US012497415B2

(12) United States Patent
Kim et al.

(10) Patent No.: US 12,497,415 B2
(45) **Date of Patent: *Dec. 16, 2025**

(54) POLYCYCLIC COMPOUND AND ORGANIC LIGHT-EMITTING ELEMENT COMPRISING SAME

(71) Applicant: LG CHEM, LTD., Seoul (KR)

(72) Inventors: Moung Gon Kim, Daejeon (KR); Sujeong Geum, Daejeon (KR); Kyunghee Kim, Daejeon (KR); Wanpyo Hong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 855 days.

This patent is subject to a terminal disclaimer.

(21) Appl. No.: 17/423,185

(22) PCT Filed: Jul. 31, 2020

(86) PCT No.: PCT/KR2020/010123

§ 371 (c)(1),
(2) Date: Jul. 15, 2021

(87) PCT Pub. No.: WO2021/020928

PCT Pub. Date: Feb. 4, 2021

(65) Prior Publication Data

US 2023/0077439 A1 Mar. 16, 2023

(30) Foreign Application Priority Data

Jul. 31, 2019 (KR) ........................ 10-2019-0093157
Nov. 29, 2019 (KR) ........................ 10-2019-0156836
May 29, 2020 (KR) ........................ 10-2020-0065269

(51) Int. Cl.
*C07F 5/02* (2006.01)
*C09K 11/06* (2006.01)
(Continued)

(52) U.S. Cl.
CPC ................ *C07F 5/027* (2013.01); *C07F 5/02* (2013.01); *C09K 11/06* (2013.01); *H10K 85/322* (2023.02);
(Continued)

(58) Field of Classification Search
CPC ..... C09K 2211/1055; C09K 2211/1014; C07F 5/027; C07F 5/02; H10K 85/322
See application file for complete search history.

(56) References Cited

U.S. PATENT DOCUMENTS

2015/0236274 A1 8/2015 Hatakeyama et al.
2016/0111644 A1 4/2016 Cho et al.
(Continued)

FOREIGN PATENT DOCUMENTS

CN 107417715 12/2017
CN 108137618 6/2018
(Continued)

*Primary Examiner* — Jenna N Chandhok

(74) *Attorney, Agent, or Firm* — Bryan Cave Leighton Paisner LLP

(57) ABSTRACT

Provided is a polycyclic compound of Formula 100:

Formula 100

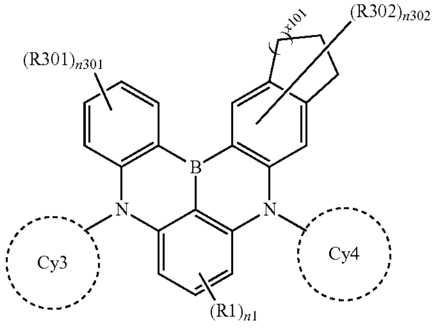

where Cy3 and Cy4 are the same as or different from each other, and are each independently one selected from the group consisting of a substituted or unsubstituted aromatic hydrocarbon ring, a substituted or unsubstituted aliphatic hydrocarbon ring, and a substituted or unsubstituted aromatic hetero ring, or a ring in which two or more rings selected from the group are fused, and an organic light-emitting element comprising the same.

12 Claims, 8 Drawing Sheets

(51) Int. Cl.

| | |
|---|---|
| ***H10K 50/11*** | (2023.01) |
| ***H10K 85/30*** | (2023.01) |
| ***H10K 85/60*** | (2023.01) |
| ***H10K 101/30*** | (2023.01) |

(52) U.S. Cl.

CPC ......... *H10K 85/626* (2023.02); *H10K 85/636* (2023.02); *H10K 85/6572* (2023.02); *H10K 85/6574* (2023.02); *H10K 85/6576* (2023.02); *H10K 85/658* (2023.02); *C09K 2211/1014* (2013.01); *H10K 50/11* (2023.02); *H10K 2101/30* (2023.02)

(56) References Cited

U.S. PATENT DOCUMENTS

| | | | |
|---|---|---|---|
| 2018/0069182 | A1 | 3/2018 | Hatakeyama et al. |
| 2018/0094000 | A1 | 4/2018 | Hatakeyama et al. |
| 2018/0301629 | A1 | 10/2018 | Hatakeyama et al. |
| 2018/0366653 | A1 | 12/2018 | He et al. |
| 2019/0027694 | A1 | 1/2019 | Hatakeyama et al. |
| 2019/0058124 | A1 | 2/2019 | Hatakeyama et al. |
| 2019/0165279 | A1 | 5/2019 | Fujita |
| 2019/0198766 | A1 | 6/2019 | Suh et al. |
| 2019/0312223 | A1 | 10/2019 | Chun et al. |
| 2020/0035921 | A1 | 1/2020 | Nakanotani et al. |
| 2020/0052212 | A1 | 2/2020 | Tasaki et al. |
| 2020/0058885 | A1 | 2/2020 | Hong et al. |
| 2020/0066997 | A1 | 2/2020 | Huang et al. |
| 2020/0144514 | A1 | 5/2020 | Hatakeyama et al. |
| 2020/0167679 | A1 | 5/2020 | Seow et al. |
| 2020/0176679 | A1 | 6/2020 | Jeong |
| 2020/0373496 | A1 | 11/2020 | Lee et al. |
| 2021/0028365 | A1 | 1/2021 | Tasaki et al. |
| 2021/0083204 | A1 | 3/2021 | Shi et al. |
| 2023/0096132 | A1* | 3/2023 | Hatakeyama ......... C07C 211/54 257/40 |

FOREIGN PATENT DOCUMENTS

| | | | |
|---|---|---|---|
| EP | 3960744 | A1 | 3/2022 |
| JP | 2012-234873 | | 11/2012 |
| JP | 2018-174279 | | 11/2018 |
| JP | 2021-38206 | | 3/2021 |
| KR | 10-2016-0046075 | | 4/2016 |
| KR | 10-2016-0119683 | | 10/2016 |
| KR | 10-2017-0111802 | | 10/2017 |
| KR | 10-1876763 | | 7/2018 |
| KR | 10-2018-0103738 | | 9/2018 |
| KR | 10-2018-0108559 | | 10/2018 |
| KR | 10-2018-0108604 | | 10/2018 |
| KR | 10-2018-0122298 | | 11/2018 |
| KR | 10-2019-0025065 | | 3/2019 |
| KR | 10-2019-0032234 | | 3/2019 |
| KR | 10-2019-0037174 | | 4/2019 |
| KR | 10-2019-0051867 | | 5/2019 |
| KR | 10-2019-0062177 | | 6/2019 |
| KR | 10-1990818 | | 6/2019 |
| KR | 10-2019-0078541 | | 7/2019 |
| KR | 10-2019-0084880 | | 7/2019 |
| KR | 10-2019-0132645 | | 11/2019 |
| KR | 10-2020-0010130 | | 1/2020 |
| WO | 2016-152418 | | 9/2016 |
| WO | 2017-126443 | | 7/2017 |
| WO | 2018-095397 | | 5/2018 |
| WO | 2018-216990 | | 11/2018 |
| WO | 2019-114764 | | 6/2019 |
| WO | 2019-194298 | | 10/2019 |
| WO | 2019-218969 | | 11/2019 |
| WO | 2020-017931 | | 1/2020 |
| WO | 2020-054676 | | 3/2020 |
| WO | 2020-218079 | | 10/2020 |
| WO | 2020-231214 | | 11/2020 |

* cited by examiner

[Figure 1]
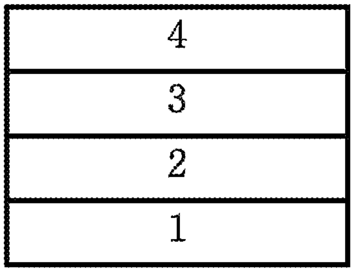
[Figure 2]
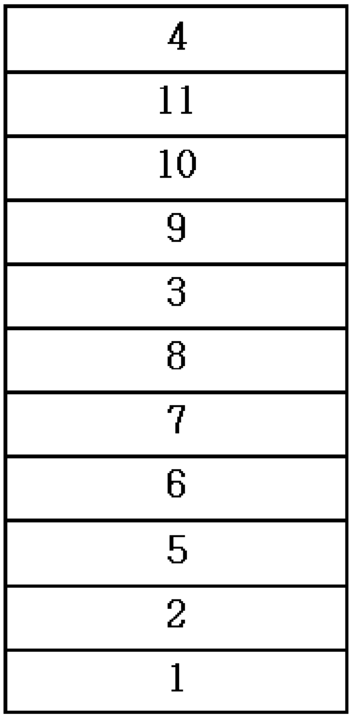

[Figure 3]
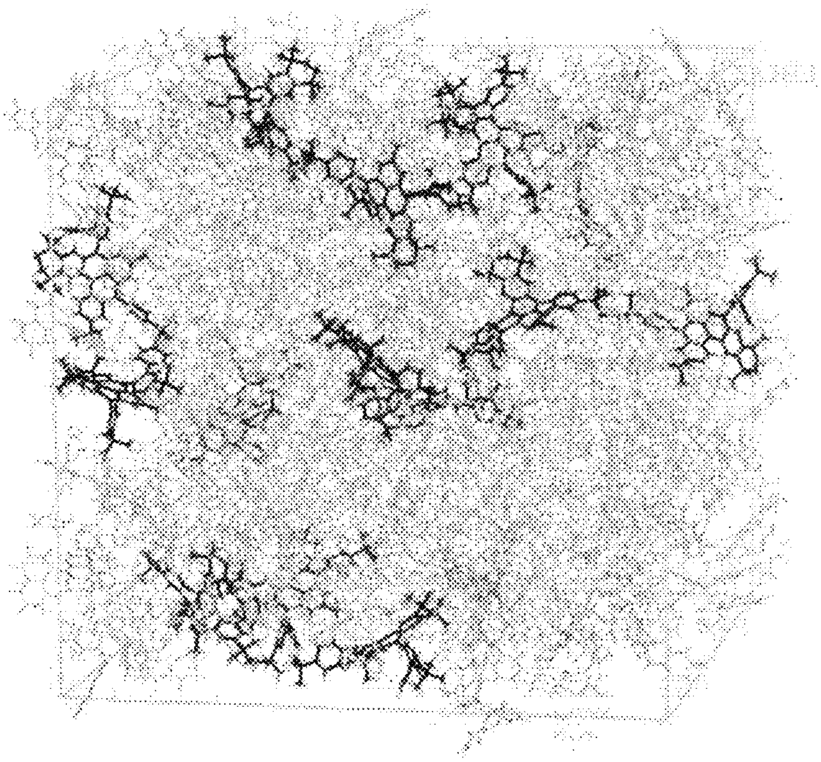

[Figure 4]
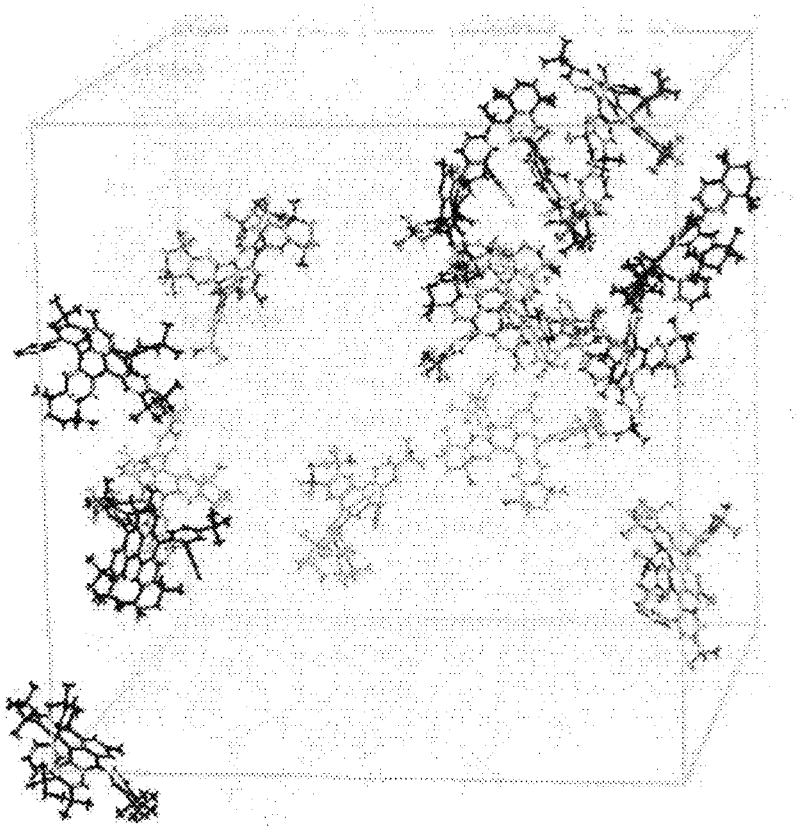

[Figure 5]
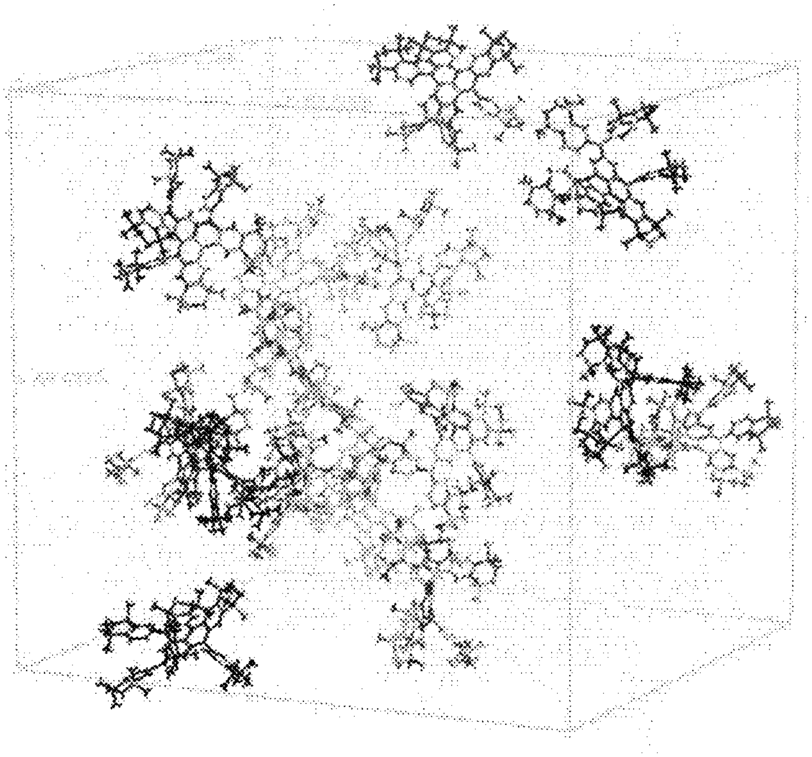

[Figure 6]
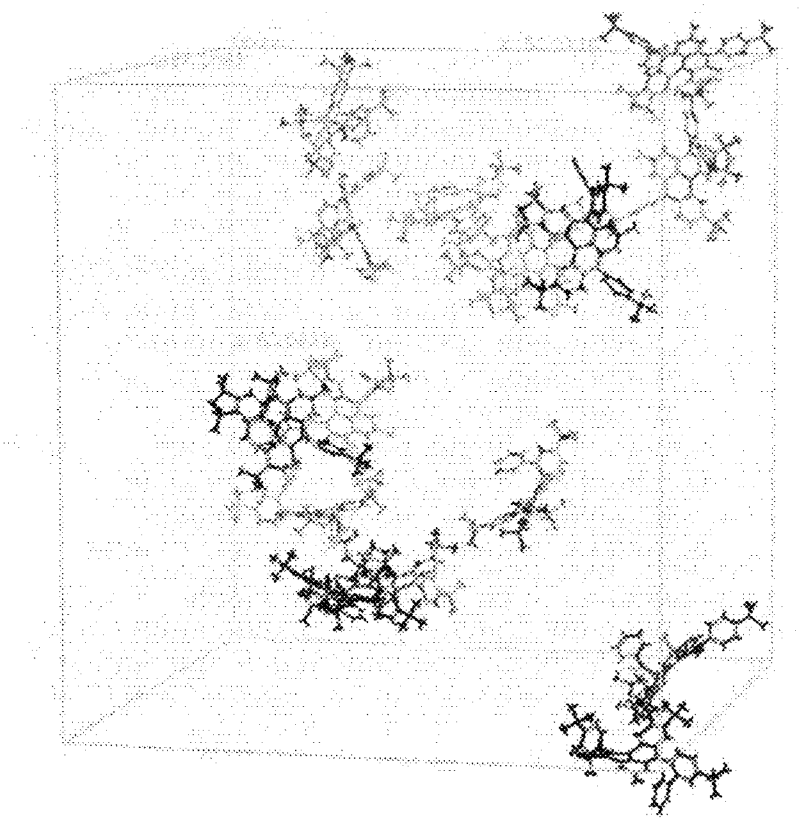

[Figure 7]
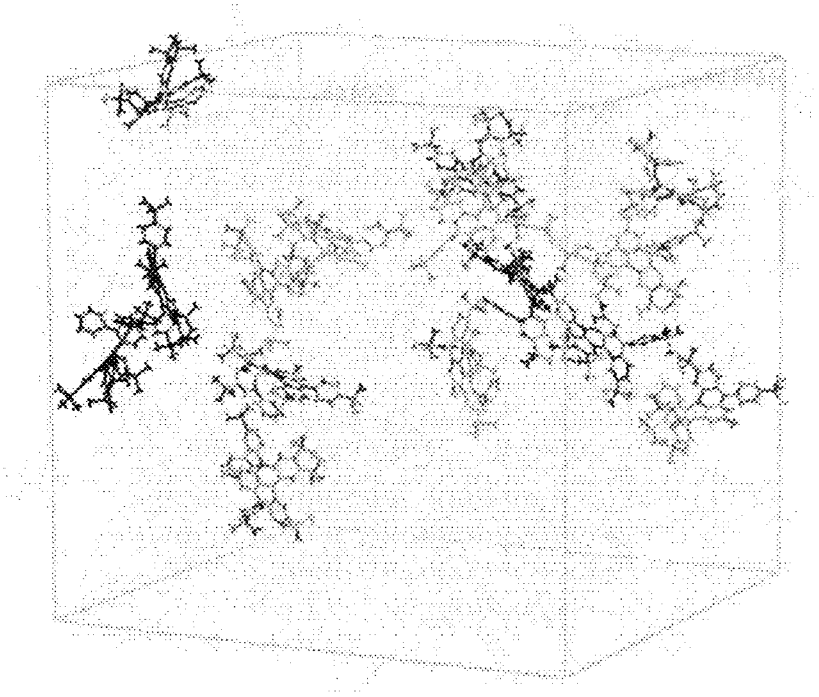

[Figure 8]
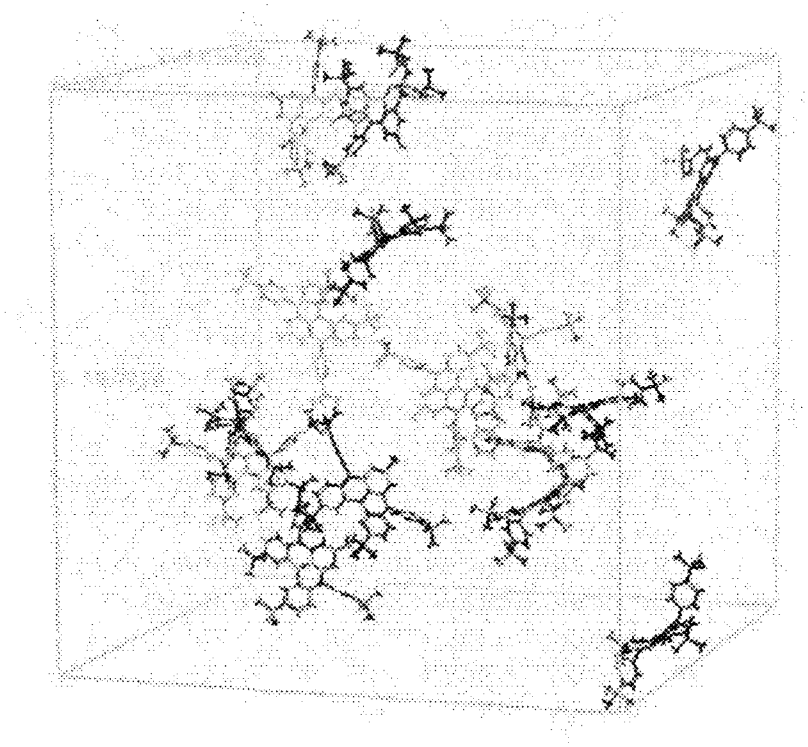

[Figure 9]
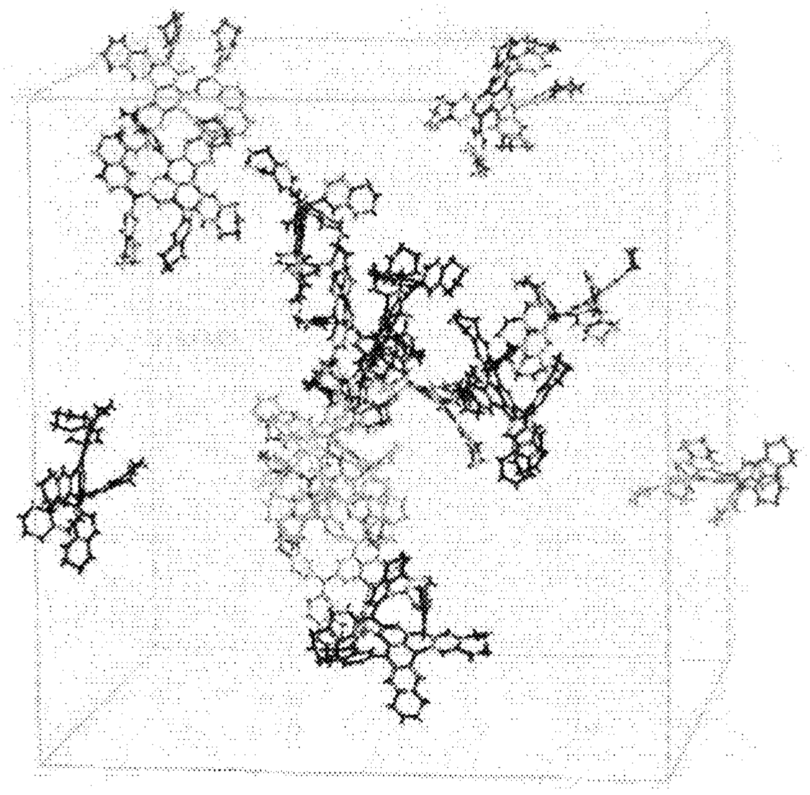

POLYCYCLIC COMPOUND AND ORGANIC LIGHT-EMITTING ELEMENT COMPRISING SAME

CROSS-REFERENCE TO RELATED APPLICATIONS

This application is a National Stage Application of International Application No. PCT/KR2020/010123 filed on Jul. 31, 2020, which claims priority to and the benefit of Korean Patent Application Nos. 10-2019-0093157, 10-2019-0156836, and 10-2020-0065269 filed in the Korean Intellectual Property Office on Jul. 31, 2019, Nov. 29, 2019, and May 29, 2020, respectively, the entire contents of which are incorporated herein by reference.

TECHNICAL FIELD

The present specification relates to a polycyclic compound and an organic light emitting device including the same.

BACKGROUND

In the present specification, an organic light emitting device is a light emitting device using an organic semiconductor material, and requires an exchange of holes and/or electrons between electrodes and organic semiconductor materials. The organic light emitting device can be roughly divided into the following two organic light emitting devices depending on the operation principle. The first organic light emitting device is a light emitting device in which an exciton is formed in an organic material layer by a photon that flows from an external light source to the device, the exciton is separated into electrons and holes, and the electrons and the holes are each transferred to different electrodes and used as a current source (voltage source). The second organic light emitting device is a light emitting device in which holes and/or electrons are injected into organic semiconductor material layers forming an interface with an electrode by applying a voltage or current to two or more electrodes, and the device is operated by the injected electrons and holes.

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer has in many cases a multi-layered structure composed of different materials in order to improve the efficiency and stability of the organic light emitting device, and for example, can be composed of a hole injection layer, a hole transport layer, a light emitting layer, an electron blocking layer, an electron transport layer, an electron injection layer, and the like. In such a structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state. Such an organic light emitting device has been known to have characteristics such as self-emission, high brightness, high efficiency, a low driving voltage, a wide viewing angle, and high contrast.

In an organic light emitting device, materials used as an organic material layer can be classified into a light emitting material and a charge transport material, for example, a hole injection material, a hole transport material, an electron blocking material, an electron transport material, an electron injection material, and the like depending on the function. The light emitting materials include blue, green, and red light emitting materials according to the light emitting color, and yellow and orange light emitting materials required for implementing a much better natural color.

Furthermore, a host/dopant system can be used as a light emitting material for the purpose of enhancing color purity and light emitting efficiency through energy transfer. The principle is that when a small amount of dopant which has a smaller energy band gap and better light emitting efficiency than those of a host mainly constituting a light emitting layer is mixed in the light emitting layer, the excitons generated by the host are transported to the dopant to emit light with high efficiency. In this case, it is possible to obtain light with a desired wavelength according to the type of dopant used because the wavelength of the host moves to the wavelength range of the dopant.

In order to fully exhibit the above-described excellent characteristics of the organic light emitting device, a material constituting an organic material layer in a device, for example, a hole injection material, a hole transport material, a light emitting material, an electron blocking material, an electron transport material, an electron injection material, and the like need to be supported by stable and efficient materials, so that there is a continuous need for developing a new material.

PRIOR ART DOCUMENT (Patent Document 1)
International Patent Publication No. 2017-126443

DETAILED DESCRIPTION OF THE INVENTION

Technical Problem

The present specification describes a compound and an organic light emitting device including the same.

Technical Solution

The present specification provides a polycyclic compound of Formula 100:

Formula 100

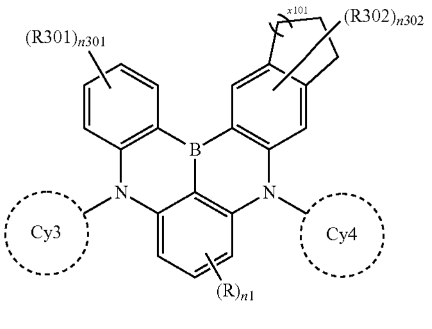

wherein n Formula 100:

R1 and R301 are the same as or different from each other, and are each independently deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring, x101 is 1 or 2;

Cy3 and Cy4 are the same as or different from each other, and are each independently one selected from the group consisting of a substituted or unsubstituted aromatic hydrocarbon ring, a substituted or unsubstituted aliphatic hydrocarbon ring, and a substituted or unsubstituted aromatic hetero ring, or a ring in which two or more rings selected from the group are fused;

R302 is hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or is bonded to an adjacent substituent to form a substituted or unsubstituted ring;

n1 is an integer from 1 to 3, n301 is an integer from 1 to 4, and n302 is an integer from 0 to 10, and when n1, n301, and n302 are each 2 or higher, substituents in the parenthesis are the same as or different from each other;

at least one of Cy3 and Cy4 is one selected from the following Formulae A-1 to A-3:

[Formula A-1]

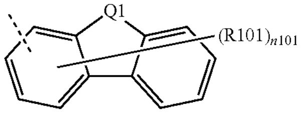

[Formula A-2]

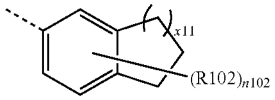

[Formula A-3]

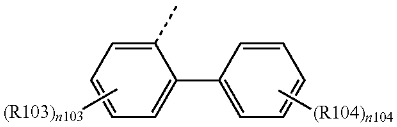

wherein in Formulae A-1 to A-3:

a dotted line is a position which is connected to Formula 100;

Q1 is O, S, or C(R118) (R119);

R101 to R104, R118, and R119 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

x11 is 1 or 2;

n101 is an integer from 0 to 7, n102 is an integer from 0 to 11, n103 is an integer from 0 to 4, and n104 is an integer from 0 to 5, and when n101 to n104 are each 2 or higher, substituents in the parenthesis are the same as or different from each other;

one or more of the aliphatic rings included in Formula 100 are selected from the following structures:

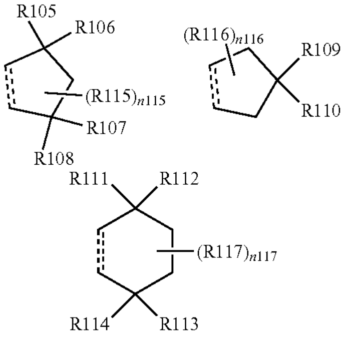

wherein in the structures:

a dotted double line is a position where substituents are fused;

R105 to R114 are the same as or different from each other, and are each independently a substituted or unsubstituted alkyl group;

R115 to R117 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

n115 is an integer from 0 to 2, and n116 and n117 are each an integer from 0 to 4, and when n115 to n117 are each 2 or higher, substituents in the parenthesis are the same as or different from each other.

Further, an exemplary embodiment of the present specification provides an organic light emitting device including: a first electrode; a second electrode provided to face the first electrode; and an organic material layer having one or more layers provided between the first electrode and the second electrode, in which one or more layers of the organic material layer include the above-described polycyclic compound.

Advantageous Effects

The compound of the present invention can be used as a material for an organic material layer of an organic light emitting device. When an organic light emitting device is manufactured by including the compound of the present invention, an organic light emitting device having high efficiency, low voltage and long-service life characteristics can be obtained, and when the compound of the present invention is included in a light emitting layer of an organic light emitting device, an organic light emitting device having high color gamut can be manufactured.

BRIEF DESCRIPTION OF THE DRAWINGS

FIGS. 1 to 2 illustrate an example of the organic light emitting device according to the present invention.

FIGS. 3 to 7 each illustrate systems of Examples 2-1 to 2-5.

FIGS. 8 and 9 each illustrate systems of Comparative Examples 2-1 and 2-2.

EXPLANATION OF REFERENCE NUMERALS AND SYMBOLS

1: Substrate
2: Positive electrode
3: Light emitting layer
4: Negative electrode
5: First hole injection layer
6: Second hole injection layer
7: Hole transport layer
8: Electron blocking layer
9: First electron transport layer
10: Second electron transport layer
11: Electron injection layer

DETAILED DESCRIPTION

Hereinafter, the present specification will be described in more detail.

The present specification provides a compound of the following Formula 100. When a compound of the following Formula 100 is used in an organic material layer of an organic light emitting device, efficiency and service life characteristics of the organic light emitting device are improved. An existing compound having a high sublimation temperature has a problem in that due to the low stability of the compound, the efficiency and service life of a device deteriorate when applied to the device, but a compound of the following Formula 100 includes an aliphatic hydrocarbon ring (specifically a cycloalkene ring) substituted with an alkyl group in the molecule, and thus has high stability due to a low sublimation temperature, and for this reason, it is possible to obtain a device having excellent efficiency and long service life characteristics when the compound is applied to the device.

Further, a compound of the following Formula 100 includes a cycloalkene ring in the molecule, and thus can also be applied for a solution process due to the increased solubility.

When one part "includes" one constituent element in the present specification, unless otherwise specifically described, this does not mean that another constituent element is excluded, but means that another constituent element can be further included.

When one member is disposed "on" another member in the present specification, this includes not only a case where the one member is brought into contact with another member, but also a case where still another member is present between the two members.

Examples of the substituents in the present specification will be described below, but are not limited thereto.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term "substituted or unsubstituted" means being substituted with one or two or more substituents selected from the group consisting of deuterium, a halogen group, a cyano group (—CN), a silyl group, a boron group, a substituted or unsubstituted alkyl group, a substituted or unsubstituted cycloalkyl group, a substituted or unsubstituted aryl group, and a substituted or unsubstituted heterocyclic group or being substituted with a substituent to which two or more substituents are linked among the substituents exemplified above, or having no substituent. For example, "the substituent to which two or more substituents are linked" can be a biphenyl group. That is, the biphenyl group can also be an aryl group, and can be interpreted as a substituent to which two phenyl groups are linked.

In the present specification, the fact that two or more substituents are linked indicates that hydrogen of any one substituent is substituted with another substituent. For example, an isopropyl group and a phenyl group can be linked to each other to become a substituent of

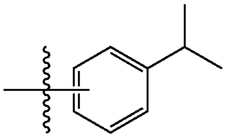
or
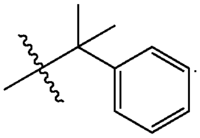
.

In the present specification, the case where three substituents are linked to one another includes not only a case where (Substituent 1)-(Substituent 2)-(Substituent 3) are consecutively linked to one another, but also a case where (Substituent 2) and (Substituent 3) are linked to (Substituent 1). For example, two phenyl groups and an isopropyl group can be linked to each other to become a substituent of or

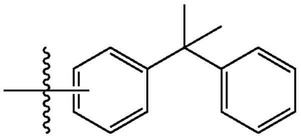
or
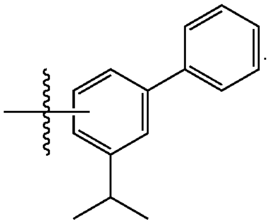
.

The same also applies to the case where four or more substituents are linked to one another.

In the present specification, a dotted line means a site bonded or fused to another substituent or a bonding portion.

Examples of the substituents will be described below, but are not limited thereto.

In the present specification, examples of a halogen group include fluorine (F), chlorine (Cl), bromine (Br) or iodine (I).

In the present specification, a silyl group can be —SiY1Y2Y3, and Y1, Y2, and Y3 can be each hydrogen; a substituted or unsubstituted alkyl group; or a substituted or unsubstituted aryl group. Specific examples of the silyl group include a trimethylsilyl group, a triethylsilyl group, a t-butyldimethylsilyl group, a vinyldimethyl-silyl group, a propyldimethylsilyl group, a triphenyl-silyl group, a diphenylsilyl group, a phenylsilyl group, and the like, but are not limited thereto.

In the present specification, a boron group can be —BY4Y5, and Y4 and Y5 can be each hydrogen; a substituted or unsubstituted alkyl group; or a substituted or unsubstituted aryl group. Specific examples of the boron group include a trimethylboron group, a triethylboron group, a t-butyl-dimethylboron group, a triphenylboron group, a phenyl-boron group, and the like, but are not limited thereto.

In the present specification, an alkyl group can be straight-chained or branched, and the number of carbon atoms thereof is not particularly limited, but is preferably 1 to 60. According to an exemplary embodiment, the number of carbon atoms of the alkyl group is 1 to 30. According to another exemplary embodiment, the number of carbon atoms of the alkyl group is 1 to 20. According to still another exemplary embodiment, the number of carbon atoms of the alkyl group is 1 to 10. According to yet another exemplary embodiment, the number of carbon atoms of the alkyl group is 1 to 6. According to still yet another exemplary embodiment, the number of carbon atoms of the alkyl group is 1 to 4. Specific examples of the alkyl group include a methyl group, an ethyl group, a propyl group, an isopropyl group, a butyl group, an isobutyl group, a tert-butyl group, a pentyl group, a hexyl group, a heptyl group, an octyl group, and the like, but are not limited thereto.

In the present specification, an amine group can be selected from the group consisting of —$NH_2$; an alkylamine group; an alkylarylamine group; an arylamine group; an arylheteroarylamine group; an alkylheteroarylamine group; and a heteroarylamine group, and the number of carbon atoms thereof is not particularly limited, but is preferably 1 to 60. In the case of an arylamine group, the number of carbon atoms thereof is 6 to 60. According to another exemplary embodiment, the number of carbon atoms of the arylamine group is 6 to 40. Specific examples of the amine group include a methylamine group; a dimethylamine group; an ethylamine group; a diethylamine group; a phenylamine group; a naphthylamine group; a biphenylamine group; an anthracenylamine group; a 9-methylanthracenylamine group; a diphenylamine group; an N-phenylnaphthylamine group; a ditolylamine group; an N-phenyltolylamine group; a triphenylamine group; an N-phenylbiphenylamine group; an N-phenylnaphthylamine group; an N-biphenylnaphthylamine group; an N-naphthyl-fluorenylamine group; an N-phenylphenanthrenylamine group; an N-biphenylphenanthrenylamine group; an N-phenylfluorenylamine group; an N-phenyl terphenylamine group; an N-phenanthrenylfluorenylamine group; an N-biphenylfluorenylamine group; an N-(4-(tert-butyl)-phenyl)-N-phenylamine group; an N,N-bis(4-(tert-butyl)-phenyl)amine group; an N,N-bis(3-(tert-butyl)phenyl)-amine group, and the like, but are not limited thereto.

In the present specification, an alkylarylamine group means an amine group in which an alkyl group and an aryl group are substituted with N of the amine group.

In the present specification, an arylheteroarylamine group means an amine group in which an aryl group and a heteroaryl group are substituted with N of the amine group.

In the present specification, an alkylheteroarylamine group means an amine group in which an alkyl group and a heteroaryl group are substituted with N of the amine group.

In the present specification, the alkyl group in the alkylamine group, the arylalkylamine group, the alkylthioxy group, the alkylsulfoxy group, and the alkylheteroarylamine group is the same as the above-described examples of the alkyl group. Specifically, examples of the alkylthioxy group include a methylthioxy group, an ethylthioxy group, a tert-butylthioxy group, a hexylthioxy group, an octylthioxy group, and the like, and examples of the alkylsulfoxy group include mesyl, an ethylsulfoxy group, a propylsulfoxy group, a butylsulfoxy group, and the like, but the examples are not limited thereto.

In the present specification, a cycloalkyl group is not particularly limited, but has preferably 3 to 60 carbon atoms, and according to an exemplary embodiment, the number of carbon atoms of the cycloalkyl group is 3 to 30. According to another exemplary embodiment, the number of carbon atoms of the cycloalkyl group is 3 to 20. According to still another exemplary embodiment, the number of carbon atoms of the cycloalkyl group is 3 to 6. The cycloalkyl group includes not only a single ring group, but also a double ring group such as a bridgehead, a fused ring, and a spiro ring. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, cycloalkene is a ring group in which a double bond is present in a hydrocarbon ring, but is a non-aromatic ring group, and the number of carbon atoms thereof is not particularly limited, but can be 3 to 60, and can be 3 to 30 according to an exemplary embodiment. The cycloalkene includes not only a single ring group, but also a double ring group such as a bridgehead, a fused ring, and a spiro ring. Examples of the cycloalkene include cyclopropene, cyclobutene, cyclopentene, cyclohexene, and the like, but are not limited thereto.

In the present specification, an aryl group is not particularly limited, but has preferably 6 to 60 carbon atoms, and can be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. Examples of a monocyclic aryl group as the aryl group include a phenyl group, a biphenyl group, a terphenyl group, and the like, but are not limited thereto. Examples of the polycyclic aryl group include a naphthyl group, an anthracenyl group, a phenanthrenyl group, a pyrenyl group, a perylenyl group, a triphenyl group, a chrysenyl group, a fluorenyl group, and the like, but are not limited thereto. In the present specification, the substituted aryl group also includes a form in which an aliphatic ring is fused to the aryl group.

In the present specification, the alkylaryl group means an aryl group substituted with an alkyl group, and a substituent other than the alkyl group can be further linked.

In the present specification, an arylalkyl group means an alkyl group substituted with an aryl group, and a substituent other than the aryl group can be further linked.

In the present specification, a heterocyclic group is a cyclic group including one or more of N, O, P, S, Si, and Se as a heteroatom, and the number of carbon atoms thereof is not particularly limited, but is preferably 2 to 60. According to an exemplary embodiment, the number of carbon atoms of the heterocyclic group is 2 to 30. According to an exemplary embodiment, the number of carbon atoms of the heterocyclic group is 2 to 20. Examples of the heterocyclic group include a pyridine group, a pyrrole group, a pyrimidine group, a pyridazinyl group, a furan group, a thiophene group, an imidazole group, a pyrazole group, a dibenzofuran group, a dibenzothiophene group, a carbazole group, a hexahydrocarbazole group, and the like, but are not limited thereto, In the present specification, a heterocyclic group can be monocyclic or polycyclic, can be an aromatic ring, an aliphatic ring, or a fused ring of the aromatic ring and the aliphatic ring, and can be selected from the examples of the heterocyclic group.

In the present specification, an aromatic hydrocarbon ring means a hydrocarbon ring in which pi electrons are completely conjugated and are planar, and the description on the aryl group can be applied to an aromatic hydrocarbon ring except for a divalent aromatic hydrocarbon ring.

In the present specification, an aliphatic hydrocarbon ring is a structure in which the aliphatic hydrocarbon ring is bonded in a ring, and means a ring which is not aromatic. Examples of the aliphatic hydrocarbon ring include cycloalkane or cycloalkene, and the above-described description on the cycloalkyl group or cycloalkenyl group can be applied to the aliphatic hydrocarbon ring except for a divalent aliphatic hydrocarbon ring. Further, a substituted aliphatic hydrocarbon ring also includes an aliphatic hydrocarbon ring in which aromatic rings are fused.

In the present specification, a fused ring of an aromatic hydrocarbon ring and an aliphatic hydrocarbon ring means that an aromatic hydrocarbon ring and an aliphatic hydrocarbon ring form a fused ring.

In the present specification, the "adjacent" group means a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring can be interpreted as groups which are "adjacent" to each other. In addition, substituents (four in total) linked to two consecutive carbons in an aliphatic ring can be interpreted as "adjacent" groups.

In the present specification, the "adjacent groups are bonded to each other to form a ring" among the substituents means that a substituent is bonded to an adjacent group to form a substituted or unsubstituted hydrocarbon ring; or a substituted or unsubstituted hetero ring.

In the present specification, a fused hydrocarbon ring can be monovalent or divalent. Specifically, in the formulae of the present application, when Cy3 and Cy4 are fused hydrocarbon rings, the fused hydrocarbon rings correspond to monovalent groups.

The present specification provides a polycyclic compound of Formula 100:

Formula 100

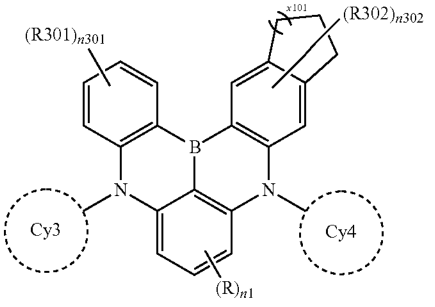

In an exemplary embodiment of the present specification, the aliphatic ring included in Formula 100 is selected from the following structures:

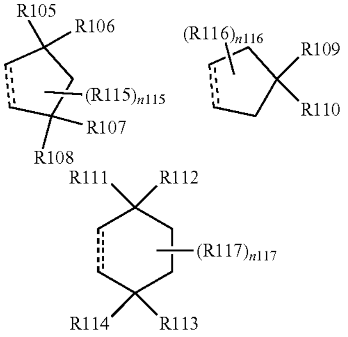

wherein in the structures:

a dotted double line is a position where substituents are fused;

R105 to R114 are the same as or different from each other, and are each independently a substituted or unsubstituted alkyl group;

R115 to R117 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

n115 is an integer from 0 to 2, and n116 and n117 are each an integer from 0 to 4, and when n115 to n117 are each 2 or higher, substituents in the parenthesis are the same as or different from each other.

When n115 is 2, R115s are the same as or different from each other. When n116 is 2 or higher, R116s are the same as or different from each other. When n117 is 2 or higher, R117s are the same as or different from each other.

In the present specification, the aliphatic ring included in Formula 100 means one or more rings of 1) an aliphatic hydrocarbon ring formed by bonding two R301s, 2) a cyclopentene ring when x101 is 1, 3) a cyclohexene ring when x101 is 2, 4) an aliphatic hydrocarbon ring included in Cy3, and 5) an aliphatic hydrocarbon ring included in Cy4.

In an exemplary embodiment of the present specification, R105 to R114 are the same as or different from each other, and are each independently a substituted or unsubstituted alkyl group having 1 to 10 carbon atoms.

In an exemplary embodiment of the present specification, R105 to R114 are the same as or different from each other, and are each independently a substituted or unsubstituted alkyl group having 1 to 6 carbon atoms.

In an exemplary embodiment of the present specification, R105 to R114 are a methyl group.

In an exemplary embodiment of the present specification, R115 and R116 are the same as or different from each other, and are each independently hydrogen; or deuterium.

In an exemplary embodiment of the present specification, R117 is hydrogen or deuterium, or four adjacent R117s are bonded to each other to form a substituted or unsubstituted benzene ring.

In an exemplary embodiment of the present specification, R117 is hydrogen or deuterium, or four adjacent R117s are bonded to each other to form a benzene ring which is unsubstituted or substituted with an alkyl group having 1 to 10 carbon atoms.

In an exemplary embodiment of the present specification, R117 is hydrogen or deuterium, or four adjacent R117s are bonded to each other to form a benzene ring.

In an exemplary embodiment of the present specification, all the aliphatic rings included in Formula 100 are selected from the above structures.

In an exemplary embodiment of the present specification, the aliphatic ring included in Formula 100 is selected from the following structures:

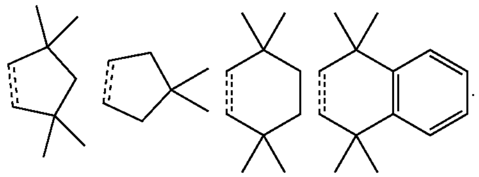

In an exemplary embodiment of the present specification, R301s are the same as or different from each other, are each independently deuterium; a substituted or unsubstituted alkyl group, a substituted or unsubstituted aryl group, a substituted or unsubstituted heterocyclic group, or a substituted or unsubstituted amine group, and adjacent two R301s are bonded to each other to form a substituted or unsubstituted hydrocarbon ring.

In an exemplary embodiment of the present specification, R301 is deuterium, a substituted or unsubstituted alkyl group having 1 to 10 carbon atoms, a substituted or unsubstituted aryl group having 6 to 30 carbon atoms, a substituted or unsubstituted heterocyclic group having 6 to 30 carbon atoms, a substituted or unsubstituted arylamine group having 6 to 60 carbon atoms, or a substituted or unsubstituted arylheteroarylamine group having 6 to 60 carbon atoms, and two adjacent R301s are bonded to each other to form a substituted or unsubstituted aliphatic hydrocarbon ring having 5 to 30 carbon atoms.

In an exemplary embodiment of the present specification, R301 is deuterium, a substituted or unsubstituted alkyl group having 1 to 6 carbon atoms, a substituted or unsubstituted aryl group having 6 to 20 carbon atoms, a substituted or unsubstituted heterocyclic group having 6 to 20 carbon atoms, a substituted or unsubstituted arylamine group having 6 to 40 carbon atoms, or a substituted or unsubstituted arylheteroarylamine group having 6 to 40 carbon atoms, and two adjacent R301s are bonded to each other to form a substituted or unsubstituted aliphatic hydrocarbon ring having 5 to 20 carbon atoms.

In an exemplary embodiment of the present specification, R301 is deuterium; an alkyl group having 1 to 10 carbon atoms, which is unsubstituted or substituted with one or more substituents selected from the group consisting of deuterium and an aryl group having 6 to 30 carbon atoms or a substituent to which two or more groups selected from the group are linked; an aryl group having 6 to 30 carbon atoms, which is unsubstituted or substituted with one or more substituents selected from the group consisting of deuterium and an alkyl group having 1 to 10 carbon atoms or a substituent to which two or more groups selected from the group are linked; a heterocyclic group having 6 to 30 carbon atoms, which is unsubstituted or substituted with one or more substituents selected from the group consisting of deuterium, an alkyl group having 1 to 10 carbon atoms and an aryl group having 6 to 30 carbon atoms or a substituent to which two or more groups selected from the group are linked; an arylamine group having 6 to 60 carbon atoms, which is unsubstituted or substituted with one or more substituents selected from the group consisting of deuterium and an alkyl group having 1 to 10 carbon atoms or a substituent to which two or more groups selected from the group are linked, and is unfused or fused with an aliphatic hydrocarbon ring having 5 or 6 carbon atoms; or an arylheteroarylamine group having 6 to 60 carbon atoms, which is unsubstituted or substituted with one or more substituents selected from the group consisting of deuterium and an alkyl group having 1 to 10 carbon atoms or a substituent to which two or more groups selected from the group are linked, and two adjacent R301s are bonded to each other to form an aliphatic hydrocarbon ring having 5 to 30 carbon atoms, which is unsubstituted or substituted with one or more substituents selected from the group consisting of deuterium, an alkyl group having 1 to 10 carbon atoms and an aryl group having 6 to 30 carbon atoms or substituents to which two or more groups selected from the group are linked.

In an exemplary embodiment of the present specification, R301 is a methyl group; an isopropyl group; a tert-butyl group; a 2-phenylpropan-2-yl group; a phenyl group which is unsubstituted or substituted with a methyl group or a tert-butyl group; a dimethylfluorenyl group; a dibenzofuran group; a dibenzothiophene group; a hexahydrocarbazole group which is unsubstituted or substituted with a methyl group, a tert-butyl group, a phenyl group, a tolyl group, a tert-butylphenyl group or a tetramethyltetrahydronaphthalene group; a diphenylamine group which is unsubstituted or substituted with a methyl group or a tert-butyl group, and is unfused or fused with cyclohexene; an N-phenyl-N-dibenzofuranamine group which is unsubstituted or substituted with a methyl group or a tert-butyl group; or an N-phenyl-N-dibenzothiopheneamine group which is unsubstituted or substituted with a methyl group or a tert-butyl group.

In an exemplary embodiment of the present specification, R302 is hydrogen, deuterium, or a substituted or unsubstituted alkyl group.

In an exemplary embodiment of the present specification, R302 is hydrogen, deuterium, or a substituted or unsubstituted alkyl group having 1 to 10 carbon atoms.

In an exemplary embodiment of the present specification, R302 is hydrogen, deuterium, or a substituted or unsubstituted alkyl group having 1 to 6 carbon atoms.

In an exemplary embodiment of the present specification, R302 is hydrogen, deuterium, or a methyl group.

In an exemplary embodiment of the present specification, n302 is 2 or higher, and two or four of a plurality of R302's are a methyl group.

In an exemplary embodiment of the present specification, Formula 100 is any one of the following Formulae 1 to 3:

Formula 1

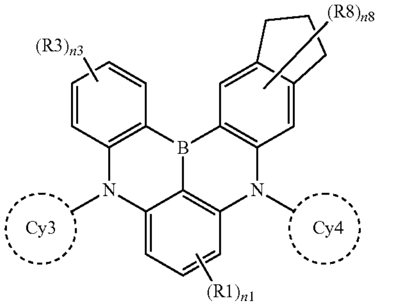

Formula 2

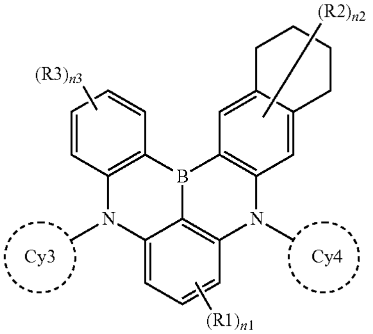

Formula 3

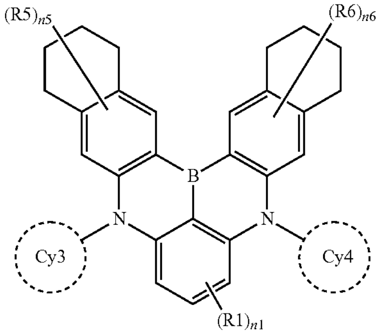

wherein in Formulae 1 to 3:

R1, Cy3, Cy4, and n1 are the same as those defined in Formula 100;

R3 and R4 are the same as or different from each other, and are each independently deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R2, R5, R6, and R8 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

n3 and n4 are each an integer from 1 to 4, n2, n5, and n6 are each an integer from 0 to 10, and n8 is an integer from 0 to 8, and when n2 to n6 and n8 are each 2 or higher, substituents in the parenthesis are the same as or different from each other.

In an exemplary embodiment of the present specification, Cy3 and Cy4 are the same as or different from each other, and are each independently one selected from the group consisting of a substituted or unsubstituted aromatic hydrocarbon ring, a substituted or unsubstituted aliphatic hydrocarbon ring, and a substituted or unsubstituted aromatic hetero ring, or a ring in which two or more rings selected from the group are fused, and at least one of Cy3 and Cy4 is one selected from the following Formulae A-1 to A-3:

[Formula A-1]

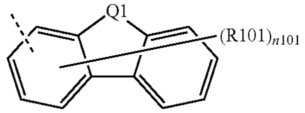

[Formula A-2]

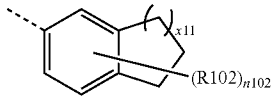

[Formula A-3]

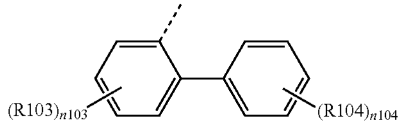

wherein in Formulae A-1 to A-3:

a dotted line is a position which is connected to Formula 100;

Q1 is O, S, or C(R118) (R119);

R101 to R104, R118, and R119 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

x11 is 1 or 2;

n101 is an integer from 0 to 7, n102 is an integer from 0 to 11, n103 is an integer from 0 to 4, and n104 is an integer from 0 to 5, and when n101 to n104 are each 2 or higher, substituents in the parenthesis are the same as or different from each other.

In an exemplary embodiment of the present specification, at least one of Cy3 and Cy4 is selected from Formulae A-1 to A-3, and the other is a substituted or unsubstituted aromatic hydrocarbon ring.

In an exemplary embodiment of the present specification, at least one of Cy3 and Cy4 is selected from Formulae A-1 to A-3, and the other is a substituted or unsubstituted aromatic hydrocarbon ring having 6 to 60 carbon atoms.

In an exemplary embodiment of the present specification, at least one of Cy3 and Cy4 is selected from Formulae A-1 to A-3, and the other is a substituted or unsubstituted aromatic hydrocarbon ring having 6 to 30 carbon atoms.

In an exemplary embodiment of the present specification, at least one of Cy3 and Cy4 is selected from Formulae A-1 to A-3, and the other is a substituted or unsubstituted monocyclic aromatic hydrocarbon ring having 6 to 20 carbon atoms.

In an exemplary embodiment of the present specification, at least one of Cy3 and Cy4 is selected from Formulae A-1 to A-3, and the other is an aromatic hydrocarbon ring having 6 to 30 carbon atoms, which is unsubstituted or substituted with one or more substituents selected from the group consisting of deuterium, an alkyl group having 1 to 10 carbon atoms, and an aryl group having 6 to 30 carbon atoms or a substituent to which two or more groups selected from the group are linked.

In an exemplary embodiment of the present specification, at least one of Cy3 and Cy4 is selected from Formulae A-1 to A-3, and the other is a monocyclic aromatic hydrocarbon ring having 6 to 20 carbon atoms, which is unsubstituted or substituted with one or more substituents selected from the group consisting of deuterium, an alkyl group having 1 to 6 carbon atoms, and an aryl group having 6 to 20 carbon atoms or a substituent to which two or more groups selected from the group are linked.

In an exemplary embodiment of the present specification, at least one of Cy3 and Cy4 is selected from Formulae A-1 to A-3, and the other is a monocyclic aromatic hydrocarbon ring having 6 to 20 carbon atoms, which is unsubstituted or substituted with deuterium, an alkyl group having 1 to 10 carbon atoms, or an arylalkyl group having 7 to 50 carbon atoms.

In an exemplary embodiment of the present specification, at least one of Cy3 and Cy4 is selected from Formulae A-1 to A-3, the other is a phenyl group, a biphenyl group, or a terphenyl group, and the phenyl group, the biphenyl group, or the terphenyl group is unsubstituted or substituted with a methyl group, an isopropyl group, a tert-butyl group, or a 2-phenylpropan-2-yl group.

In an exemplary embodiment of the present specification, Cy3 and Cy4 are the same as or different from each other, and are each independently selected from Formulae A-1 to A-3.

In an exemplary embodiment of the present specification, R118 and R119 are the same as or different from each other, and are each independently hydrogen, deuterium, a substituted or unsubstituted alkyl group, or a substituted or unsubstituted aryl group.

In an exemplary embodiment of the present specification, R118 and R119 are the same as or different from each other, and are each independently hydrogen, deuterium, a substituted or unsubstituted alkyl group having 1 to 10 carbon atoms, or a substituted or unsubstituted aryl group having 6 to 30 carbon atoms.

In an exemplary embodiment of the present specification, R118 and R119 are a methyl group.

In an exemplary embodiment of the present specification, R101 is hydrogen, deuterium, a substituted or unsubstituted alkyl group, or a substituted or unsubstituted aryl group.

In an exemplary embodiment of the present specification, R101 is hydrogen, deuterium, a substituted or unsubstituted alkyl group having 1 to 10 carbon atoms, or a substituted or unsubstituted aryl group having 6 to 30 carbon atoms.

In an exemplary embodiment of the present specification, R101 is hydrogen, deuterium, or a substituted or unsubstituted alkyl group having 1 to 6 carbon atoms.

In an exemplary embodiment of the present specification, R101 is hydrogen, deuterium, or a tert-butyl group.

In an exemplary embodiment of the present specification, R102 is hydrogen, deuterium, a substituted or unsubstituted alkyl group, or a substituted or unsubstituted aryl group, or four adjacent R102s are bonded to each other to form a substituted or unsubstituted aromatic hydrocarbon ring.

In an exemplary embodiment of the present specification, R102 is hydrogen, deuterium, a substituted or unsubstituted alkyl group having 1 to 10 carbon atoms, or a substituted or unsubstituted aryl group having 6 to 30 carbon atoms, or four adjacent R102s are bonded to each other to form a substituted or unsubstituted aromatic hydrocarbon ring having 6 to 30 carbon atoms.

In an exemplary embodiment of the present specification, R102 is hydrogen, deuterium, or a substituted or unsubstituted alkyl group having 1 to 6 carbon atoms, or four adjacent R102s are bonded to each other to form a substituted or unsubstituted benzene ring.

In an exemplary embodiment of the present specification, R102 is hydrogen, deuterium, or a methyl group, or four adjacent R102s are bonded to each other to form a benzene ring.

In an exemplary embodiment of the present specification, n102 is 2 or higher, and two or four of a plurality of R102s are a methyl group.

In an exemplary embodiment of the present specification, R103 and R104 are the same as or different from each other, and are each independently hydrogen, deuterium, a substituted or unsubstituted alkyl group, or a substituted or unsubstituted aryl group, or two adjacent R103s; or two adjacent R104s are bonded to each other to form a substituted or unsubstituted hydrocarbon ring.

In an exemplary embodiment of the present specification, R103 and R104 are the same as or different from each other, and are each independently hydrogen, deuterium, a substituted or unsubstituted alkyl group having 1 to 10 carbon atoms, or a substituted or unsubstituted aryl group having 6 to 30 carbon atoms, or two adjacent R103s; or two adjacent R104s are bonded to each other to form a substituted or unsubstituted aliphatic hydrocarbon ring having 5 to 30 carbon atoms.

In an exemplary embodiment of the present specification, R103 and R104 are the same as or different from each other, and are each independently hydrogen, deuterium, a substituted or unsubstituted alkyl group having 1 to 6 carbon atoms, or a substituted or unsubstituted aryl group having 6 to 20 carbon atoms, or two adjacent R103s; or two adjacent R104s are bonded to each other to form a substituted or unsubstituted aliphatic hydrocarbon ring having 5 to 20 carbon atoms.

In an exemplary embodiment of the present specification, the alkyl group or aryl group of R103 and R104 can be substituted with one or more substituents selected from the group consisting of deuterium, an alkyl group having 1 to 10 carbon atoms, and an aryl group having 6 to 30 carbon atoms, or a substituent to which two or more groups selected from the group are linked.

In an exemplary embodiment of the present specification, the alkyl group or aryl group of R103 and R104 can be substituted with deuterium, an alkyl group having 1 to 10 carbon atoms, an arylalkyl group having 7 to 50 carbon atoms, or an aryl group having 6 to 30 carbon atoms.

In an exemplary embodiment of the present specification, the aliphatic hydrocarbon ring formed by bonding two adjacent R103s; or two adjacent R104s to each other can be substituted with one or more substituents selected from the group consisting of deuterium and an alkyl group having 1 to 10 carbon atoms; or a substituent to which two or more groups selected from the group are linked.

In an exemplary embodiment of the present specification, R103 and R104 are the same as or different from each other, and are each independently hydrogen; deuterium; an alkyl group having 1 to 6 carbon atoms, which is unsubstituted or substituted with deuterium or an aryl group having 6 to 20 carbon atoms; or an aryl group having 6 to 20 carbon atoms, which is unsubstituted or substituted with deuterium or an alkyl group having 1 to 6 carbon atoms, or two adjacent R103s; or two adjacent R104s are bonded to each other to form an aliphatic hydrocarbon ring having 5 or 6 carbon atoms, which is unsubstituted or substituted with an alkyl group having 1 to 6 carbon atoms.

In an exemplary embodiment of the present specification, R103 and R104 are the same as or different from each other, and are each independently hydrogen, deuterium, a methyl group, an isopropyl group, a tert-butyl group, a 2-phenyl-propan-2-yl group, or a phenyl group which is unsubstituted or substituted with a tert-butyl group, or two adjacent R103s; or two adjacent R104s are bonded to each other to form a cyclopentene ring which is unsubstituted or substituted with a methyl group, or a cyclohexene ring which is unsubstituted or substituted with a methyl group.

In an exemplary embodiment of the present specification, R103 is hydrogen, deuterium, a methyl group, an isopropyl group, a tert-butyl group, a 2-phenylpropan-2-yl, or a phenyl group which is unsubstituted or substituted with a tert-butyl group.

In an exemplary embodiment of the present specification, R104 is hydrogen, deuterium, a methyl group, an isopropyl group, a tert-butyl group, a 2-phenylpropan-2-yl group, or a phenyl group which is unsubstituted or substituted with a tert-butyl group, or two adjacent R104s are bonded to each other to form a cyclopentene ring which is unsubstituted or substituted with a methyl group, or a cyclohexene ring which is unsubstituted or substituted with a methyl group.

When n101 is 2 or higher, R101s are the same as or different from each other. When n102 is 2 or higher, R102s are the same as or different from each other. When n103 is 2 or higher, R103s are the same as or different from each other. When n104 is 2 or higher, R104s are the same as or different from each other.

In an exemplary embodiment of the present specification, Cy3 and Cy4 are the same as or different from each other, and are each independently selected from the following Groups A-11 to A-14, and at least one of Cy3 and Cy4 is selected from the following Groups A-11 to A-13:

Group A-11

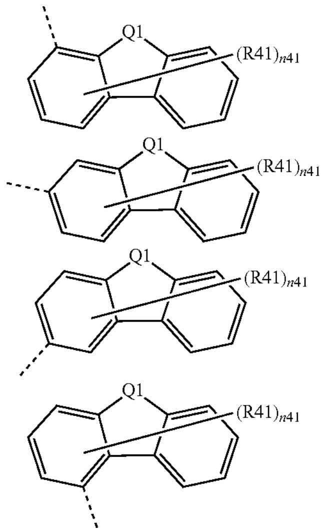

Group A-12

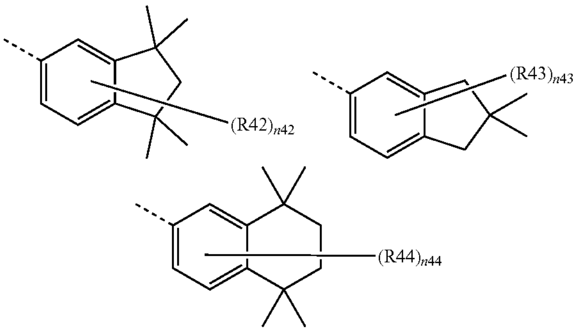

Group A-13

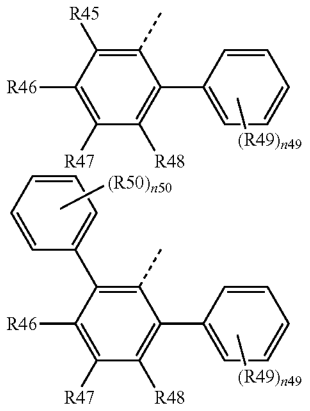

Group A-14

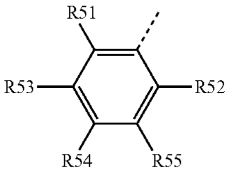

wherein in Groups A-11 to A-14:

a dotted line is a position which is connected to Formula 100;

Q1 is O; S; or C(R118) (R119),

R41 to R44, R46 to R50, R53 to R55, R118, and R119 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R45, R51, and R52 are the same as or different from each other, and are each independently hydrogen, deuterium, or a substituted or unsubstituted alkyl group;

n41, n43, and n44 are each an integer from 0 to 7, and n42, n49, and n50 are each an integer from 0 to 5, and when n41 to n44, n49, and n50 are each 2 or higher, substituents in the parenthesis are the same as or different from each other.

In an exemplary embodiment of the present specification, the above-described description on R101 can be applied to R41.

In an exemplary embodiment of the present specification, R41 is hydrogen, deuterium, a substituted or unsubstituted alkyl group, or a substituted or unsubstituted aryl group.

In an exemplary embodiment of the present specification, R41 is hydrogen; deuterium; a substituted or unsubstituted alkyl group having 1 to 10 carbon atoms, or a substituted or unsubstituted aryl group having 6 to 30 carbon atoms.

In an exemplary embodiment of the present specification, R41 is hydrogen, deuterium, or a substituted or unsubstituted alkyl group having 1 to 6 carbon atoms.

In an exemplary embodiment of the present specification, R41 is hydrogen, deuterium, or a tert-butyl group.

In an exemplary embodiment of the present specification, the above-described description on R102 can be applied to R42 to R44.

In an exemplary embodiment of the present specification, R42 and R43 are the same as or different from each other, and are each independently hydrogen, deuterium, a substituted or unsubstituted alkyl group, or a substituted or unsubstituted aryl group.

In an exemplary embodiment of the present specification, R42 and R43 are the same as or different from each other, and are each independently hydrogen, deuterium, a substituted or unsubstituted alkyl group having 1 to 10 carbon atoms, or a substituted or unsubstituted aryl group having 6 to 30 carbon atoms.

In an exemplary embodiment of the present specification, R42 and R43 are the same as or different from each other, and are each independently hydrogen, deuterium, or a substituted or unsubstituted alkyl group having 1 to 6 carbon atoms.

In an exemplary embodiment of the present specification, R42 and R43 are the same as or different from each other, and are each independently hydrogen, deuterium, or a methyl group.

In an exemplary embodiment of the present specification, R44 is hydrogen, deuterium, a substituted or unsubstituted alkyl group, or a substituted or unsubstituted aryl group, or four adjacent R44s are bonded to each other to form a substituted or unsubstituted aromatic hydrocarbon ring.

In an exemplary embodiment of the present specification, R44 is hydrogen, deuterium, a substituted or unsubstituted alkyl group having 1 to 10 carbon atoms, or a substituted or unsubstituted aryl group having 6 to 30 carbon atoms, or four adjacent R44s are bonded to each other to form a substituted or unsubstituted aromatic hydrocarbon ring having 6 to 30 carbon atoms.

In an exemplary embodiment of the present specification, R44 is hydrogen, deuterium, or a substituted or unsubstituted alkyl group having 1 to 6 carbon atoms, or four adjacent R44s are bonded to each other to form a substituted or unsubstituted benzene ring.

In an exemplary embodiment of the present specification, R44 is hydrogen, deuterium, or a methyl group, or four adjacent R44s are bonded to each other to form a benzene ring.

In an exemplary embodiment of the present specification, the above-described description on R103 and R104 can be applied to R45 to R49.

In an exemplary embodiment of the present specification, R46 to R50 are the same as or different from each other, and are each independently hydrogen, deuterium, a substituted or unsubstituted alkyl group, or a substituted or unsubstituted aryl group, or are bonded to an adjacent substituent to form a substituted or unsubstituted ring.

In an exemplary embodiment of the present specification, R46 to R50 are the same as or different from each other, and are each independently hydrogen, deuterium, a substituted or unsubstituted alkyl group having 1 to 10 carbon atoms, or a substituted or unsubstituted aryl group having 6 to 30 carbon atoms, or two adjacent substituents are bonded to each other to form a substituted or unsubstituted hydrocarbon ring having 5 to 30 carbon atoms.

In an exemplary embodiment of the present specification, R46 to R50 are the same as or different from each other, and are each independently hydrogen, deuterium, a substituted or unsubstituted alkyl group having 1 to 6 carbon atoms, or a substituted or unsubstituted aryl group having 6 to 20 carbon atoms, or two adjacent substituents are bonded to each other to form a substituted or unsubstituted aliphatic hydrocarbon ring having 5 to 20 carbon atoms.

In an exemplary embodiment of the present specification, the alkyl group or aryl group of R46 to R50 can be substituted with one or more substituents selected from the group consisting of deuterium, an alkyl group having 1 to 10 carbon atoms, and an aryl group having 6 to 30 carbon atoms, or a substituent to which two or more groups selected from the group are linked.

In an exemplary embodiment of the present specification, the alkyl group or aryl group of R46 to R50 can be substituted with deuterium, an alkyl group having 1 to 10 carbon atoms, an arylalkyl group having 7 to 50 carbon atoms, or an aryl group having 6 to 30 carbon atoms.

In an exemplary embodiment of the present specification, the aliphatic hydrocarbon ring formed by bonding two adjacent R49s; or two adjacent R50s to each other can be substituted with one or more substituents selected from the group consisting of deuterium and an alkyl group having 1 to 10 carbon atoms, or a substituent to which two or more groups selected from the group are linked.

In an exemplary embodiment of the present specification, R46 to R50 are the same as or different from each other, and are each independently hydrogen; deuterium; an alkyl group having 1 to 6 carbon atoms, which is unsubstituted or substituted with deuterium or an aryl group having 6 to 20 carbon atoms, or an aryl group having 6 to 20 carbon atoms, which is unsubstituted or substituted with deuterium or an alkyl group having 1 to 6 carbon atoms, or two adjacent R49s; or two adjacent R50s are bonded to each other to form an aliphatic hydrocarbon ring having 5 or 6 carbon atoms, which is unsubstituted or substituted with an alkyl group having 1 to 6 carbon atoms.

In an exemplary embodiment of the present specification, R46 to R50 are the same as or different from each other, and are each independently hydrogen, deuterium, a methyl group, an isopropyl group, a tert-butyl group, a 2-phenylpropan-2-yl group, or a phenyl group which is unsubstituted or substituted with a tert-butyl group, or two adjacent R49s; or two adjacent R50s are bonded to each other to form a cyclopentene ring which is unsubstituted or substituted with a methyl group, or a cyclohexene ring which is unsubstituted or substituted with a methyl group.

In an exemplary embodiment of the present specification, R45 is hydrogen, deuterium, or a substituted or unsubstituted alkyl group.

In an exemplary embodiment of the present specification, R45 is hydrogen, deuterium, or a substituted or unsubstituted alkyl group having 1 to 10 carbon atoms.

In an exemplary embodiment of the present specification, R45 is hydrogen; deuterium, or an alkyl group having 1 to 10 carbon atoms, which is substituted with one or more substituents selected from the group consisting of deuterium, an alkyl group having 1 to 10 carbon atoms, and an aryl group having 6 to 30 carbon atoms, or a substituent to which two or more groups selected from the group are linked.

In an exemplary embodiment of the present specification, R45 is hydrogen, deuterium, a methyl group, an isopropyl group, a tert-butyl group, or a 2-phenylpropan-2-yl group.

In an exemplary embodiment of the present specification, R51 and R52 are the same as or different from each other, and are each independently hydrogen, deuterium, or a substituted or unsubstituted alkyl group.

In an exemplary embodiment of the present specification, R51 and R52 are the same as or different from each other, and are each independently hydrogen, deuterium, or a substituted or unsubstituted alkyl group having 1 to 10 carbon atoms.

In an exemplary embodiment of the present specification, R51 and R52 are the same as or different from each other, and are each independently hydrogen, deuterium, or an alkyl group having 1 to 10 carbon atoms, which is substituted with one or more substituents selected from the group consisting of deuterium, an alkyl group having 1 to 10 carbon atoms, and an aryl group having 6 to 30 carbon atoms, or a substituent to which two or more groups selected from the group are linked.

In an exemplary embodiment of the present specification, R51 and R52 are the same as or different from each other, and are each independently hydrogen, deuterium, a methyl group, an isopropyl group, a tert-butyl group, or a 2-phenylpropan-2-yl group.

In an exemplary embodiment of the present specification, Group A-12 is selected from the following Group A-12-1:

Group A-12-1

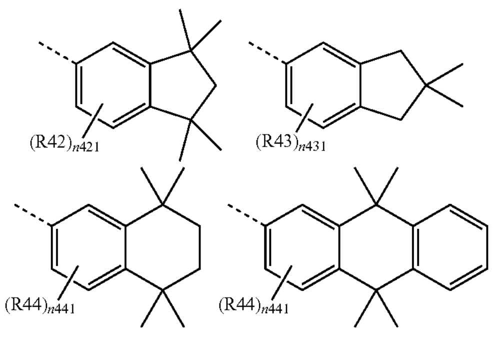

wherein in Group A-12-1:

the definitions of R42 to R44 are the same as those defined in Group A-12; and n421, n431, and n441 are each an integer from 0 to 3, and when n421, n431, and n441 are each 2 or higher, substituents in the parenthesis are the same as or different from each other.

When n41 is 2 or higher, R41s are the same as or different from each other. When n42 is 2 or higher, R42s are the same as or different from each other. When n43 is 2 or higher, R43s are the same as or different from each other. When n44 is 2 or higher, R44s are the same as or different from each other. When n49 is 2 or higher, R49s are the same as or different from each other. When n50 is 2 or higher, R50s are the same as or different from each other.

In an exemplary embodiment of the present specification, R1 is deuterium, a substituted or unsubstituted alkyl group, a substituted or unsubstituted heterocyclic group, or a substituted or unsubstituted amine group.

In an exemplary embodiment of the present specification, R1 is deuterium, a substituted or unsubstituted alkyl group, a substituted or unsubstituted heterocyclic group, or —N(R211) (R212).

In an exemplary embodiment of the present specification, R1 is deuterium, a substituted or unsubstituted alkyl group having 1 to 10 carbon atoms, a substituted or unsubstituted N-containing heterocyclic group having 2 to 30 carbon atoms, a substituted or unsubstituted arylamine group having 6 to 60 carbon atoms, or a substituted or unsubstituted arylheteroarylamine group having 6 to 60 carbon atoms.

In an exemplary embodiment of the present specification, R1 is deuterium, a substituted or unsubstituted alkyl group having 1 to 6 carbon atoms, a substituted or unsubstituted N-containing heterocyclic group having 2 to 20 carbon atoms, a substituted or unsubstituted arylamine group having 6 to 40 carbon atoms, or a substituted or unsubstituted arylheteroarylamine group having 6 to 40 carbon atoms.

In an exemplary embodiment of the present specification, R1 is deuterium, a substituted or unsubstituted alkyl group having 1 to 10 carbon atoms, a substituted or unsubstituted N-containing heterocyclic group having 2 to 30 carbon atoms, or —N(R211) (R212).

In an exemplary embodiment of the present specification, R1 is deuterium, a substituted or unsubstituted alkyl group having 1 to 6 carbon atoms, a substituted or unsubstituted N-containing heterocyclic group having 2 to 20 carbon atoms, or —N(R211) (R212).

In an exemplary embodiment of the present specification, R1 is deuterium; an alkyl group having 1 to 10 carbon atoms, which is unsubstituted or substituted with deuterium; an N-containing heterocyclic group having 2 to 30 carbon atoms, which is unsubstituted or substituted with one or more substituents selected from the group consisting of deuterium, an alkyl group having 1 to 10 carbon atoms, and an aryl group having 6 to 30 carbon atoms, or a substituent to which two or more groups selected from the group are linked; an arylamine group having 6 to 60 carbon atoms, which is unsubstituted or substituted with one or more substituents selected from the group consisting of deuterium and an alkyl group having 1 to 10 carbon atoms or a substituent to which two or more groups selected from the group are linked, and is unfused or fused with an aliphatic hydrocarbon ring having 5 to 30 carbon atoms; or an arylheteroarylamine group having 6 to 60 carbon atoms, which is unsubstituted or substituted with one or more substituents selected from the group consisting of deuterium and an alkyl group having 1 to 10 carbon atoms, or a substituent to which two or more groups selected from the group are linked.

In an exemplary embodiment of the present specification, R1 is deuterium; an alkyl group having 1 to 6 carbon atoms, which is unsubstituted or substituted with deuterium; an N-containing heterocyclic group having 2 to 20 carbon atoms, which is unsubstituted or substituted with an alkyl group having 1 to 6 carbon atoms, an aryl group having 6 to 20 carbon atoms, or an alkylaryl group having 7 to 30 carbon atoms; an arylamine group having 6 to 40 carbon atoms, which is unsubstituted or substituted with deuterium or an alkyl group having 1 to 6 carbon atoms, and is unfused or fused with an aliphatic hydrocarbon ring having 5 or 6 carbon atoms; or an arylheteroarylamine group having 6 to 40 carbon atoms, which is unsubstituted or substituted with deuterium.

In an exemplary embodiment of the present specification, R1 is a methyl group which is unsubstituted or substituted with deuterium; an isopropyl group; a tert-butyl group; a hexahydrocarbazole group which is unsubstituted or substituted with a methyl group, a tert-butyl group, a phenyl group, a tolyl group, a tert-butylphenyl group, or a tetramethyltetrahydronaphthalene group; a diphenylamine group which is unsubstituted or substituted with a methyl group, an isopropyl group, or a tert-butyl group, and is unfused or fused with cyclopentene or cyclohexene; an N-phenyl-N-dibenzofuranamine group; or an N-phenyl-N-dibenzothiopheneamine group.

In an exemplary embodiment of the present specification, R211 and R212 are the same as or different from each other, and are each independently a substituted or unsubstituted aryl group; or a substituted or unsubstituted heterocyclic group.

In an exemplary embodiment of the present specification, R211 and R212 are the same as or different from each other, and are each independently a substituted or unsubstituted aryl group having 6 to 30 carbon atoms; or a substituted or unsubstituted heterocyclic group having 2 to 30 carbon atoms.

In an exemplary embodiment of the present specification, R211 and R212 are the same as or different from each other, and are each independently an aryl group having 6 to 30 carbon atoms, which is unsubstituted or substituted with deuterium or an alkyl group having 1 to 10 carbon atoms, and is unfused or fused with an aliphatic hydrocarbon ring having 5 to 30 carbon atoms; or a heterocyclic group having 2 to 30 carbon atoms, which is unsubstituted or substituted with deuterium or an alkyl group having 1 to 10 carbon atoms.

In an exemplary embodiment of the present specification, R211 and R212 are the same as or different from each other, and are each independently an aryl group having 6 to 20 carbon atoms, which is unsubstituted or substituted with deuterium or an alkyl group having 1 to 6 carbon atoms, and is unfused or fused with an aliphatic hydrocarbon ring having 5 or 6 carbon atoms; or a heterocyclic group having 6 to 20 carbon atoms, which is unsubstituted or substituted with deuterium or an alkyl group having 1 to 6 carbon atoms.

In an exemplary embodiment of the present specification, R211 and R212 are the same as or different from each other, and are each independently a phenyl group which is unsubstituted or substituted with deuterium, a methyl group, or a tert-butyl group; a tetrahydronaphthalene group which is unsubstituted or substituted with a methyl group; a dibenzofuran group; or a dibenzothiophene group.

In an exemplary embodiment of the present specification, R1 is an alkyl group having 1 to 10 carbon atoms, which is unsubstituted or substituted with deuterium; an arylamine group having 6 to 60 carbon atoms, which is unsubstituted or substituted with one or more substituents selected from the group consisting of deuterium and an alkyl group having 1 to 10 carbon atoms, or a substituent to which two or more groups selected from the group are linked, and is unfused or fused with an aliphatic hydrocarbon ring having 5 to 30 carbon atoms; an arylheteroarylamine group having 6 to 60 carbon atoms, which is unsubstituted or substituted with one or more substituents selected from the group consisting of deuterium and an alkyl group having 1 to 10 carbon atoms, or a substituent to which two or more groups selected from the group are linked; or the following Formula Het1:

Formula Het1

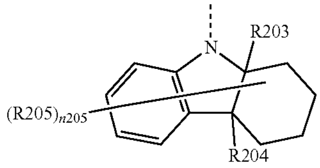

wherein in Formula Het1:

a dotted line is a position which is connected to Formula 100;

R203 to R205 are the same as or different from each other, and are each independently hydrogen, deuterium, an alkyl group having 1 to 10 carbon atoms, which is unsubstituted or substituted with deuterium, or an aryl group having 6 to 30 carbon atoms, which is unsubstituted or substituted with one or more substituents selected from the group consisting of deuterium and an alkyl group having 1 to 10 carbon atoms, or a substituent to which two or more groups selected from the group are linked; and n205 is an integer from 0 to 12, and when n205 is 2 or higher, R205s are the same as or different from each other.

In an exemplary embodiment of the present specification, R203 and R204 are the same as or different from each other, and are each independently hydrogen, deuterium, or a substituted or unsubstituted alkyl group.

In an exemplary embodiment of the present specification, R203 and R204 are the same as or different from each other, and are each independently hydrogen, deuterium, or a substituted or unsubstituted alkyl group having 1 to 10 carbon atoms.

In an exemplary embodiment of the present specification, R203 and R204 are the same as or different from each other, and are each independently hydrogen, deuterium, or a substituted or unsubstituted alkyl group having 1 to 6 carbon atoms.

In an exemplary embodiment of the present specification, R203 and R204 are a methyl group.

In an exemplary embodiment of the present specification, R205 is hydrogen, deuterium, a substituted or unsubstituted alkyl group, or a substituted or unsubstituted aryl group.

In an exemplary embodiment of the present specification, R205 is hydrogen, deuterium, a substituted or unsubstituted alkyl group having 1 to 10 carbon atoms, or a substituted or unsubstituted aryl group having 6 to 30 carbon atoms.

In an exemplary embodiment of the present specification, R205 is hydrogen, deuterium, an alkyl group having 1 to 10 carbon atoms, which is unsubstituted or substituted with deuterium, or an aryl group having 6 to 30 carbon atoms, which is unsubstituted or substituted with one or more substituents selected from the group consisting of deuterium and an alkyl group having 1 to 10 carbon atoms, or a substituent to which two or more groups selected from the group are linked.

In an exemplary embodiment of the present specification, R205 is hydrogen, deuterium, an alkyl group having 1 to 6 carbon atoms, which is unsubstituted or substituted with deuterium, or an aryl group having 6 to 20 carbon atoms, which is unsubstituted or substituted with deuterium or an alkyl group having 1 to 6 carbon atoms.

A form in which an aliphatic hydrocarbon ring is fused is also included in the substituted aryl group of R205.

In an exemplary embodiment of the present specification, R205 is hydrogen, deuterium, a methyl group, a tert-butyl group, a phenyl group which is unsubstituted or substituted with a methyl group or a tert-butyl group, or a tetrahydronaphthalene group which is unsubstituted or substituted with a methyl group.

In an exemplary embodiment of the present specification, R3 and R4 are the same as or different from each other, and are each independently deuterium, a substituted or unsubstituted alkyl group, a substituted or unsubstituted aryl group, a substituted or unsubstituted heterocyclic group, or a substituted or unsubstituted amine group.

In an exemplary embodiment of the present specification, R3 and R4 are the same as or different from each other, and are each independently deuterium, a substituted or unsubstituted alkyl group having 1 to 10 carbon atoms, a substituted or unsubstituted aryl group having 6 to 30 carbon atoms, a substituted or unsubstituted heterocyclic group having 6 to 30 carbon atoms, a substituted or unsubstituted arylamine group having 6 to 60 carbon atoms, or a substituted or unsubstituted arylheteroarylamine group having 6 to 60 carbon atoms.

In an exemplary embodiment of the present specification, R3 and R4 are the same as or different from each other, and are each independently deuterium, a substituted or unsubstituted alkyl group having 1 to 6 carbon atoms, a substituted or unsubstituted aryl group having 6 to 20 carbon atoms, a substituted or unsubstituted heterocyclic group having 6 to 20 carbon atoms, a substituted or unsubstituted arylamine group having 6 to 40 carbon atoms, or a substituted or unsubstituted arylheteroarylamine group having 6 to 40 carbon atoms.

In an exemplary embodiment of the present specification, R3 and R4 are the same as or different from each other, and are each independently deuterium, a substituted or unsubstituted alkyl group having 1 to 10 carbon atoms, a substituted or unsubstituted aryl group having 6 to 30 carbon atoms, a substituted or unsubstituted heterocyclic group having 6 to 30 carbon atoms, or —N(R211) (R212).

In an exemplary embodiment of the present specification, R3 and R4 are the same as or different from each other, and are each independently deuterium, a substituted or unsubstituted alkyl group having 1 to 6 carbon atoms, a substituted or unsubstituted aryl group having 6 to 20 carbon atoms, a substituted or unsubstituted heterocyclic group having 6 to 20 carbon atoms; or —N(R211) (R212).

In an exemplary embodiment of the present specification, R3 and R4 are the same as or different from each other, and are each independently deuterium; an alkyl group having 1 to 10 carbon atoms, which is unsubstituted or substituted with one or more substituents selected from the group consisting of deuterium and an aryl group having 6 to 30 carbon atoms or a substituent to which two or more groups selected from the group are linked; an aryl group having 6 to 30 carbon atoms, which is unsubstituted or substituted with one or more substituents selected from the group consisting of deuterium and an alkyl group having 1 to 10 carbon atoms or a substituent to which two or more groups selected from the group are linked; a heterocyclic group having 6 to 30 carbon atoms, which is unsubstituted or substituted with one or more substituents selected from the group consisting of deuterium, an alkyl group having 1 to 10 carbon atoms and an aryl group having 6 to 30 carbon atoms or a substituent to which two or more groups selected from the group are linked; an arylamine group having 6 to 60 carbon atoms, which is unsubstituted or substituted with one or more substituents selected from the group consisting of deuterium and an alkyl group having 1 to 10 carbon atoms or a substituent to which two or more groups selected from the group are linked, and is unfused or fused with an aliphatic hydrocarbon ring having 5 to 30 carbon atoms; or an arylheteroarylamine group having 6 to 60 carbon atoms, which is unsubstituted or substituted with one or more substituents selected from the group consisting of deuterium and an alkyl group having 1 to 10 carbon atoms or a substituent to which two or more groups selected from the group are linked.

In an exemplary embodiment of the present specification, R3 and R4 are the same as or different from each other, and are each independently deuterium; an alkyl group having 1 to 6 carbon atoms, which is unsubstituted or substituted with deuterium or an aryl group having 6 to 20 carbon atoms; an aryl group having 6 to 20 carbon atoms, which is unsubstituted or substituted with deuterium or an alkyl group having 1 to 6 carbon atoms; a heterocyclic group having 6 to 20 carbon atoms, which is unsubstituted or substituted with an alkyl group having 1 to 6 carbon atoms, an aryl group having 6 to 20 carbon atoms, or an alkylaryl group having 7 to 30 carbon atoms; an arylamine group having 6 to 40 carbon atoms, which is unsubstituted or substituted with deuterium or an alkyl group having 1 to 6 carbon atoms; or an arylheteroarylamine group having 2 to 40 carbon atoms, which is unsubstituted or substituted with deuterium or an alkyl group having 1 to 6 carbon atoms.

In an exemplary embodiment of the present specification, R3 and R4 are the same as or different from each other, and are each independently a methyl group; an isopropyl group; a tert-butyl group; a 2-phenylpropan-2-yl group; a phenyl group which is unsubstituted or substituted with a methyl group or a tert-butyl group; a dimethylfluorenyl group; a dibenzofuran group; a dibenzothiophene group; a hexahydrocarbazole group which is unsubstituted or substituted with a methyl group, a tert-butyl group, a phenyl group, a tolyl group, a tert-butylphenyl group or a tetramethyltetrahydronaphthalene group; a diphenylamine group which is unsubstituted or substituted with a methyl group or a tert-butyl group, and is unfused or fused with cyclohexene; an N-phenyl-N-dibenzofuranamine group which is unsubstituted or substituted with a methyl group or a tert-butyl group; or an N-phenyl-N-dibenzothiopheneamine group which is unsubstituted or substituted with a methyl group or a tert-butyl group.

In an exemplary embodiment of the present specification, two adjacent R3s are bonded to each other to form a substituted or unsubstituted aliphatic hydrocarbon ring.

In an exemplary embodiment of the present specification, two adjacent R3s are bonded to each other to form an aliphatic hydrocarbon ring having 5 to 30 carbon atoms, which is unsubstituted or substituted with an alkyl group having 1 to 10 carbon atoms.

In an exemplary embodiment of the present specification, two adjacent R3's are bonded to each other to form an aliphatic hydrocarbon ring having 5 to 20 carbon atoms, which is unsubstituted or substituted with an alkyl group having 1 to 6 carbon atoms.

In an exemplary embodiment of the present specification, two adjacent R3's are bonded to each other to form an aliphatic hydrocarbon ring having 5 or 6 carbon atoms, which is unsubstituted or substituted with a methyl group.

In an exemplary embodiment of the present specification, R2, R5, R6, and R8 are the same as or different from each other, and are each independently hydrogen, deuterium, or a substituted or unsubstituted alkyl group, or two adjacent substituents are bonded to each other to form a substituted or unsubstituted hydrocarbon ring.

In an exemplary embodiment of the present specification, R2, R5, R6, and R8 are the same as or different from each other, and are each independently hydrogen, deuterium, or a substituted or unsubstituted alkyl group having 1 to 10 carbon atoms, or two adjacent substituents are bonded to each other to form a substituted or unsubstituted hydrocarbon ring having 5 to 30 carbon atoms.

In an exemplary embodiment of the present specification, R2, R5, R6, and R8 are the same as or different from each other, and are each independently hydrogen, deuterium, or a substituted or unsubstituted alkyl group having 1 to 6 carbon atoms, or two adjacent substituents are bonded to each other to form a substituted or unsubstituted hydrocarbon ring having 5 to 20 carbon atoms.

In an exemplary embodiment of the present specification, R2, R5, R6, and R8 are the same as or different from each other, and are independently hydrogen, deuterium, or a methyl group, or two adjacent R2s; two adjacent R5s; or two adjacent R6s are bonded to each other to form a benzene ring.

In an exemplary embodiment of the present specification, n2 is 4 or higher, and four of a plurality of R2s are a methyl group.

In an exemplary embodiment of the present specification, n5 is 4 or higher, and four of a plurality of R5s are a methyl group.

In an exemplary embodiment of the present specification, n6 is 4 or higher, and four of a plurality of R6s are a methyl group.

In an exemplary embodiment of the present specification, n8 is 2 or higher, and two or four of a plurality of R8s are a methyl group.

In an exemplary embodiment of the present specification, n1 is 1.

In an exemplary embodiment of the present specification, n3 is 1.

In an exemplary embodiment of the present specification, n4 is 1.

When n2 is 2 or higher, R2s are the same as or different from each other. When n5 is 2 or higher, R5s are the same as or different from each other. When n6 is 2 or higher, R6s are the same as or different from each other.

In an exemplary embodiment of the present specification, Formula 100 is any one of the following Formulae 101 to 109:

Formula 101

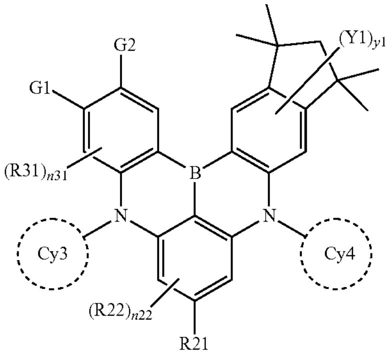

-continued

Formula 102

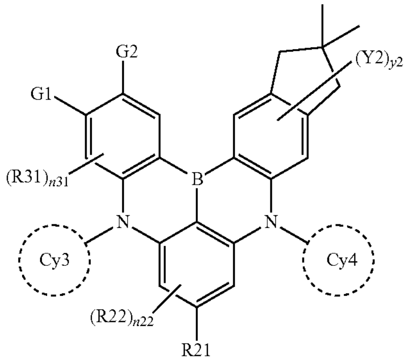

Formula 103

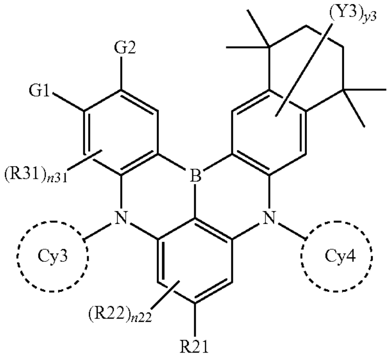

Formula 104

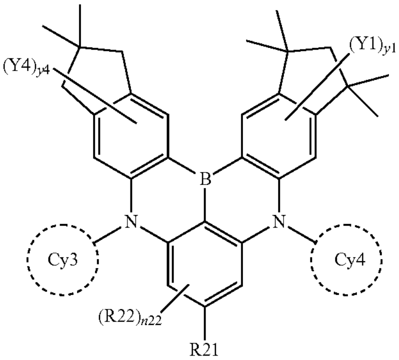

Formula 105

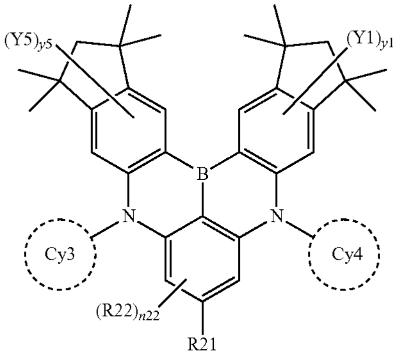

-continued

Formula 106

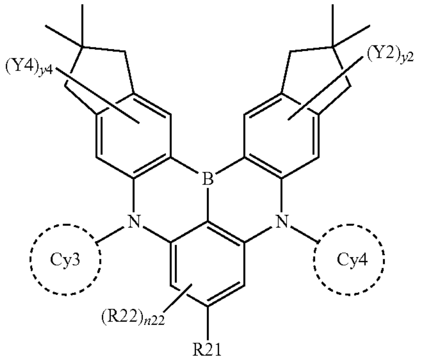

Formula 107

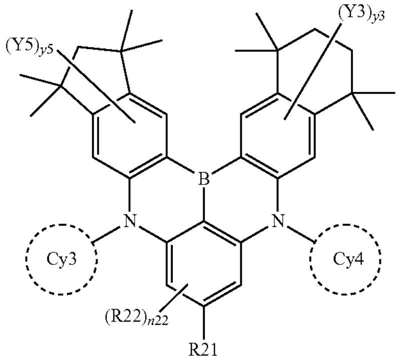

Formula 108

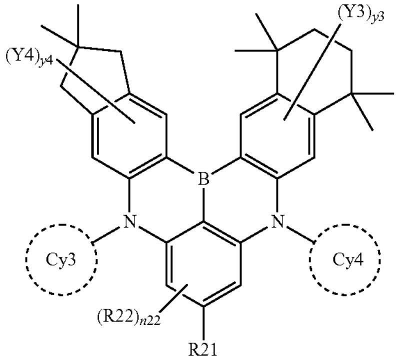

Formula 109

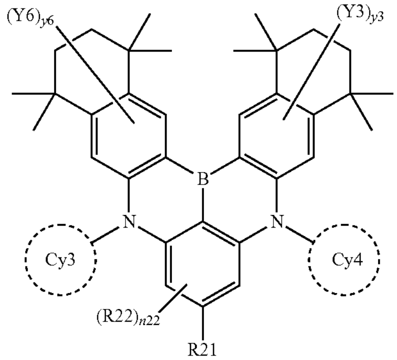

wherein in Formulae 101 to 109:

Cy3 and Cy4 are the same as those defined in Formula 100;

R22, R31, G1, G2, and Y1 to Y6 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R21 is a substituted or unsubstituted alkyl group, a substituted or unsubstituted aryl group, a substituted or unsubstituted heterocyclic group, or a substituted or unsubstituted amine group;

at least one of G1 and G2 is a substituted or unsubstituted alkyl group, a substituted or unsubstituted aryl group, a substituted or unsubstituted heterocyclic group, or a substituted or unsubstituted amine group;

n22 and n31 are each an integer from 0 to 2, y1 and y5 are each an integer from 0 to 4, and y2 to y4 and y6 are each an integer from 0 to 6, and when n22, n31, and y1 to y6 are each 2 or higher, substituents in the parenthesis are the same as or different from each other.

In an exemplary embodiment of the present specification, the above-described description on R1 can be applied to R21.

In an exemplary embodiment of the present specification, R21 is a substituted or unsubstituted alkyl group, a substituted or unsubstituted heterocyclic group, or a substituted or unsubstituted amine group.

In an exemplary embodiment of the present specification, R21 is deuterium, a substituted or unsubstituted alkyl group, a substituted or unsubstituted heterocyclic group, or —N(R211) (R212).

In an exemplary embodiment of the present specification, R21 is a substituted or unsubstituted alkyl group having 1 to 10 carbon atoms, a substituted or unsubstituted N-containing heterocyclic group having 2 to 30 carbon atoms, a substituted or unsubstituted arylamine group having 6 to 60 carbon atoms, or a substituted or unsubstituted arylheteroarylamine group having 6 to 60 carbon atoms.

In an exemplary embodiment of the present specification, R21 is an alkyl group having 1 to 10 carbon atoms, which is unsubstituted or substituted with deuterium; an N-containing heterocyclic group having 2 to 30 carbon atoms, which is unsubstituted or substituted with one or more substituents selected from the group consisting of deuterium, an alkyl group having 1 to 10 carbon atoms, and an aryl group having 6 to 30 carbon atoms, or a substituent to which two or more groups selected from the group are linked; an arylamine group having 6 to 60 carbon atoms, which is unsubstituted or substituted with one or more substituents selected from the group consisting of deuterium and an alkyl group having 1 to 10 carbon atoms or a substituent to which two or more groups selected from the group are linked, and is unfused or fused with an aliphatic hydrocarbon ring having 5 to 30 carbon atoms; or an arylheteroarylamine group having 6 to 60 carbon atoms, which is unsubstituted or substituted with one or more substituents selected from the group consisting of deuterium and an alkyl group having 1 to 10 carbon atoms, or a substituent to which two or more groups selected from the group are linked.

In an exemplary embodiment of the present specification, R21 is an alkyl group having 1 to 6 carbon atoms, which is unsubstituted or substituted with deuterium; an N-containing heterocyclic group having 2 to 20 carbon atoms, which is unsubstituted or substituted with an alkyl group having 1 to 6 carbon atoms, an aryl group having 6 to 20 carbon atoms, or an alkylaryl group having 7 to 30 carbon atoms;

an arylamine group having 6 to 40 carbon atoms, which is unsubstituted or substituted with deuterium or an alkyl group having 1 to 6 carbon atoms, and is unfused or fused with an aliphatic hydrocarbon ring having 5 or 6 carbon atoms; or an arylheteroarylamine group having 6 to 40 carbon atoms, which is unsubstituted or substituted with deuterium.

In an exemplary embodiment of the present specification, R21 is a methyl group which is unsubstituted or substituted with deuterium; an isopropyl group; a tert-butyl group; a hexahydrocarbazole group which is unsubstituted or substituted with a methyl group, a tert-butyl group, a phenyl group, a tolyl group, a tert-butylphenyl group, or a tetramethyltetrahydronaphthalene group; a diphenylamine group which is unsubstituted or substituted with a methyl group, an isopropyl group, or a tert-butyl group, and is unfused or fused with cyclopentene or cyclohexene; an N-phenyl-N-dibenzofuranamine group; or an N-phenyl-N-dibenzothiopheneamine group.

In an exemplary embodiment of the present specification, R21 is an alkyl group having 1 to 10 carbon atoms, which is unsubstituted or substituted with deuterium; an N-containing heterocyclic group having 2 to 30 carbon atoms, which is unsubstituted or substituted with one or more substituents selected from the group consisting of deuterium, an alkyl group having 1 to 10 carbon atoms, and an aryl group having 6 to 30 carbon atoms, or a substituent to which two or more groups selected from the group are linked; or —N(R211) (R212).

In an exemplary embodiment of the present specification, R21 is an alkyl group having 1 to 10 carbon atoms, which is unsubstituted or substituted with deuterium; an arylamine group having 6 to 60 carbon atoms, which is unsubstituted or substituted with one or more substituents selected from the group consisting of deuterium and an alkyl group having 1 to 10 carbon atoms, or a substituent to which two or more groups selected from the group are linked, and is unfused or fused with an aliphatic hydrocarbon ring having 5 to 30 carbon atoms; an arylheteroarylamine group having 6 to 60 carbon atoms, which is unsubstituted or substituted with one or more substituents selected from the group consisting of deuterium and an alkyl group having 1 to 10 carbon atoms, or a substituent to which two or more groups selected from the group are linked; or the above Formula Het1.

In an exemplary embodiment of the present specification, R22 is hydrogen or deuterium.

In an exemplary embodiment of the present specification, R31 is hydrogen or deuterium.

In an exemplary embodiment of the present specification, the above-described description on R3 and R4 can be applied to G1 and G2.

In an exemplary embodiment of the present specification, at least one of G1 and G2 is a substituted or unsubstituted alkyl group having 1 to 10 carbon atoms, a substituted or unsubstituted aryl group having 6 to 30 carbon atoms, a substituted or unsubstituted arylamine group having 6 to 60 carbon atoms, or a substituted or unsubstituted arylheteroarylamine group having 6 to 60 carbon atoms.

In an exemplary embodiment of the present specification, at least one of G1 and G2 is deuterium, a substituted or unsubstituted alkyl group, a substituted or unsubstituted heterocyclic group, or —N(R211) (R212).

In an exemplary embodiment of the present specification, at least one of G1 and G2 is an alkyl group having 1 to 10 carbon atoms, which is unsubstituted or substituted with one or more substituents selected from the group consisting of deuterium and an aryl group having 6 to 30 carbon atoms or a substituent to which two or more groups selected from the group are linked; an aryl group having 6 to 30 carbon atoms, which is unsubstituted or substituted with one or more substituents selected from the group consisting of deuterium and an alkyl group having 1 to 10 carbon atoms or a substituent to which two or more groups selected from the group are linked; a heterocyclic group having 6 to 30 carbon atoms, which is unsubstituted or substituted with one or more substituents selected from the group consisting of deuterium, an alkyl group having 1 to 10 carbon atoms and an aryl group having 6 to 30 carbon atoms or a substituent to which two or more groups selected from the group are linked; an arylamine group having 6 to 60 carbon atoms, which is unsubstituted or substituted with one or more substituents selected from the group consisting of deuterium and an alkyl group having 1 to 10 carbon atoms or a substituent to which two or more groups selected from the group are linked, and is unfused or fused with an aliphatic hydrocarbon ring having 5 to 30 carbon atoms; or an arylheteroarylamine group having 6 to 60 carbon atoms, which is unsubstituted or substituted with one or more substituents selected from the group consisting of deuterium and an alkyl group having 1 to 10 carbon atoms or a substituent to which two or more groups selected from the group are linked.

In an exemplary embodiment of the present specification, at least one of G1 and G2 is an alkyl group having 1 to 6 carbon atoms, which is unsubstituted or substituted with deuterium or an aryl group having 6 to 20 carbon atoms; an aryl group having 6 to 20 carbon atoms, which is unsubstituted or substituted with deuterium or an alkyl group having 1 to 6 carbon atoms; a heterocyclic group having 6 to 20 carbon atoms, which is unsubstituted or substituted with an alkyl group having 1 to 6 carbon atoms, an aryl group having 6 to 20 carbon atoms, or an alkylaryl group having 7 to 30 carbon atoms; an arylamine group having 6 to 40 carbon atoms, which is unsubstituted or substituted with deuterium or an alkyl group having 1 to 6 carbon atoms, and is unfused or fused with an aliphatic hydrocarbon ring having 5 or 6 carbon atoms; or an arylheteroarylamine group having 6 to 40 carbon atoms, which is unsubstituted or substituted with deuterium.

In an exemplary embodiment of the present specification, at least one of G1 and G2 is a methyl group; an isopropyl group; a tert-butyl group; a 2-phenylpropan-2-yl group; a phenyl group which is unsubstituted or substituted with a methyl group or a tert-butyl group; a dimethylfluorenyl group; a dibenzofuran group; a dibenzothiophene group; a hexahydrocarbazole group, which is unsubstituted or substituted with a methyl group, a tert-butyl group, a phenyl group, a tolyl group, a tert-butylphenyl group, or a tetramethyltetrahydronaphthalene group; a diphenylamine group which is unsubstituted or substituted with a methyl group, an isopropyl group, or a tert-butyl group, and is unfused or fused with cyclopentene or cyclohexene; an N-phenyl-N-dibenzofuranamine group; or an N-phenyl-N-dibenzothiopheneamine group.

In an exemplary embodiment of the present specification, at least one of G1 and G2 is an alkyl group having 1 to 10 carbon atoms, which is unsubstituted or substituted with one or more substituents selected from the group consisting of deuterium and an aryl group having 6 to 30 carbon atoms or a substituent to which two or more groups selected from the group are linked; an aryl group having 6 to 30 carbon atoms, which is unsubstituted or substituted with one or more substituents selected from the group consisting of deuterium and an alkyl group having 1 to 10 carbon atoms or a substituent to which two or more groups selected from the group are linked; a heterocyclic group having 6 to 30 carbon atoms, which is unsubstituted or substituted with one or more substituents selected from the group consisting of deuterium, an alkyl group having 1 to 10 carbon atoms, and an aryl group having 6 to 30 carbon atoms or a substituent to which two or more groups selected from the group are linked; or —N(R211) (R212).

In an exemplary embodiment of the present specification, any one of G1 and G2 is a substituted or unsubstituted alkyl group, a substituted or unsubstituted aryl group, a substituted or unsubstituted heterocyclic group, or a substituted or unsubstituted amine group, and the other is hydrogen or deuterium.

In an exemplary embodiment of the present specification, any one of G1 and G2 is a substituted or unsubstituted alkyl group having 1 to 10 carbon atoms, a substituted or unsubstituted aryl group having 6 to 30 carbon atoms, a substituted or unsubstituted heterocyclic group having 6 to 30 carbon atoms, a substituted or unsubstituted arylamine group having 6 to 60 carbon atoms, or a substituted or unsubstituted arylheteroarylamine group having 6 to 60 carbon atoms, and the other is hydrogen or deuterium.

In an exemplary embodiment of the present specification, any one of G1 and G2 is an alkyl group having 1 to 6 carbon atoms, which is unsubstituted or substituted with deuterium or an aryl group having 6 to 20 carbon atoms; an aryl group having 6 to 20 carbon atoms, which is unsubstituted or substituted with deuterium or an alkyl group having 1 to 6 carbon atoms; a heterocyclic group having 6 to 20 carbon atoms, which is unsubstituted or substituted with an alkyl group having 1 to 6 carbon atoms, an aryl group having 6 to 20 carbon atoms, or an alkylaryl group having 7 to 30 carbon atoms; an arylamine group having 6 to 40 carbon atoms, which is unsubstituted or substituted with deuterium or an alkyl group having 1 to 6 carbon atoms, and is unfused or fused with an aliphatic hydrocarbon ring having 5 or 6 carbon atoms; or an arylheteroarylamine group having 6 to 40 carbon atoms, which is unsubstituted or substituted with deuterium, and the other is hydrogen or deuterium.

In an exemplary embodiment of the present specification, any one of G1 and G2 is an alkyl group having 1 to 6 carbon atoms, which is unsubstituted or substituted with deuterium or an aryl group having 6 to 20 carbon atoms; an aryl group having 6 to 20 carbon atoms, which is unsubstituted or substituted with deuterium or an alkyl group having 1 to 6 carbon atoms; a heterocyclic group having 6 to 20 carbon atoms, which is unsubstituted or substituted with an alkyl group having 1 to 6 carbon atoms, an aryl group having 6 to 20 carbon atoms, or an alkylaryl group having 7 to 30 carbon atoms; or —N(R211) (R212), and the other is hydrogen or deuterium.

In an exemplary embodiment of the present specification, Y1 to Y6 are the same as or different from each other, and are each independently hydrogen or deuterium, or four adjacent Y3s; or four adjacent Y6s are bonded to each other to form a benzene ring.

In an exemplary embodiment of the present specification, Y1 to Y6 are the same as or different from each other, and are each independently hydrogen or deuterium, or four adjacent Y3s; or four adjacent Y6s are bonded to each other to form a benzene ring.

In an exemplary embodiment of the present specification, Formula 103 is the following Formula 103-1 or 103-2:

Formula 103-1

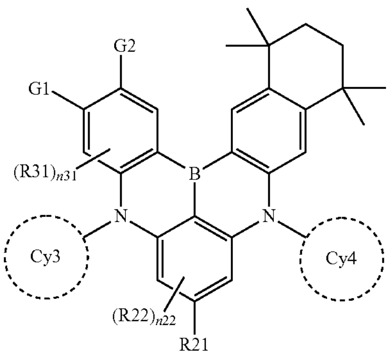

Formula 103-2

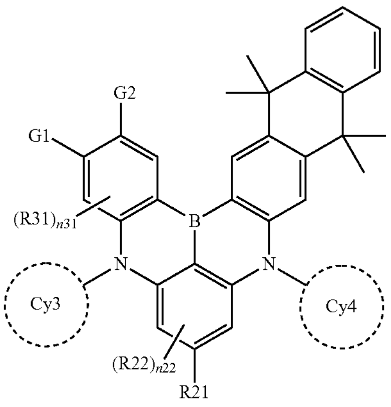

wherein in Formulae 103-1 and 103-2:

the definitions of G1, G2, Cy3, Cy4, R21, R22, R31, n22, and n31 are the same as those defined in Formula 103.

In an exemplary embodiment of the present specification, Formula 107 is the following Formula 107-1 or 107-2:

Formula 107-1

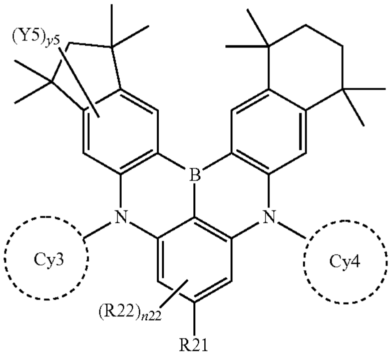

-continued

Formula 107-2

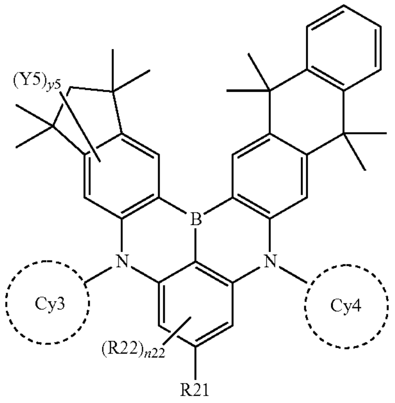

wherein in Formulae 107-1 and 107-2:

the definitions of Y5, Cy3, Cy4, R21, R22, n22, and y5 are the same as those defined in Formula 107.

In an exemplary embodiment of the present specification, Formula 108 is the following Formula 108-1 or 108-2:

Formula 108-1

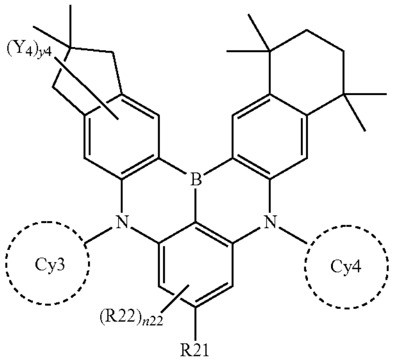

Formula 108-2

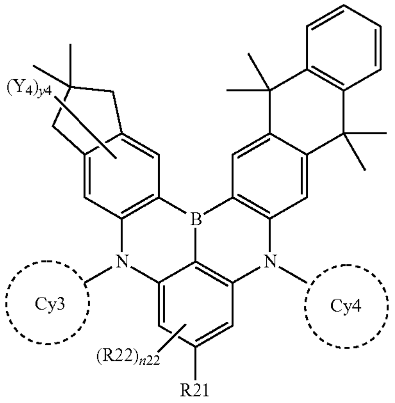

wherein in Formulae 108-1 and 108-2:

the definitions of Y4, Cy3, Cy4, R21, R22, n22, and y4 are the same as those defined in Formula 108.

In an exemplary embodiment of the present specification, Formula 109 is any one of the following Formulae 109-1 to 109-3:

Formula 109-1

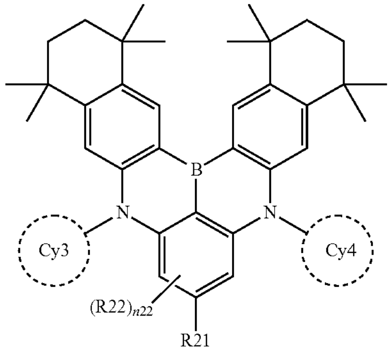

Formula 109-2

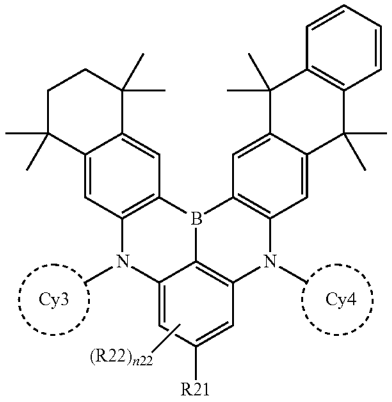

Formula 109-3

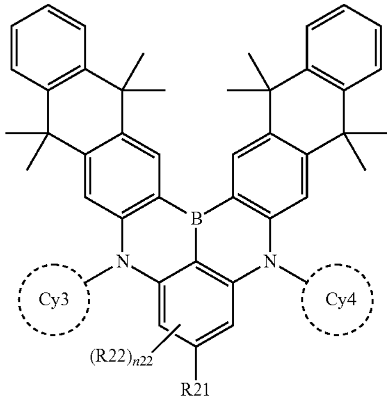

wherein in Formulae 109-1 to 109-3:

the definitions of Cy3, Cy4, R21, R22, and n22 are the same as those defined in Formula 109.

In an exemplary embodiment of the present specification, Formula 100 is any one of the following Formulae 201 to 209:

Formula 201
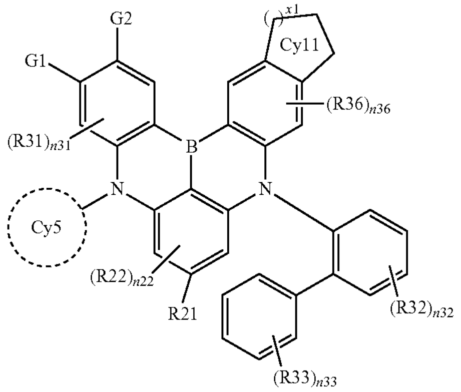
Formula 202
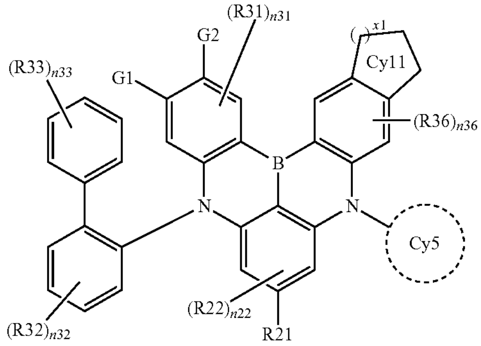
Formula 203
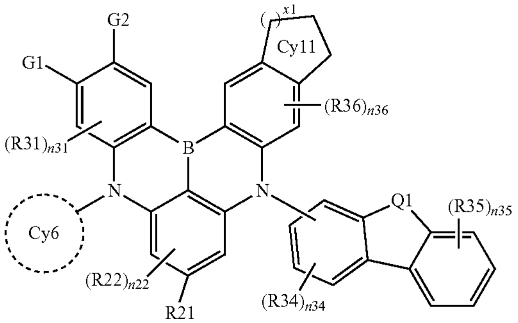
Formula 204
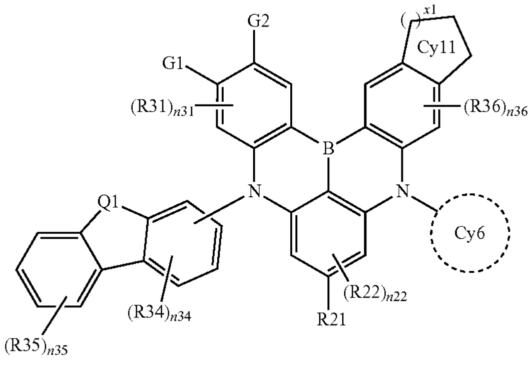
-continued
Formula 205
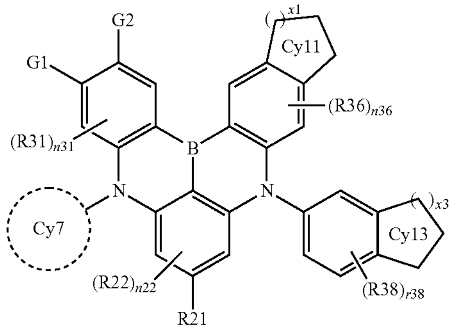
Formula 206
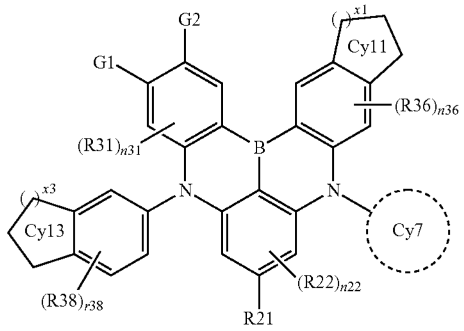
Formula 207
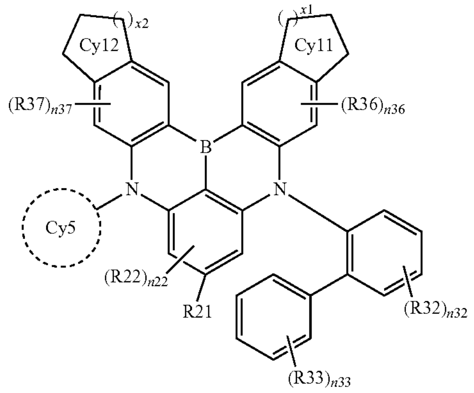
Formula 208
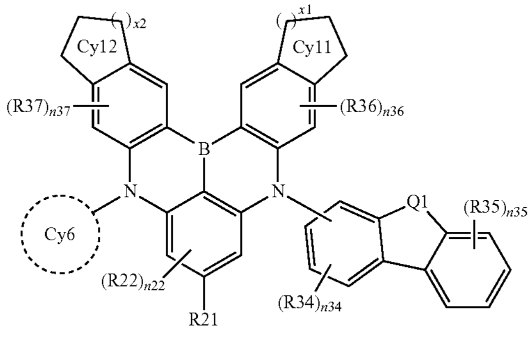

-continued

Formula 209

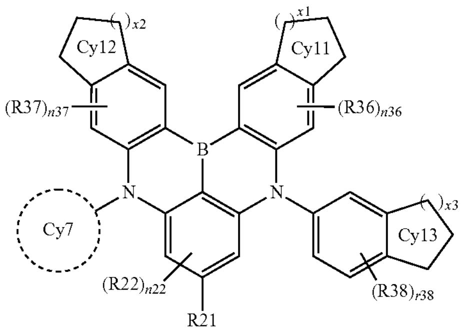

wherein in Formulae 201 to 209:

Q1 is the same as that defined in Formula 100;

Cy5 to Cy7 are the same as or different from each other, and are each independently one selected from the group consisting of a substituted or unsubstituted aromatic hydrocarbon ring, a substituted or unsubstituted aliphatic hydrocarbon ring, and a substituted or unsubstituted aromatic hetero ring, or a ring in which two or more rings selected from the group are fused;

R22, R31 to R38, G1, and G2 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R21 is a substituted or unsubstituted alkyl group, a substituted or unsubstituted aryl group, a substituted or unsubstituted heterocyclic group, or a substituted or unsubstituted amine group;

at least one of G1 and G2 is a substituted or unsubstituted alkyl group, a substituted or unsubstituted aryl group, a substituted or unsubstituted heterocyclic group, or a substituted or unsubstituted amine group;

x1 to x3 are each 1 or 2;

n22, n31, n36, and n37 are each an integer from 0 to 2, n32 and n35 are each an integer from 0 to 4, n33 is an integer from 0 to 5, and n34 and n38 are each an integer from 0 to 3, when n22 and n31 to n38 are each 2 or higher, substituents in the parenthesis are the same as or different from each other;

Cy11 to Cy13 are the same as or different from each other, and are each independently selected from the following structures:

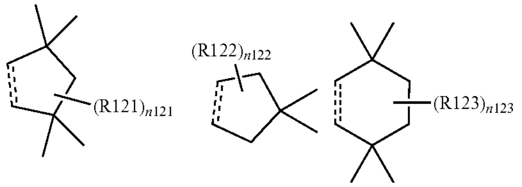

wherein in the structures:

a dotted double line is a position where substituents are fused;

R121 to R123 are the same as or different from each other, and are each independently hydrogen, deuterium, a substituted or unsubstituted alkyl group, a substituted or unsubstituted aryl group, or a substituted or unsubstituted heterocyclic group, or are bonded to an adjacent substituent to form a substituted or unsubstituted ring; and n121 is an integer from 0 to 2, n122 and n123 are each an integer from 0 to 4, and when n121 to n123 are each 2 or more, substituents in the parenthesis are the same as or different from each other.

In an exemplary embodiment of the present specification, the above-described description on R115 to R117 is applied to R121 to R123.

In an exemplary embodiment of the present specification, R121 and R122 are the same as or different from each other, and are each independently hydrogen or deuterium.

In an exemplary embodiment of the present specification, R123 is hydrogen or deuterium, or four adjacent R123s are bonded to each other to form a substituted or unsubstituted benzene ring.

In an exemplary embodiment of the present specification, R123 is hydrogen or deuterium, or four adjacent R123s are bonded to each other to form a benzene ring which is unsubstituted or substituted with an alkyl group having 1 to 10 carbon atoms.

In an exemplary embodiment of the present specification, R123 is hydrogen or deuterium, or four adjacent R123s are bonded to each other to form a benzene ring.

In an exemplary embodiment of the present specification, Cy11 to Cy13 are the same as or different from each other, and are each independently selected from the following structures:

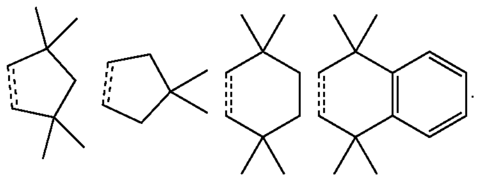

In an exemplary embodiment of the present specification, the above-described description on R103 can be applied to R32.

In an exemplary embodiment of the present specification, the above-described description on R104 can be applied to R33.

In an exemplary embodiment of the present specification, R32 and R33 are the same as or different from each other, and are each independently hydrogen, deuterium, a substituted or unsubstituted alkyl group, or a substituted or unsubstituted aryl group, or two adjacent R32s; or two adjacent R33s are bonded to each other to form a substituted or unsubstituted hydrocarbon ring.

In an exemplary embodiment of the present specification, R32 and R33 are the same as or different from each other, and are each independently hydrogen, deuterium, a substituted or unsubstituted alkyl group having 1 to 10 carbon atoms, or a substituted or unsubstituted aryl group having 6 to 30 carbon atoms, or two adjacent R32s; or two adjacent R33s are bonded to each other to form a substituted or unsubstituted aliphatic hydrocarbon ring having 5 to 30 carbon atoms.

In an exemplary embodiment of the present specification, R32 and R33 are the same as or different from each other, and are each independently hydrogen, deuterium, a substituted or unsubstituted alkyl group having 1 to 6 carbon atoms, or a substituted or unsubstituted aryl group having 6 to 20 carbon atoms, or two adjacent R32s; or two adjacent R33s are bonded to each other to form a substituted or unsubstituted aliphatic hydrocarbon ring having 5 to 20 carbon atoms.

In an exemplary embodiment of the present specification, the alkyl group or aryl group of R32 and R33 can be substituted with one or more substituents selected from the group consisting of deuterium, an alkyl group having 1 to 10 carbon atoms, and an aryl group having 6 to 30 carbon atoms, or a substituent to which two or more groups selected from the group are linked.

In an exemplary embodiment of the present specification, the alkyl group or aryl group of R32 and R33 can be substituted with deuterium, an alkyl group having 1 to 10 carbon atoms, an arylalkyl group having 7 to 50 carbon atoms, or an aryl group having 6 to 30 carbon atoms.

In an exemplary embodiment of the present specification, the aliphatic hydrocarbon ring formed by bonding two adjacent R32s, or two R33s adjacent to each other can be substituted with one or more substituents selected from the group consisting of deuterium and an alkyl group having 1 to 10 carbon atoms, or a substituent to which two or more groups selected from the group are linked.

In an exemplary embodiment of the present specification, R32 and R33 are the same as or different from each other, and are each independently hydrogen; deuterium; an alkyl group having 1 to 6 carbon atoms, which is unsubstituted or substituted with deuterium or an aryl group having 6 to 20 carbon atoms; or an aryl group having 6 to 20 carbon atoms, which is unsubstituted or substituted with deuterium or an alkyl group having 1 to 6 carbon atoms, or two adjacent R32s; or two adjacent R33s are bonded to each other to form an aliphatic hydrocarbon ring having 5 or 6 carbon atoms, which is unsubstituted or substituted with an alkyl group having 1 to 6 carbon atoms.

In an exemplary embodiment of the present specification, R32 and R33 are the same as or different from each other, and are each independently hydrogen; deuterium; a methyl group; an isopropyl group; a tert-butyl group; a 2-phenylpropan-2-yl group; or a phenyl group which is unsubstituted or substituted with a tert-butyl group, or two adjacent R32s; or two adjacent R33s are bonded to each other to form a cyclopentene ring which is unsubstituted or substituted with a methyl group, or a cyclohexene ring which is unsubstituted or substituted with a methyl group.

In an exemplary embodiment of the present specification, R32 is hydrogen; deuterium; a methyl group; an isopropyl group; a tert-butyl group; a 2-phenylpropan-2-yl group; or a phenyl group which is unsubstituted or substituted with a tert-butyl group.

In an exemplary embodiment of the present specification, R33 is hydrogen; deuterium; a methyl group; an isopropyl group; a tert-butyl group; a 2-phenylpropan-2-yl group; or a phenyl group which is unsubstituted or substituted with a tert-butyl group, or two adjacent R33s are bonded to each other to form a cyclopentene ring which is unsubstituted or substituted with a methyl group, or a cyclohexene ring which is unsubstituted or substituted with a methyl group.

In an exemplary embodiment of the present specification, the above-described description on R101 can be applied to R34 and R35.

In an exemplary embodiment of the present specification, R34 and R35 are the same as or different from each other, and are each independently hydrogen, deuterium, a substituted or unsubstituted alkyl group, or a substituted or unsubstituted aryl group.

In an exemplary embodiment of the present specification, R34 and R35 are the same as or different from each other, and are each independently hydrogen, deuterium, a substituted or unsubstituted alkyl group having 1 to 10 carbon atoms, or a substituted or unsubstituted aryl group having 6 to 30 carbon atoms.

In an exemplary embodiment of the present specification, R34 and R35 are the same as or different from each other, and are each independently hydrogen, deuterium, or a substituted or unsubstituted alkyl group having 1 to 6 carbon atoms.

In an exemplary embodiment of the present specification, R34 and R35 are the same as or different from each other, and are each independently hydrogen, deuterium, or a tert-butyl group.

In an exemplary embodiment of the present specification, R36 and R37 are the same as or different from each other, and are each independently hydrogen or deuterium.

In an exemplary embodiment of the present specification, the above-described description on R102 can be applied to R38.

In an exemplary embodiment of the present specification, R38 is hydrogen, deuterium, a substituted or unsubstituted alkyl group, or a substituted or unsubstituted aryl group.

In an exemplary embodiment of the present specification, R38 is hydrogen, deuterium, a substituted or unsubstituted alkyl group having 1 to 10 carbon atoms, or a substituted or unsubstituted aryl group having 6 to 30 carbon atoms.

In an exemplary embodiment of the present specification, R38 is hydrogen, deuterium, or a substituted or unsubstituted alkyl group having 1 to 6 carbon atoms.

In an exemplary embodiment of the present specification, R38 is hydrogen, deuterium, or a methyl group.

In an exemplary embodiment of the present specification, the above-described description on Cy3 and Cy4 can be applied to Cy5 to Cy7.

In an exemplary embodiment of the present specification, Cy5 to Cy7 are the same as or different from each other, and are each independently selected from Formulae A-1 to A-3, or a substituted or unsubstituted aromatic hydrocarbon ring.

In an exemplary embodiment of the present specification, Cy5 to Cy7 are the same as or different from each other, and are each independently selected from Formulae A-1 to A-3, or a substituted or unsubstituted aromatic hydrocarbon ring having 6 to 30 carbon atoms.

In an exemplary embodiment of the present specification, Cy5 to Cy7 are the same as or different from each other, and are each independently selected from Formulae A-1 to A-3, or a substituted or unsubstituted monocyclic aromatic hydrocarbon ring having 6 to 20 carbon atoms.

In an exemplary embodiment of the present specification, Cy5 to Cy7 are the same as or different from each other, and are each independently selected from Formulae A-1 to A-3, or a monocyclic aromatic hydrocarbon ring having 6 to 20 carbon atoms, which is unsubstituted or substituted with one or more substituents selected from the group consisting of deuterium, an alkyl group having 1 to 6 carbon atoms, and an aryl group having 6 to 20 carbon atoms or a substituent to which two or more groups selected from the group are linked.

In an exemplary embodiment of the present specification, Cy5 to Cy7 are the same as or different from each other, and are each independently selected from Formulae A-1 to A-3, or a monocyclic aromatic hydrocarbon ring having 6 to 20 carbon atoms, which is unsubstituted or substituted with deuterium, an alkyl group having 1 to 10 carbon atoms, or an arylalkyl group having 7 to 50 carbon atoms.

In an exemplary embodiment of the present specification, Cy5 to Cy7 are the same as or different from each other, and are each independently selected from A-1 to A-3, or a phenyl group, a biphenyl group, or a terphenyl group, and the phenyl group, the biphenyl group, or the terphenyl group is unsubstituted or substituted with a methyl group, an isopropyl group, a tert-butyl group, or a 2-phenylpropan-2-yl group.

In an exemplary embodiment of the present specification, Cy5 to Cy7 are the same as or different from each other, and are each independently selected from Formulae A-1 to A-3.

In an exemplary embodiment of the present specification, Cy5 to Cy7 are the same as or different from each other, and are each independently selected from Groups A-11 to A-14.

In an exemplary embodiment of the present specification, in Formula 103, when Cy4 is

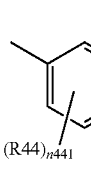

,

R44 is hydrogen or deuterium, G2 is a tert-butyl group, R21 is a methyl group; and Cy3 is a substituted phenyl group, and there are two or more substituents linked to the phenyl group of Cy3.

In an exemplary embodiment of the present specification, in Formula 205, when Cy11 and Cy13 are each

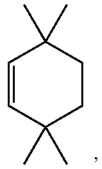

,

G2 is a tert-butyl group, R21 is a methyl group, and Cy7 is a substituted phenyl group; and there are two or more substituents linked to the phenyl group of Cy7.

In an exemplary embodiment of the present specification, Formula 103 excludes the case where two tert-butyl groups are included as a substituent included in G2, or/and Cy3. That is, the case where G2 of Formula 103 is a tert-butyl group can be included, the case where there is one tert-butyl group among the substituents linked to Cy3 of Formula 103 can be included, and the case where there are three tert-butyl groups among the substituents linked to Cy3 of Formula 103 can also be included. However, the case where there is one tert-butyl group among the substituents linked to Cy3 while G2 of Formula 103 is a tert-butyl group is excluded. Further, the case where there are two tert-butyl groups among the substituents linked to Cy3 of Formula 103 is also excluded.

In an exemplary embodiment of the present specification, Formula 205 excludes the case where two tert-butyl groups are included as a substituent included in G2, or/and Cy7. That is, the case where G2 of Formula 205 is a tert-butyl group can be included, the case where there is one tert-butyl group among the substituents linked to Cy7 of Formula 205 can be included, and the case where there are three tert-butyl groups among the substituents linked to Cy7 of Formula 205 can also be included. However, the case where there is one tert-butyl group among the substituents linked to Cy7 while G2 of Formula 205 is a tert-butyl group is excluded. Further, the case where there are two tert-butyl groups among the substituents linked to Cy7 of Formula 205 is also excluded.

In an exemplary embodiment of the present specification, the above-described formulae exclude the following compounds:

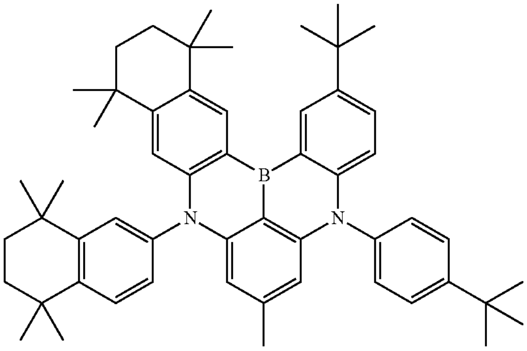

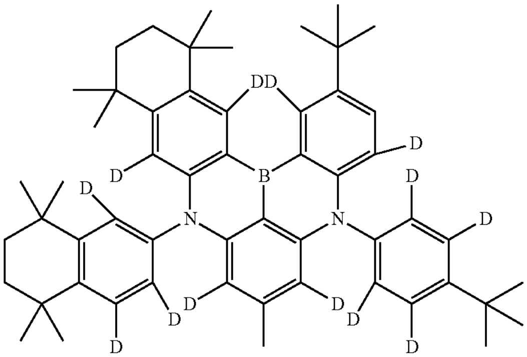

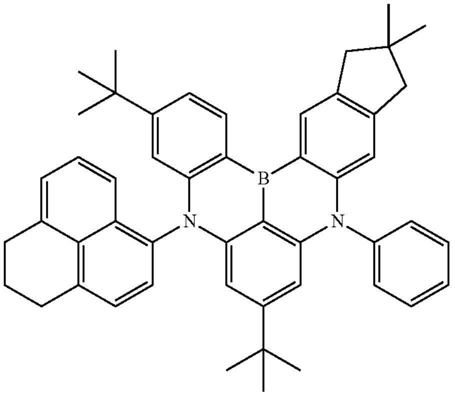

-continued
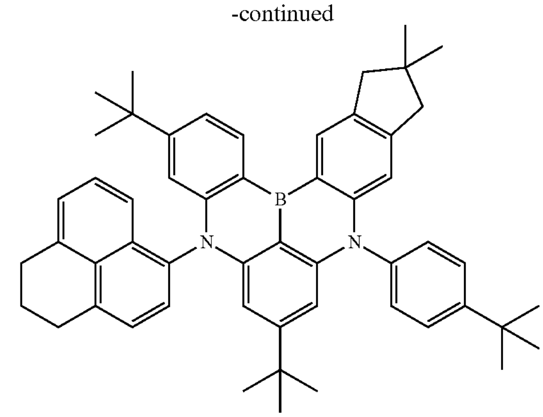
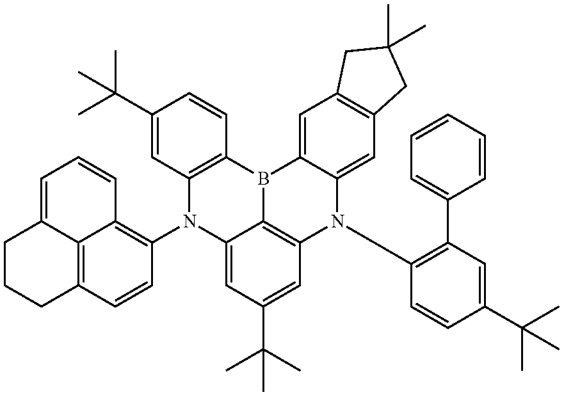
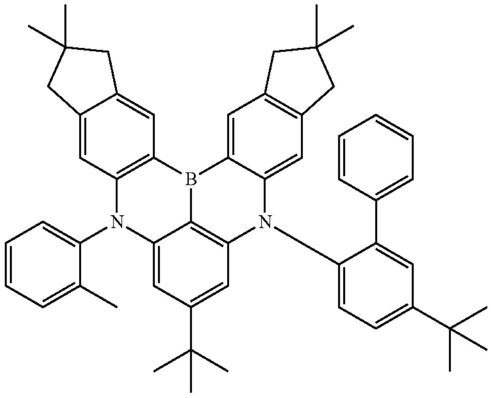
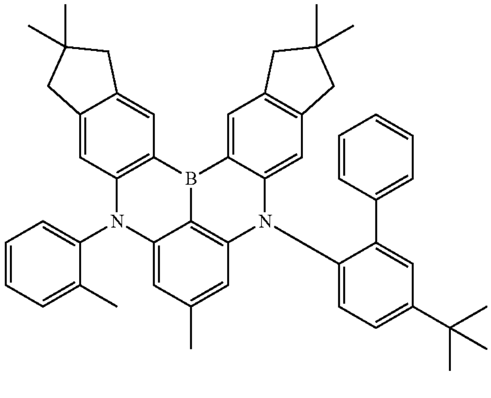
-continued
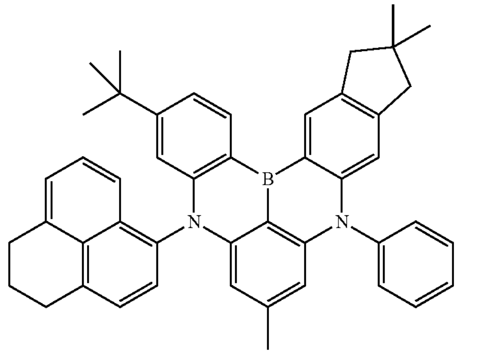
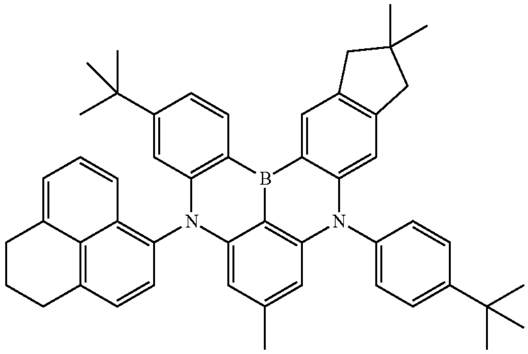
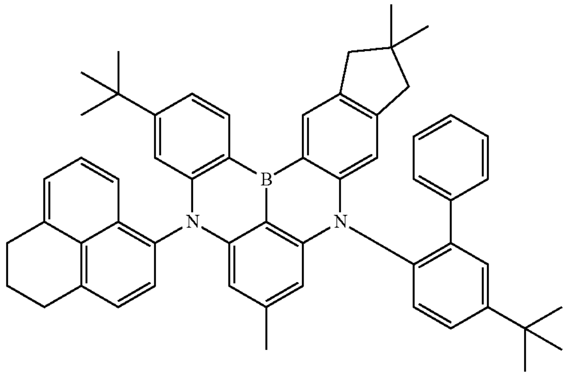
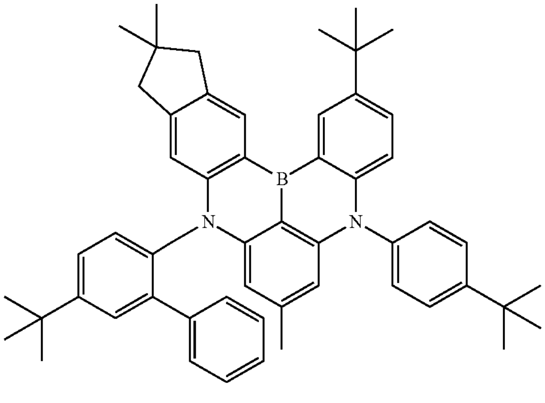

-continued
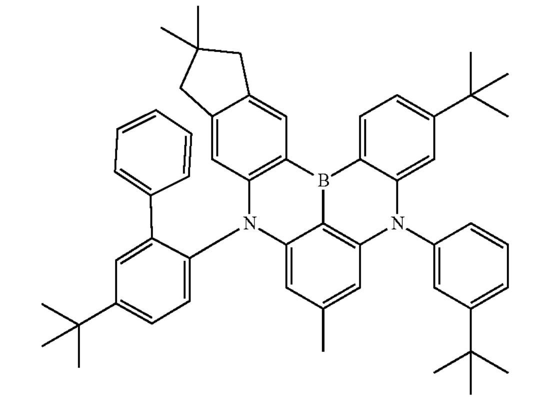
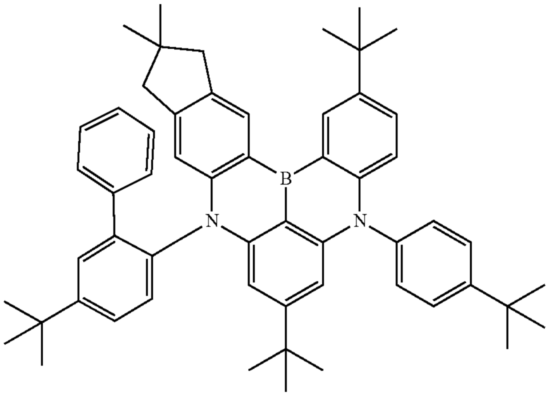
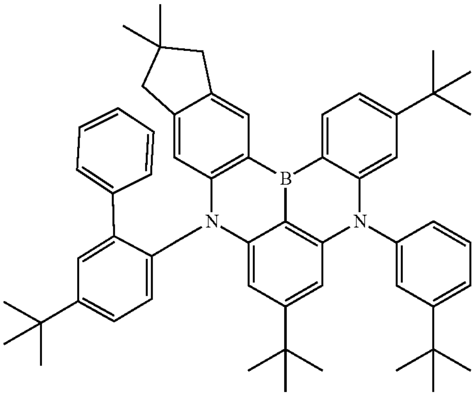
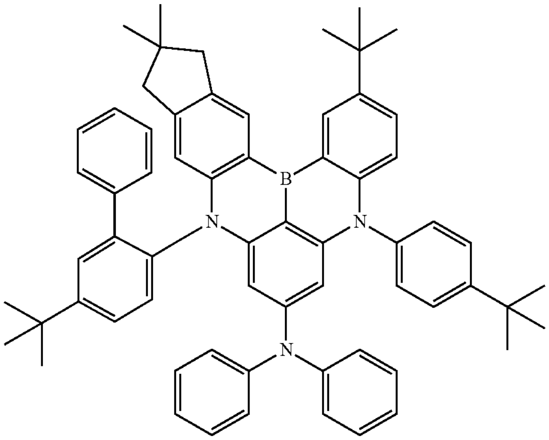
-continued
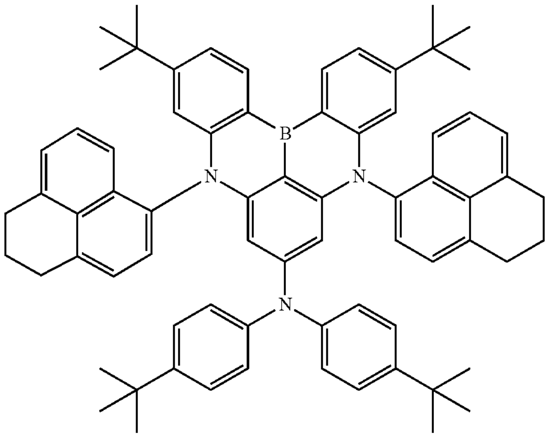
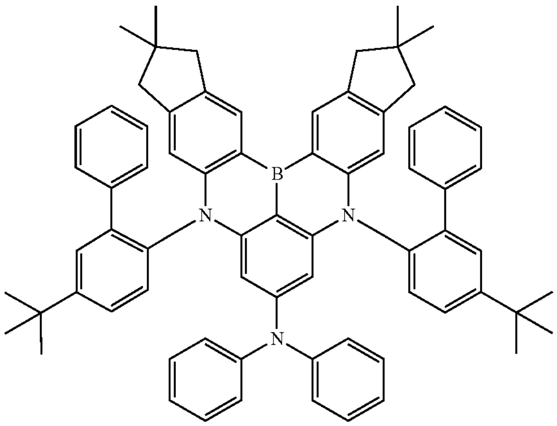
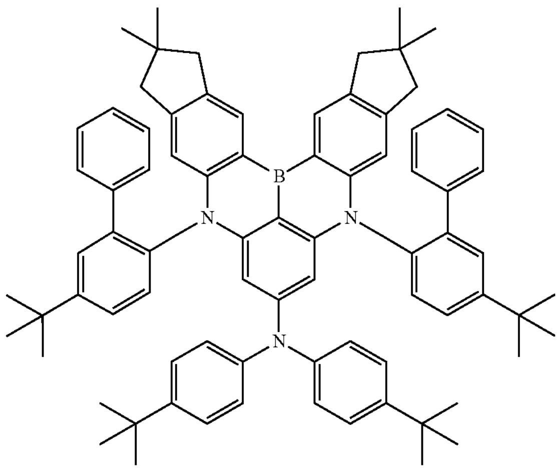

-continued
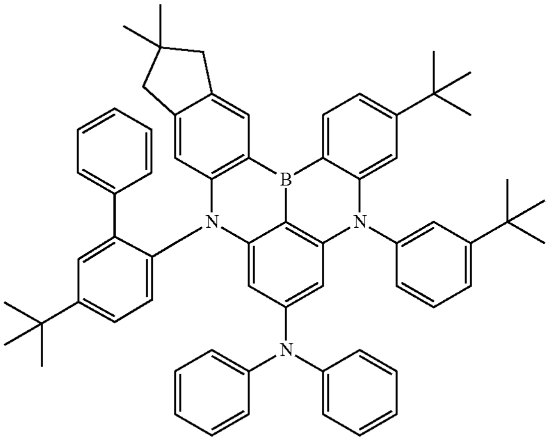
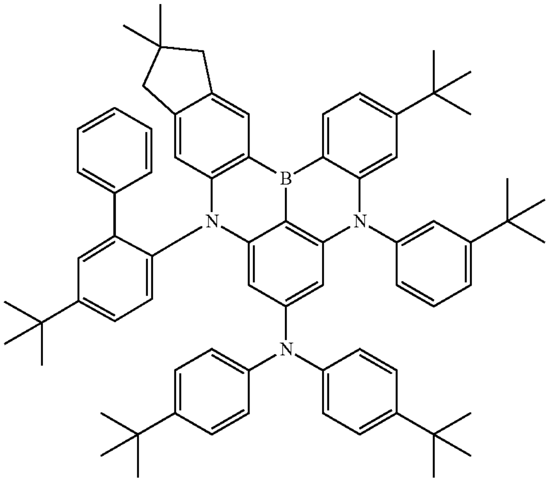
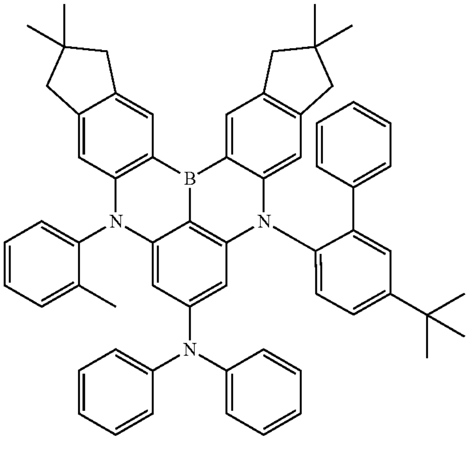
-continued
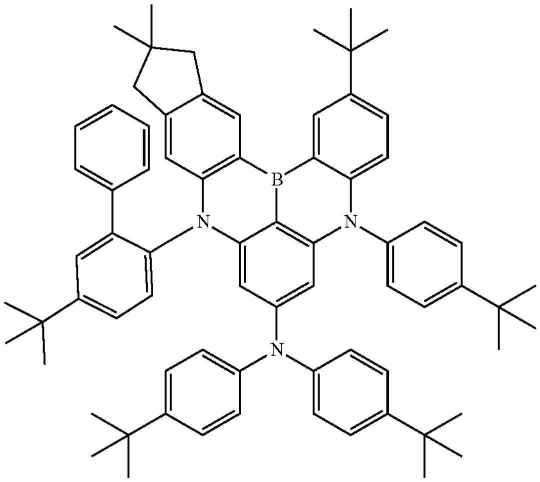
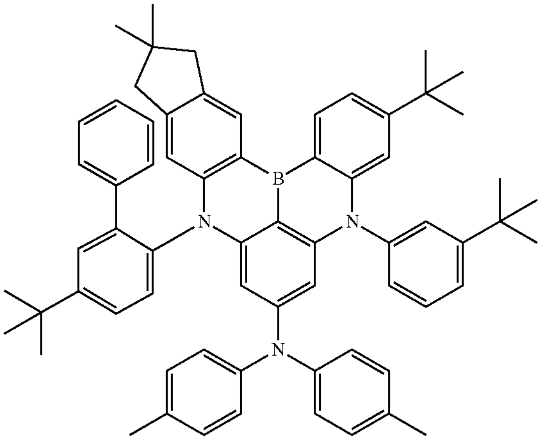
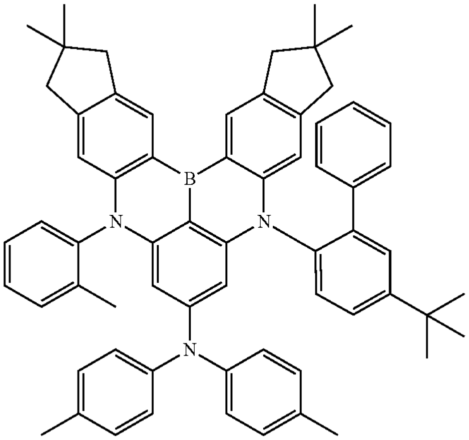

-continued
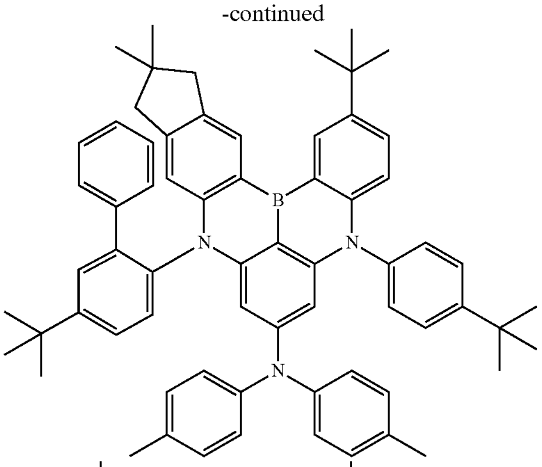
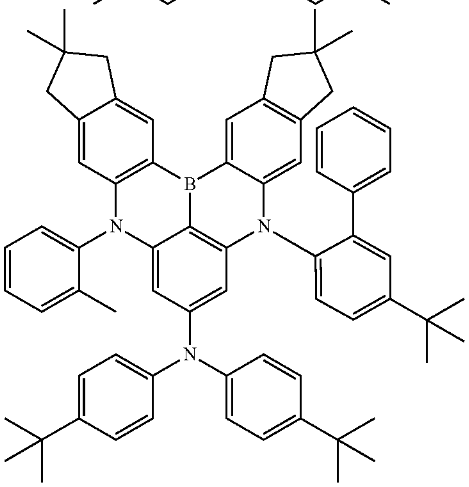
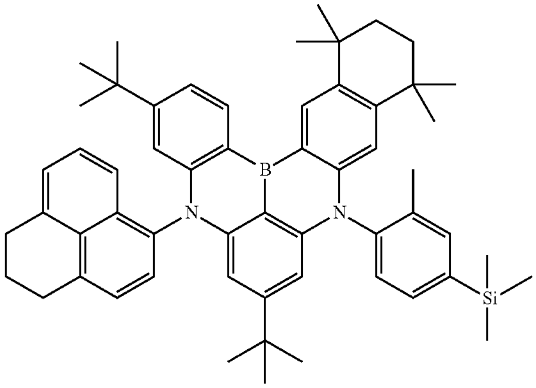
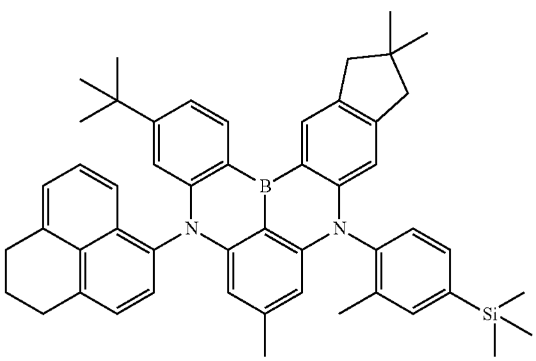
-continued
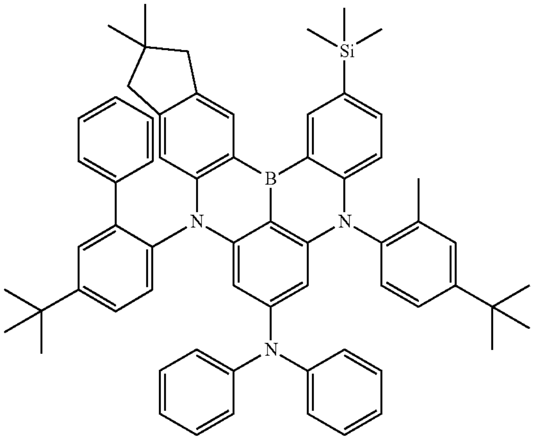
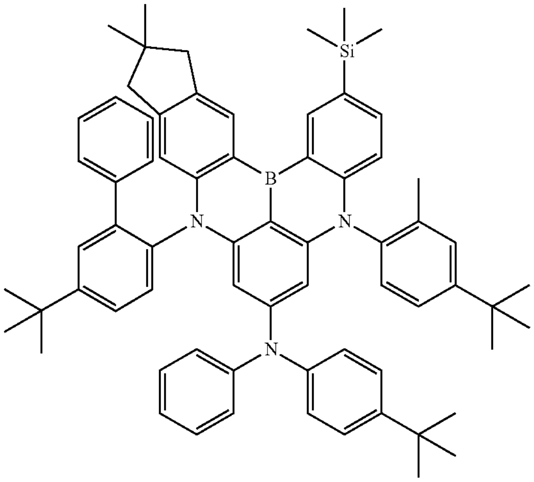
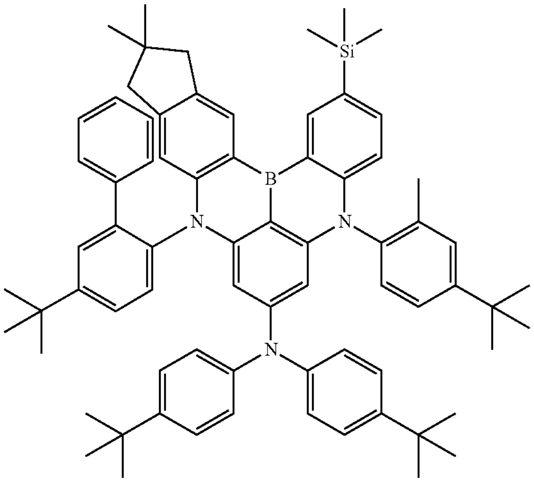

-continued
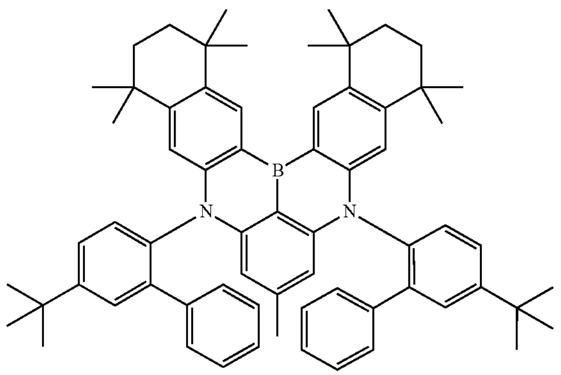
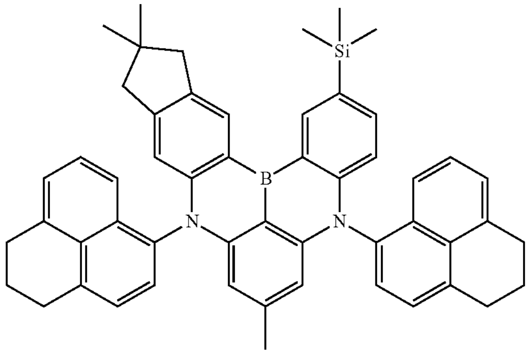
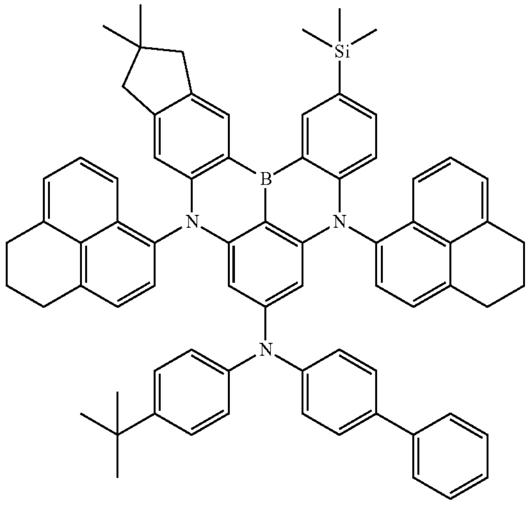
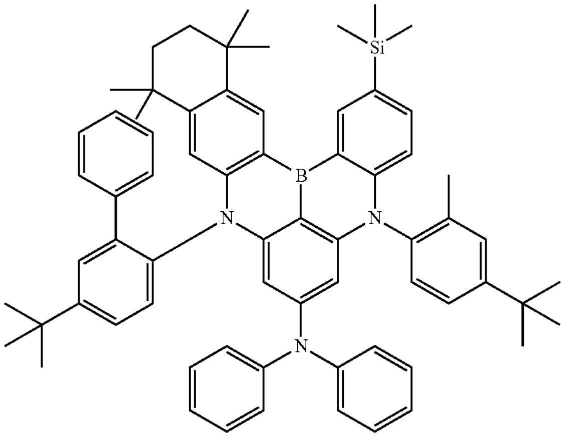
-continued
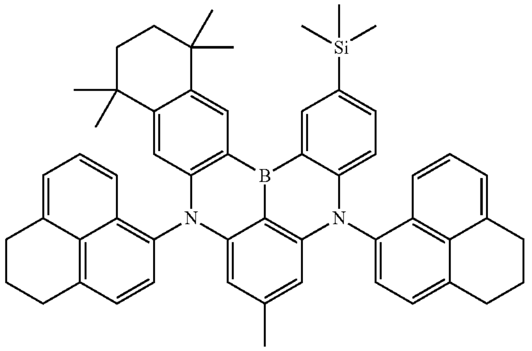
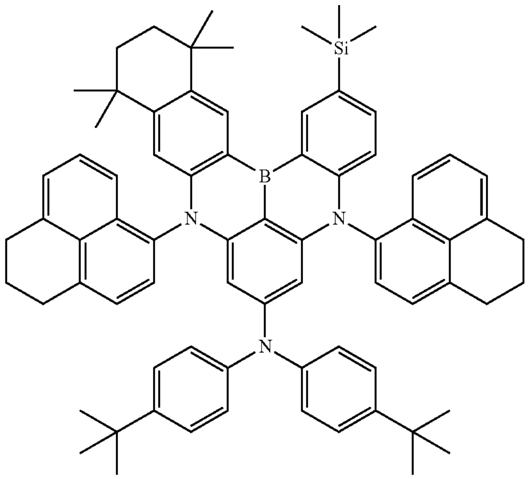
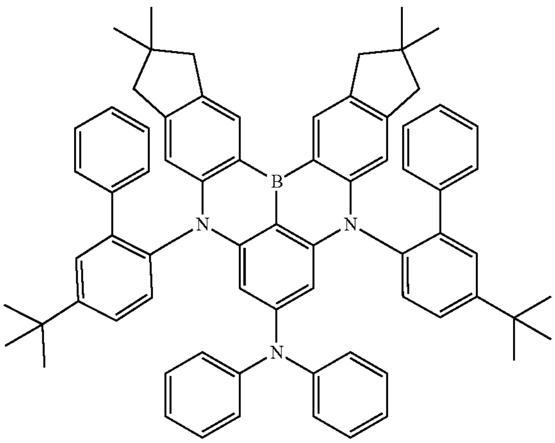

-continued
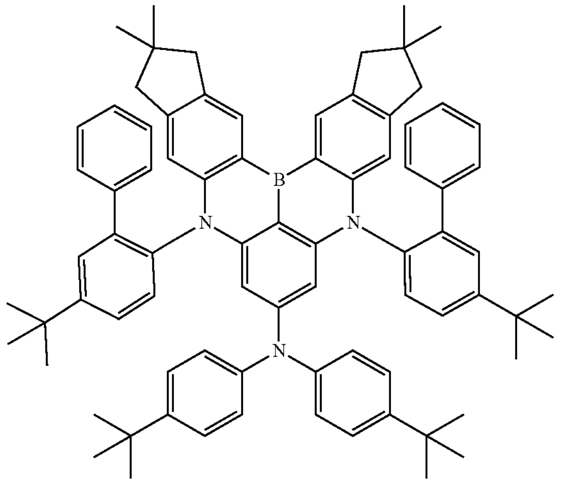
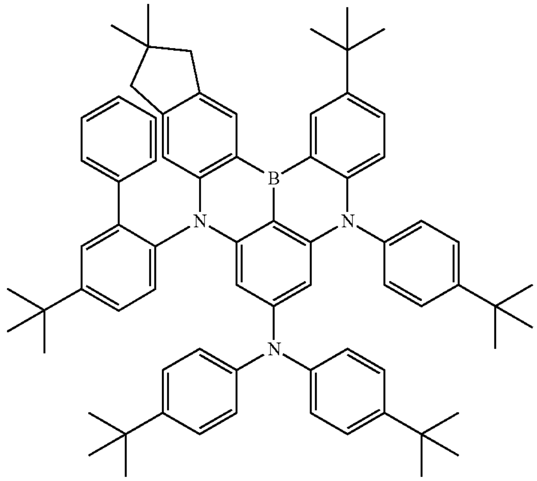
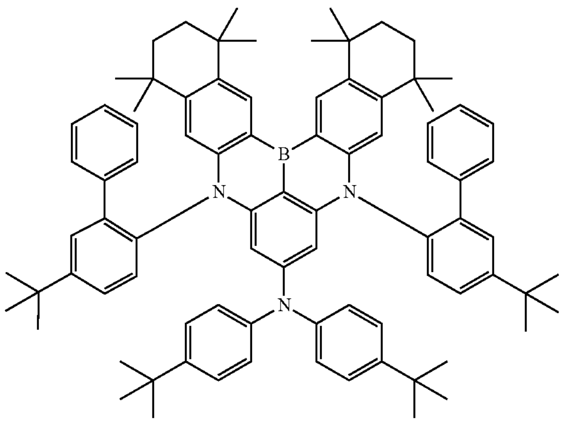
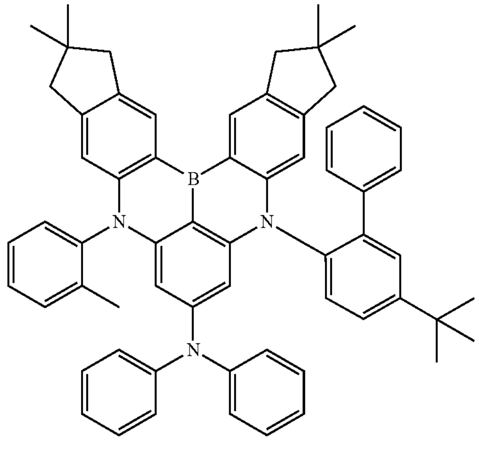
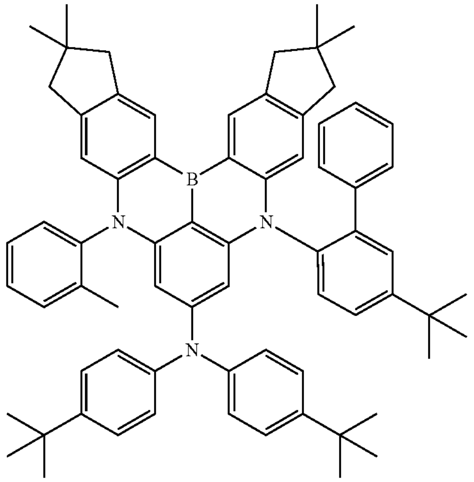 [SMILES: Cc1ccccc1N1c2cc3c(cc2B2c4cc5c(cc4N(Cc4ccc(C(C)(C)C)cc4-c4ccccc4)c4cc(N(c6ccc(C(C)(C)C)cc6)c6ccc(C(C)(C)C)cc6)cc1c42)CC(C)(C)C5)CC(C)(C)C3]
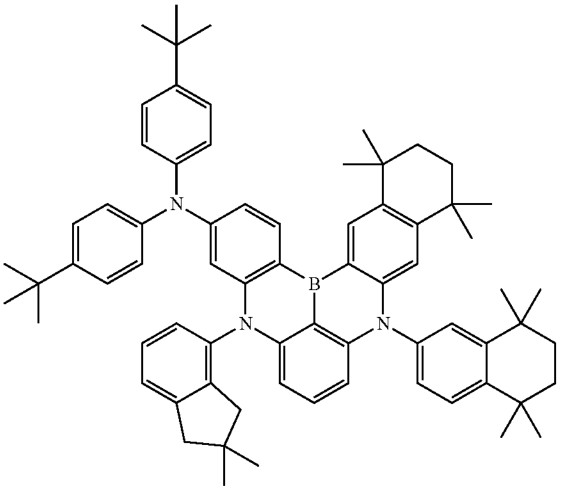
-continued -continued
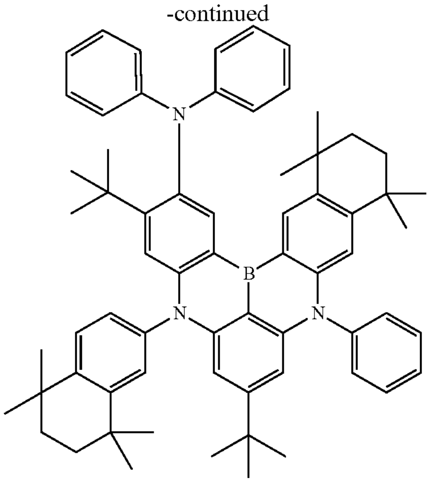
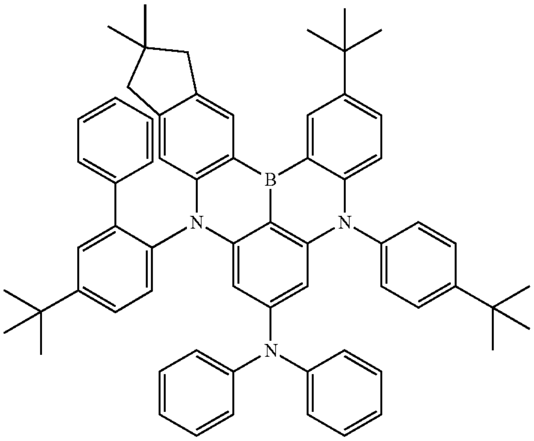
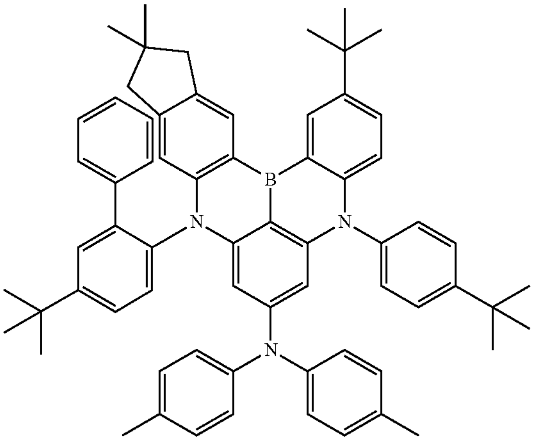
-continued
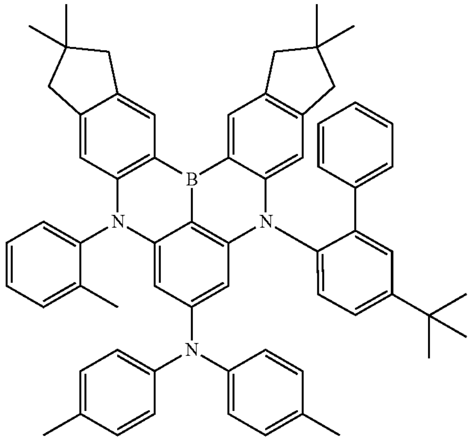
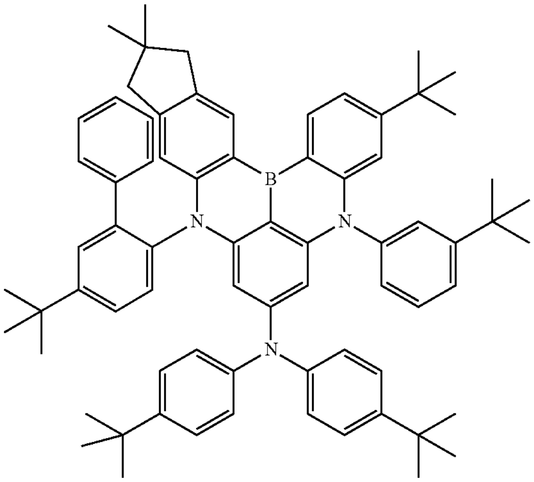
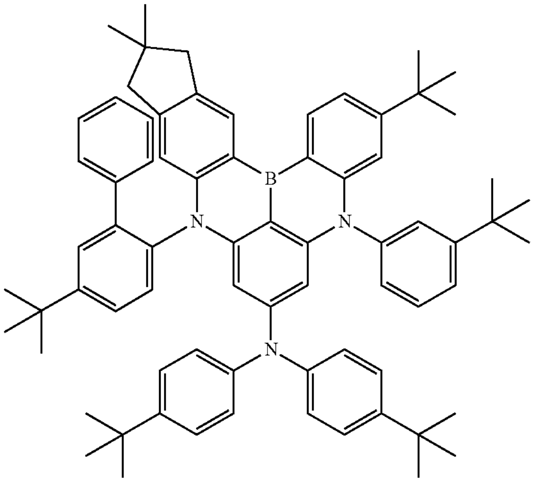

-continued
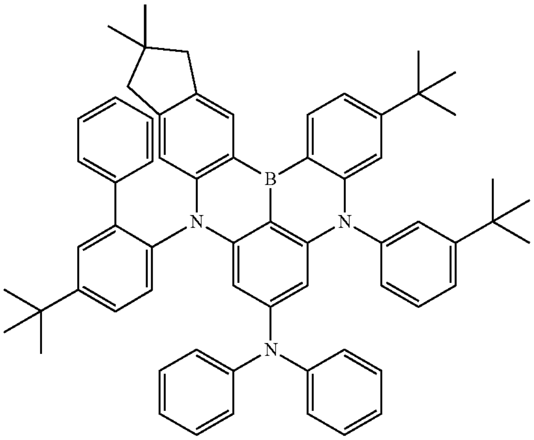
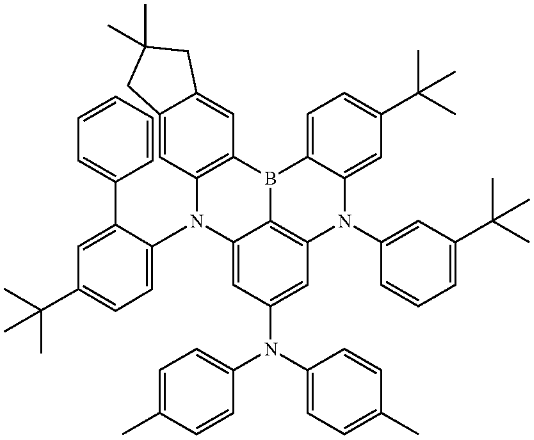
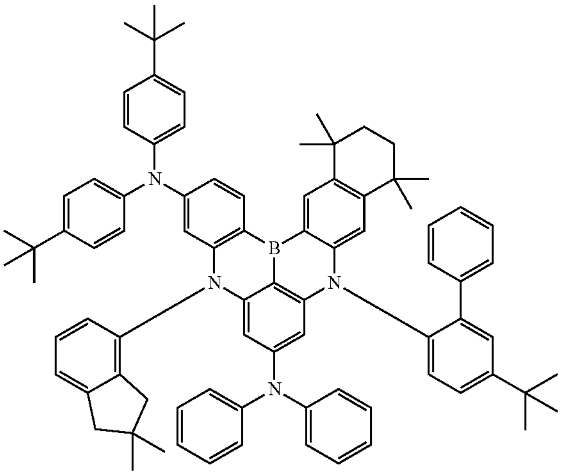
-continued
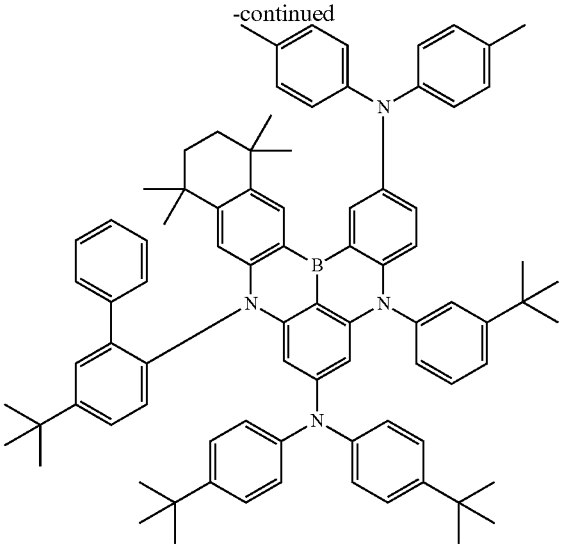
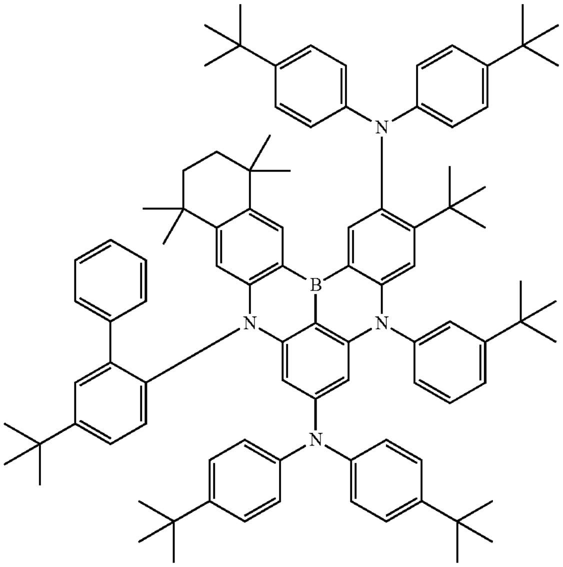
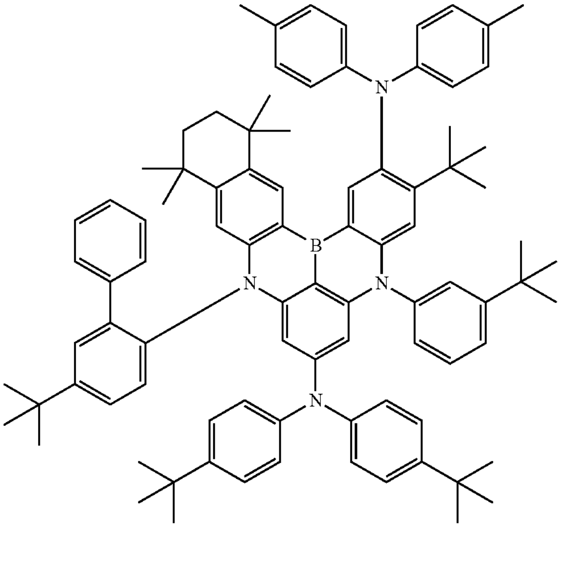 [SMILES: Cc1ccc(N(Cc2cc3c(cc2C(C)(C)C)N(c2cccc(C(C)(C)C)c2)c2cc(N(c4ccc(C(C)(C)C)cc4)c4ccc(C(C)(C)C)cc4)cc4c2B3c2cc3c(cc2N4CCc2ccc(C(C)(C)C)cc2-c2ccccc2)C(C)(C)CCC3(C)C)c2ccc(C)cc2)cc1]

-continued
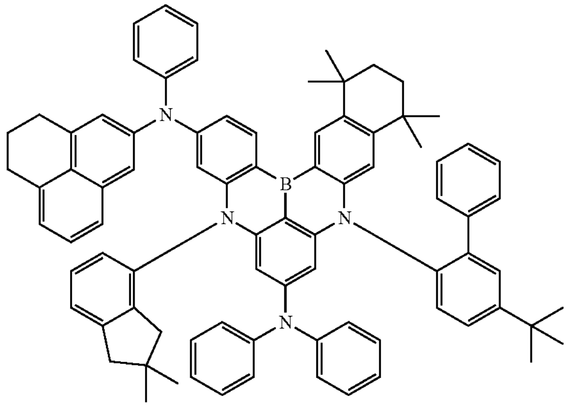
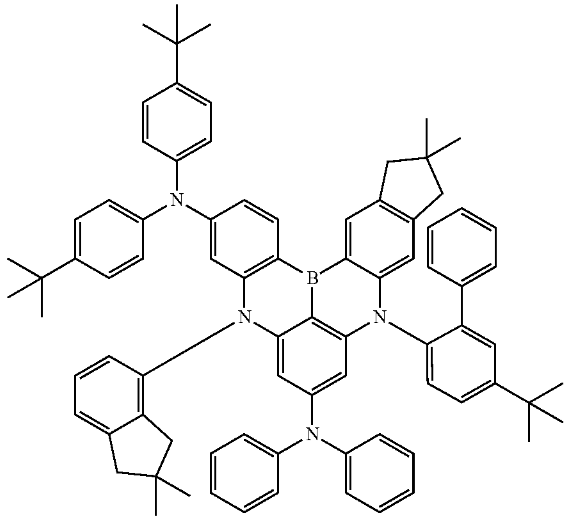
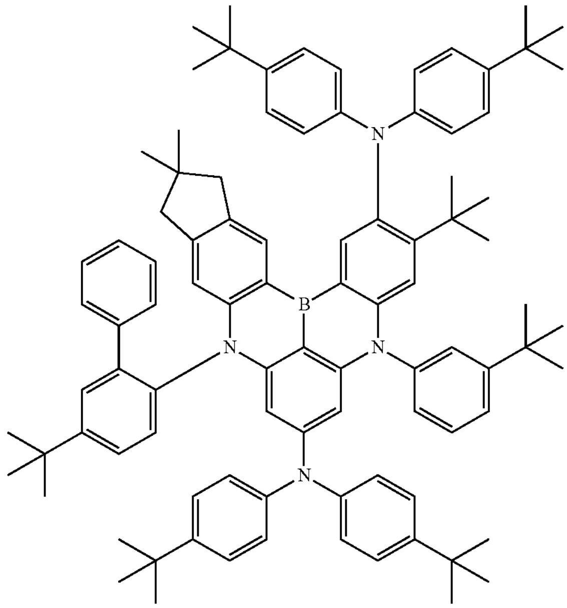
-continued
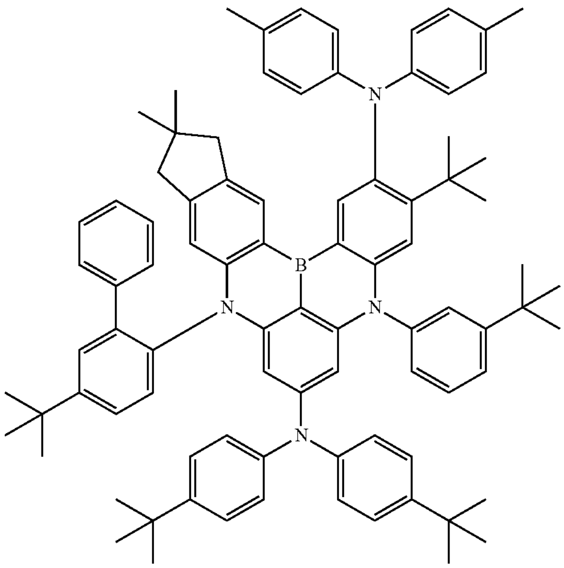 [SMILES: Cc1ccc(N(Cc2cc3c(cc2C(C)(C)C)N(c2cccc(C(C)(C)C)c2)c2cc(N(c4ccc(C(C)(C)C)cc4)c4ccc(C(C)(C)C)cc4)cc4c2B3c2cc3c(cc2N4Cc2ccc(C(C)(C)C)cc2-c2ccccc2)CC(C)(C)C3)c2ccc(C)cc2)cc1]
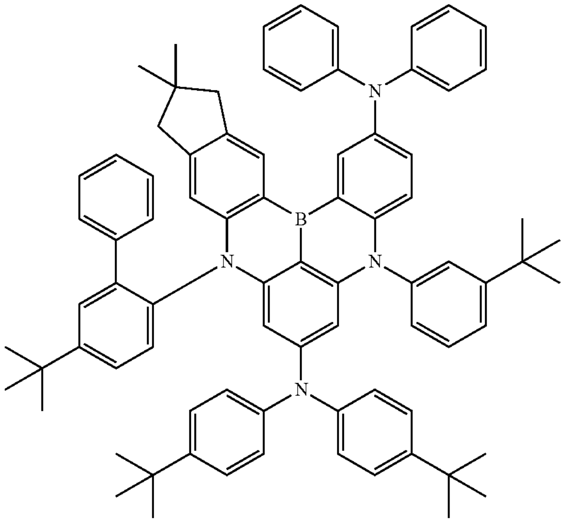
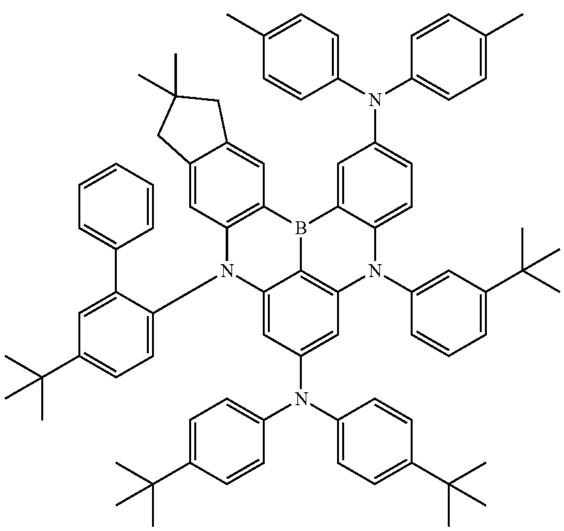

-continued
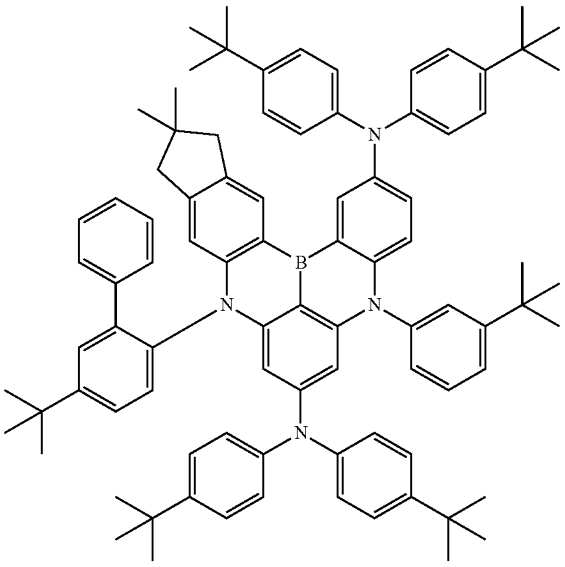
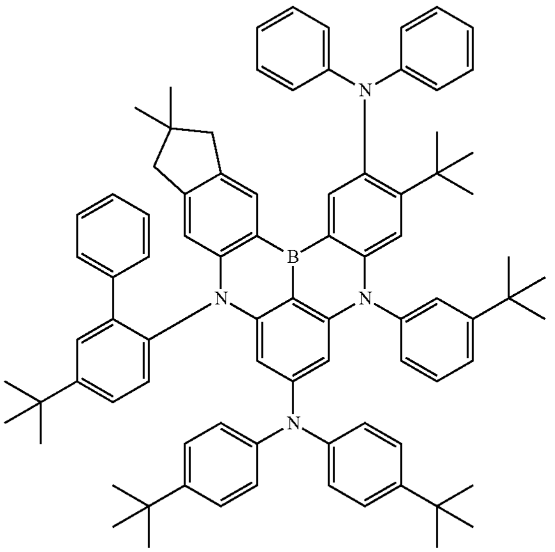
.
In an exemplary embodiment of the present specification, Formula 100 can be any one of the following compounds:
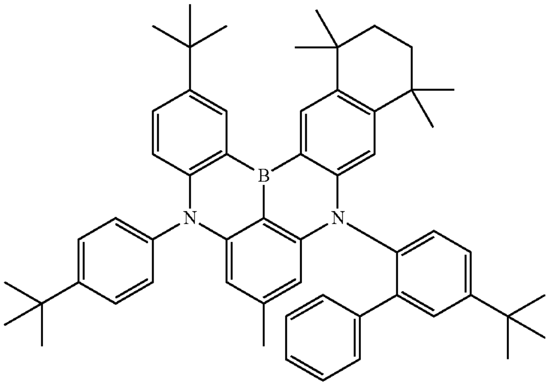
-continued
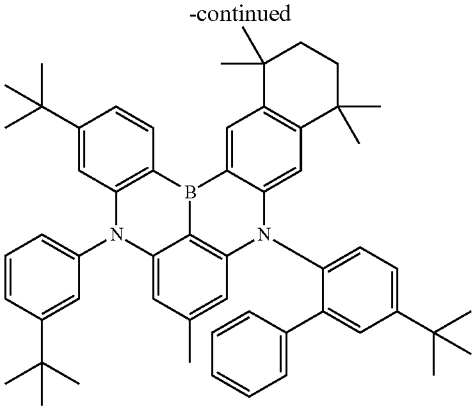
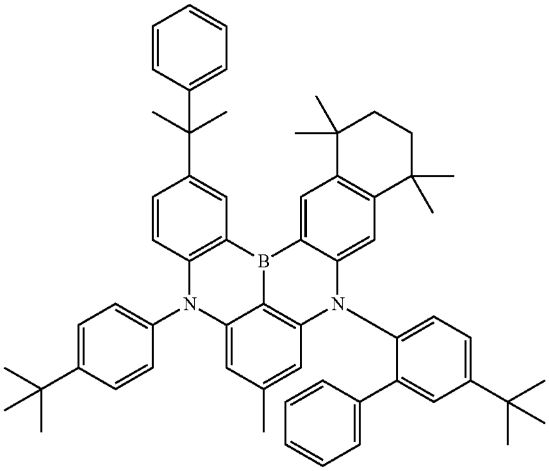
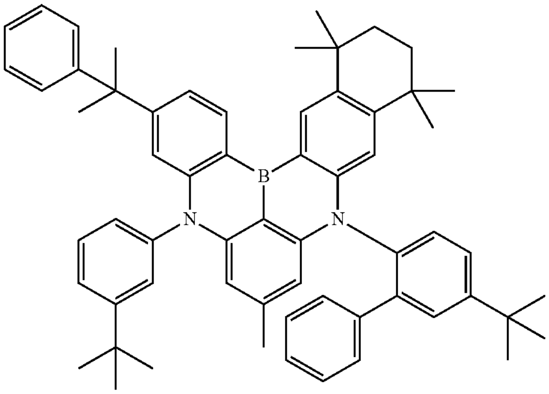
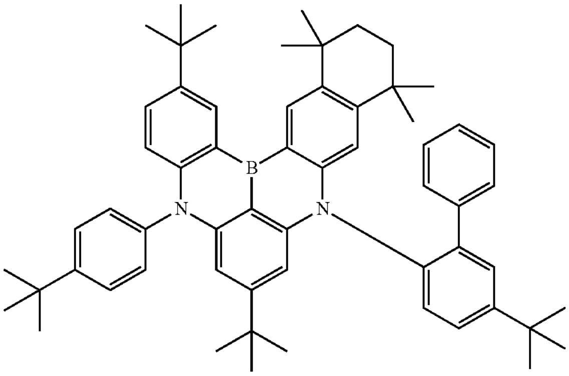

-continued
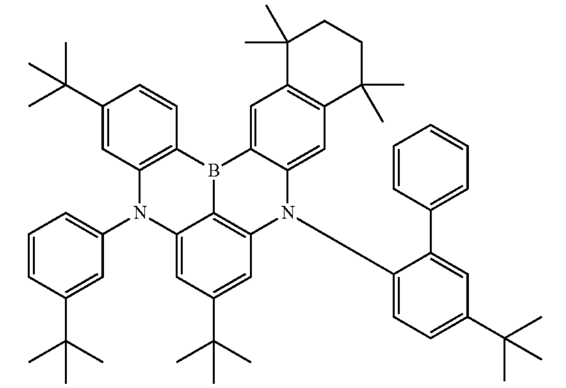
-continued
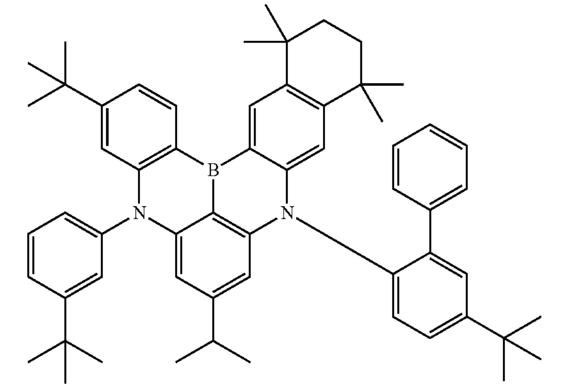
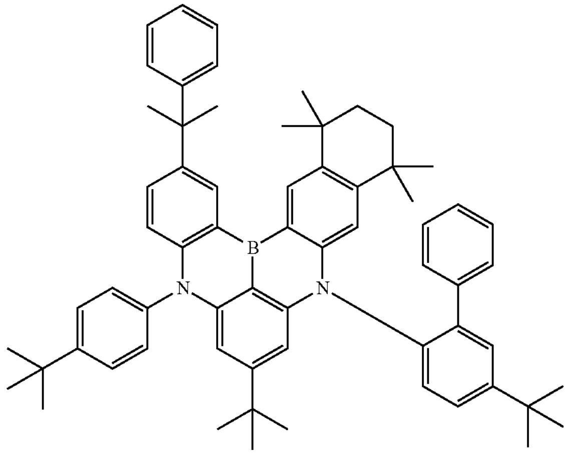
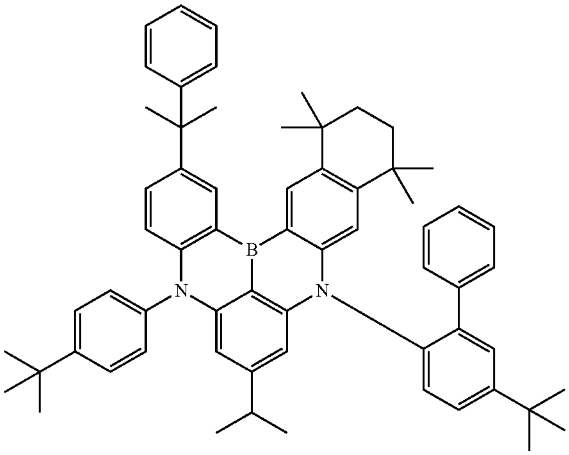
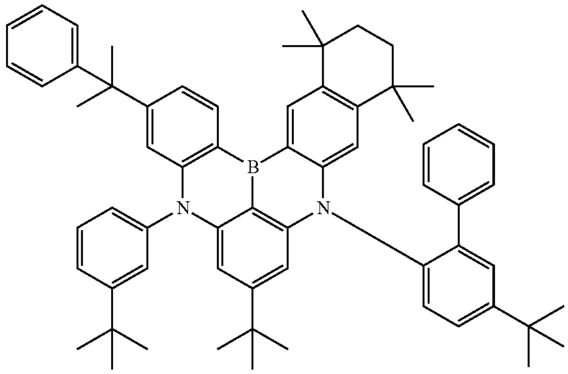
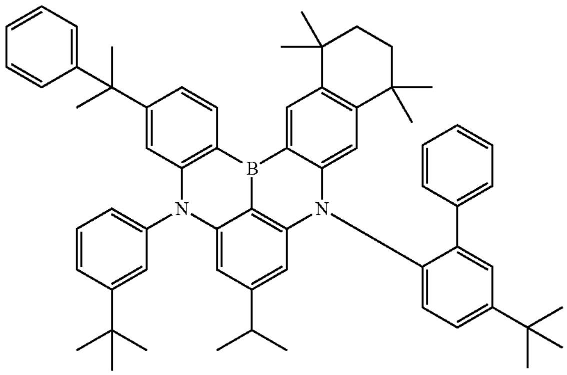
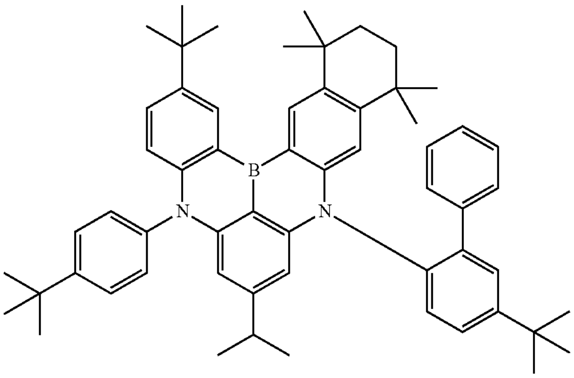
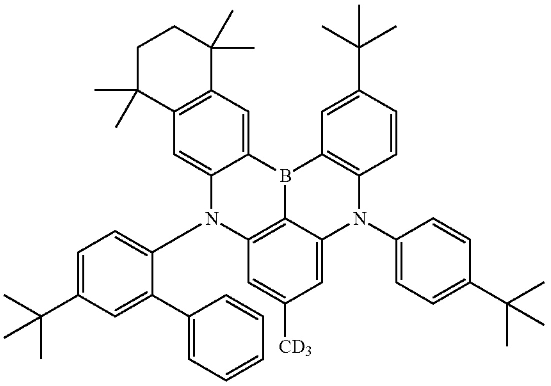

-continued
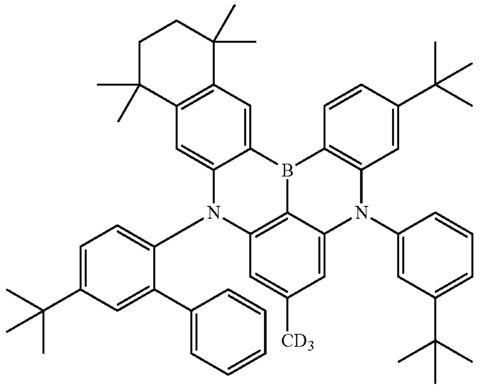
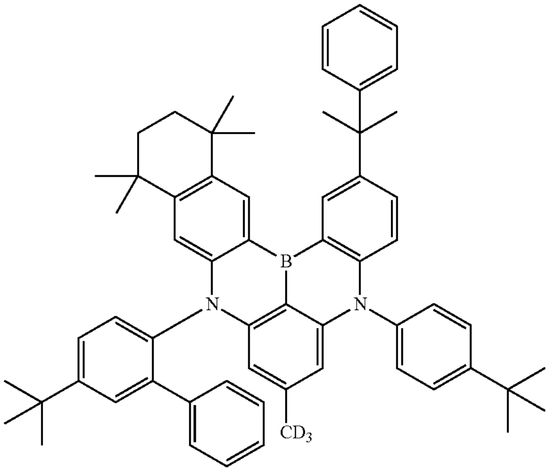
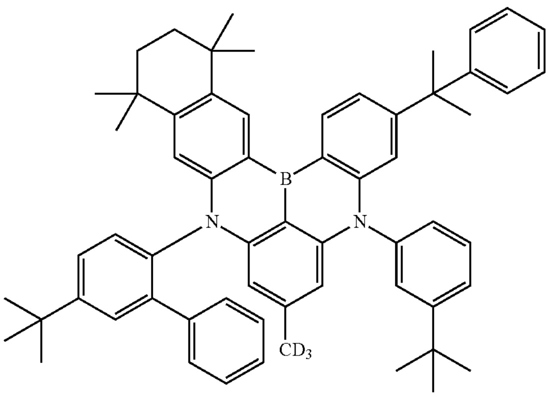
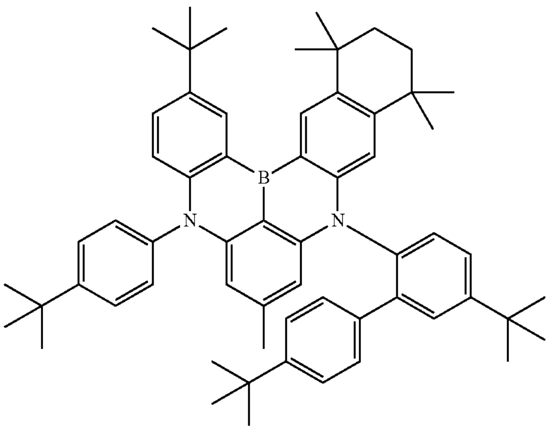
-continued
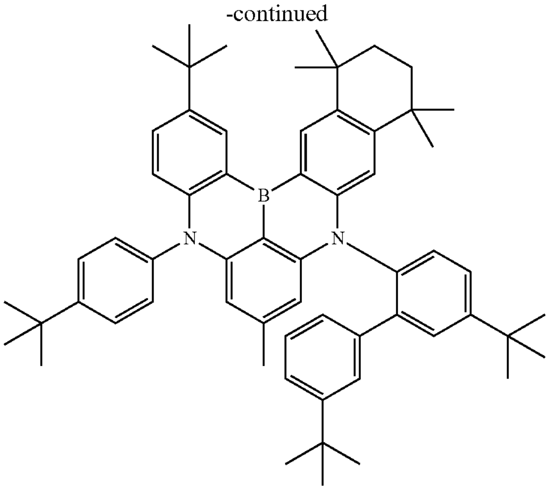
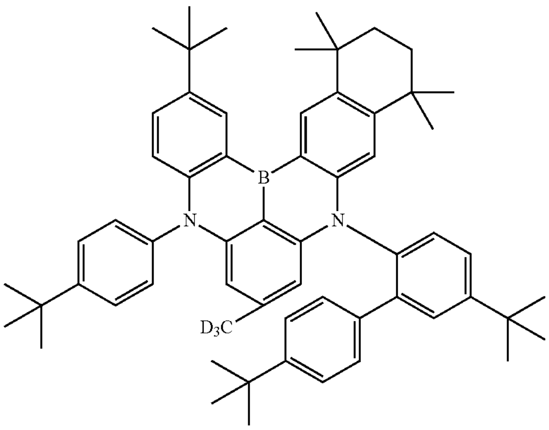
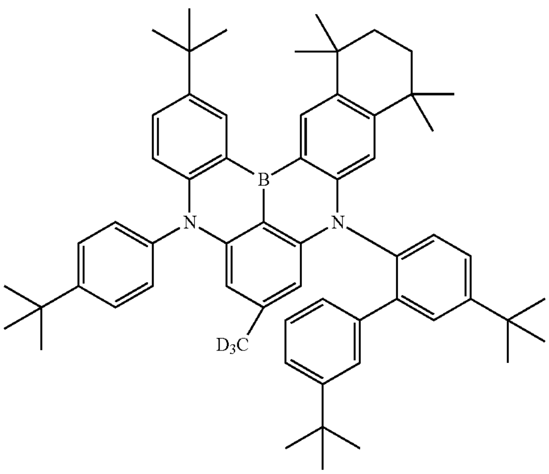

-continued
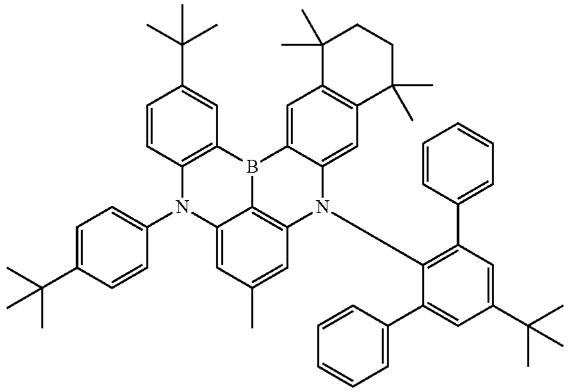
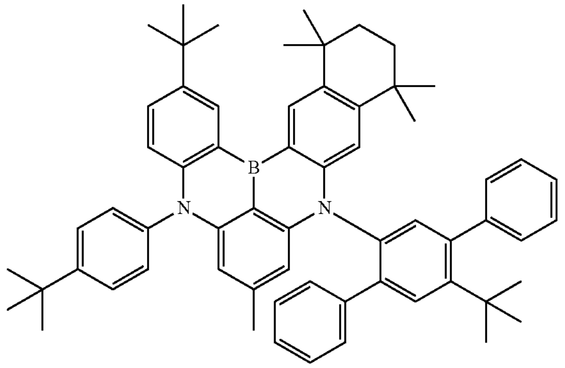
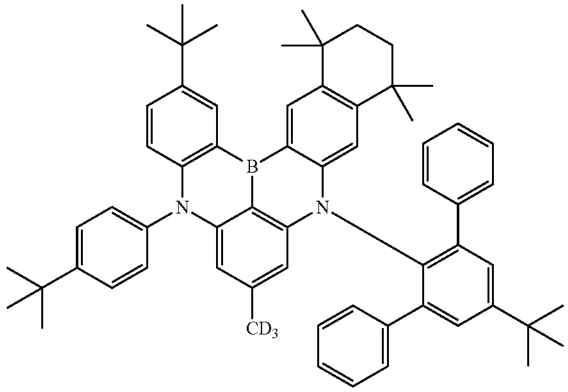
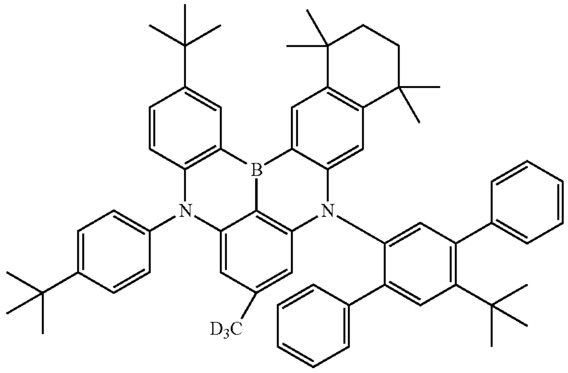
-continued
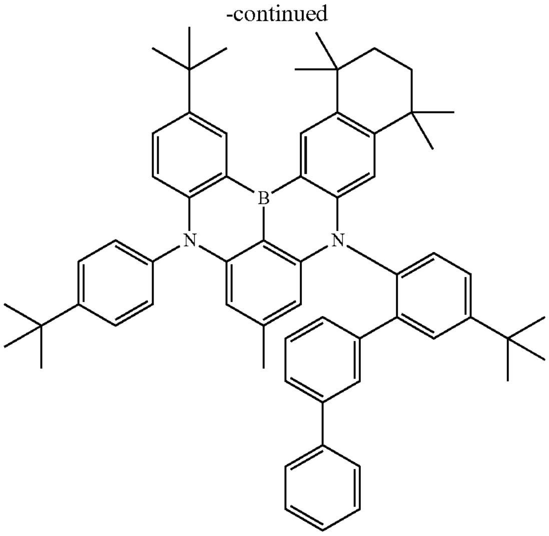
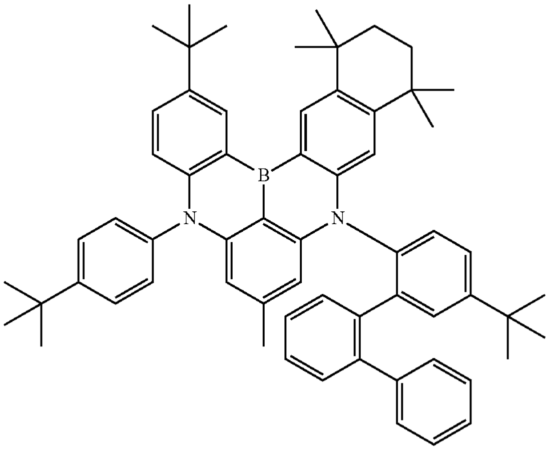
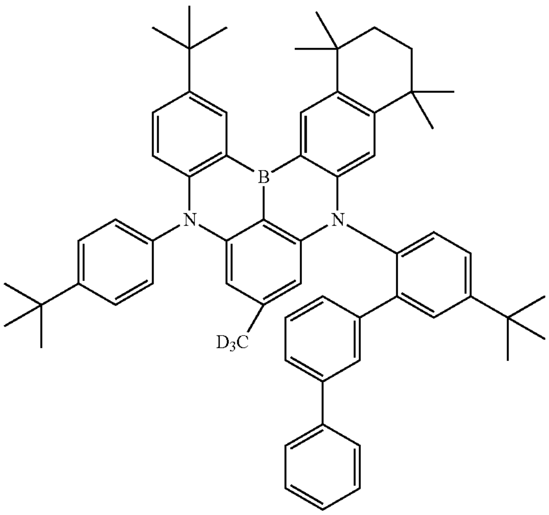

-continued
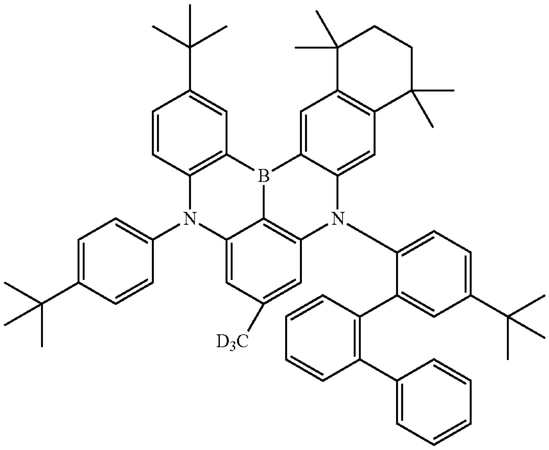
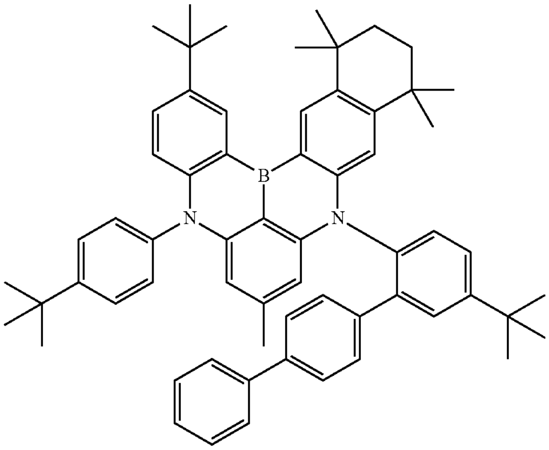
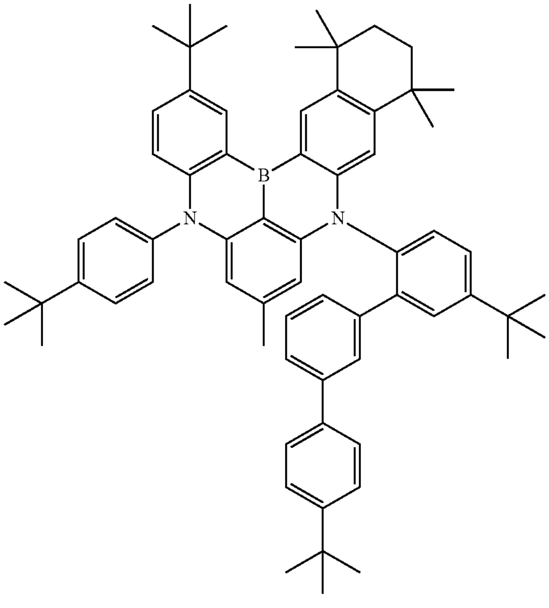
-continued
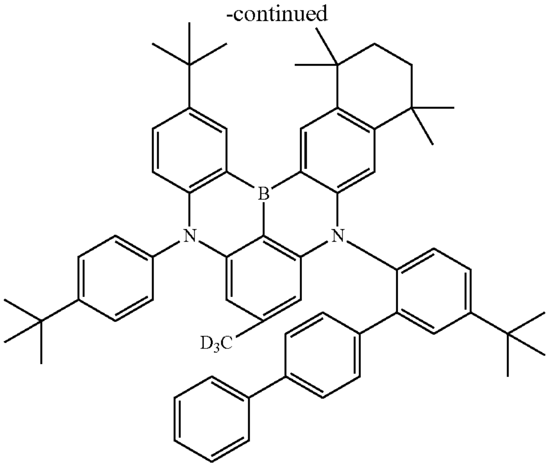
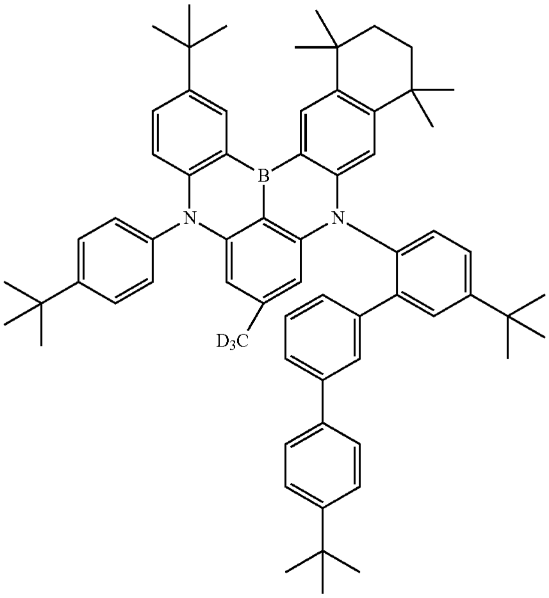
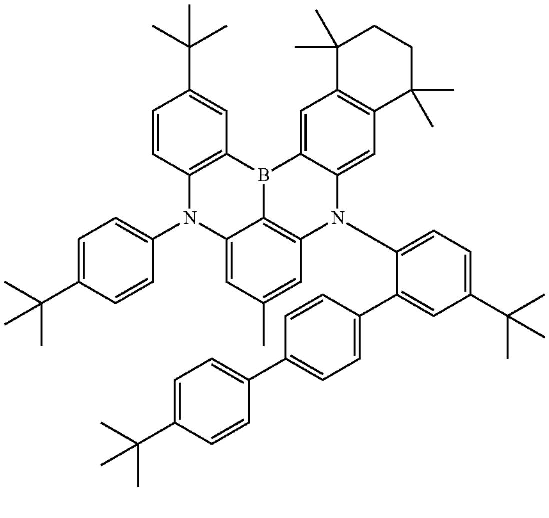

-continued
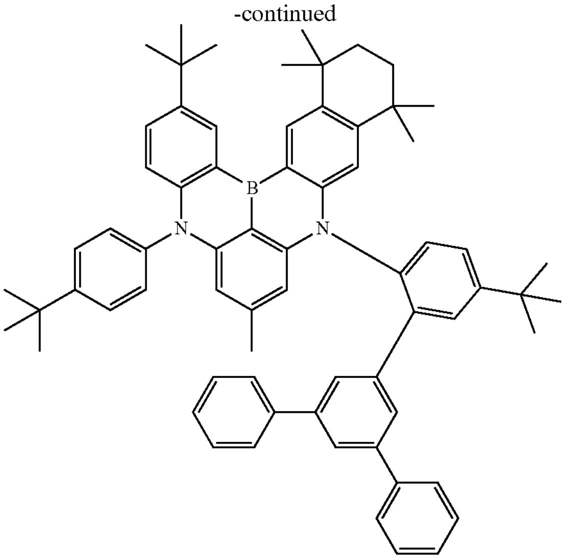
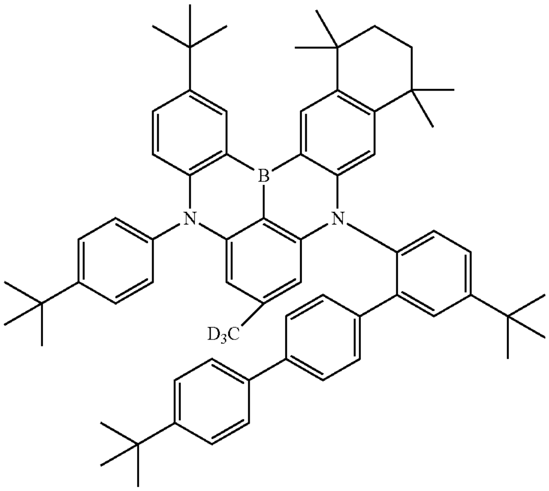
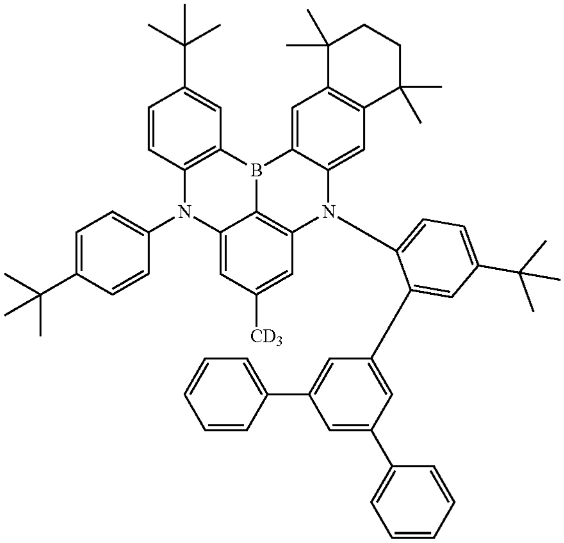
-continued
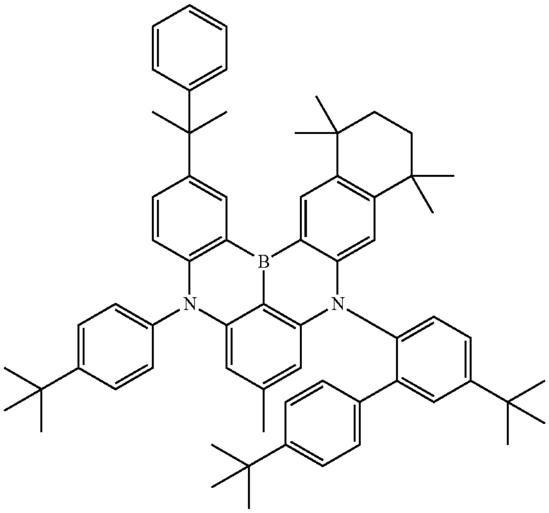
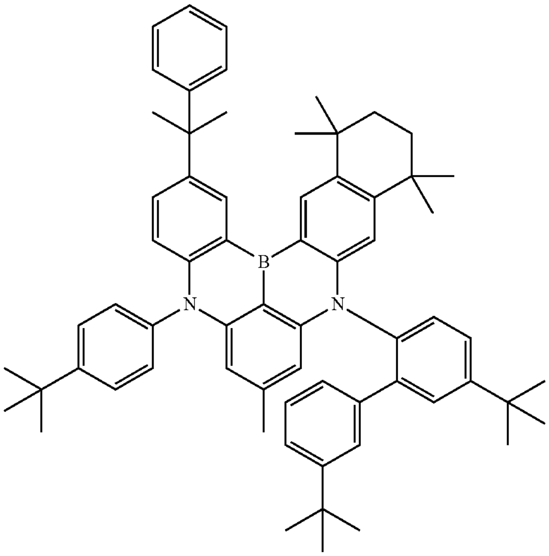
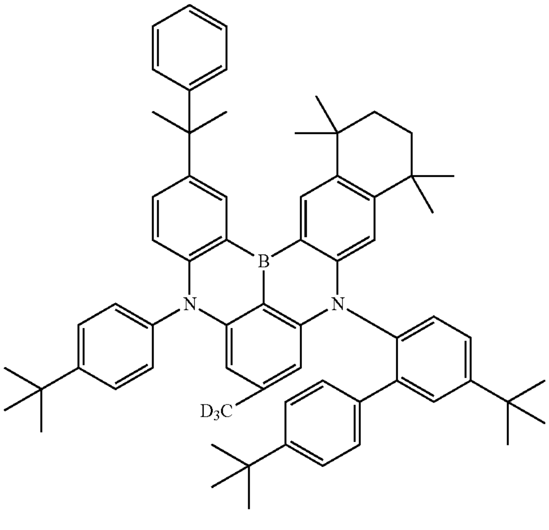

-continued
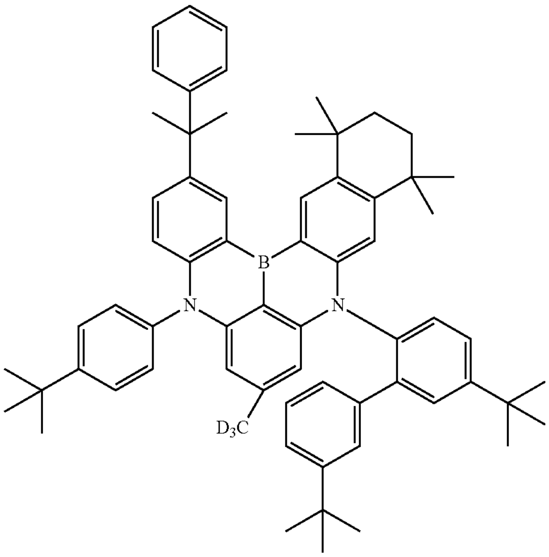
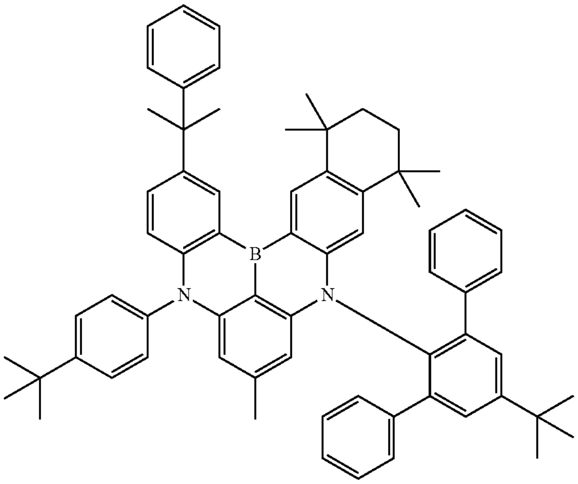
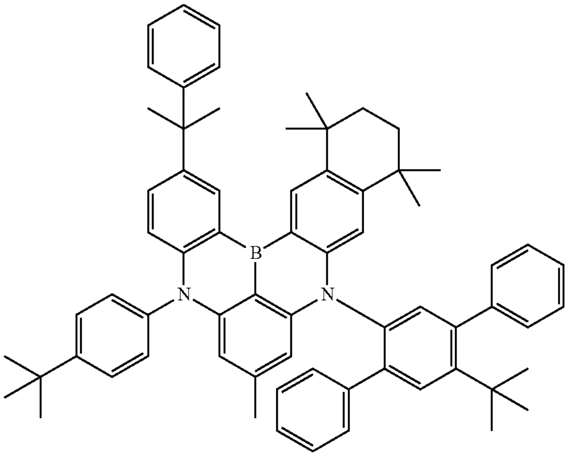
-continued
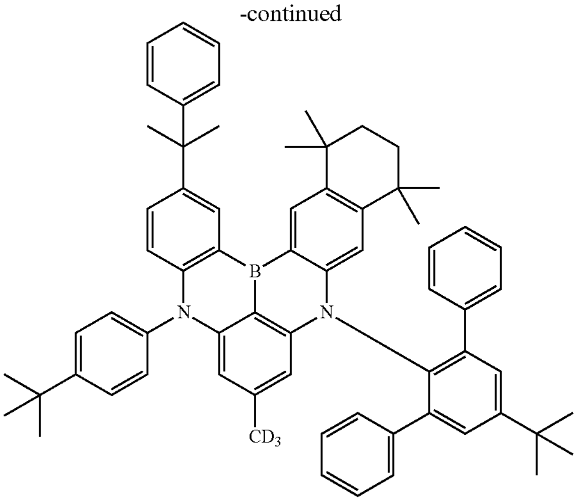
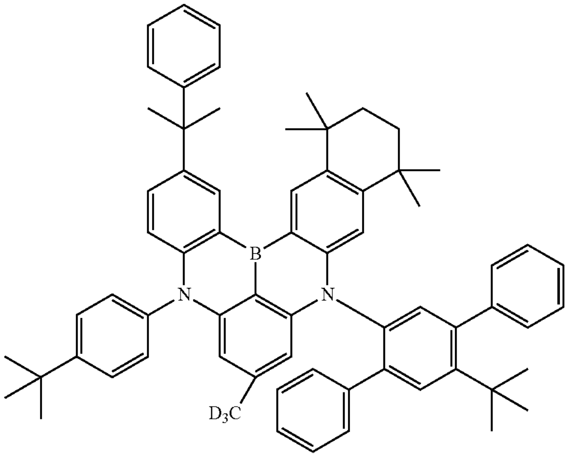
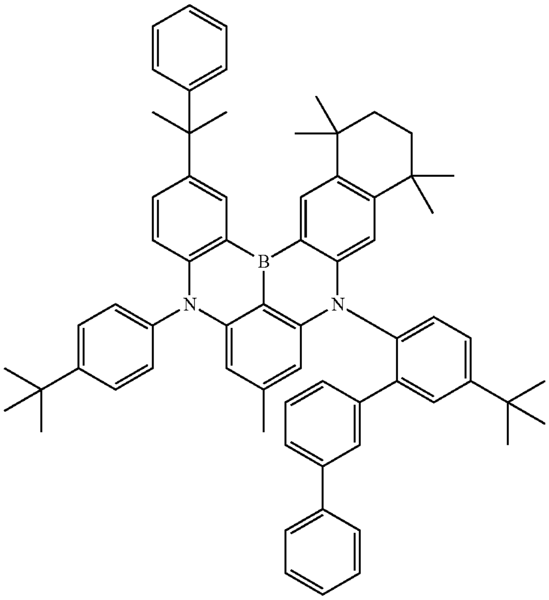

-continued
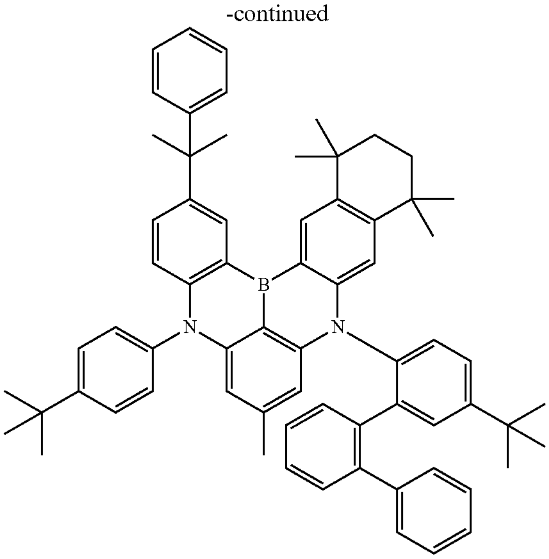
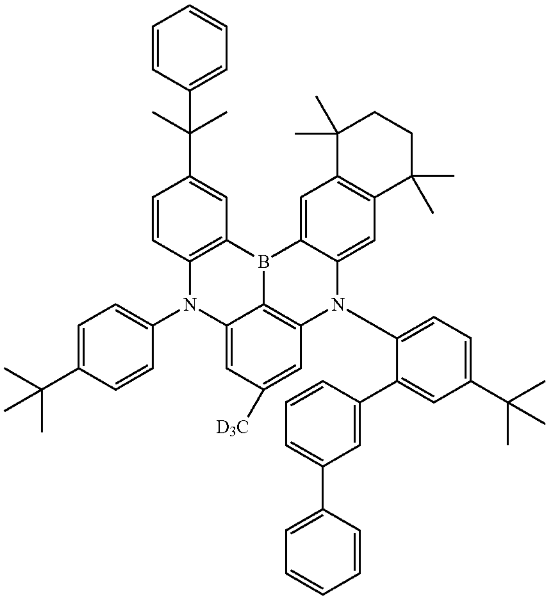
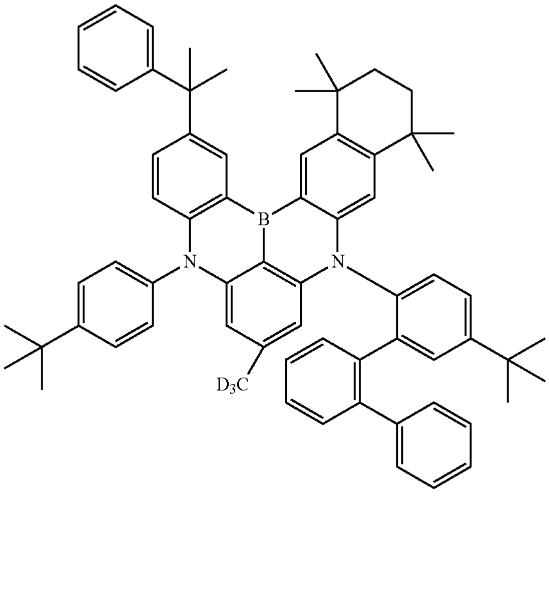
-continued
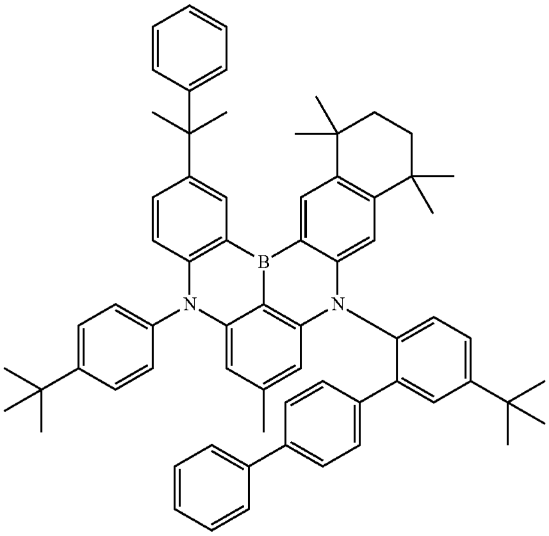
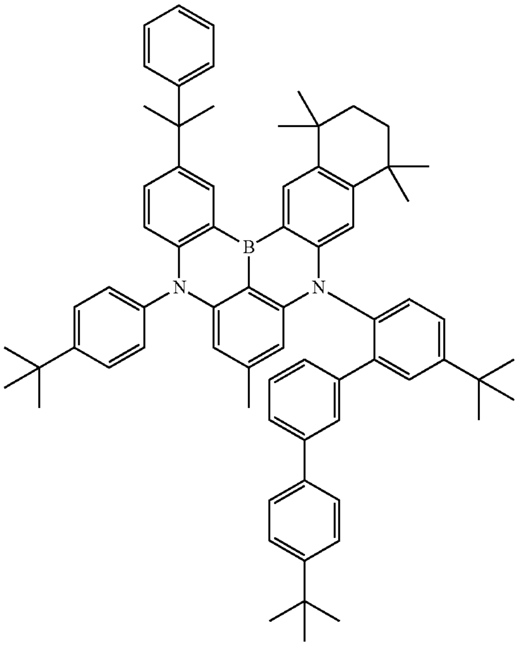
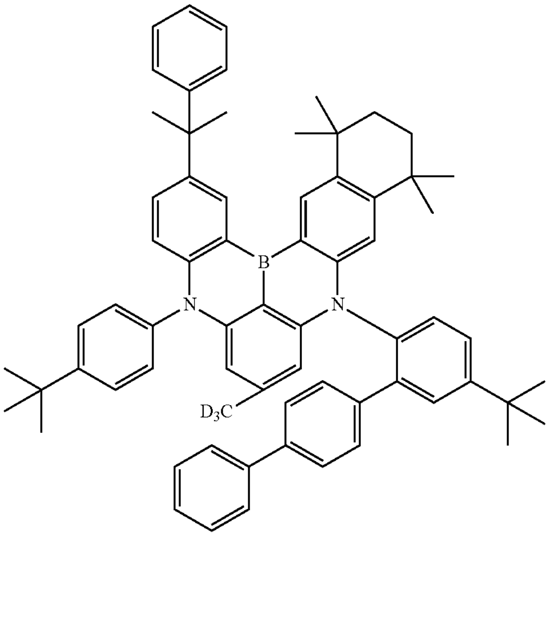

-continued
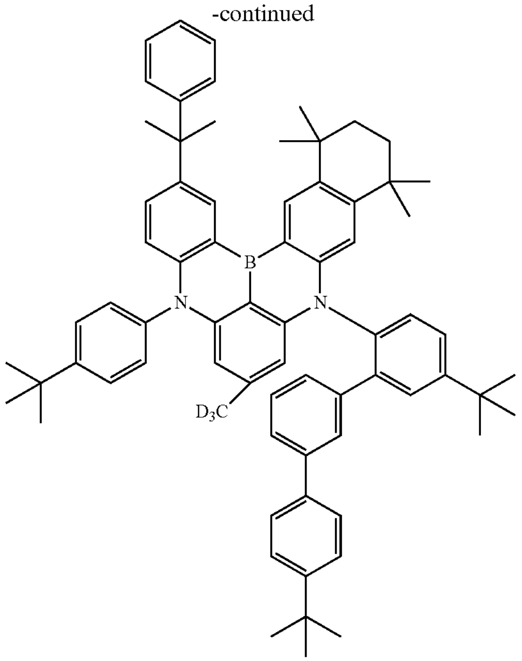
-continued
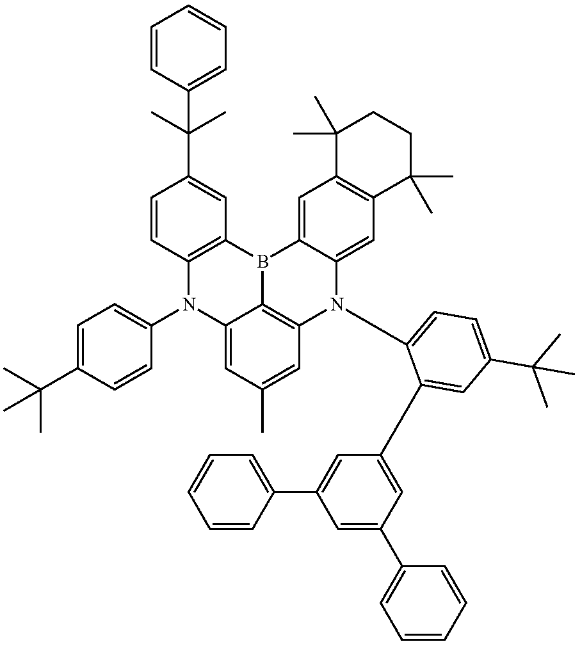
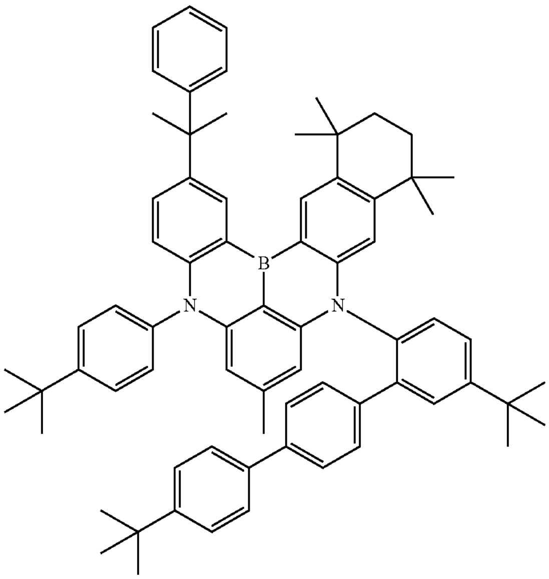
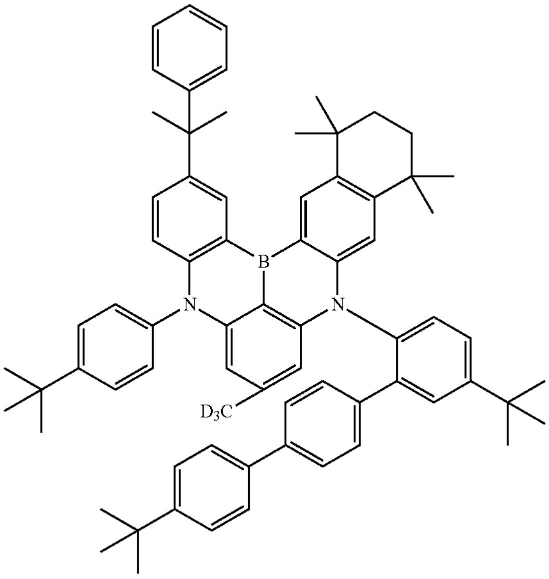

-continued
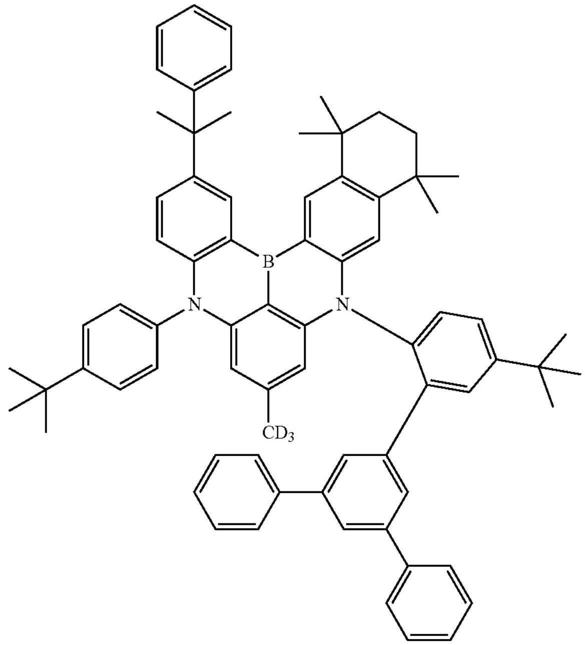
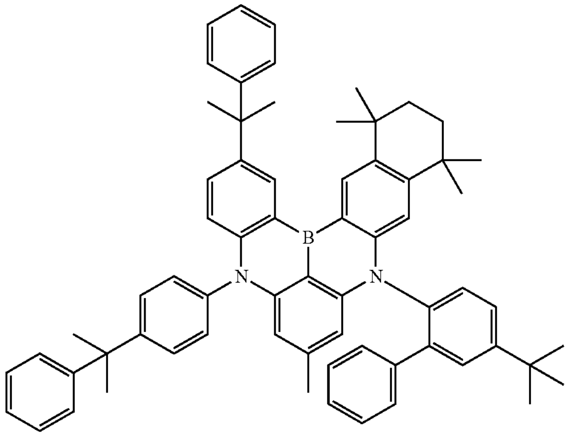
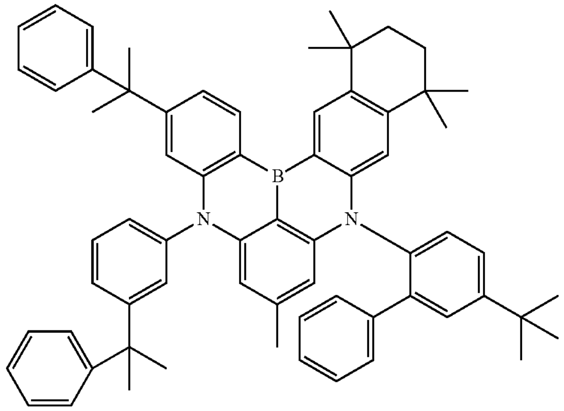
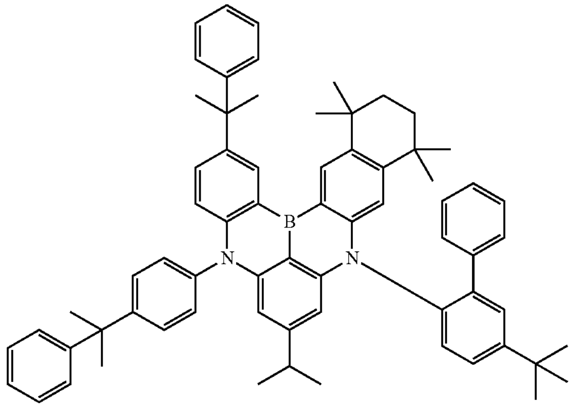
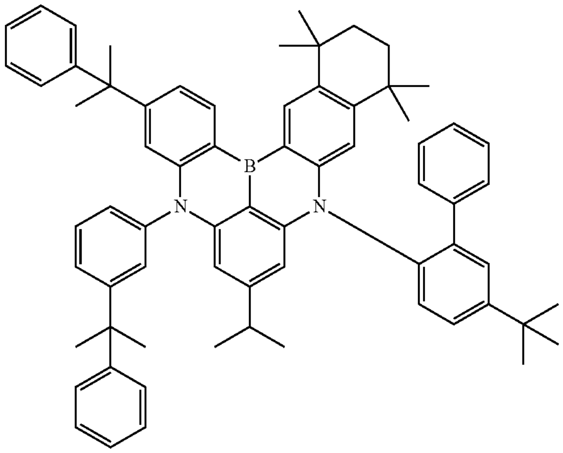
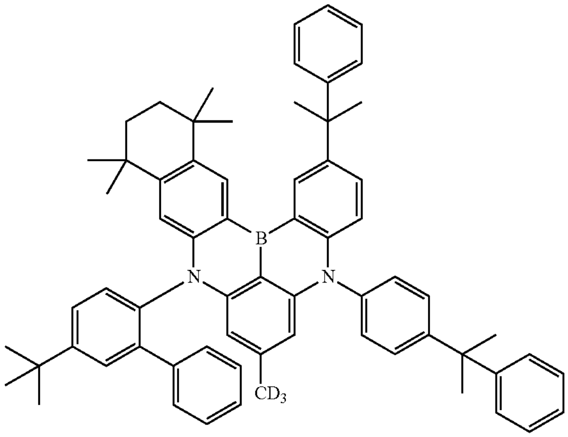
-continued -continued
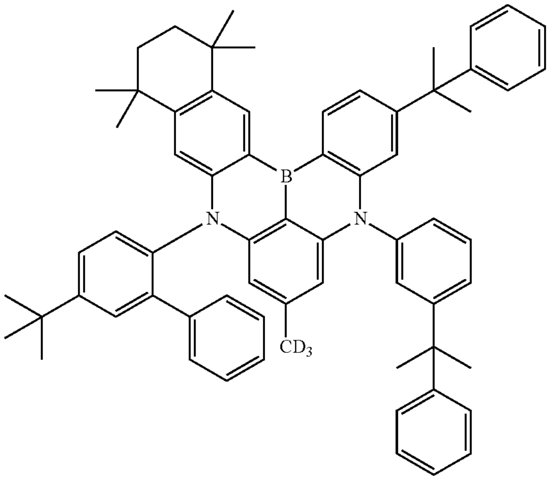
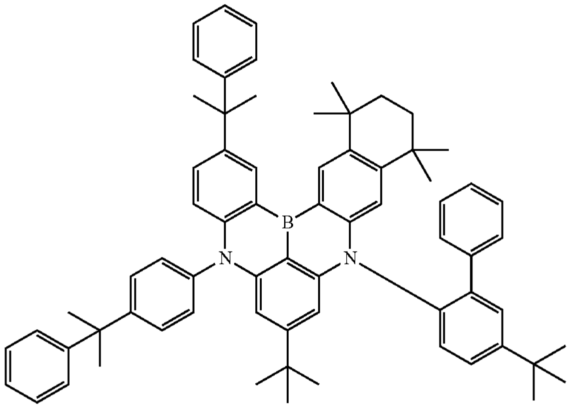
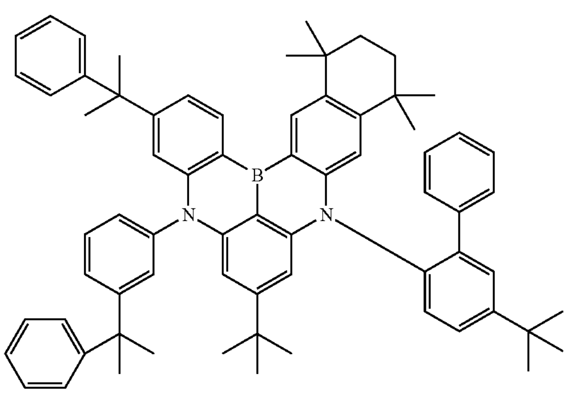
-continued
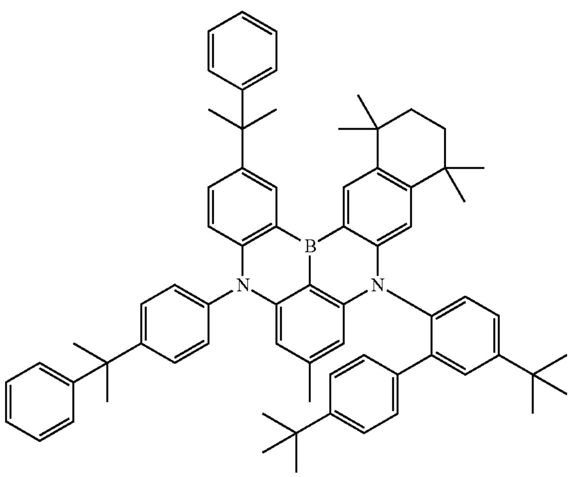
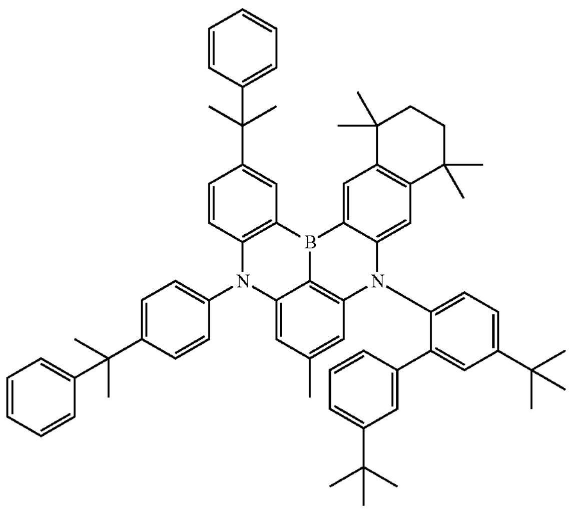
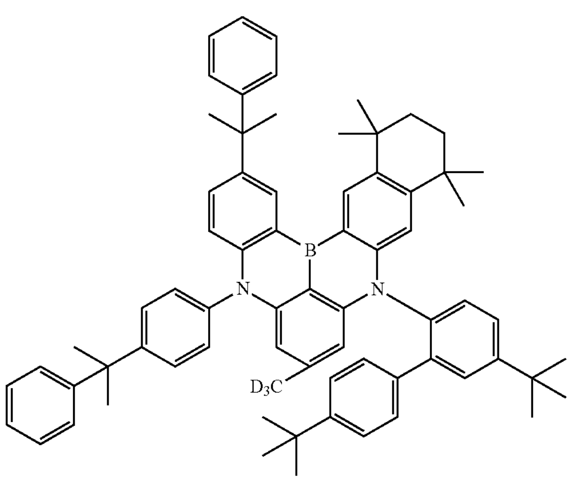

-continued
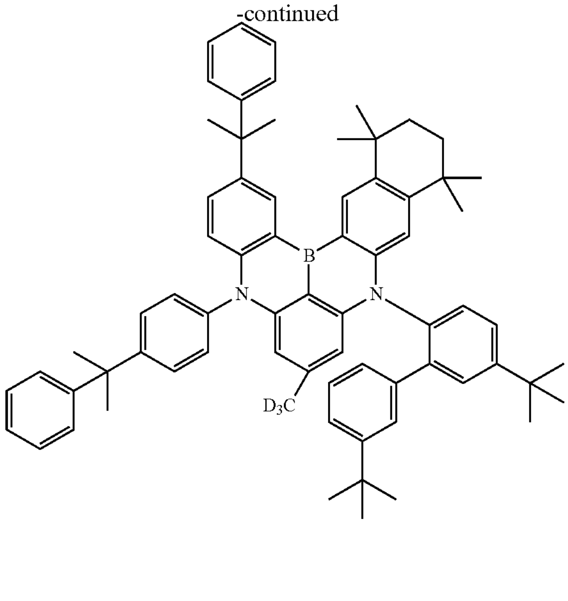
-continued
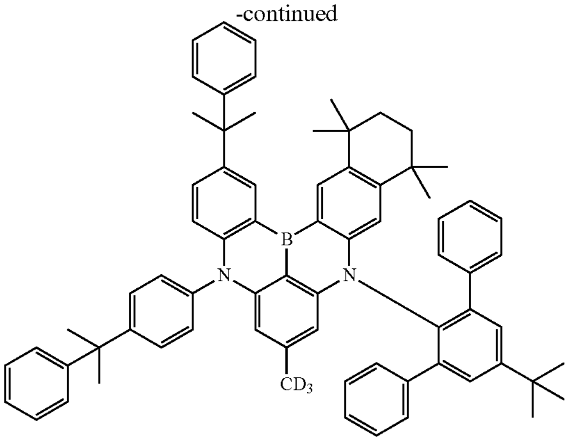
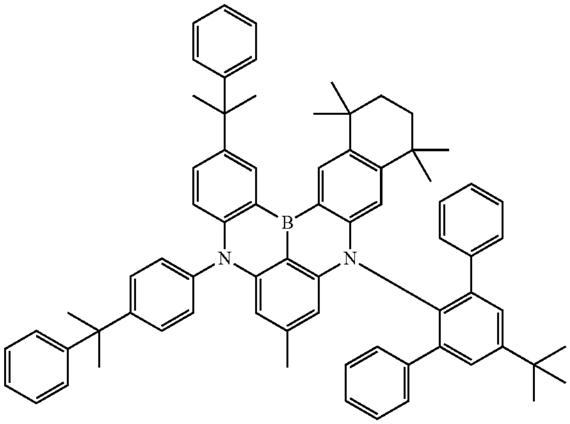
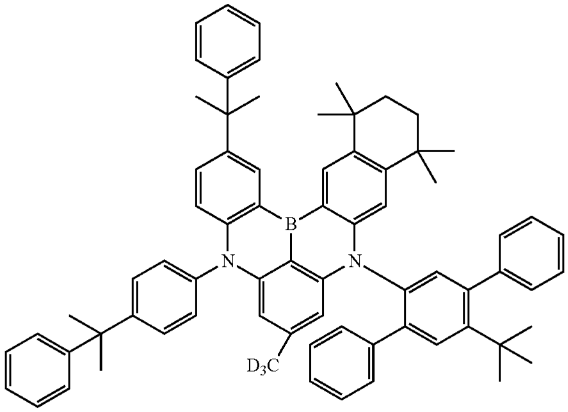
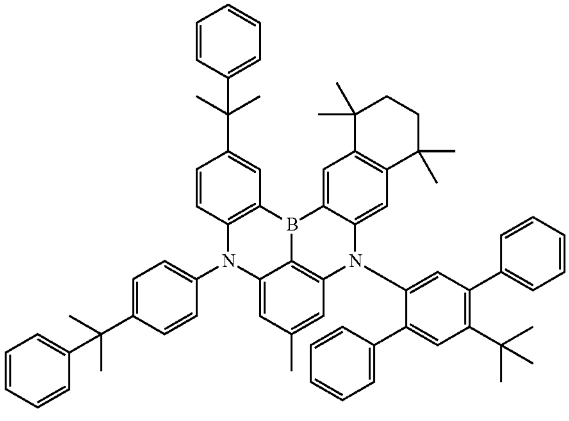
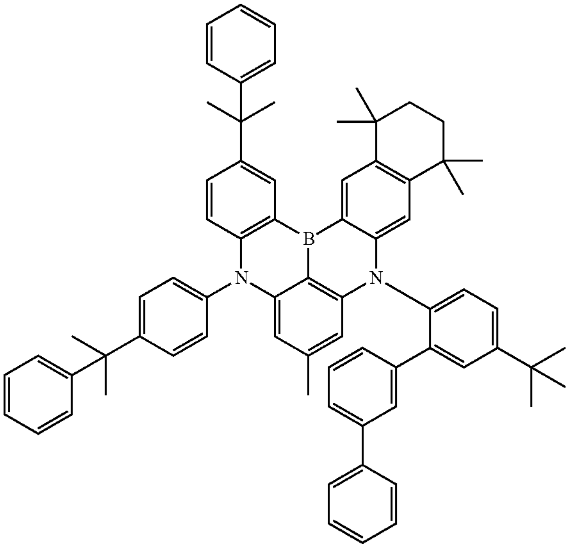

-continued
-continued
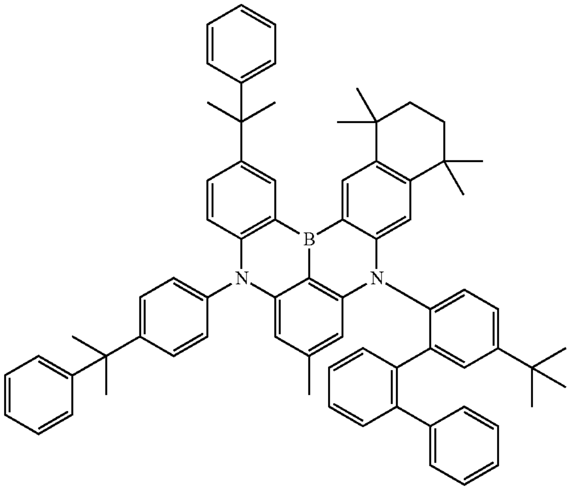
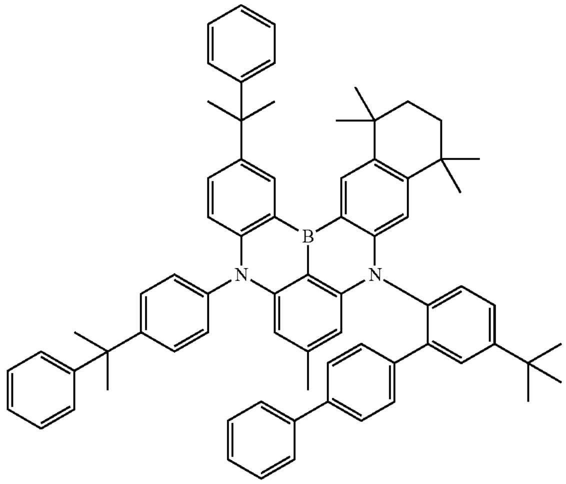
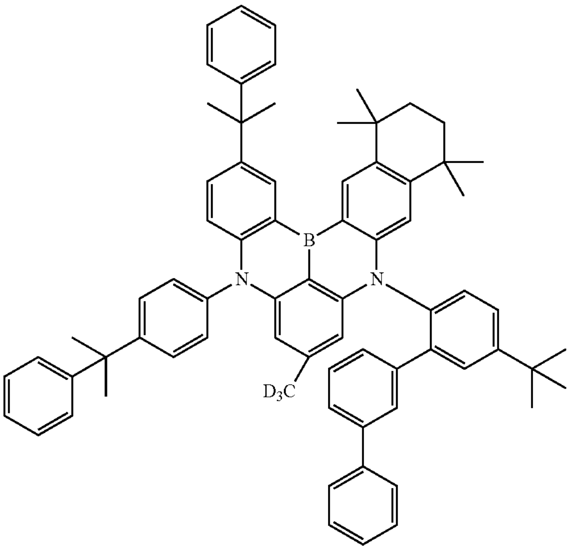
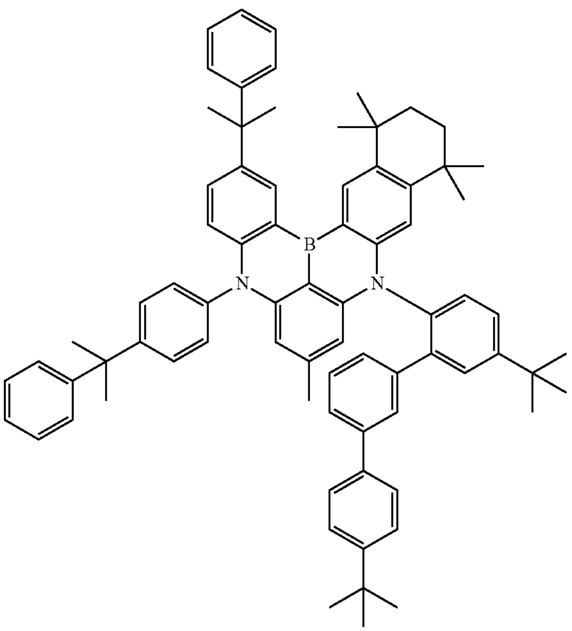
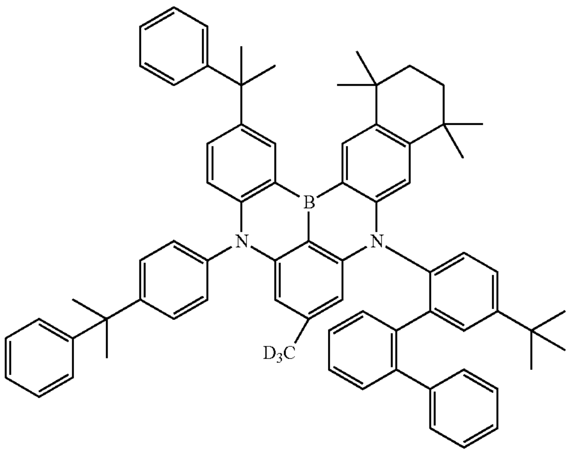
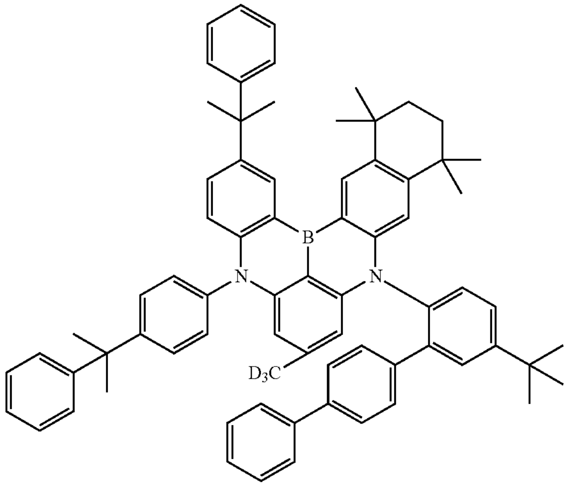

-continued
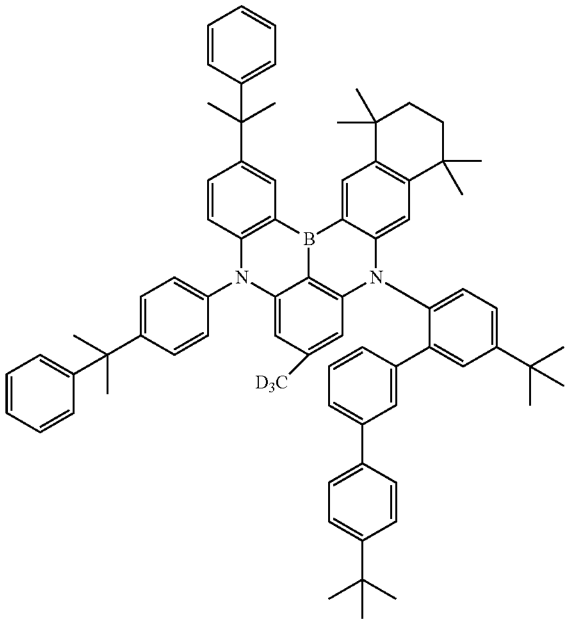
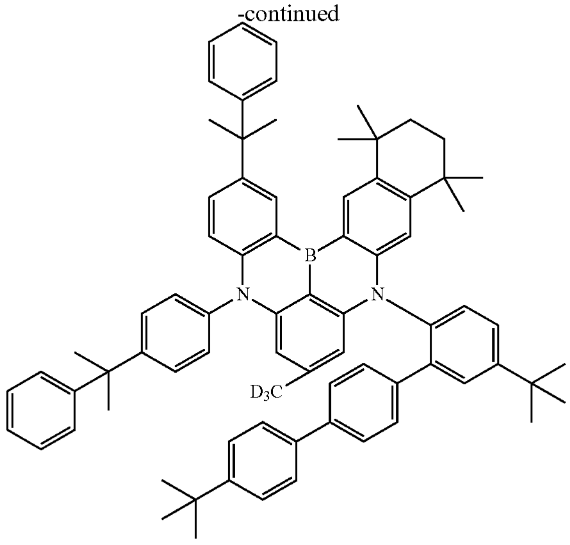
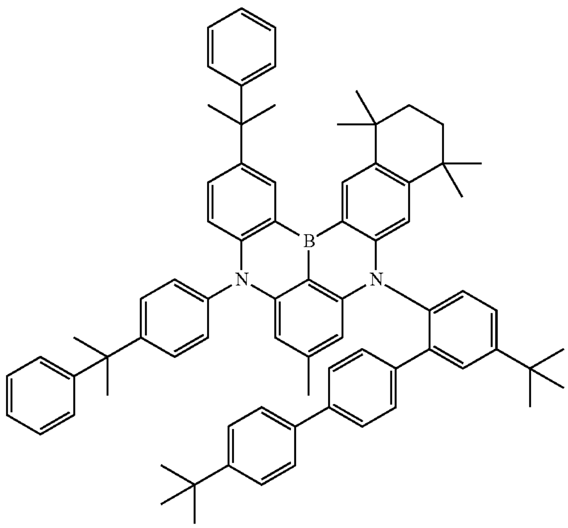
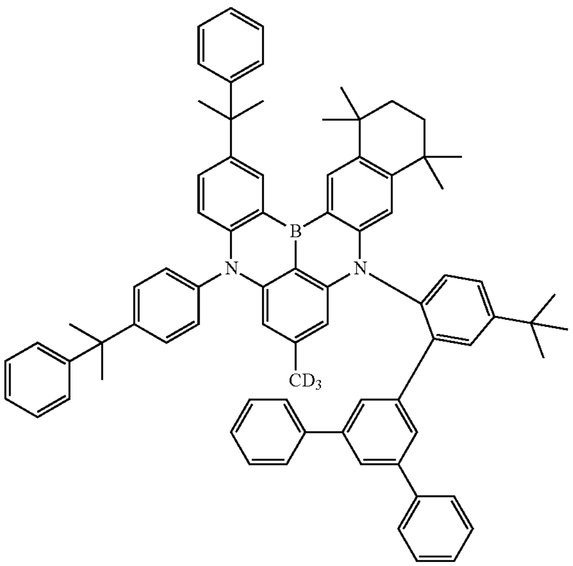
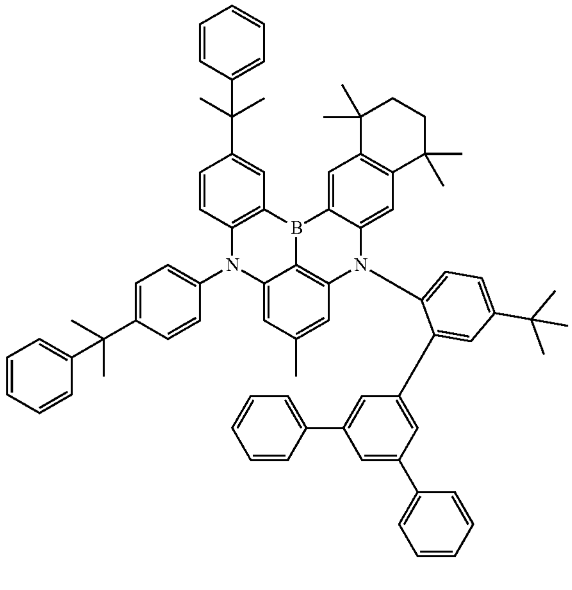
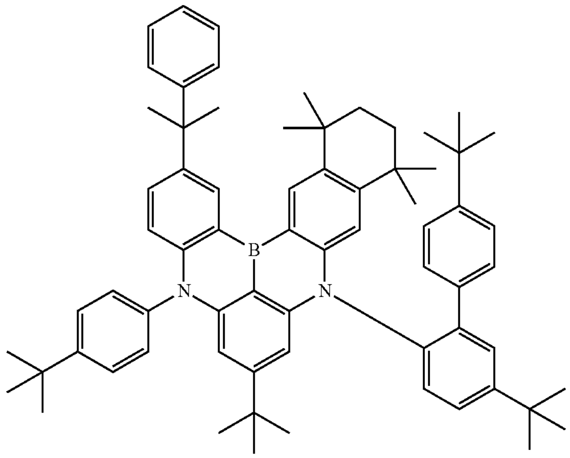
-continued -continued
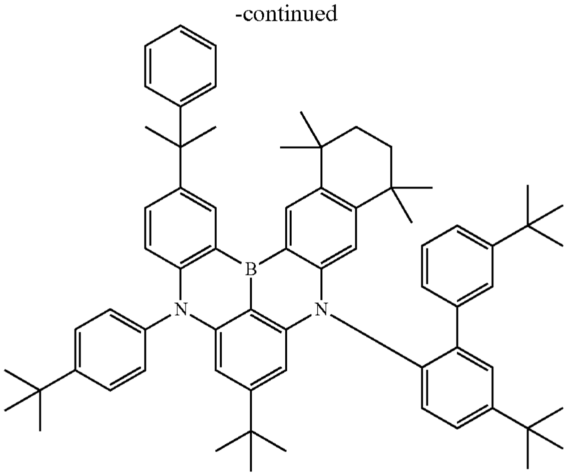
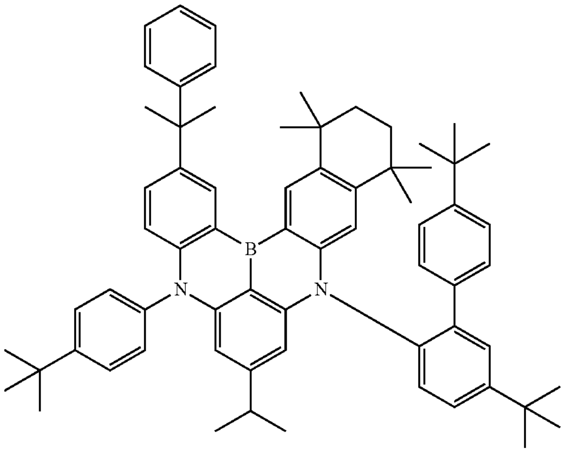
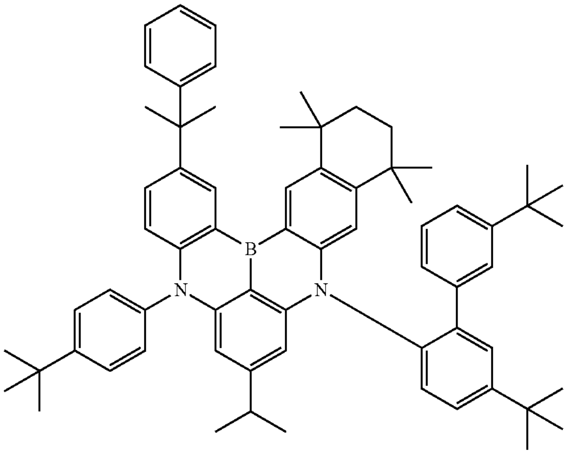
-continued
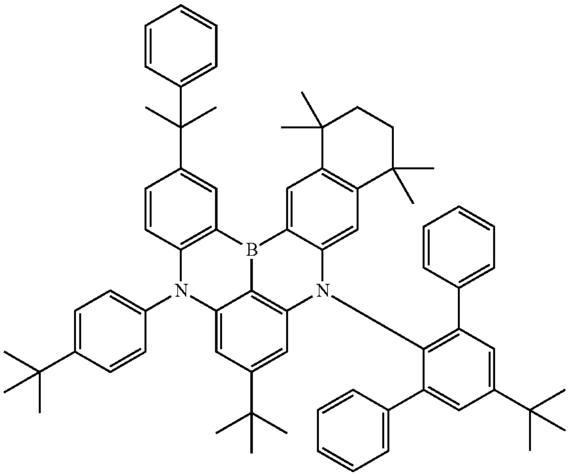
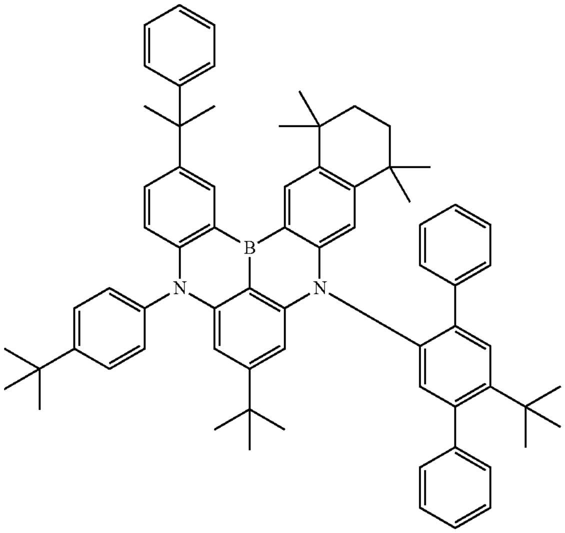
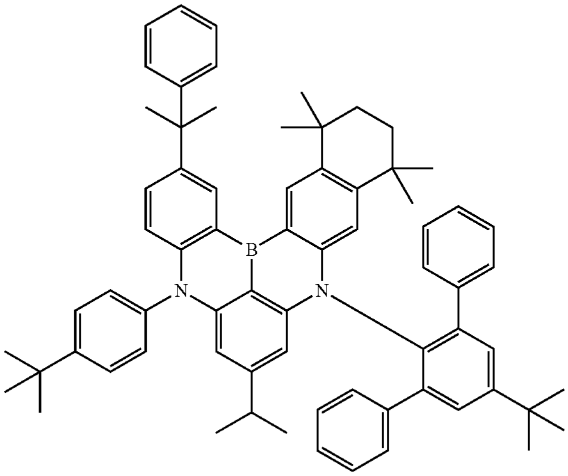

-continued
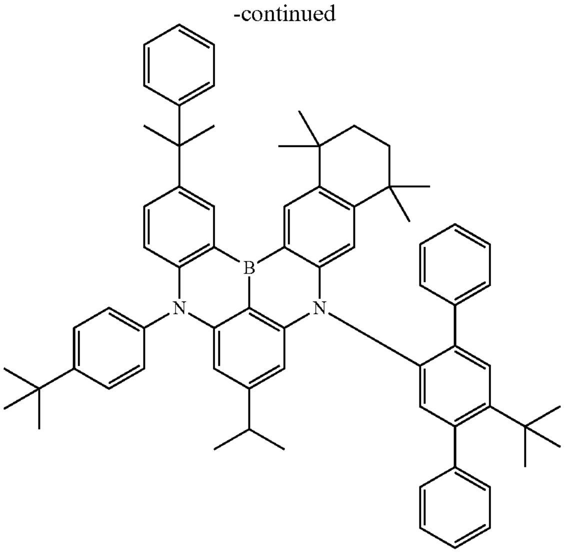
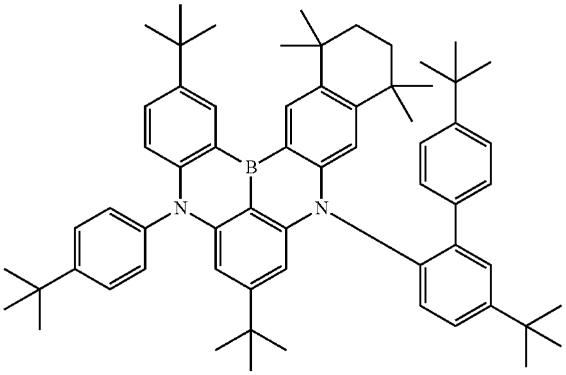
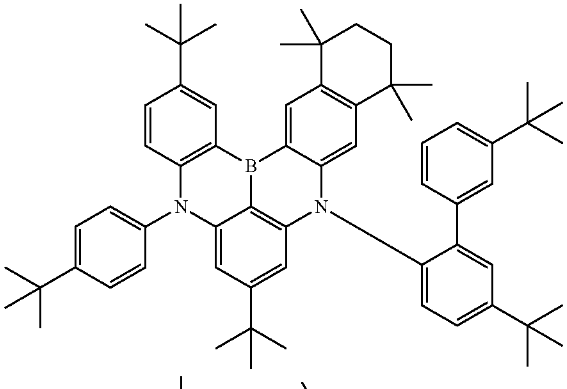
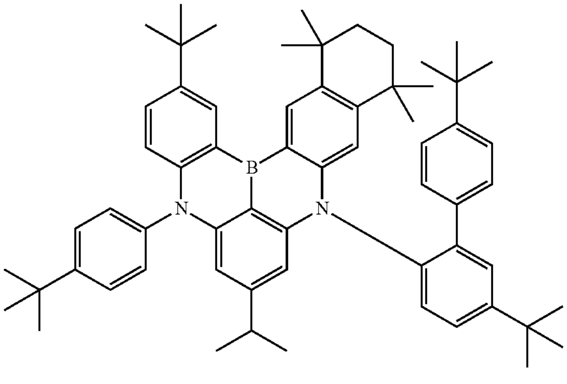
-continued
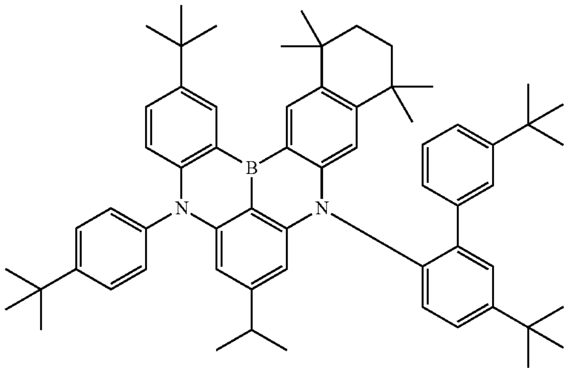
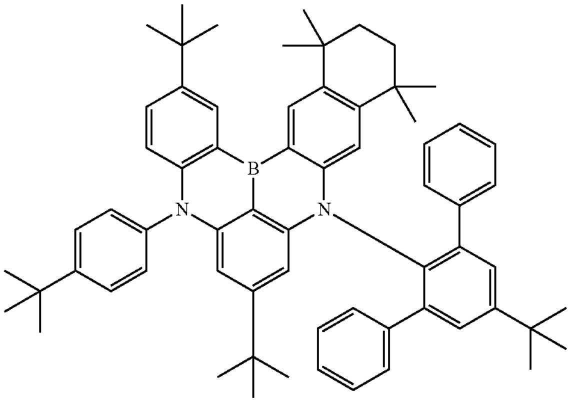
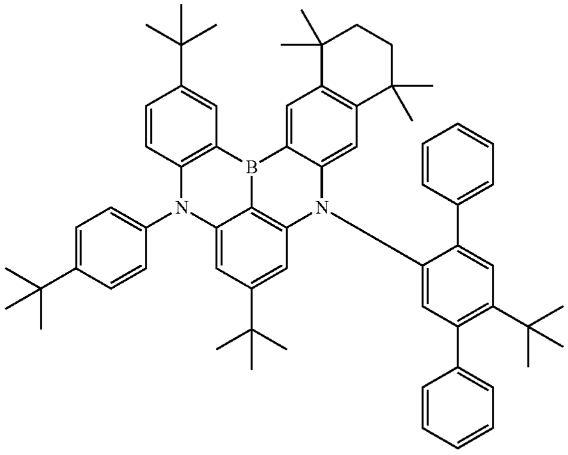
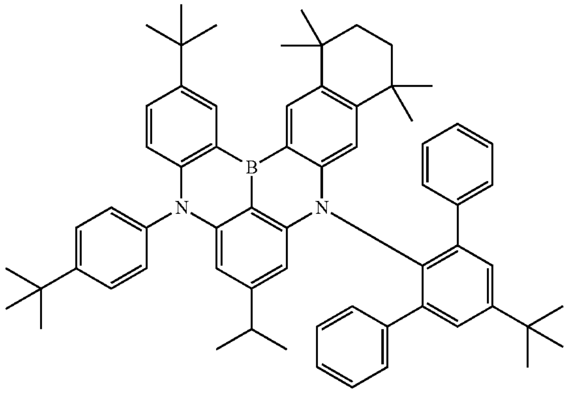

-continued
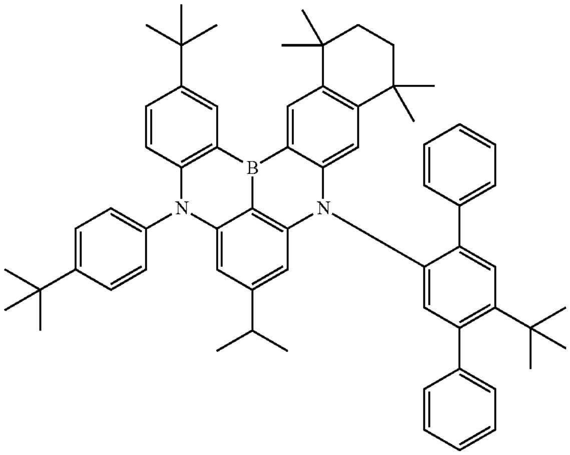
-continued
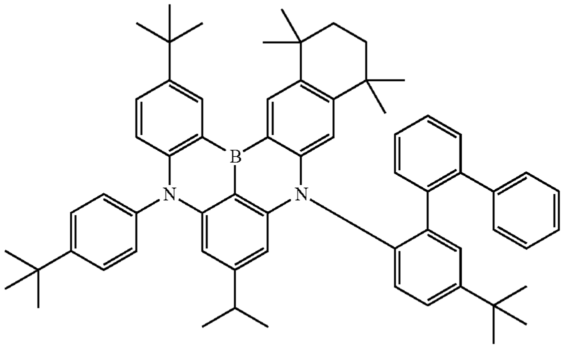
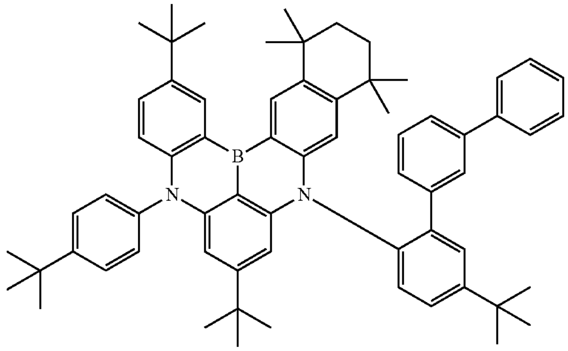
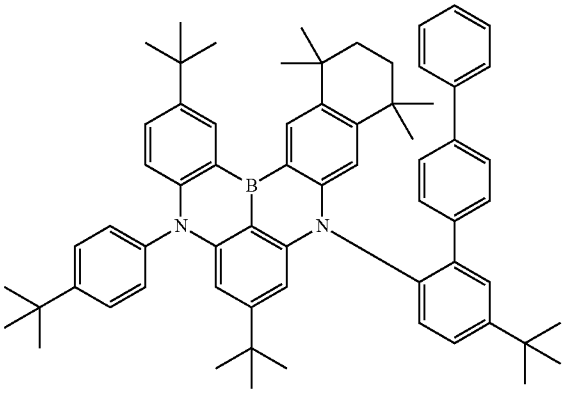
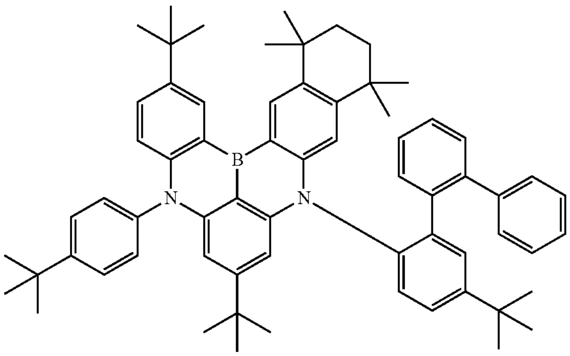
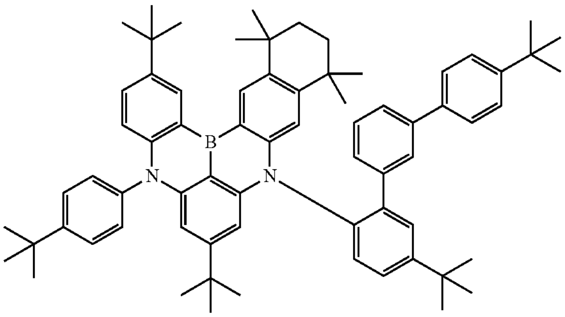
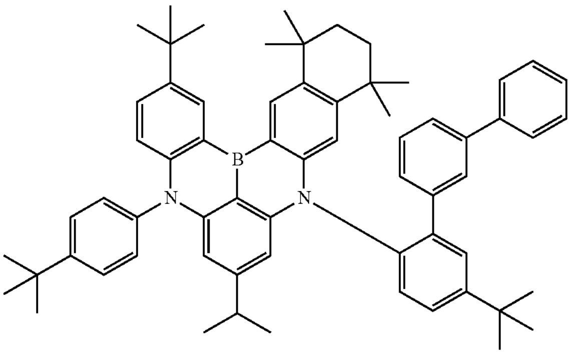
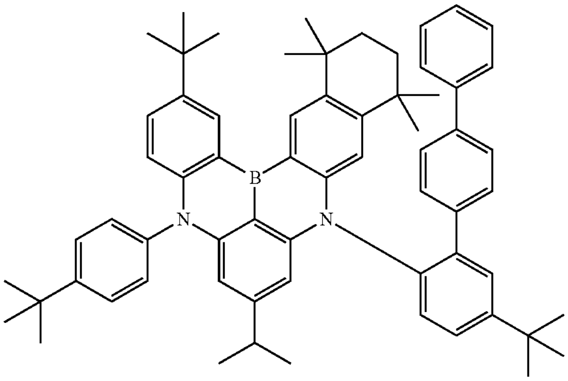

-continued
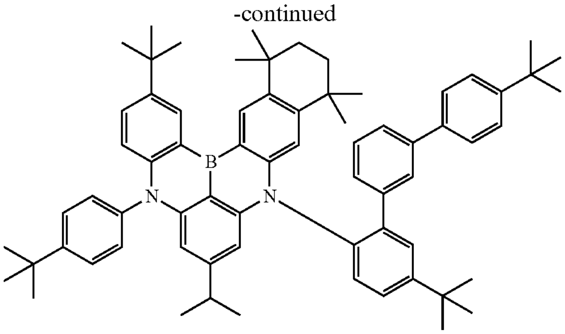
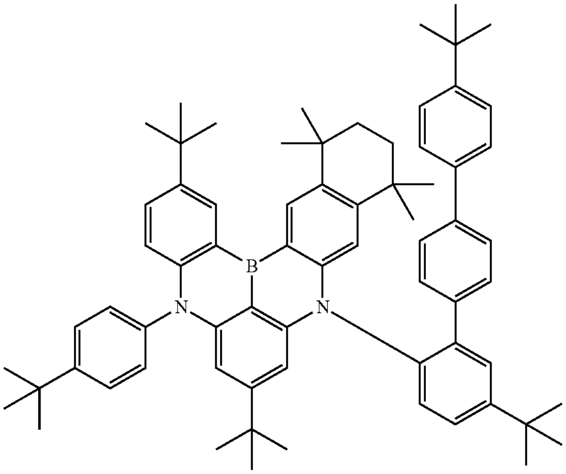
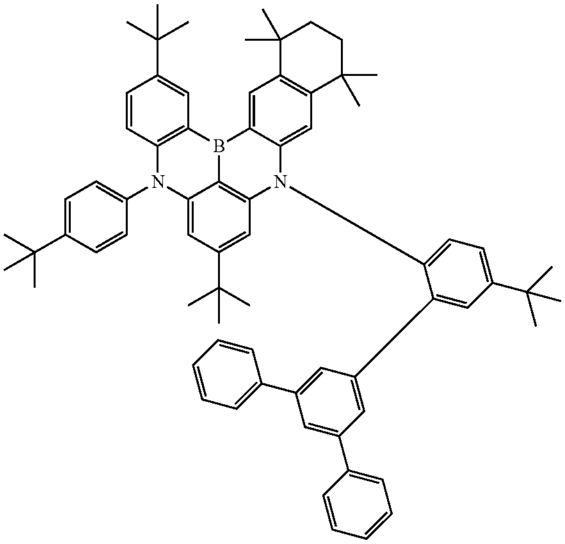
-continued
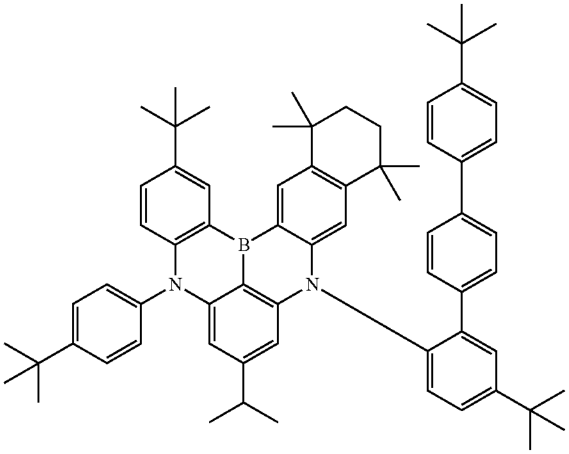
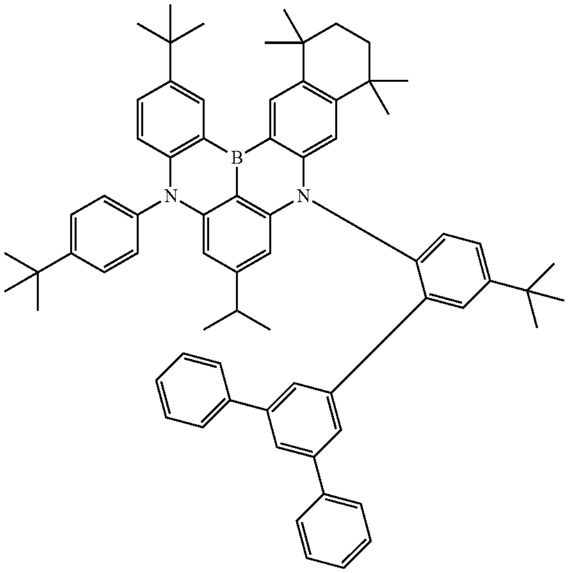

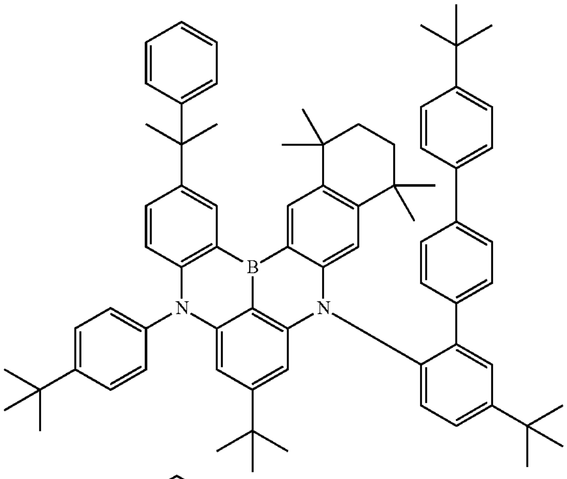
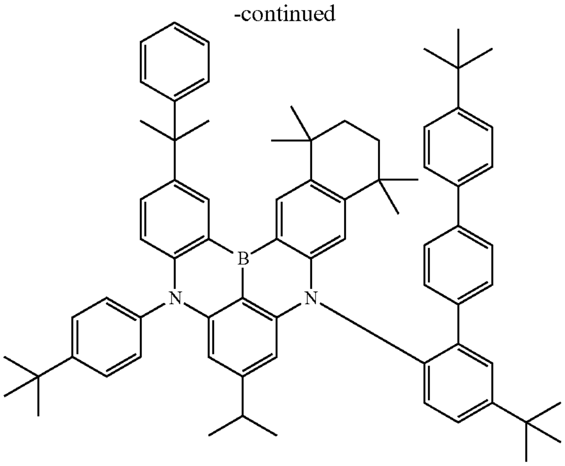
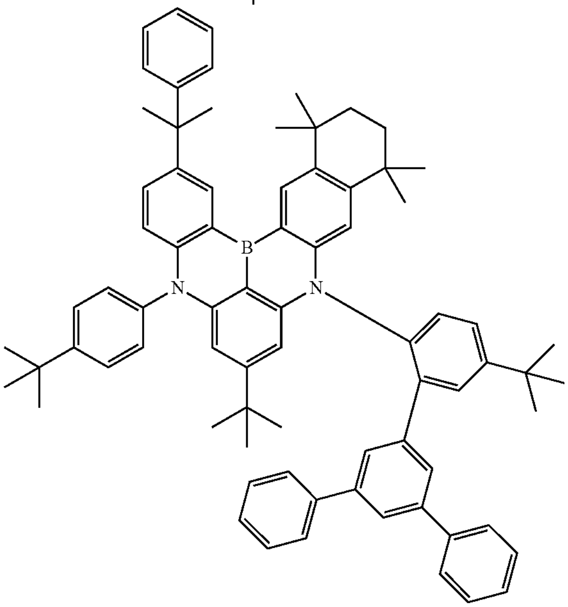
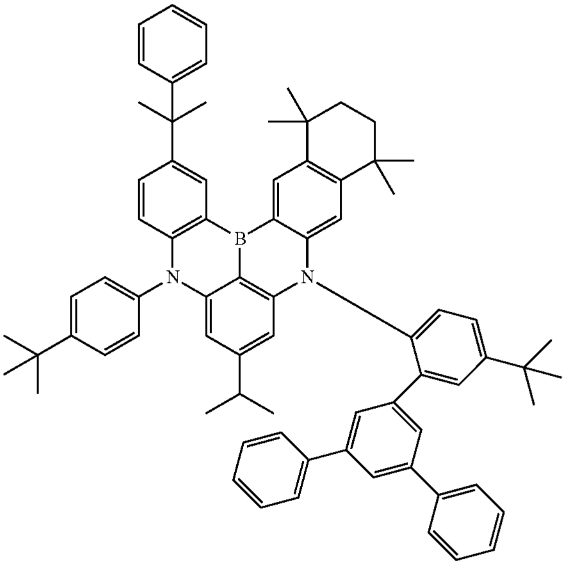
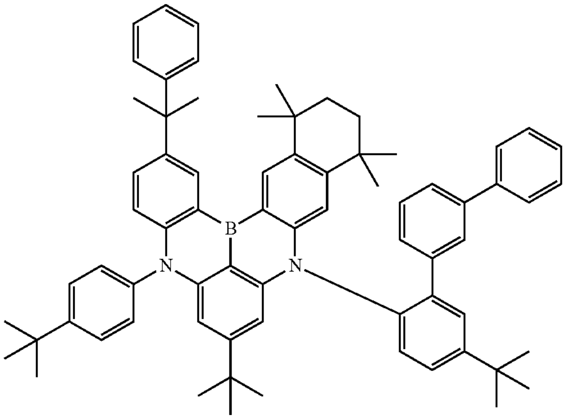

-continued
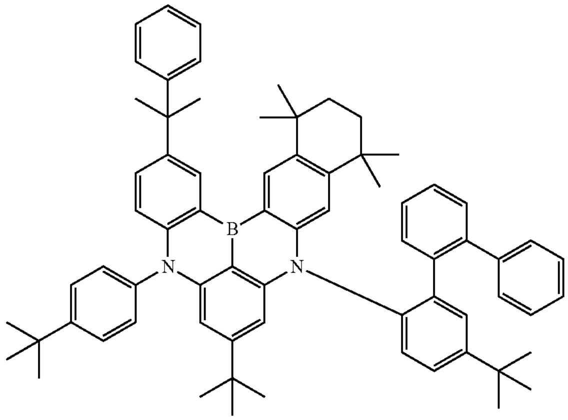
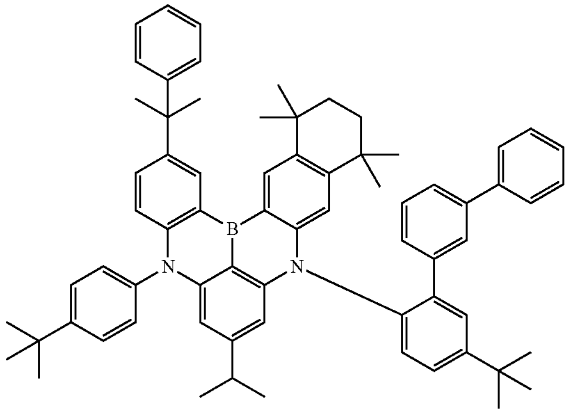
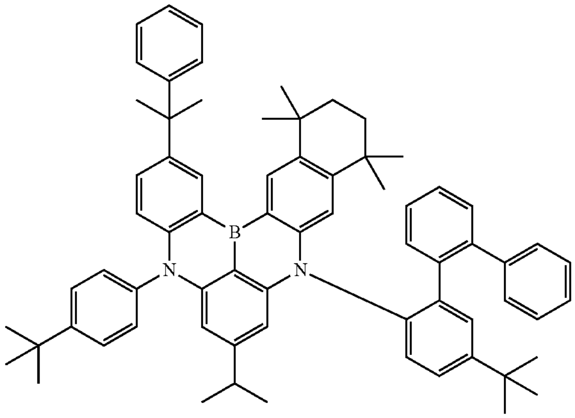
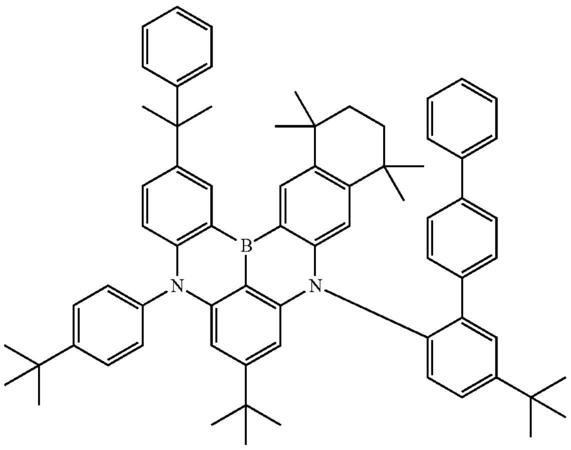

-continued
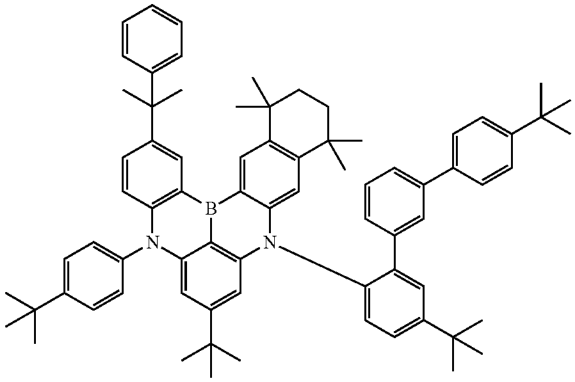
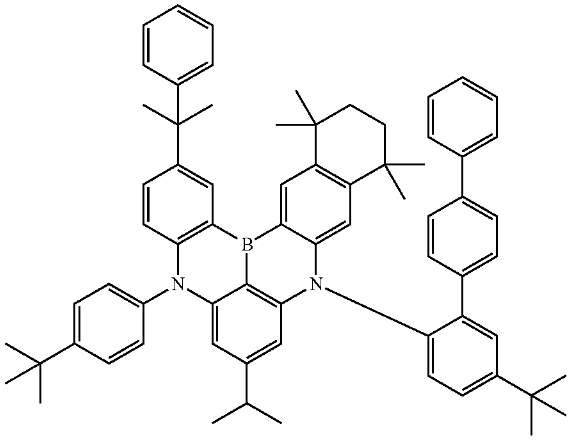
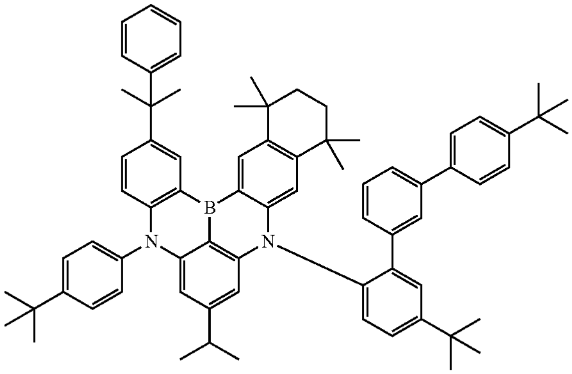
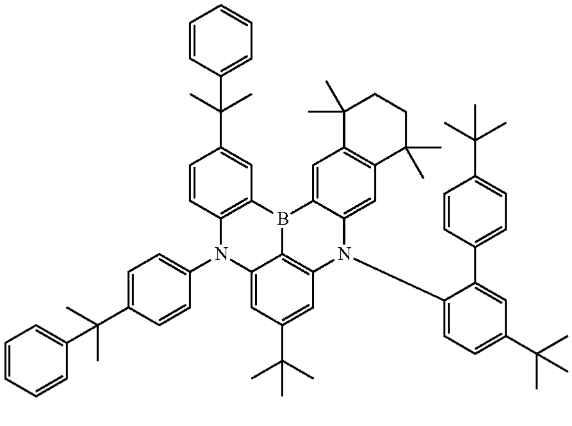

-continued
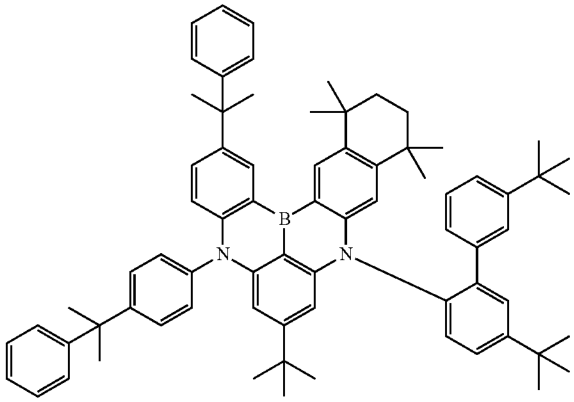
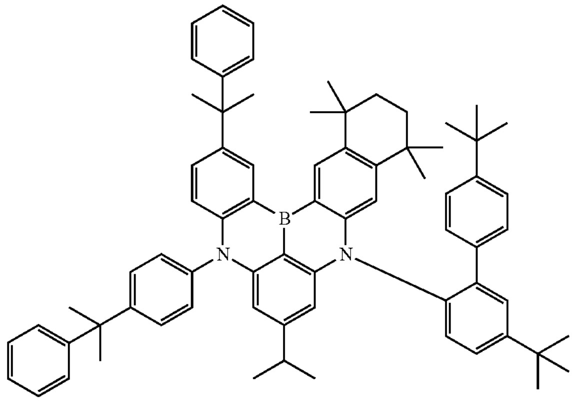
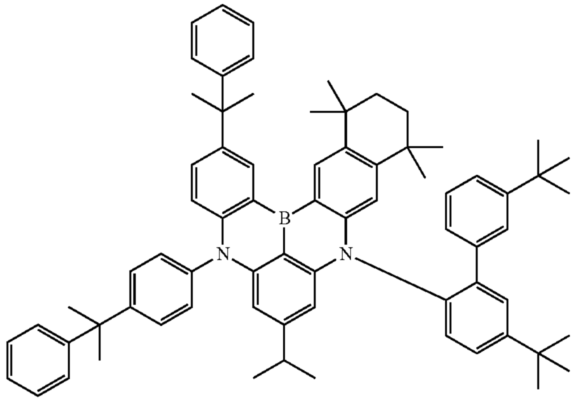
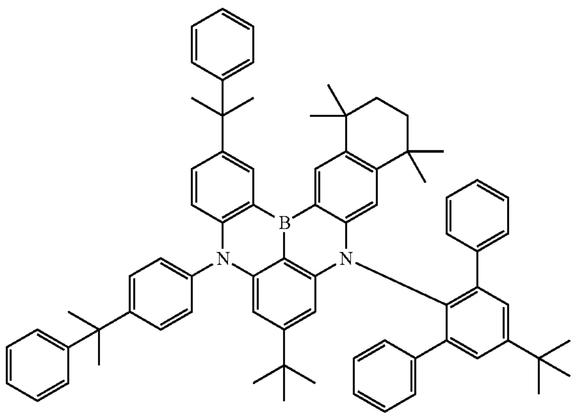

-continued
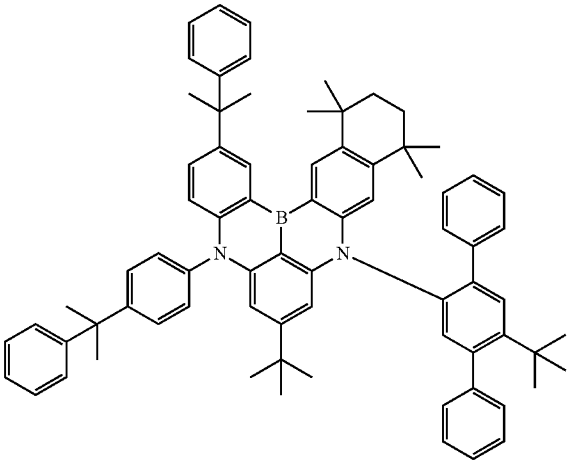
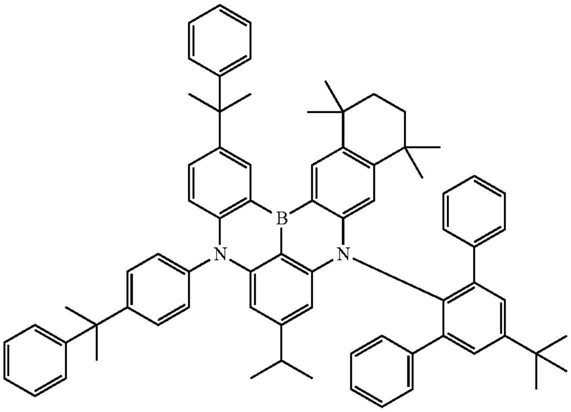
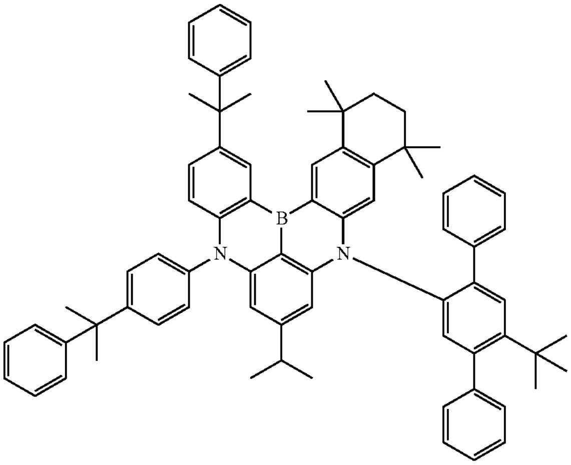
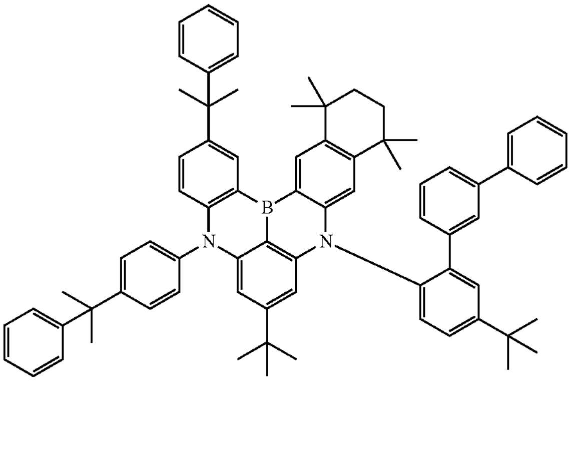

-continued
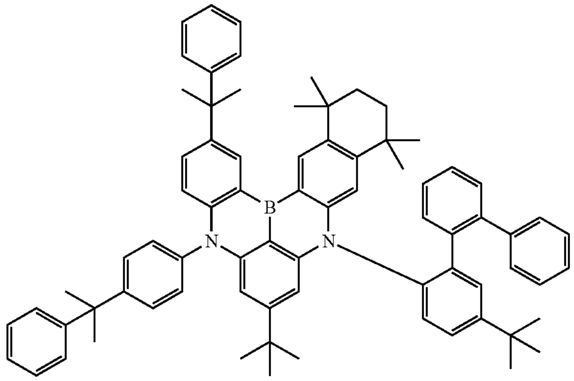
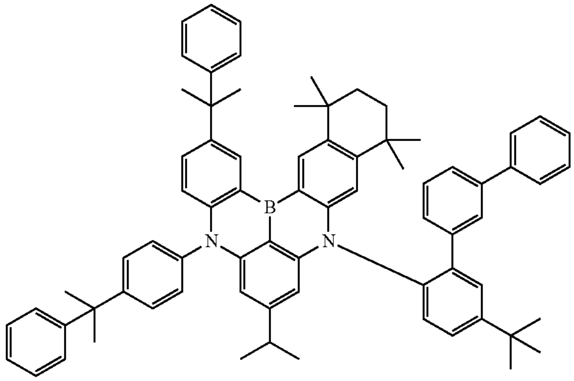
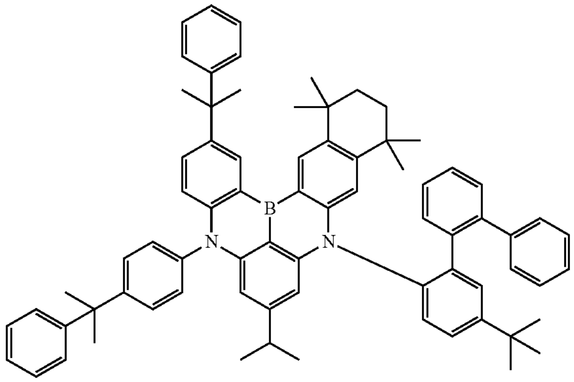
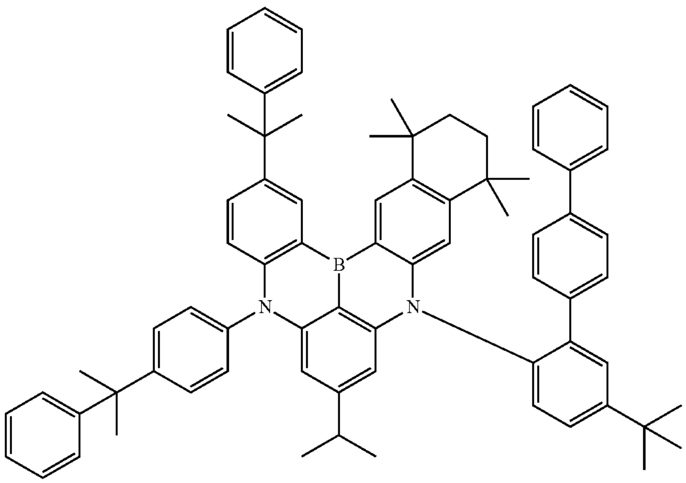

-continued
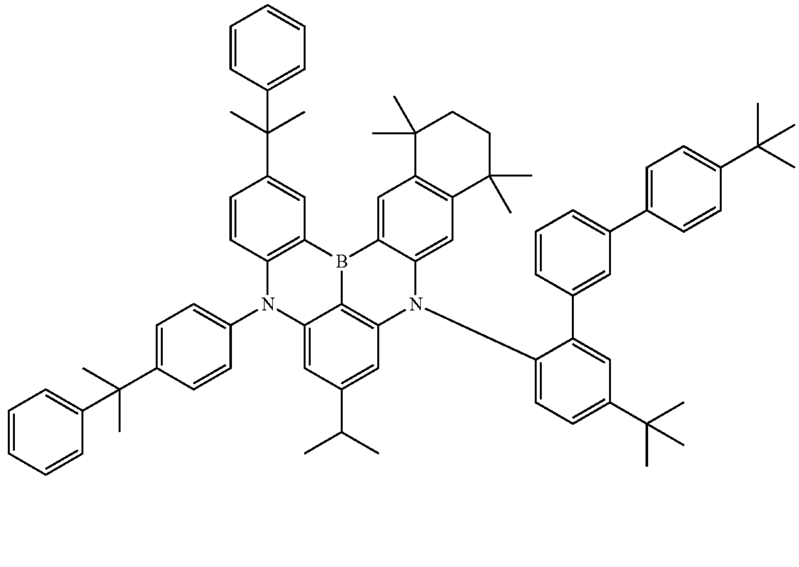 [SMILES: CC(C)c1cc2c3c(c1)N(c1ccc(C(C)(C)C)cc1-c1cccc(-c4ccc(C(C)(C)C)cc4)c1)c1cc4c(cc1B3c1cc(C(C)(C)c3ccccc3)ccc1N2c1ccc(C(C)(C)c2ccccc2)cc1)C(C)(C)CCC4(C)C]
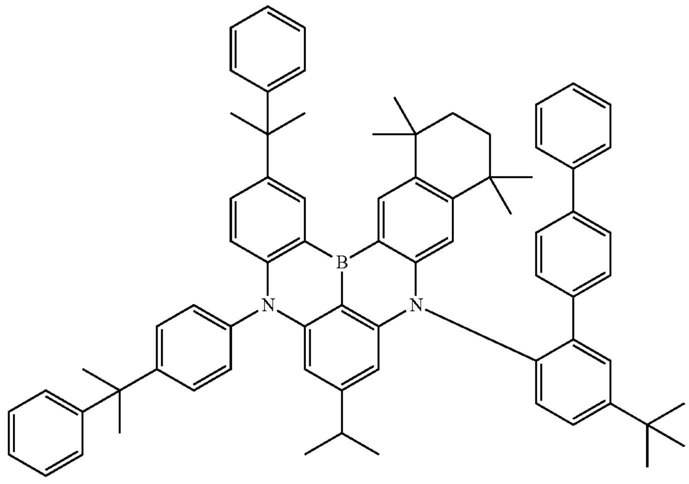
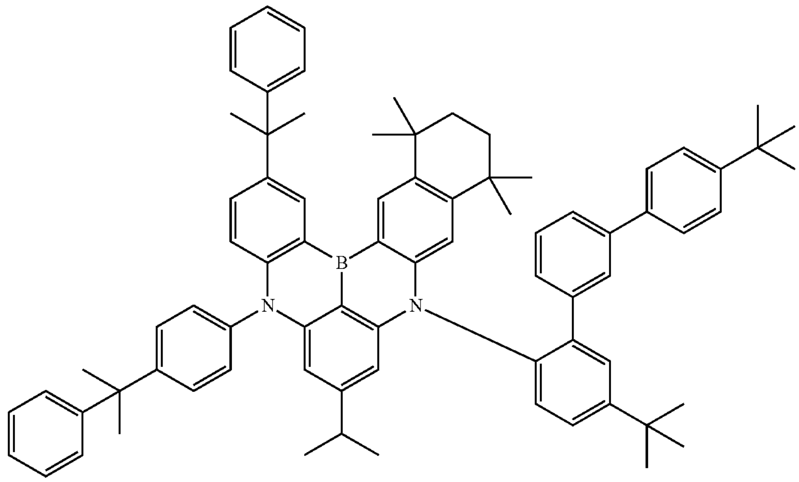

-continued
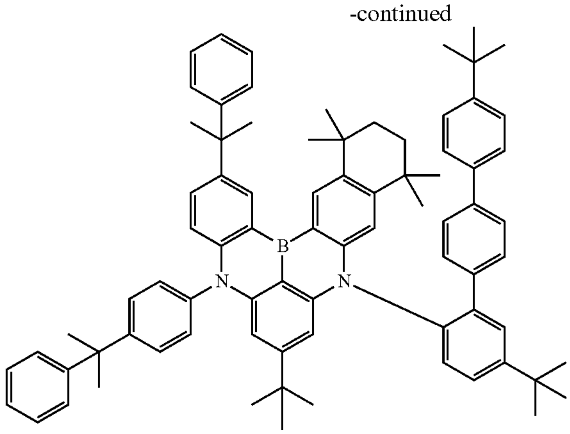
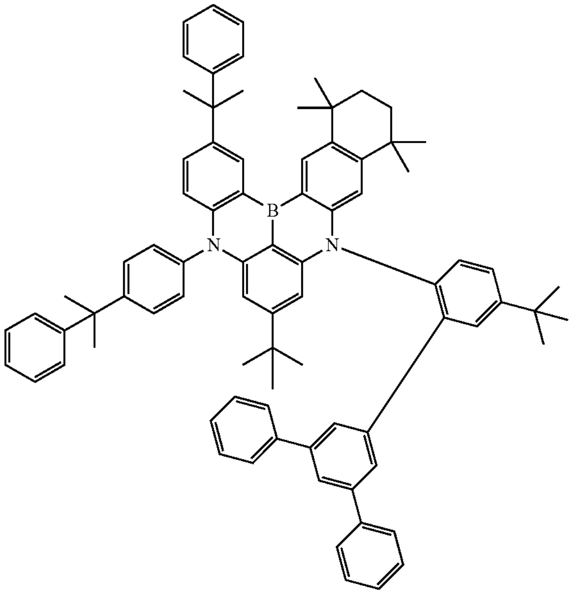 [SMILES: CC(C)c1cc2c3c(c1)N(c1ccc(C(C)(C)C)cc1-c1cc(-c4ccccc4)cc(-c4ccccc4)c1)c1cc4c(cc1B3c1cc(C(C)(C)c3ccccc3)ccc1N2c1ccc(C(C)(C)c2ccccc2)cc1)C(C)(C)CCC4(C)C]
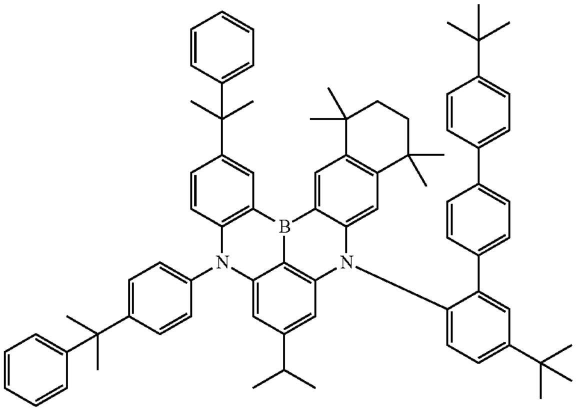

-continued
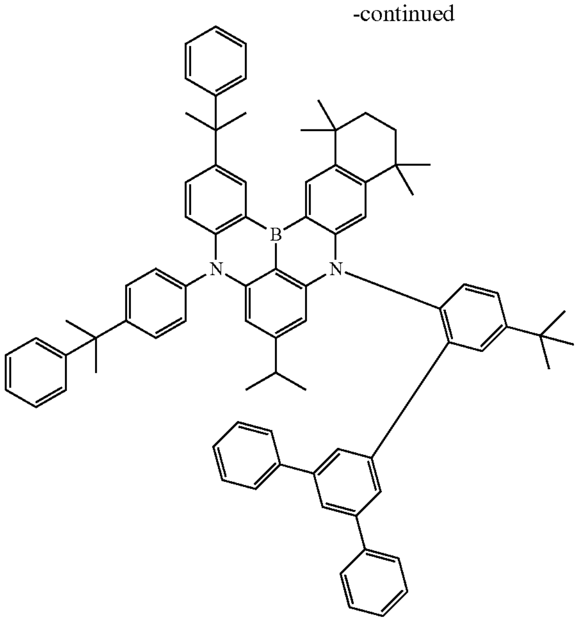
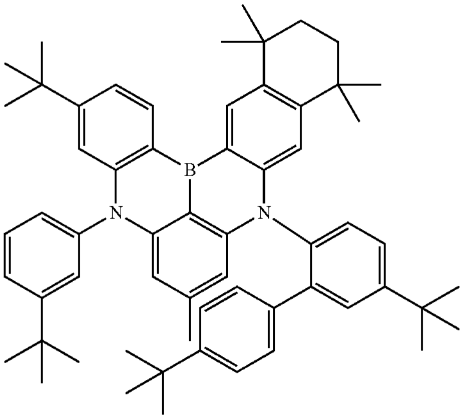
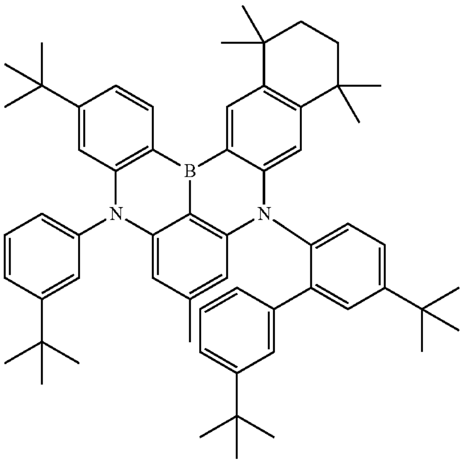

-continued
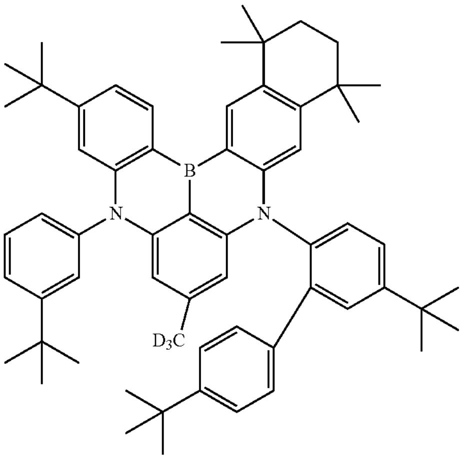
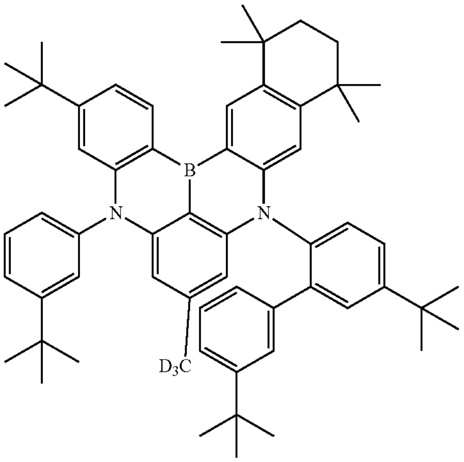 [SMILES: [2H]C([2H])([2H])c1cc2c3c(c1)N(c1ccc(C(C)(C)C)cc1-c1cccc(C(C)(C)C)c1)c1cc4c(cc1B3c1ccc(C(C)(C)C)cc1N2c1cccc(C(C)(C)C)c1)C(C)(C)CCC4(C)C]
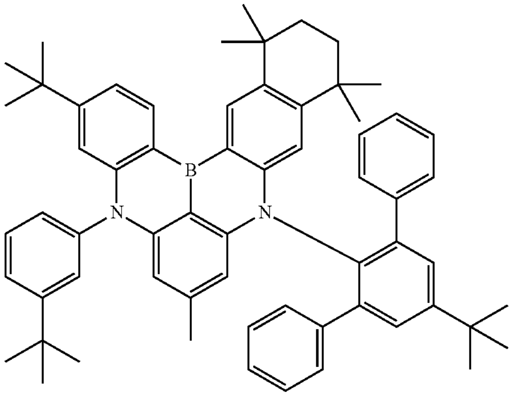
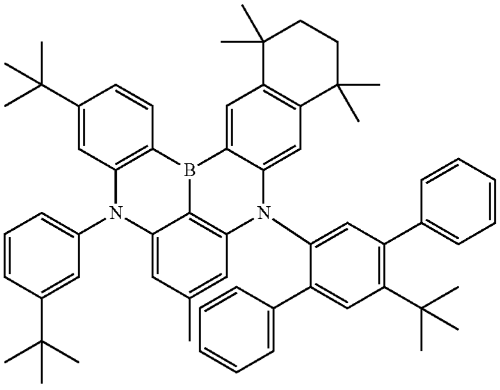

-continued
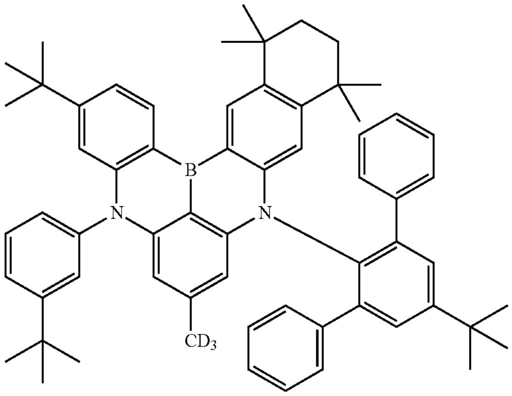
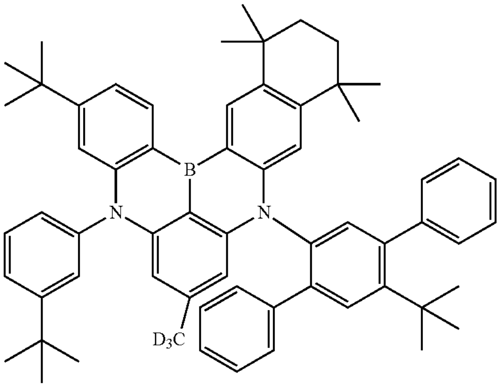
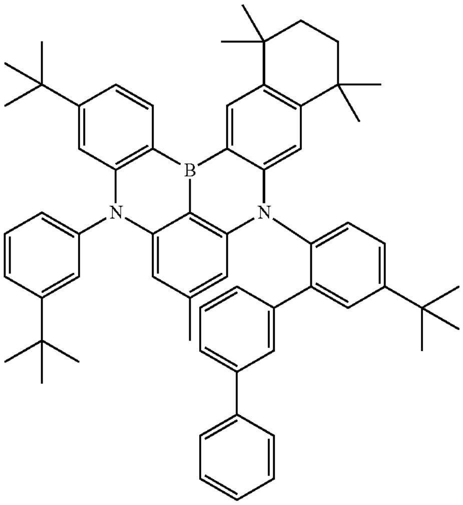
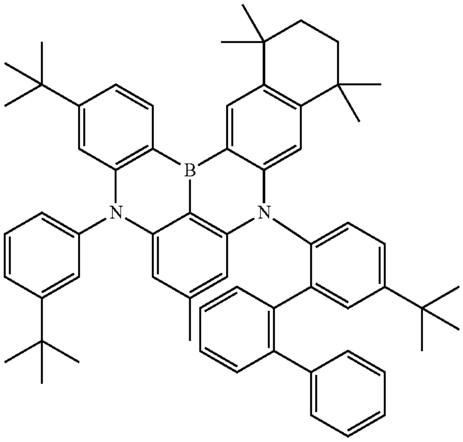

-continued
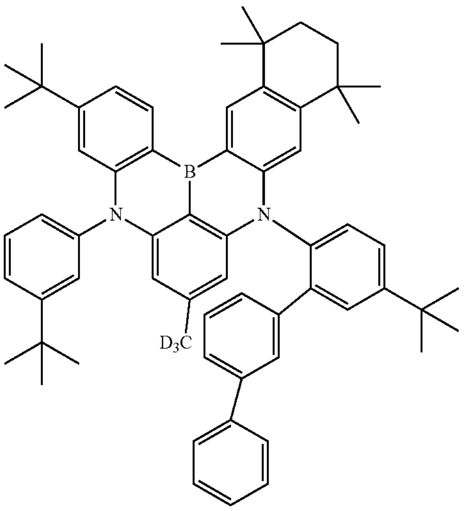
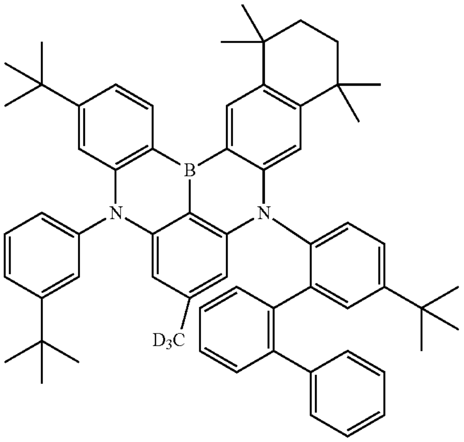
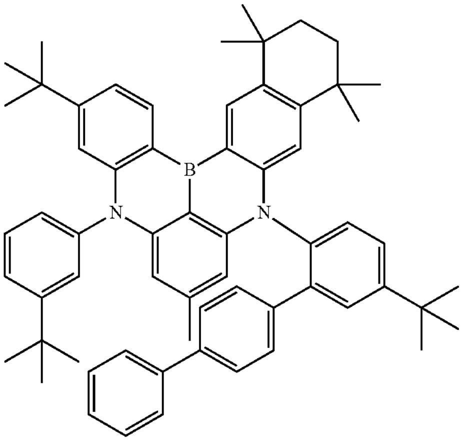

-continued
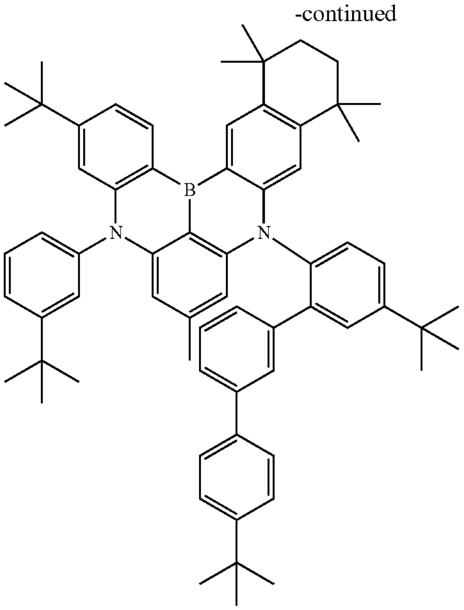
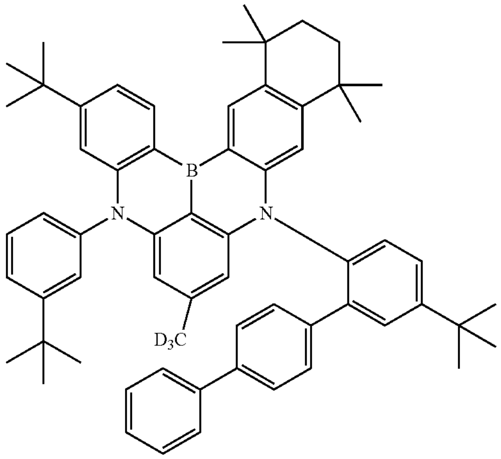
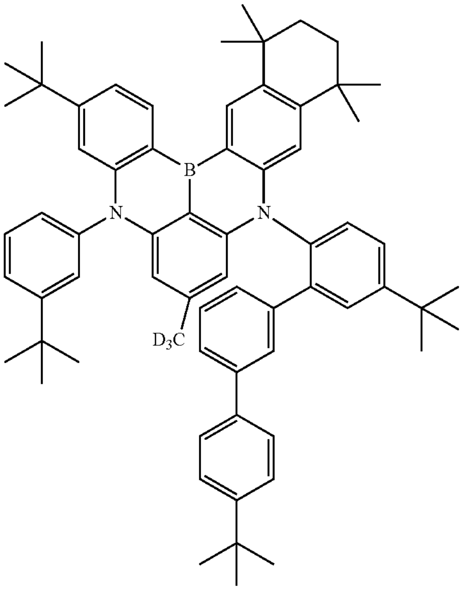 [SMILES: [2H]C([2H])([2H])c1cc2c3c(c1)N(c1ccc(C(C)(C)C)cc1-c1cccc(-c4ccc(C(C)(C)C)cc4)c1)c1cc4c(cc1B3c1ccc(C(C)(C)C)cc1N2c1cccc(C(C)(C)C)c1)C(C)(C)CCC4(C)C]

-continued
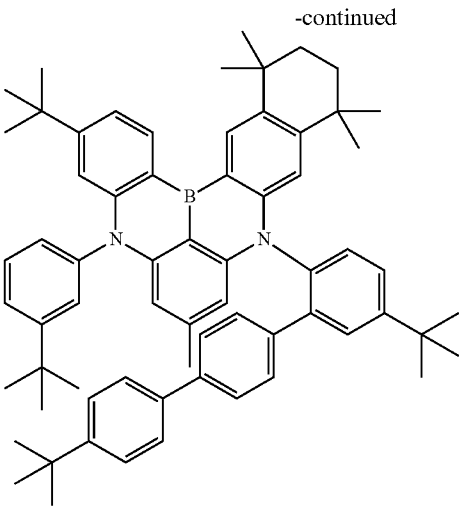
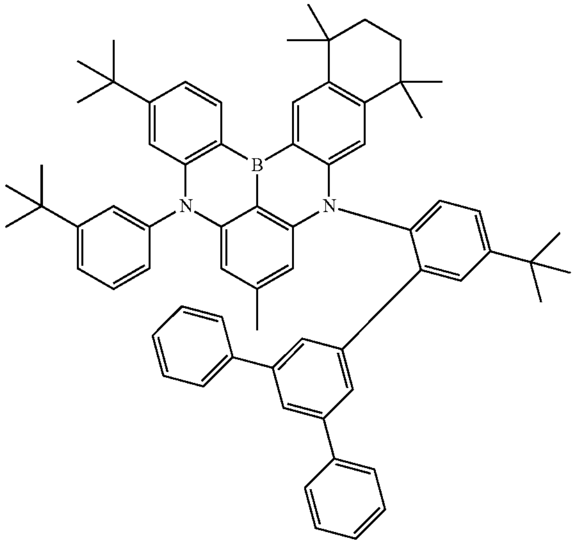
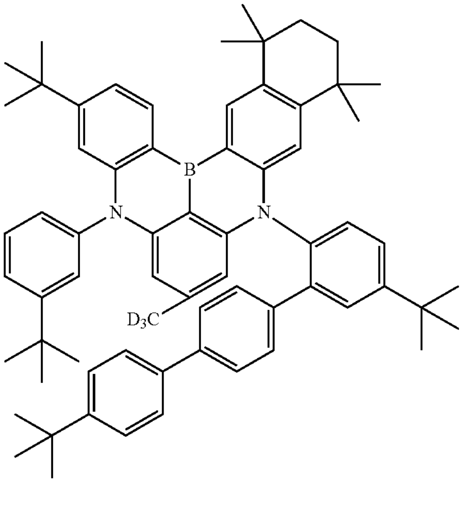

-continued
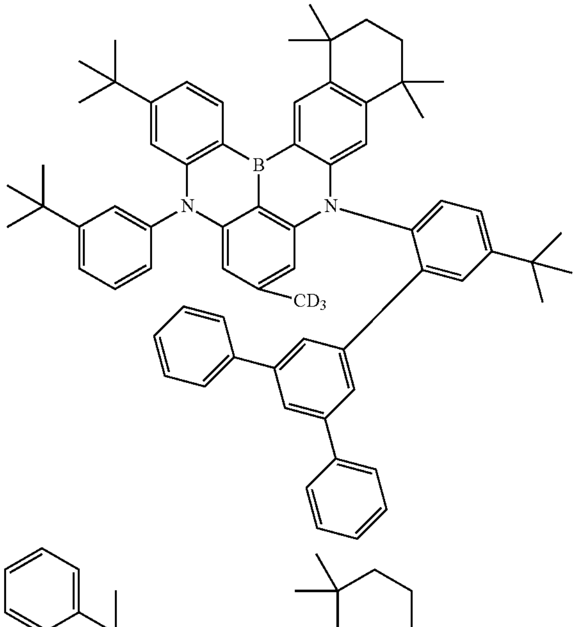
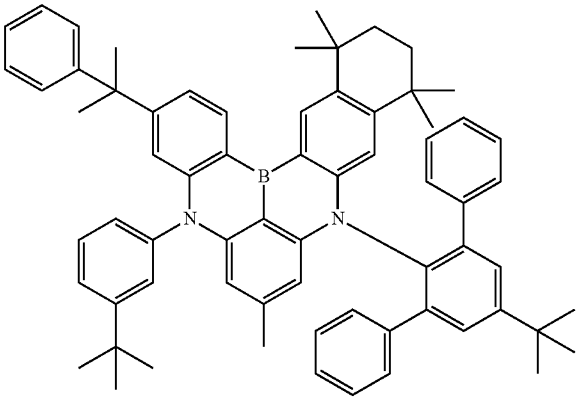
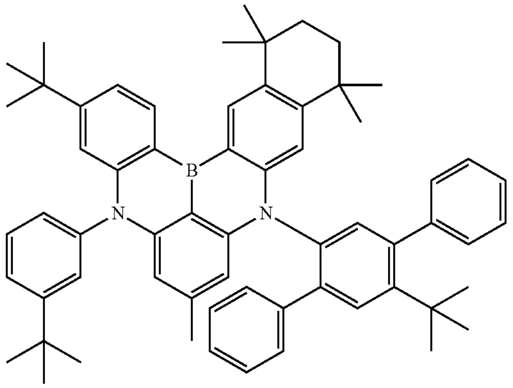
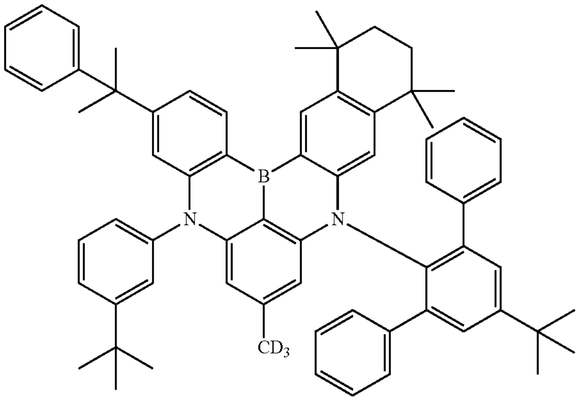

-continued
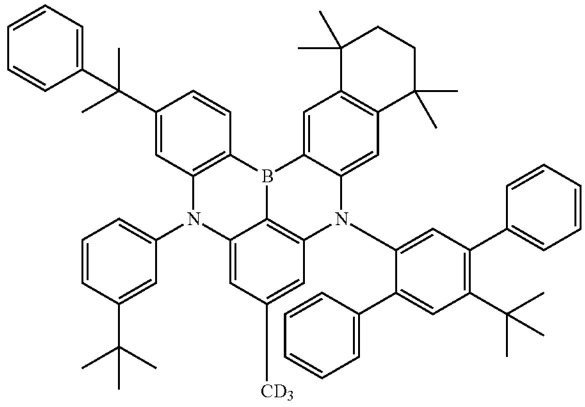
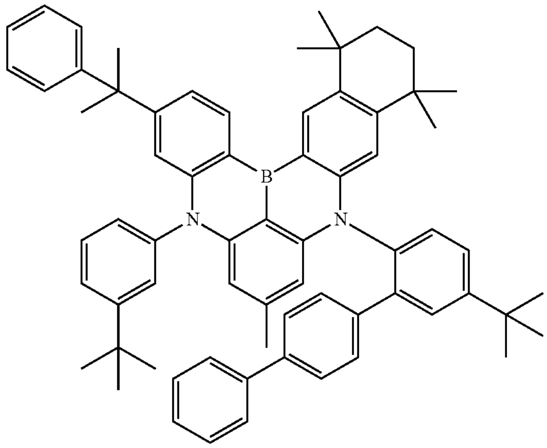
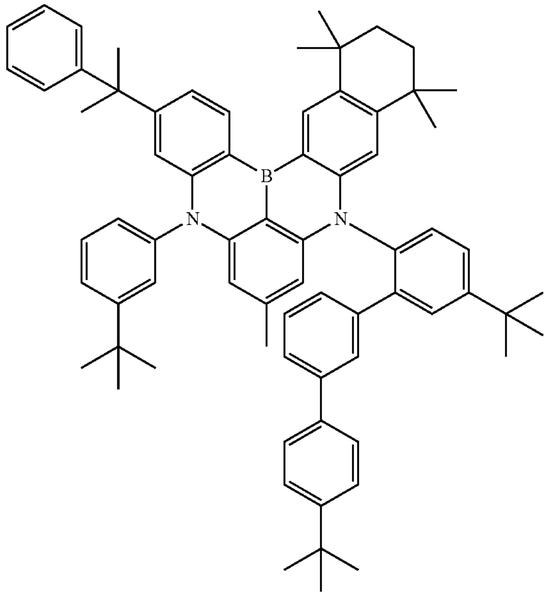

-continued
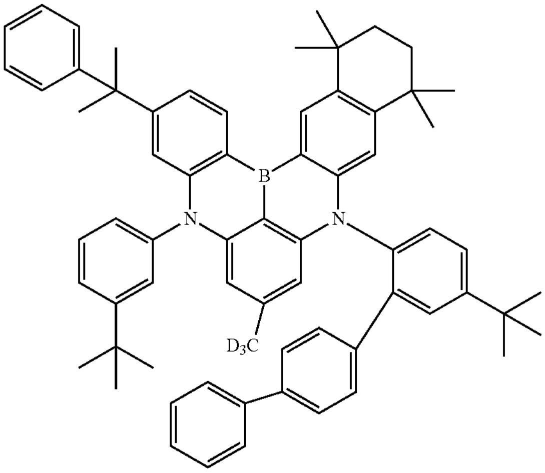
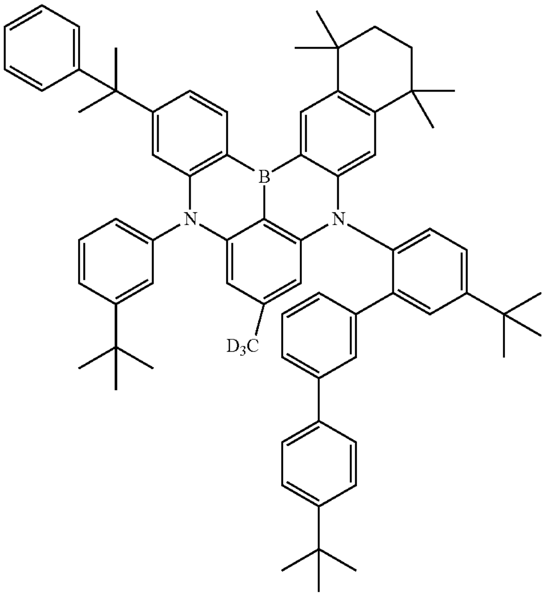
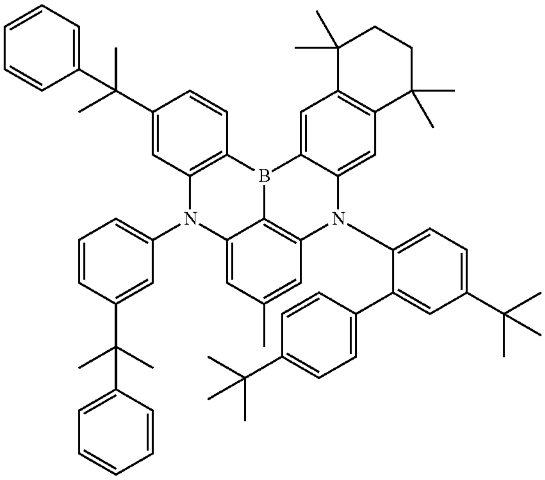

-continued
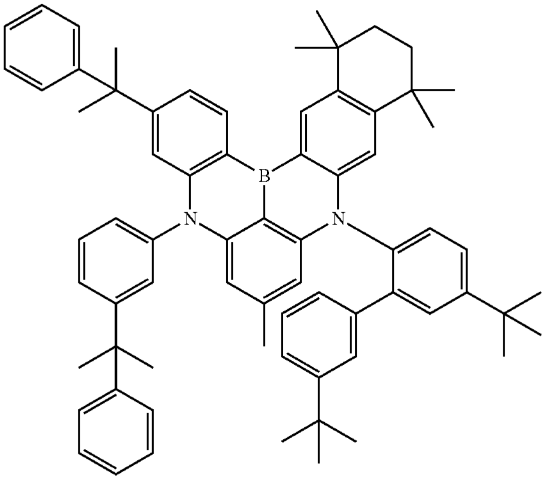
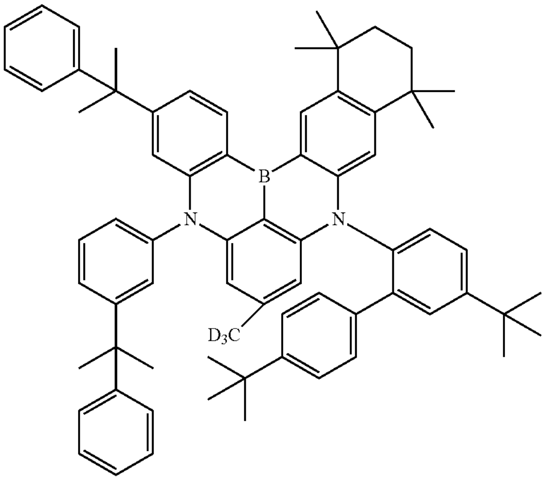
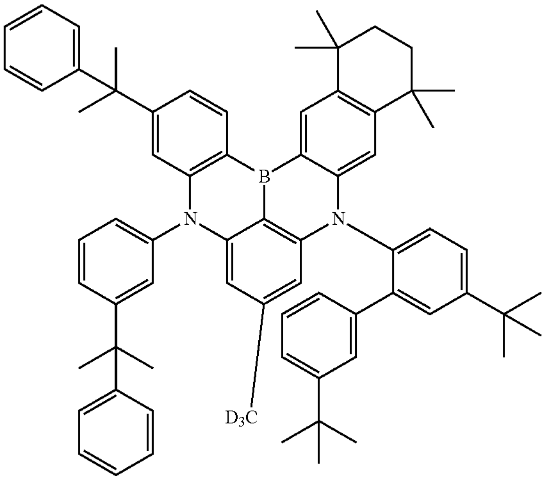 [SMILES: [2H]C([2H])([2H])c1cc2c3c(c1)N(c1ccc(C(C)(C)C)cc1-c1cccc(C(C)(C)C)c1)c1cc4c(cc1B3c1ccc(C(C)(C)c3ccccc3)cc1N2c1cccc(C(C)(C)c2ccccc2)c1)C(C)(C)CCC4(C)C]

-continued
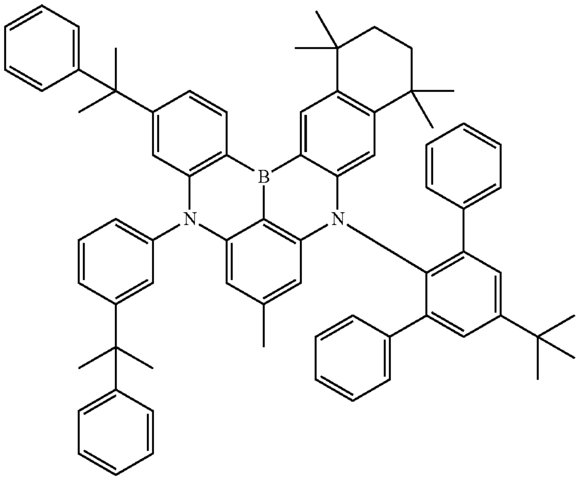
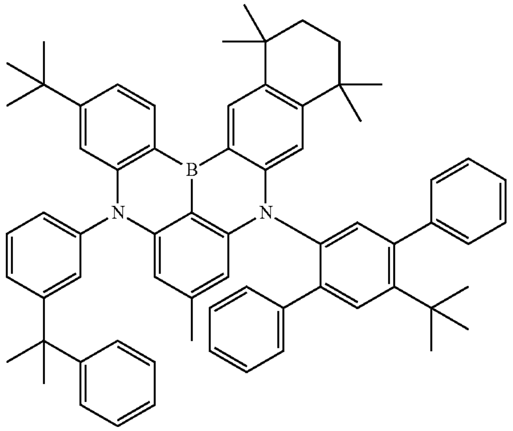
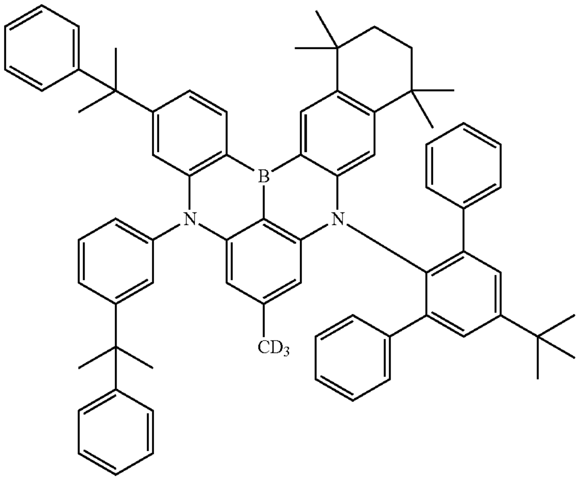

-continued
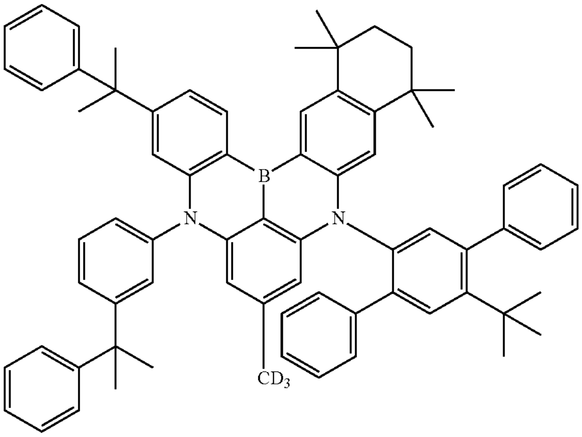
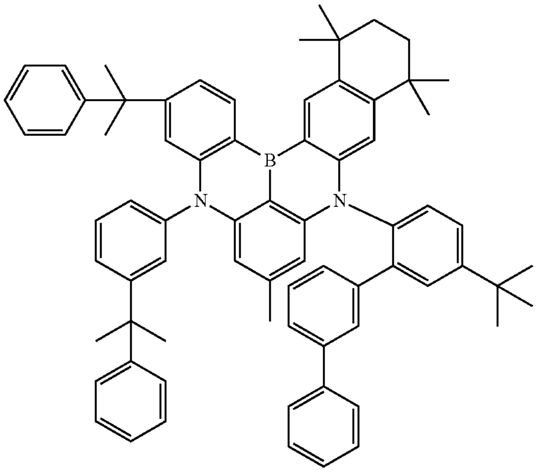
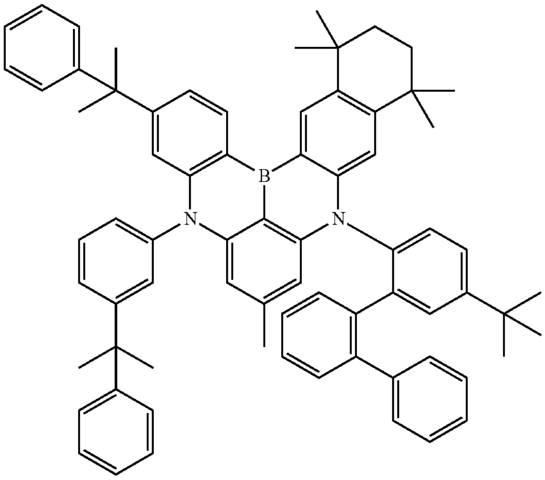

-continued
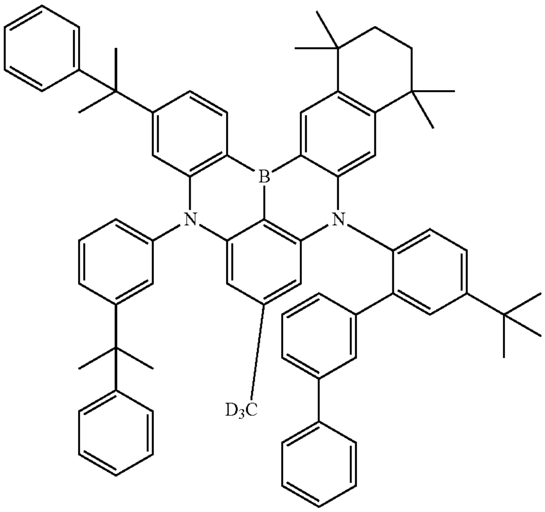
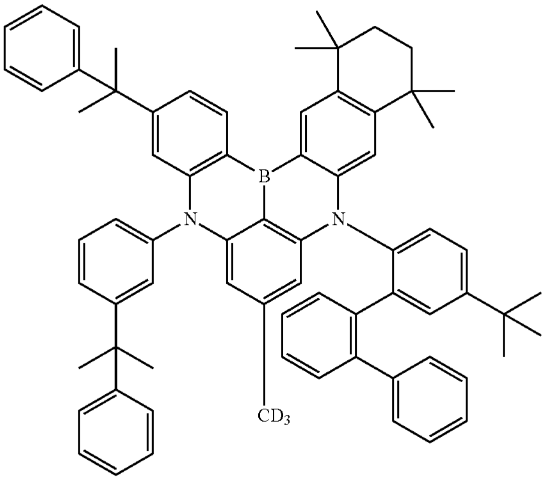 [SMILES: [2H]C([2H])([2H])c1cc2c3c(c1)N(c1ccc(C(C)(C)C)cc1-c1ccccc1-c1ccccc1)c1cc4c(cc1B3c1ccc(C(C)(C)c3ccccc3)cc1N2c1cccc(C(C)(C)c2ccccc2)c1)C(C)(C)CCC4(C)C]
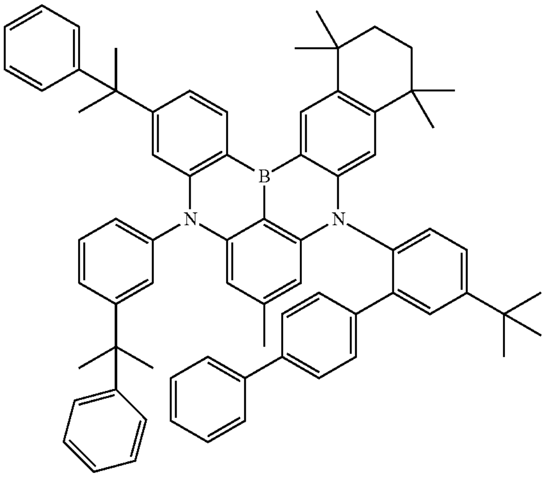

-continued
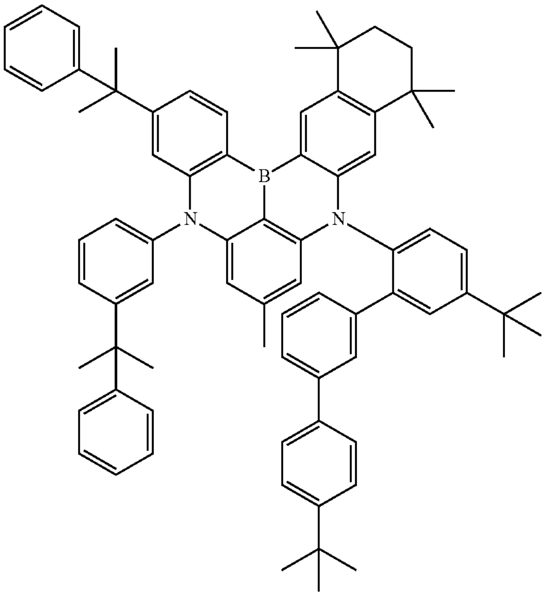
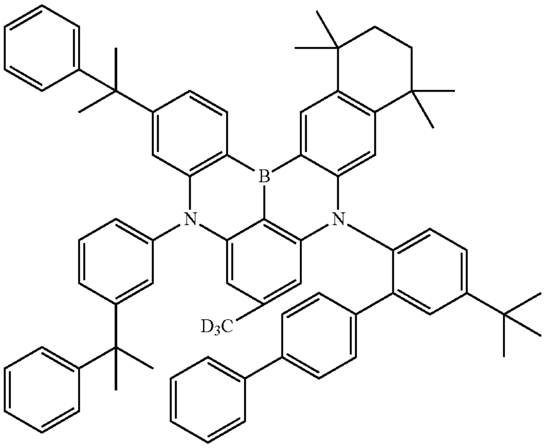
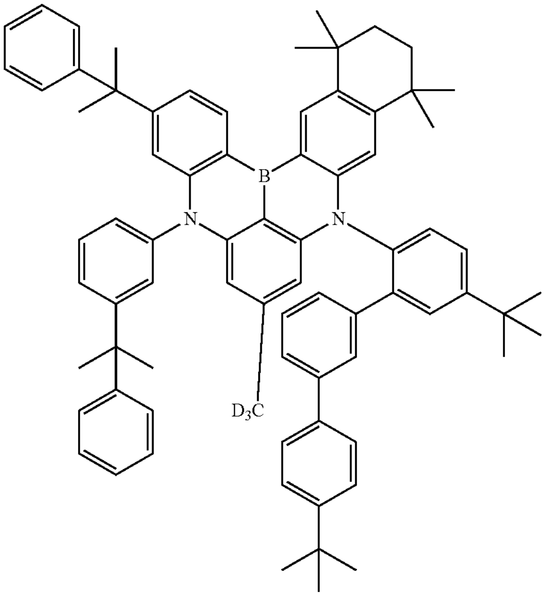 [SMILES: [2H]C([2H])([2H])c1cc2c3c(c1)N(c1ccc(C(C)(C)C)cc1-c1cccc(-c4ccc(C(C)(C)C)cc4)c1)c1cc4c(cc1B3c1ccc(C(C)(C)c3ccccc3)cc1N2c1cccc(C(C)(C)c2ccccc2)c1)C(C)(C)CCC4(C)C]

-continued
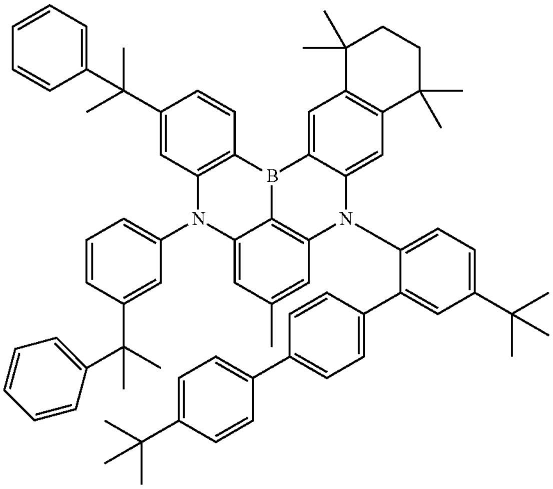
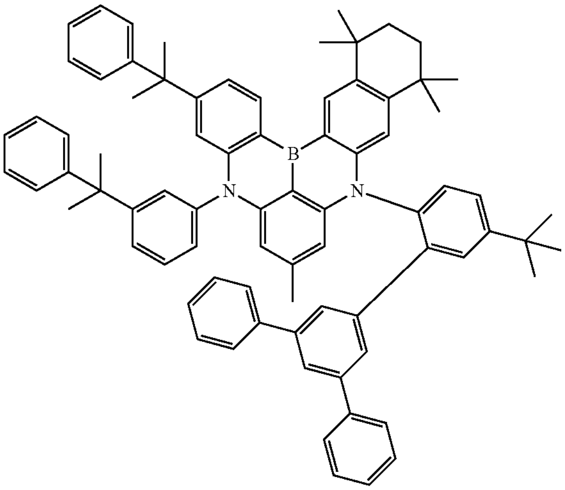
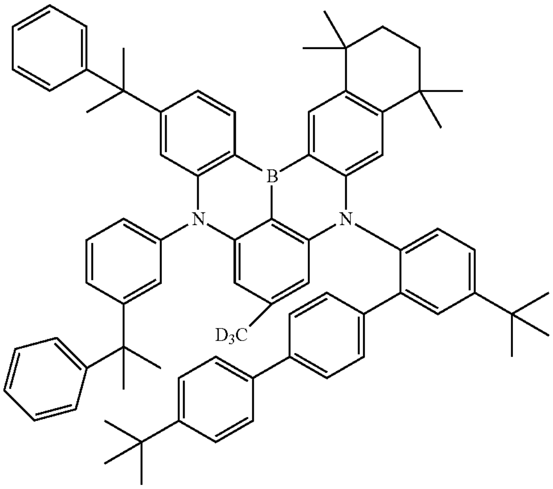

-continued
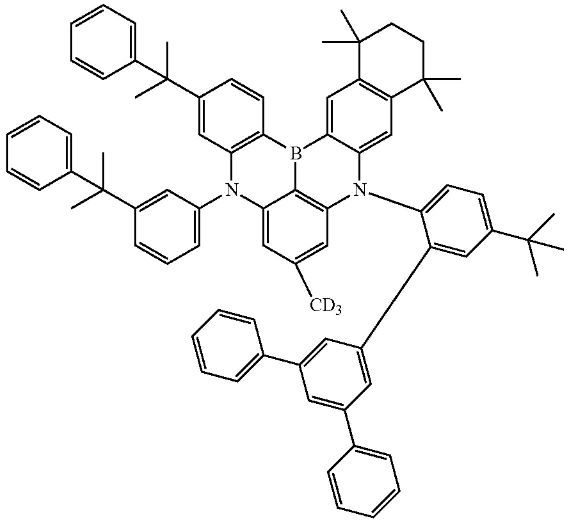 [SMILES: [2H]C([2H])([2H])c1cc2c3c(c1)N(c1ccc(C(C)(C)C)cc1-c1cc(-c4ccccc4)cc(-c4ccccc4)c1)c1cc4c(cc1B3c1ccc(C(C)(C)c3ccccc3)cc1N2c1cccc(C(C)(C)c2ccccc2)c1)C(C)(C)CCC4(C)C]
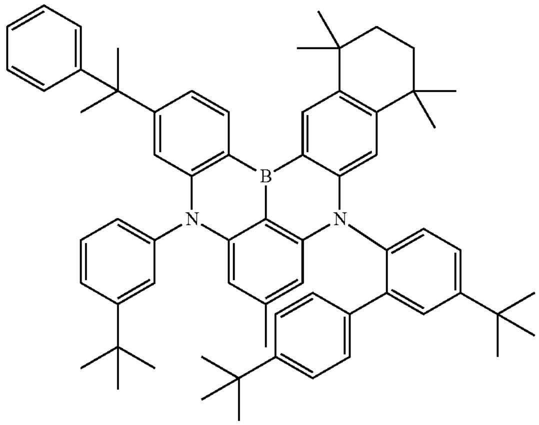
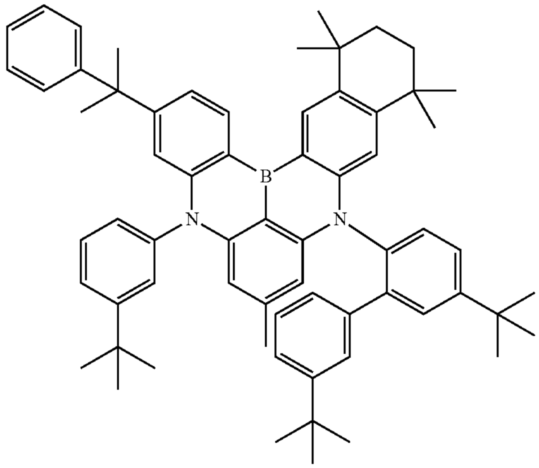

-continued
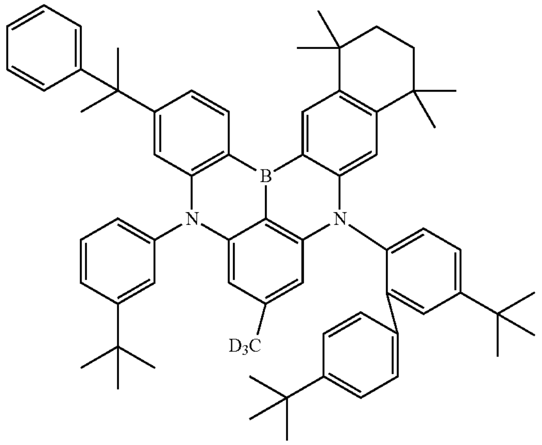
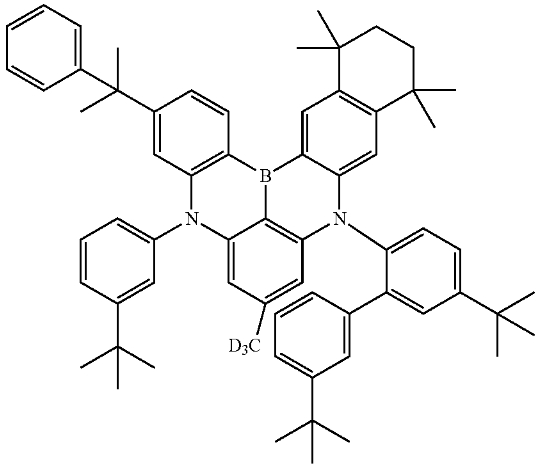 [SMILES: [2H]C([2H])([2H])c1cc2c3c(c1)N(c1ccc(C(C)(C)C)cc1-c1cccc(C(C)(C)C)c1)c1cc4c(cc1B3c1ccc(C(C)(C)c3ccccc3)cc1N2c1cccc(C(C)(C)C)c1)C(C)(C)CCC4(C)C]
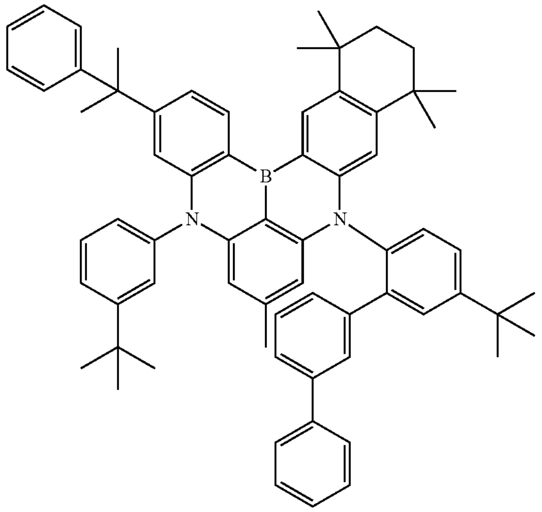

-continued
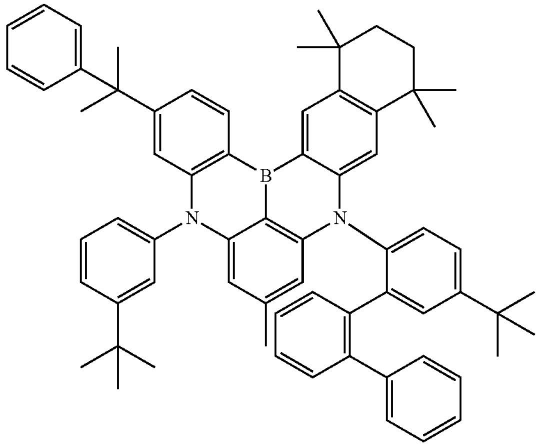
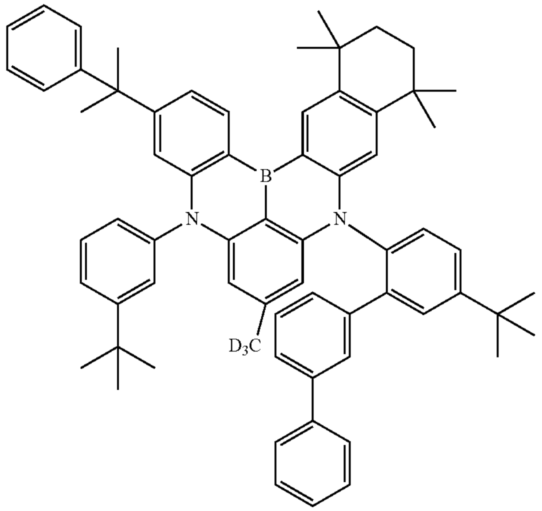
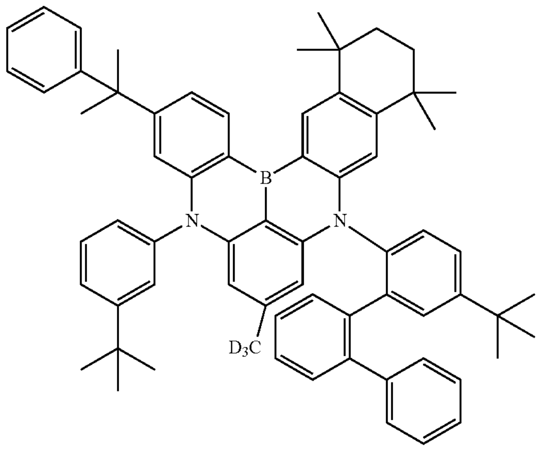 [SMILES: [2H]C([2H])([2H])c1cc2c3c(c1)N(c1ccc(C(C)(C)C)cc1-c1ccccc1-c1ccccc1)c1cc4c(cc1B3c1ccc(C(C)(C)c3ccccc3)cc1N2c1cccc(C(C)(C)C)c1)C(C)(C)CCC4(C)C]

-continued
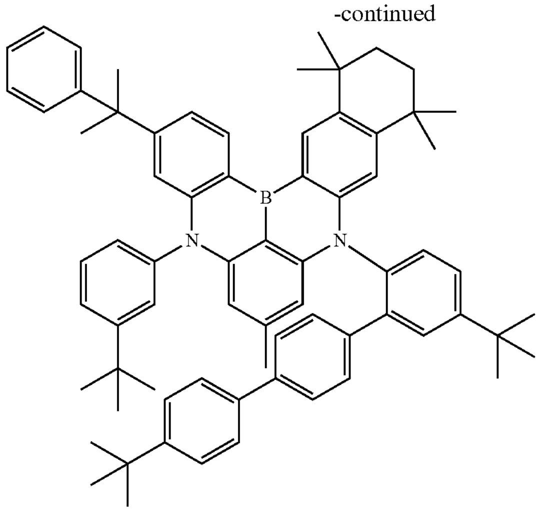
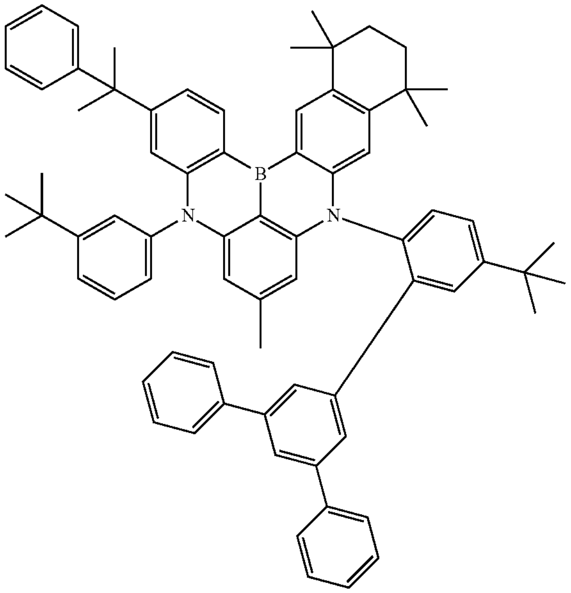
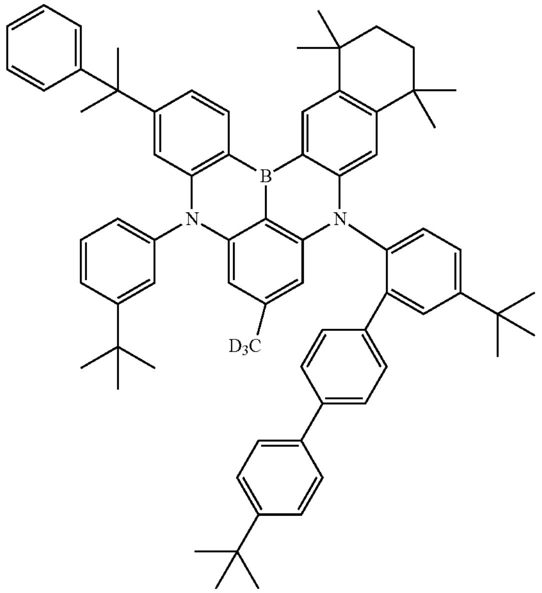

-continued
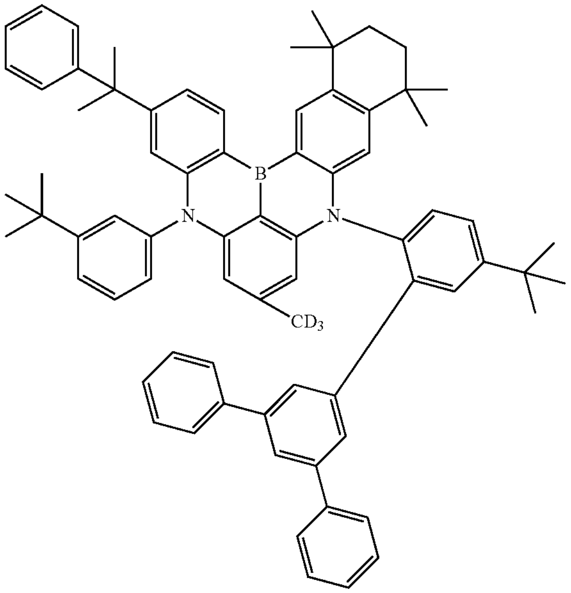 [SMILES: [2H]C([2H])([2H])c1cc2c3c(c1)N(c1ccc(C(C)(C)C)cc1-c1cc(-c4ccccc4)cc(-c4ccccc4)c1)c1cc4c(cc1B3c1ccc(C(C)(C)c3ccccc3)cc1N2c1cccc(C(C)(C)C)c1)C(C)(C)CCC4(C)C]
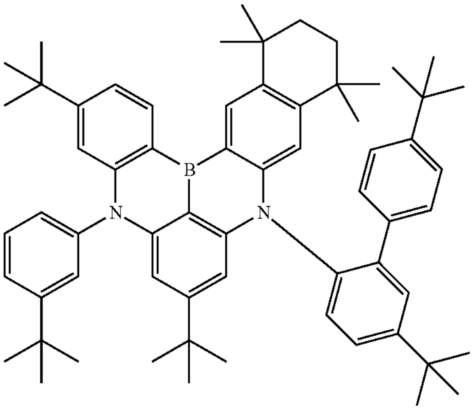
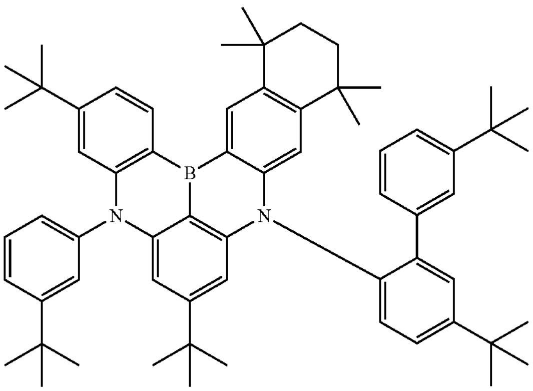

-continued
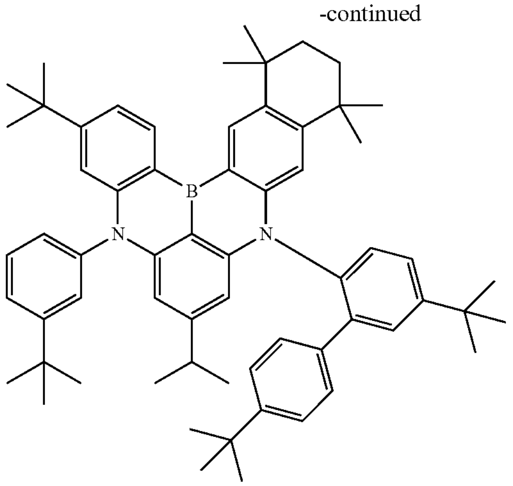
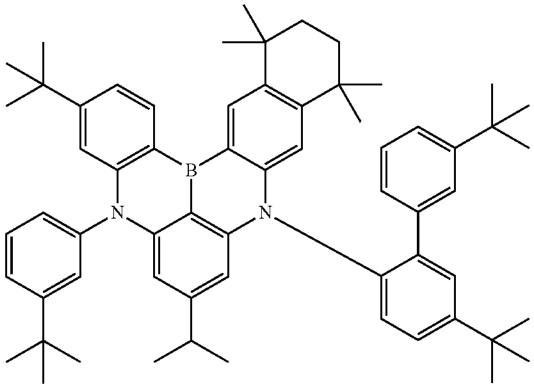
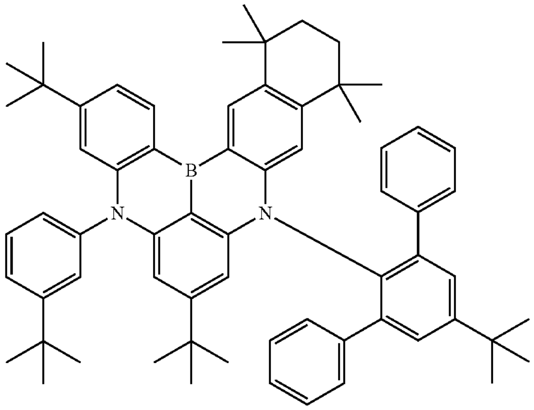
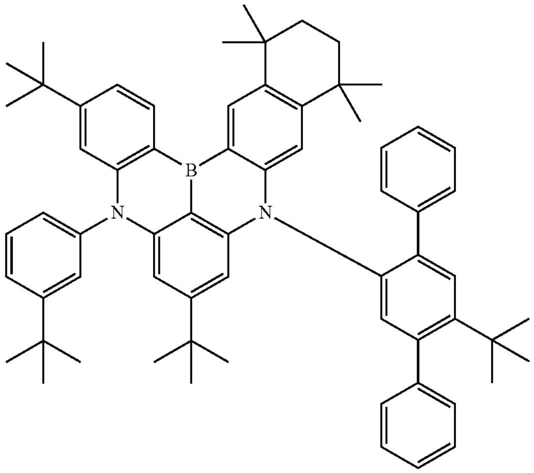

-continued
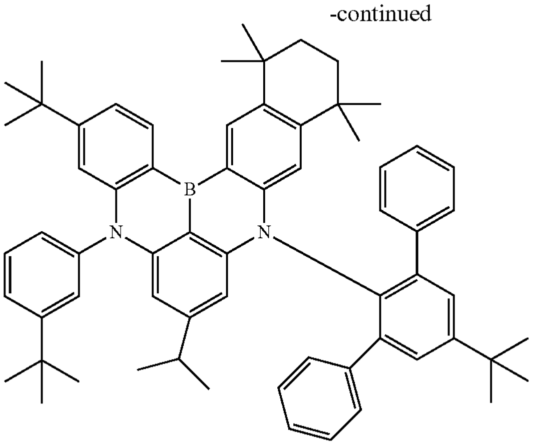
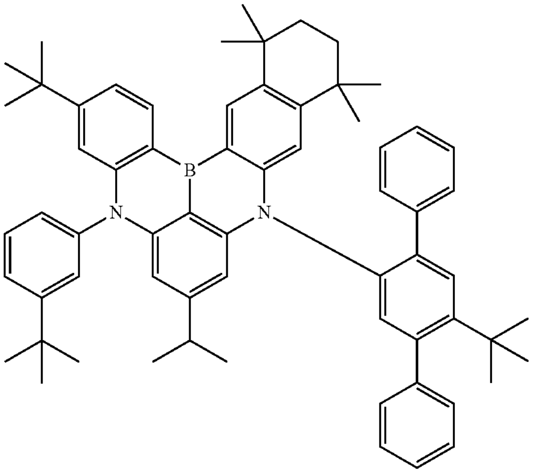
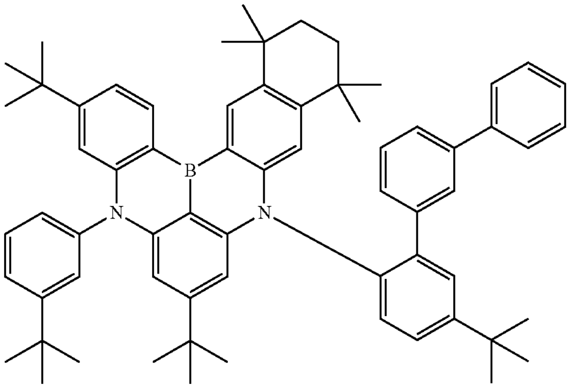
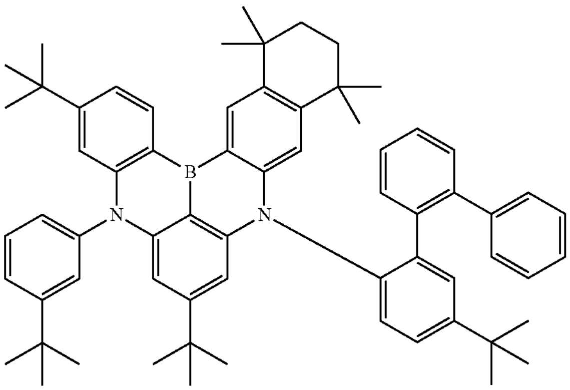

-continued
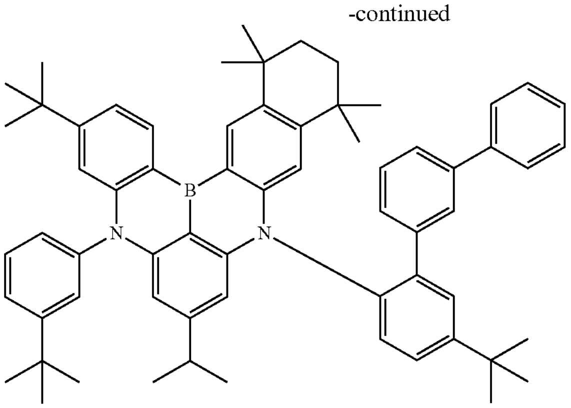
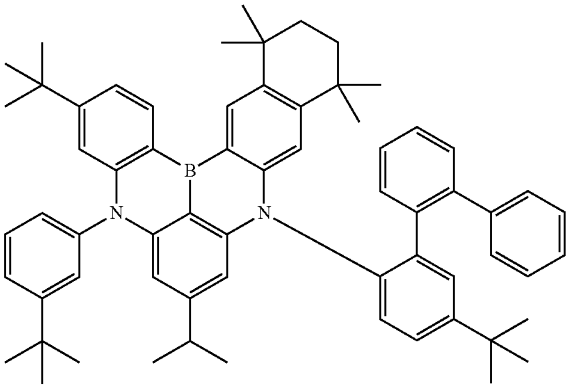
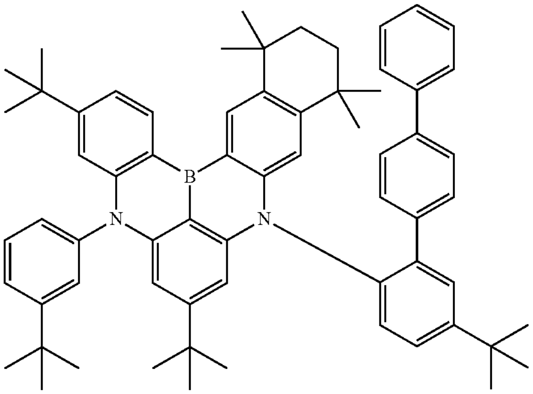
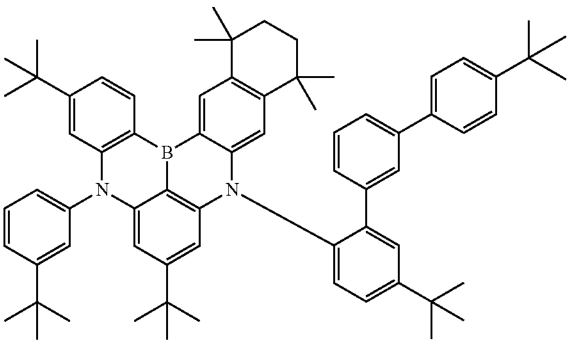

-continued
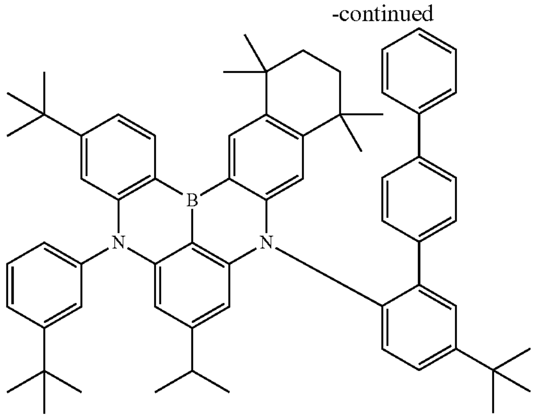
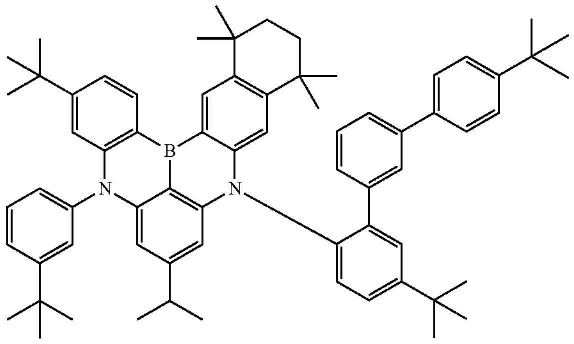
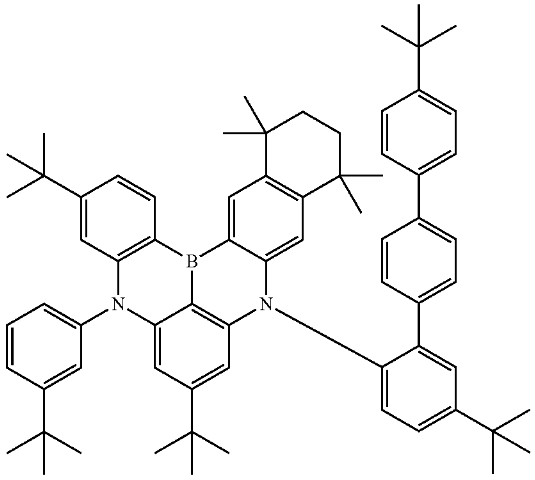

-continued
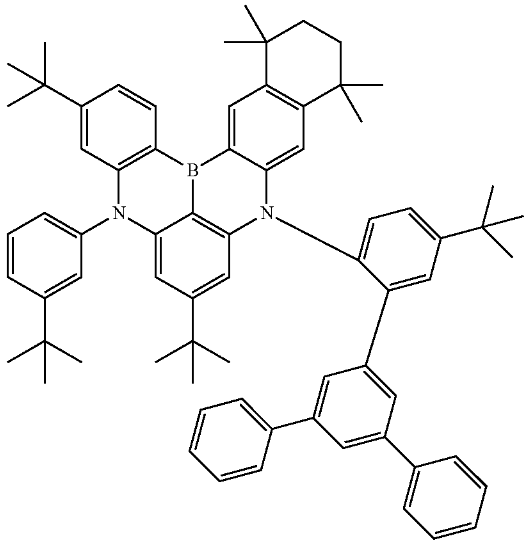
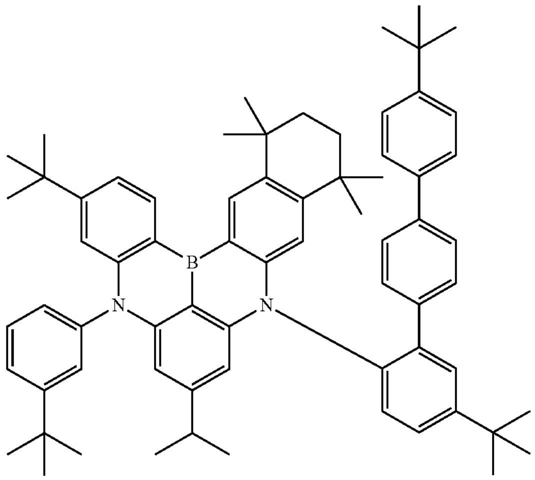
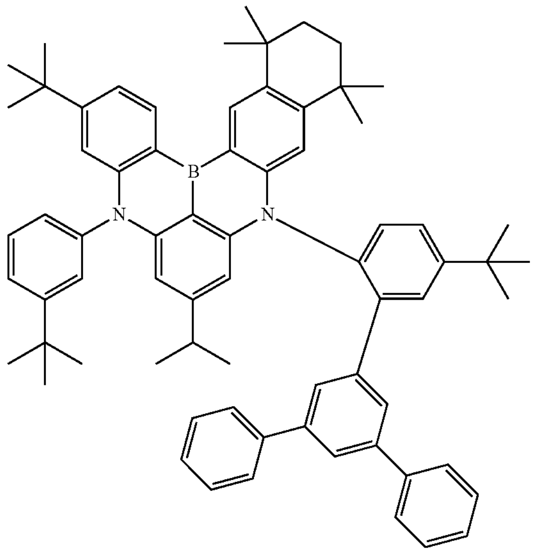

-continued
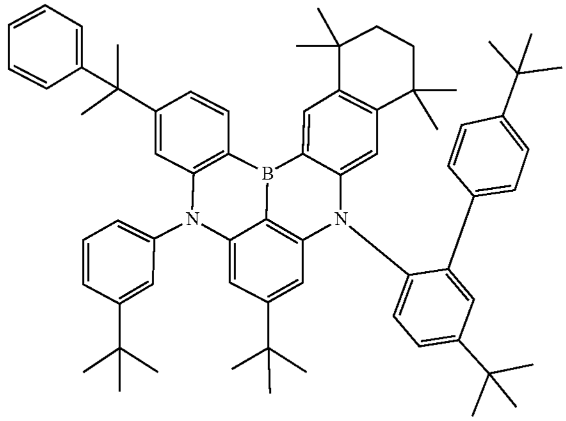
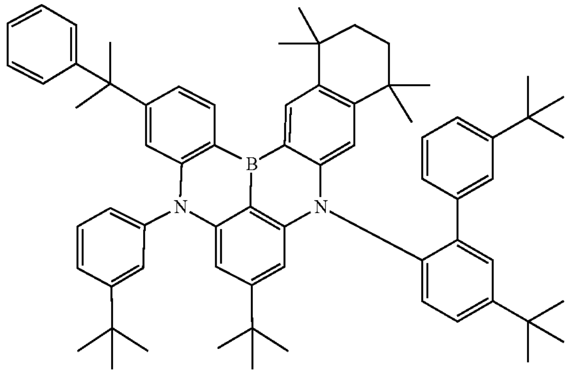
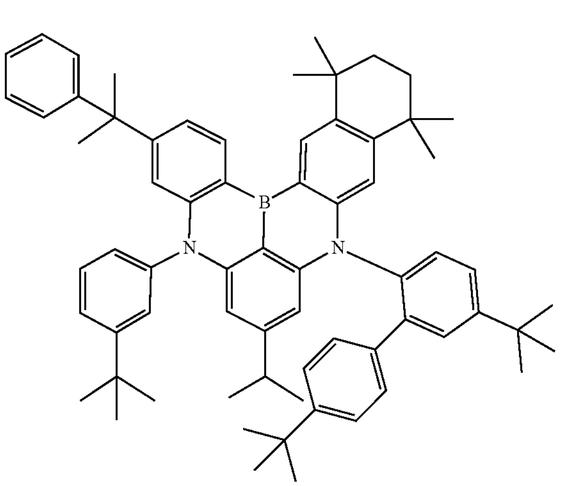
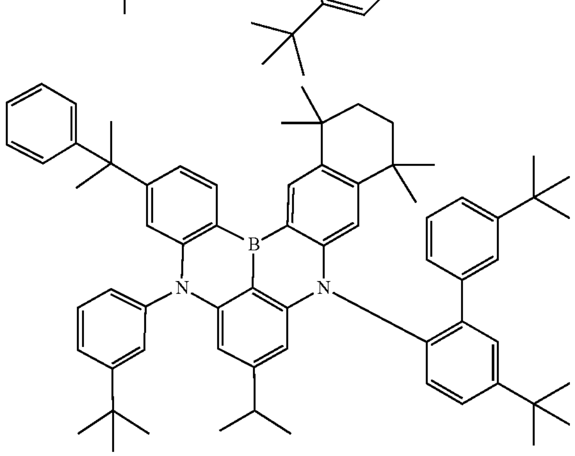
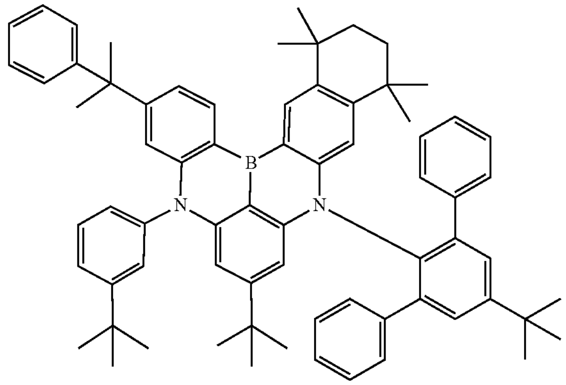
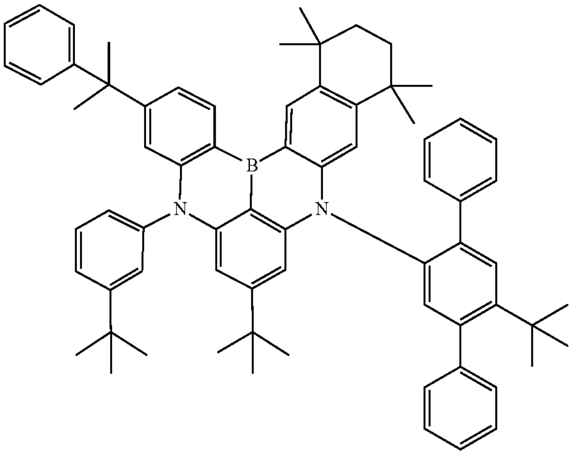
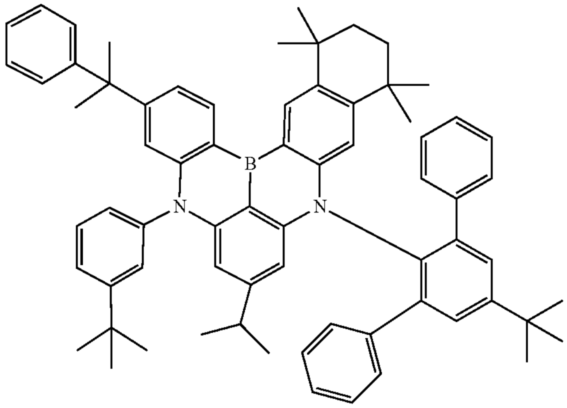
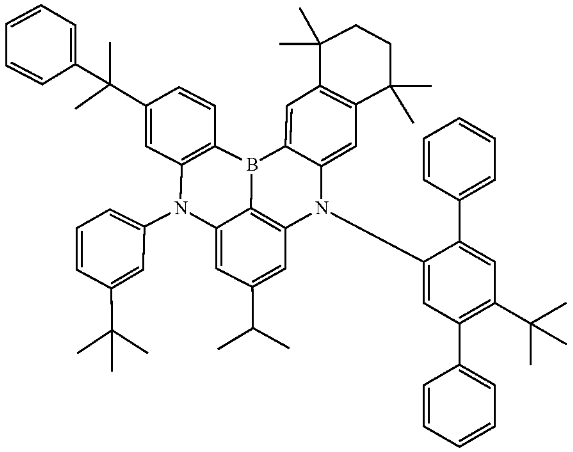

-continued
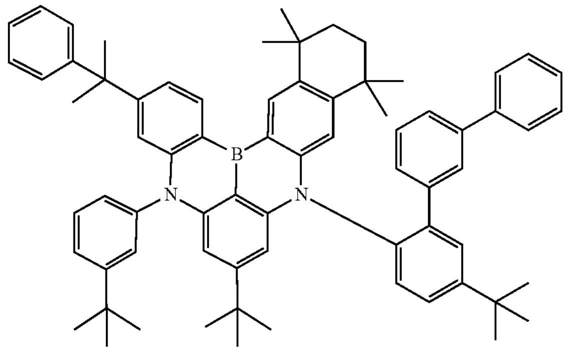
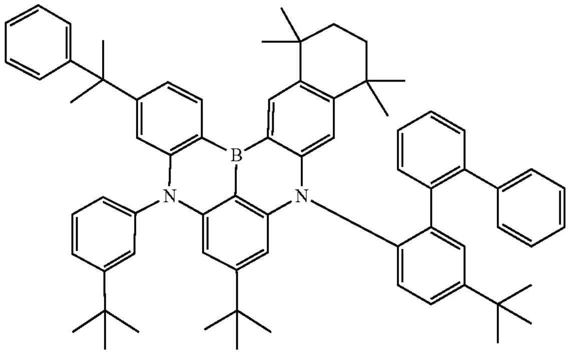
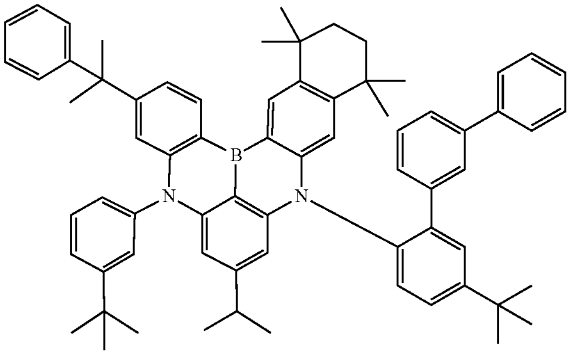
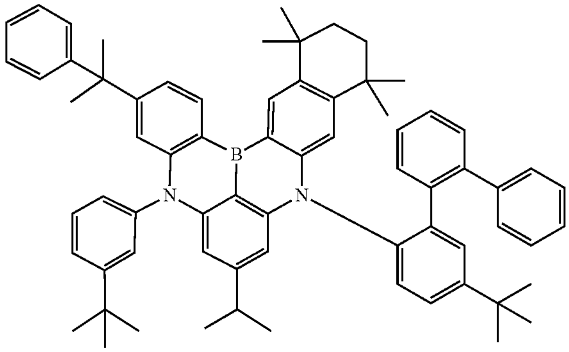
-continued
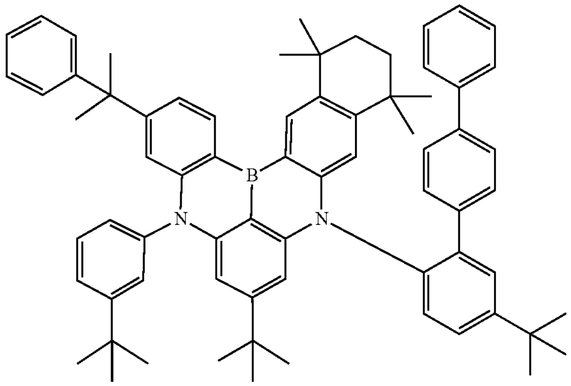
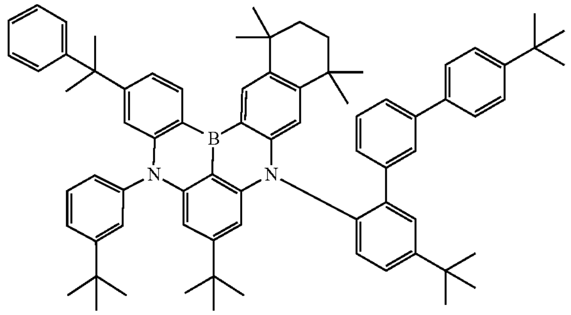
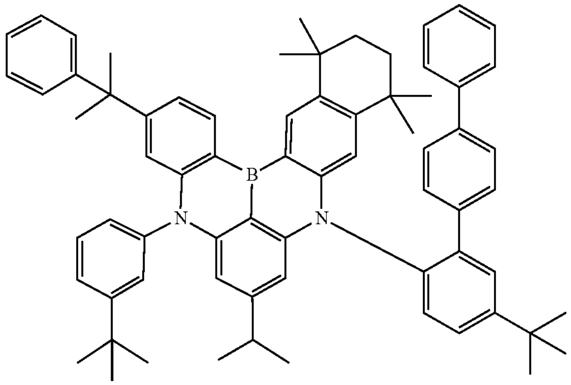
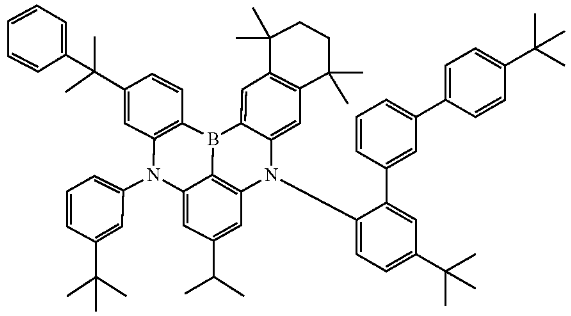

-continued
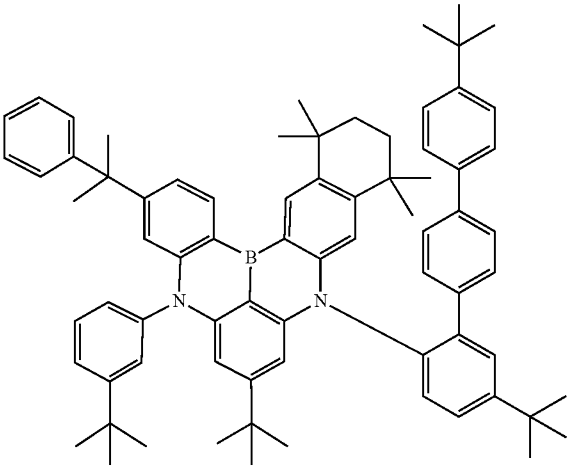
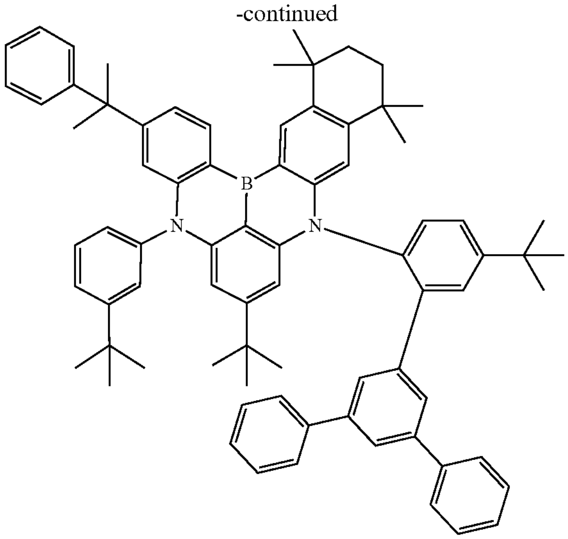
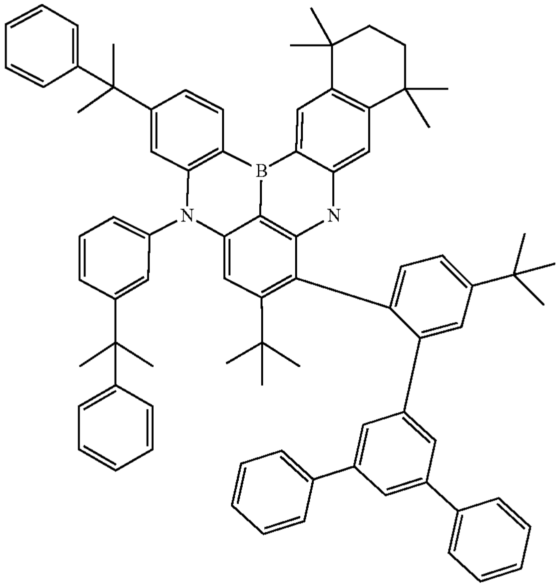
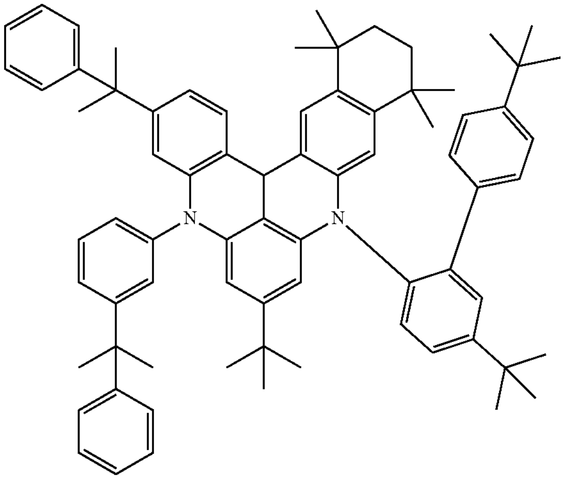
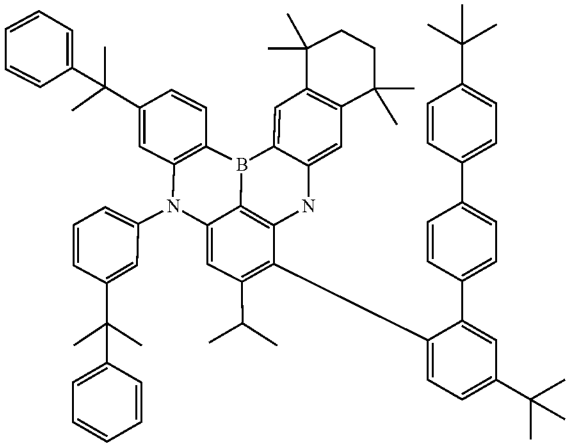
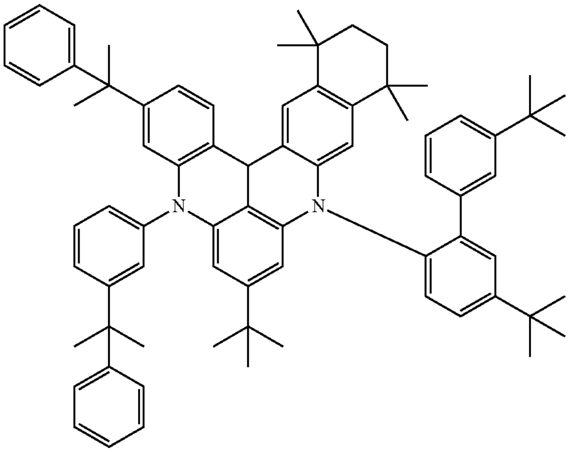
-continued -continued
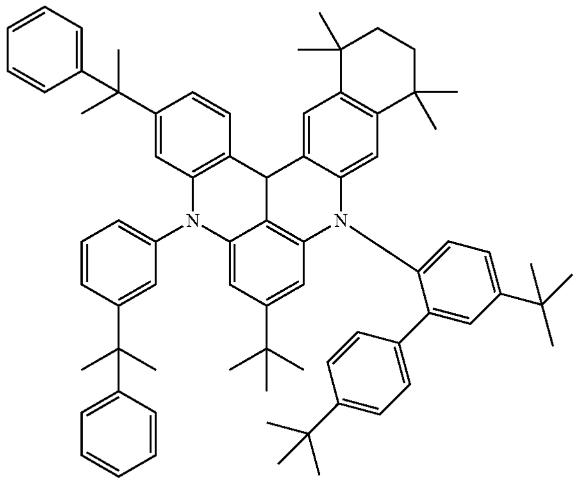
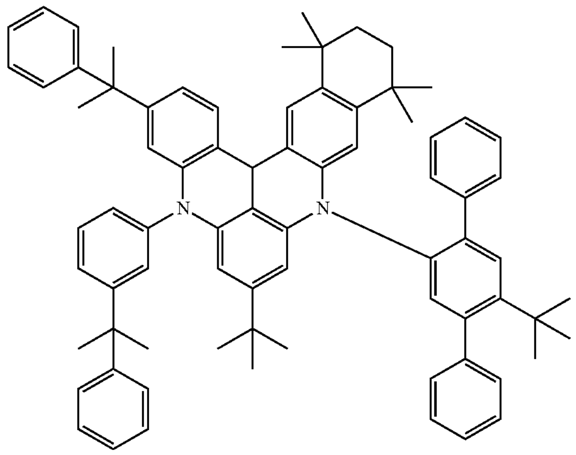
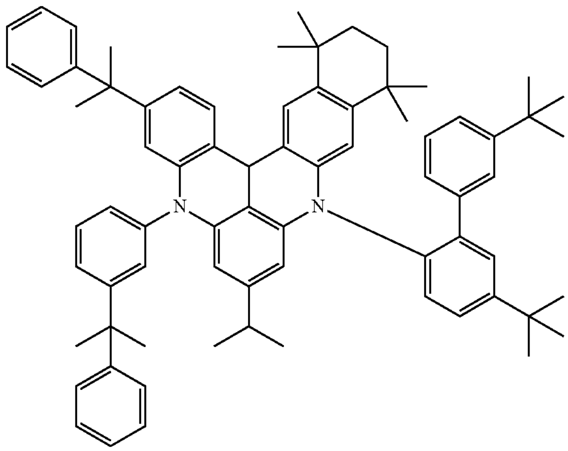
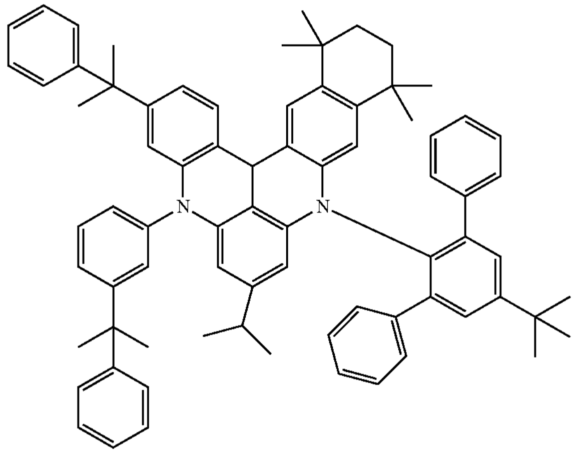
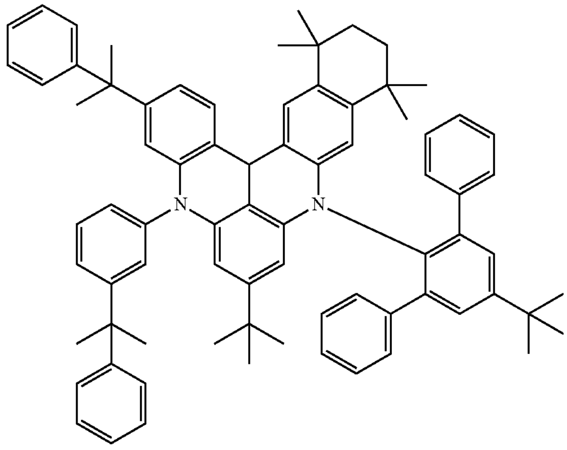
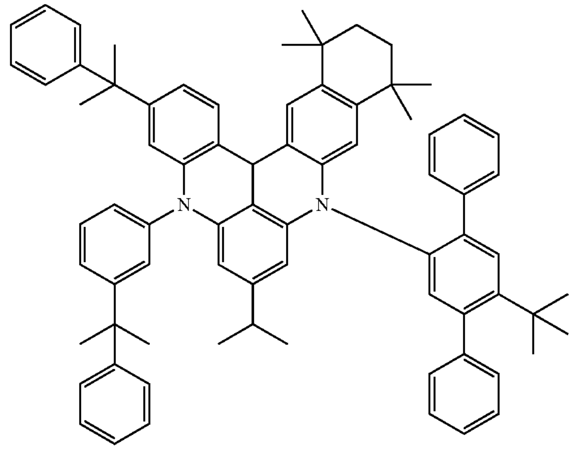
-continued -continued
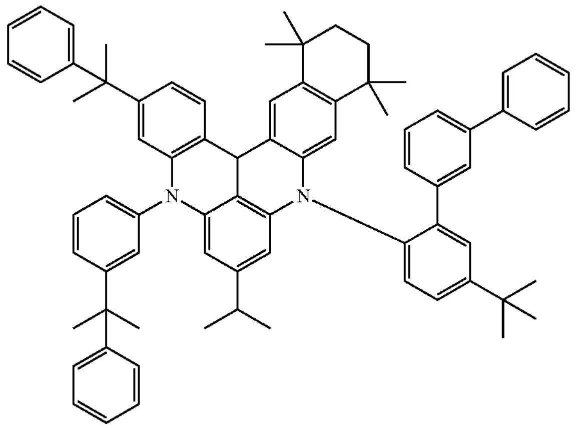
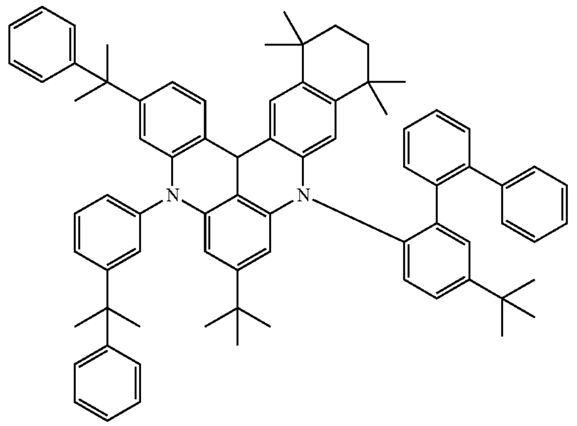
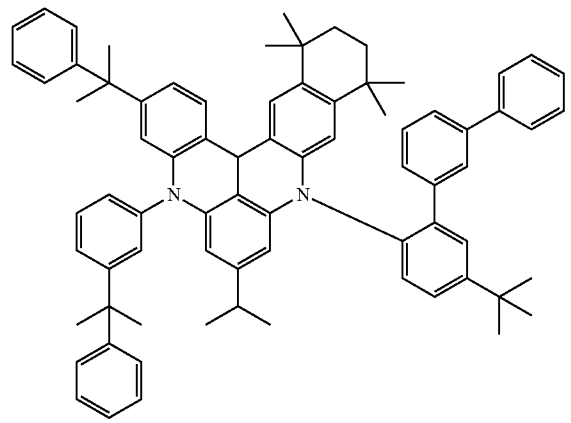
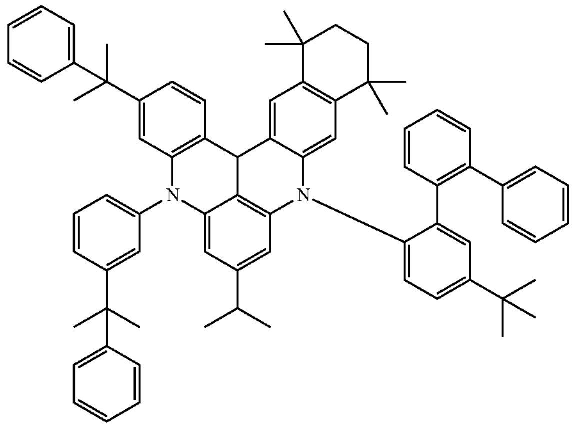
-continued
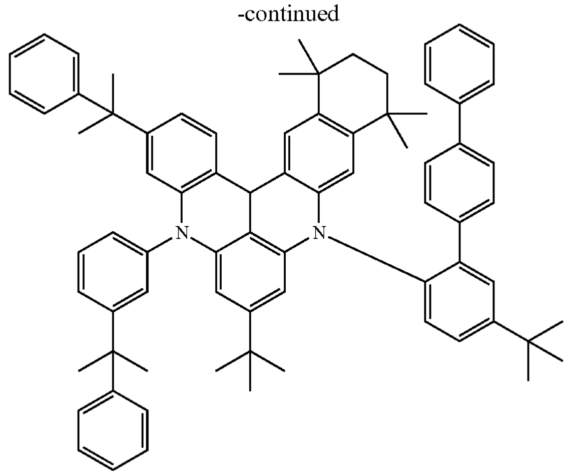
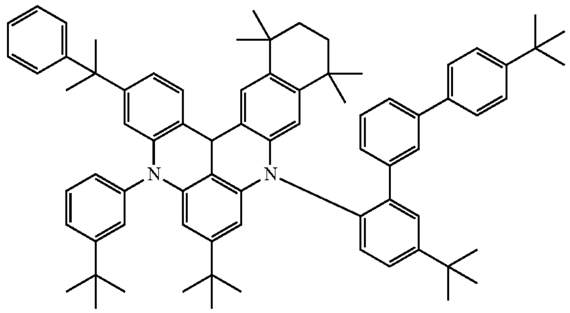
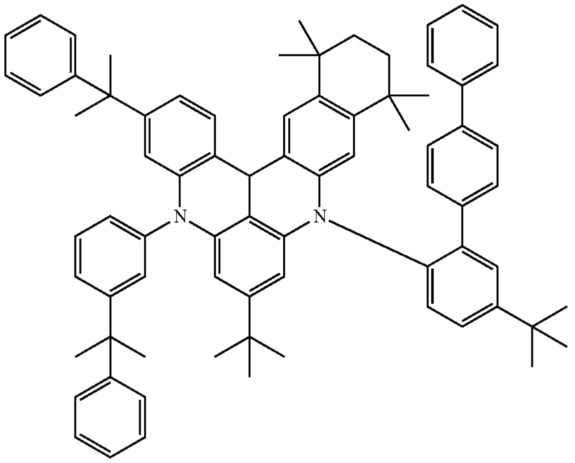
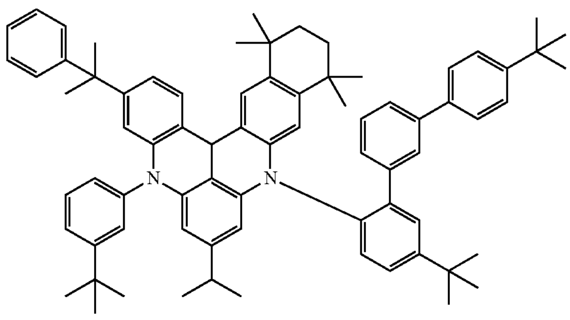

-continued
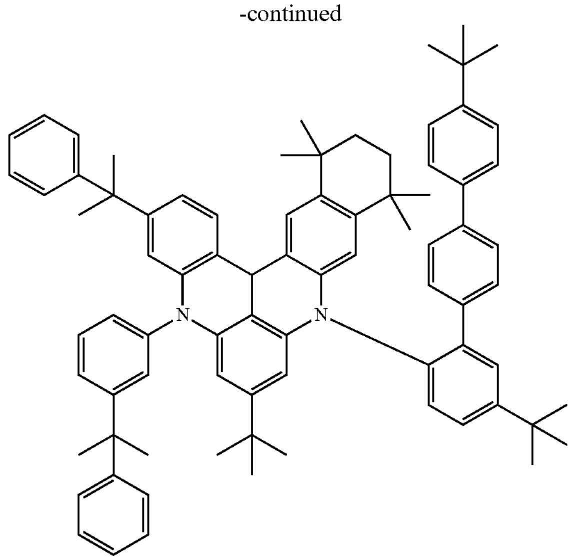
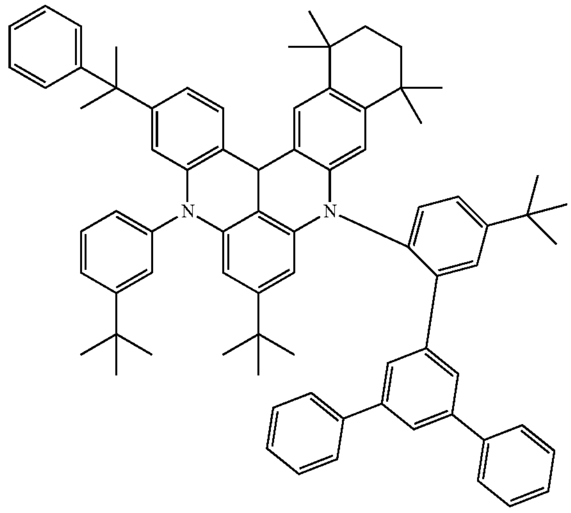
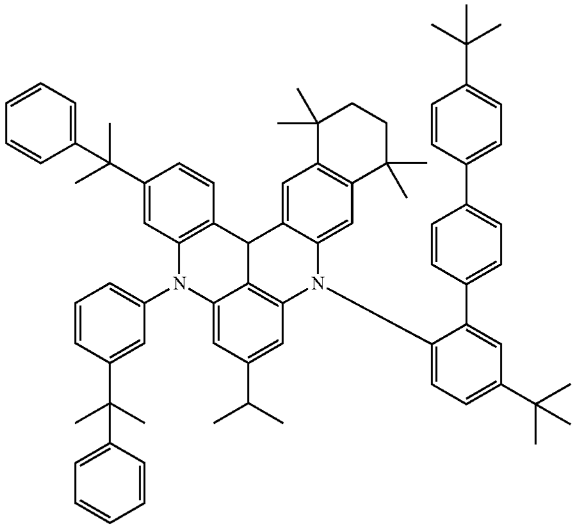
-continued
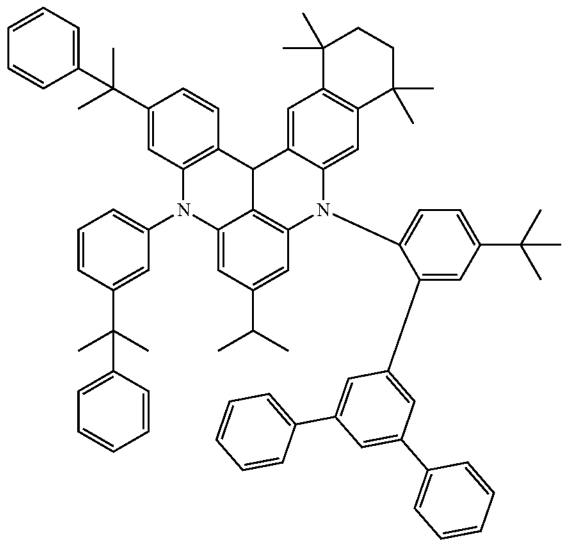
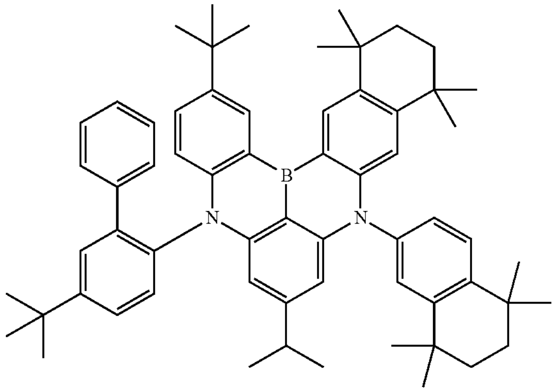
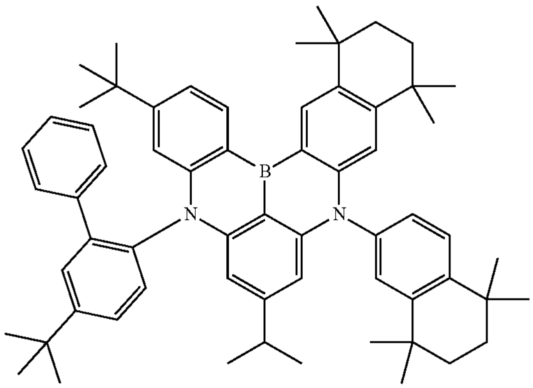

-continued
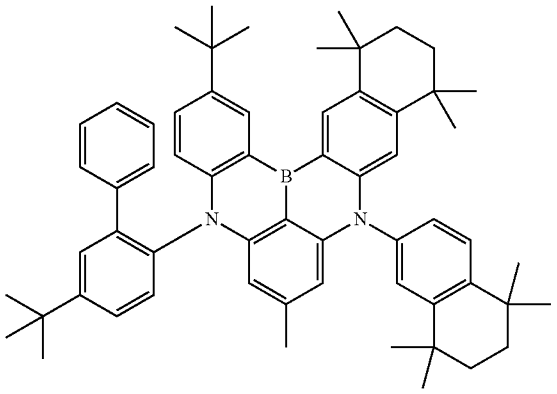
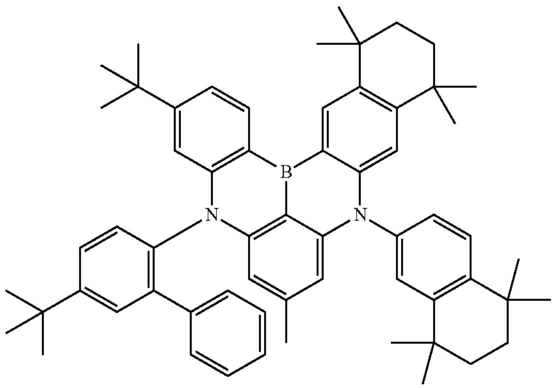
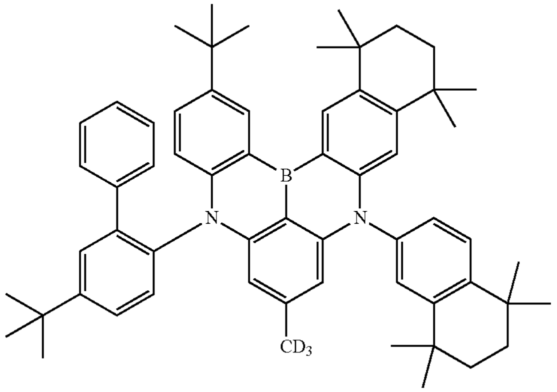
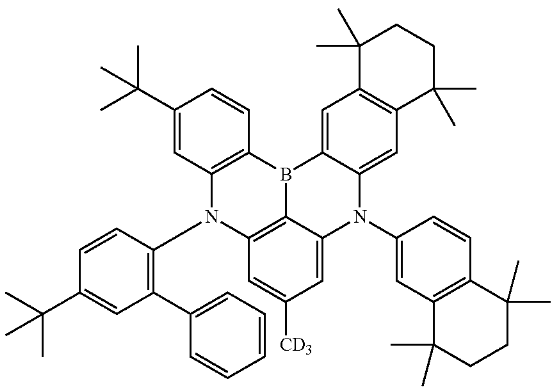
-continued
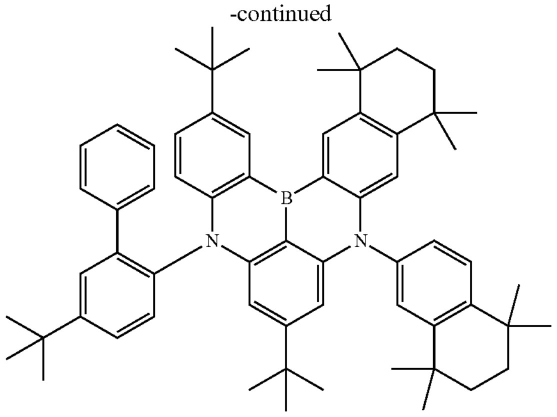
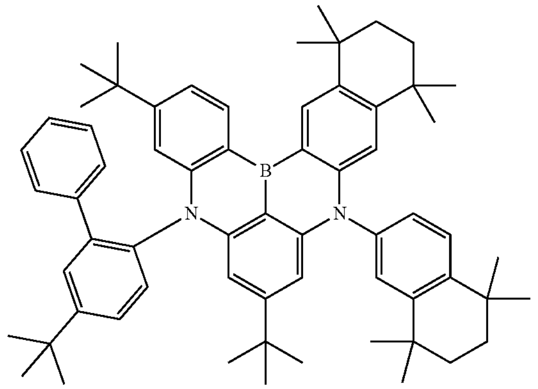
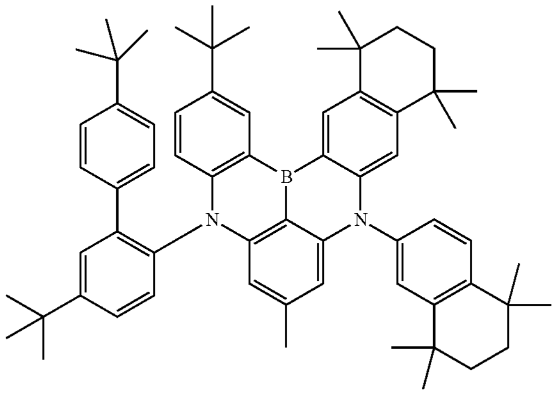
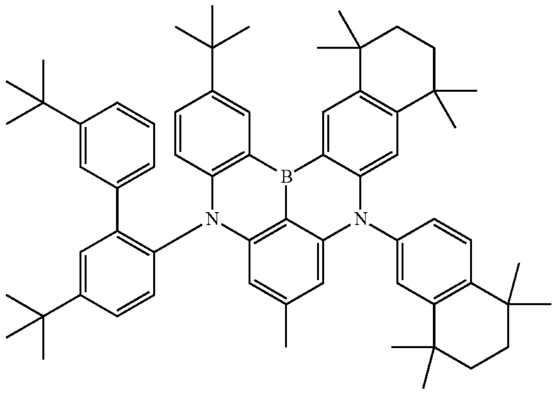

-continued
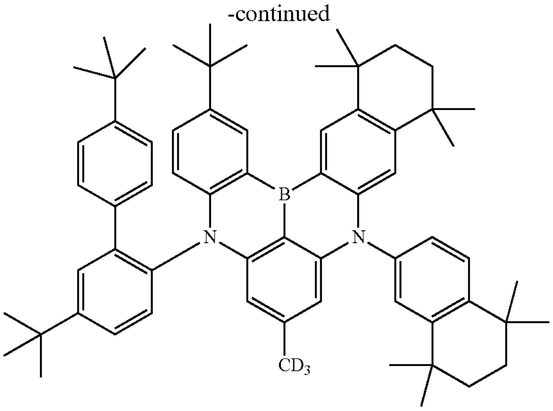
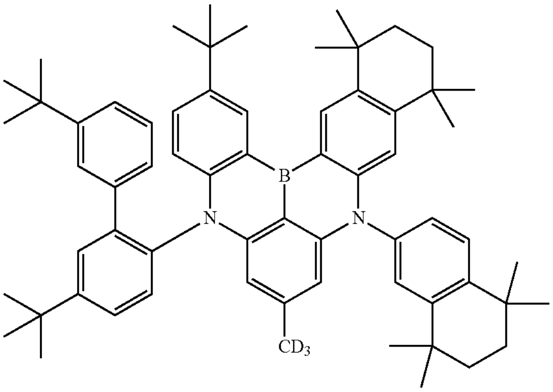
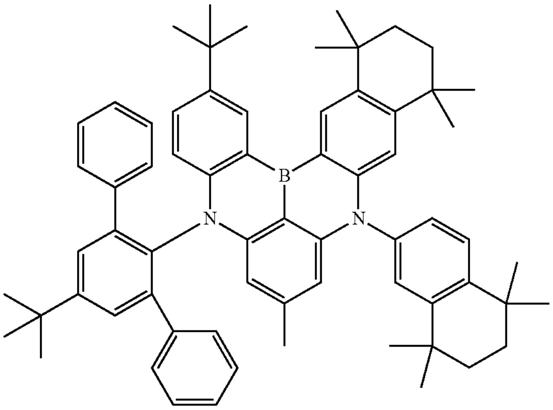
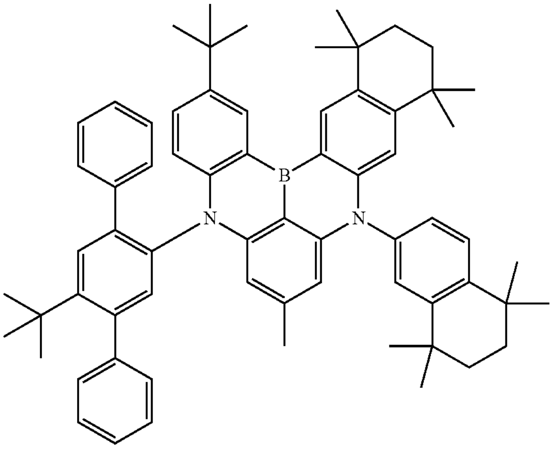
-continued
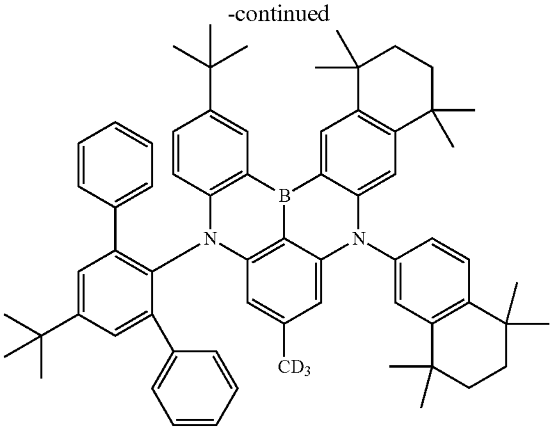
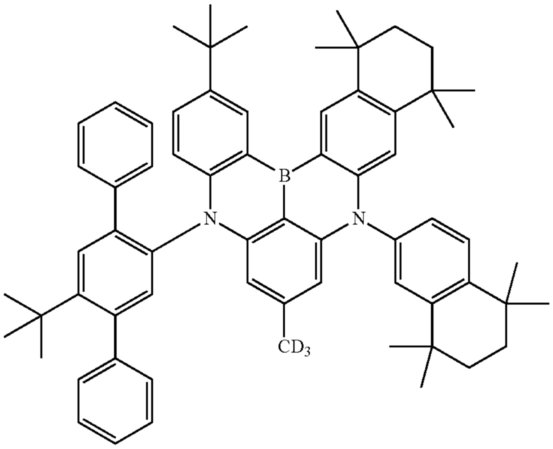
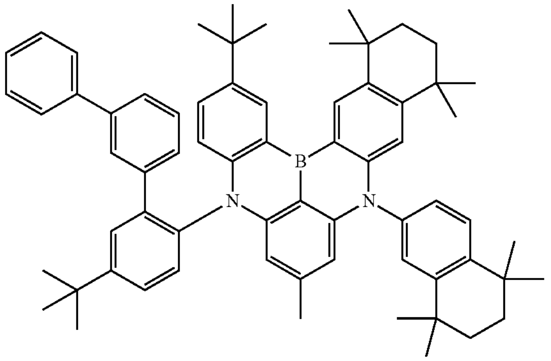
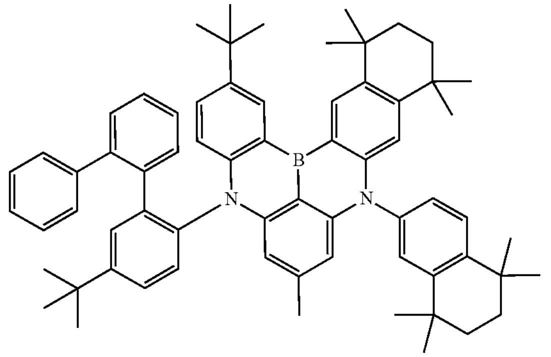

-continued
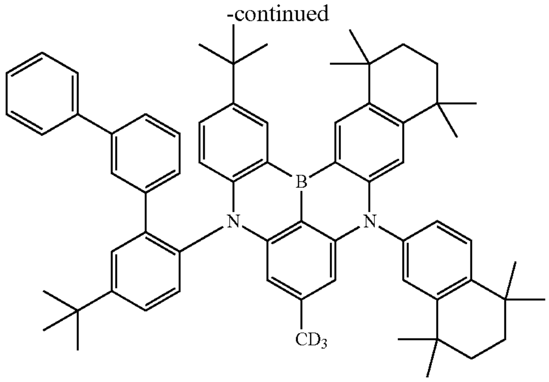
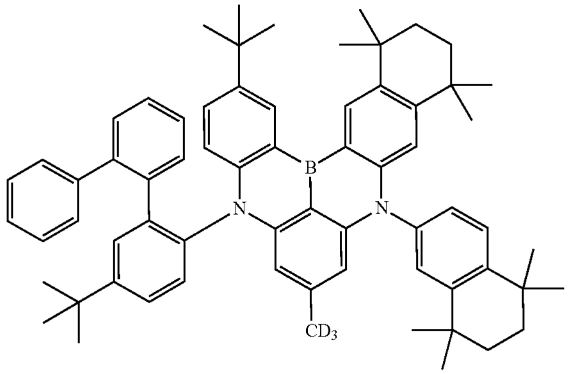 [SMILES: [2H]C([2H])([2H])c1cc2c3c(c1)N(c1ccc(C(C)(C)C)cc1-c1ccccc1-c1ccccc1)c1ccc(C(C)(C)C)cc1B3c1cc3c(cc1N2c1ccc2c(c1)C(C)(C)CCC2(C)C)C(C)(C)CCC3(C)C]
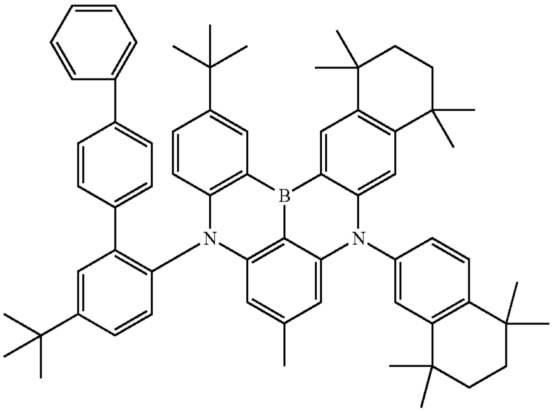
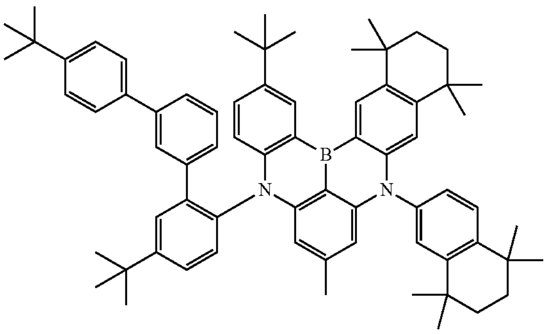
-continued
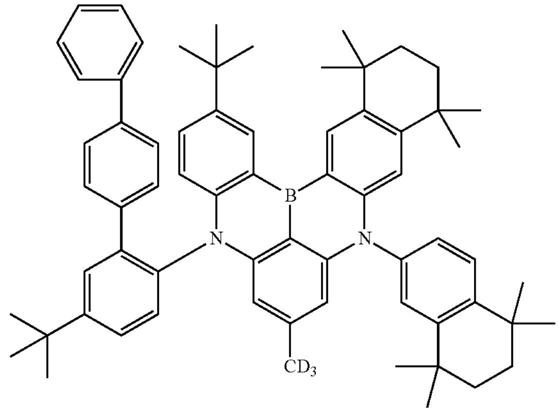
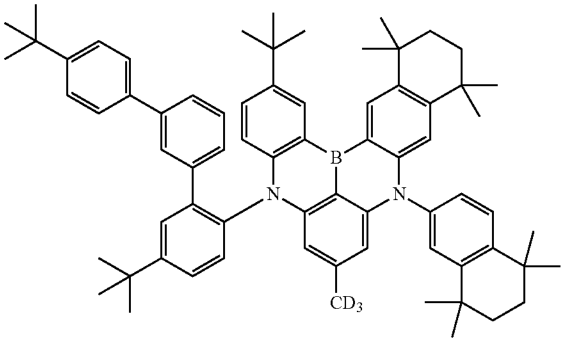
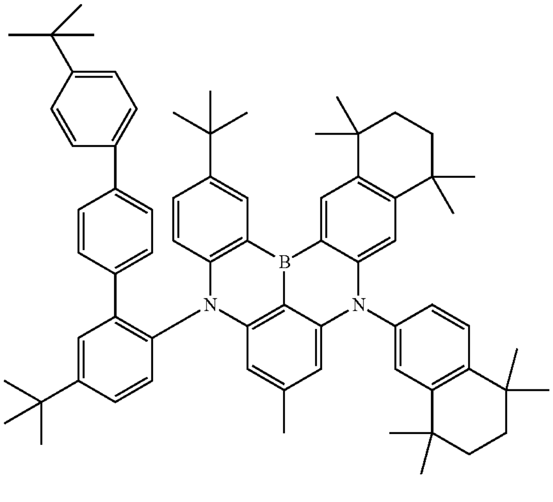
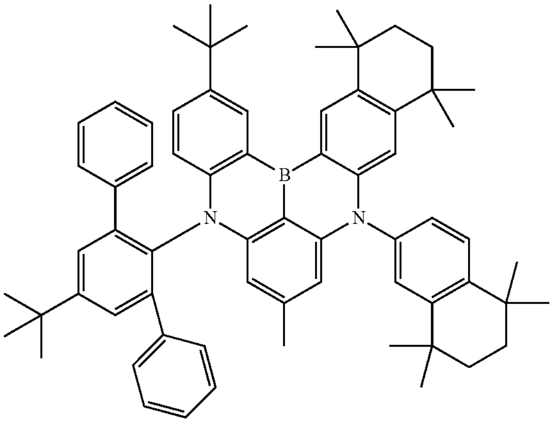

-continued
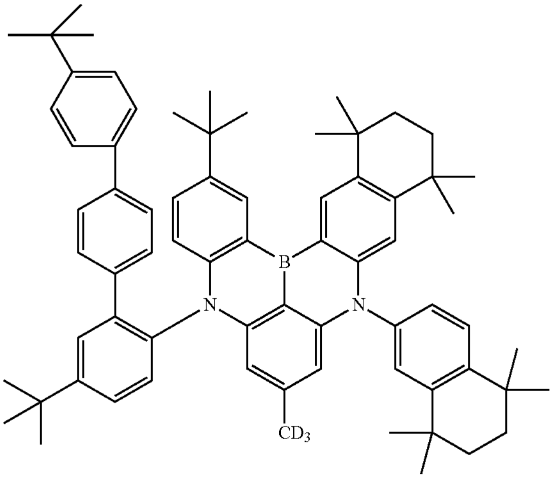
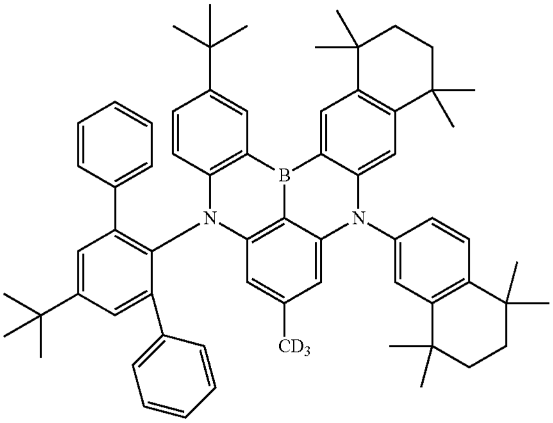
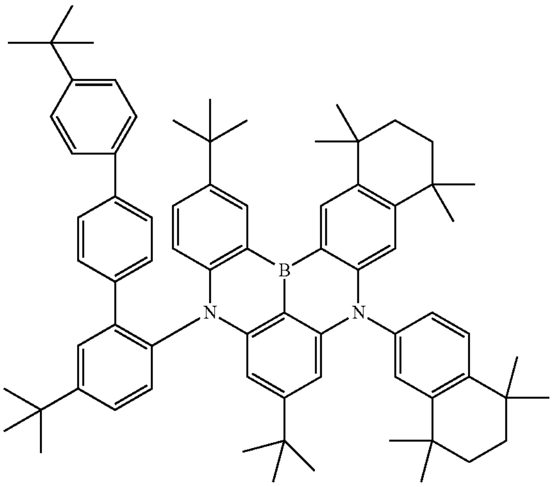
-continued
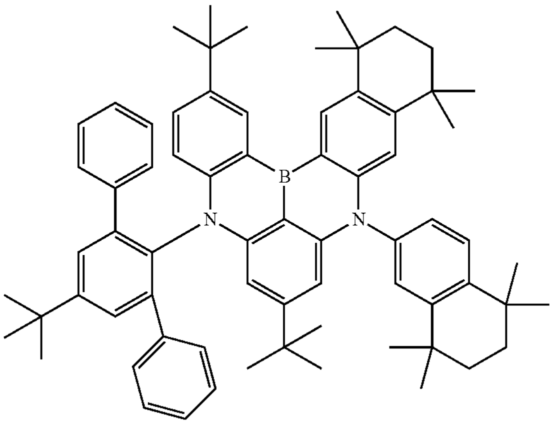
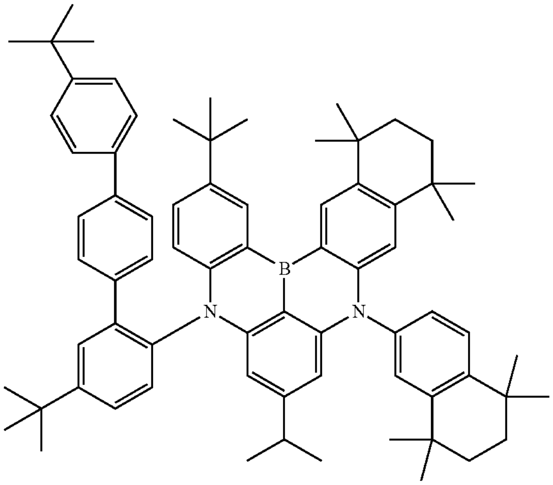
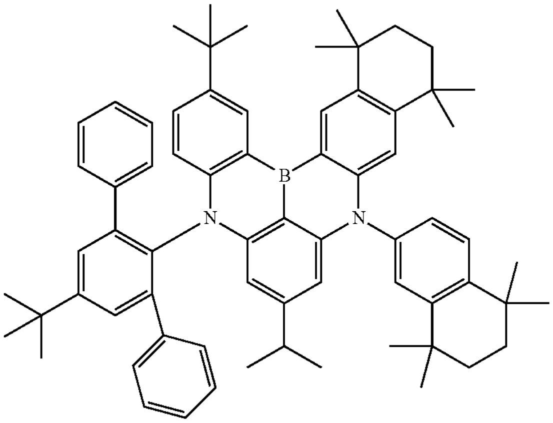
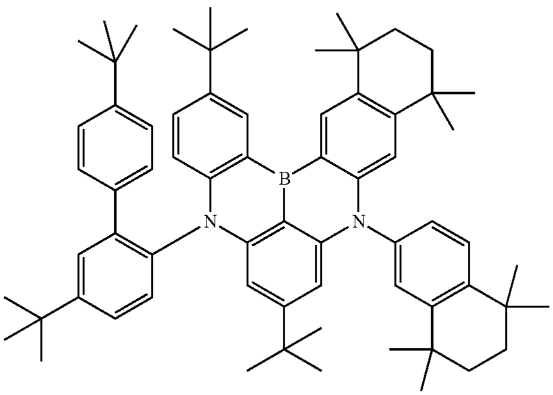

-continued
-continued
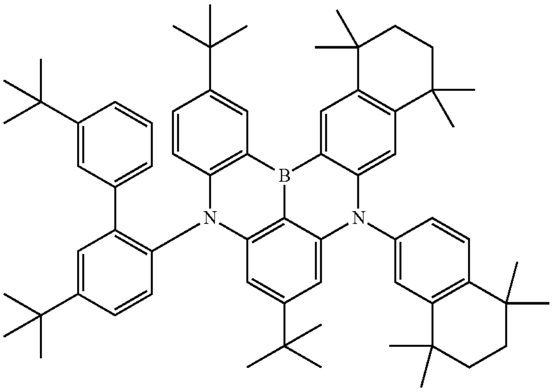
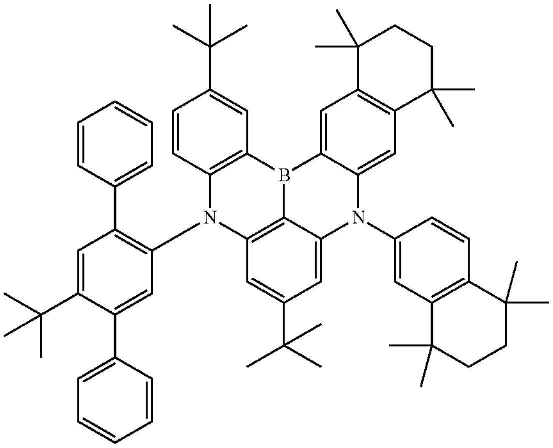
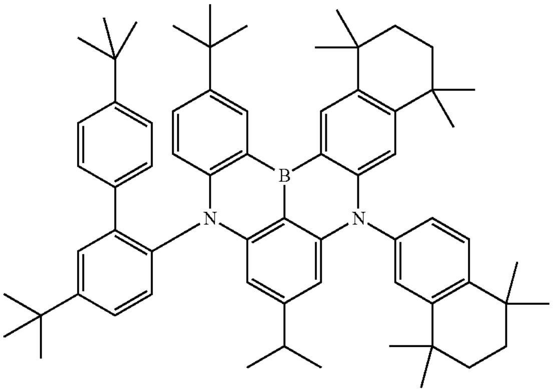
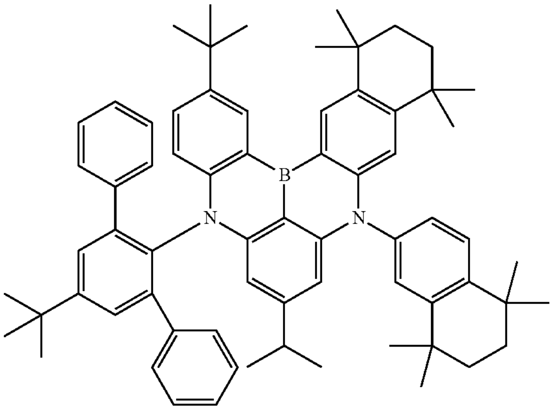
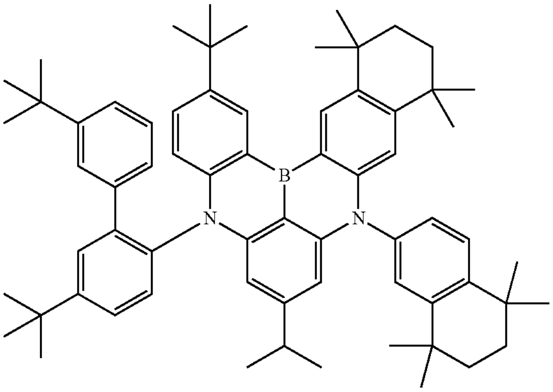
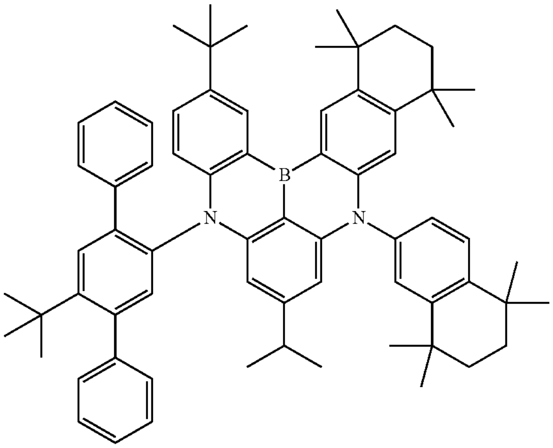
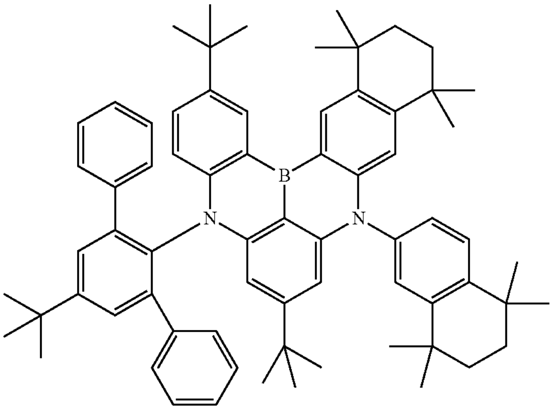
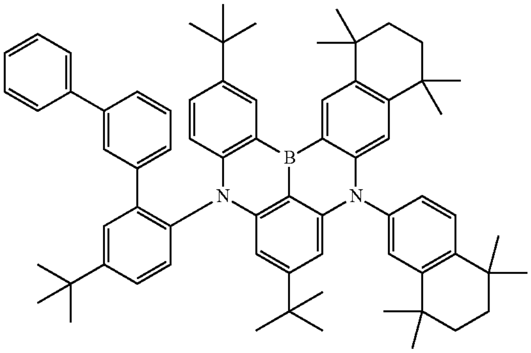

-continued
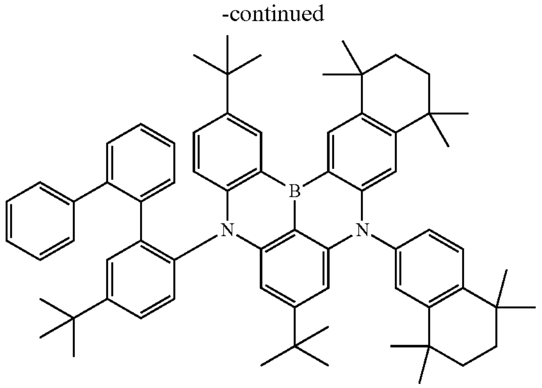
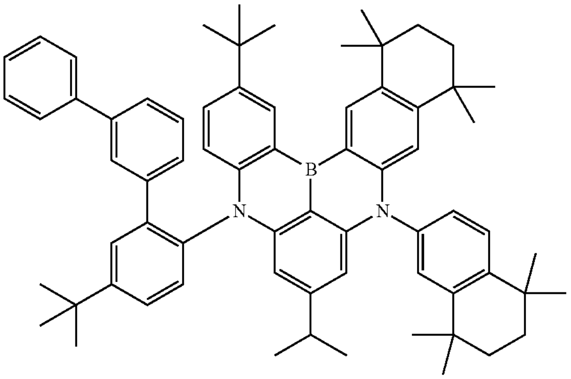
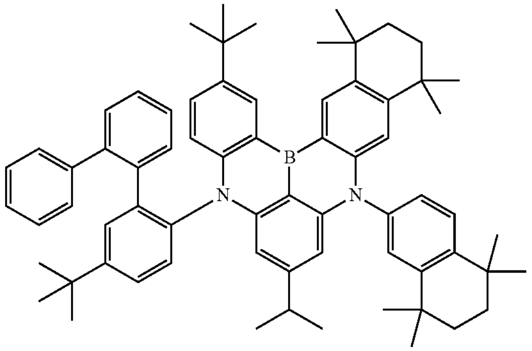
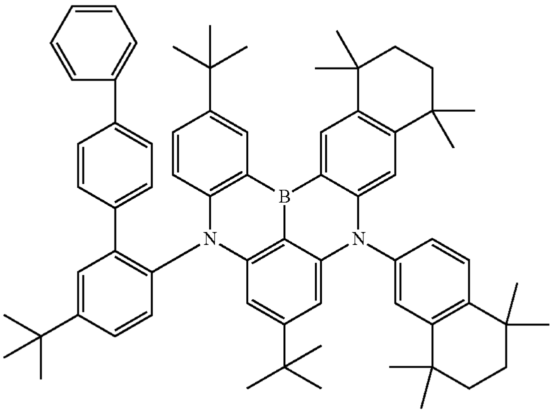
-continued
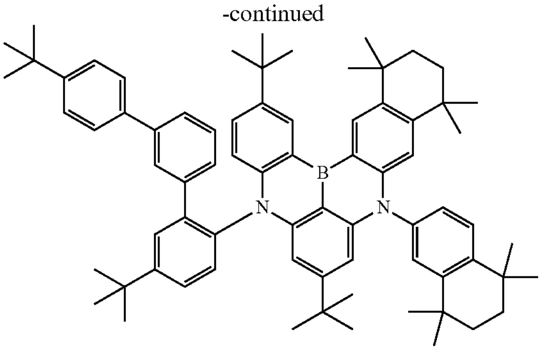
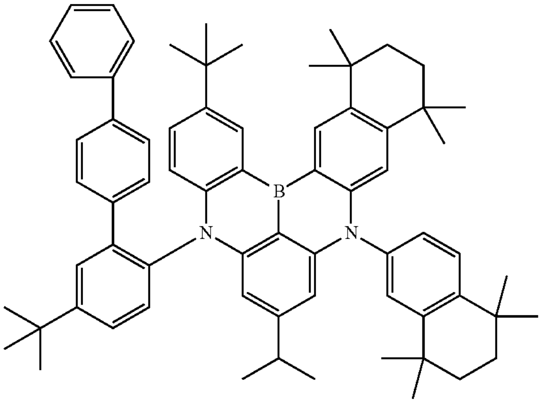
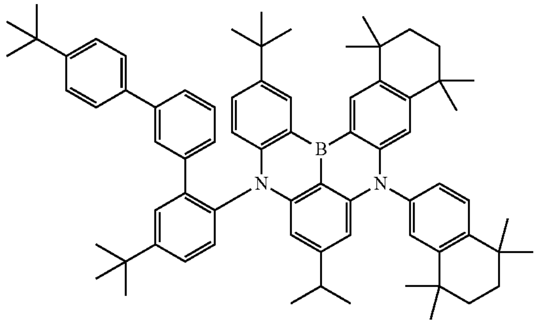
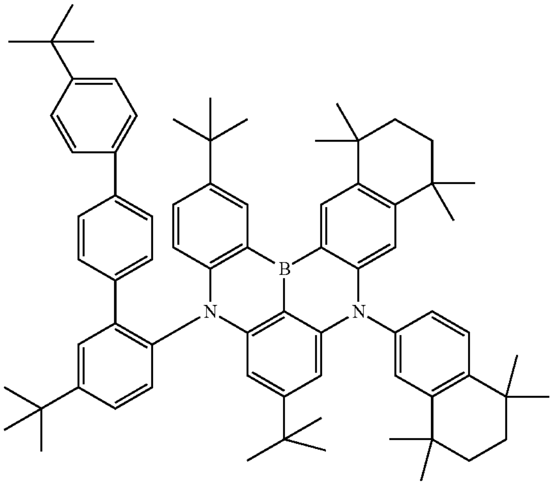

-continued
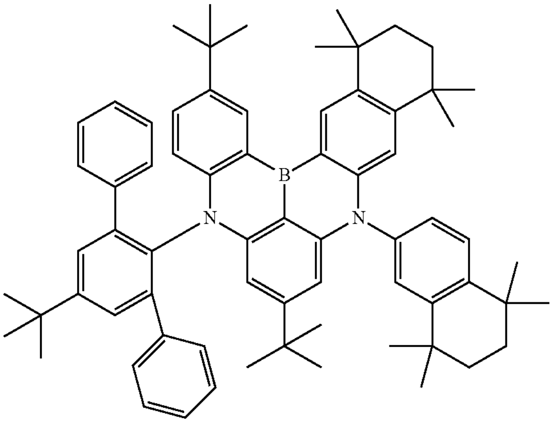
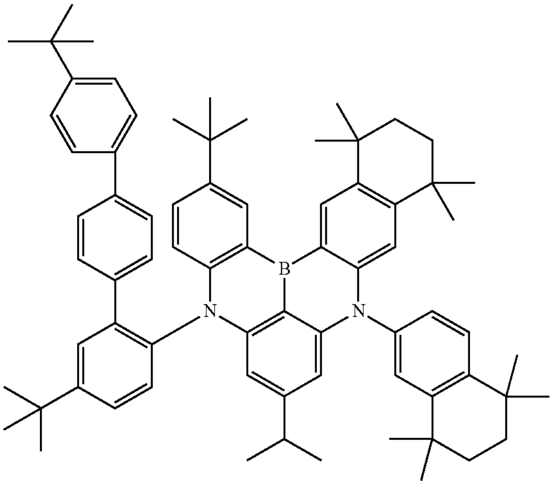
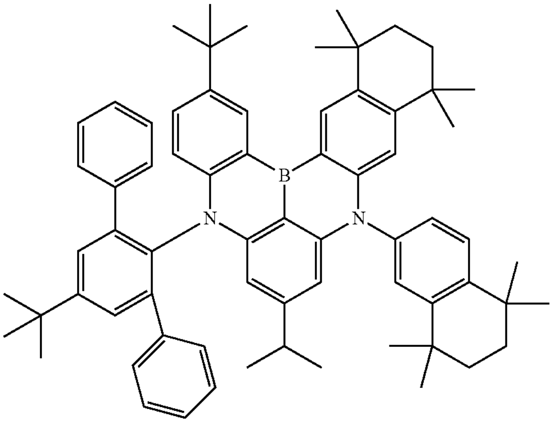
-continued
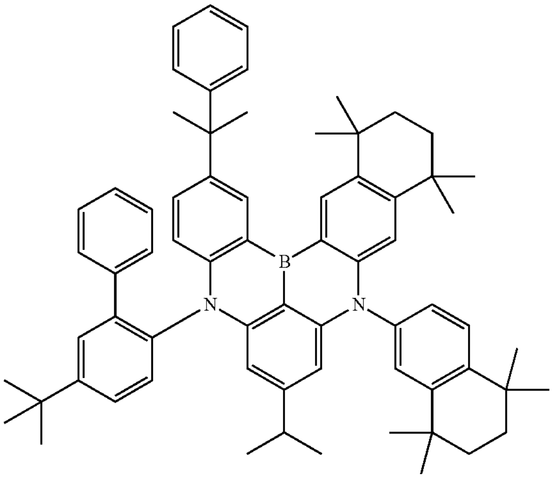
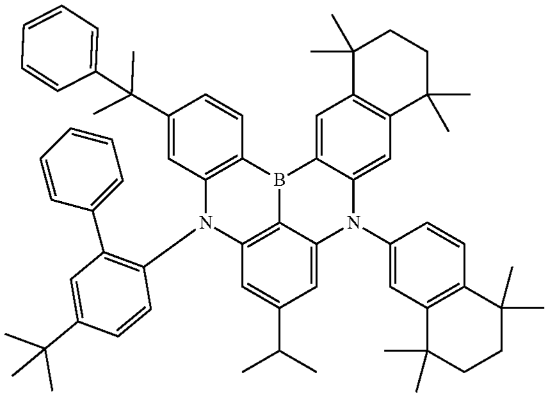
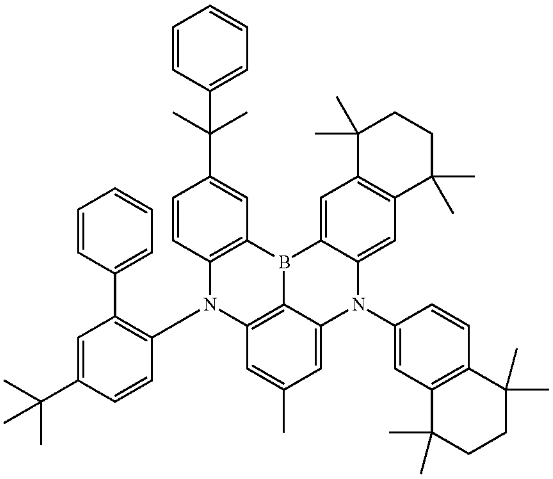

-continued
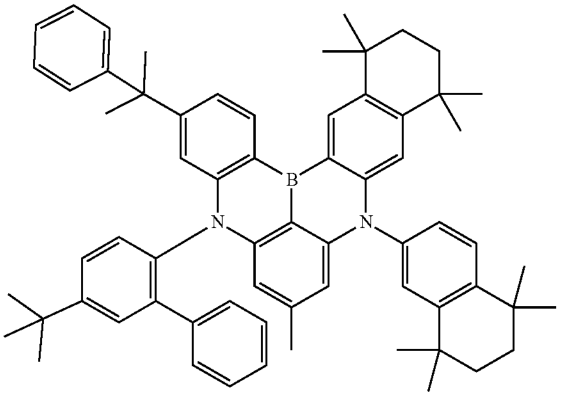
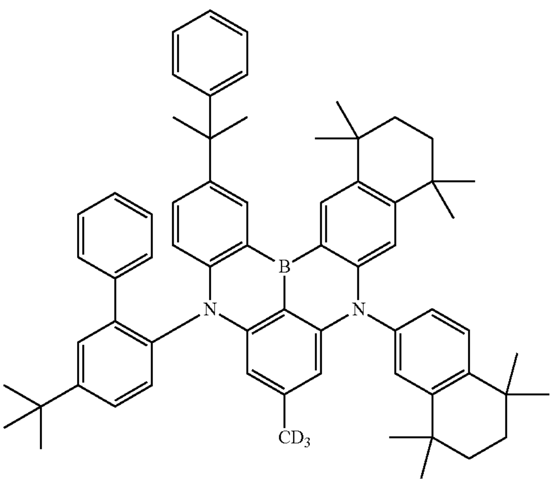
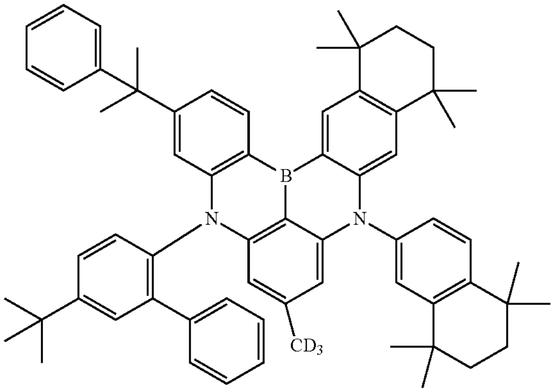
-continued
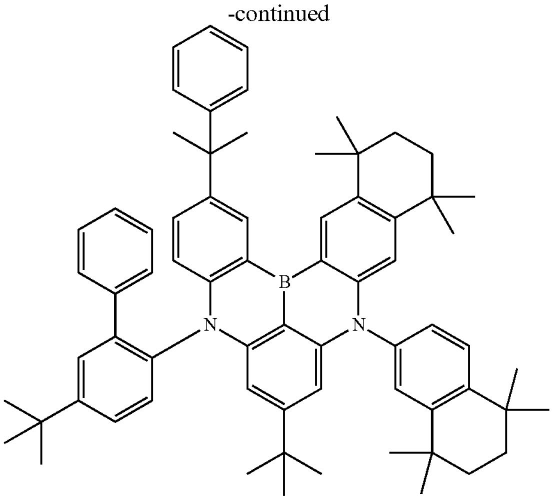
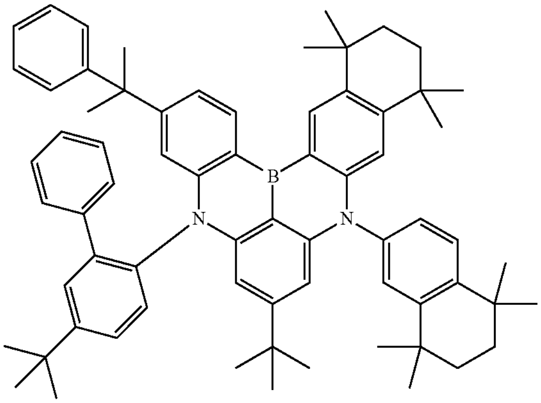
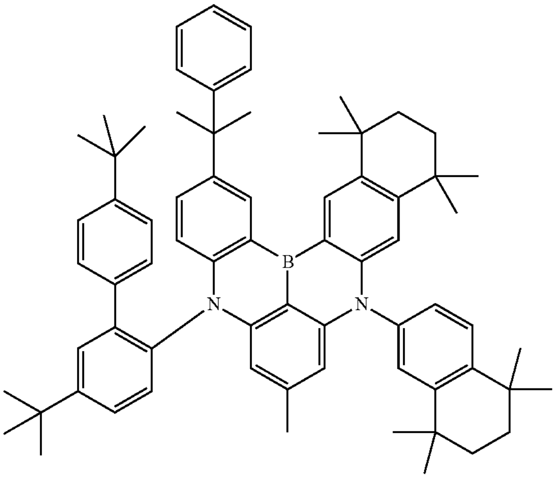

-continued
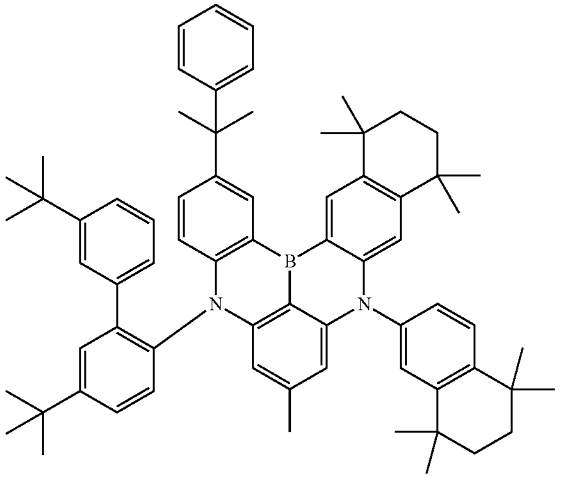
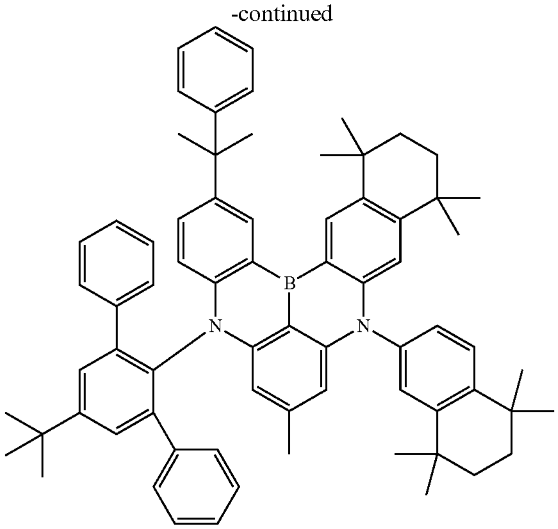
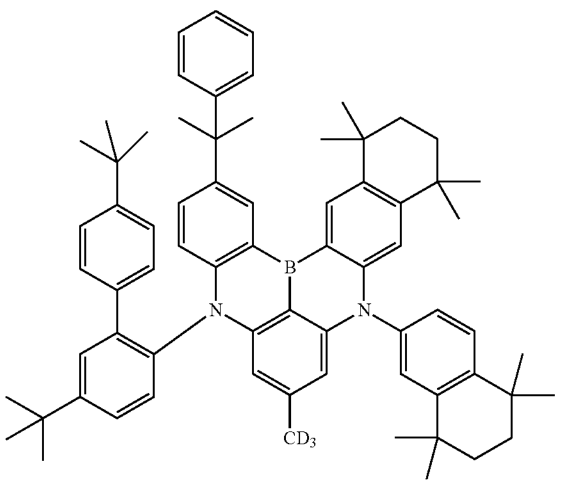
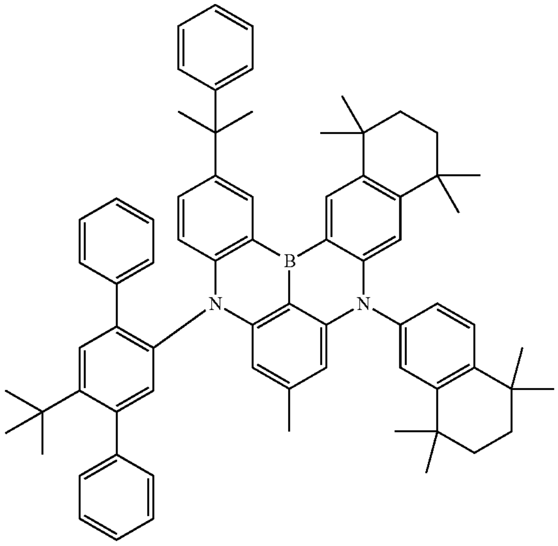
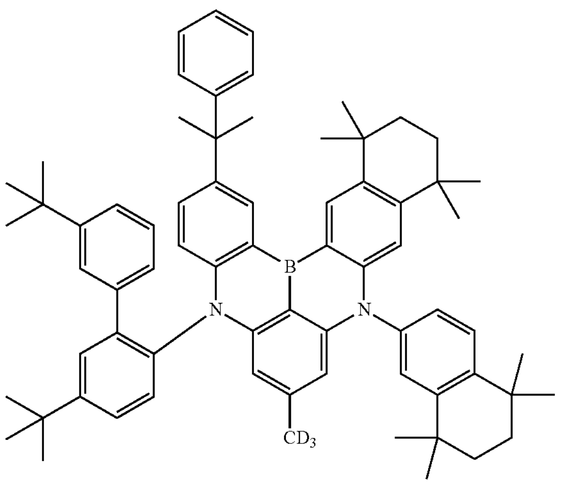
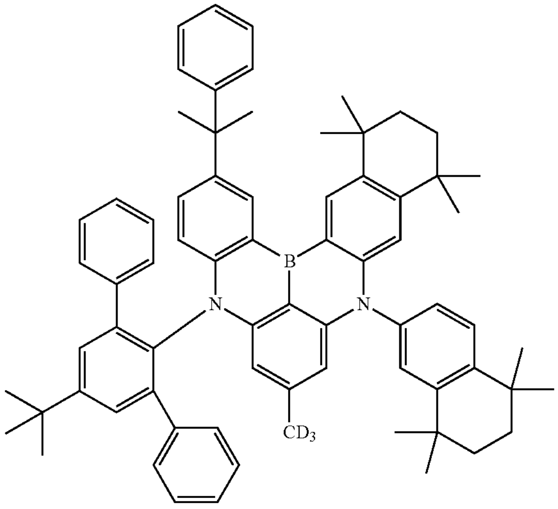
CD3

-continued
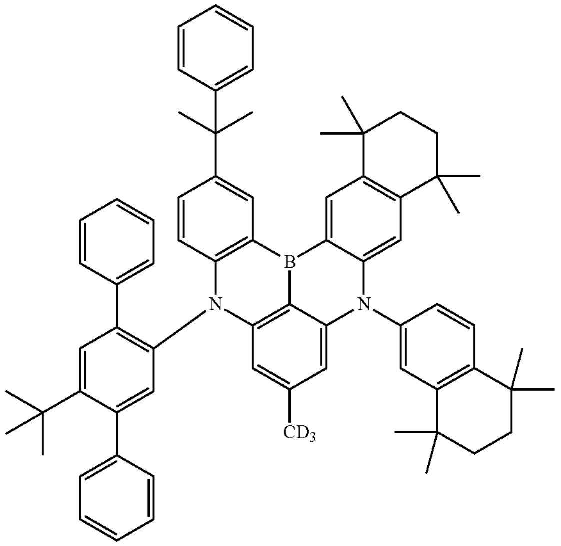
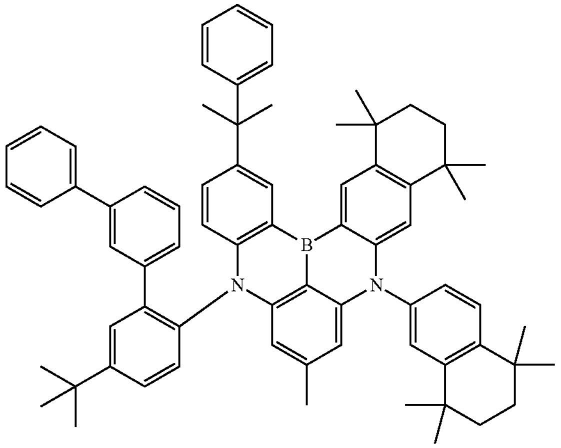
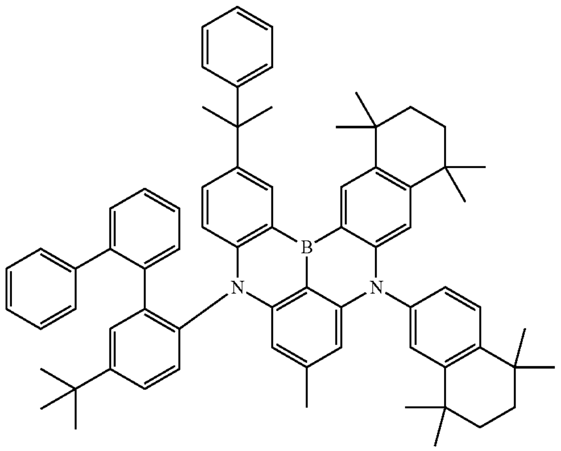
-continued
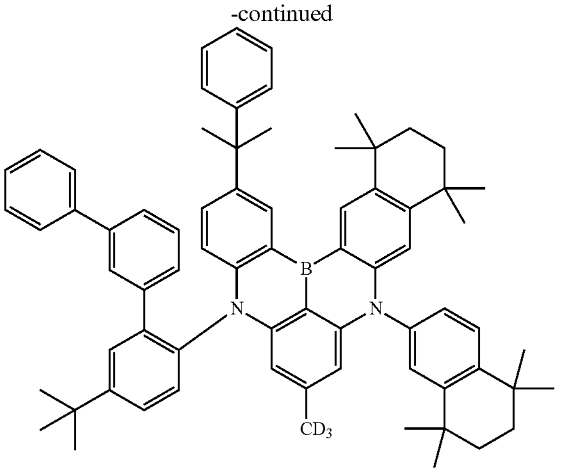
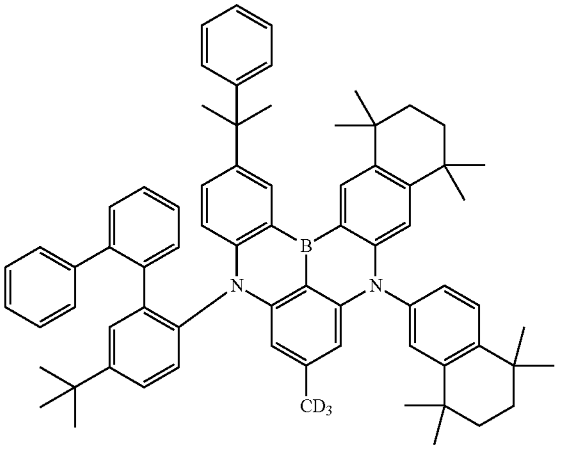
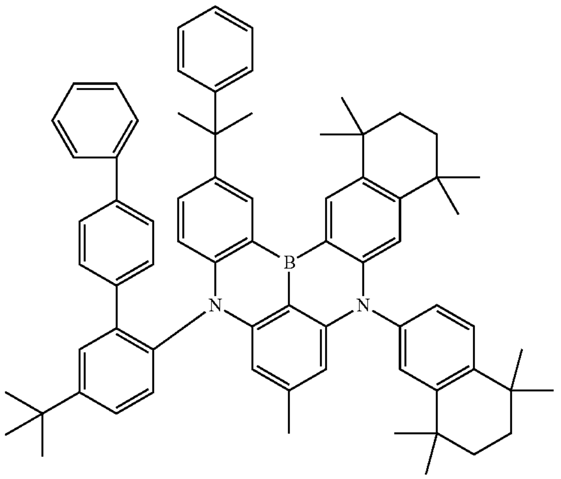

-continued
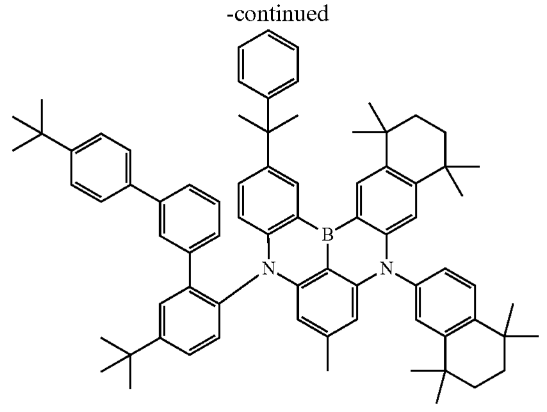
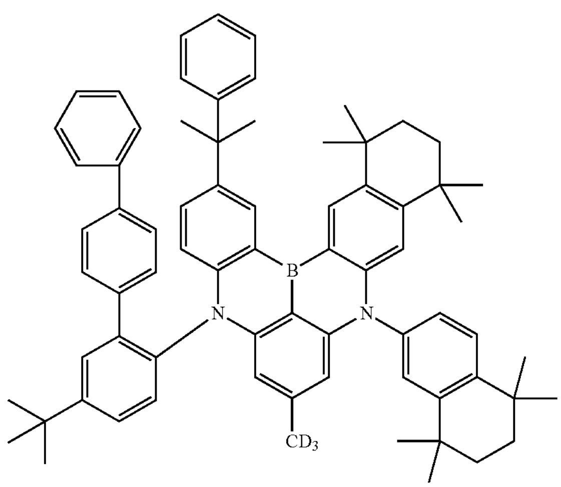
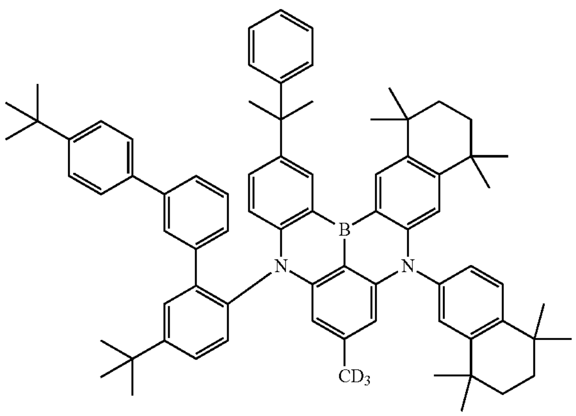
-continued
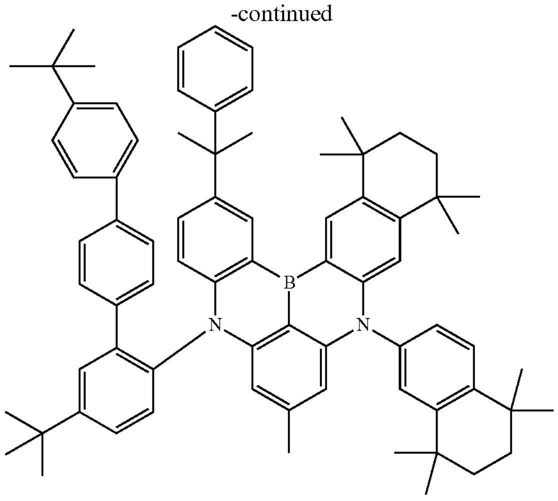
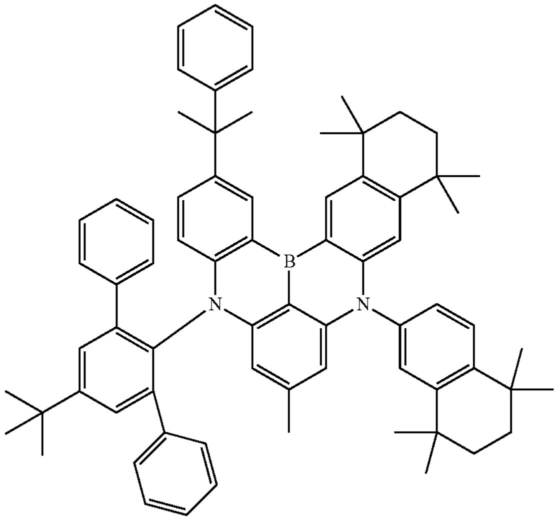
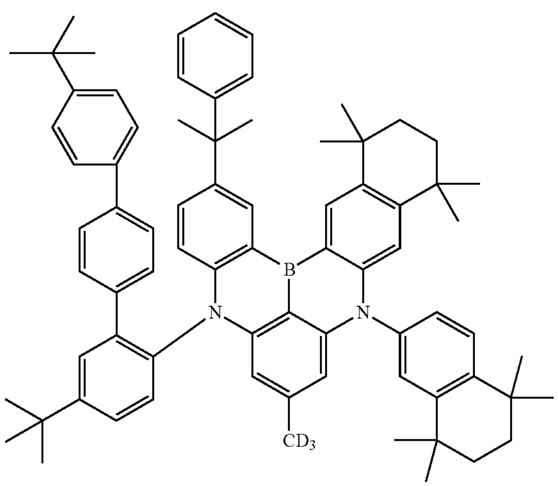

-continued
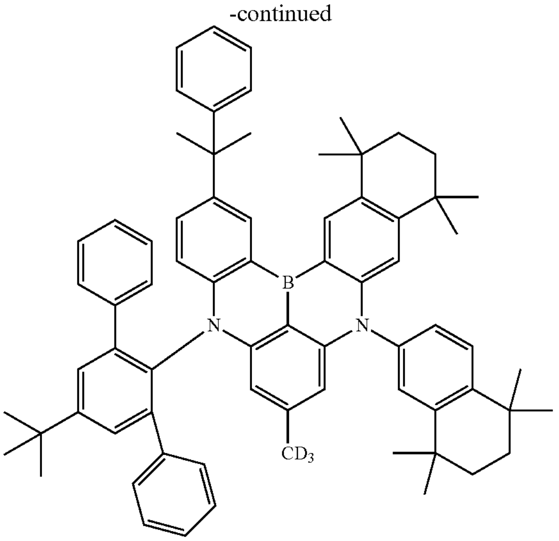
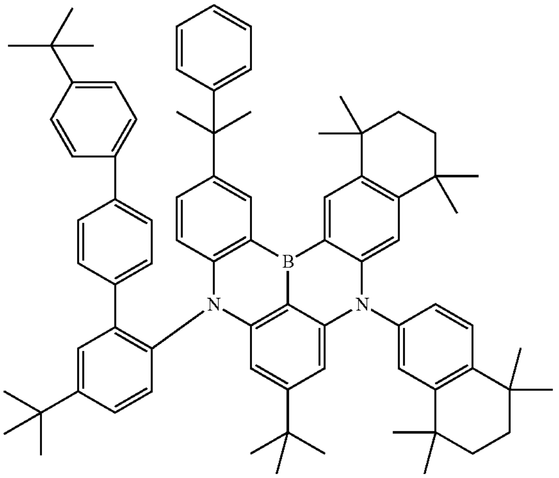
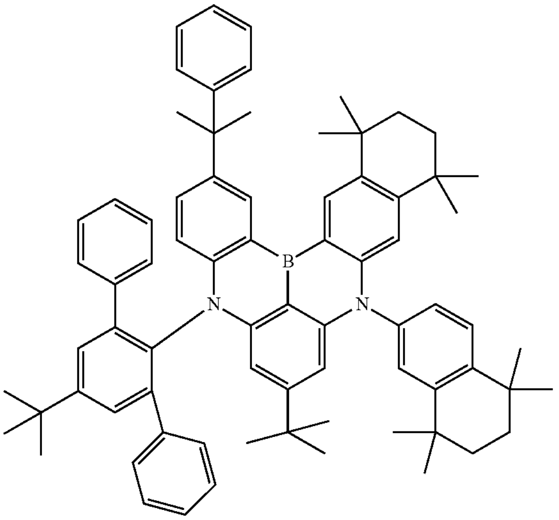
-continued
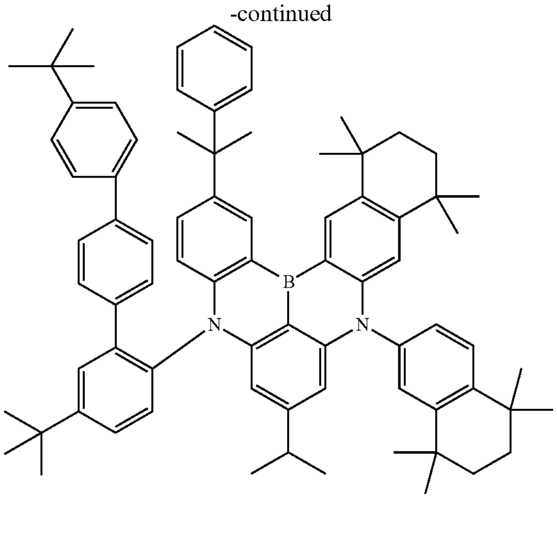
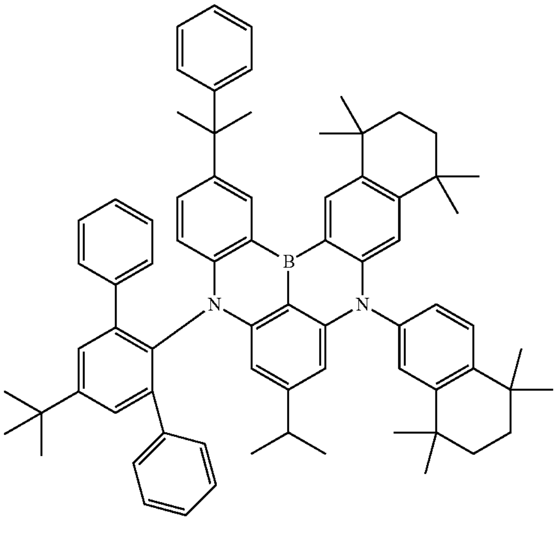
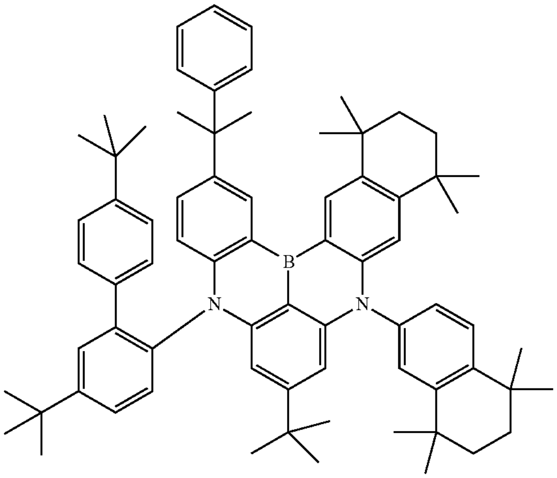

-continued
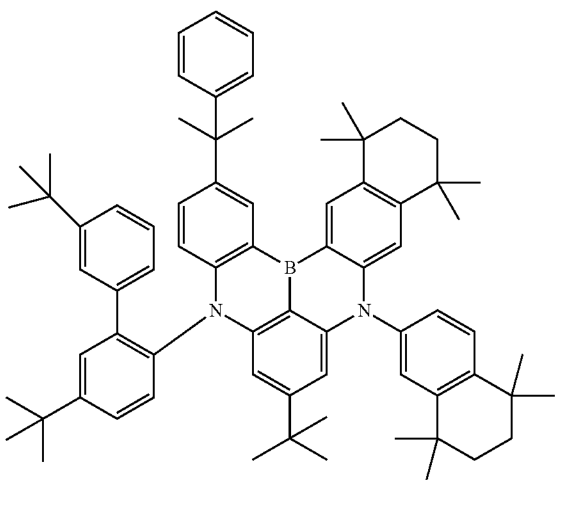
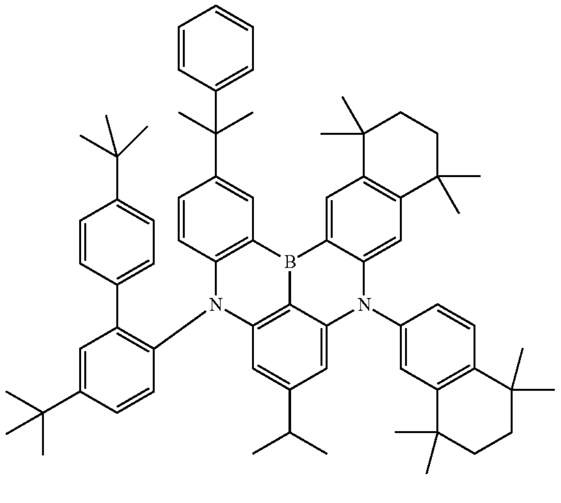
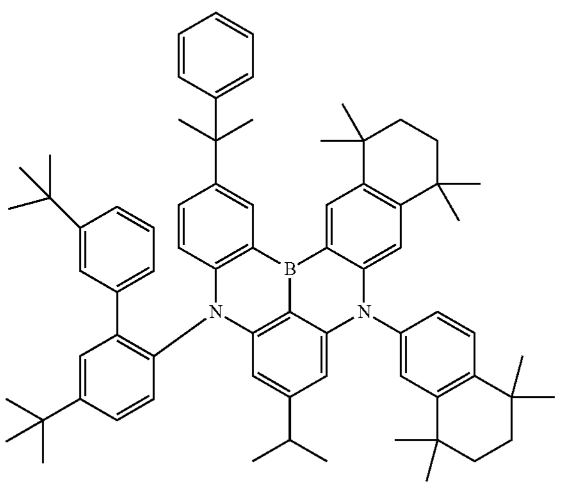 [SMILES: CC(C)c1cc2c3c(c1)N(c1ccc(C(C)(C)C)cc1-c1cccc(C(C)(C)C)c1)c1ccc(C(C)(C)c4ccccc4)cc1B3c1cc3c(cc1N2c1ccc2c(c1)C(C)(C)CCC2(C)C)C(C)(C)CCC3(C)C]
-continued
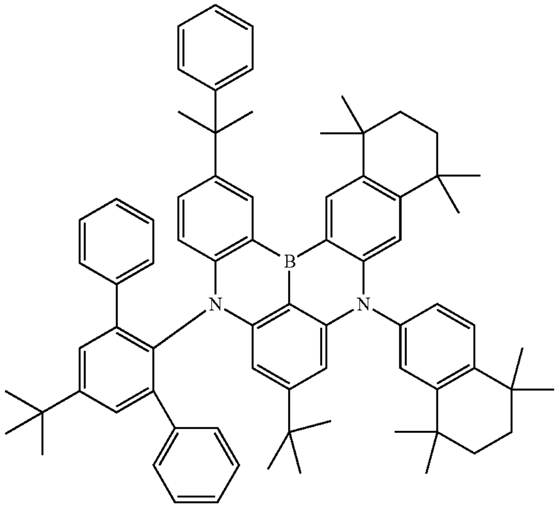
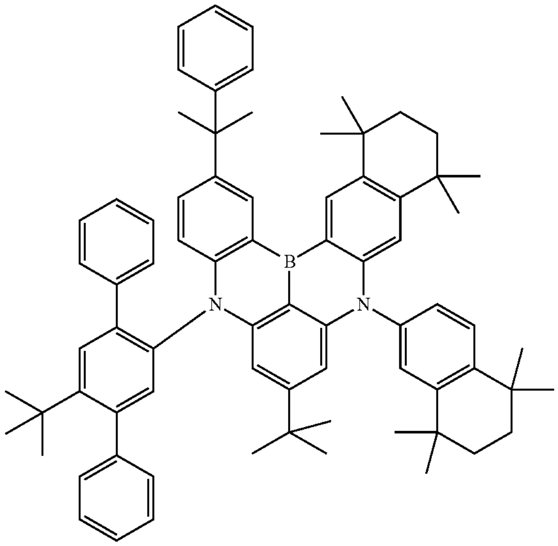
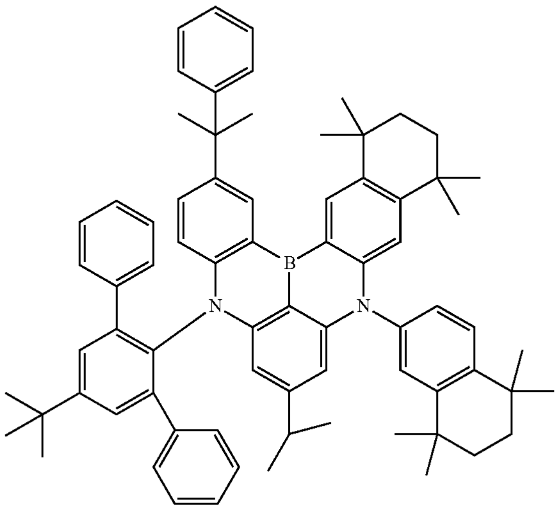

-continued
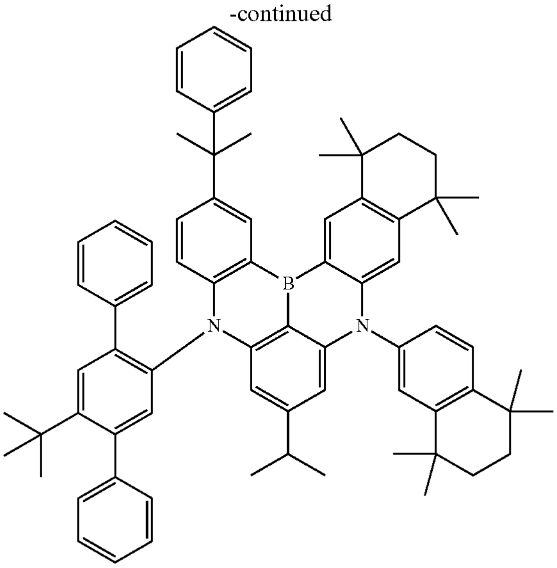
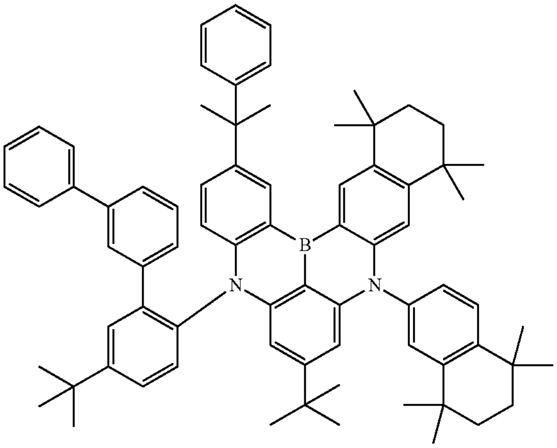
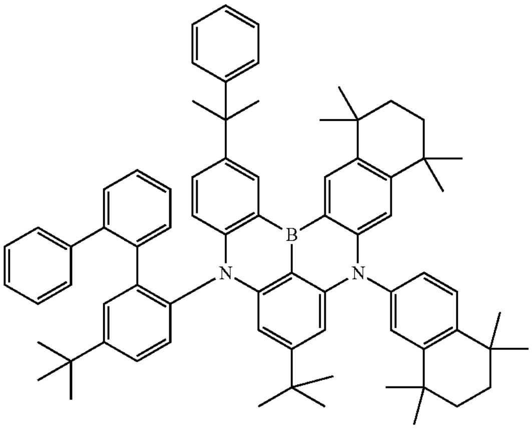
-continued
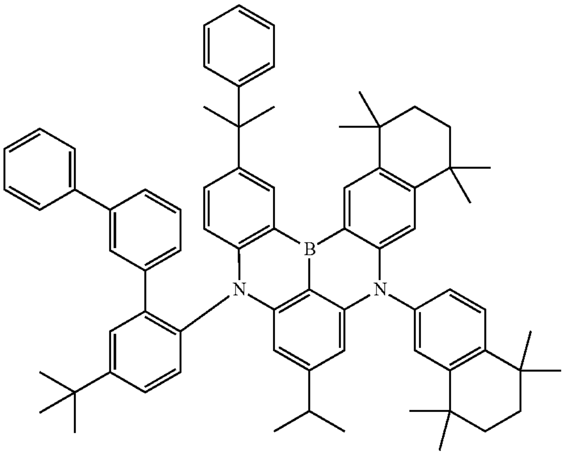
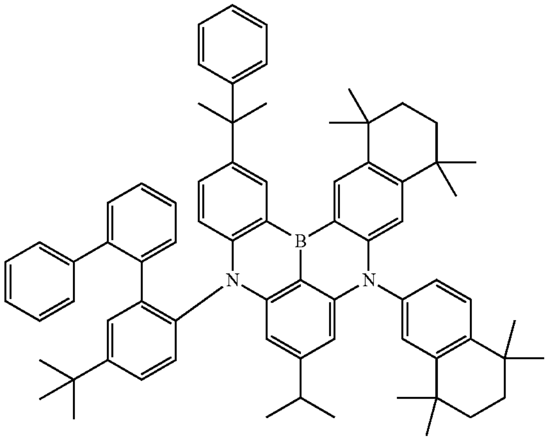
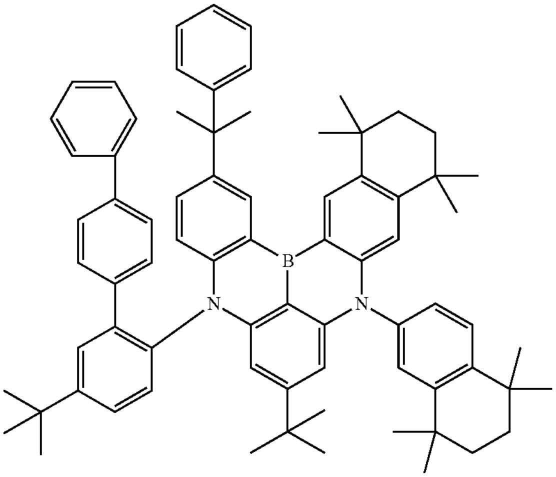

-continued
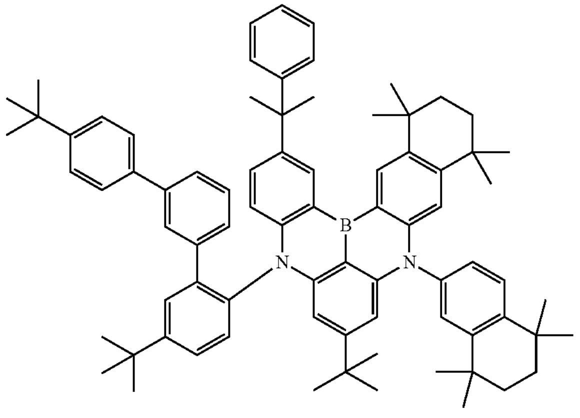
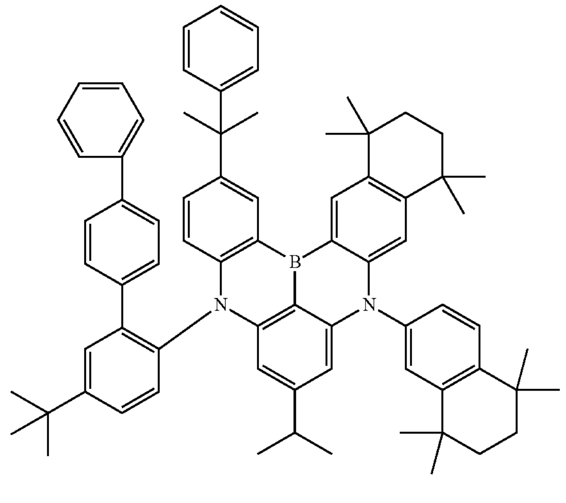
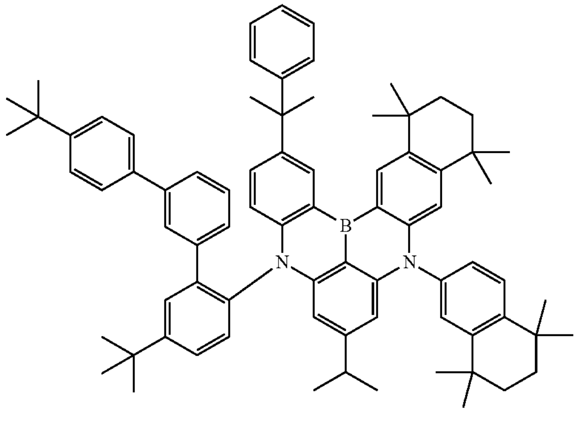
-continued
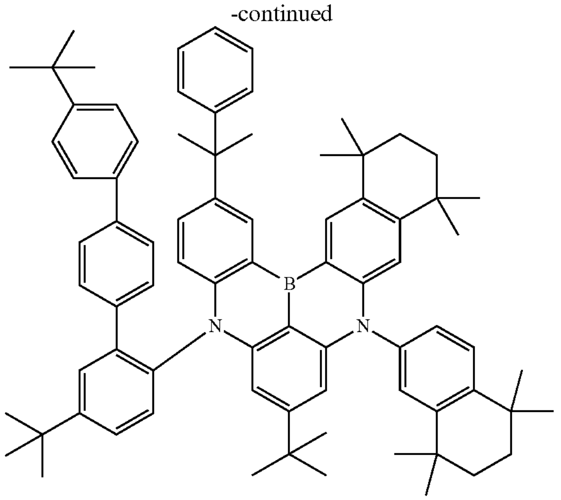
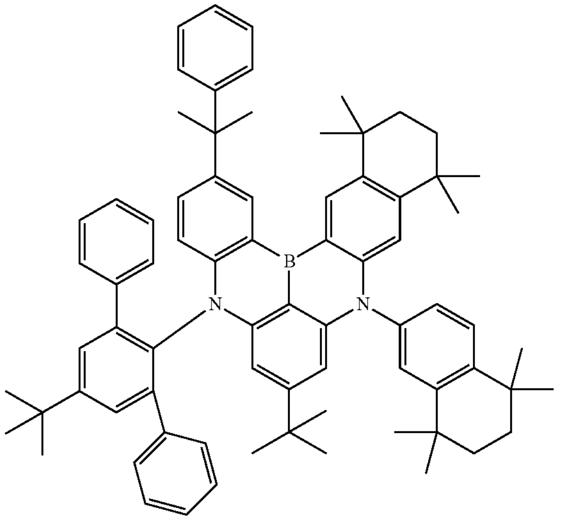
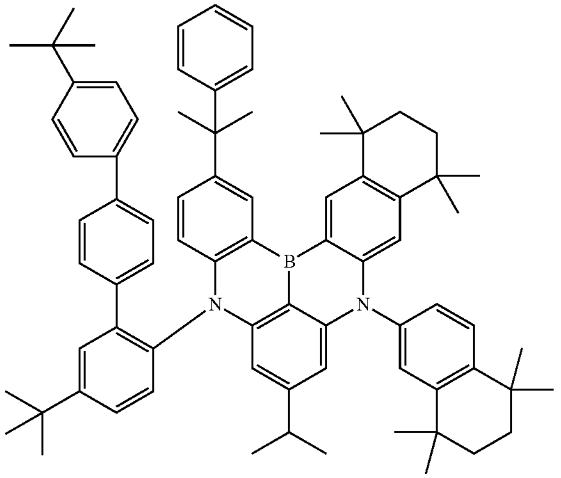

-continued
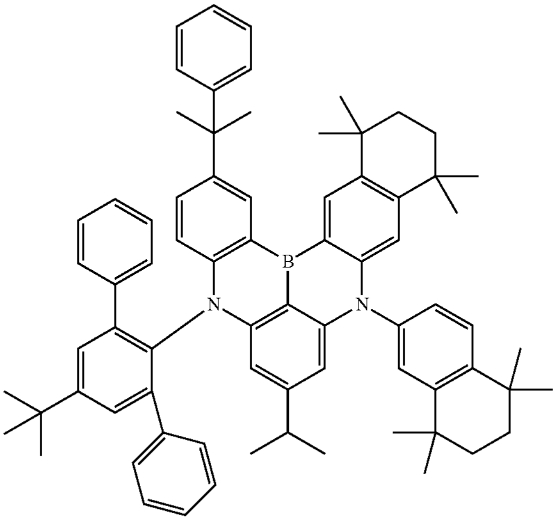 [SMILES: CC(C)c1cc2c3c(c1)N(c1c(-c4ccccc4)cc(C(C)(C)C)cc1-c1ccccc1)c1ccc(C(C)(C)c4ccccc4)cc1B3c1cc3c(cc1N2c1ccc2c(c1)C(C)(C)CCC2(C)C)C(C)(C)CCC3(C)C]
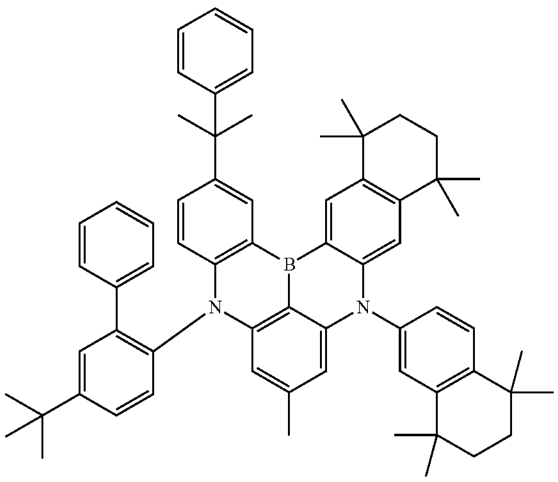
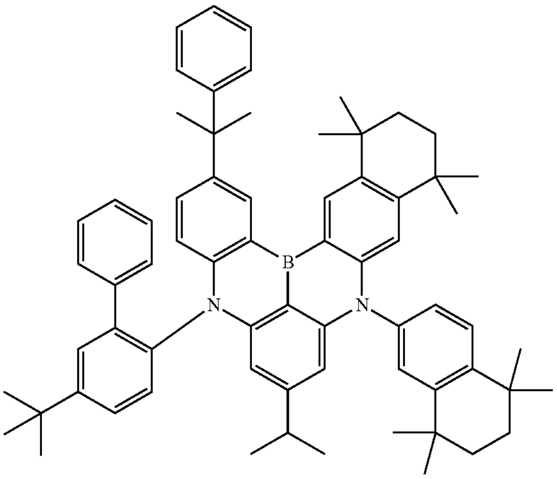
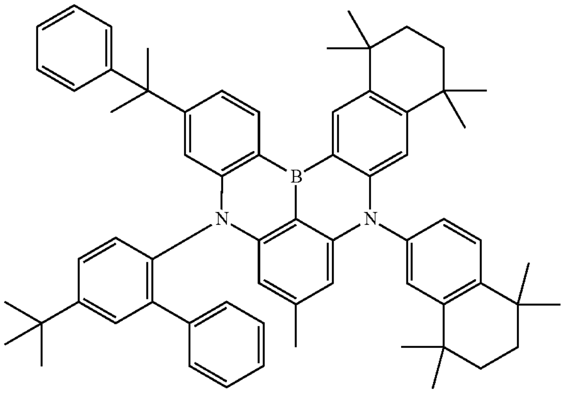
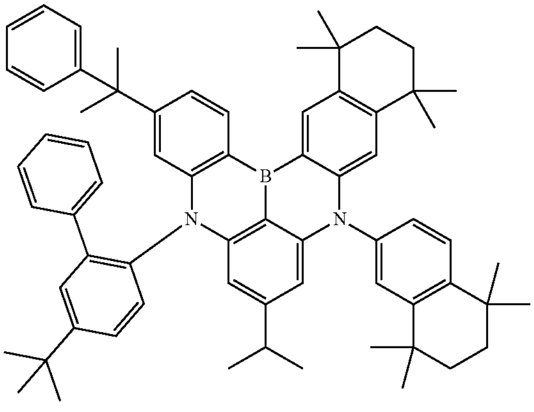
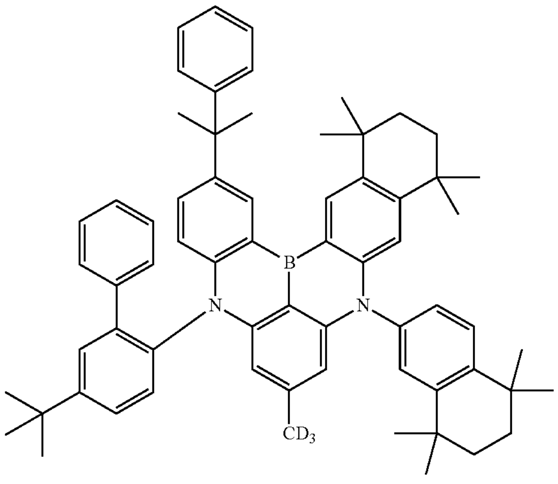

-continued
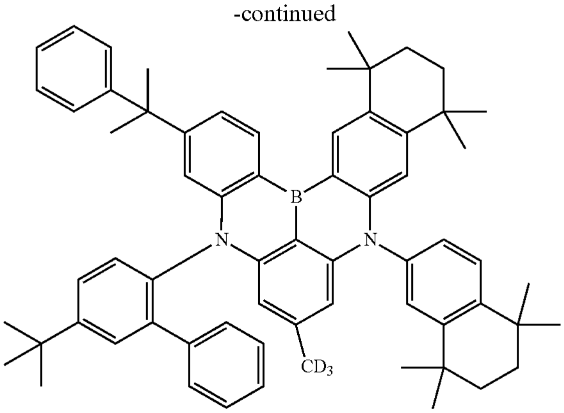
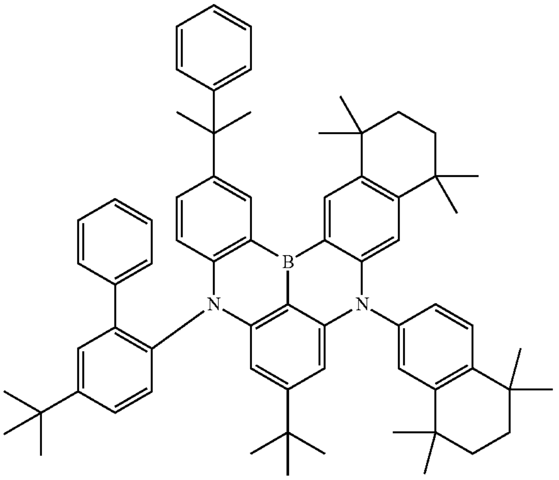
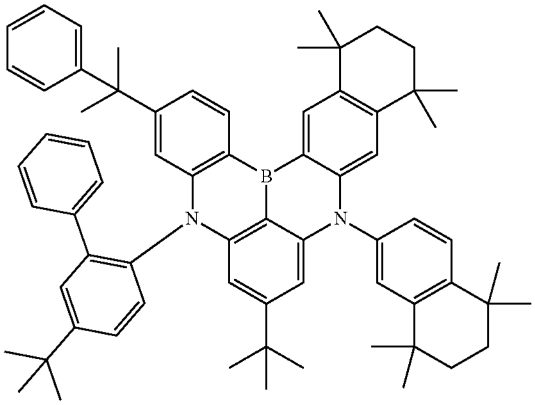
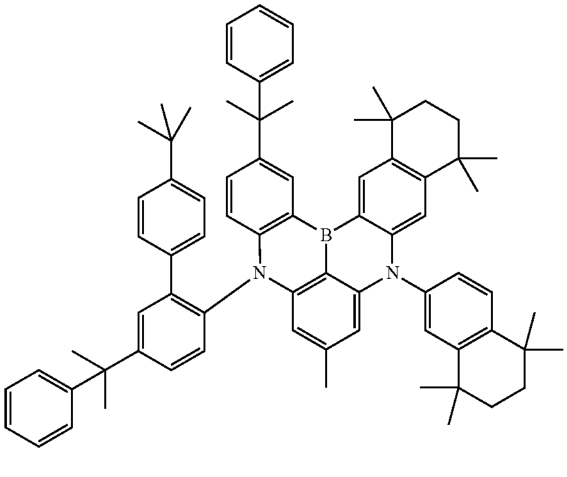
-continued
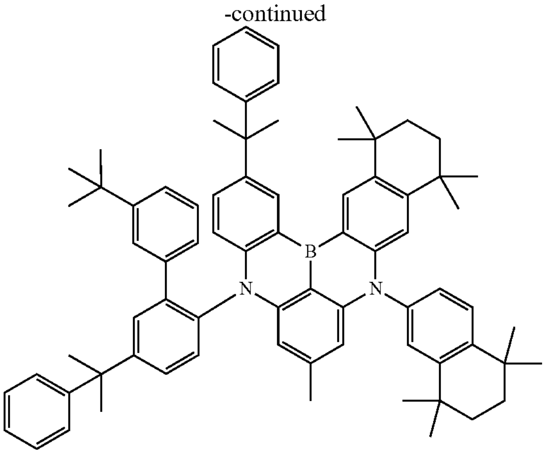
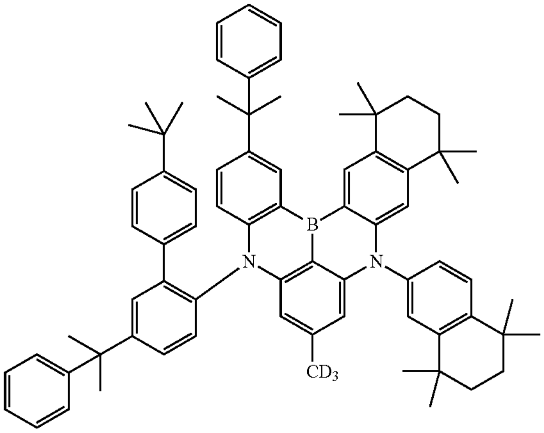
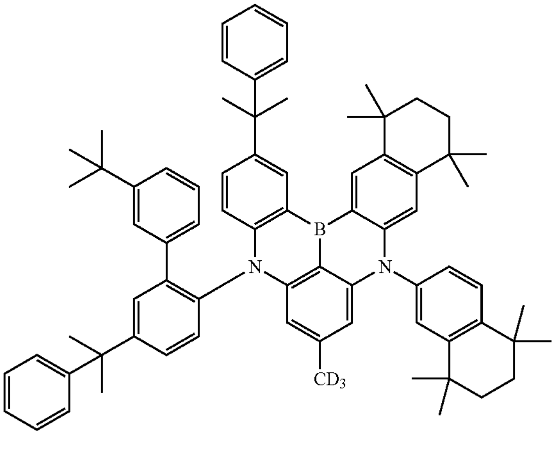

-continued
-continued
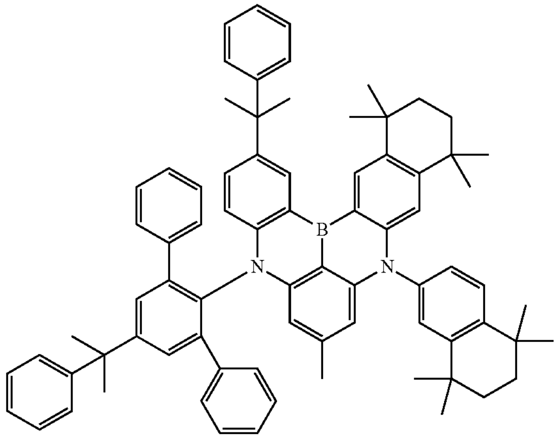
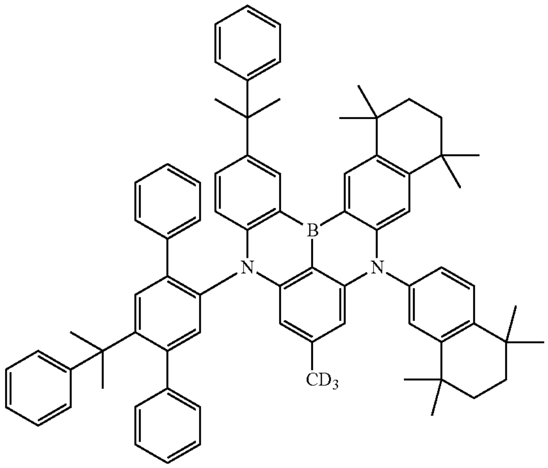
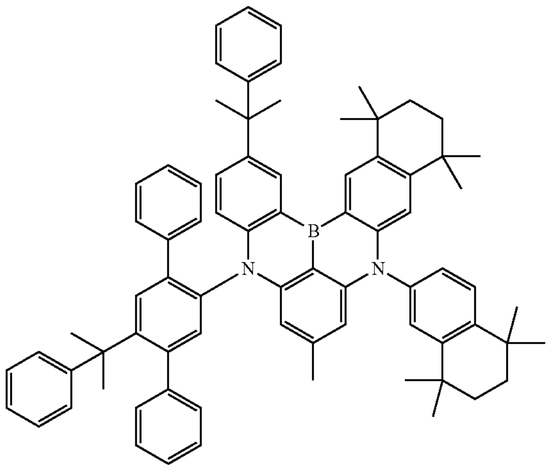
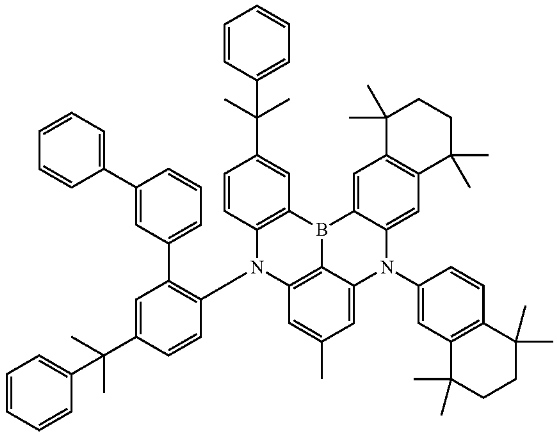
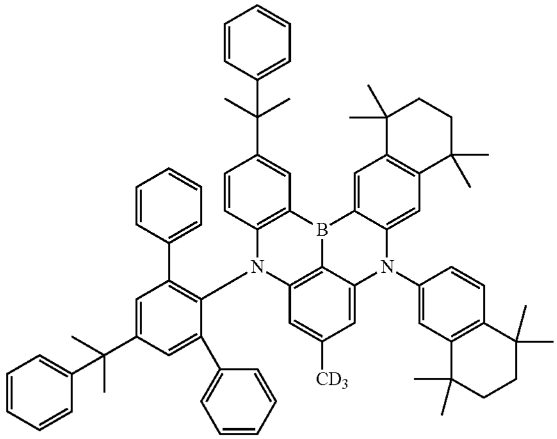
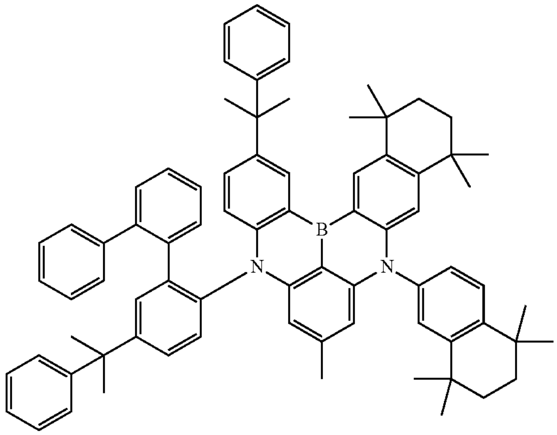

-continued
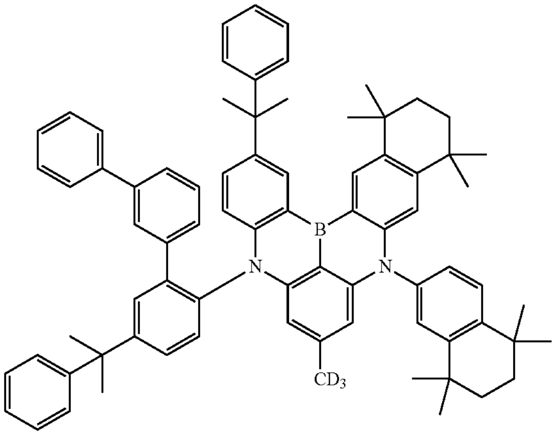
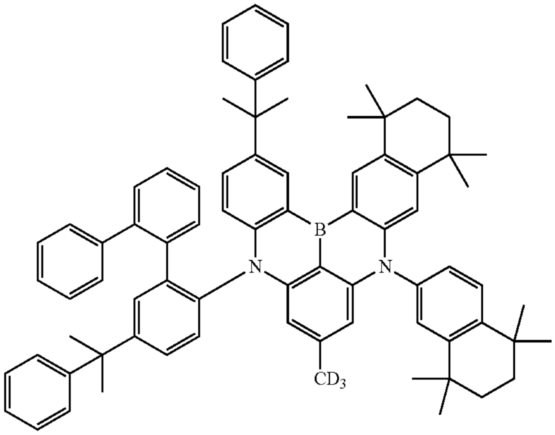
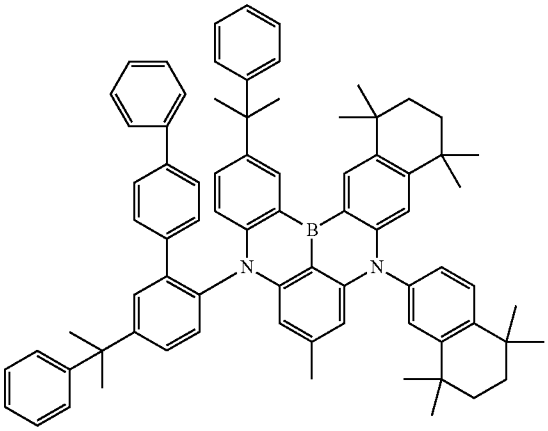
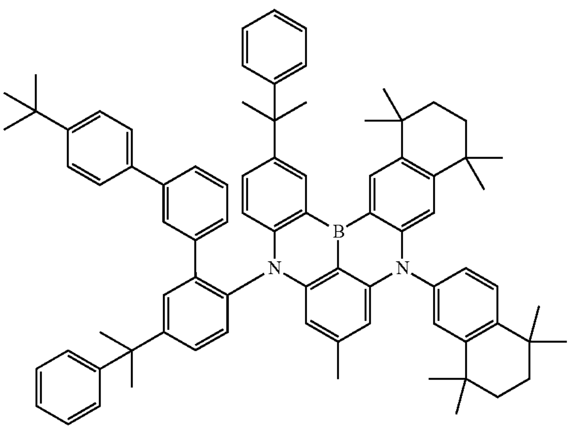
-continued
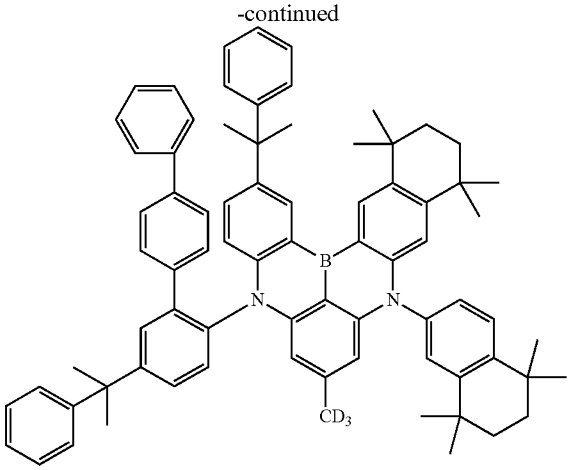
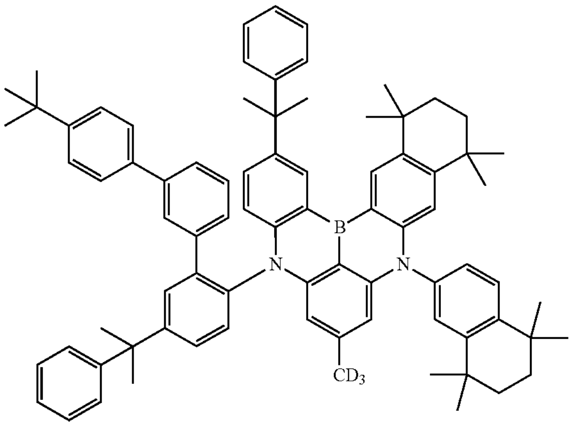
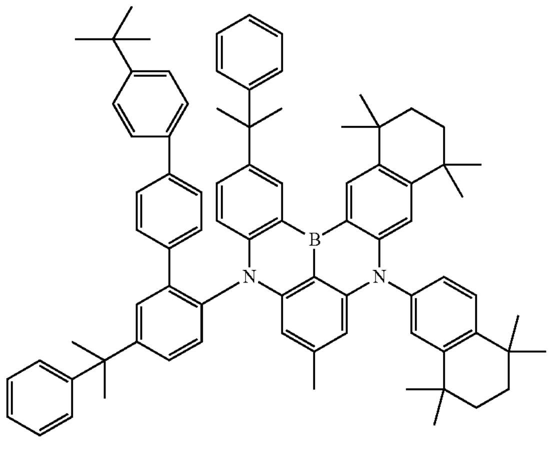

-continued
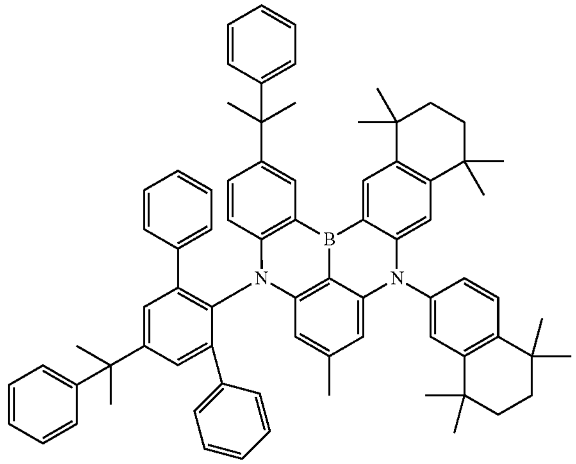
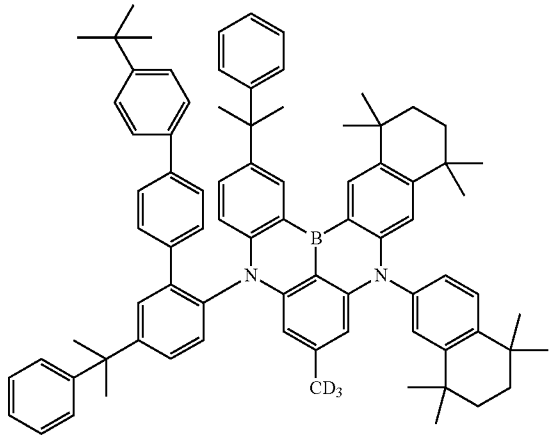
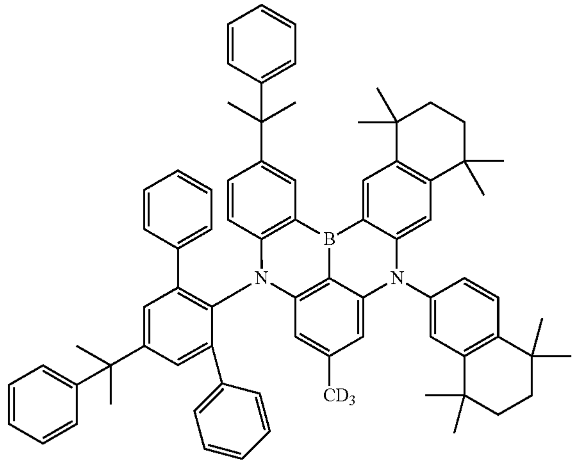
-continued
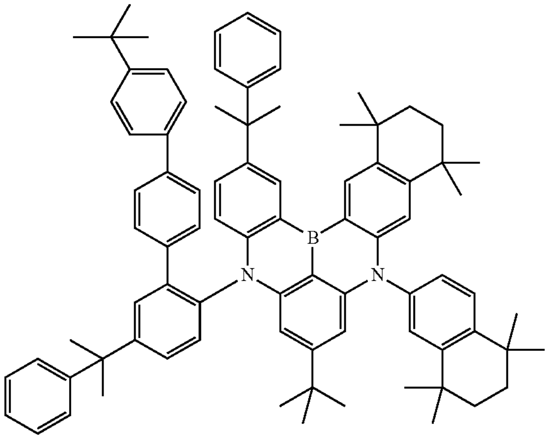
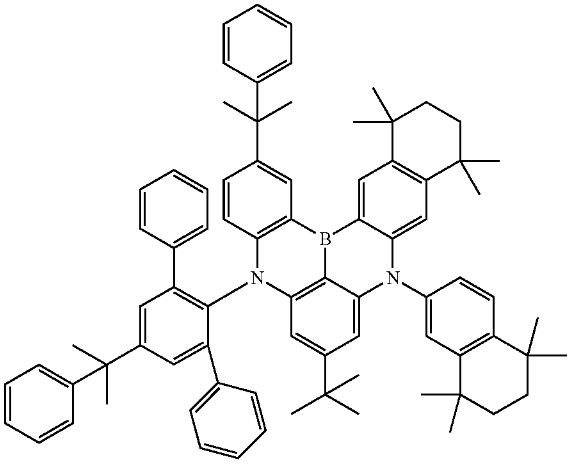
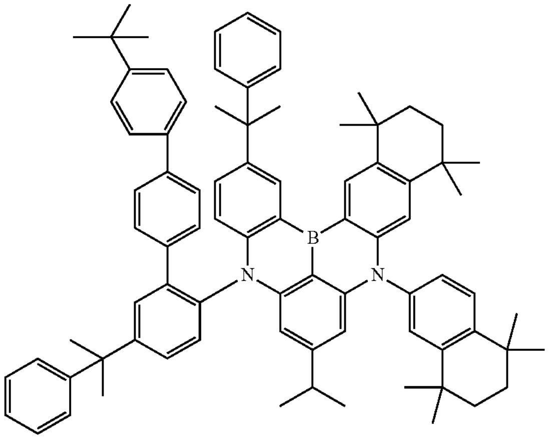

-continued
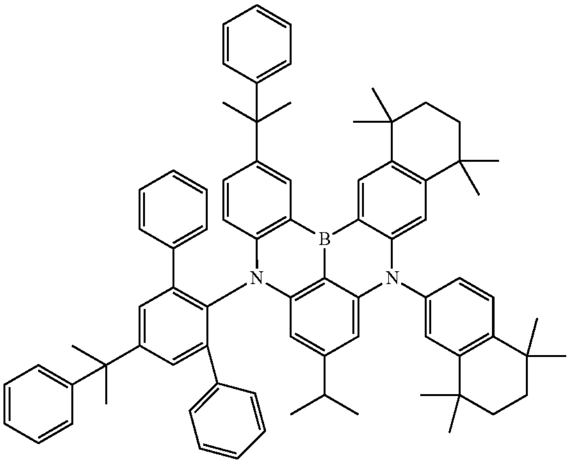
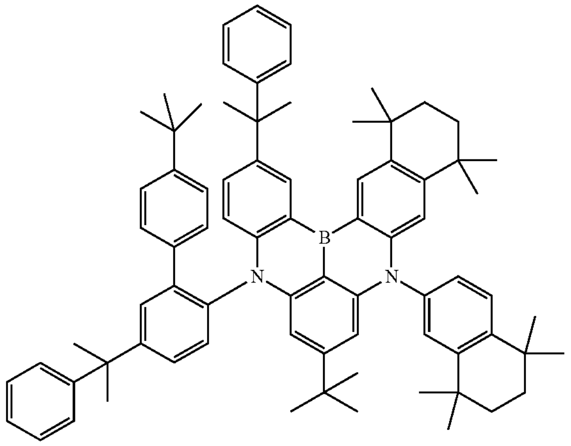
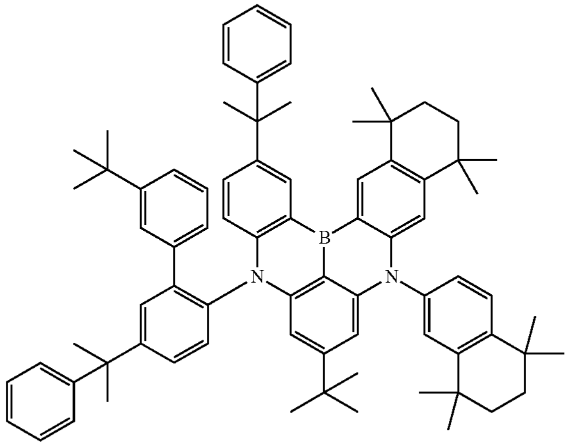
-continued
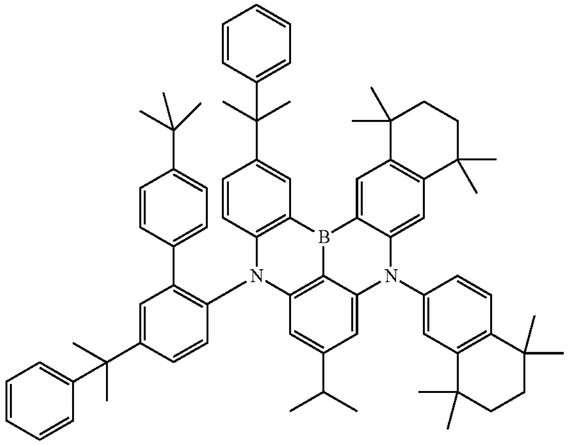
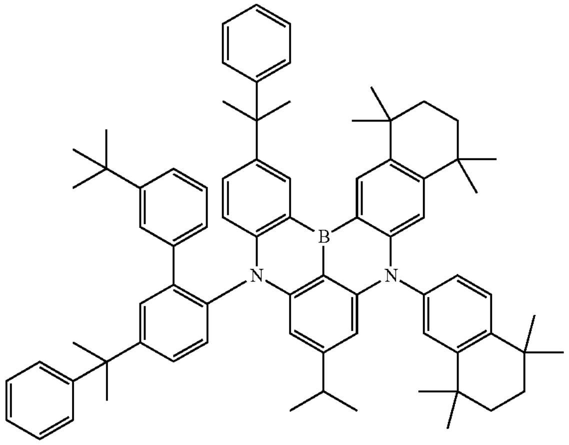
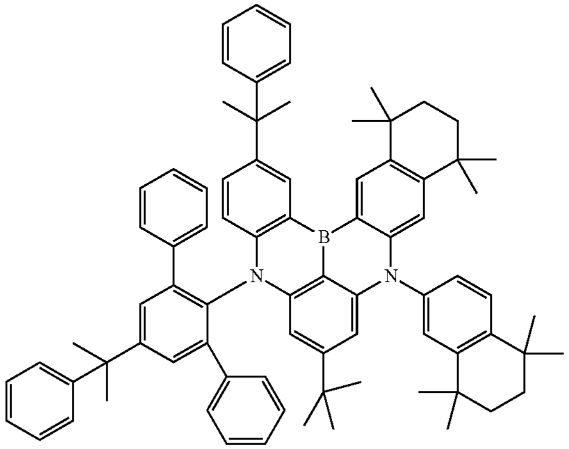

-continued
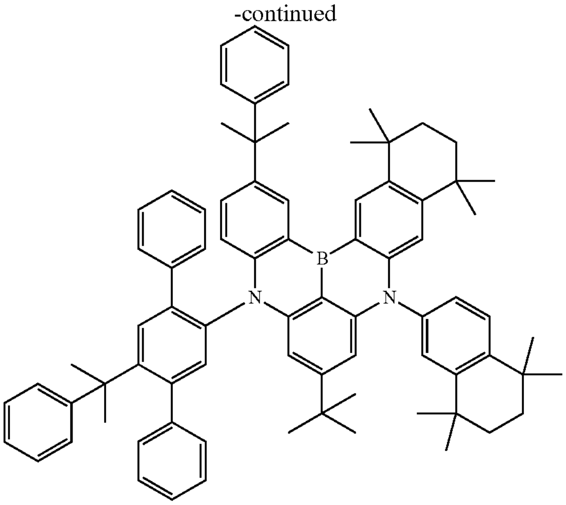
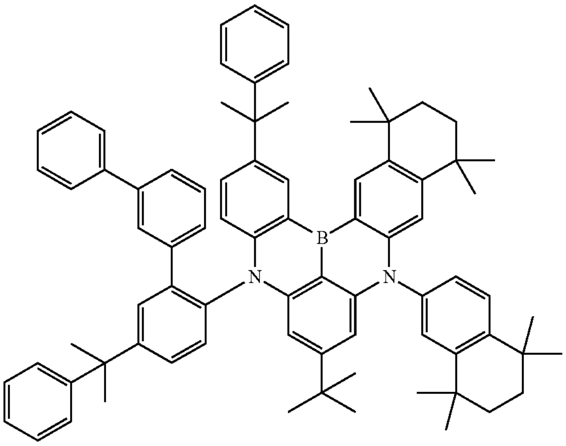
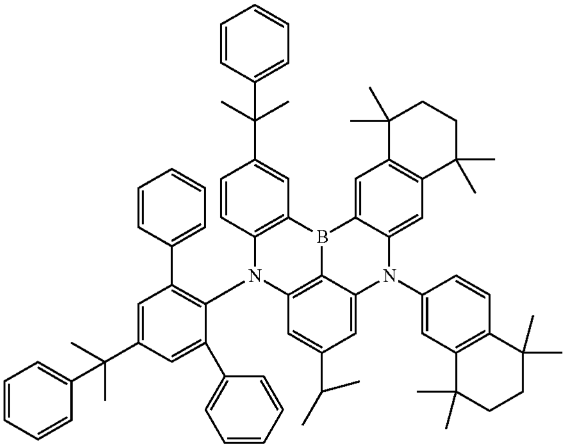
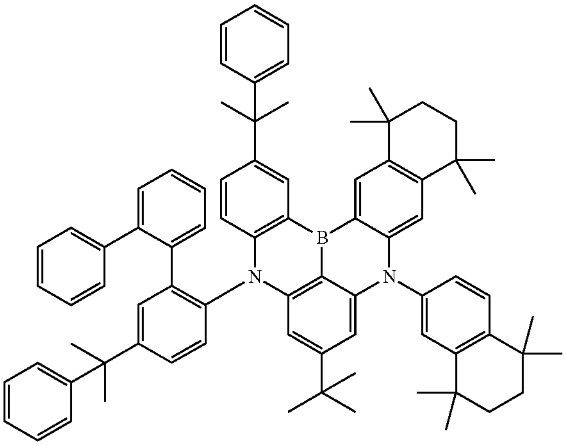
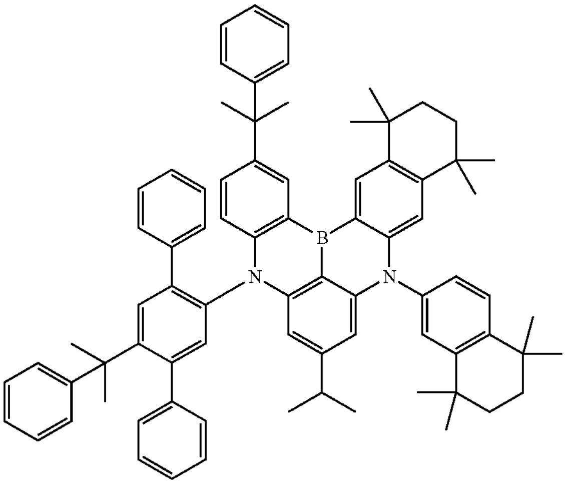
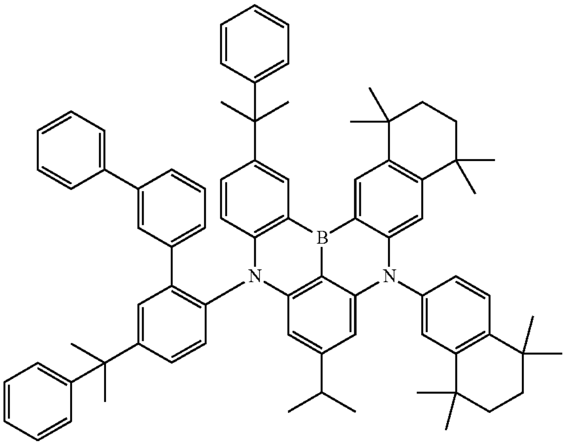

-continued
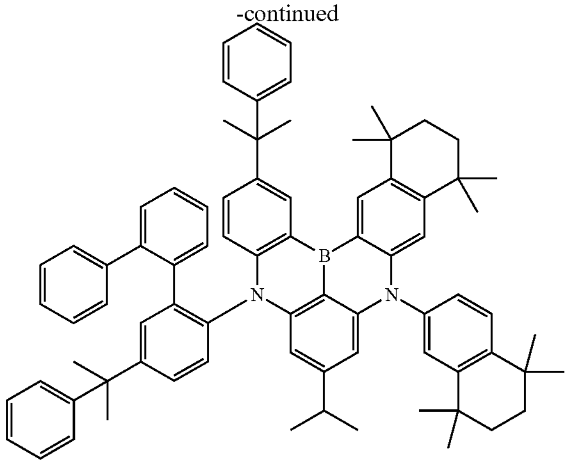
-continued
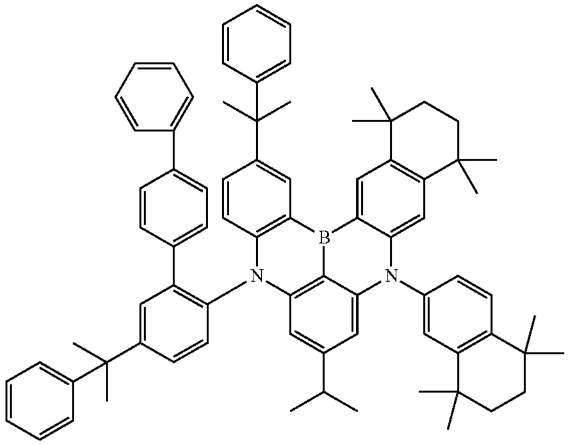
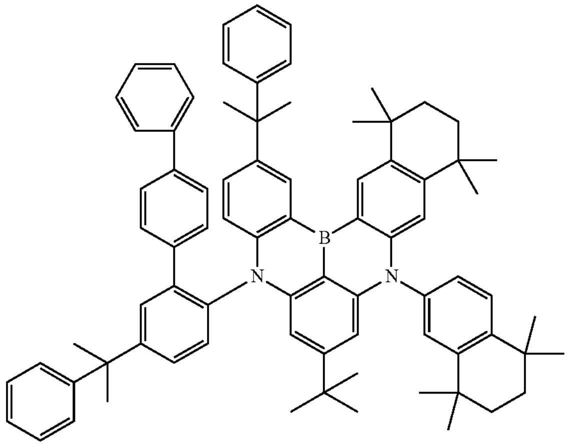
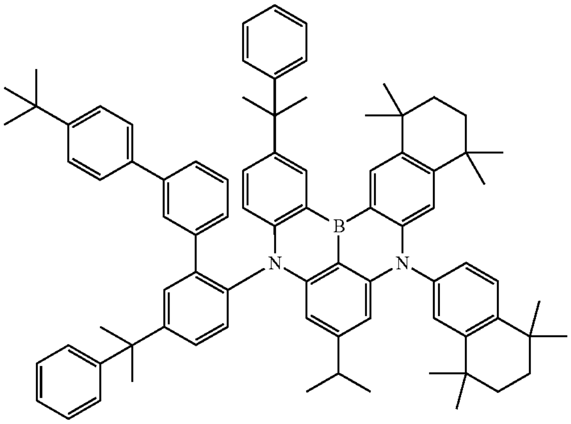
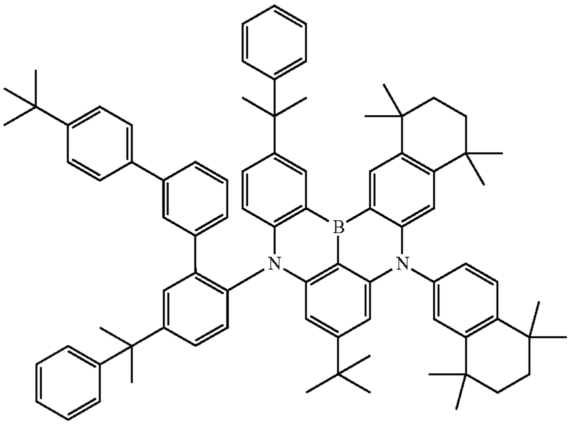
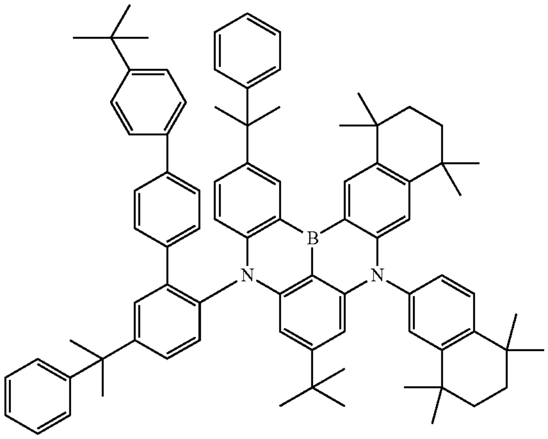

-continued
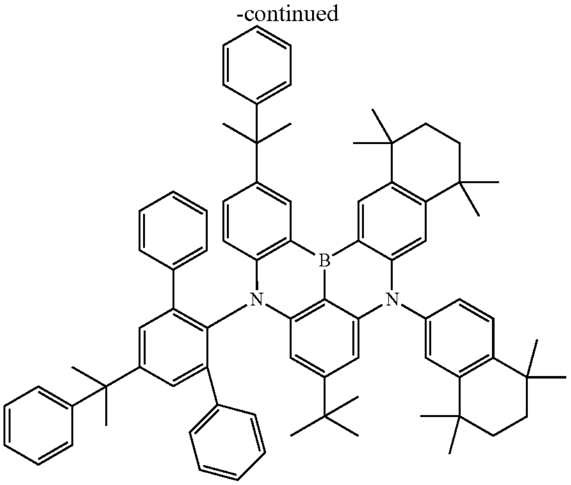
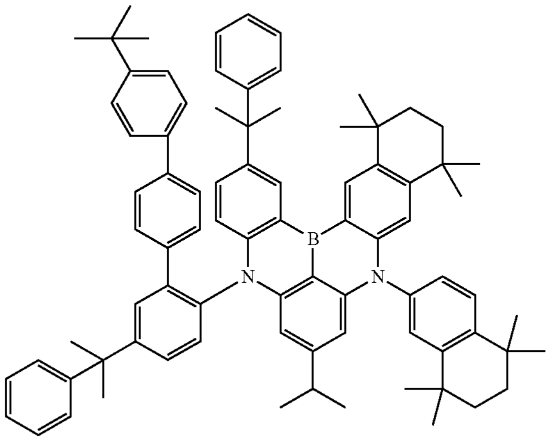
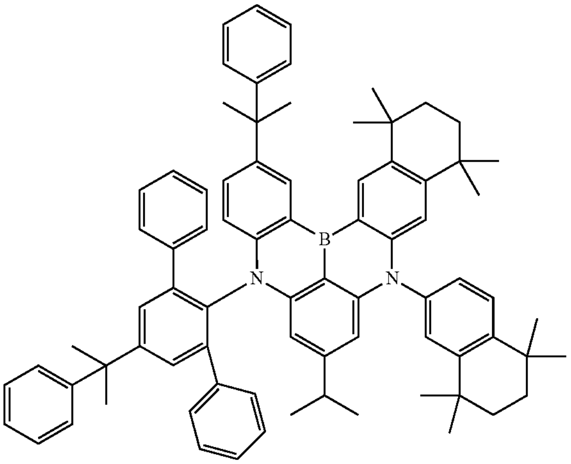
-continued
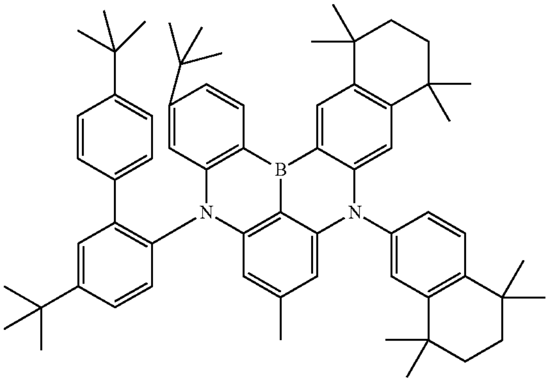
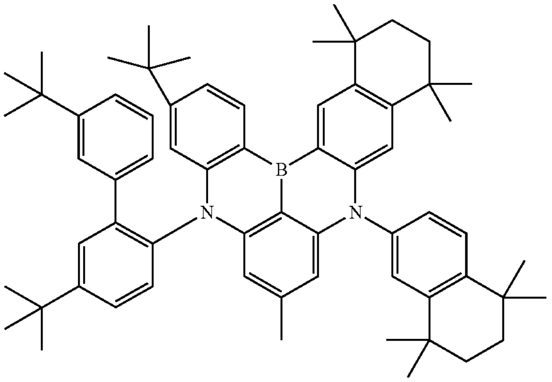
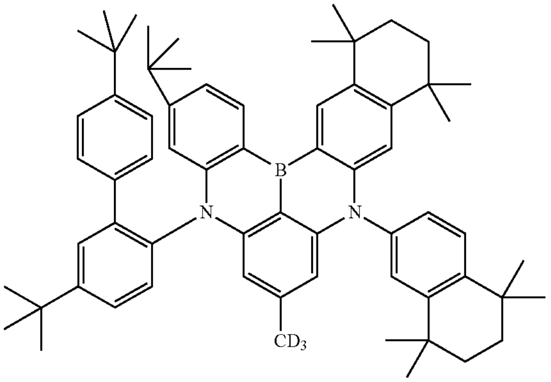
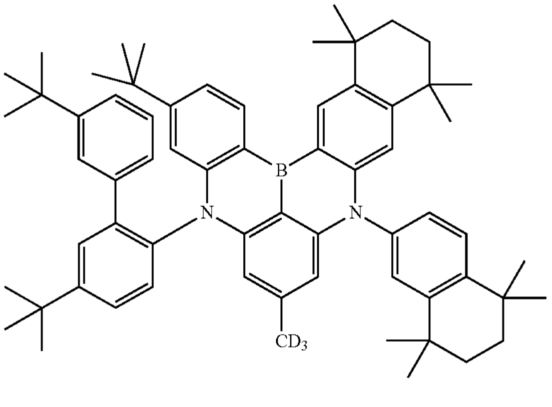

-continued
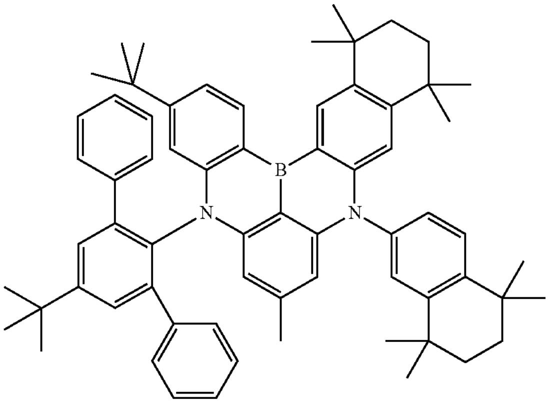
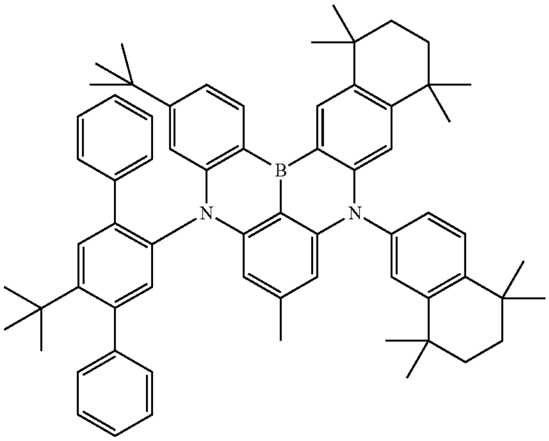
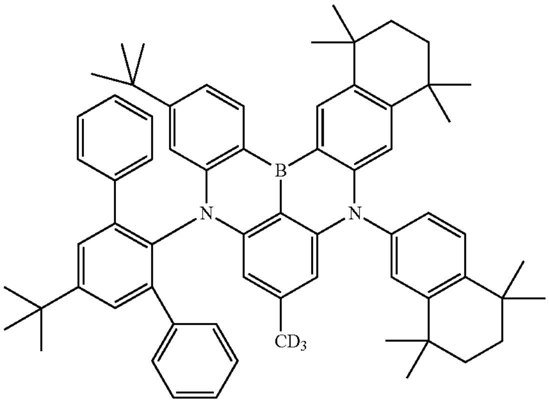
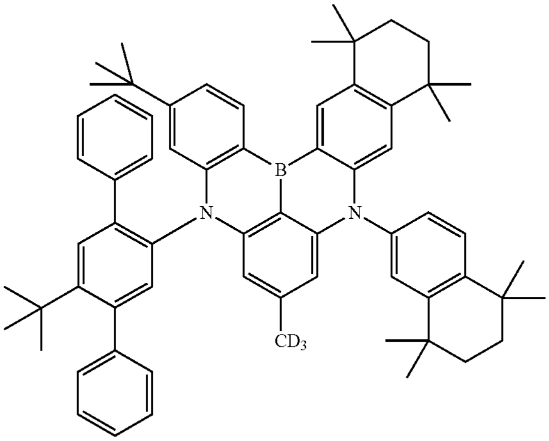
-continued
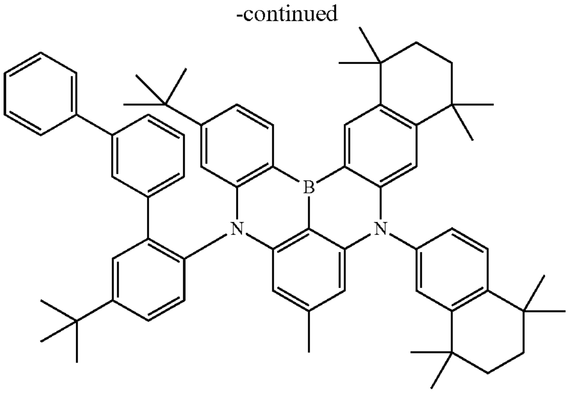
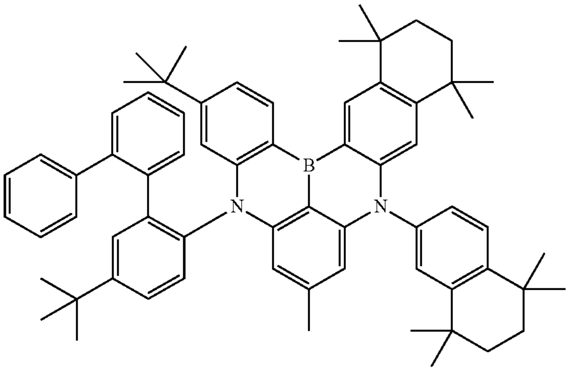
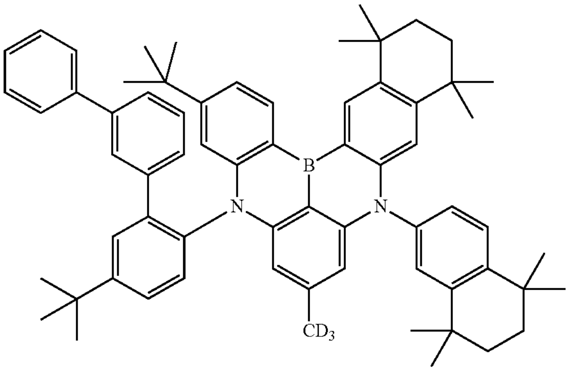
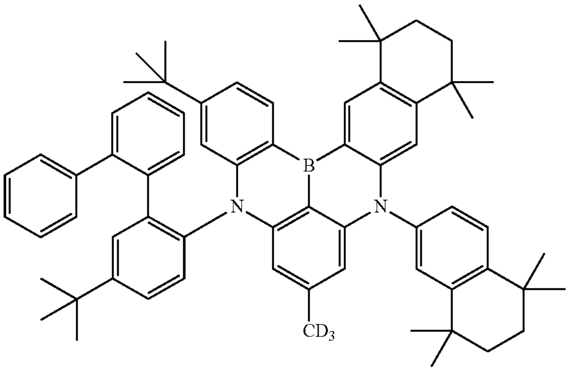

-continued
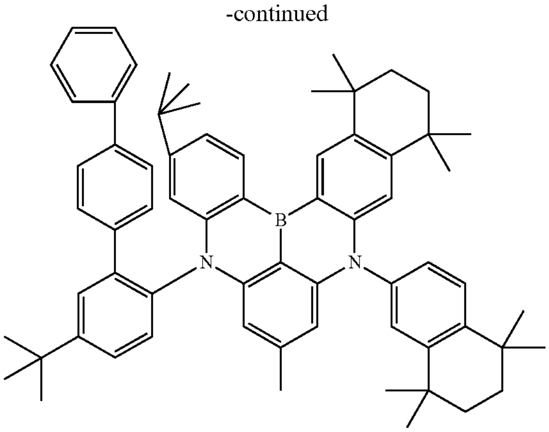
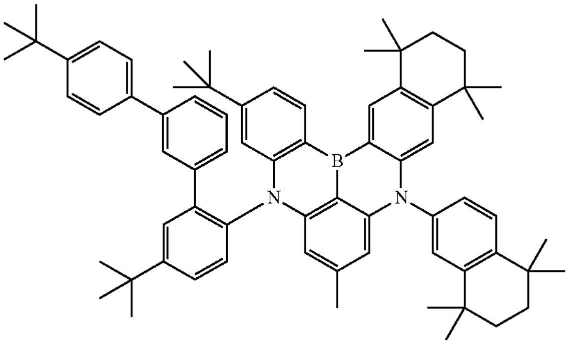
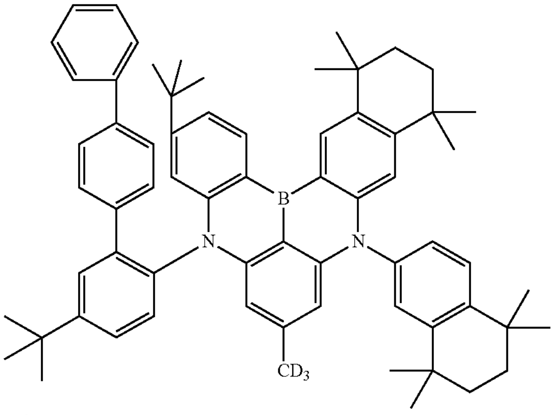
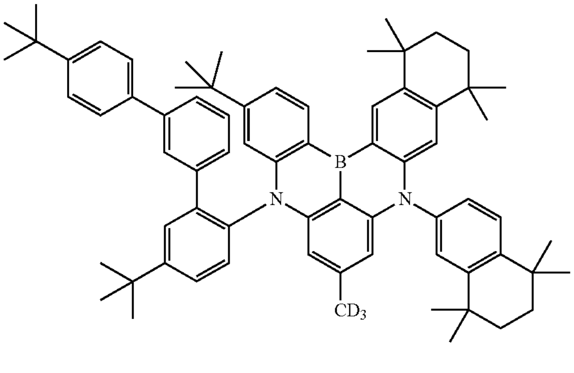
-continued
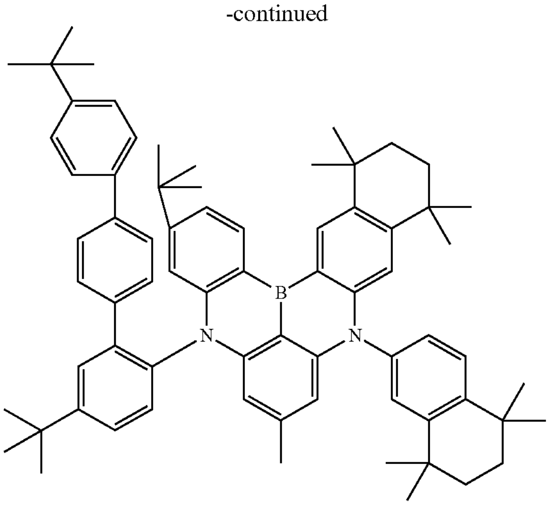
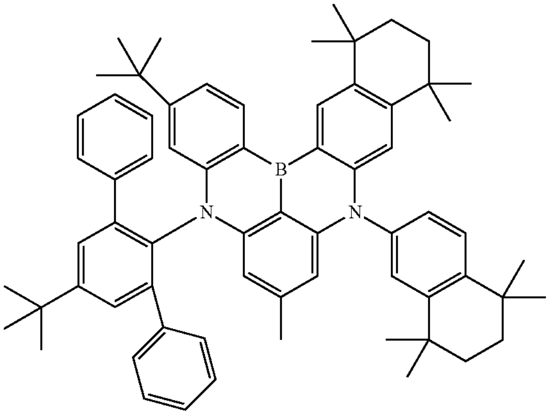
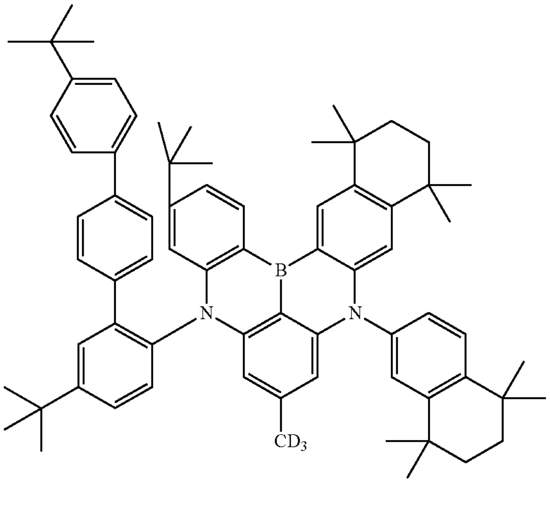

-continued
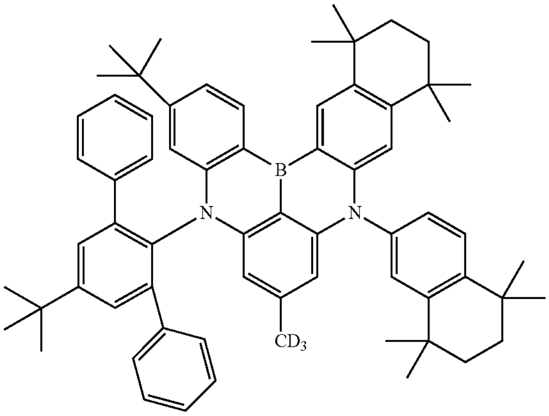
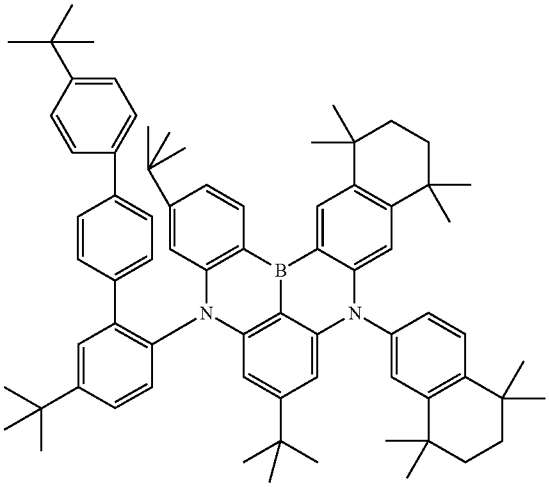
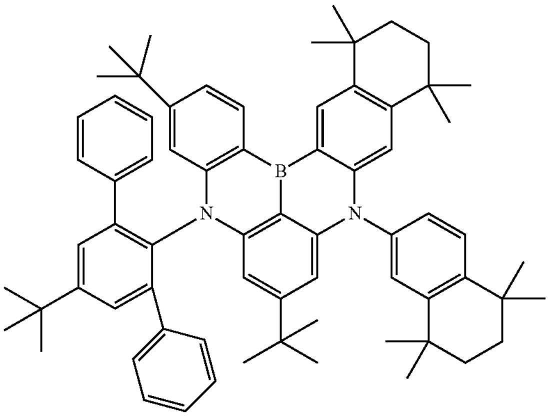
-continued
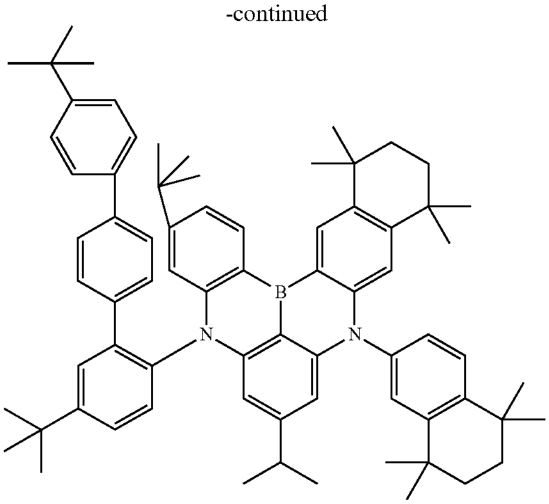
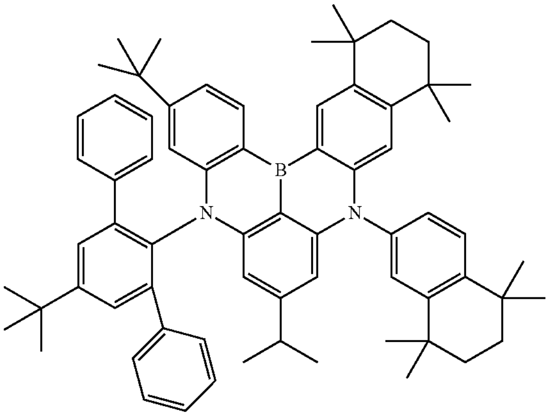
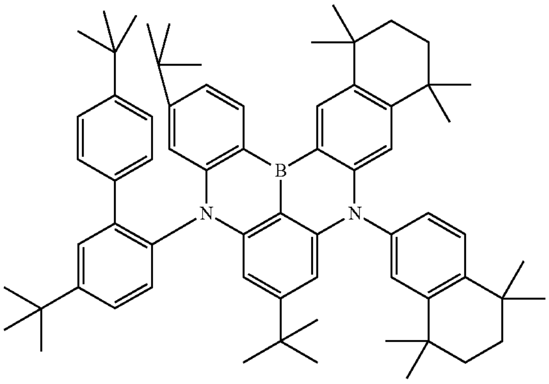
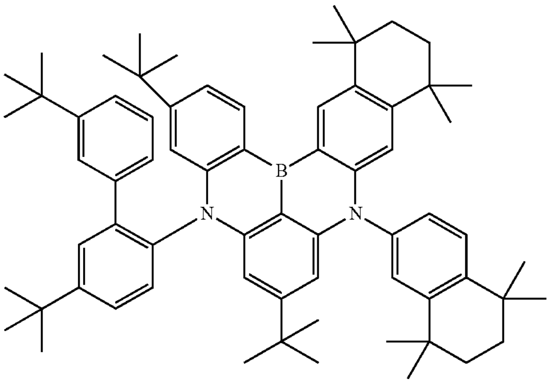

-continued
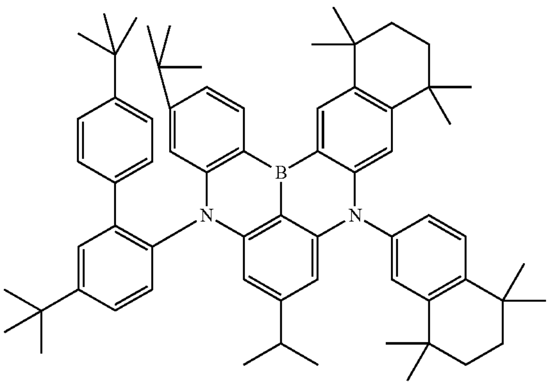
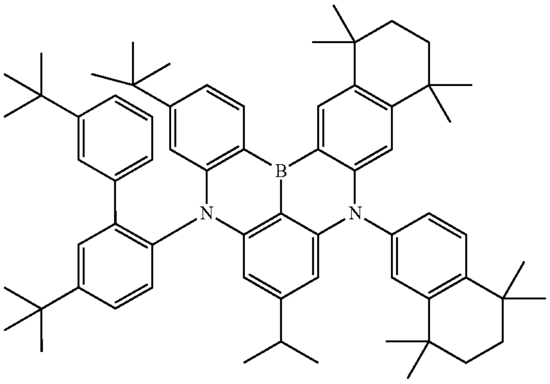
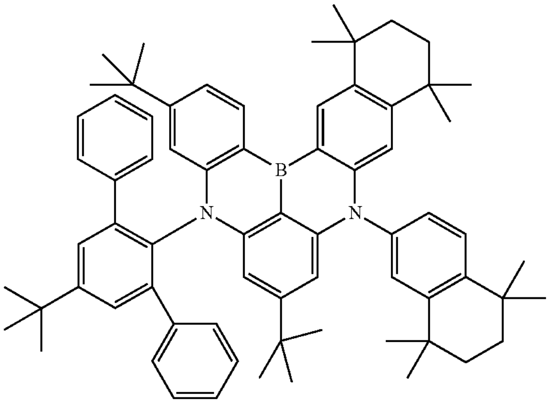
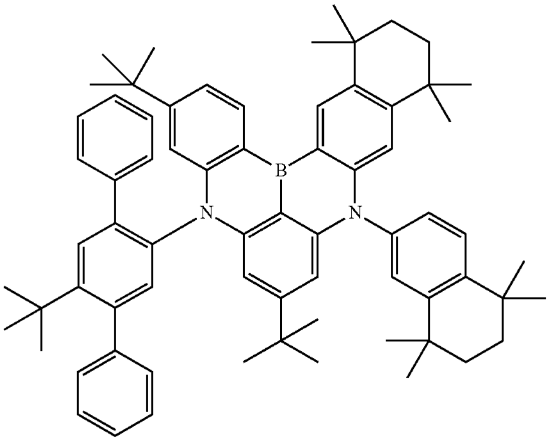
-continued
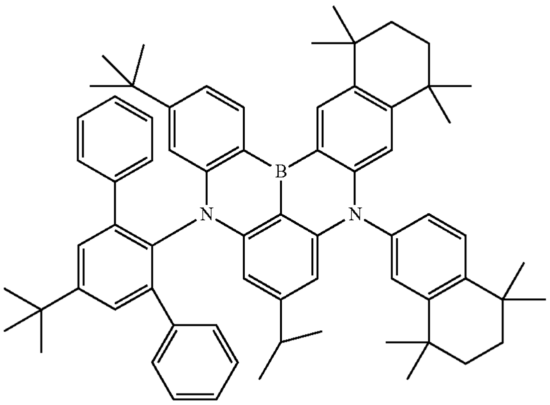
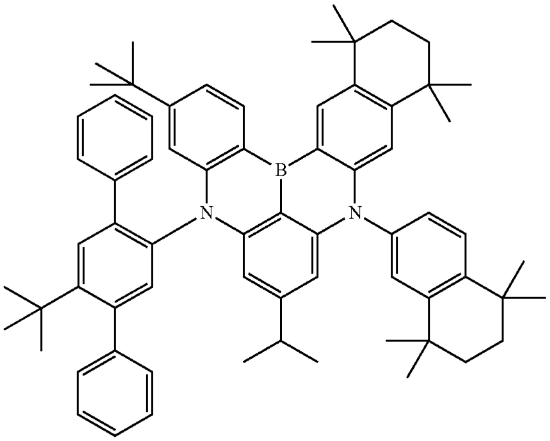
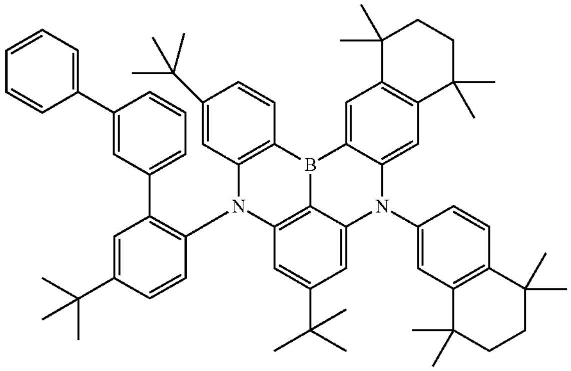
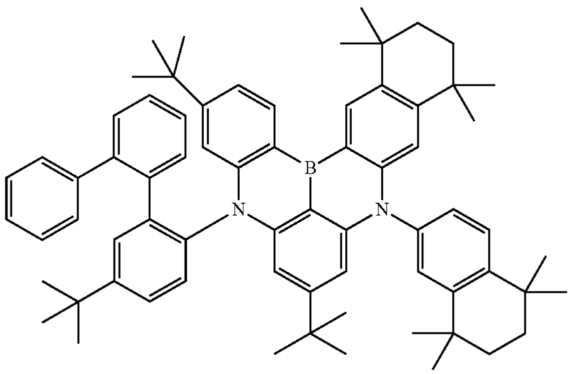

-continued
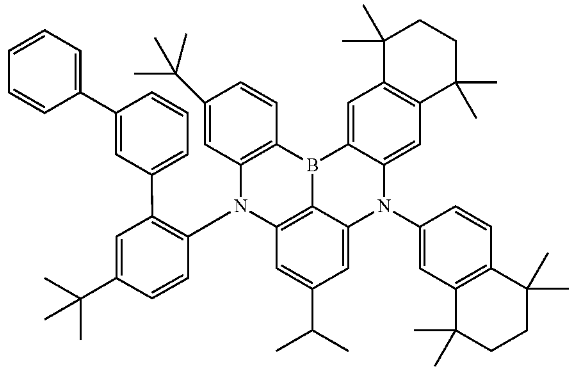
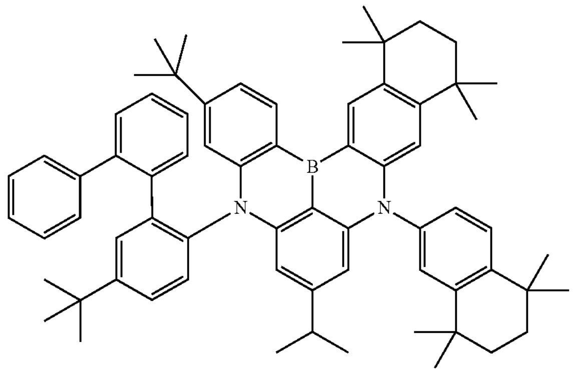
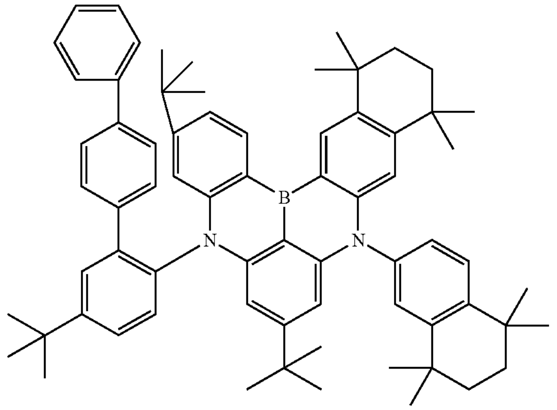
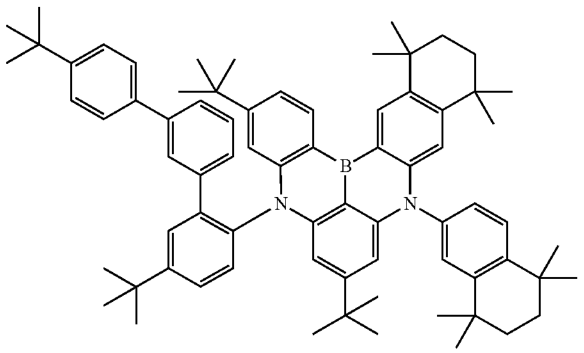
-continued
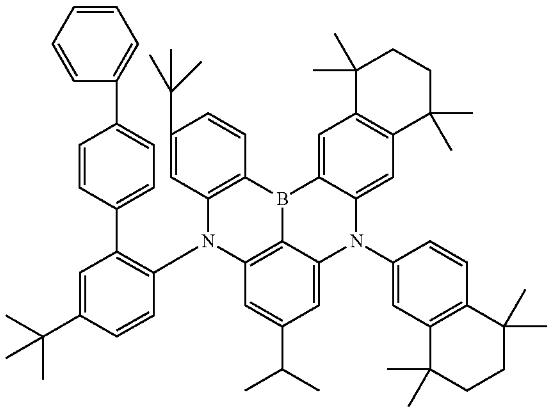
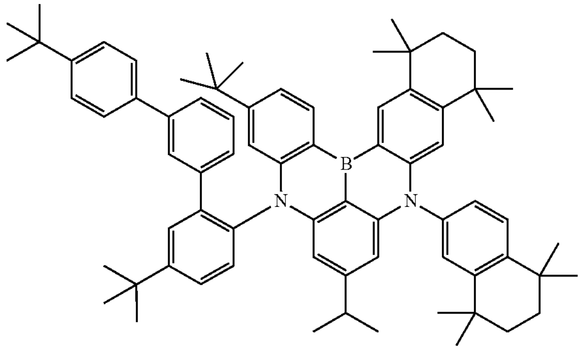
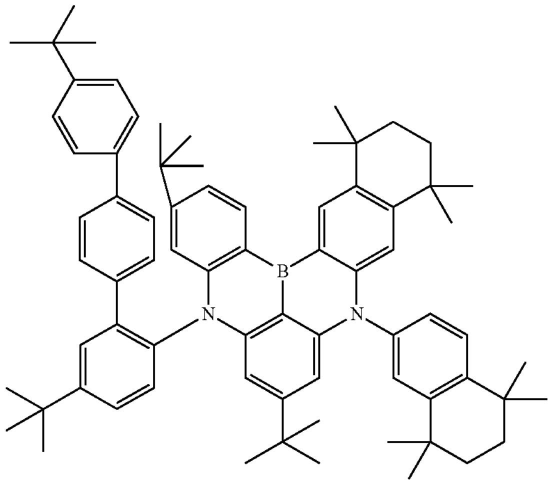
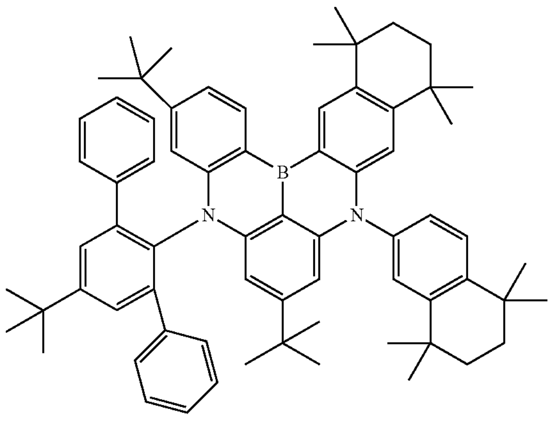

-continued
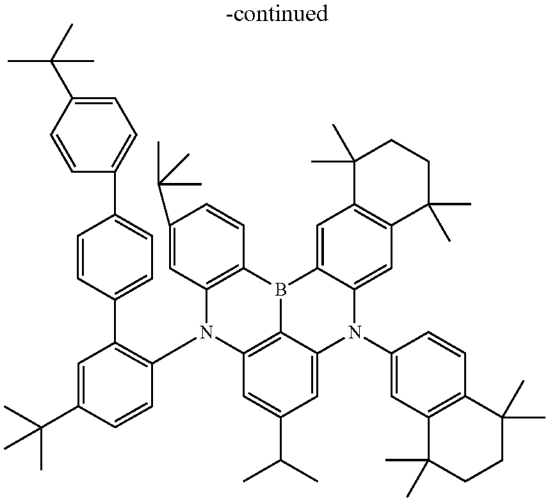
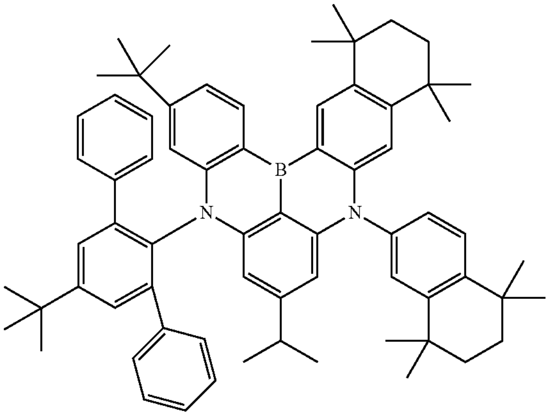
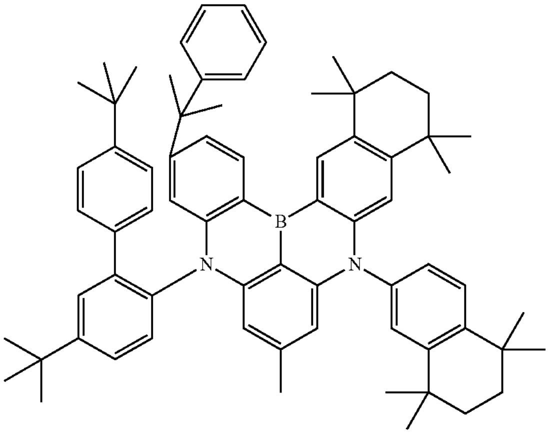
-continued
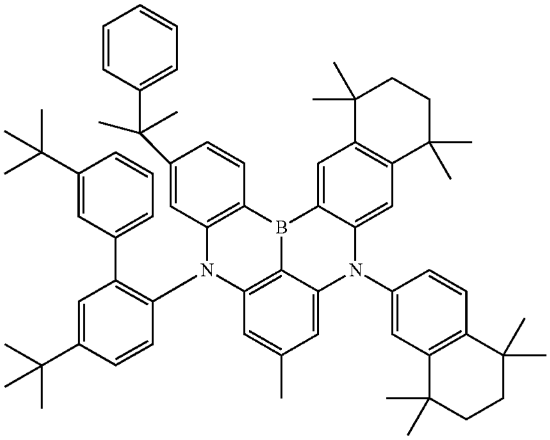
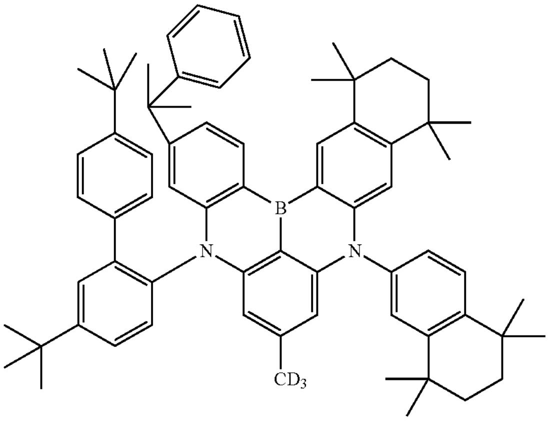
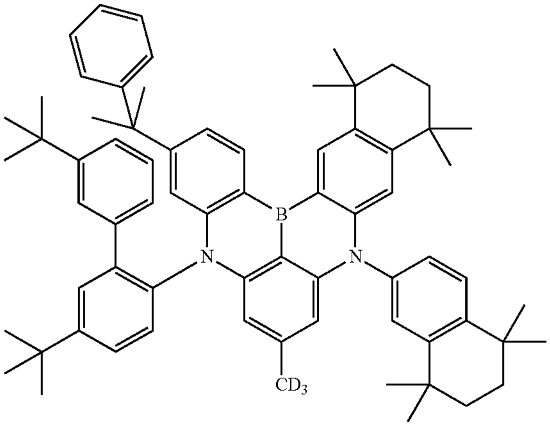
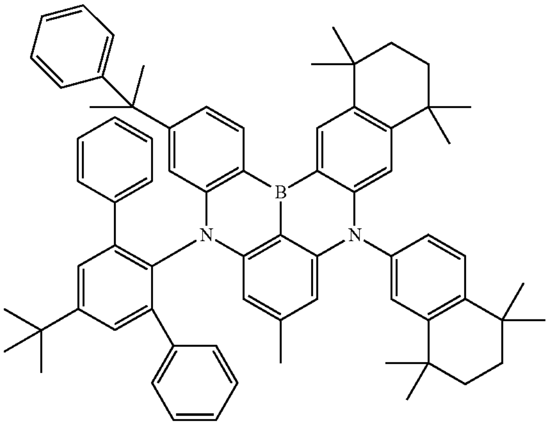

-continued
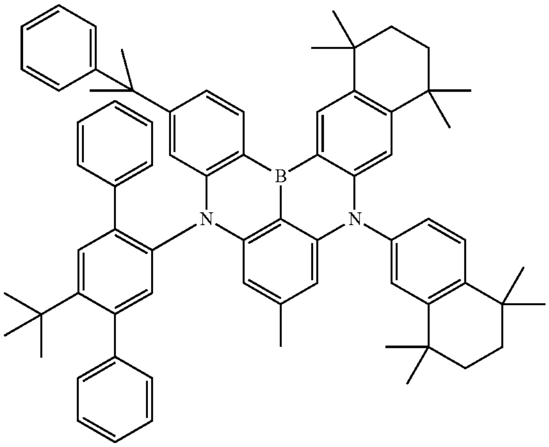
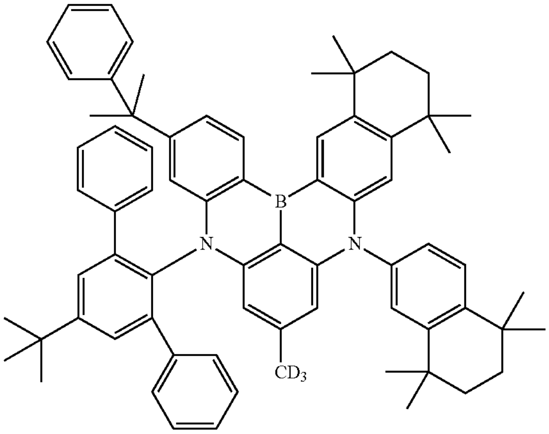
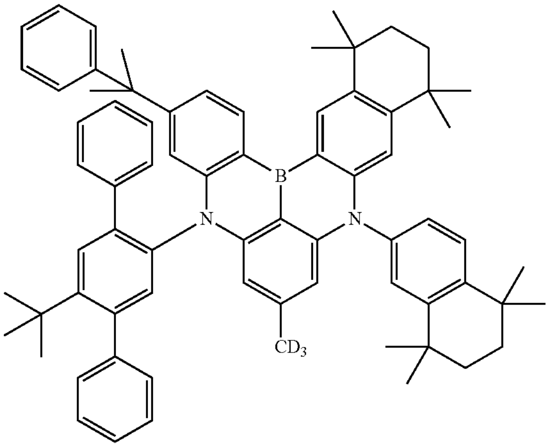
-continued
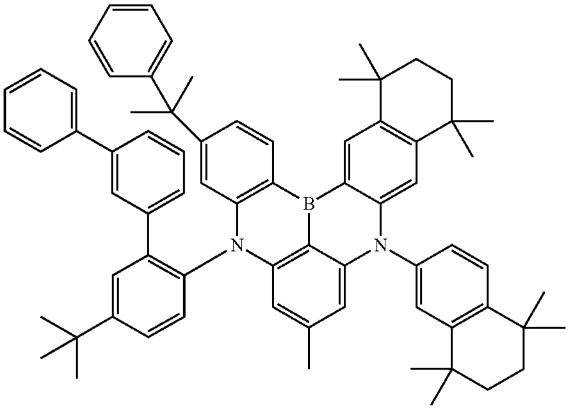
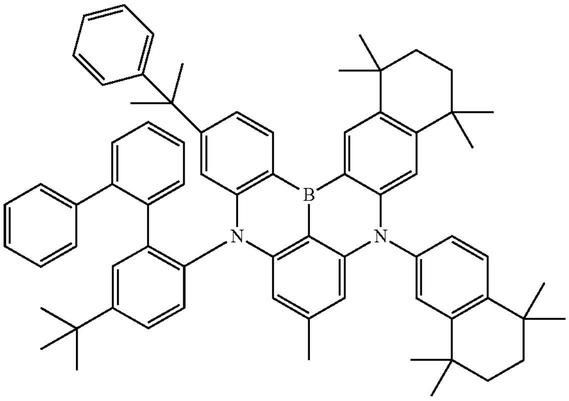
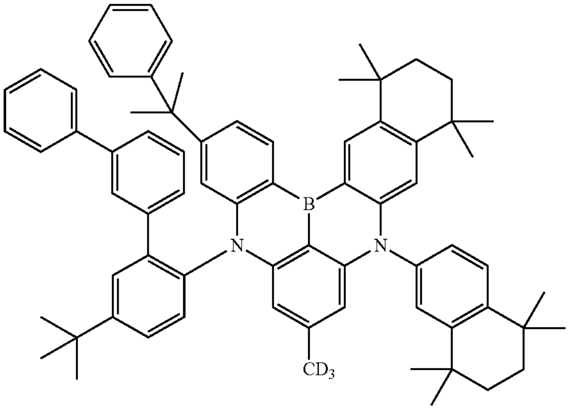
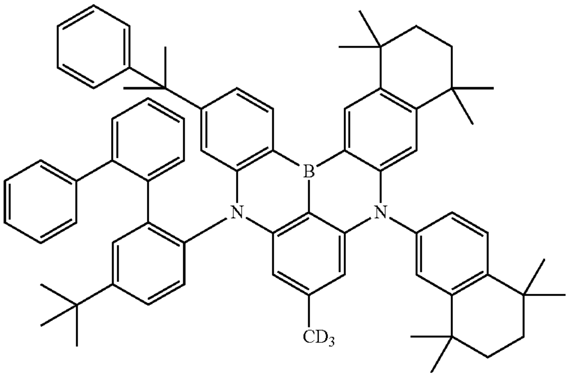

-continued
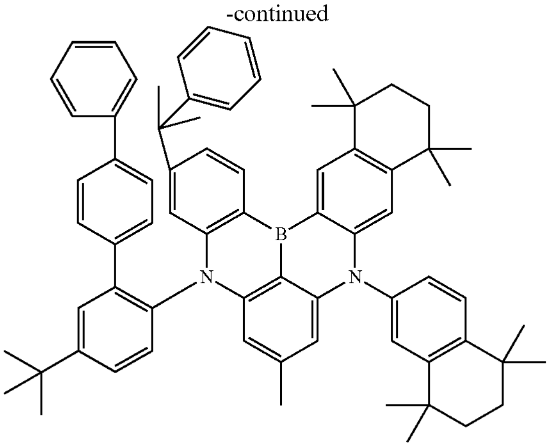
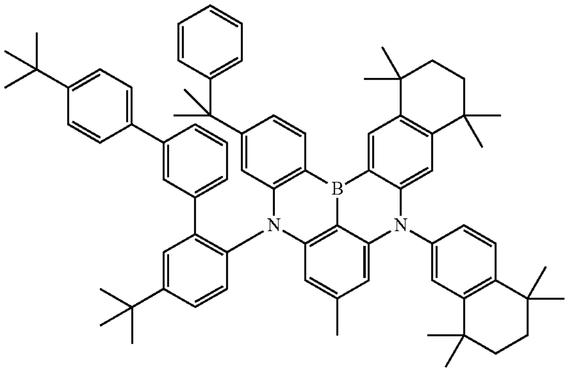
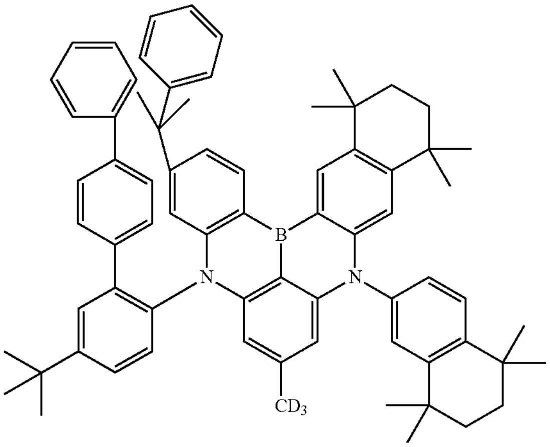
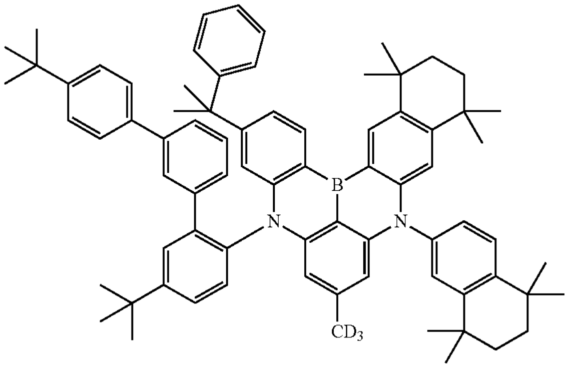
-continued
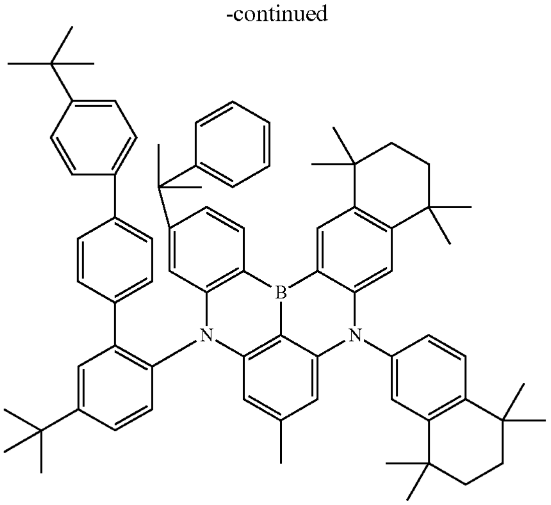
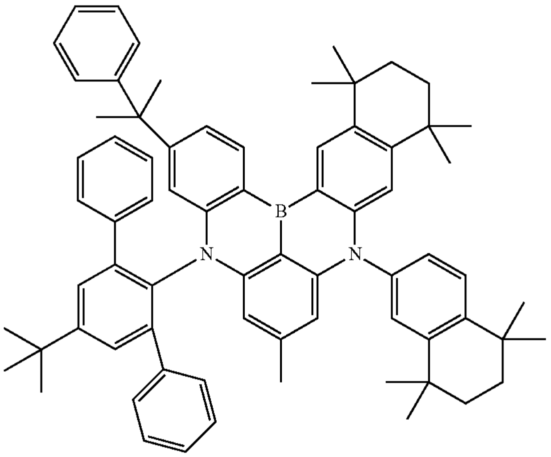
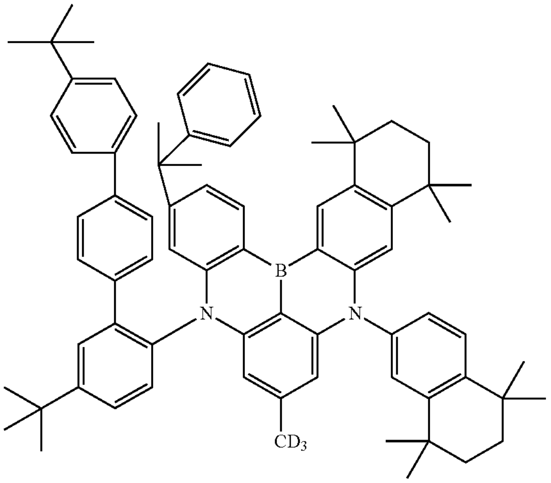

-continued
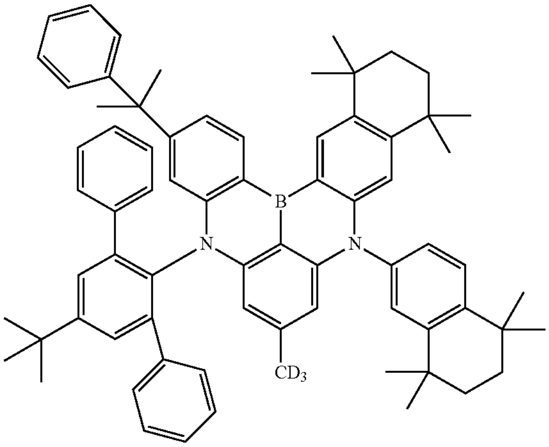 [SMILES: [2H]C([2H])([2H])c1cc2c3c(c1)N(c1c(-c4ccccc4)cc(C(C)(C)C)cc1-c1ccccc1)c1cc(C(C)(C)c4ccccc4)ccc1B3c1cc3c(cc1N2c1ccc2c(c1)C(C)(C)CCC2(C)C)C(C)(C)CCC3(C)C]
-continued
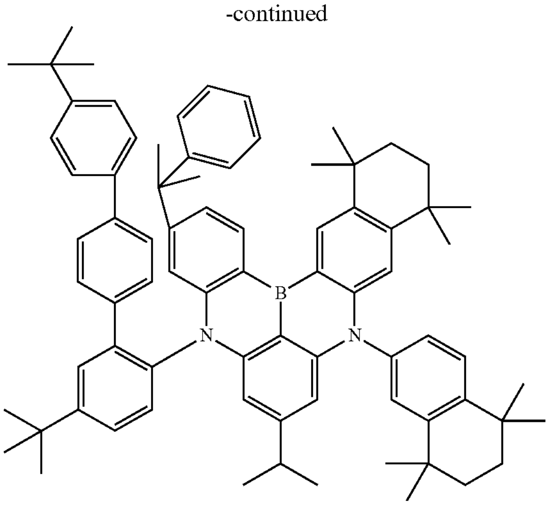
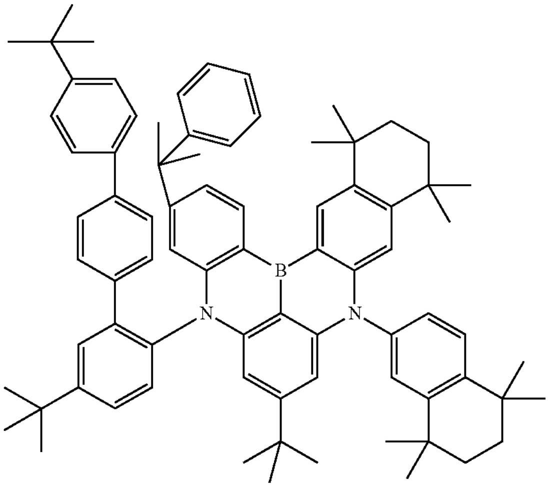
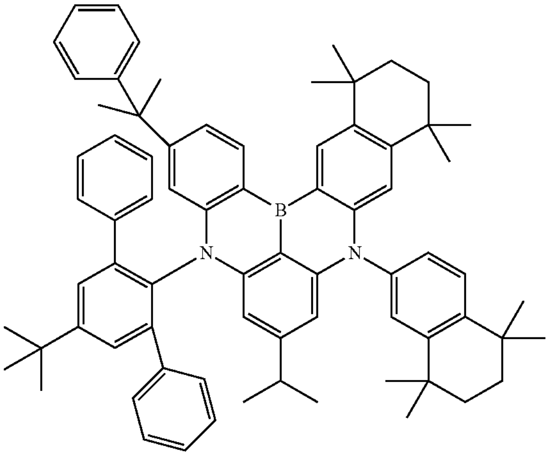 [SMILES: CC(C)c1cc2c3c(c1)N(c1c(-c4ccccc4)cc(C(C)(C)C)cc1-c1ccccc1)c1cc(C(C)(C)c4ccccc4)ccc1B3c1cc3c(cc1N2c1ccc2c(c1)C(C)(C)CCC2(C)C)C(C)(C)CCC3(C)C]
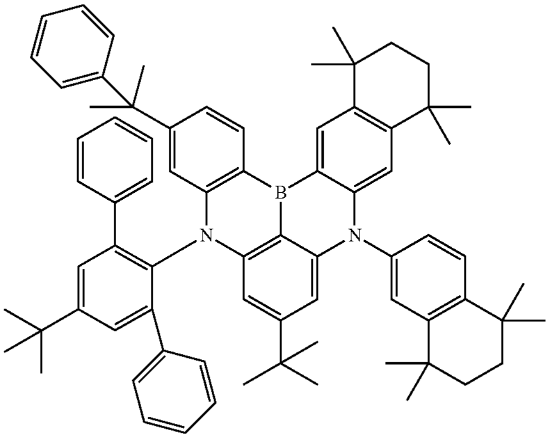
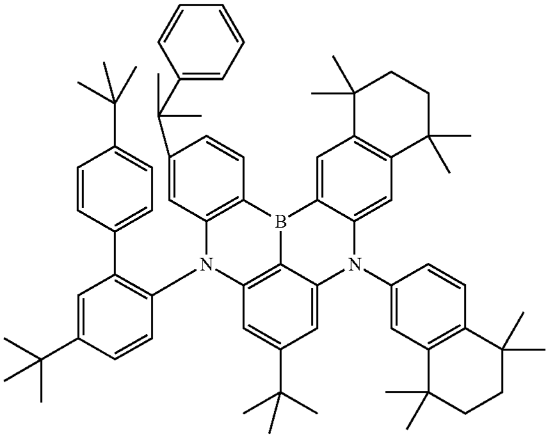

-continued
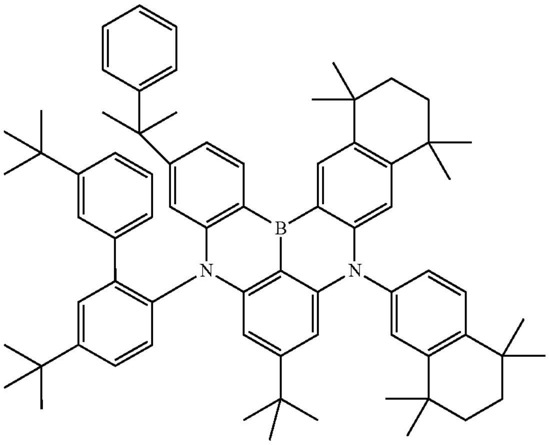
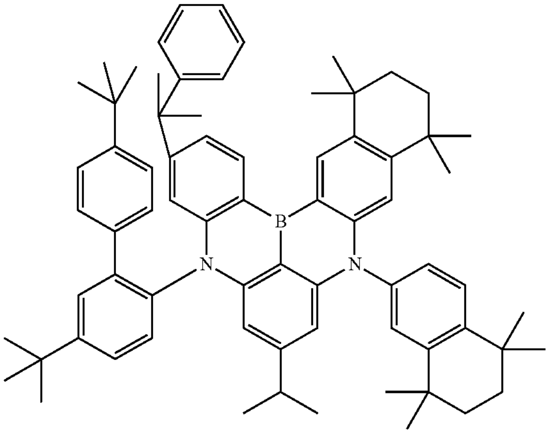
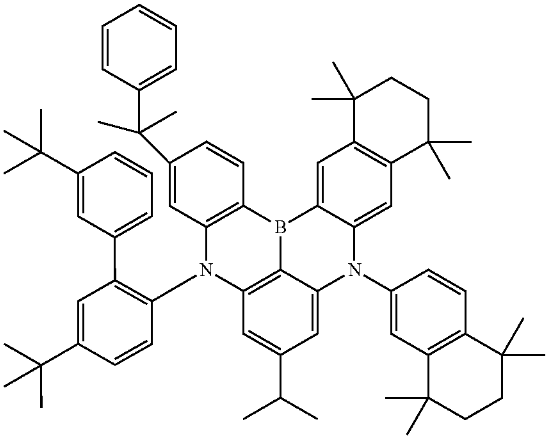
-continued
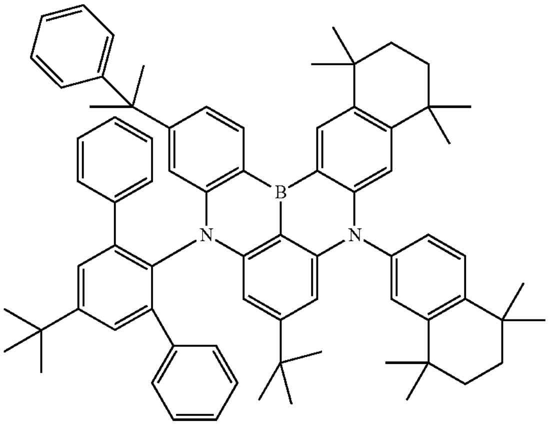
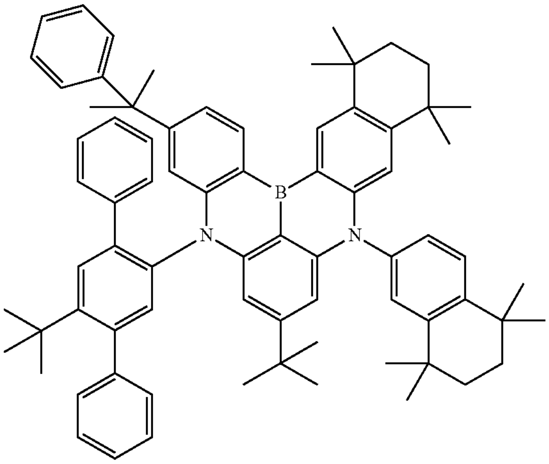
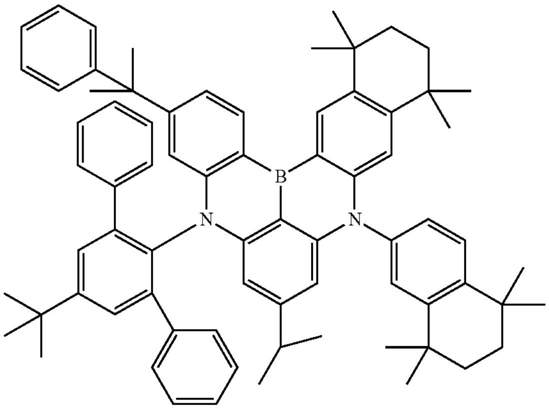

-continued
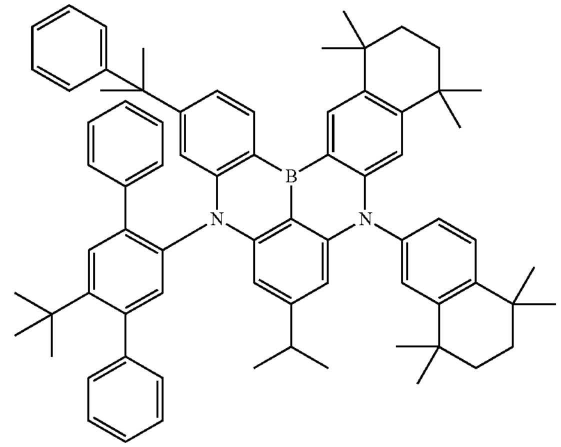
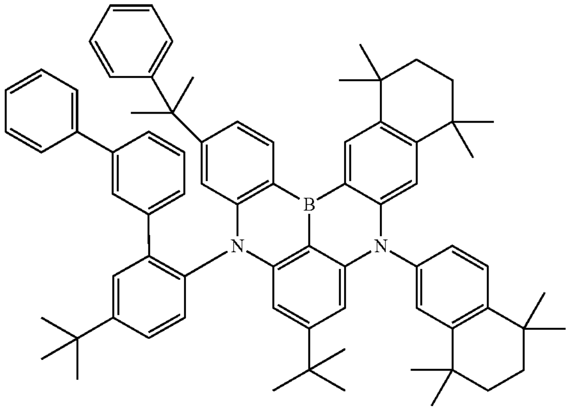
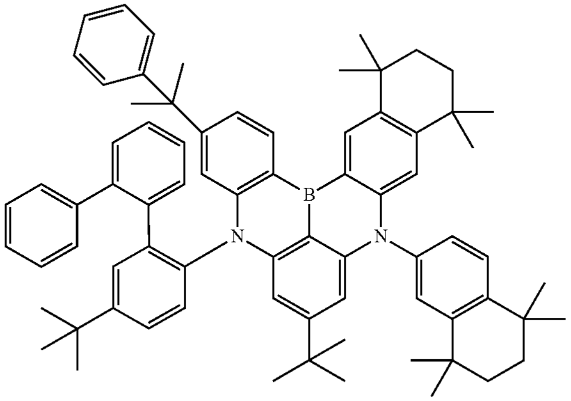
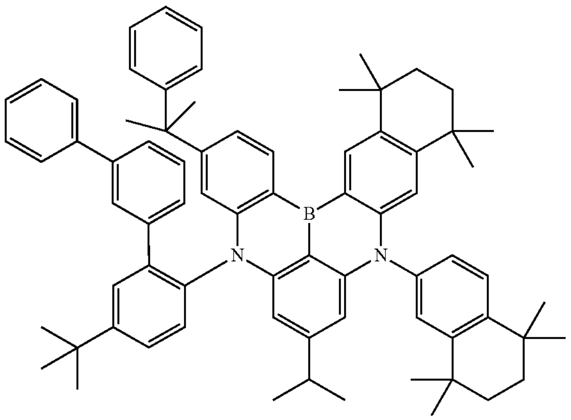
-continued
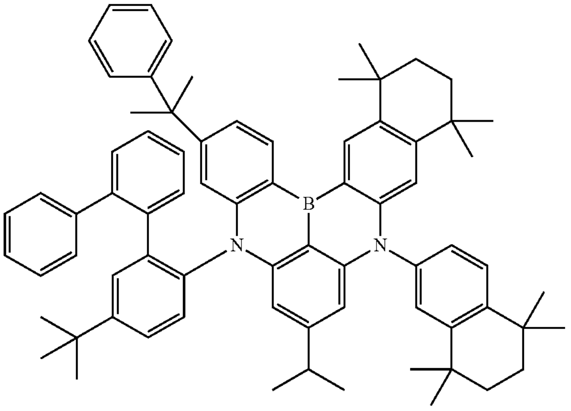
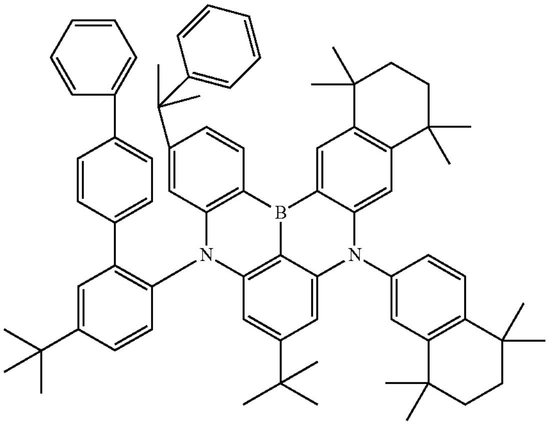
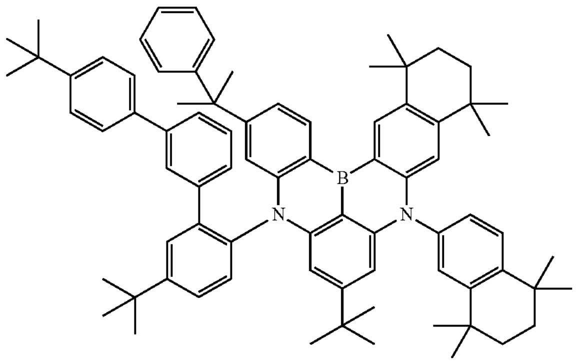
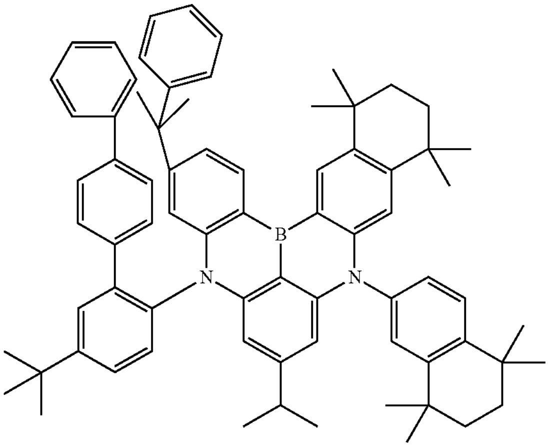

-continued
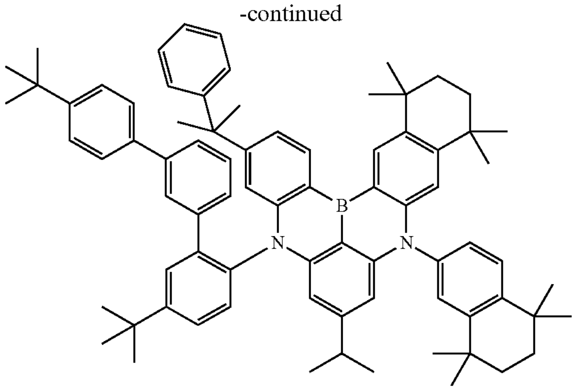
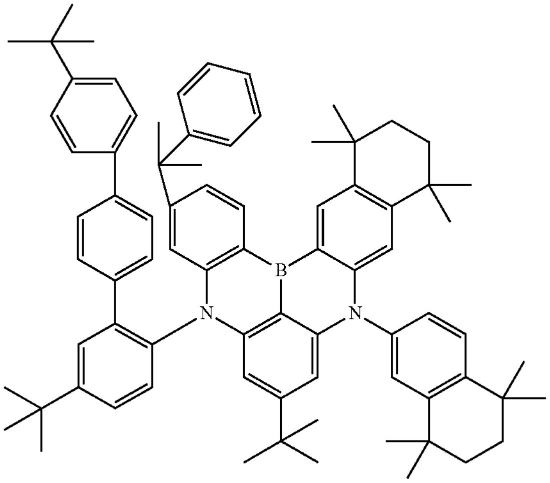
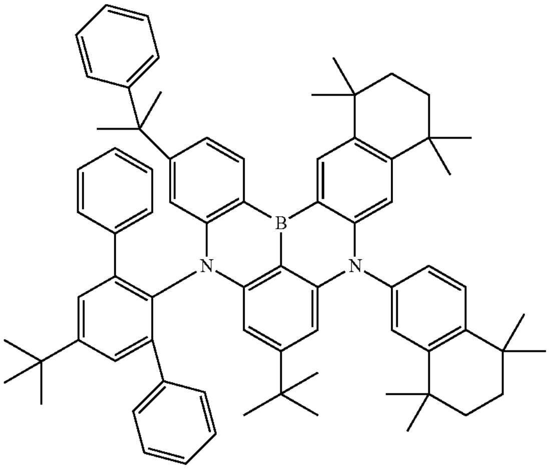
-continued
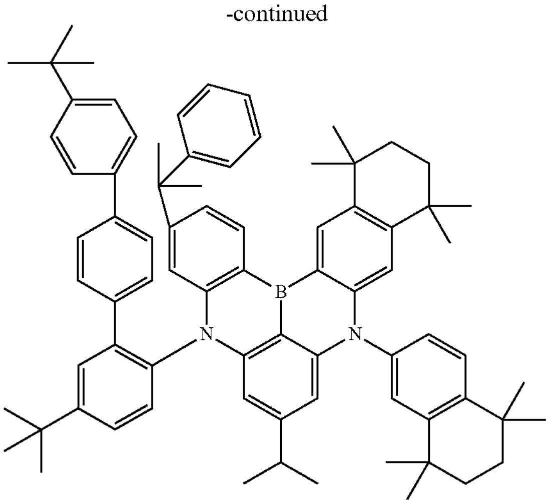
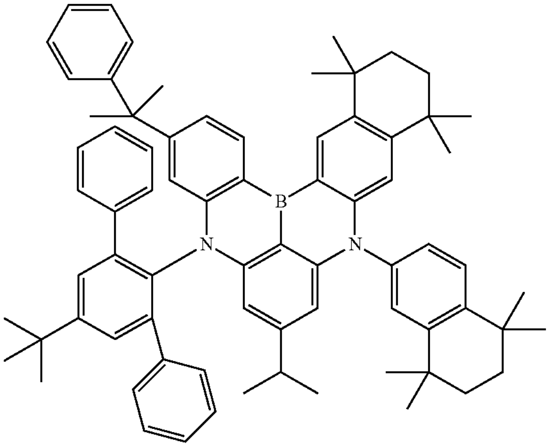 [SMILES: CC(C)c1cc2c3c(c1)N(c1c(-c4ccccc4)cc(C(C)(C)C)cc1-c1ccccc1)c1cc(C(C)(C)c4ccccc4)ccc1B3c1cc3c(cc1N2c1ccc2c(c1)C(C)(C)CCC2(C)C)C(C)(C)CCC3(C)C]
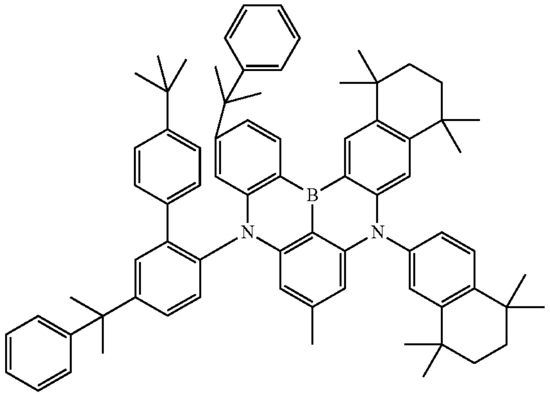
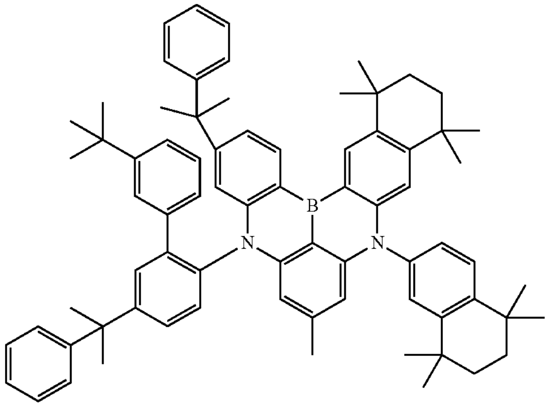

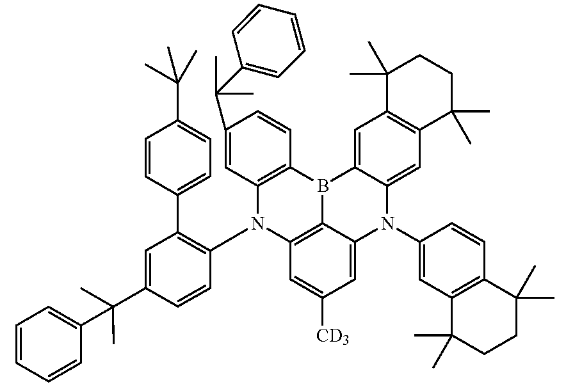
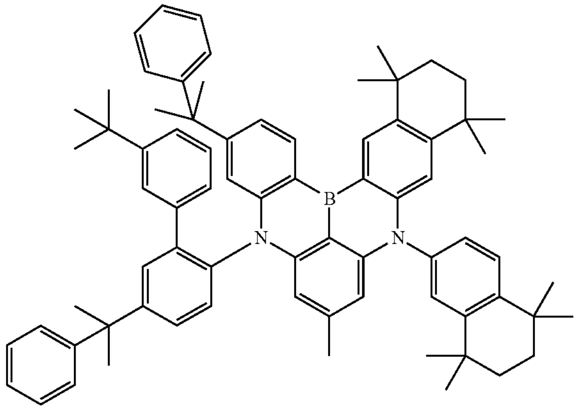
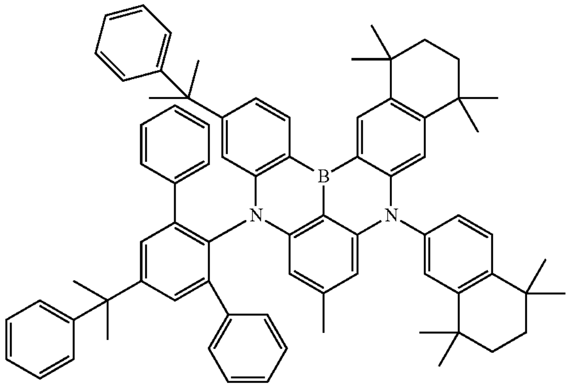
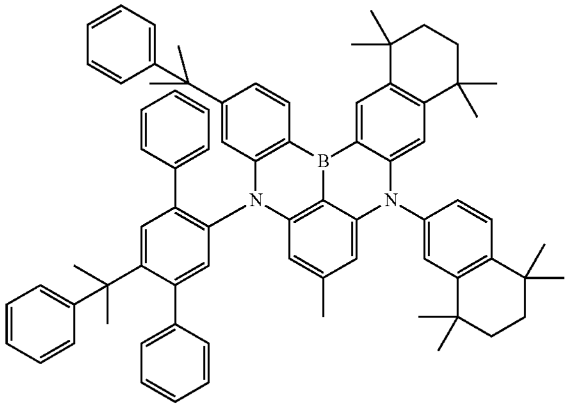
-continued
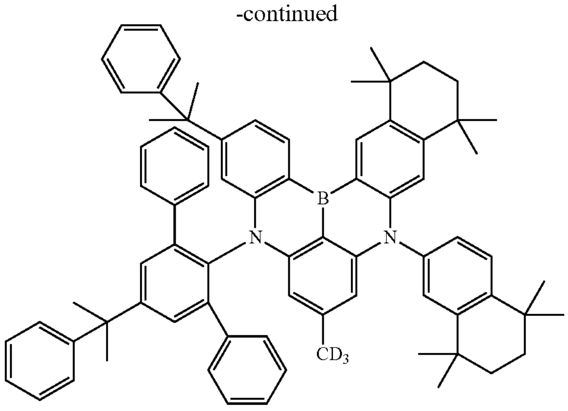
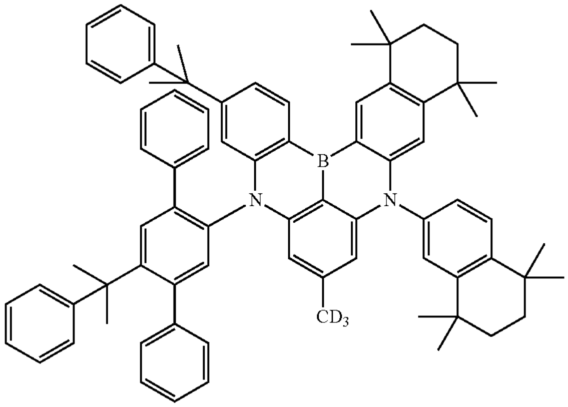
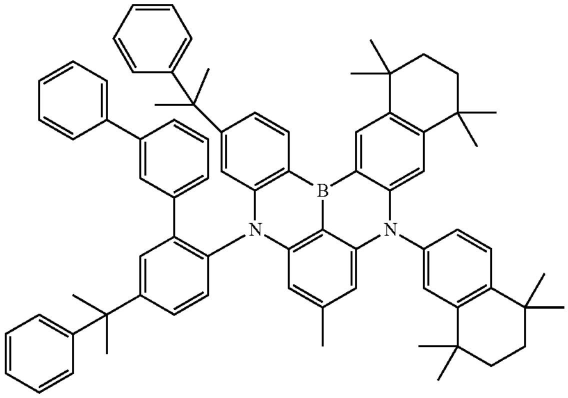
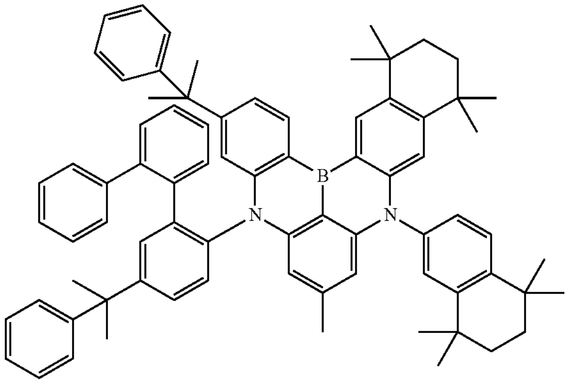

-continued
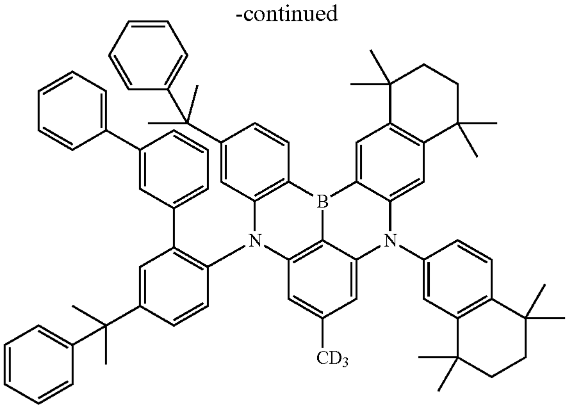
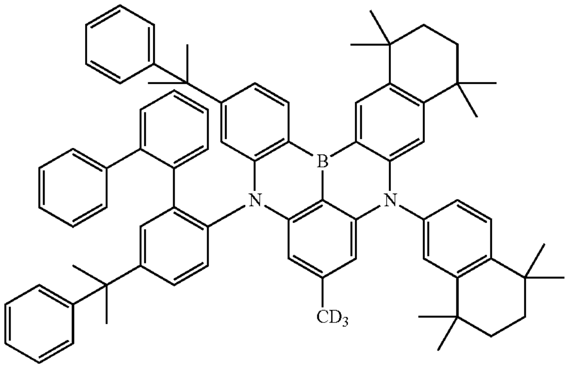
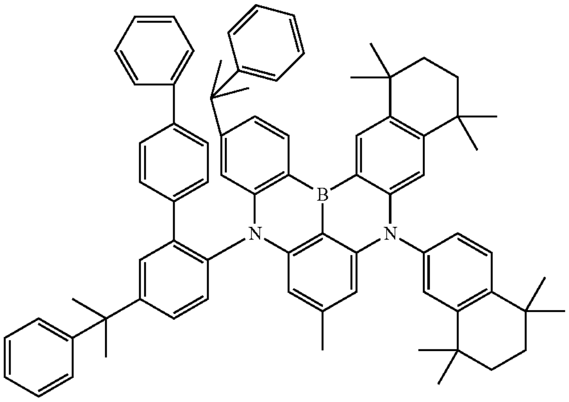
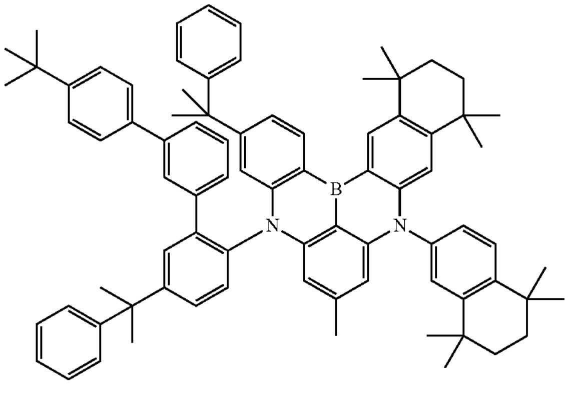
-continued
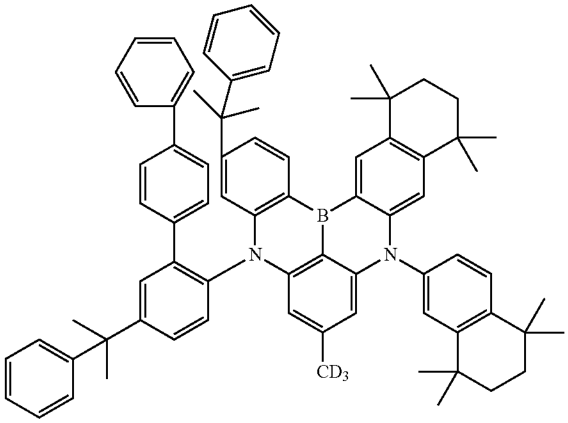
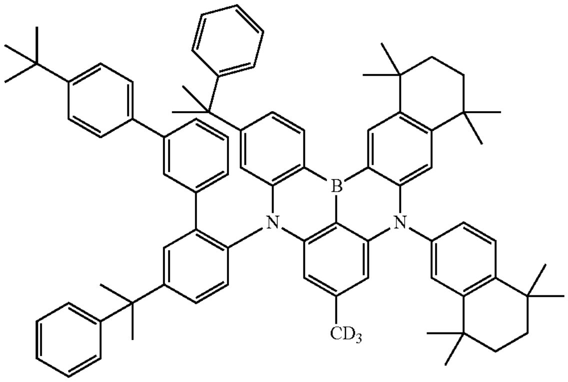
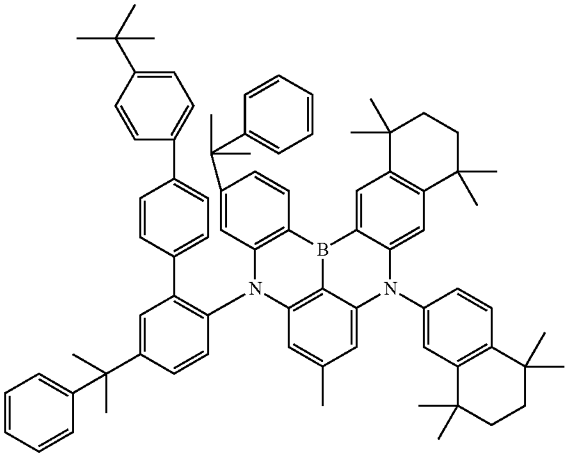
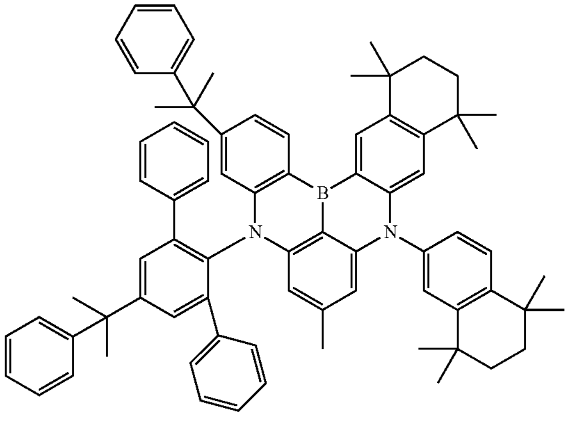

-continued
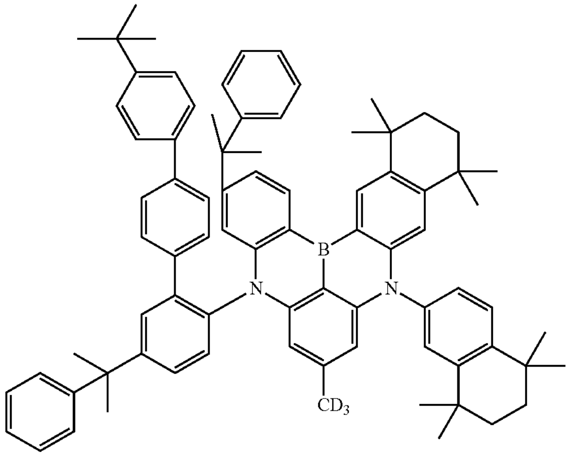
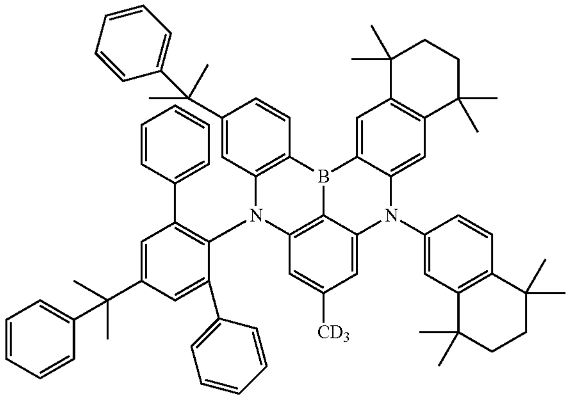
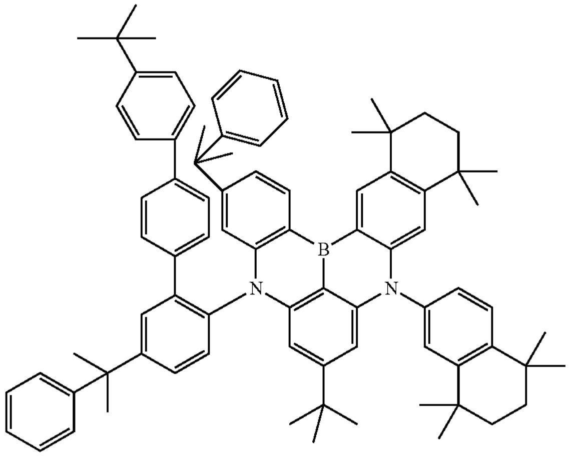
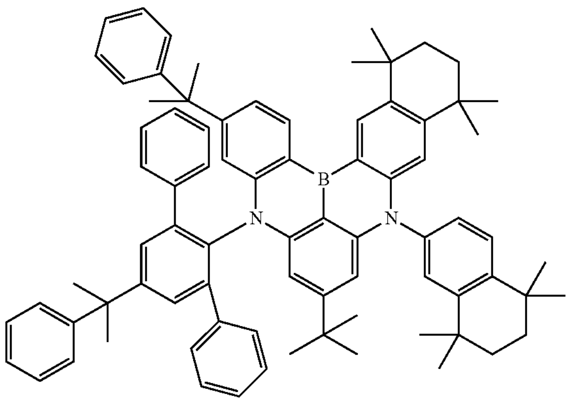
-continued
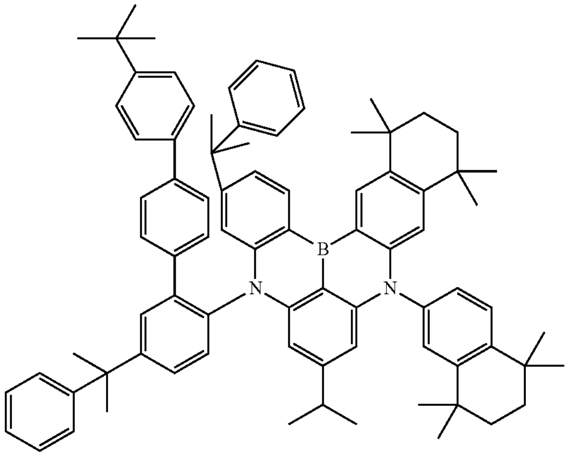
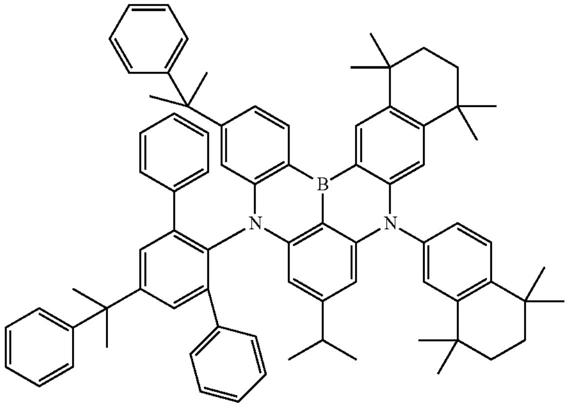
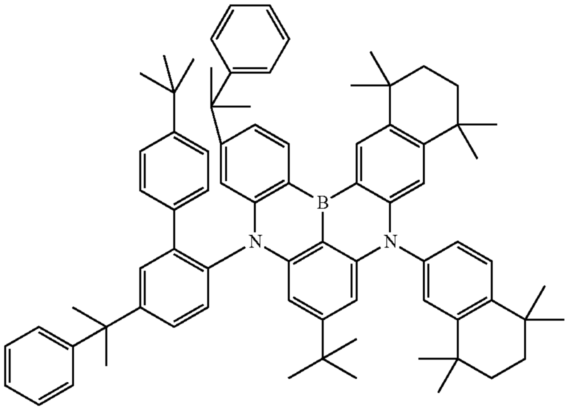
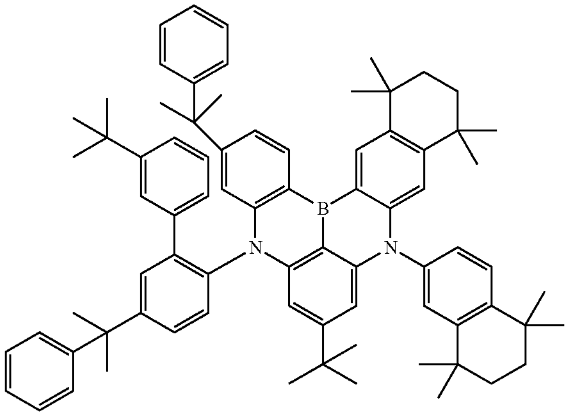

-continued
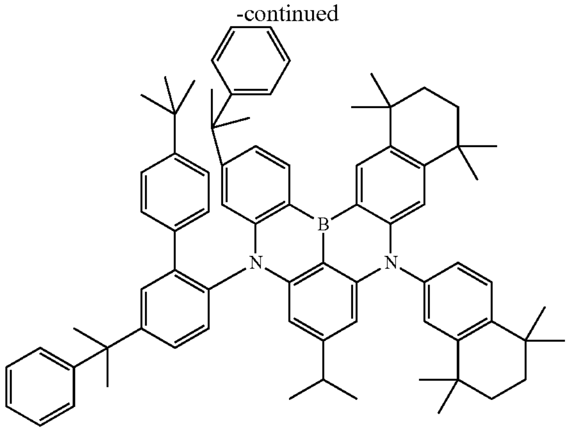
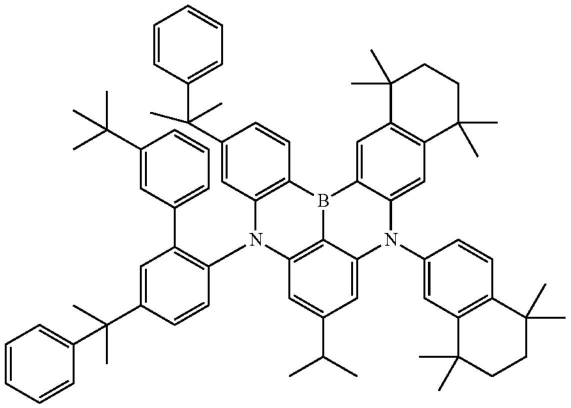
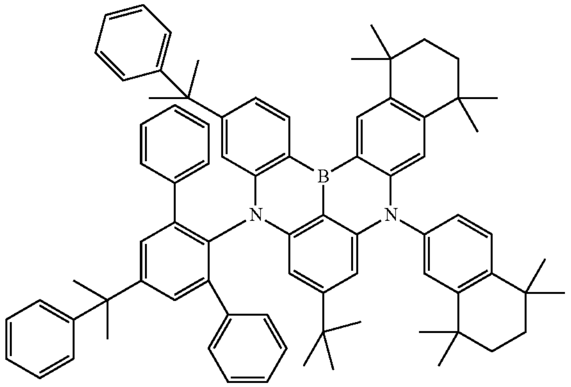
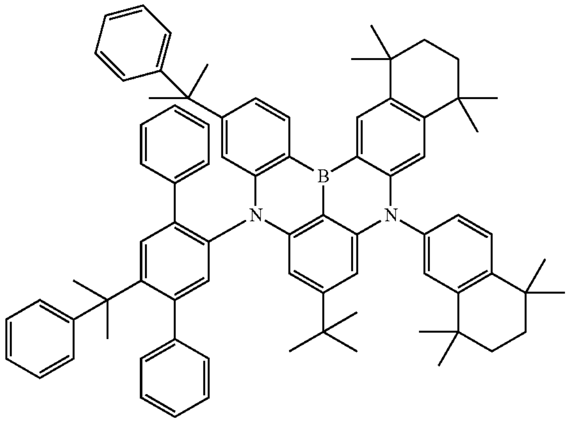
-continued
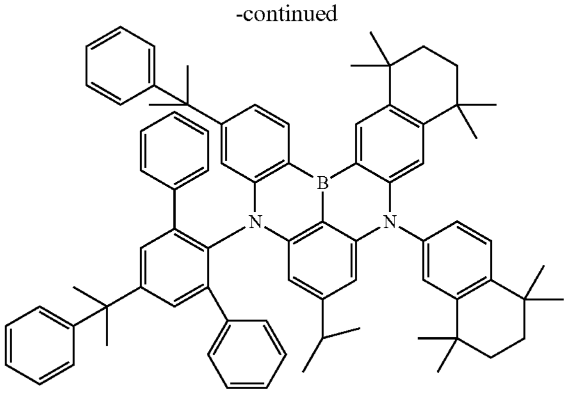
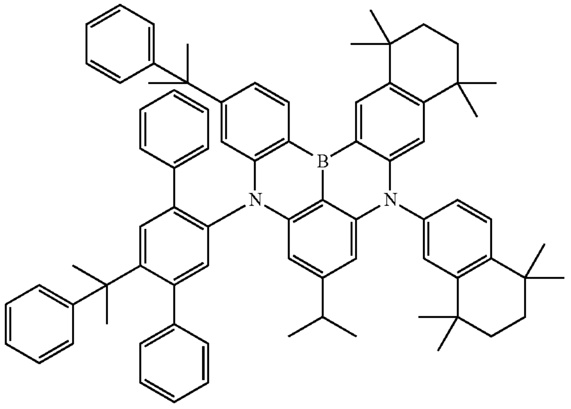
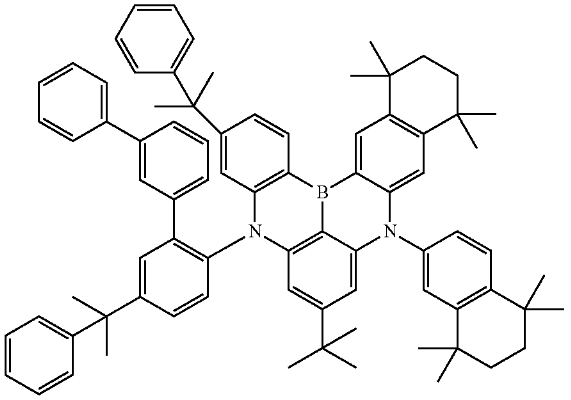
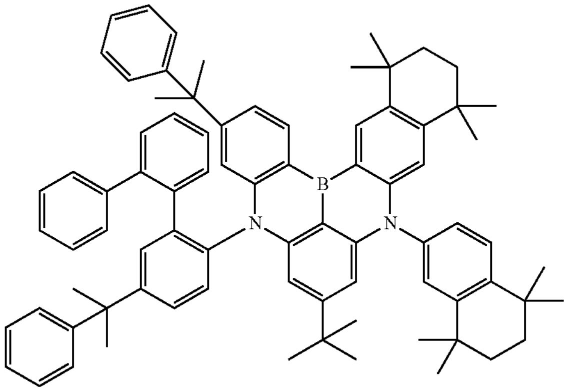

-continued
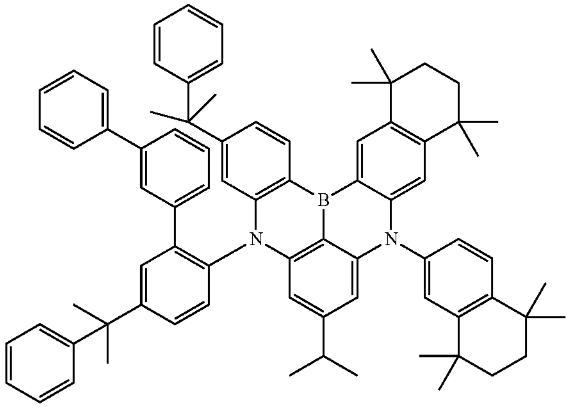
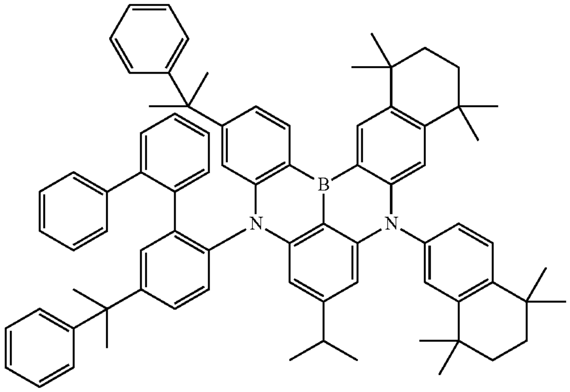
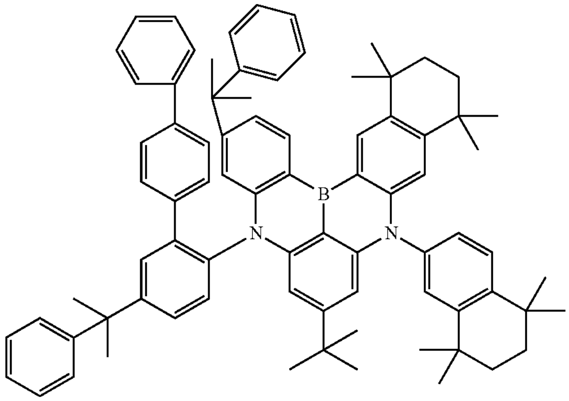
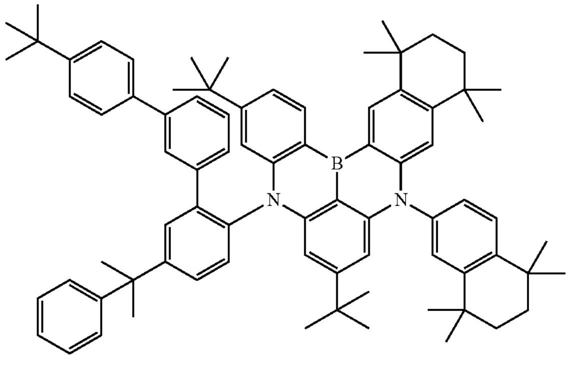
-continued
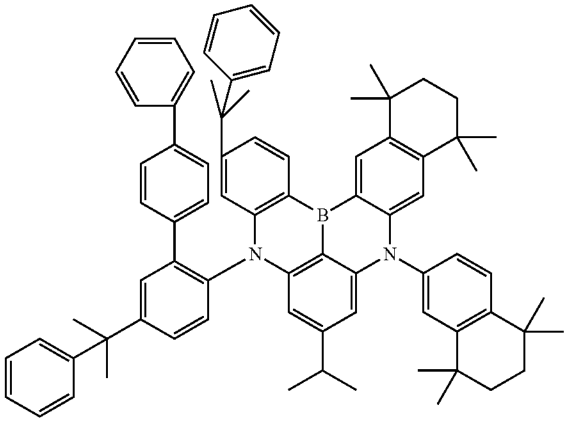
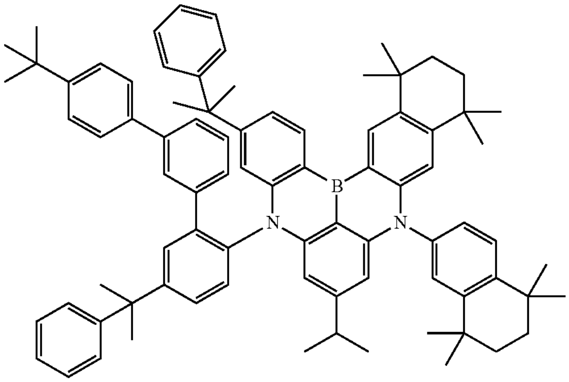
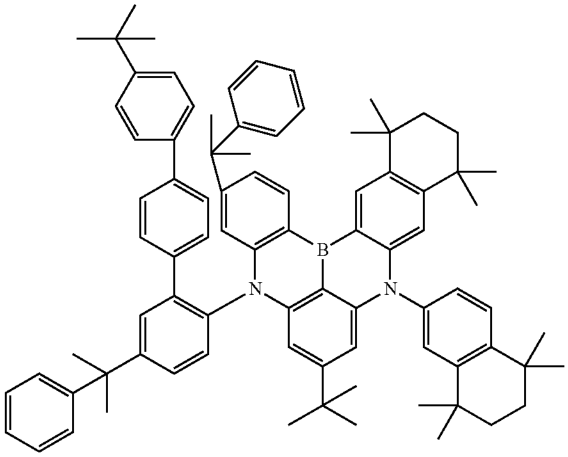
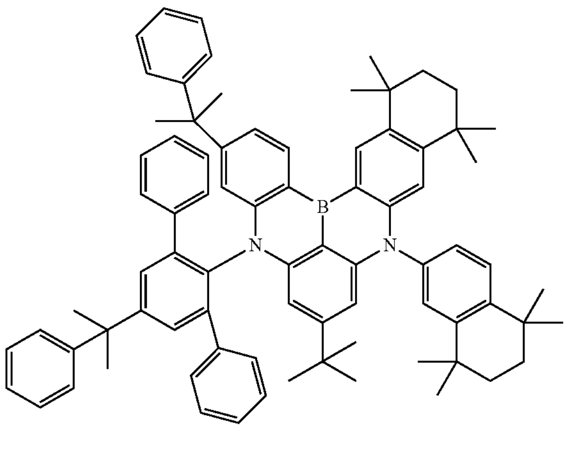

-continued
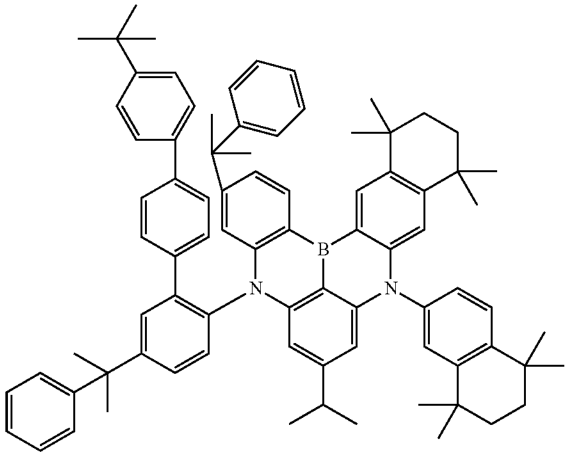
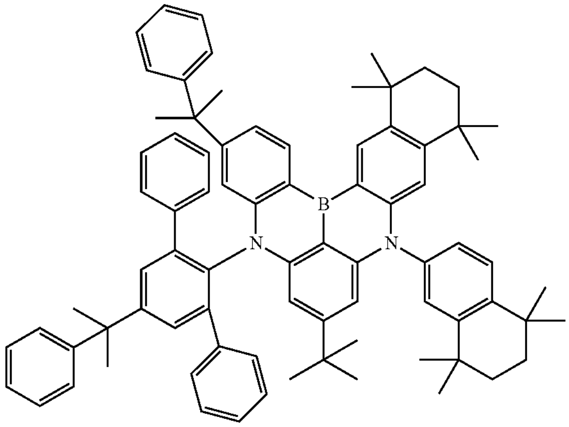
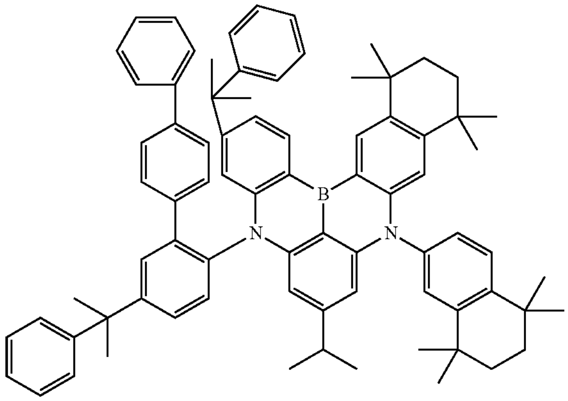
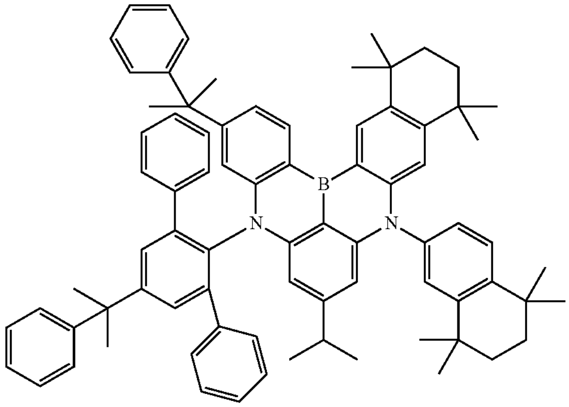
-continued
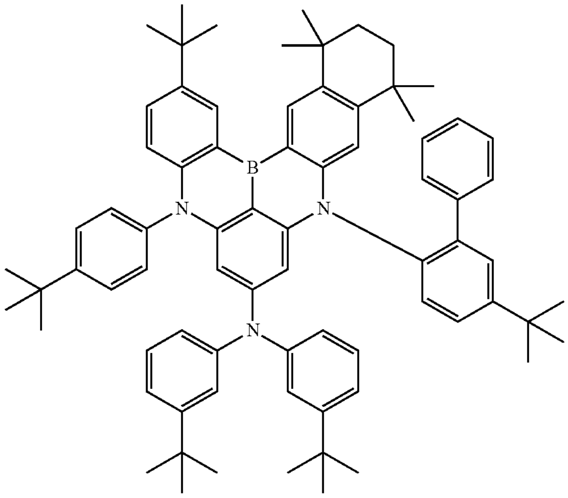
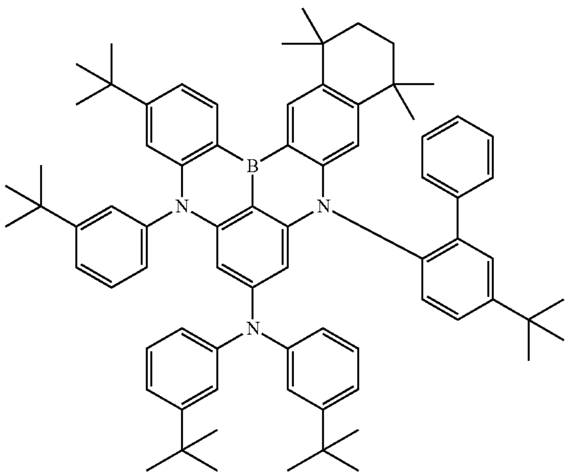
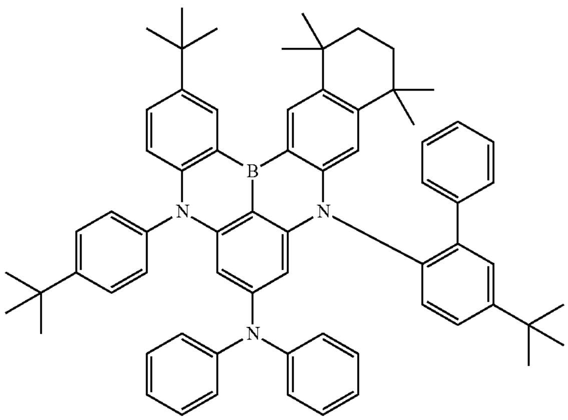

-continued
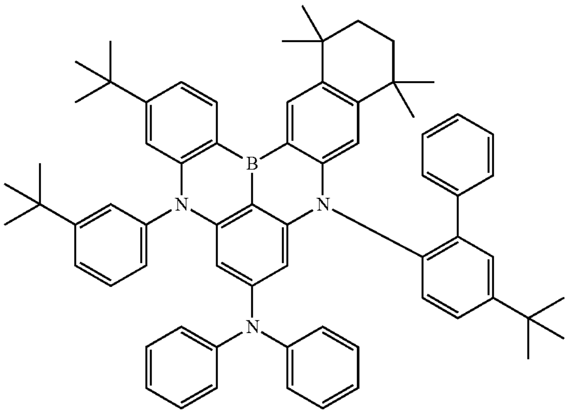
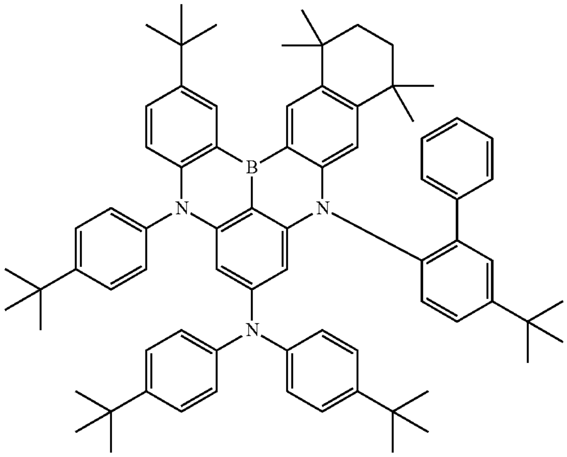
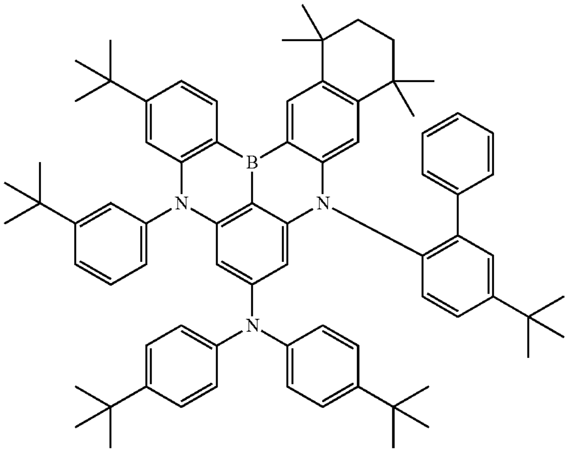
-continued
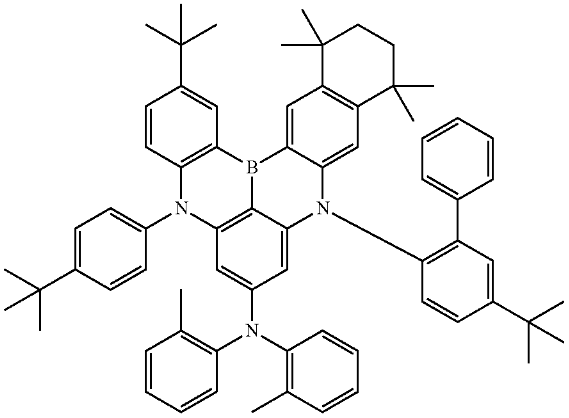
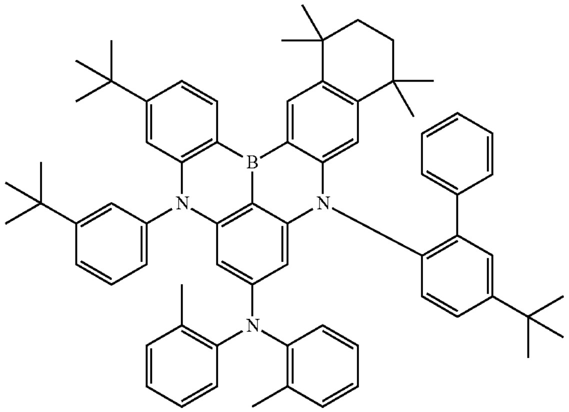
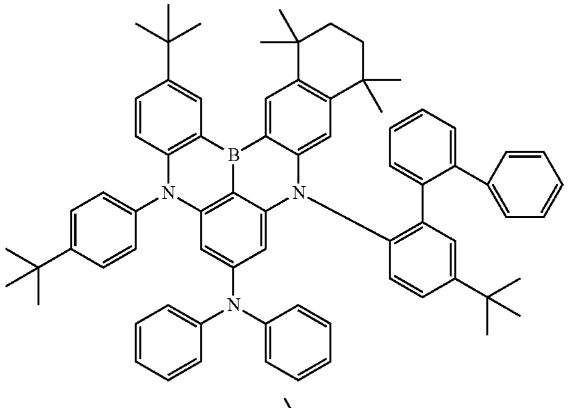
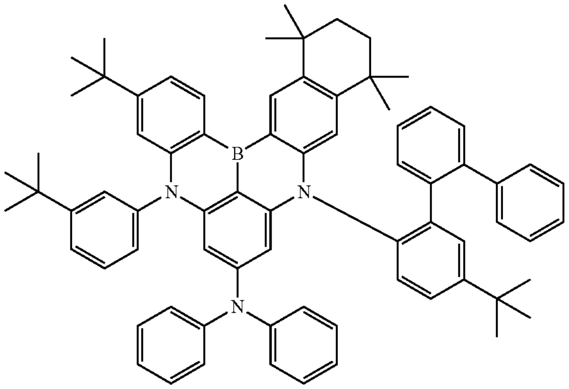

-continued
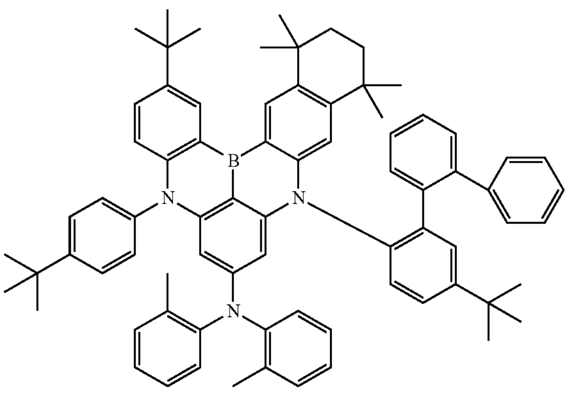
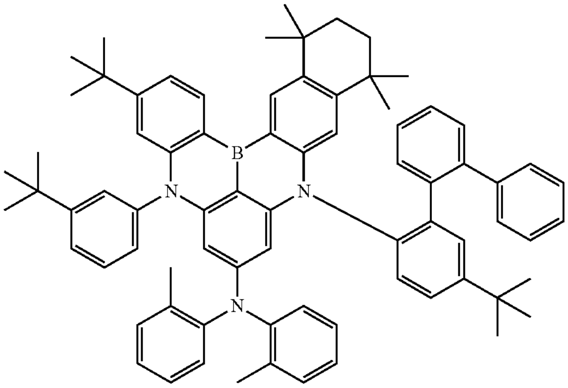
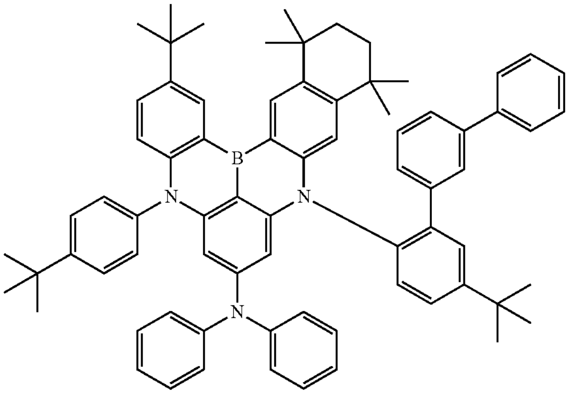
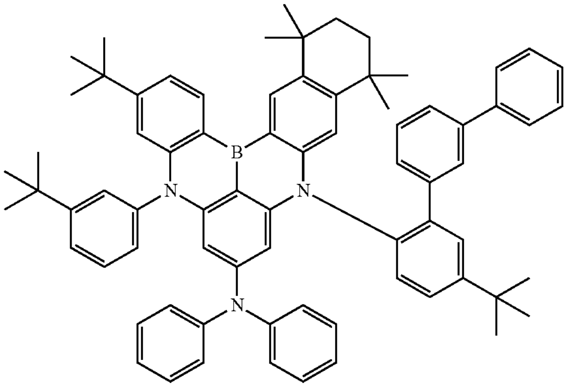
-continued
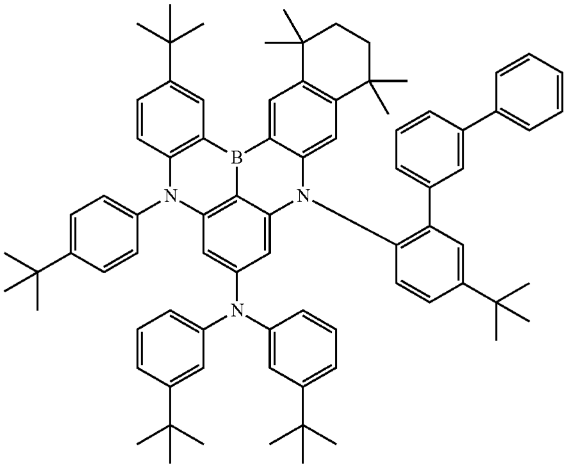
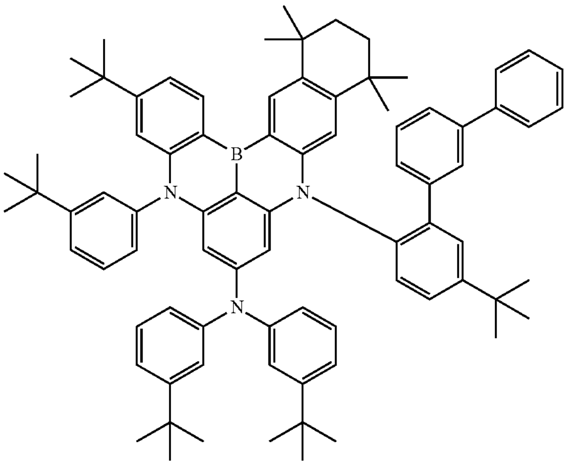
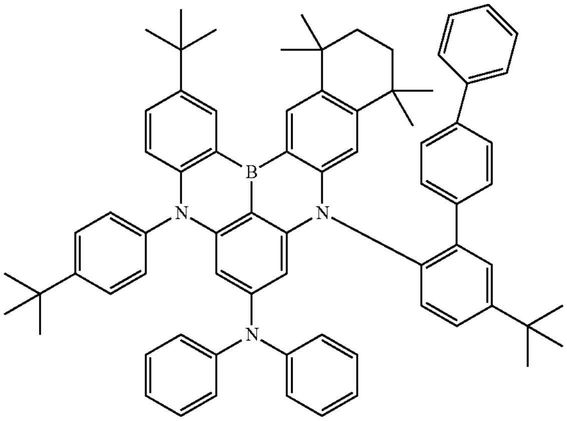

-continued
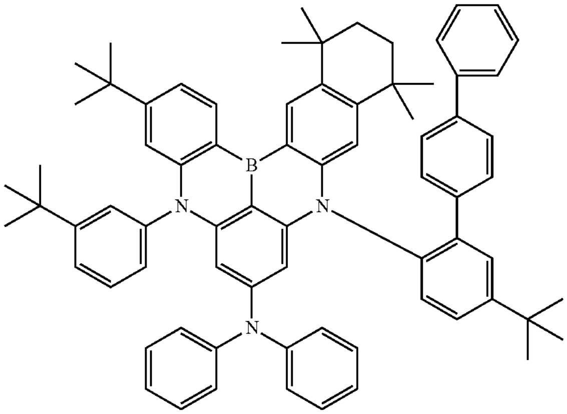
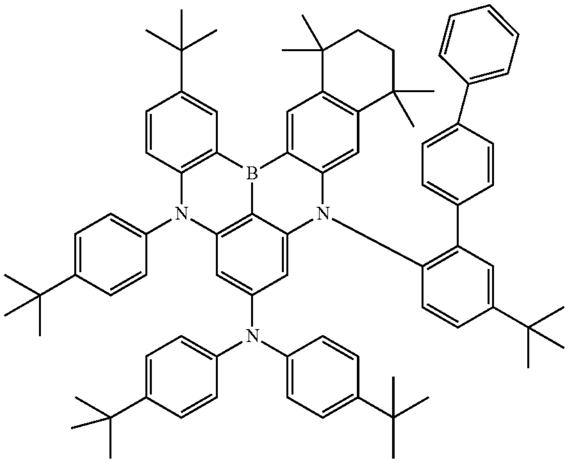
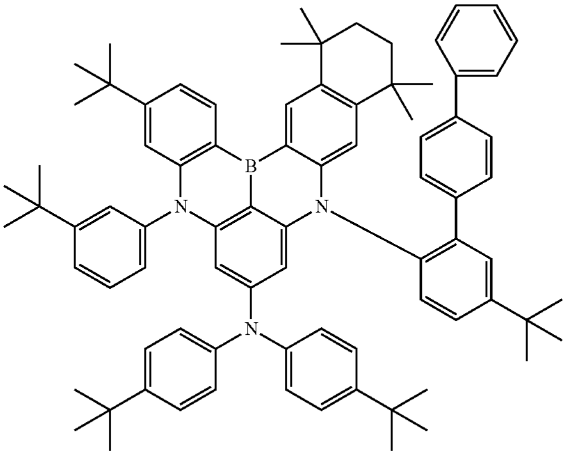
-continued
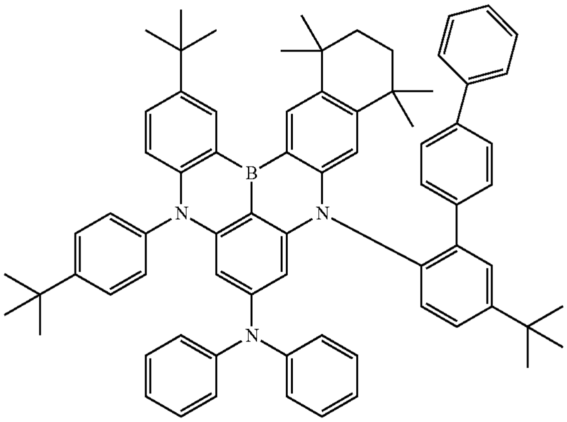
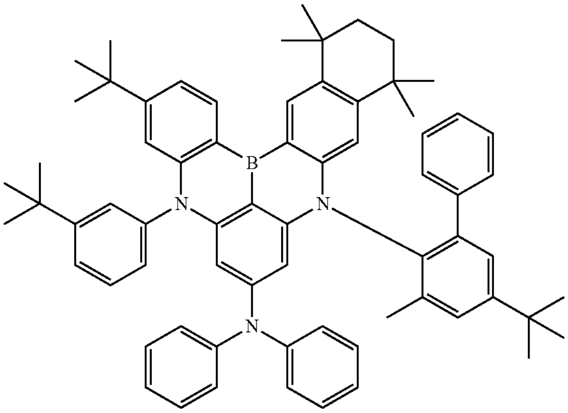
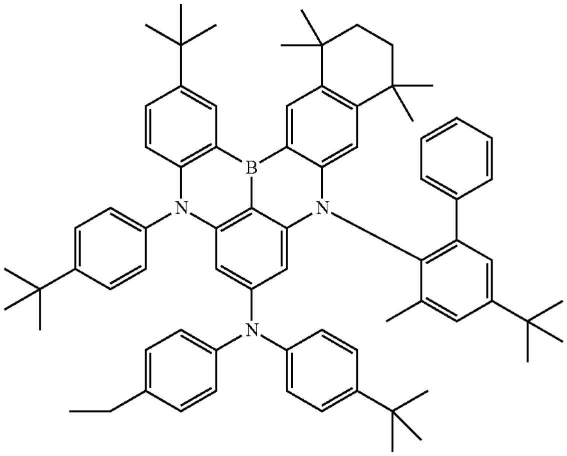

-continued
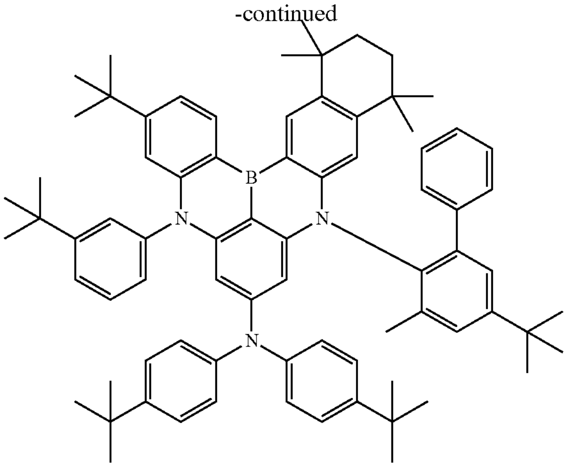
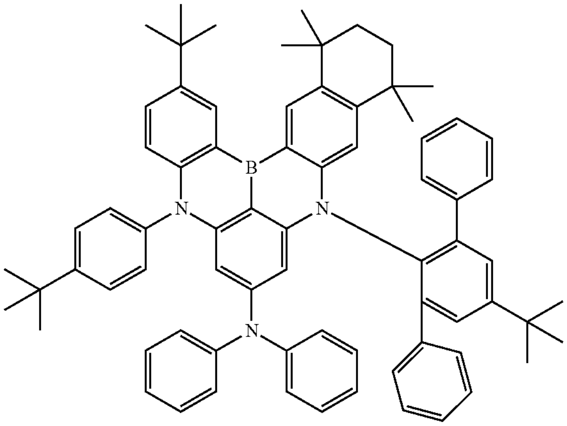
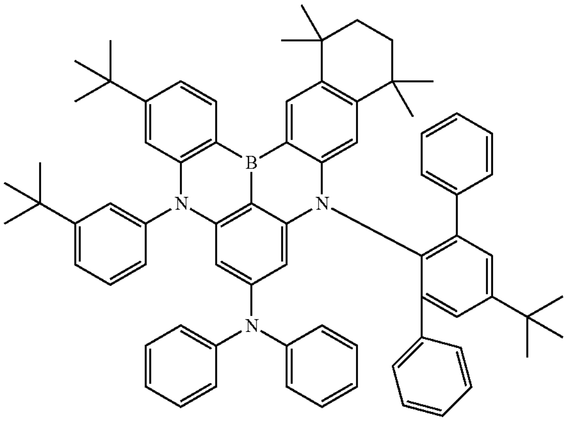
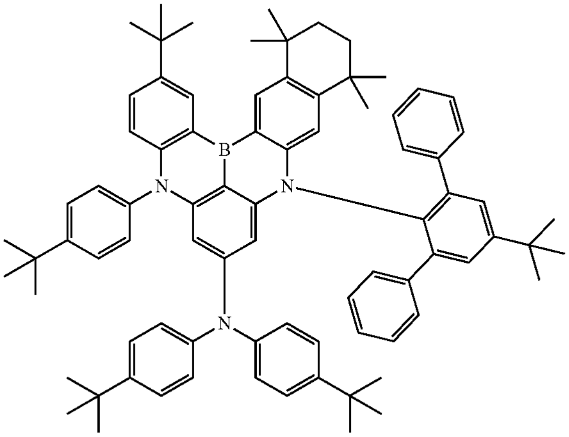
-continued
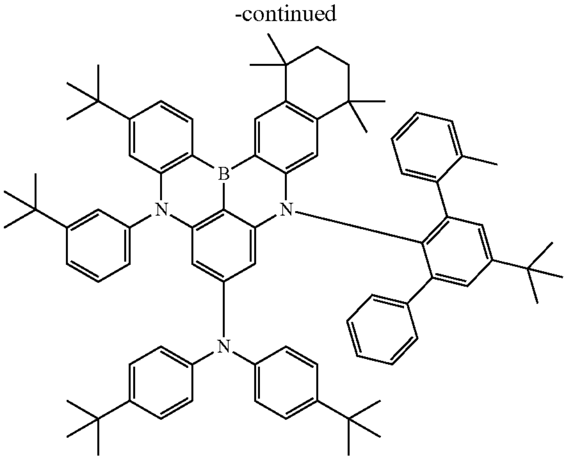
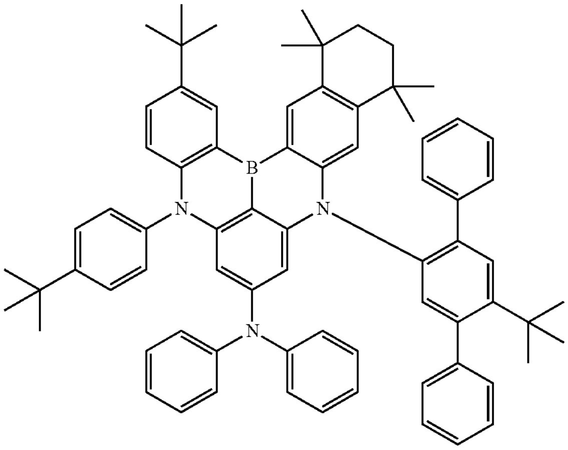
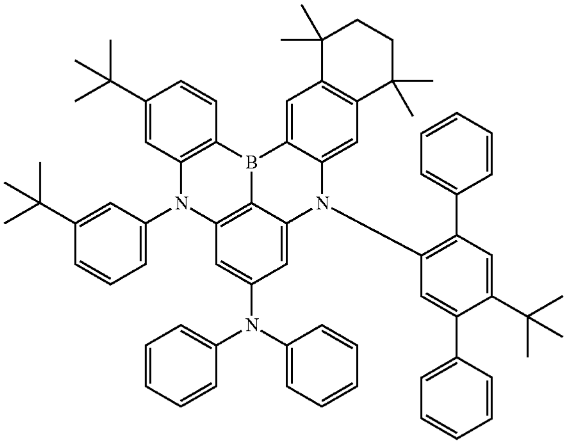

-continued
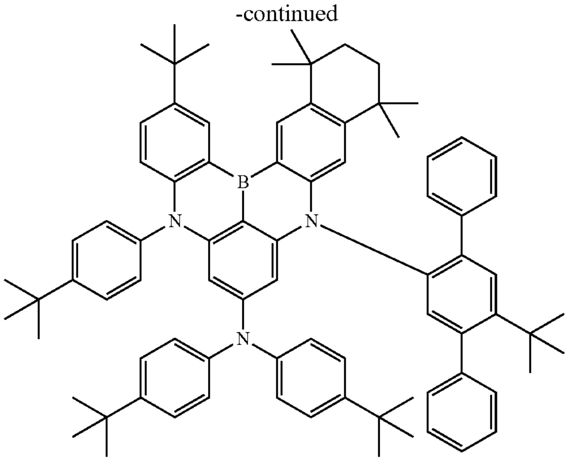
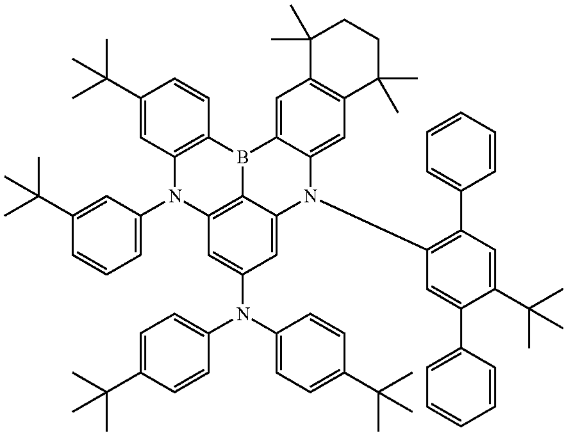
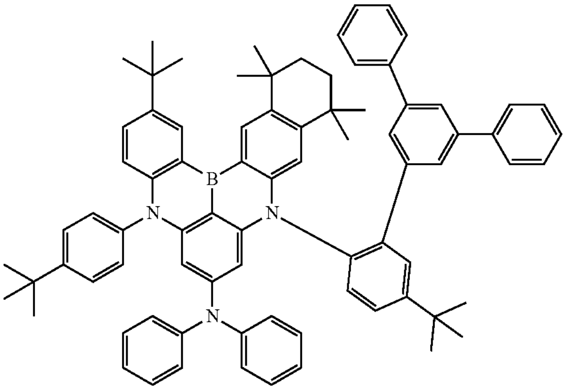
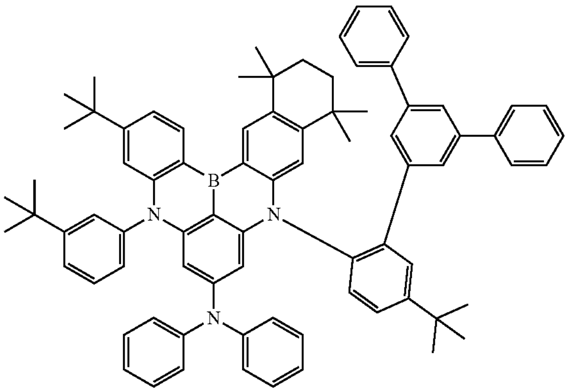
-continued
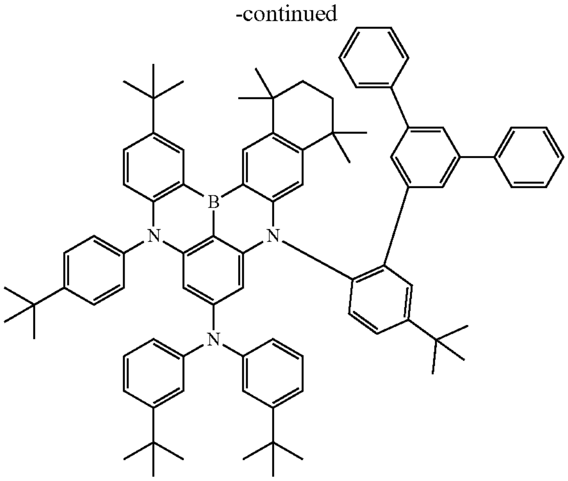
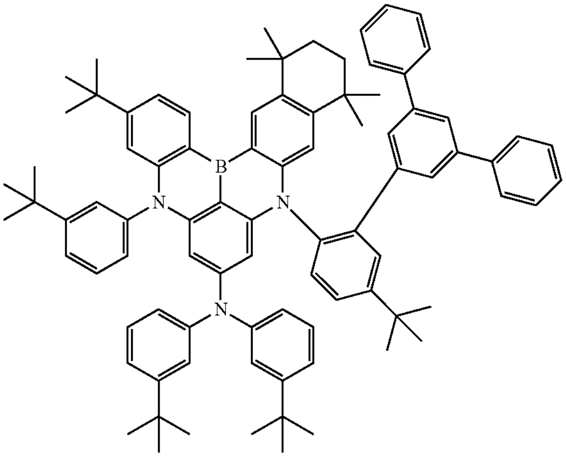
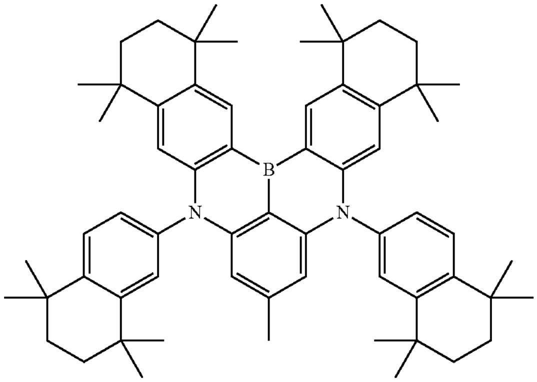
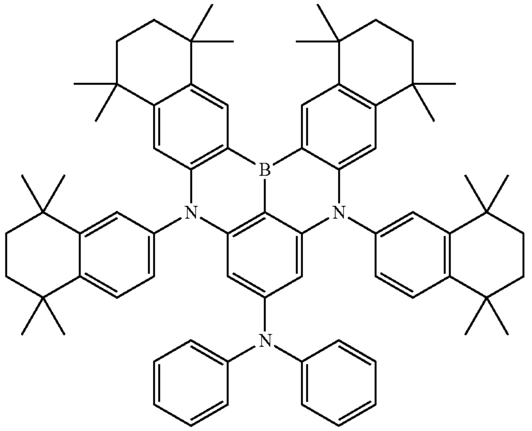

-continued
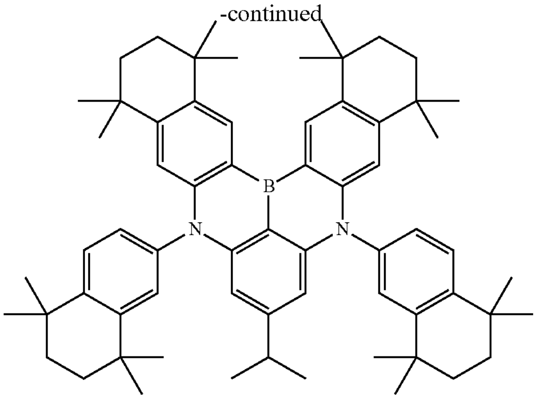
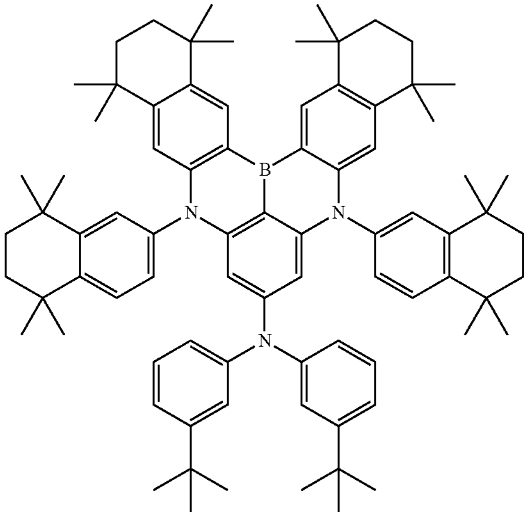
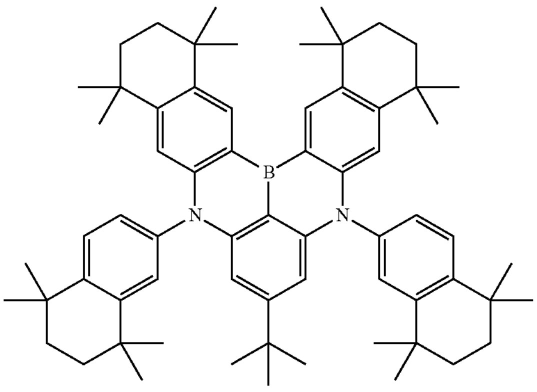
-continued
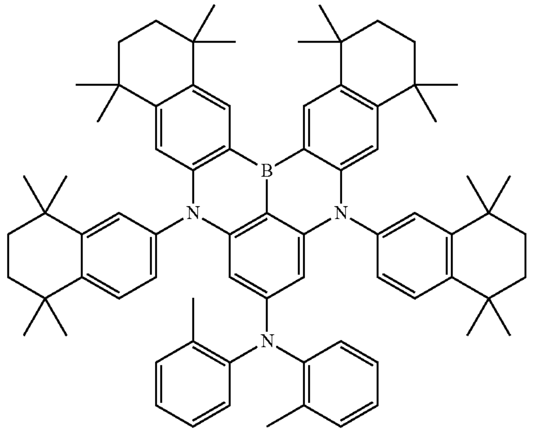
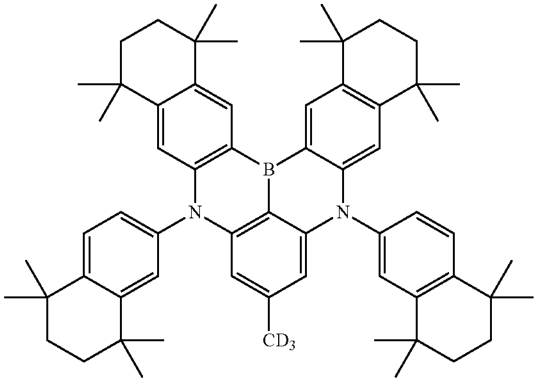
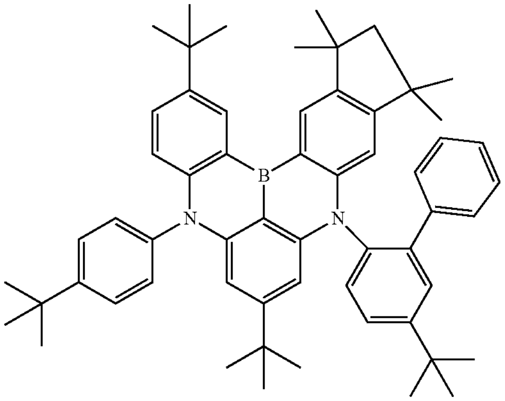
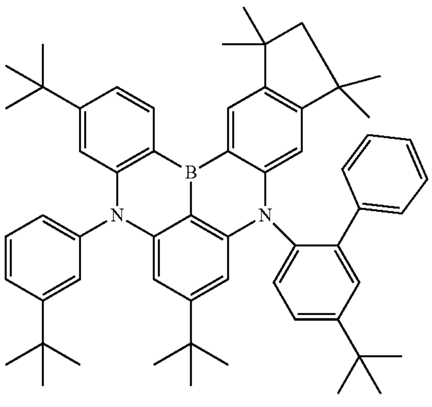

-continued
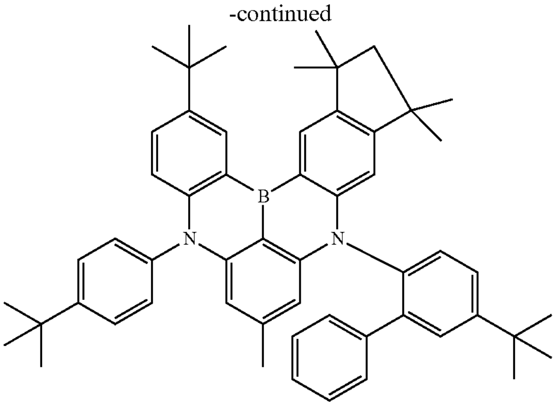
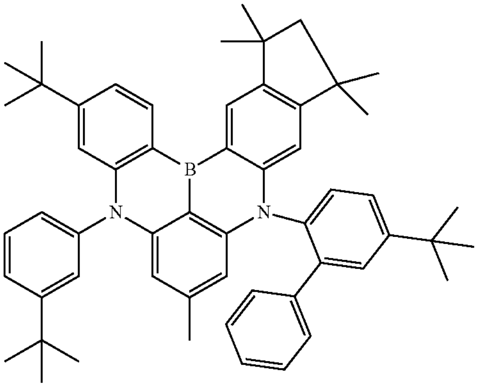
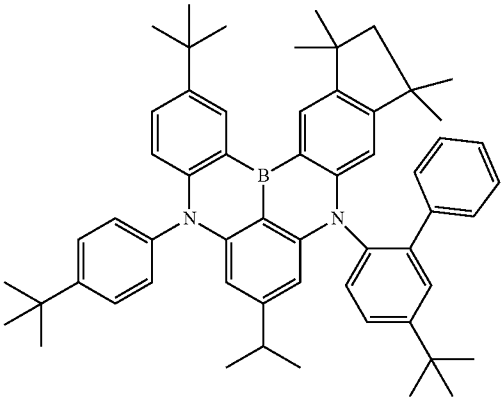
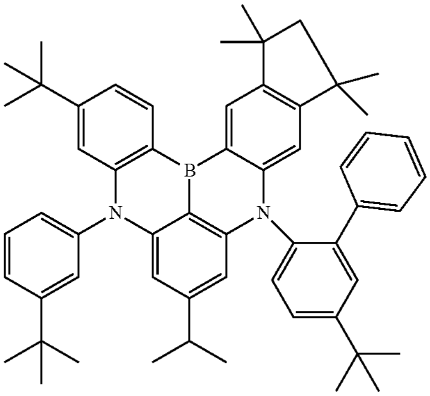
-continued
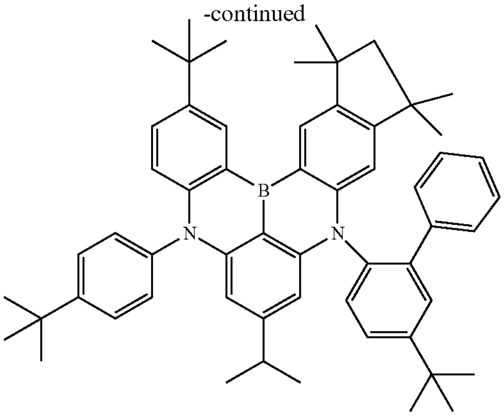
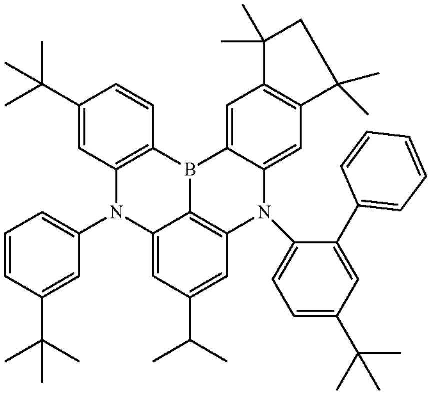
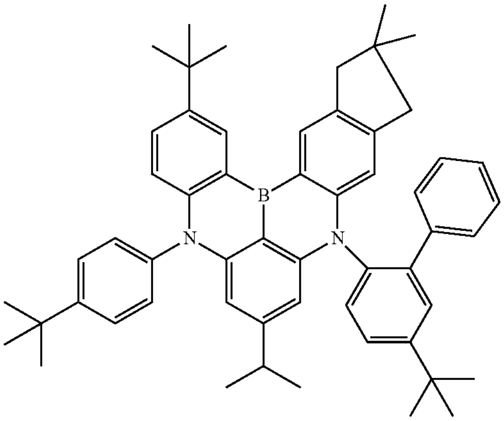
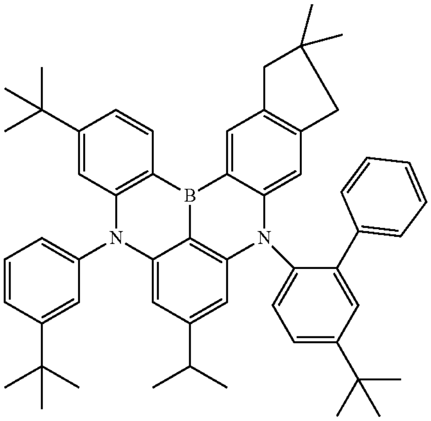

-continued
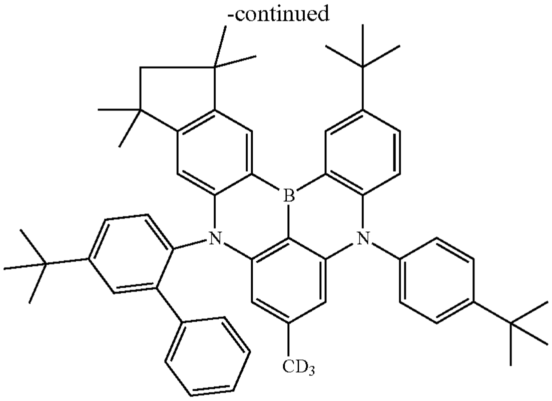
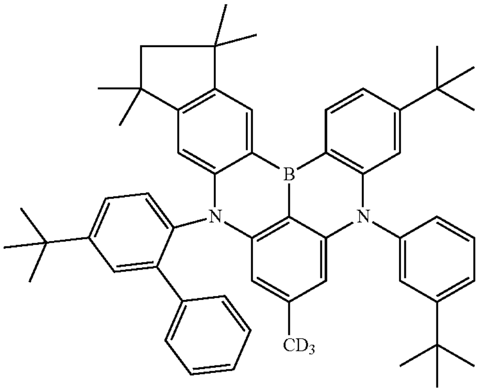
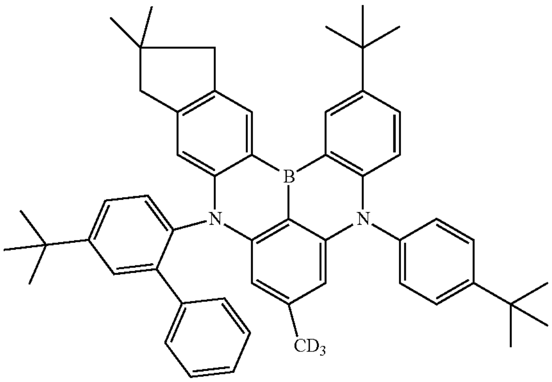
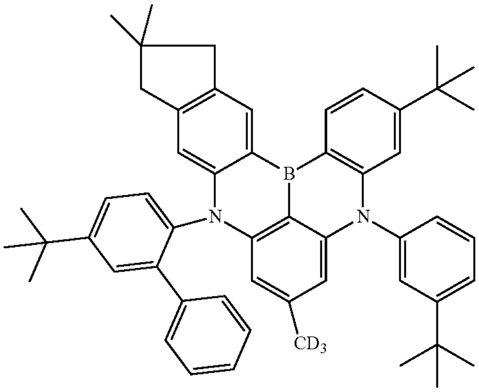
-continued
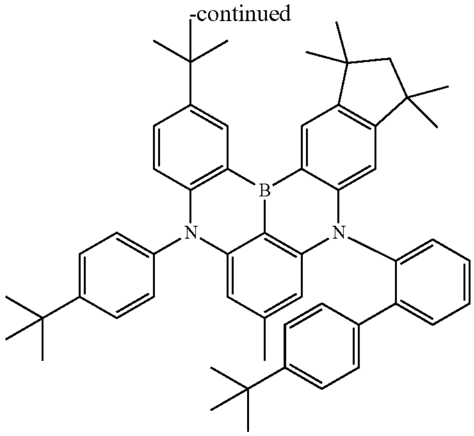
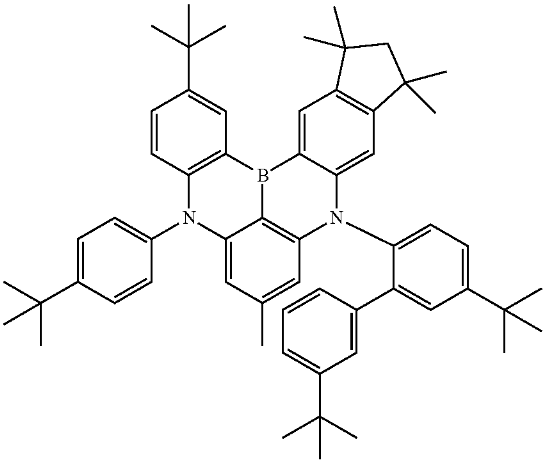
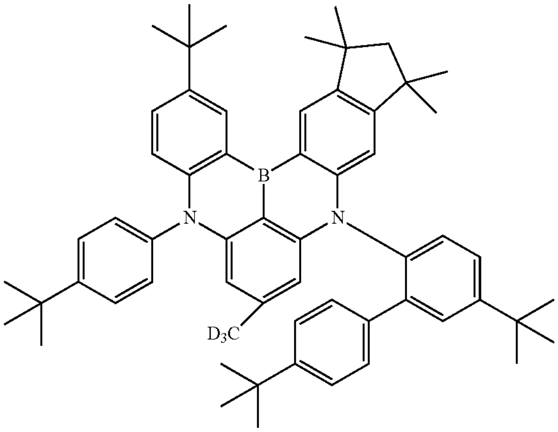

-continued
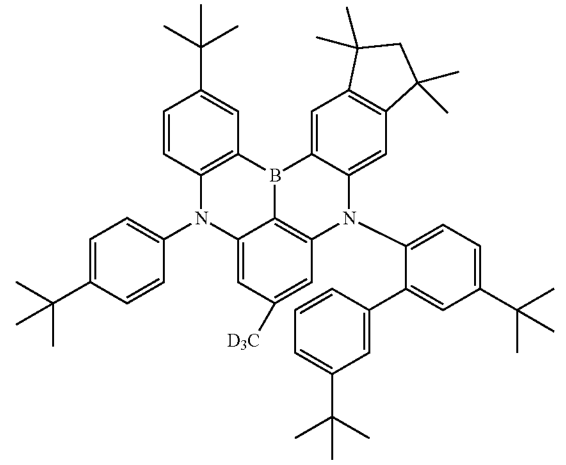
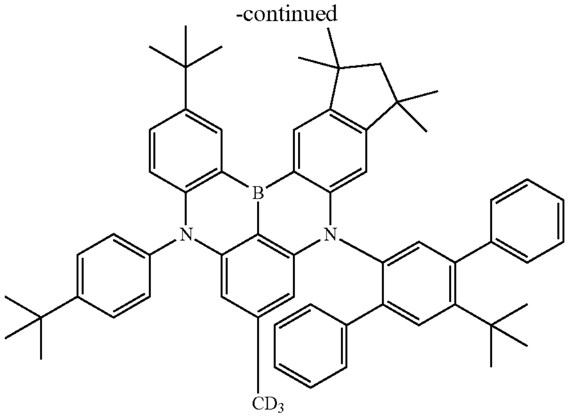
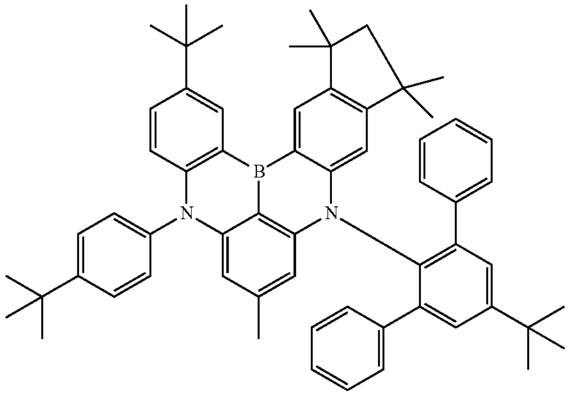
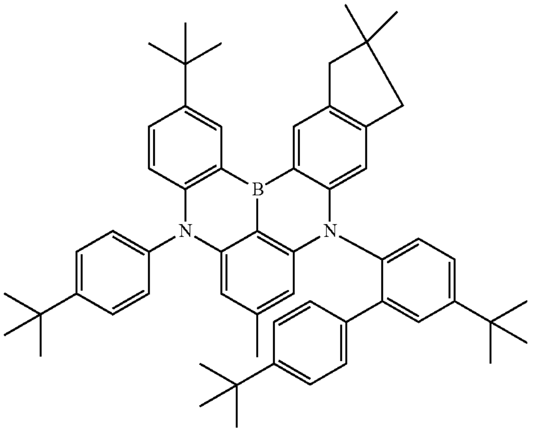
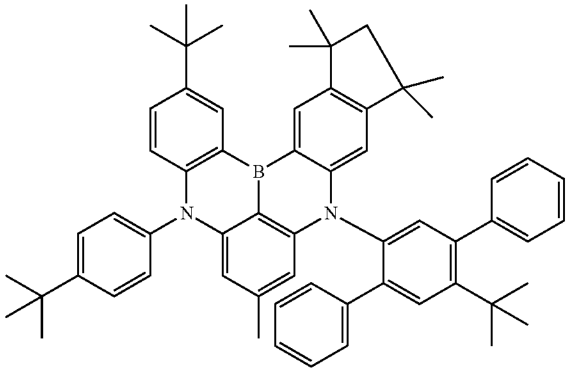
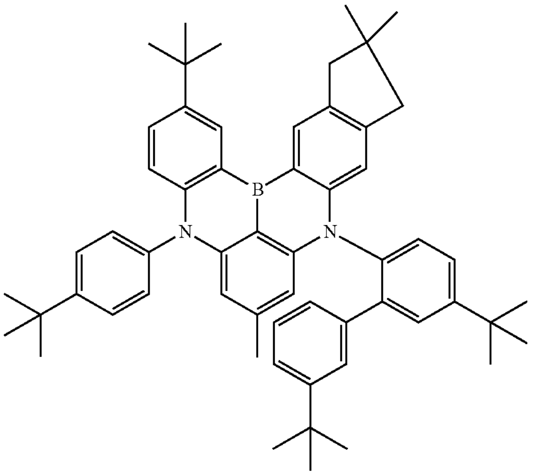
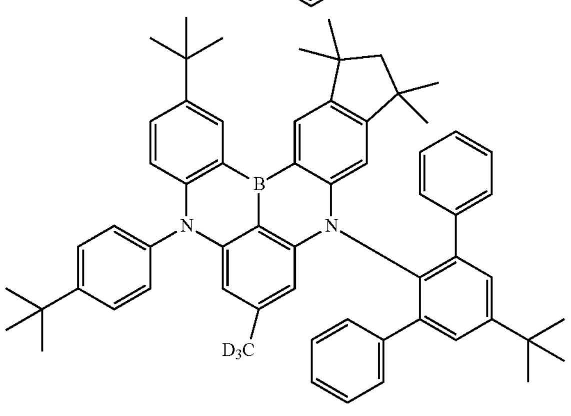
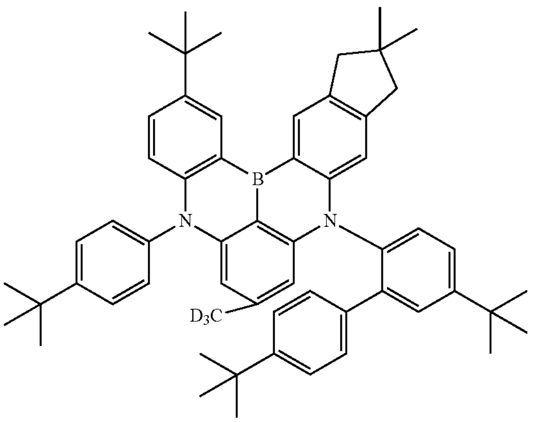

-continued
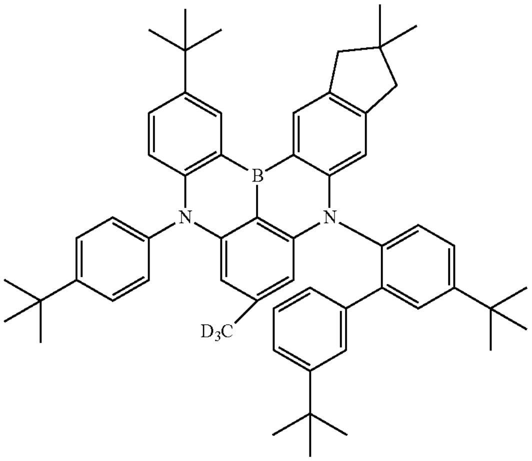
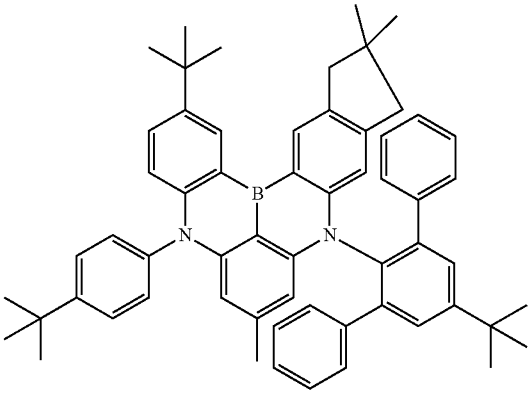
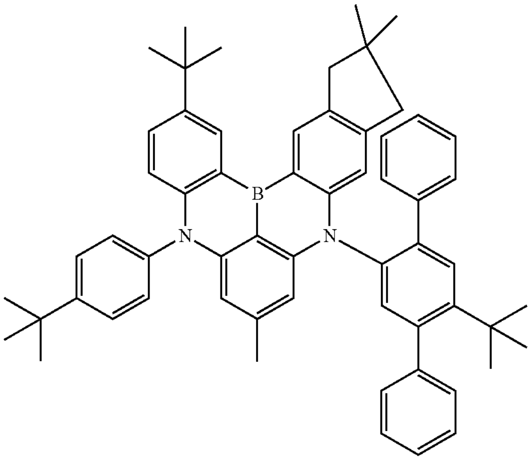
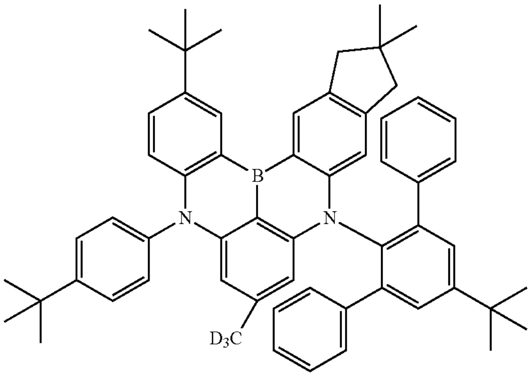
-continued
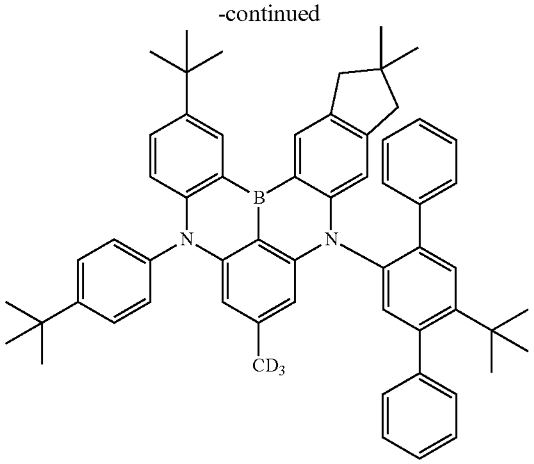
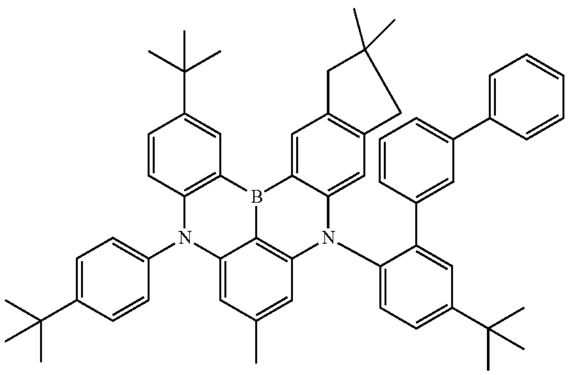
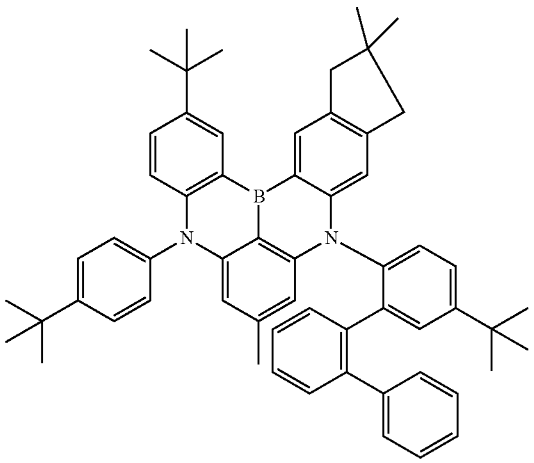

-continued
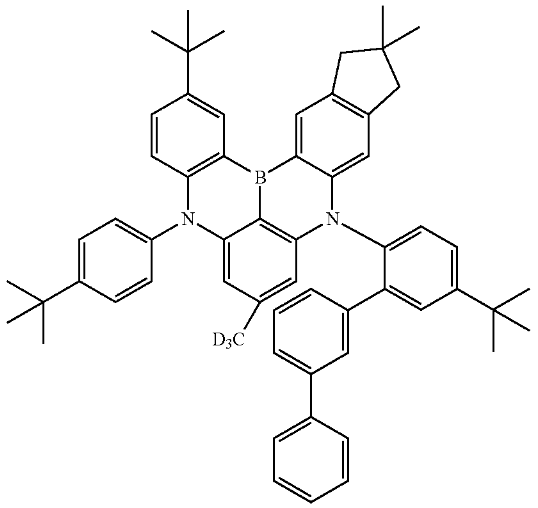
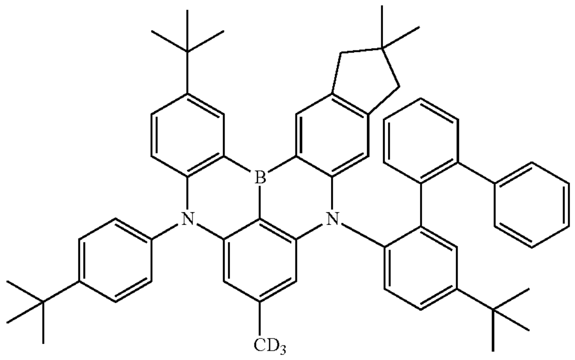
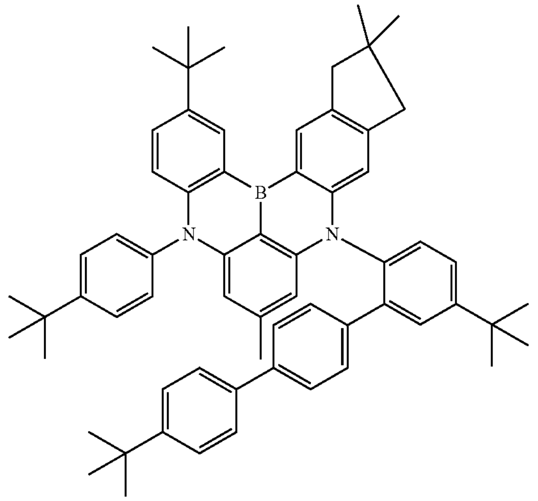
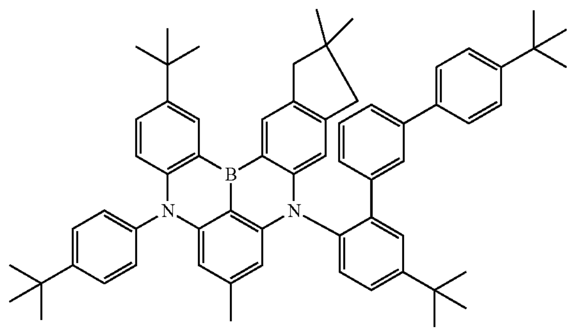
-continued
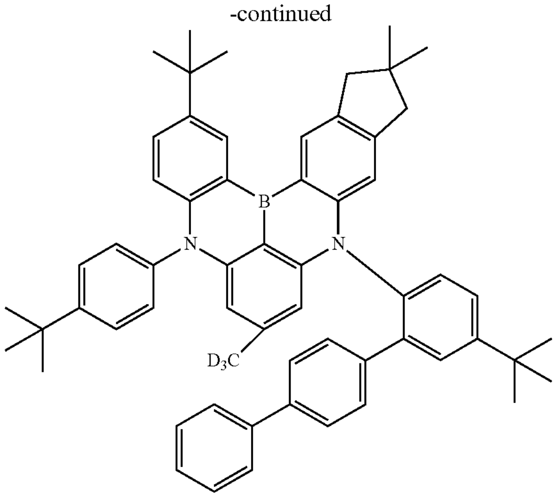
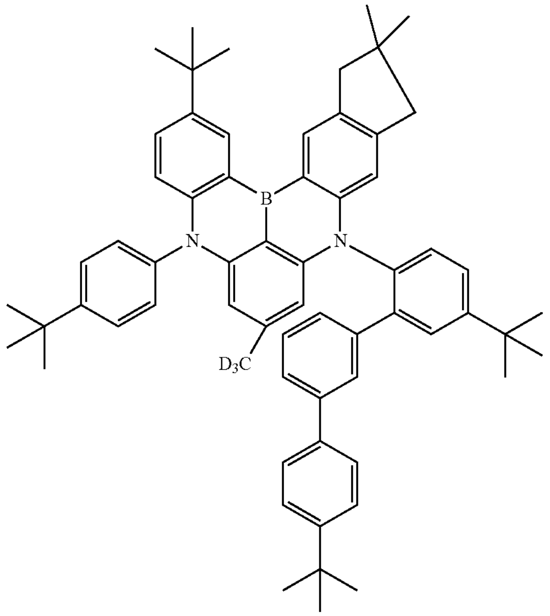
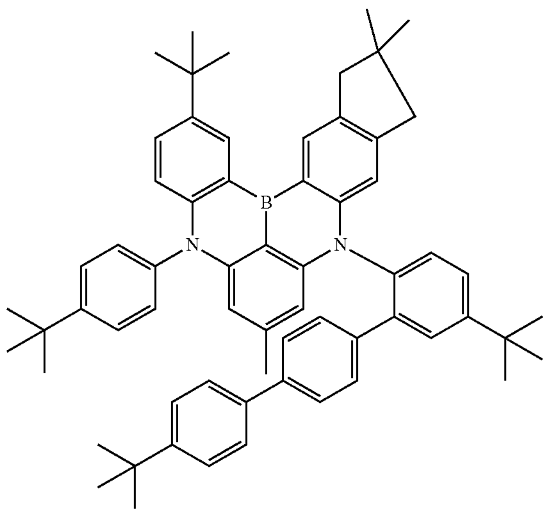

-continued
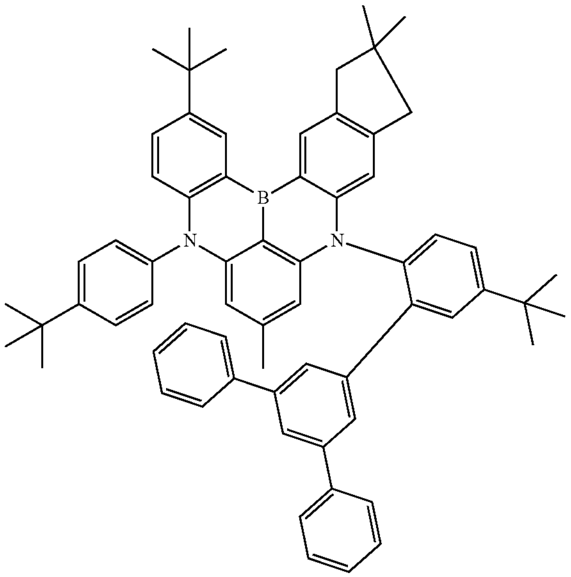
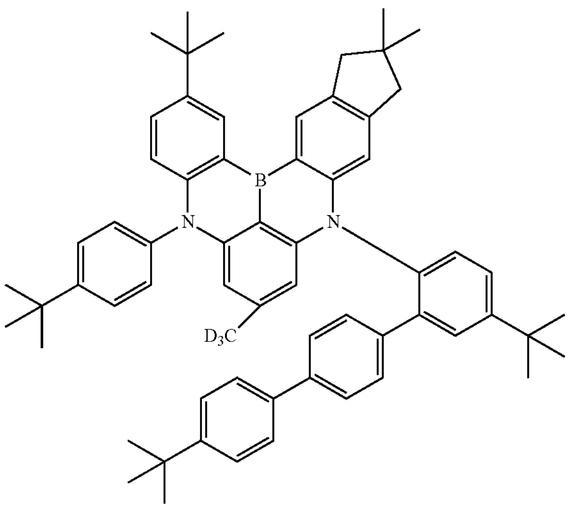
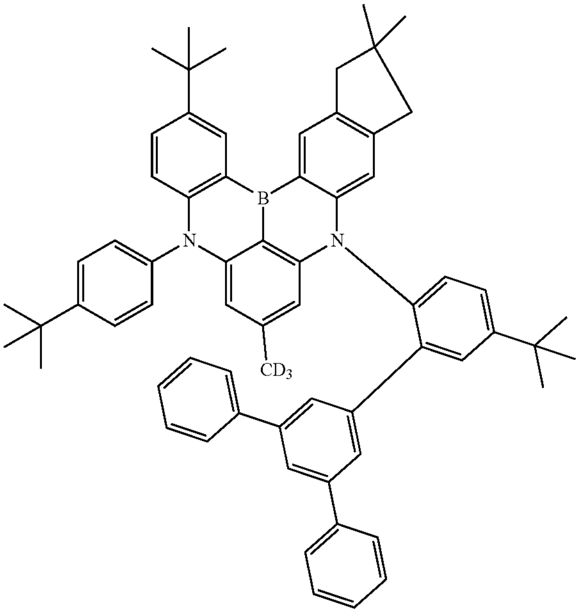
-continued
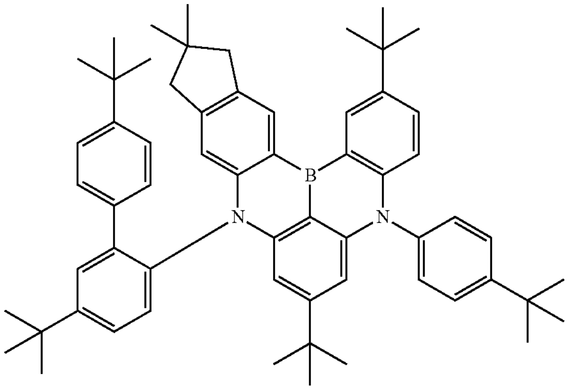
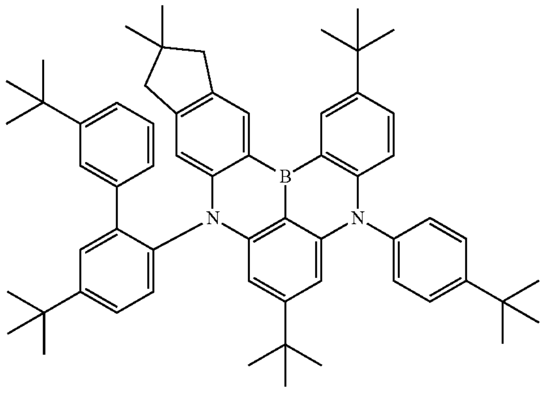
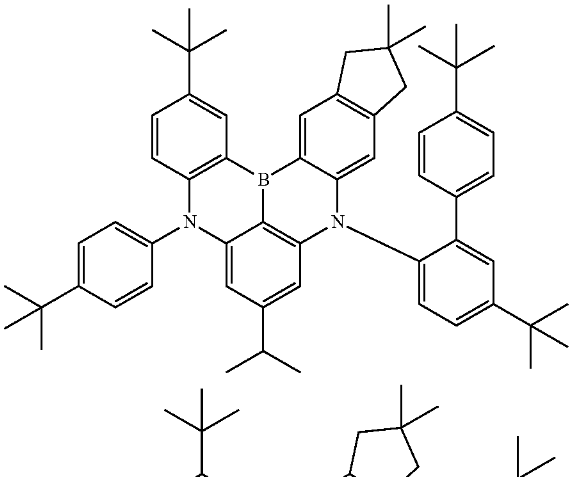
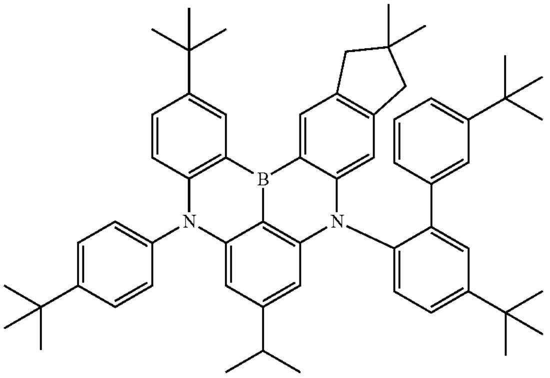

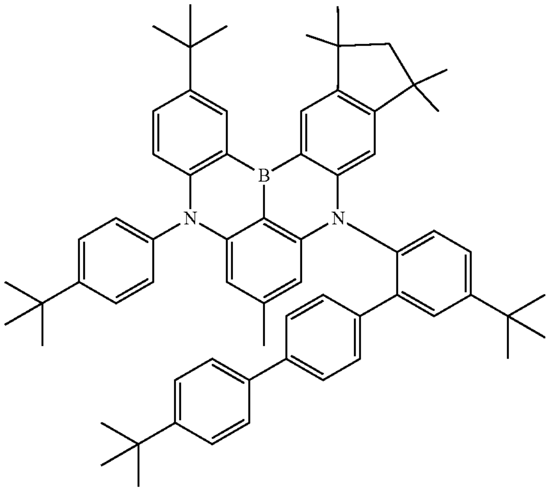
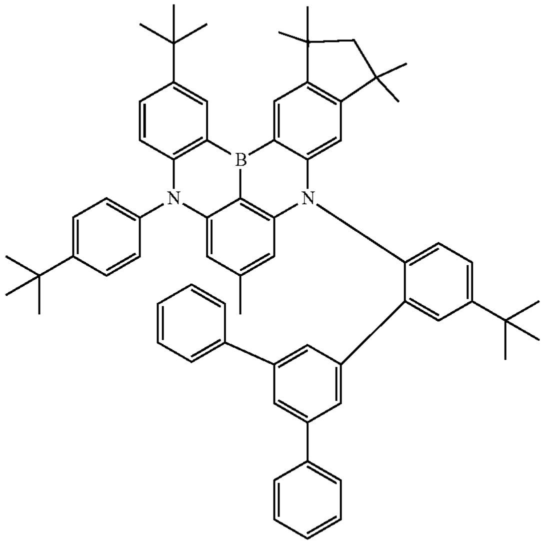
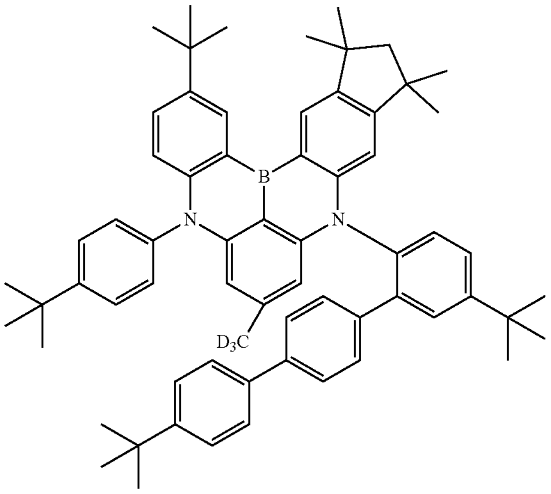
-continued
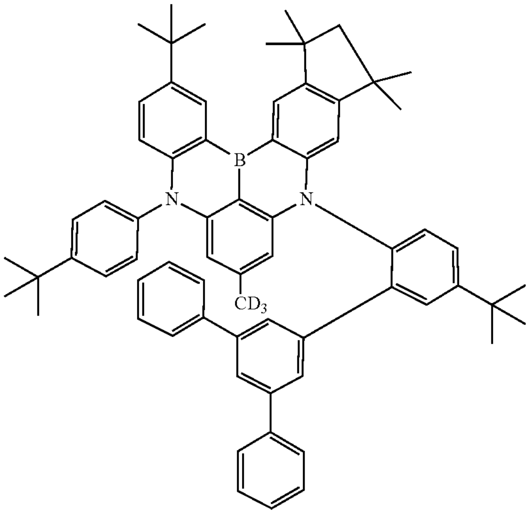
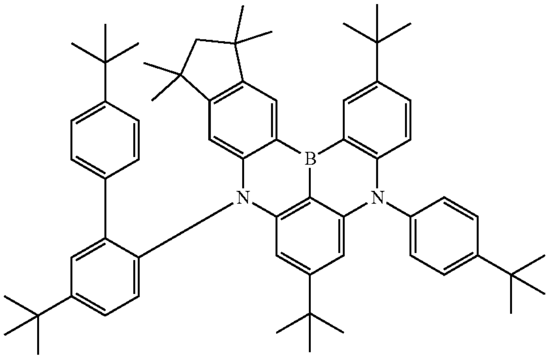
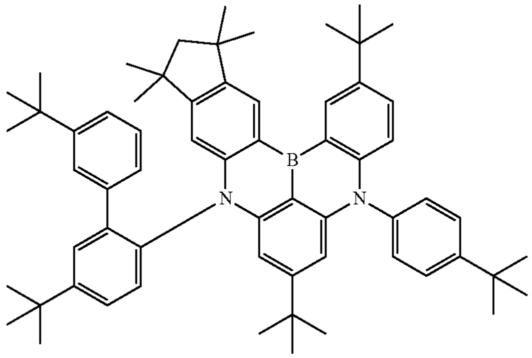
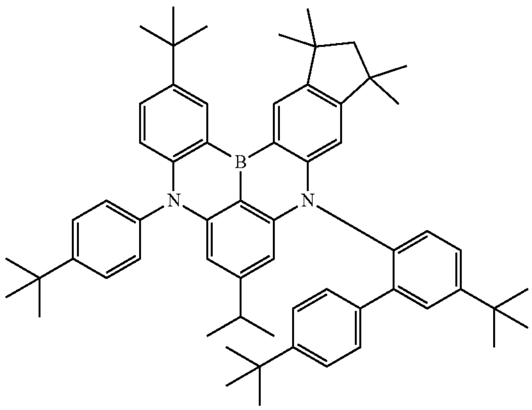

-continued
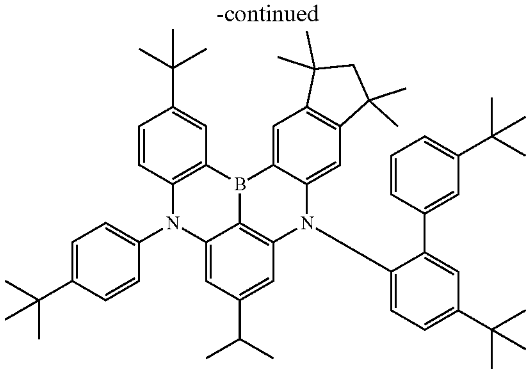
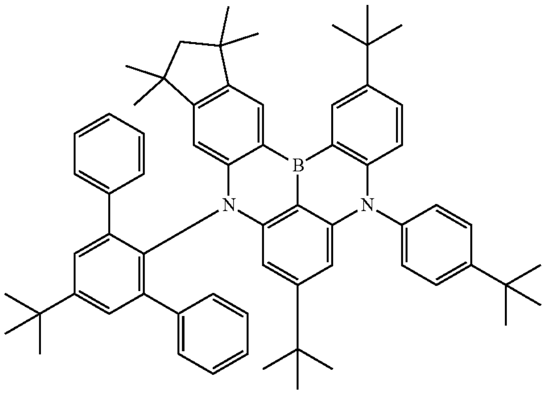
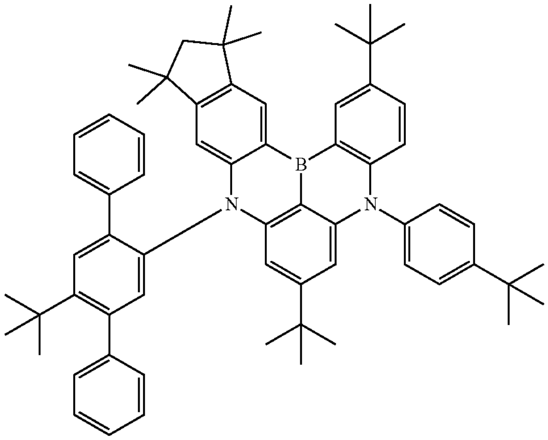
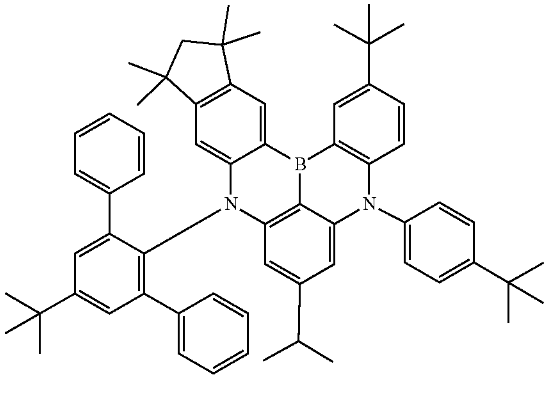
-continued
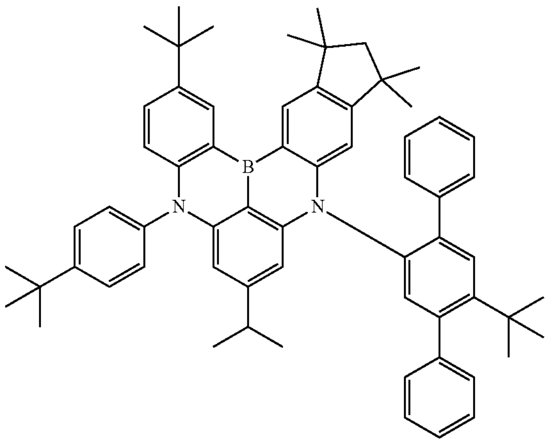
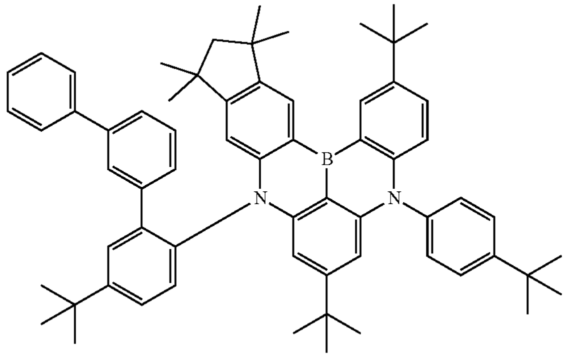
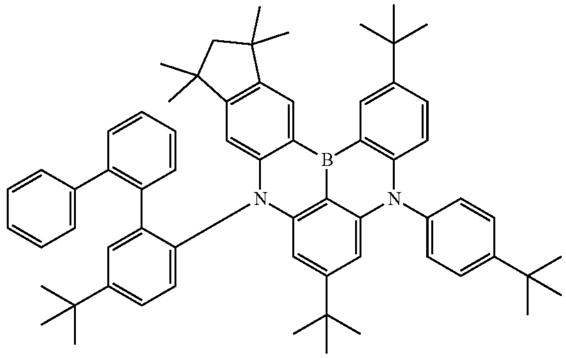
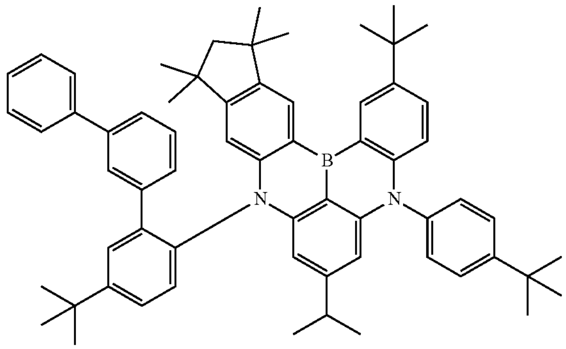

-continued
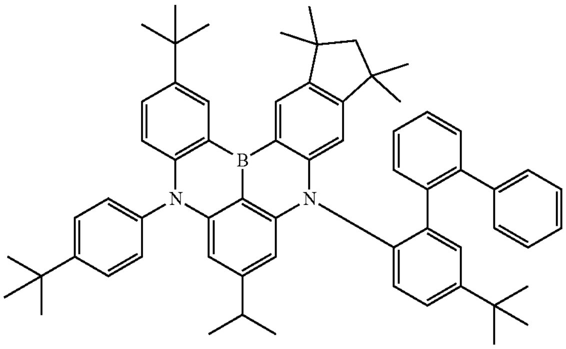
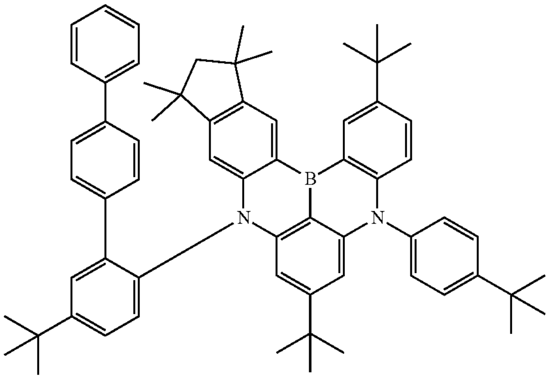
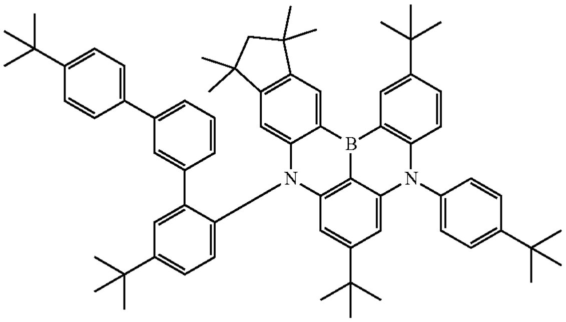
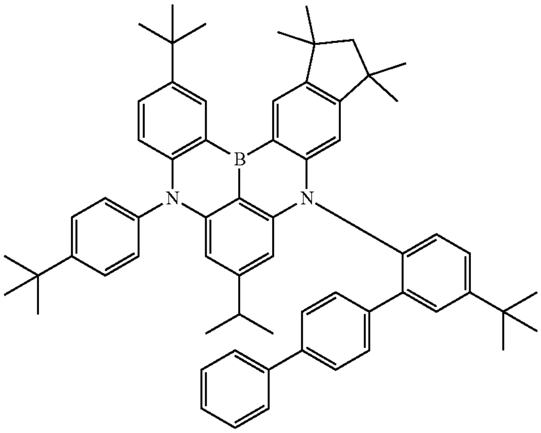
-continued
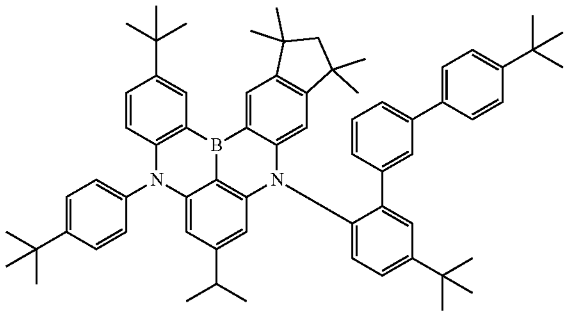
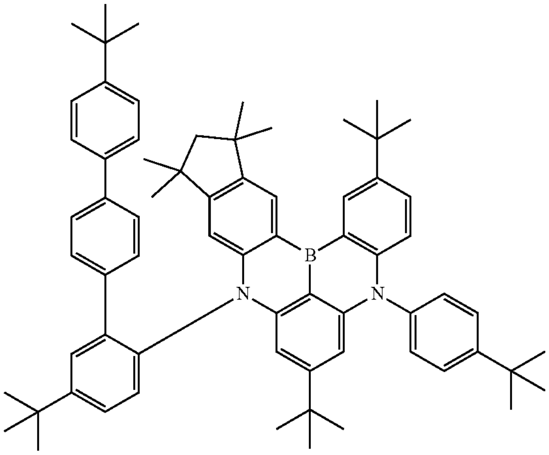
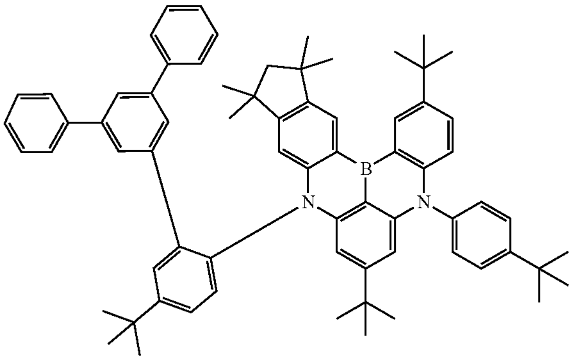
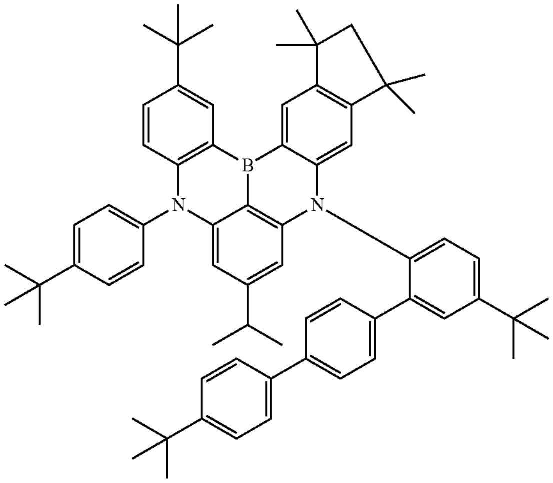

-continued
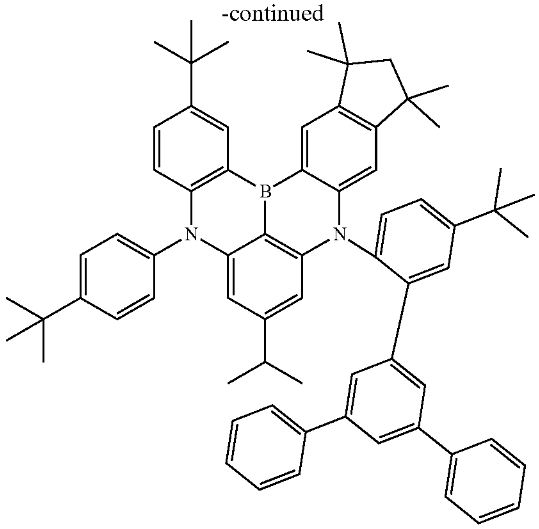
-continued
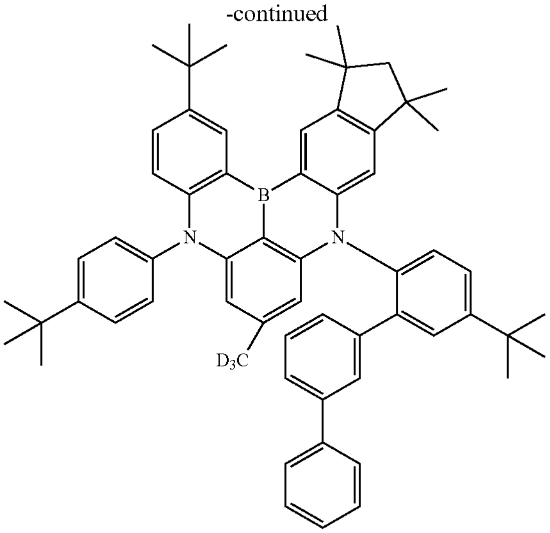
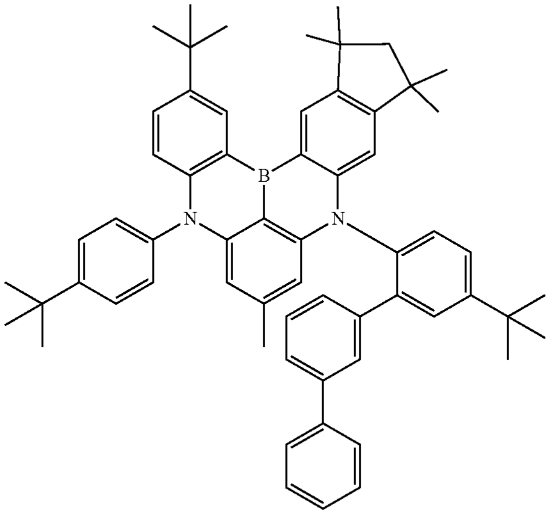
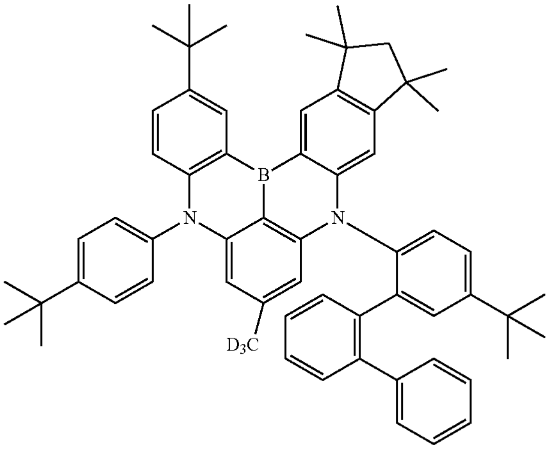
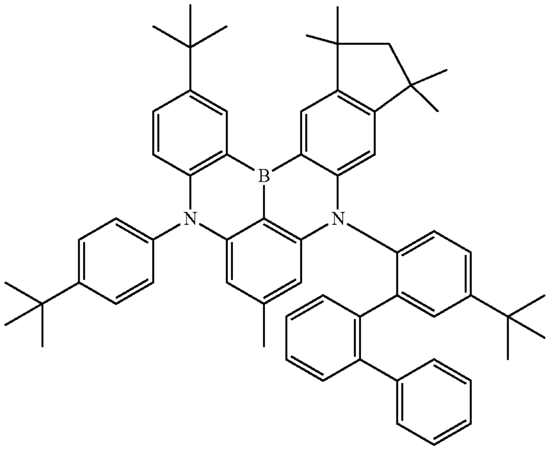
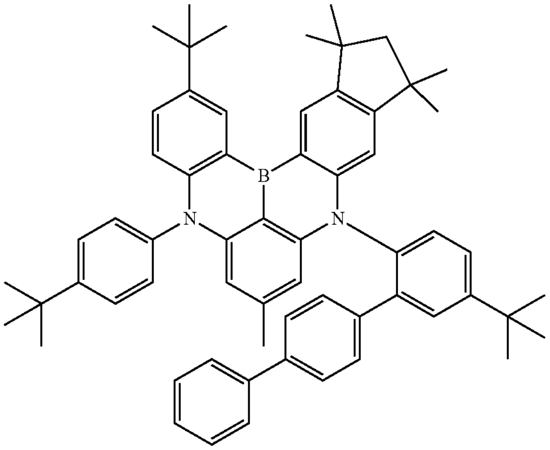

-continued
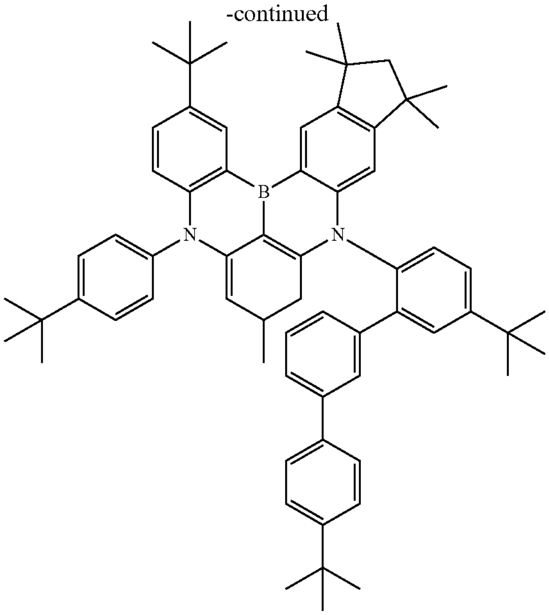
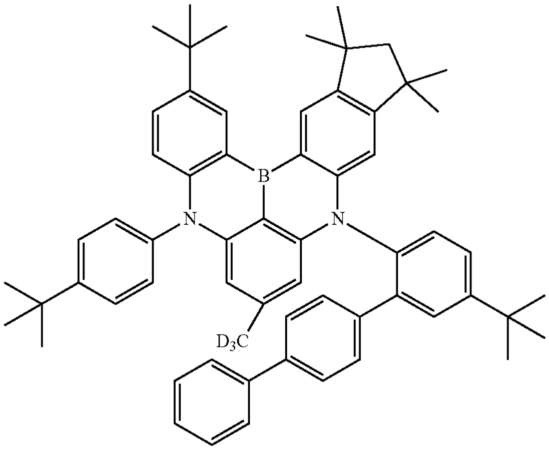
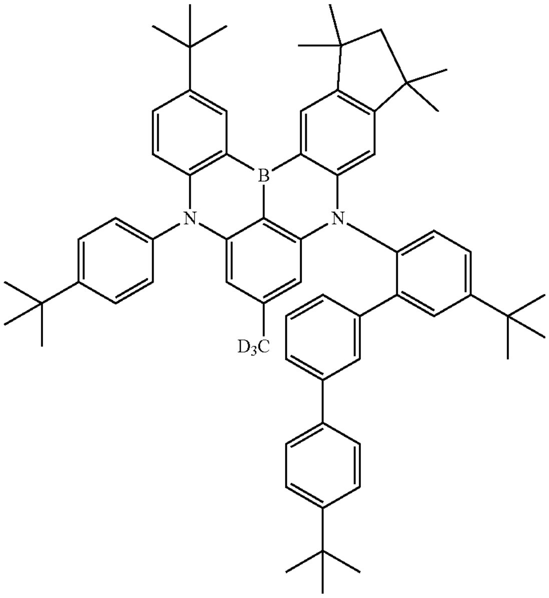
-continued
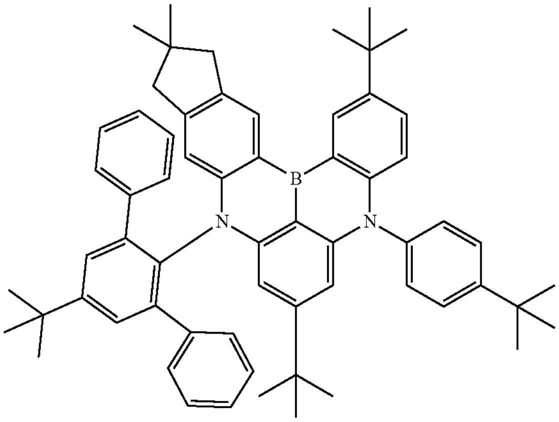
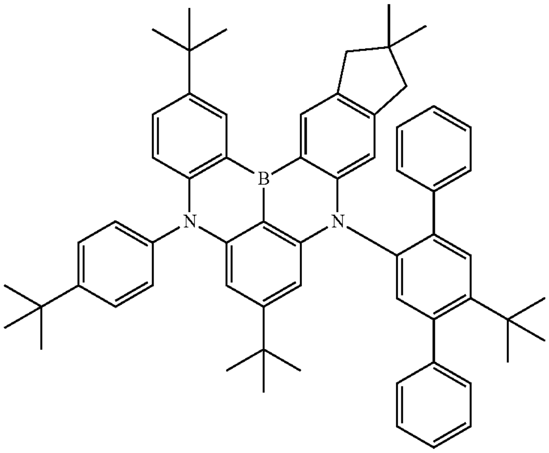
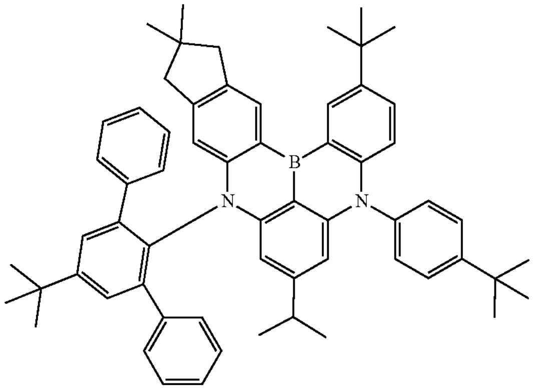
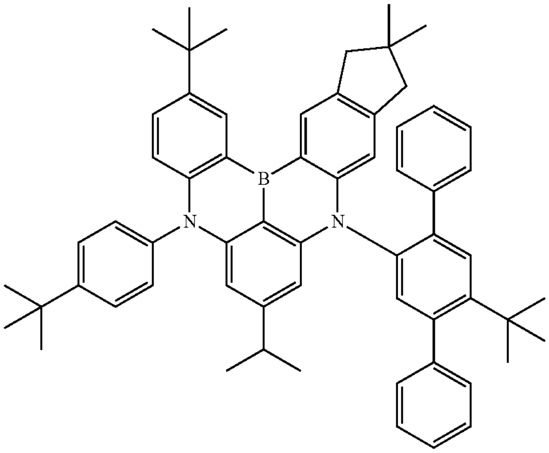

-continued
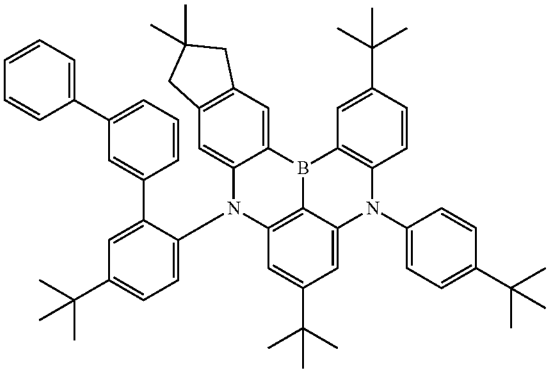
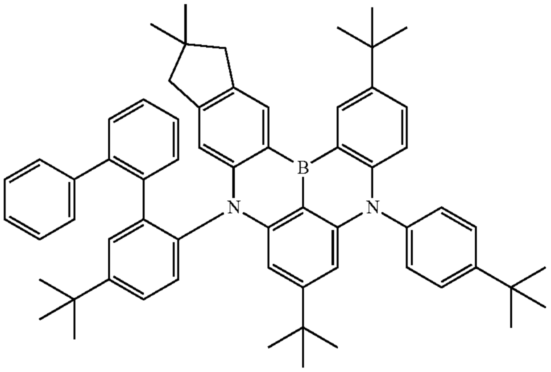
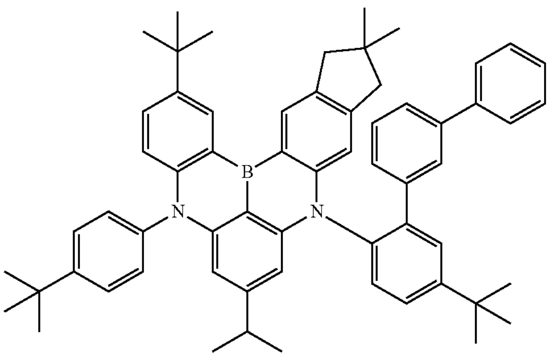
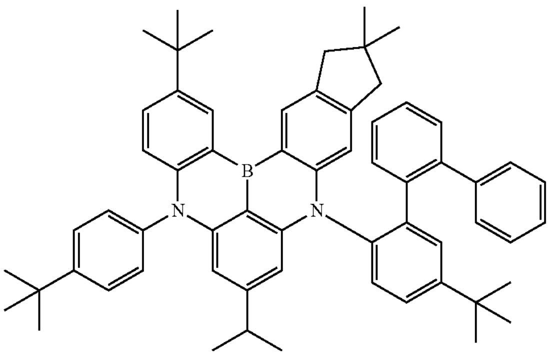
-continued
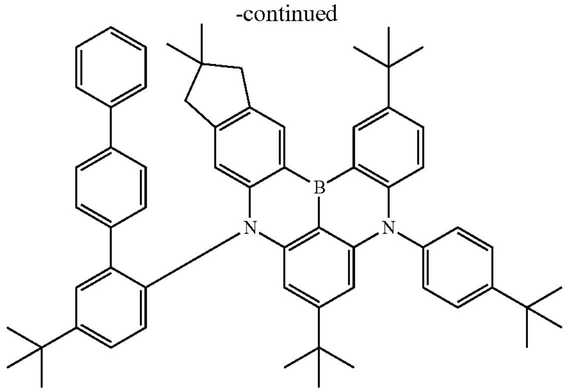
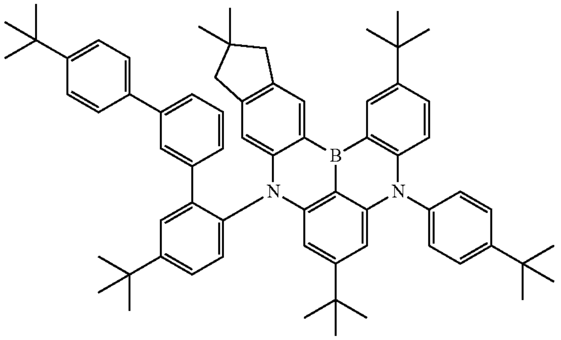
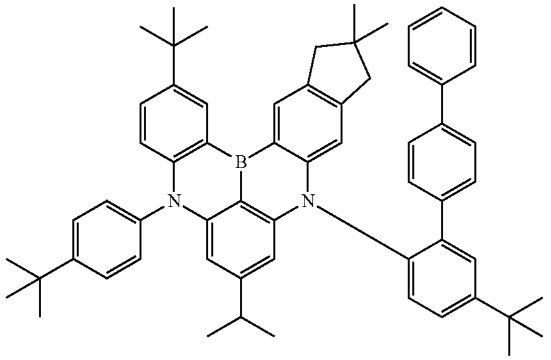
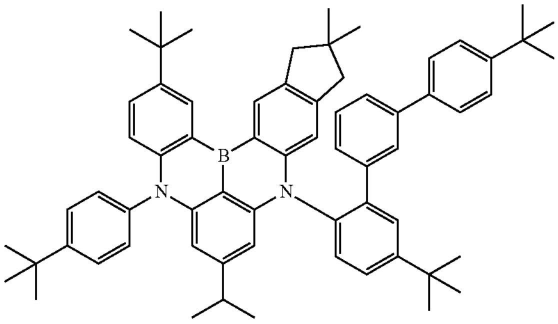

-continued
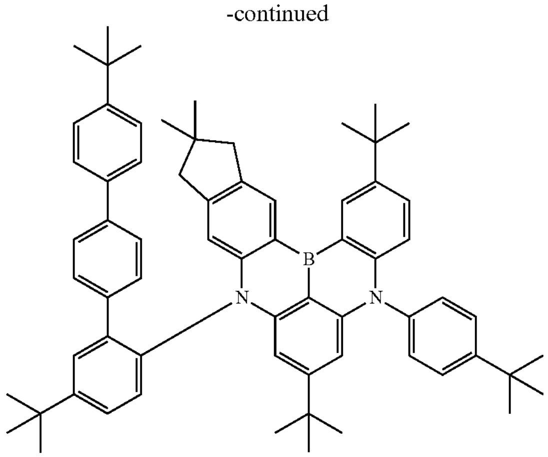
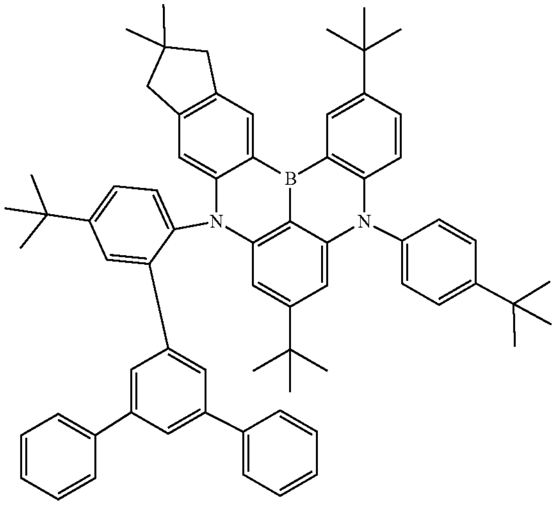
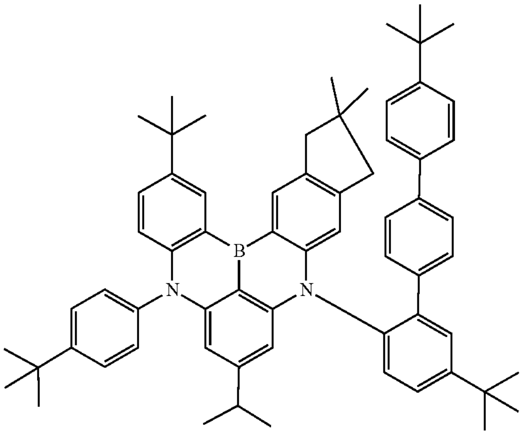
-continued
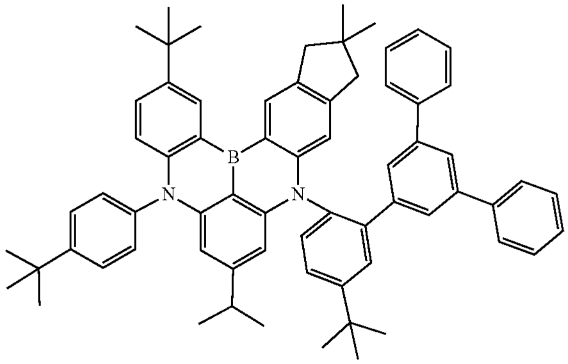
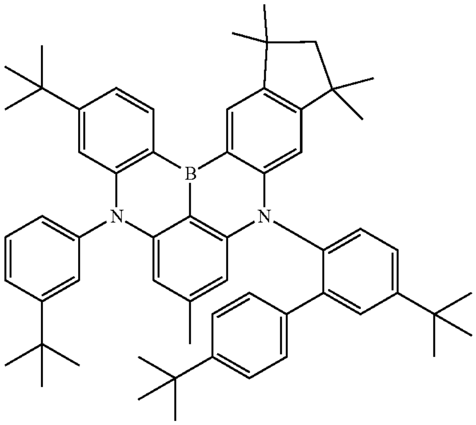
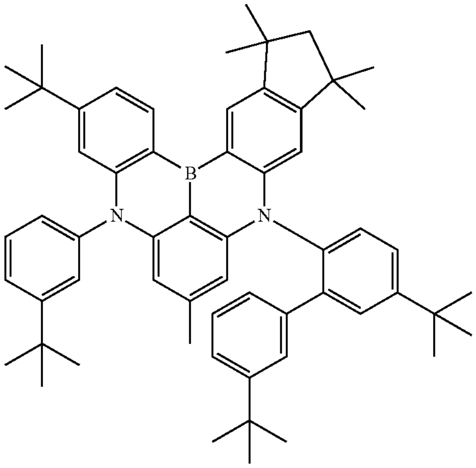
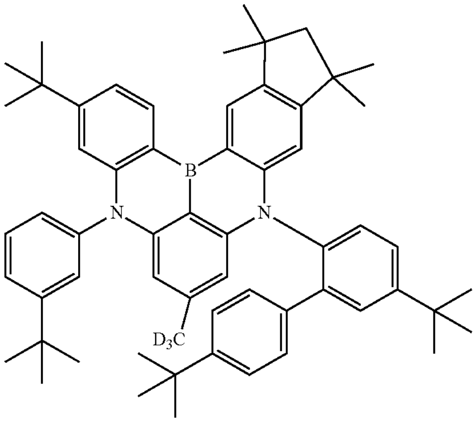

-continued
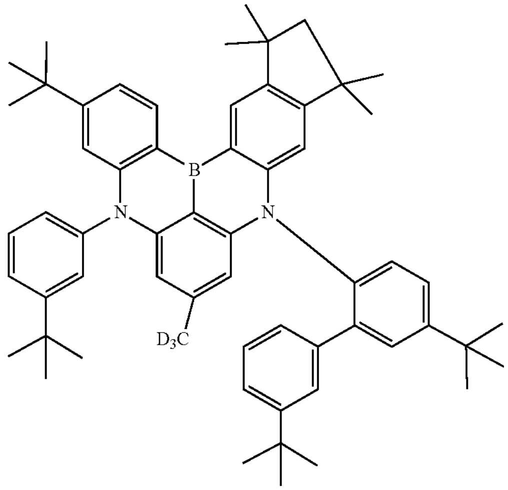
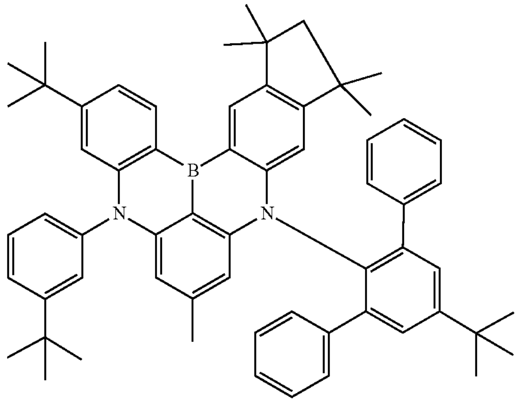
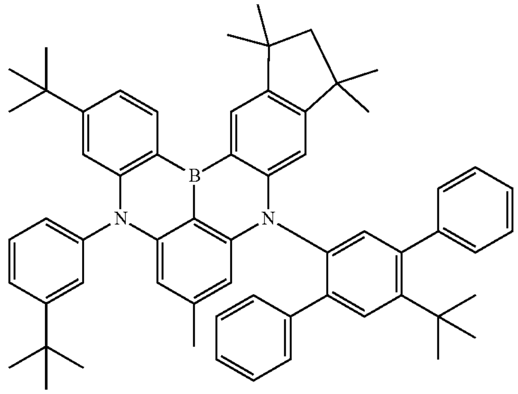
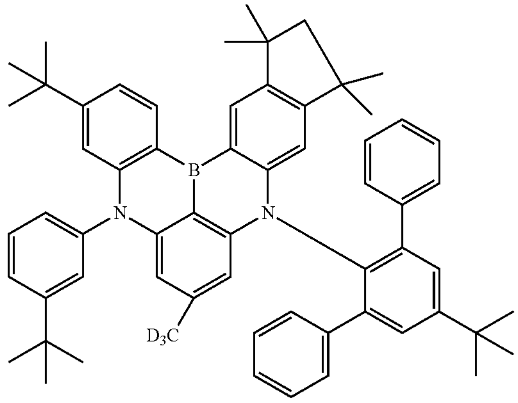
-continued
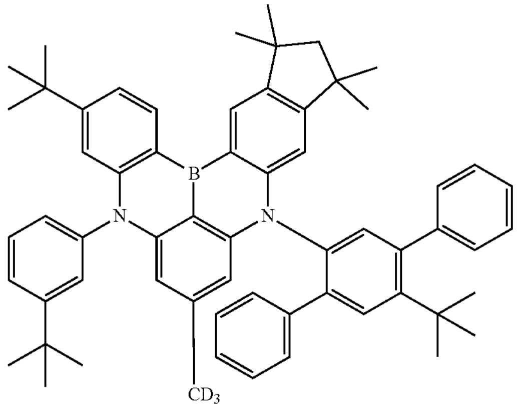
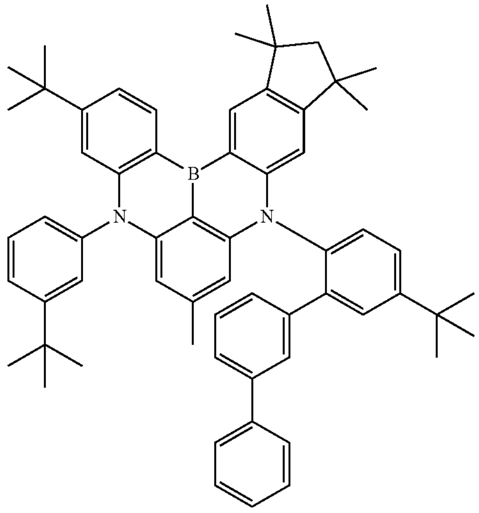
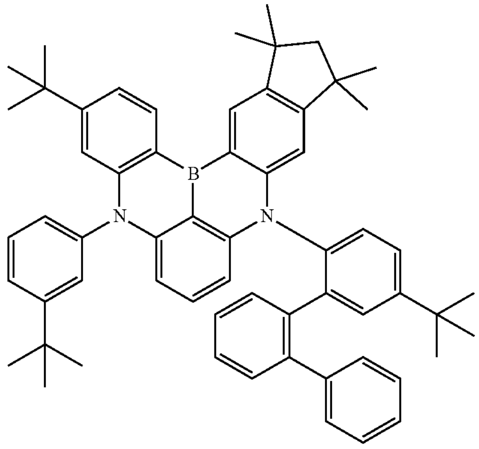

-continued
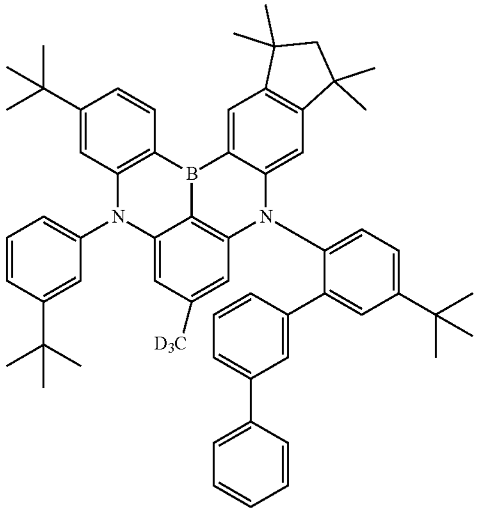
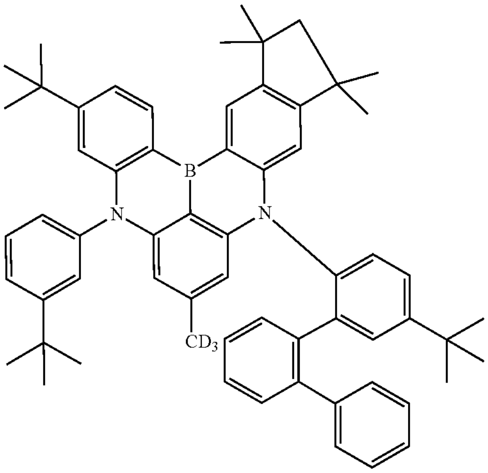
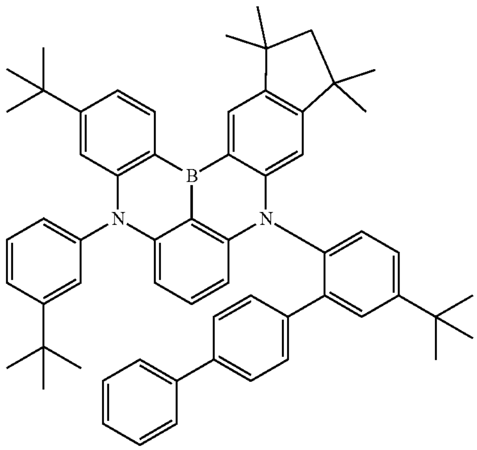
-continued
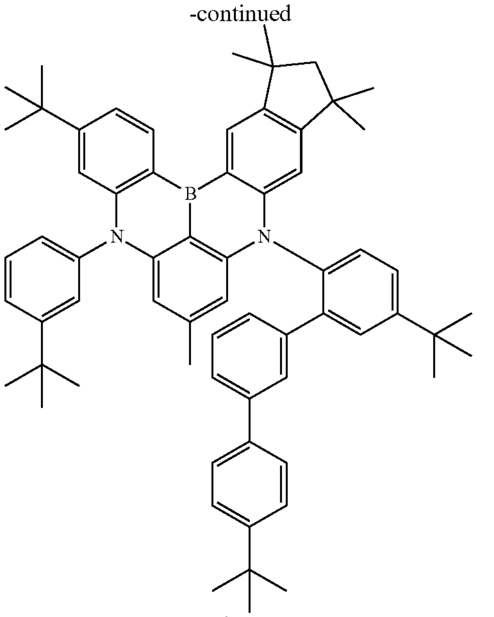
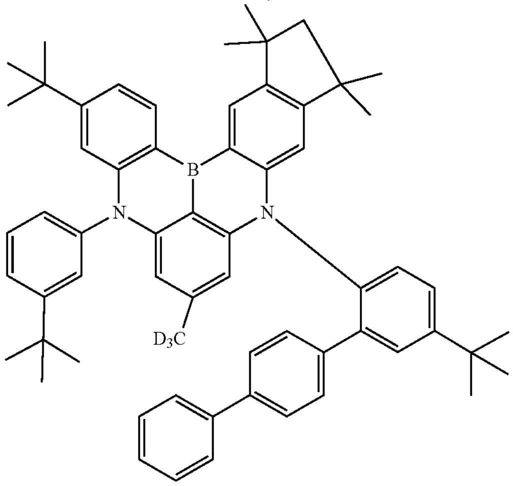
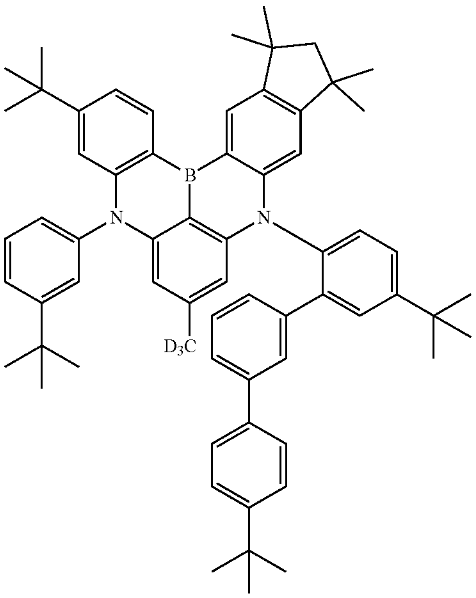

-continued
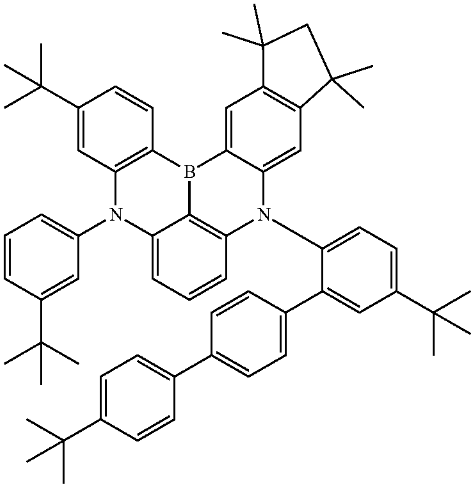
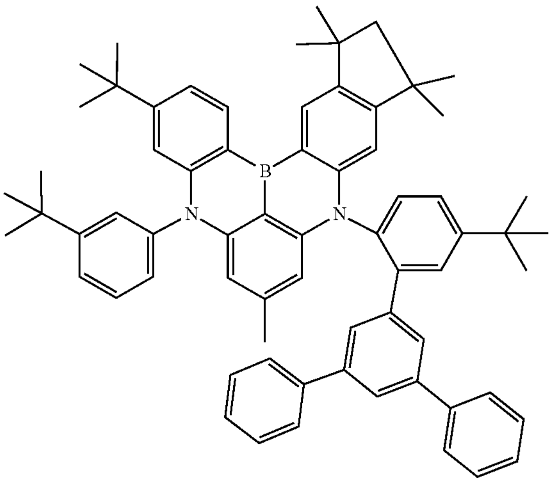
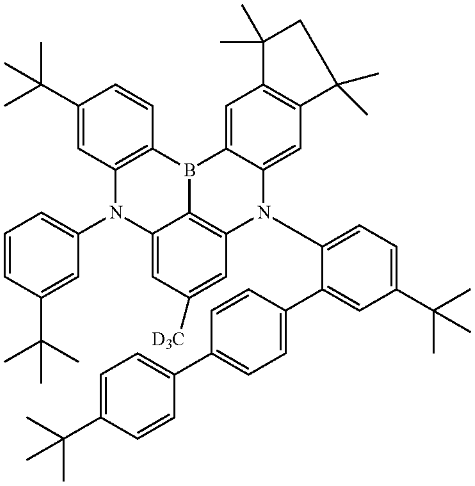
-continued
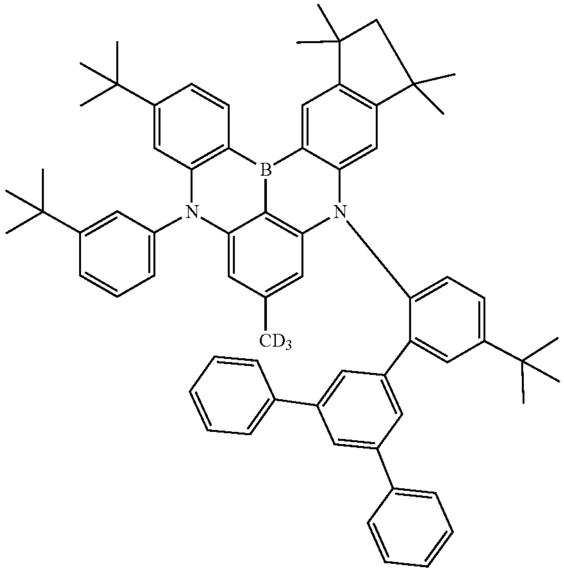
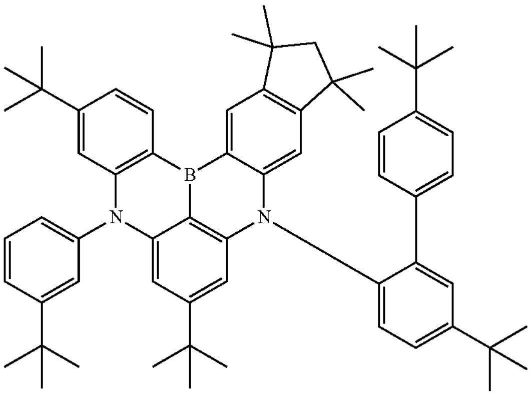
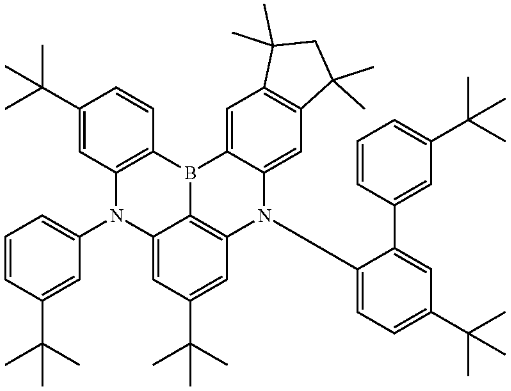

-continued
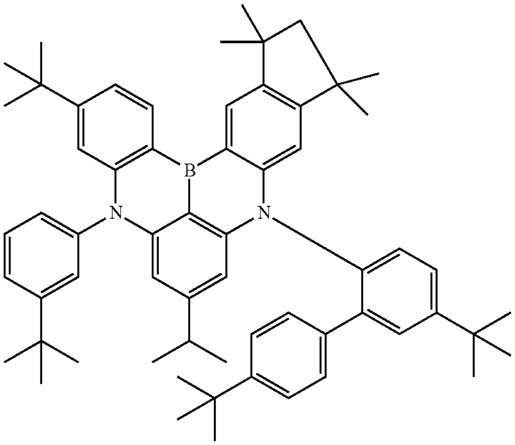
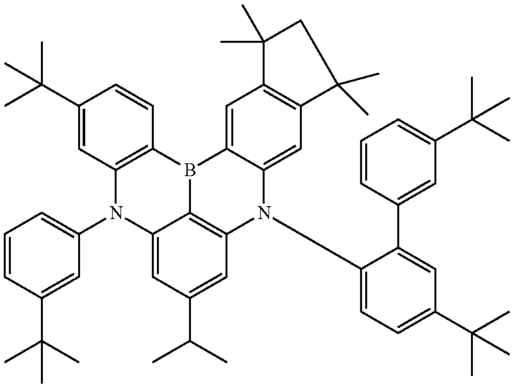
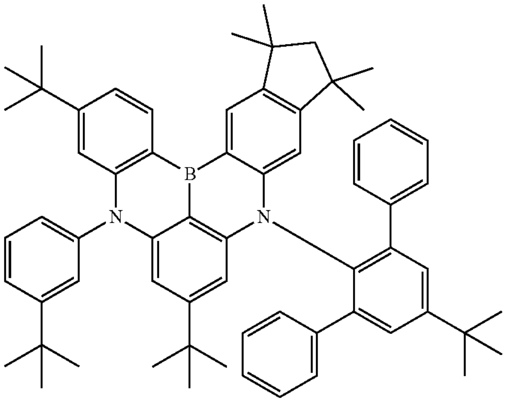
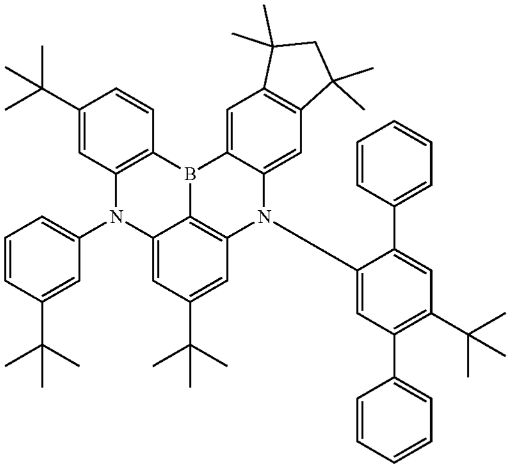
-continued
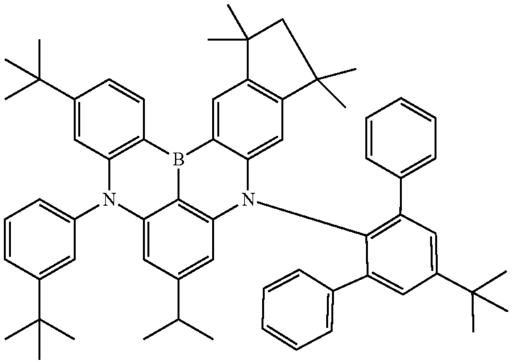
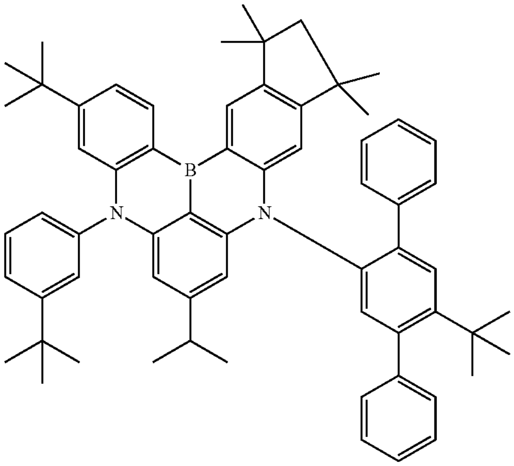
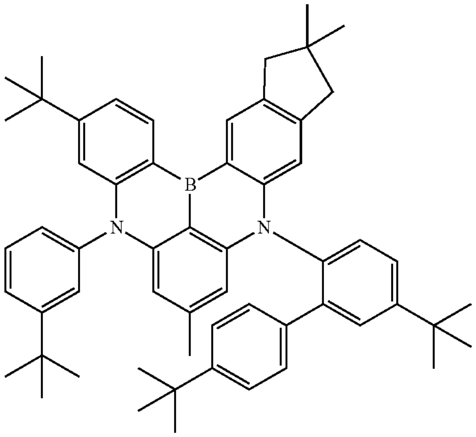

-continued
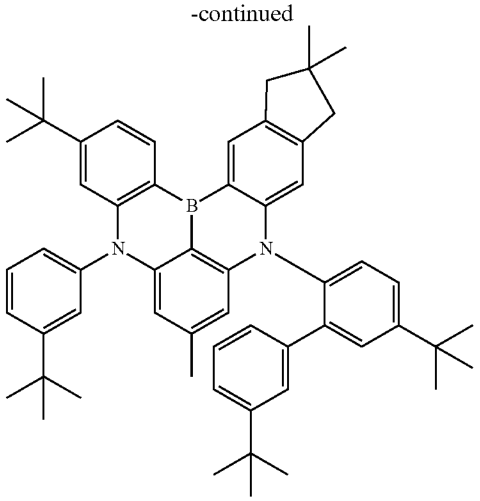
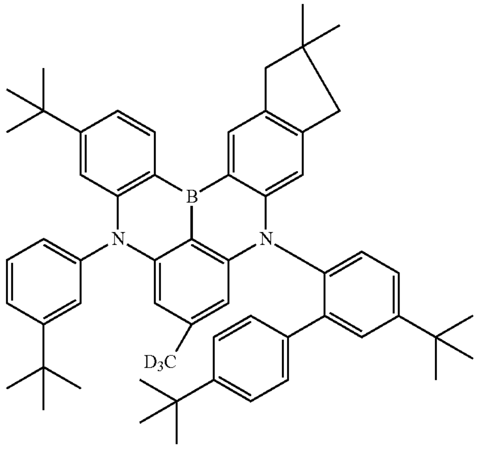
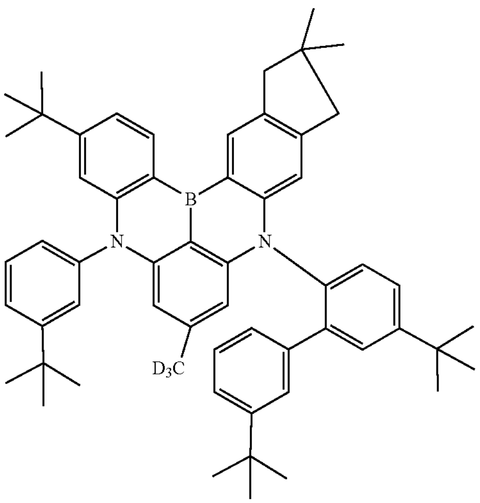
-continued
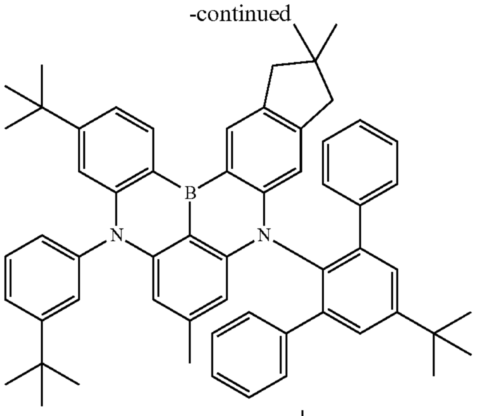
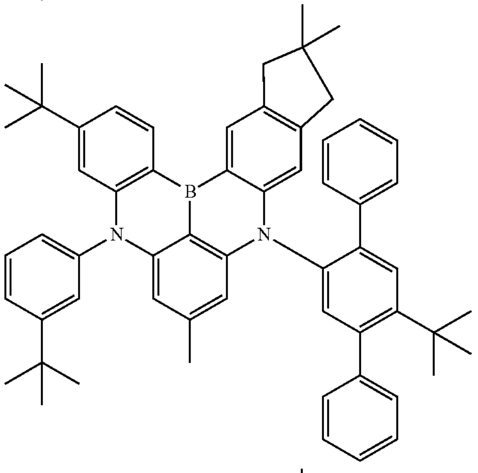
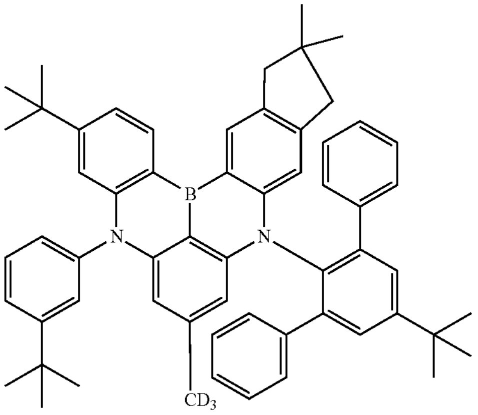
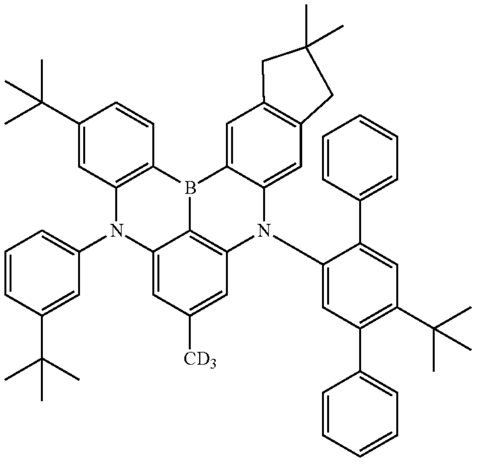

-continued
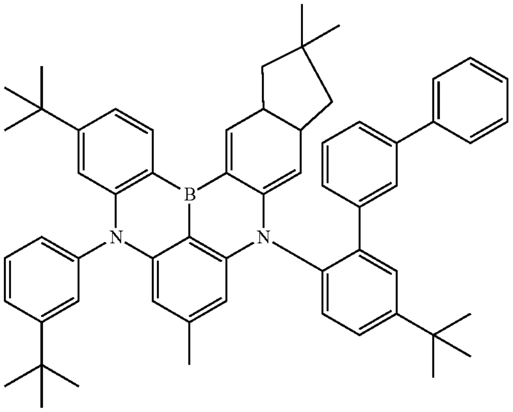
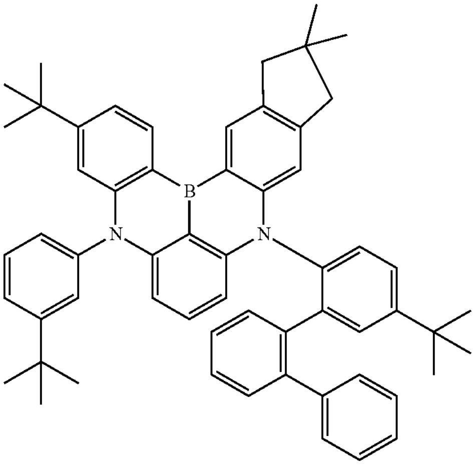
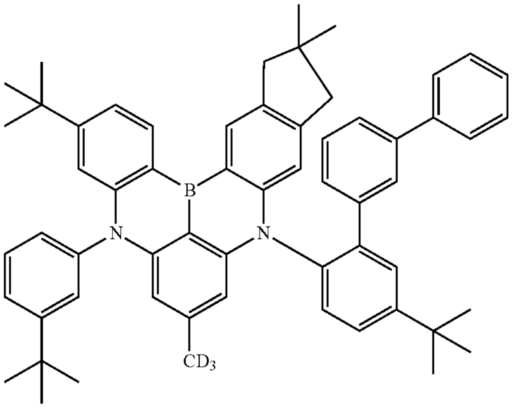
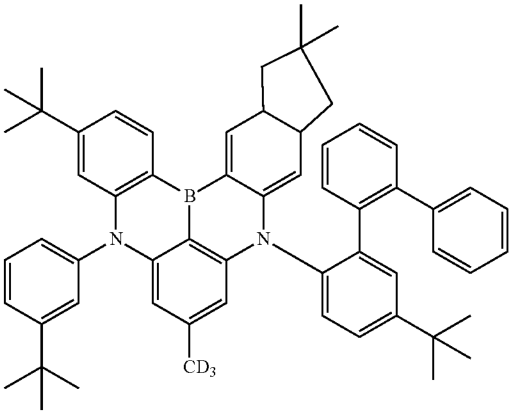
-continued
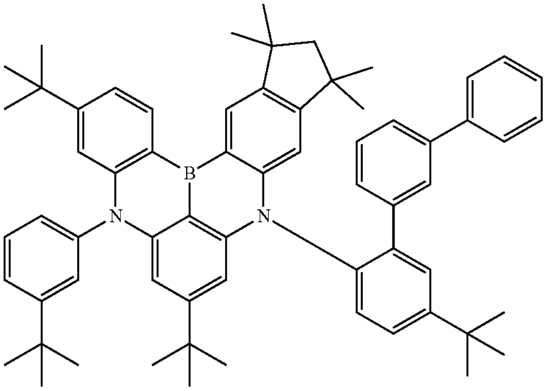
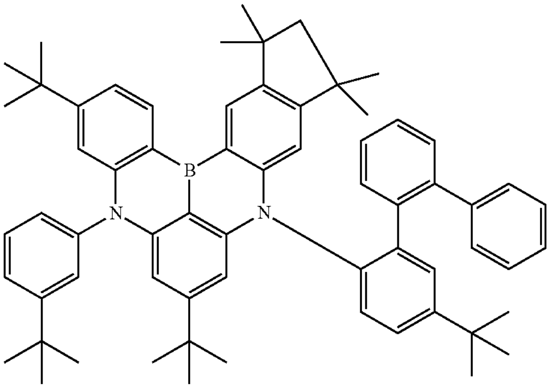
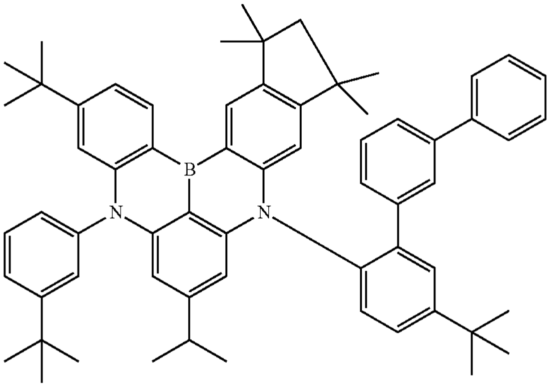
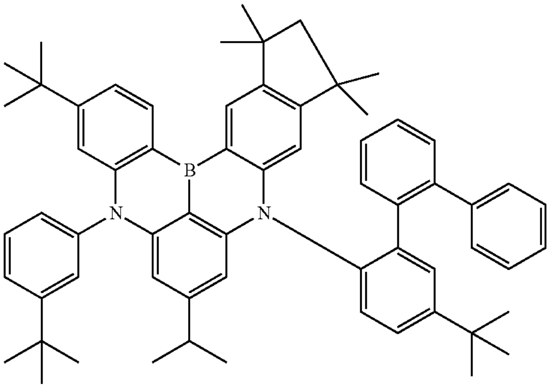

-continued
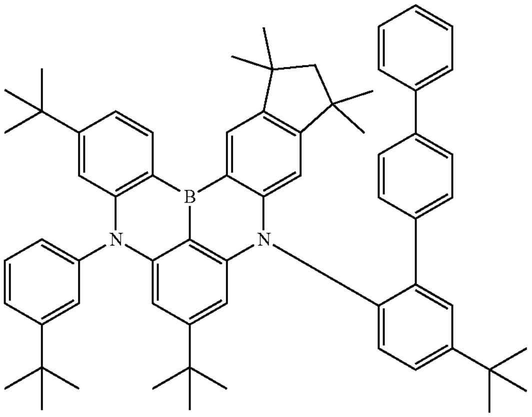
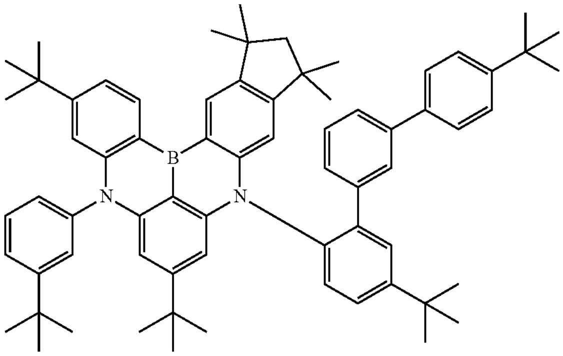
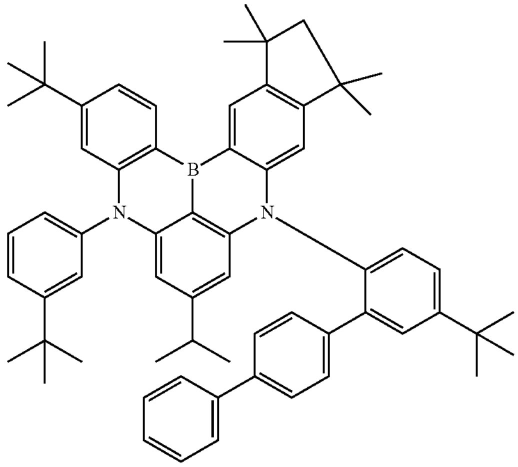
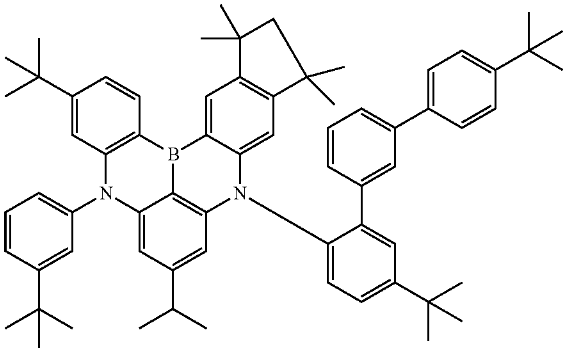
-continued
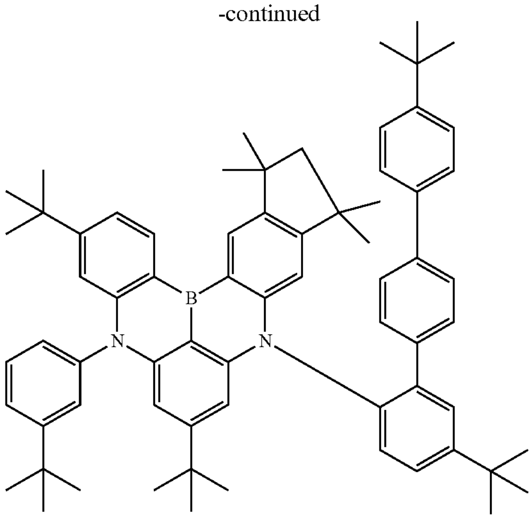
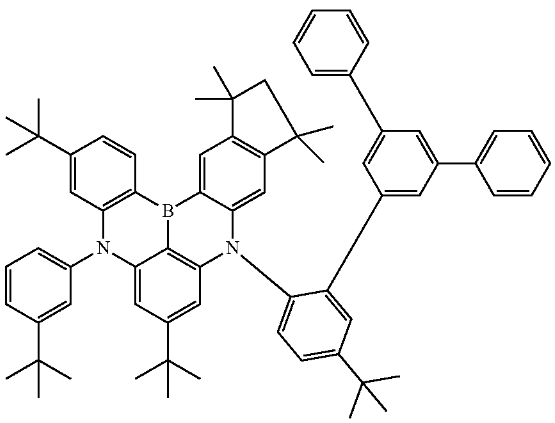
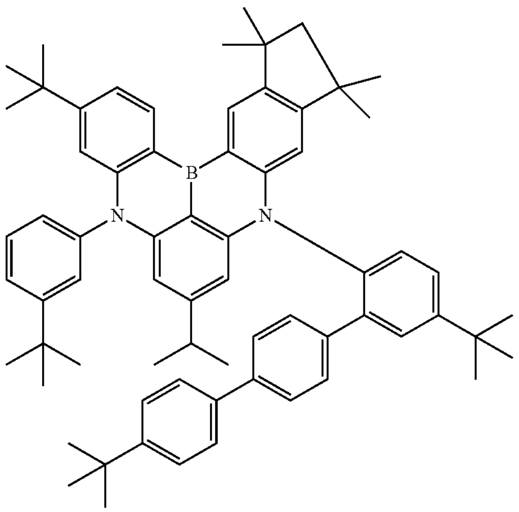

-continued
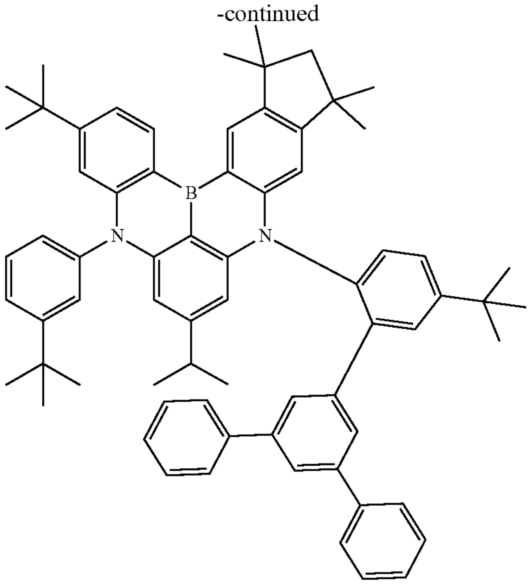
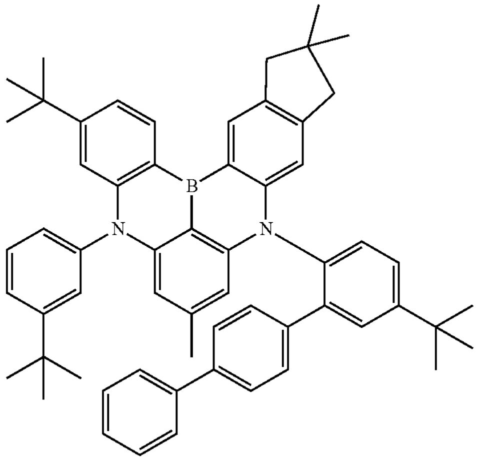
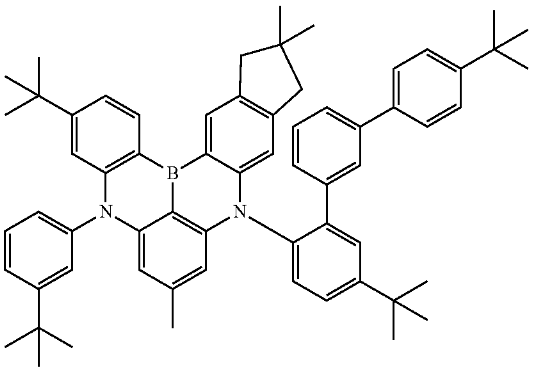
-continued
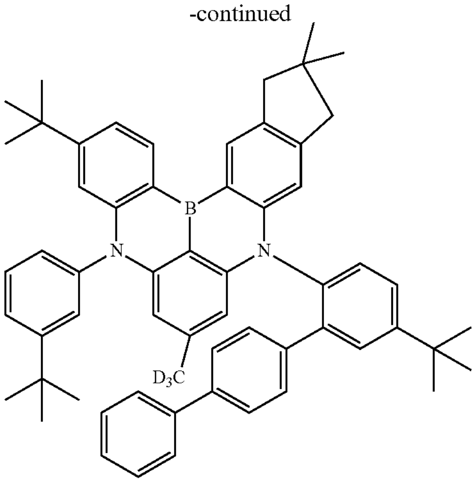
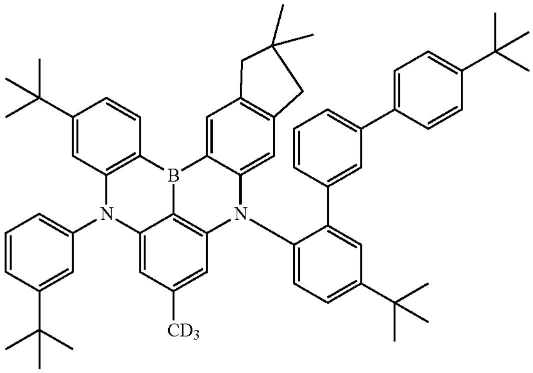
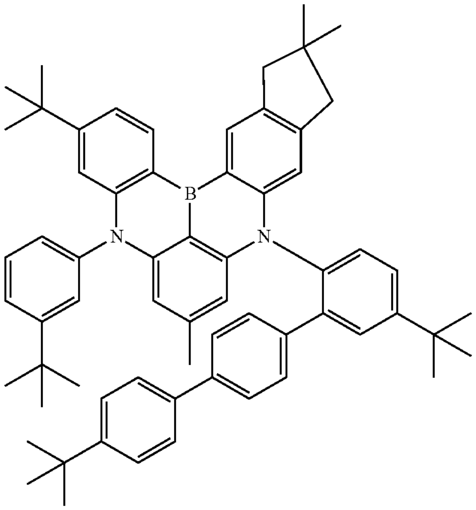

-continued
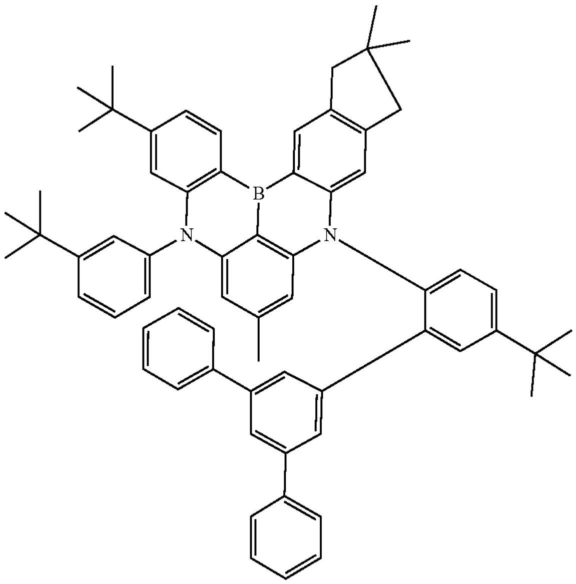
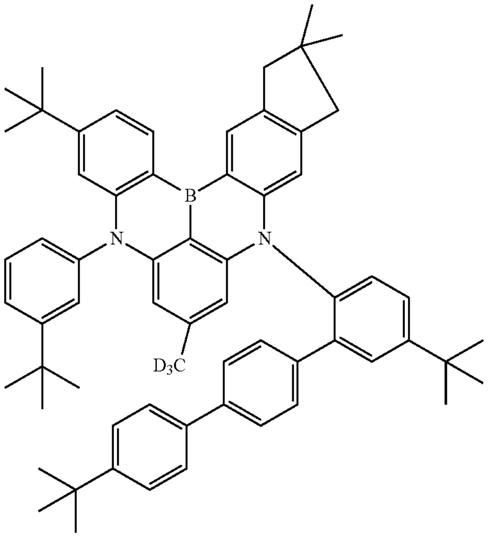
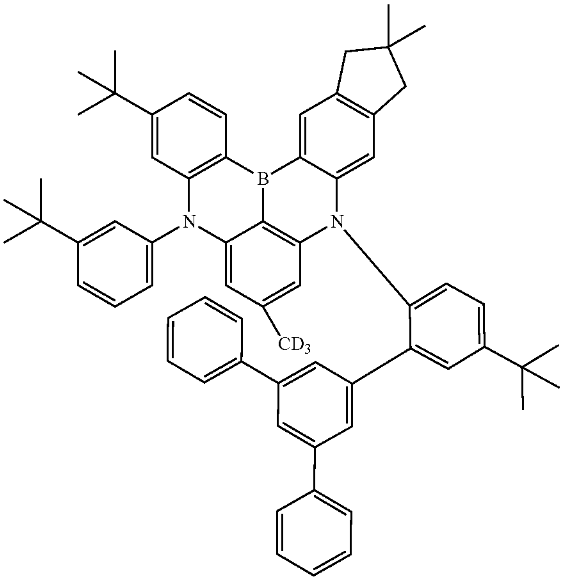
-continued
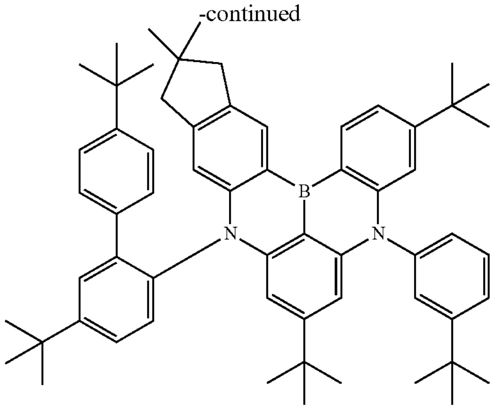
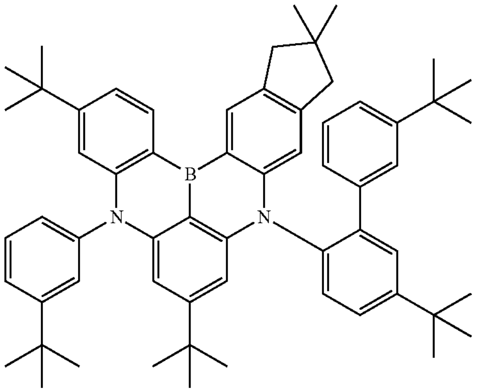
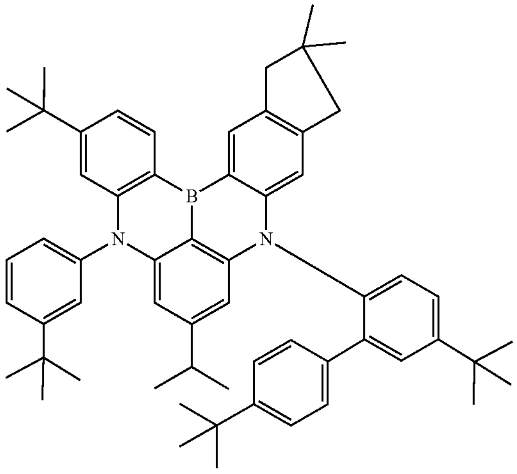
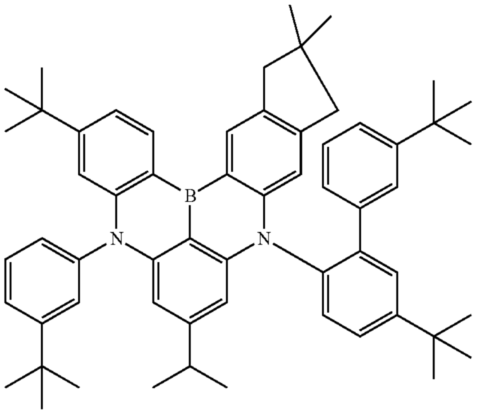

-continued
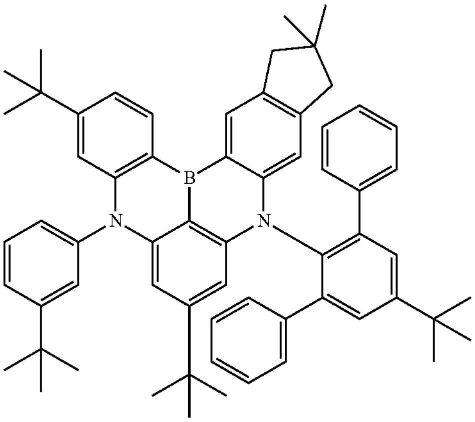
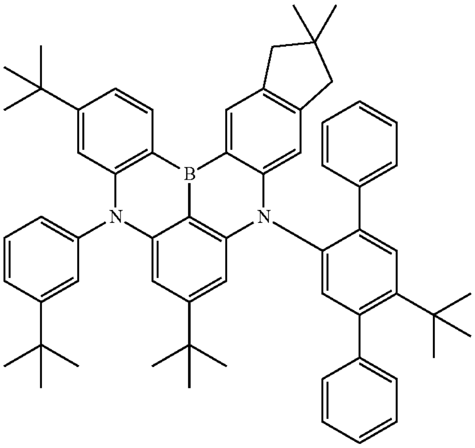
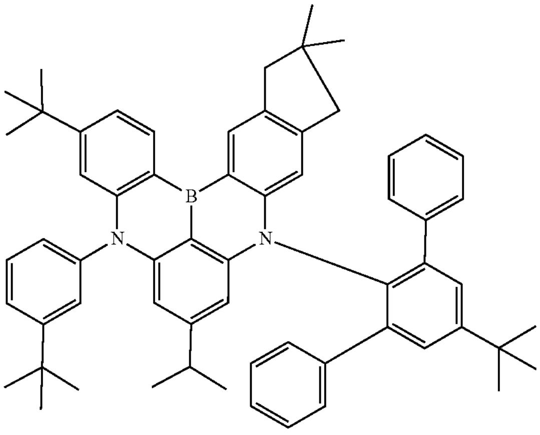
-continued
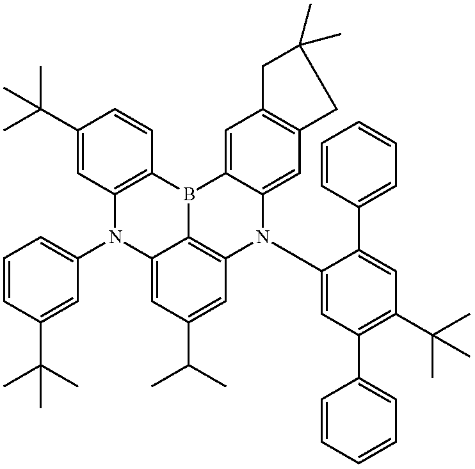
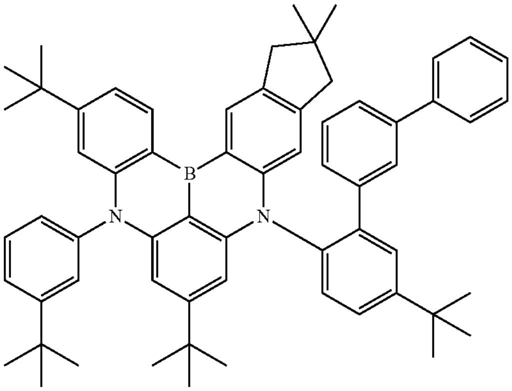
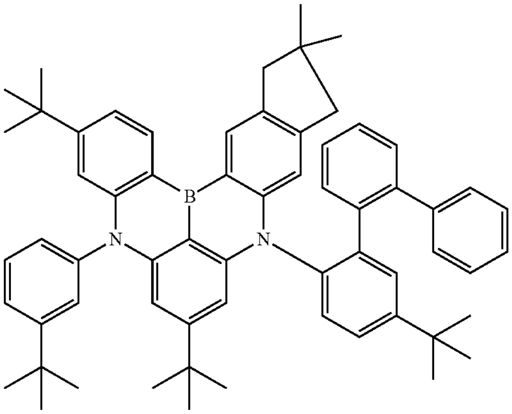
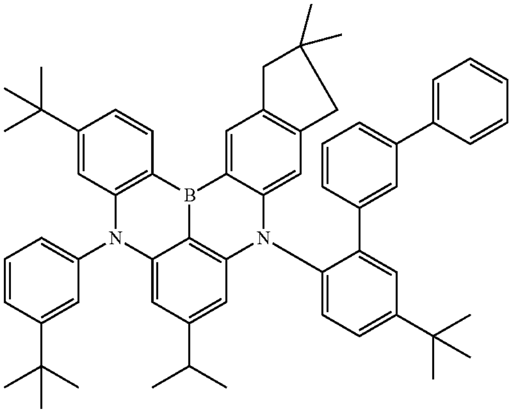

-continued
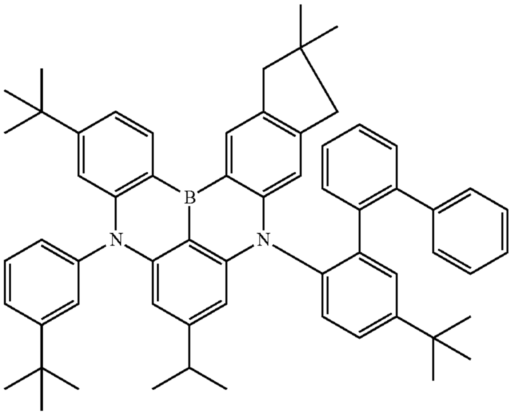
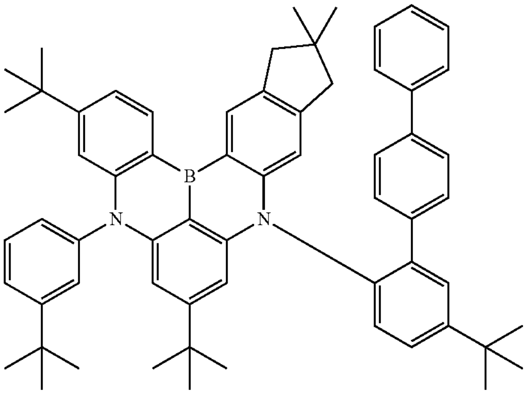
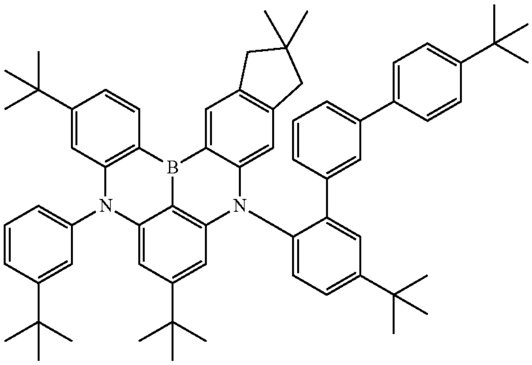
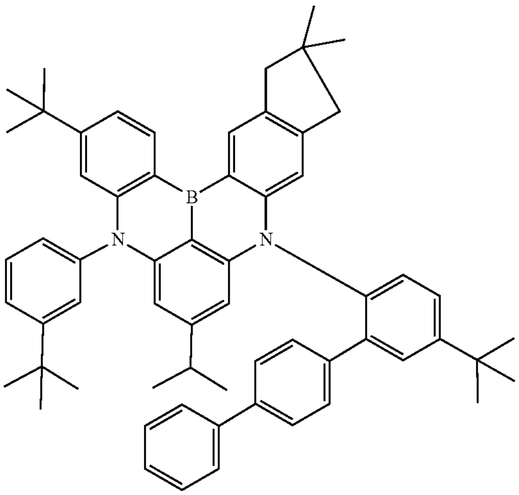
-continued
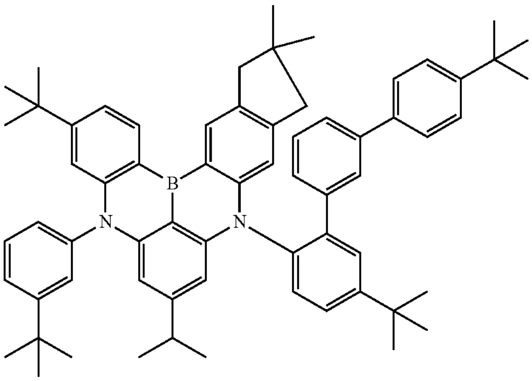
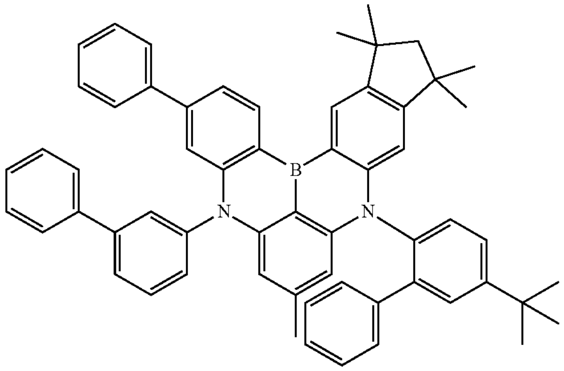
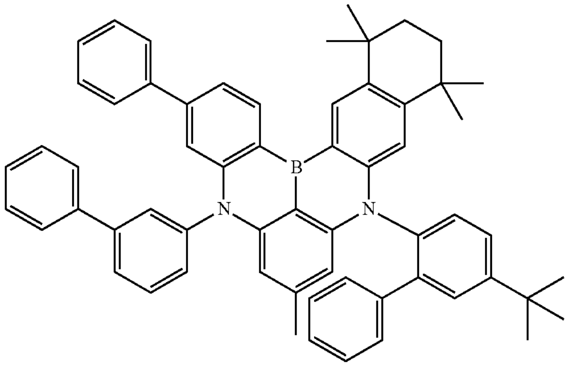
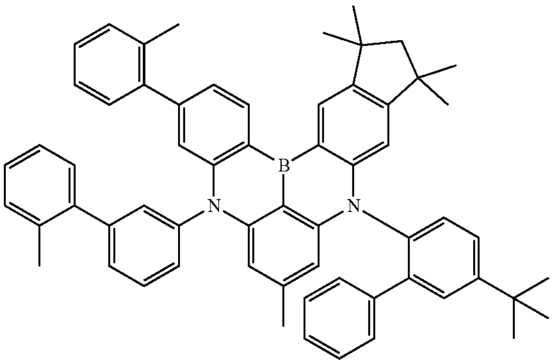

-continued
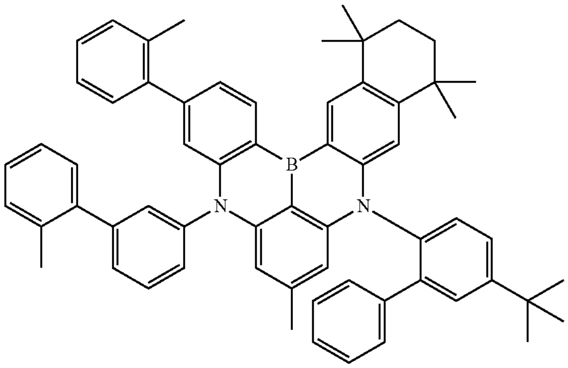
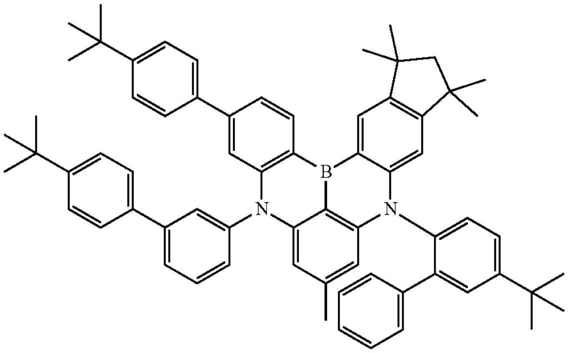
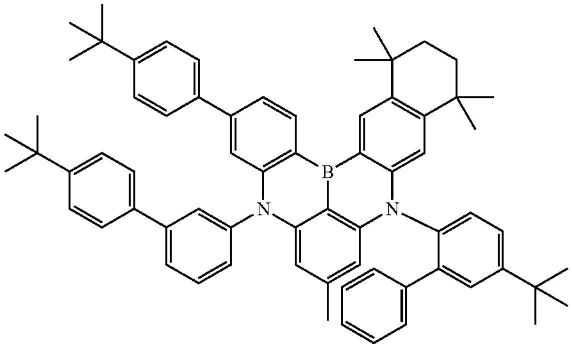
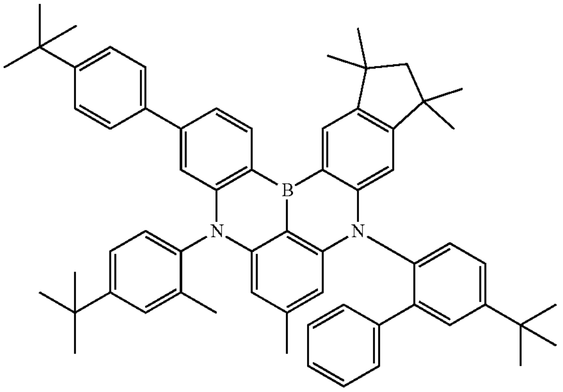
-continued
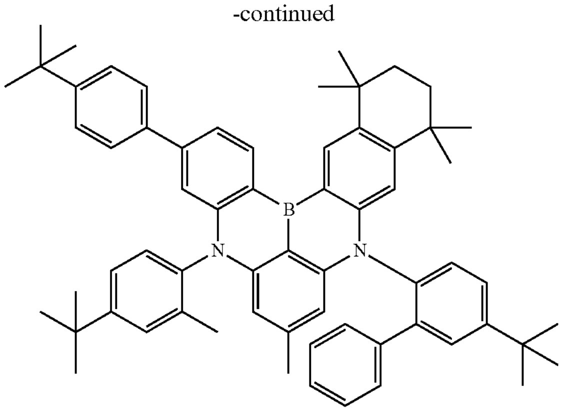
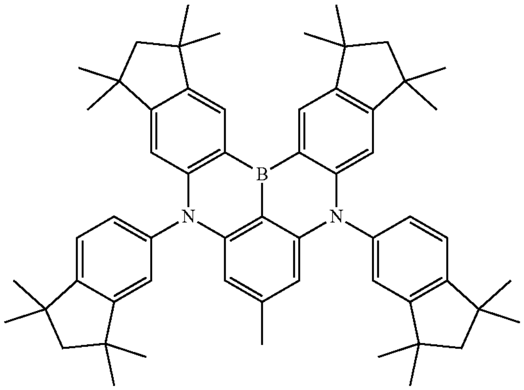
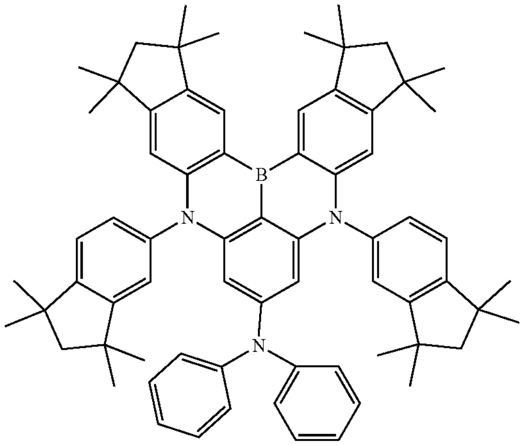
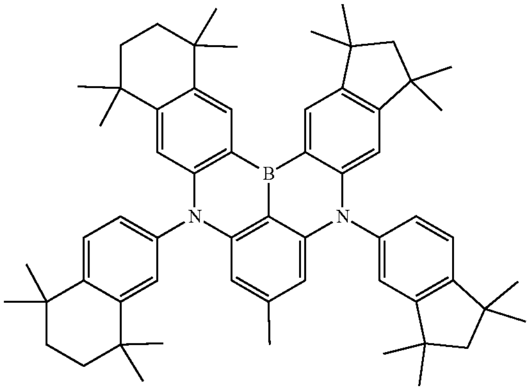

-continued
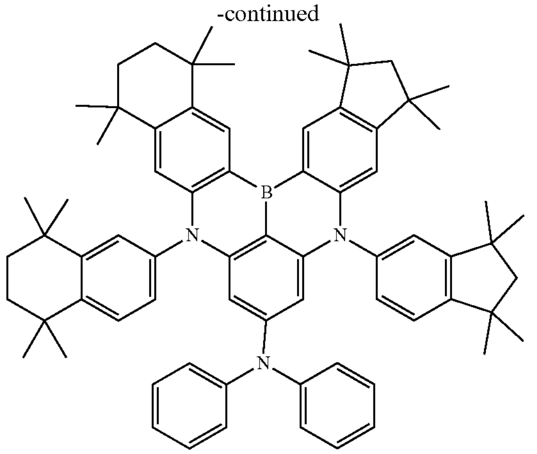
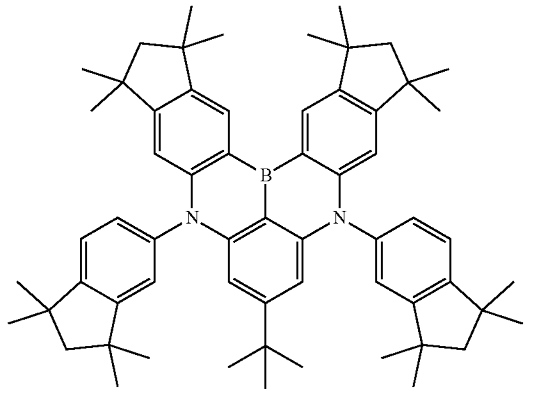
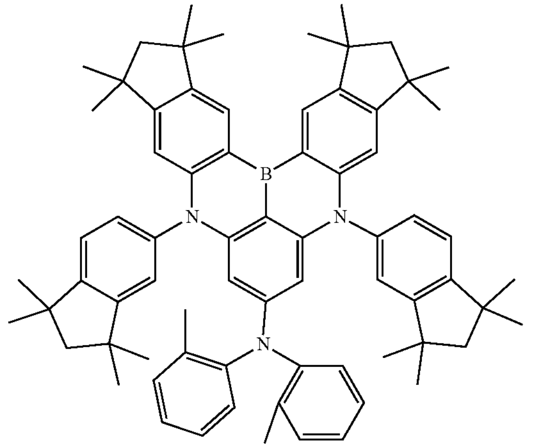
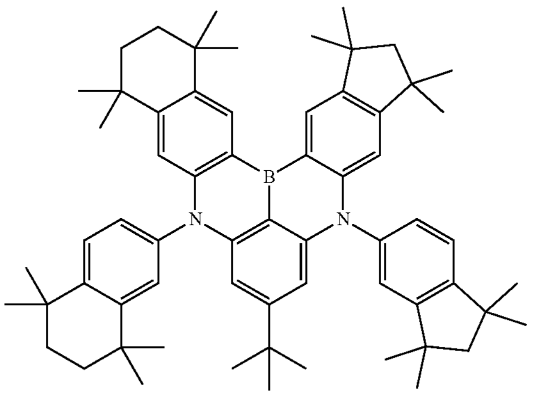
-continued
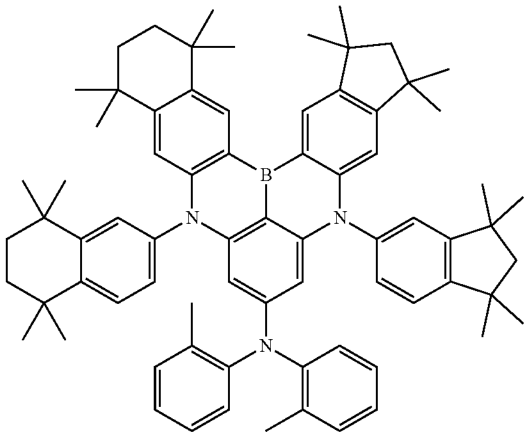
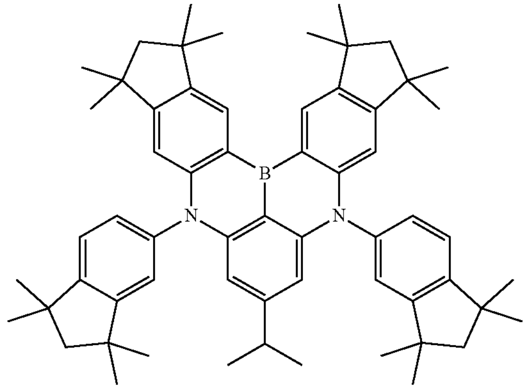
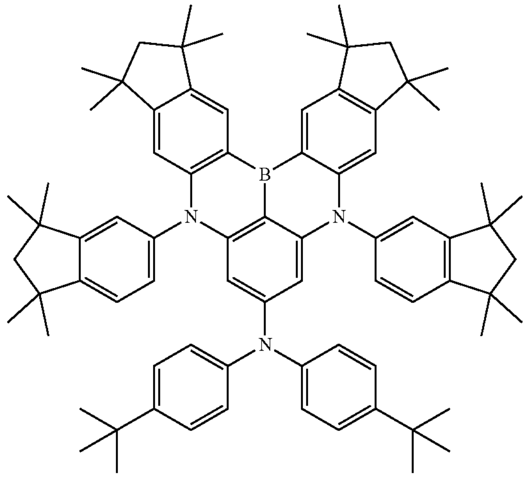
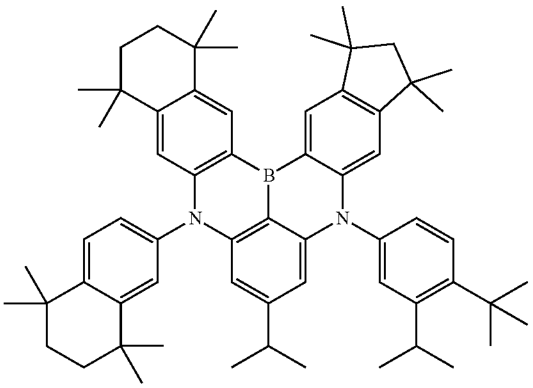

-continued
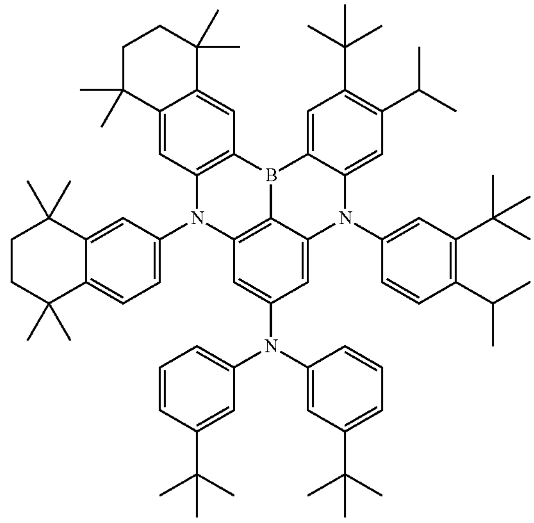
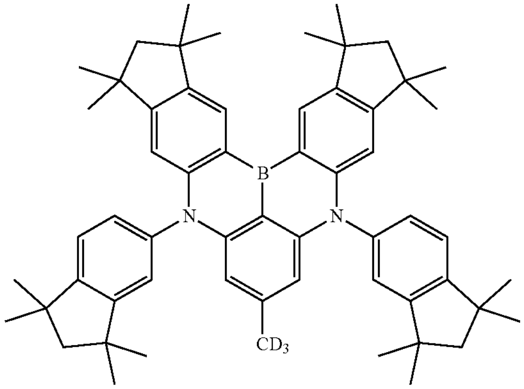
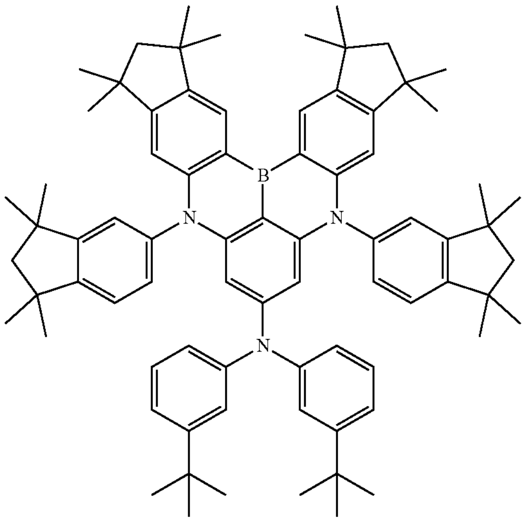
-continued
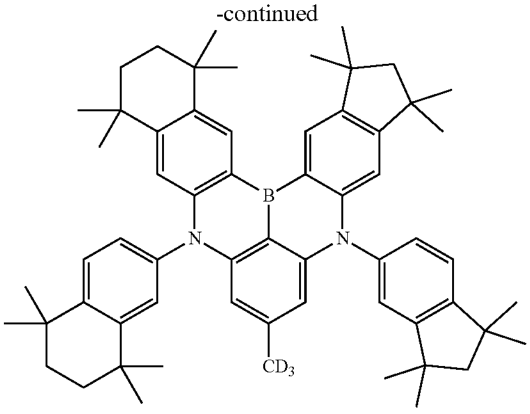
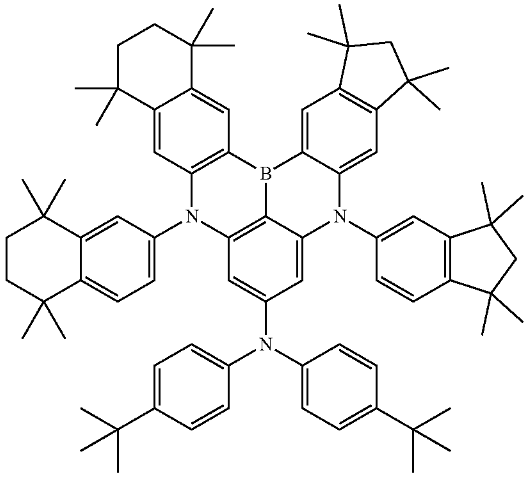
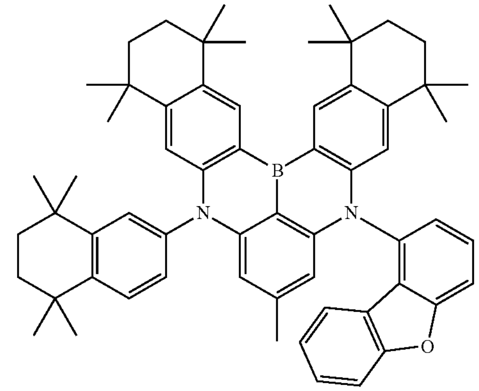
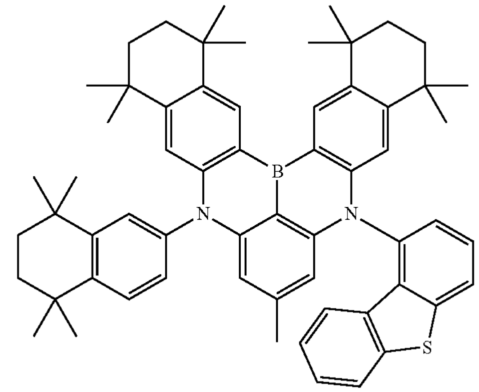

-continued
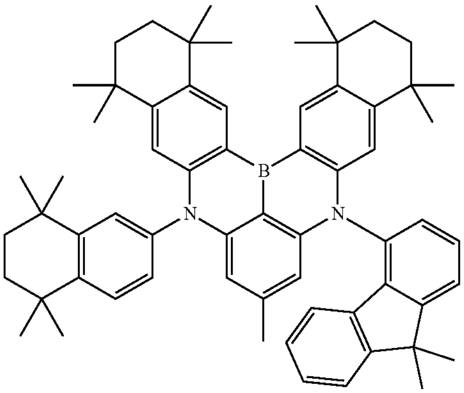
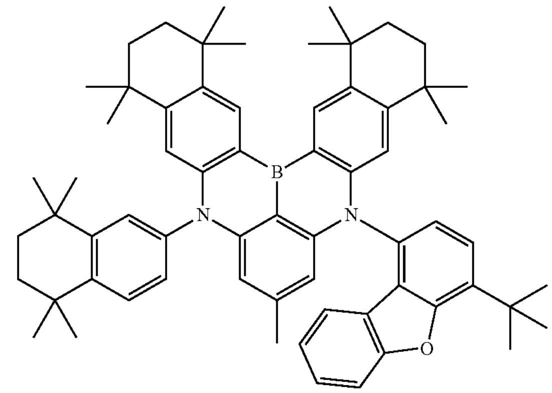
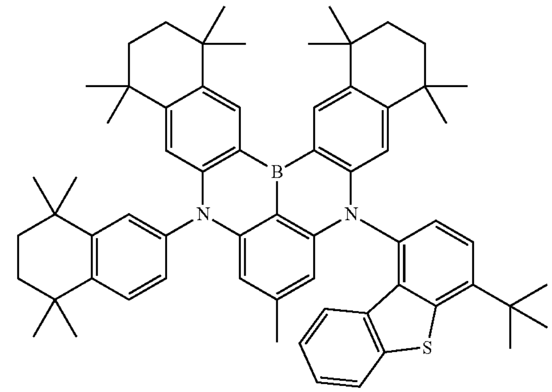
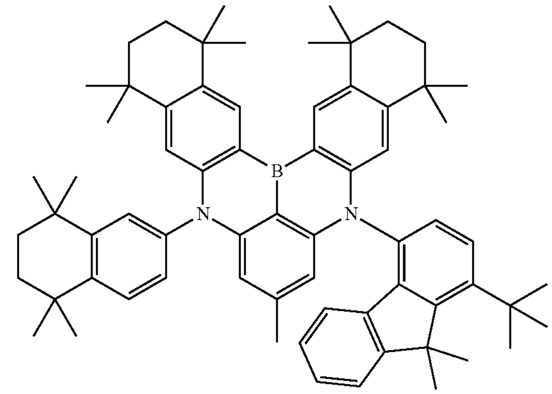
-continued
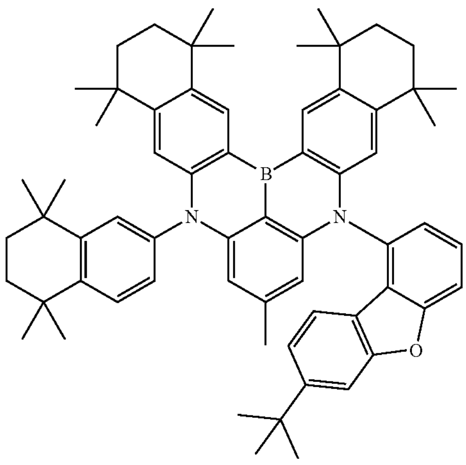
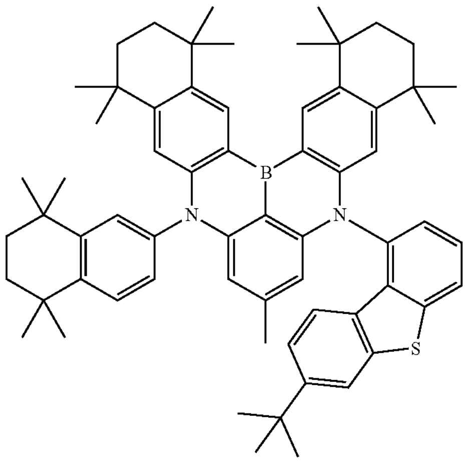
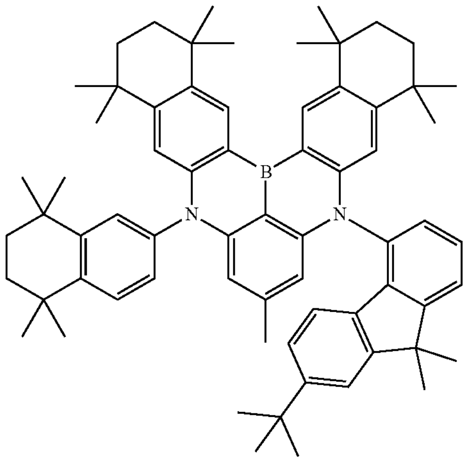

-continued
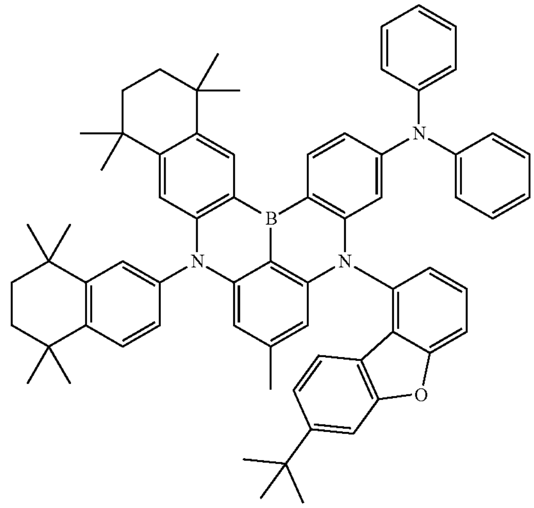
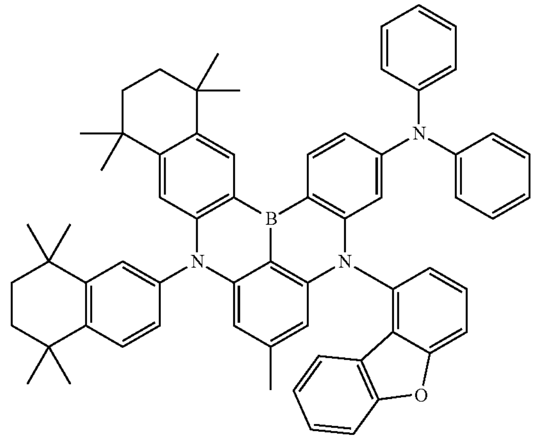
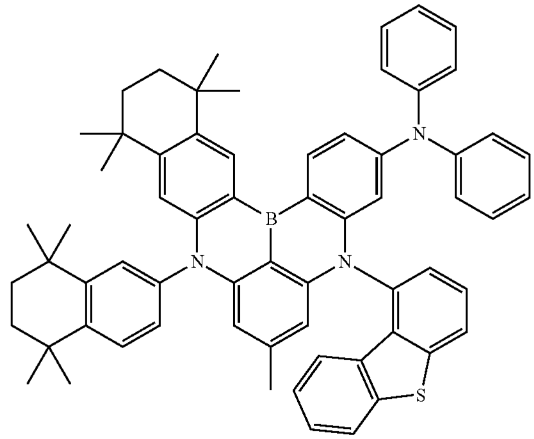
-continued
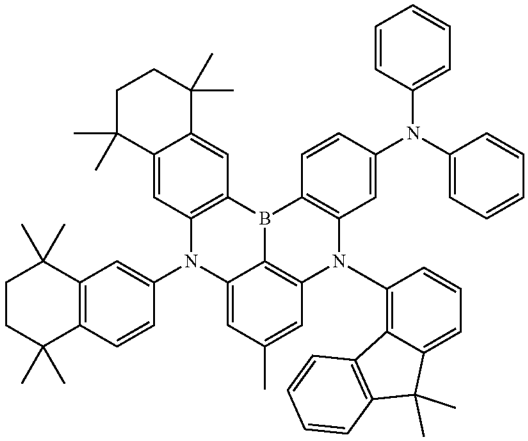
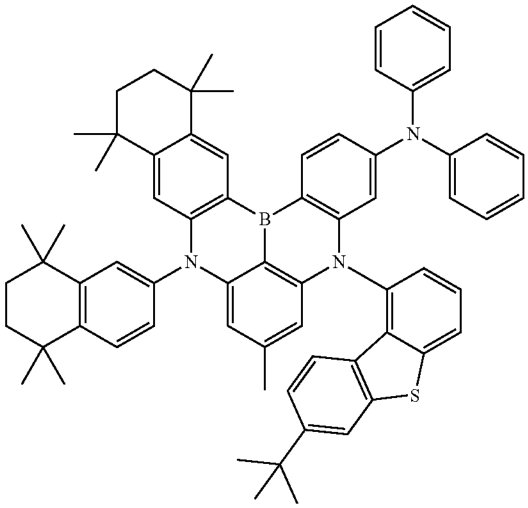
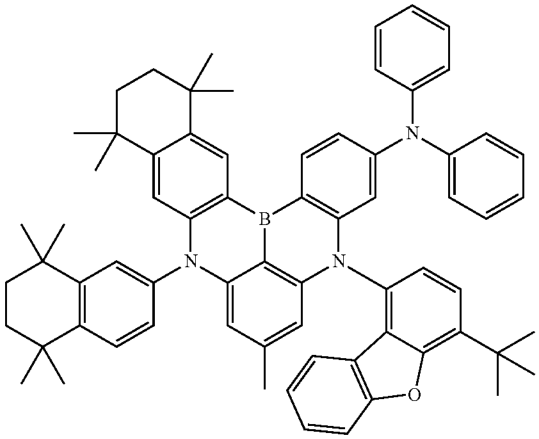

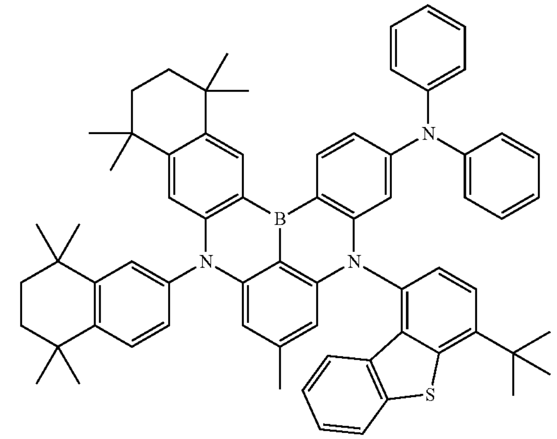
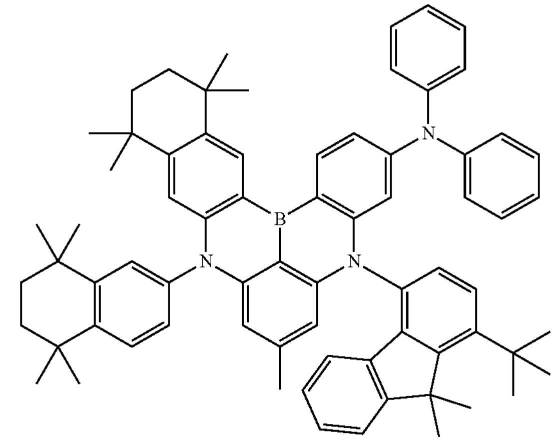
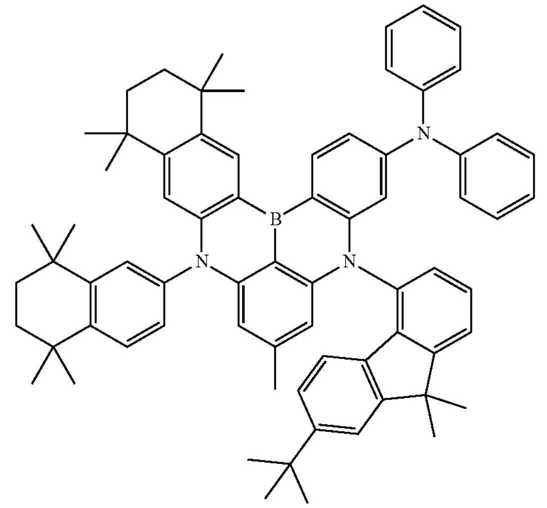
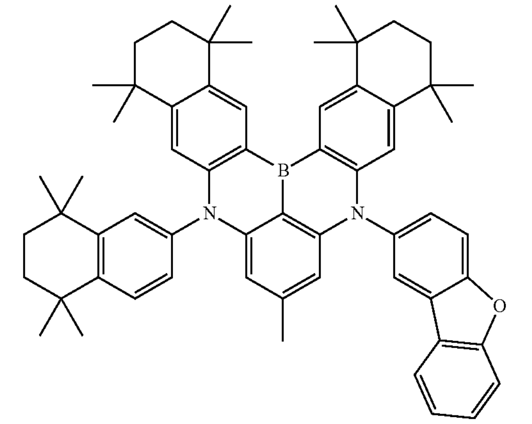
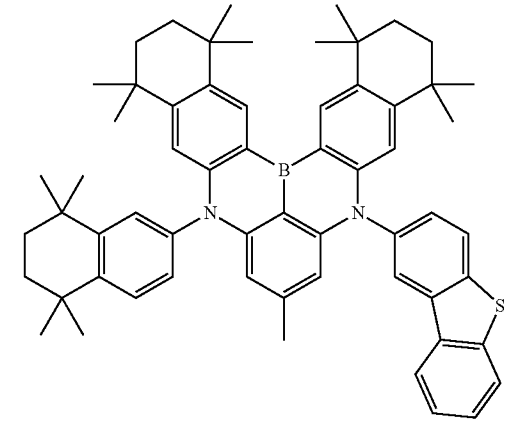
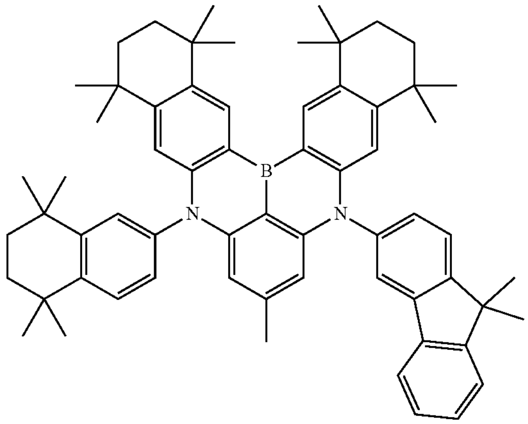

-continued
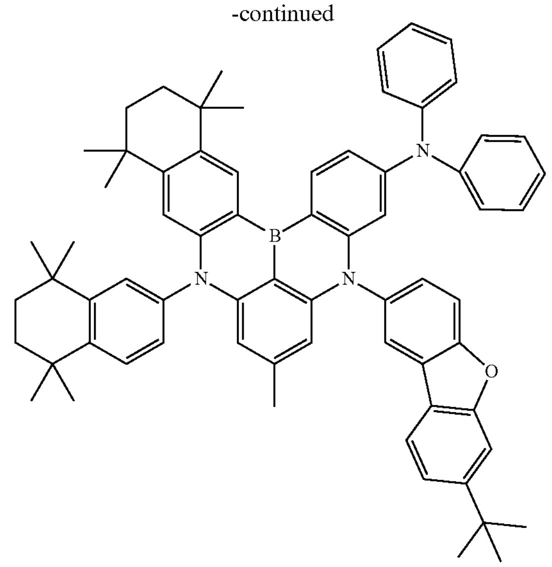
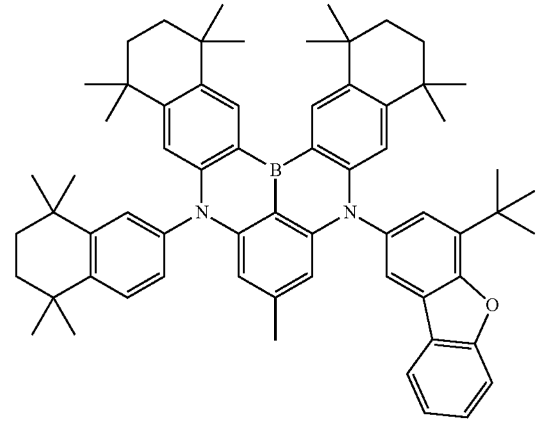
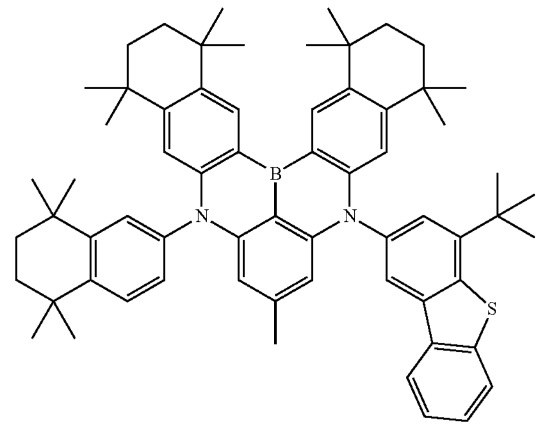
-continued
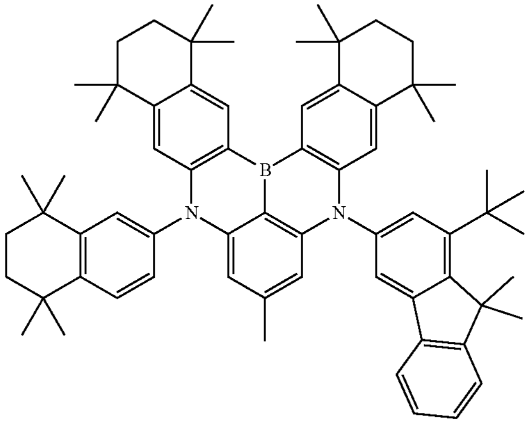
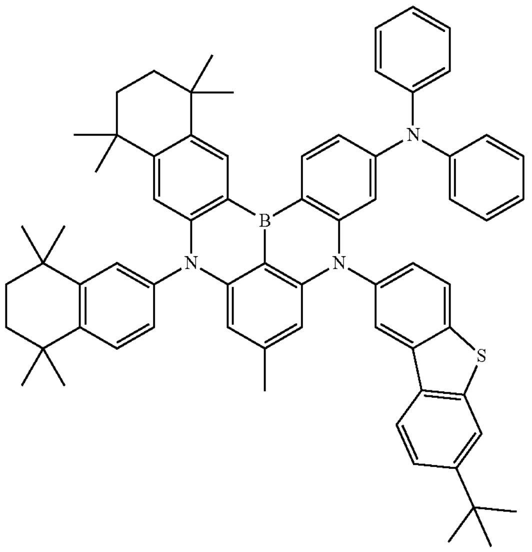
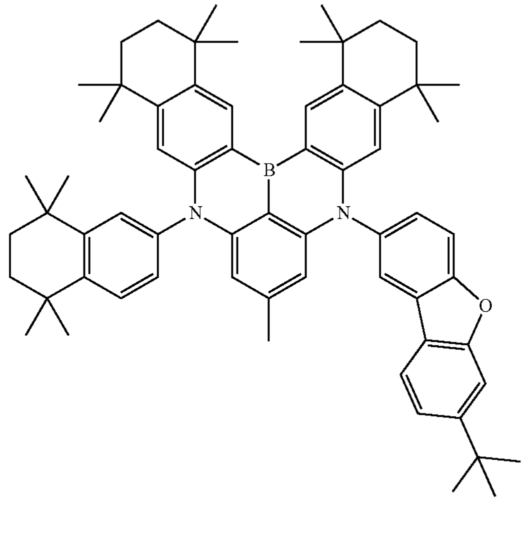

-continued
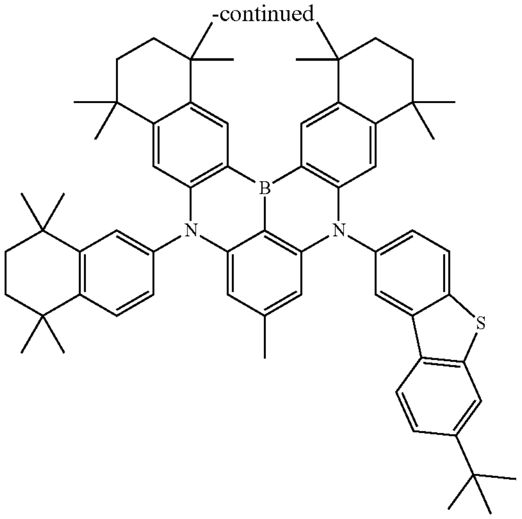
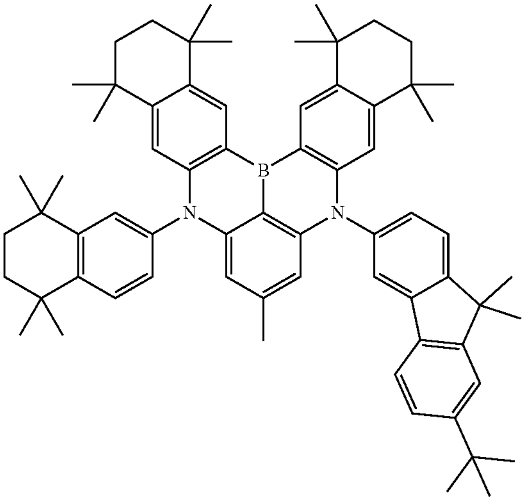
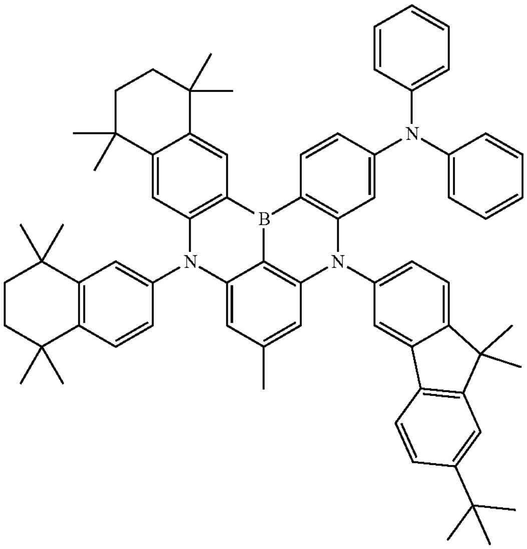
-continued
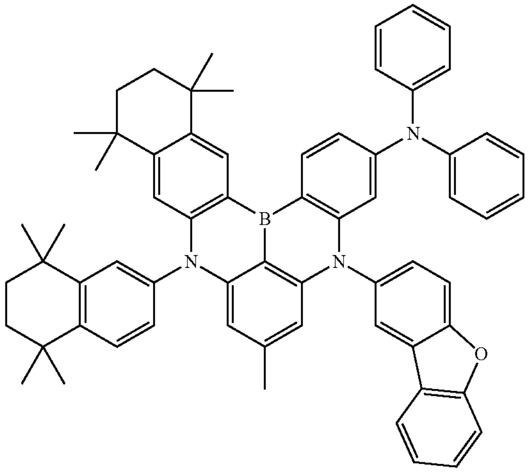
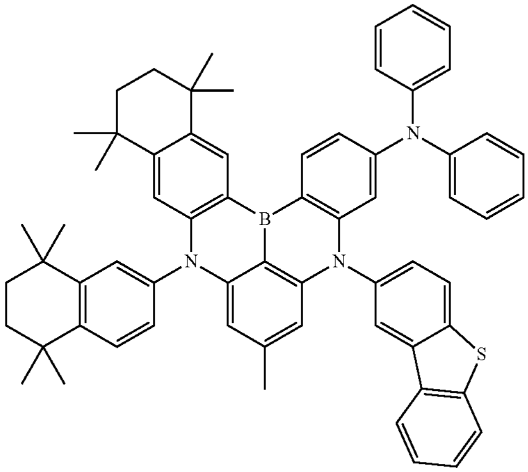
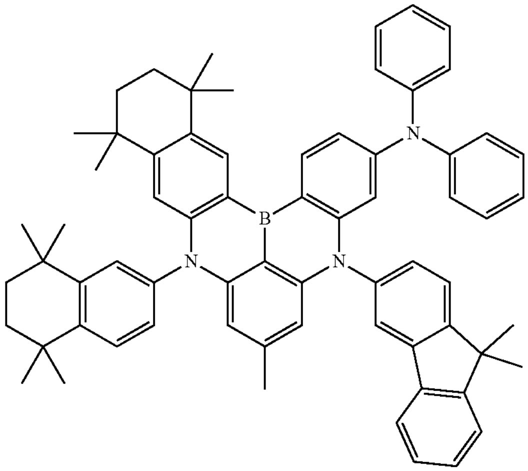

-continued
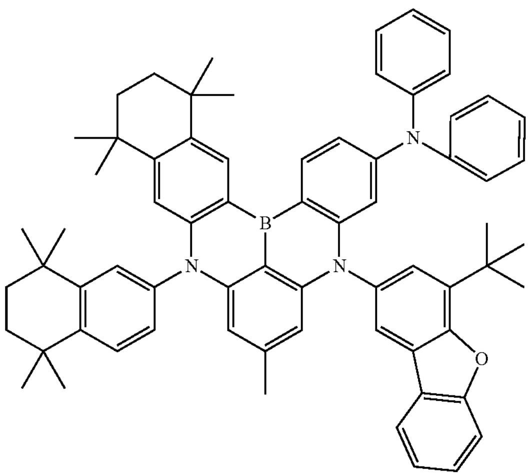
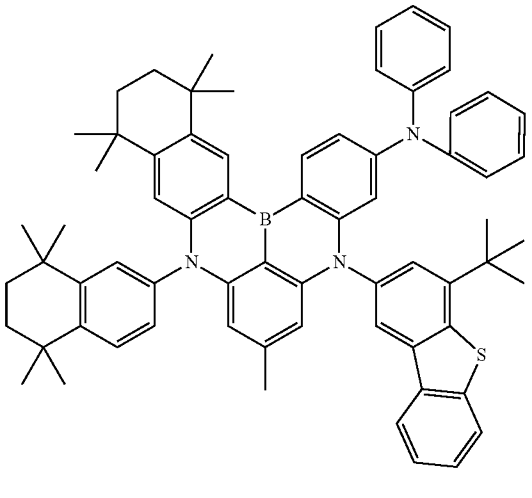
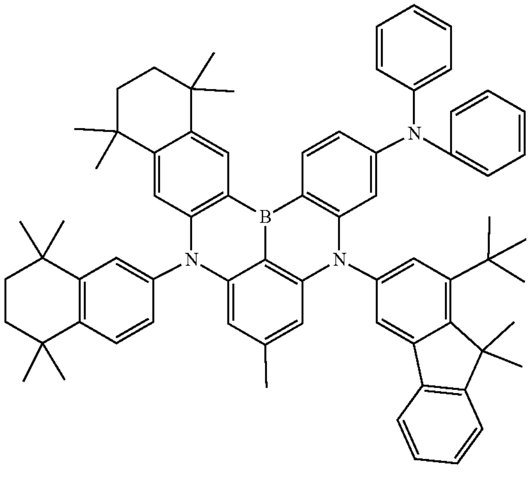
-continued
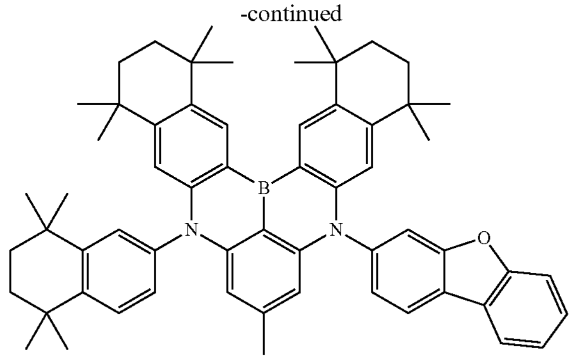
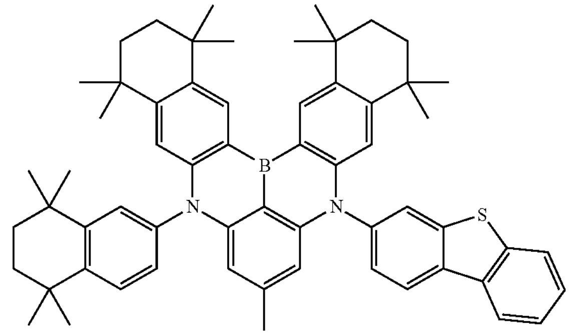
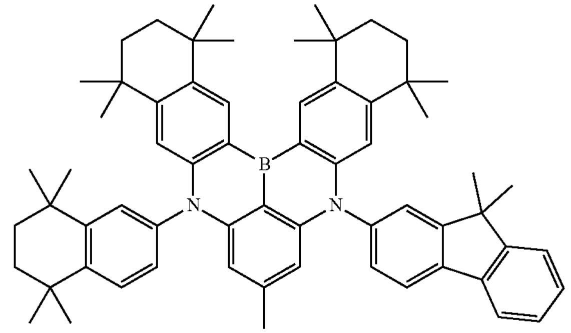
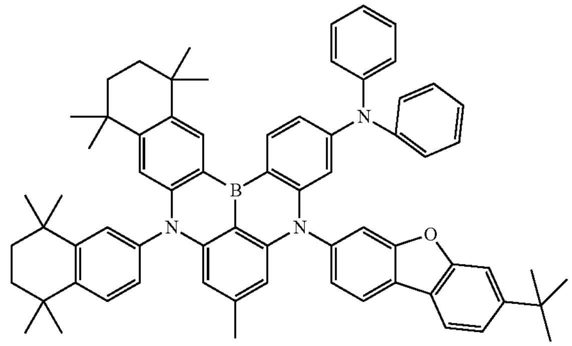
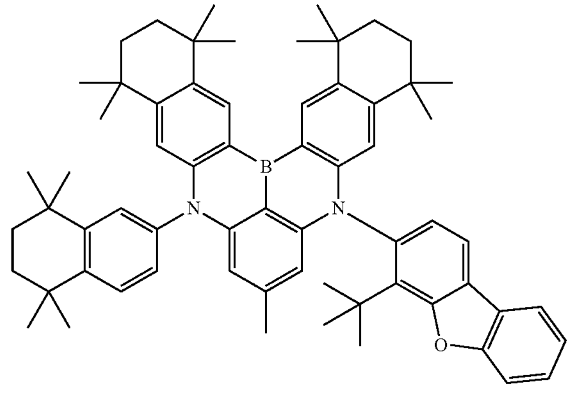

-continued
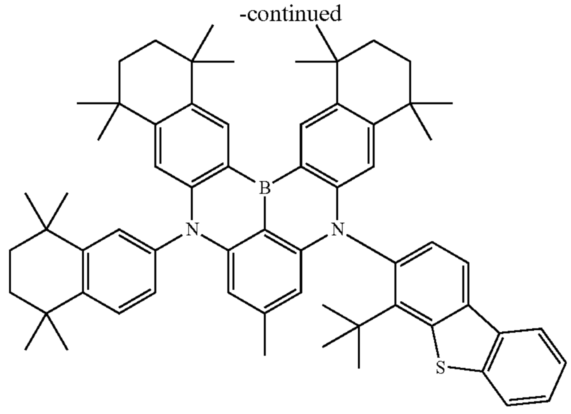
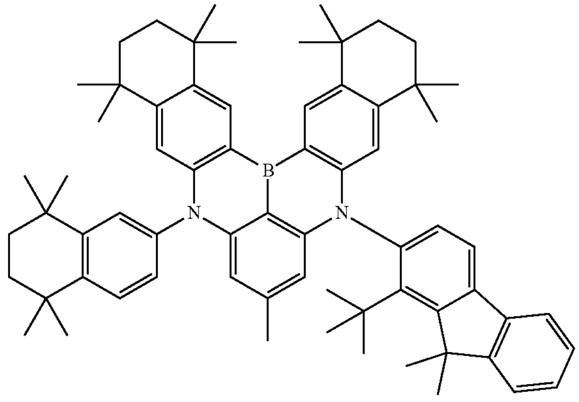
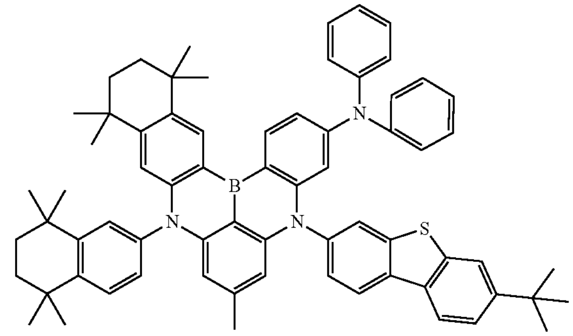
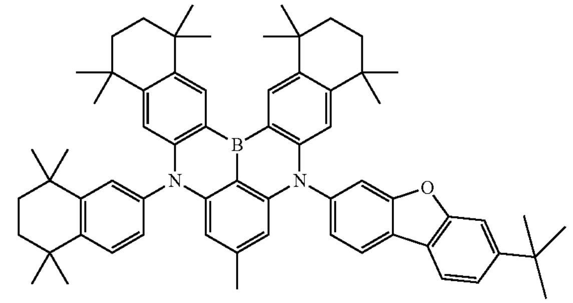
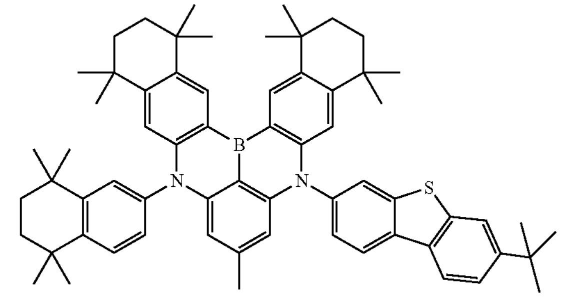
-continued
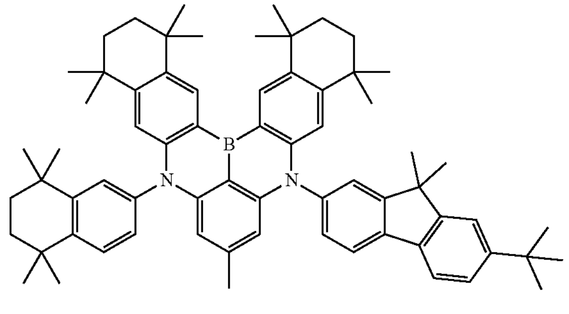
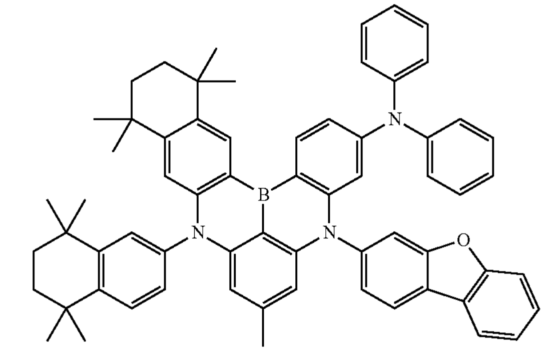
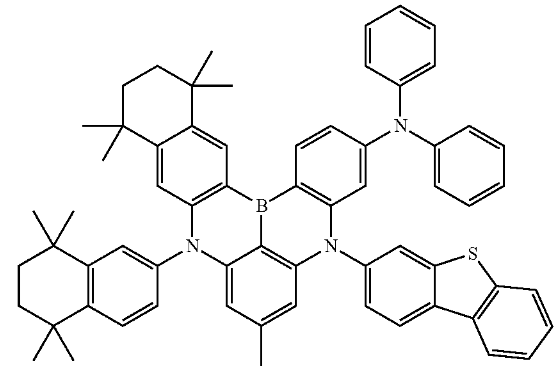
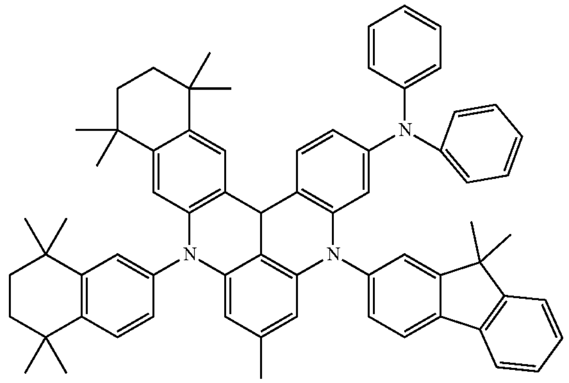

-continued
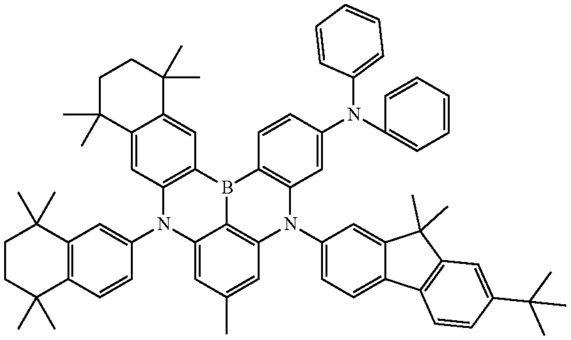
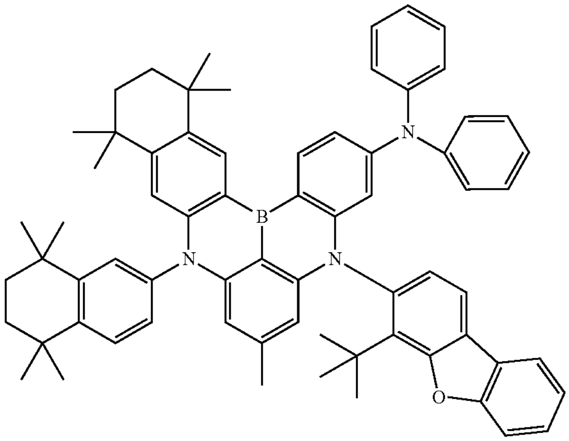
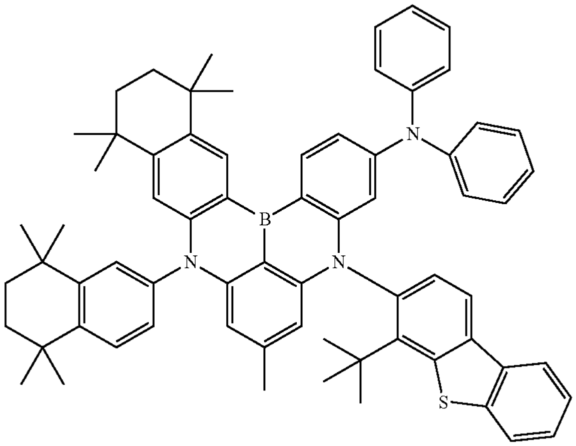
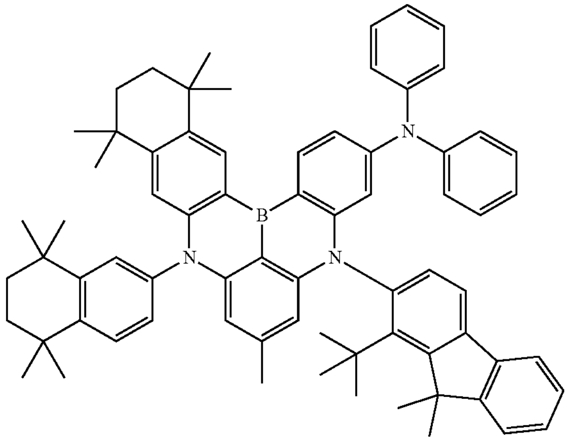
-continued
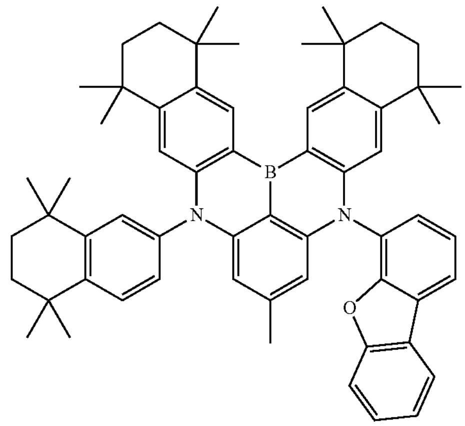
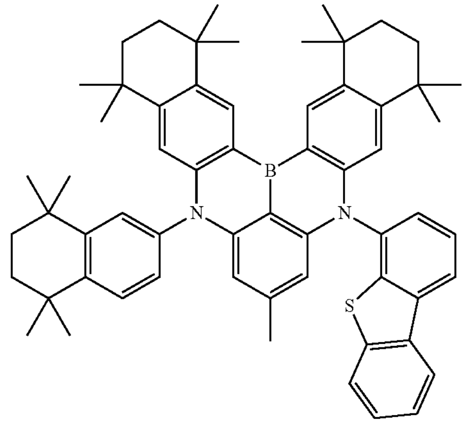
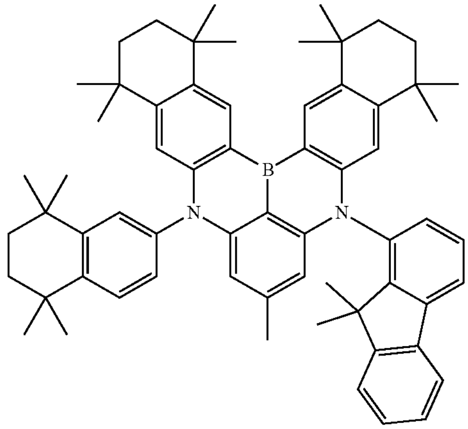

-continued
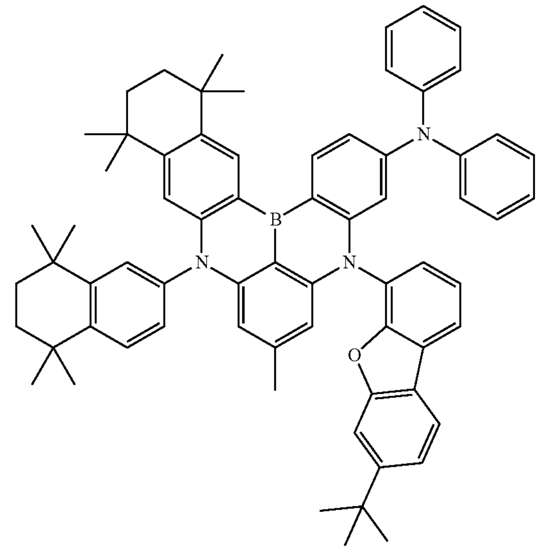
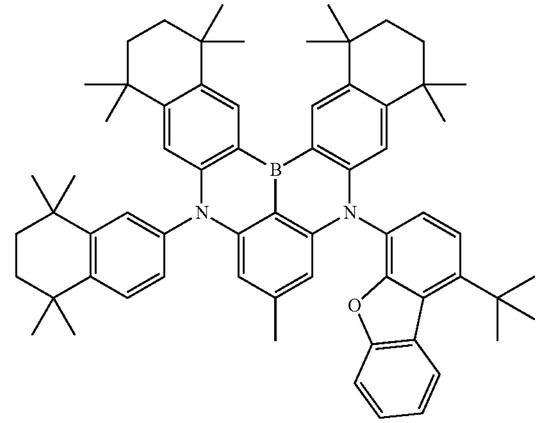
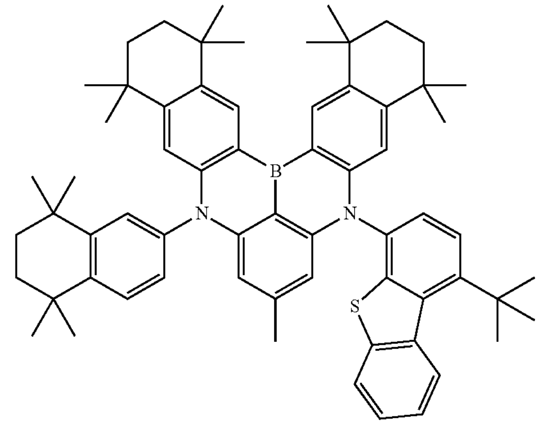
-continued
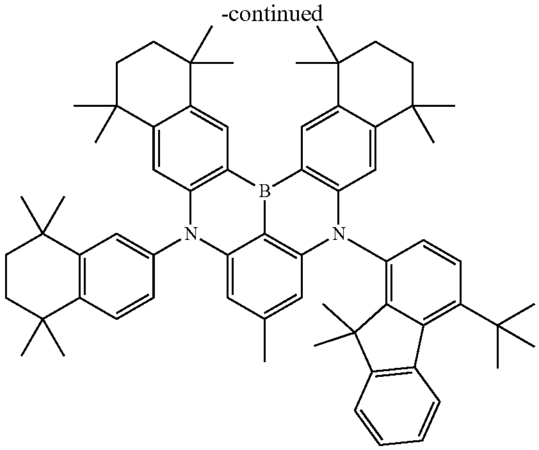
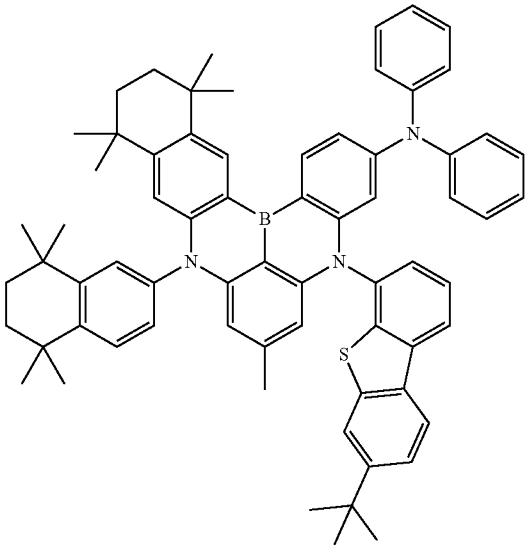
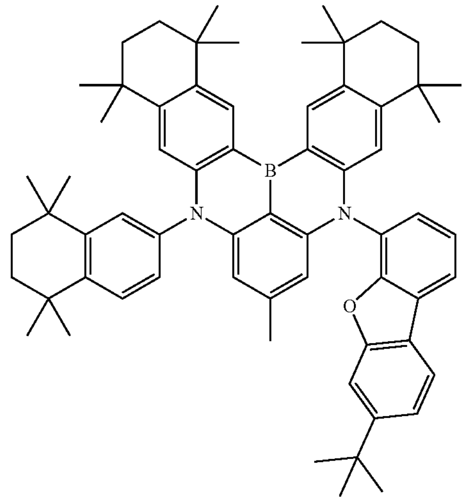

-continued
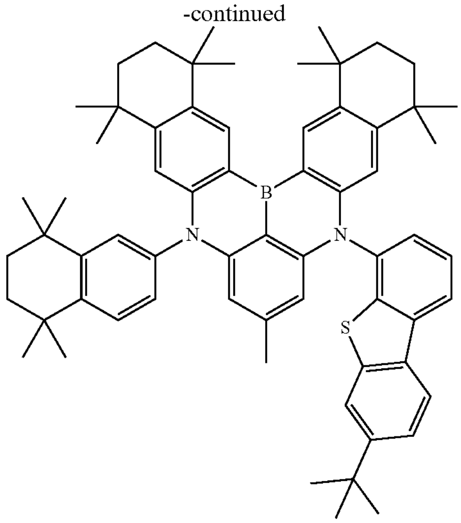
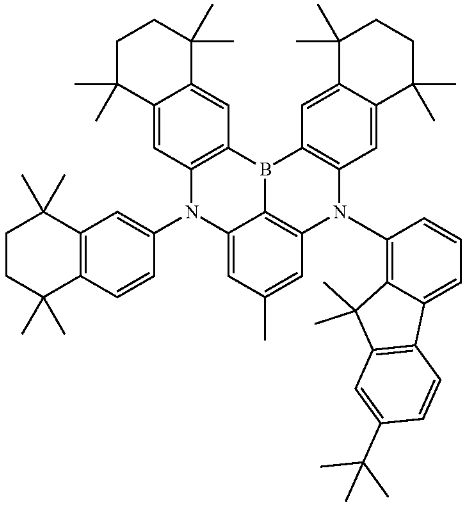
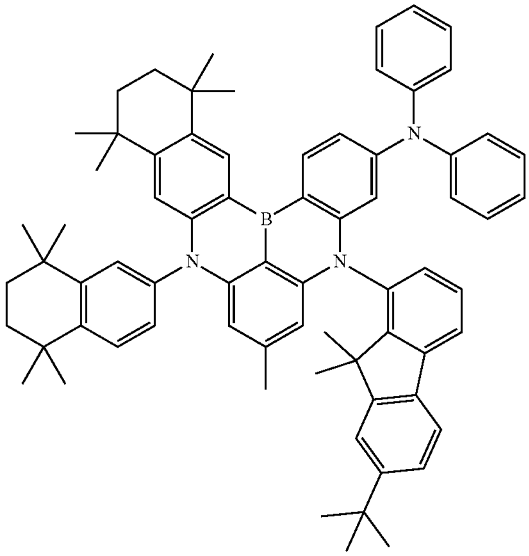
-continued
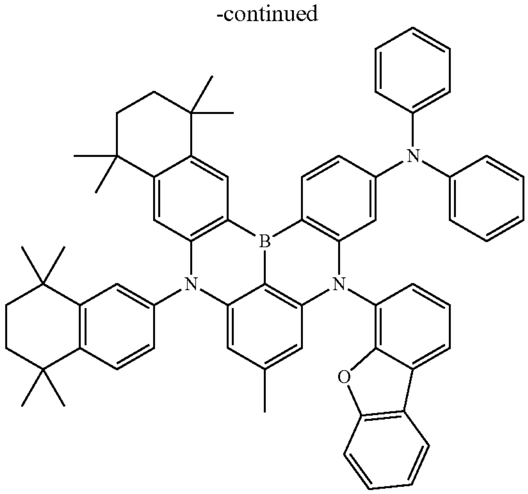
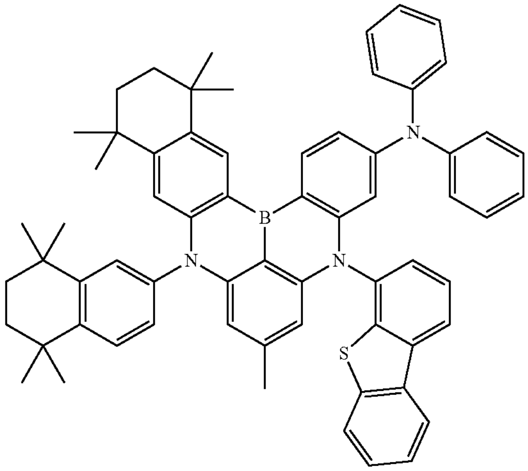
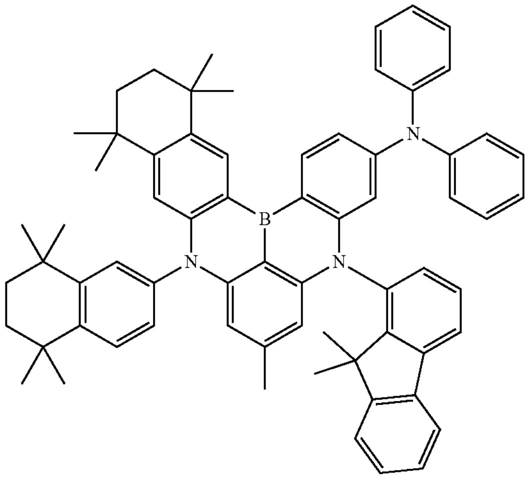

-continued
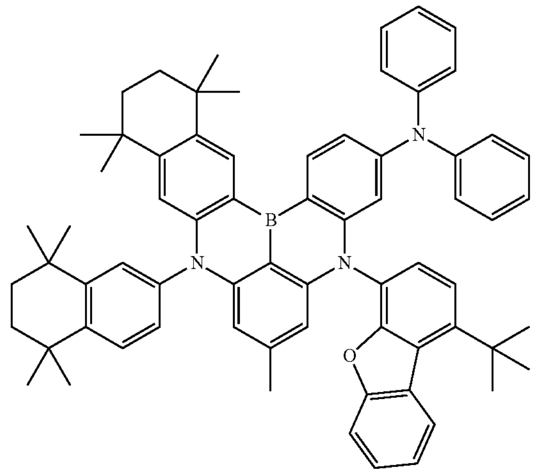
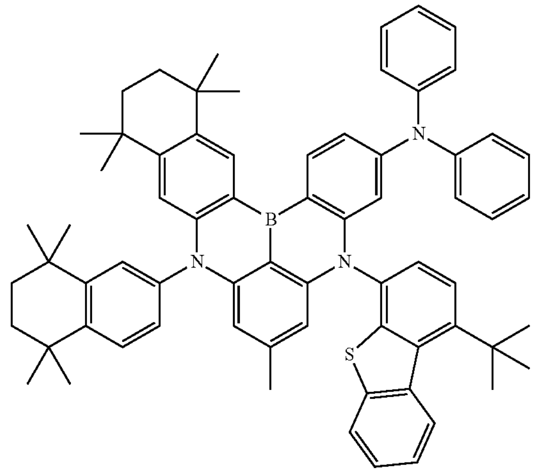
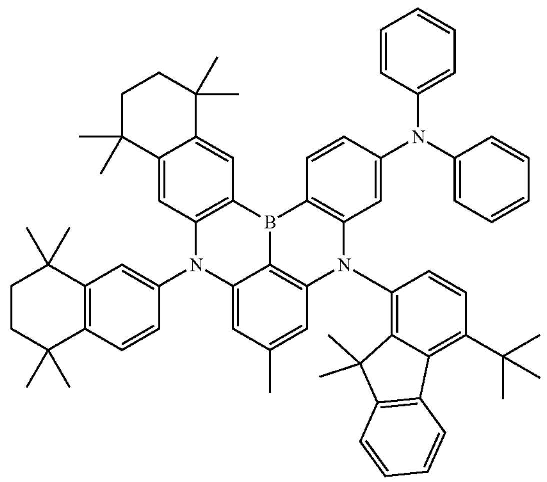
-continued
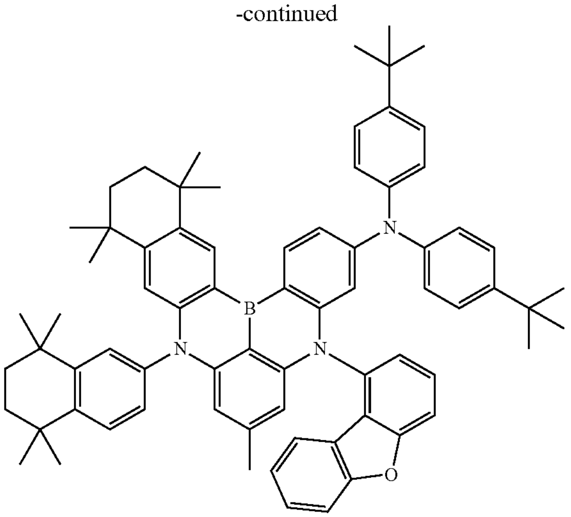
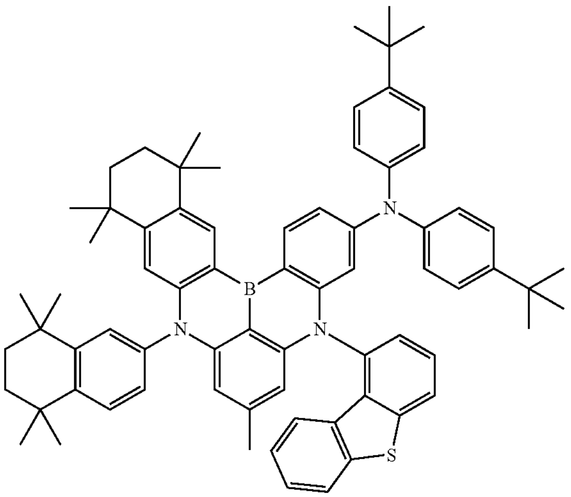
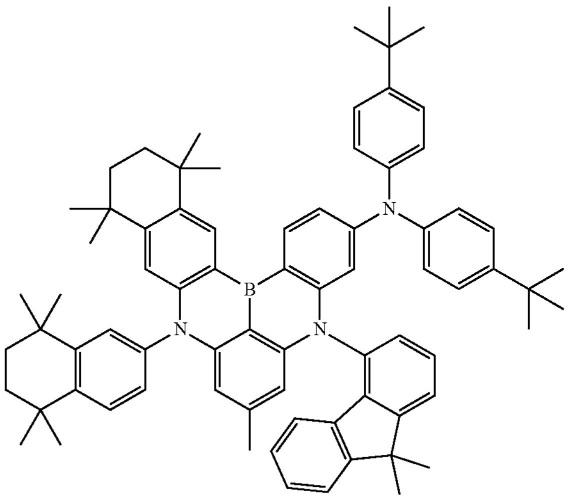

-continued
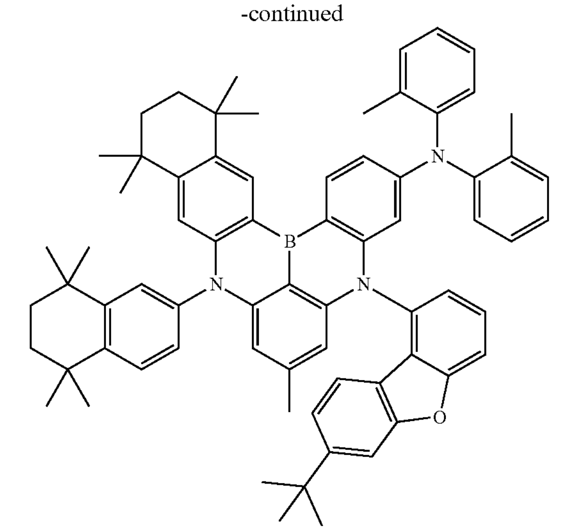
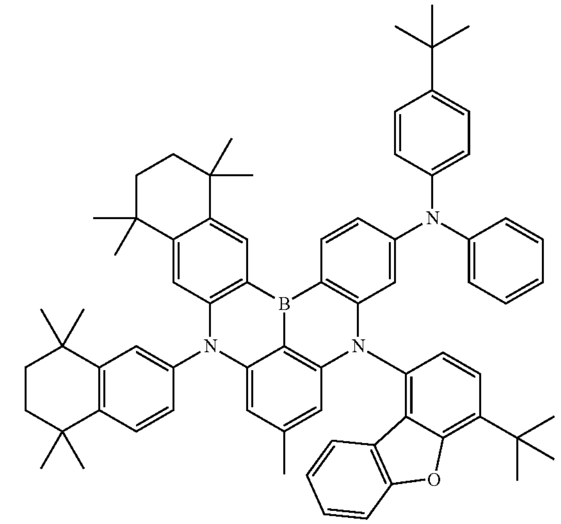
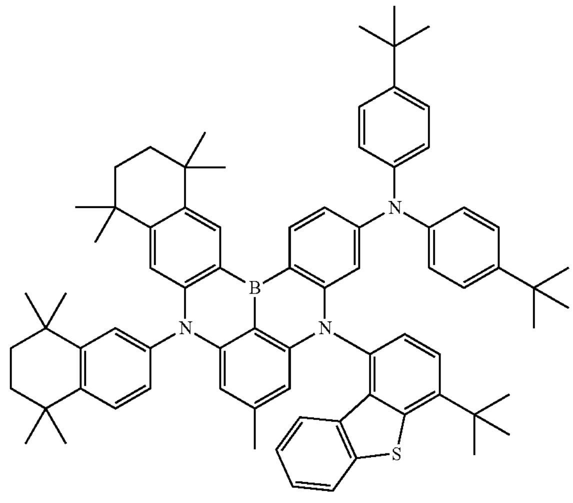
-continued
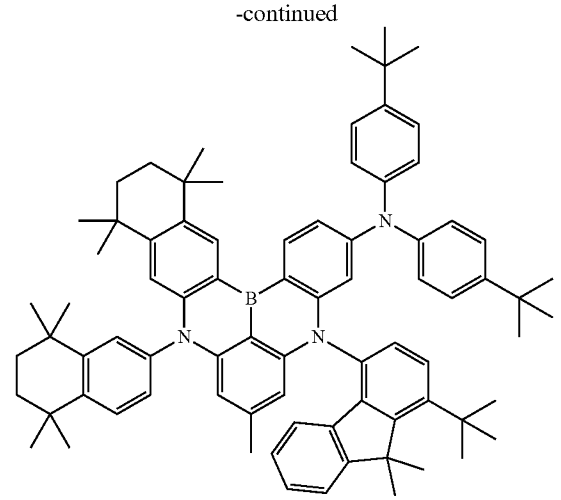
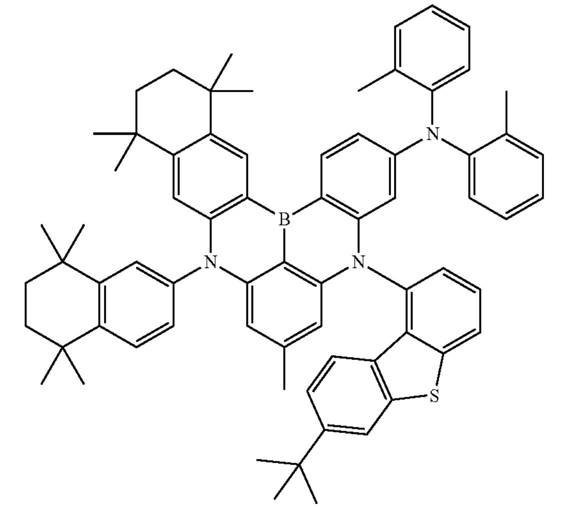
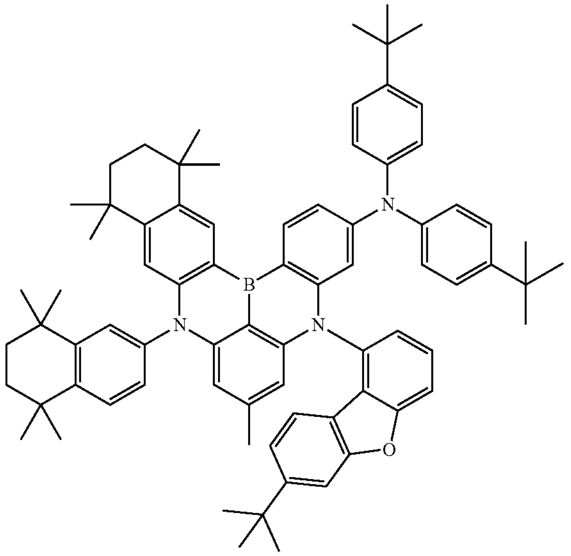

-continued
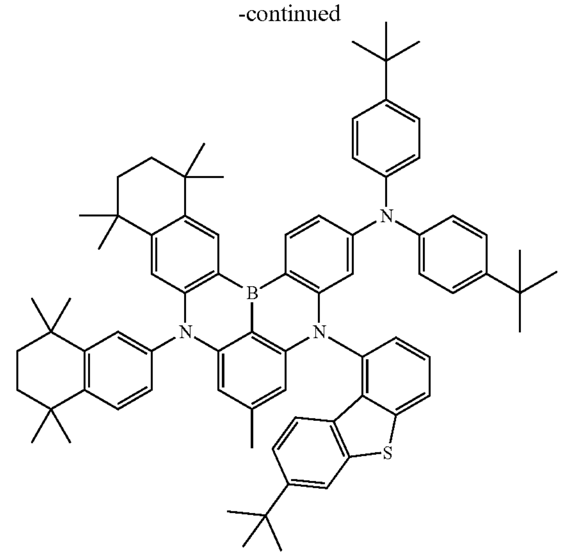
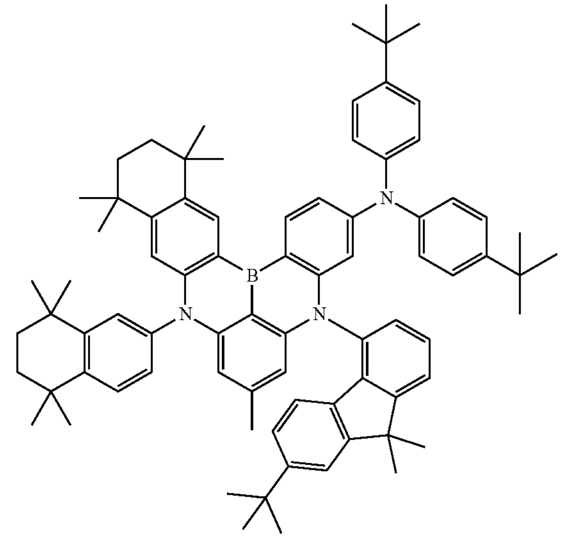
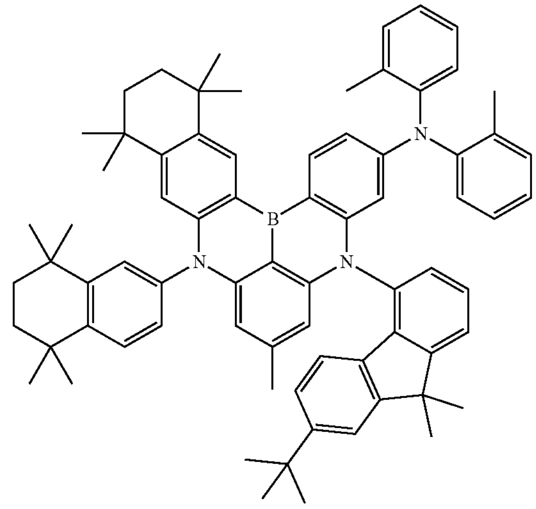
-continued
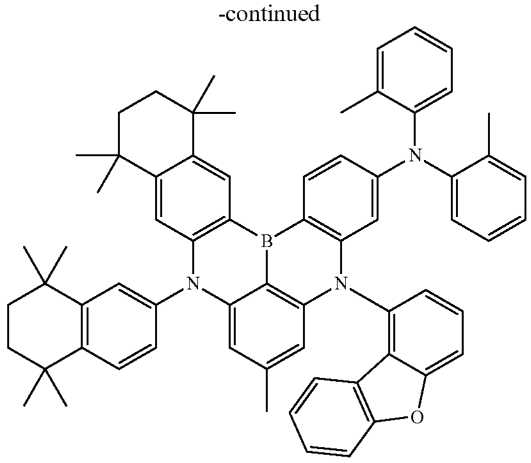
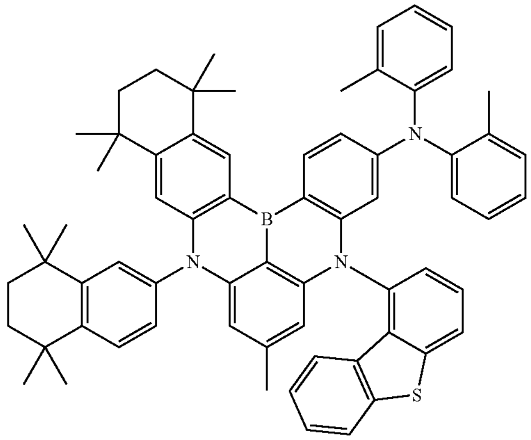
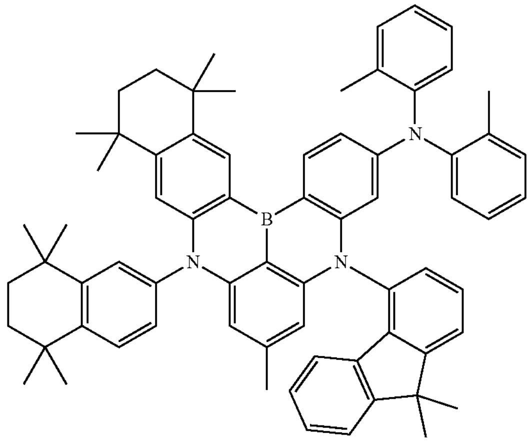

-continued
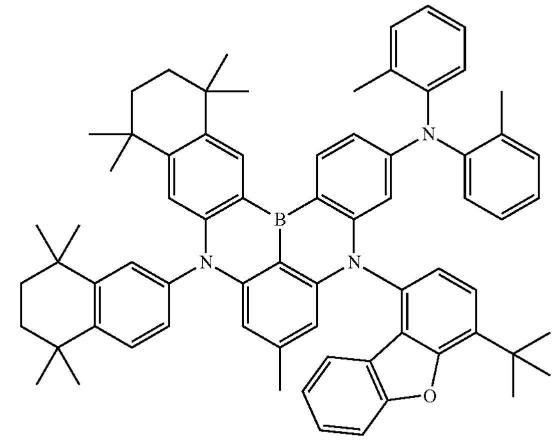
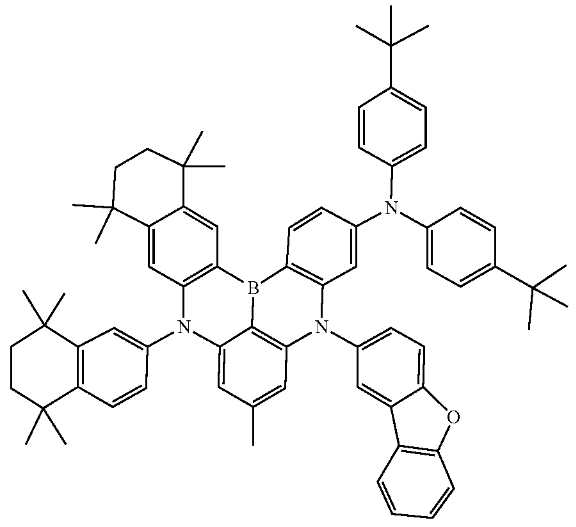
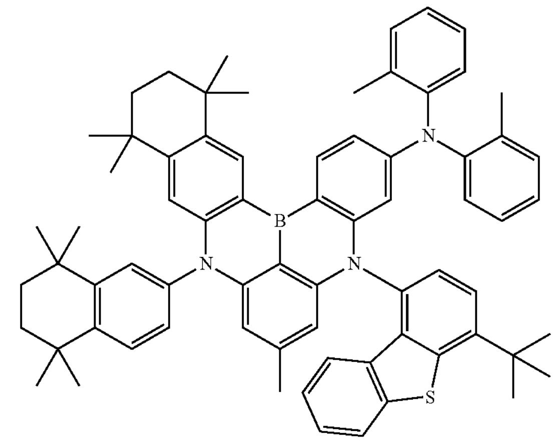
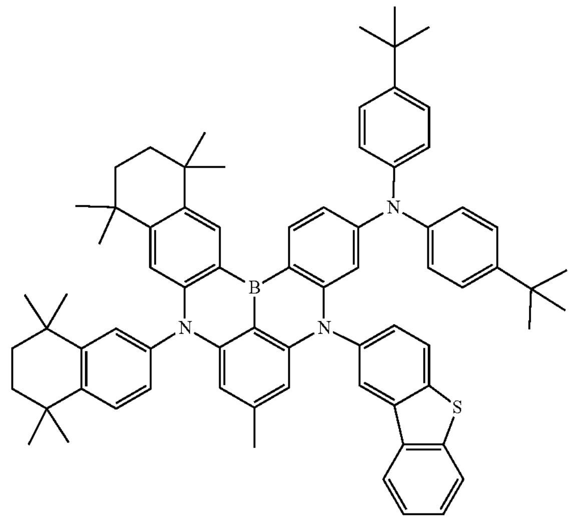
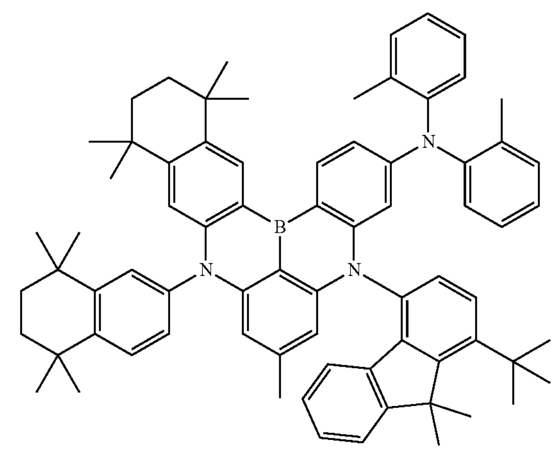
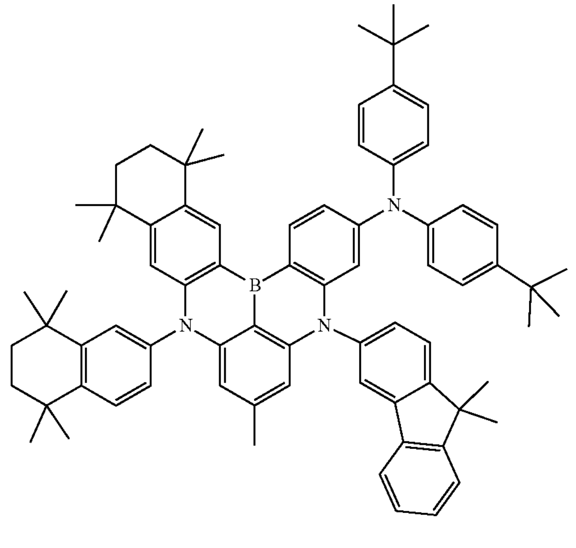

-continued
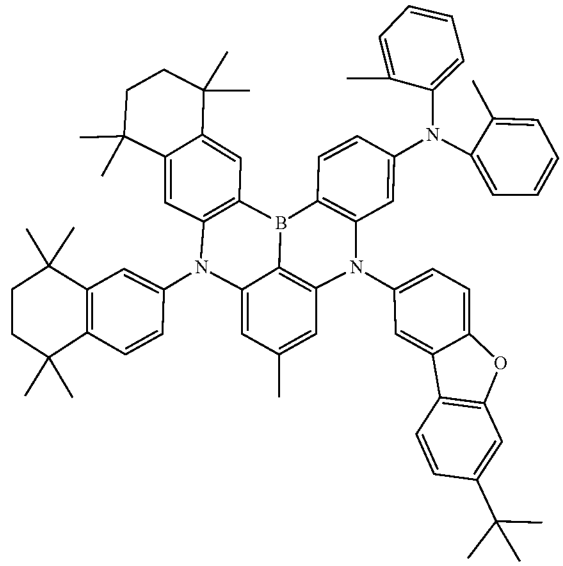
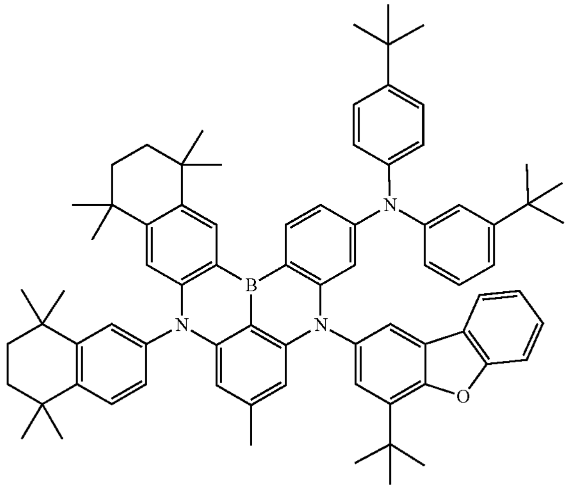
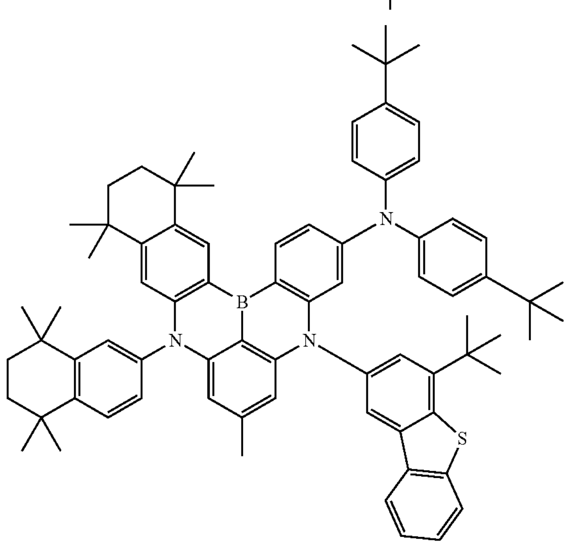
-continued
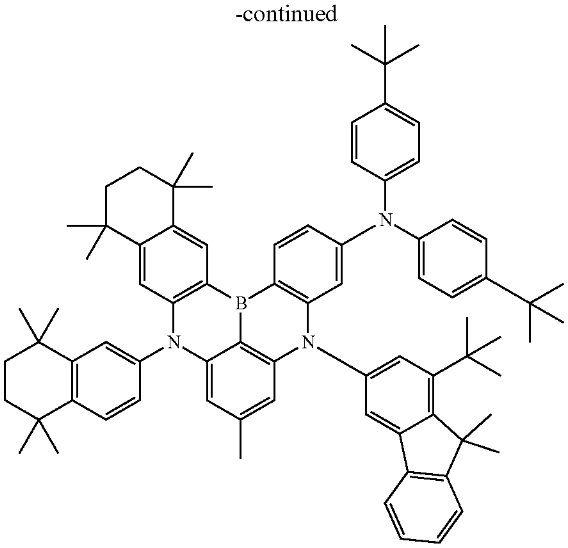
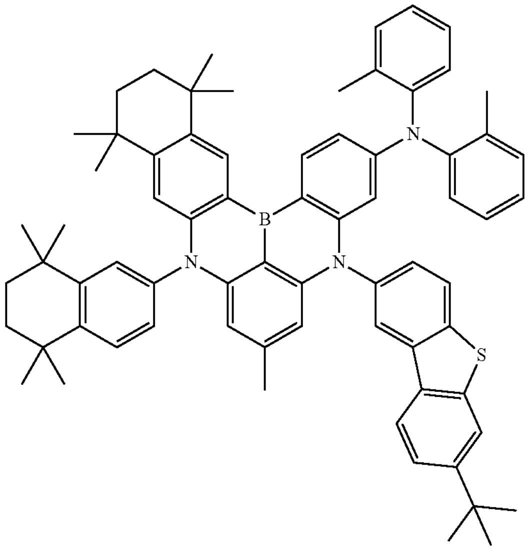
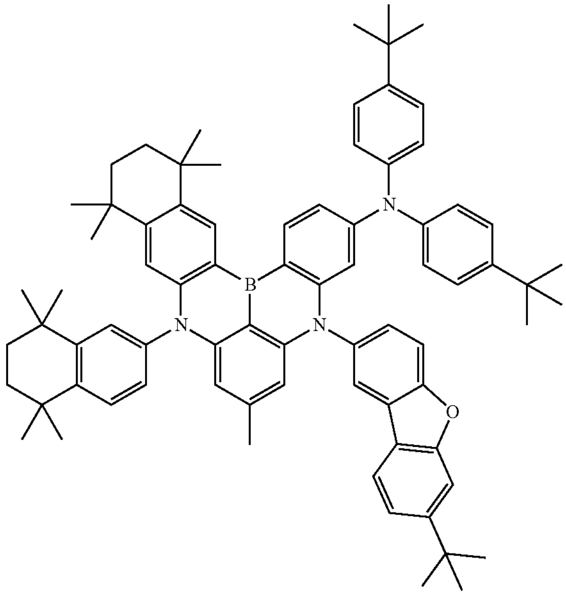

-continued
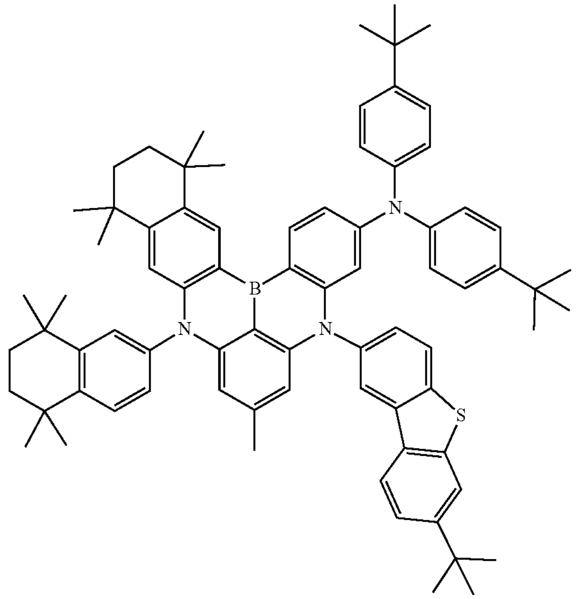
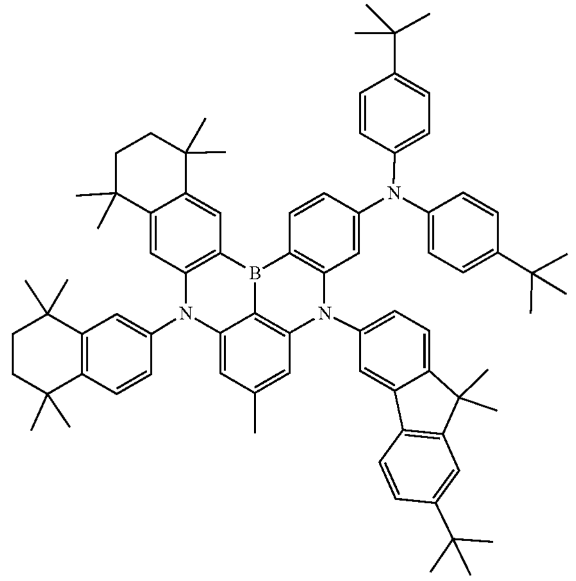
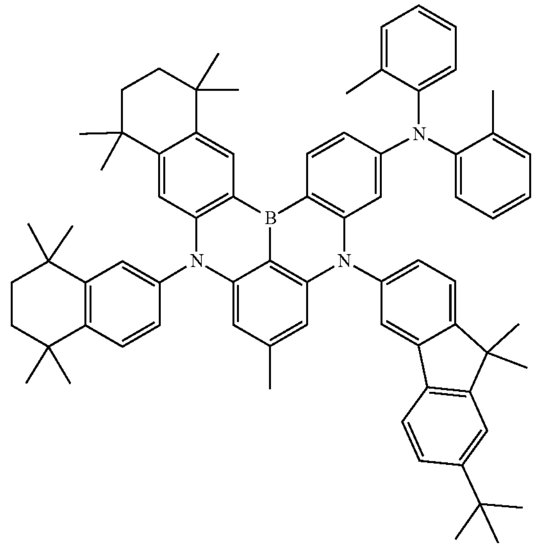
-continued
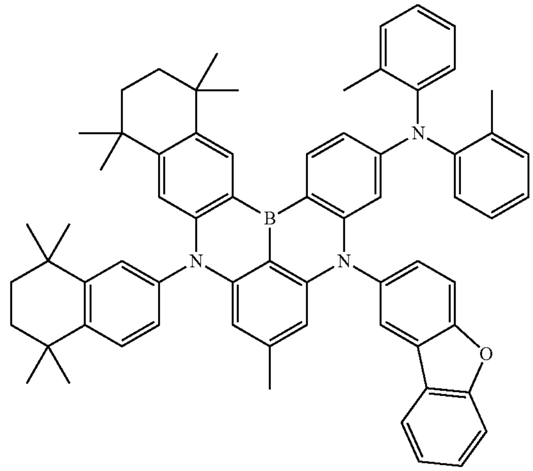
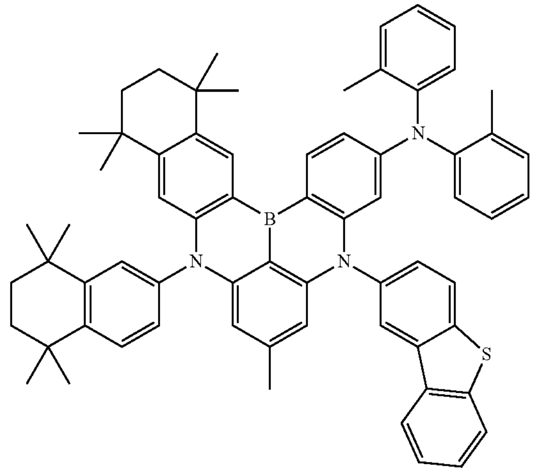
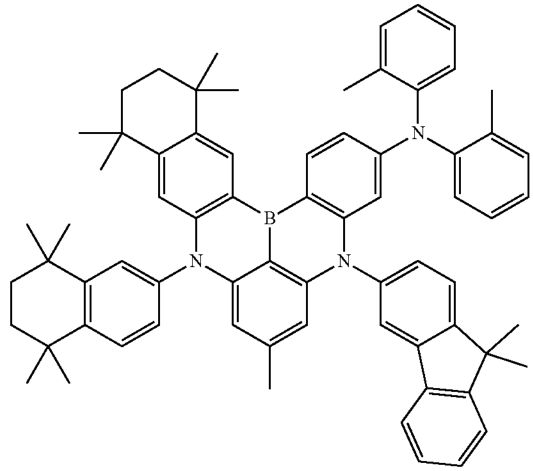

-continued
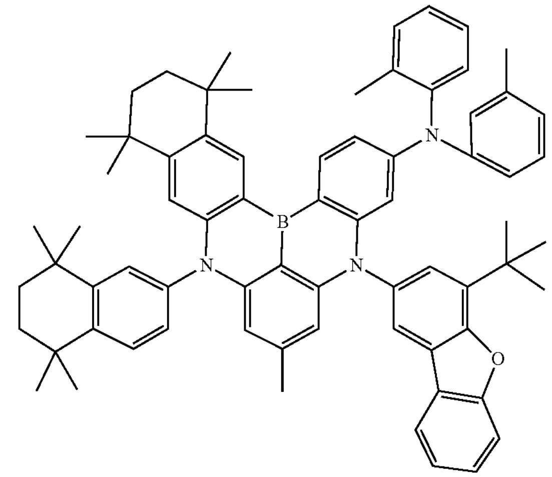
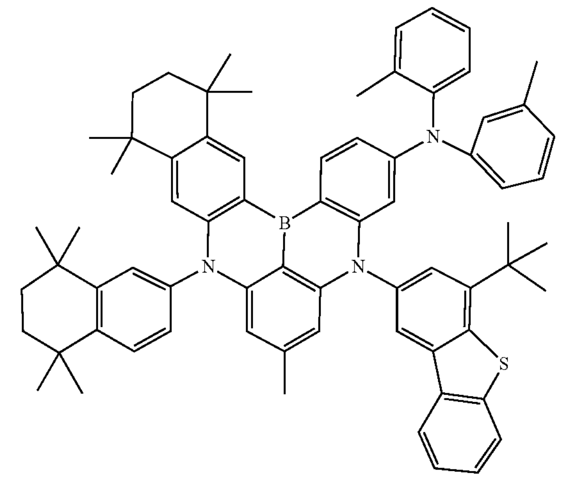
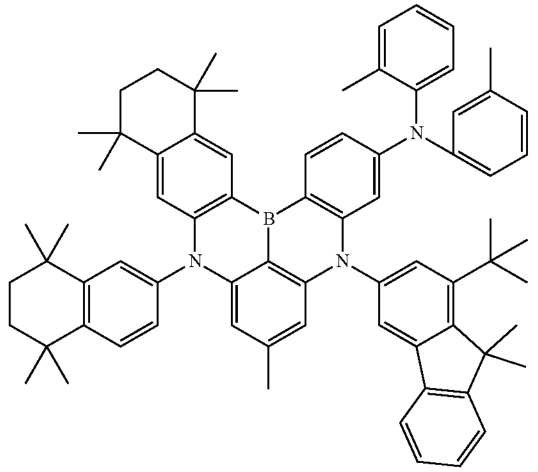
-continued
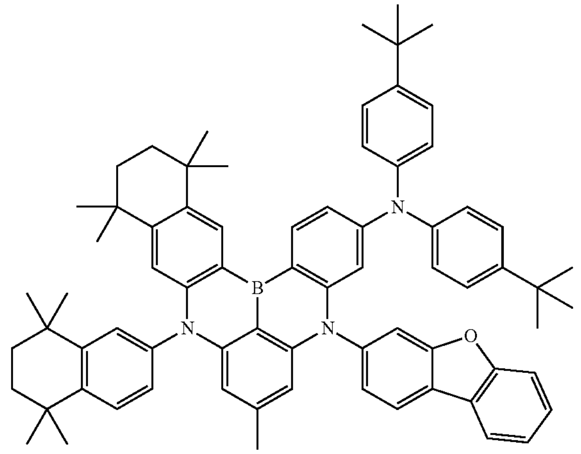
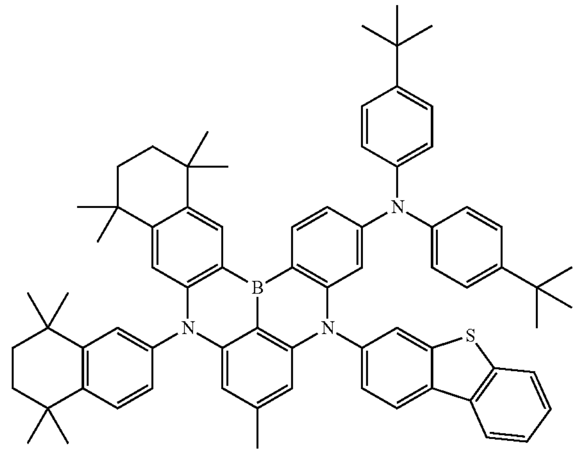
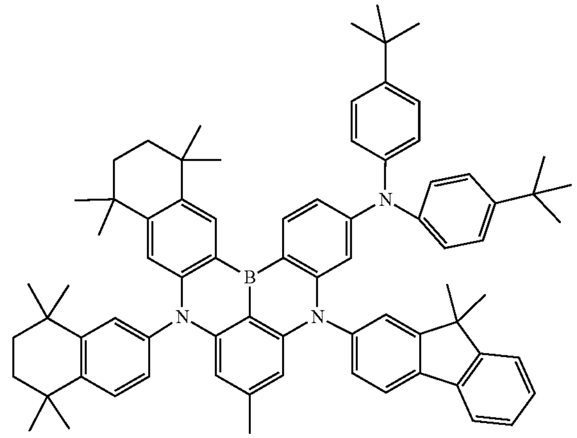
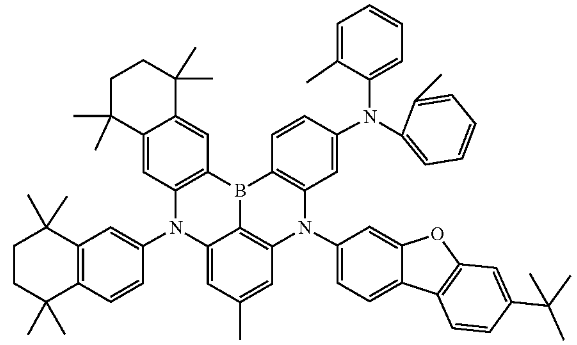

-continued
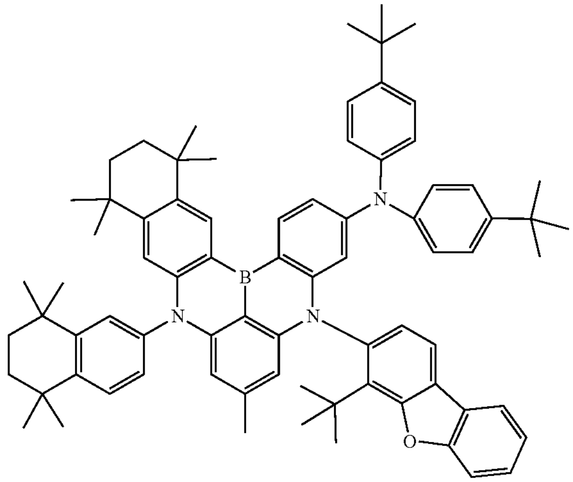
-continued
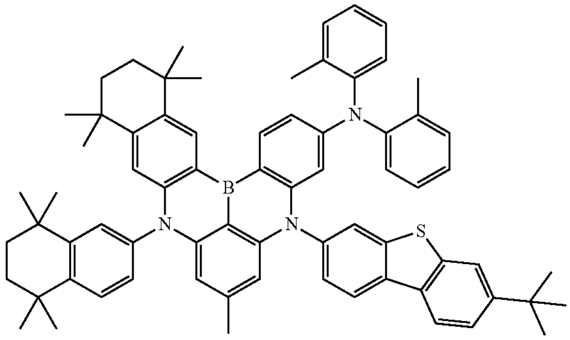
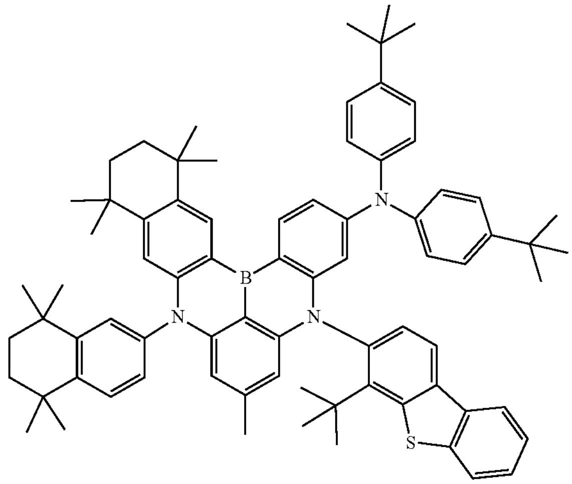
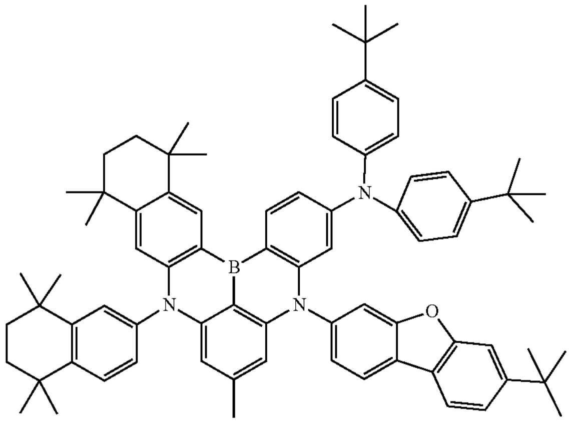
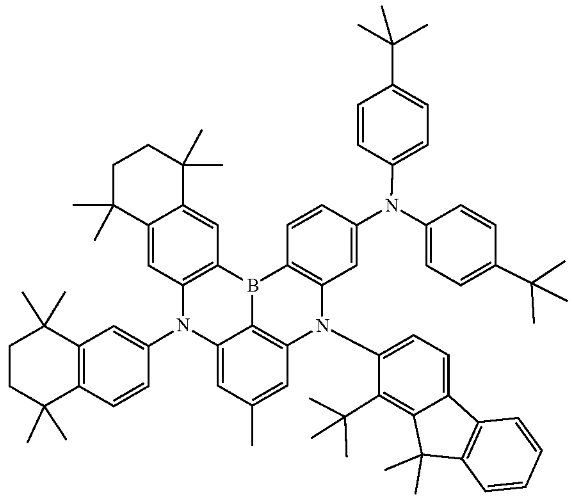
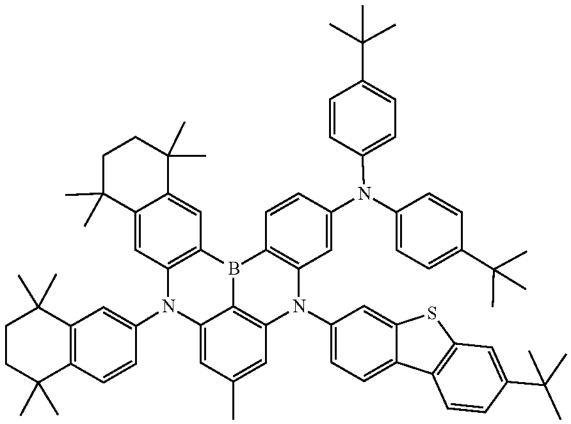

-continued
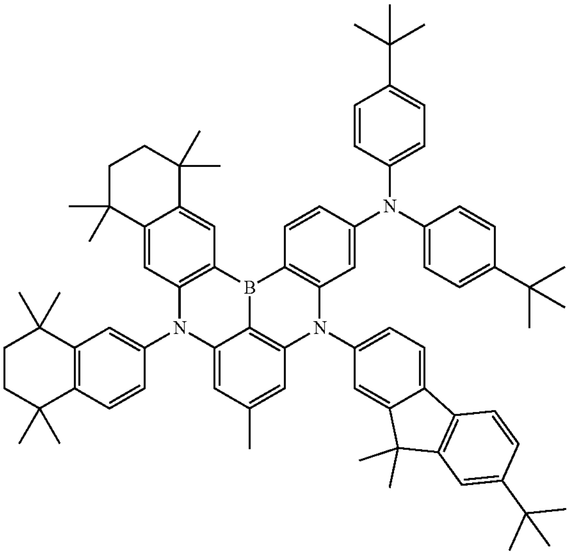
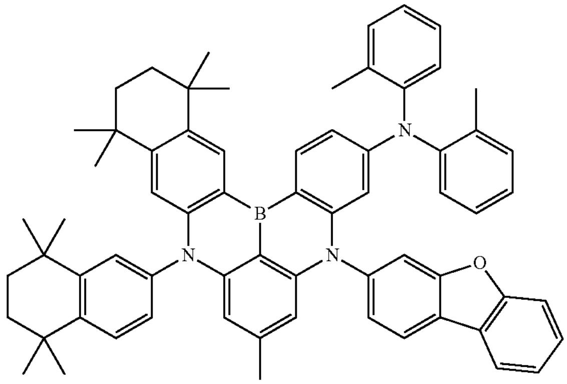
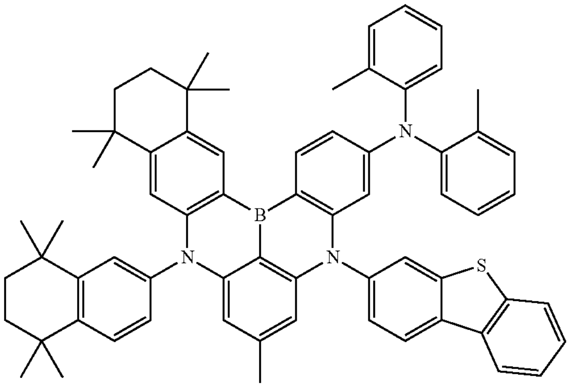
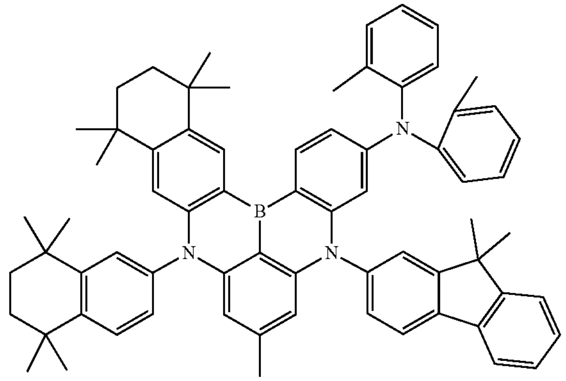
-continued
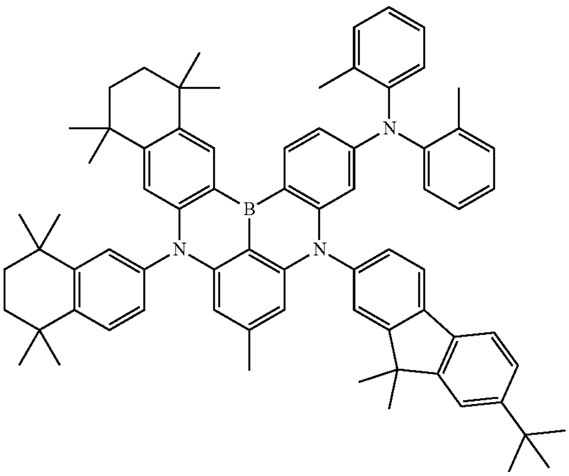
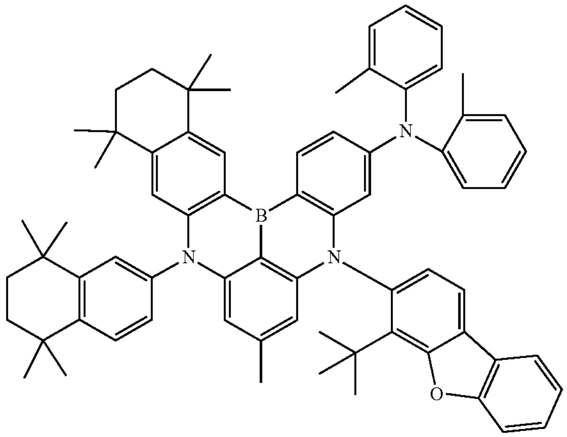
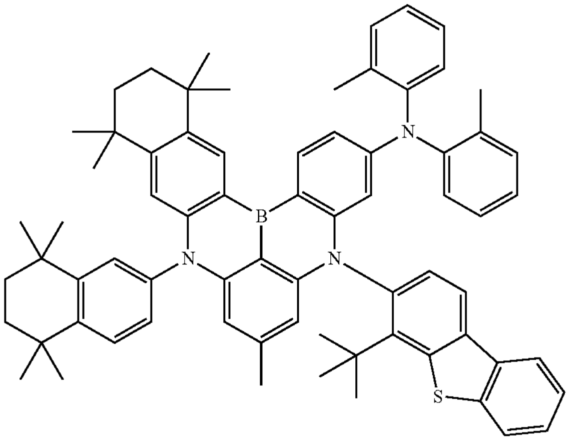

-continued
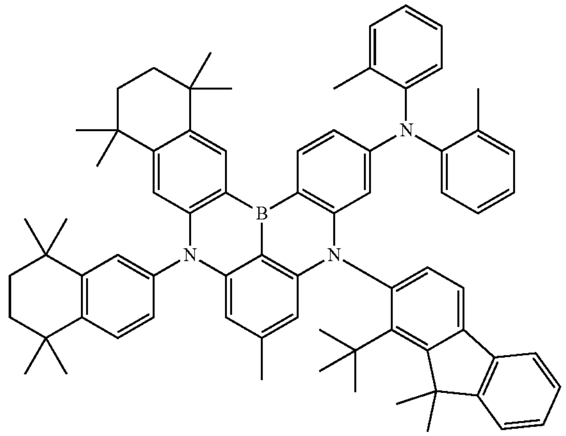
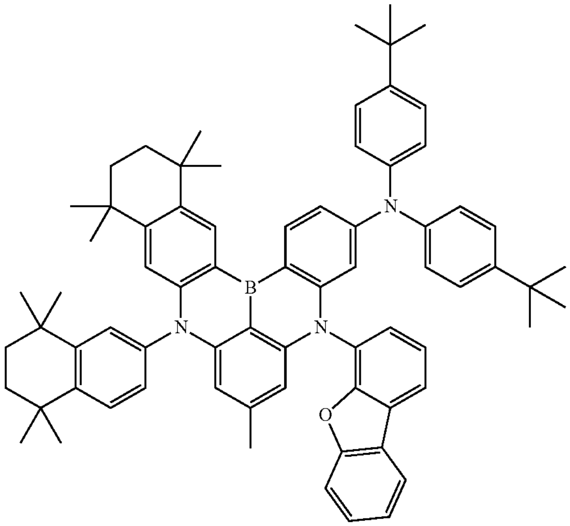
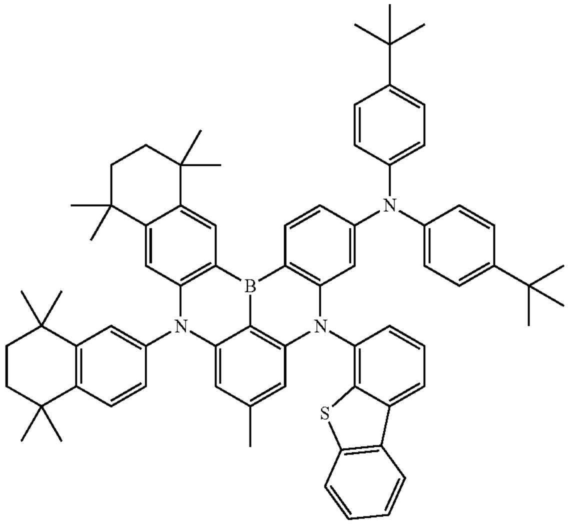
-continued
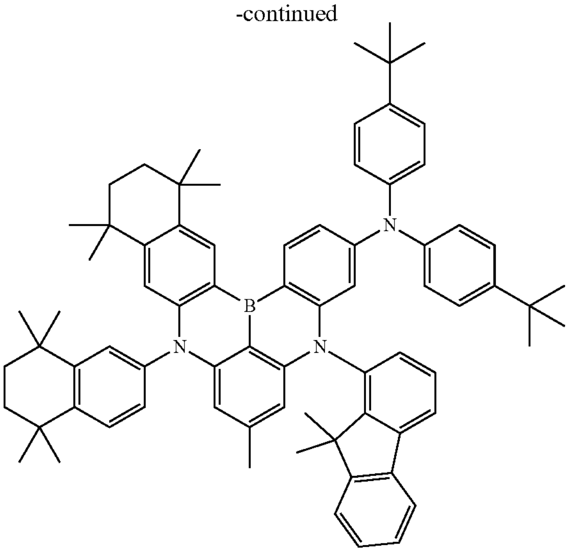
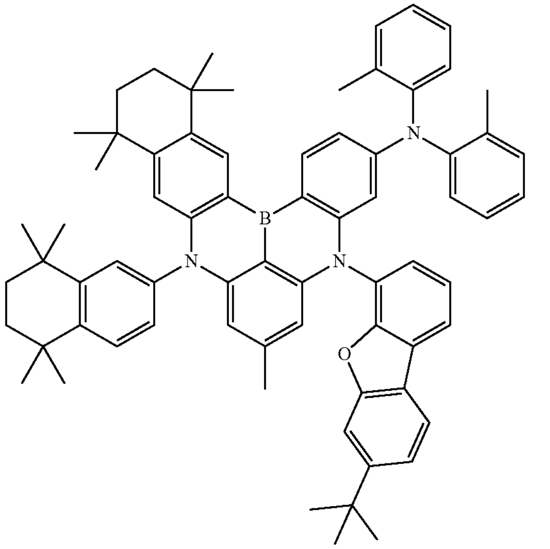
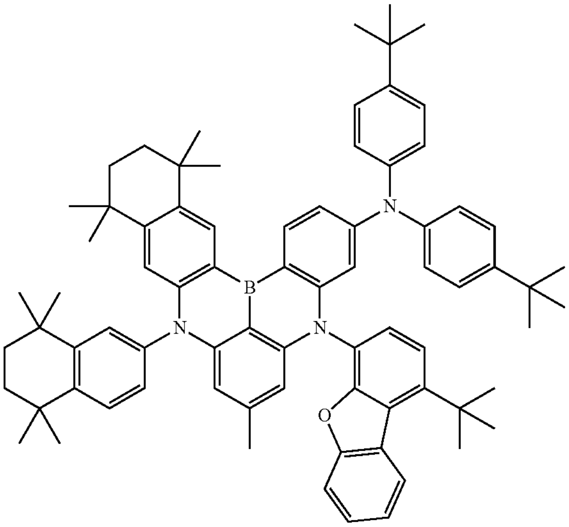

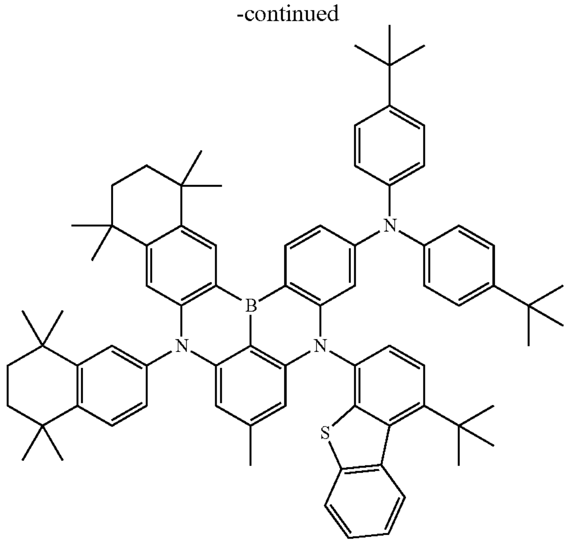
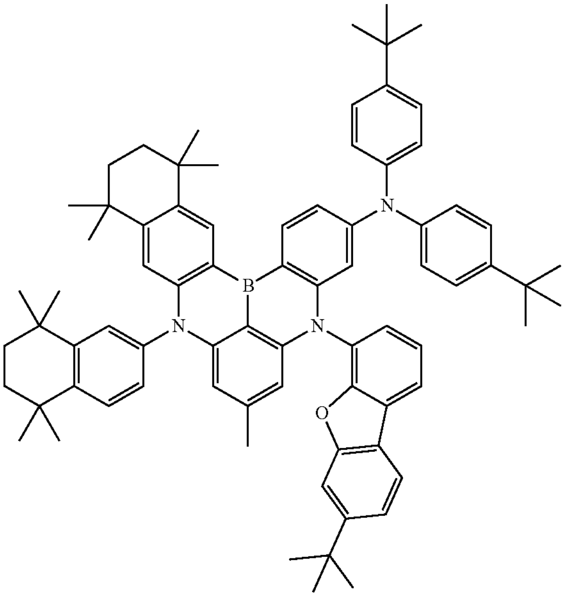
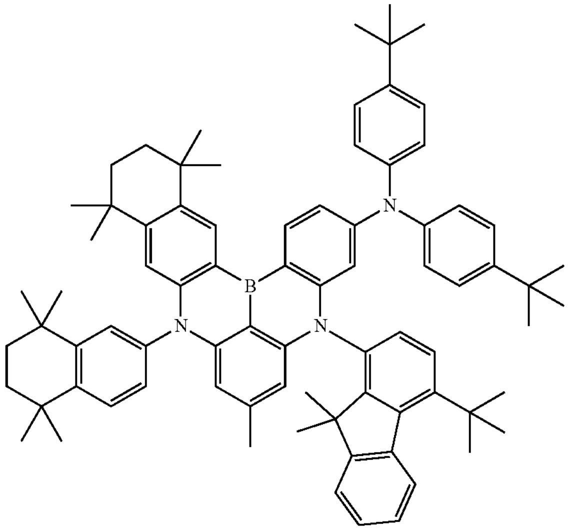
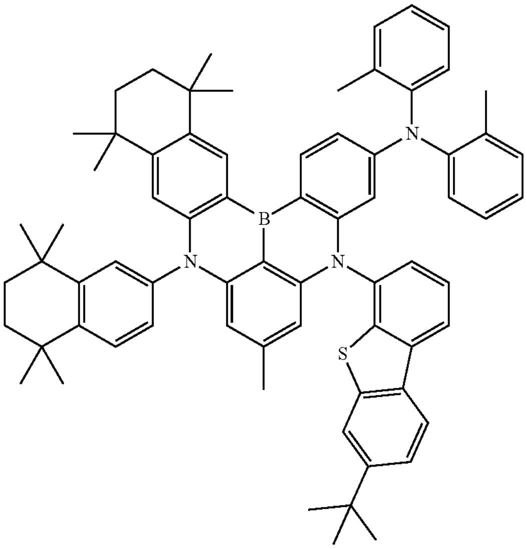
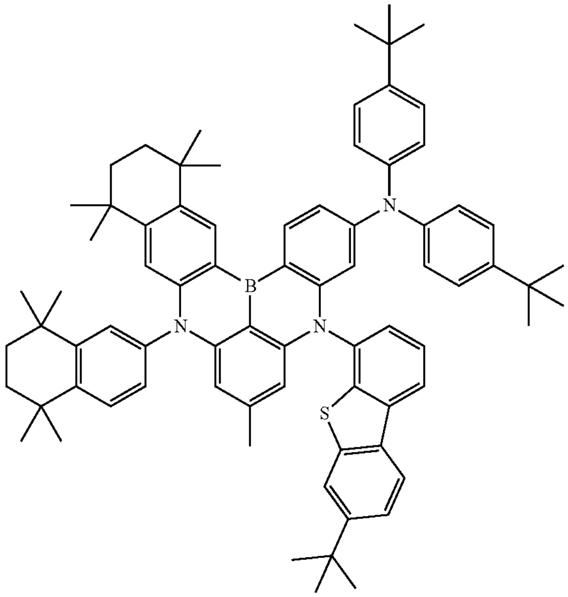

-continued
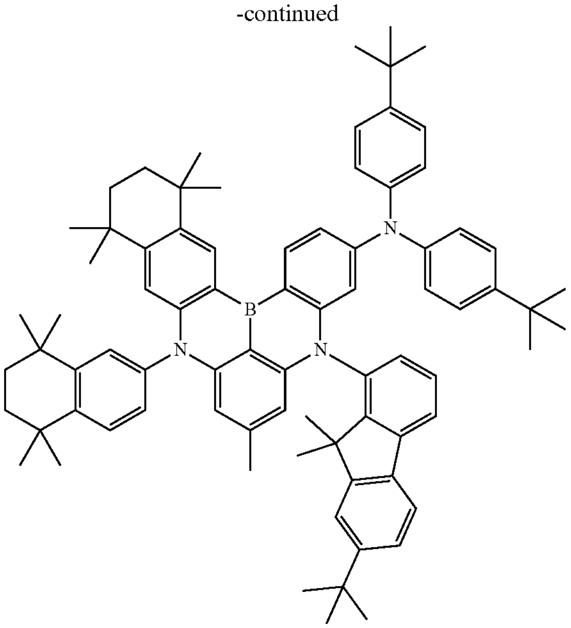
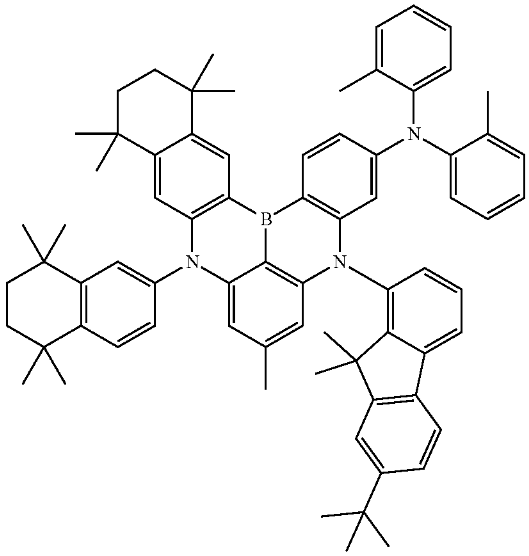
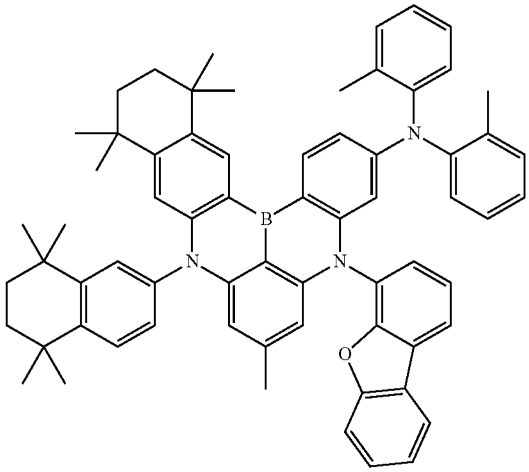
-continued
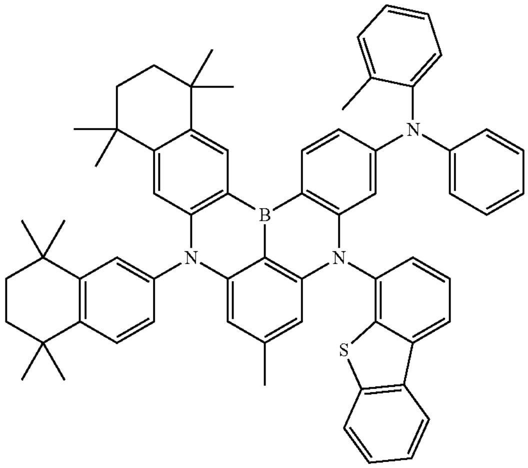
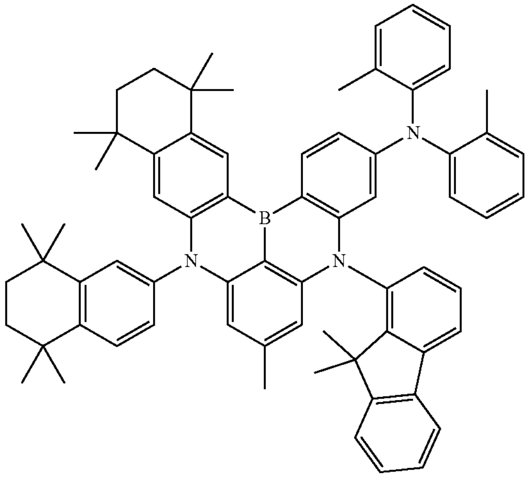
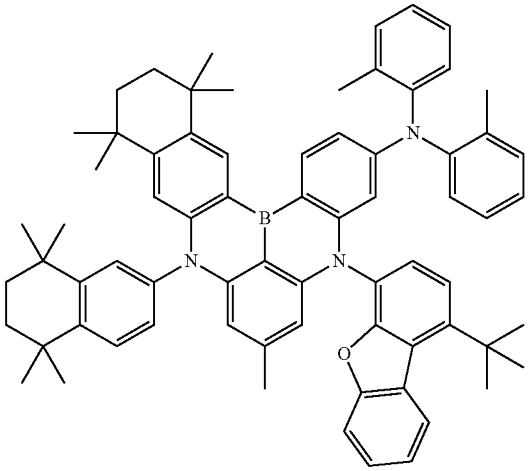

-continued
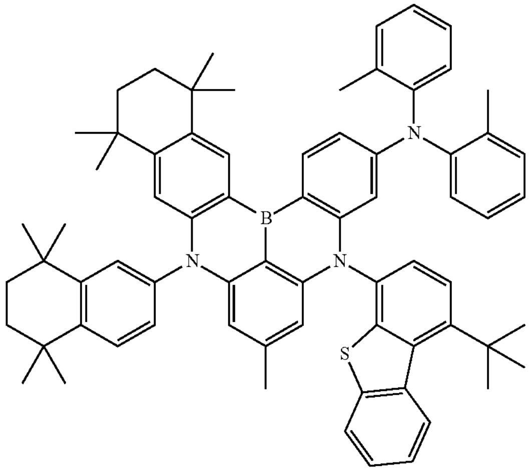
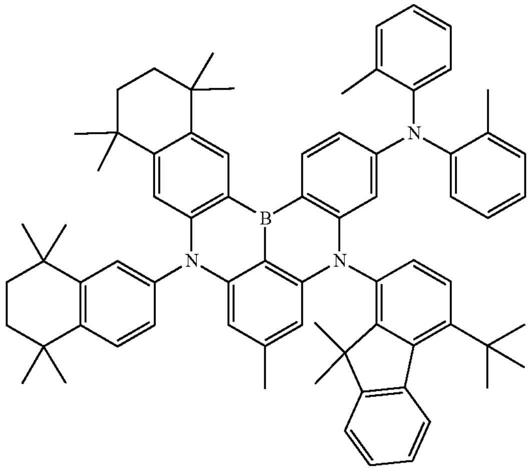
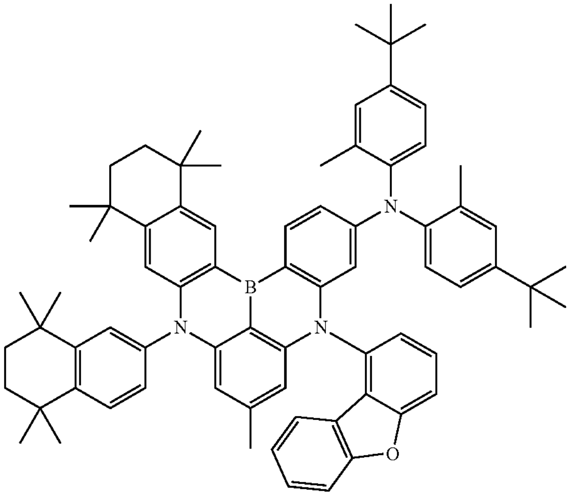
-continued
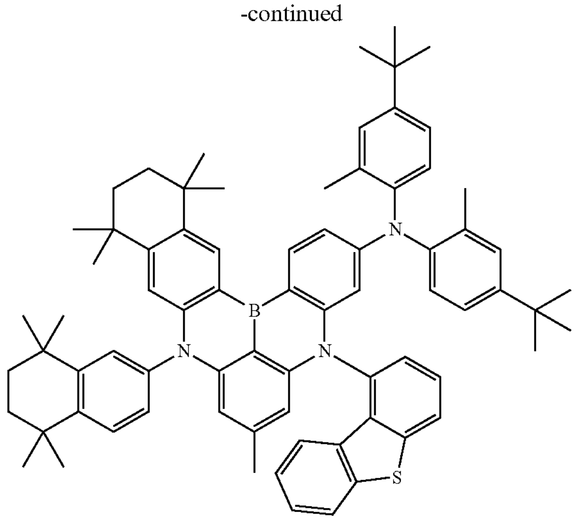
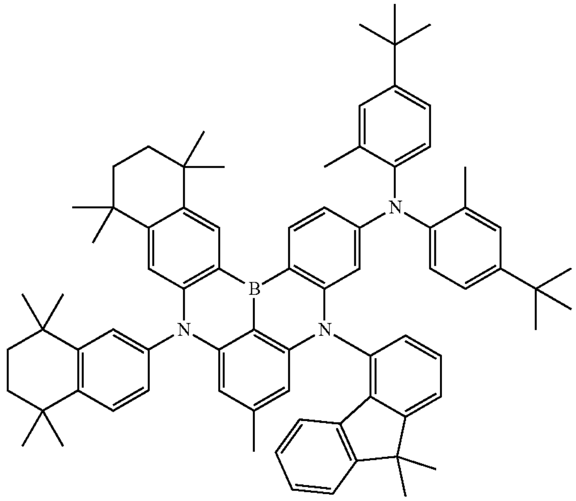
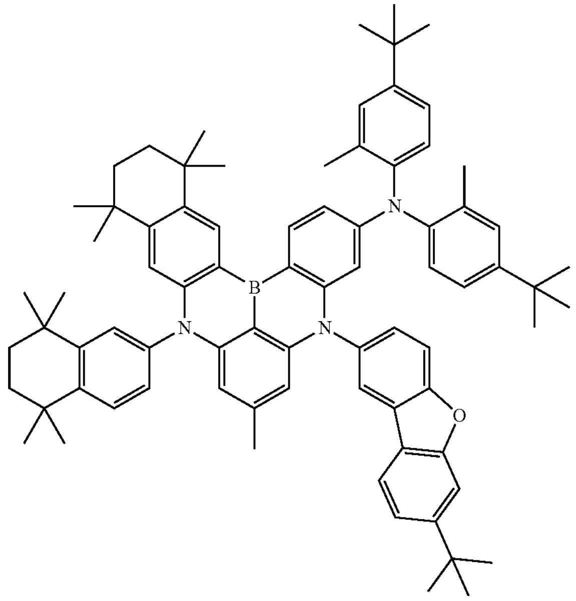

-continued
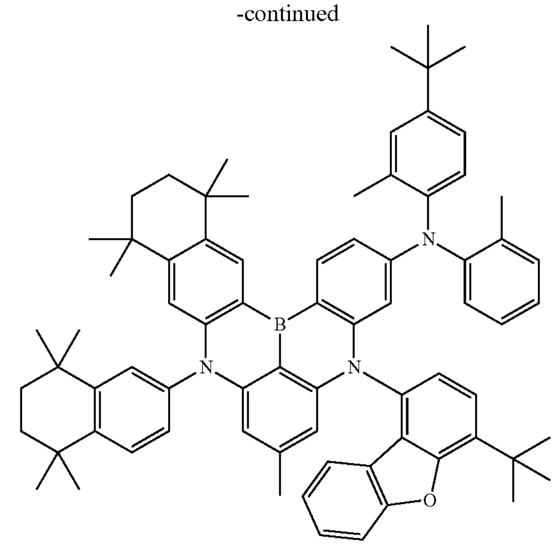
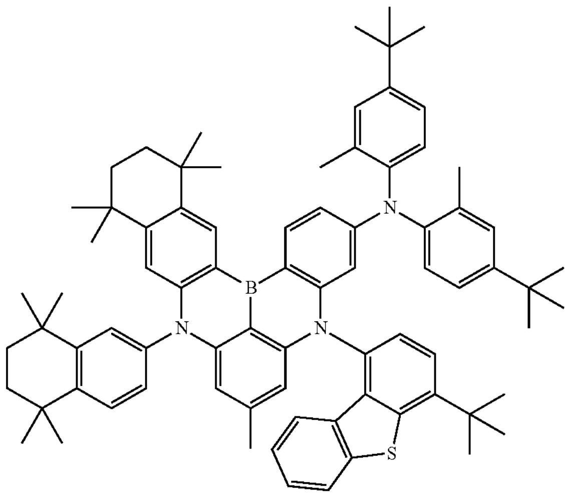
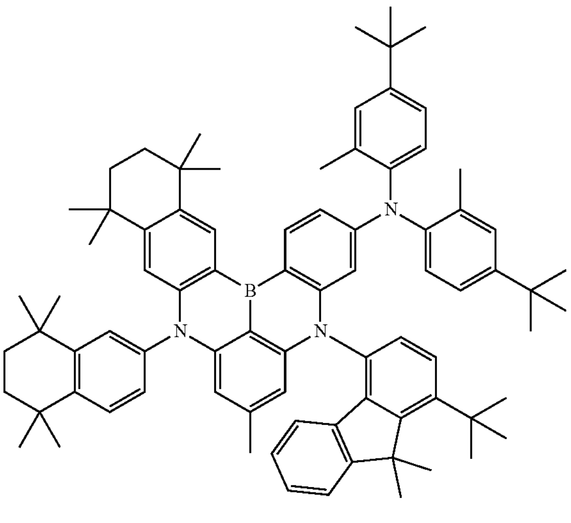
-continued
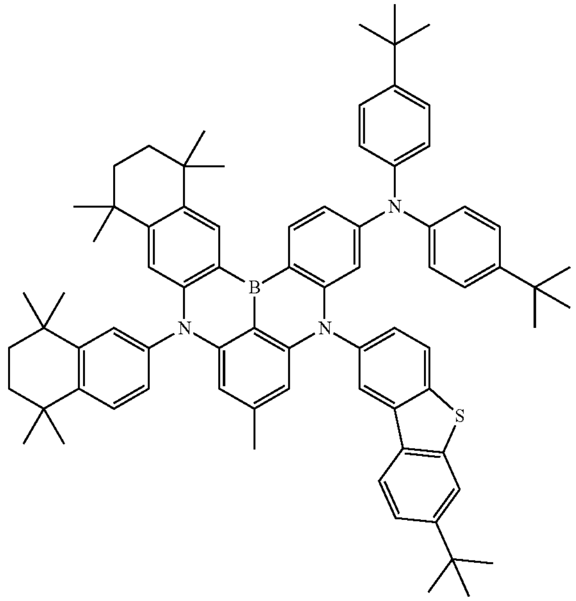
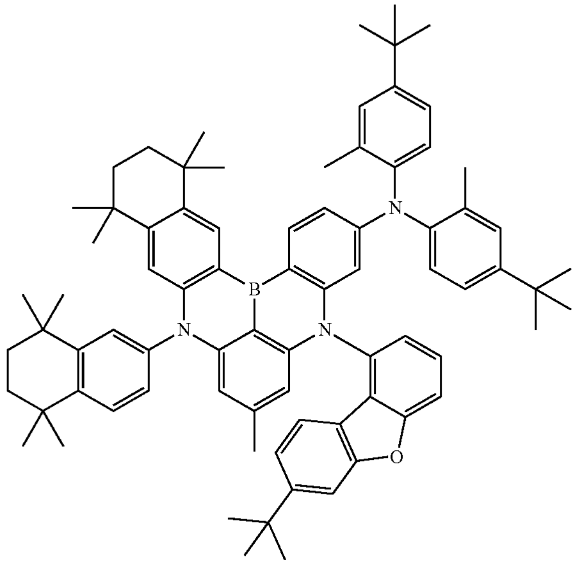
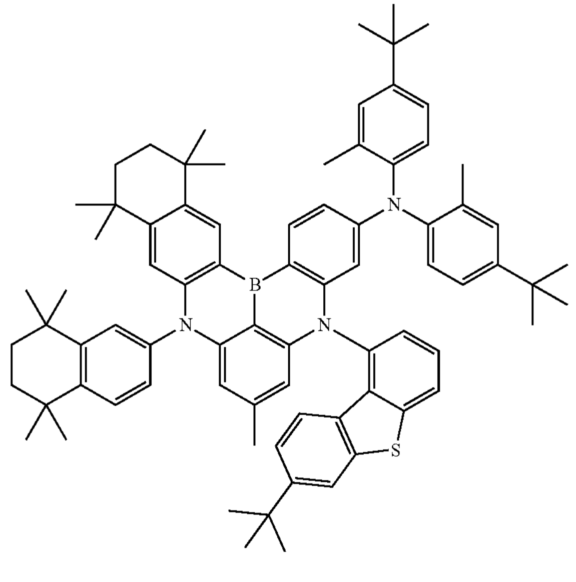

-continued
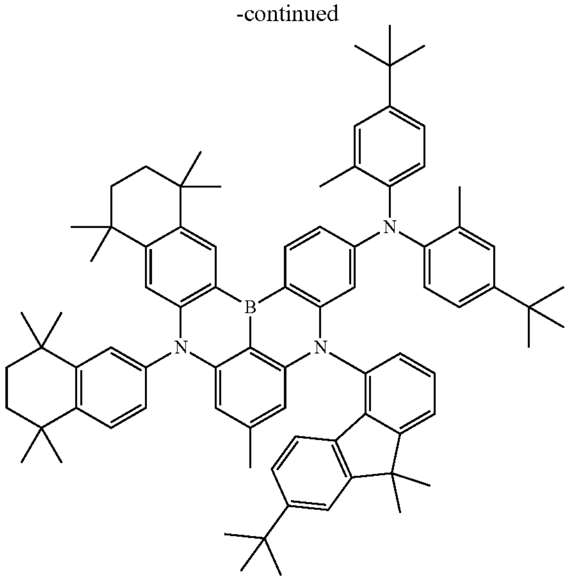
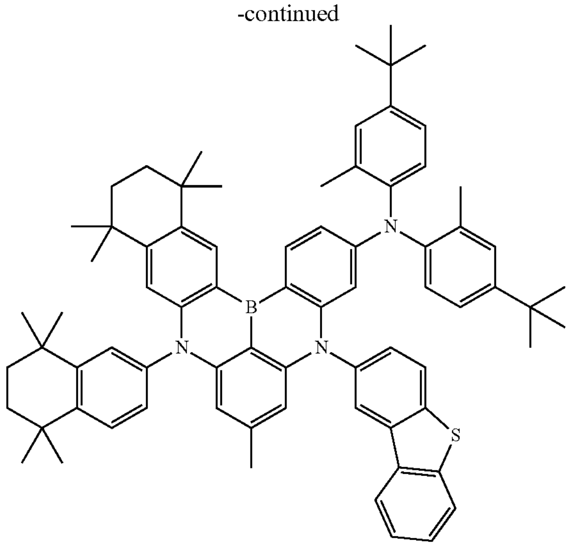
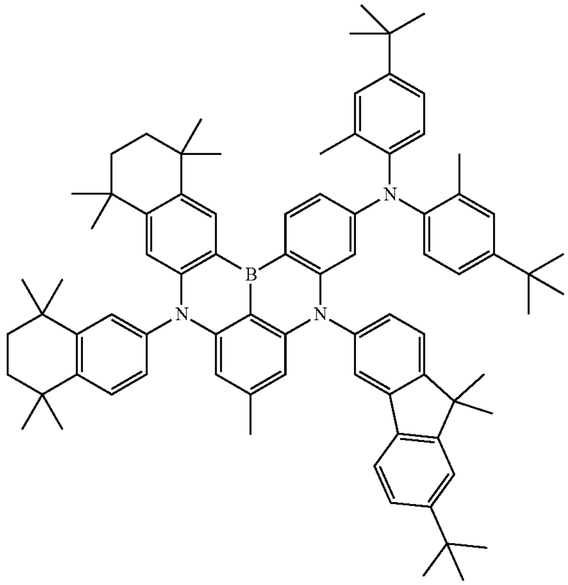
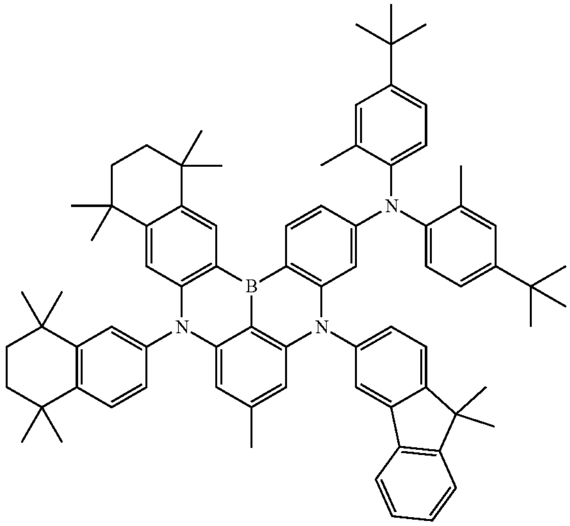
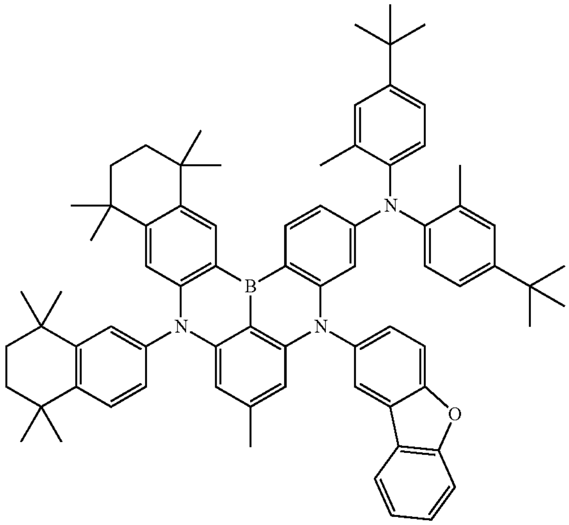
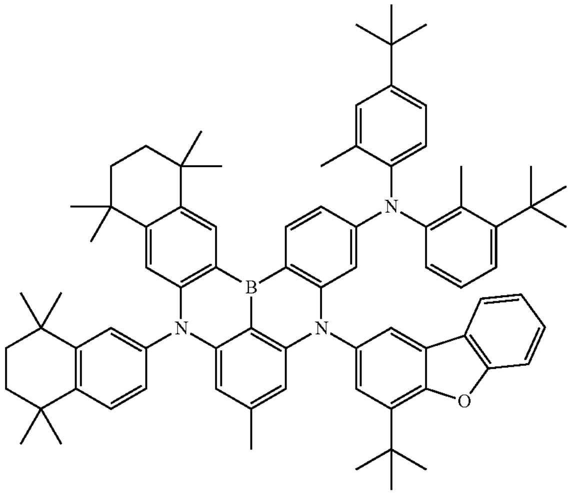
-continued -continued
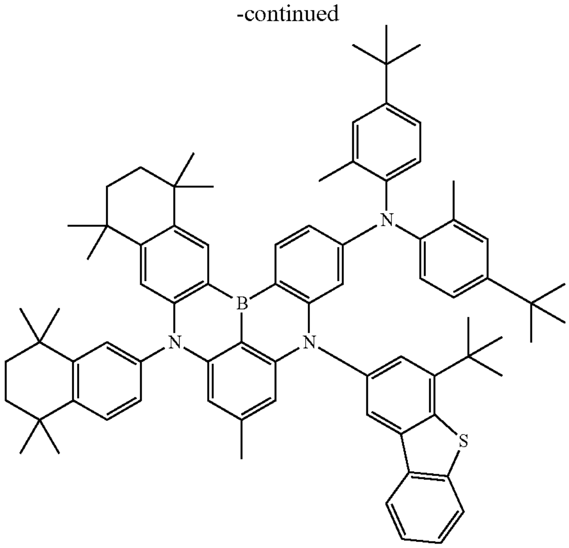
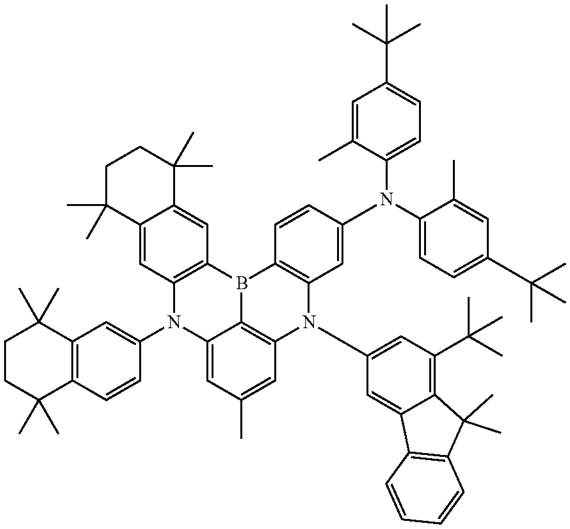
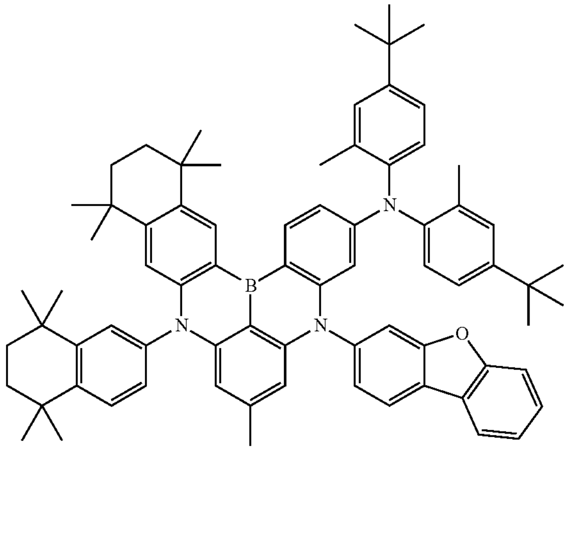
-continued
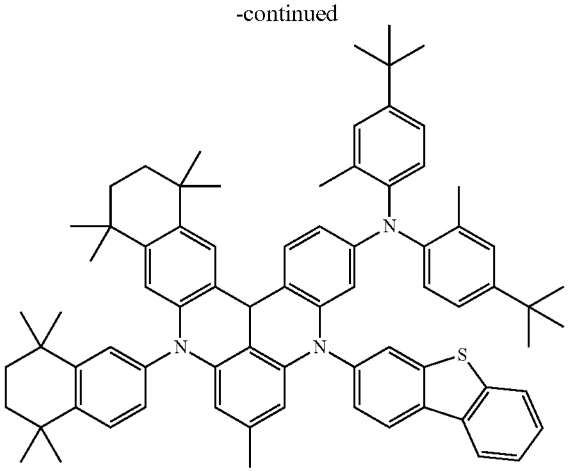
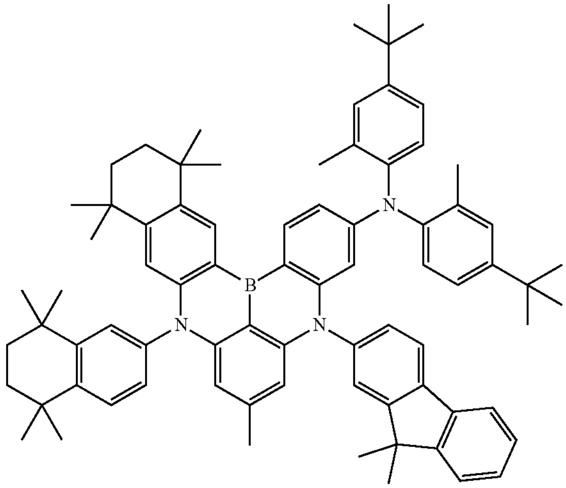
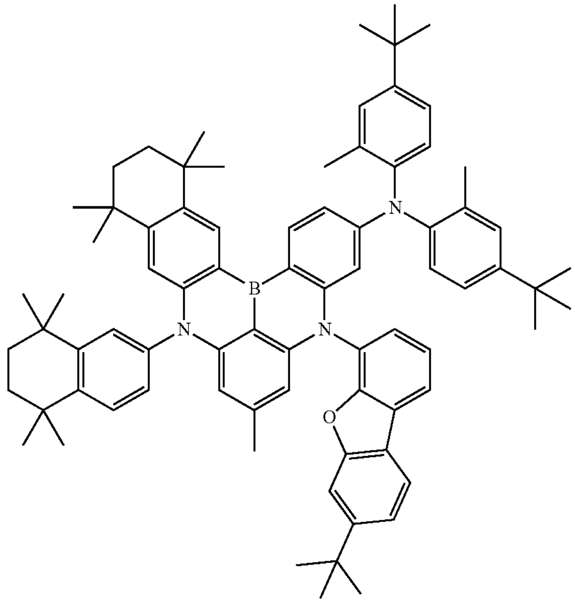

-continued
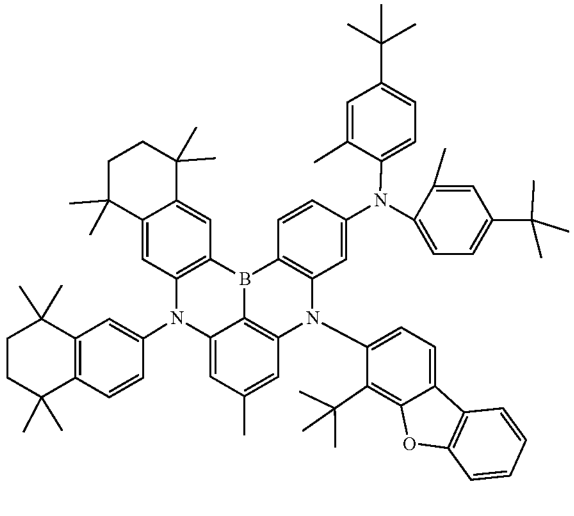
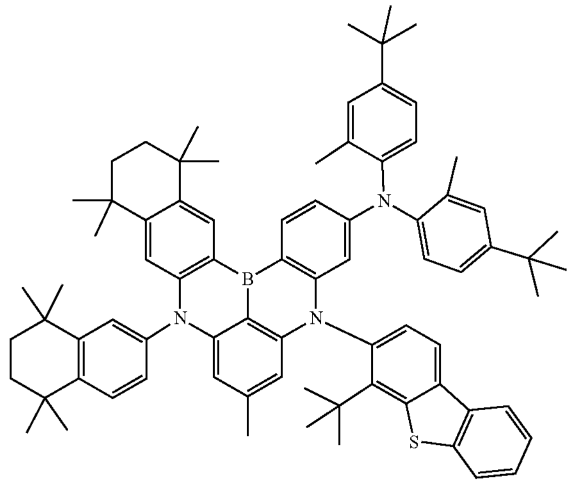
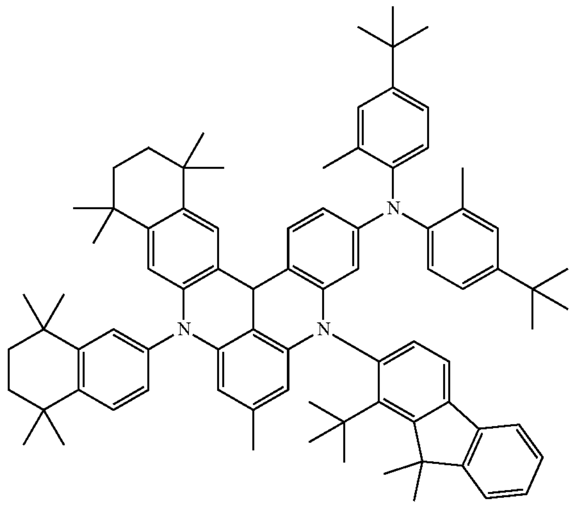
-continued
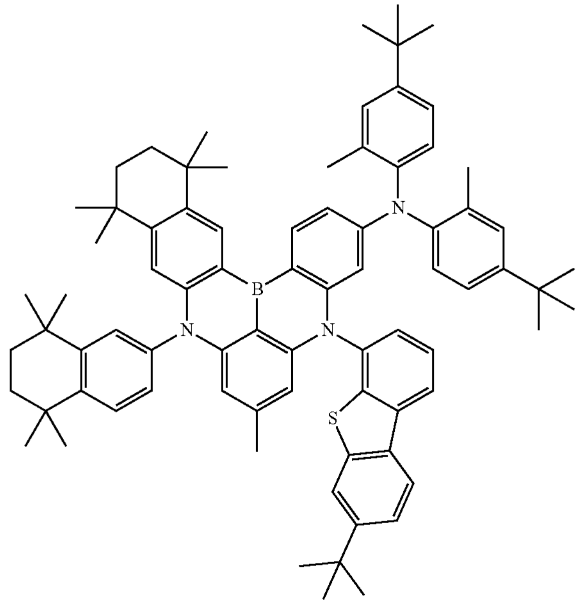
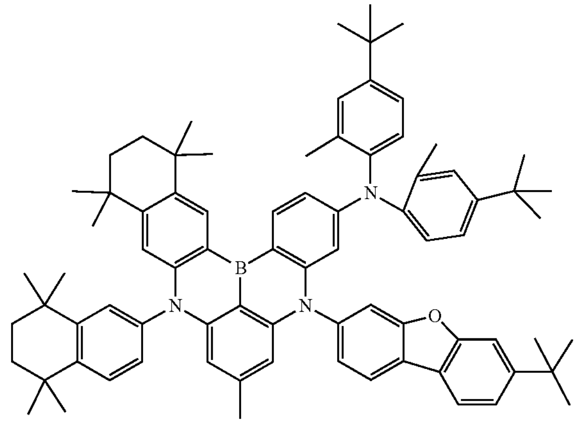
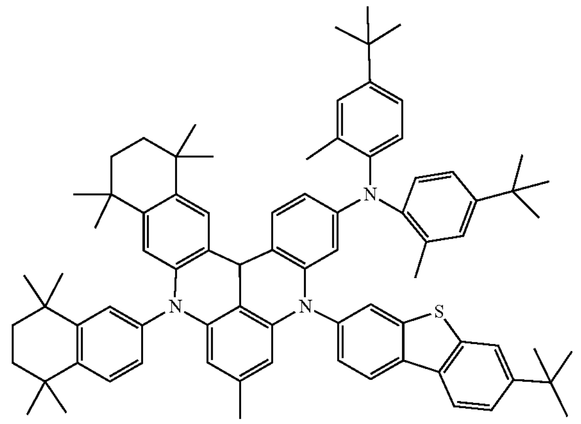

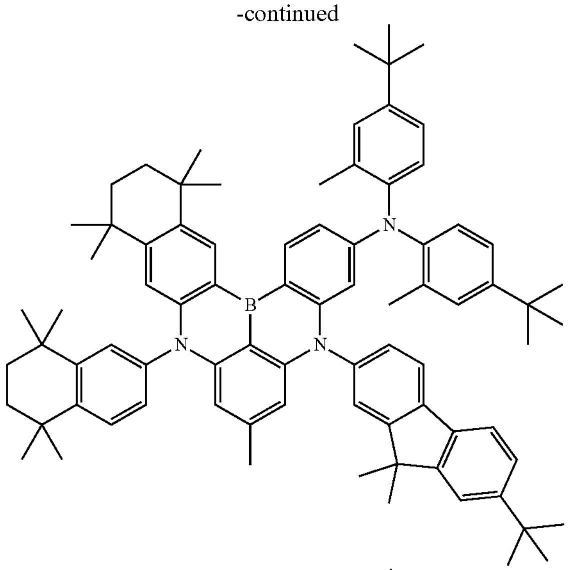
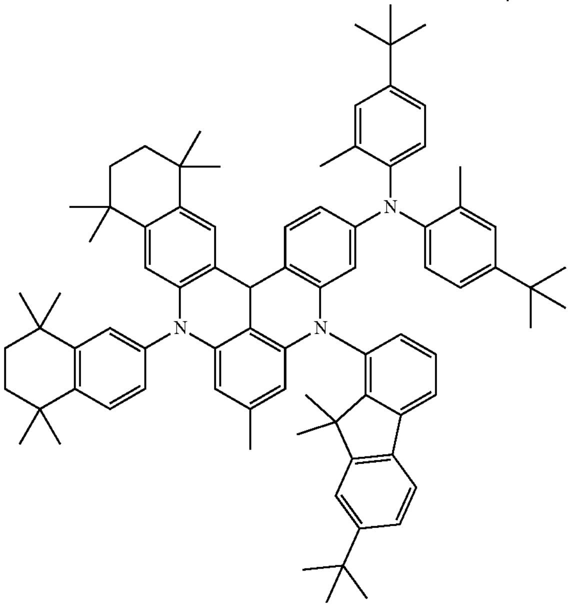
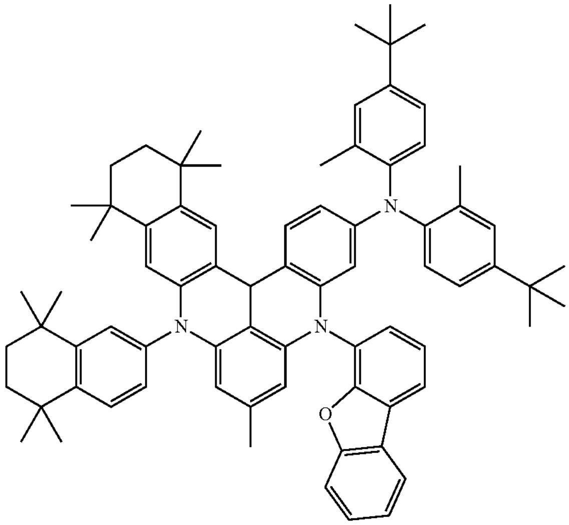
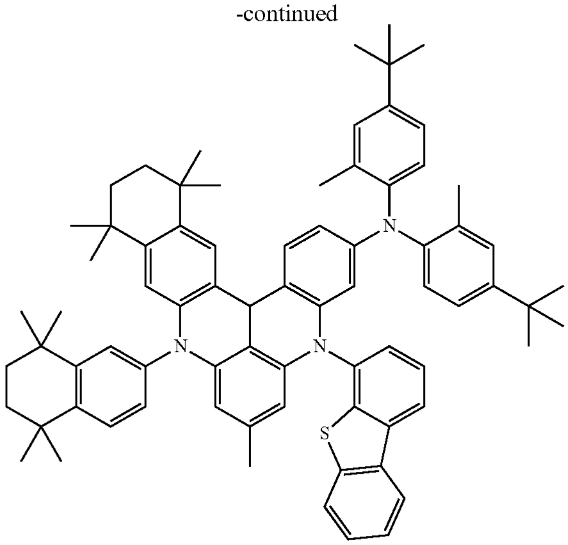
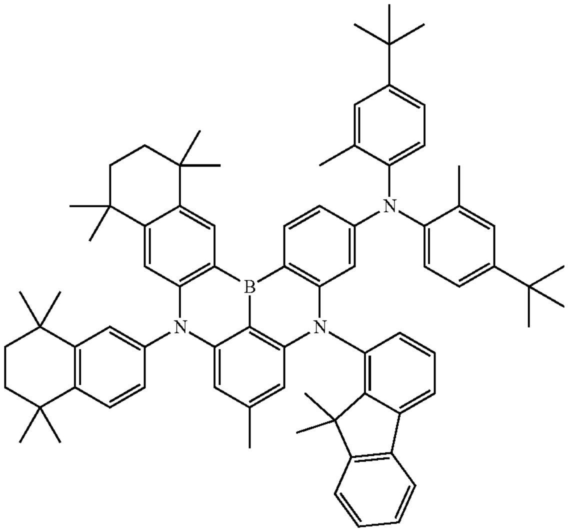
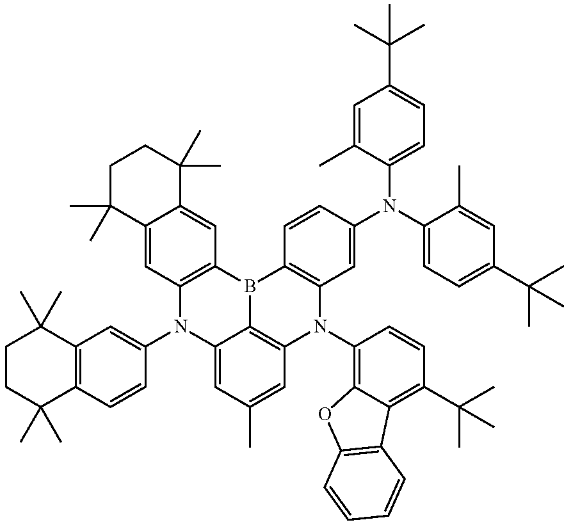

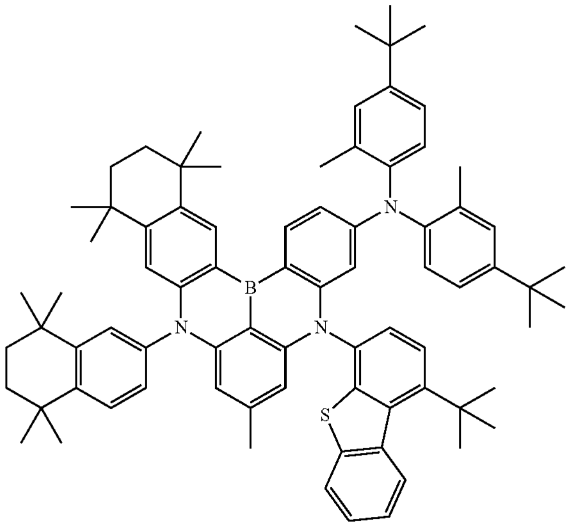
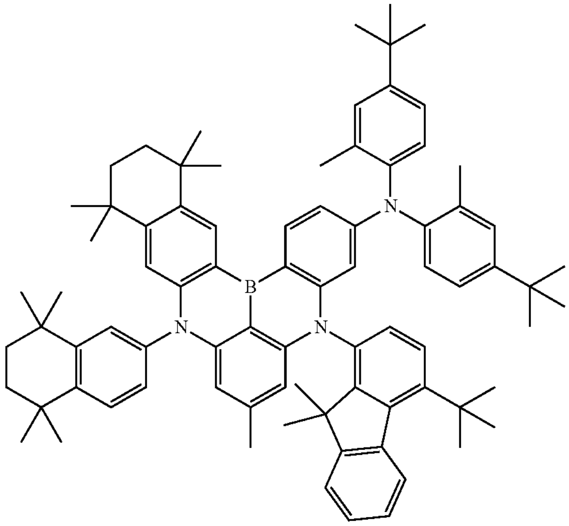
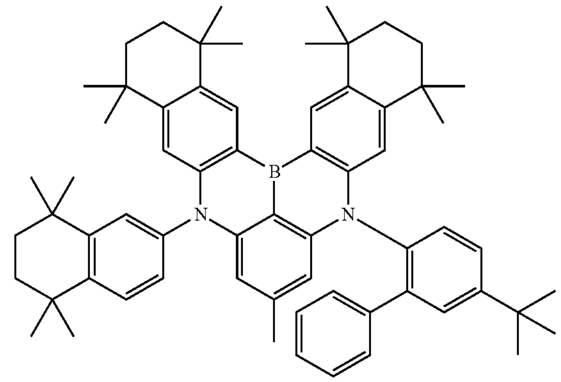
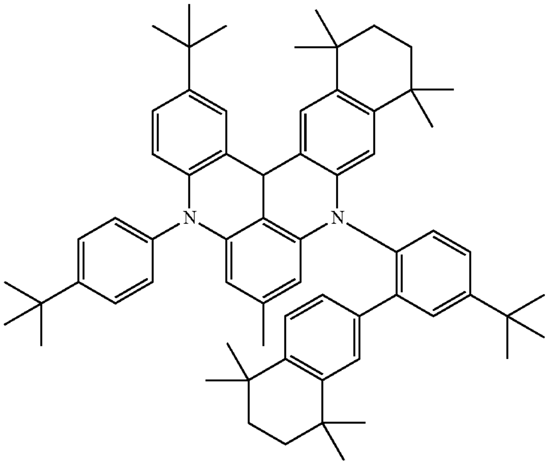
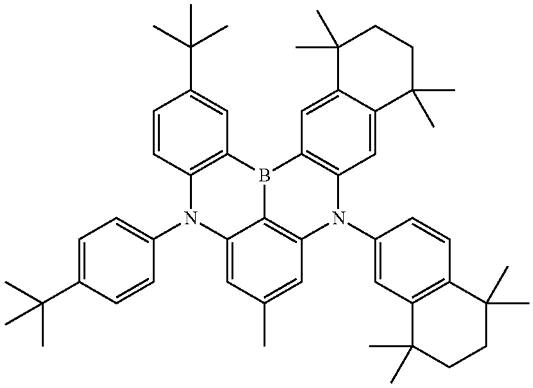
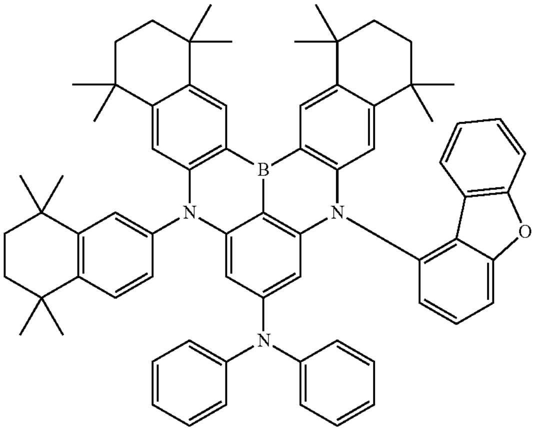
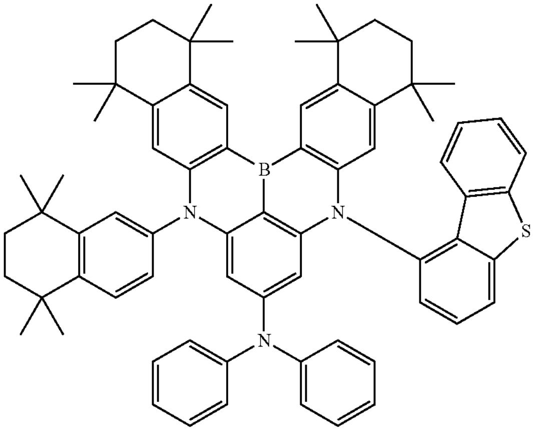

-continued
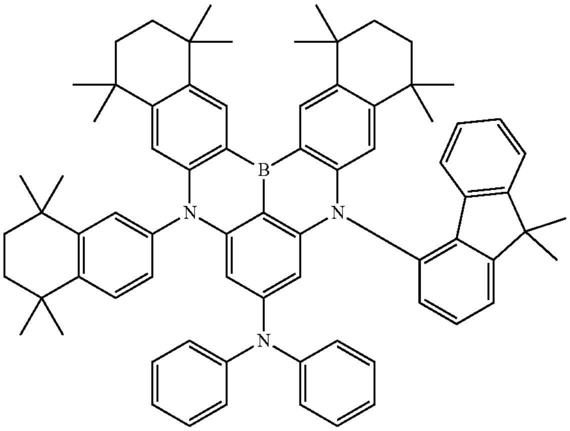
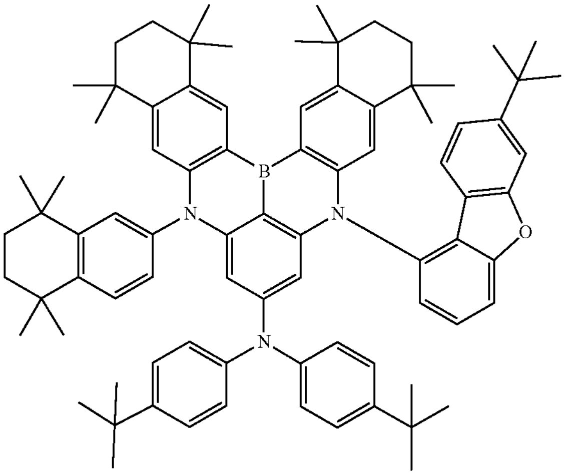
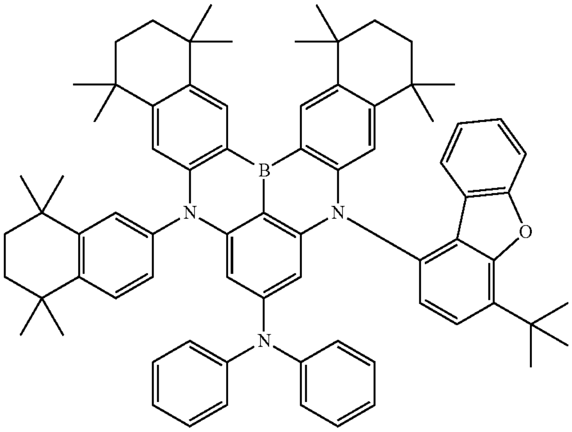
-continued
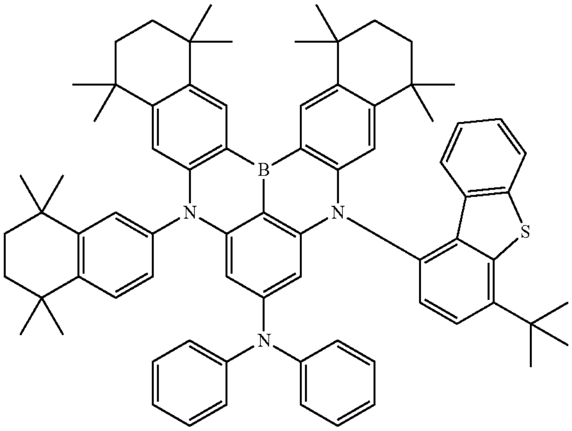
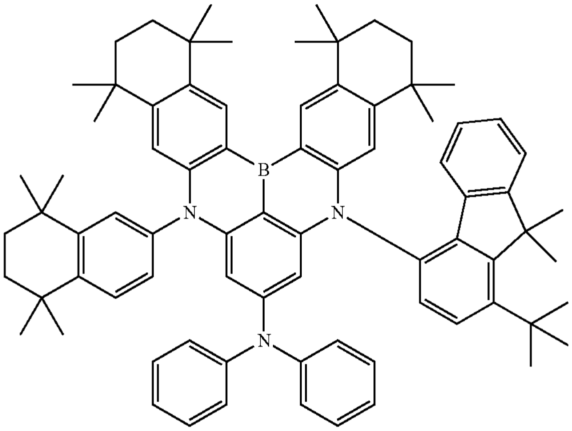
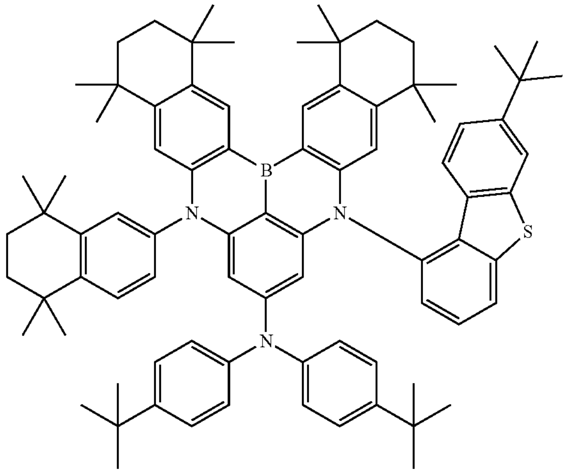

-continued
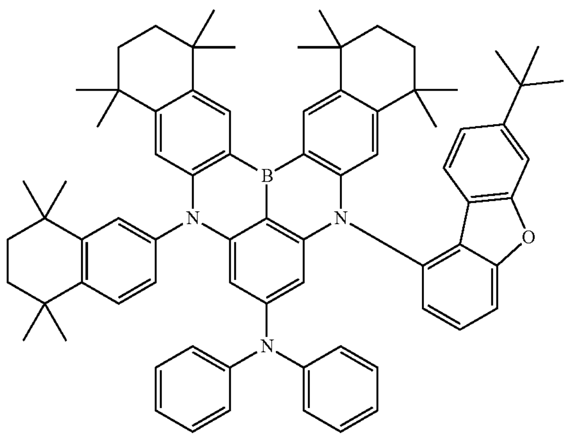
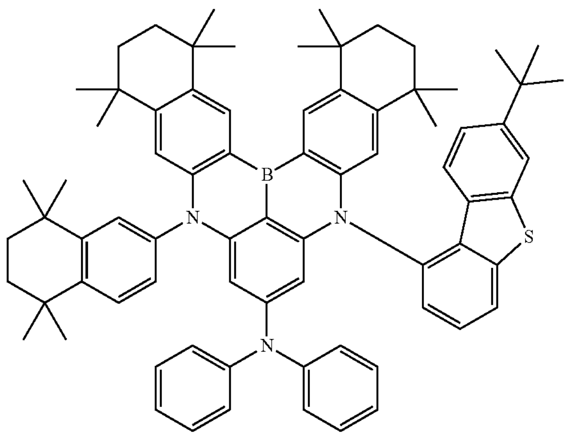
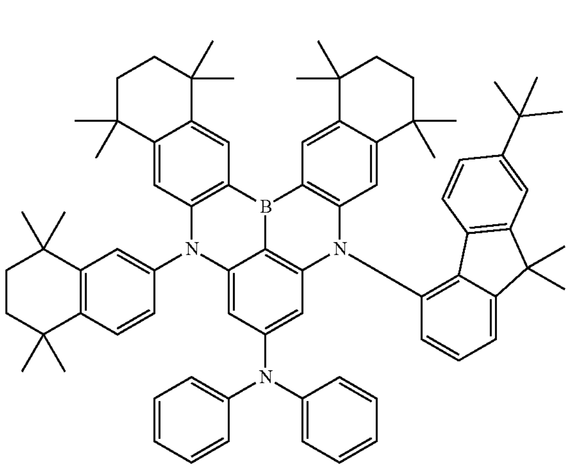
-continued
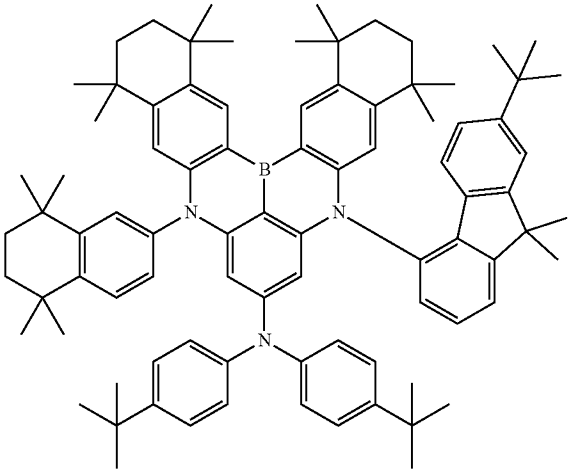
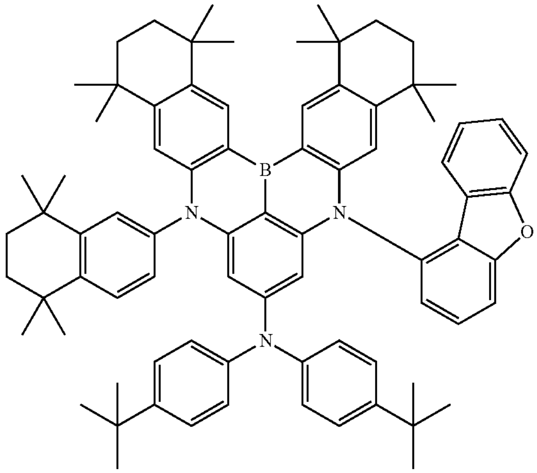
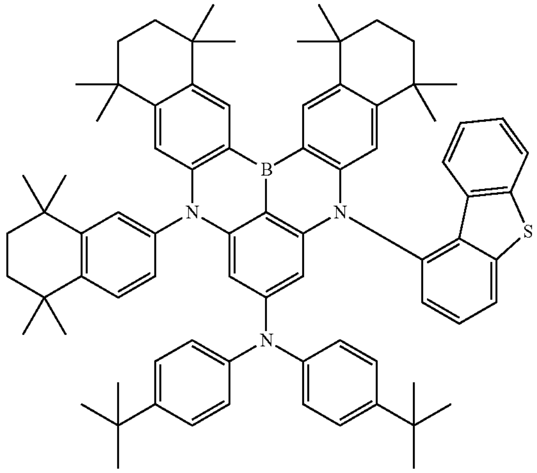

-continued
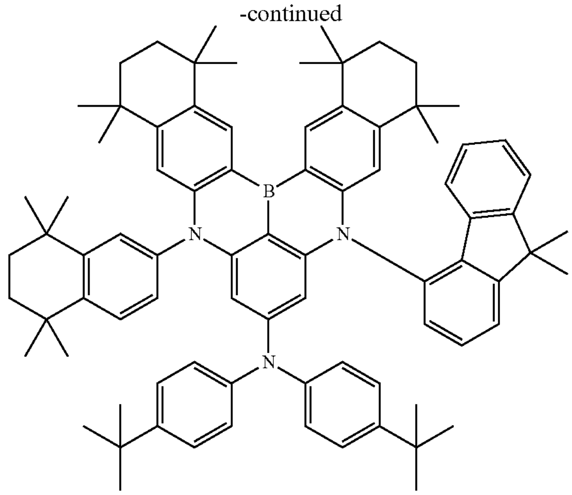
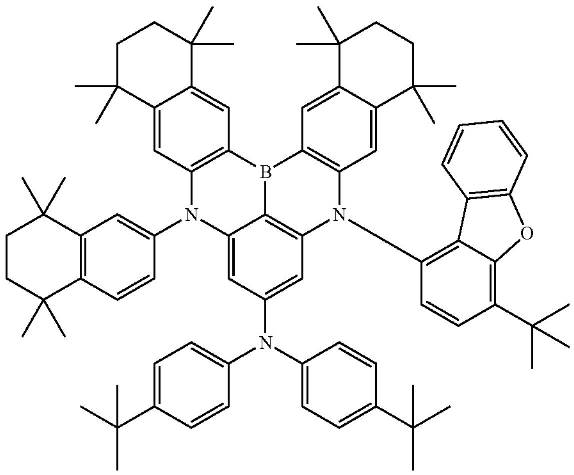
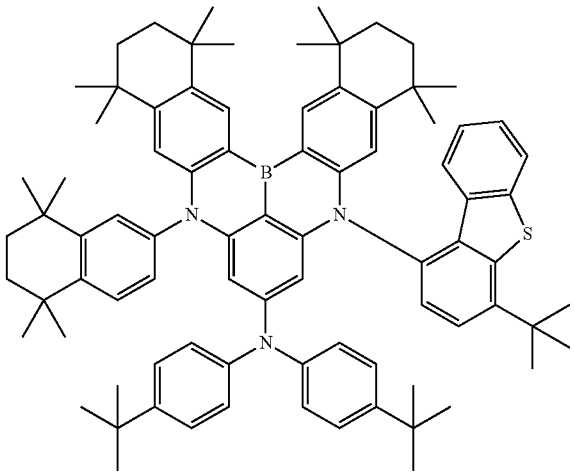
-continued
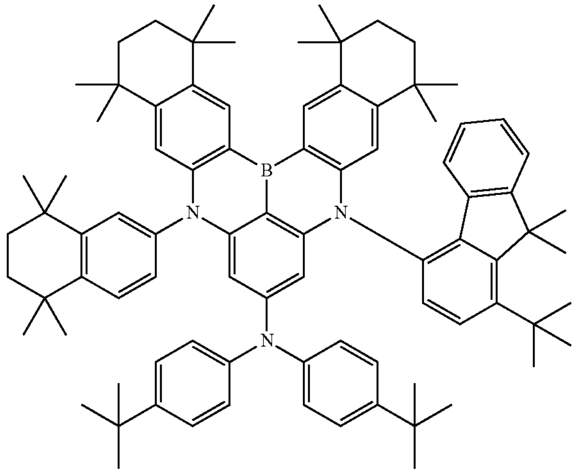 [SMILES: CC(C)(C)c1ccc(N(c2ccc(C(C)(C)C)cc2)c2cc3c4c(c2)N(c2ccc(C(C)(C)C)c5c2-c2ccccc2C5(C)C)c2cc5c(cc2B4c2cc4c(cc2N3c2ccc3c(c2)C(C)(C)CCC3(C)C)C(C)(C)CCC4(C)C)C(C)(C)CCC5(C)C)cc1]
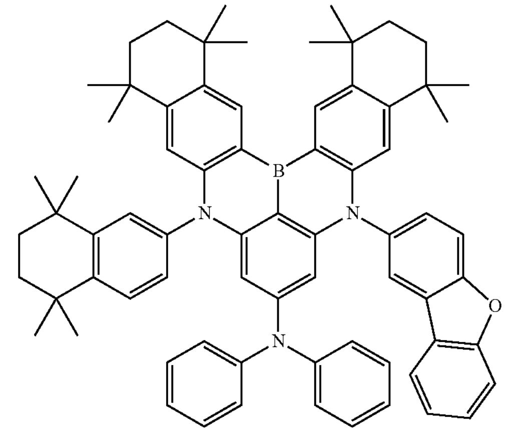
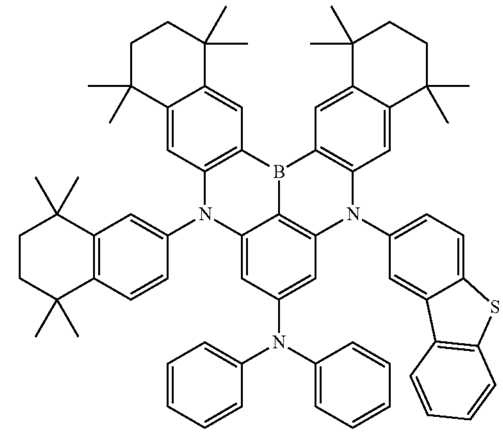

-continued
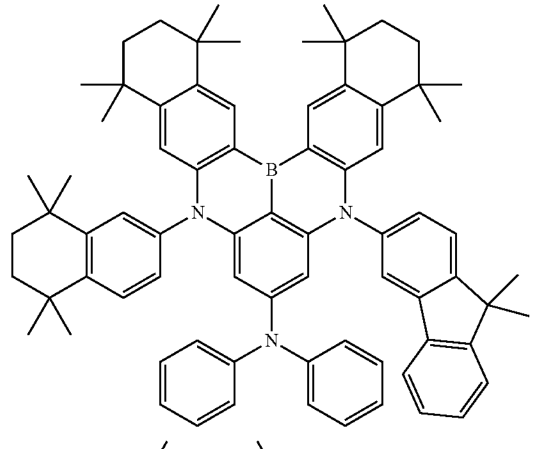
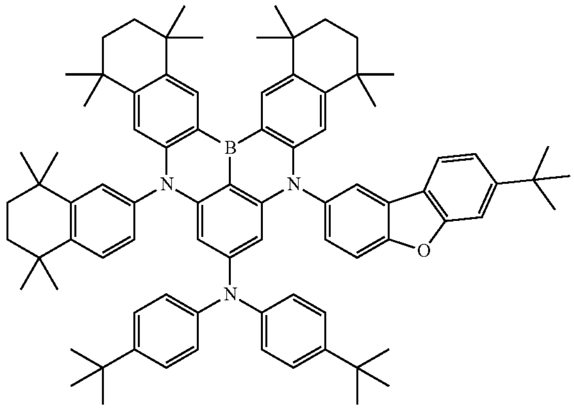
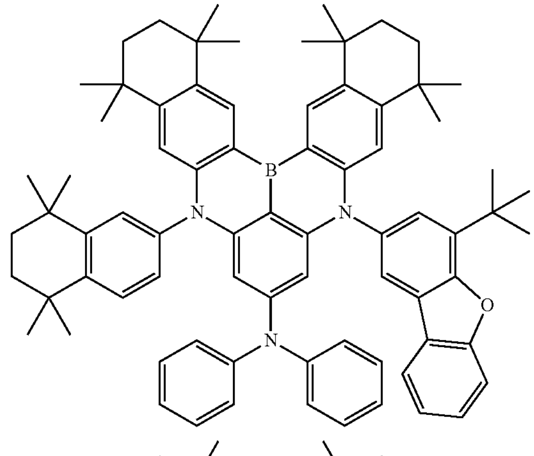
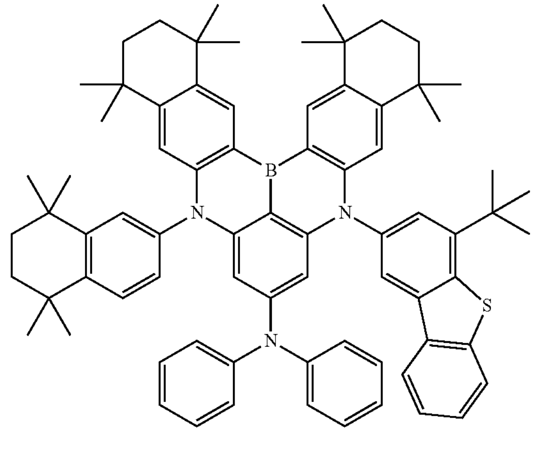
-continued
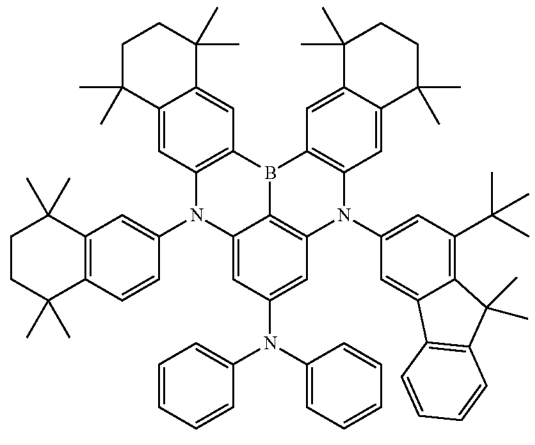
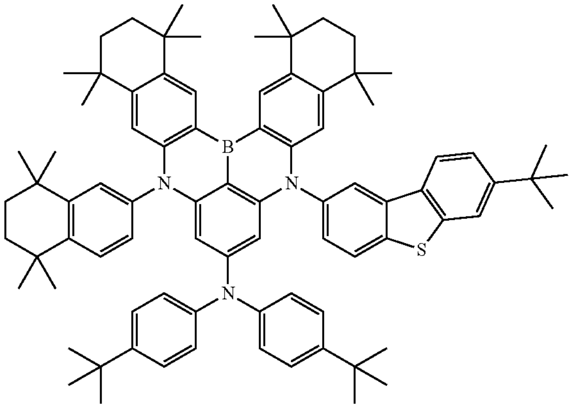
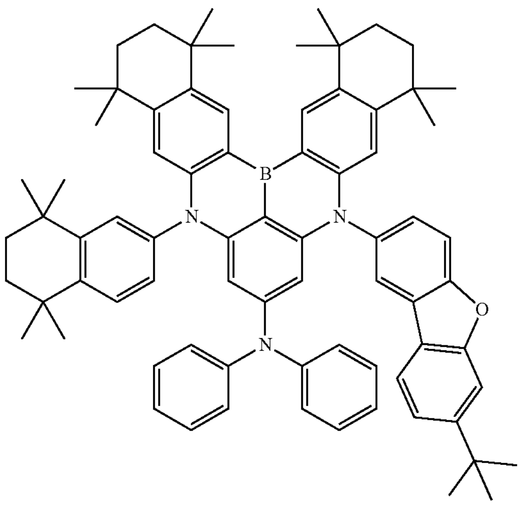

-continued
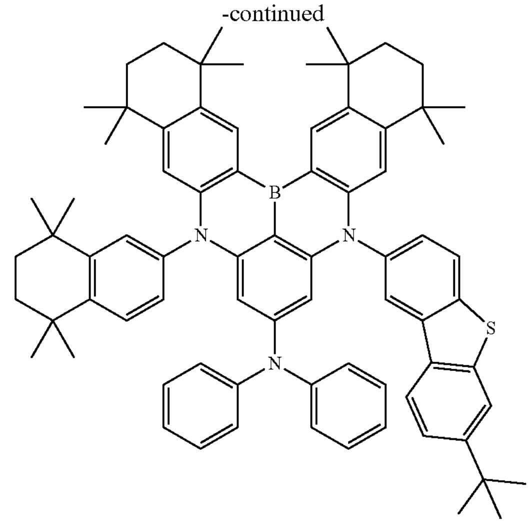
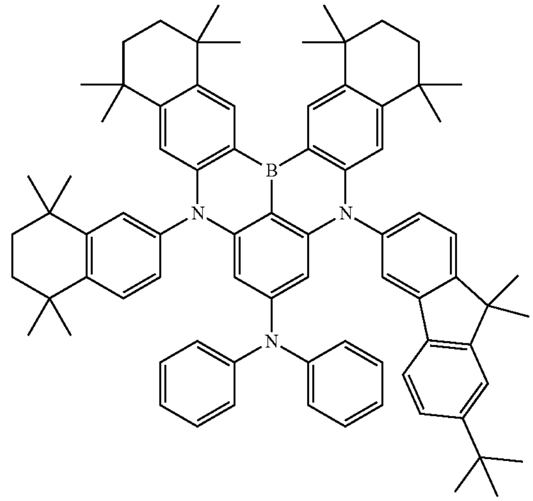
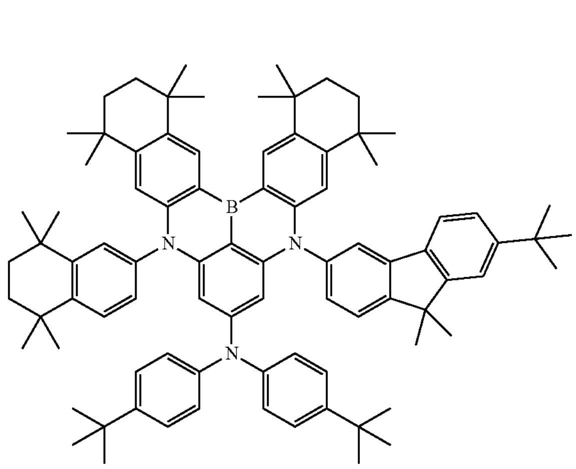
-continued
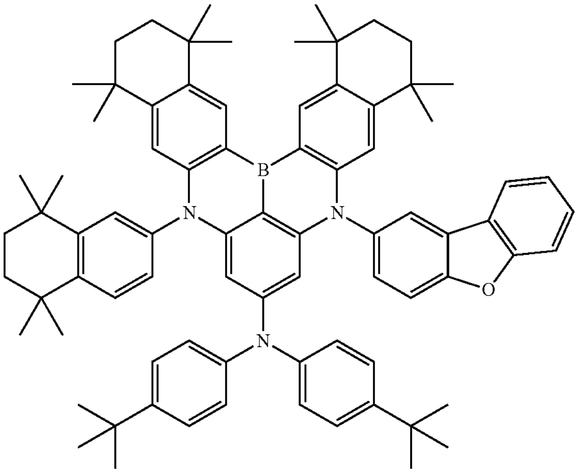
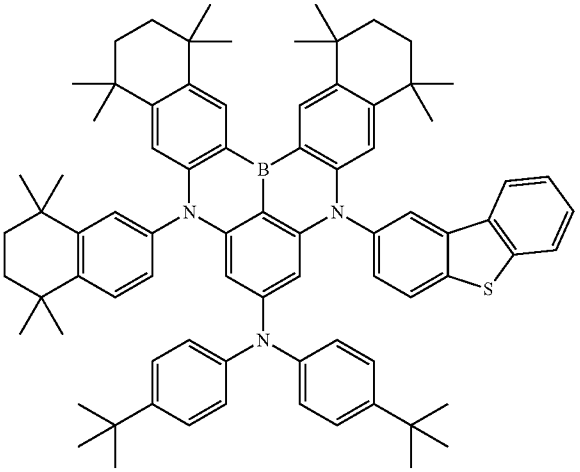
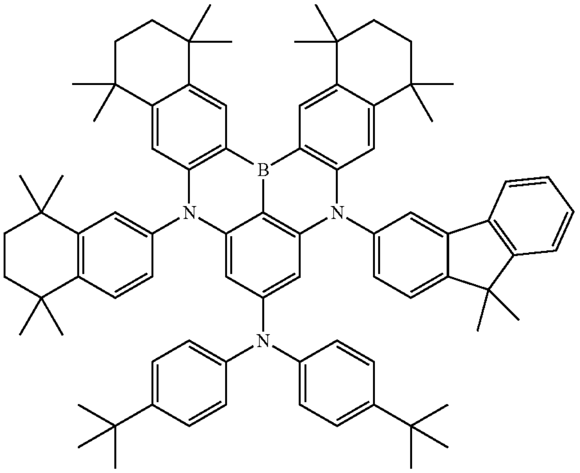

-continued
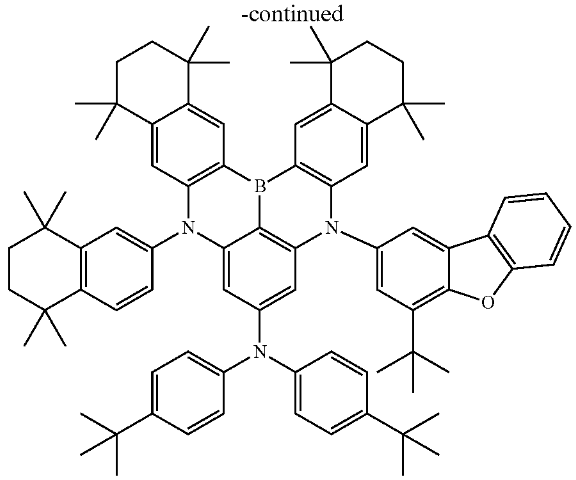
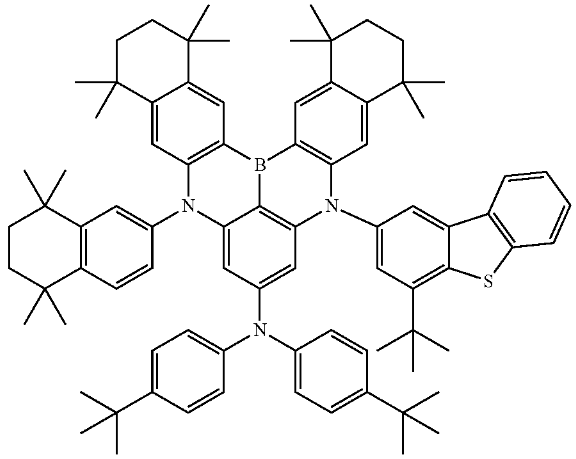
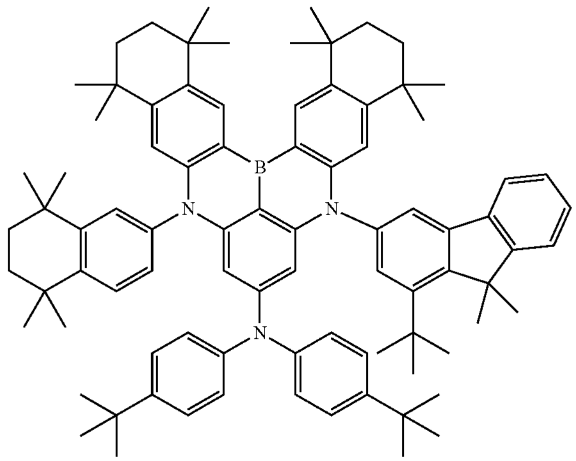
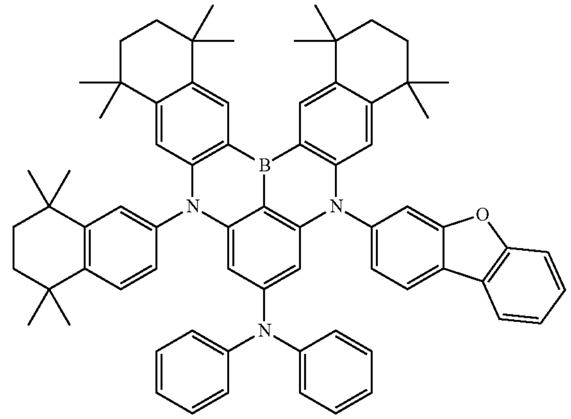
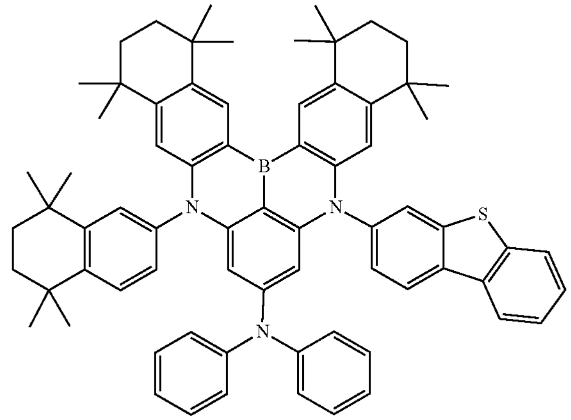
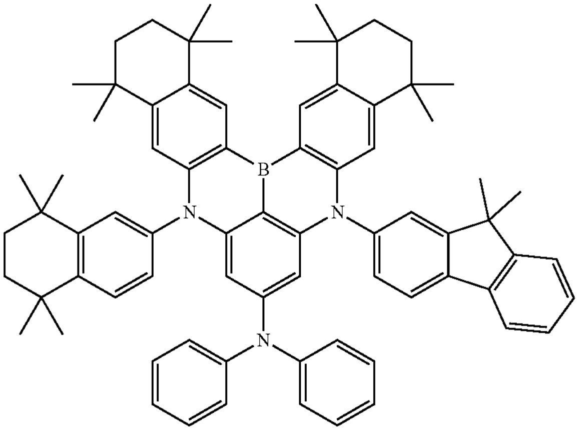
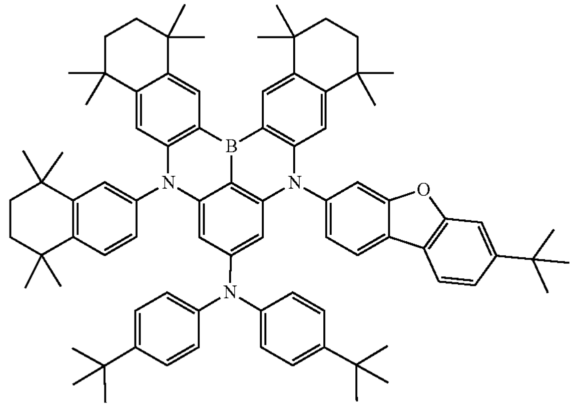

-continued
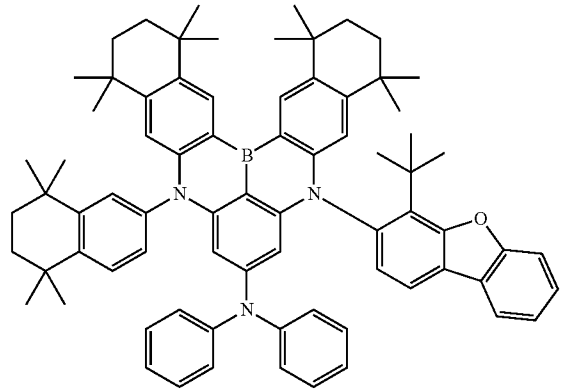
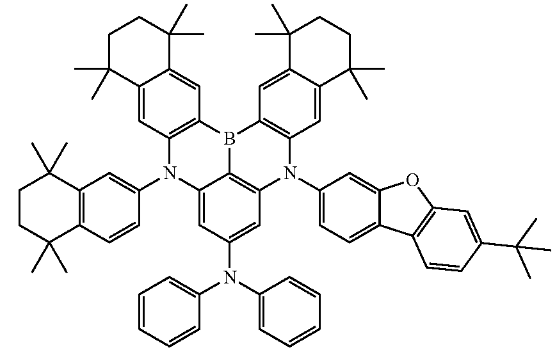
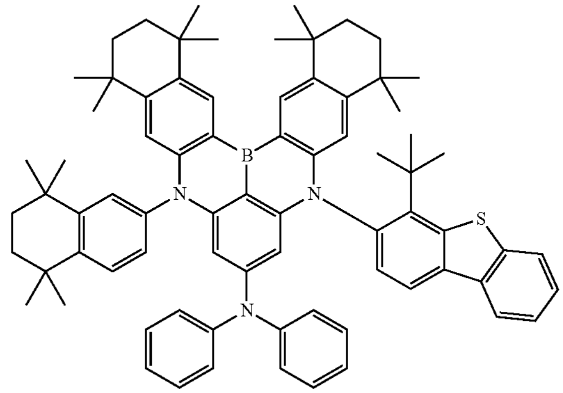
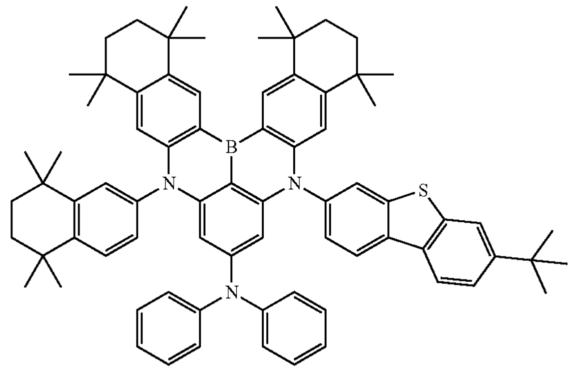
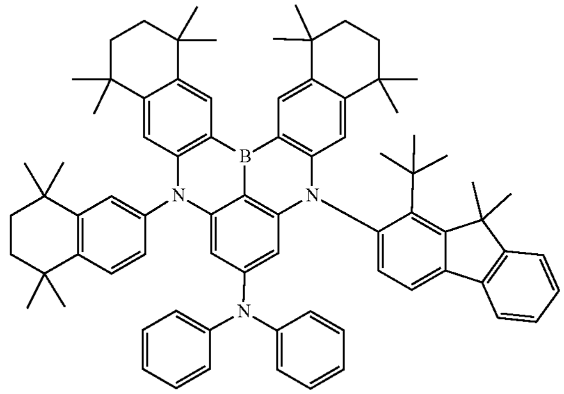
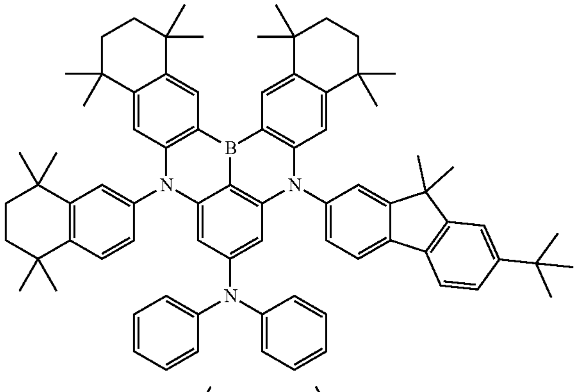
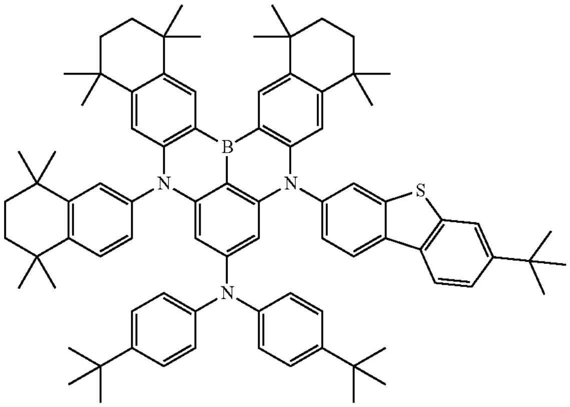
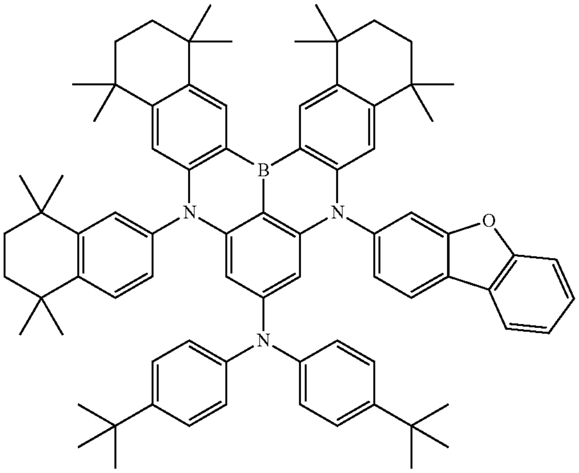
-continued -continued
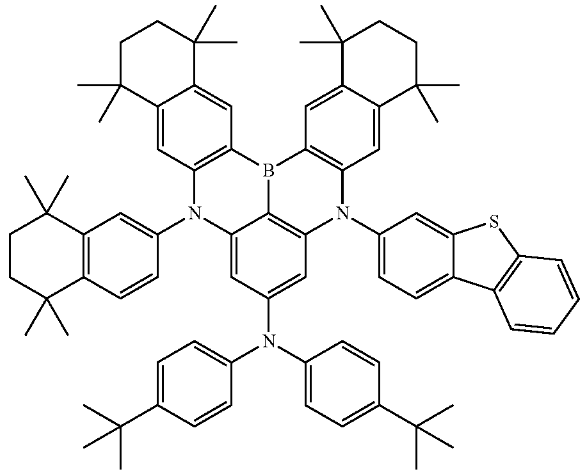
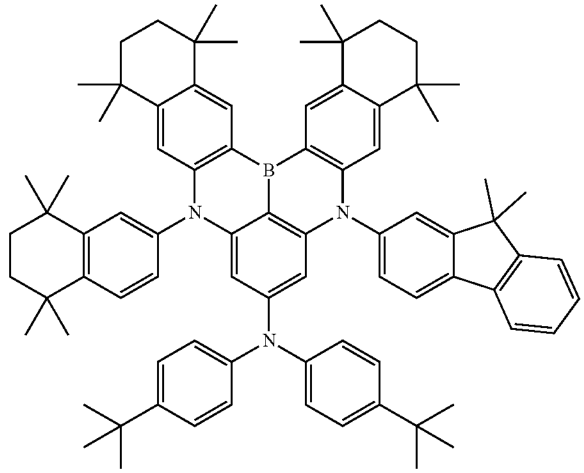
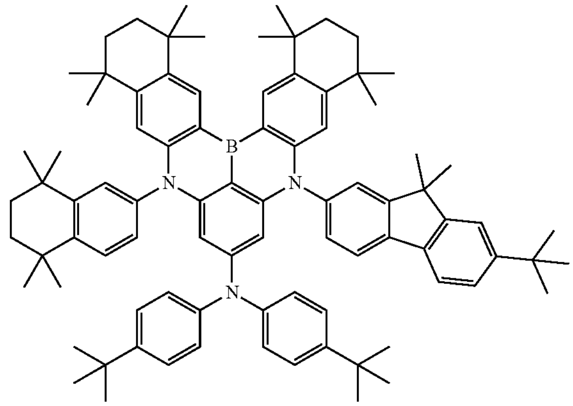
-continued
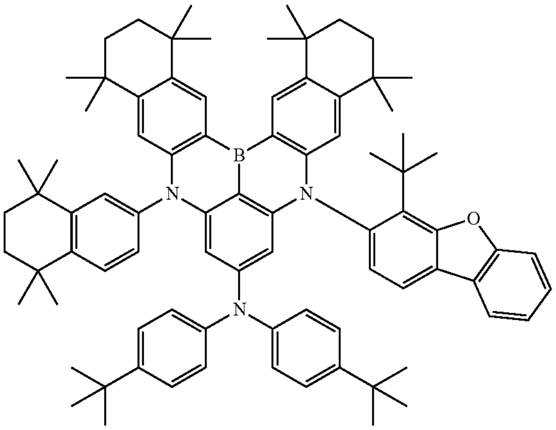
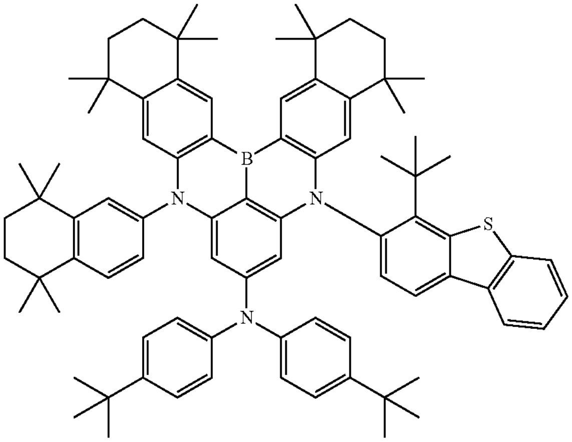
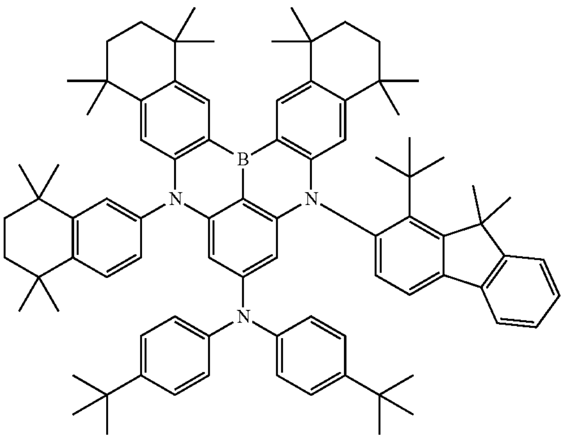

-continued
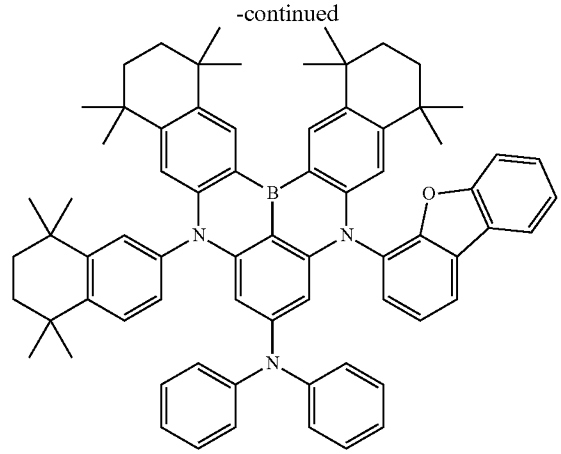
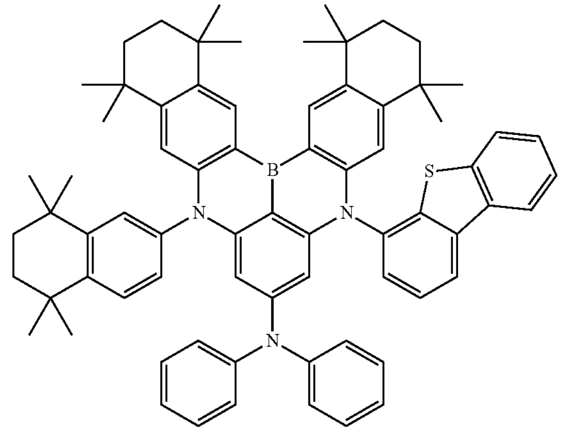
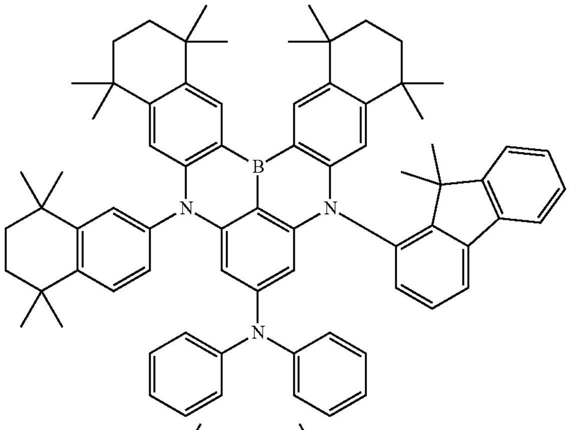
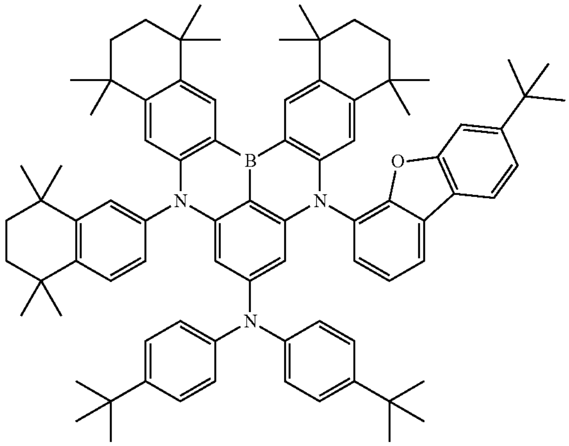
-continued
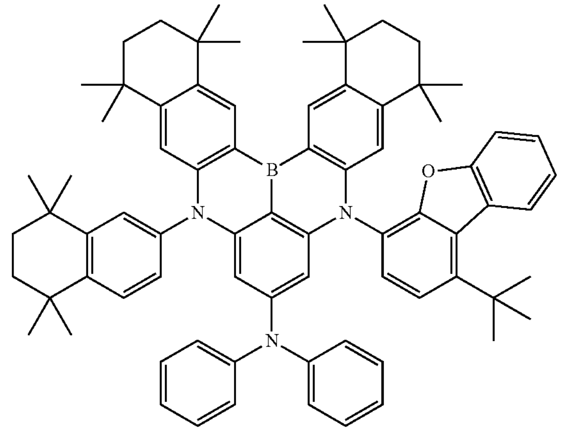
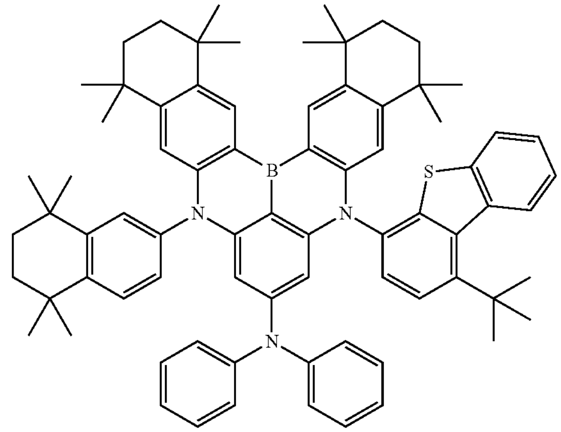
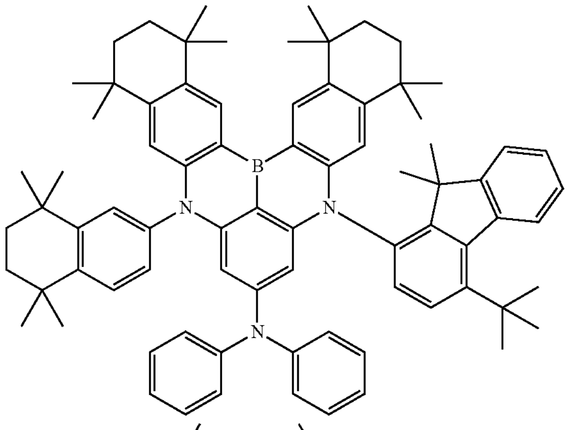
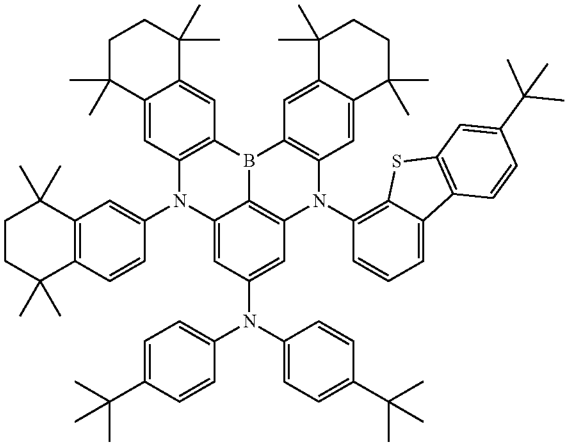

-continued
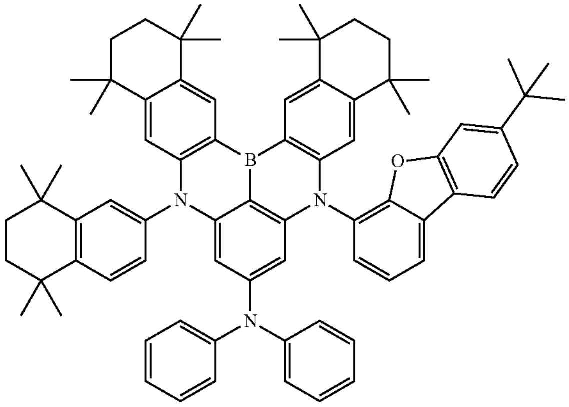
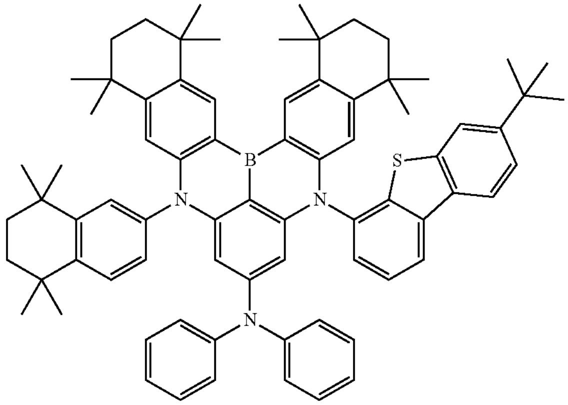
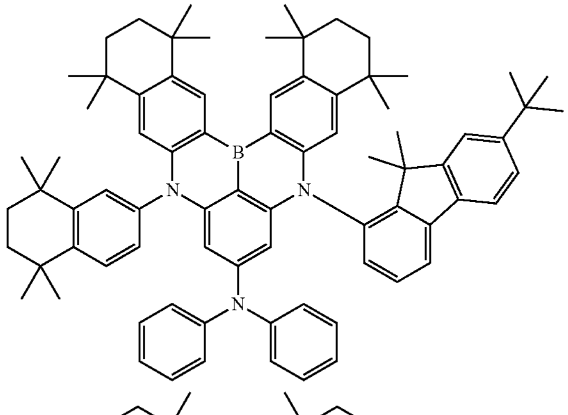
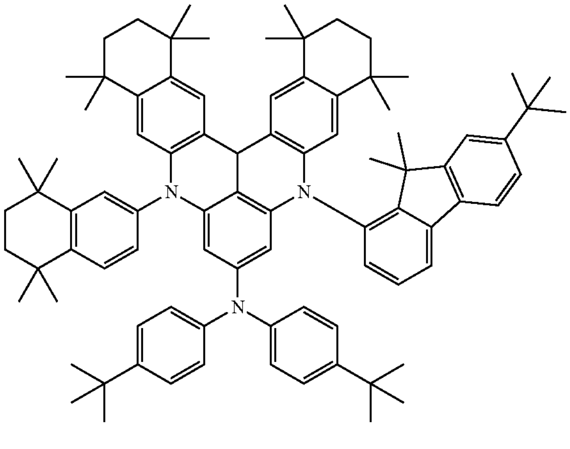
-continued
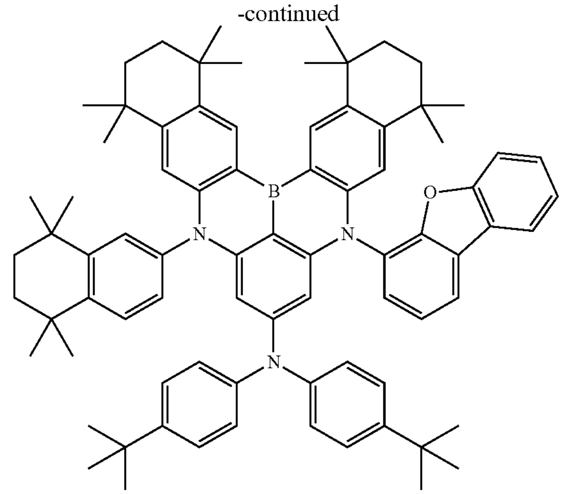
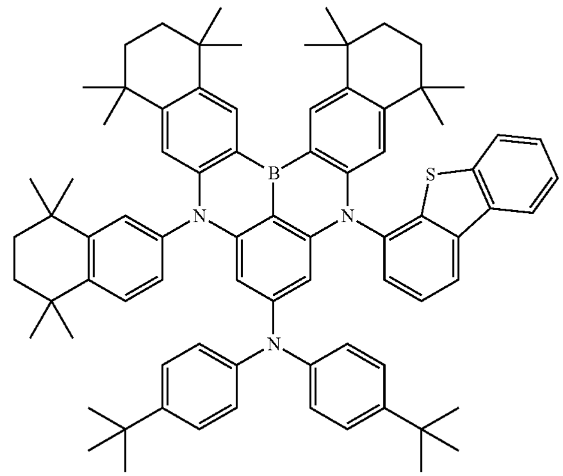
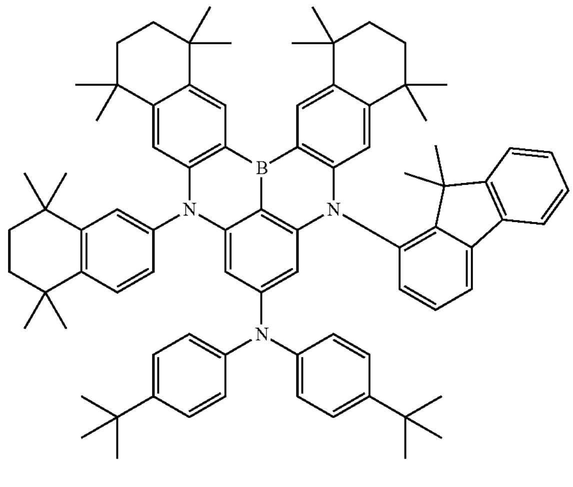

-continued
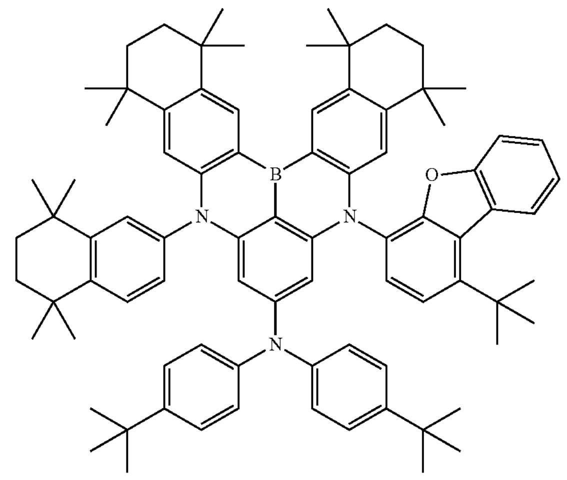
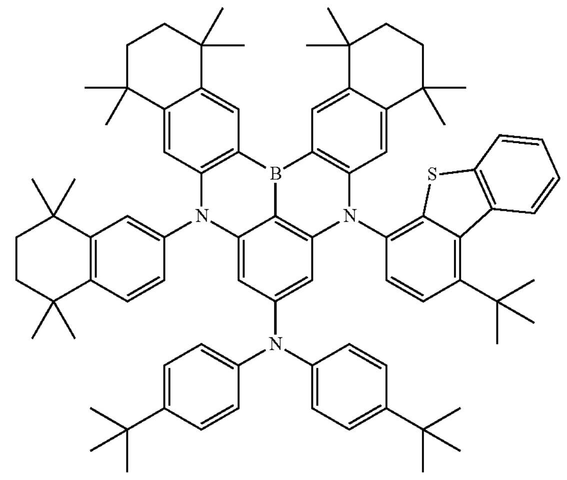
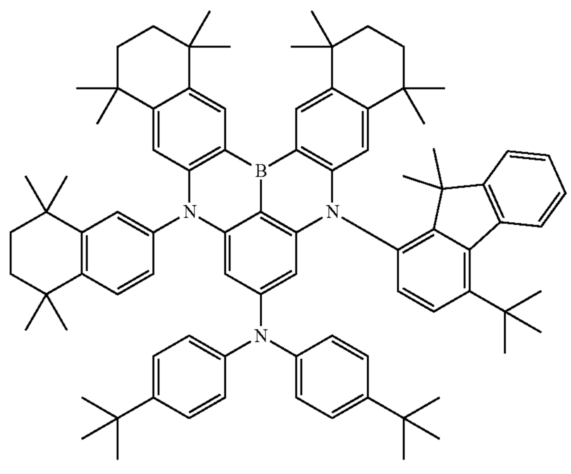
-continued
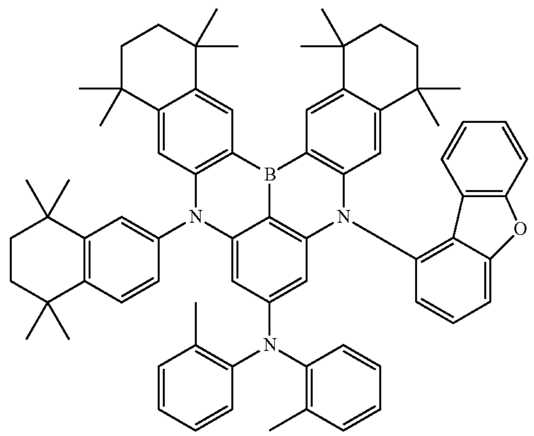
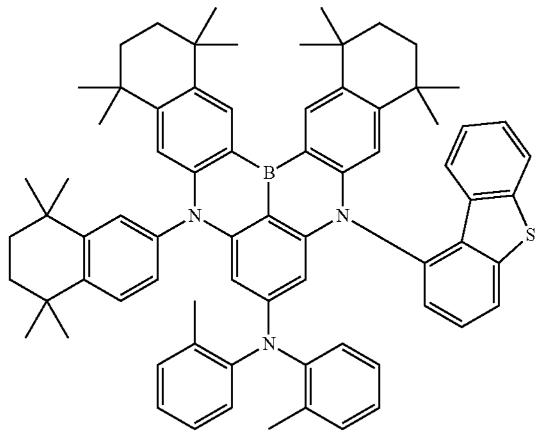
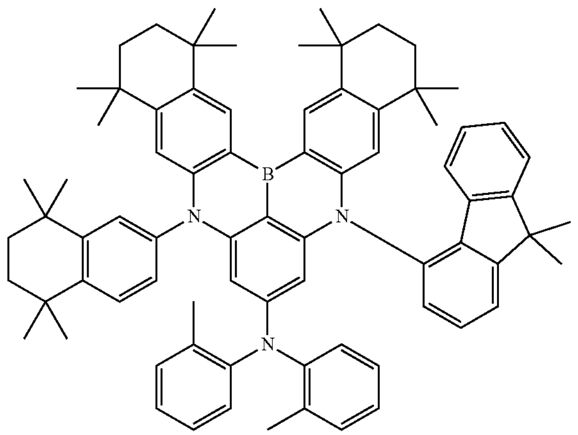

-continued
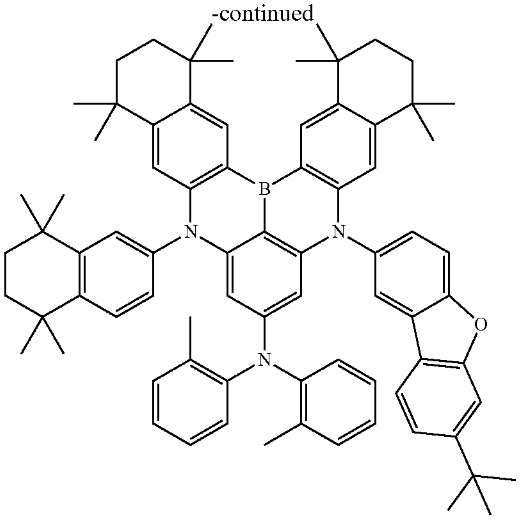
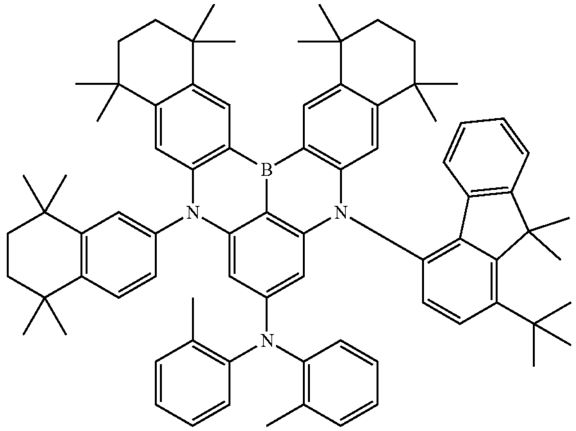
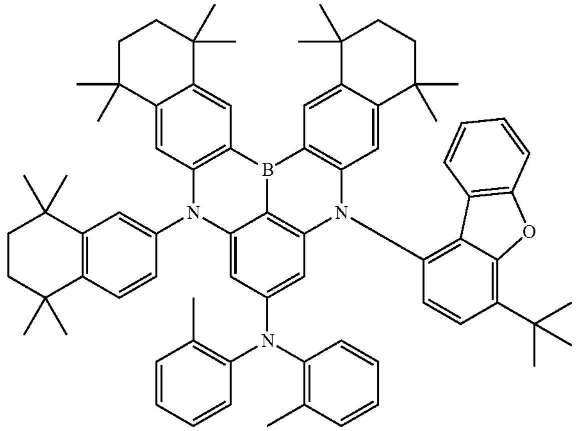
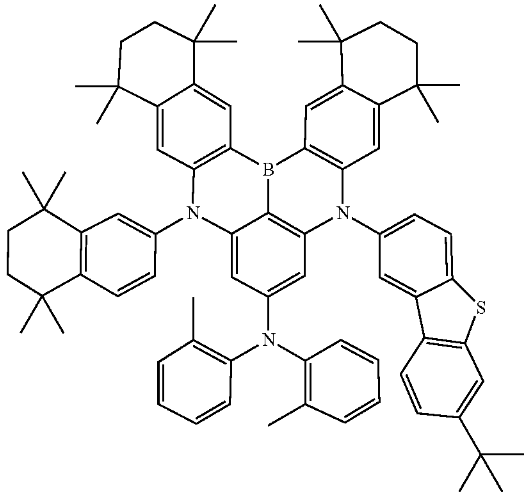
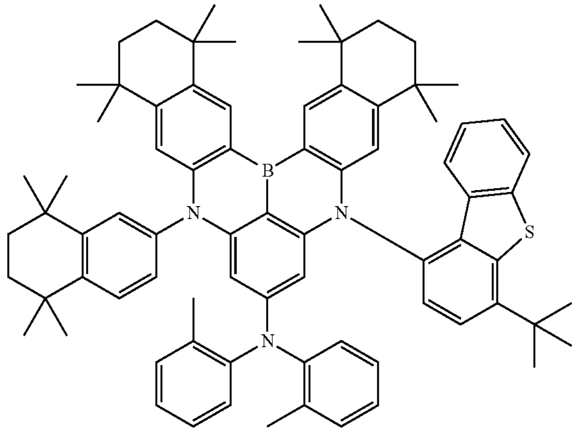
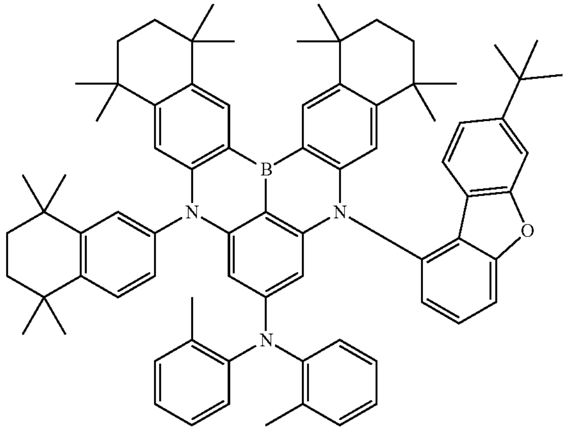

-continued
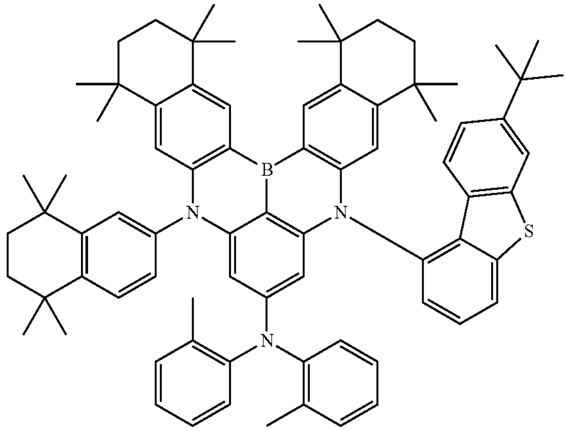
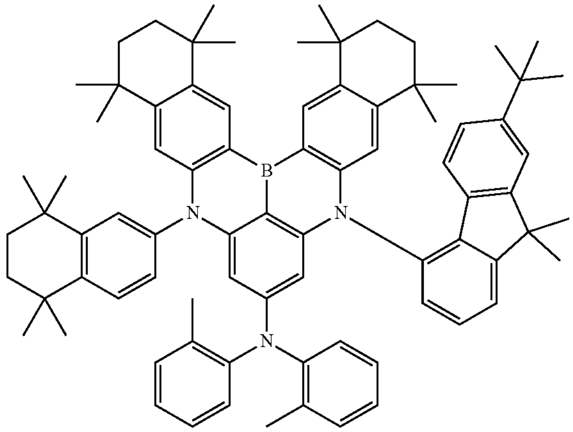
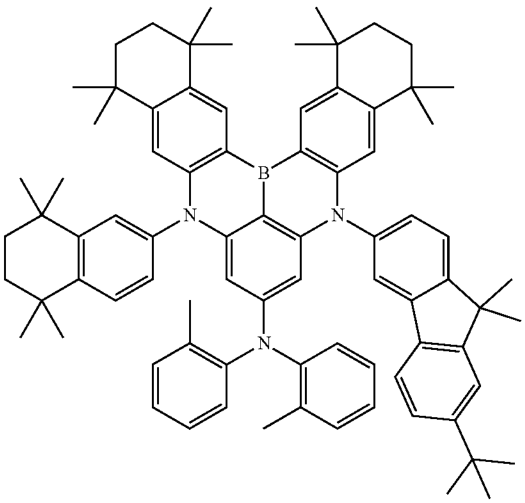
-continued
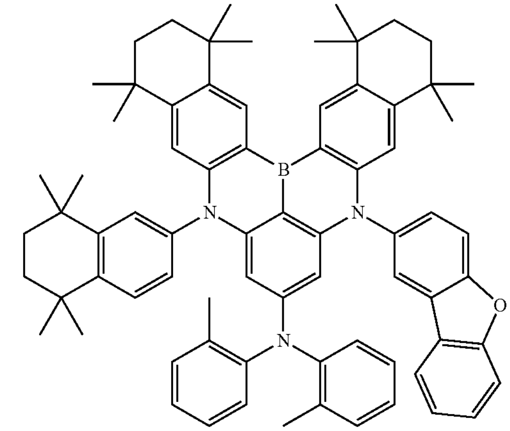
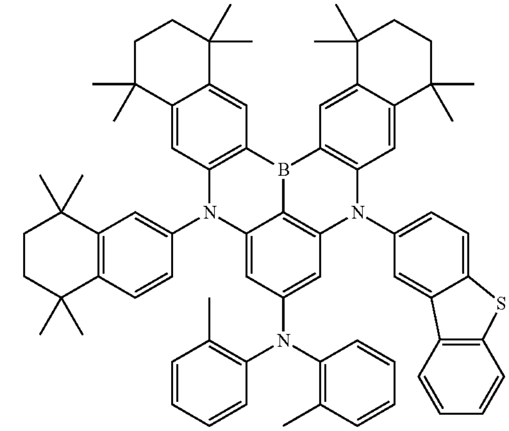
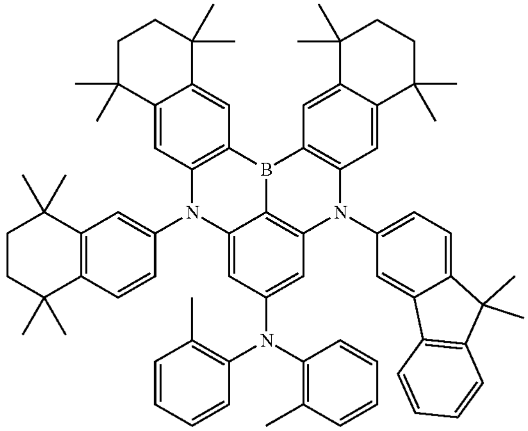
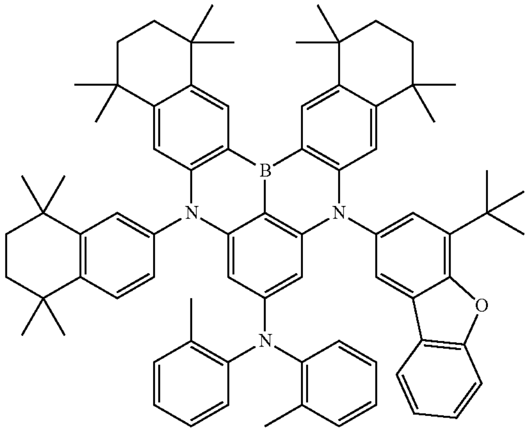

-continued
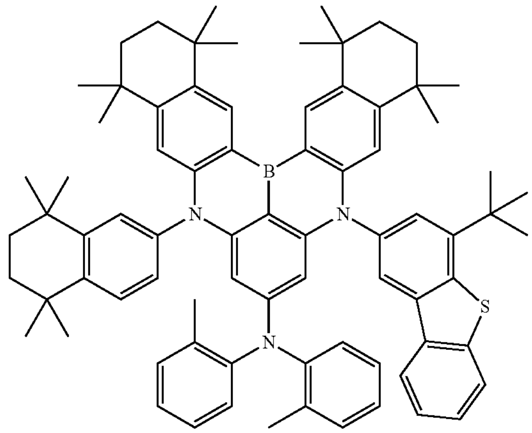
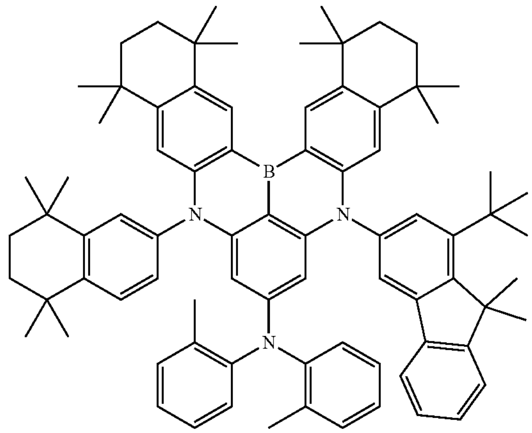
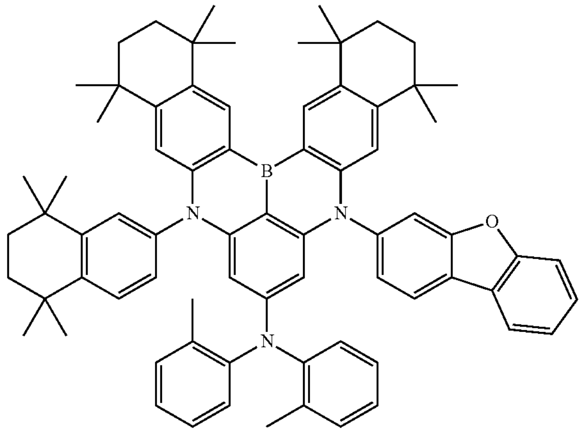
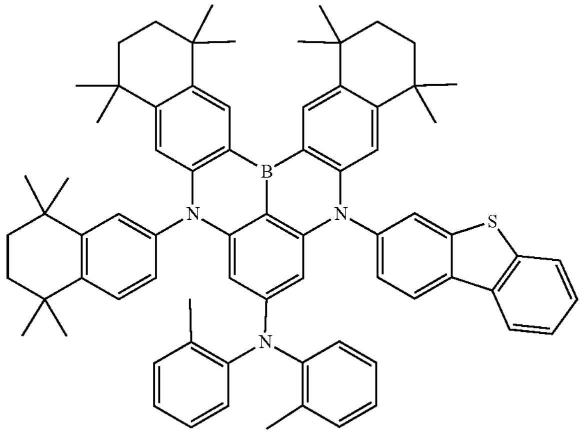
-continued
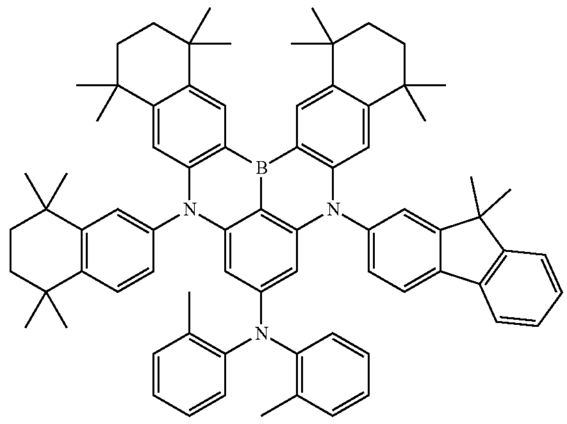
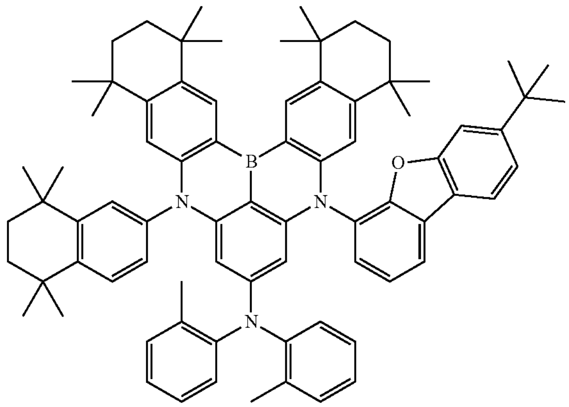
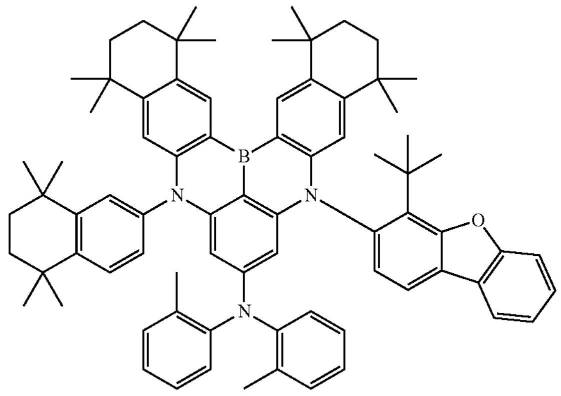
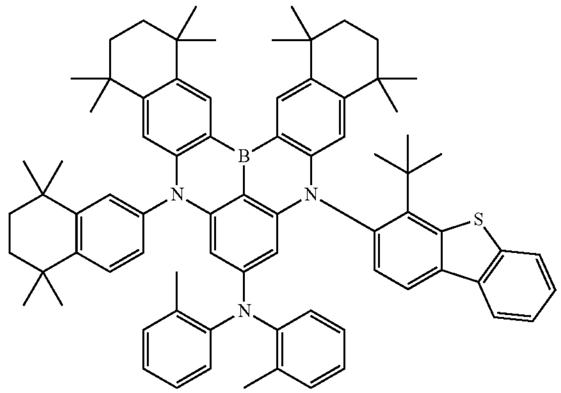

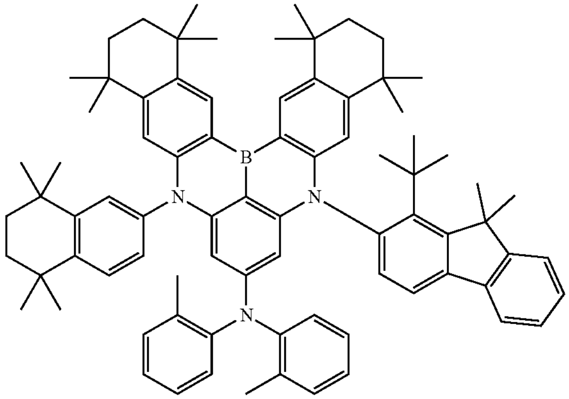
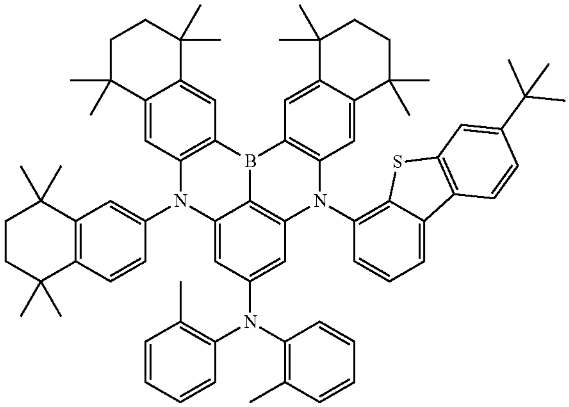
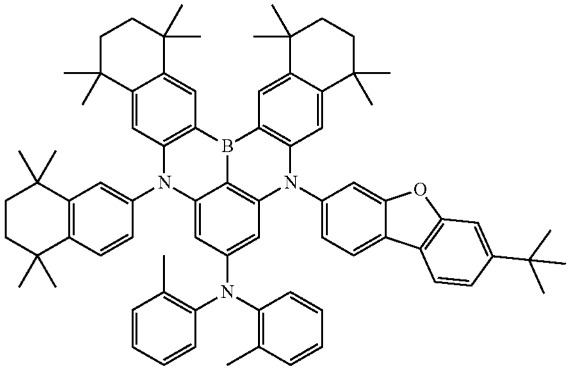
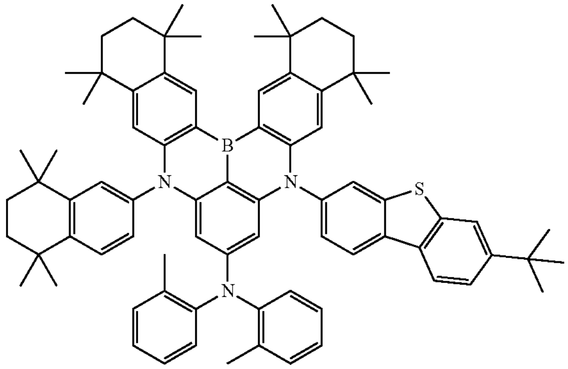
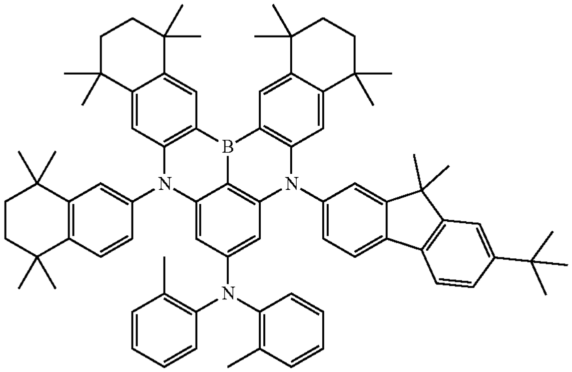
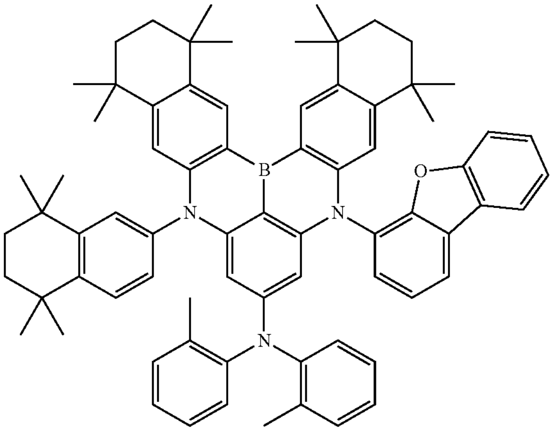
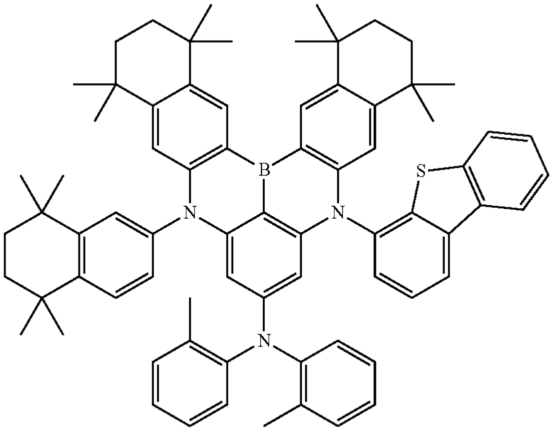
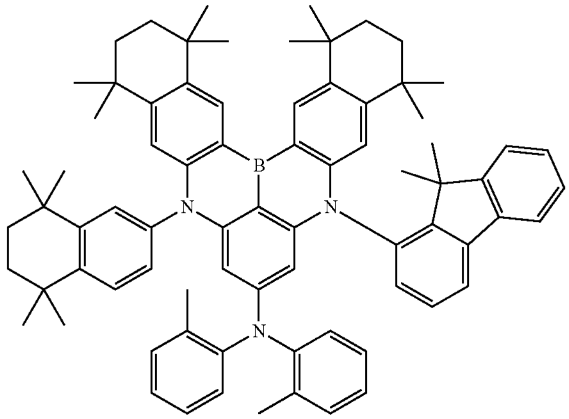

-continued
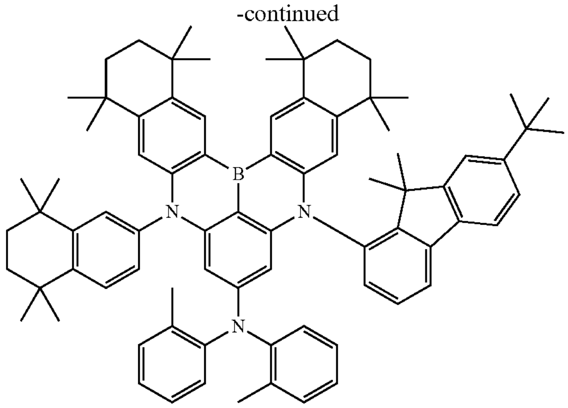
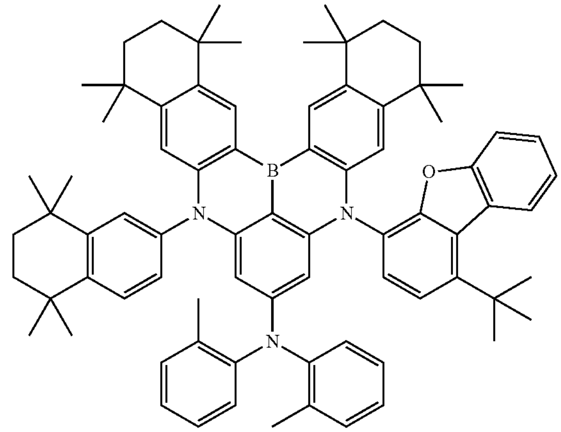
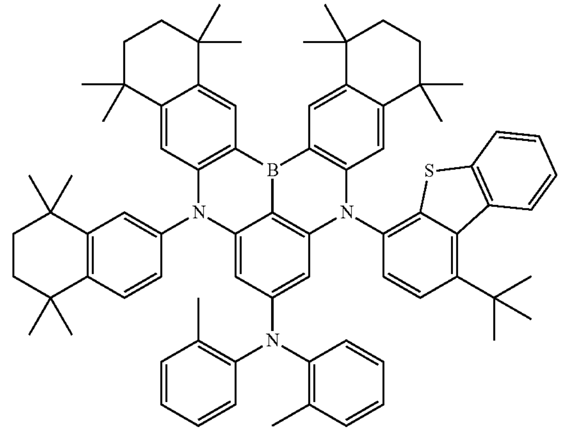
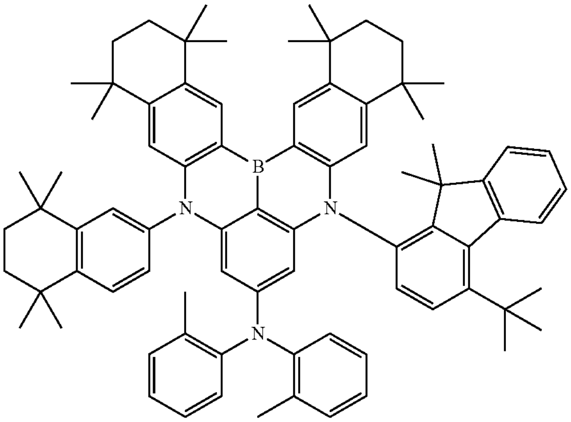
-continued
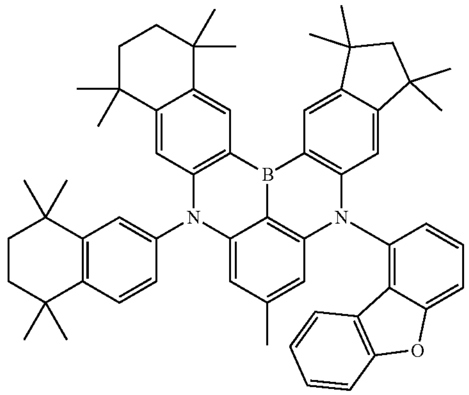
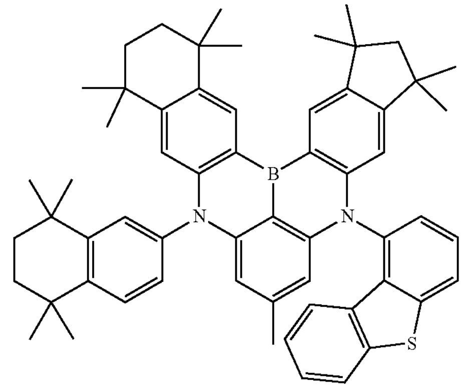
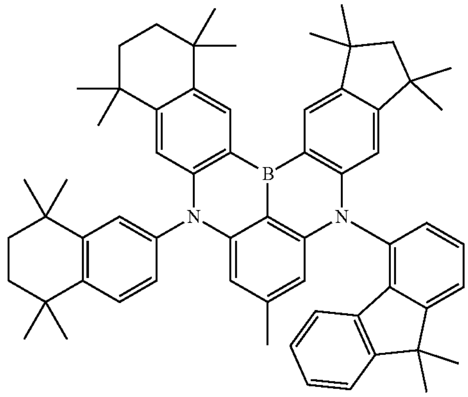
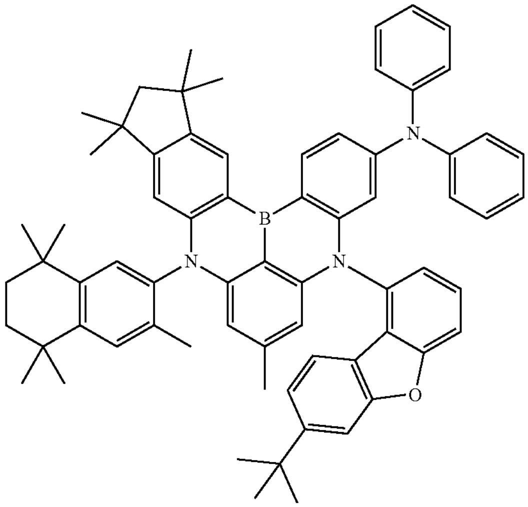

-continued
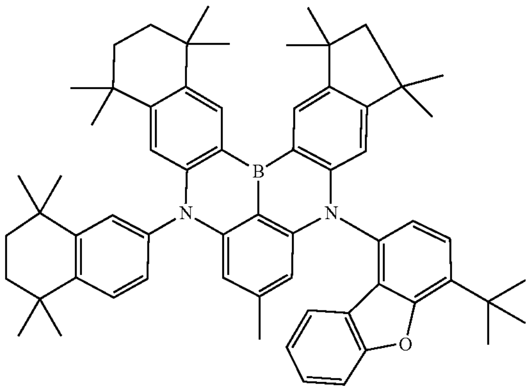
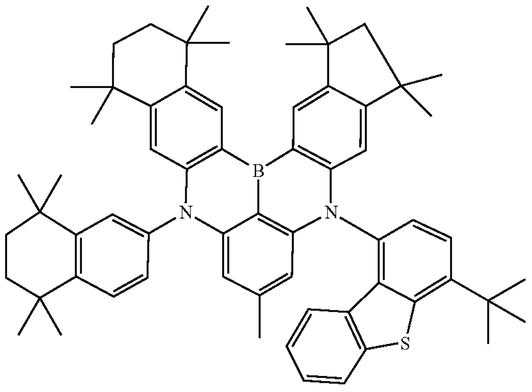
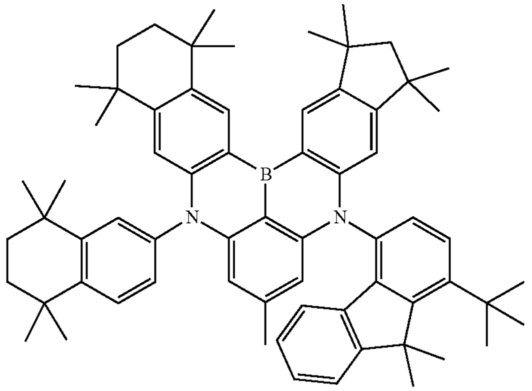
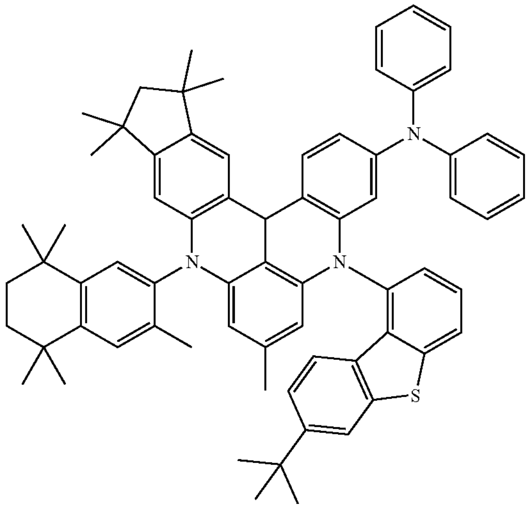
-continued
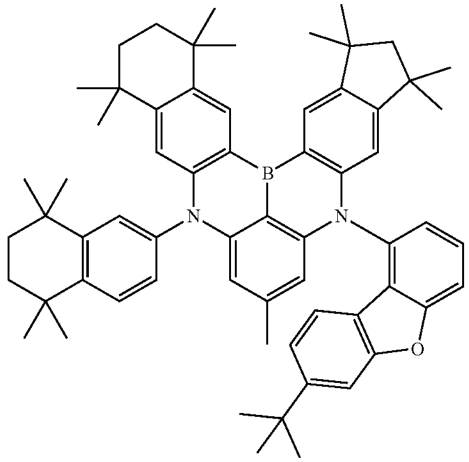
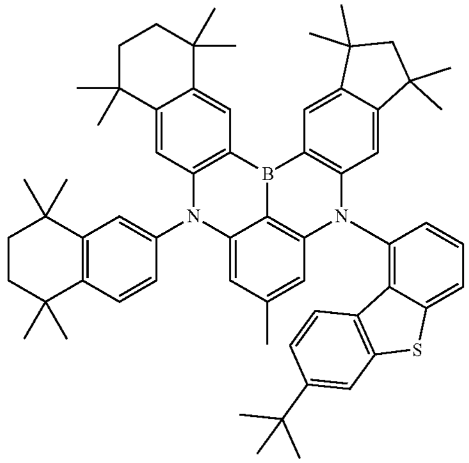
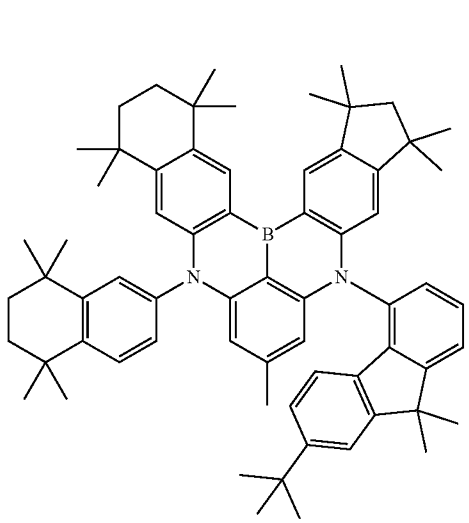

-continued
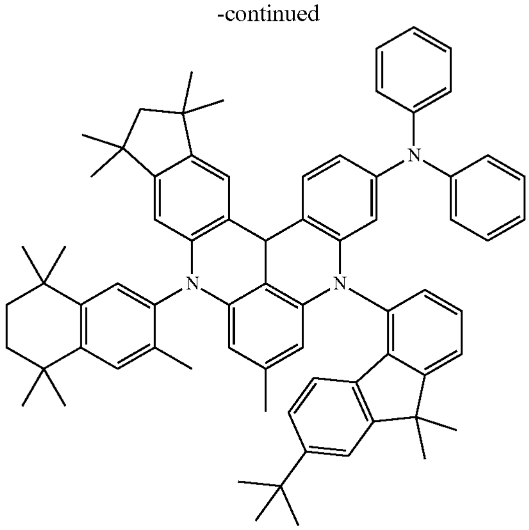
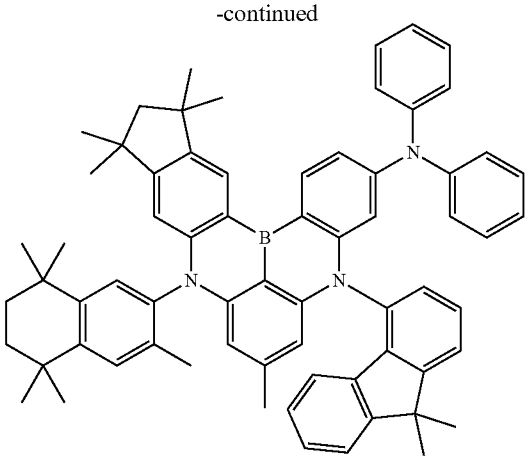
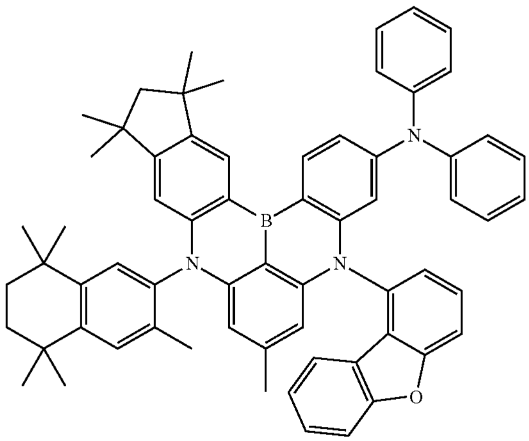
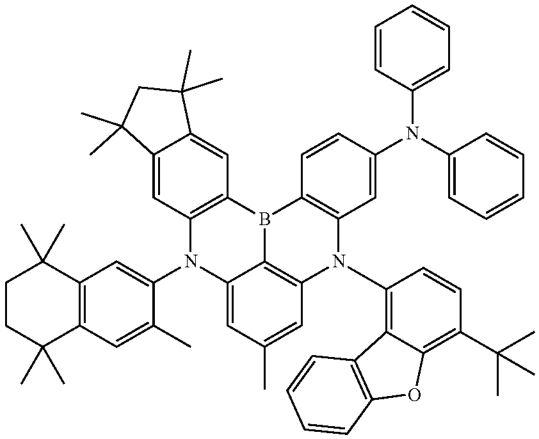
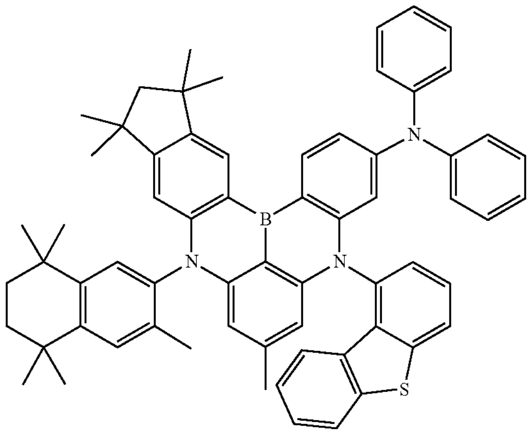
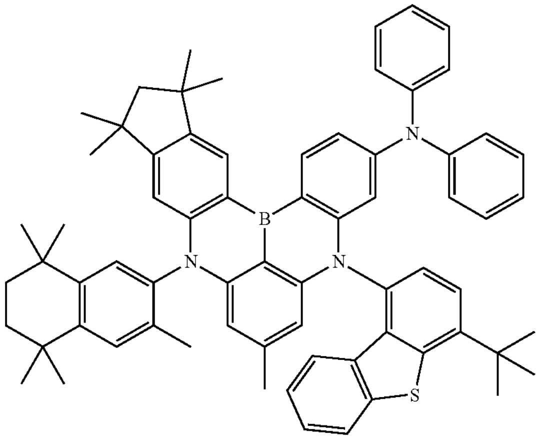
-continued -continued
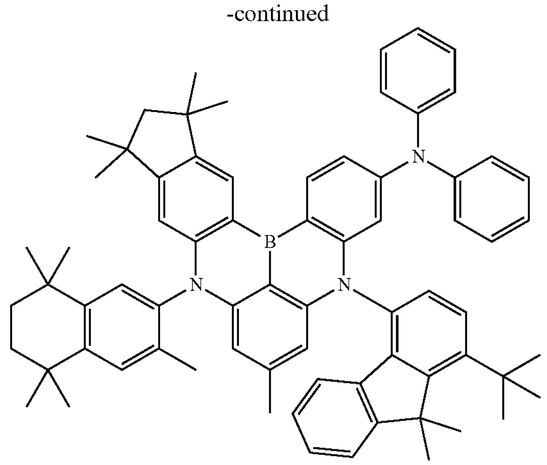
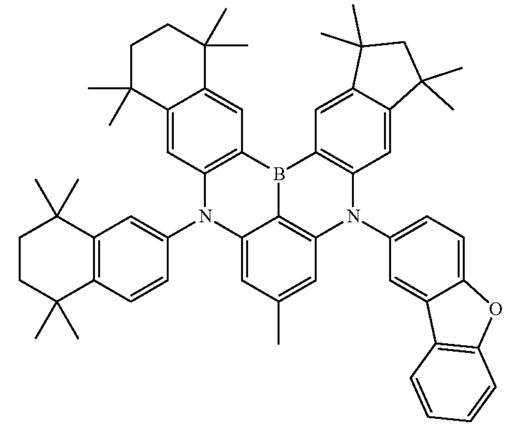
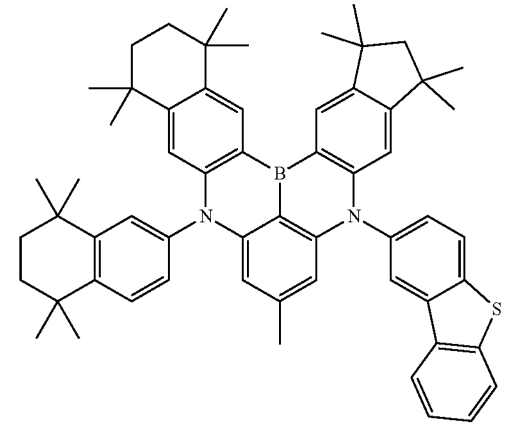
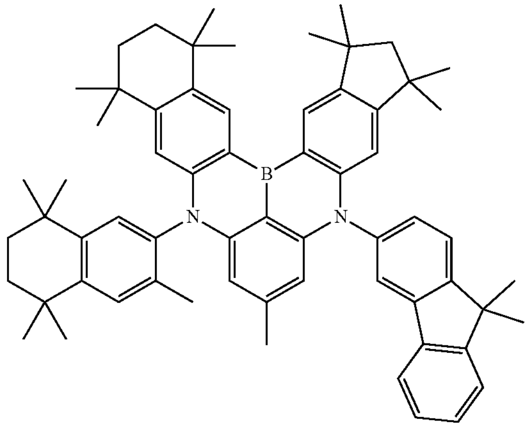
-continued
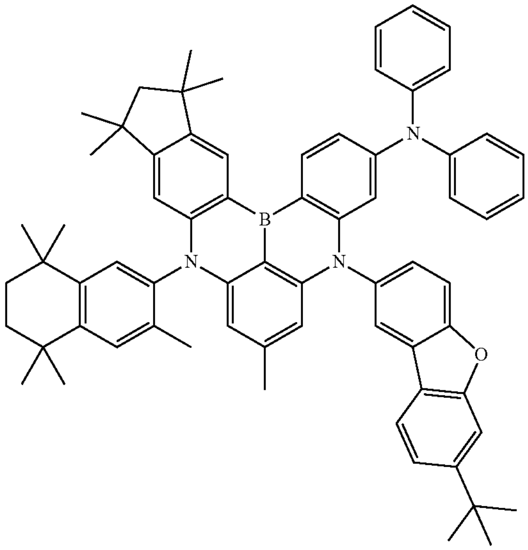
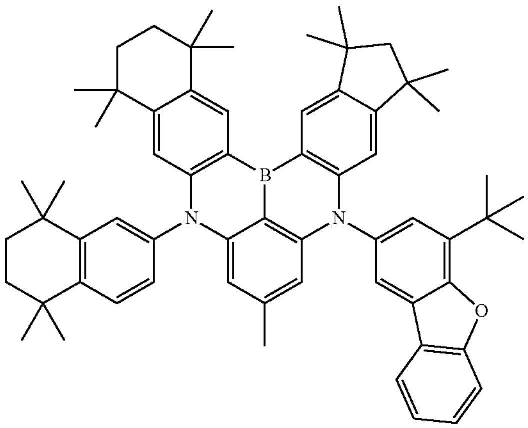
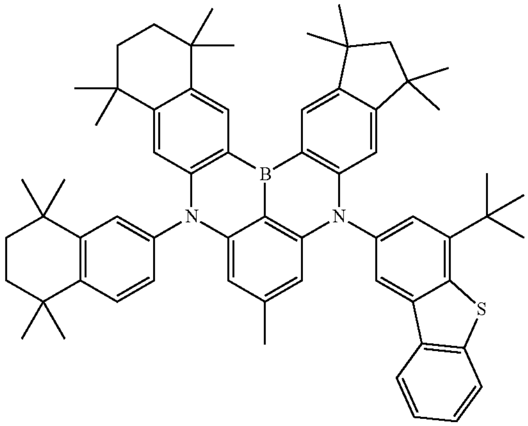

-continued
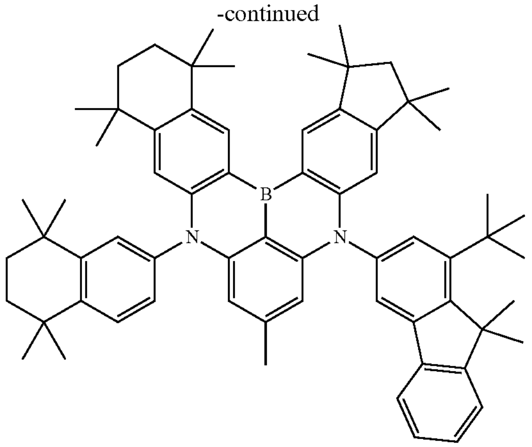
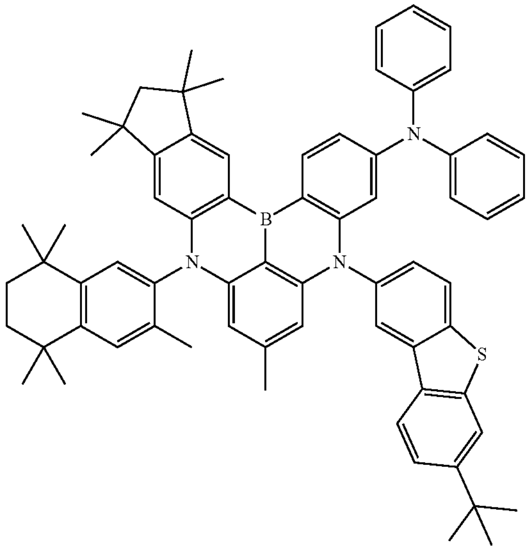
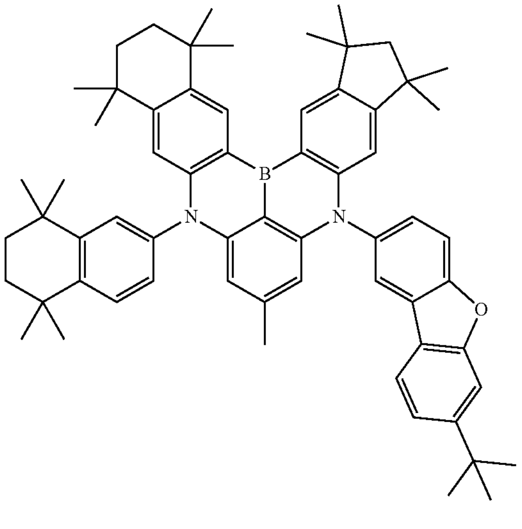
-continued
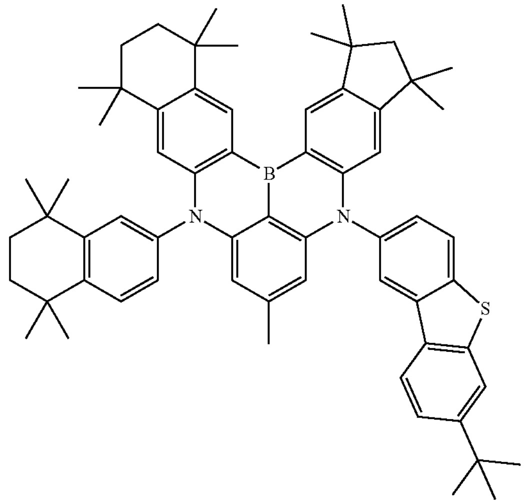
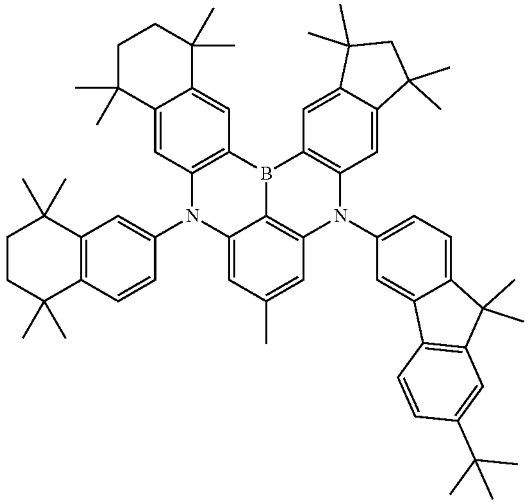
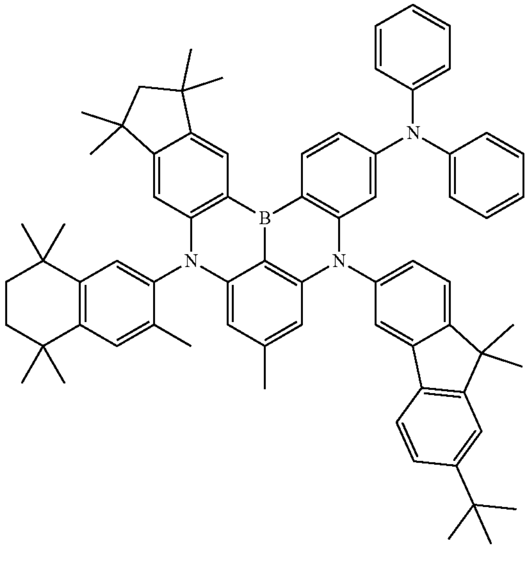

-continued
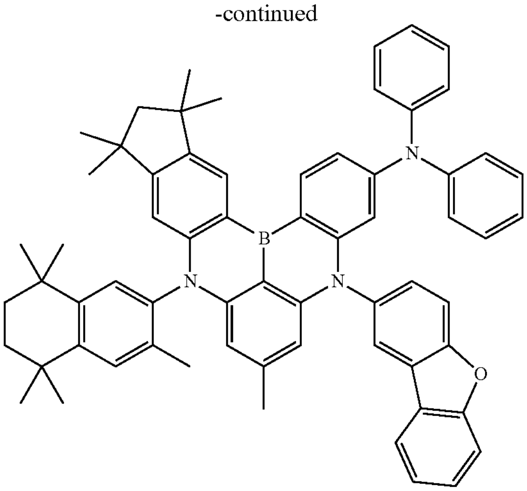
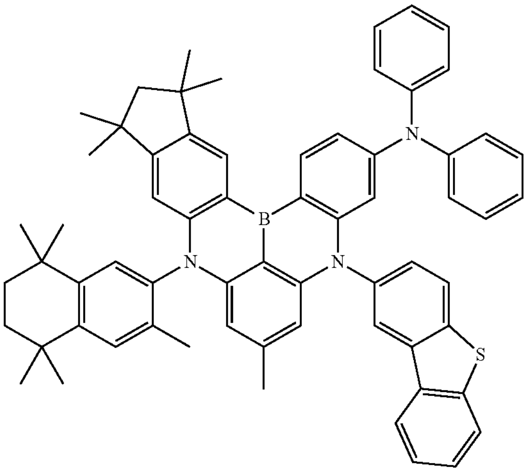
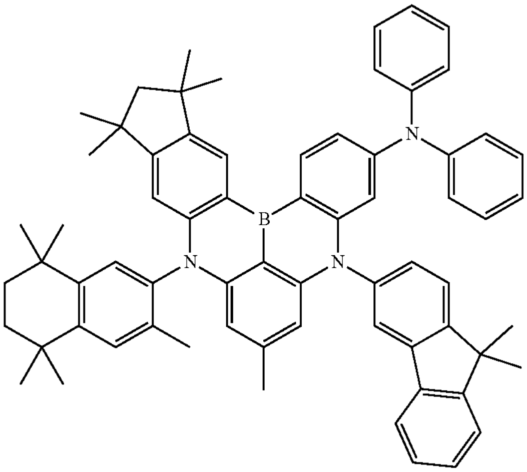
-continued
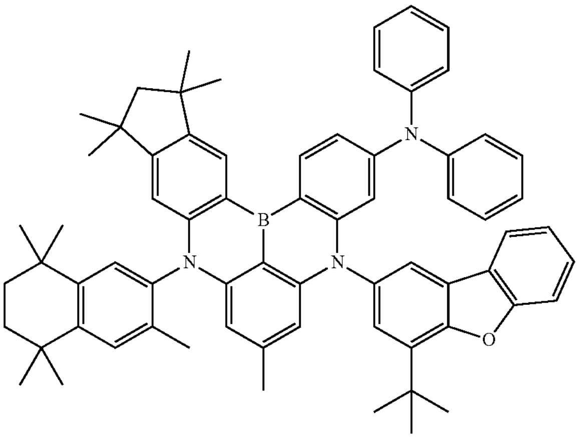
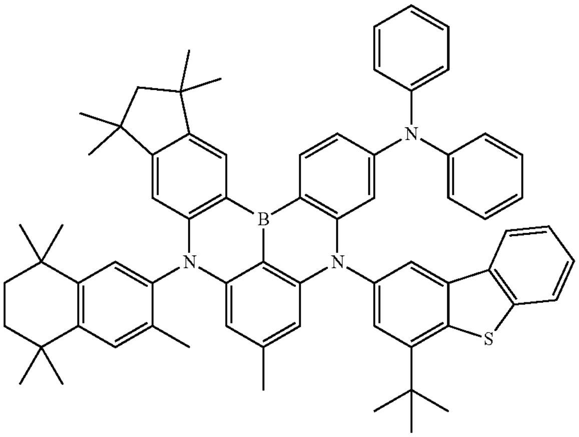
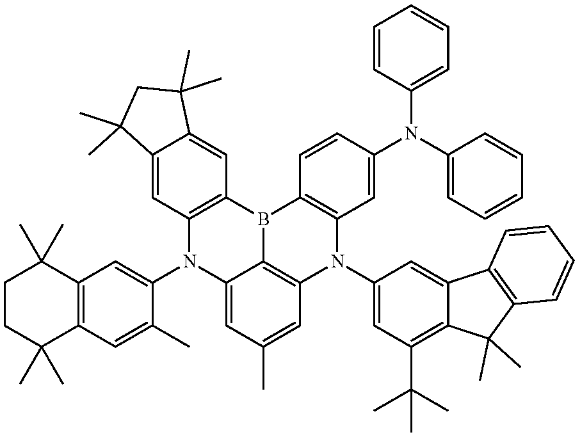

-continued
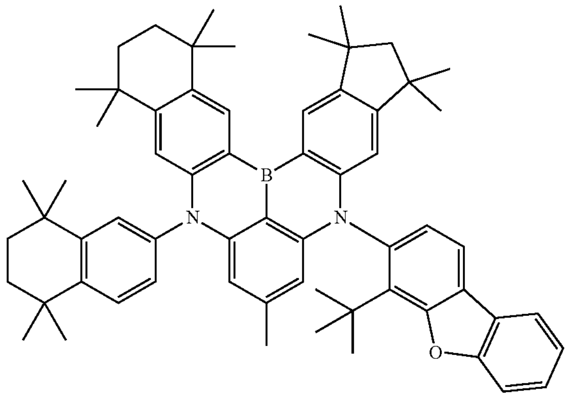
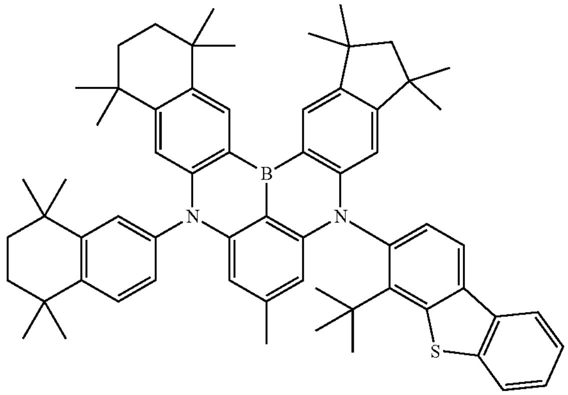
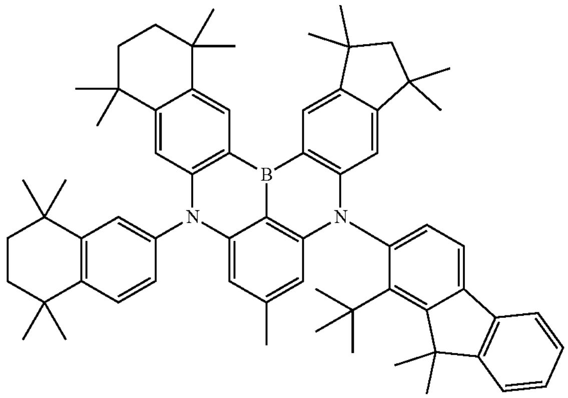
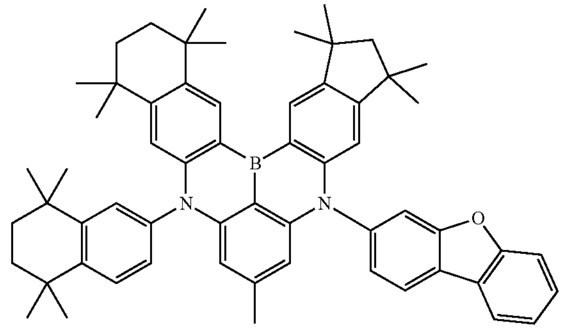
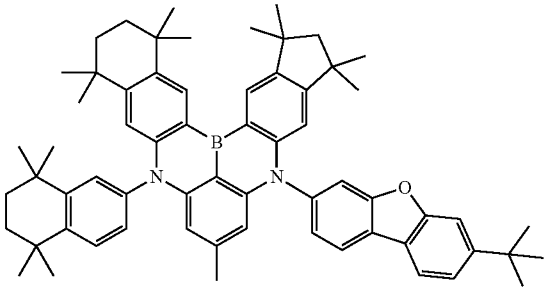
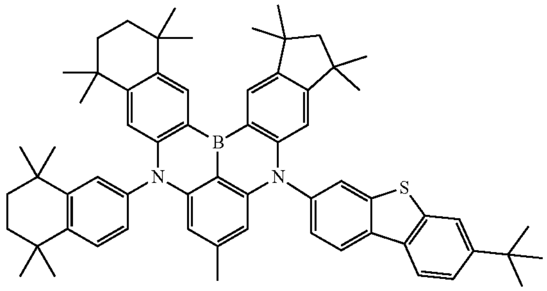
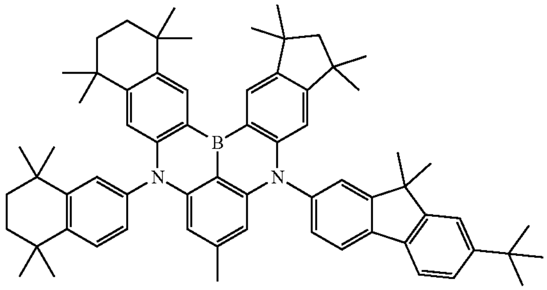
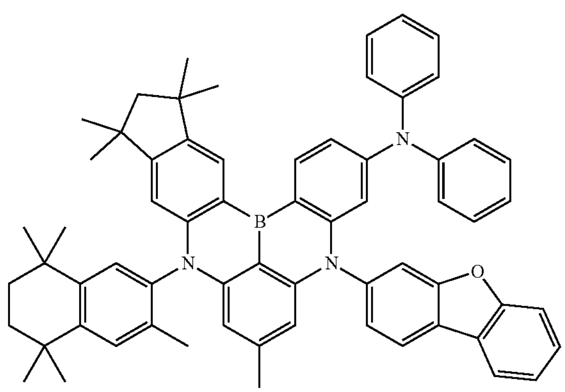
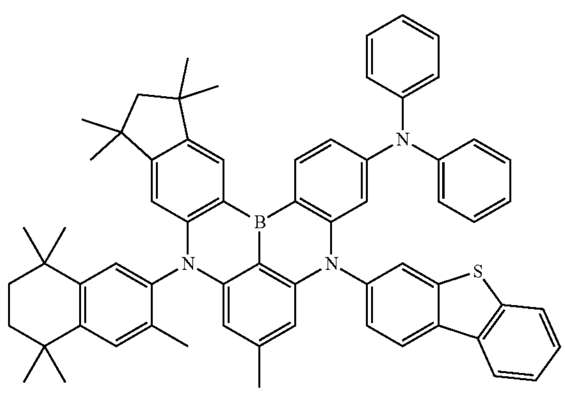

-continued
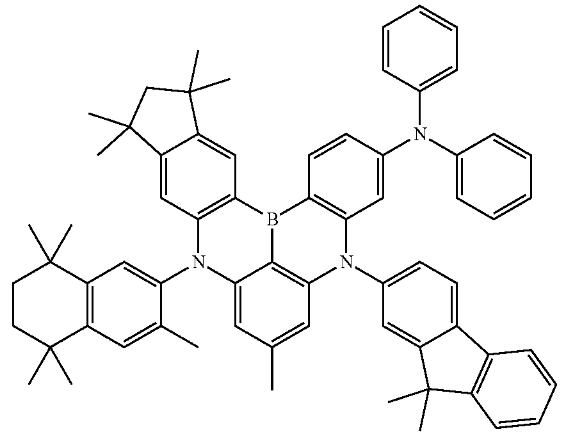
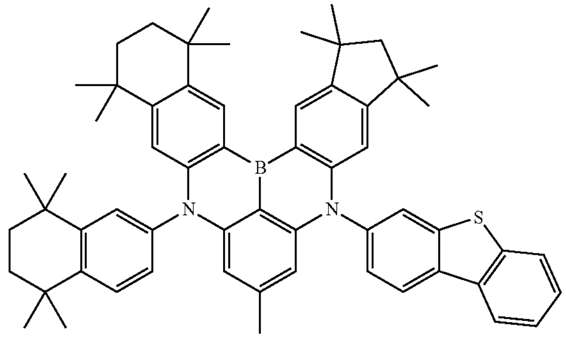
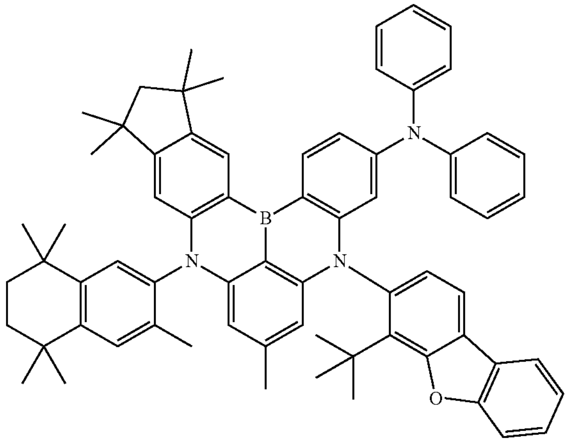
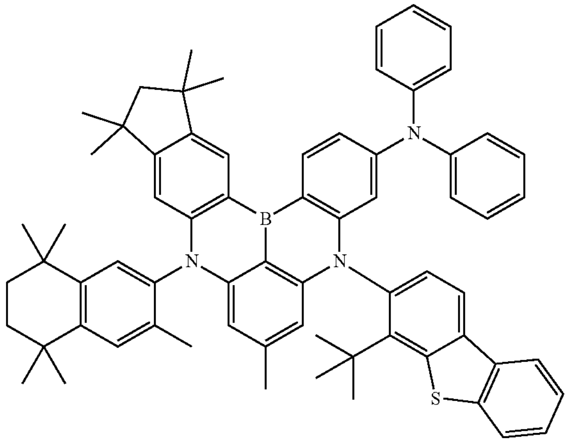
-continued
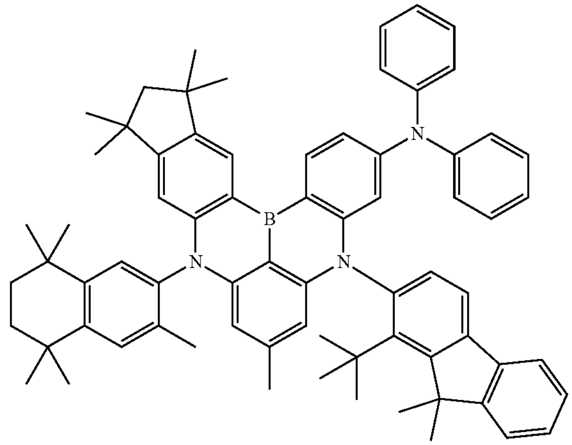
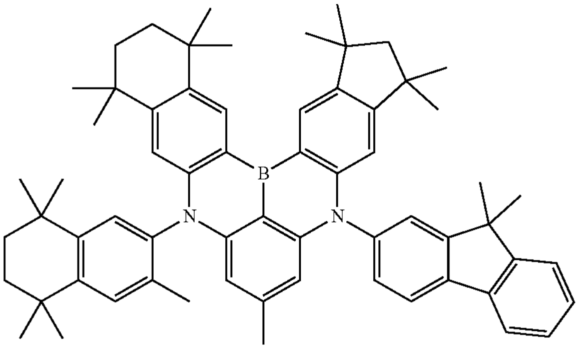
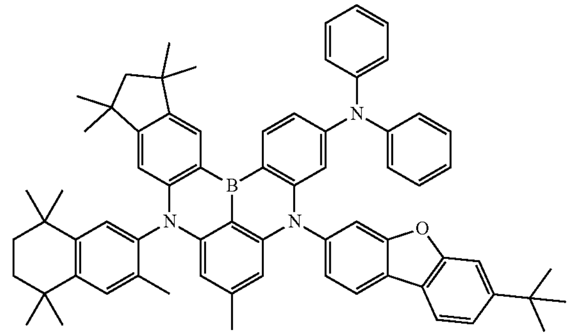
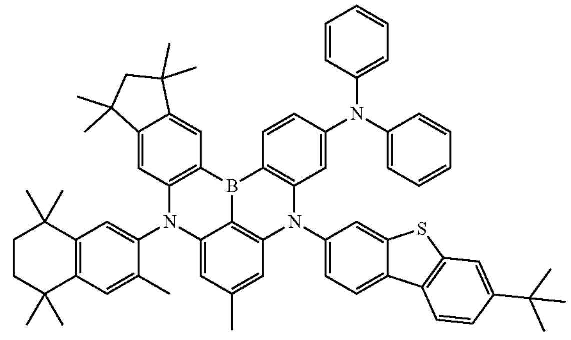

-continued
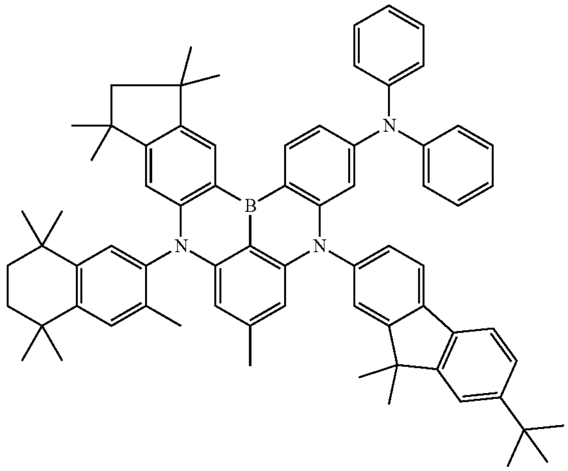
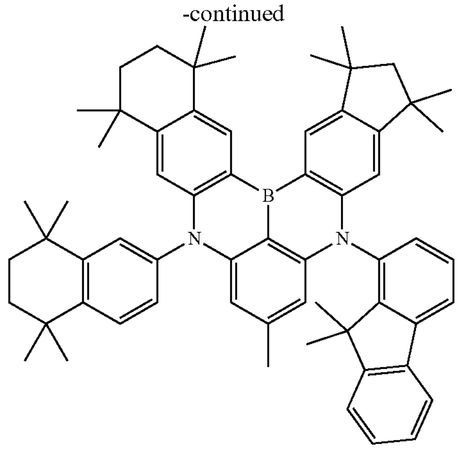
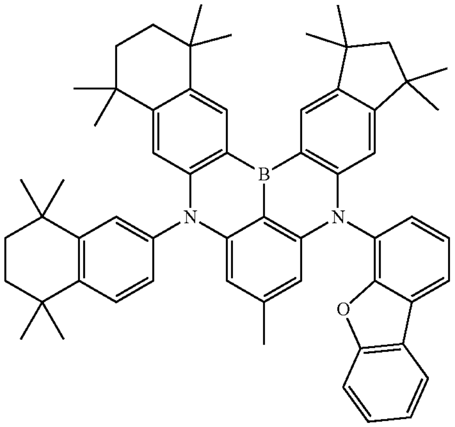
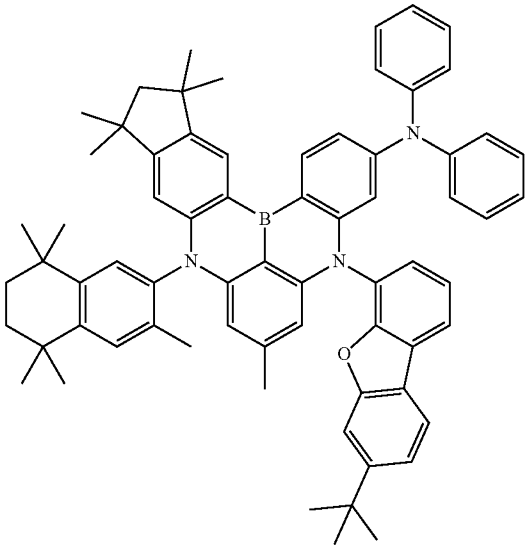
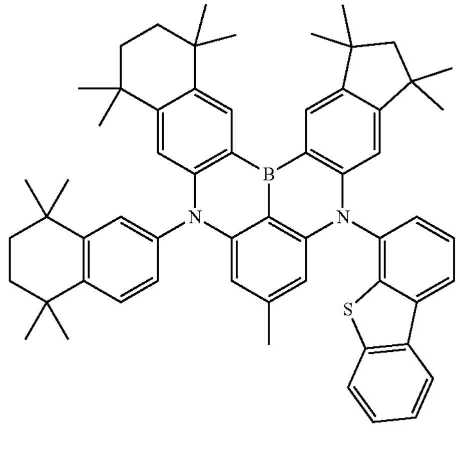
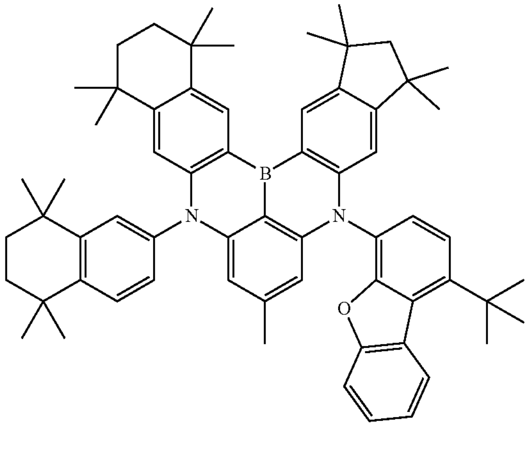

-continued
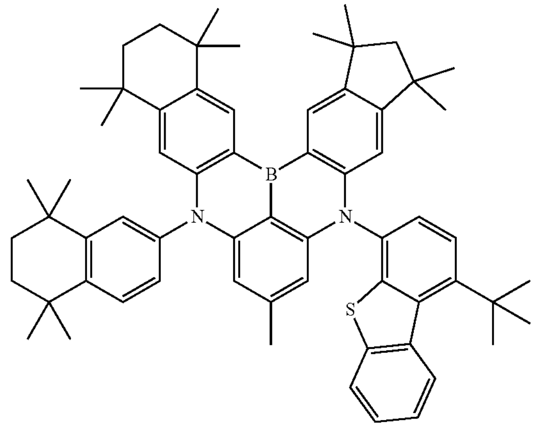
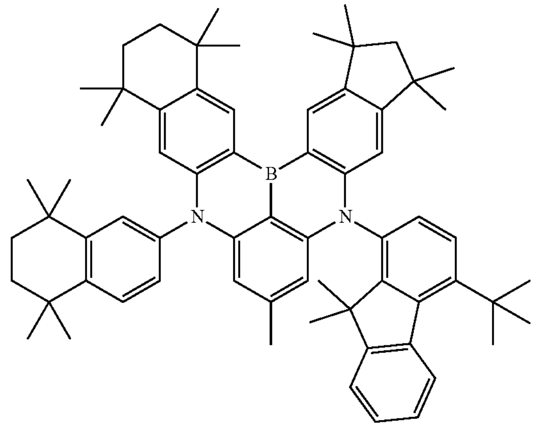
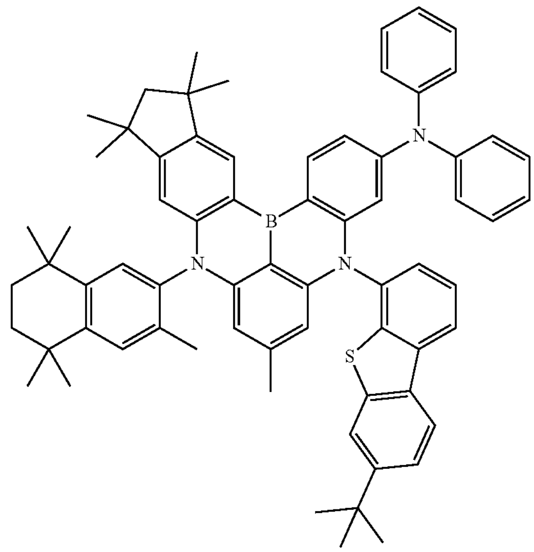
-continued
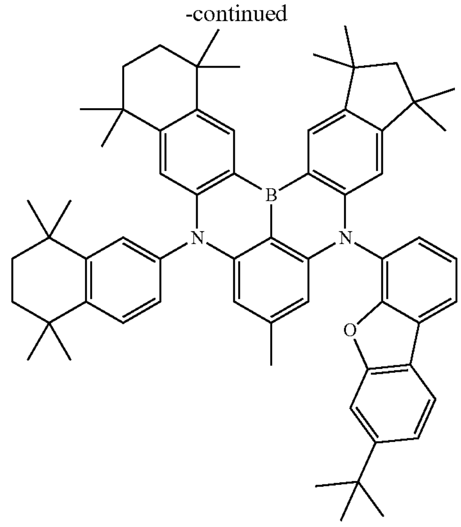
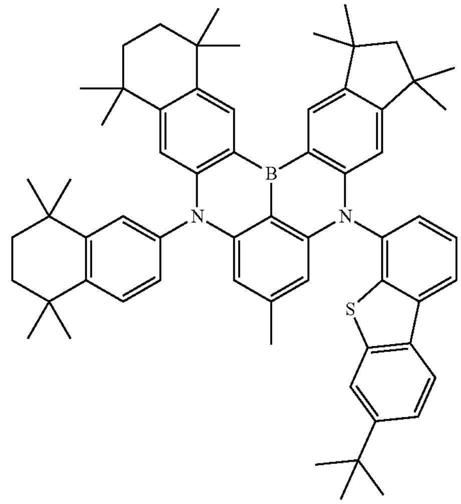
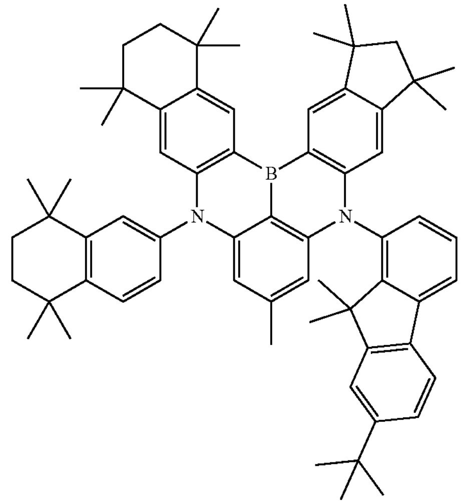

-continued
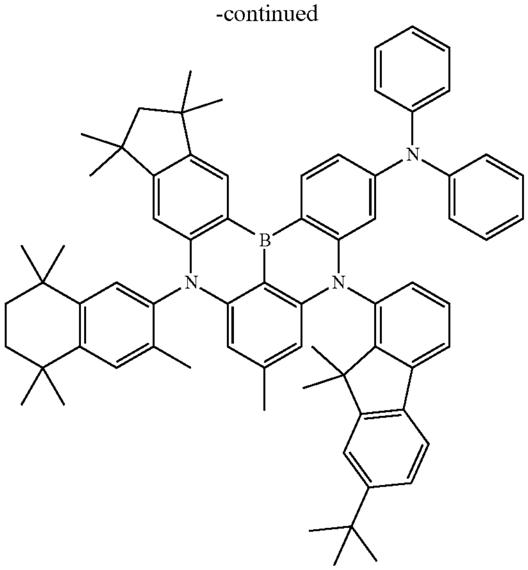
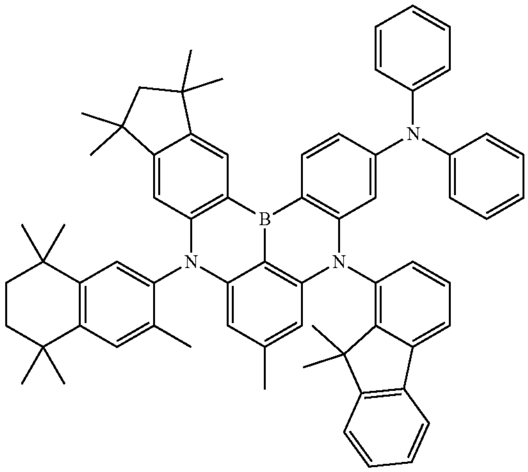
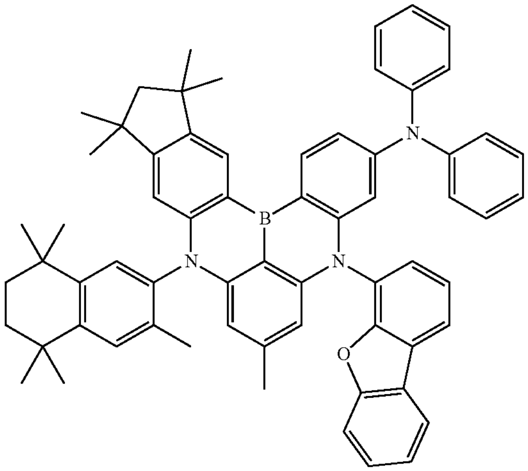
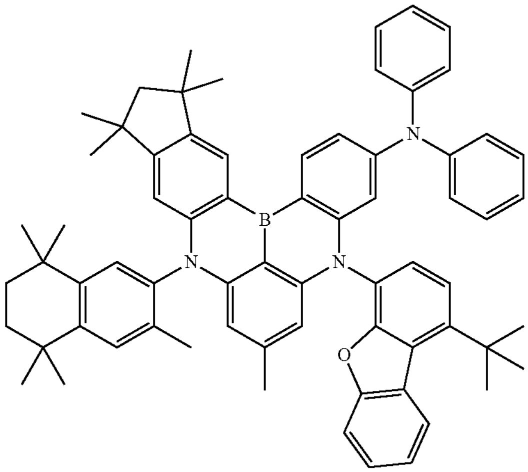
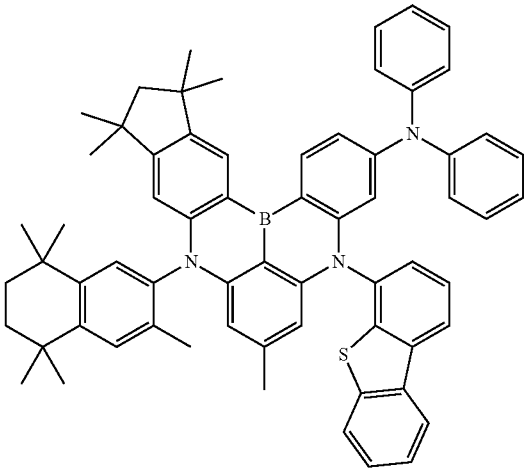
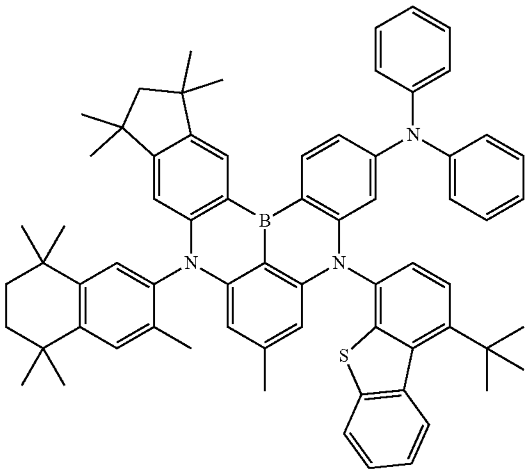
-continued -continued
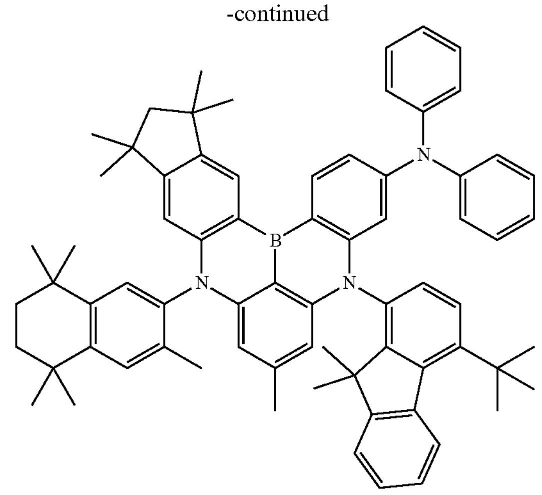
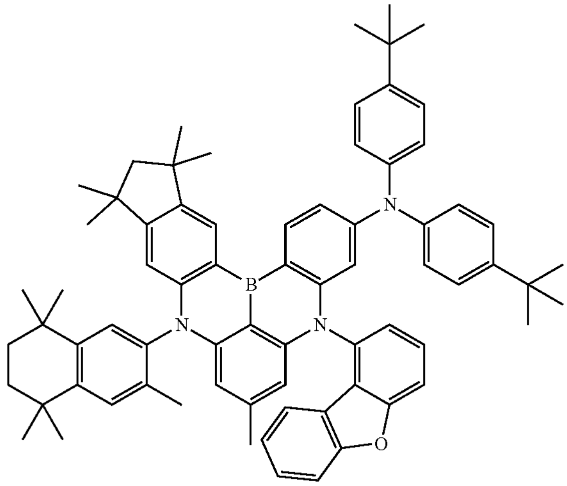
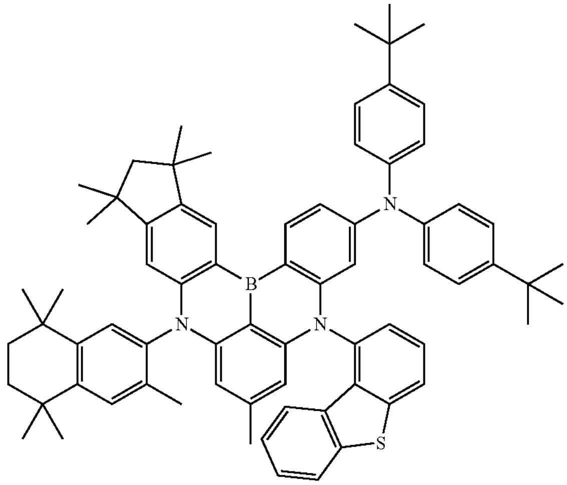
-continued
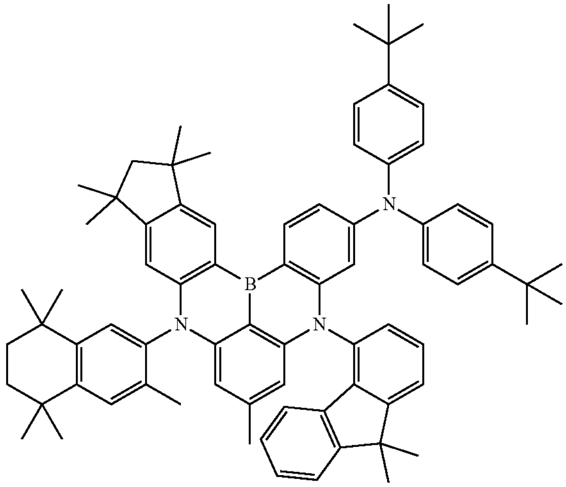
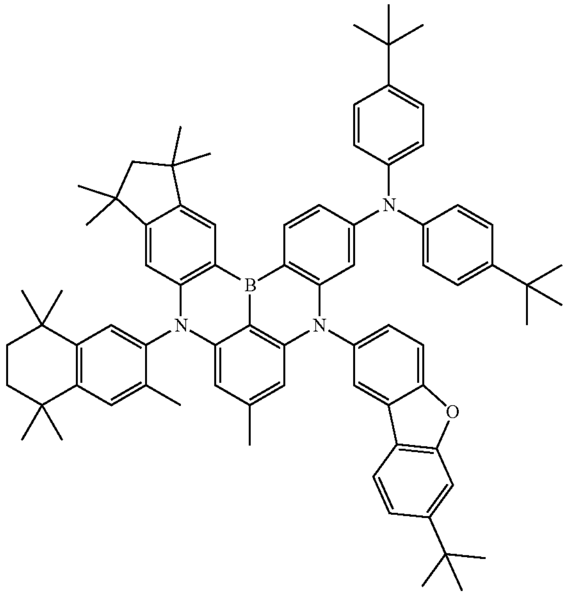
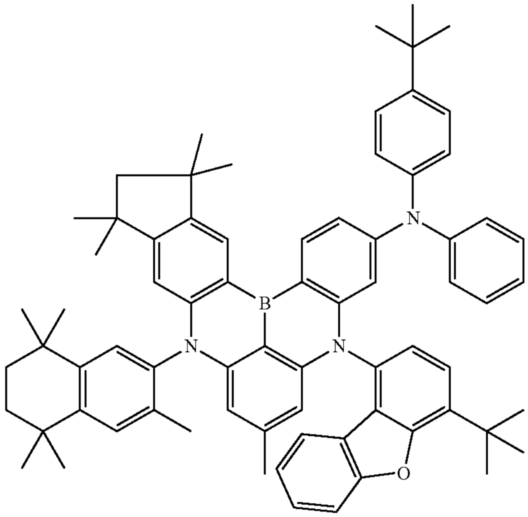

-continued
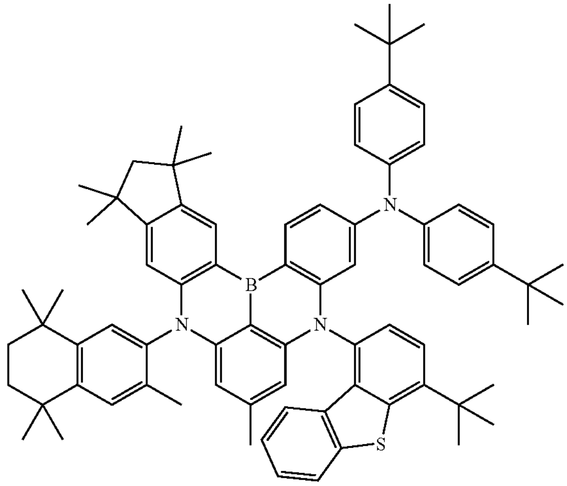
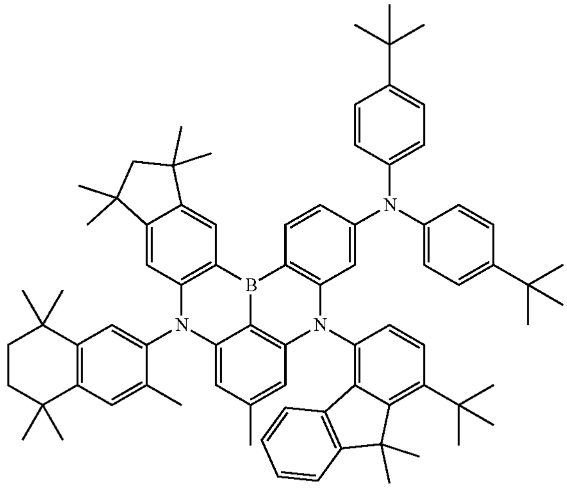
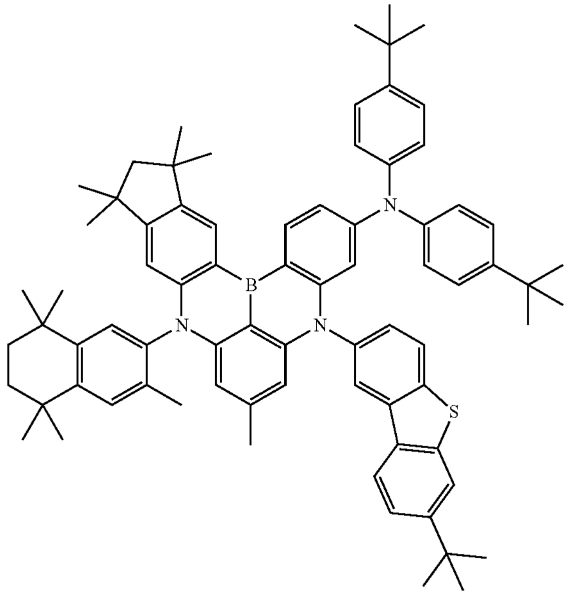
-continued
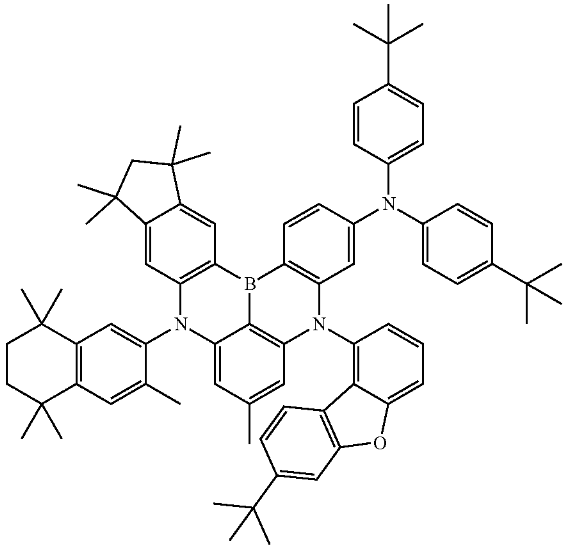
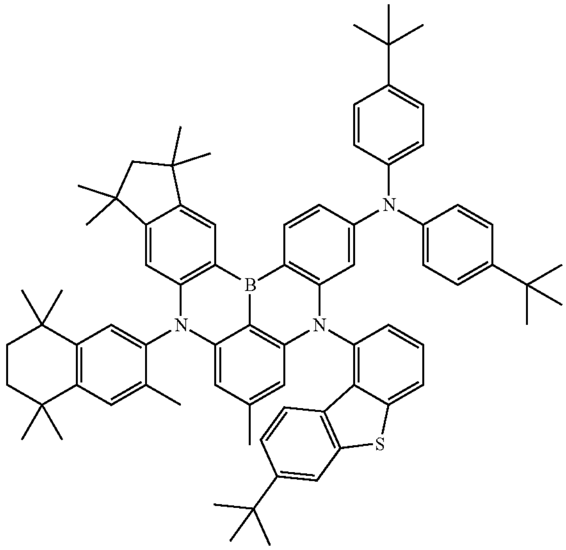
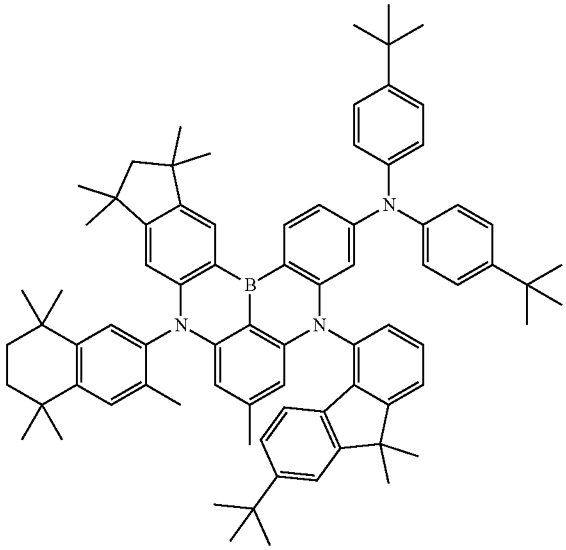

-continued
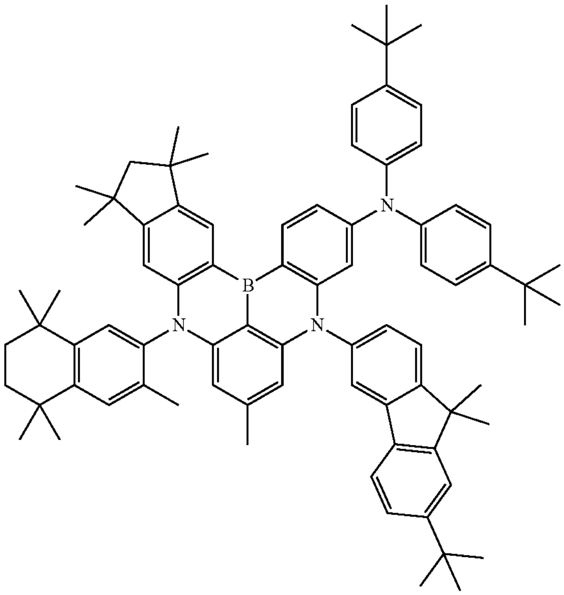
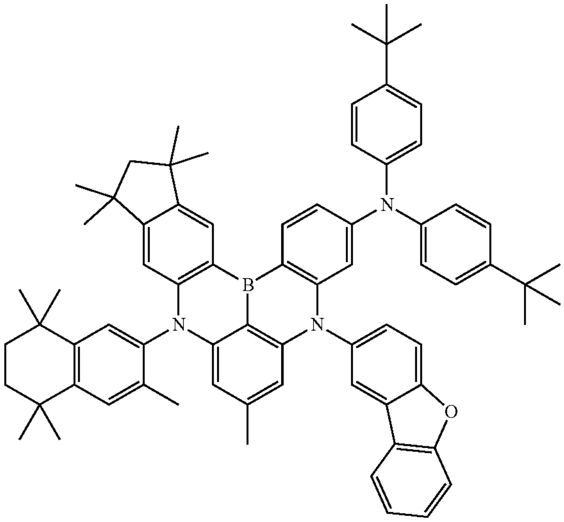
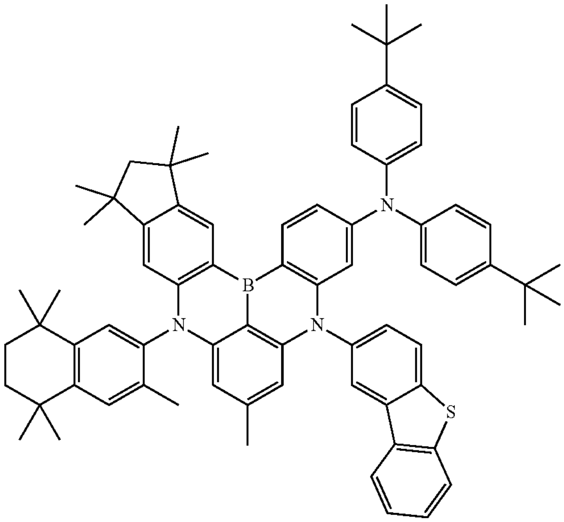
-continued
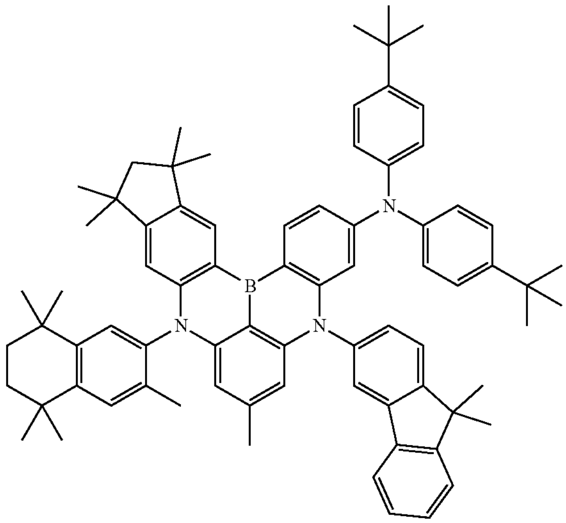
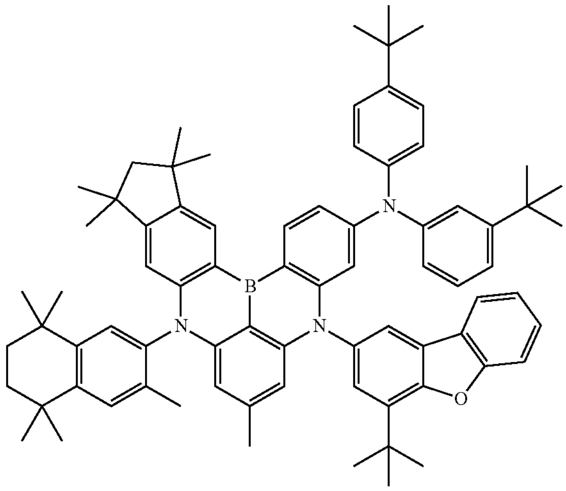
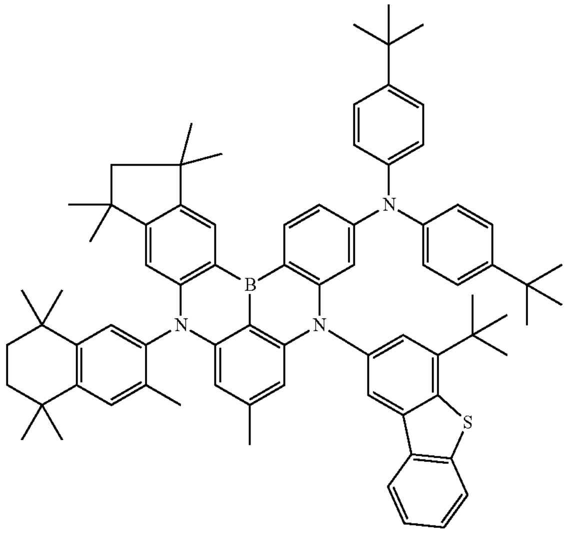

-continued
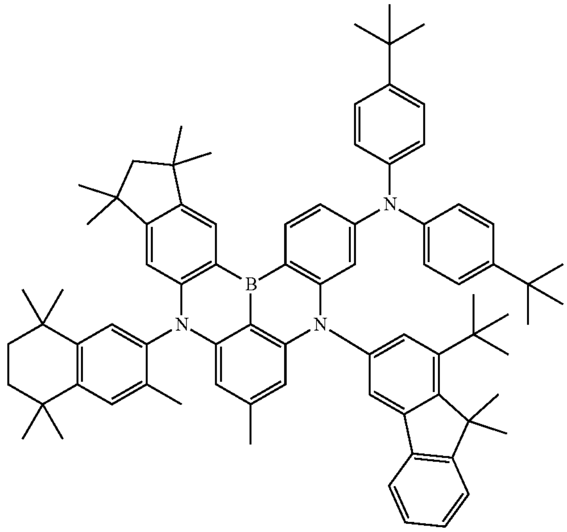
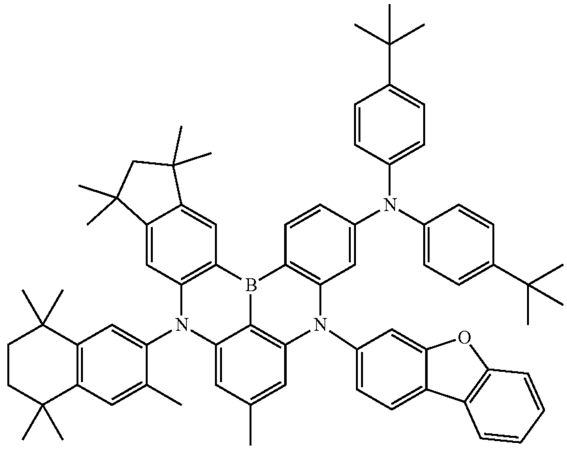
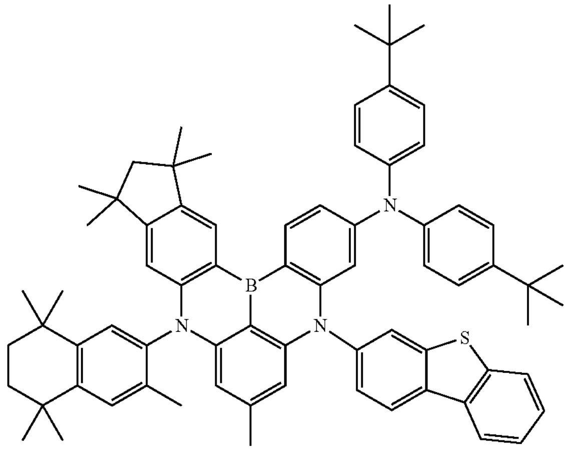
-continued
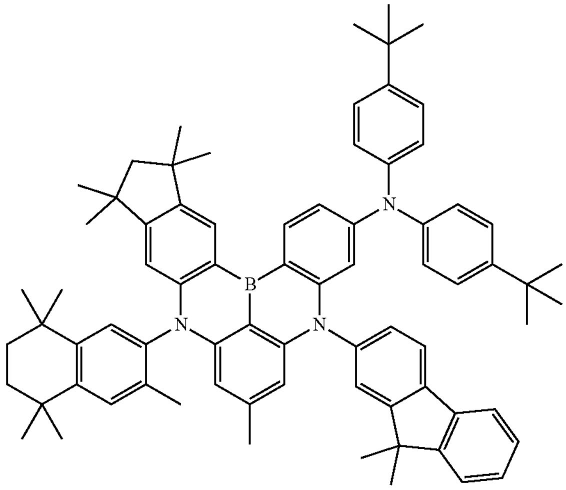
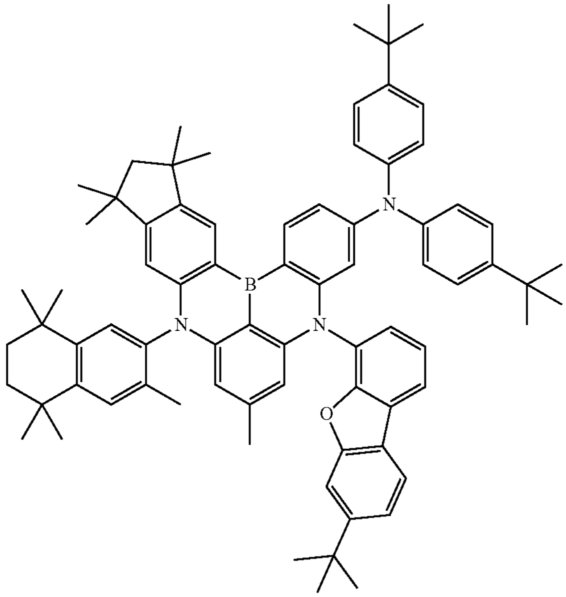
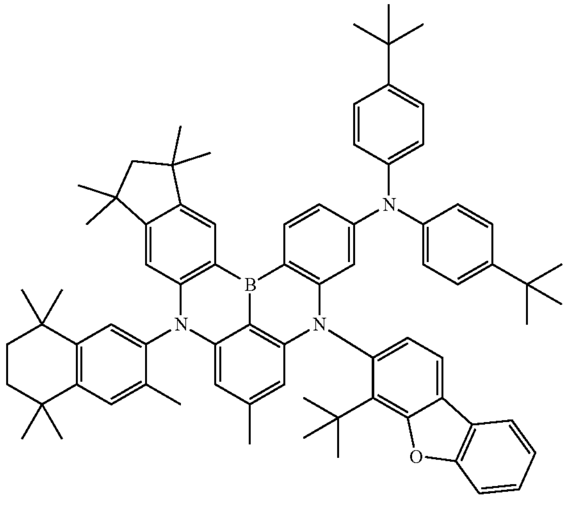

-continued
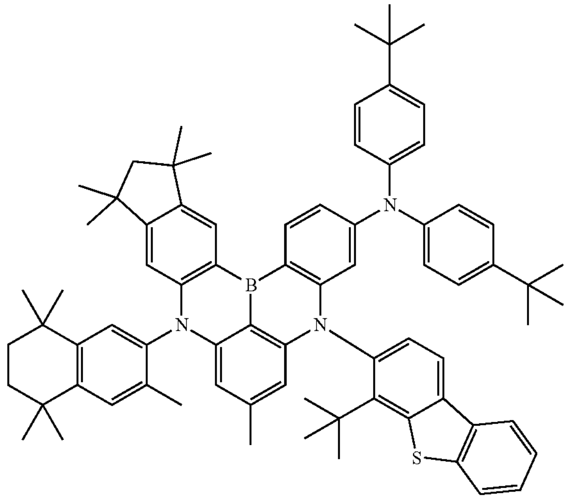
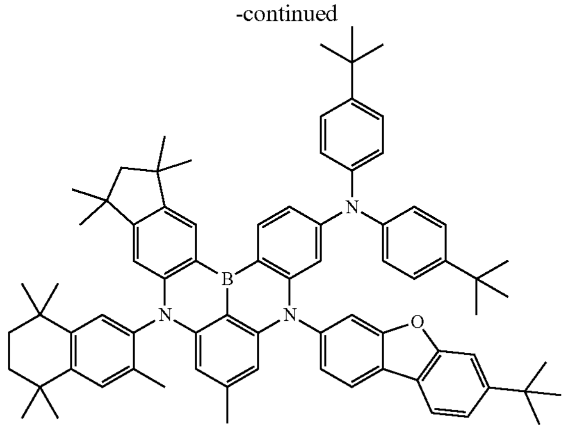
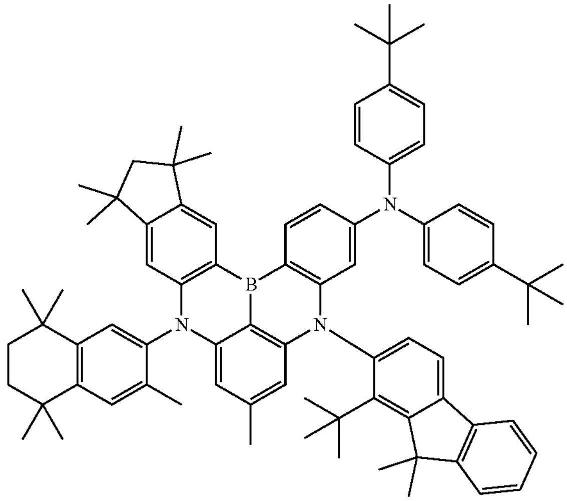
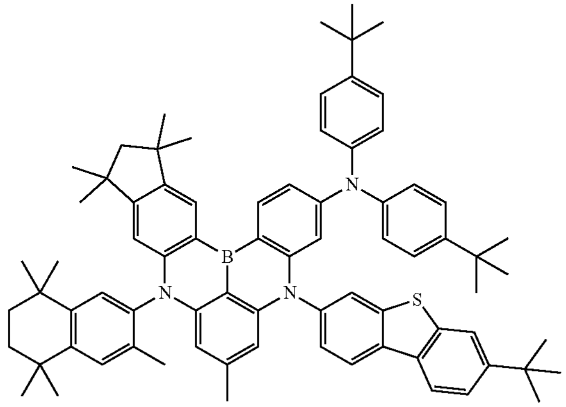
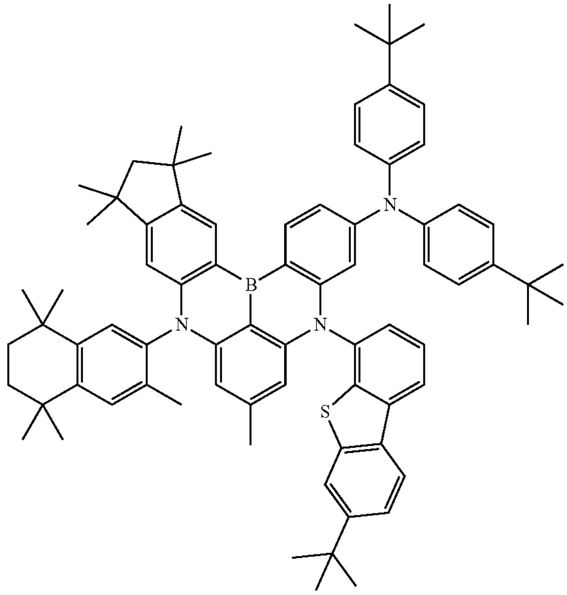
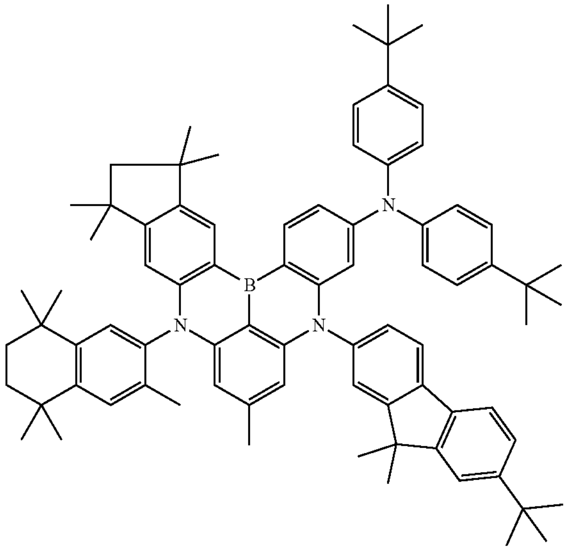

-continued
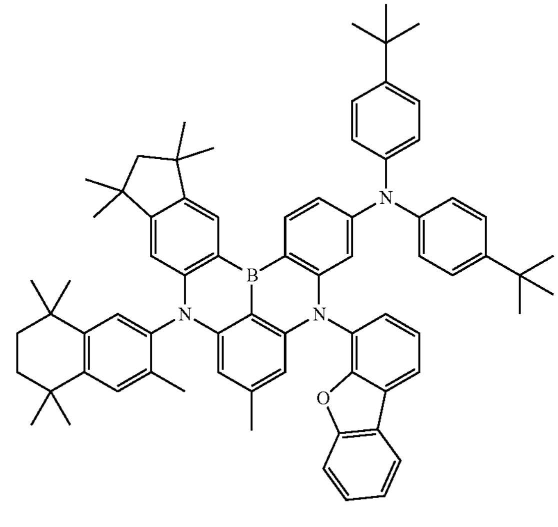
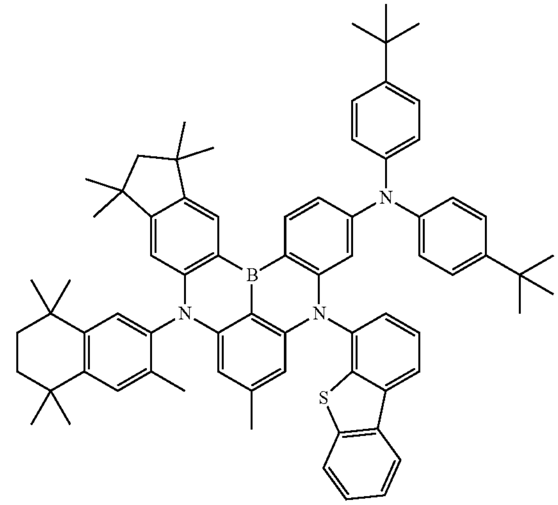
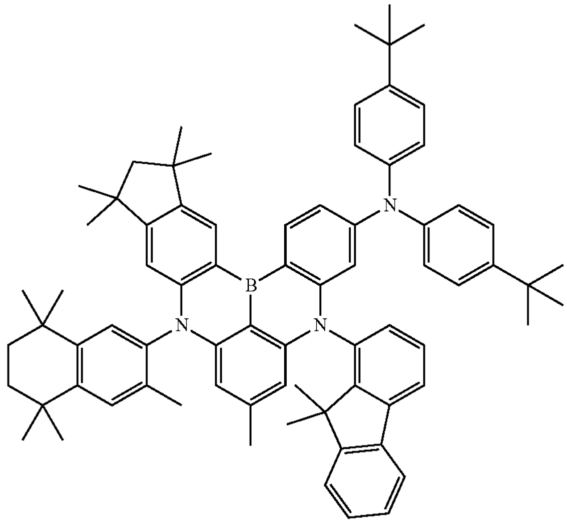
-continued
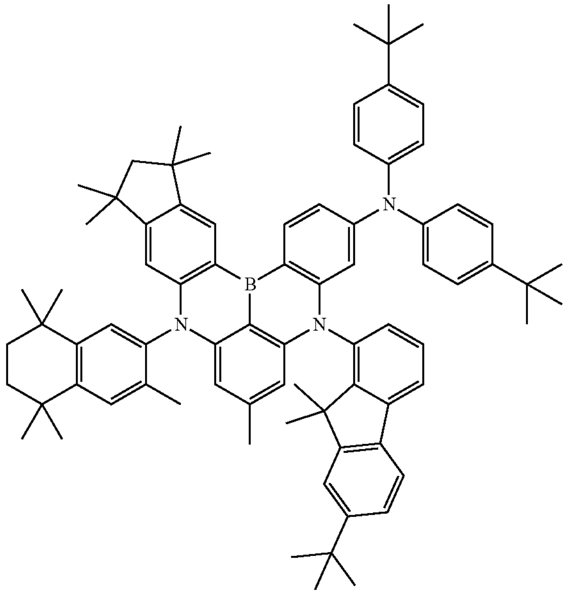
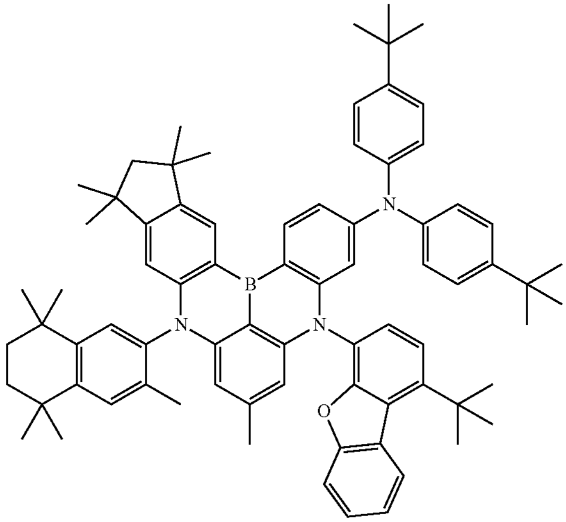
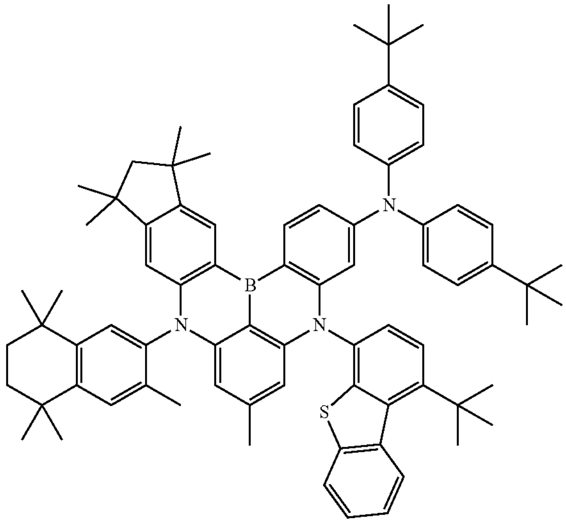

-continued
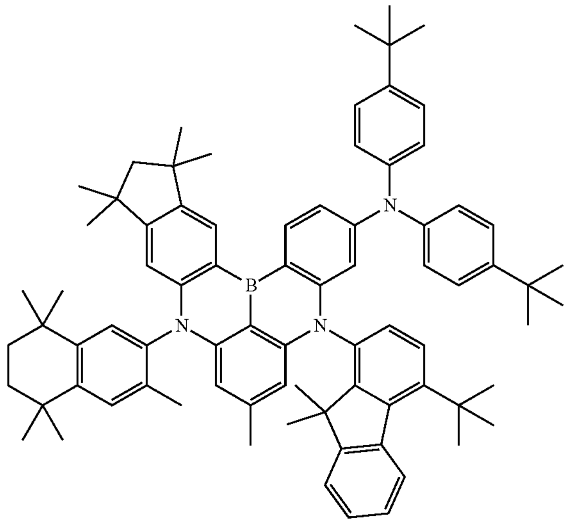
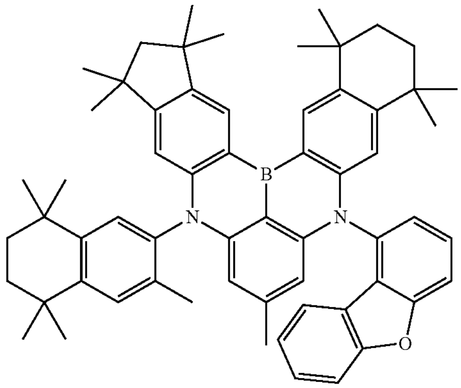
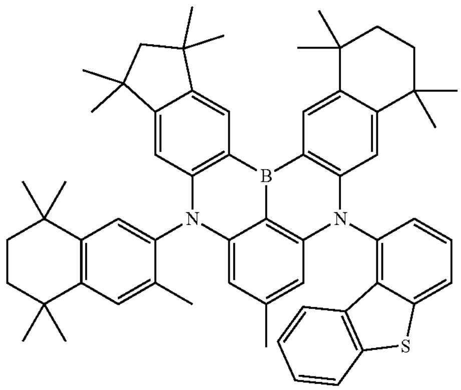
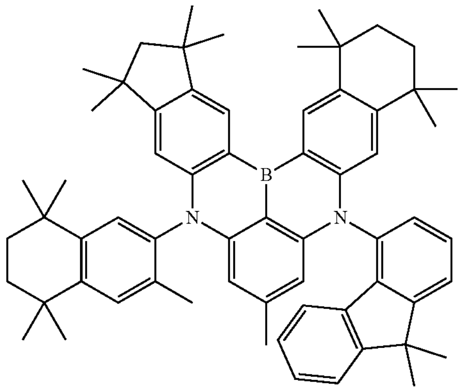
-continued
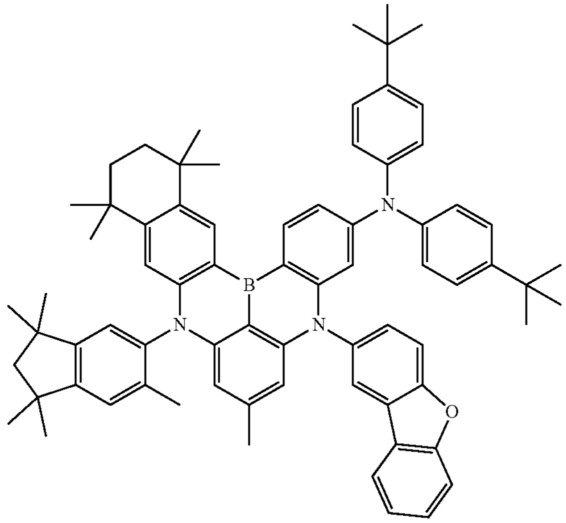
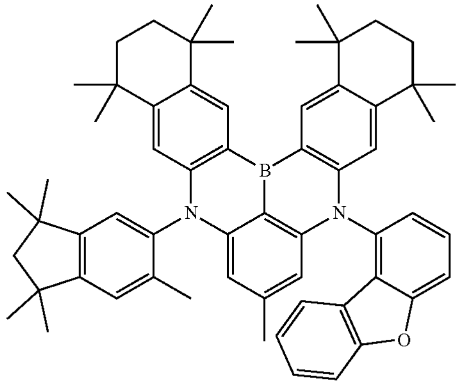
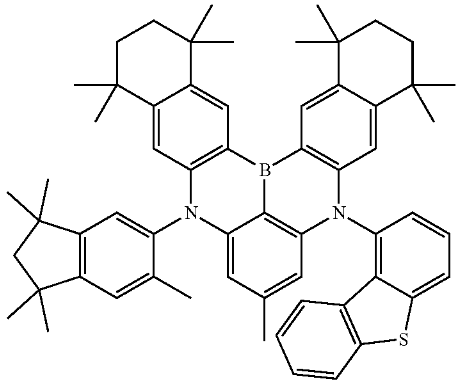
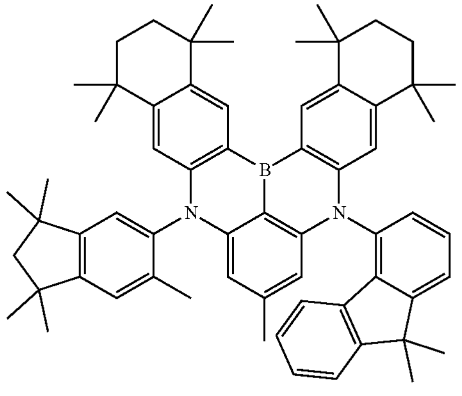

-continued
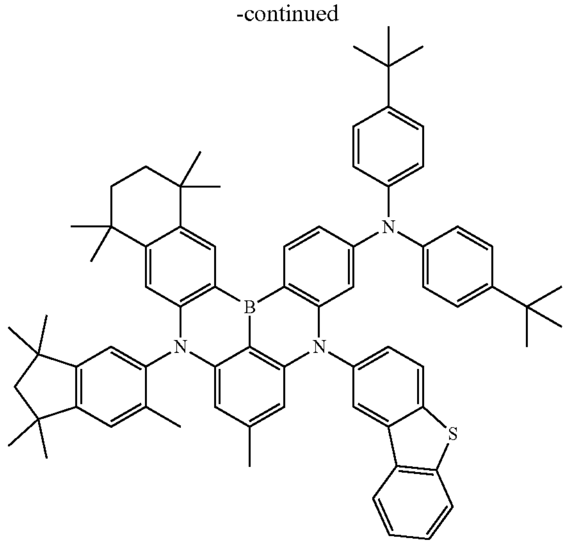
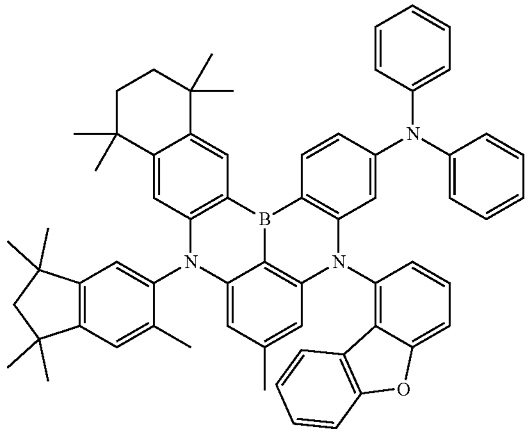
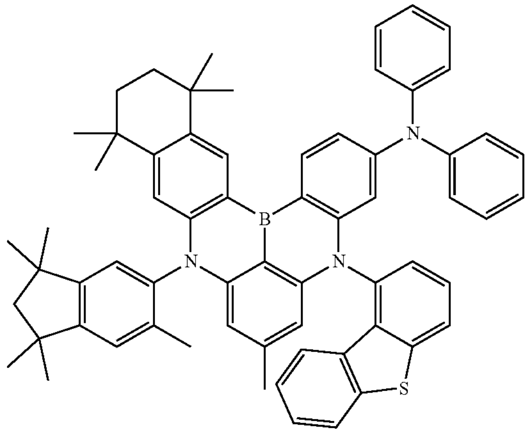
-continued
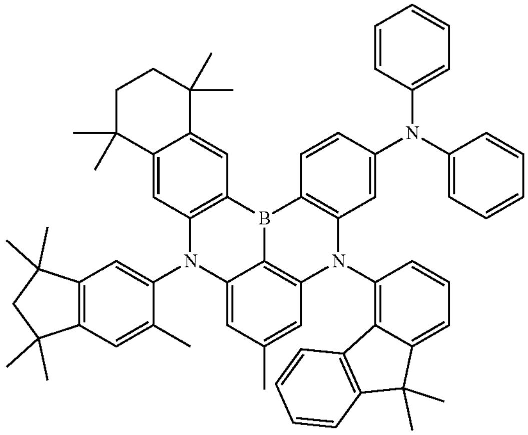
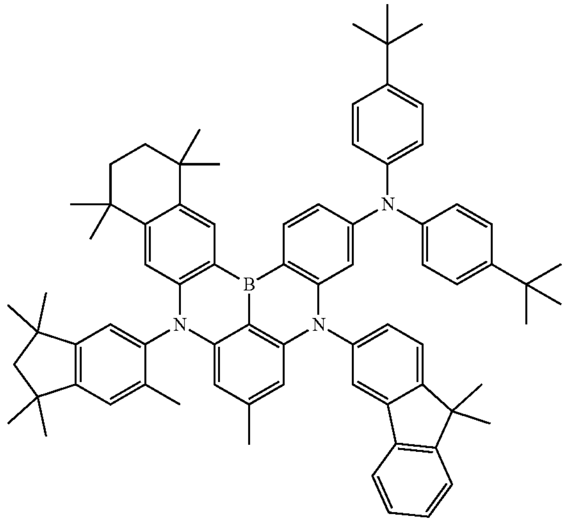
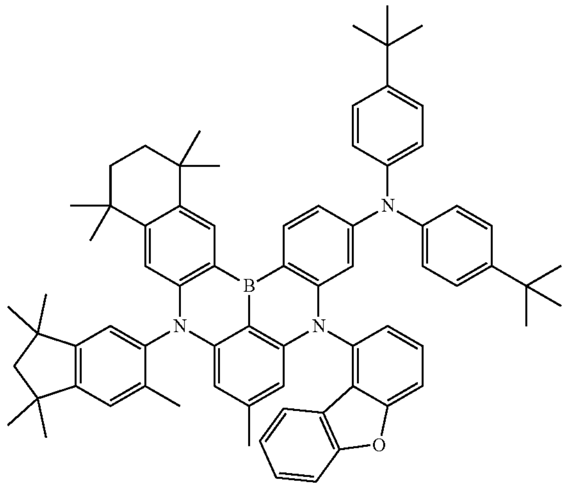

-continued
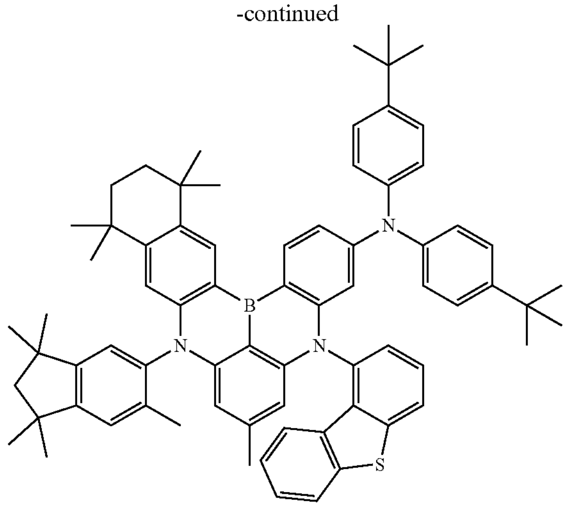
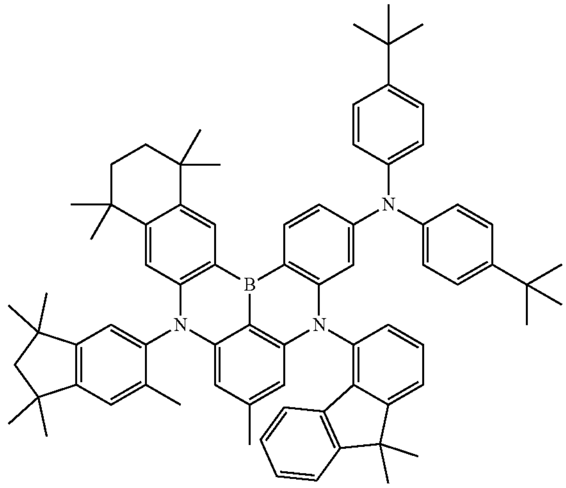
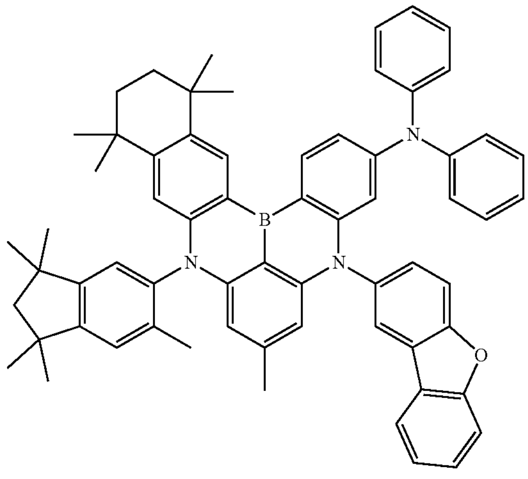
-continued
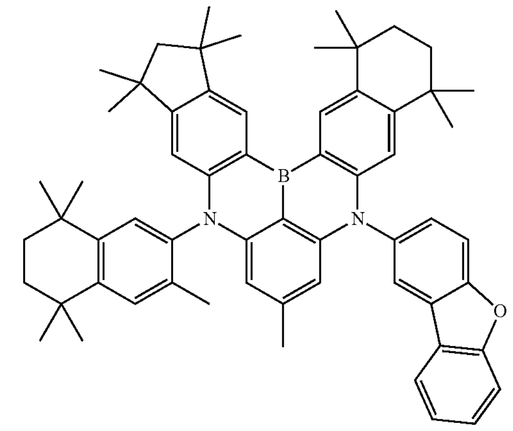
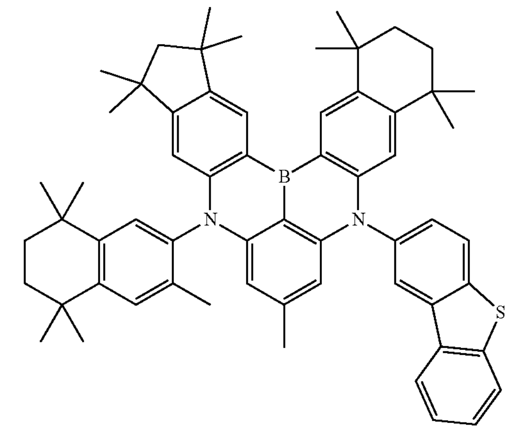
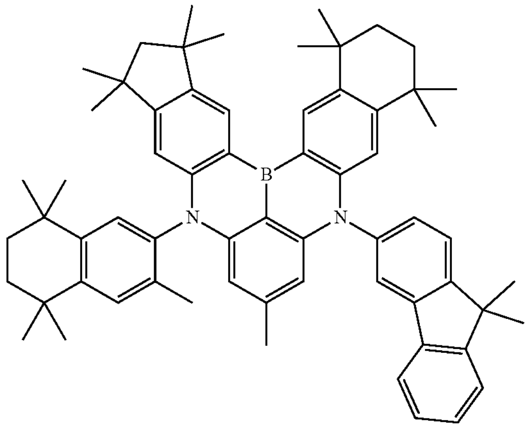

-continued
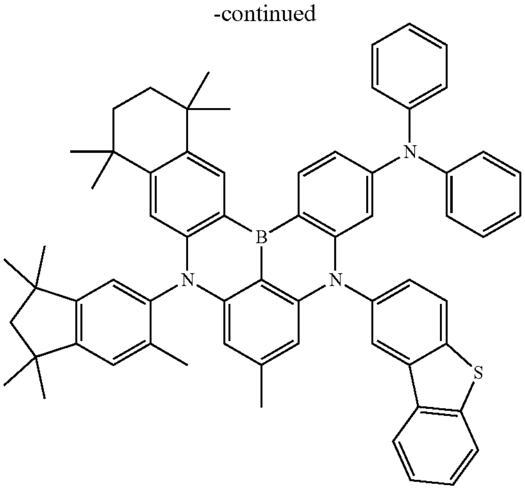
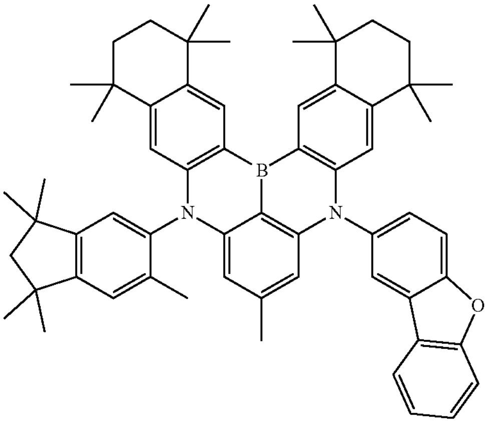
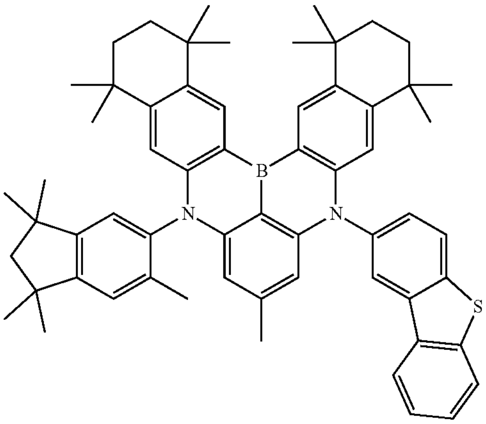
-continued
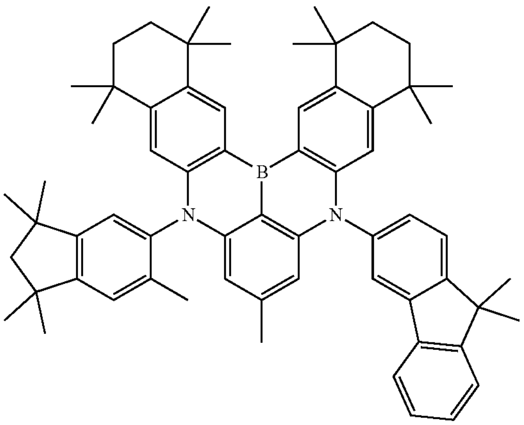
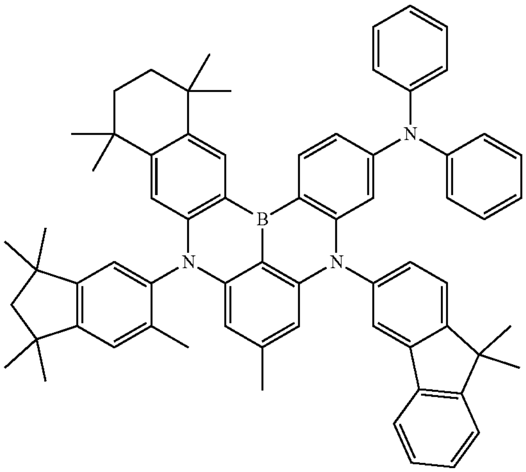
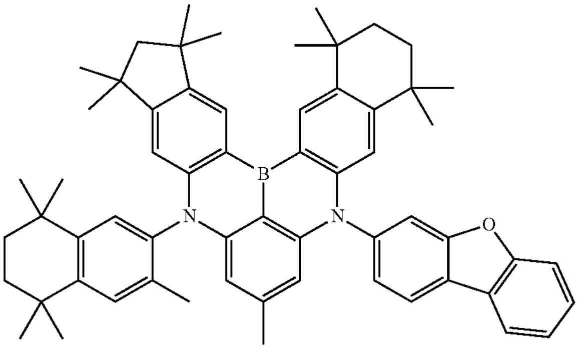
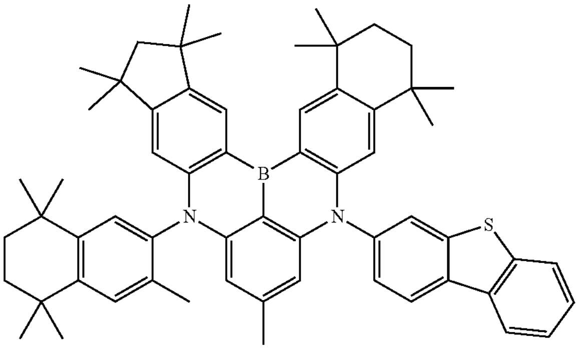

-continued
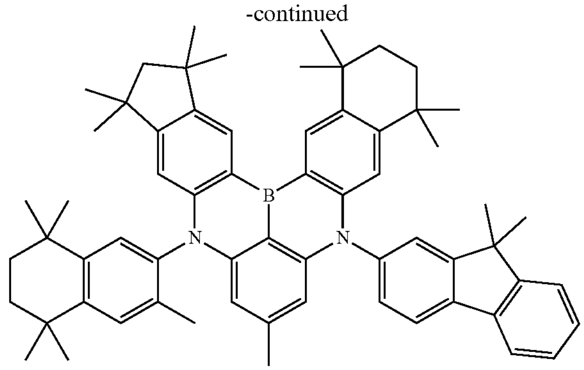
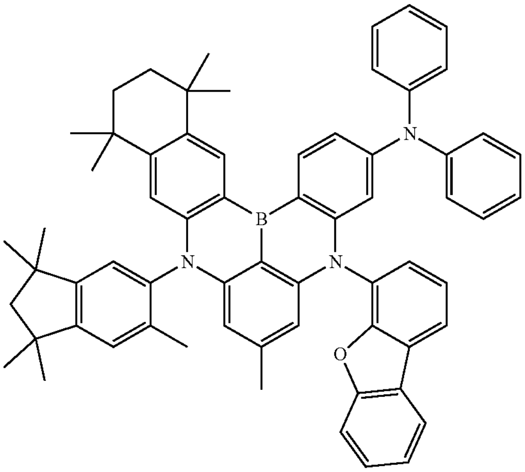
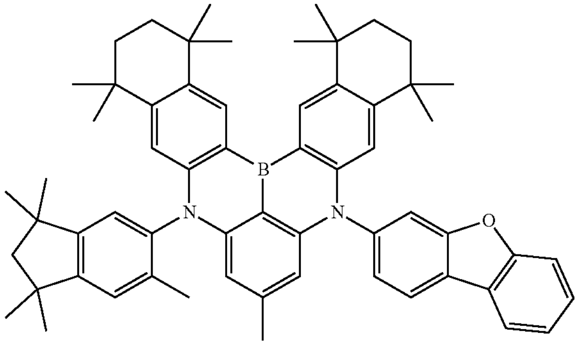
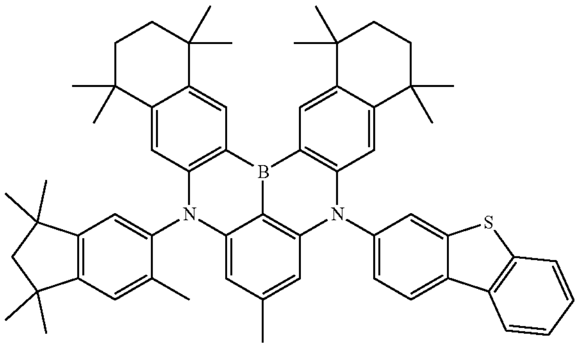
-continued
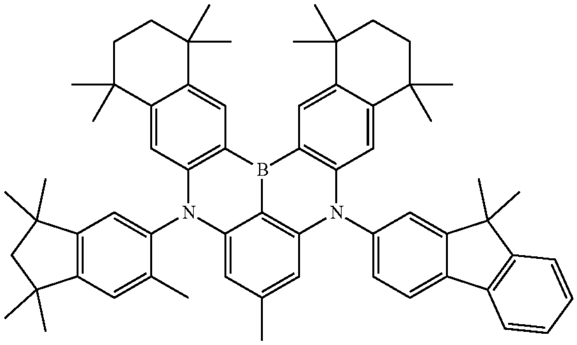
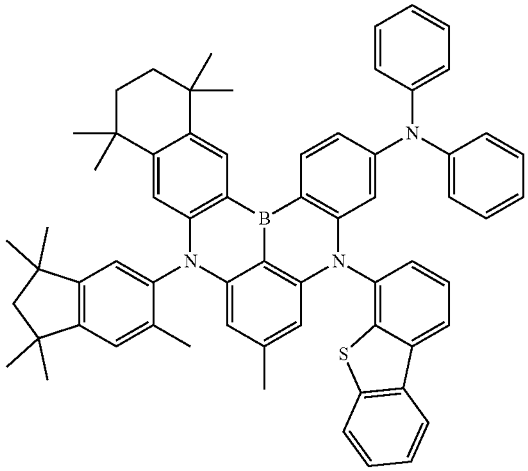
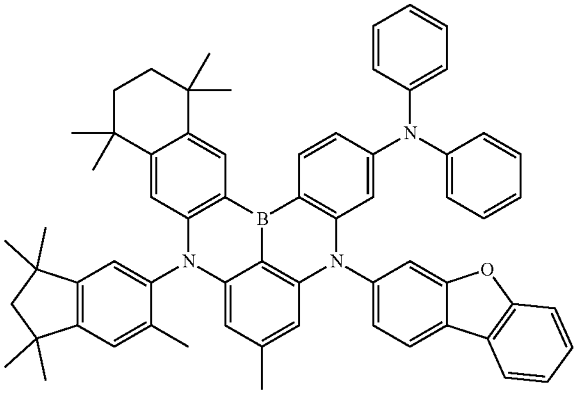
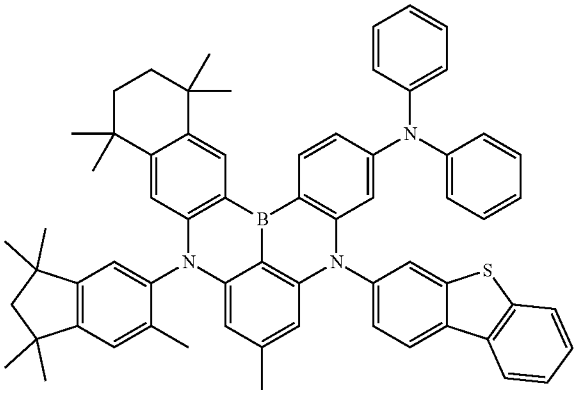

-continued
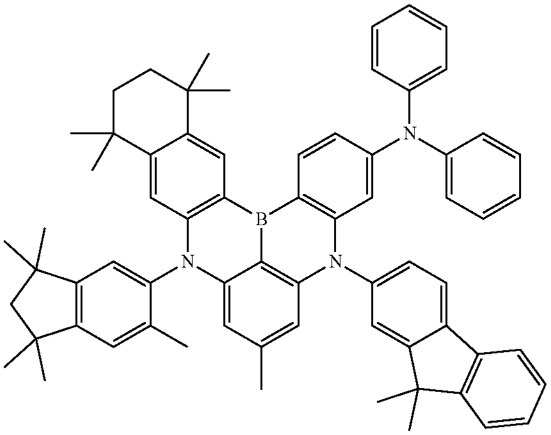
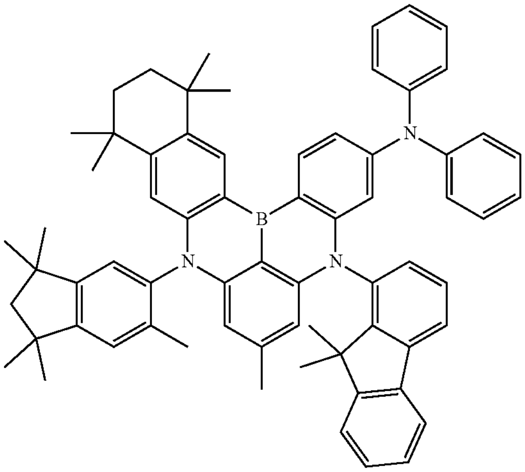
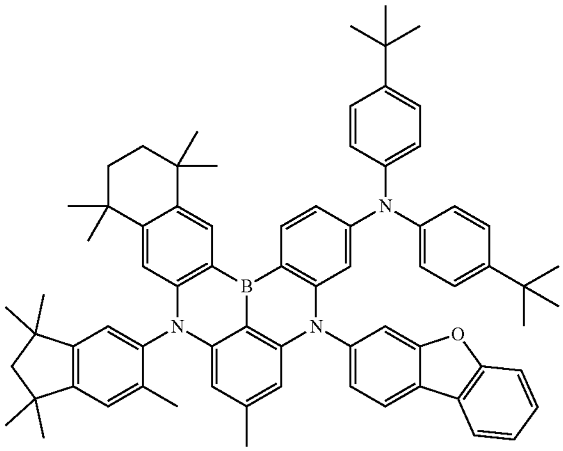
-continued
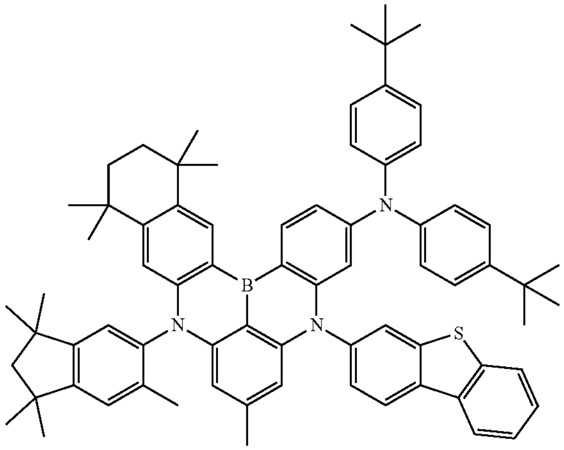
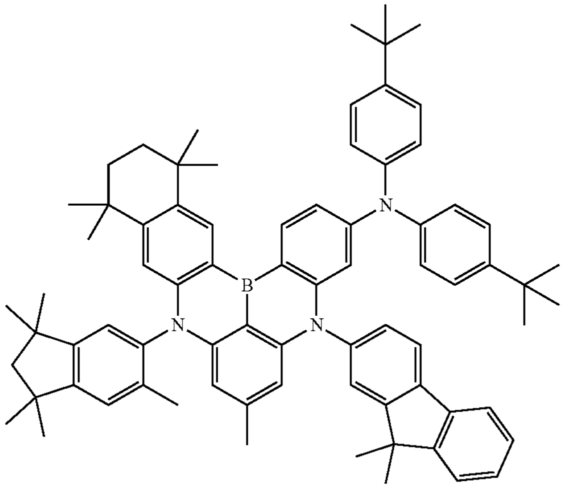
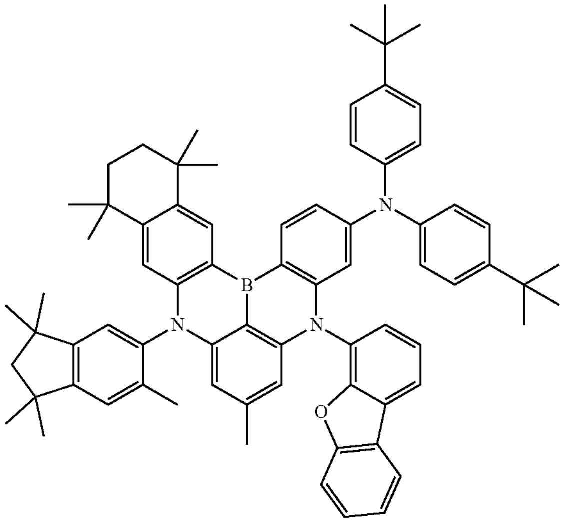

-continued
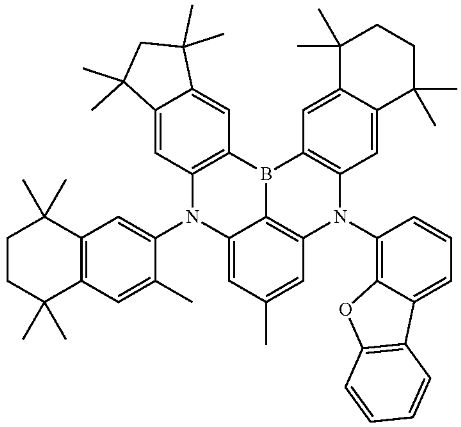
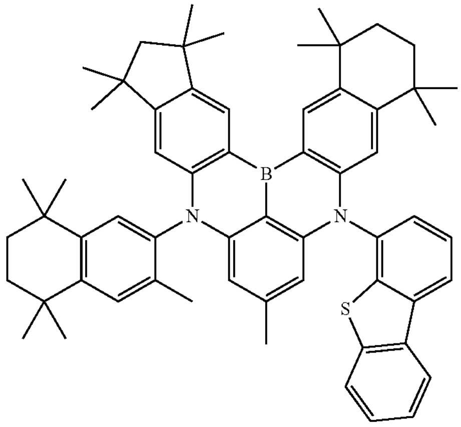
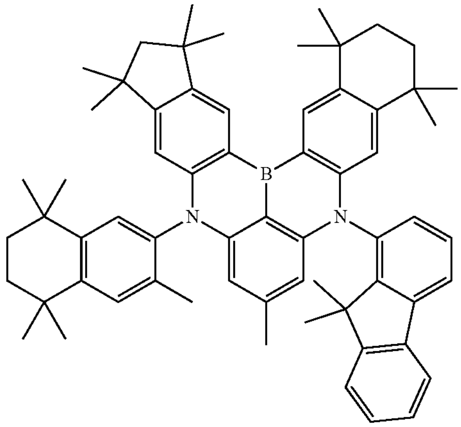
-continued
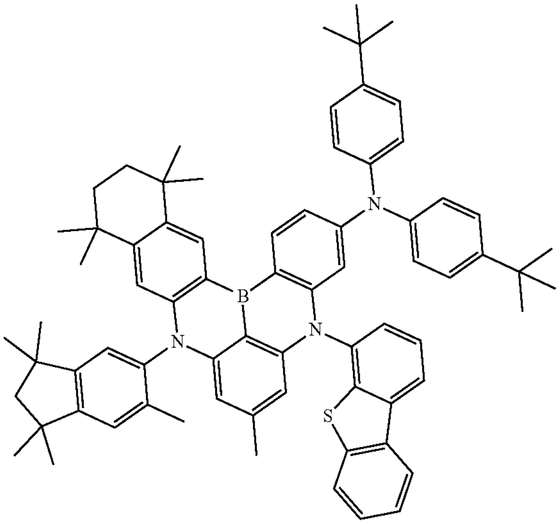
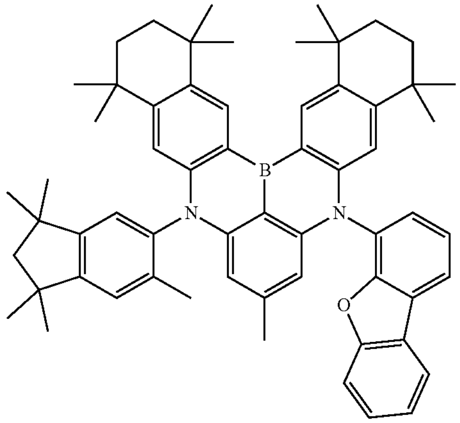
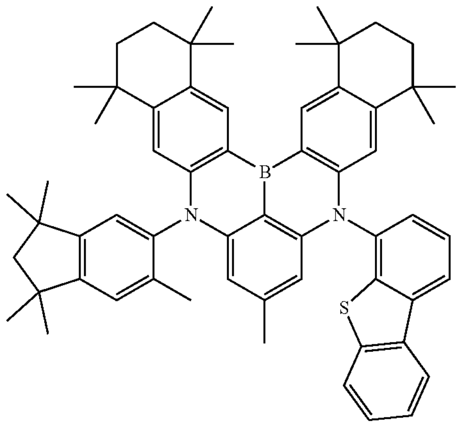

-continued
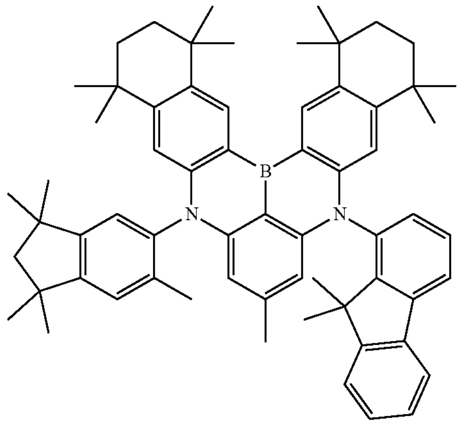
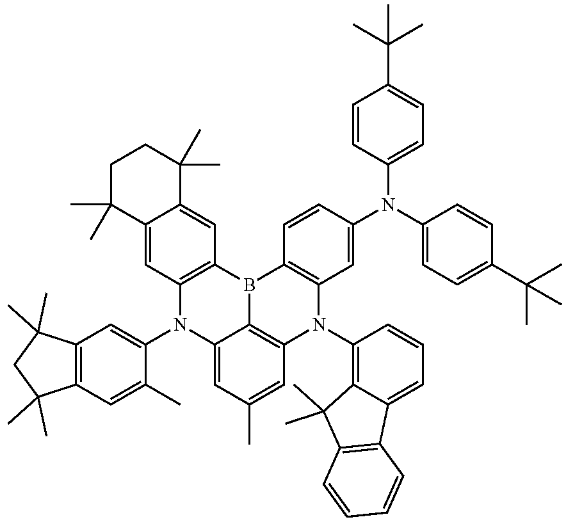
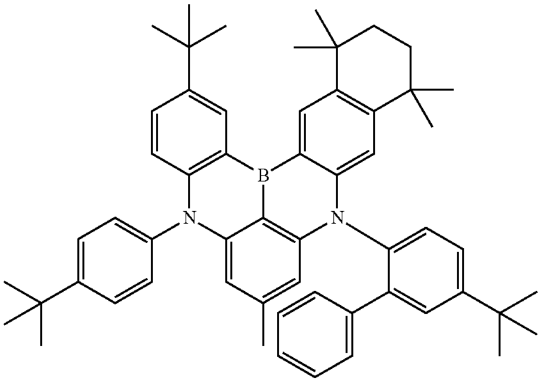
-continued
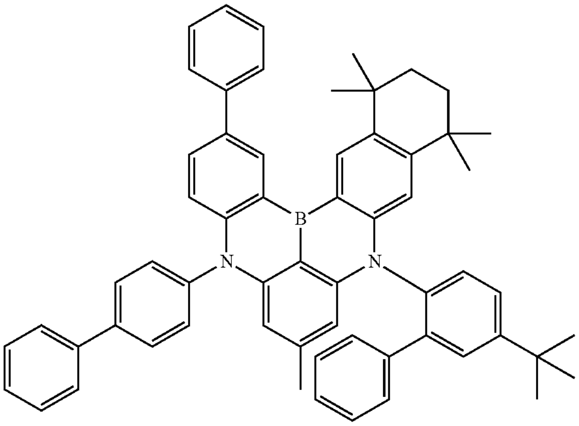
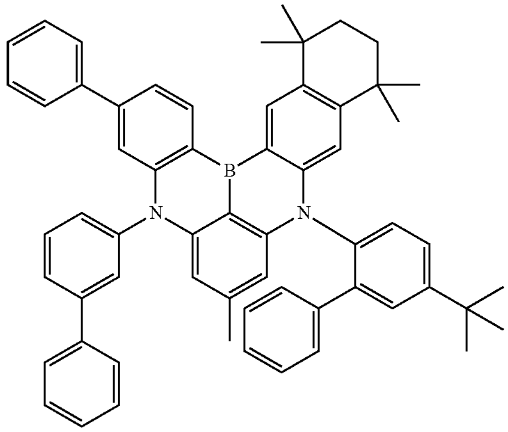
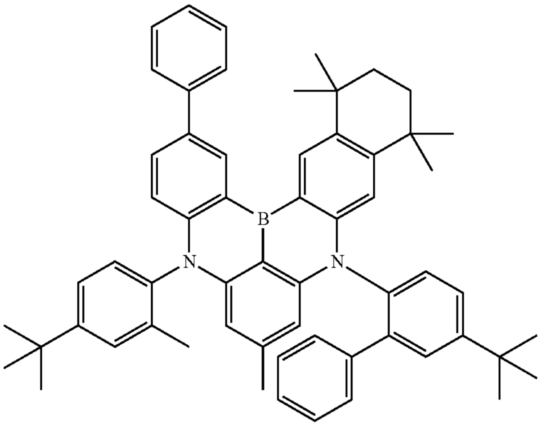
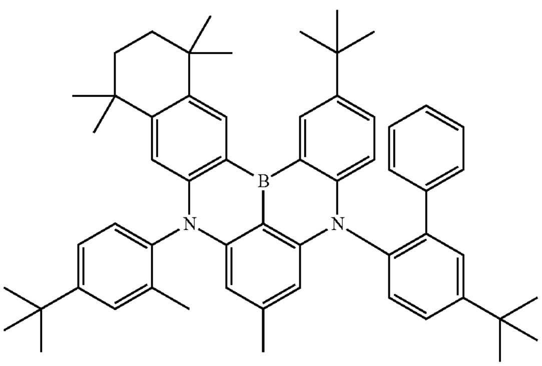

-continued
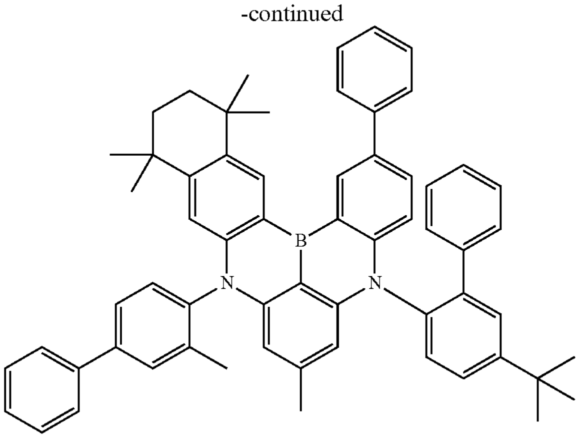
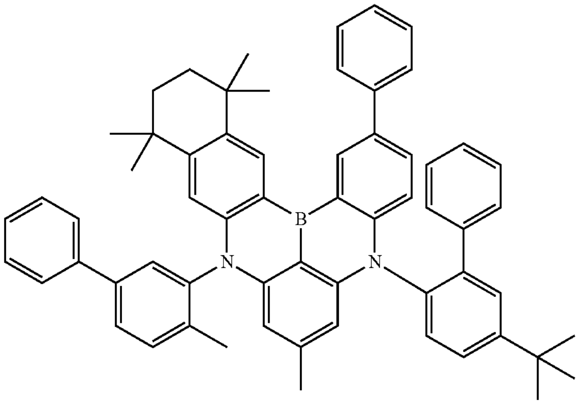
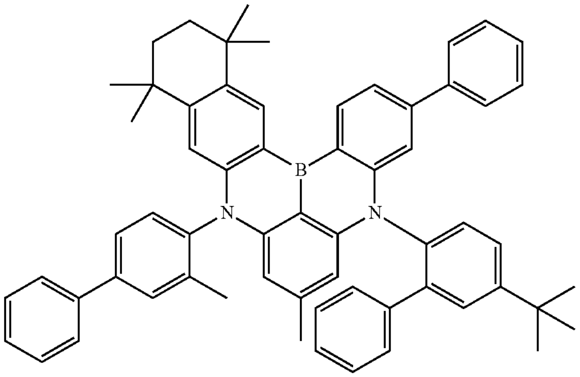
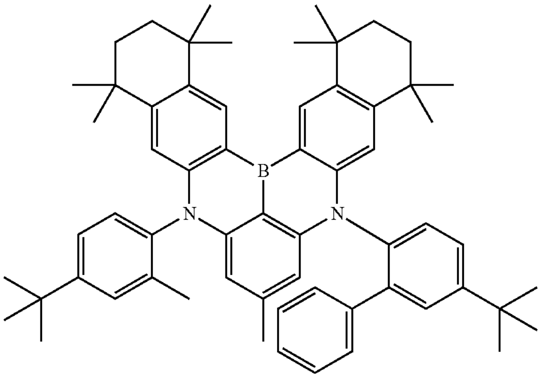
-continued
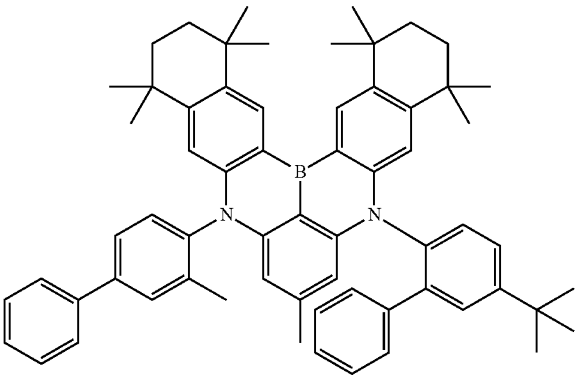
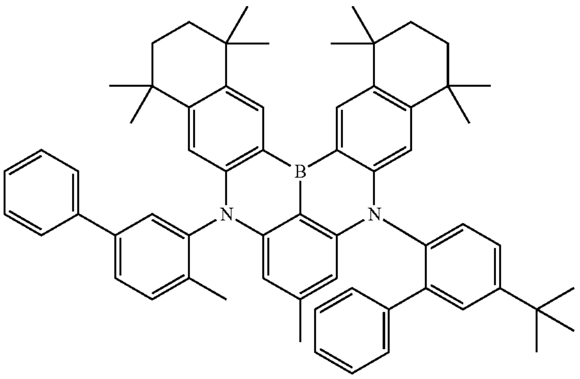
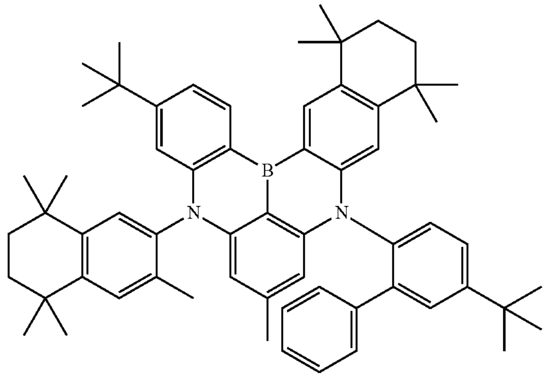
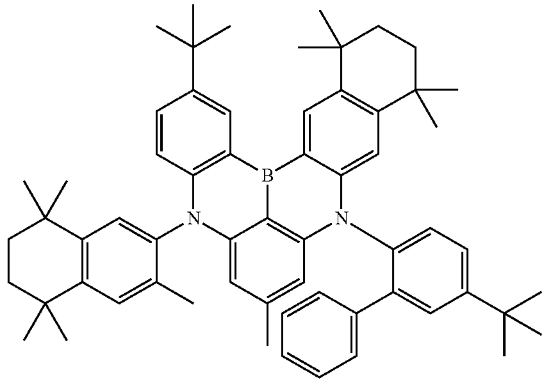

-continued
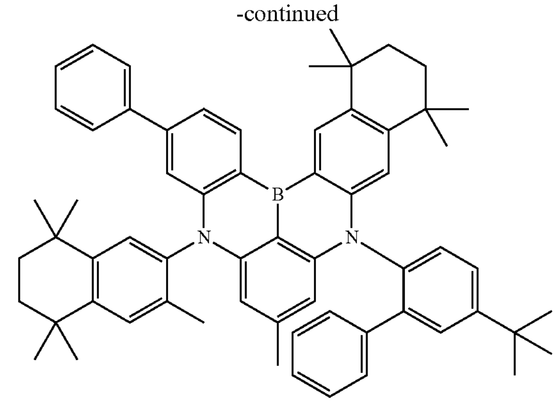
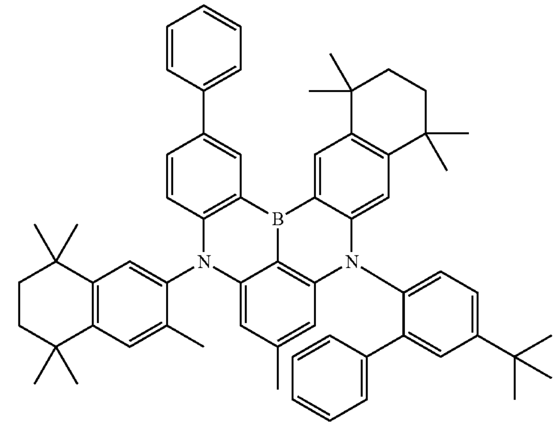
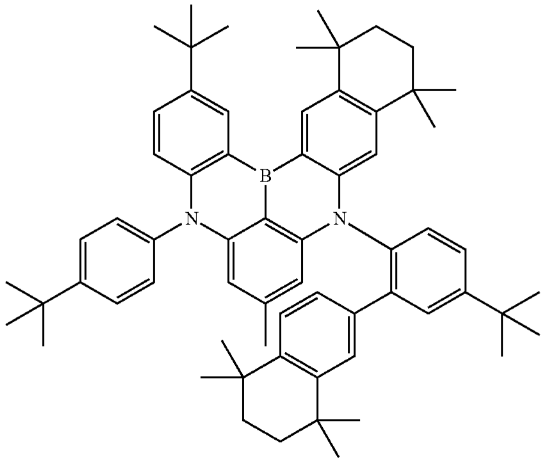
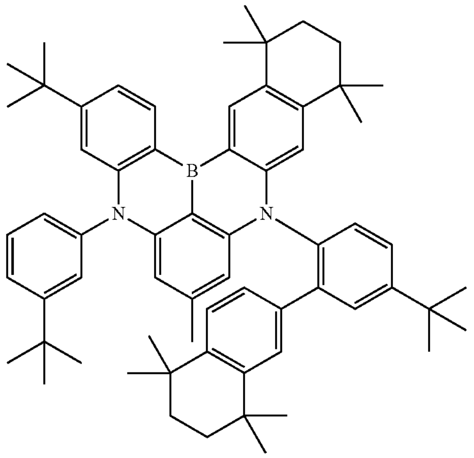
-continued
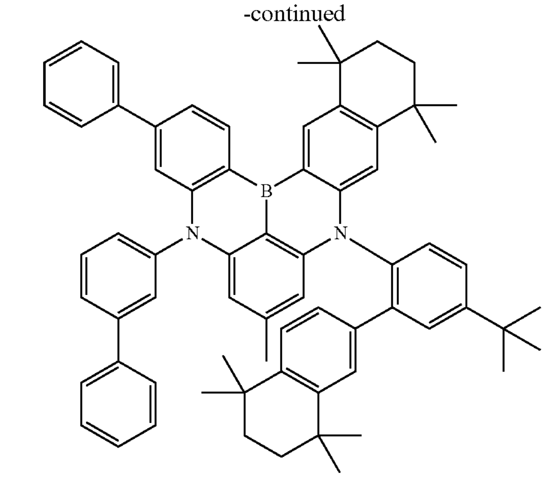
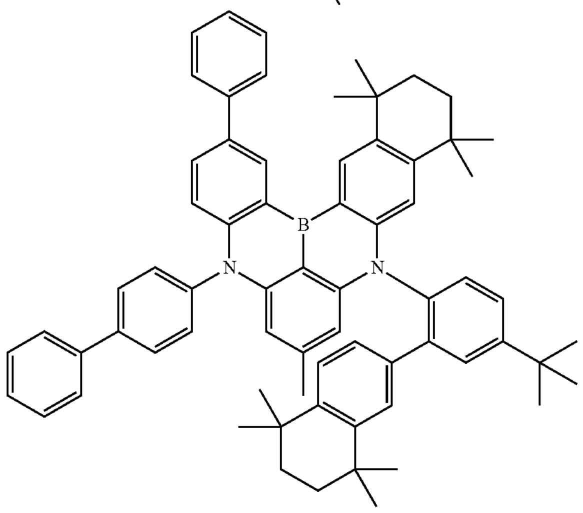
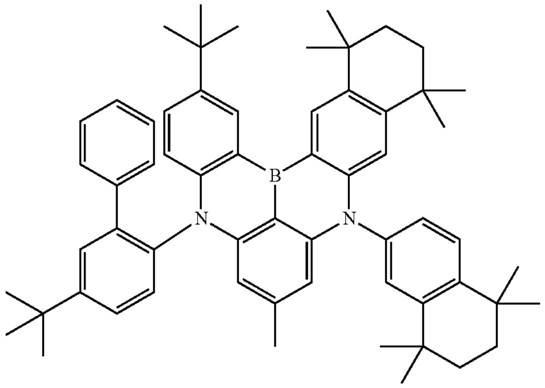
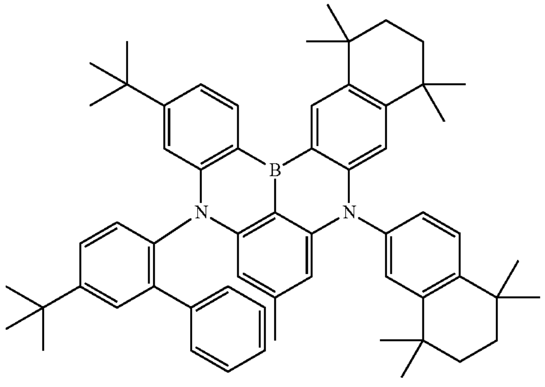

-continued
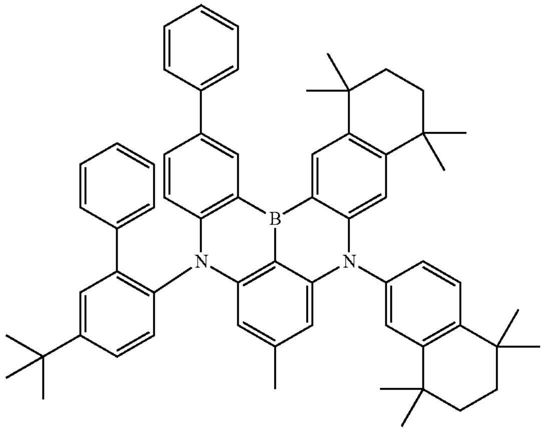
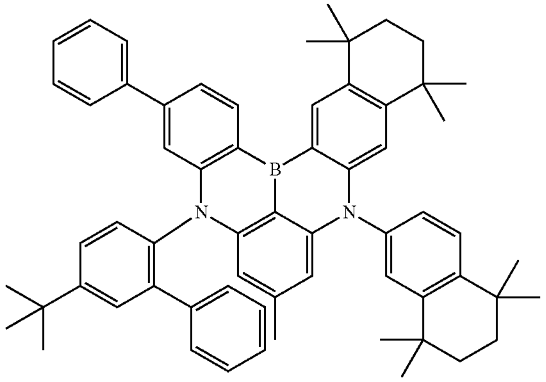
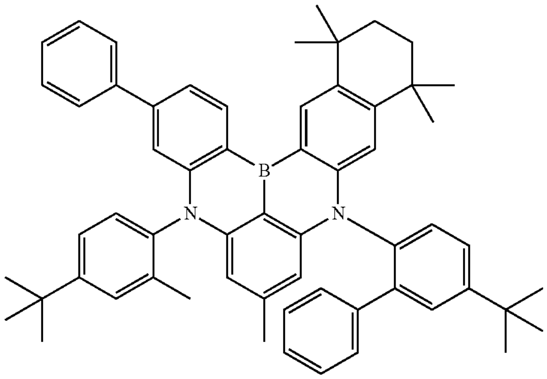
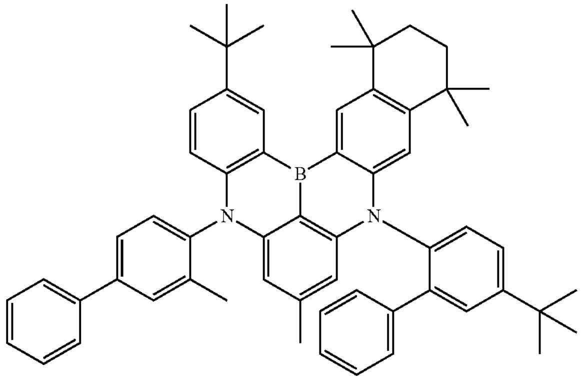
-continued
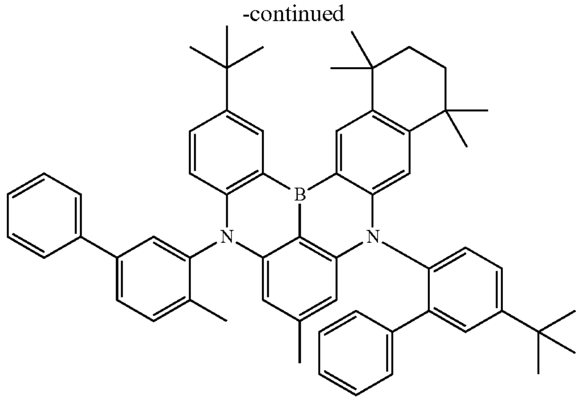
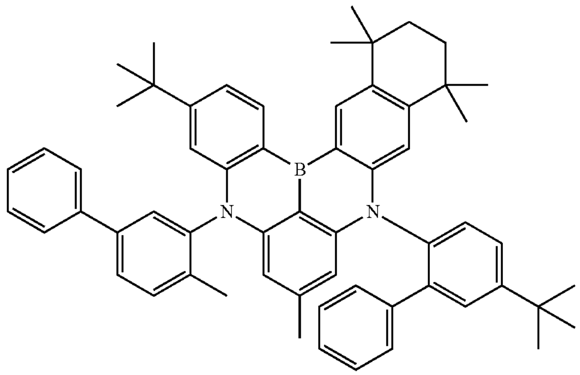
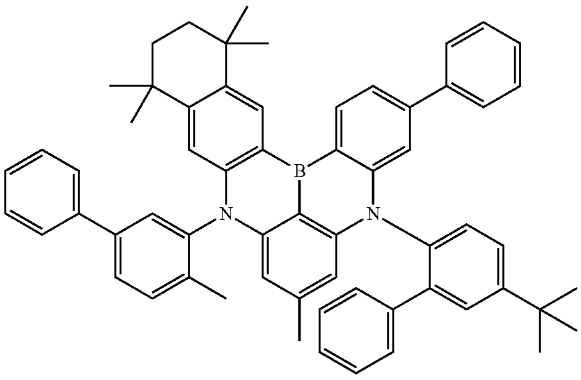
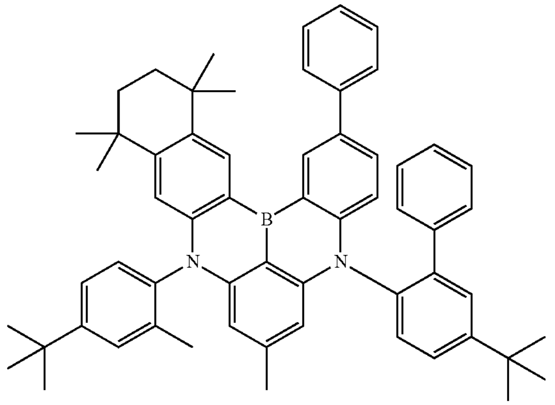

-continued
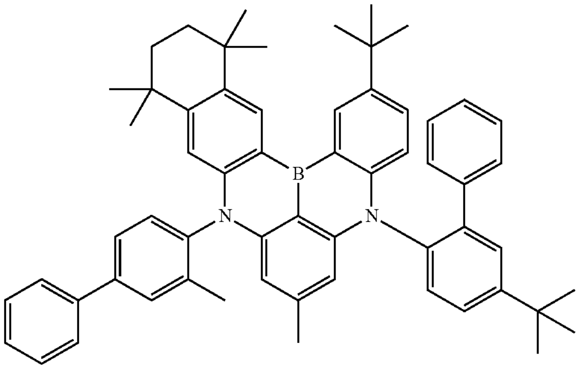
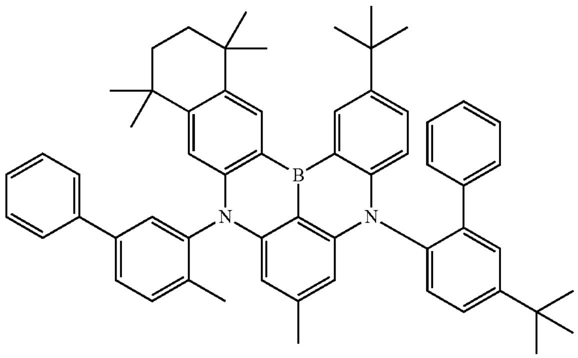
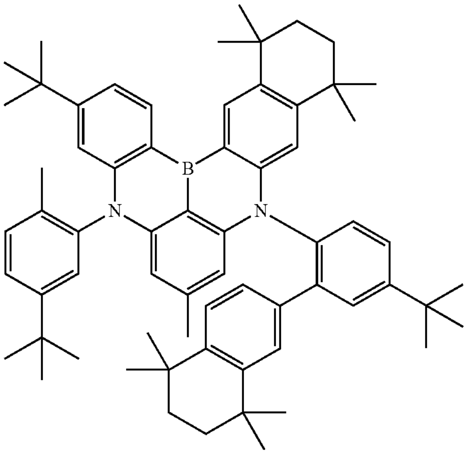
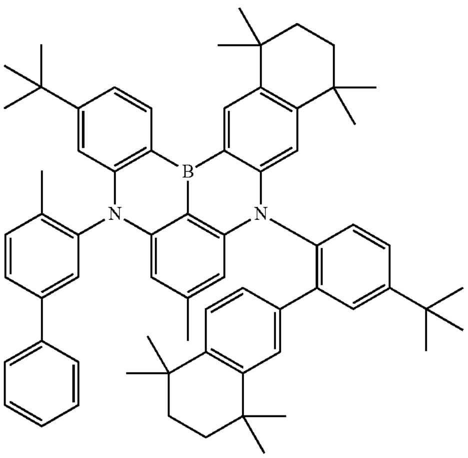
-continued
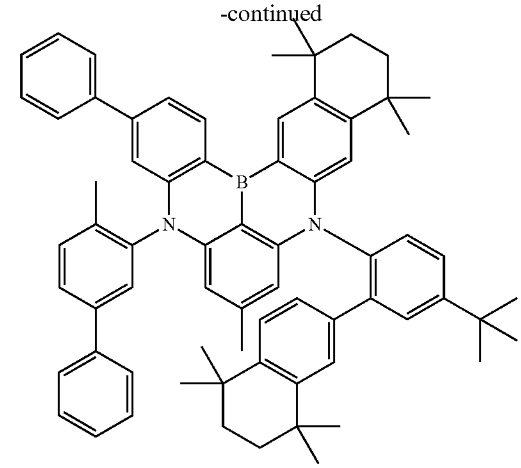
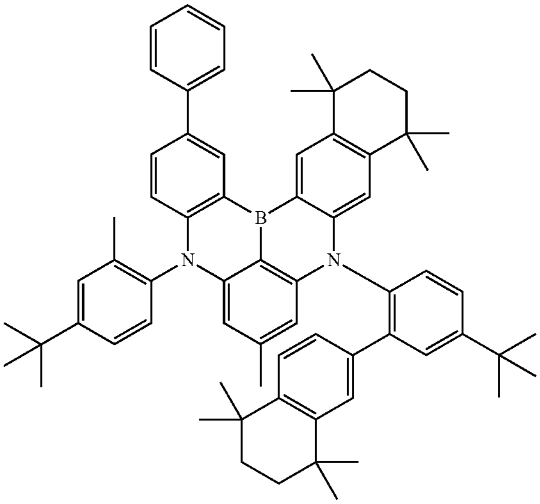
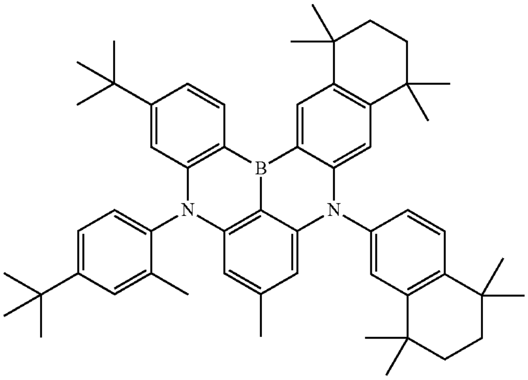
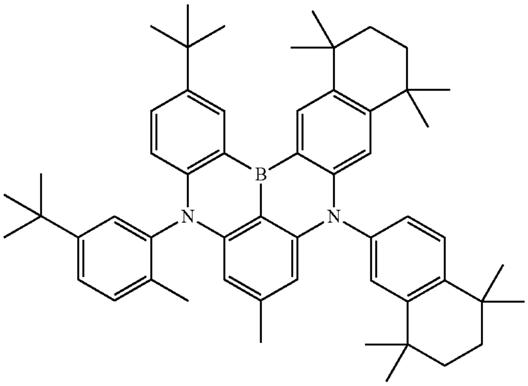

-continued
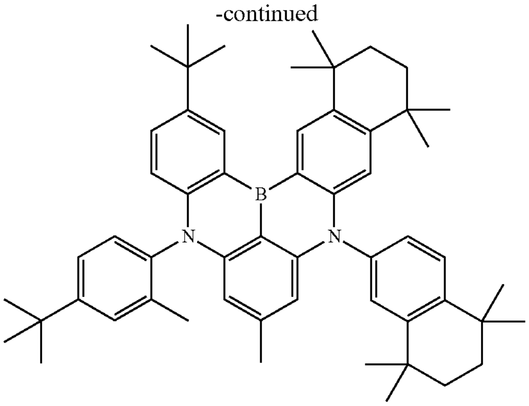
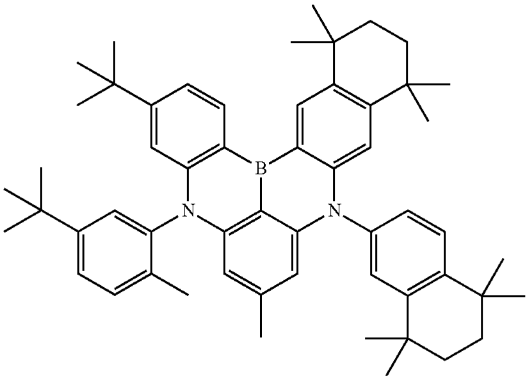
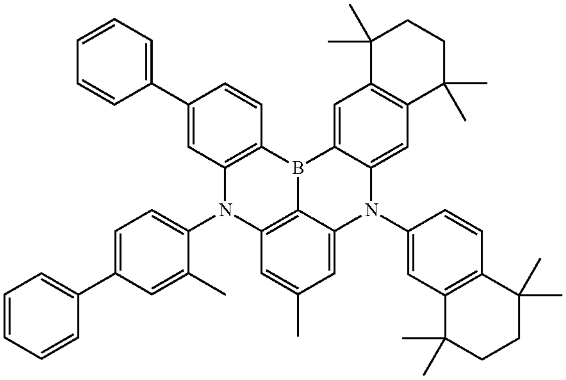
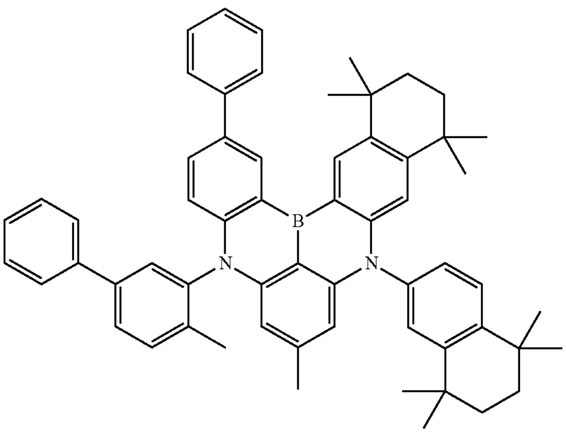
-continued
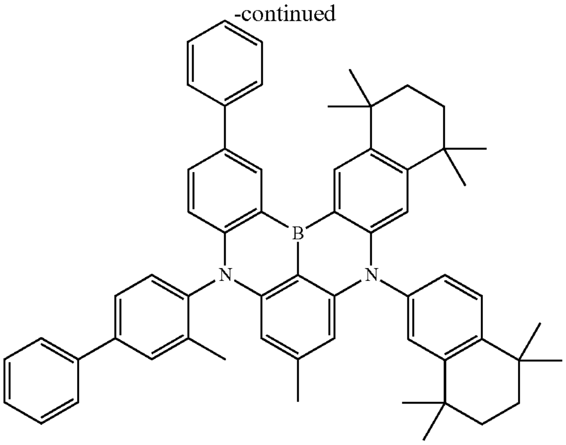
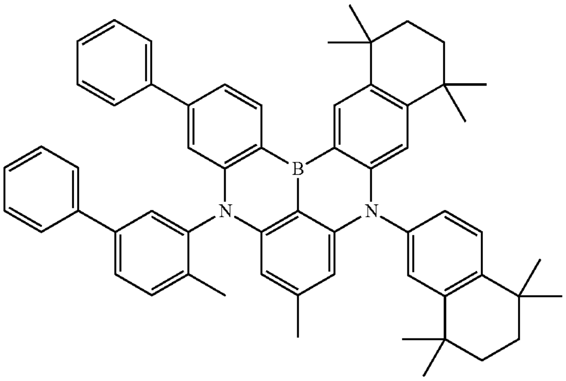
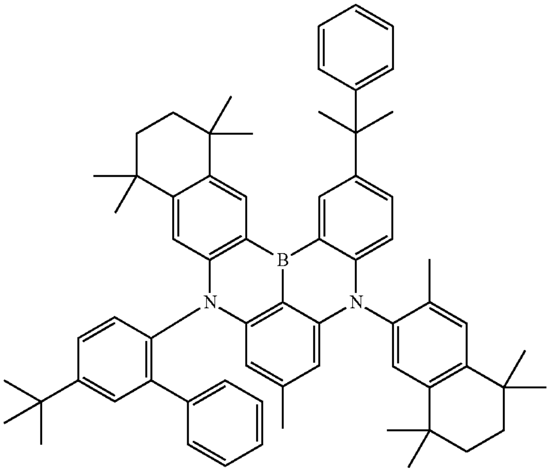
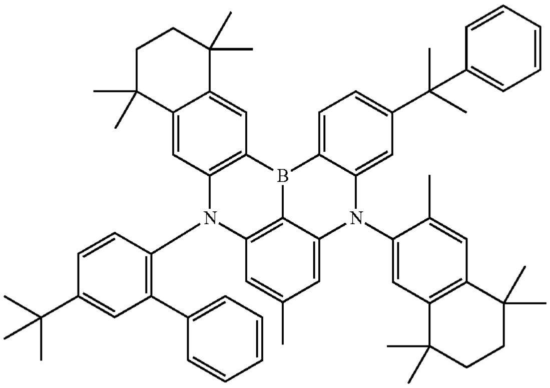

-continued
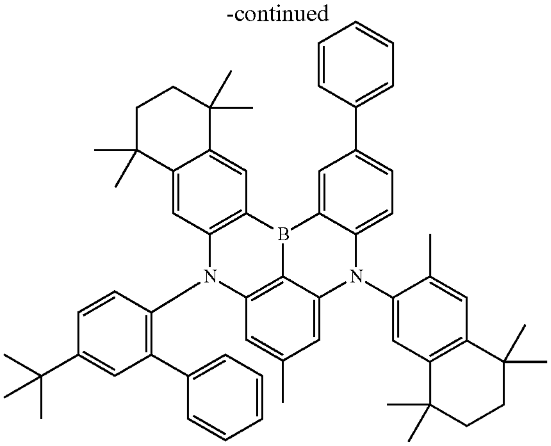
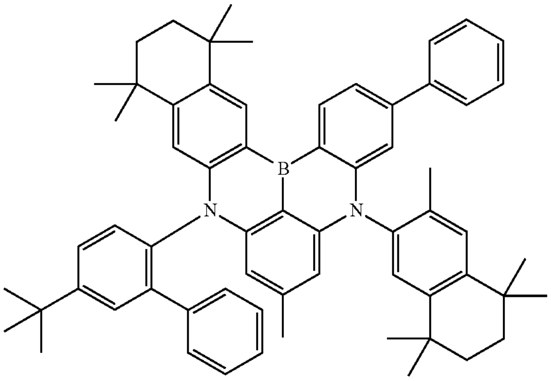
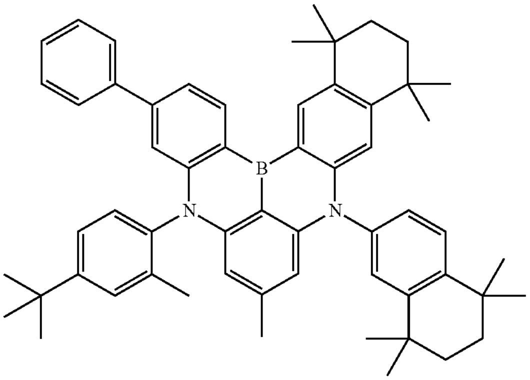
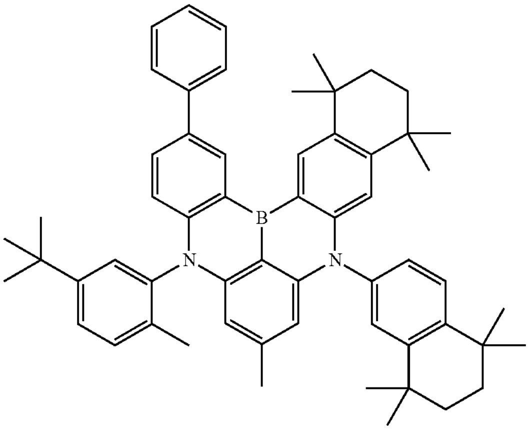
-continued
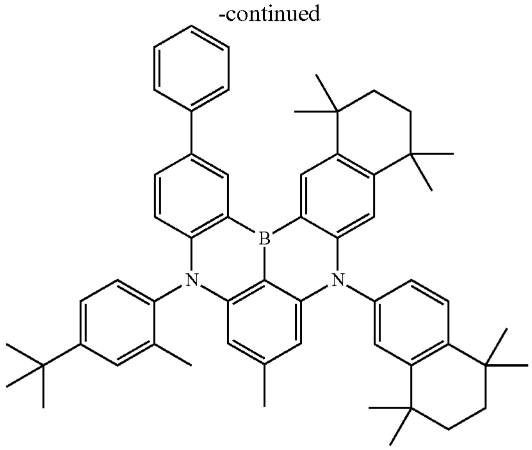
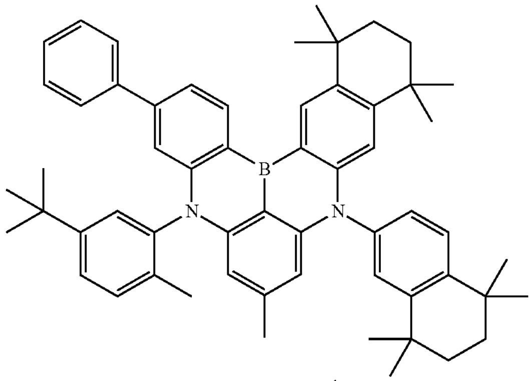
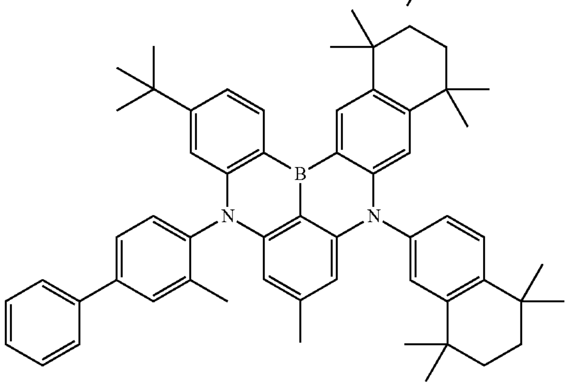
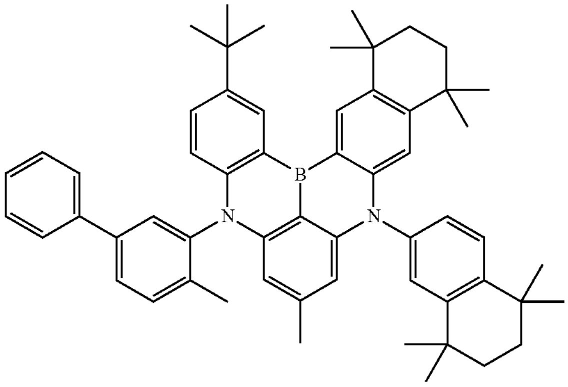

-continued
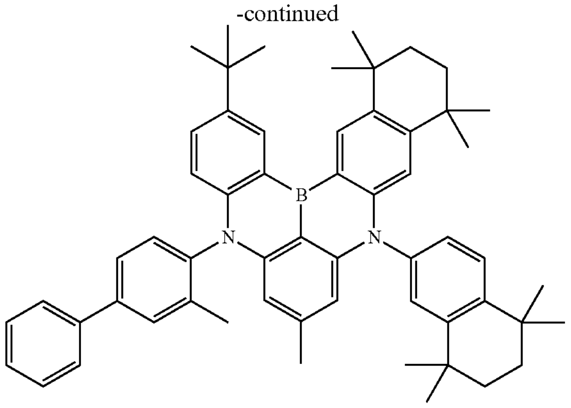
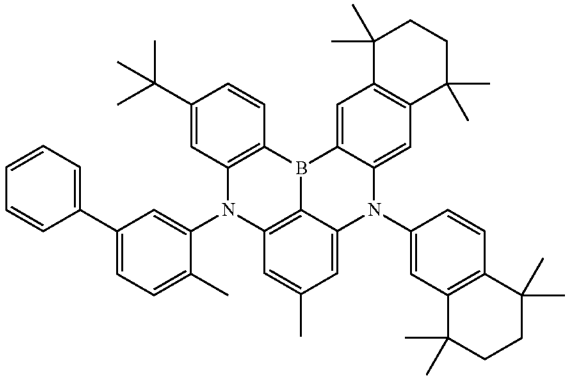
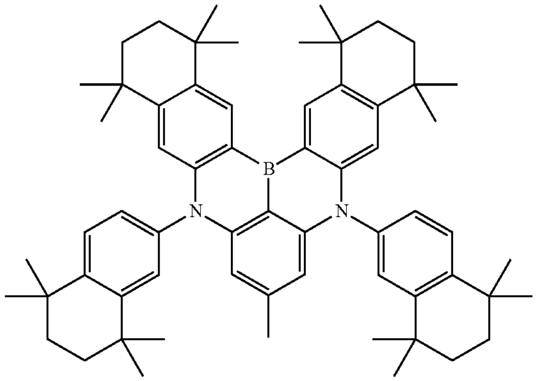
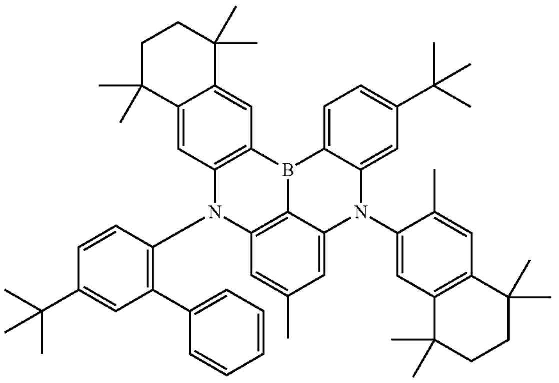
-continued
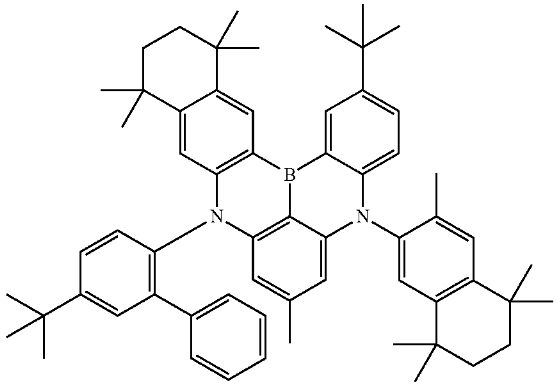
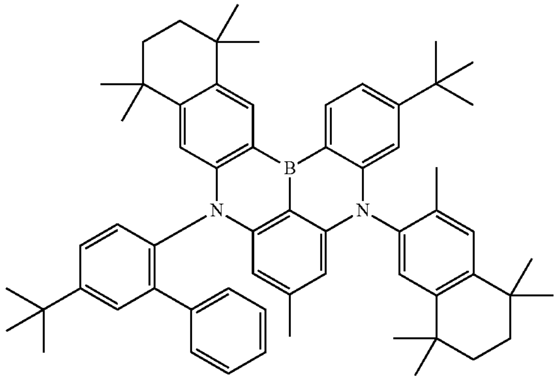
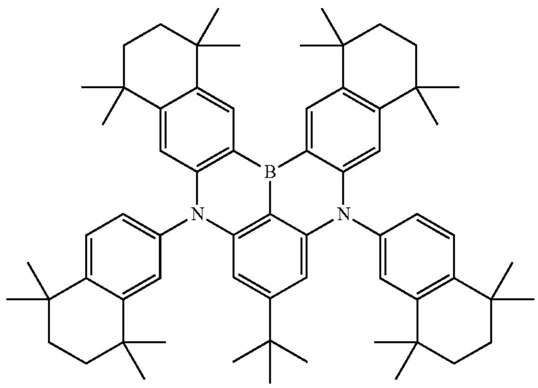
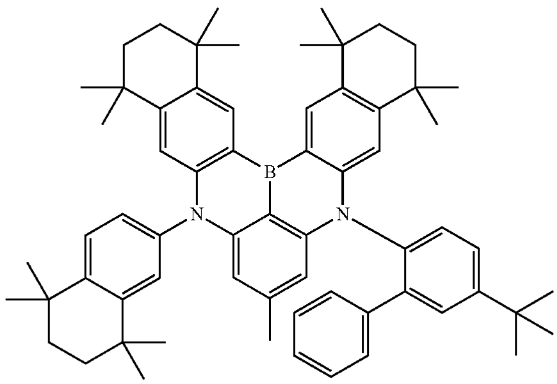

-continued
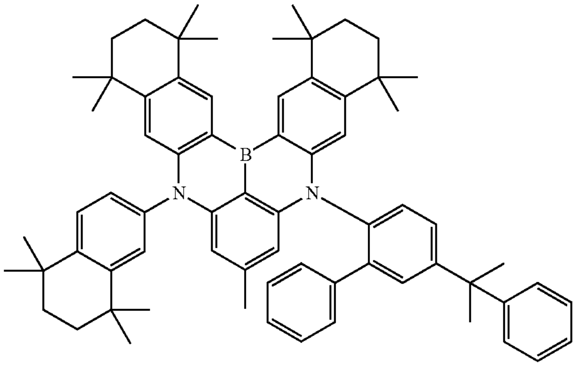
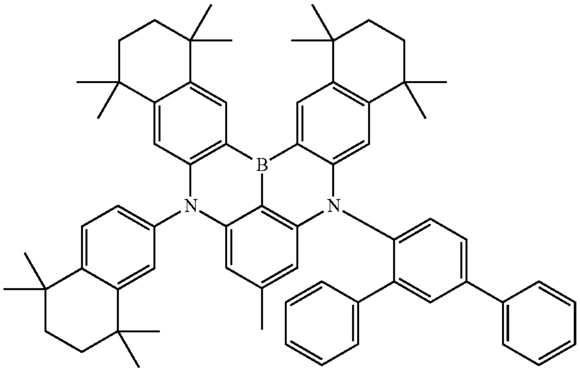
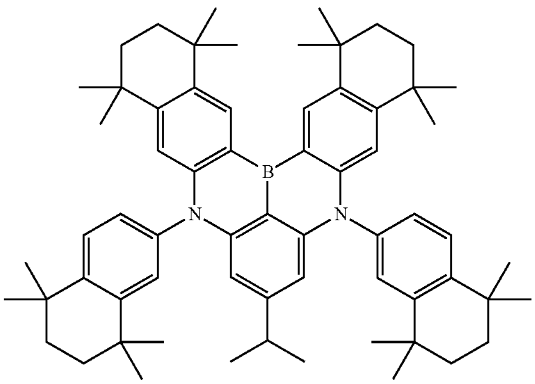
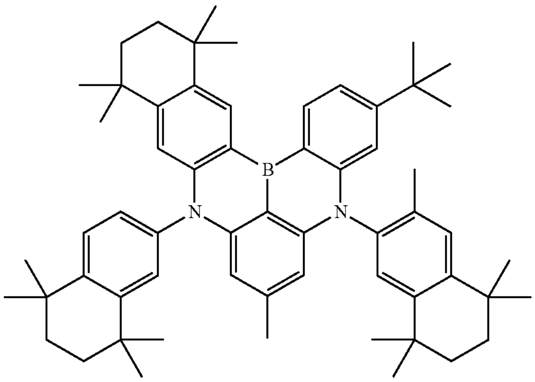
-continued
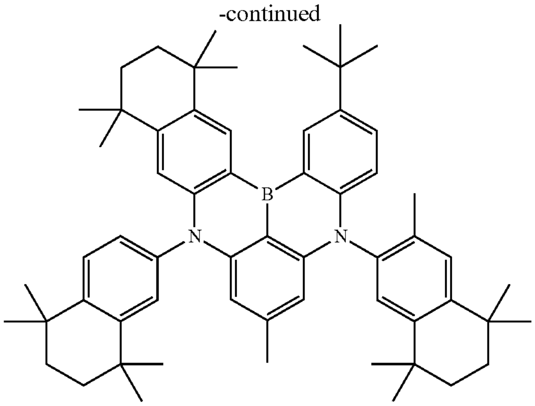
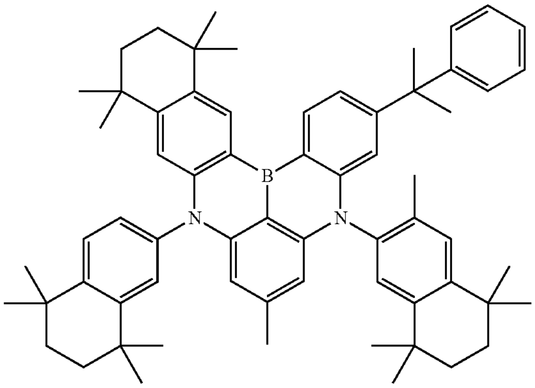
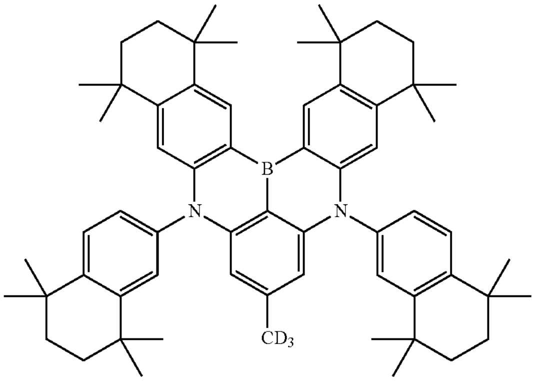
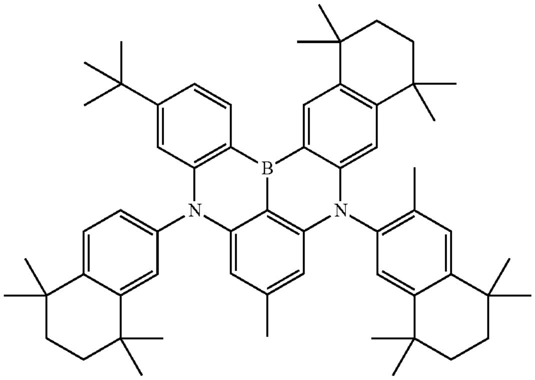

-continued
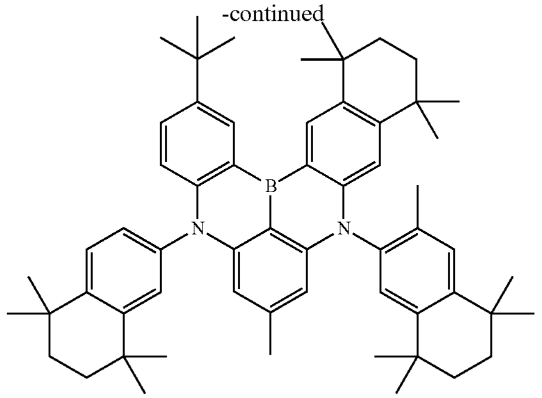
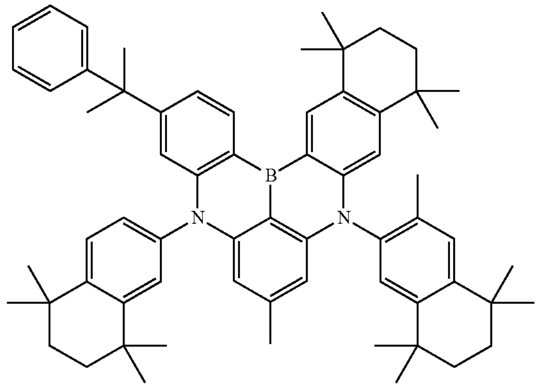
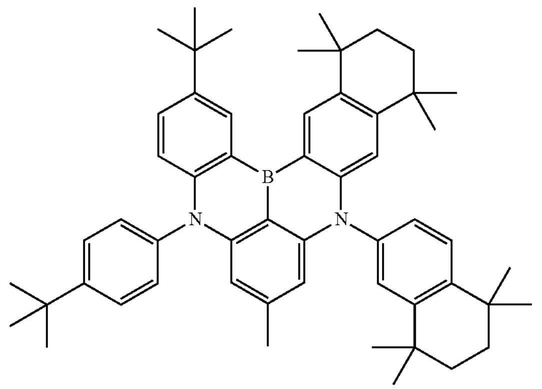
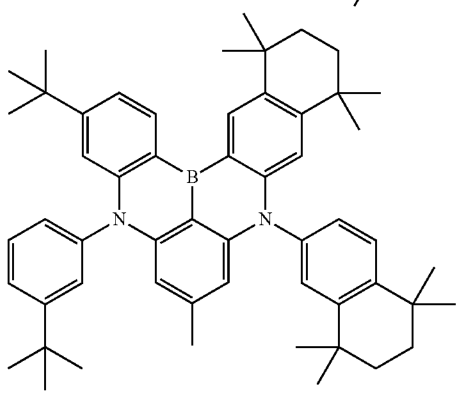
-continued
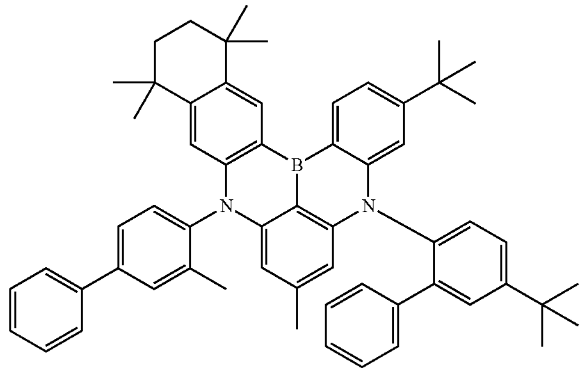
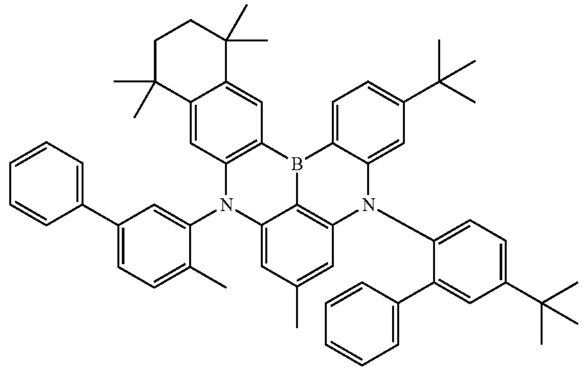
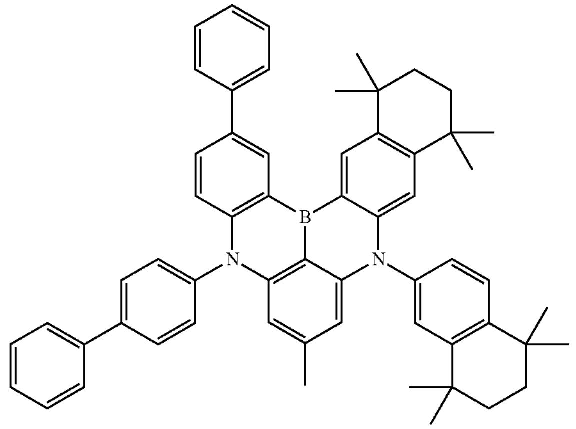
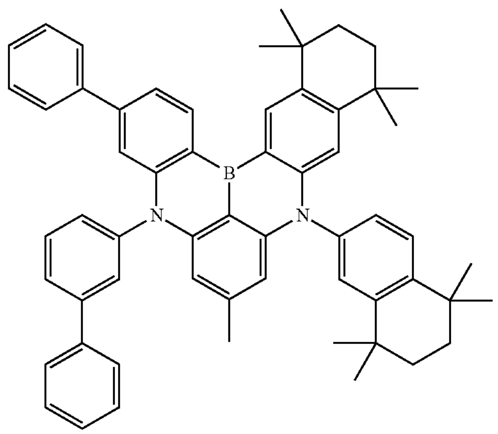

-continued
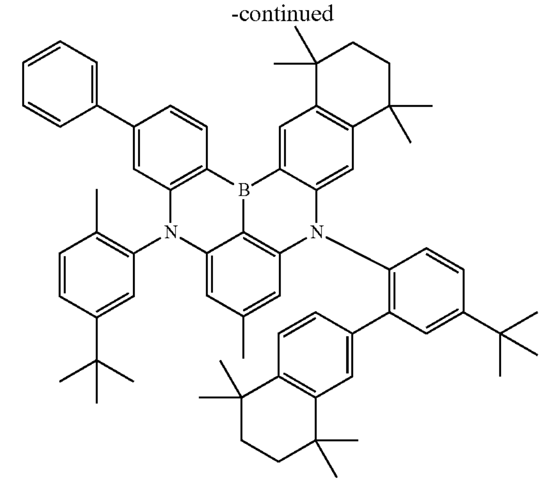
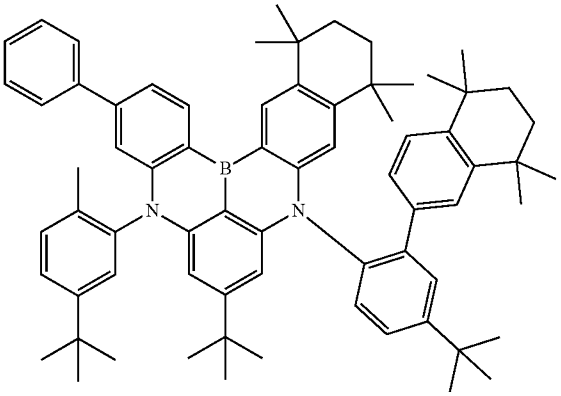
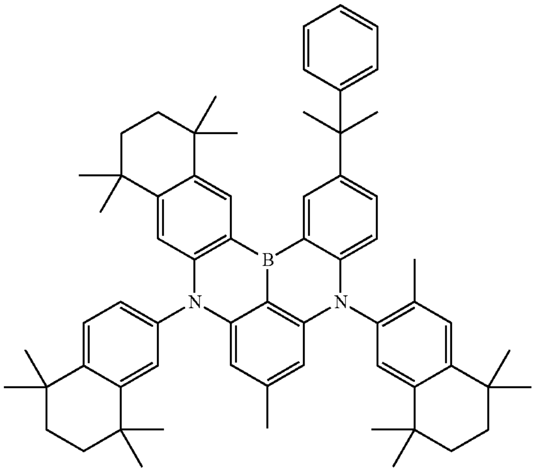
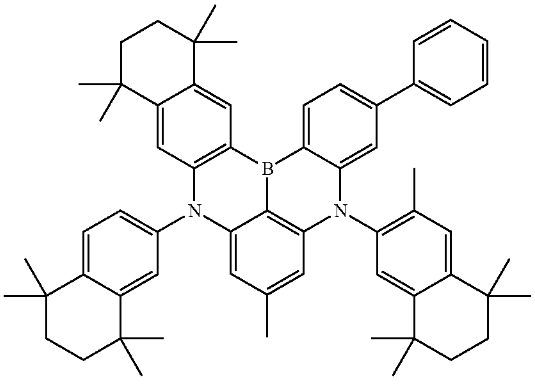
-continued
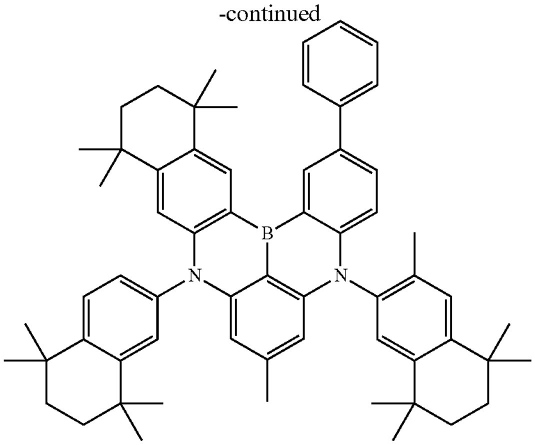
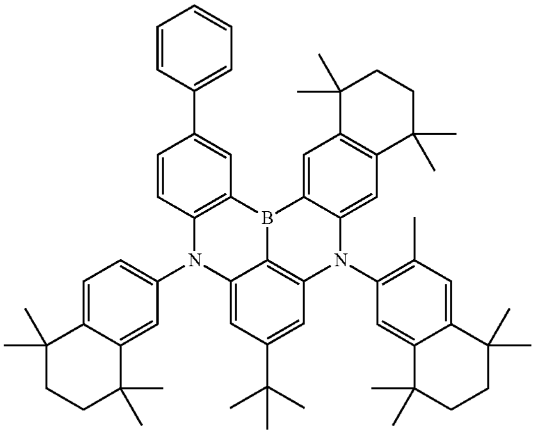
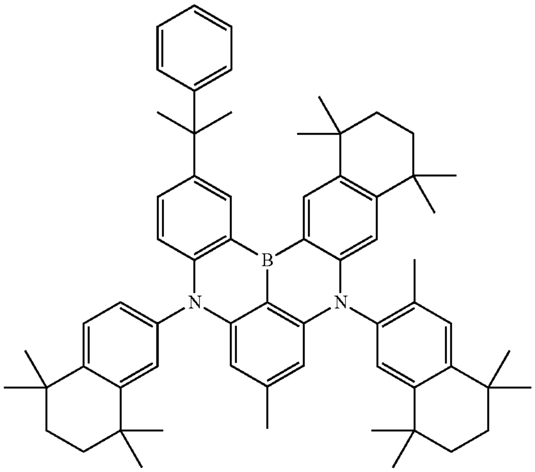
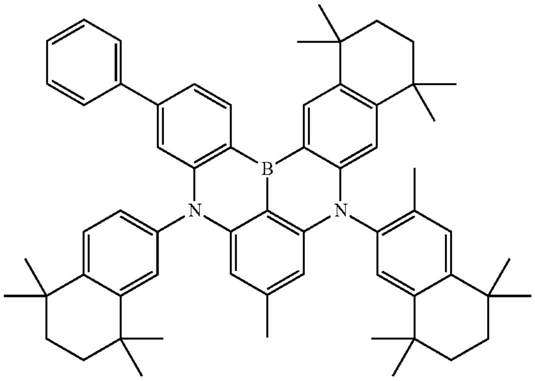

-continued
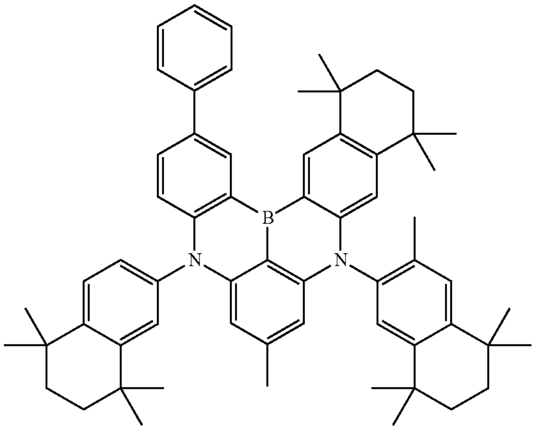
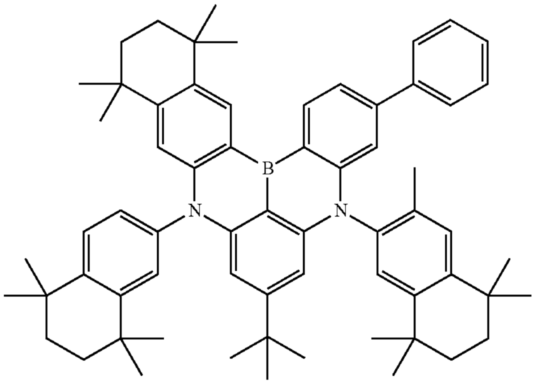
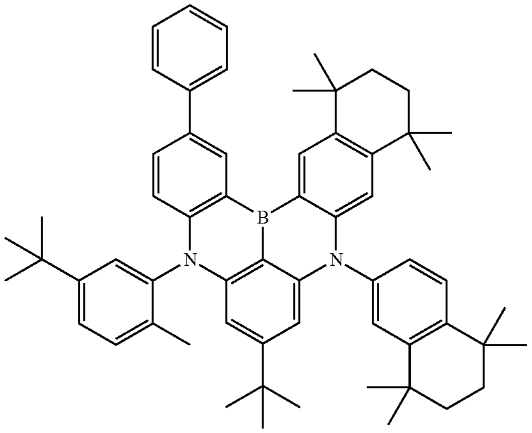
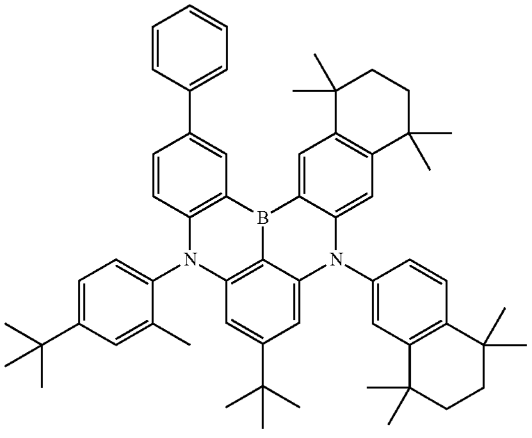
-continued
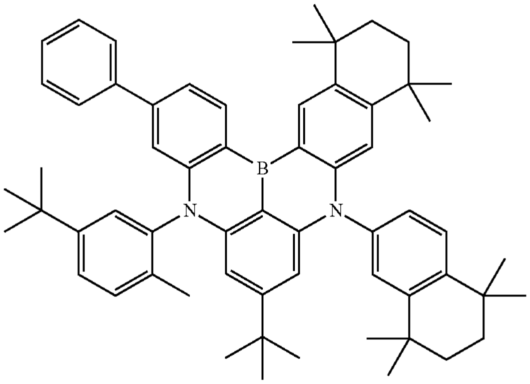
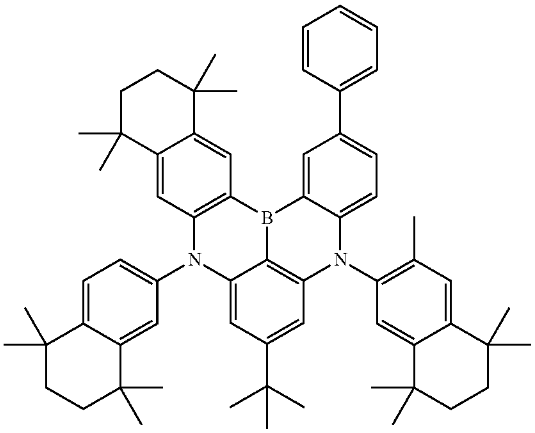
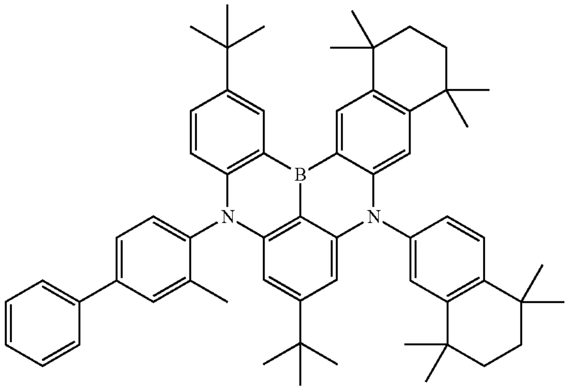
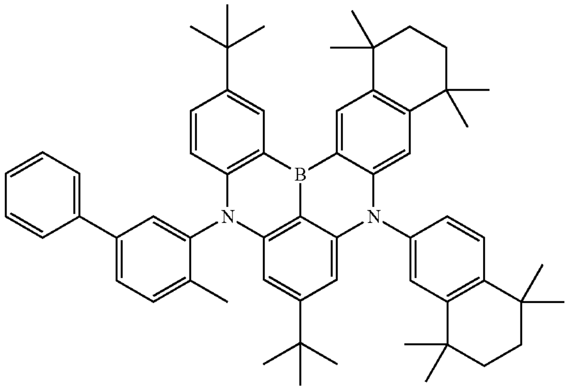

-continued
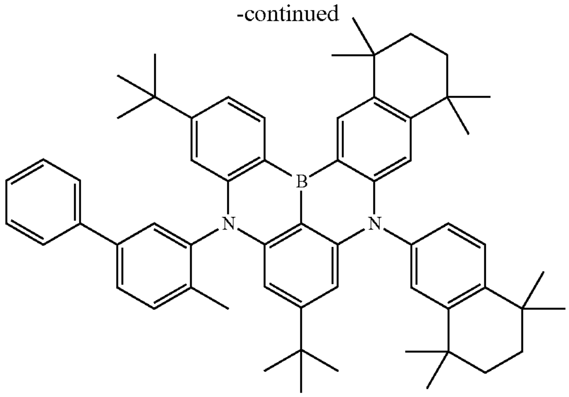
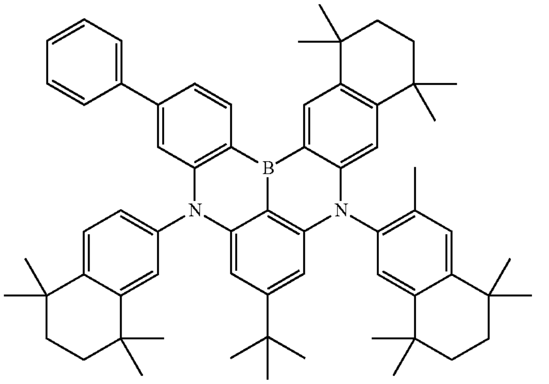
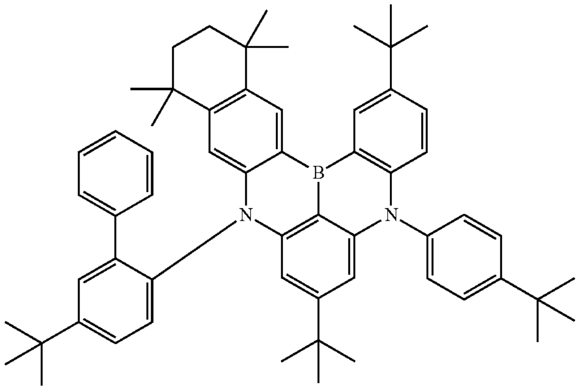
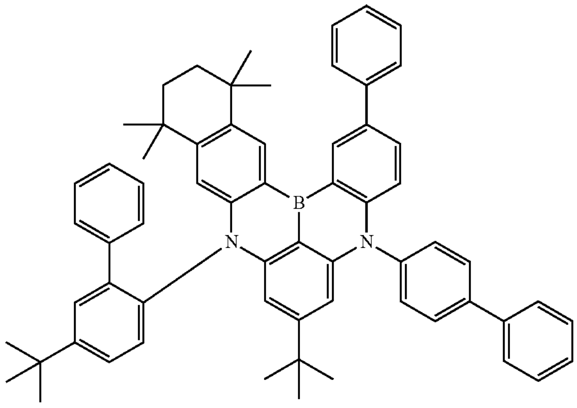
-continued
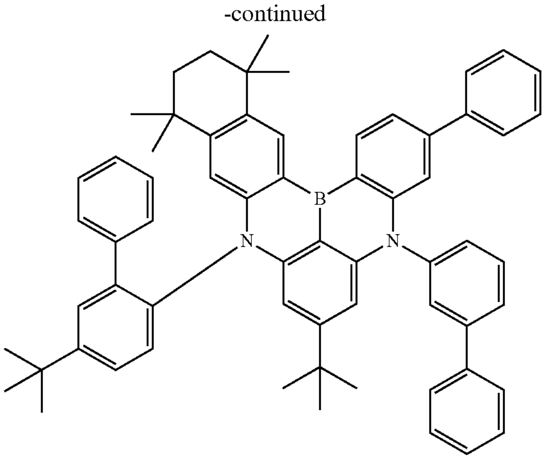
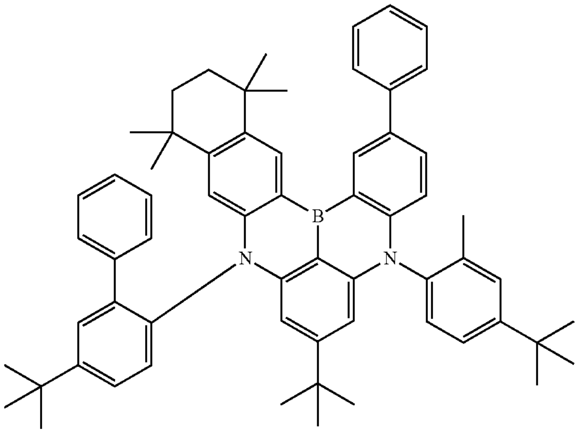
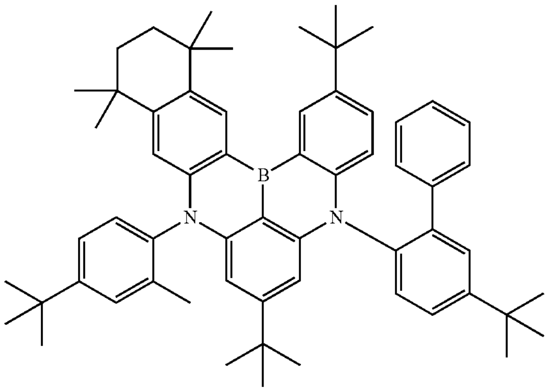
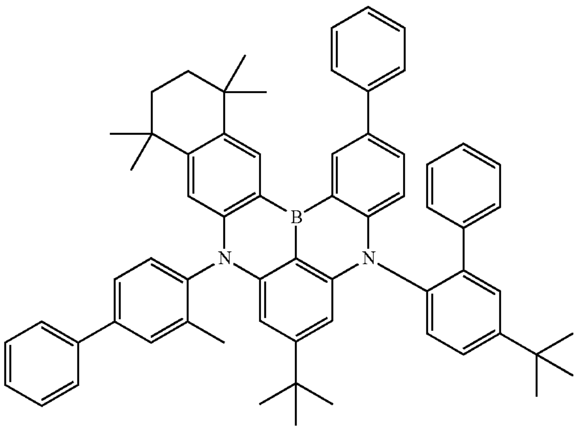

-continued
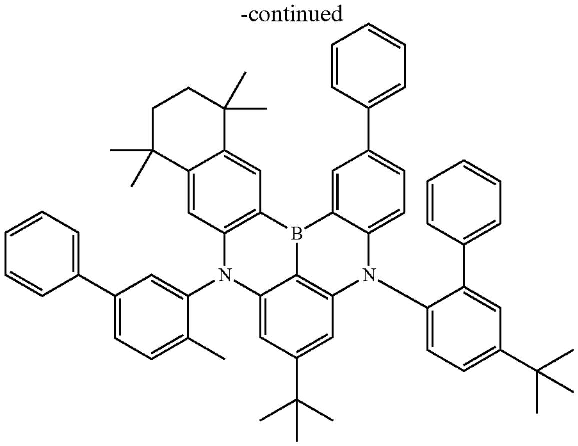
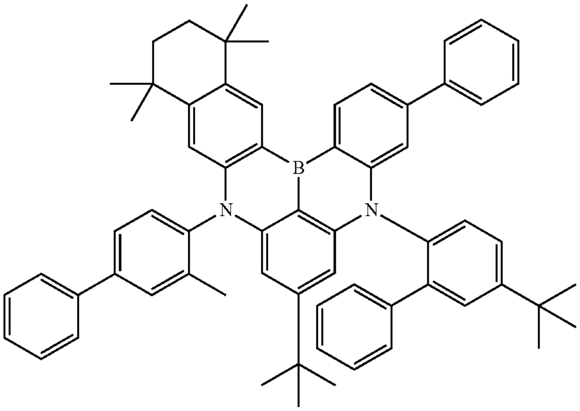
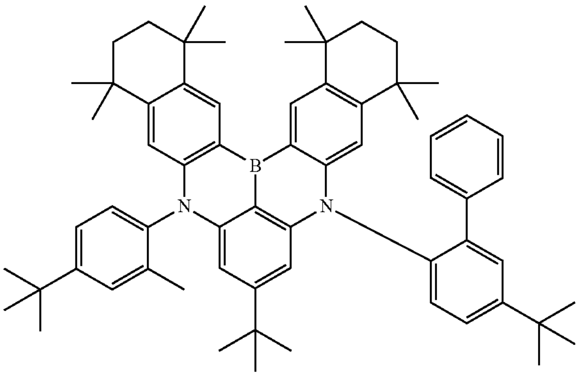
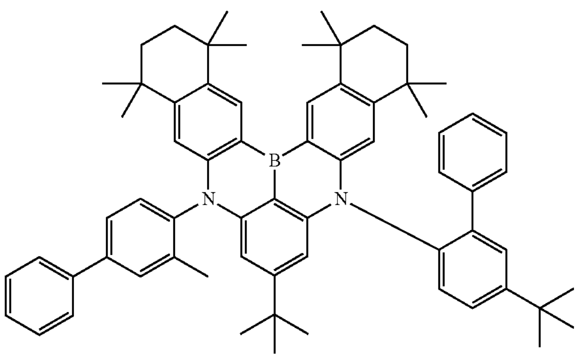
-continued
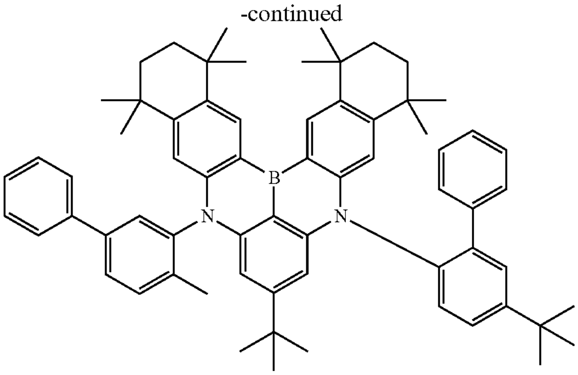
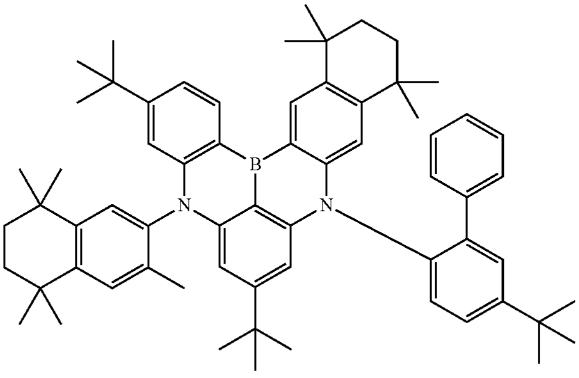
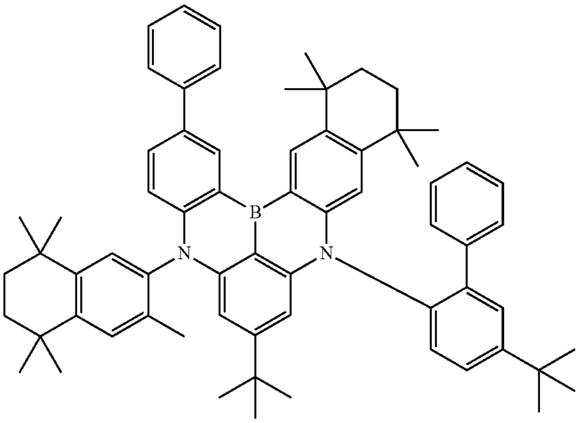
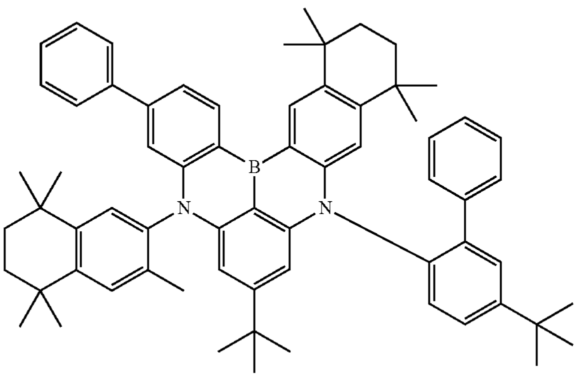

-continued
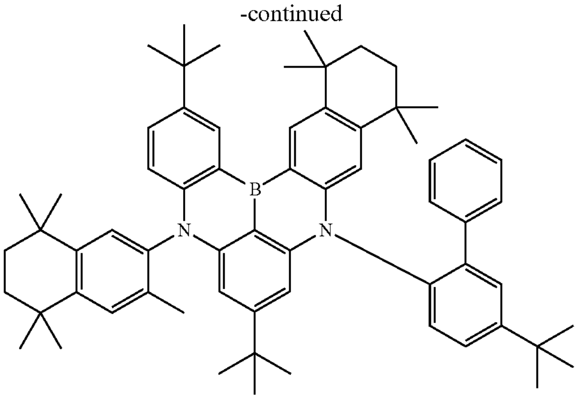
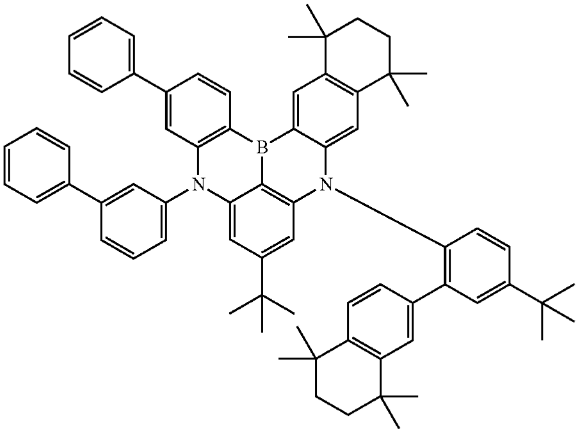
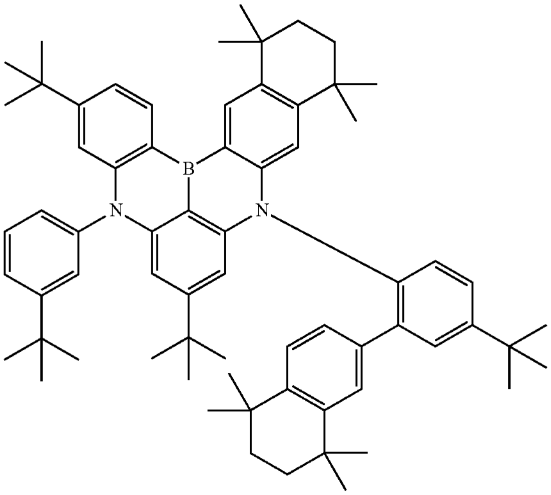
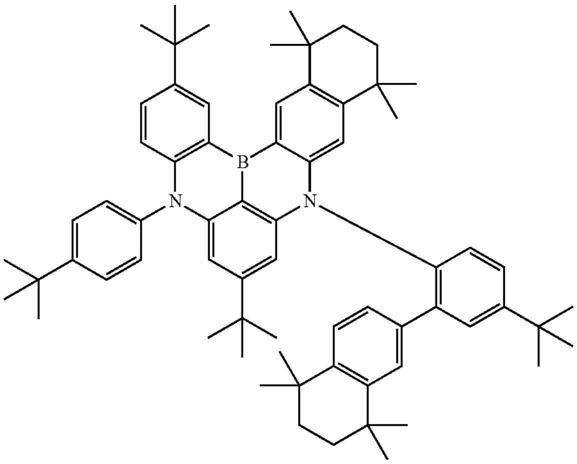
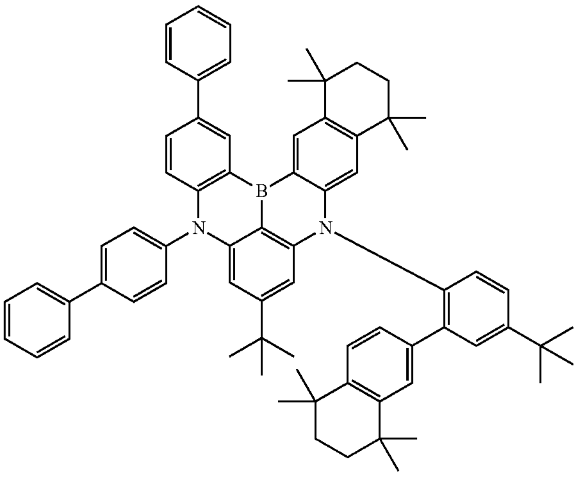
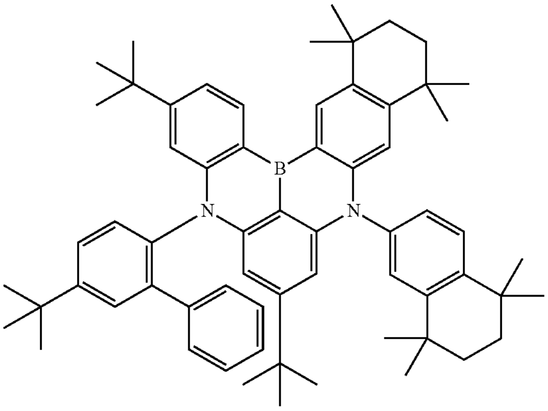

-continued
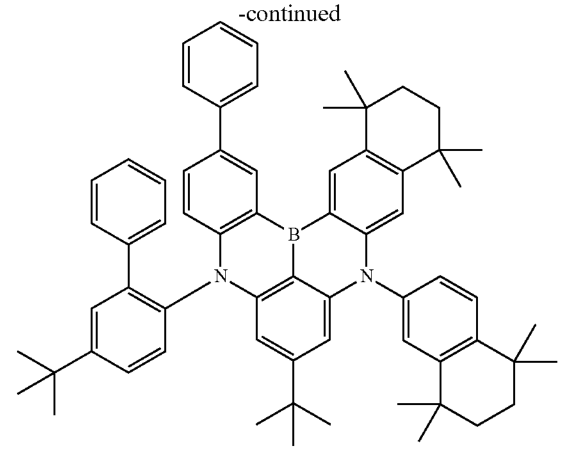
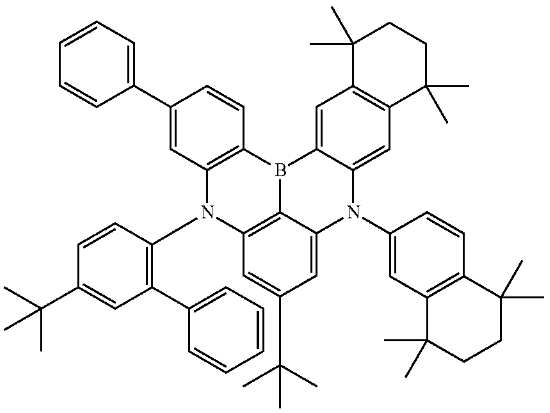
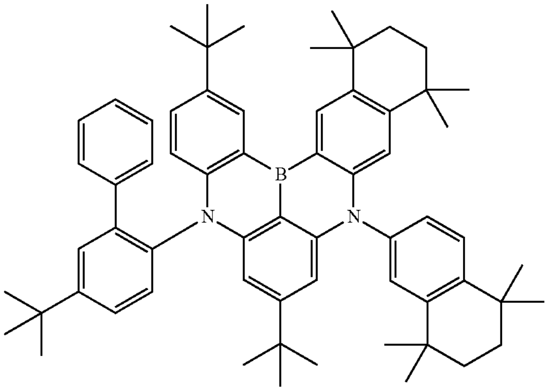
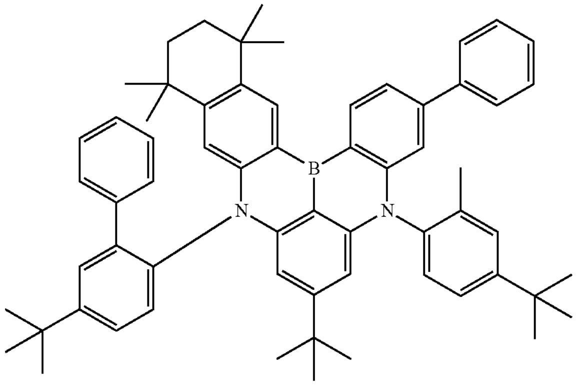
-continued
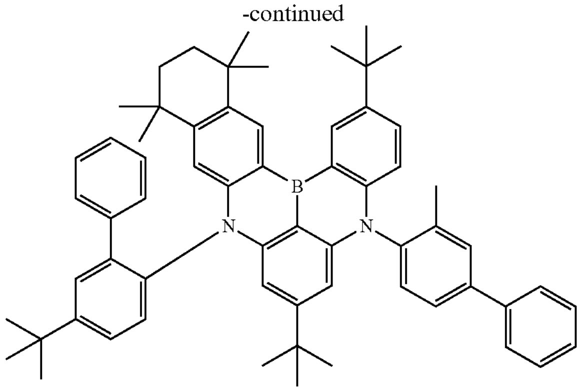
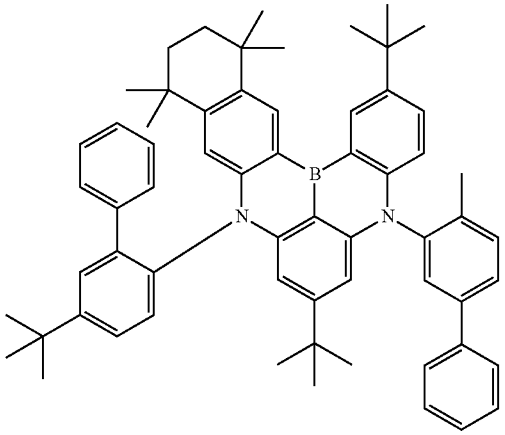
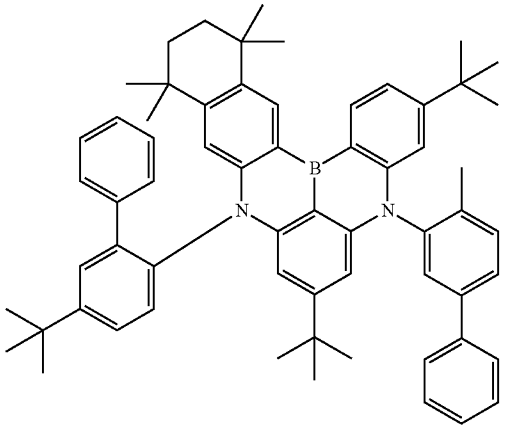
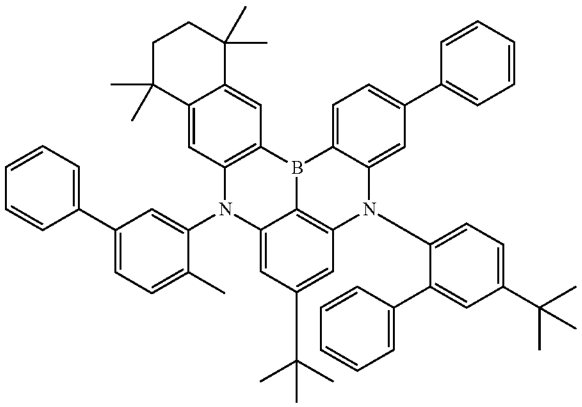

-continued
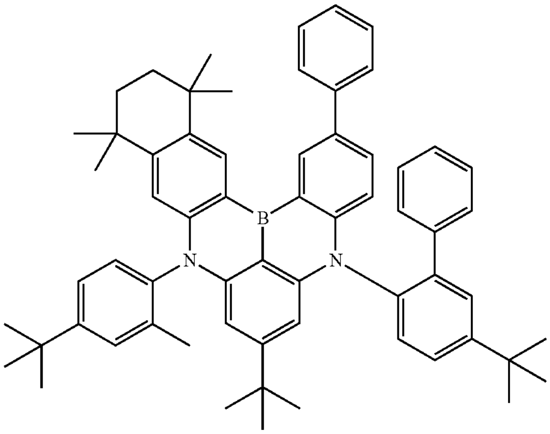
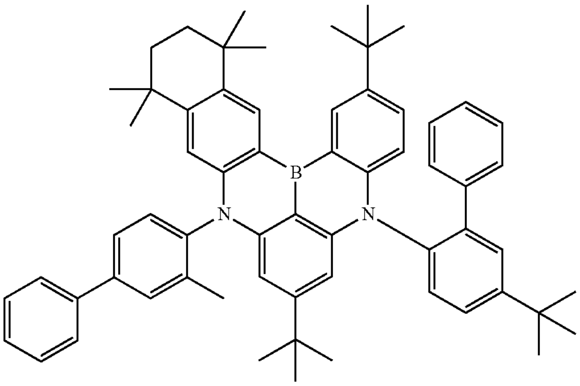
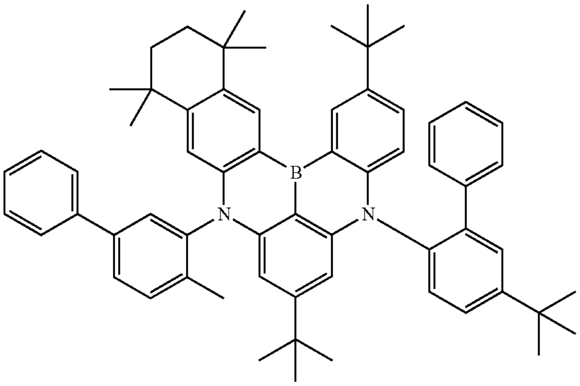
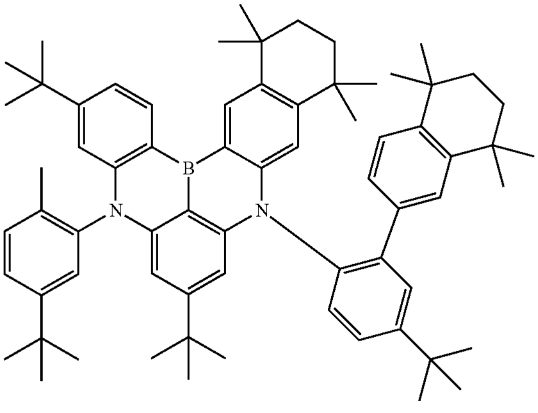
-continued
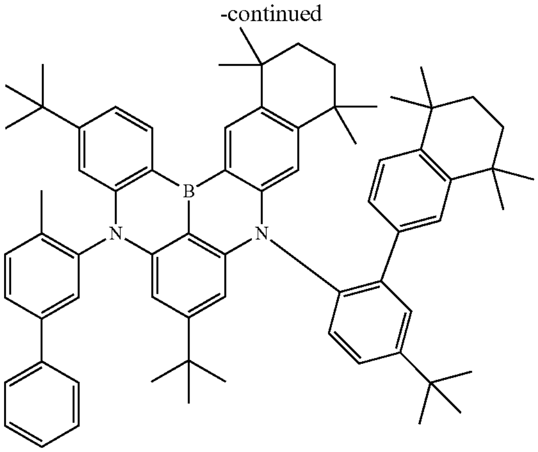
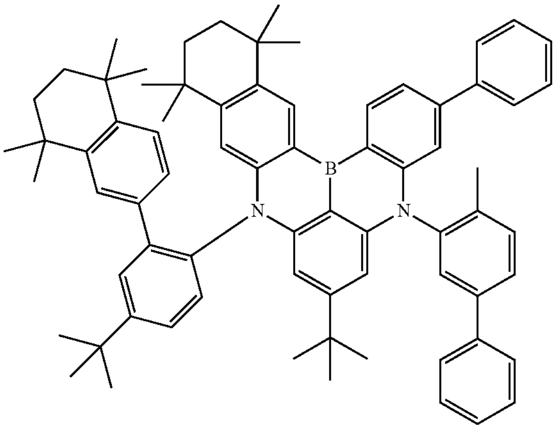
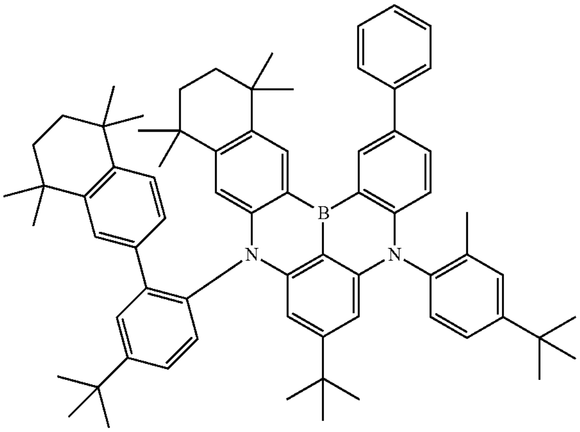
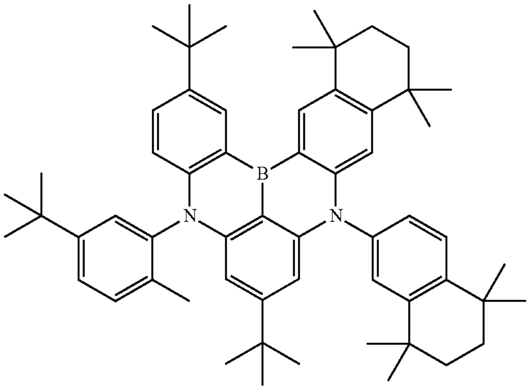

-continued
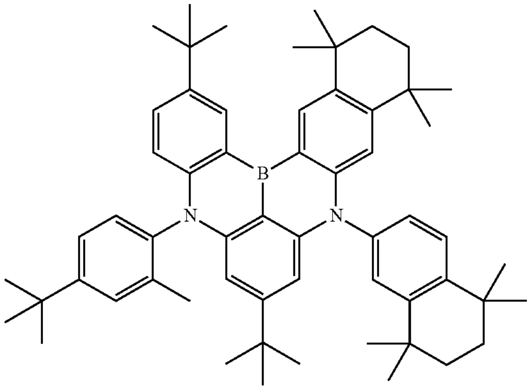
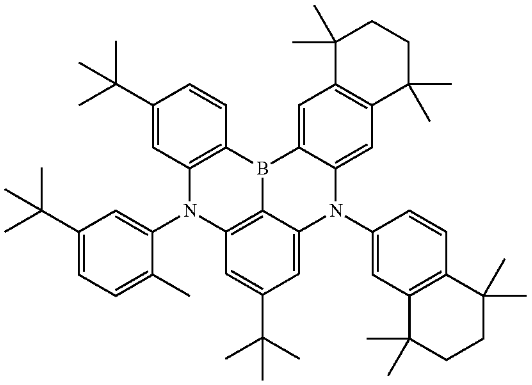
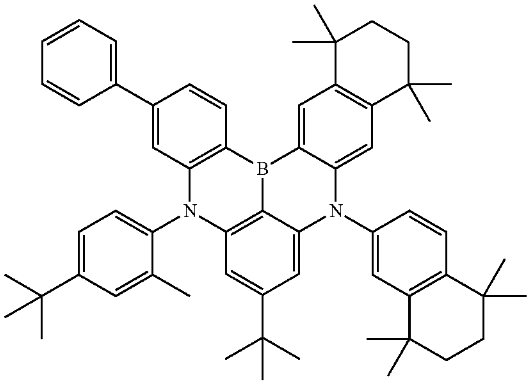
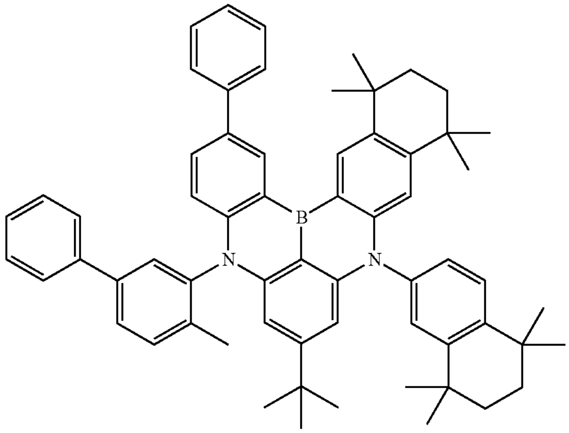
-continued
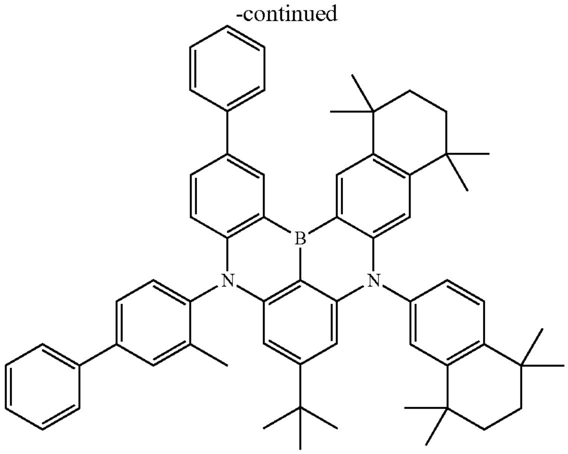
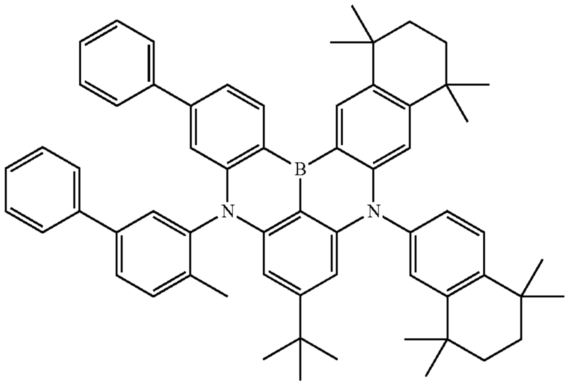
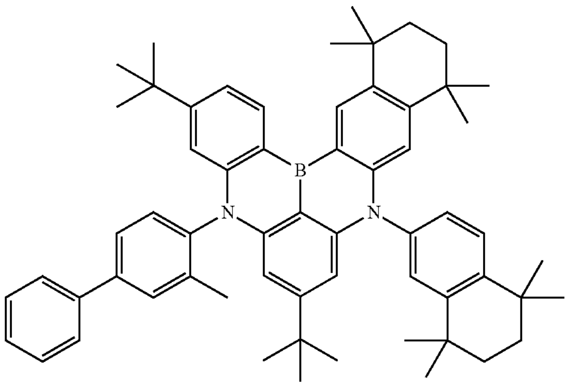
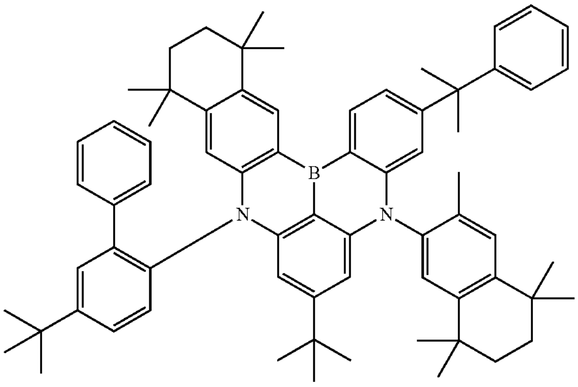

-continued
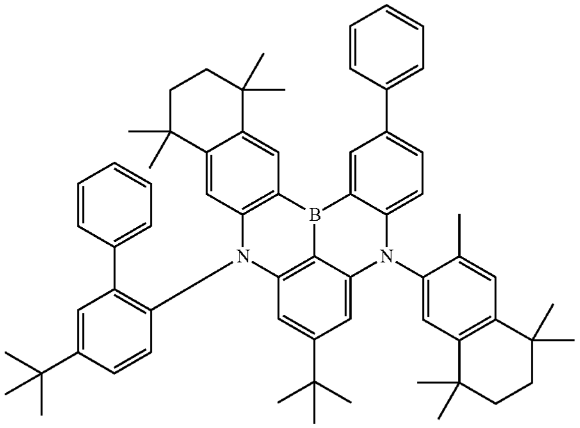
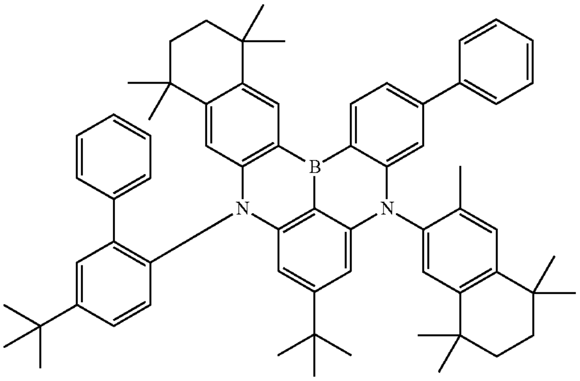
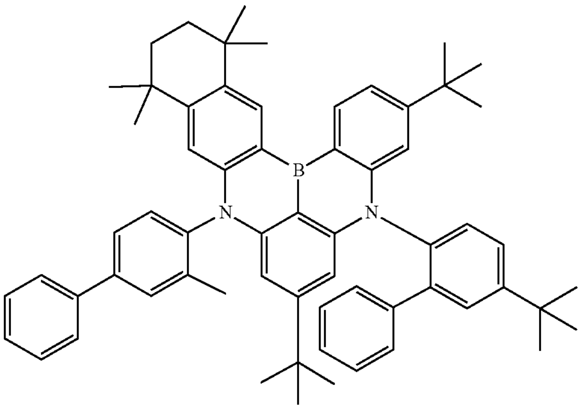
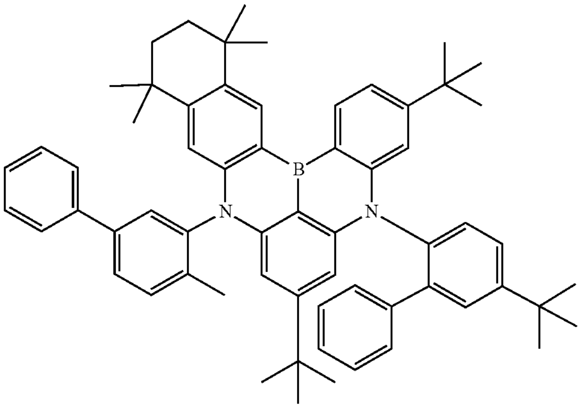
-continued
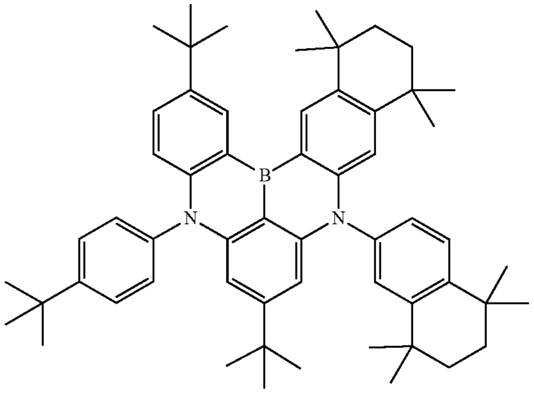
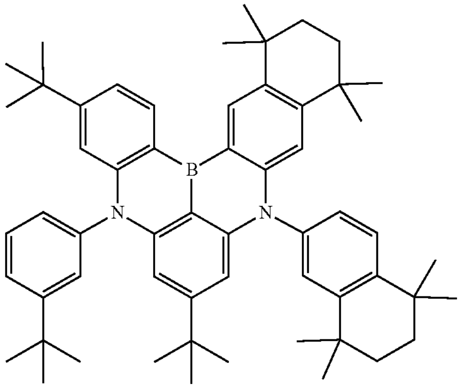
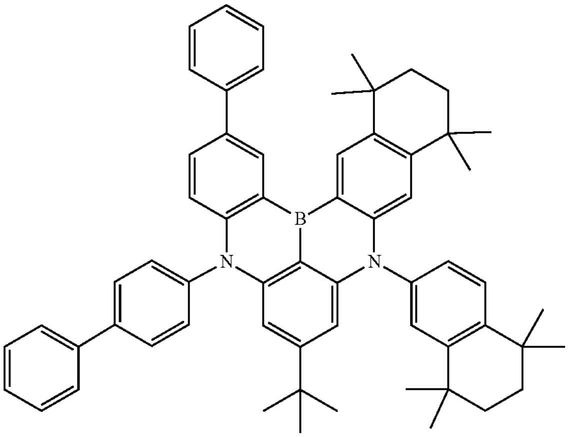
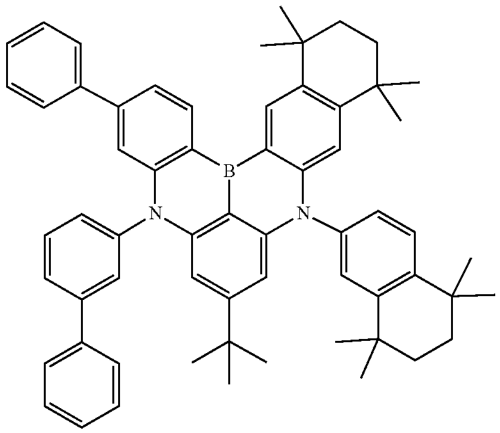

-continued
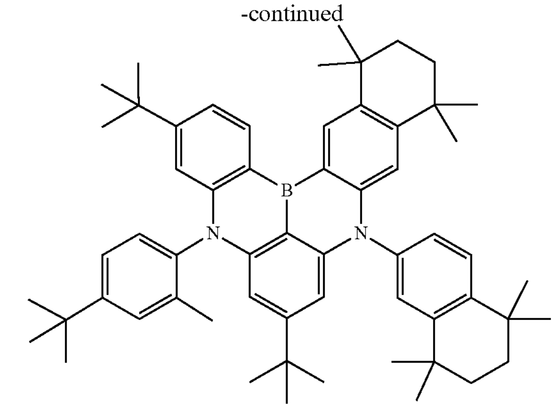
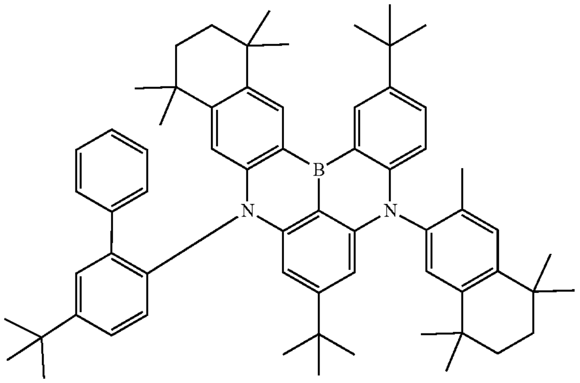
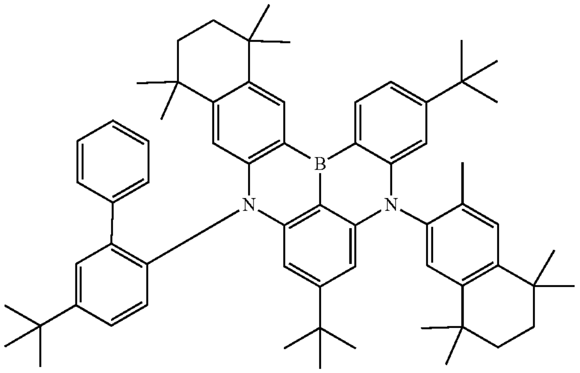
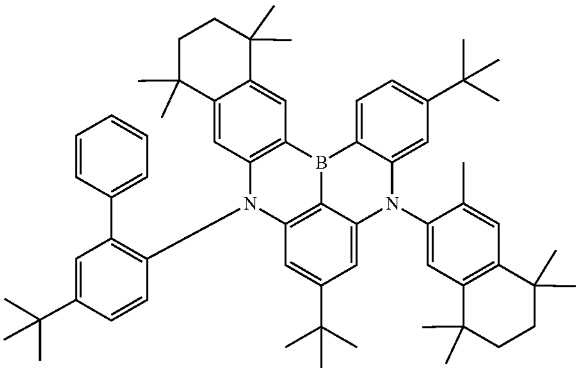
-continued
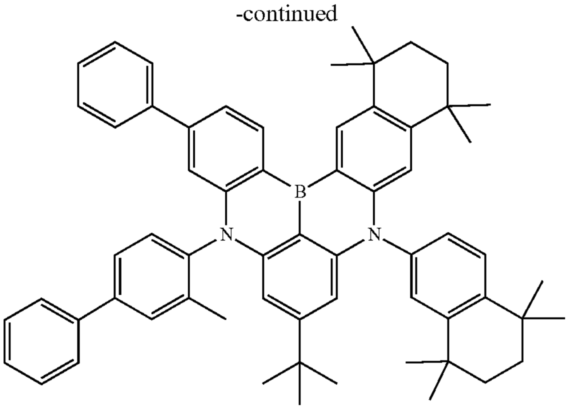
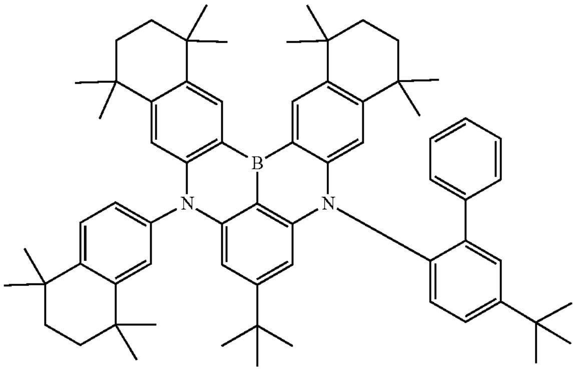
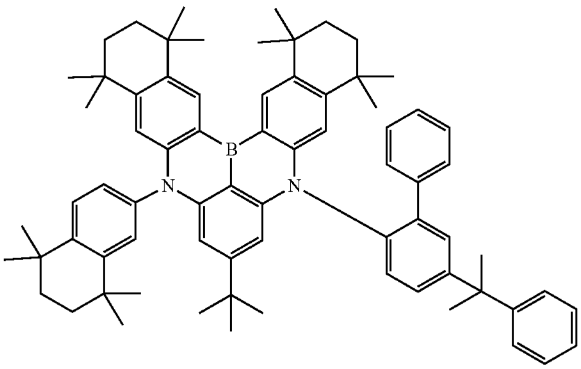
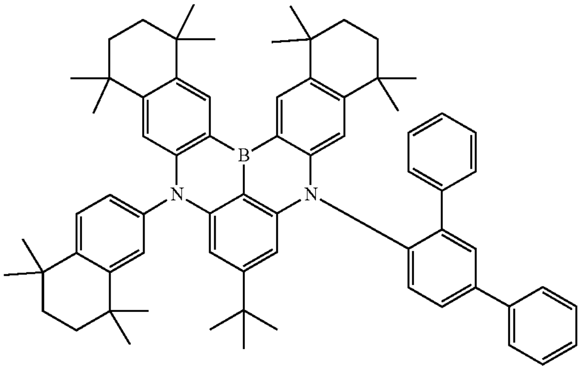

-continued
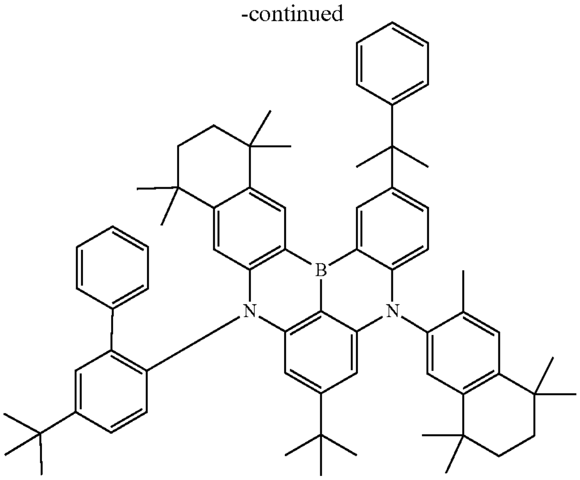
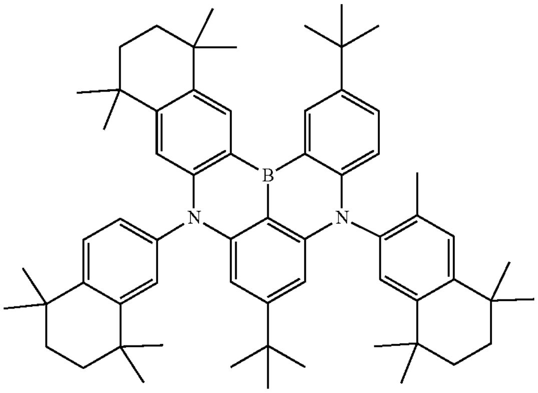
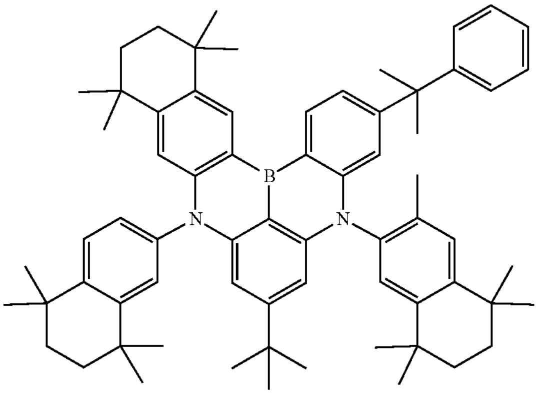
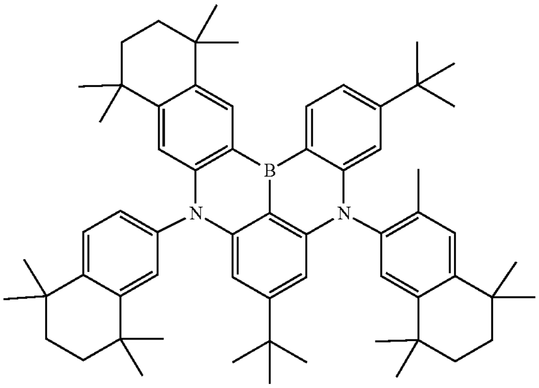
-continued
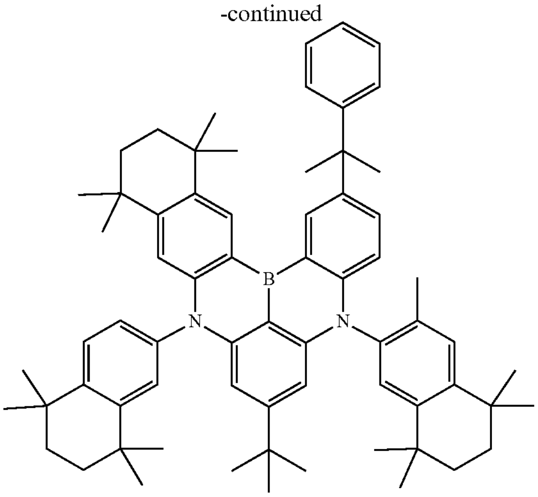
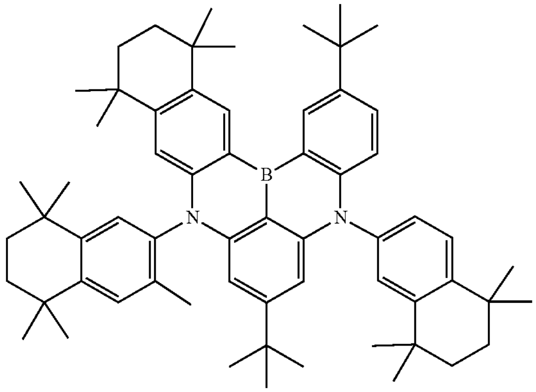
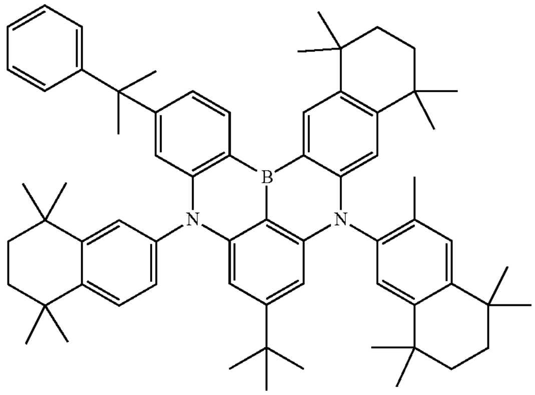
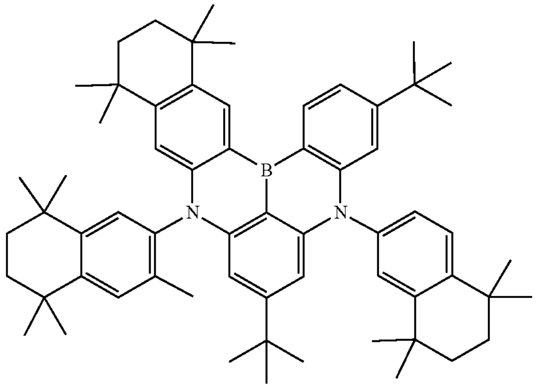

-continued
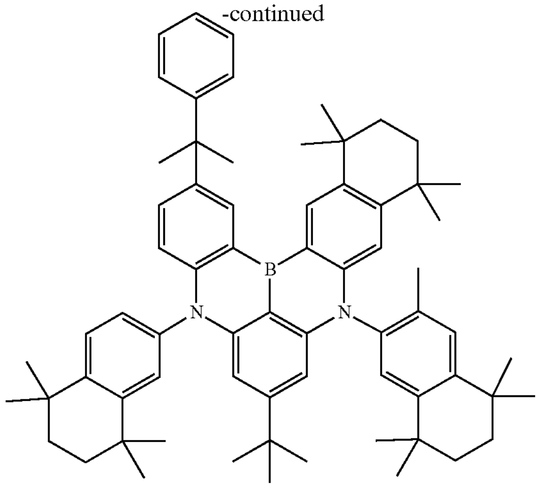
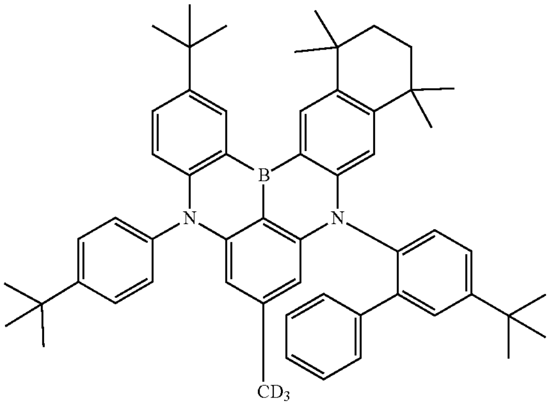
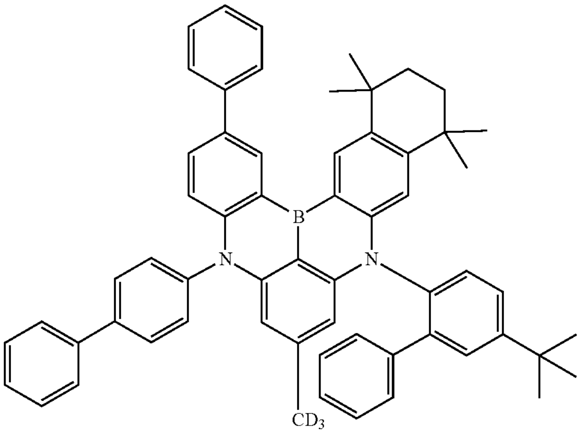
-continued
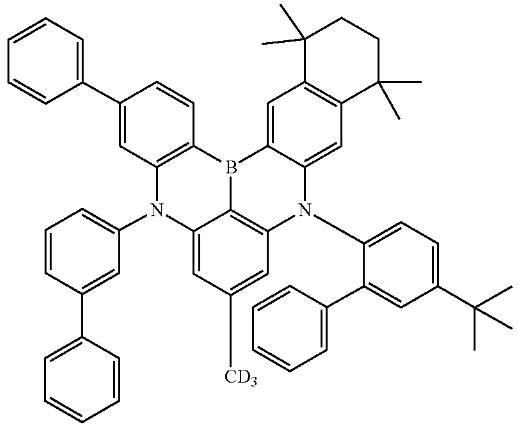
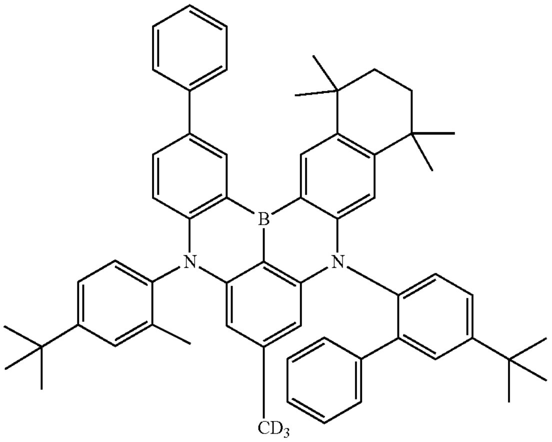
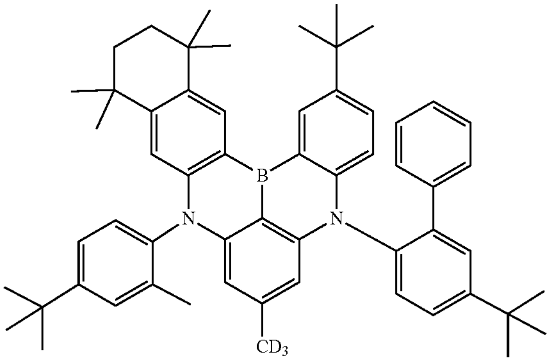
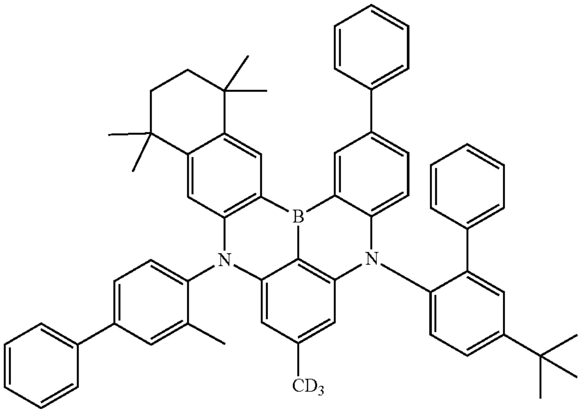

-continued
-continued
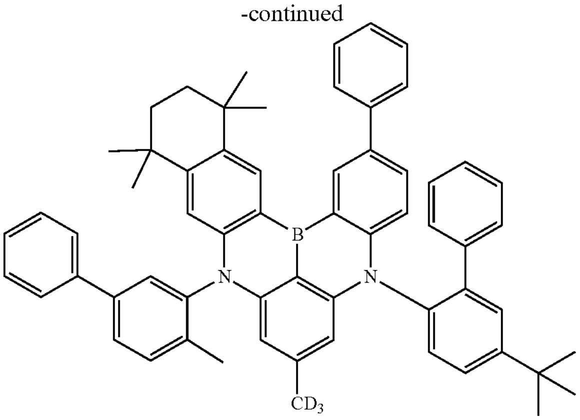
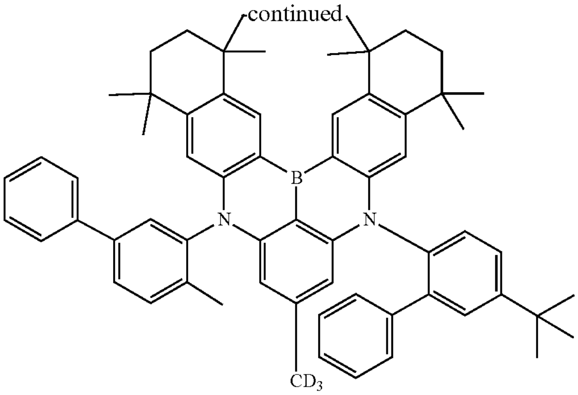
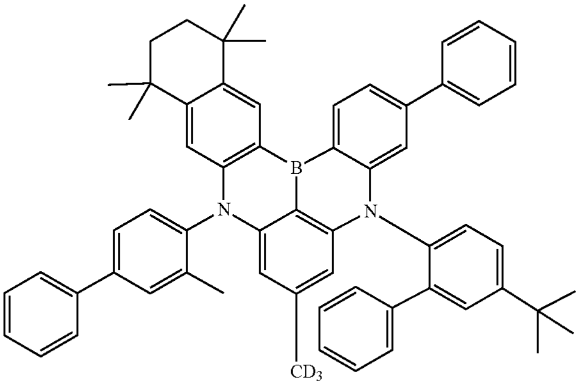
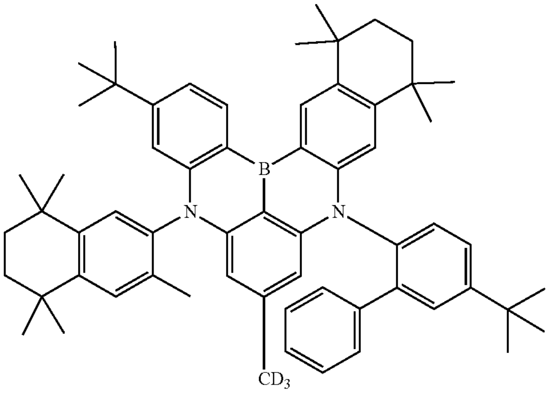
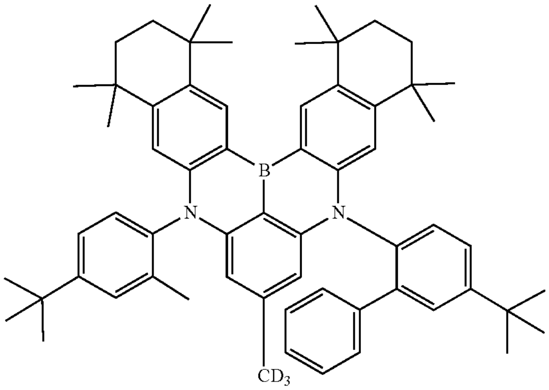
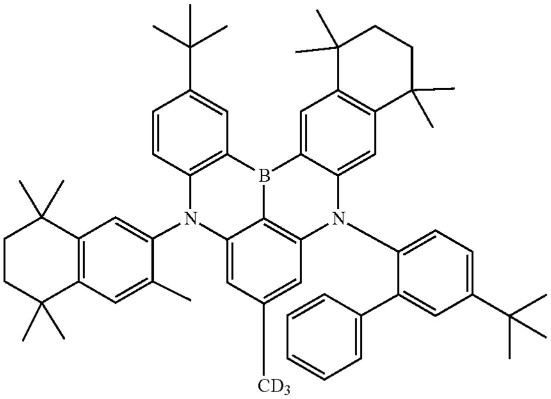
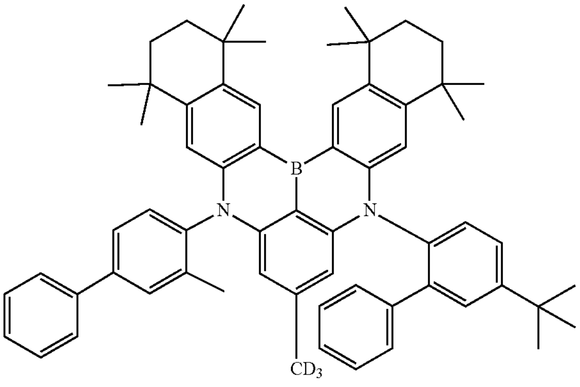
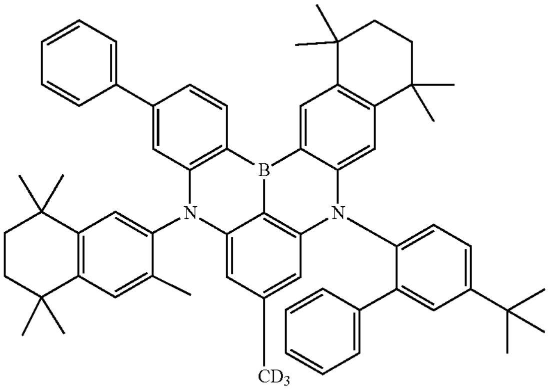

-continued
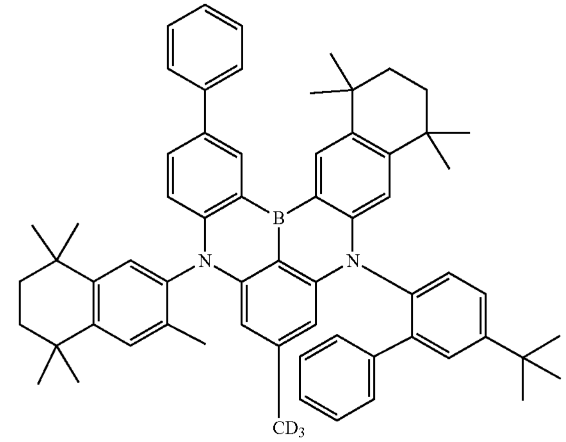
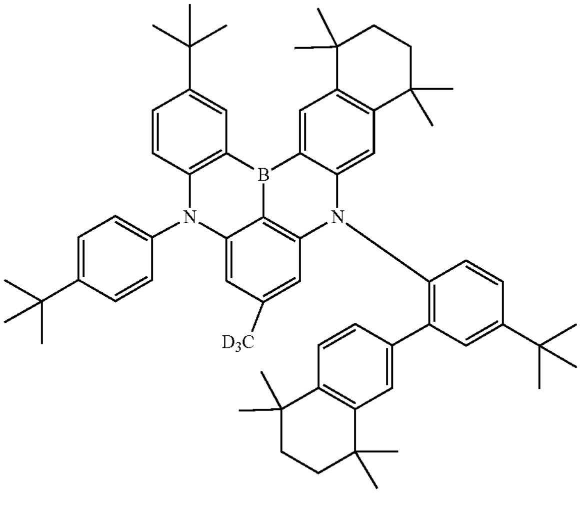
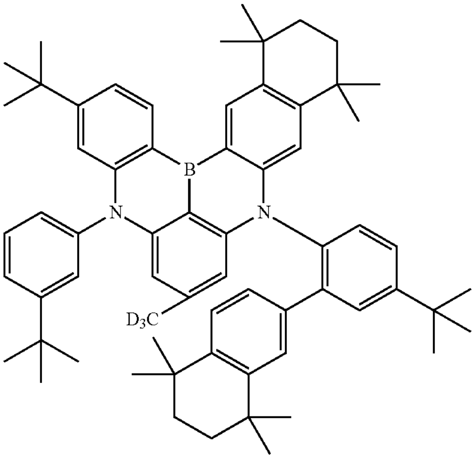
-continued
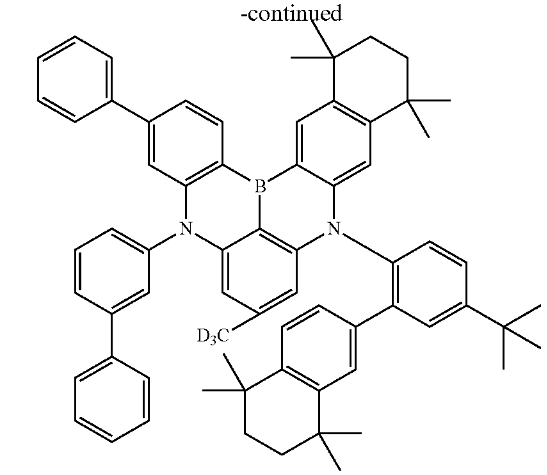
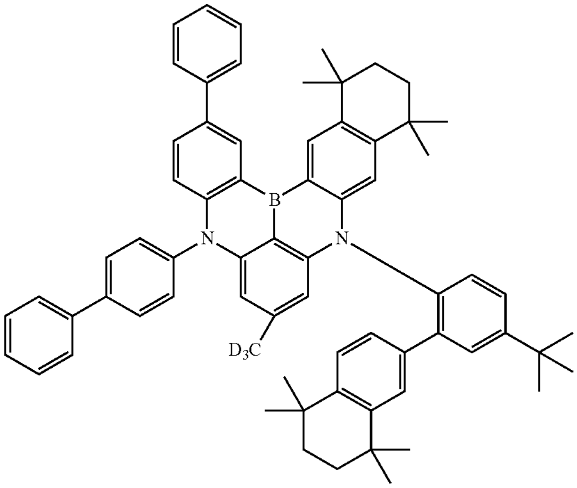
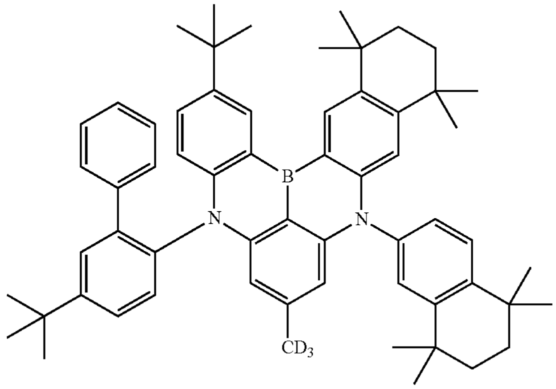
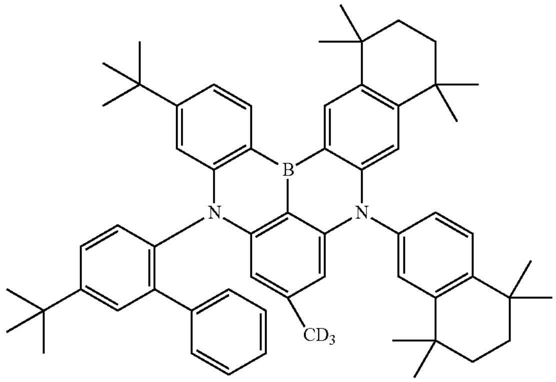

-continued
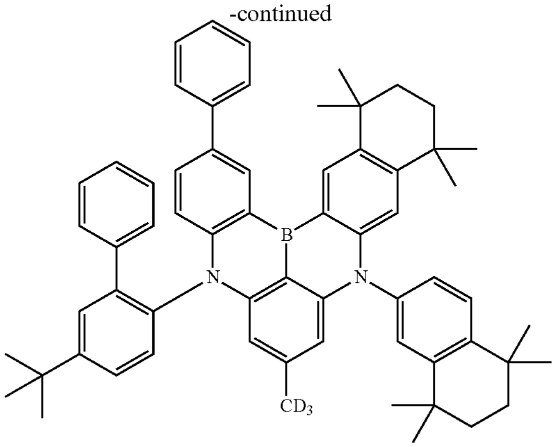
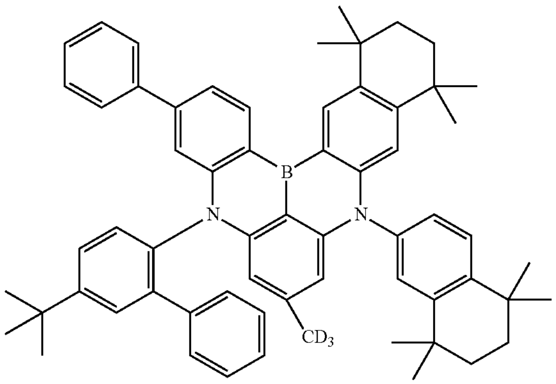
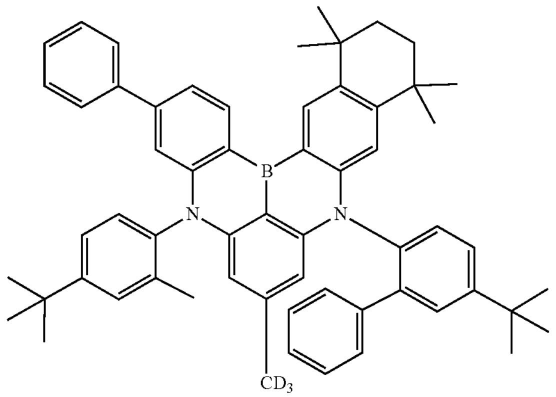
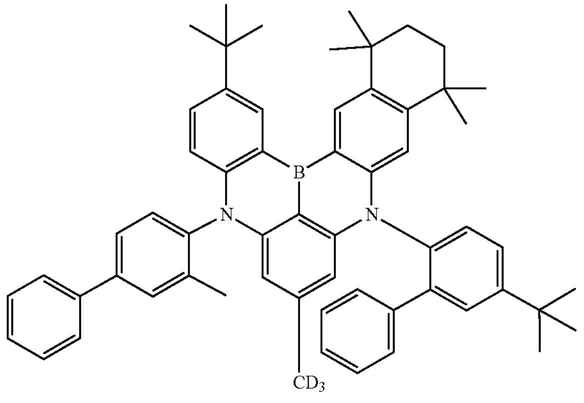
-continued
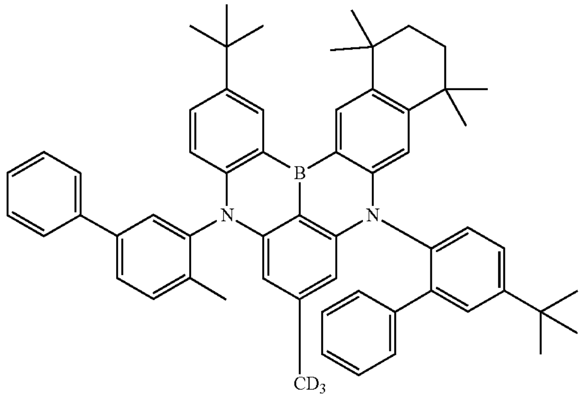
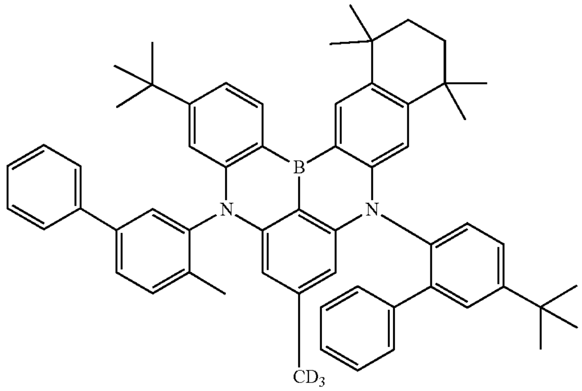
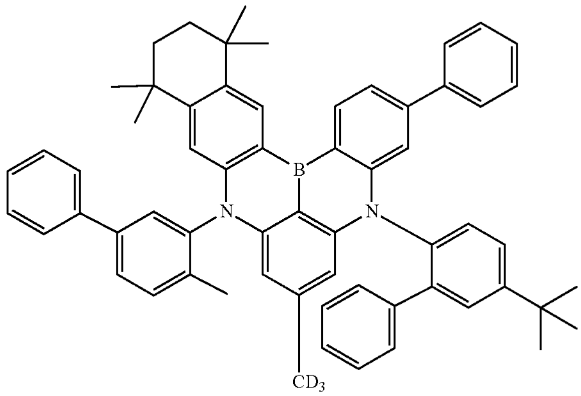
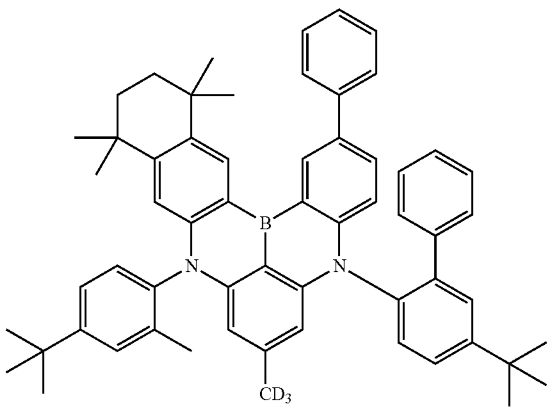

-continued
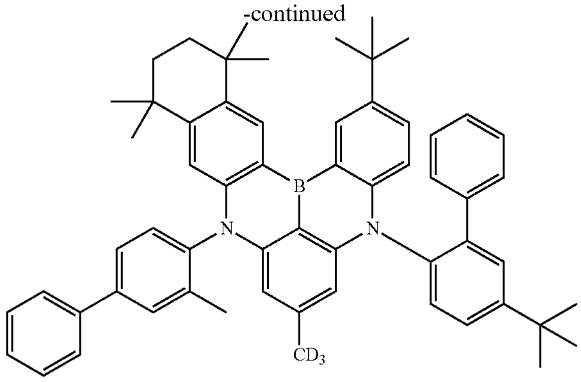
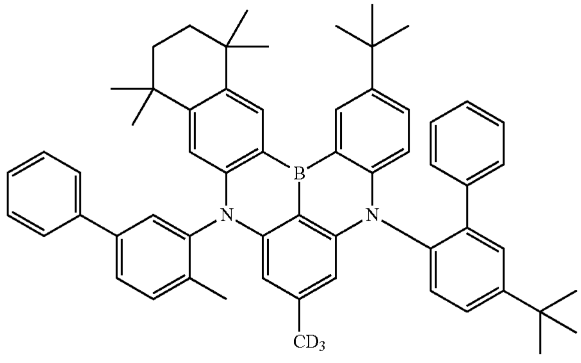
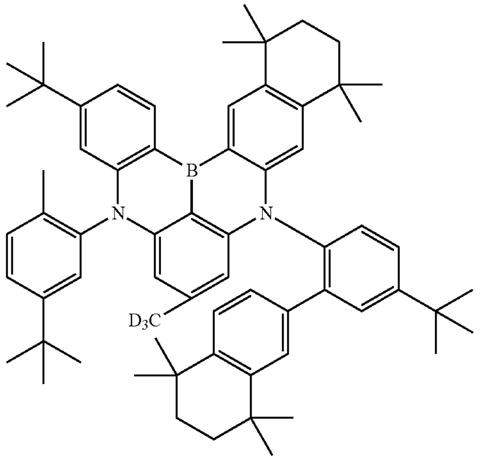
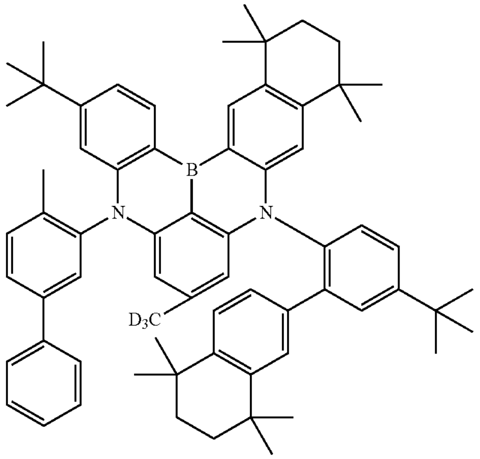
-continued
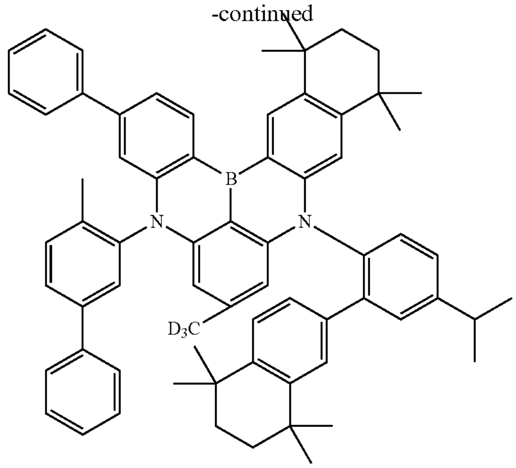
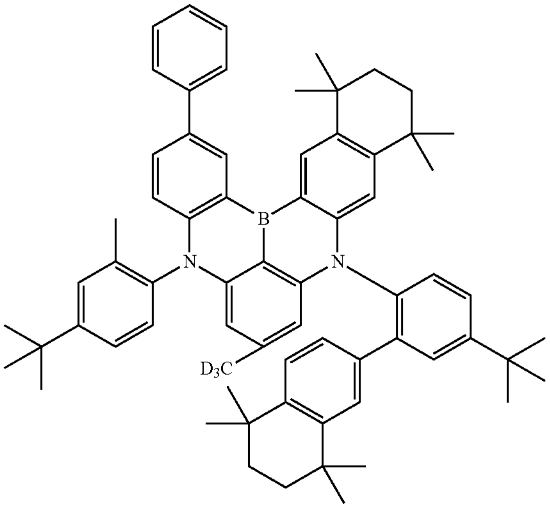
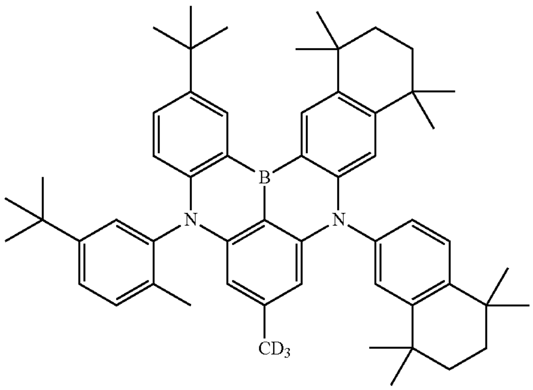

-continued
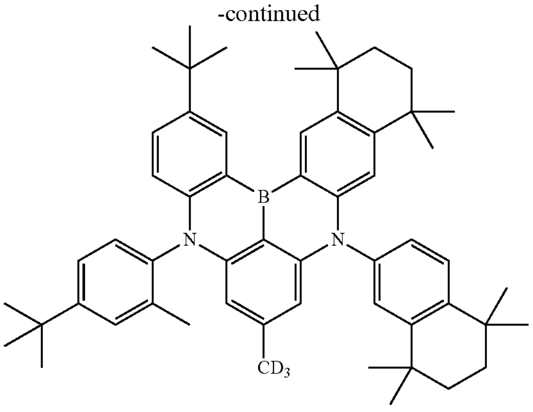
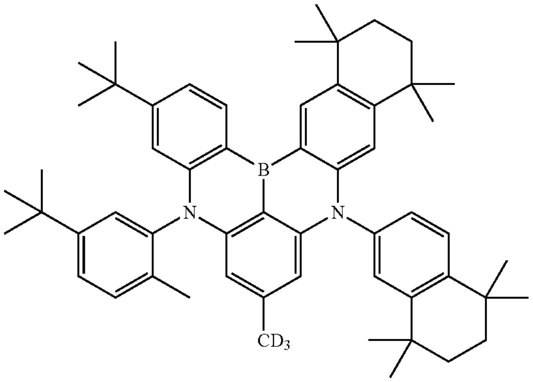
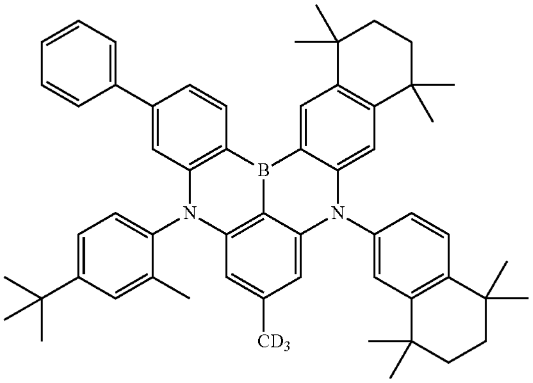
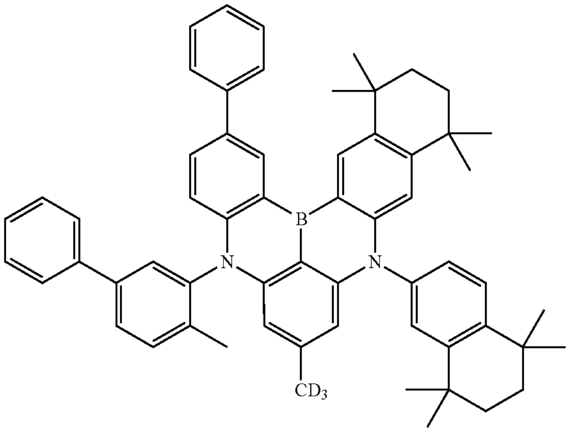
-continued
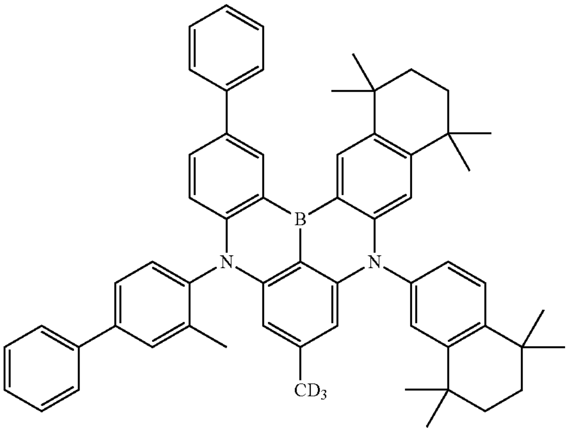
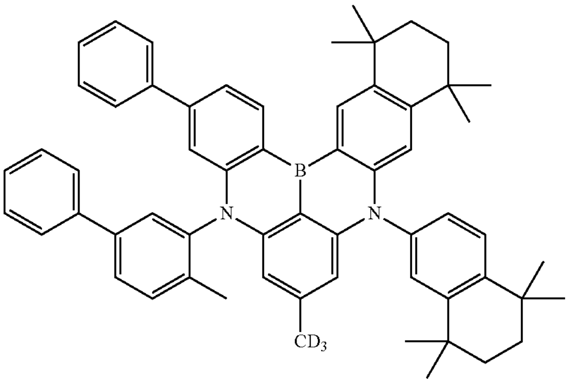
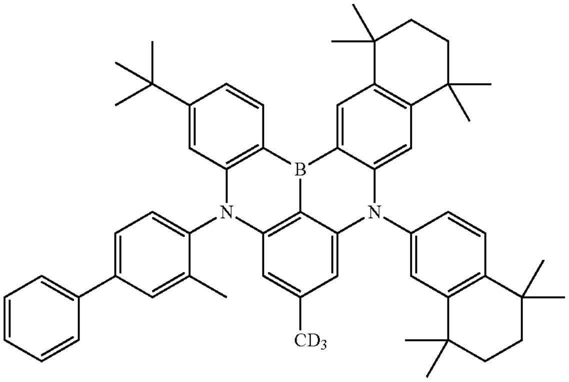
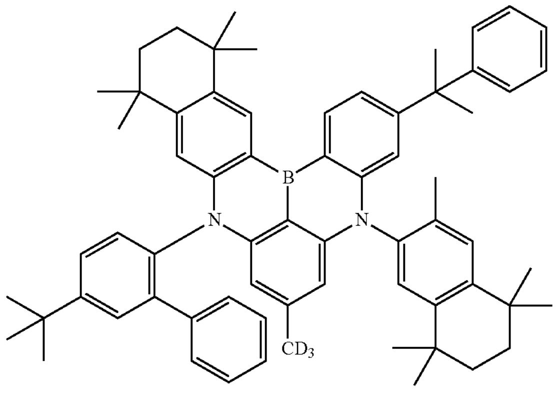

-continued
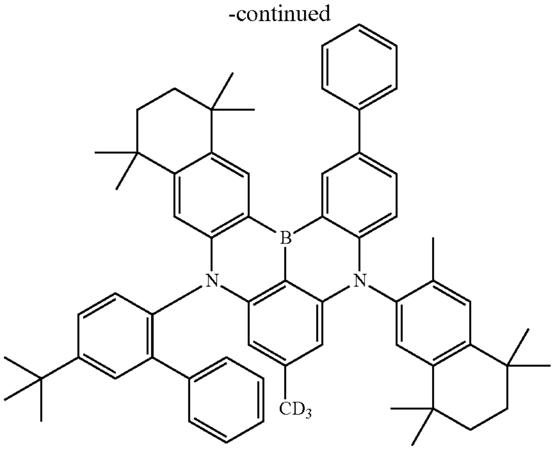
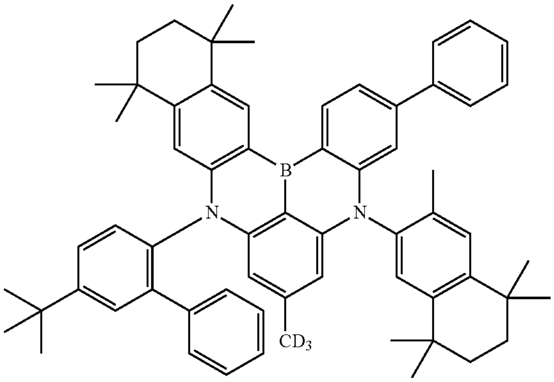
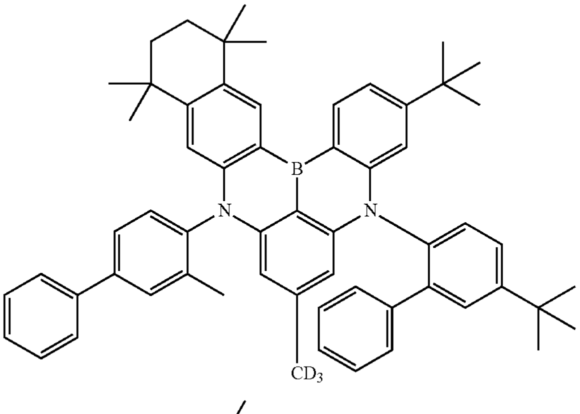
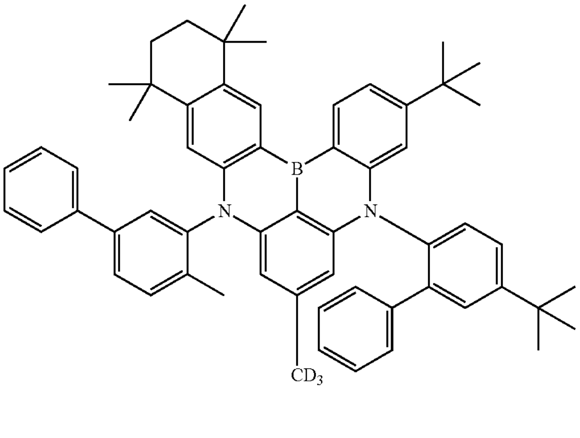
-continued
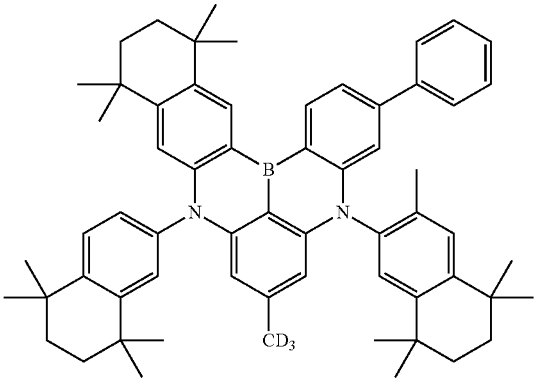
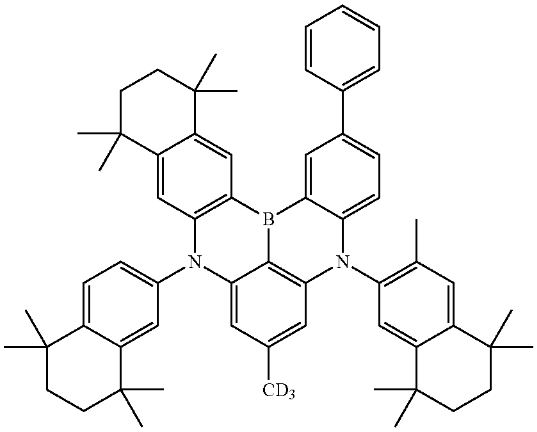
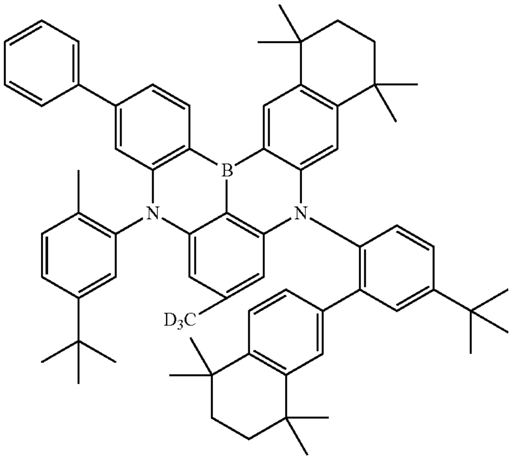
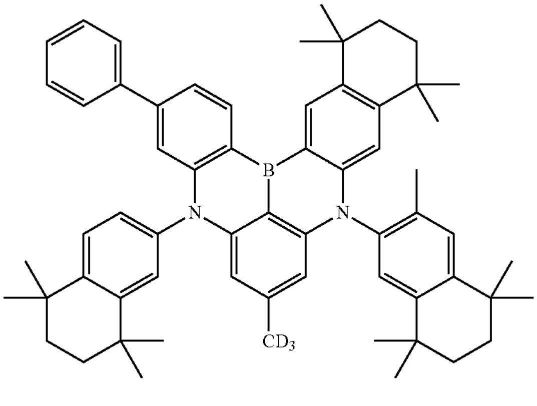

-continued
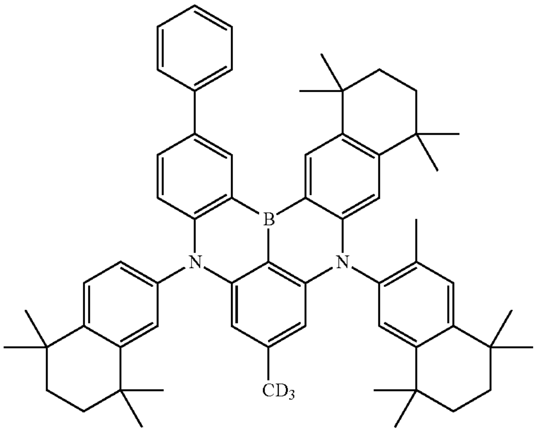
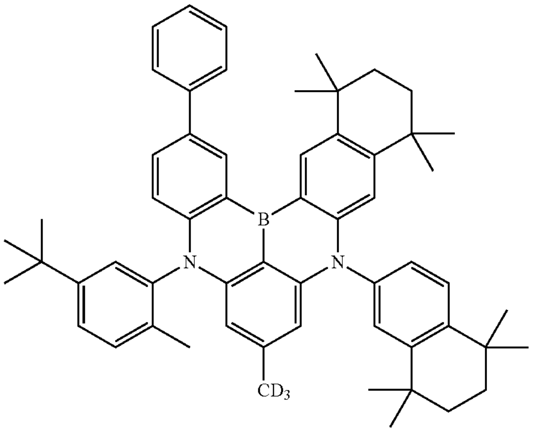
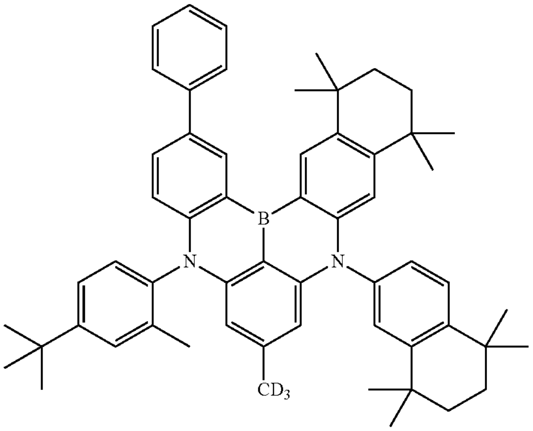
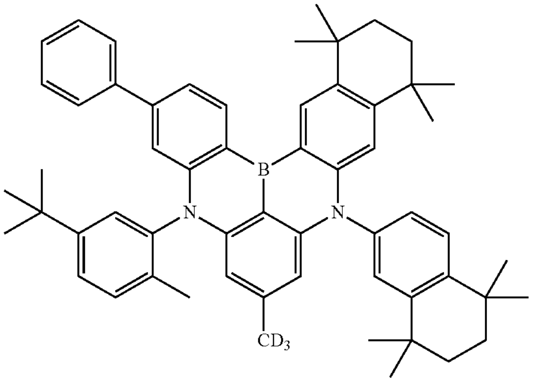
-continued
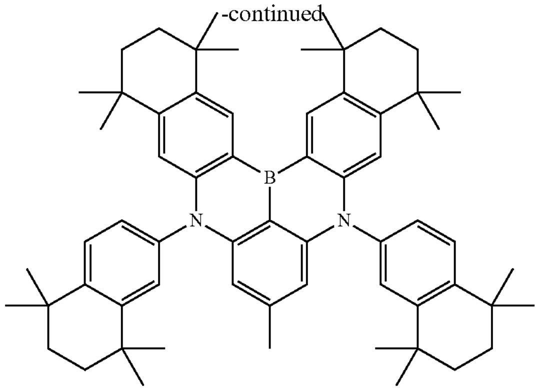
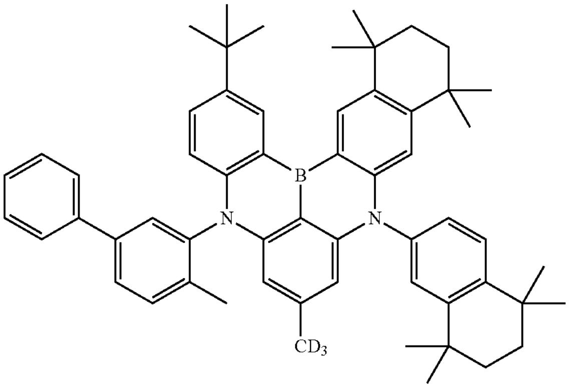
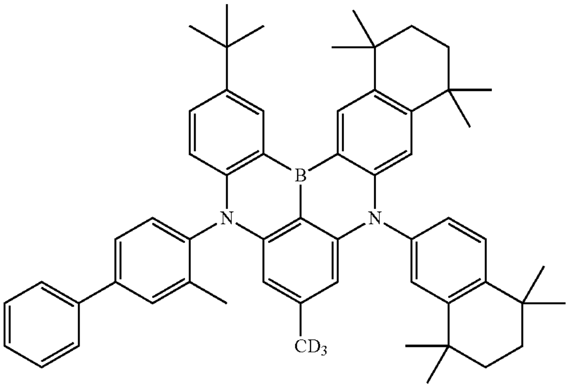
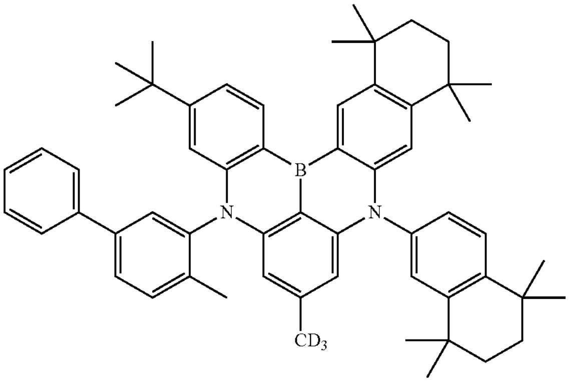

-continued
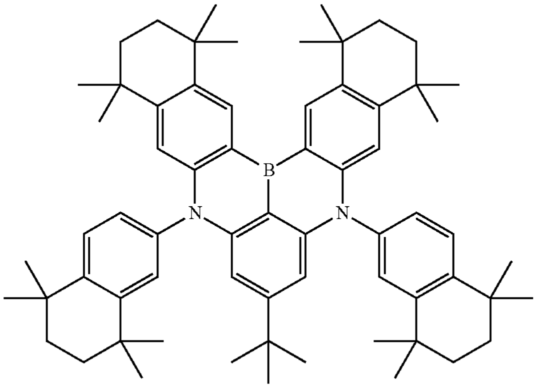
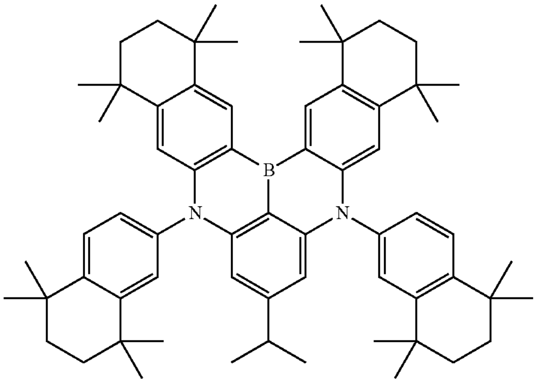
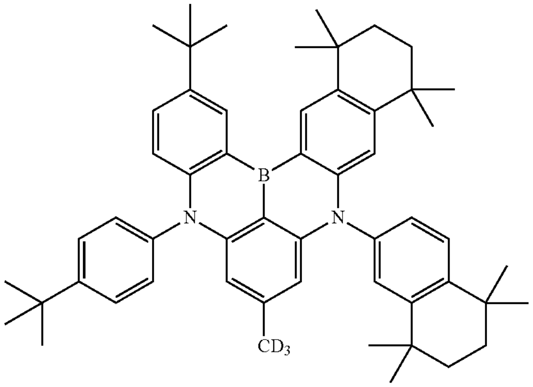
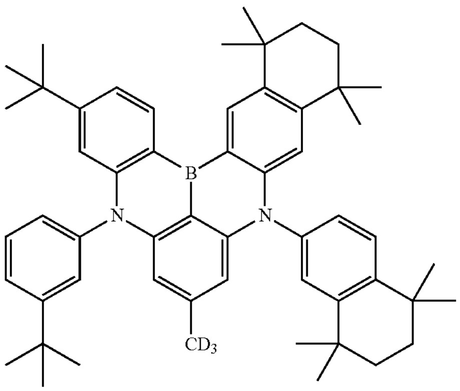
-continued
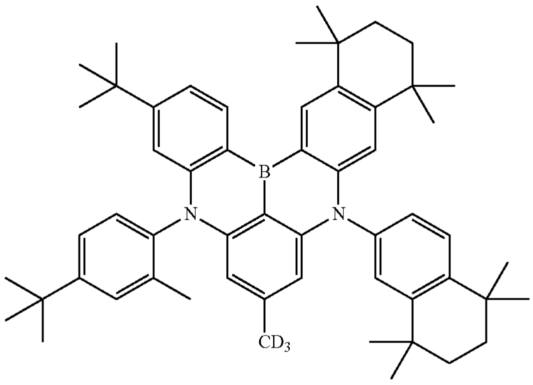
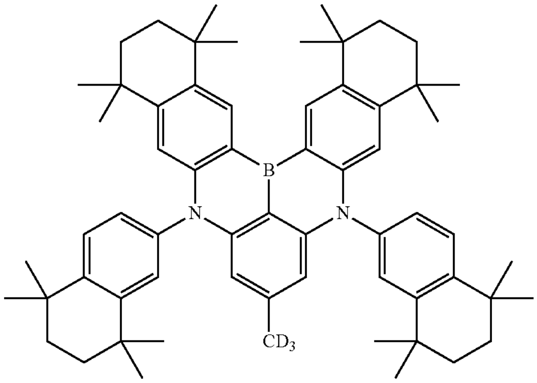
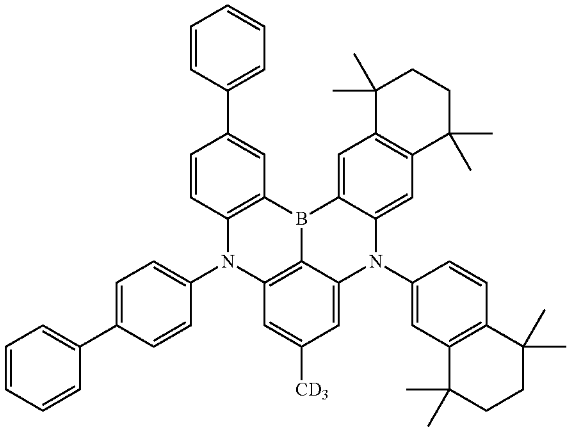
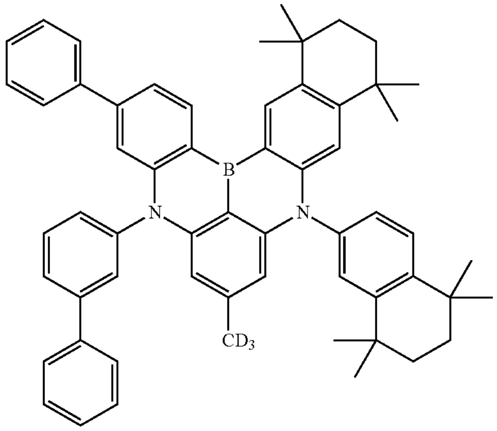

-continued
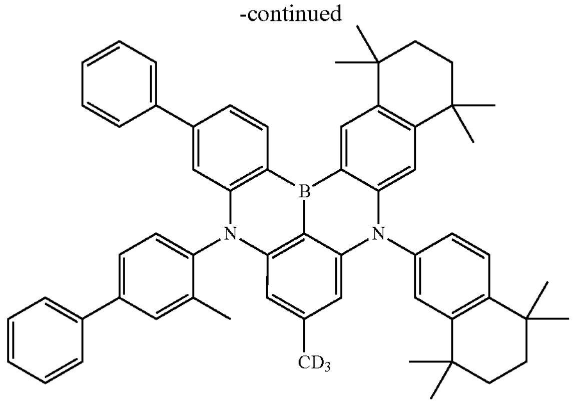
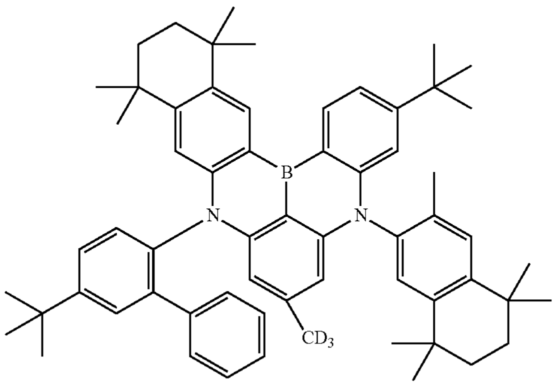
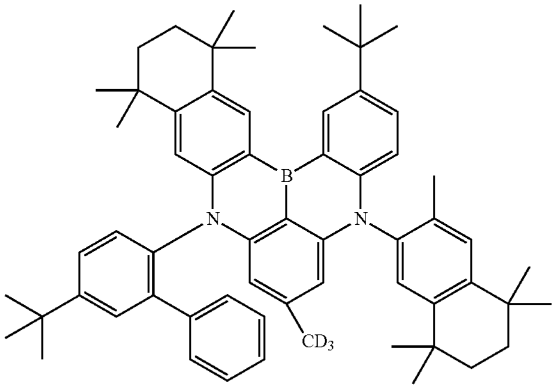
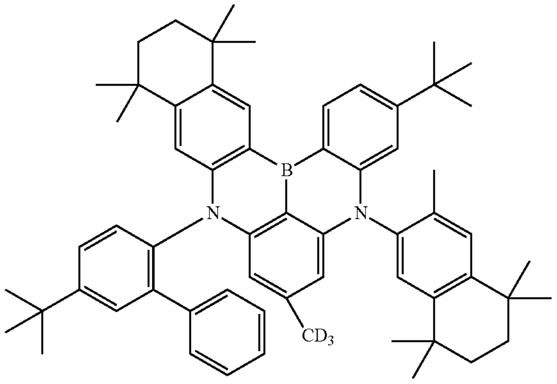
-continued
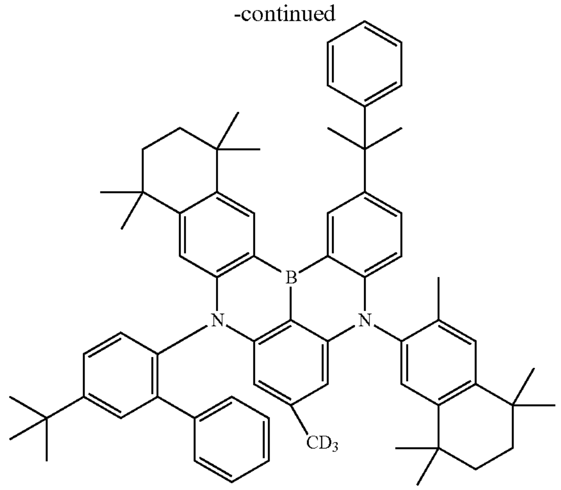
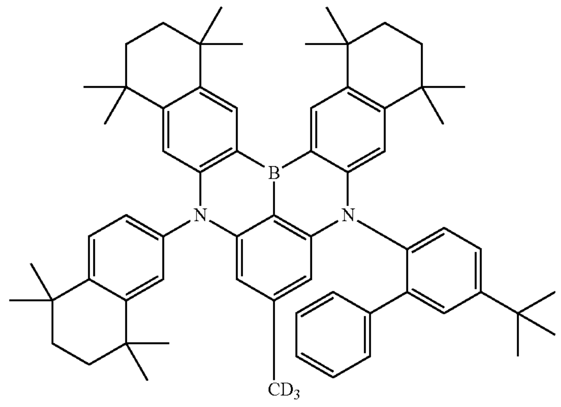
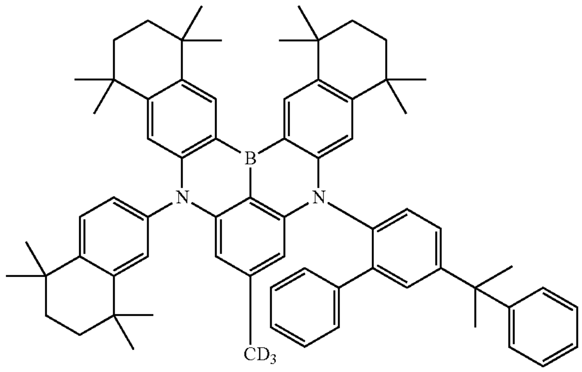
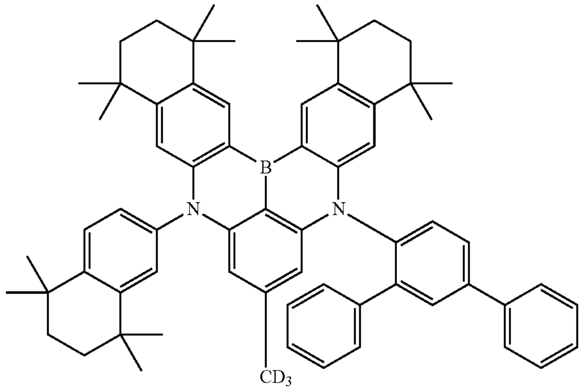

-continued
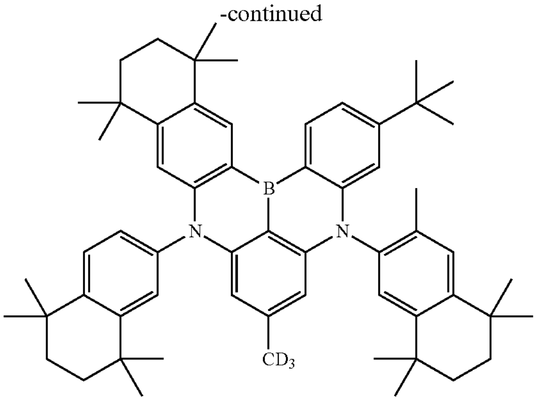
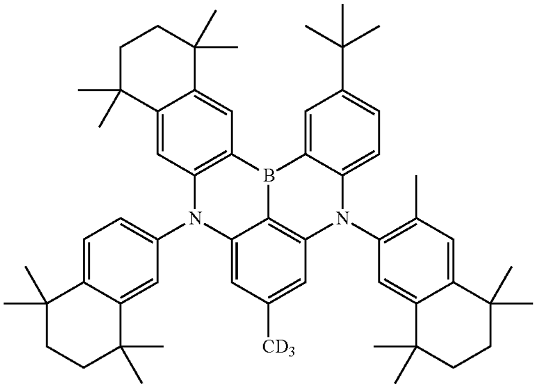
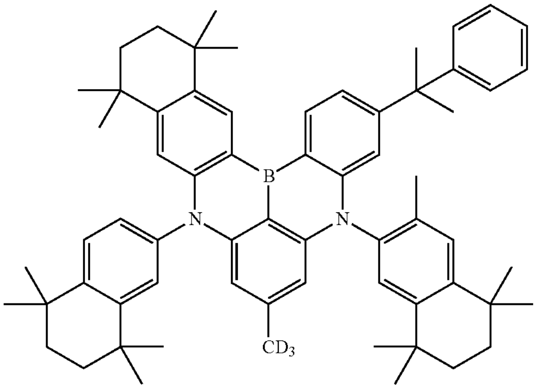
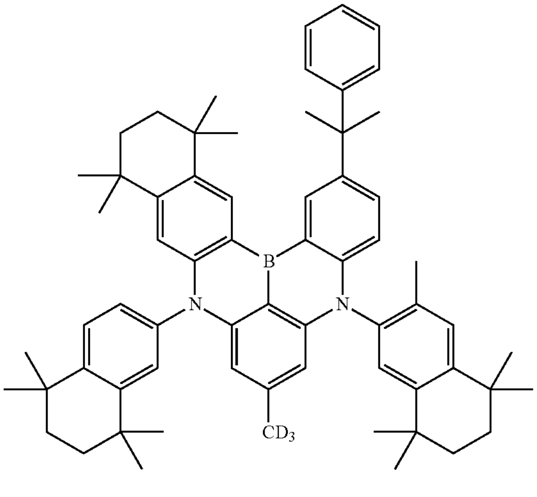
-continued
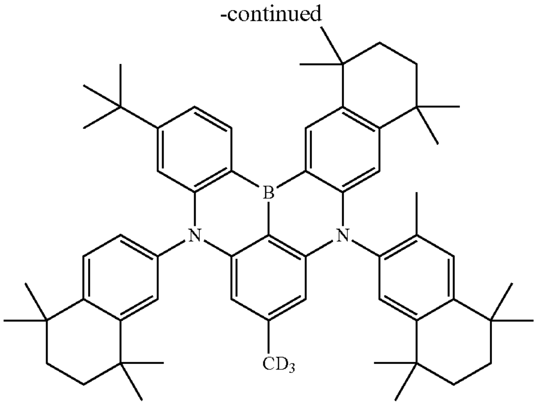
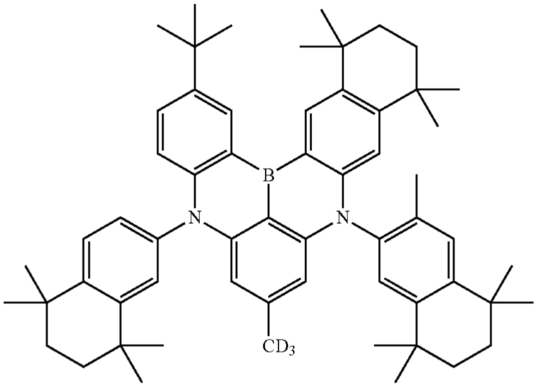
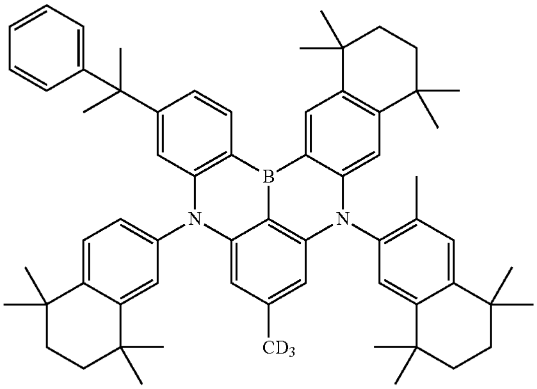
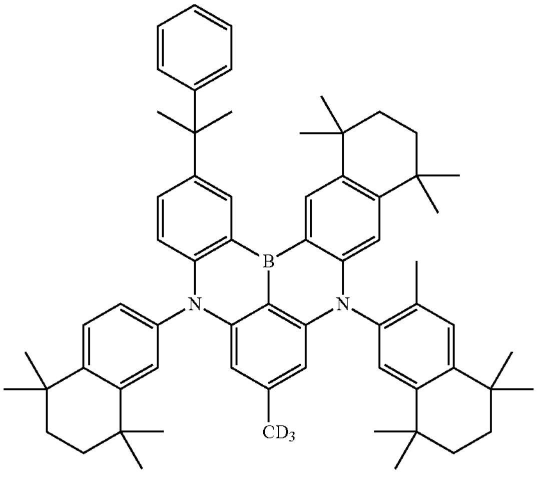

-continued
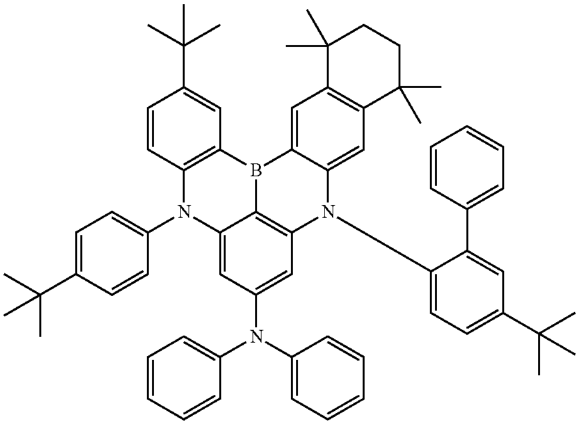
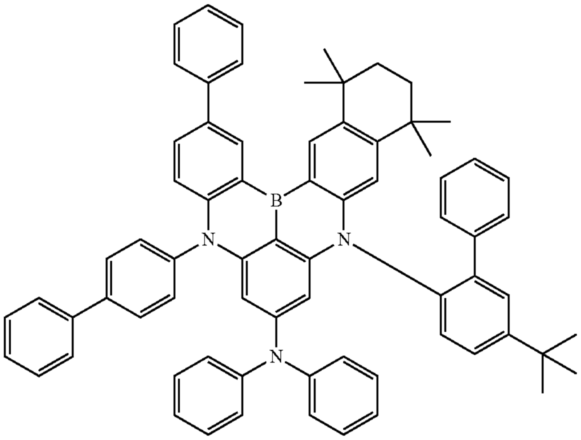
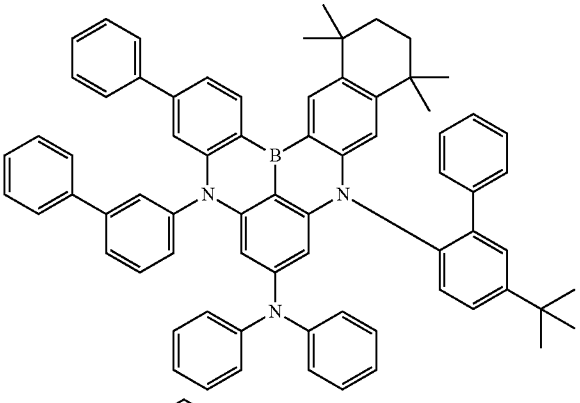
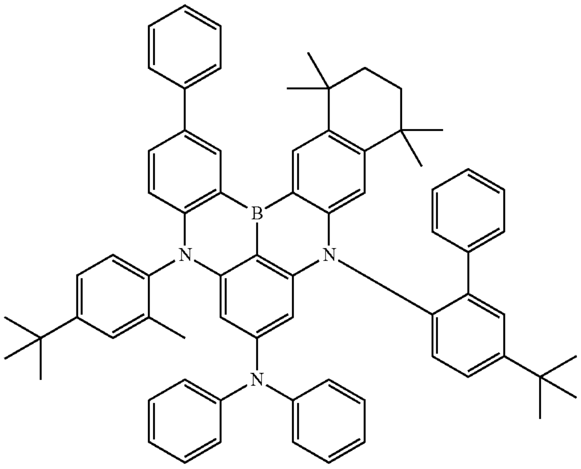
-continued
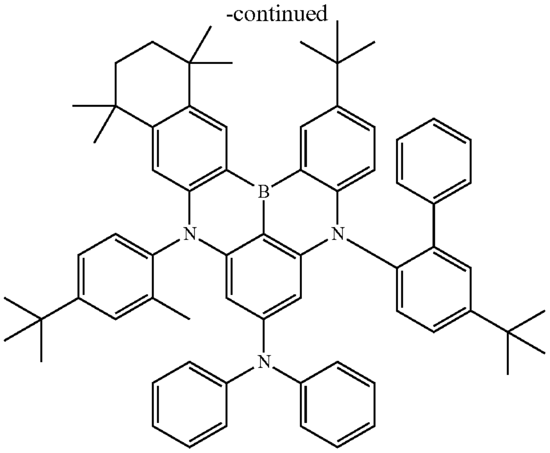
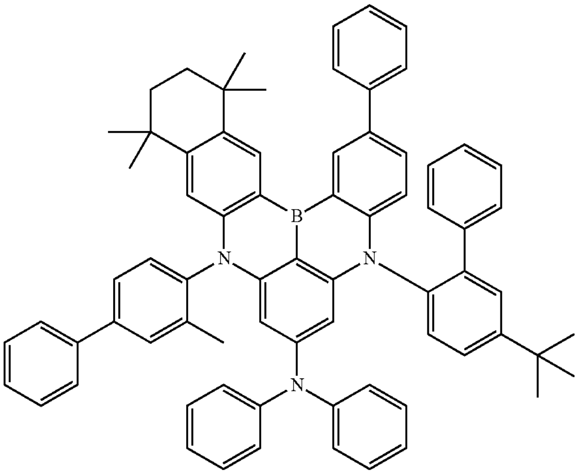
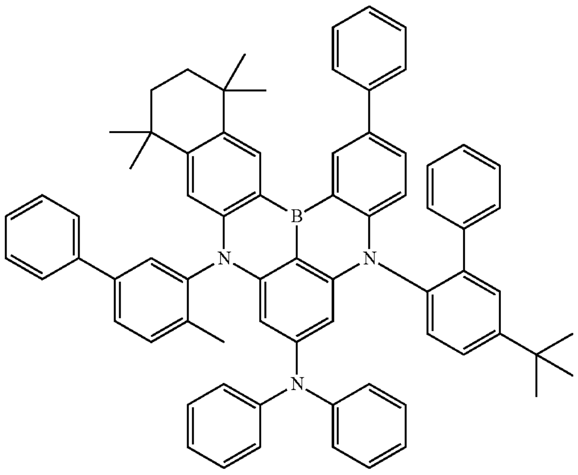

-continued
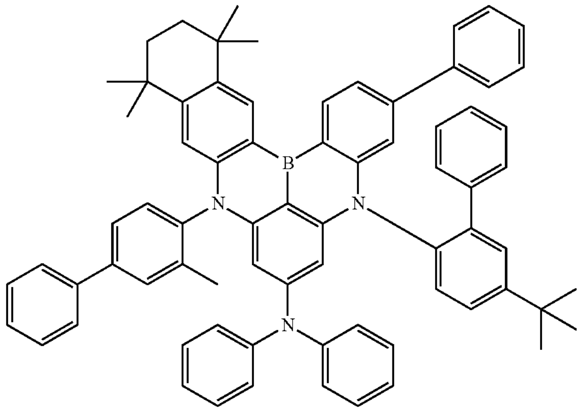
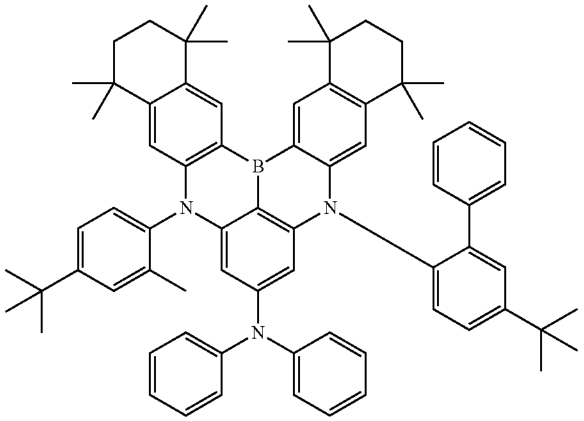
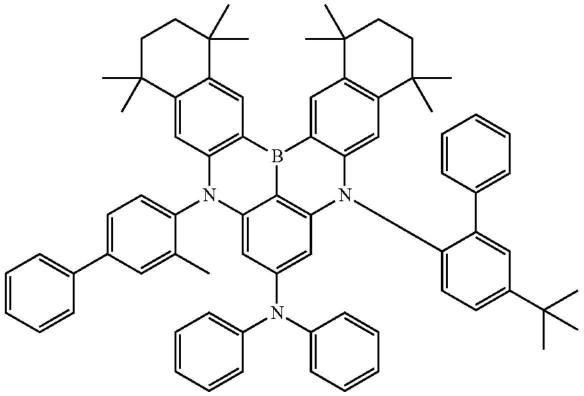
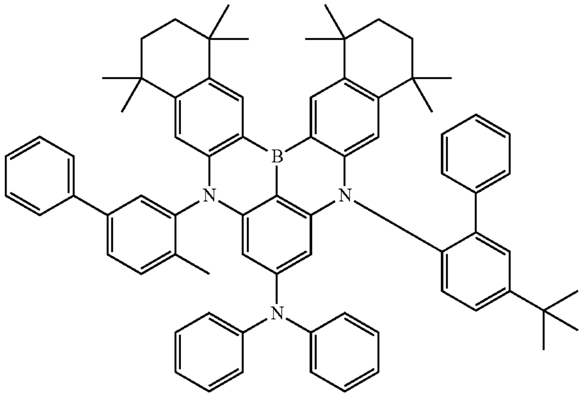
-continued
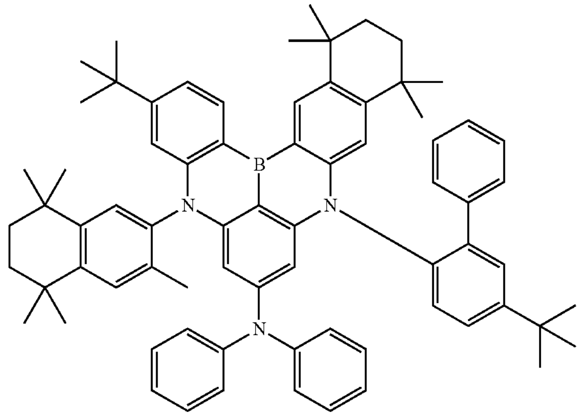
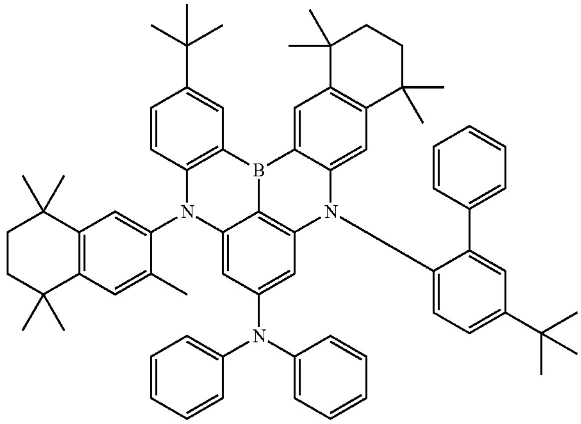
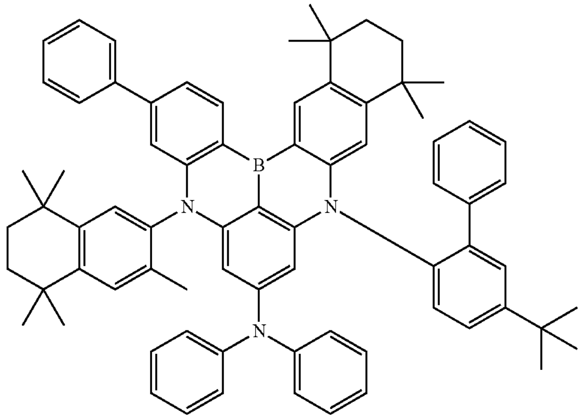
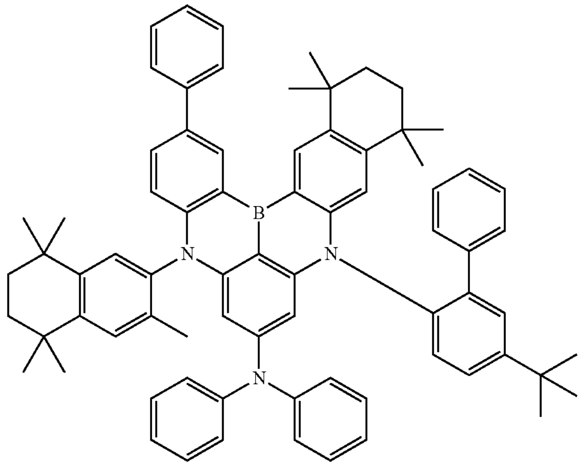

-continued
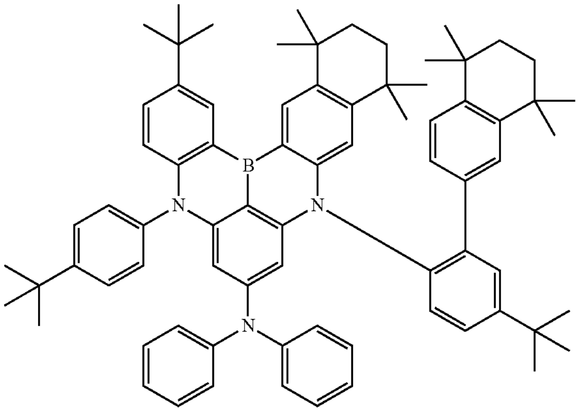
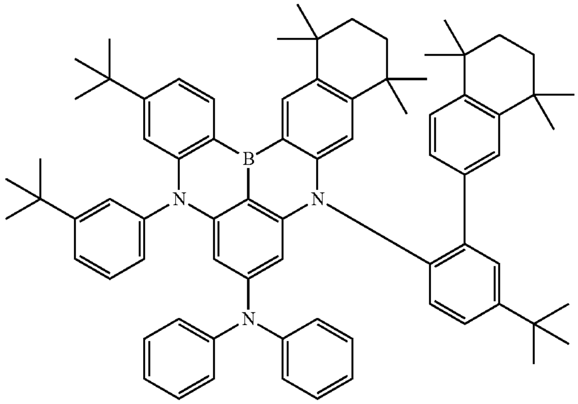
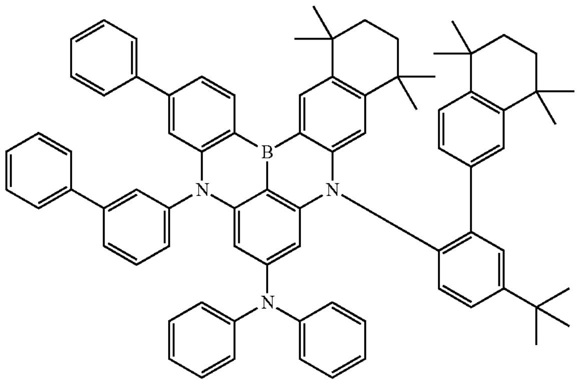
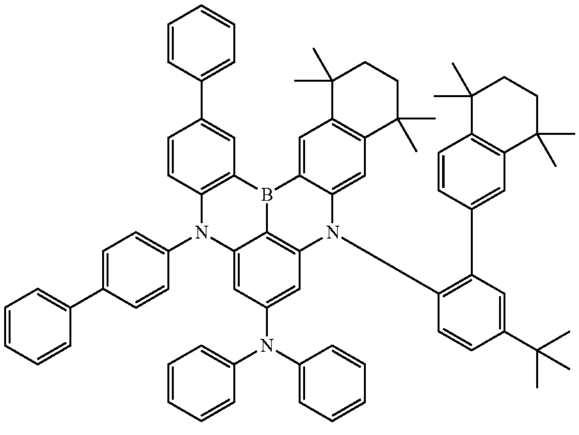
-continued
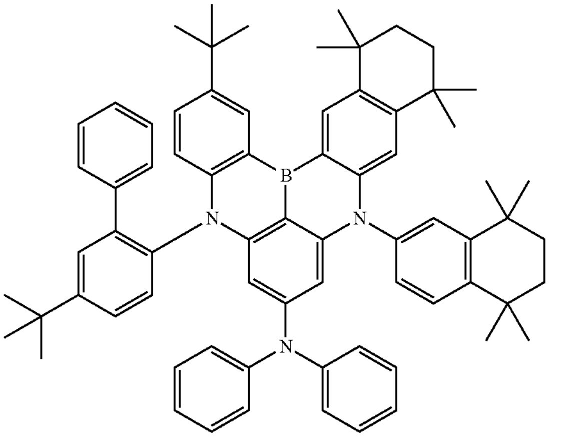
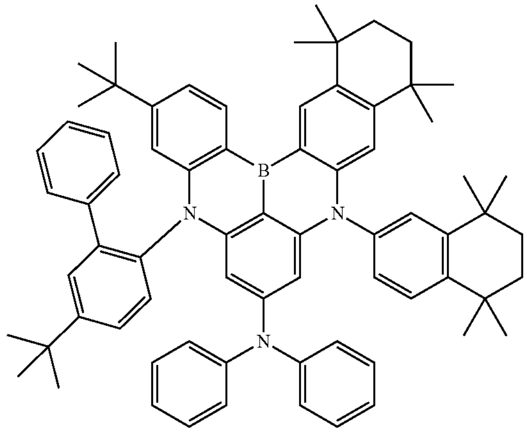
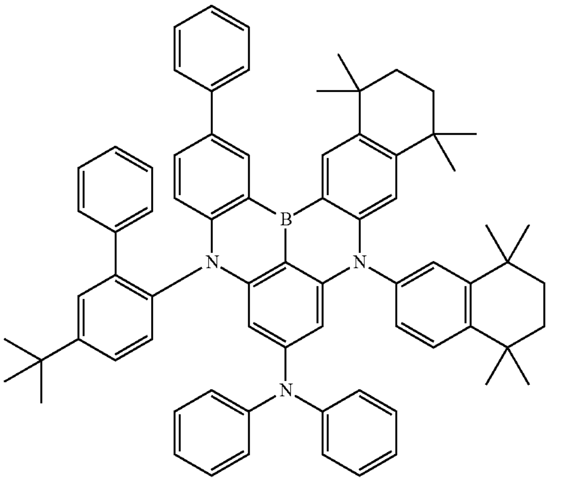

-continued
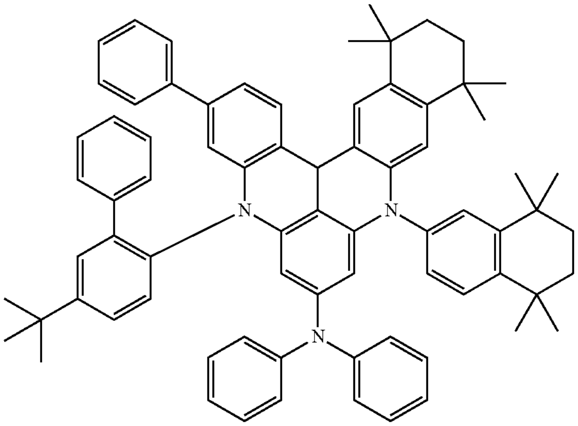
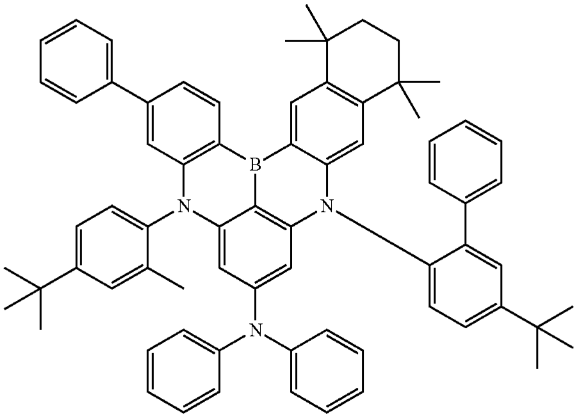
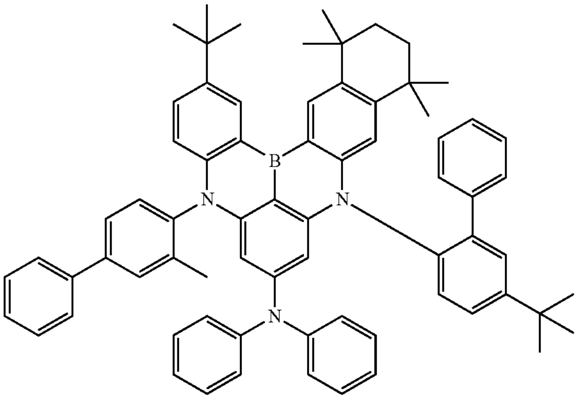
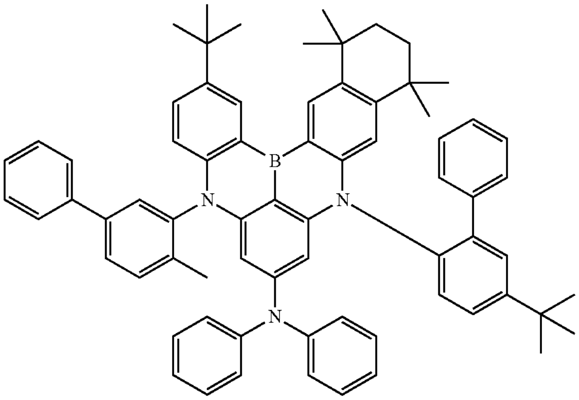
-continued
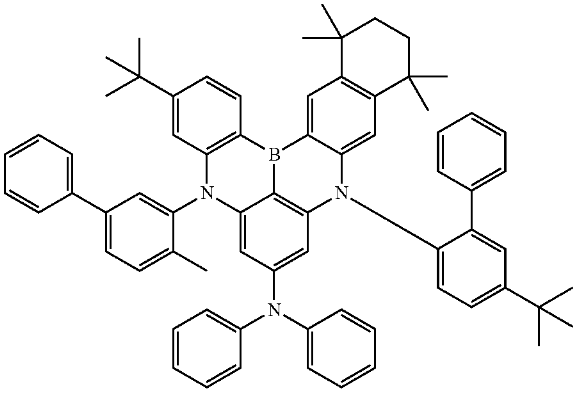
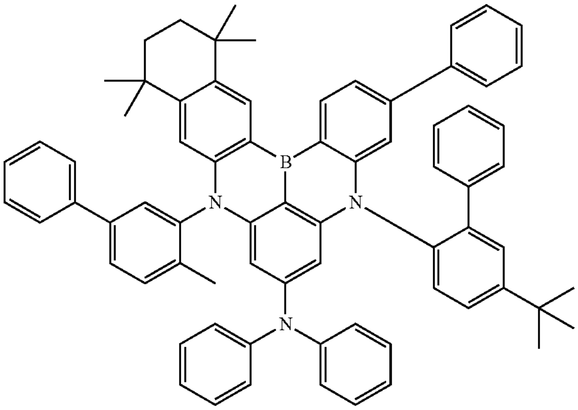
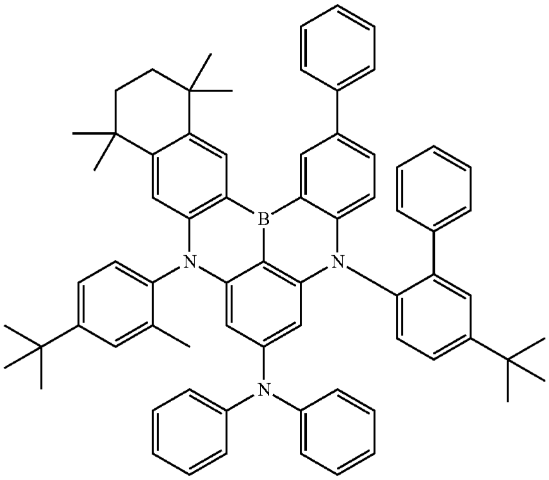
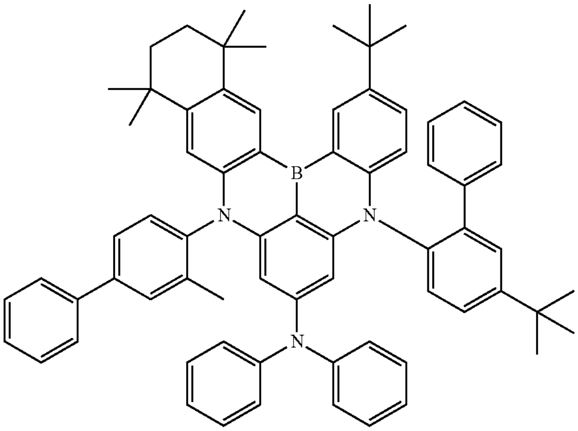

-continued
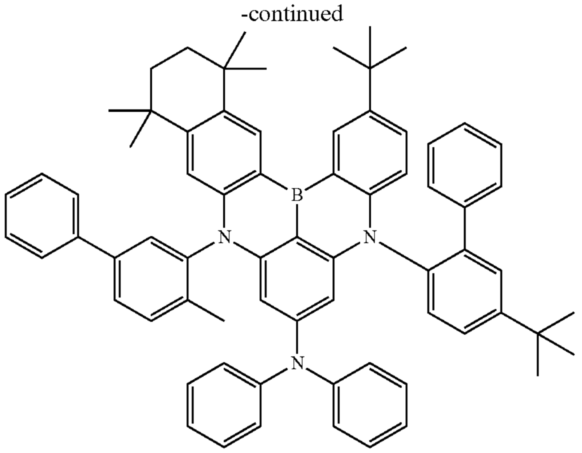
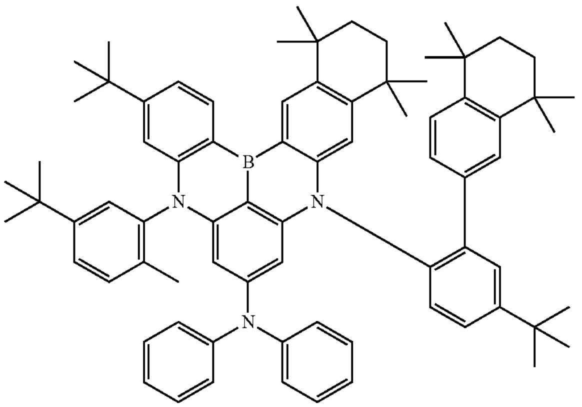
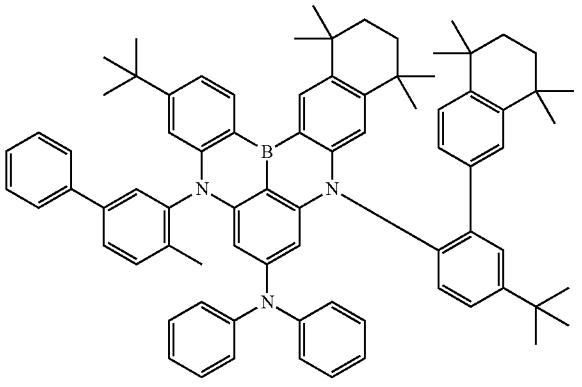
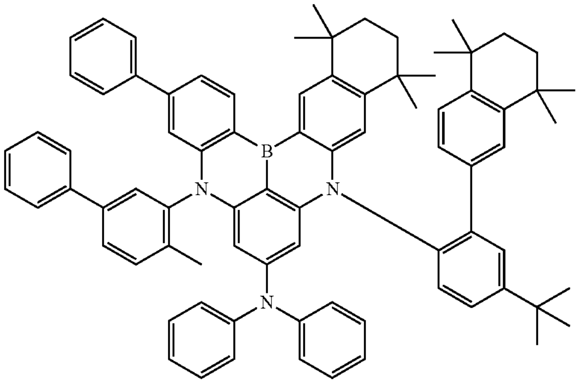
-continued
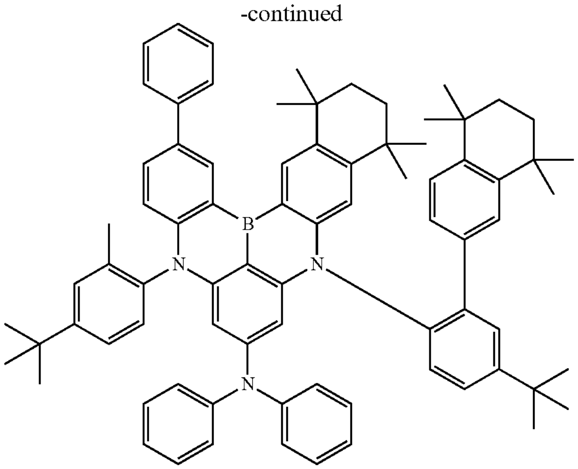
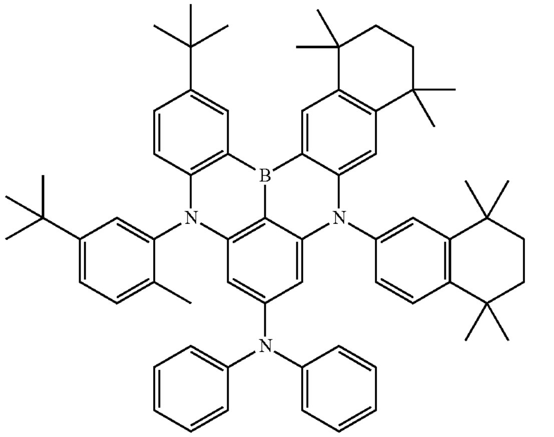
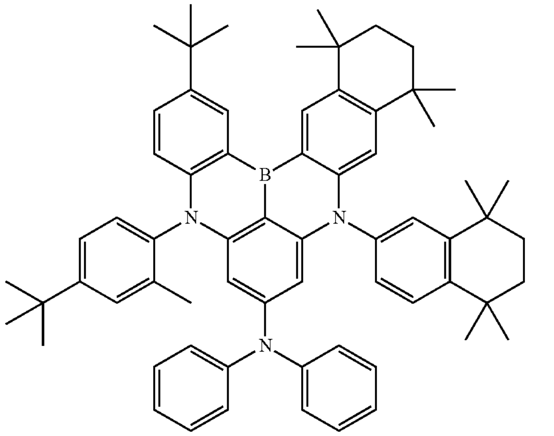

-continued
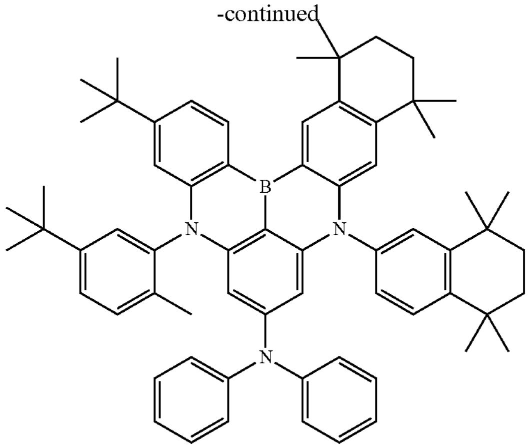
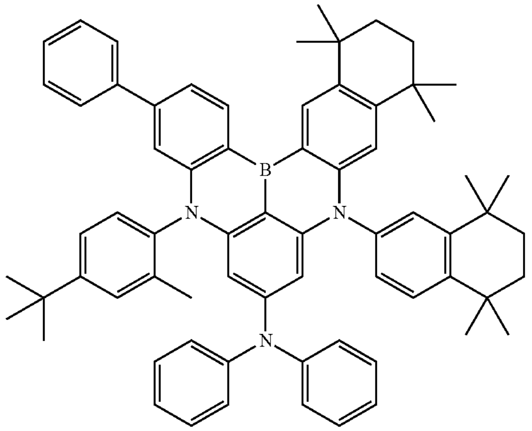
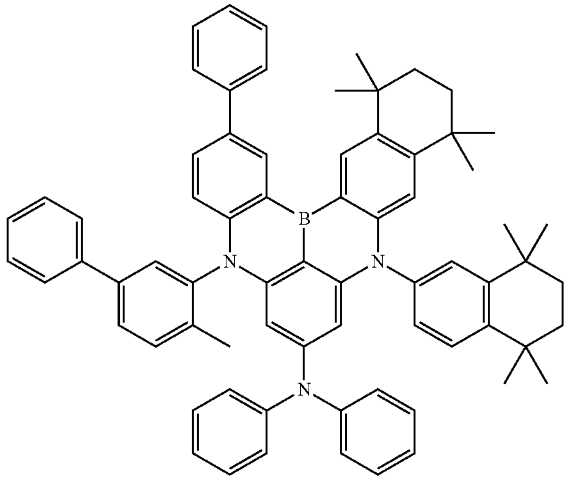
-continued
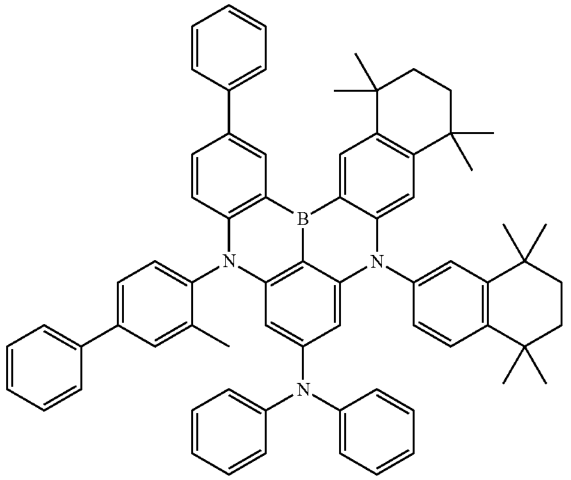
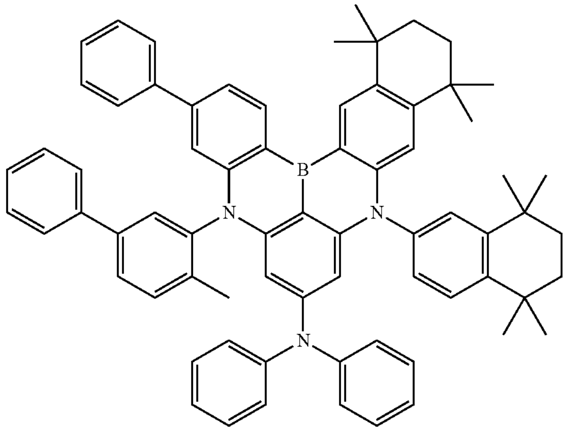
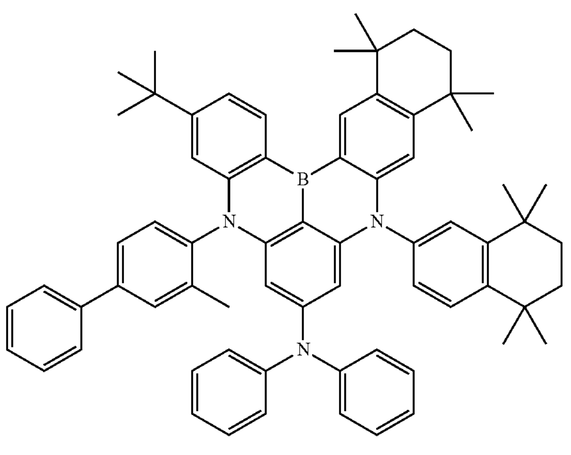

-continued
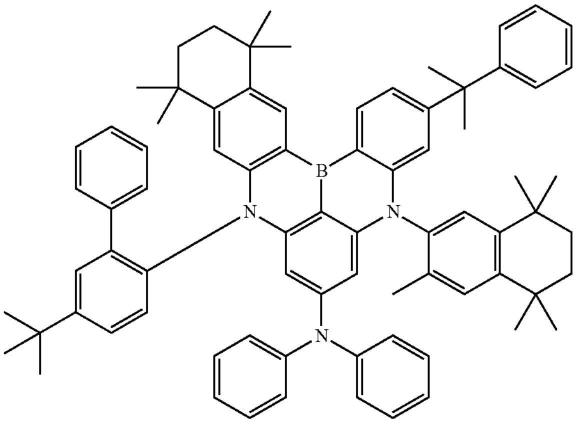
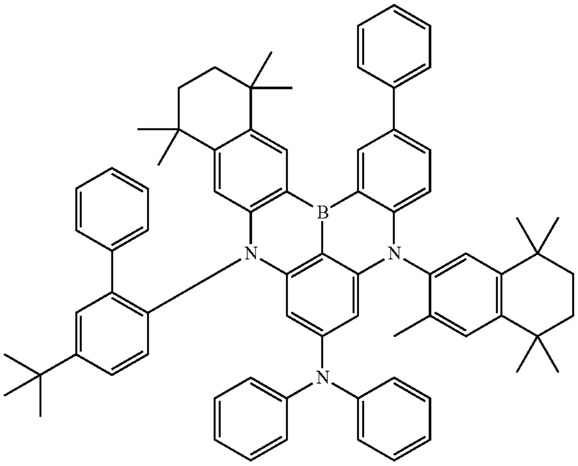
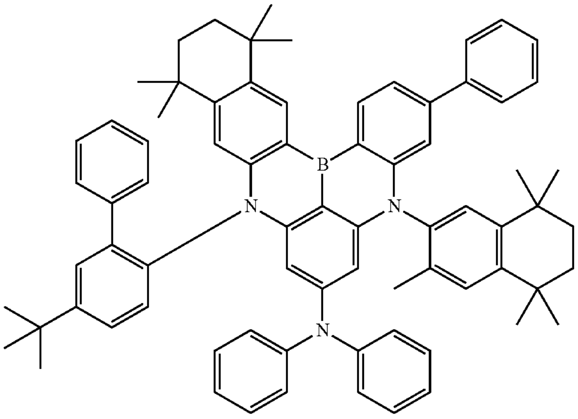
-continued
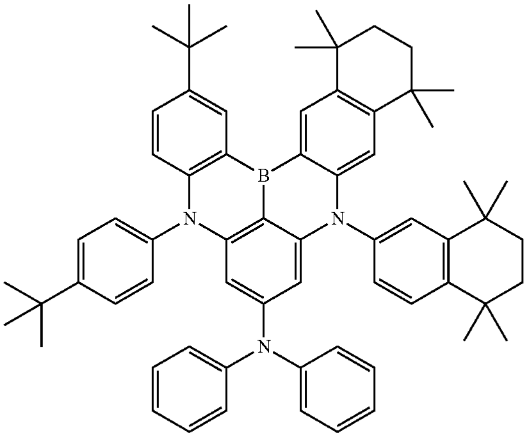
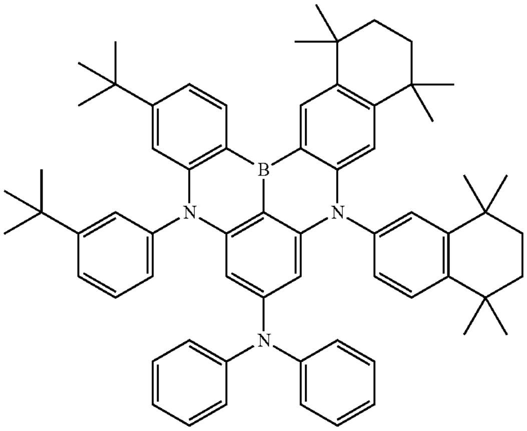
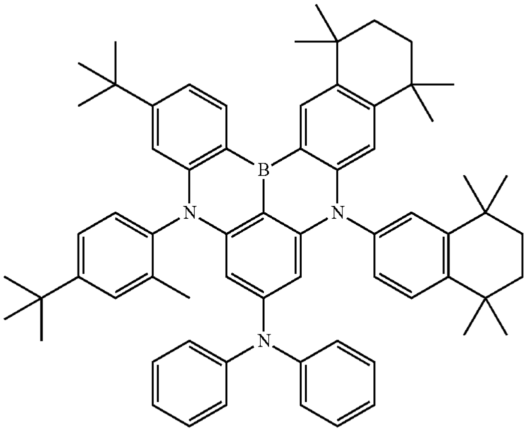

-continued
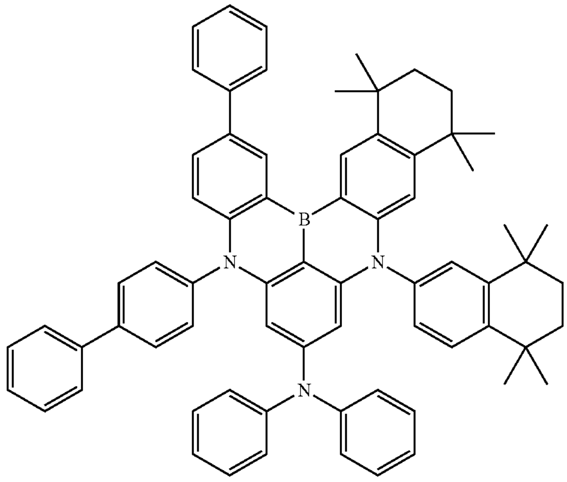
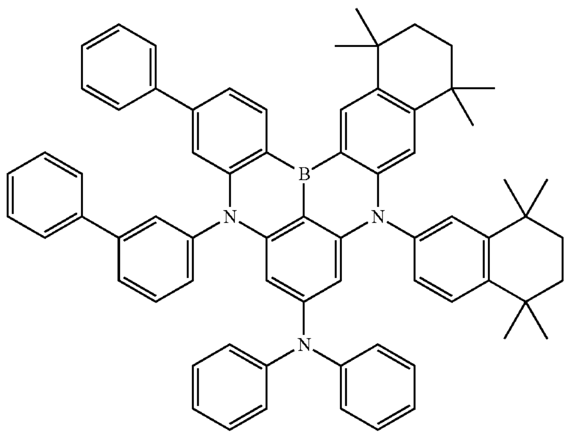
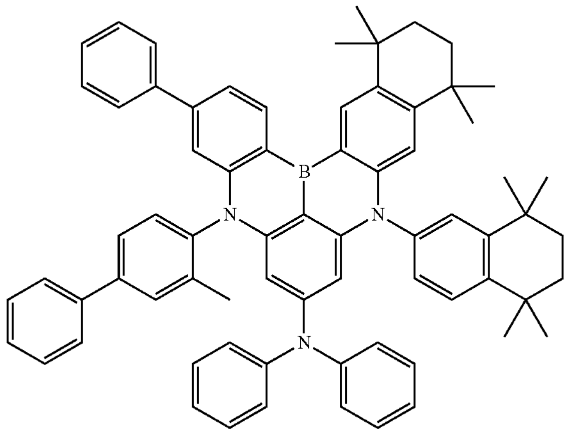
-continued
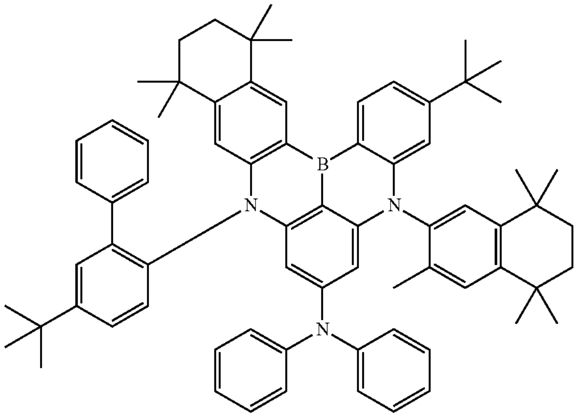
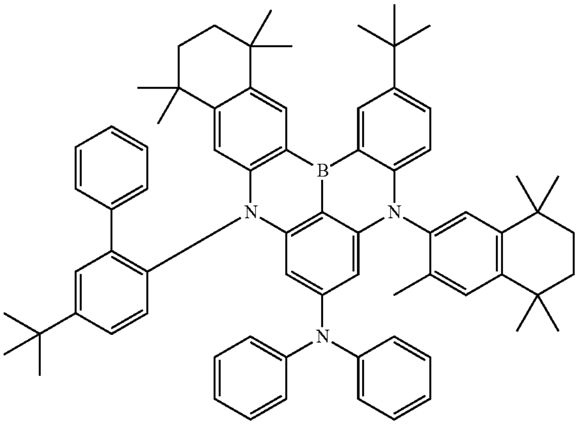
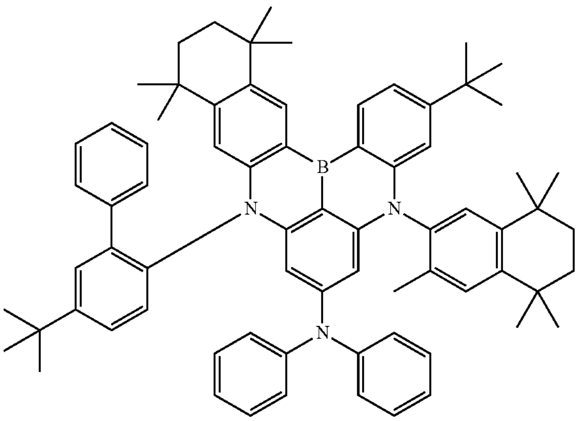

-continued
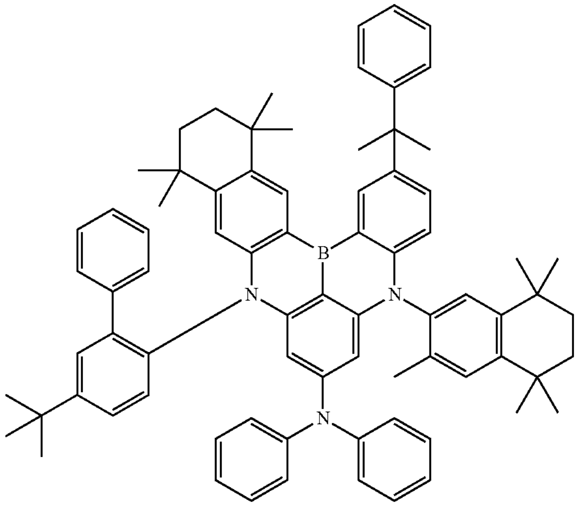
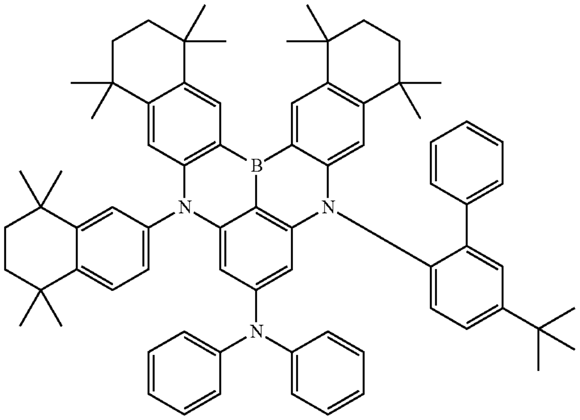
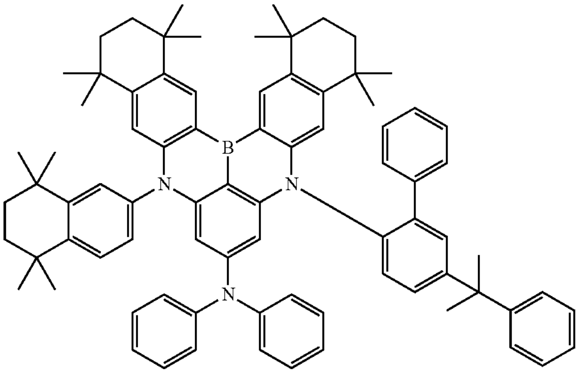
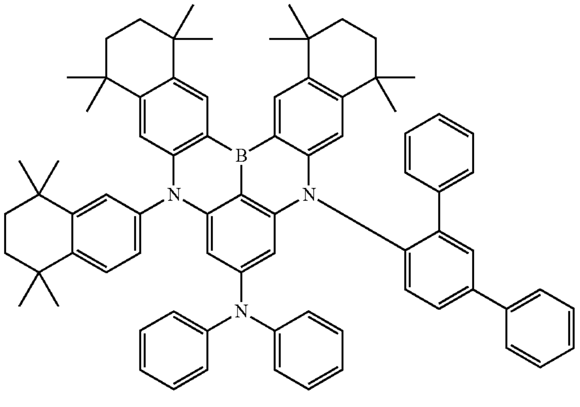
-continued
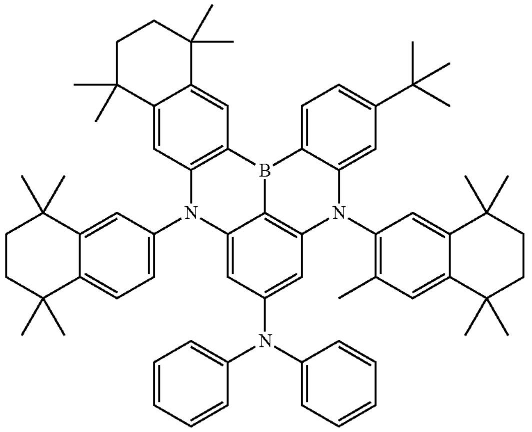
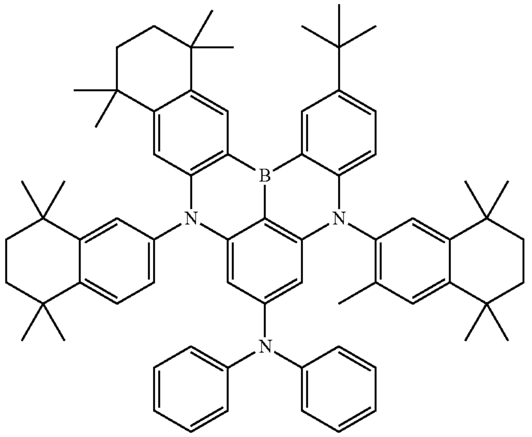
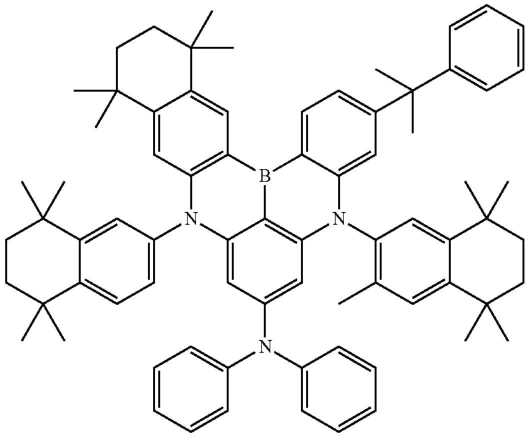

-continued
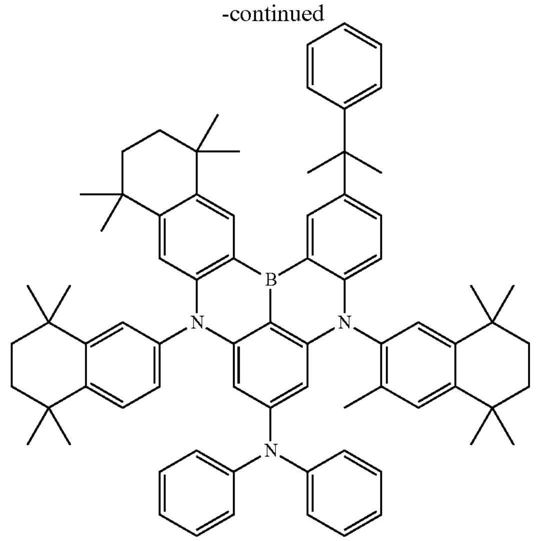
-continued
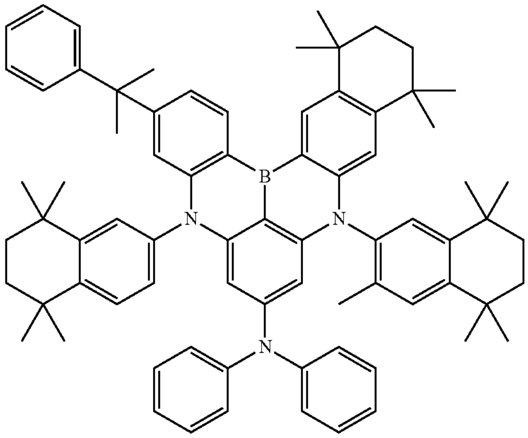
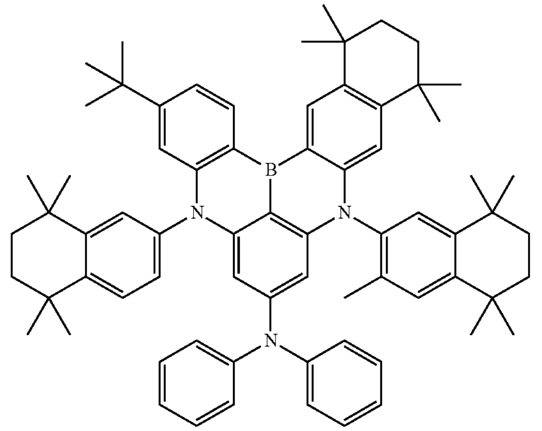
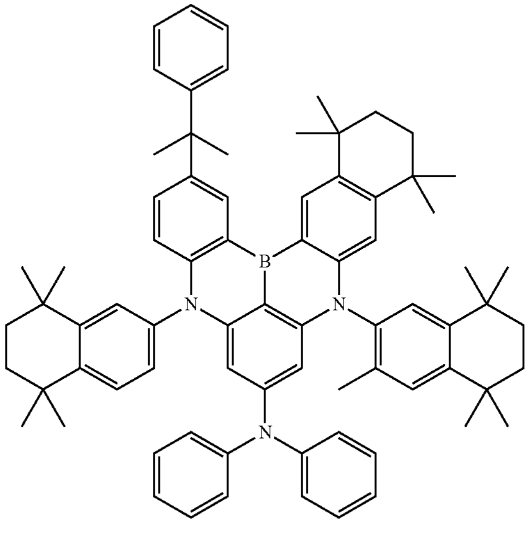
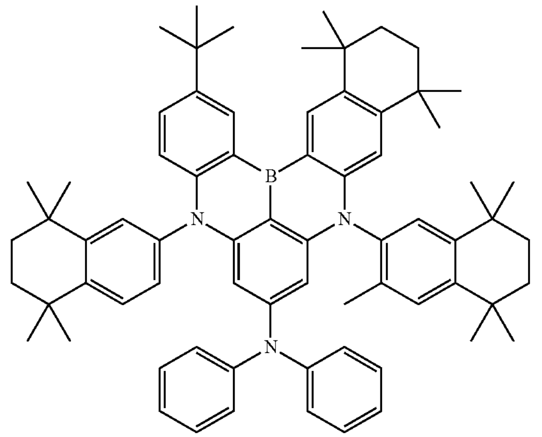
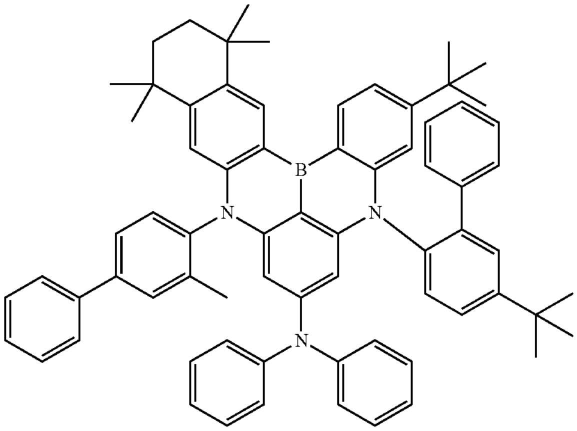

-continued
-continued
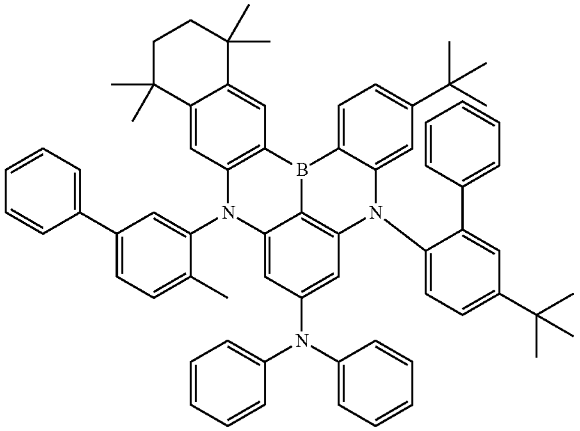
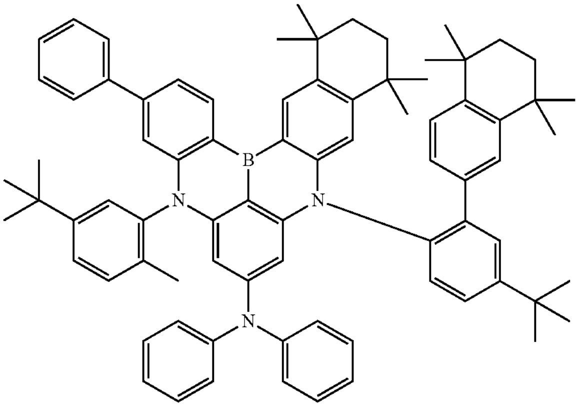
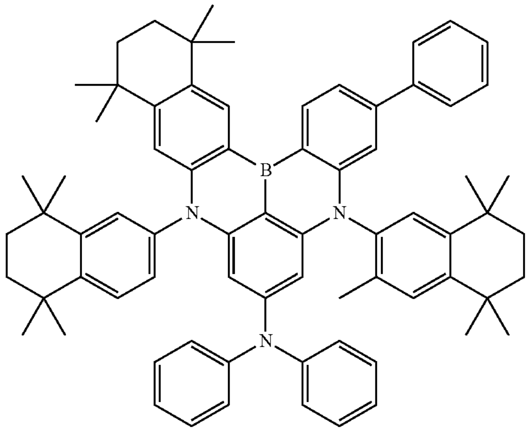
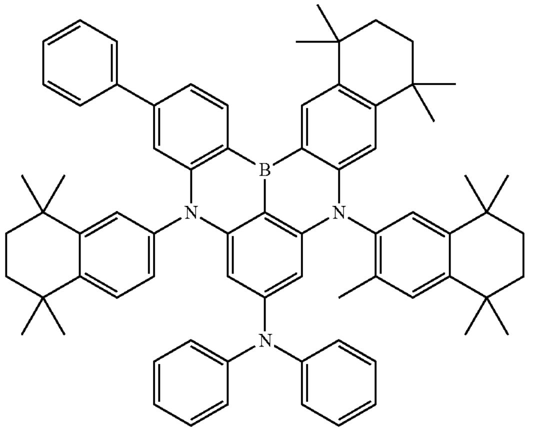
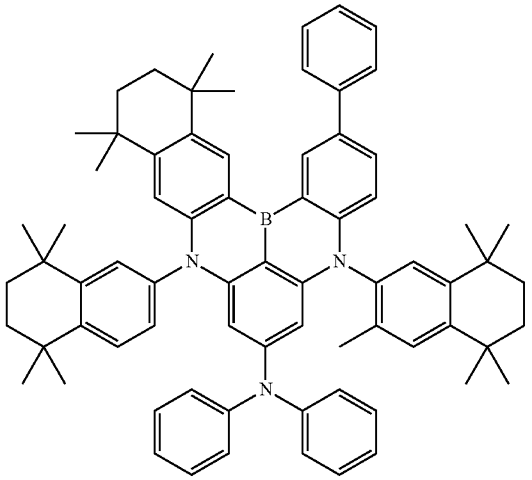
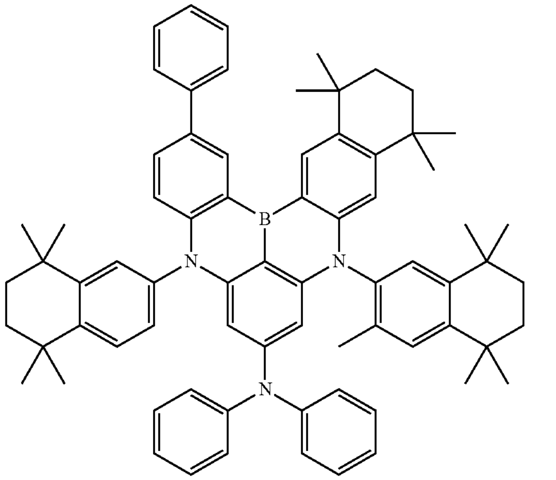

-continued
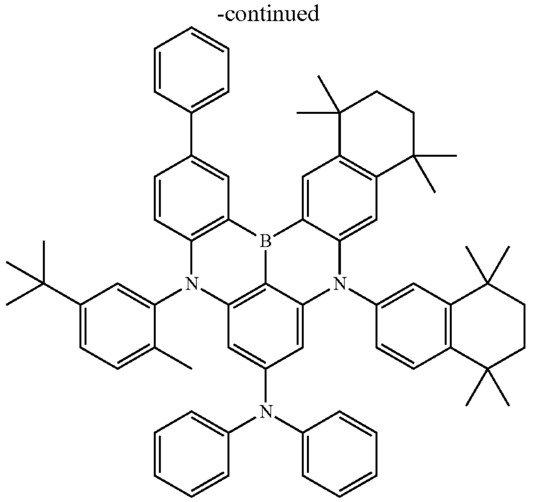
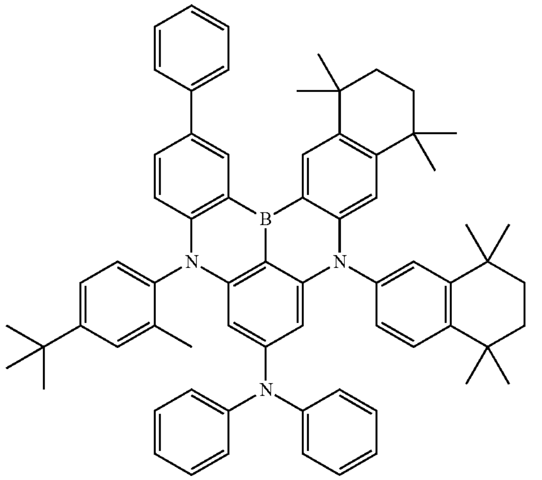
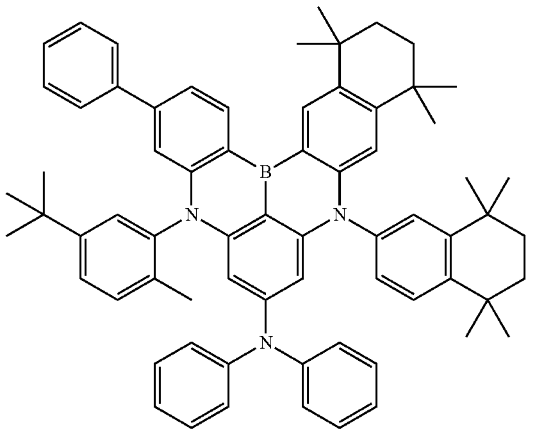
-continued
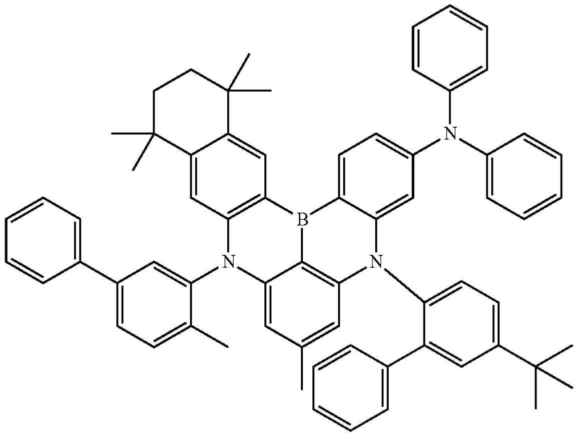
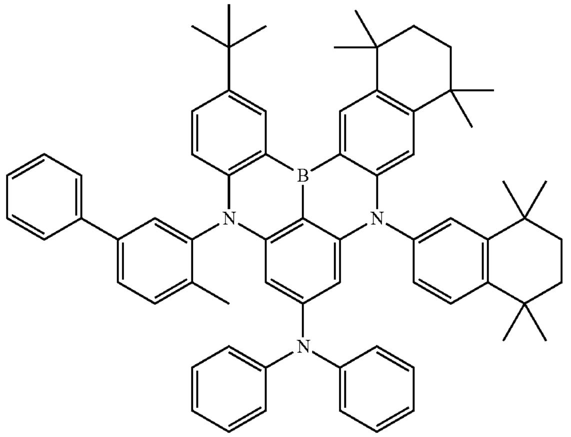
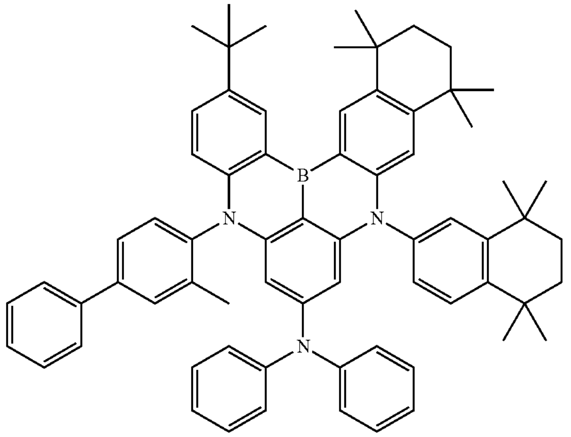

-continued
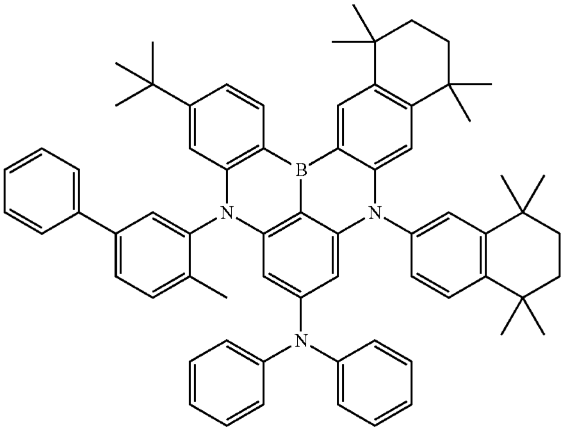
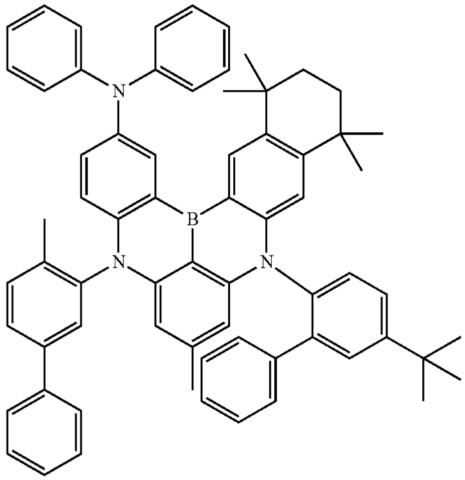
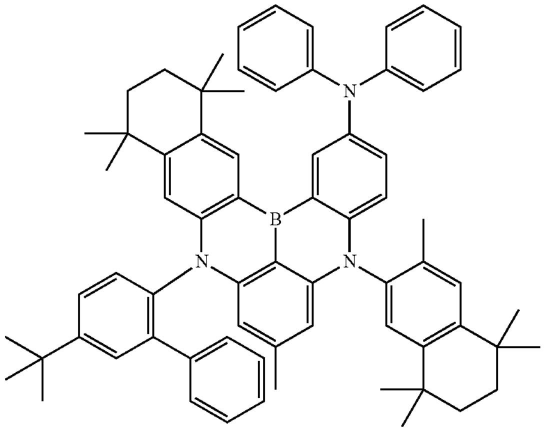
-continued
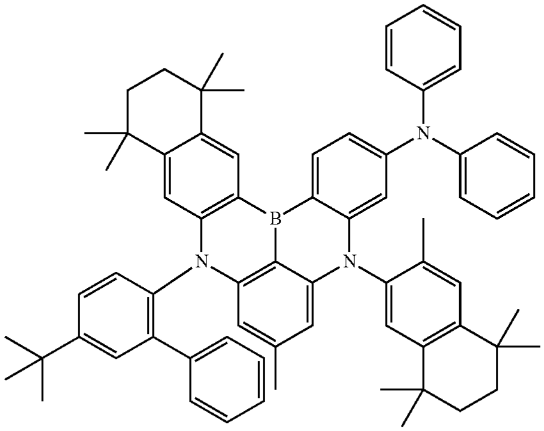
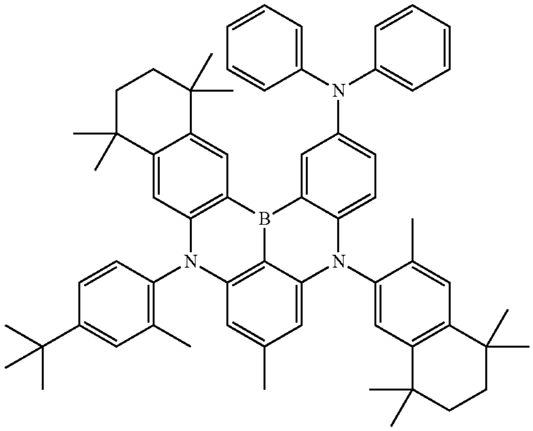
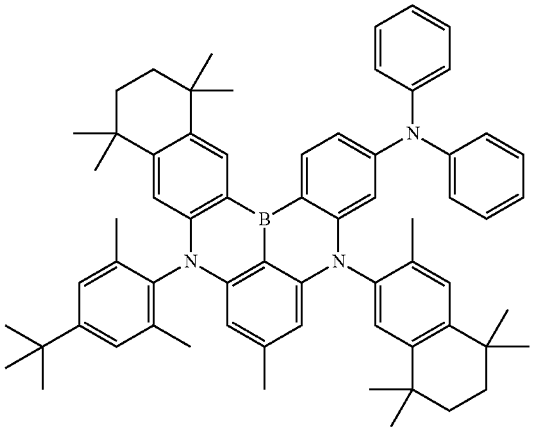
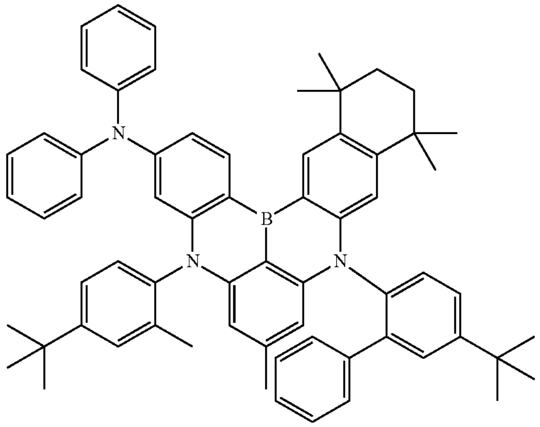

-continued
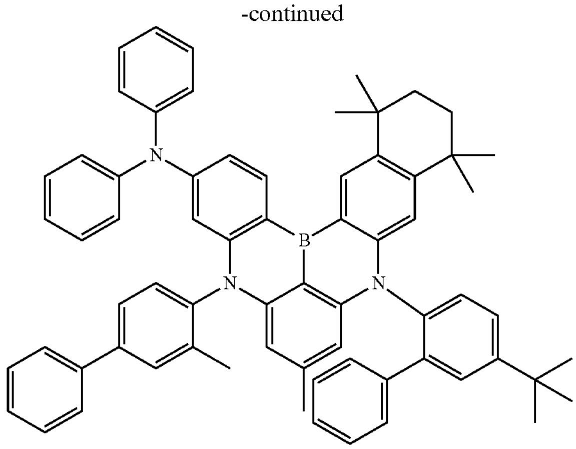
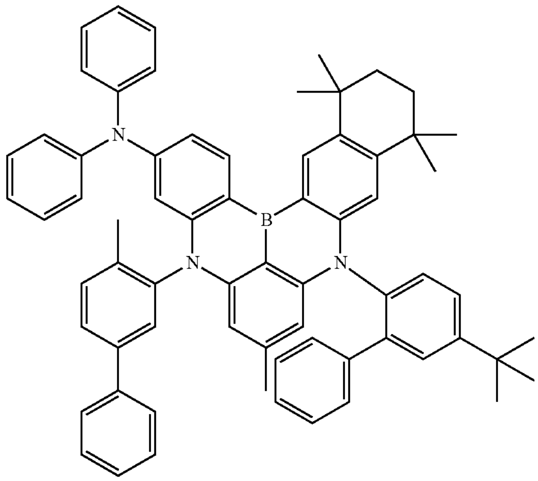
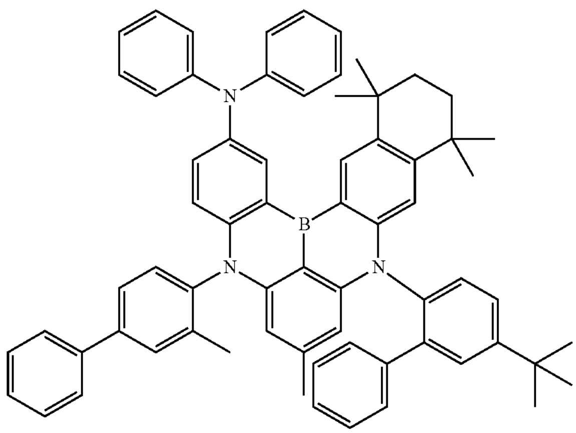
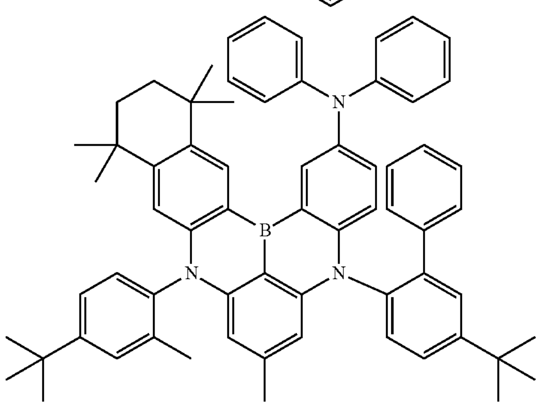
-continued
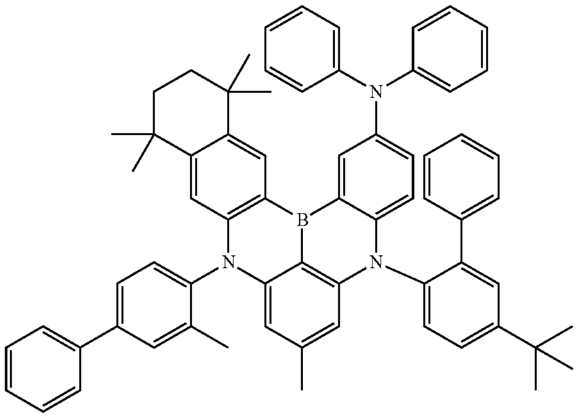
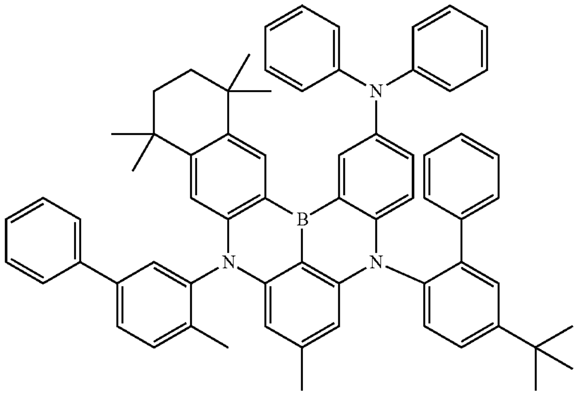
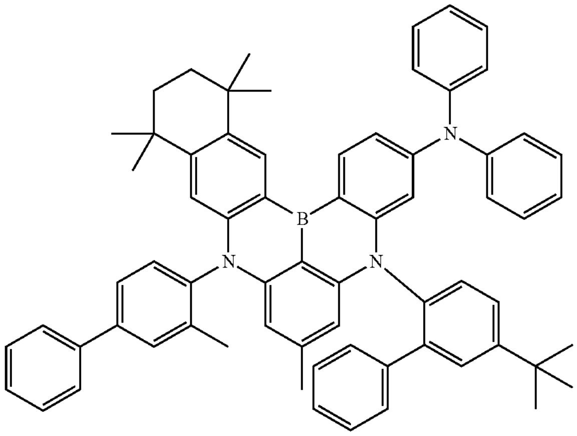
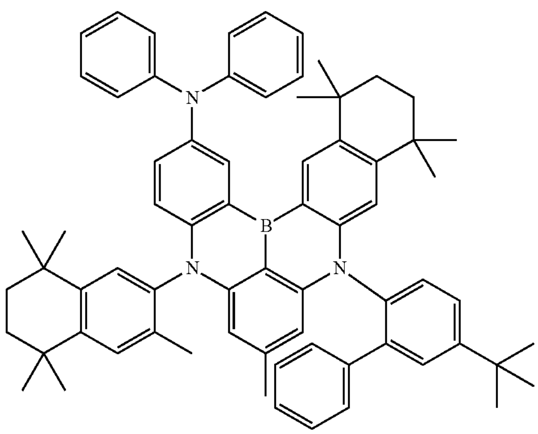

-continued
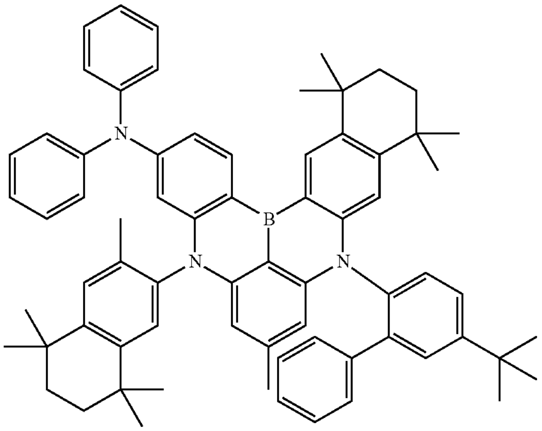
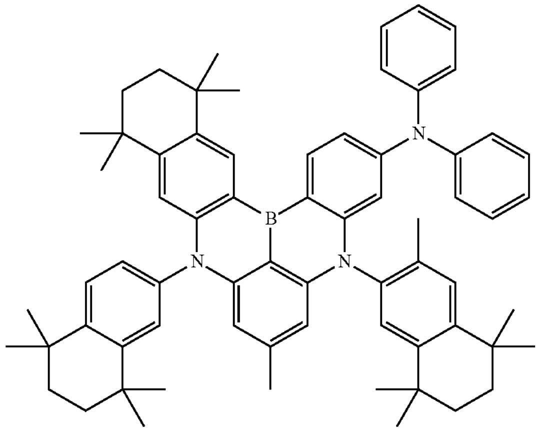
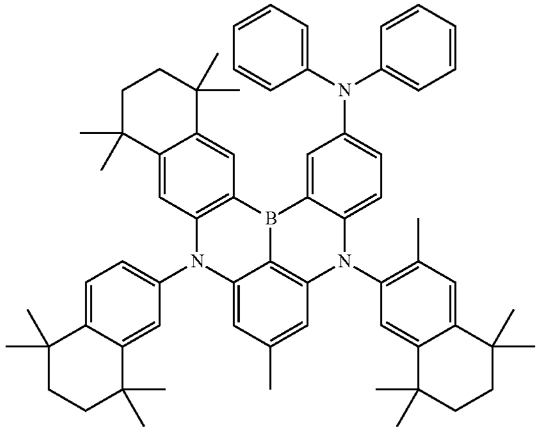
-continued
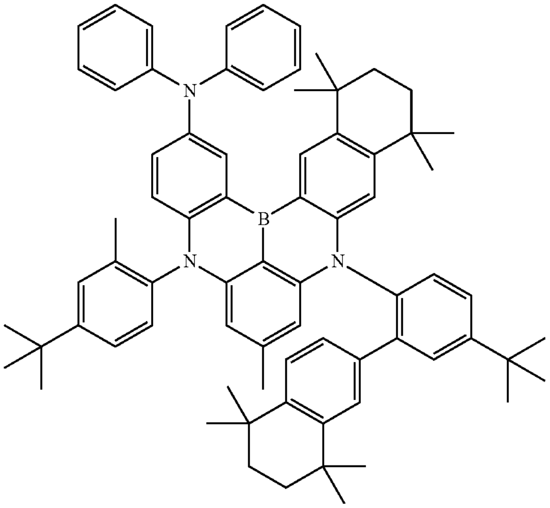
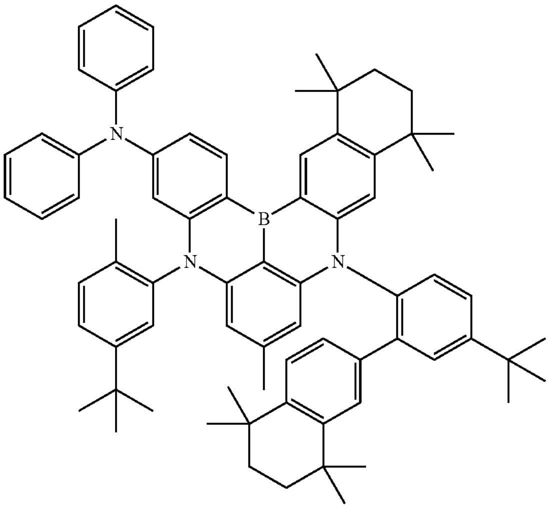
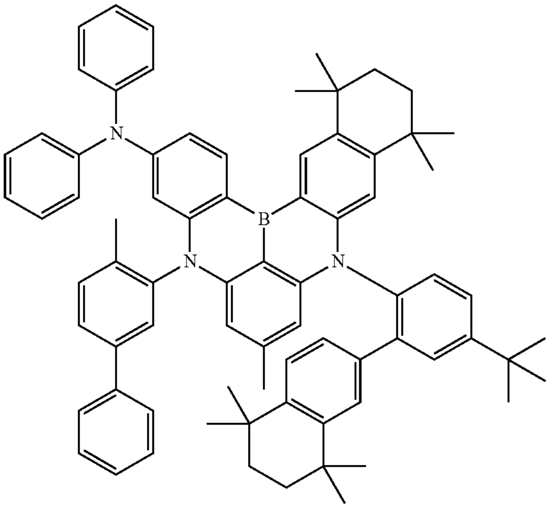

-continued
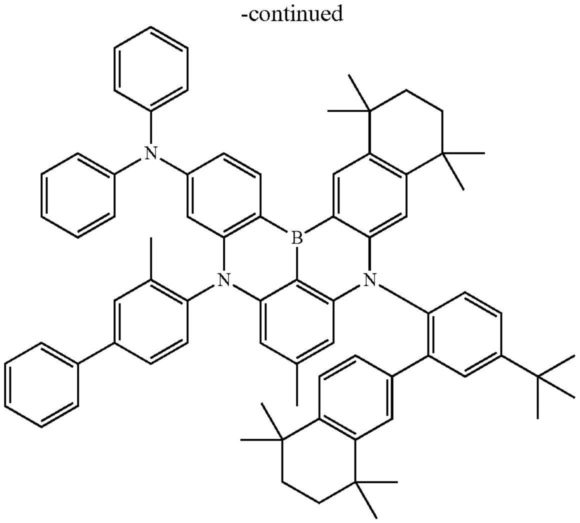
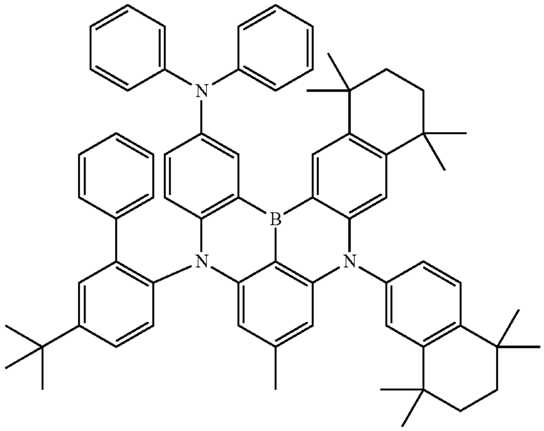
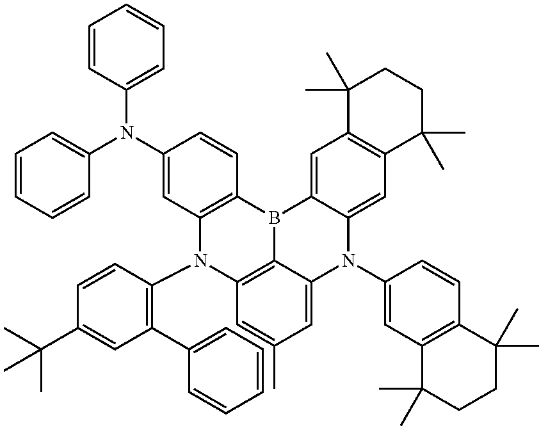
-continued
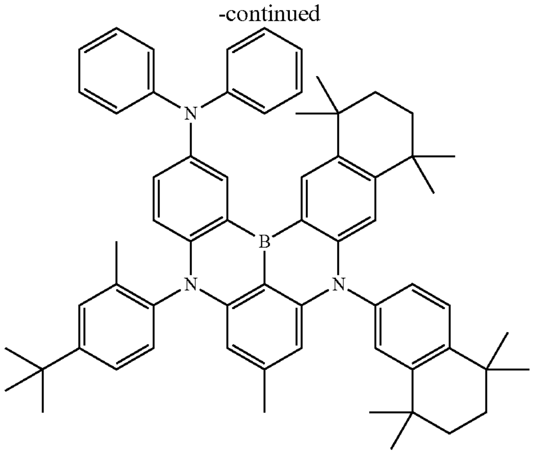
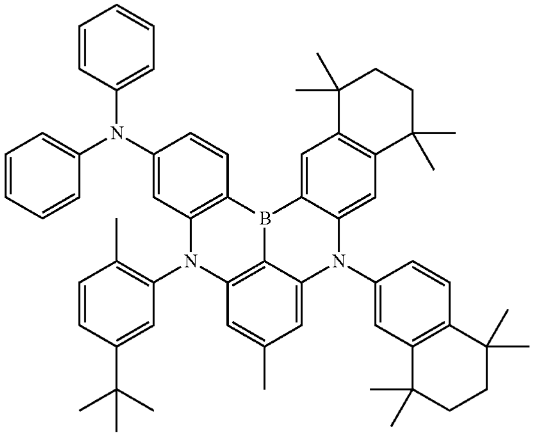
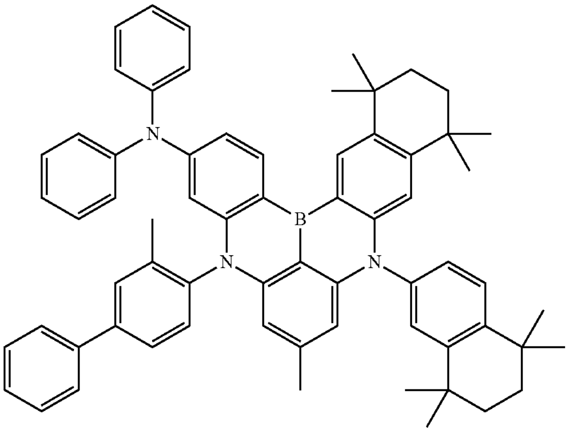
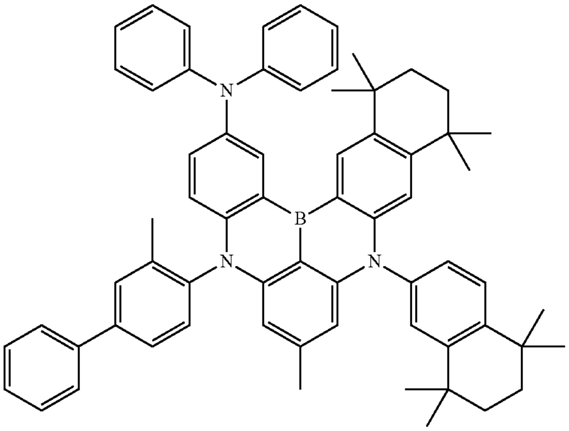

-continued
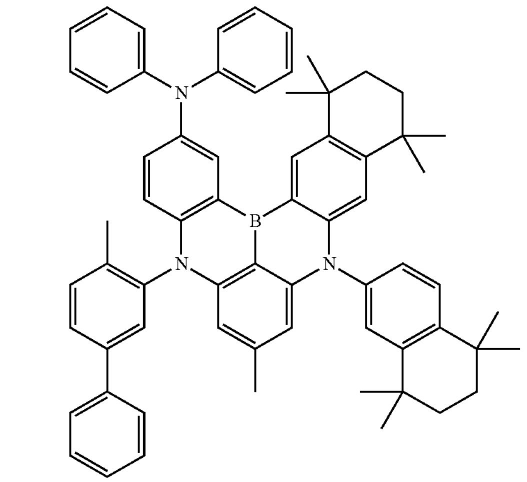
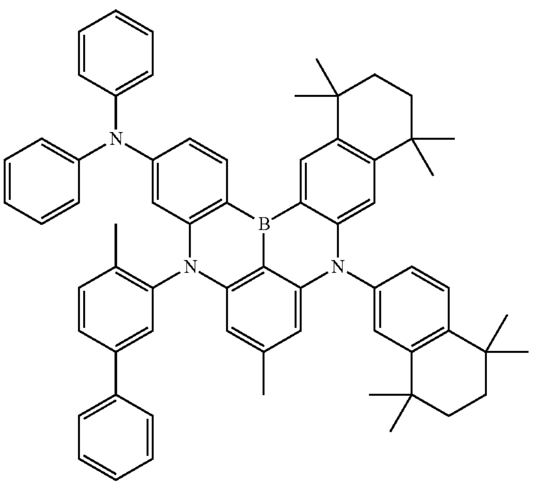
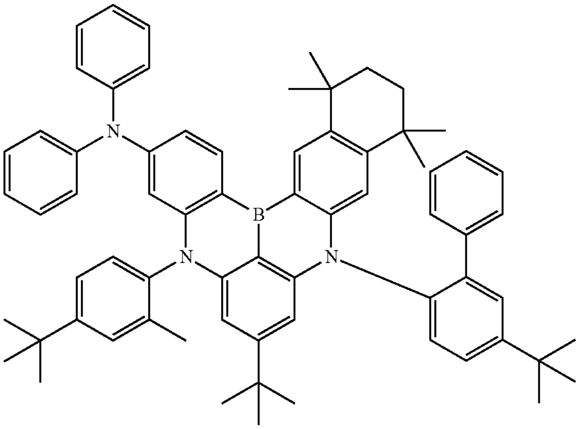
-continued
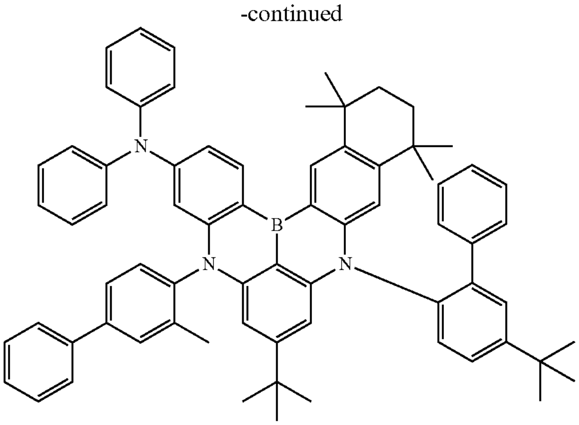
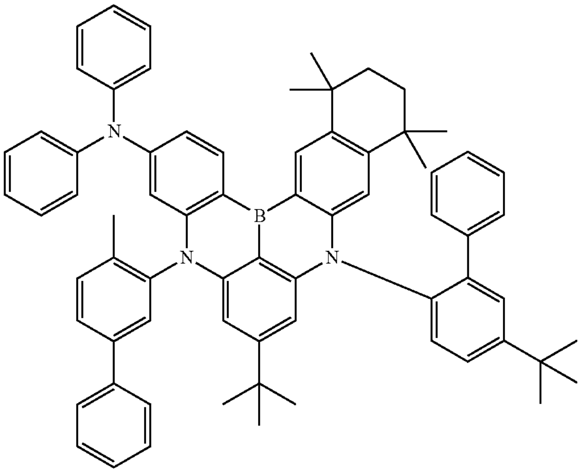
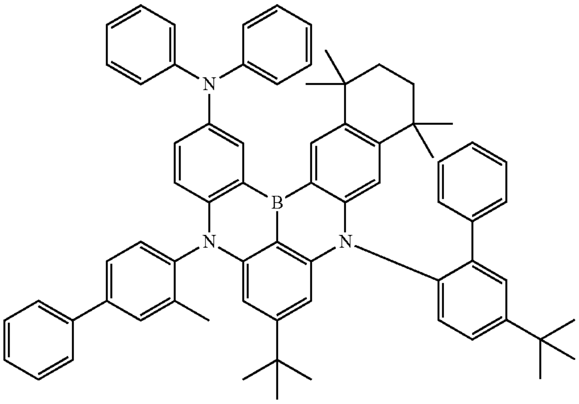
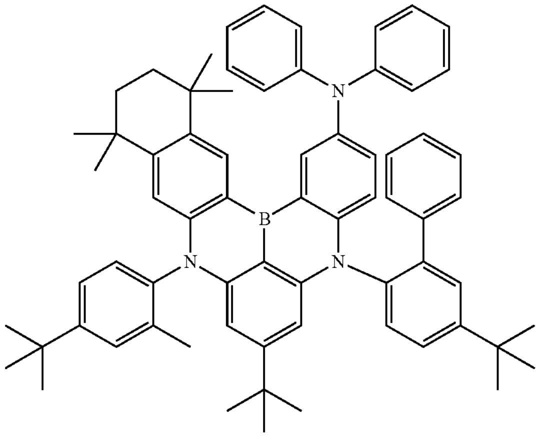

-continued
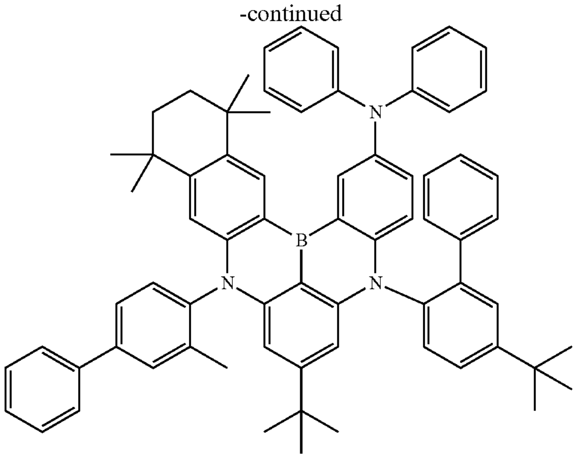
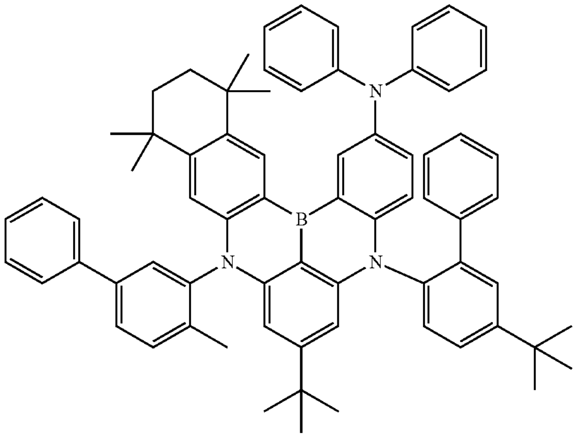
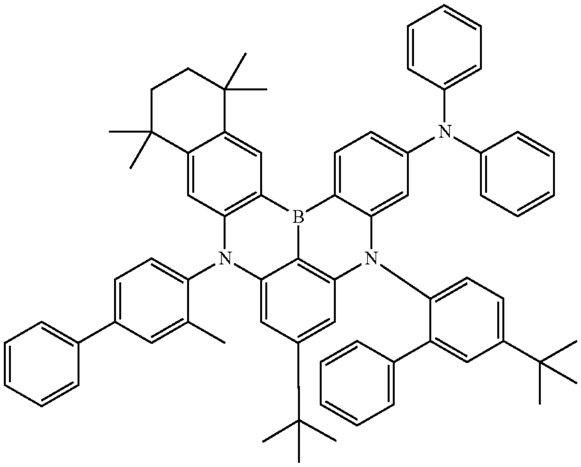
-continued
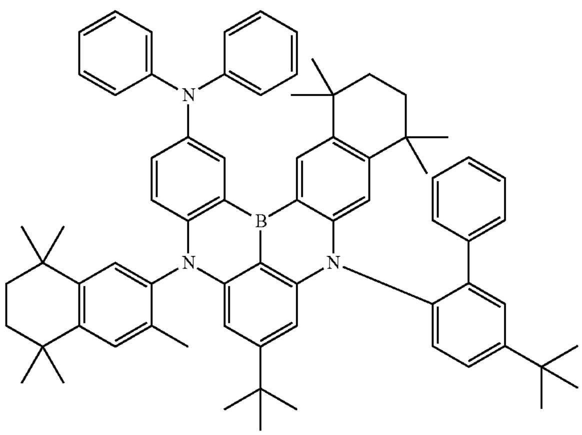
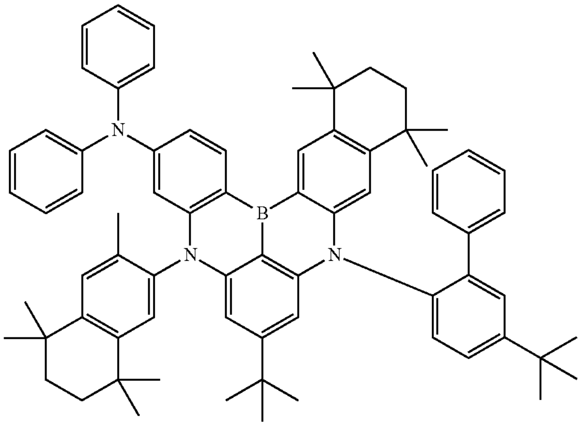
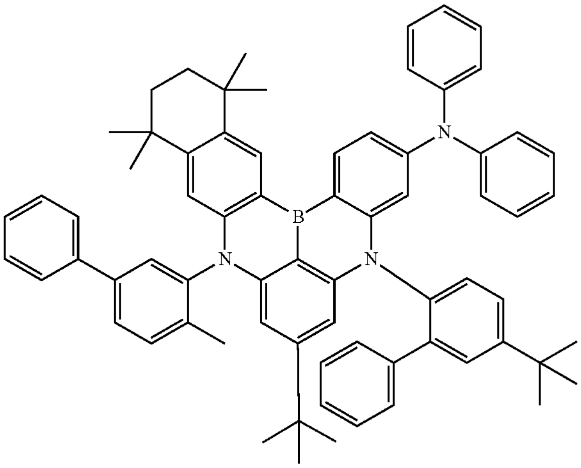

-continued
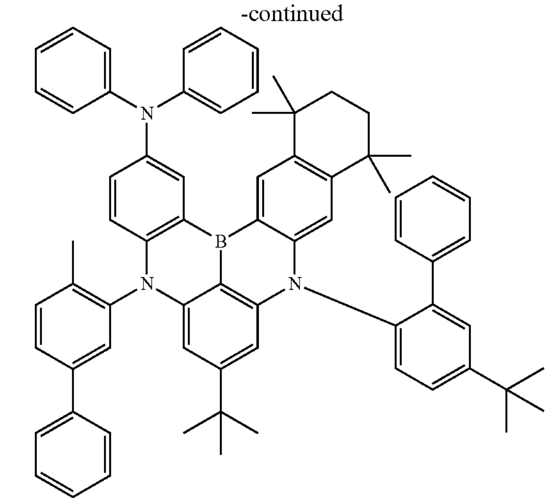
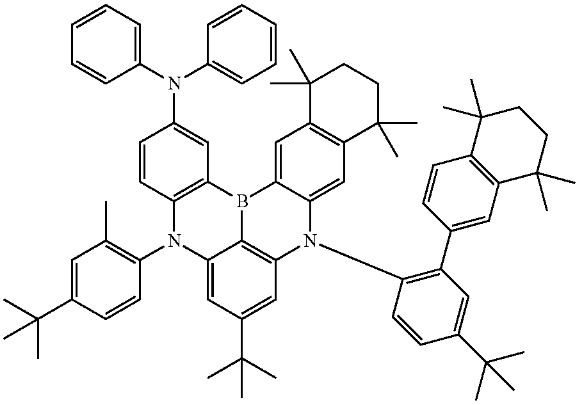
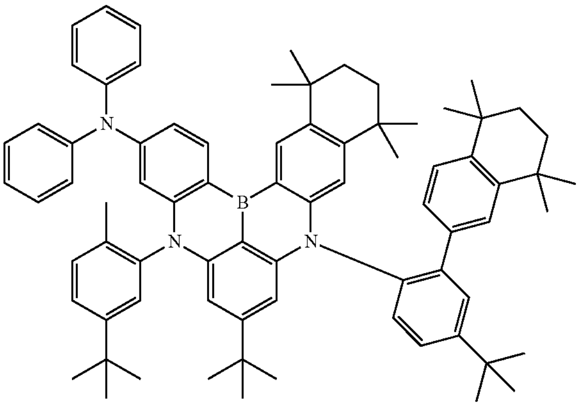
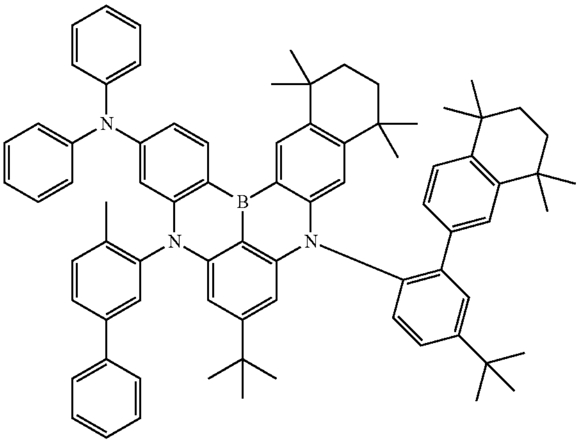
-continued
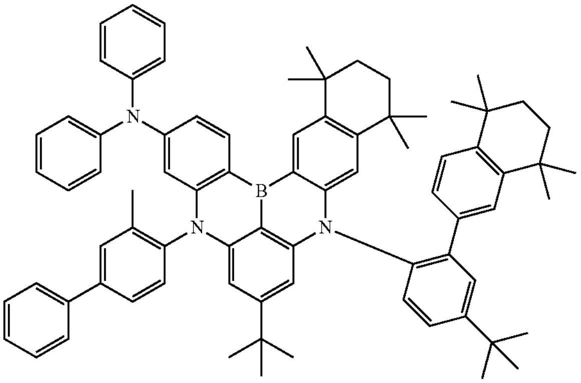
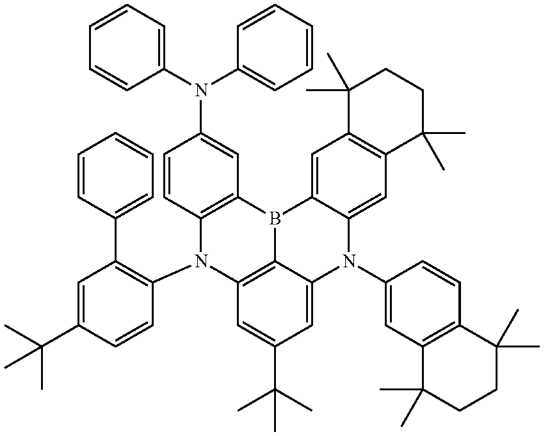
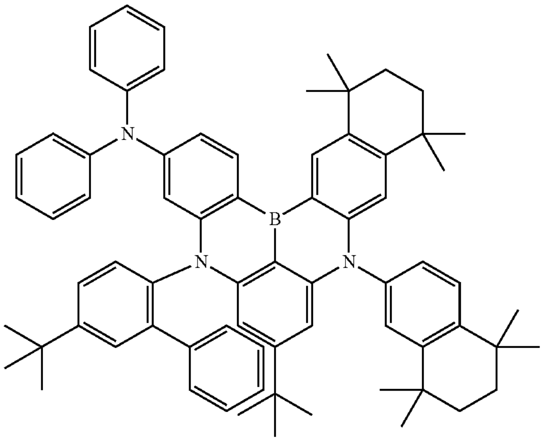
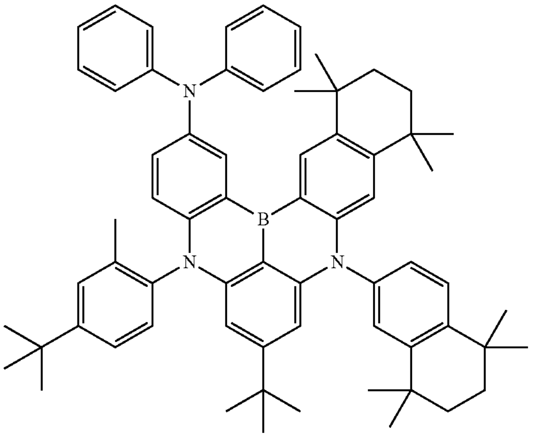

-continued
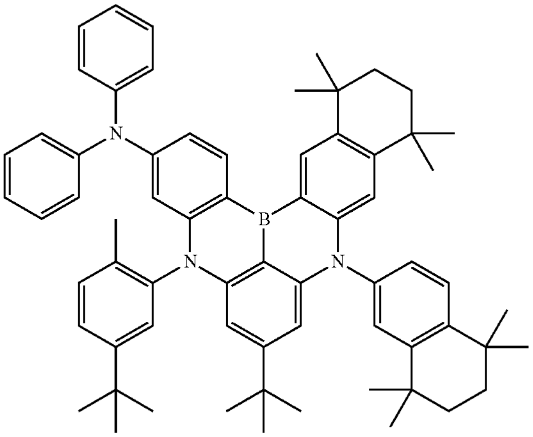
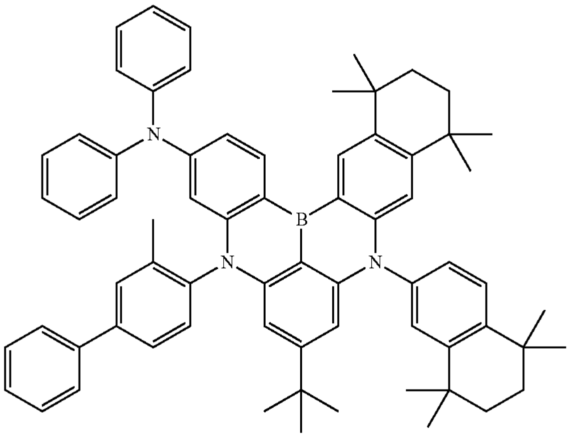
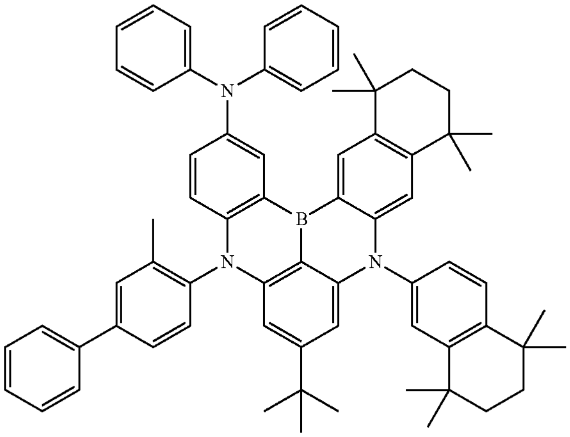
-continued
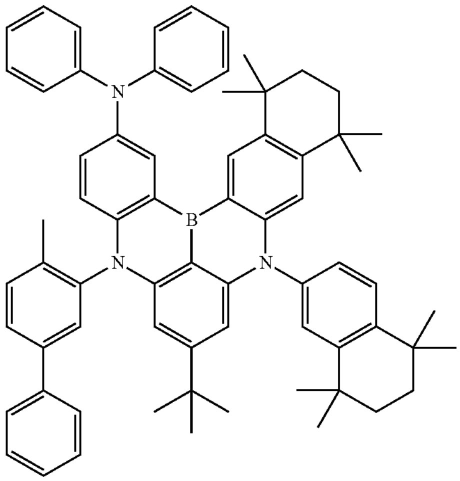
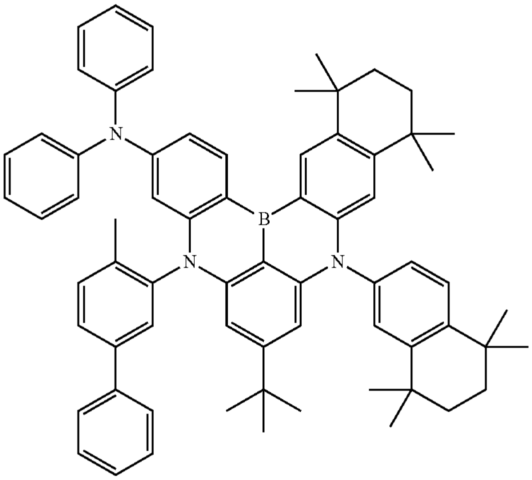
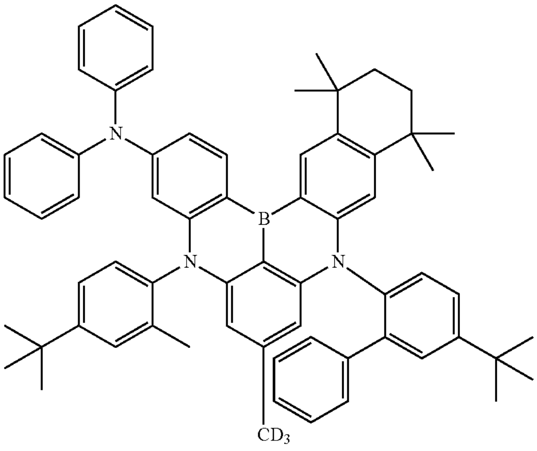

-continued
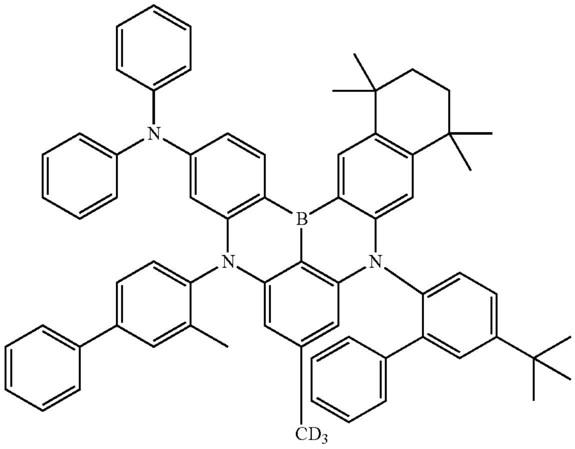
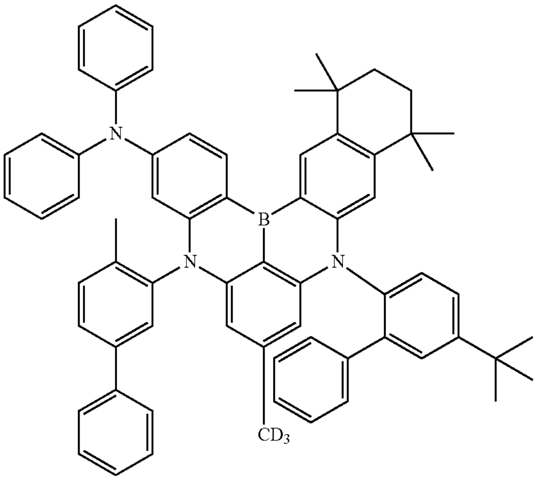
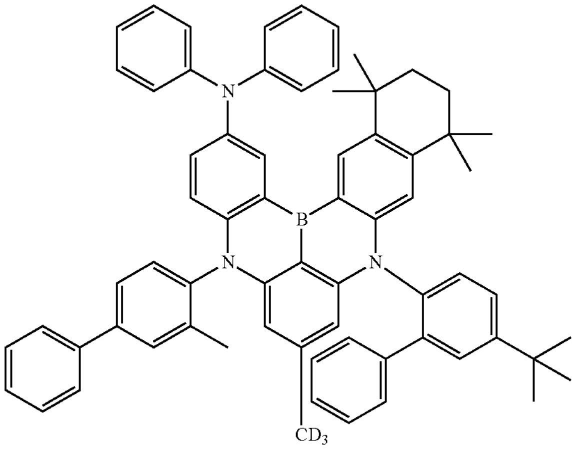
-continued
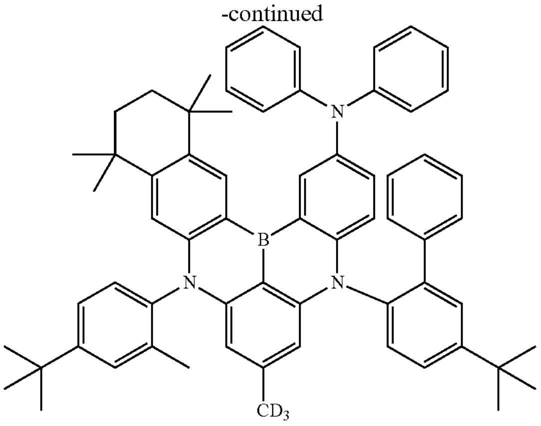
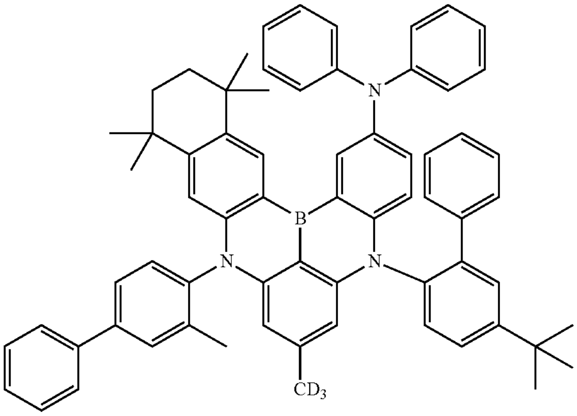
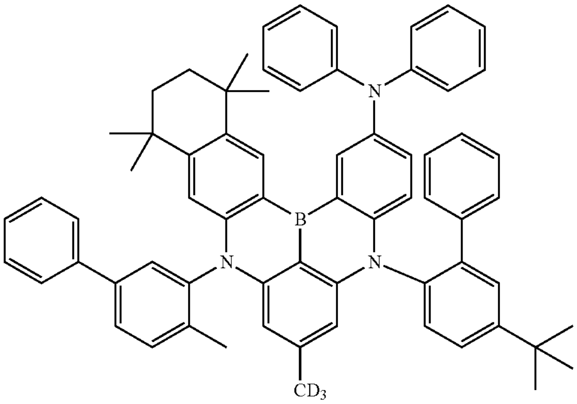
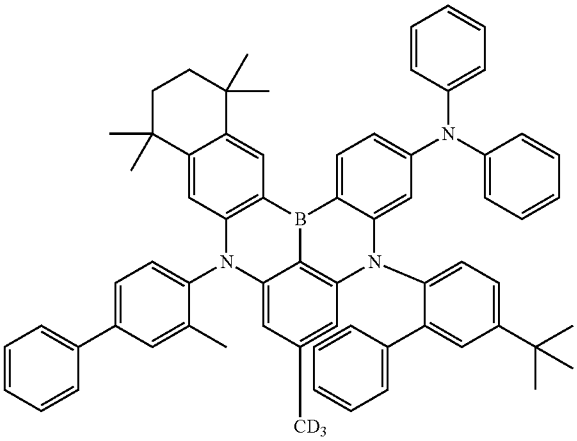

-continued
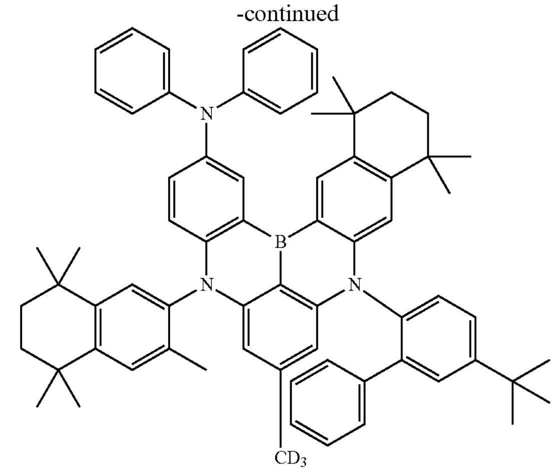
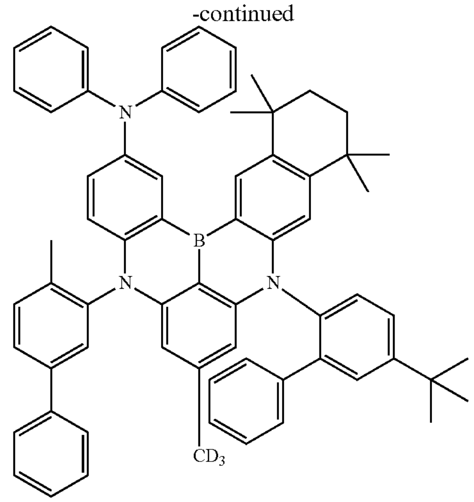
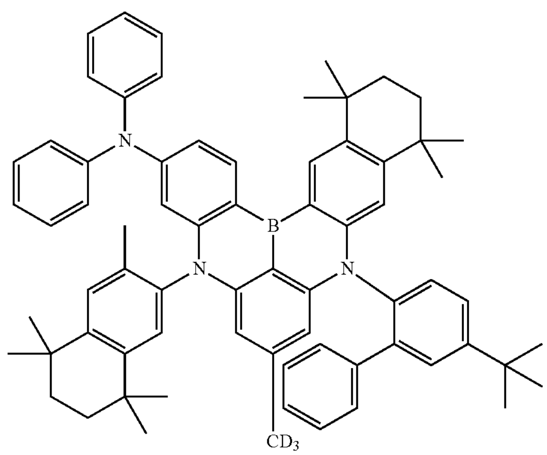
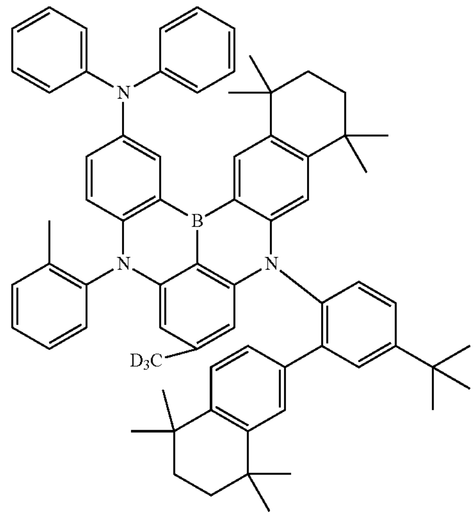
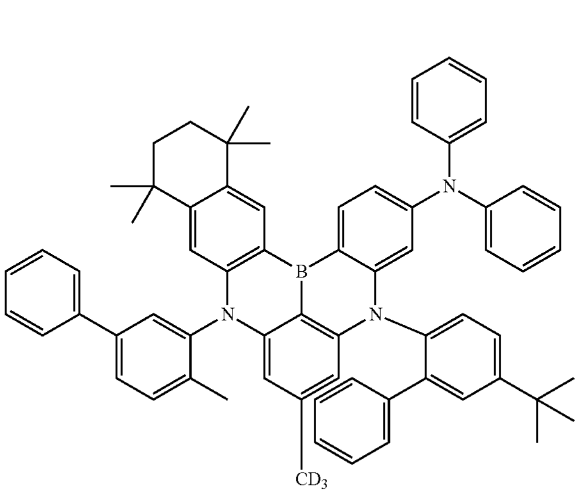
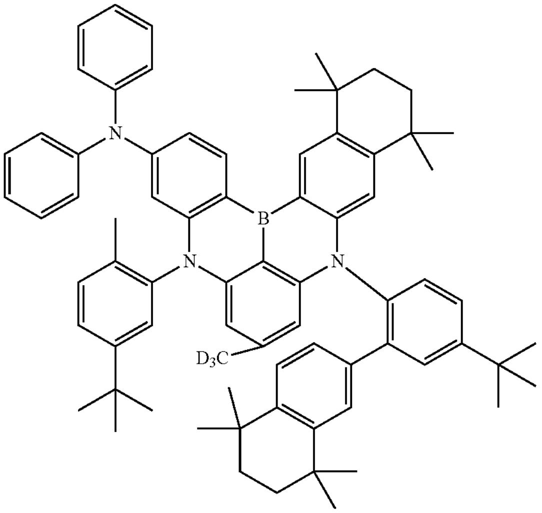
-continued -continued
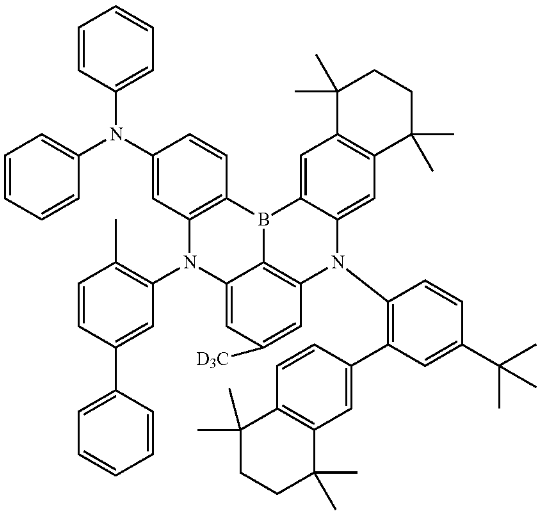
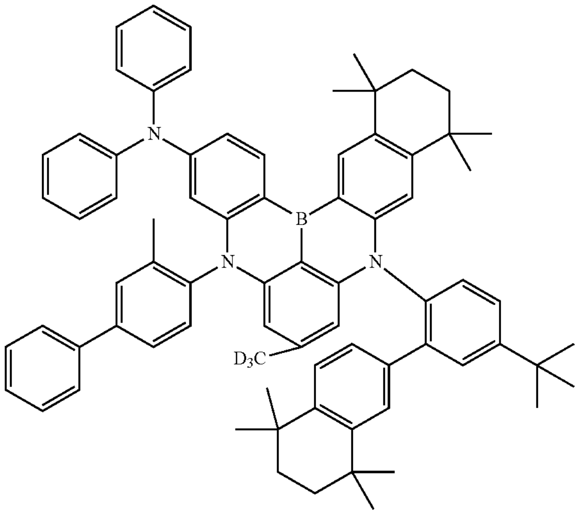
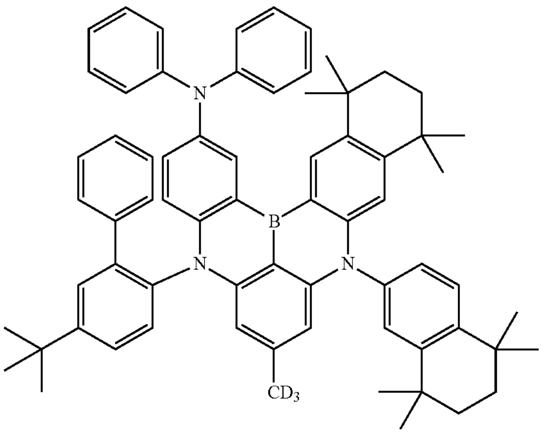
-continued
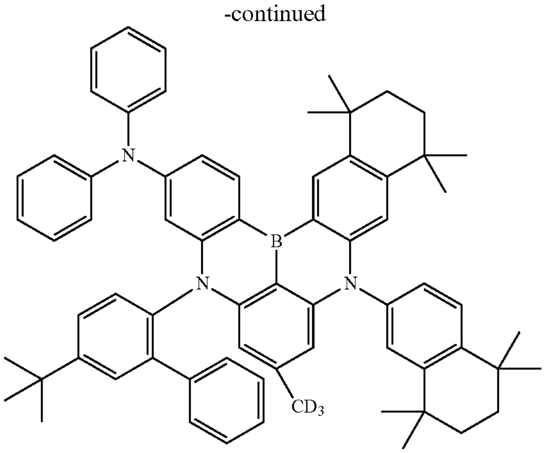
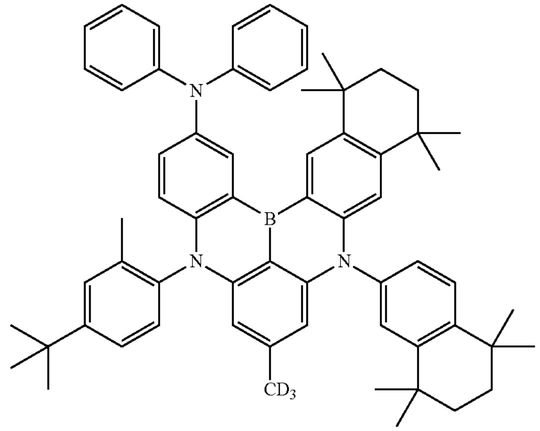
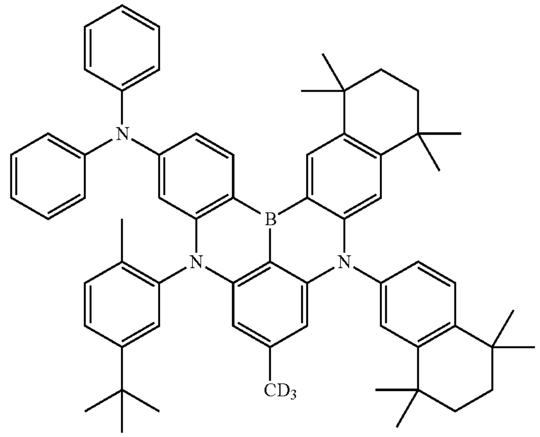
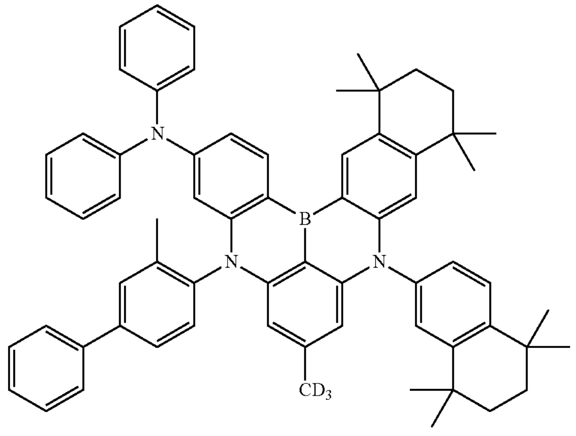

-continued
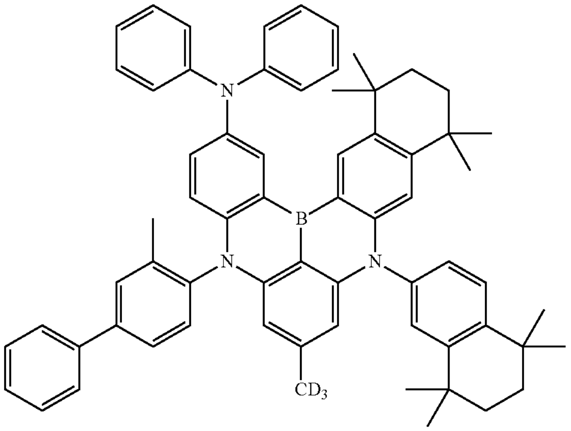
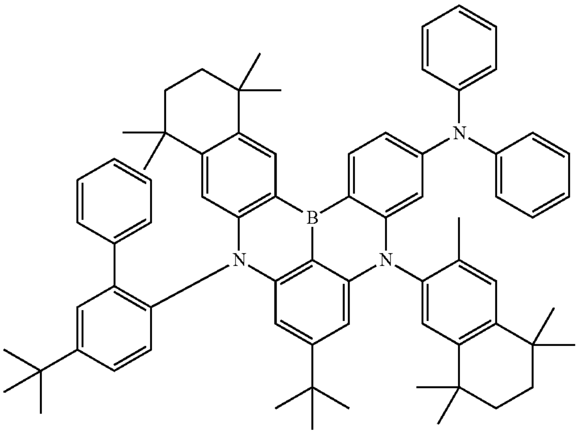
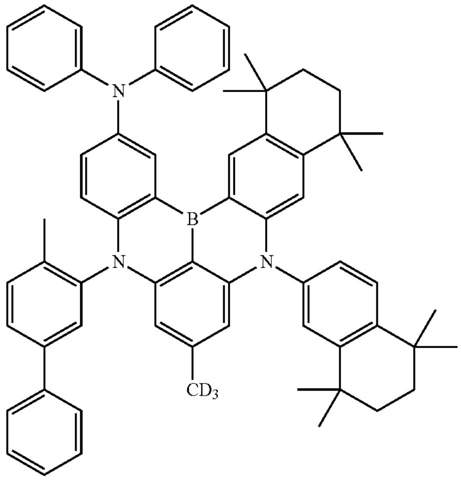
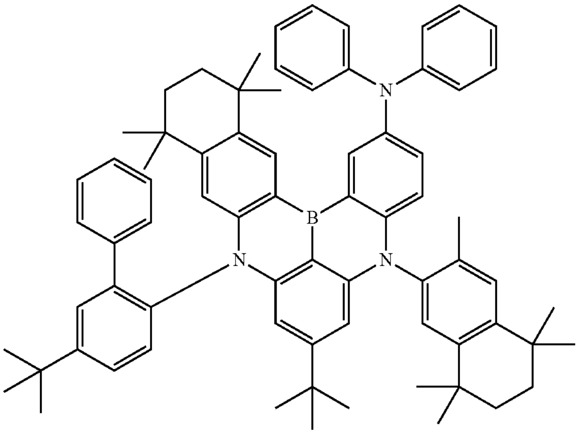
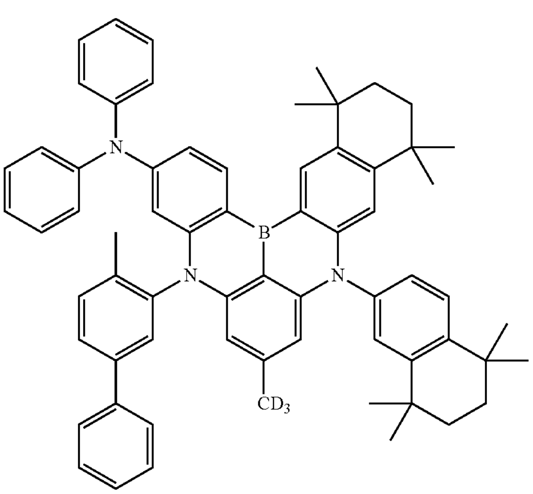
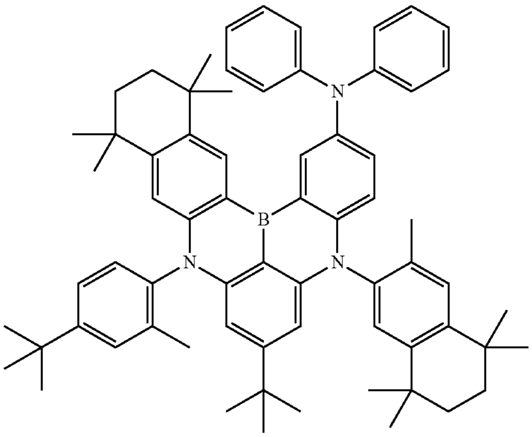

-continued
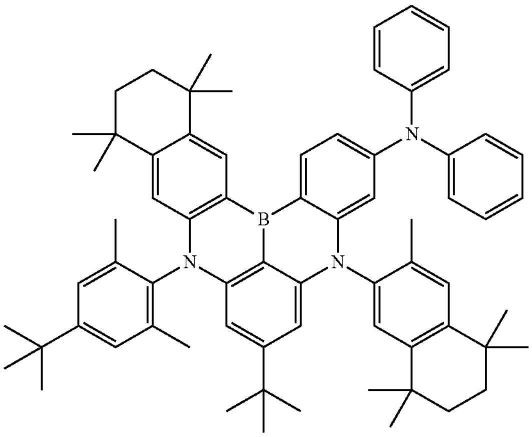
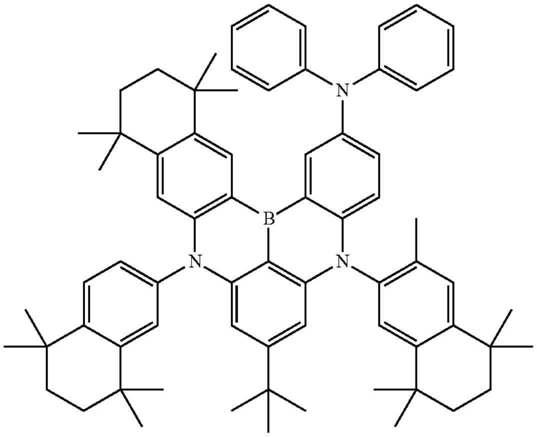
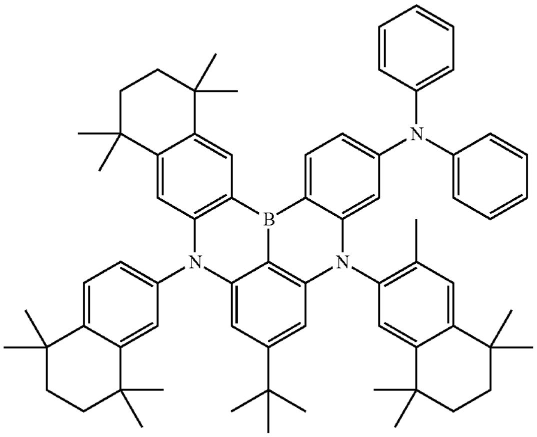
-continued
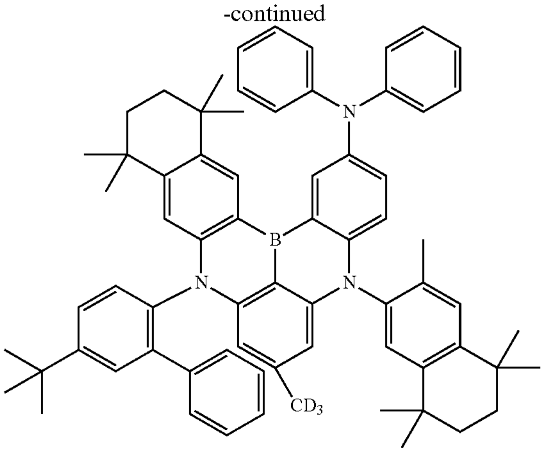
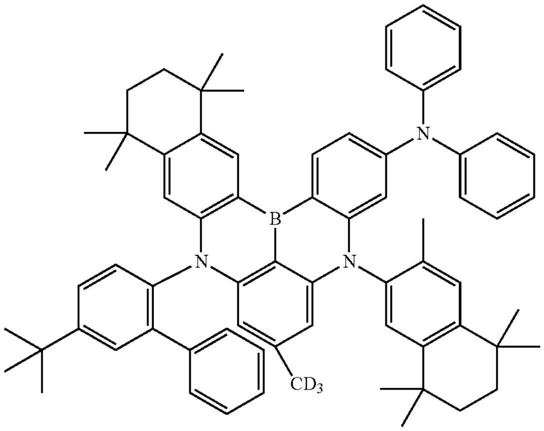
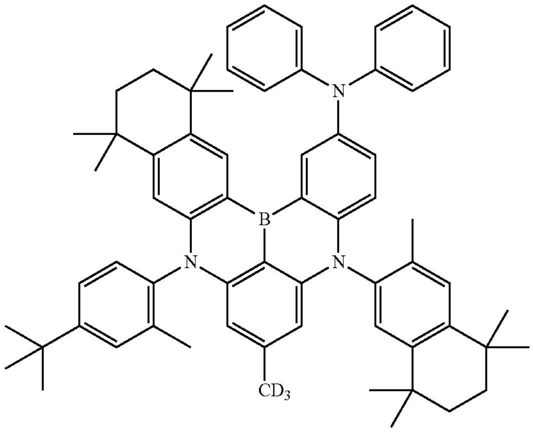
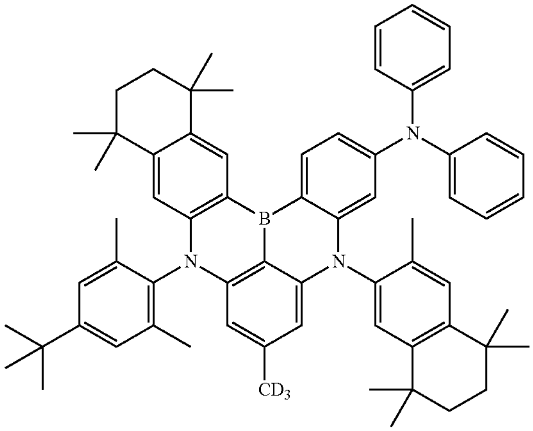

-continued
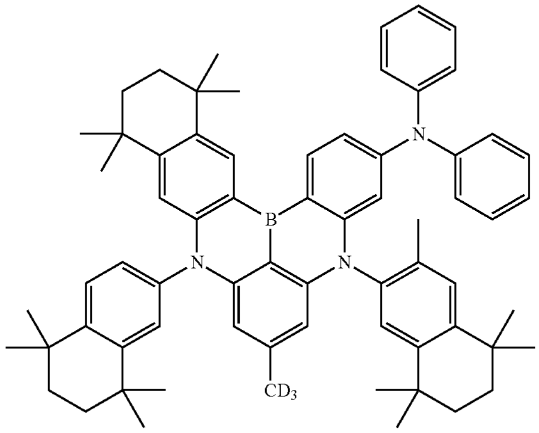
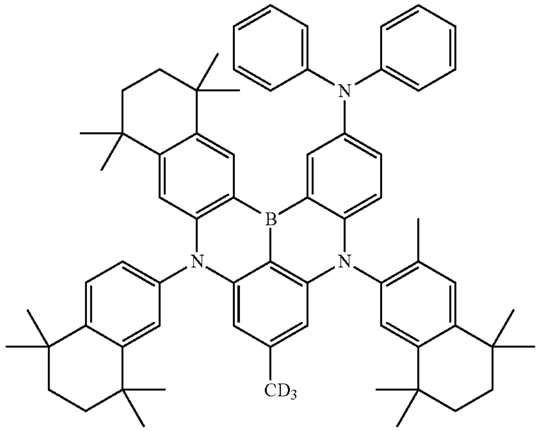
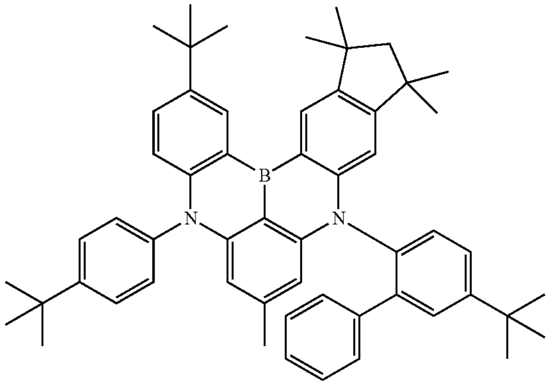
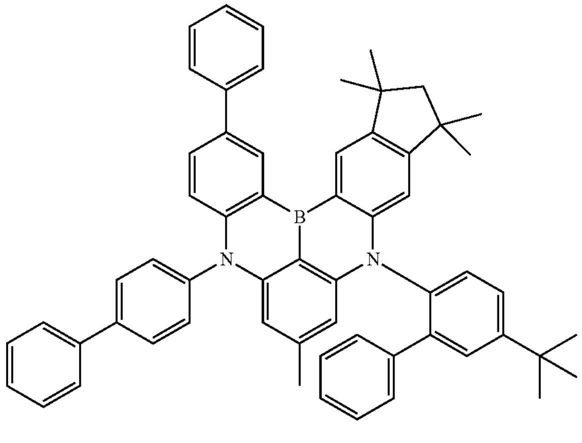
-continued
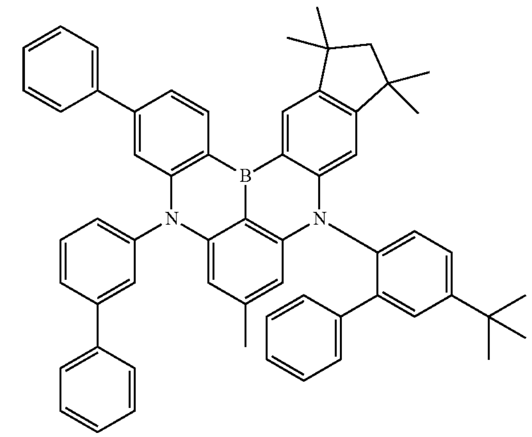
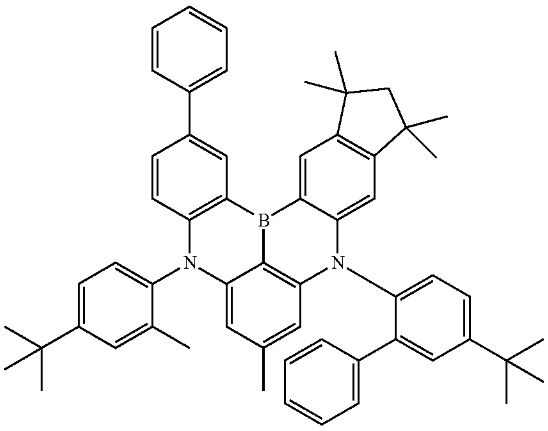
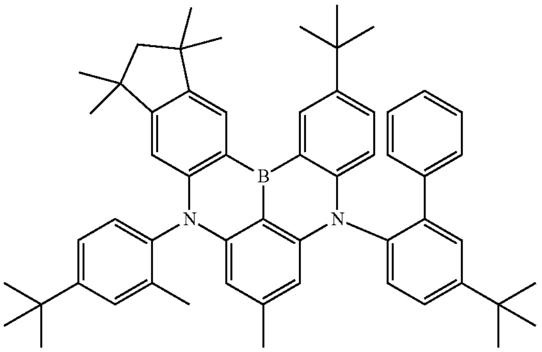
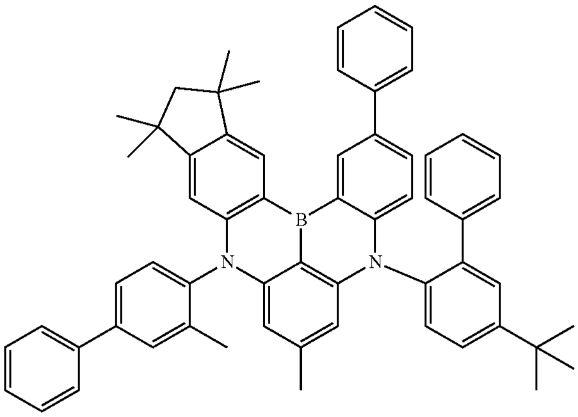

-continued
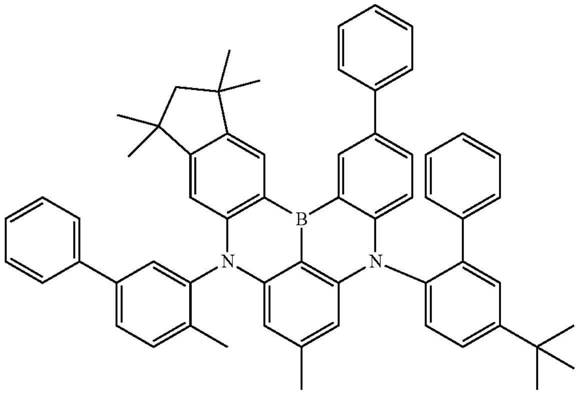
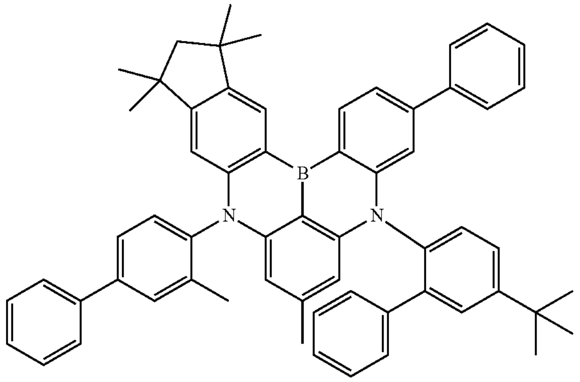
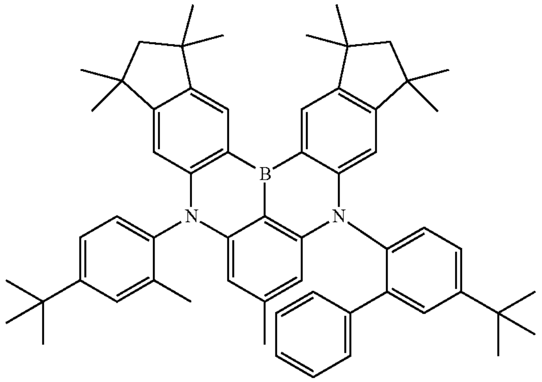
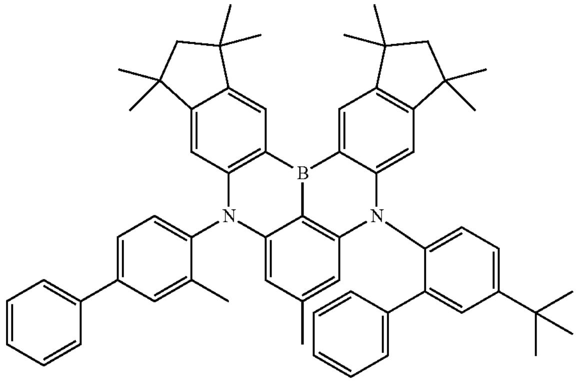
-continued
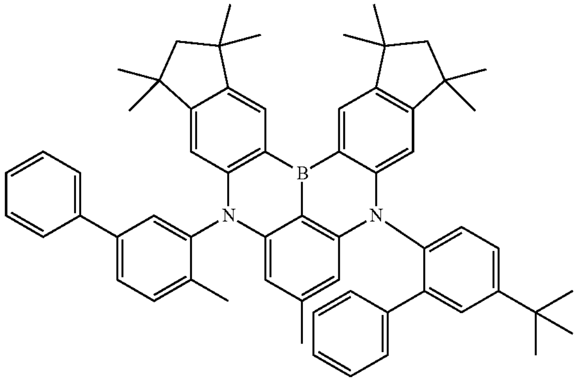
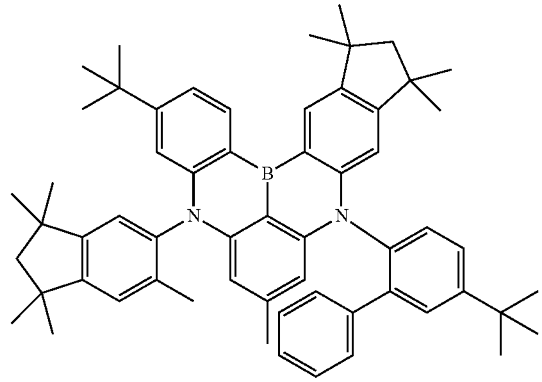
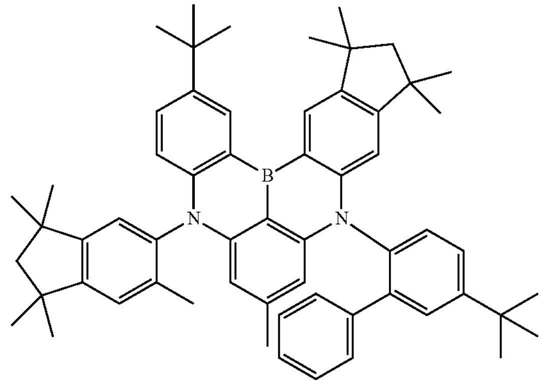
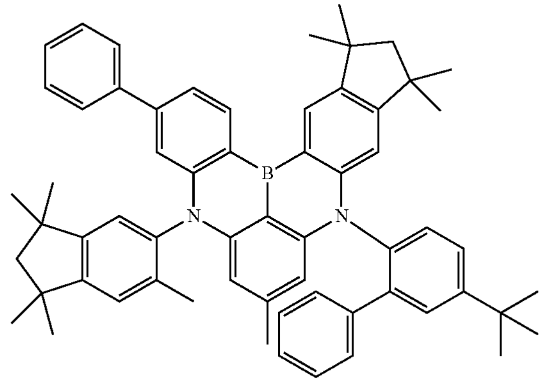

-continued
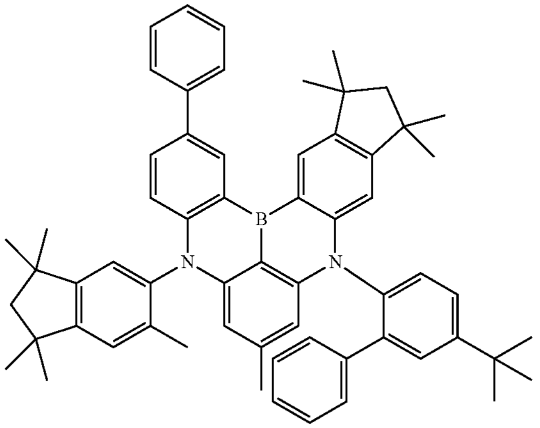
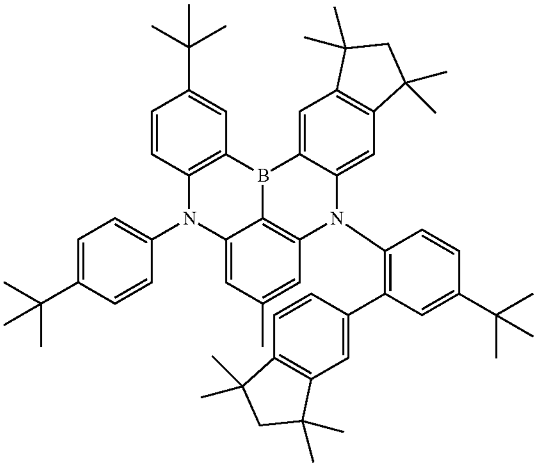
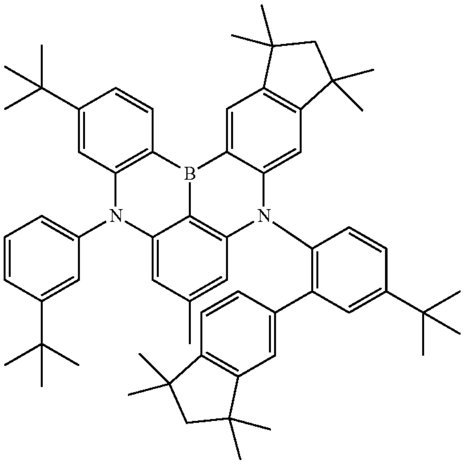
-continued
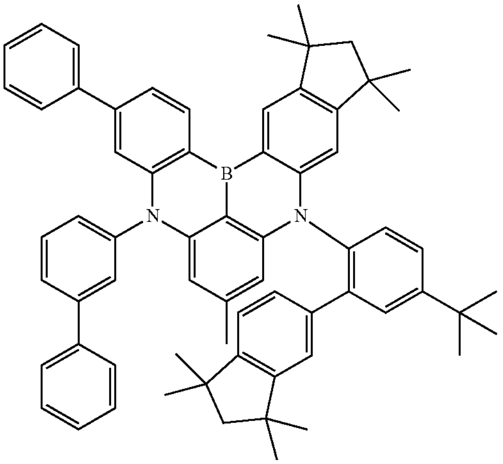
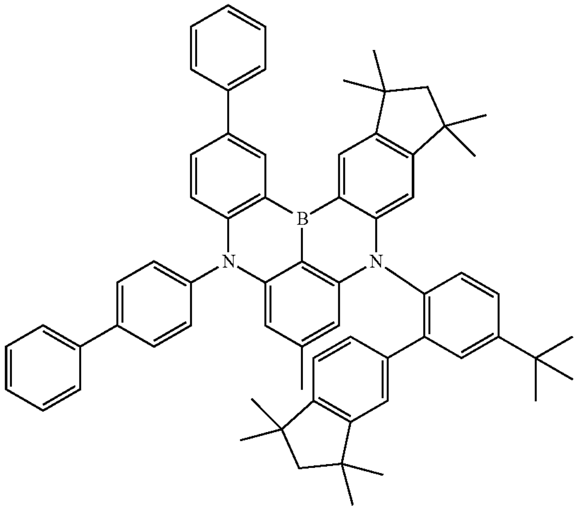
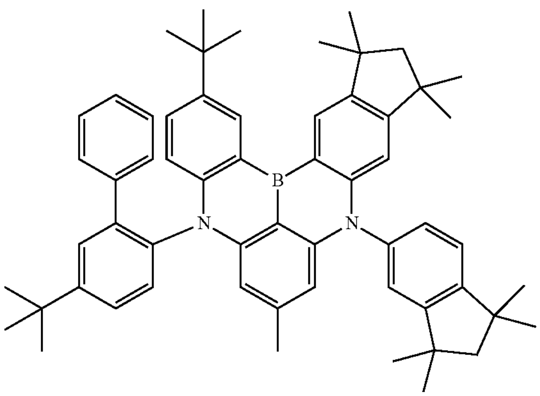

-continued
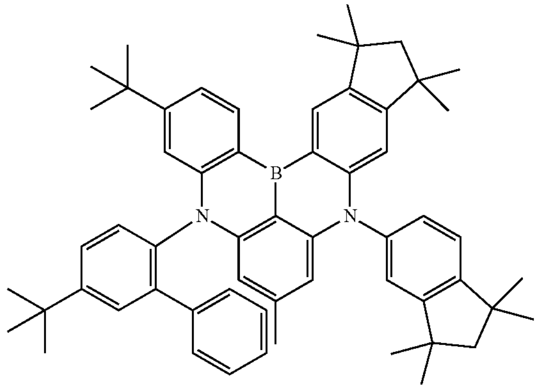
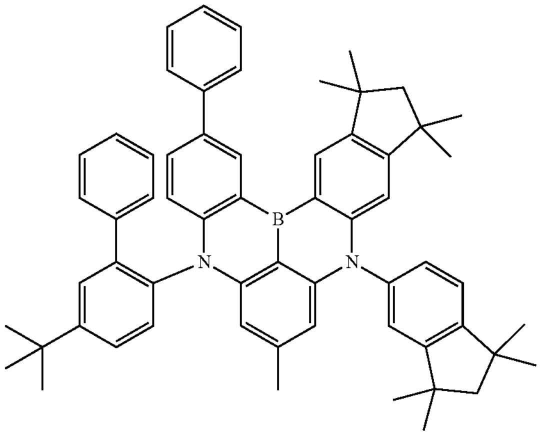
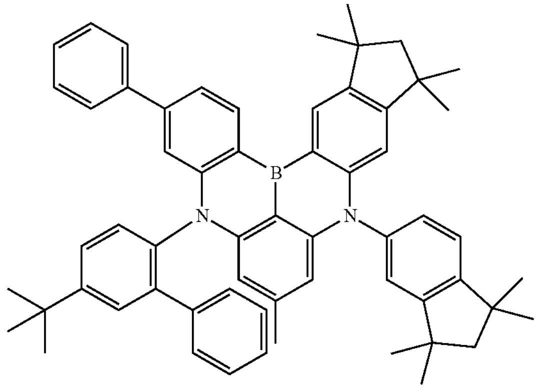
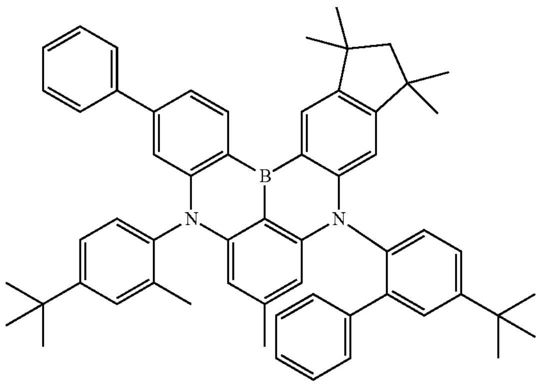
-continued
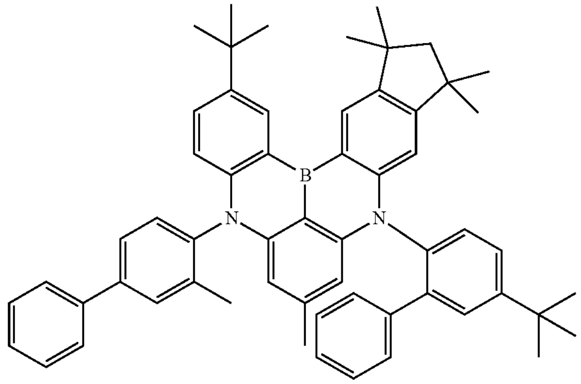
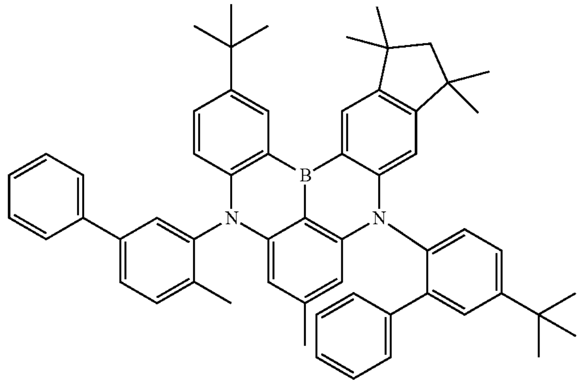
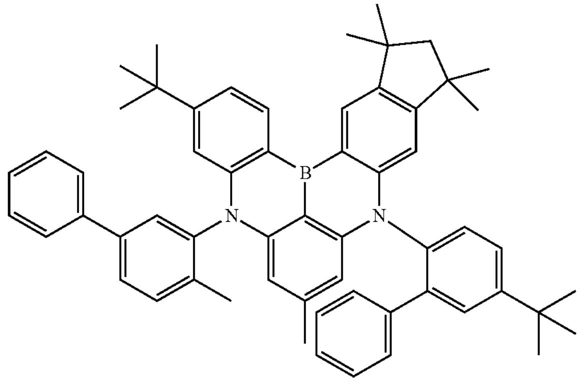
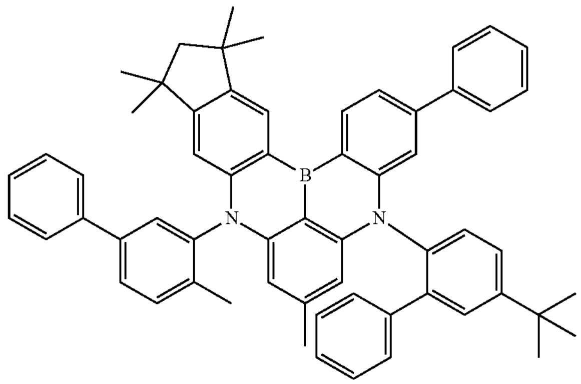

-continued
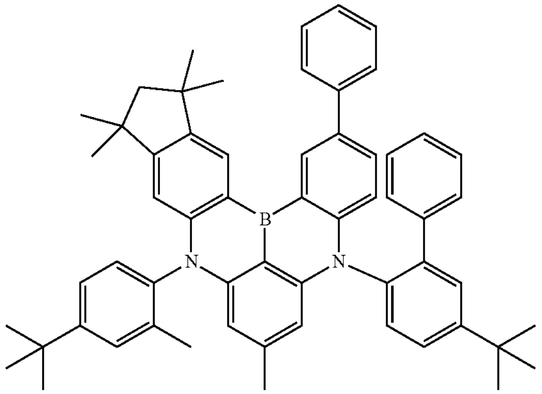
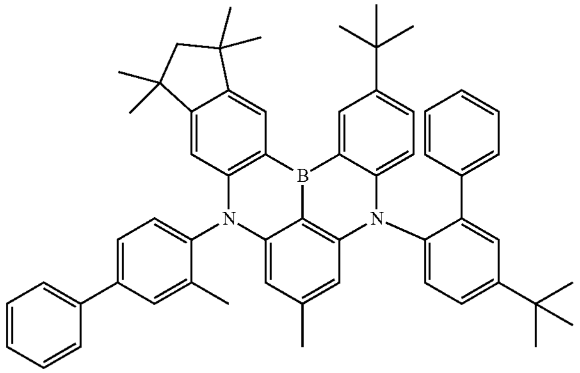
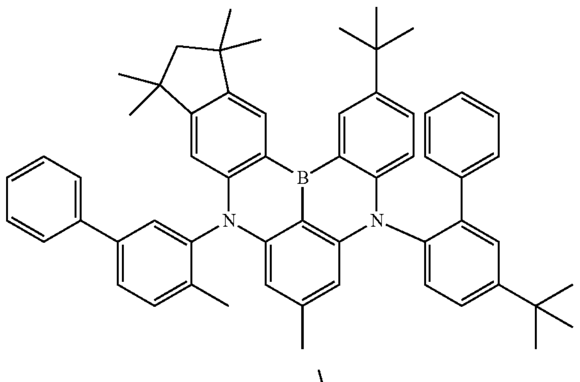
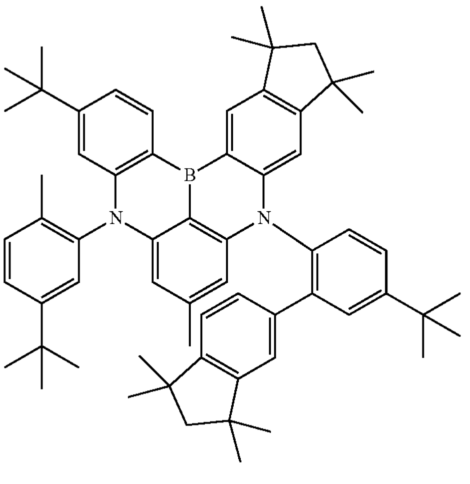
-continued
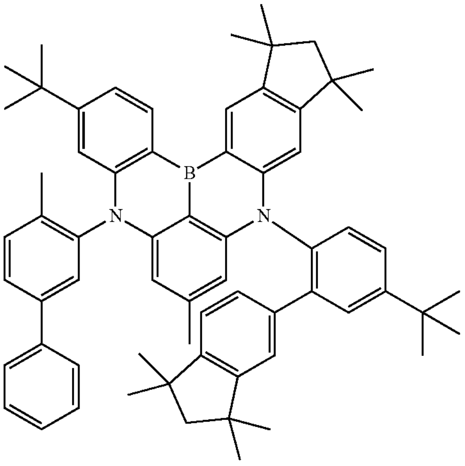
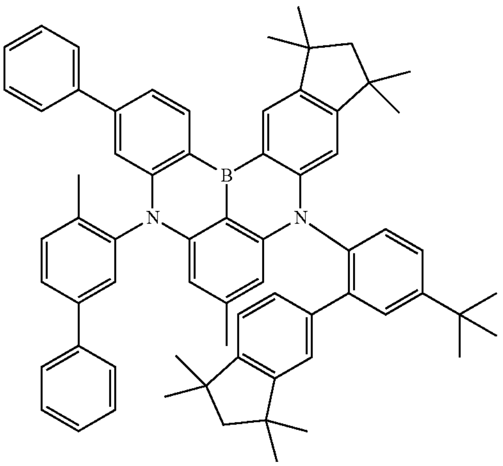
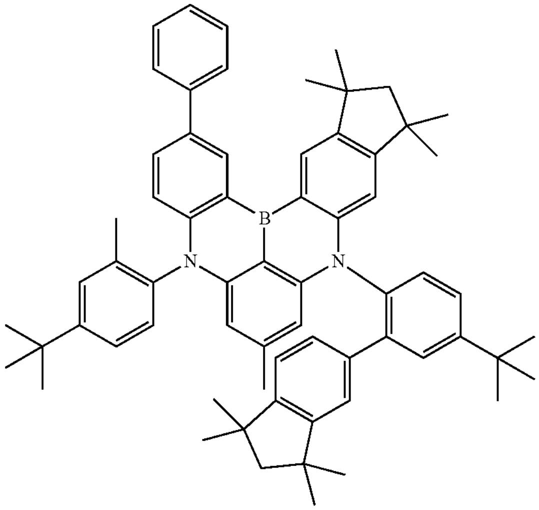

-continued
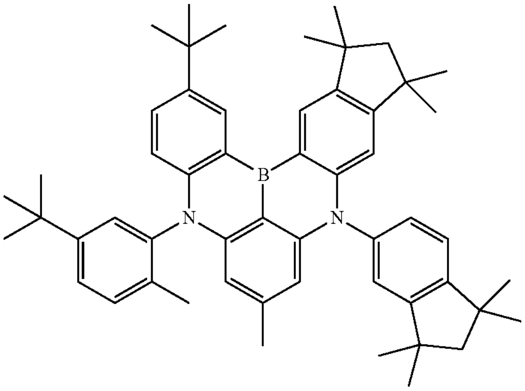
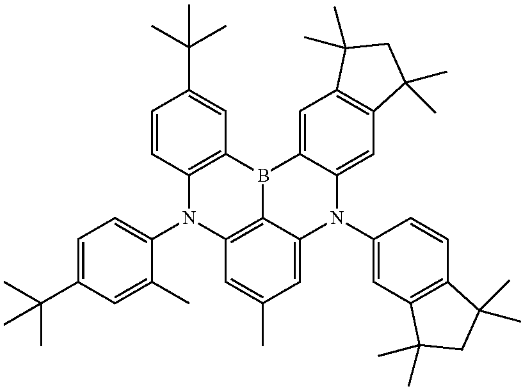
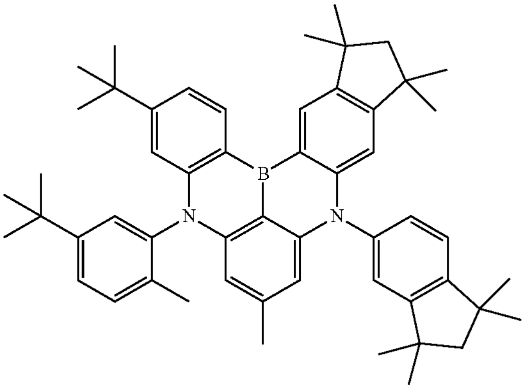
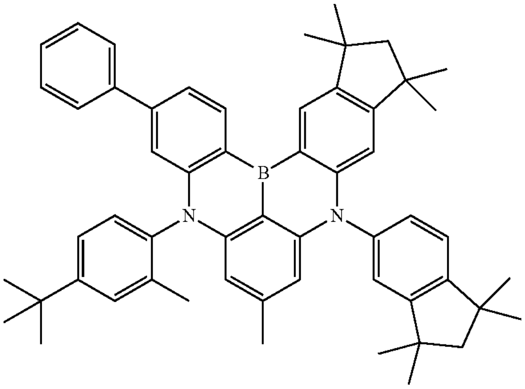
-continued
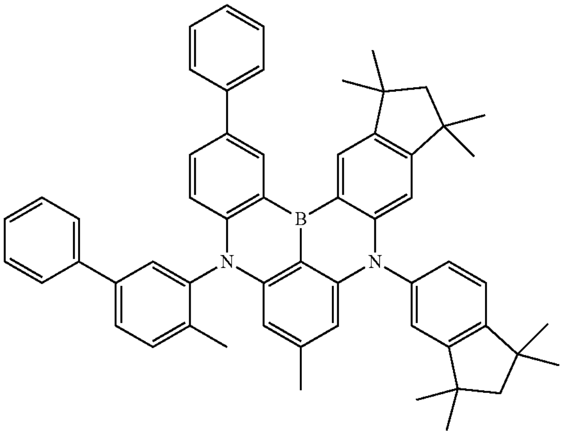
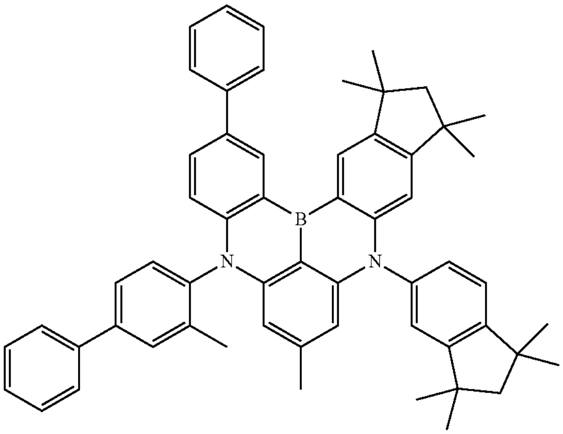
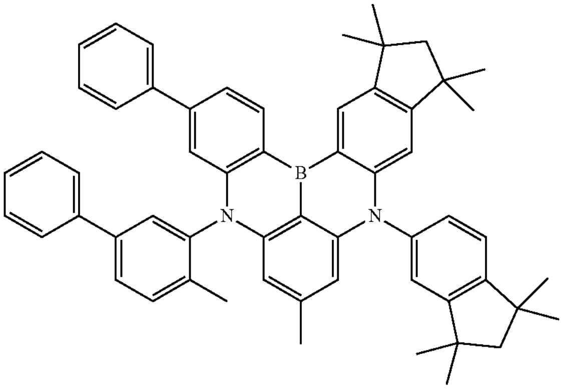
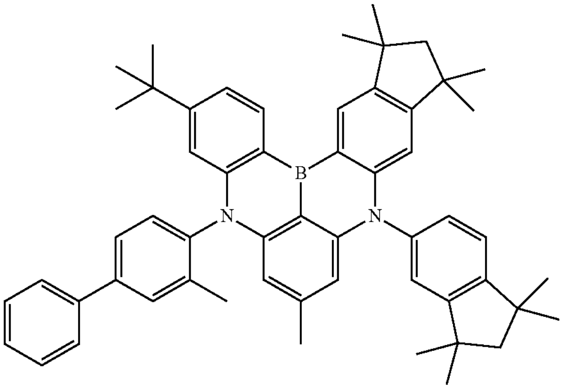

-continued
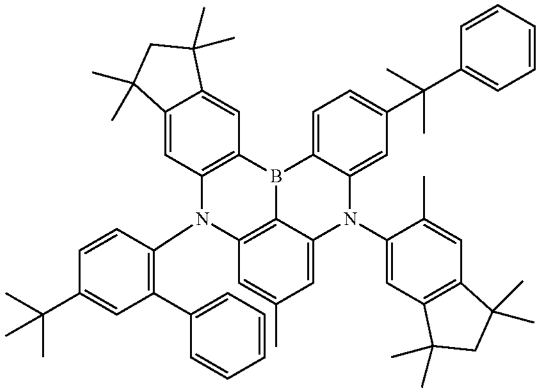
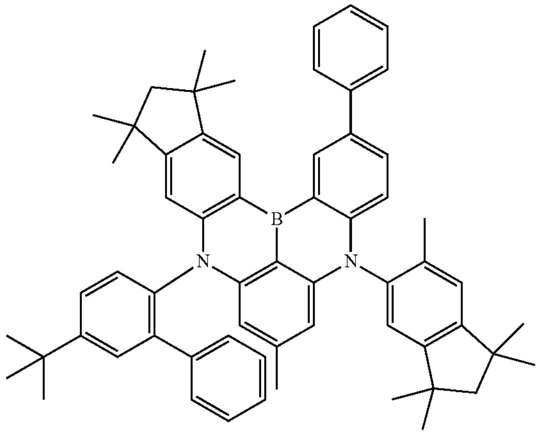
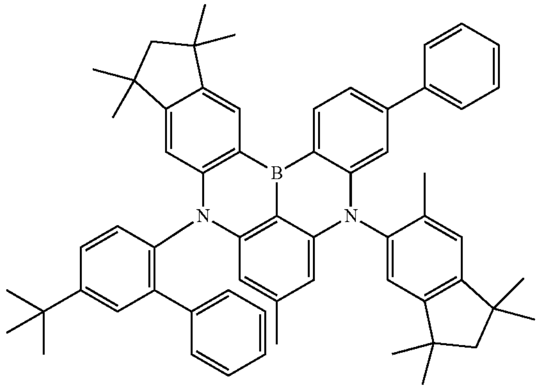
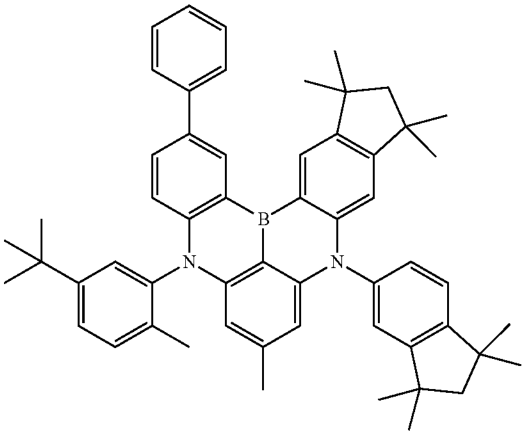
-continued
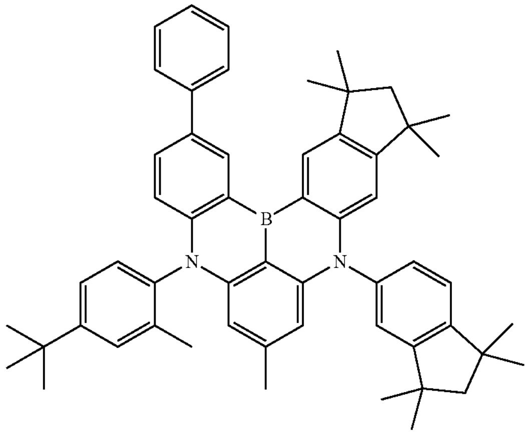
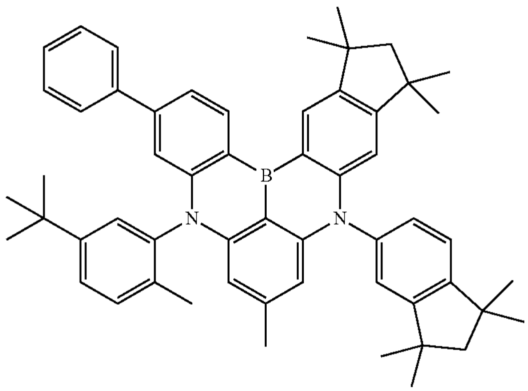
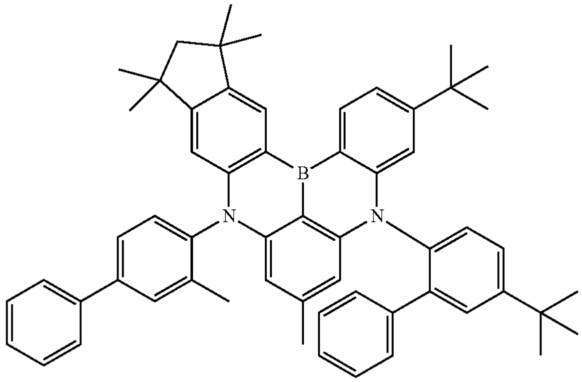
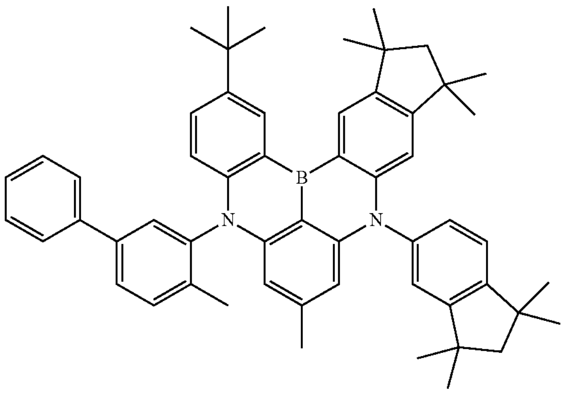

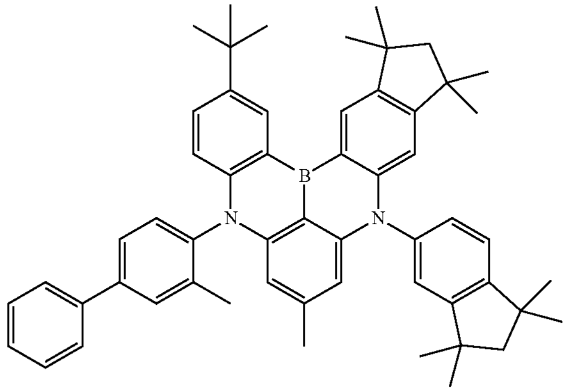
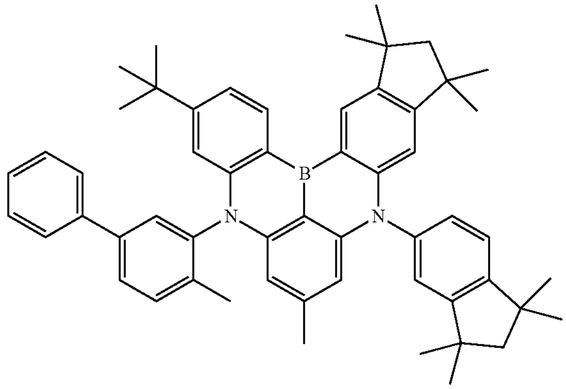
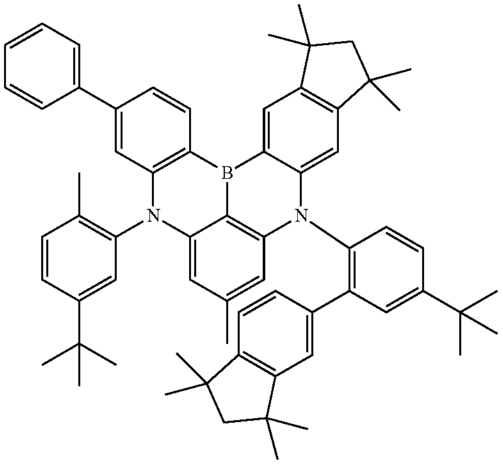
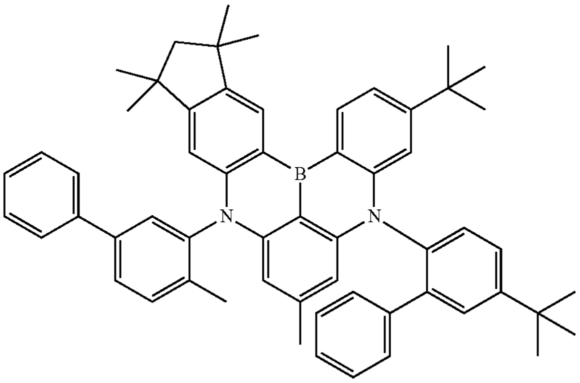
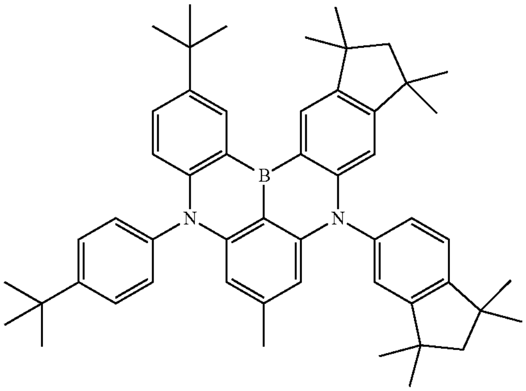
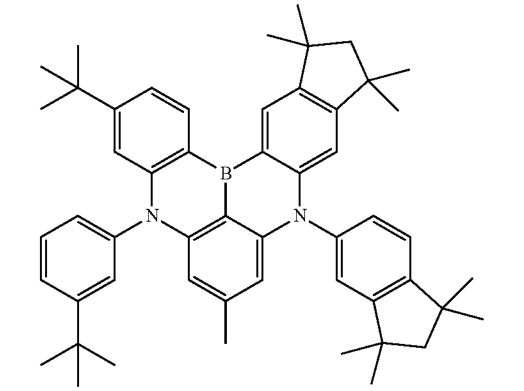
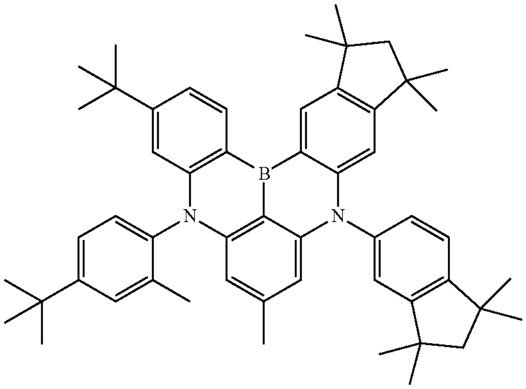
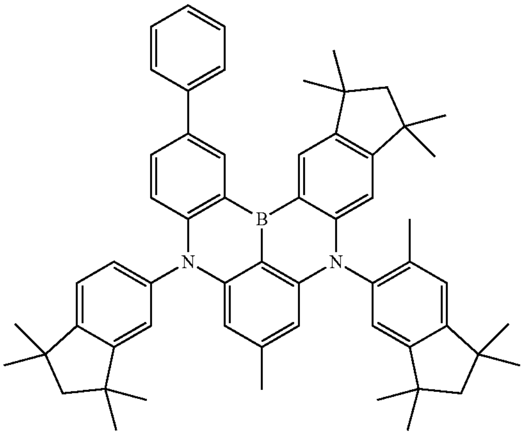

-continued
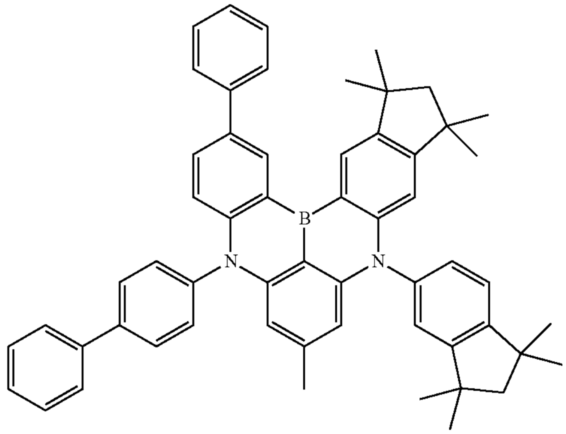
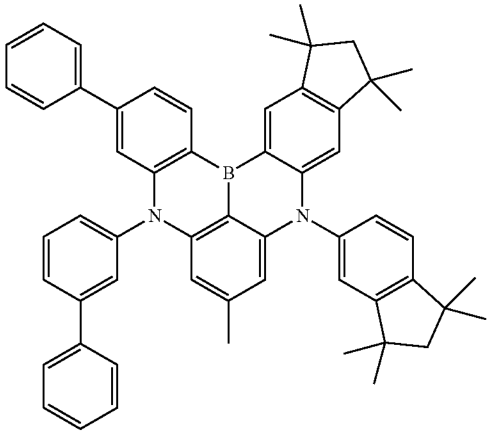
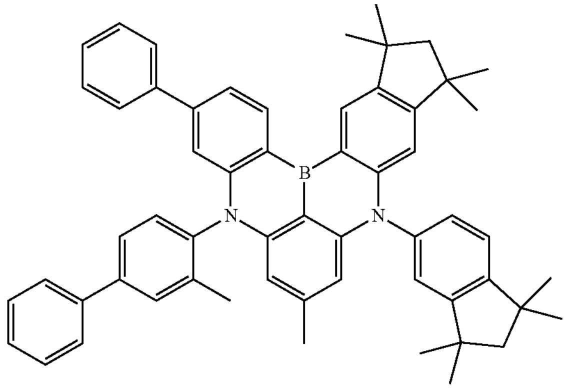
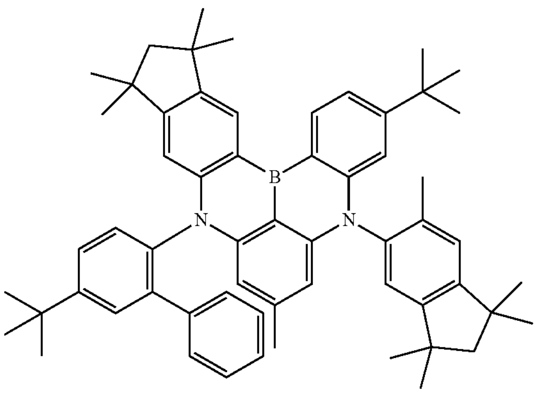
-continued
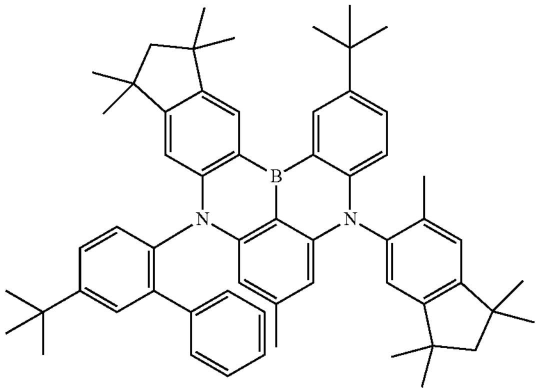
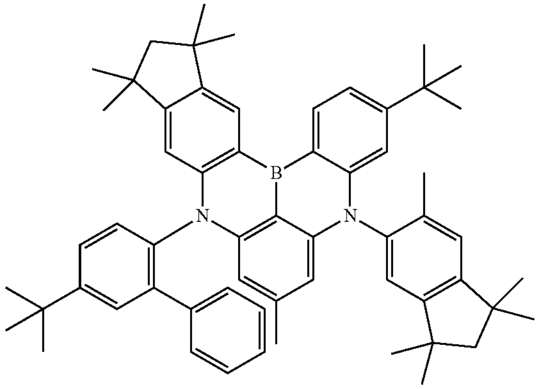
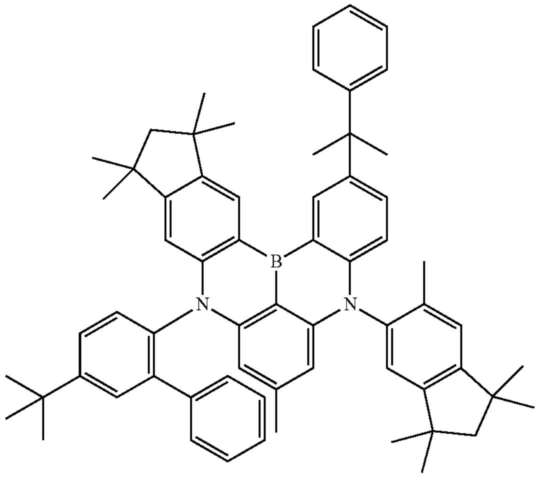
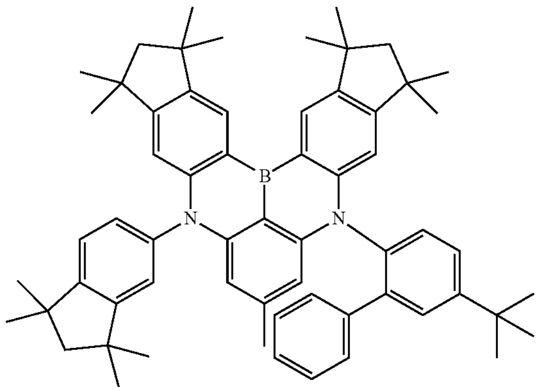

-continued
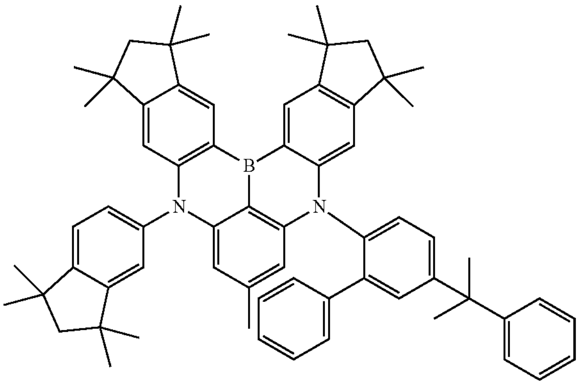
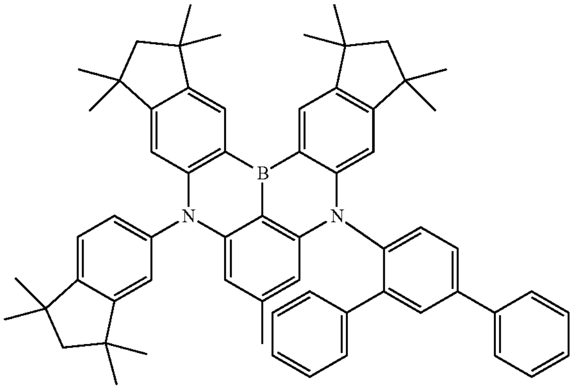
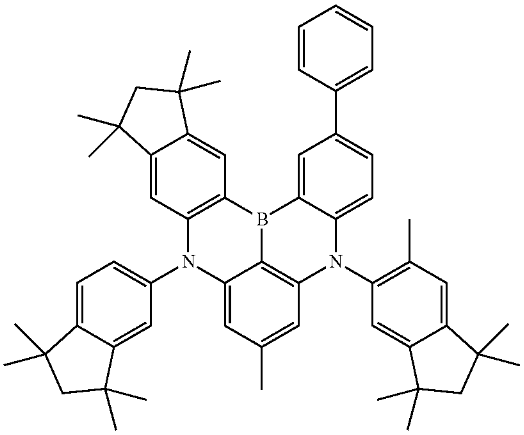
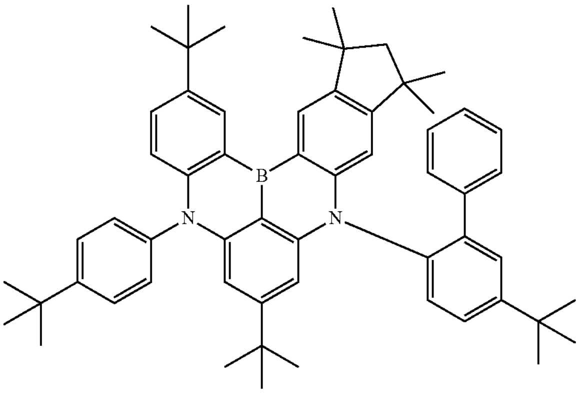
-continued
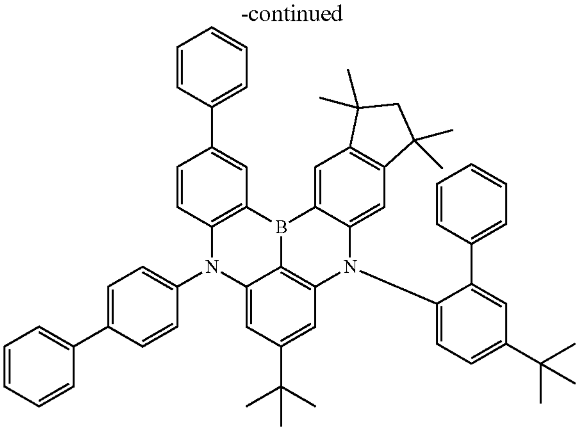
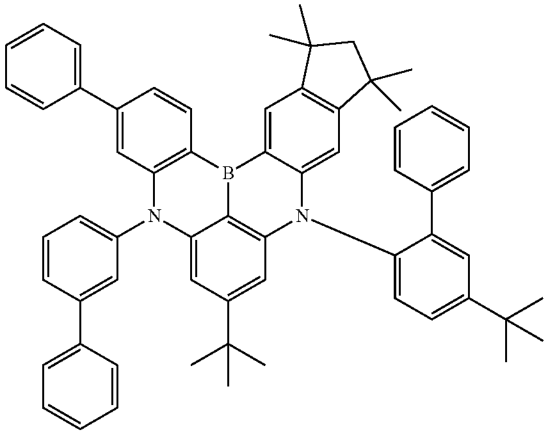
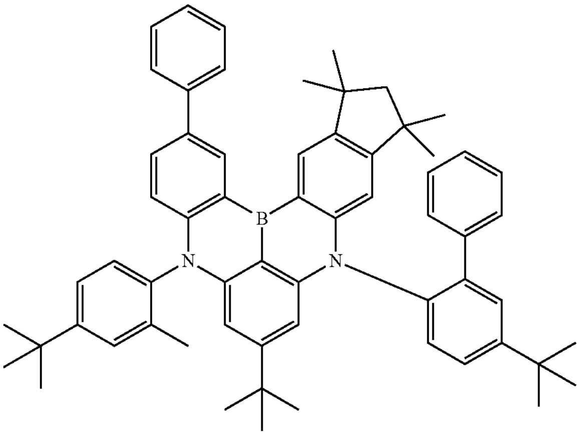
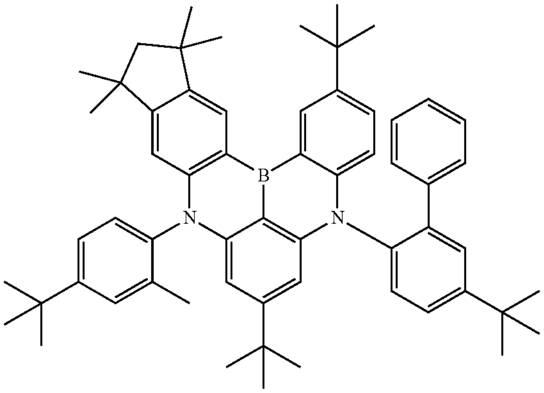

-continued
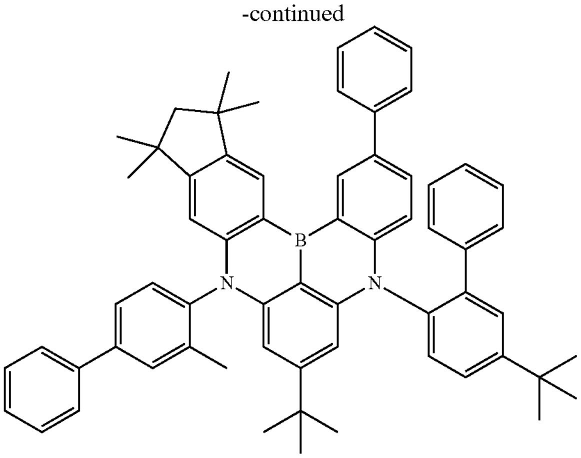
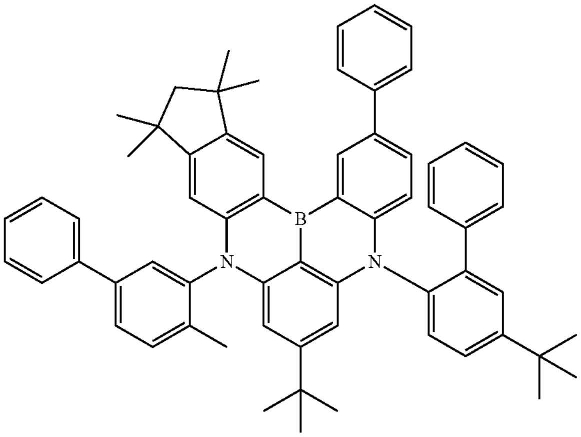
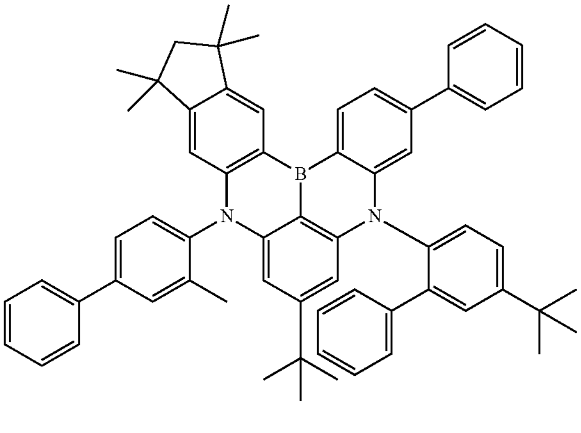
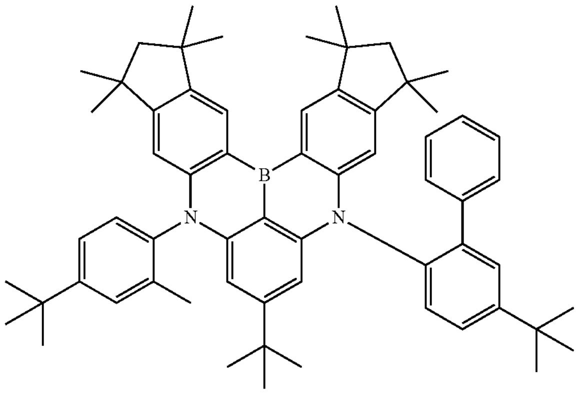
-continued
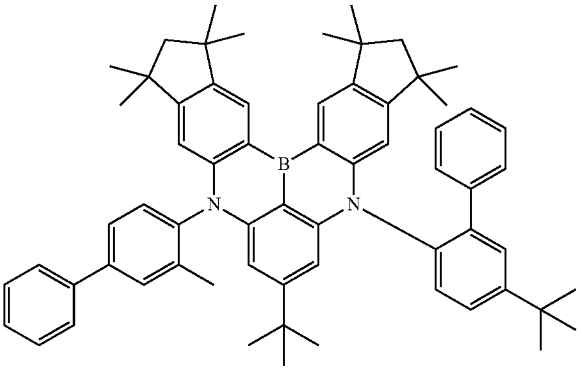
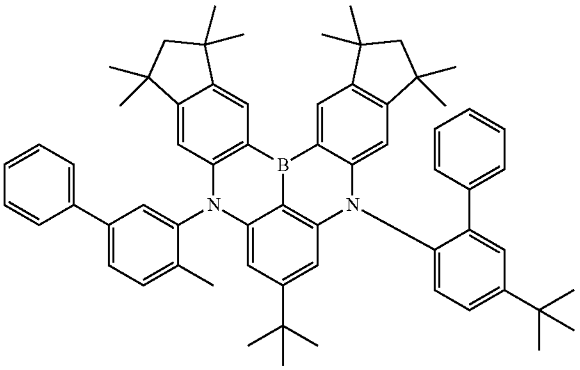
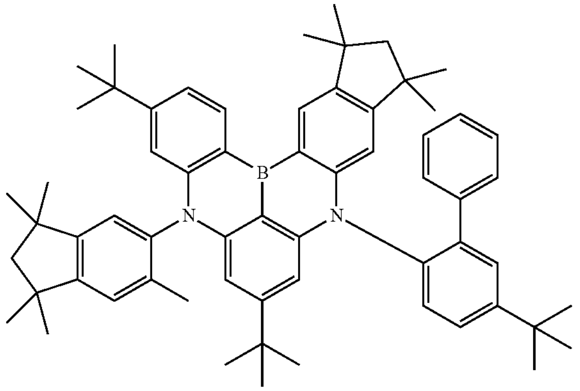
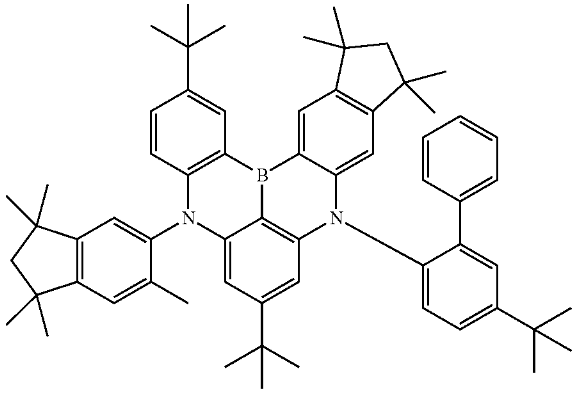

-continued
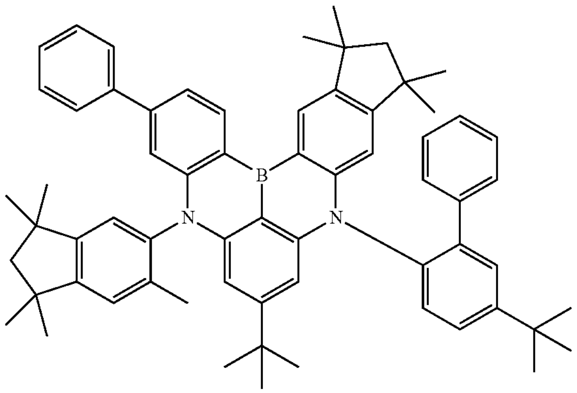
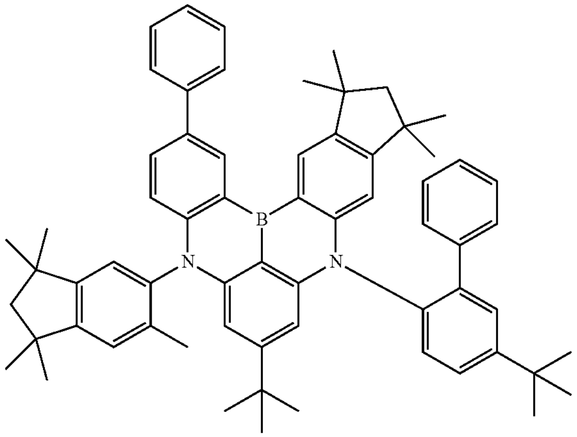
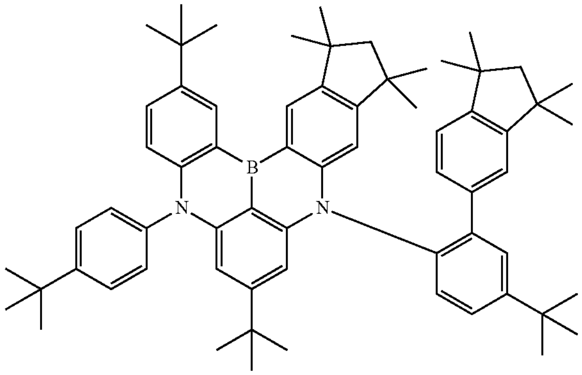
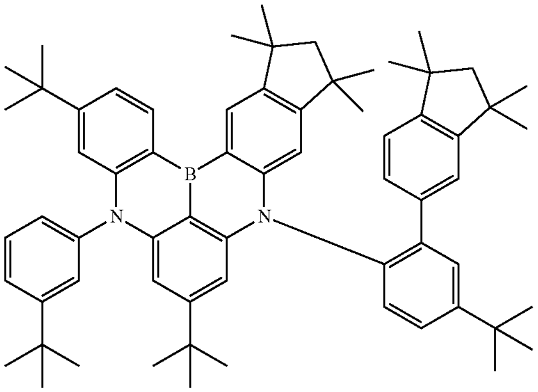
-continued
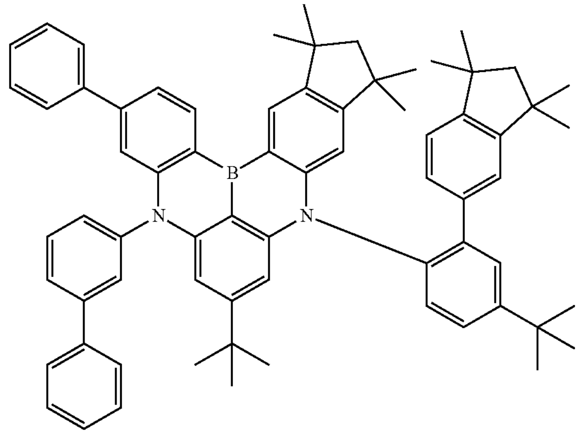
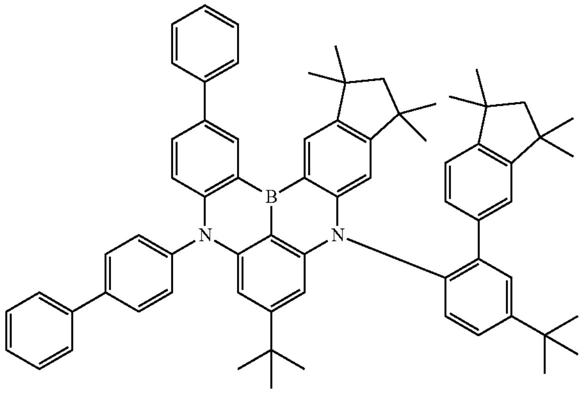
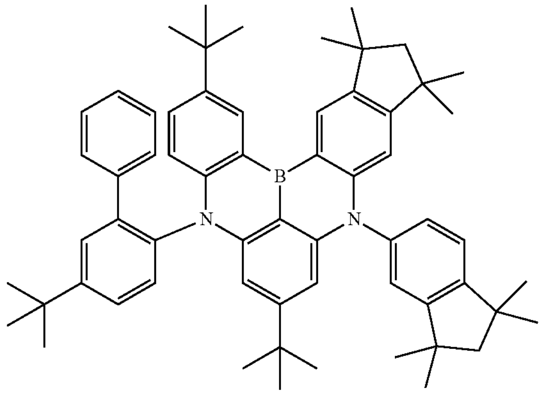
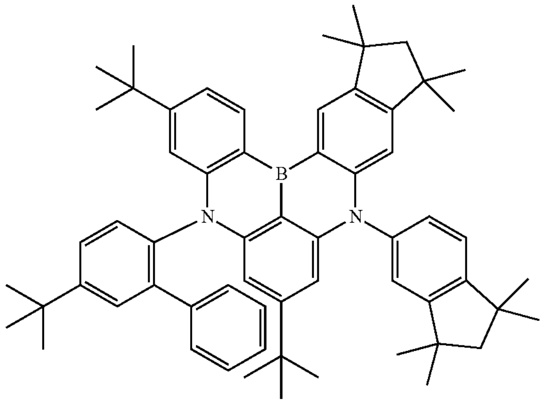

-continued
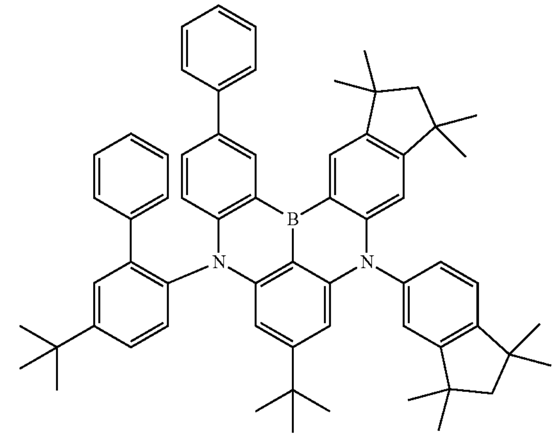
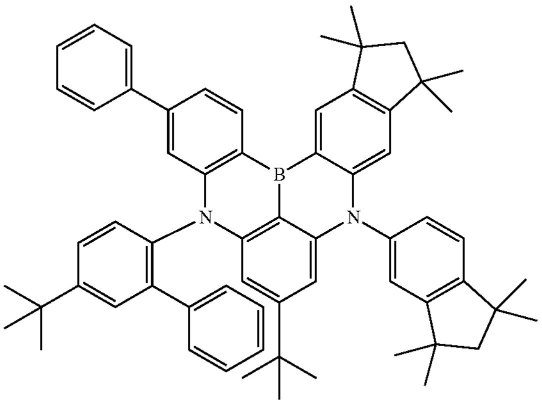
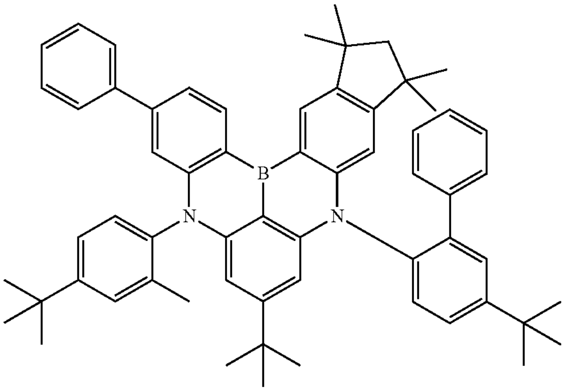
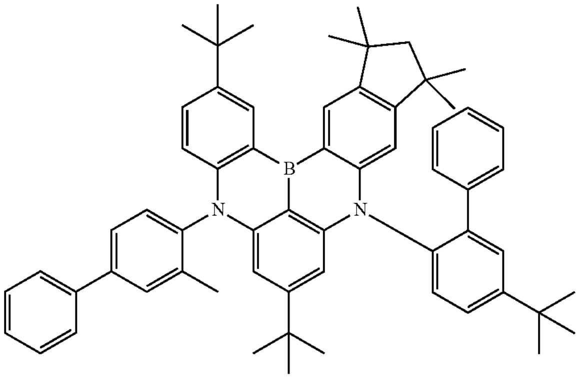
-continued
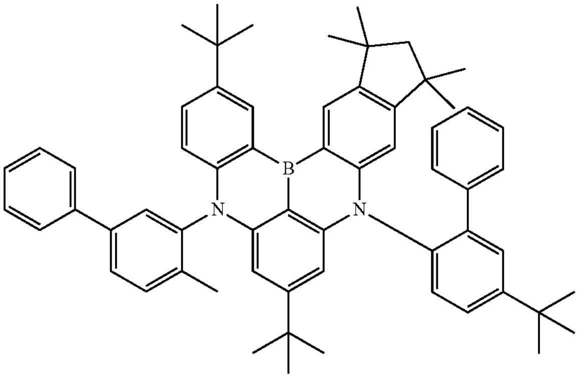
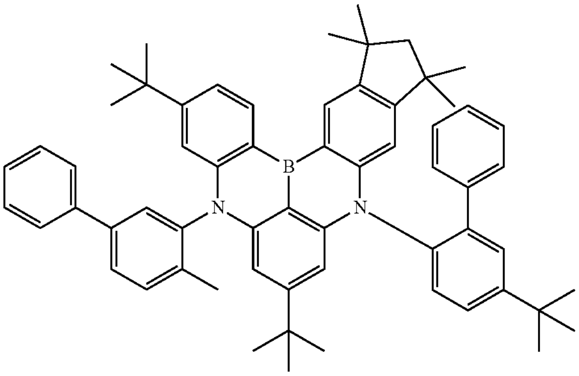
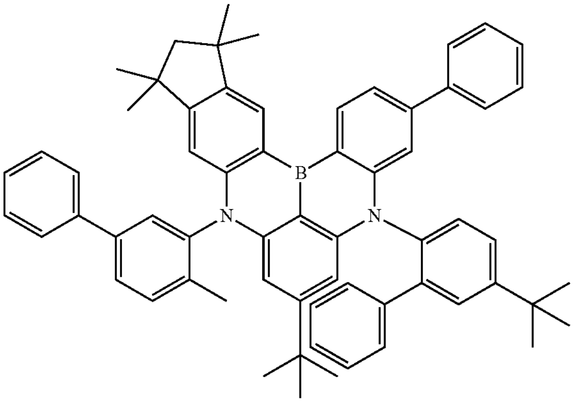
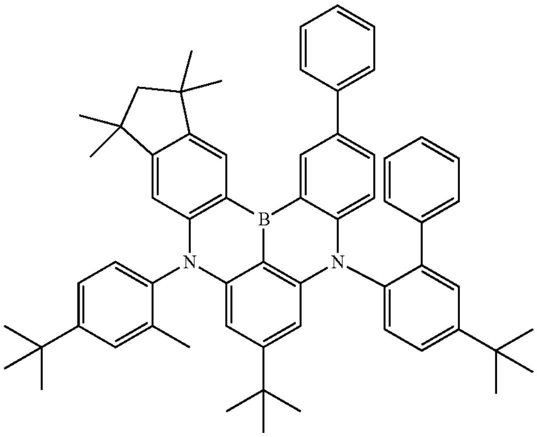

-continued
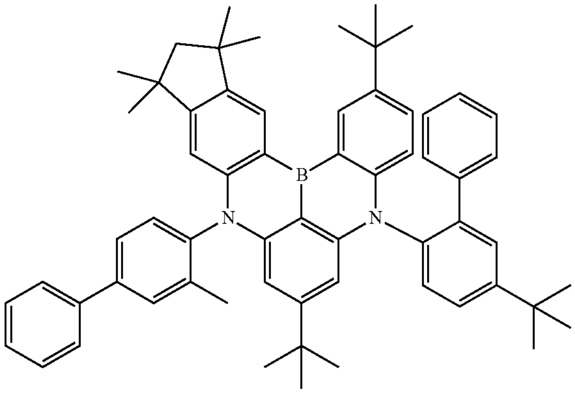
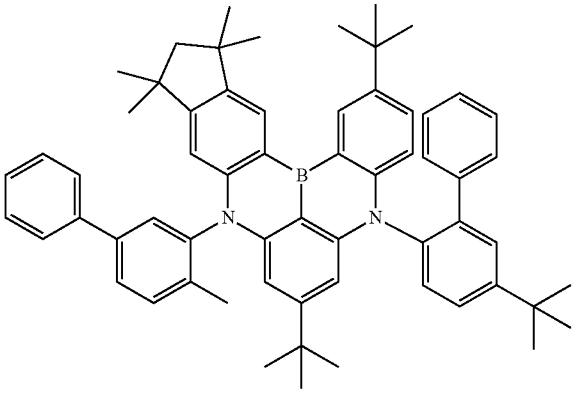
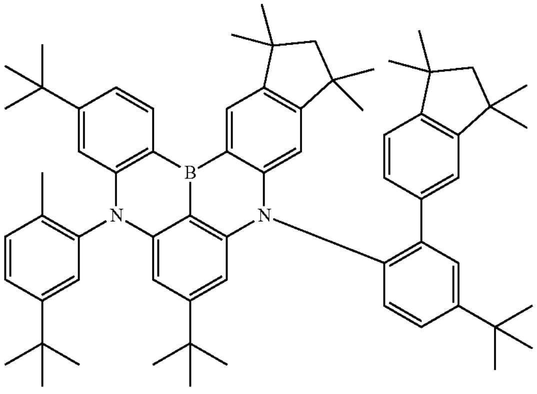
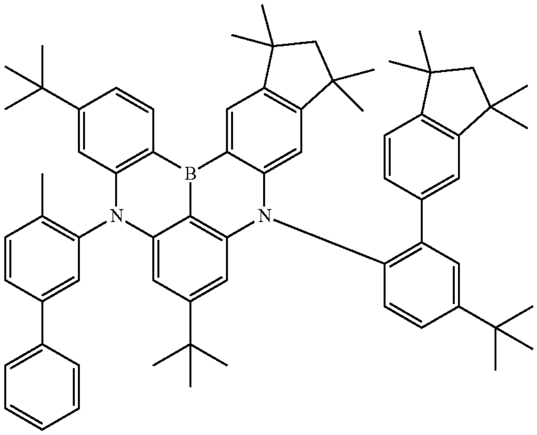
-continued
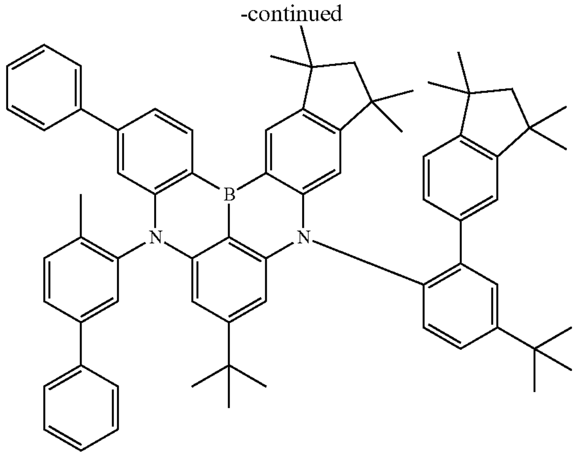
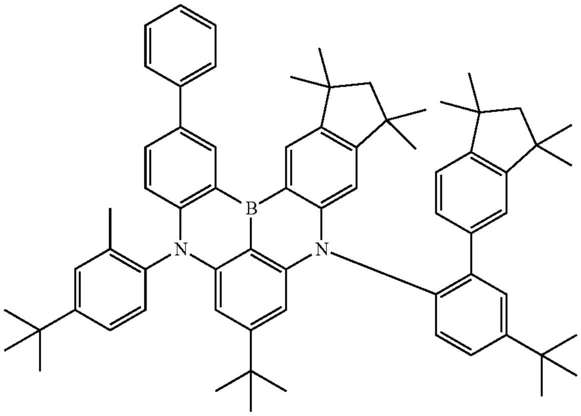
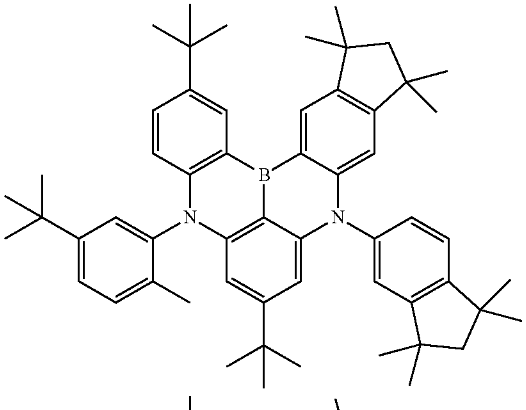
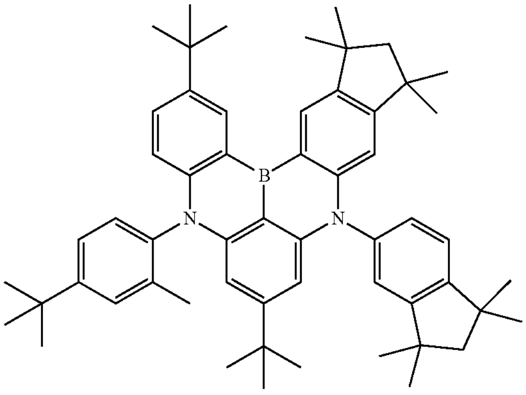

-continued
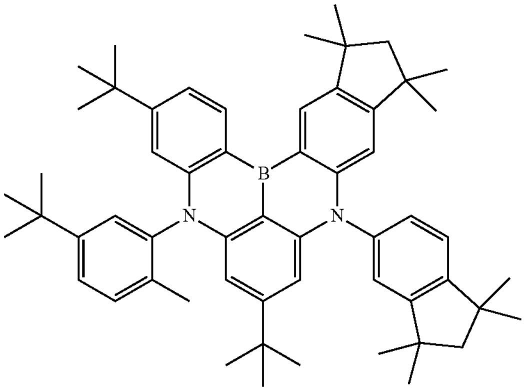
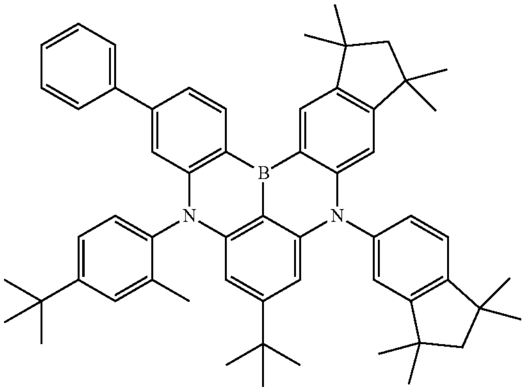
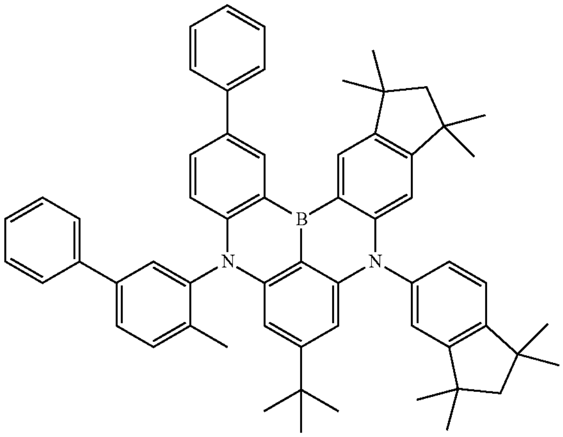
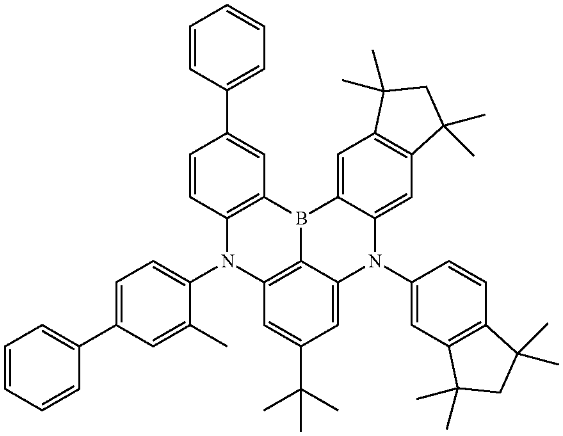
-continued
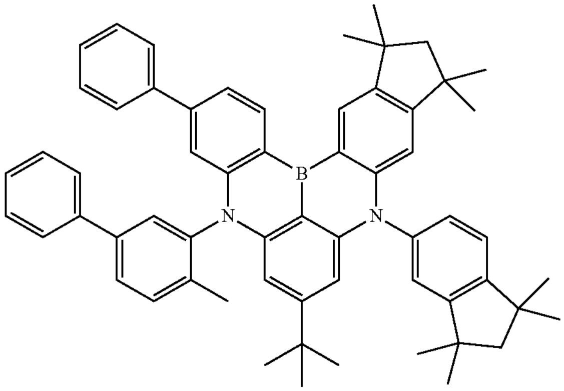
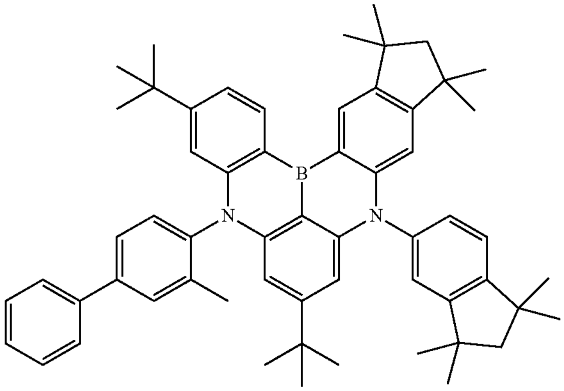
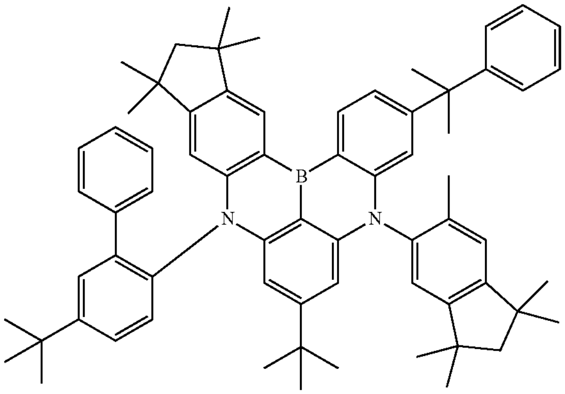
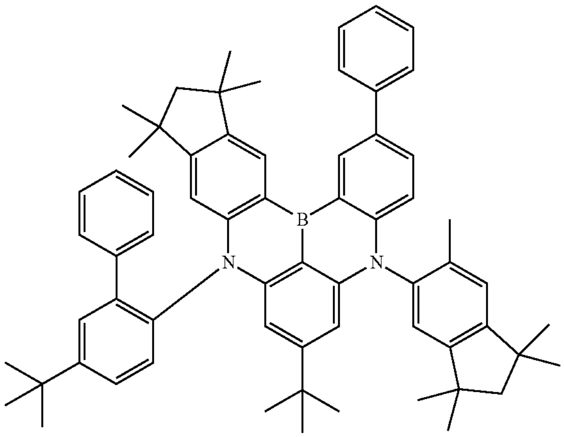

-continued
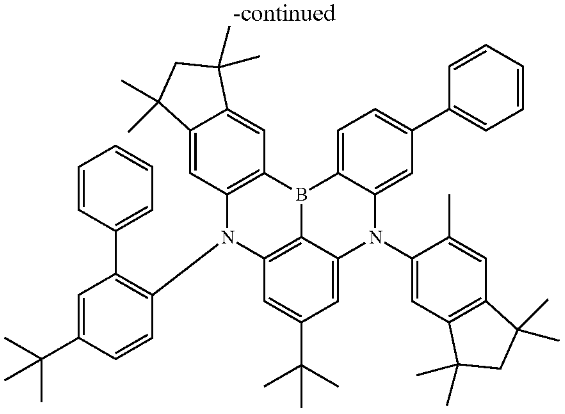
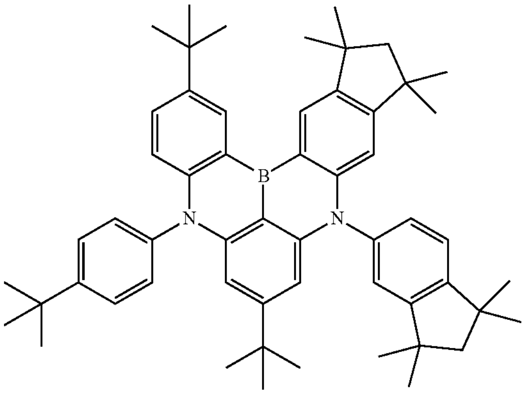
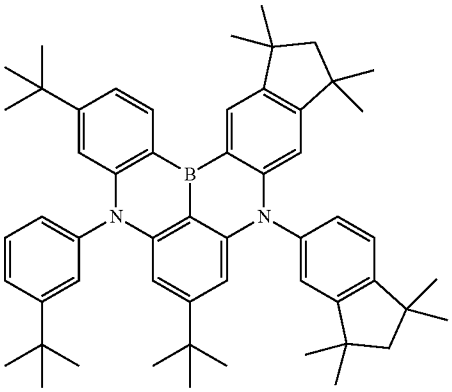
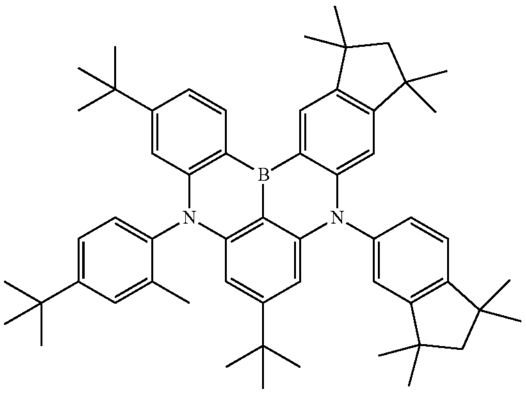
-continued
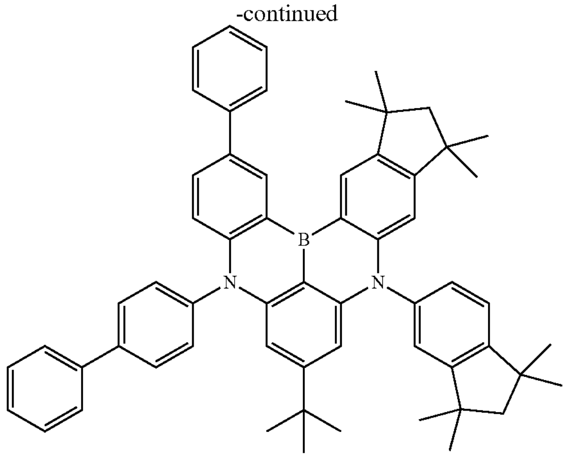
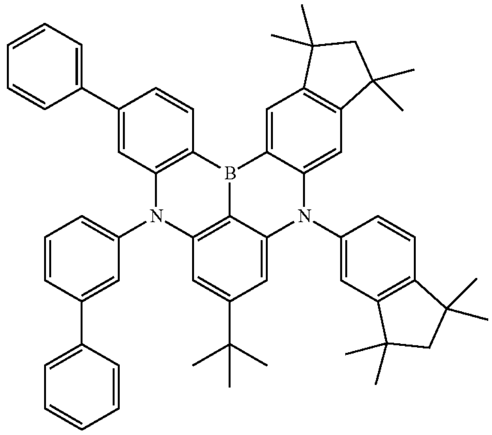
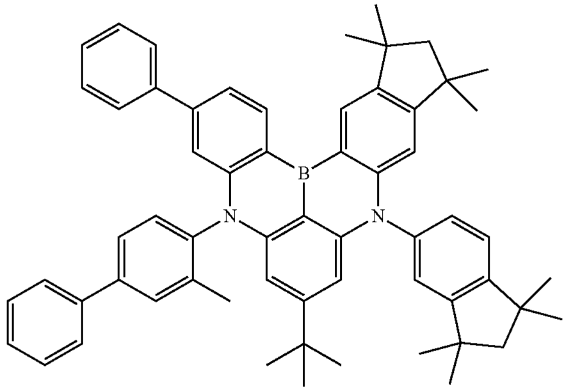
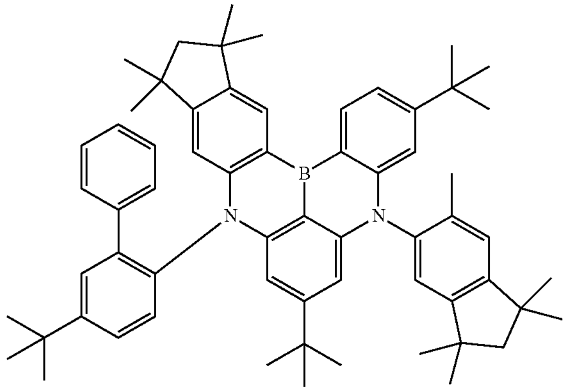

-continued
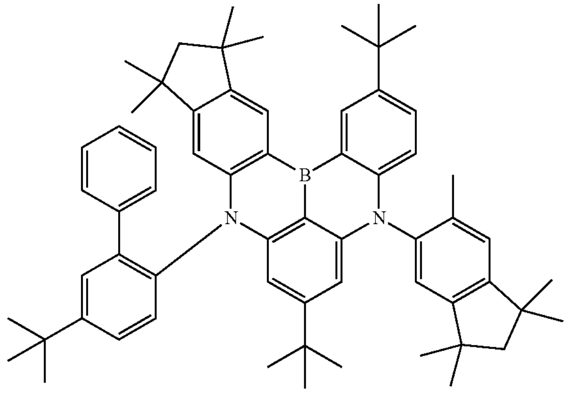
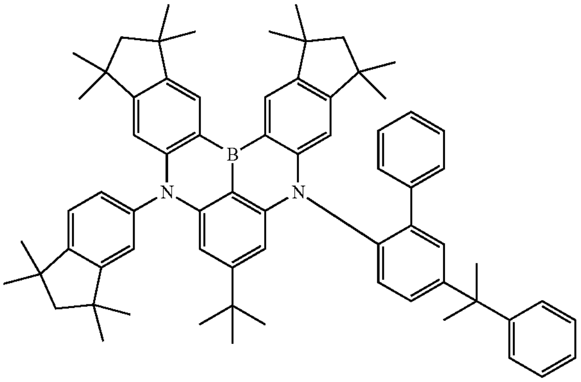
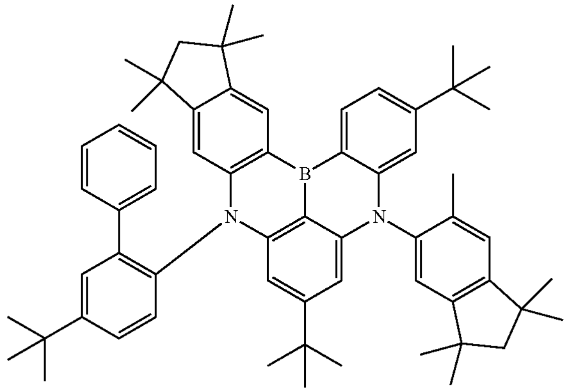
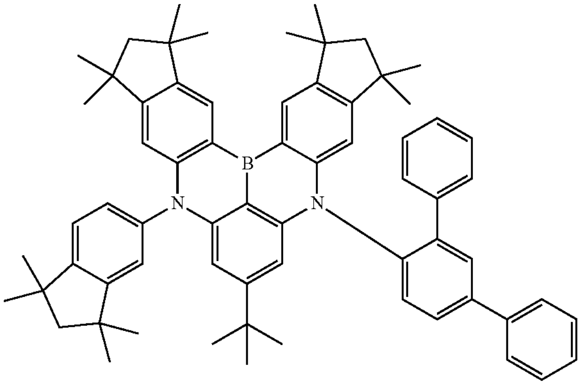
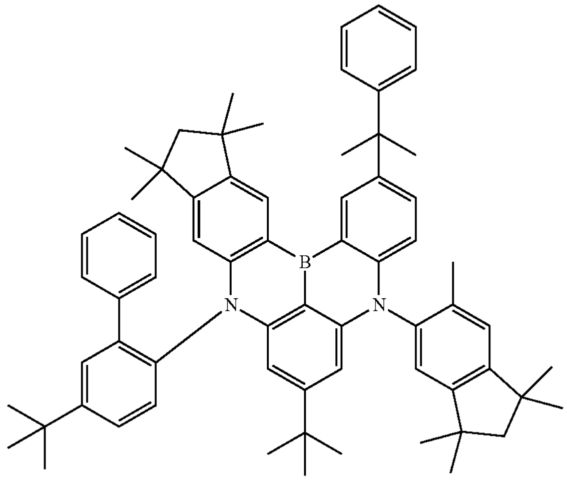
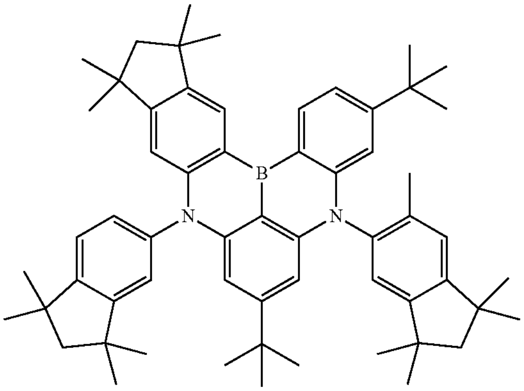
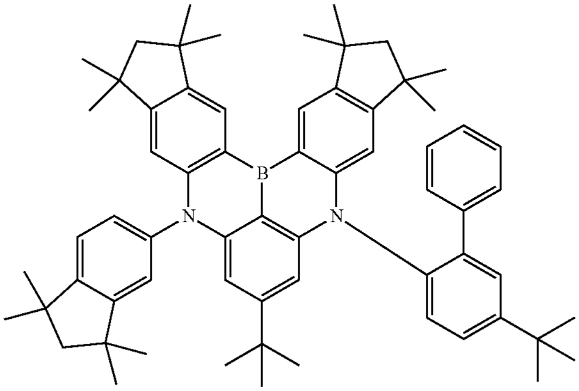
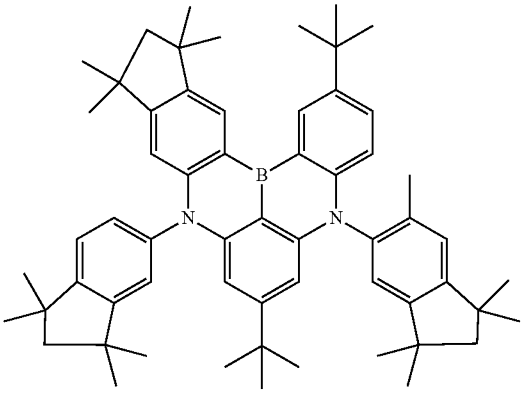
-continued -continued
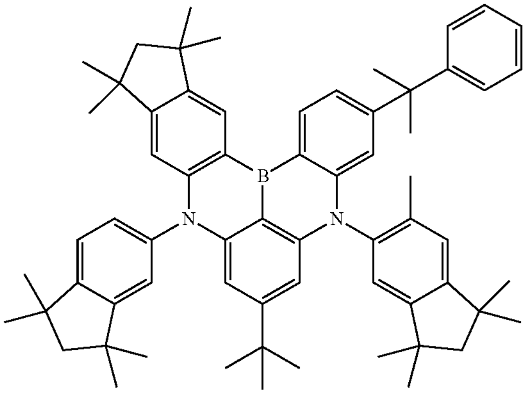
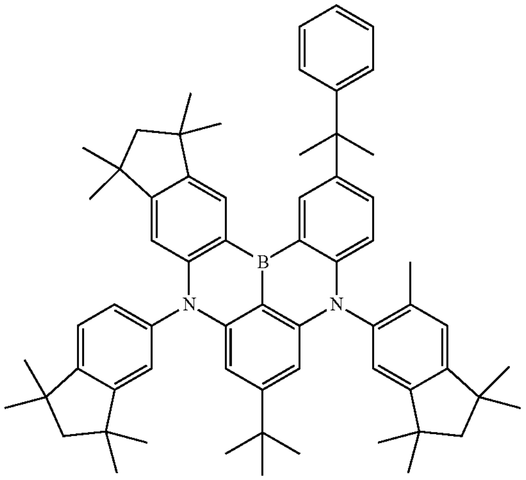
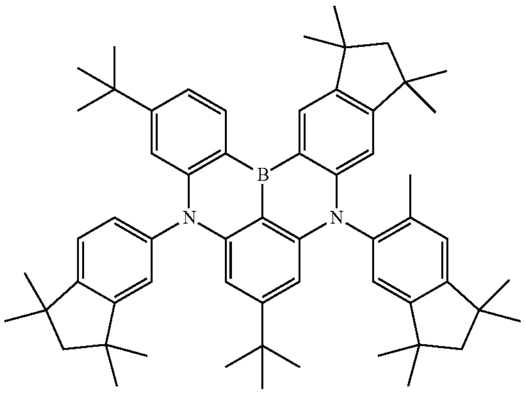
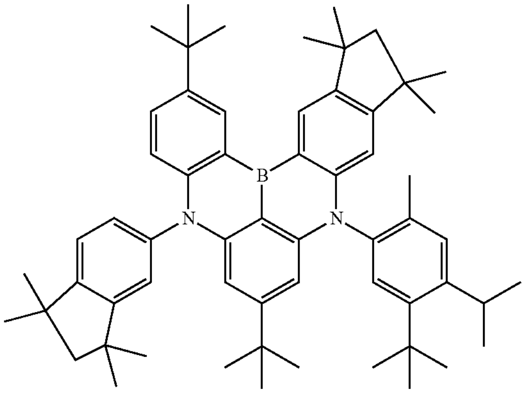
-continued
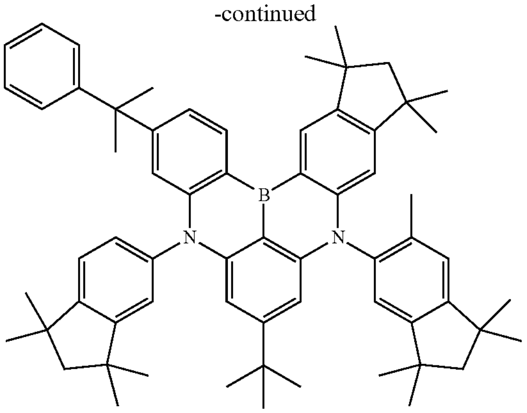
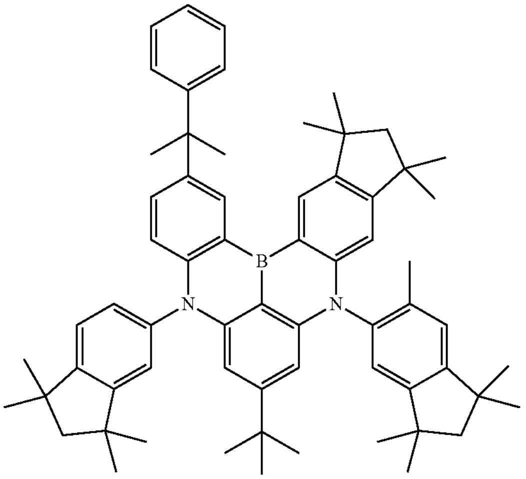
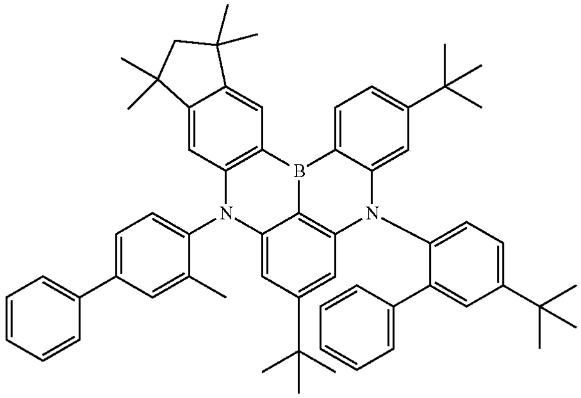
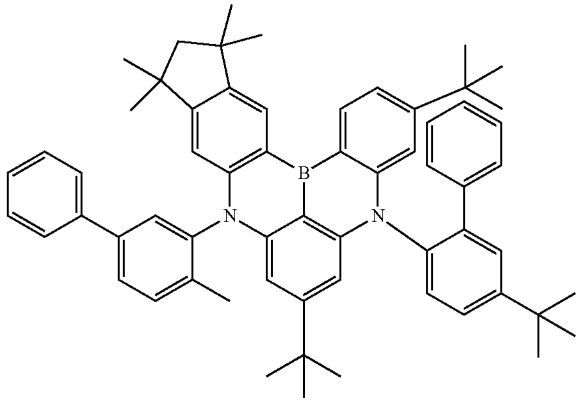

-continued
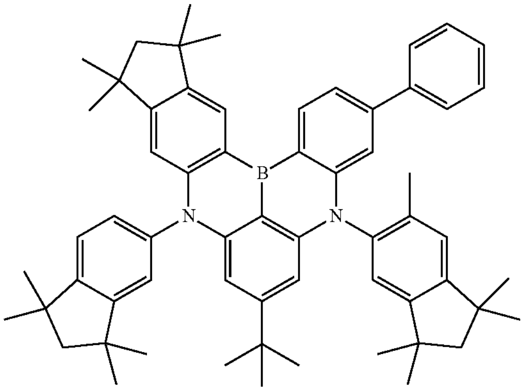
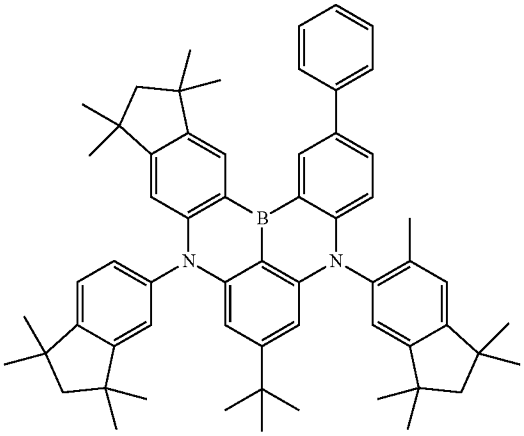
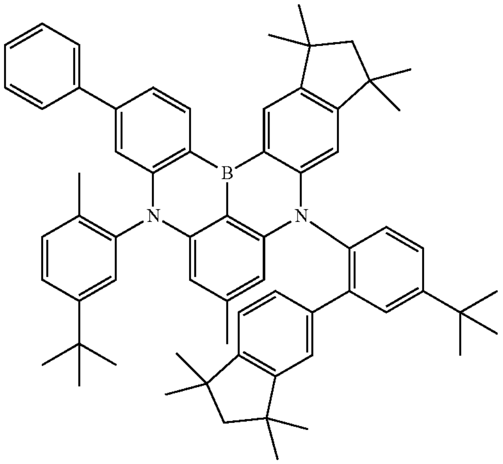
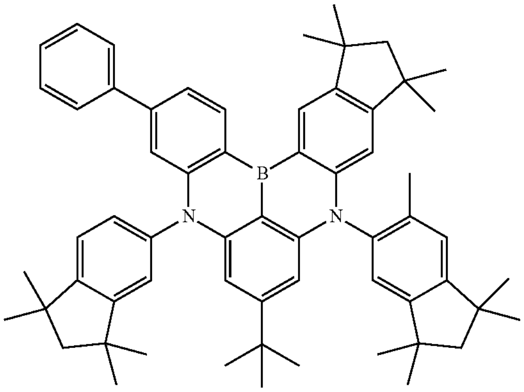
-continued
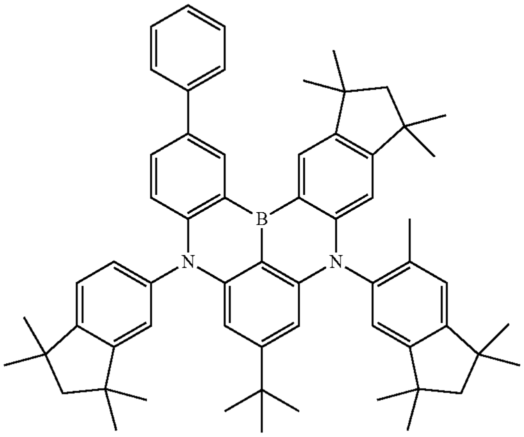
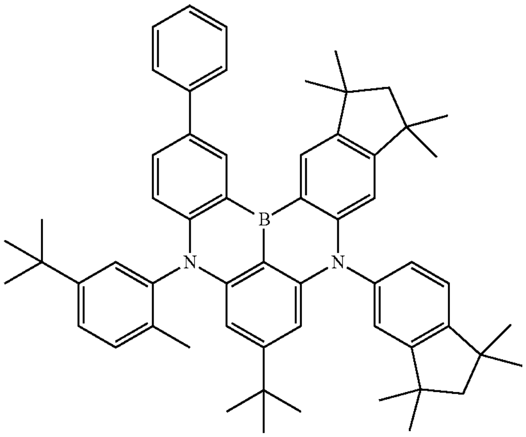
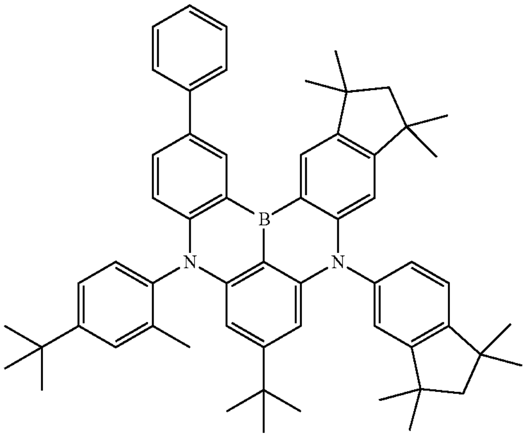
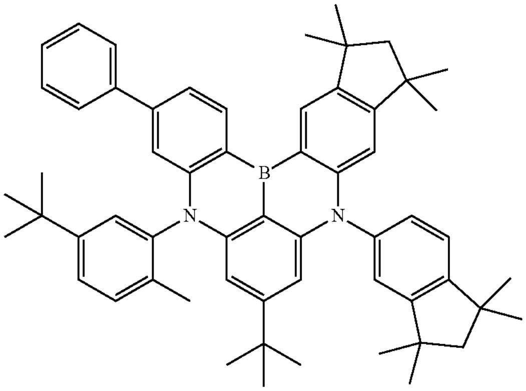

-continued
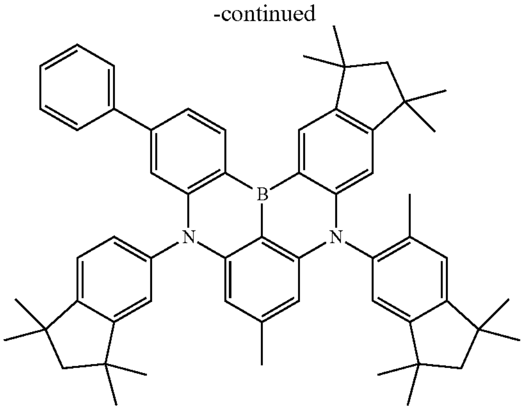
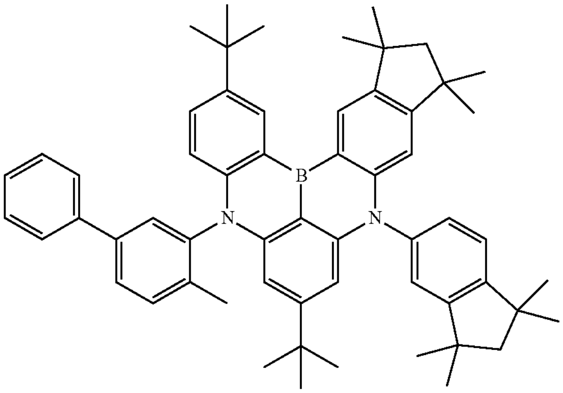
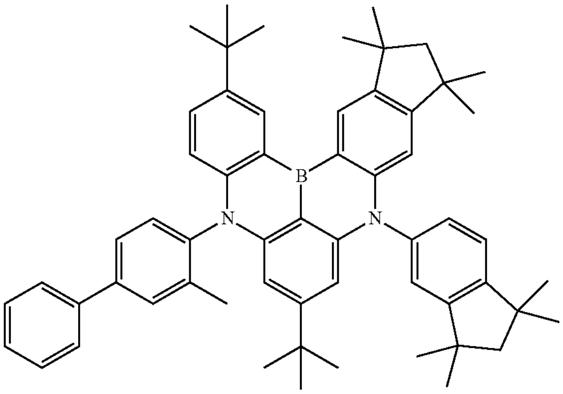
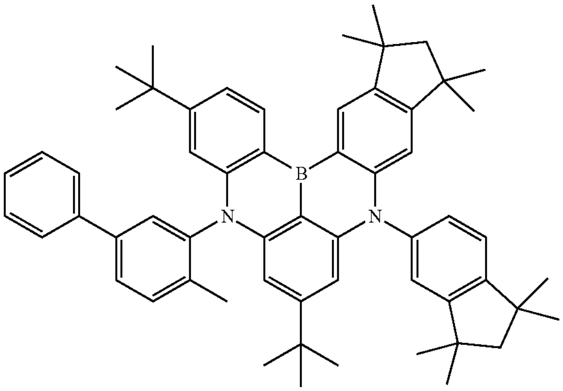
-continued
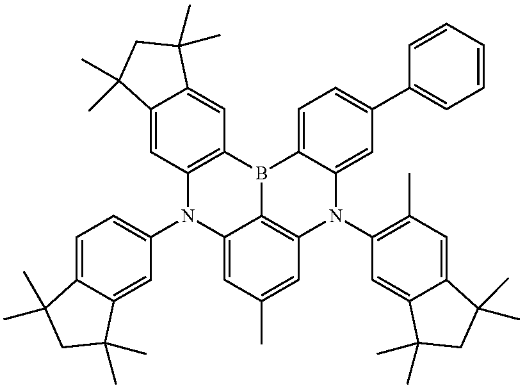
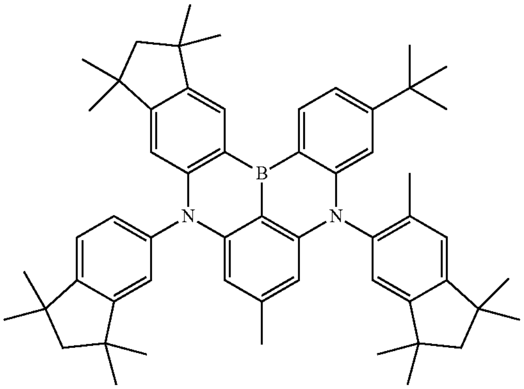
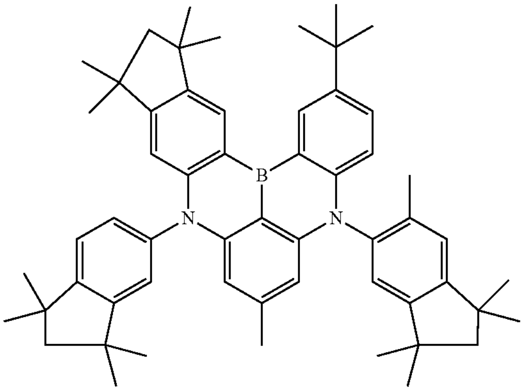
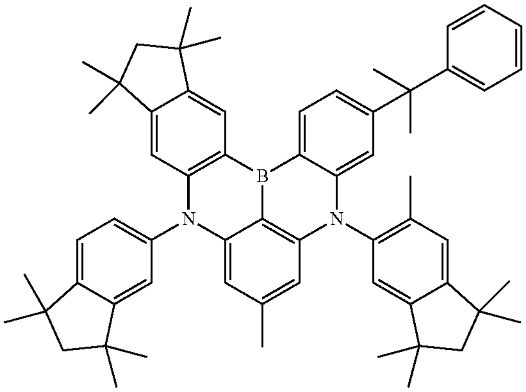

-continued
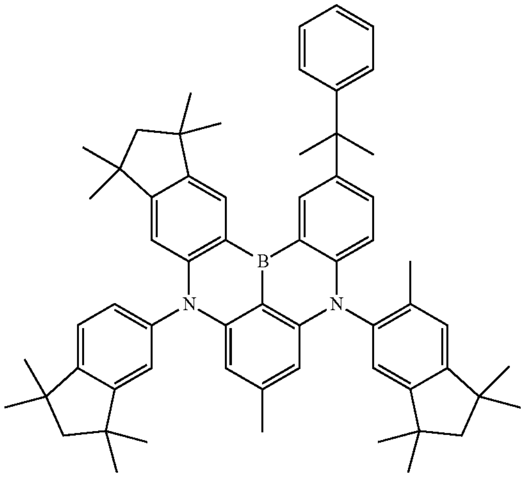
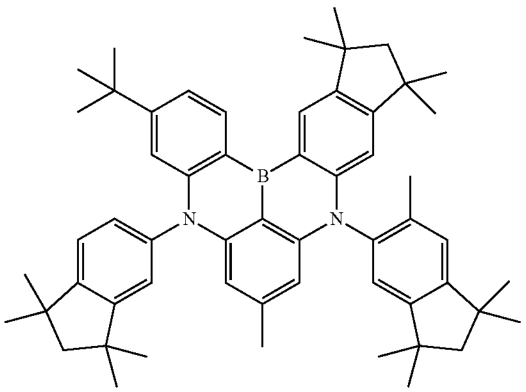
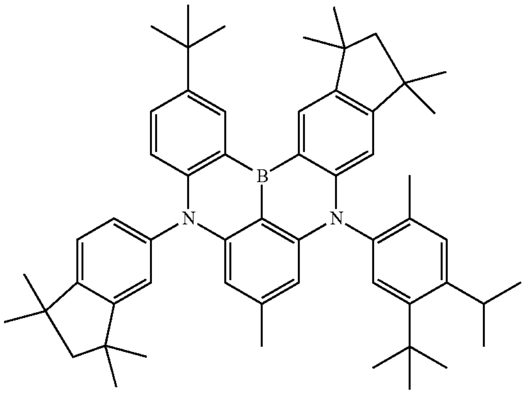
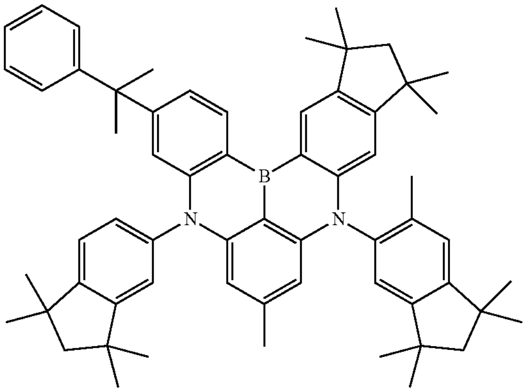
-continued
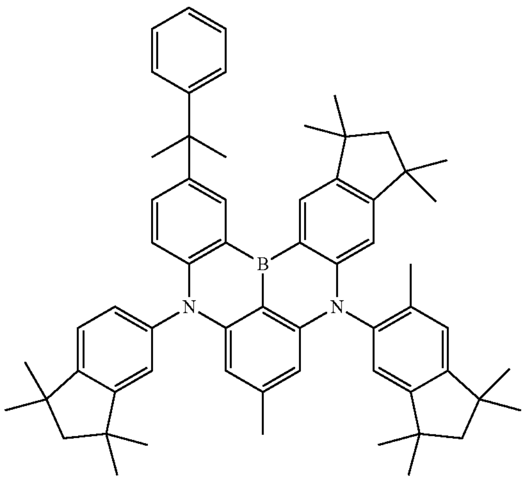
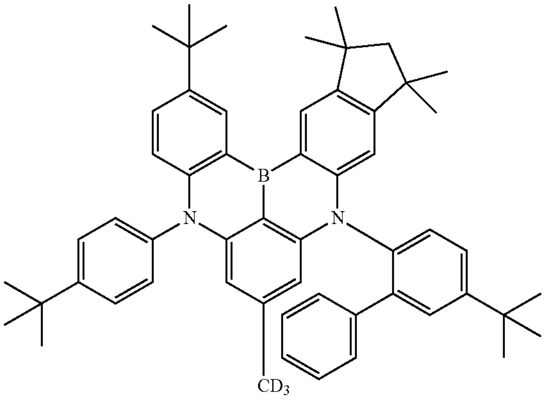
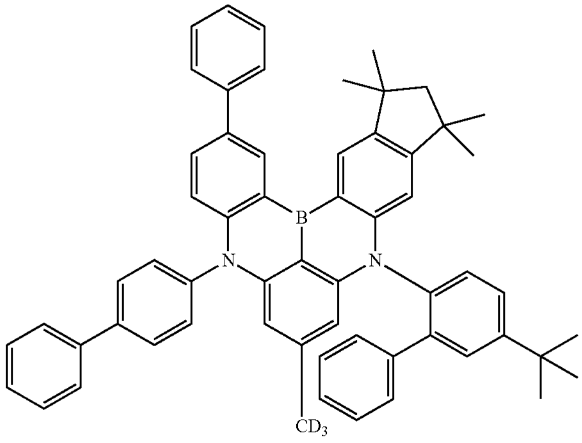

-continued
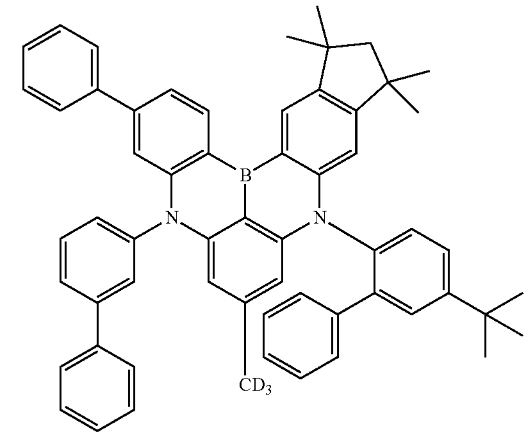
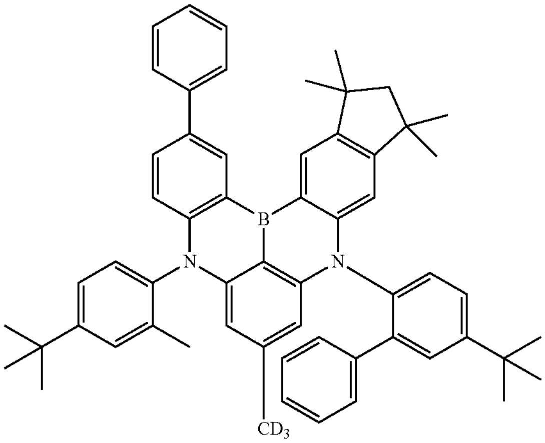
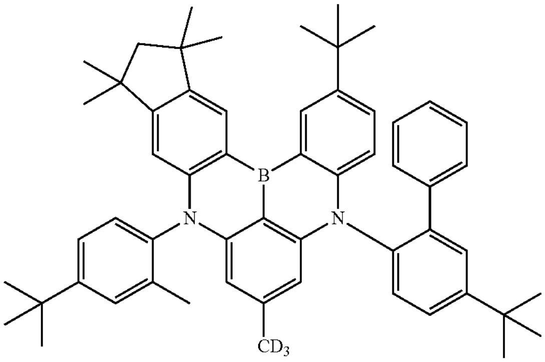
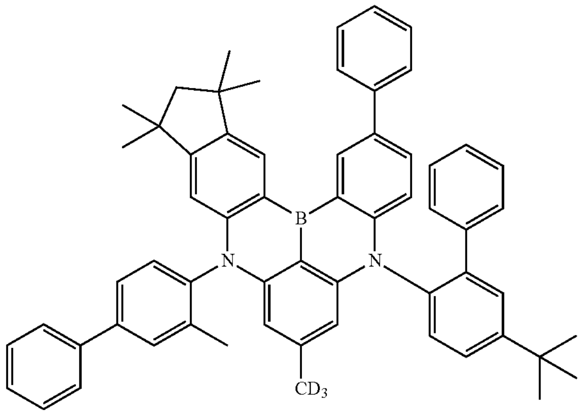
-continued
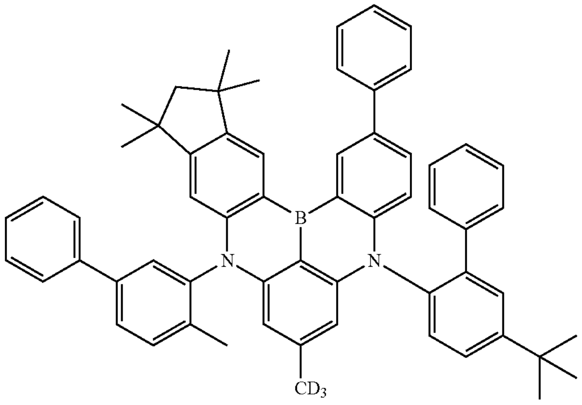
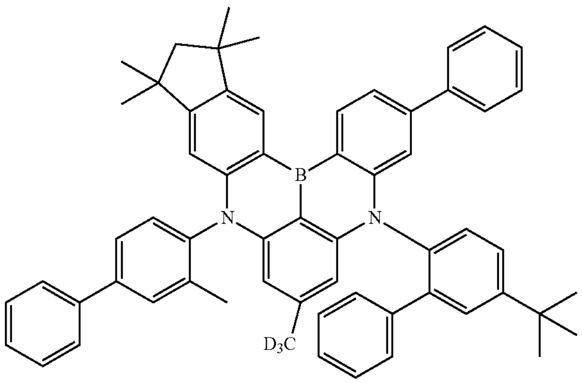
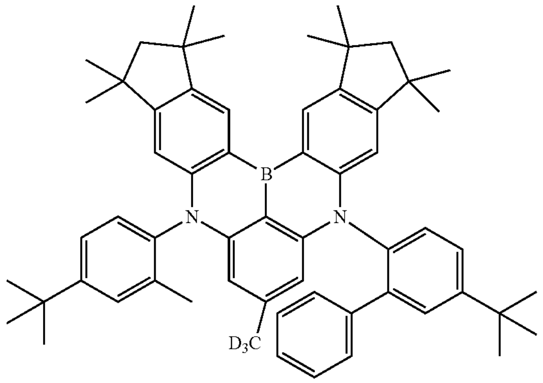
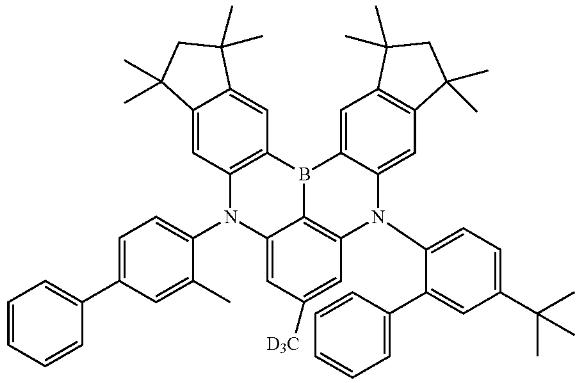

-continued
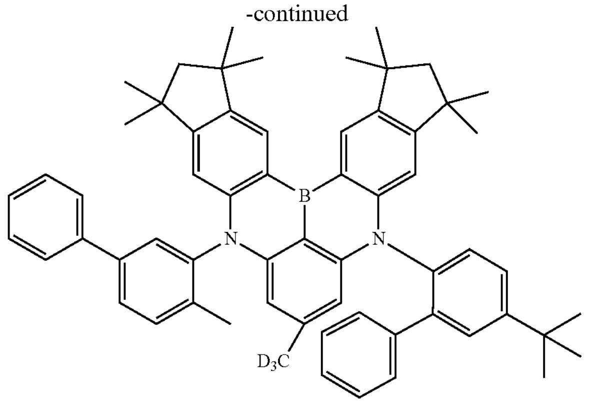
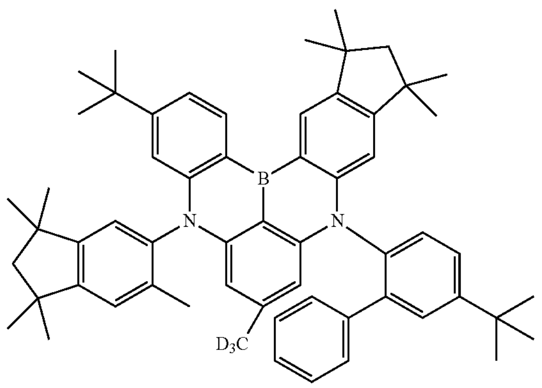
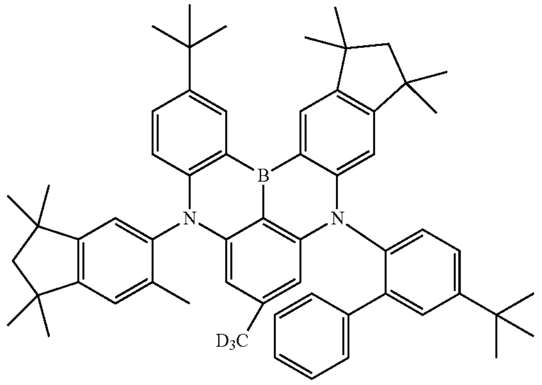
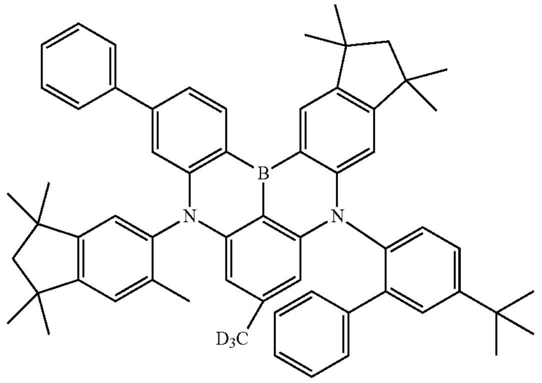
-continued
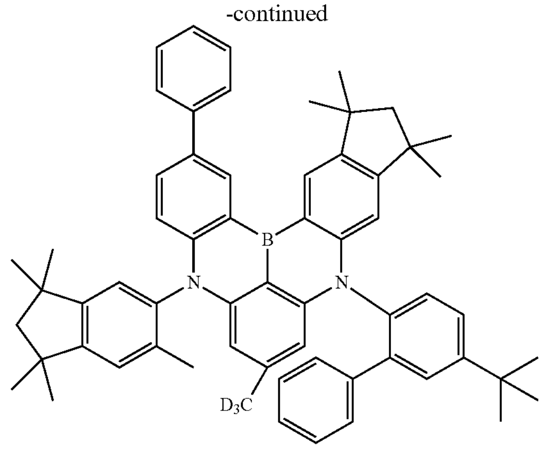
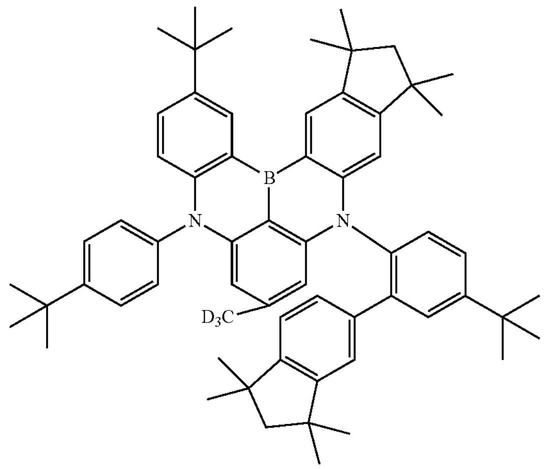
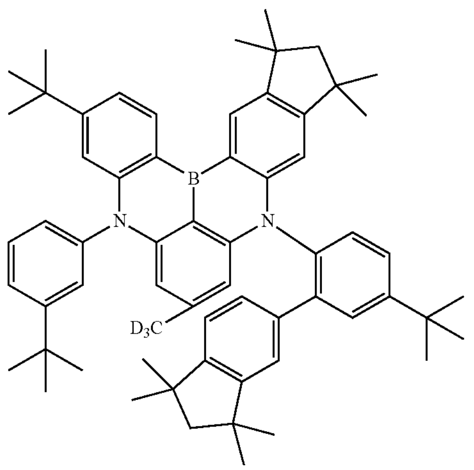

-continued
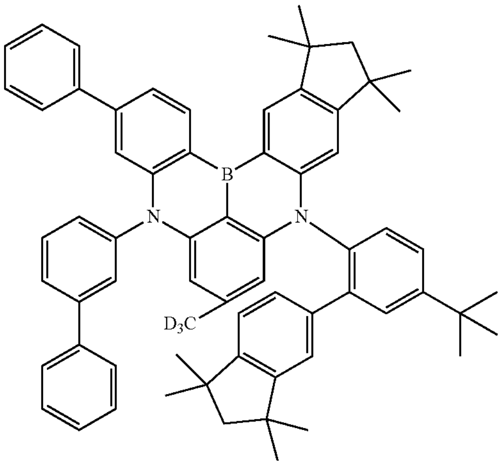
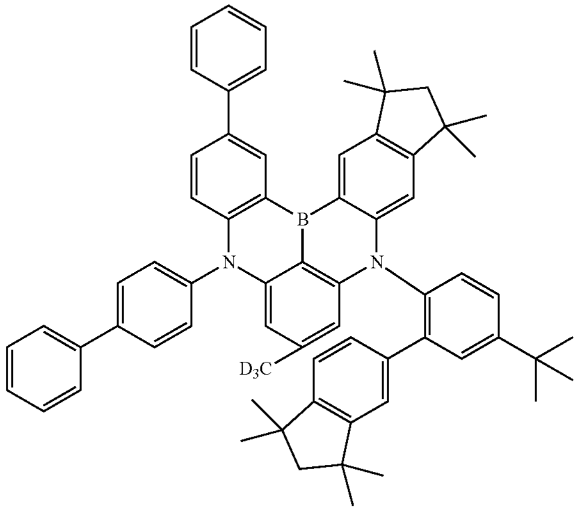
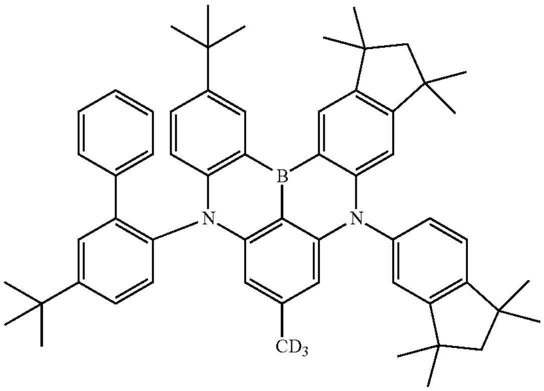
-continued
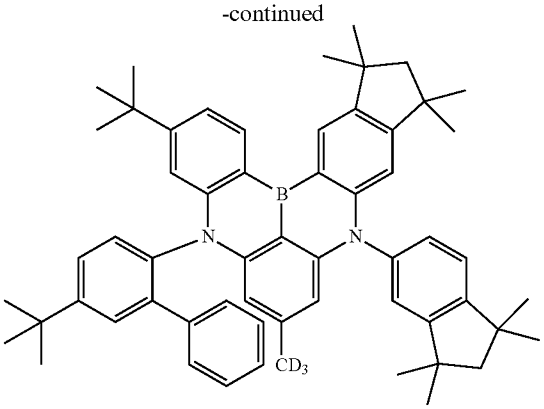
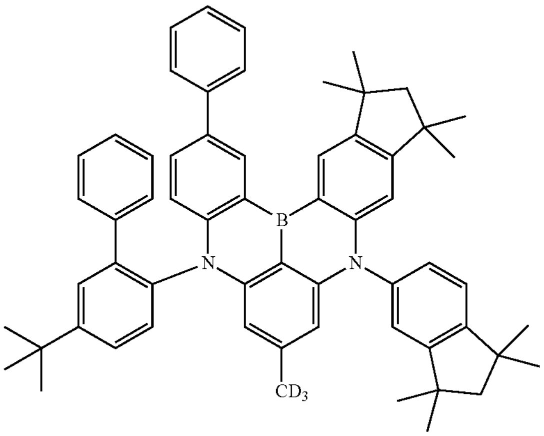
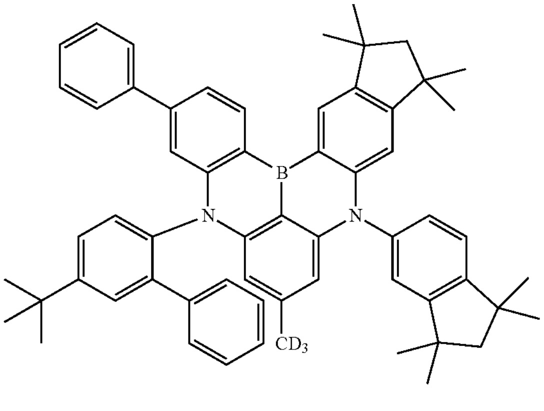
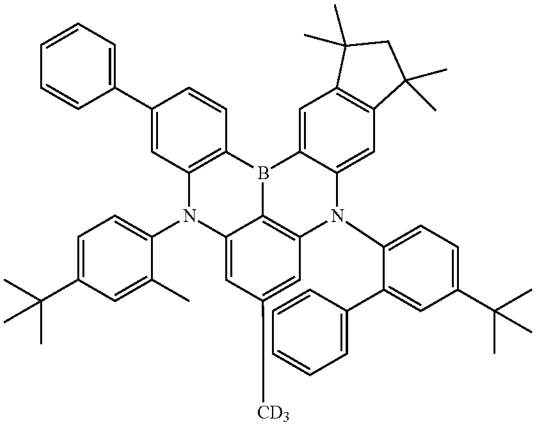

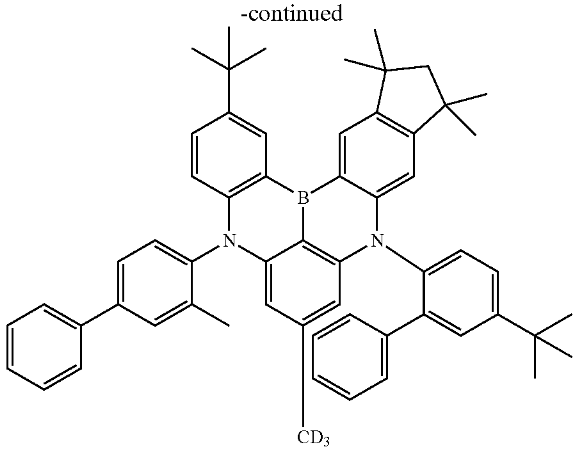
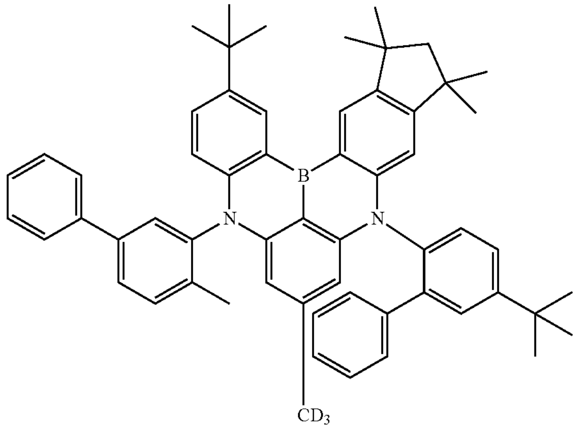
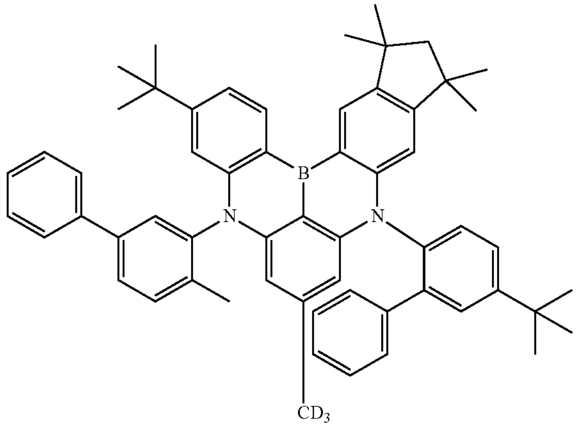
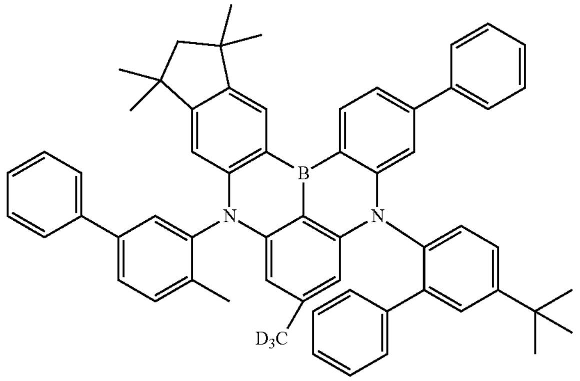
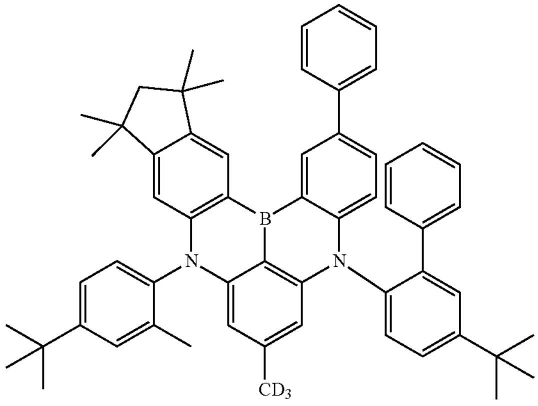
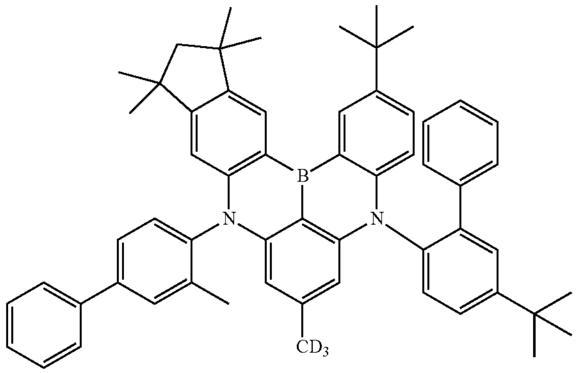
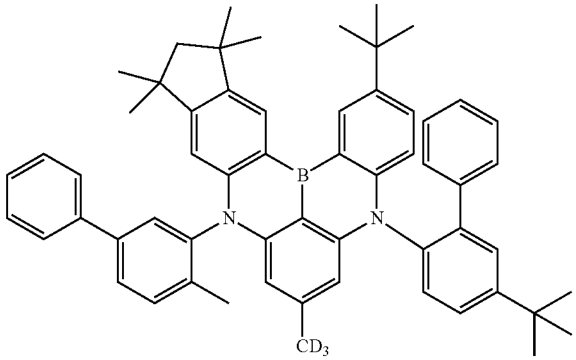
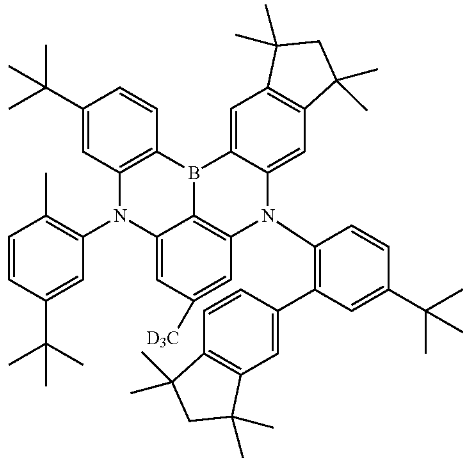

-continued
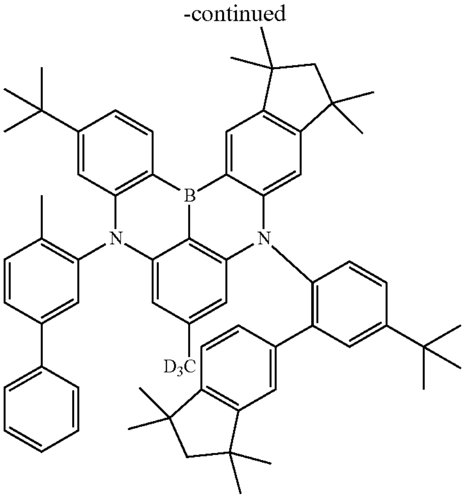
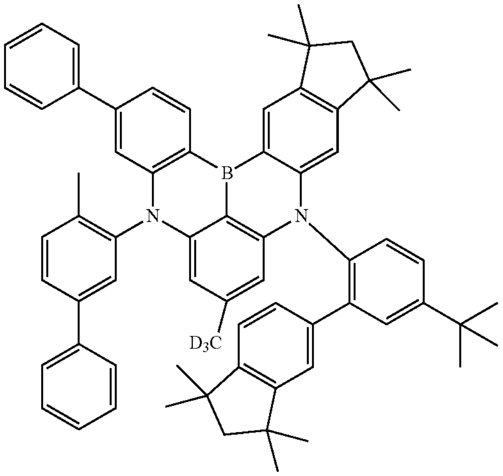
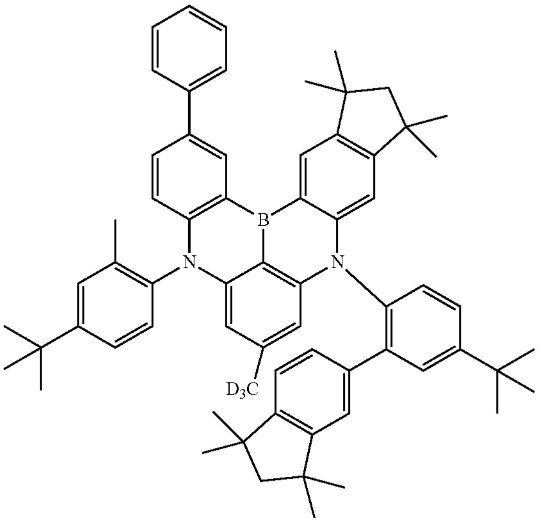
-continued
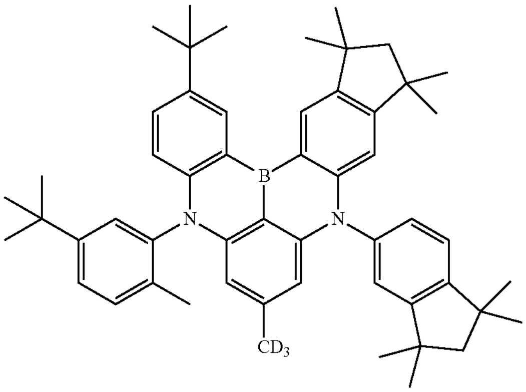
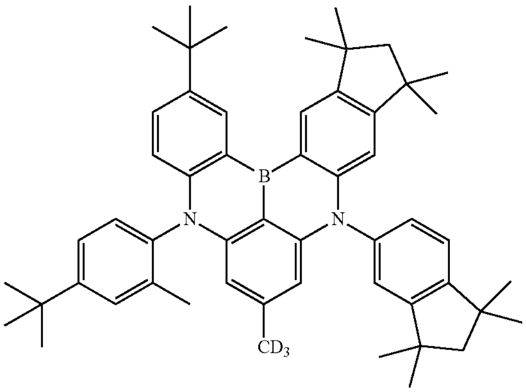
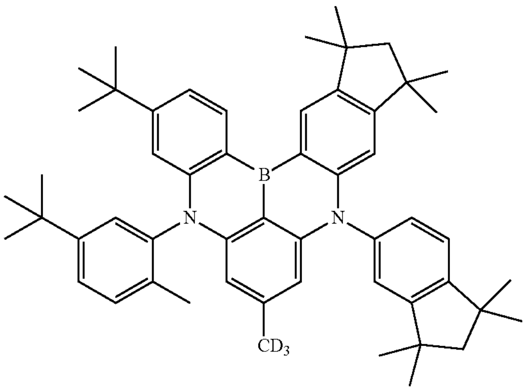
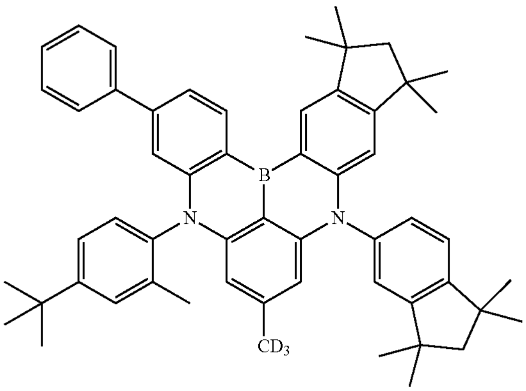

-continued
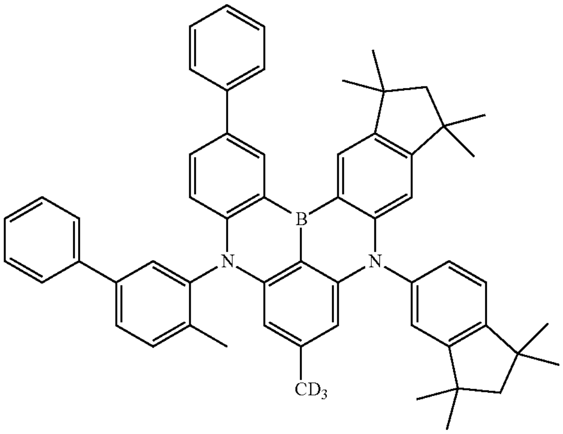
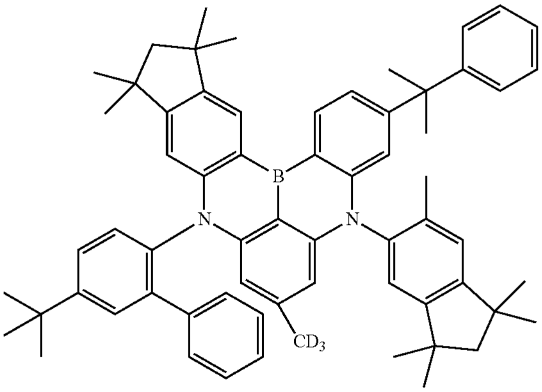
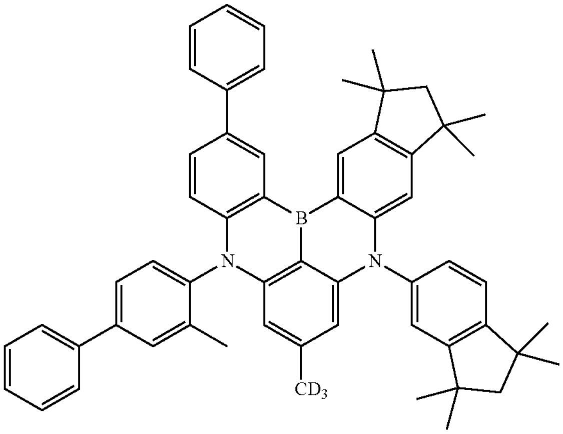
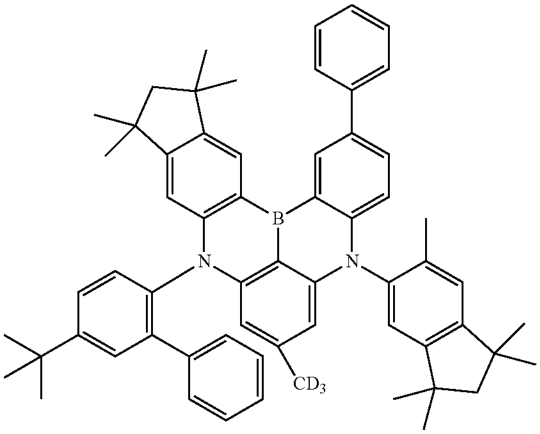
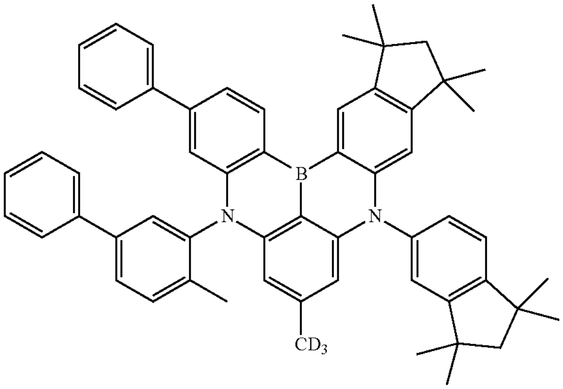
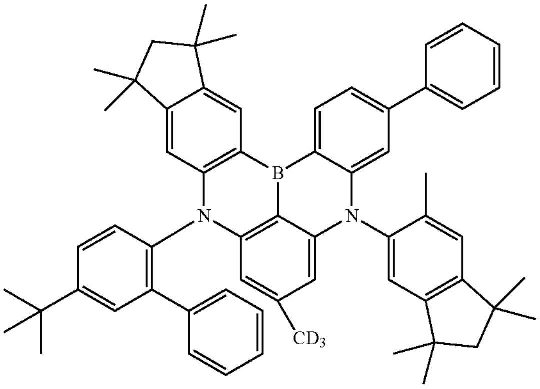
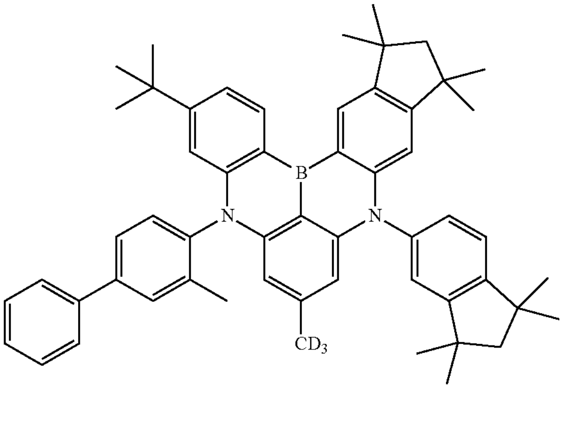
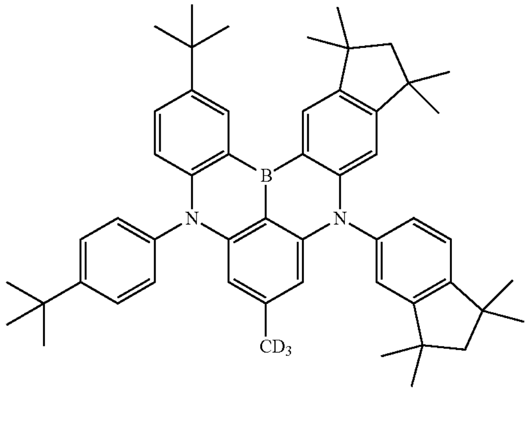
-continued -continued
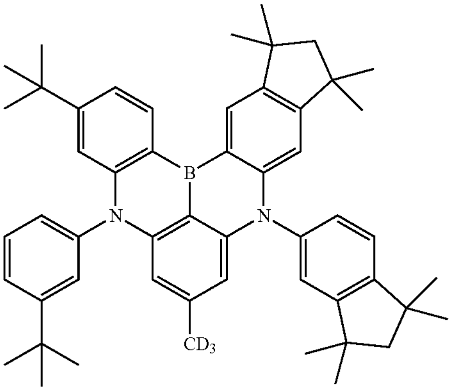
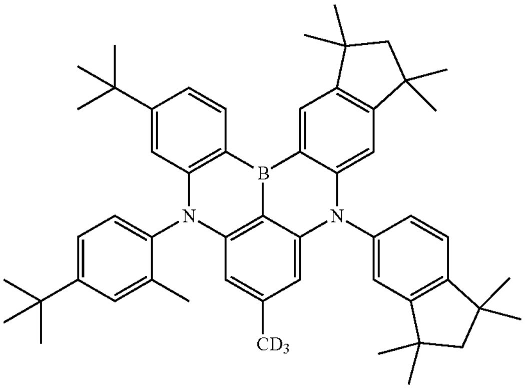
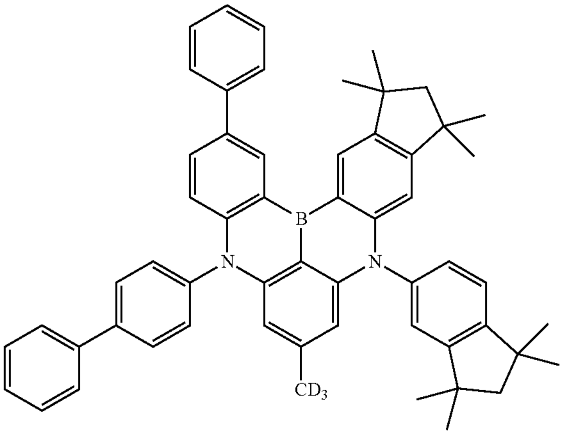
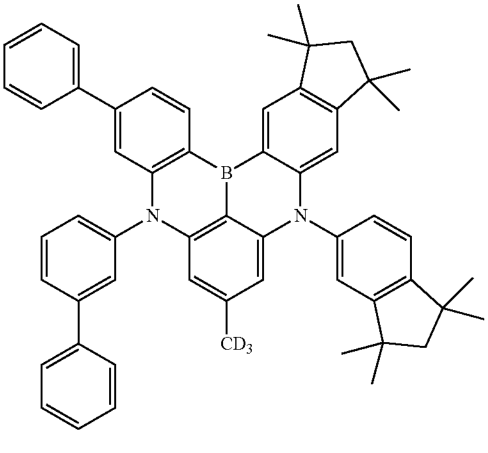
-continued
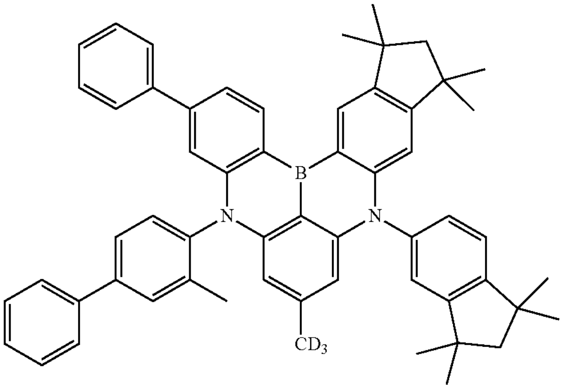
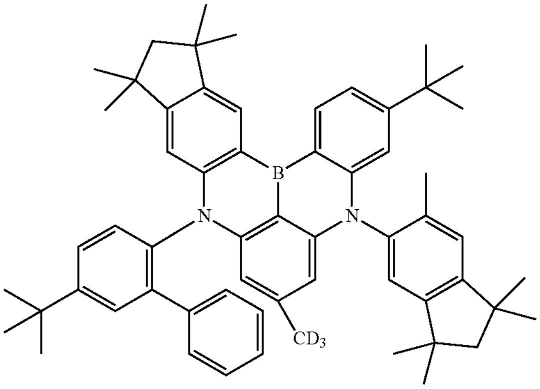
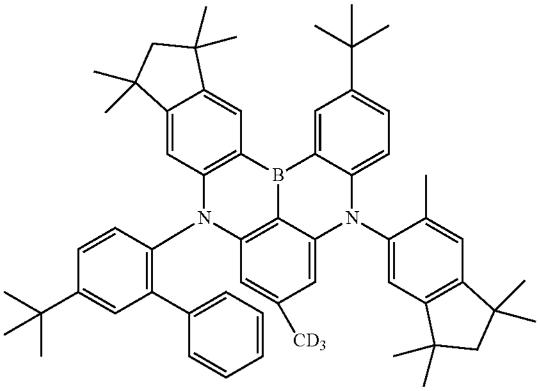
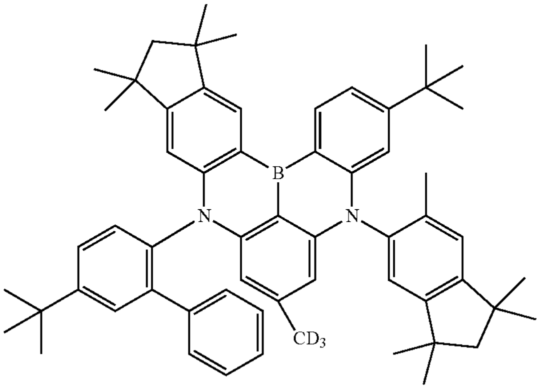

-continued
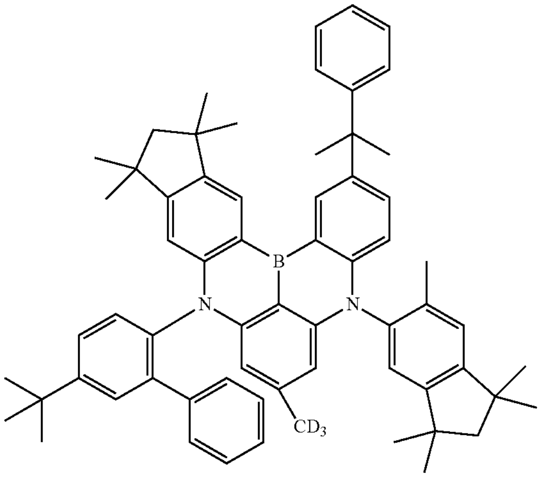
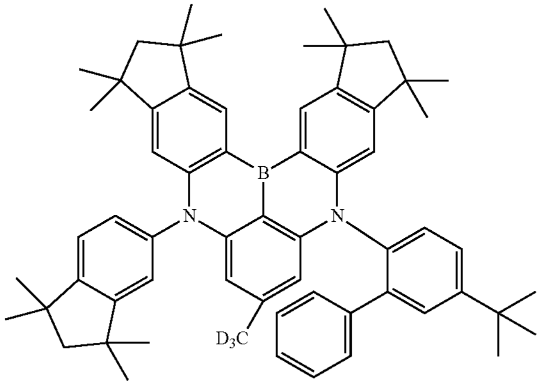
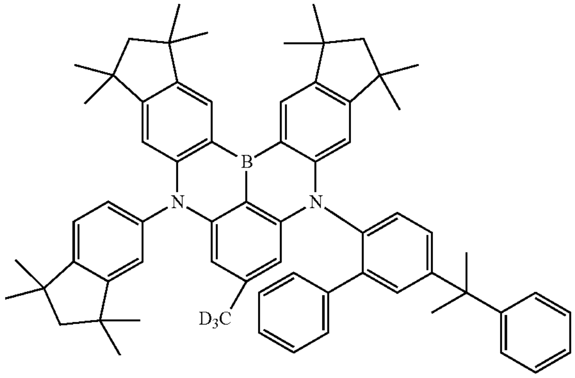
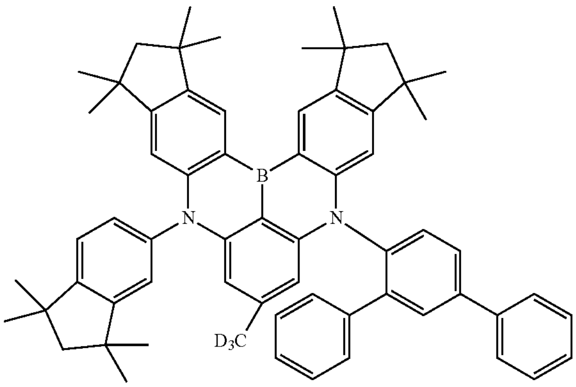
-continued
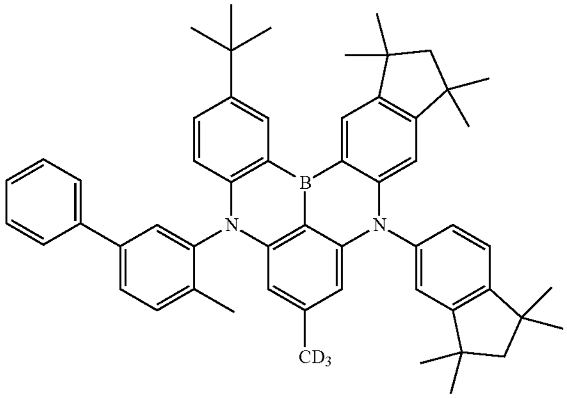
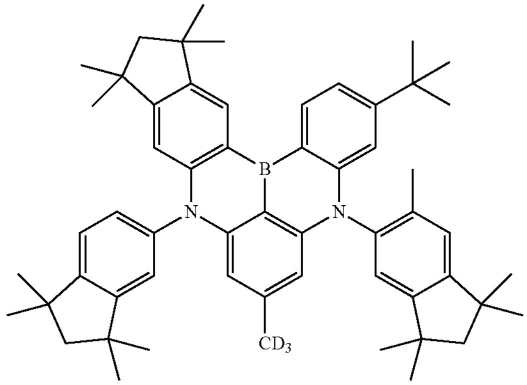
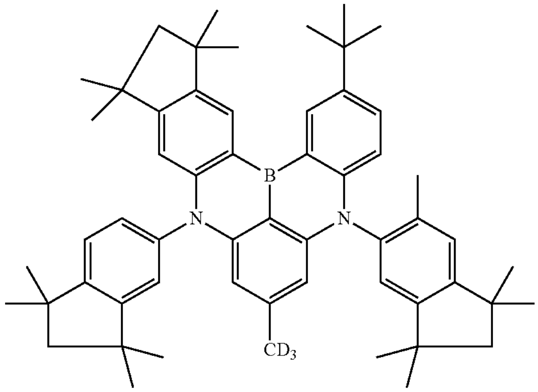
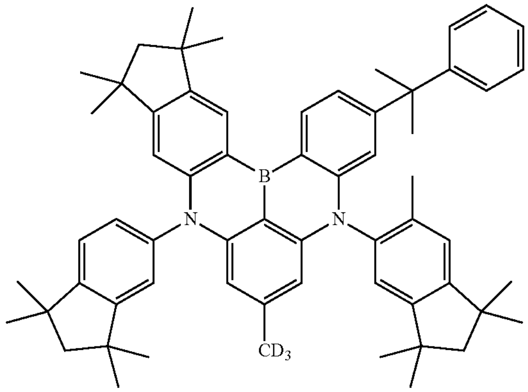

-continued
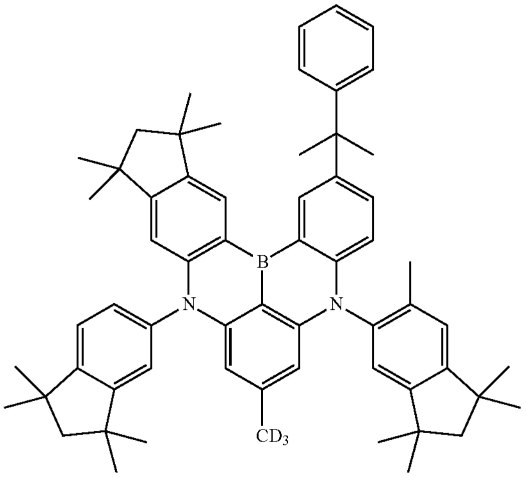
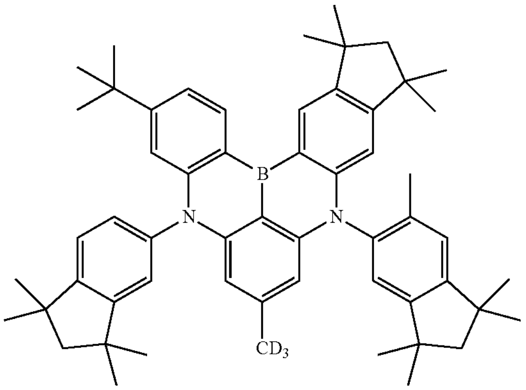
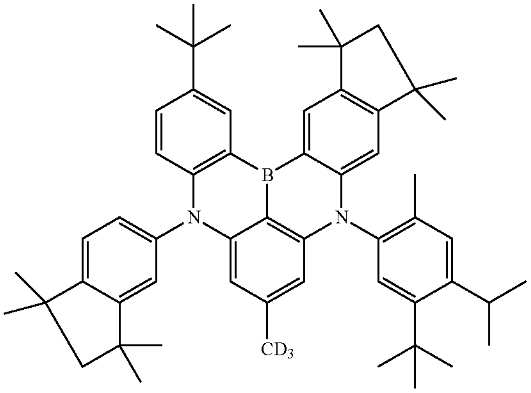
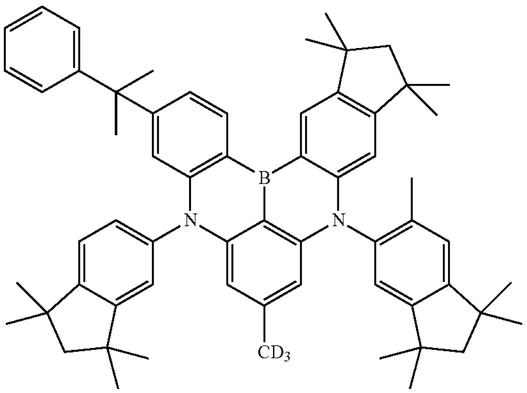
-continued
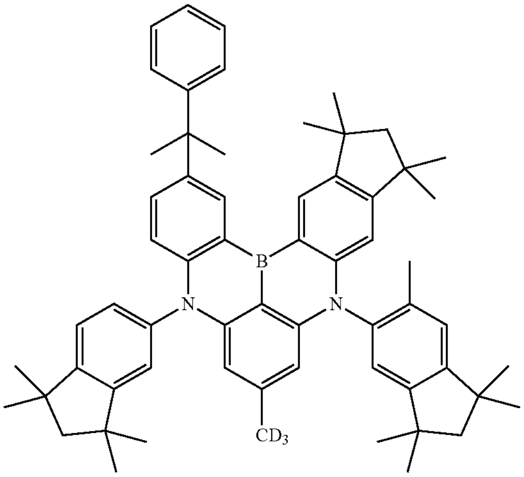
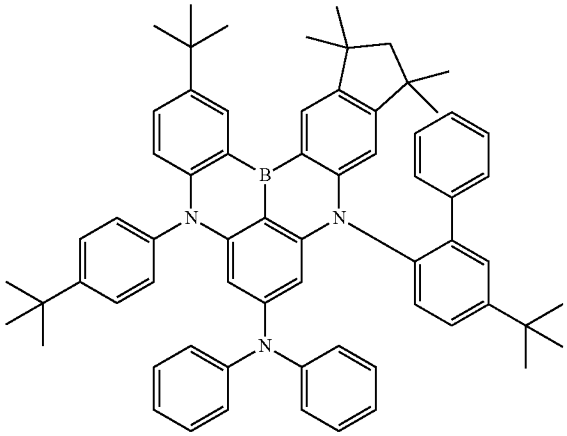
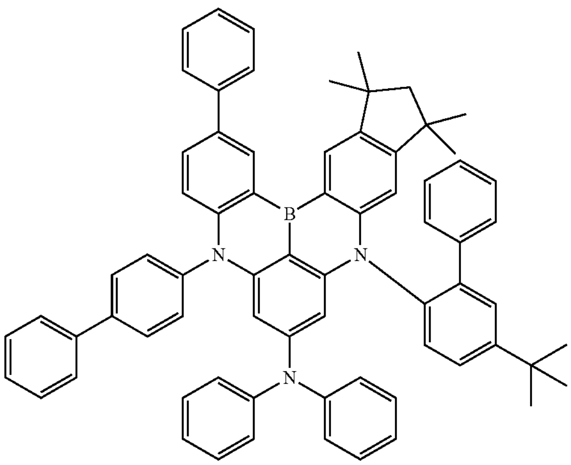

-continued
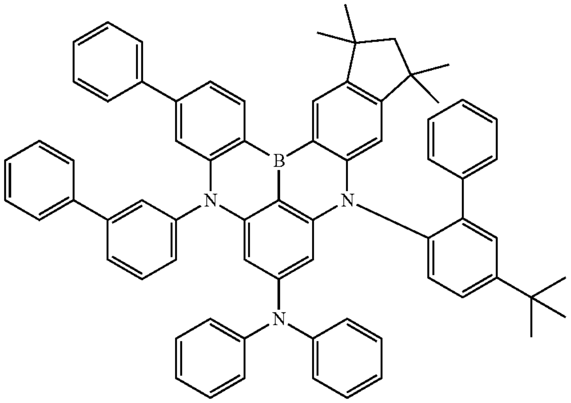
-continued
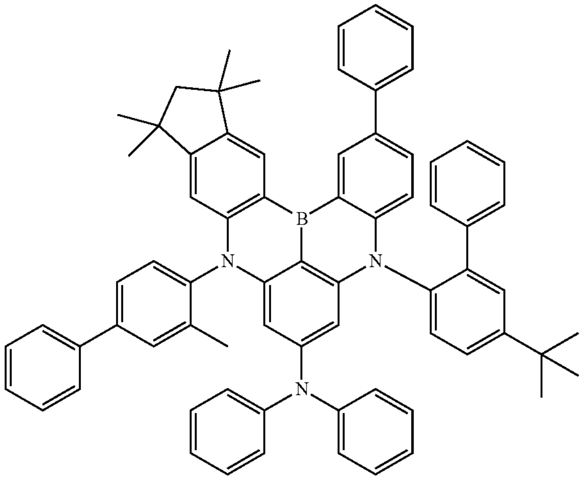
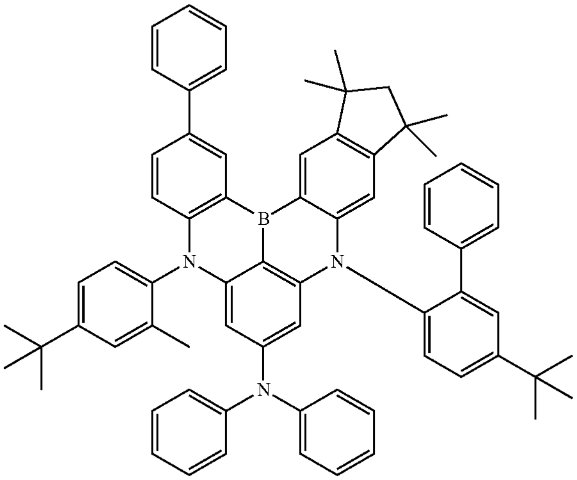
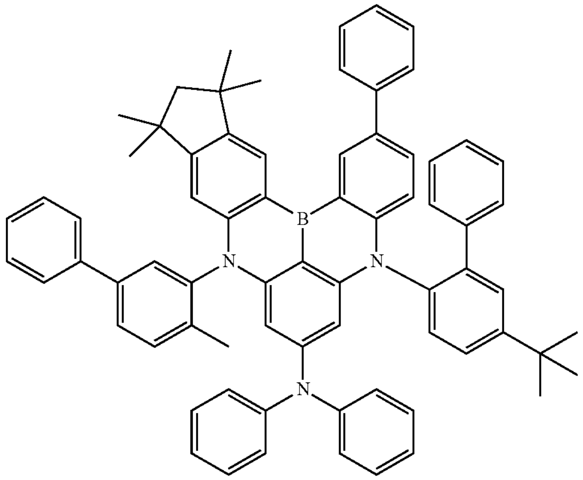
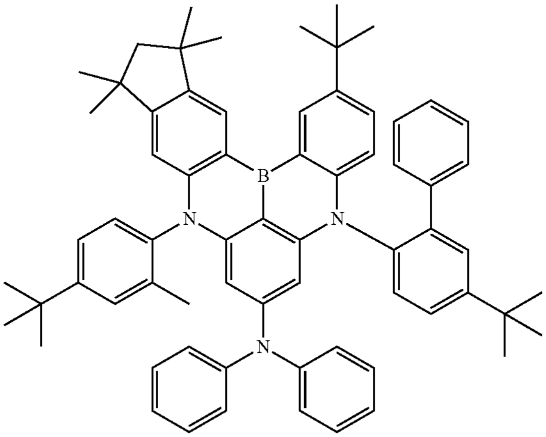
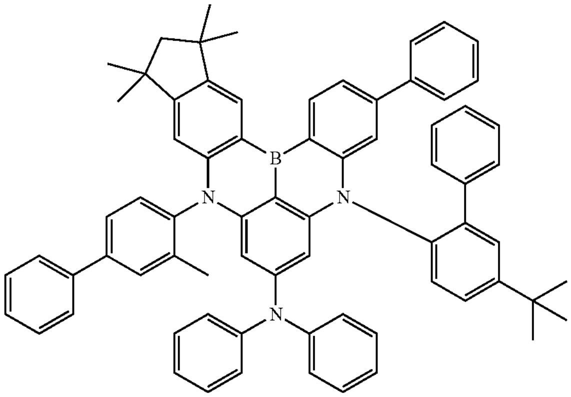

-continued
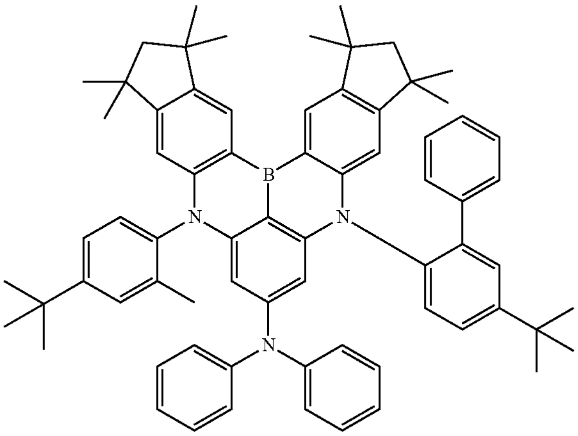
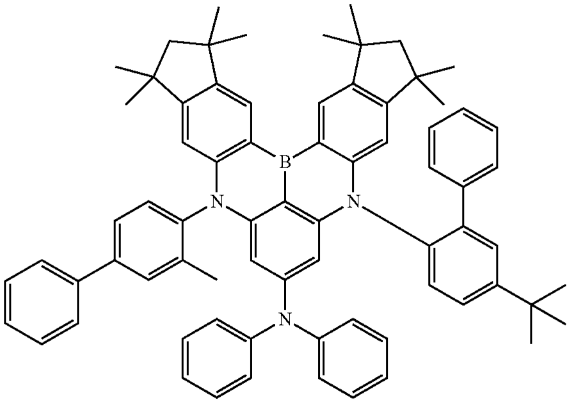
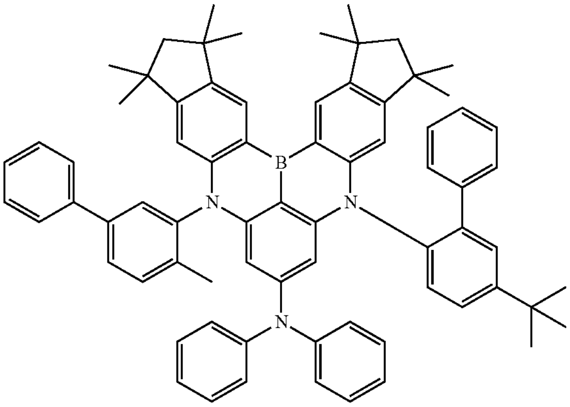
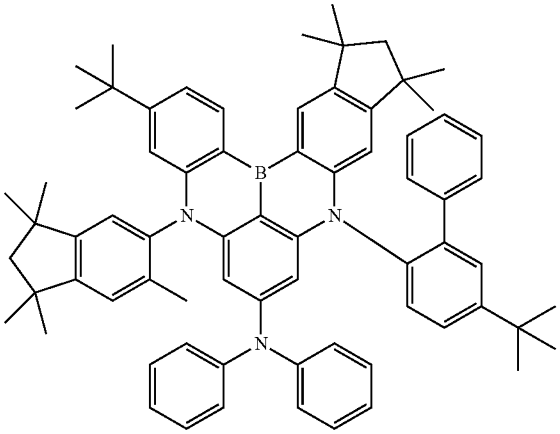
-continued
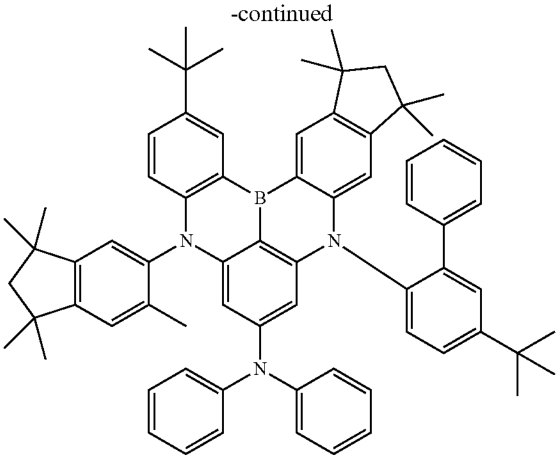
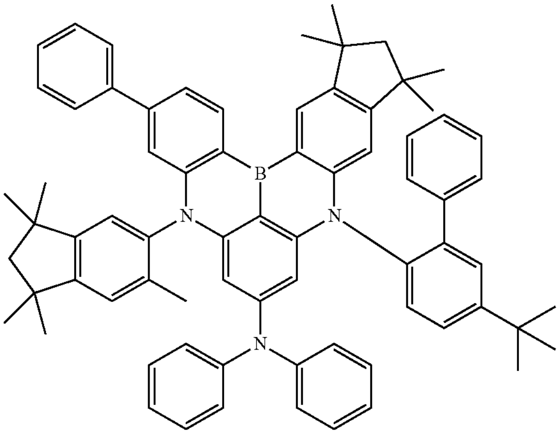
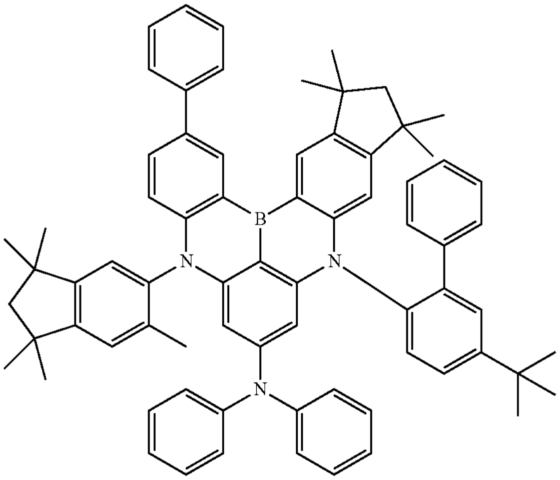

-continued
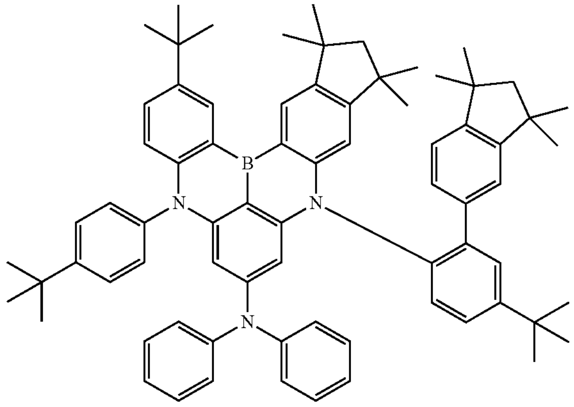
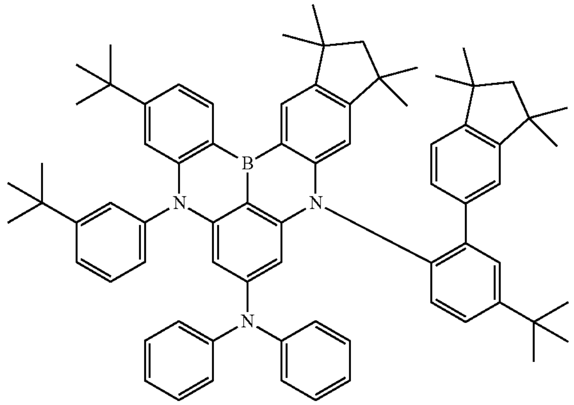
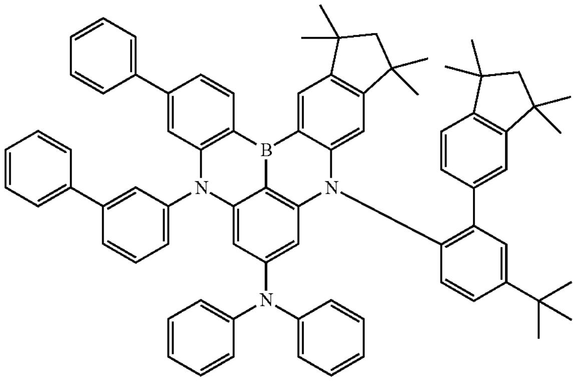
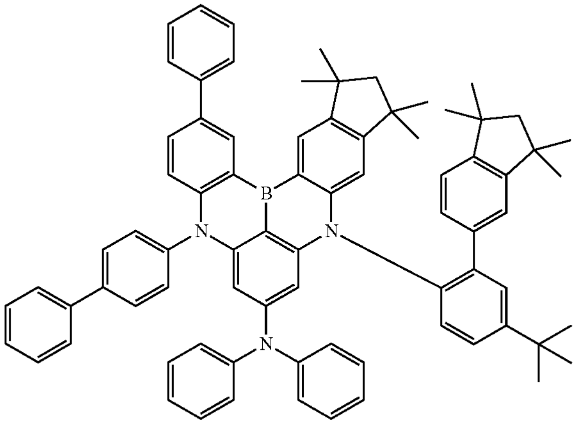
-continued
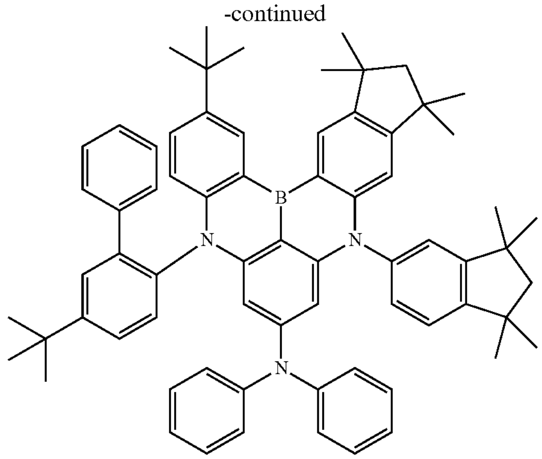
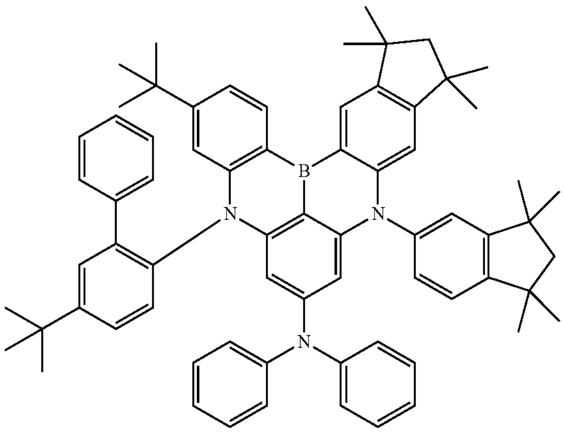
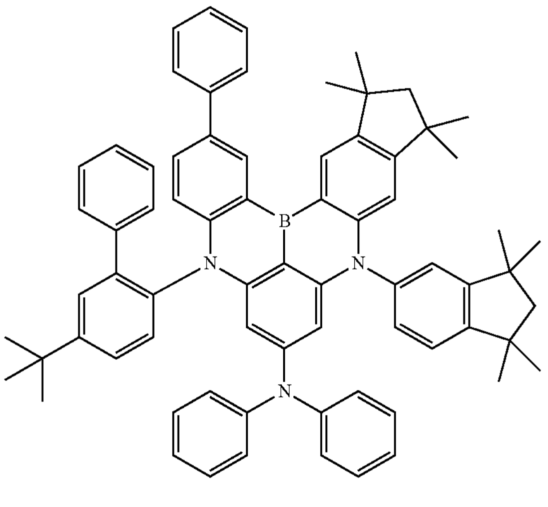

-continued
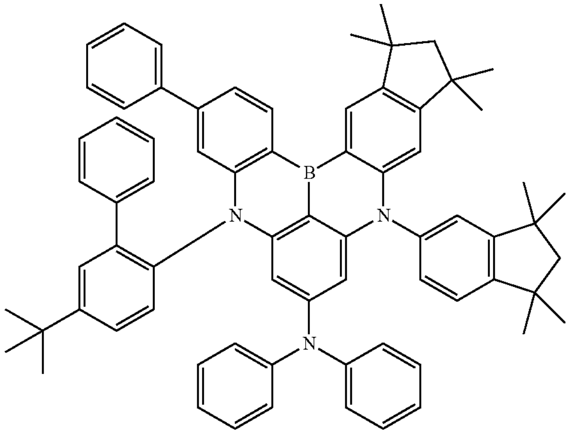
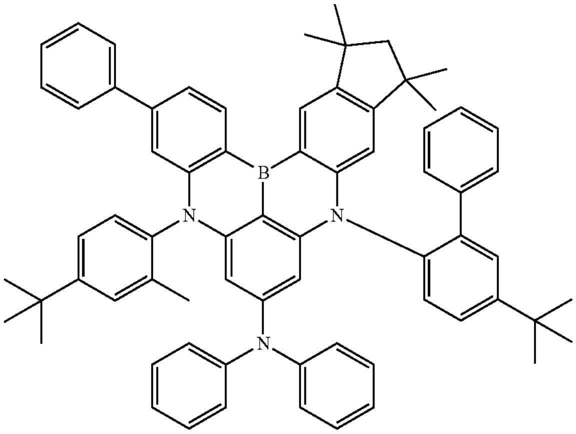
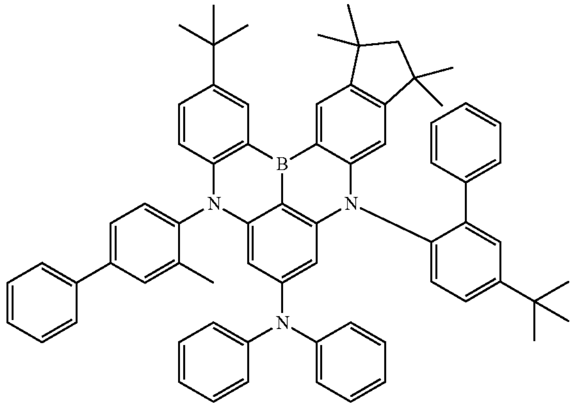
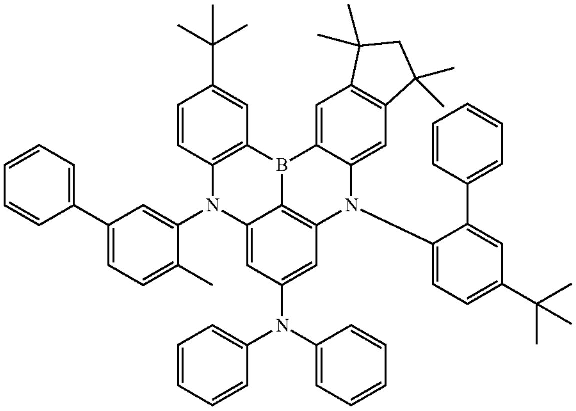
-continued
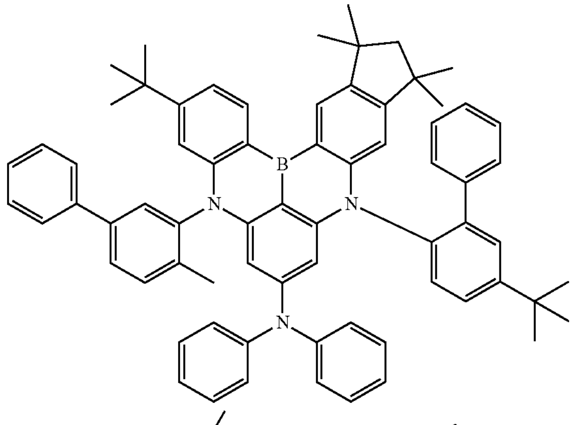
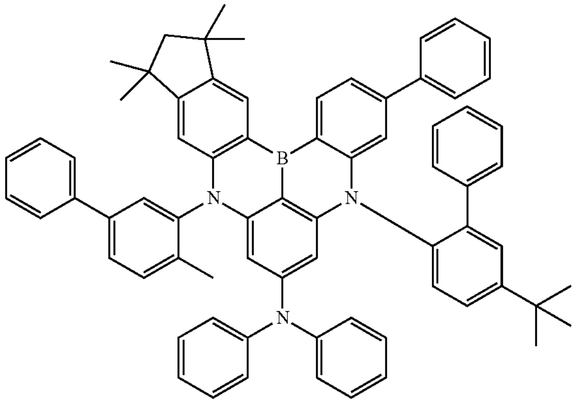
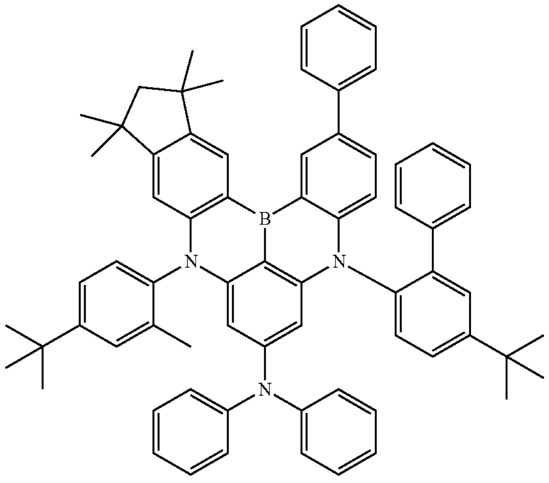
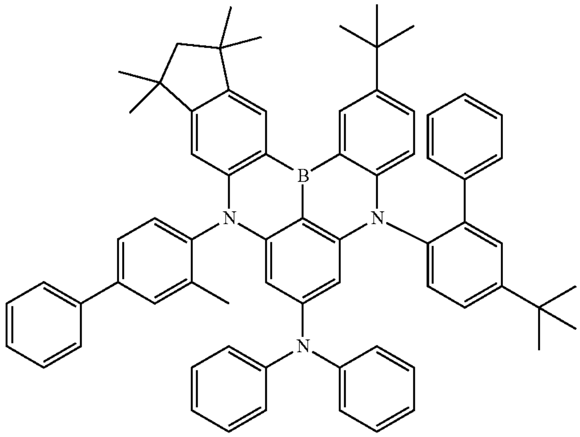

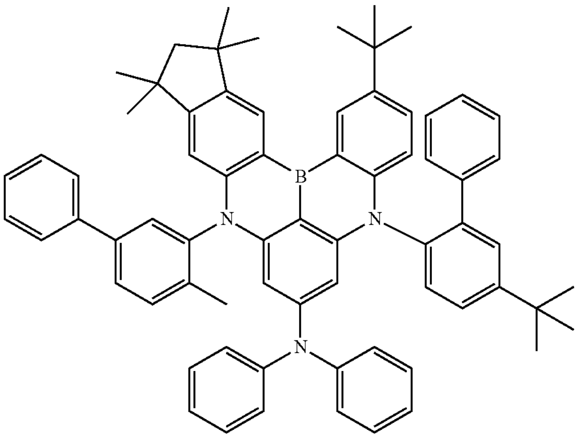
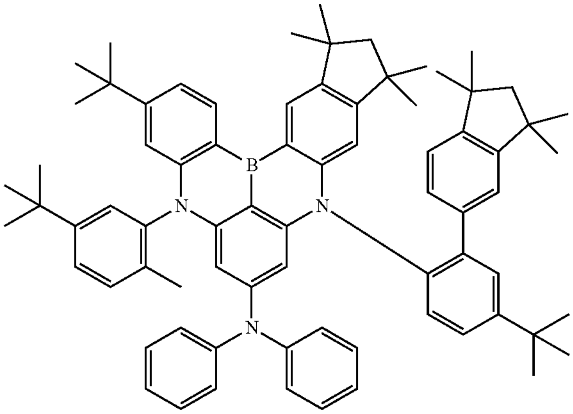
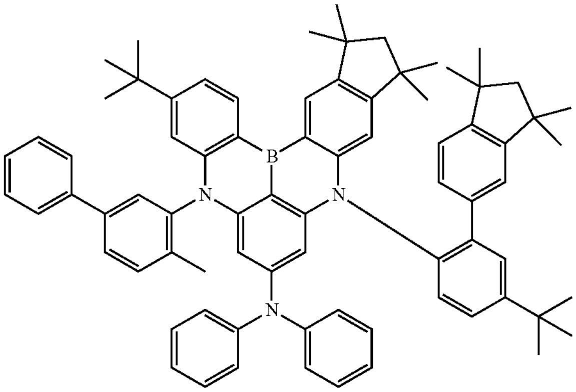
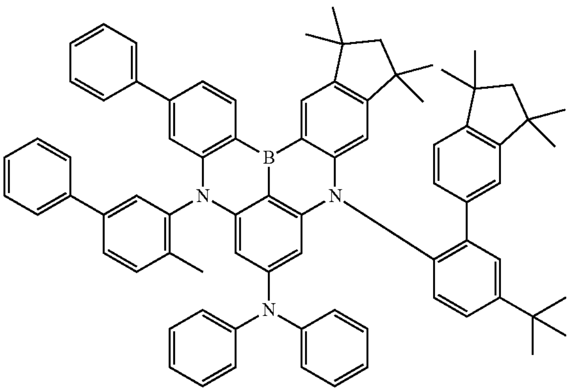
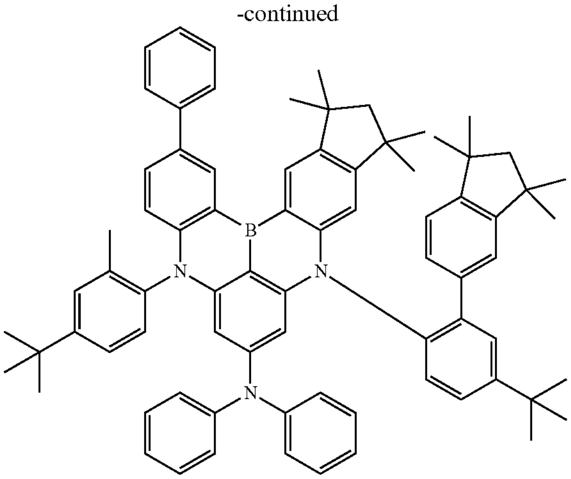
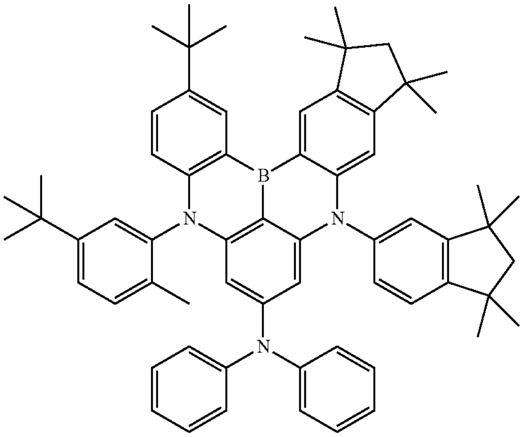
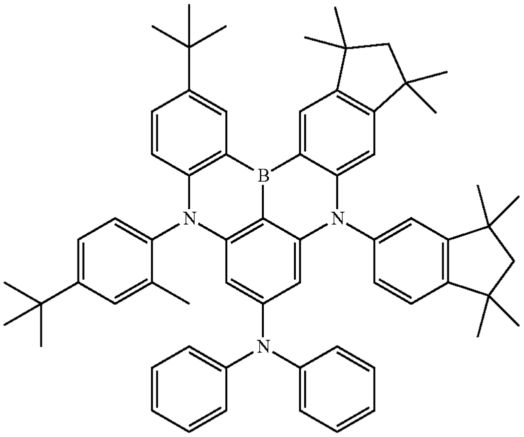

-continued
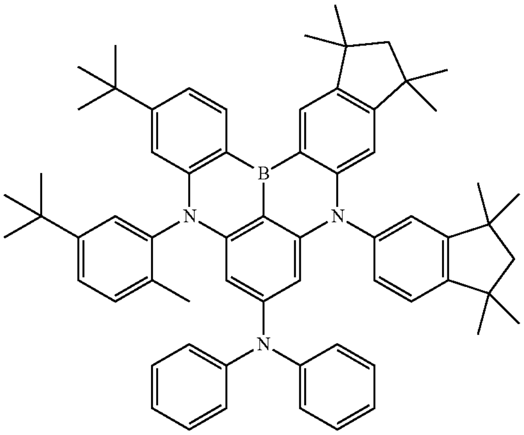
-continued
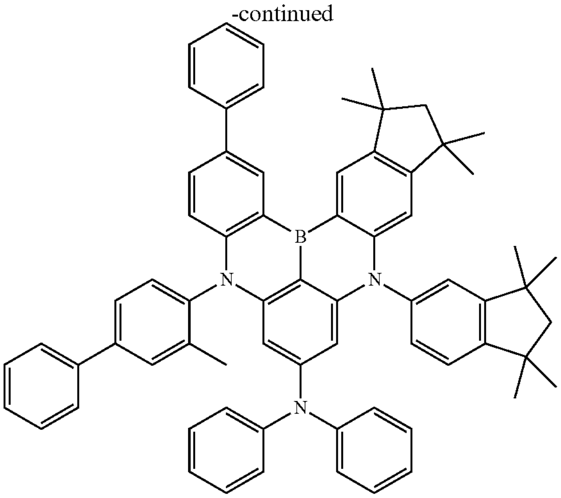
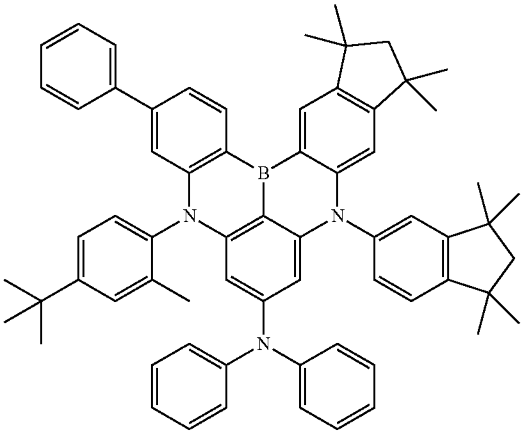
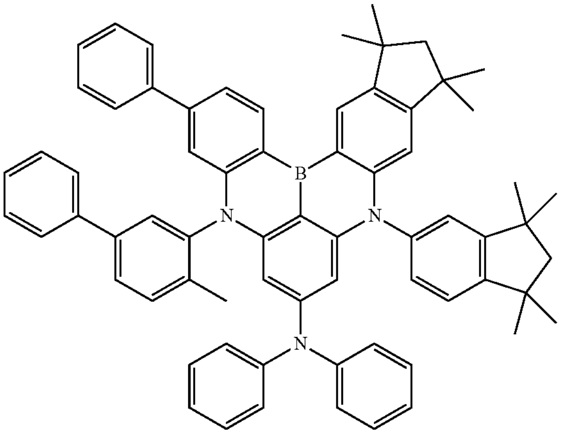
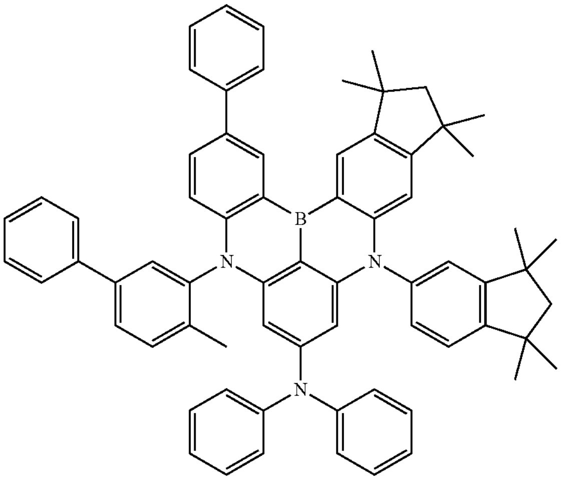
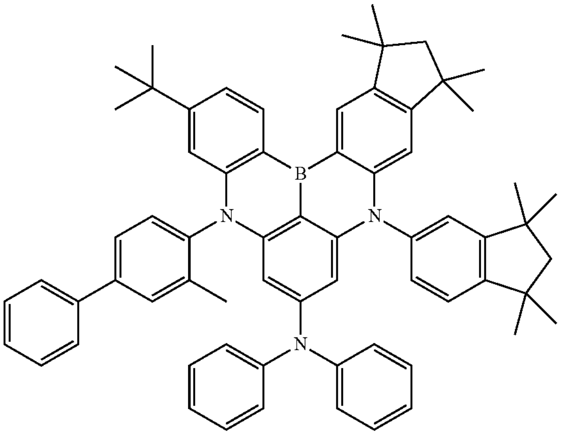

-continued
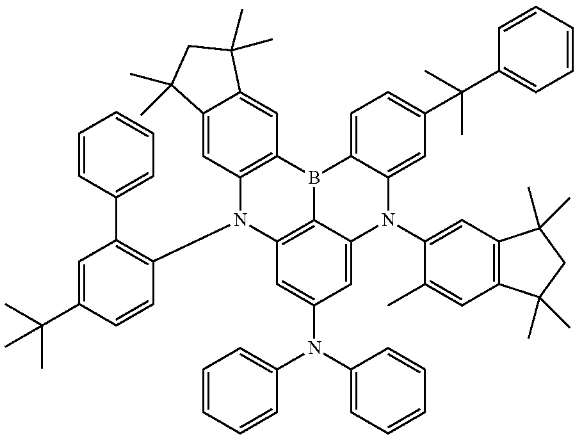
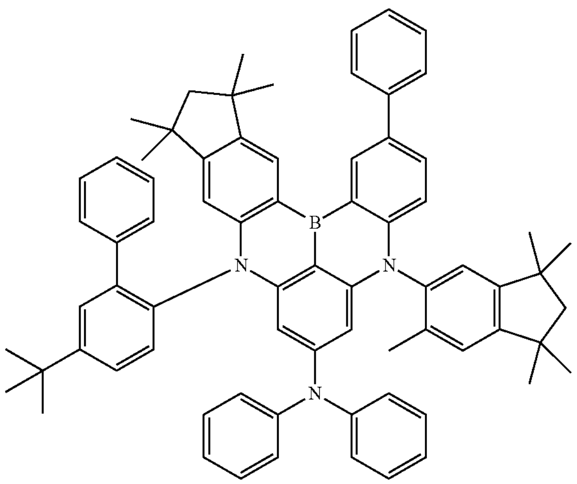
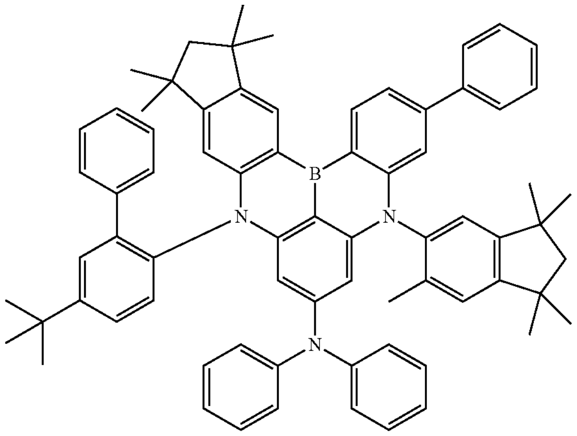
-continued
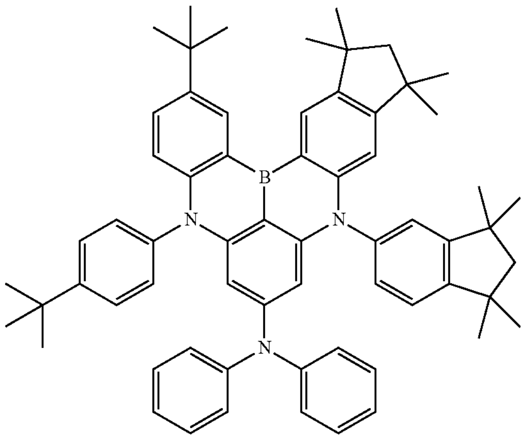
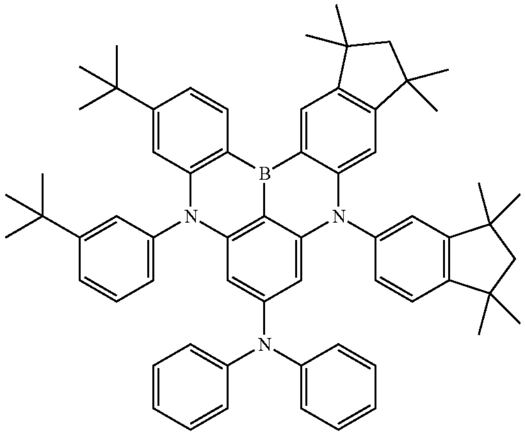
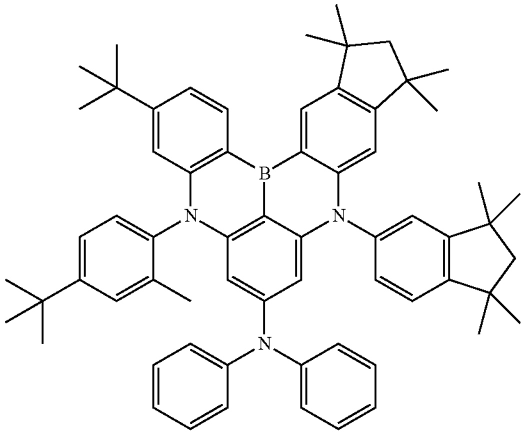

-continued
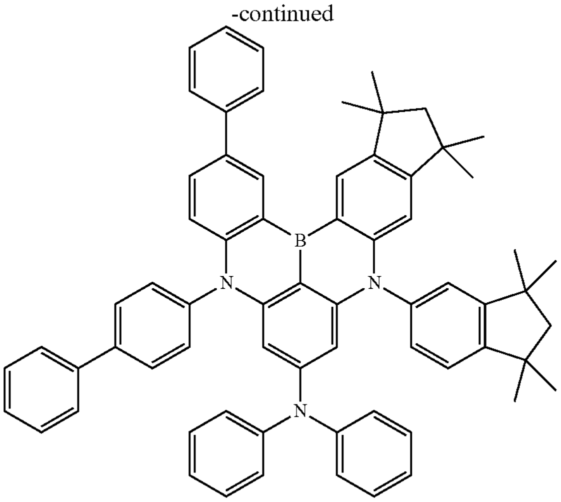
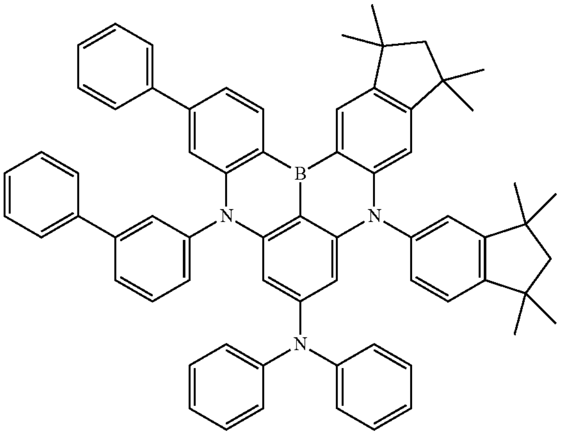
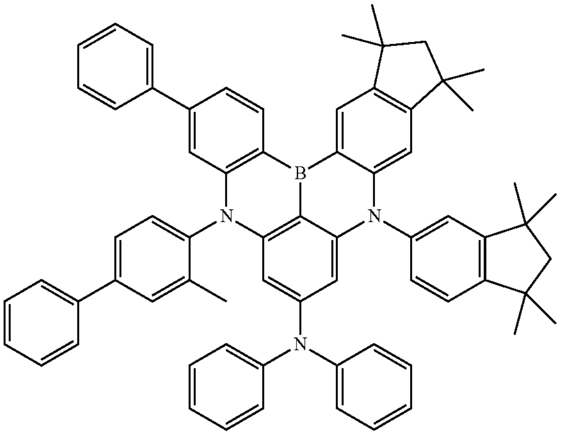
-continued
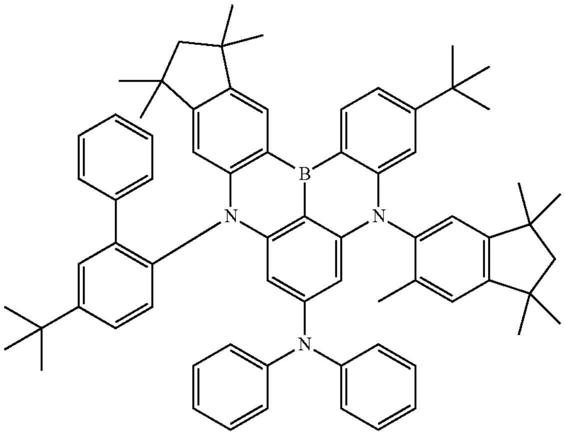
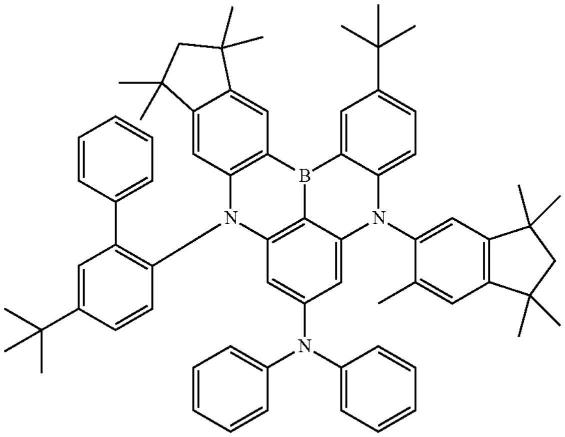
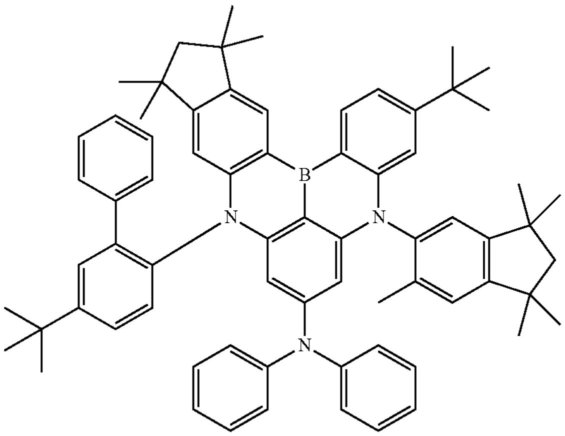

-continued
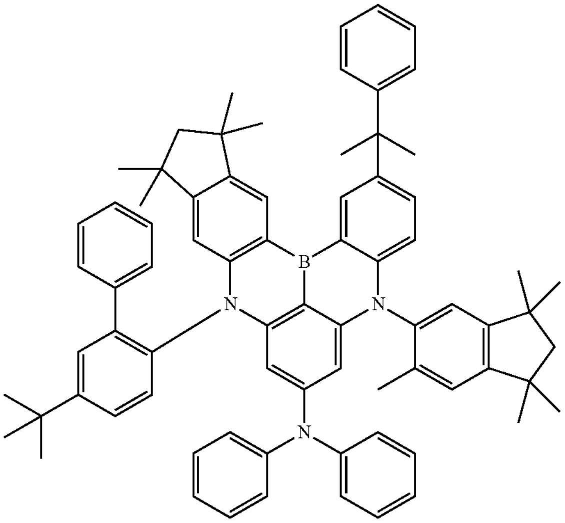
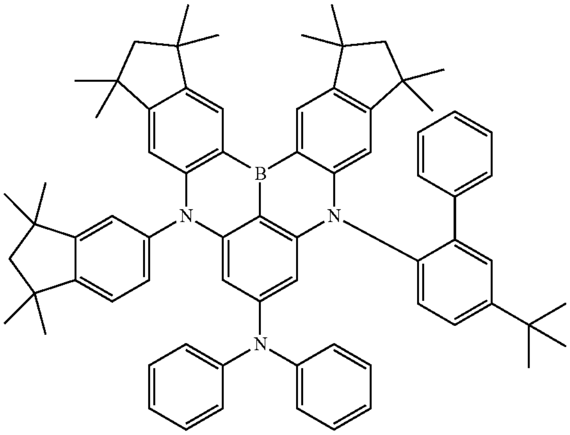
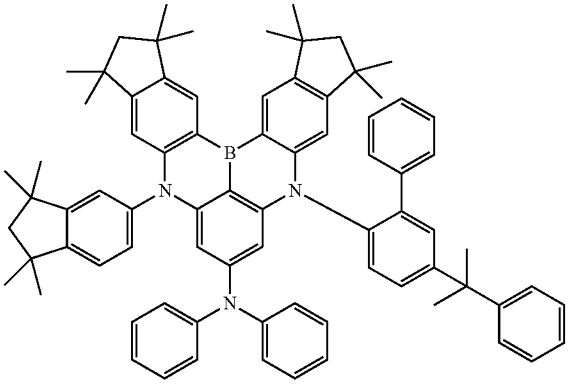
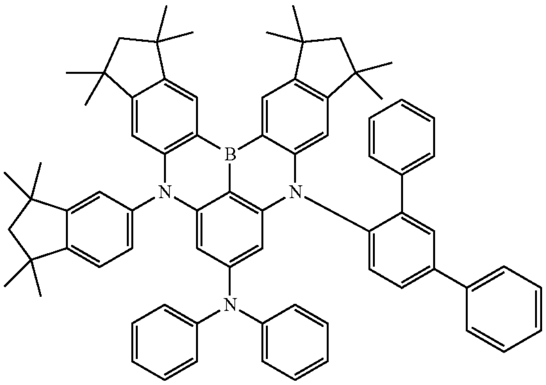
-continued
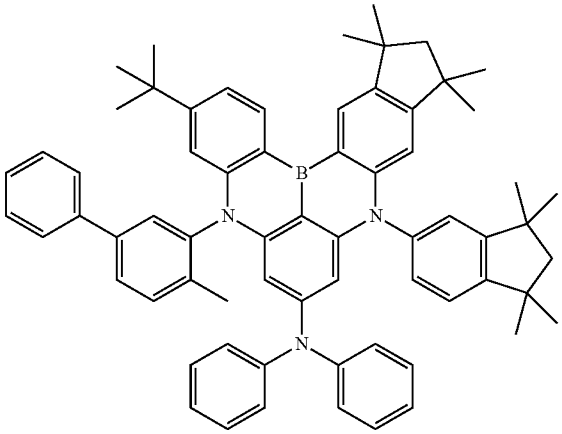
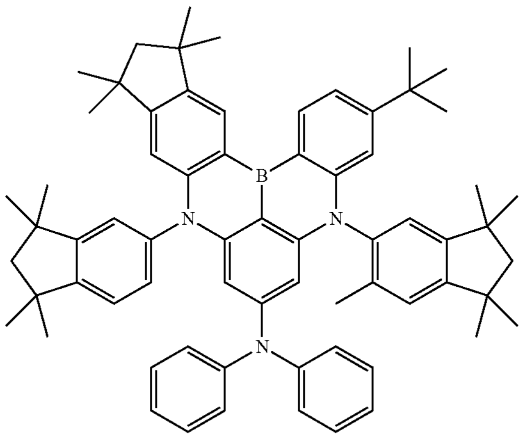
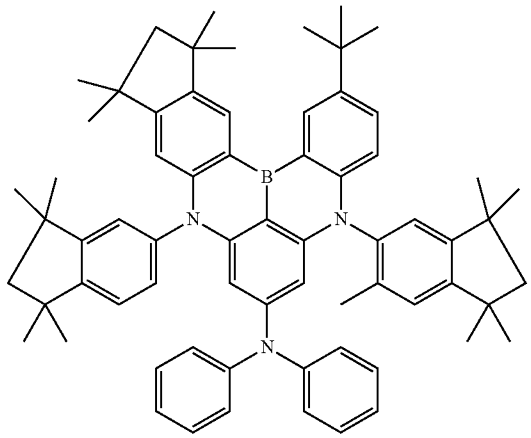

-continued
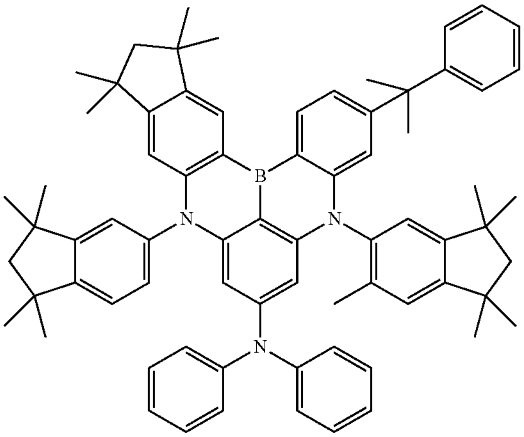
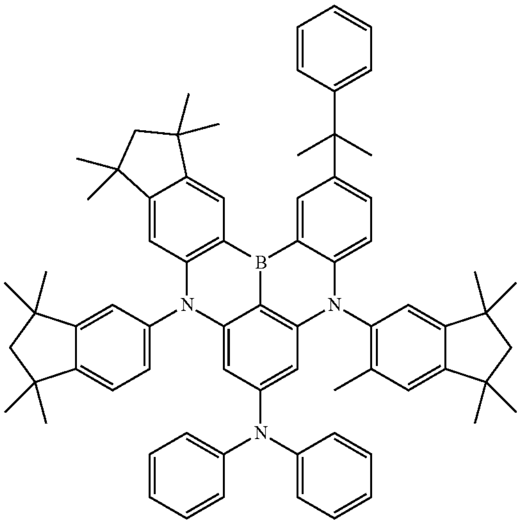
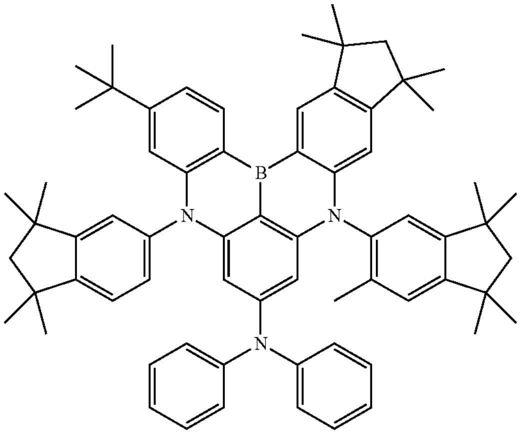
-continued
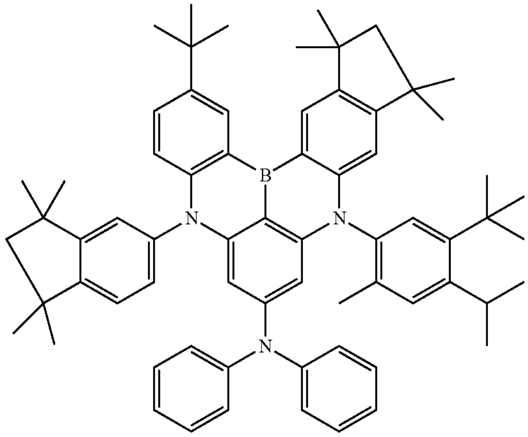
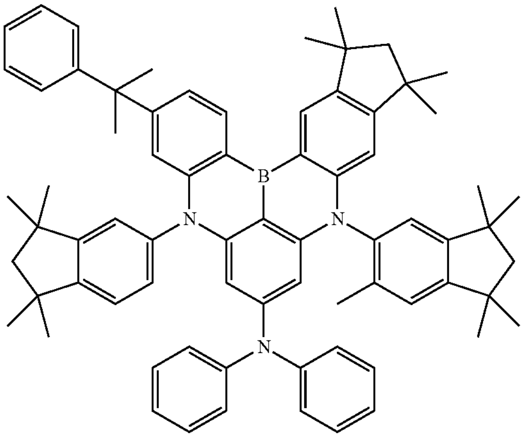
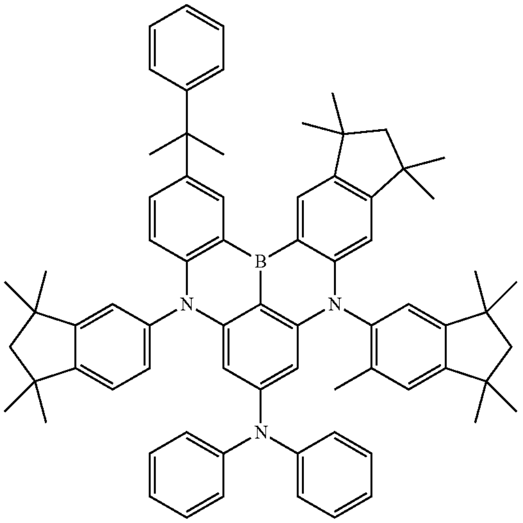

-continued
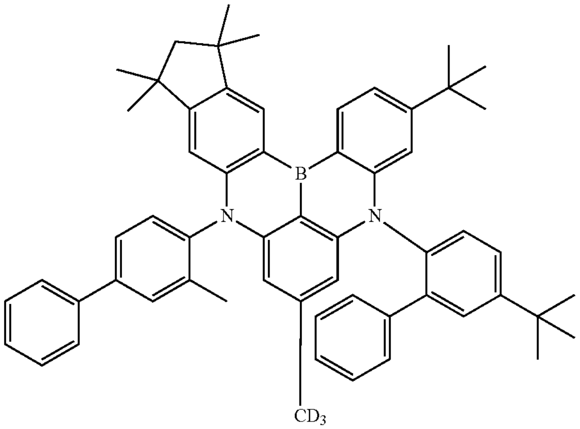
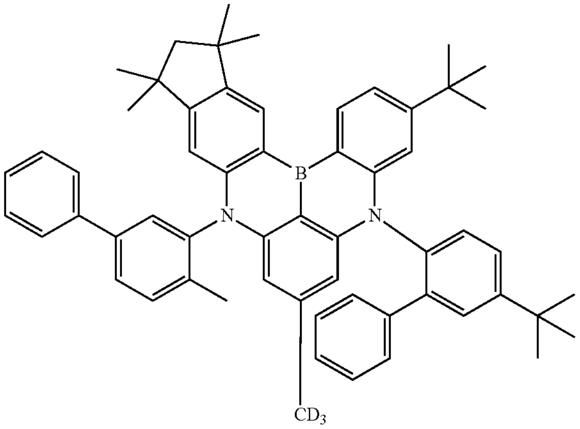
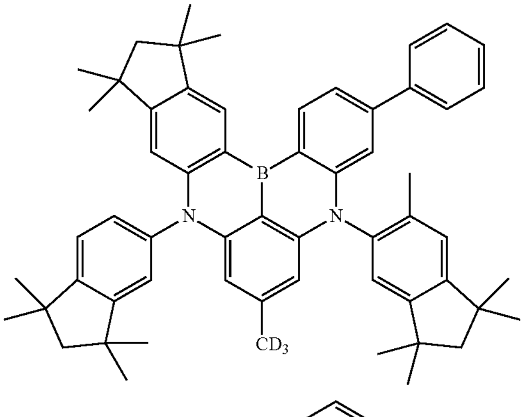
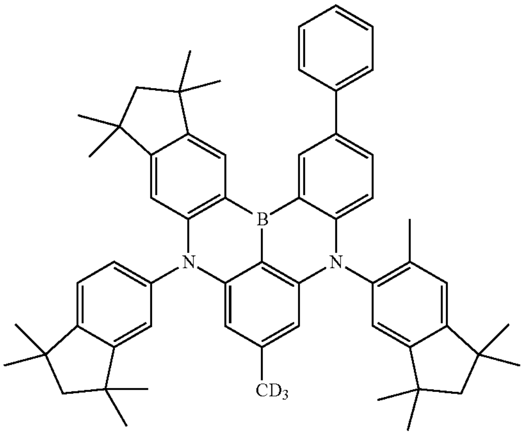
-continued
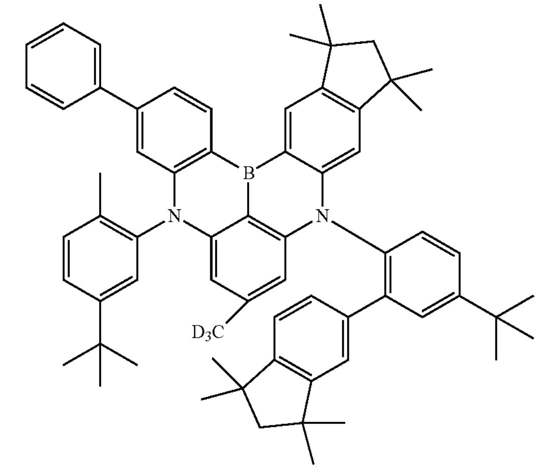
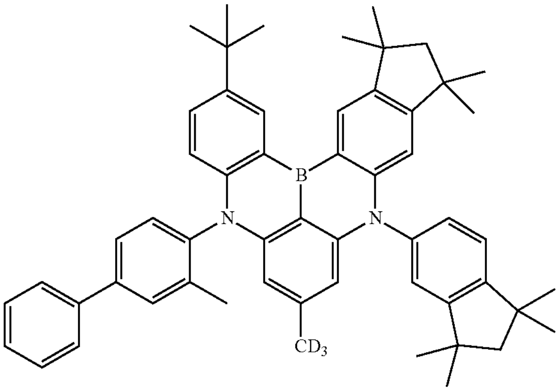
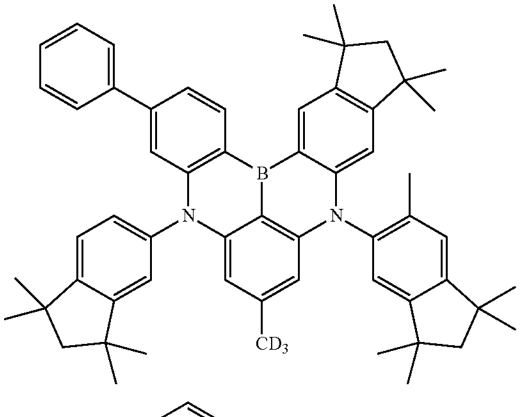
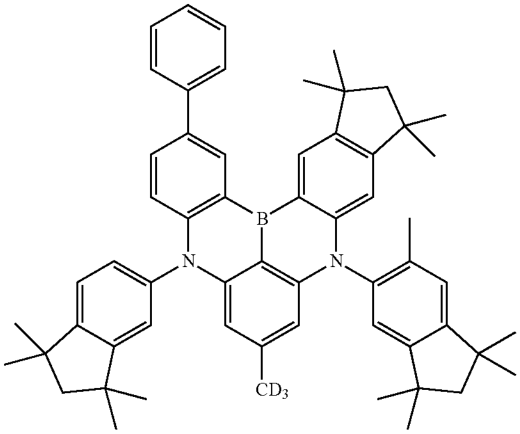

-continued
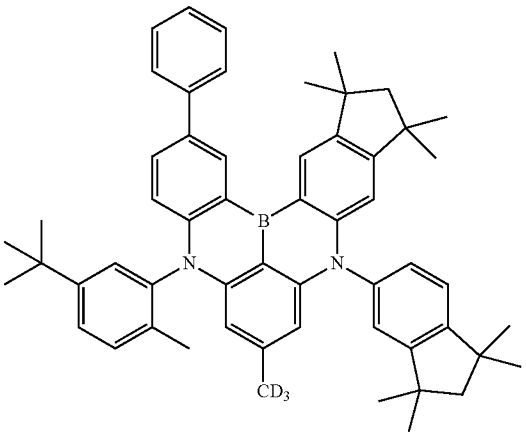
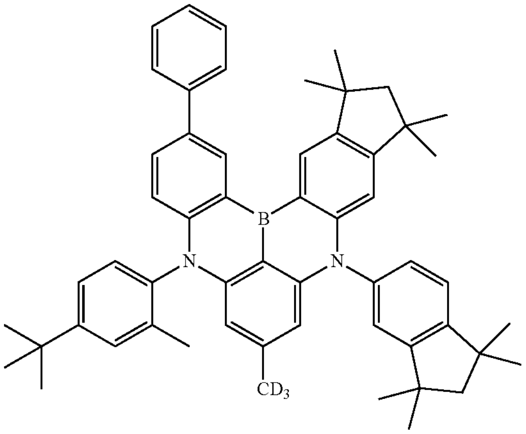
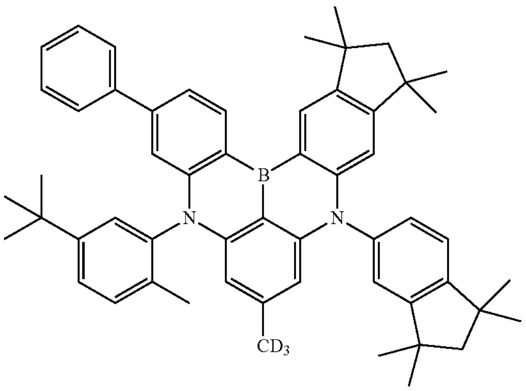
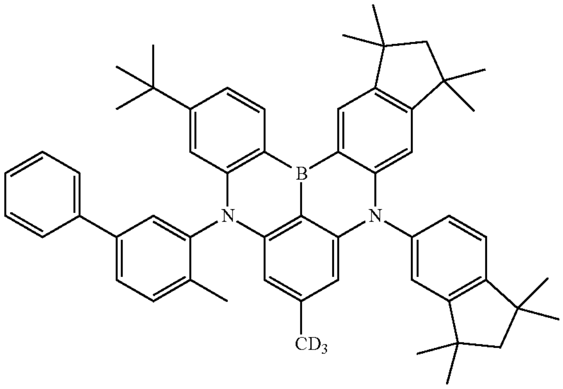
-continued
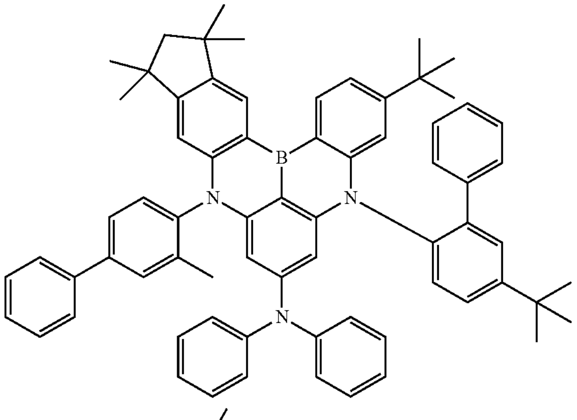
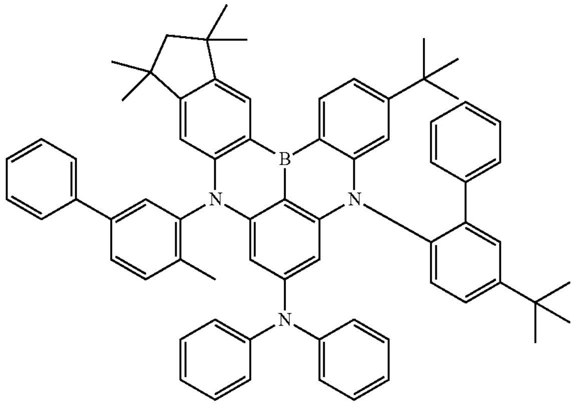
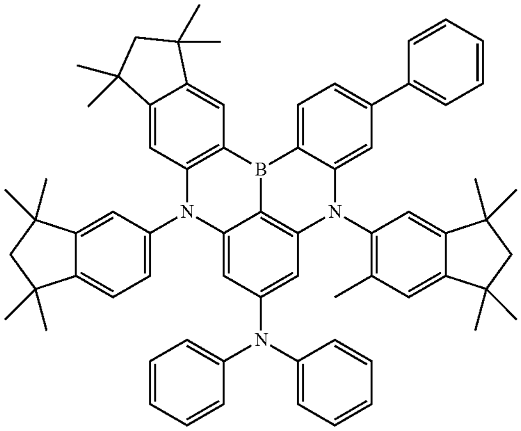
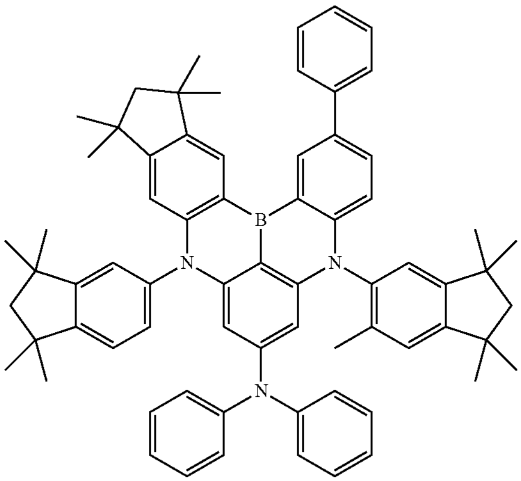

-continued
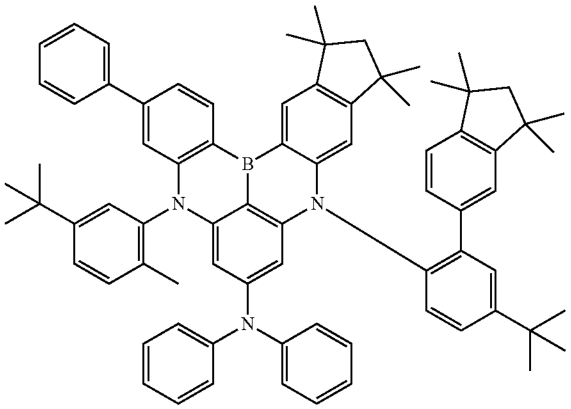
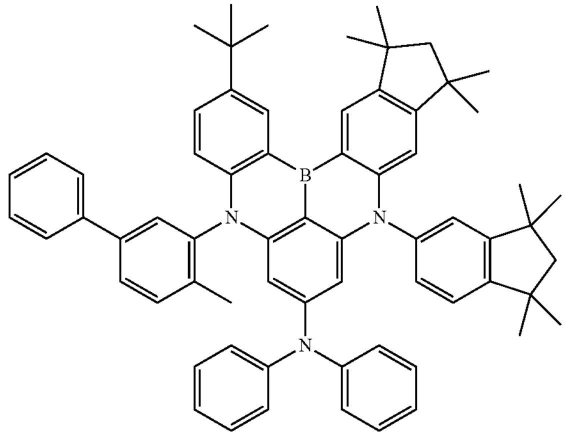
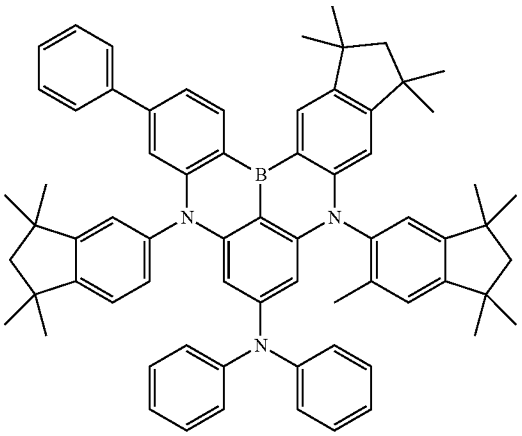
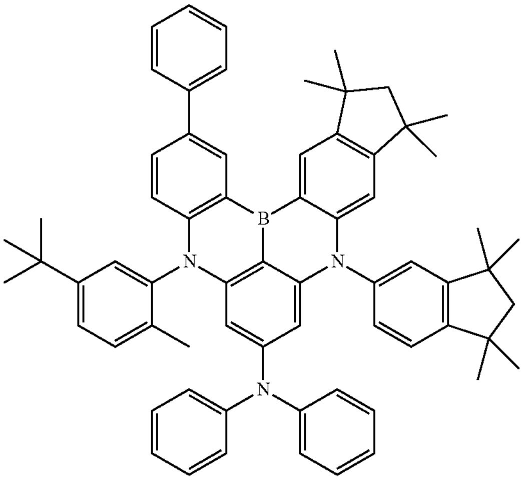
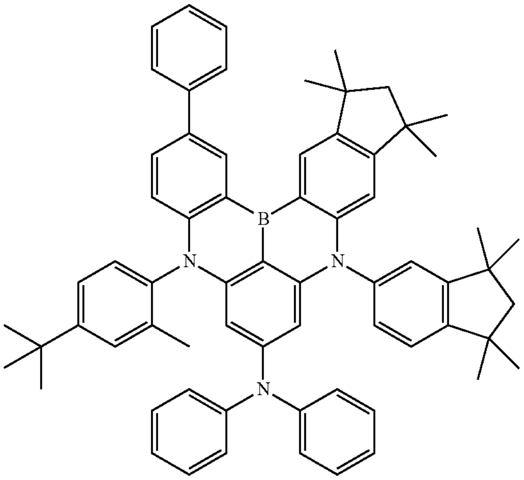
-continued
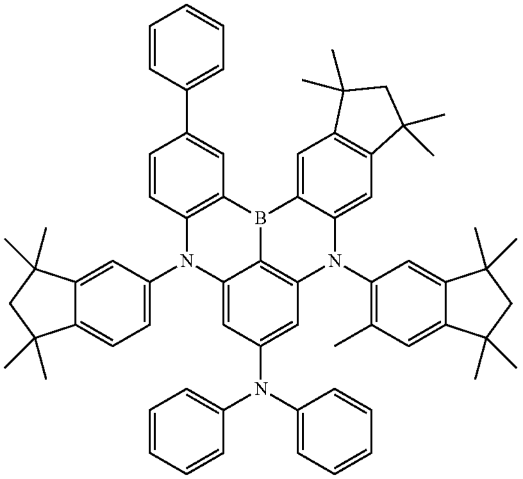

-continued
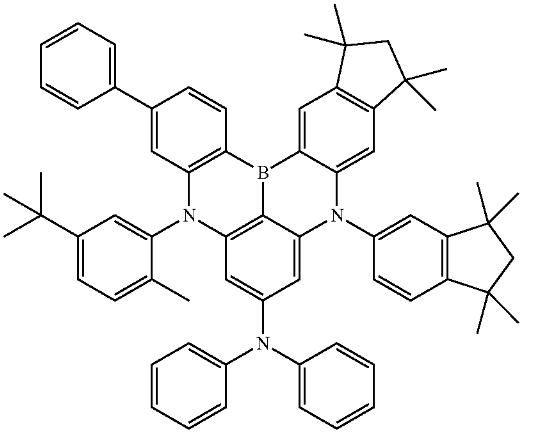
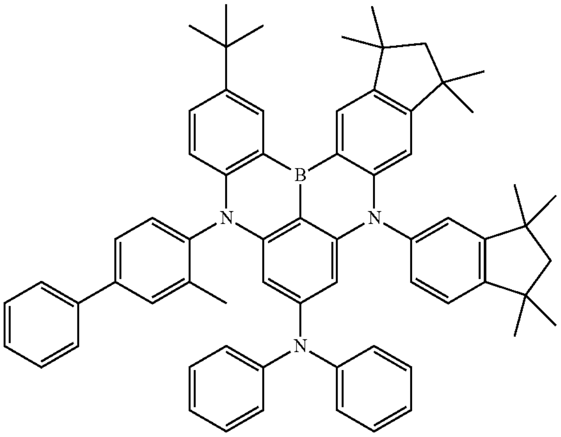
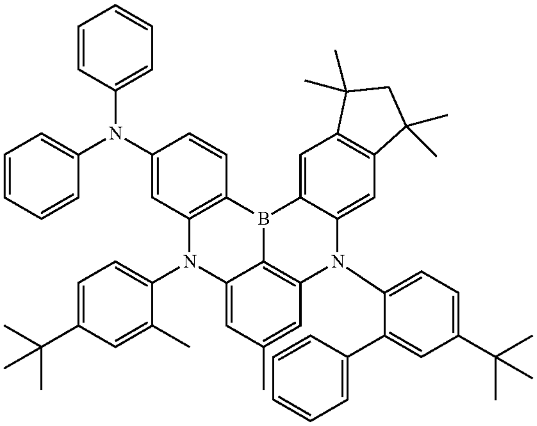
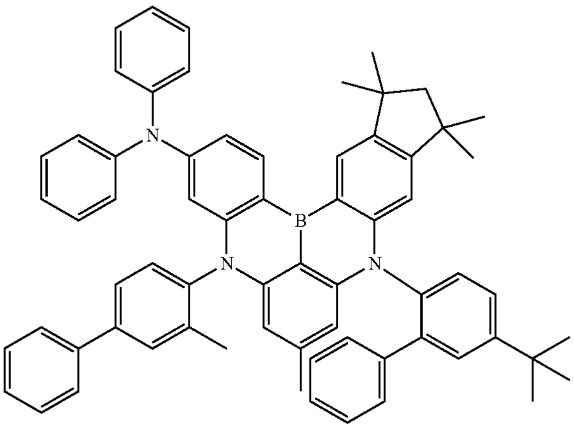
-continued
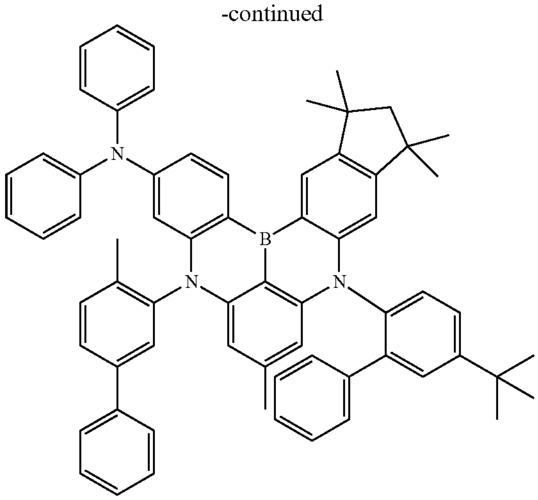
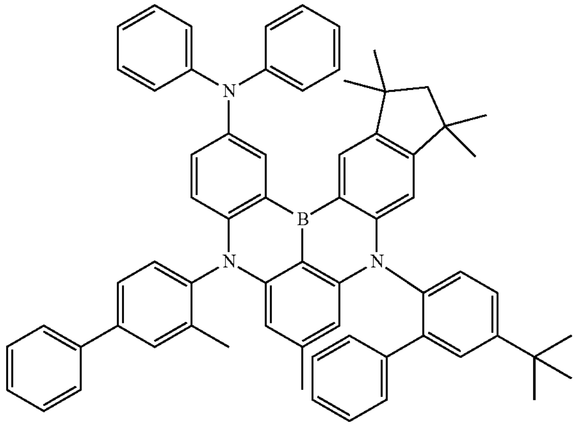
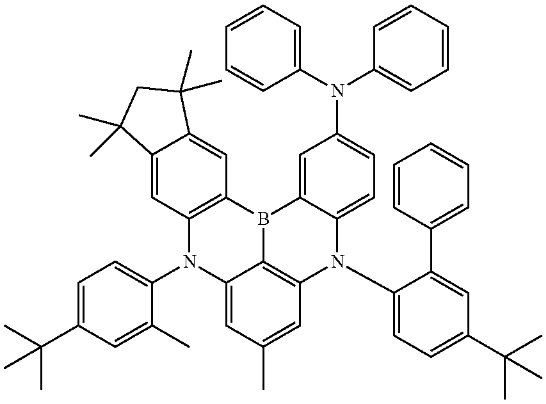
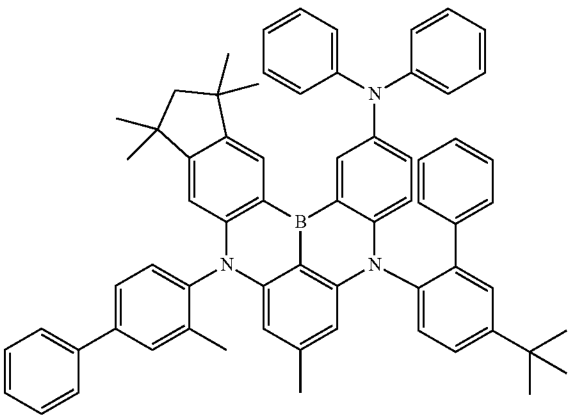

-continued
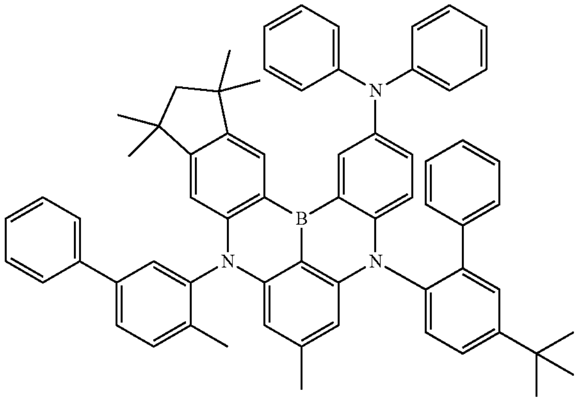
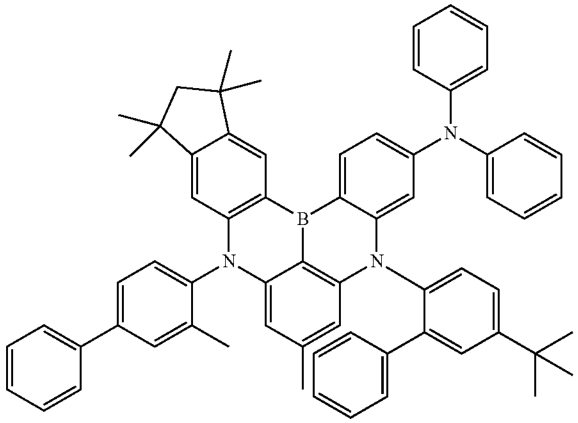
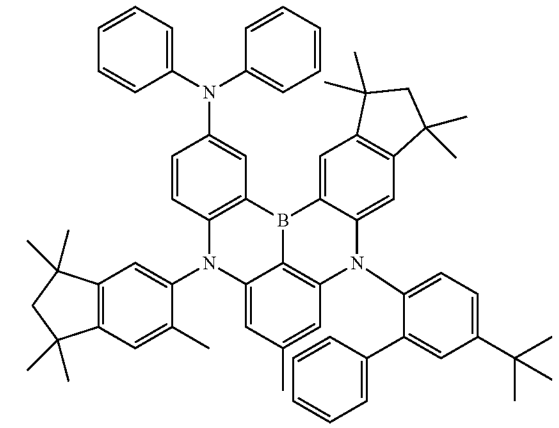
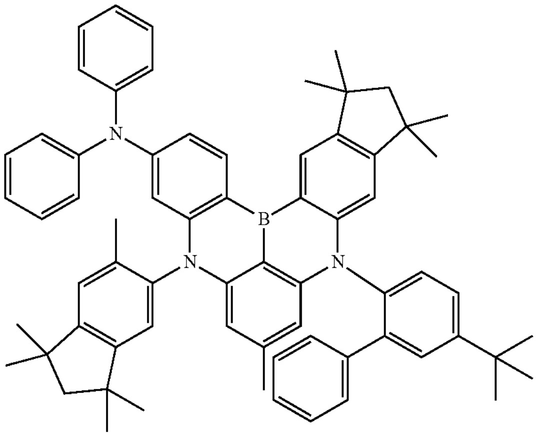
-continued
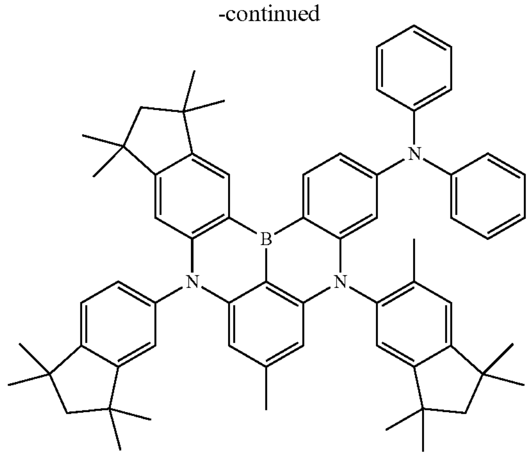
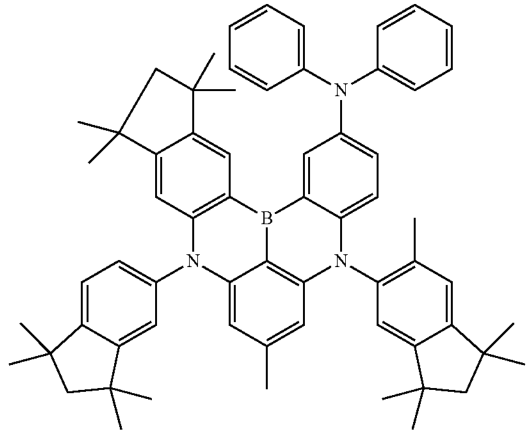
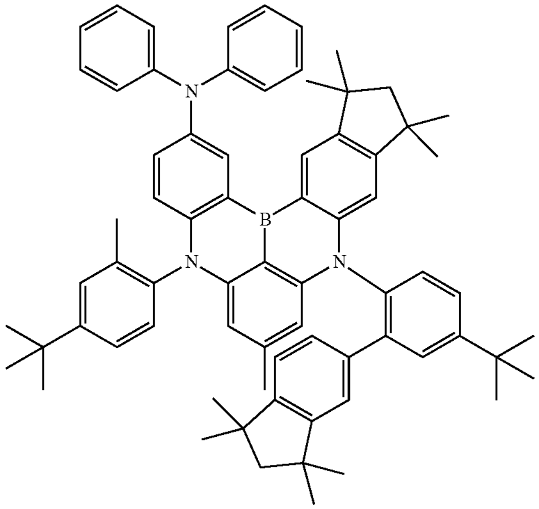

-continued
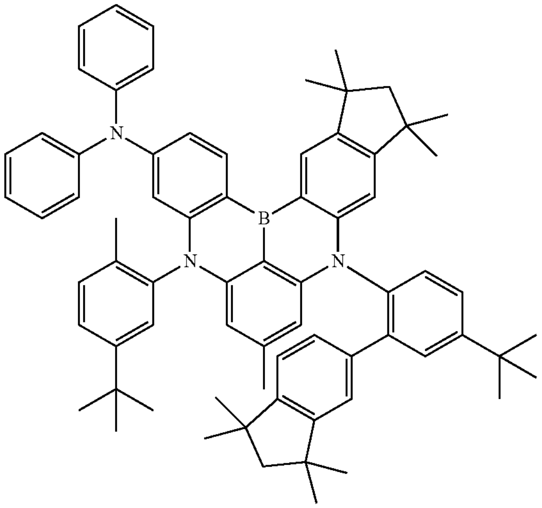
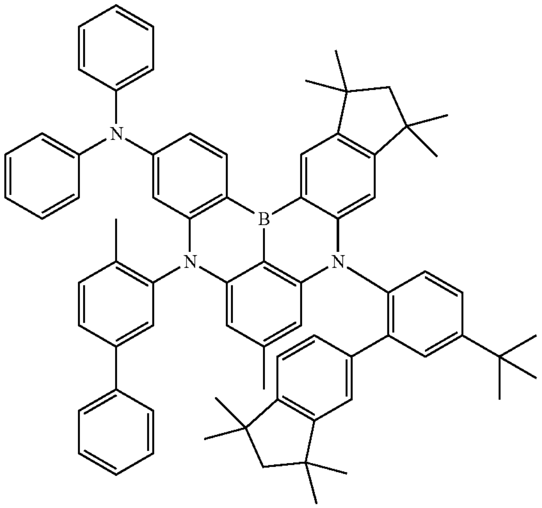
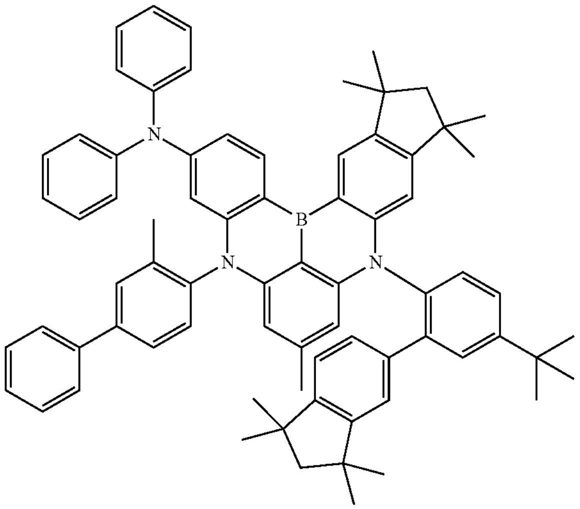
-continued
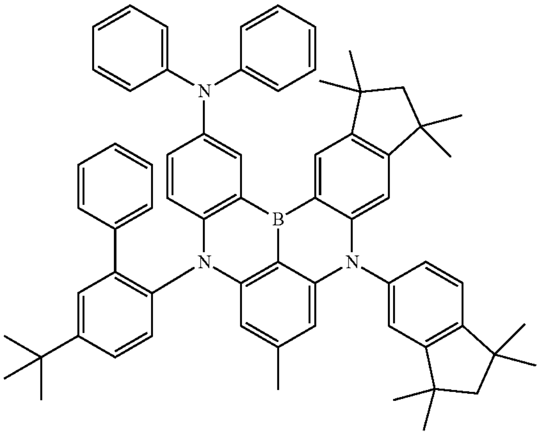
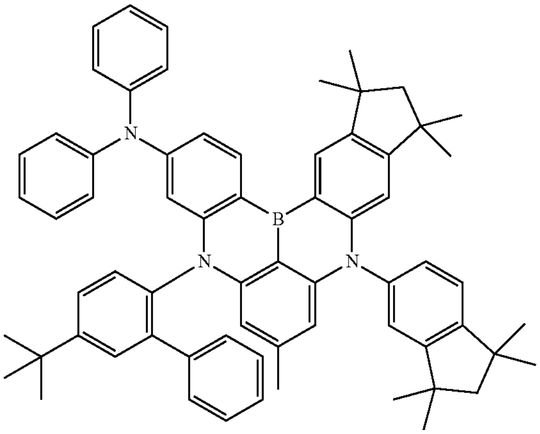
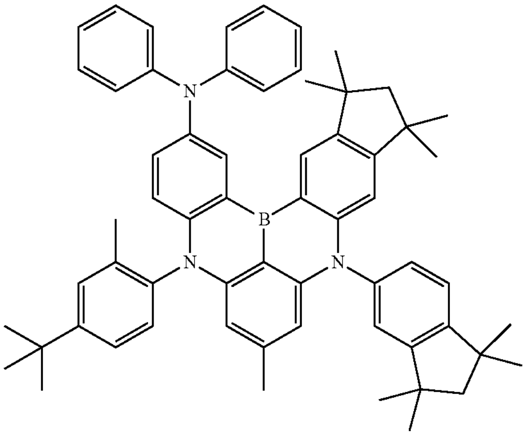

-continued
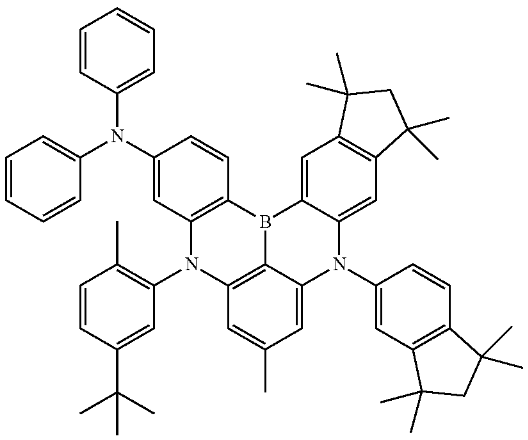
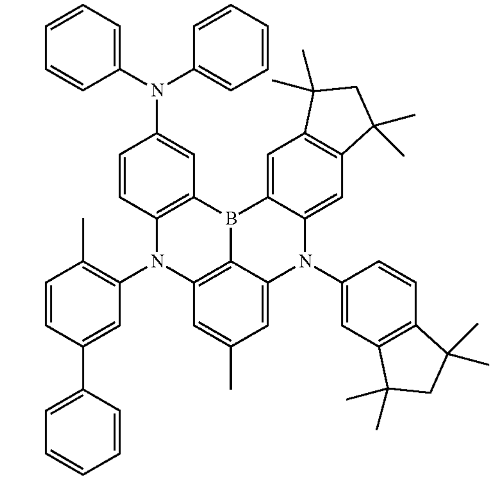
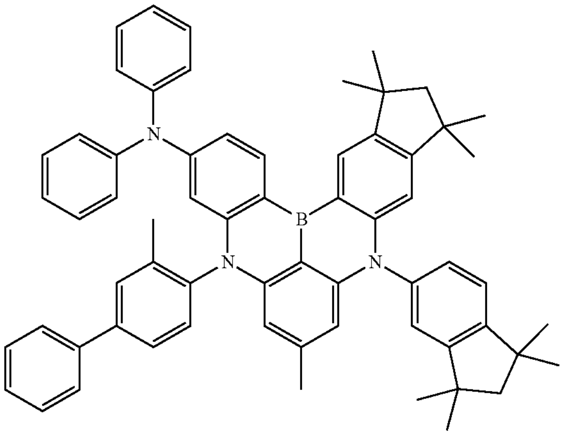
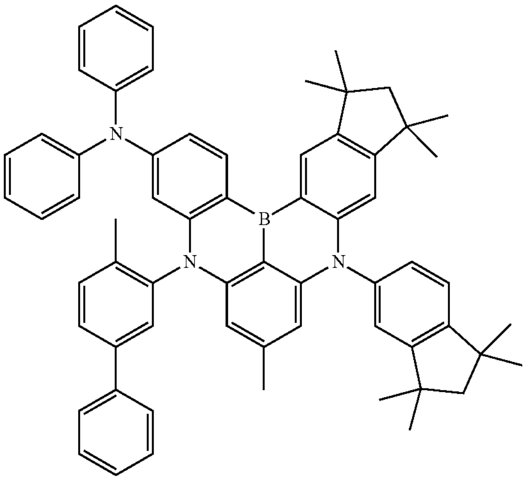
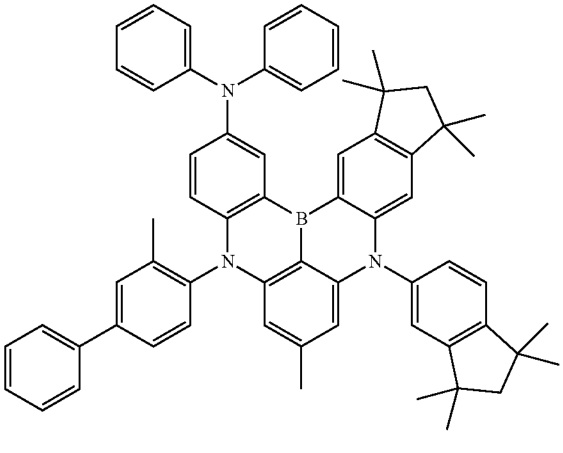
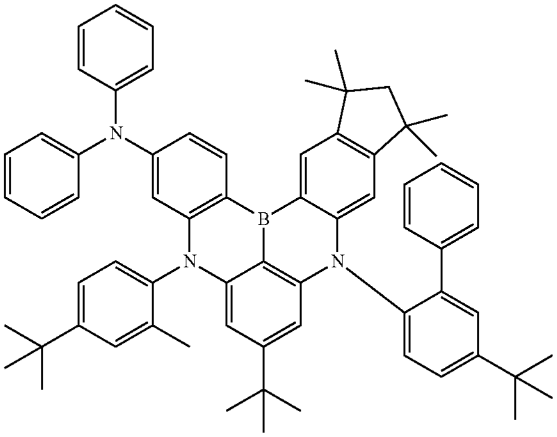
-continued -continued
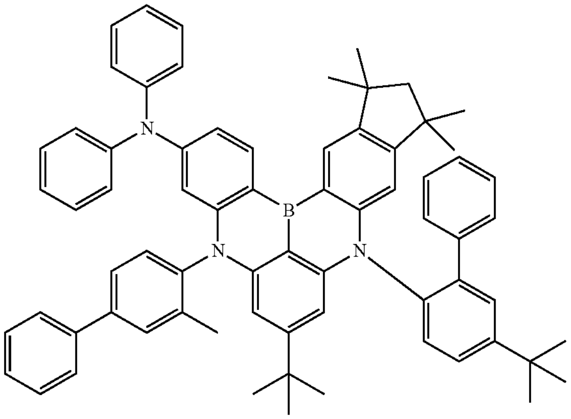
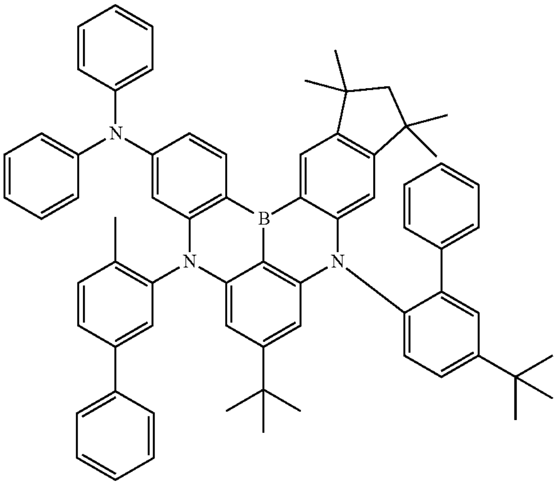
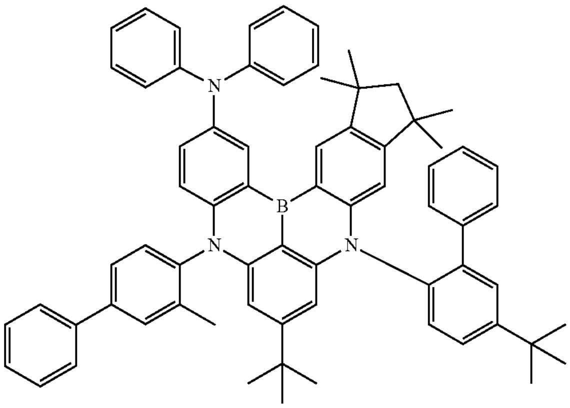
-continued
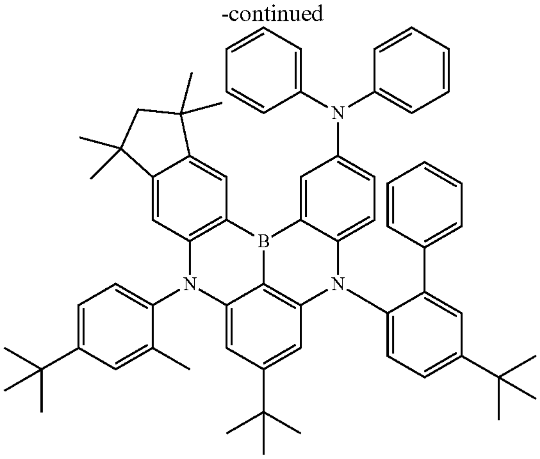
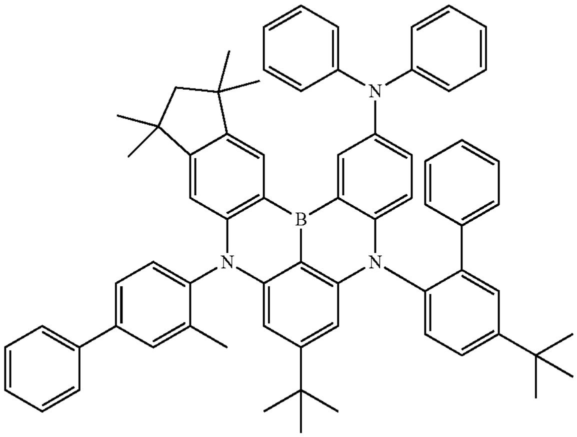
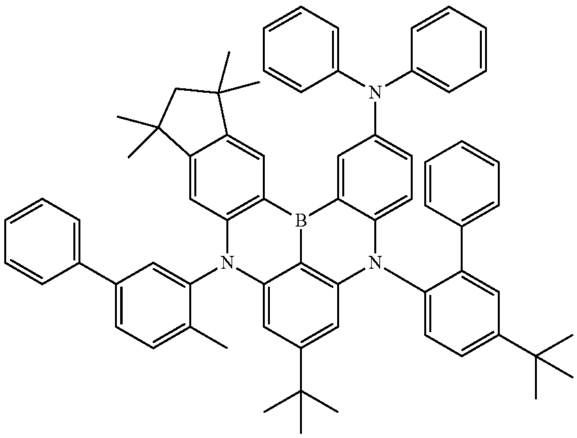
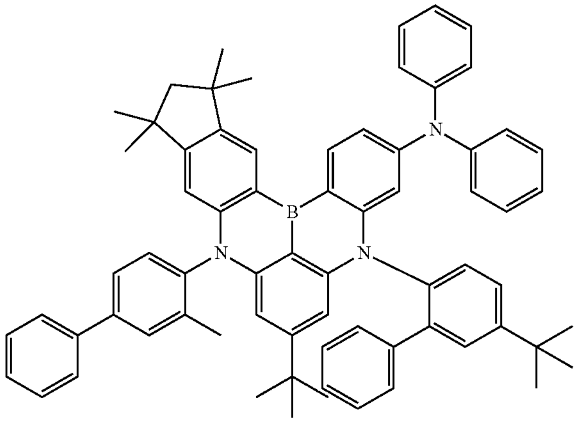

-continued
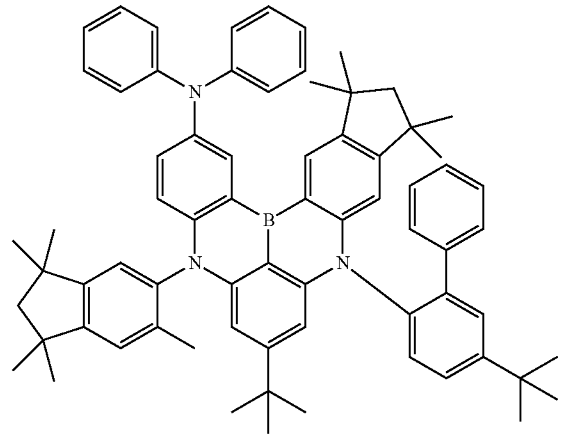
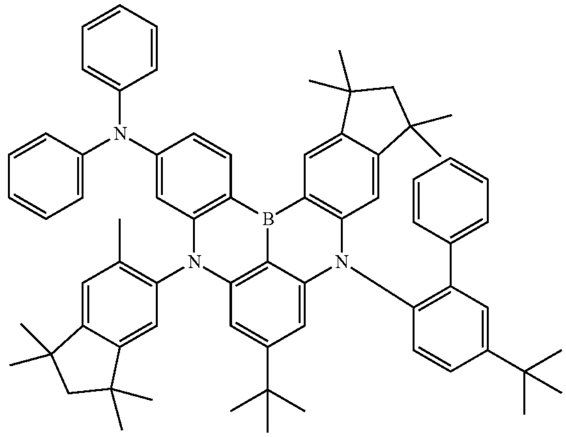
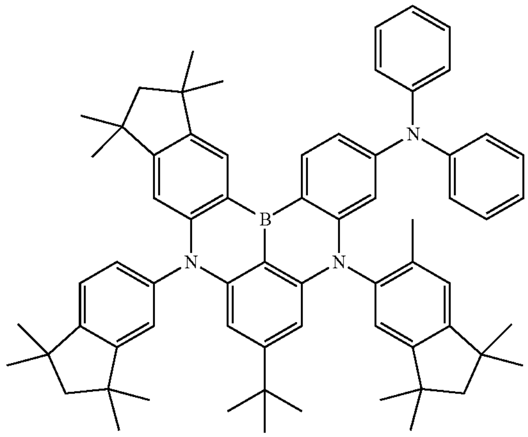
-continued
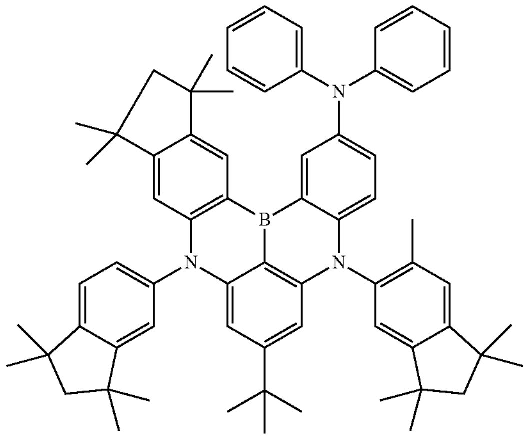
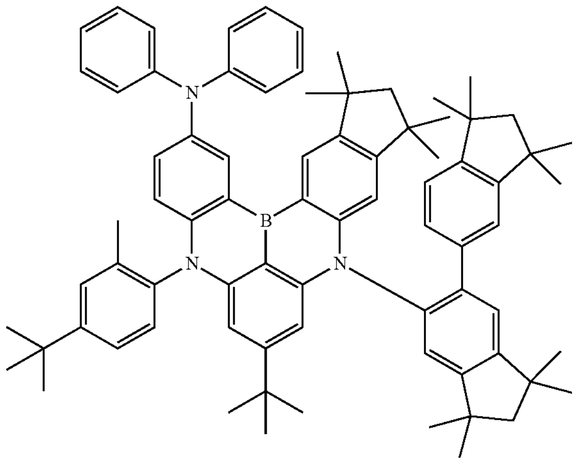
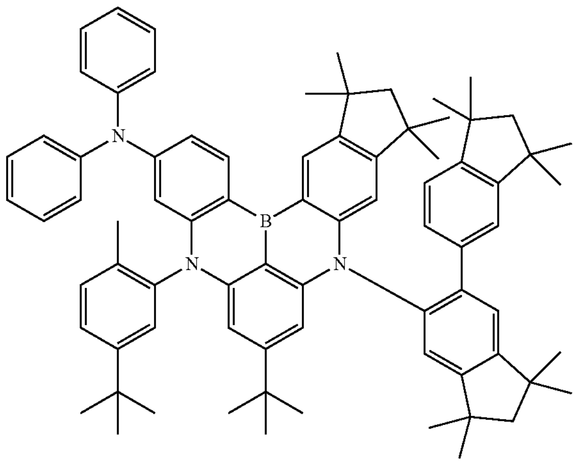

-continued
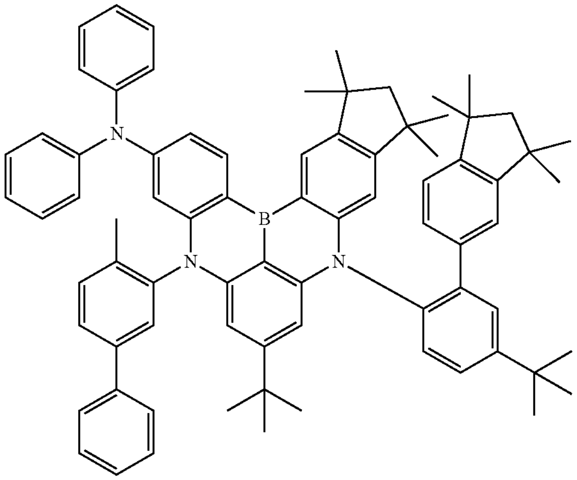
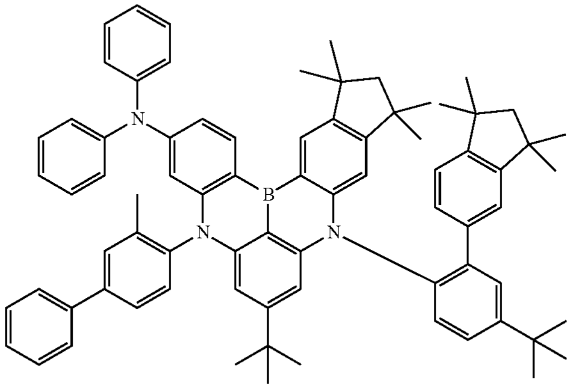
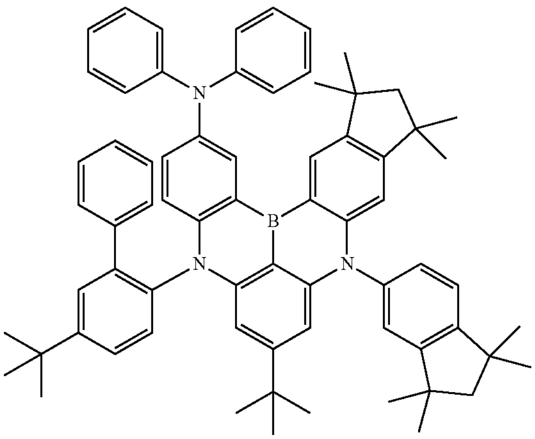
-continued
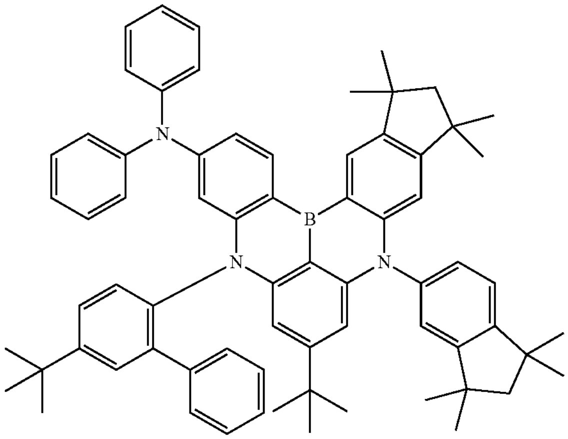
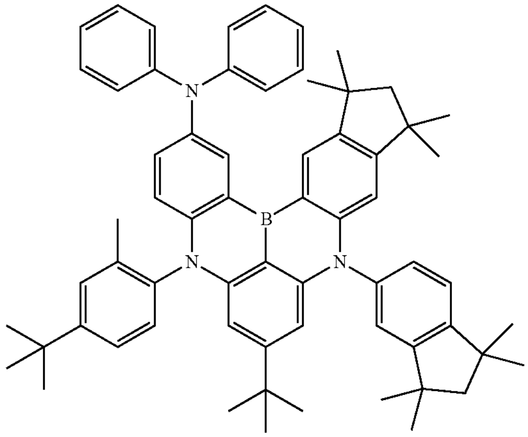
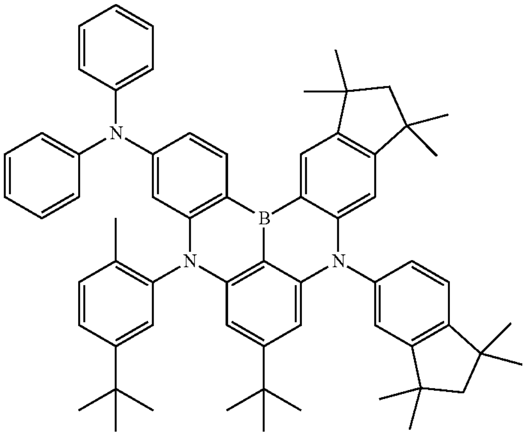

-continued
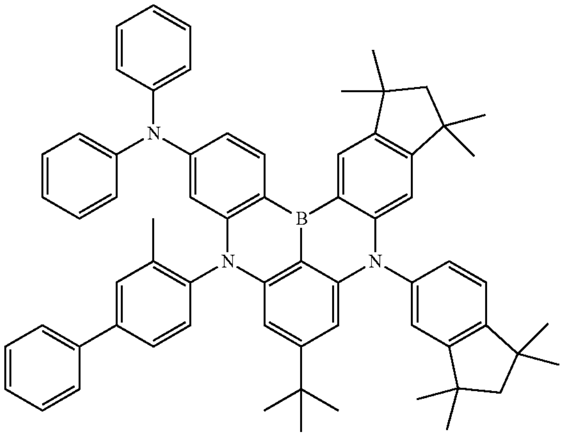
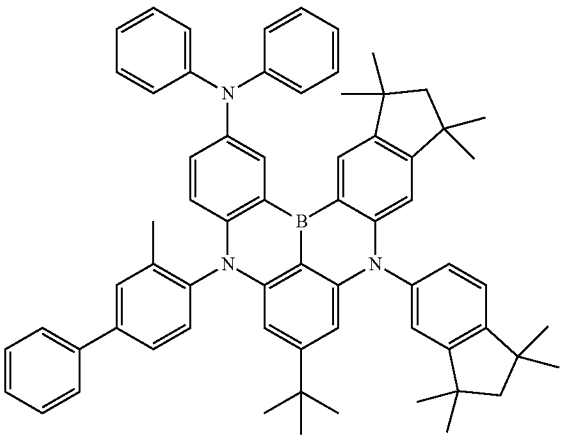
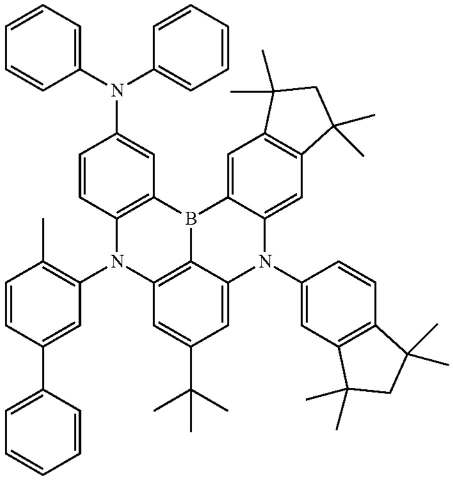
-continued
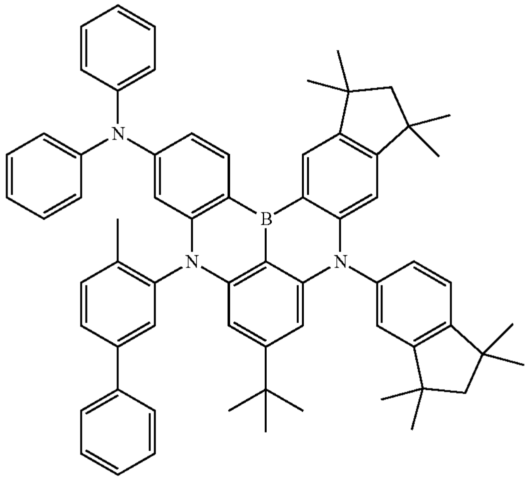
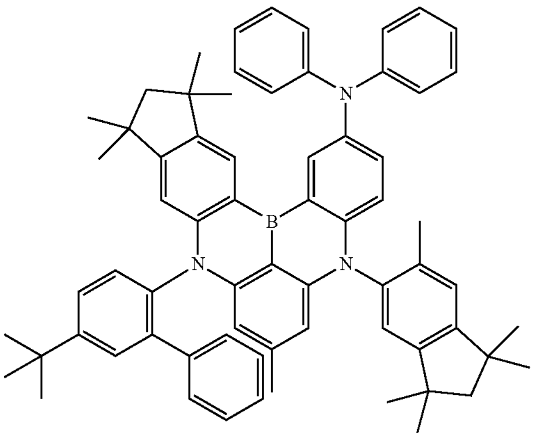
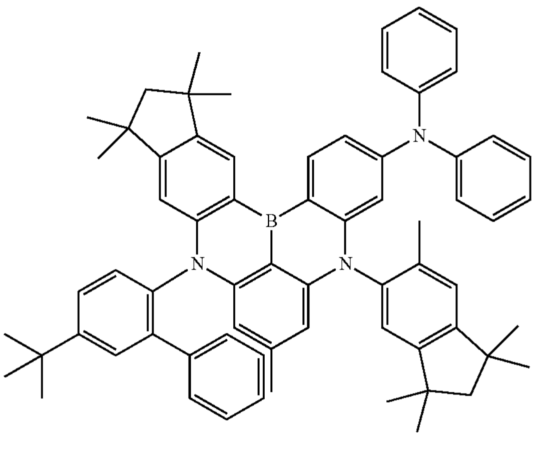

-continued
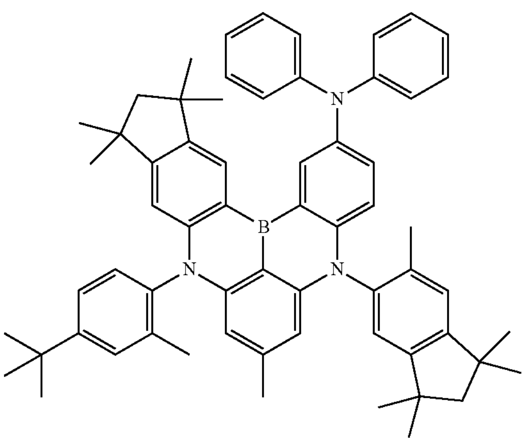
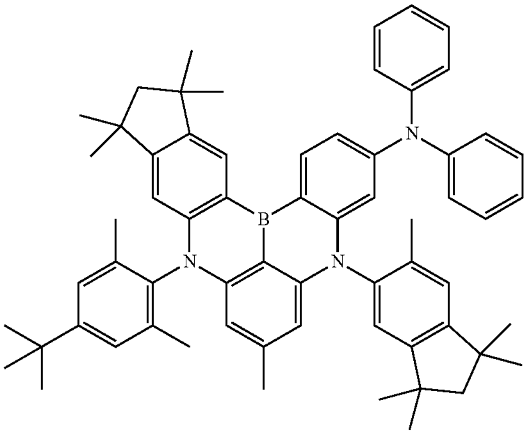
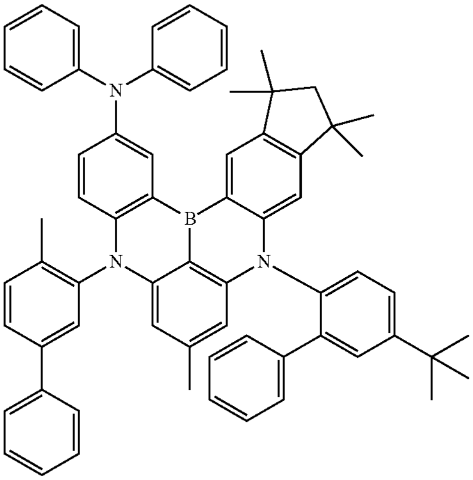
-continued
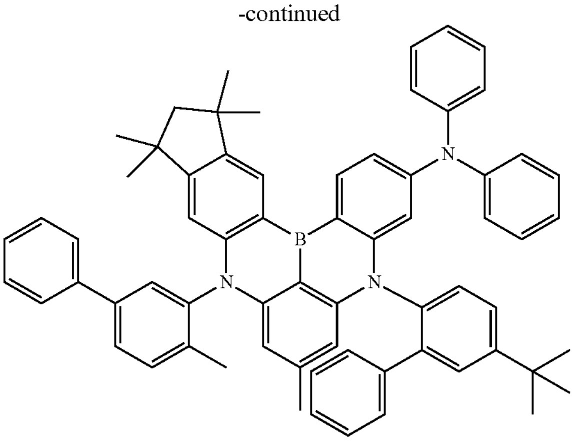
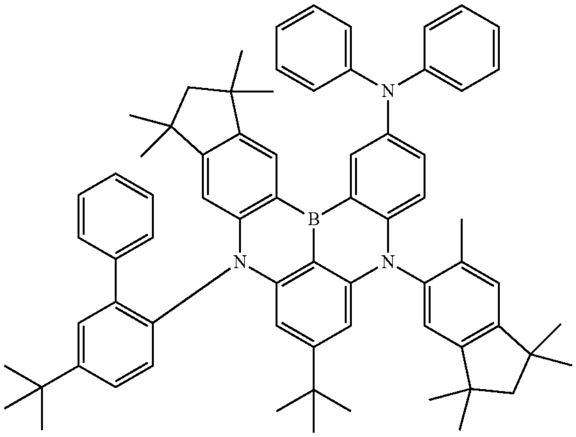
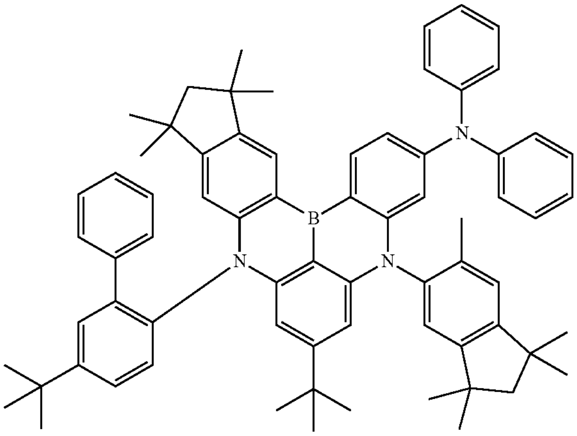
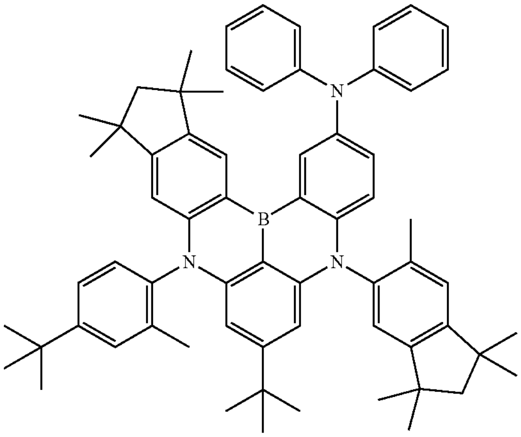

-continued
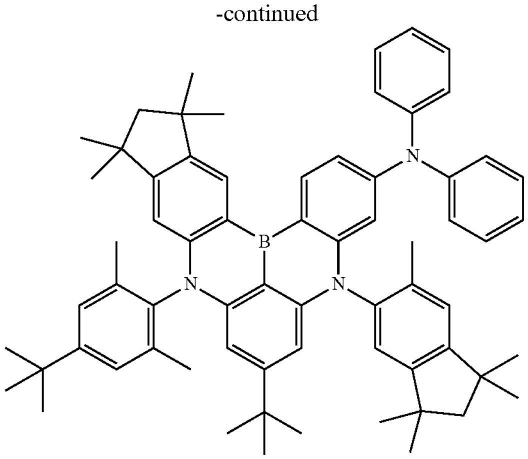
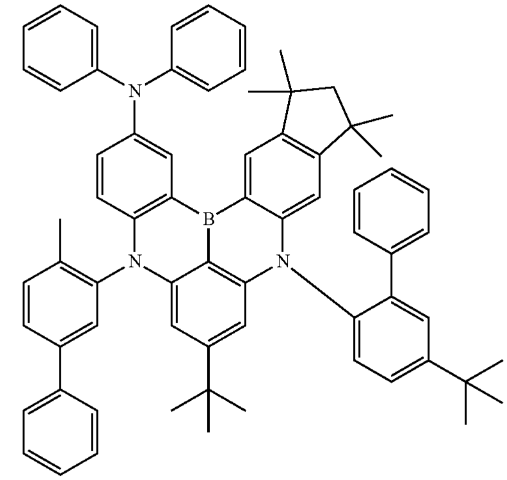
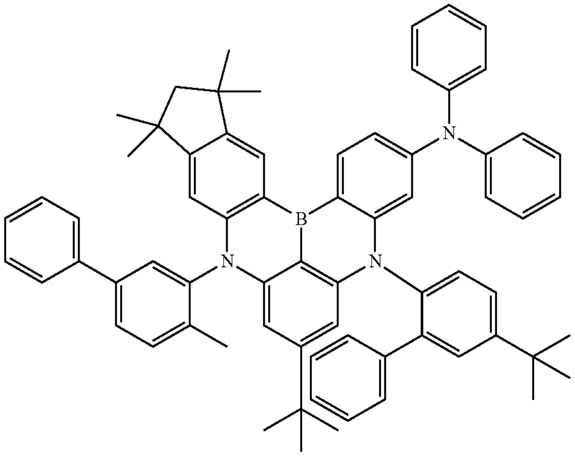
-continued
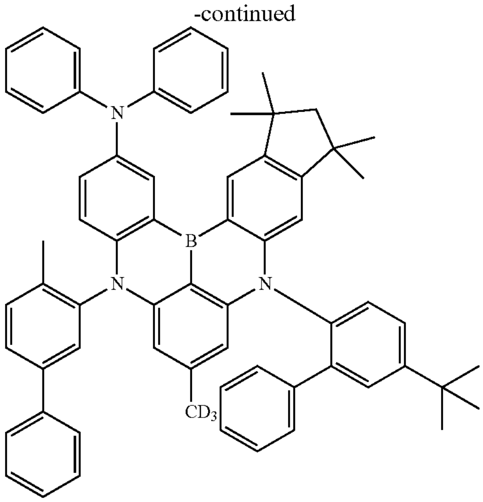
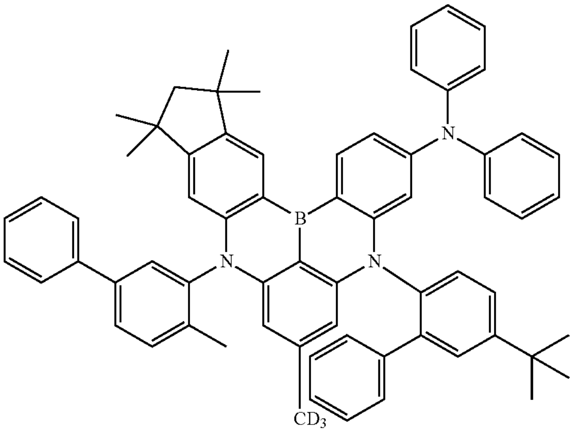
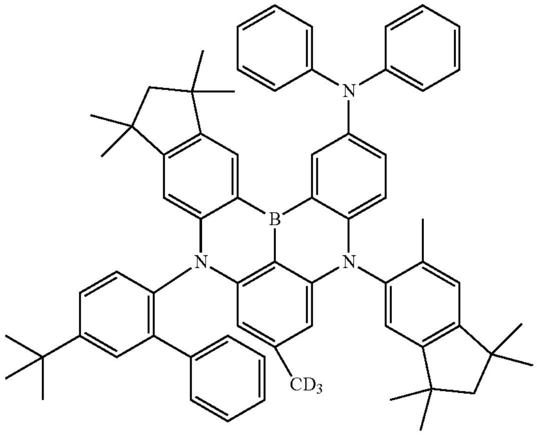

-continued
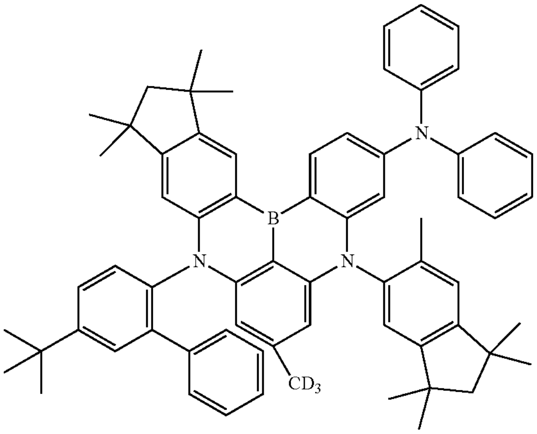
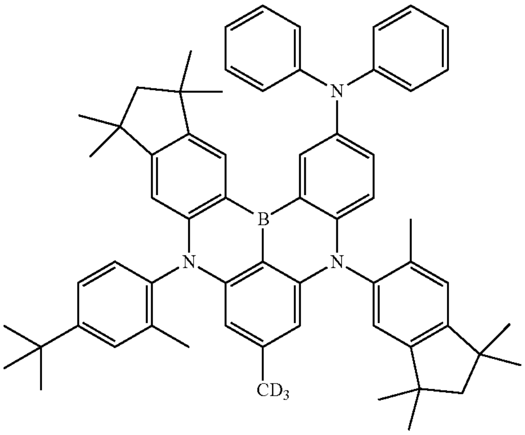
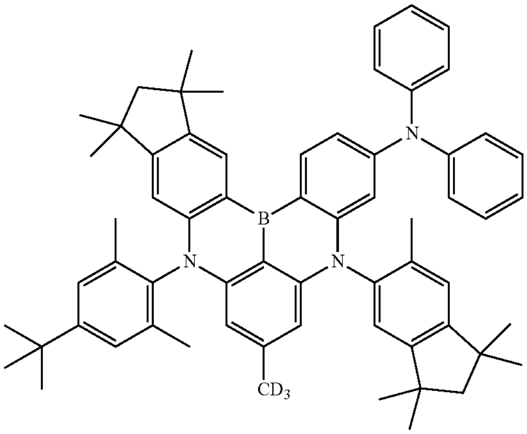
-continued
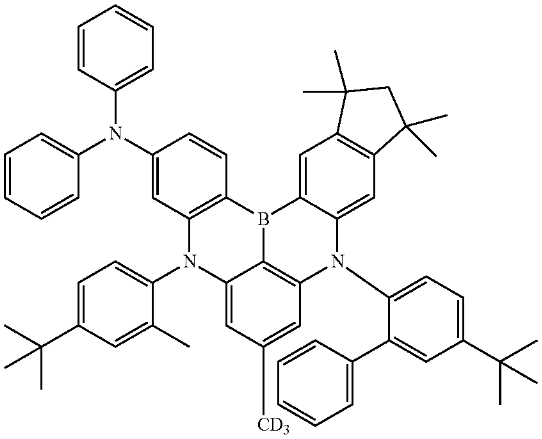
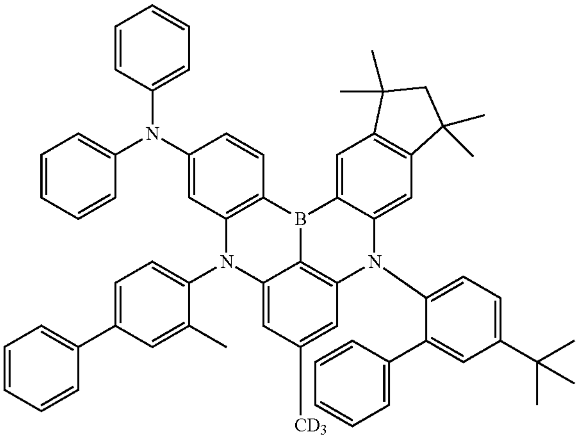
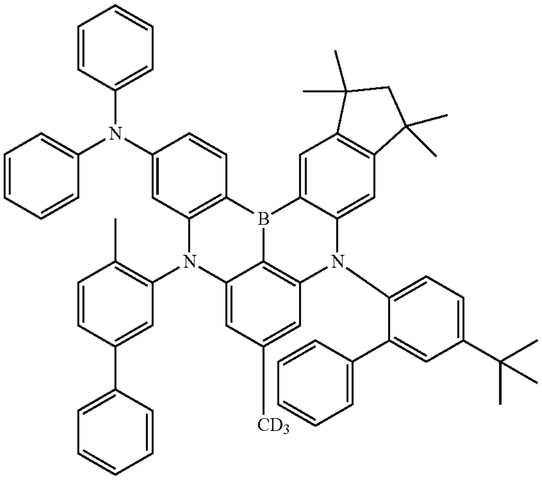

-continued
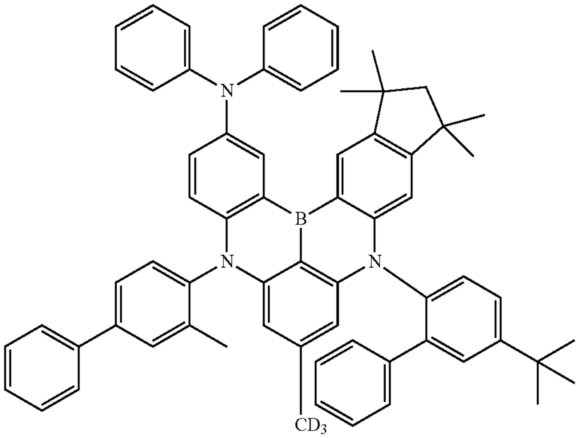
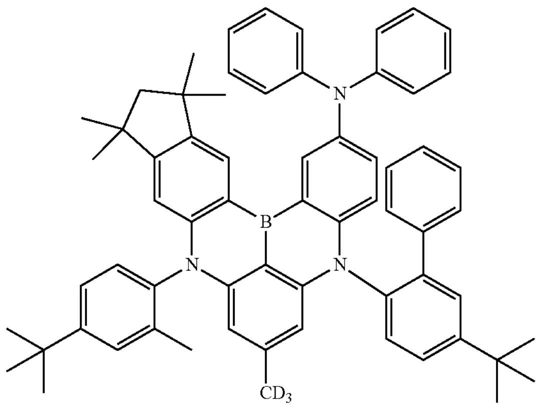
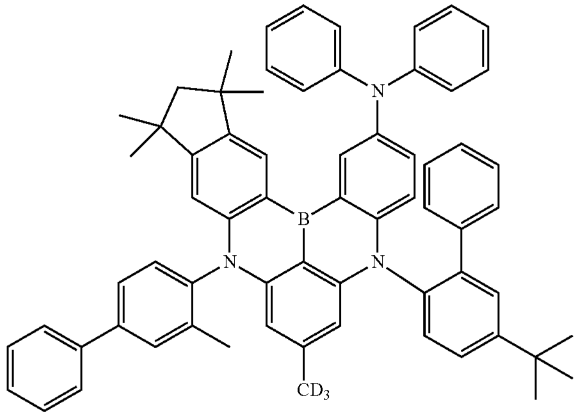
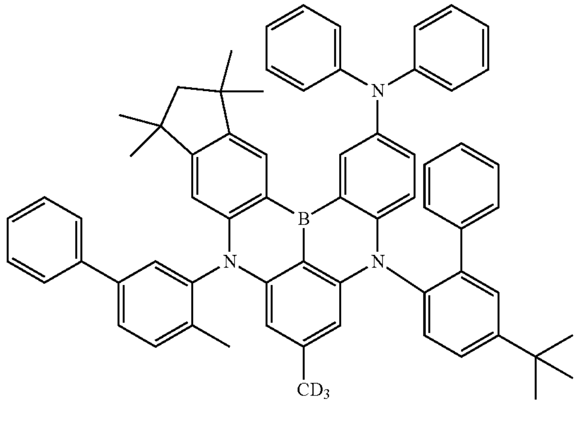
-continued
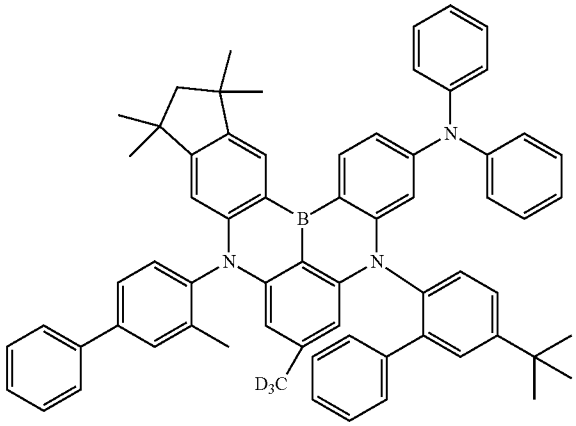
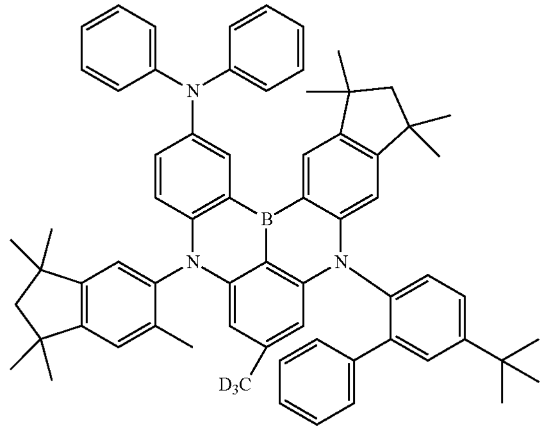
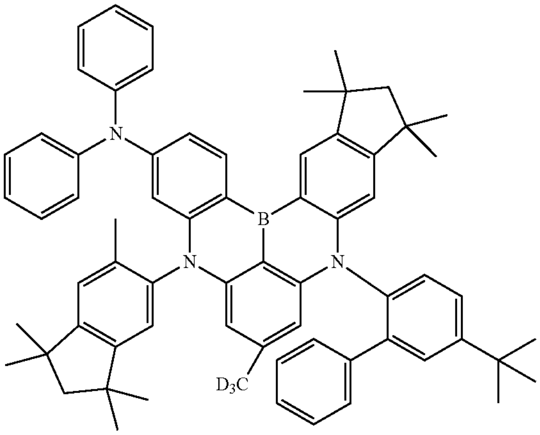
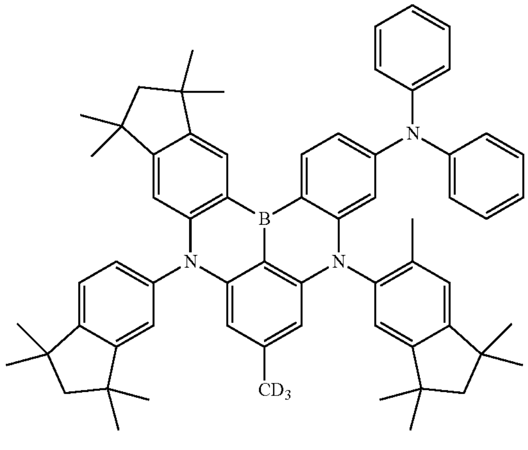

-continued
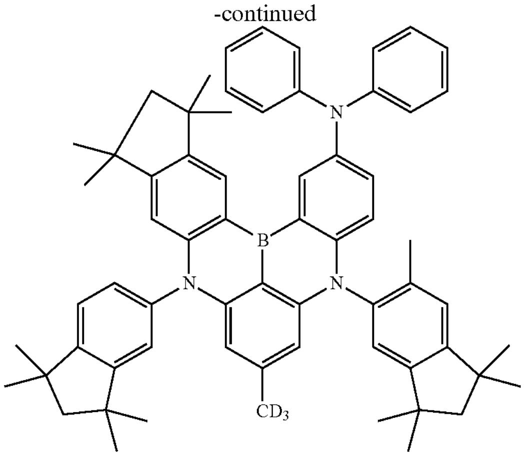
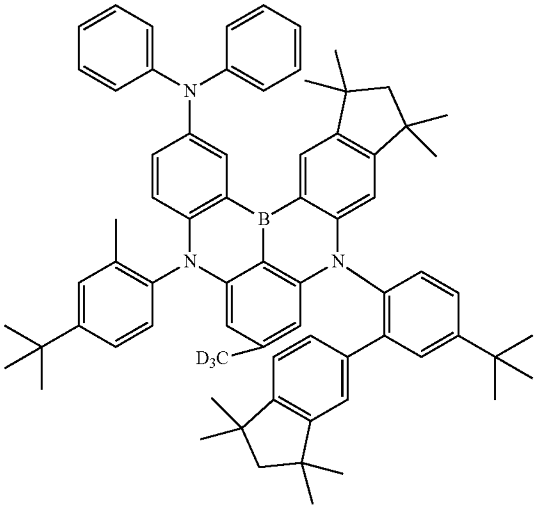
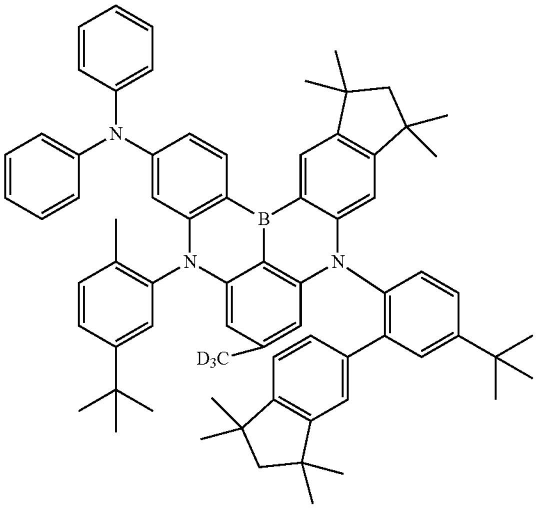
-continued
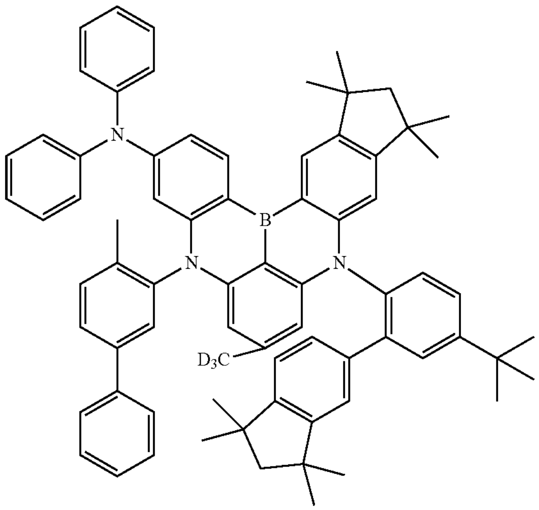
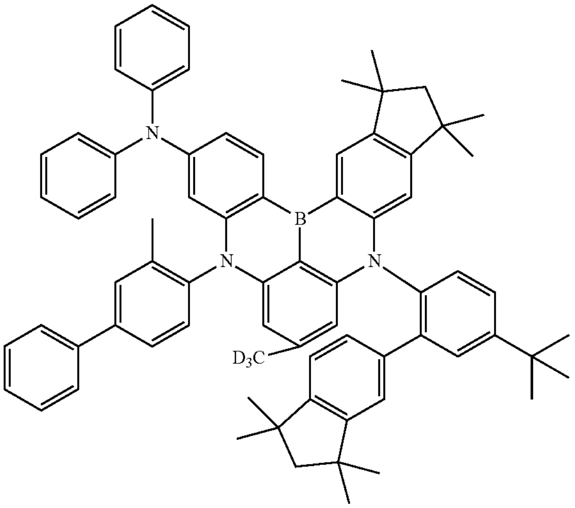
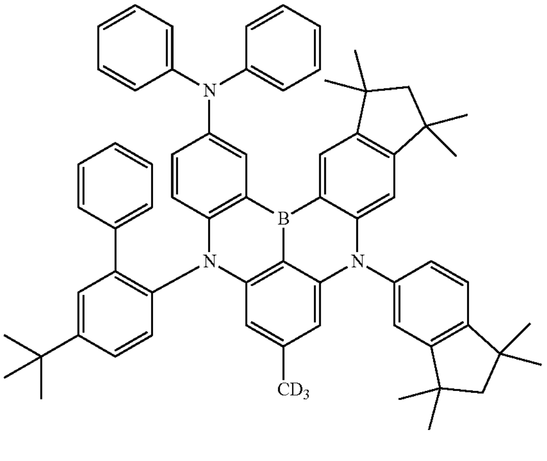

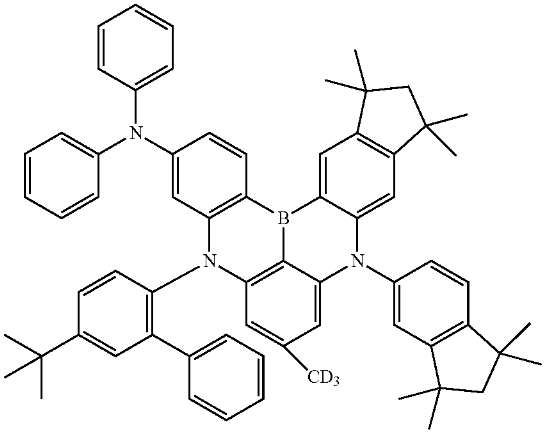
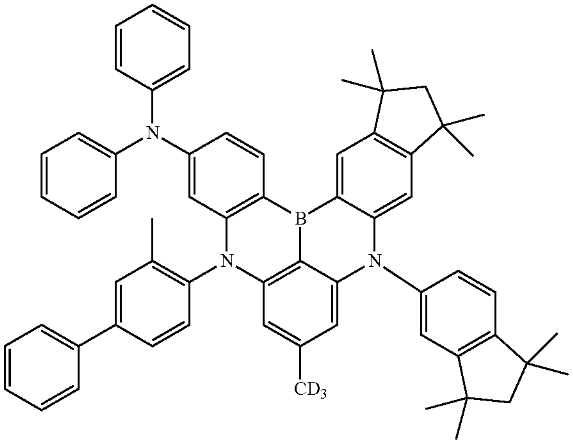
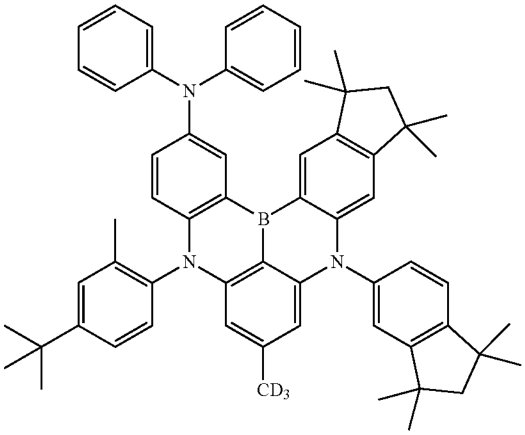
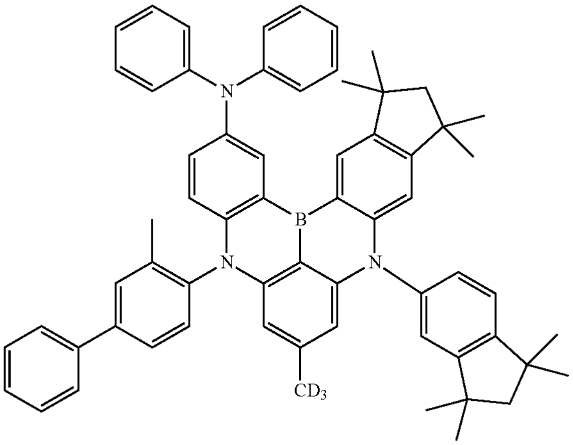
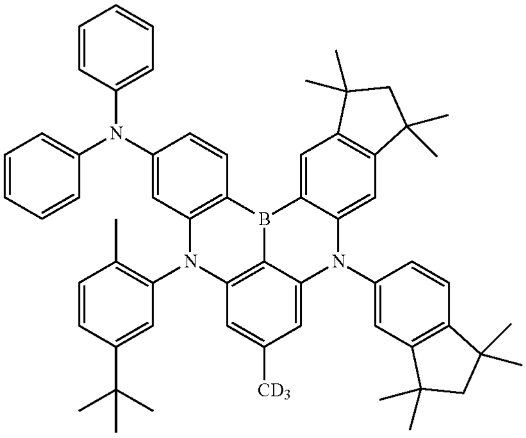
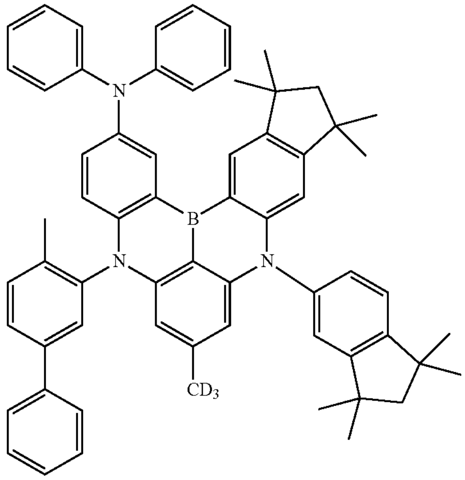

-continued
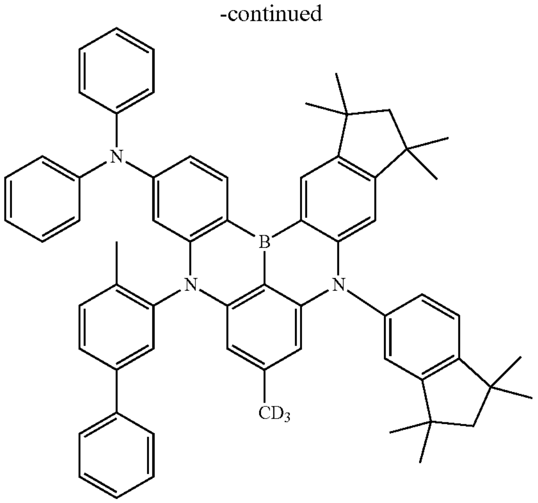
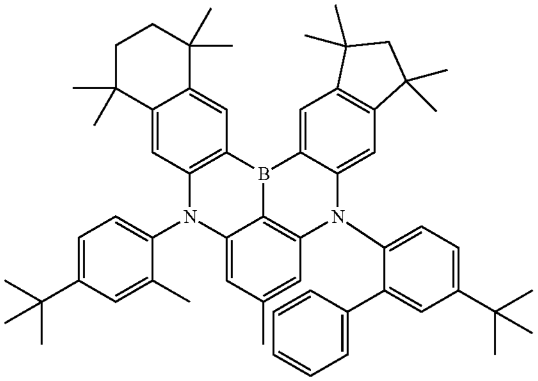
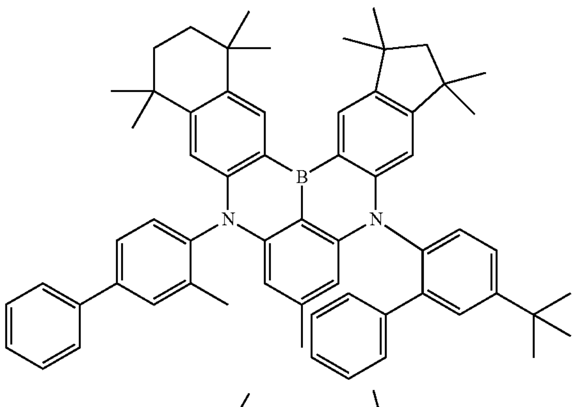
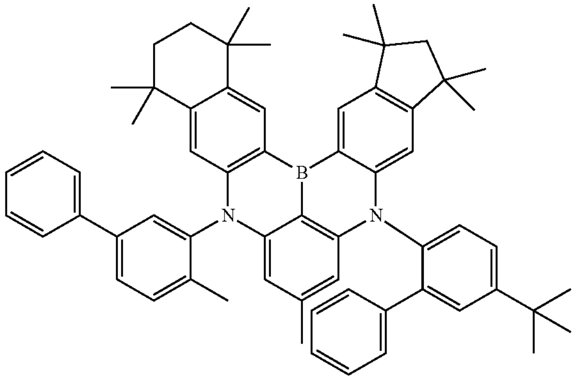
-continued
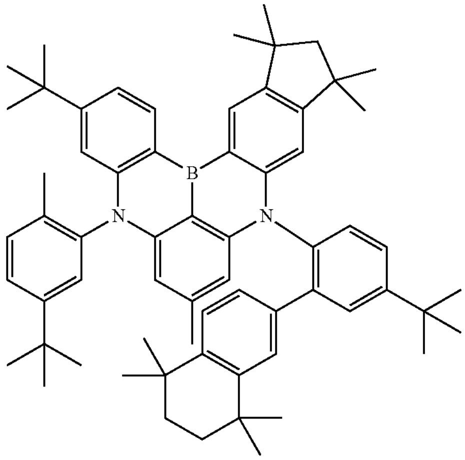
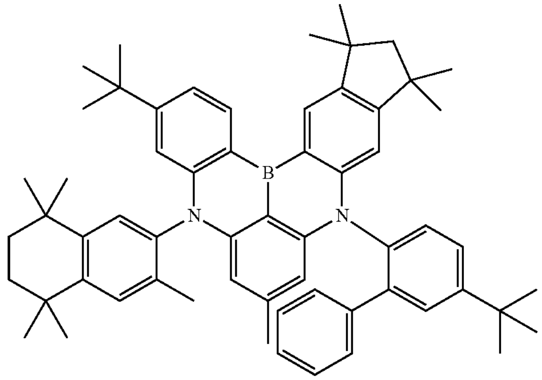
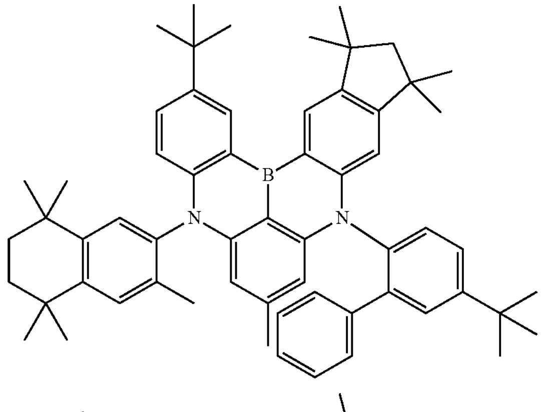
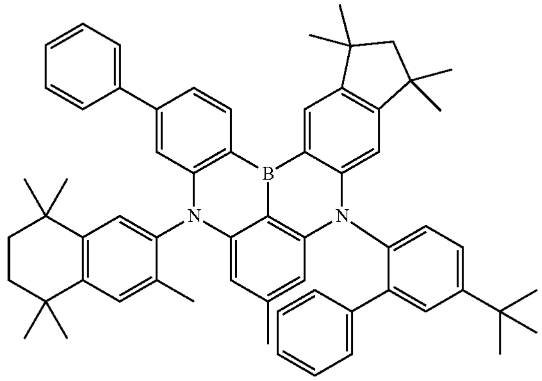

-continued
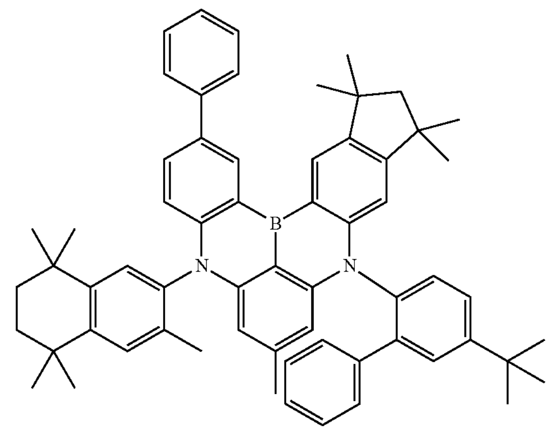
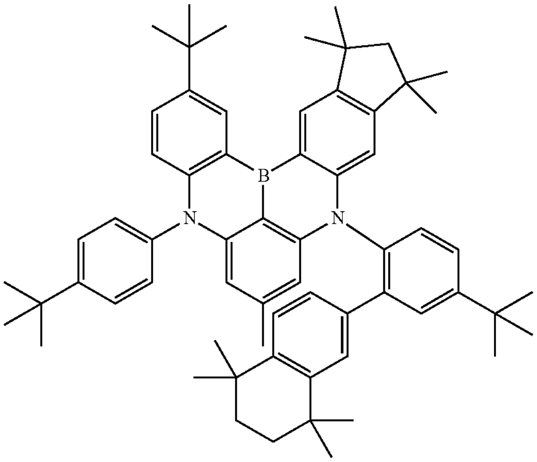
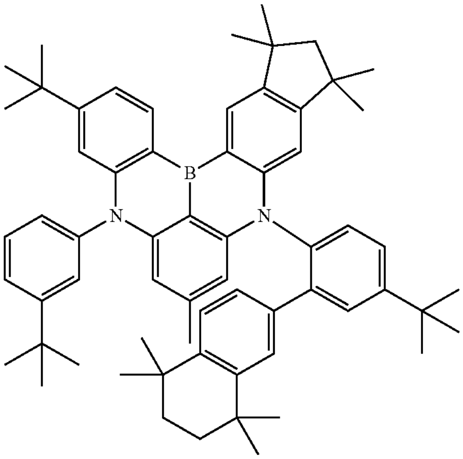
-continued
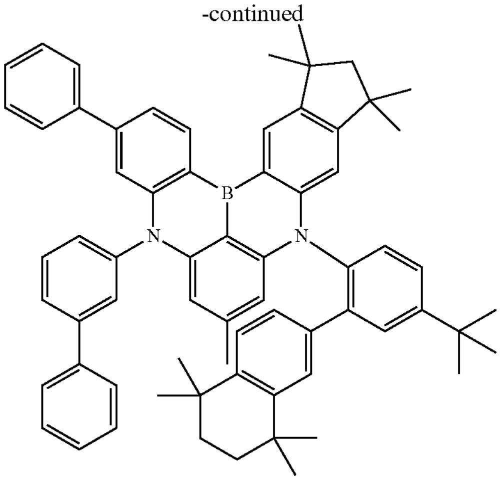
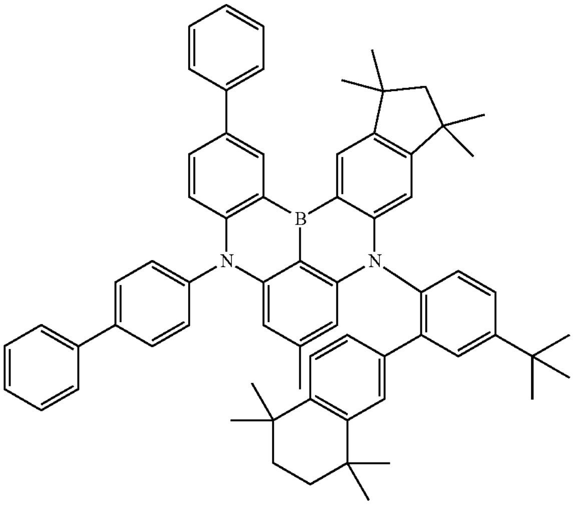
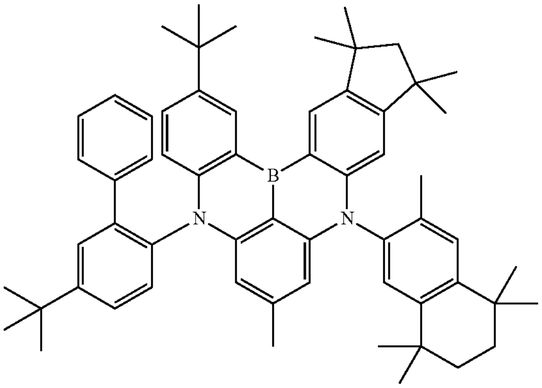

-continued
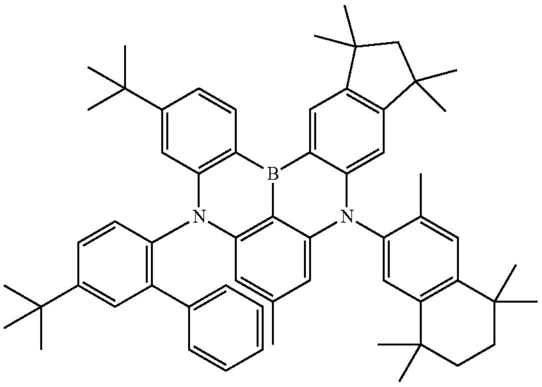
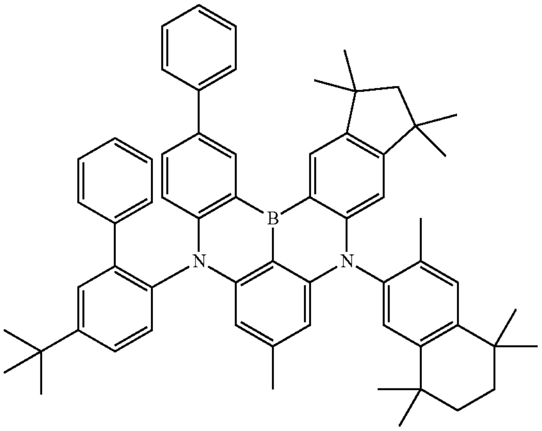
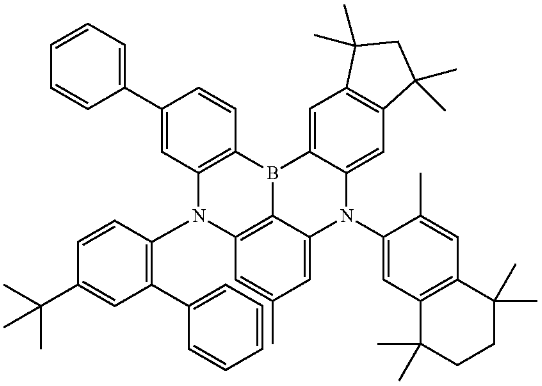
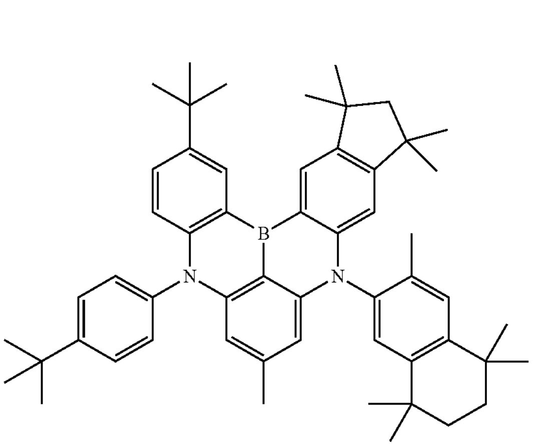
-continued
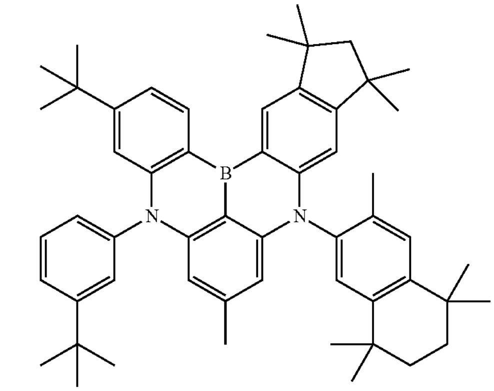
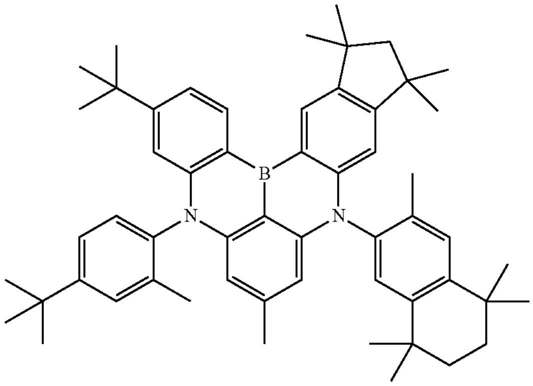
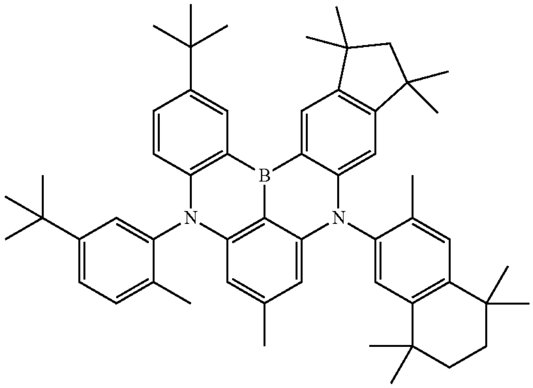
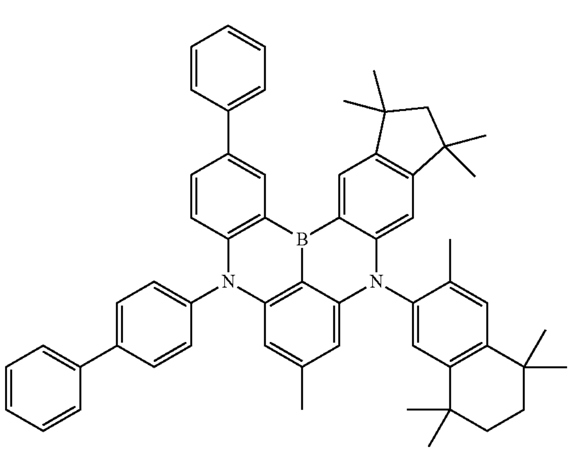

-continued
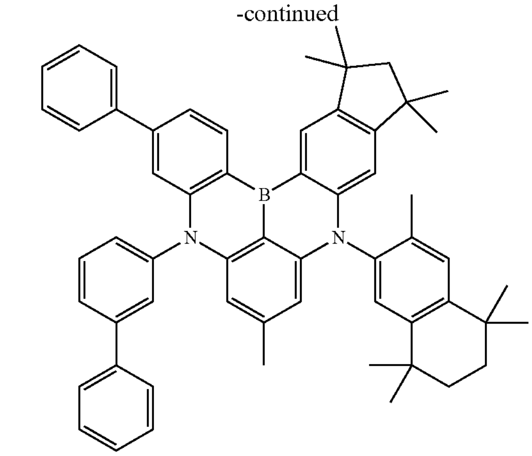
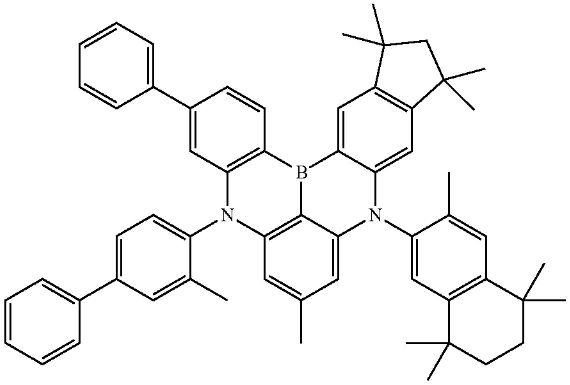
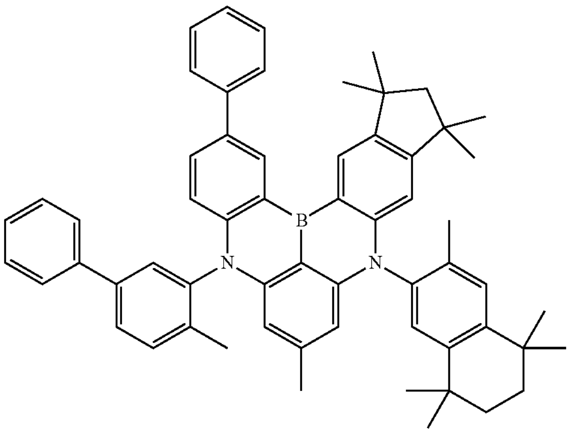
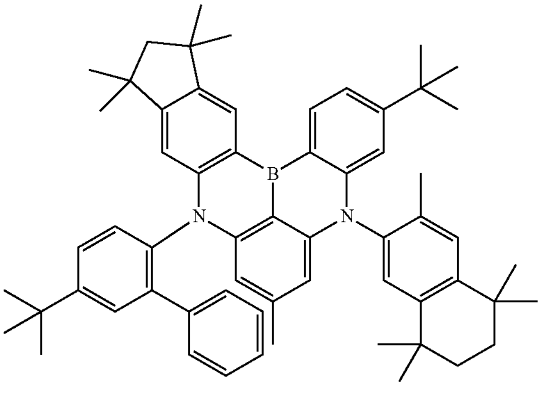
-continued
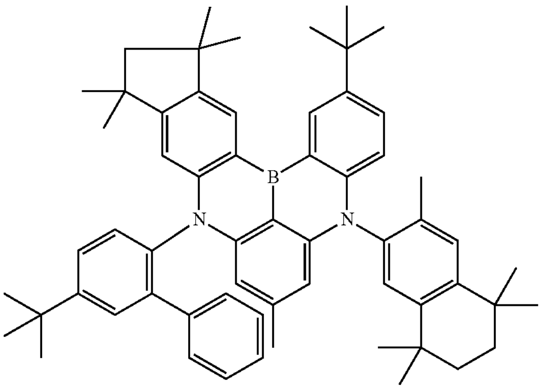
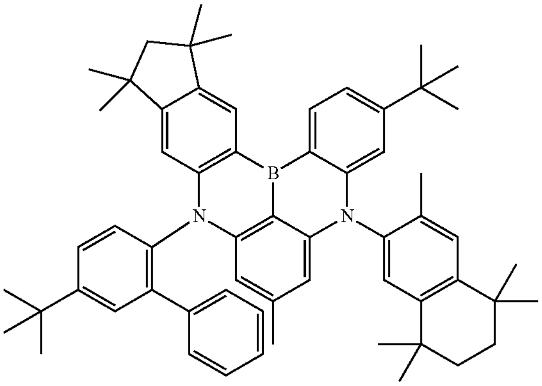
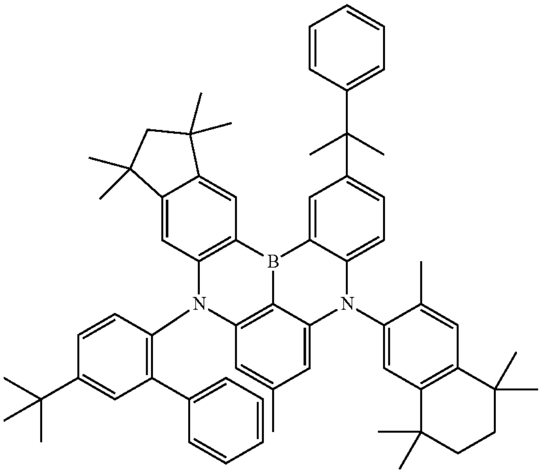
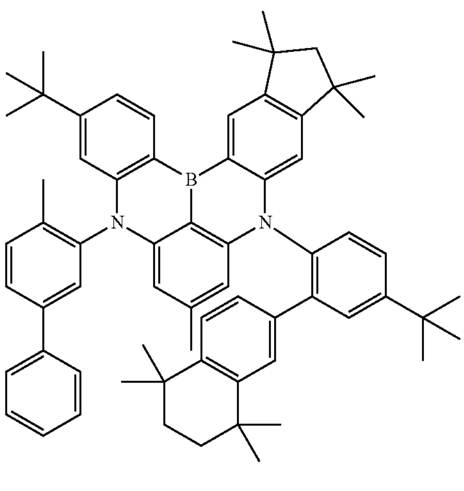

-continued
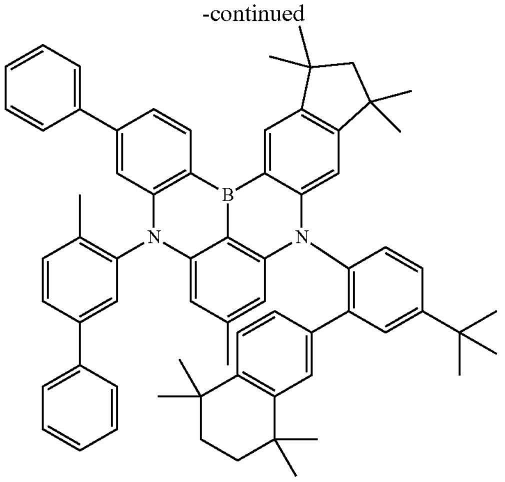
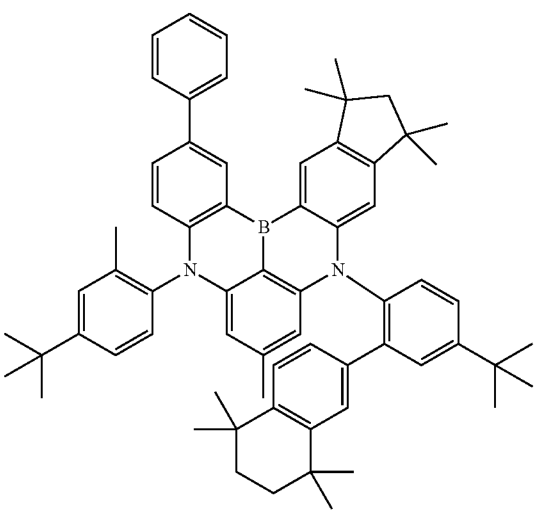
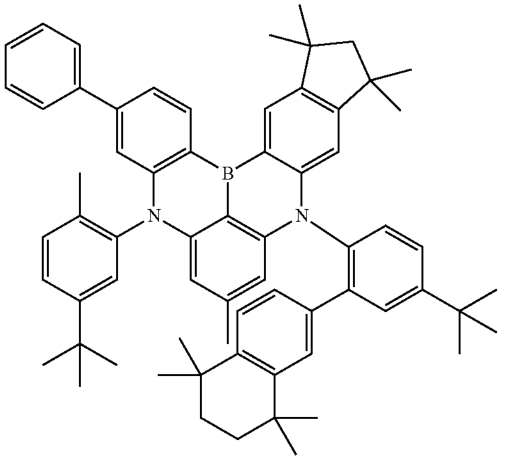
-continued
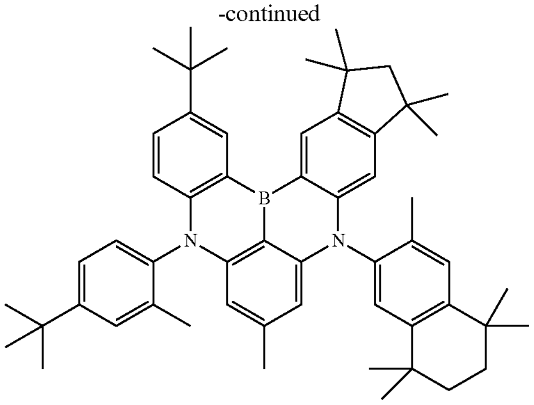
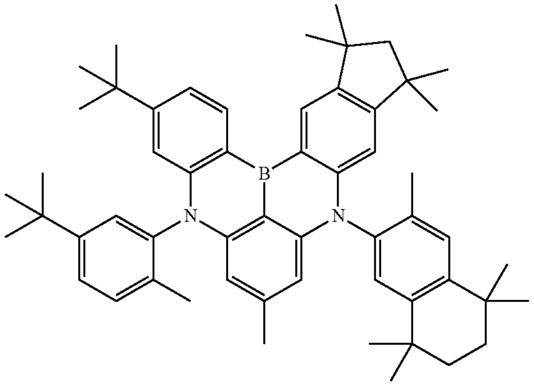
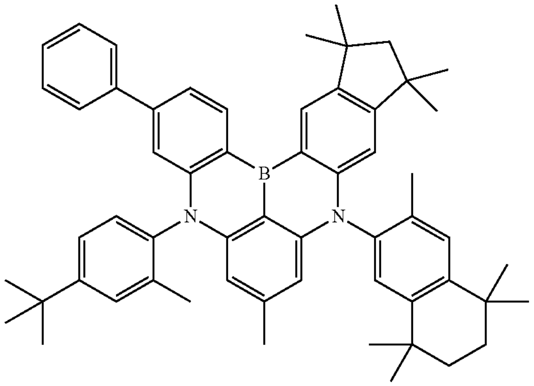
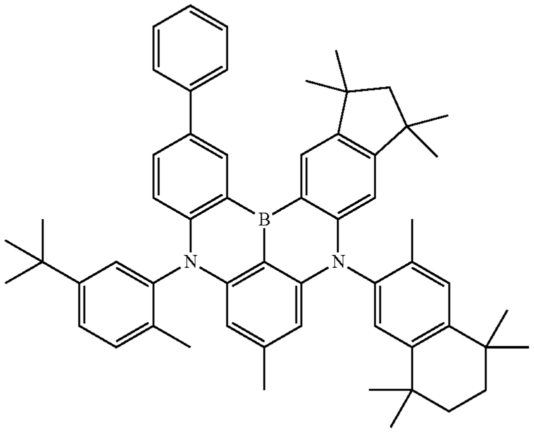

-continued
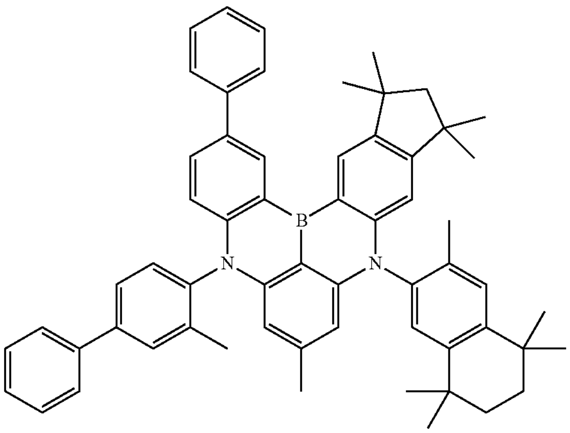
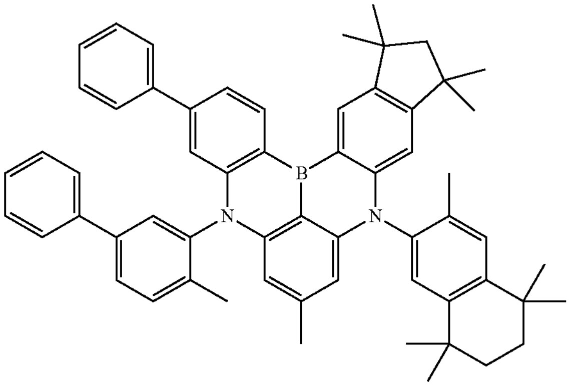
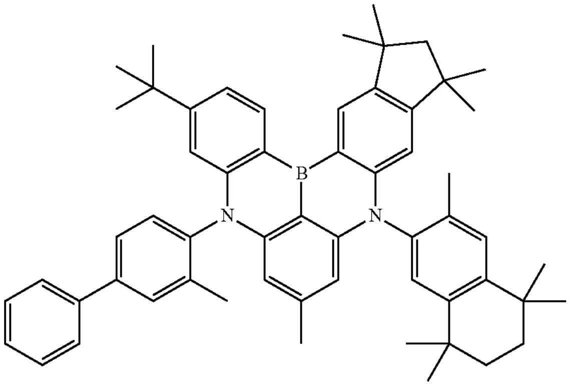
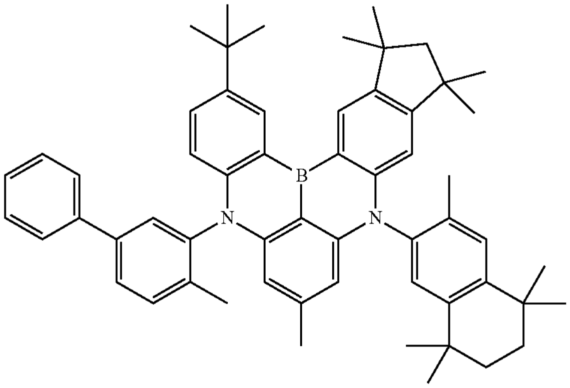
-continued
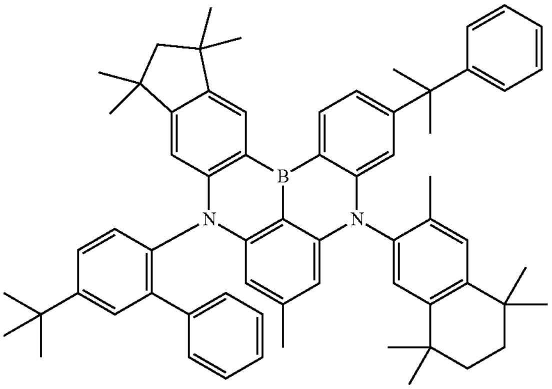
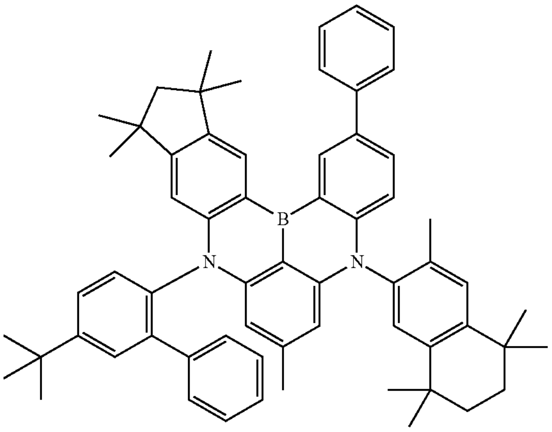
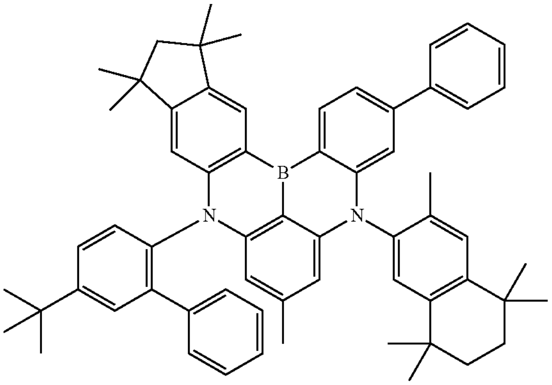
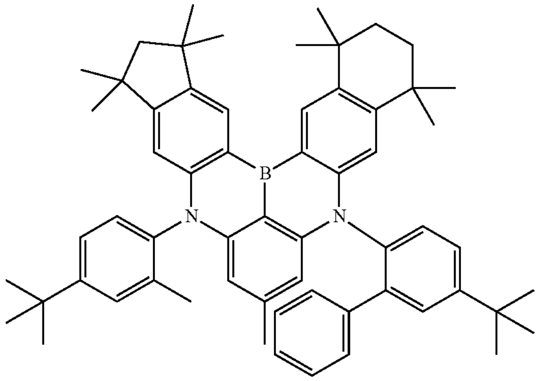

-continued
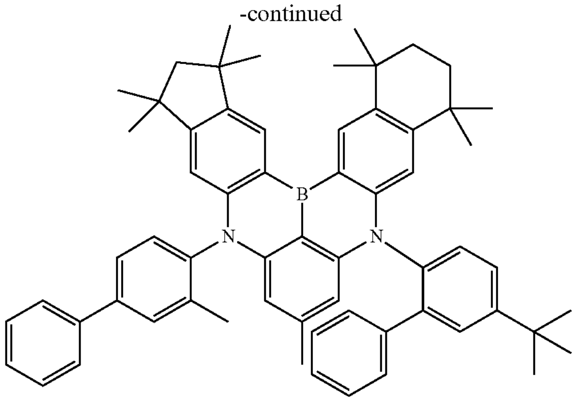
-continued
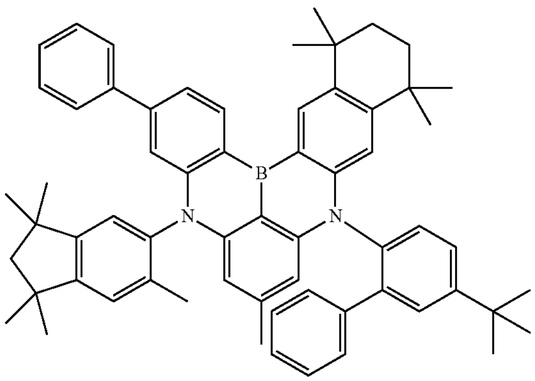
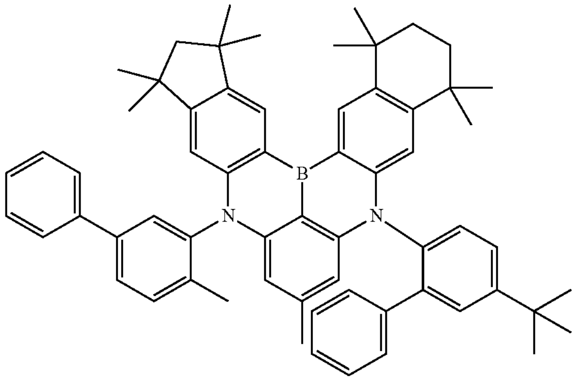
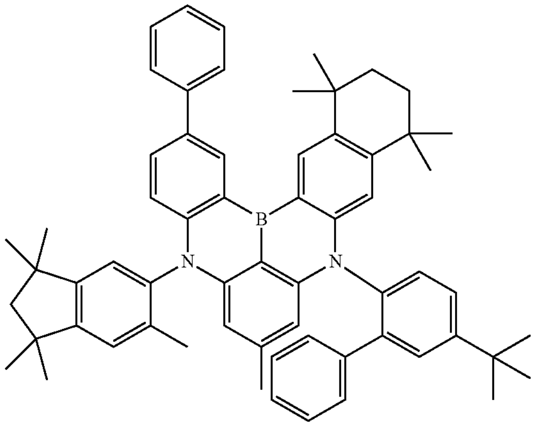 [SMILES: Cc1cc2c3c(c1)N(c1ccc(C(C)(C)C)cc1-c1ccccc1)c1cc4c(cc1B3c1cc(-c3ccccc3)ccc1N2c1cc2c(cc1C)C(C)(C)CC2(C)C)C(C)(C)CCC4(C)C]
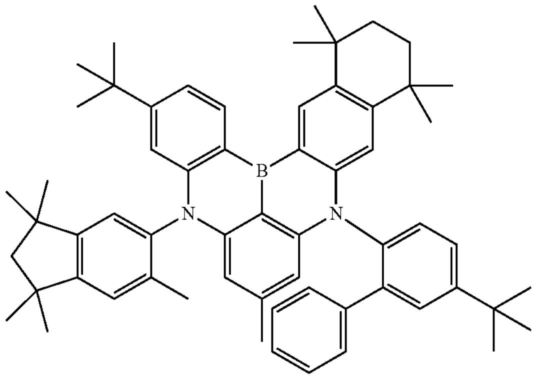
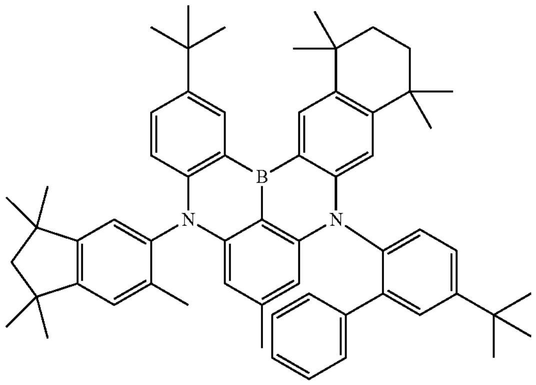
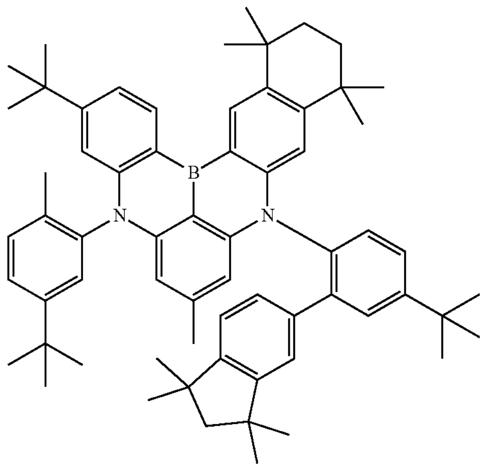

-continued
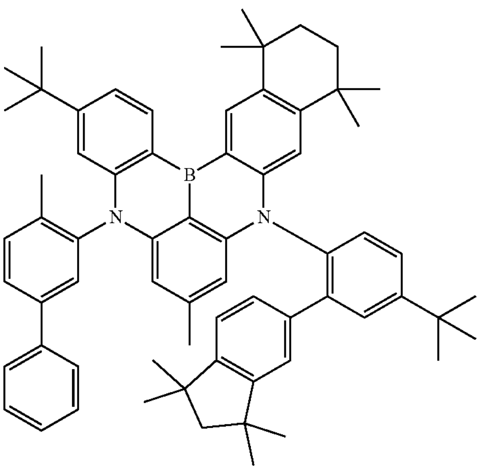
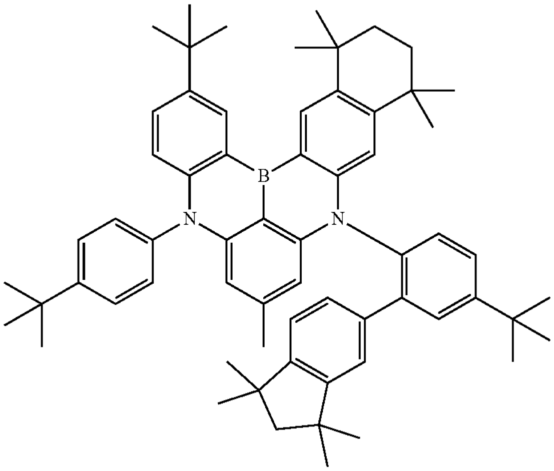
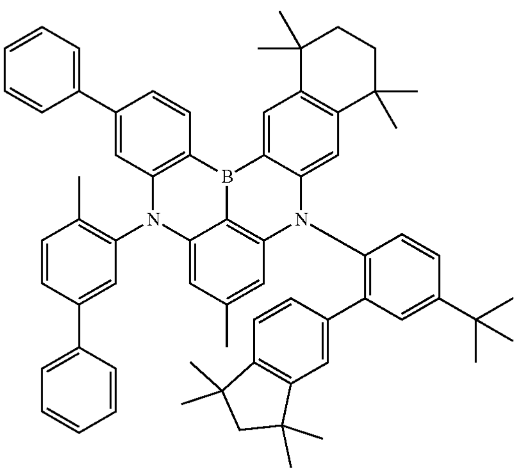
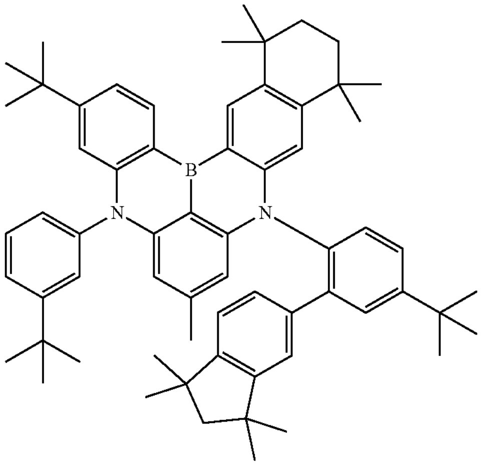
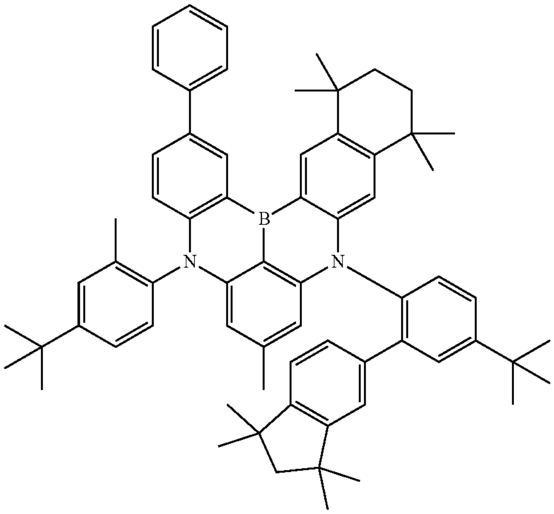
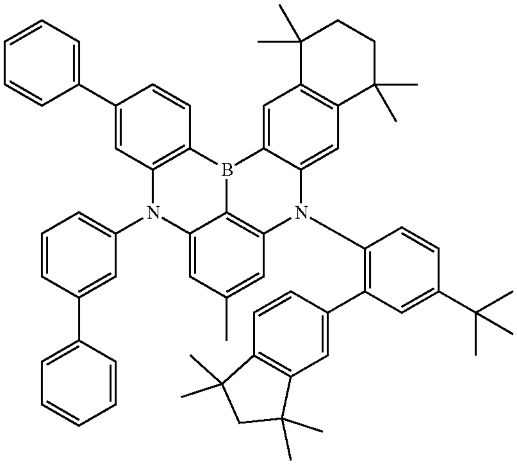

-continued
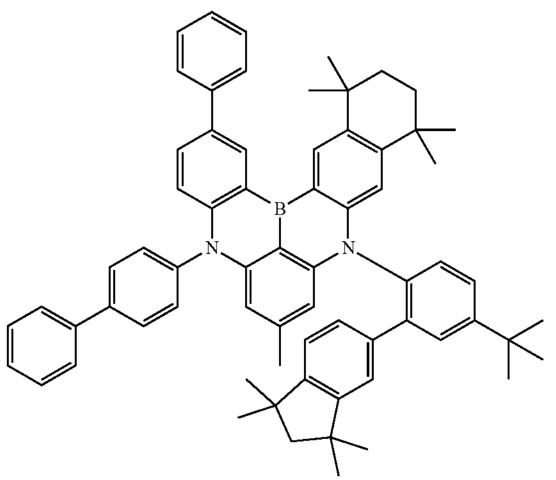
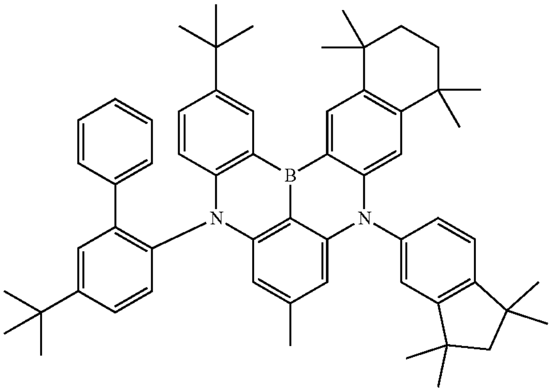
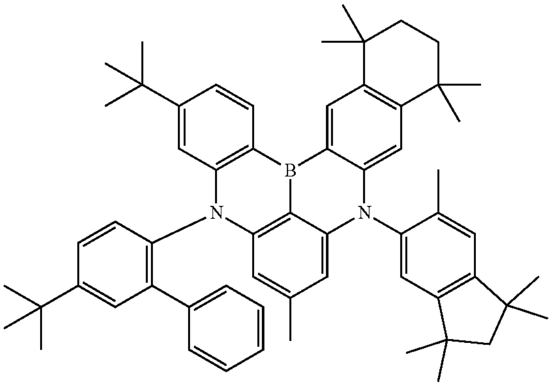
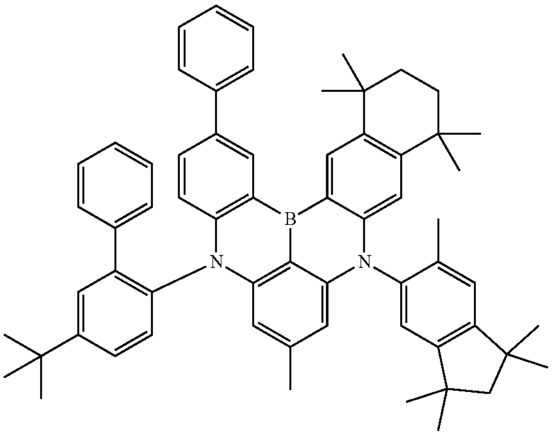
-continued
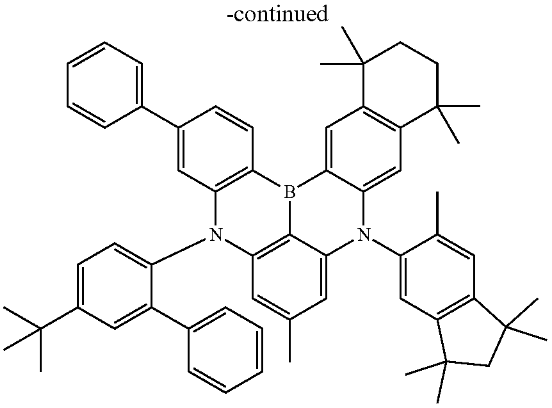
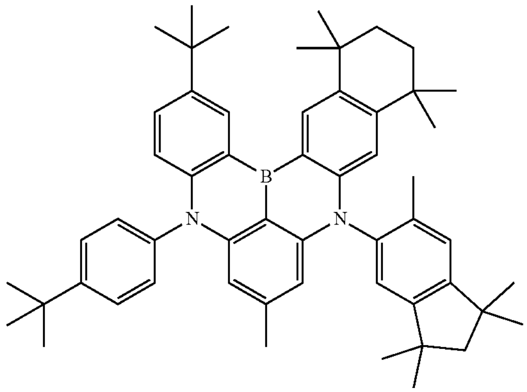
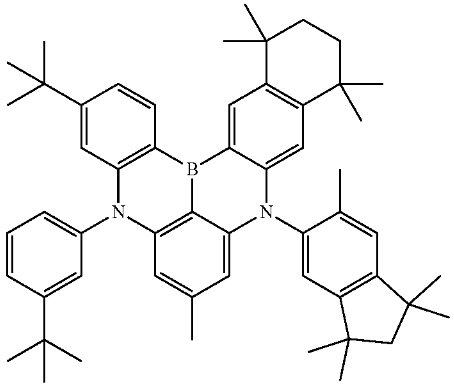
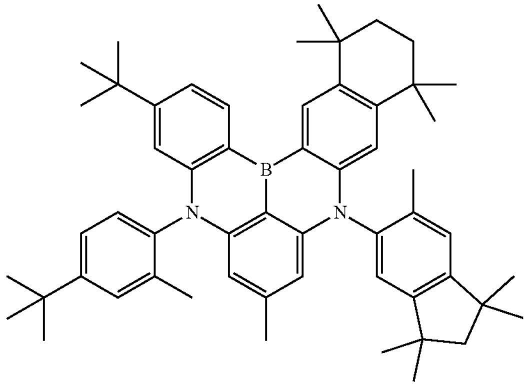

-continued
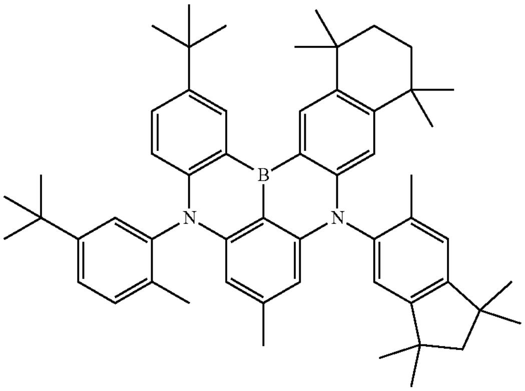
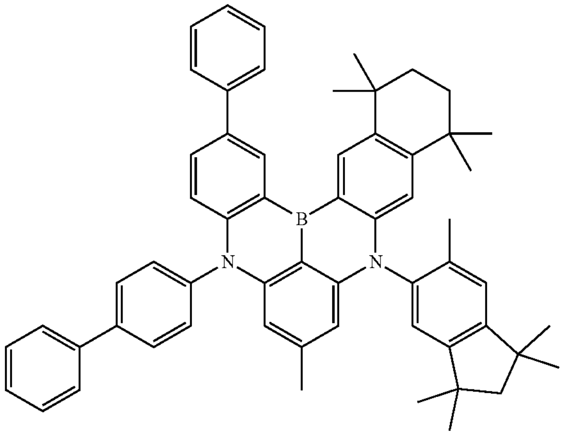
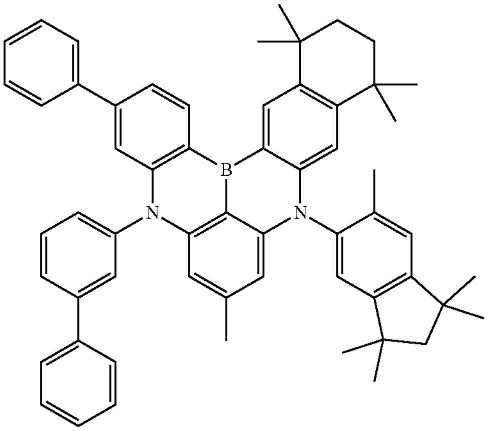
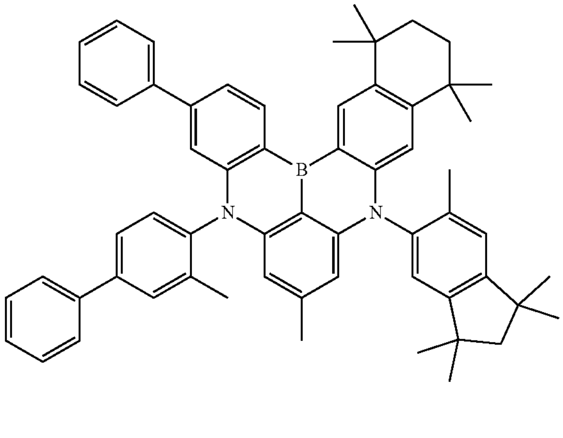
-continued
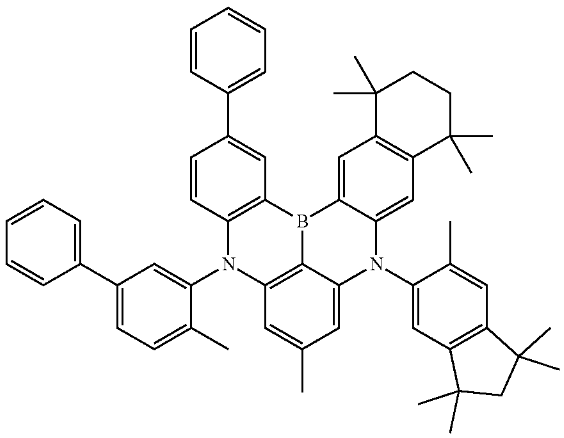
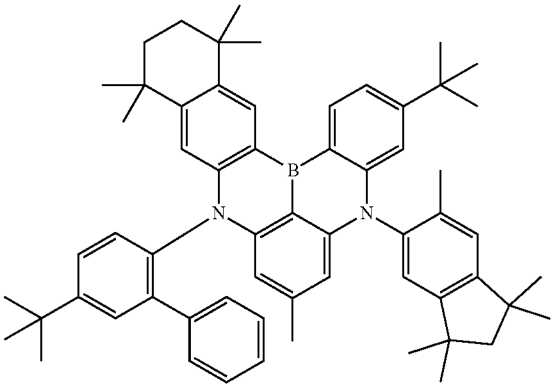
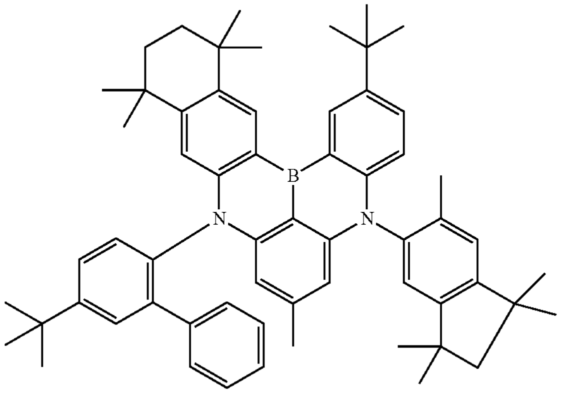
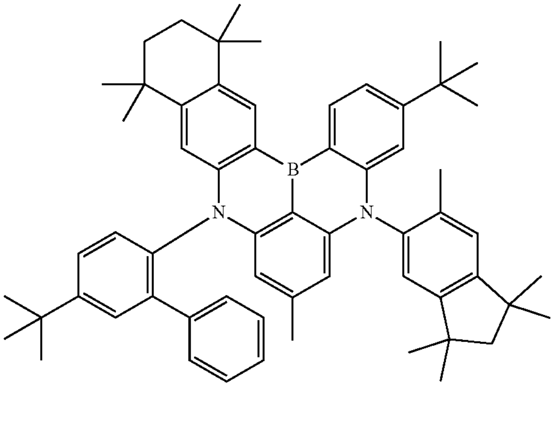

-continued
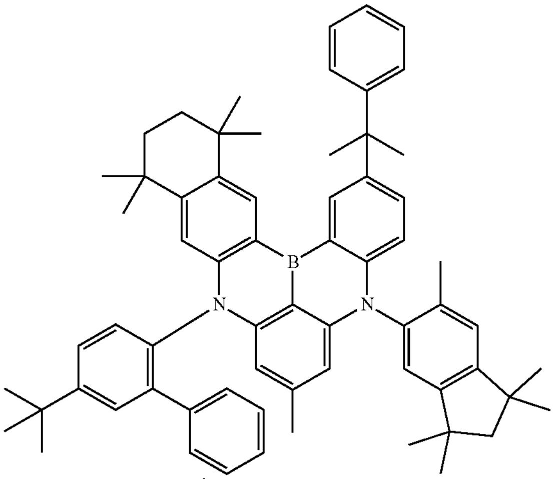
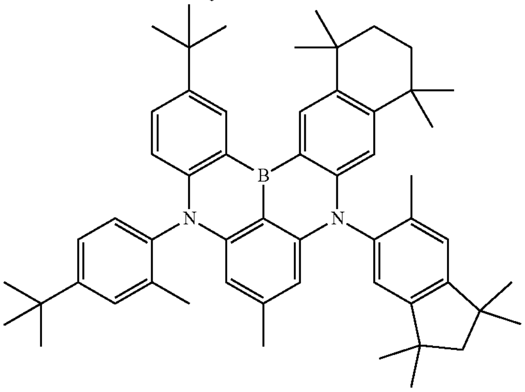
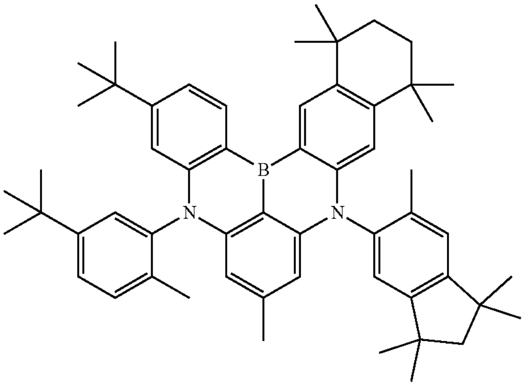
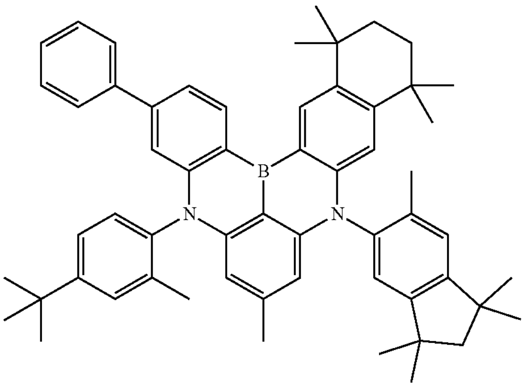
-continued
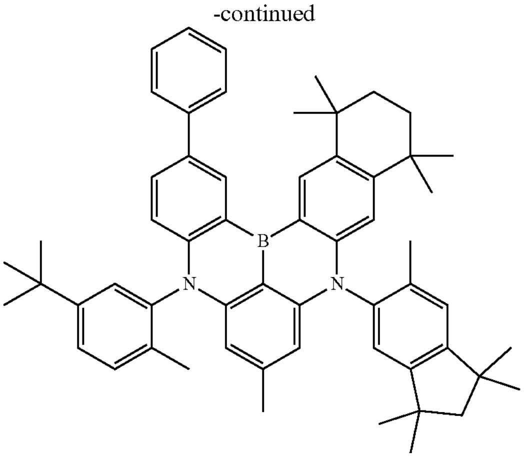
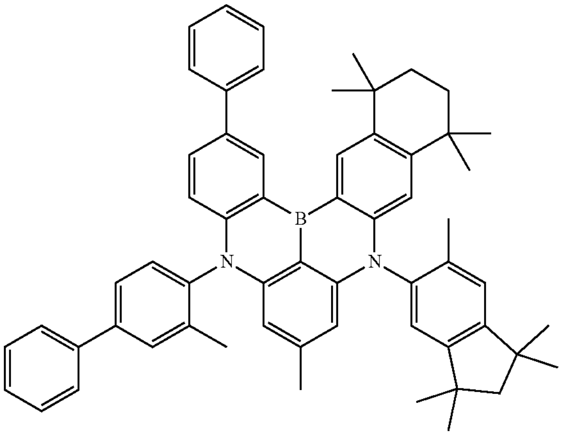
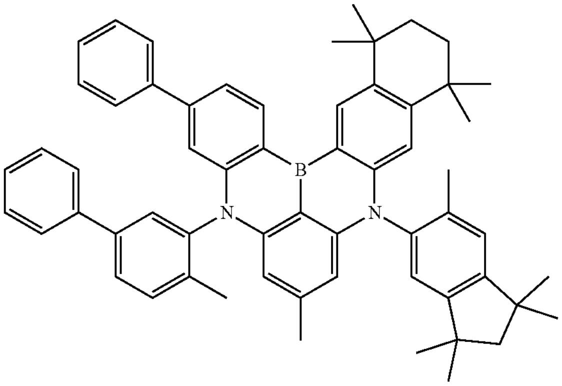
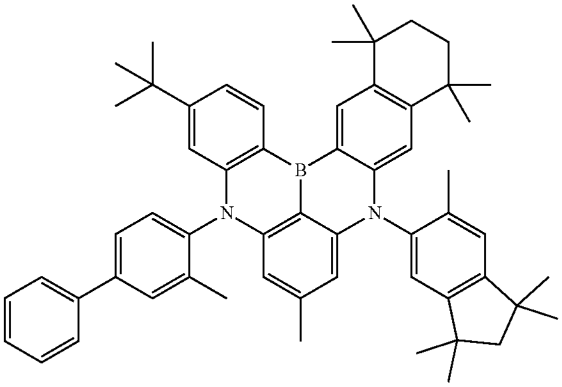

-continued
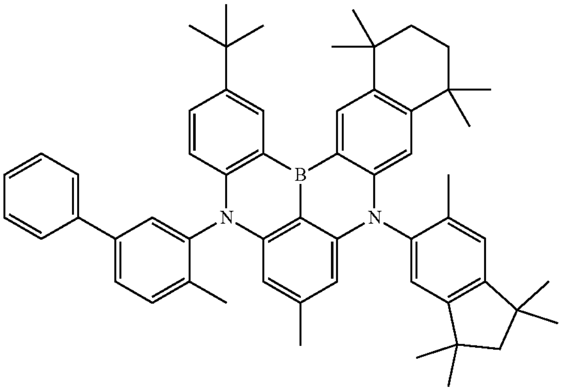
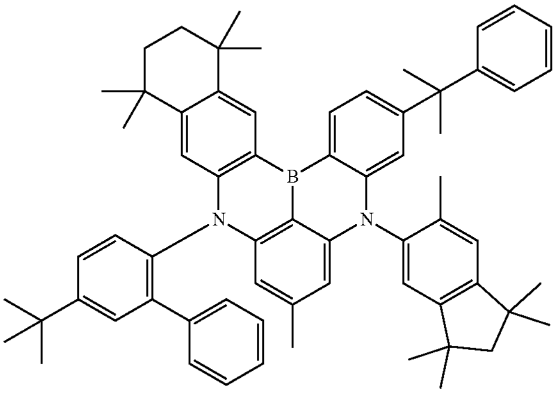
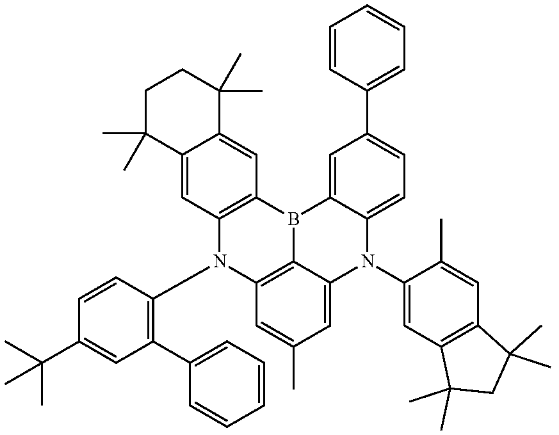
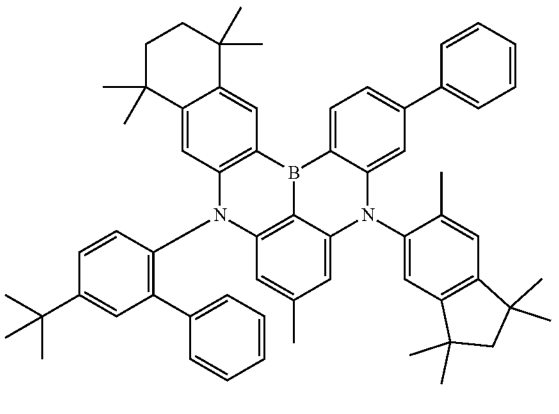
-continued
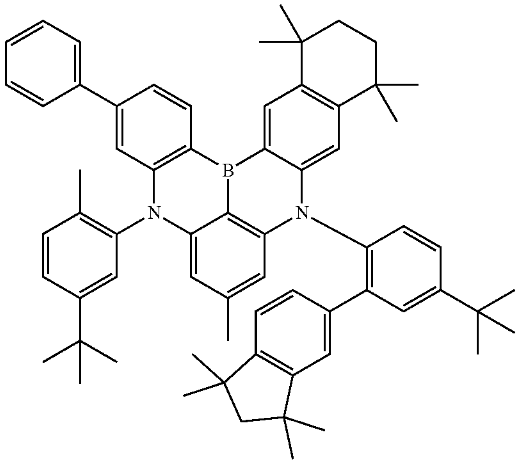
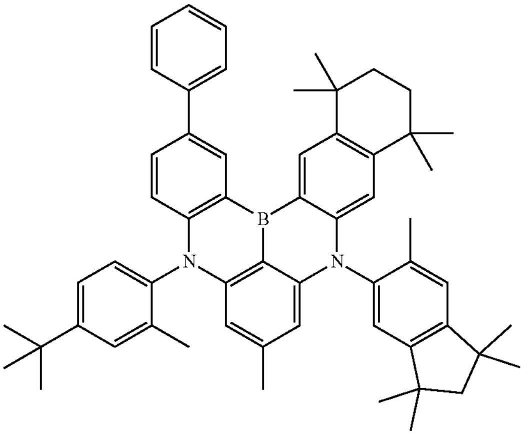
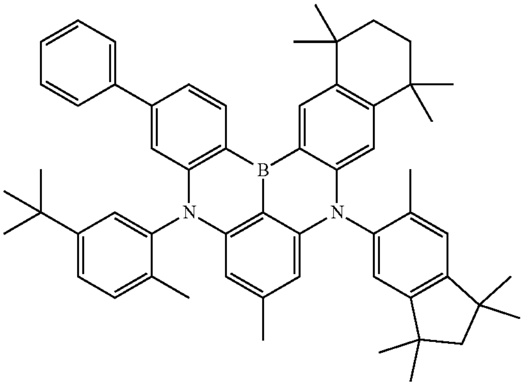
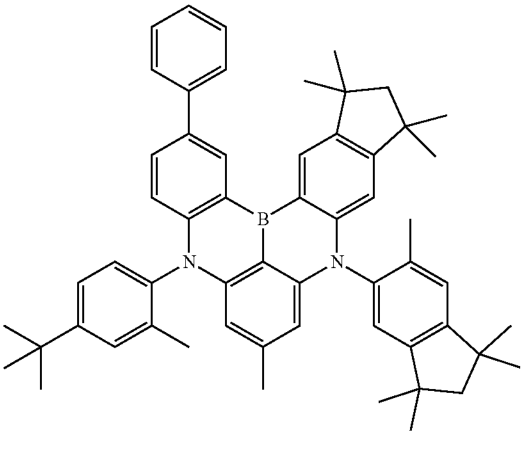

-continued
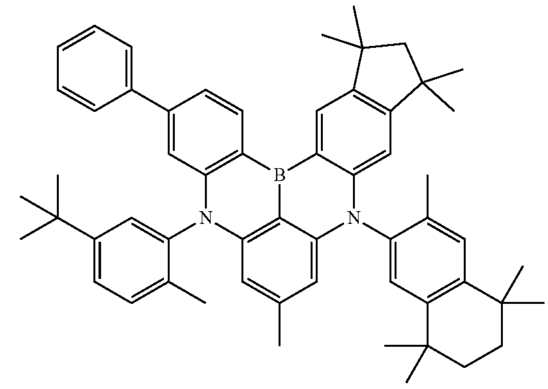
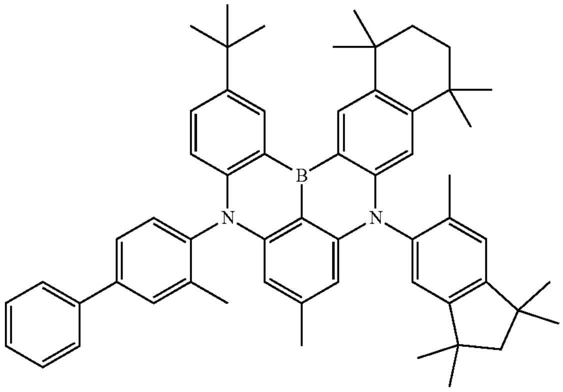
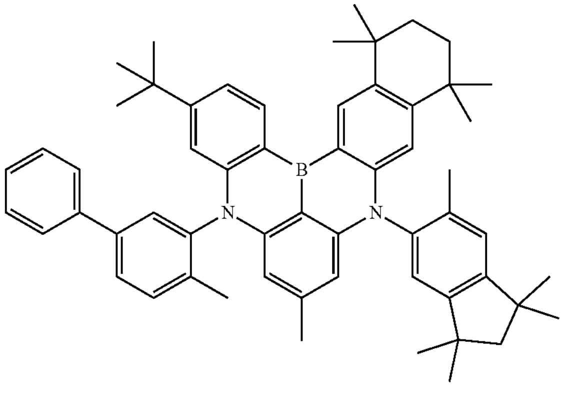
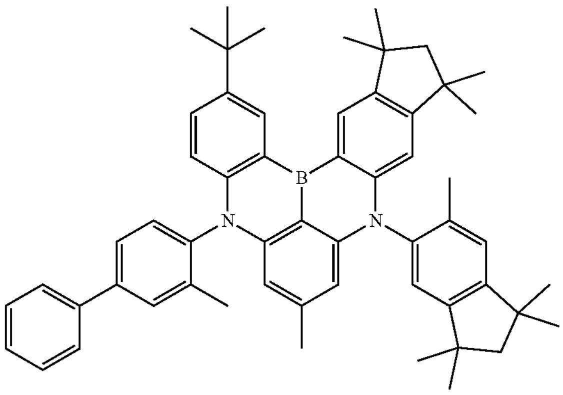
-continued
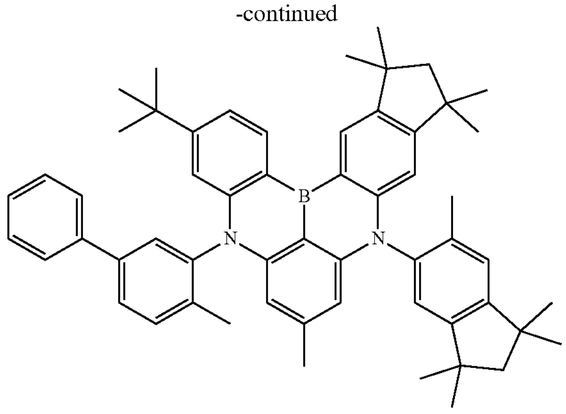
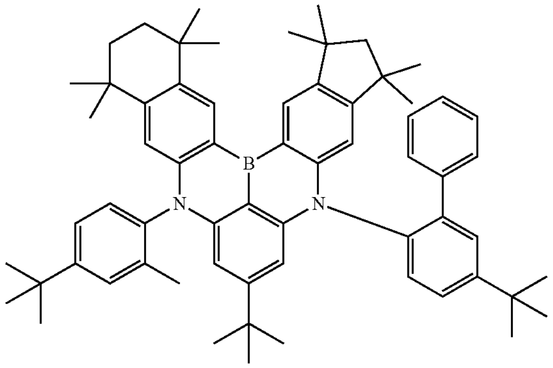
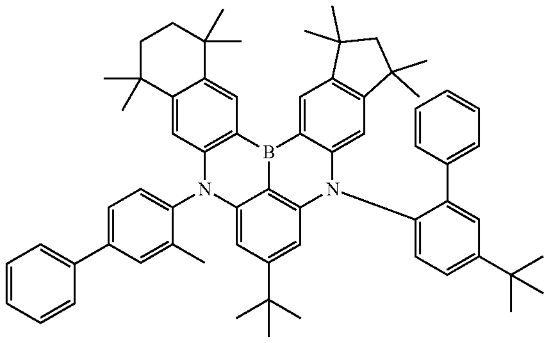
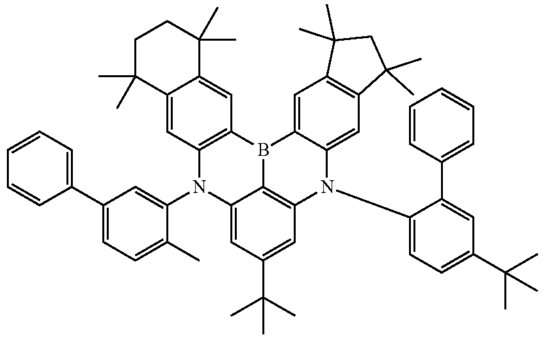

-continued
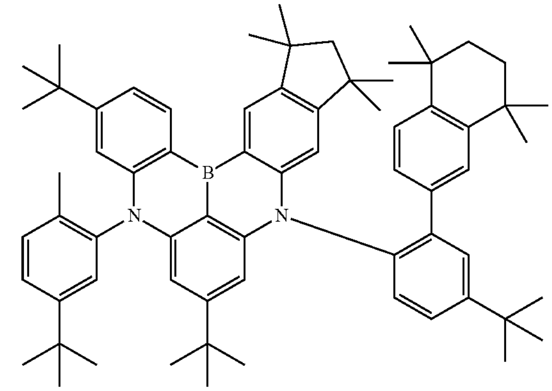
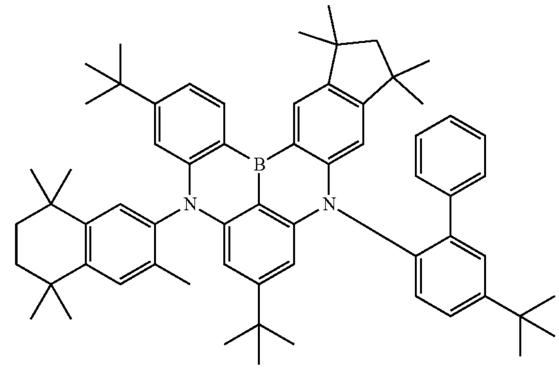
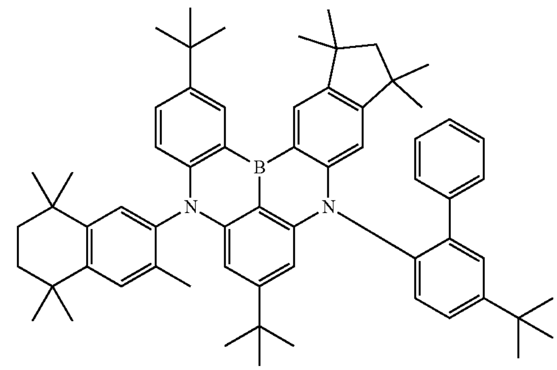
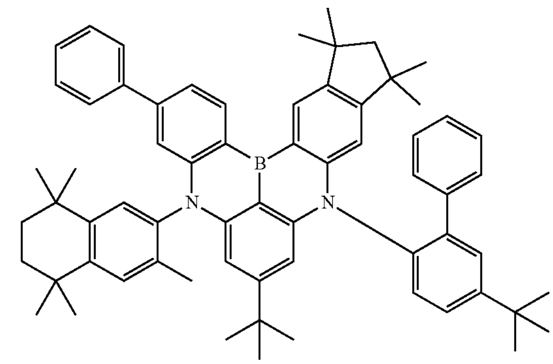
-continued
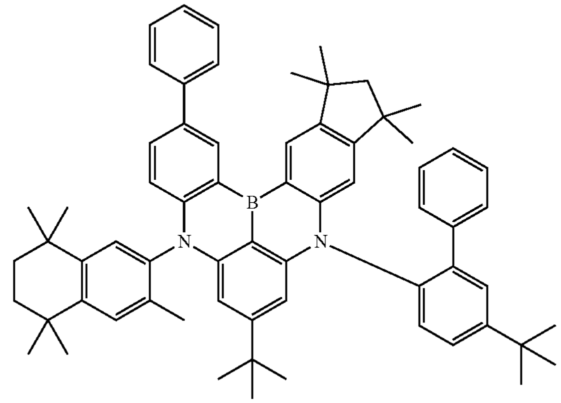
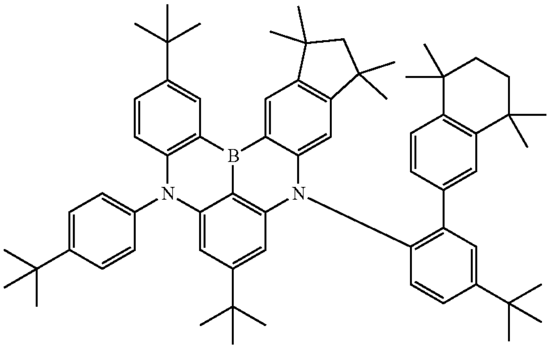
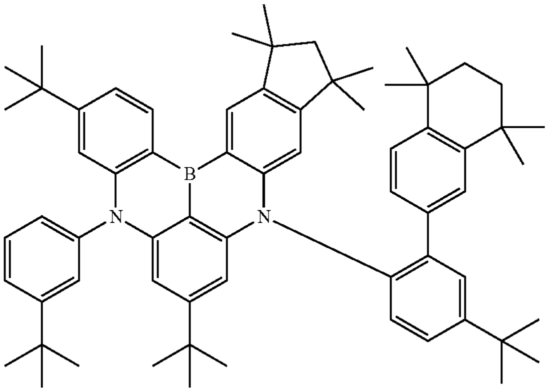
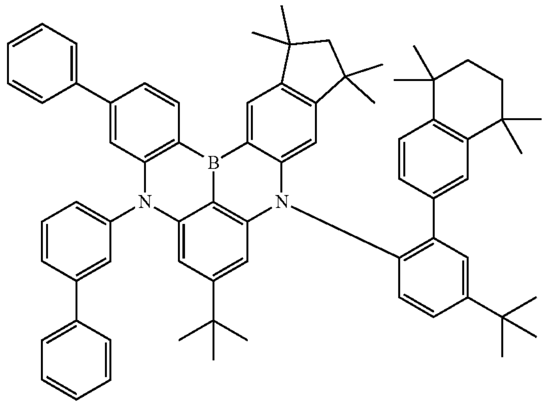

-continued
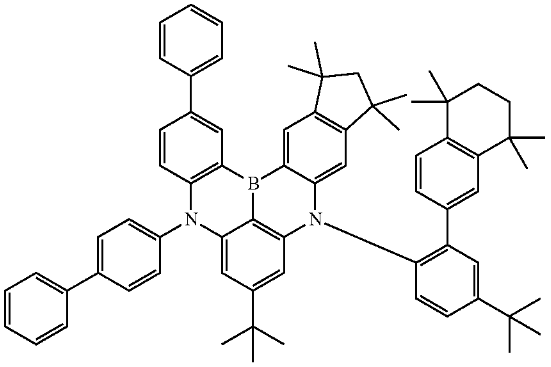
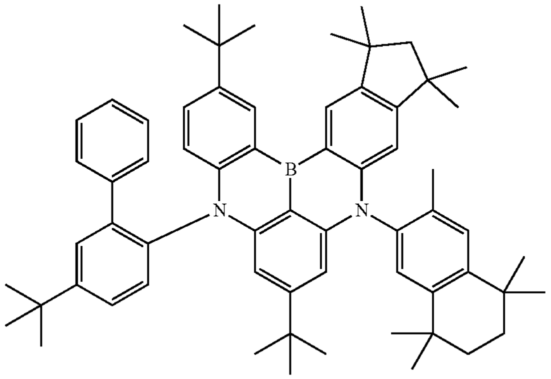
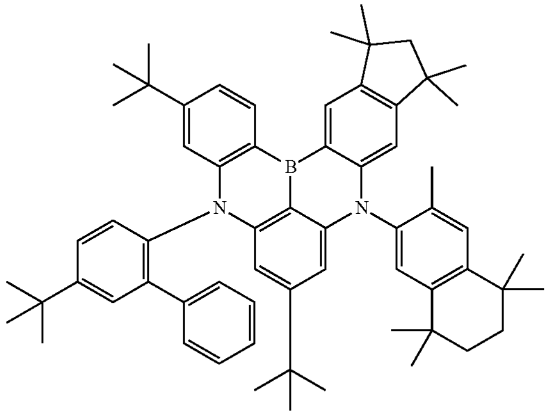
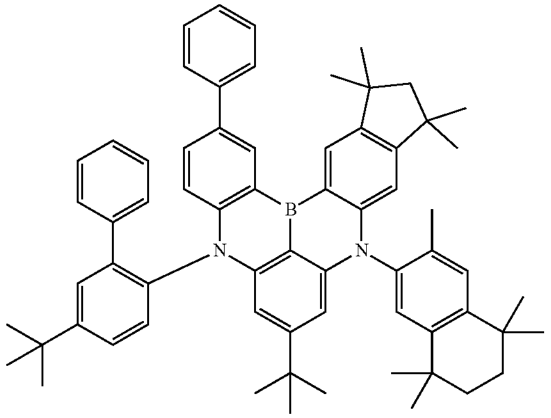
-continued
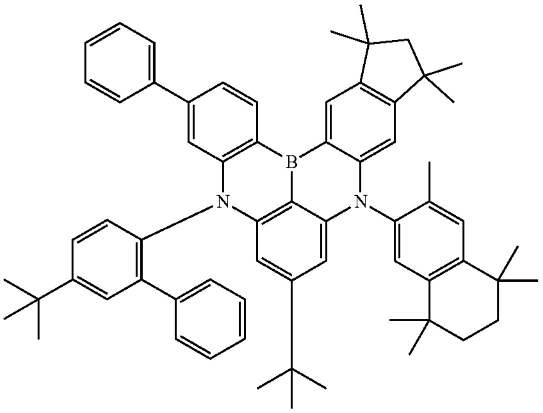
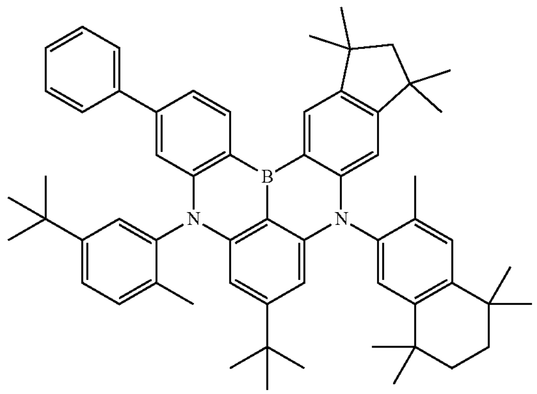
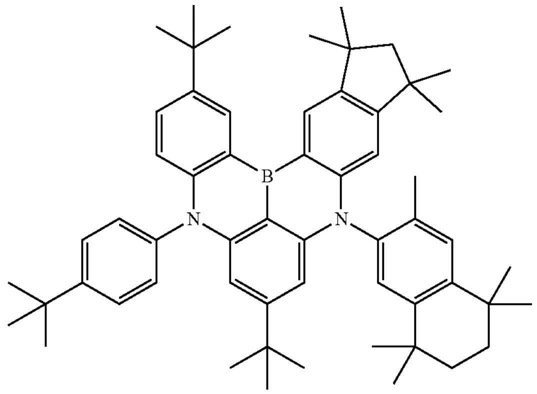
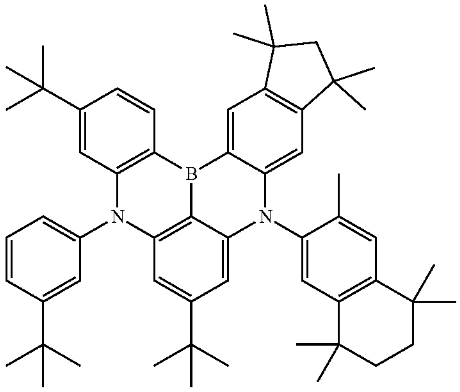

-continued
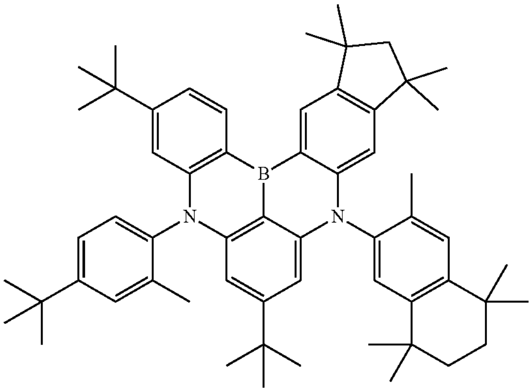
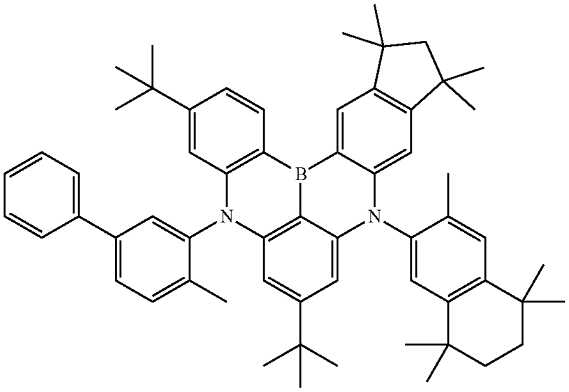
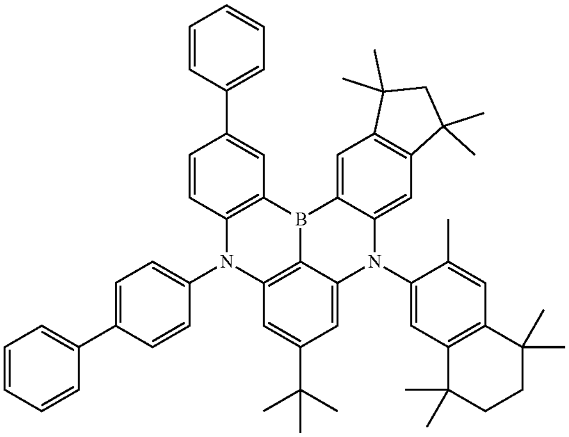
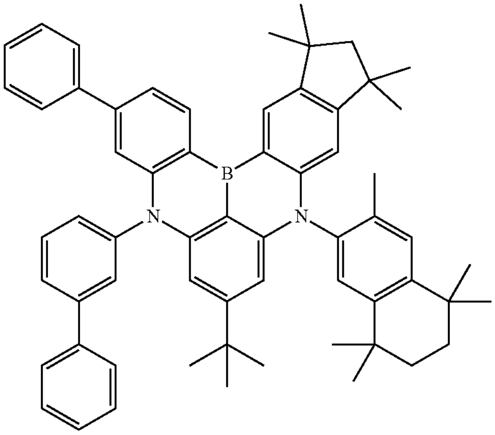
-continued
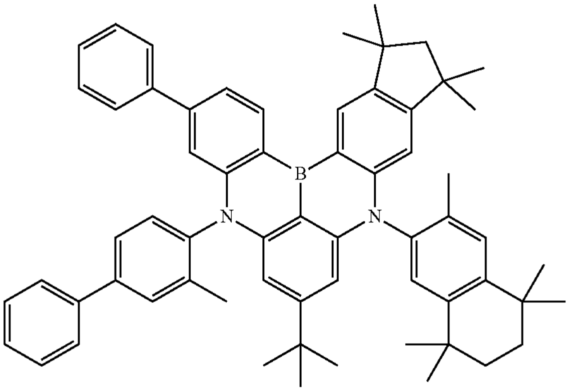
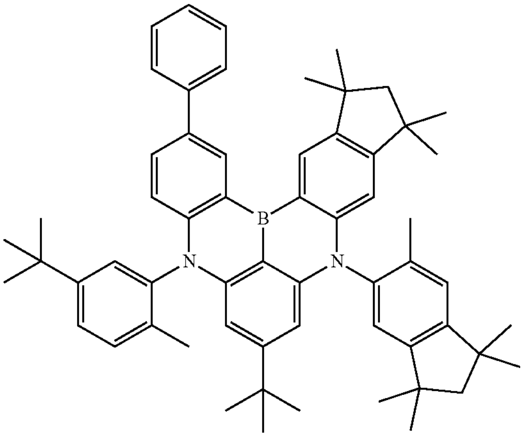
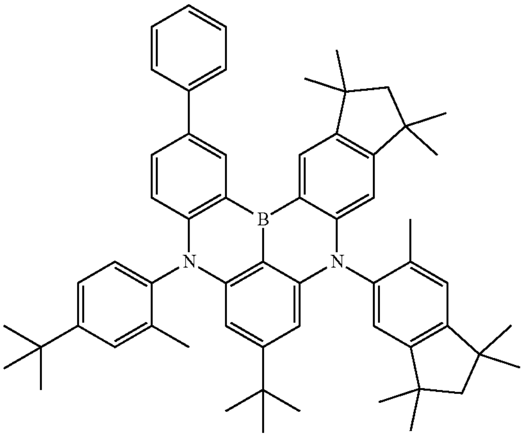
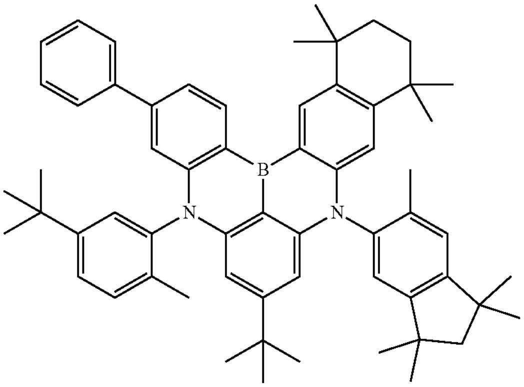

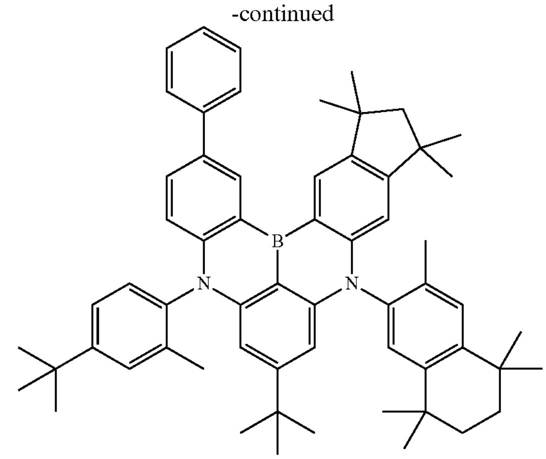
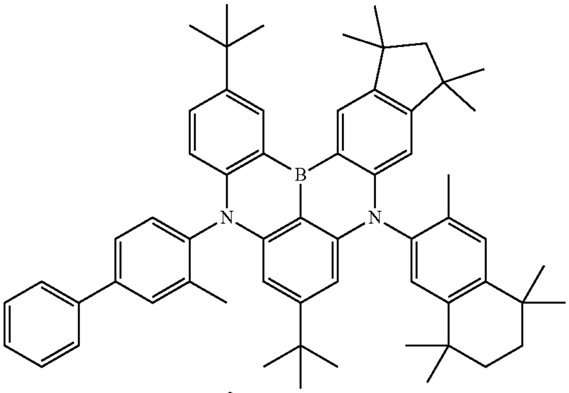
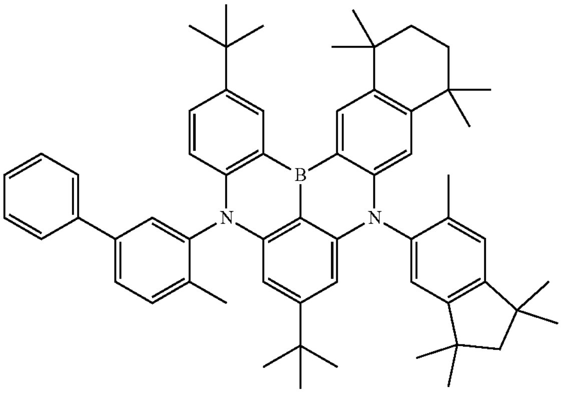
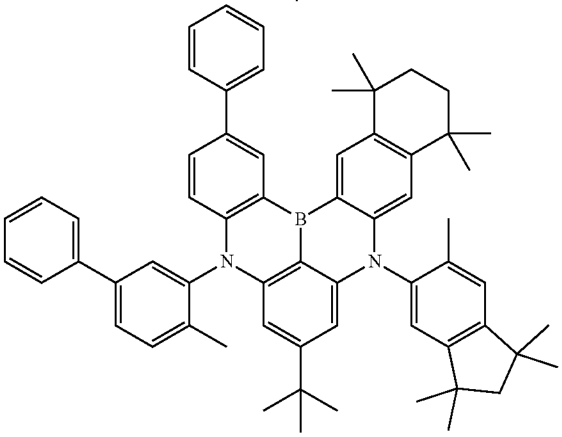
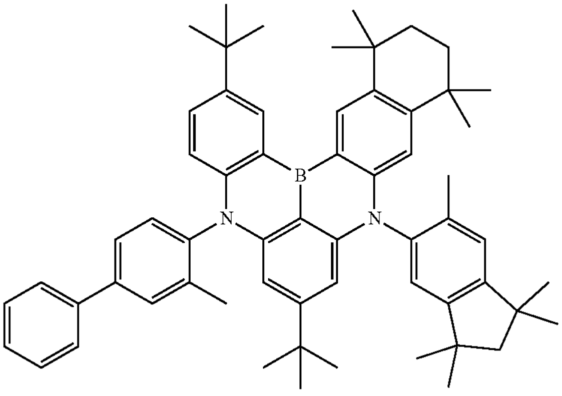
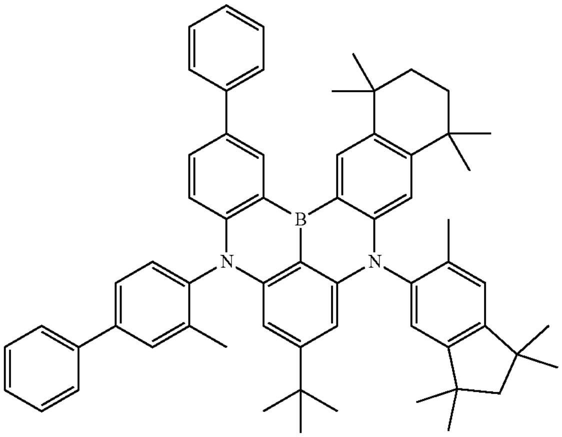
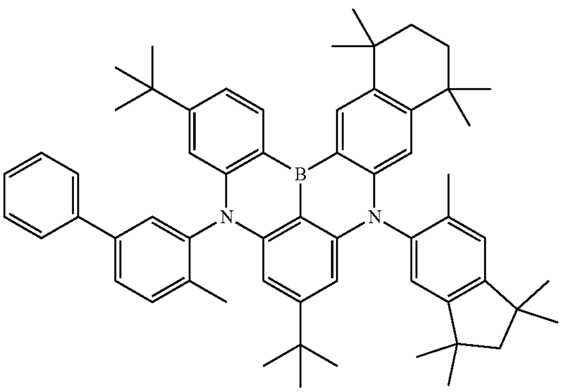
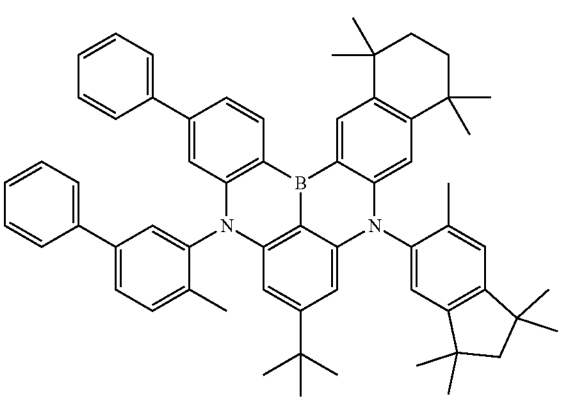

-continued
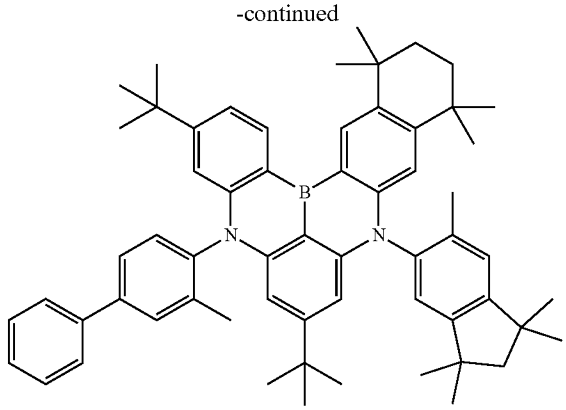
-continued
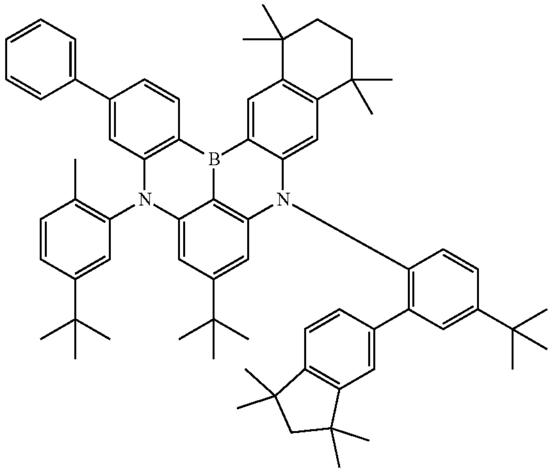
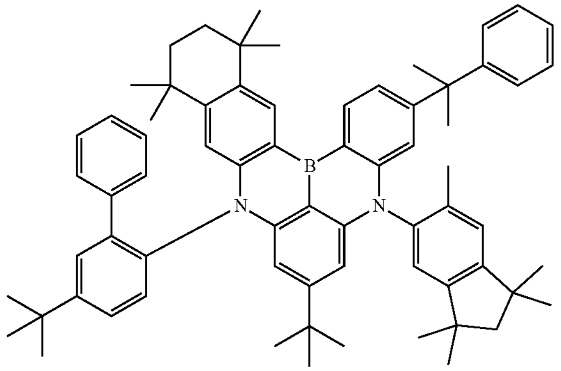
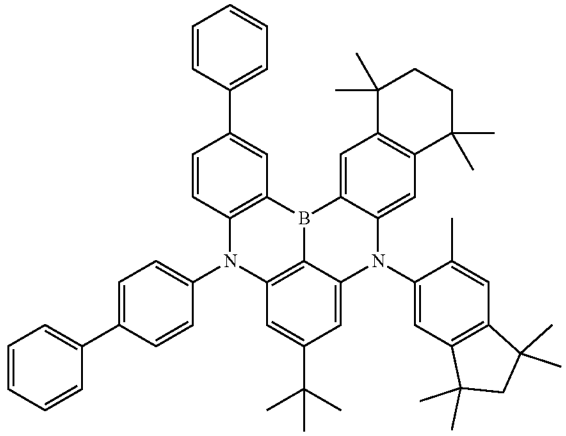
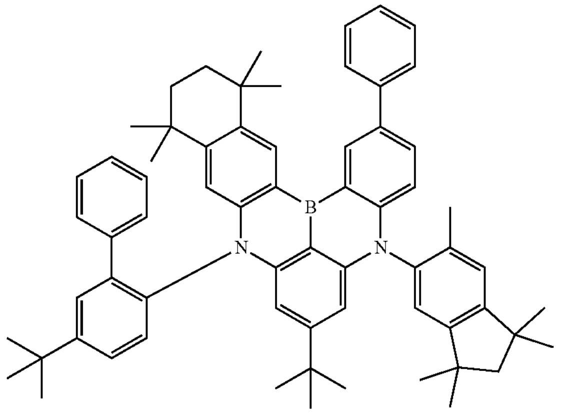
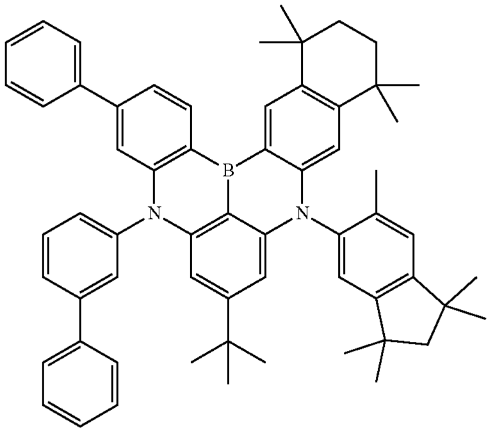
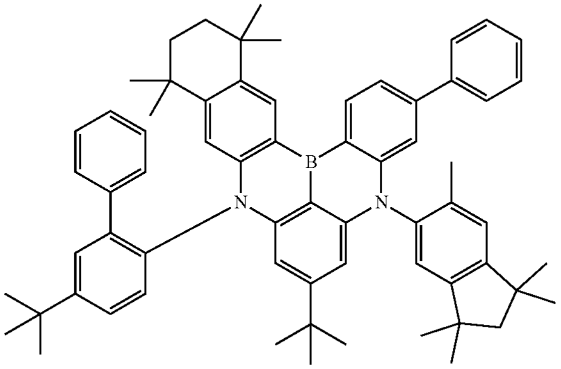
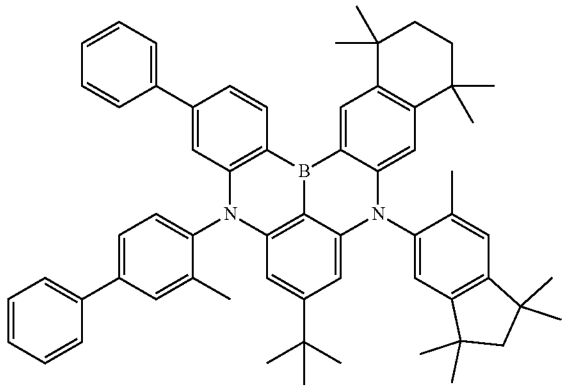

-continued
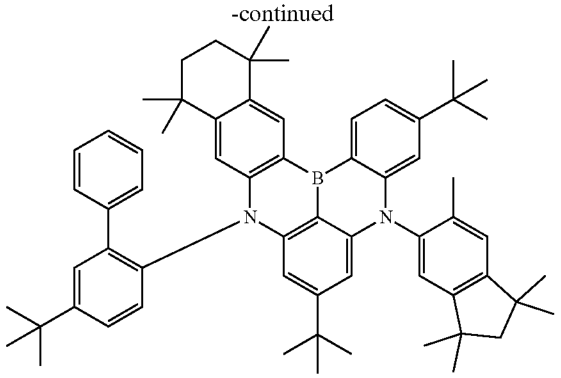
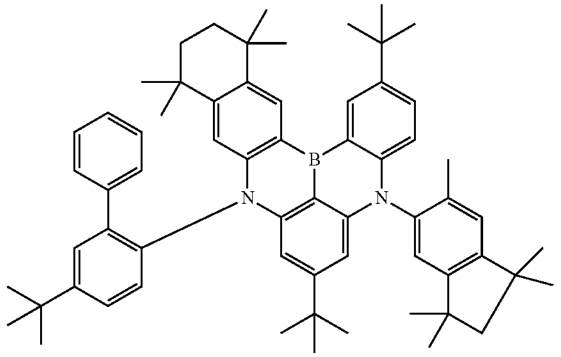
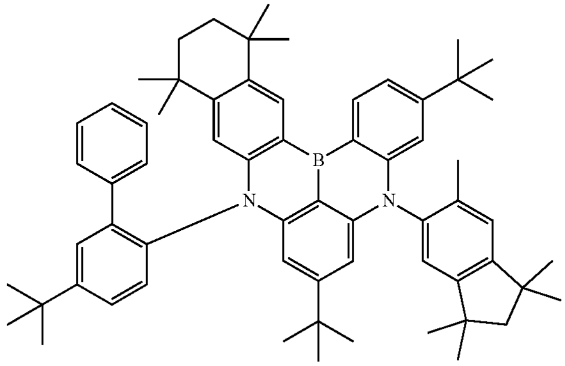
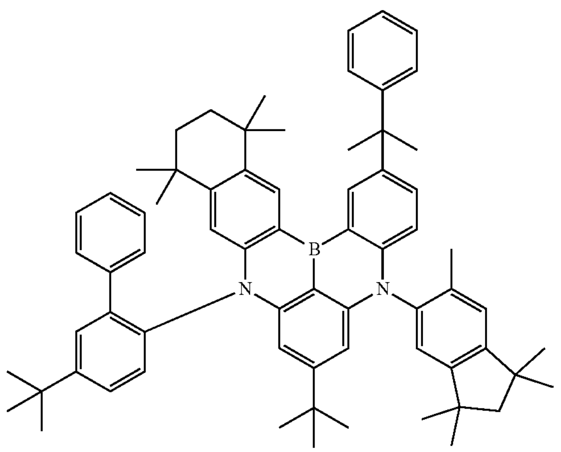
-continued
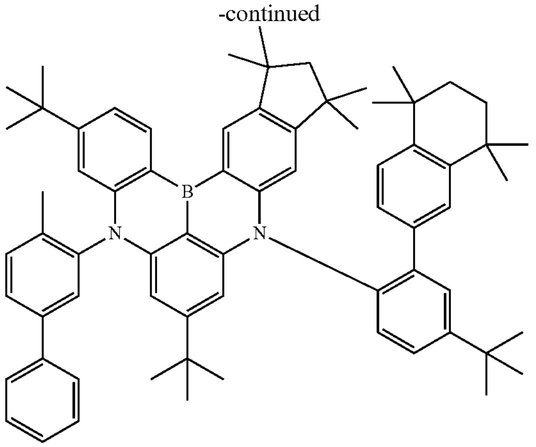
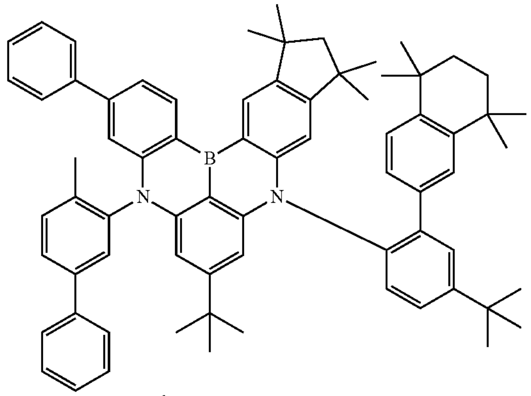
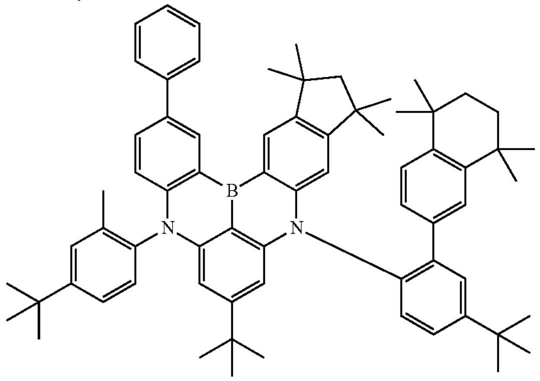
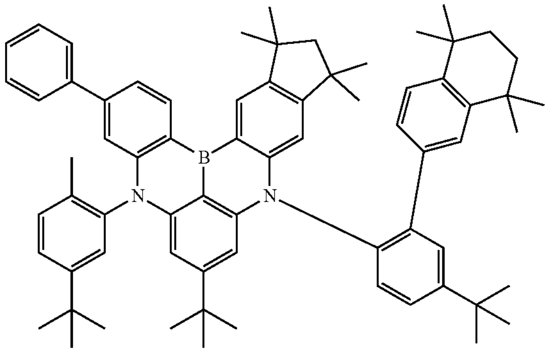

-continued
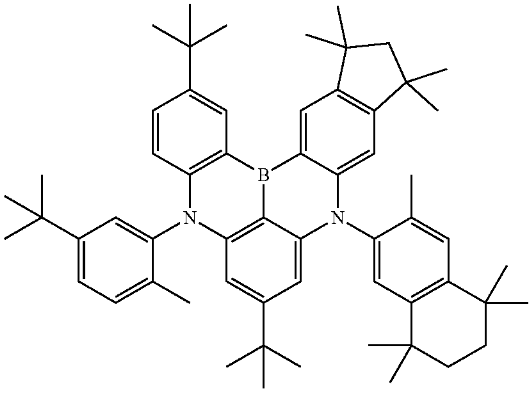
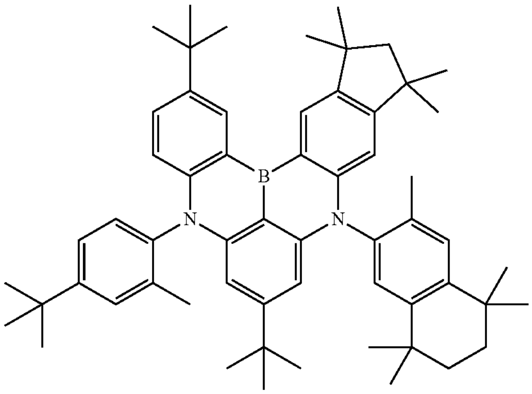
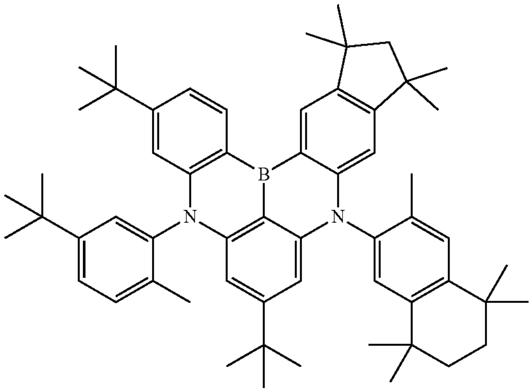
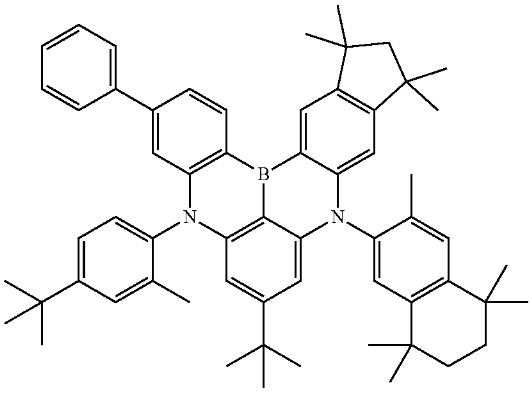
-continued
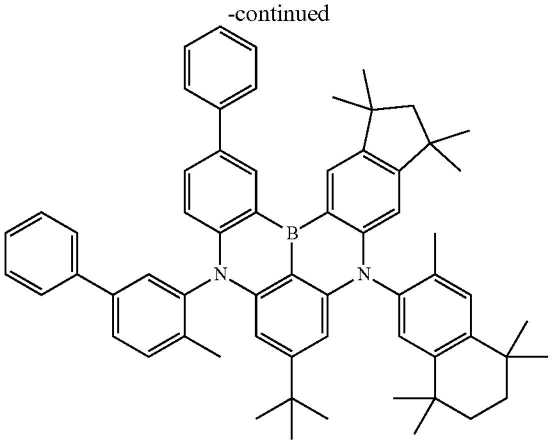
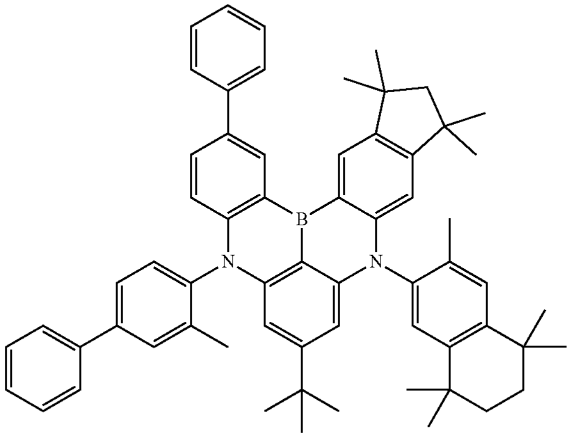
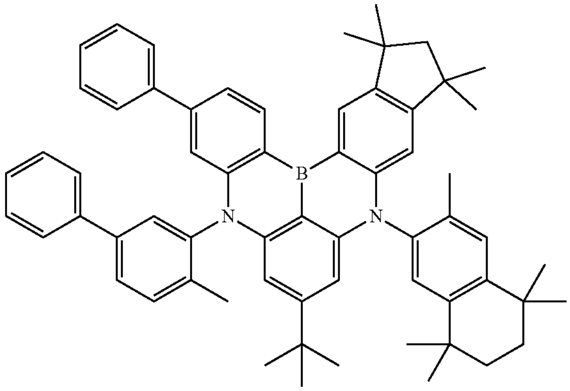
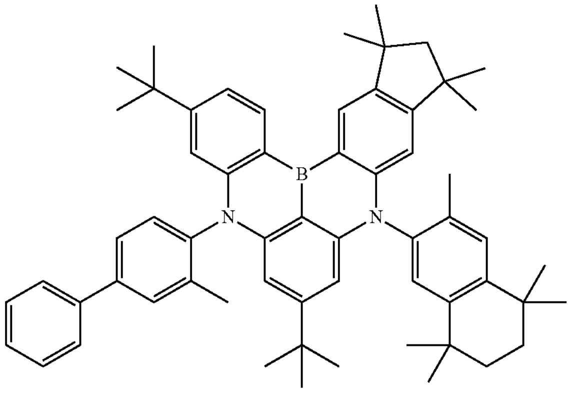

-continued
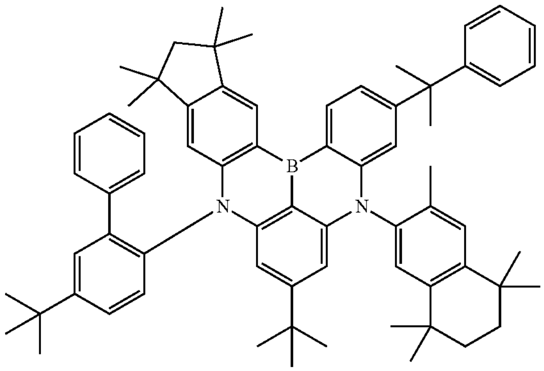
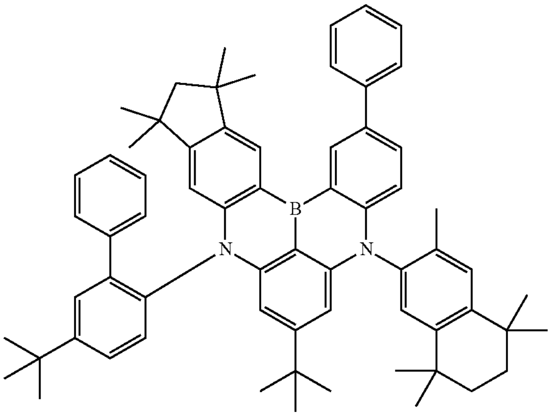
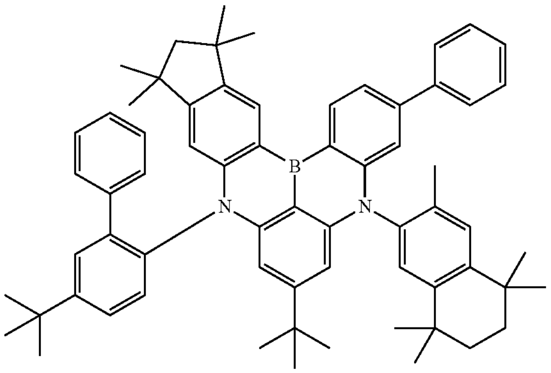
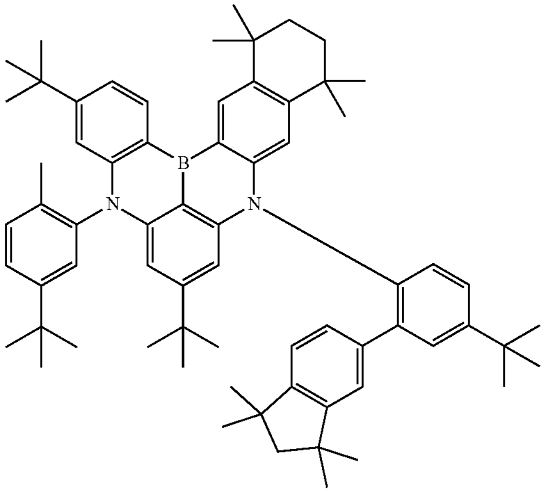
-continued
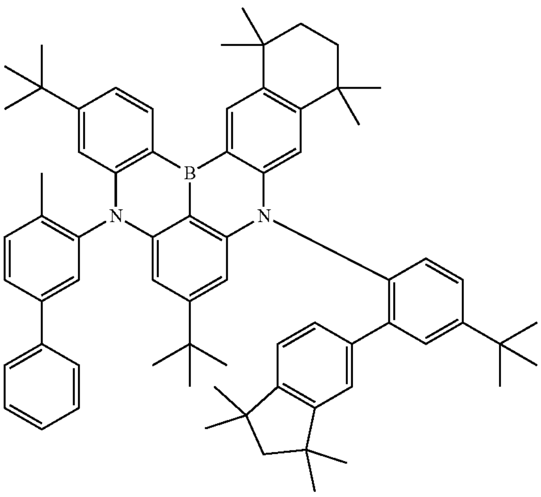
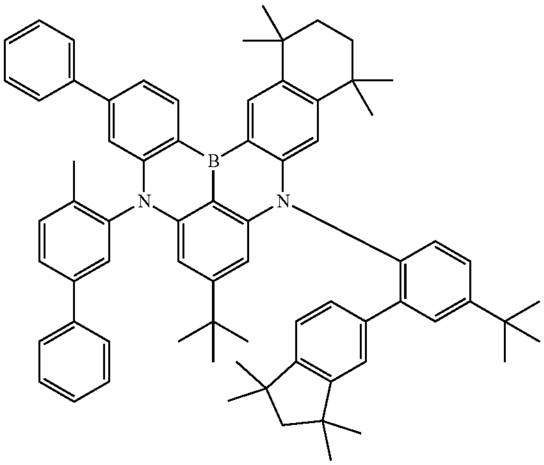
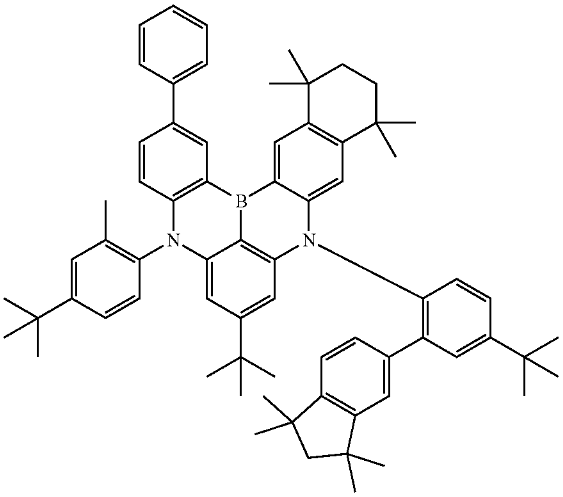

-continued
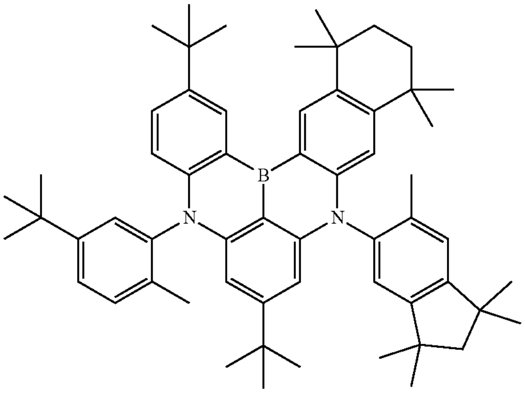
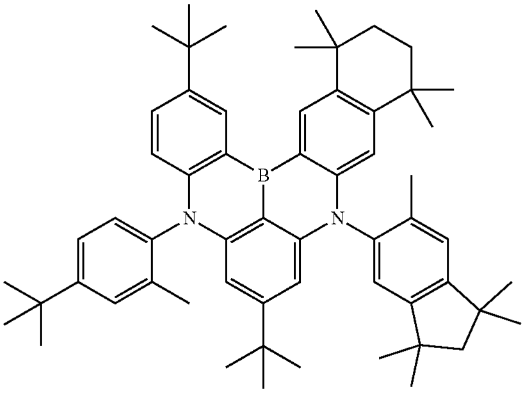
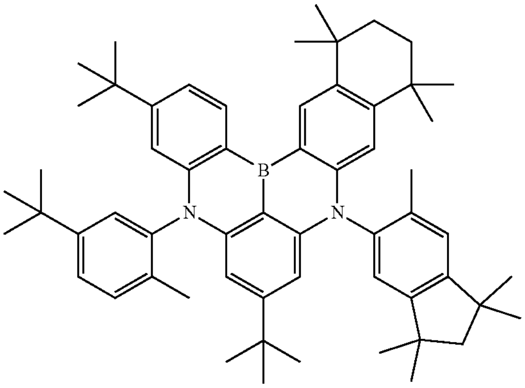
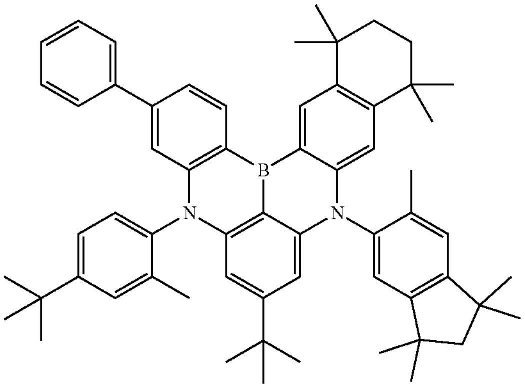
-continued
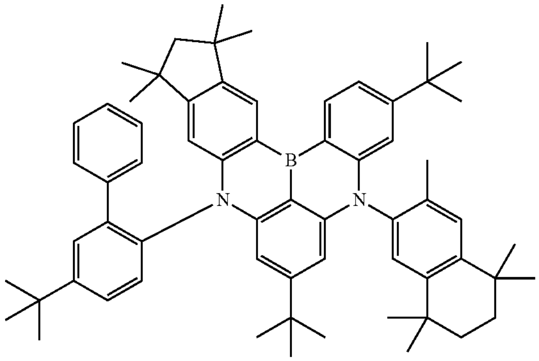
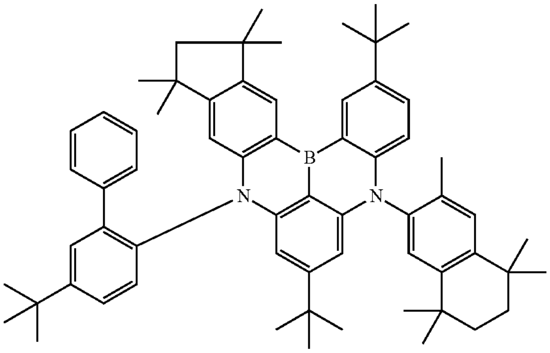
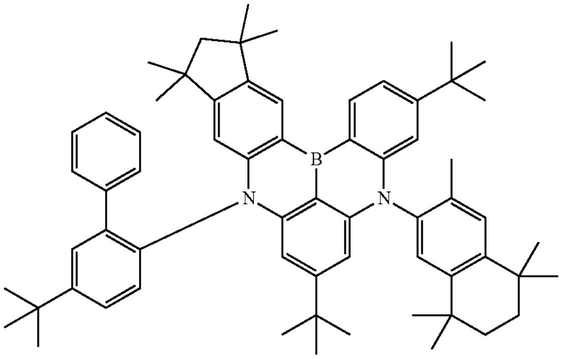
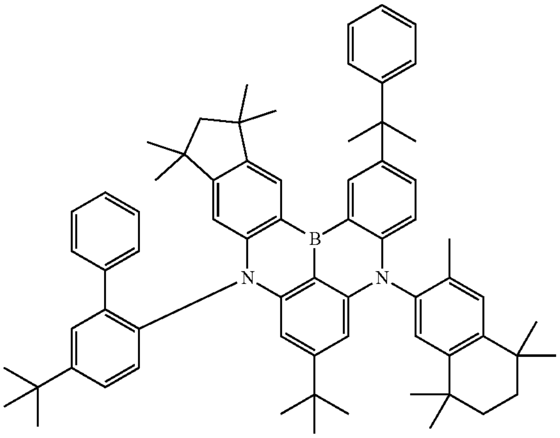

-continued
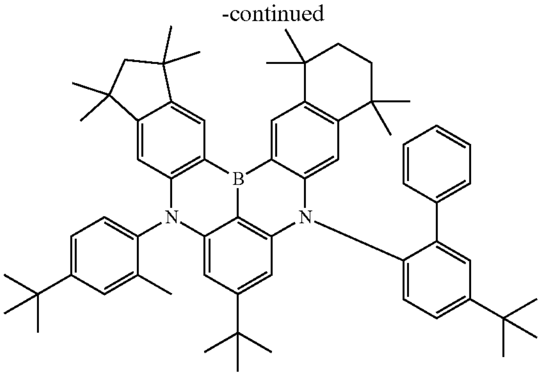
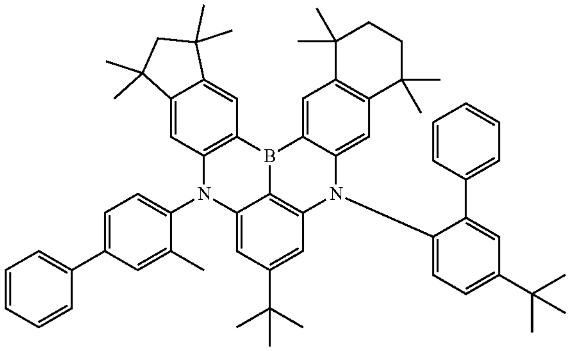
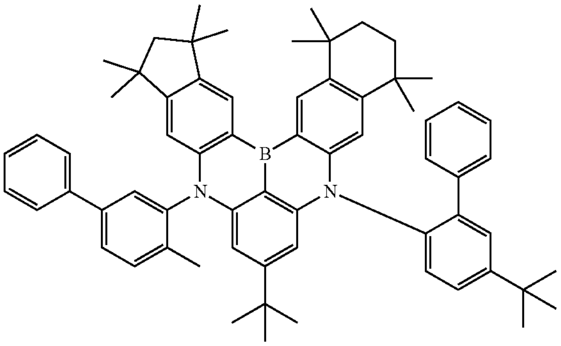
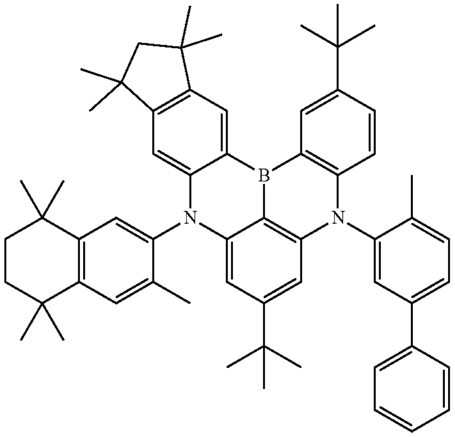
-continued
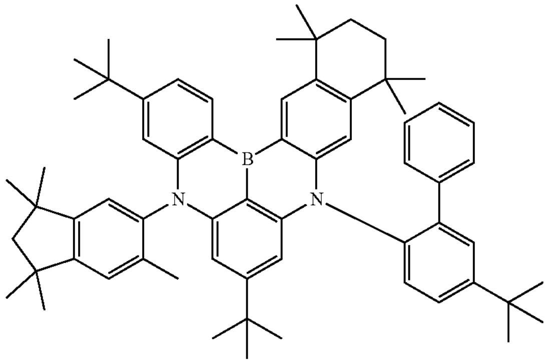
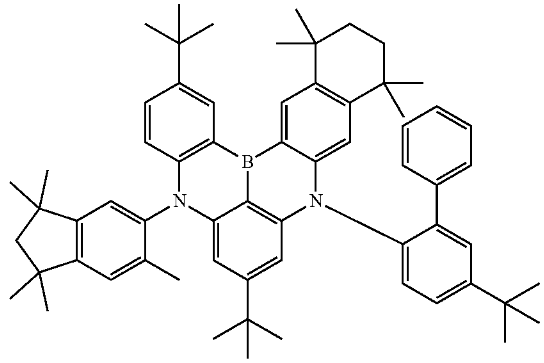
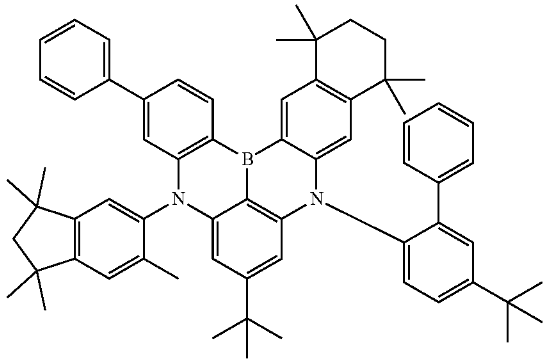
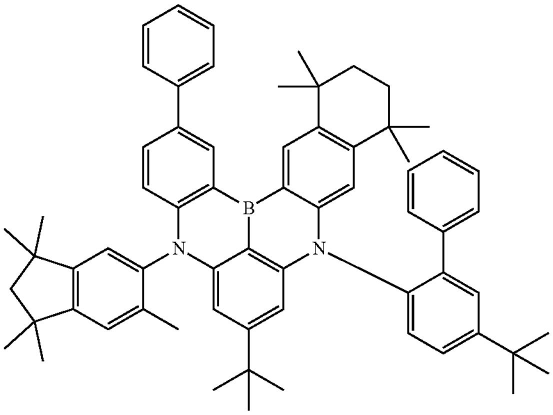

-continued
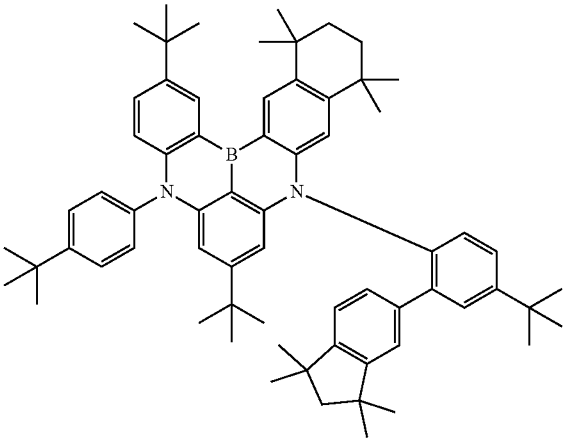
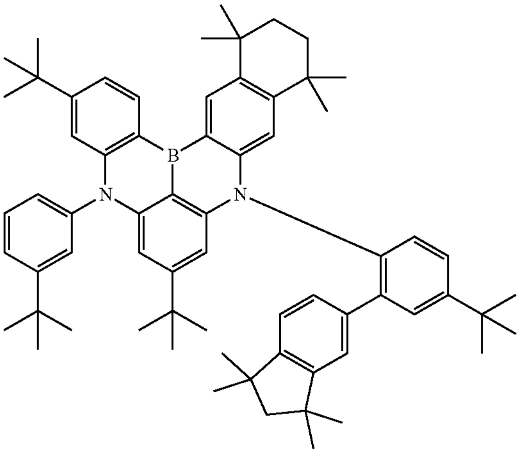
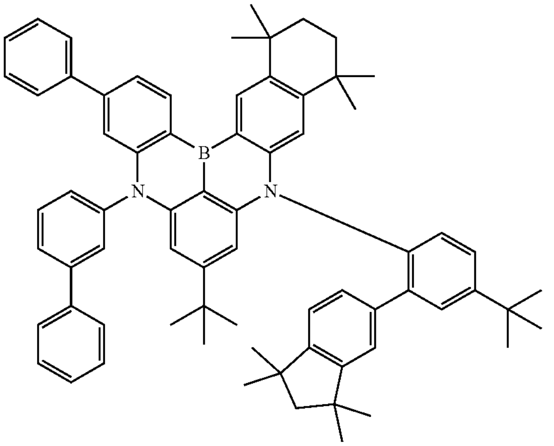
-continued
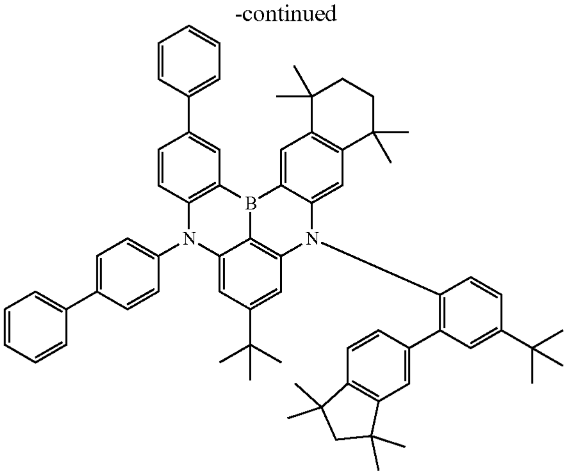
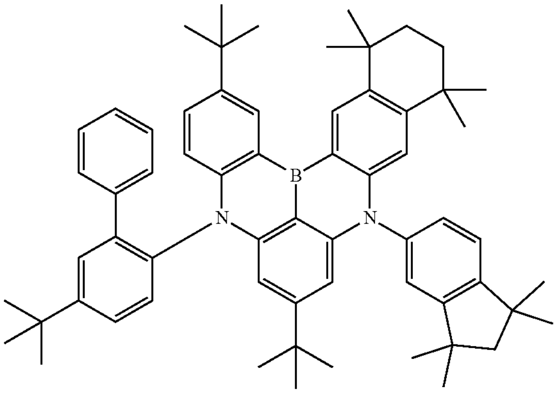
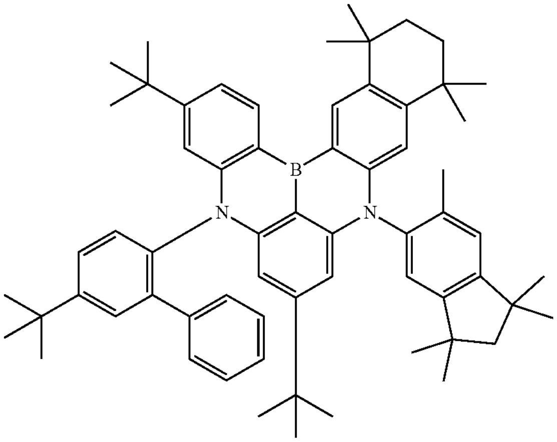
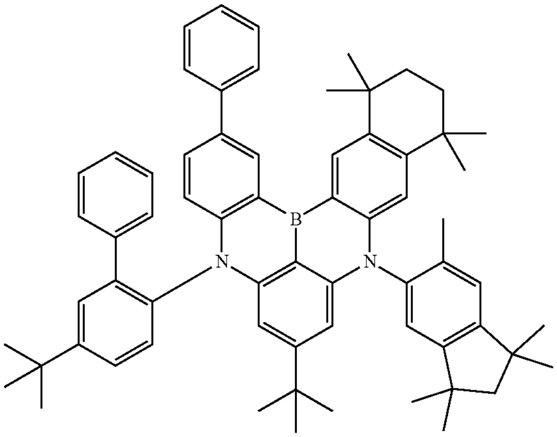

-continued
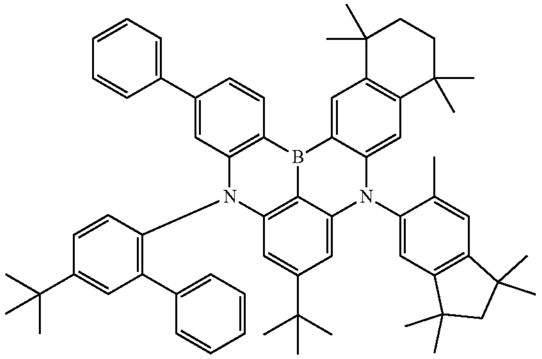
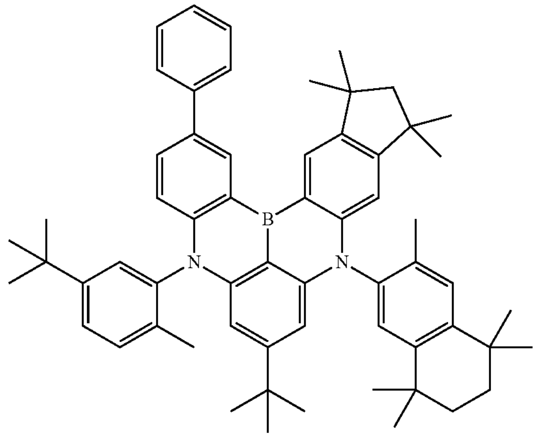
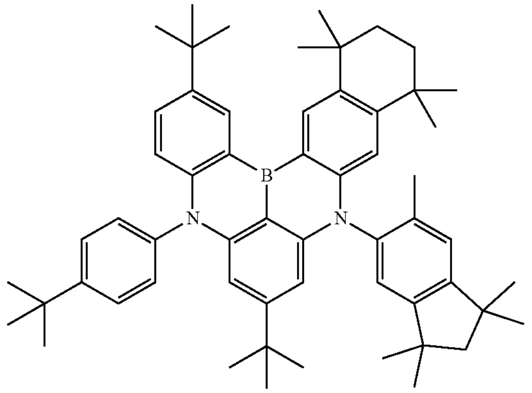
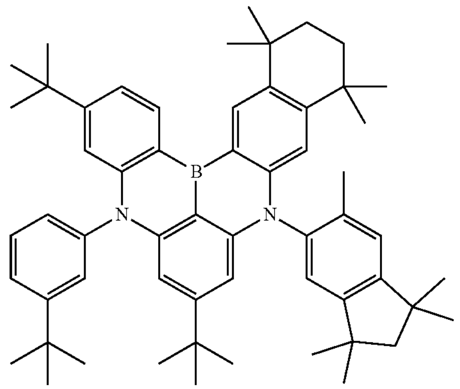
-continued
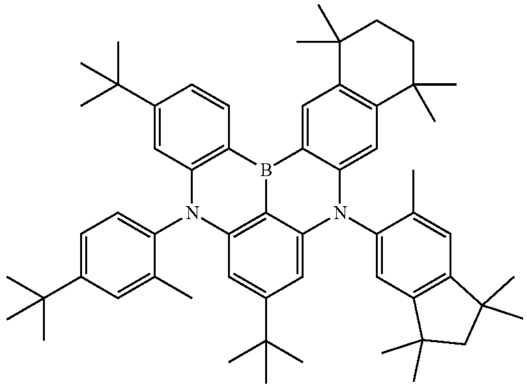
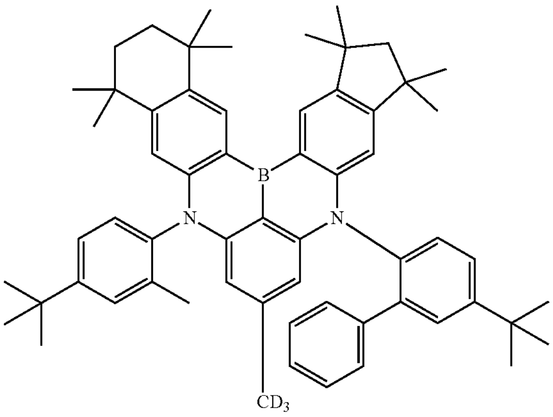
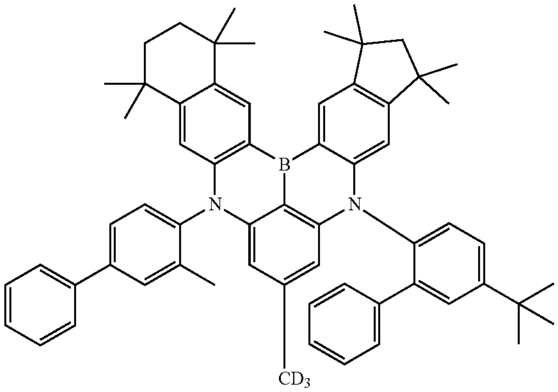
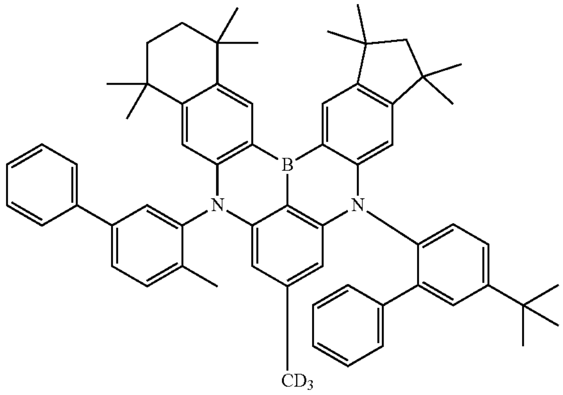

-continued
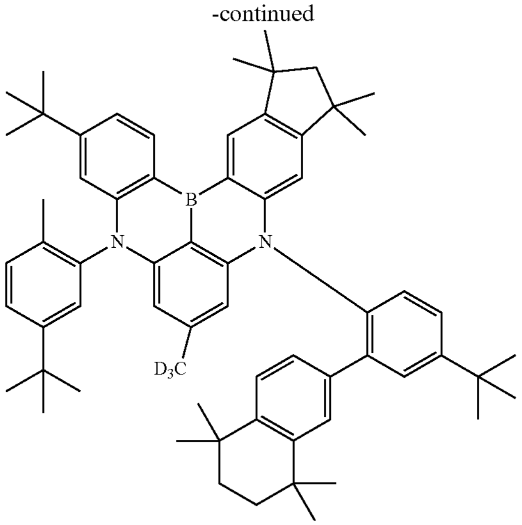
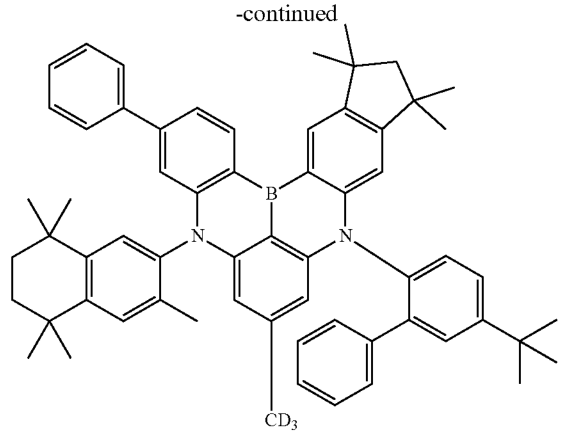
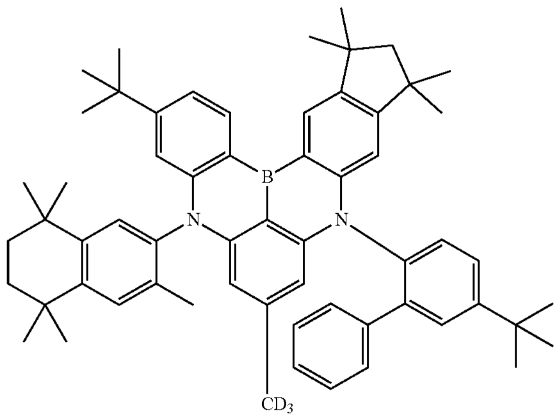
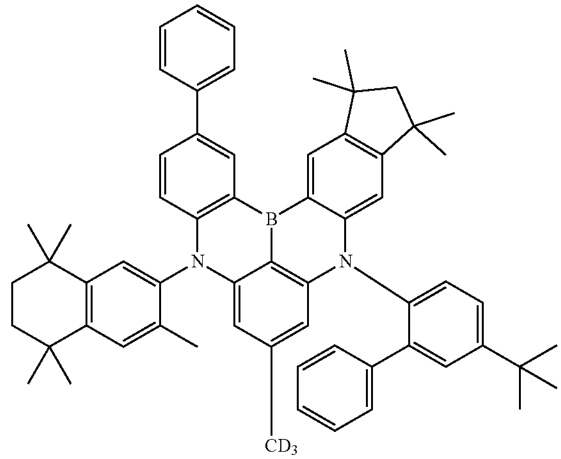
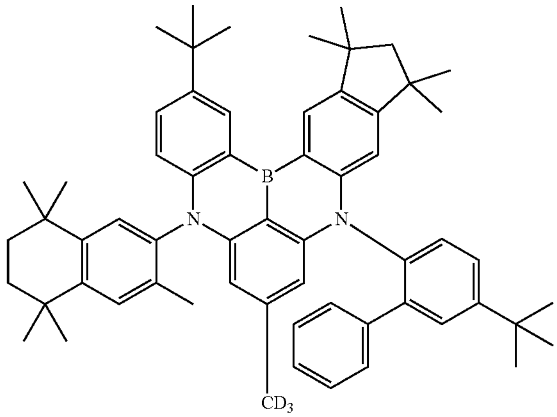
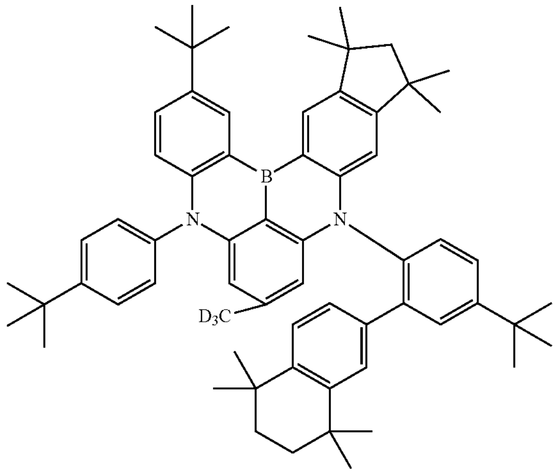

-continued
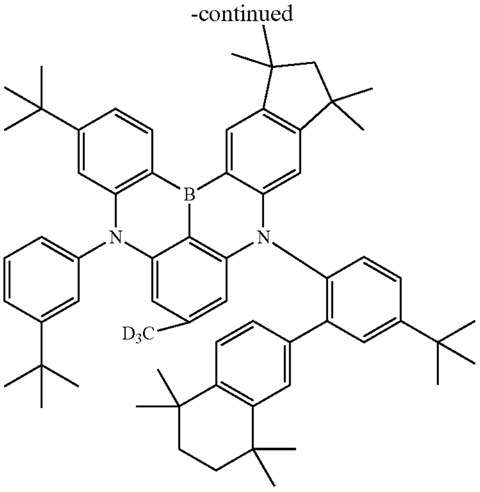
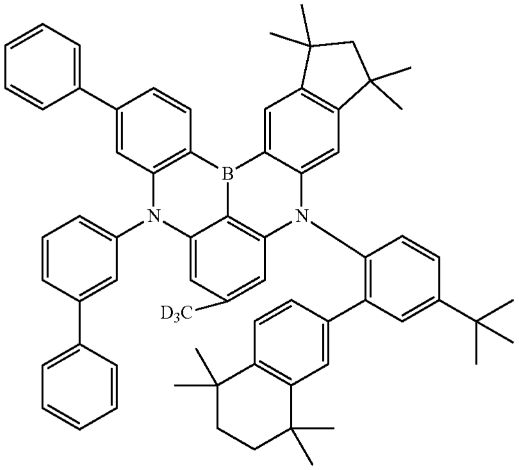
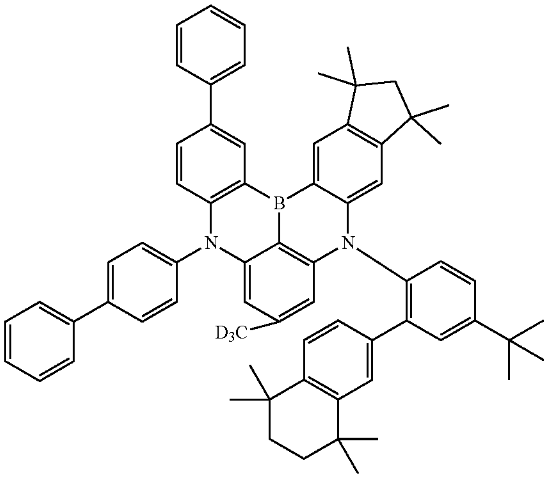
-continued
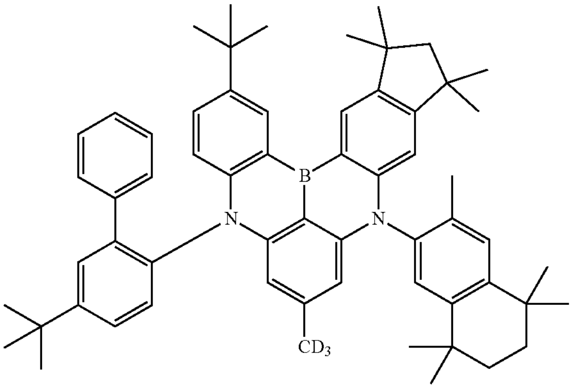
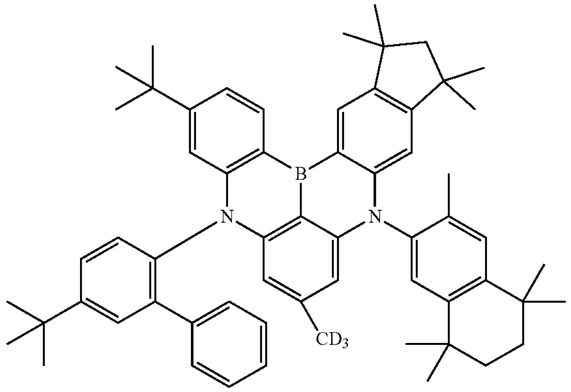
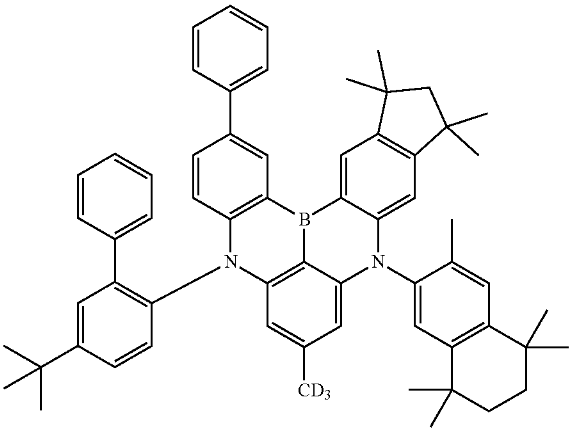
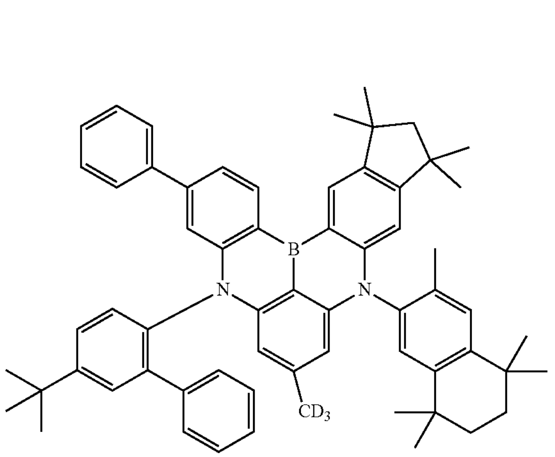

-continued
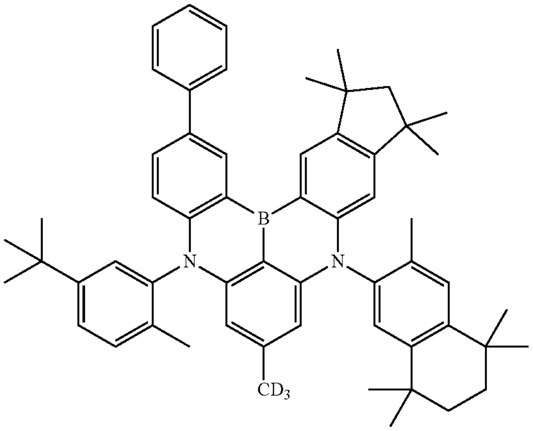
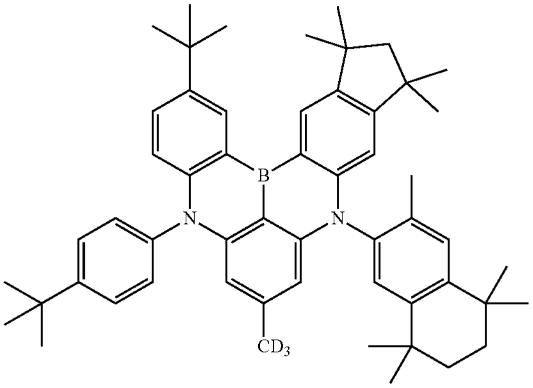
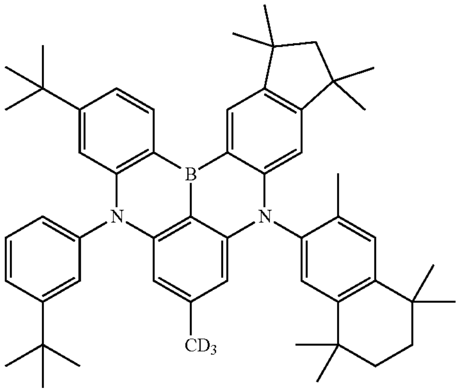
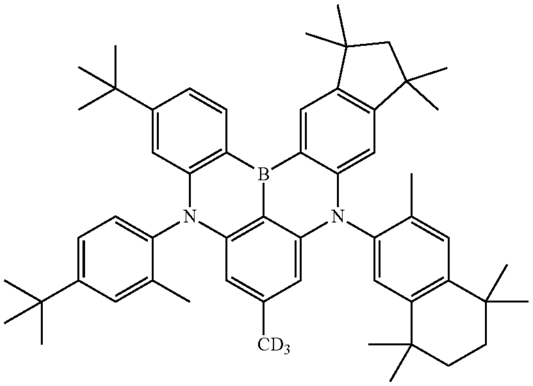
-continued
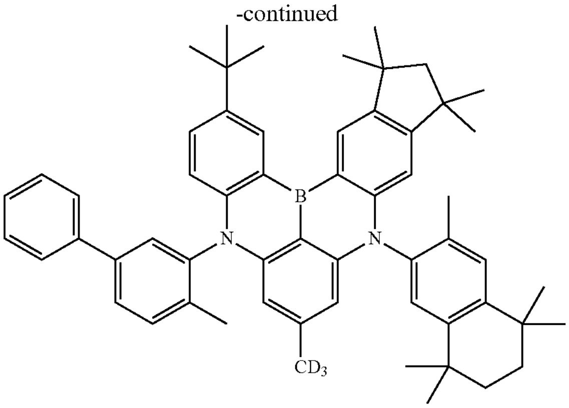
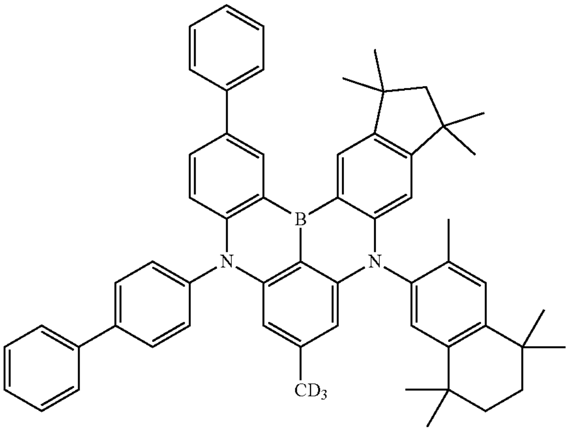
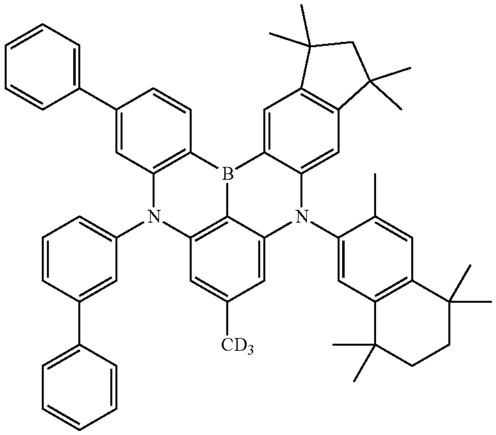
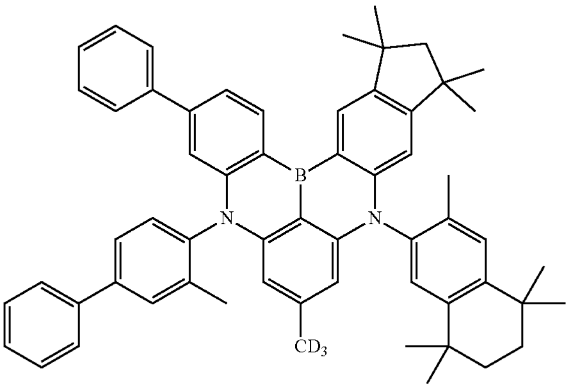

-continued
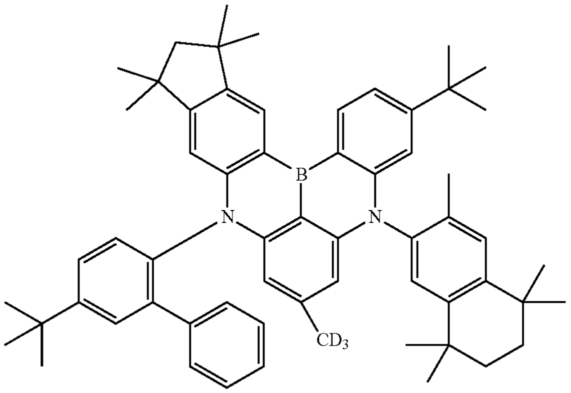
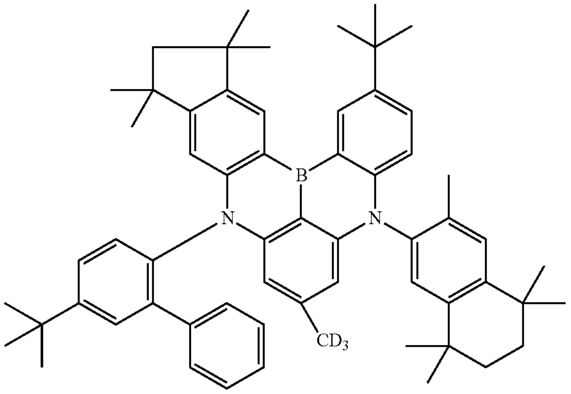
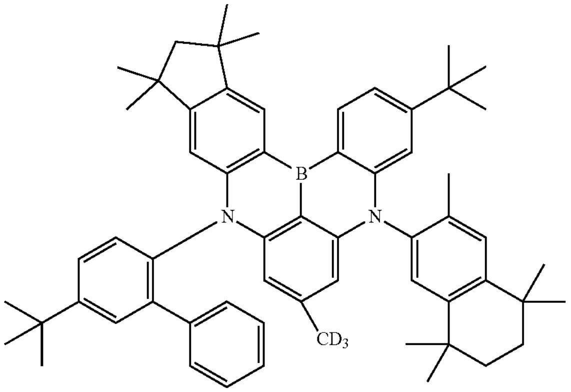
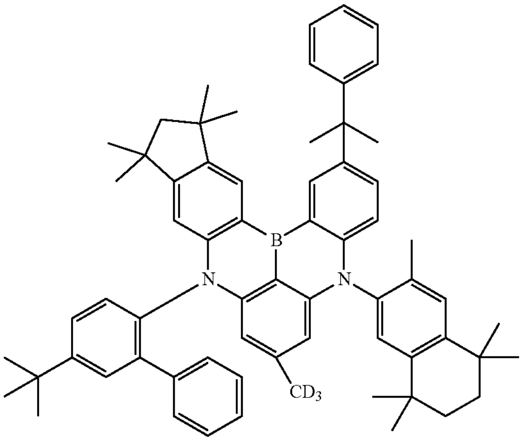
-continued
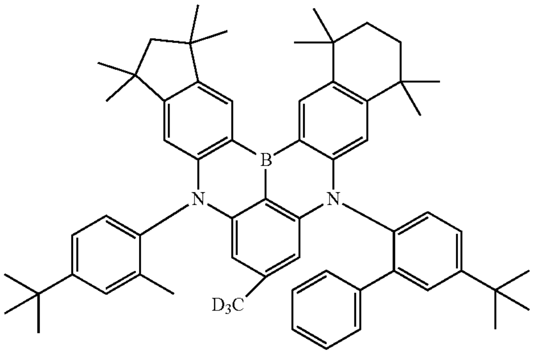
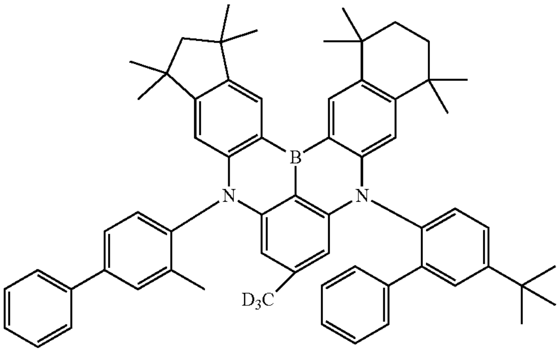
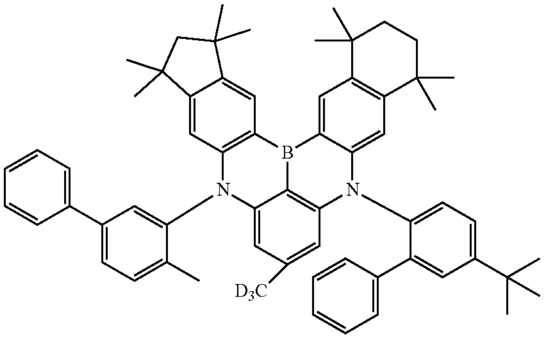
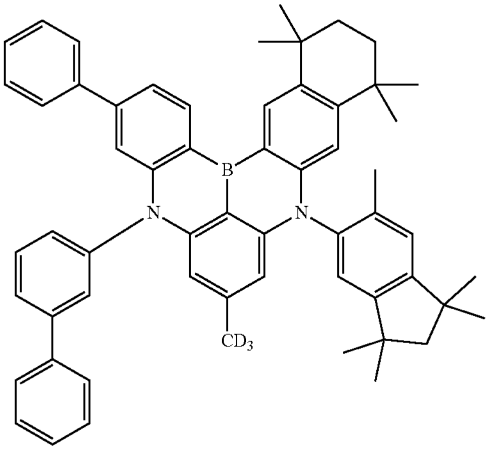

-continued
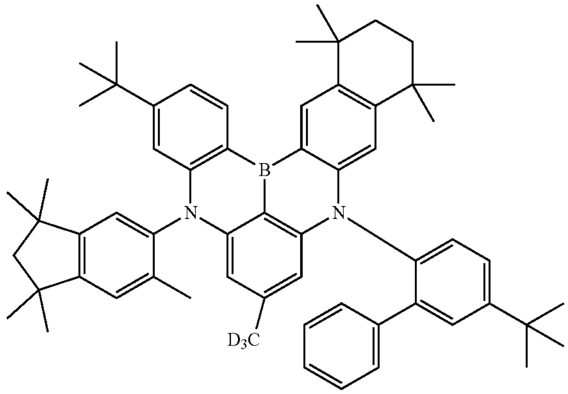
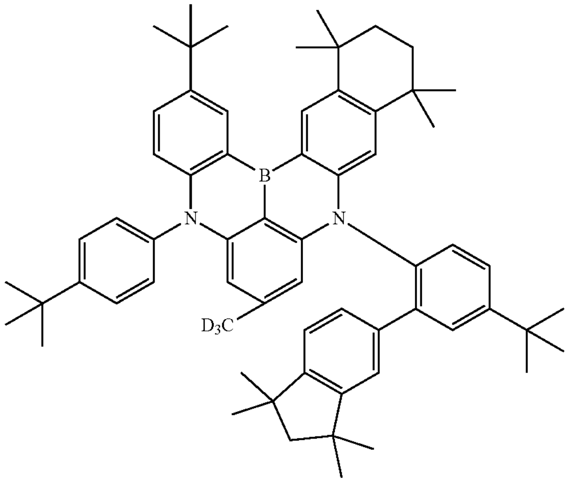
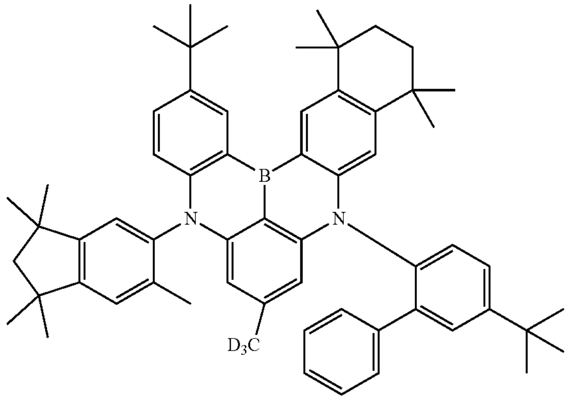
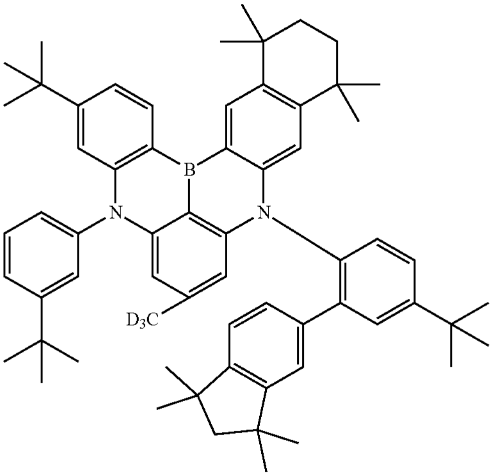
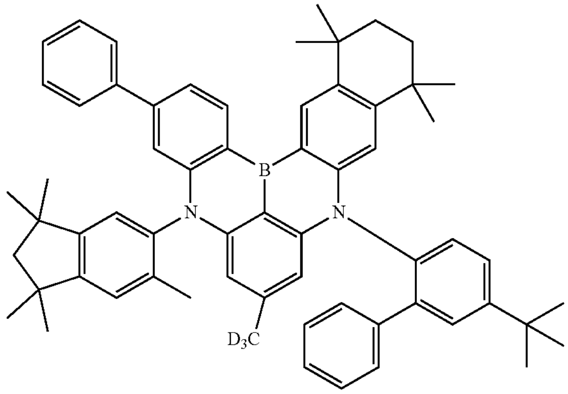
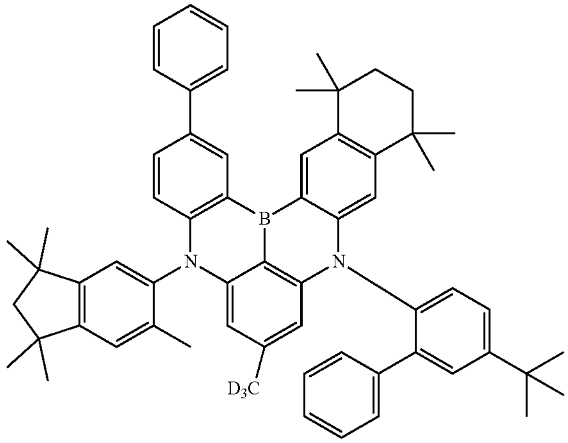
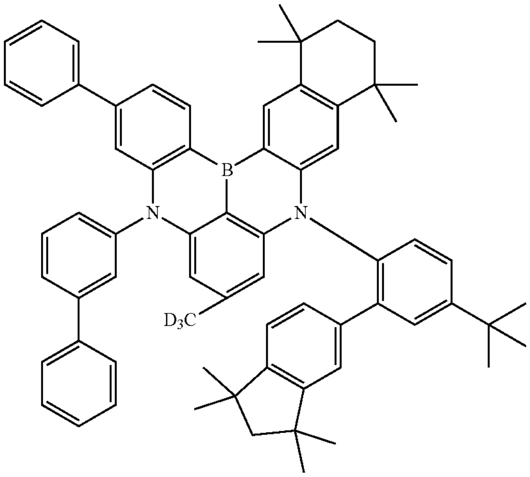

-continued
-continued
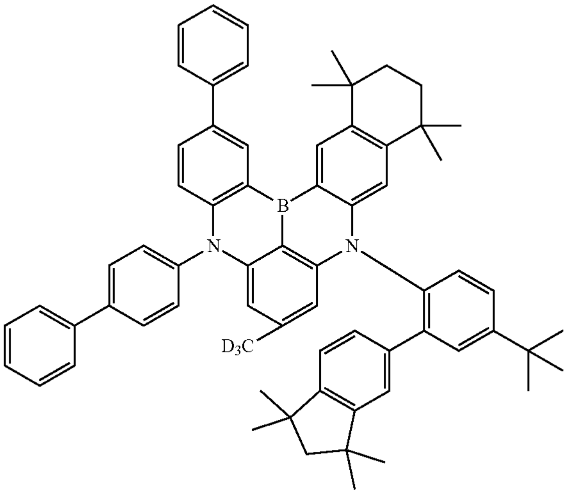
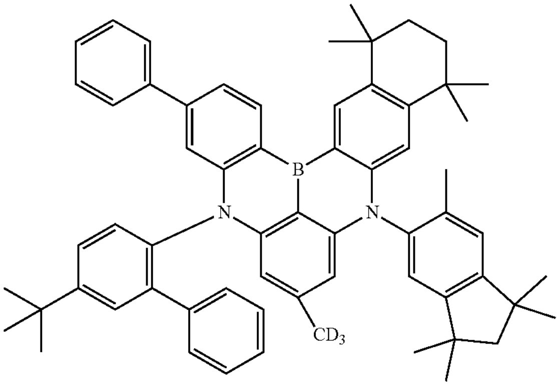
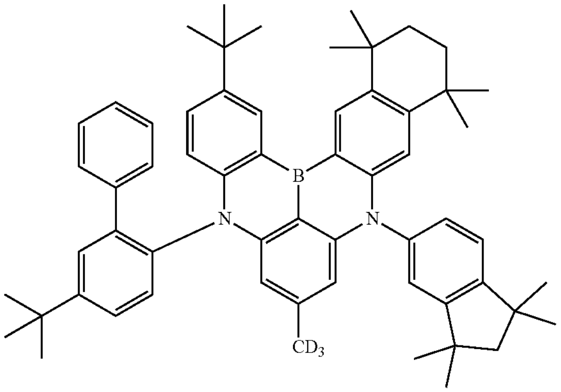
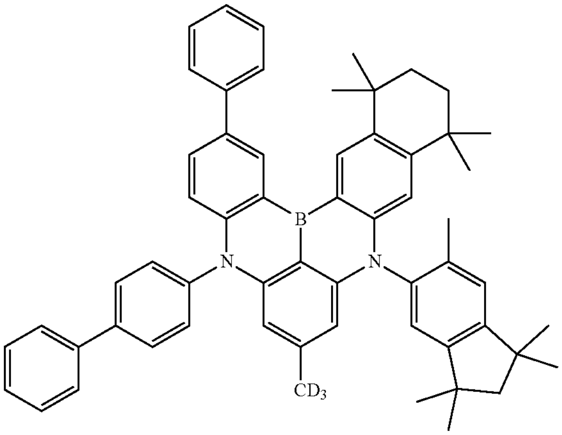
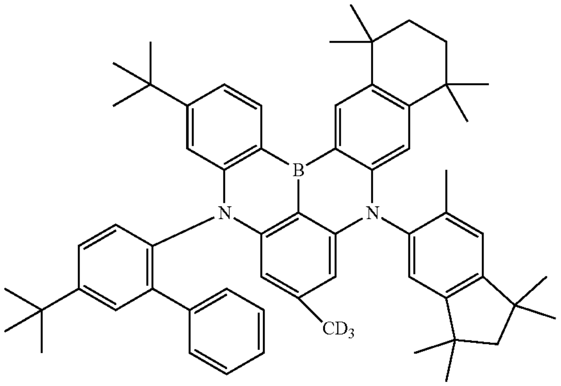
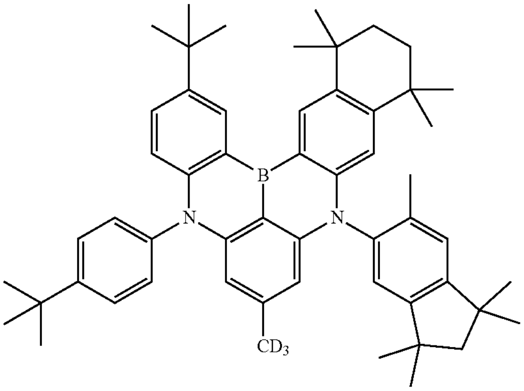
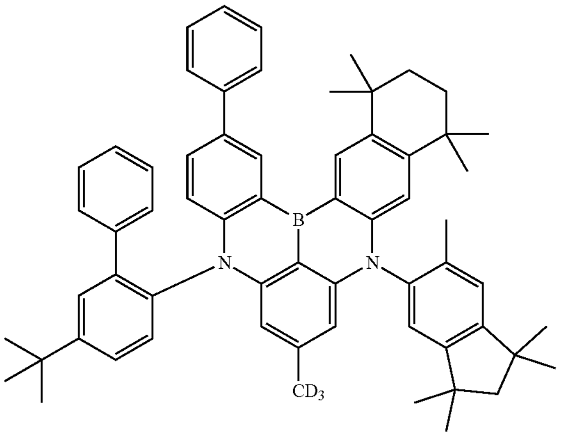
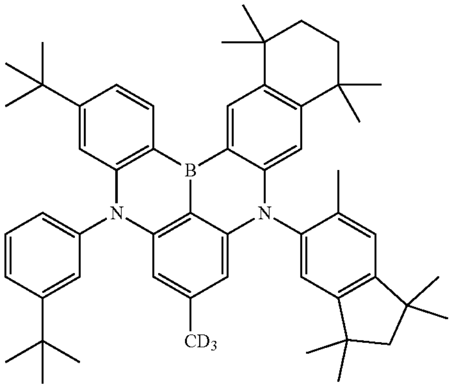

-continued
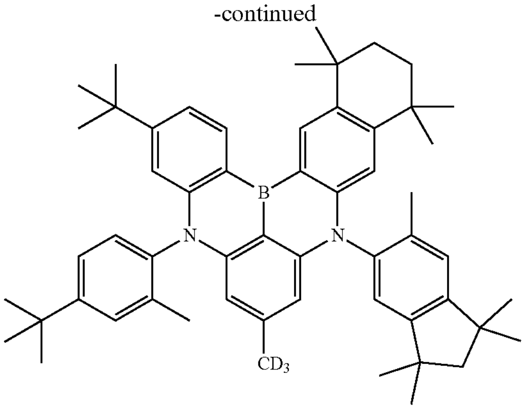
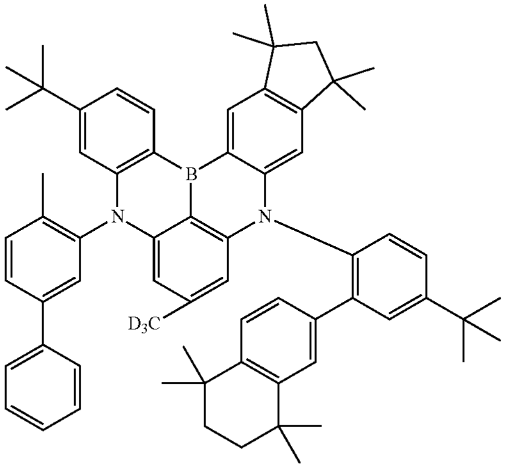
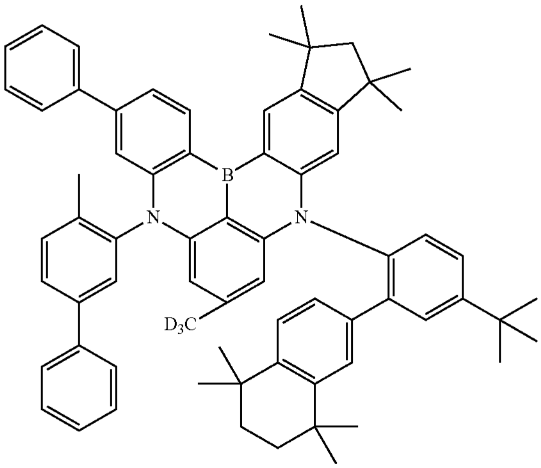
-continued
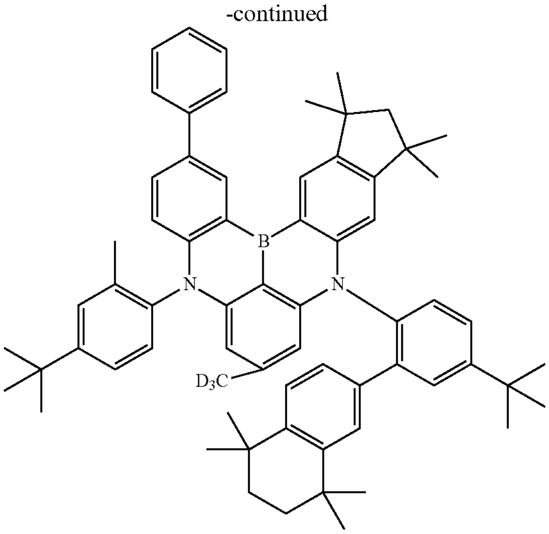
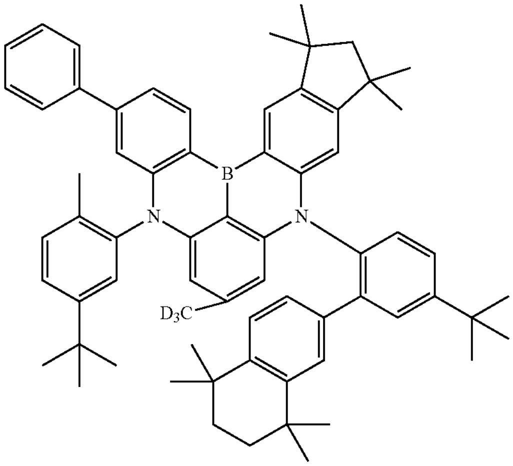
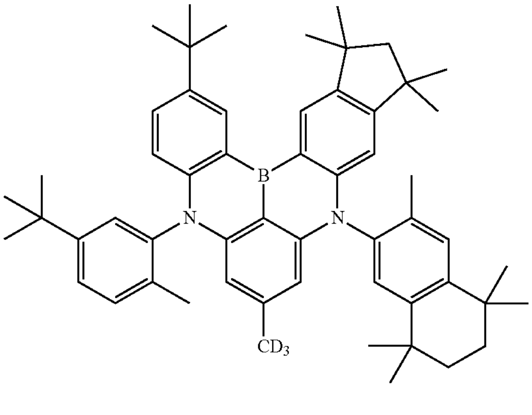

-continued
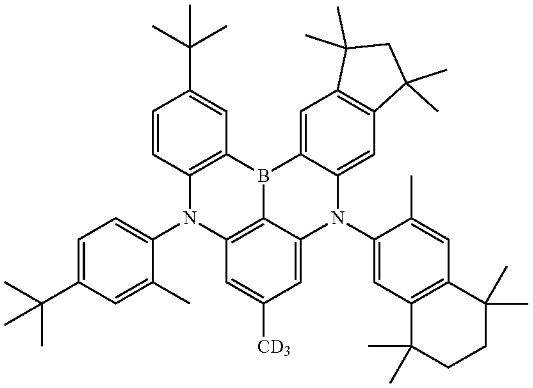
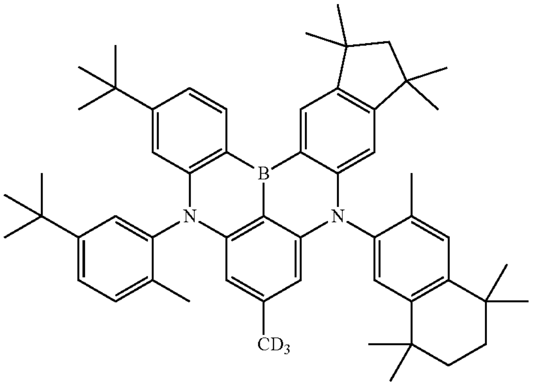
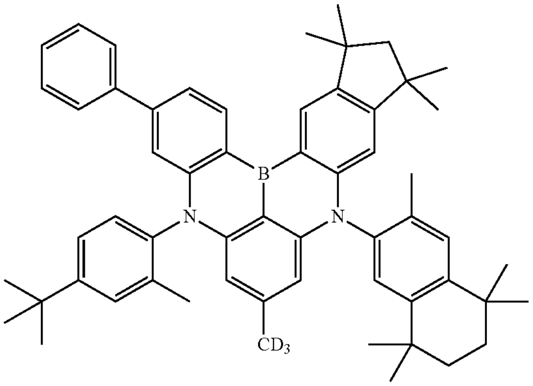
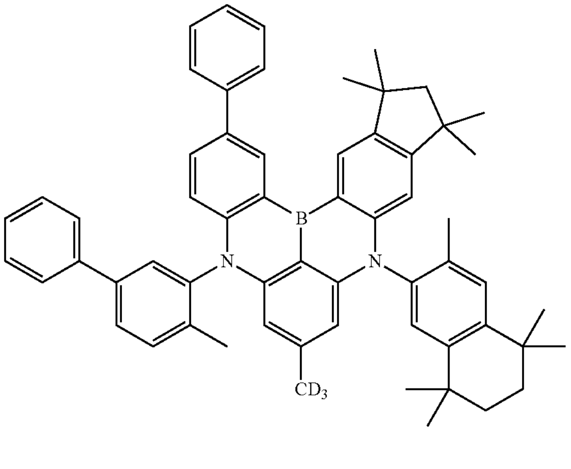
-continued
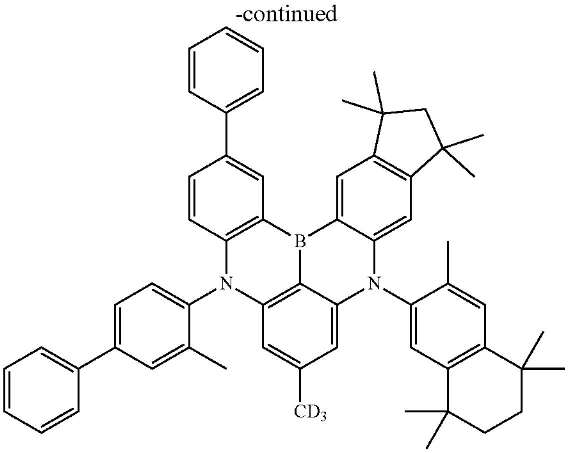
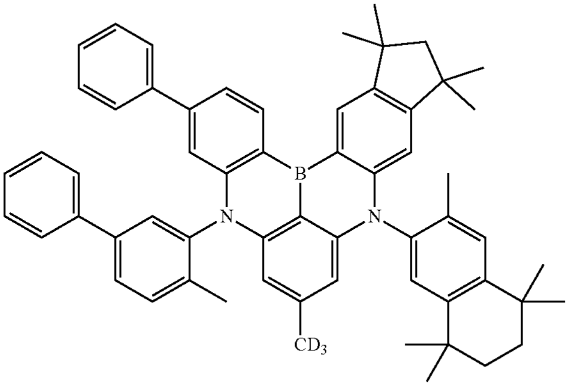
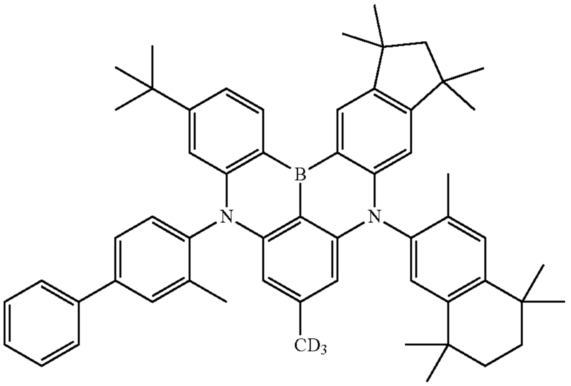
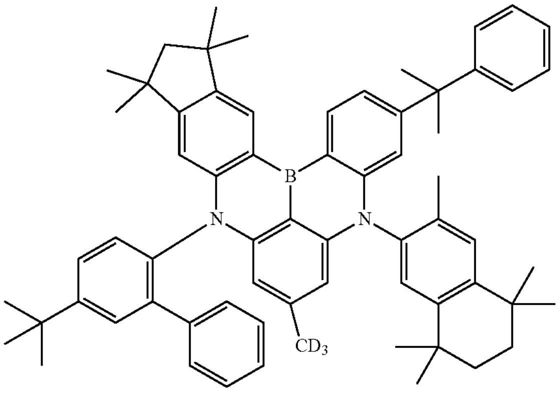

-continued
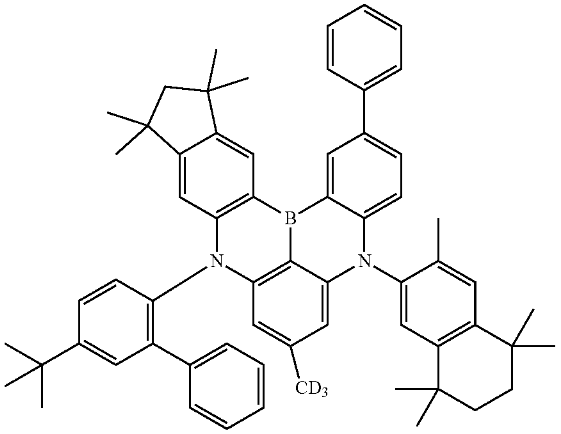
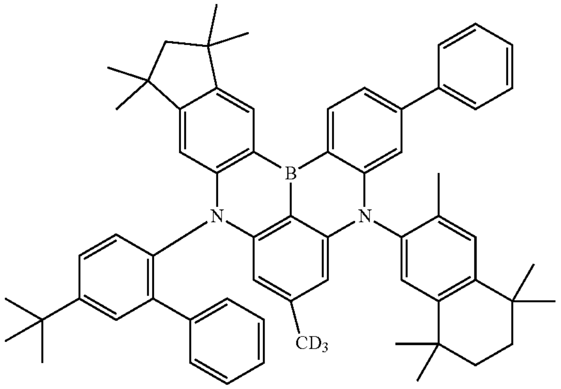
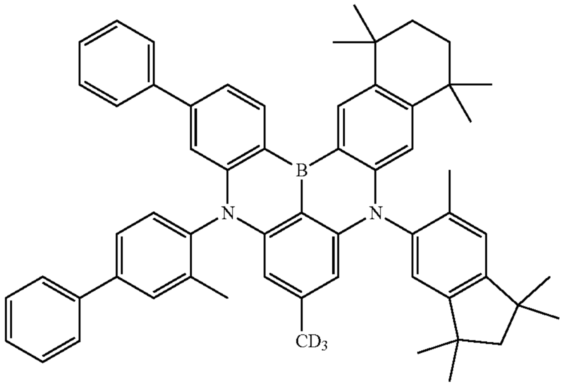
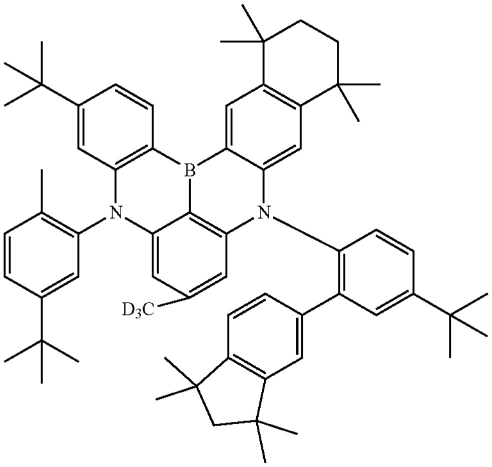
-continued
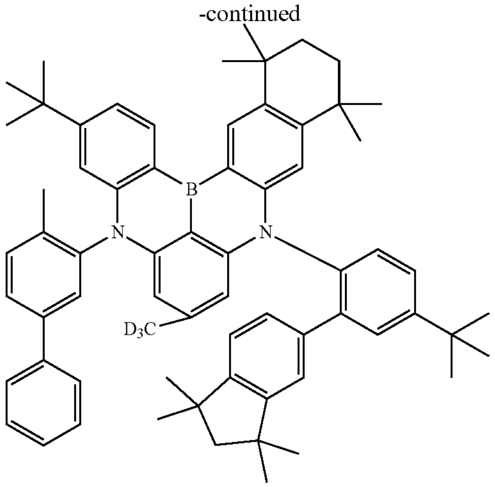
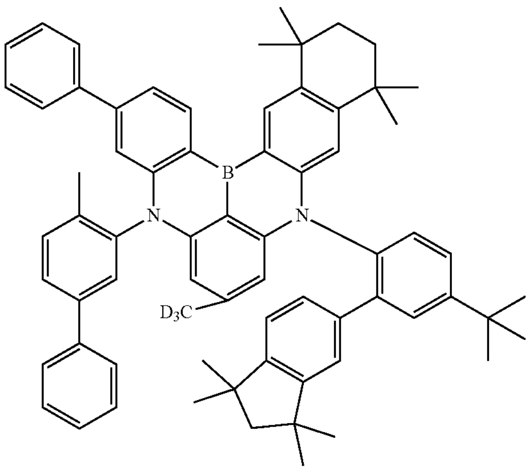
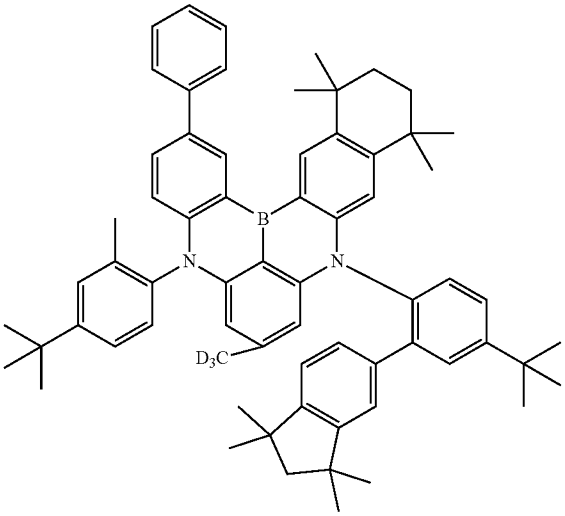

-continued
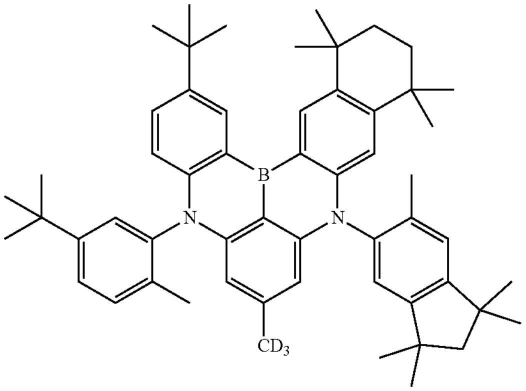
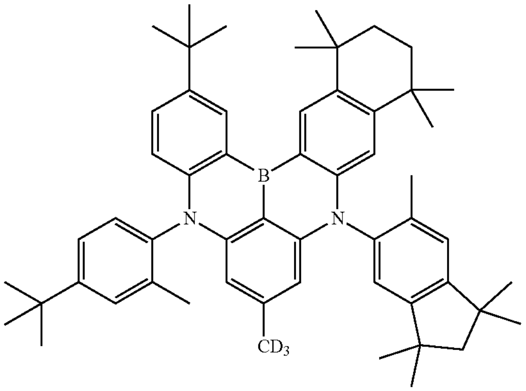
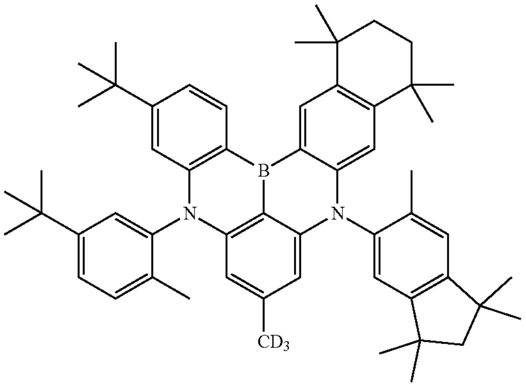
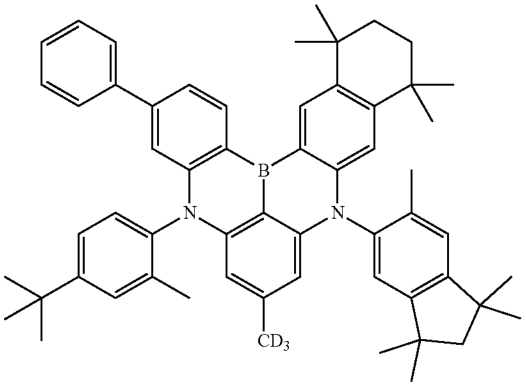
-continued
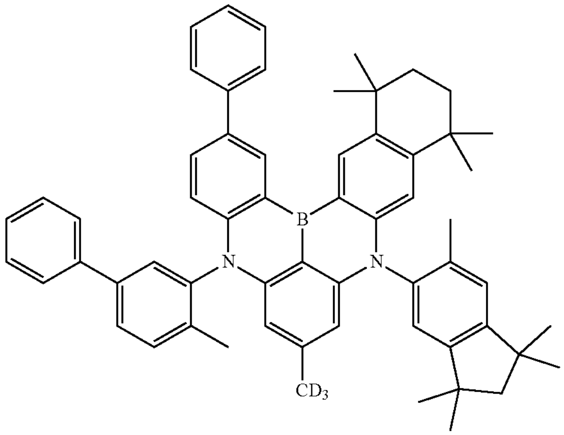
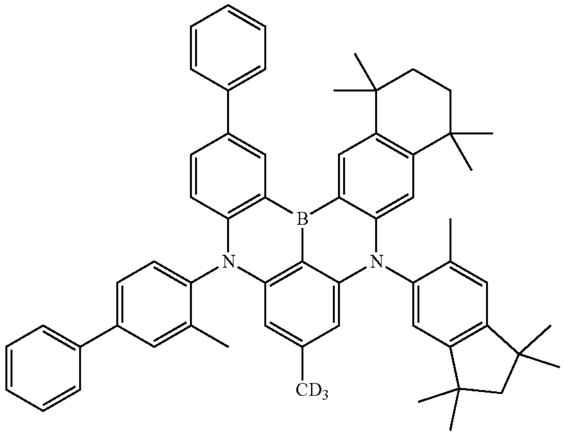
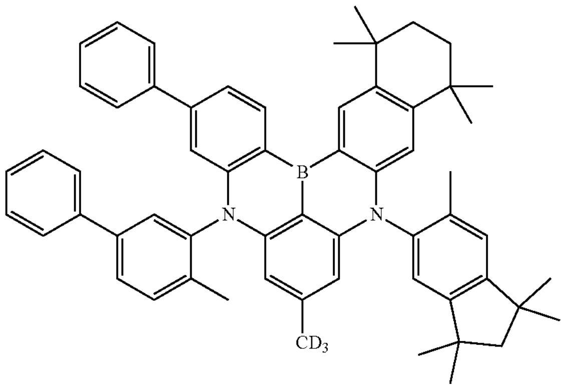
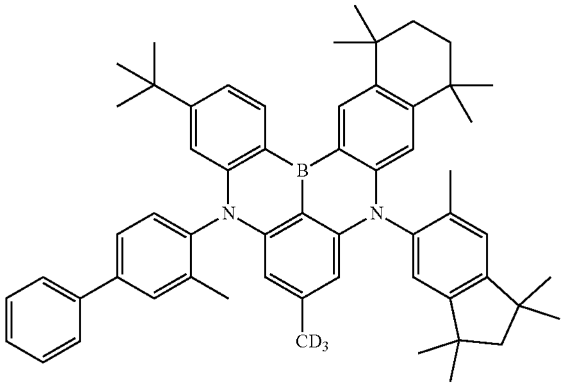

-continued
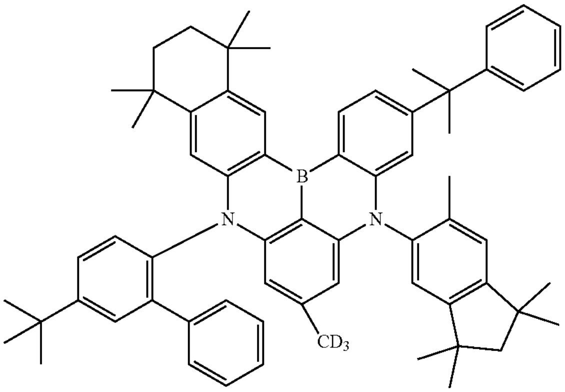
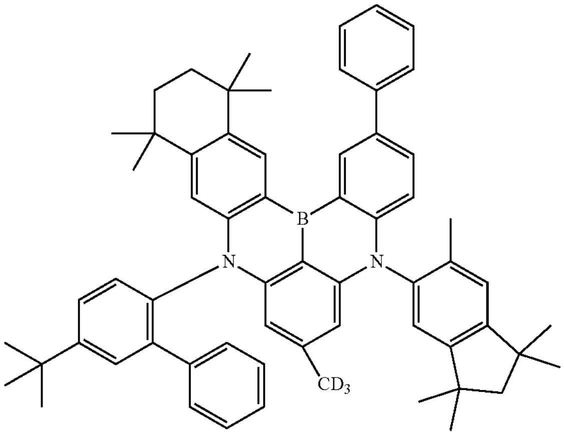
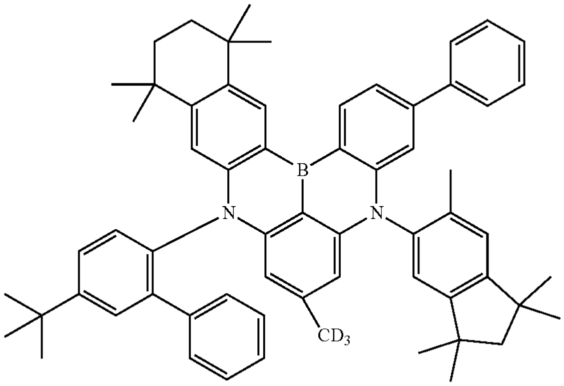
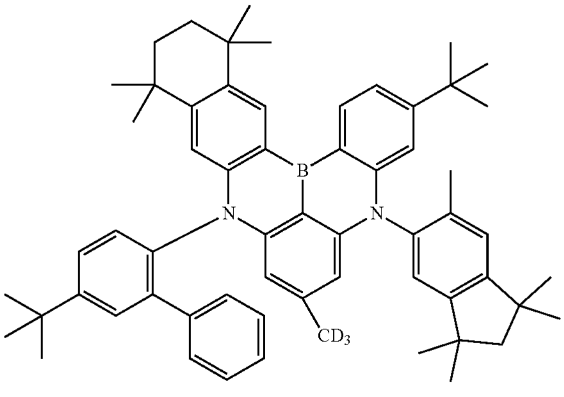
-continued
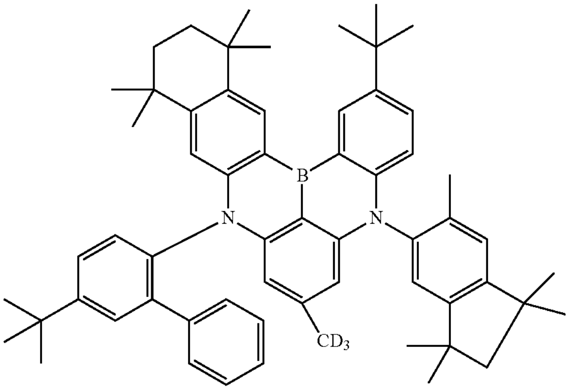
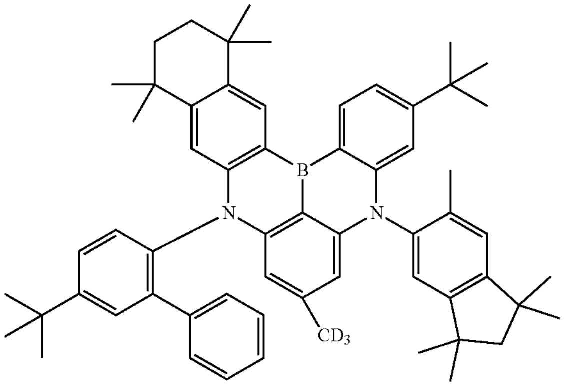
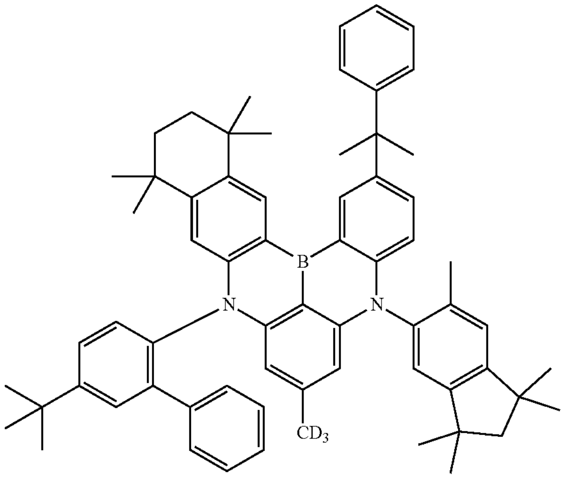
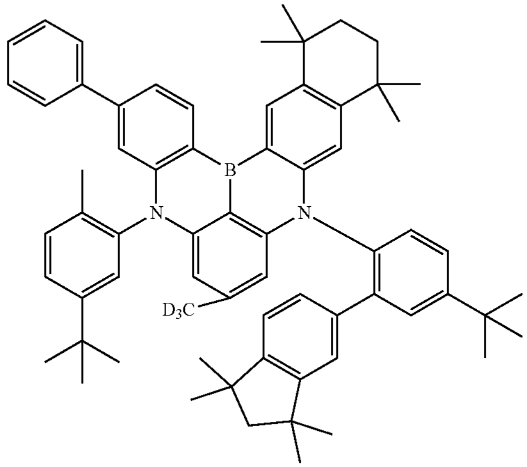

-continued
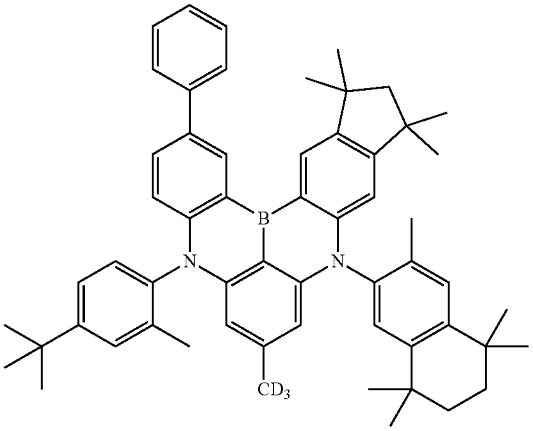
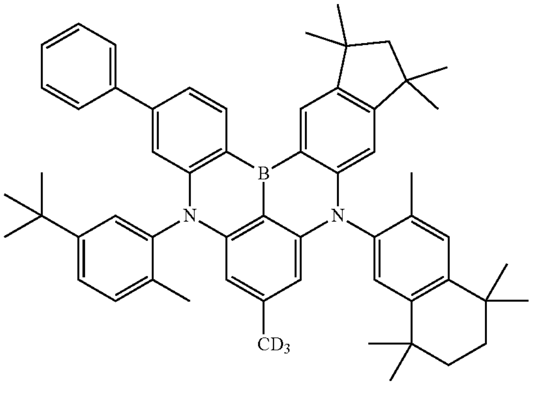
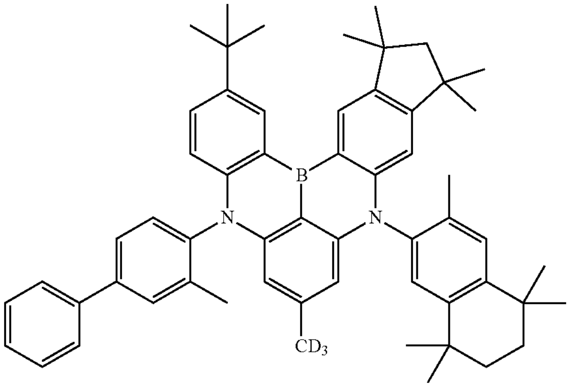
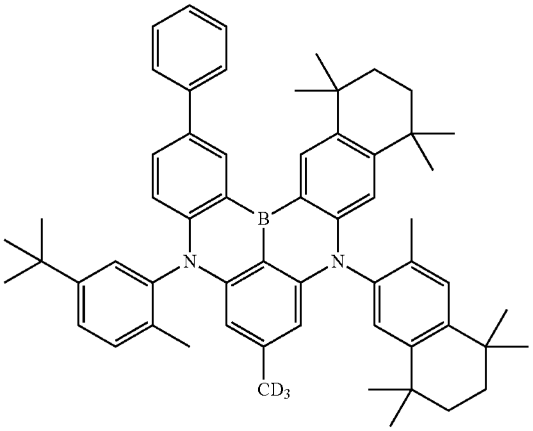
-continued
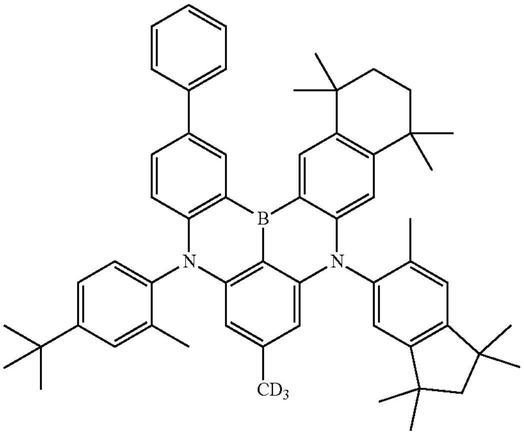
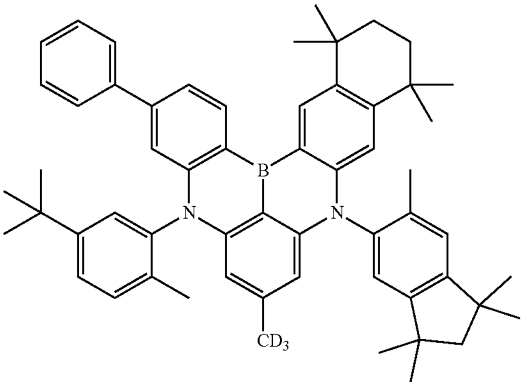
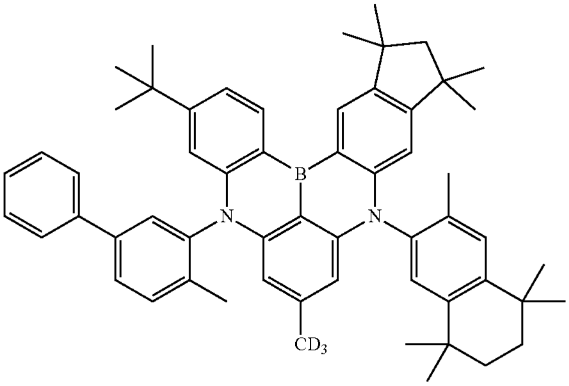
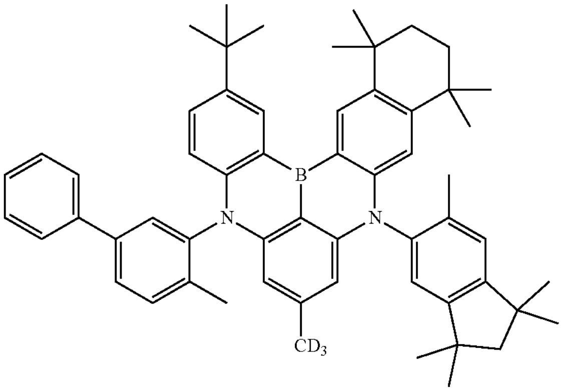

-continued
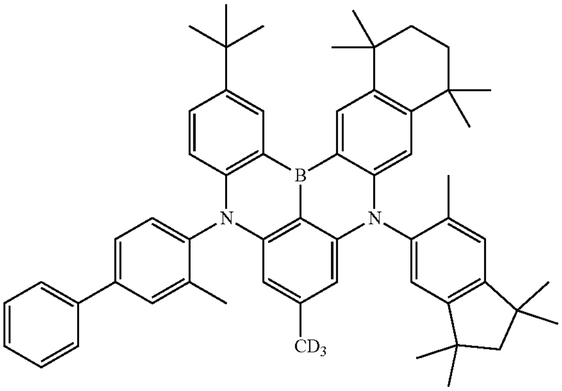
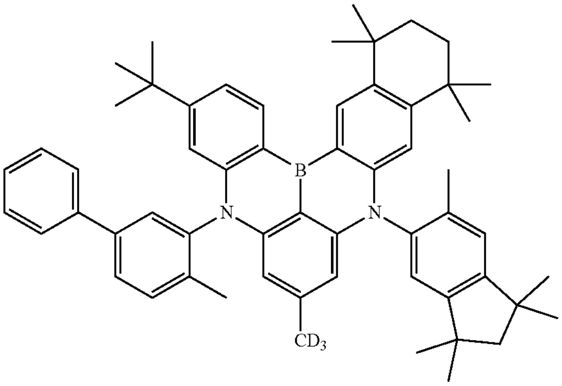
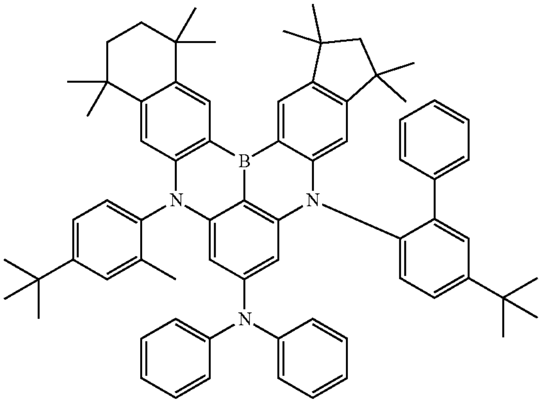
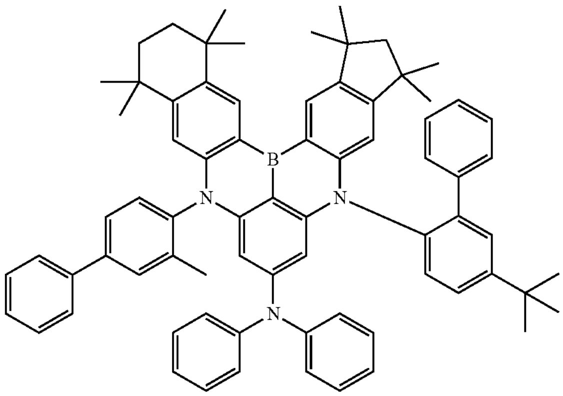
-continued
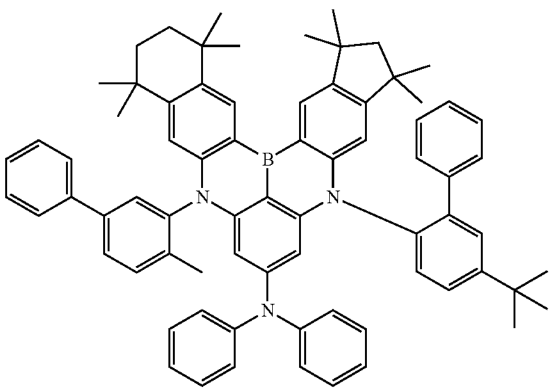
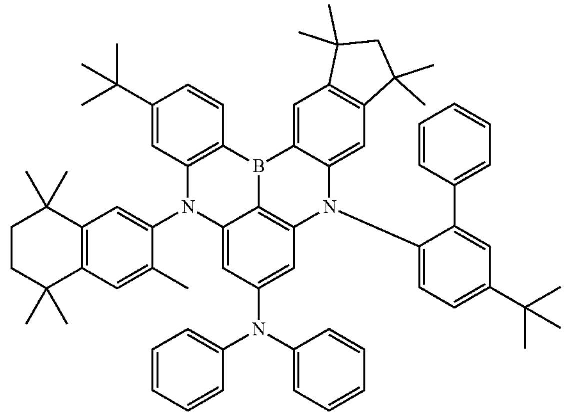
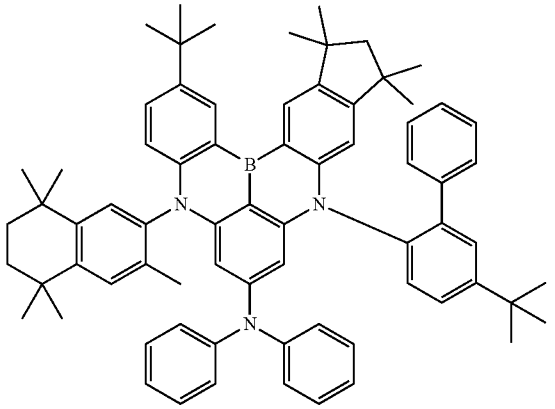
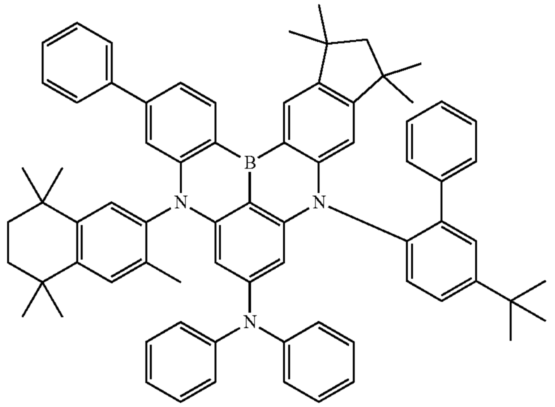

-continued
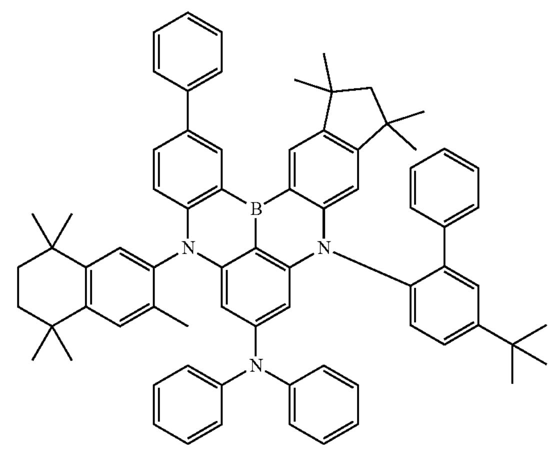
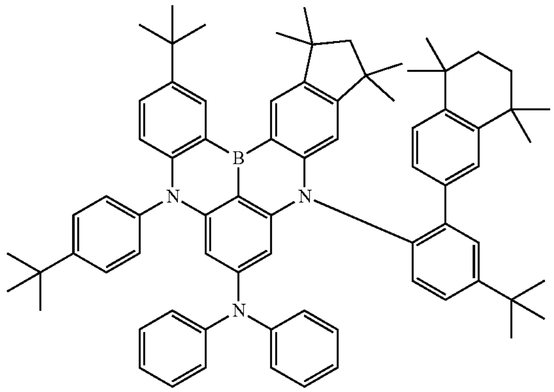
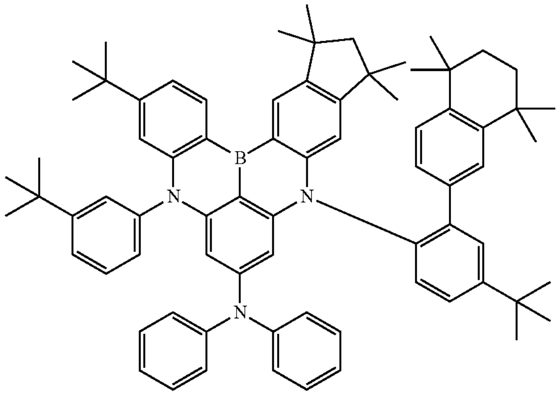
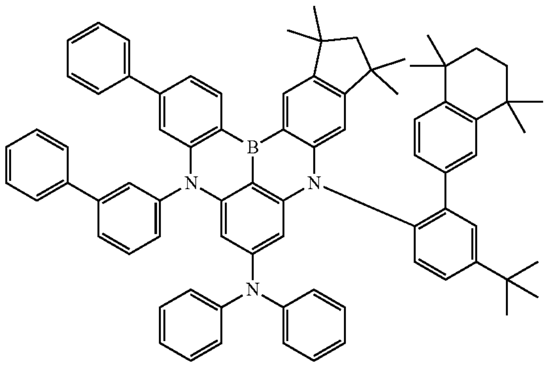
-continued
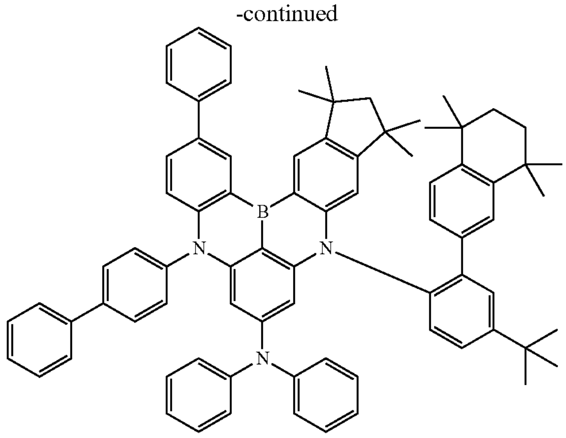
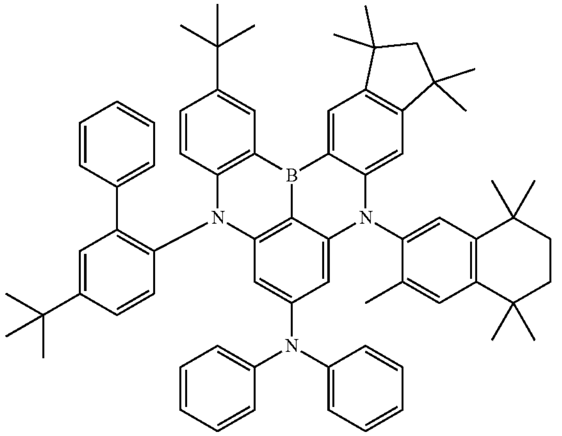
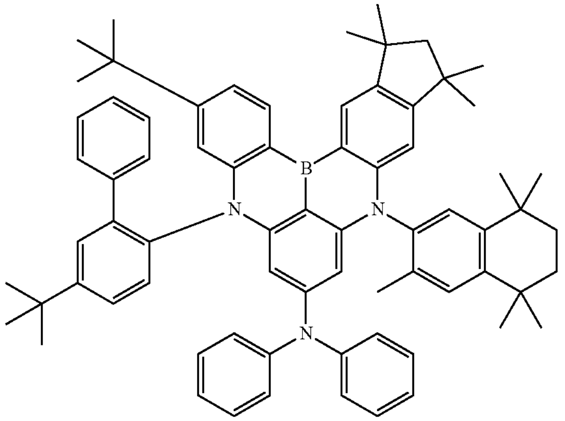

-continued
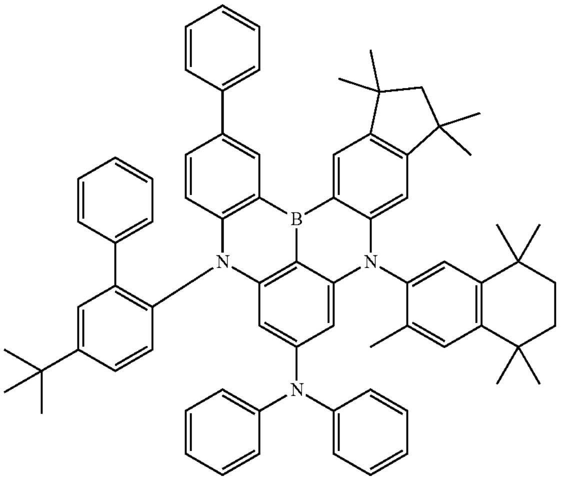
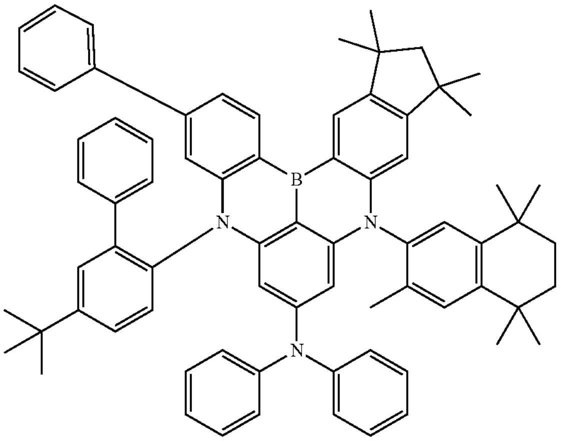
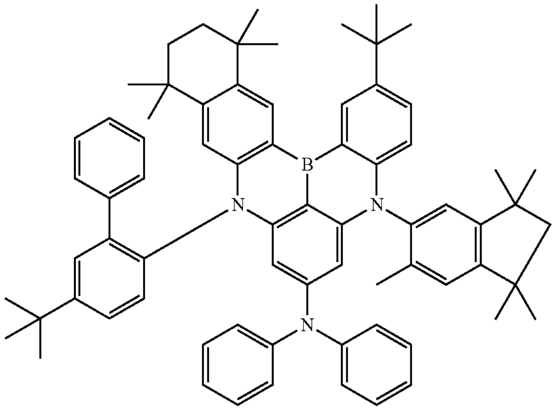
-continued
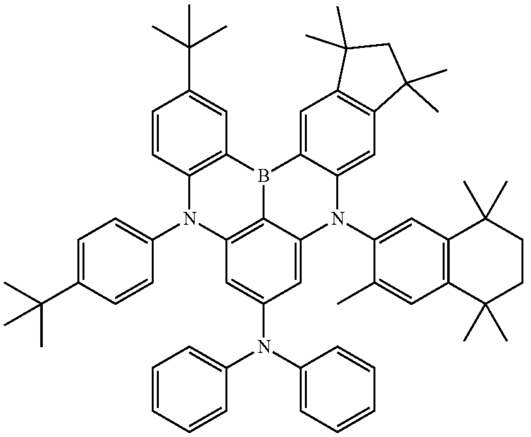
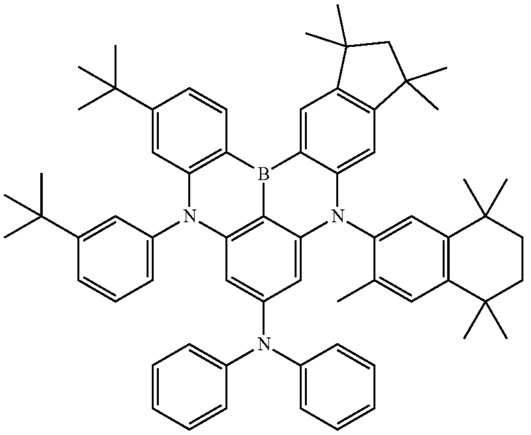
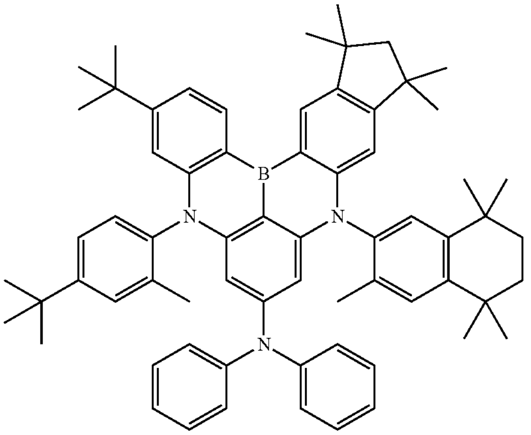
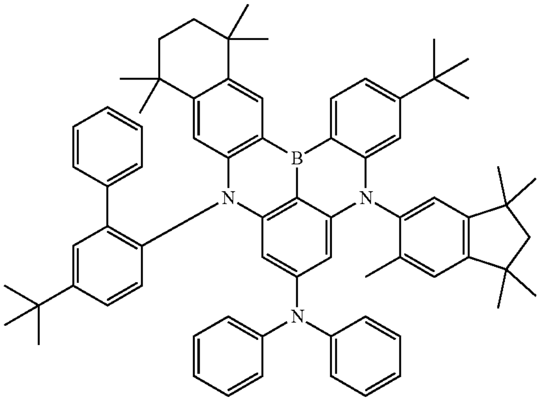

-continued
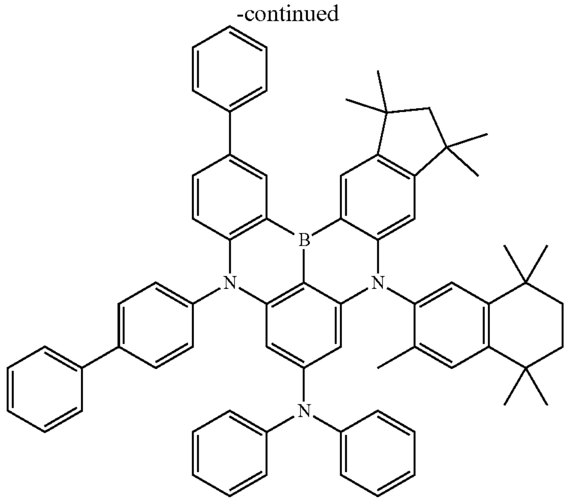
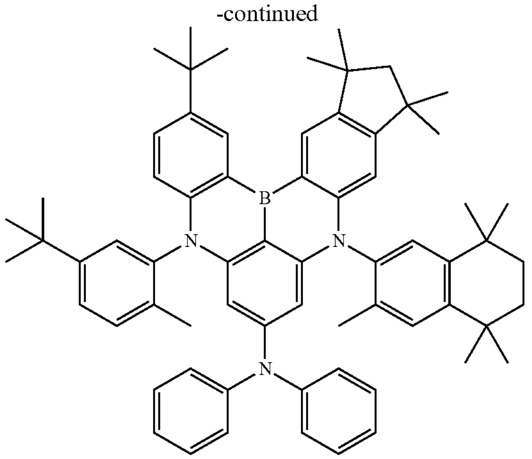
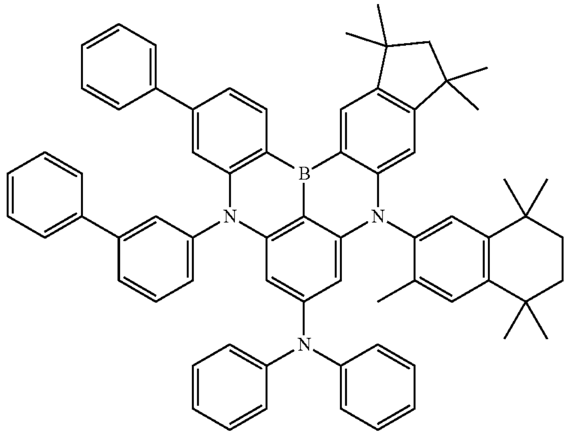
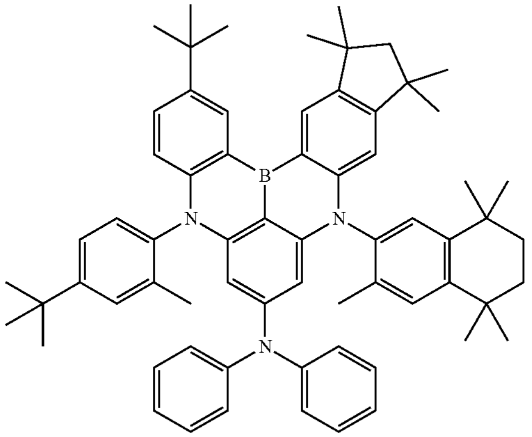
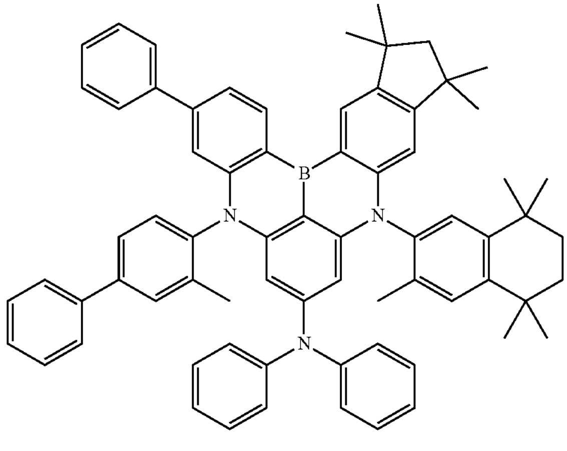
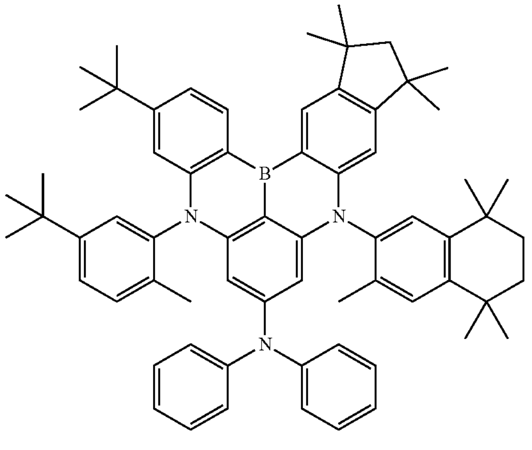
-continued -continued
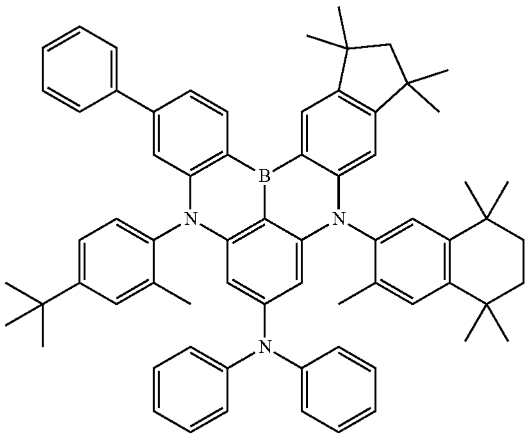
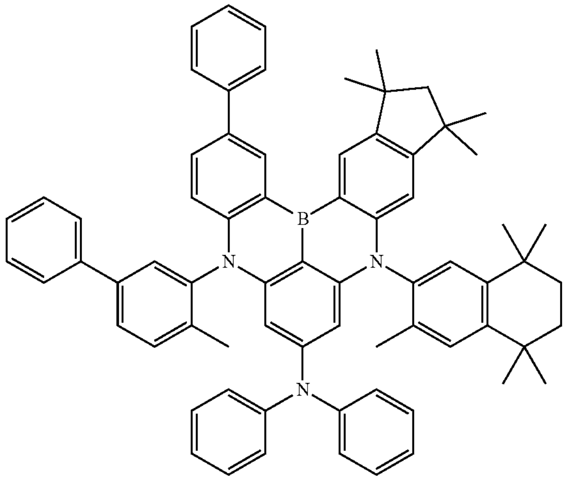
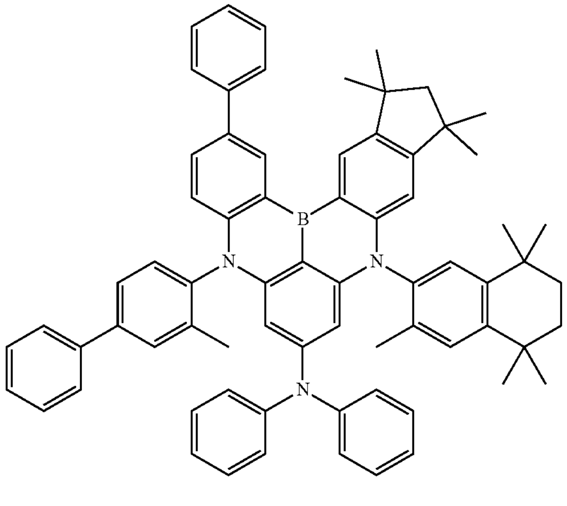
-continued
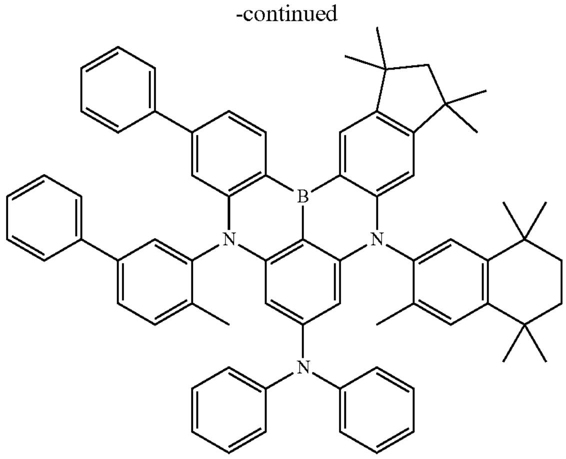
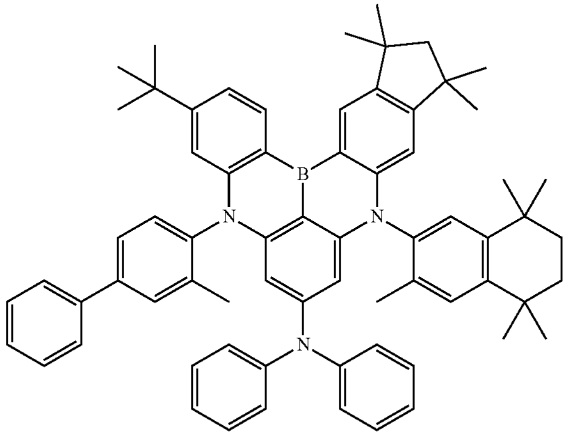
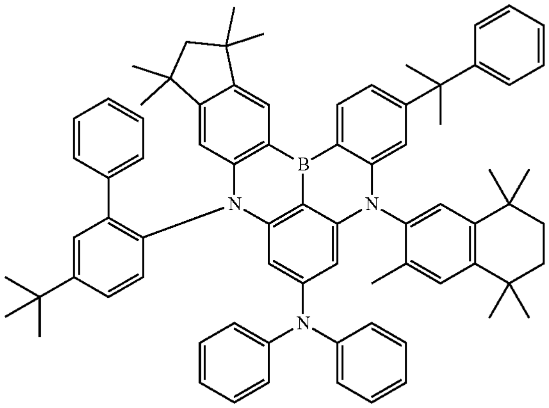
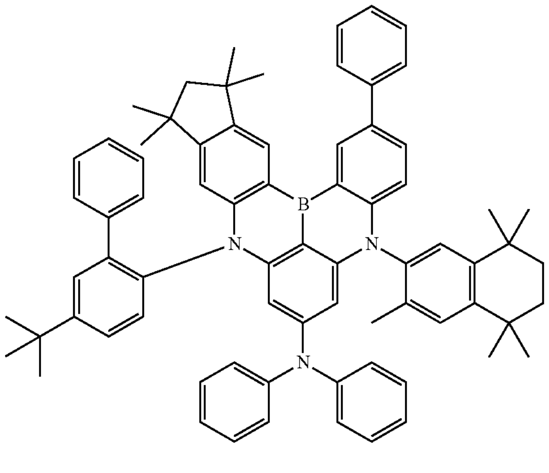

-continued
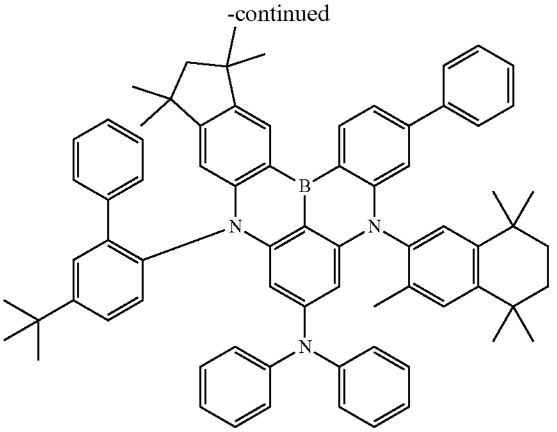
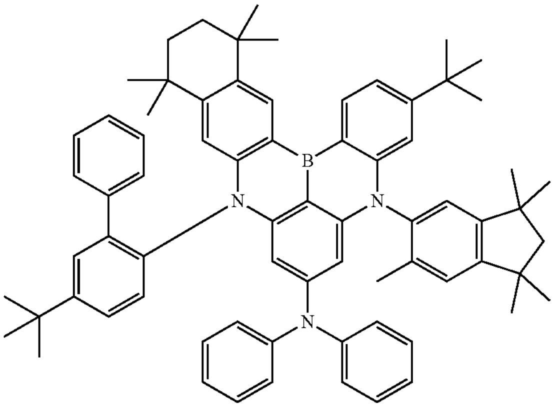
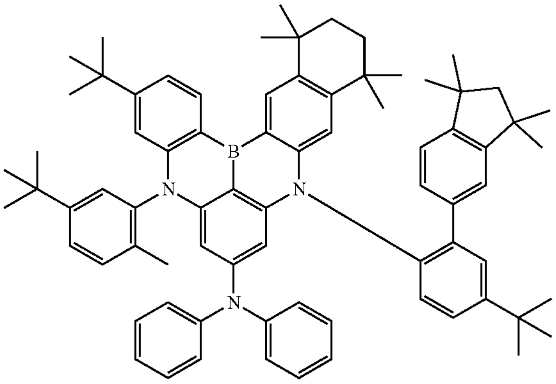
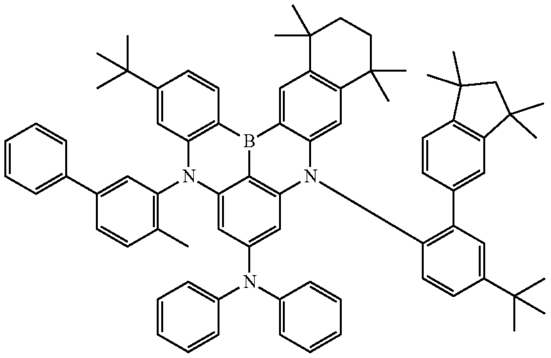
-continued
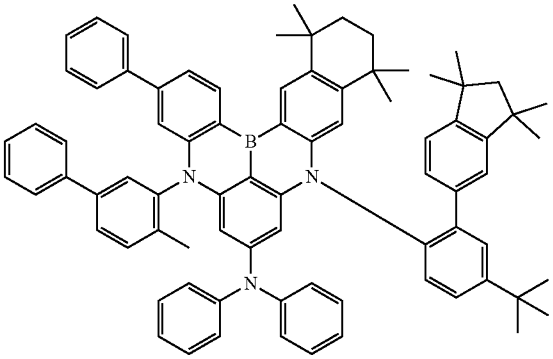
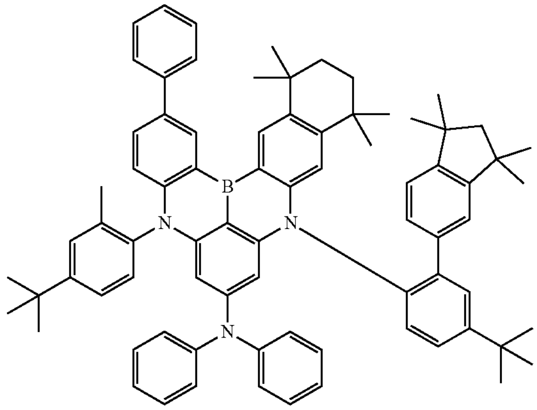
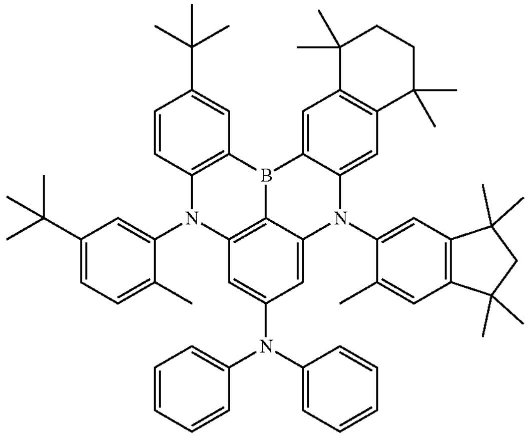
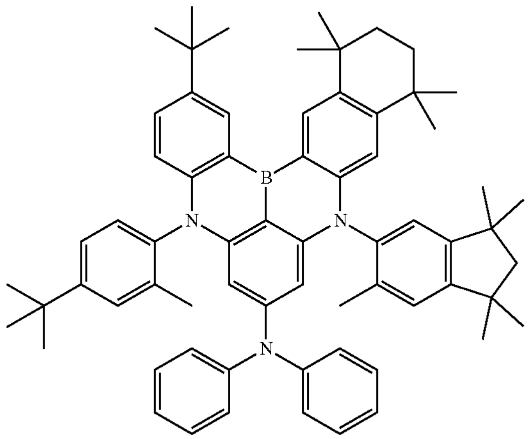

-continued
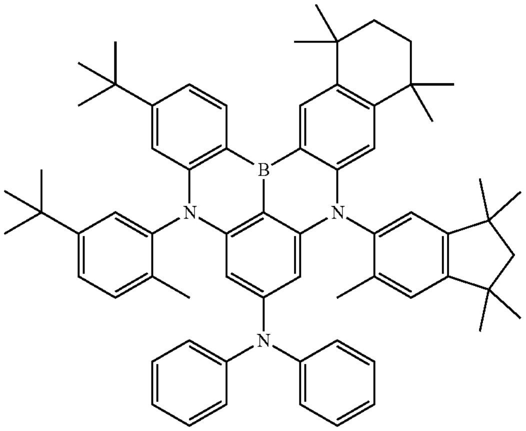
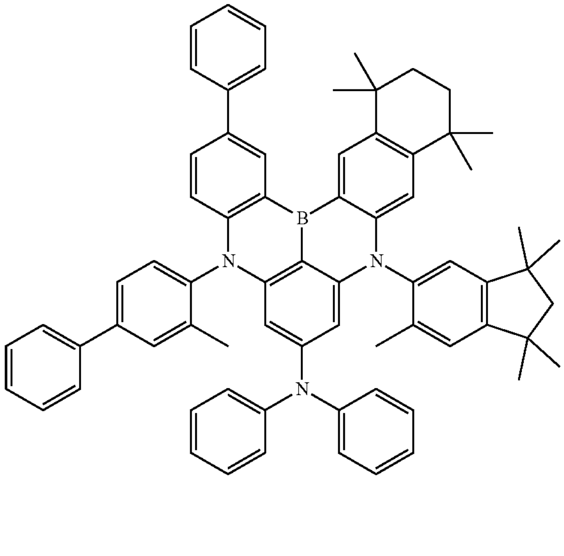
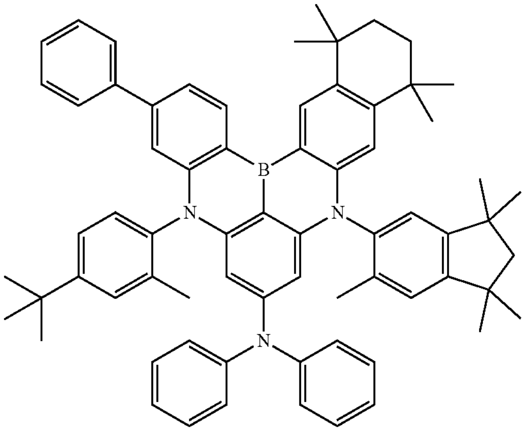
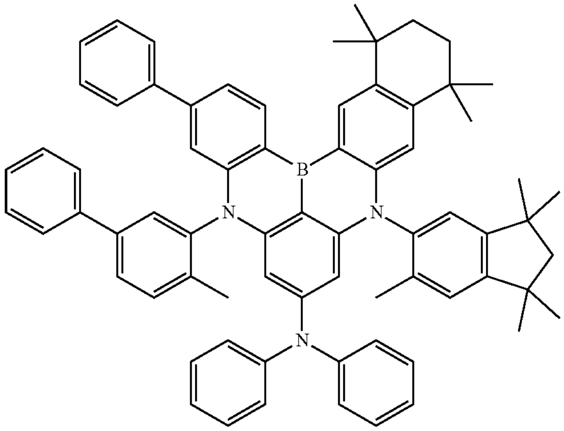
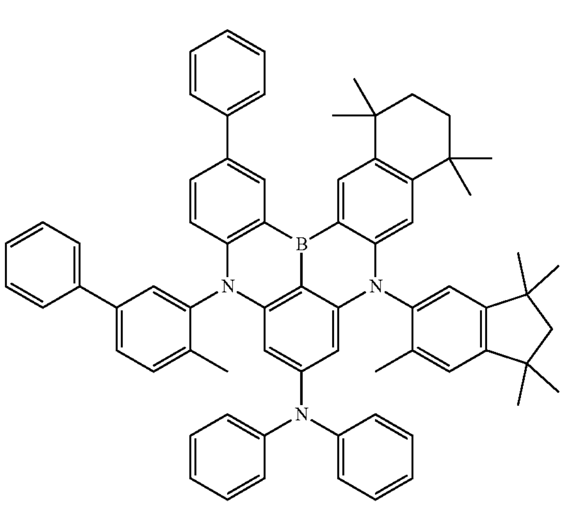
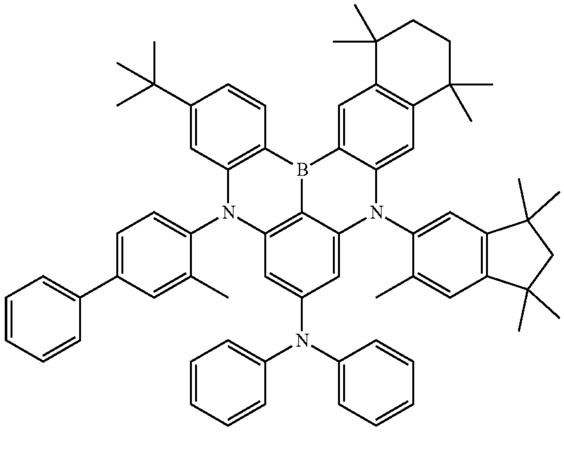
-continued -continued
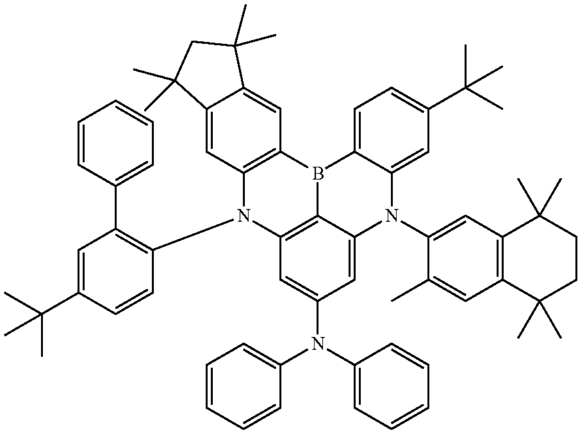
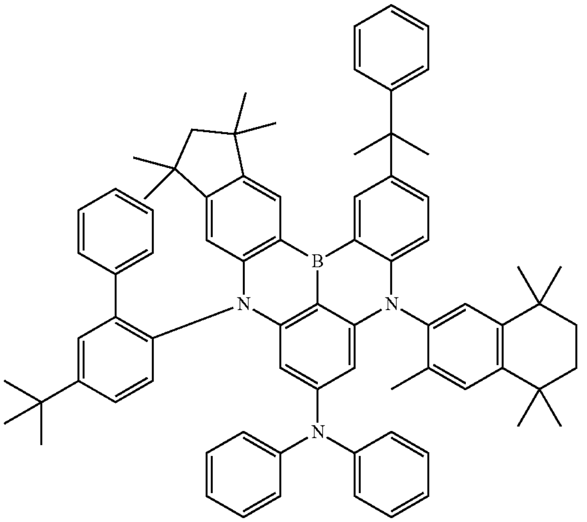
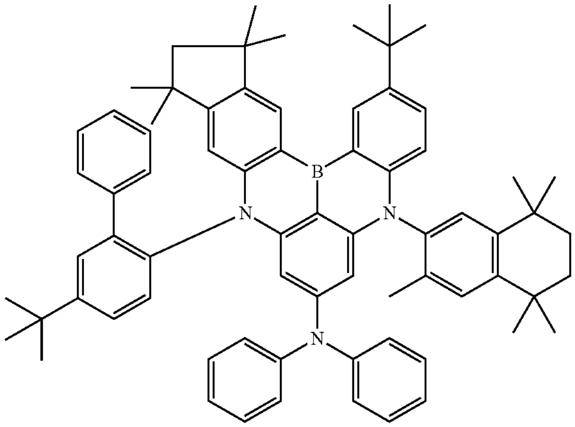
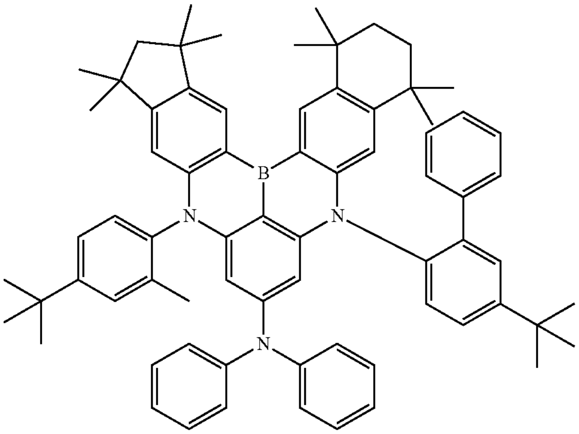
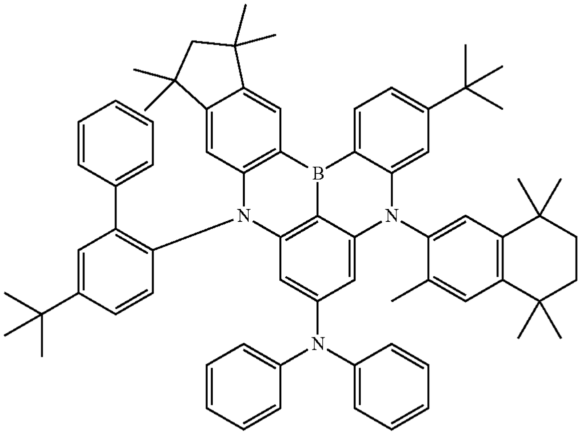
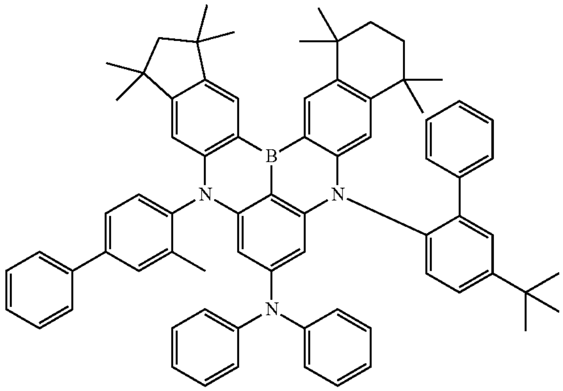

-continued
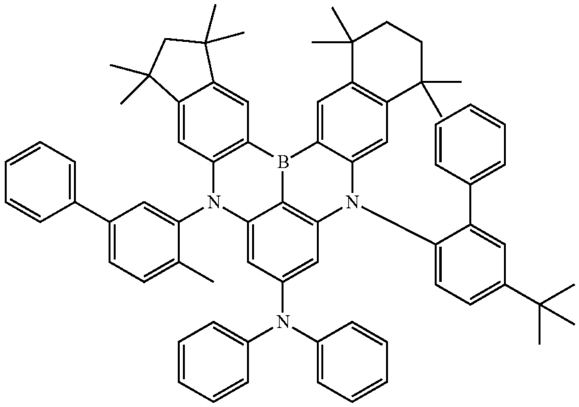
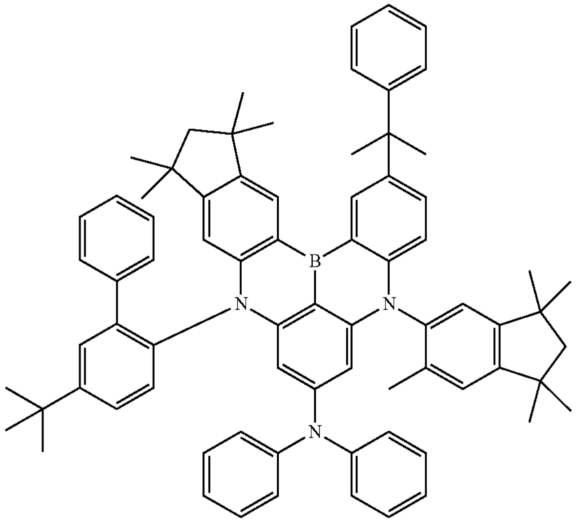
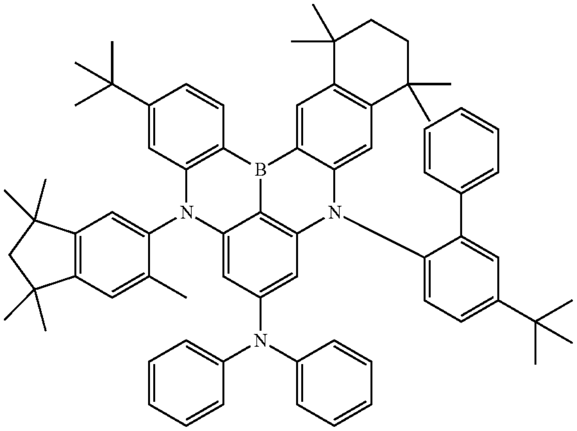
-continued
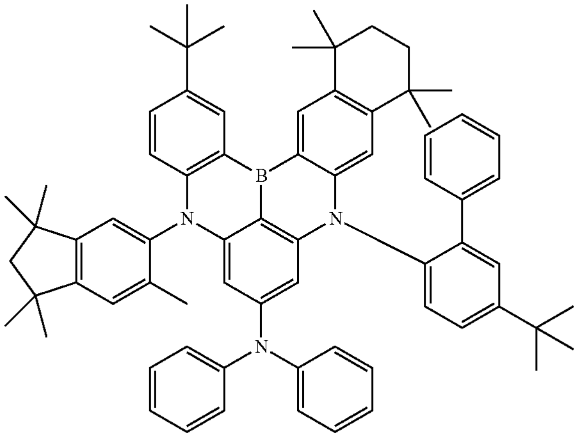
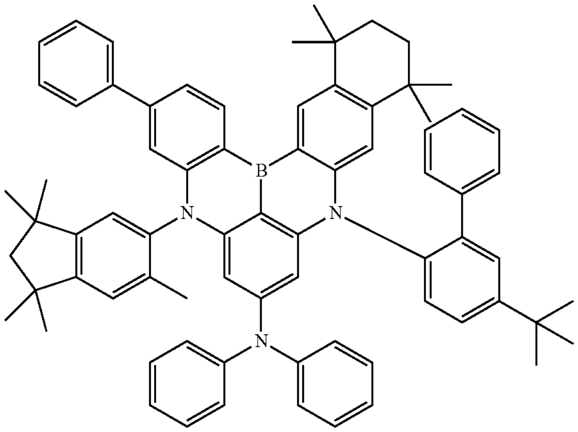
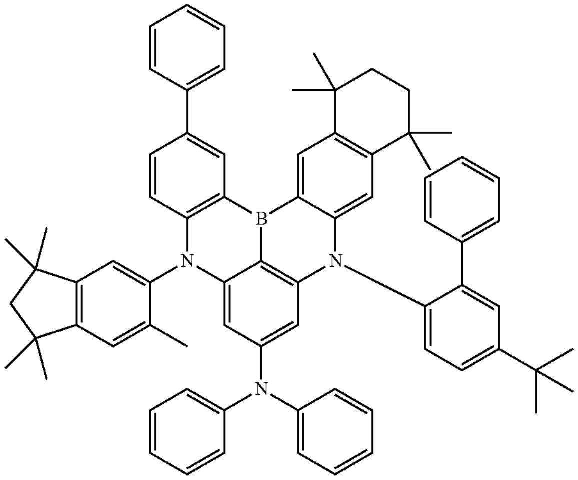

-continued
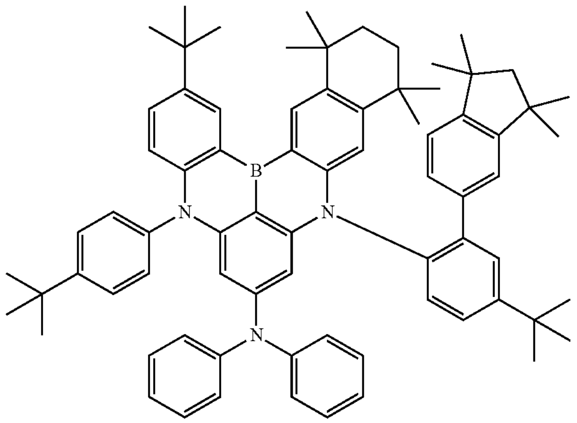
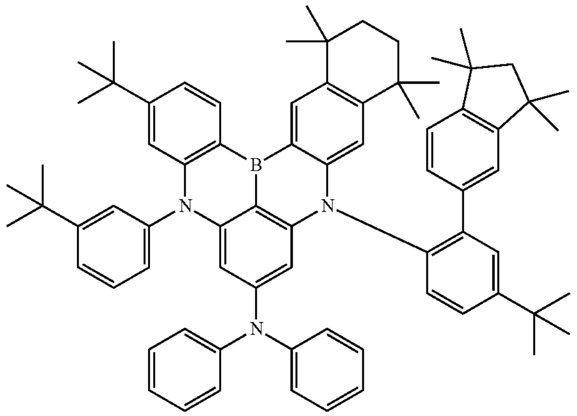
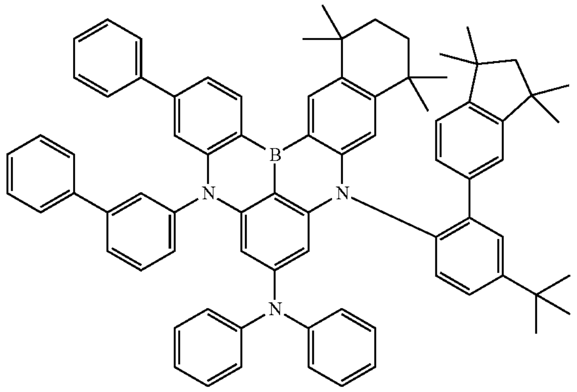
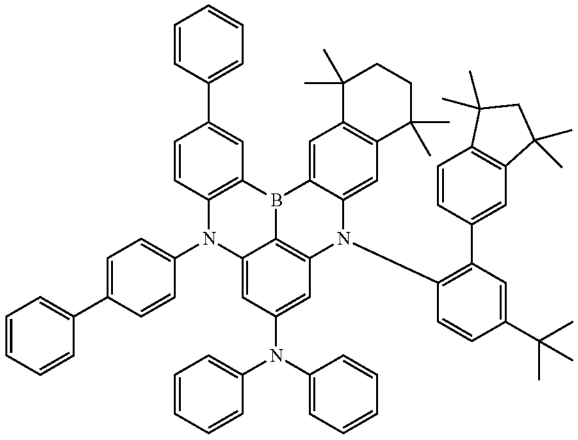
-continued
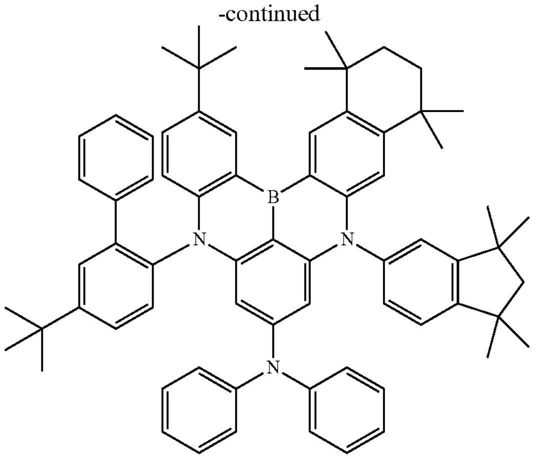
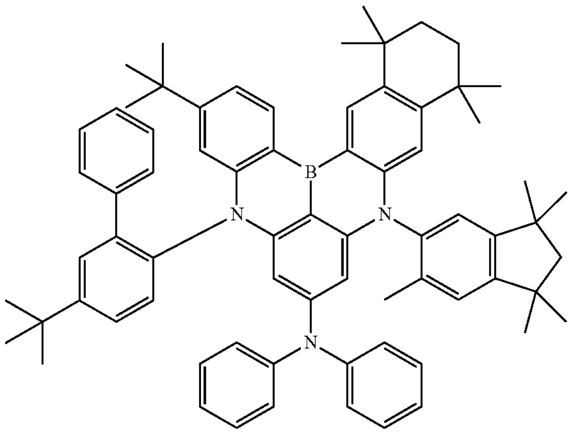
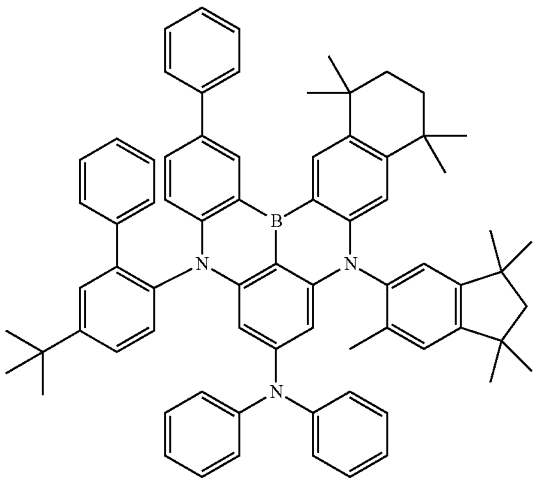

-continued
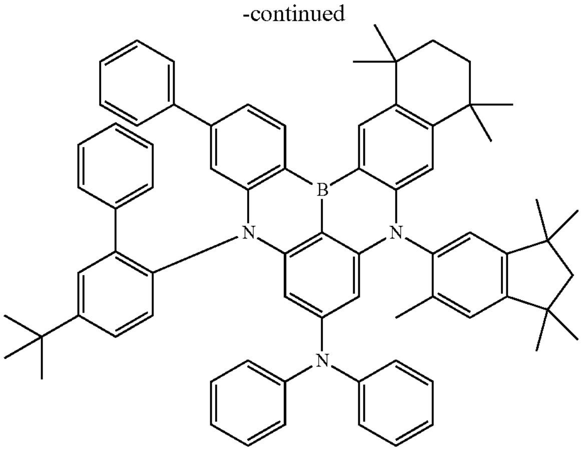
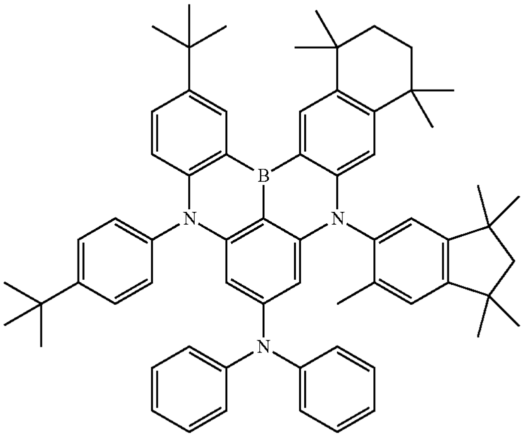
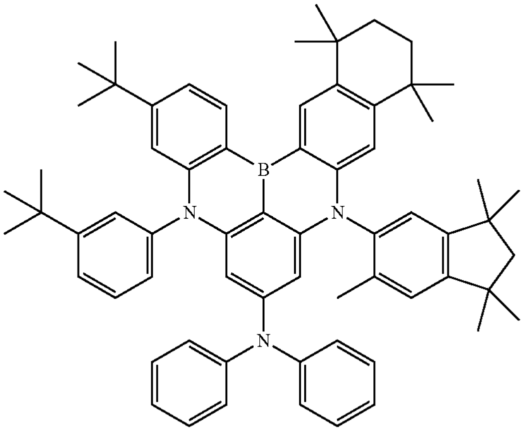
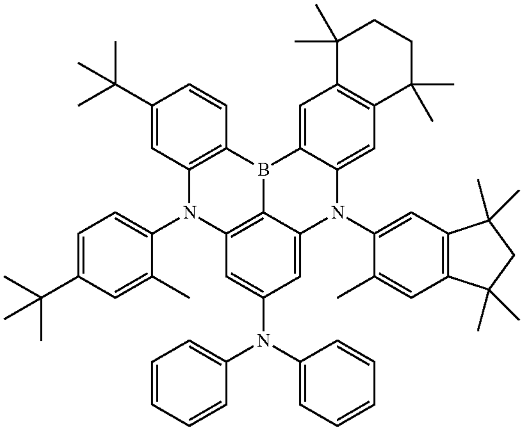
-continued
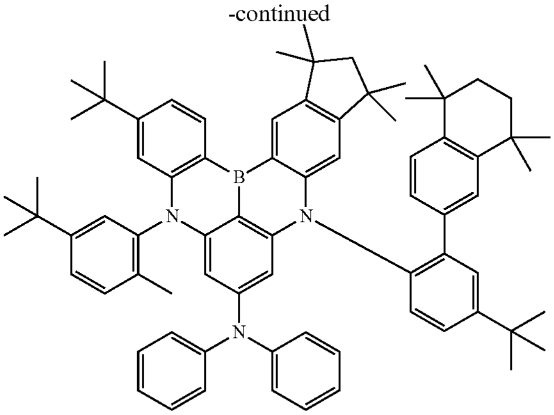
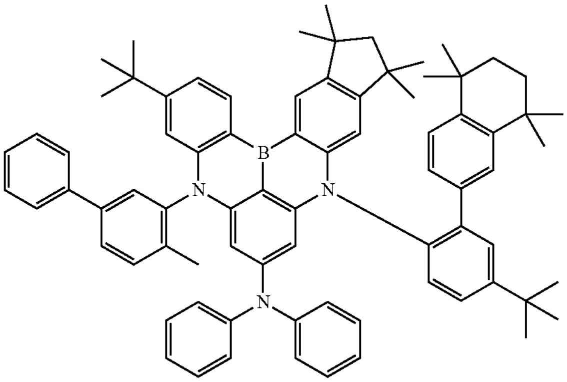
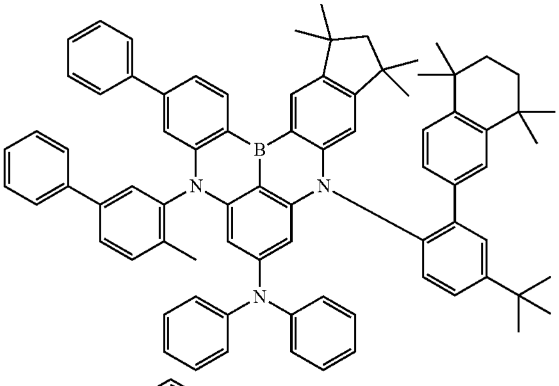
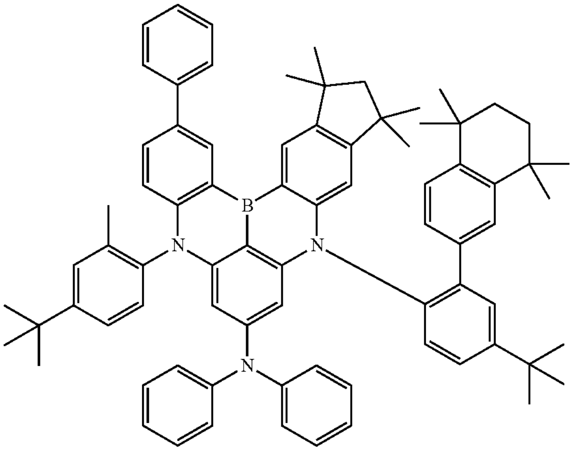

-continued
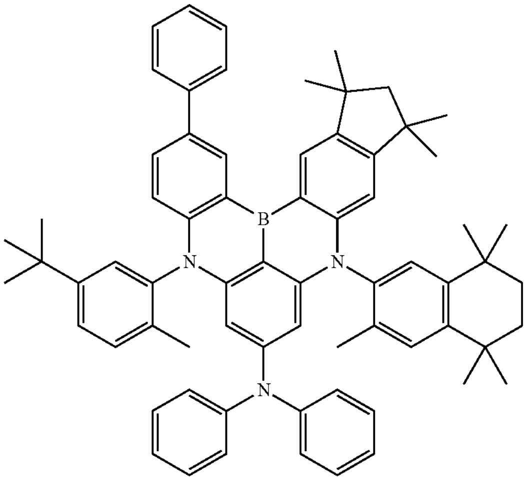
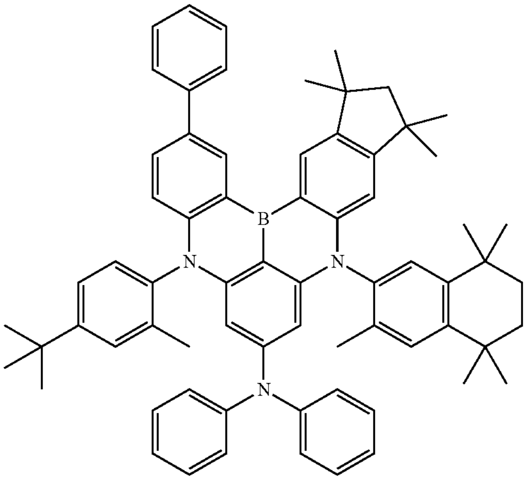
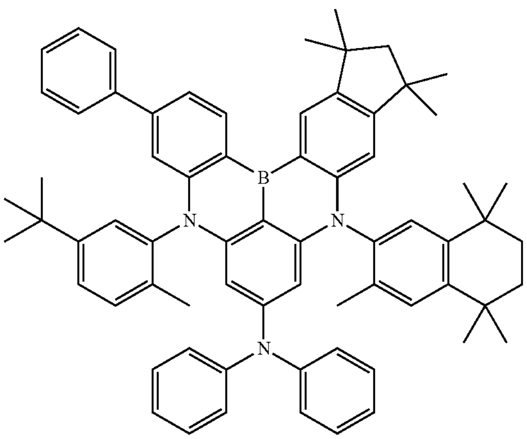
-continued
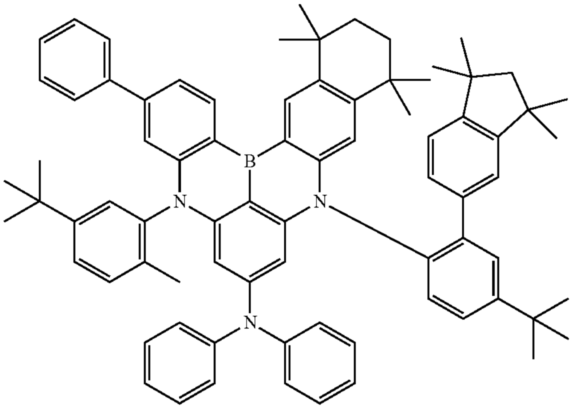
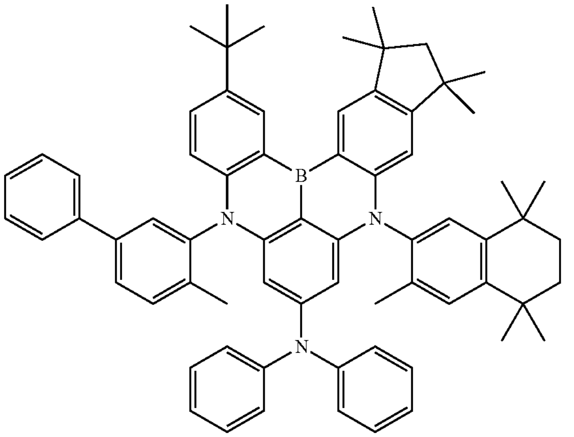
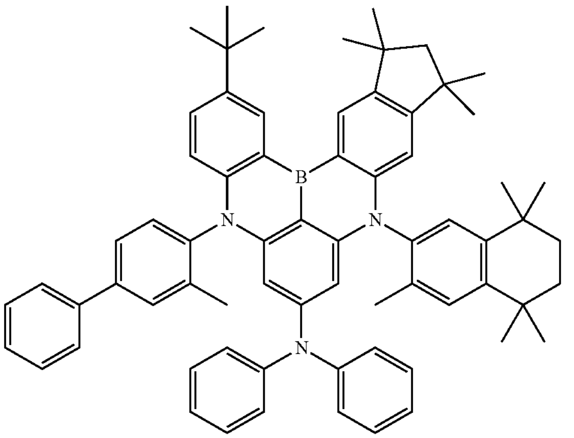
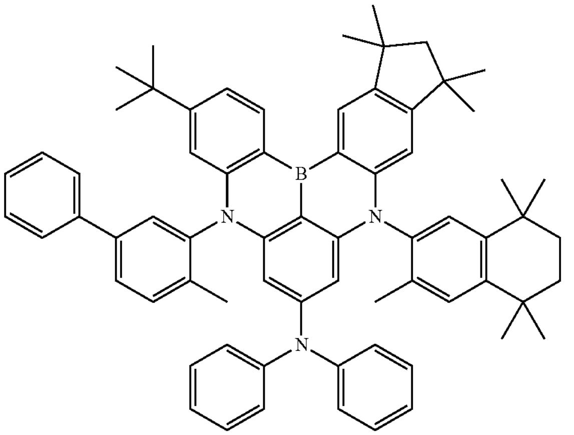

-continued
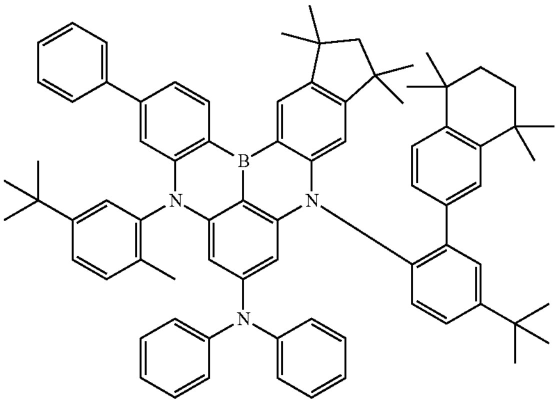
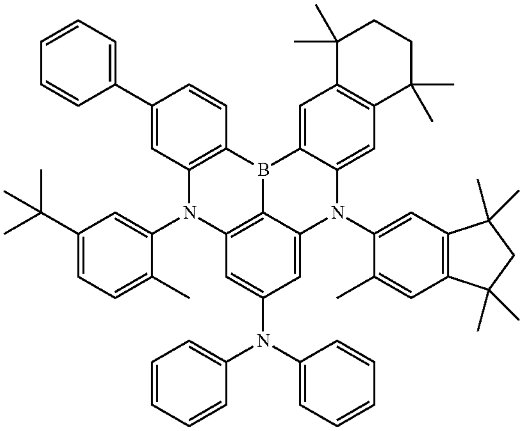
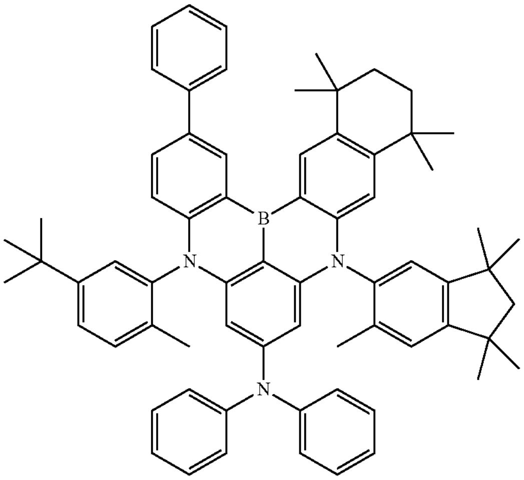
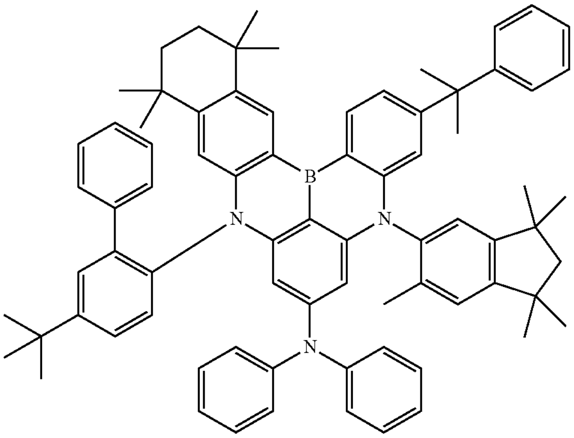
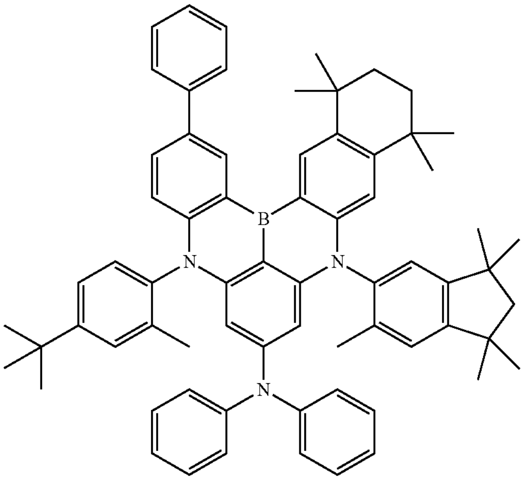
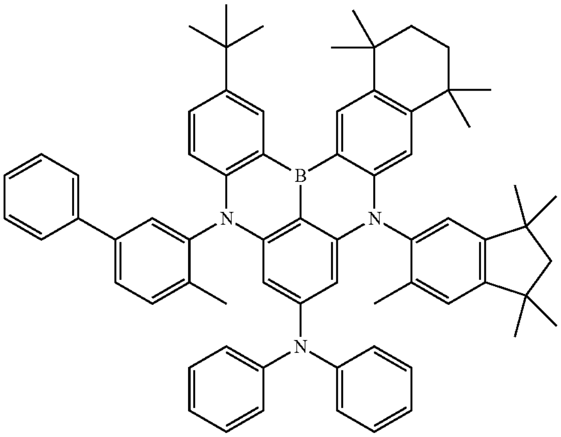

-continued
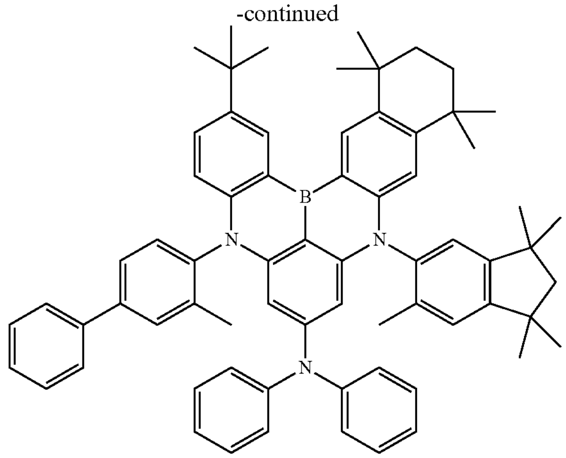
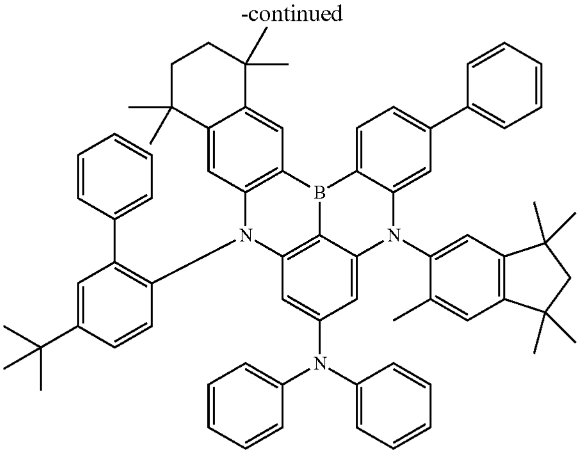
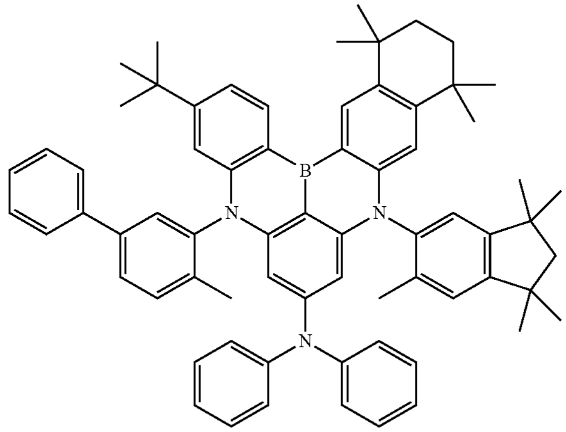
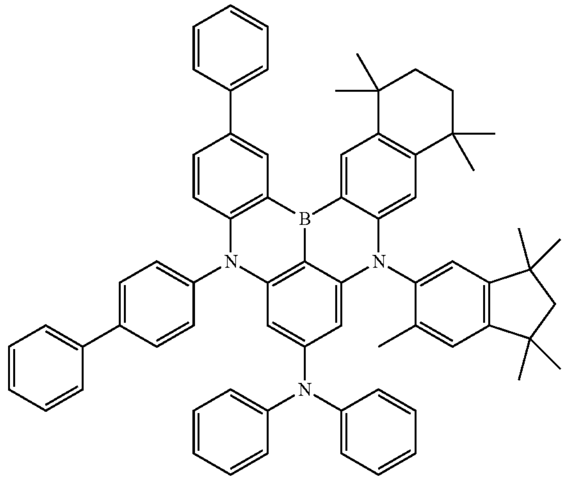
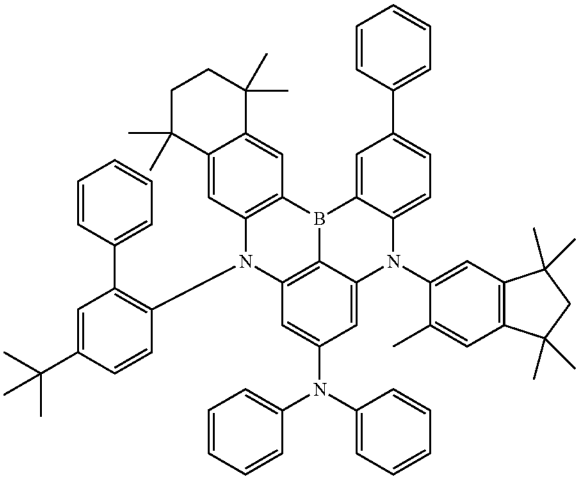
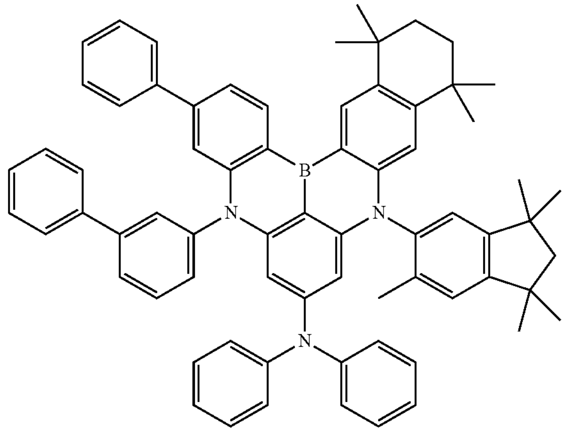

-continued
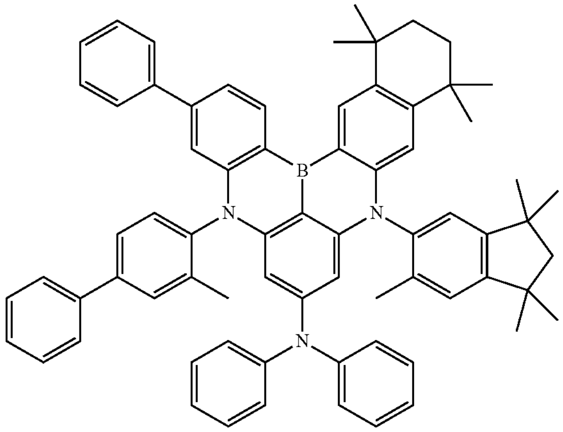
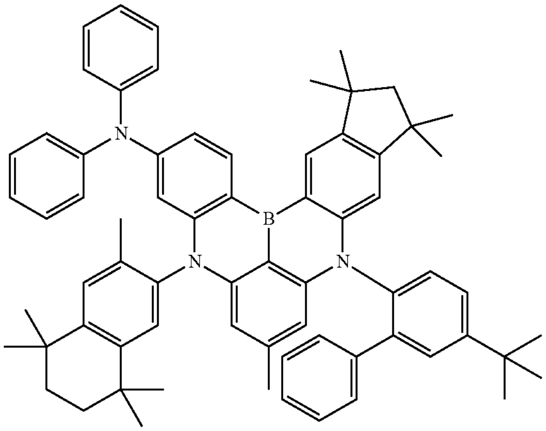
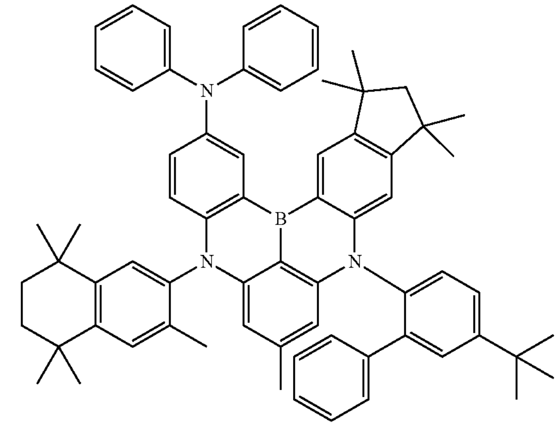
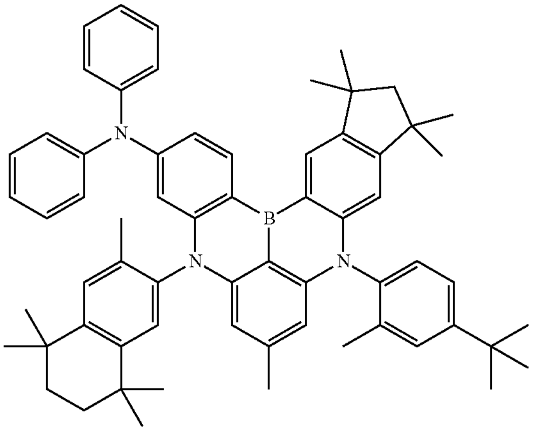
-continued
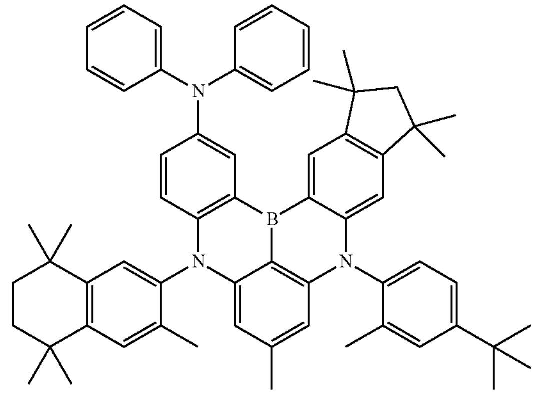
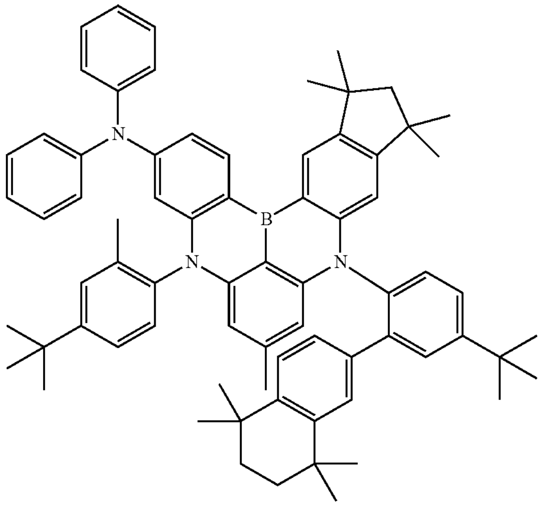
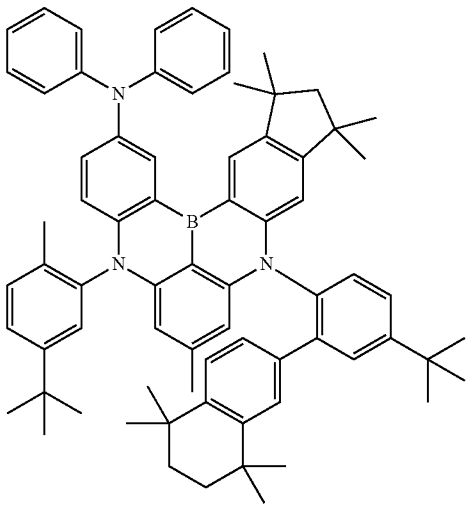

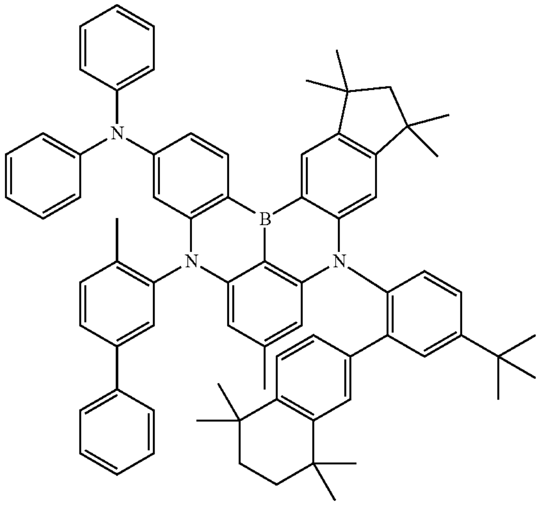
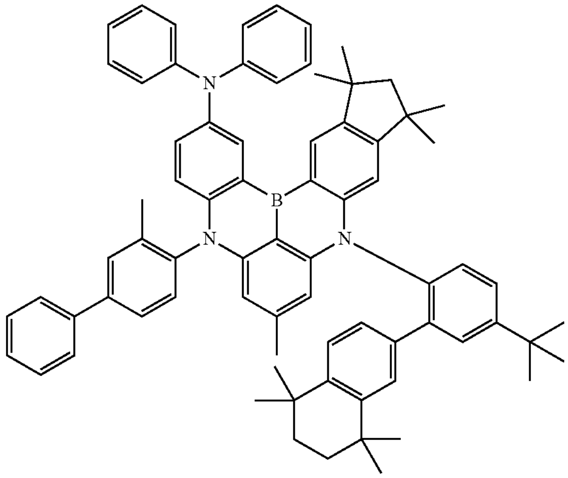
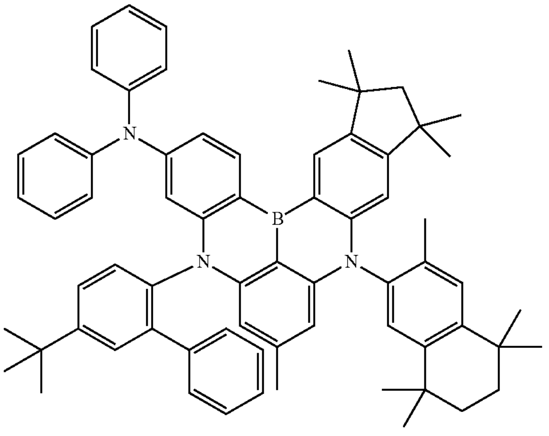
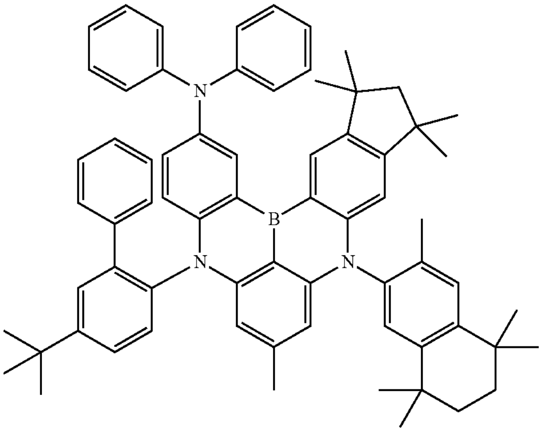
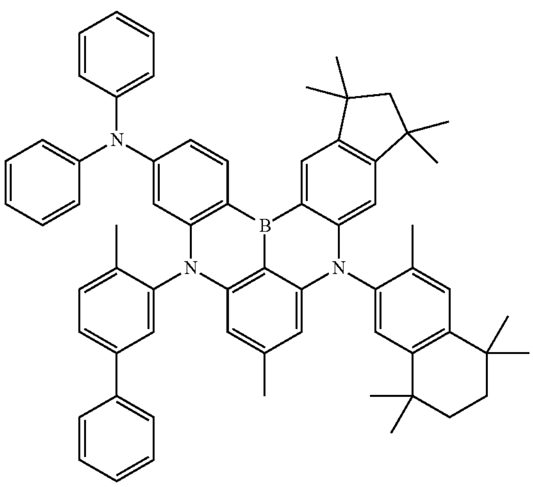
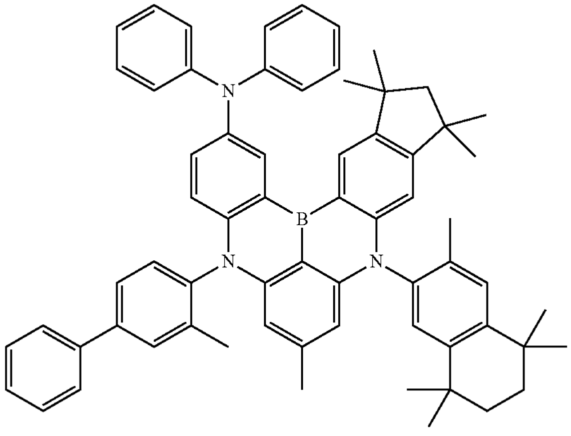

-continued
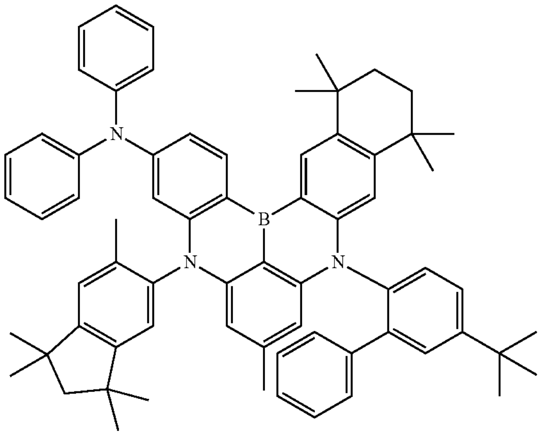
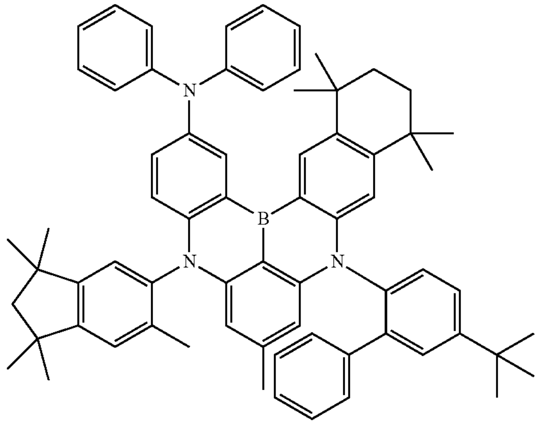
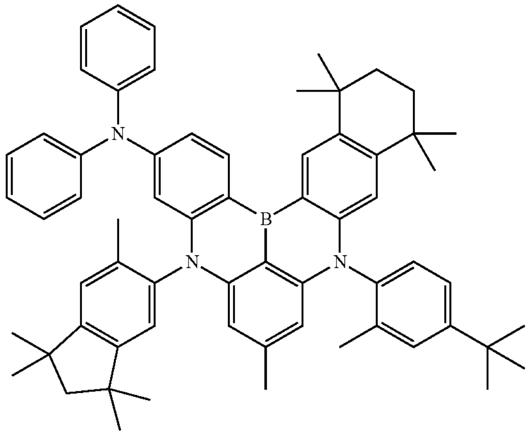
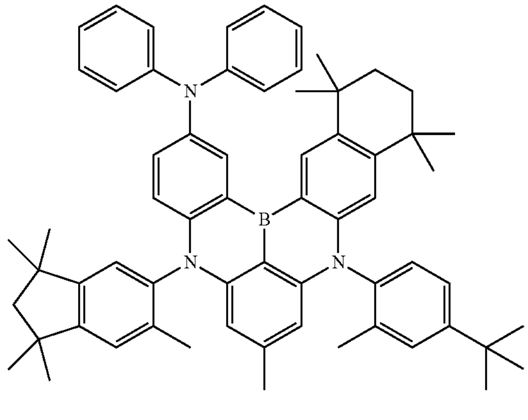
-continued
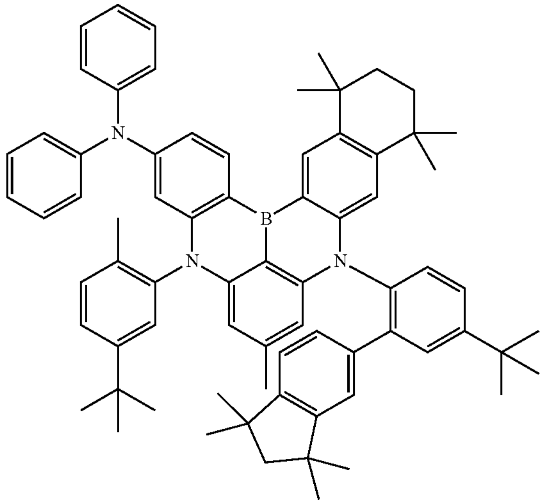
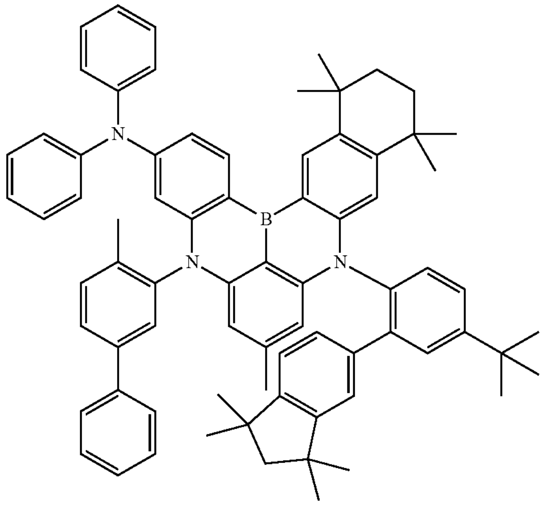
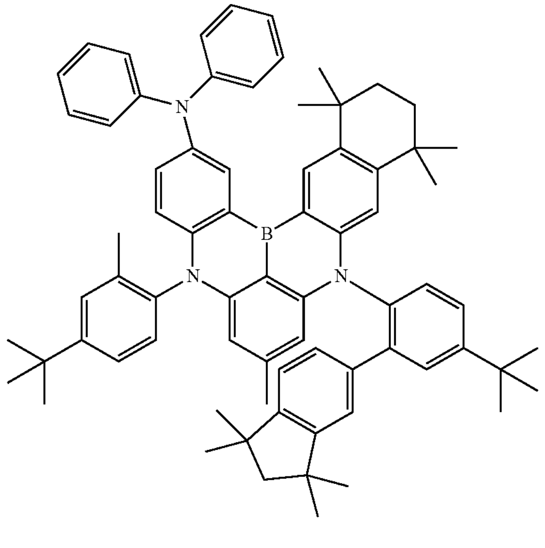

-continued
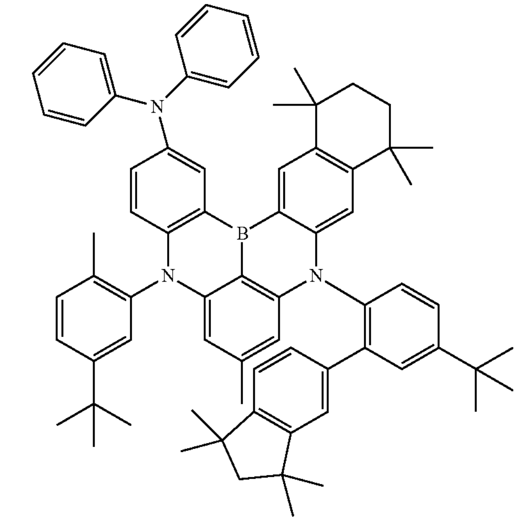
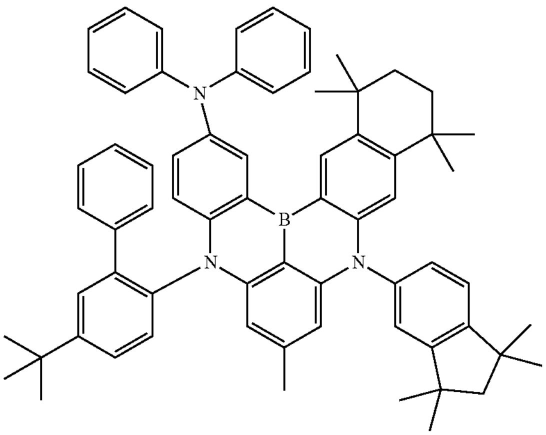
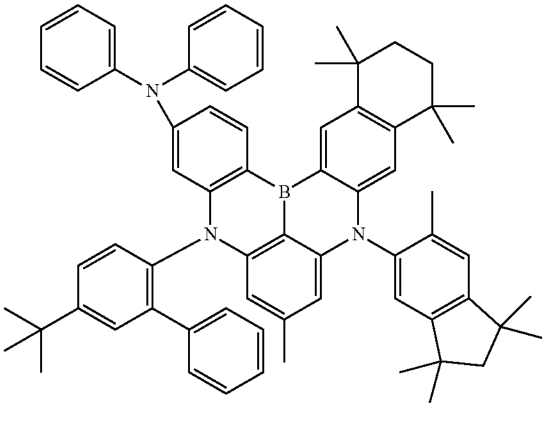
-continued
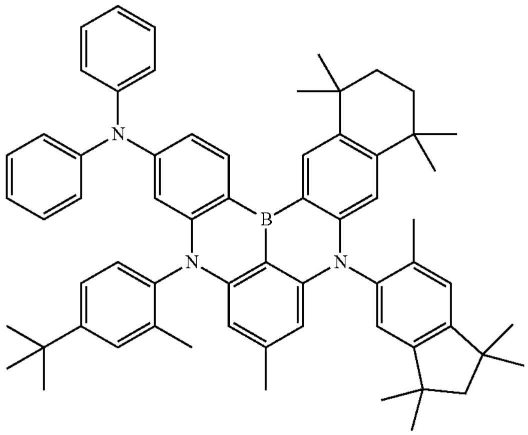
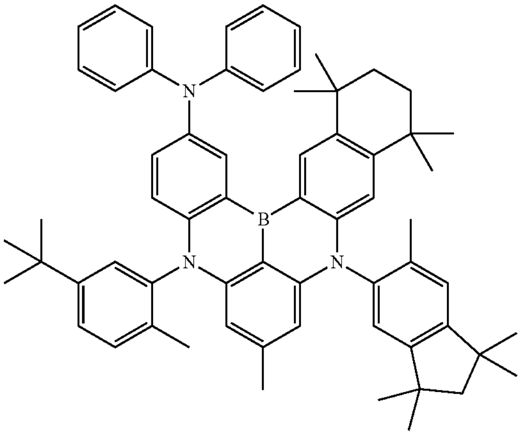
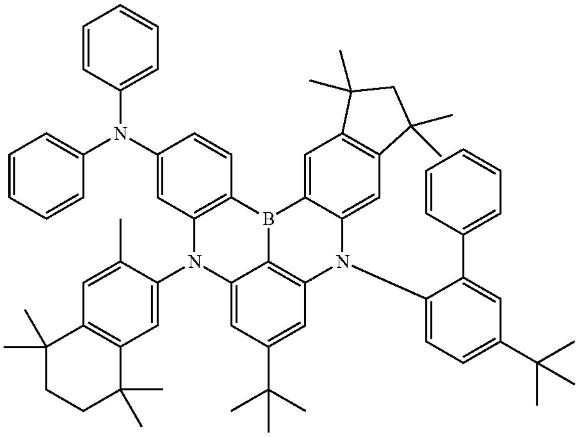

-continued
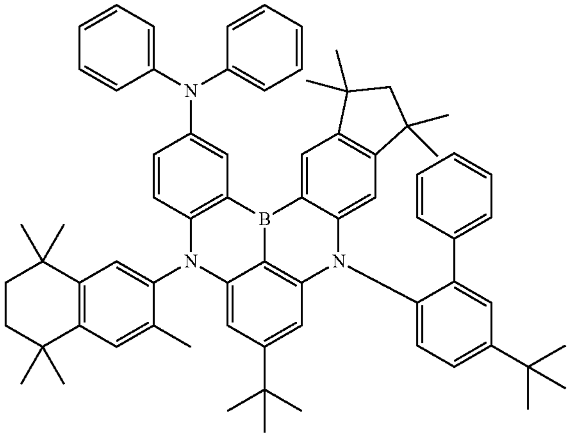
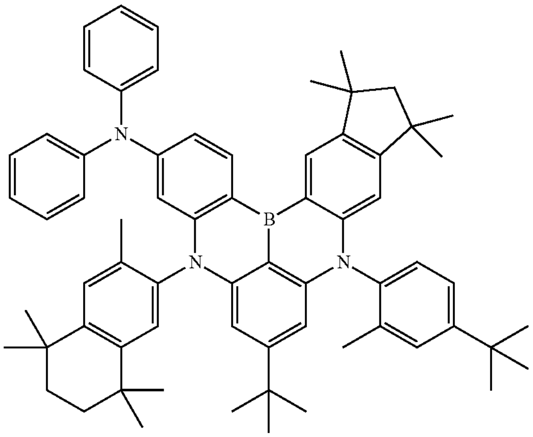
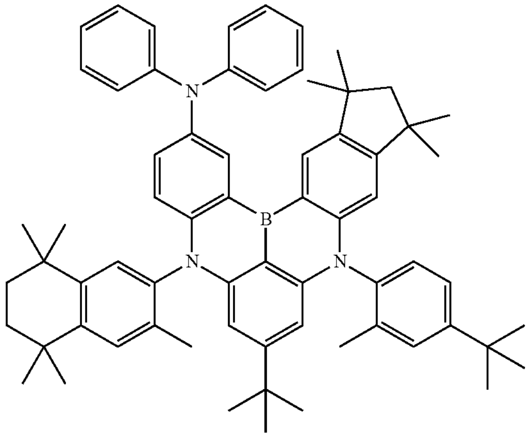
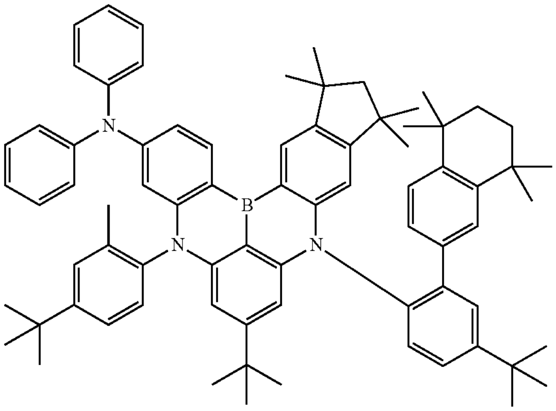
-continued
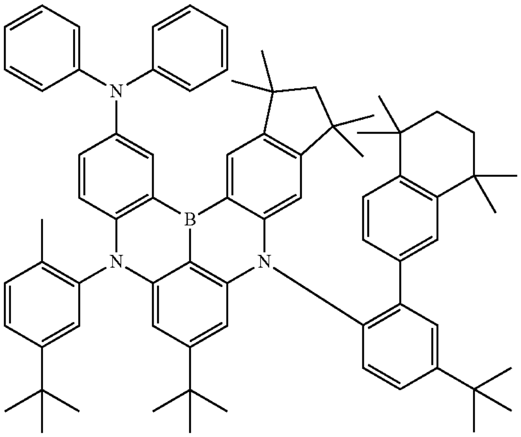
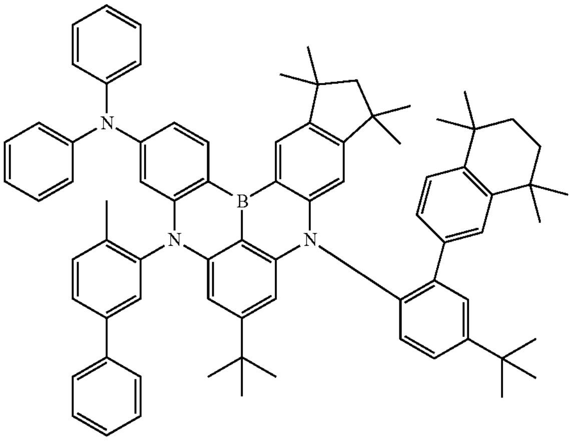
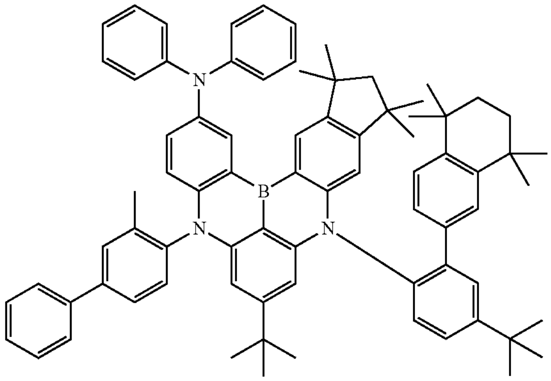
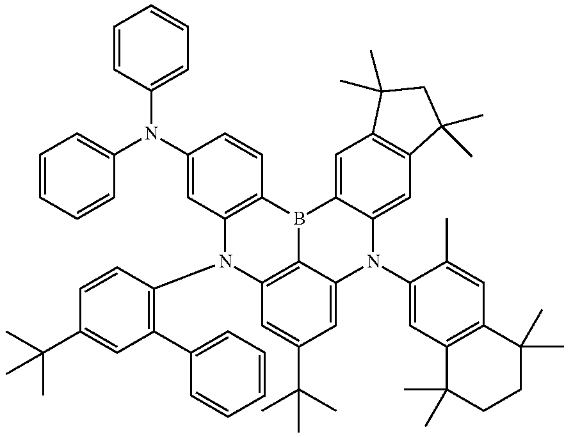

-continued
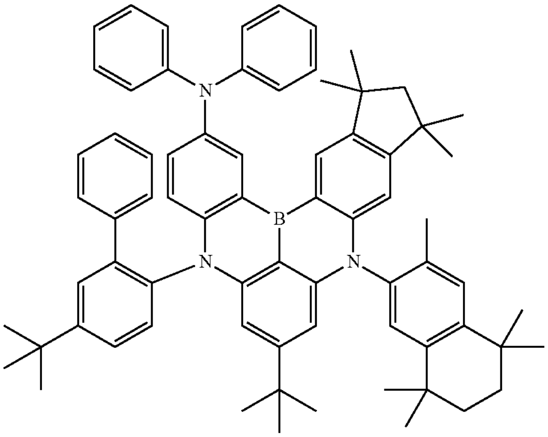
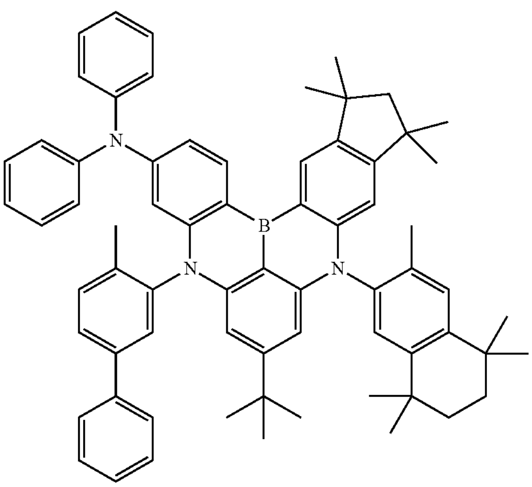
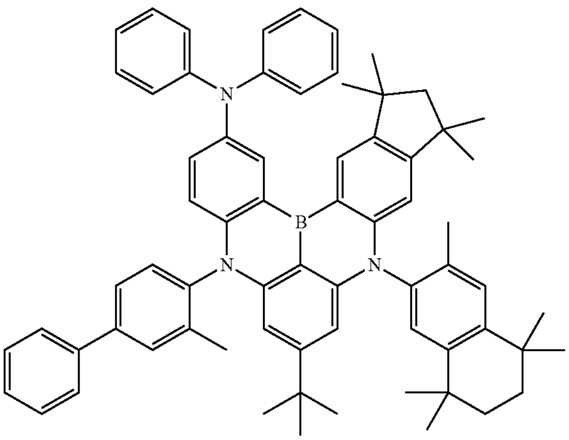
-continued
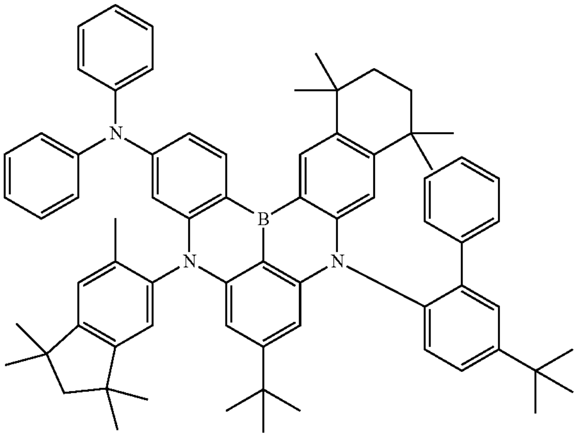
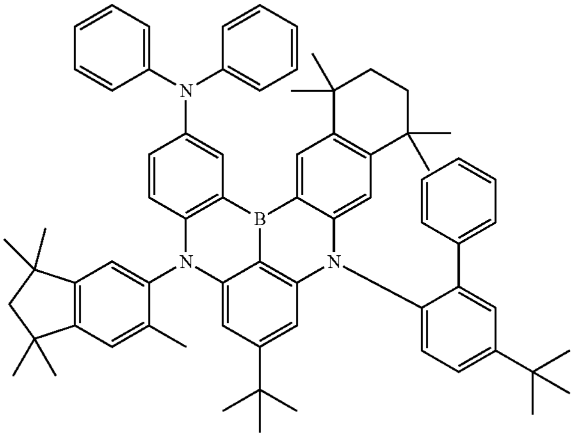
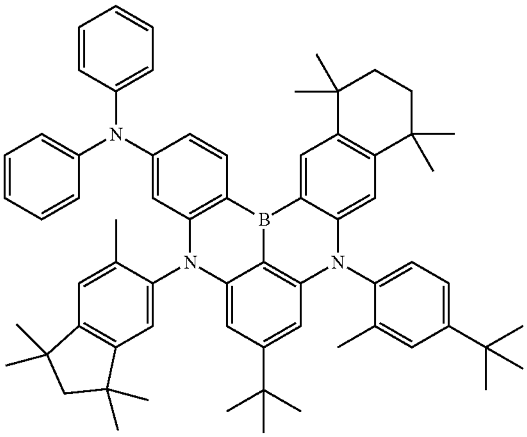

-continued
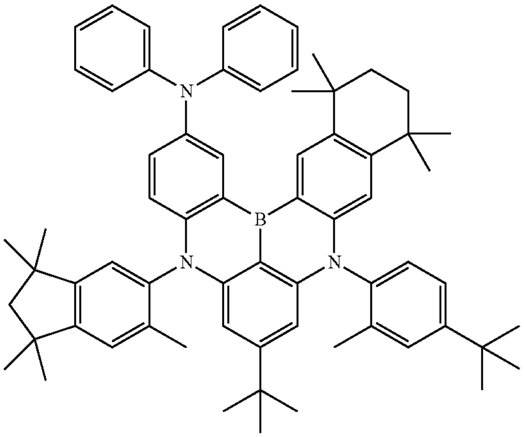
-continued
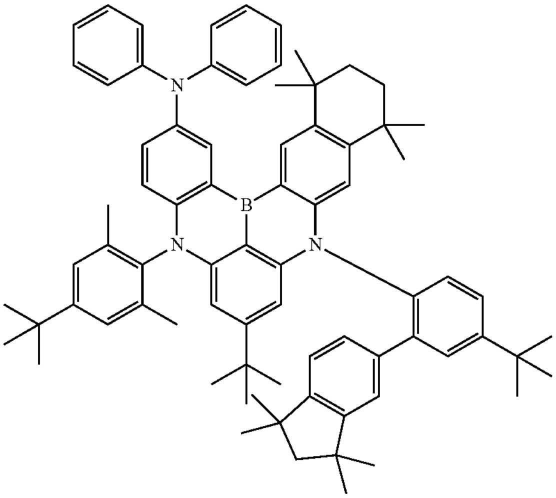
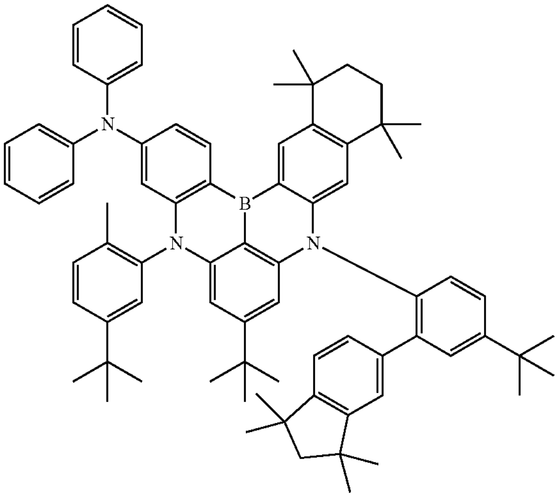
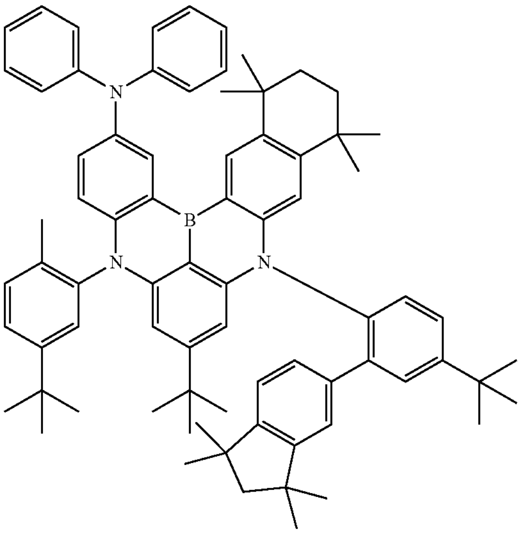
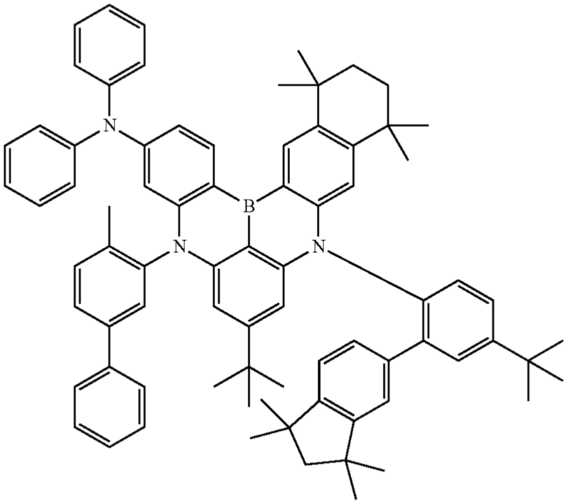
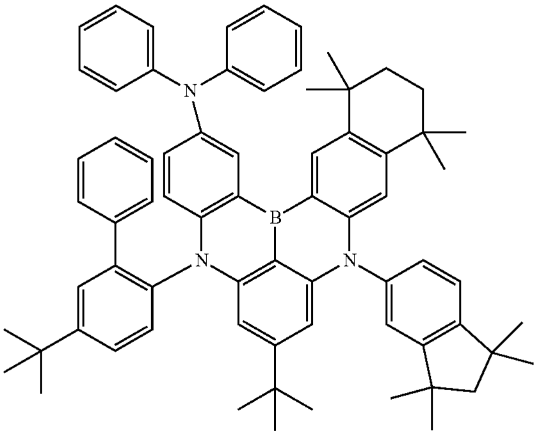

-continued
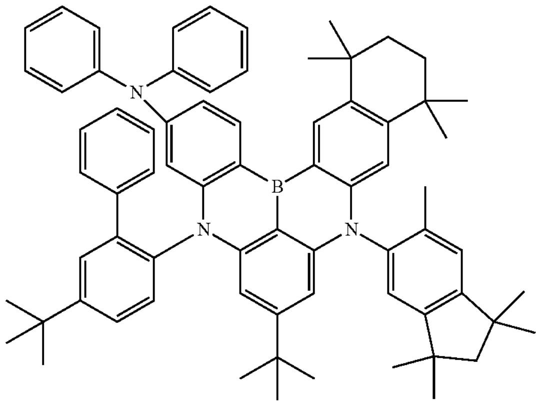
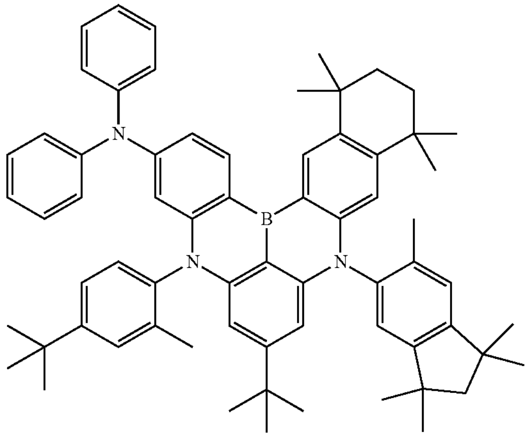
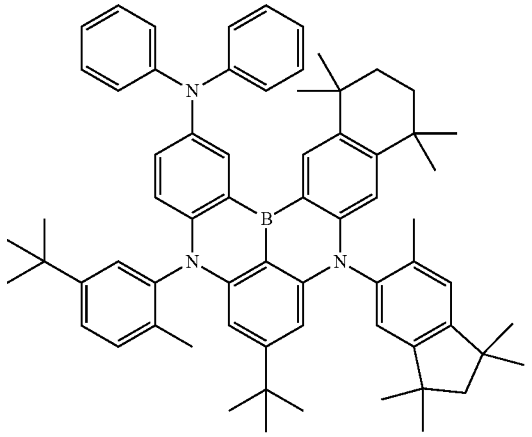
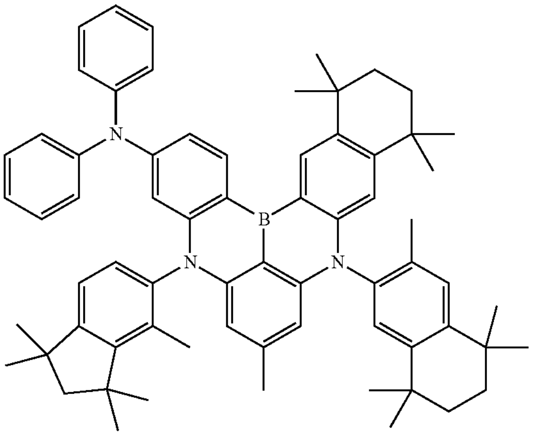
-continued
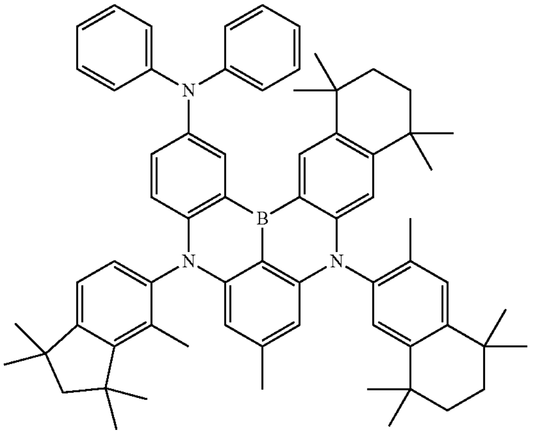
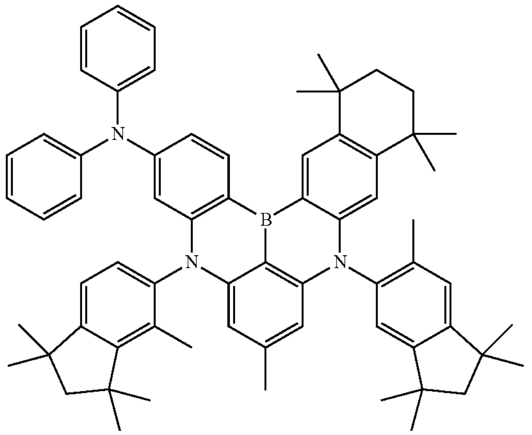
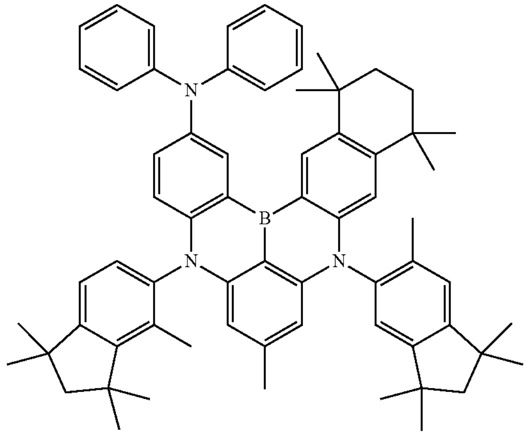

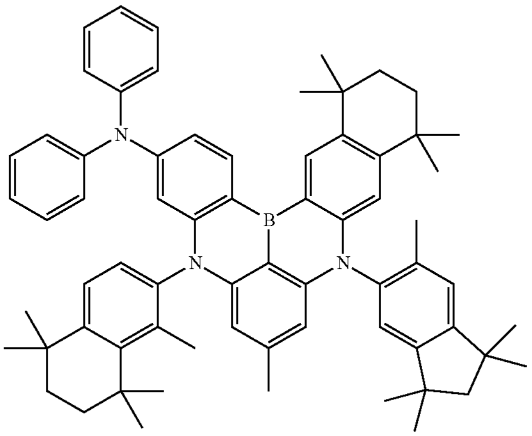
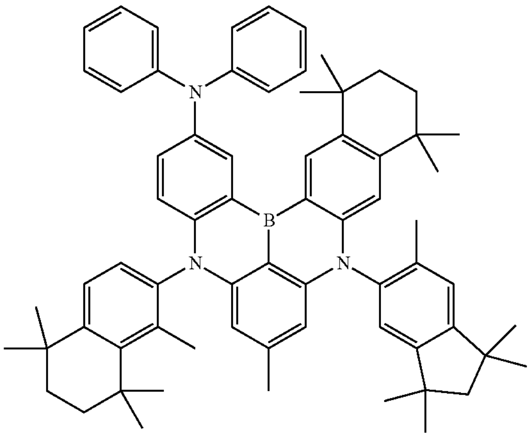
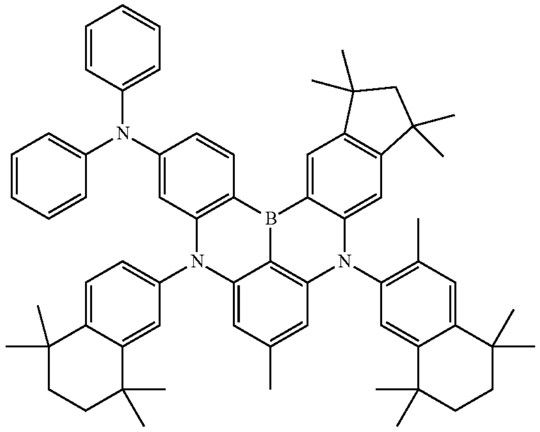
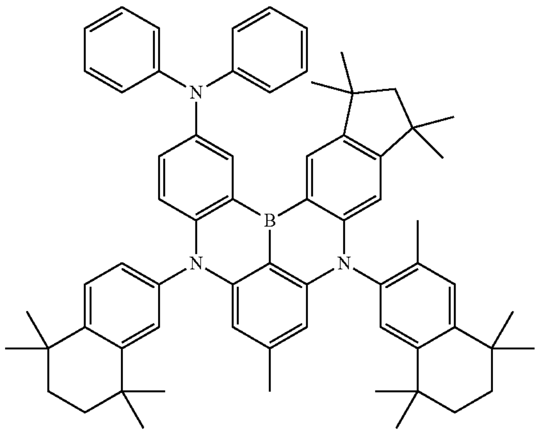
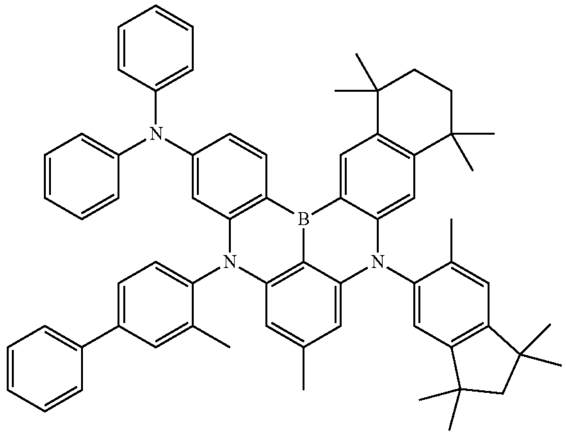
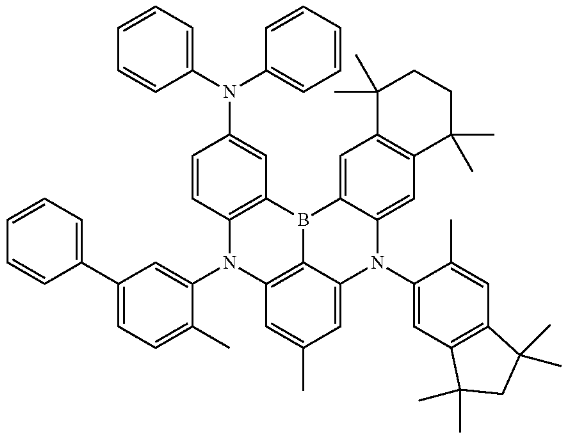

-continued
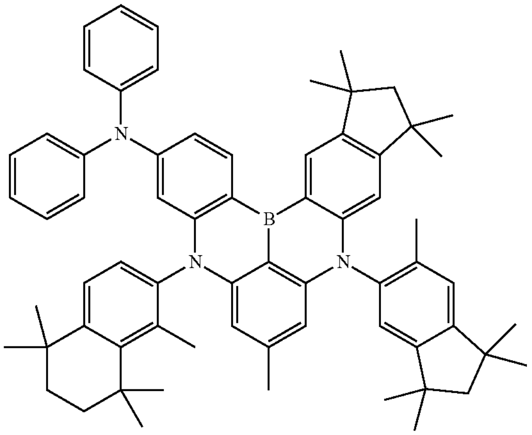
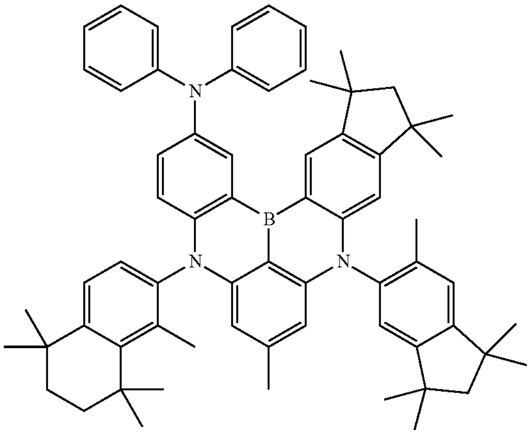
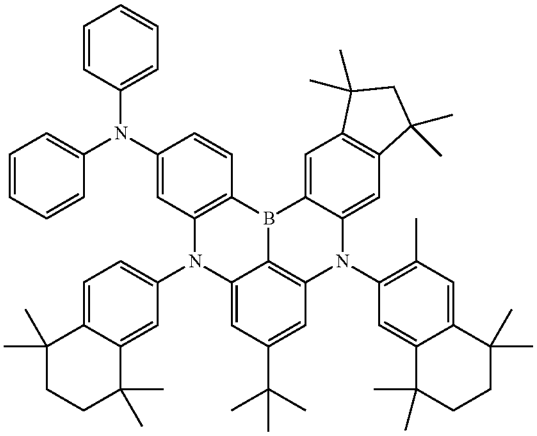
-continued
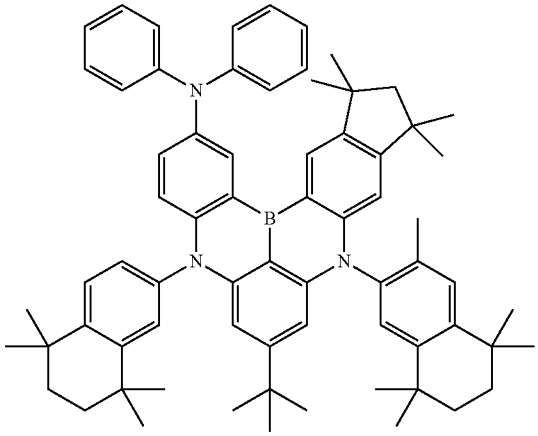
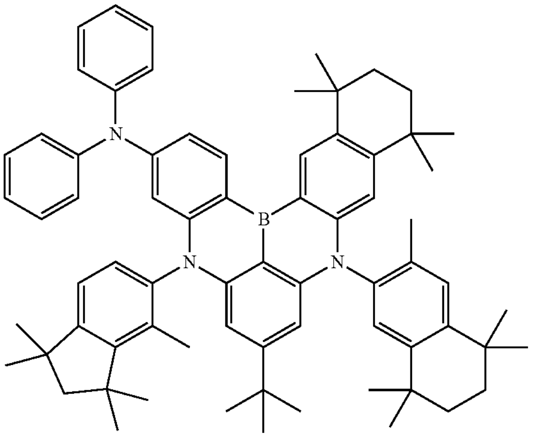
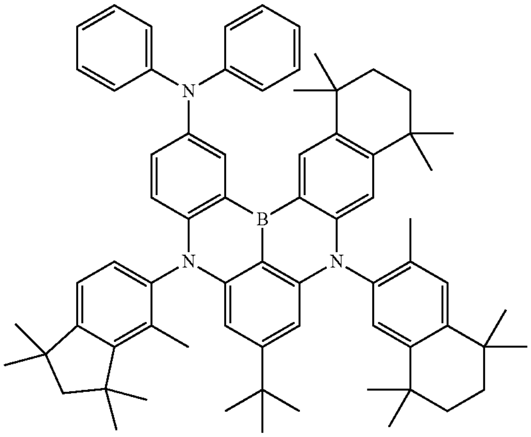

-continued
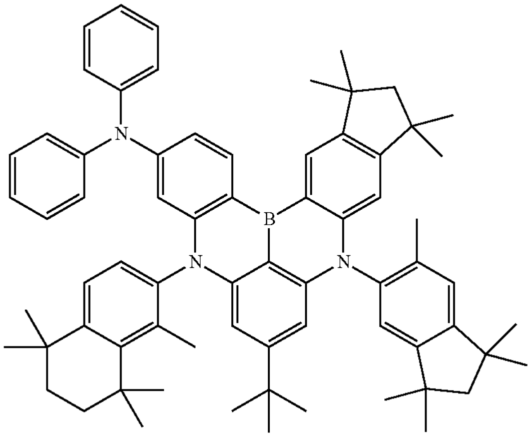
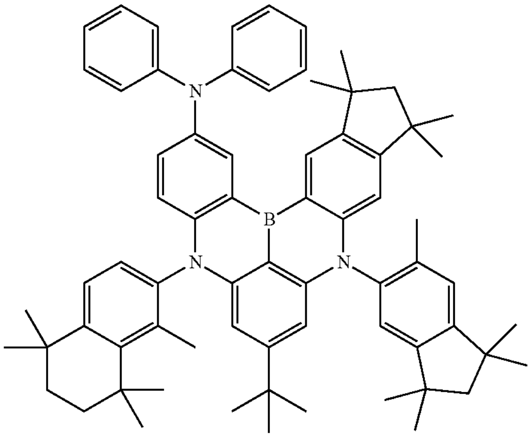
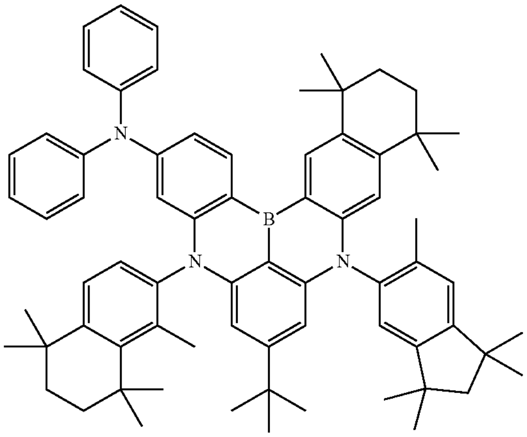
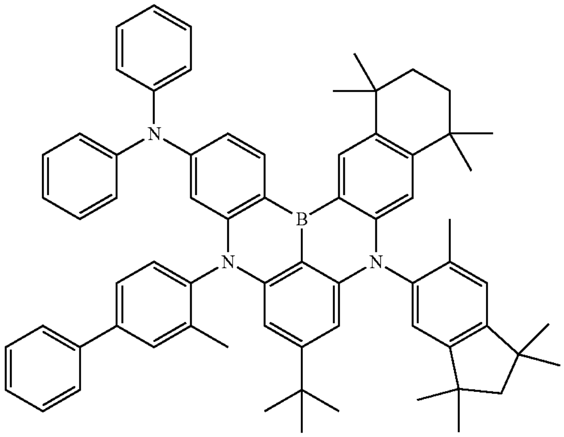
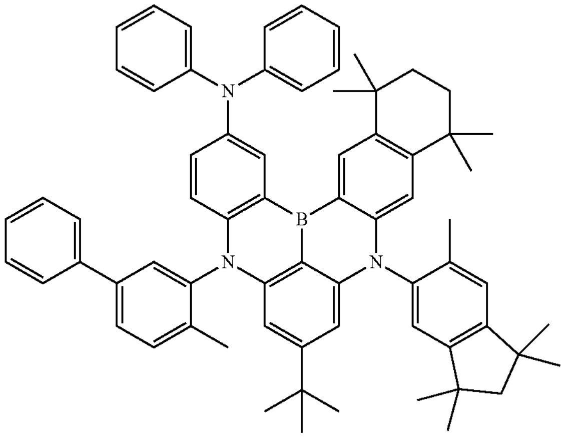
-continued
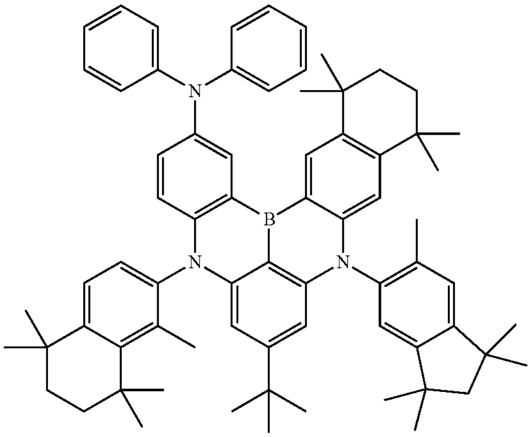

-continued
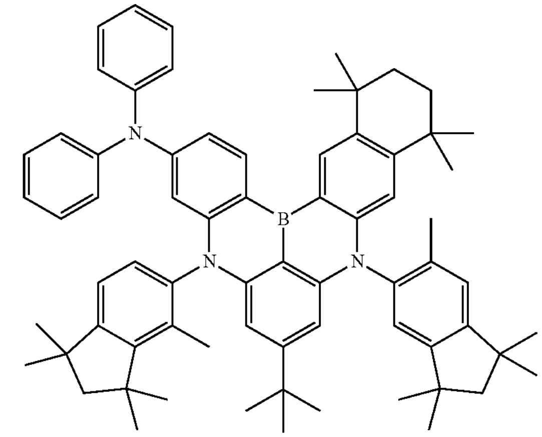
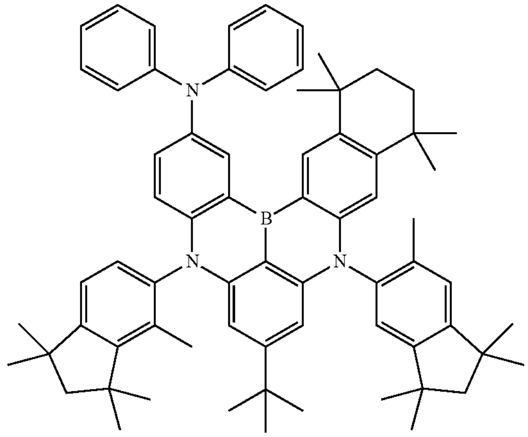
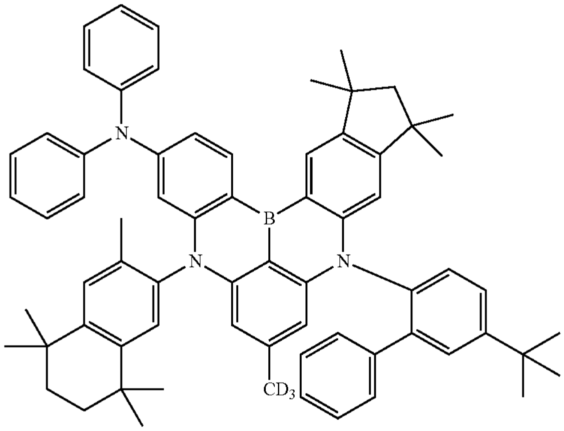
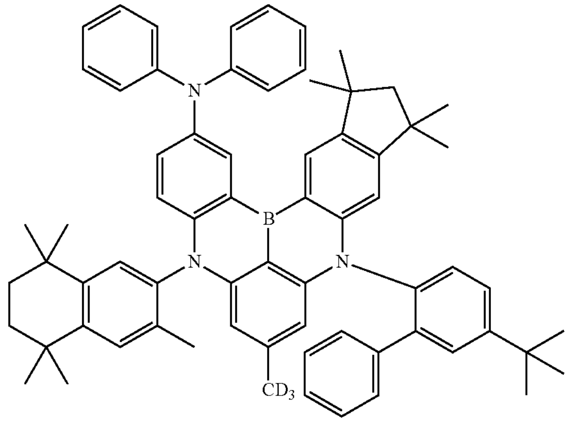
-continued
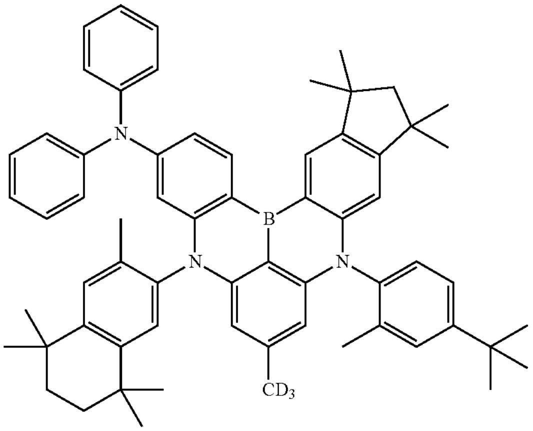
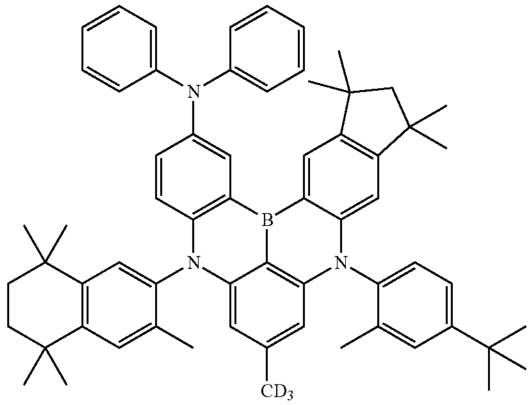
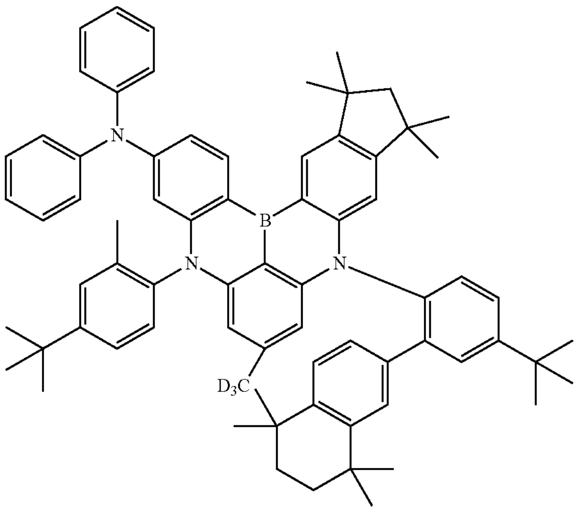

-continued
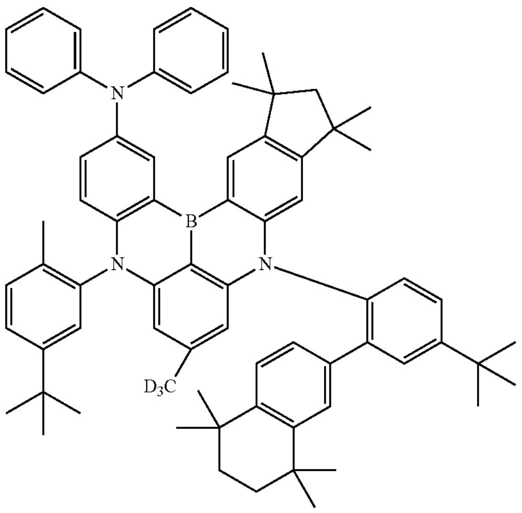
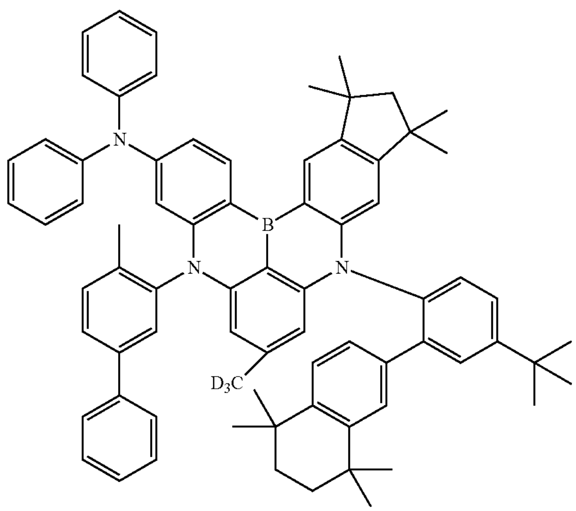
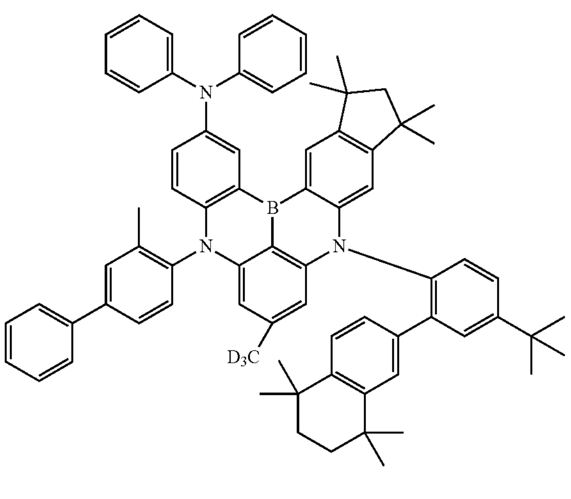
-continued
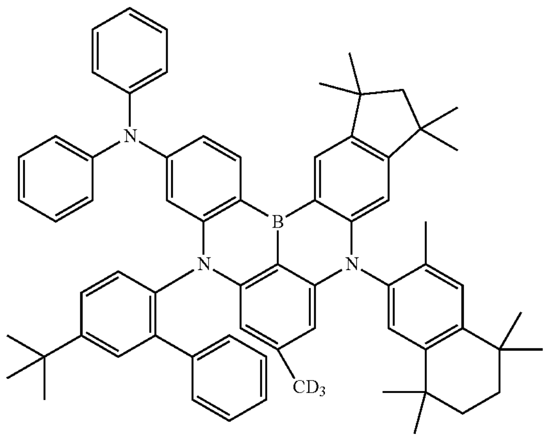
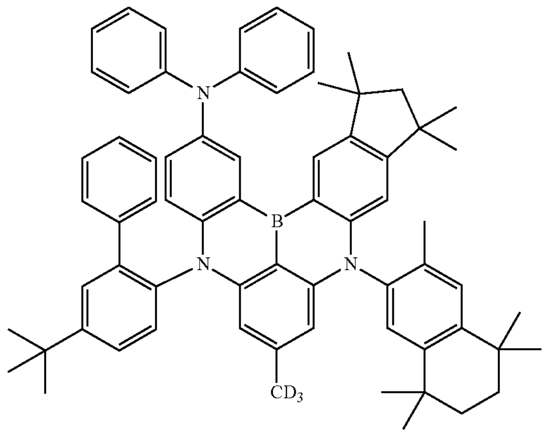
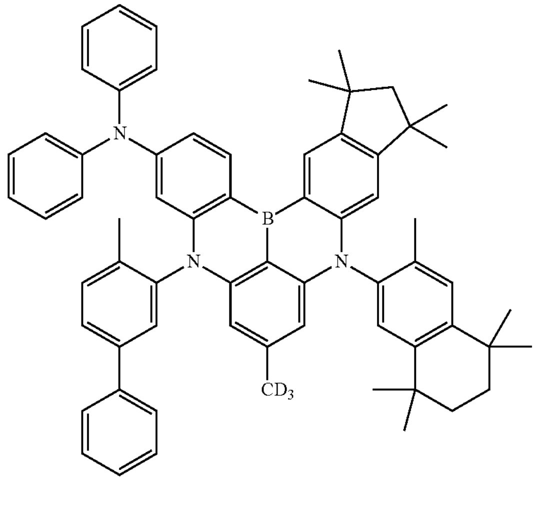

-continued
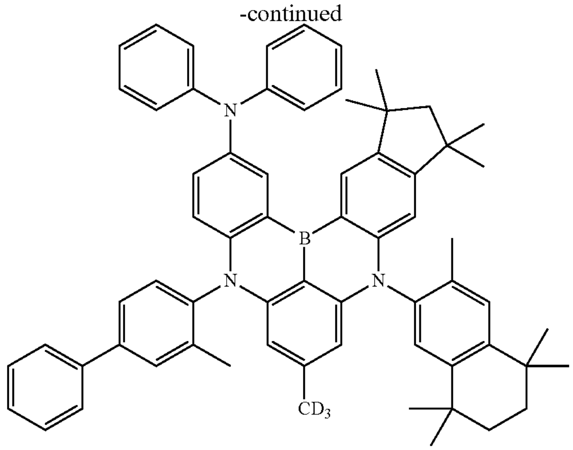
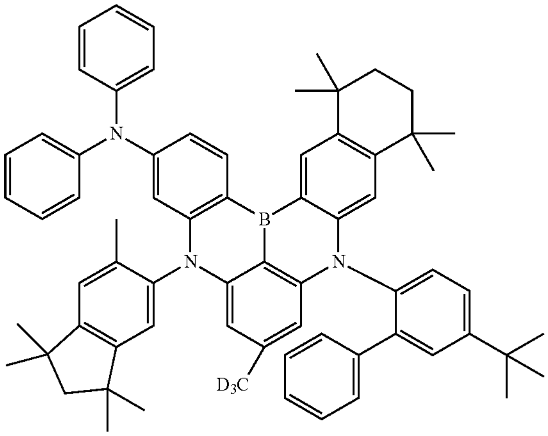
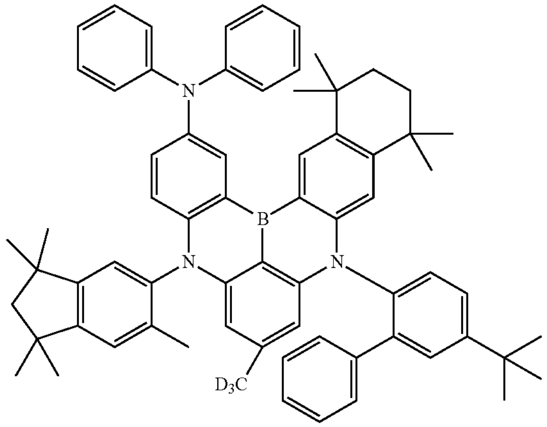
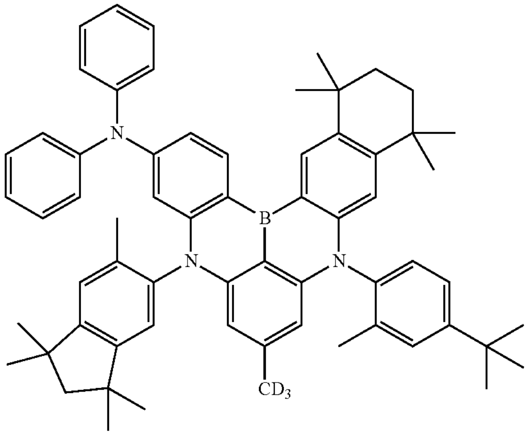
-continued
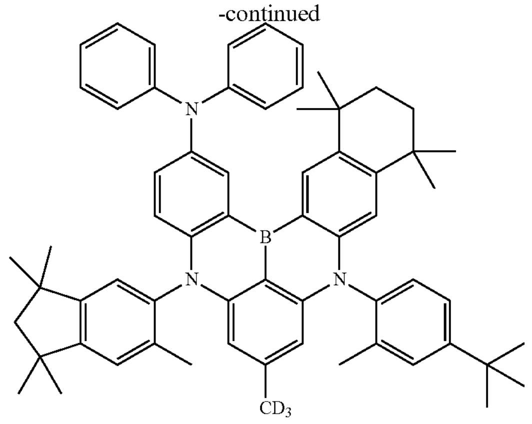
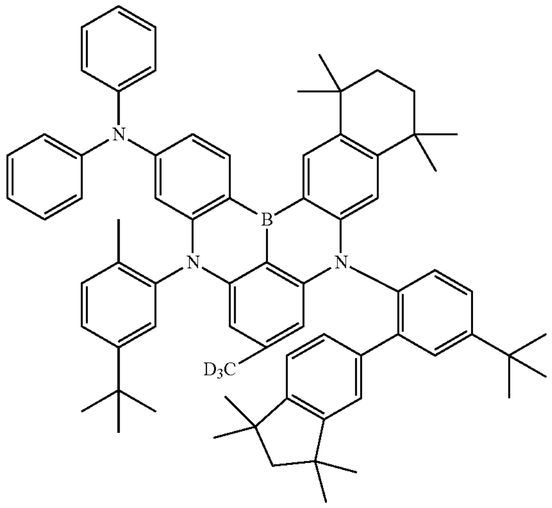
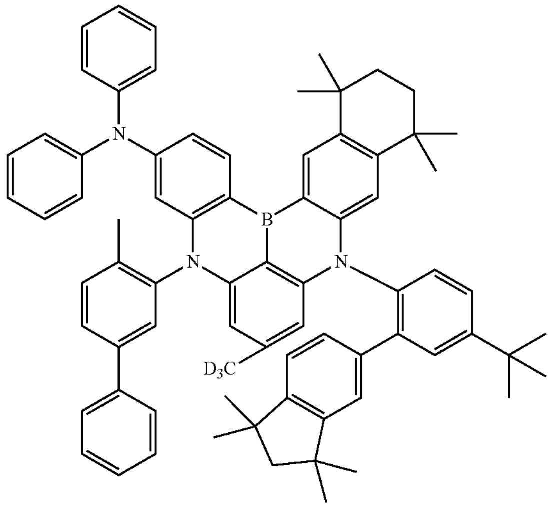

-continued
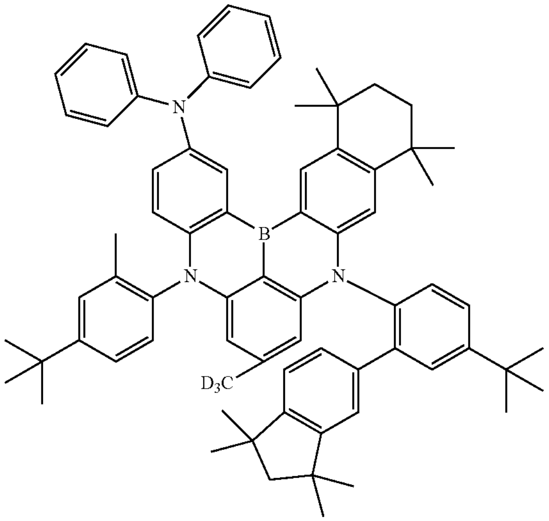
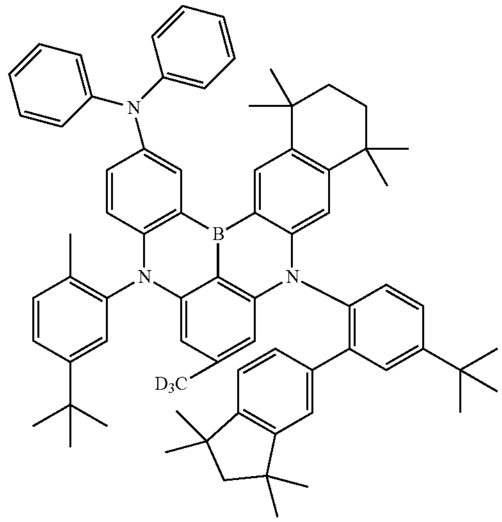
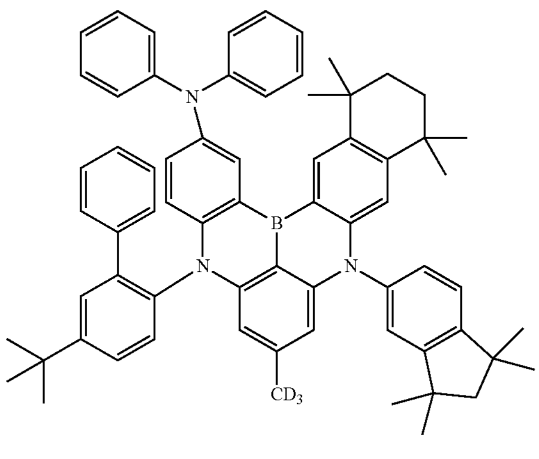
-continued
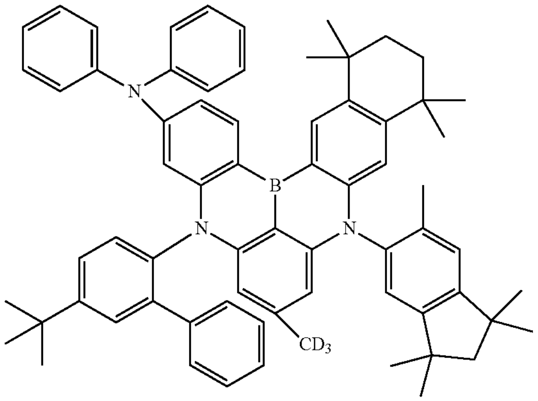
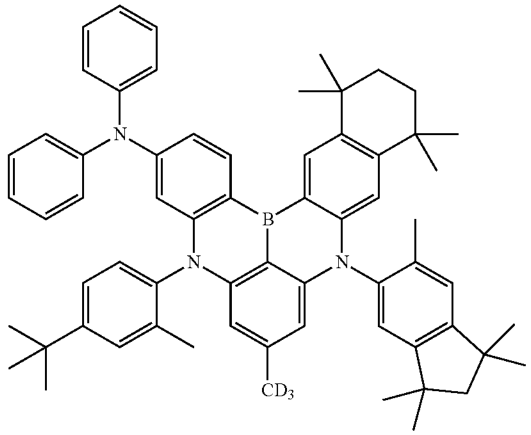
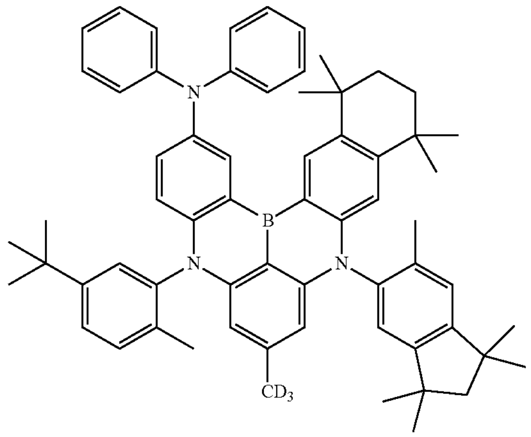
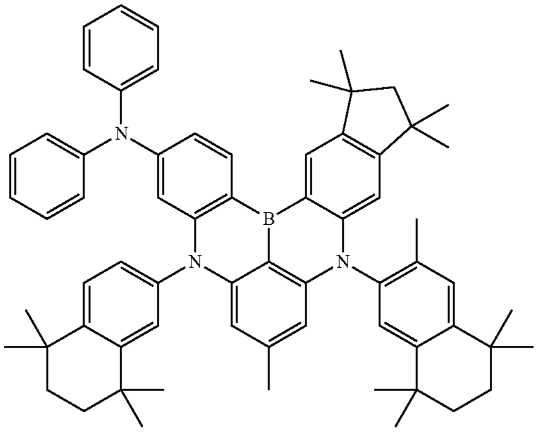

-continued
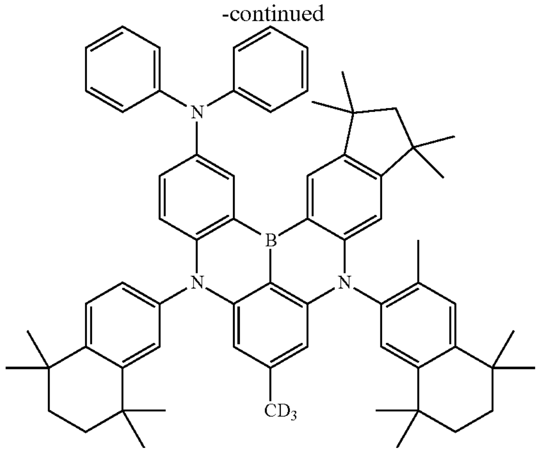
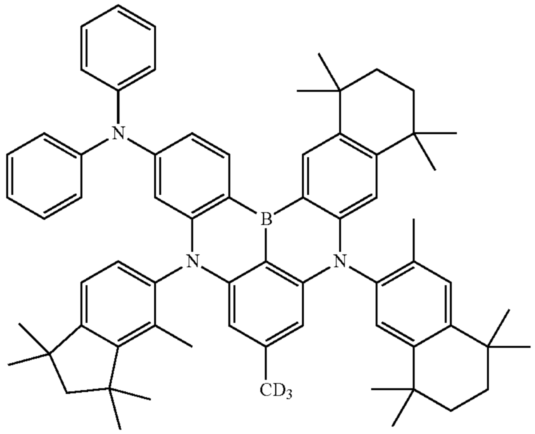
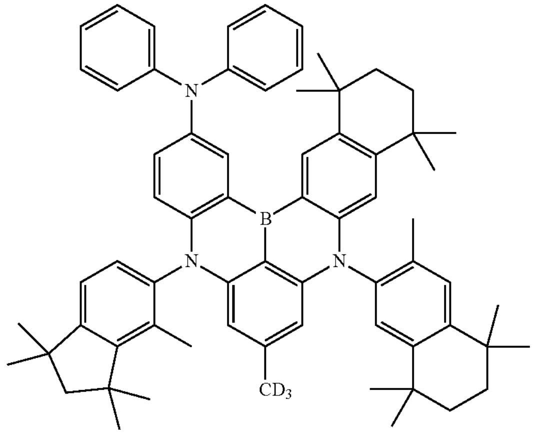
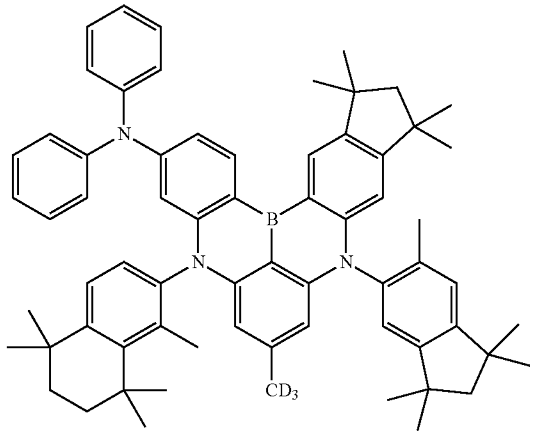
-continued
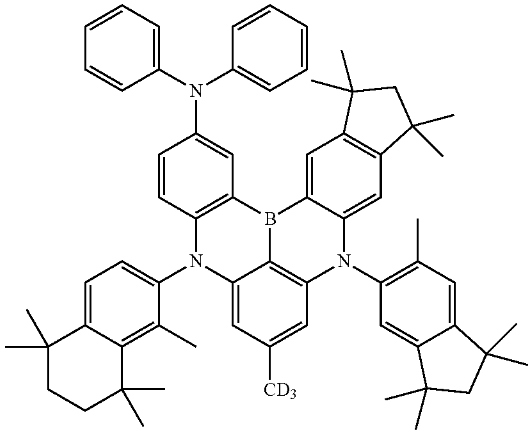
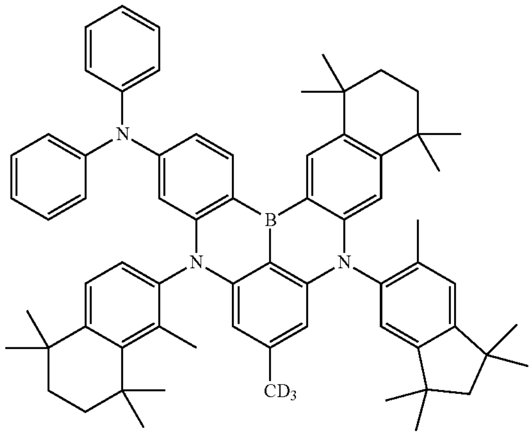
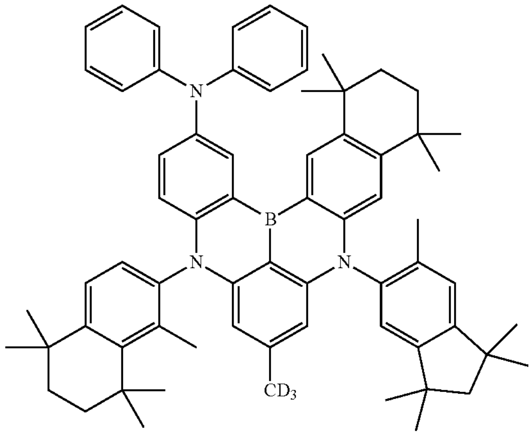

-continued
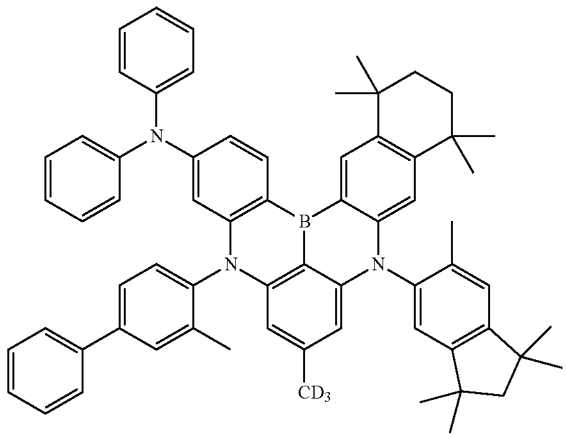
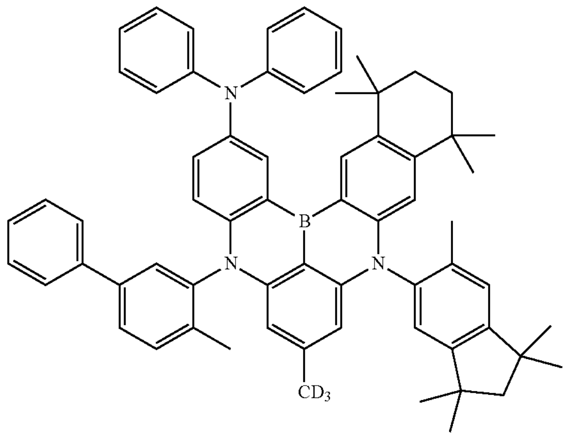
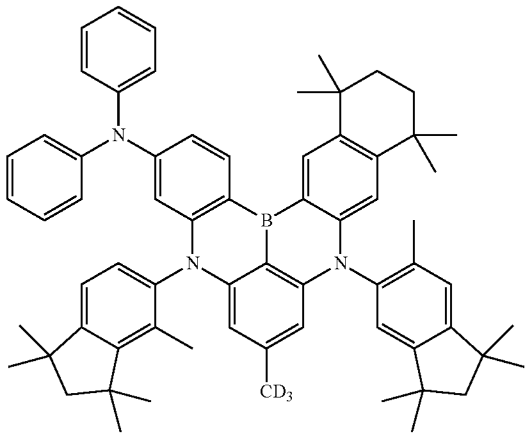
-continued
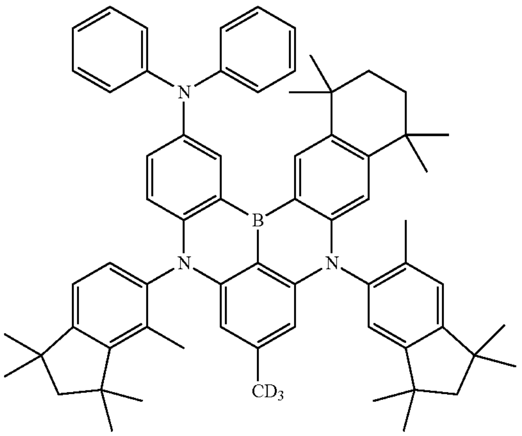
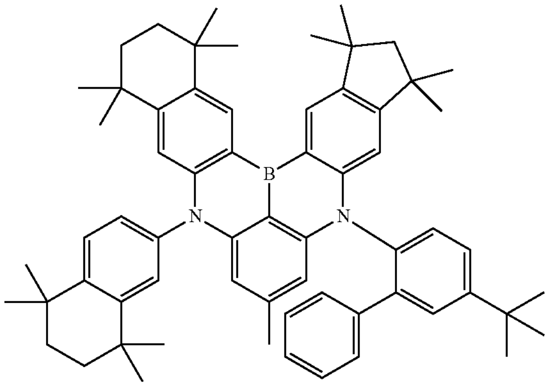
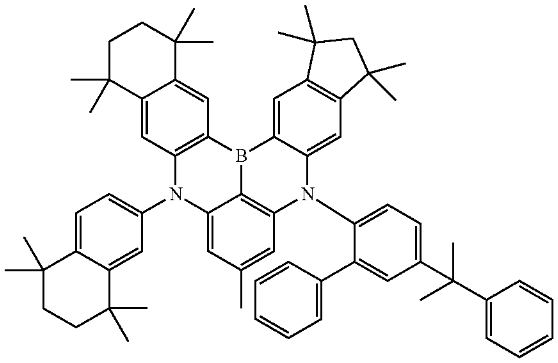
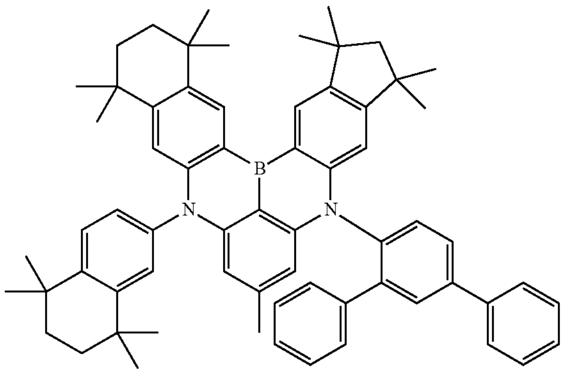

-continued
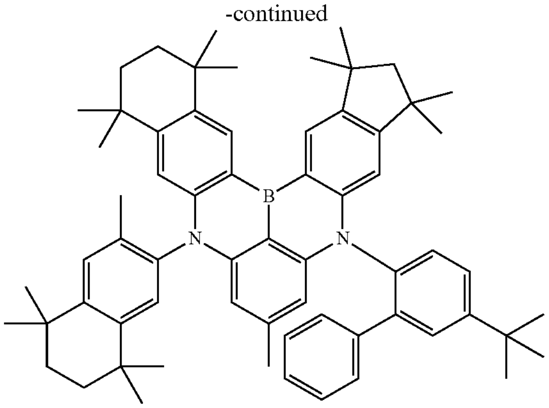
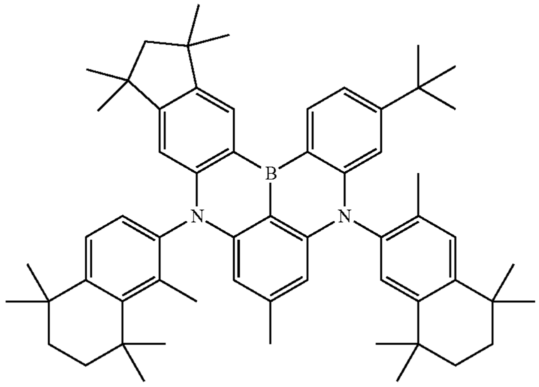
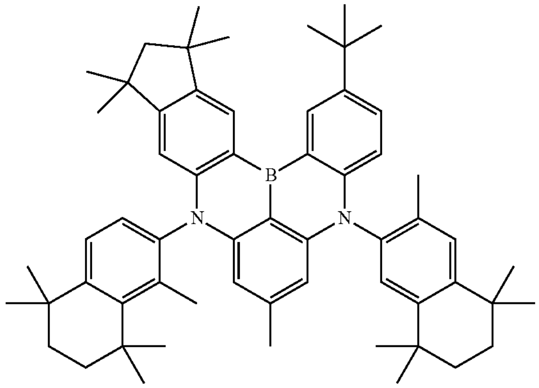
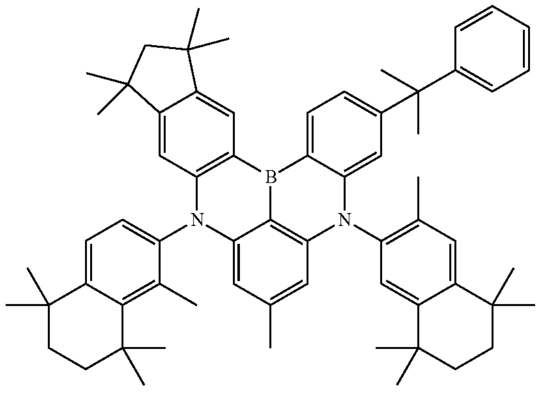
-continued
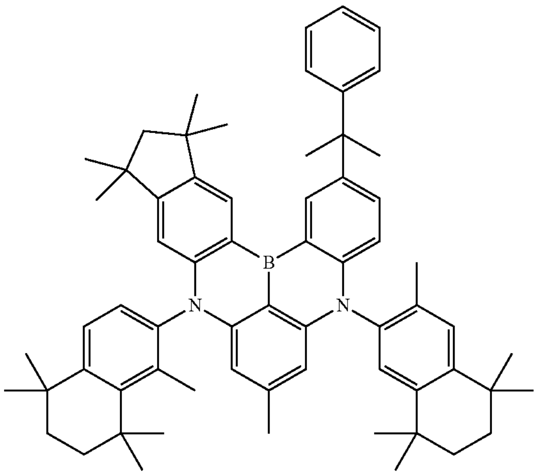
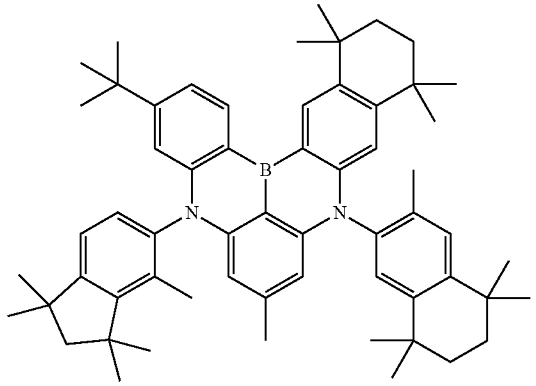
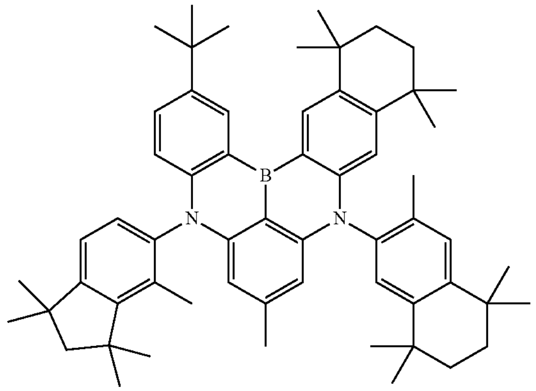
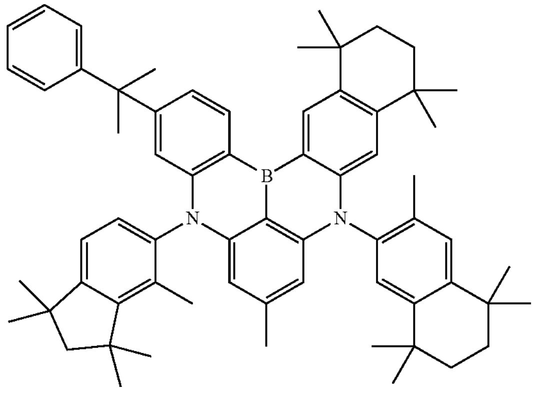

-continued
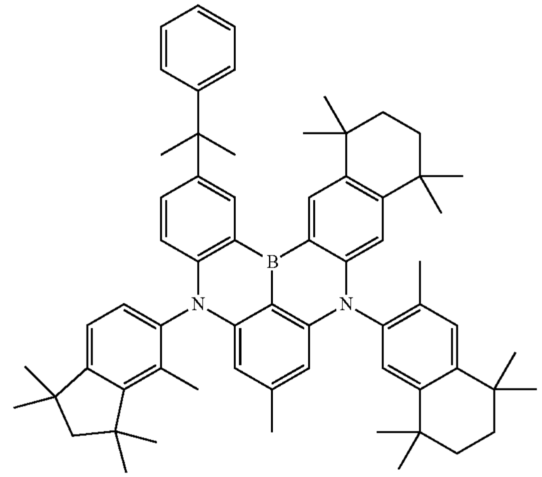
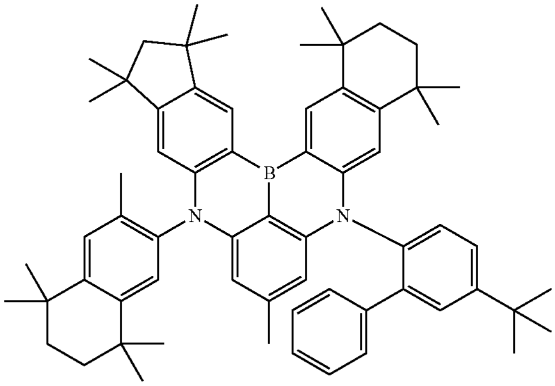
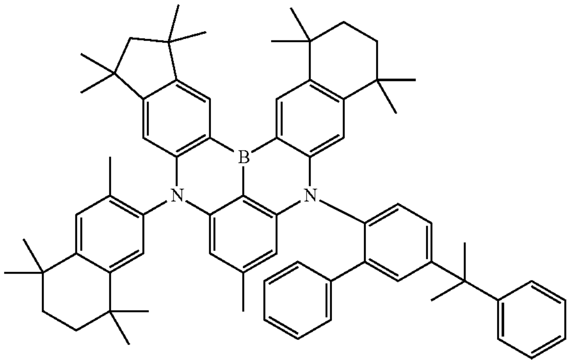
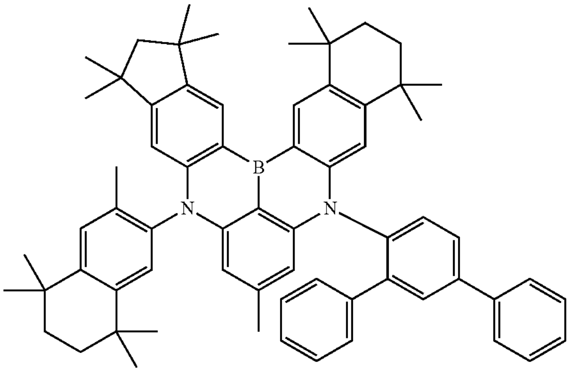
-continued
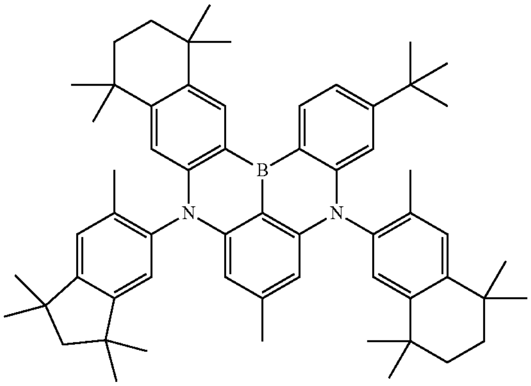
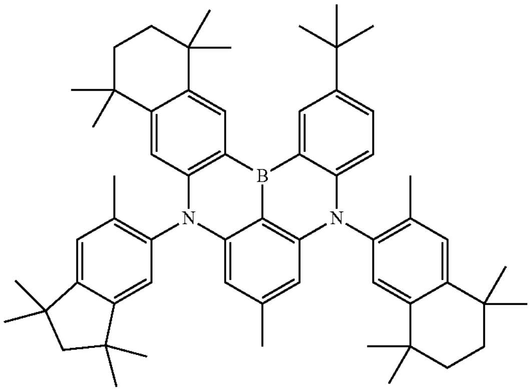
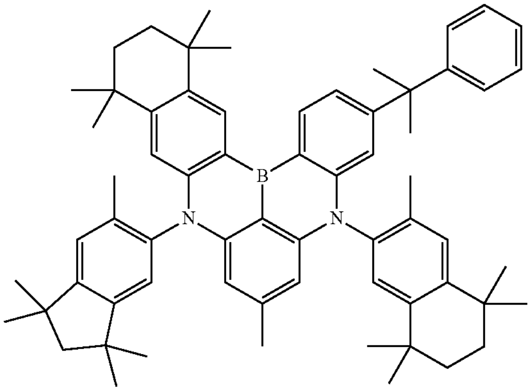
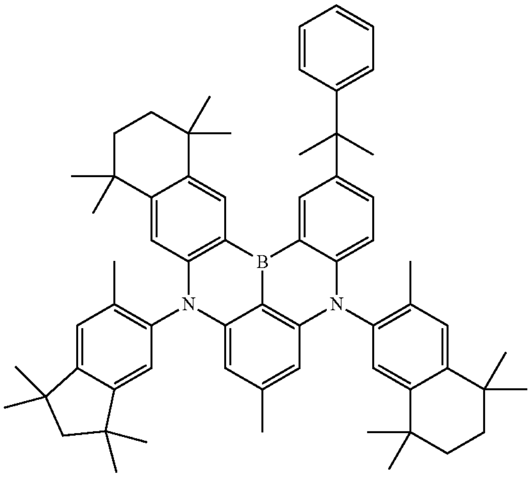

-continued
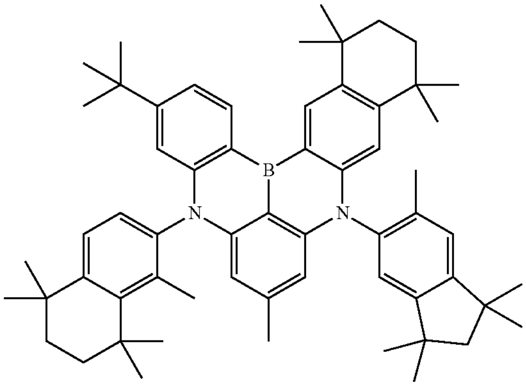
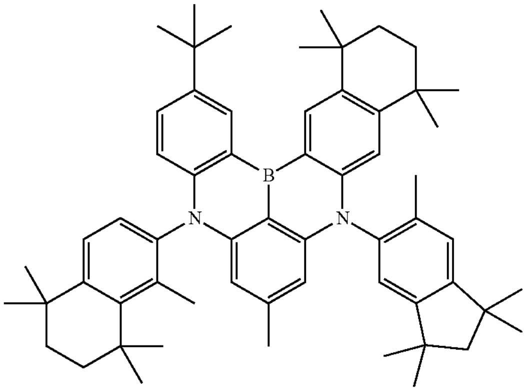
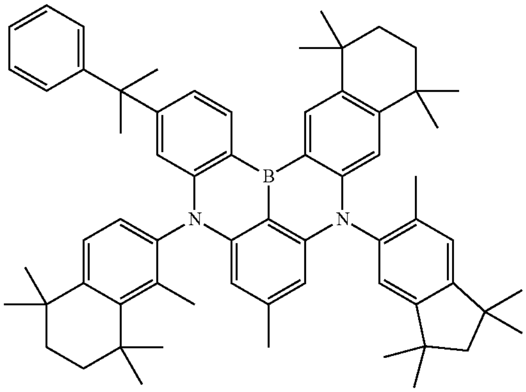
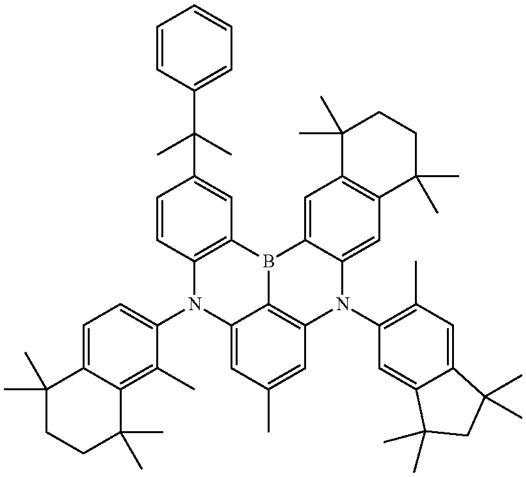
-continued
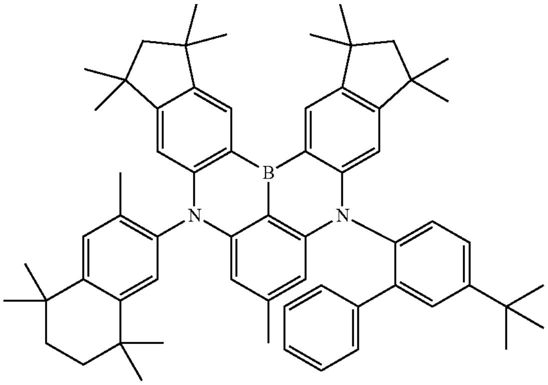
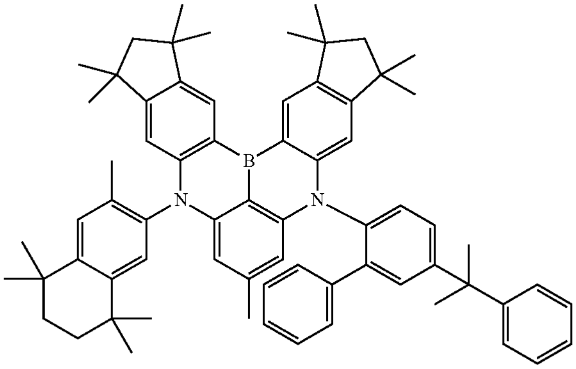
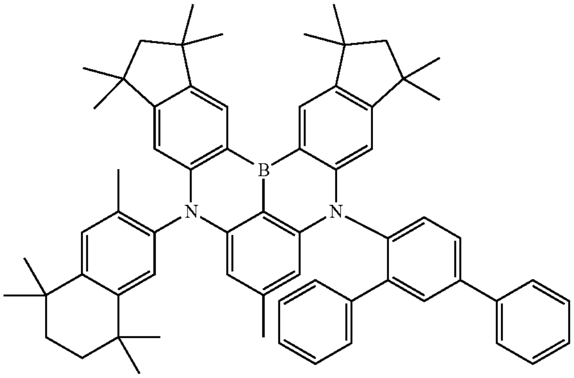
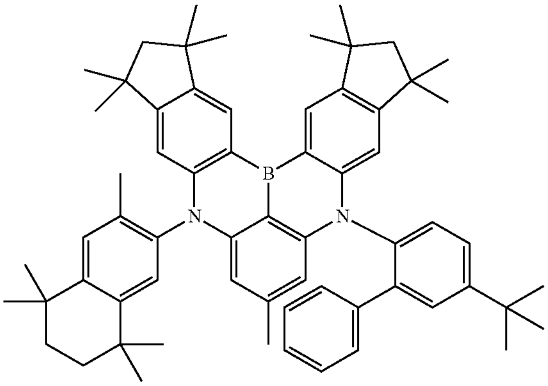

-continued
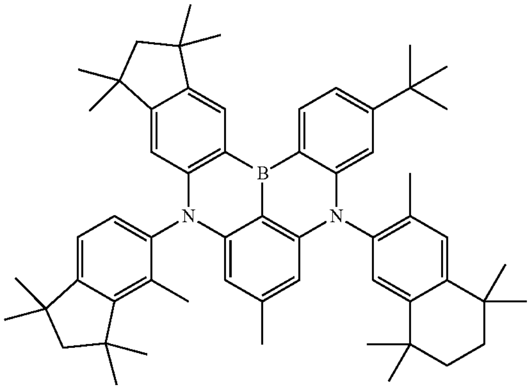
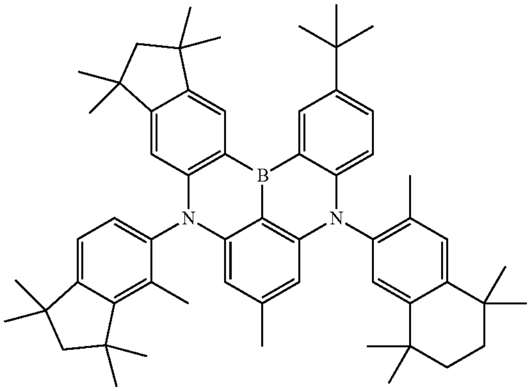
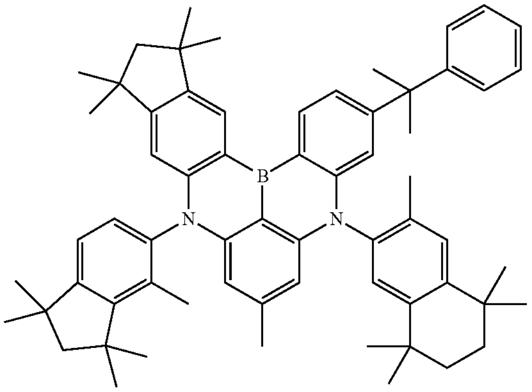
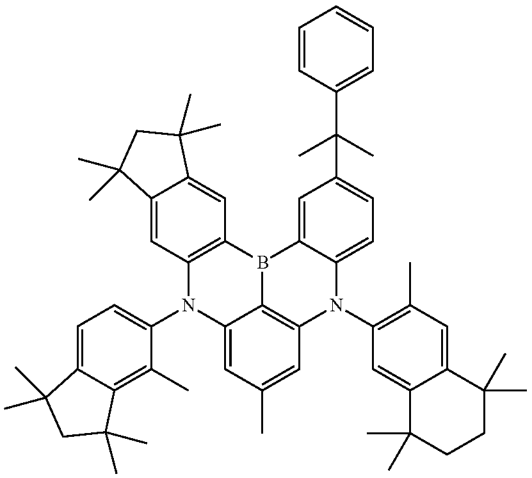
-continued
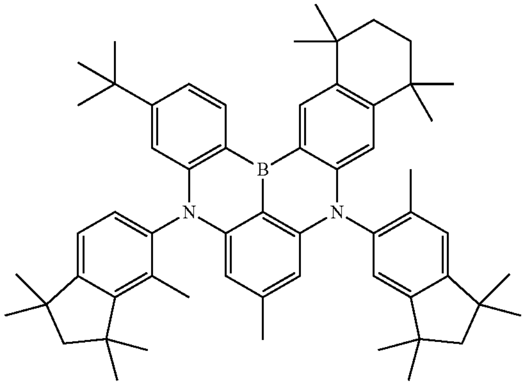
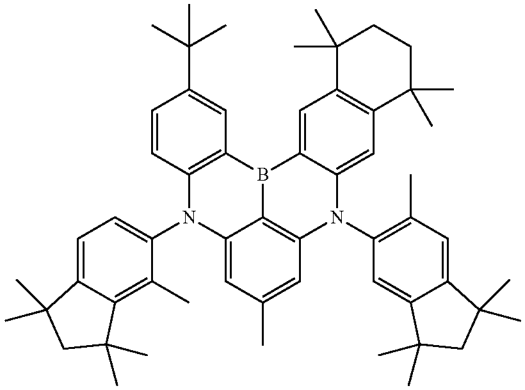
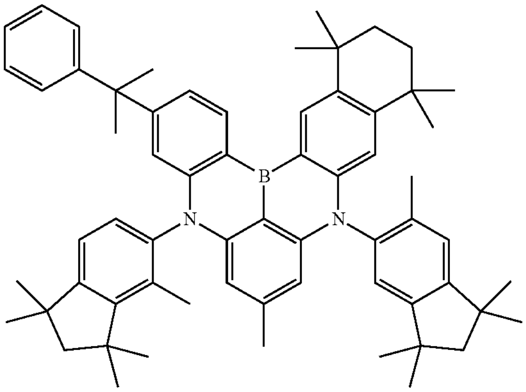
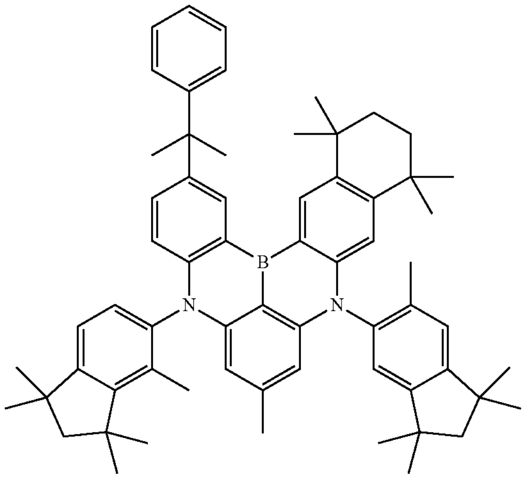

-continued
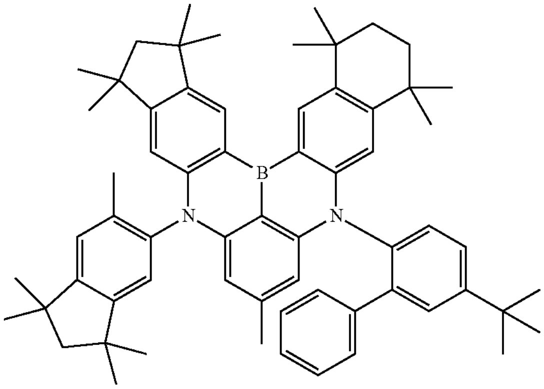
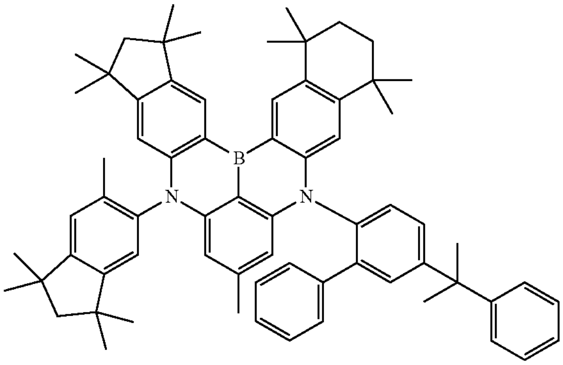
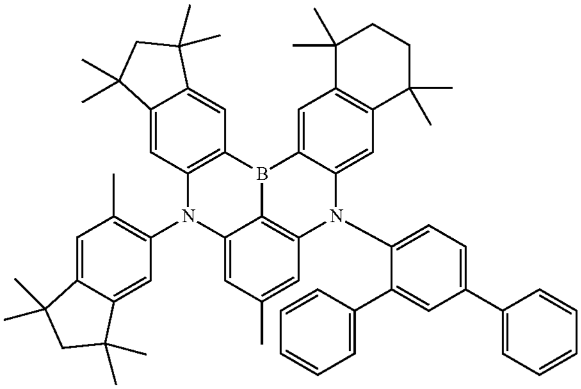
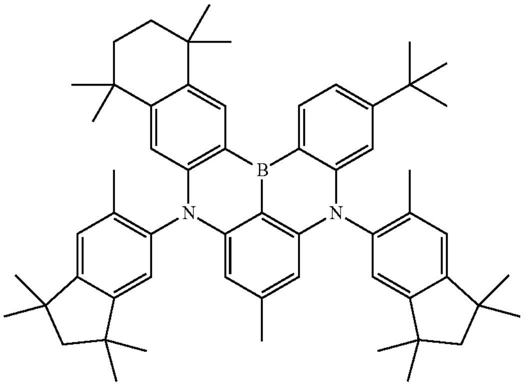
-continued
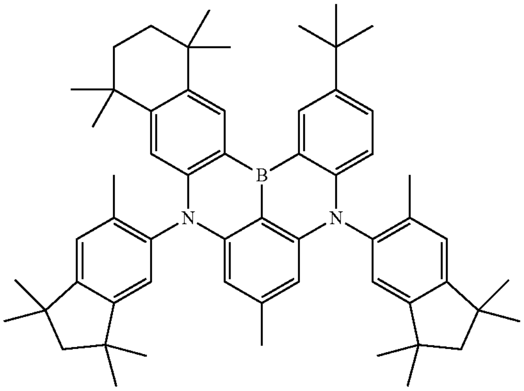
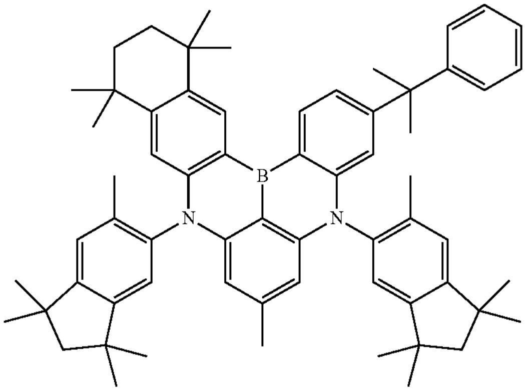
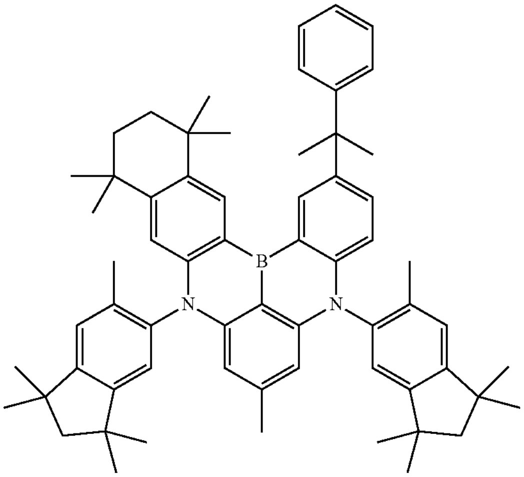
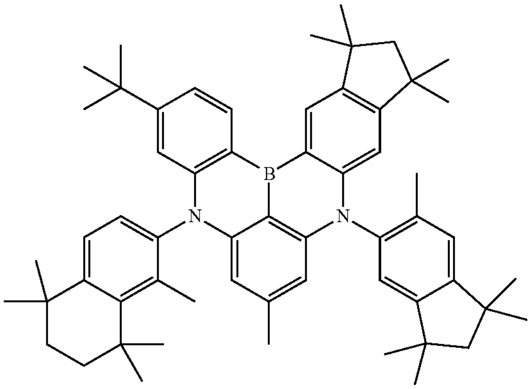

-continued
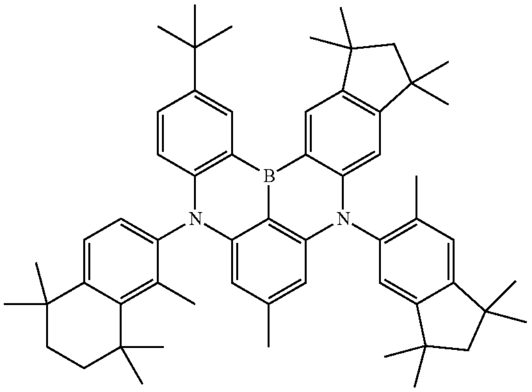
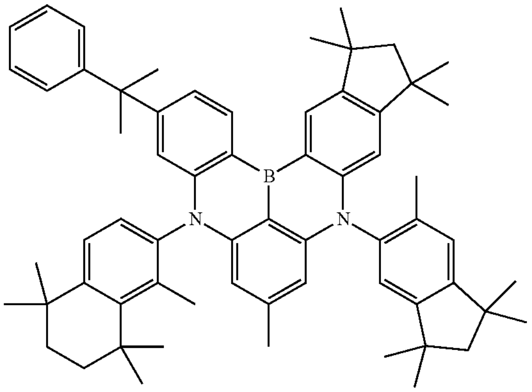
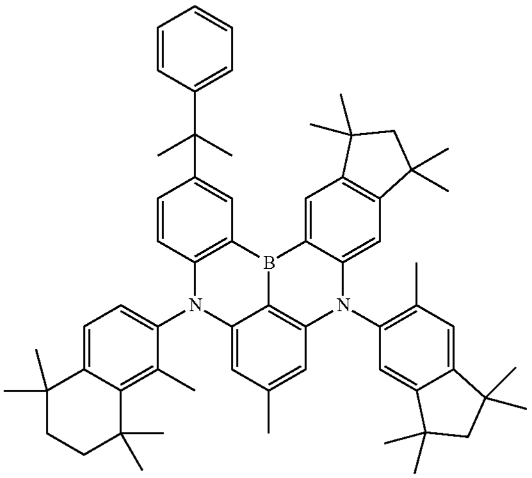
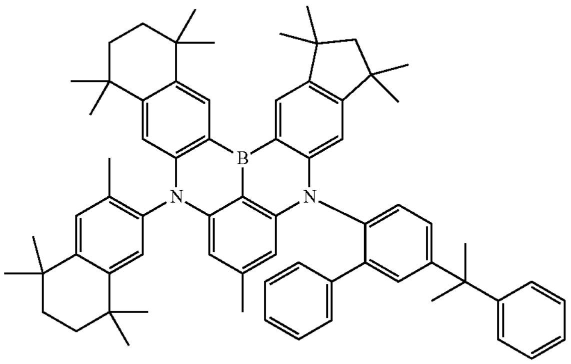
-continued
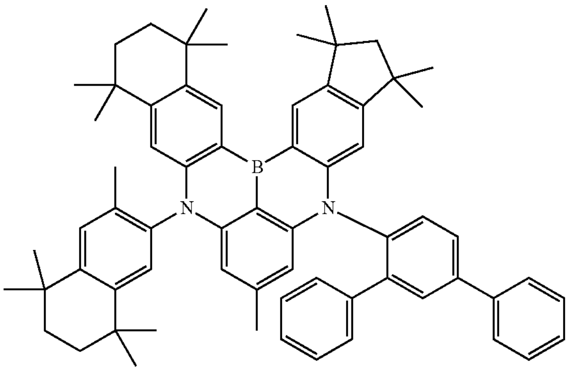
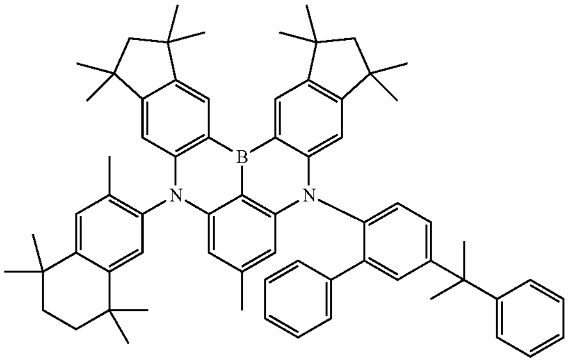
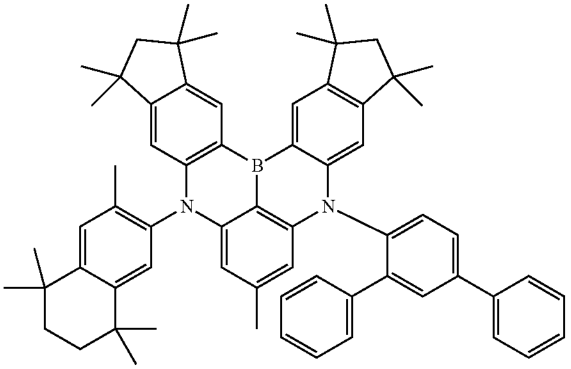
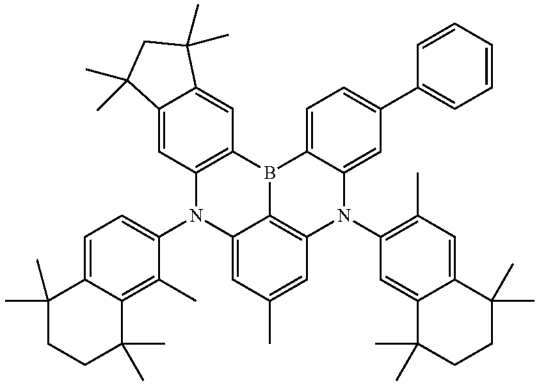

-continued
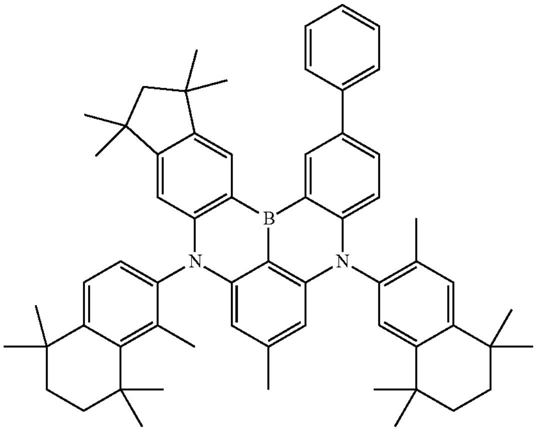
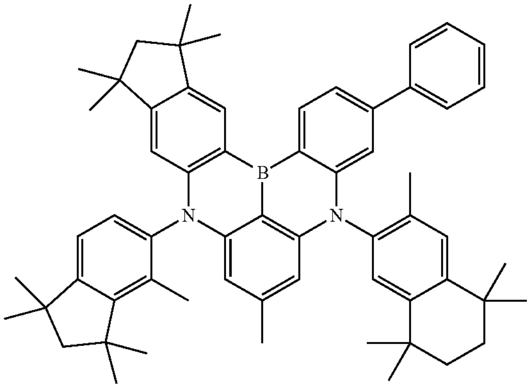
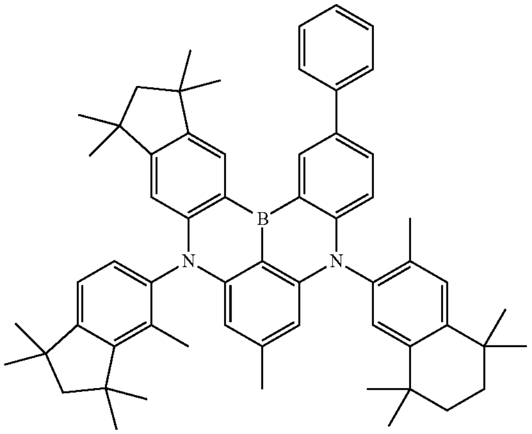
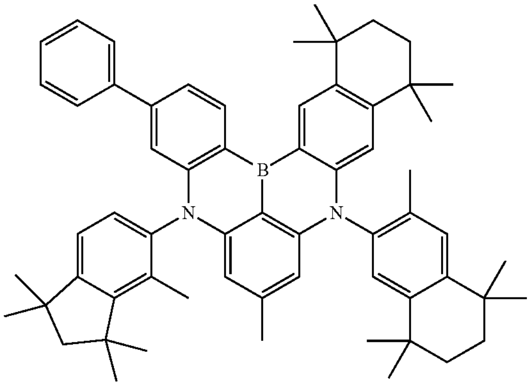
-continued
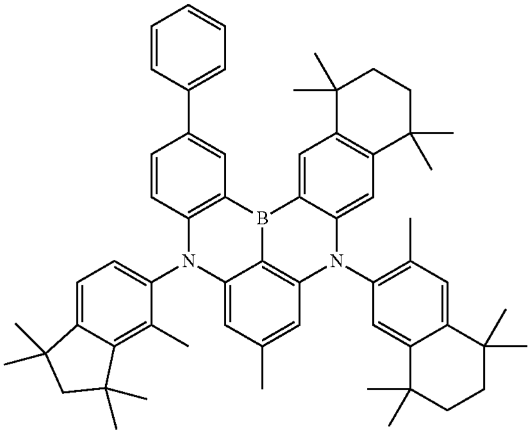
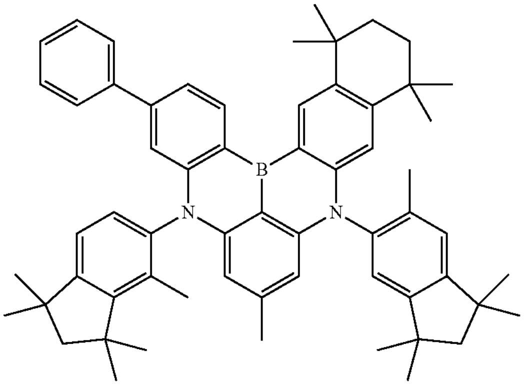
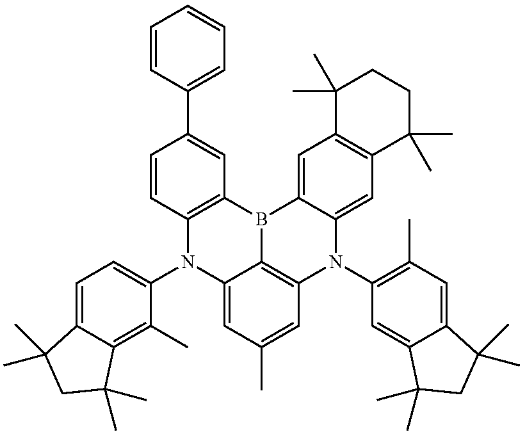
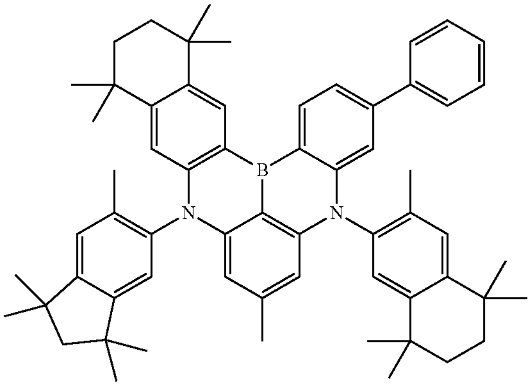

-continued
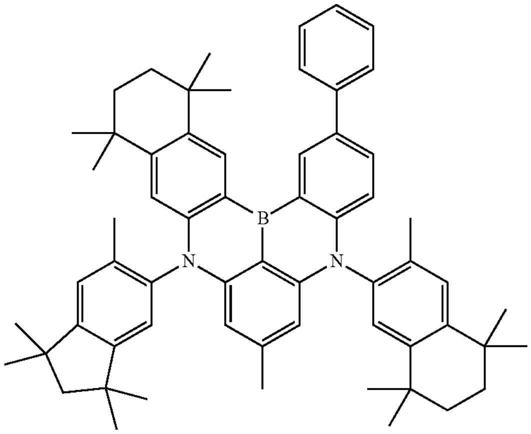
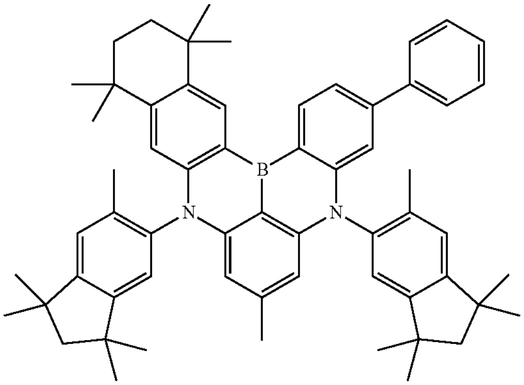
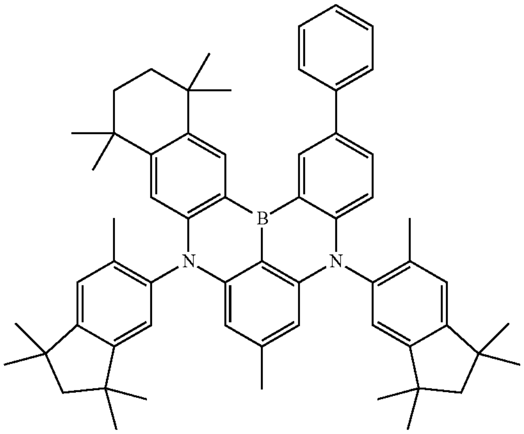
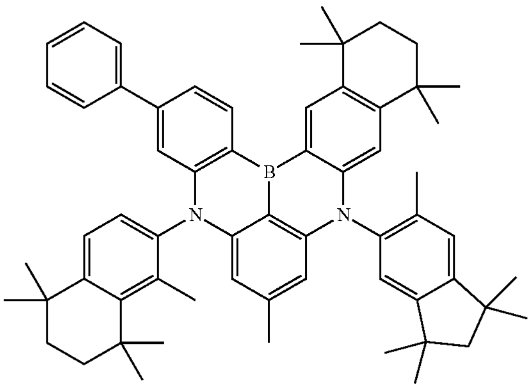
-continued
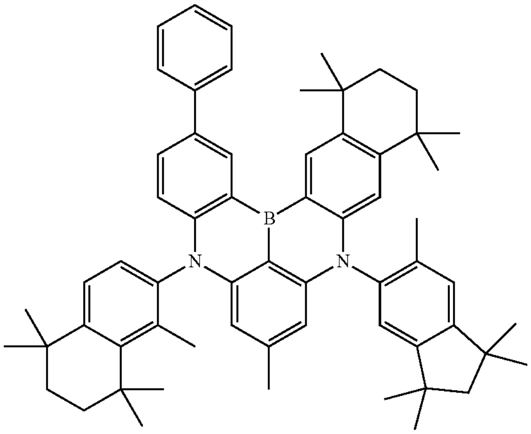
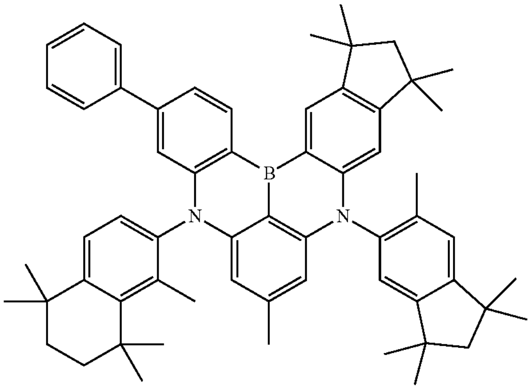
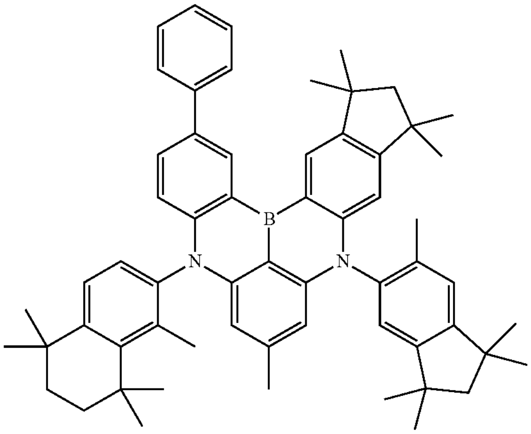
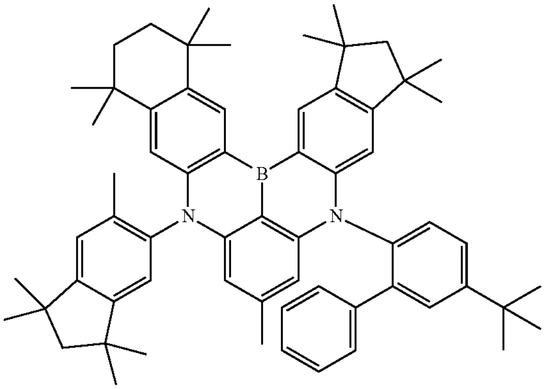

-continued
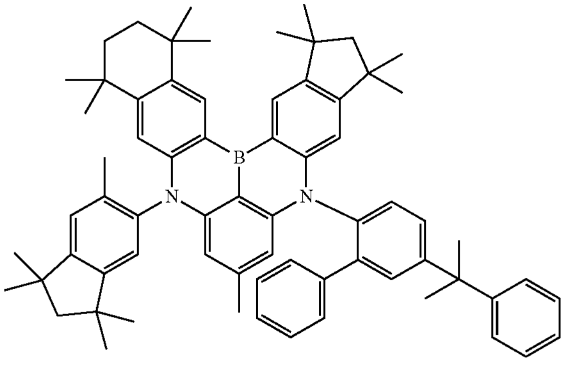
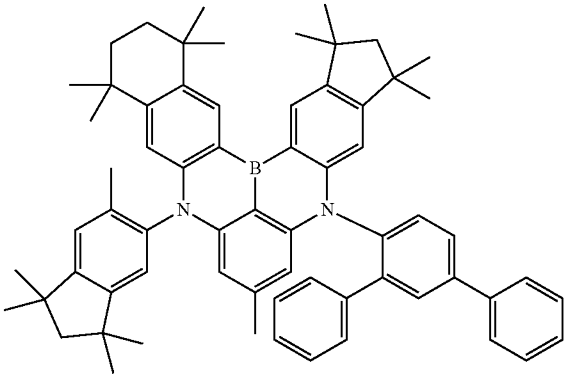
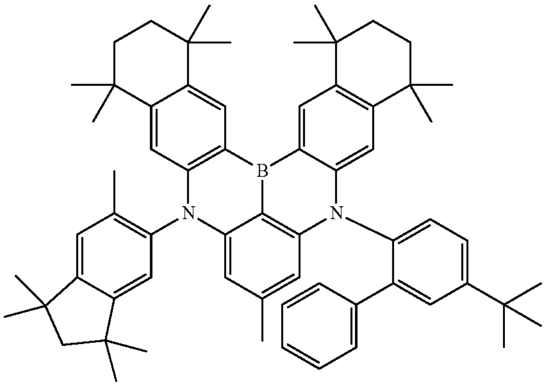
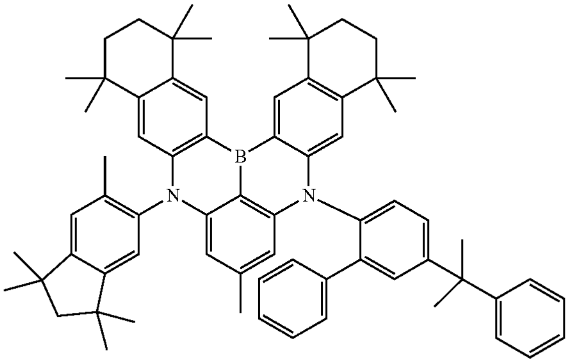
-continued
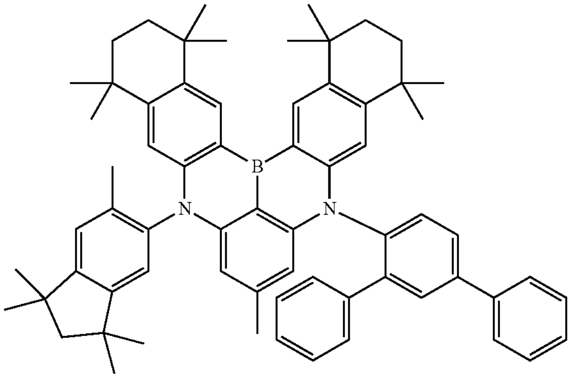
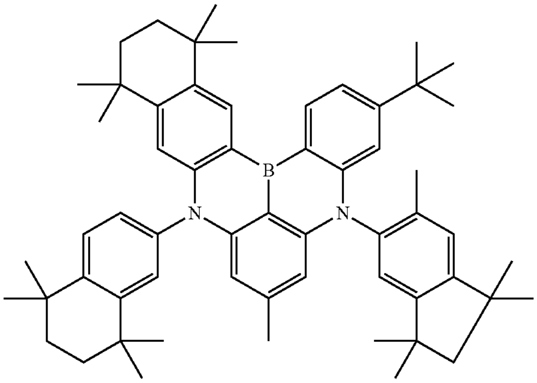
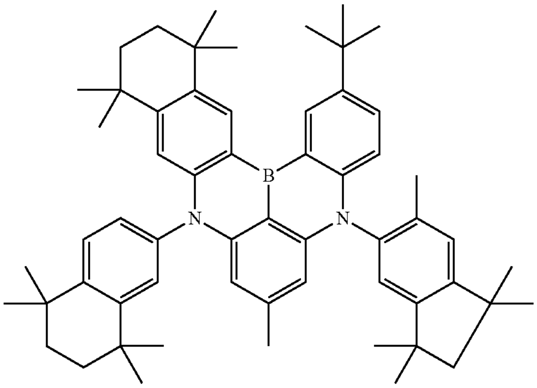
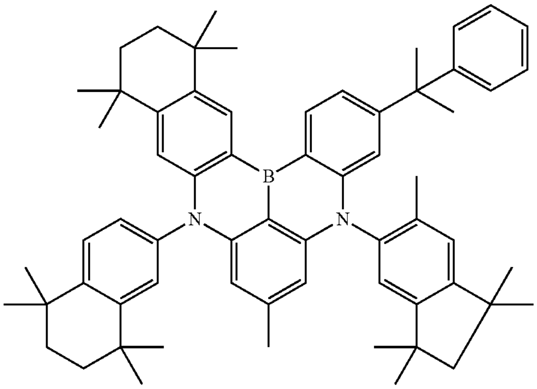

-continued
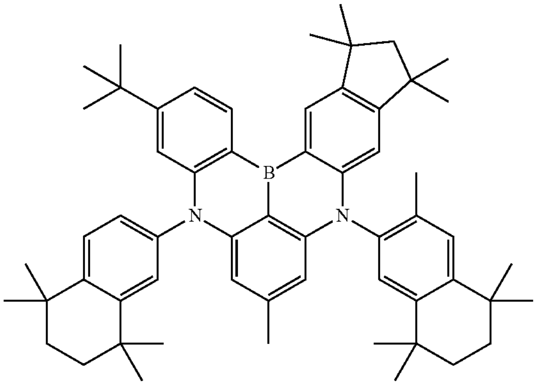
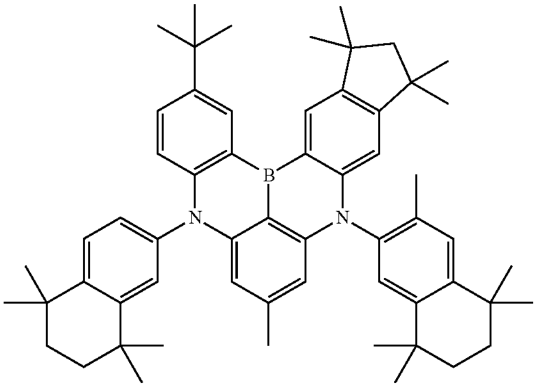
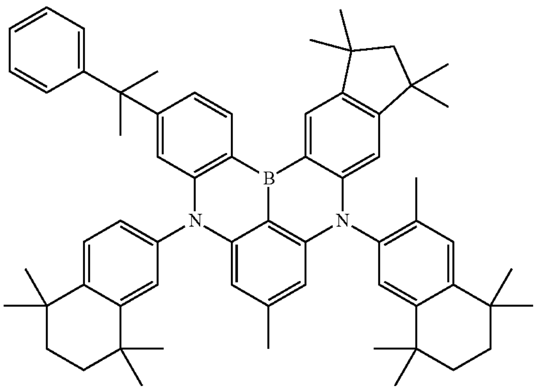
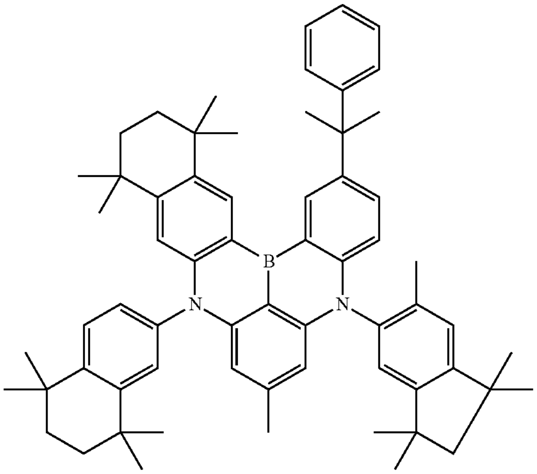
-continued
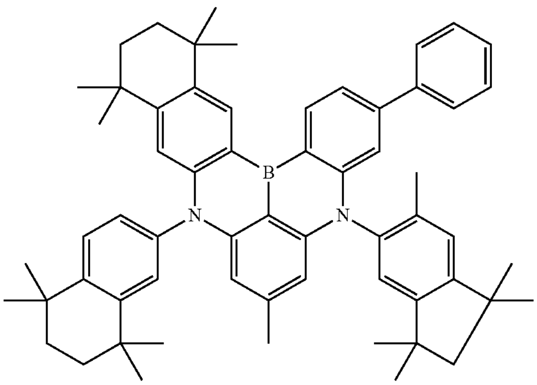
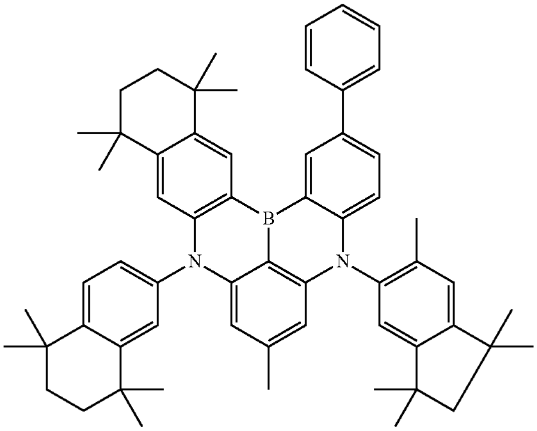
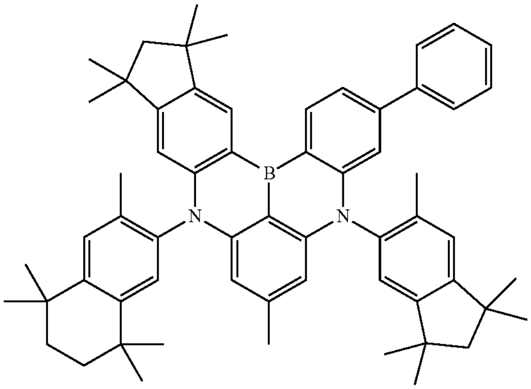
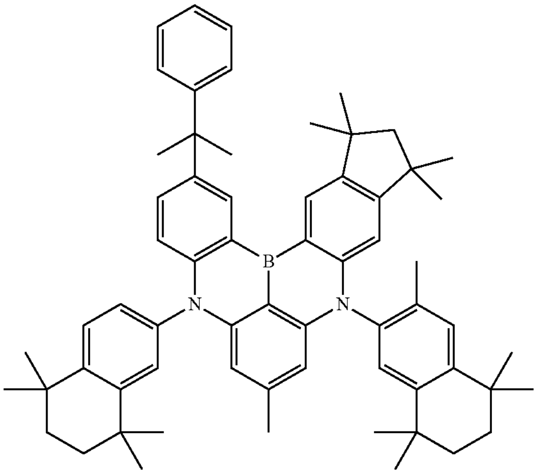

-continued
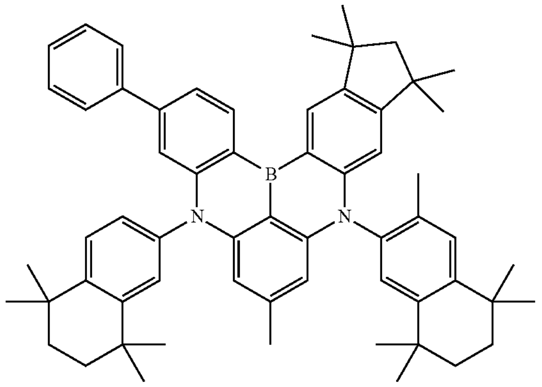
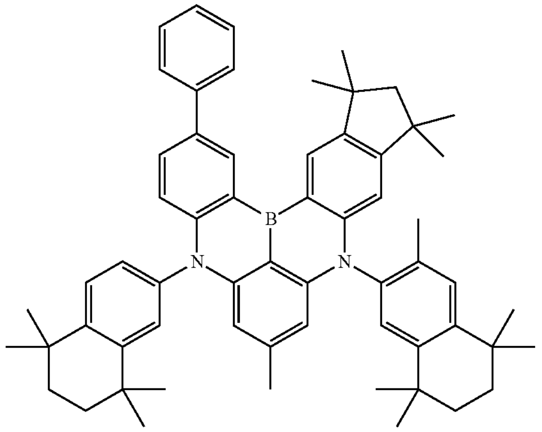
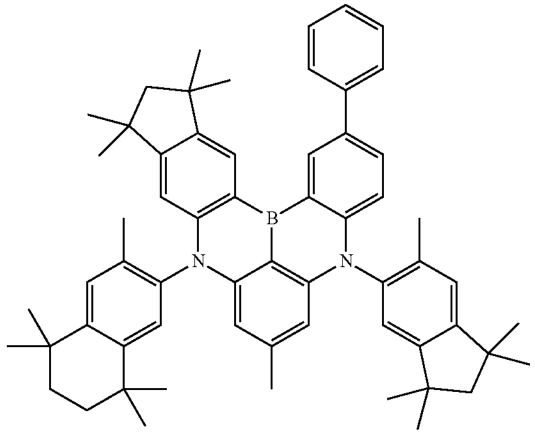
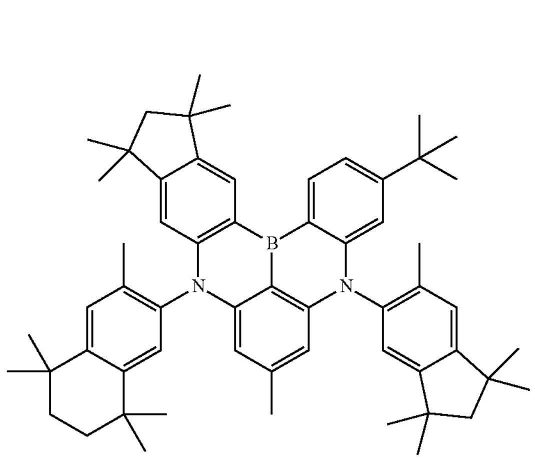
-continued
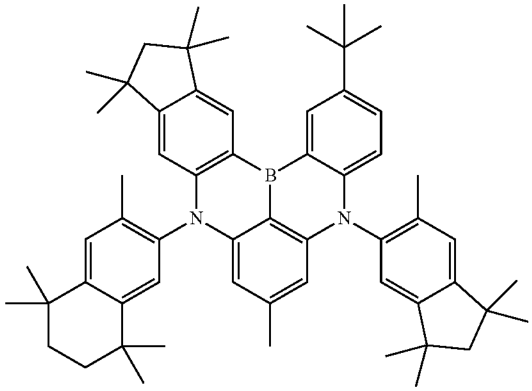
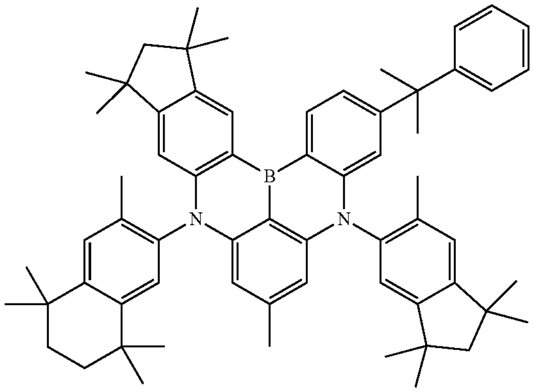
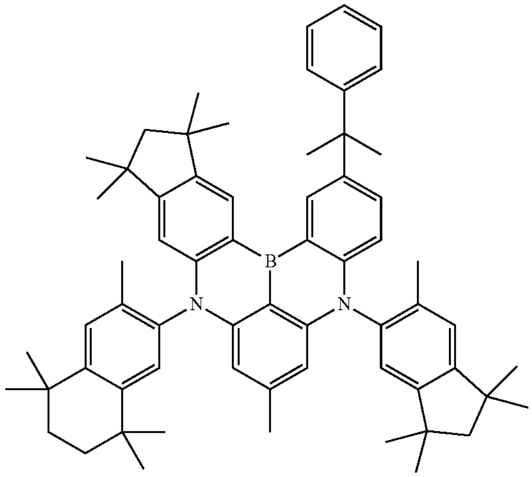
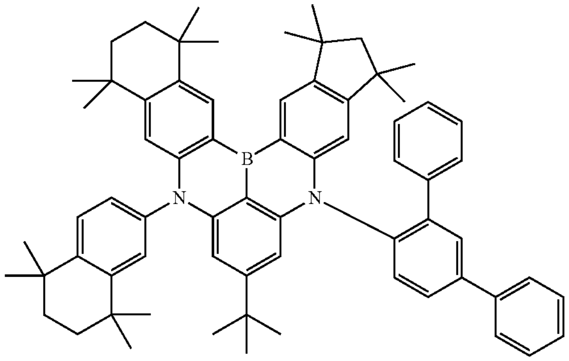

-continued
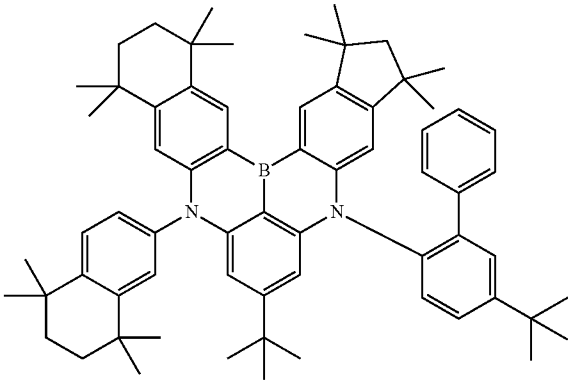
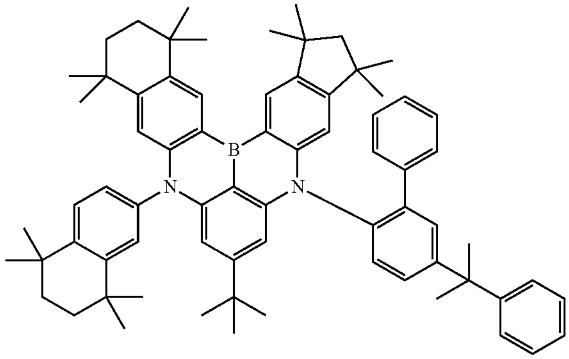
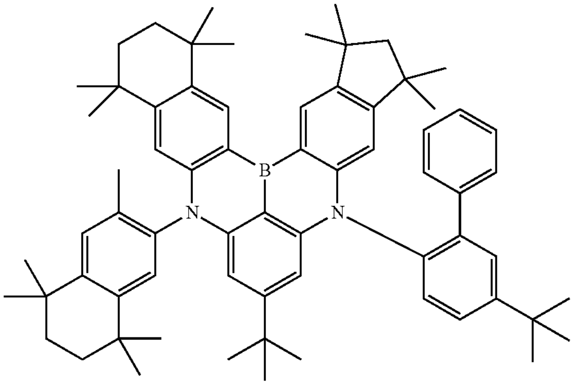
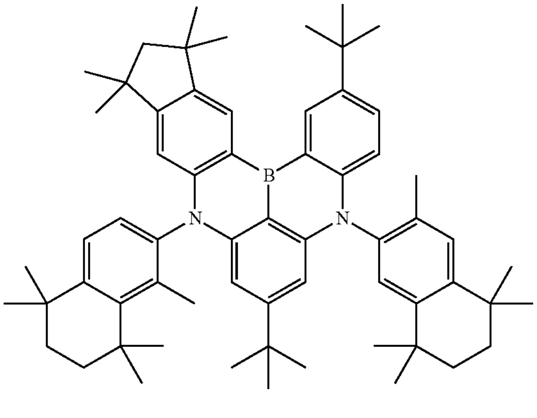
-continued
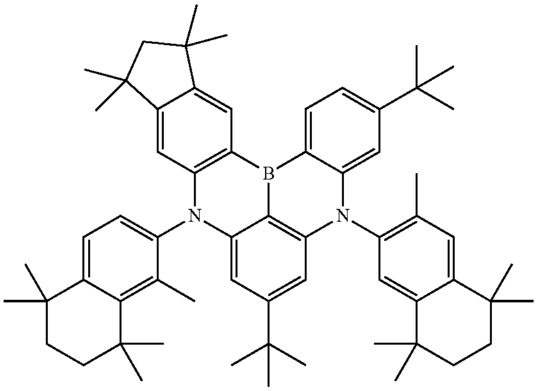
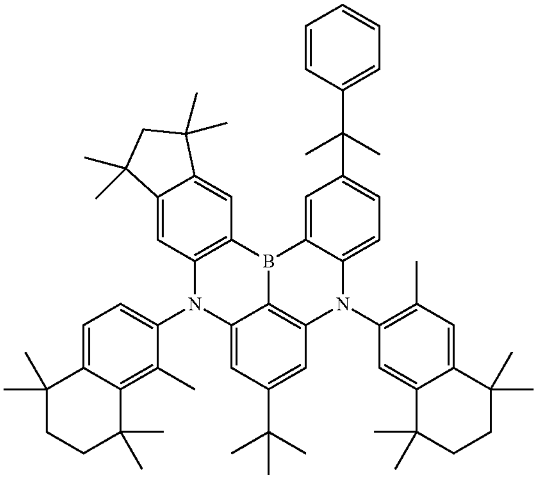
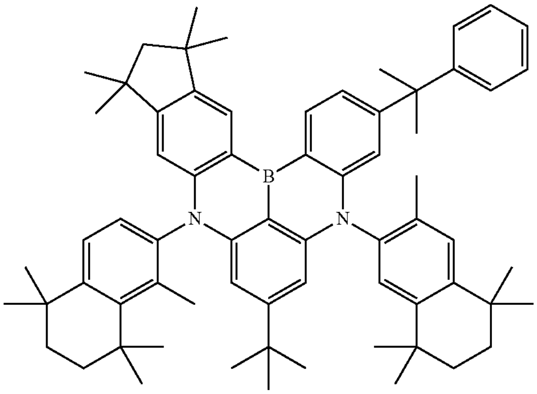
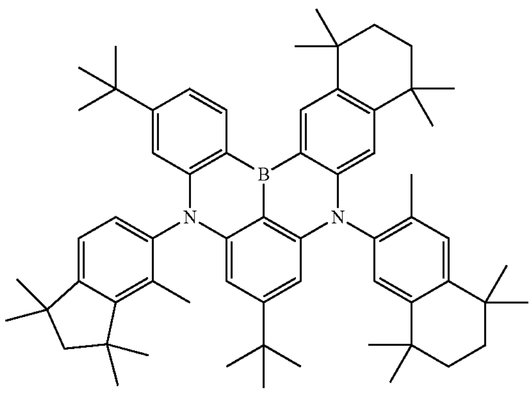

-continued
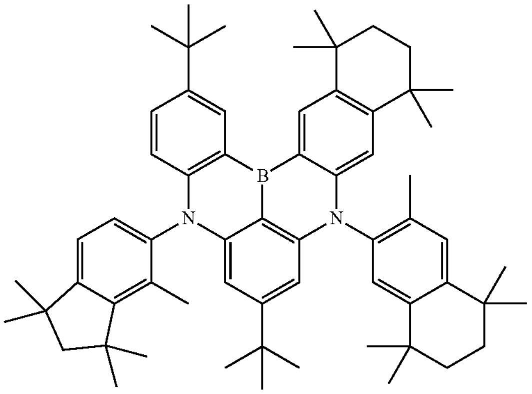
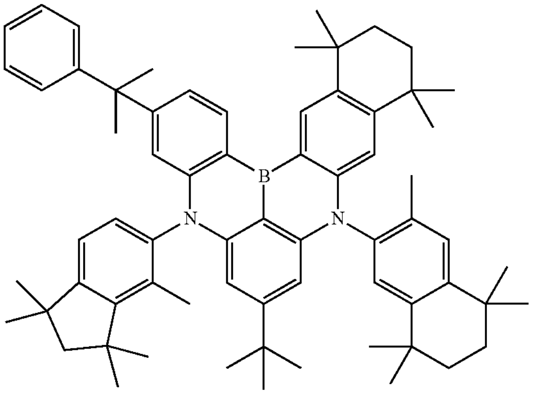
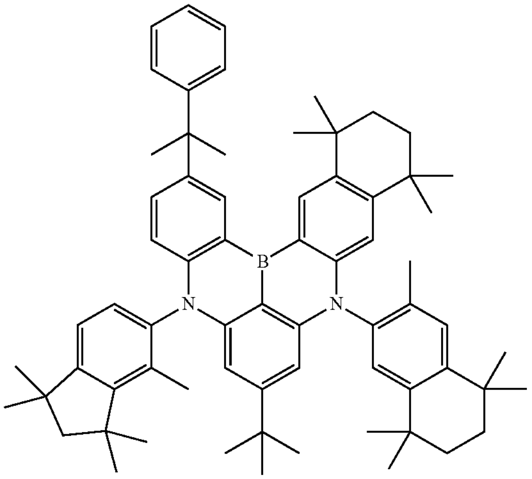
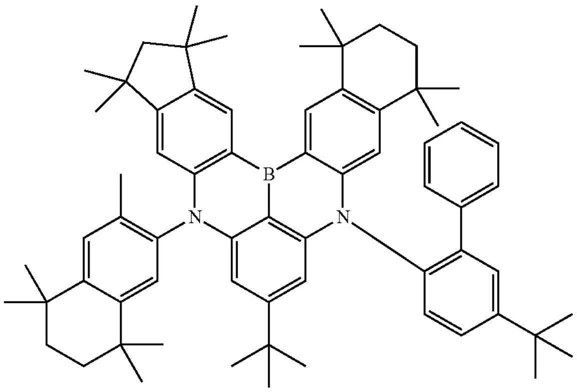
-continued
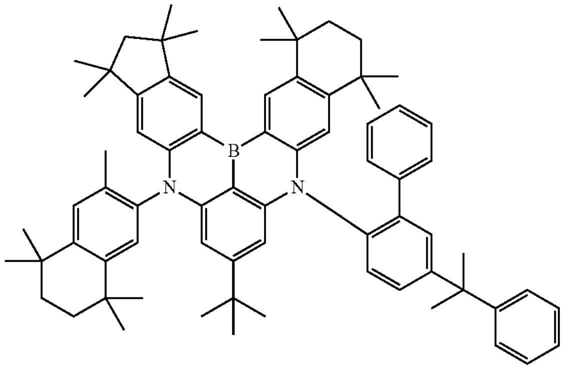
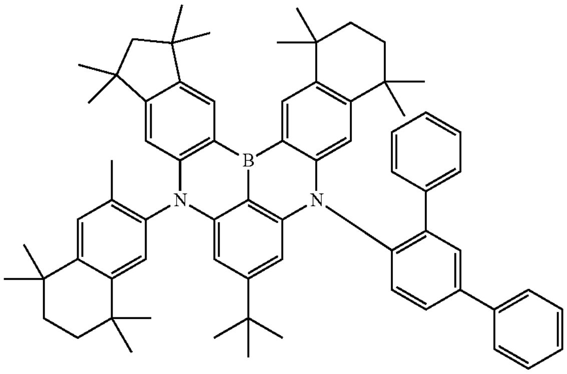
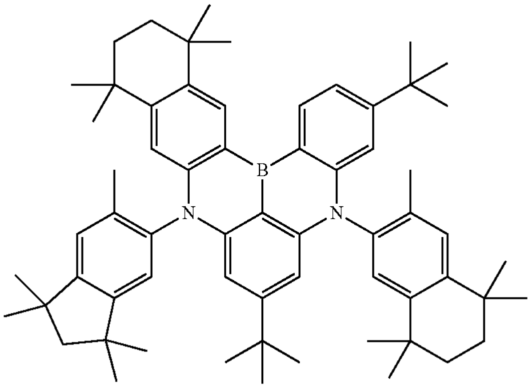
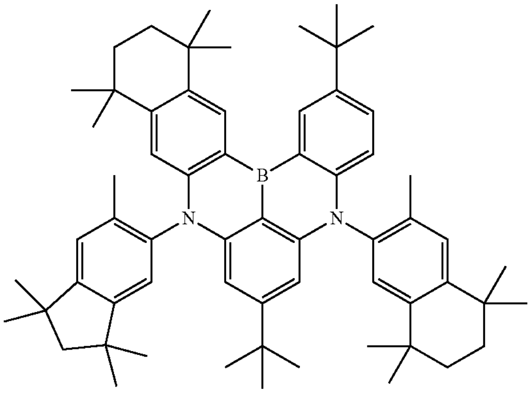

-continued
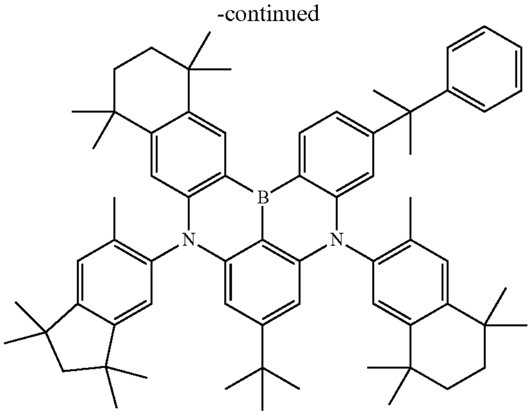
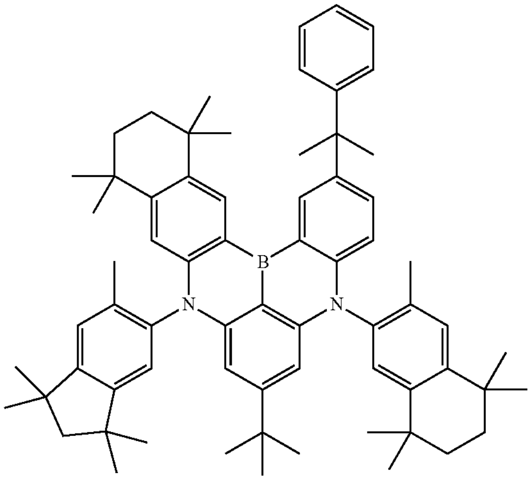
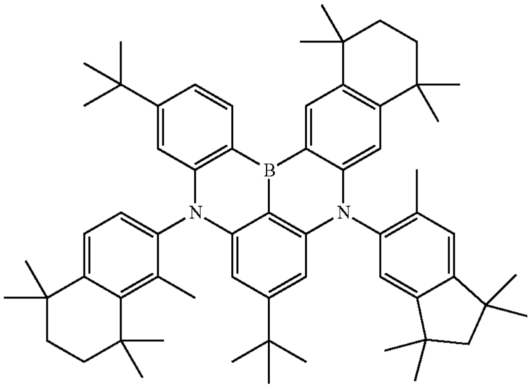
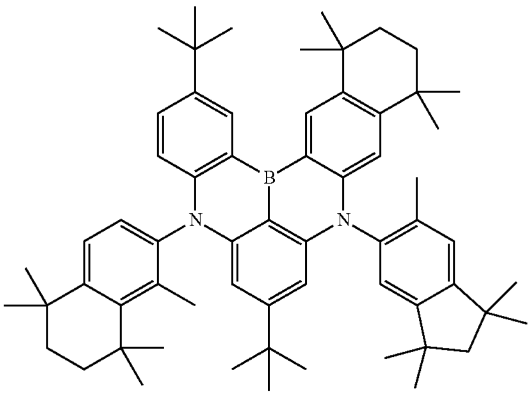
-continued
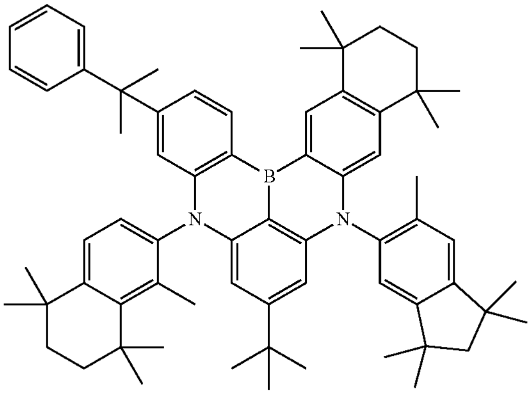
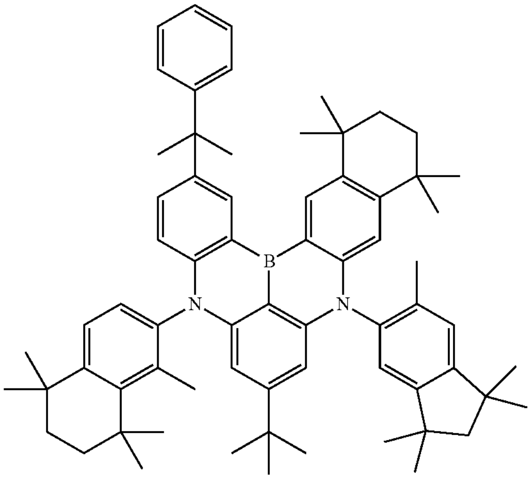
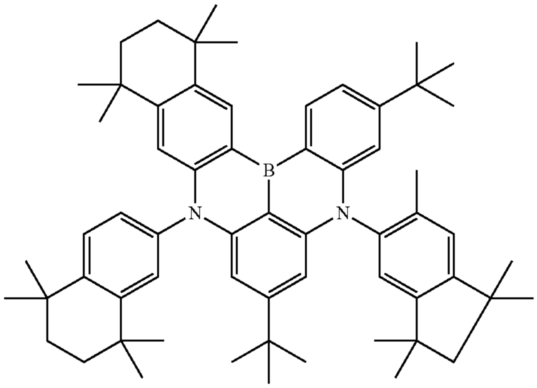
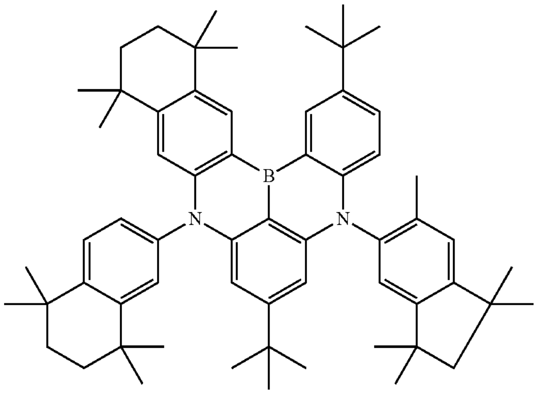

-continued
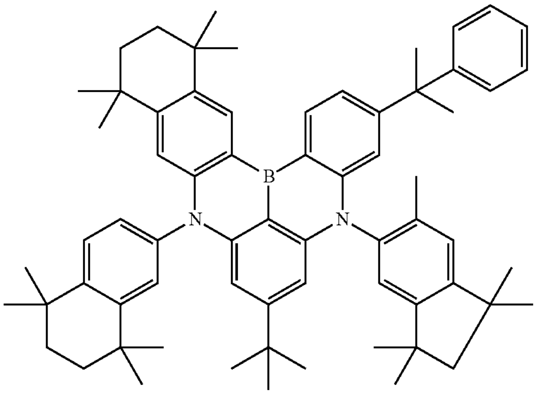
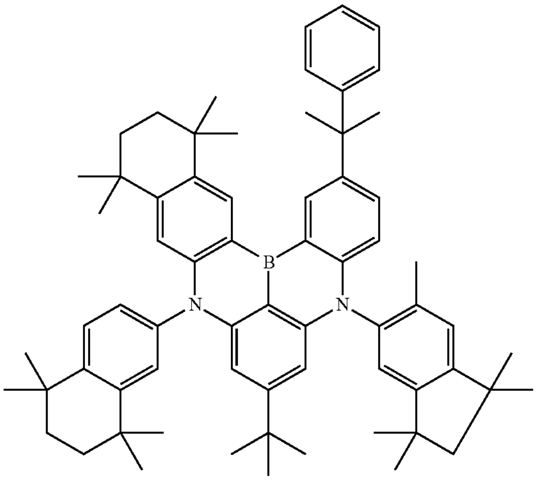
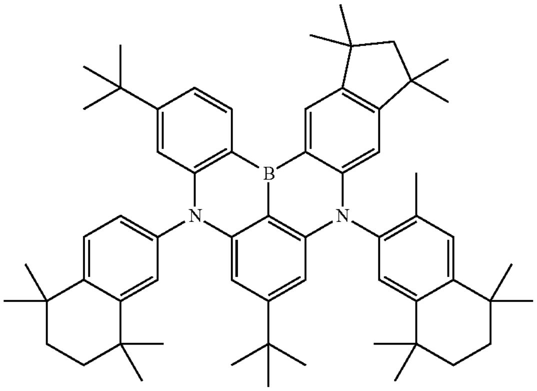
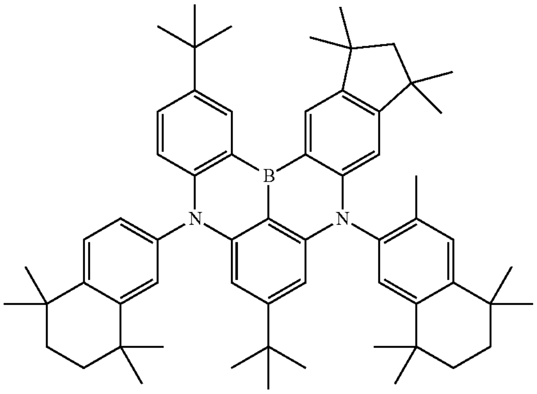
-continued
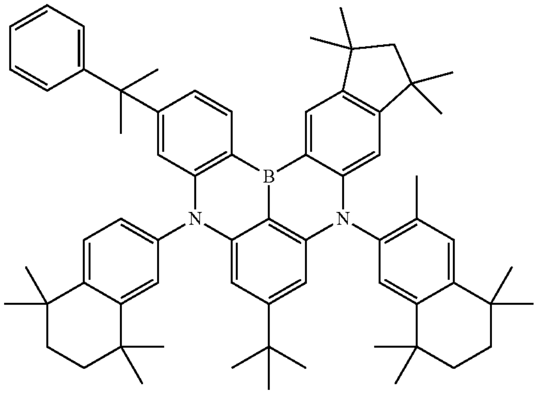
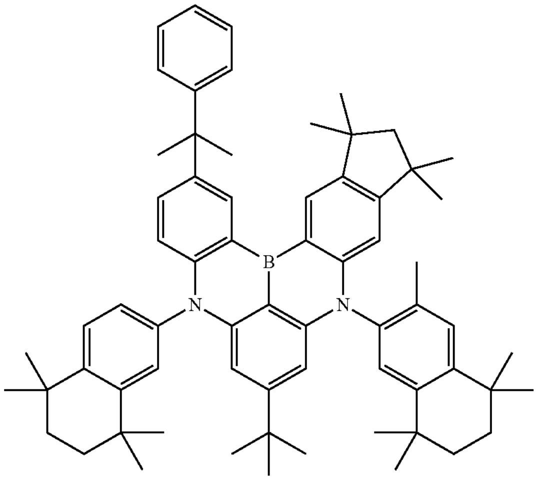
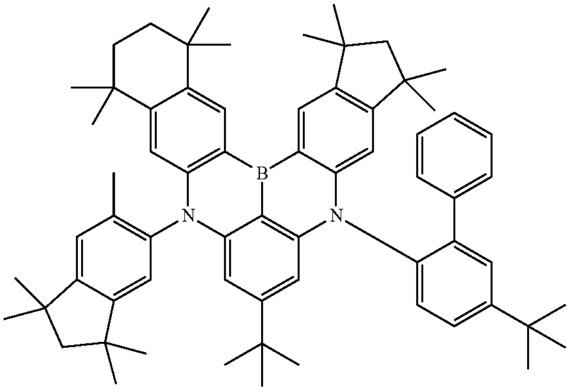
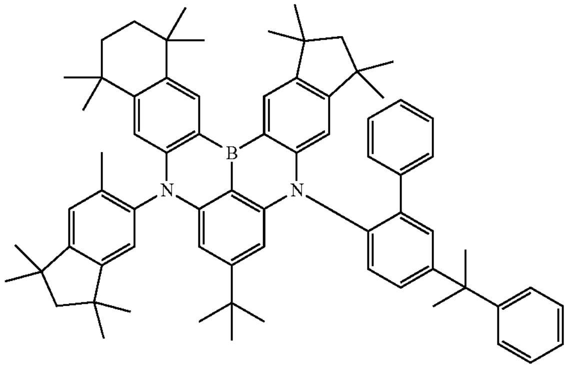

-continued
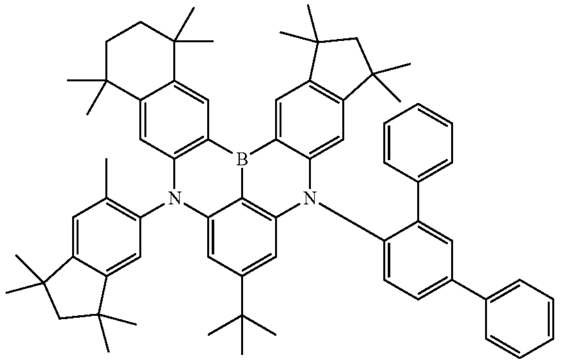
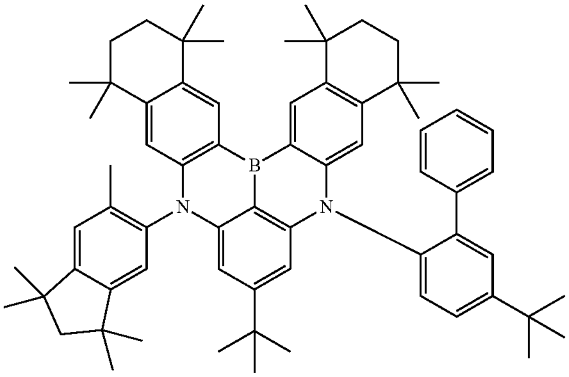
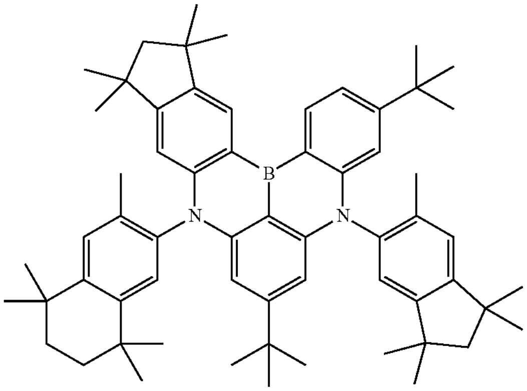
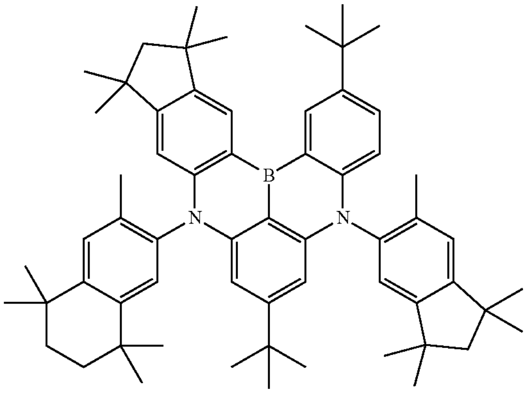
-continued
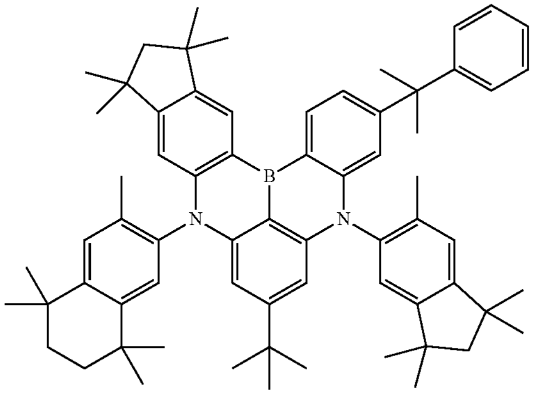
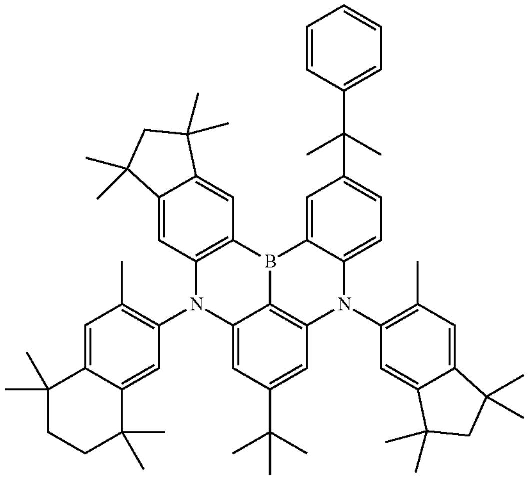
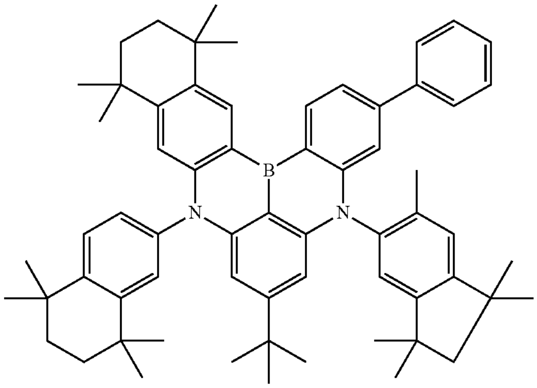
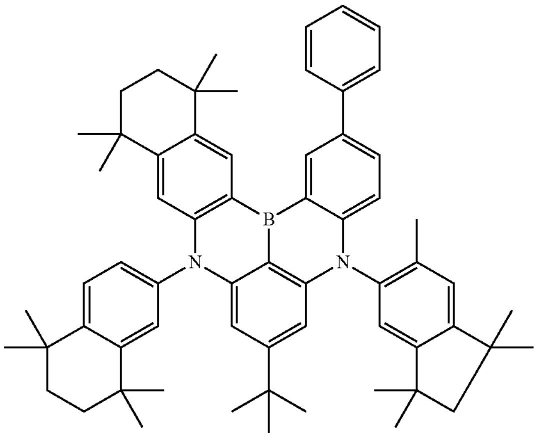

-continued
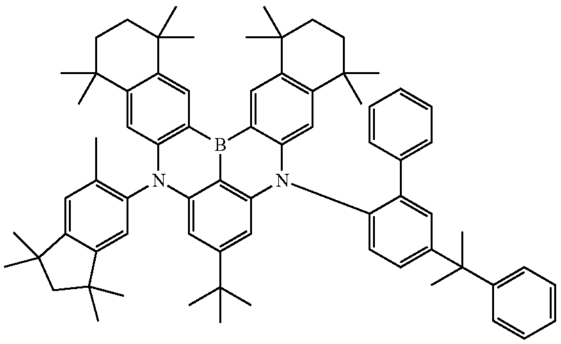
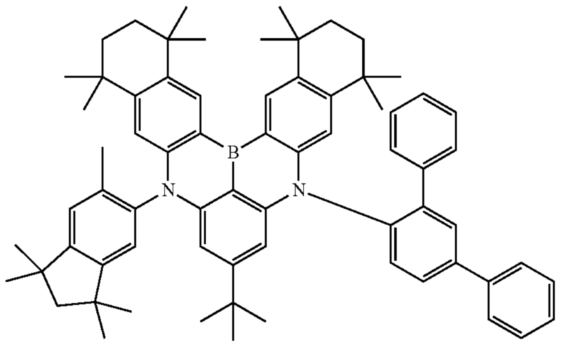
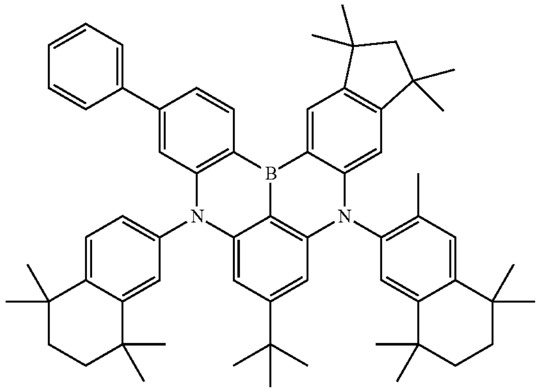
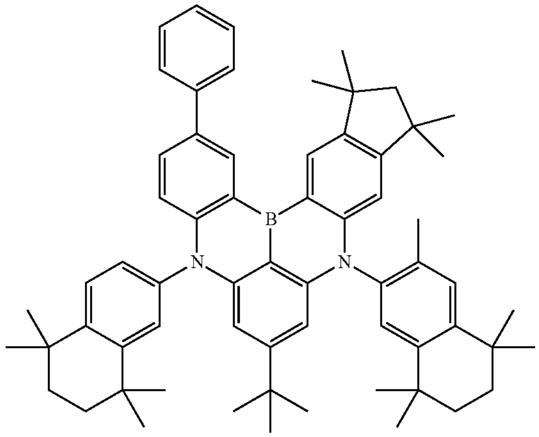
-continued
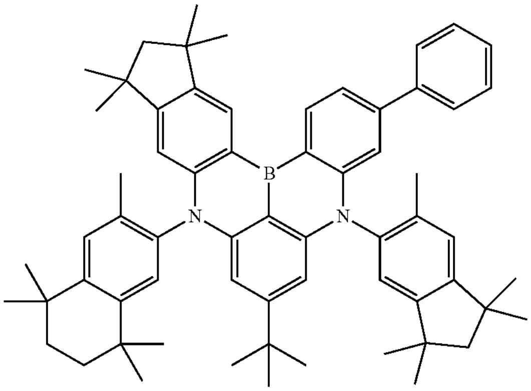
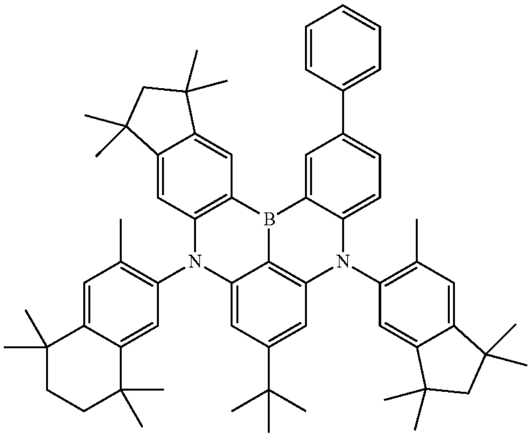
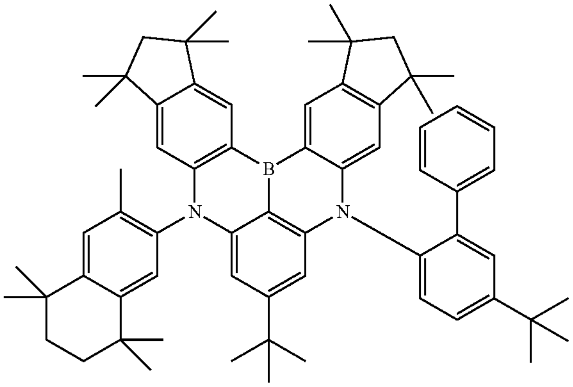
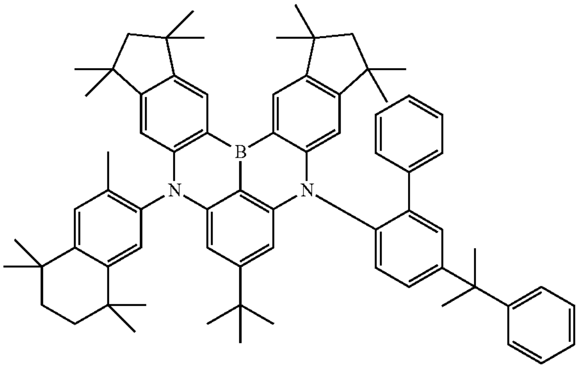

-continued
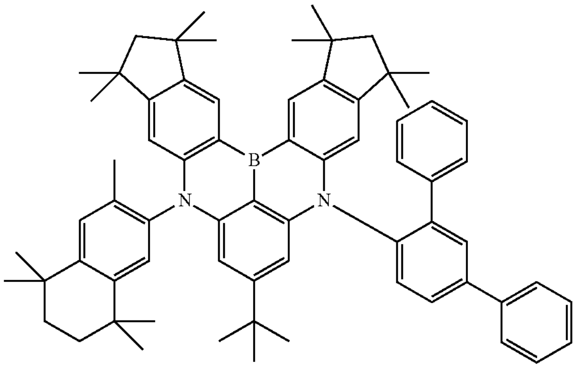
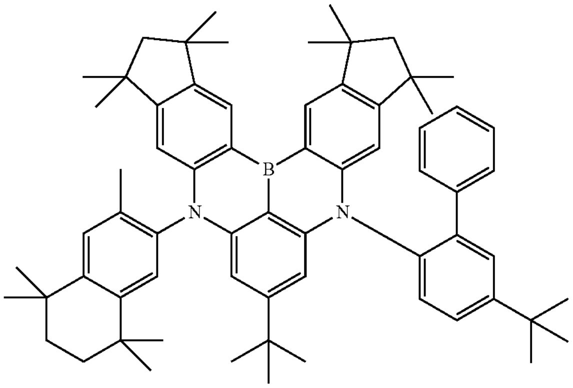
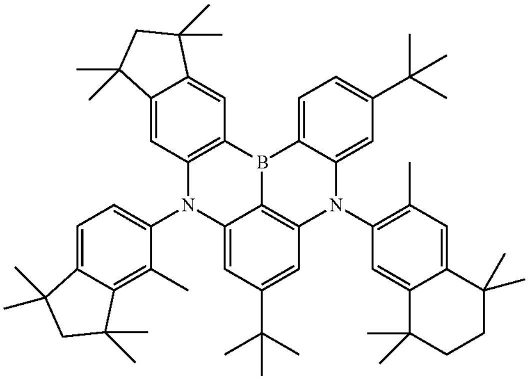
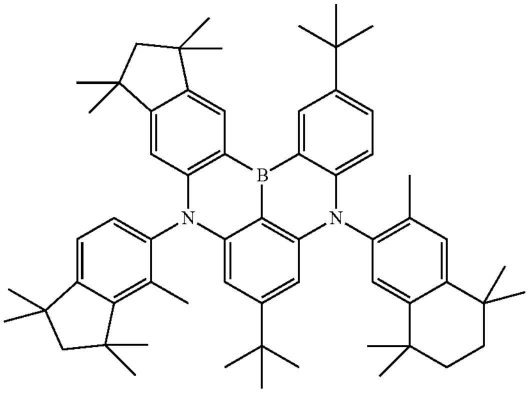
-continued
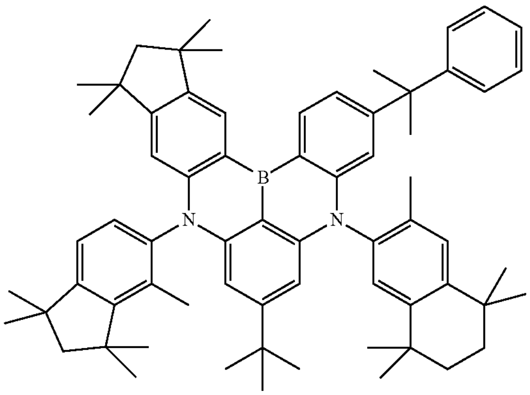
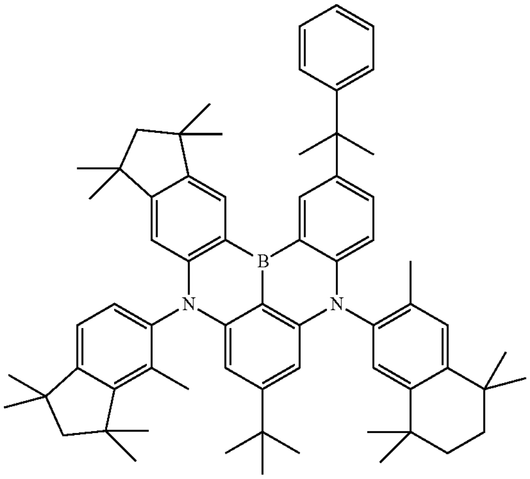
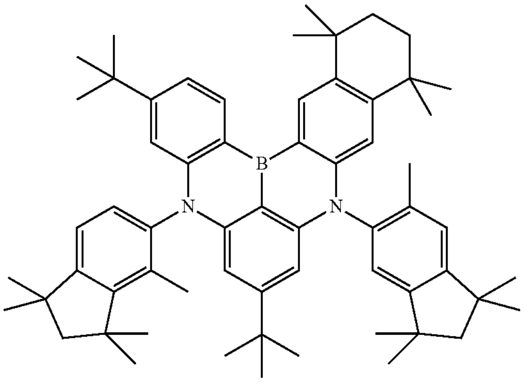
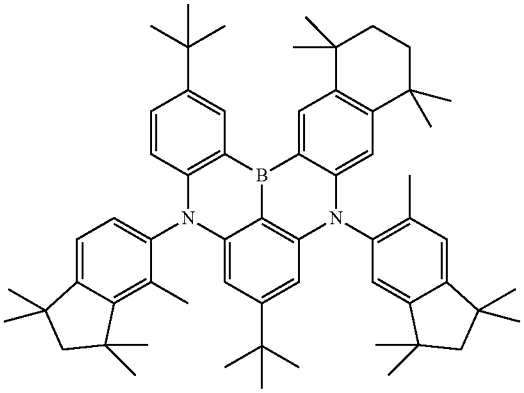

-continued
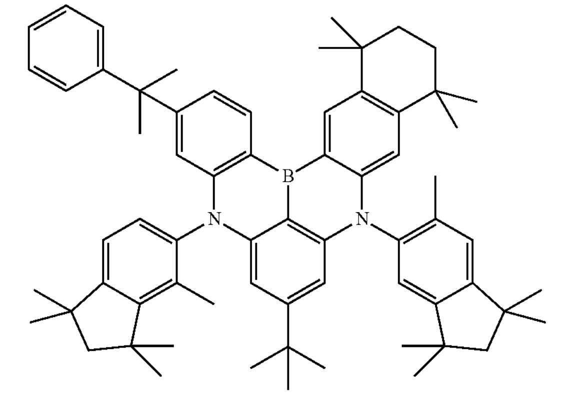
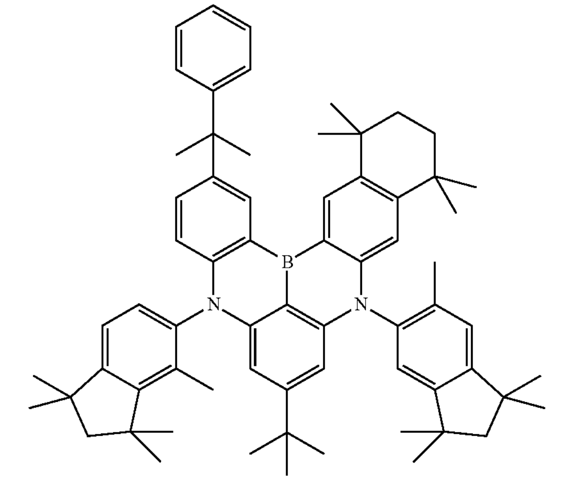
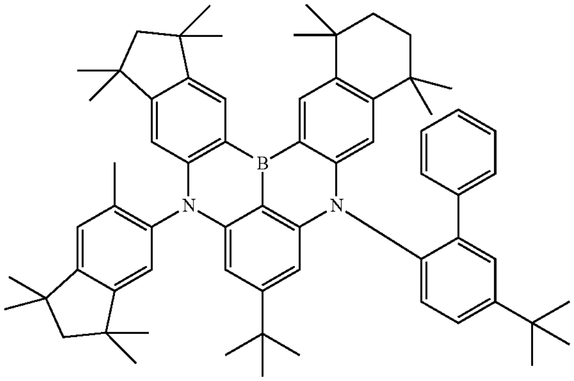
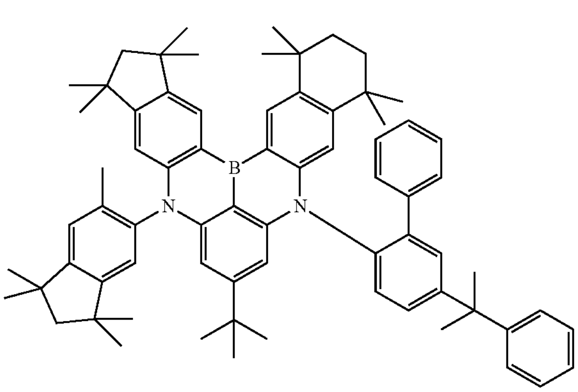
-continued
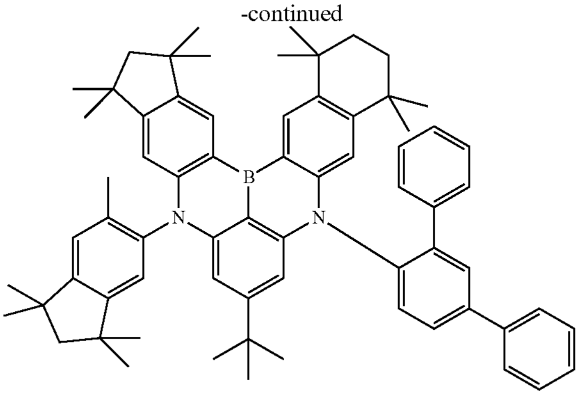
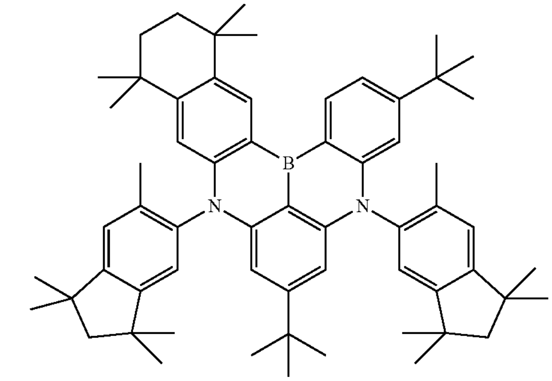
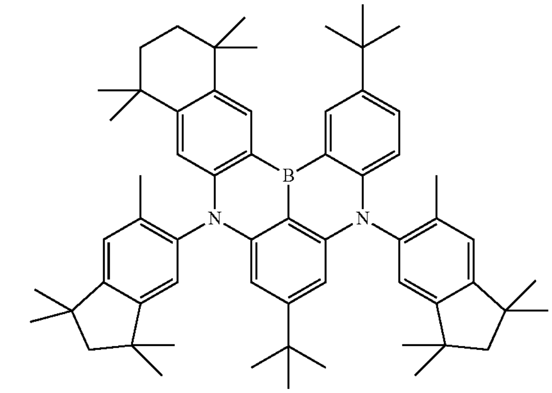
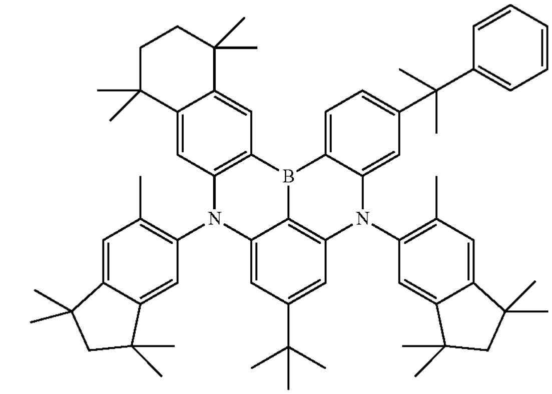

-continued
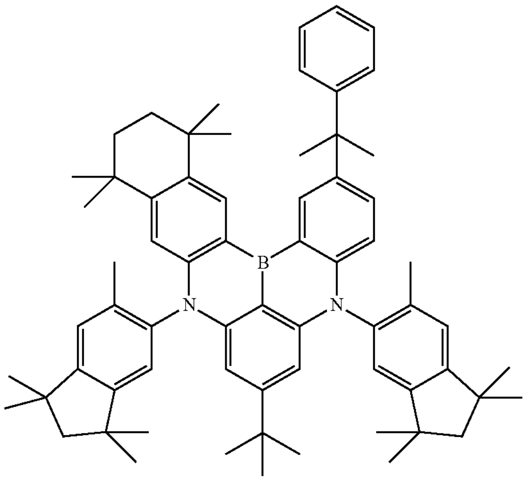
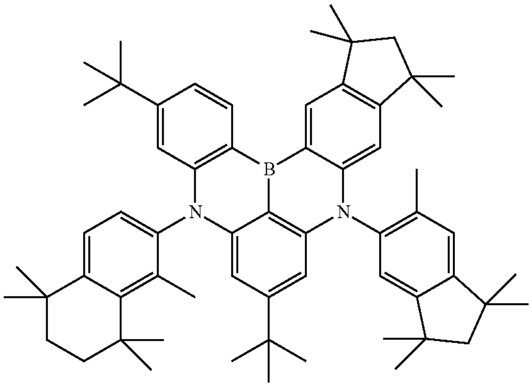
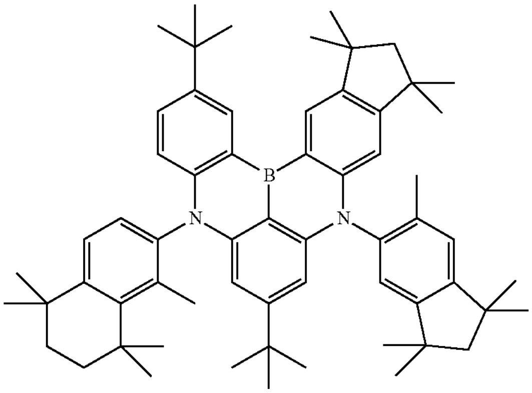
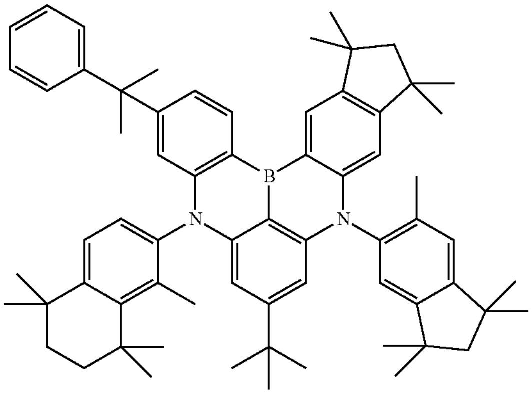
-continued
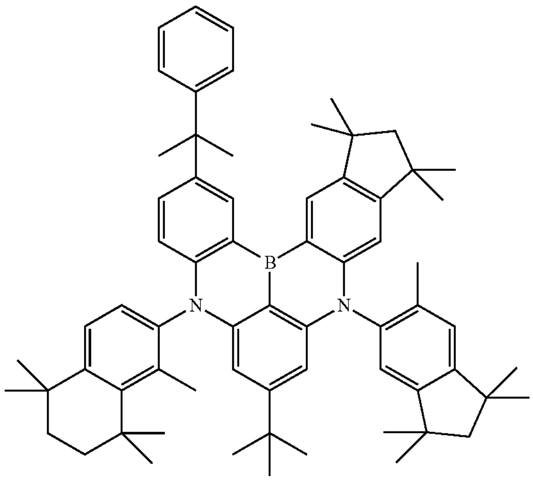
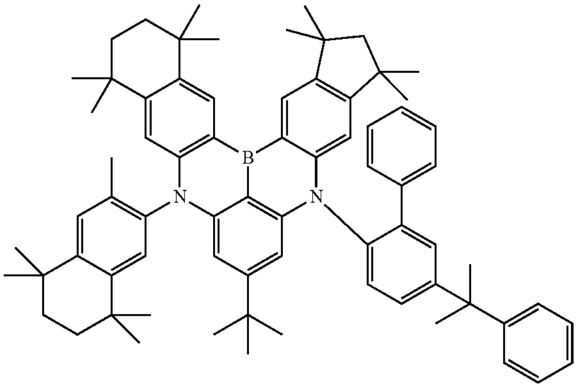
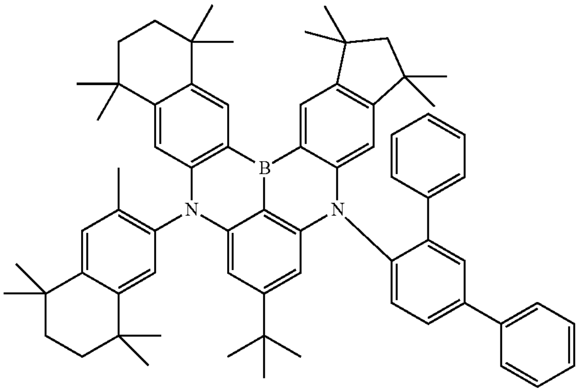
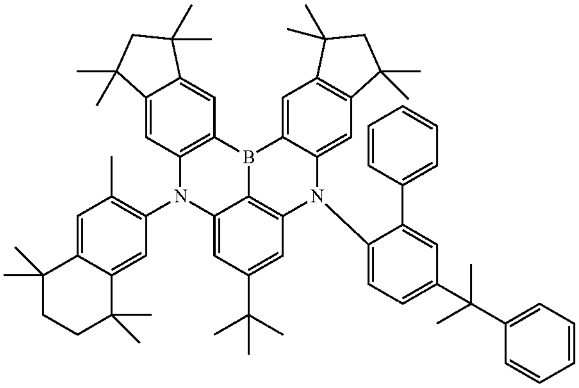

-continued
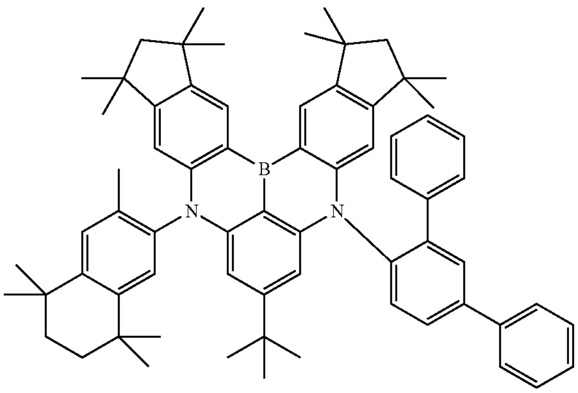
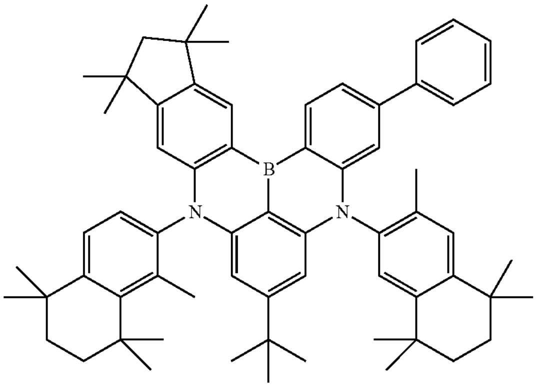
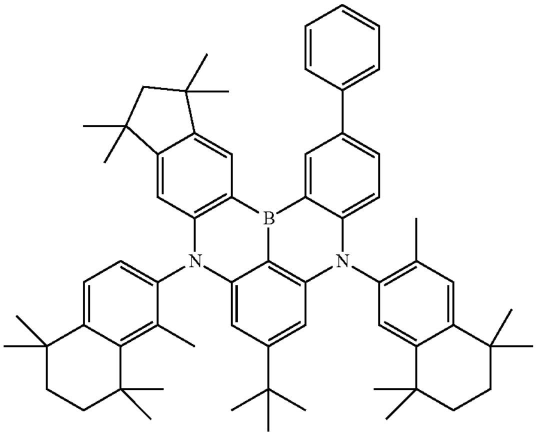
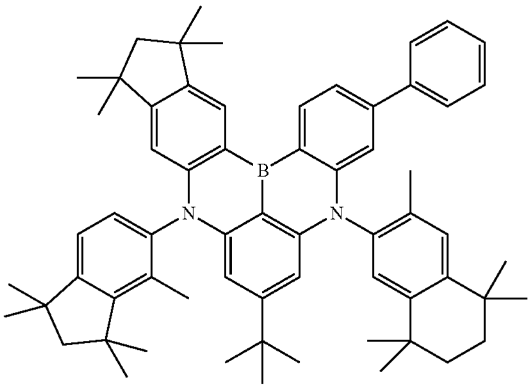
-continued
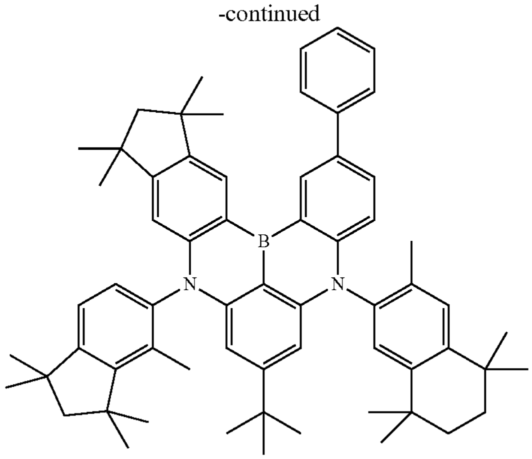
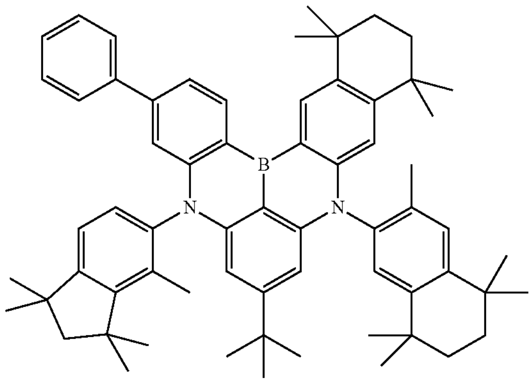
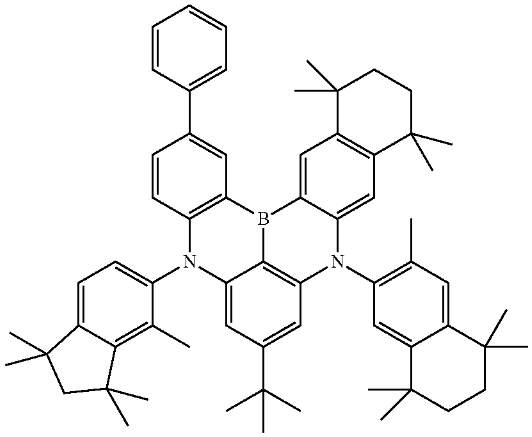
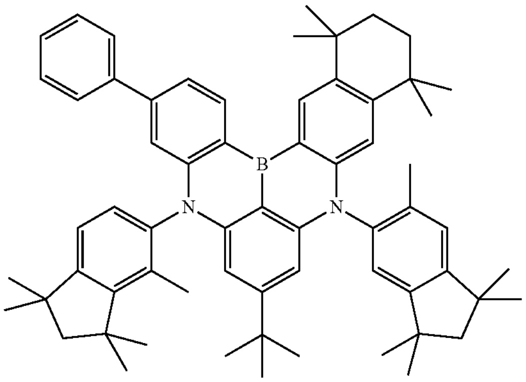

-continued
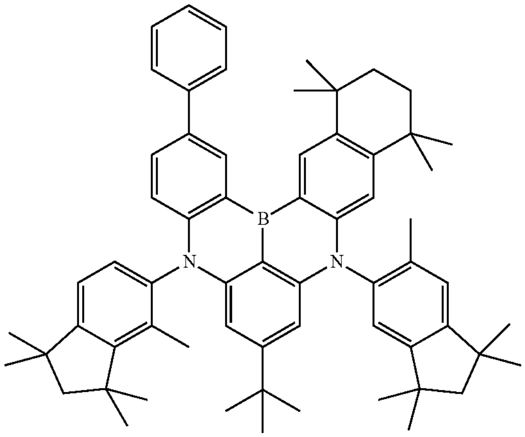
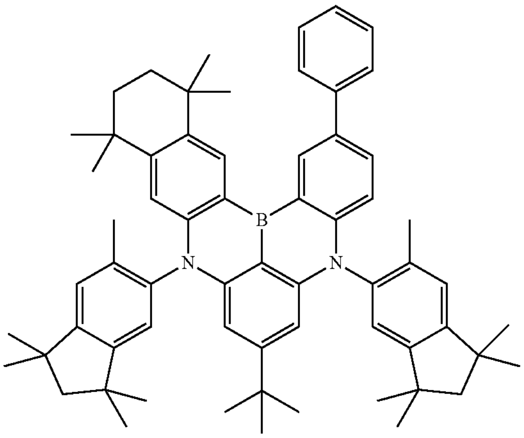
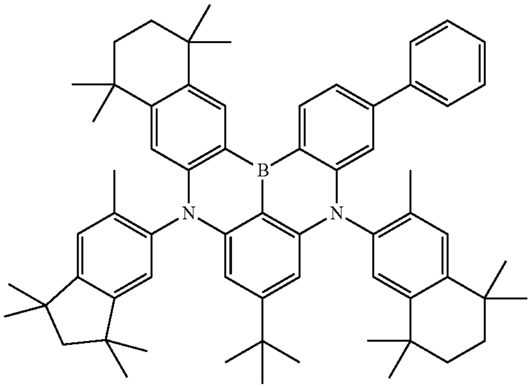
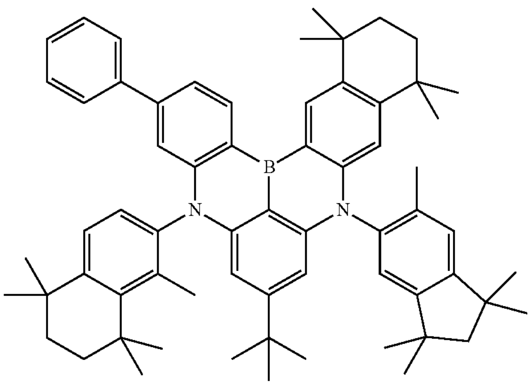
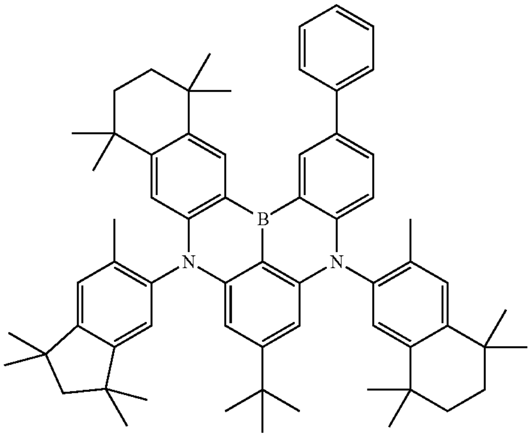
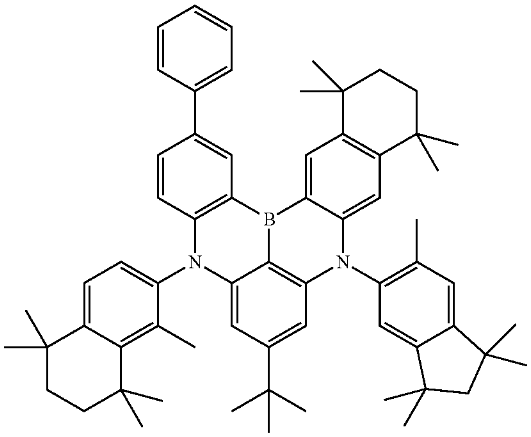
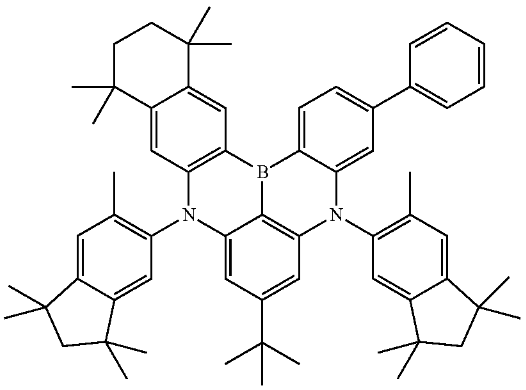
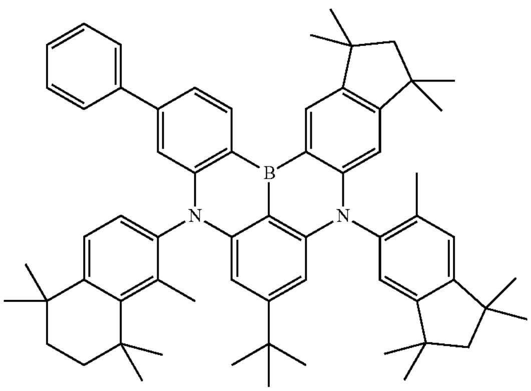
-continued -continued
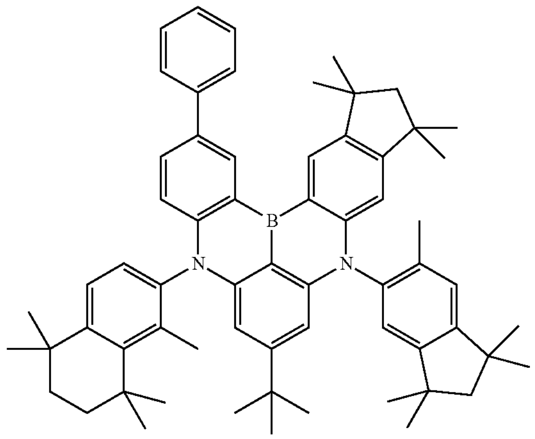
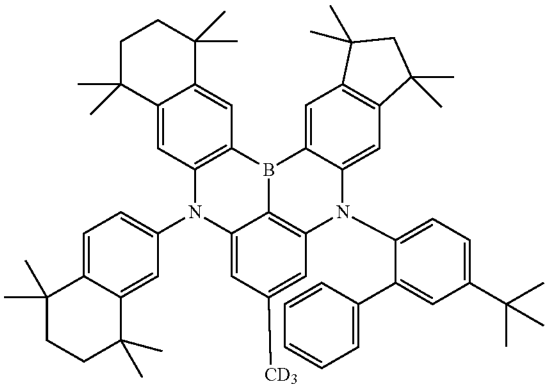
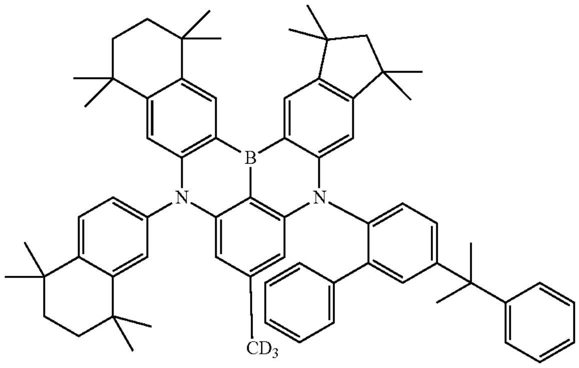
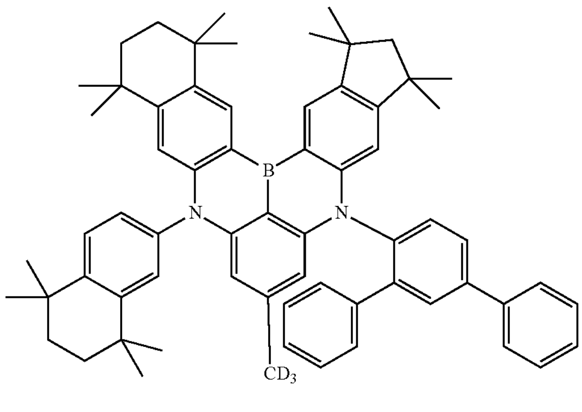
-continued
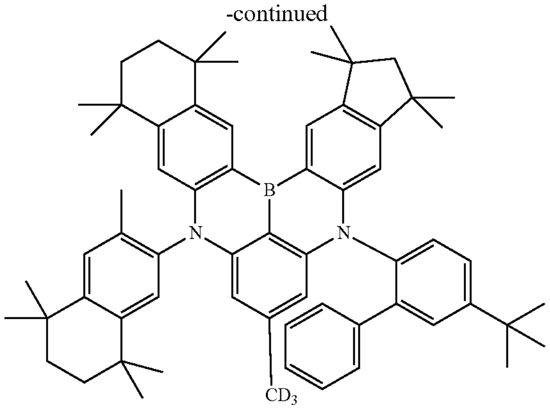
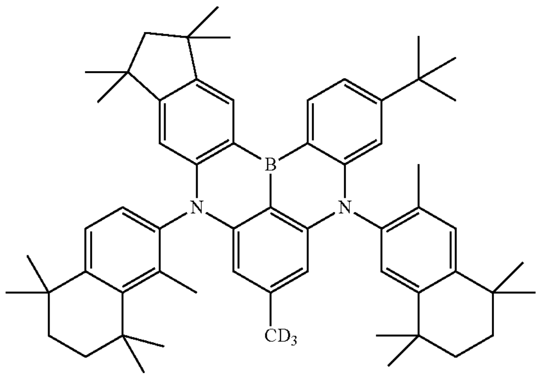
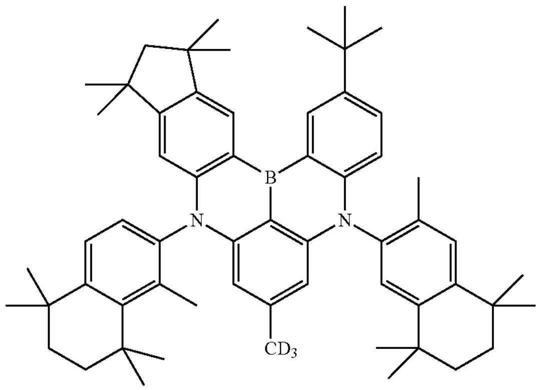
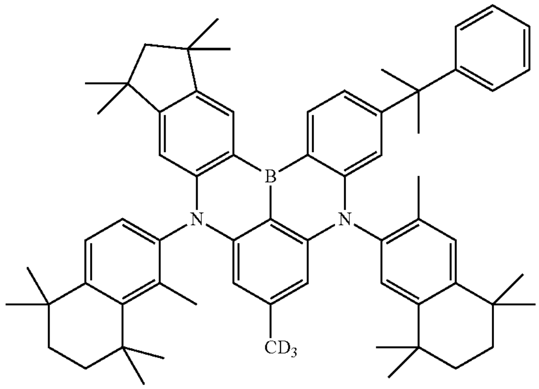

-continued
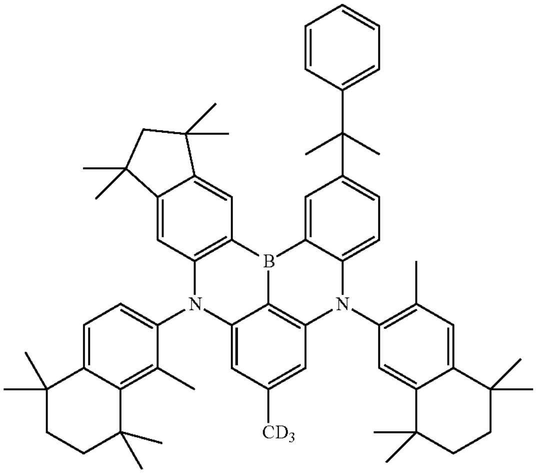
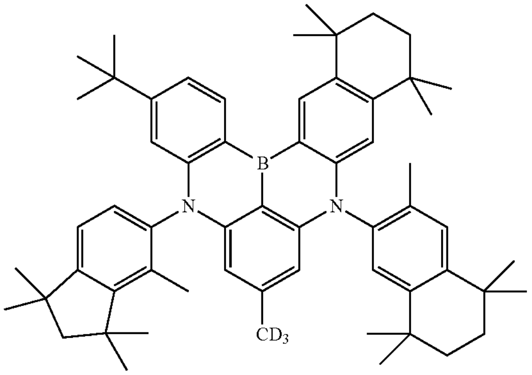
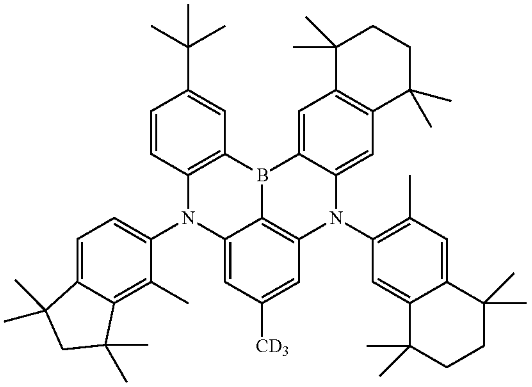
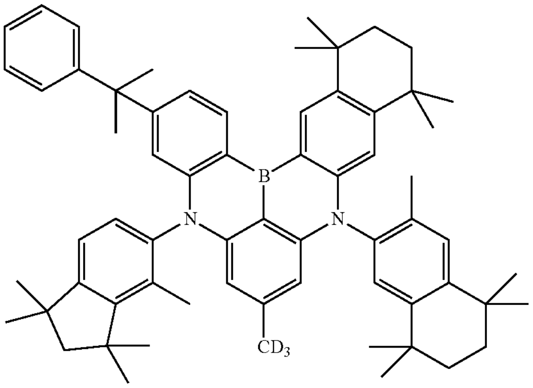
-continued
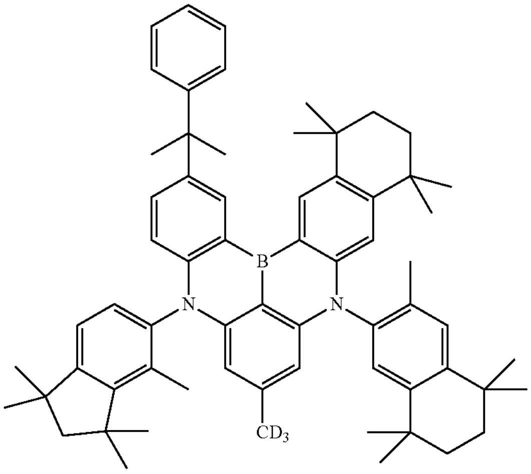
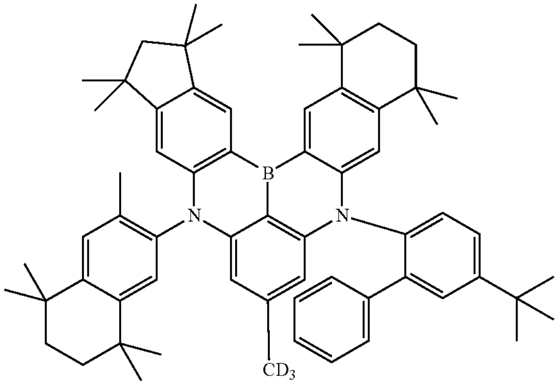
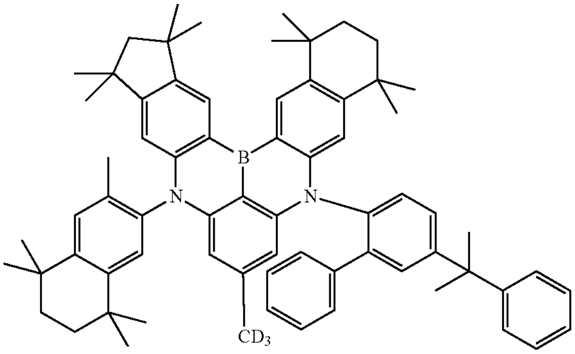
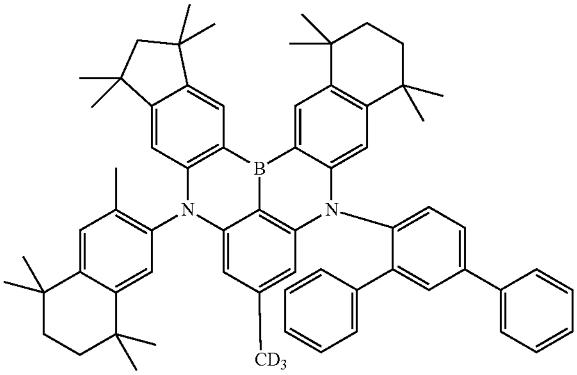

-continued
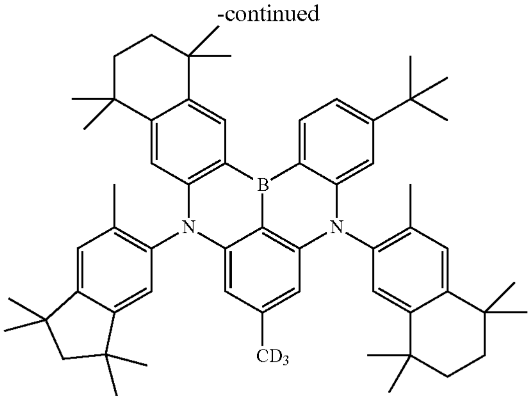
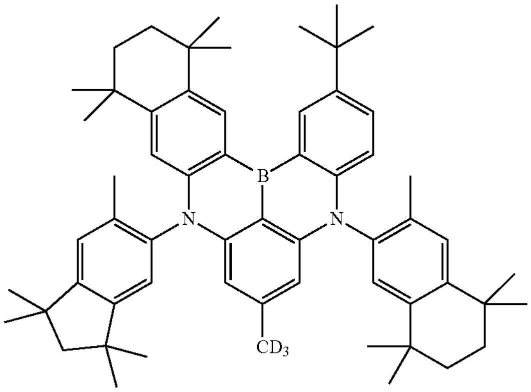
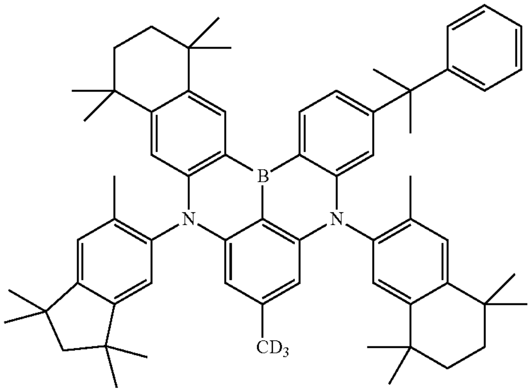
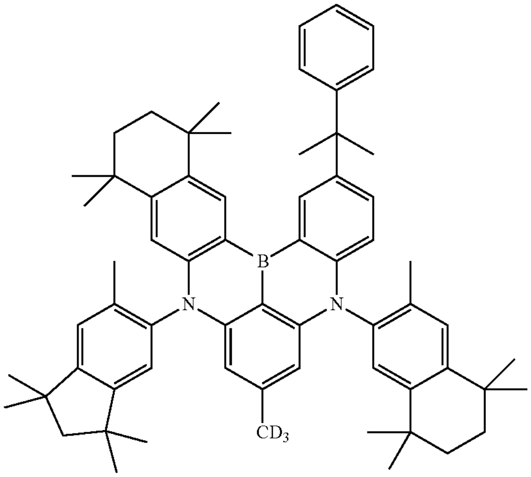
-continued
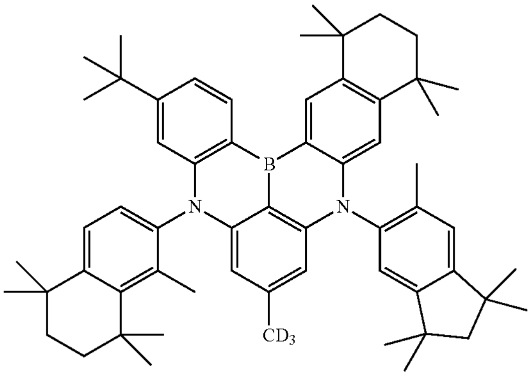
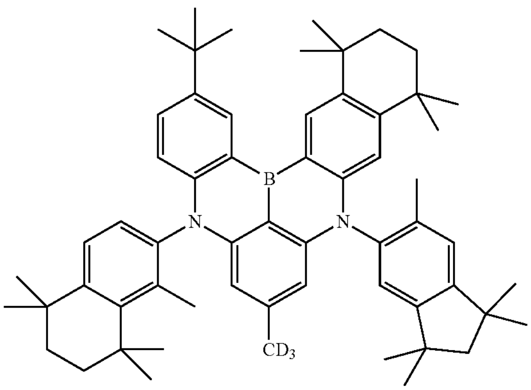
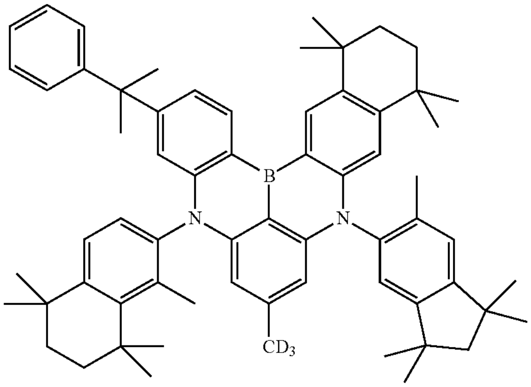
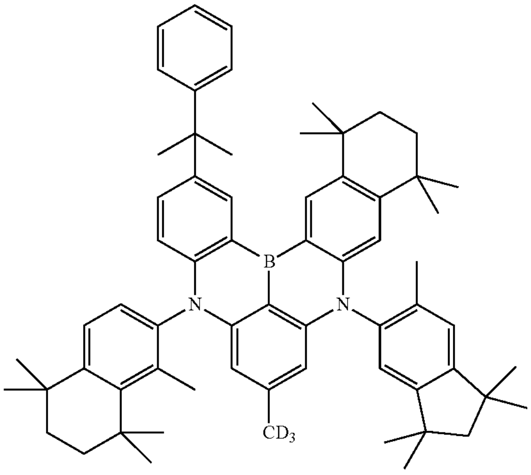

-continued
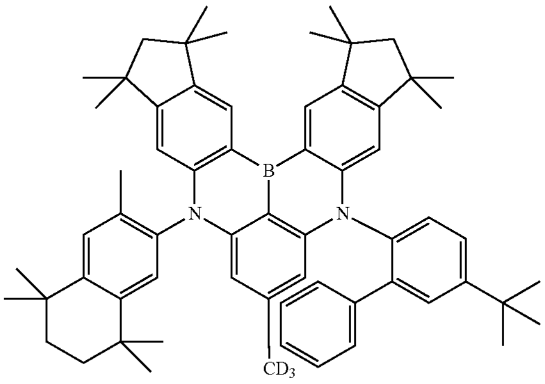
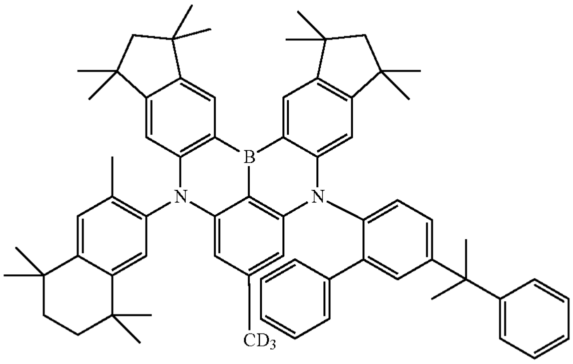
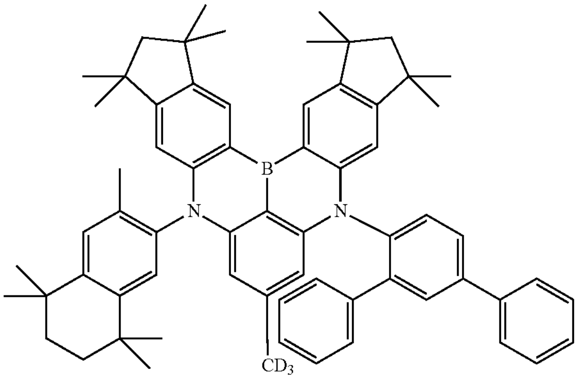
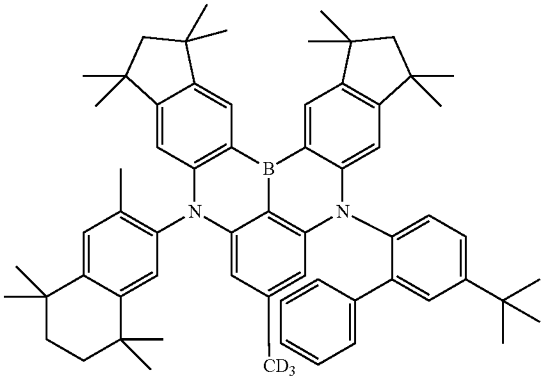
-continued
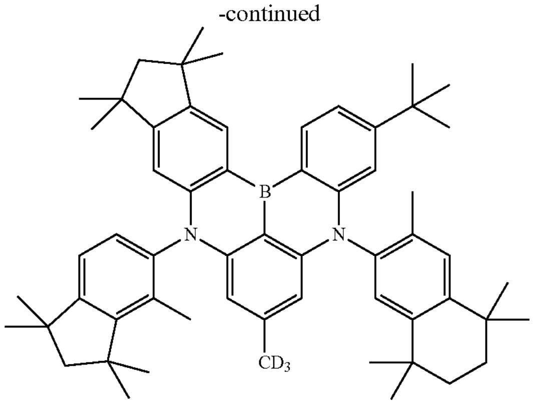
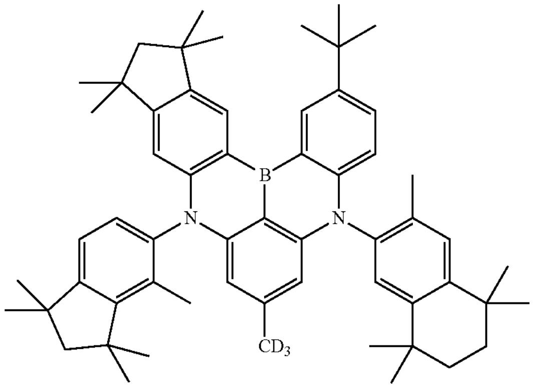
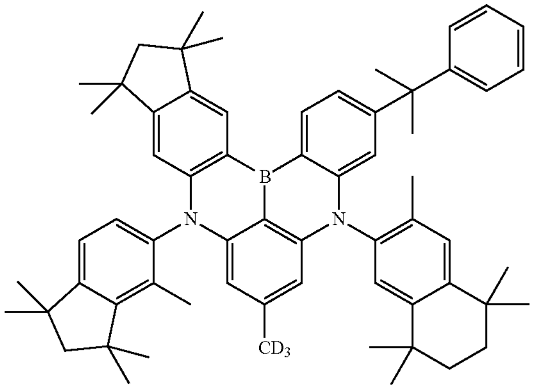
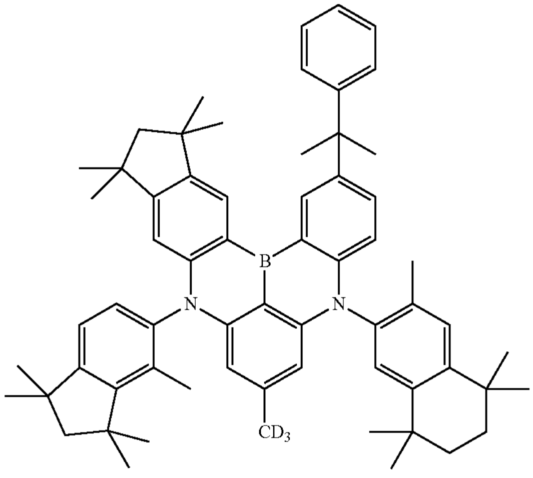

-continued
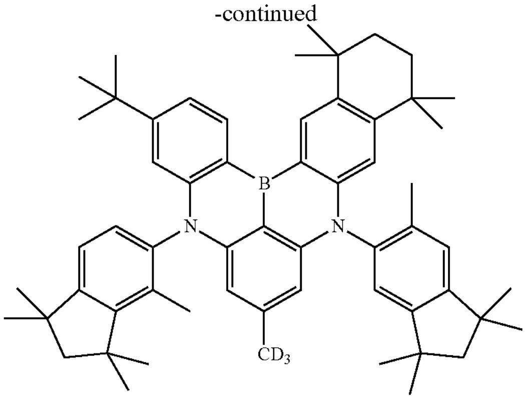
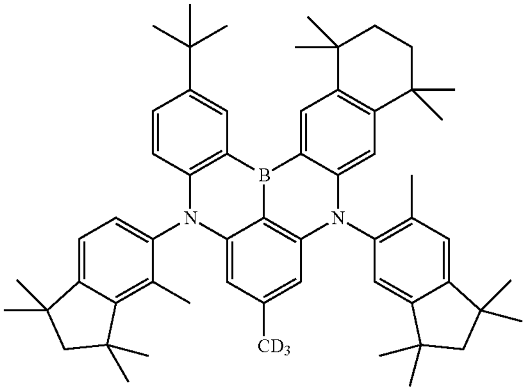
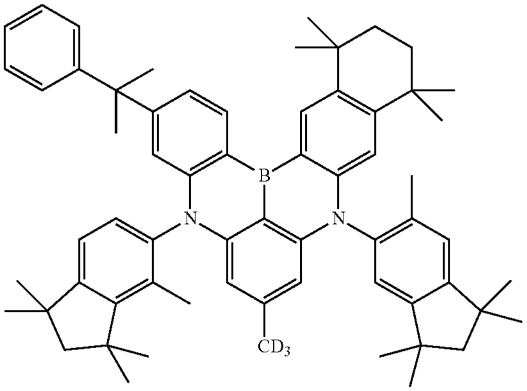
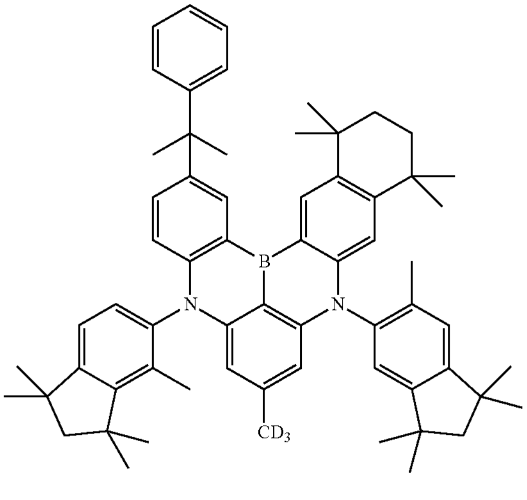
-continued
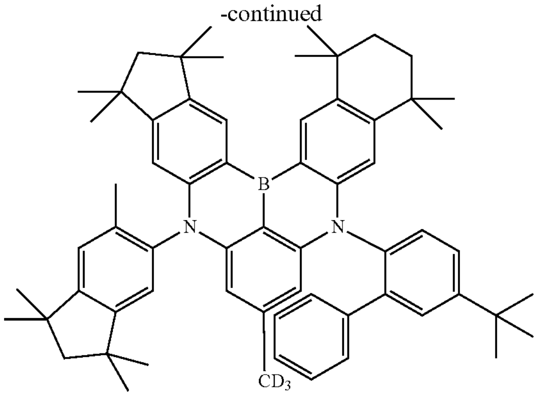
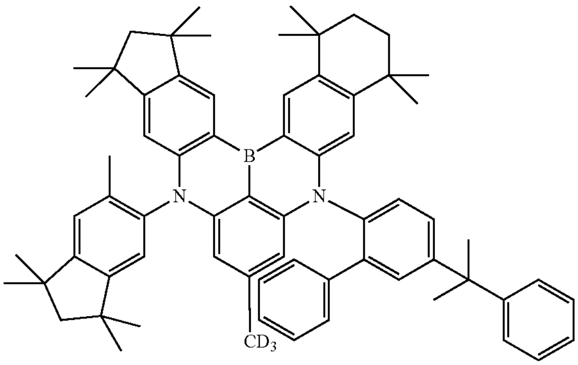
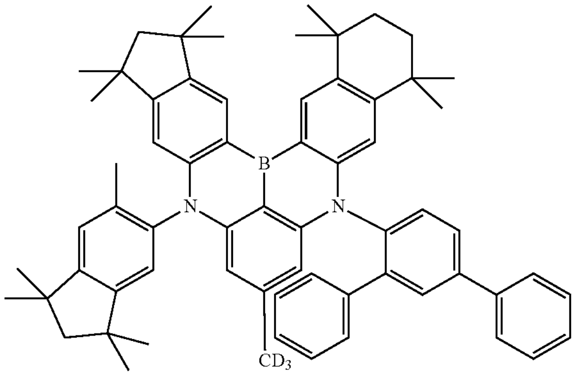
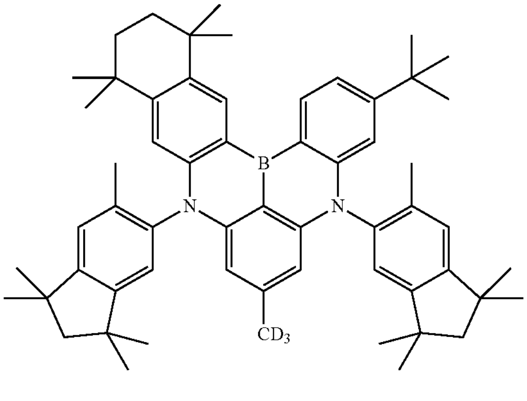

-continued
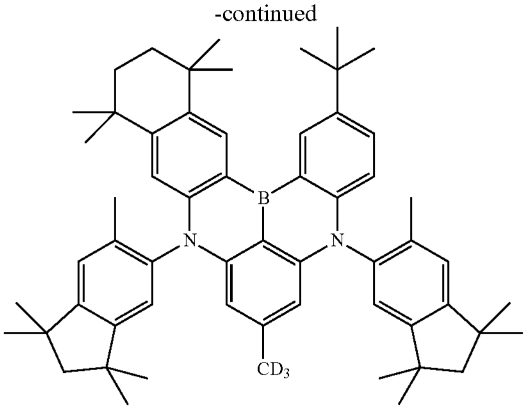
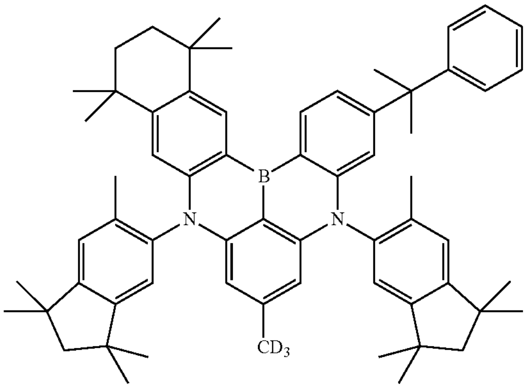
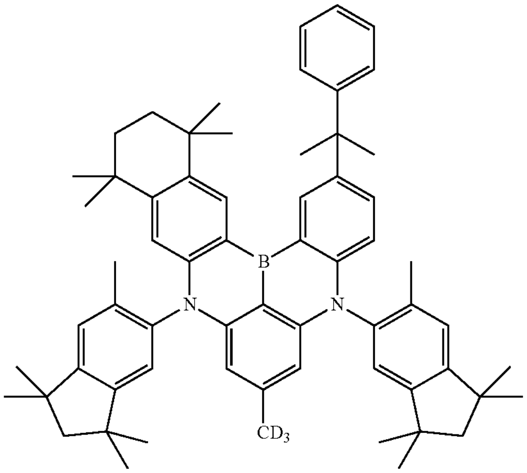
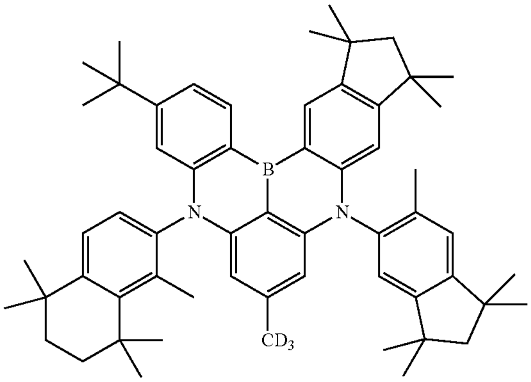
-continued
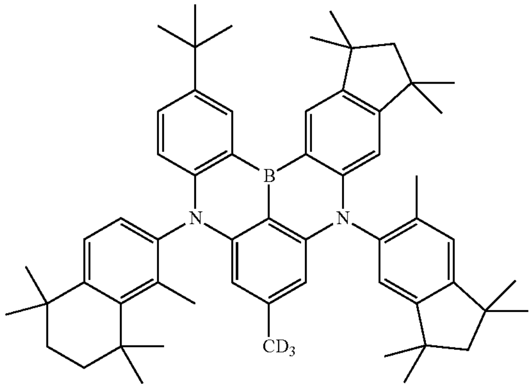
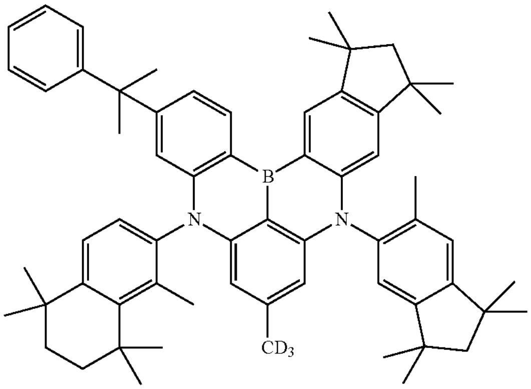
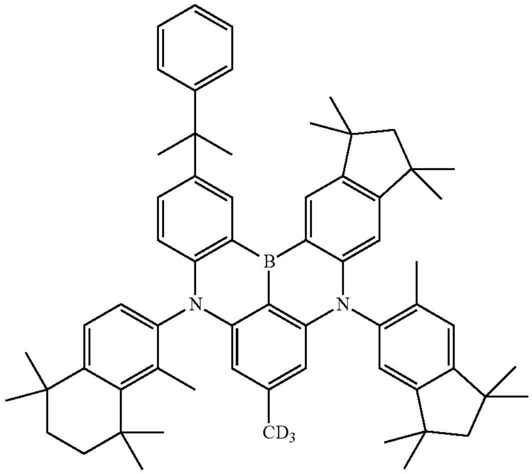
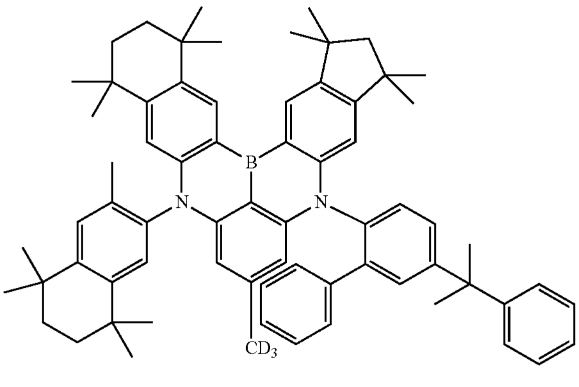

-continued
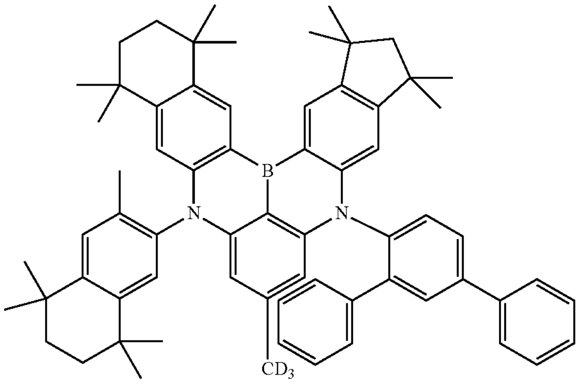
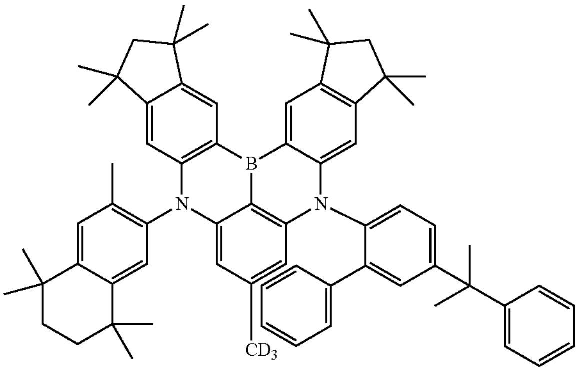
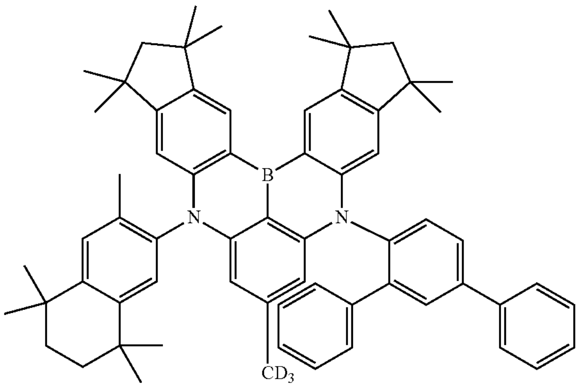
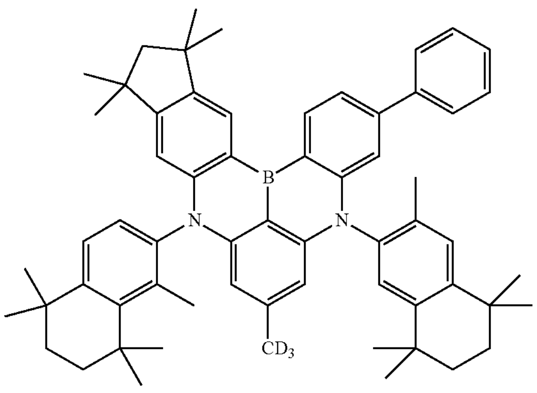
-continued
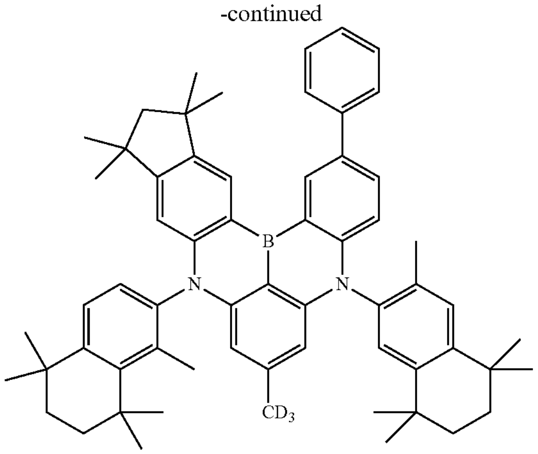
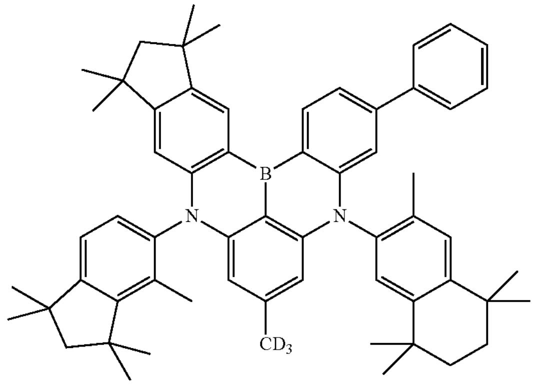
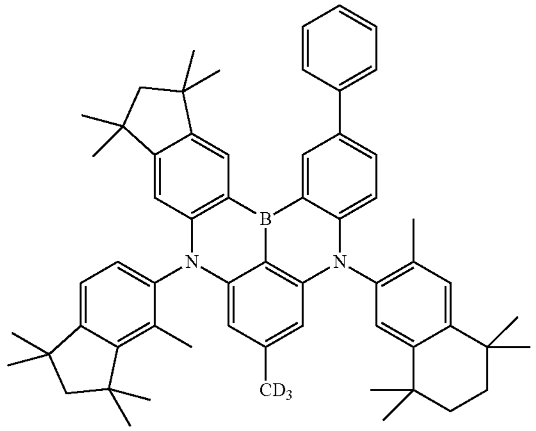
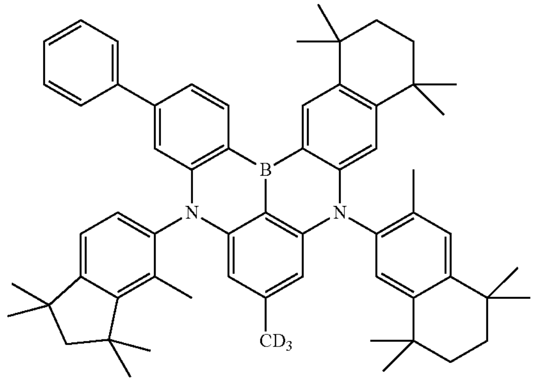

-continued
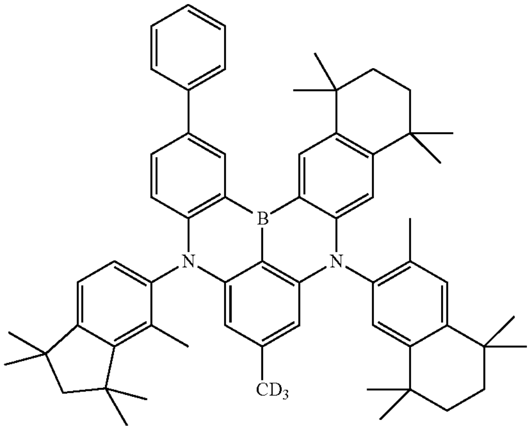
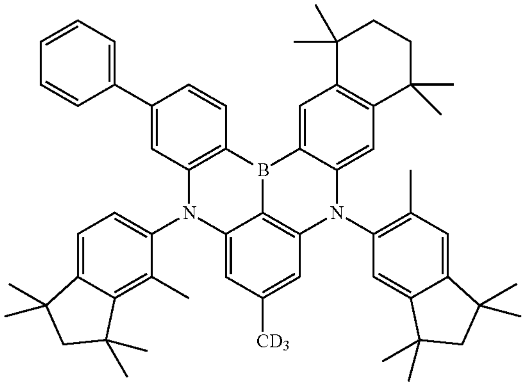
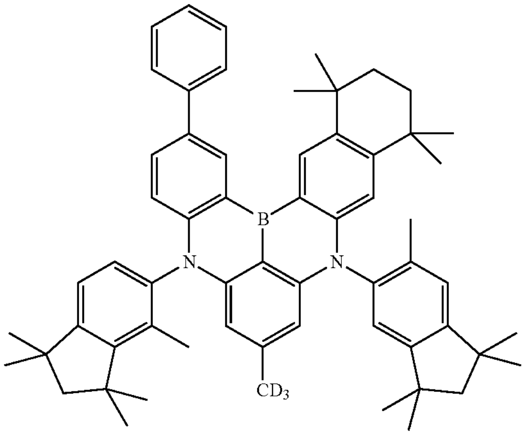
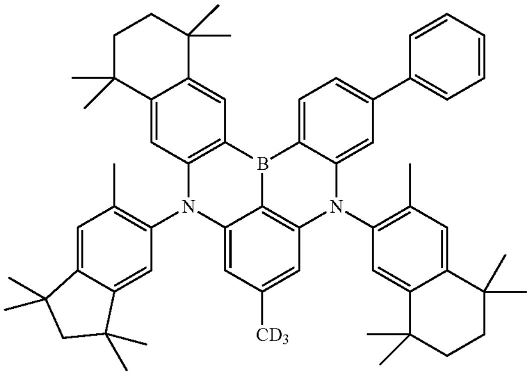
-continued
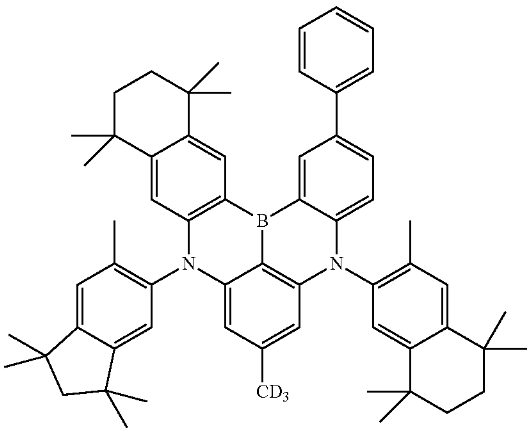
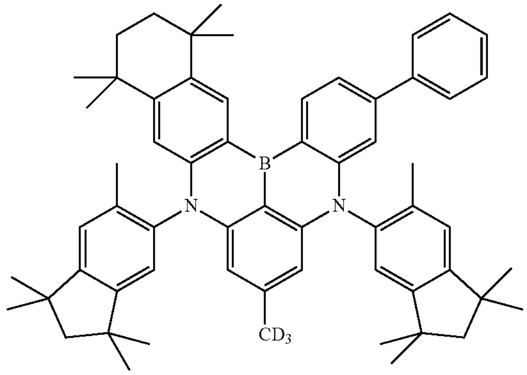
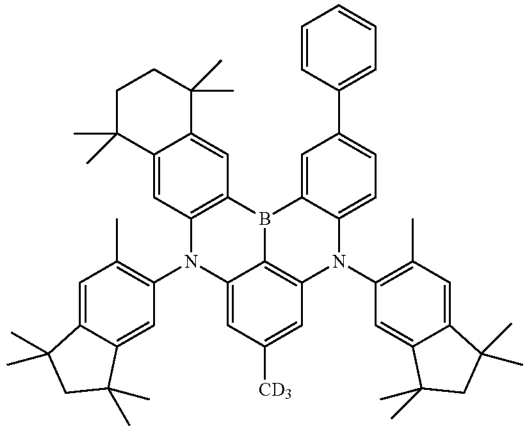
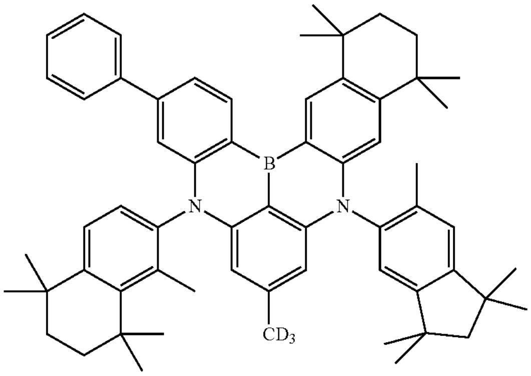

-continued
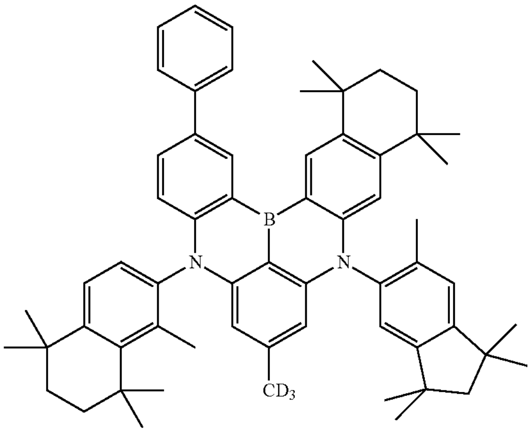
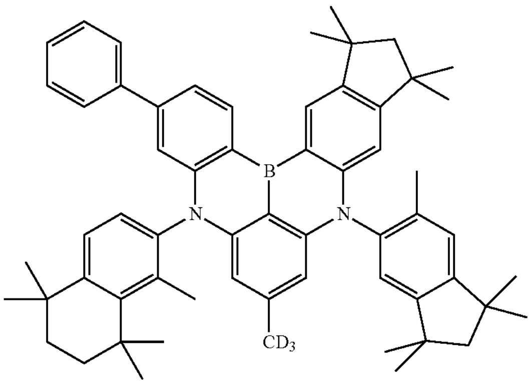
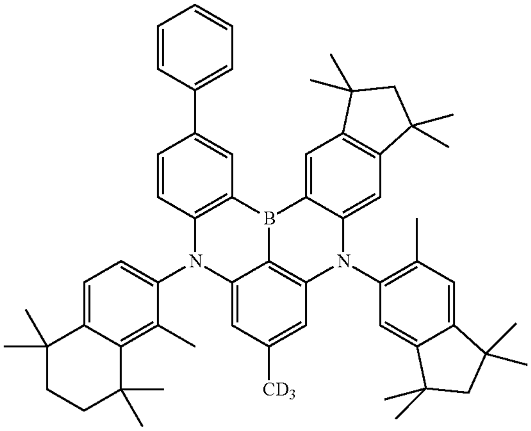
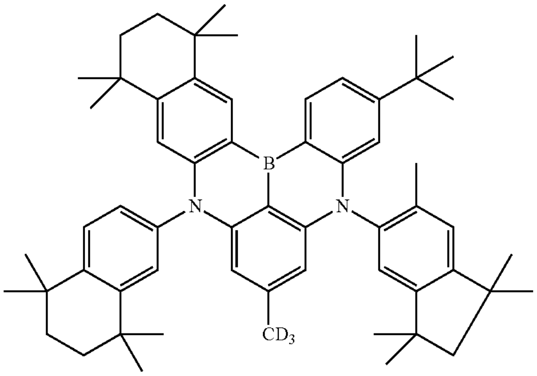
-continued
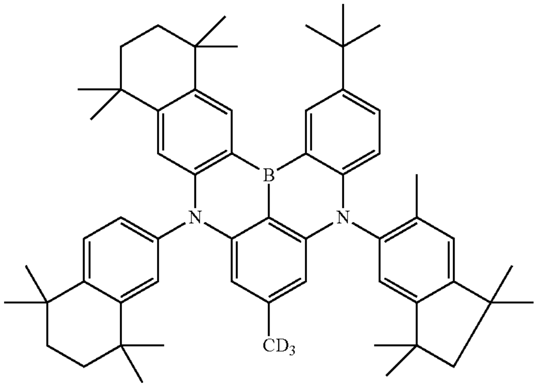
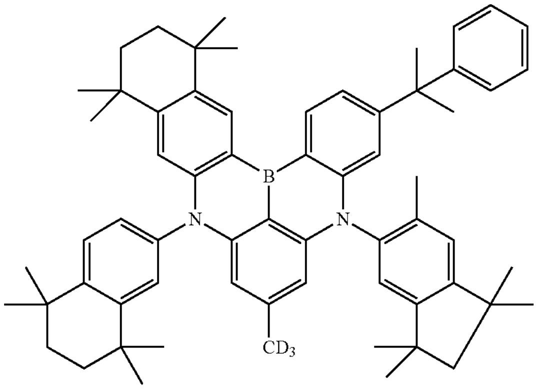
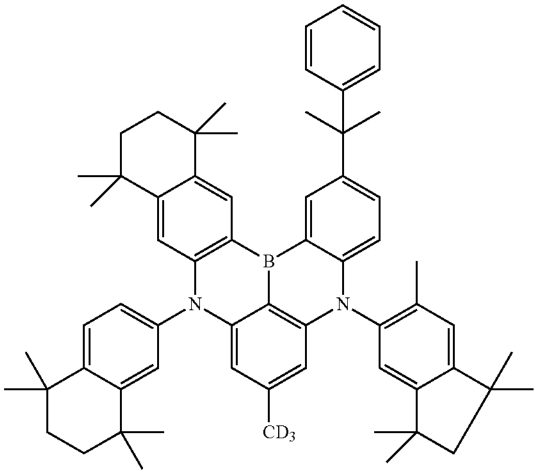
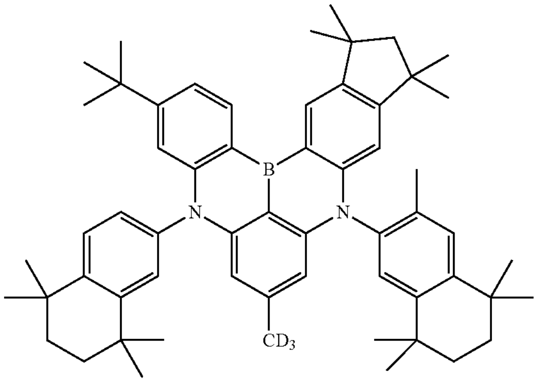

-continued
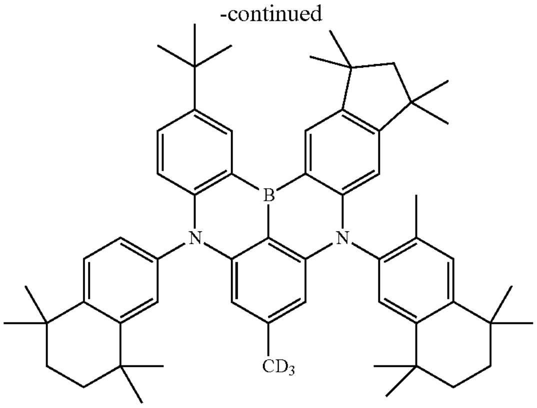
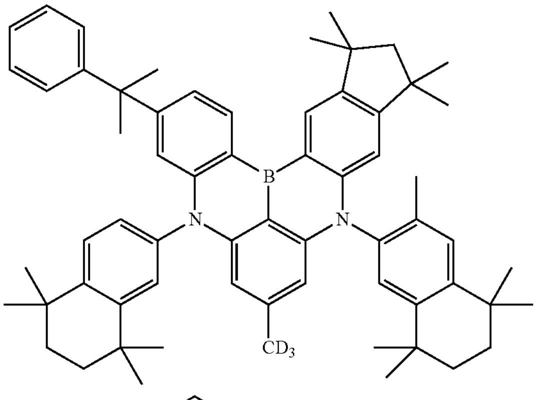
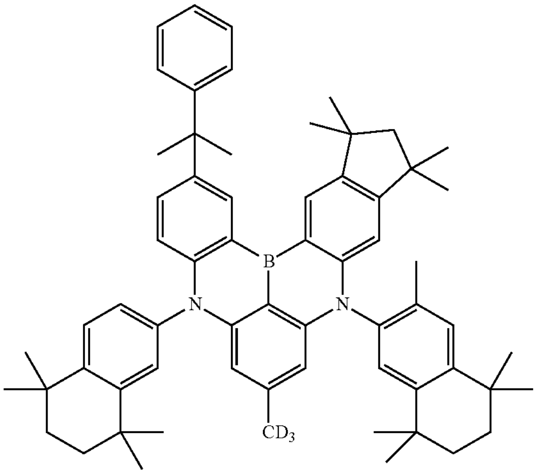
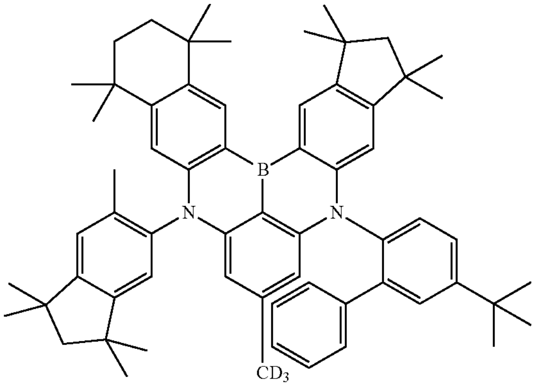
-continued
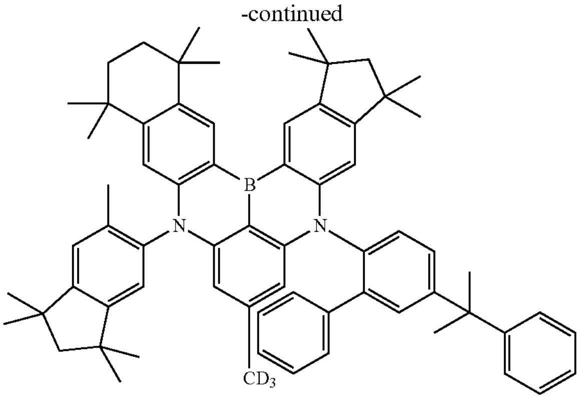
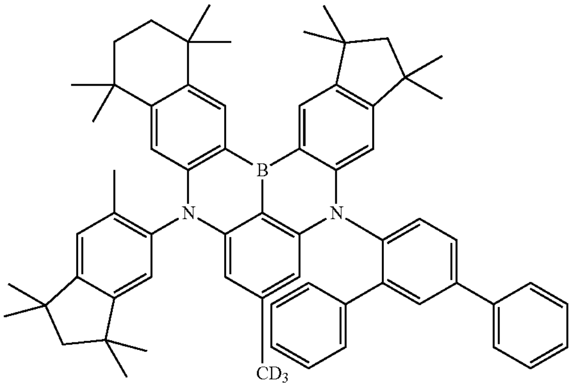
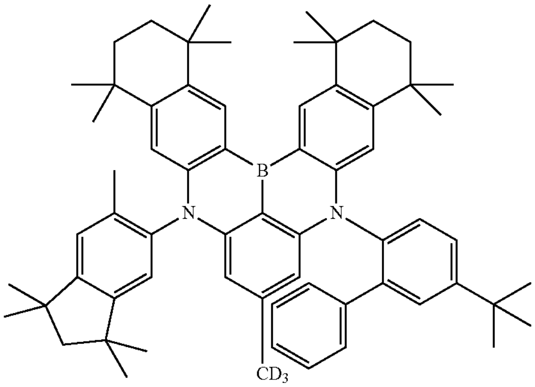
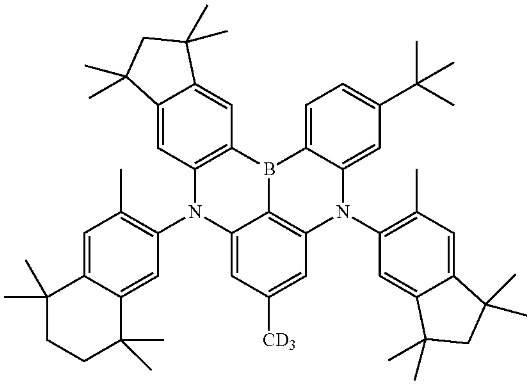

-continued
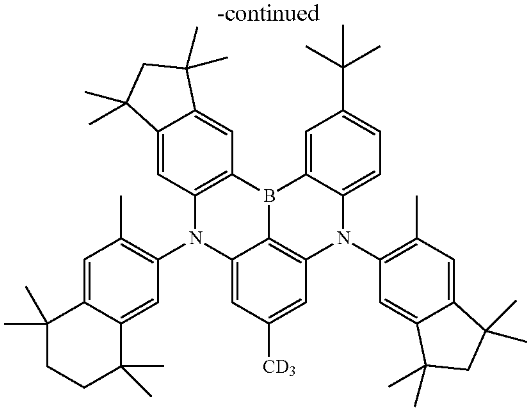
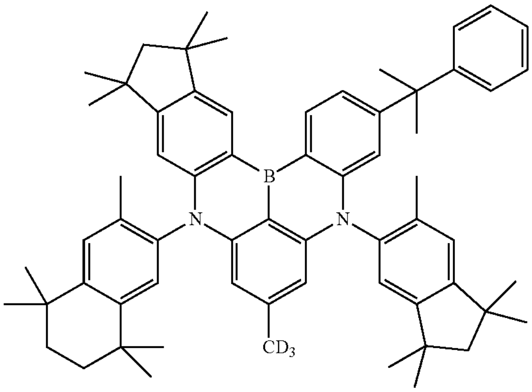
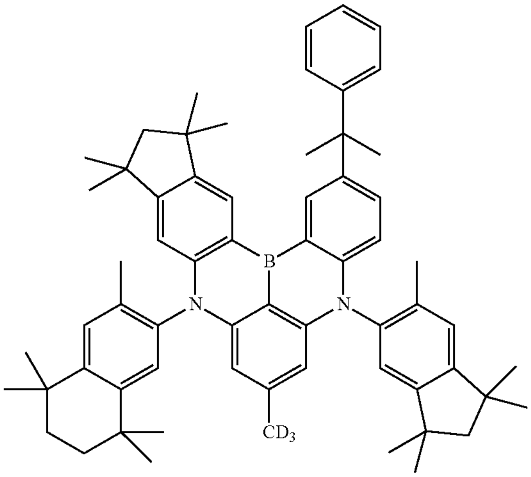
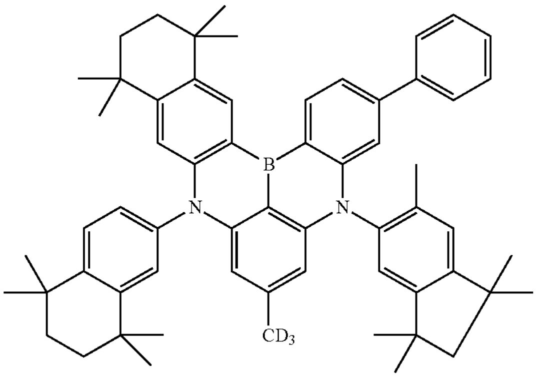
-continued
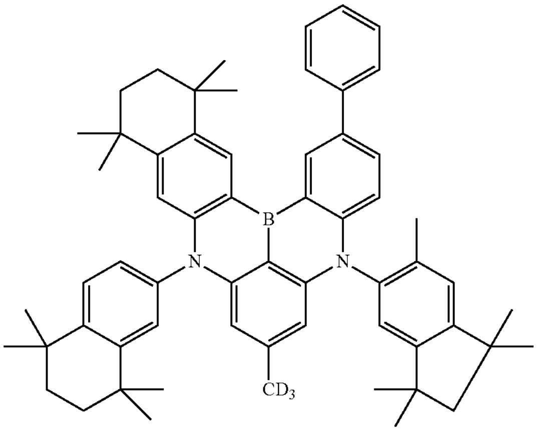
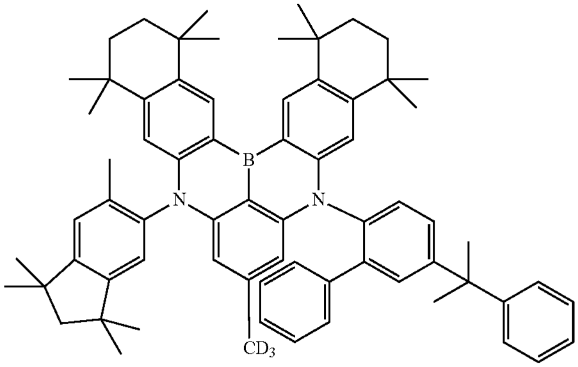
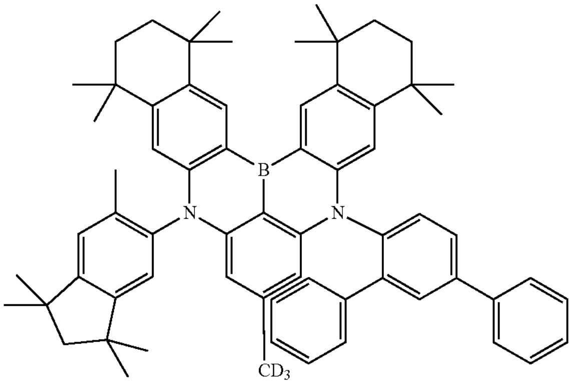
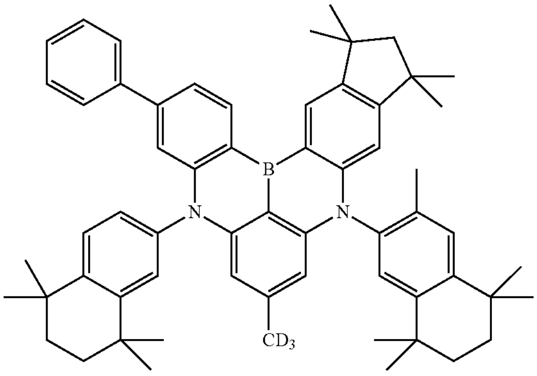

-continued
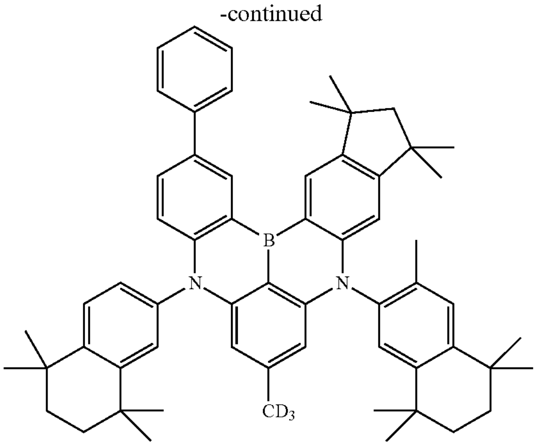
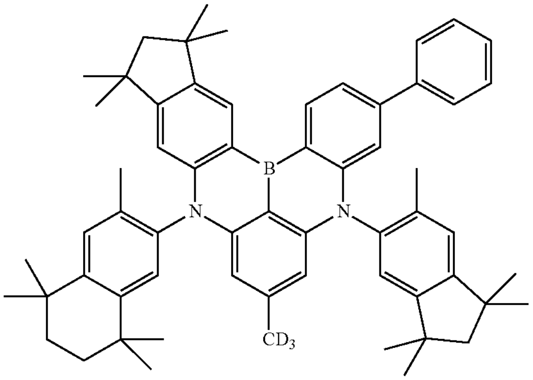
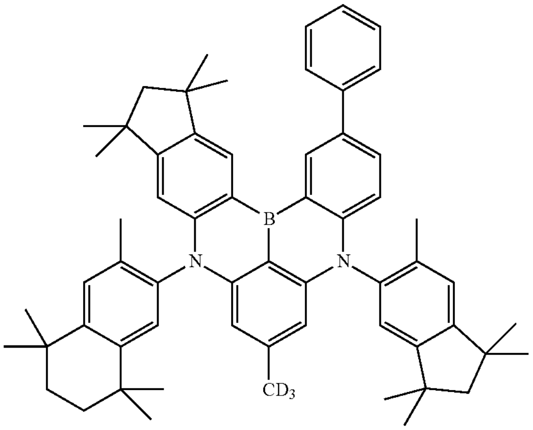
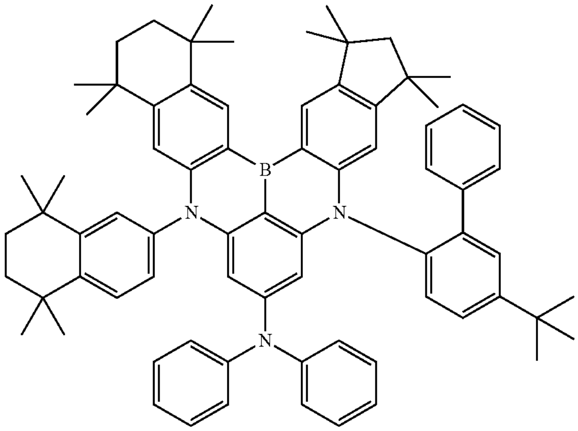
-continued
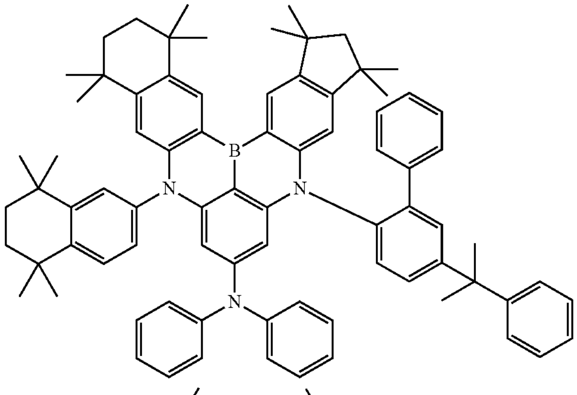
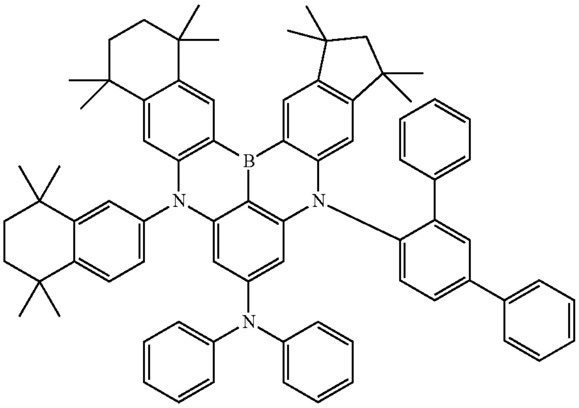
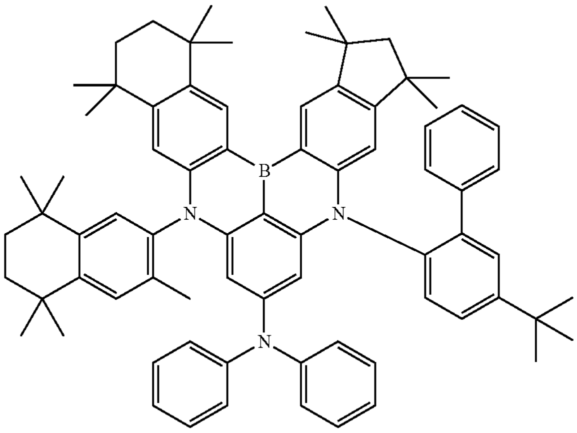
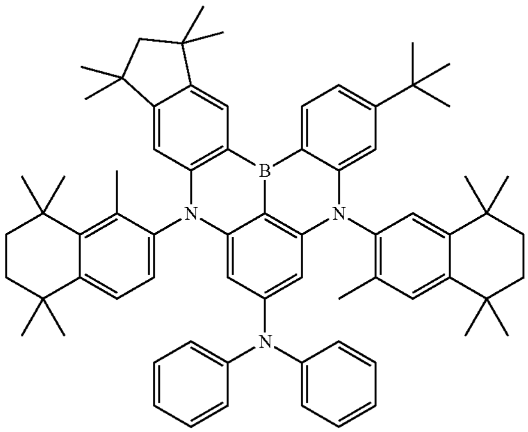

-continued
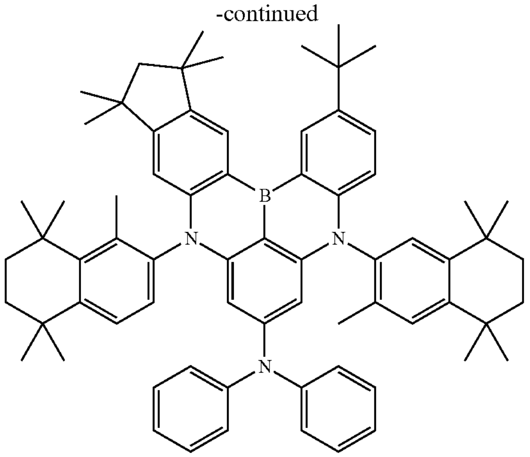
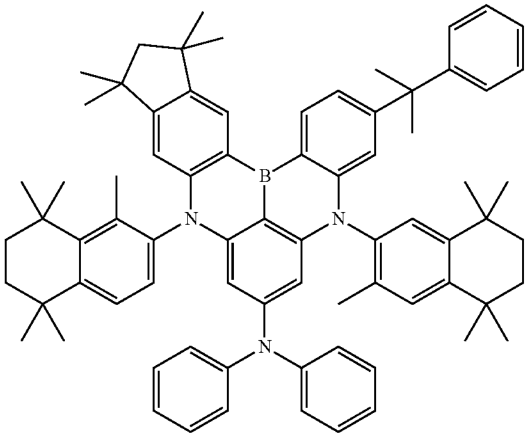
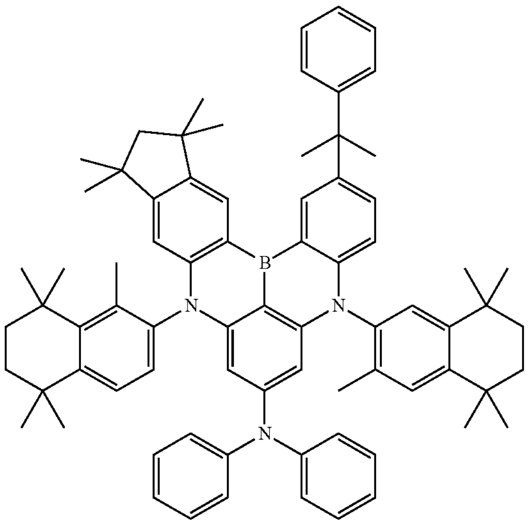
-continued
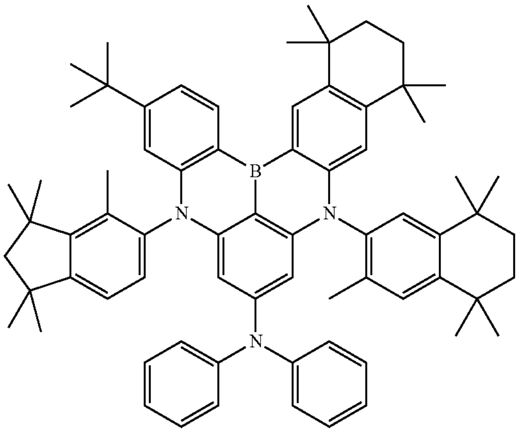
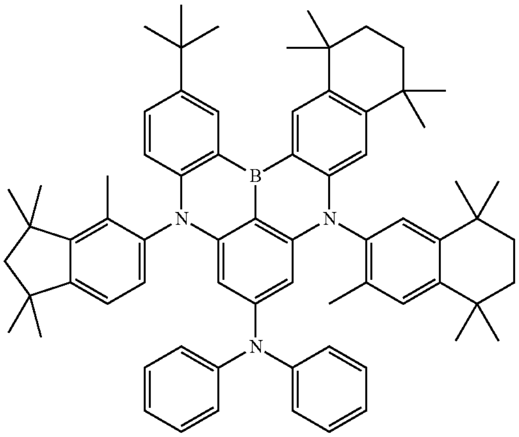
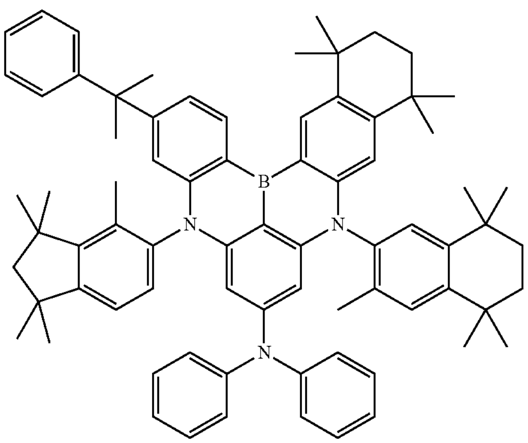

-continued
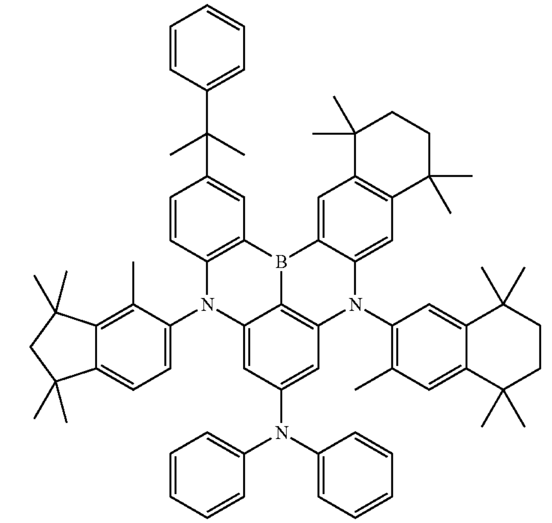
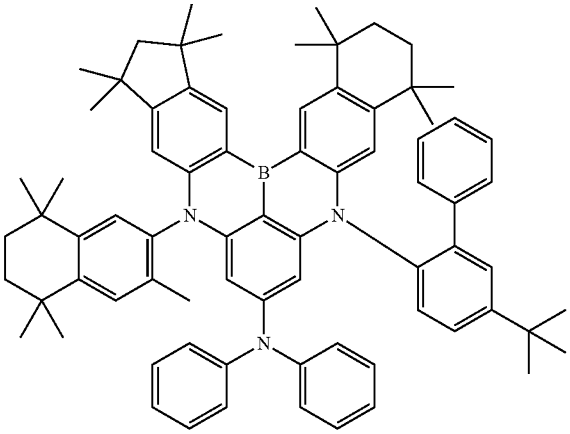
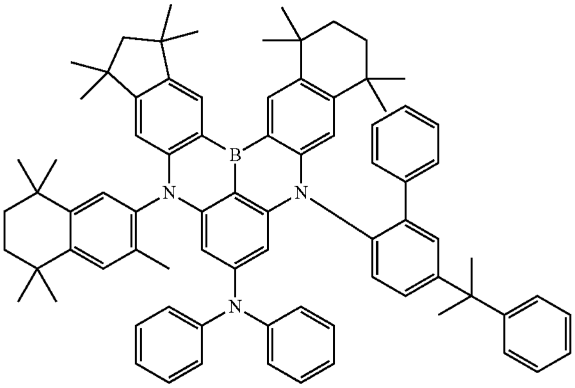
-continued
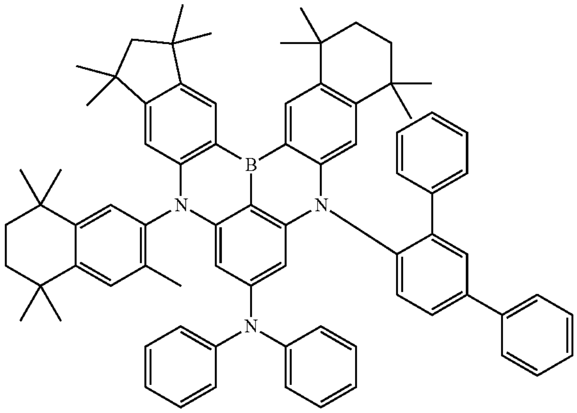
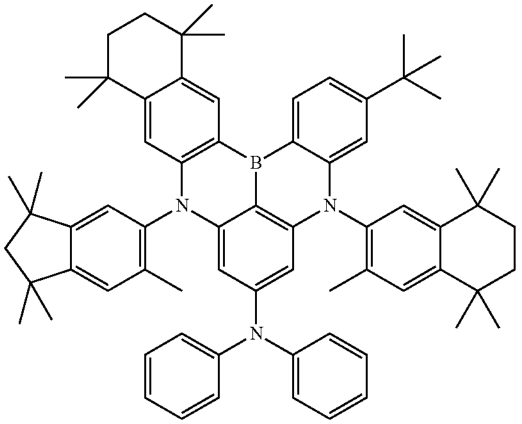
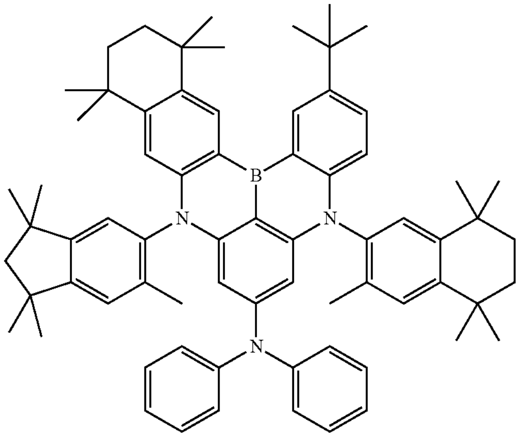
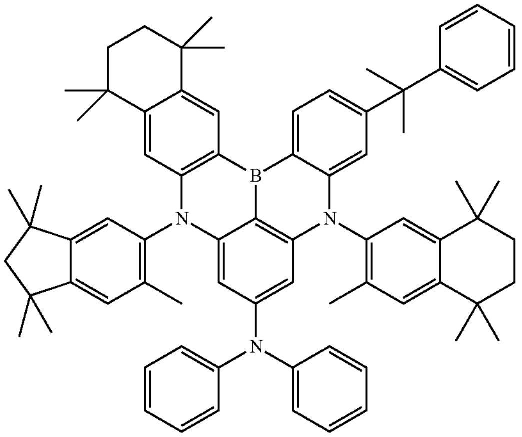

-continued
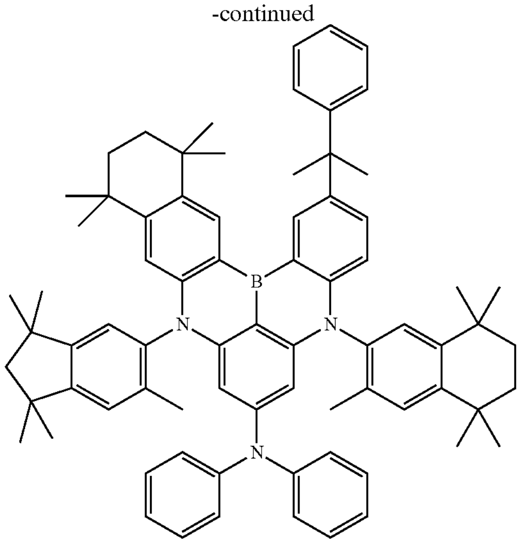
-continued
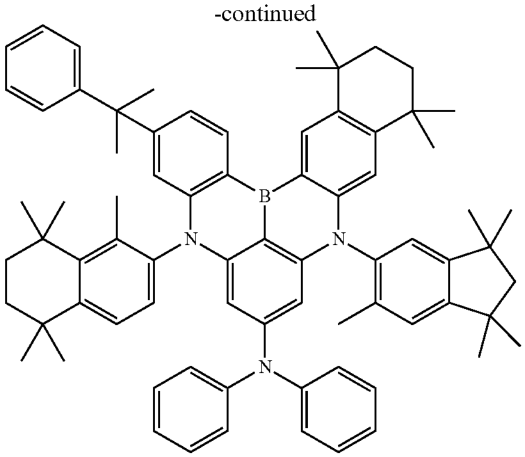
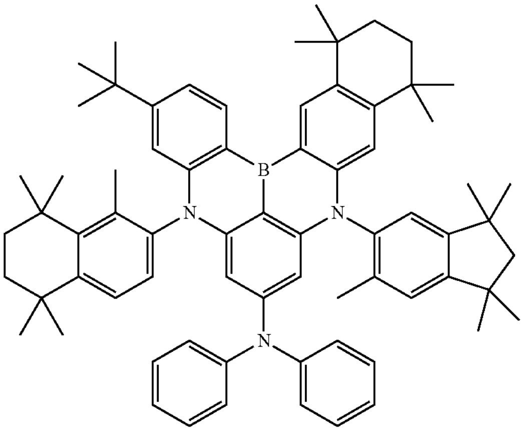
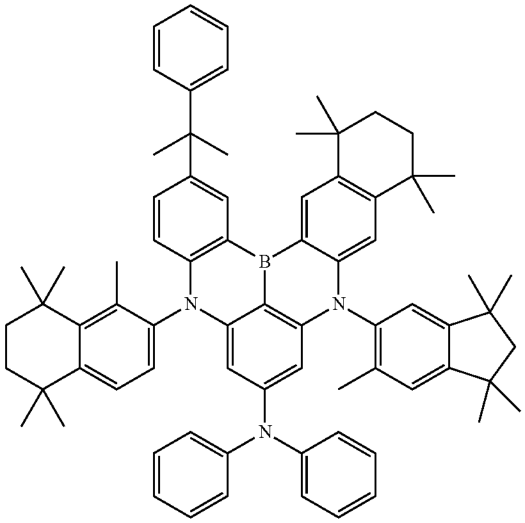
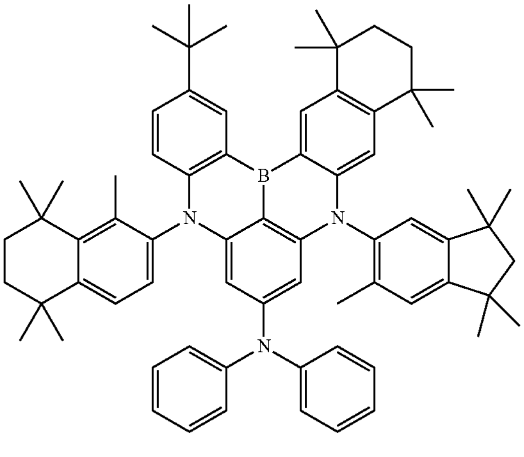
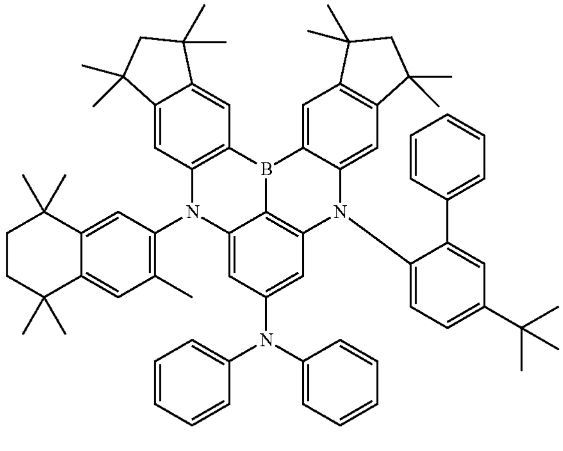

-continued
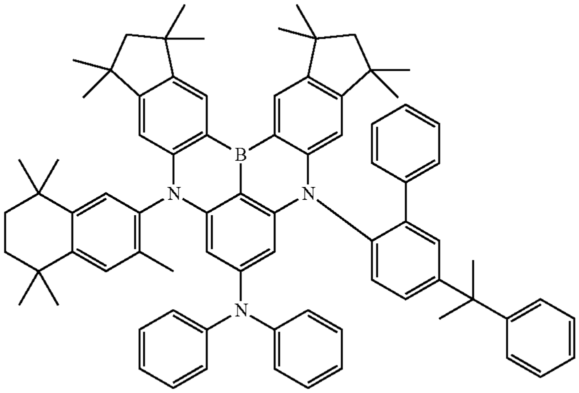
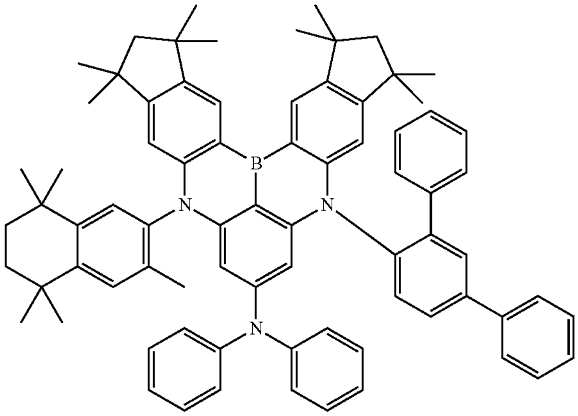
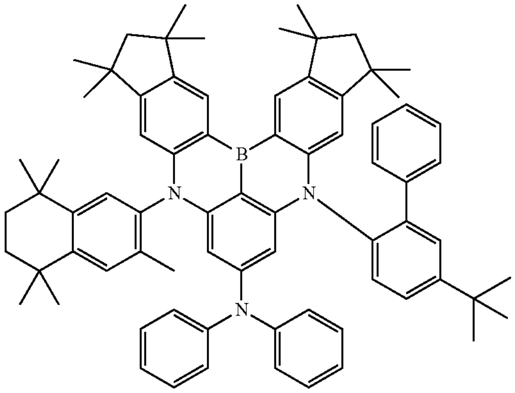
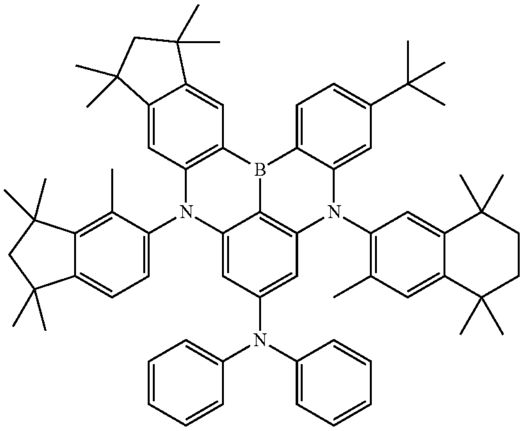
-continued
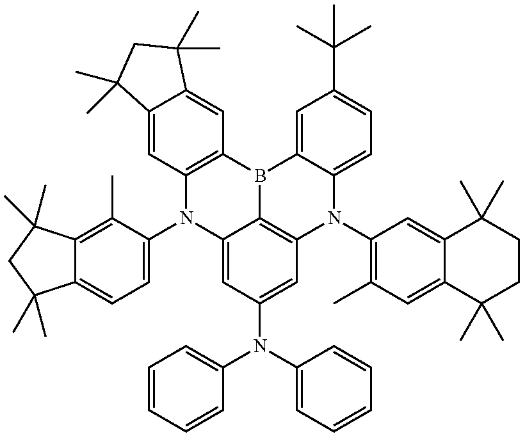
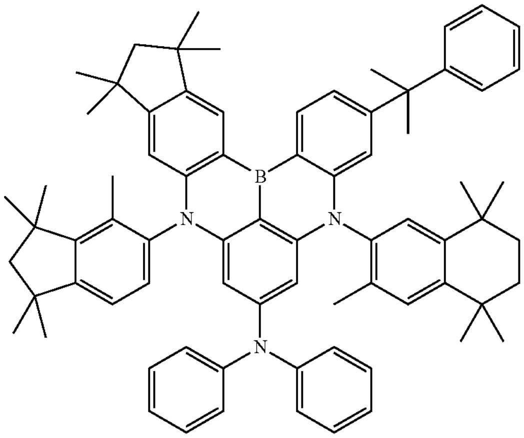
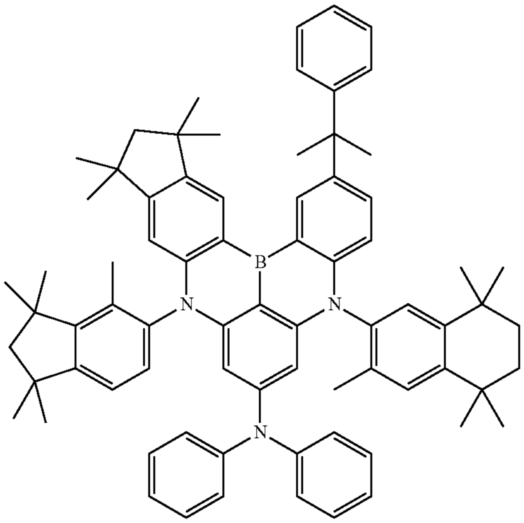

-continued
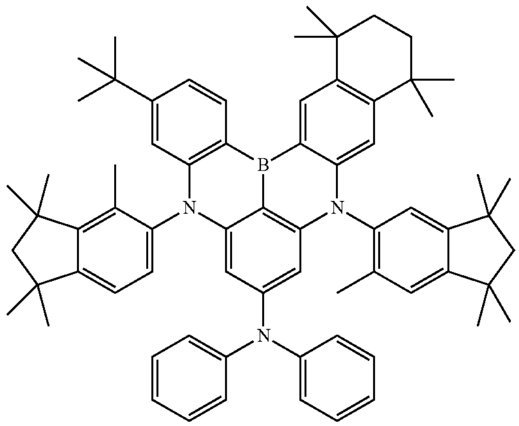
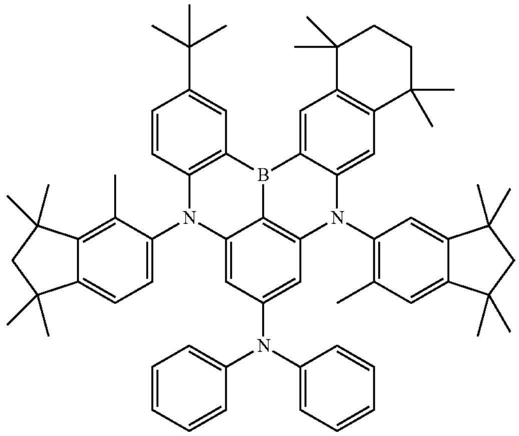
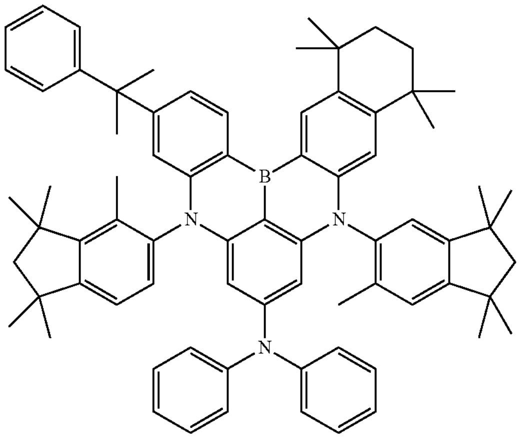
-continued
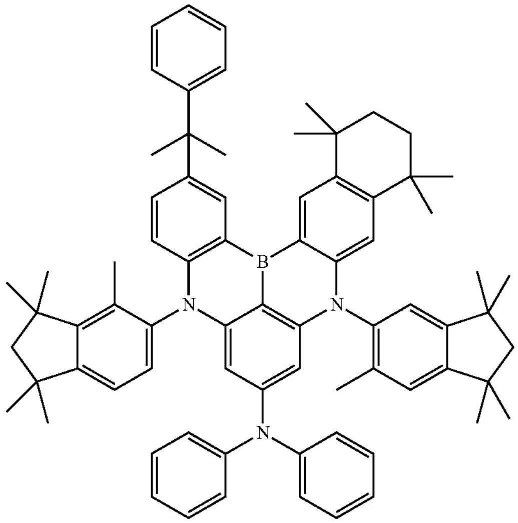
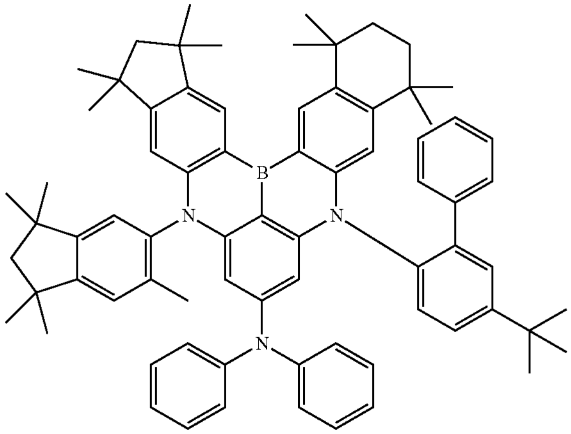
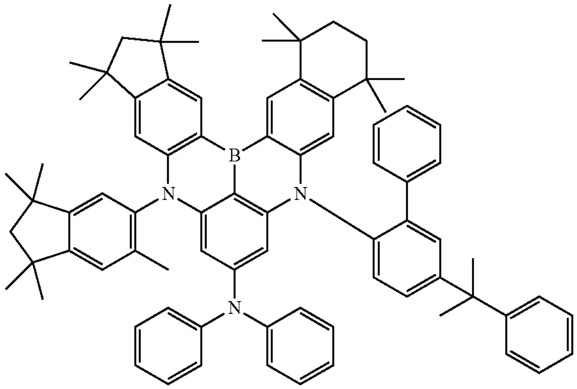

-continued
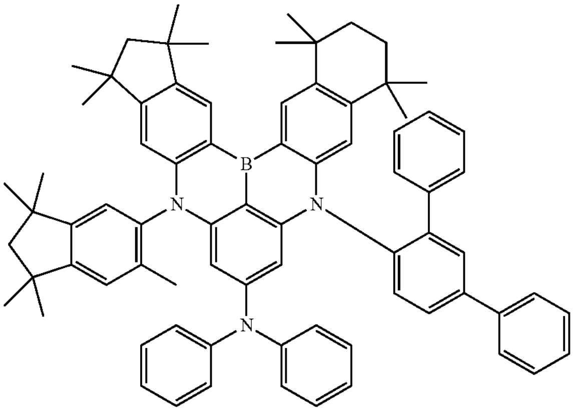
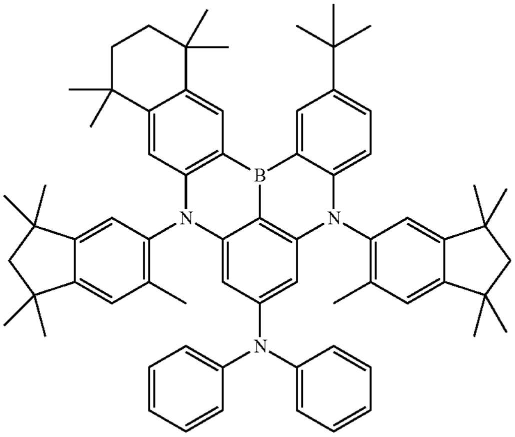
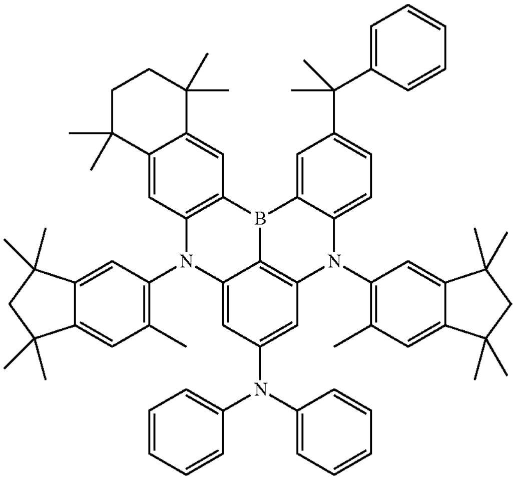
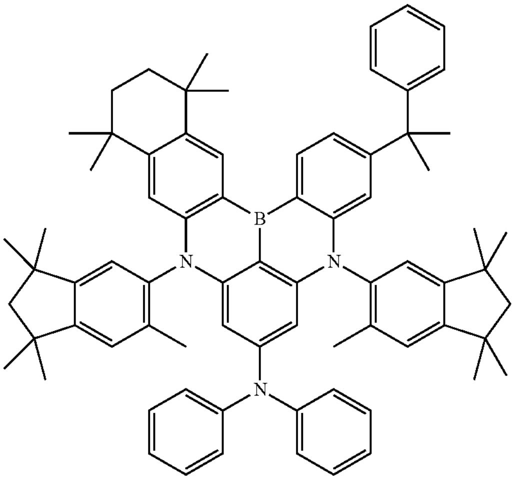
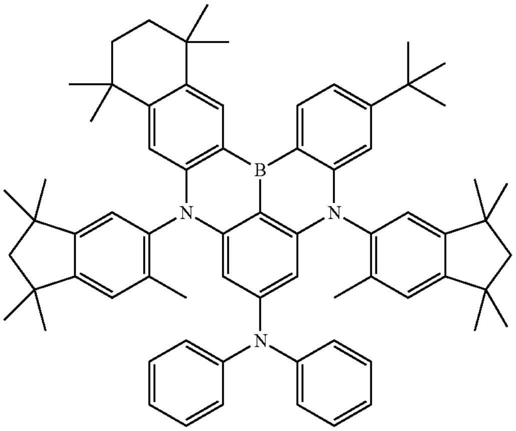
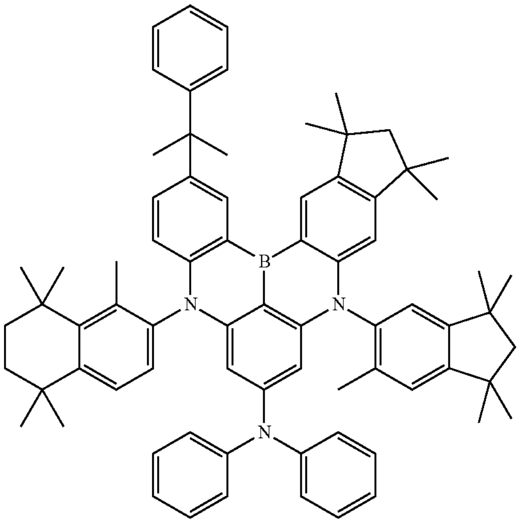

-continued
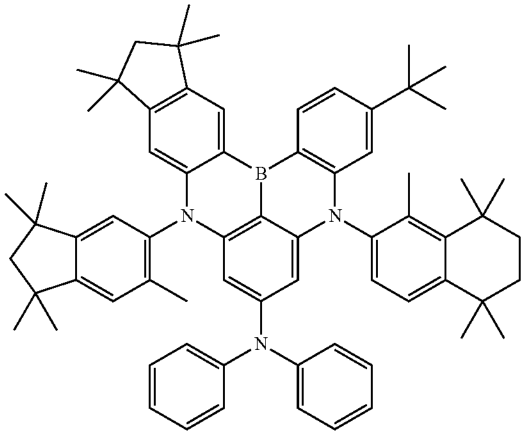
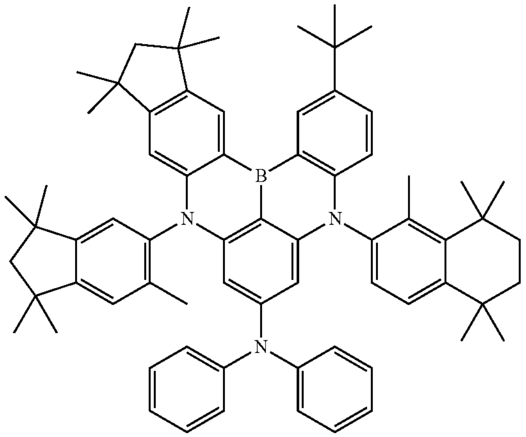
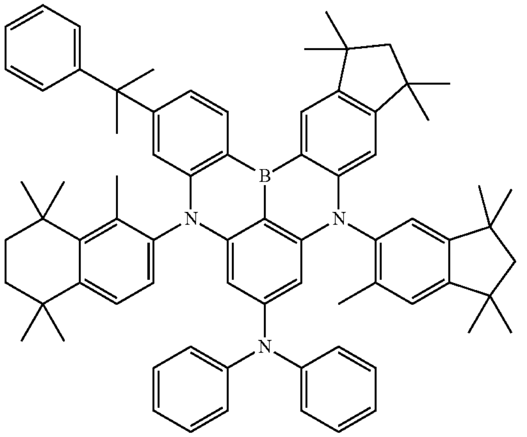
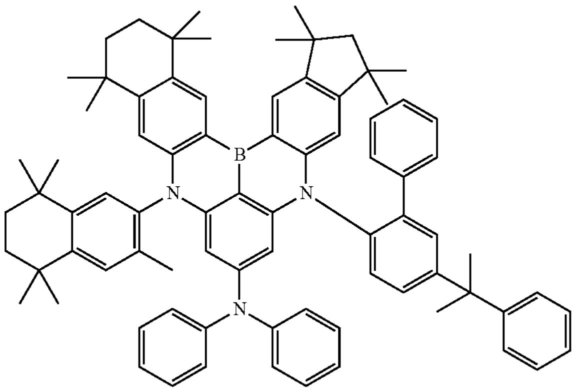
-continued
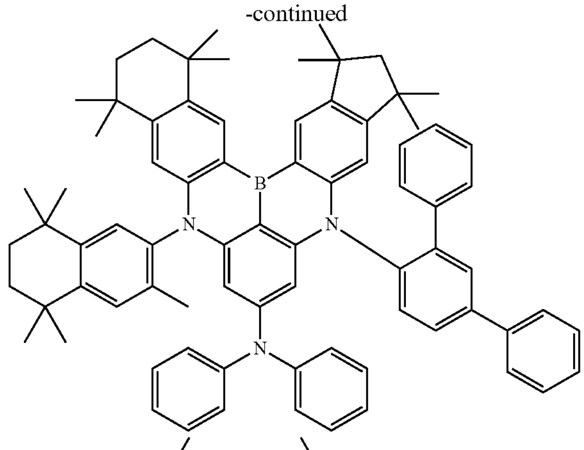
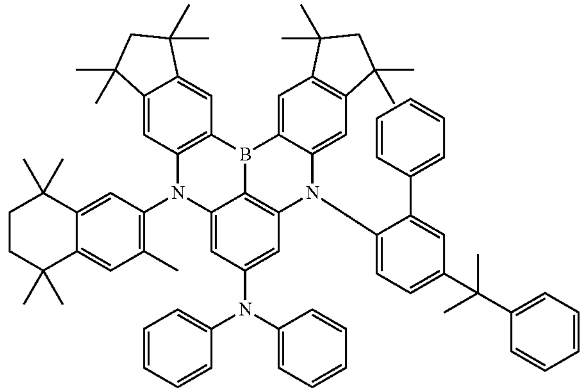
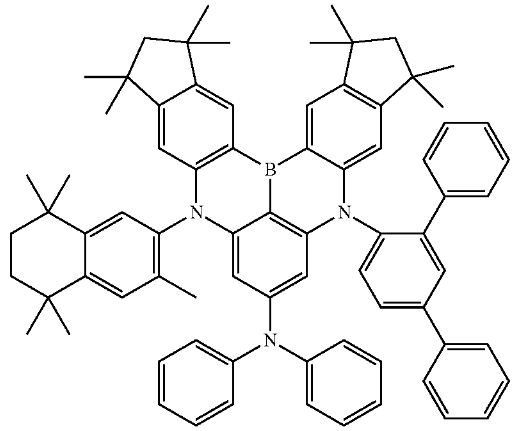
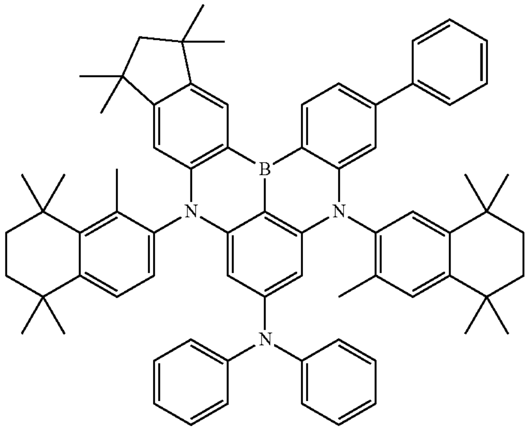

-continued
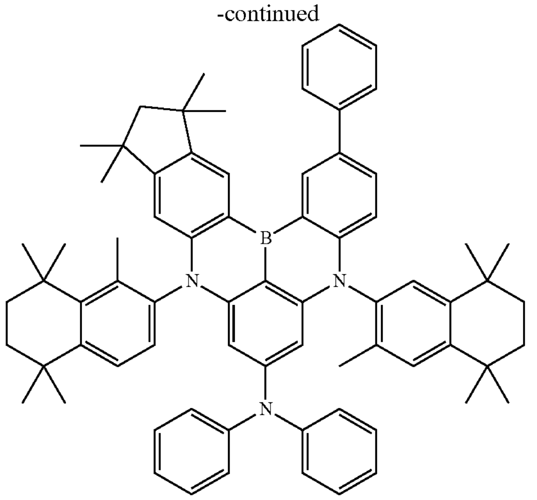
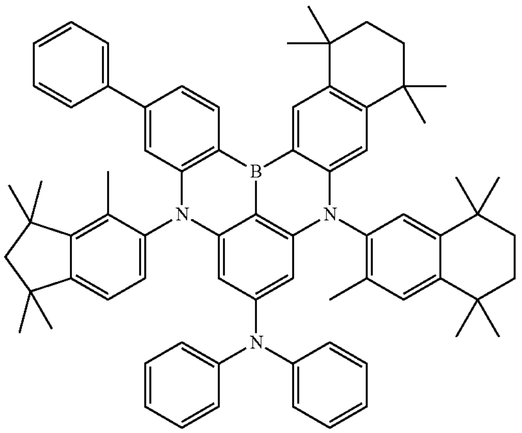
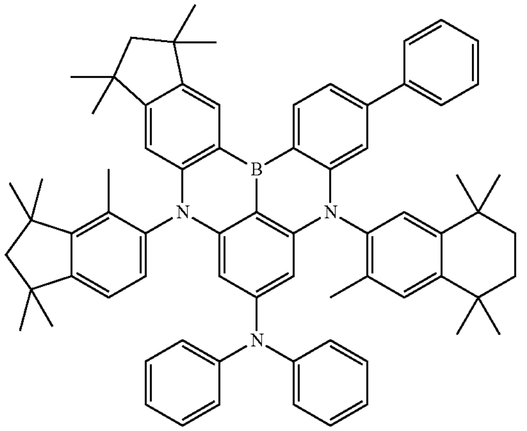
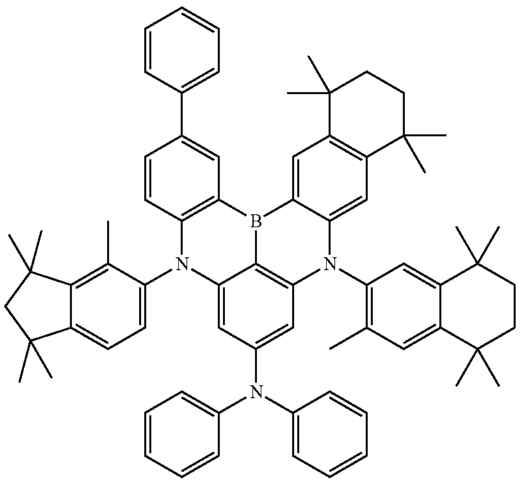
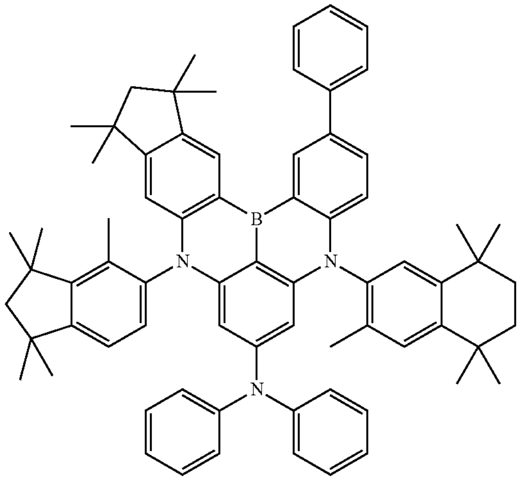
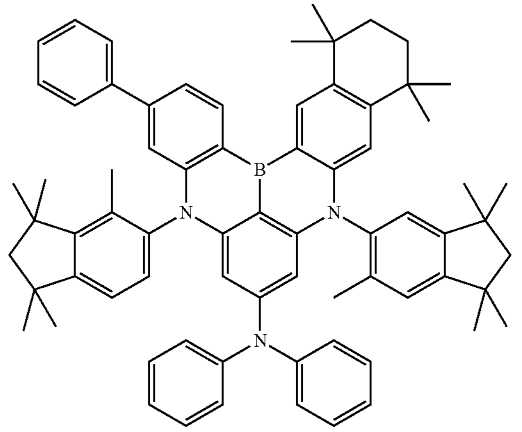
-continued -continued
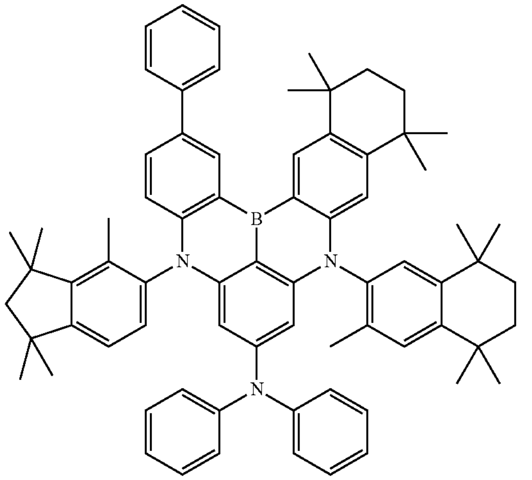
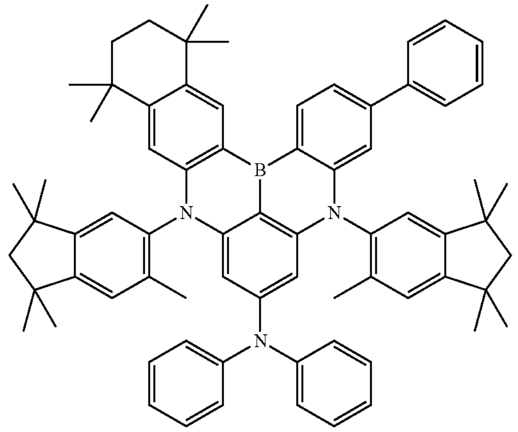
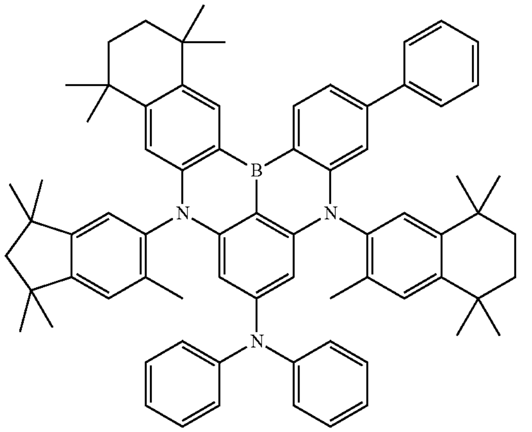
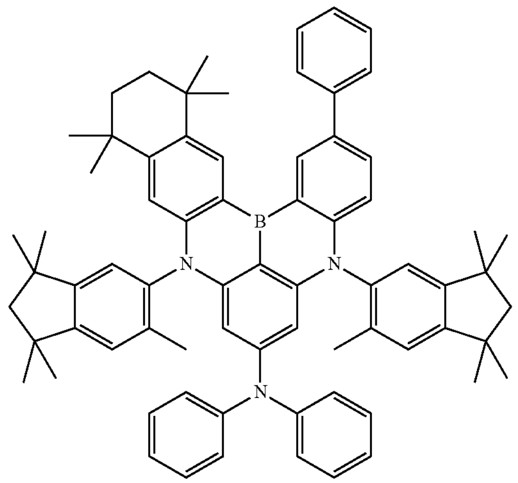
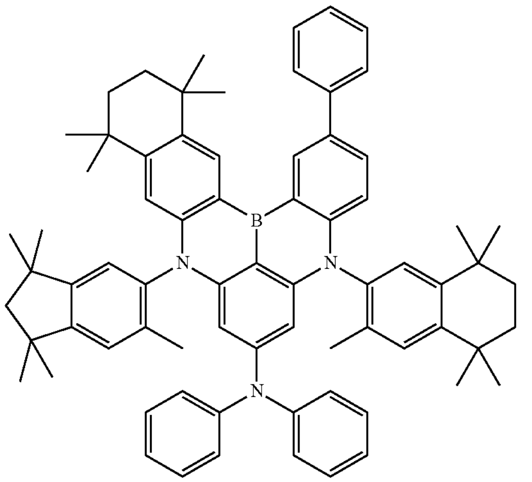
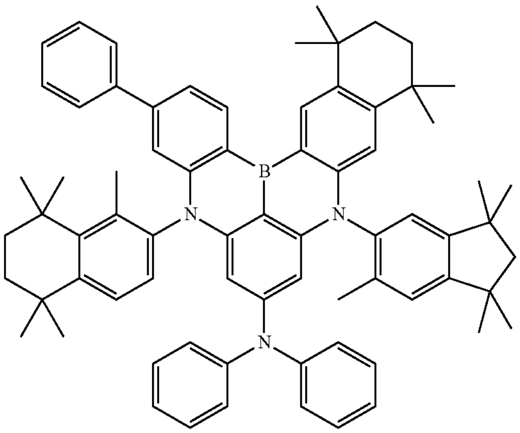
-continued -continued
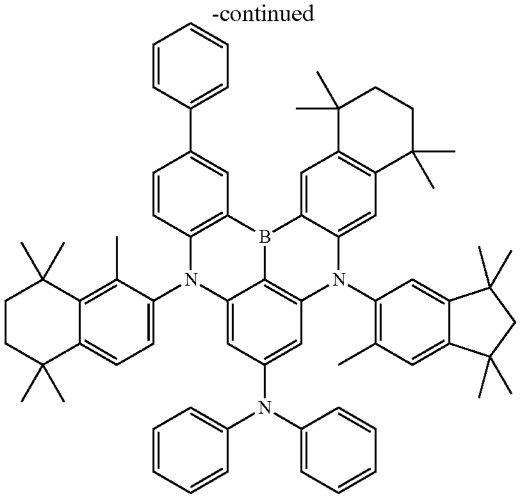
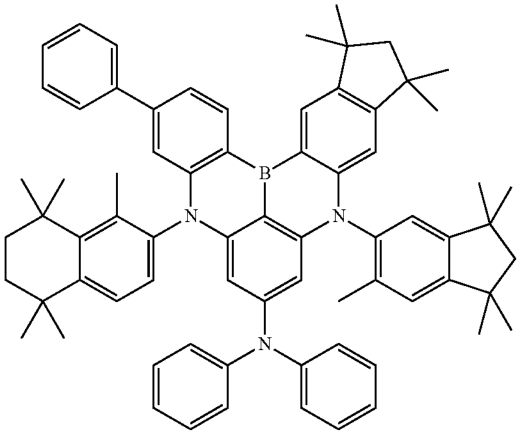
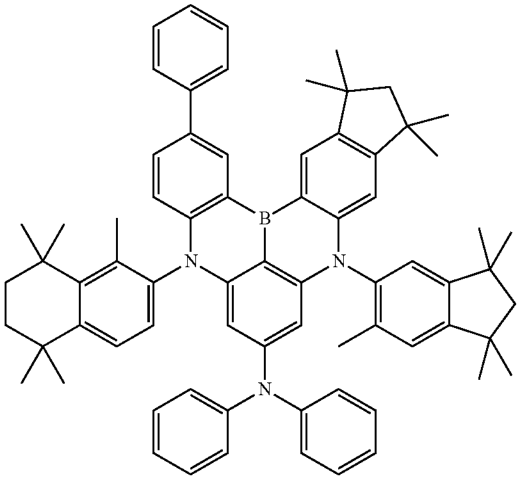
-continued
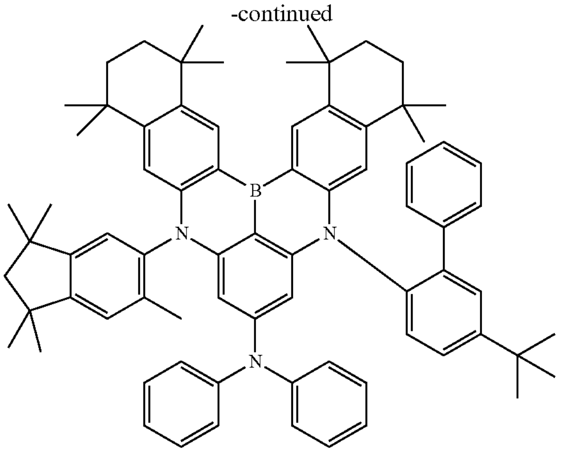
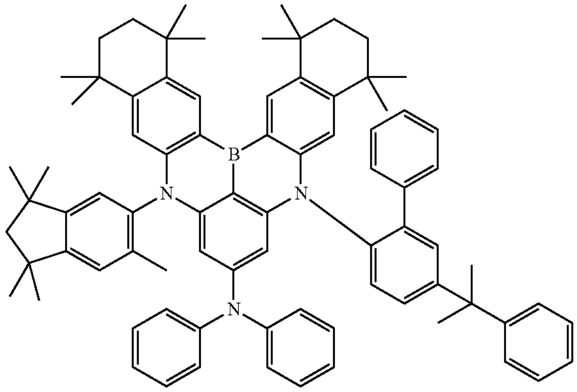
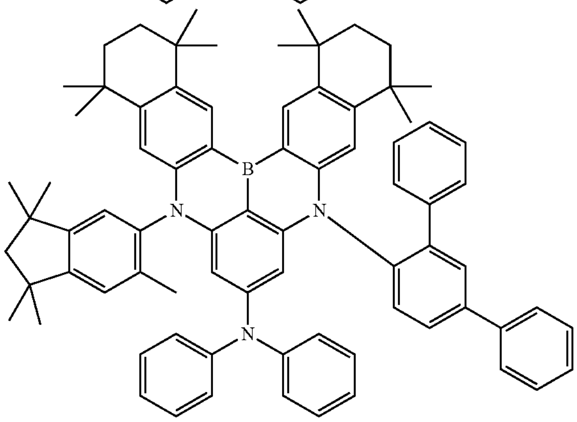
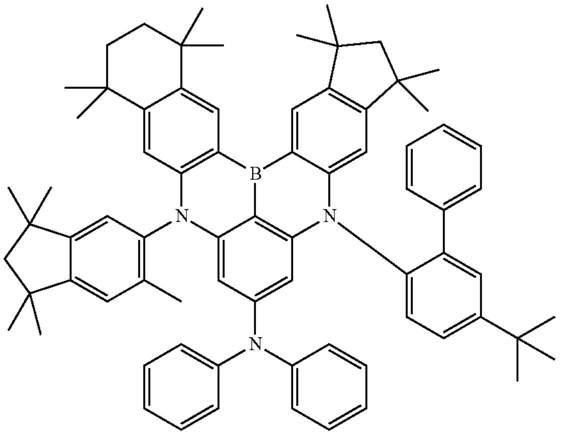

-continued
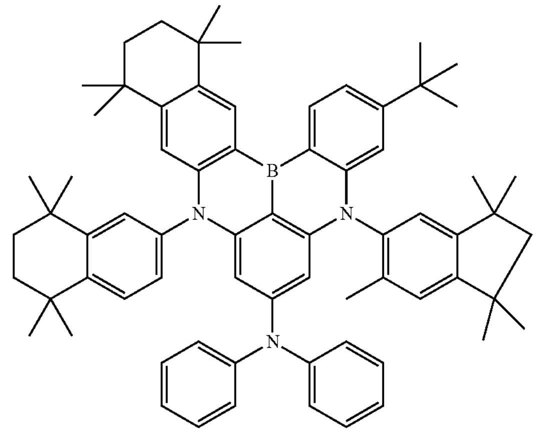
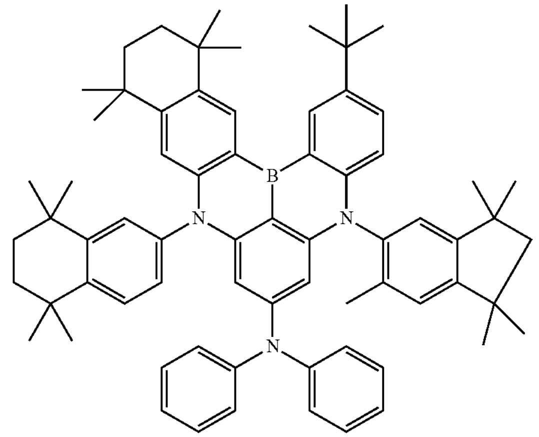
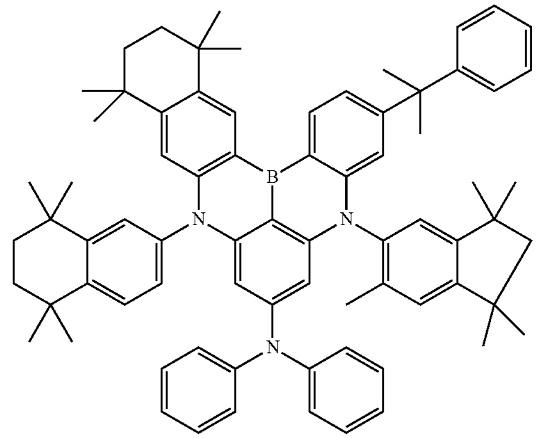
-continued
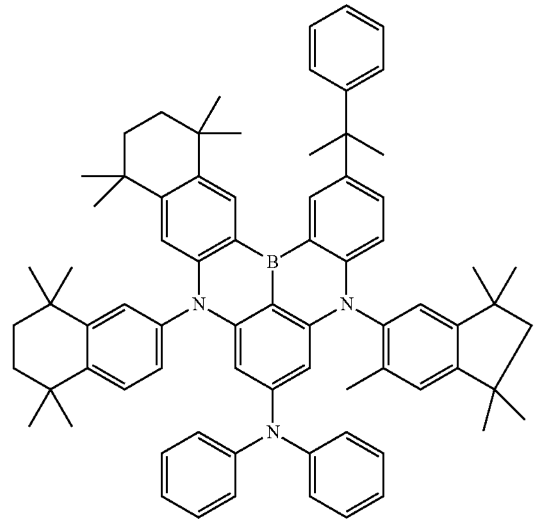
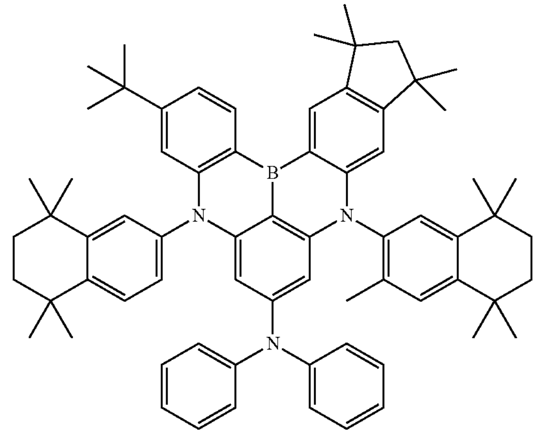
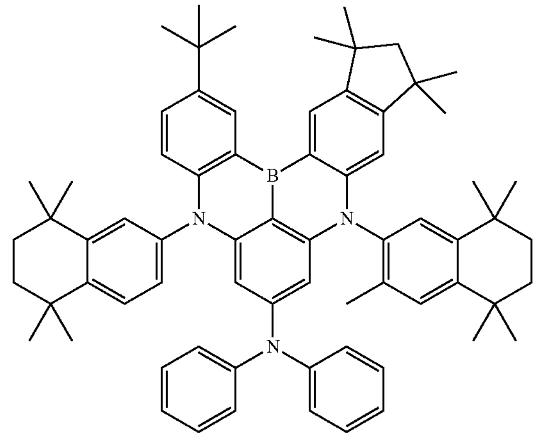

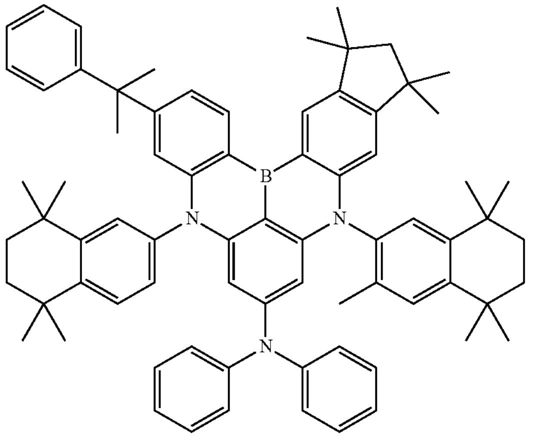
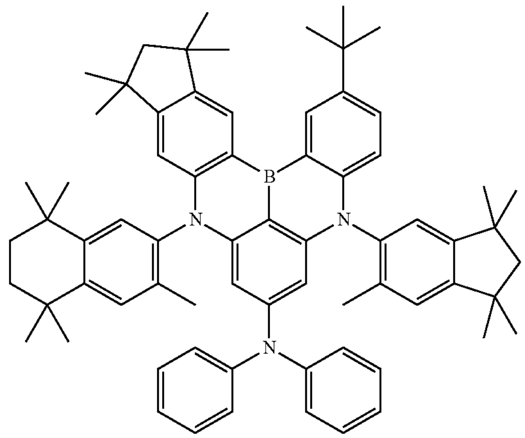
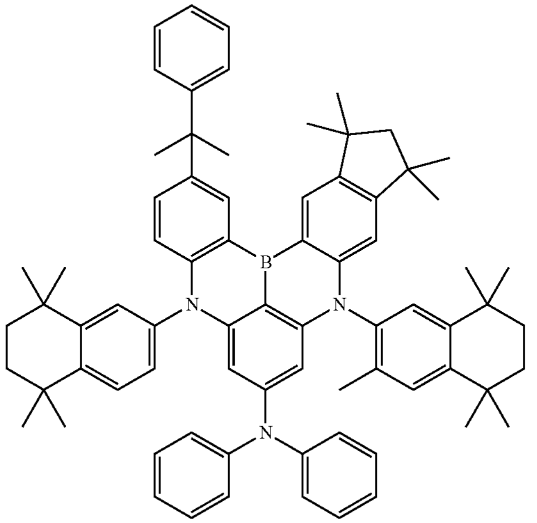
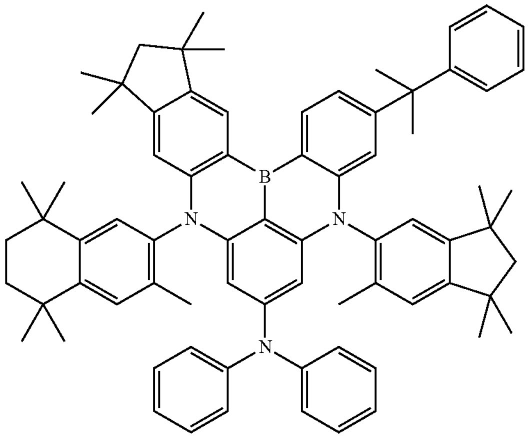
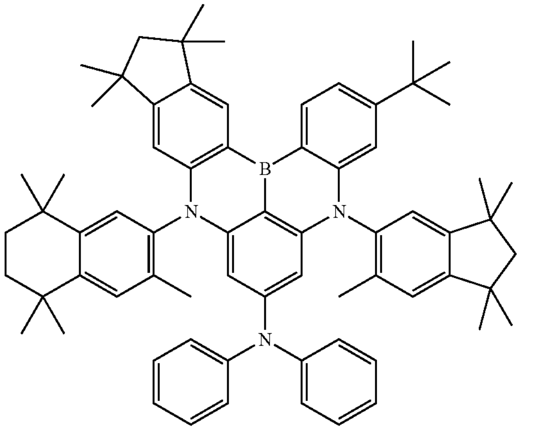
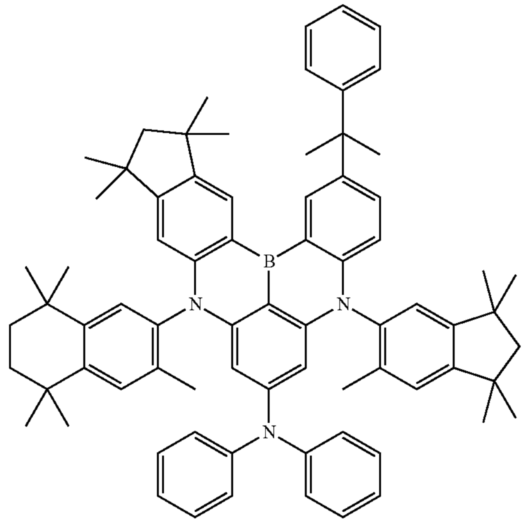

-continued
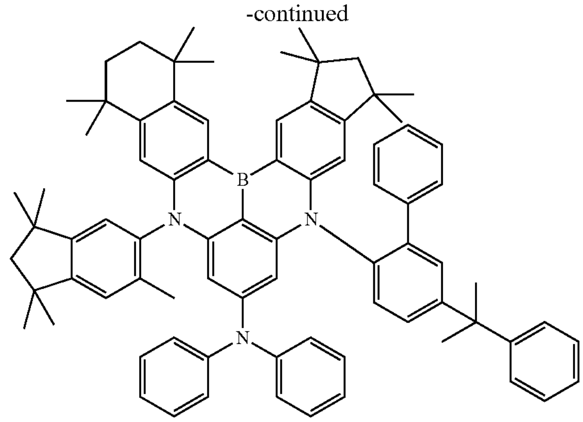
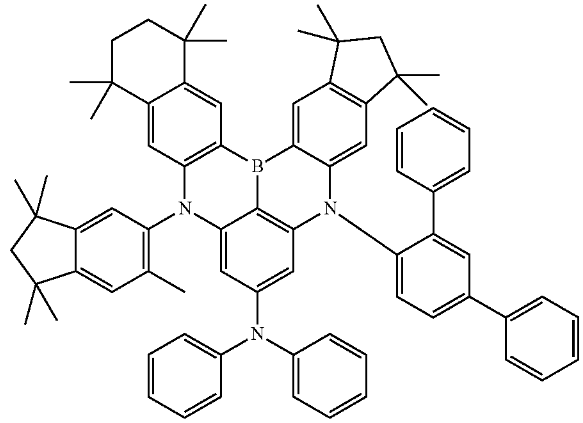
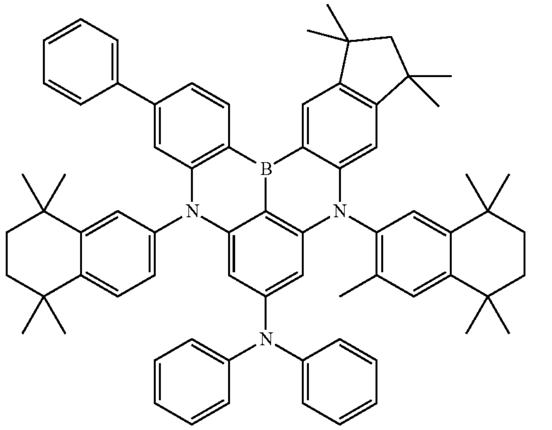
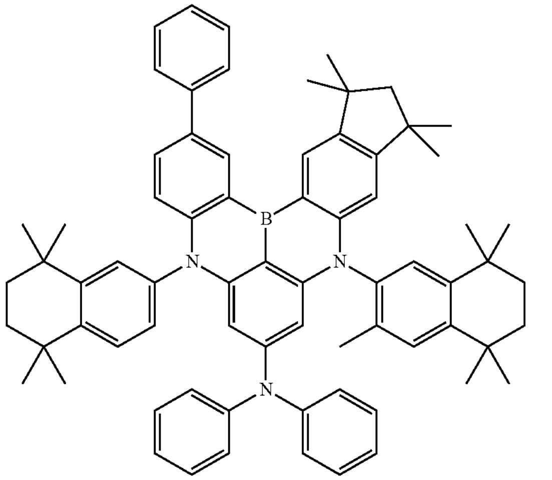
-continued
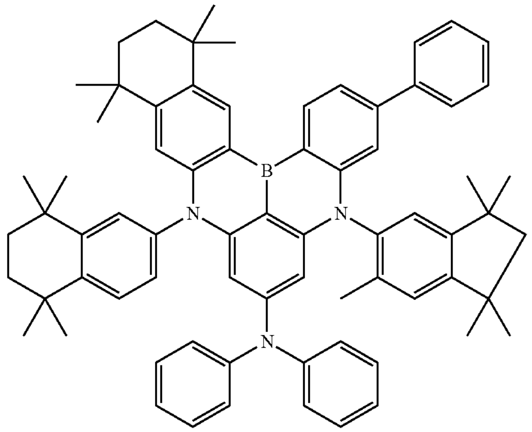
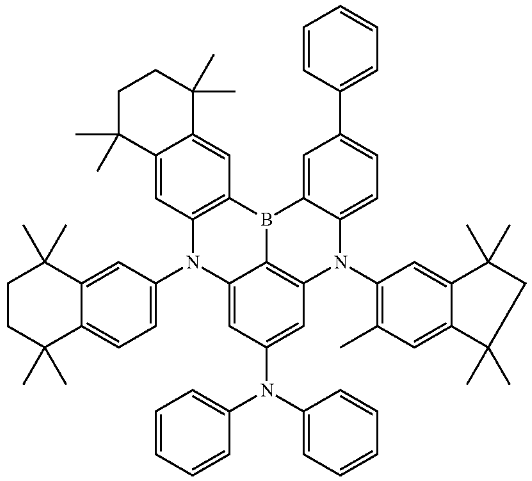
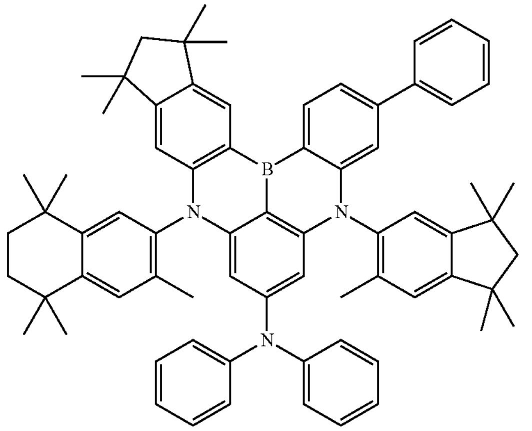

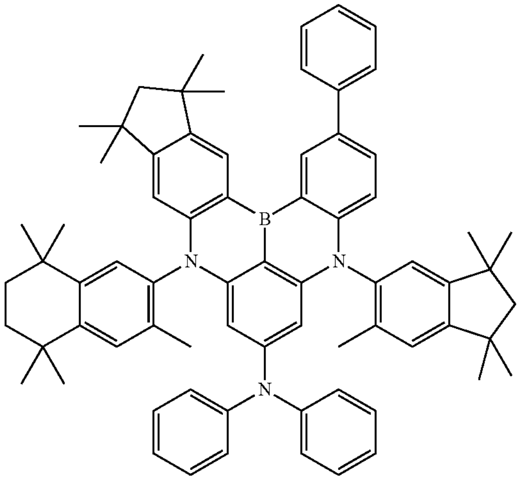
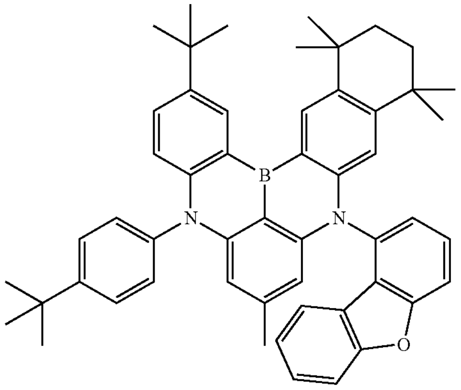
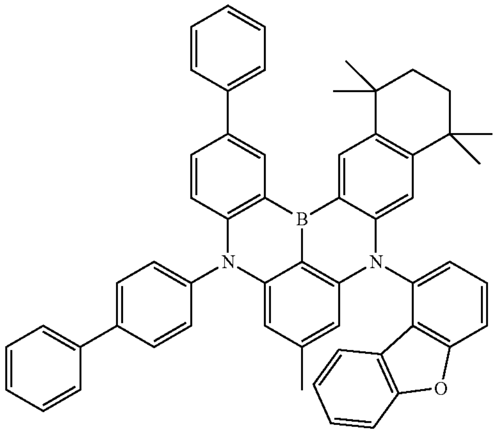
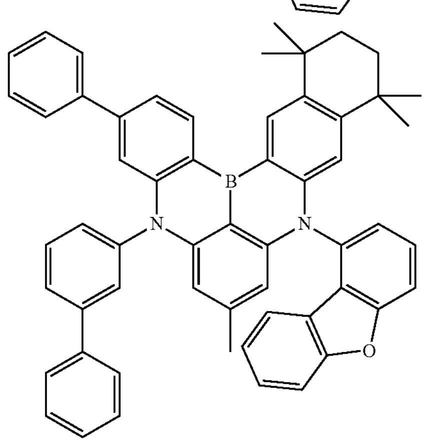
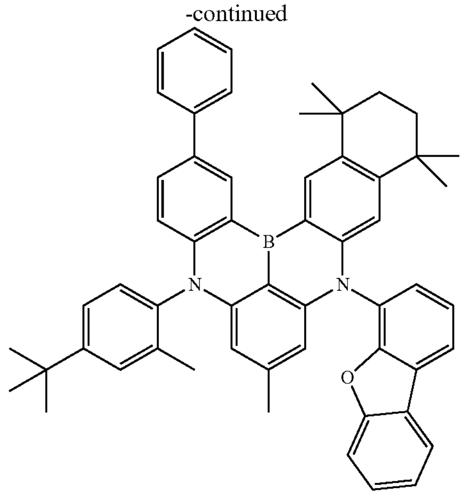
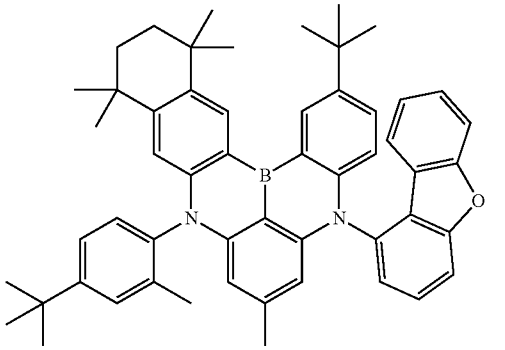
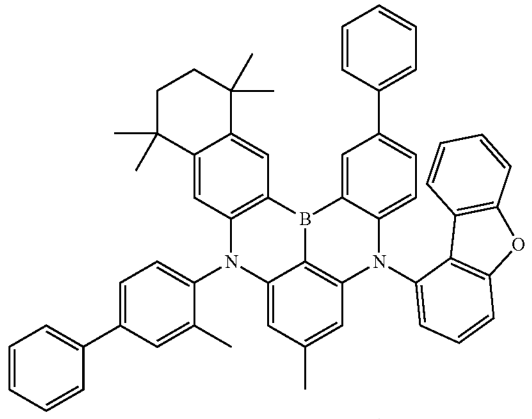
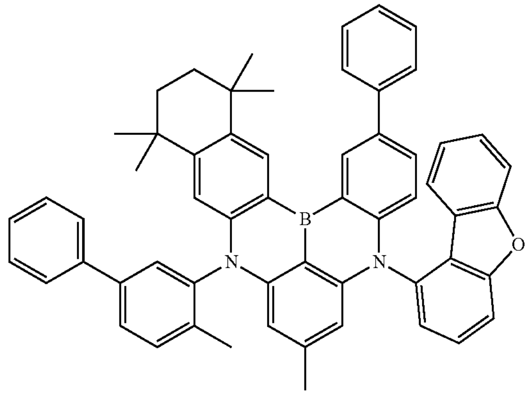

-continued
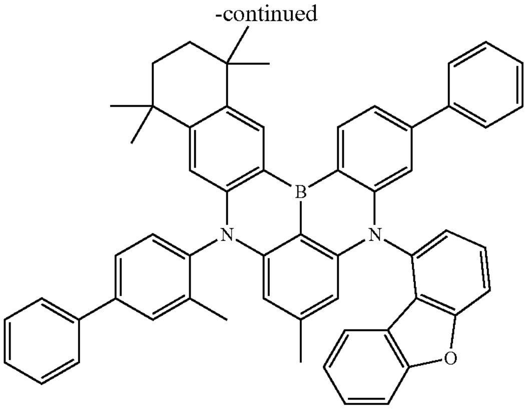
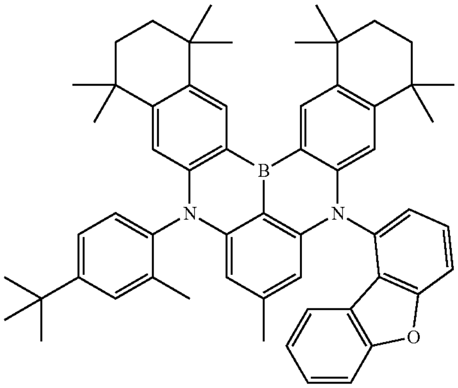
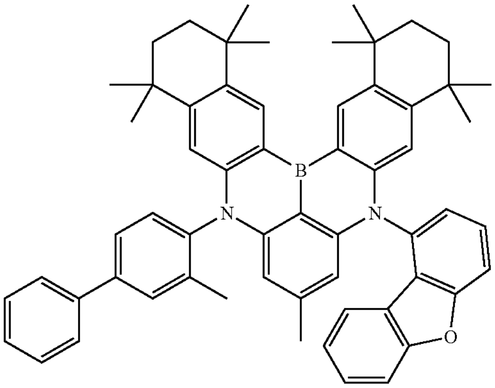
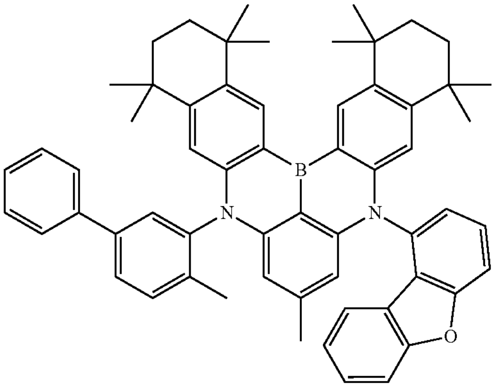
-continued
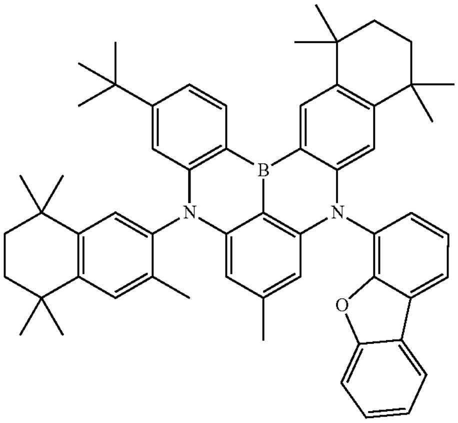
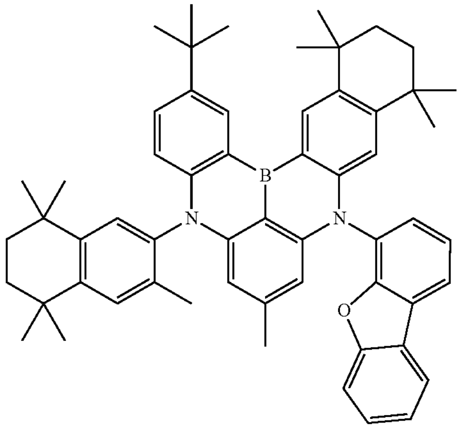
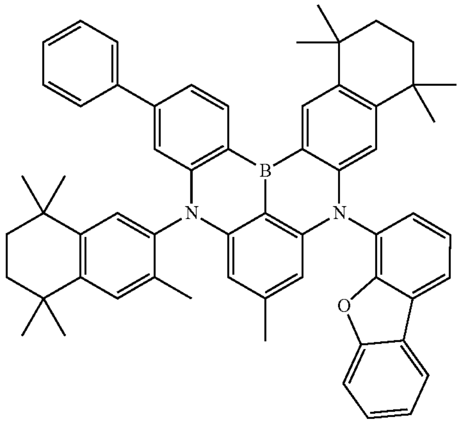

-continued
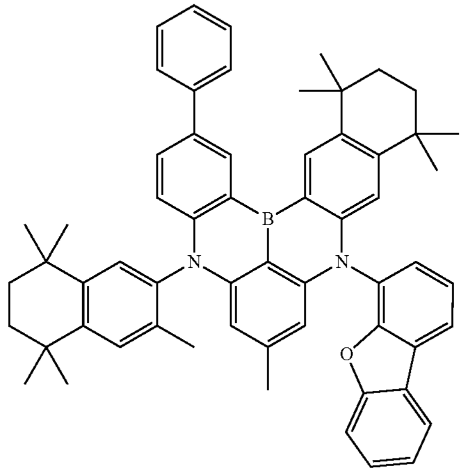
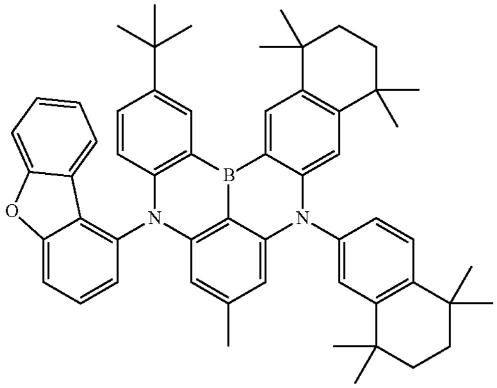
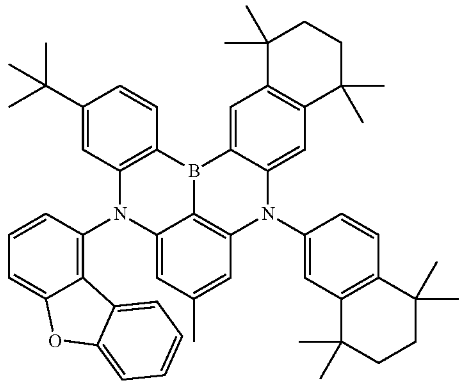
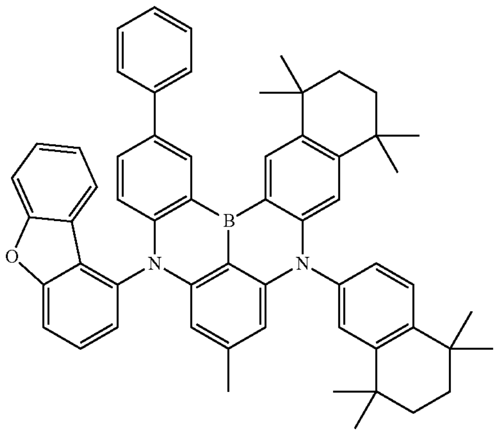
-continued
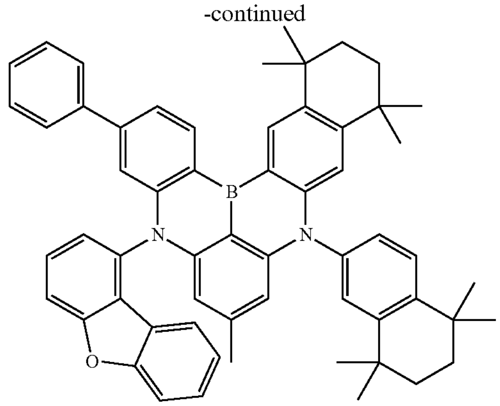
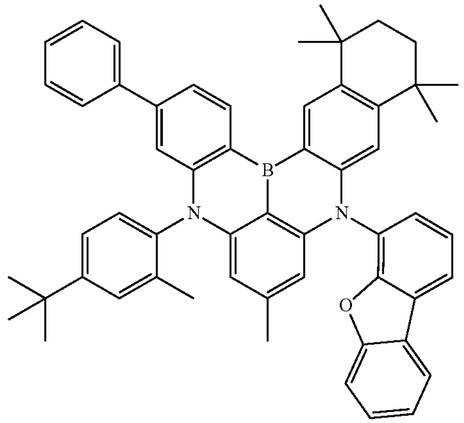
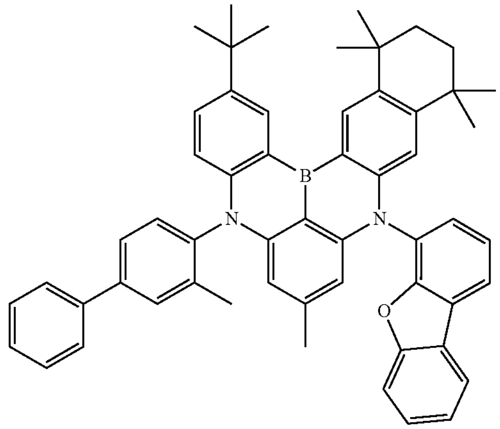
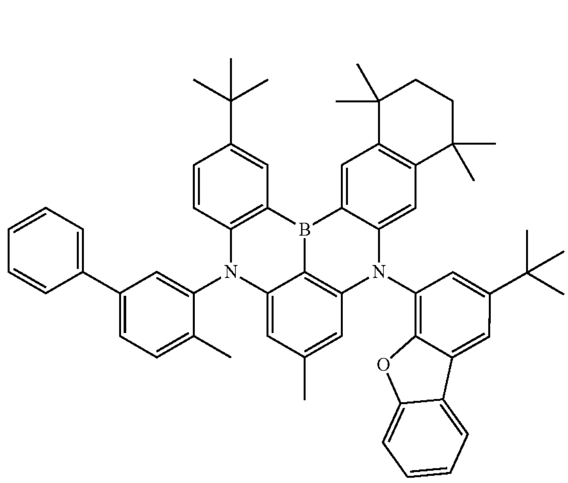

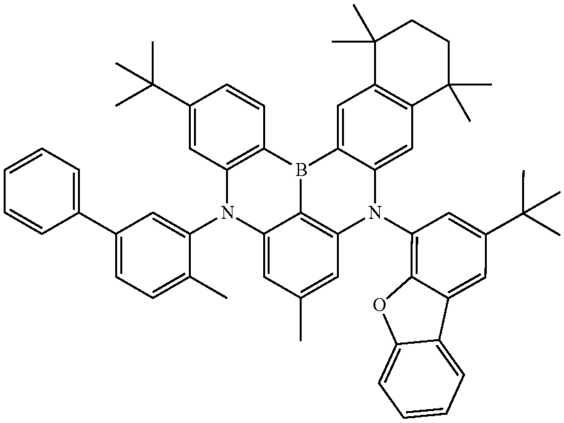
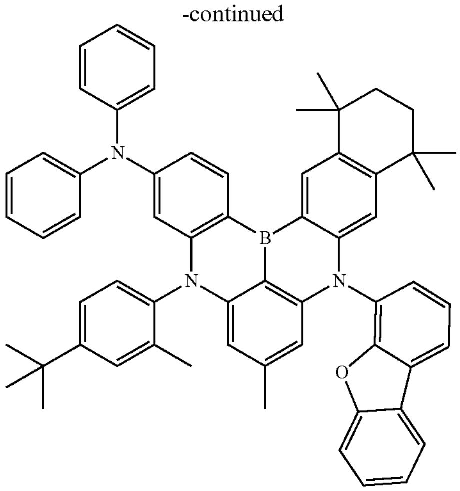
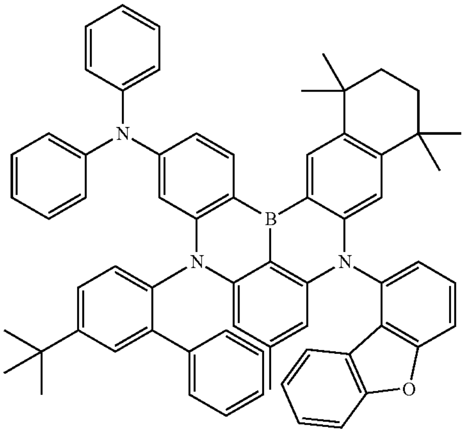
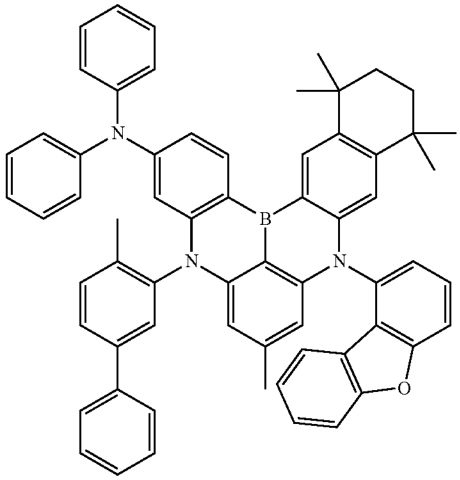
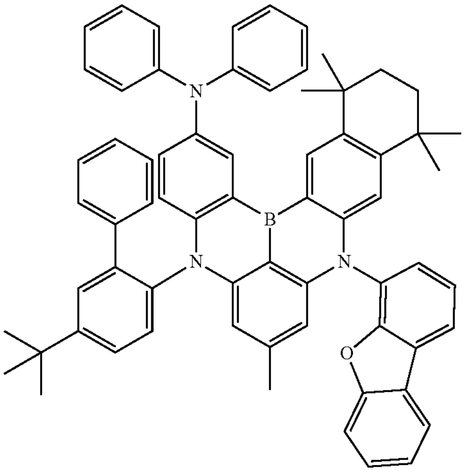
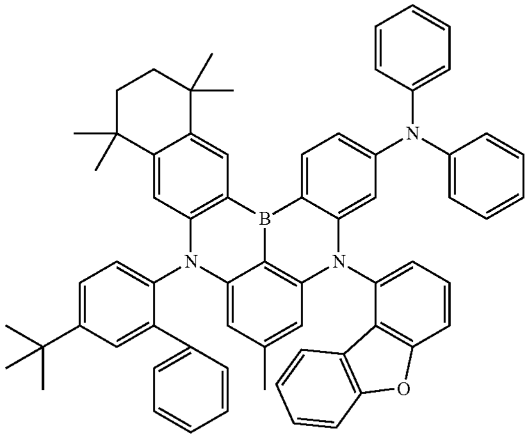

-continued
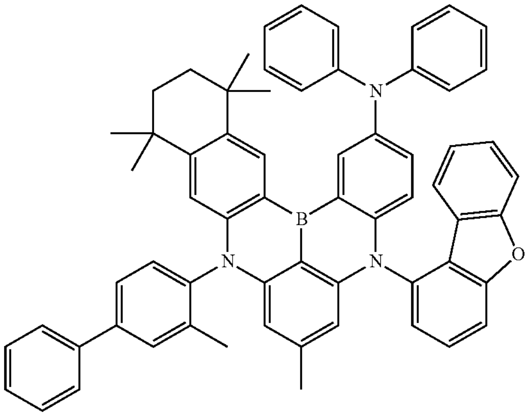
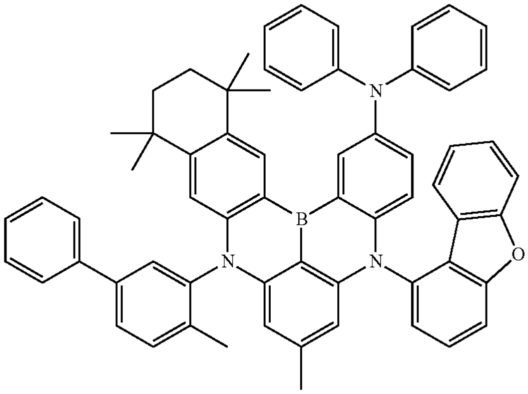
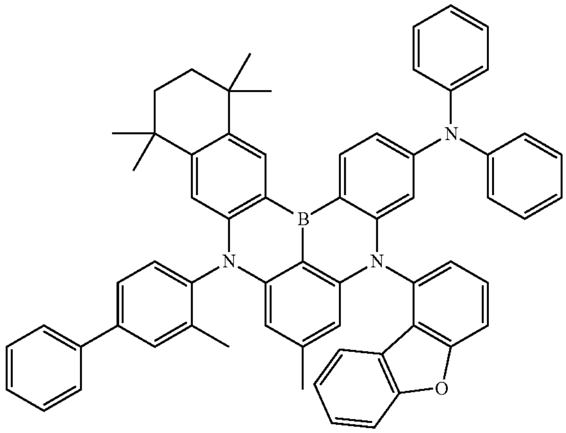
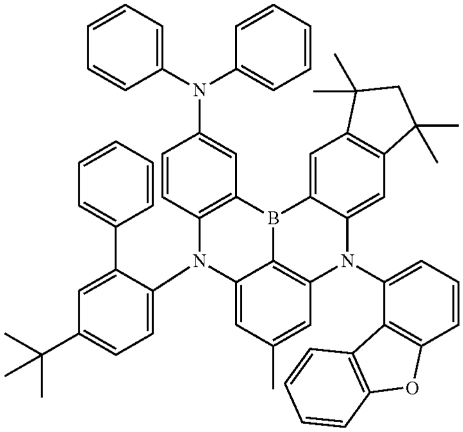
-continued
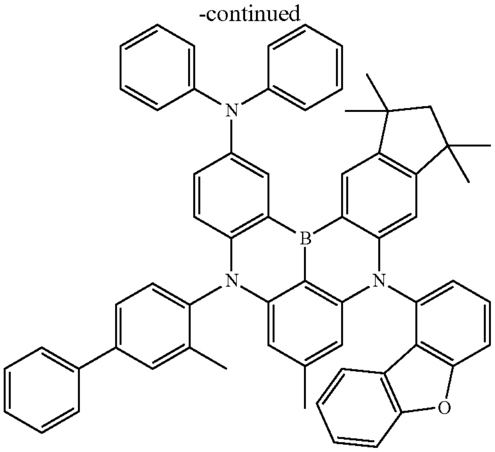
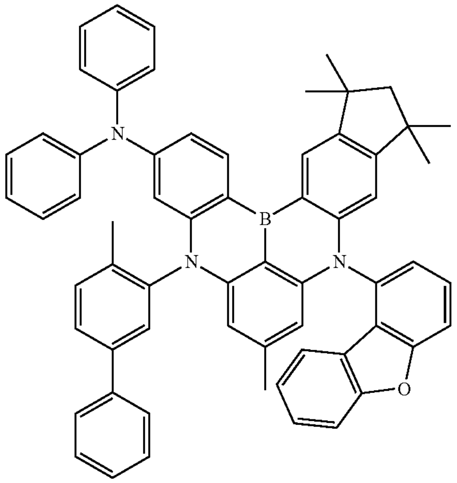
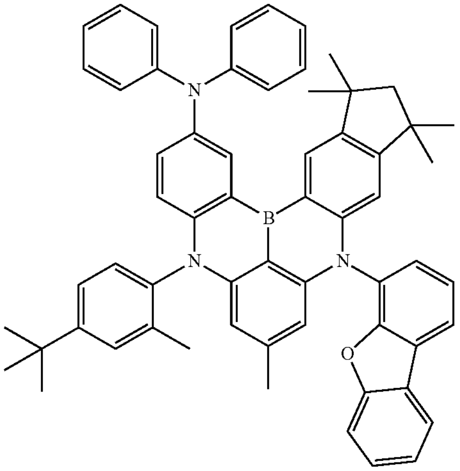

-continued
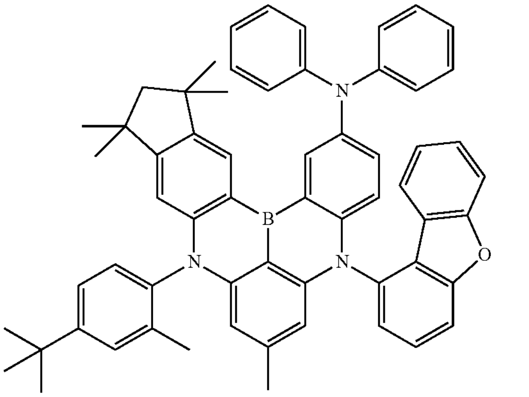
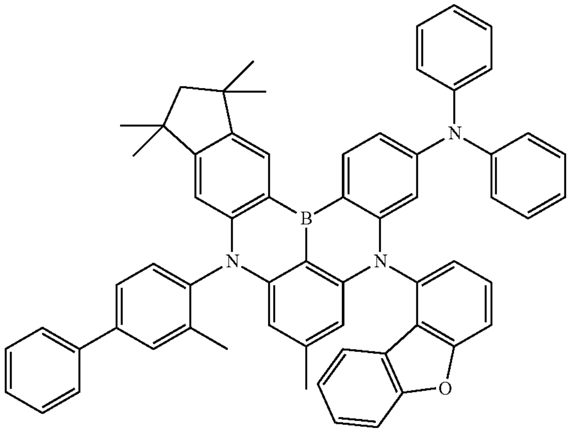
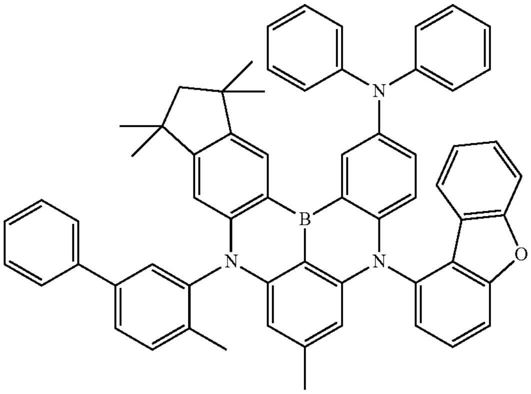
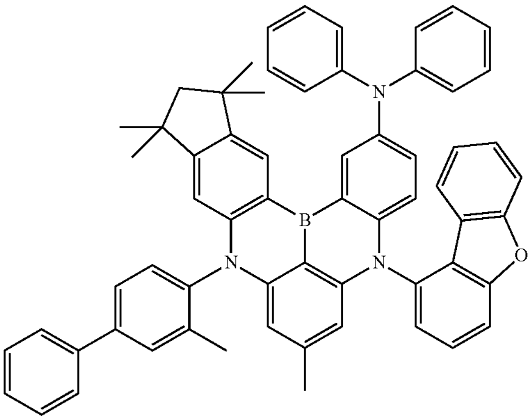
-continued
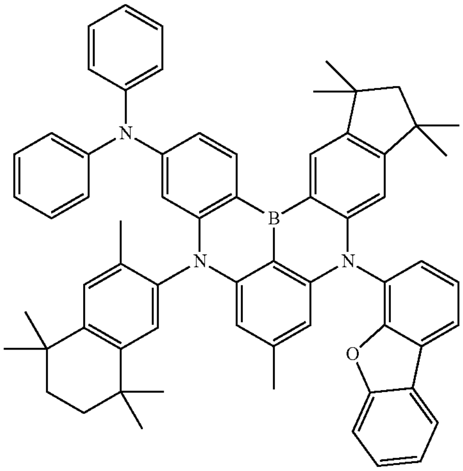
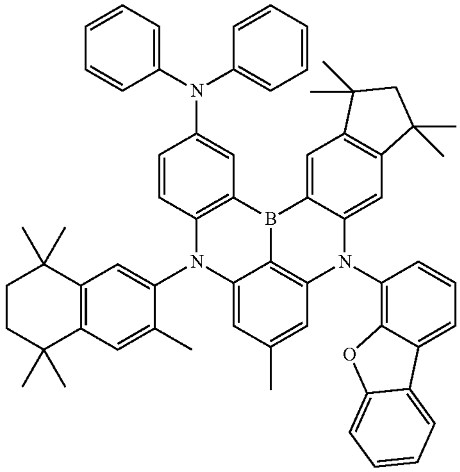
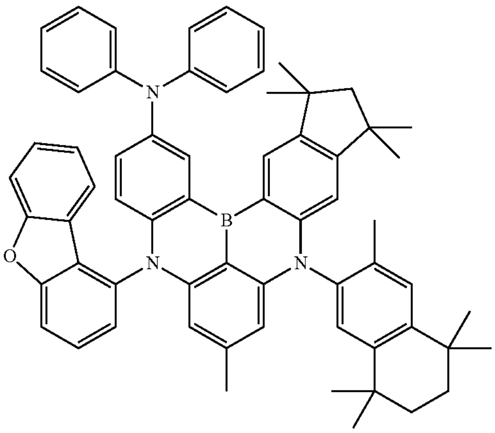

-continued
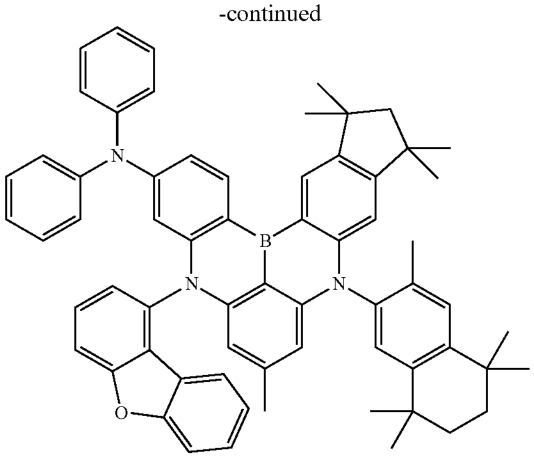
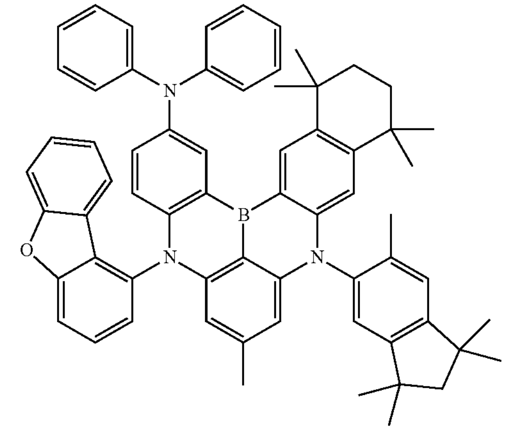
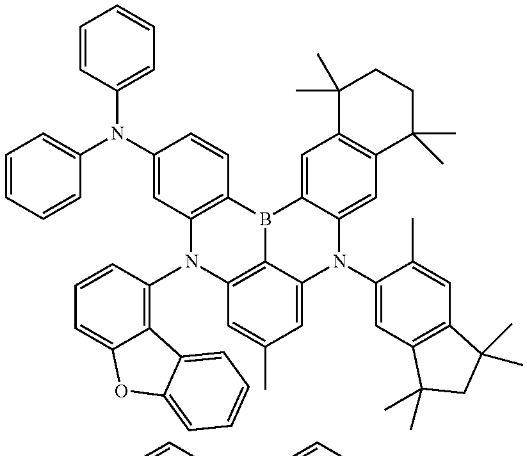
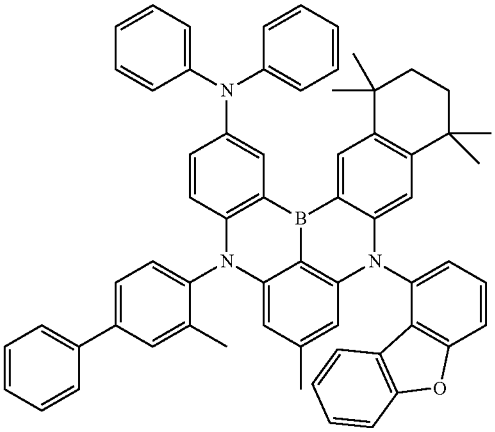
-continued
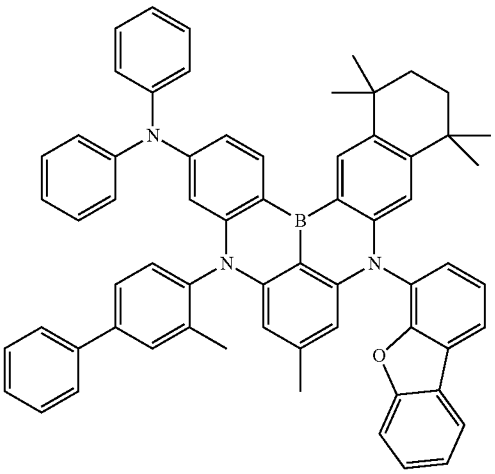
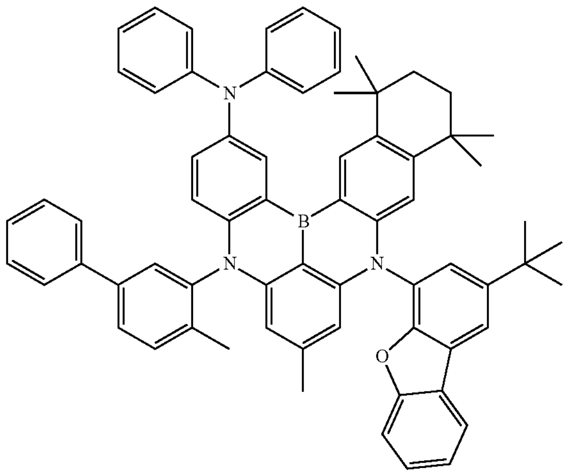
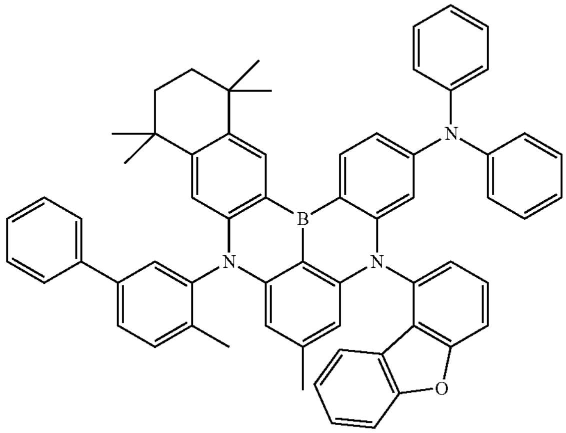

-continued
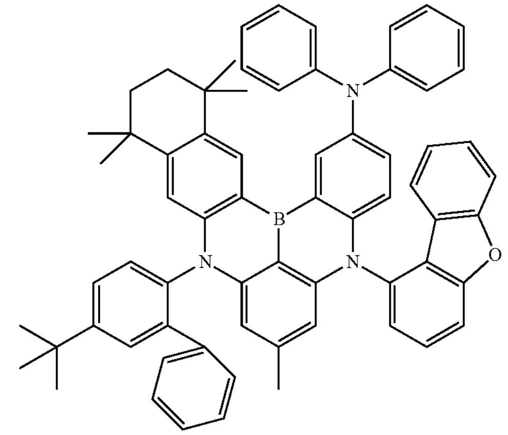
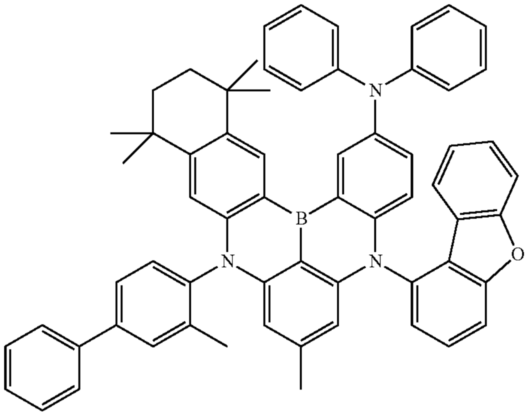
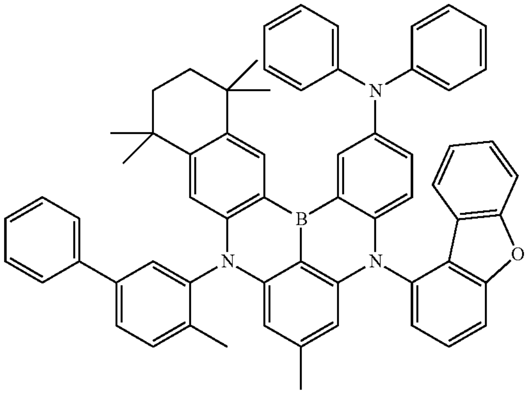
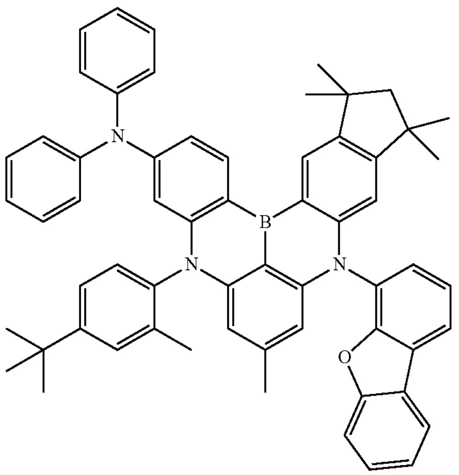
-continued
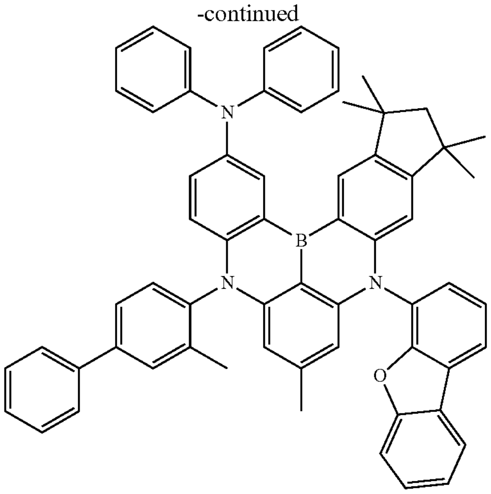
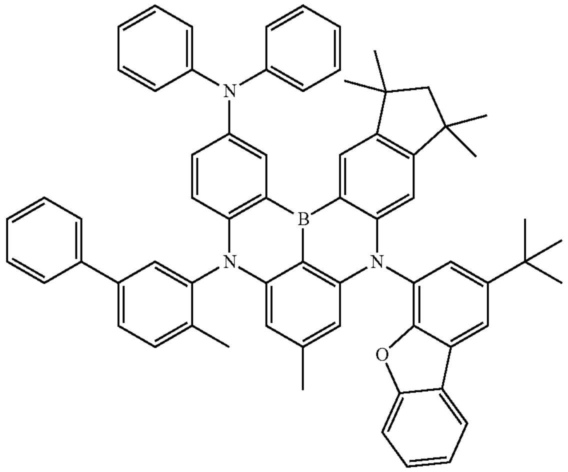
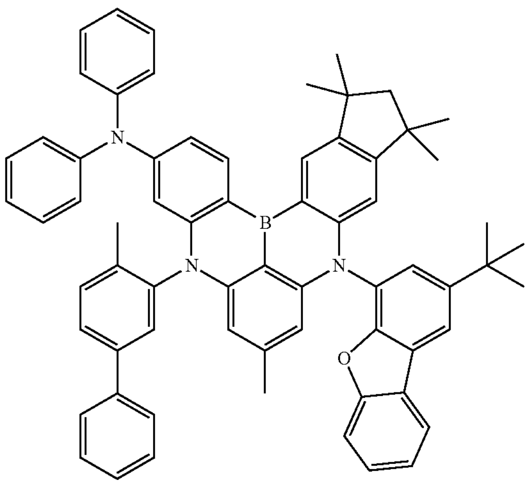

-continued
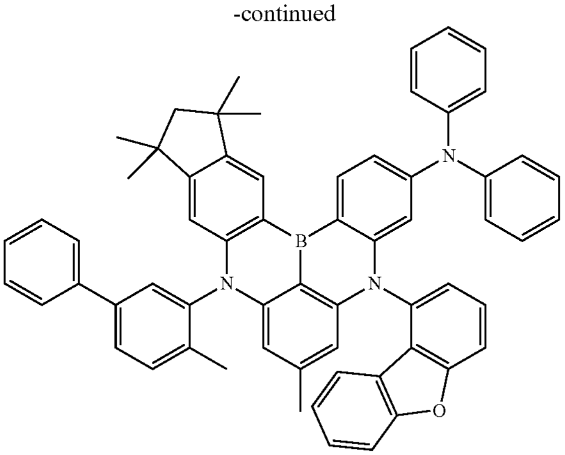
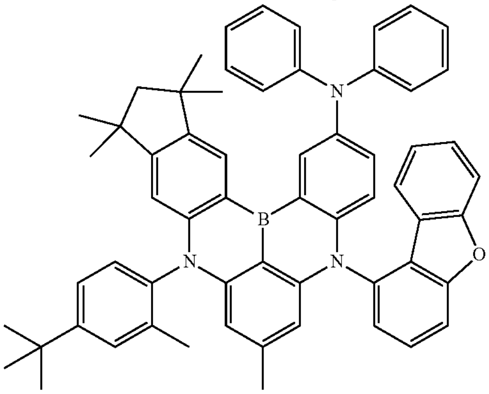
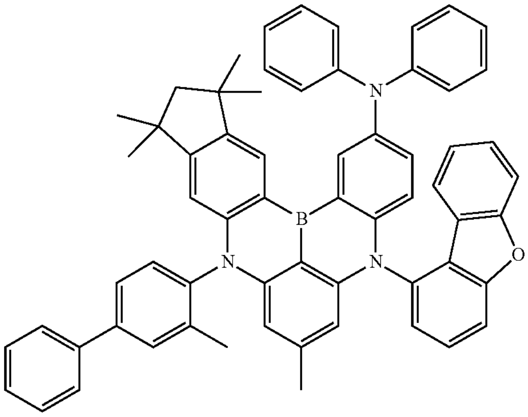
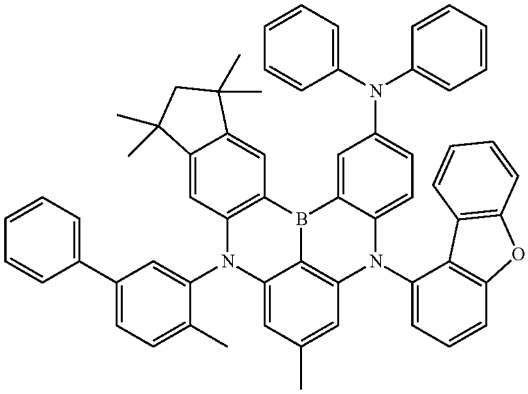
-continued
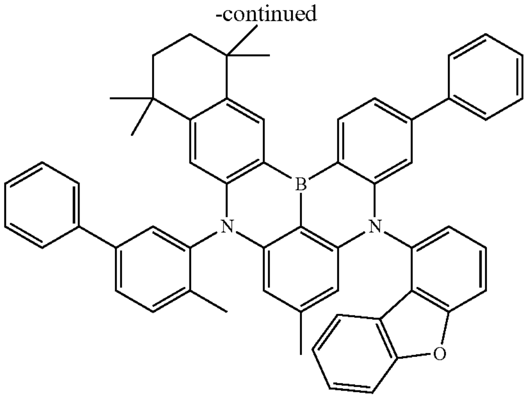
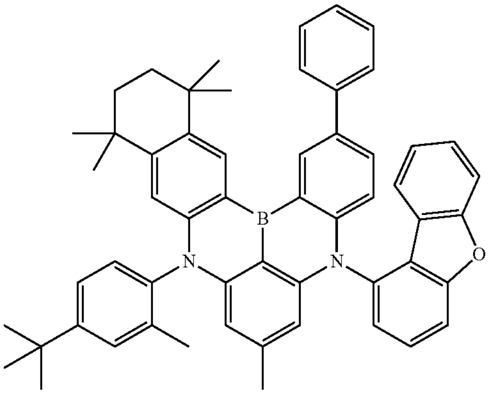
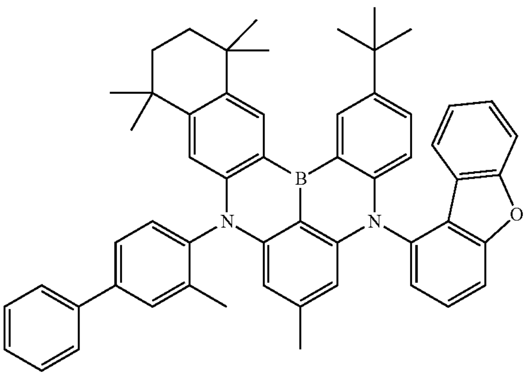
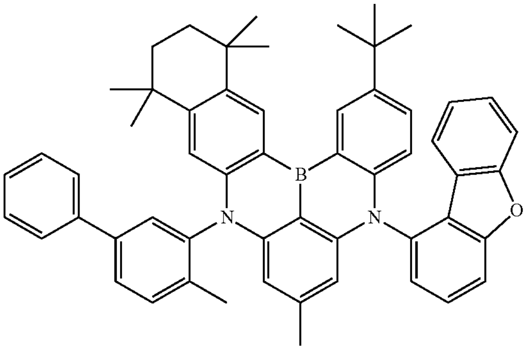

-continued
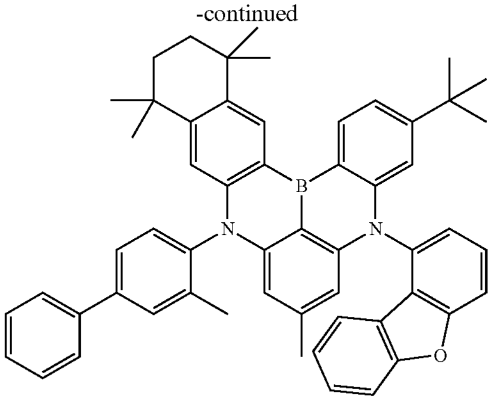
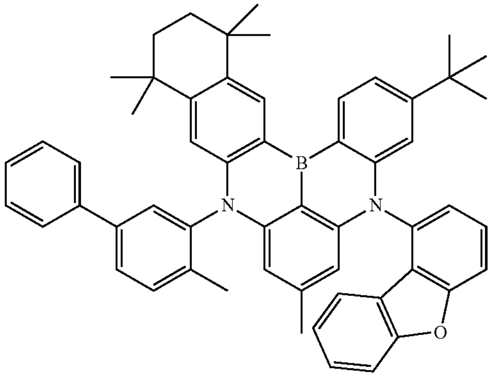
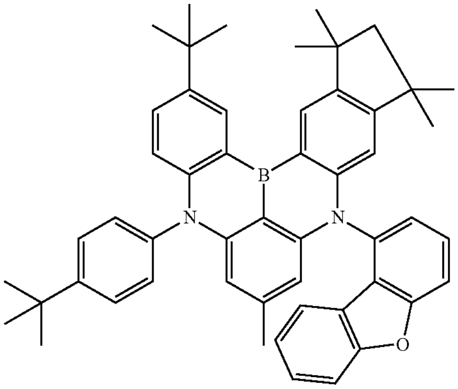
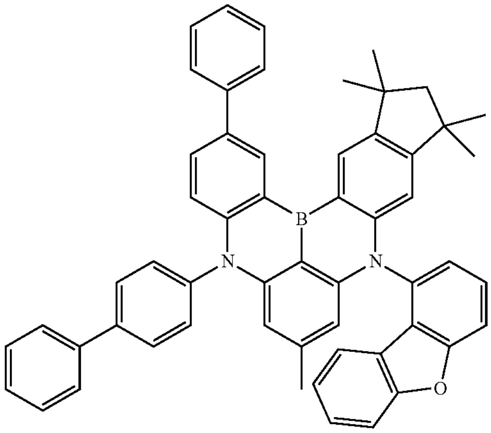
-continued
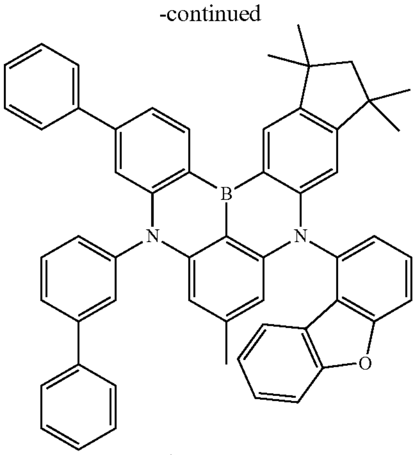
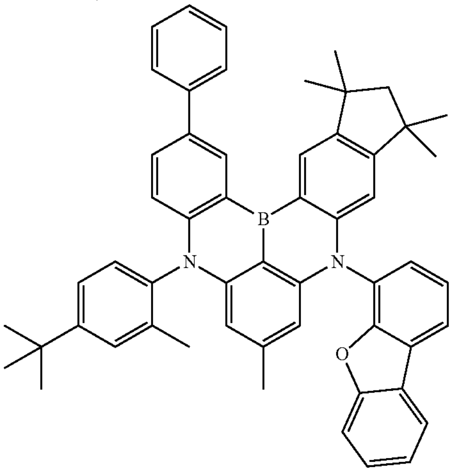
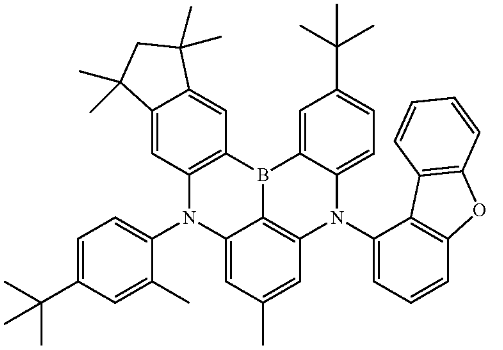
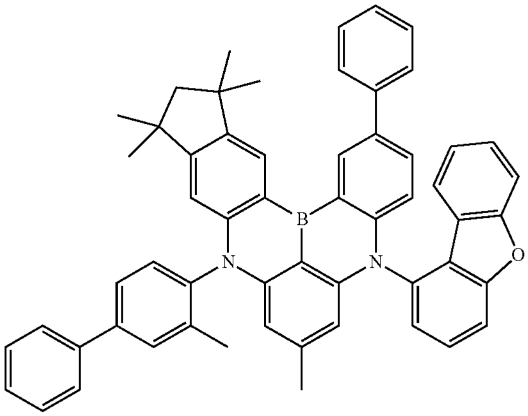

-continued
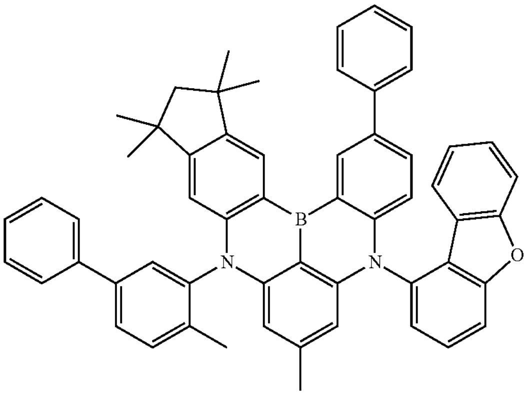
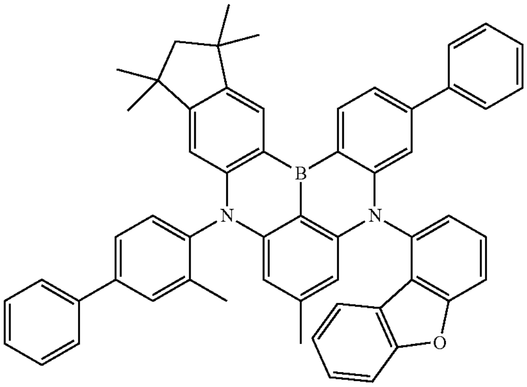
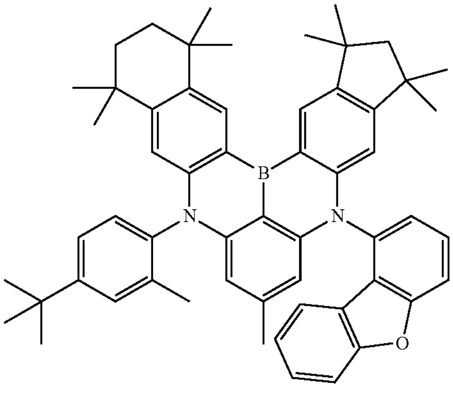
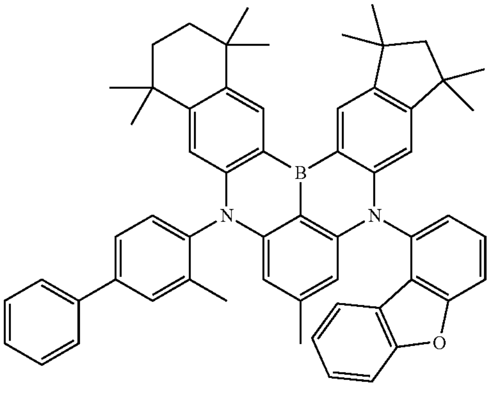
-continued
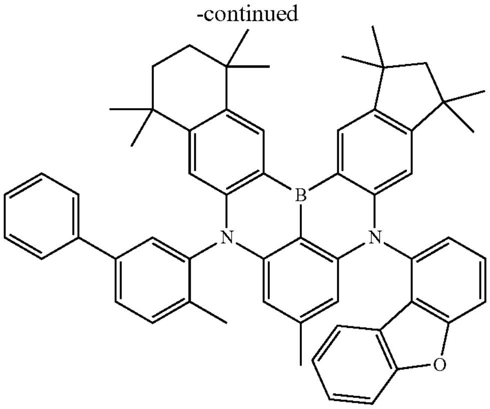
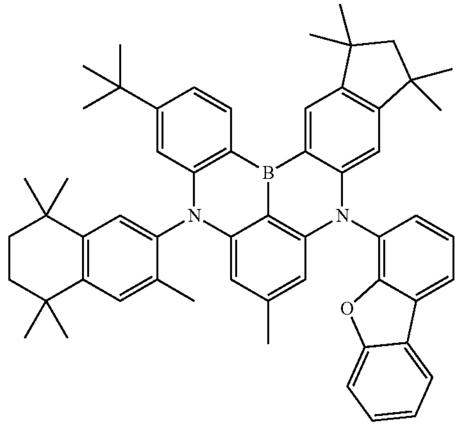
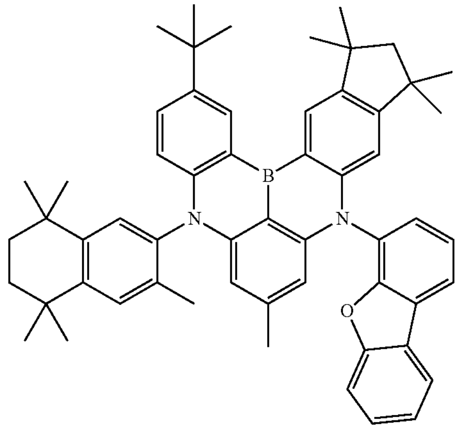
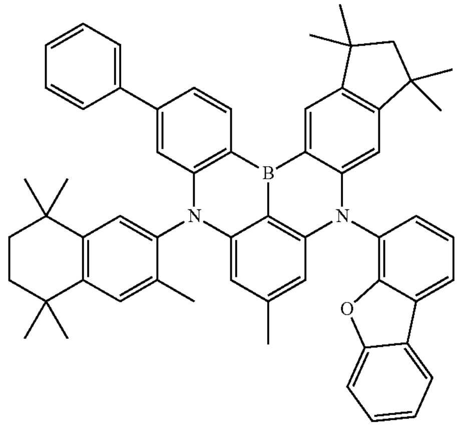

-continued
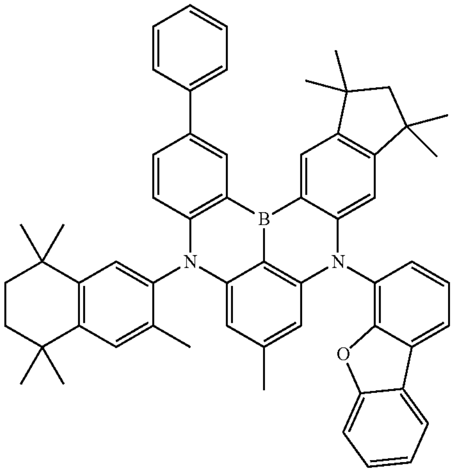
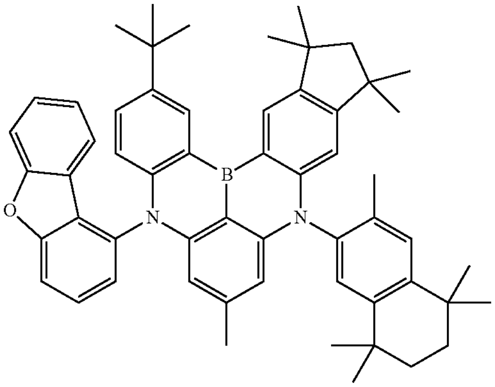
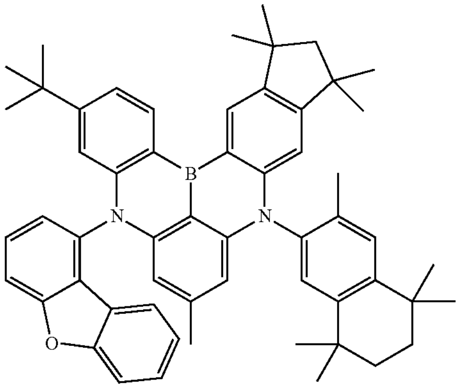
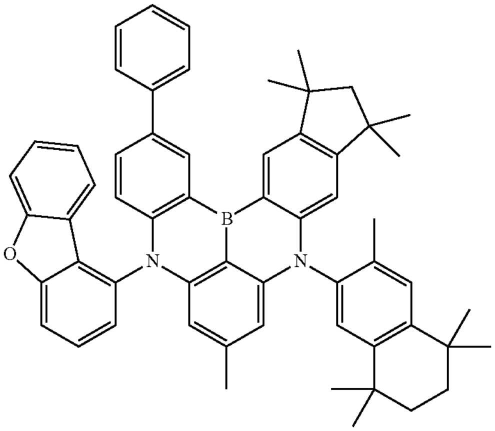
-continued
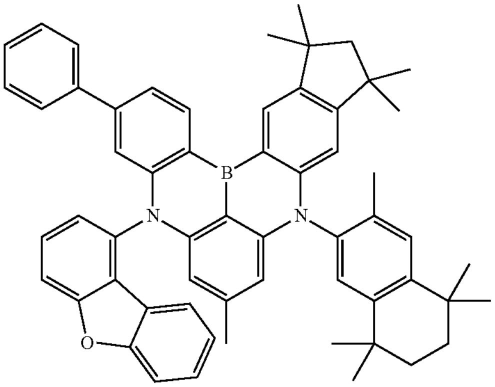
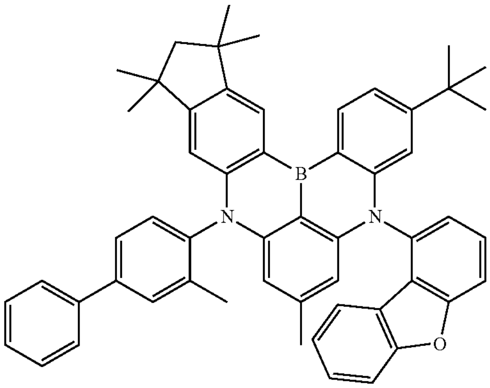
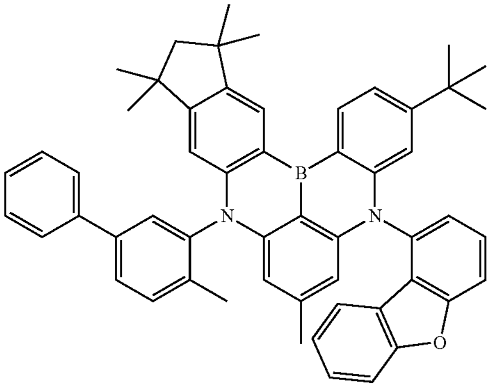
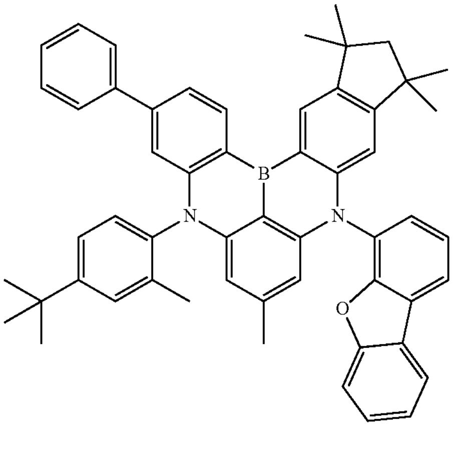

-continued
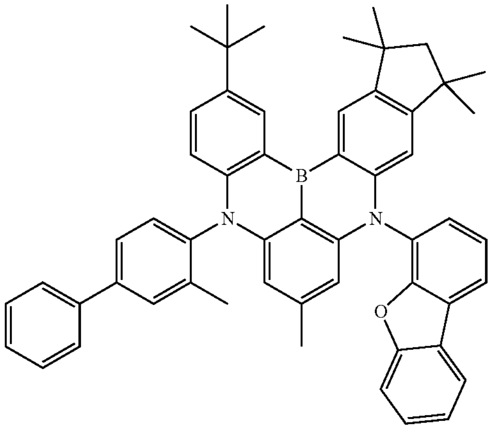
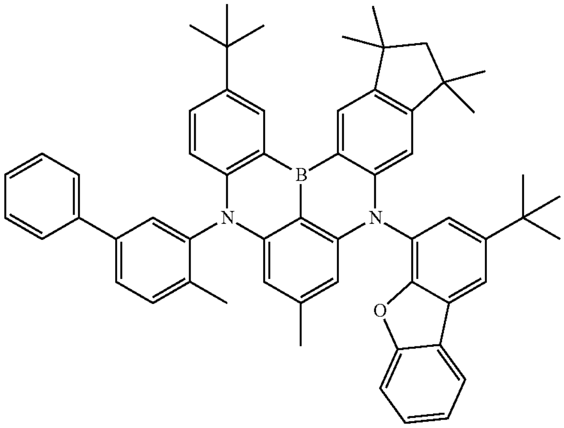
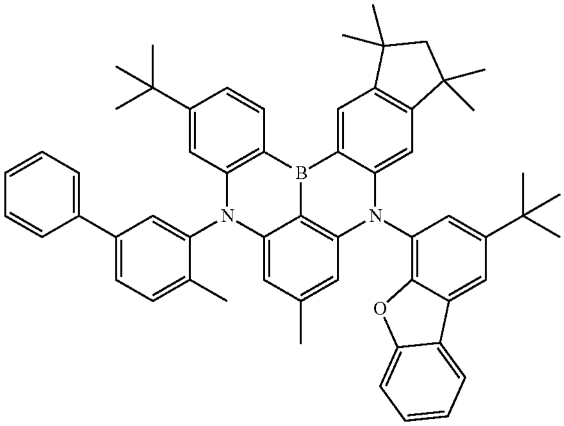
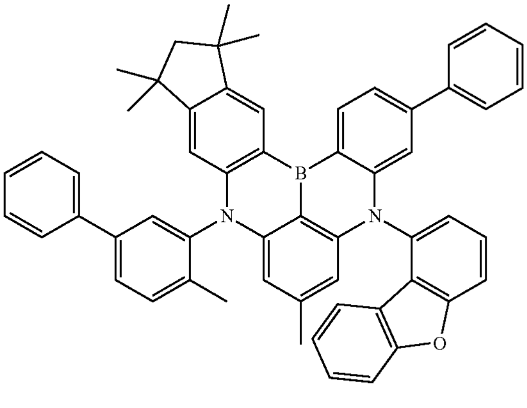
-continued
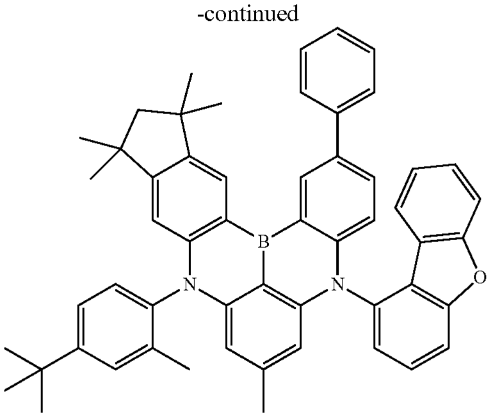
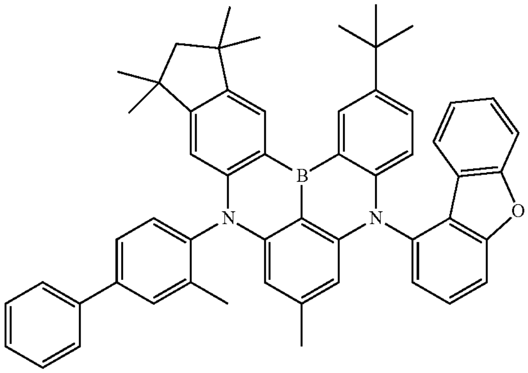
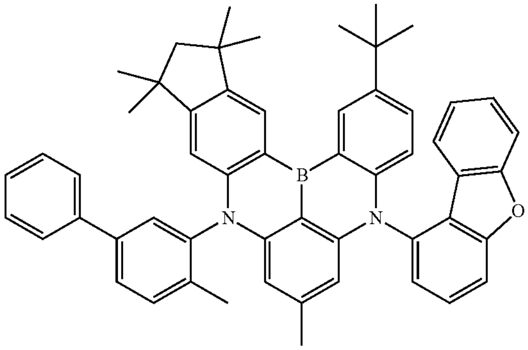
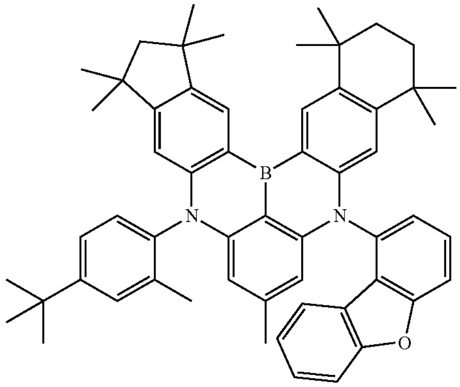

-continued
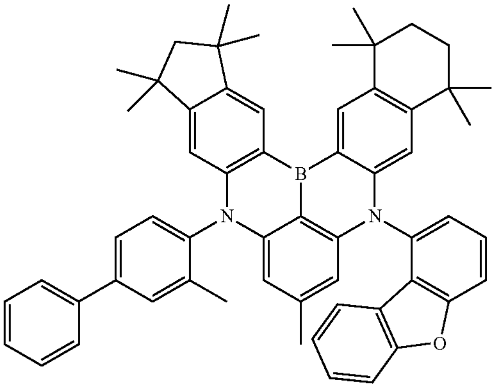
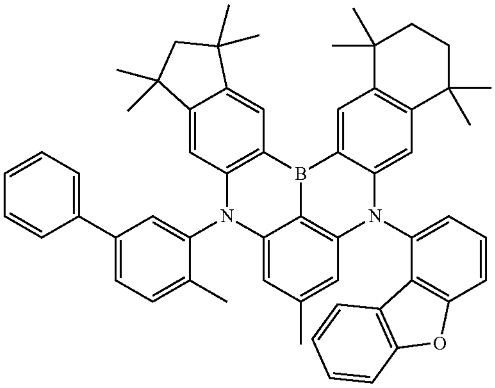
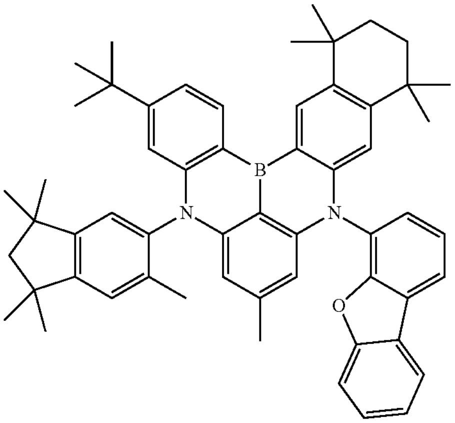
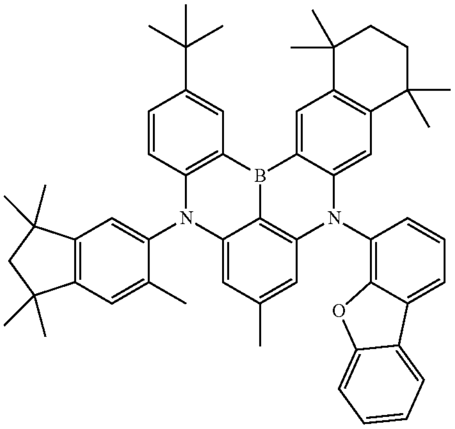
-continued
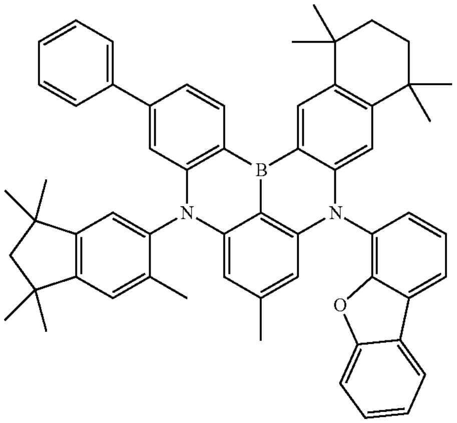
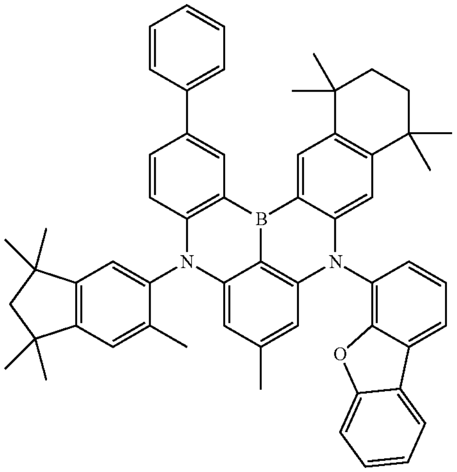
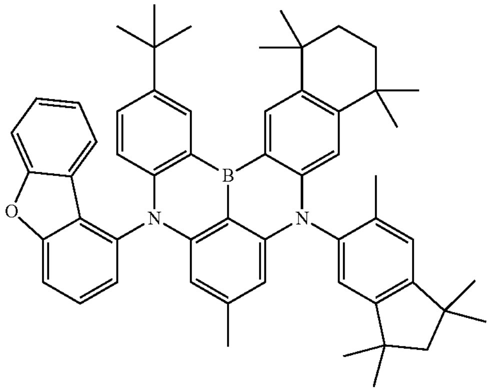
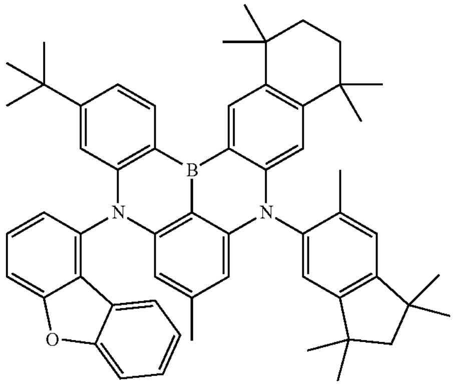

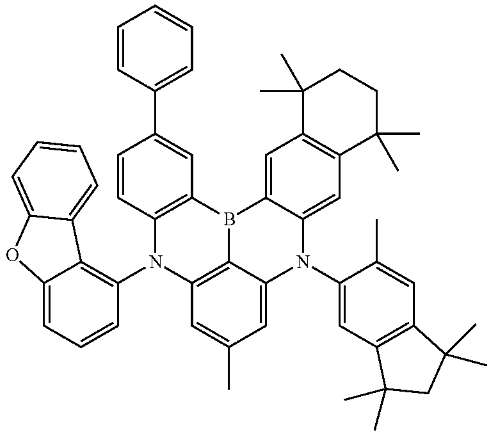
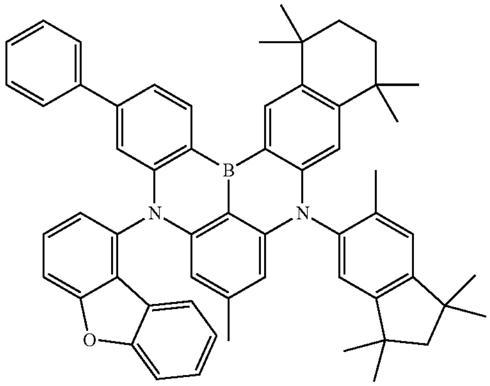
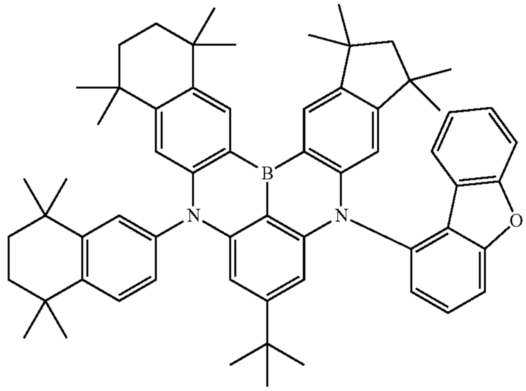
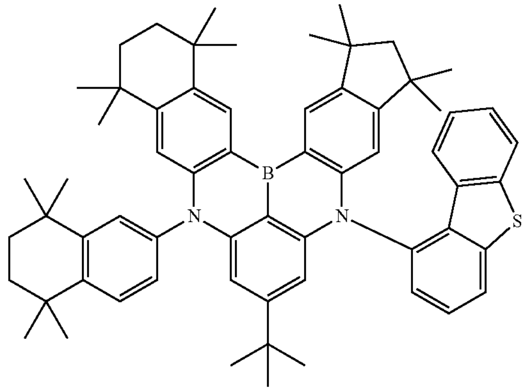
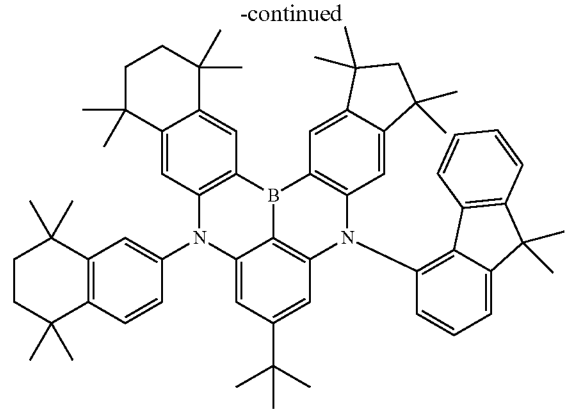
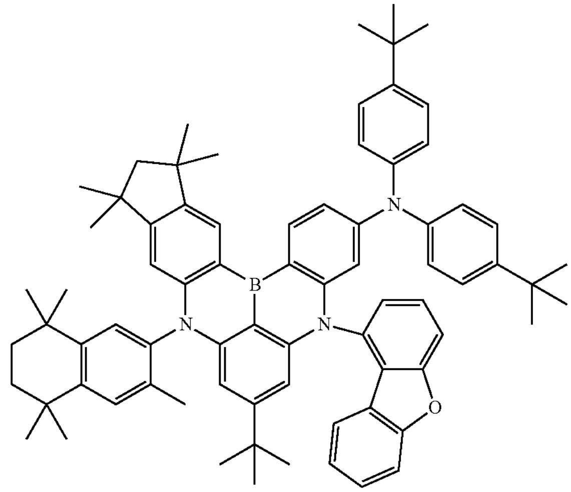
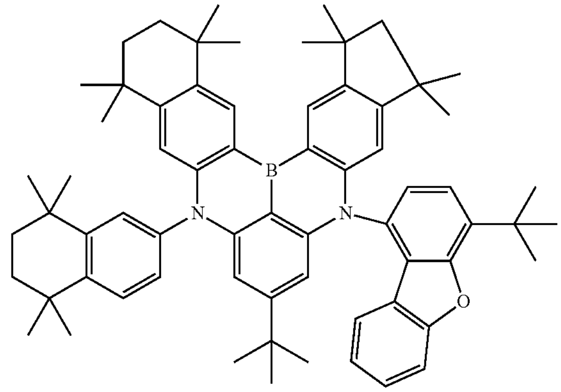
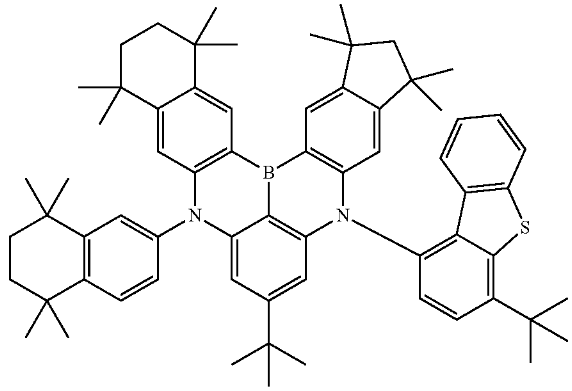

-continued
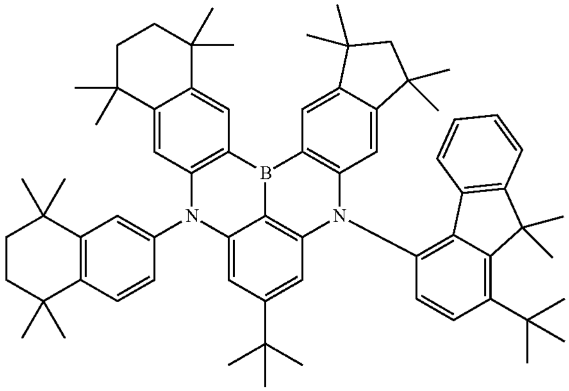
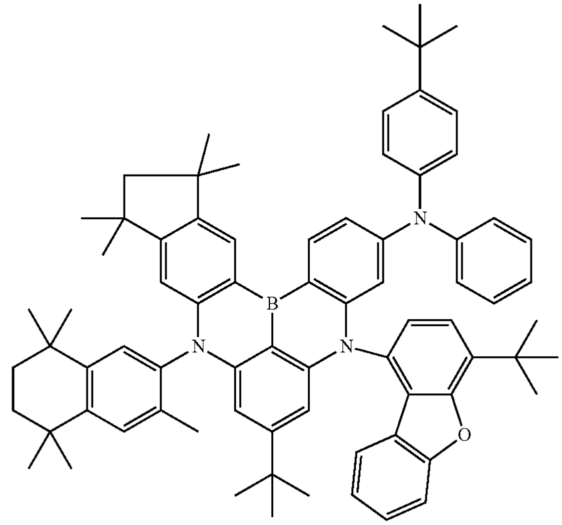
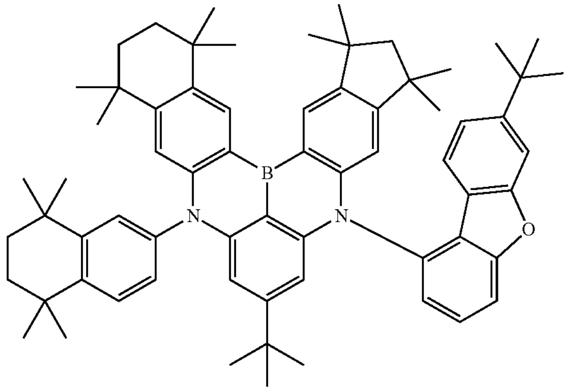
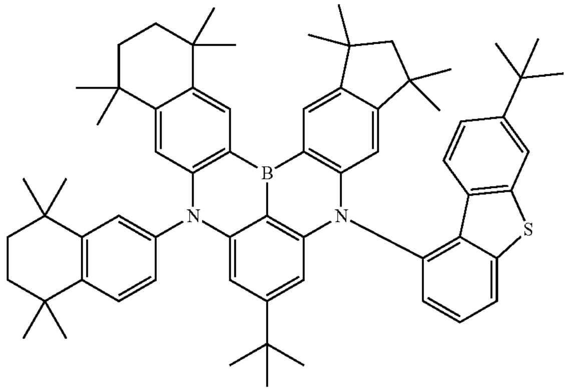
-continued
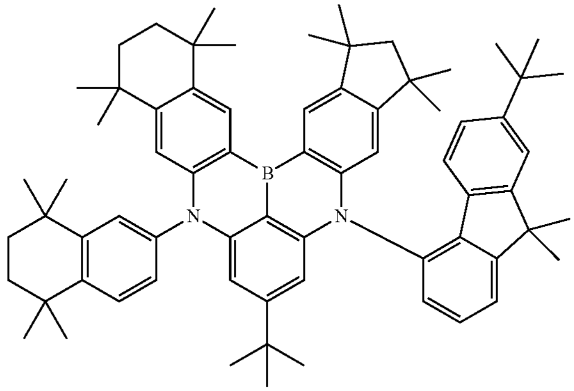
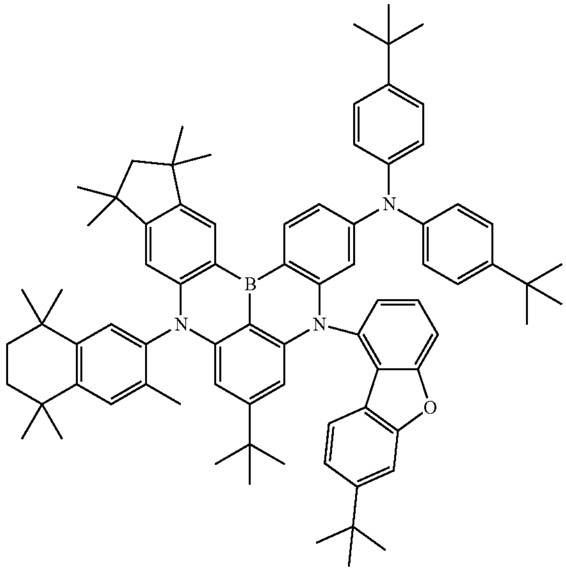
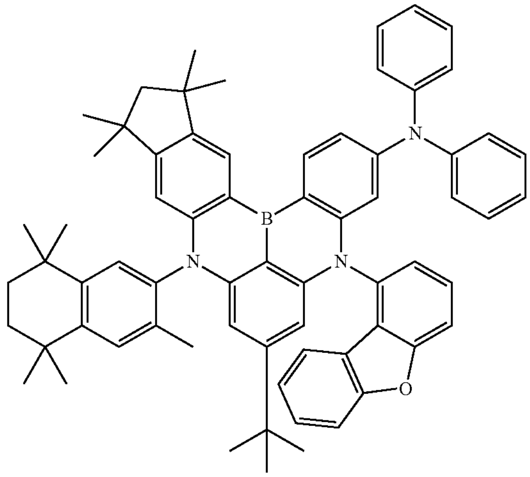

-continued
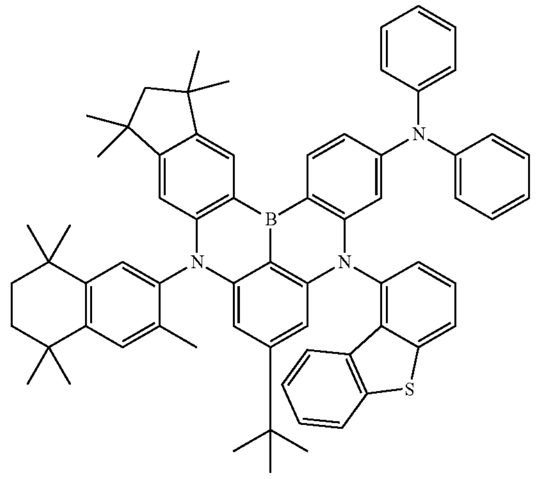
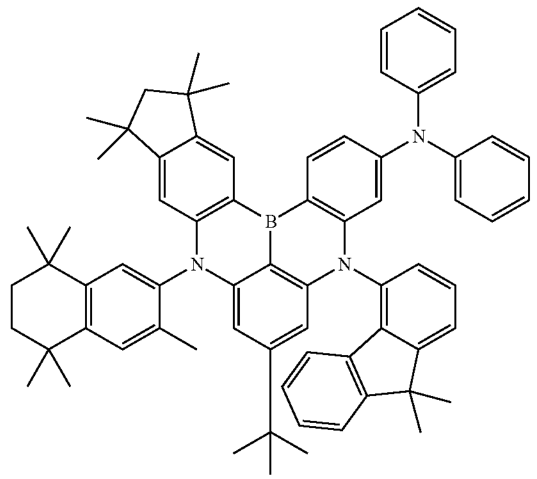
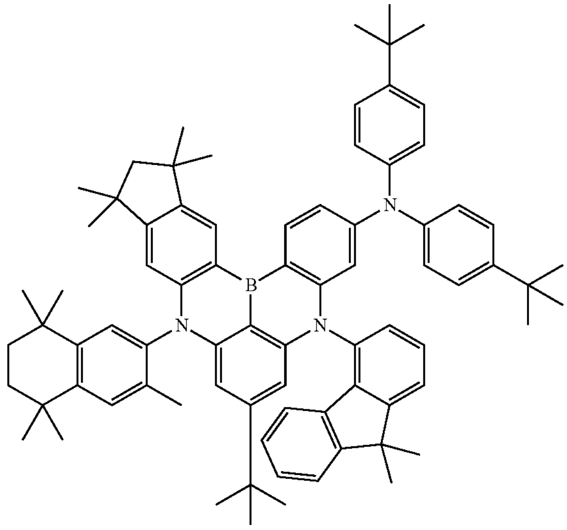
-continued
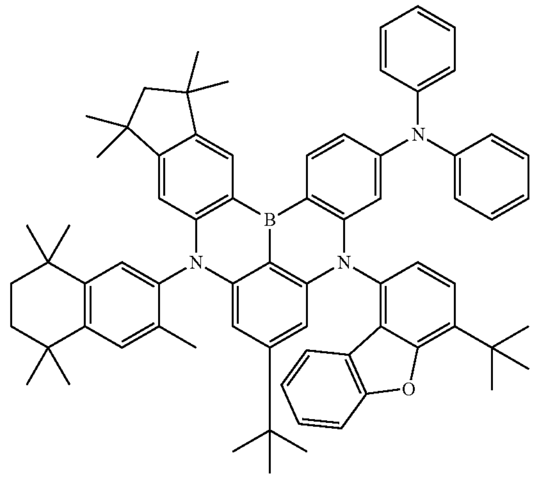
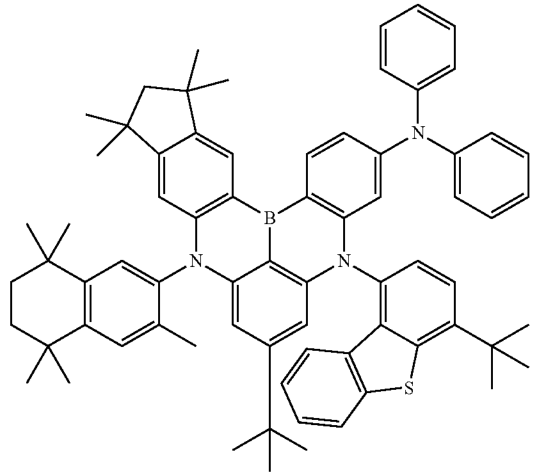
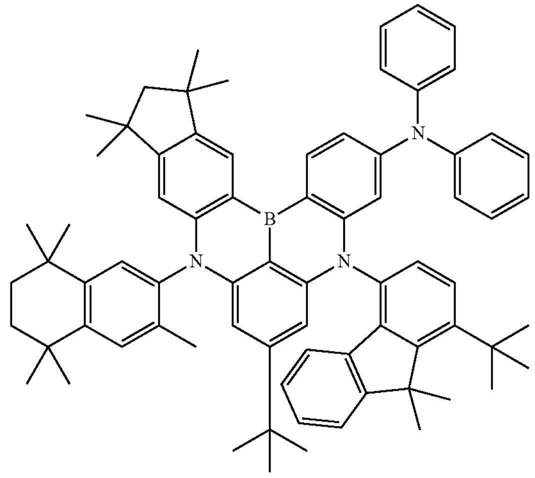

-continued
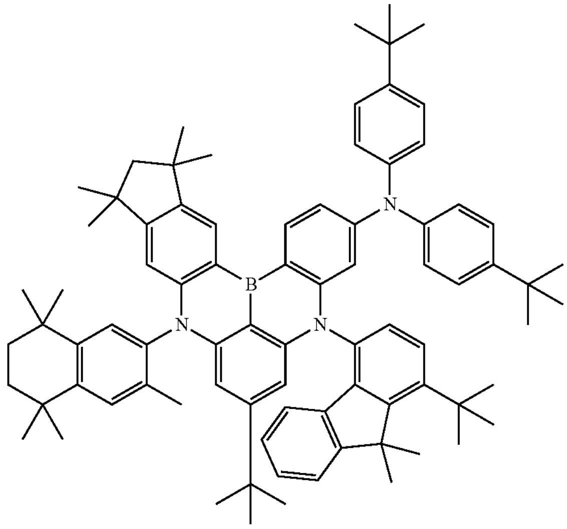
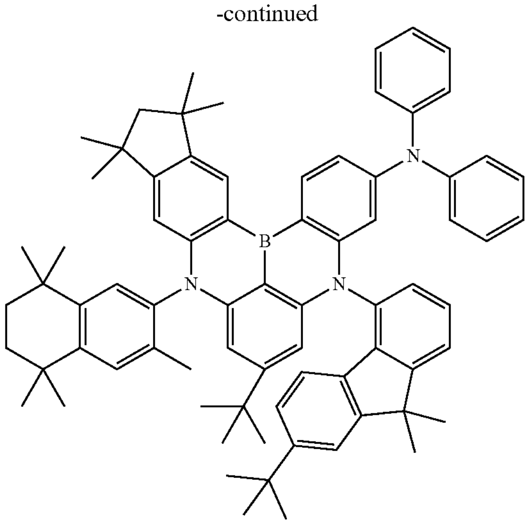
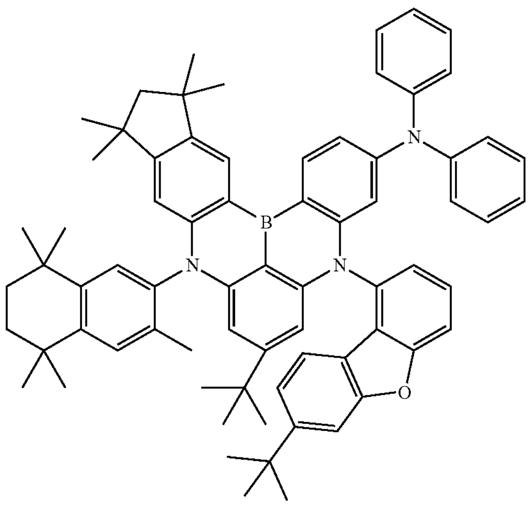
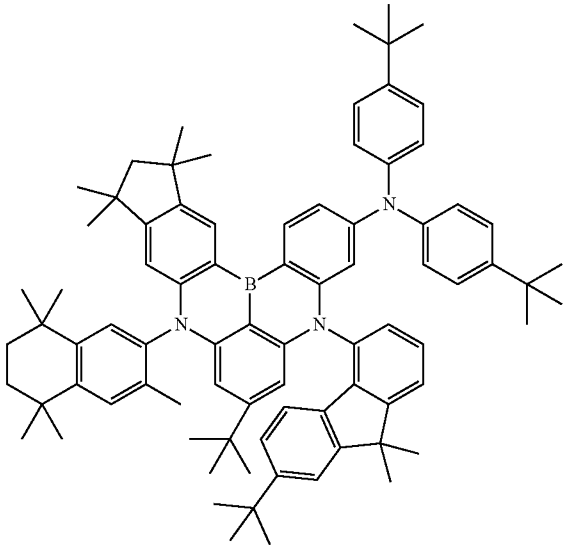
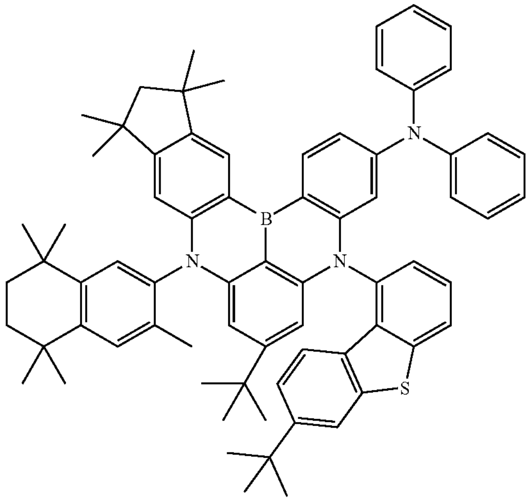
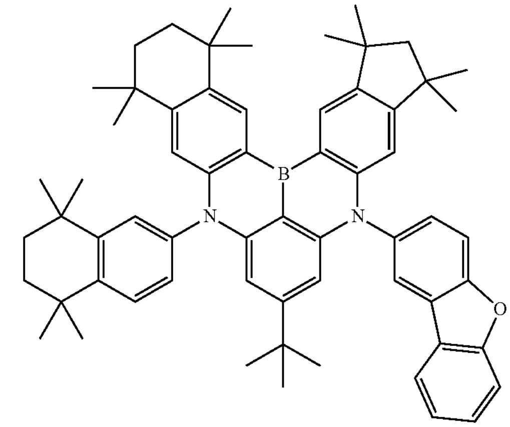

-continued
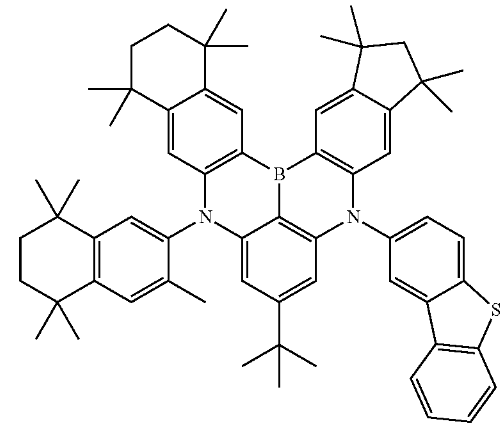
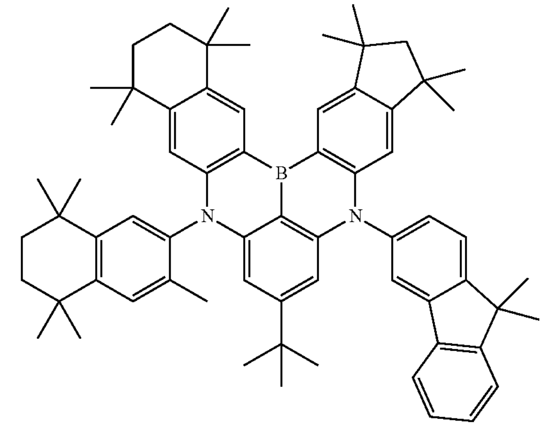
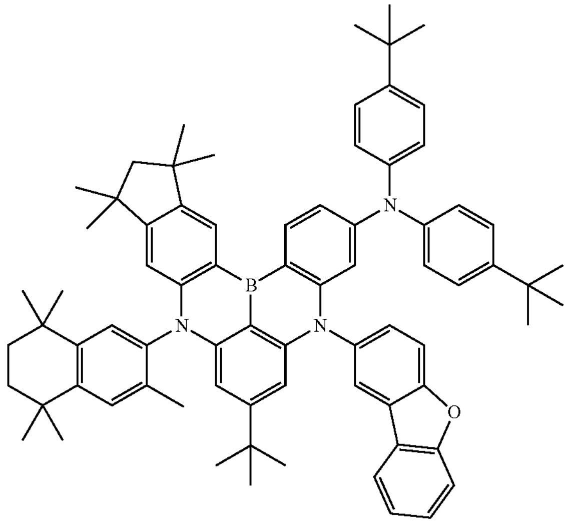
-continued
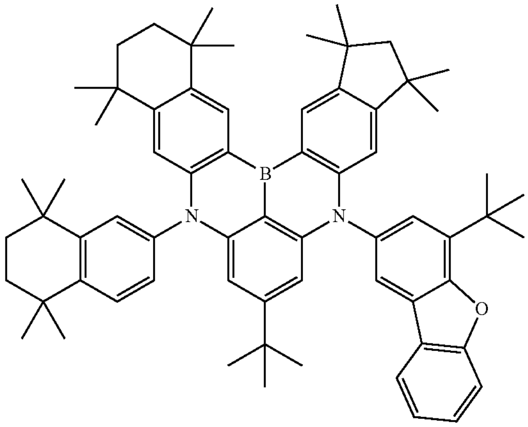
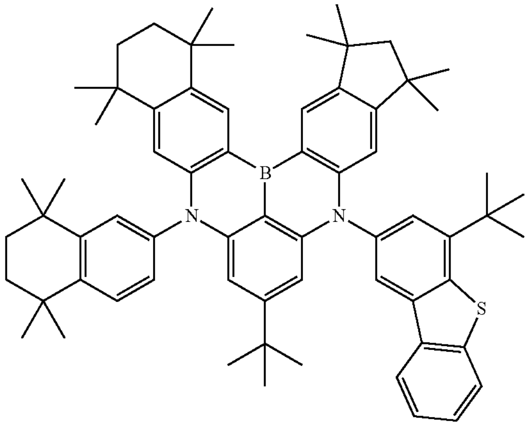
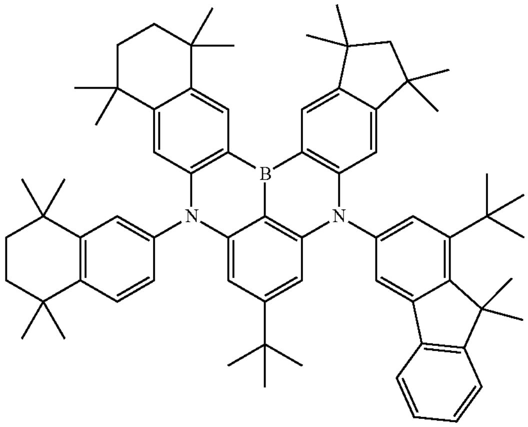

-continued
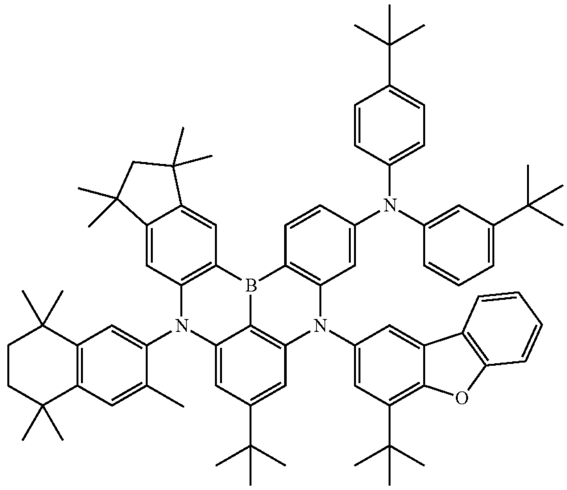
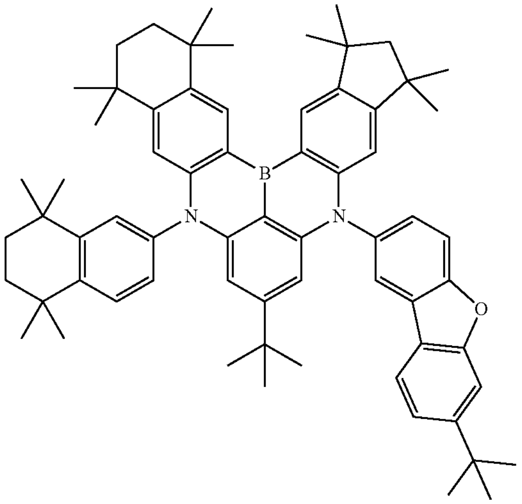
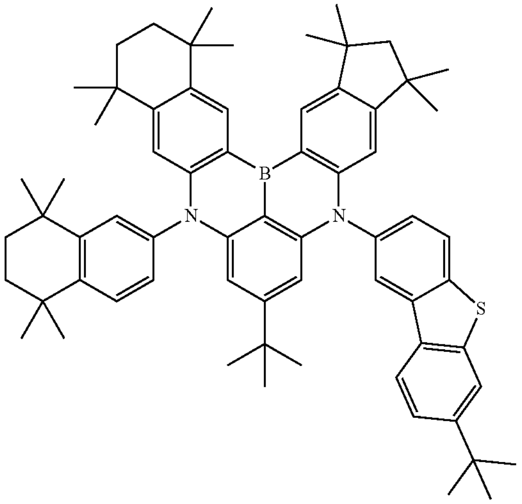
-continued
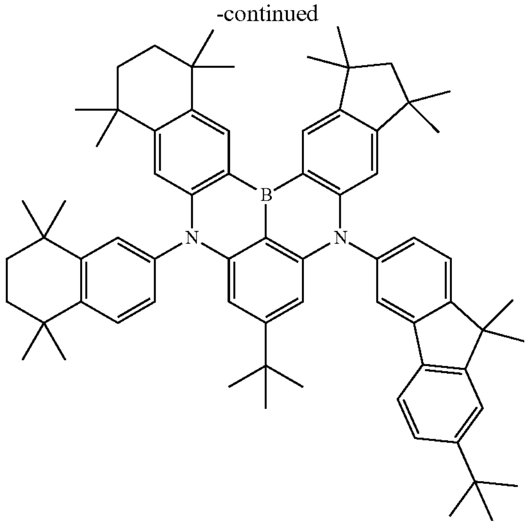
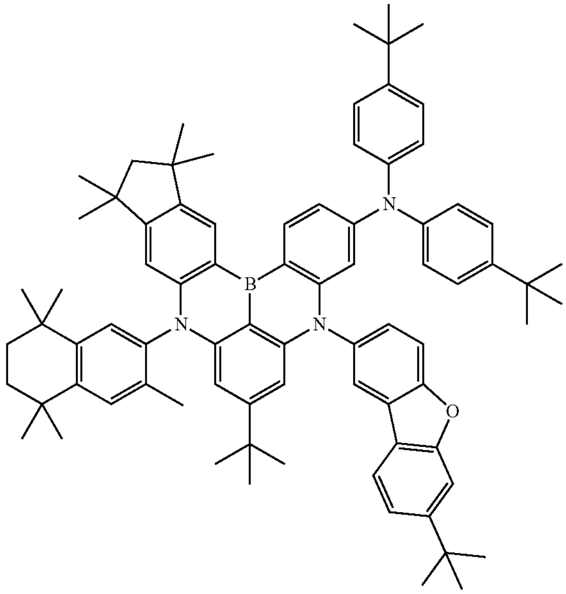
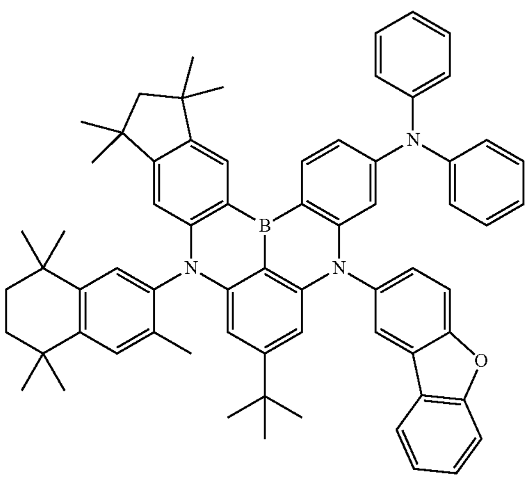

-continued
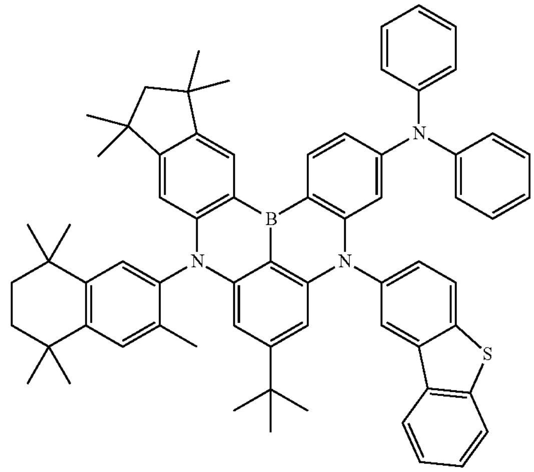
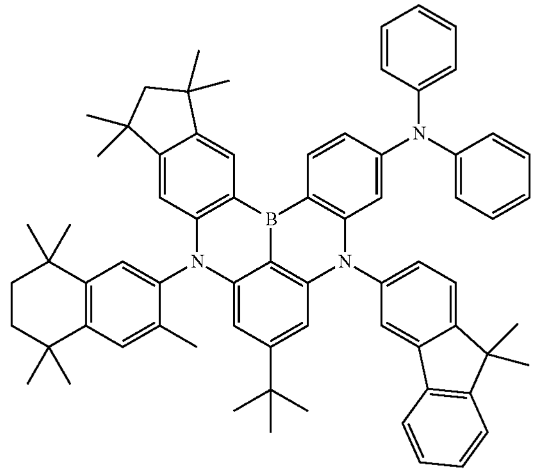
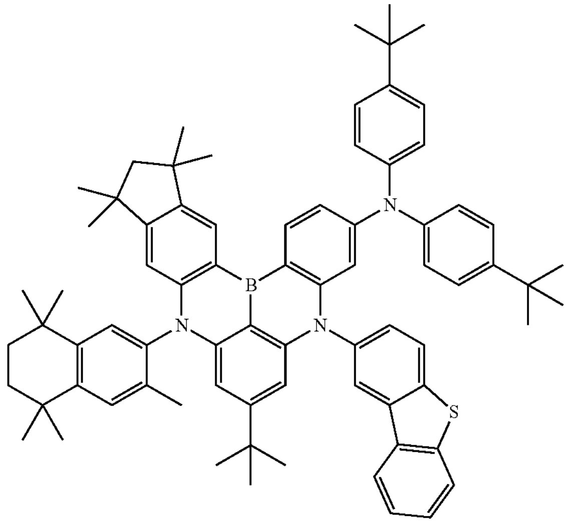
-continued
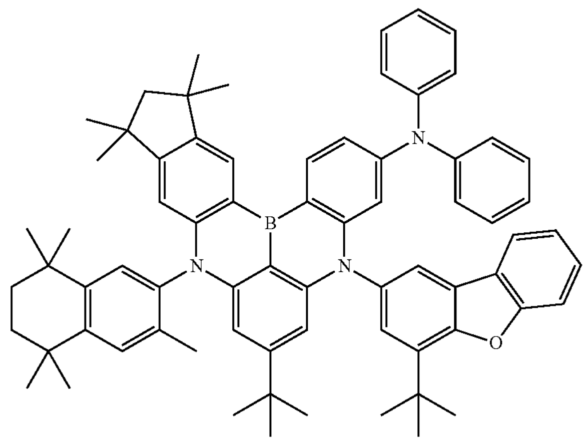
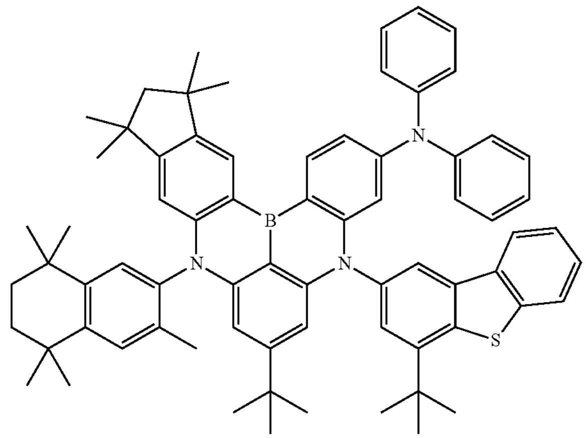
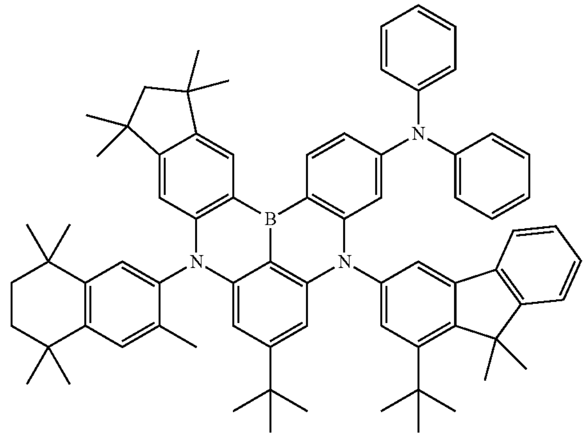

-continued
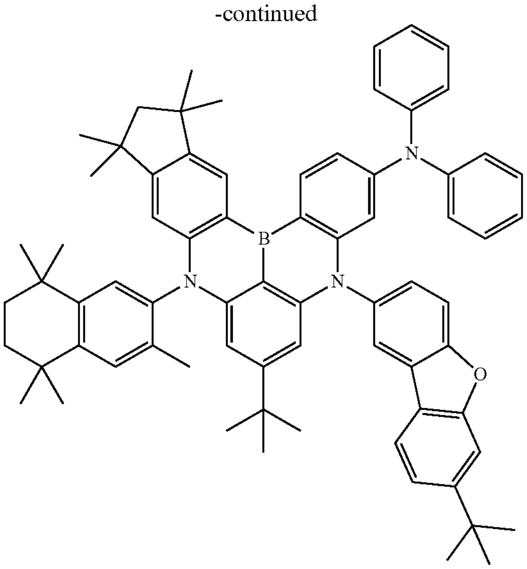
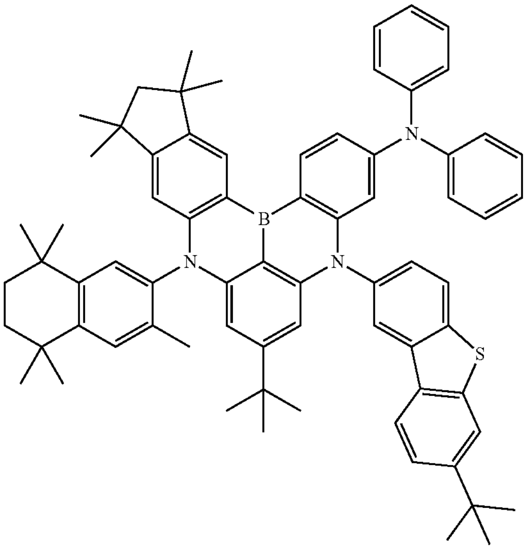
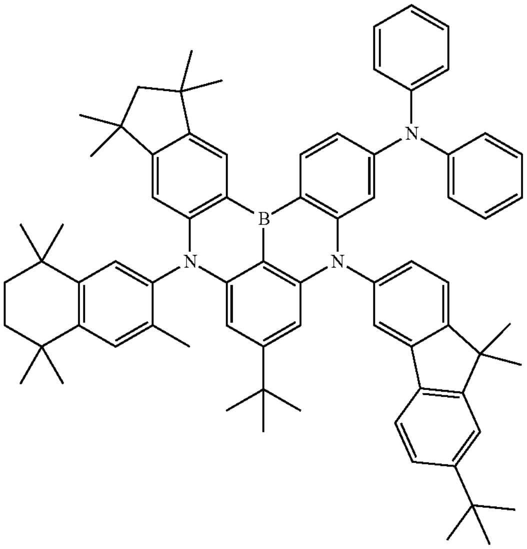
-continued
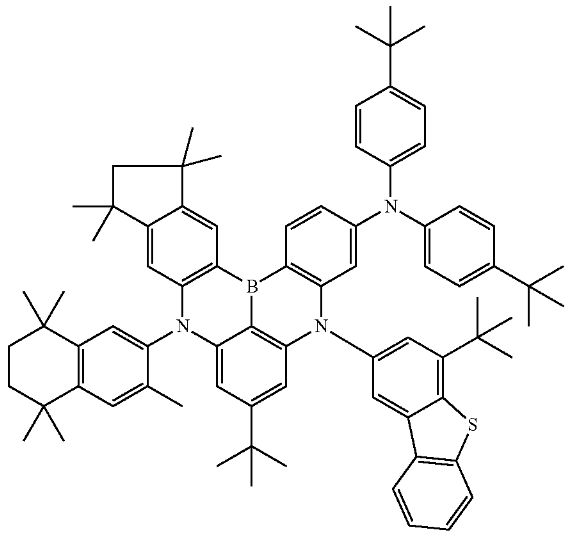
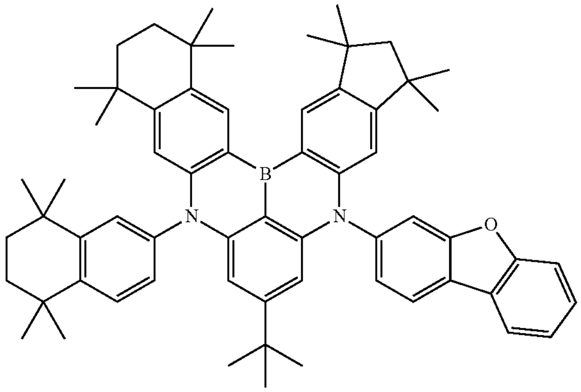
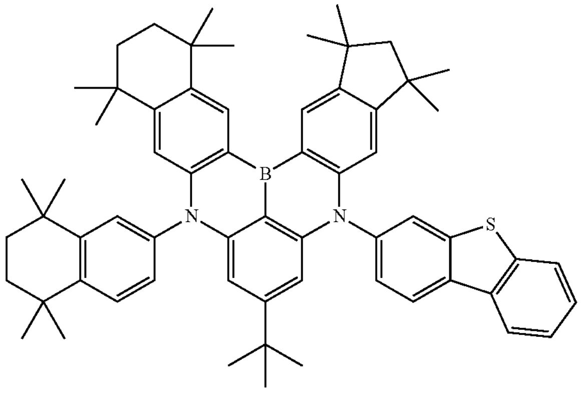
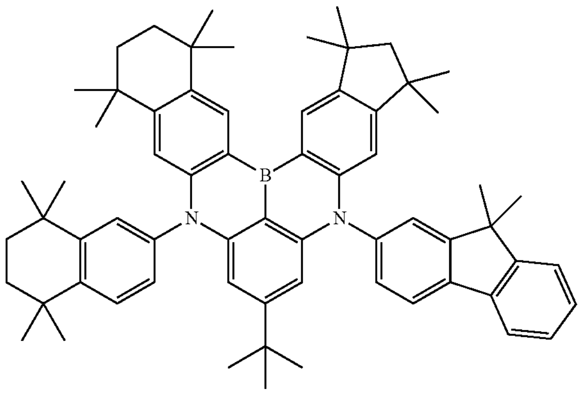

-continued
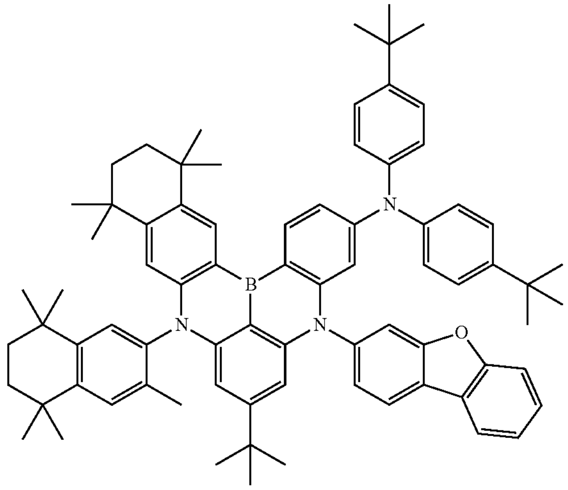
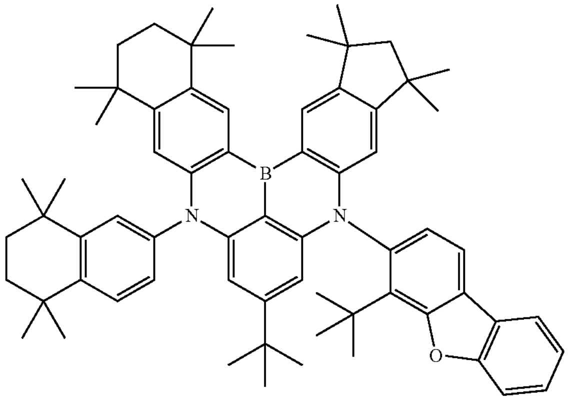
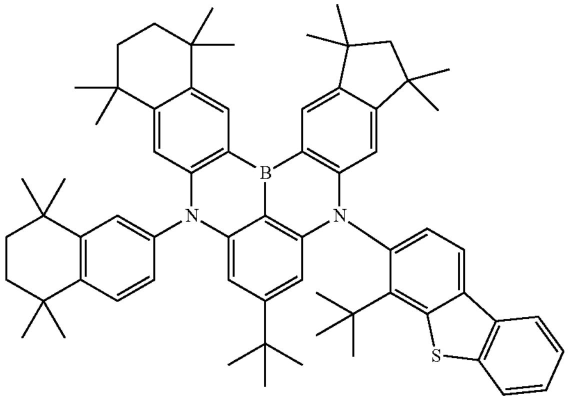
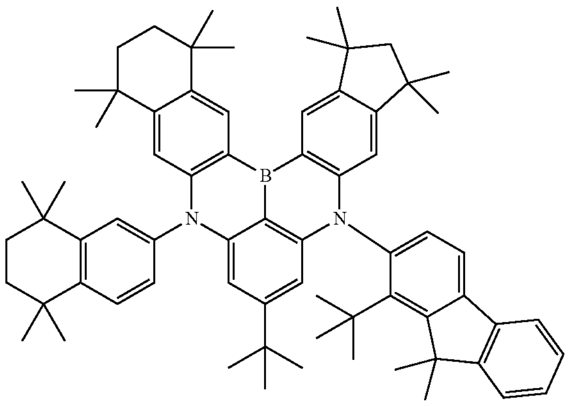
-continued
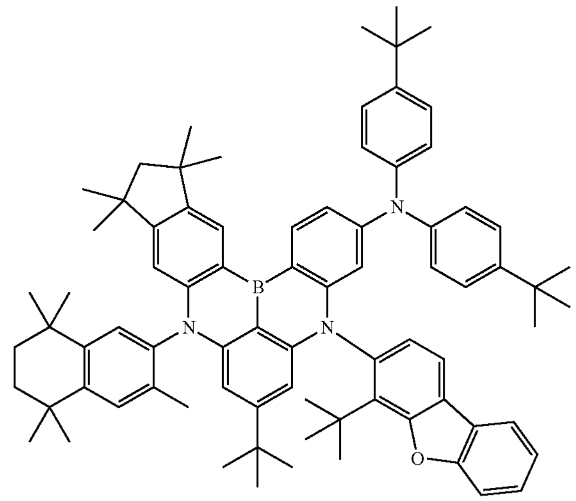
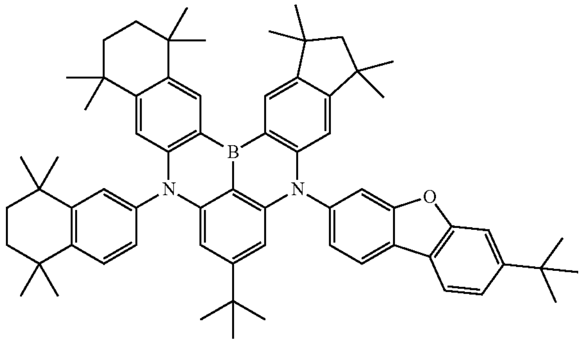
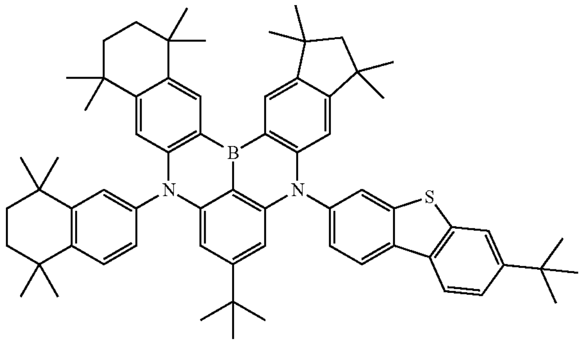
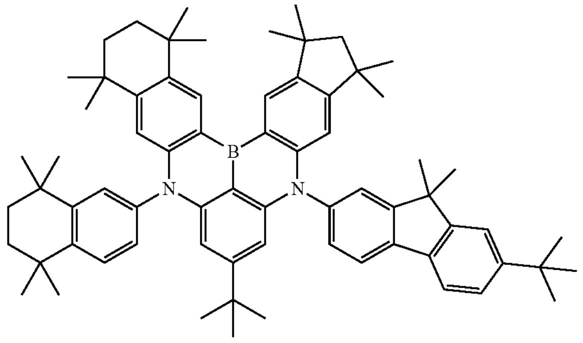

-continued
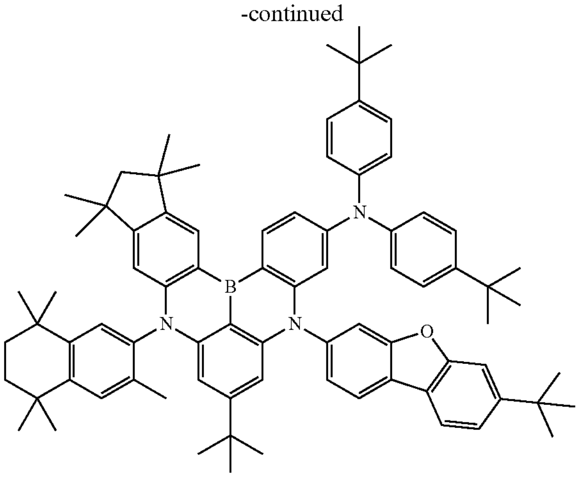
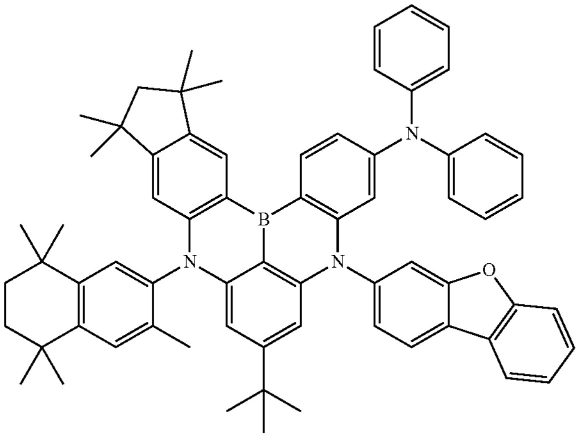
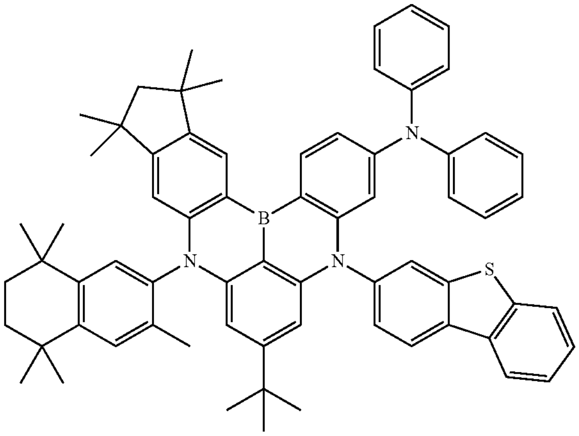
-continued
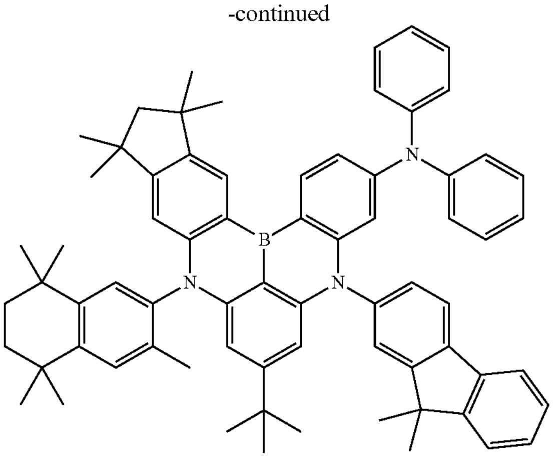
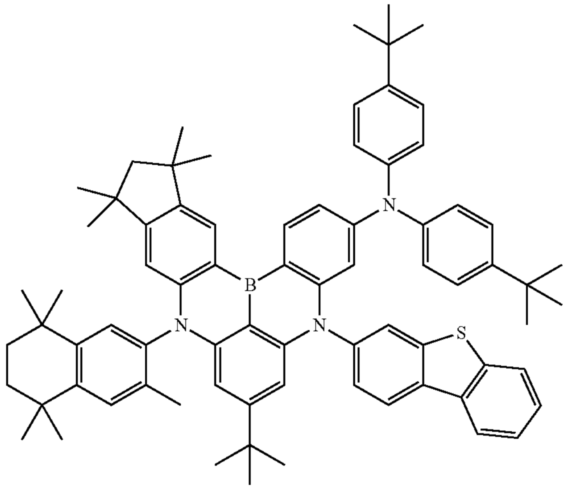
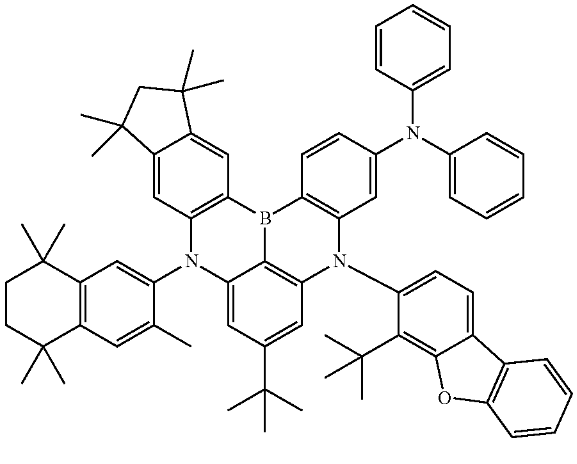

-continued
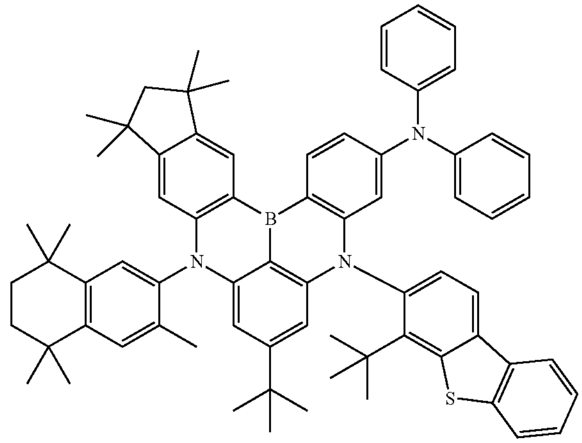
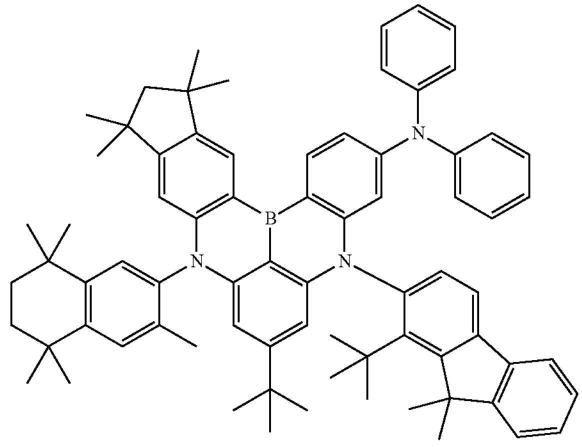
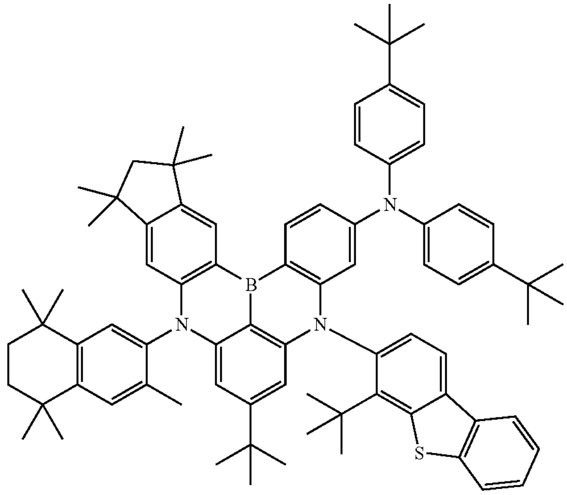
-continued
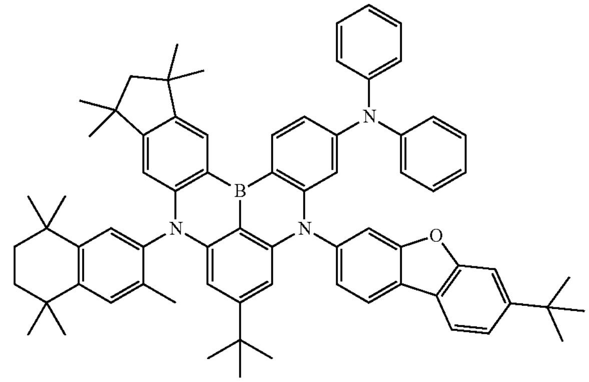
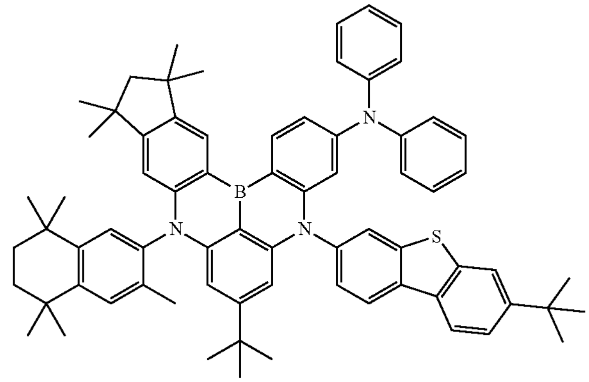
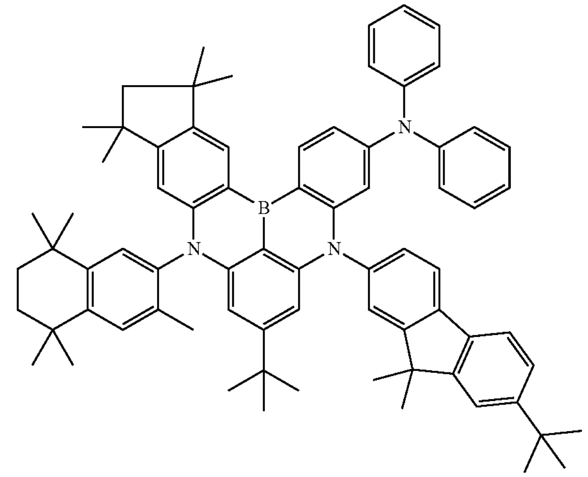
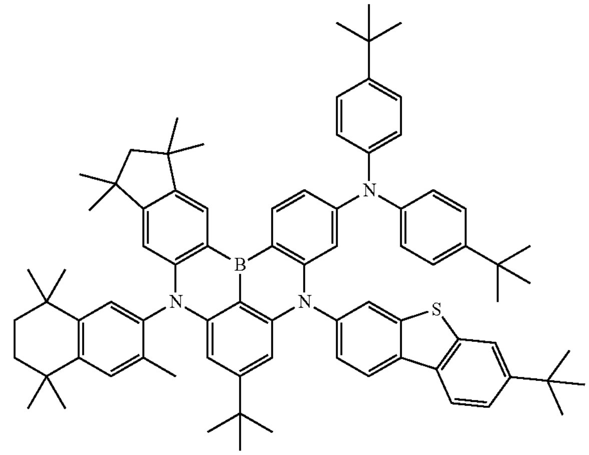

-continued
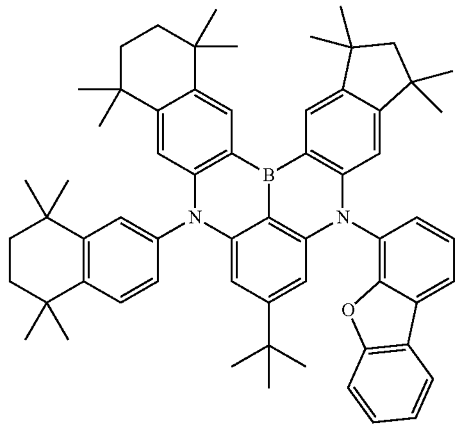
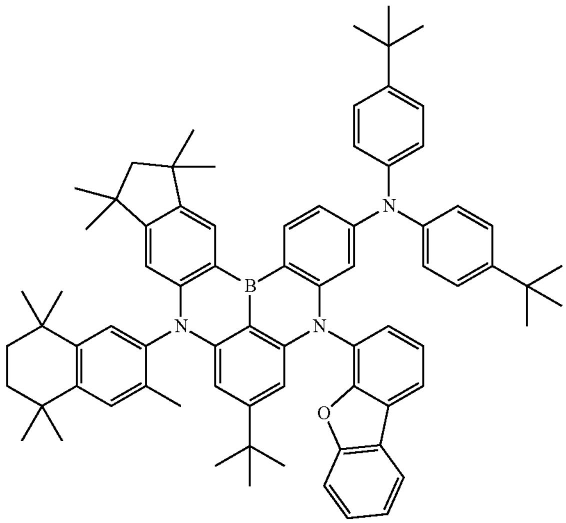
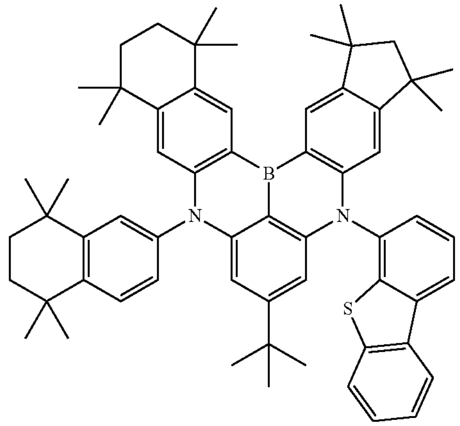
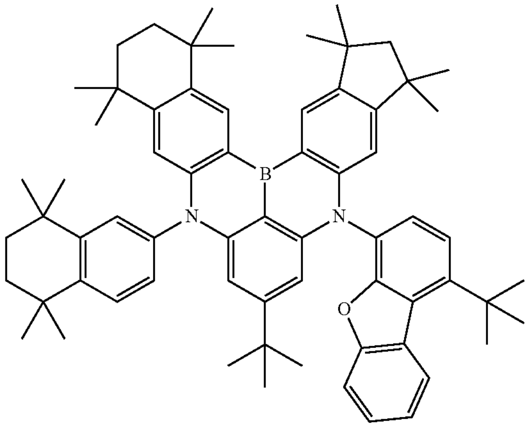
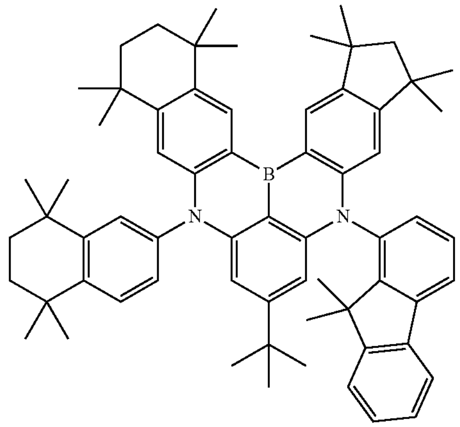
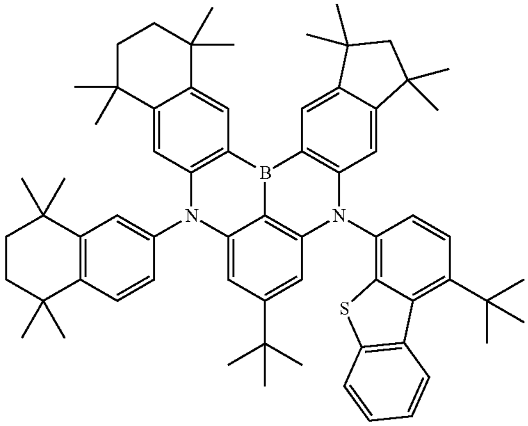
-continued -continued
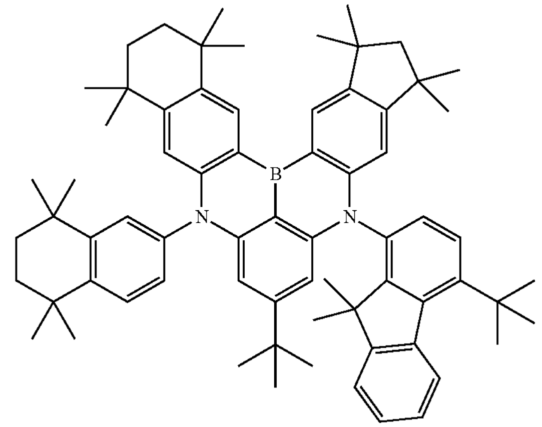
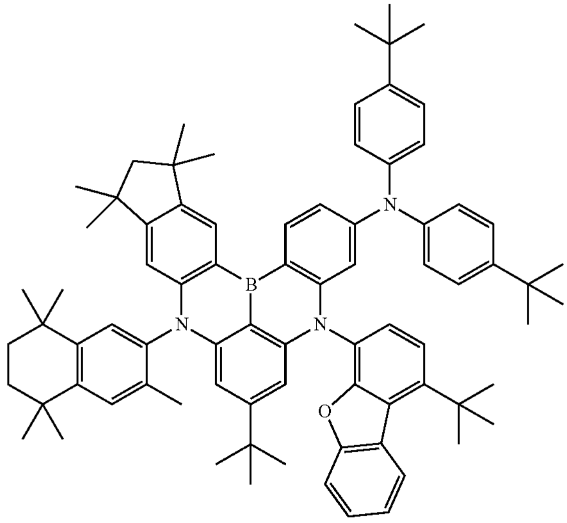
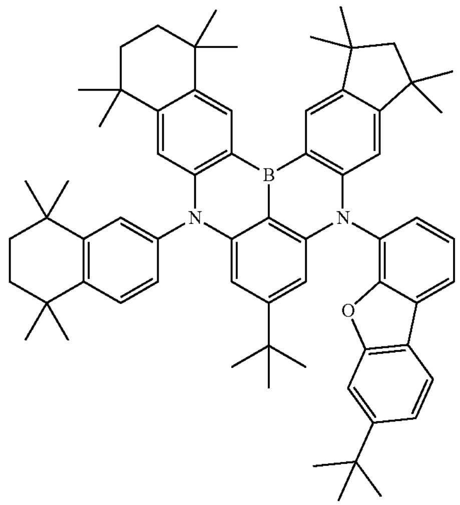
-continued
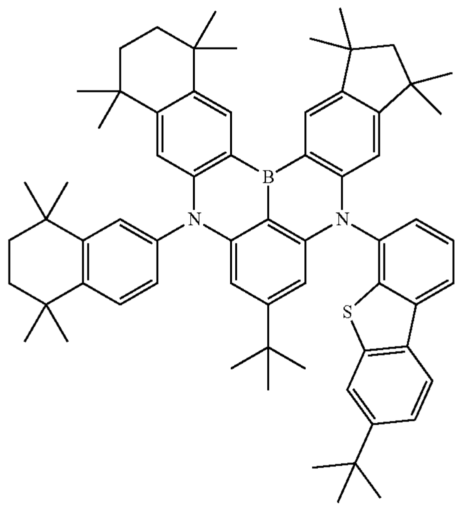
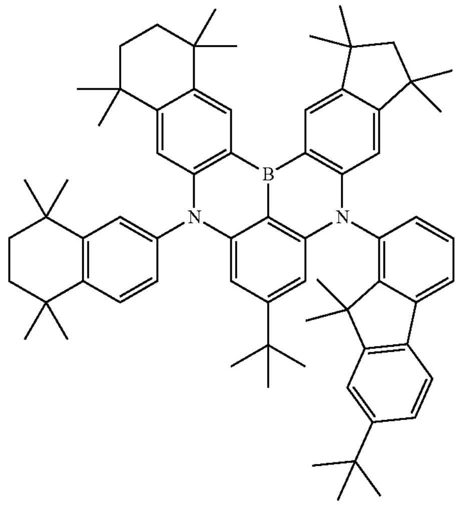
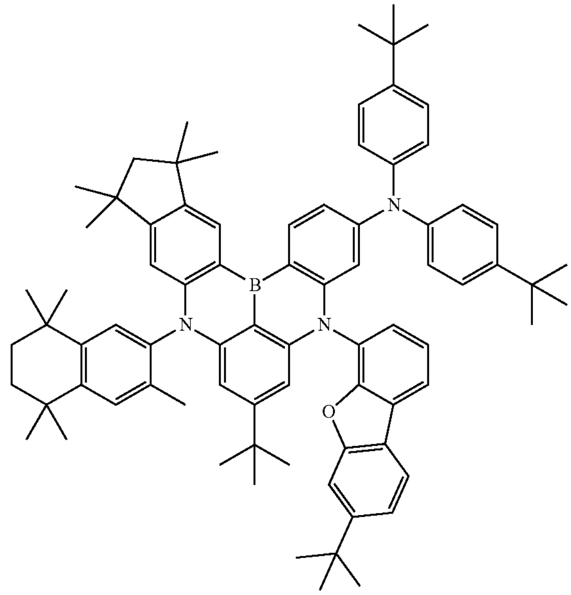

-continued
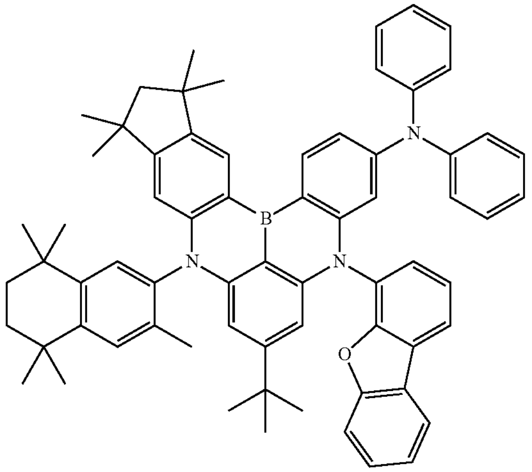
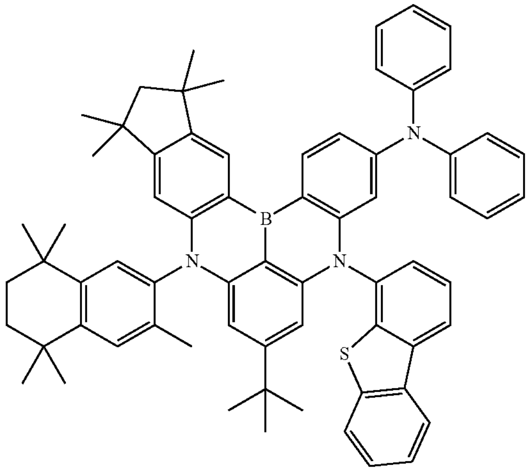
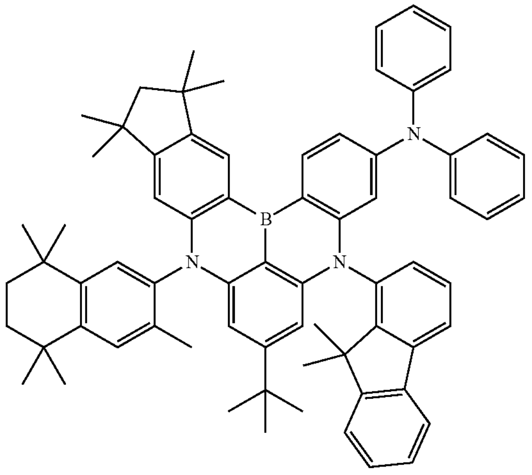
-continued
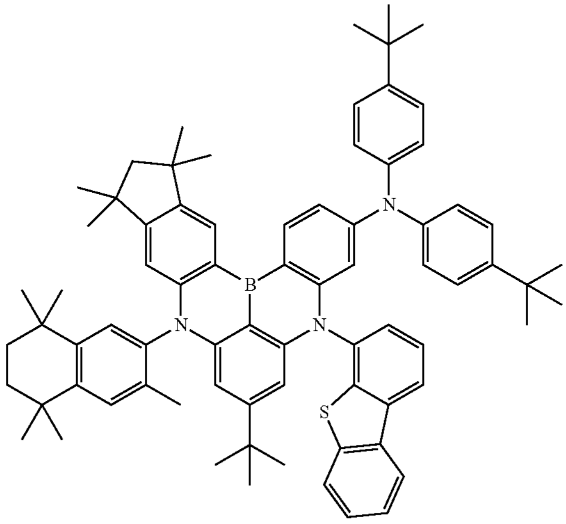
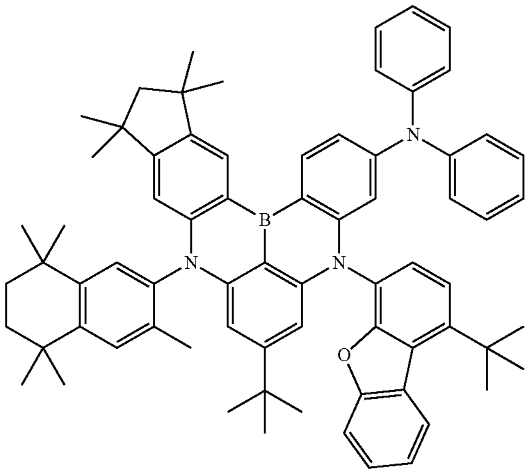
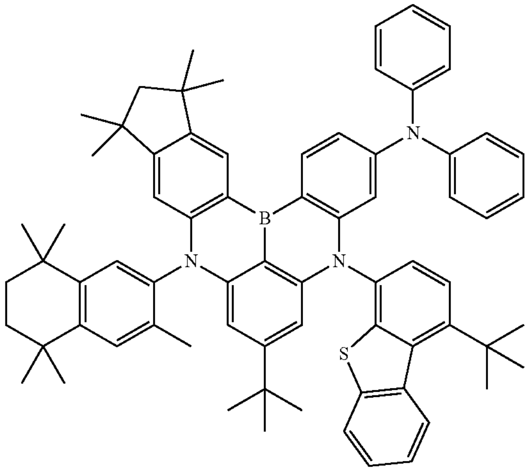

-continued
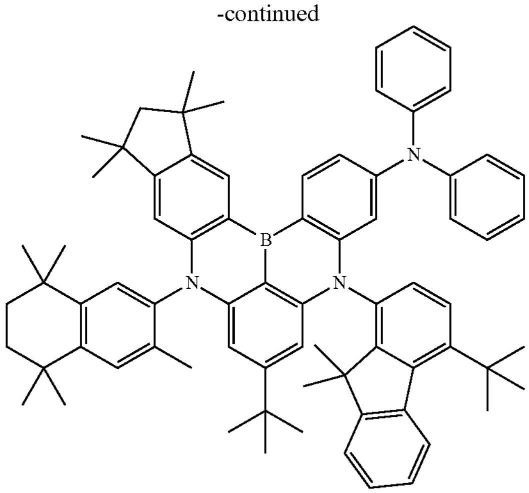
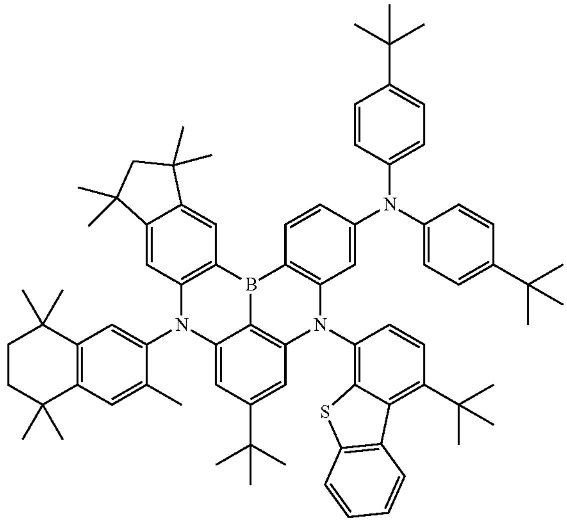
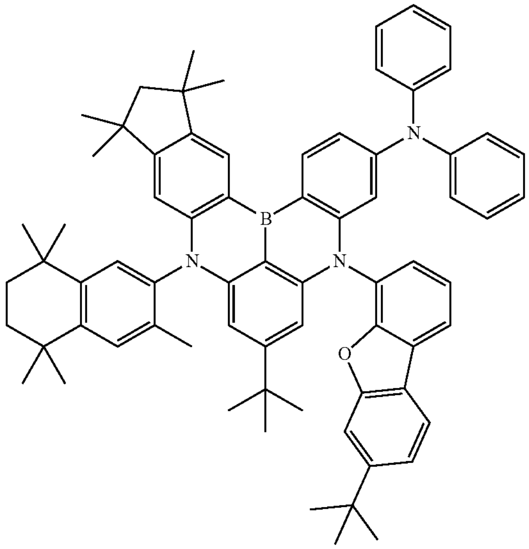
-continued
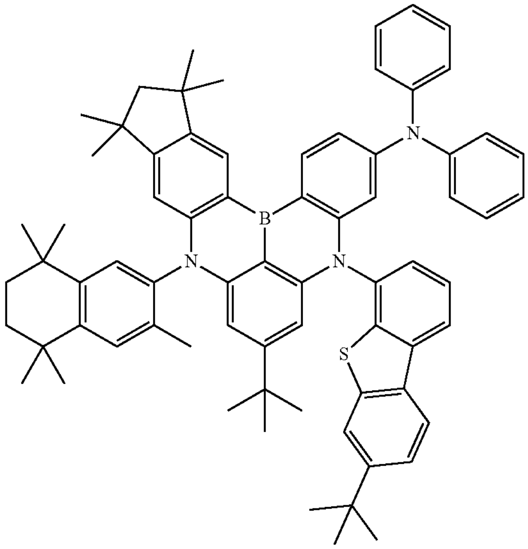
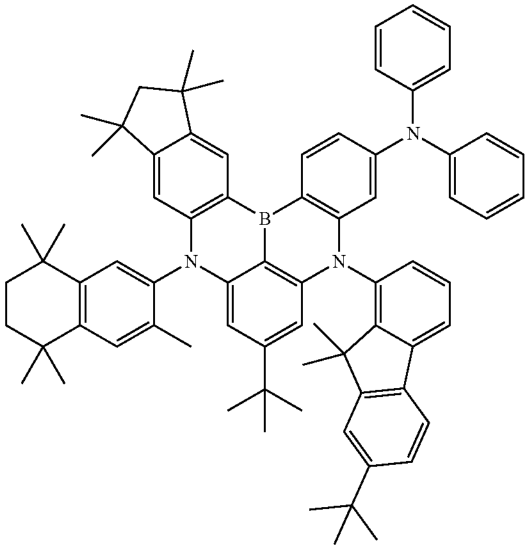
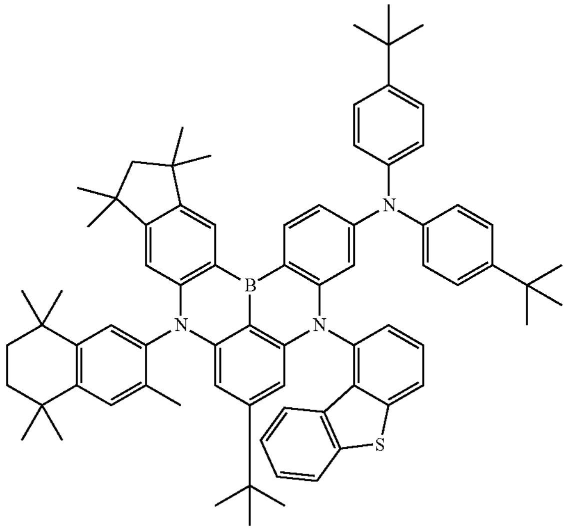

-continued
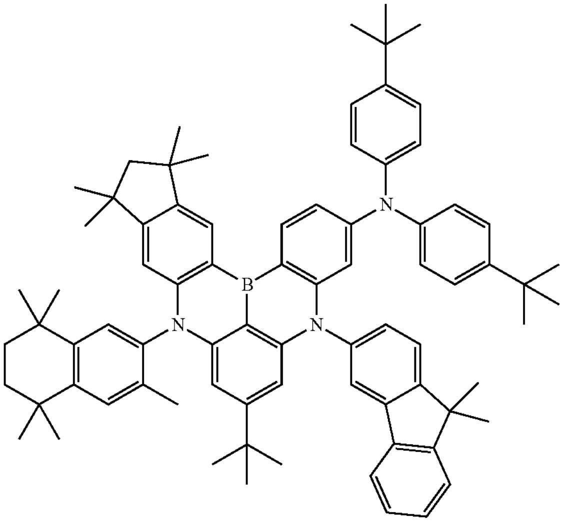
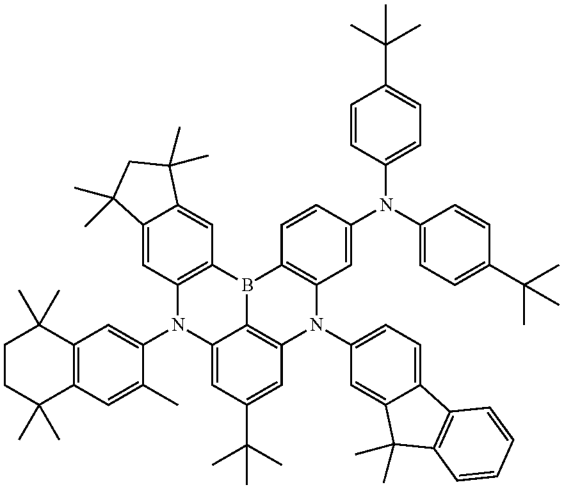
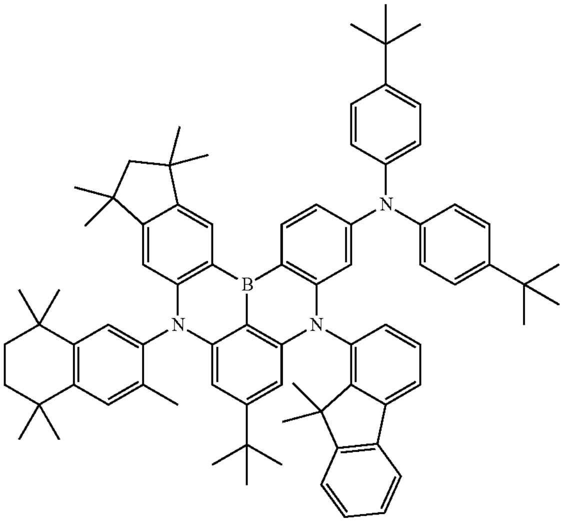
-continued
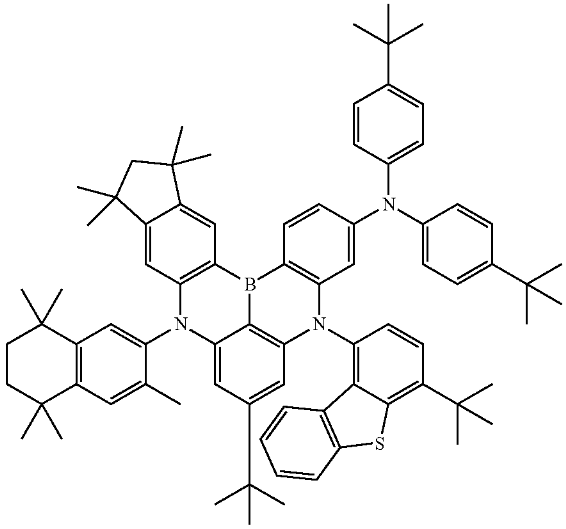
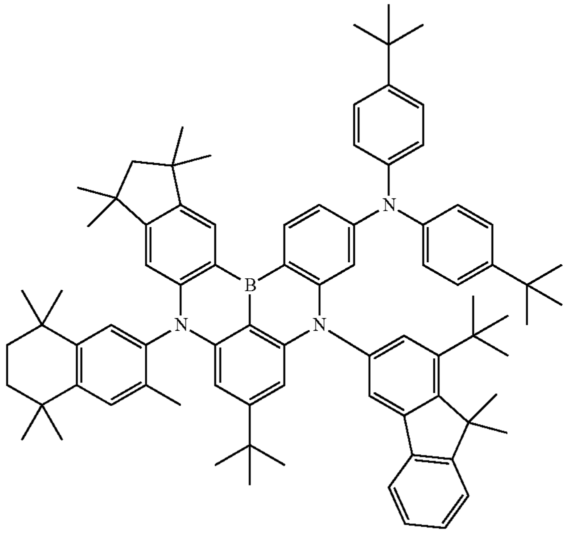
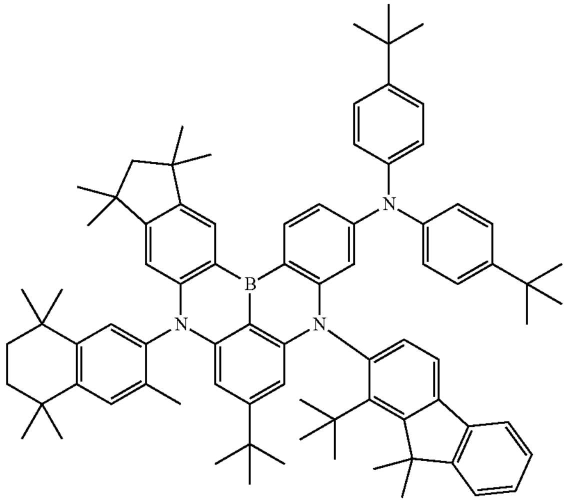

-continued
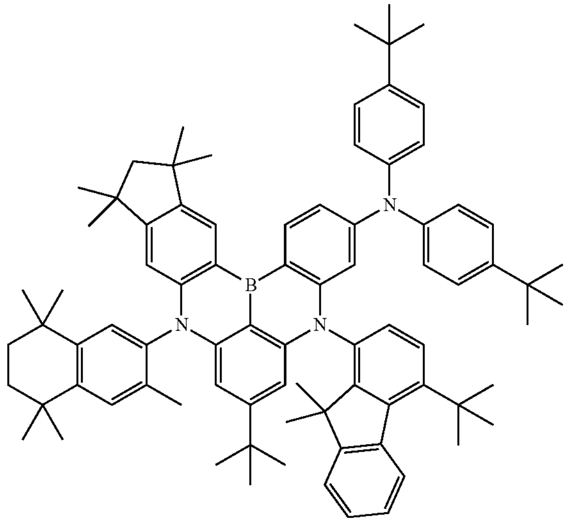
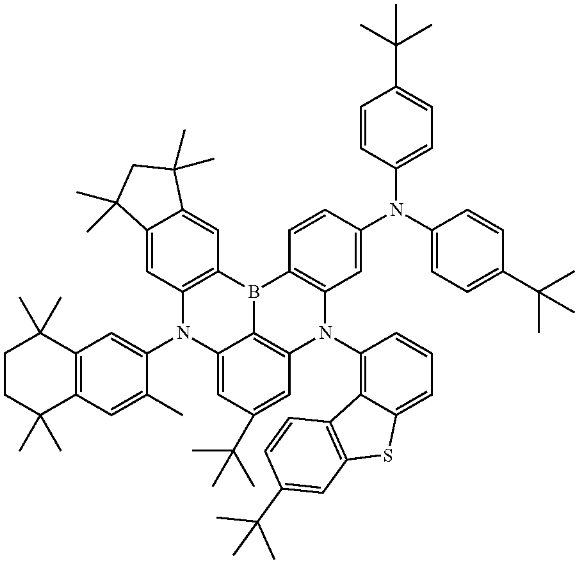
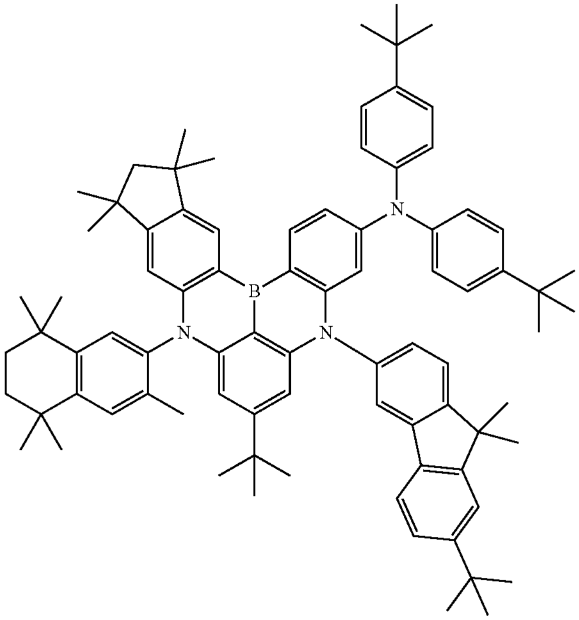
-continued
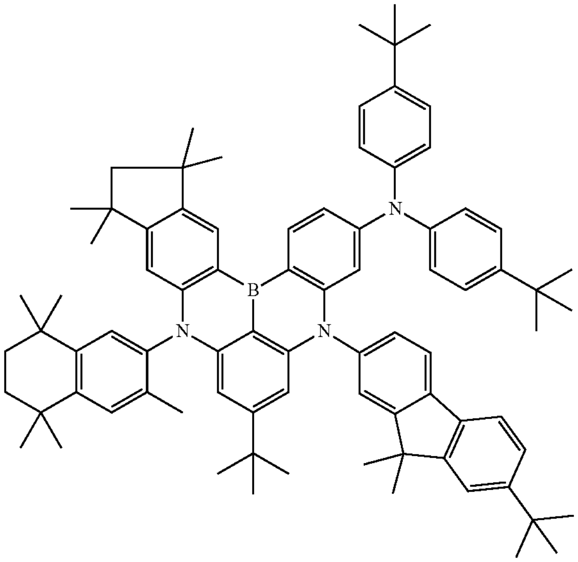
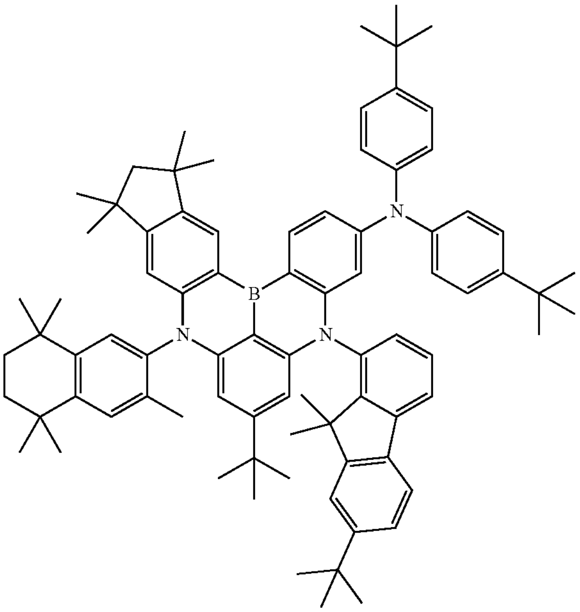

-continued
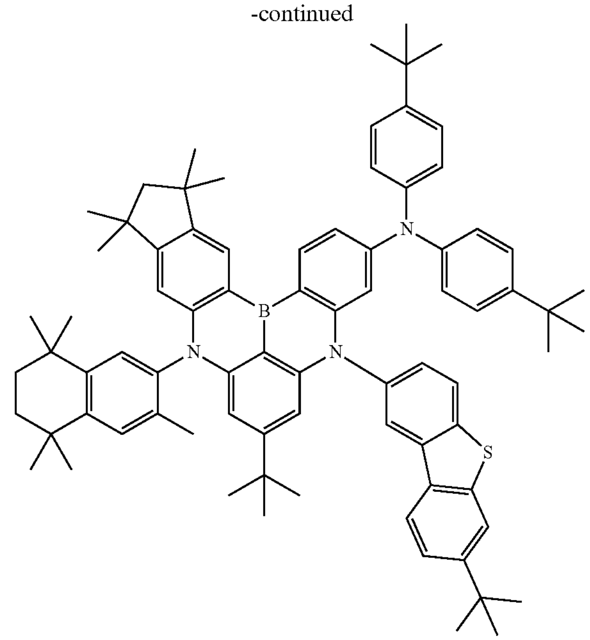
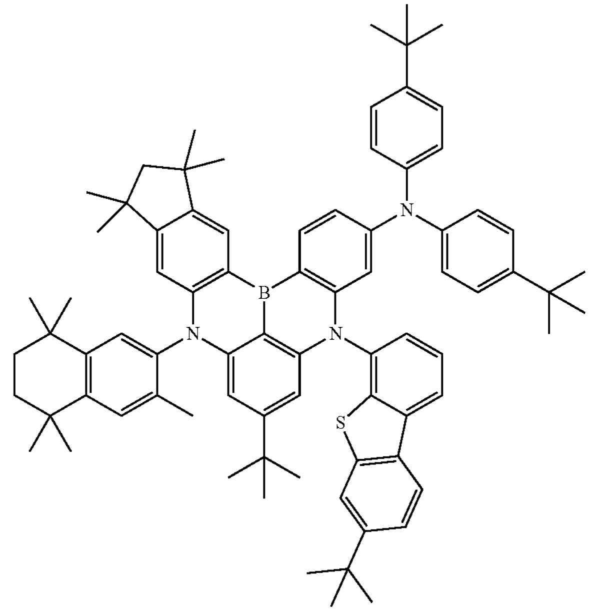
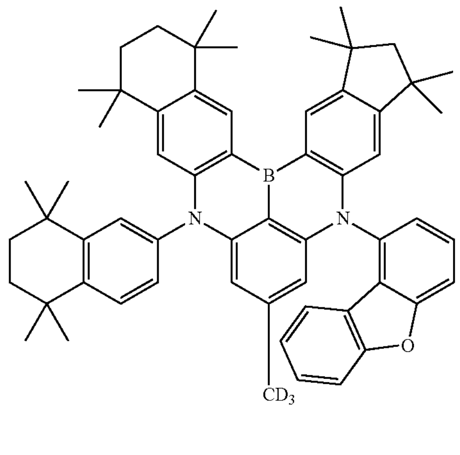
-continued
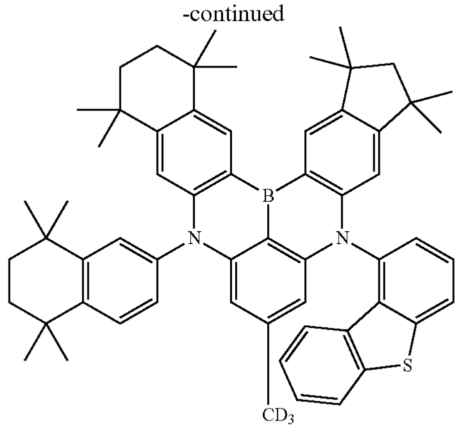
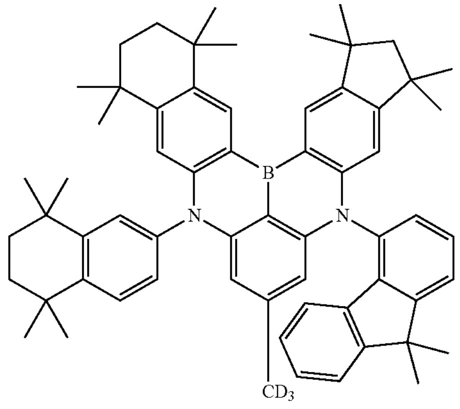
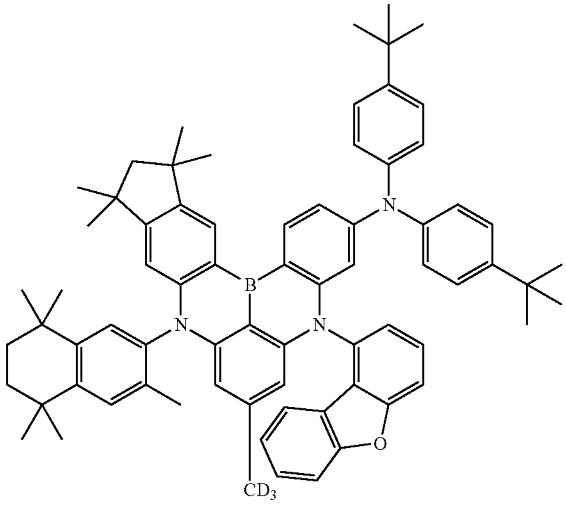
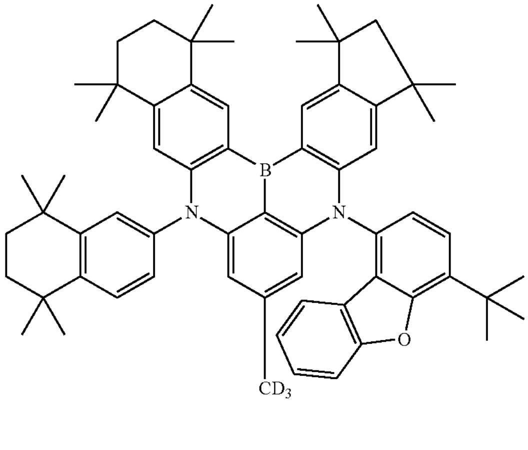

-continued
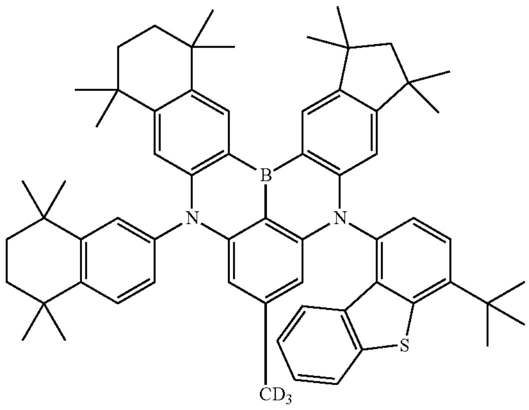
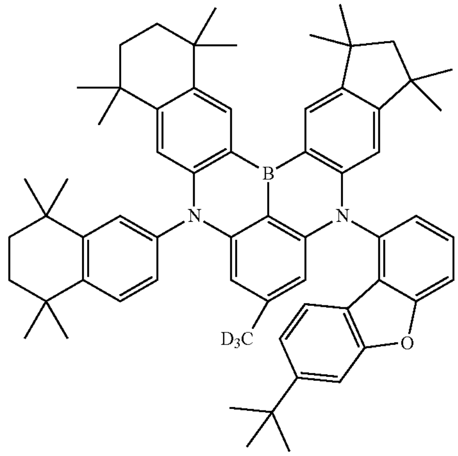
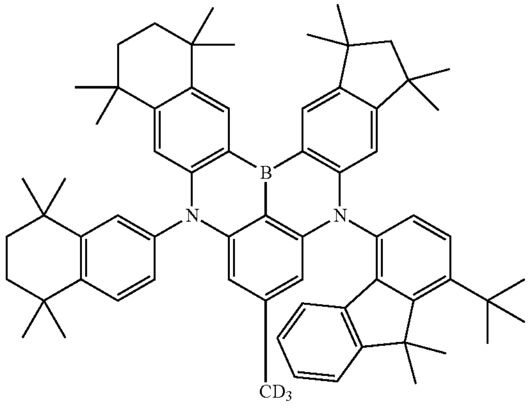
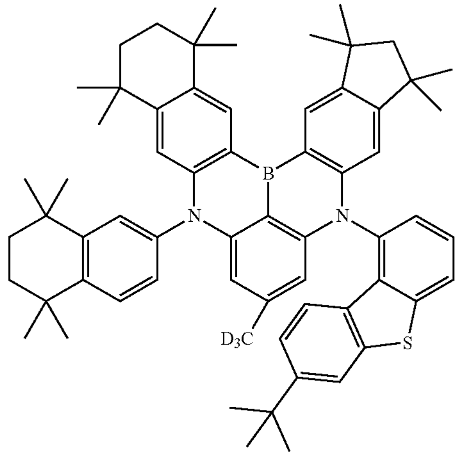
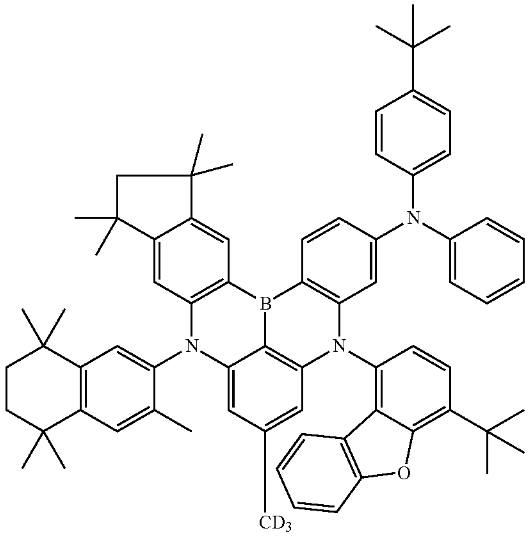
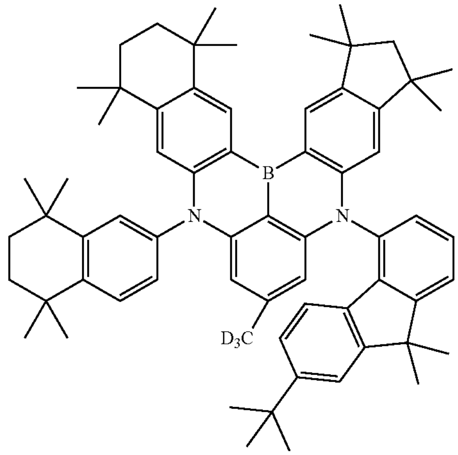
-continued -continued
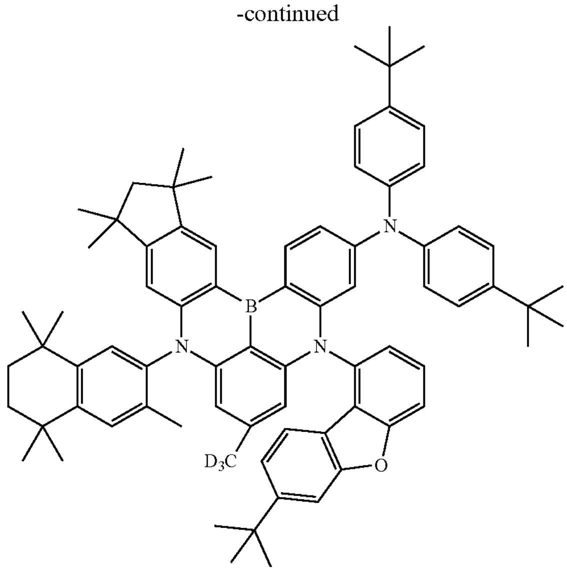
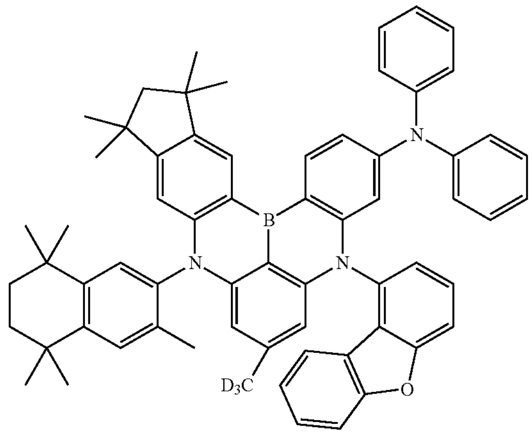
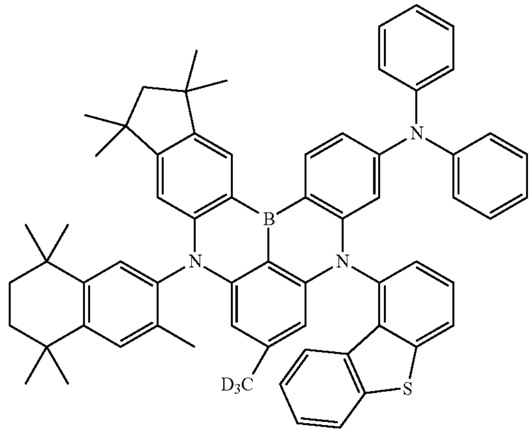
-continued
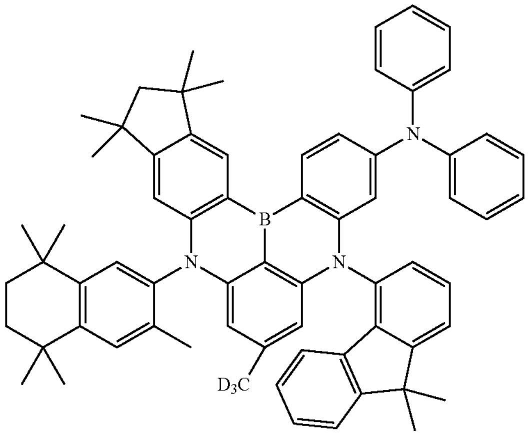
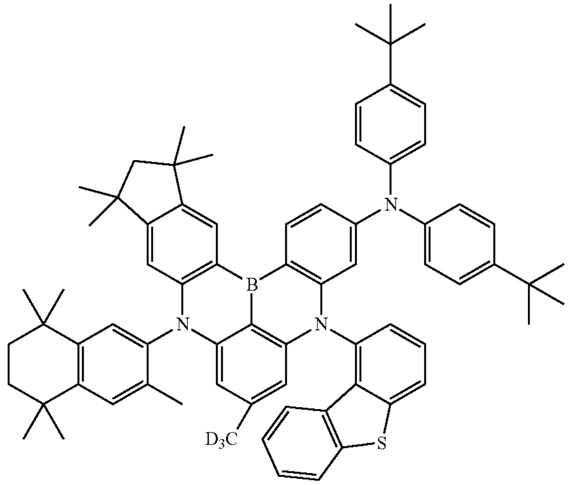
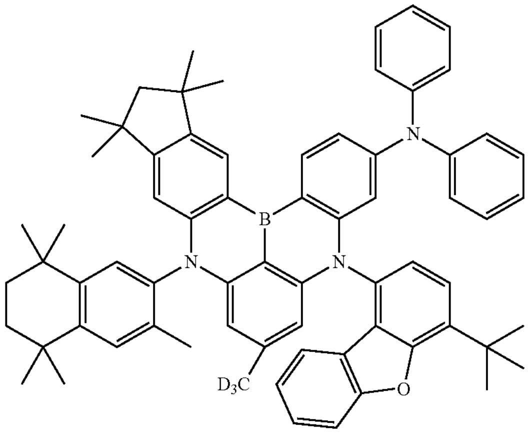

-continued
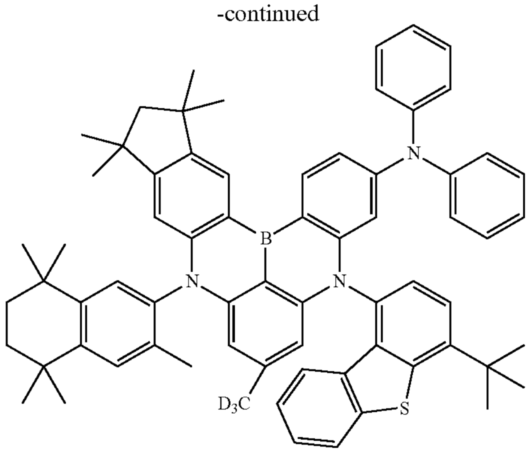
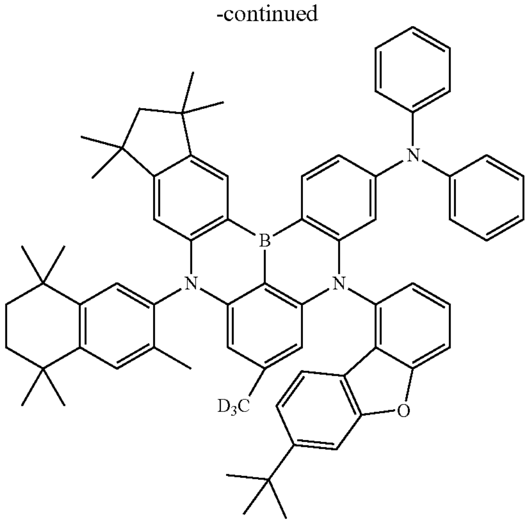
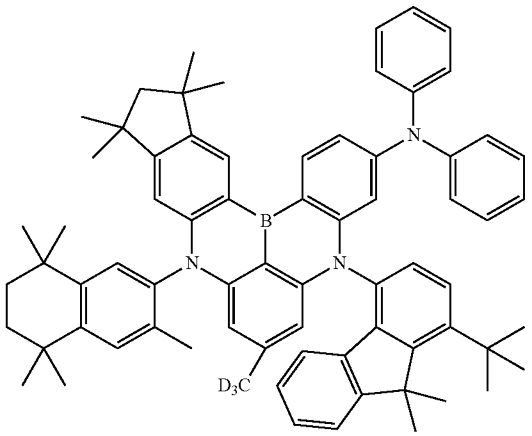
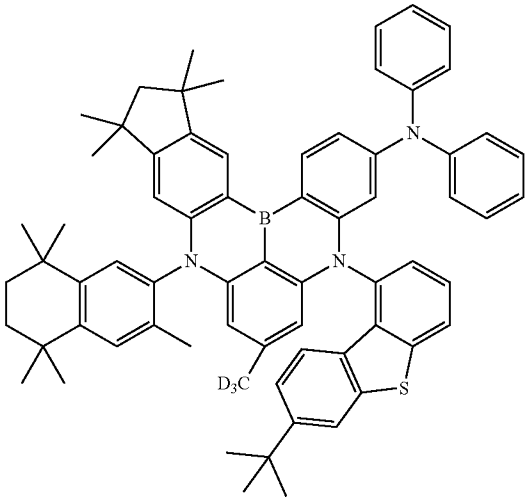
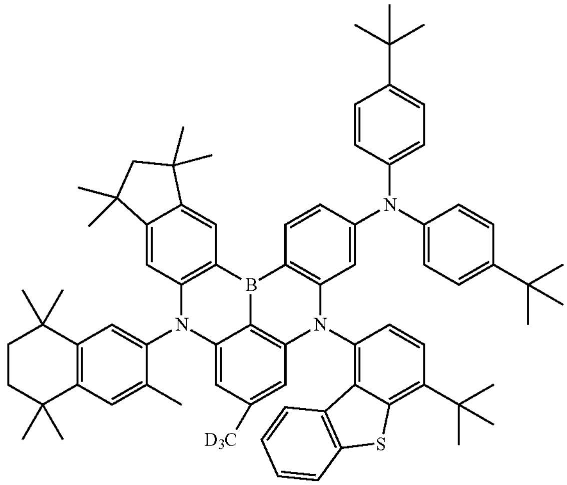
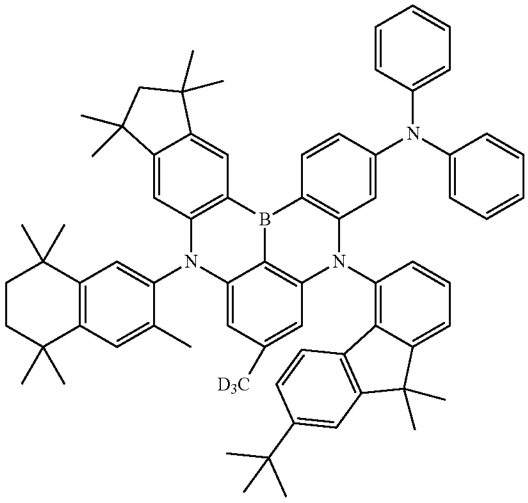
-continued -continued
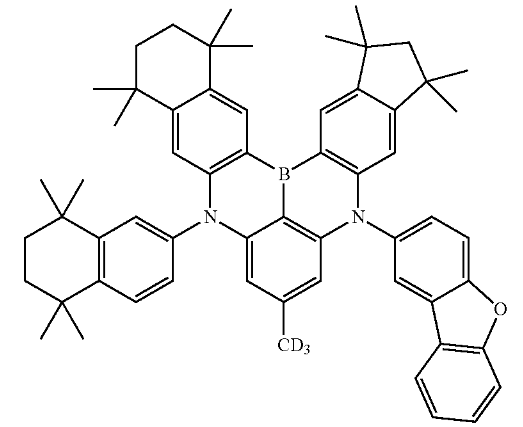
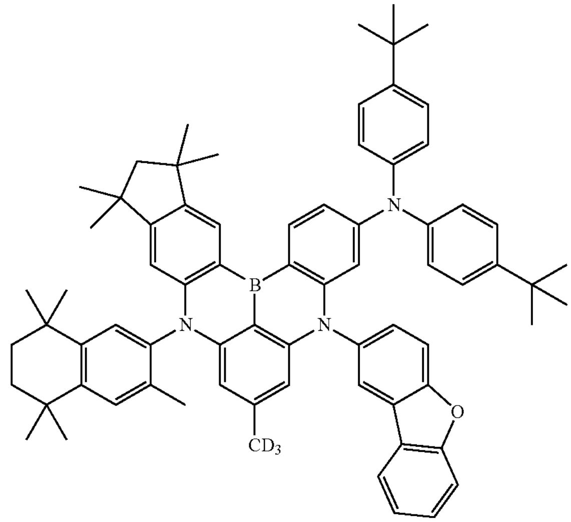
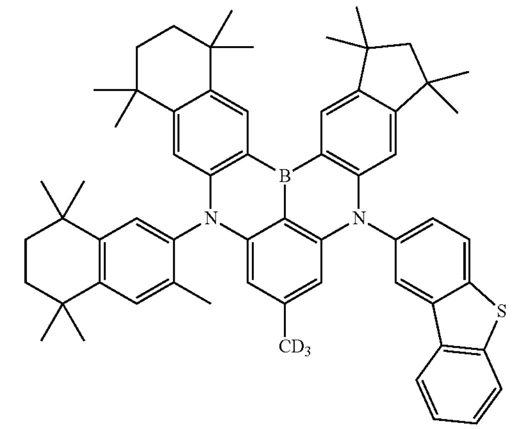
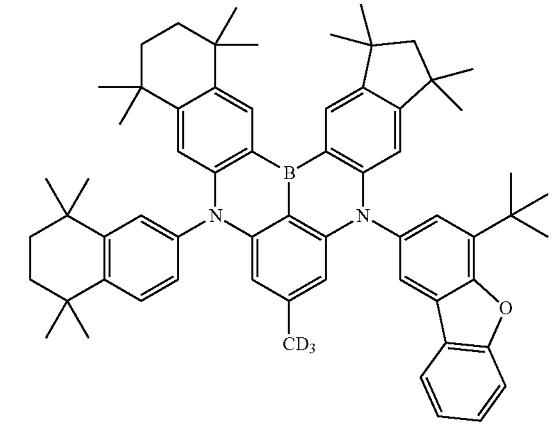
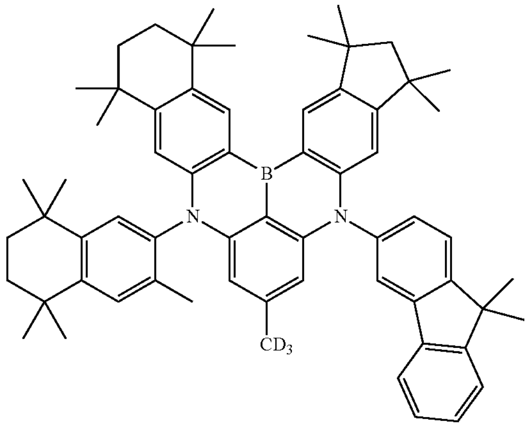
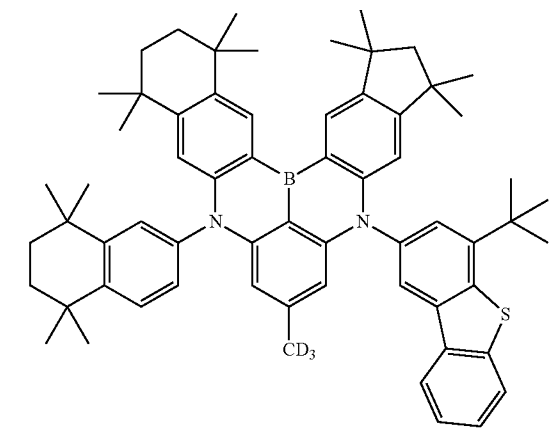
-continued -continued
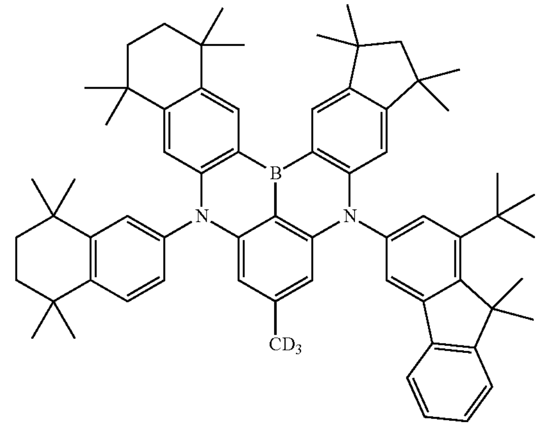
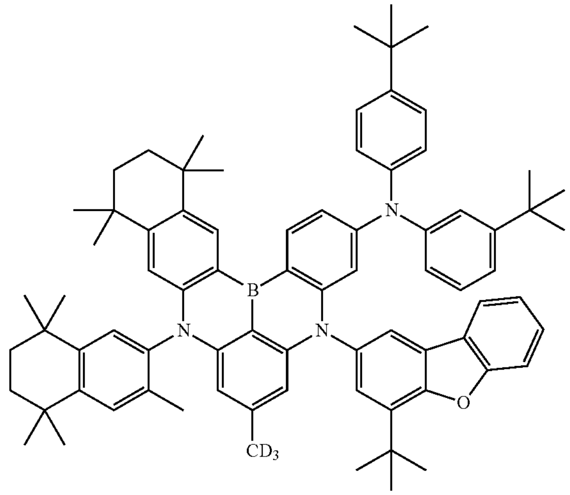
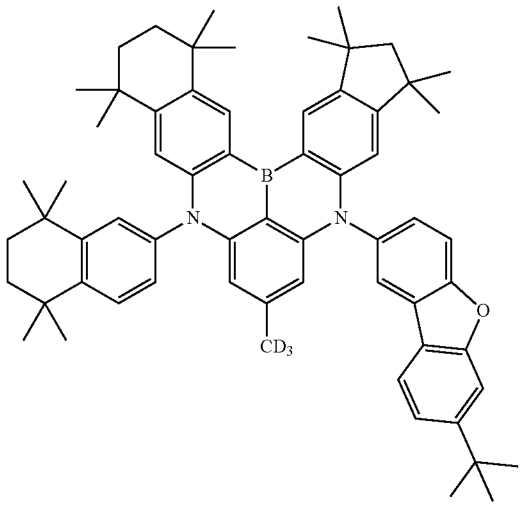
-continued
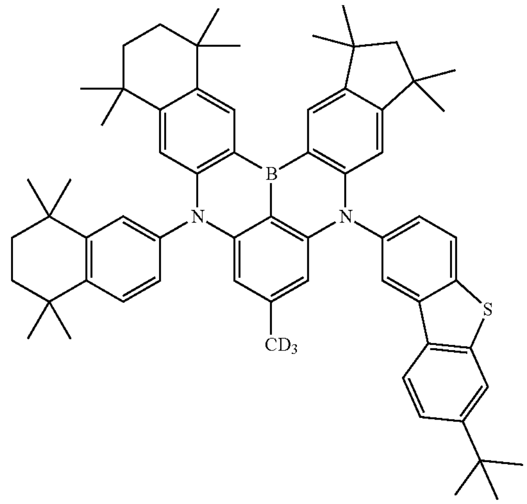
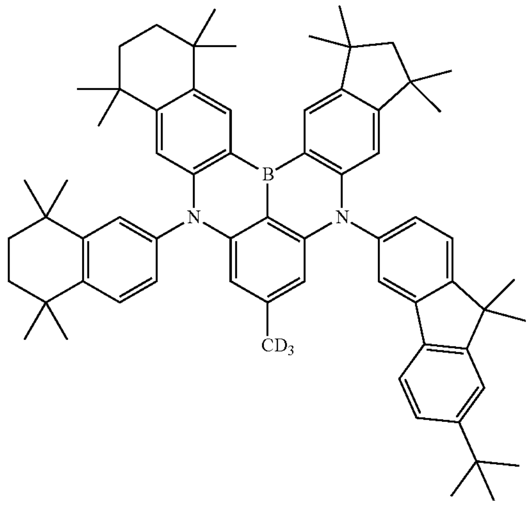
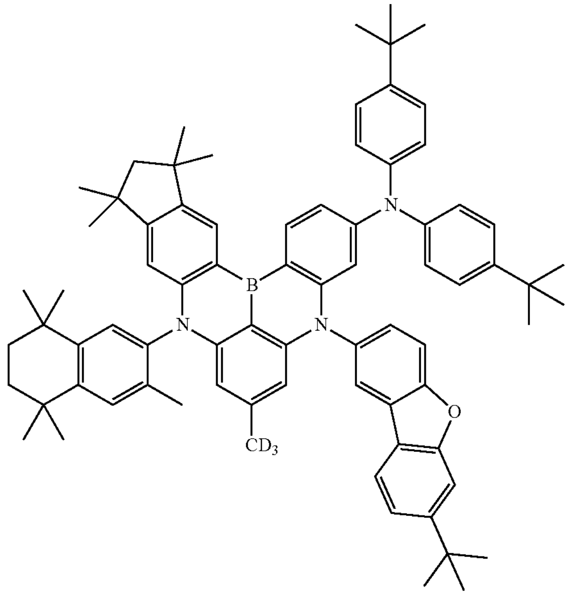

-continued
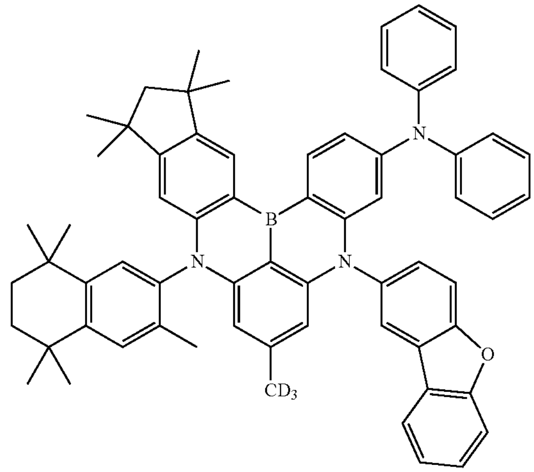
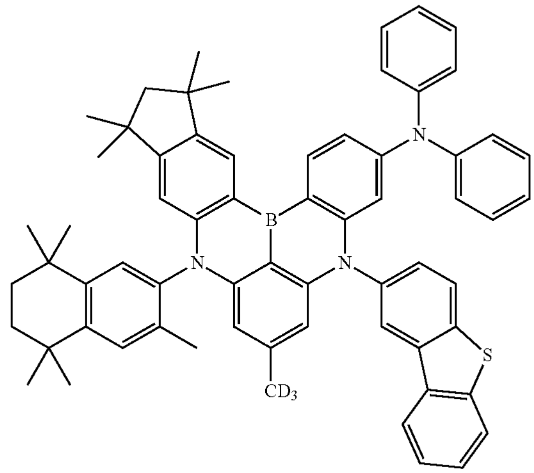
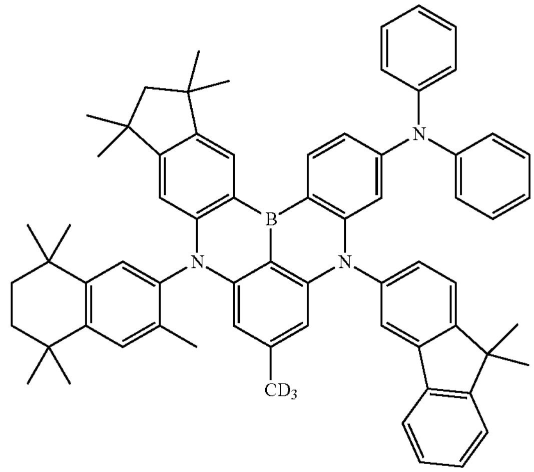
-continued
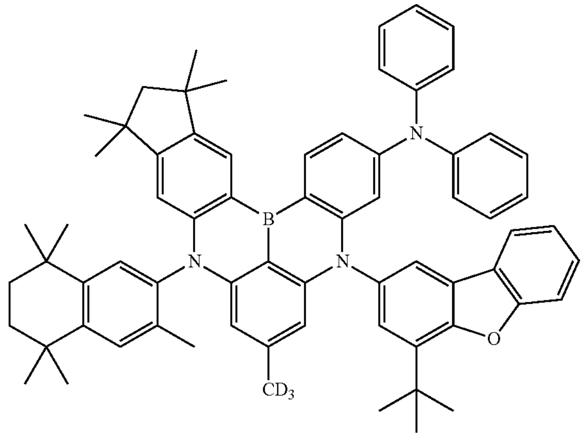
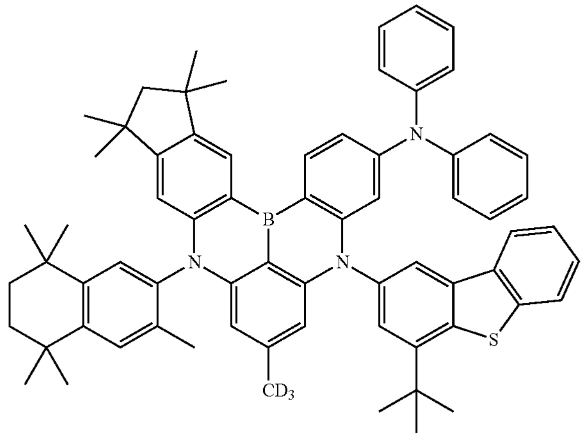
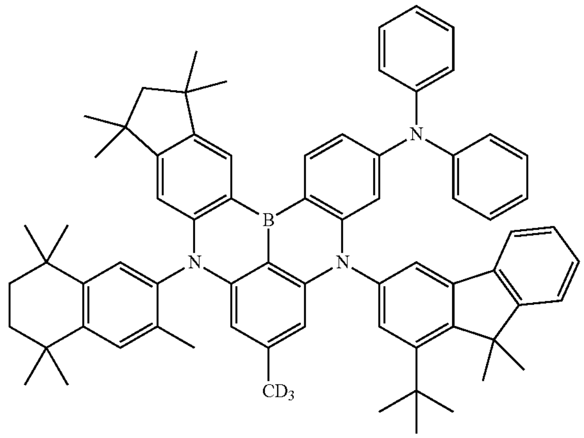

-continued
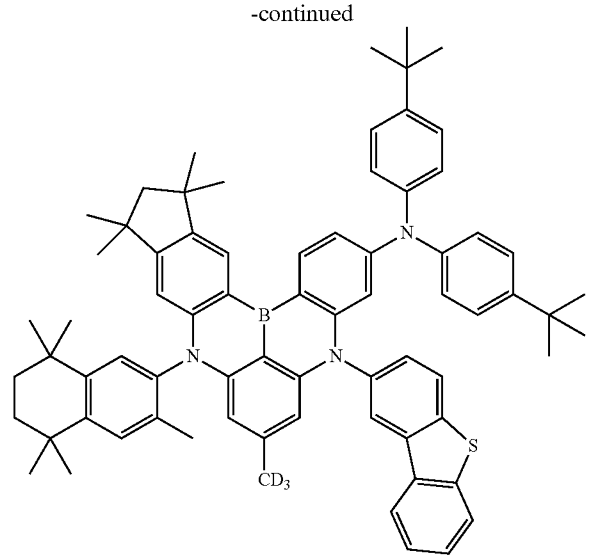
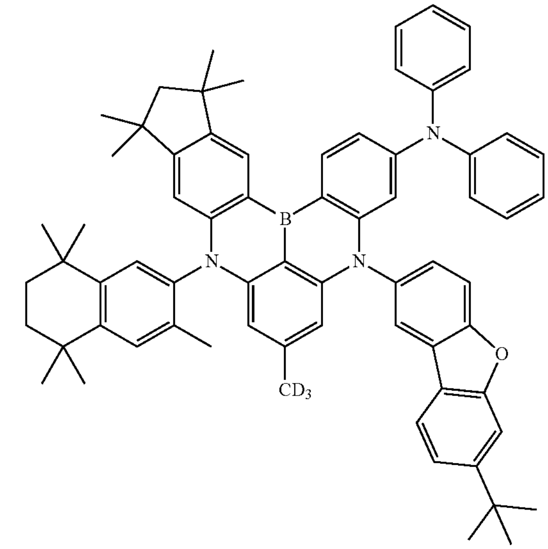
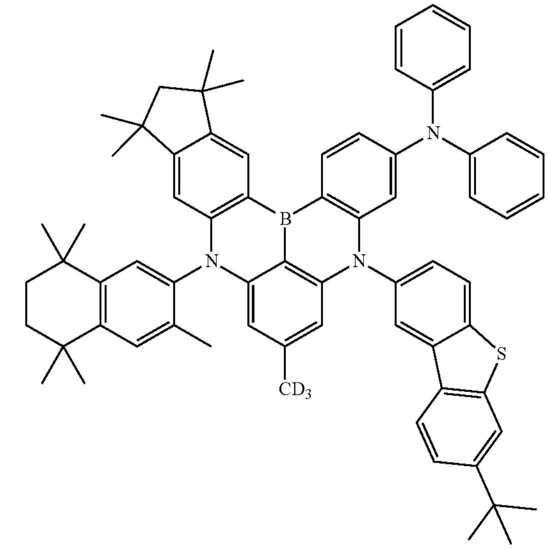
-continued
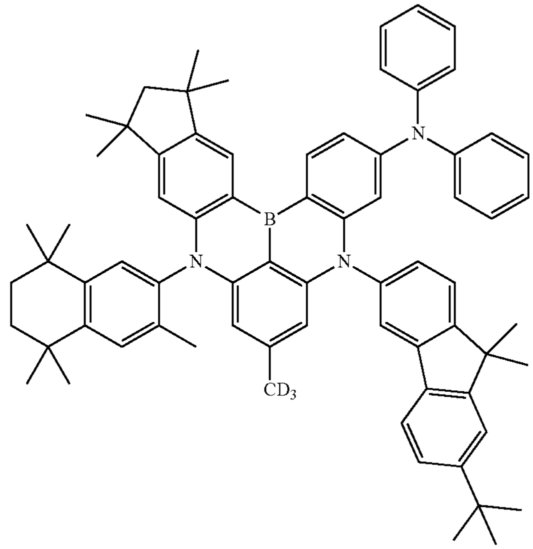
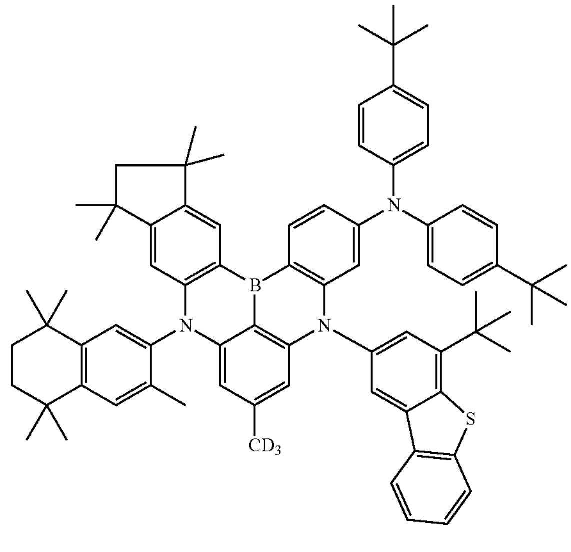
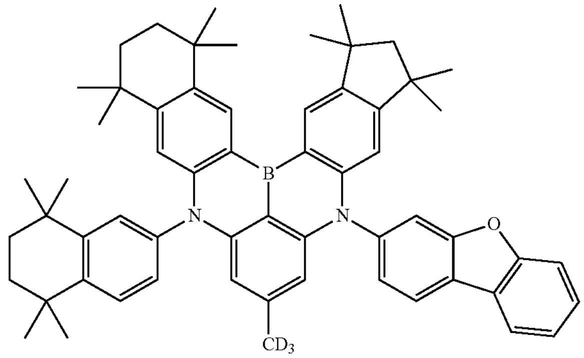

-continued
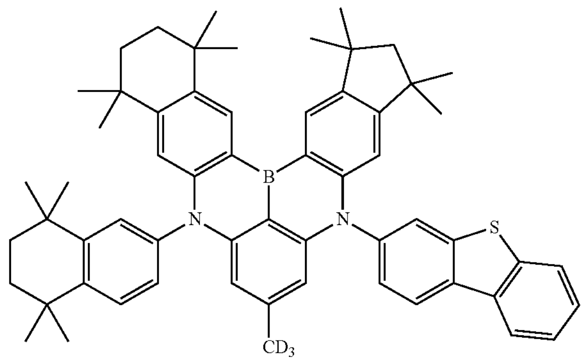
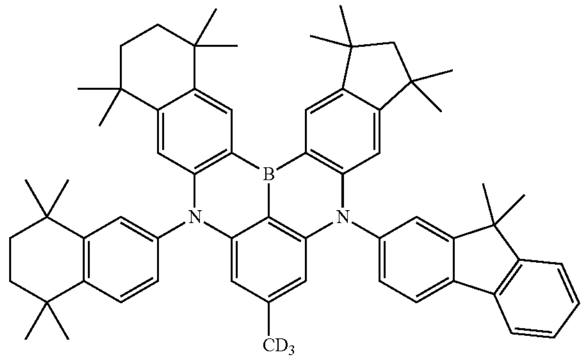
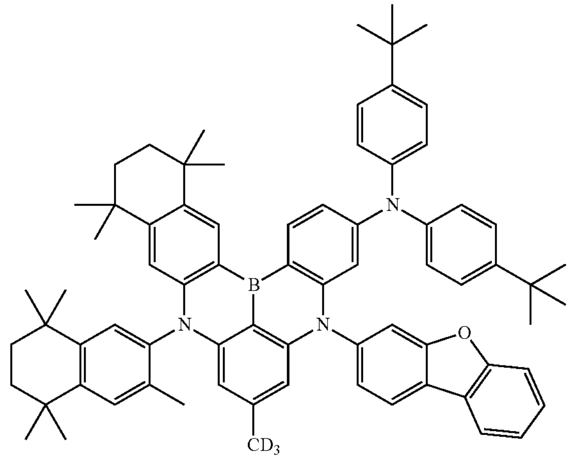
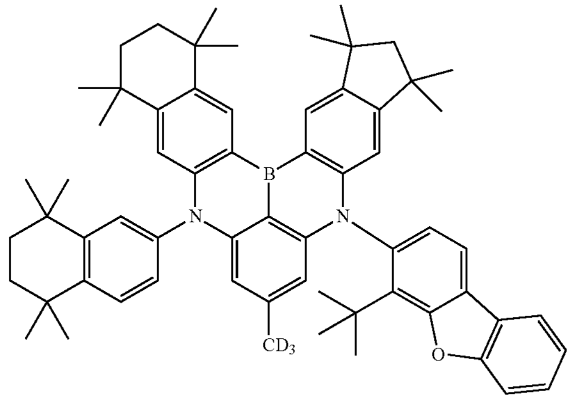
-continued
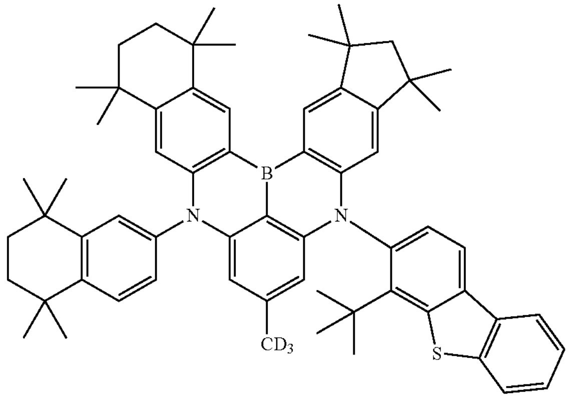
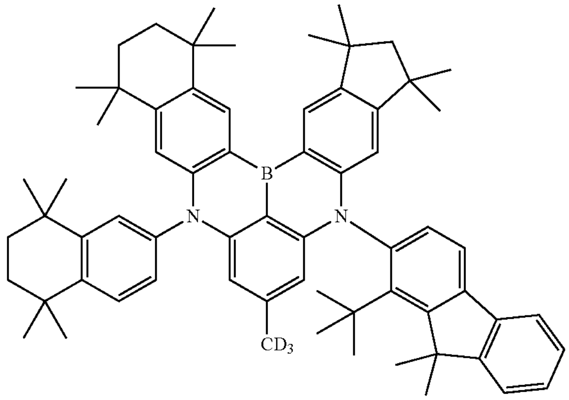
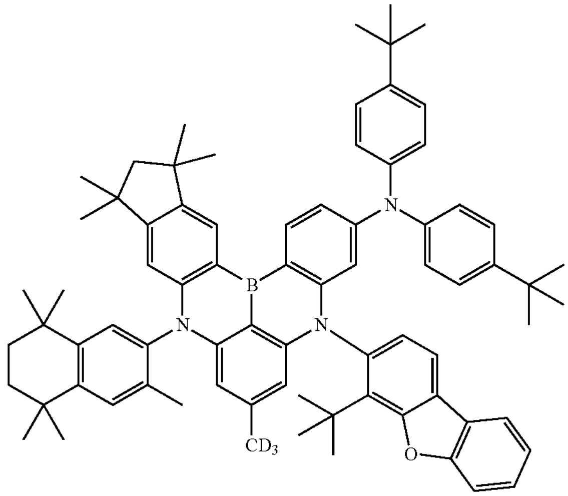
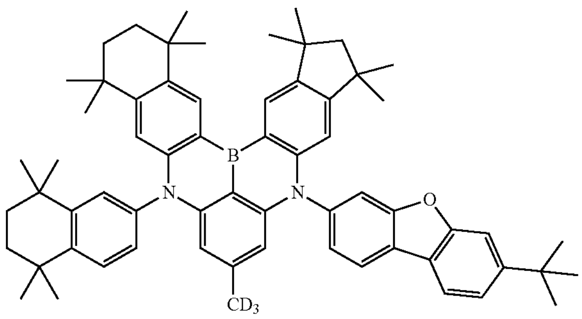

-continued
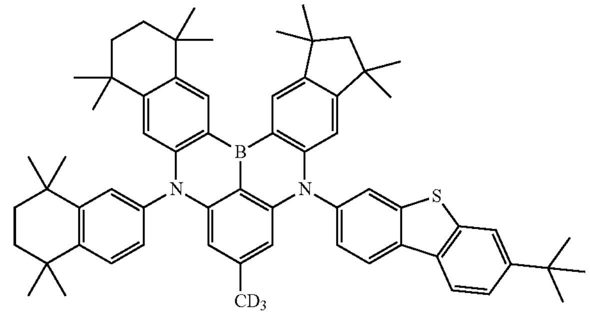
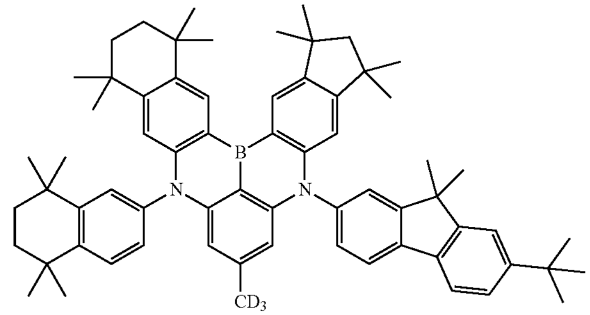
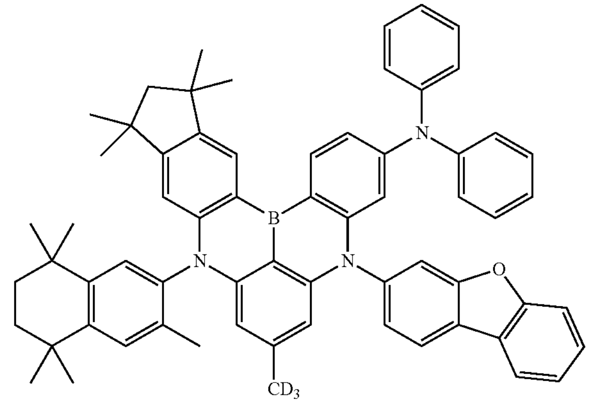
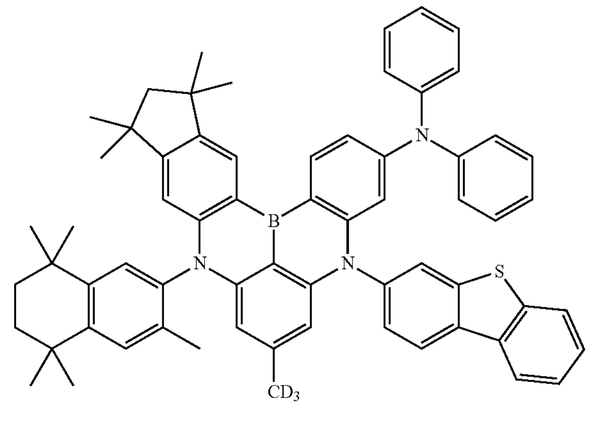
-continued
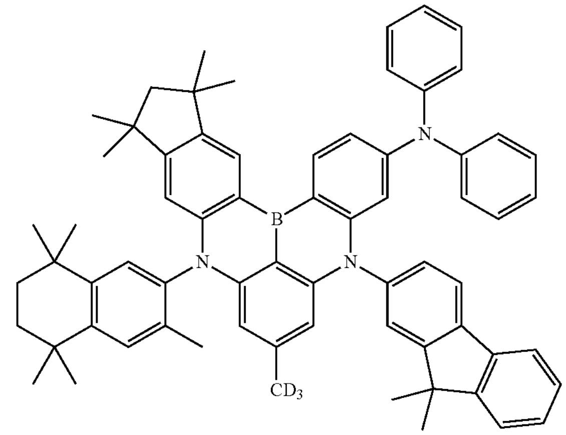
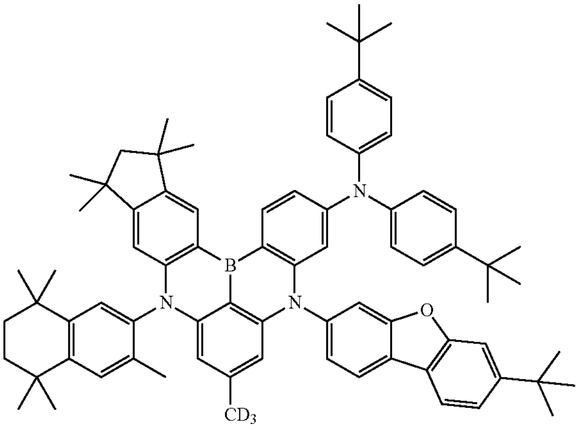
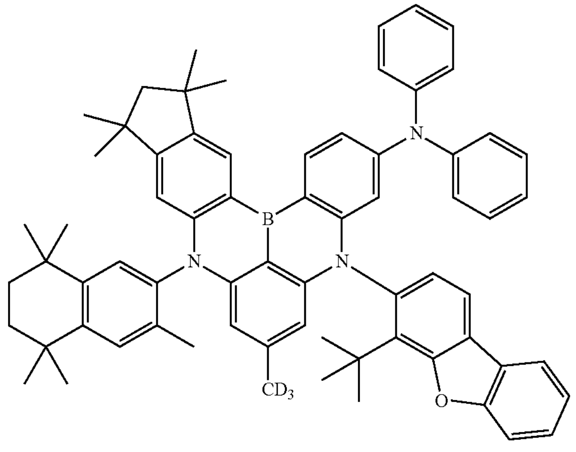

-continued
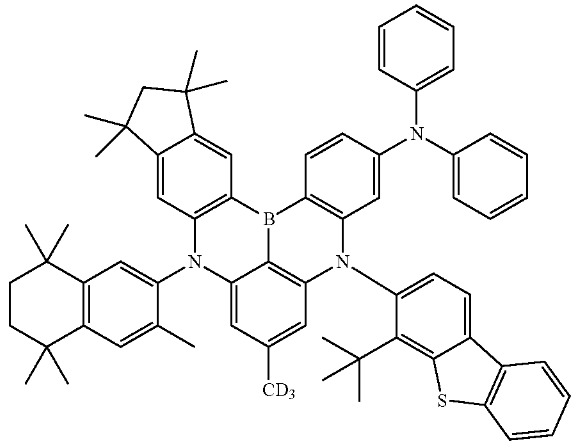
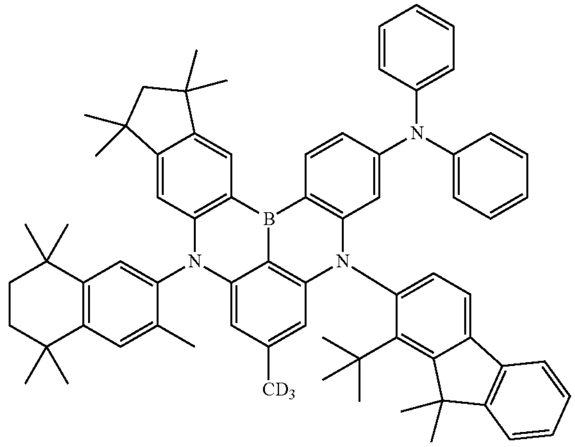
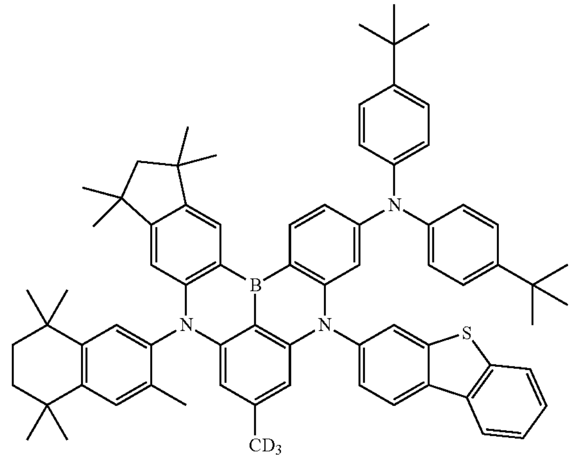
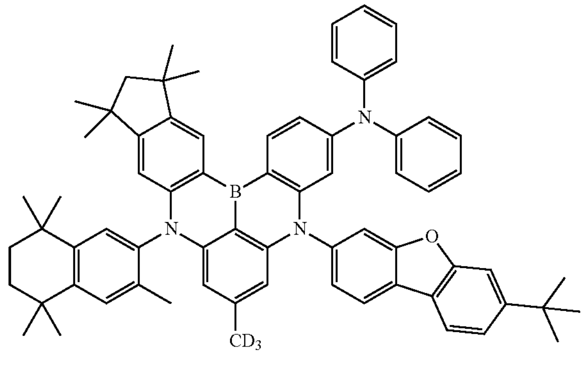
-continued
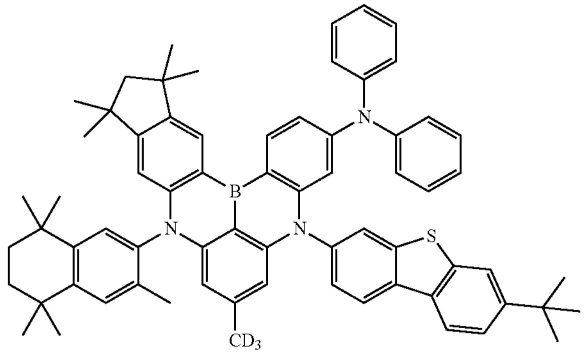
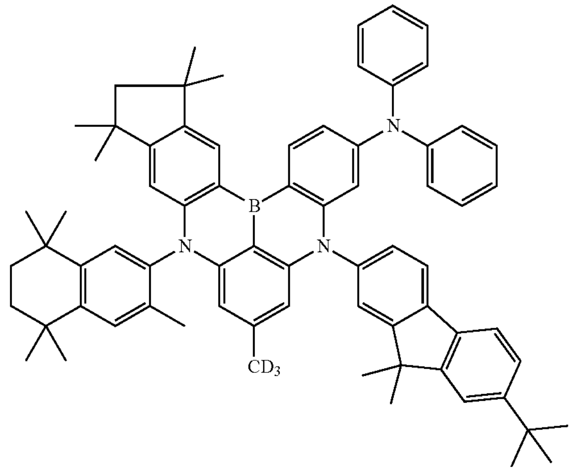
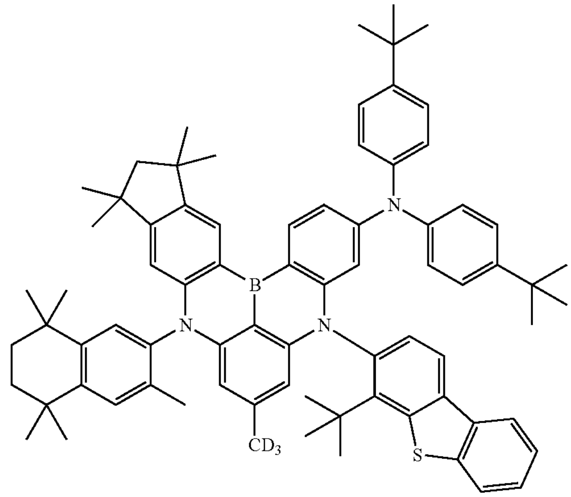

-continued
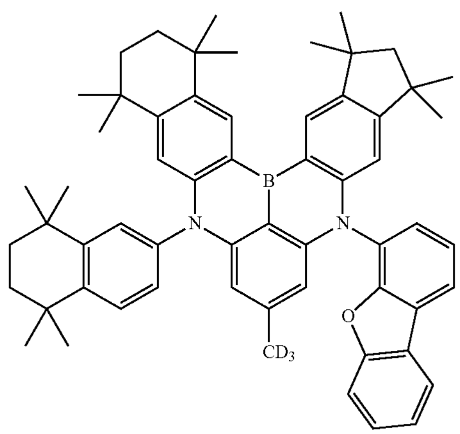
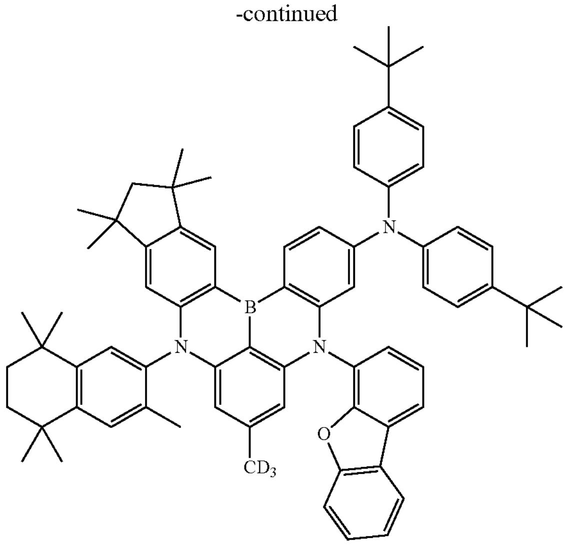
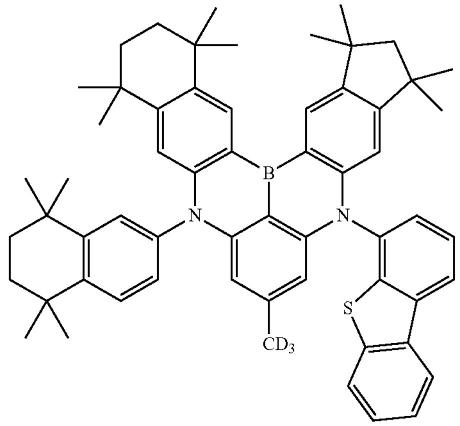
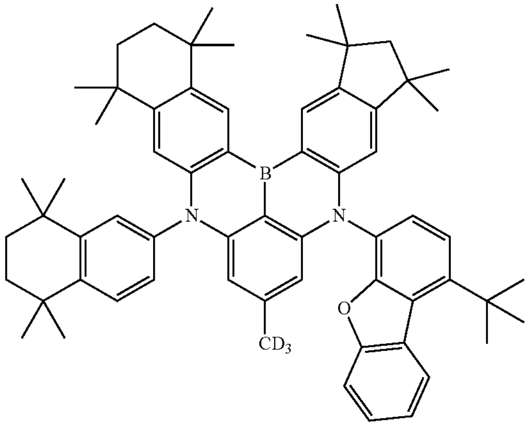
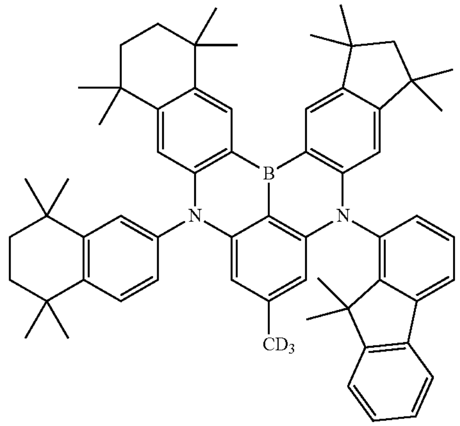
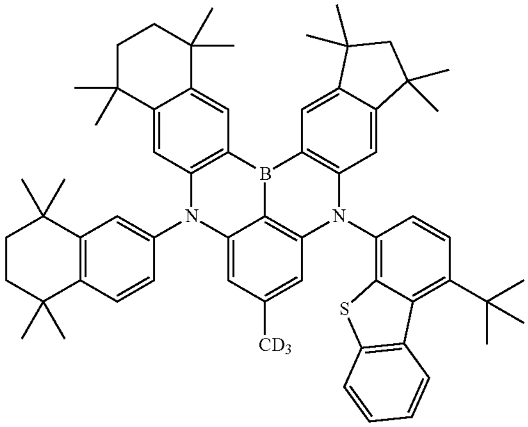

-continued
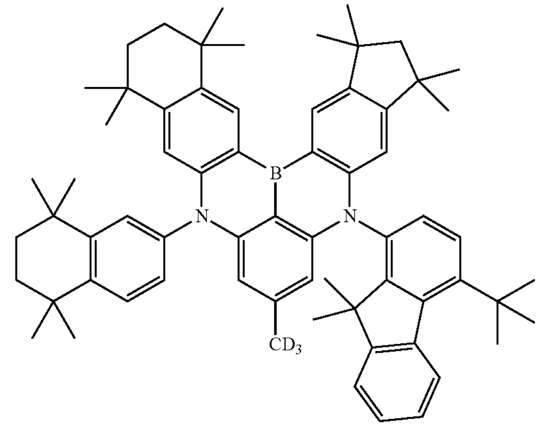
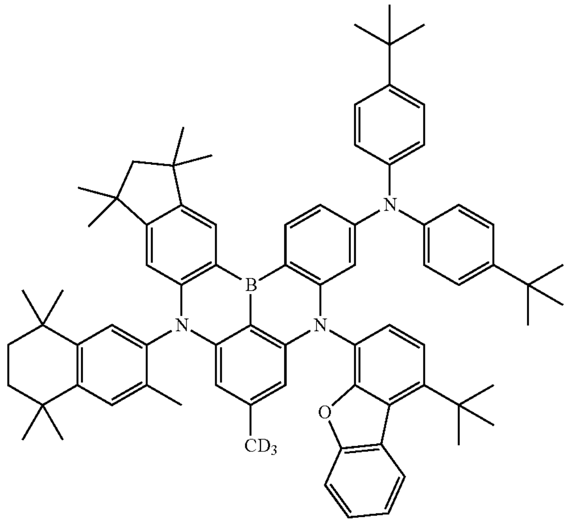
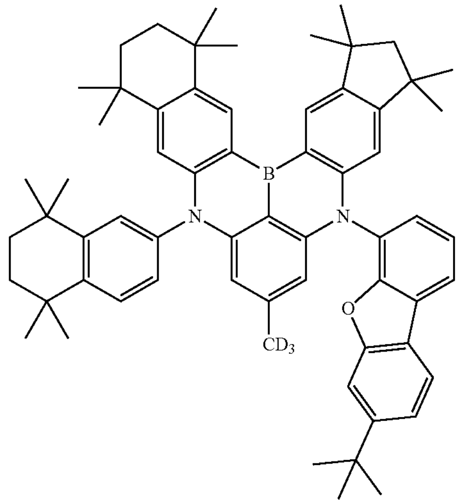
-continued
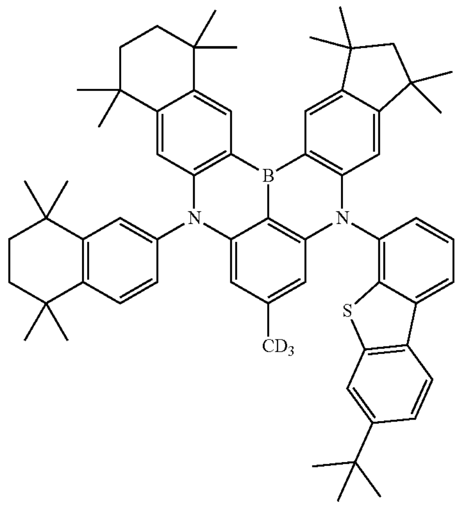
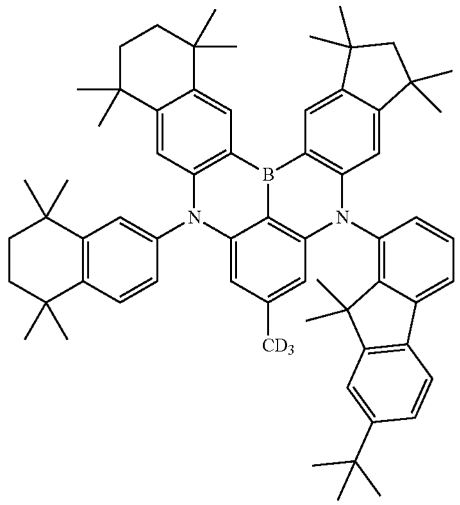
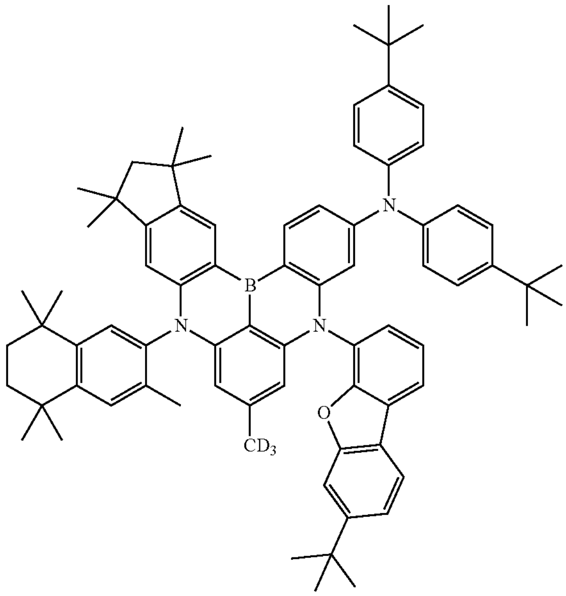

-continued
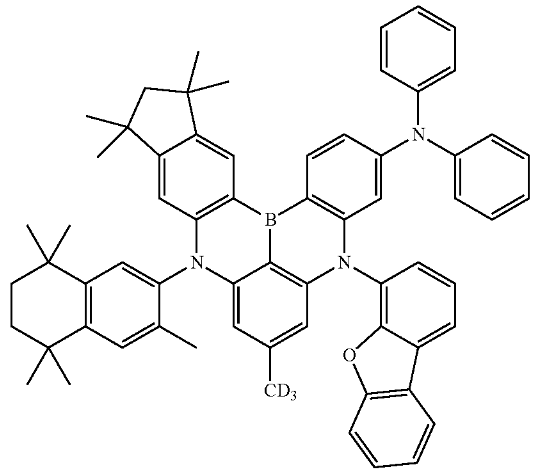
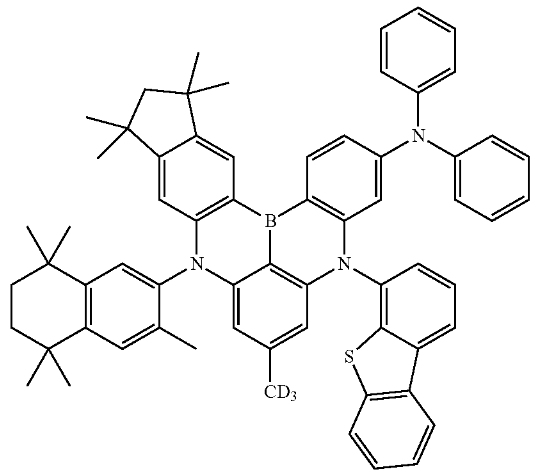
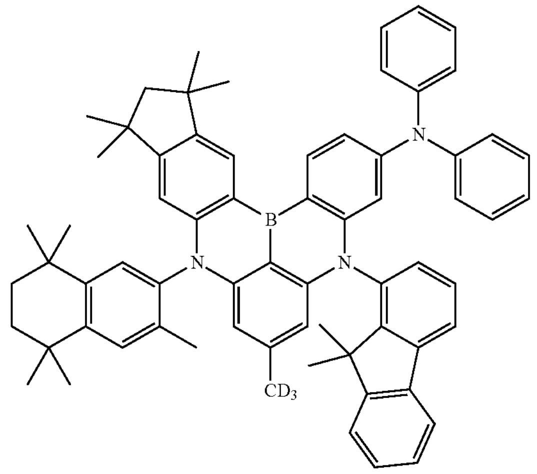
-continued
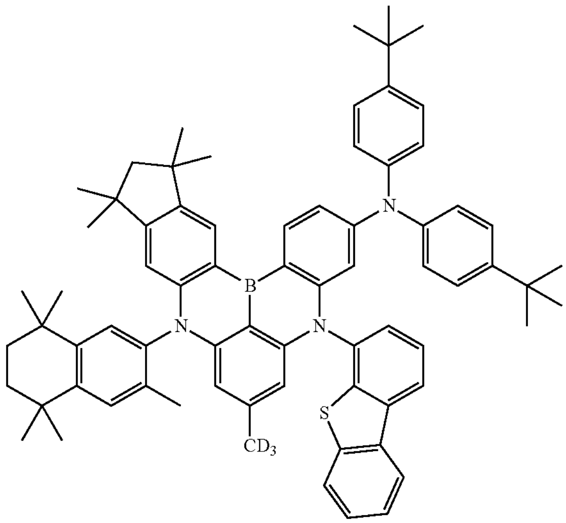
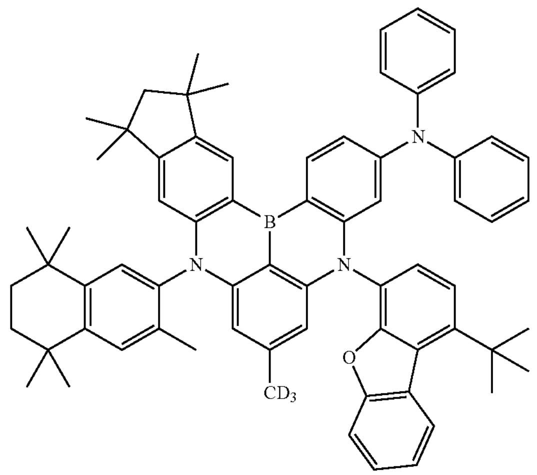
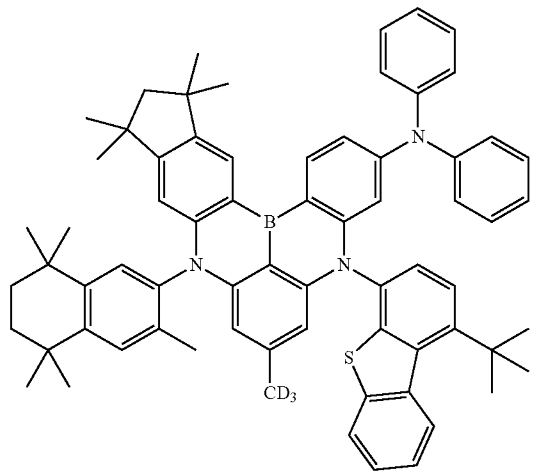

-continued
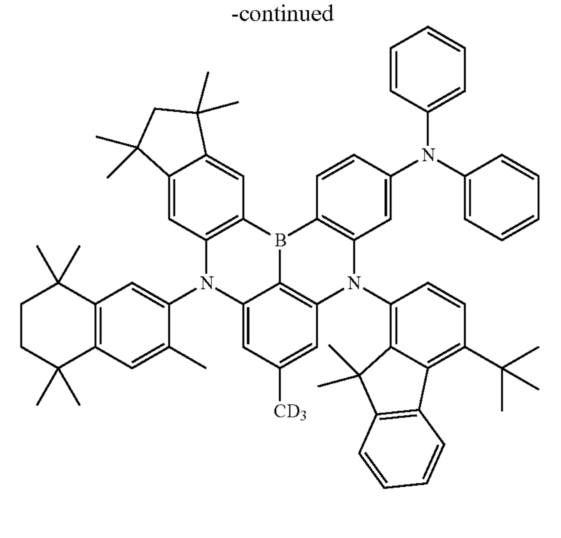
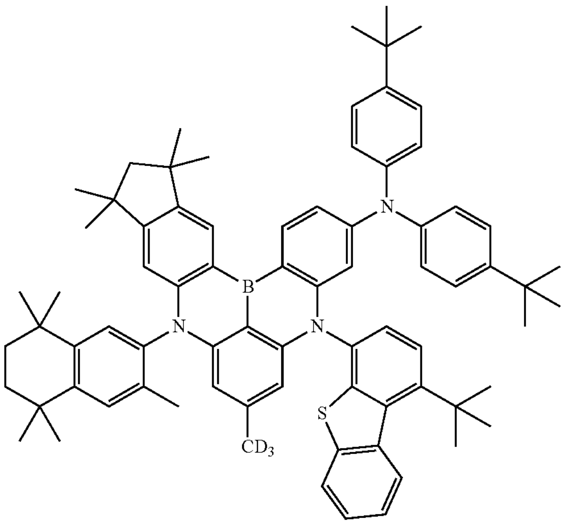
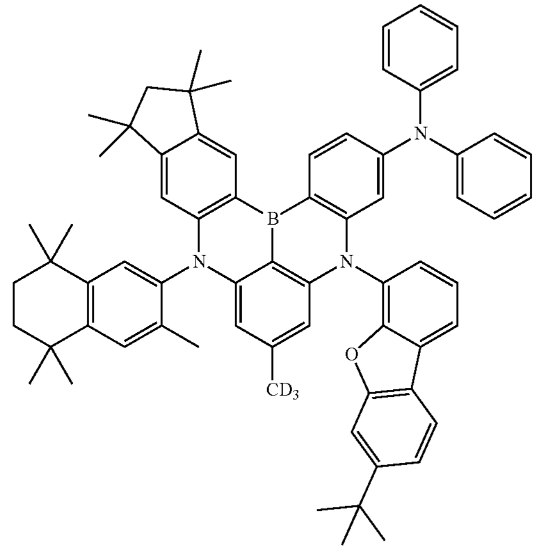
-continued
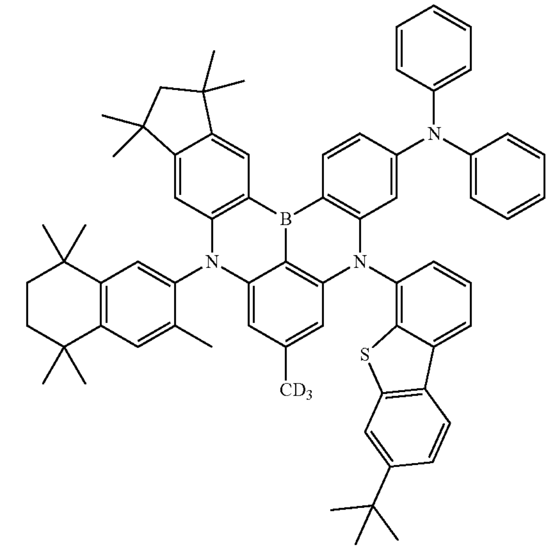
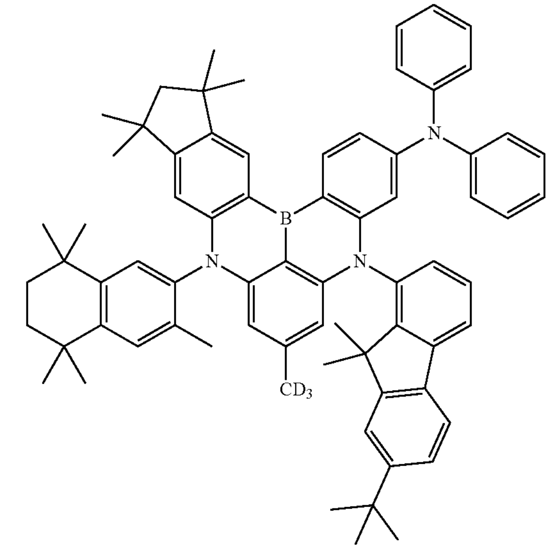
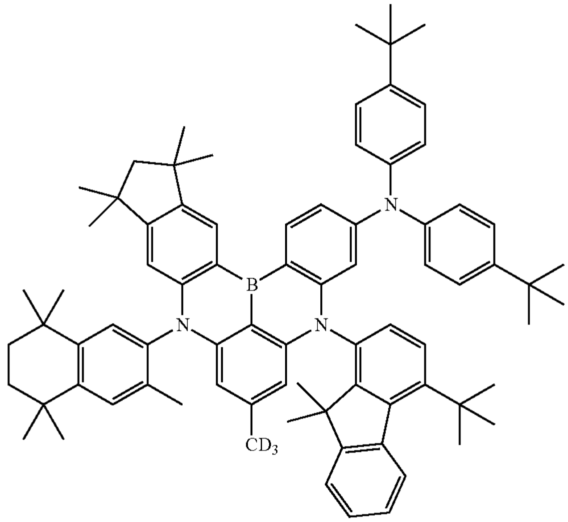

-continued
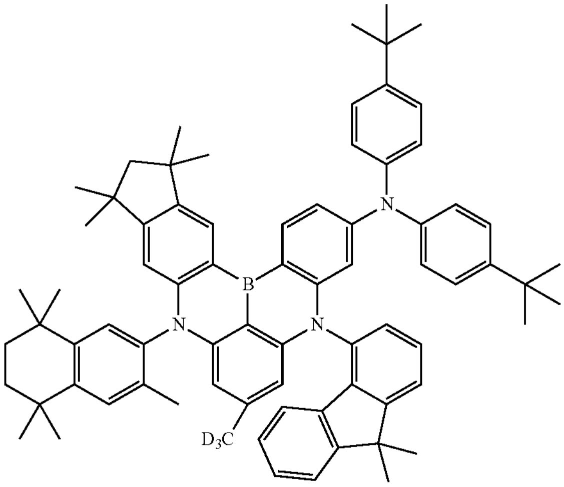
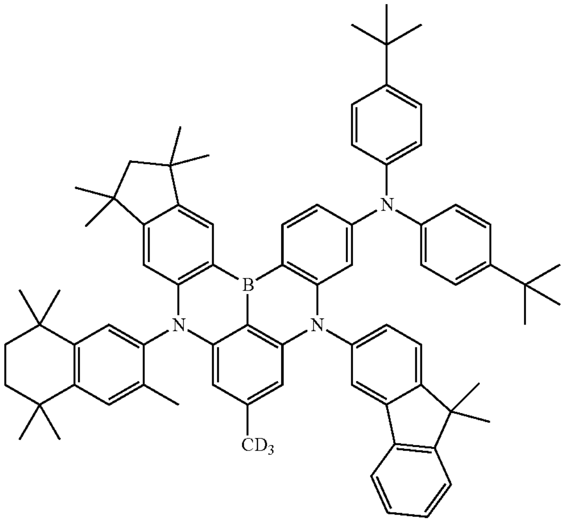
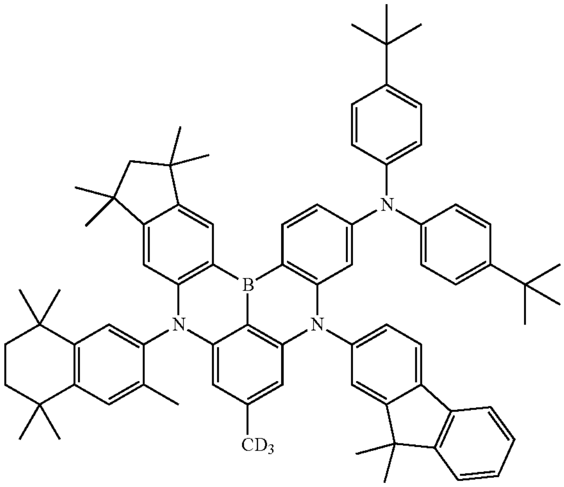
-continued
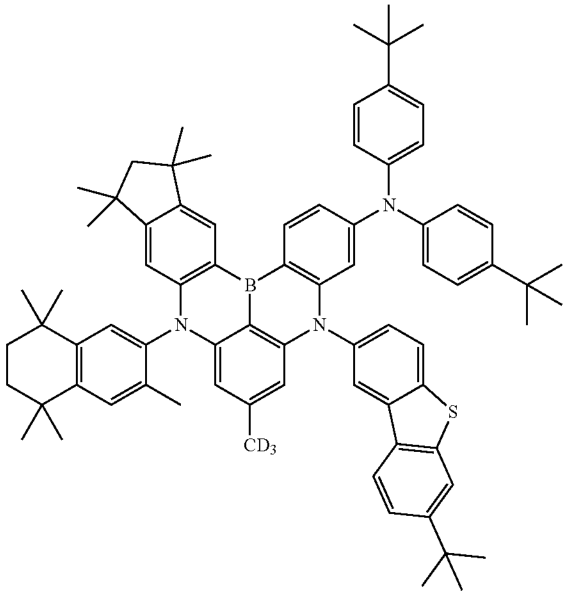
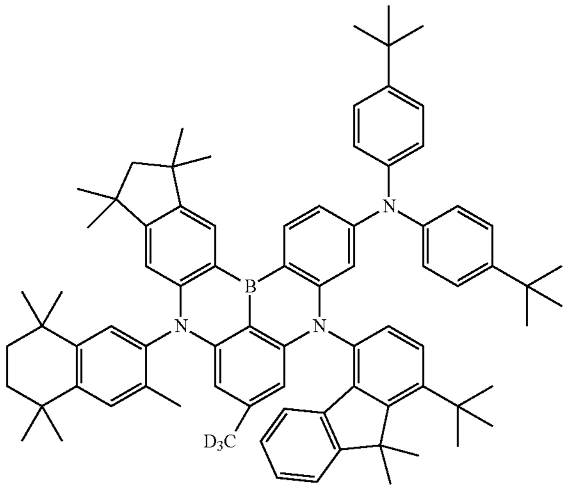
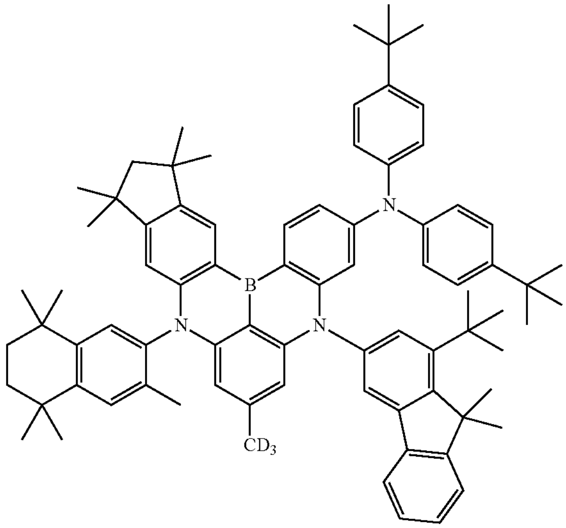

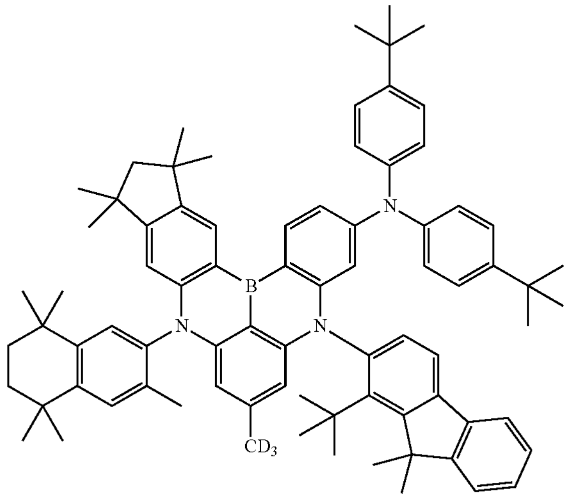
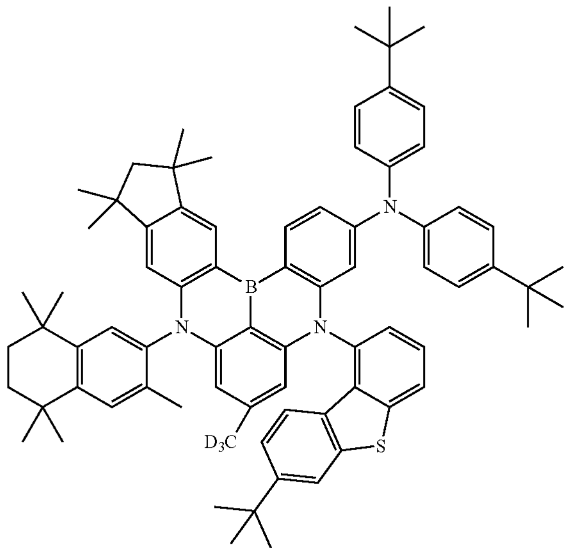
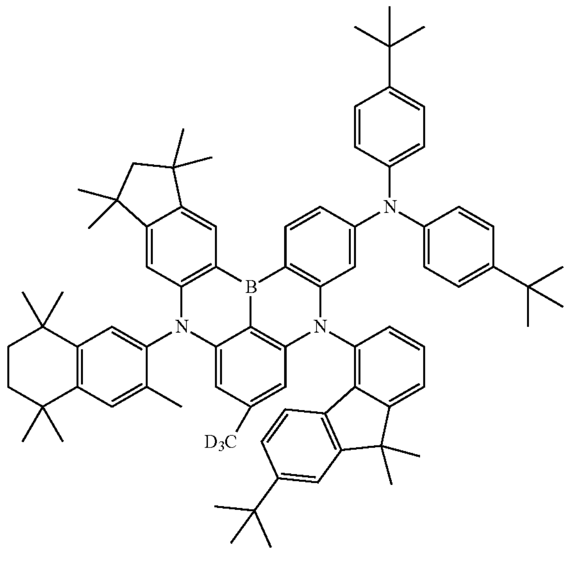
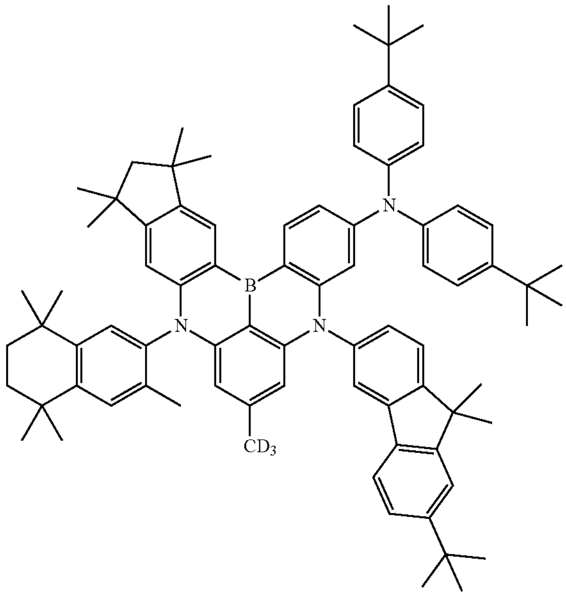
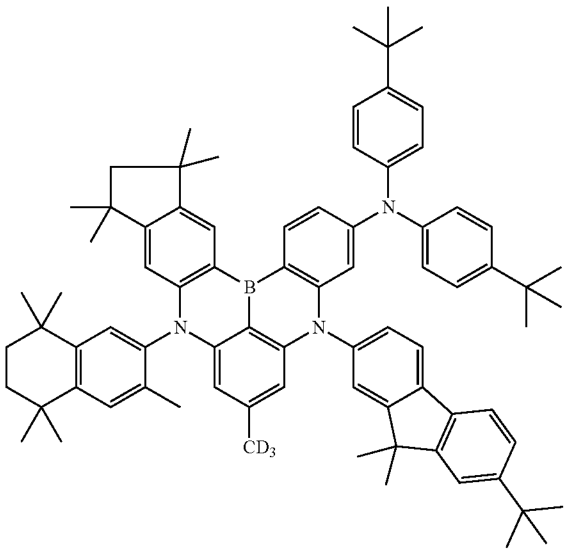
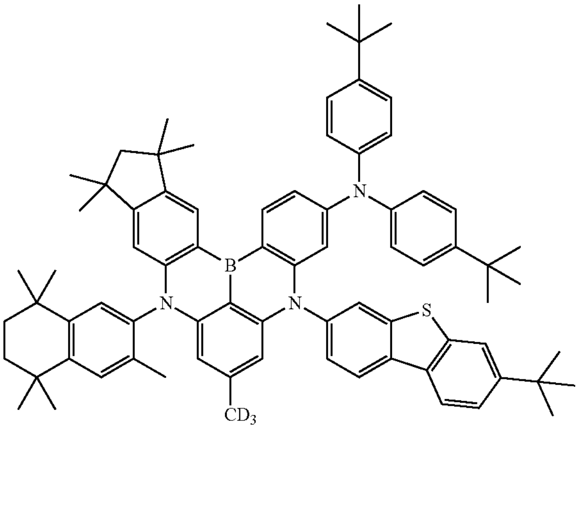

-continued
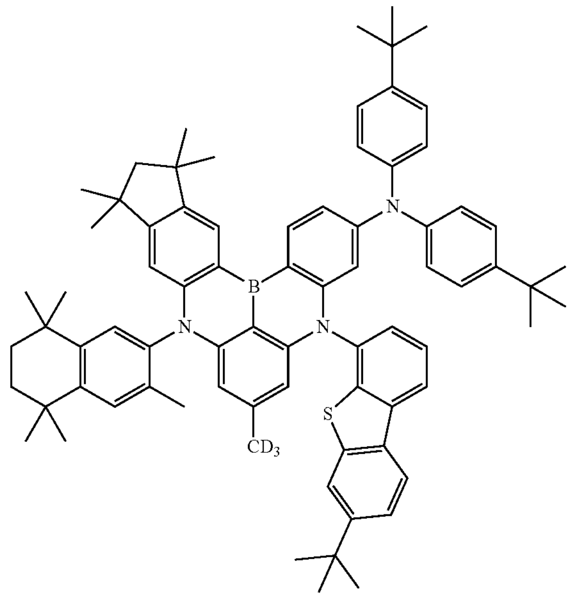
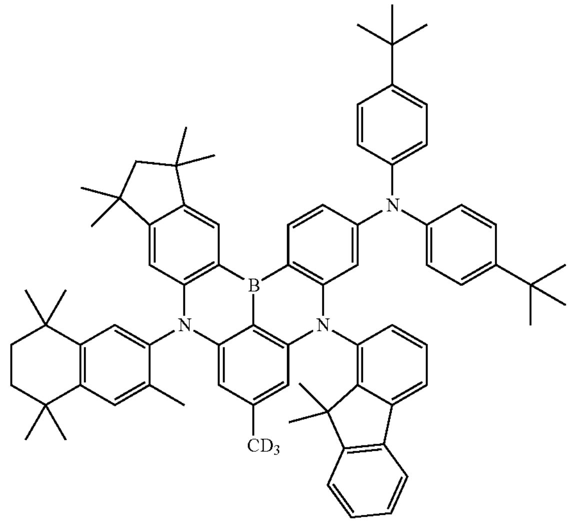
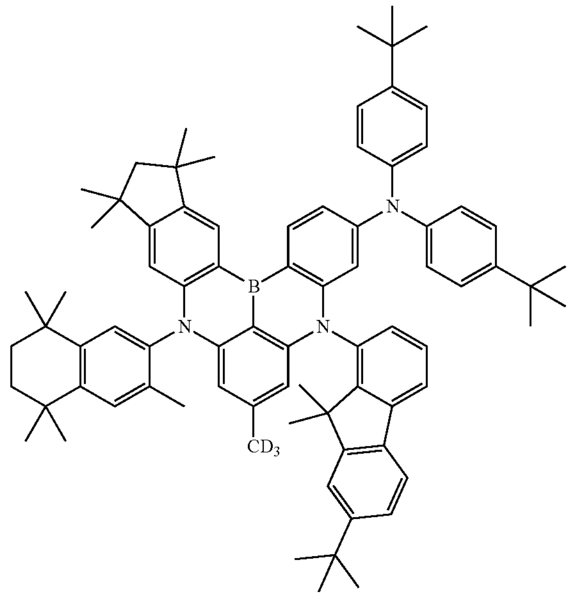
-continued
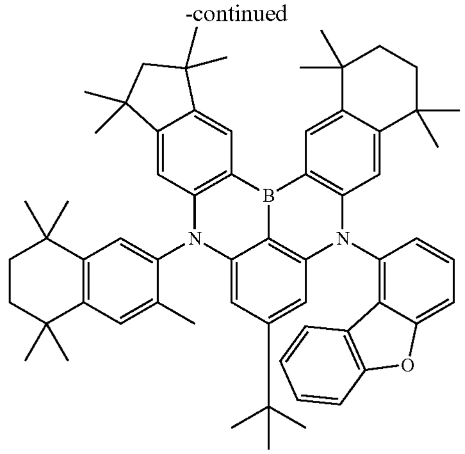
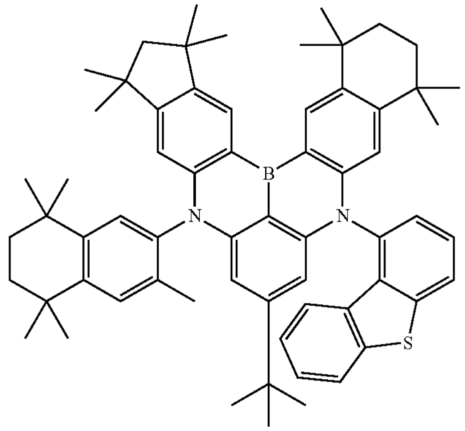
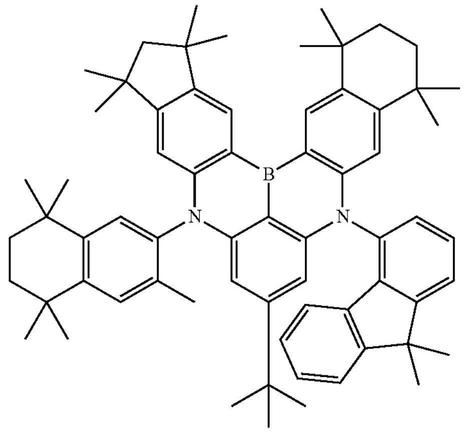
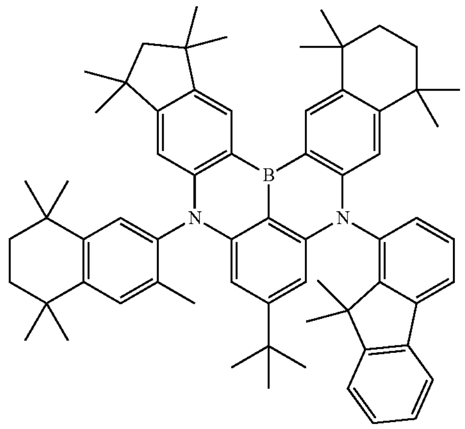

-continued
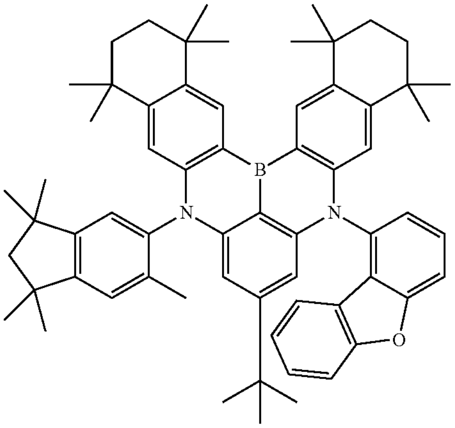
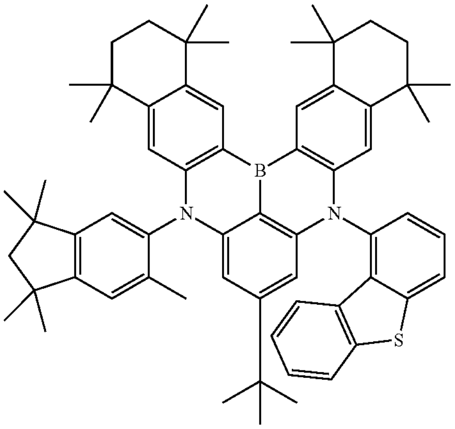
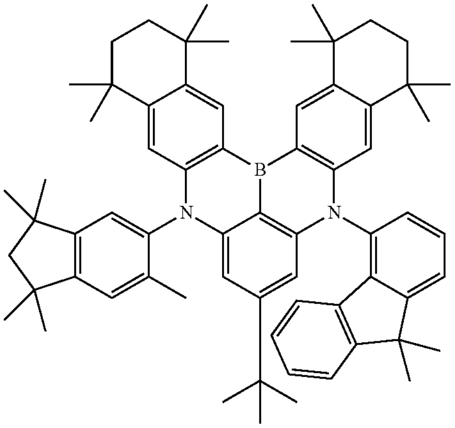
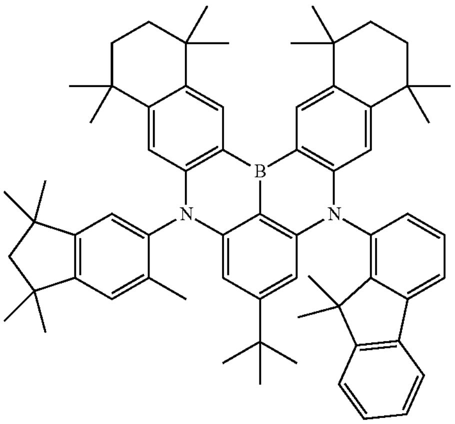
-continued
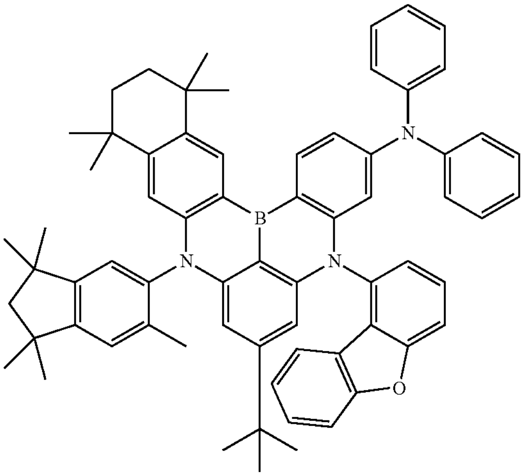
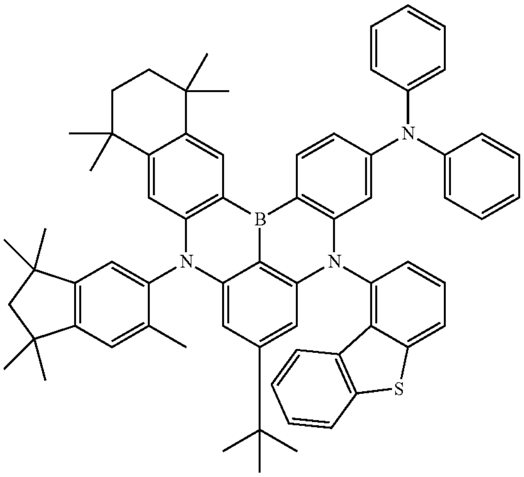
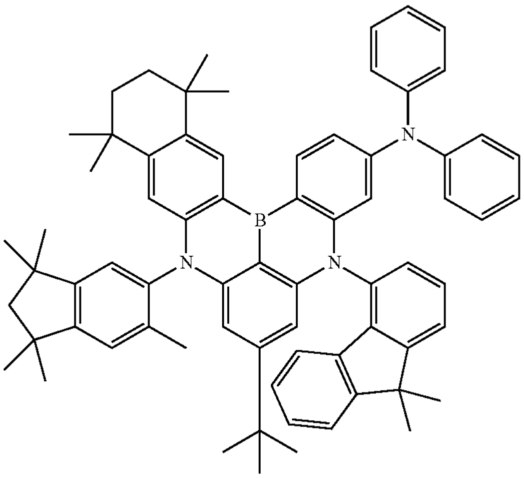

-continued
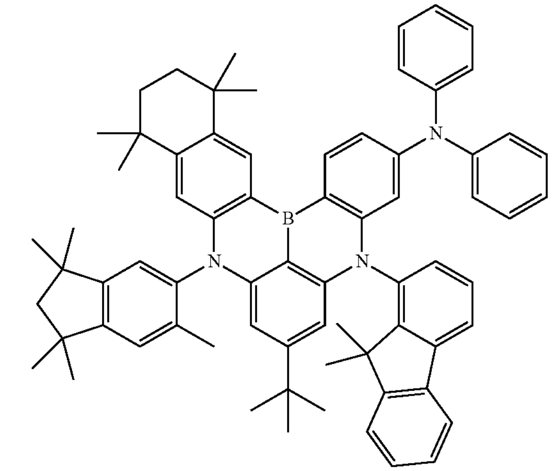
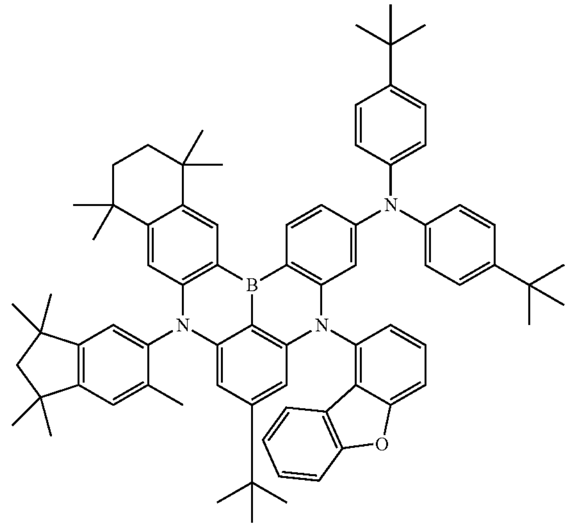
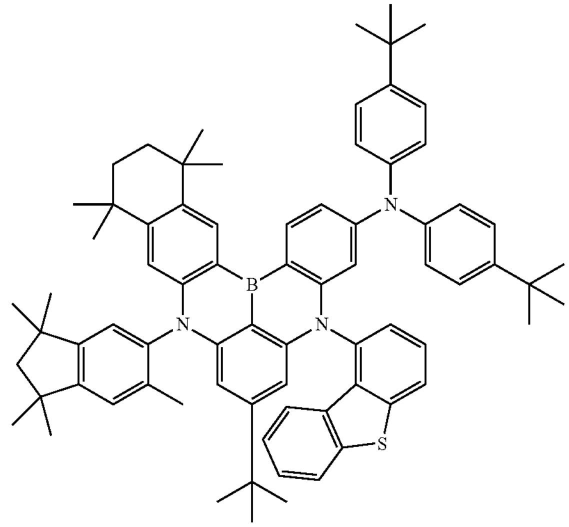
-continued
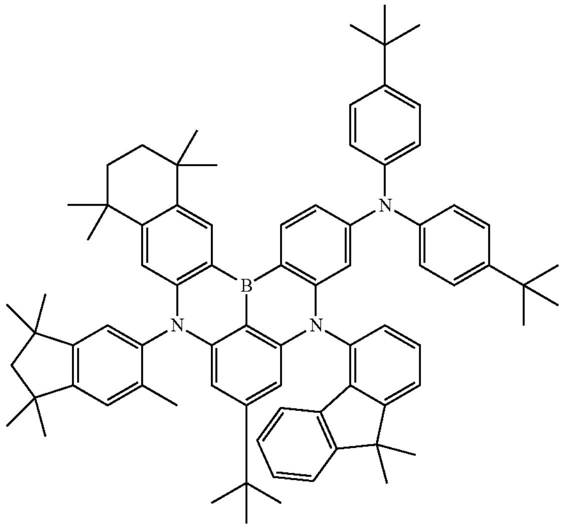
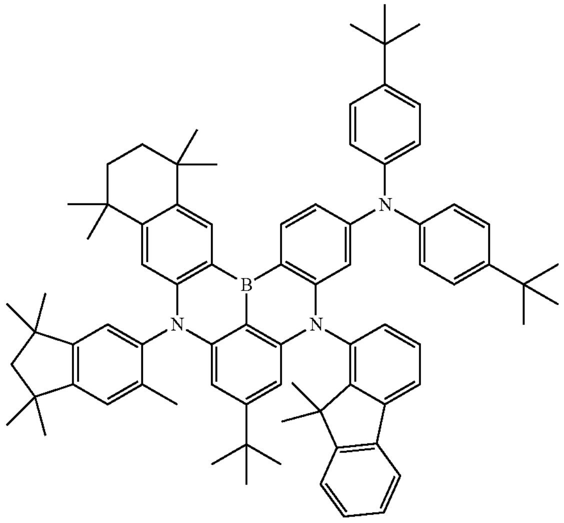
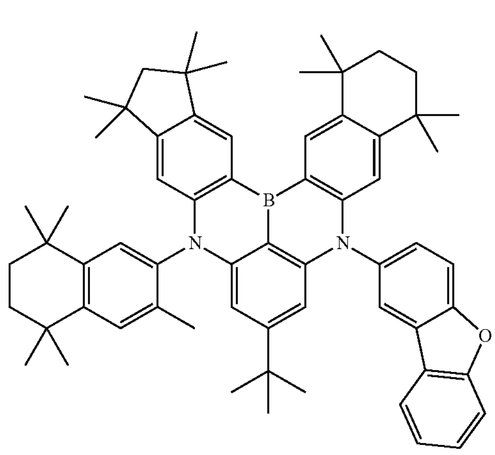

-continued
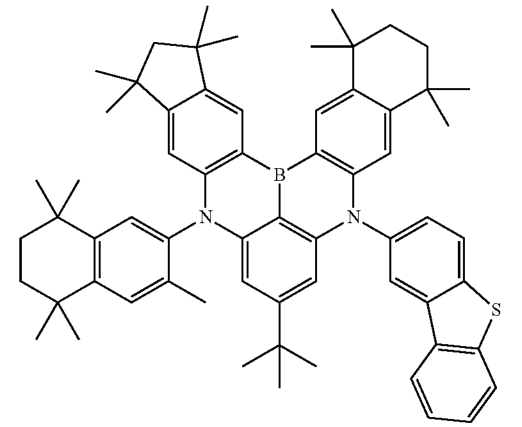
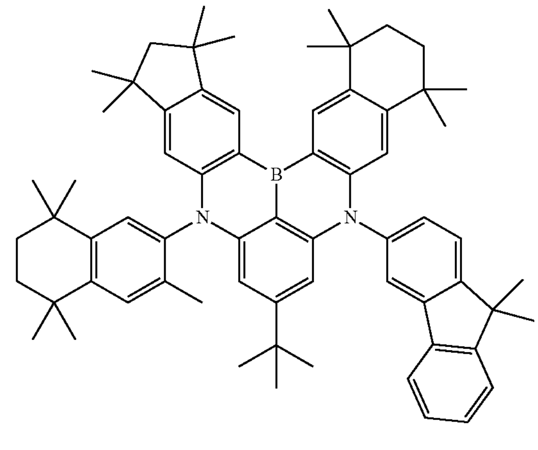
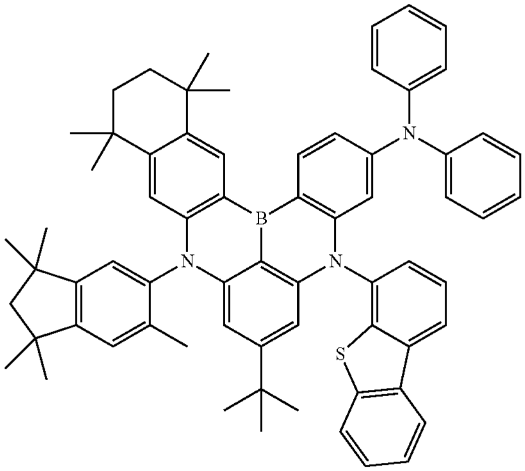
-continued
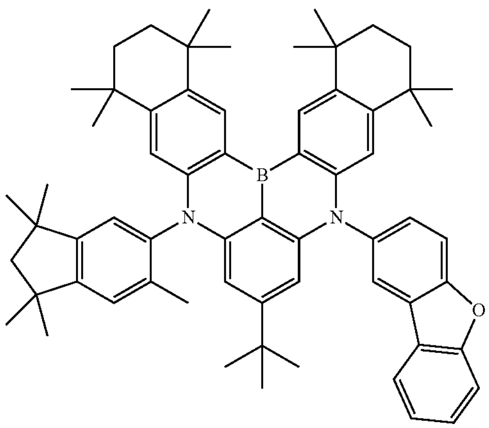
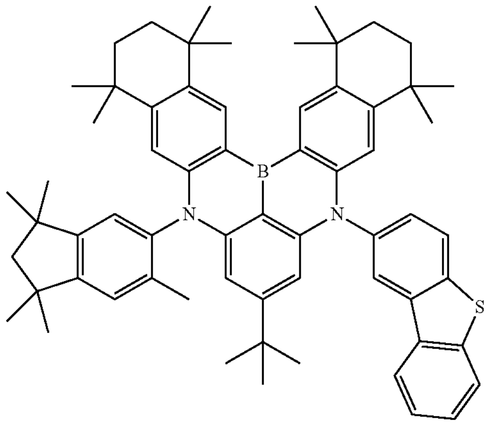
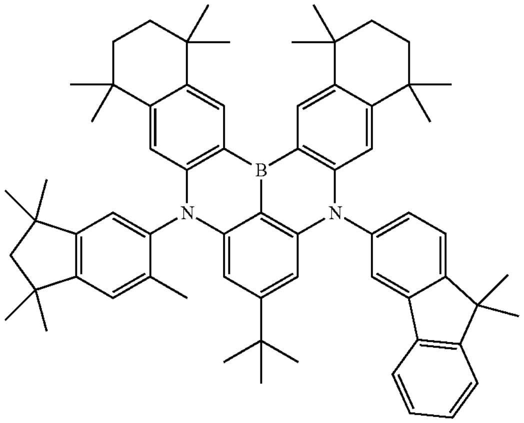

-continued
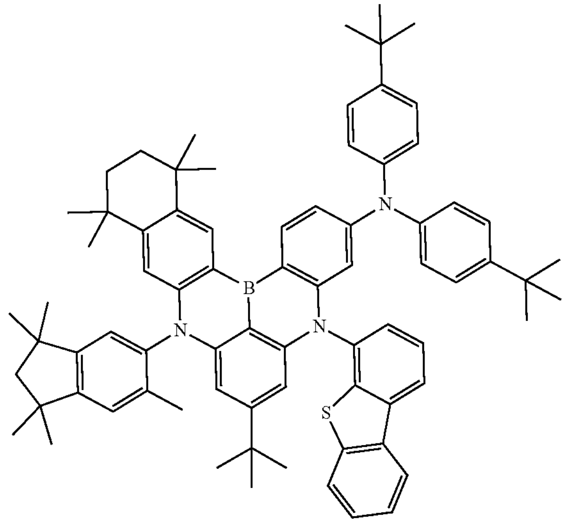
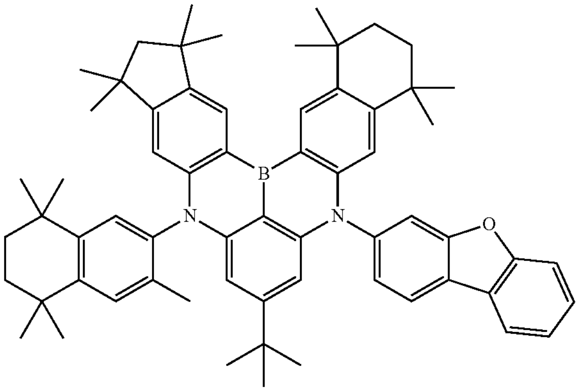
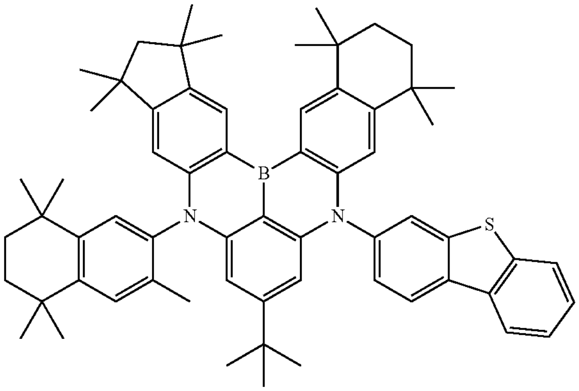
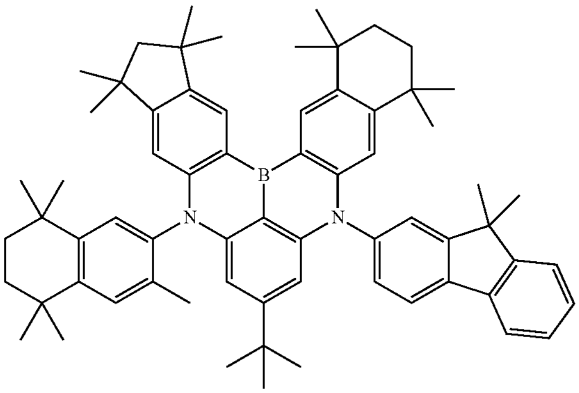
-continued
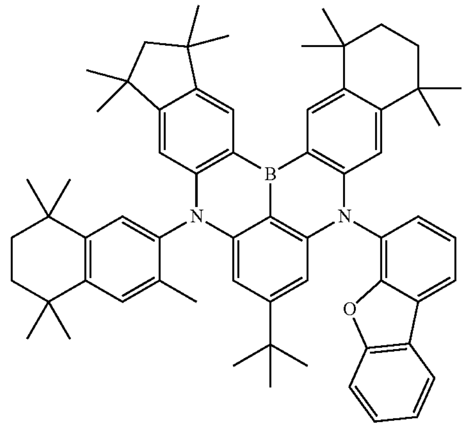
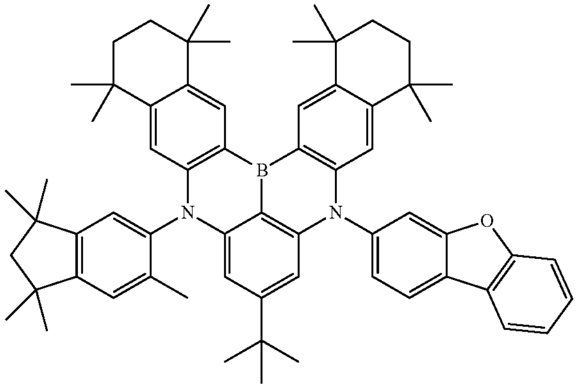
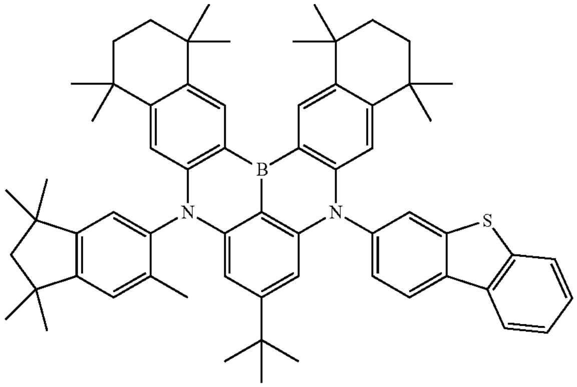
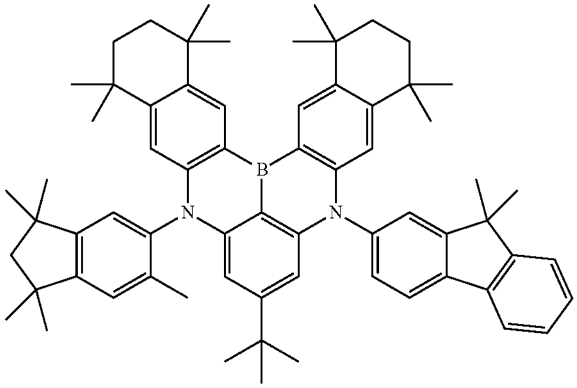

-continued
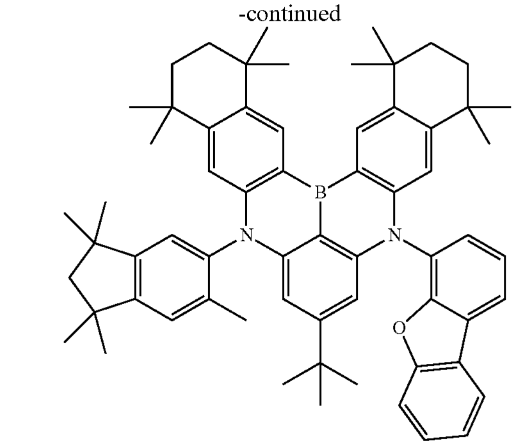
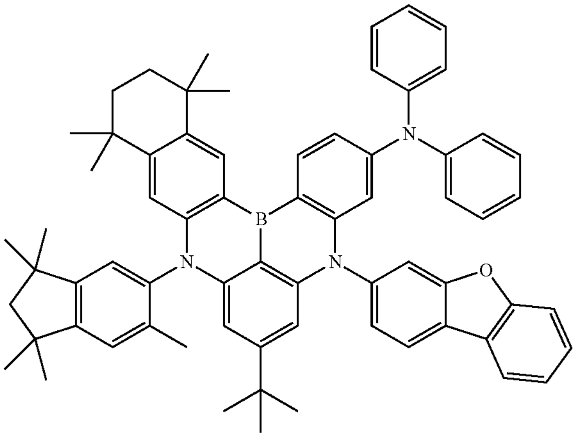
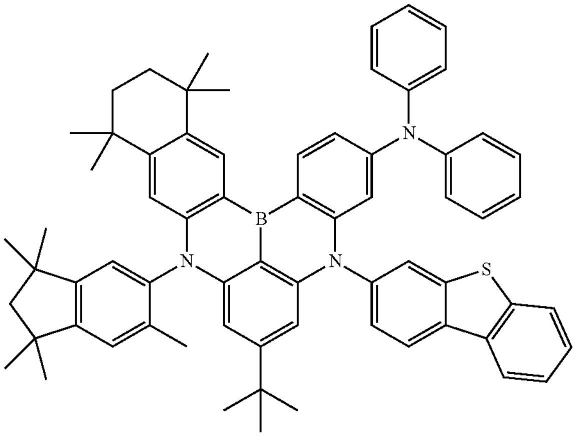
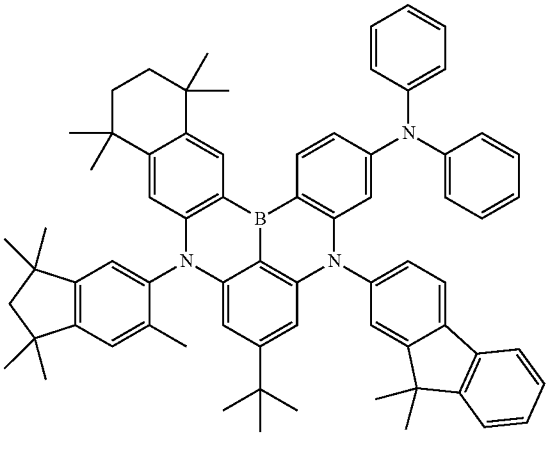
-continued
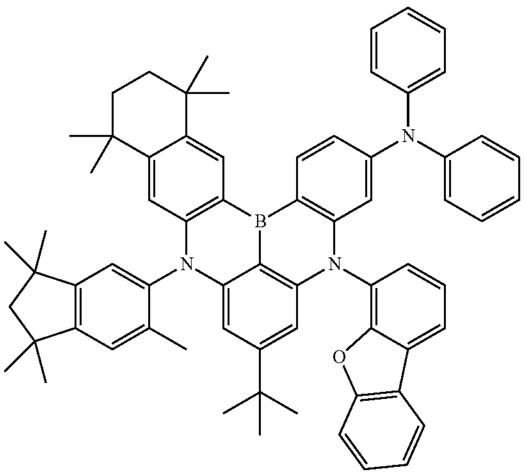
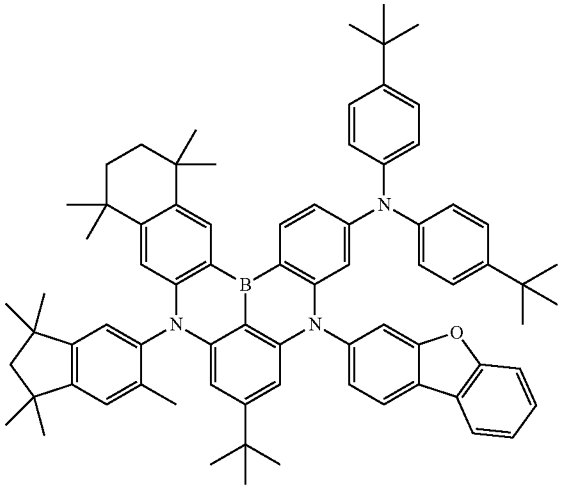
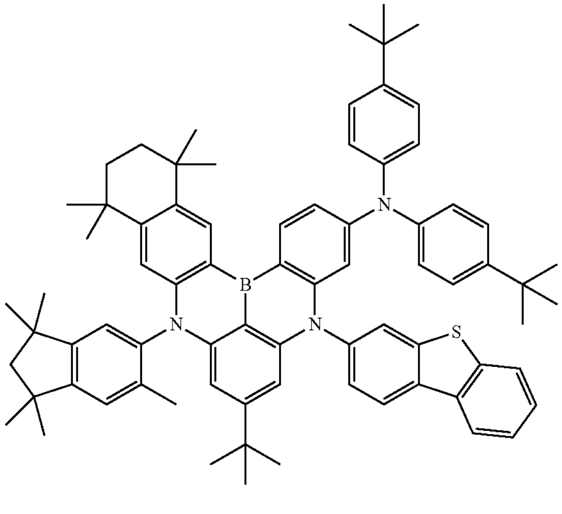

-continued
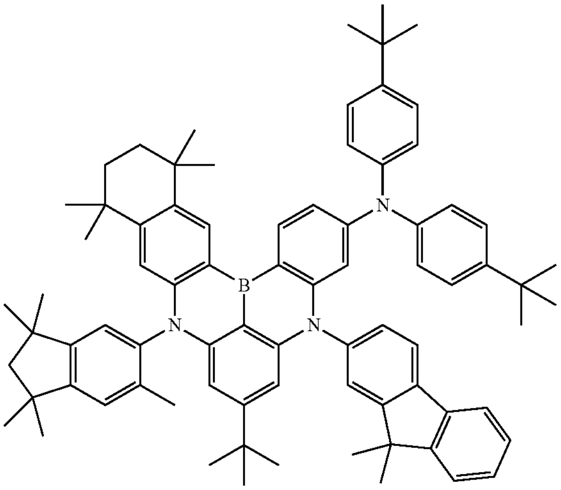
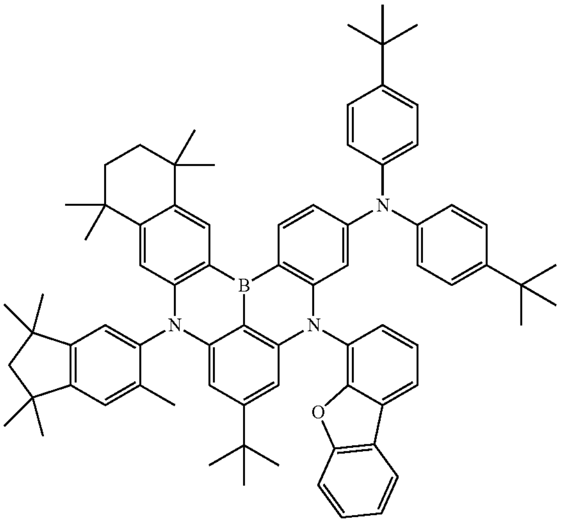
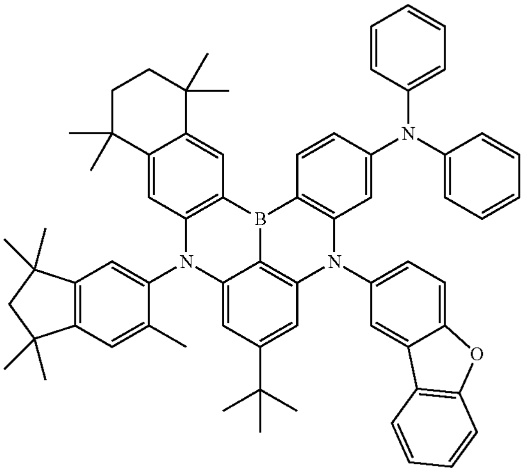
-continued
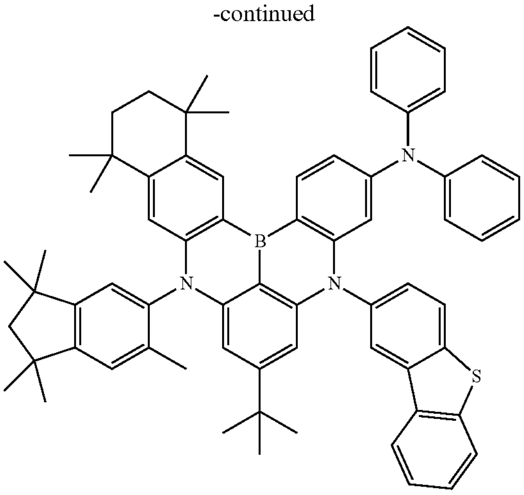
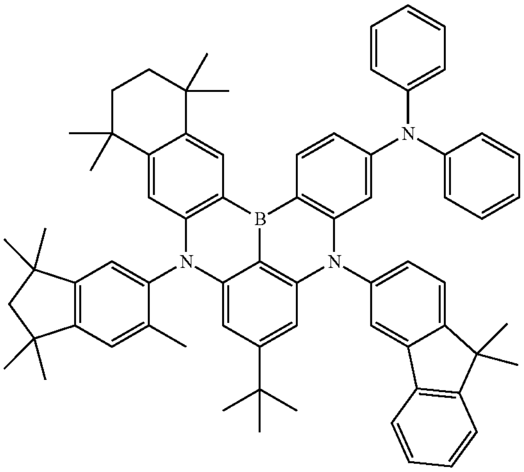
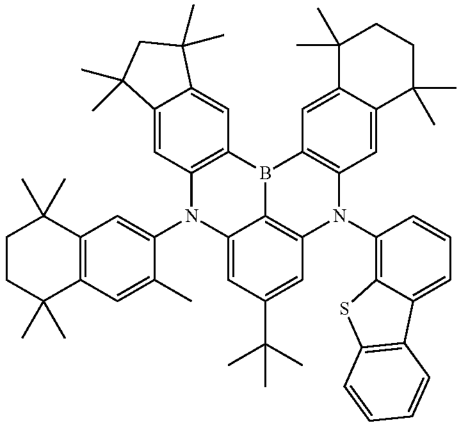

-continued
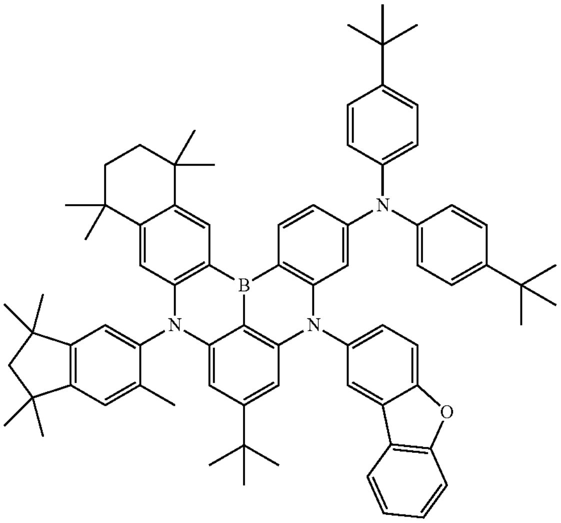
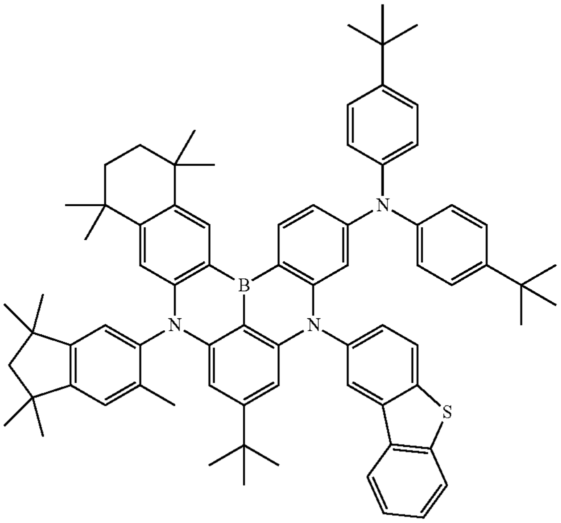
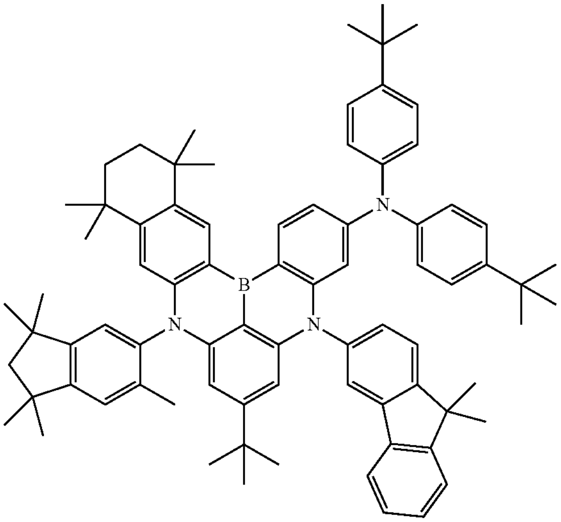
-continued
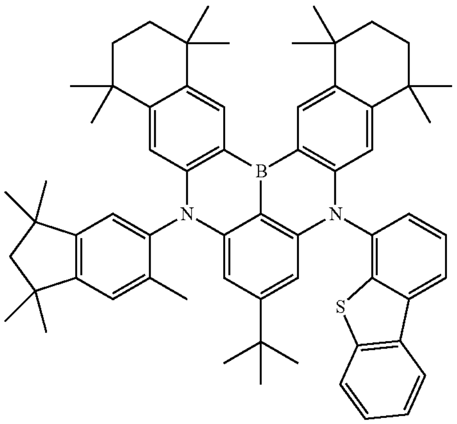
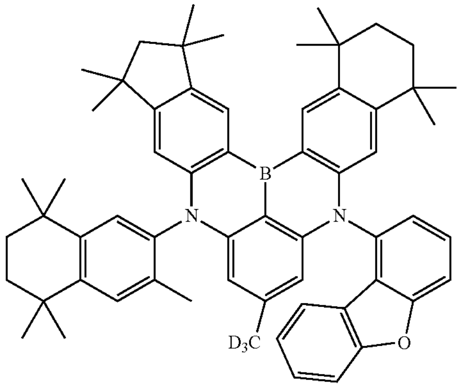
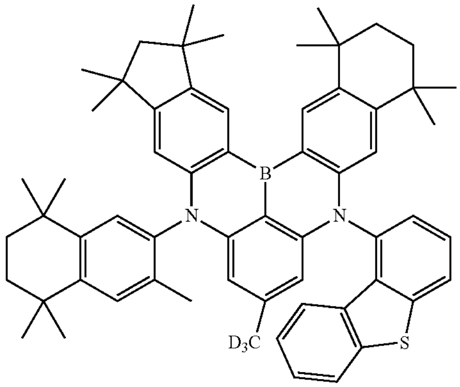
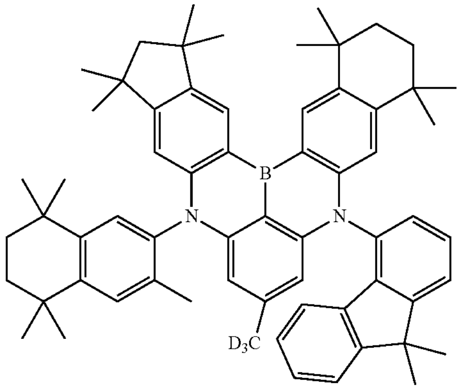

1033
-continued
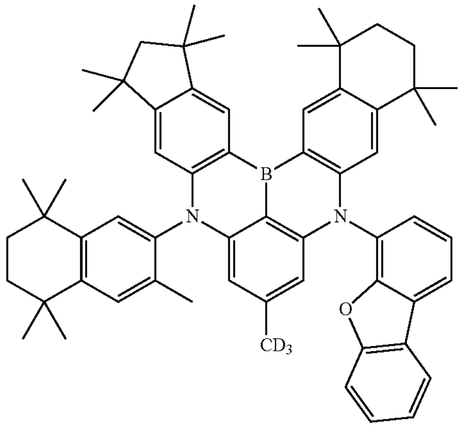
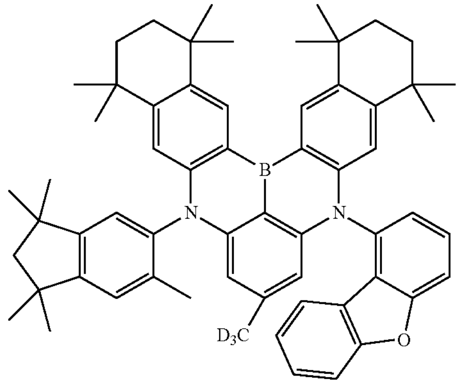
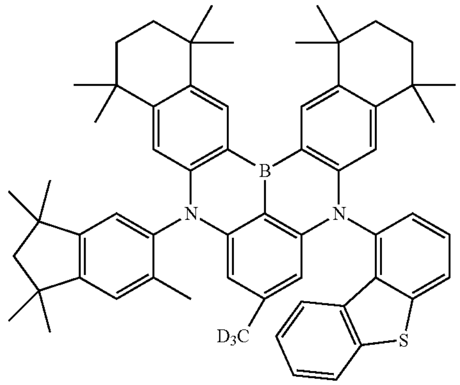
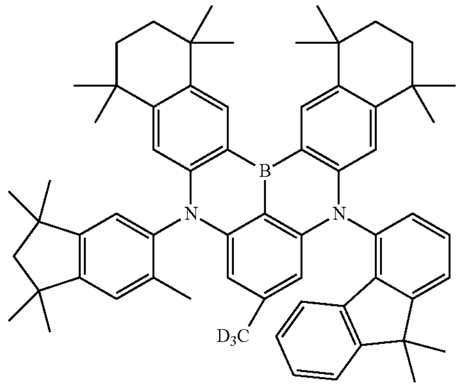
1034
-continued
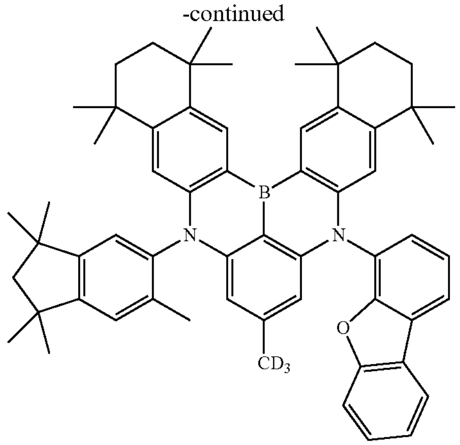
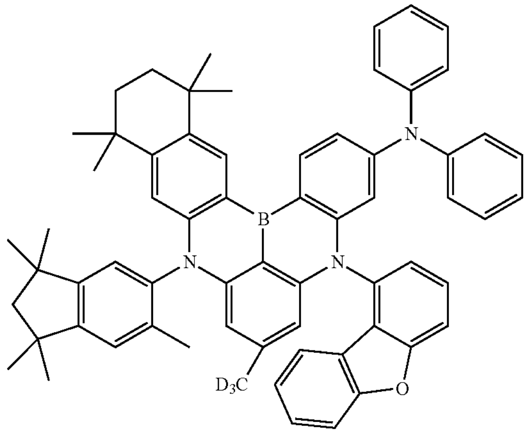
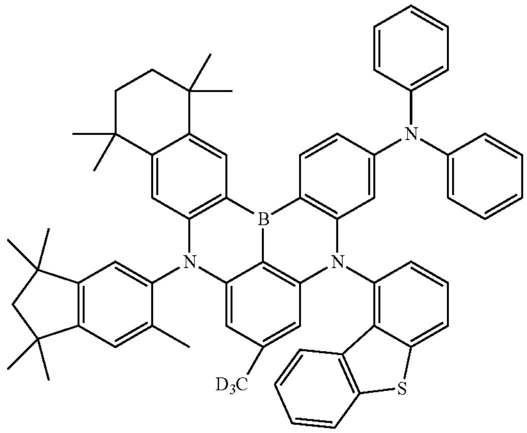
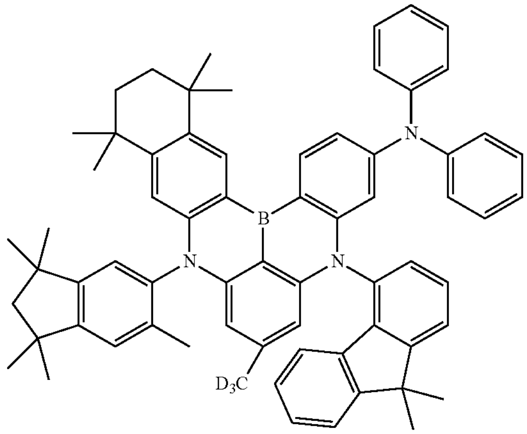

-continued
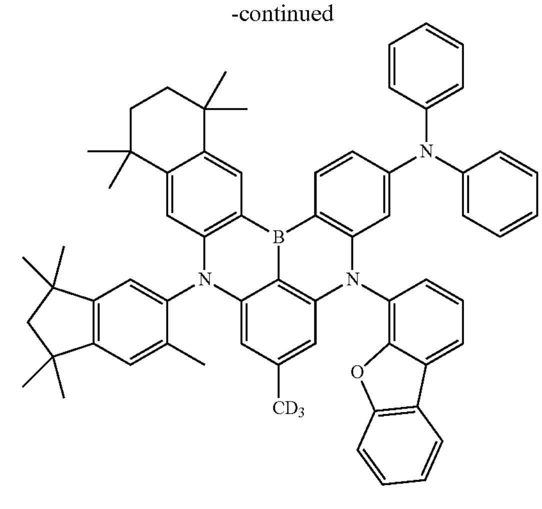
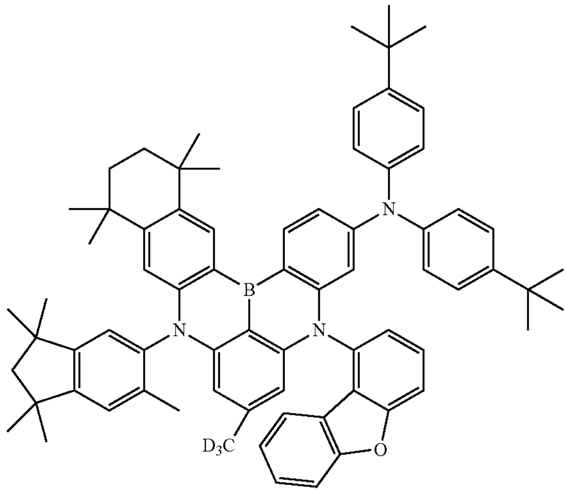
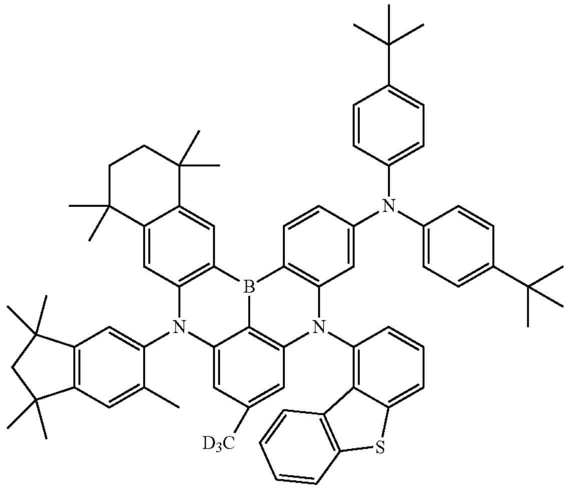
-continued
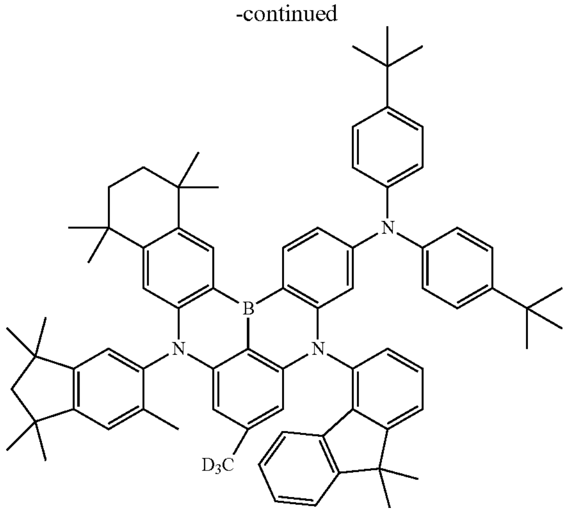
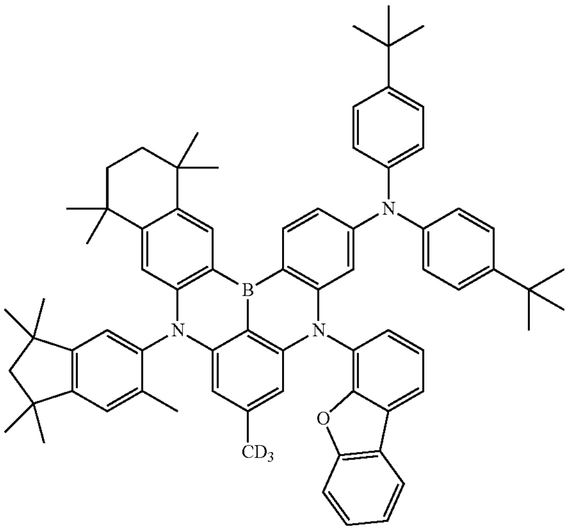
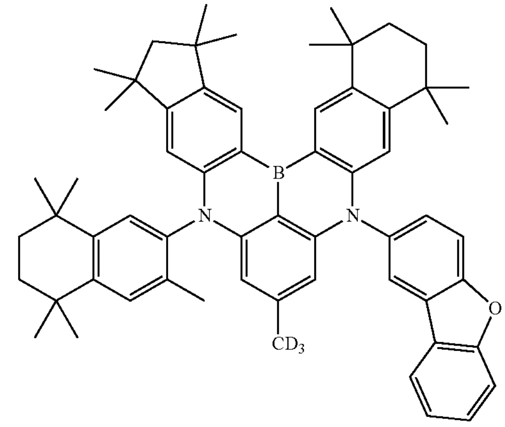

-continued
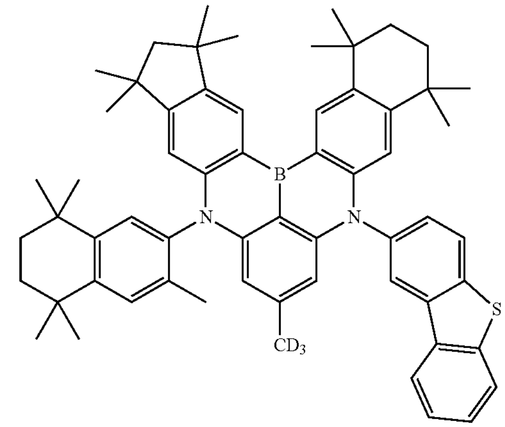
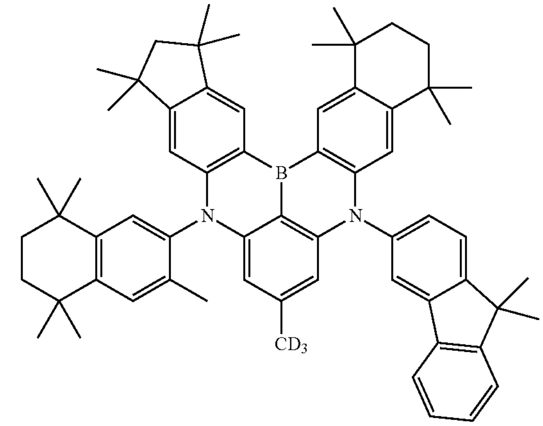
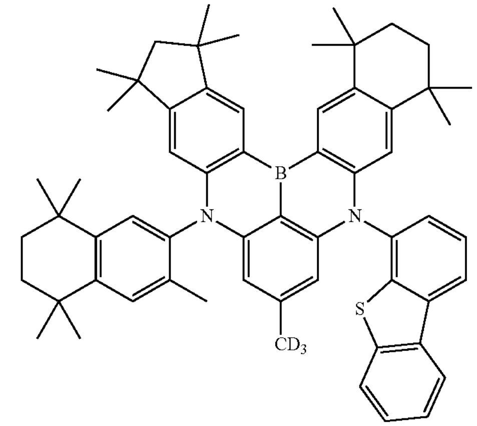
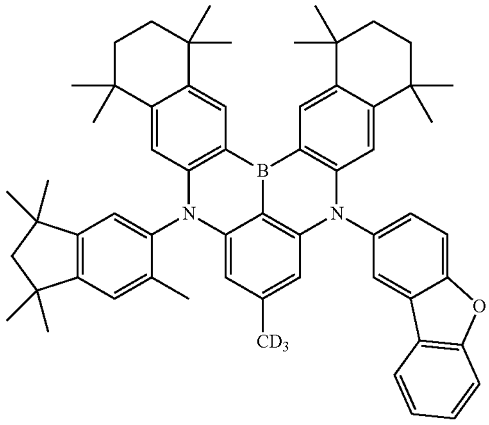
-continued
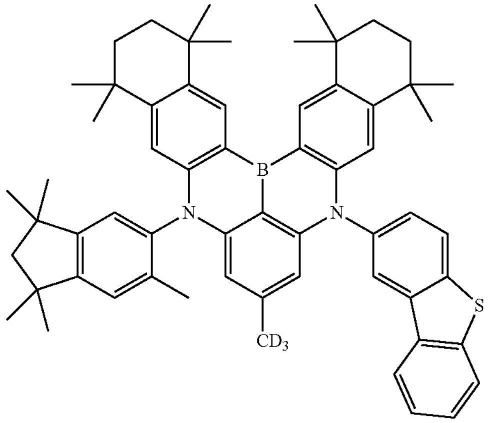
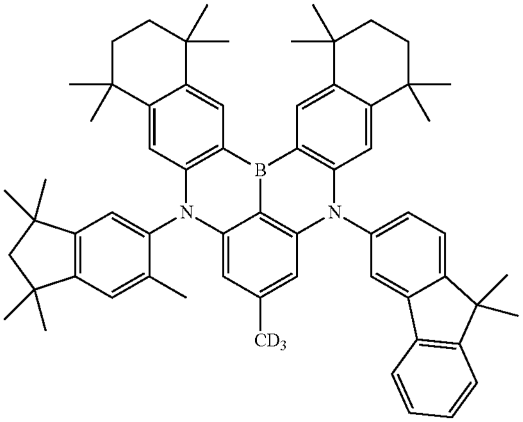
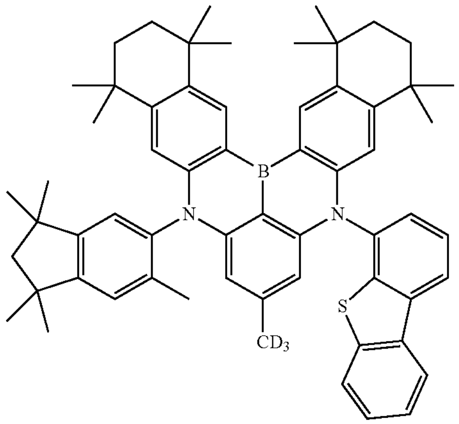
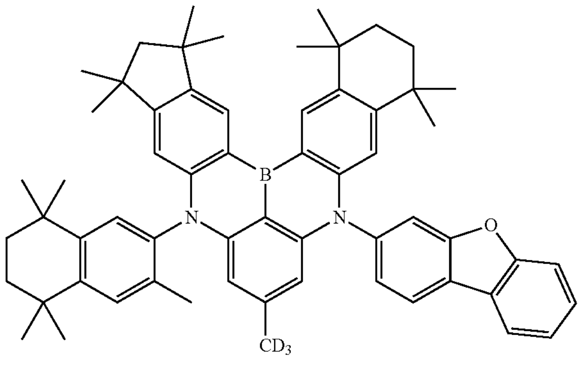

-continued
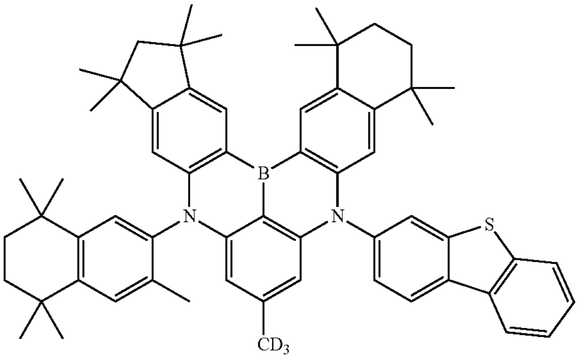
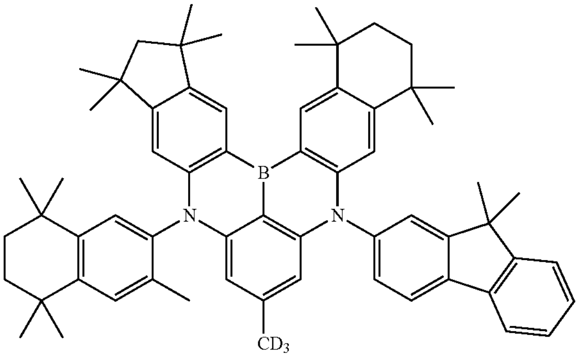
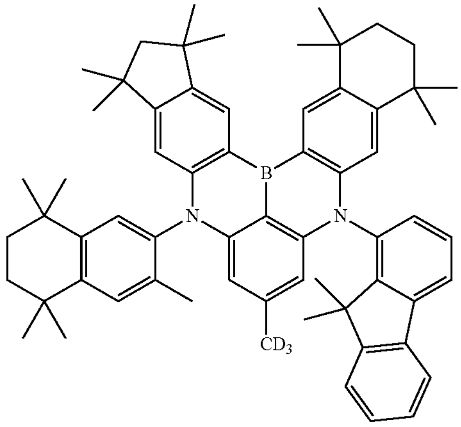
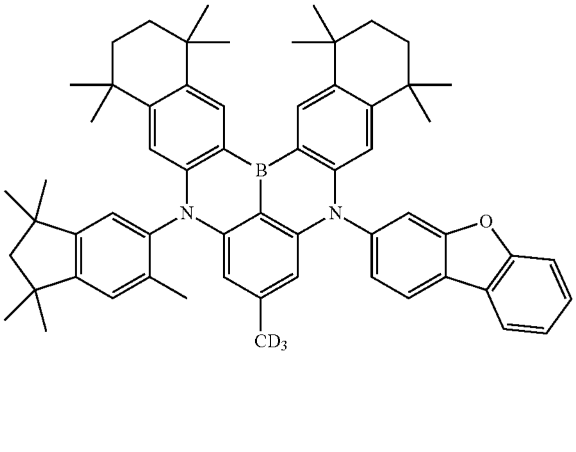
-continued
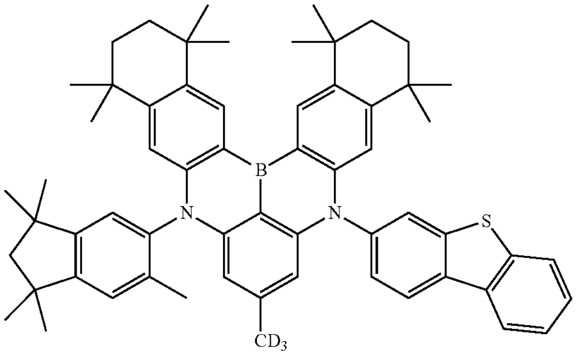
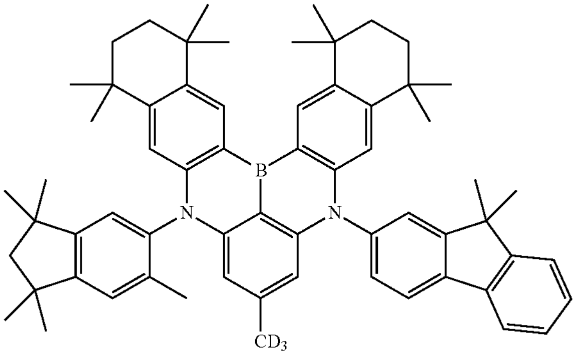
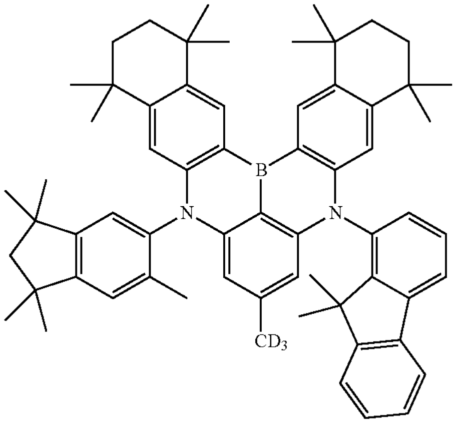
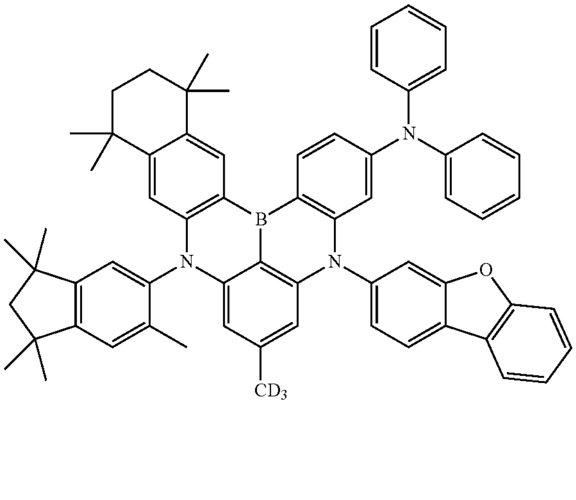

-continued
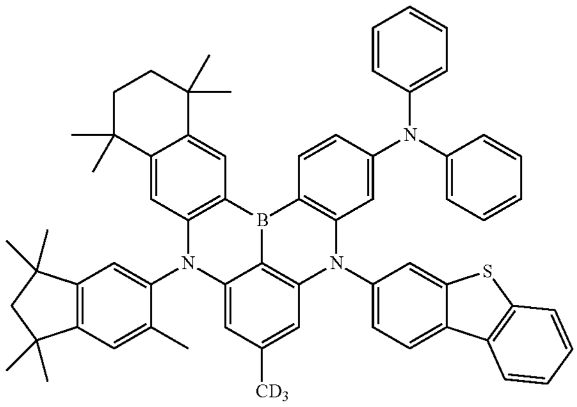
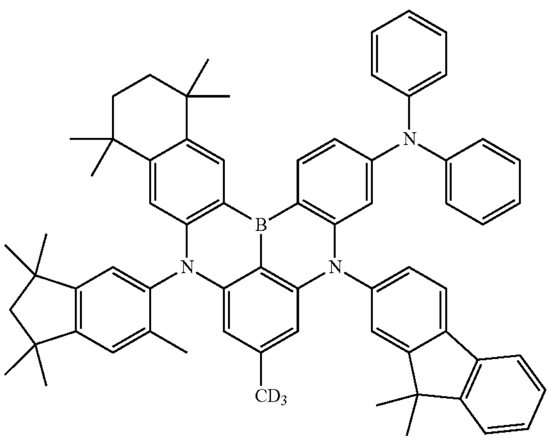
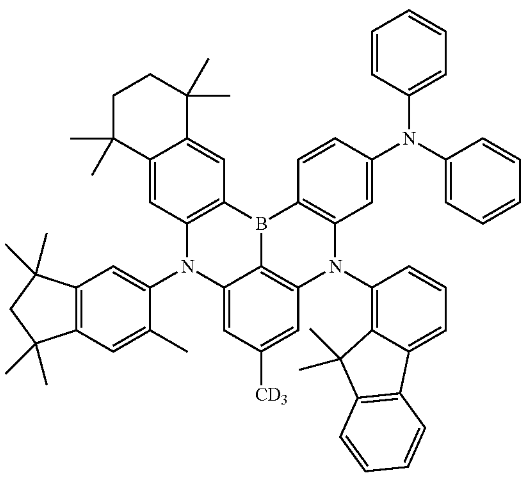
-continued
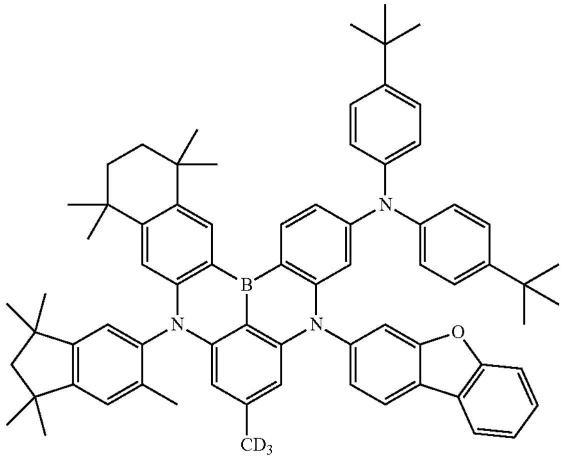
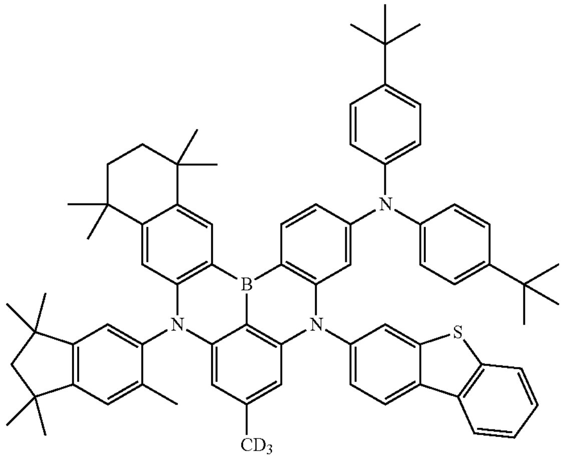
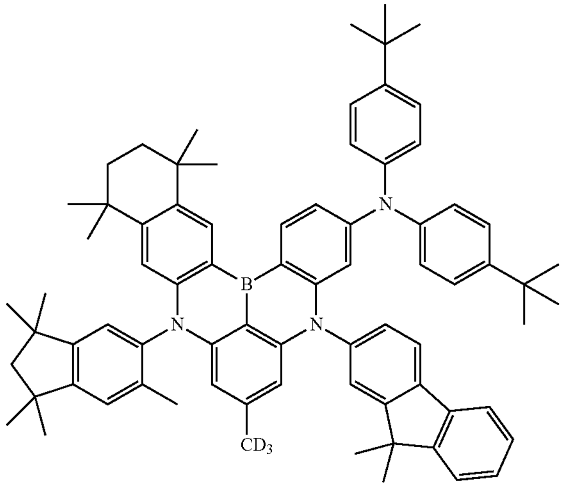

-continued
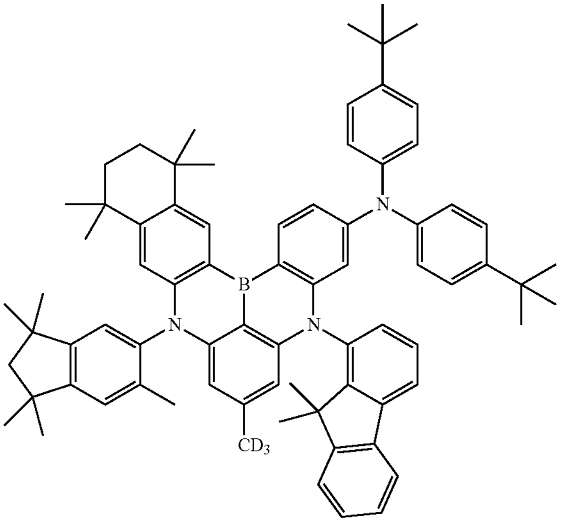
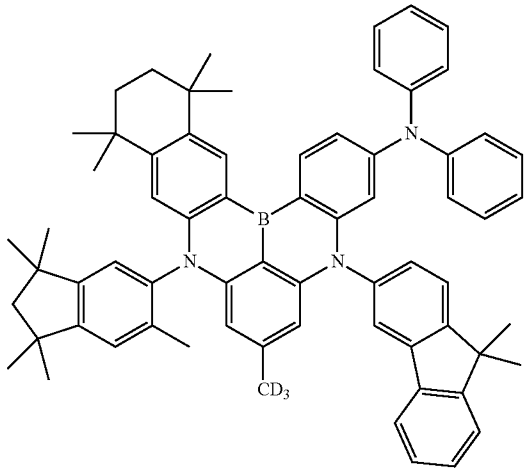
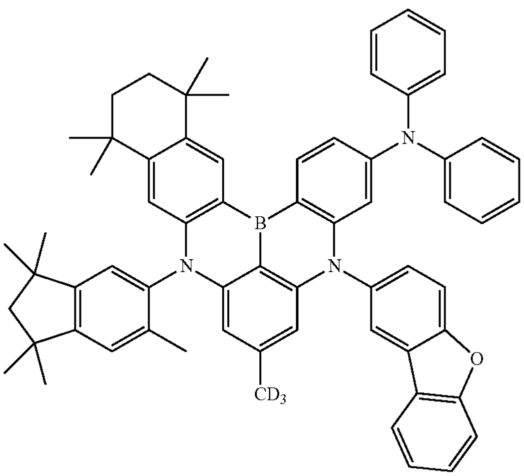
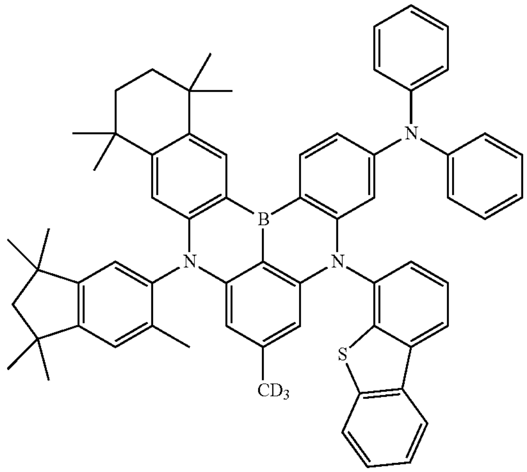
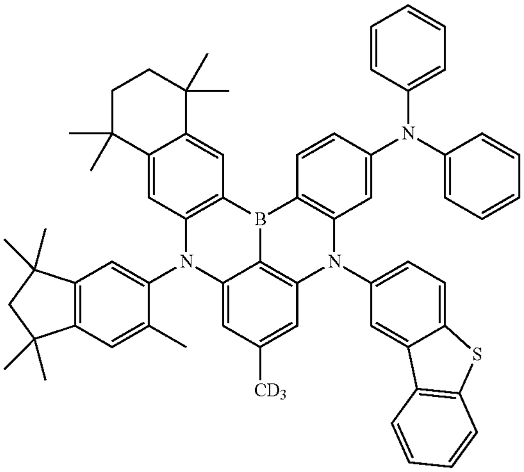
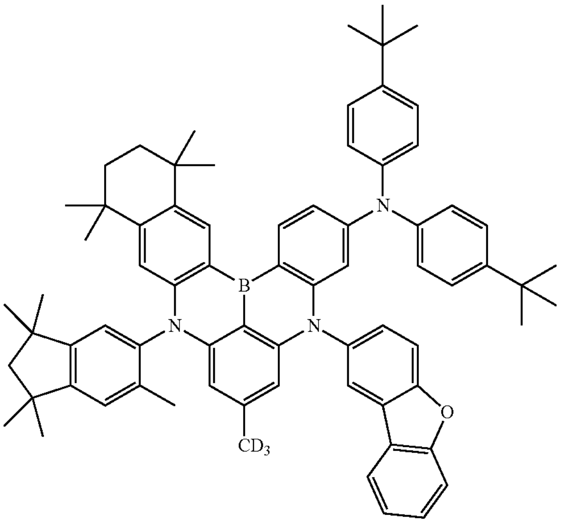

-continued
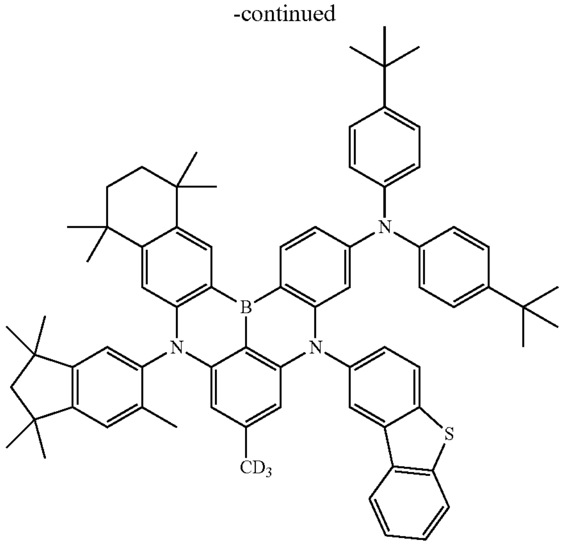
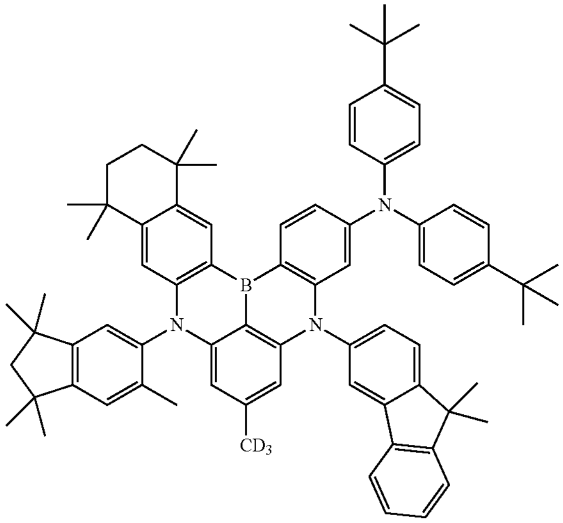
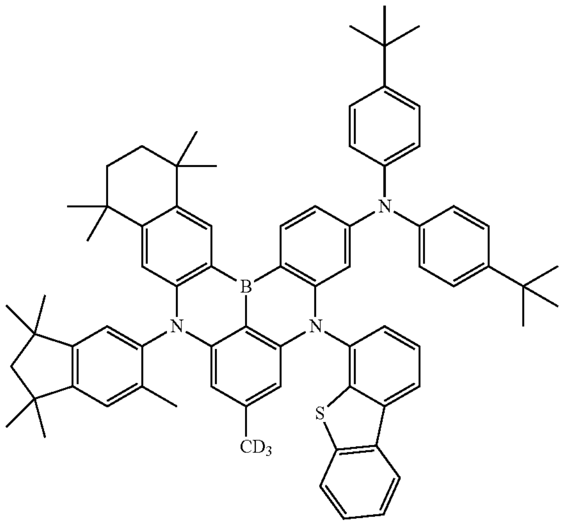
-continued
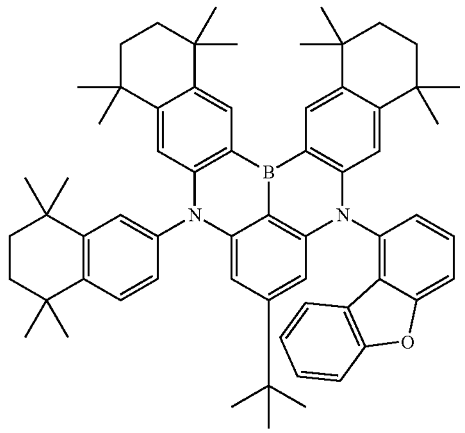
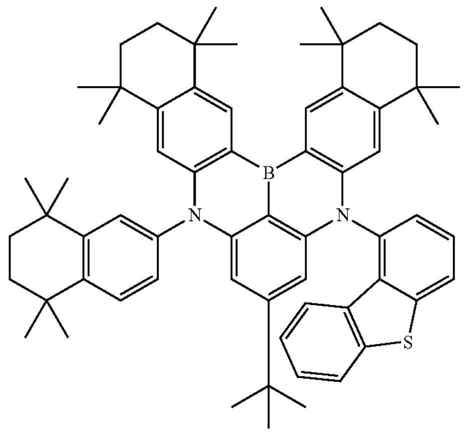
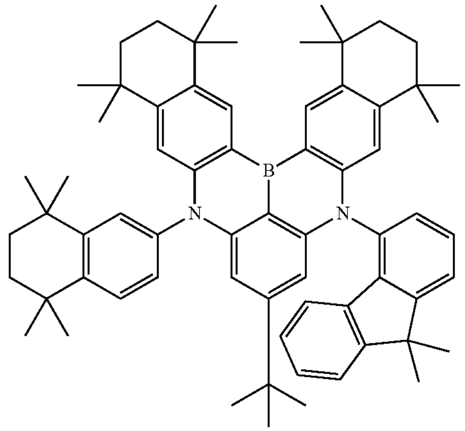

-continued
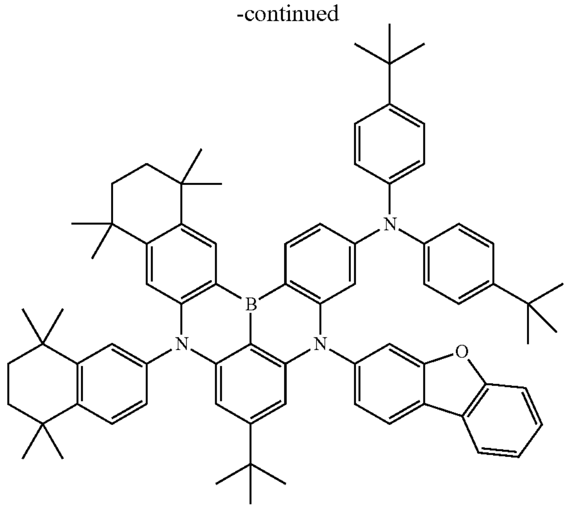
-continued
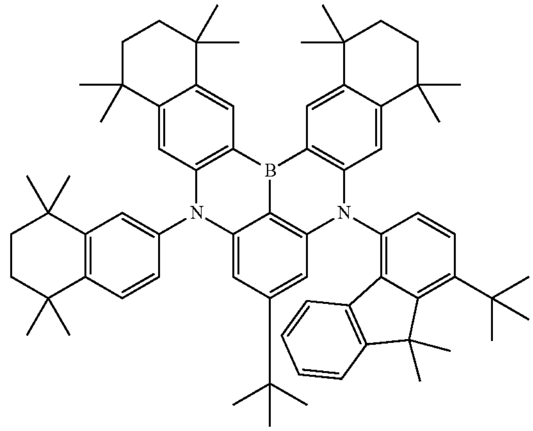
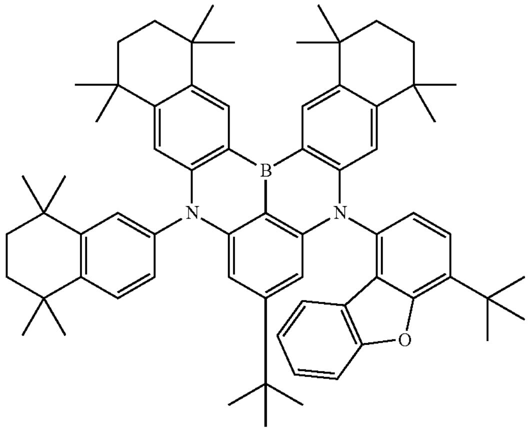
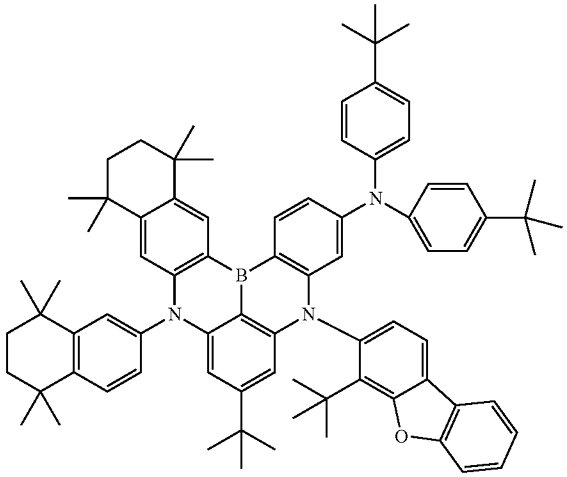
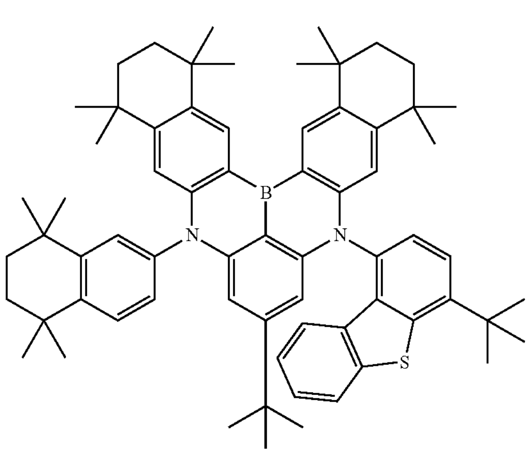
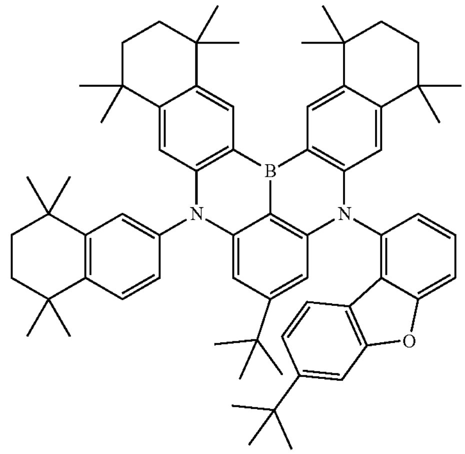

-continued
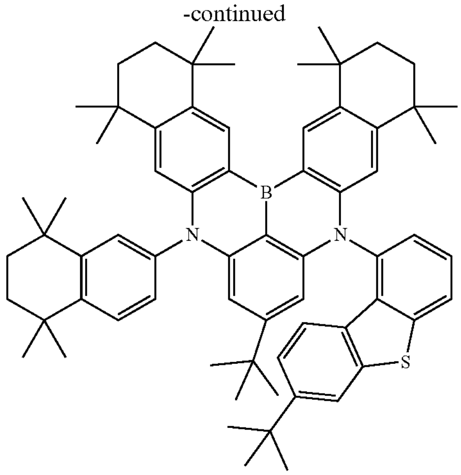
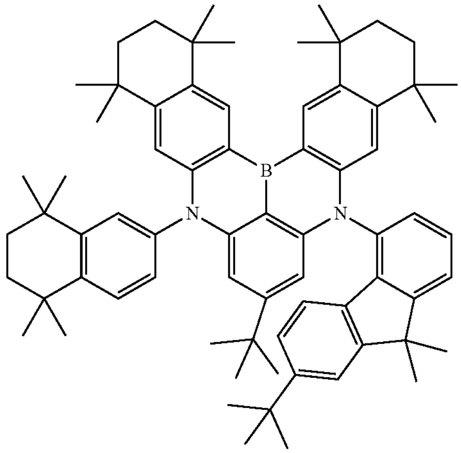
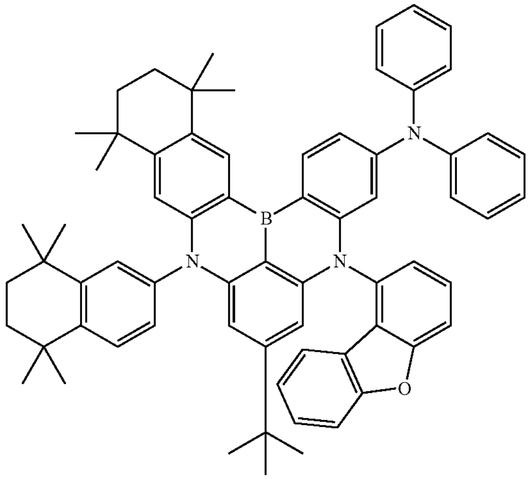
-continued
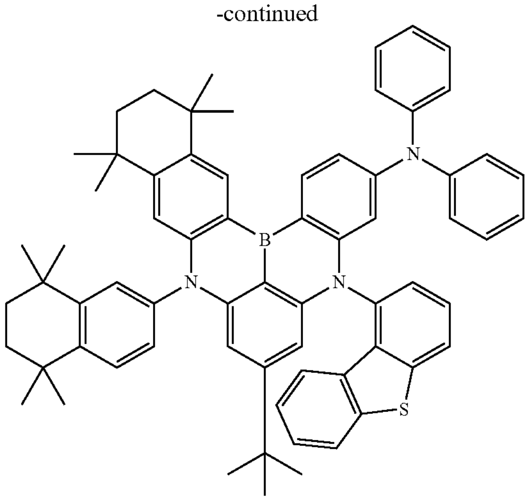
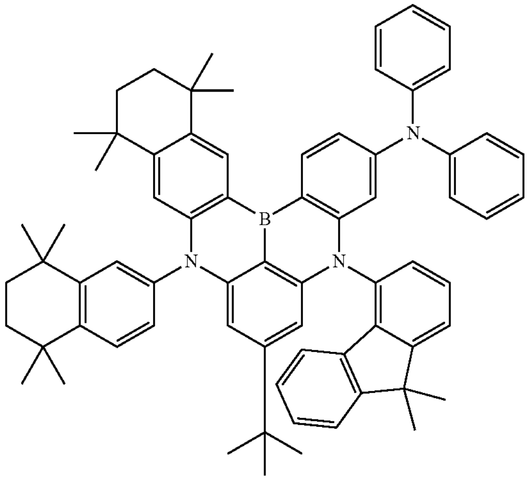
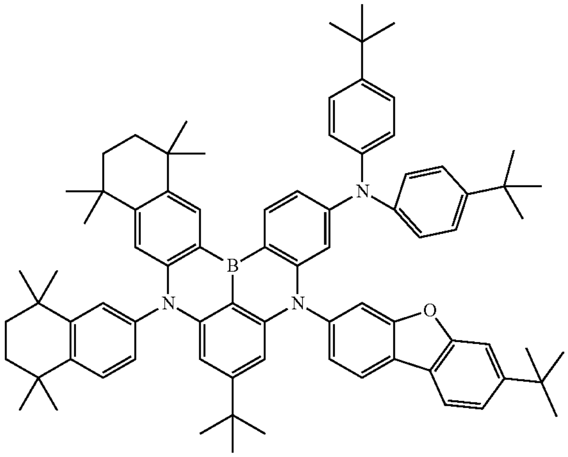 [SMILES: CC(C)(C)c1ccc(N(c2ccc(C(C)(C)C)cc2)c2ccc3c(c2)N(c2ccc4c(c2)oc2cc(C(C)(C)C)ccc24)c2cc(C(C)(C)C)cc4c2B3c2cc3c(cc2N4c2ccc4c(c2)C(C)(C)CCC4(C)C)C(C)(C)CCC3(C)C)cc1]

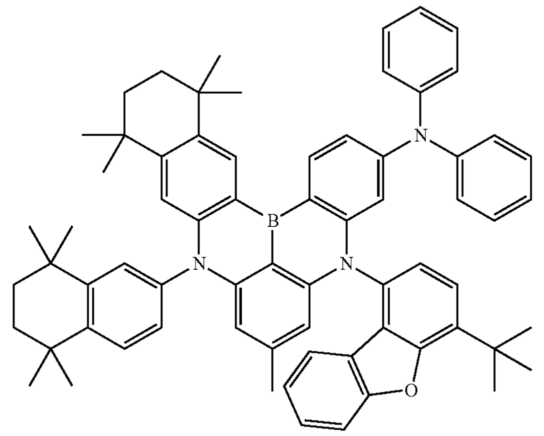
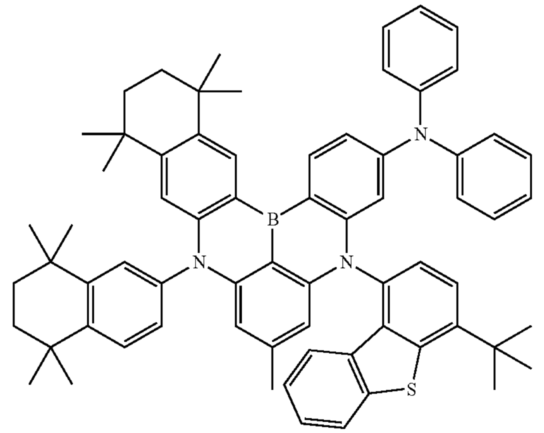
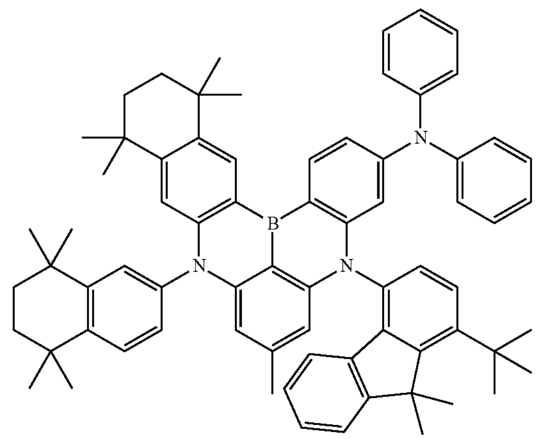
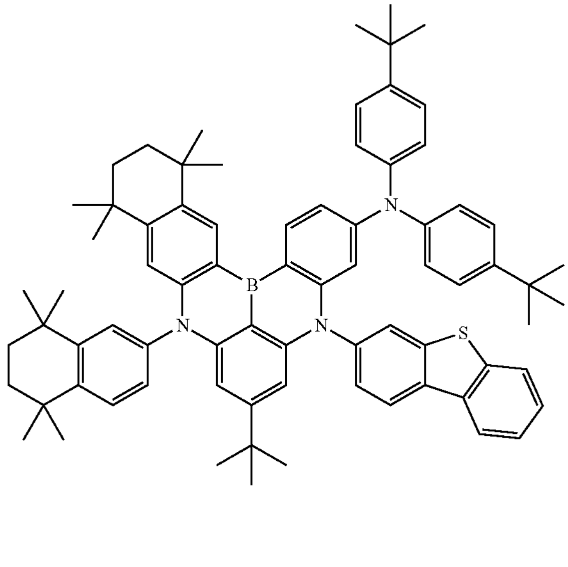
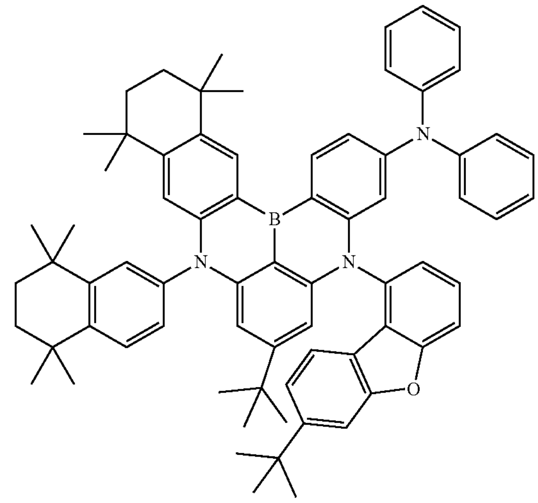
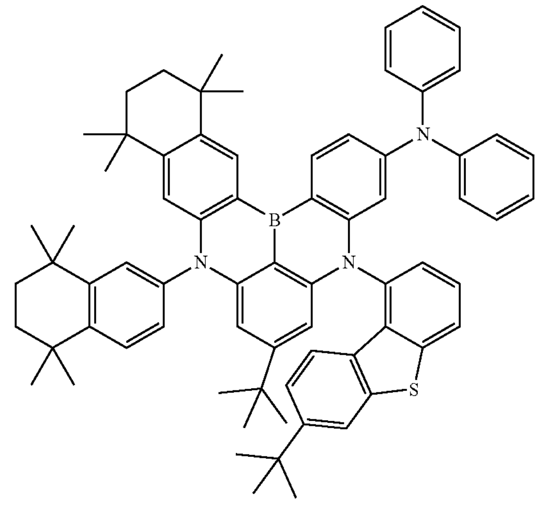

-continued
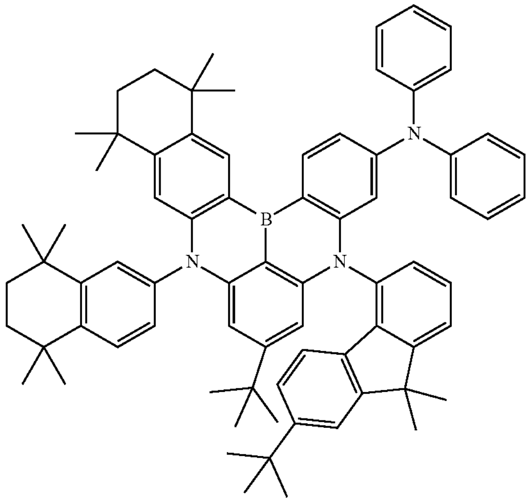
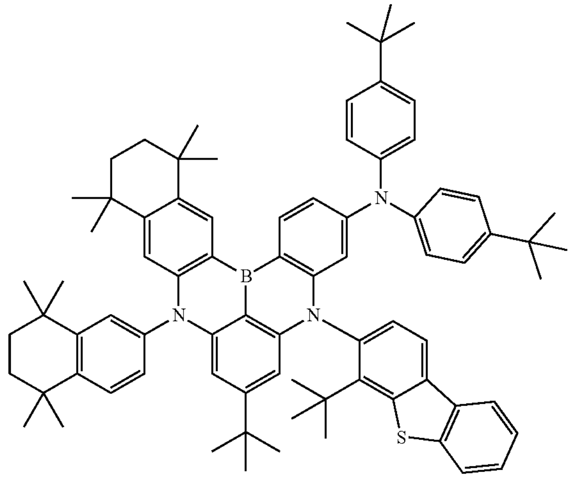 [SMILES: CC(C)(C)c1ccc(N(c2ccc(C(C)(C)C)cc2)c2ccc3c(c2)N(c2ccc4c(sc5ccccc54)c2C(C)(C)C)c2cc(C(C)(C)C)cc4c2B3c2cc3c(cc2N4c2ccc4c(c2)C(C)(C)CCC4(C)C)C(C)(C)CCC3(C)C)cc1]
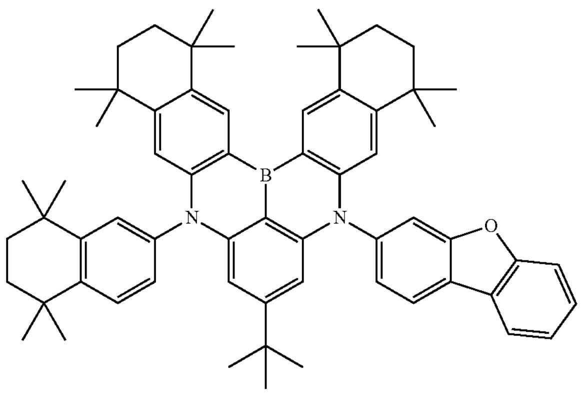
-continued
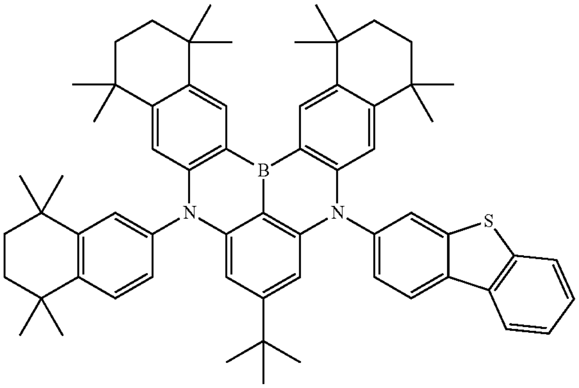
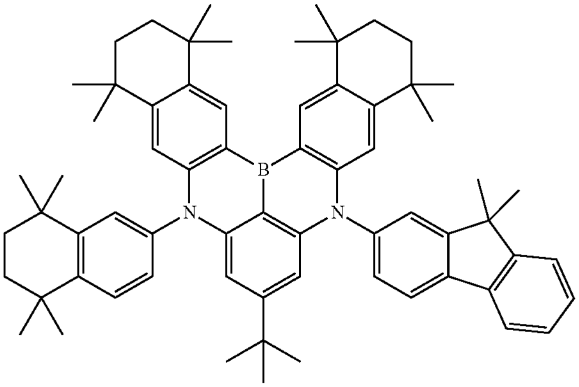
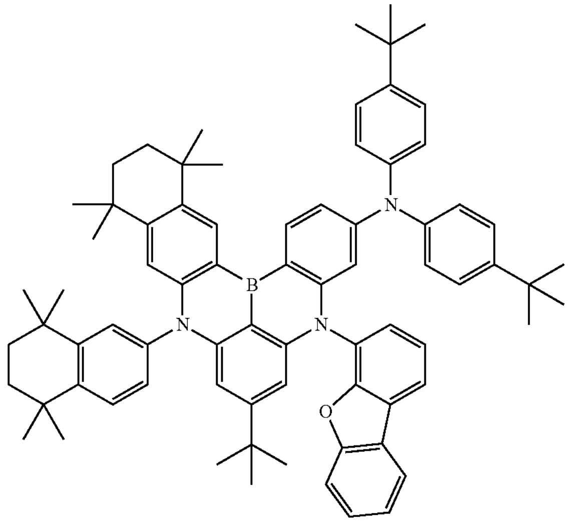
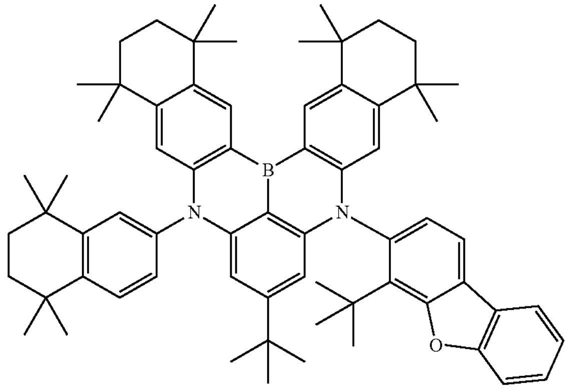

-continued
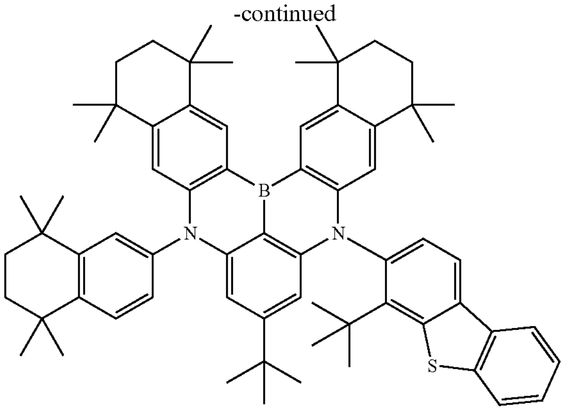
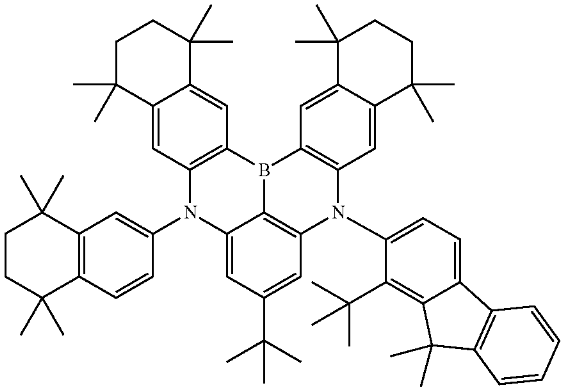
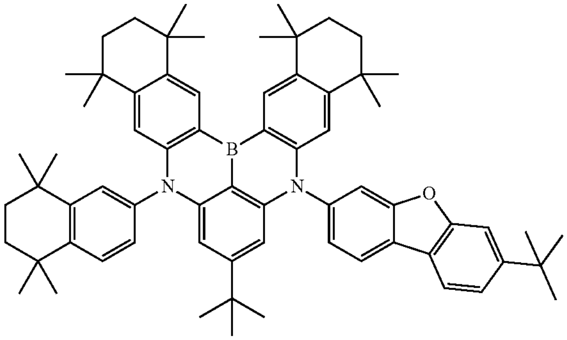
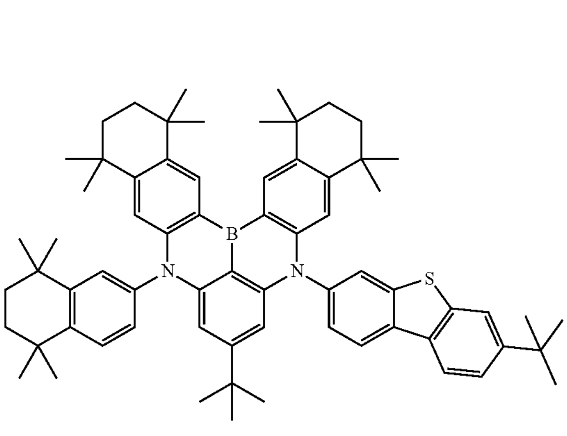
-continued
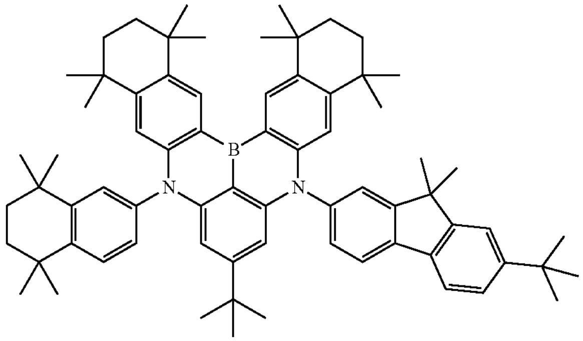
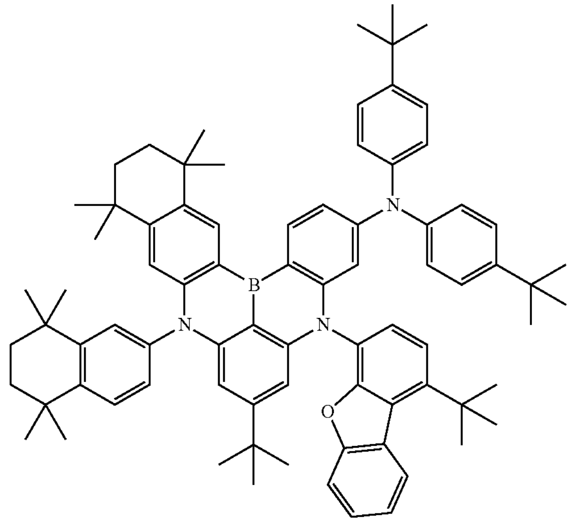
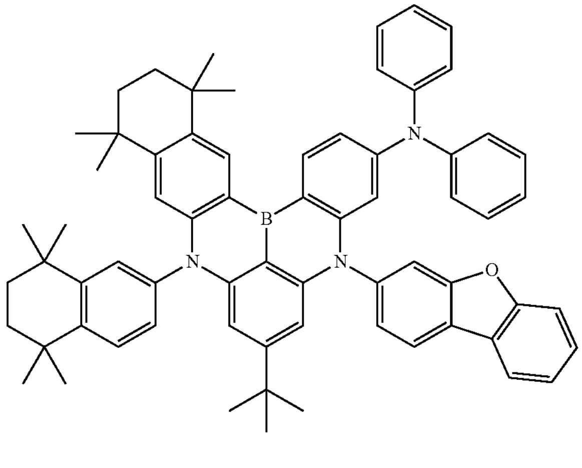

-continued
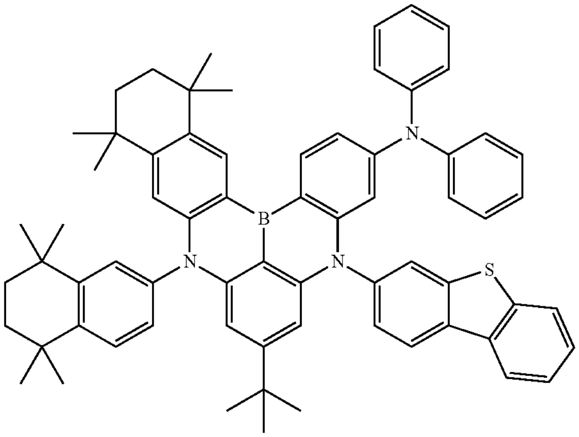
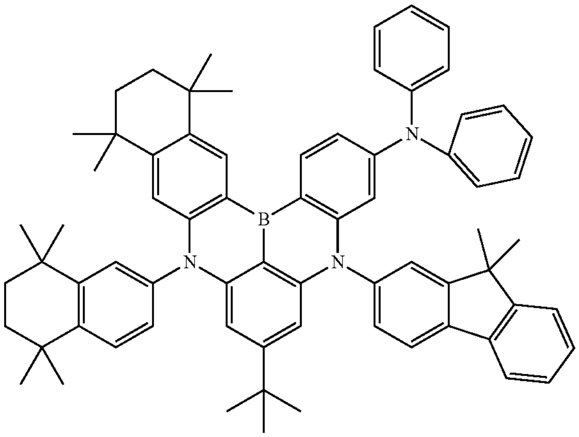
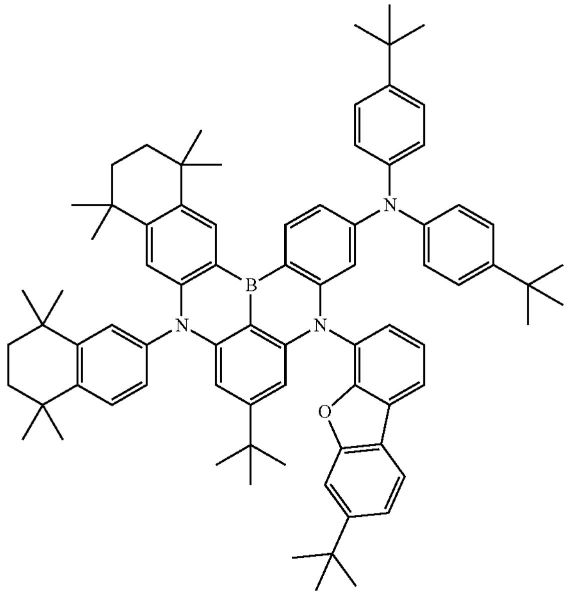
-continued
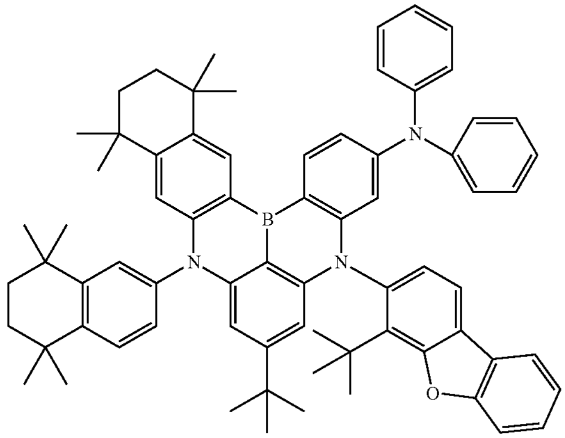
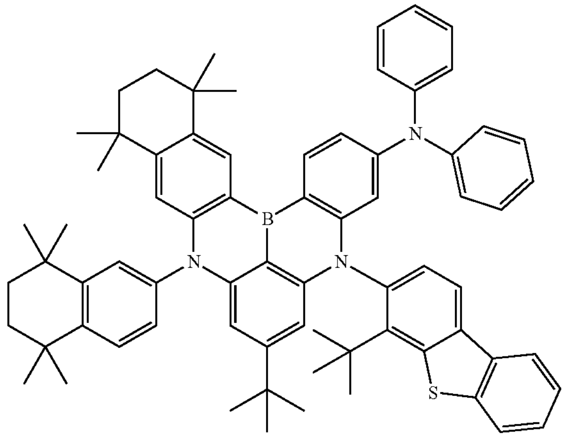
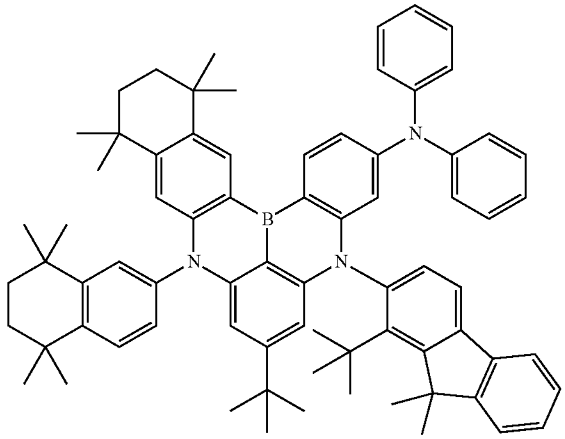

-continued
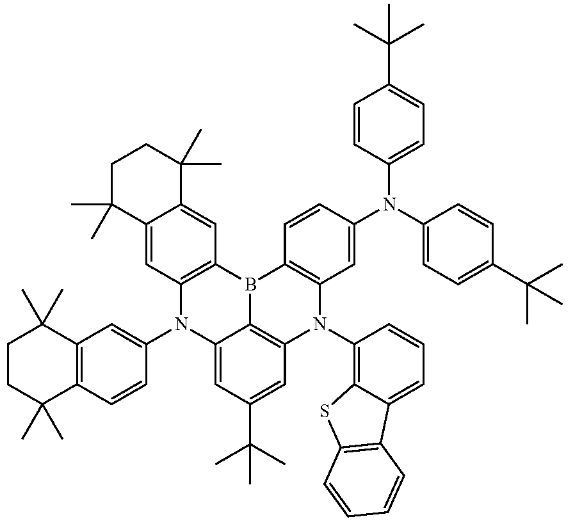
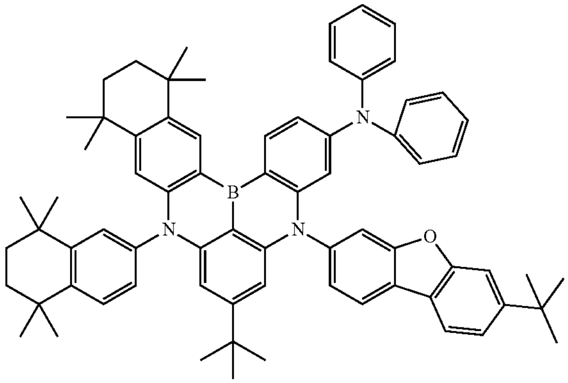
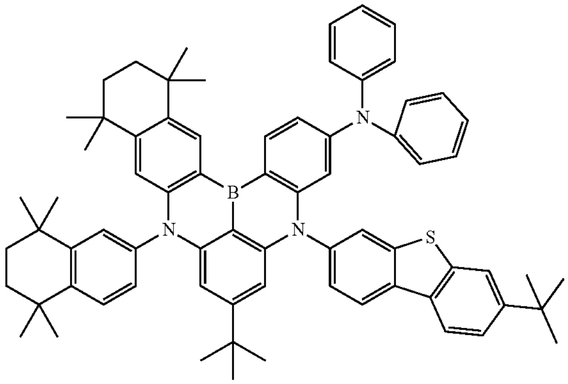
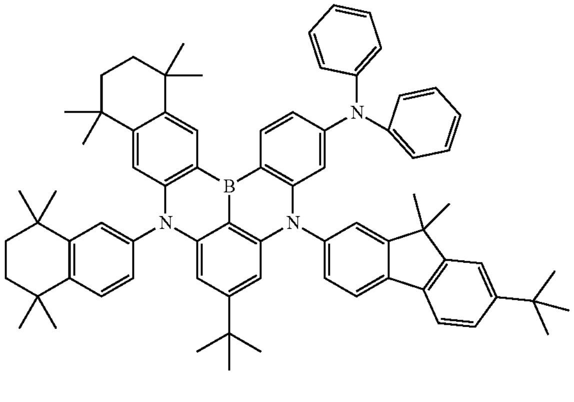
-continued
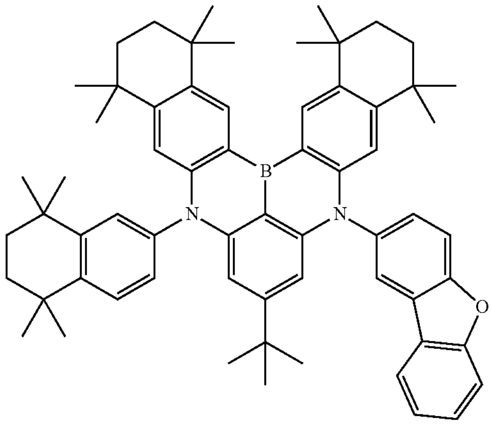
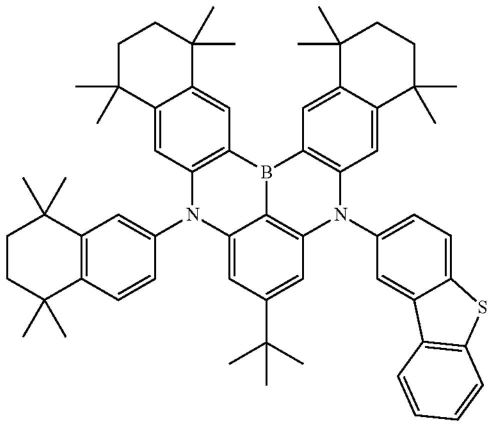
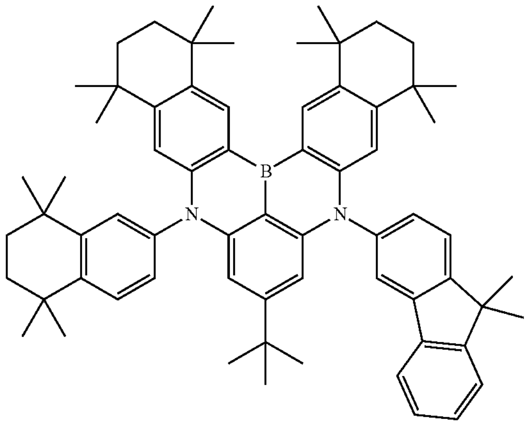

-continued
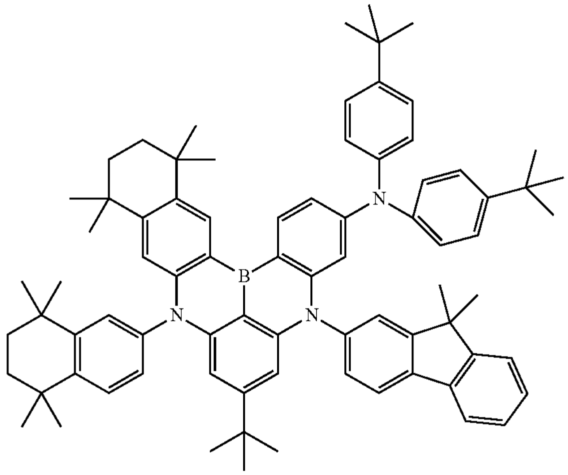
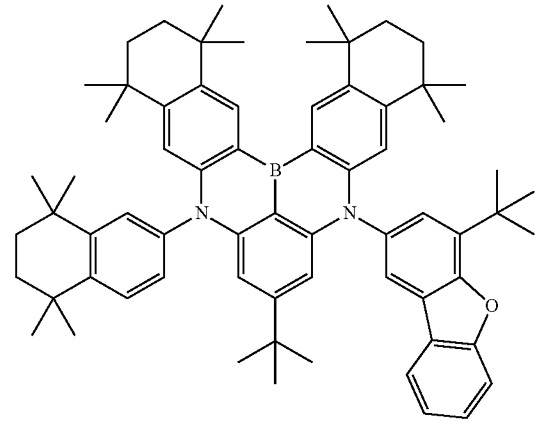
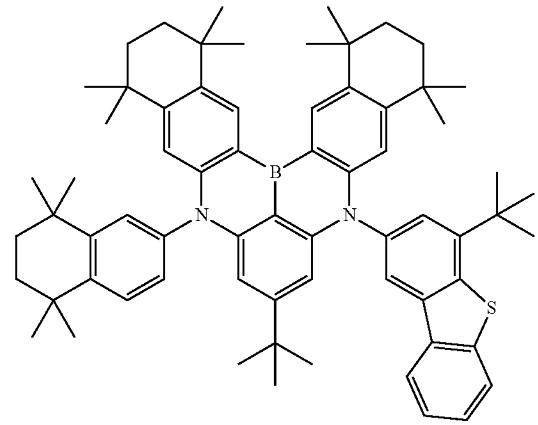
-continued
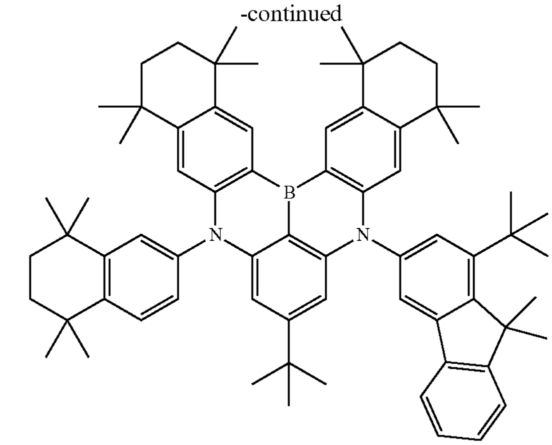
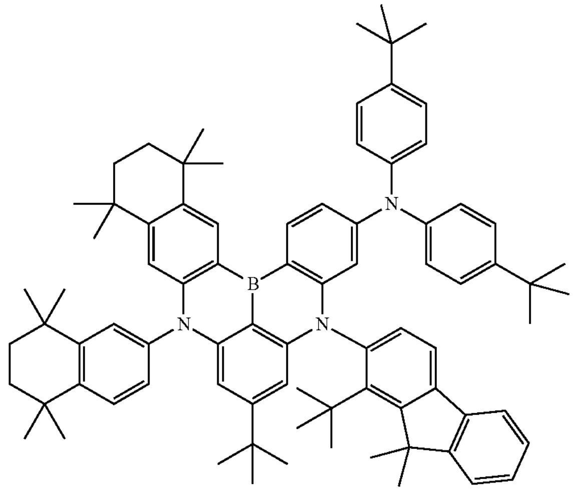
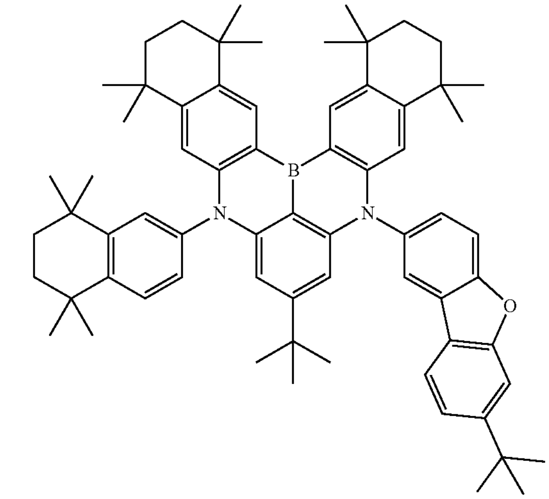

-continued
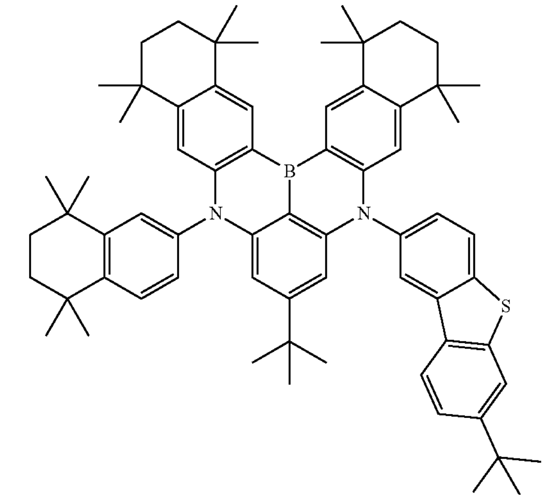
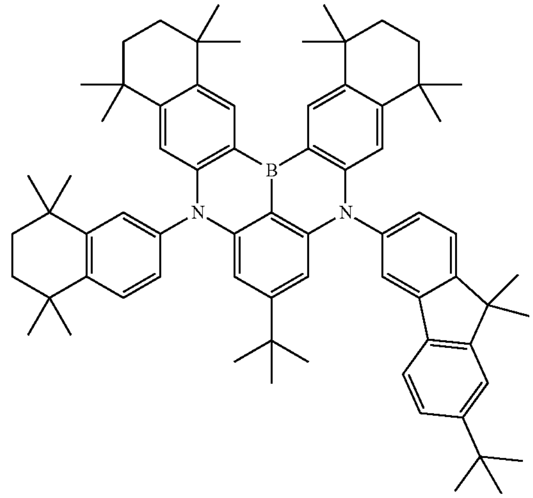
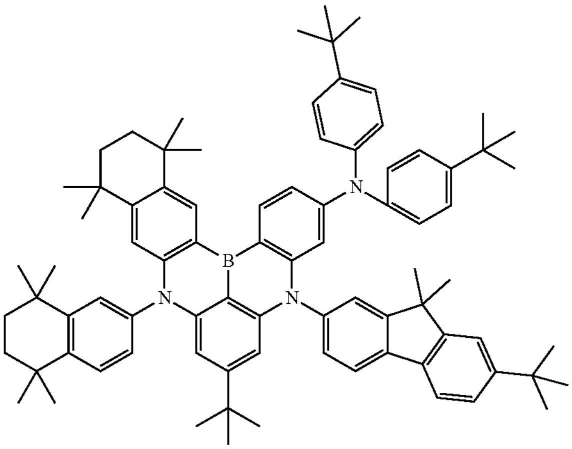 [SMILES: CC(C)(C)c1ccc(N(c2ccc(C(C)(C)C)cc2)c2ccc3c(c2)N(c2ccc4c(c2)C(C)(C)c2cc(C(C)(C)C)ccc2-4)c2cc(C(C)(C)C)cc4c2B3c2cc3c(cc2N4c2ccc4c(c2)C(C)(C)CCC4(C)C)C(C)(C)CCC3(C)C)cc1]
-continued
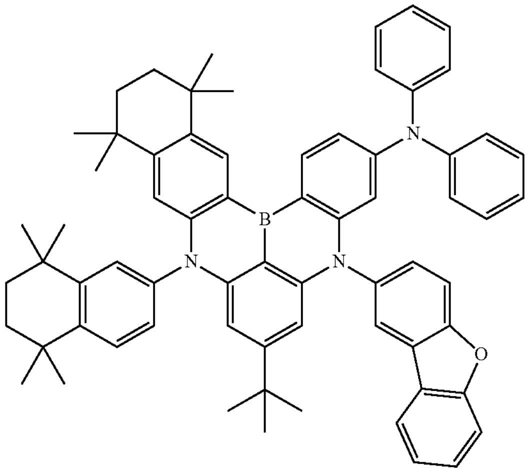
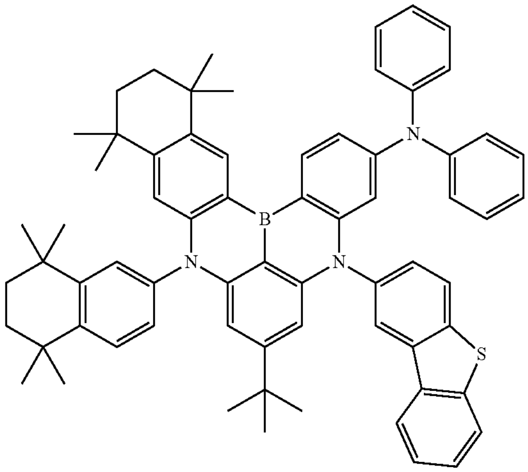
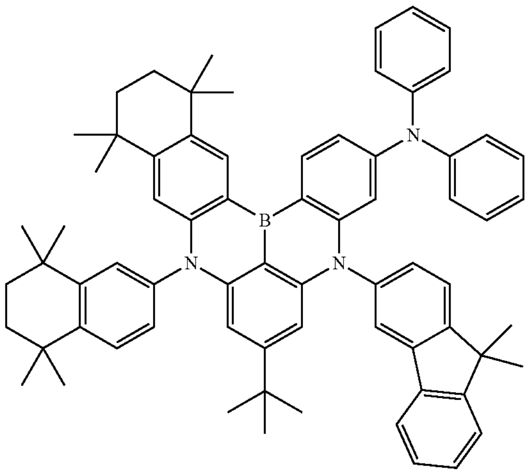

-continued
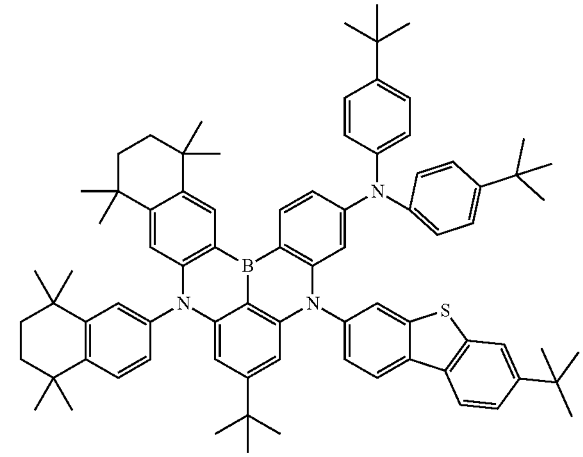 [SMILES: CC(C)(C)c1ccc(N(c2ccc(C(C)(C)C)cc2)c2ccc3c(c2)N(c2ccc4c(c2)sc2cc(C(C)(C)C)ccc24)c2cc(C(C)(C)C)cc4c2B3c2cc3c(cc2N4c2ccc4c(c2)C(C)(C)CCC4(C)C)C(C)(C)CCC3(C)C)cc1]
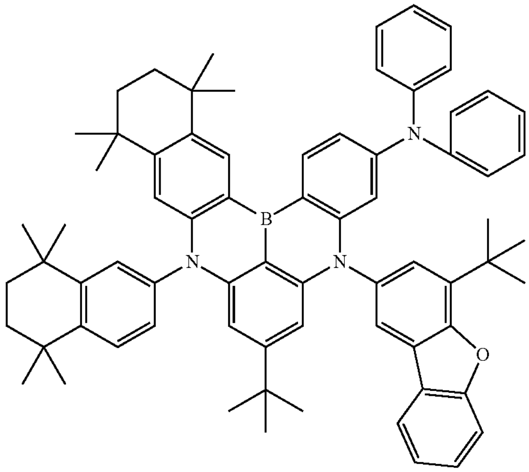
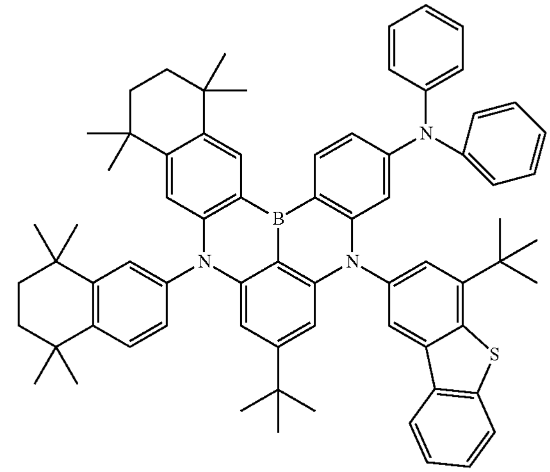
-continued
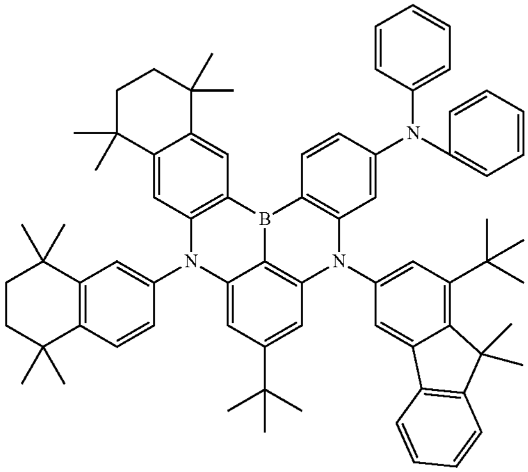
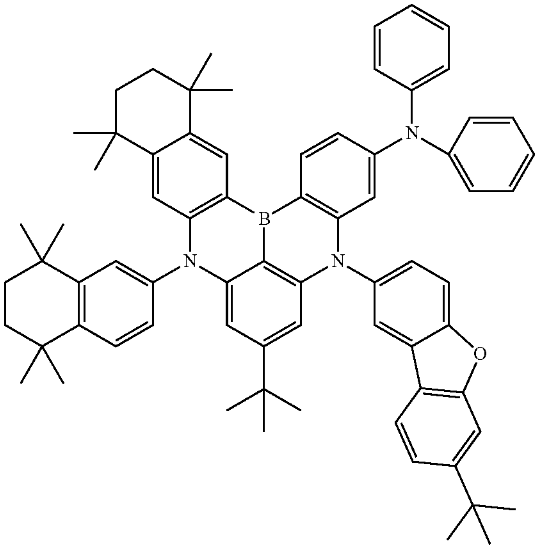
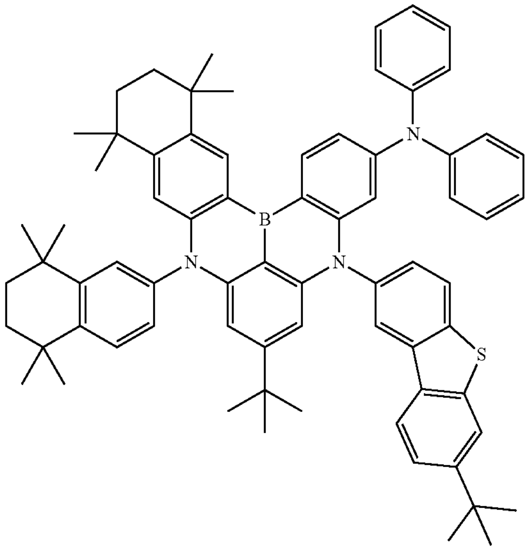

-continued
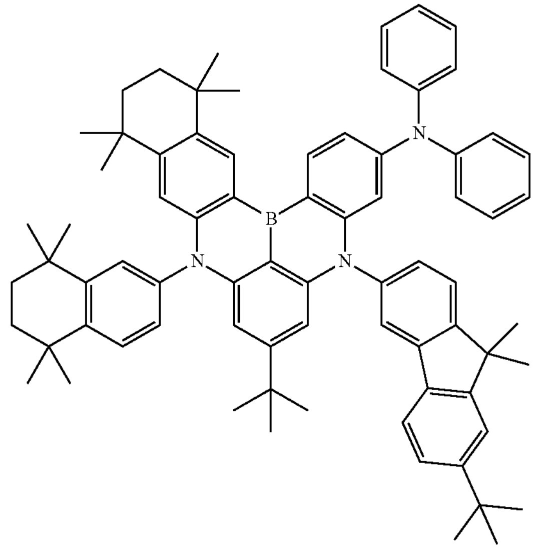
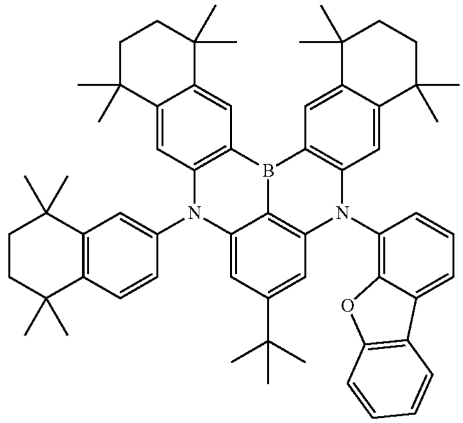
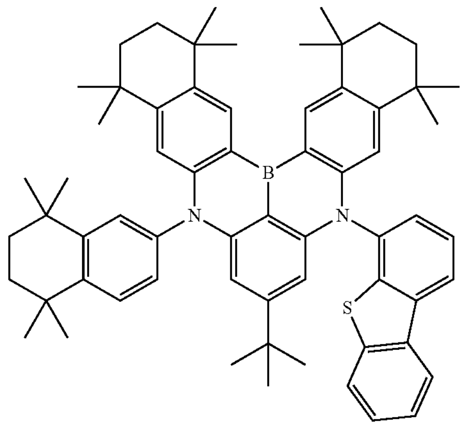
-continued
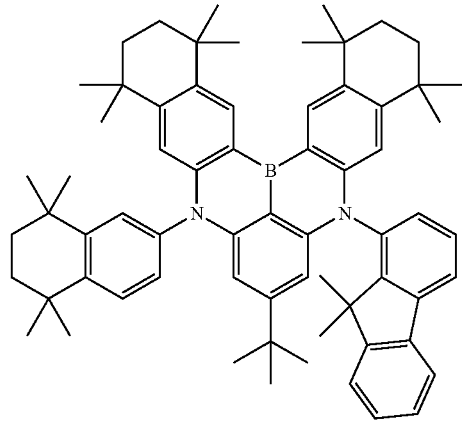
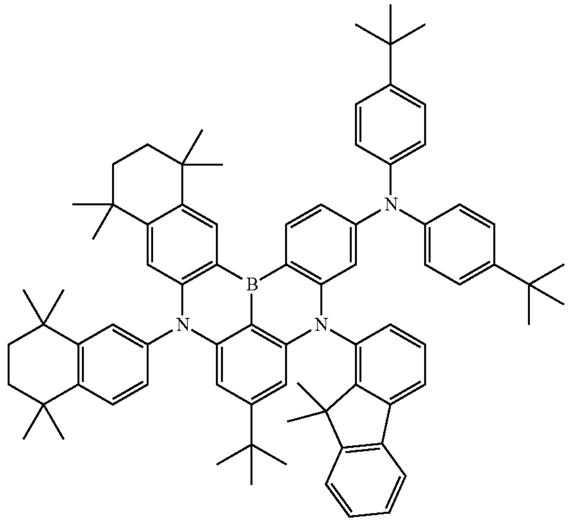
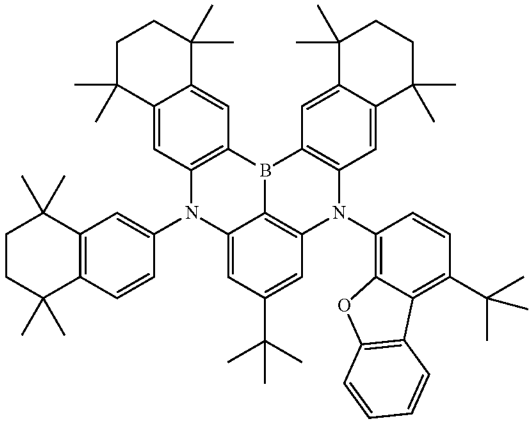

-continued
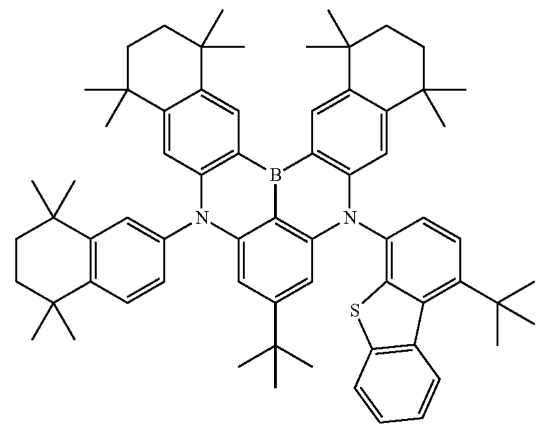
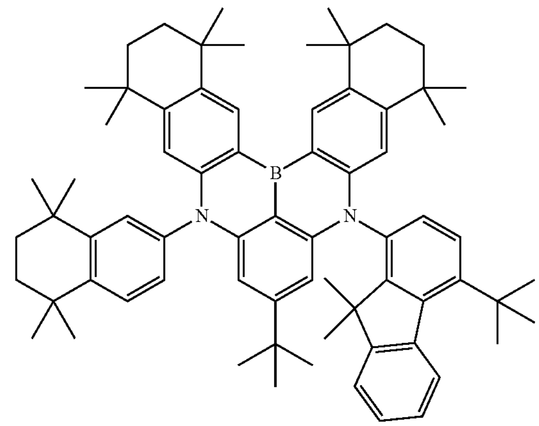
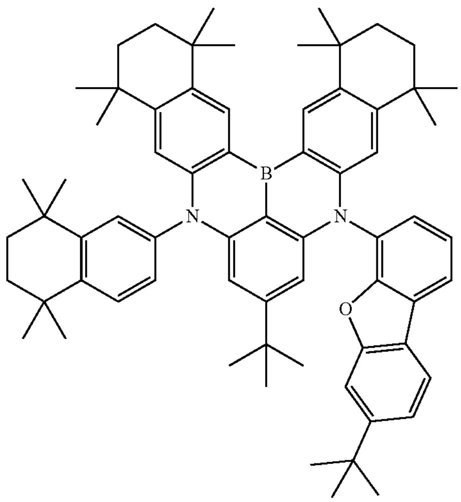
-continued
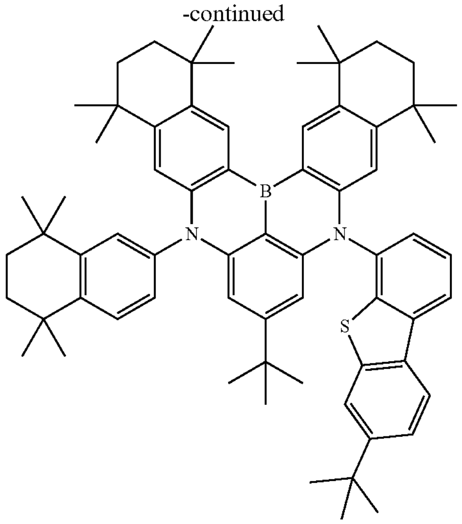
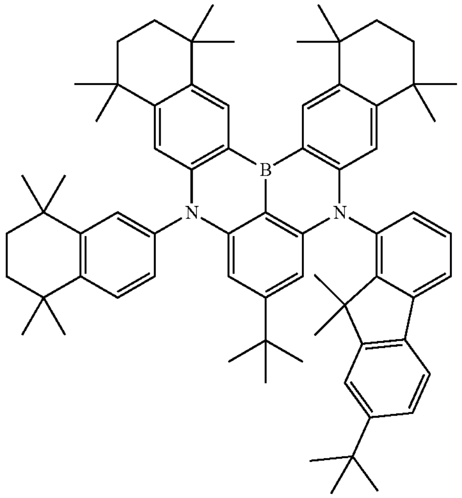
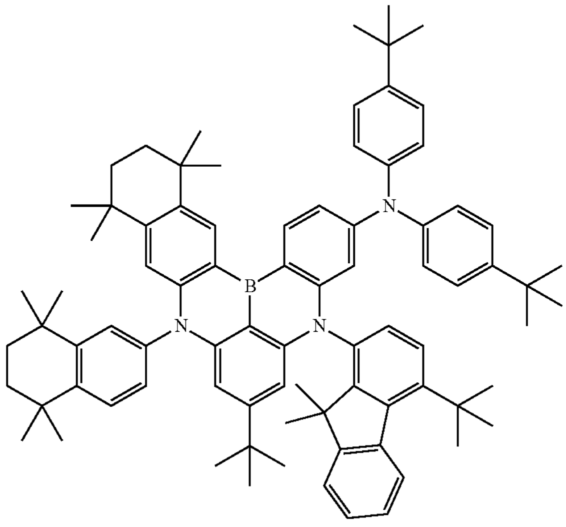 [SMILES: CC(C)(C)c1ccc(N(c2ccc(C(C)(C)C)cc2)c2ccc3c(c2)N(c2ccc(C(C)(C)C)c4c2C(C)(C)c2ccccc2-4)c2cc(C(C)(C)C)cc4c2B3c2cc3c(cc2N4c2ccc4c(c2)C(C)(C)CCC4(C)C)C(C)(C)CCC3(C)C)cc1]

-continued
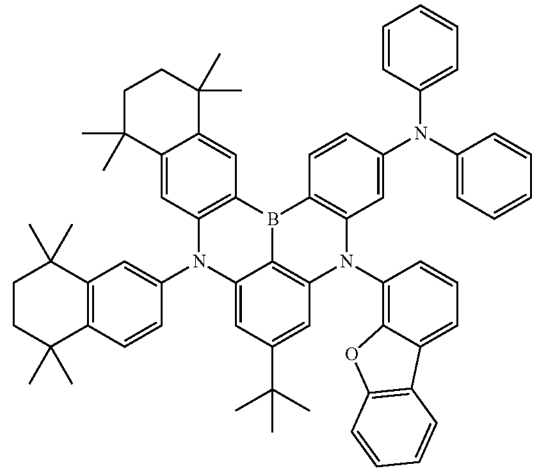
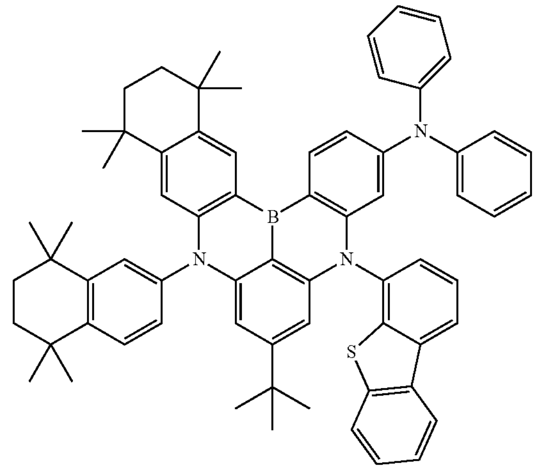
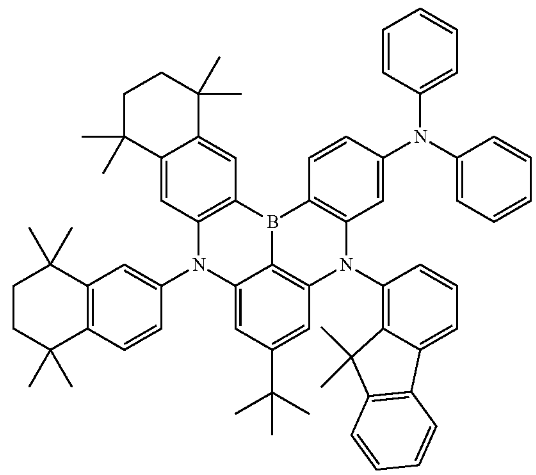
-continued
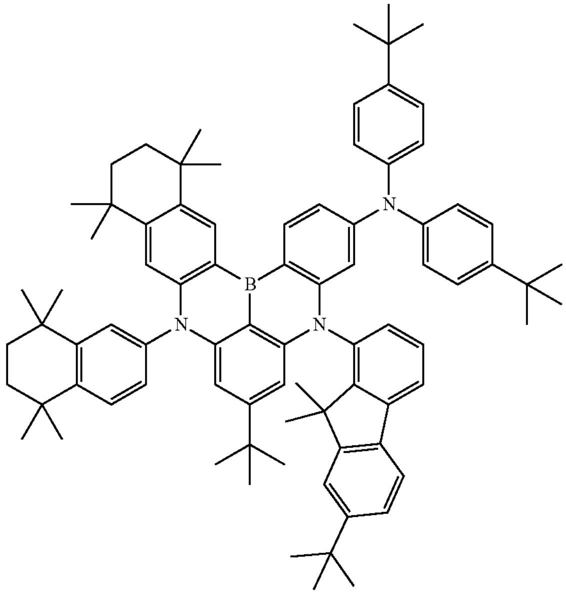 [SMILES: CC(C)(C)c1ccc(N(c2ccc(C(C)(C)C)cc2)c2ccc3c(c2)N(c2cccc4c2C(C)(C)c2cc(C(C)(C)C)ccc2-4)c2cc(C(C)(C)C)cc4c2B3c2cc3c(cc2N4c2ccc4c(c2)C(C)(C)CCC4(C)C)C(C)(C)CCC3(C)C)cc1]
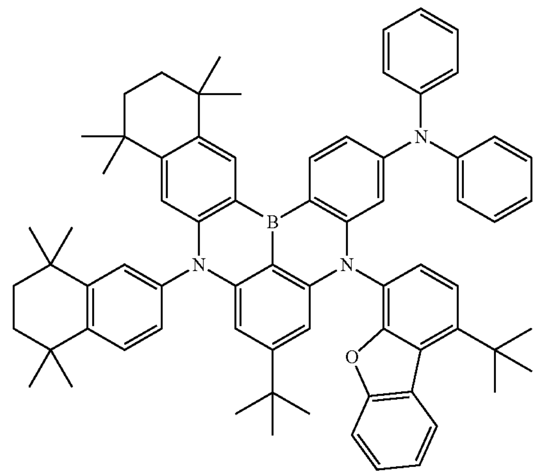
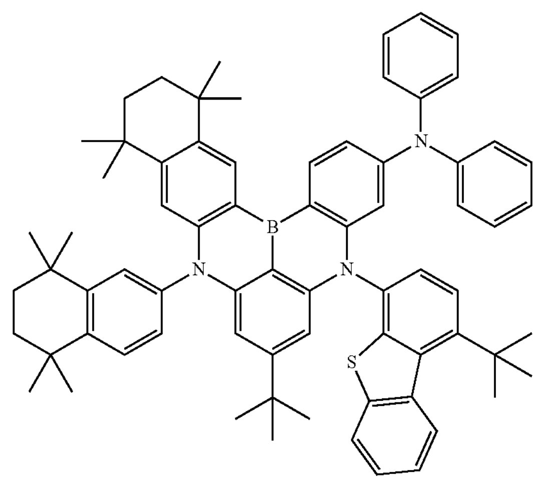

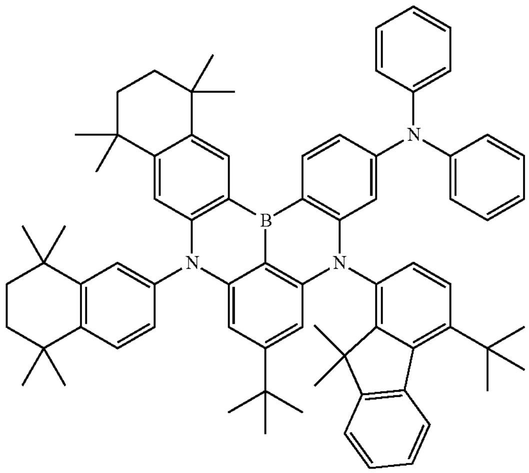
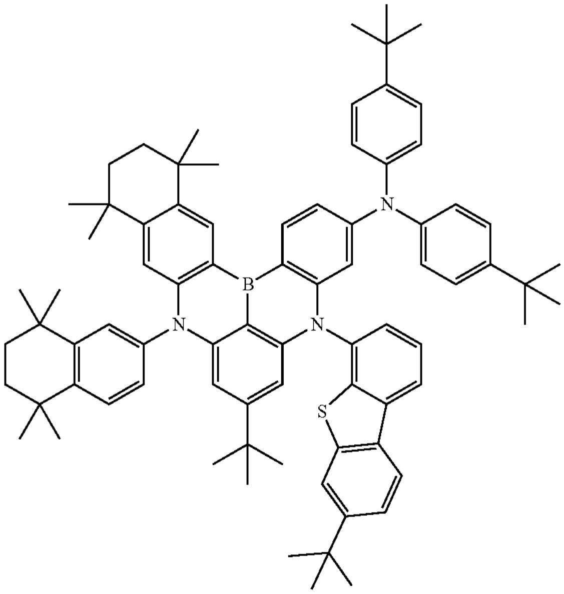 [SMILES: CC(C)(C)c1ccc(N(c2ccc(C(C)(C)C)cc2)c2ccc3c(c2)N(c2cccc4c2sc2cc(C(C)(C)C)ccc24)c2cc(C(C)(C)C)cc4c2B3c2cc3c(cc2N4c2ccc4c(c2)C(C)(C)CCC4(C)C)C(C)(C)CCC3(C)C)cc1]
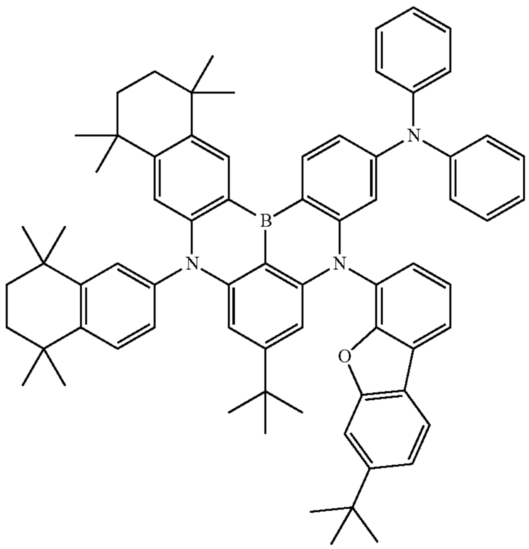
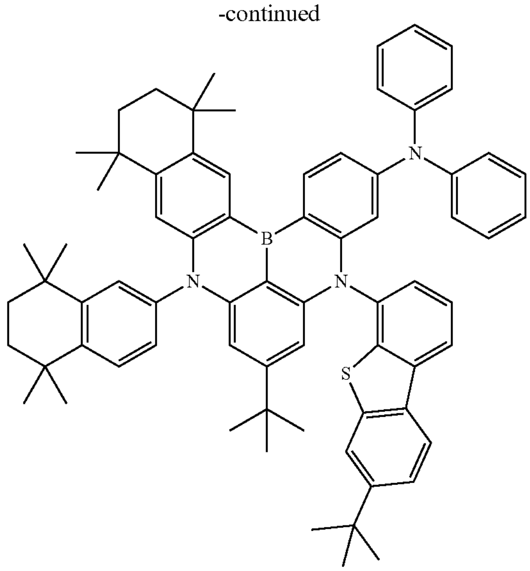
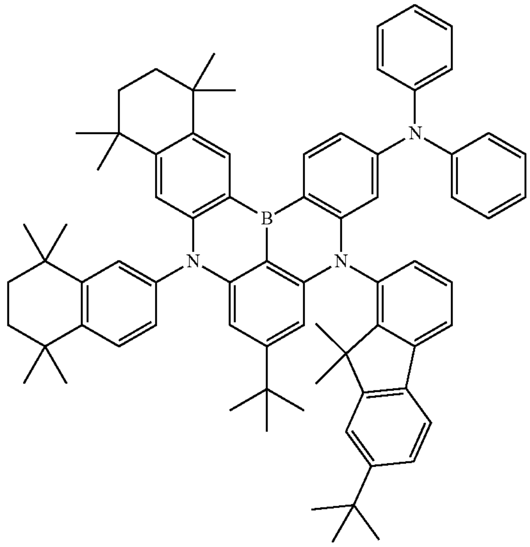
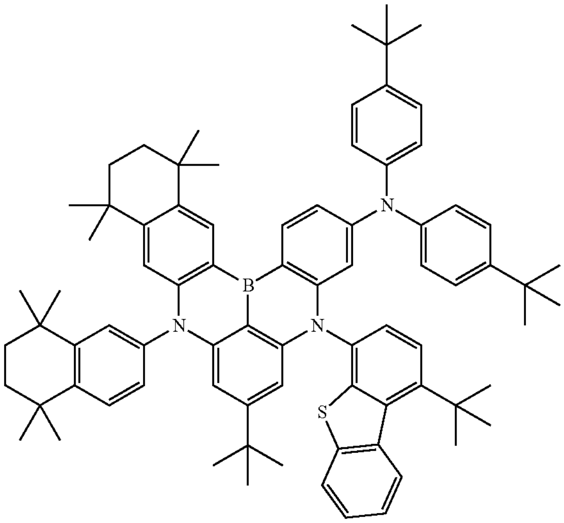 [SMILES: CC(C)(C)c1ccc(N(c2ccc(C(C)(C)C)cc2)c2ccc3c(c2)N(c2ccc(C(C)(C)C)c4c2sc2ccccc24)c2cc(C(C)(C)C)cc4c2B3c2cc3c(cc2N4c2ccc4c(c2)C(C)(C)CCC4(C)C)C(C)(C)CCC3(C)C)cc1]

-continued
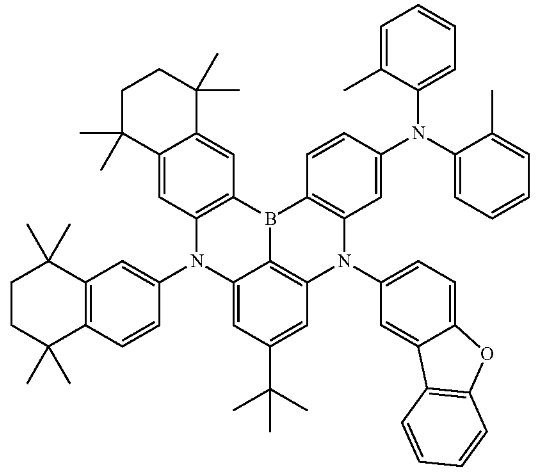
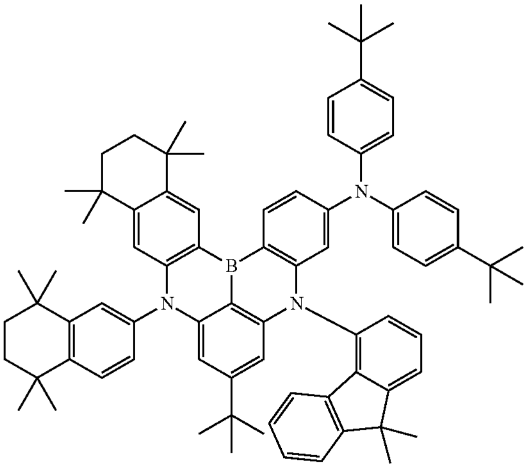
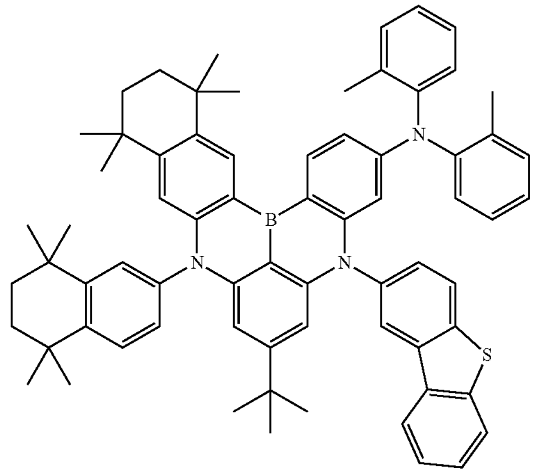
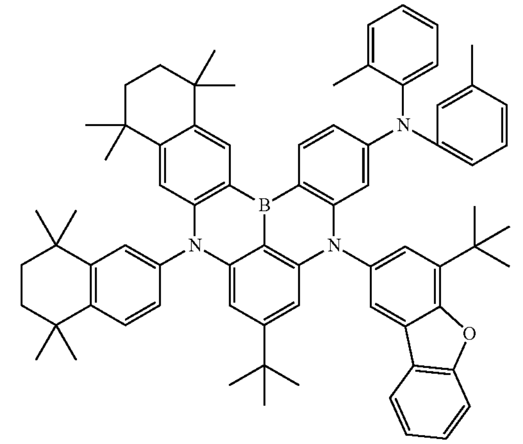
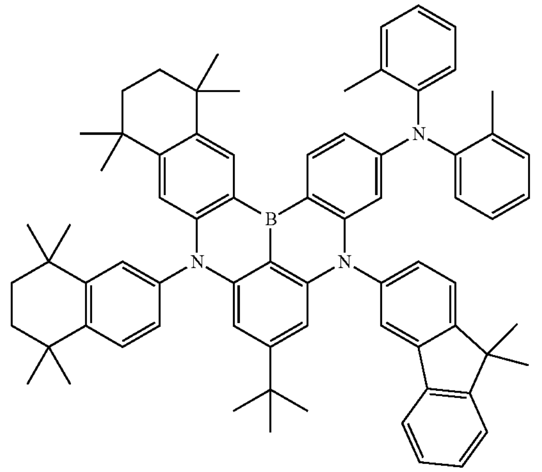
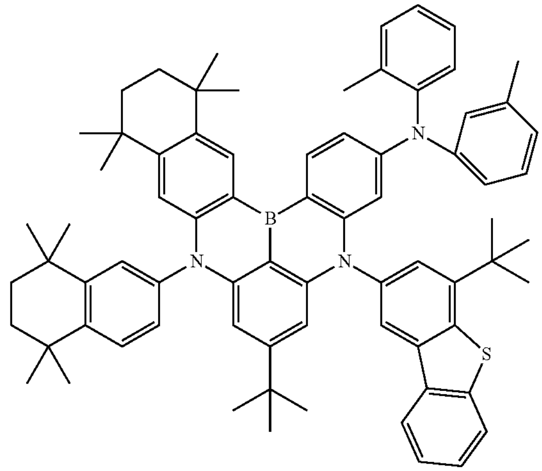

-continued
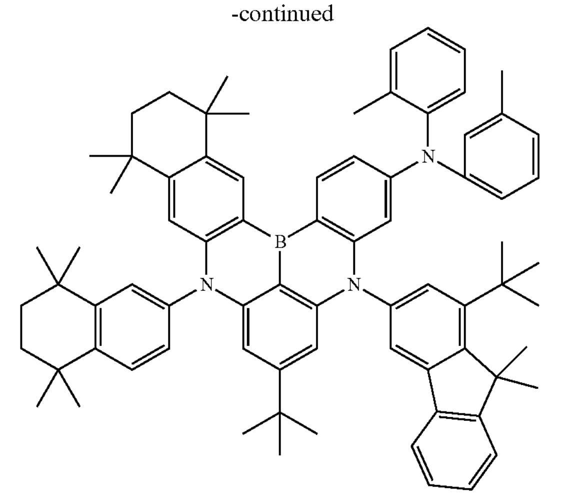
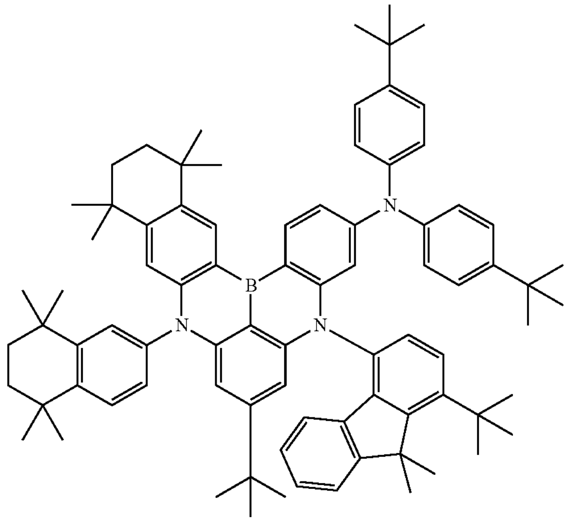
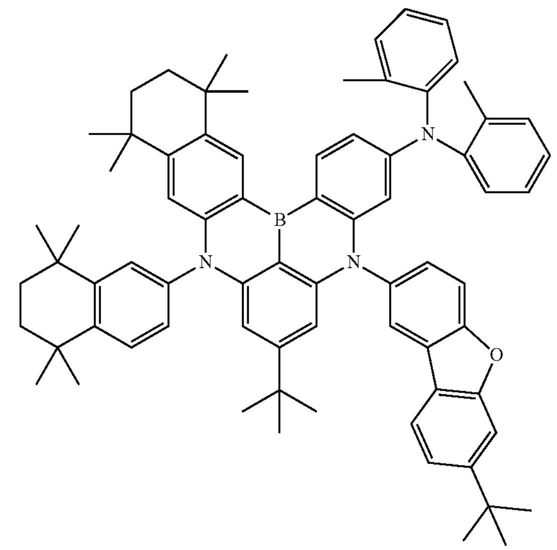
-continued
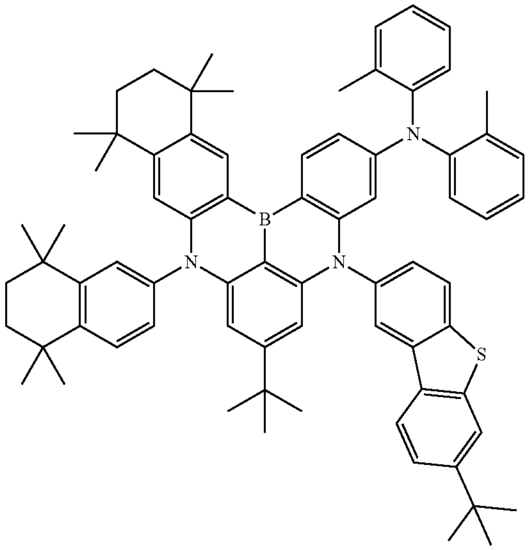
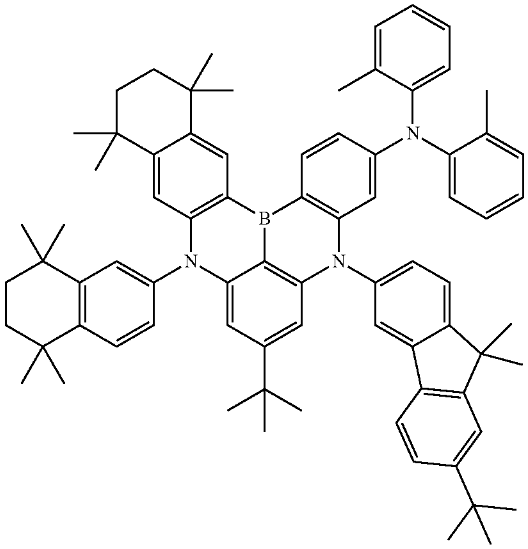
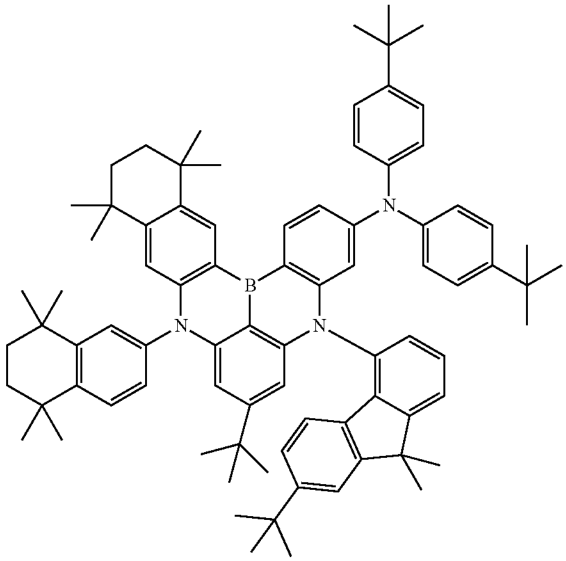

-continued
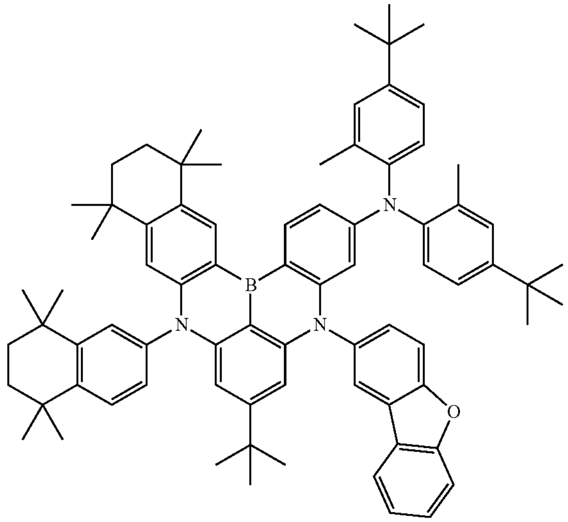
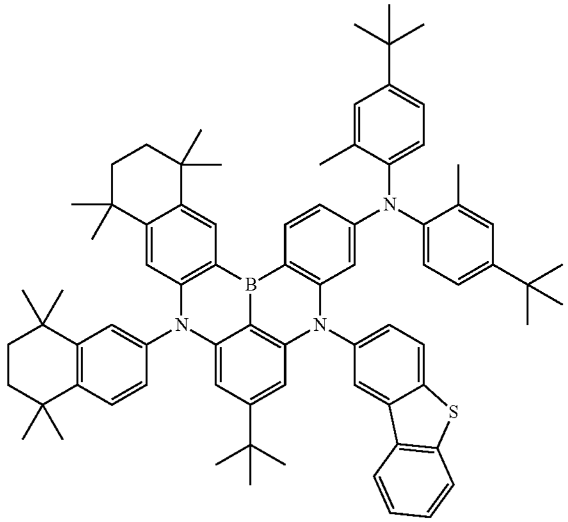
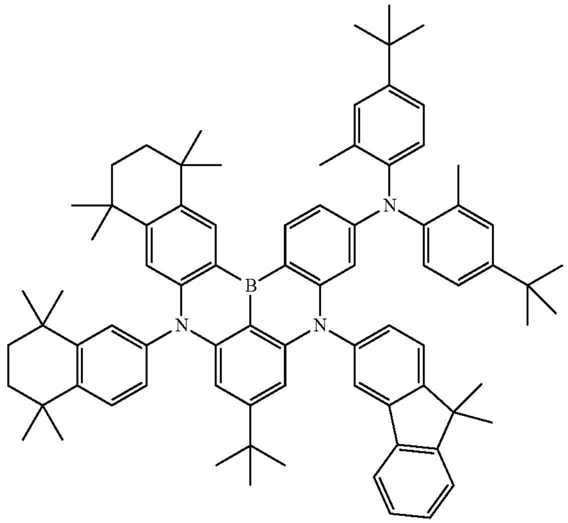
-continued
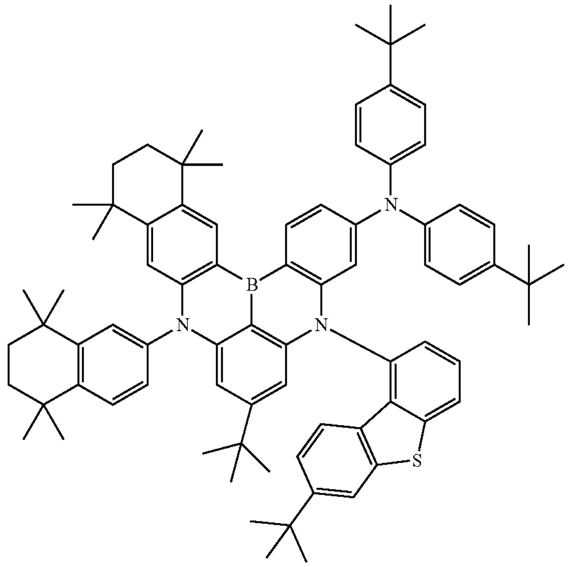
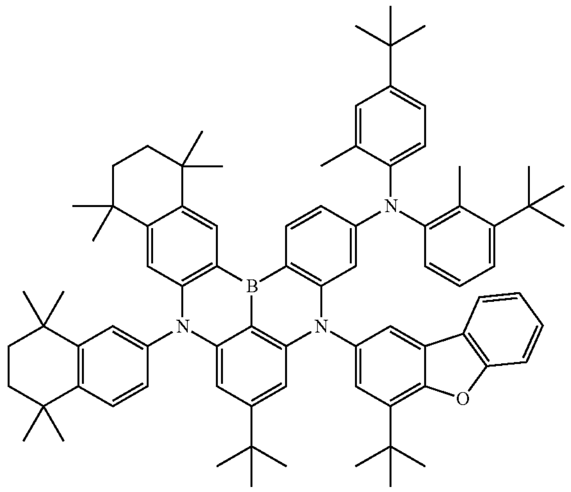
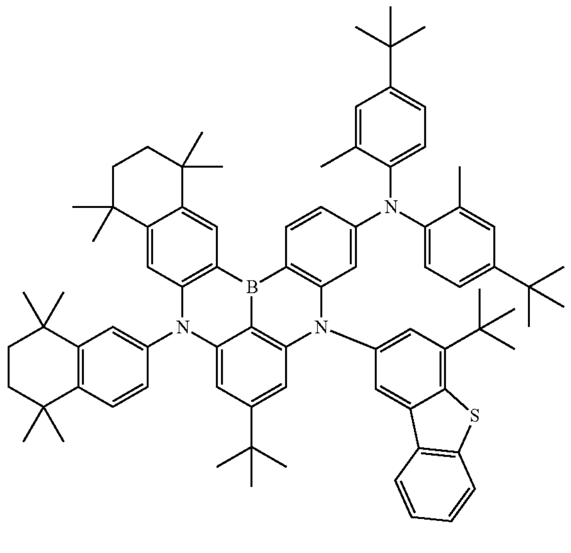

-continued
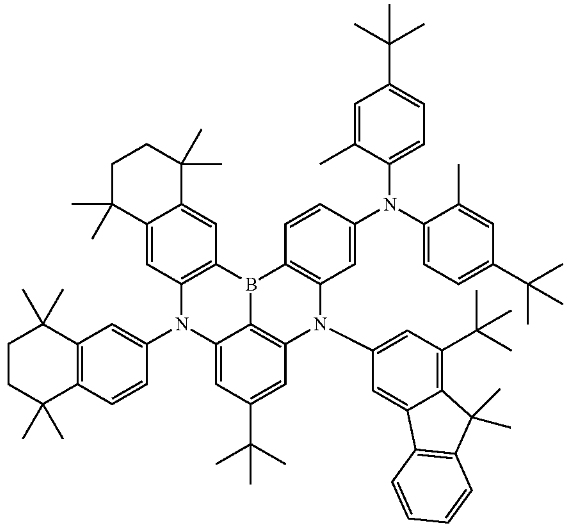
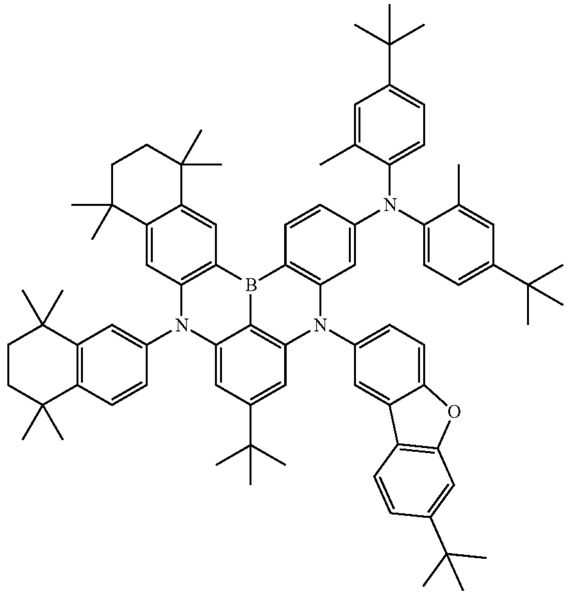
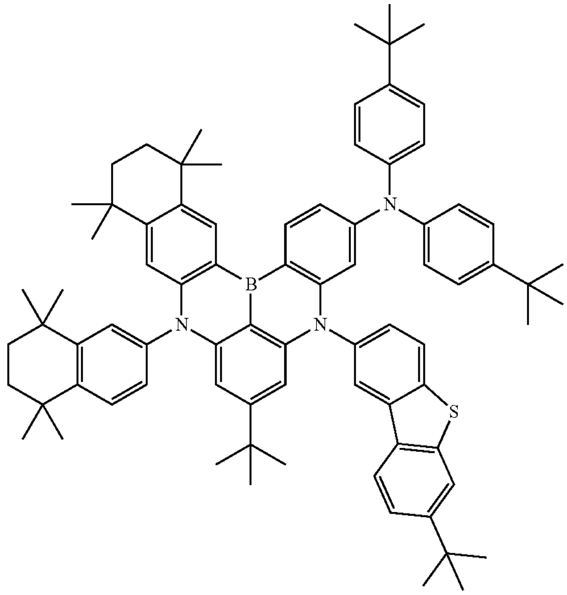
-continued
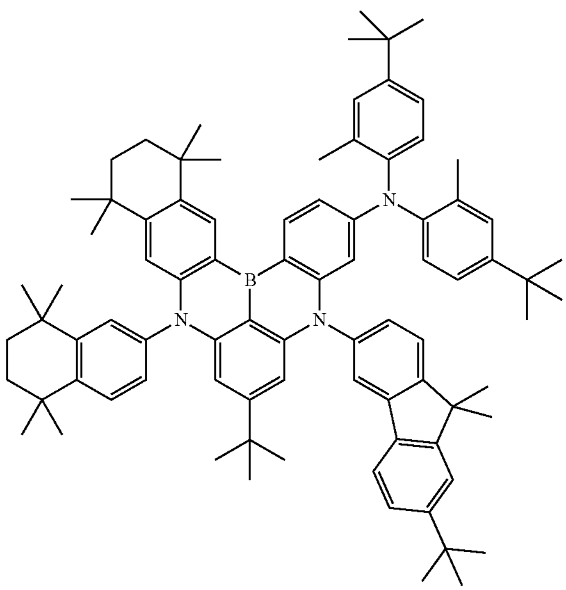
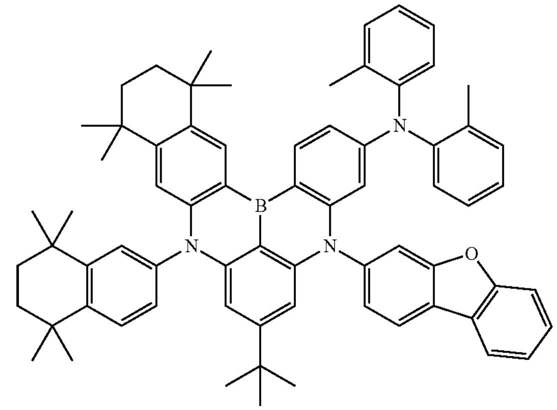
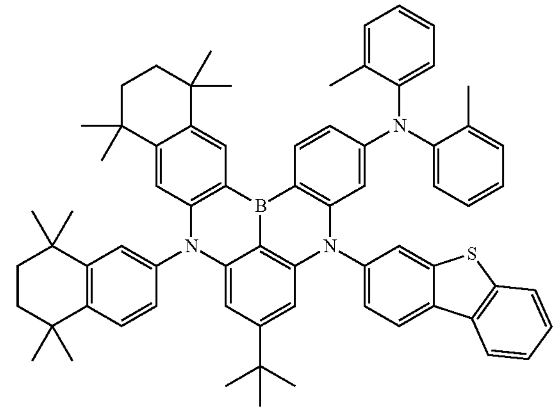

-continued
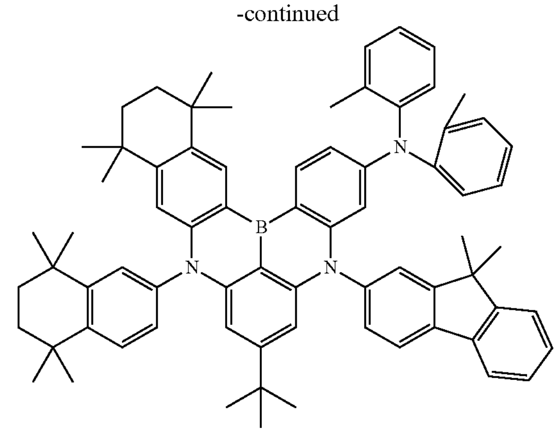
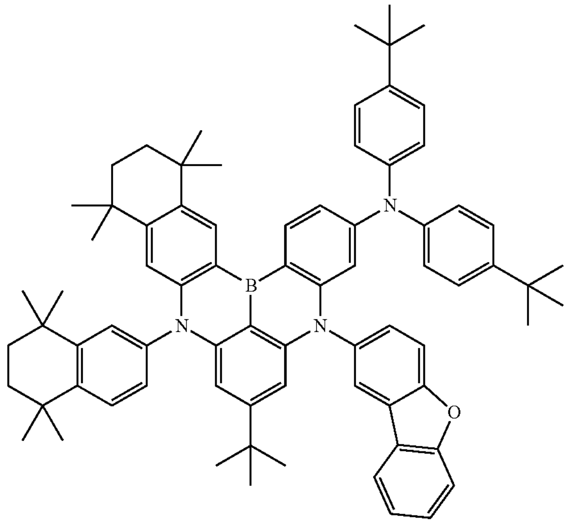
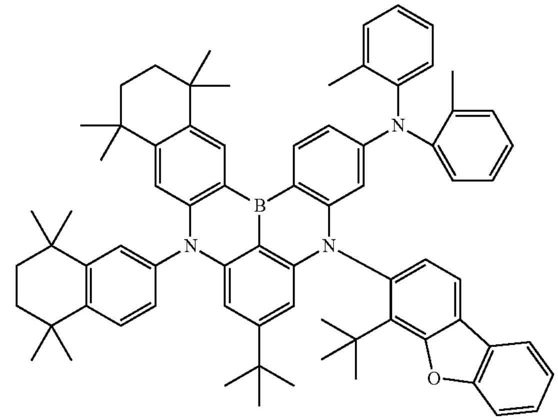
-continued
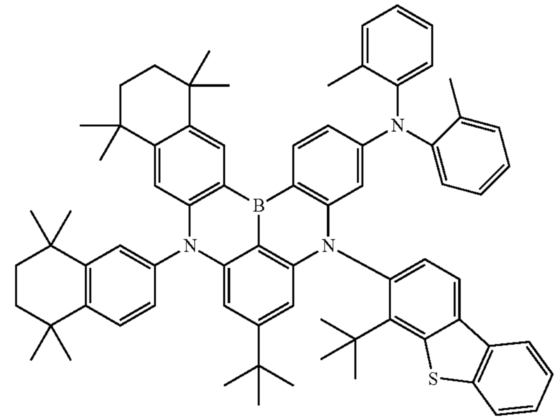
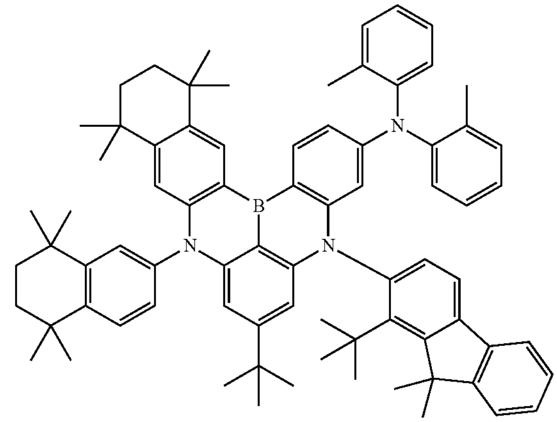
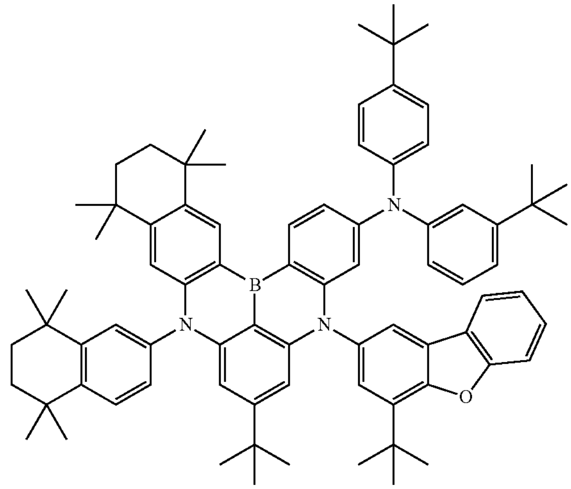
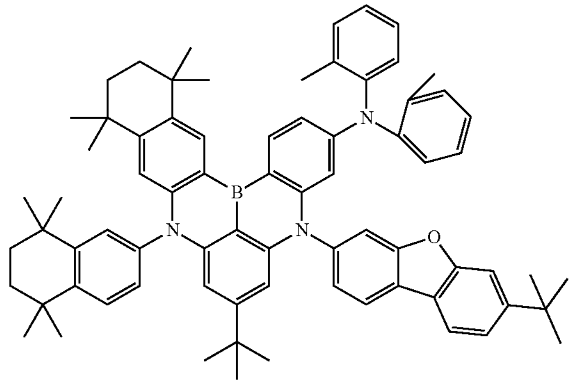

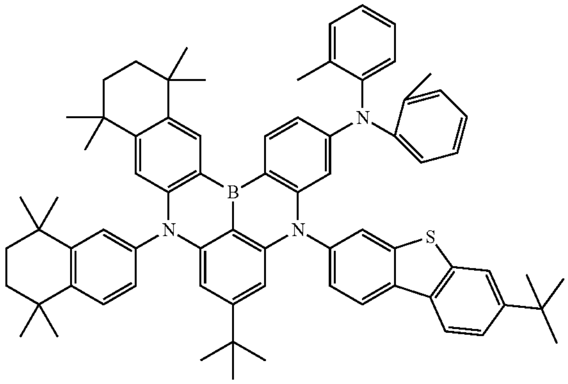
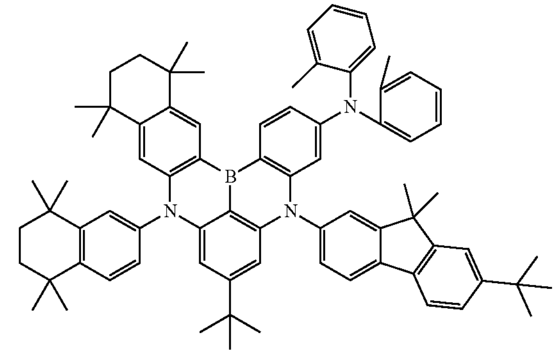
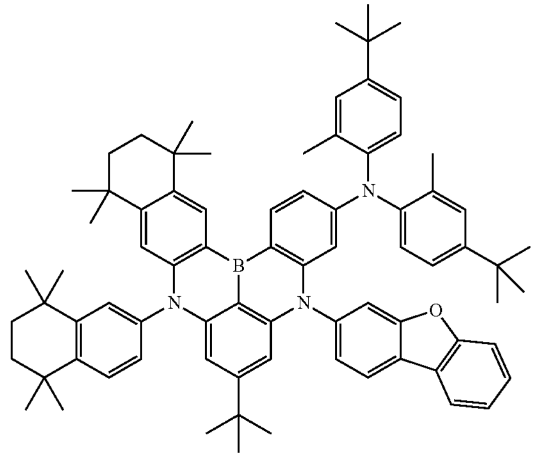
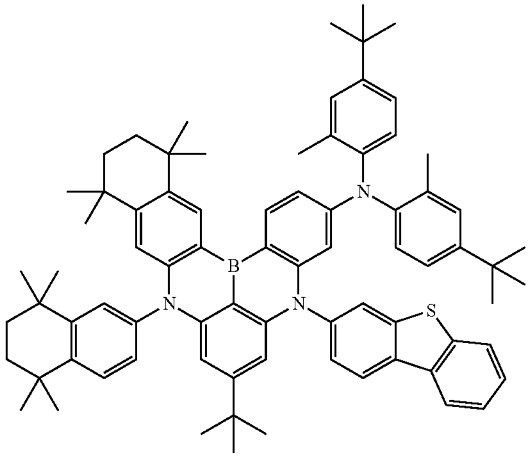
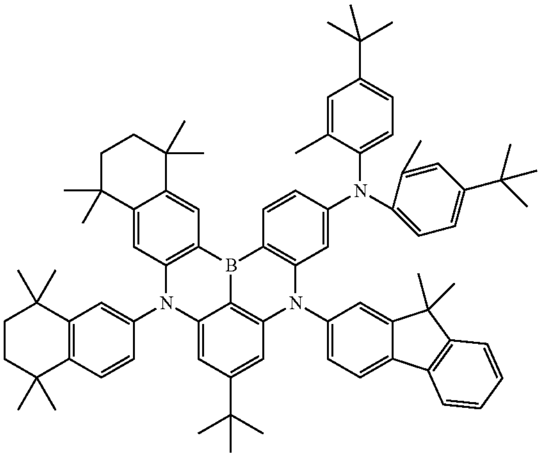
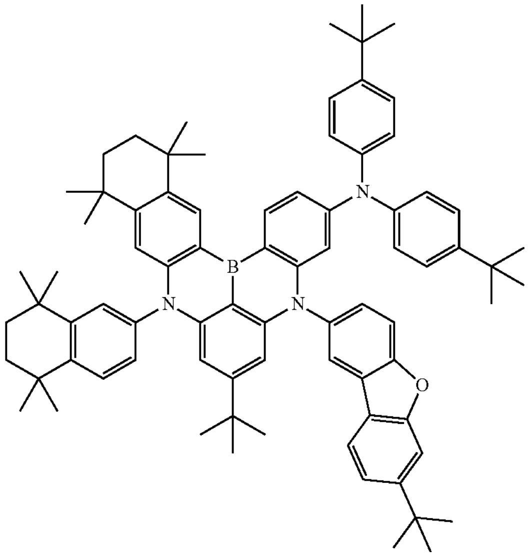
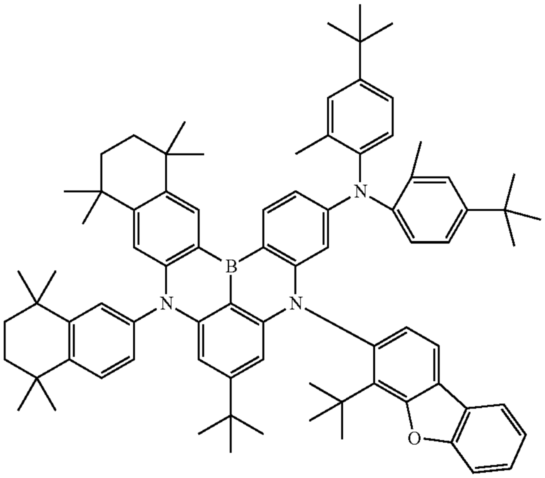

-continued
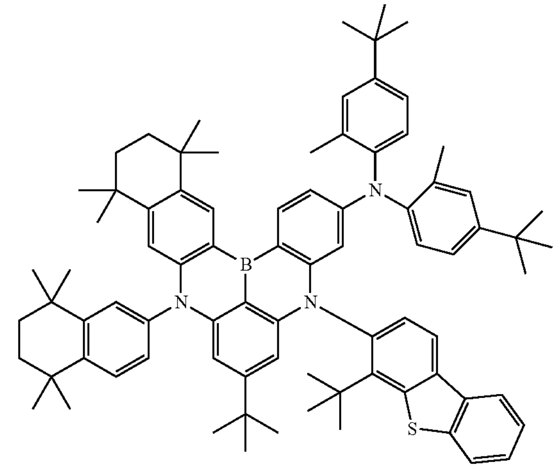
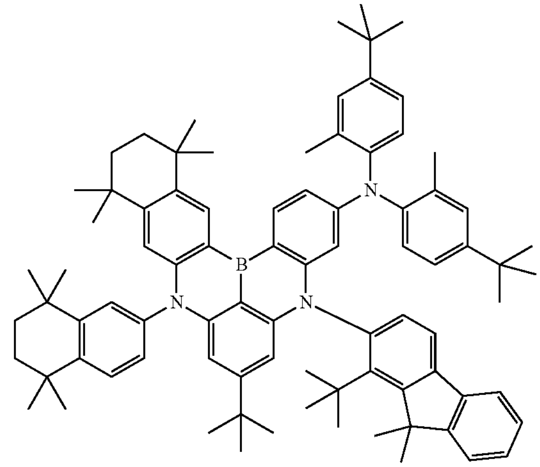
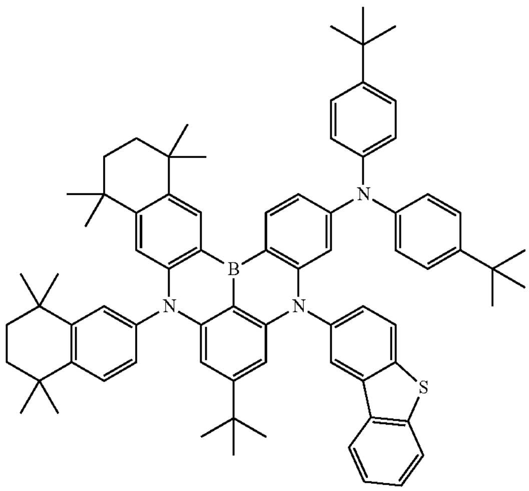
-continued
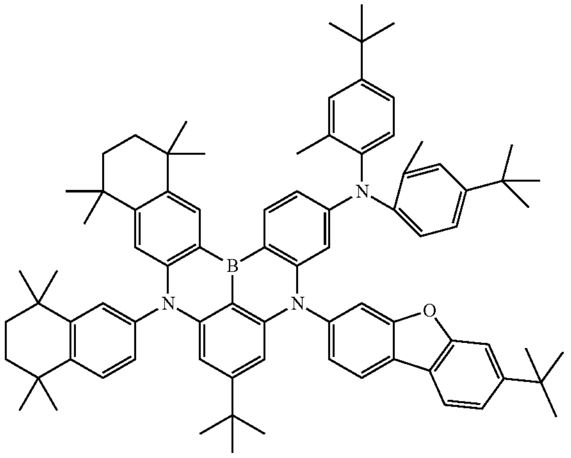
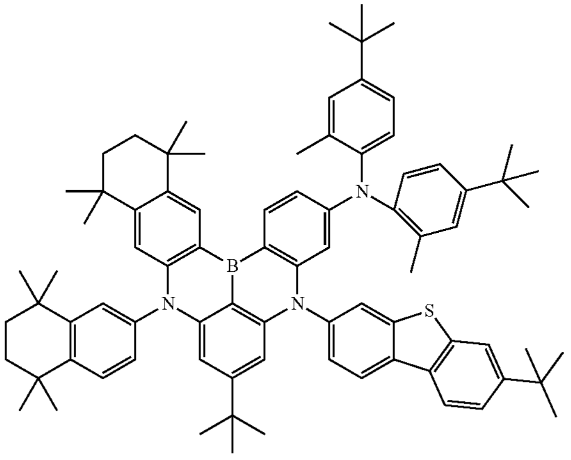
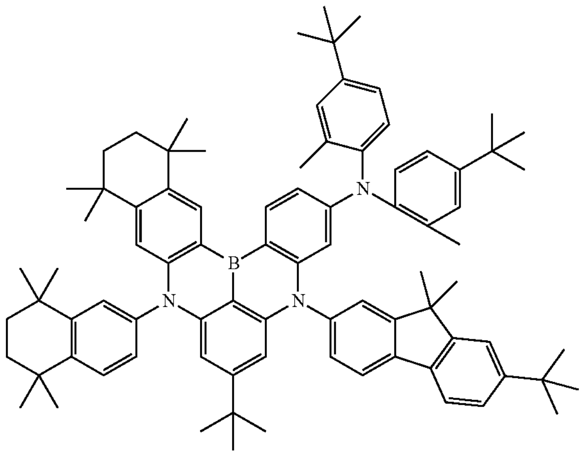

-continued
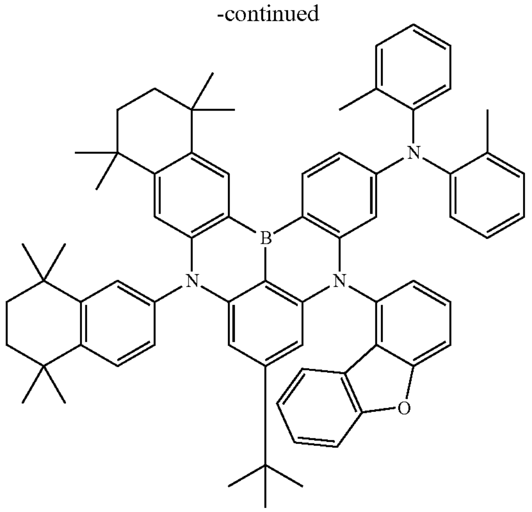
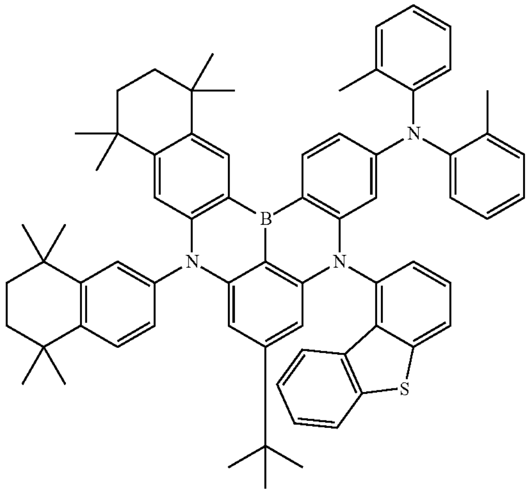
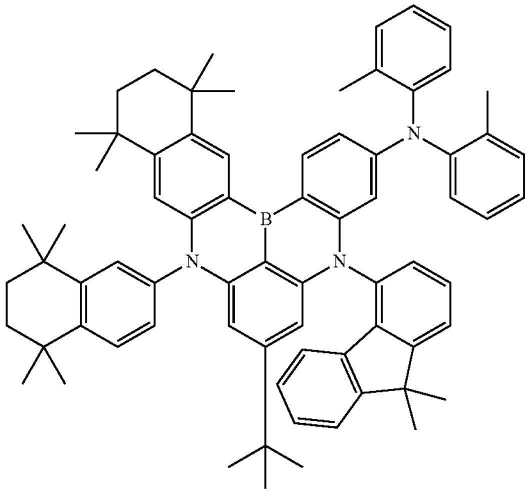
-continued
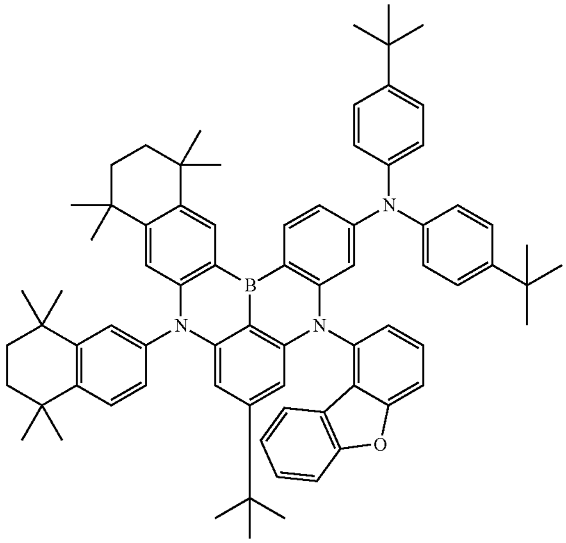
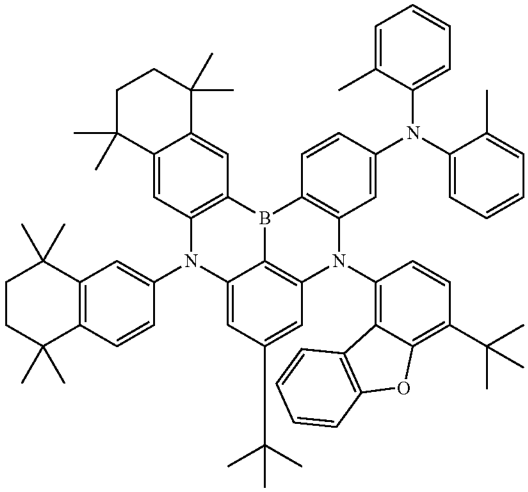
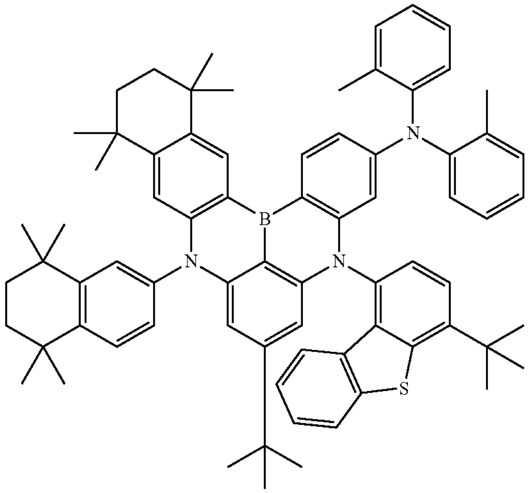

-continued
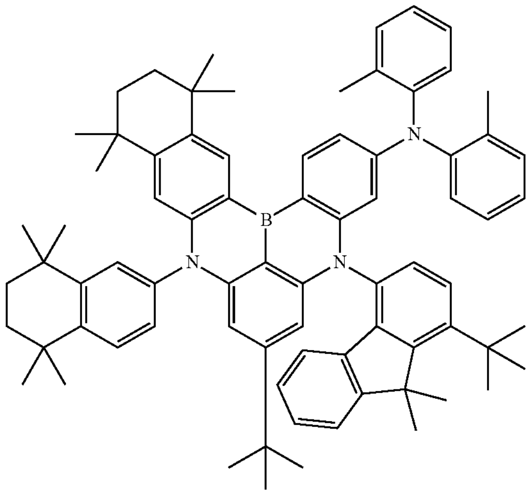
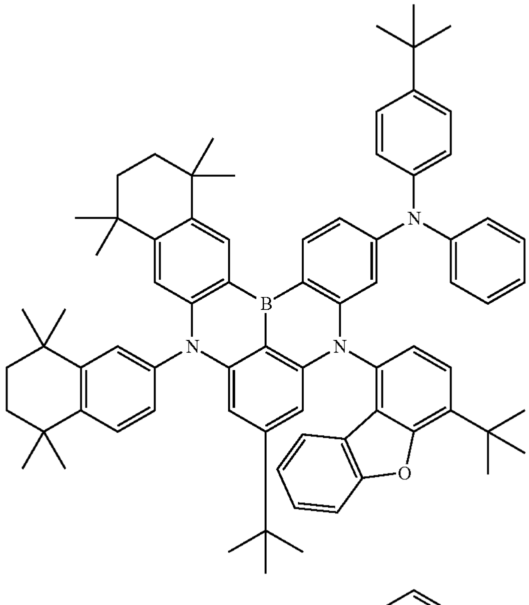
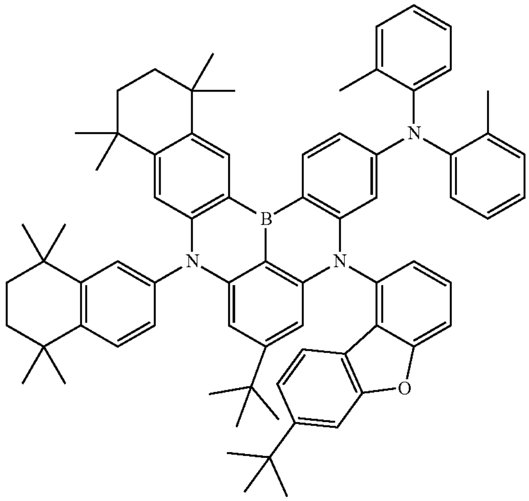
-continued
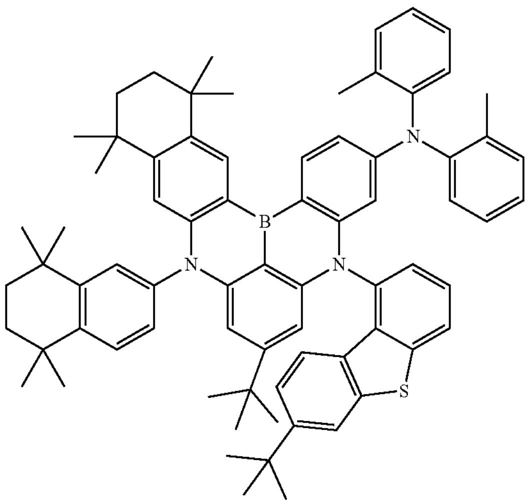
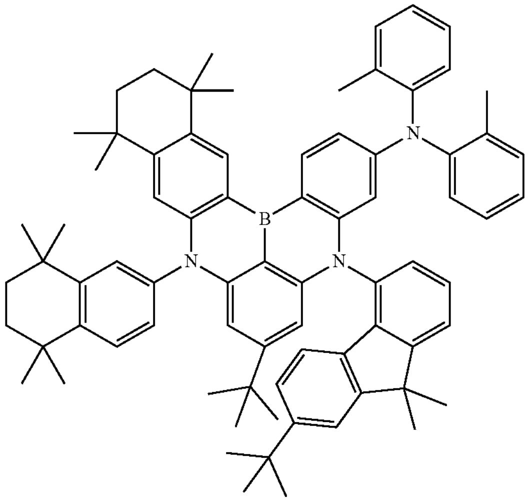
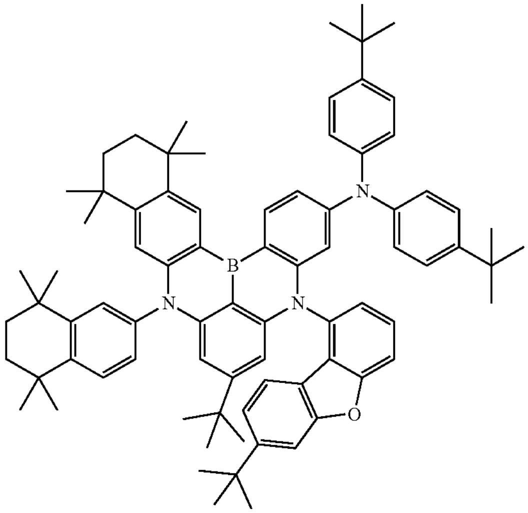

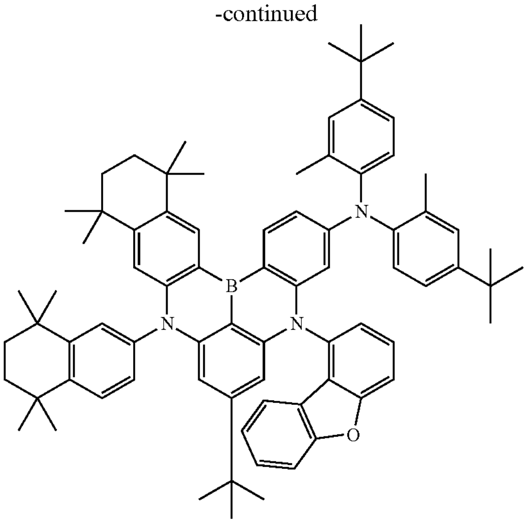
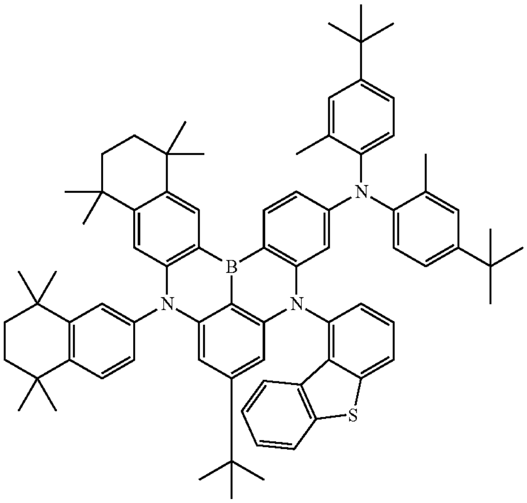
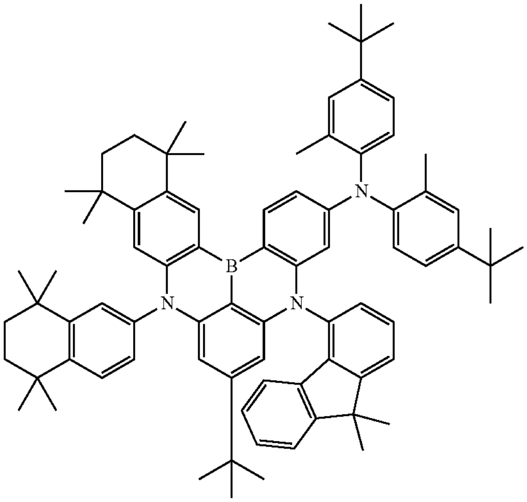
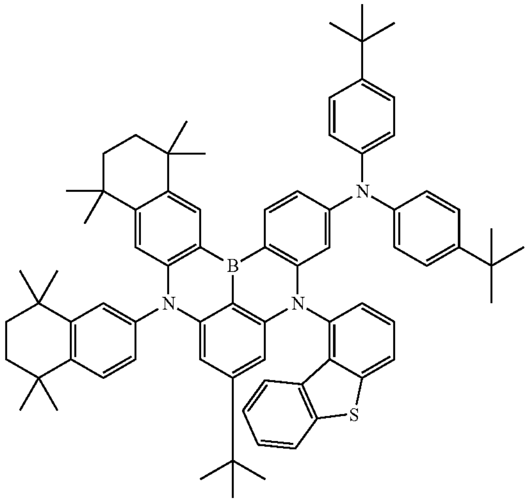
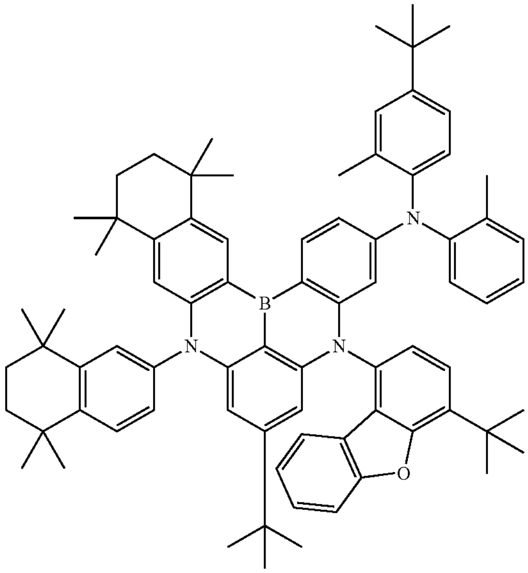
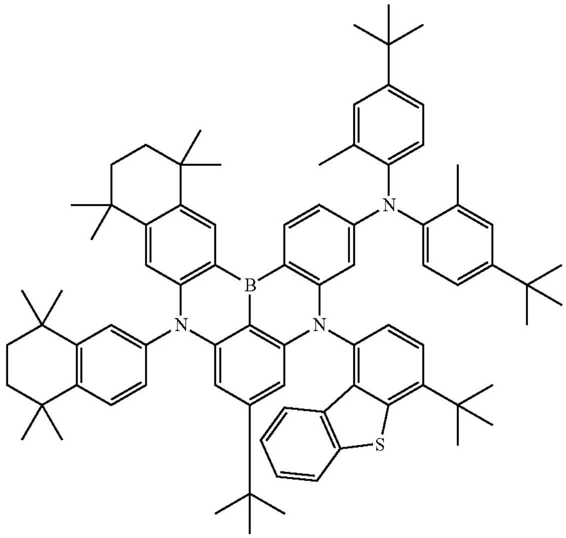

-continued
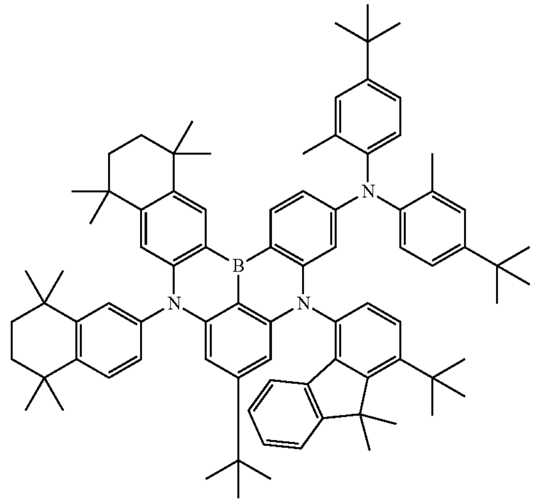
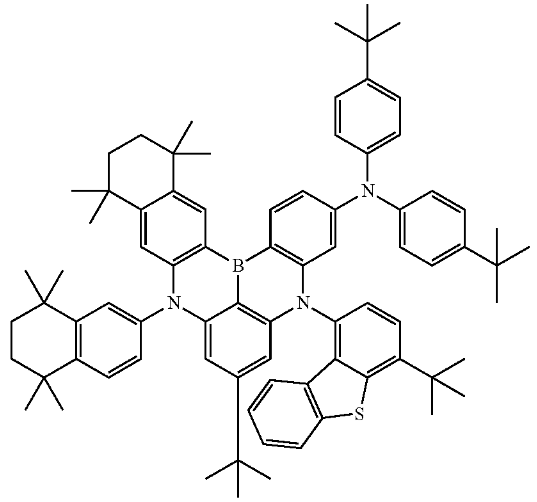
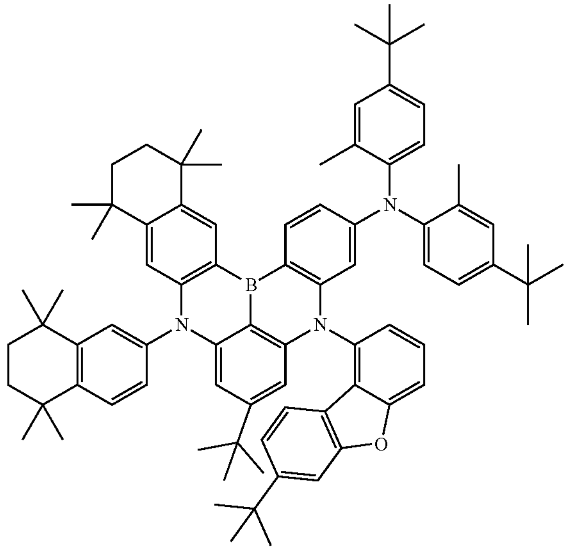
-continued
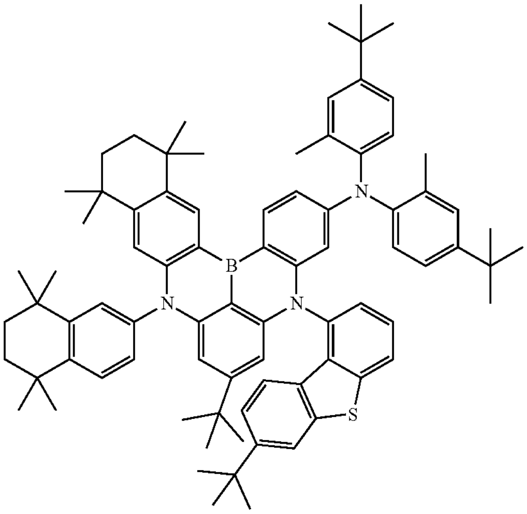
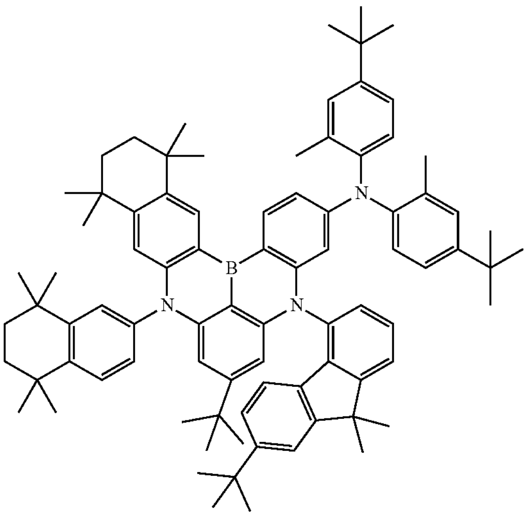
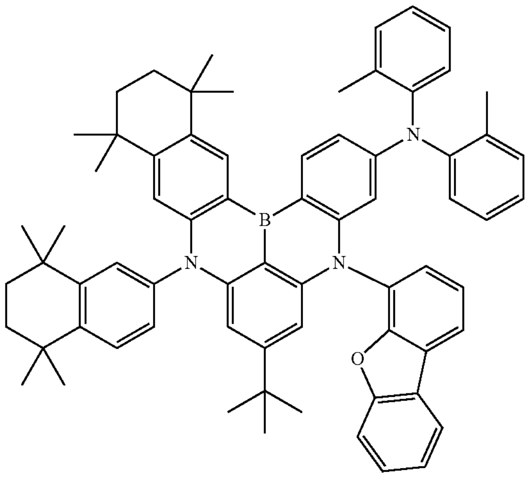

-continued
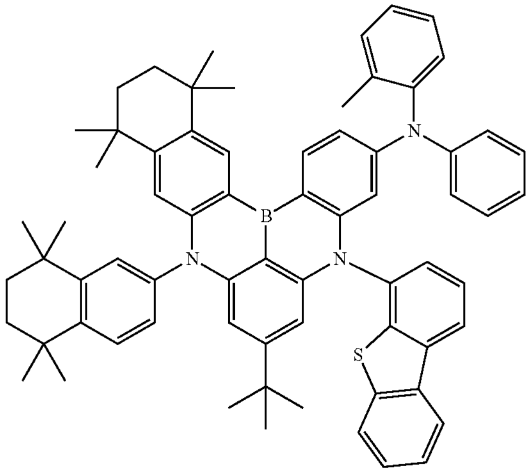
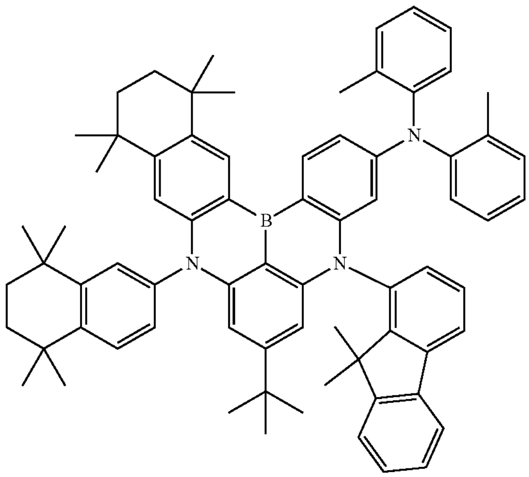
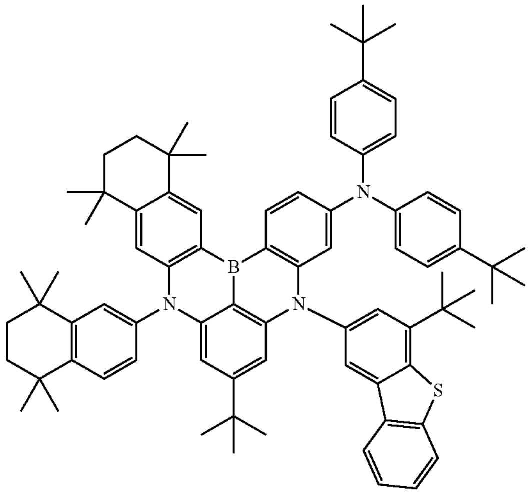
-continued
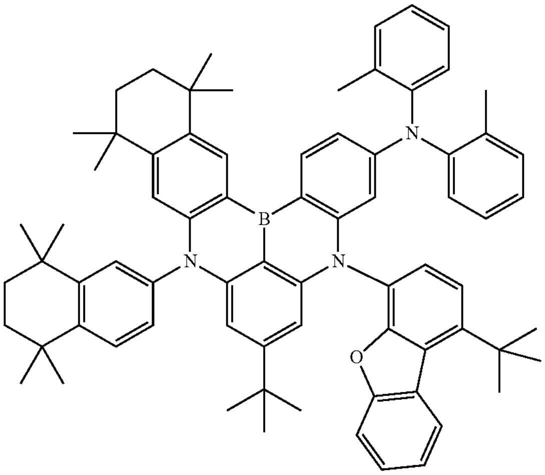
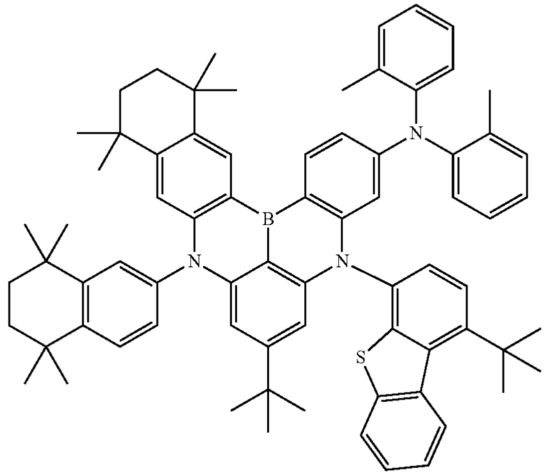
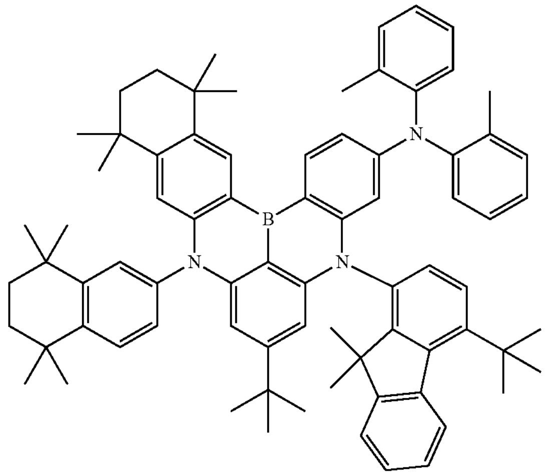

-continued
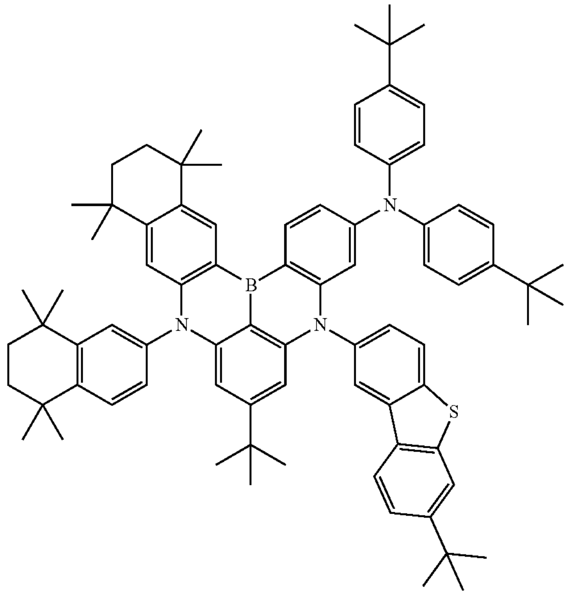
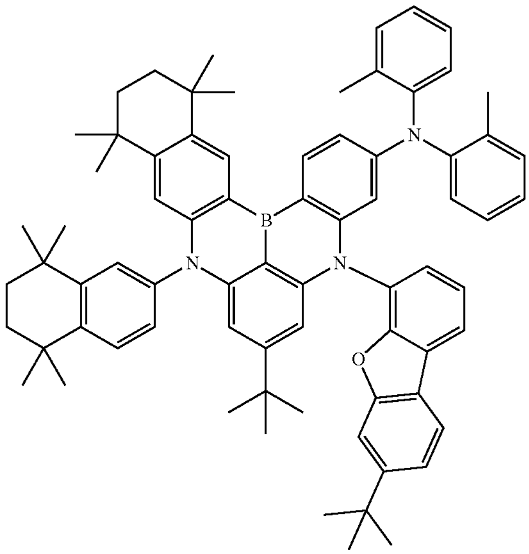
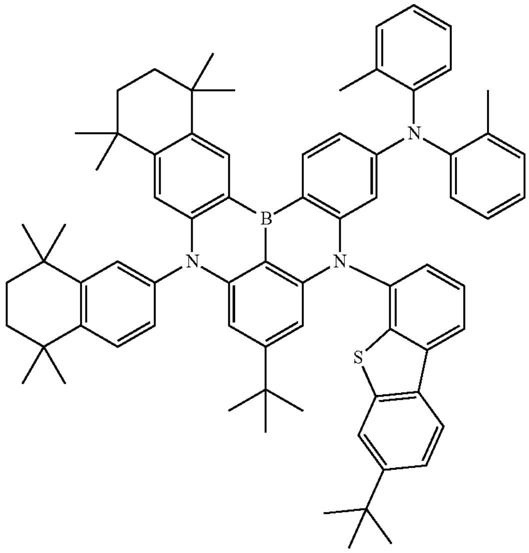
-continued
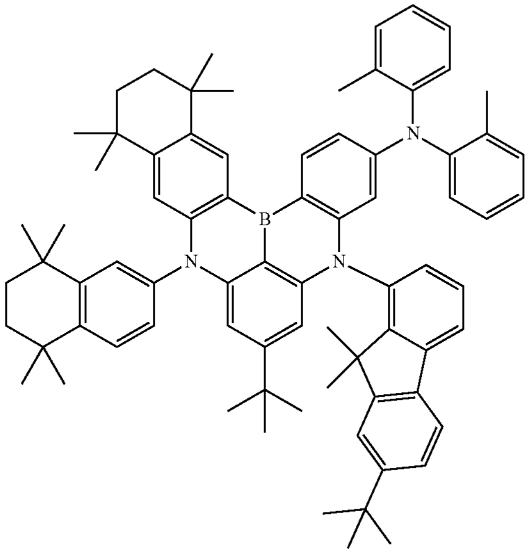
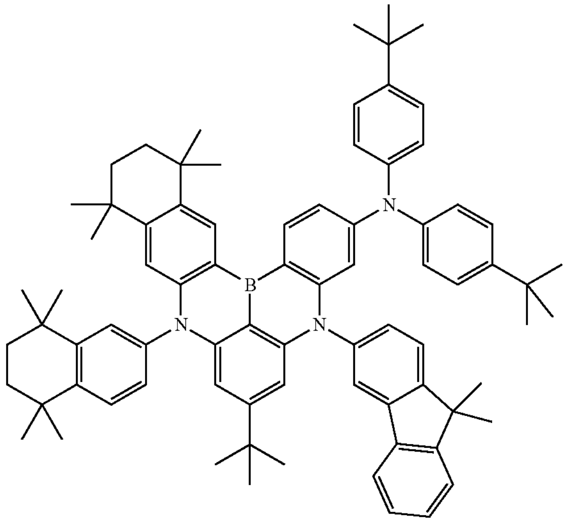
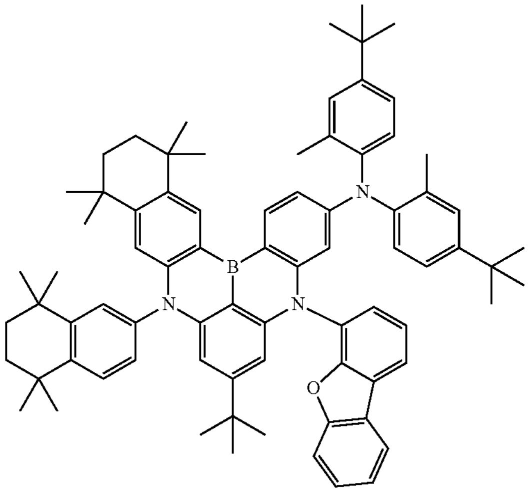

-continued
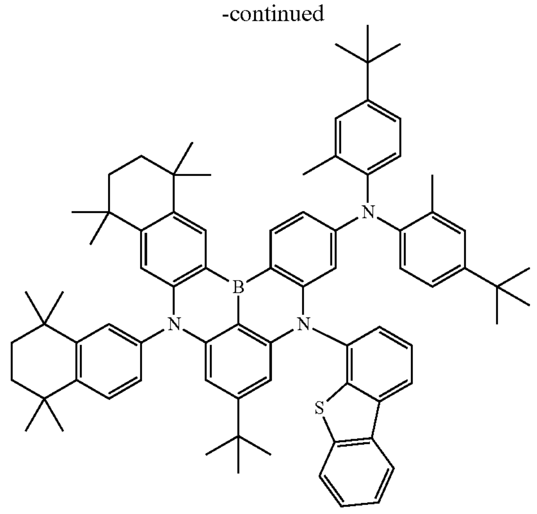
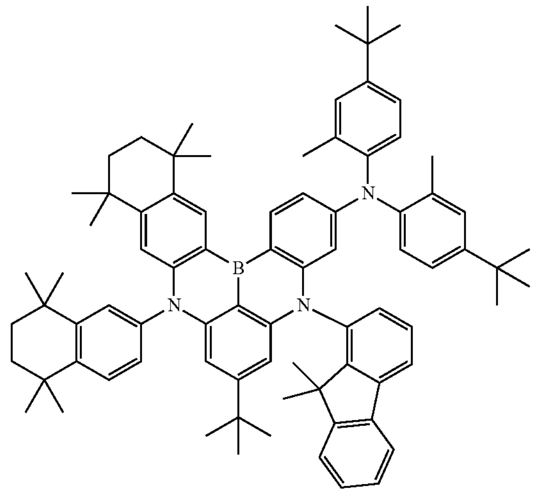
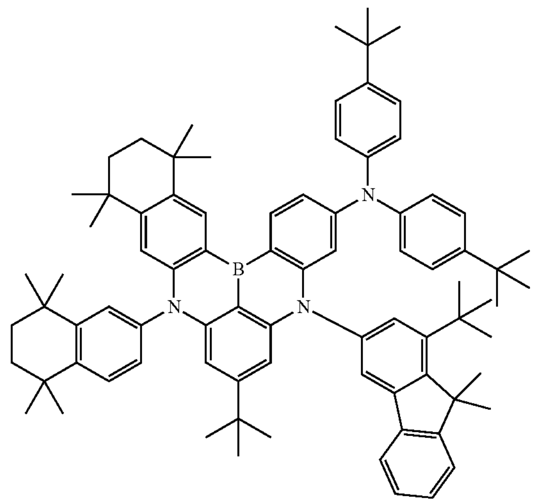
-continued
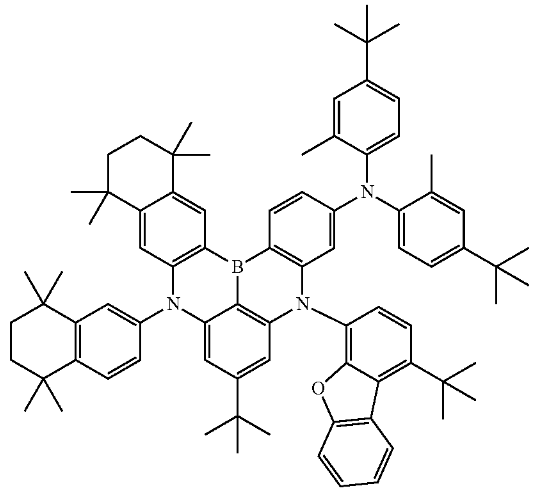
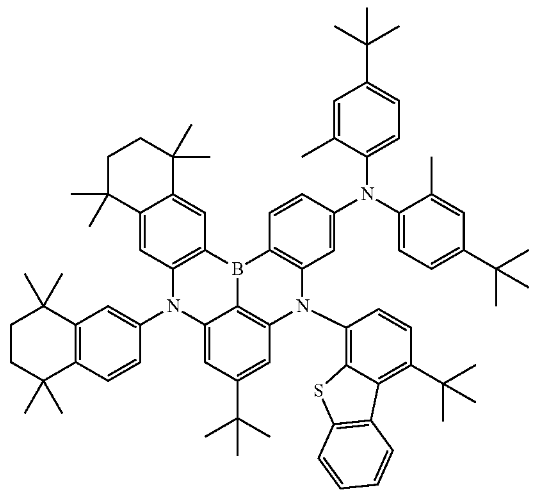
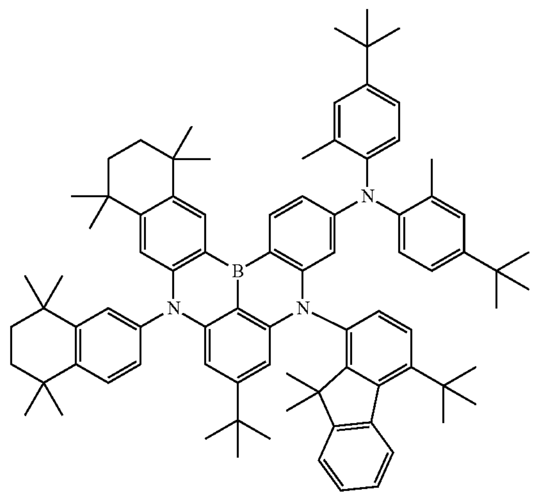

-continued
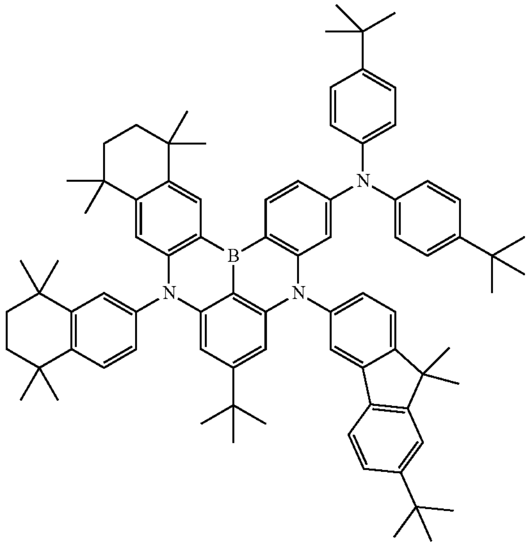
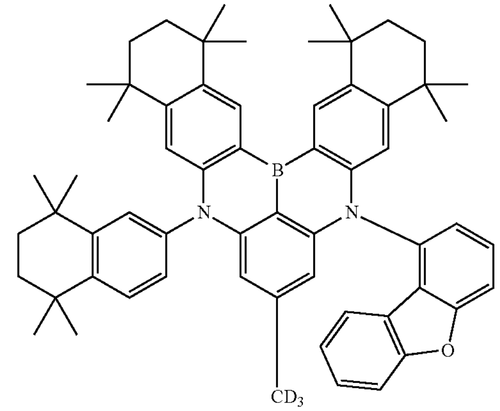
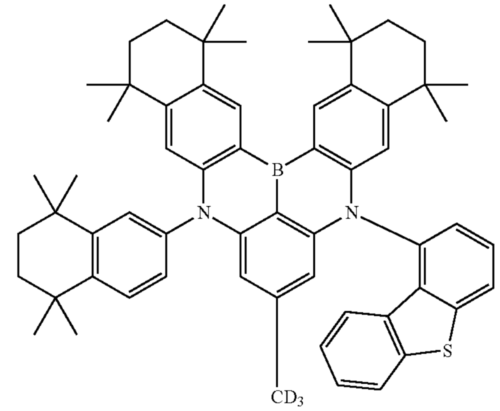
-continued
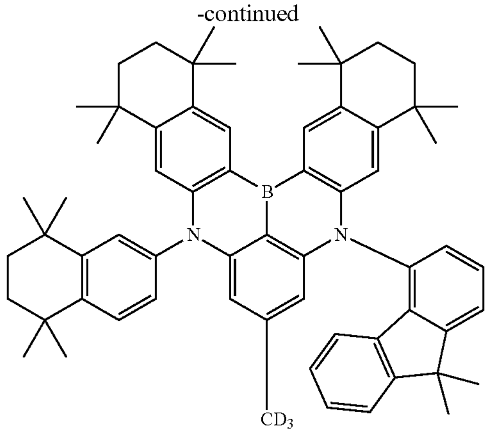
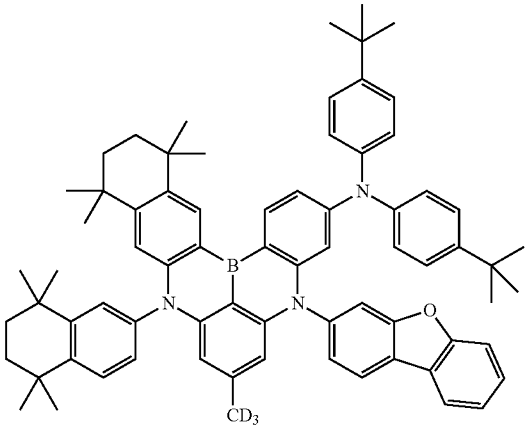
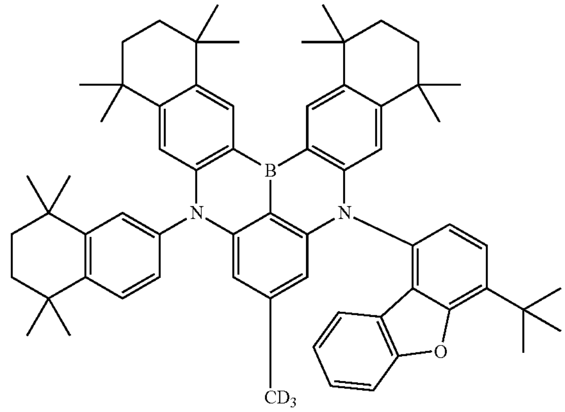
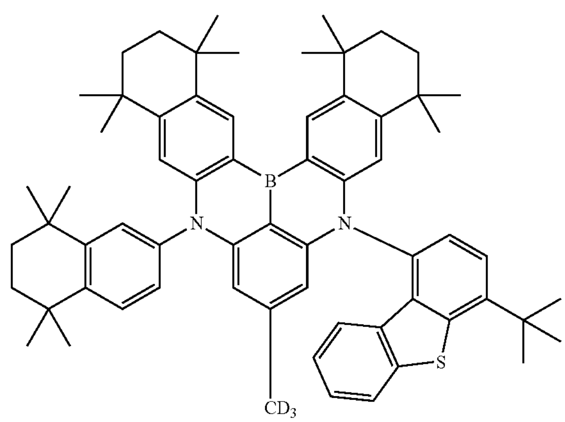

-continued
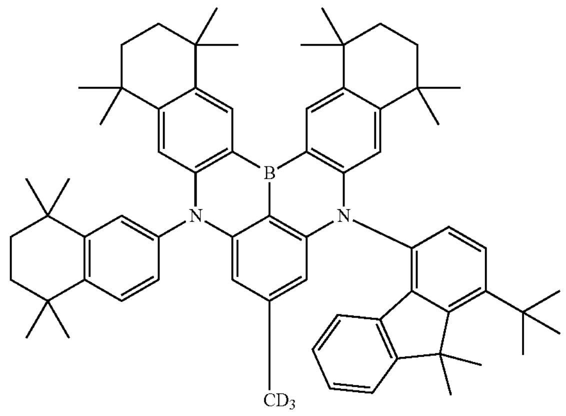
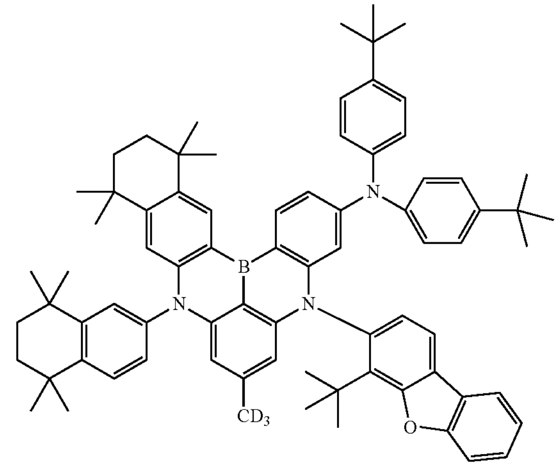
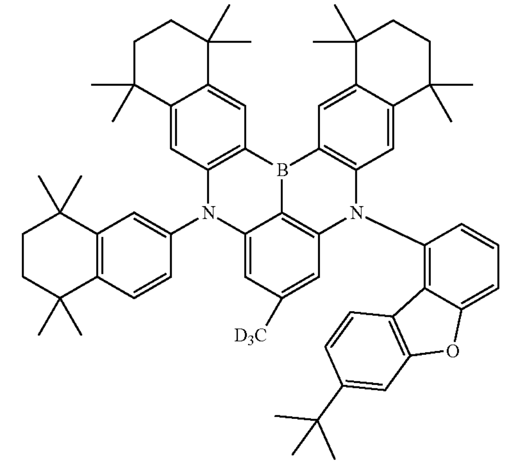
-continued
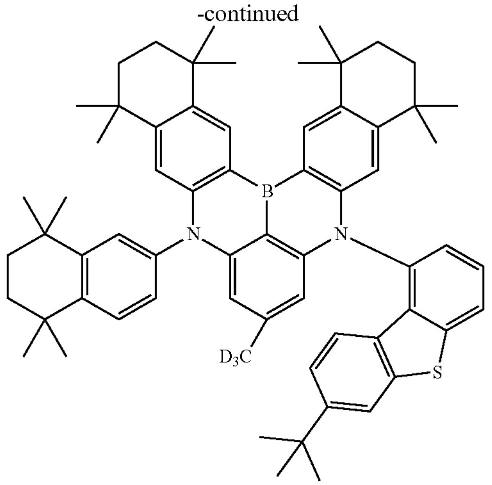
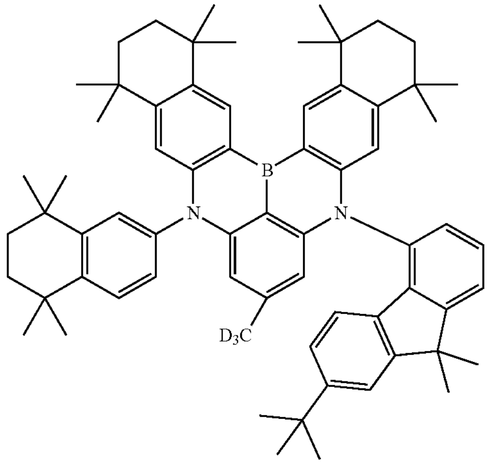
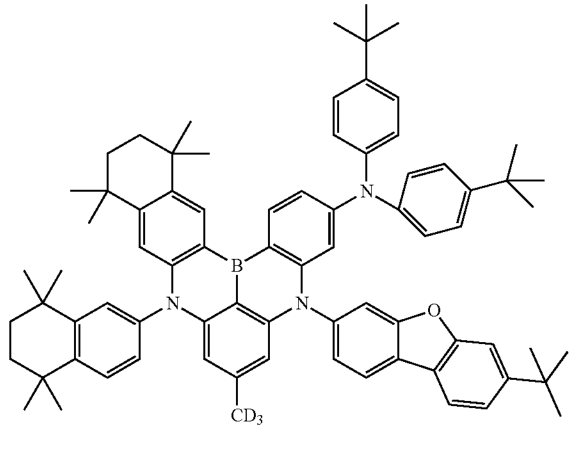

-continued
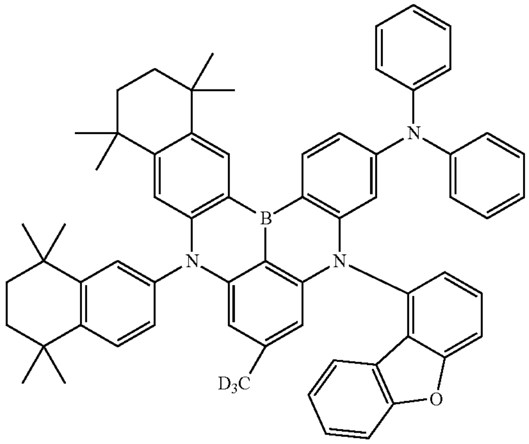
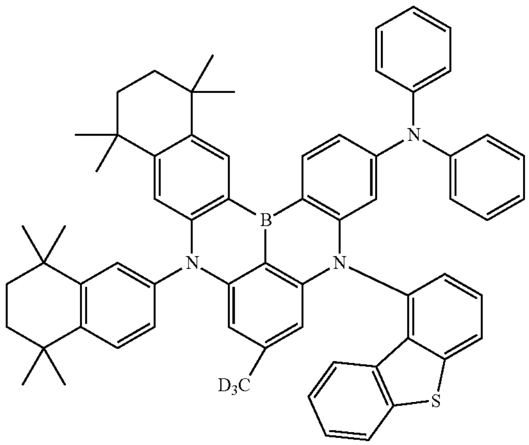
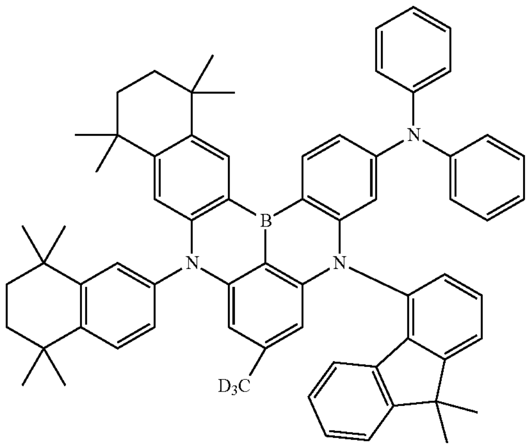
-continued
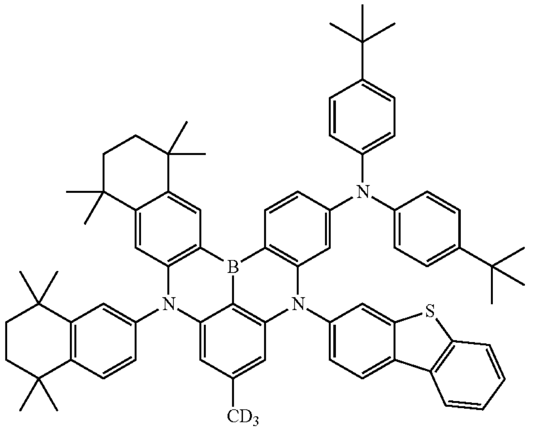
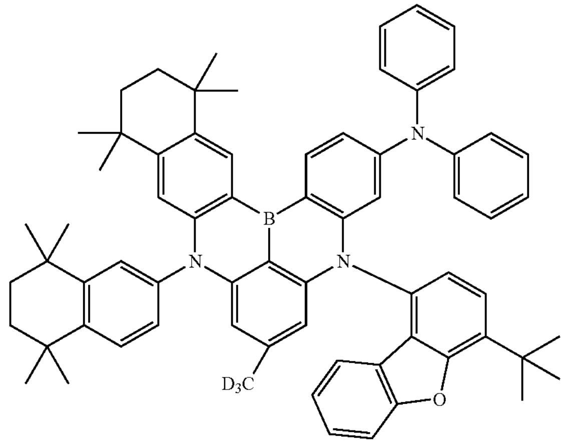
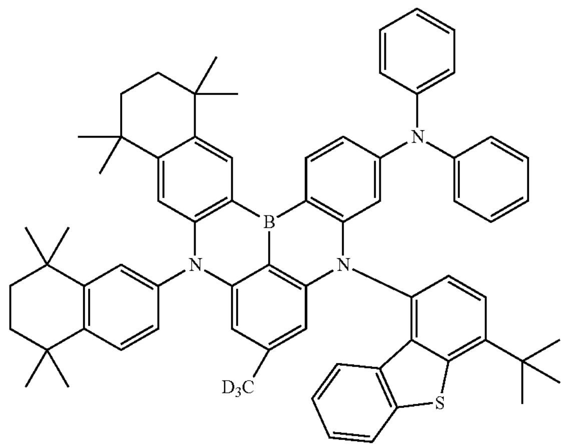

-continued
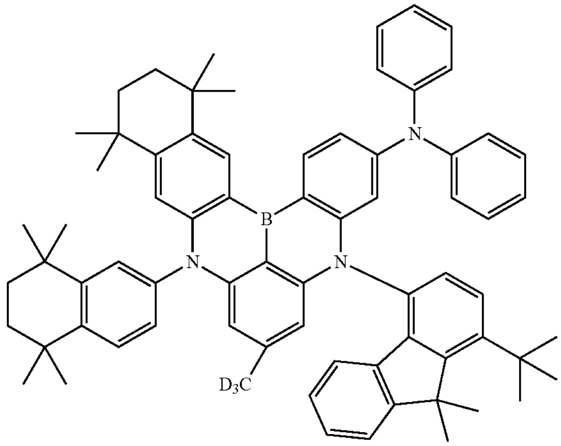
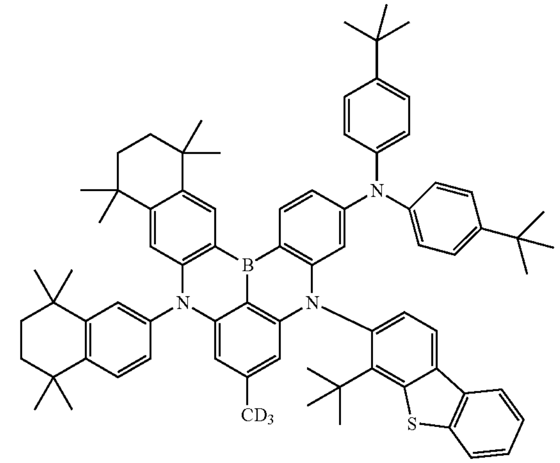
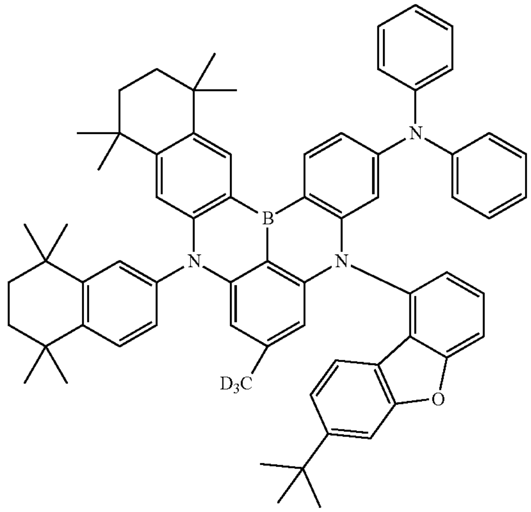
-continued
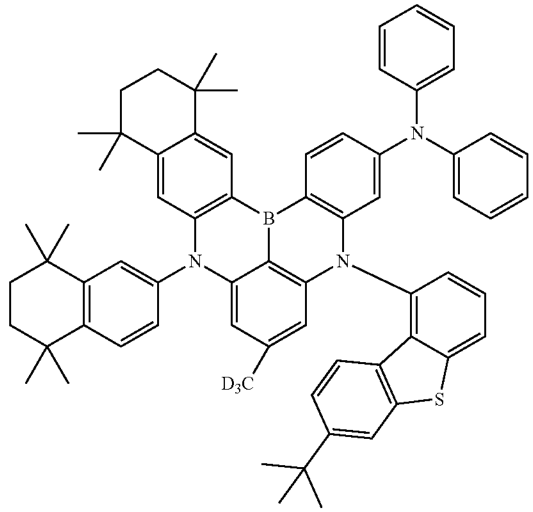
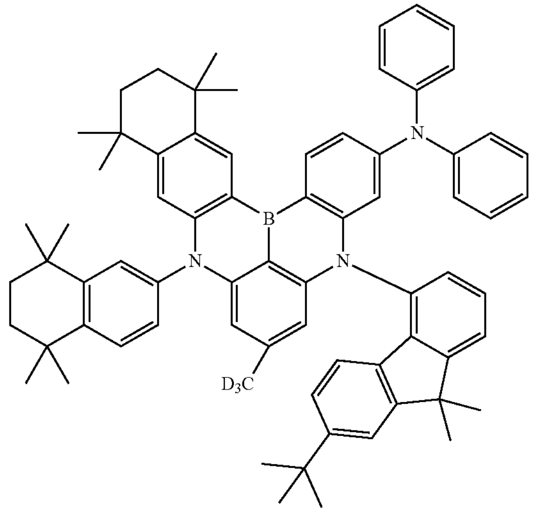
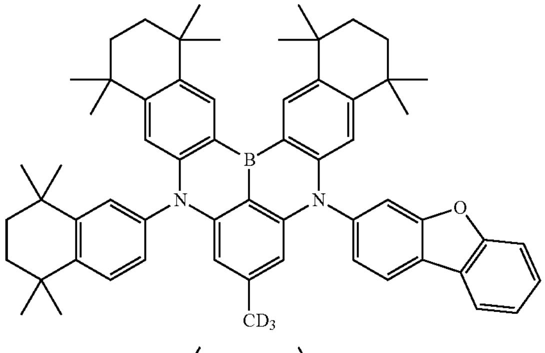
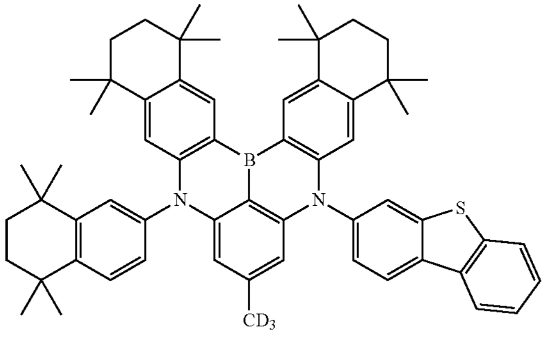

-continued
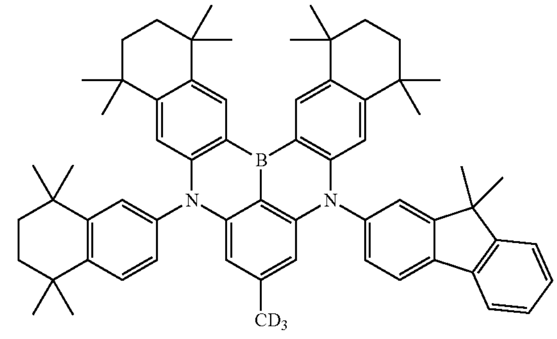
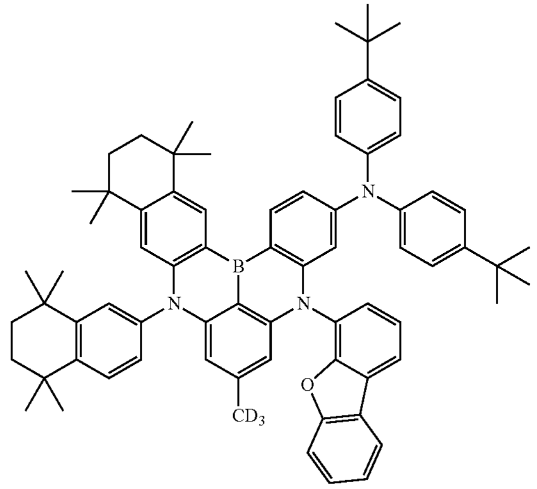
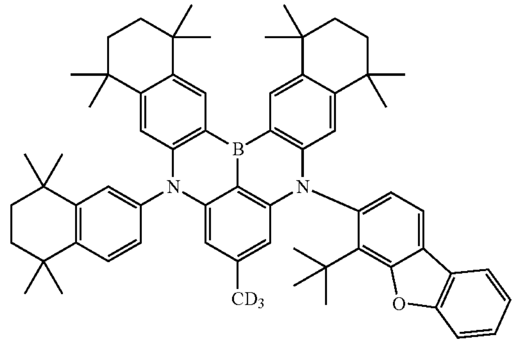
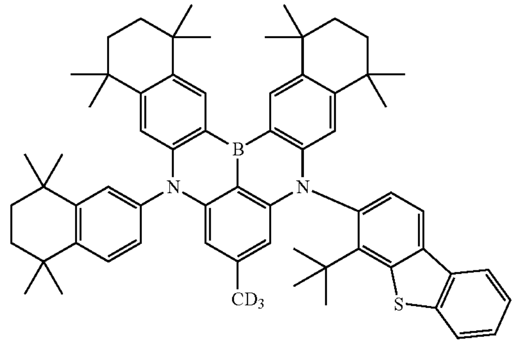
-continued
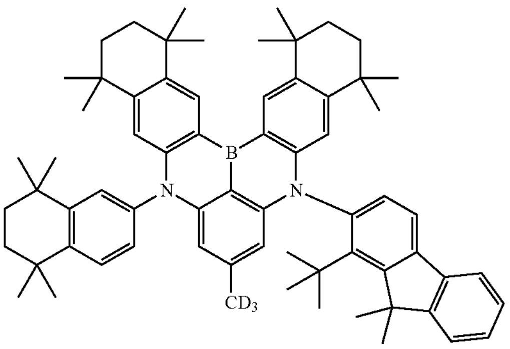
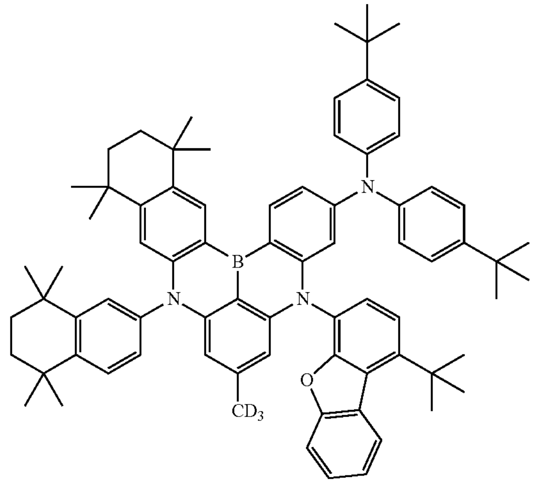
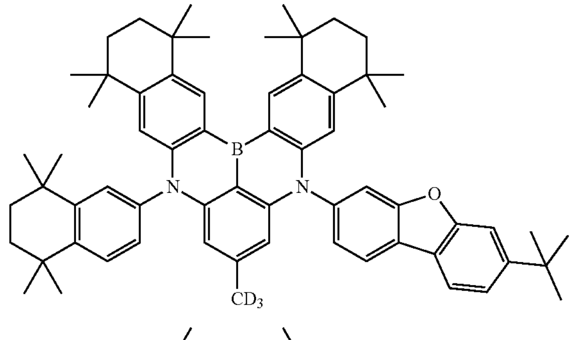
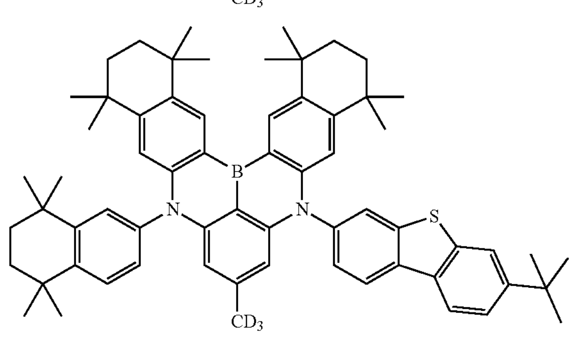

-continued
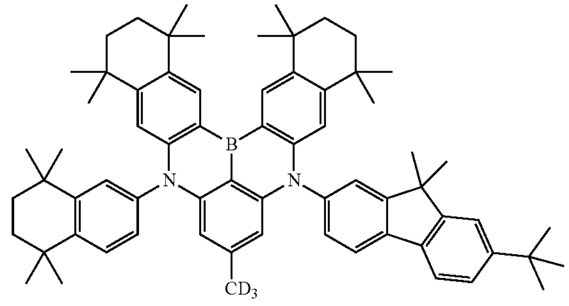
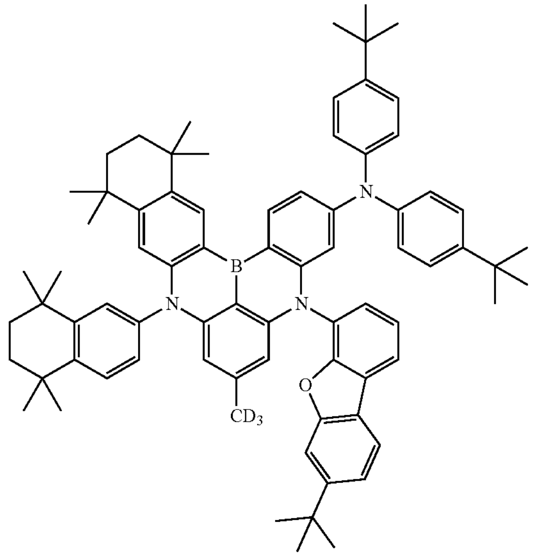
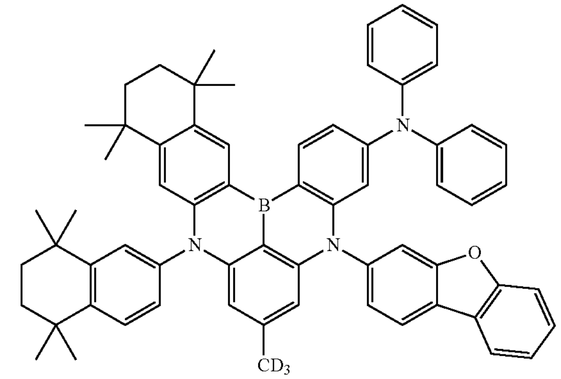
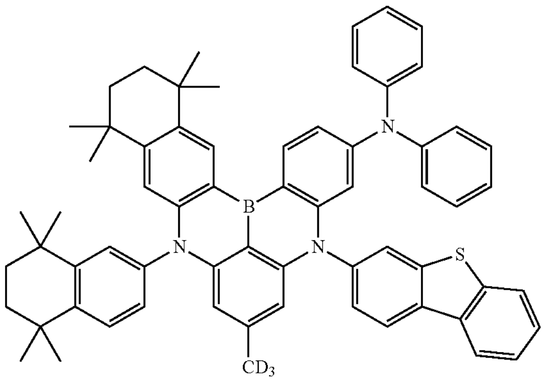
-continued
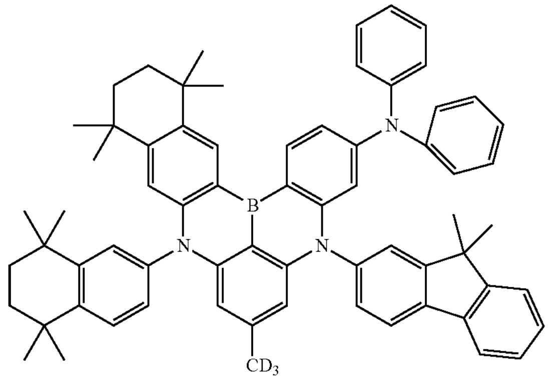
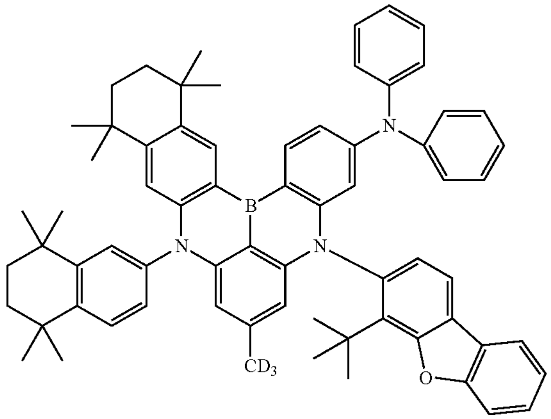
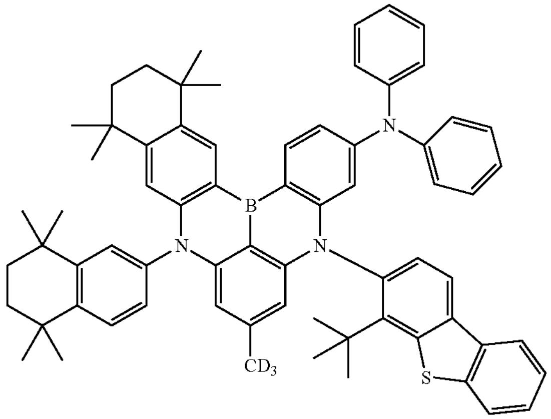
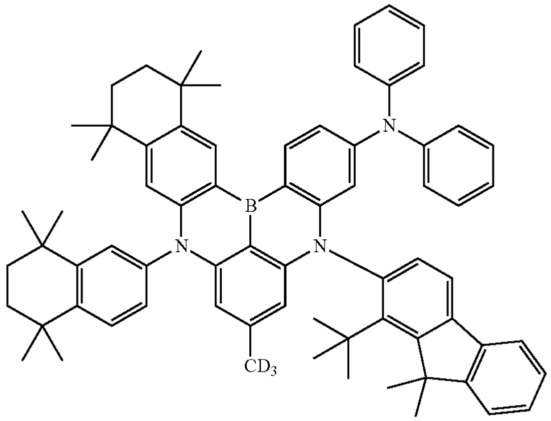

-continued
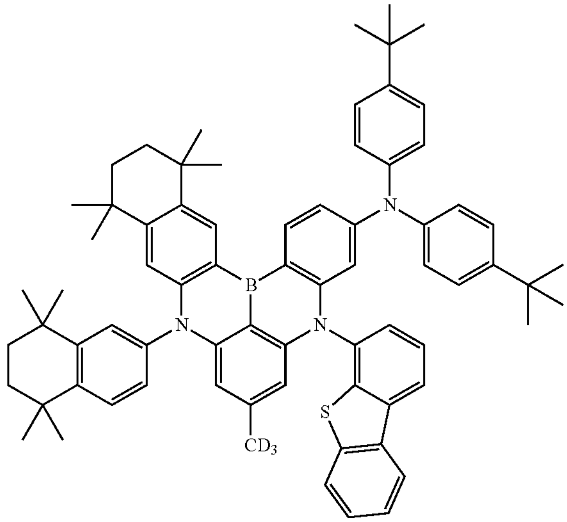
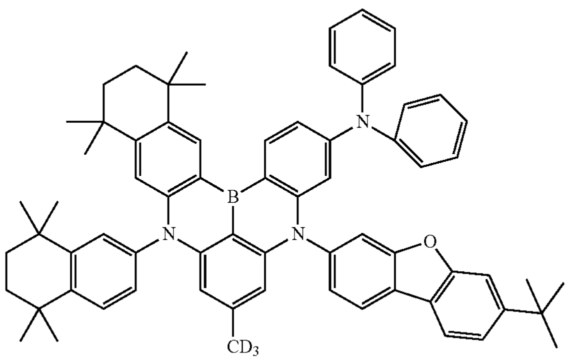
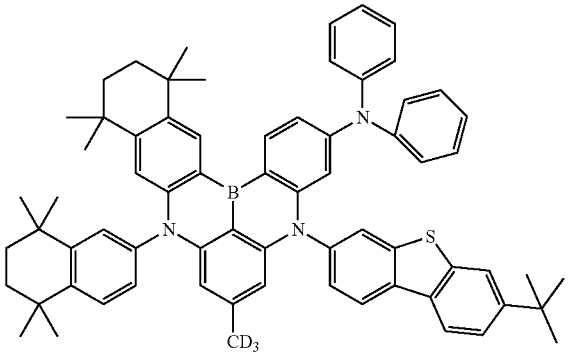
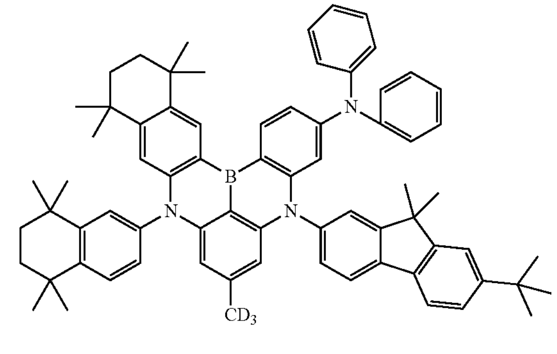
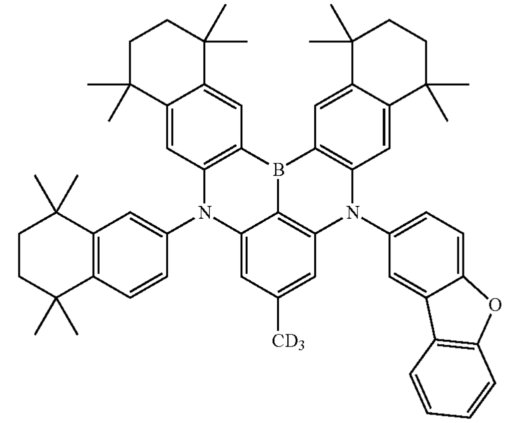
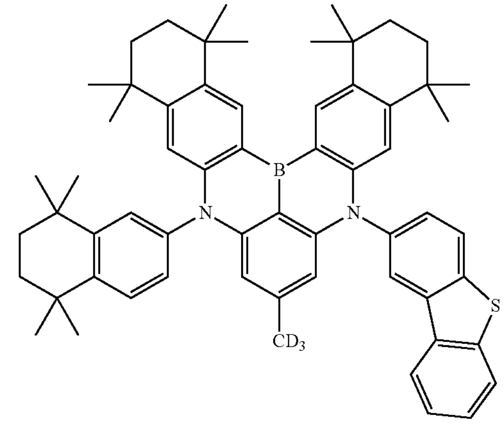
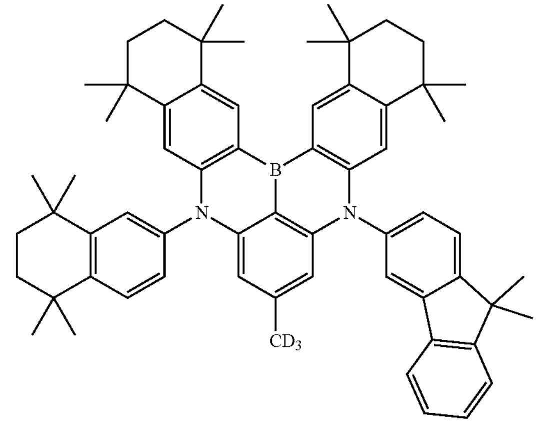
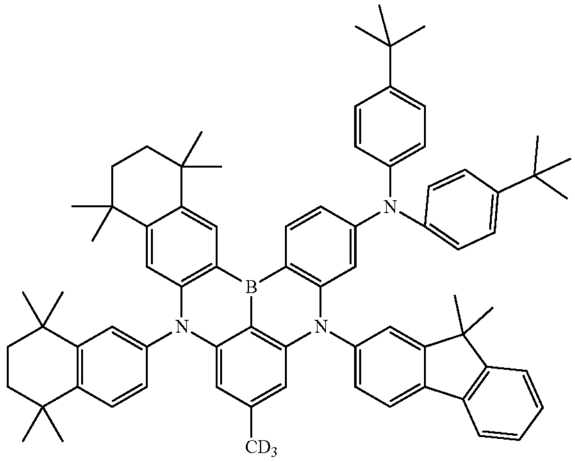

-continued
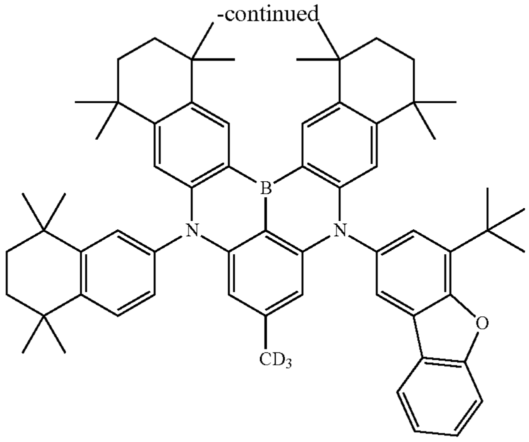
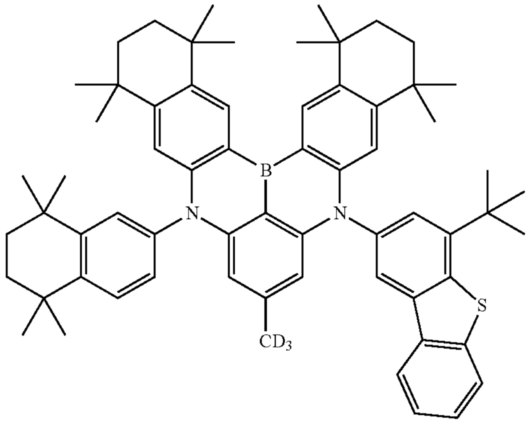
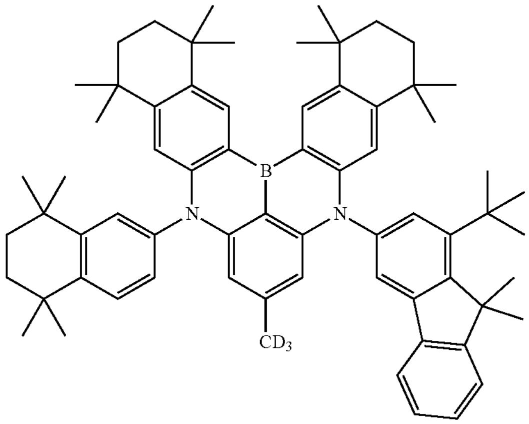
-continued
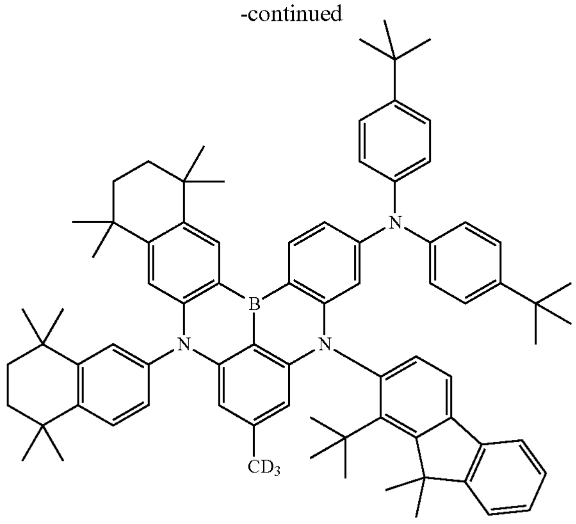
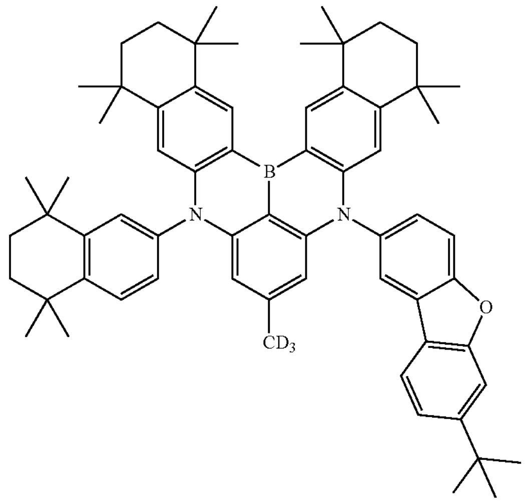
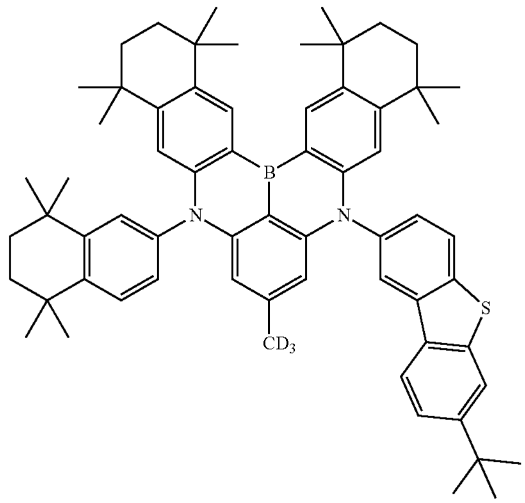

-continued
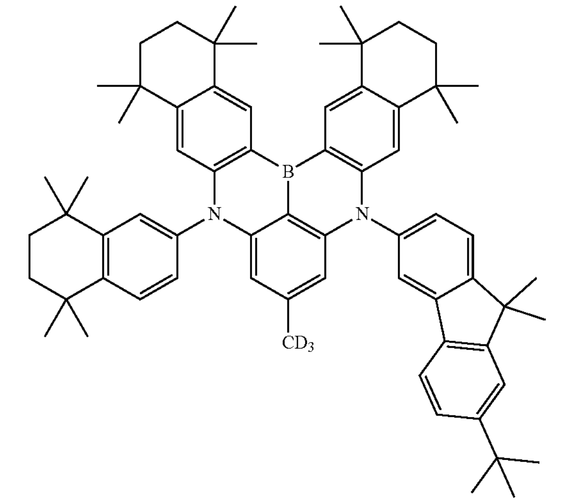
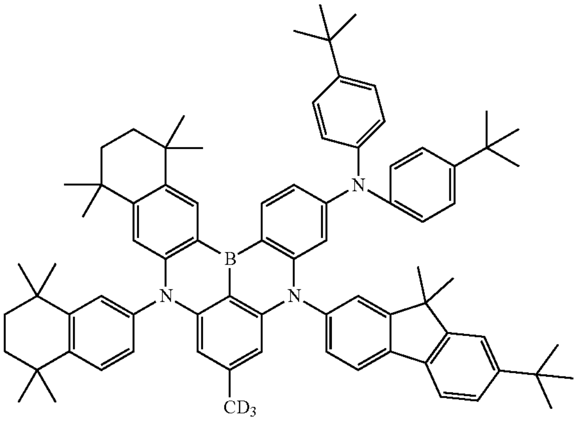
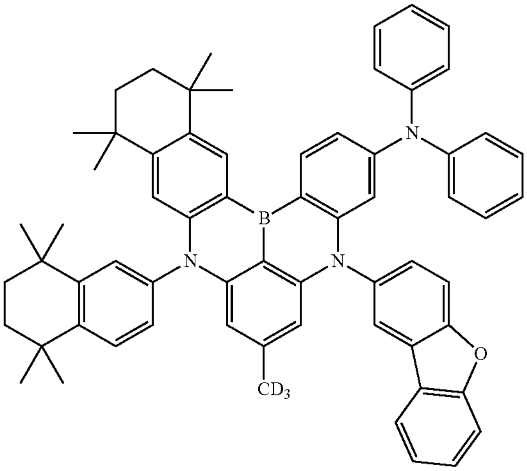
-continued
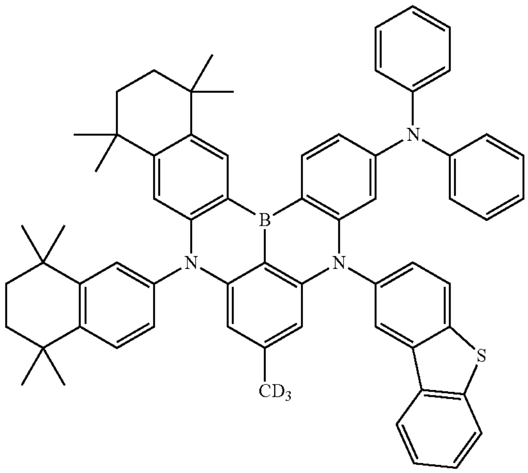
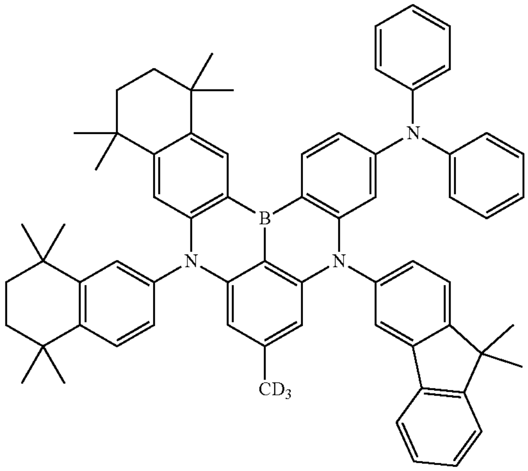
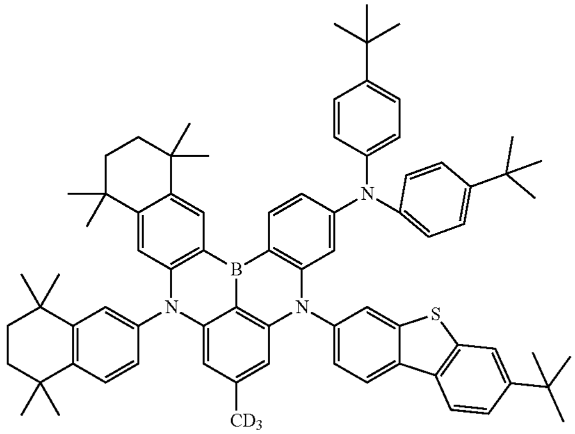

-continued
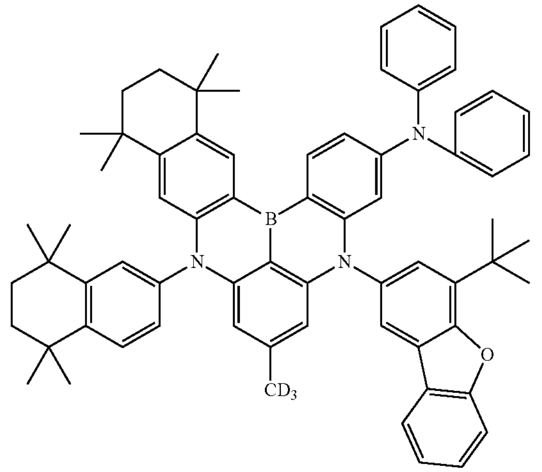
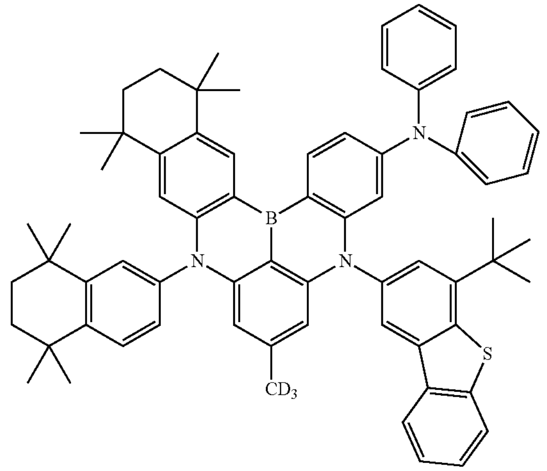
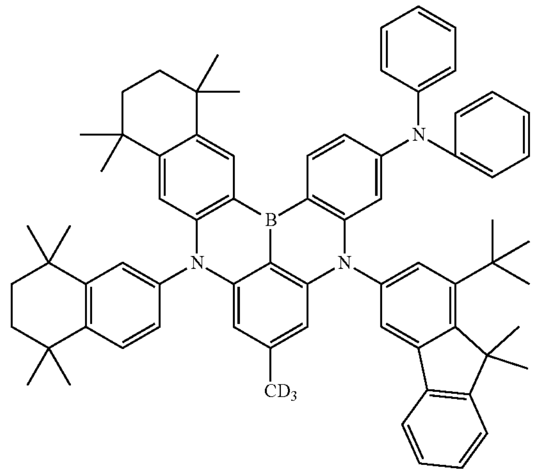
-continued
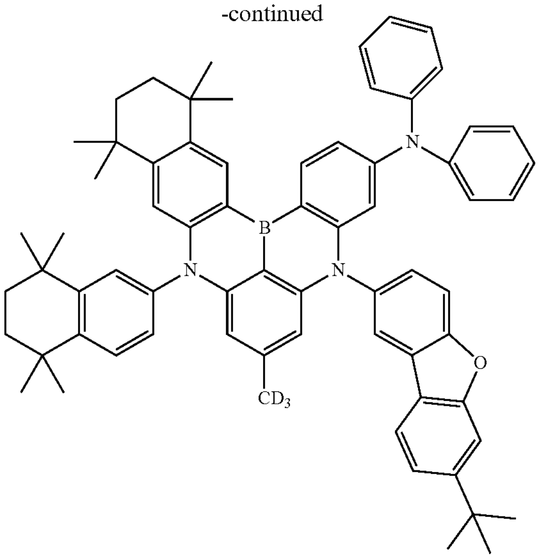
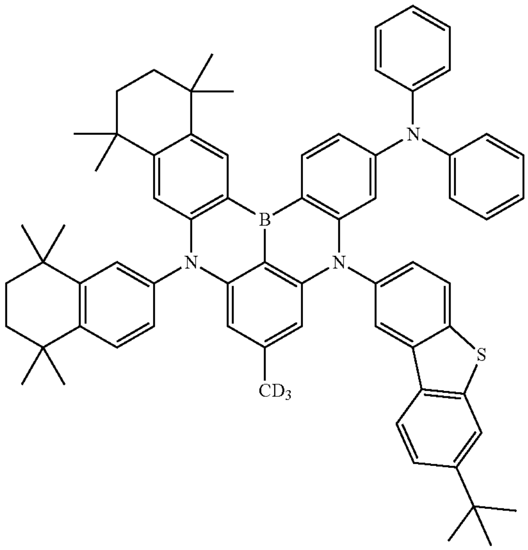
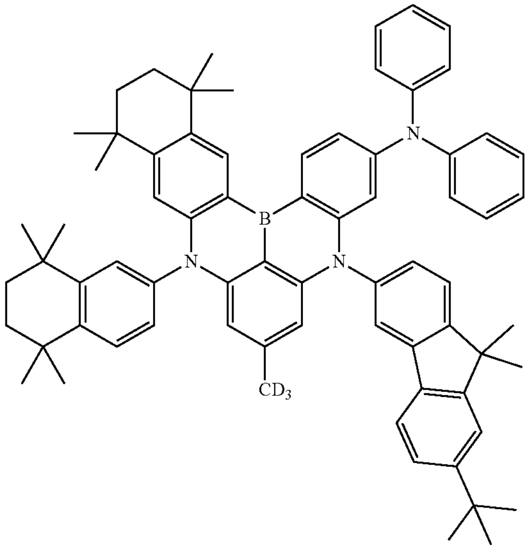

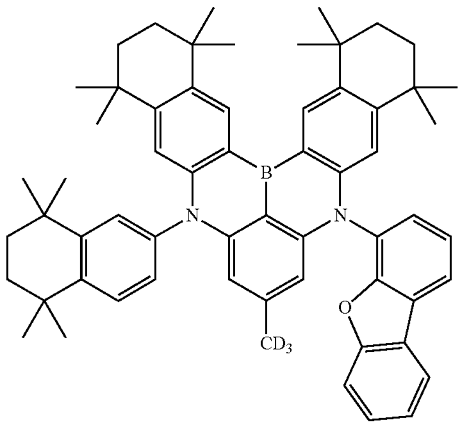
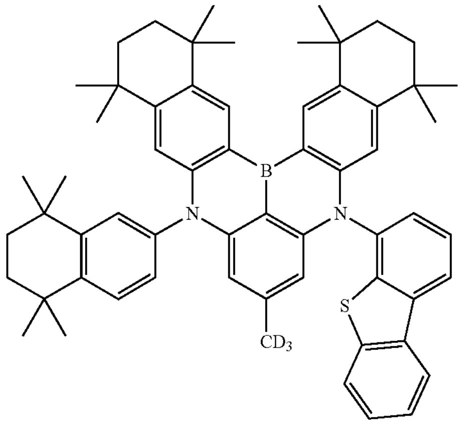
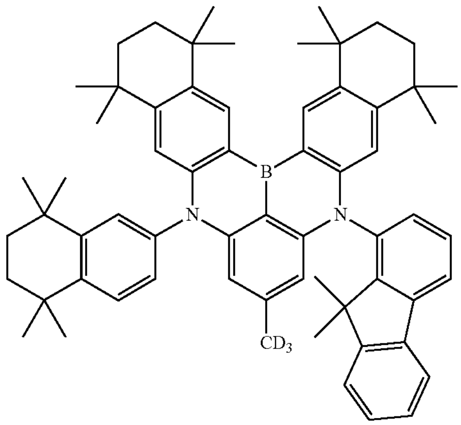
-continued
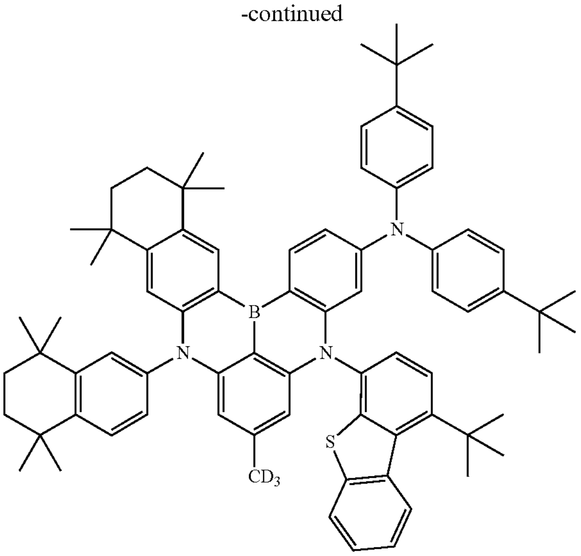
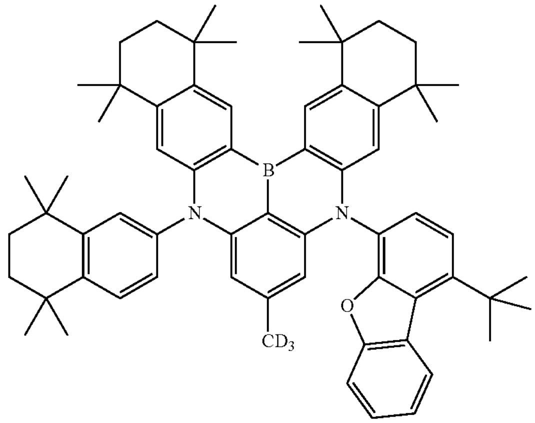
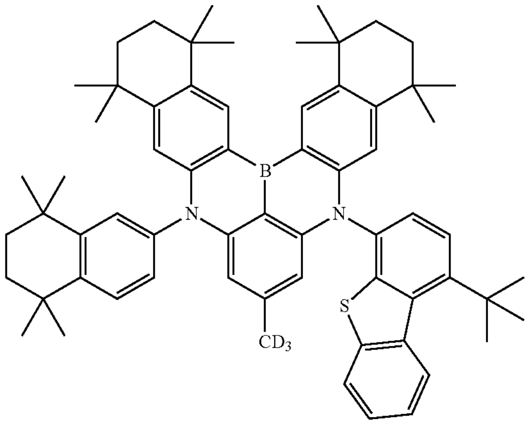

-continued
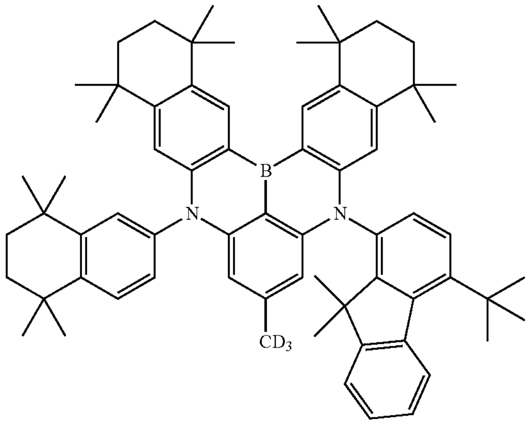
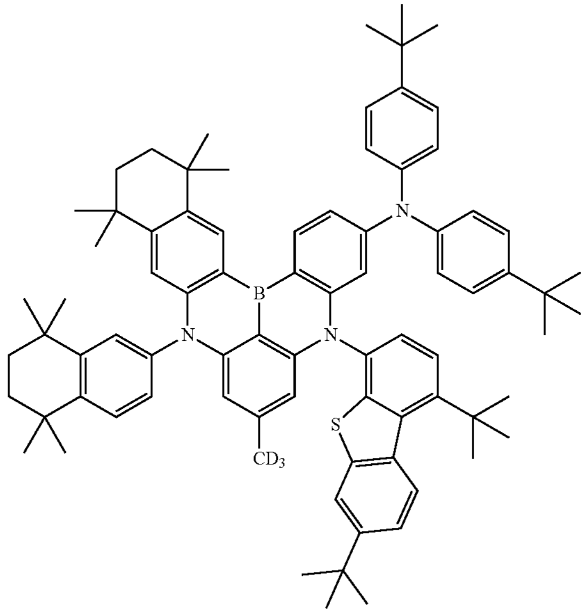
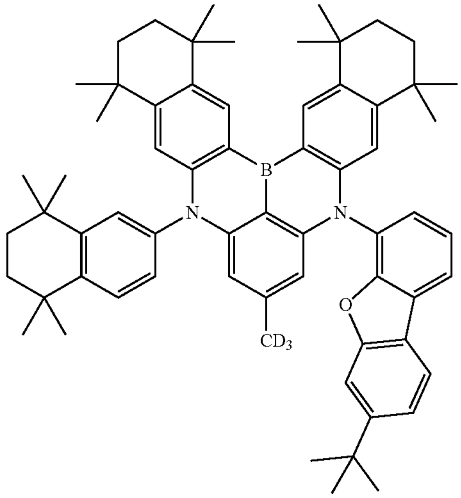
-continued
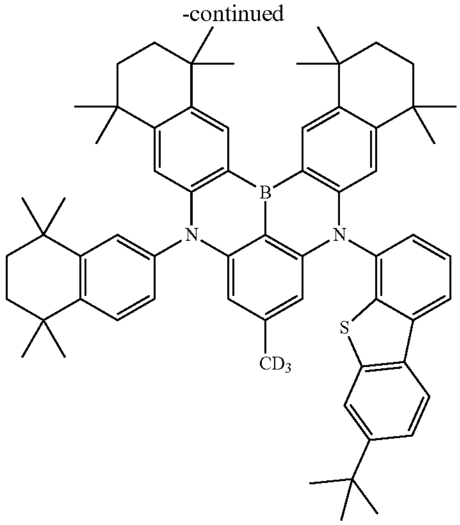
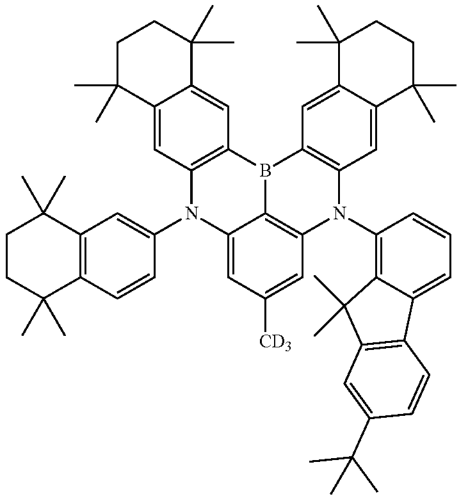
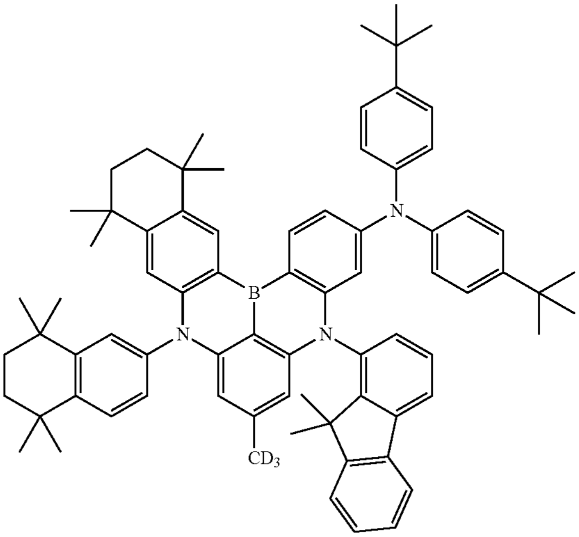

-continued
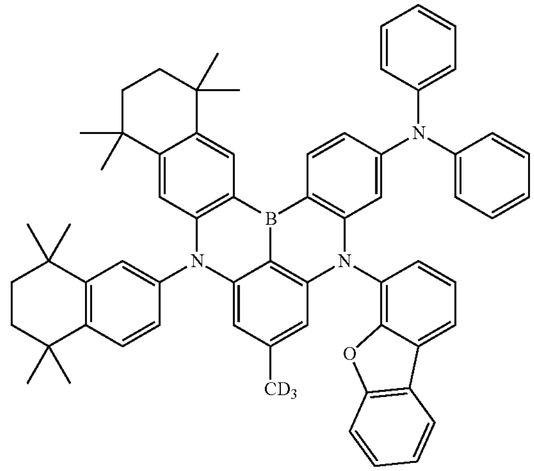
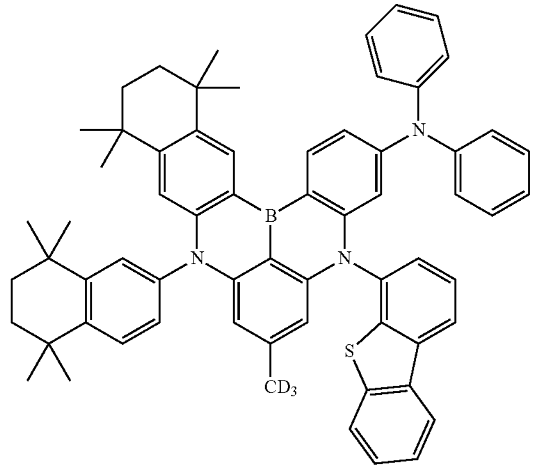
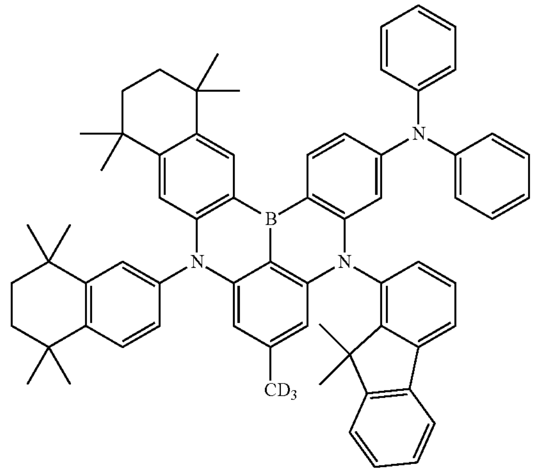
-continued
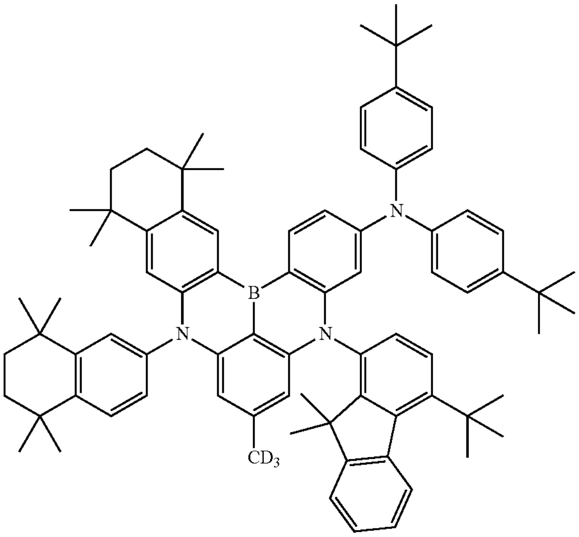
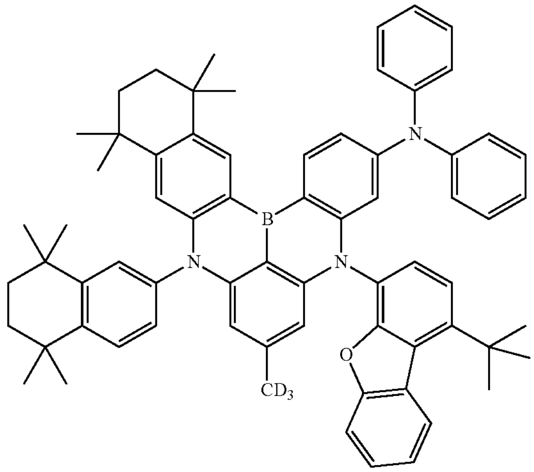
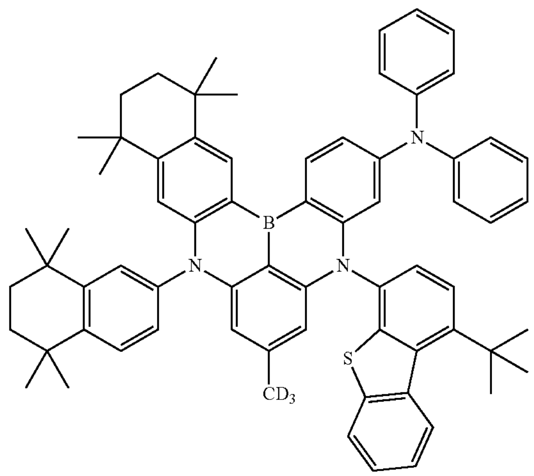

-continued
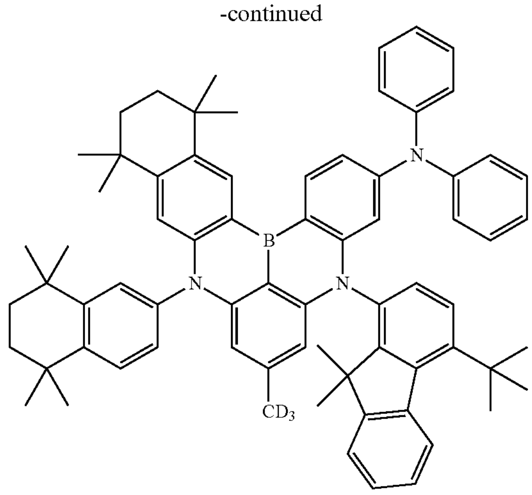
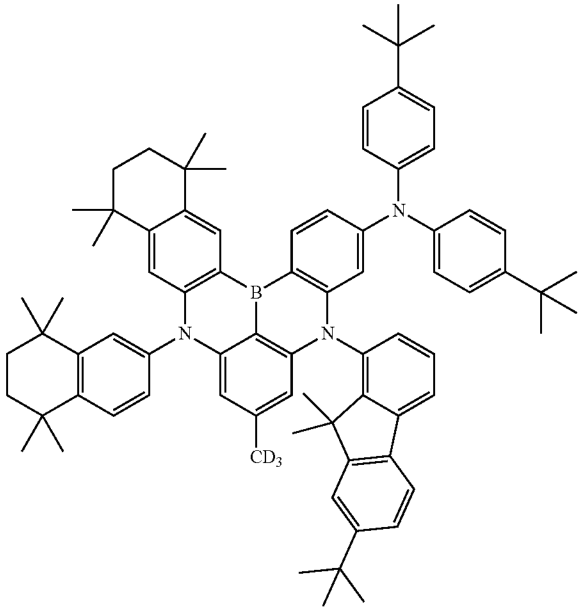
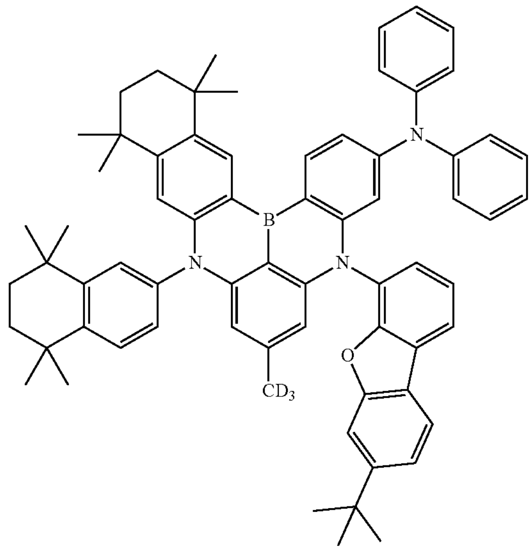
-continued
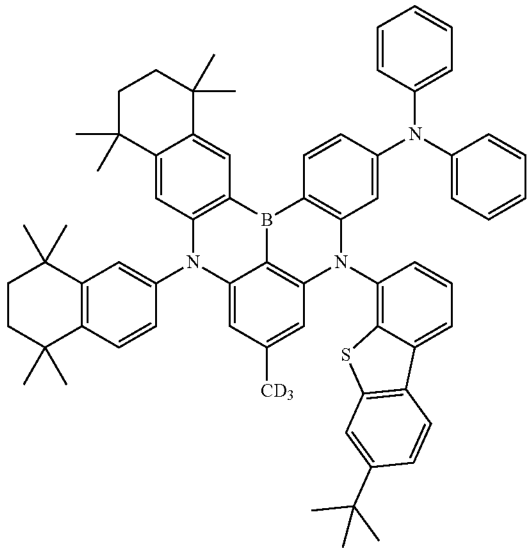
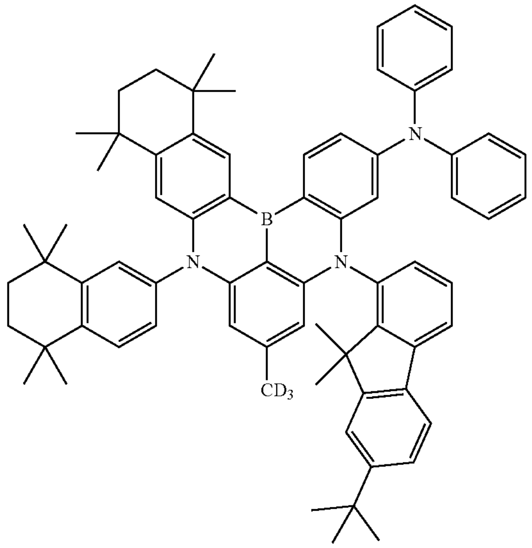
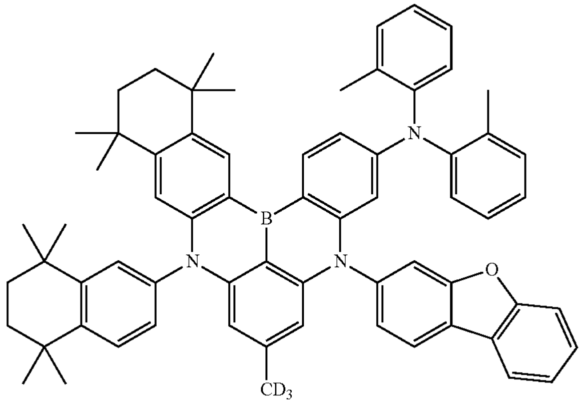

-continued
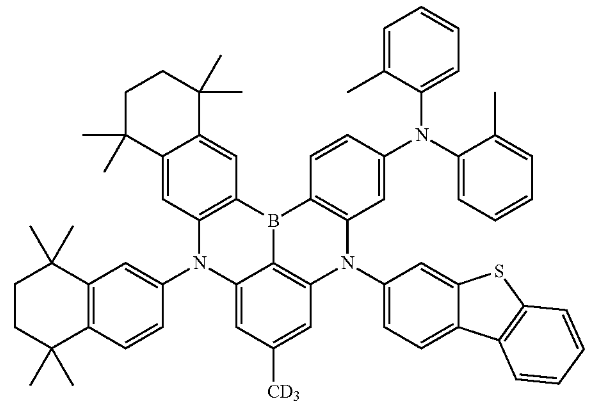
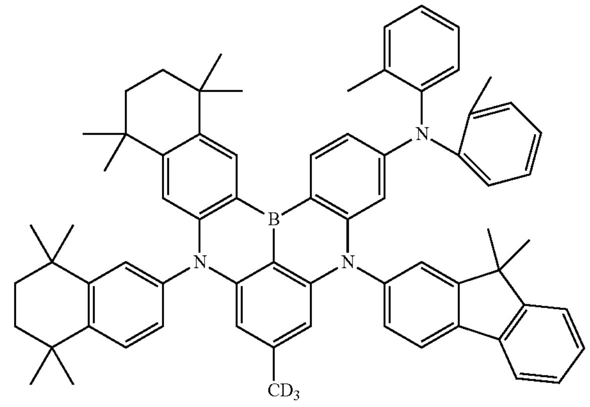
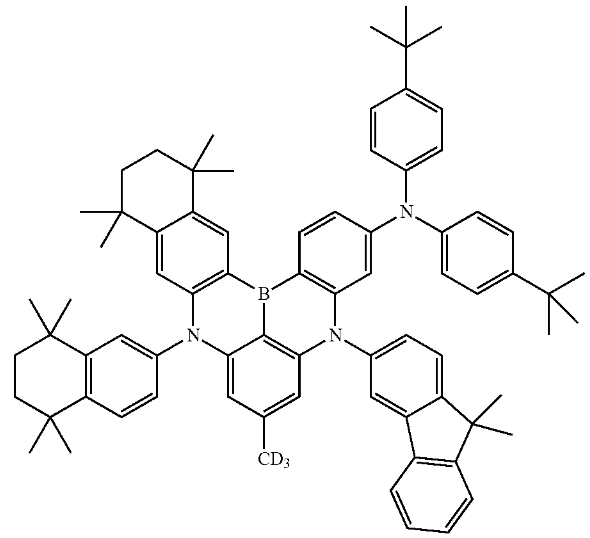
-continued
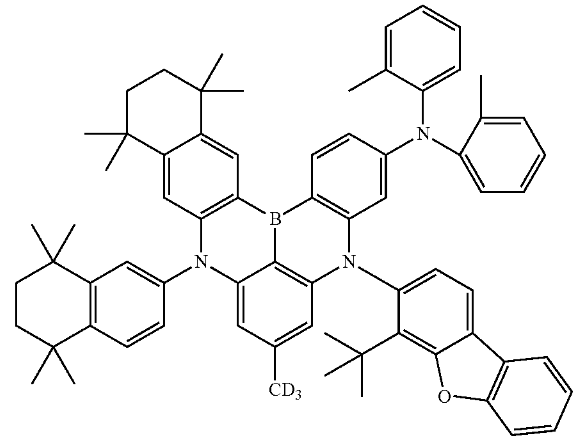
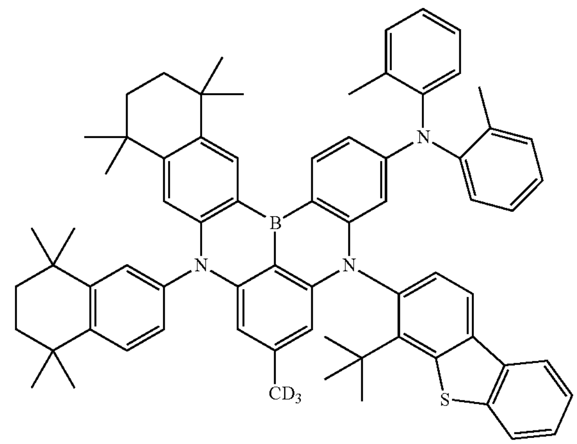
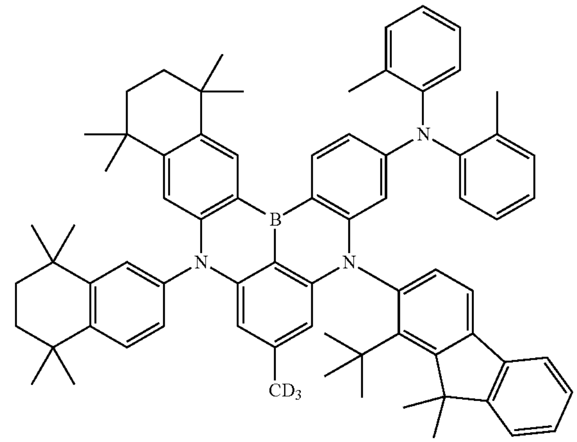

-continued
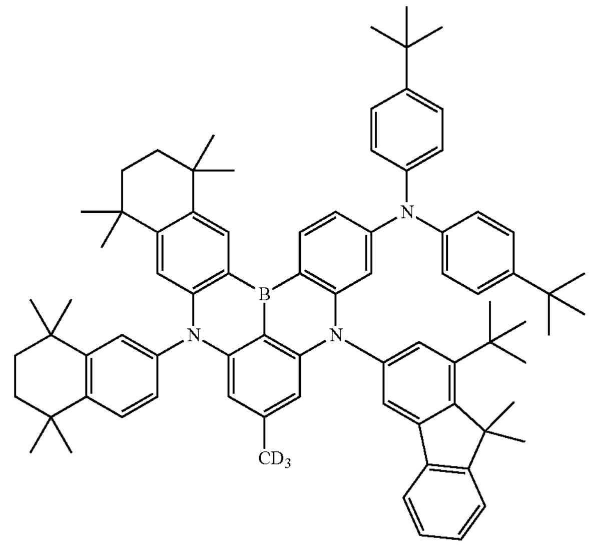
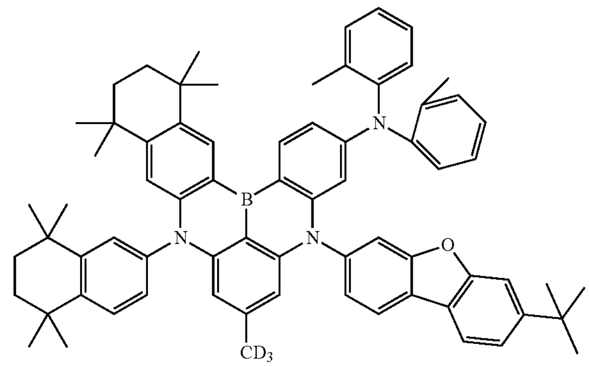
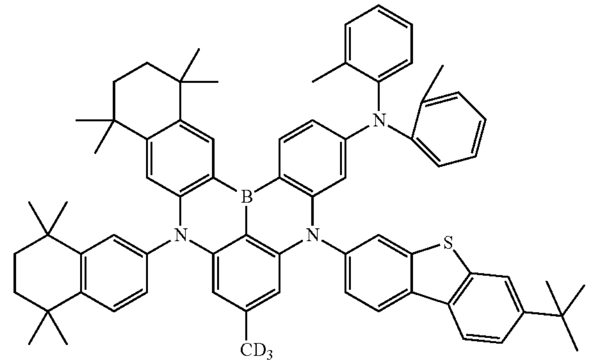
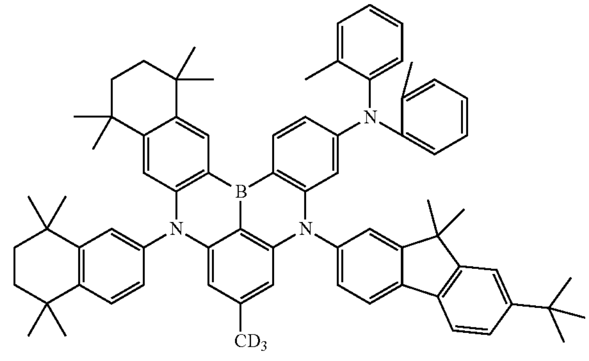
-continued
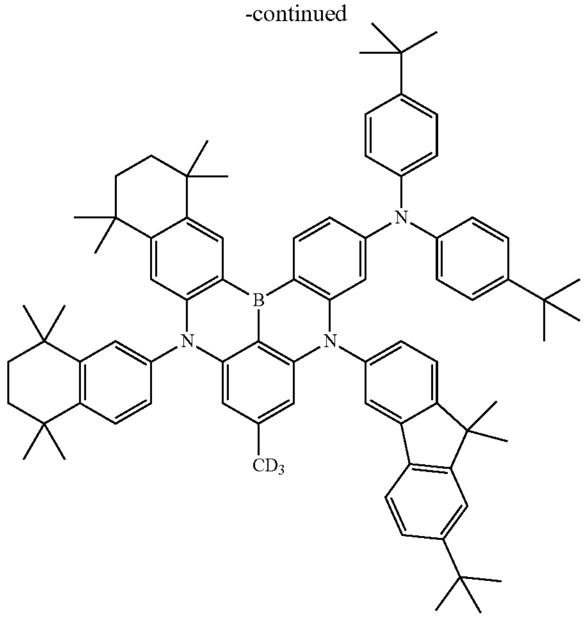
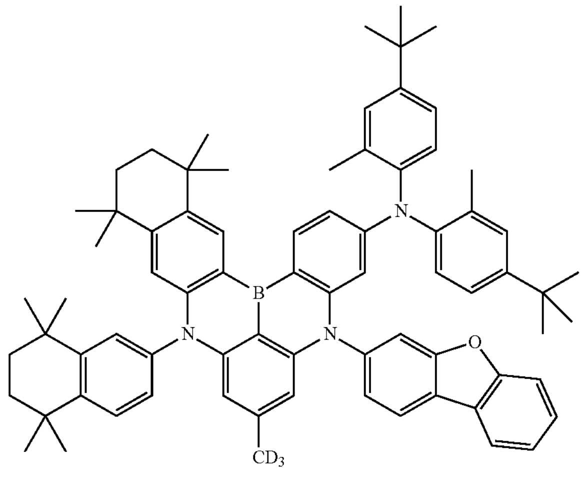
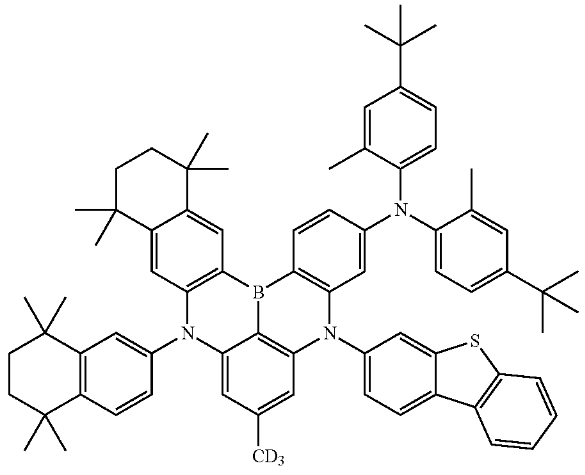

-continued
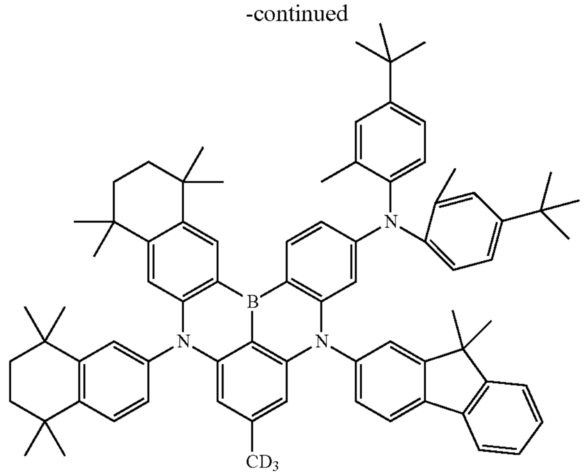
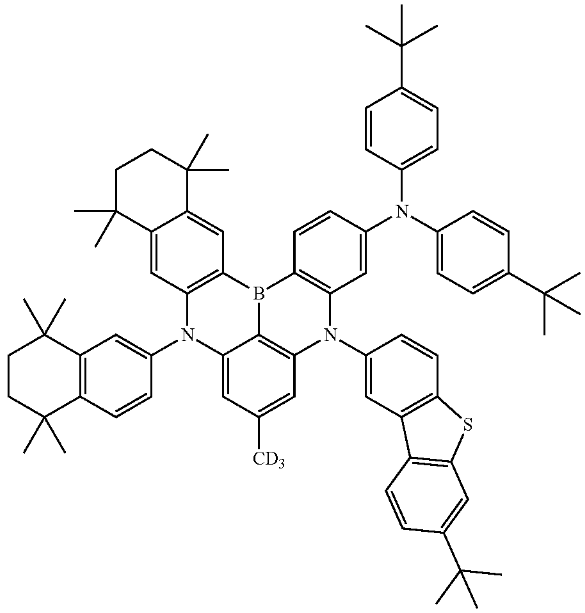
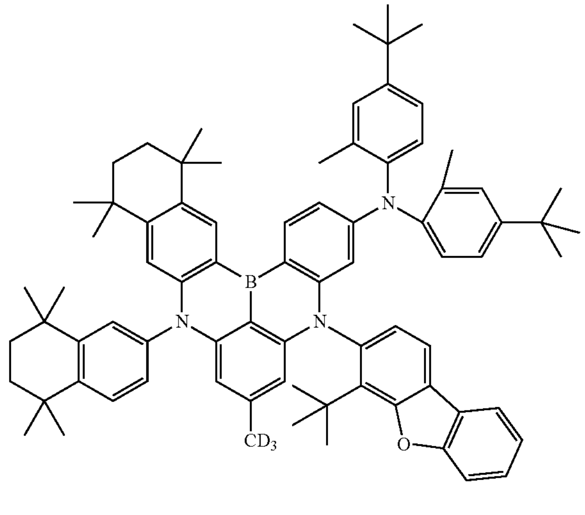
-continued
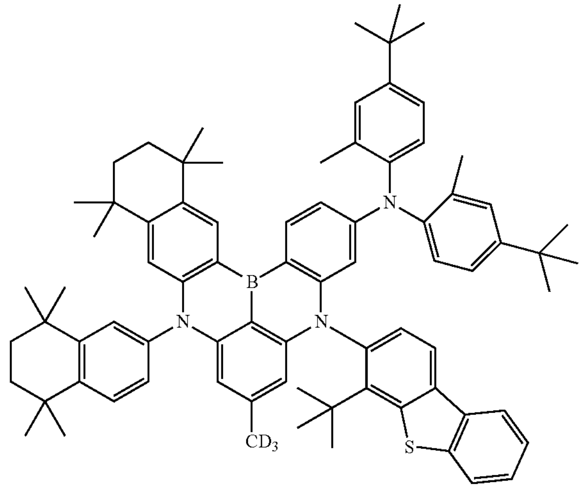
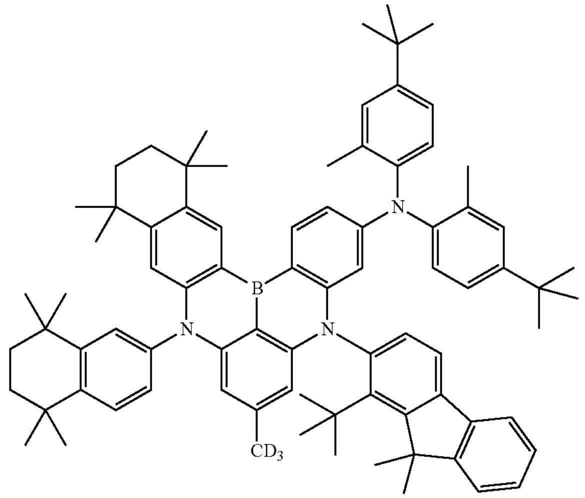
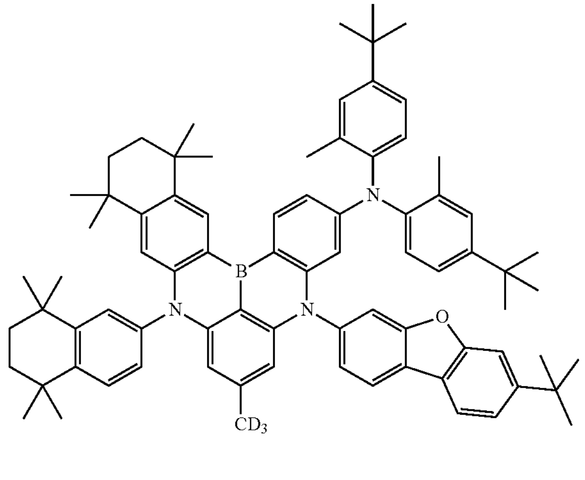

-continued
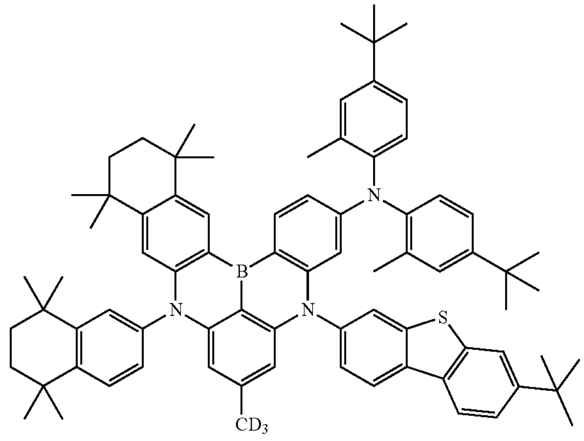
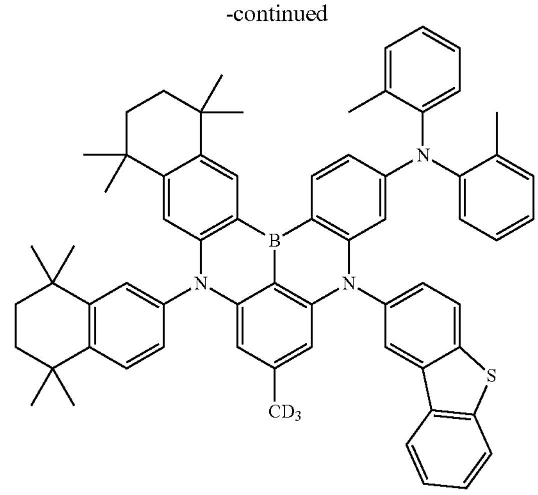
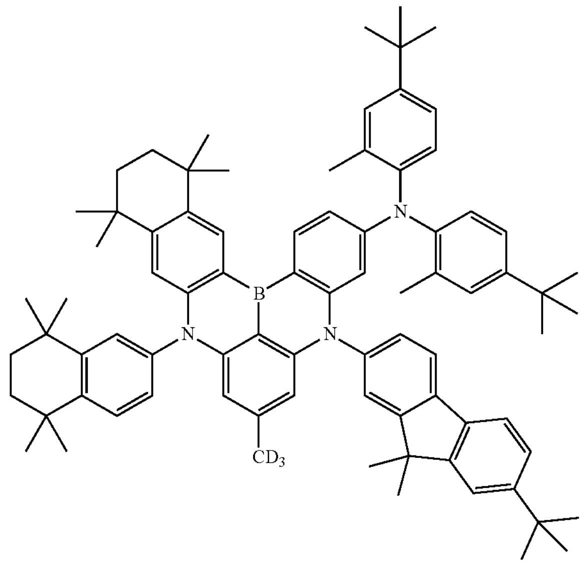
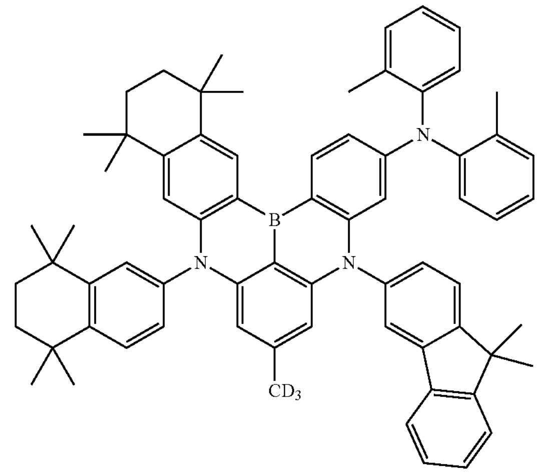
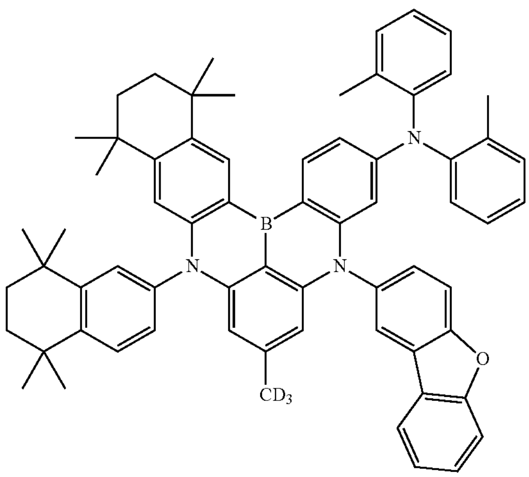
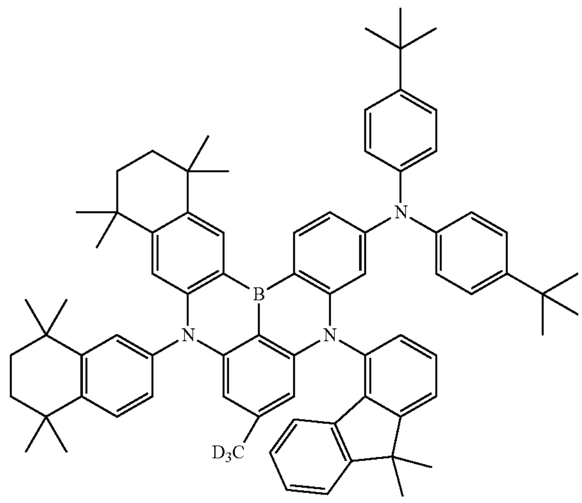
-continued -continued
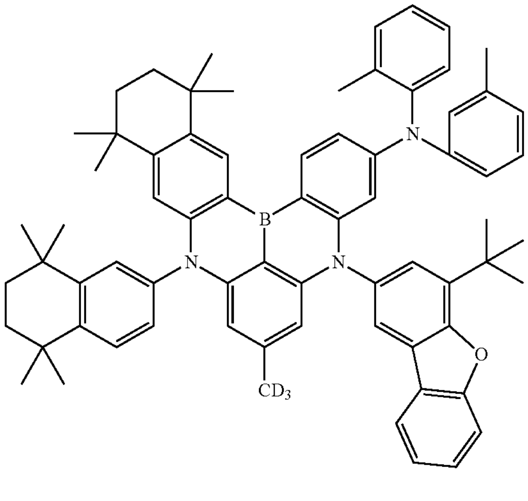
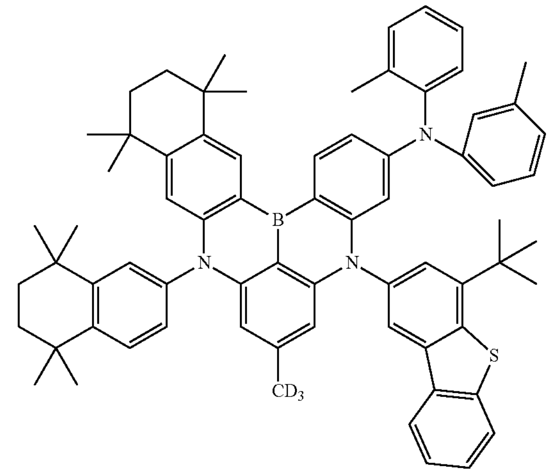
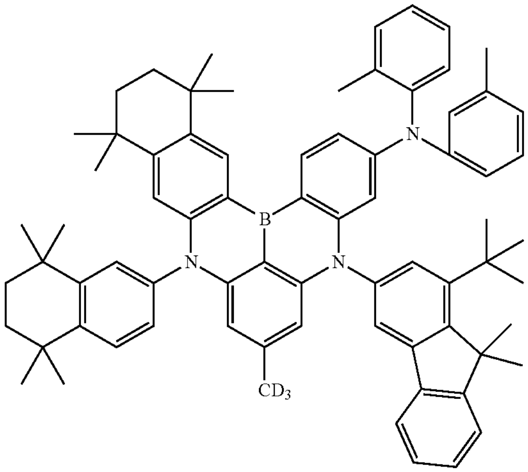
-continued
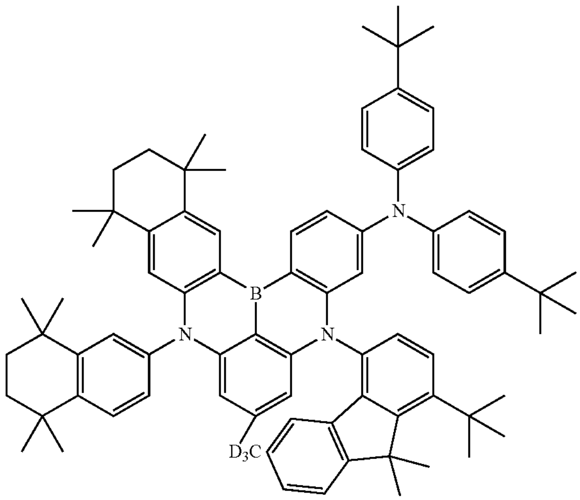
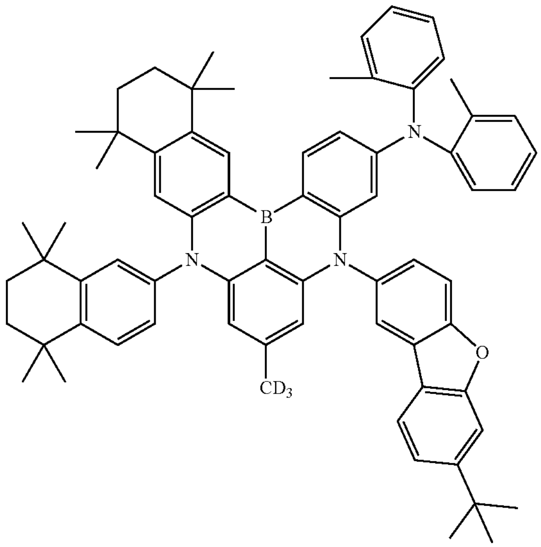
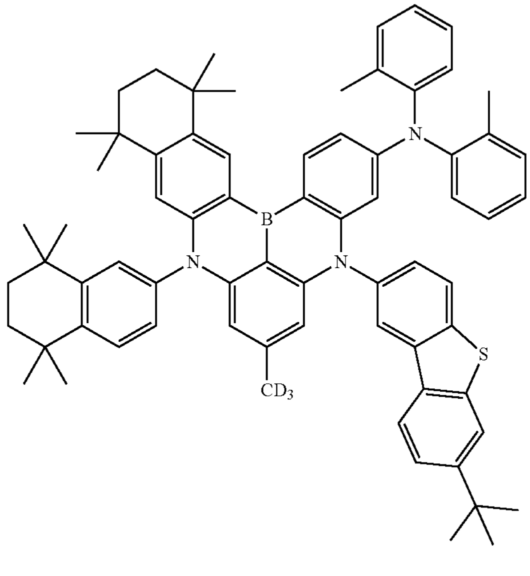

-continued
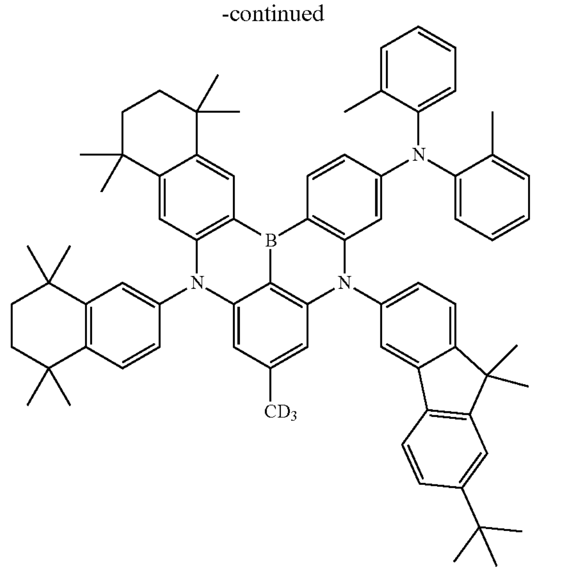
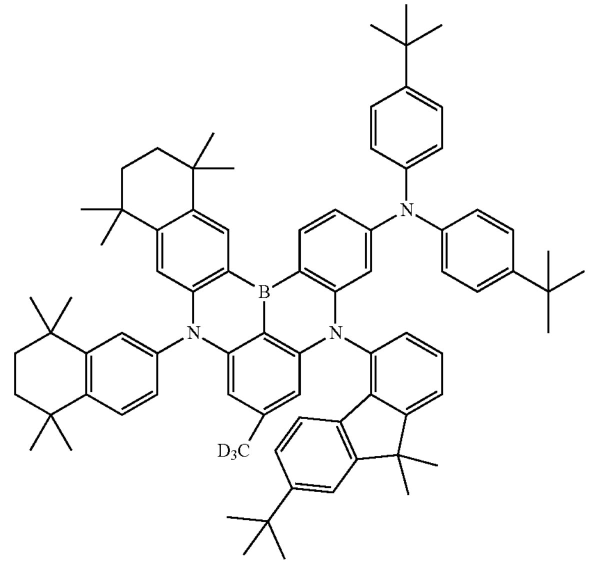
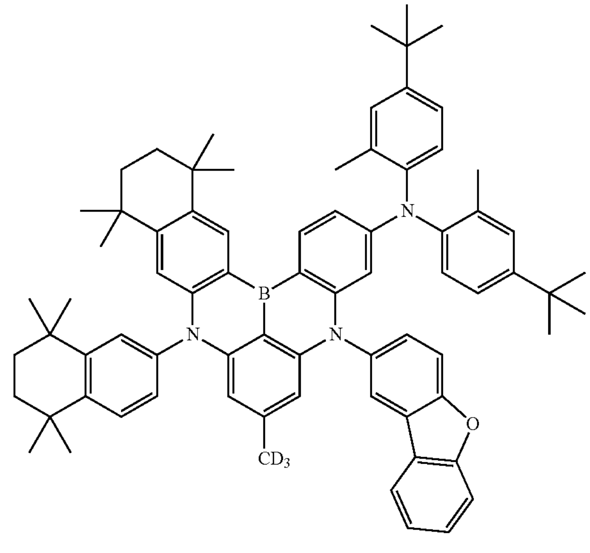
-continued
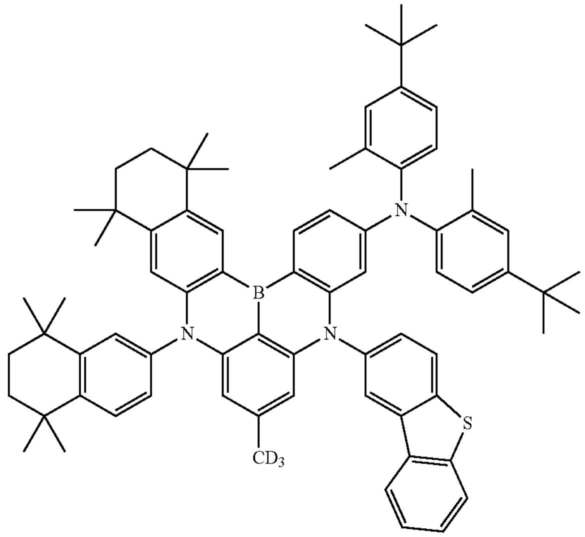
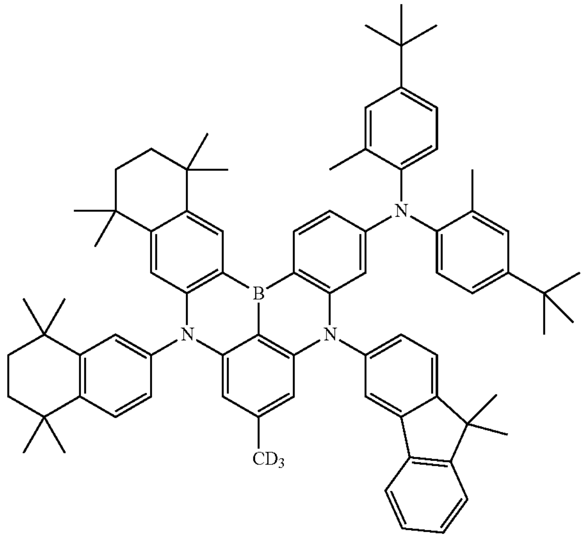
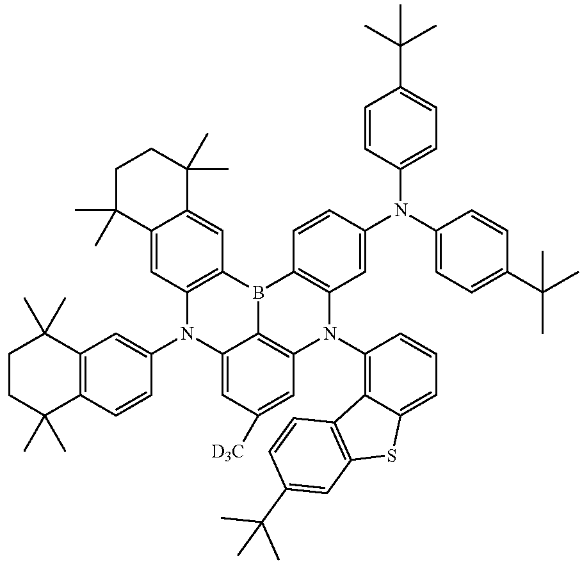

-continued
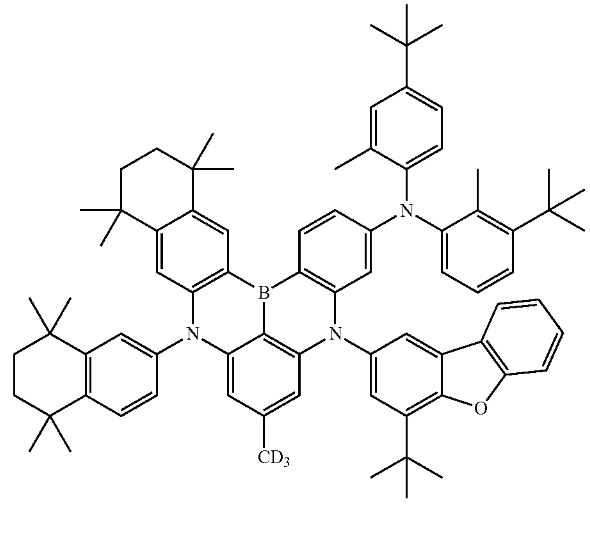
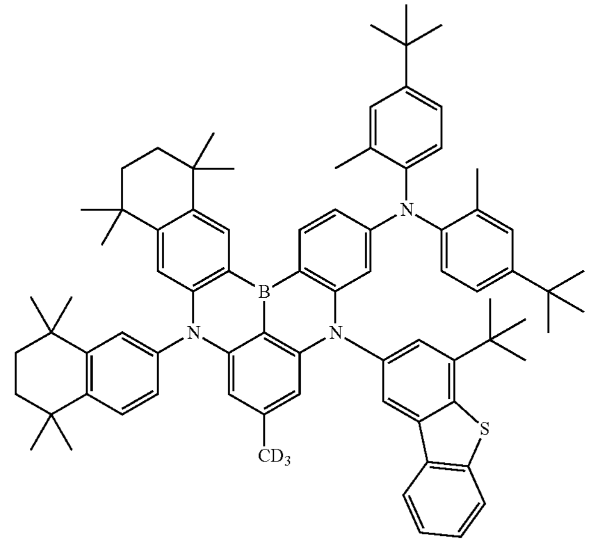
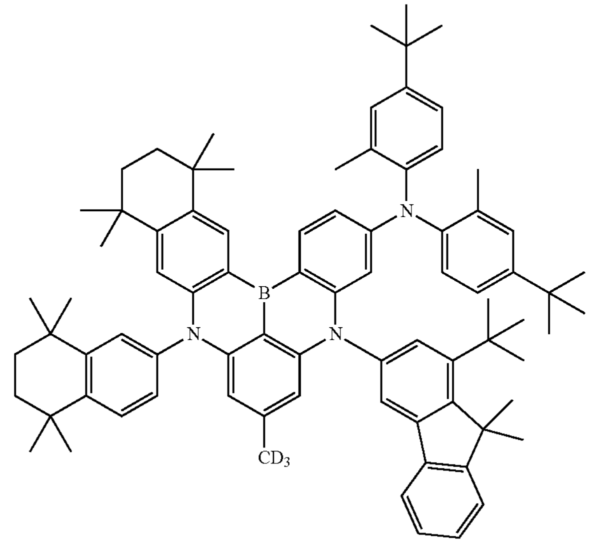
-continued
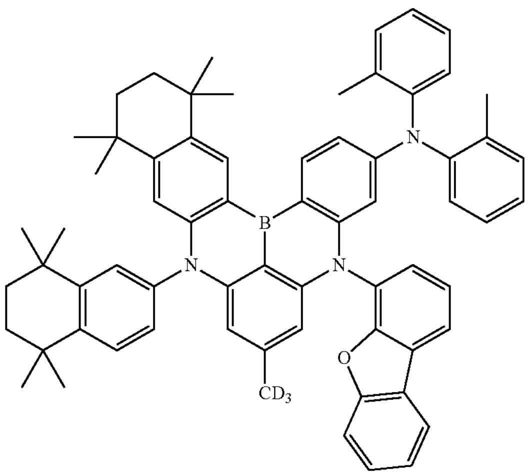
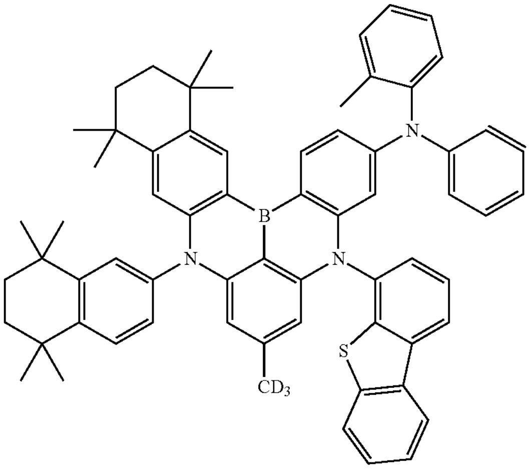
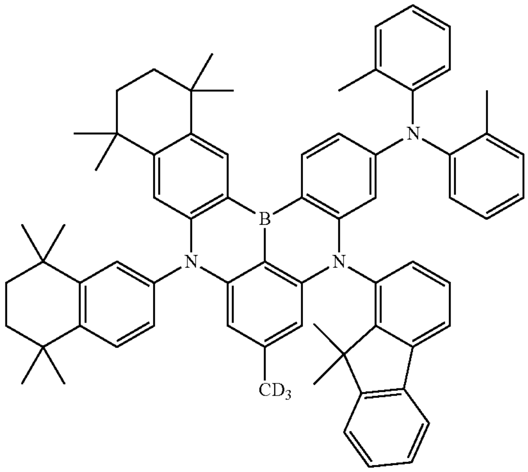

-continued
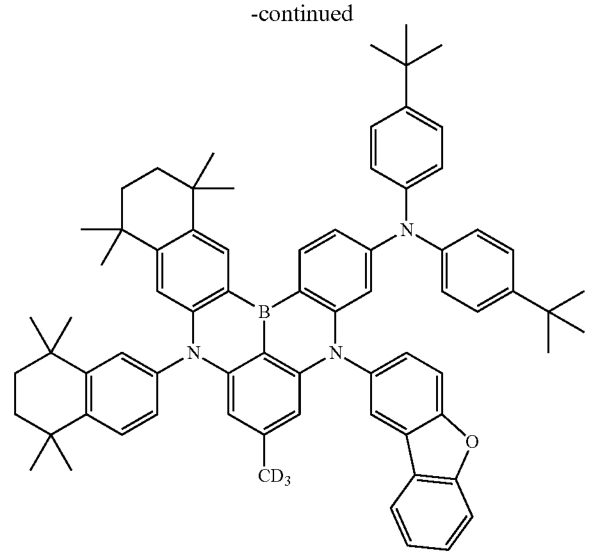
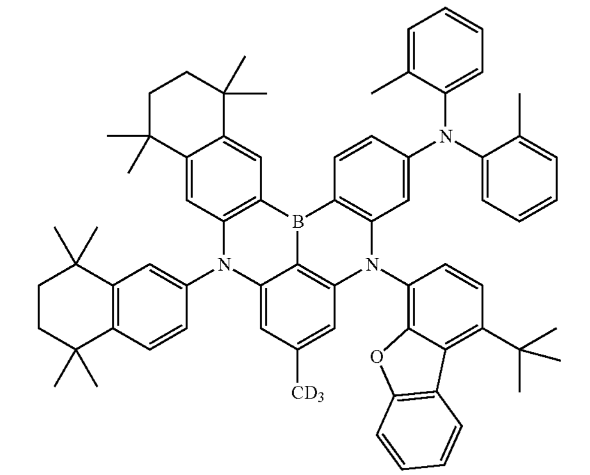
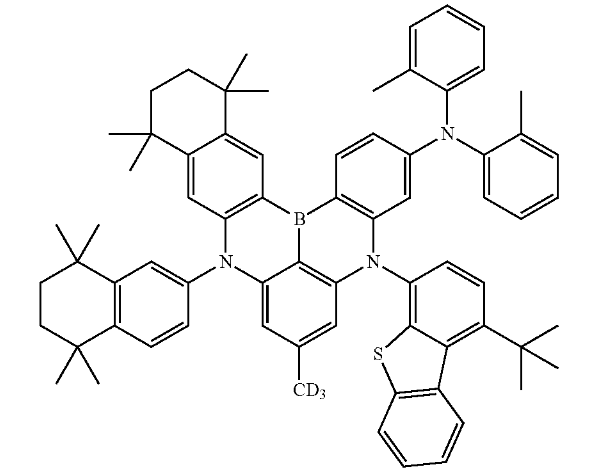
-continued
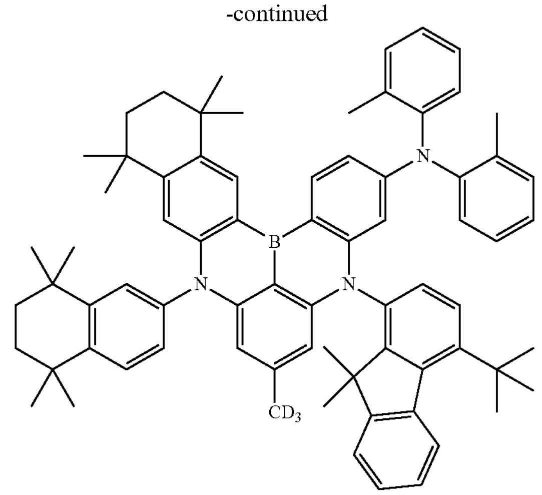
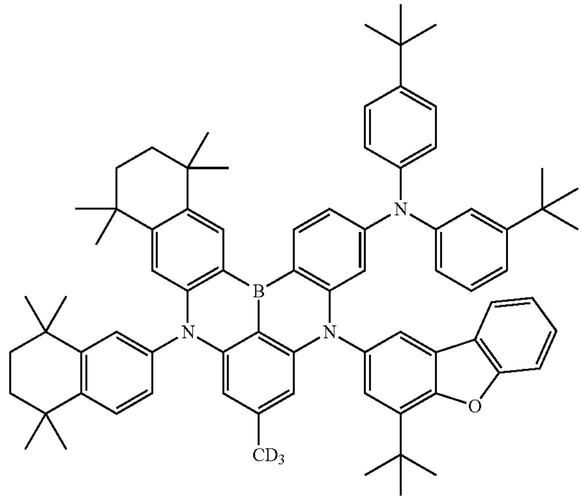
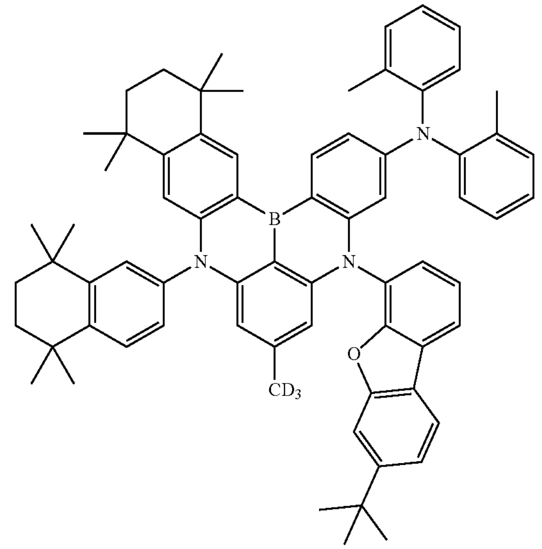

-continued
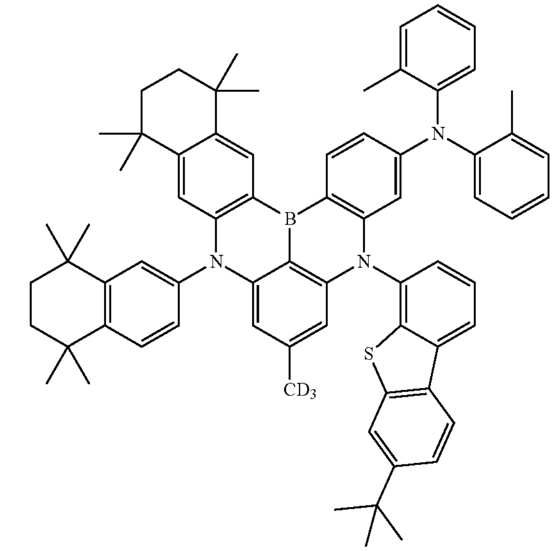
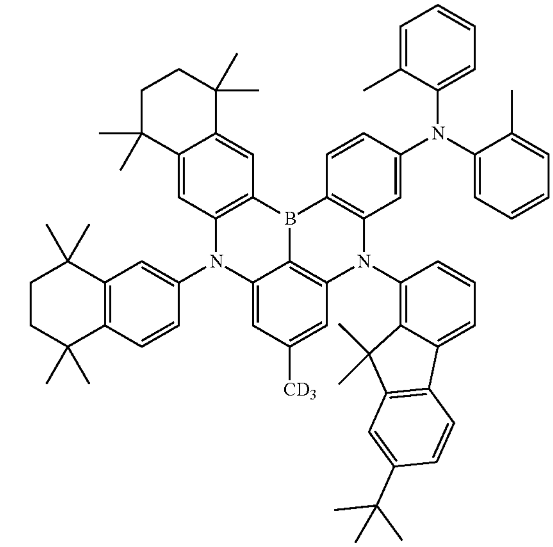
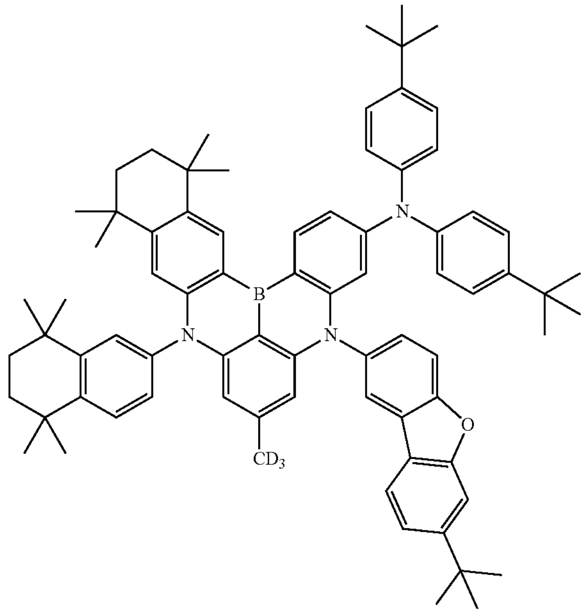
-continued
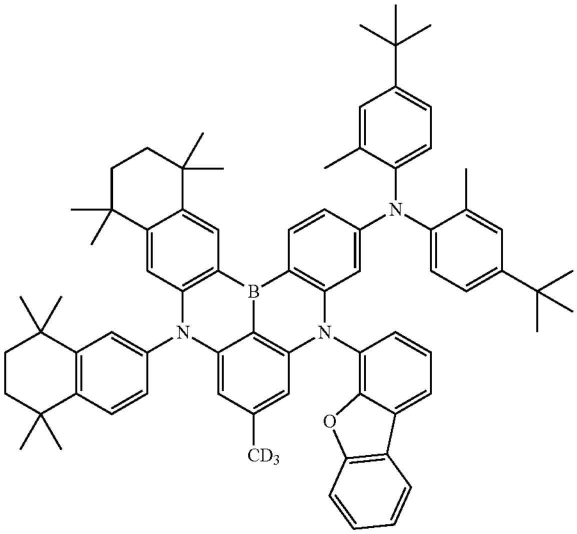
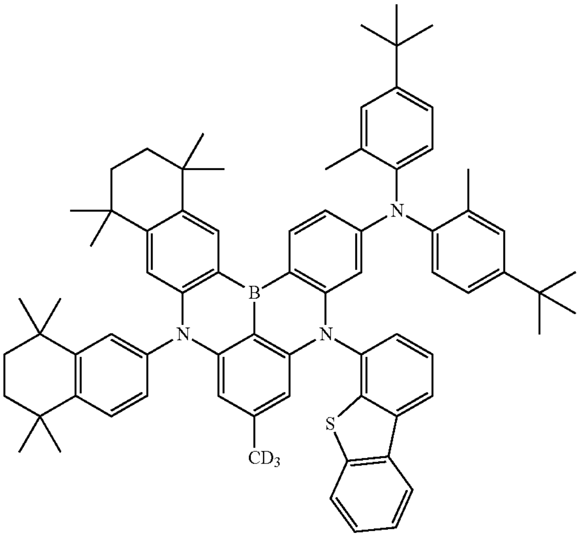
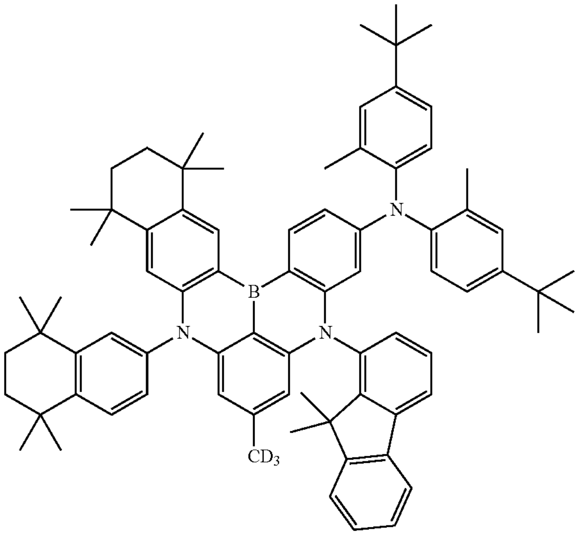

-continued
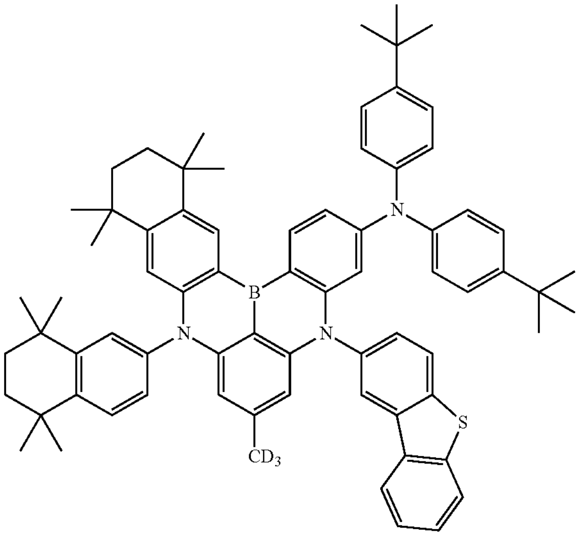
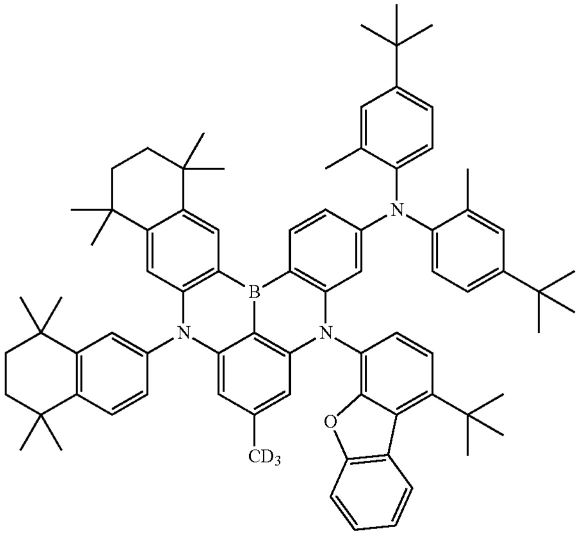
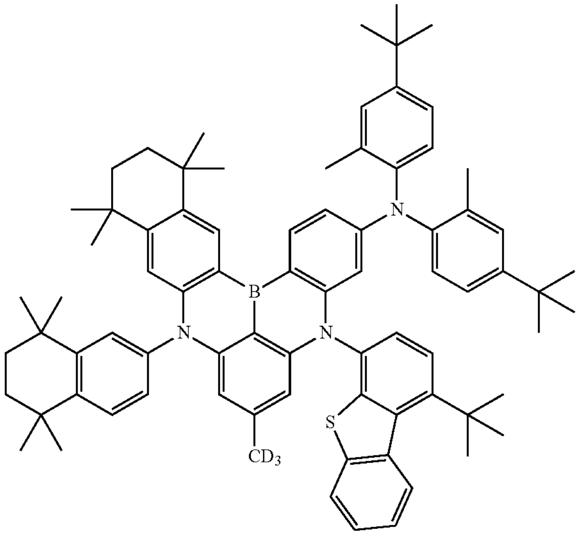
-continued
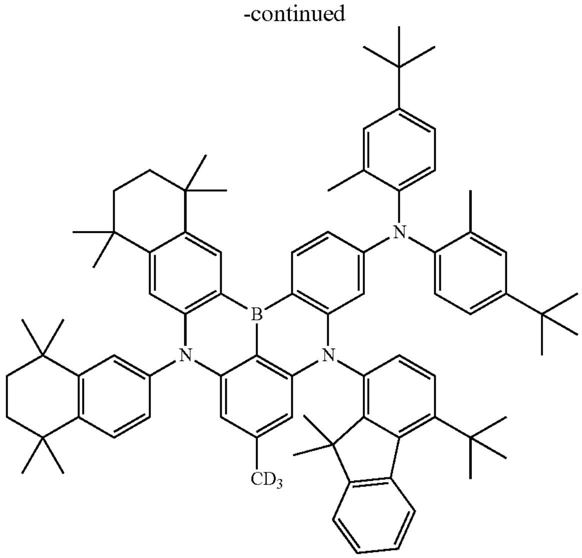
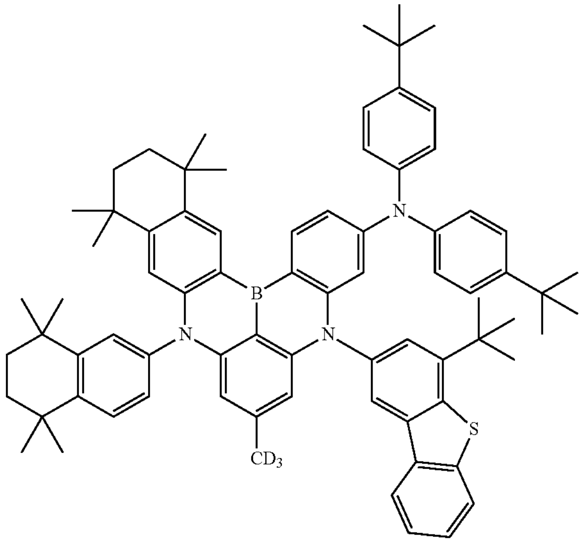
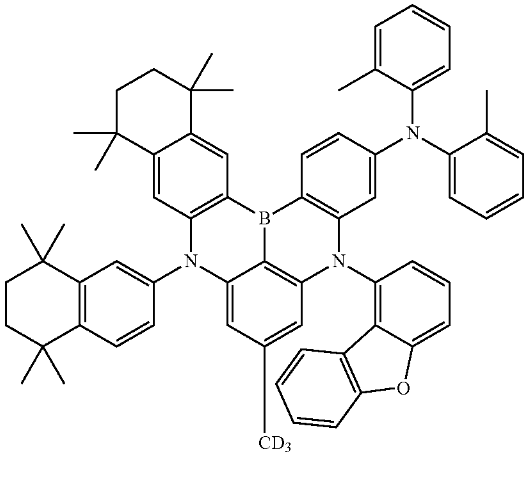

-continued
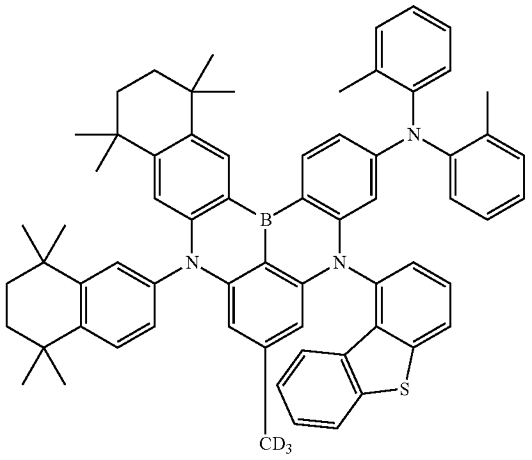
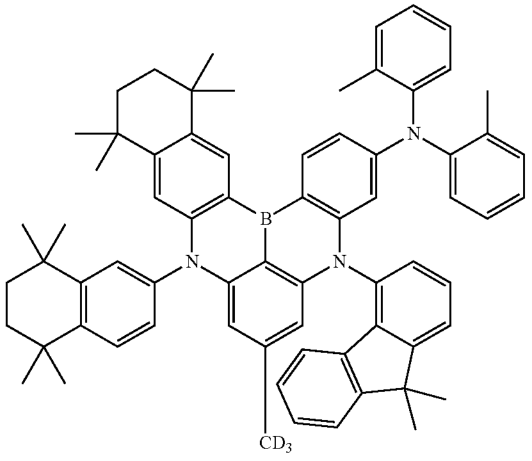
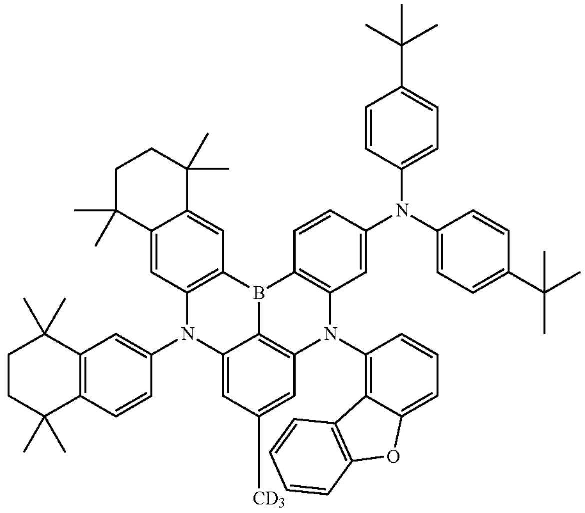
-continued
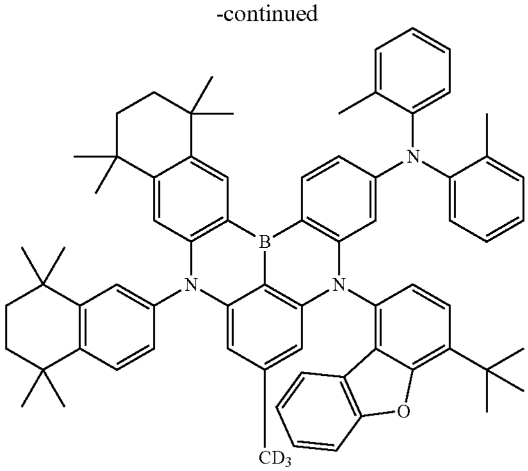
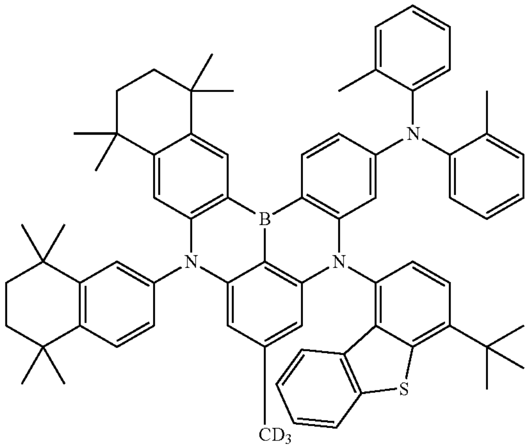
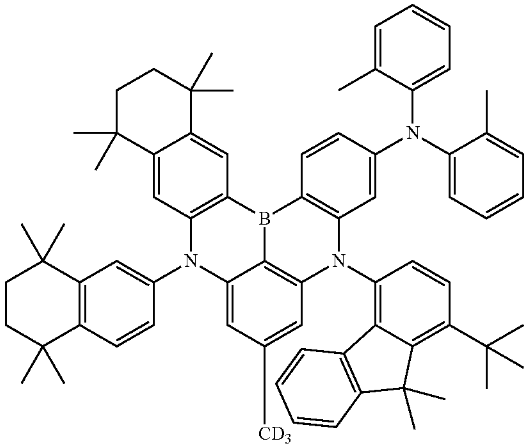

-continued
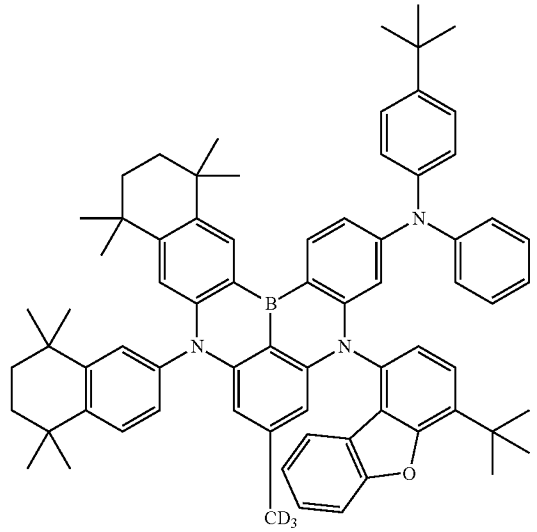
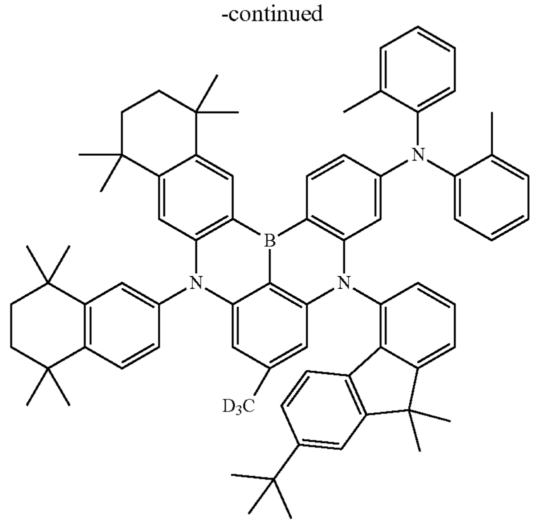
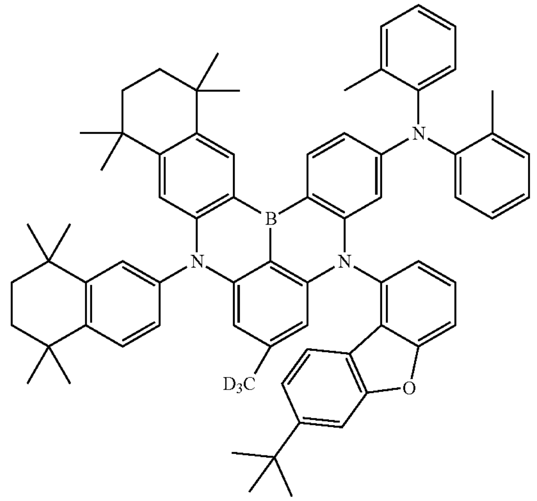
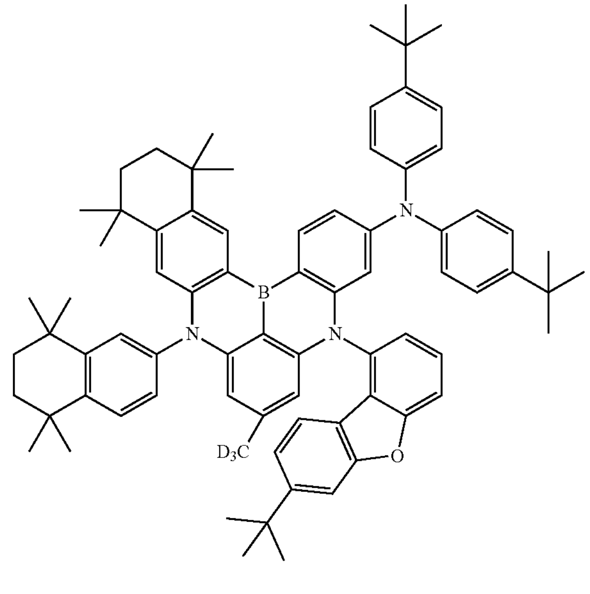
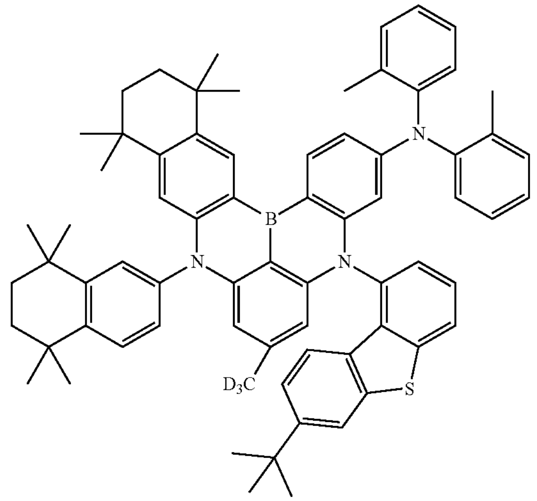
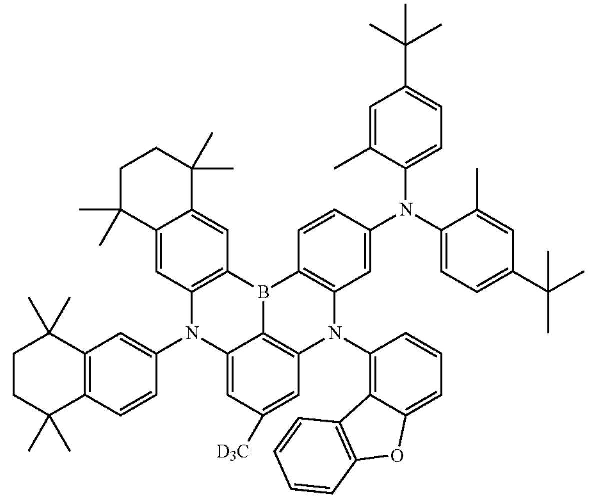

-continued
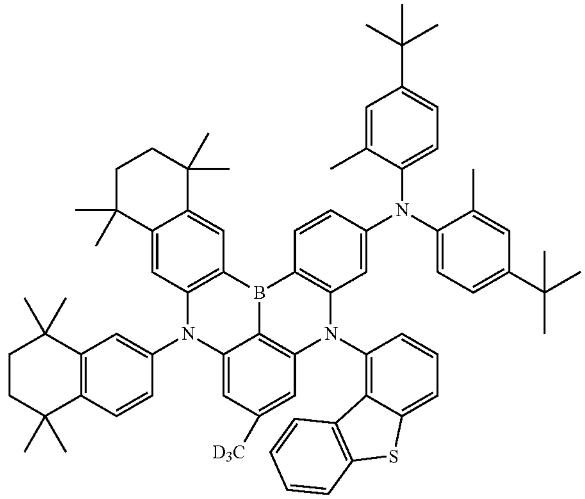
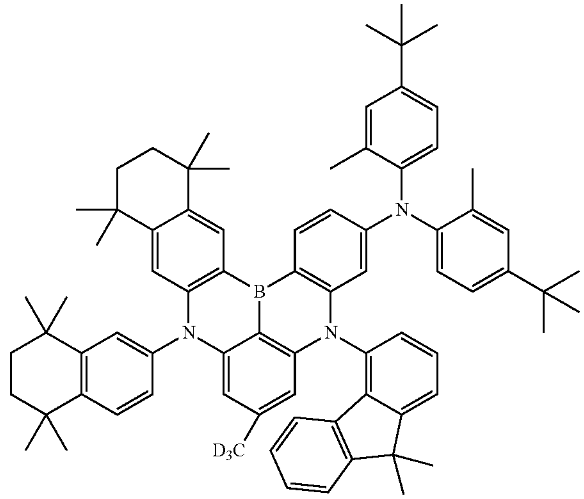
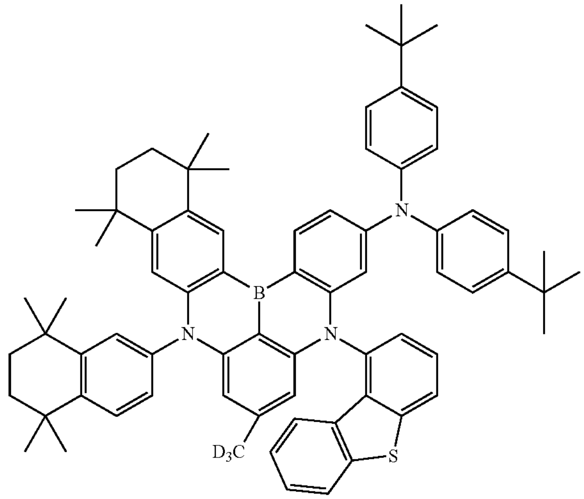
-continued
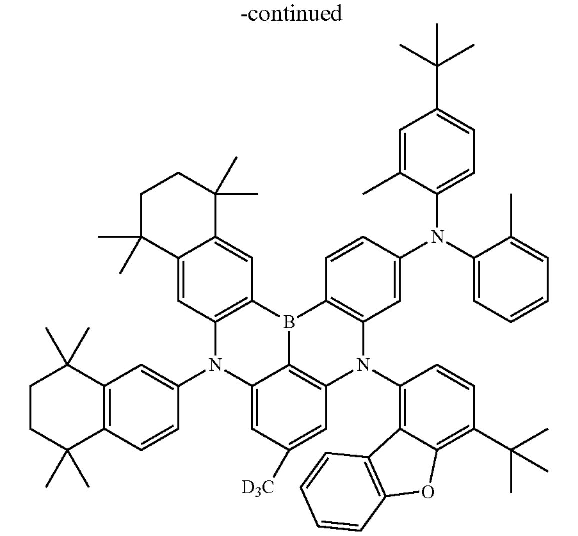
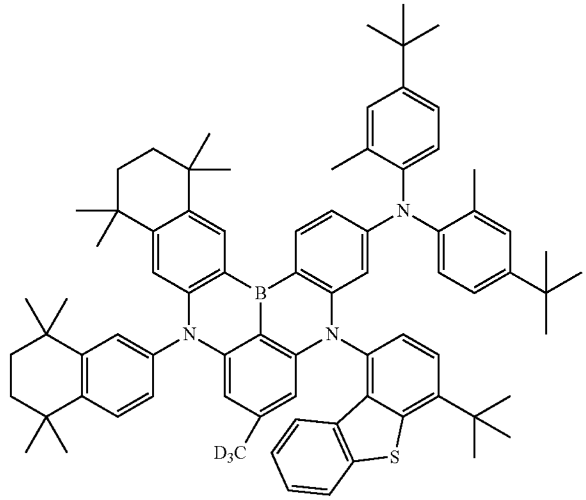
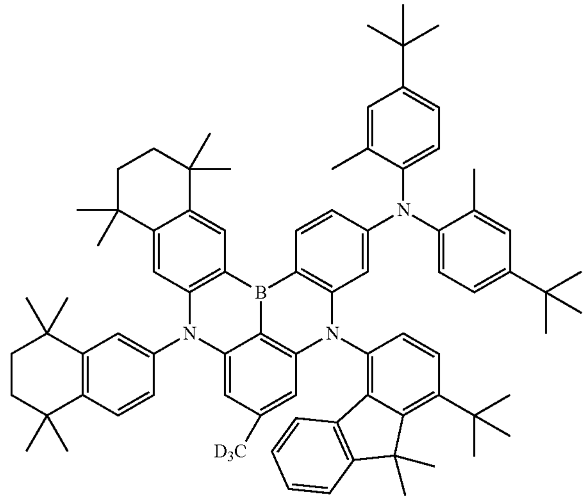

-continued
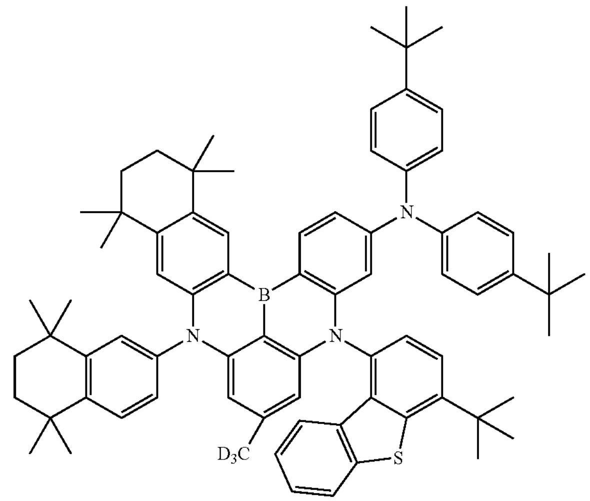
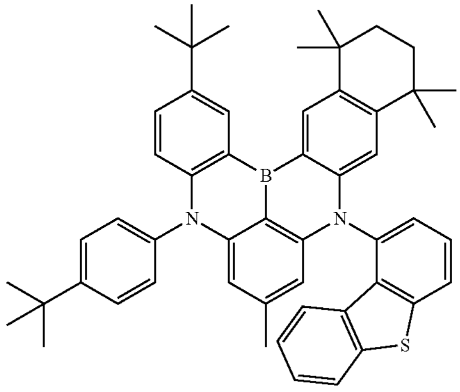
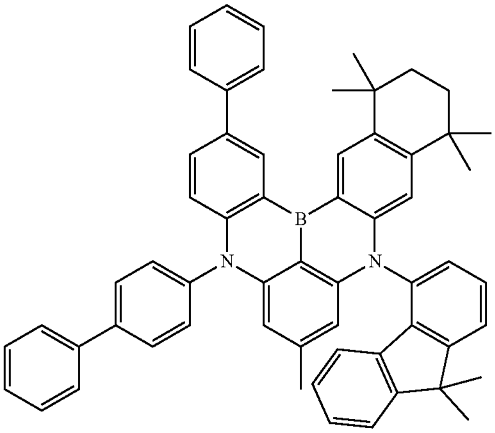
-continued
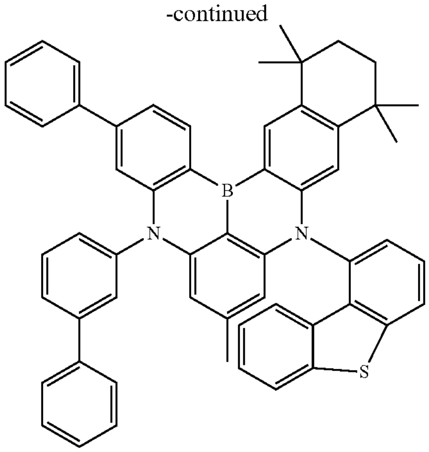
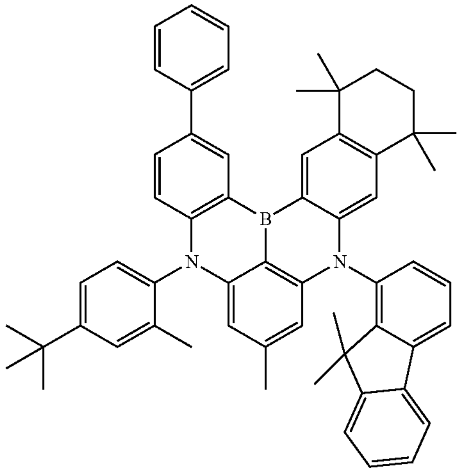
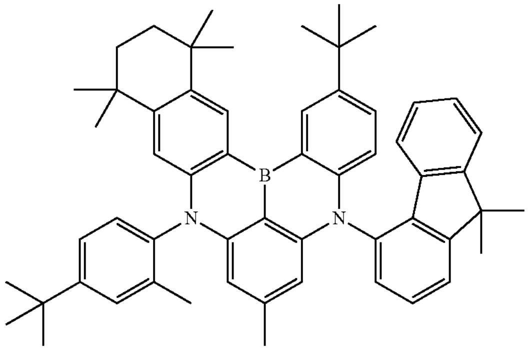
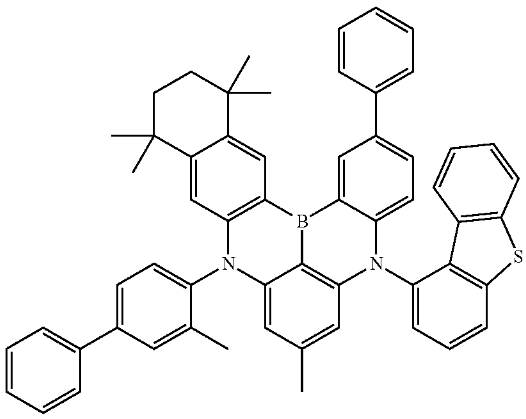

-continued
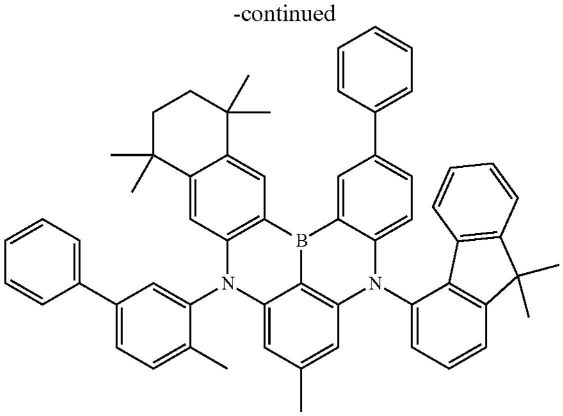
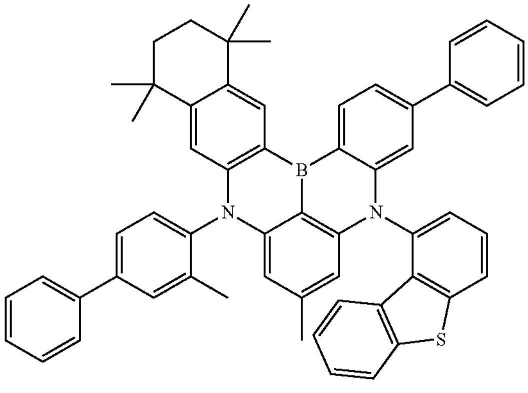
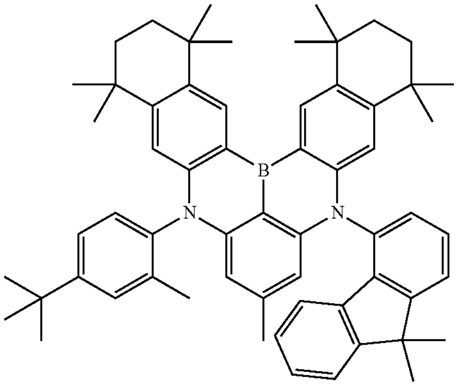
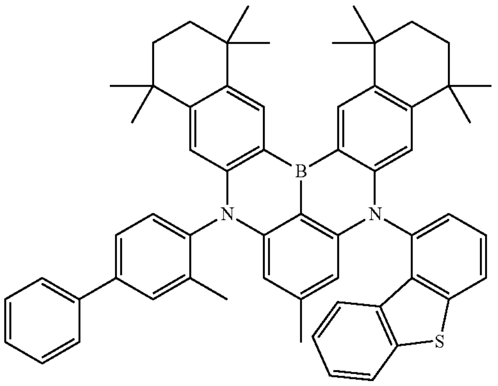
-continued
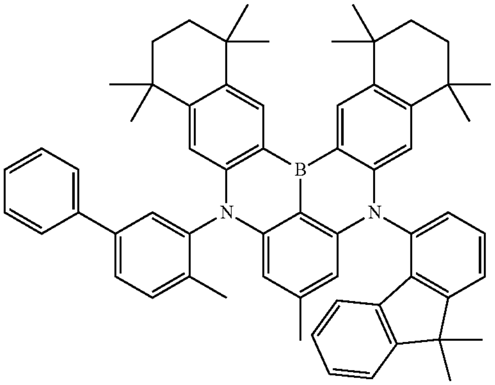
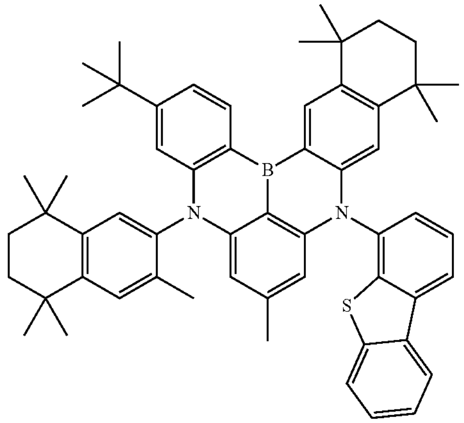
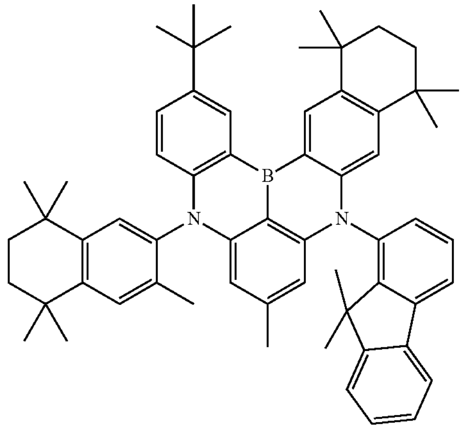
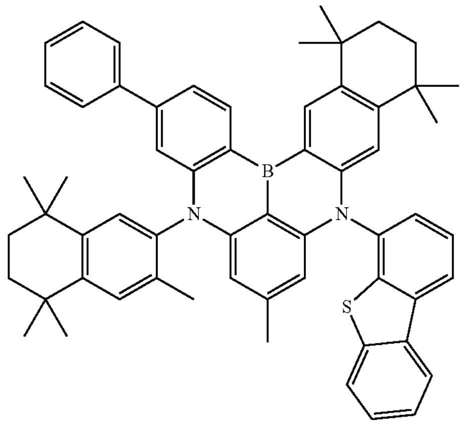

-continued
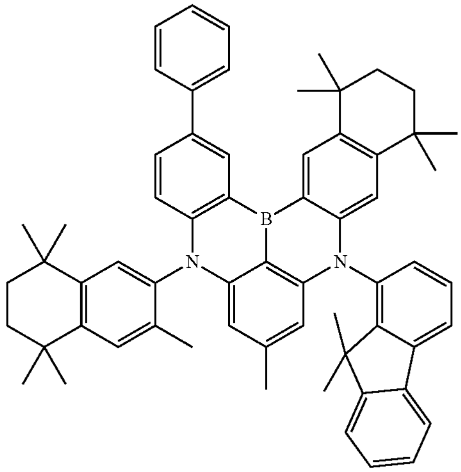
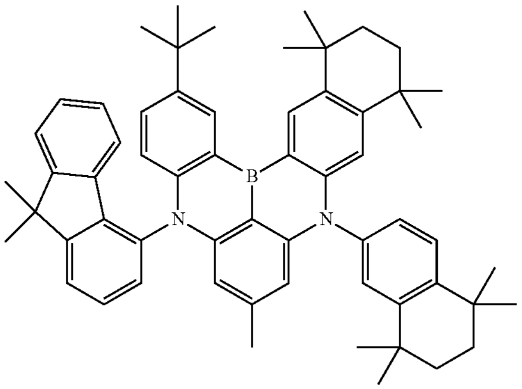
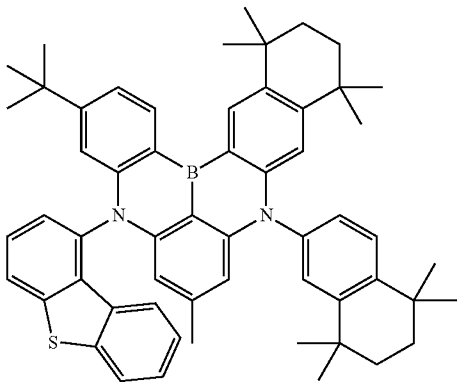
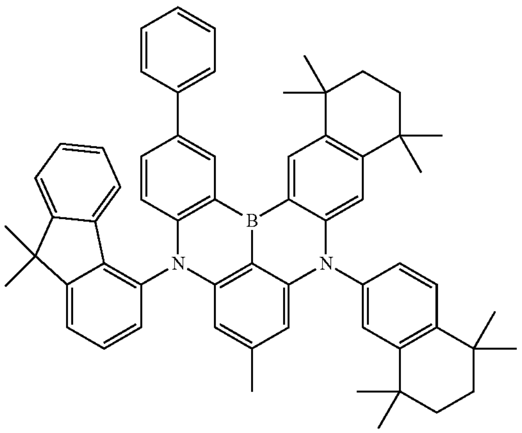
-continued
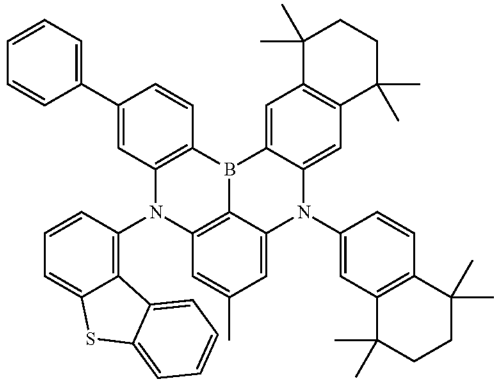
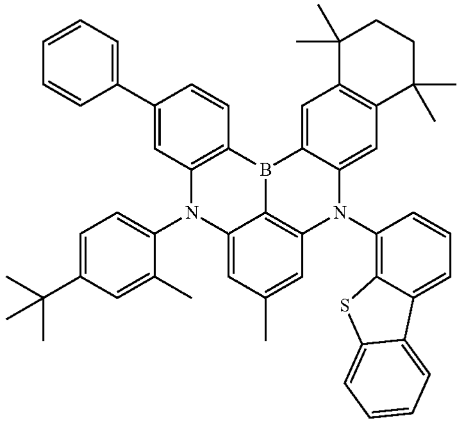
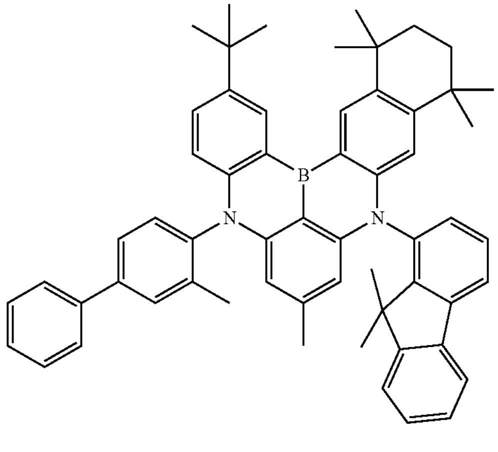
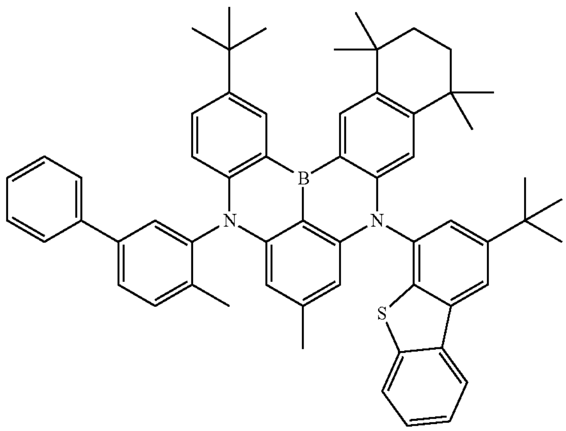

-continued
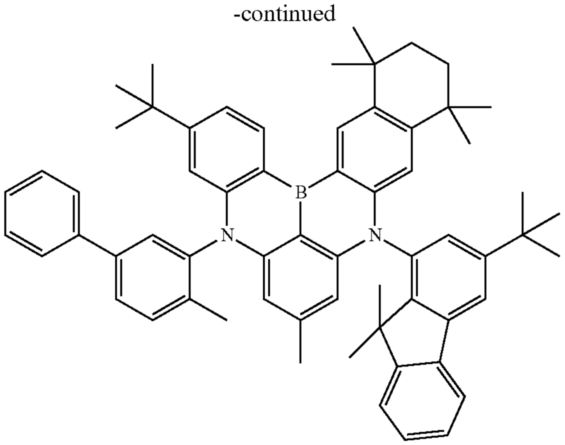
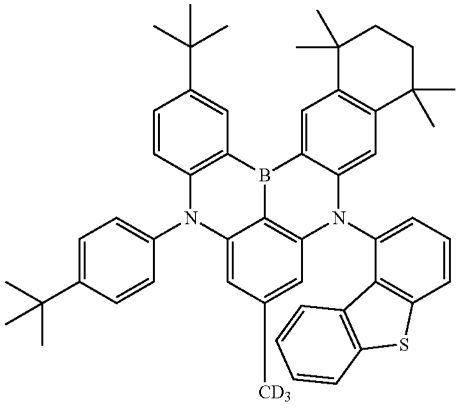
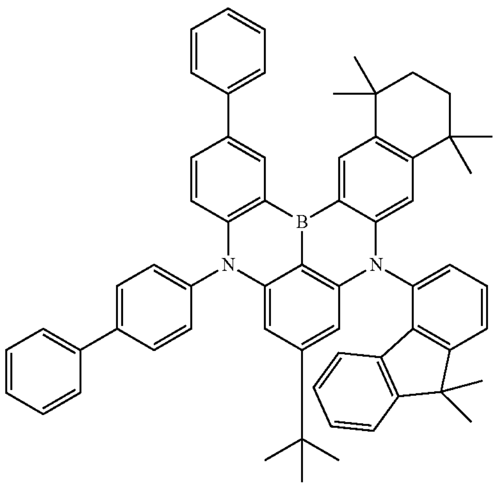
-continued
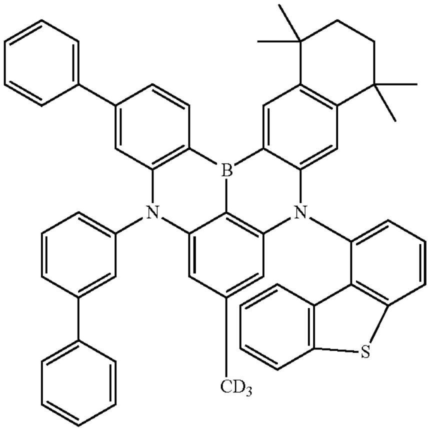
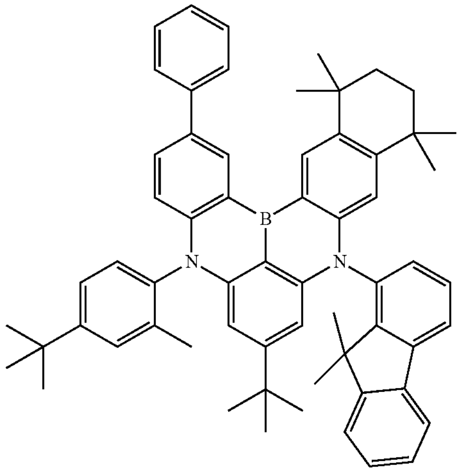
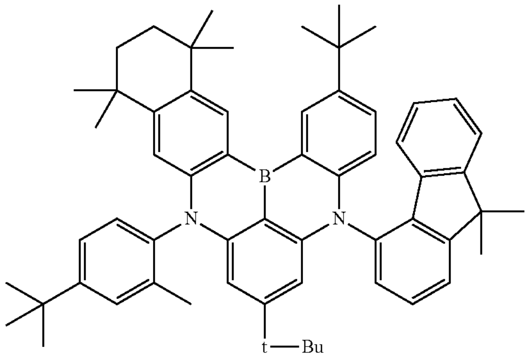
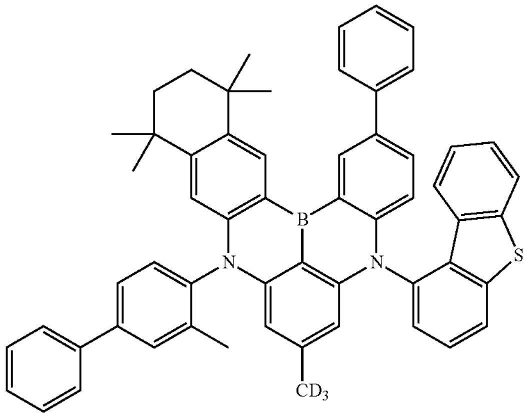

-continued
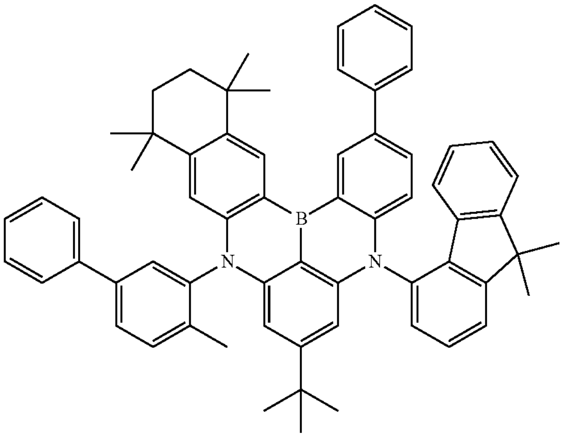
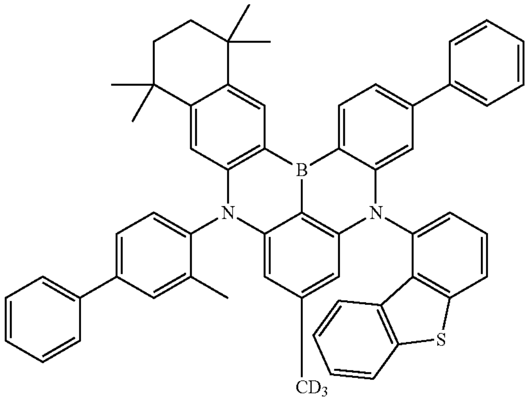
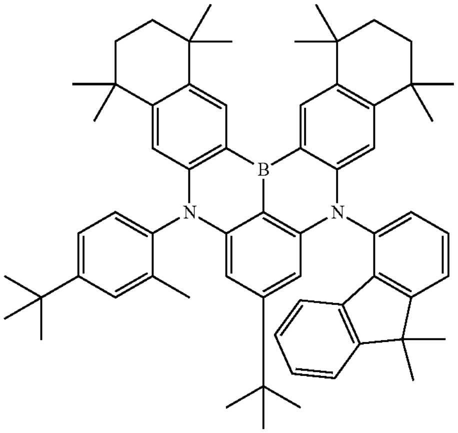
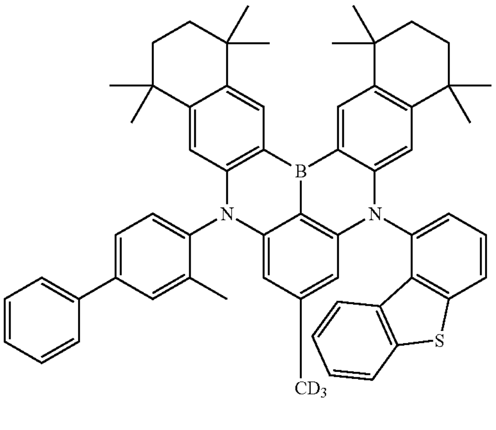
-continued
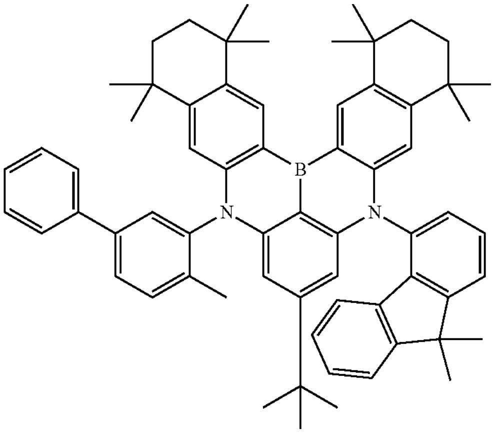
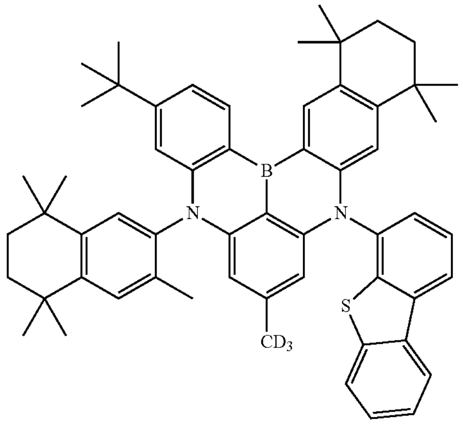
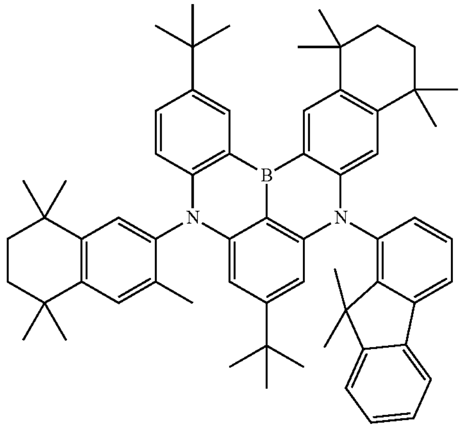
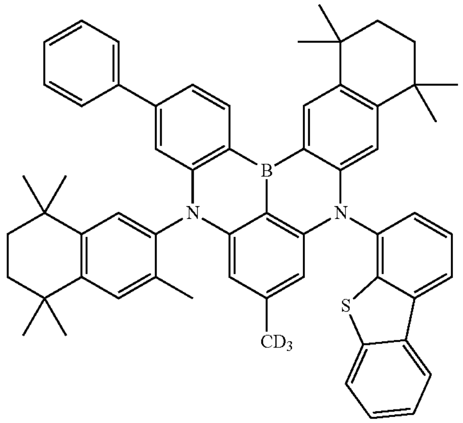

-continued
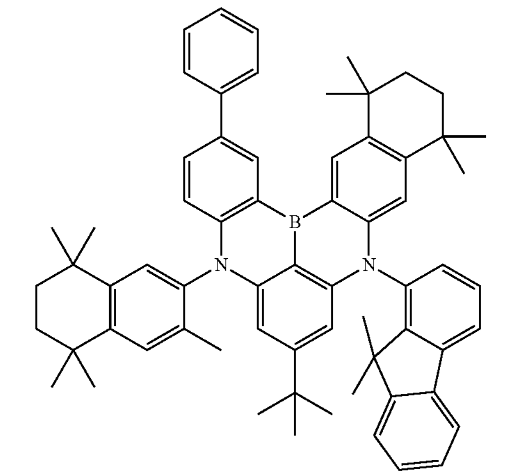
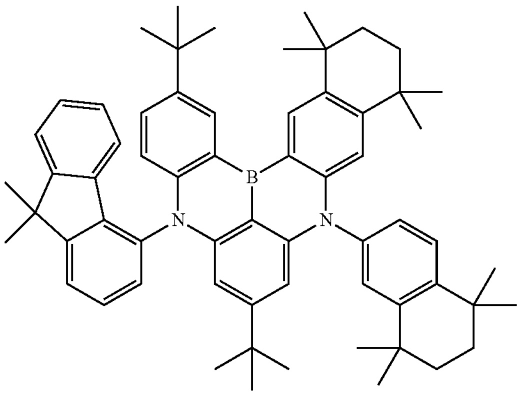
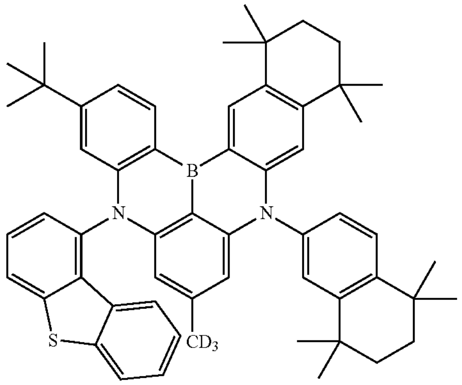
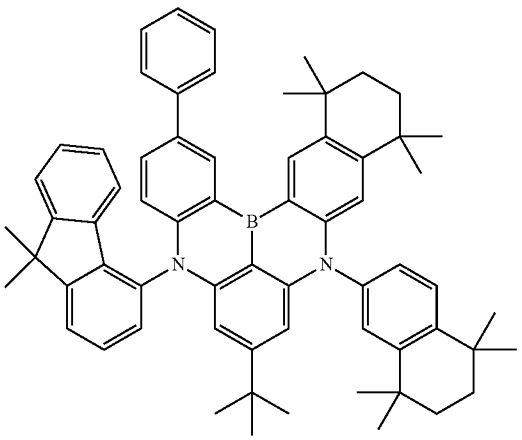
-continued
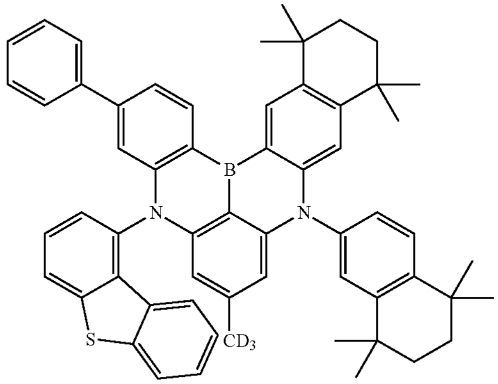
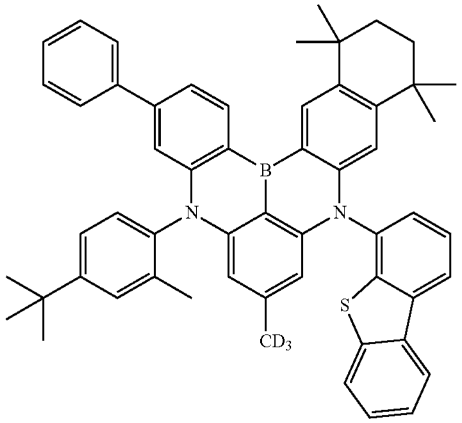
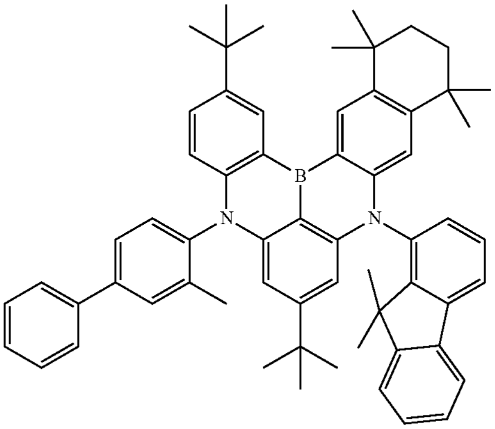
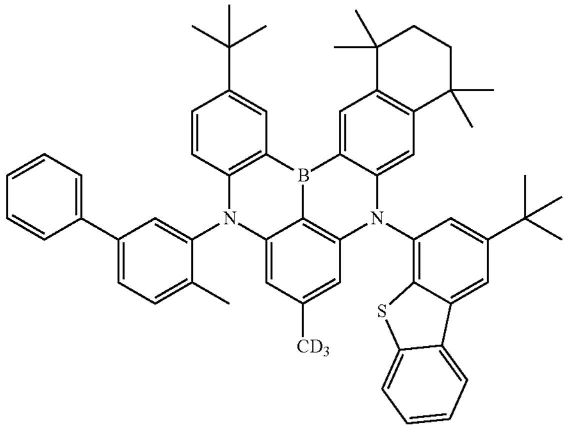

-continued
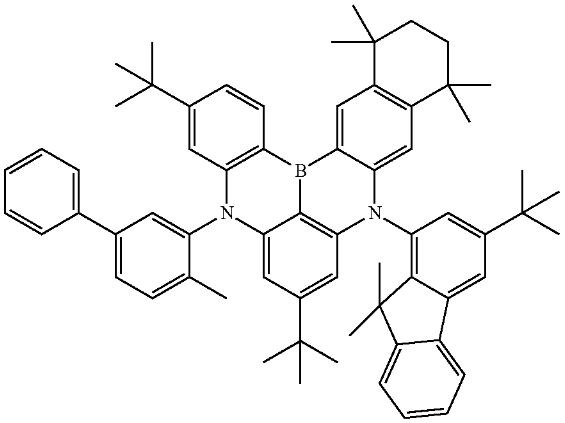
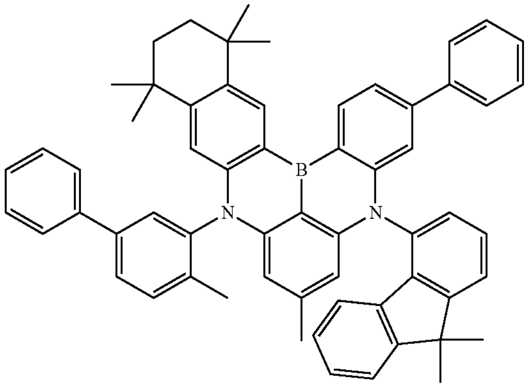
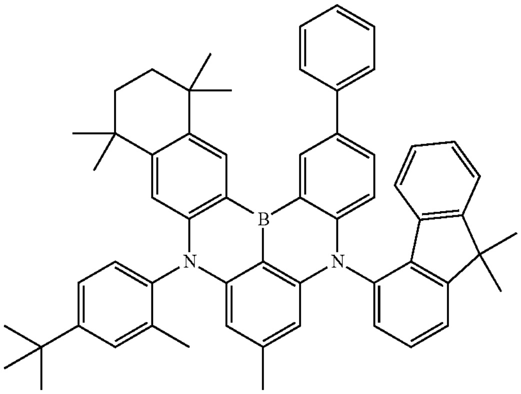
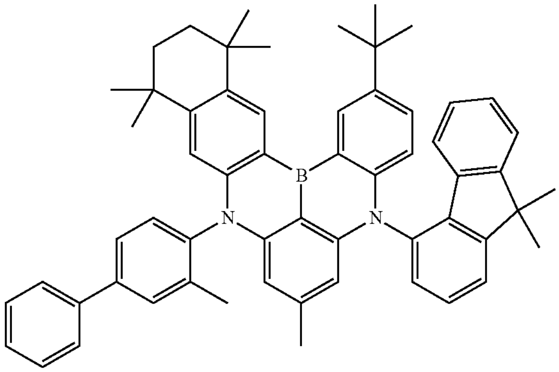
-continued
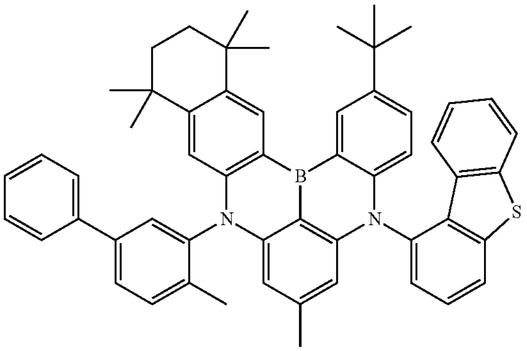
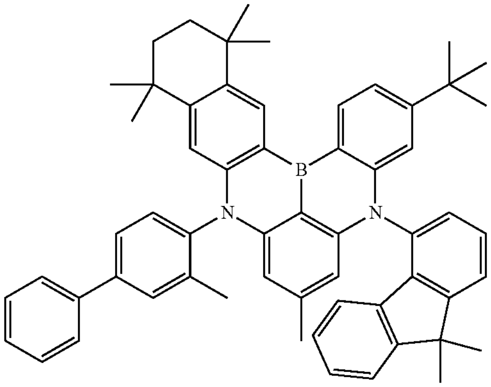
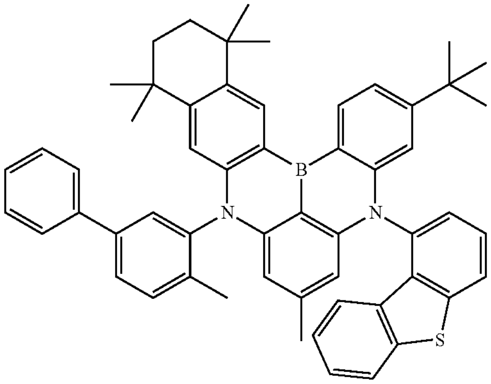
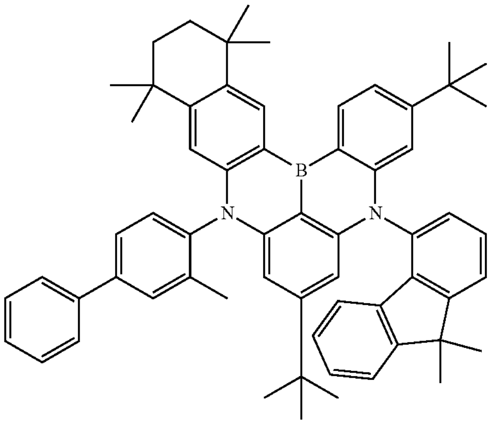

-continued
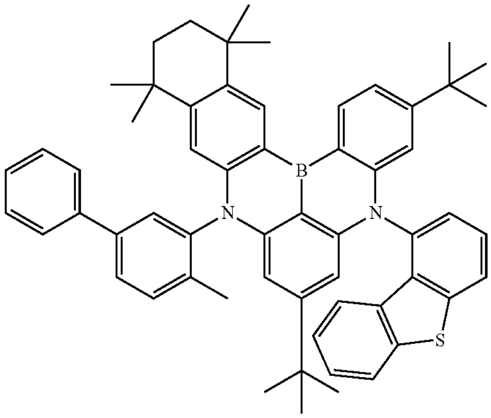
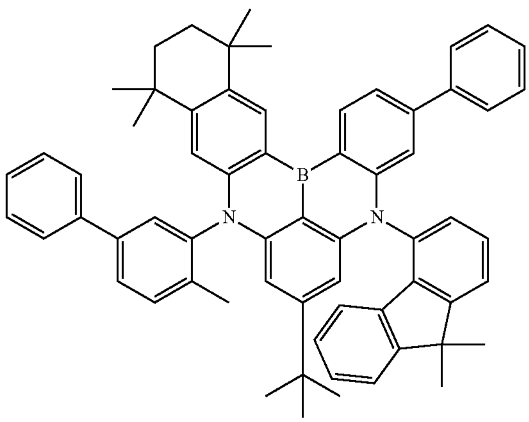
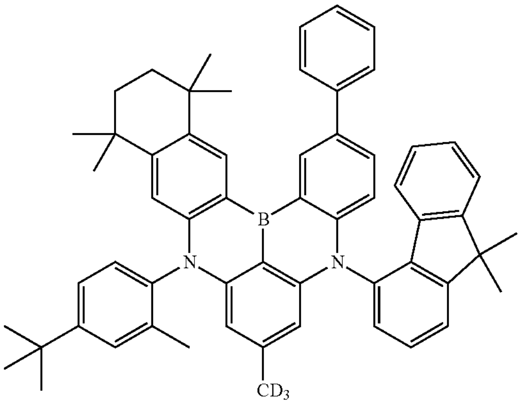
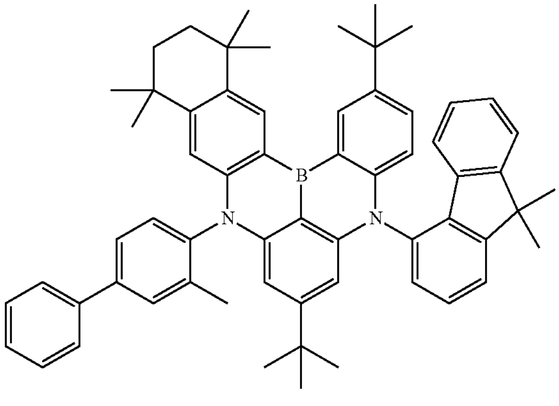
-continued
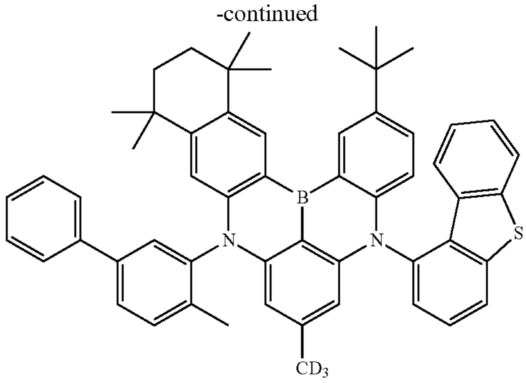
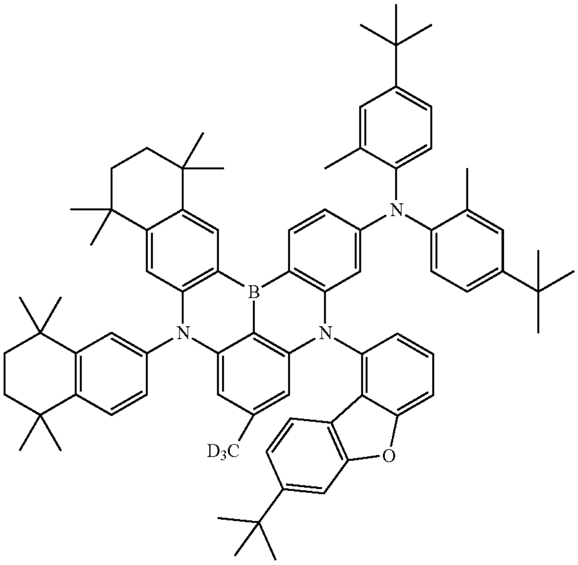
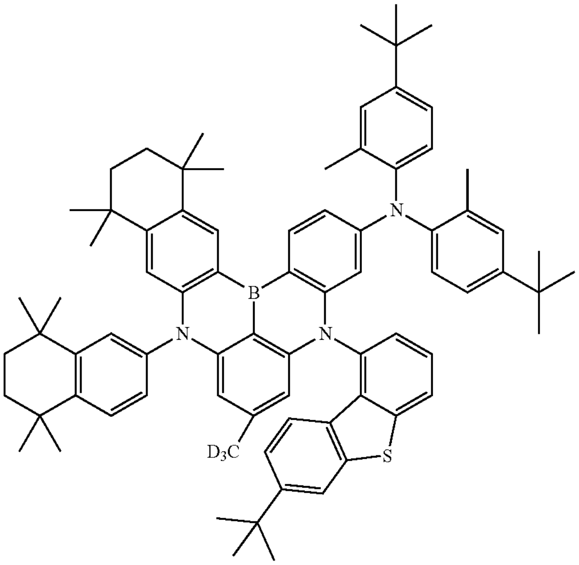

-continued
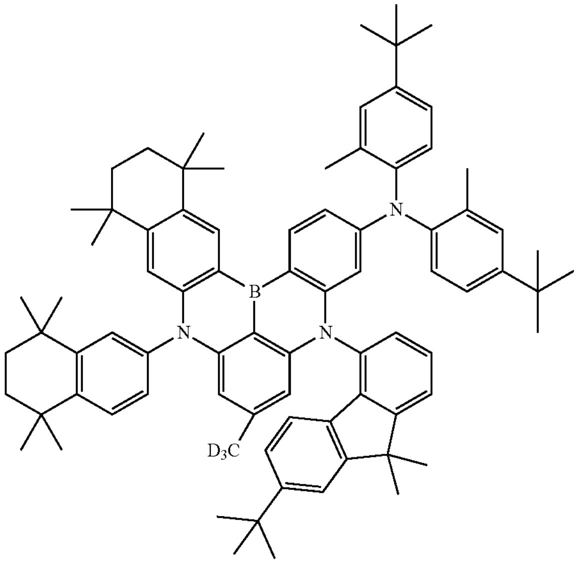
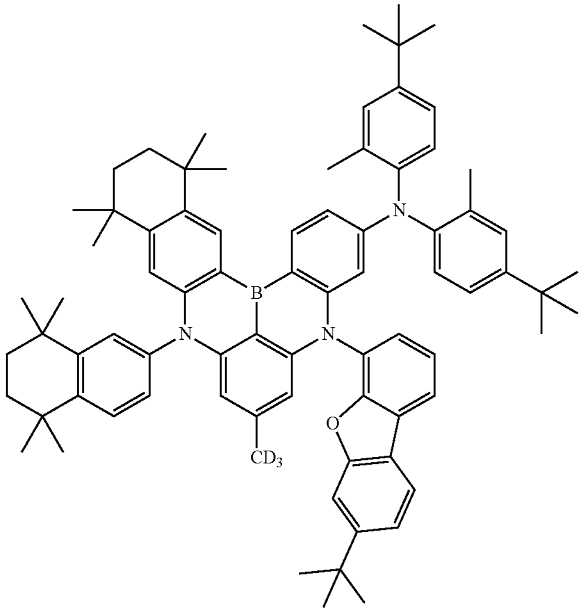
-continued
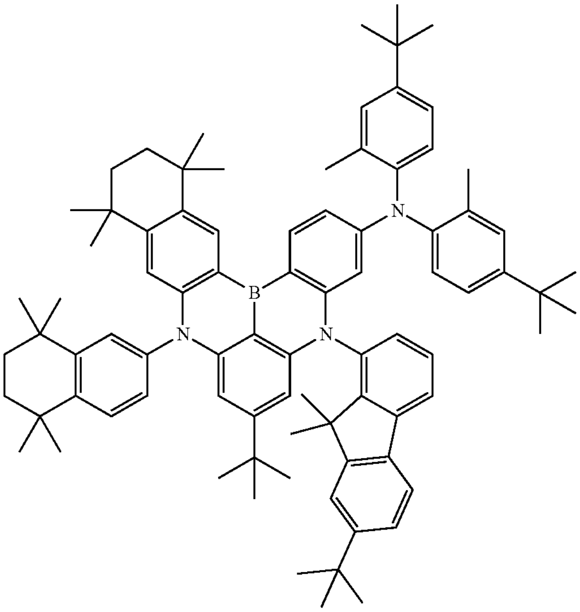
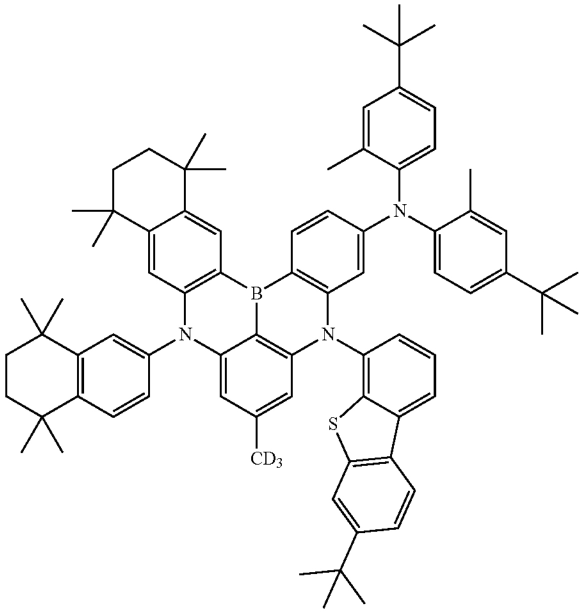

-continued
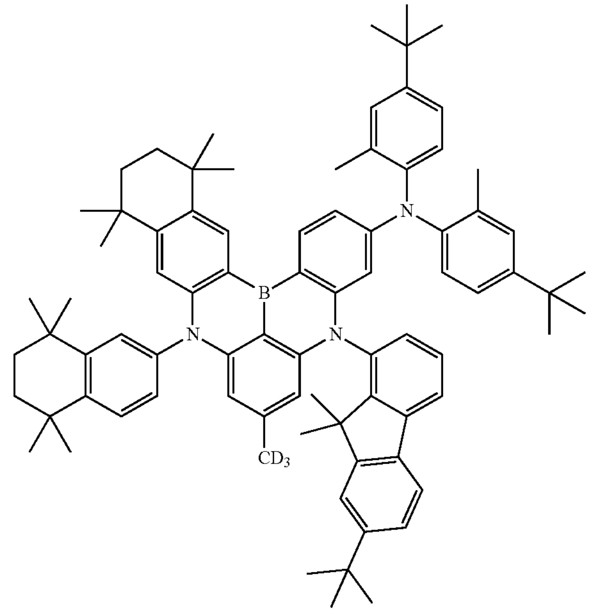
-continued
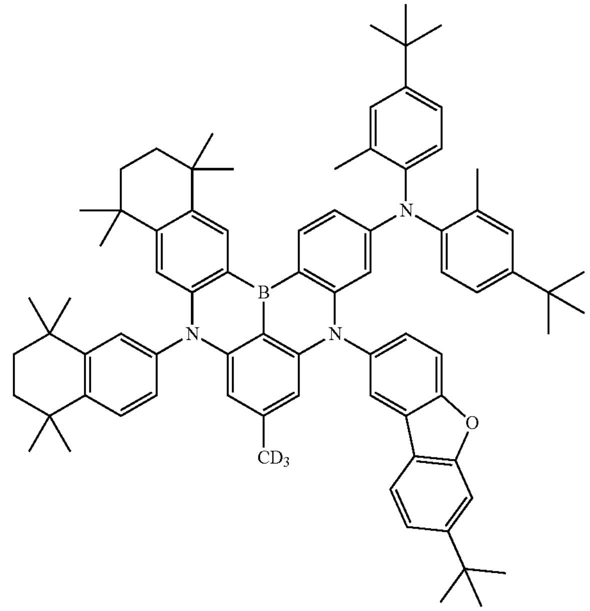
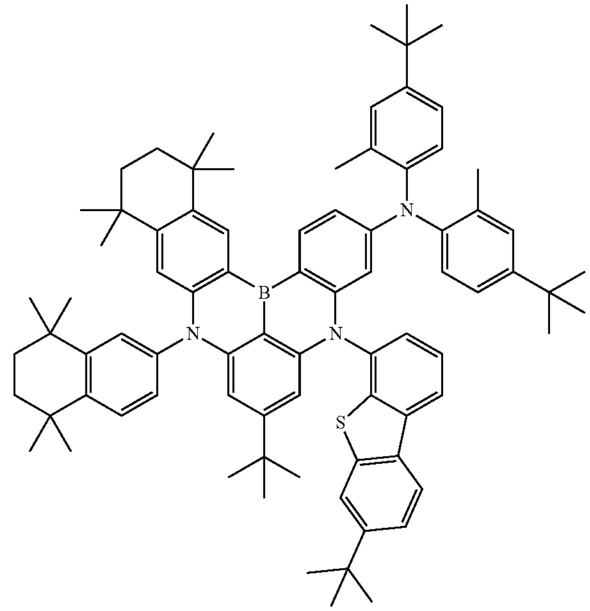
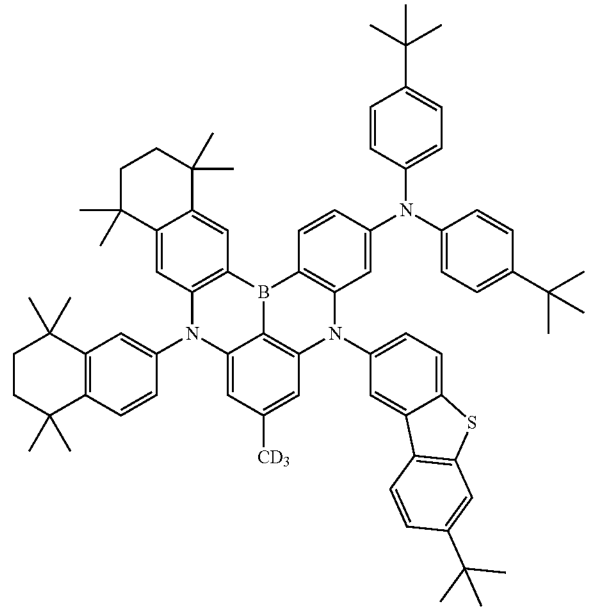

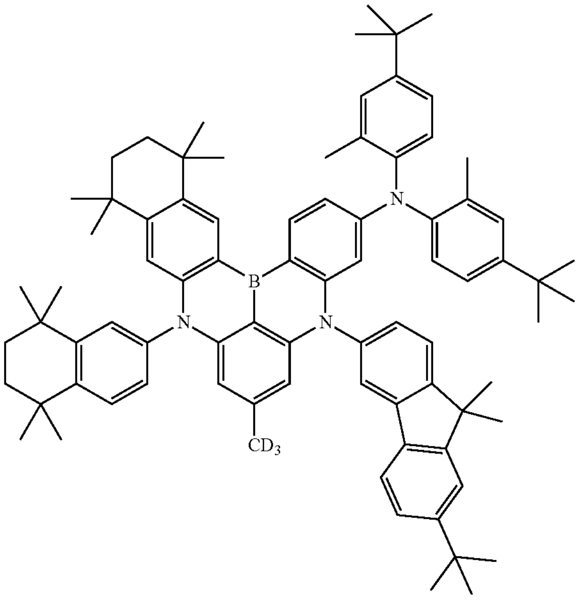
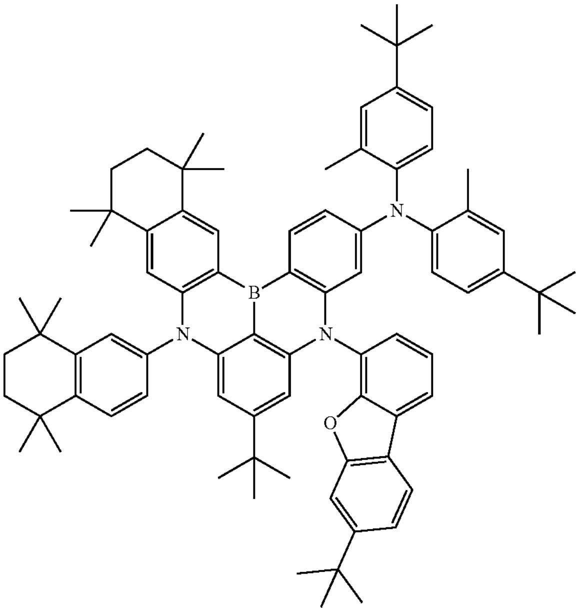
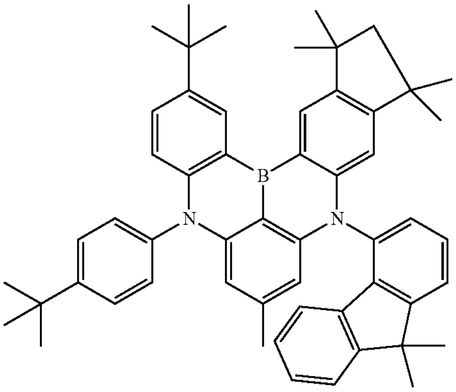
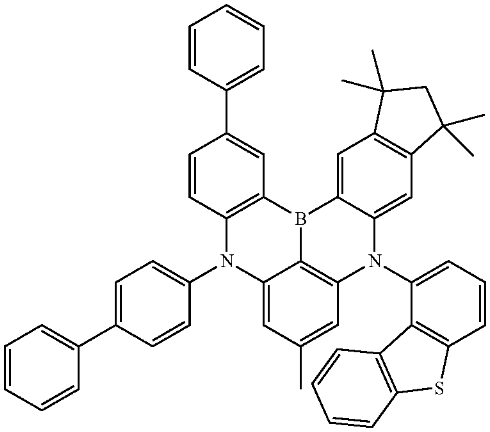
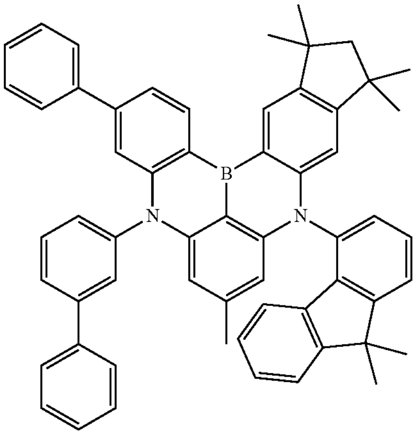
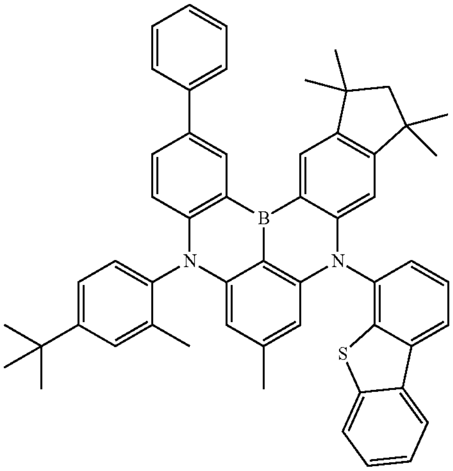
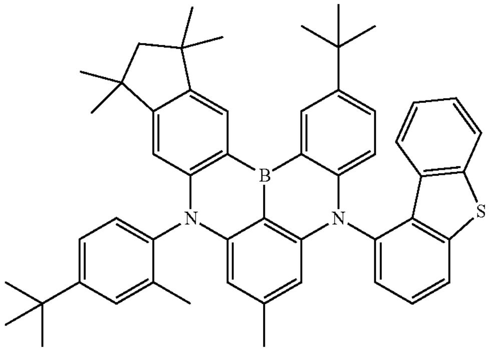

-continued
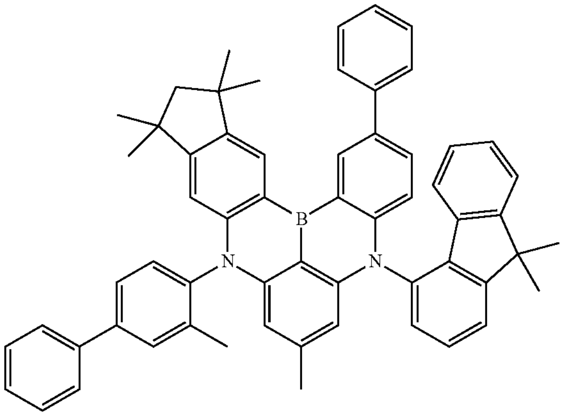
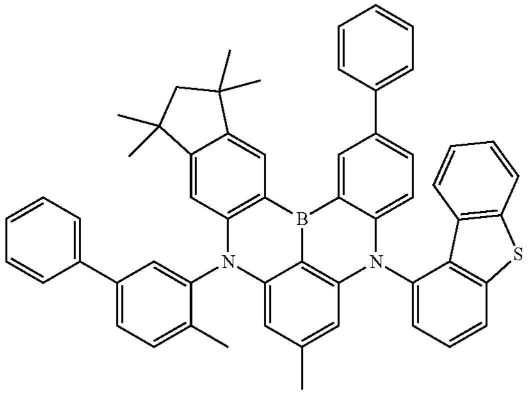
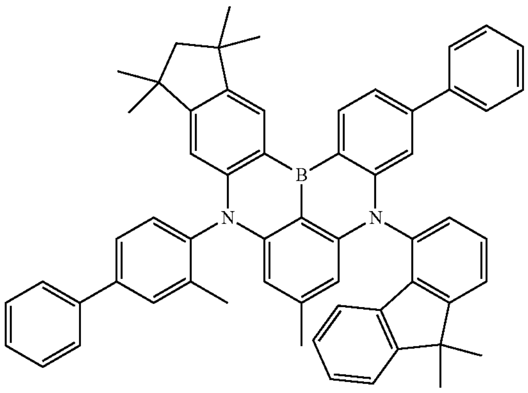
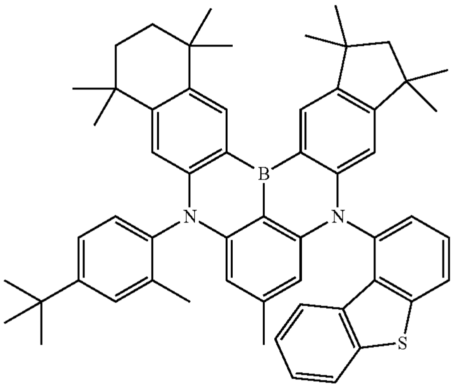
-continued
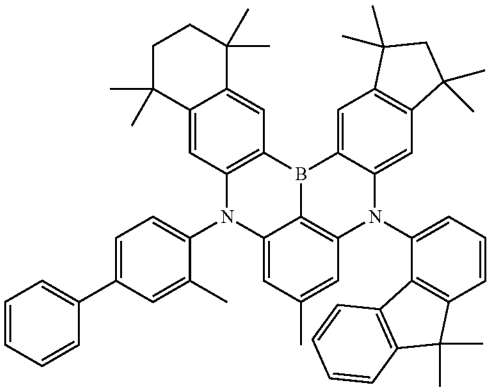
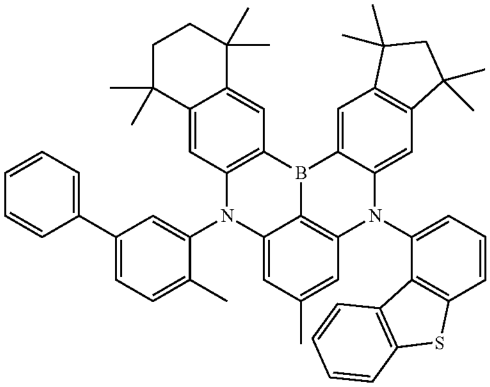
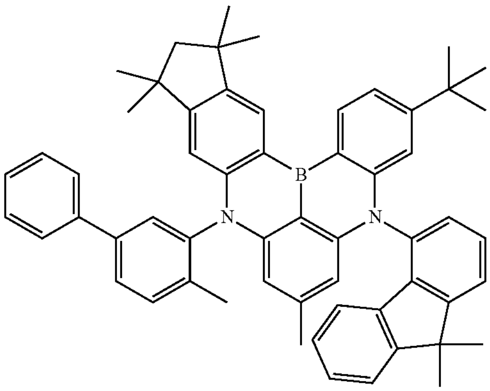
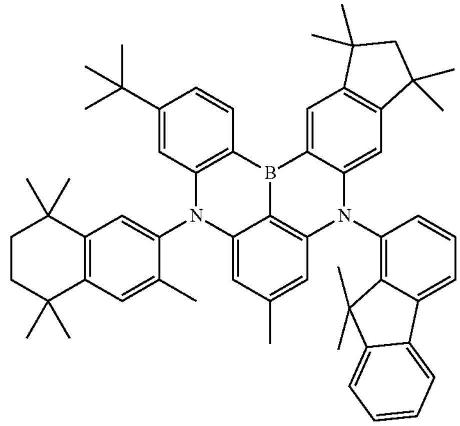

-continued
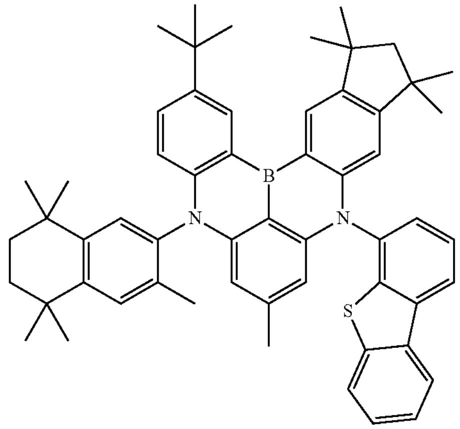
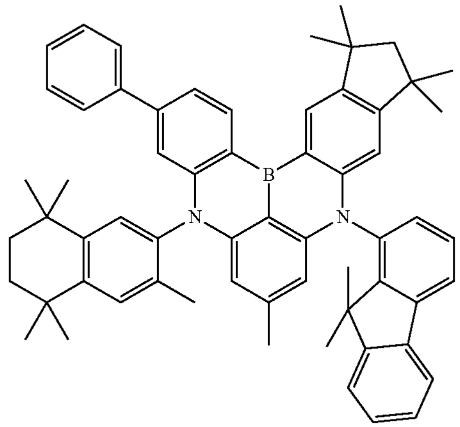
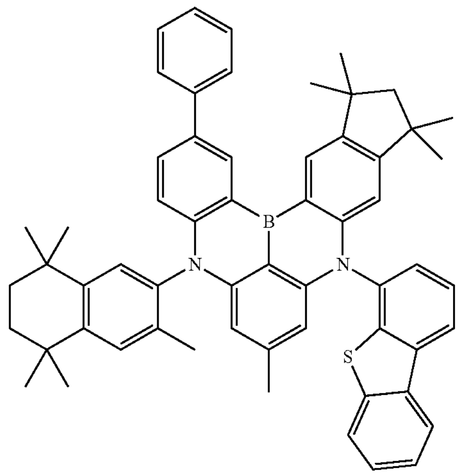
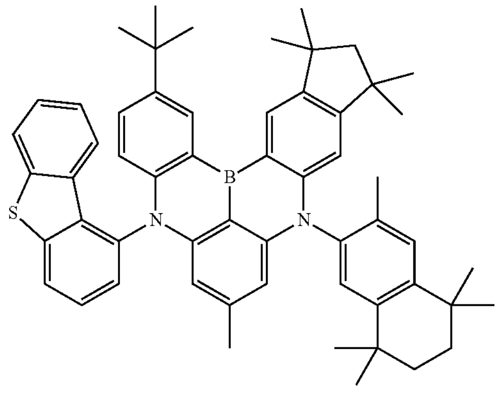
-continued
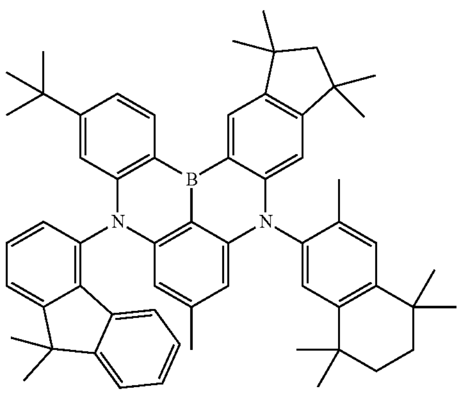
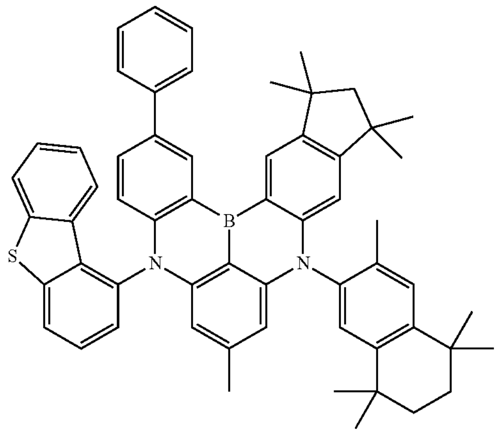
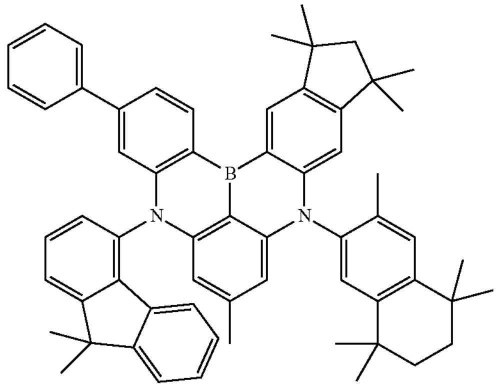
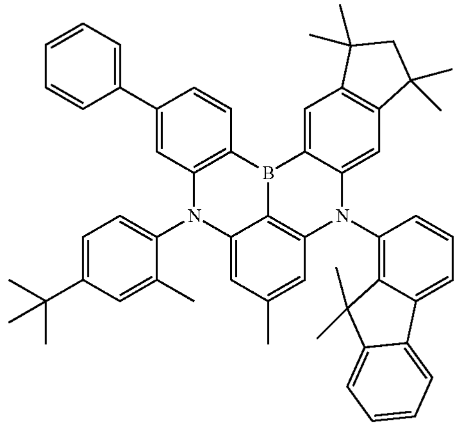

-continued
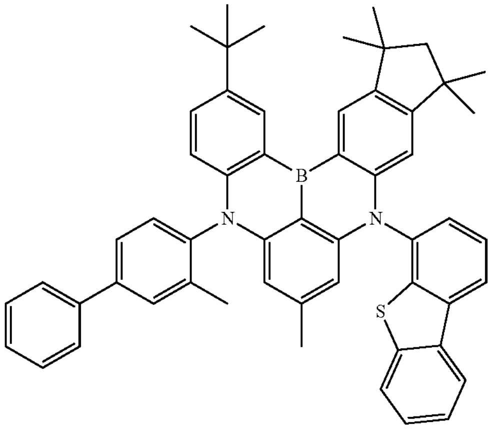
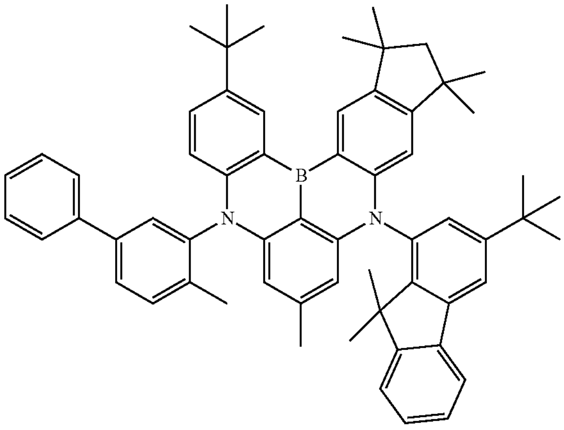
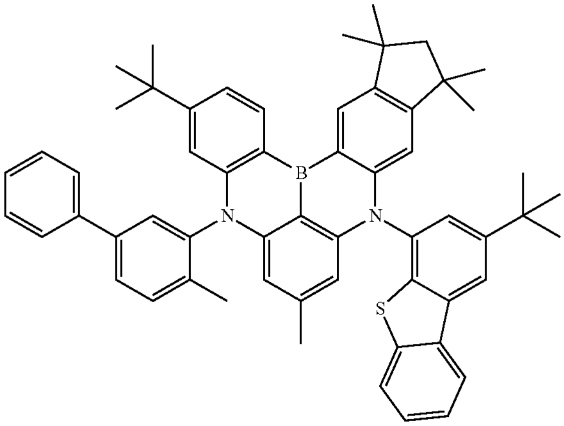
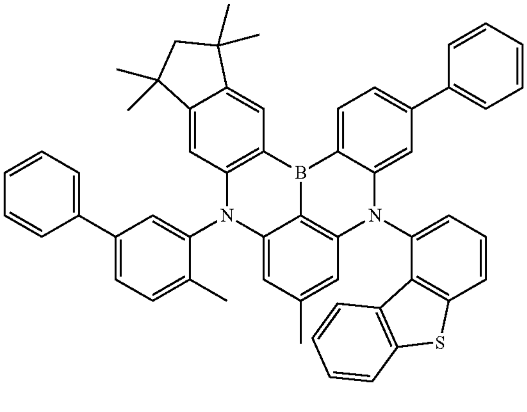
-continued
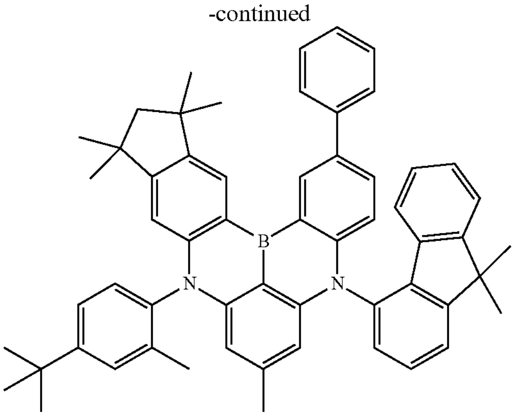
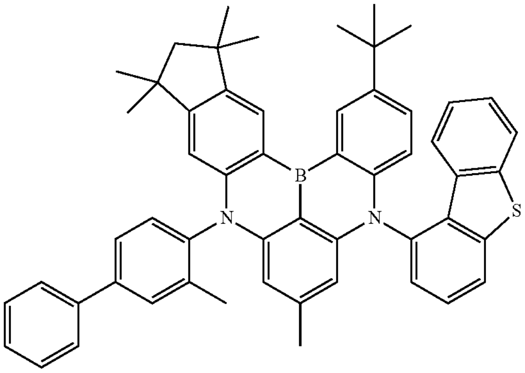
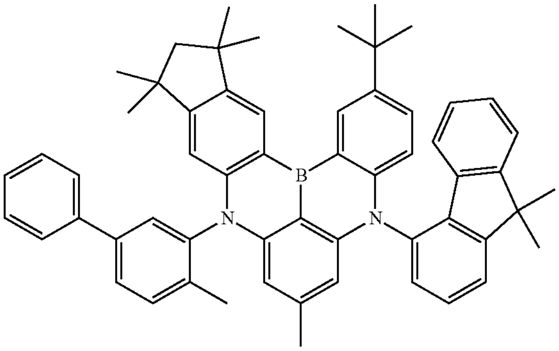
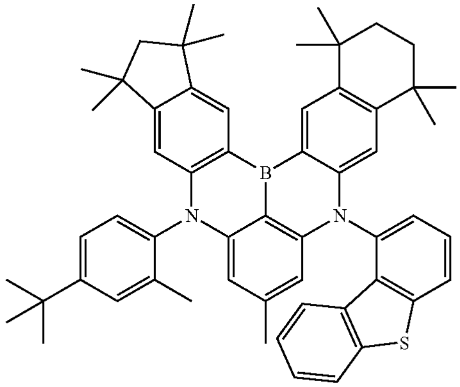

-continued
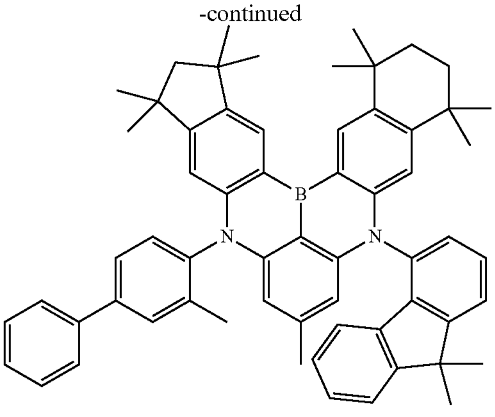
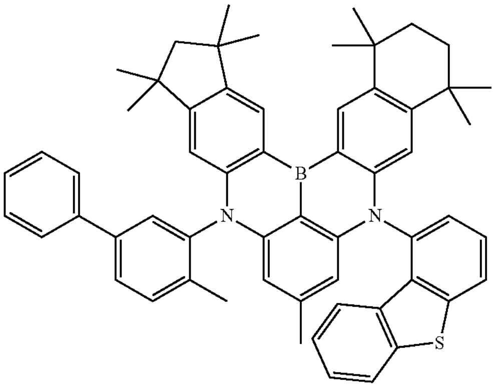
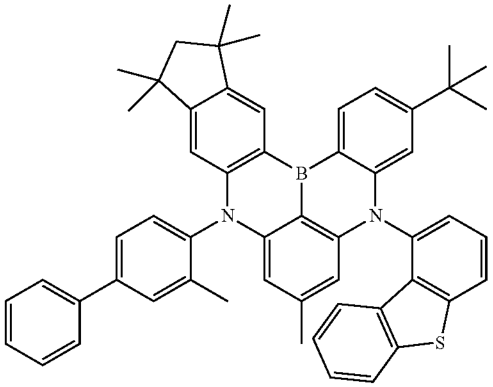
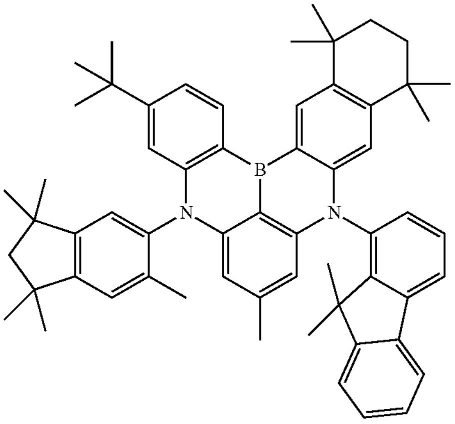
-continued
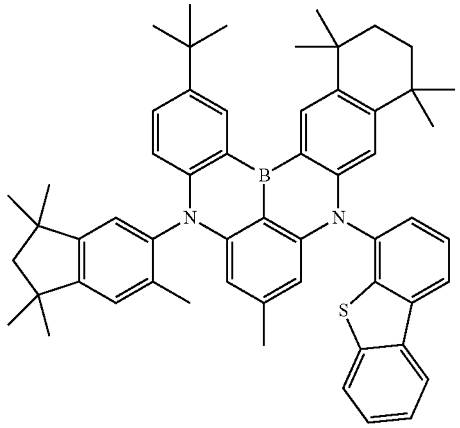
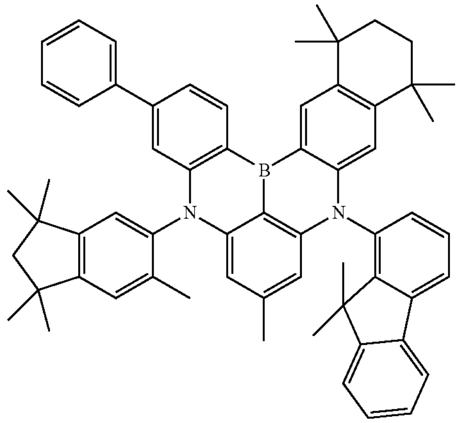
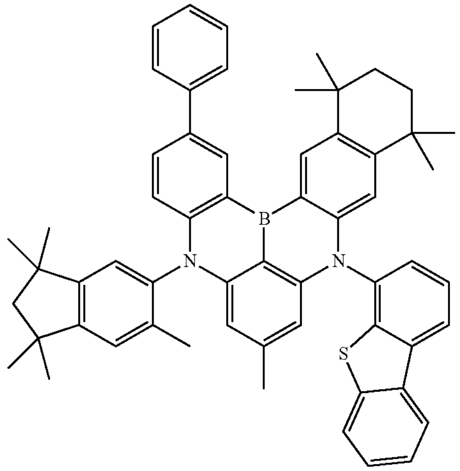
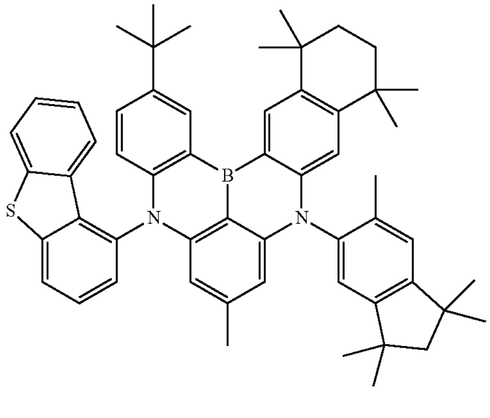

-continued
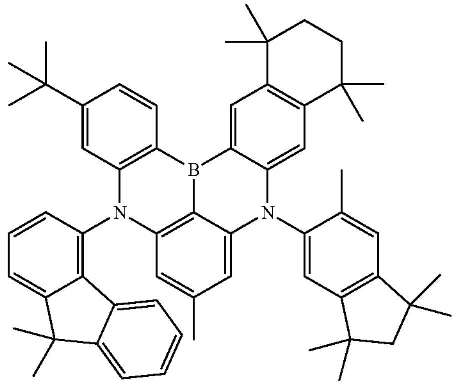
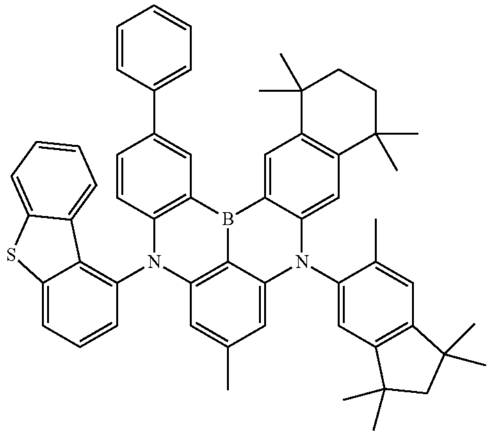
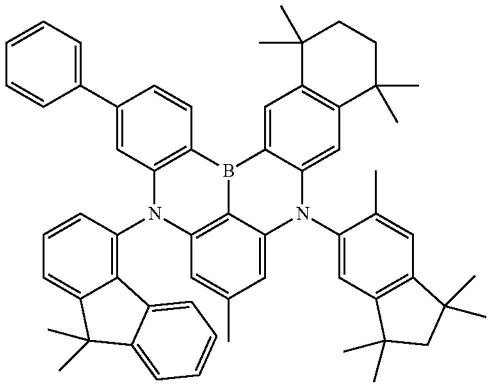
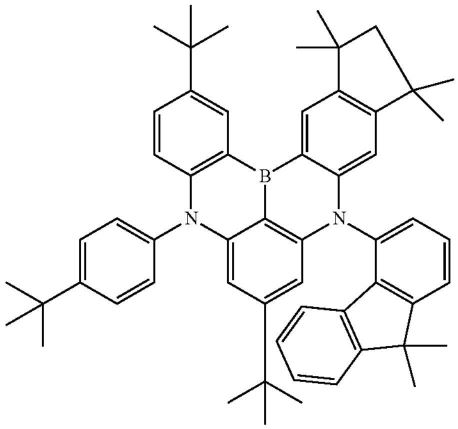
-continued
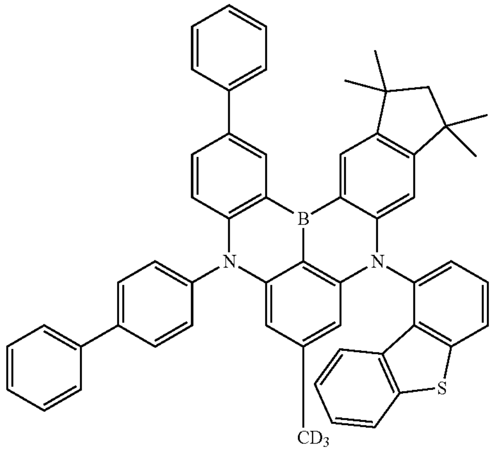
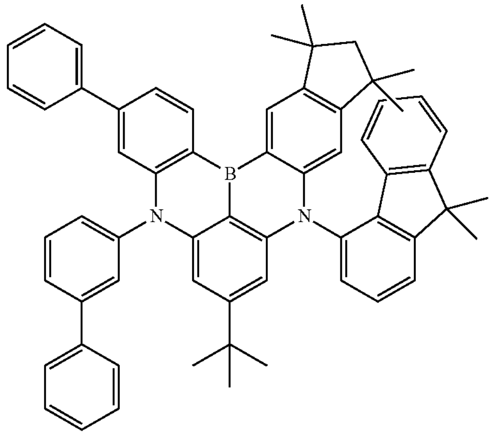
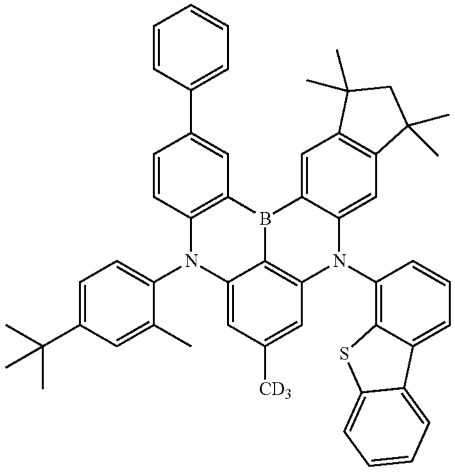
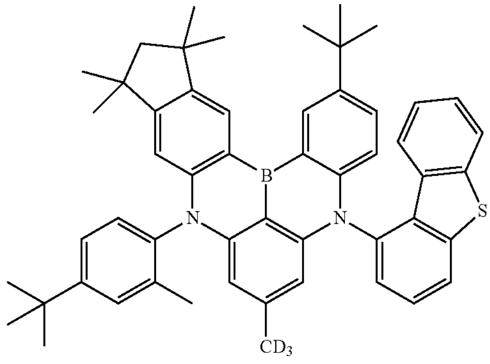

-continued
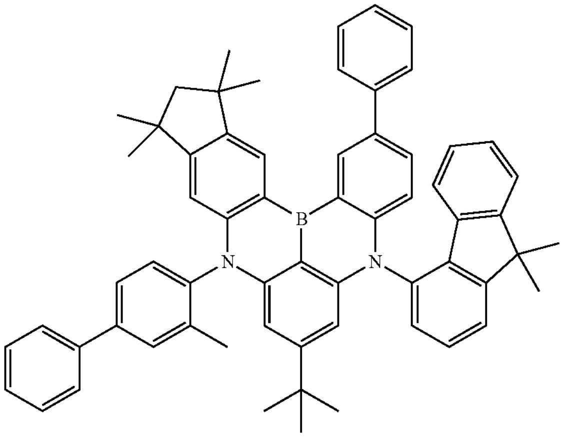
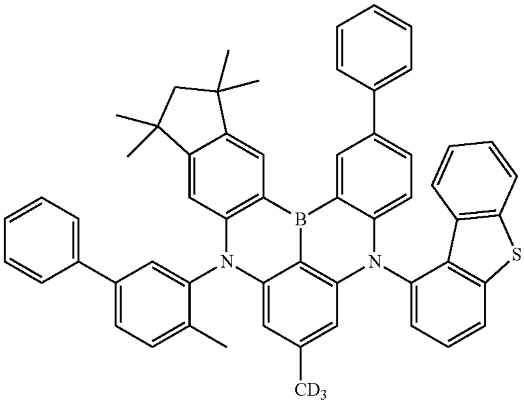
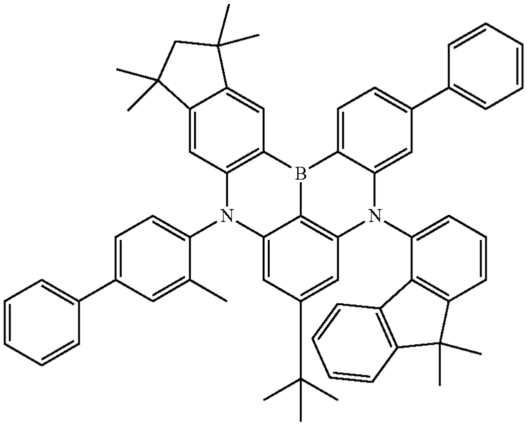
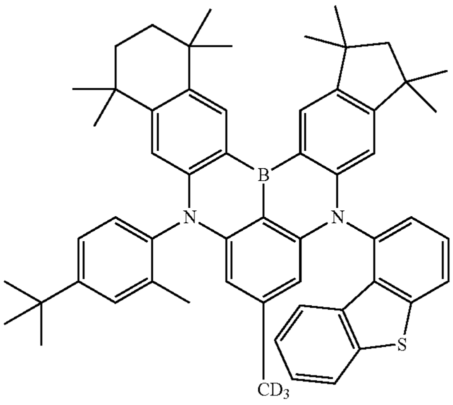
-continued
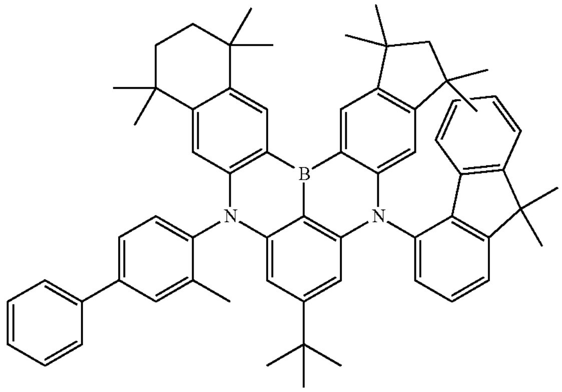
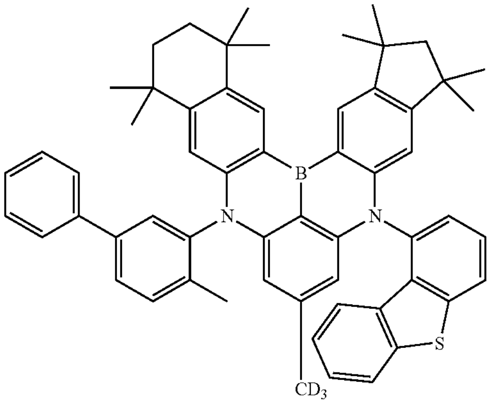
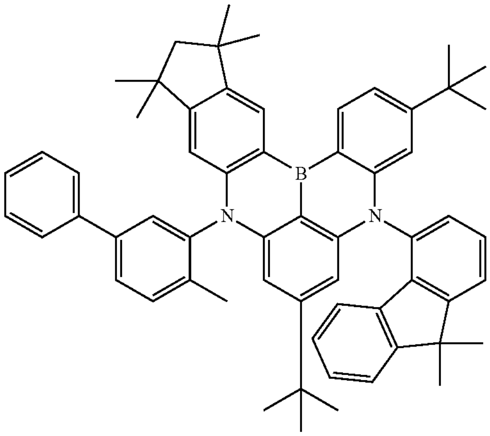
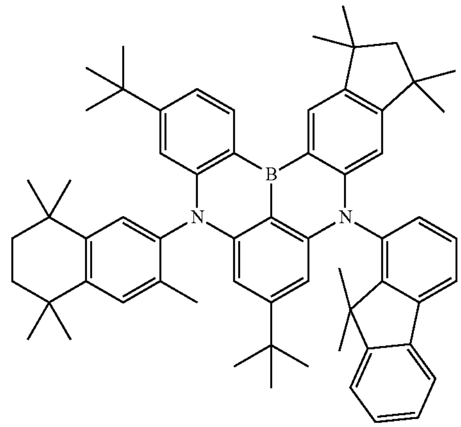

-continued
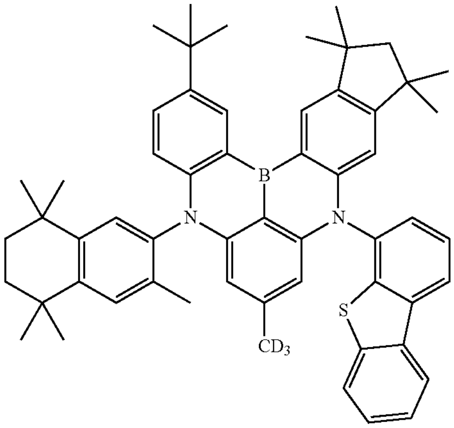
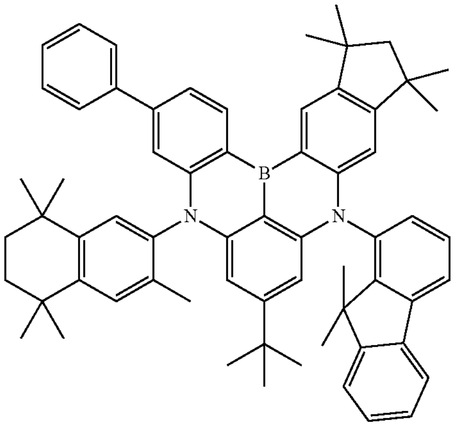
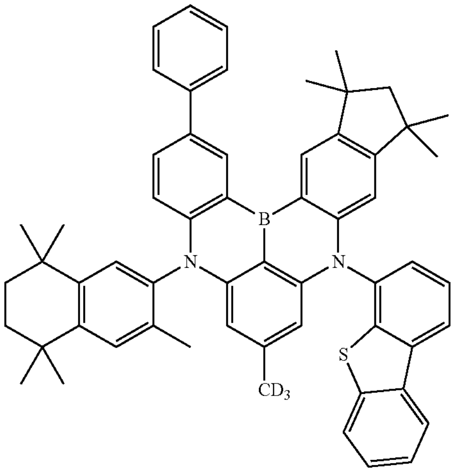
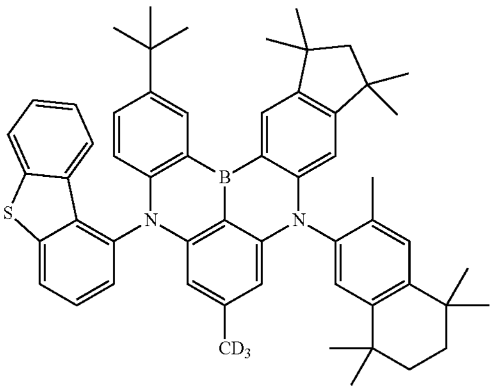
-continued
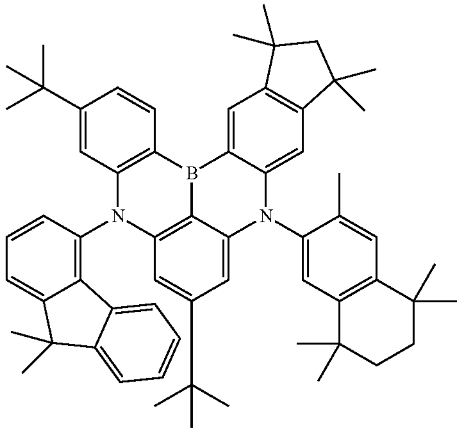
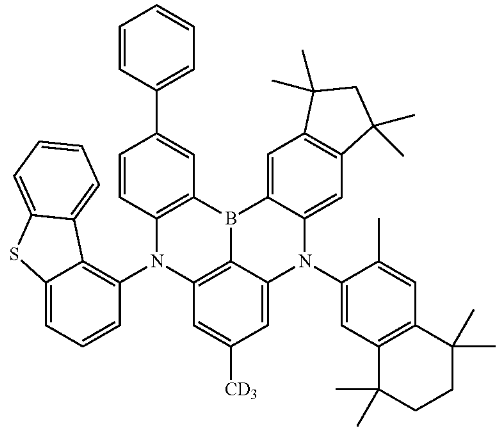
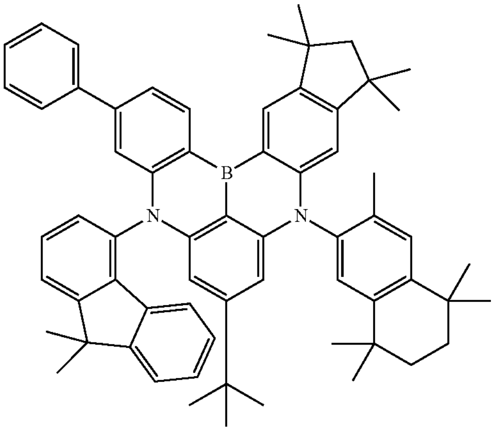
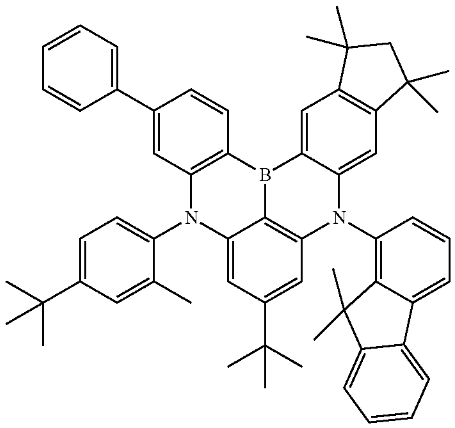

-continued
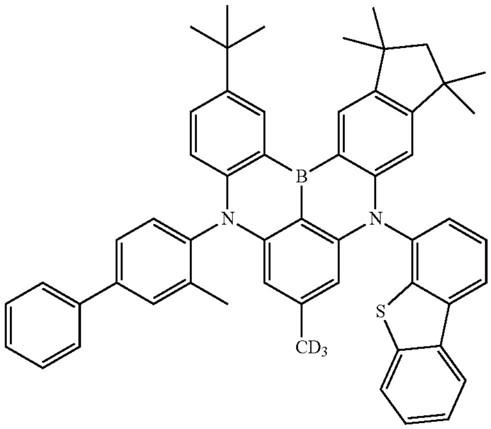
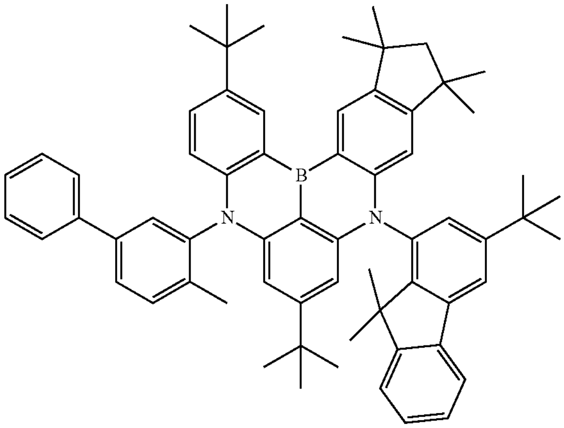
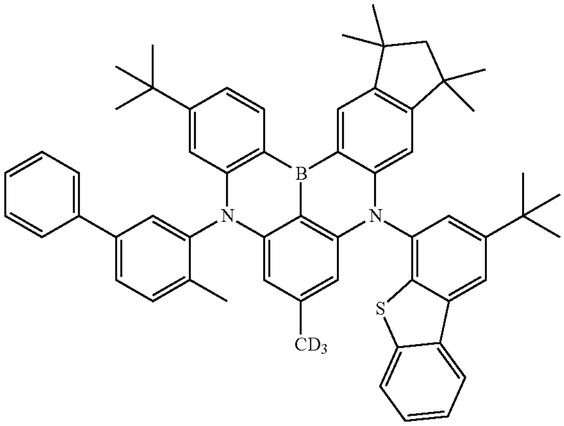
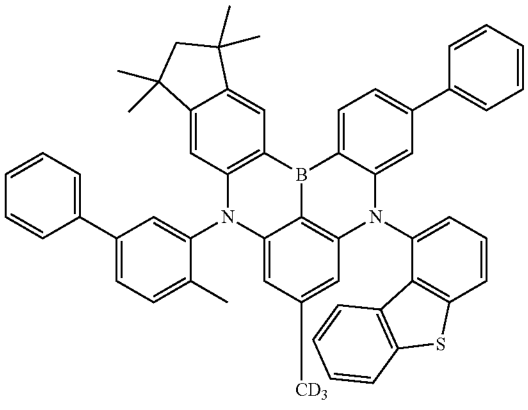
-continued
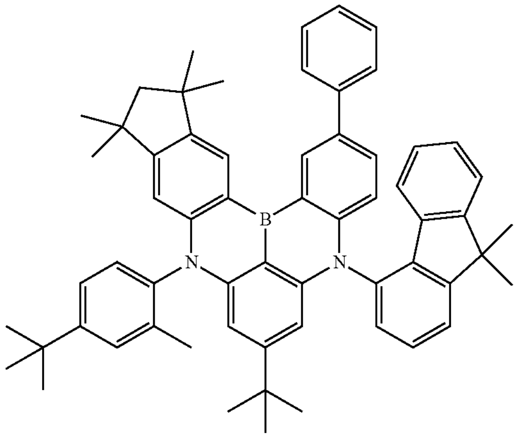
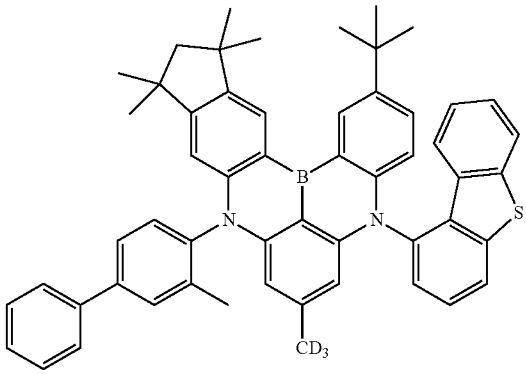
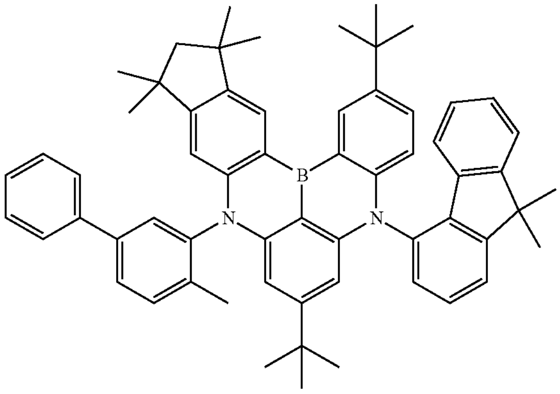
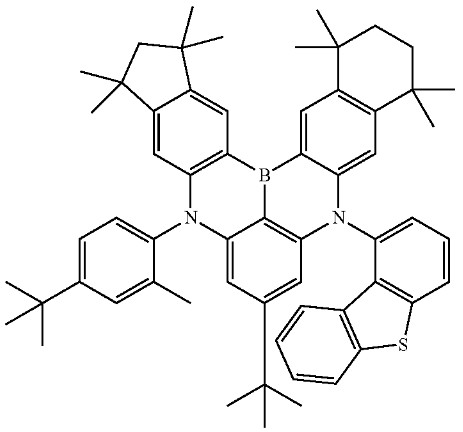

-continued
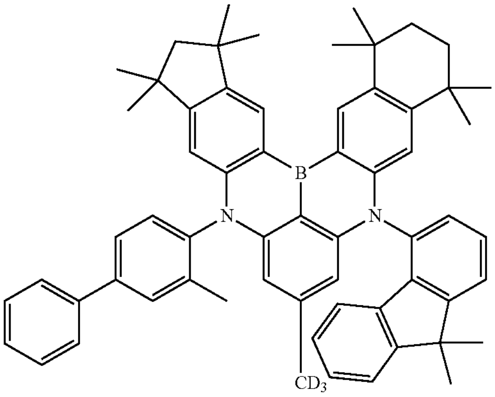
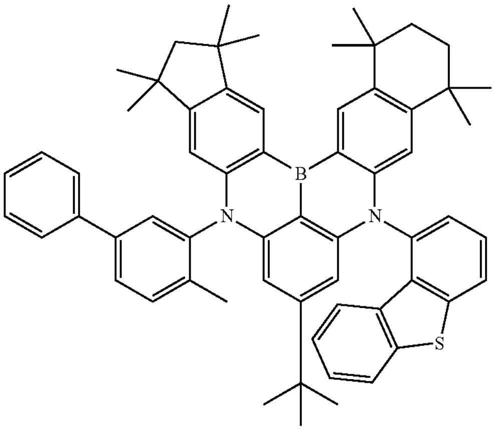
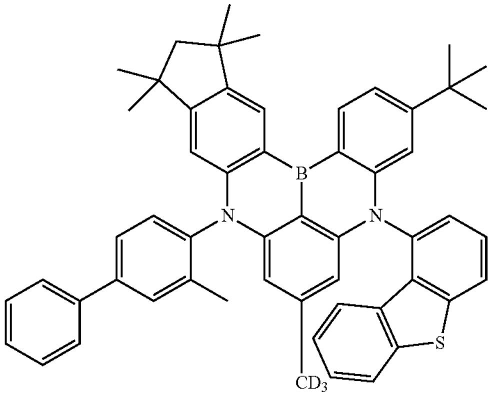
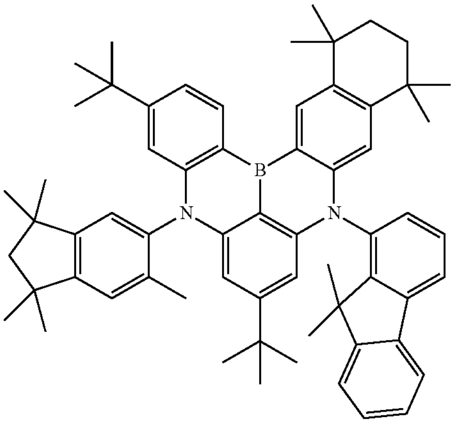
-continued
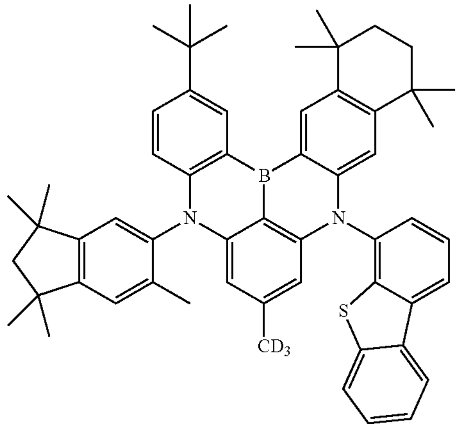
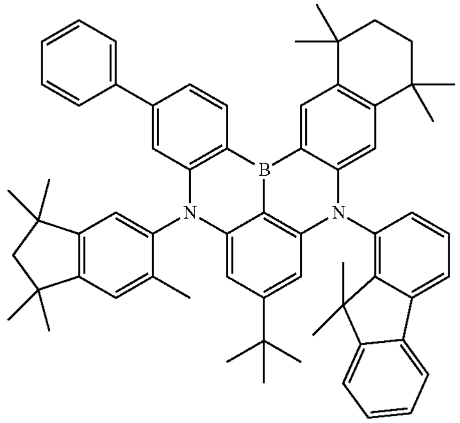
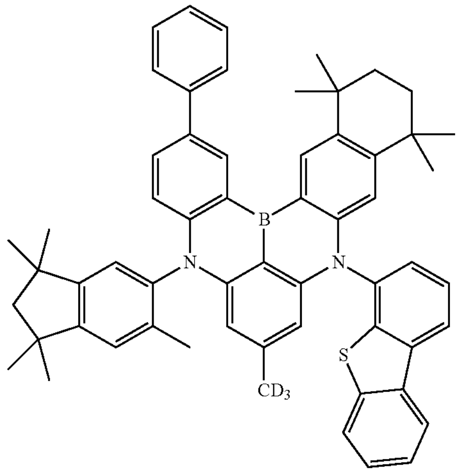
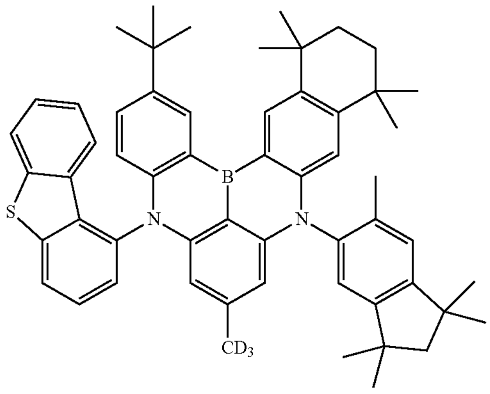

-continued
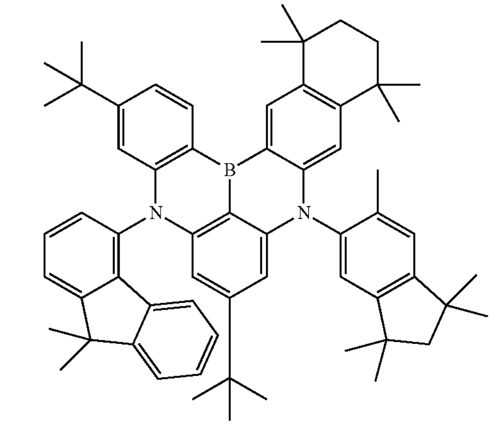
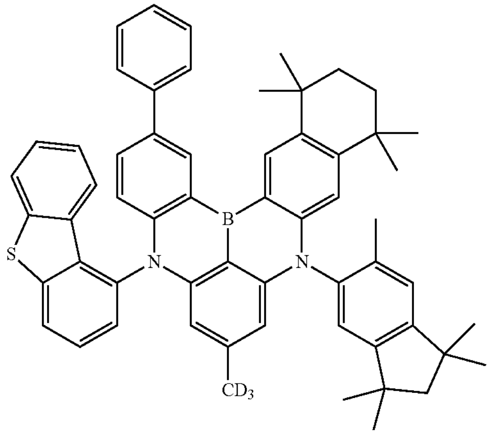
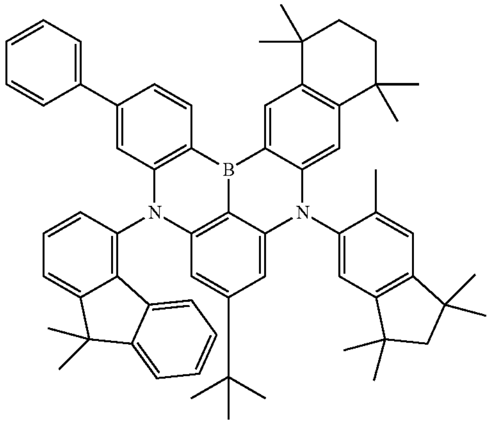
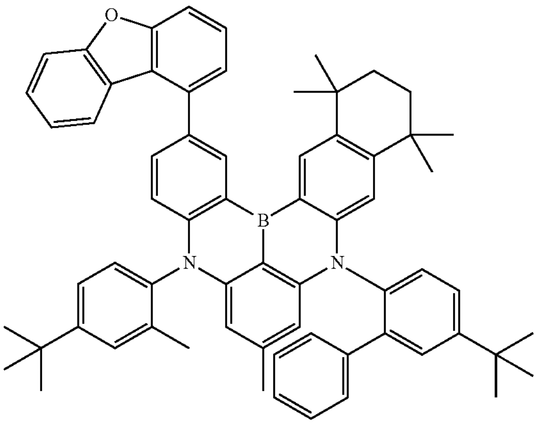
-continued
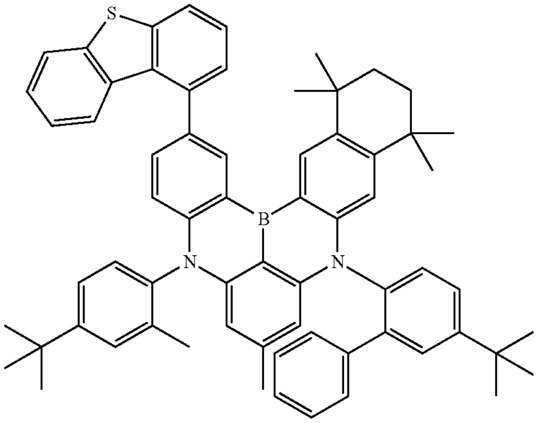
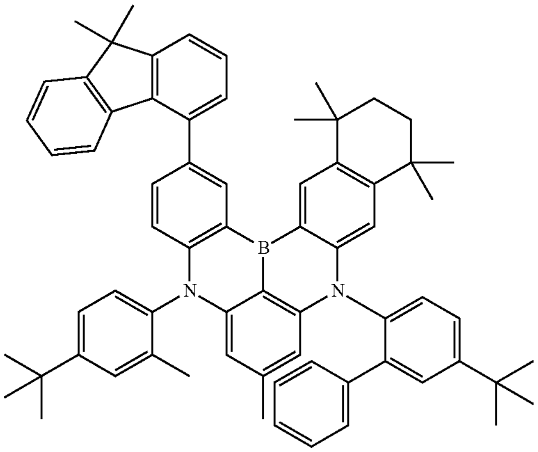
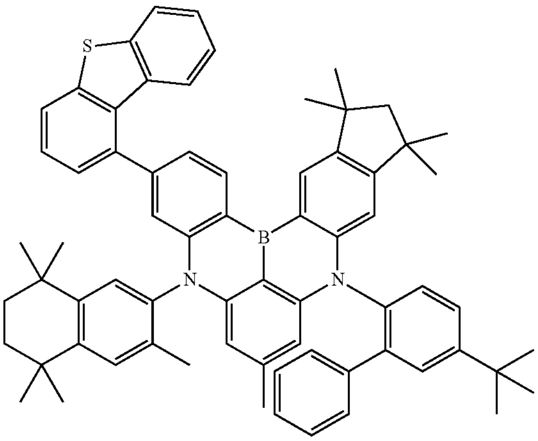

-continued
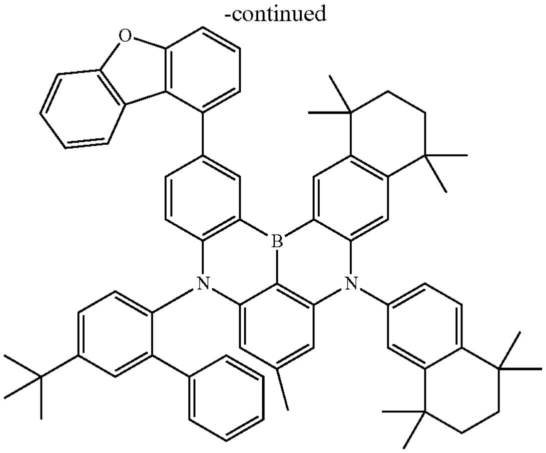
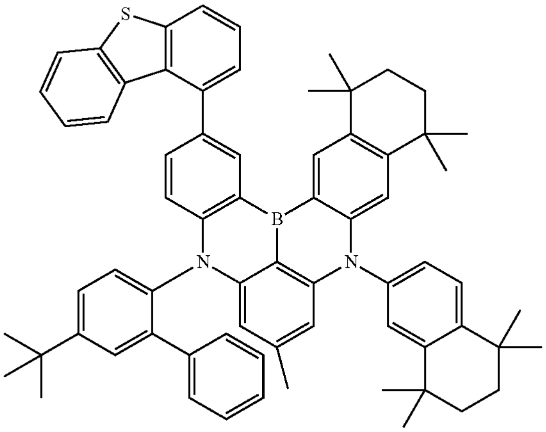
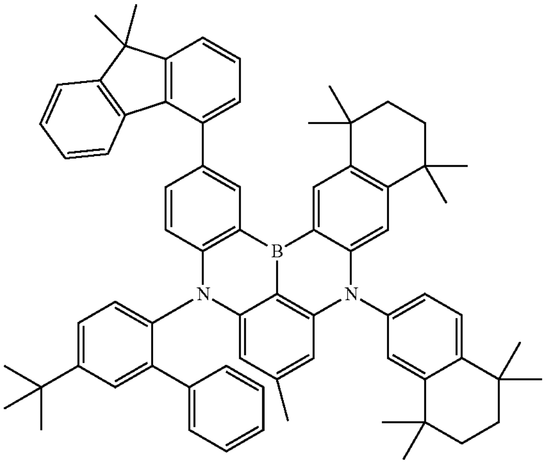
-continued
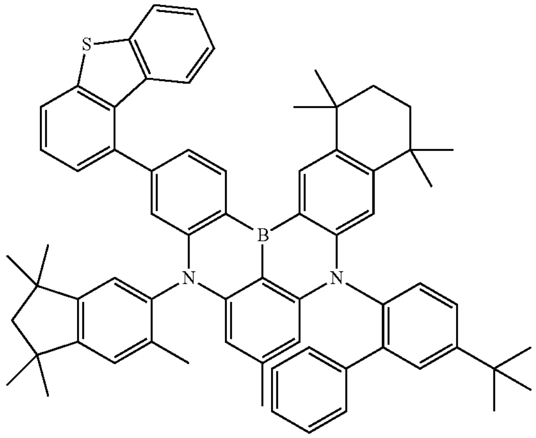
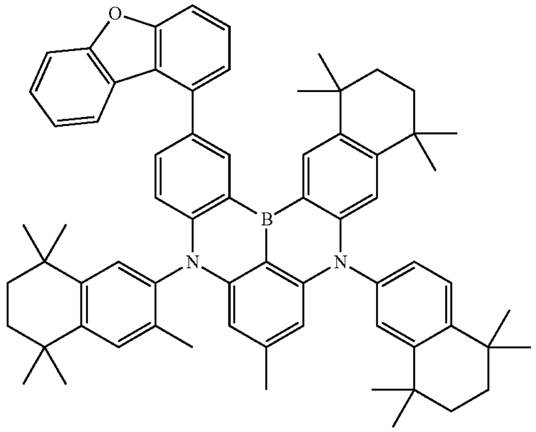
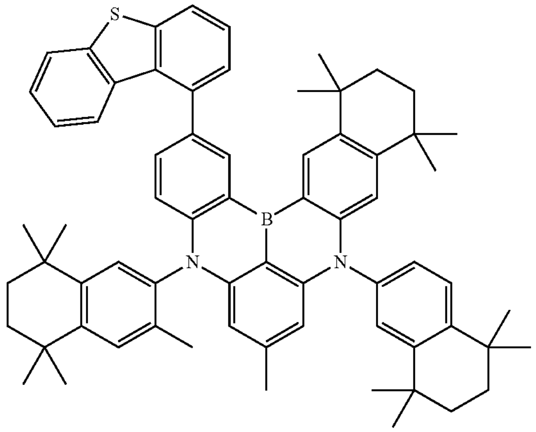

-continued
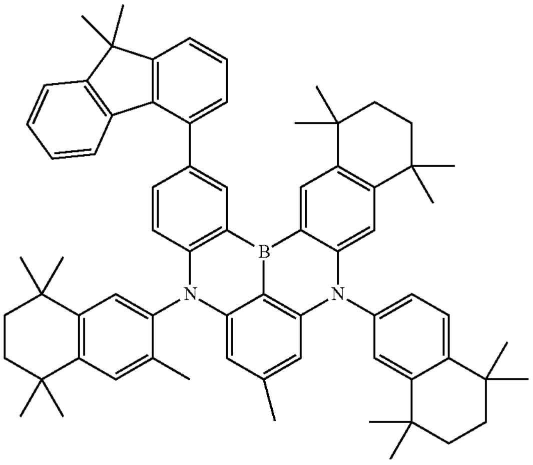
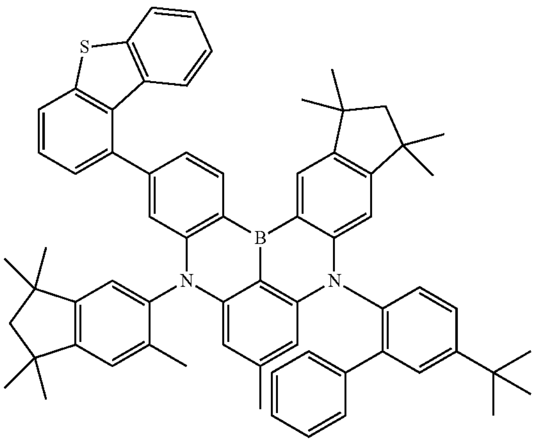
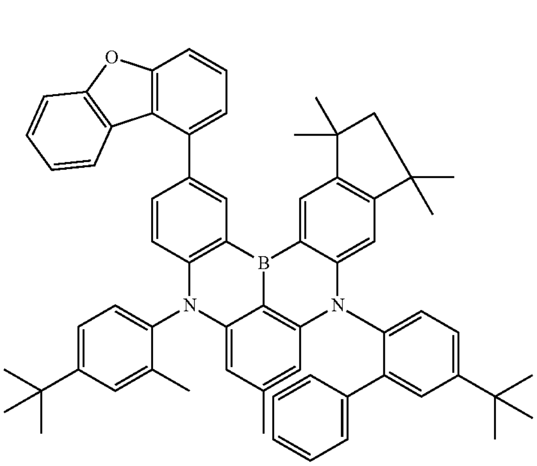
-continued
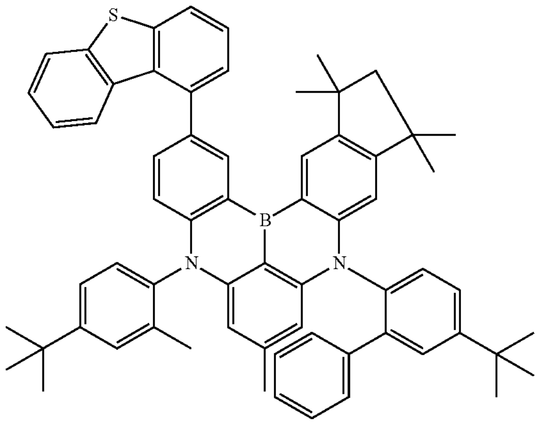
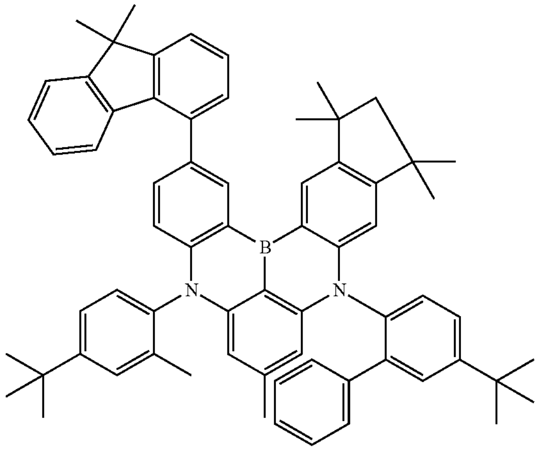
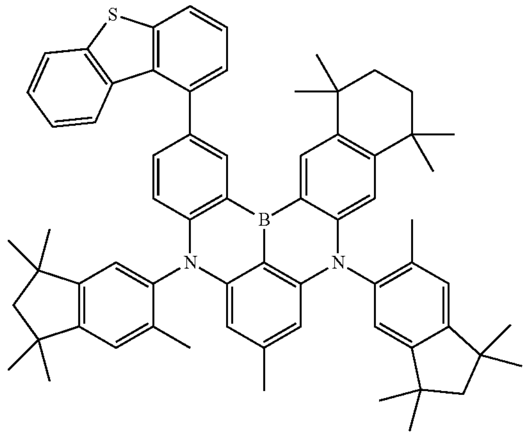

-continued
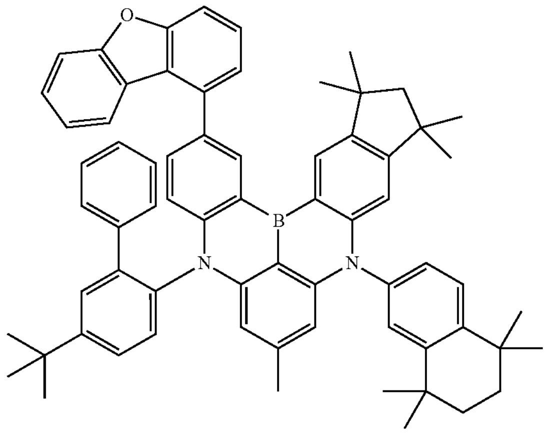
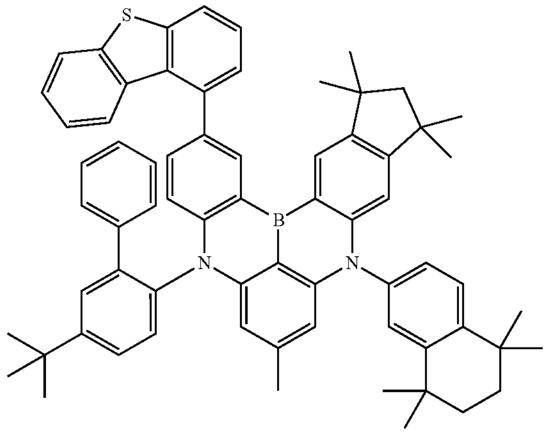
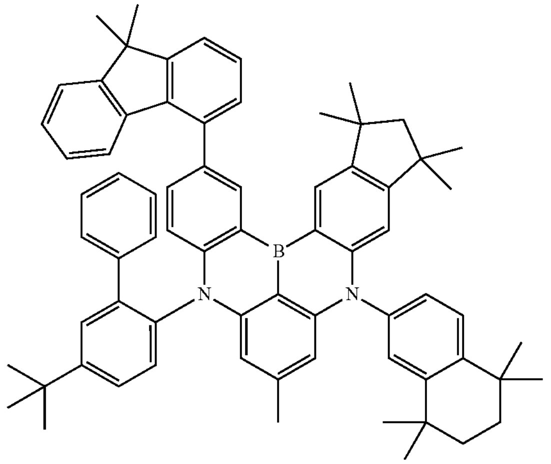
-continued
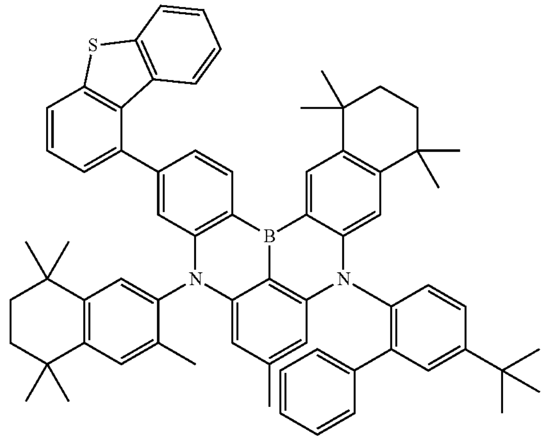
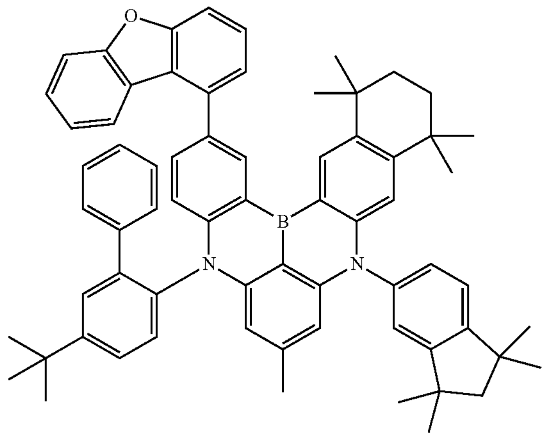
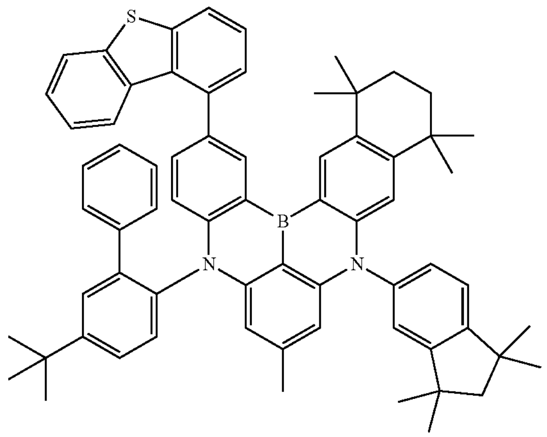

-continued
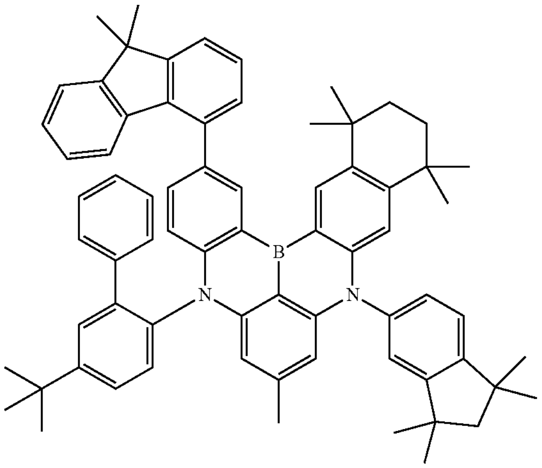
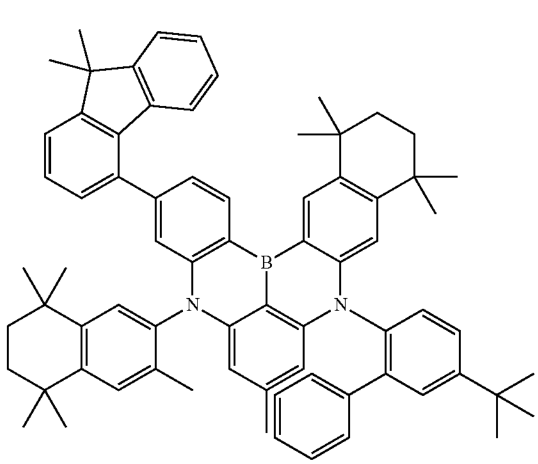
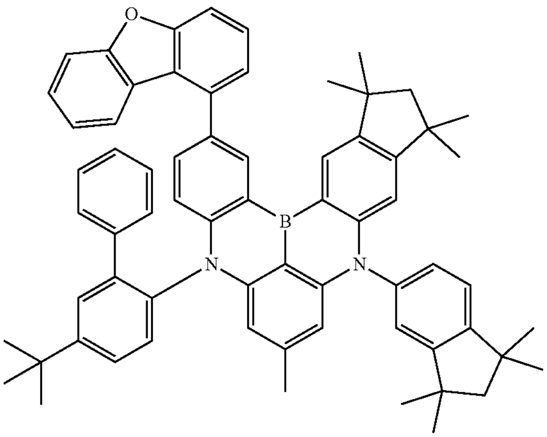
-continued
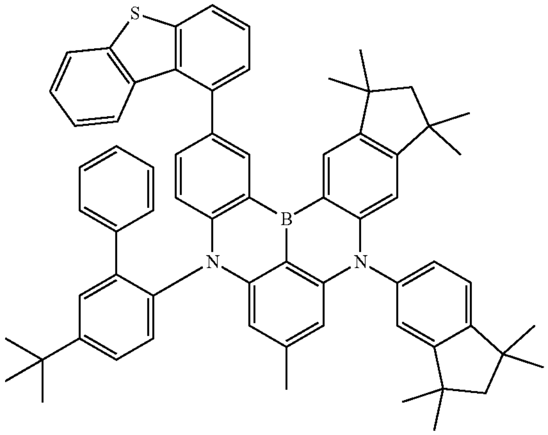
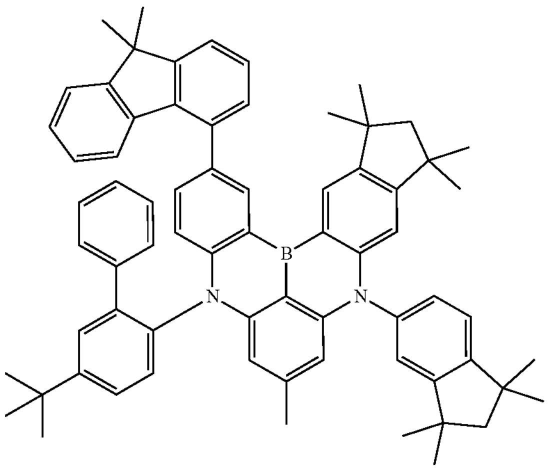
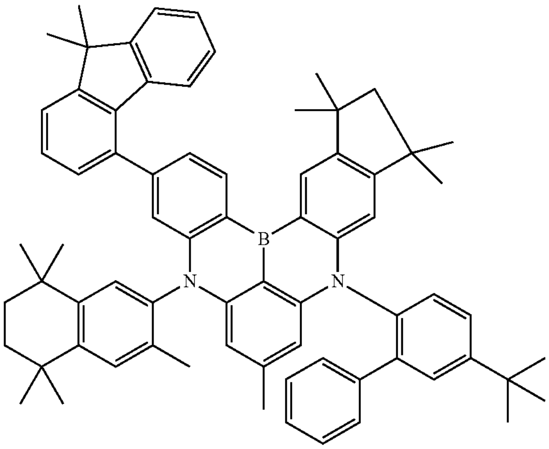

-continued
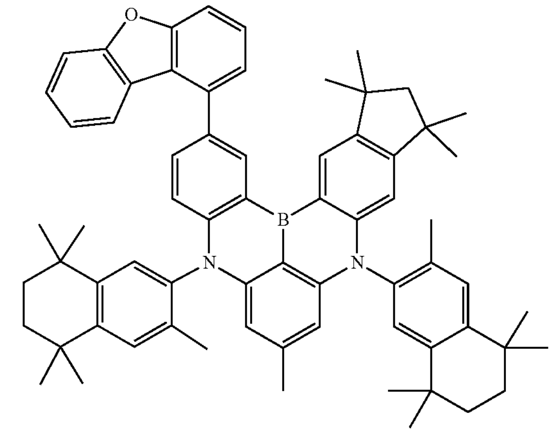
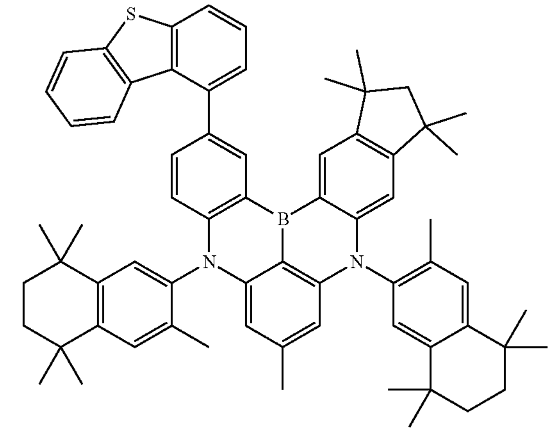
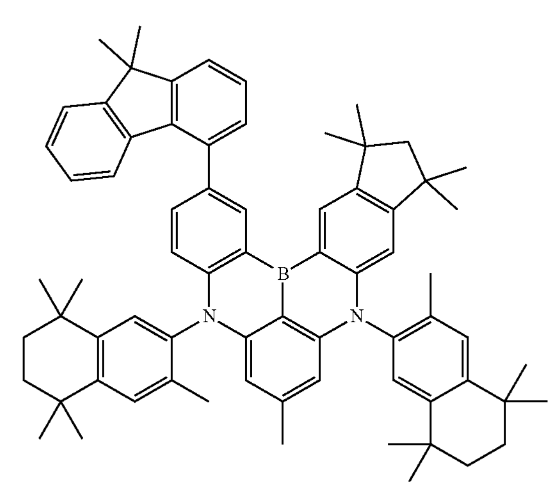
-continued
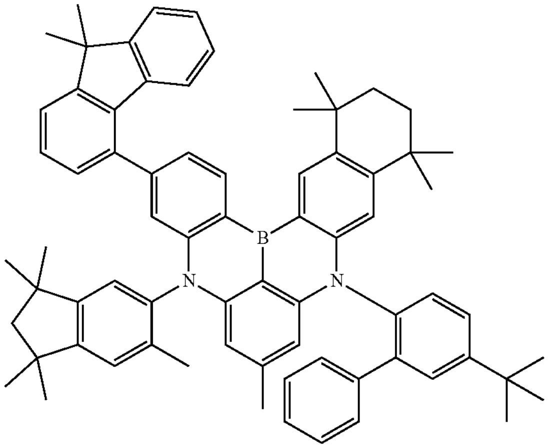
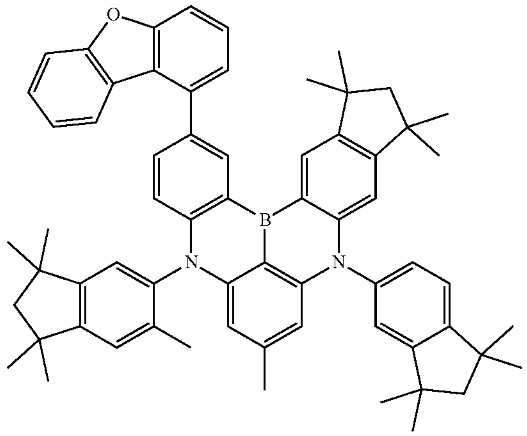
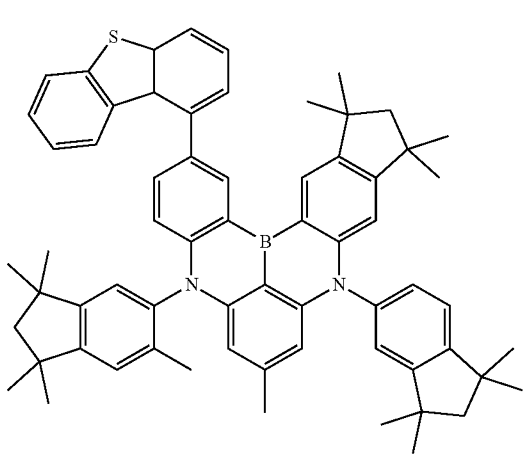

-continued
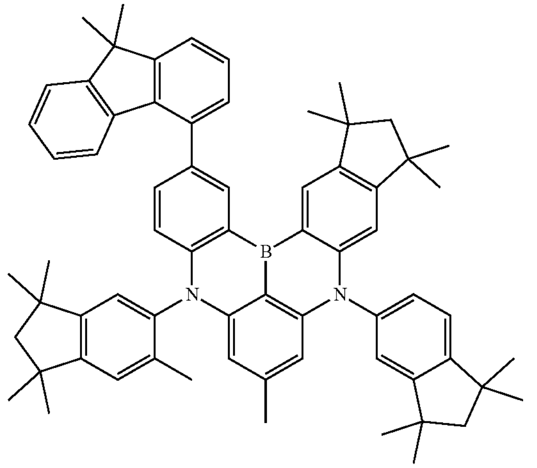
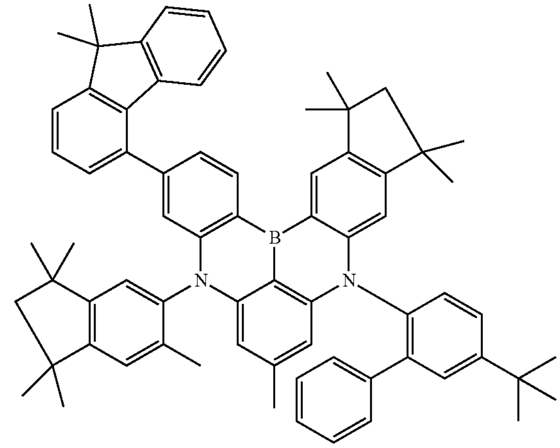
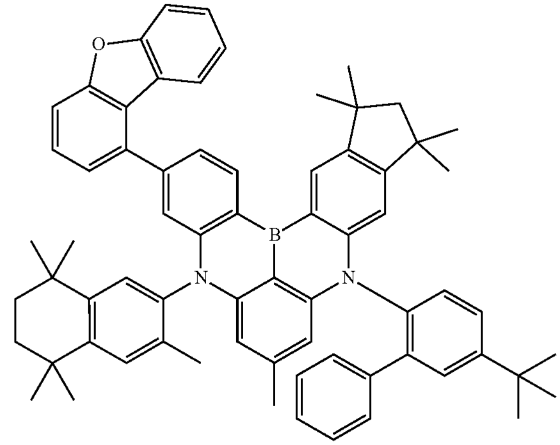
-continued
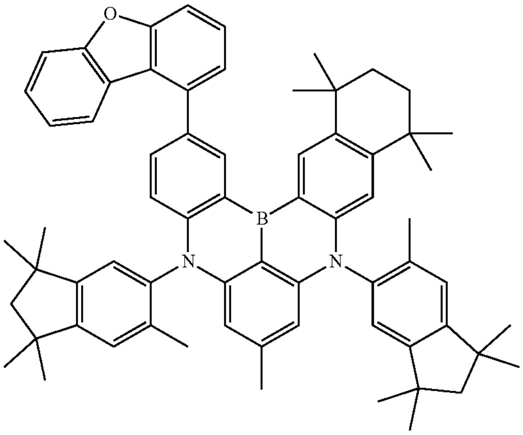
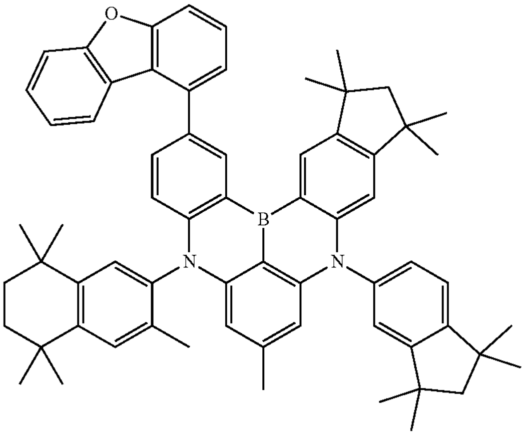
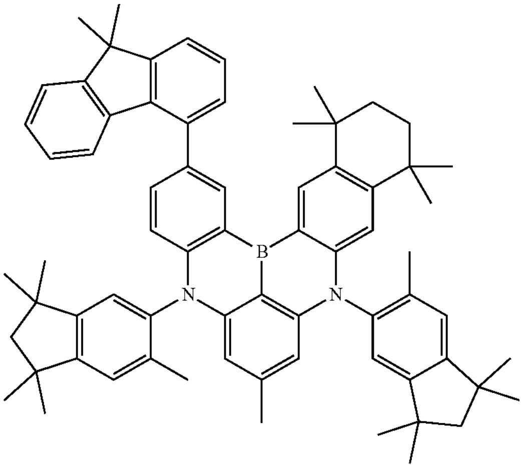

-continued
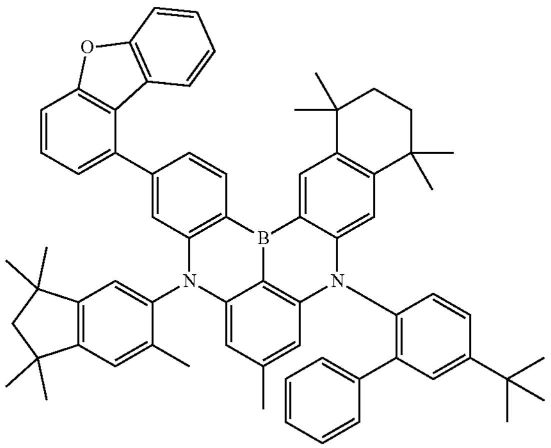
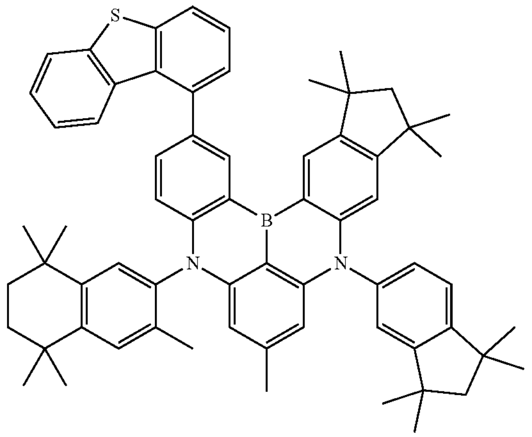
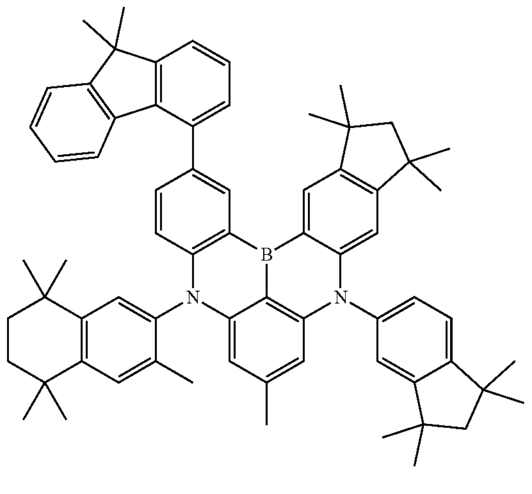
-continued
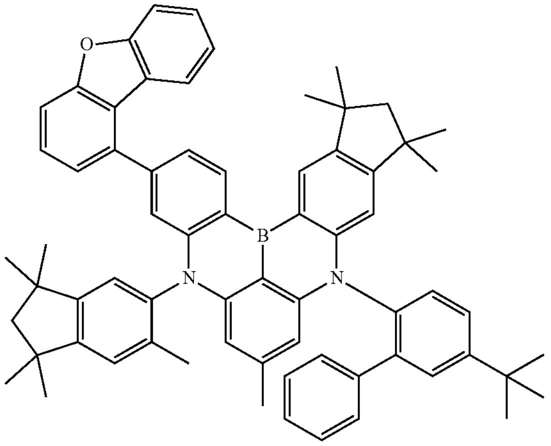
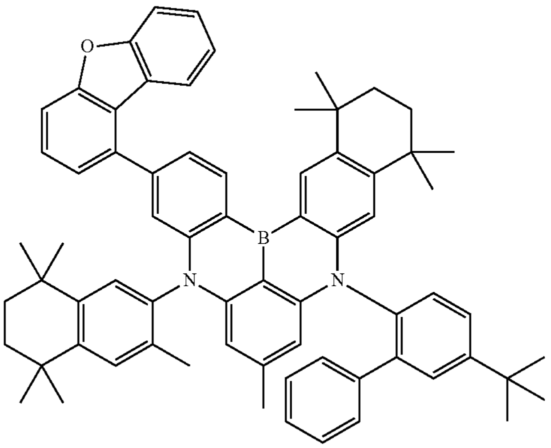
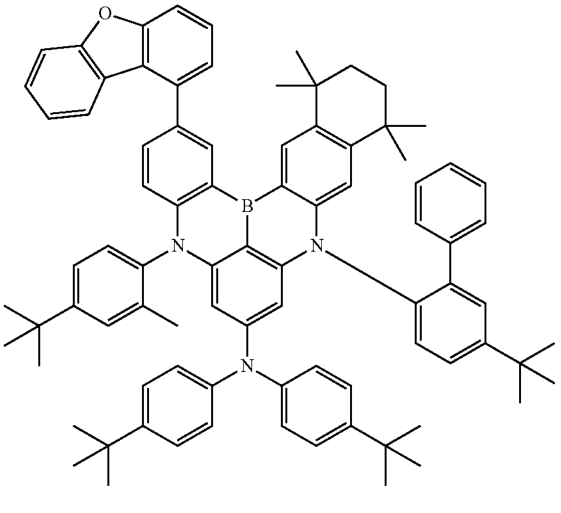

-continued
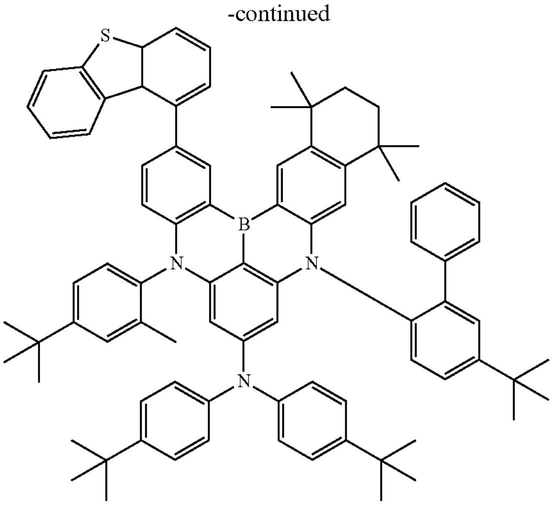
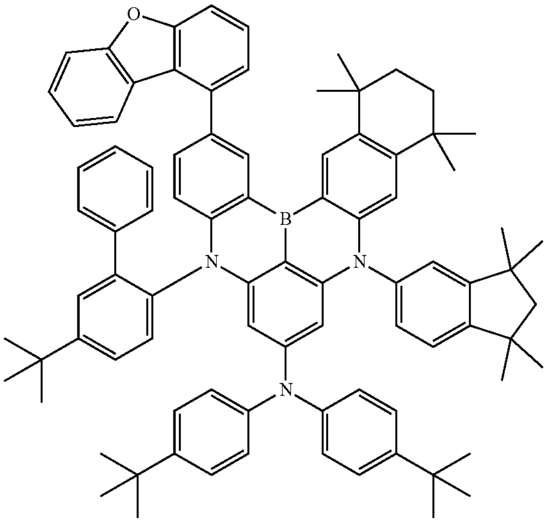
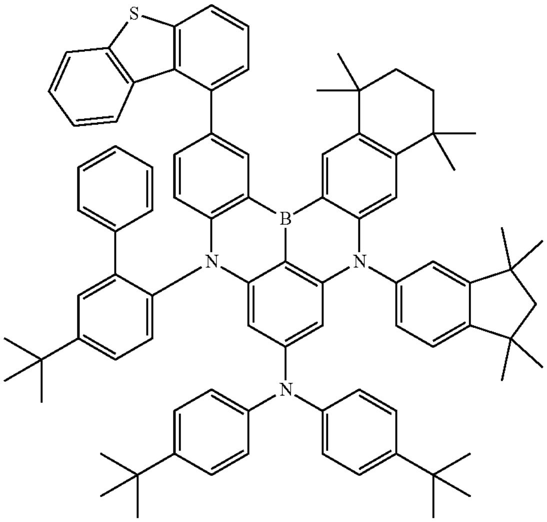
-continued
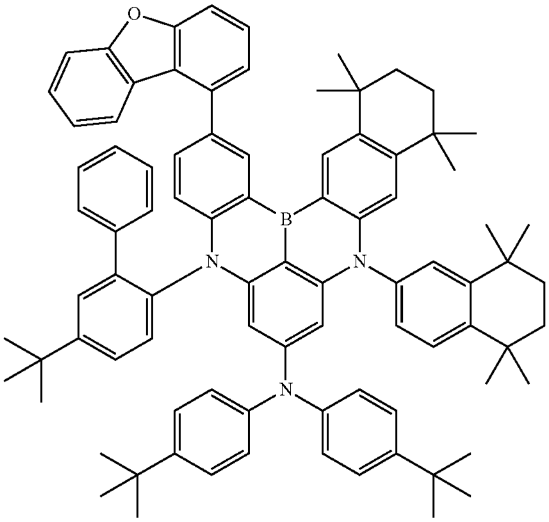
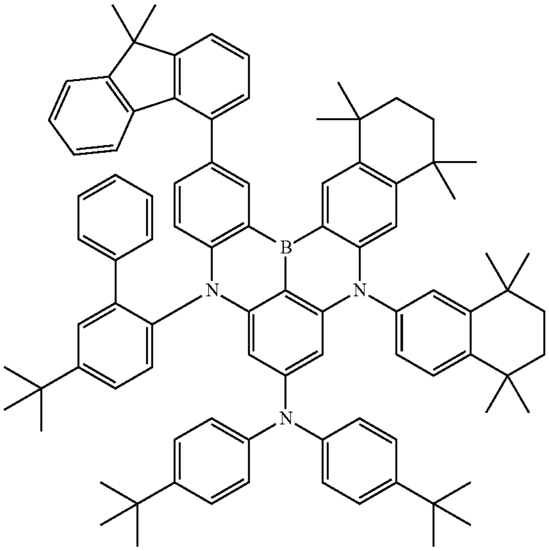
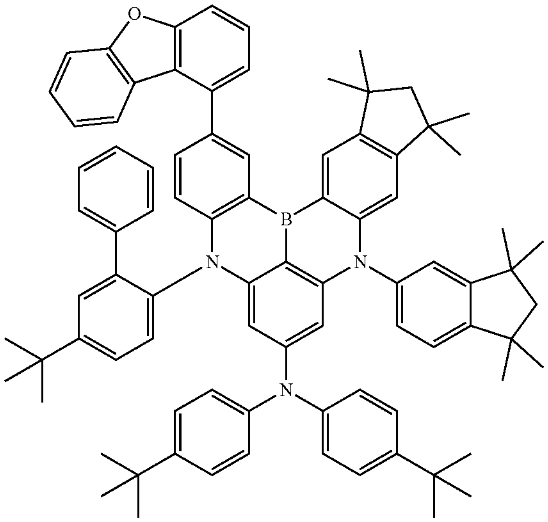

-continued
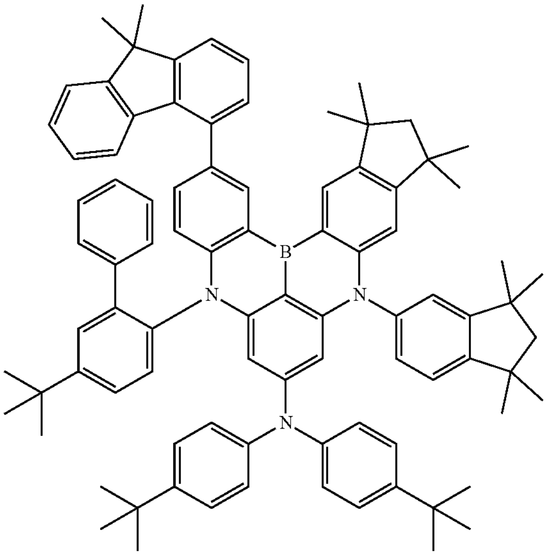
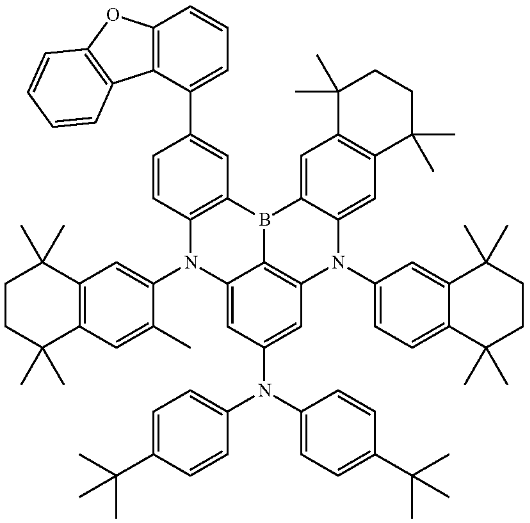
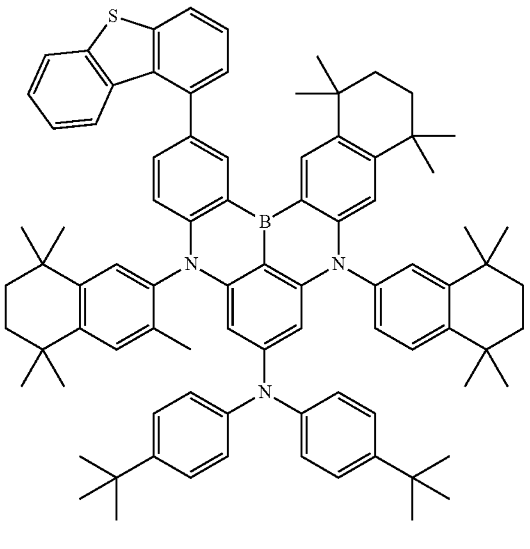
-continued
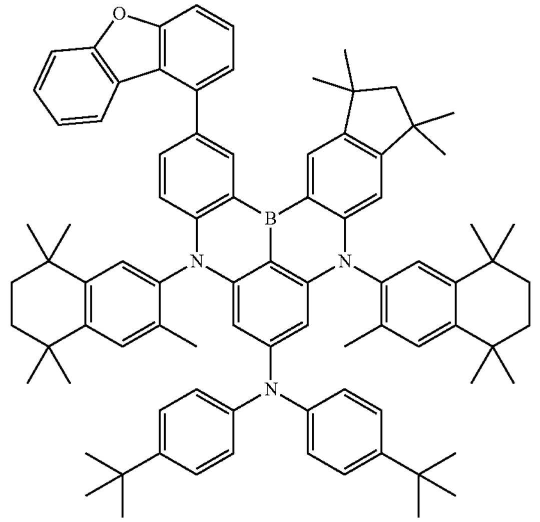
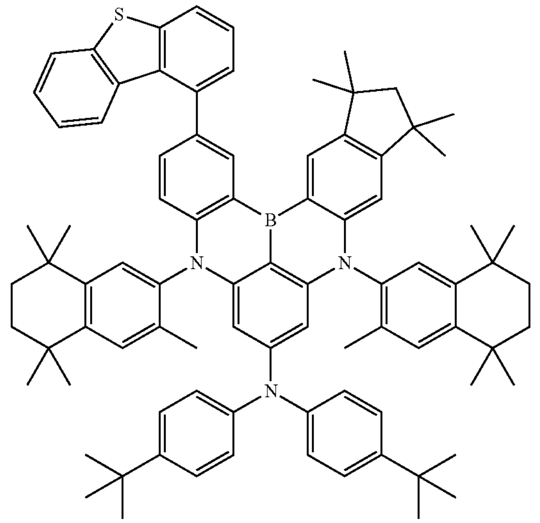
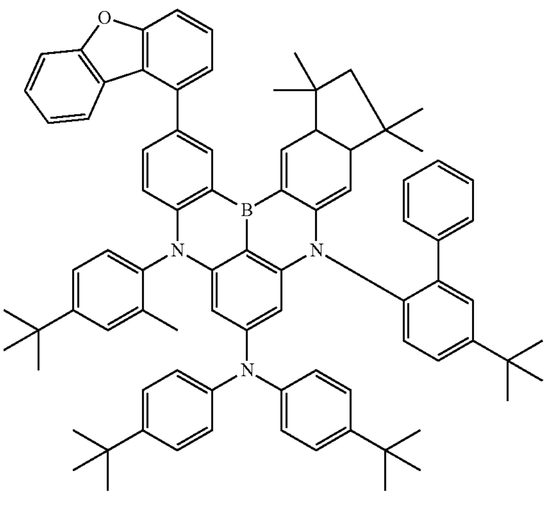

-continued
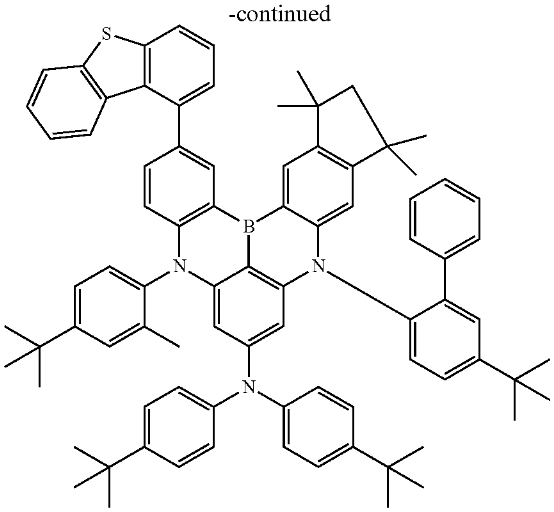
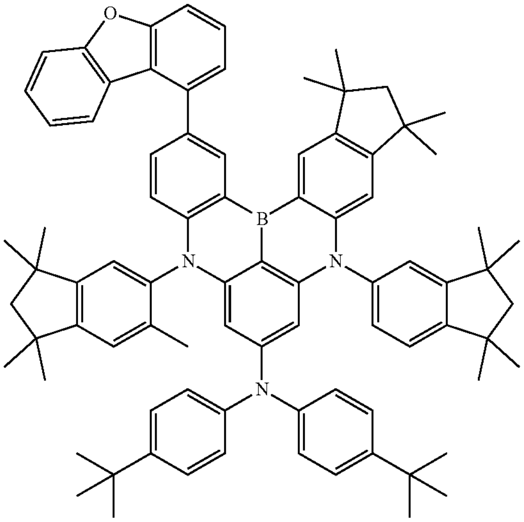
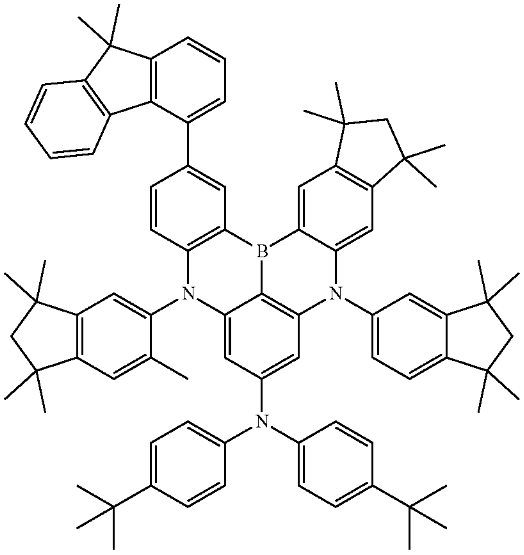
-continued
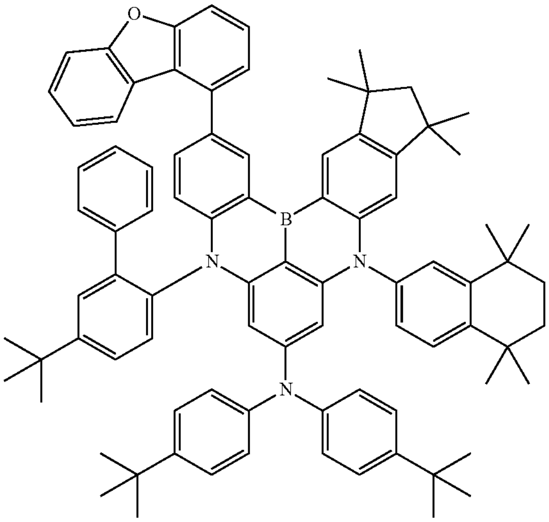
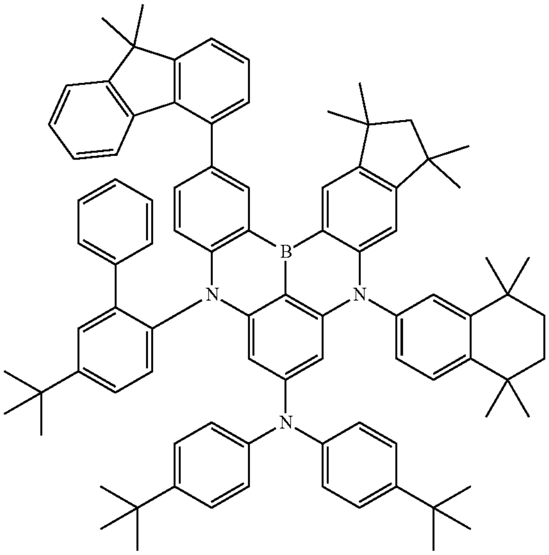 [SMILES: CC(C)(C)c1ccc(N(c2ccc(C(C)(C)C)cc2)c2cc3c4c(c2)N(c2ccc(C(C)(C)C)cc2-c2ccccc2)c2ccc(-c5cccc6c5-c5ccccc5C6(C)C)cc2B4c2cc4c(cc2N3c2ccc3c(c2)C(C)(C)CCC3(C)C)C(C)(C)CC4(C)C)cc1]
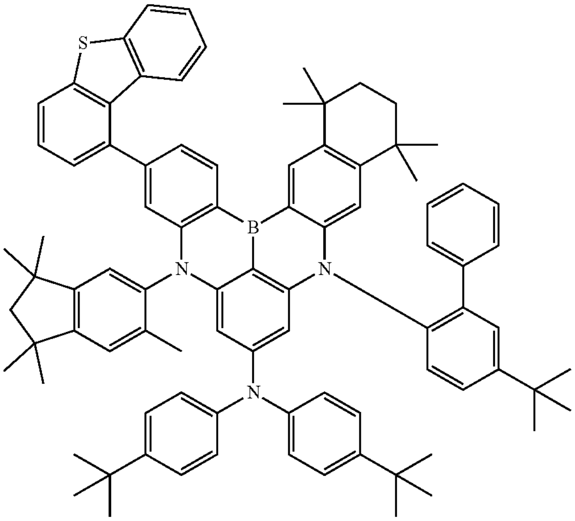

-continued
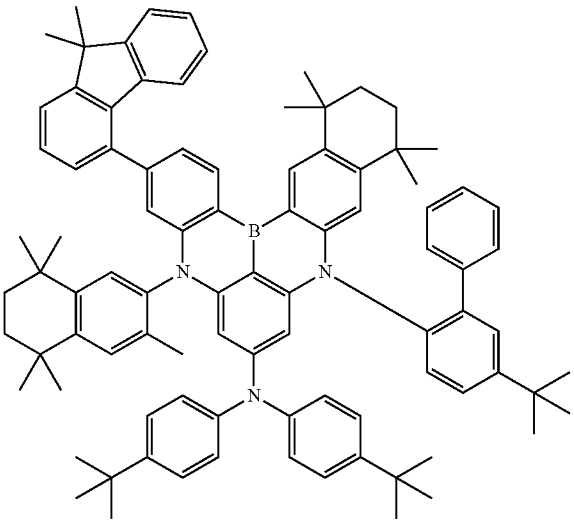
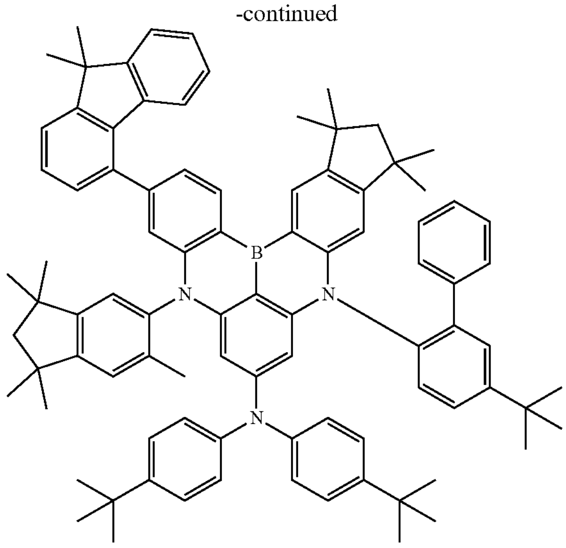
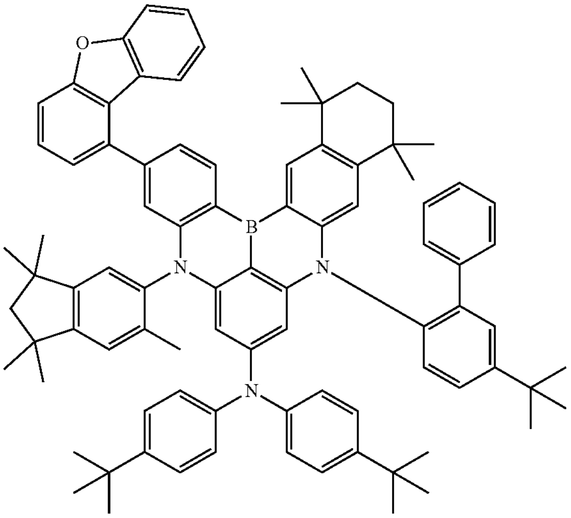
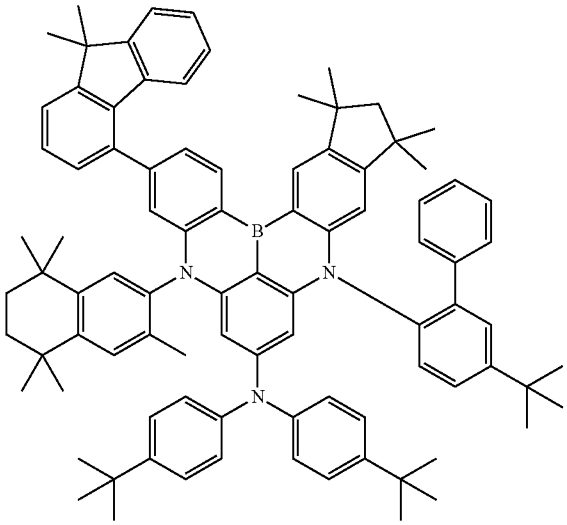
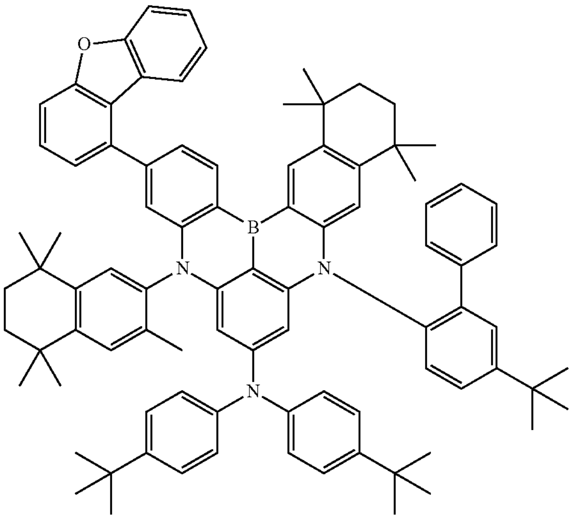
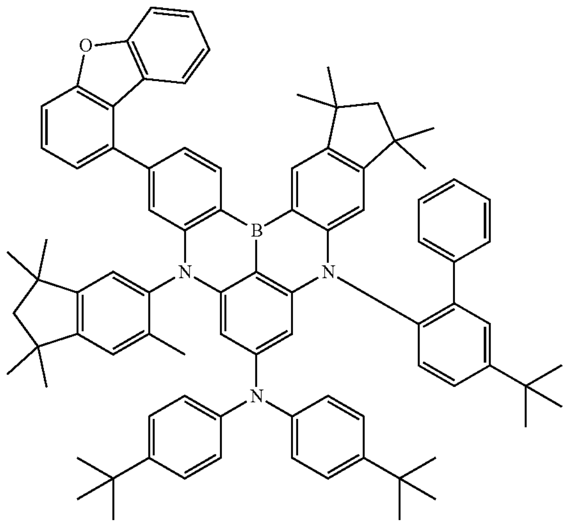
-continued -continued
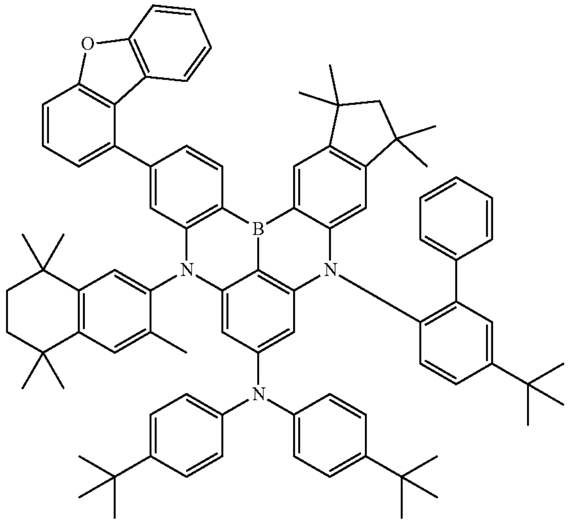
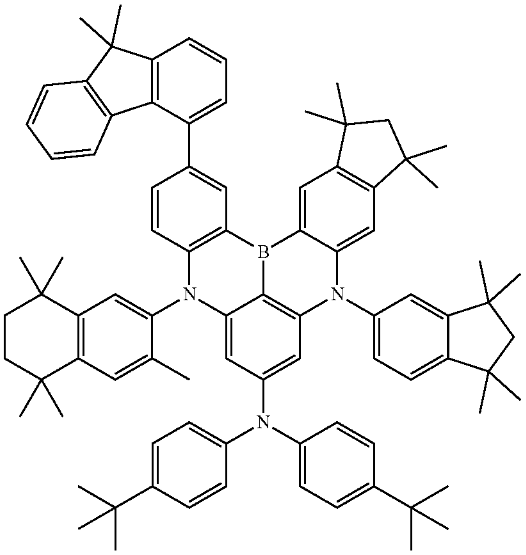
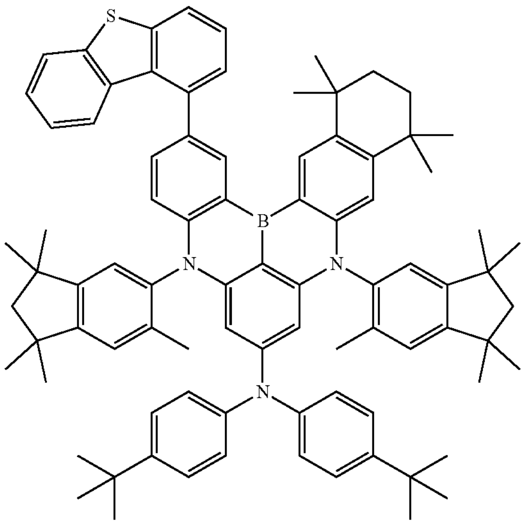
-continued
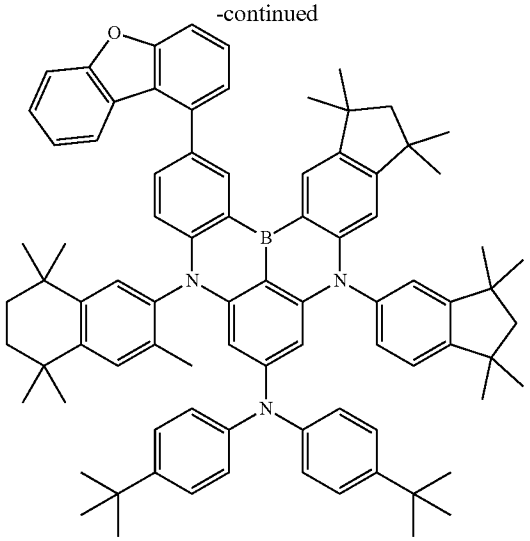
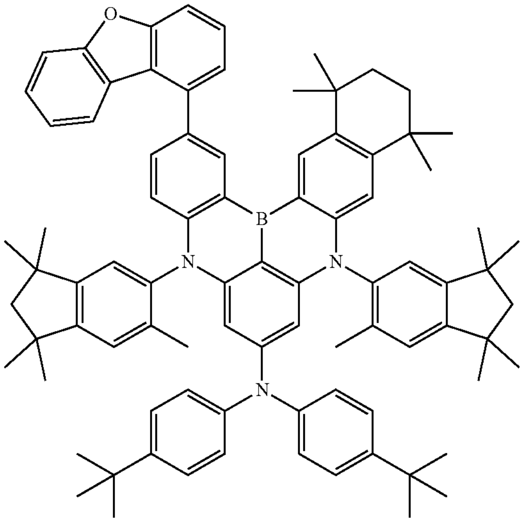
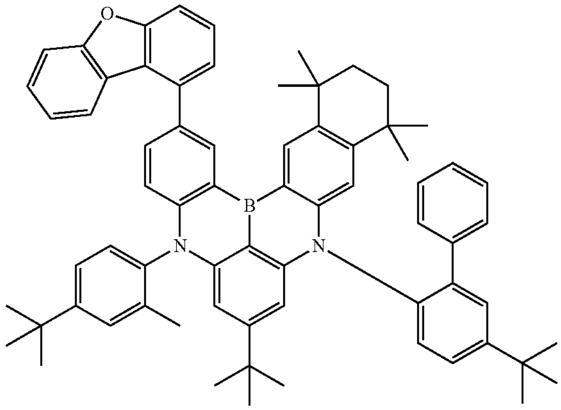

-continued
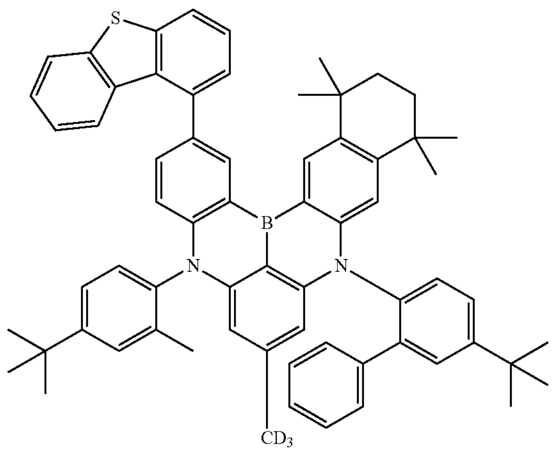
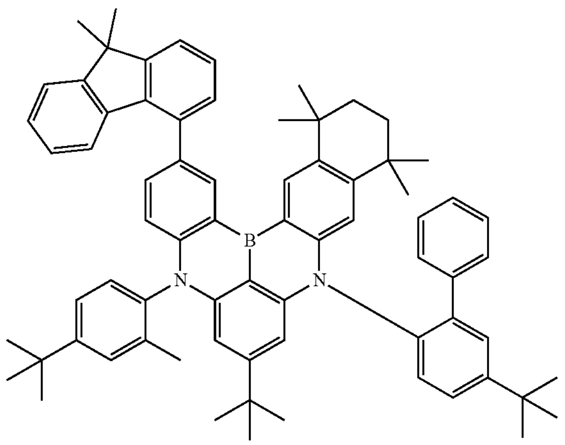
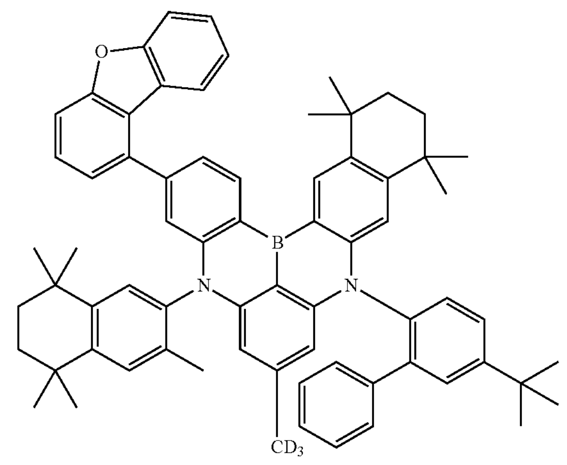
-continued
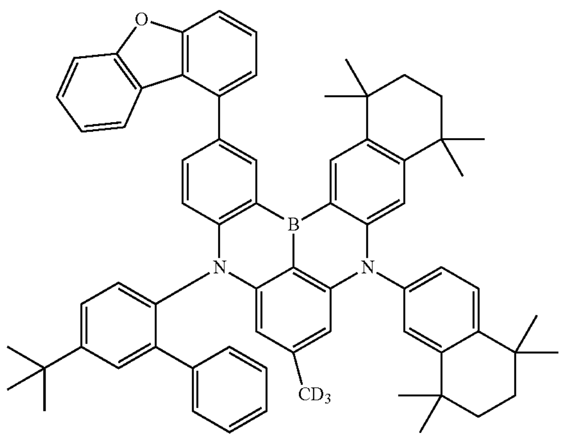
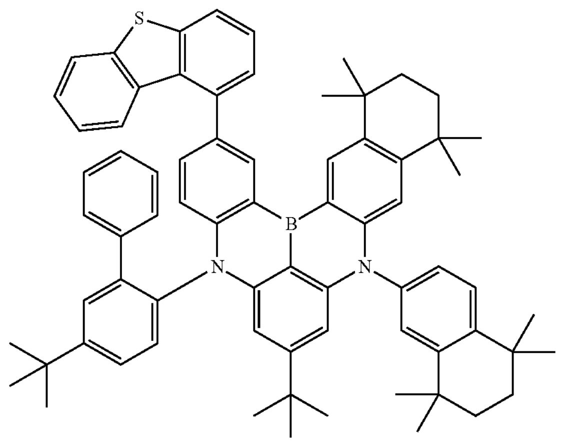
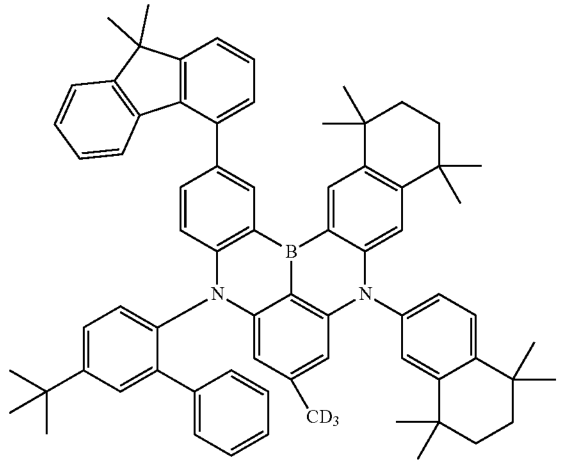

-continued
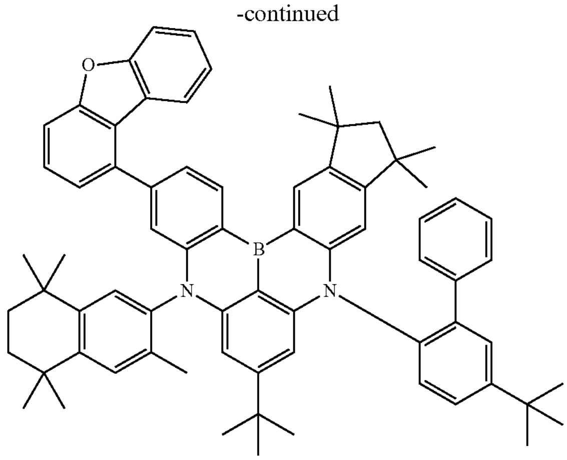
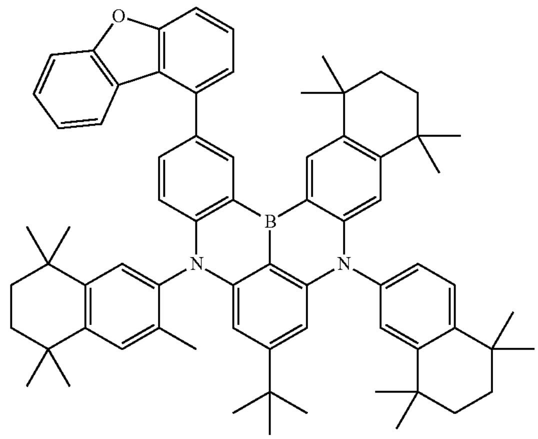
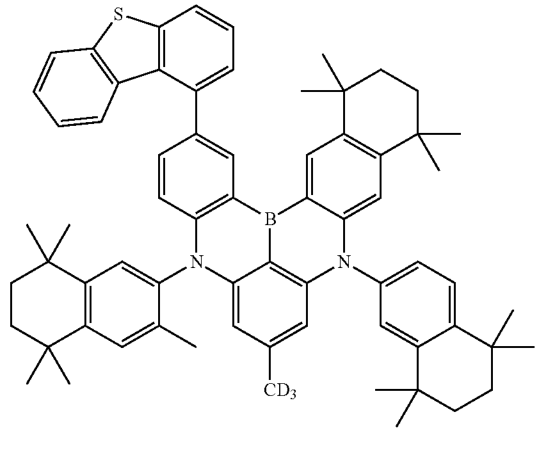
-continued
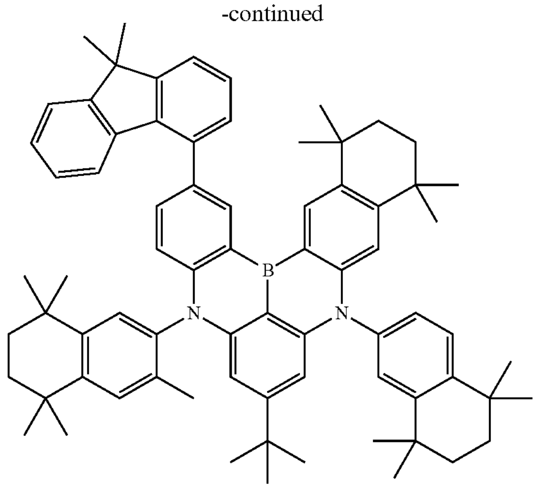
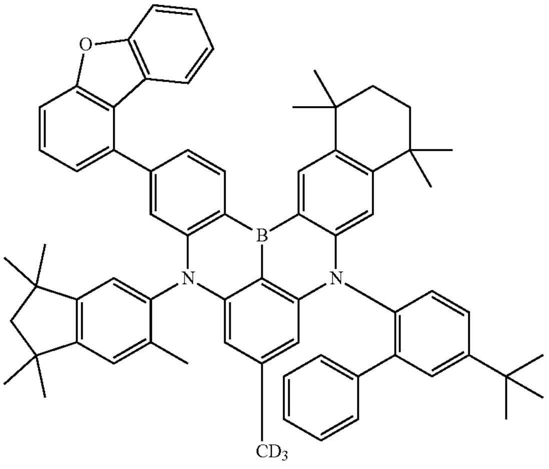
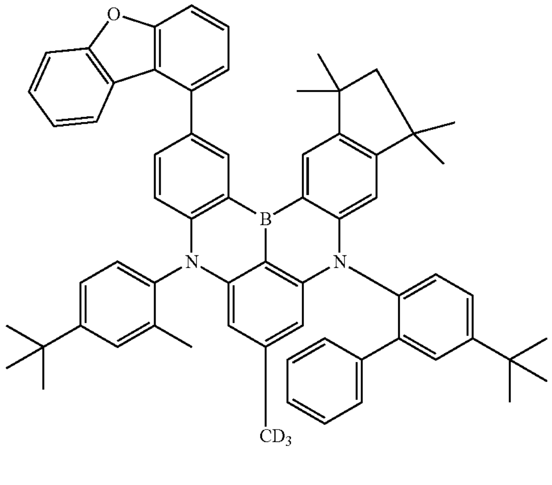

-continued
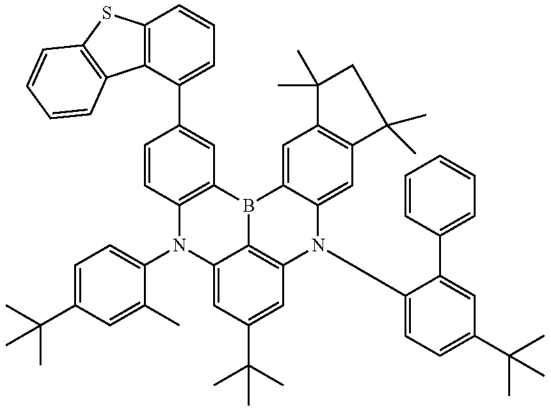
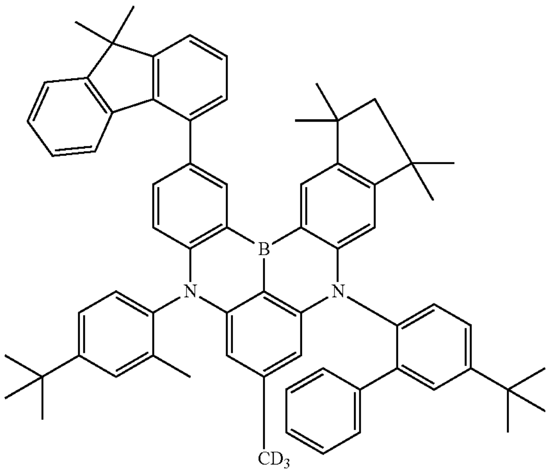
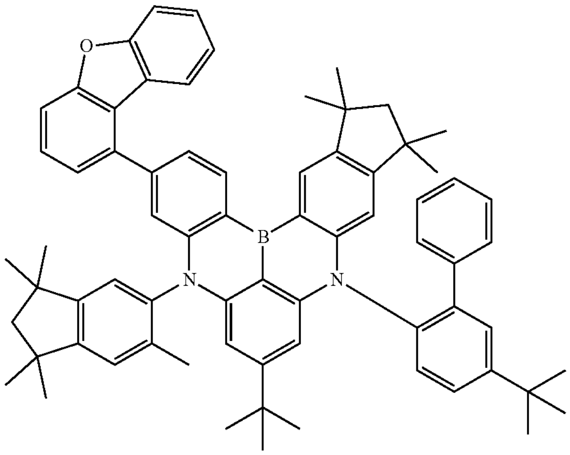
-continued
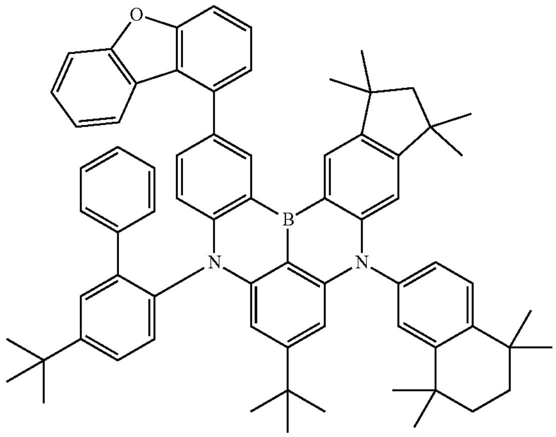
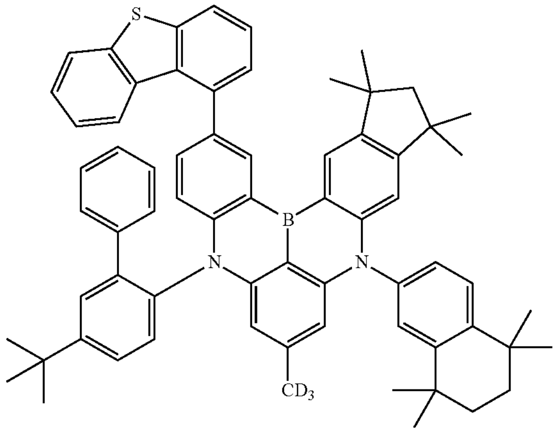
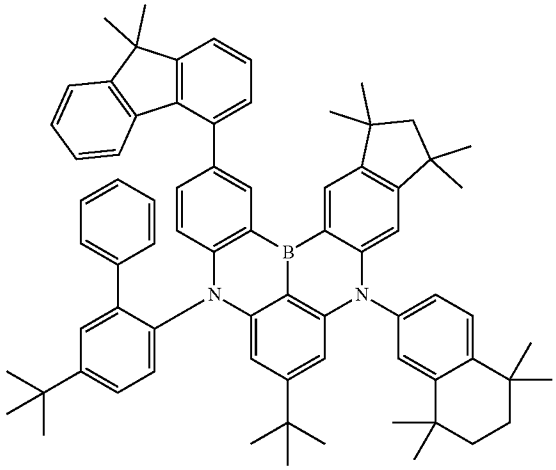

-continued
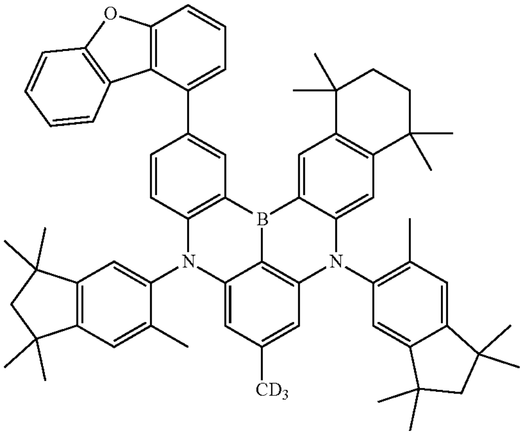
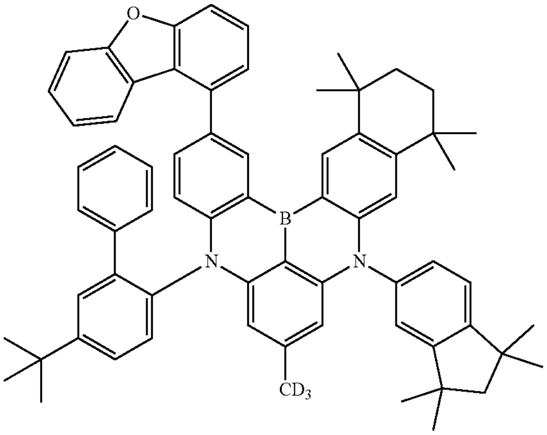
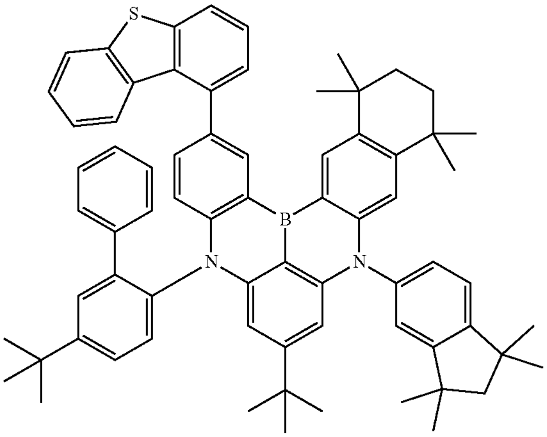
-continued
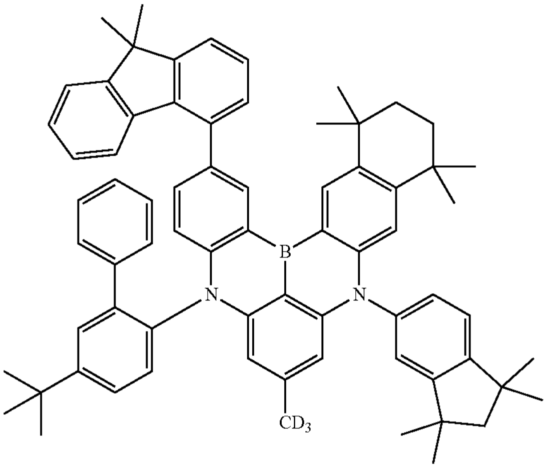
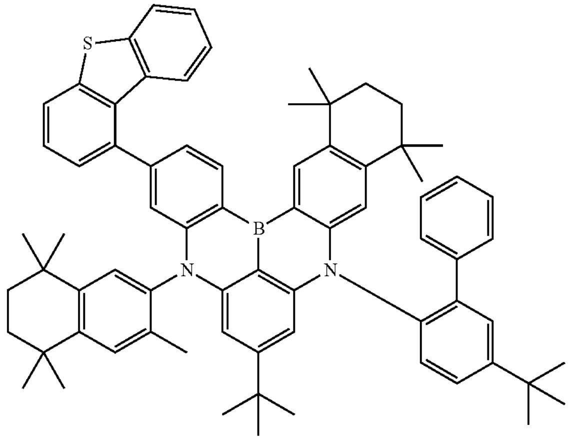
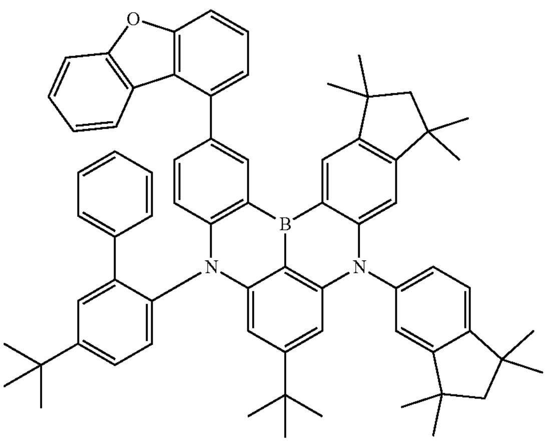

-continued
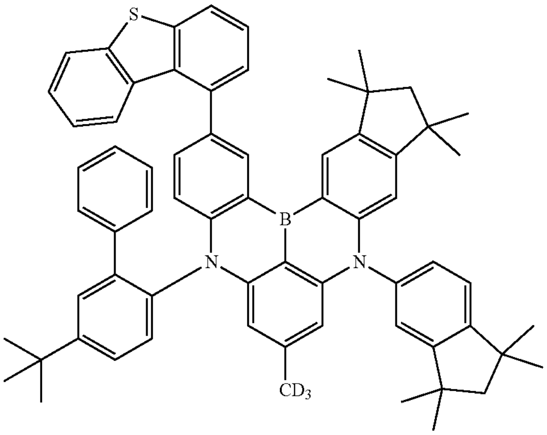
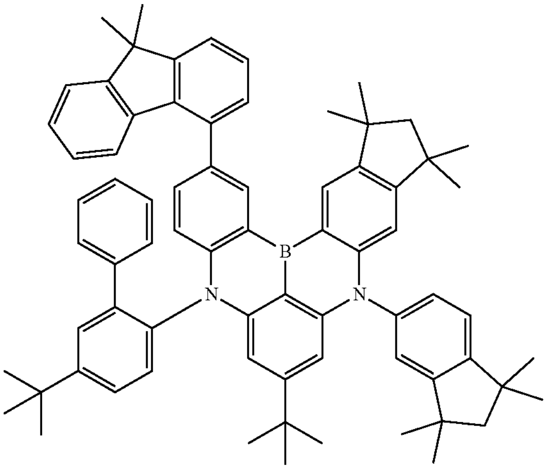
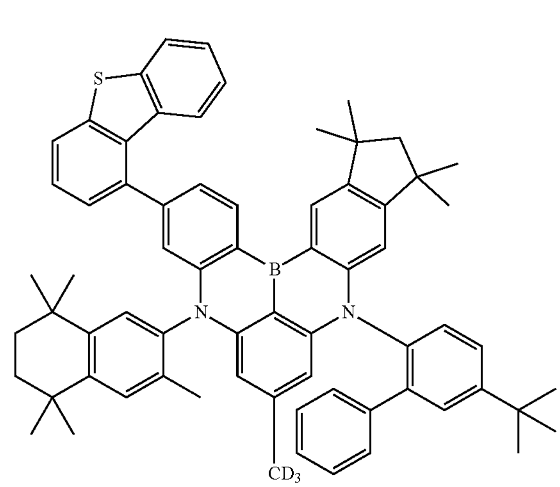
-continued
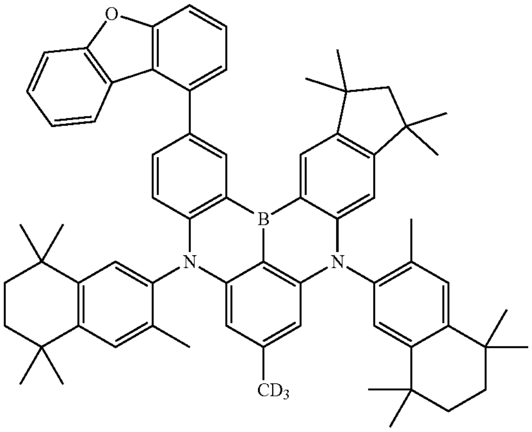
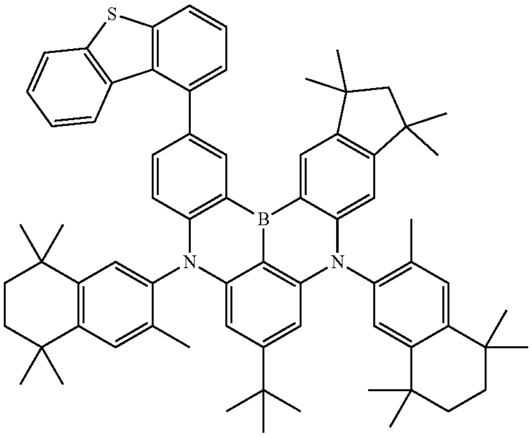
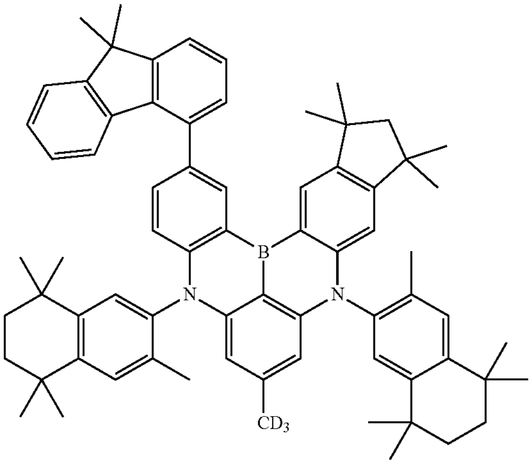

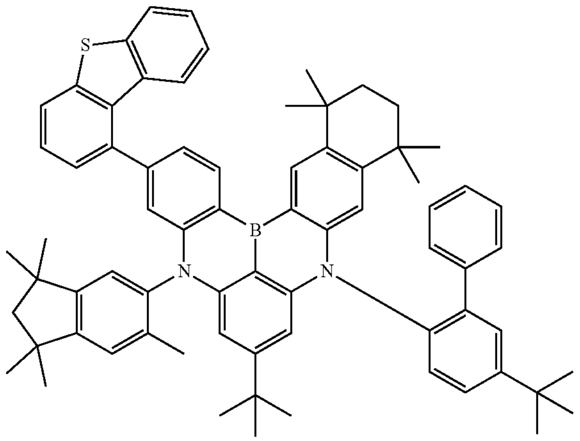
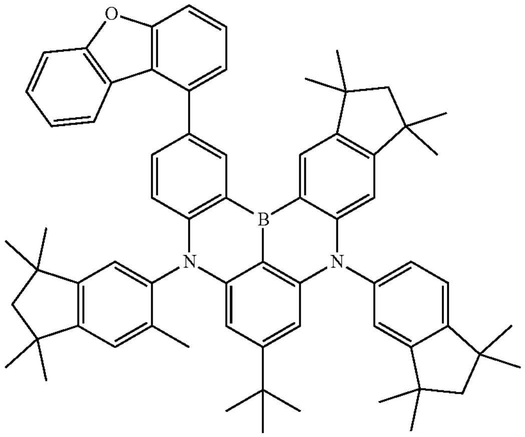
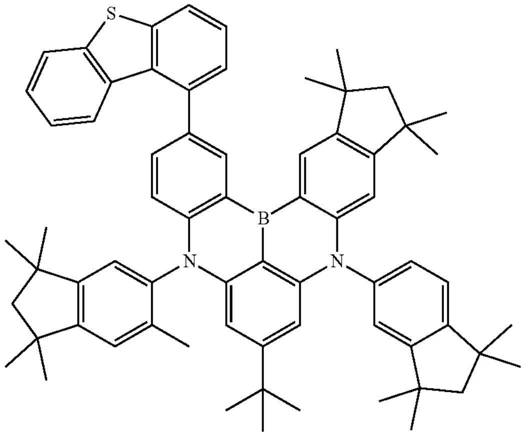
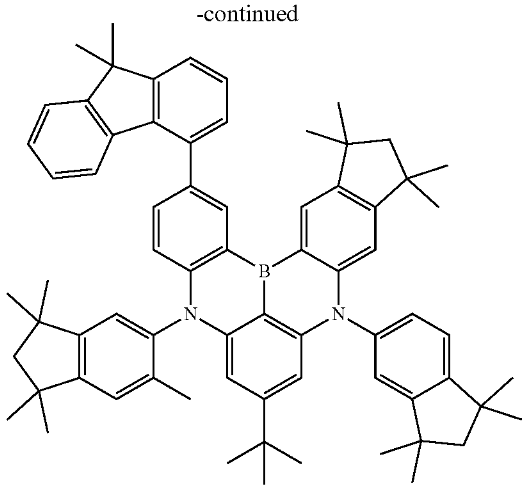
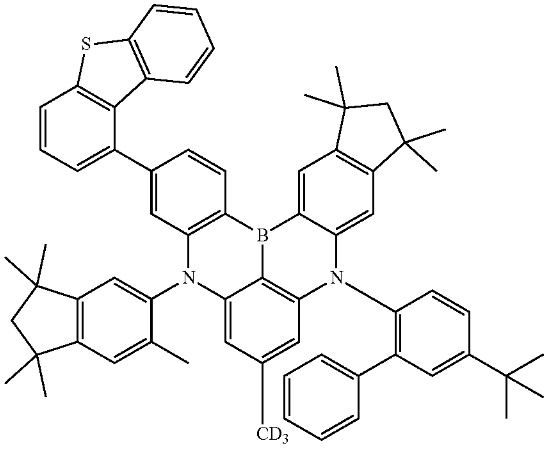
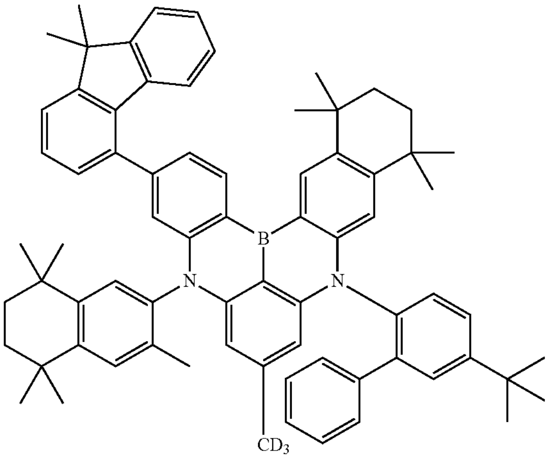

-continued
-continued
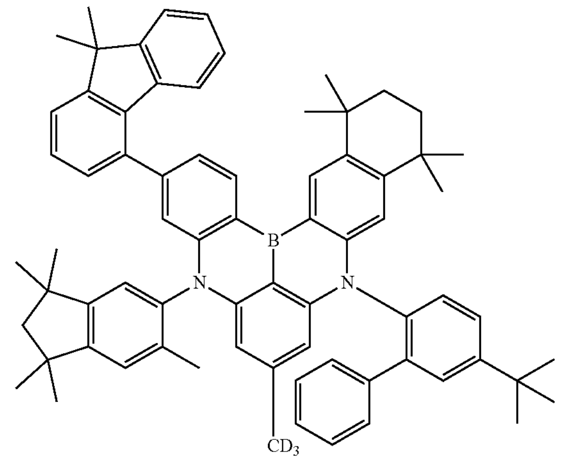
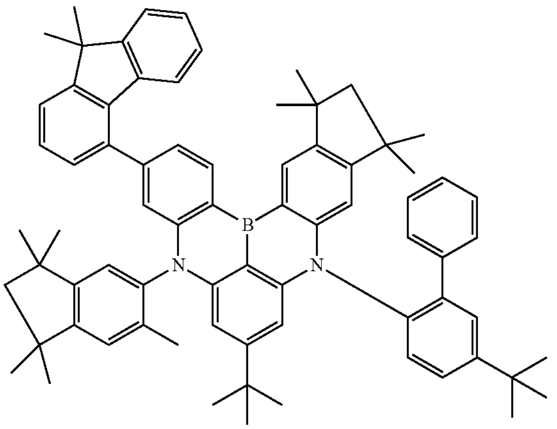
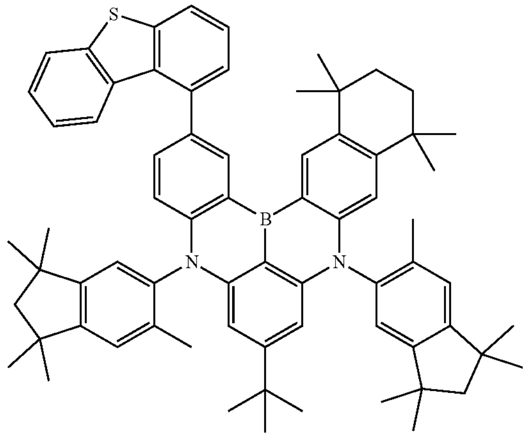
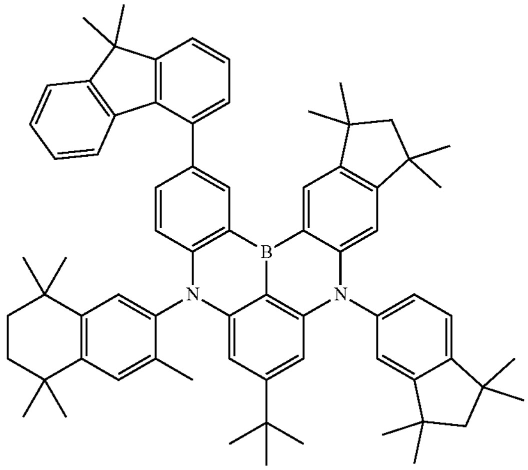
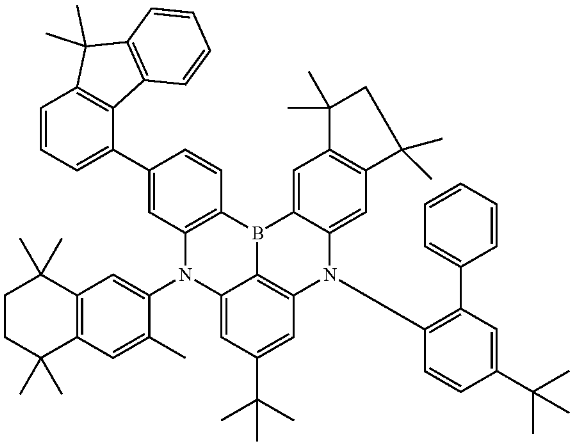
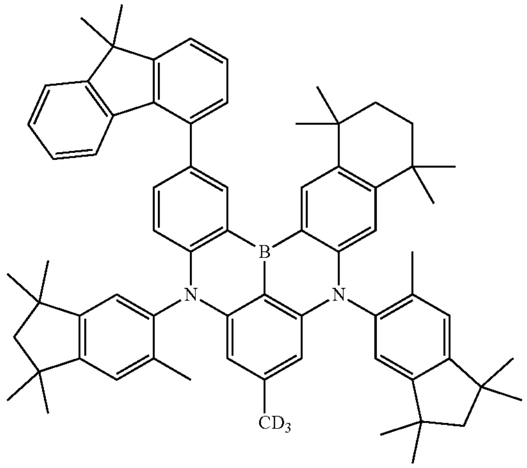

-continued
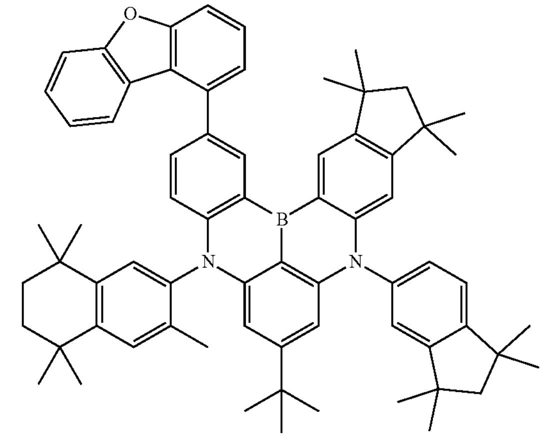
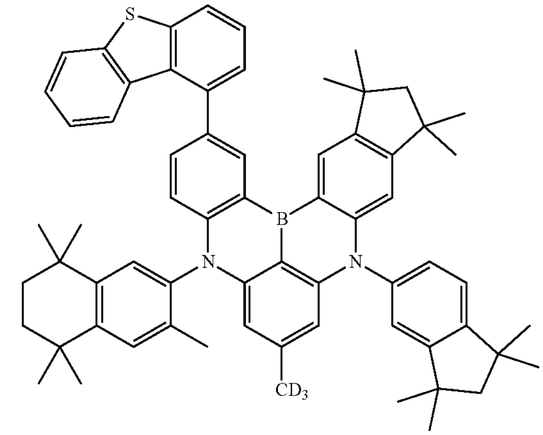
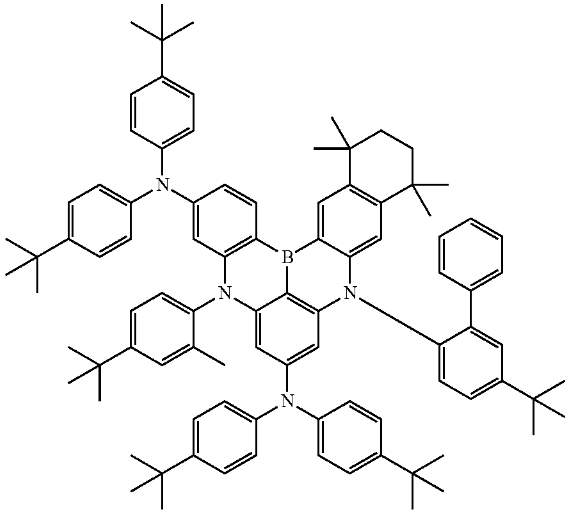
-continued
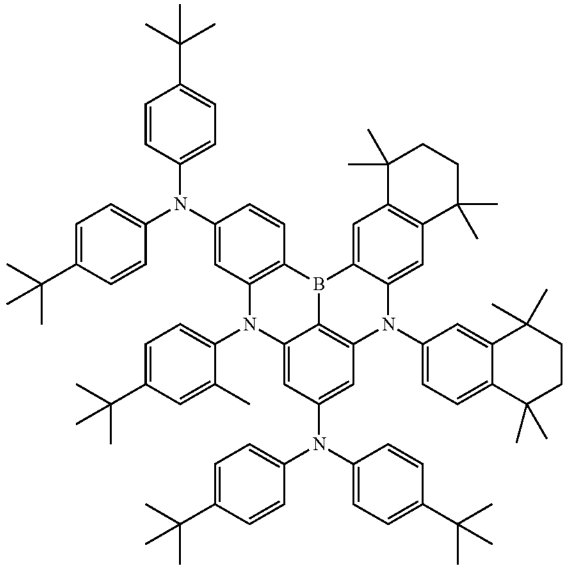
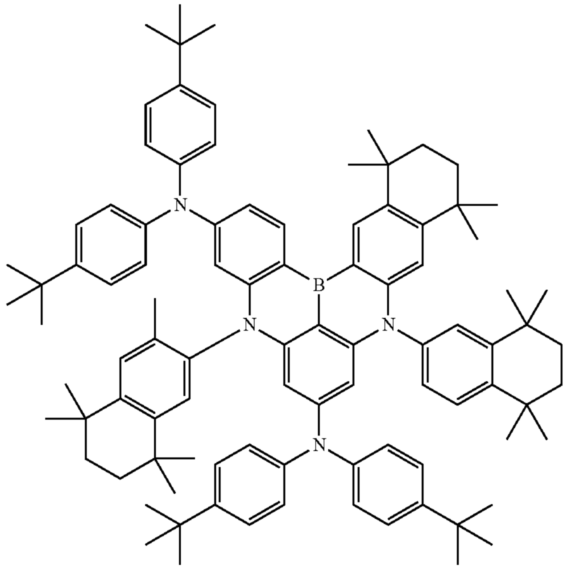
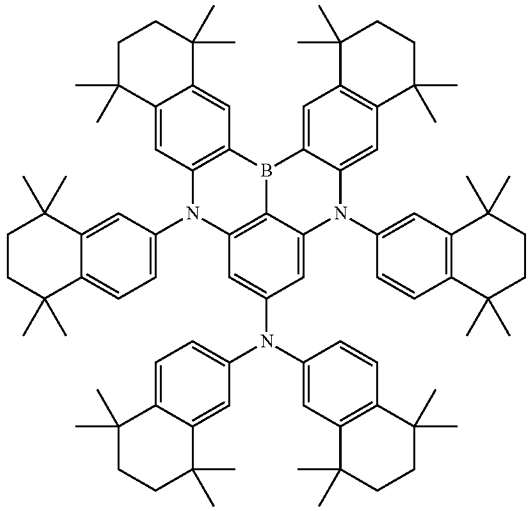

-continued
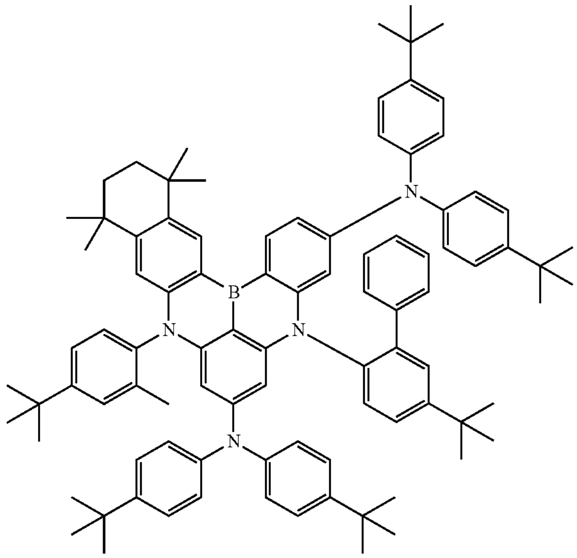
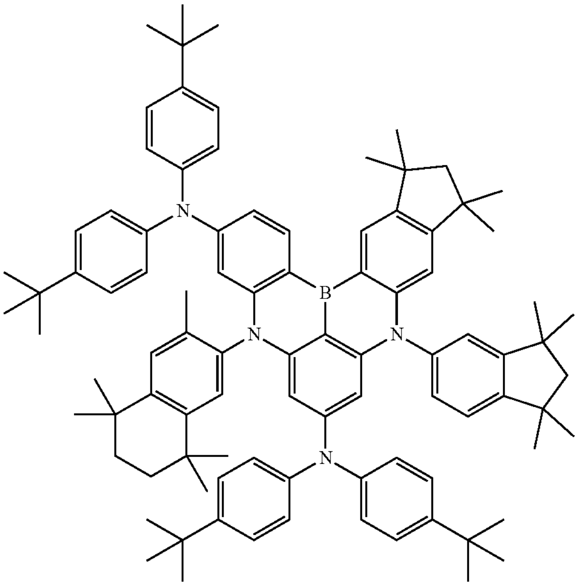
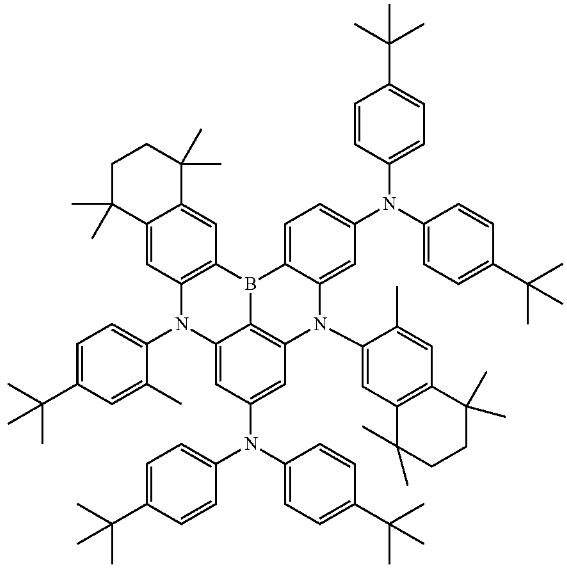
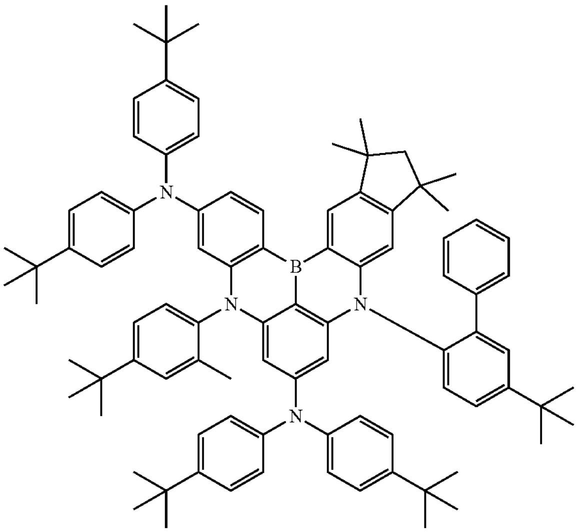
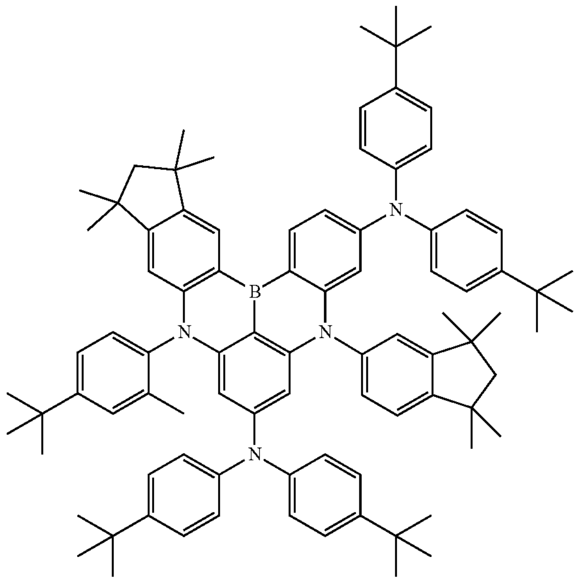
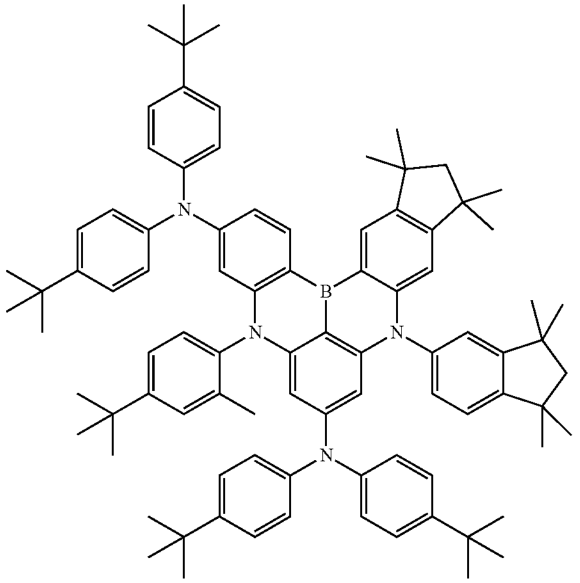

-continued
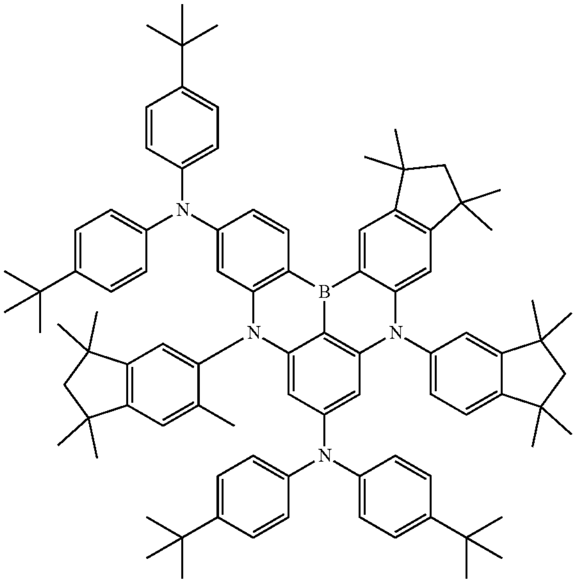
-continued
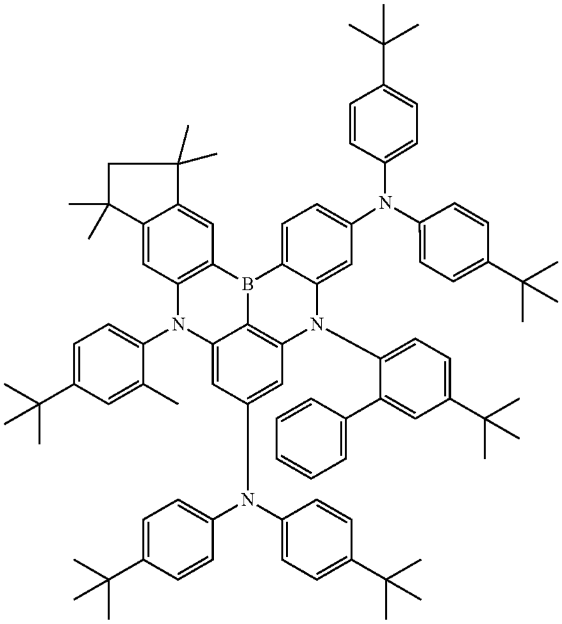
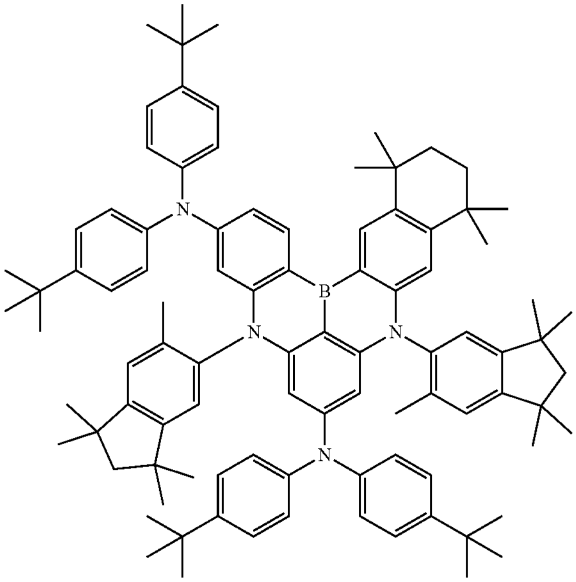
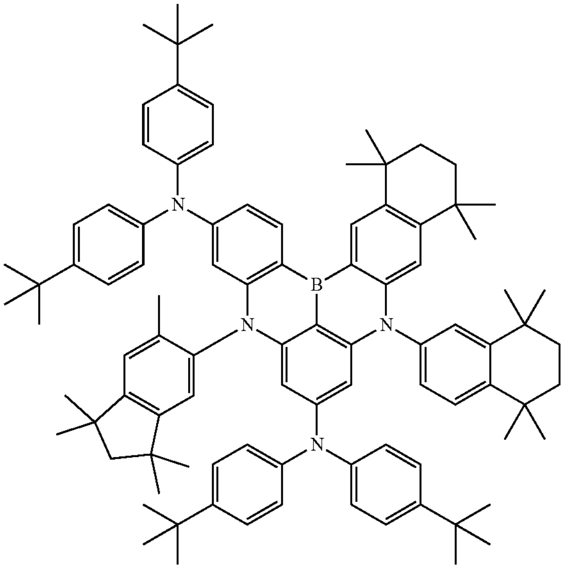

-continued
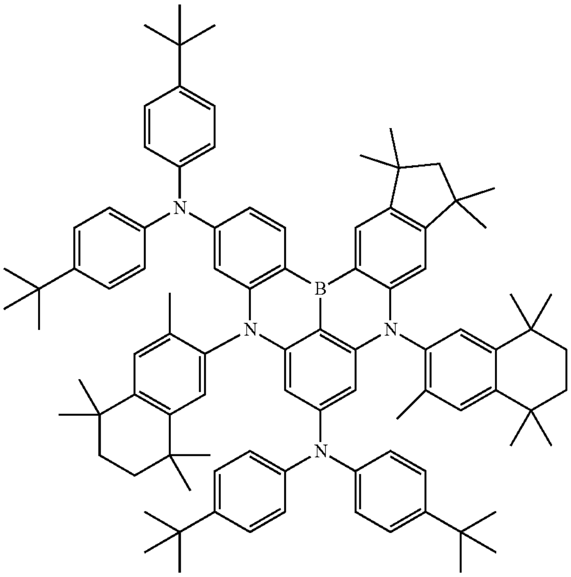
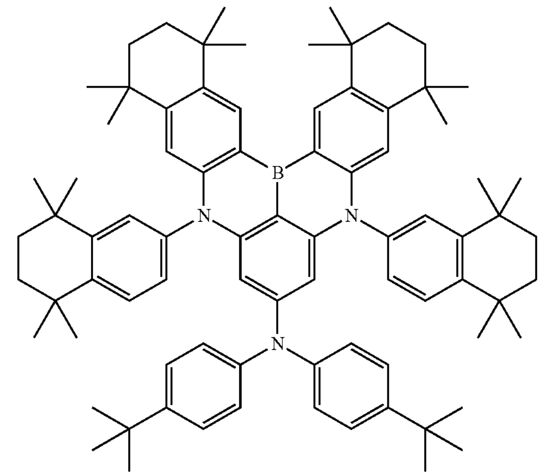
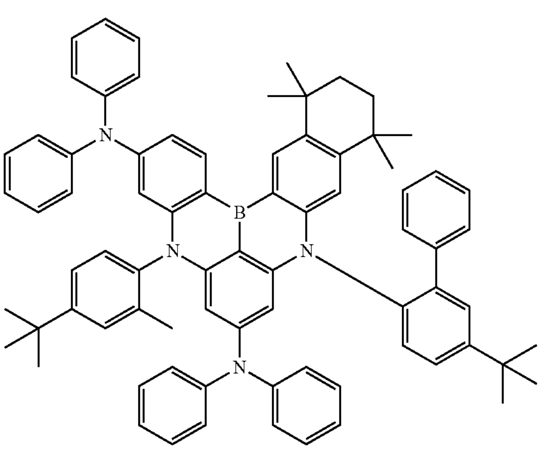
-continued
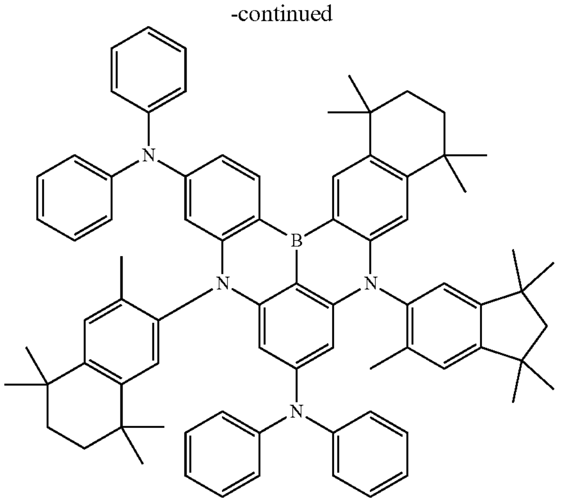
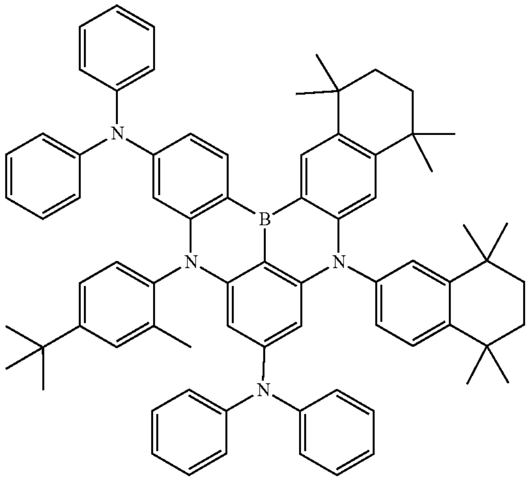
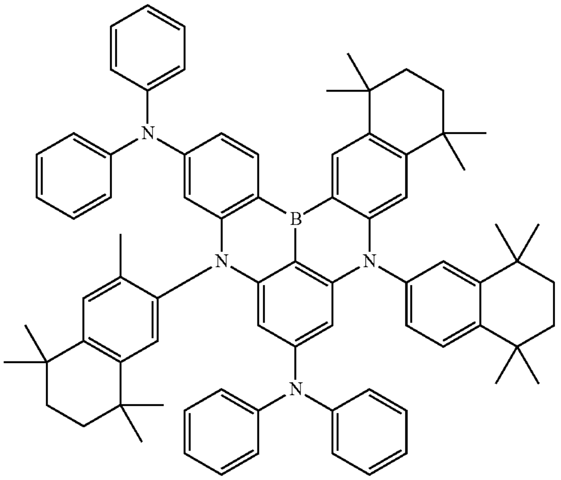

-continued
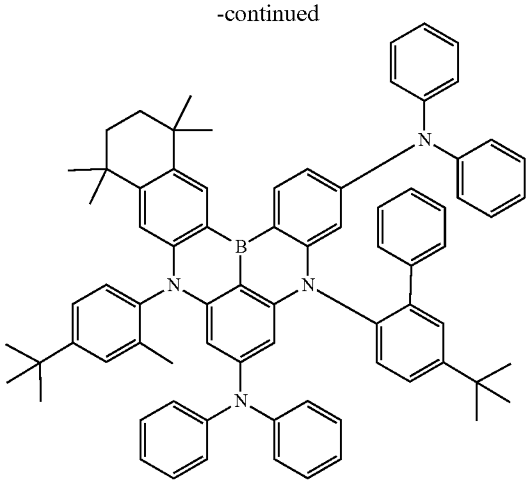
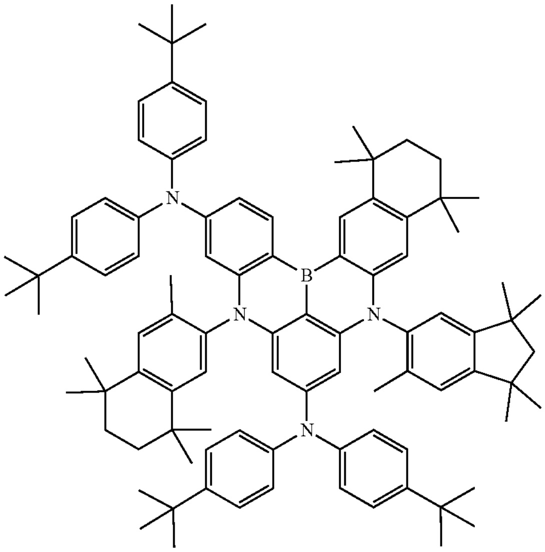
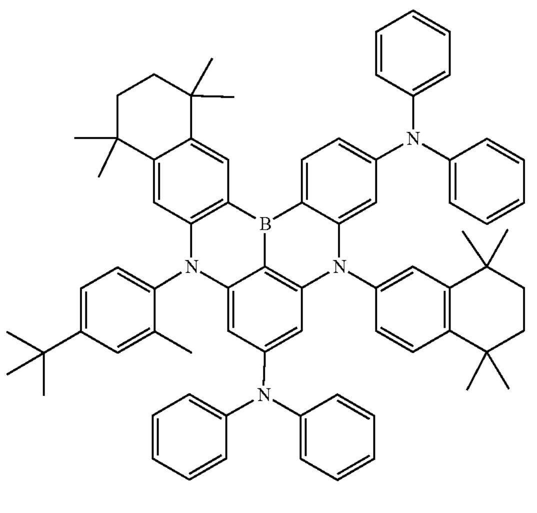
-continued
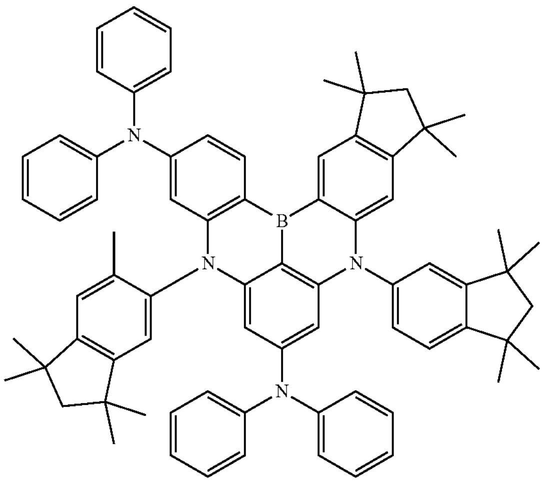
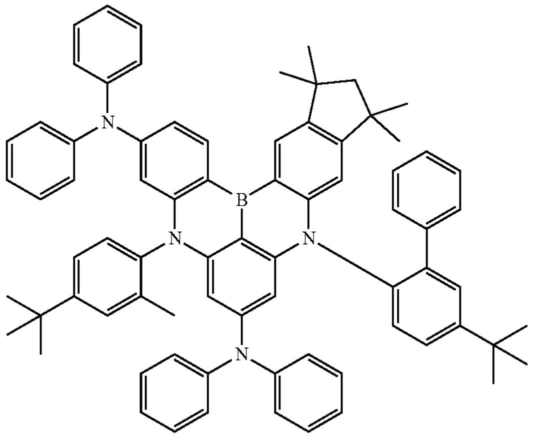
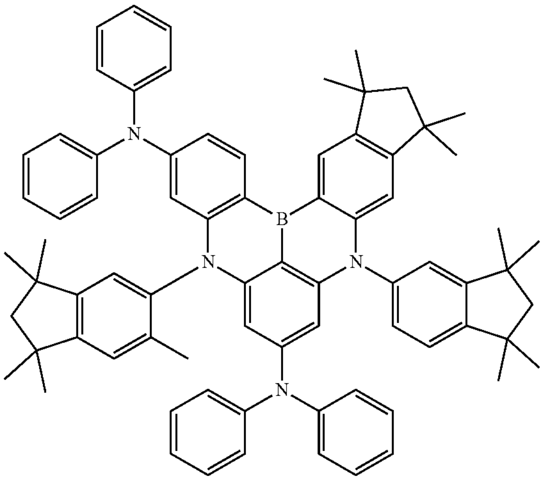

-continued
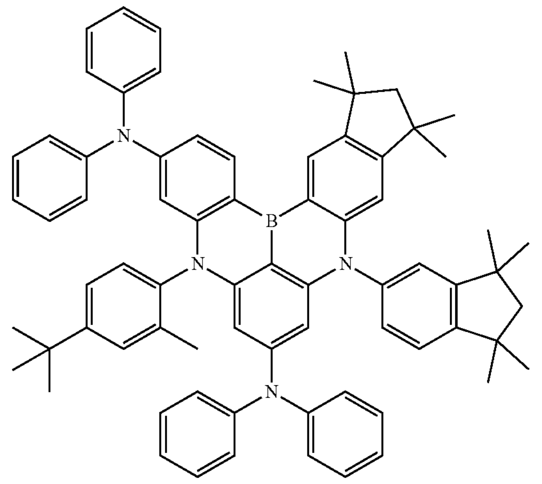
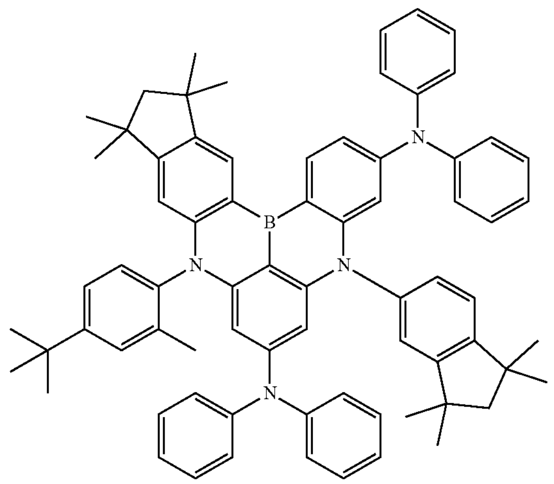
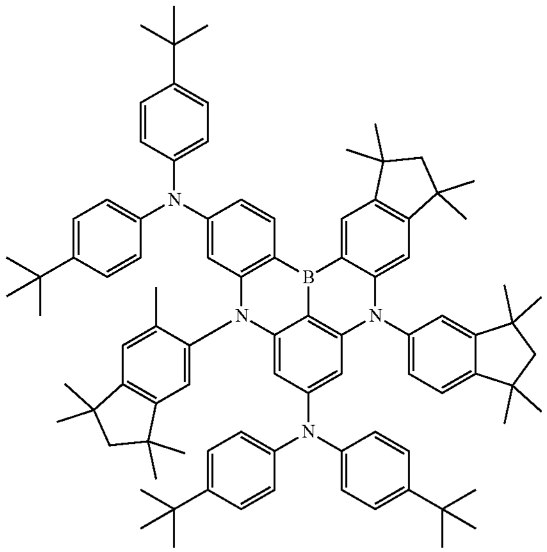
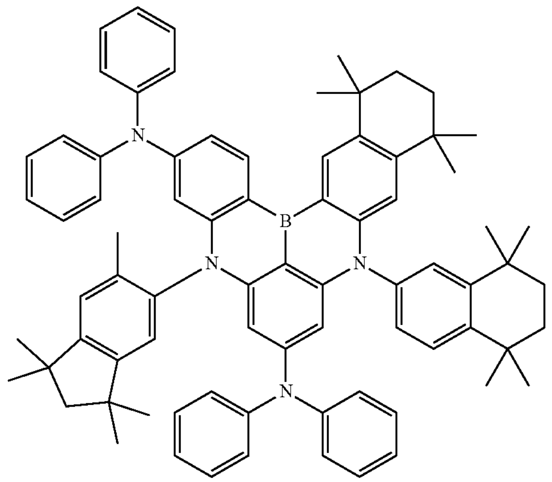
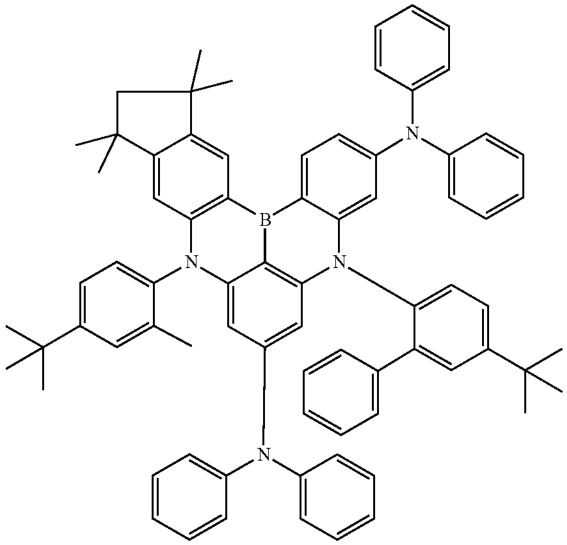
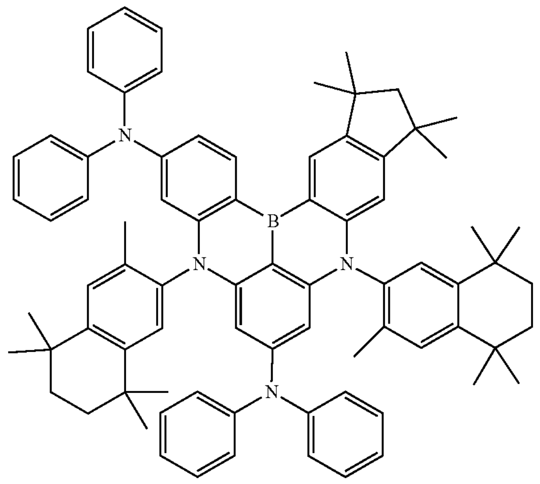
-continued

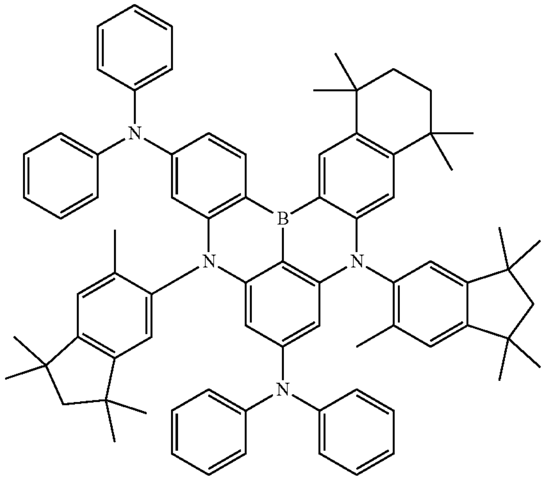
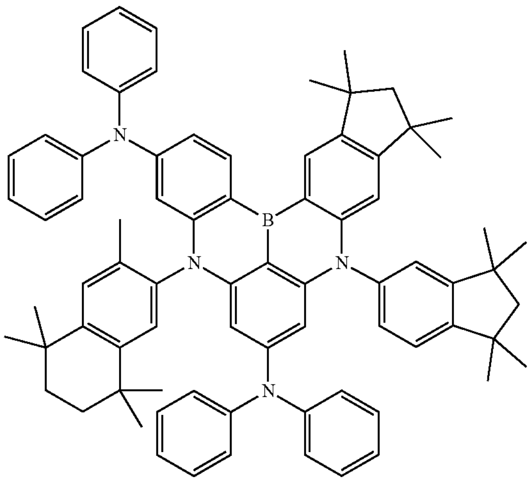
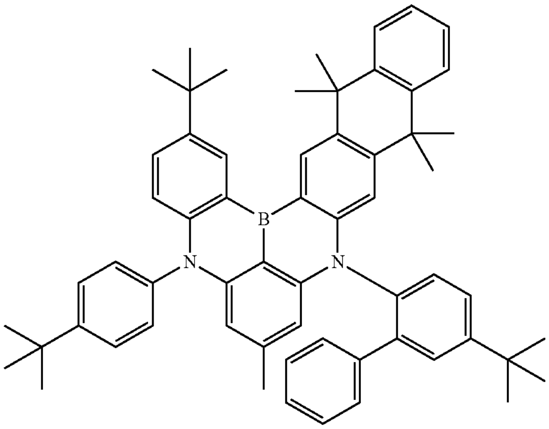
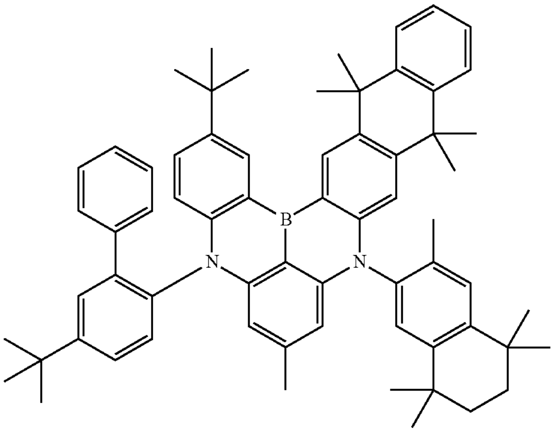
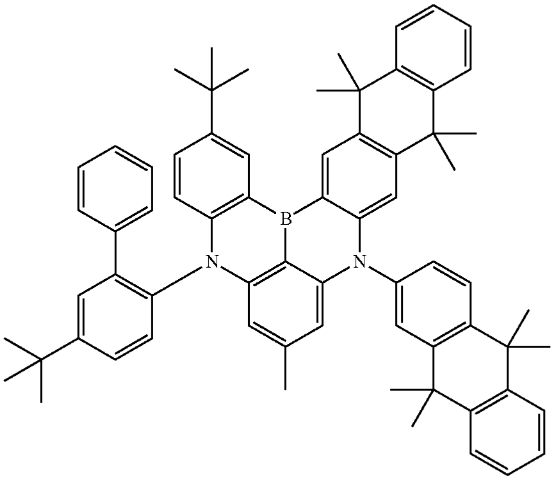
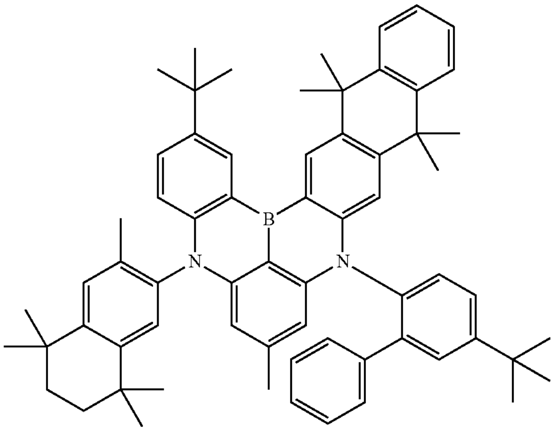

-continued
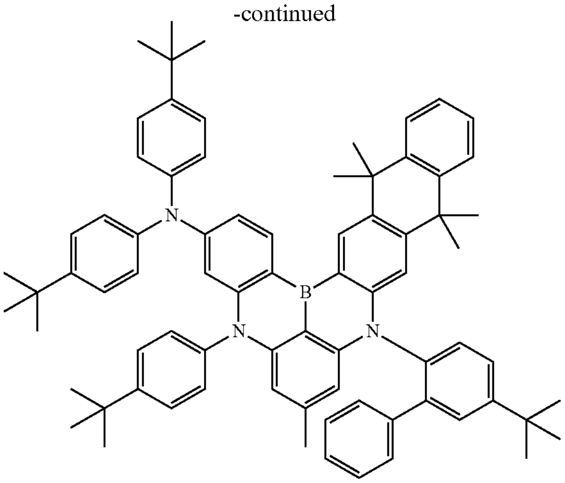
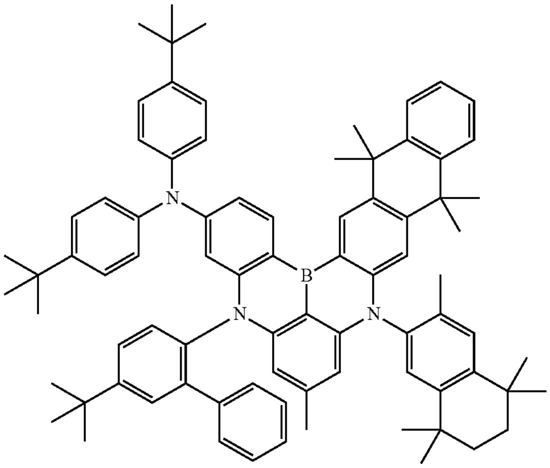
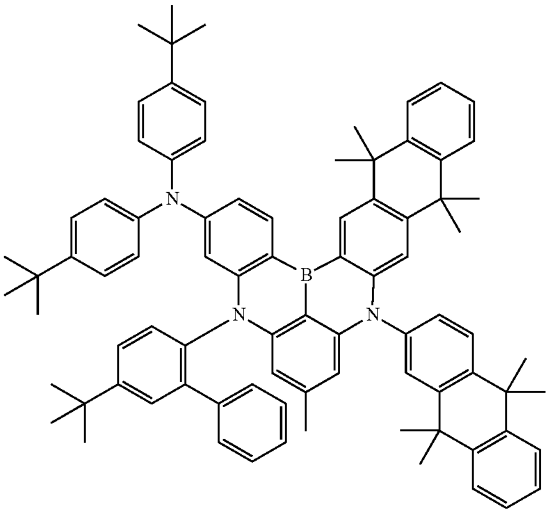
-continued
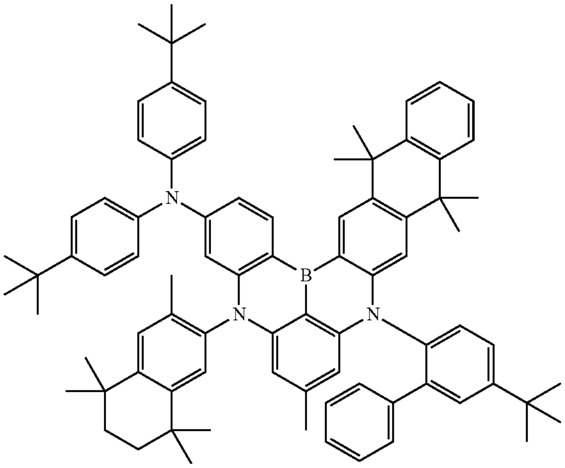
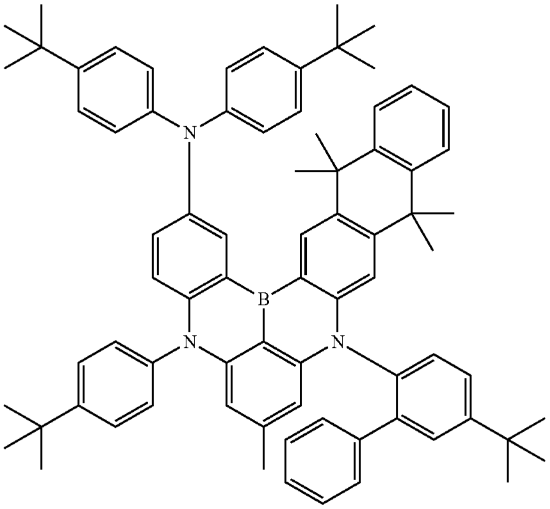
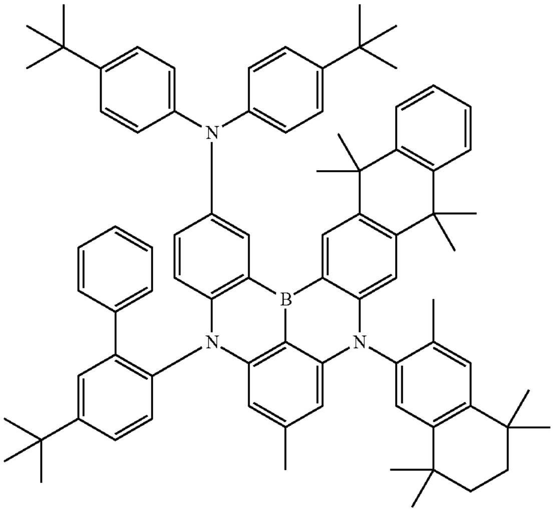

-continued
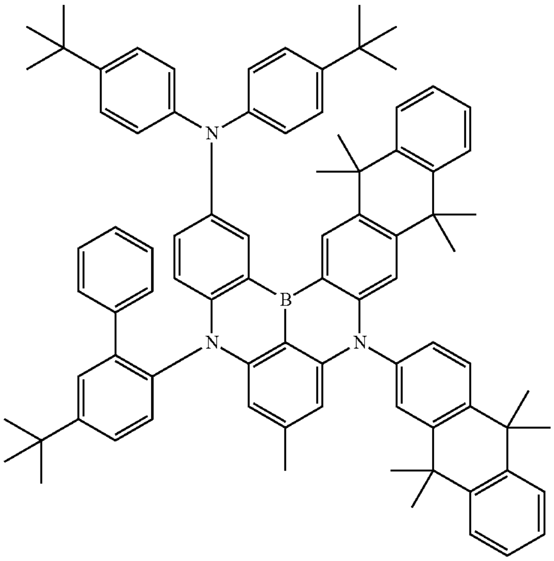
-continued
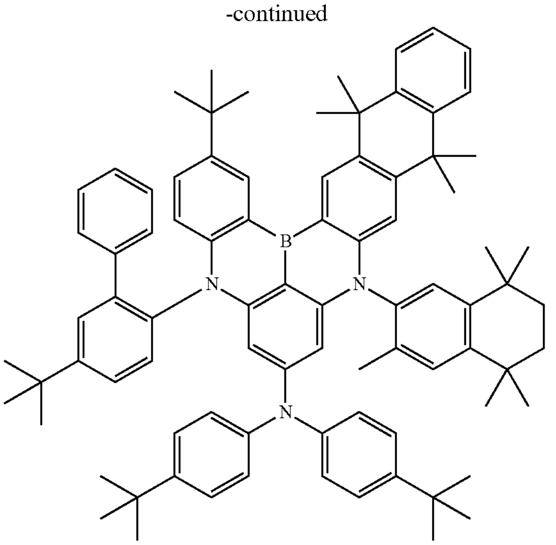
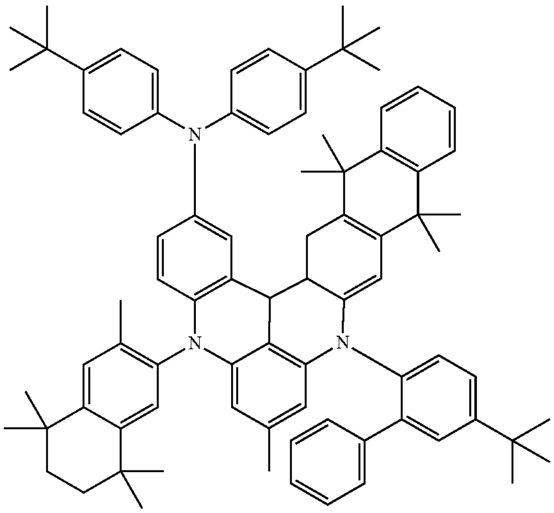
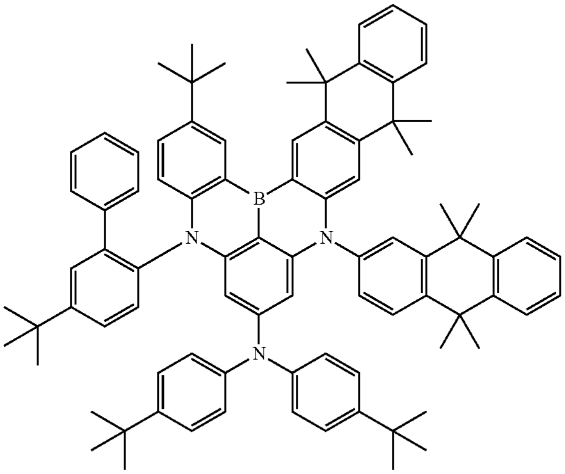
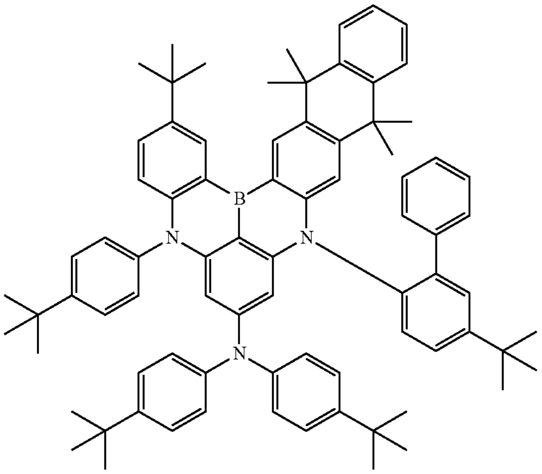
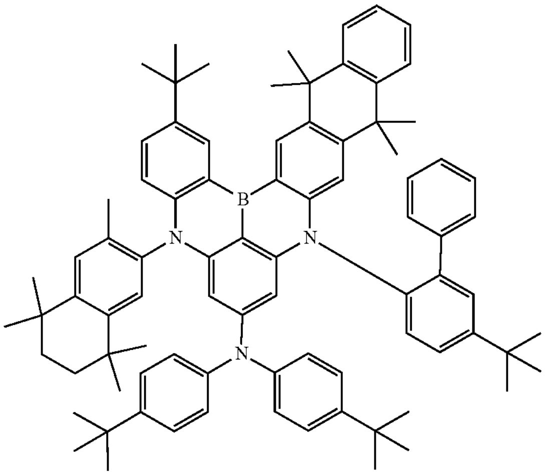

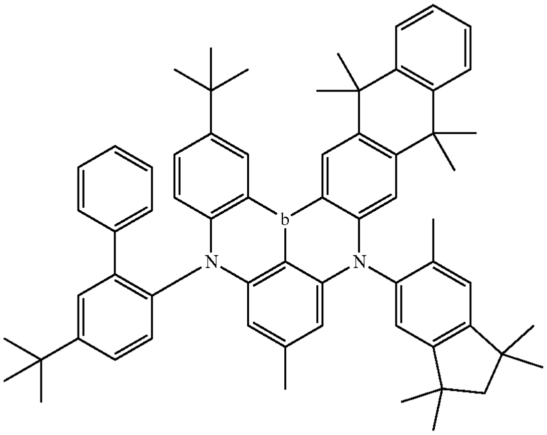
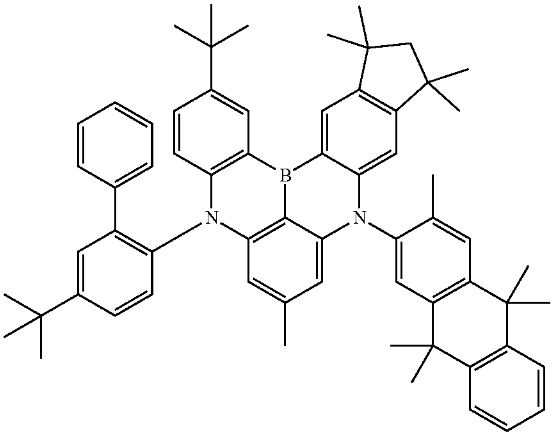
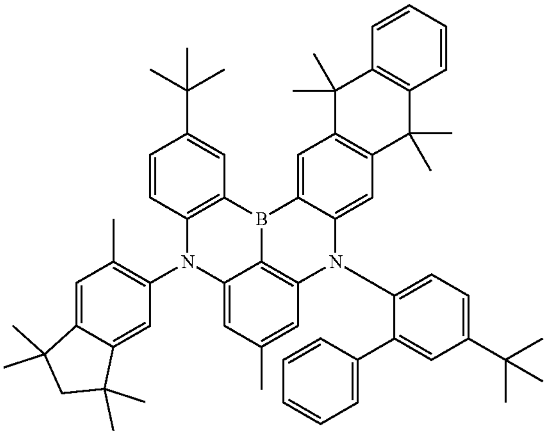
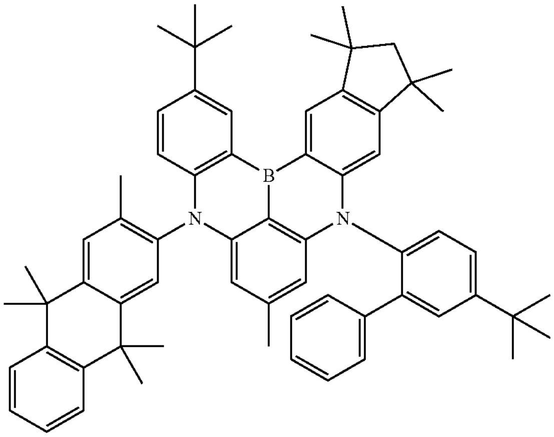
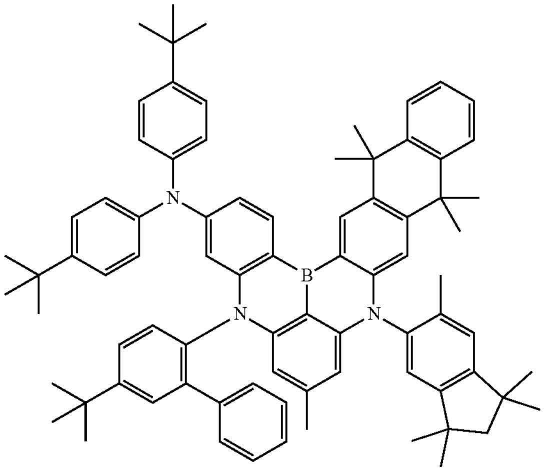
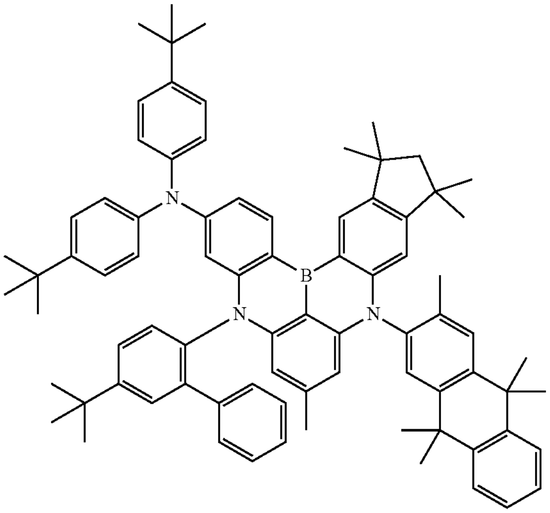

-continued
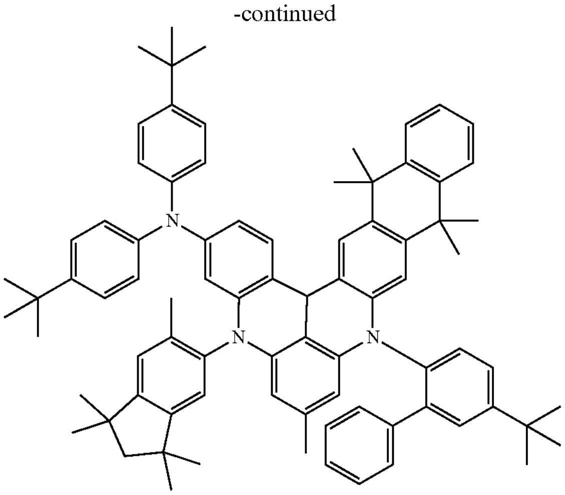
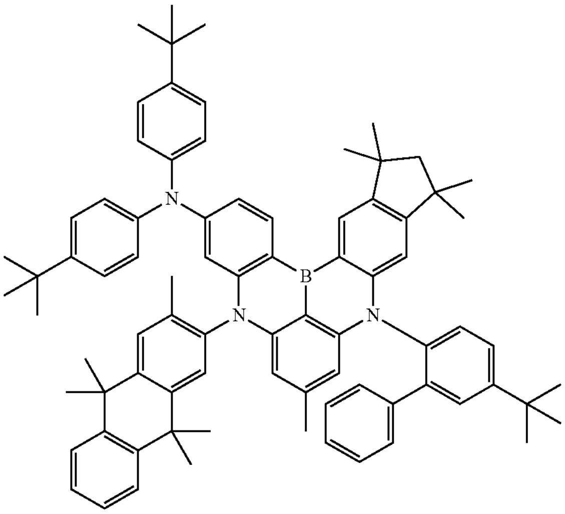
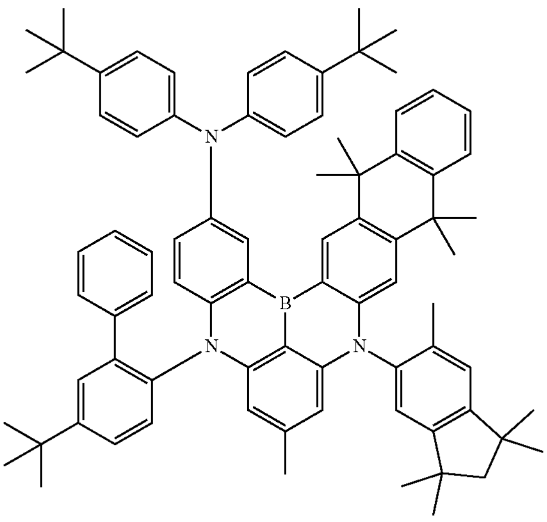
-continued
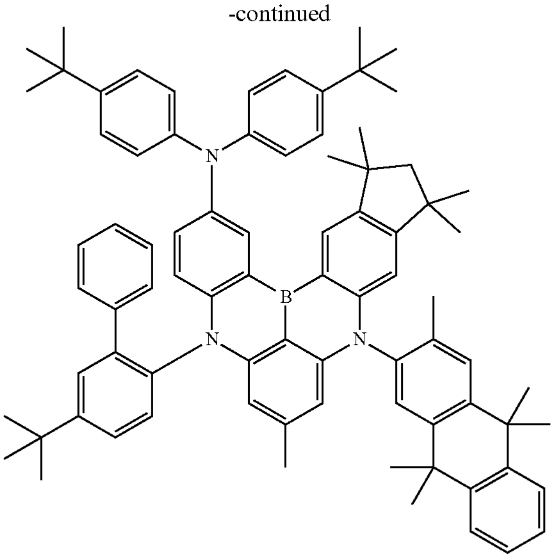
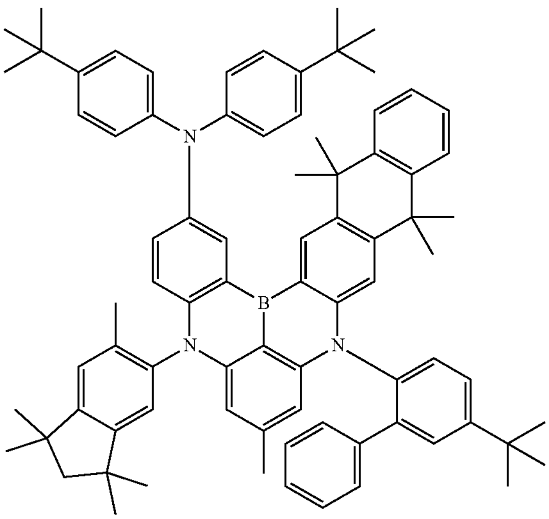
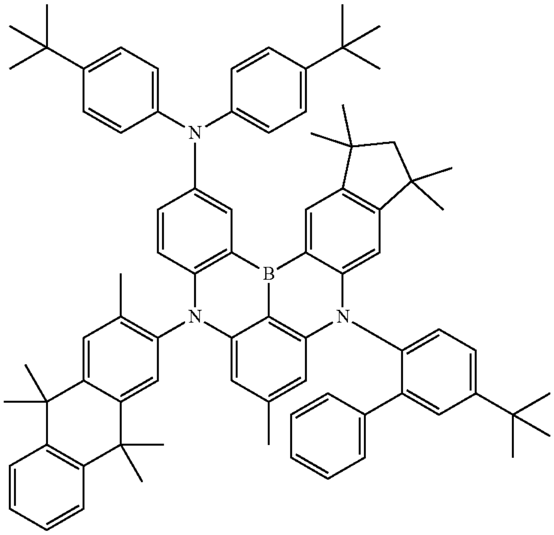

-continued
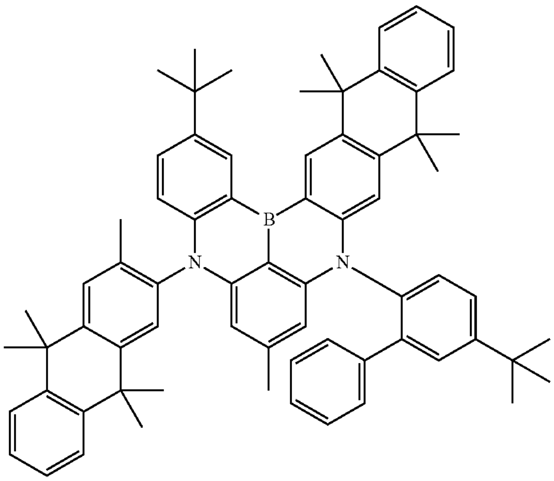
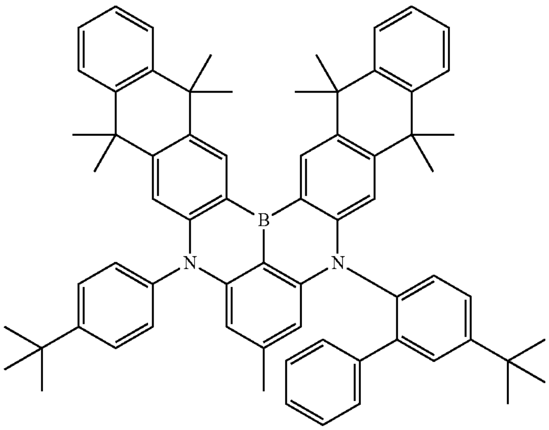
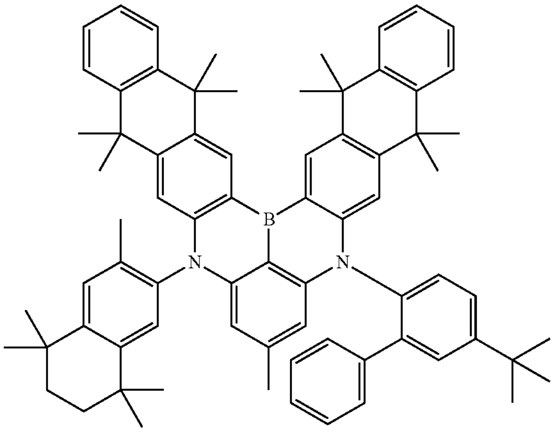
-continued
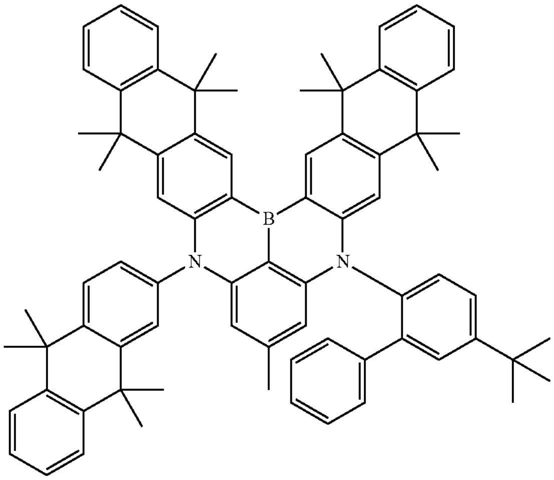
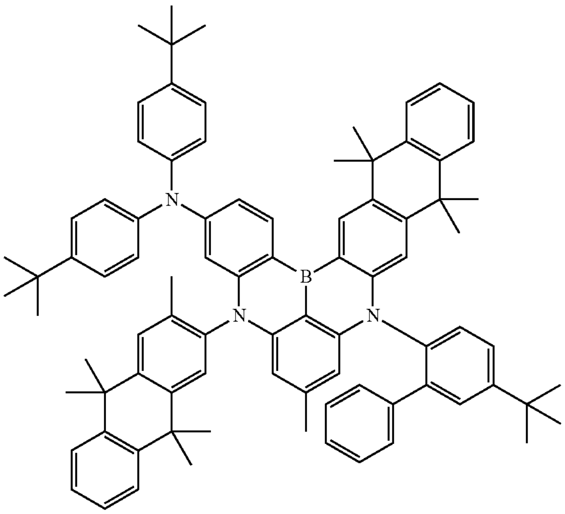
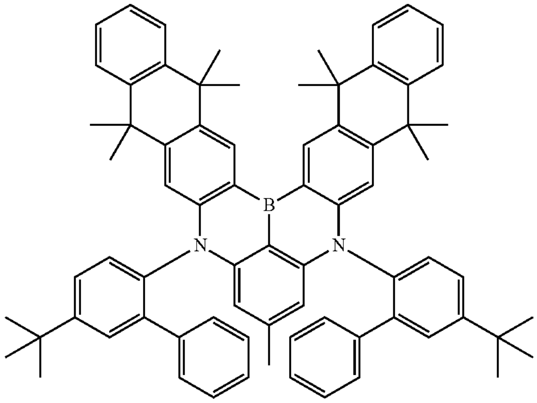

-continued
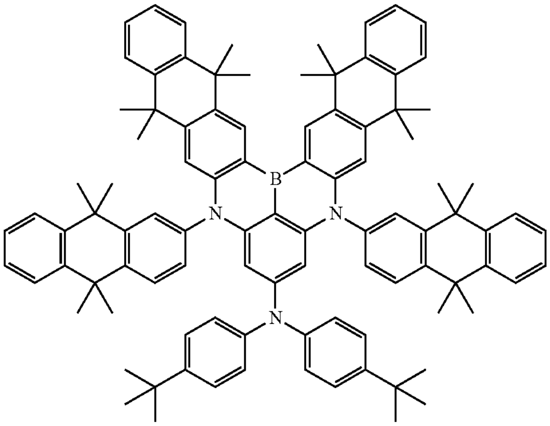
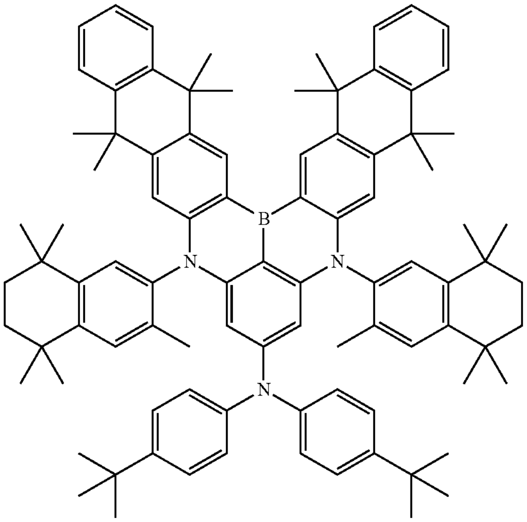
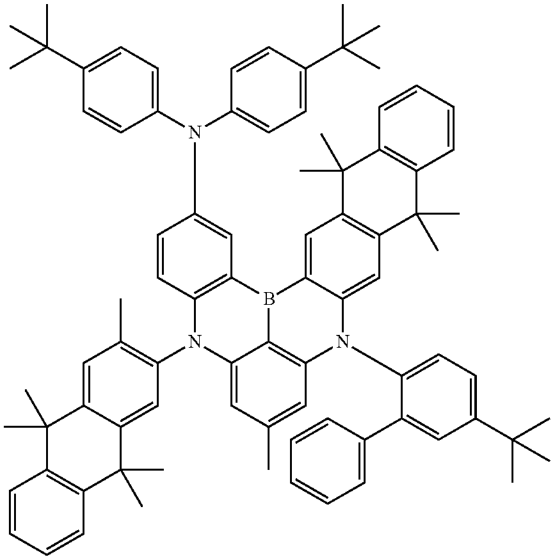
-continued
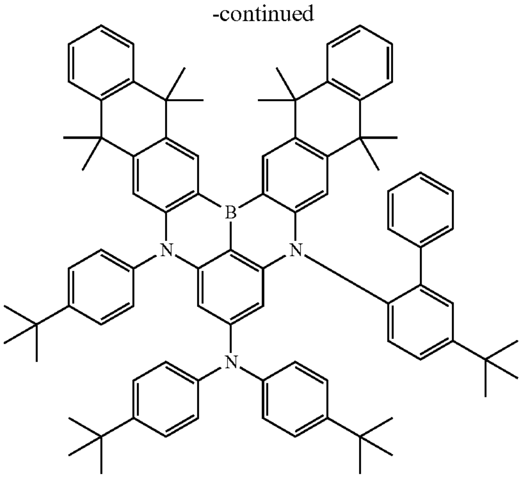
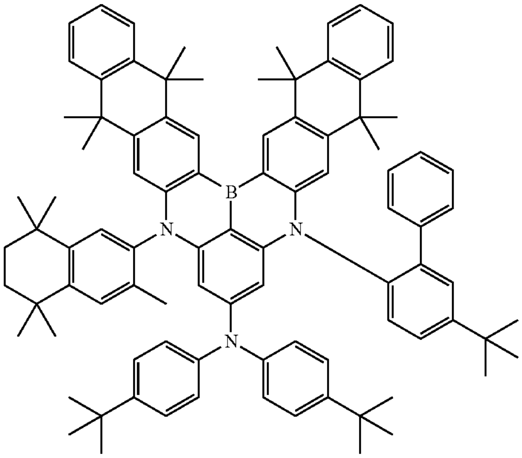
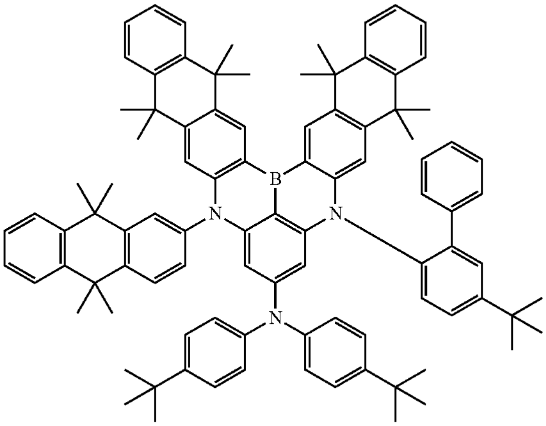

-continued
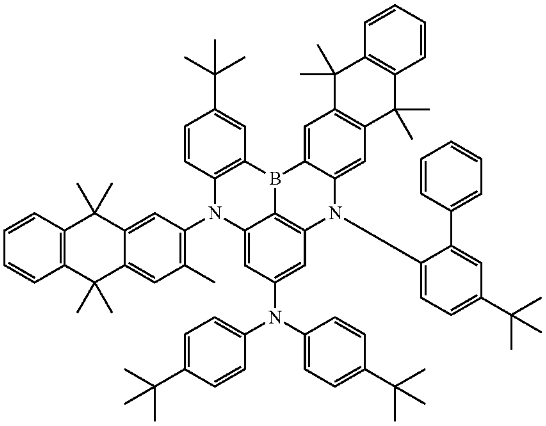
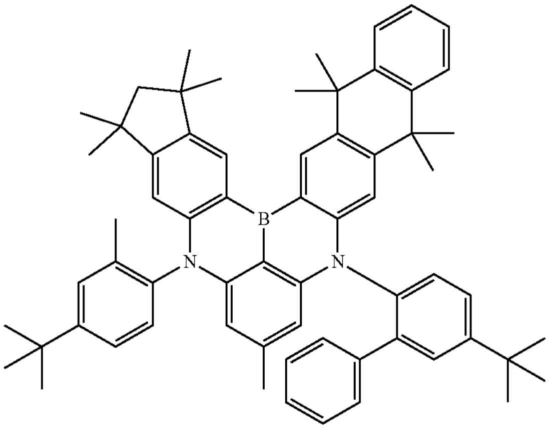
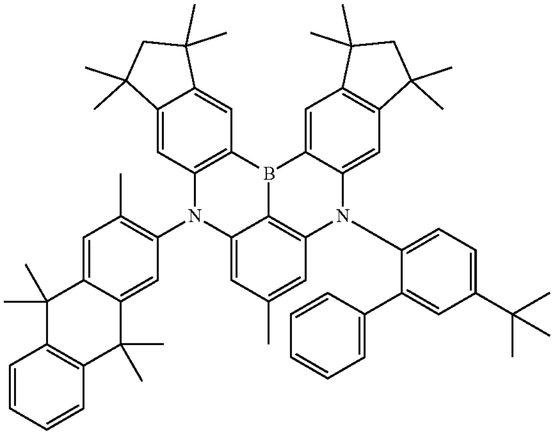
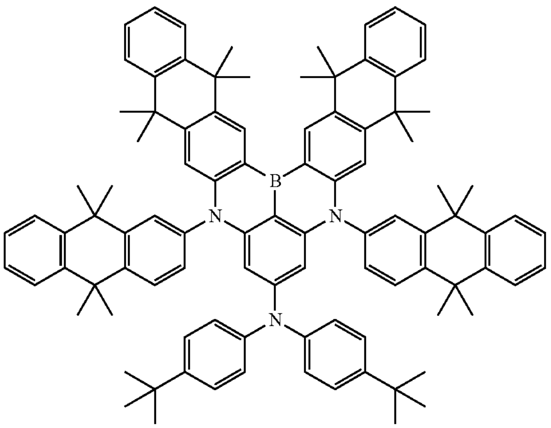
-continued
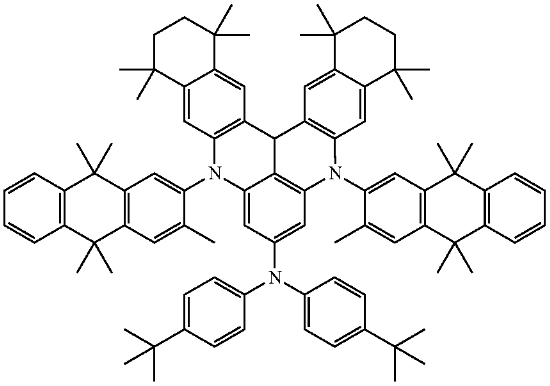
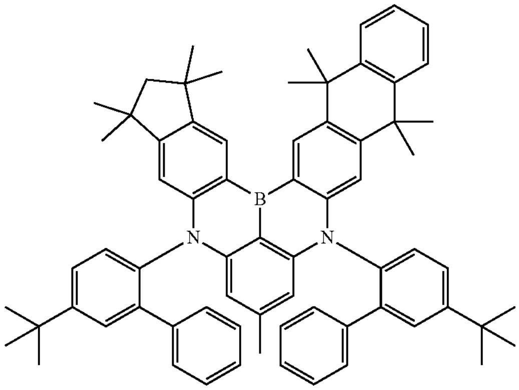
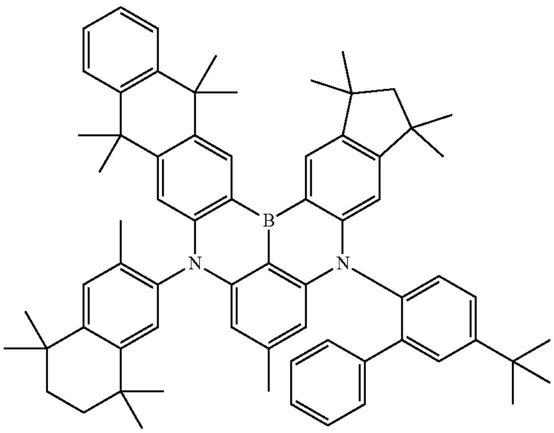
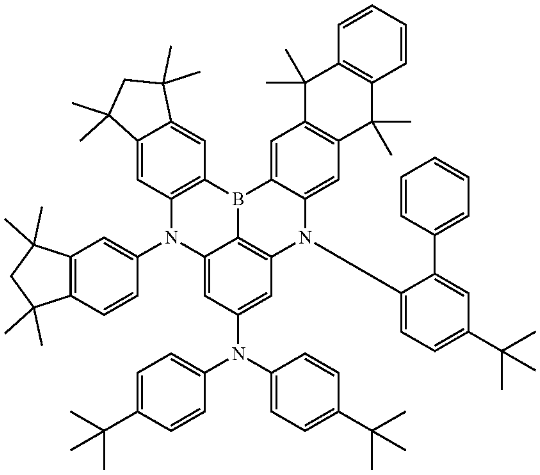

-continued
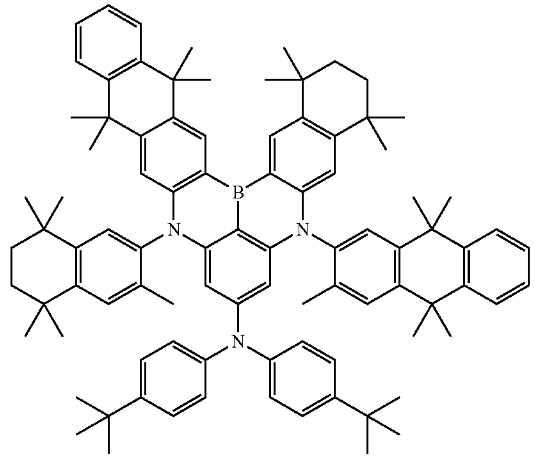
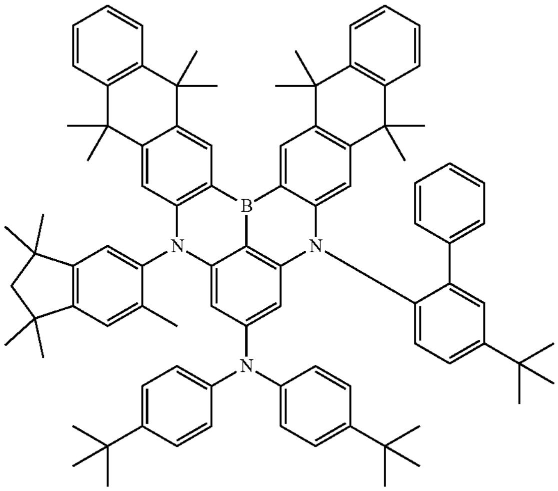
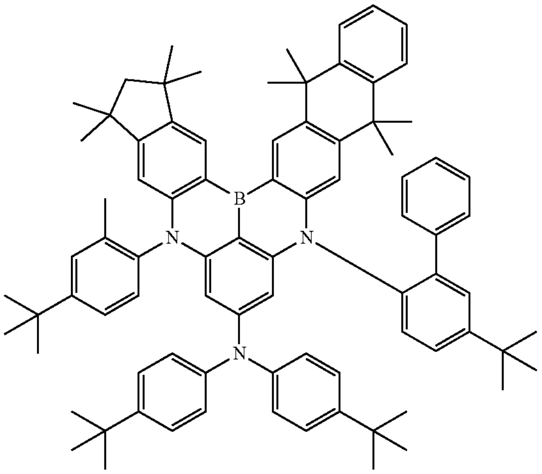
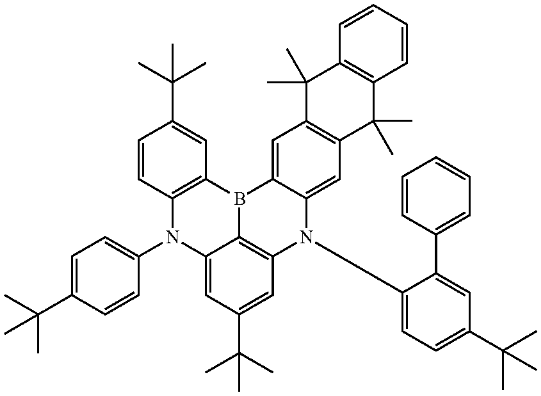
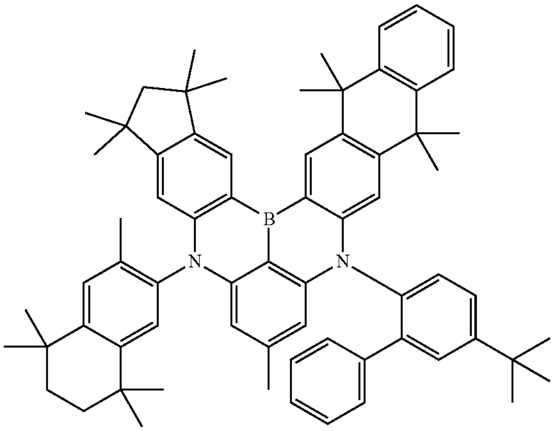
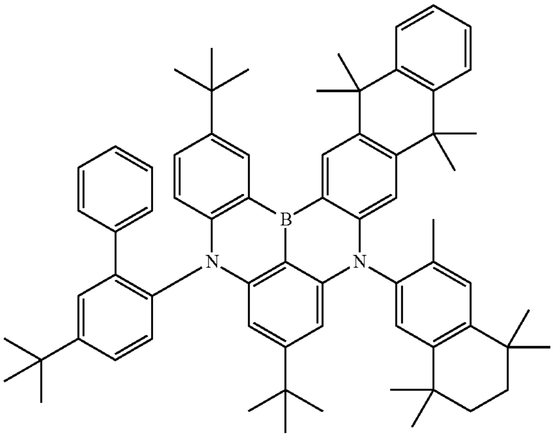
-continued -continued
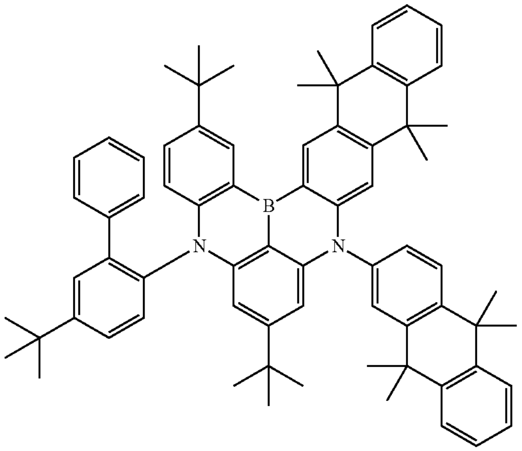
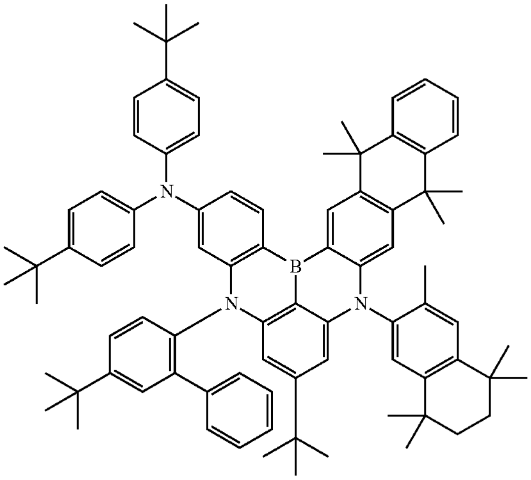
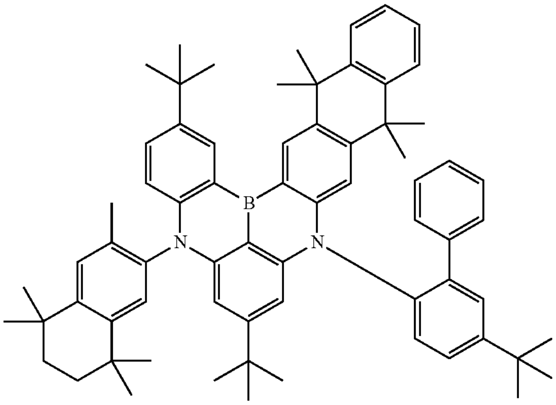
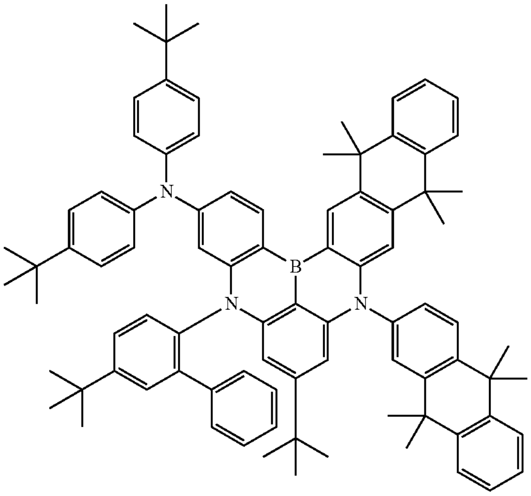
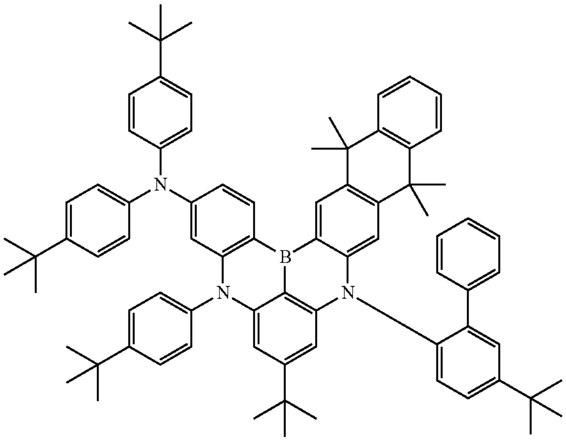
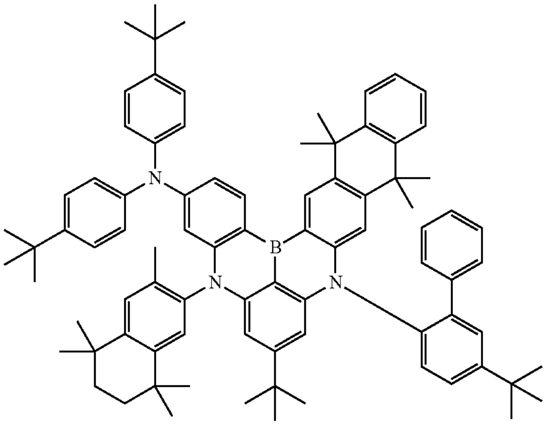

-continued
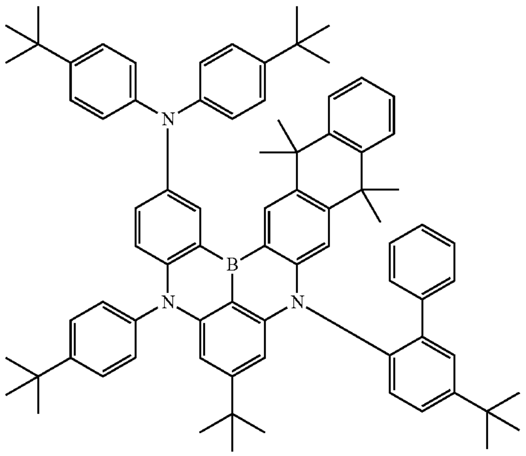
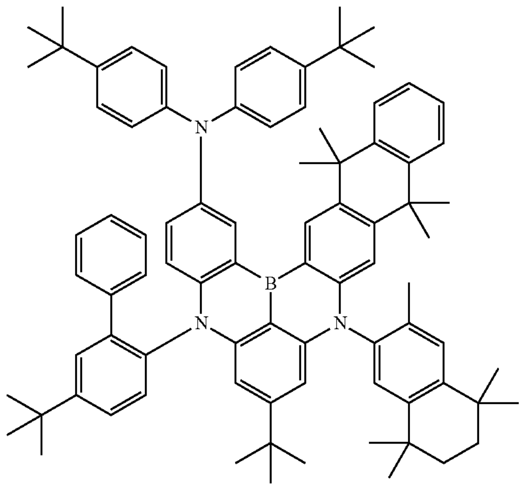
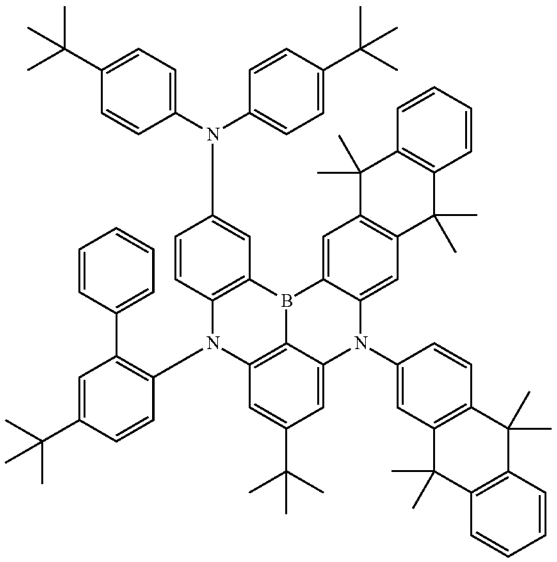
-continued
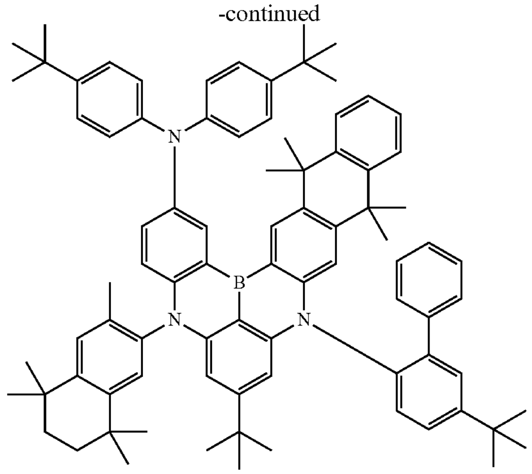
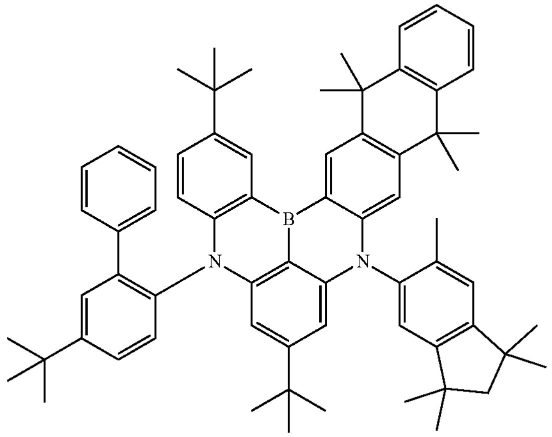
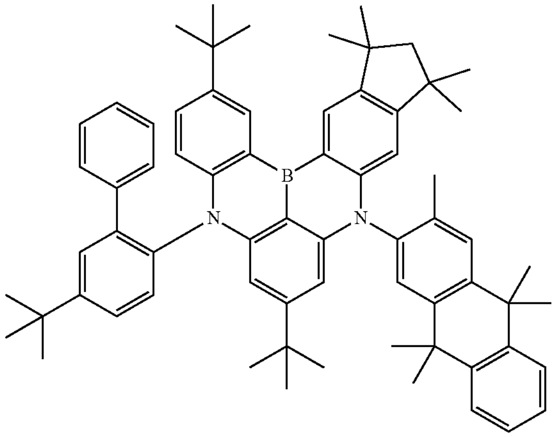
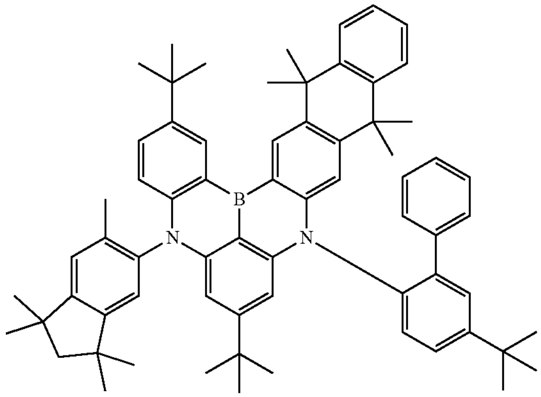

-continued
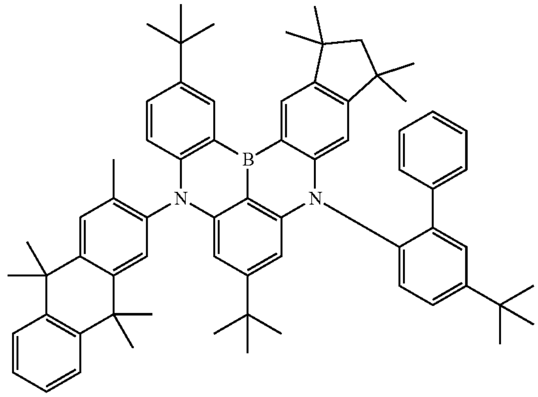
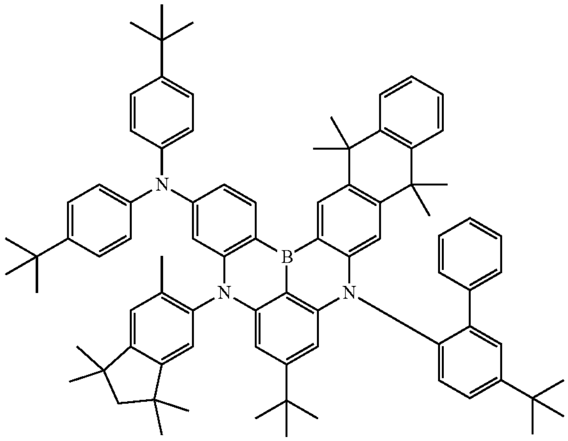
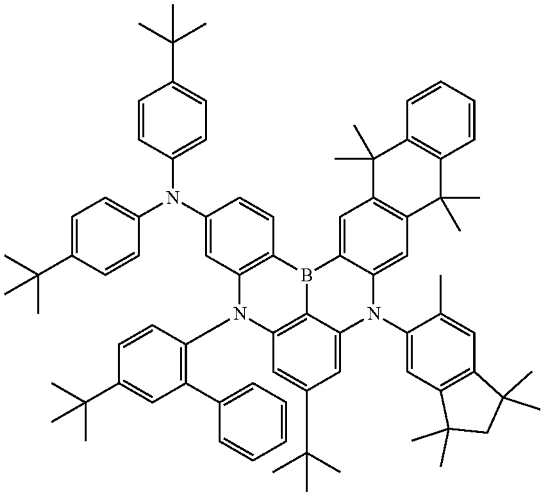
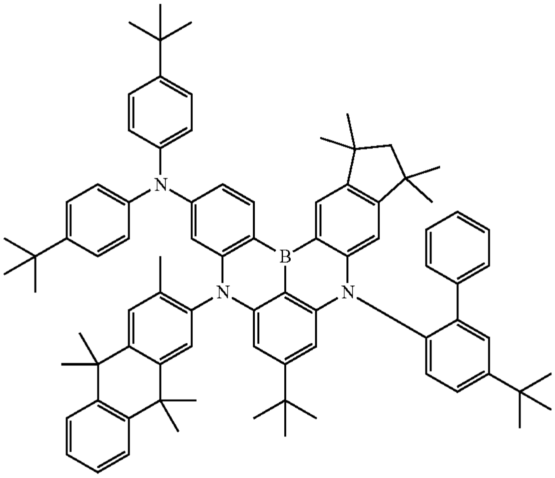
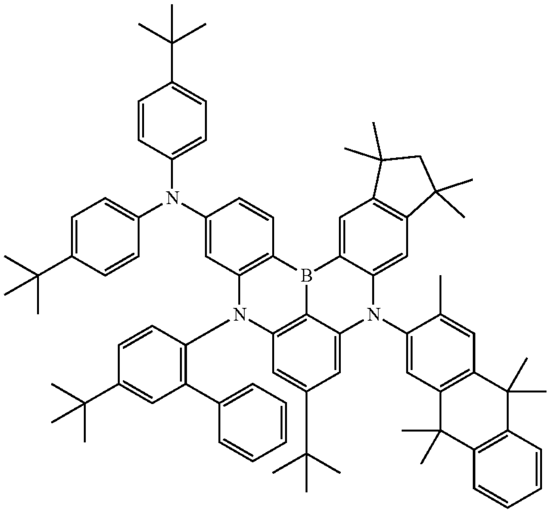
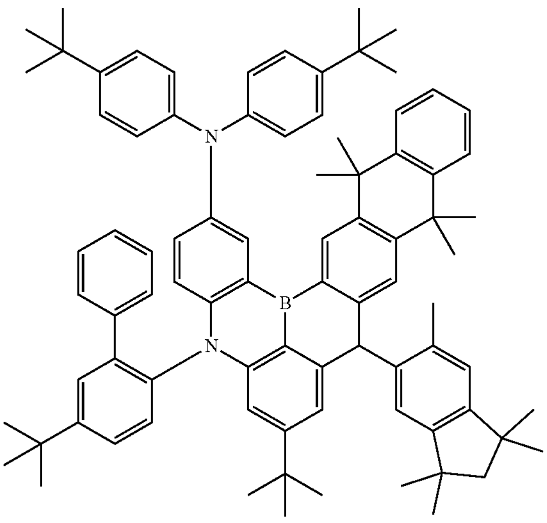

-continued
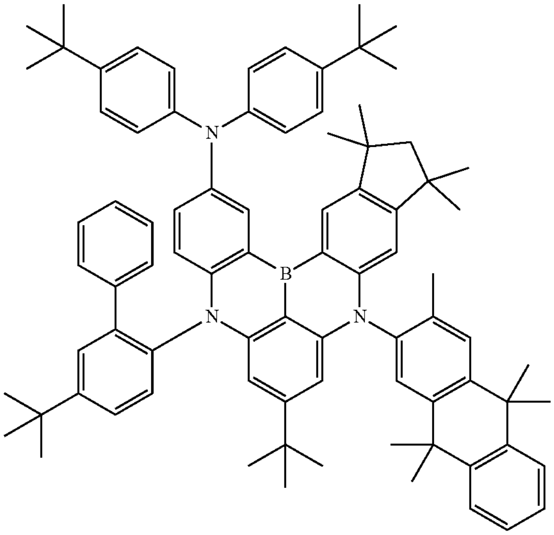
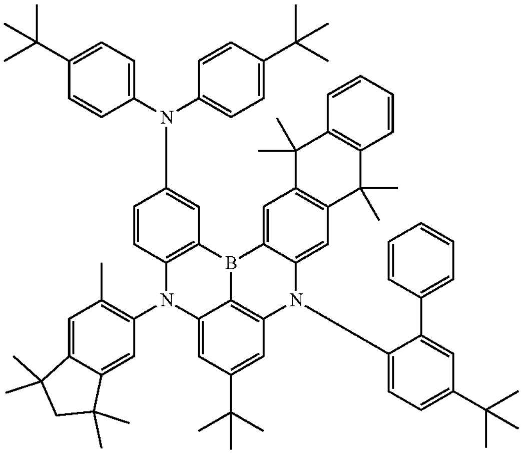
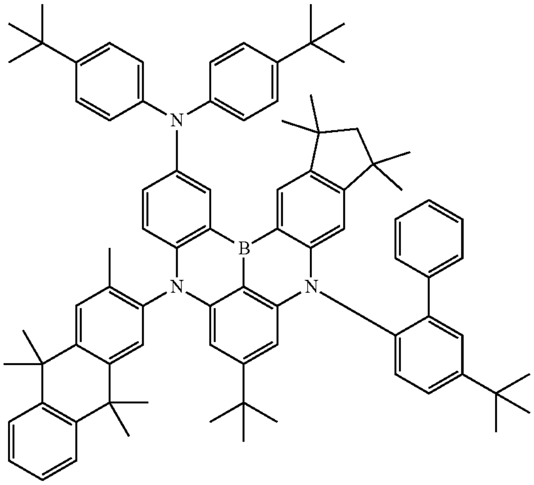
-continued
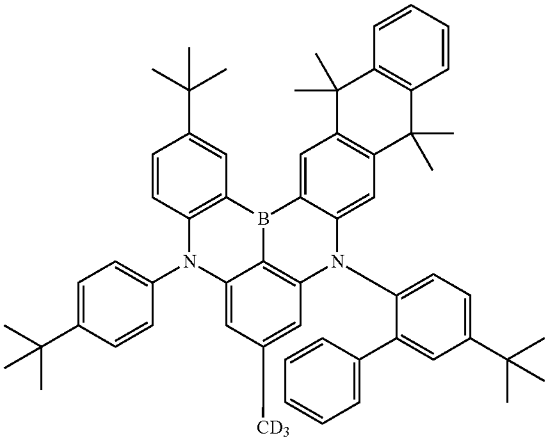
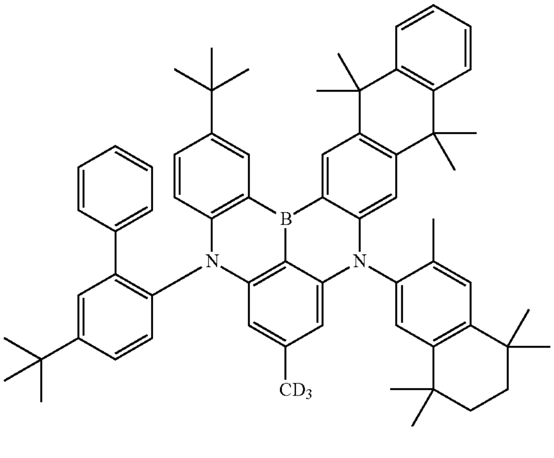
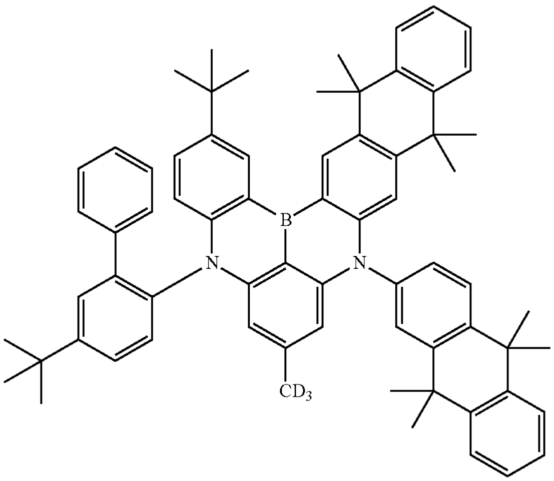

-continued
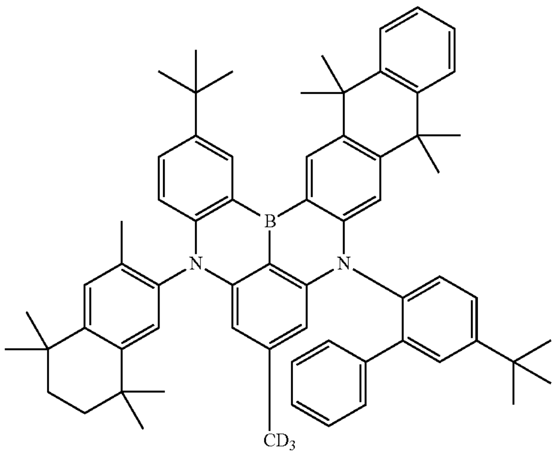
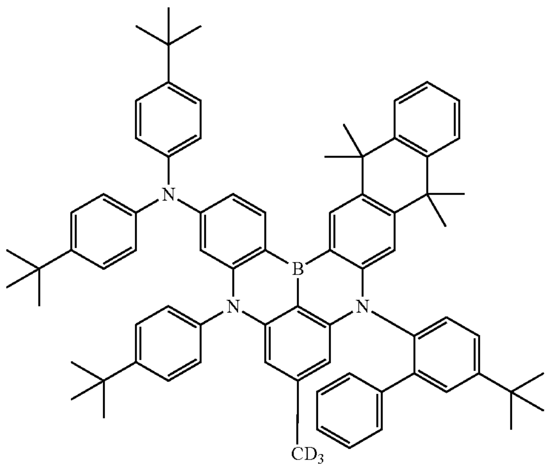
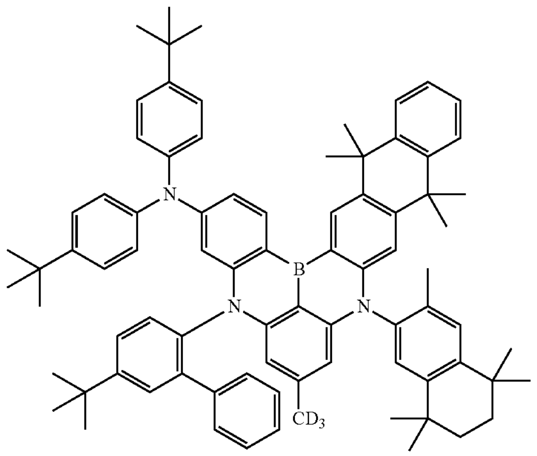
-continued
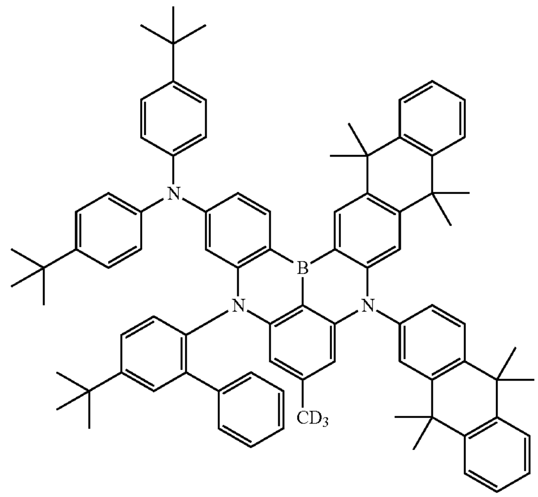
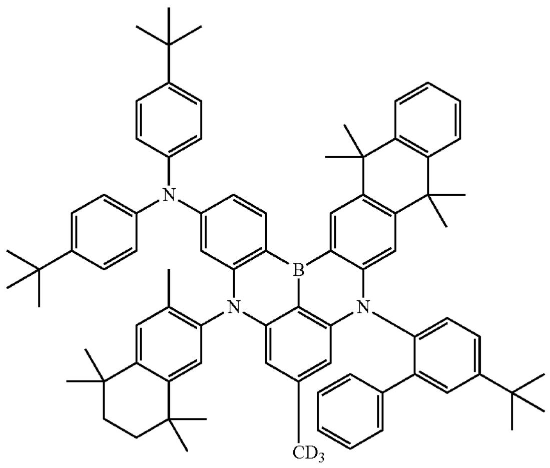
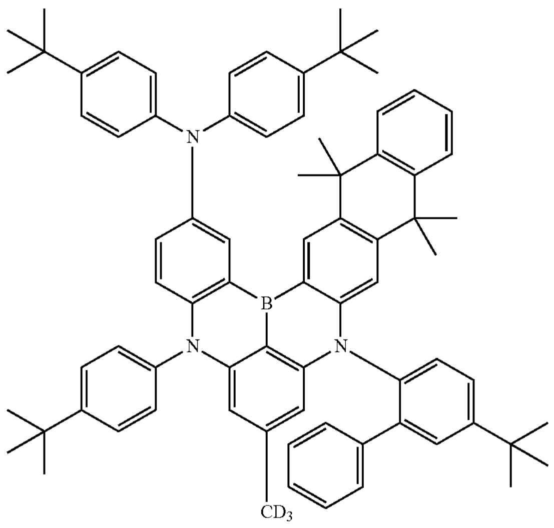

-continued
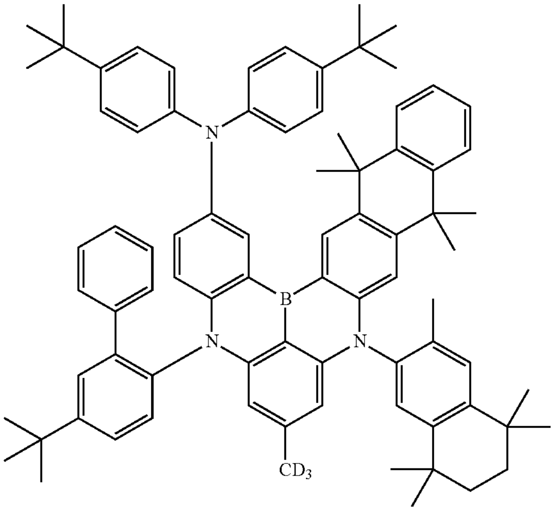
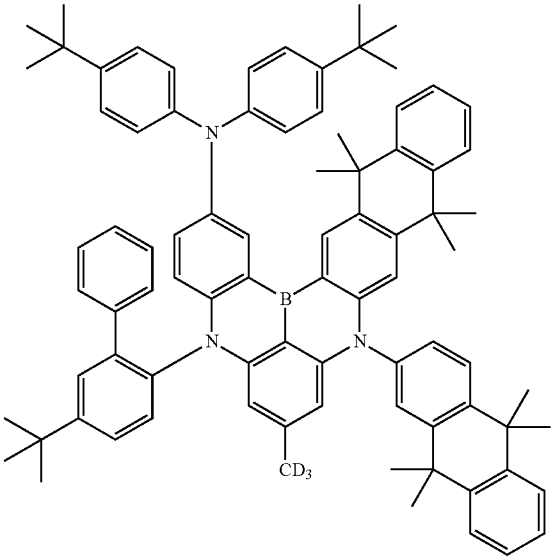
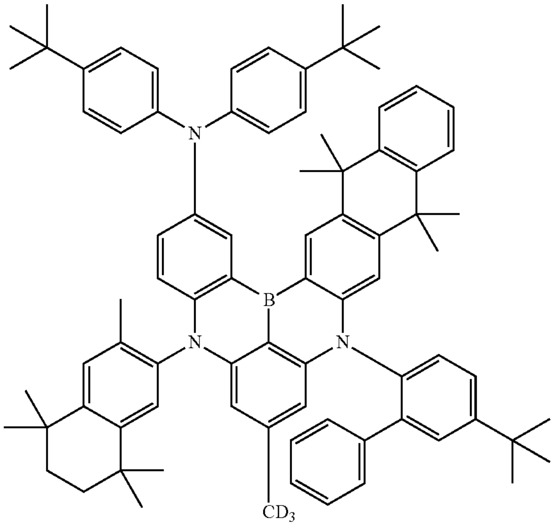
-continued
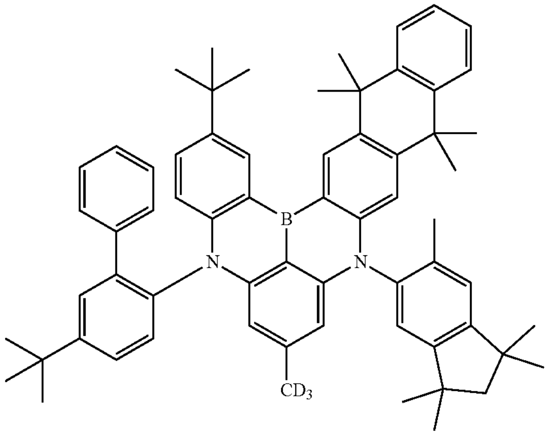
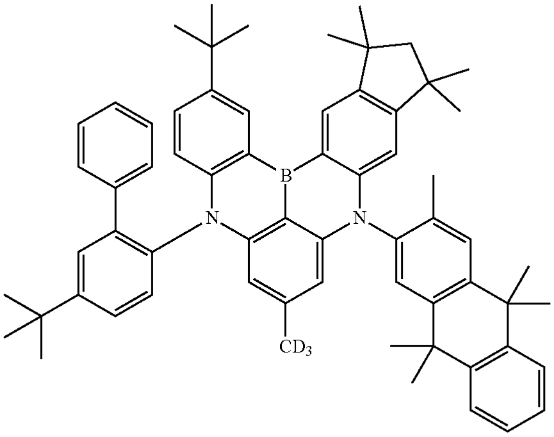
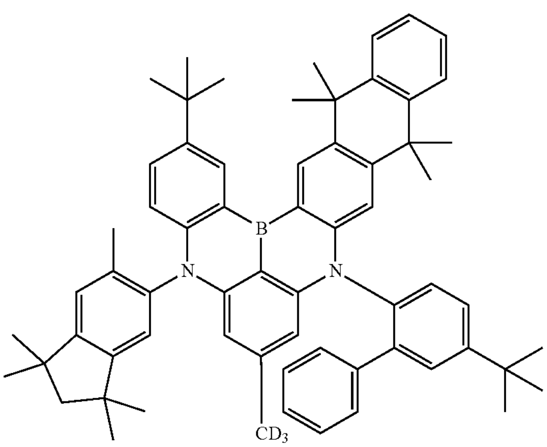

-continued
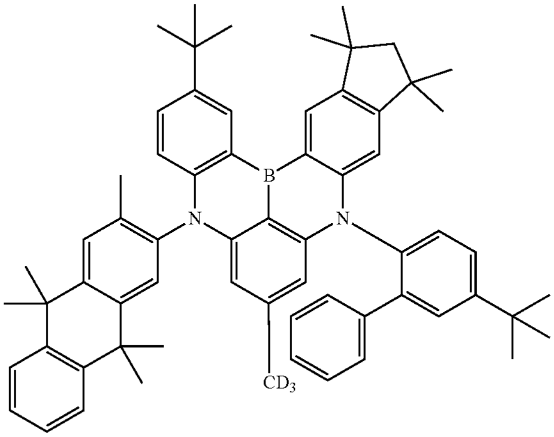
-continued
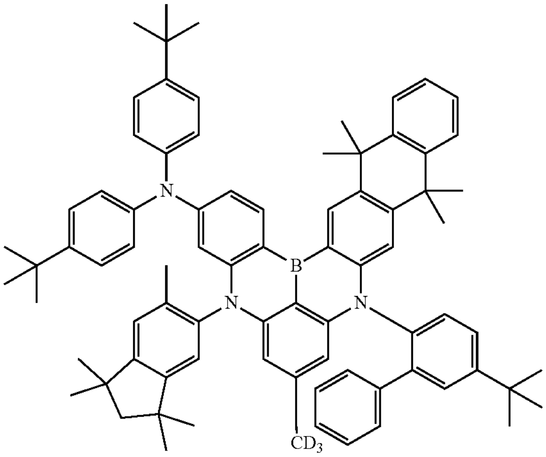
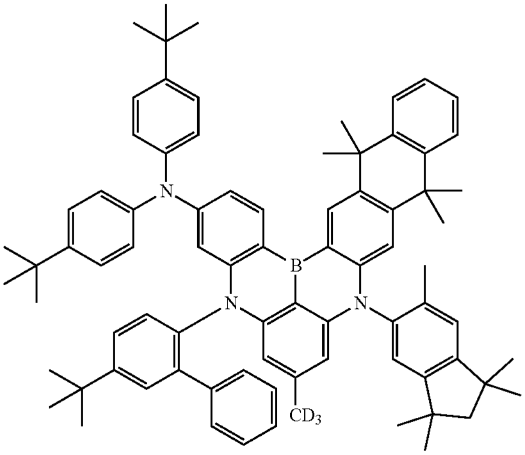
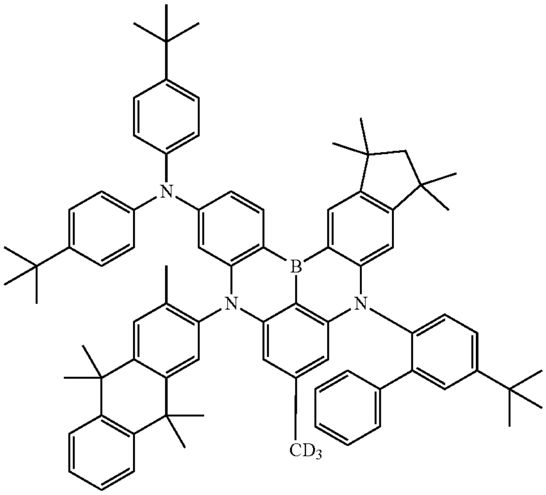
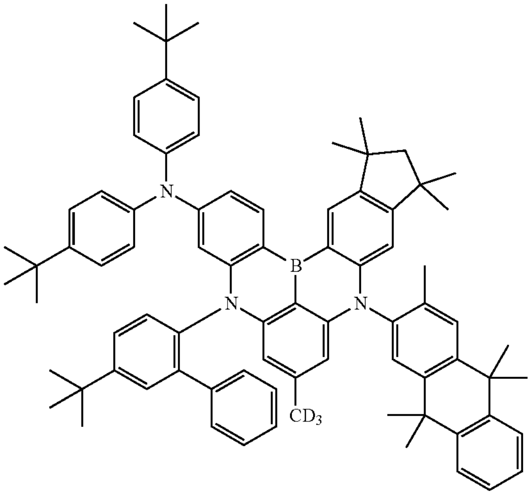
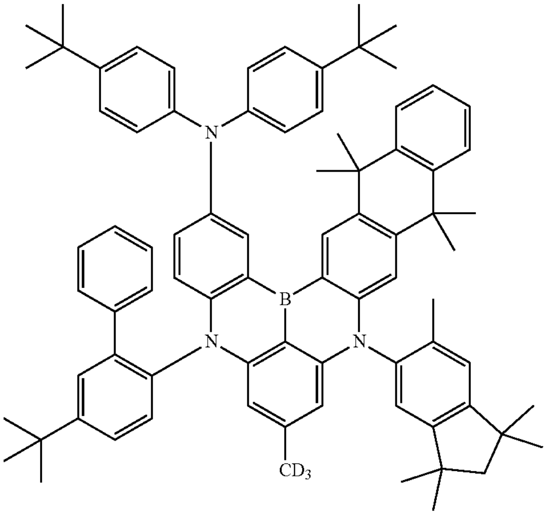

-continued
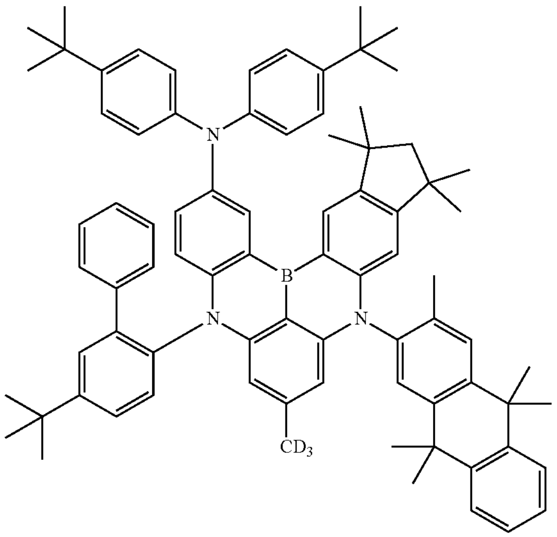
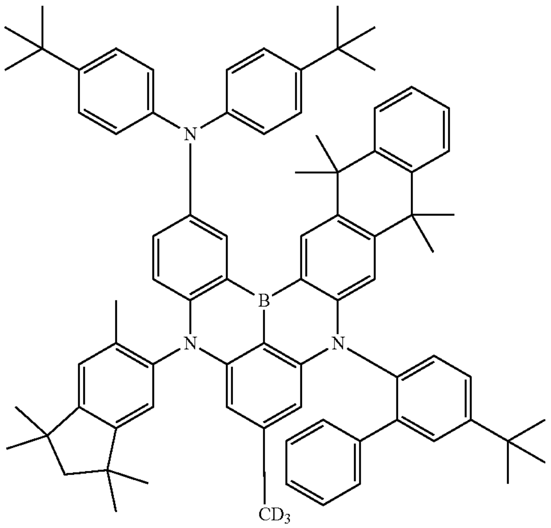
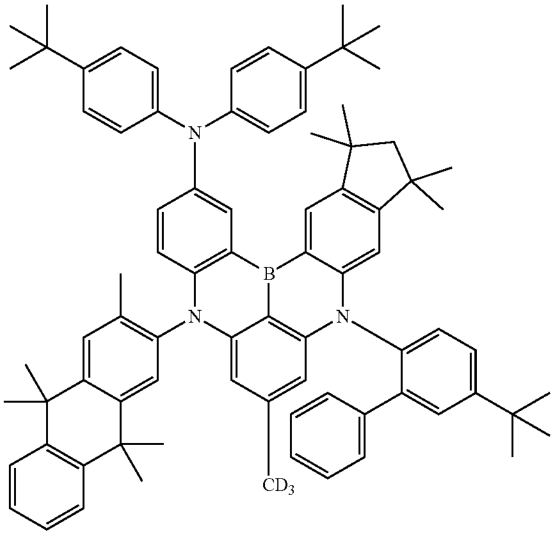
-continued
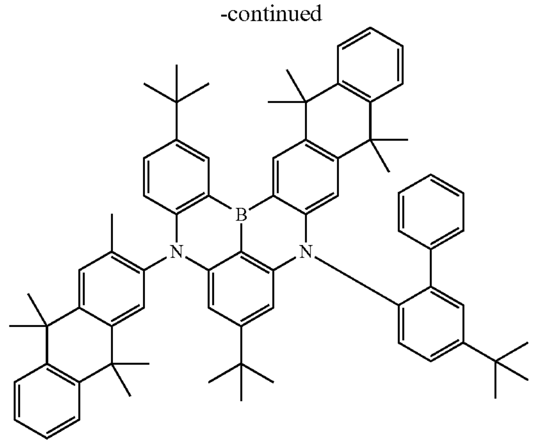
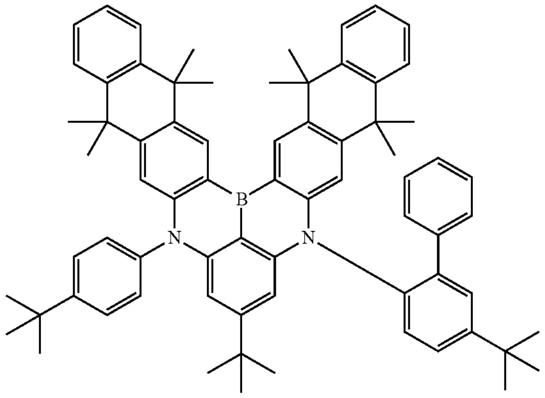
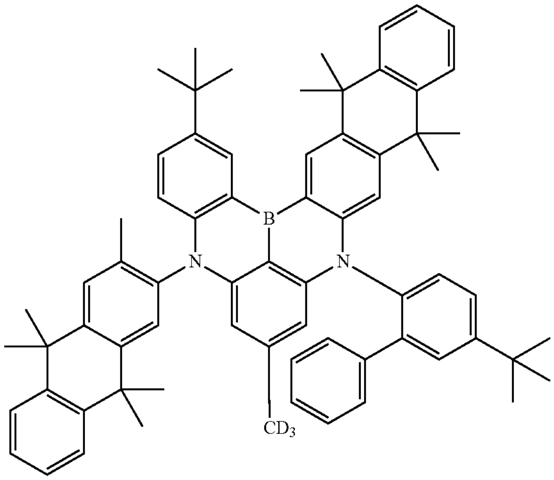

-continued
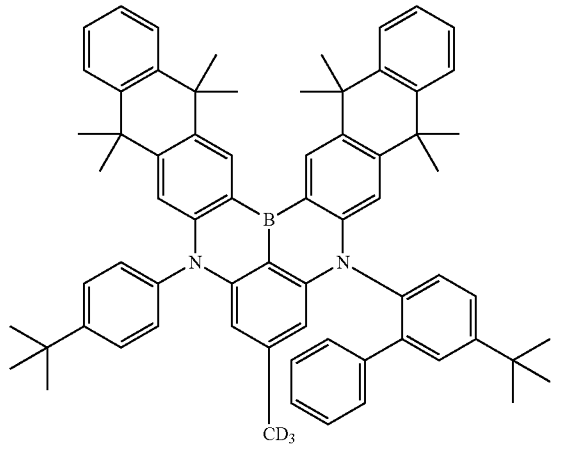
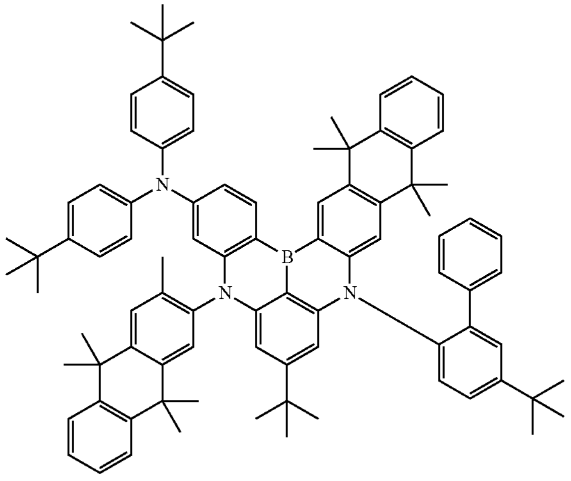
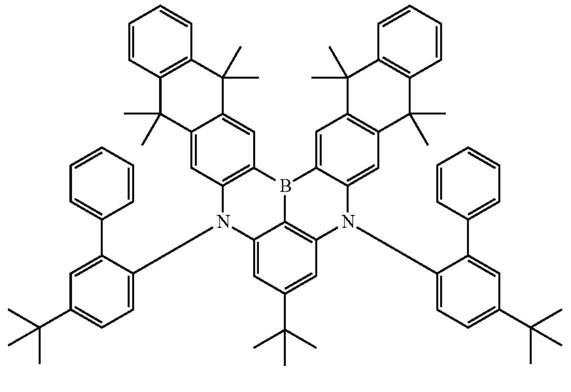
-continued
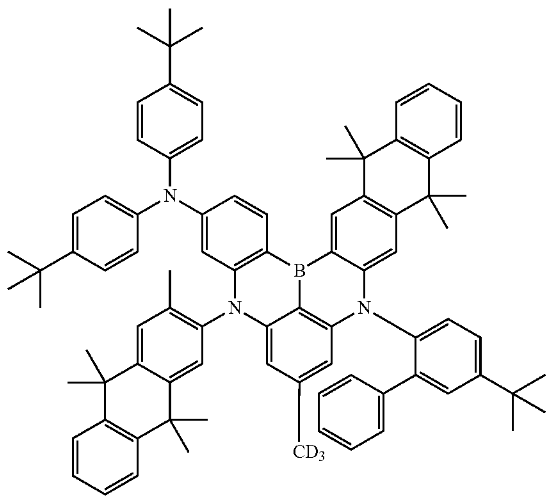
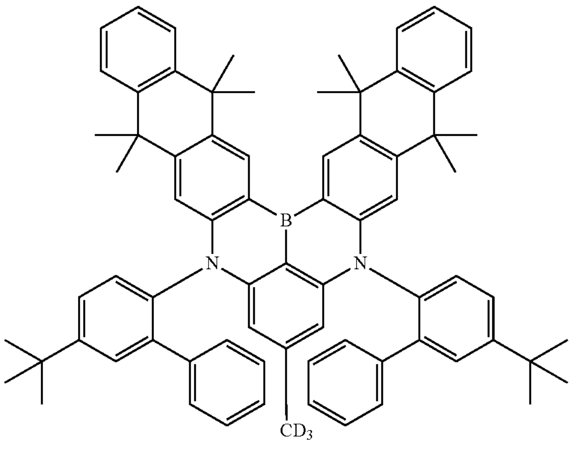
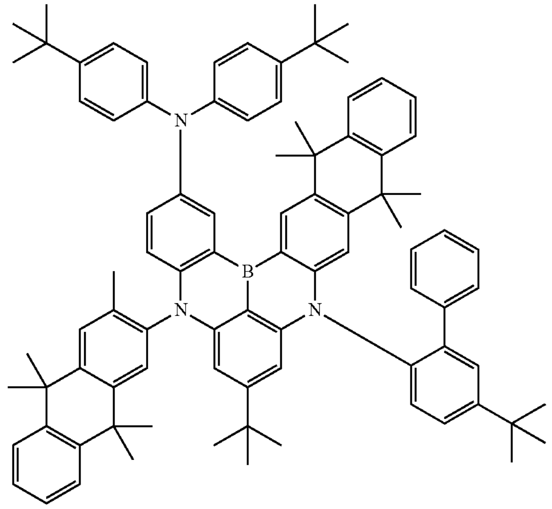

-continued
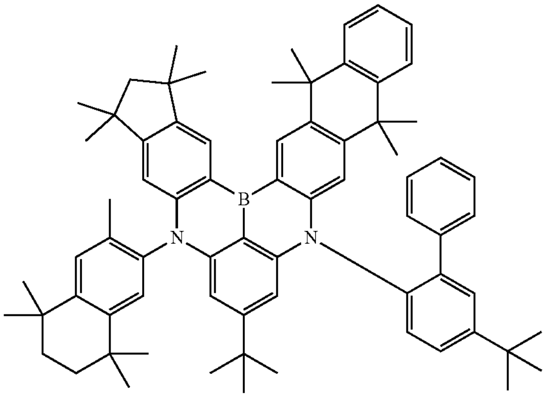
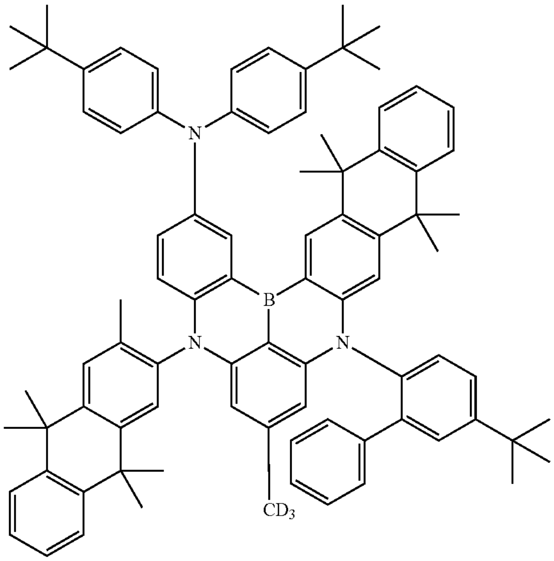
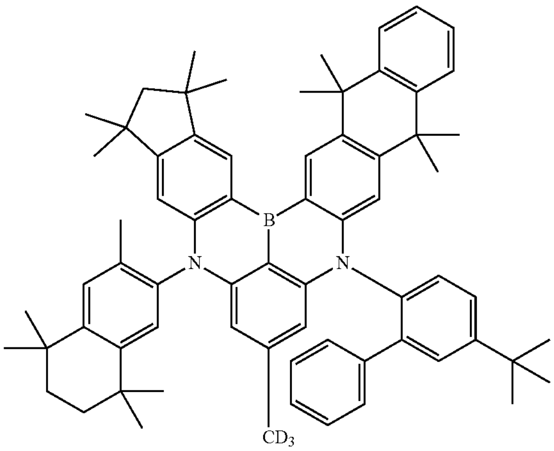
-continued
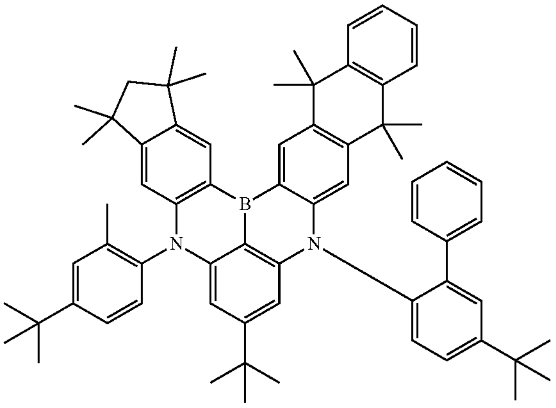
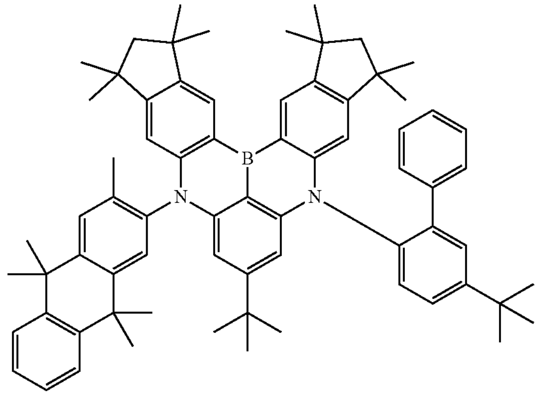
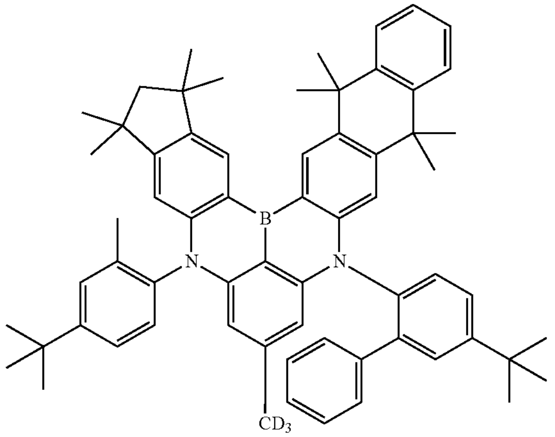
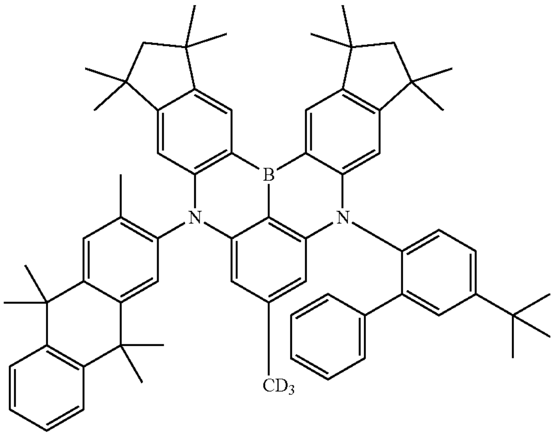

-continued
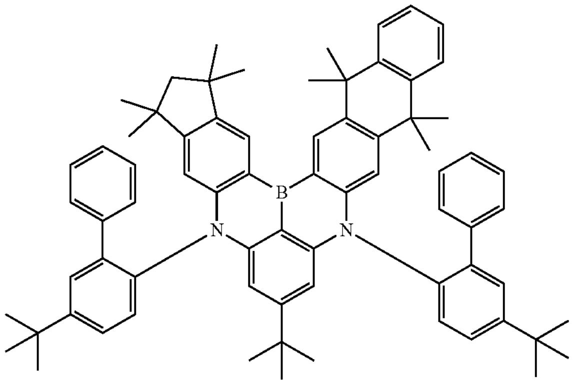
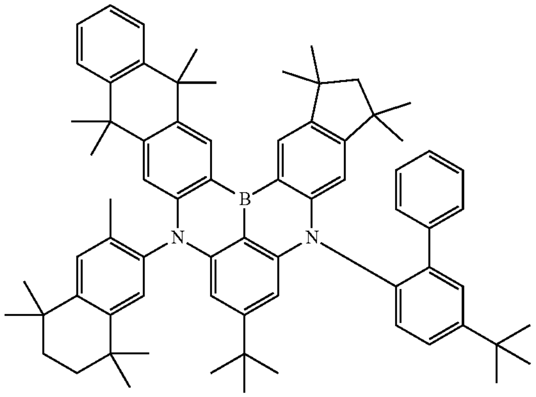
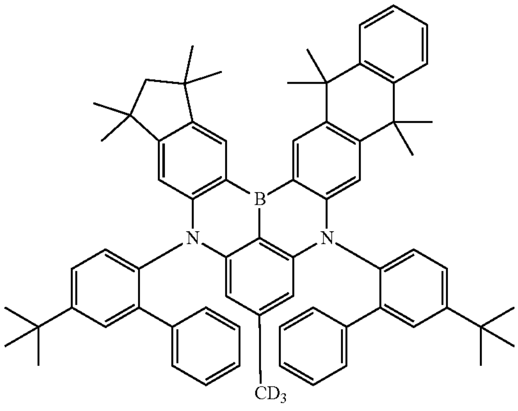
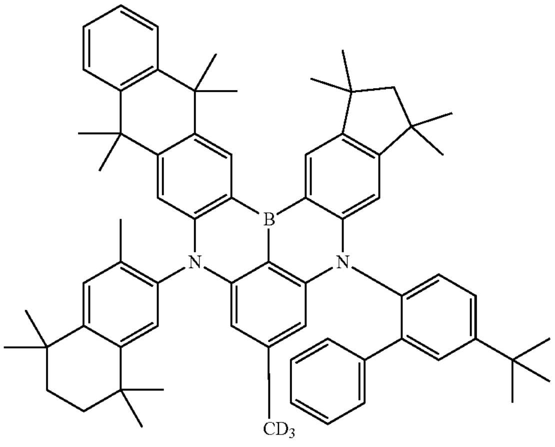
-continued
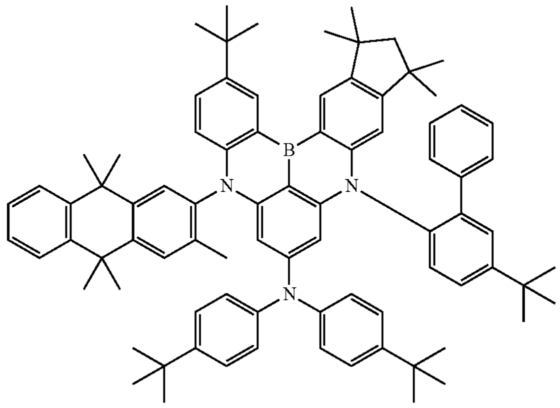
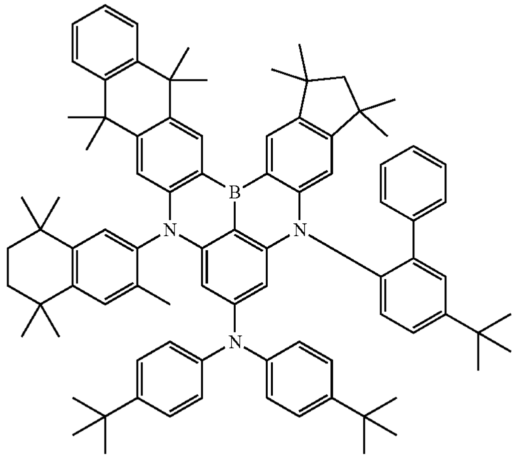
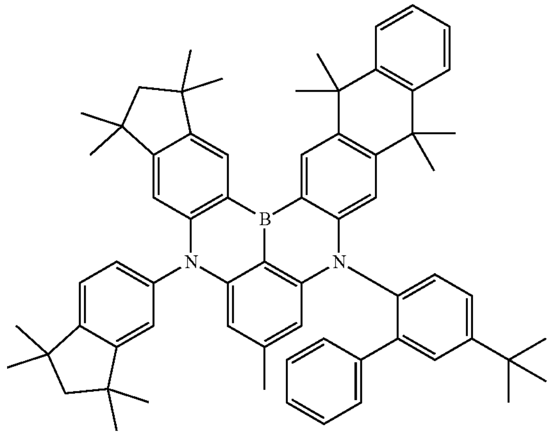

-continued
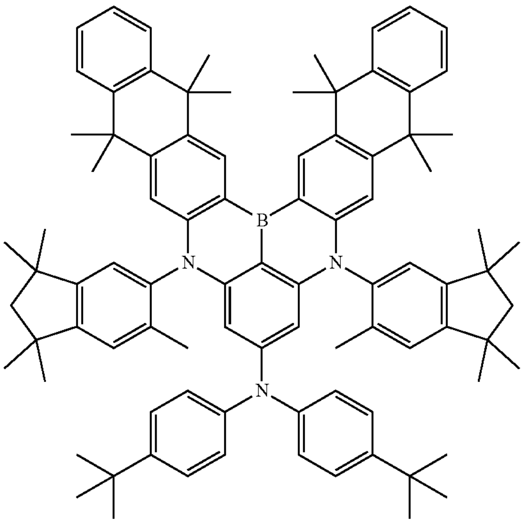
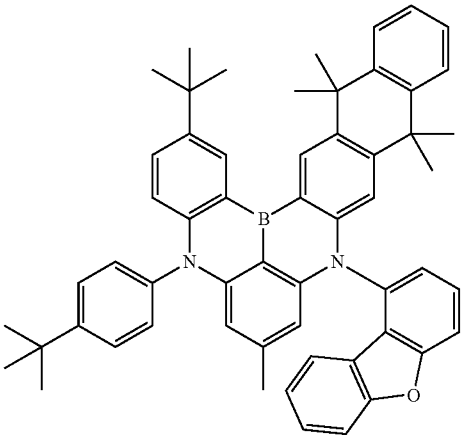
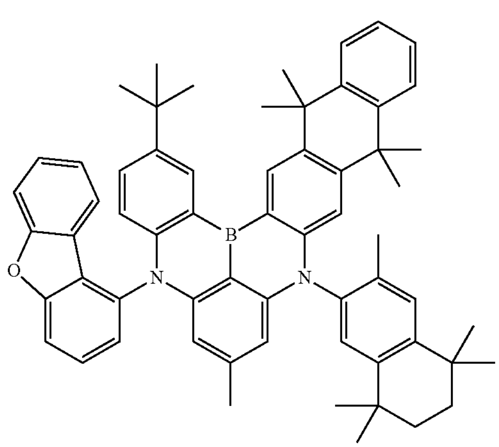
-continued
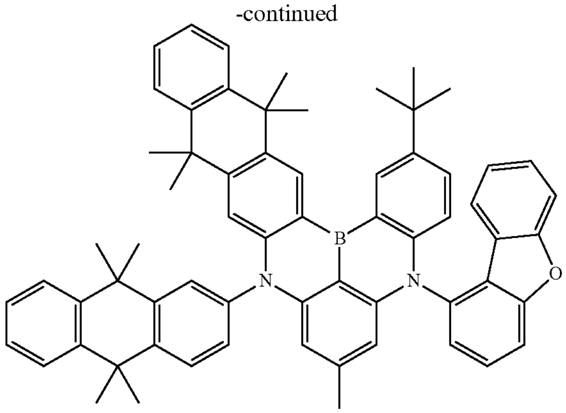
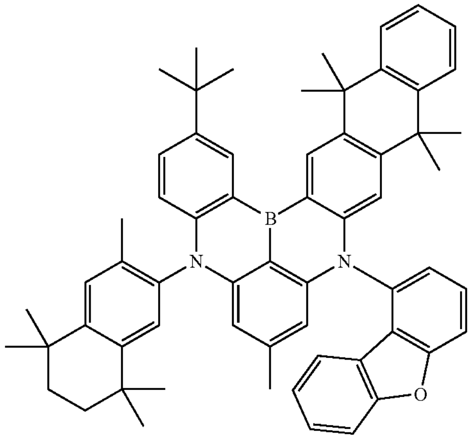
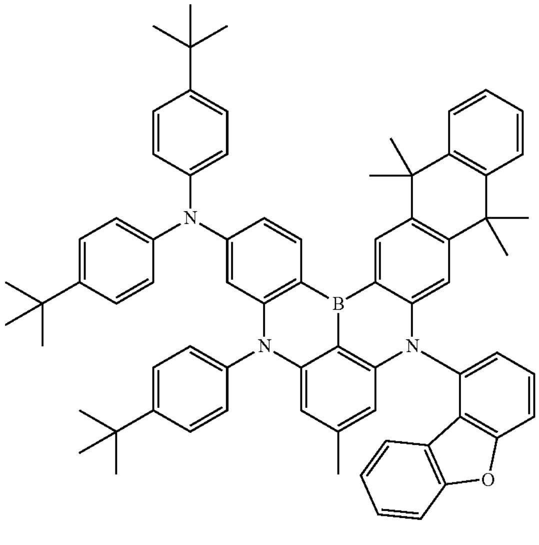

-continued
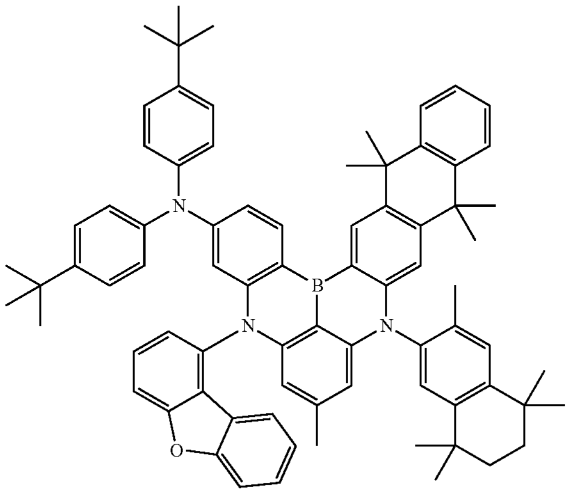
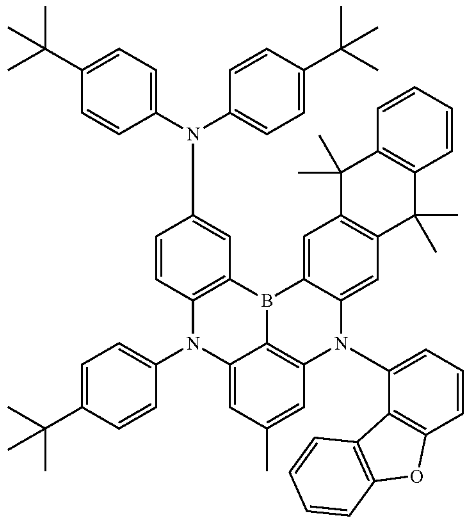
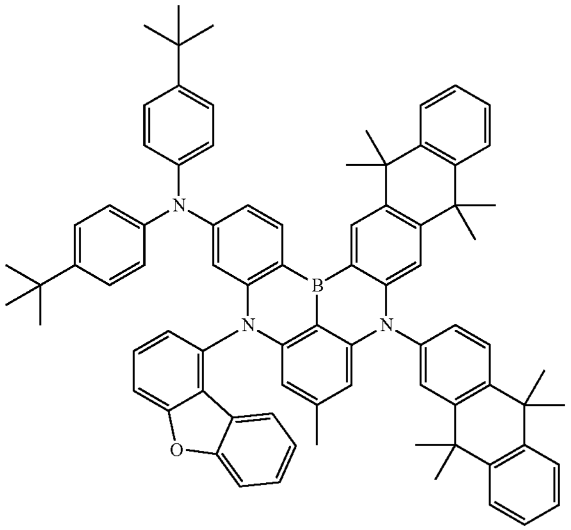
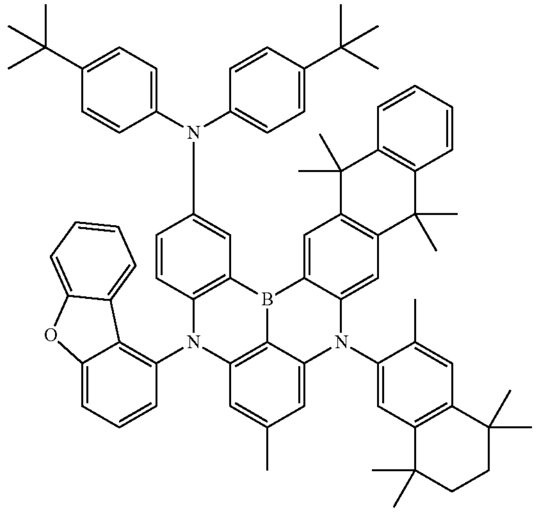
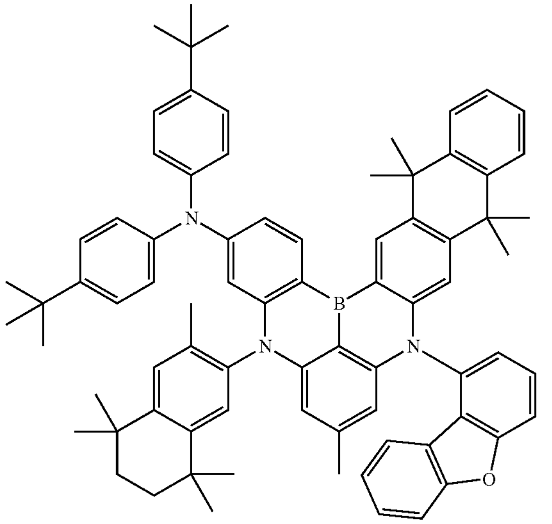
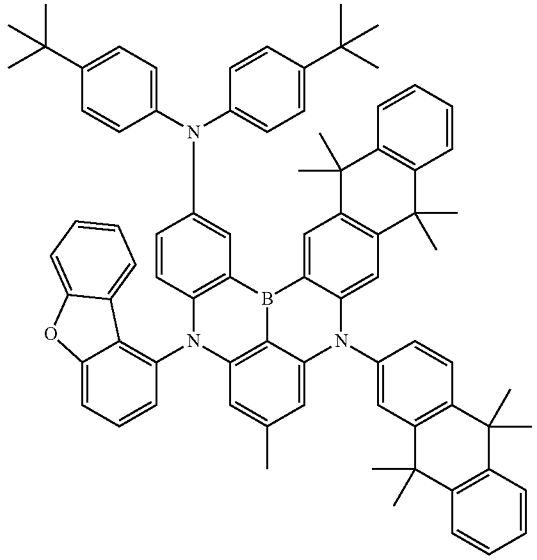

-continued
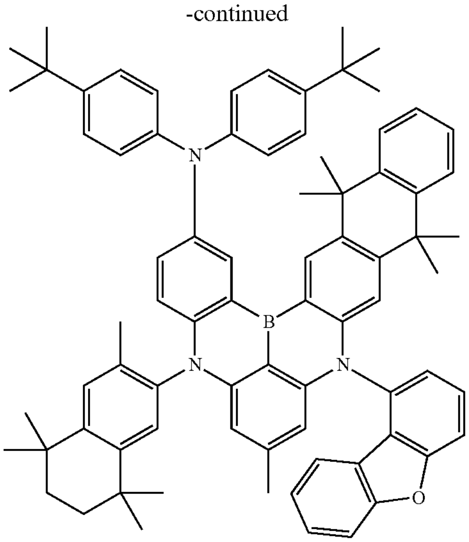
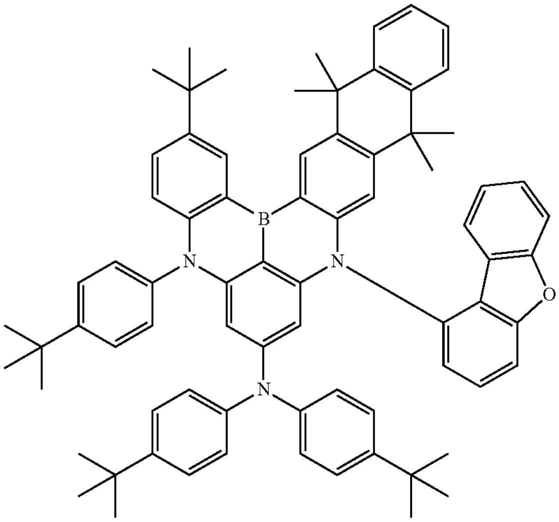
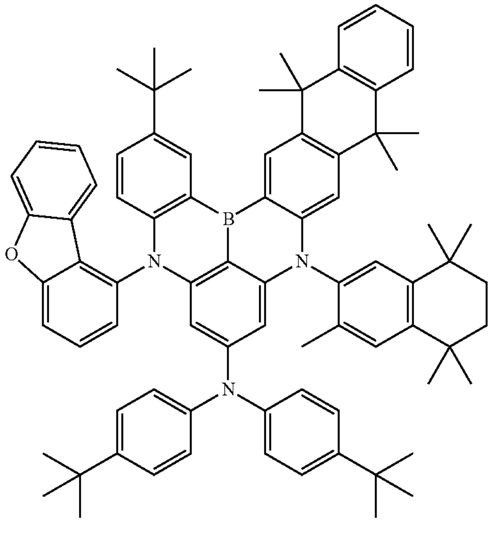
-continued
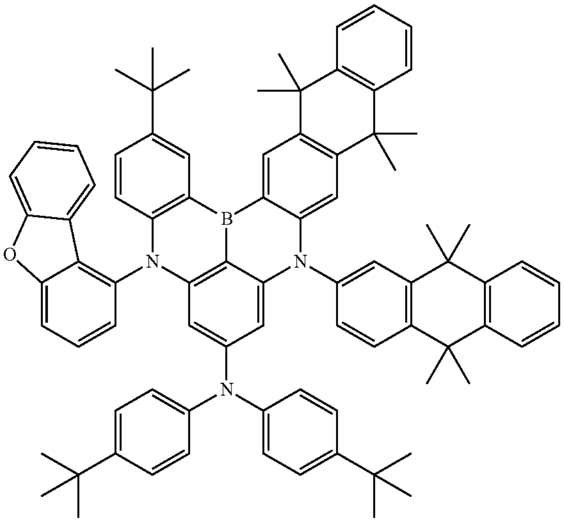
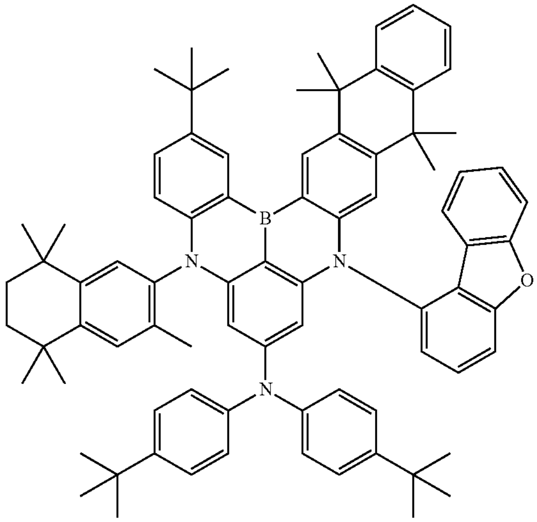
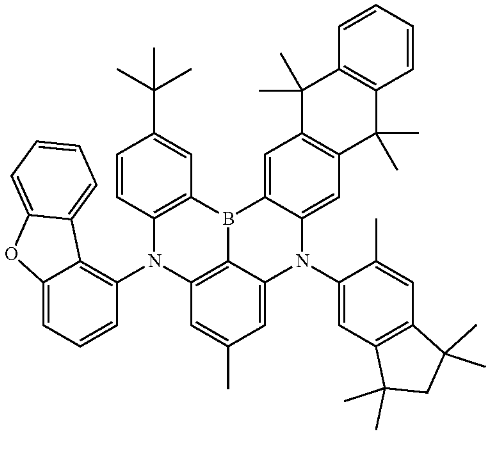

-continued
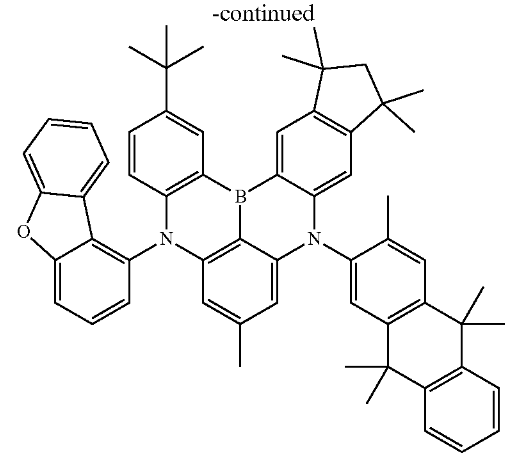
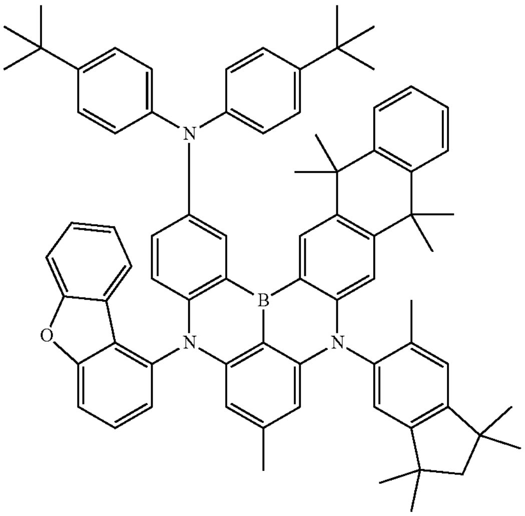
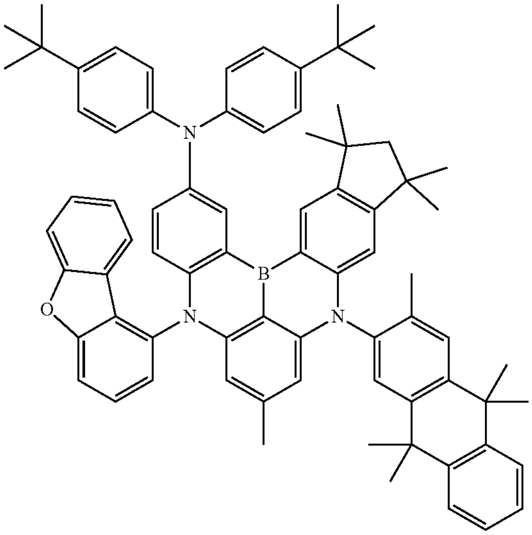
-continued
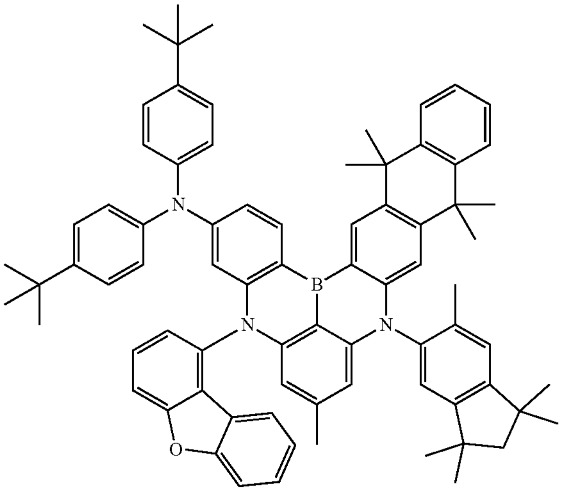
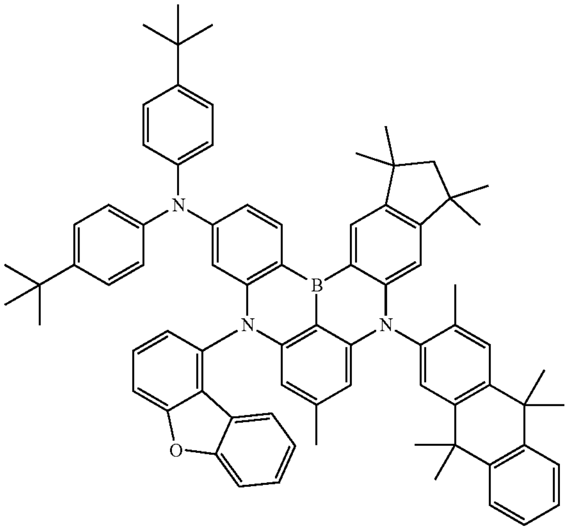
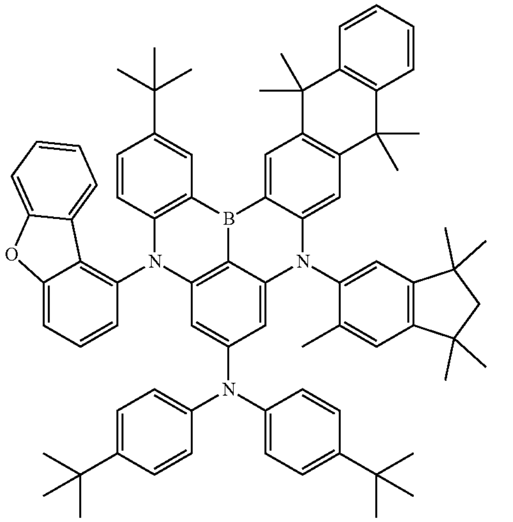

-continued
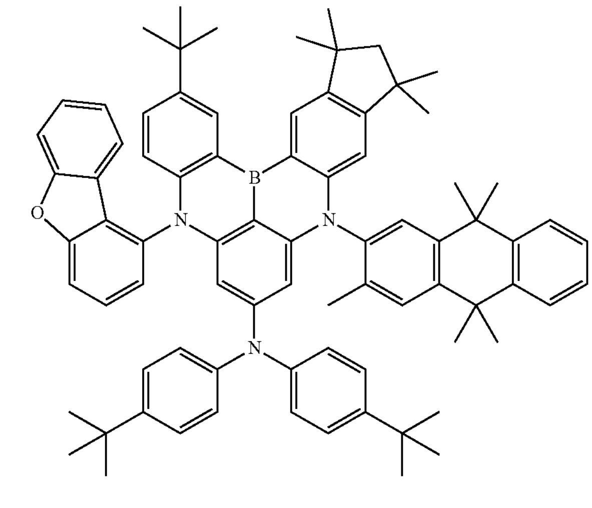
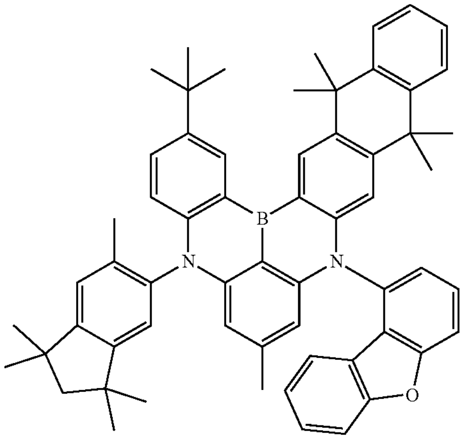
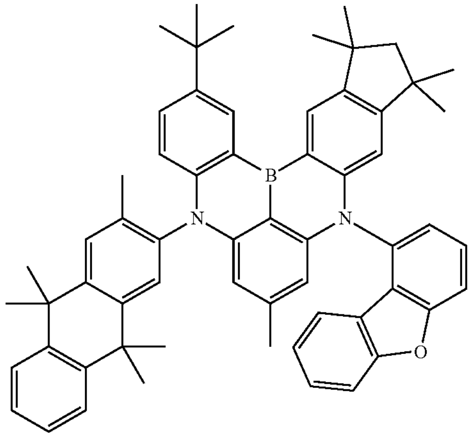
-continued
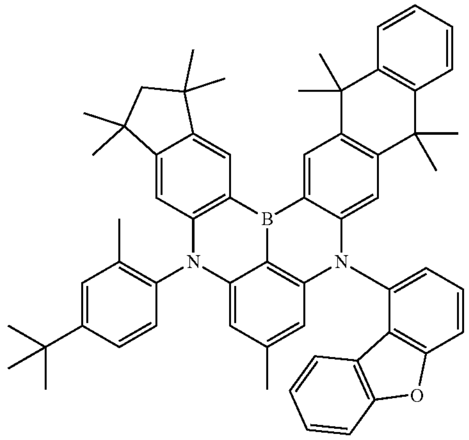
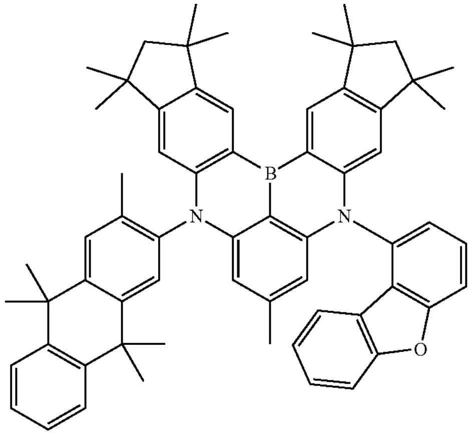
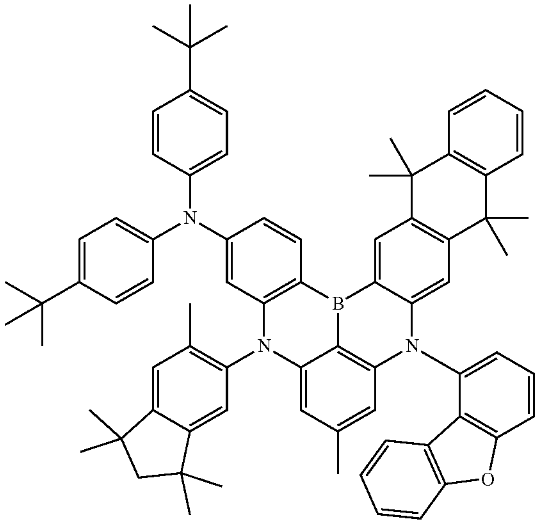

-continued
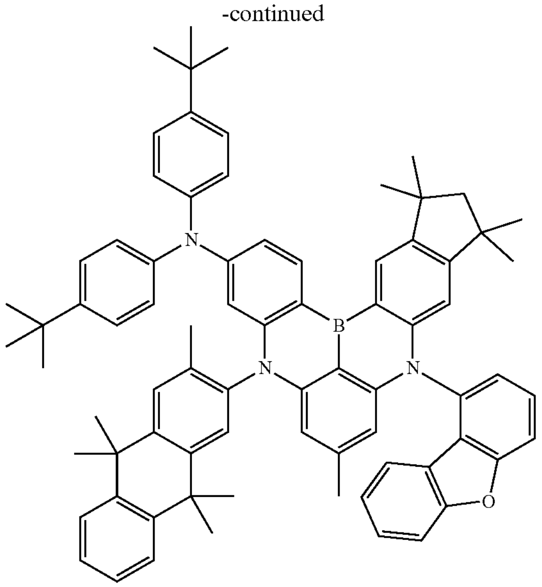
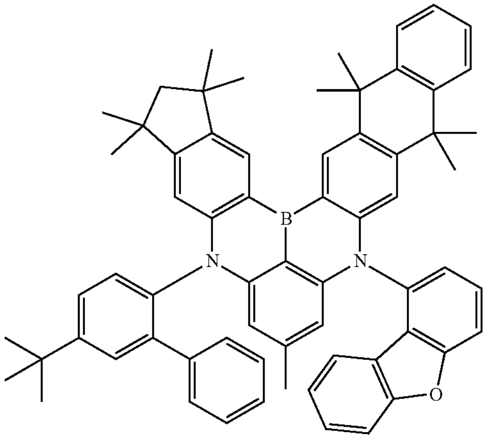
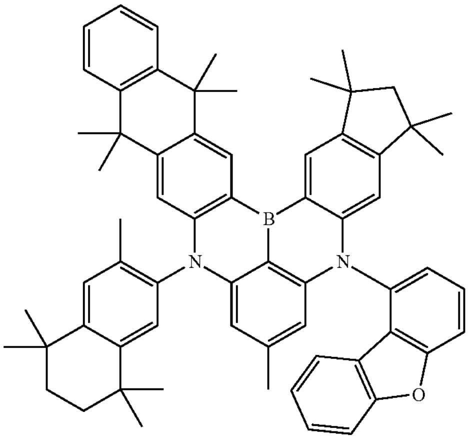
-continued
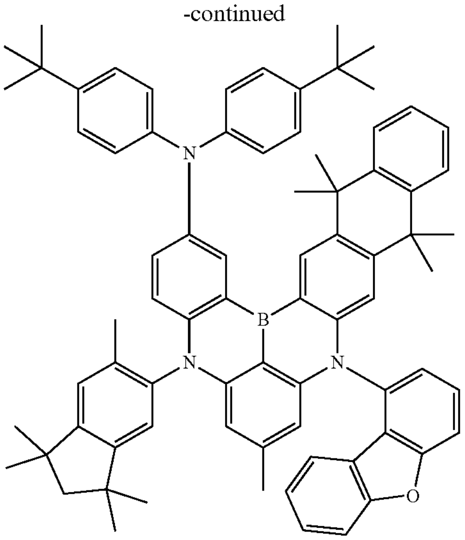
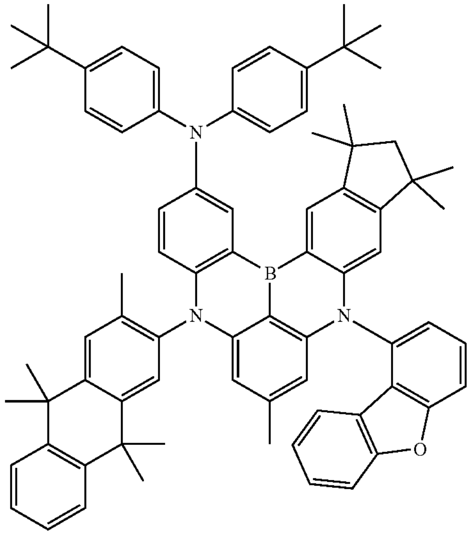
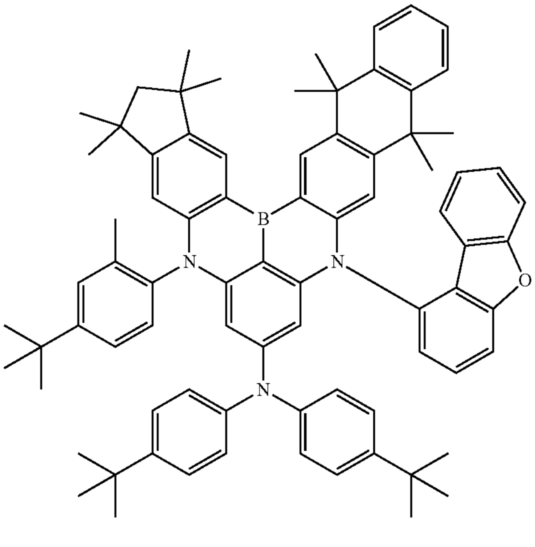

-continued
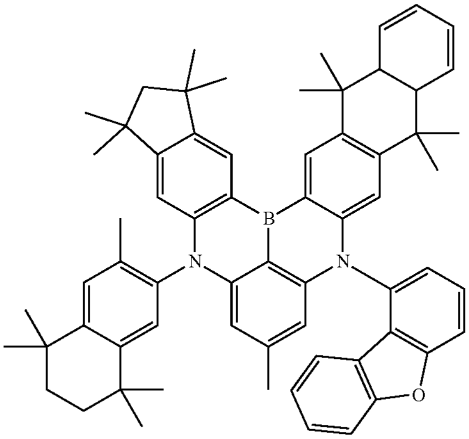
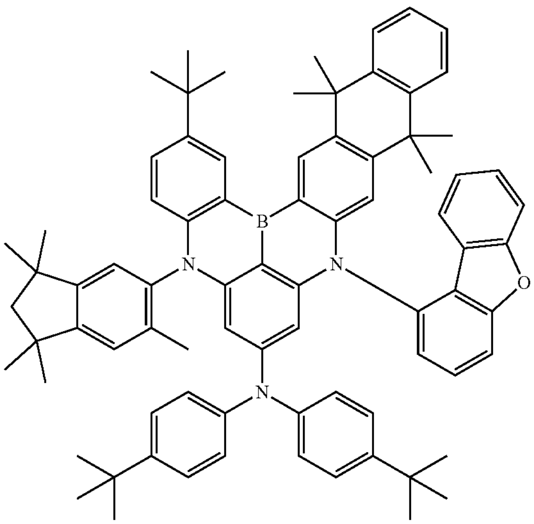
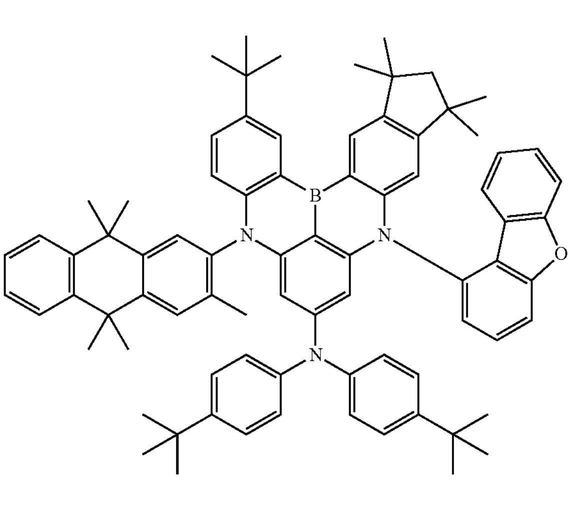
-continued
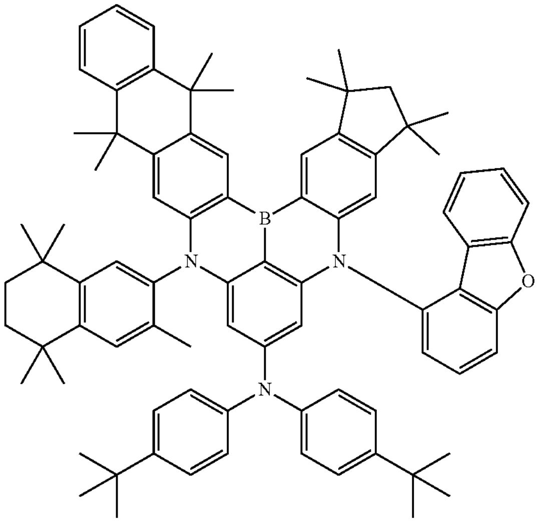
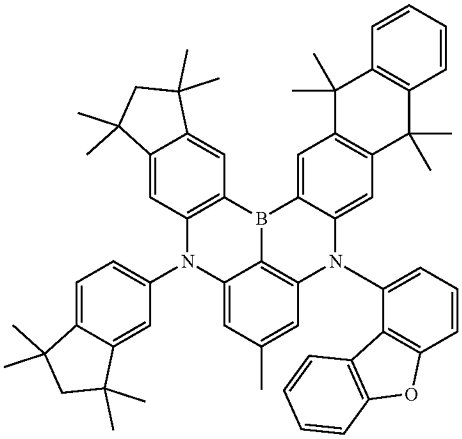
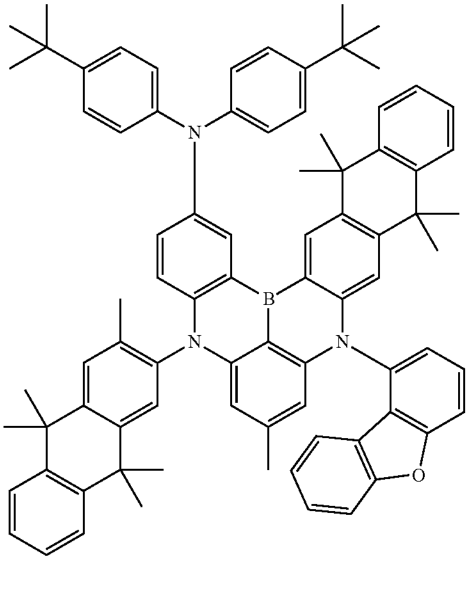

-continued
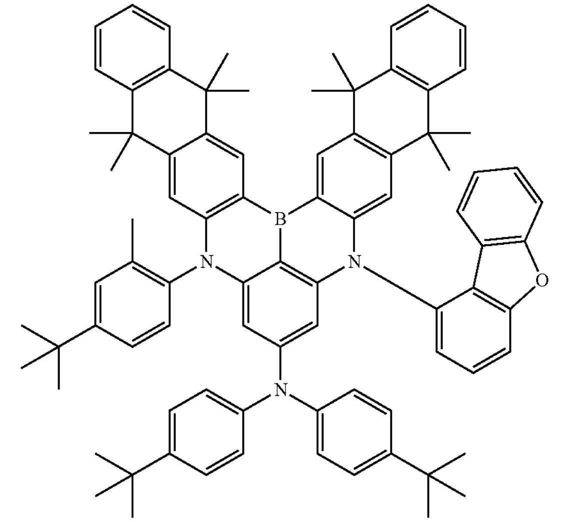
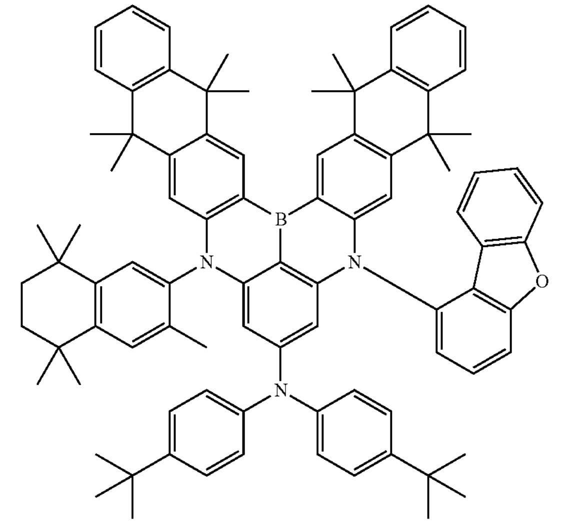
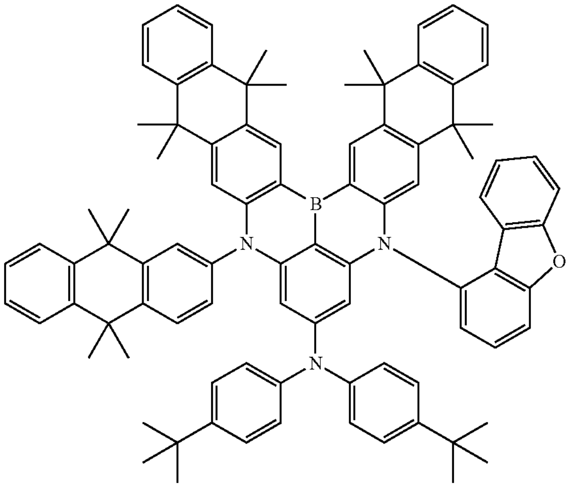
-continued
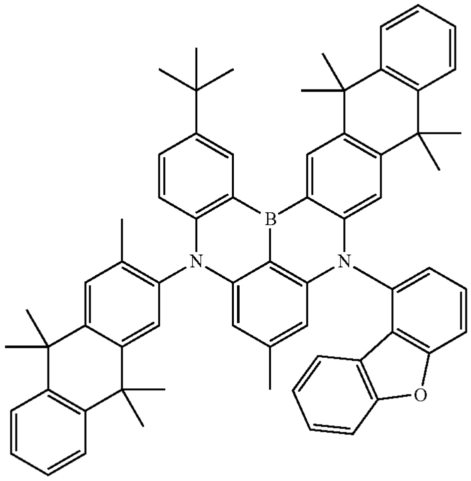
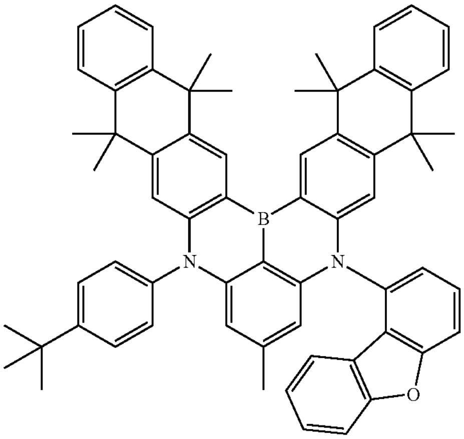
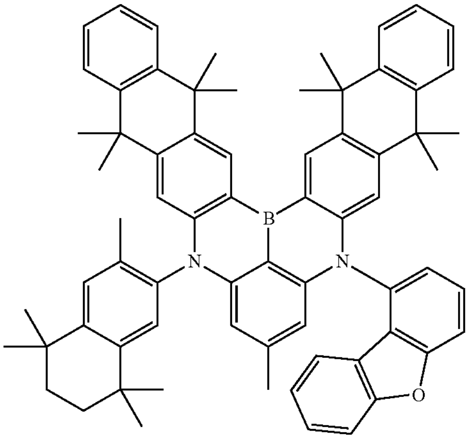

-continued
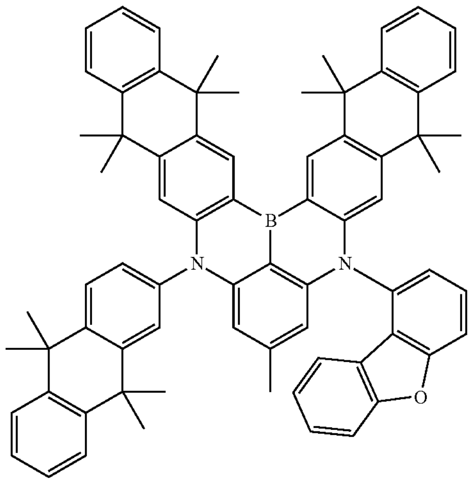
-continued
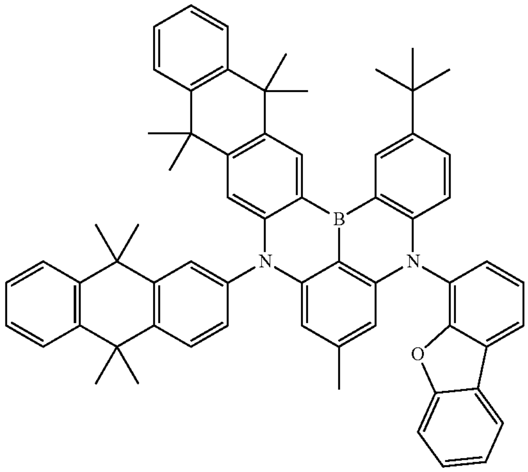
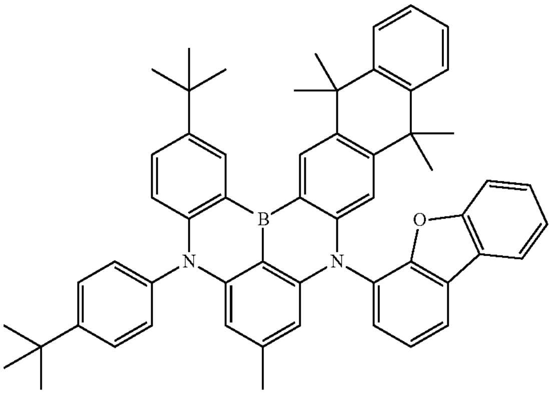
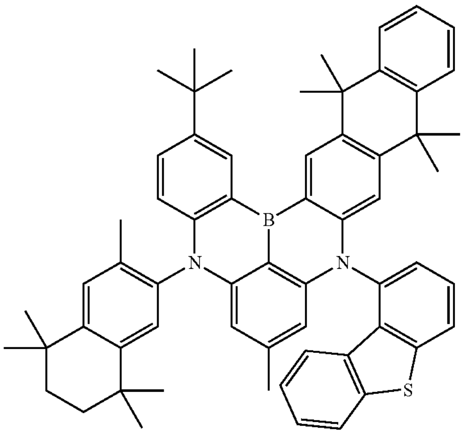
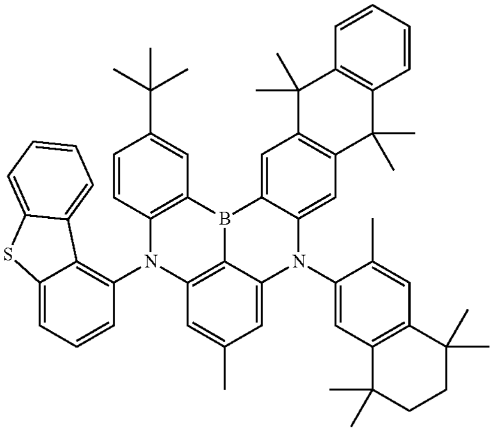
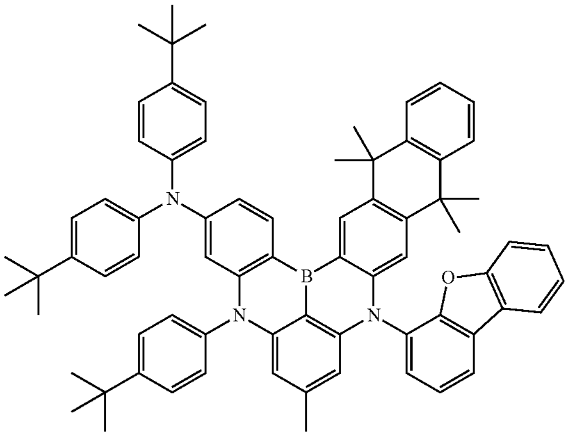

-continued
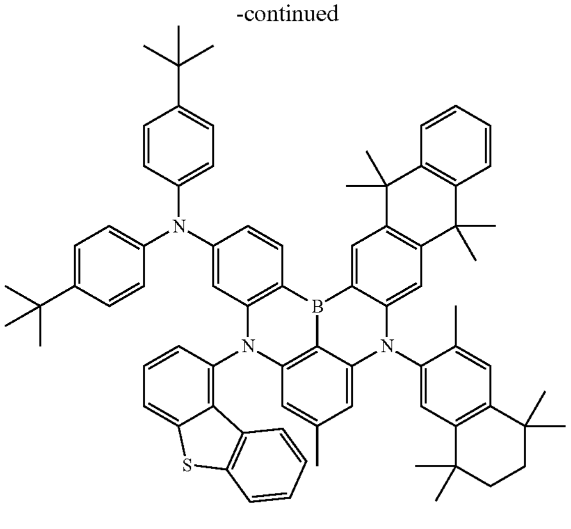
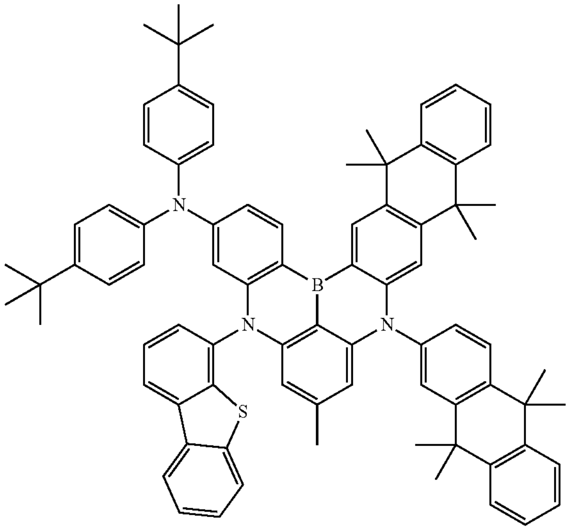
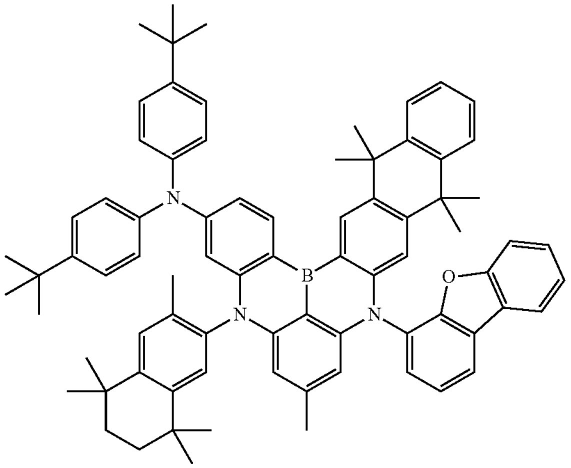
-continued
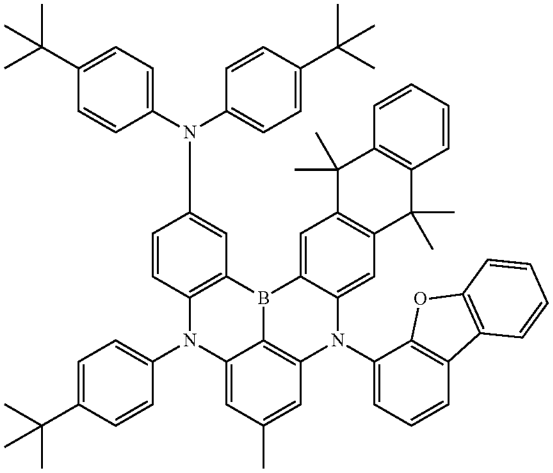
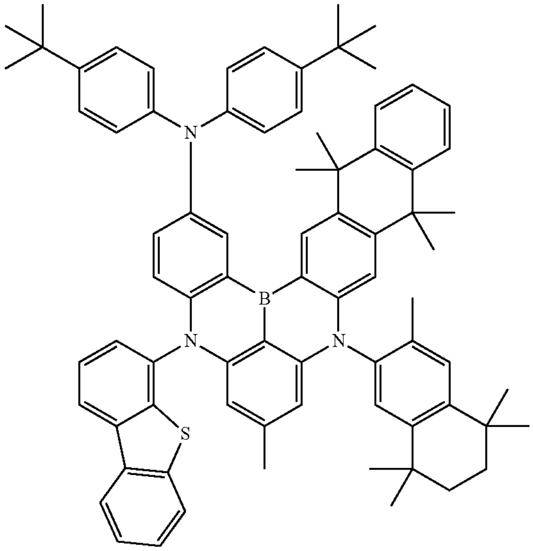
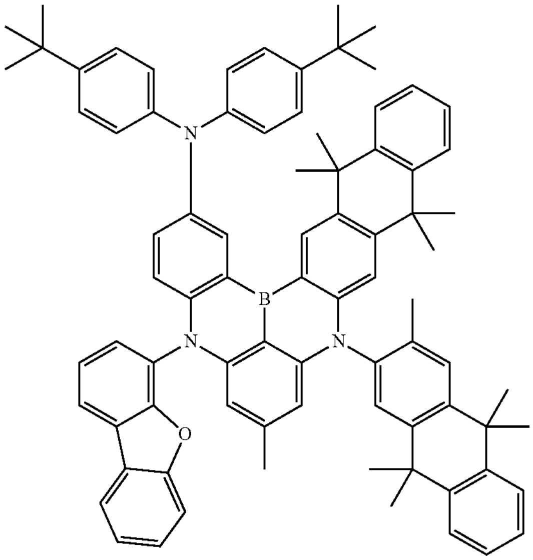

-continued
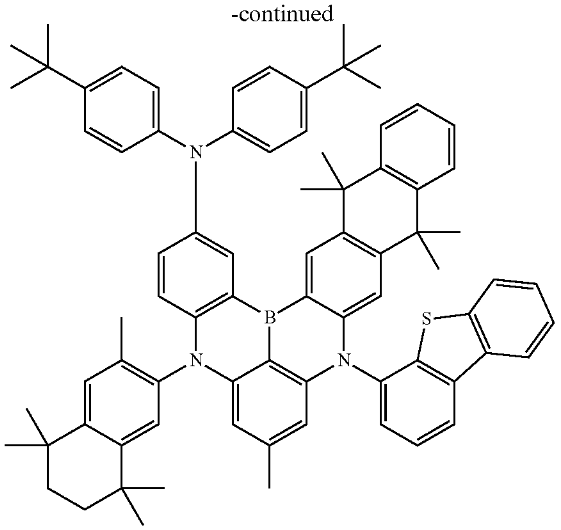
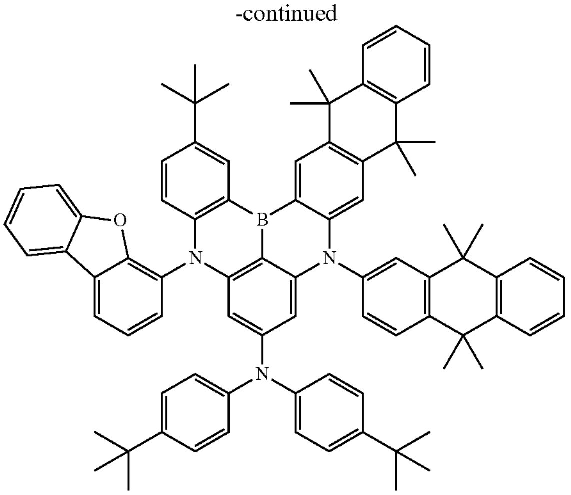
-continued
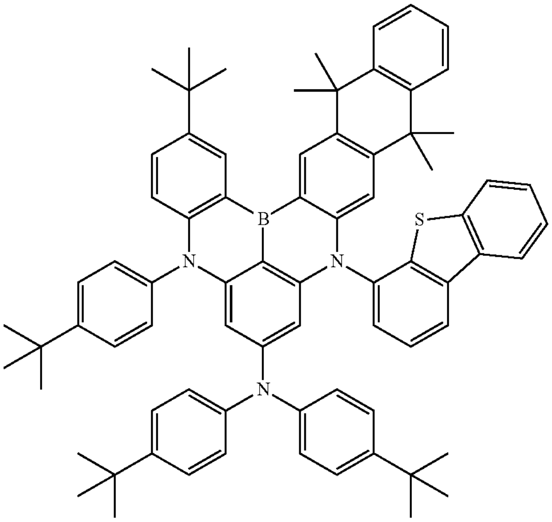
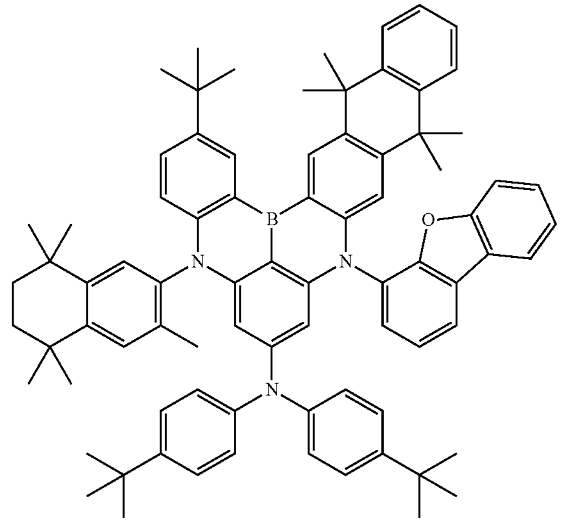
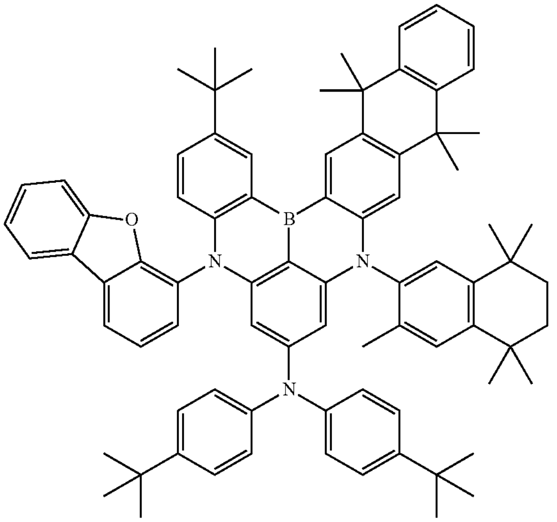
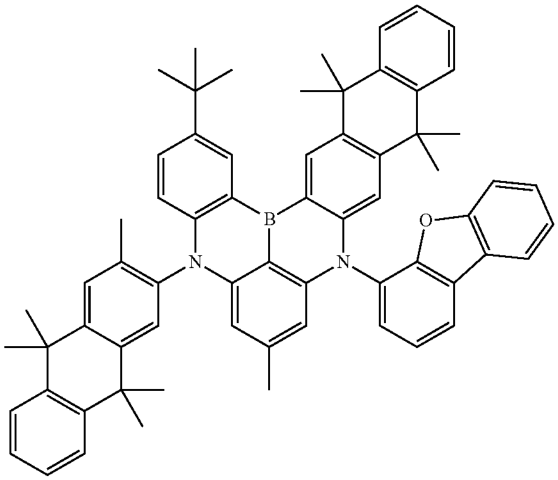

-continued
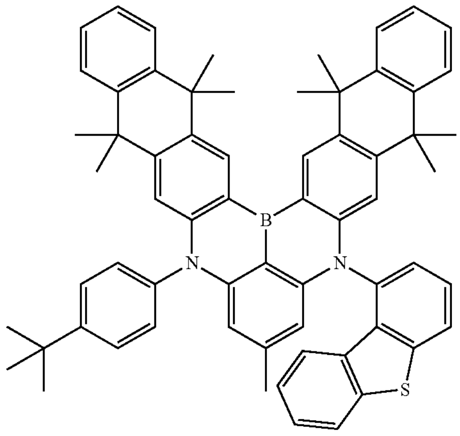
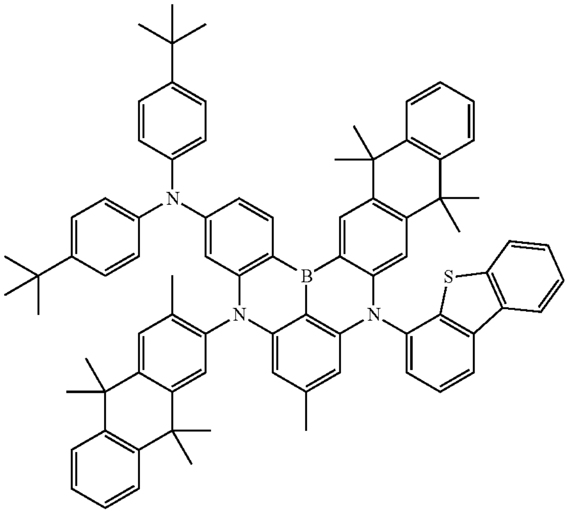
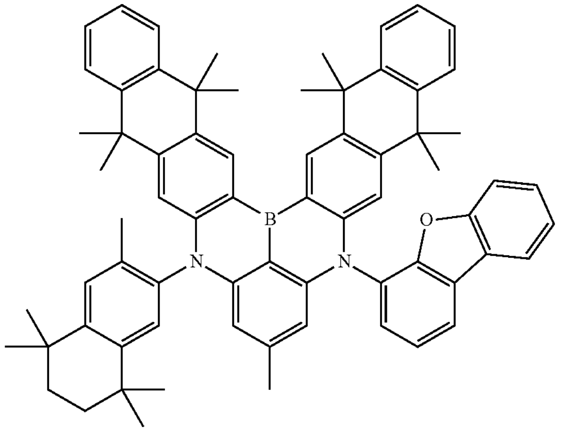
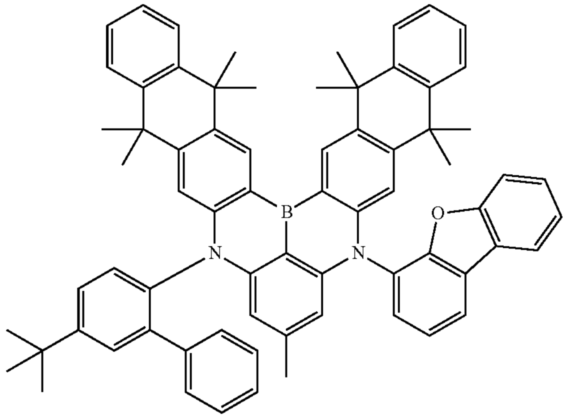
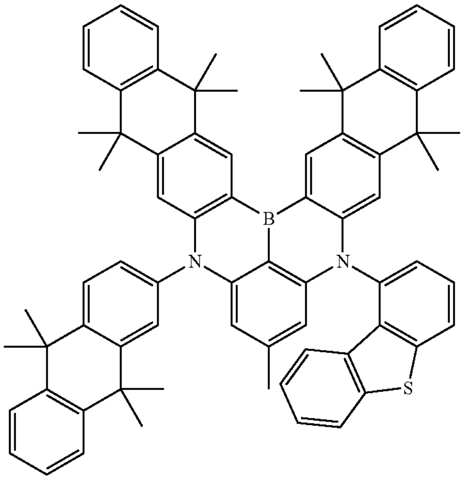
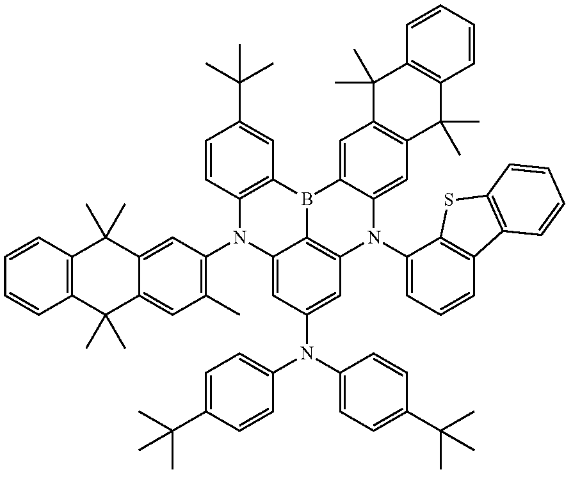

-continued
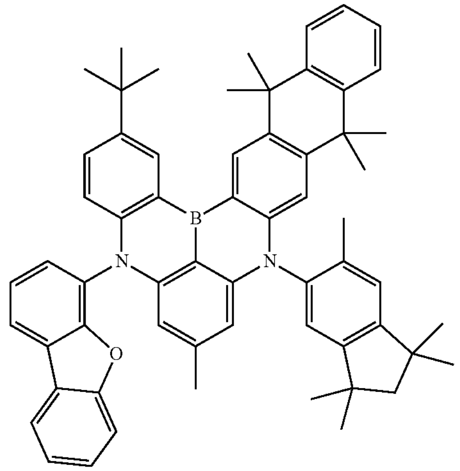
-continued
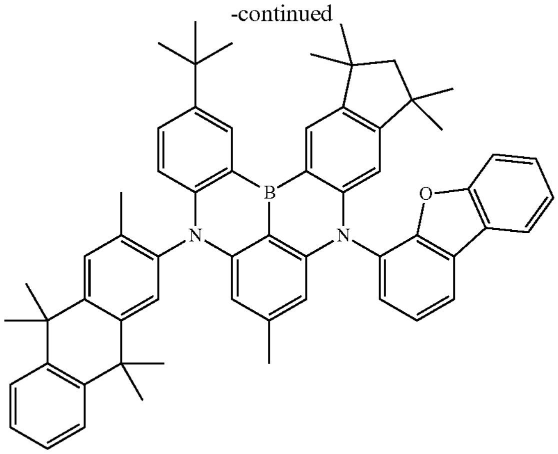
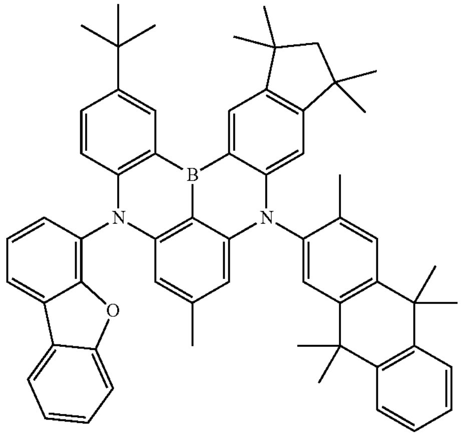
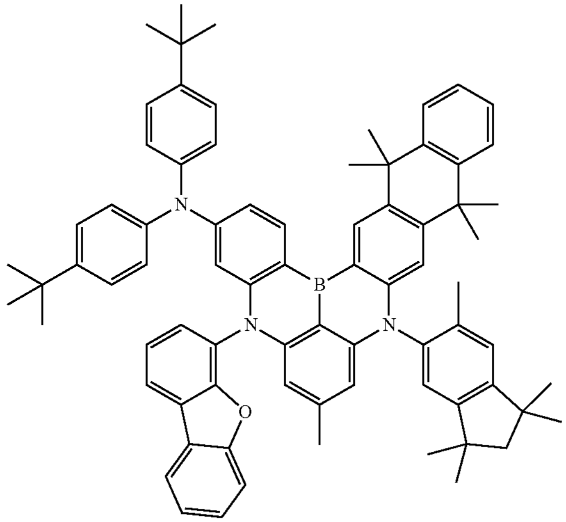
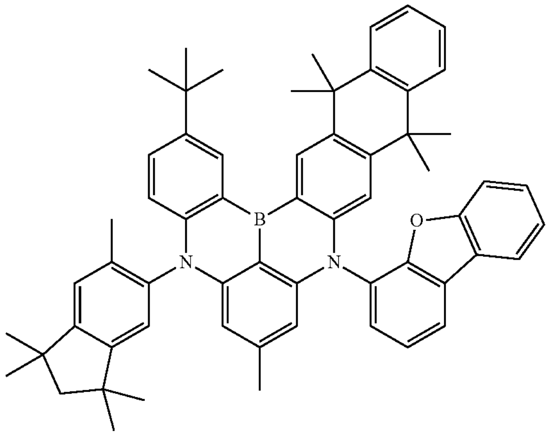
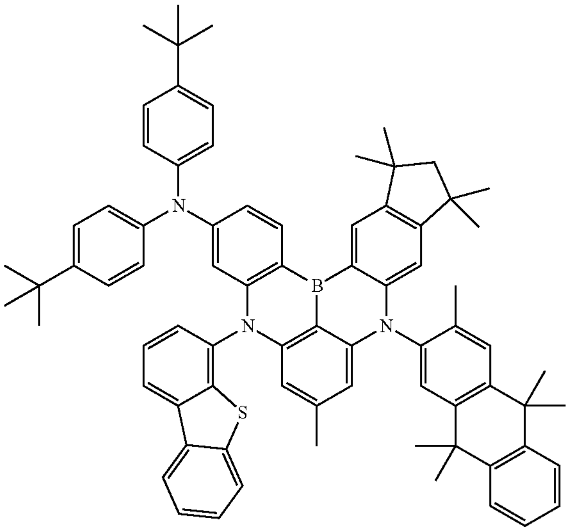

-continued
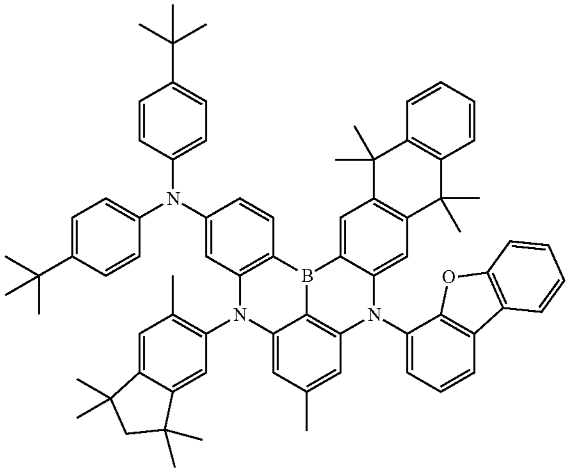
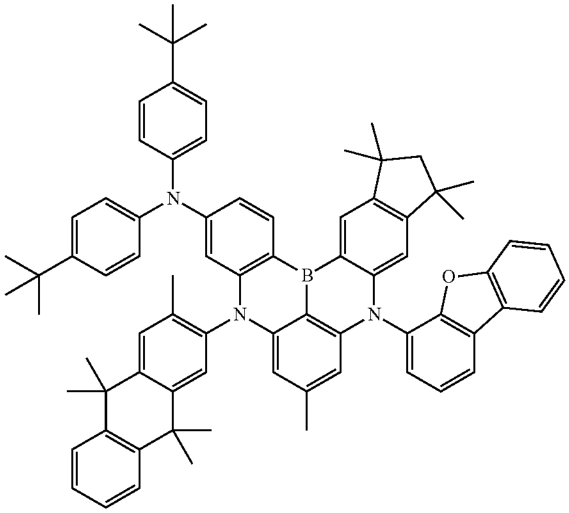
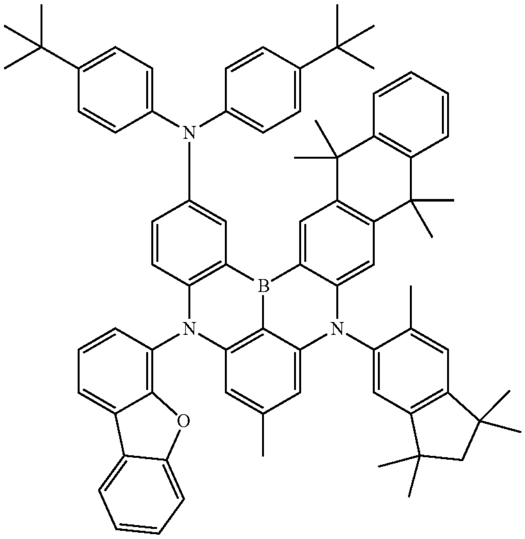
-continued
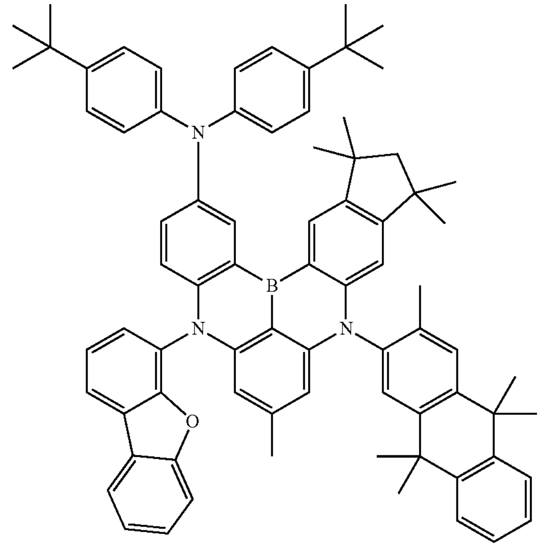
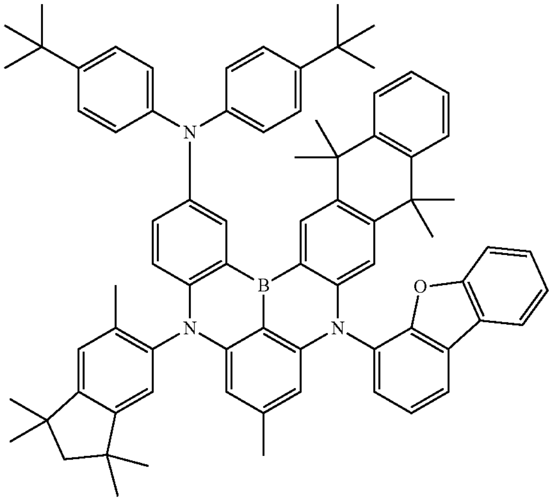
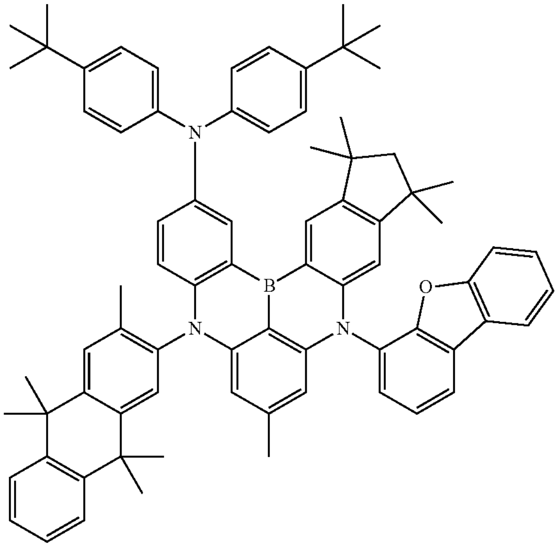

-continued
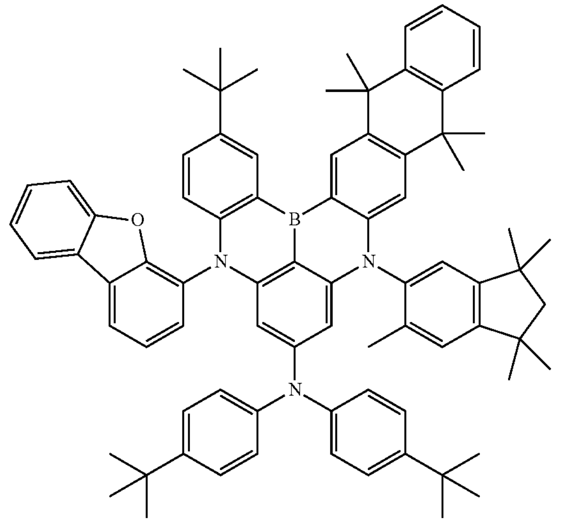
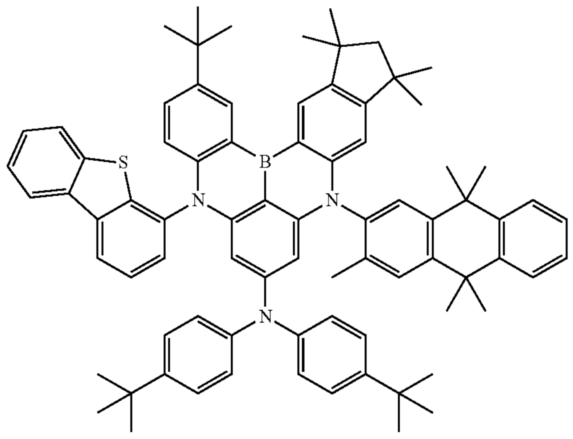
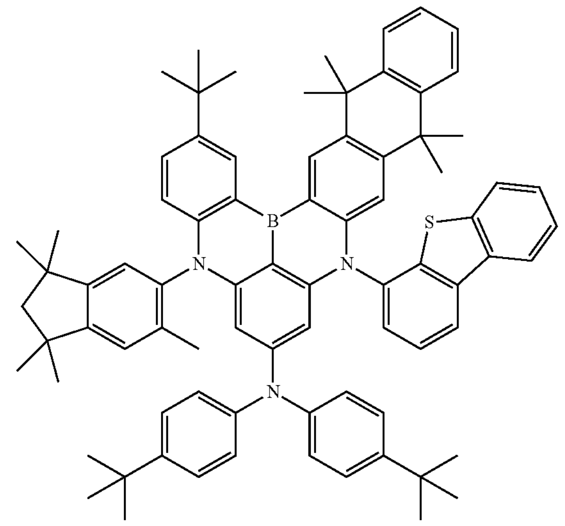
-continued
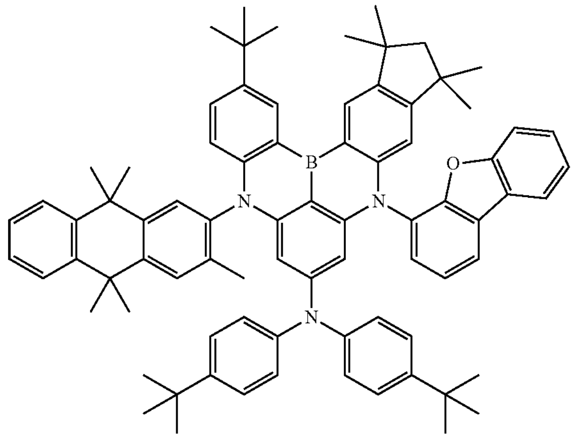
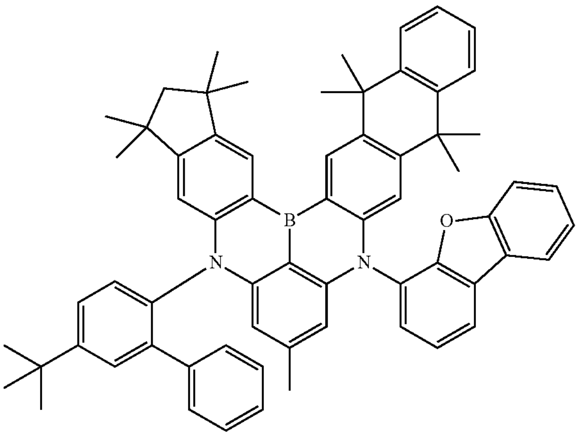
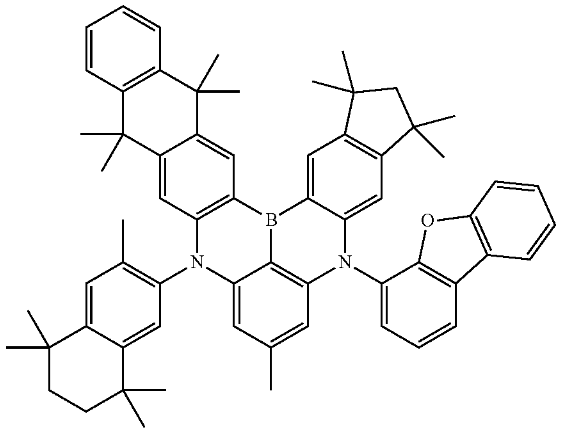

-continued
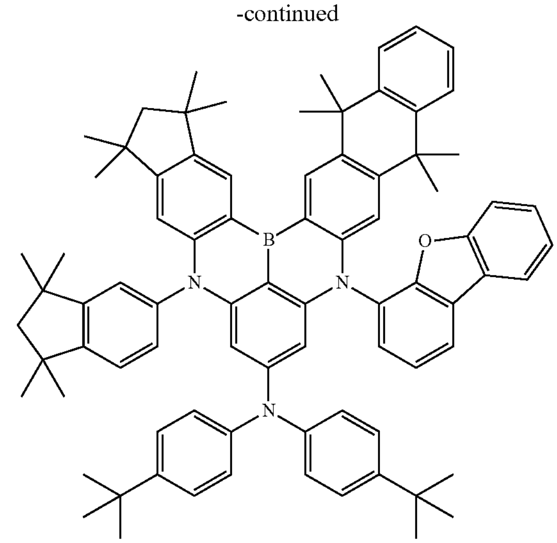
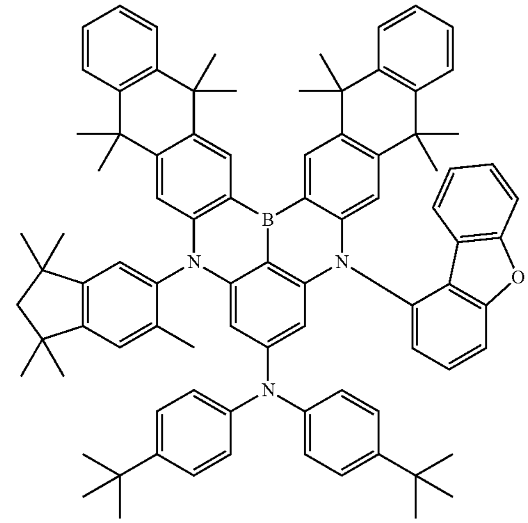
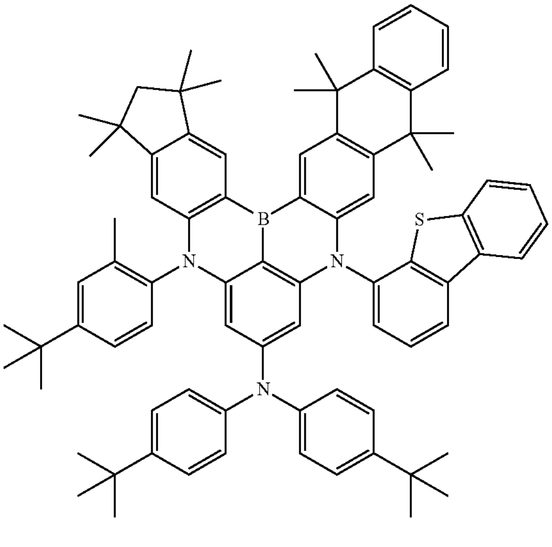
-continued
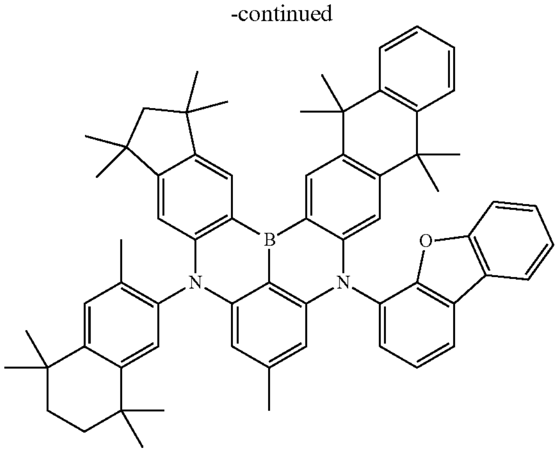
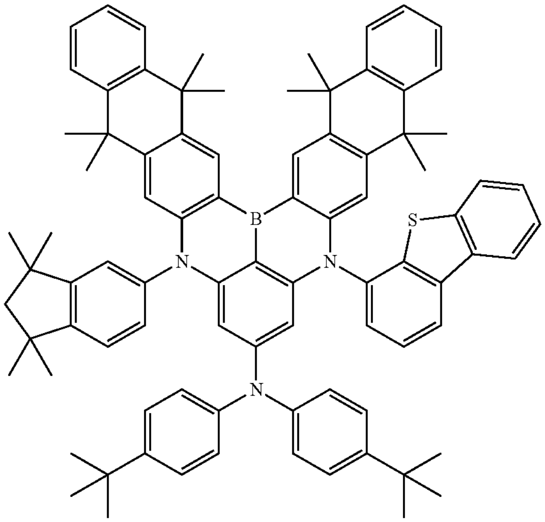
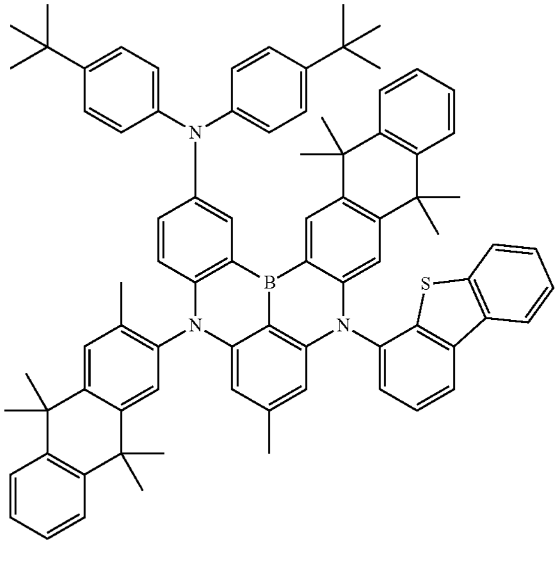

-continued
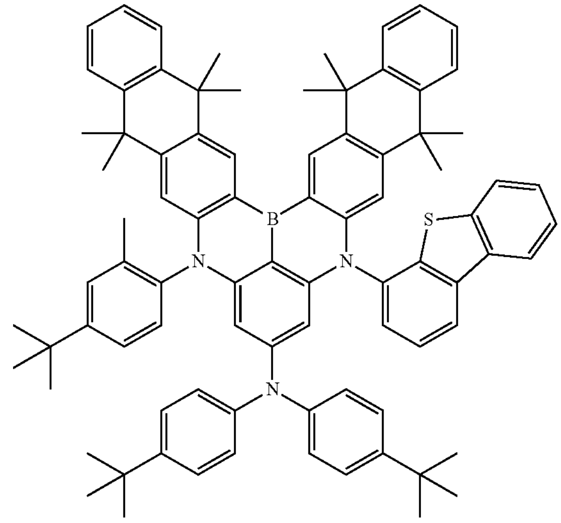
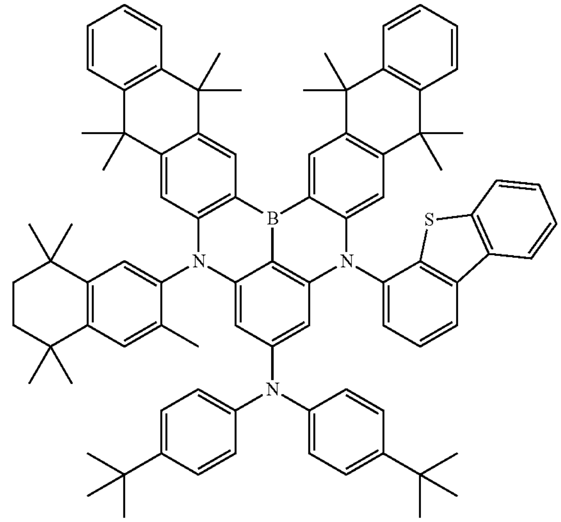
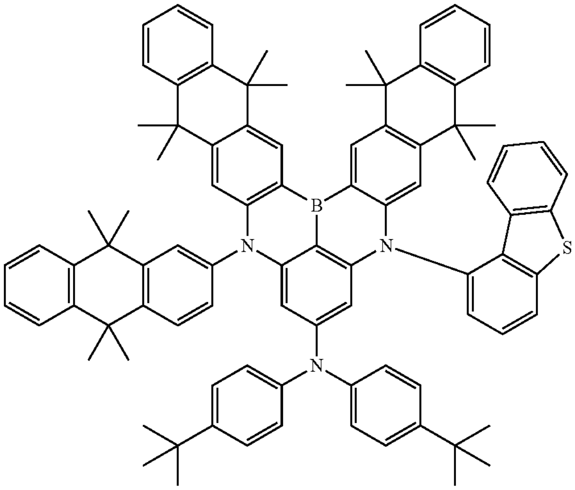
-continued
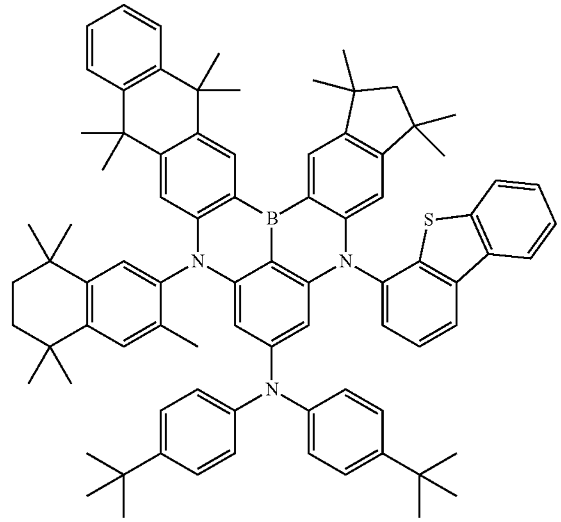
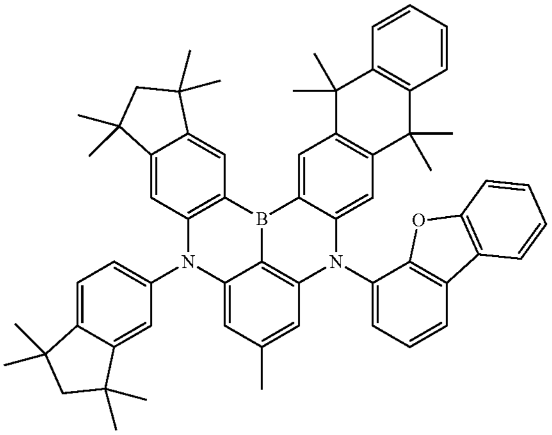
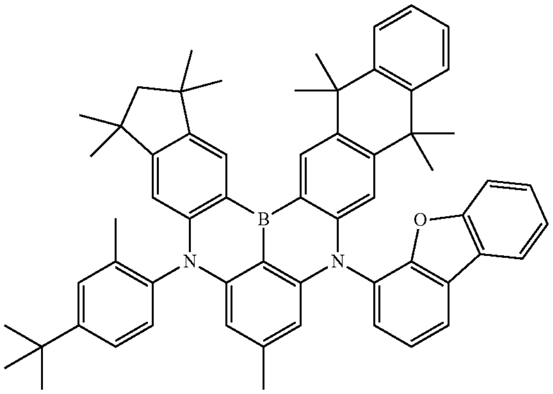

-continued
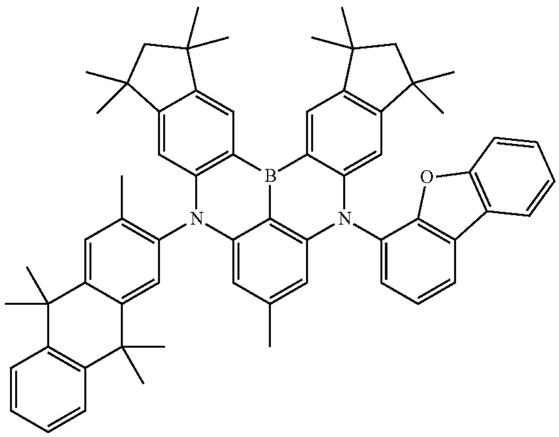
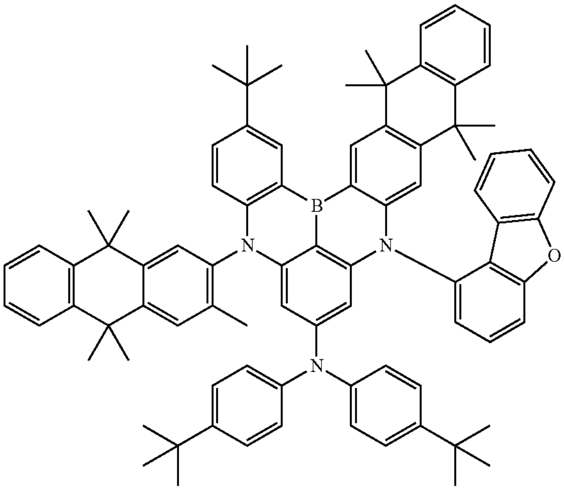
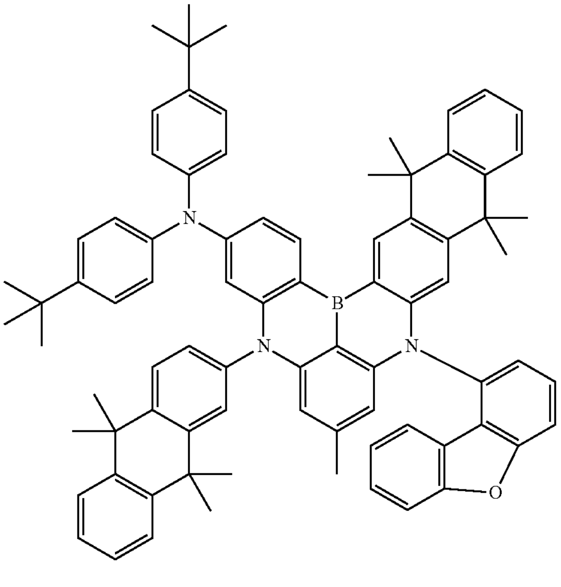
-continued
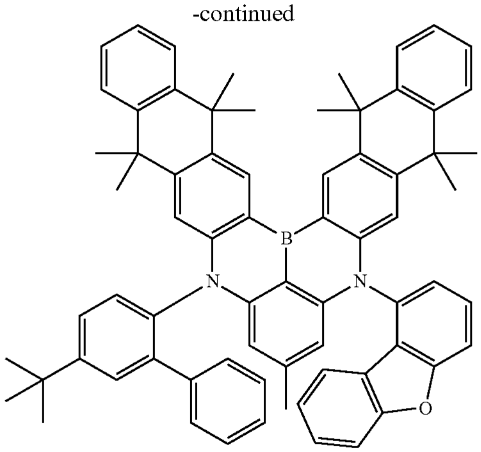
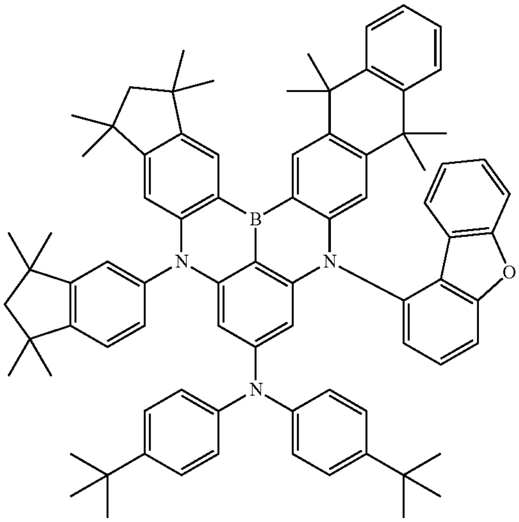
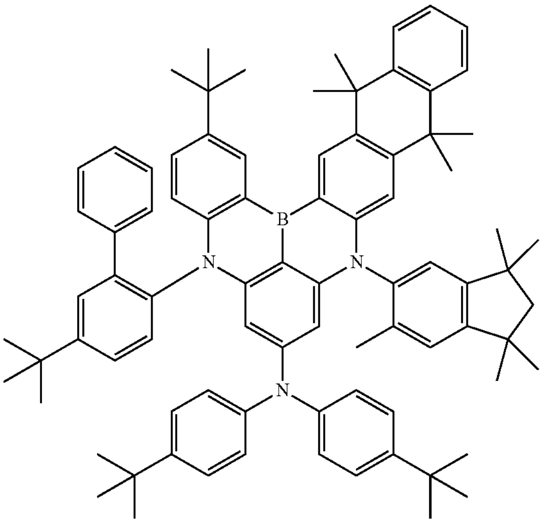

-continued
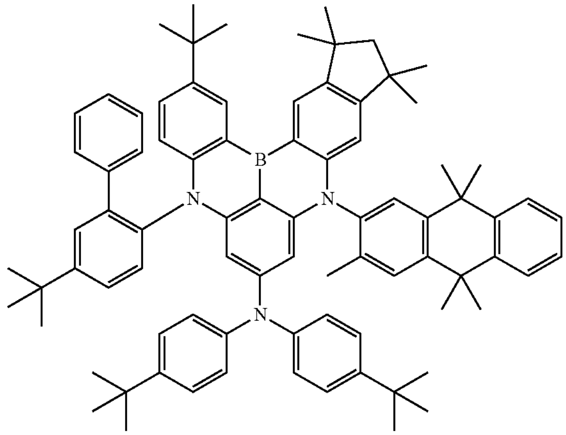
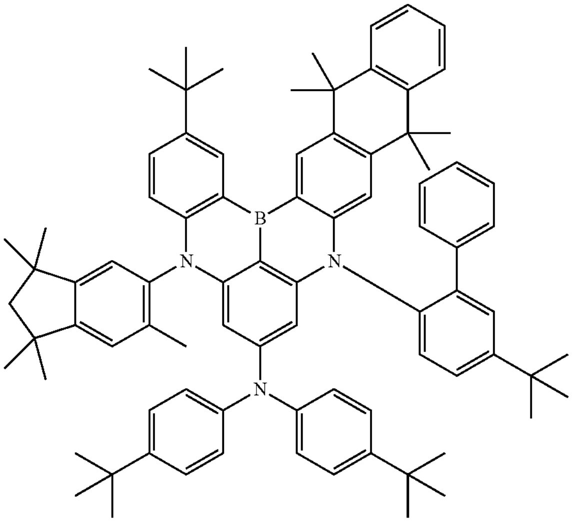
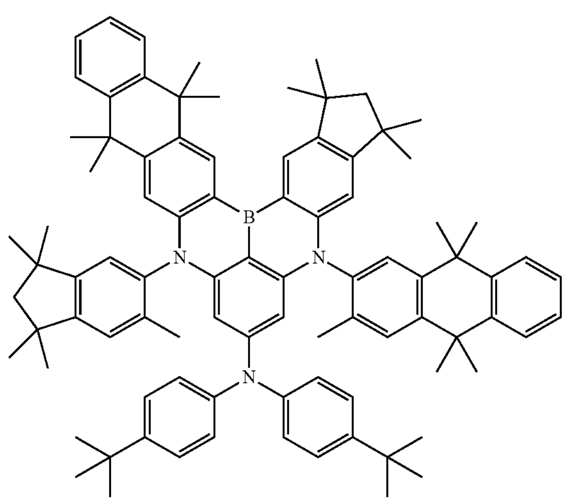
-continued
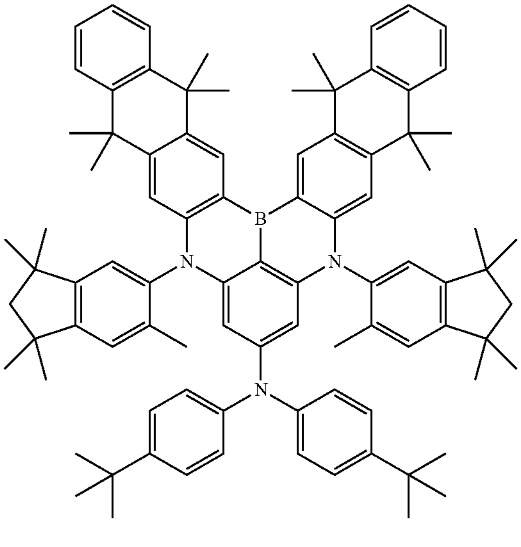
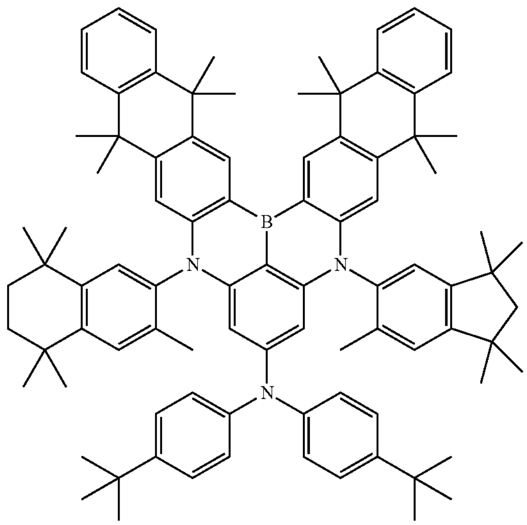
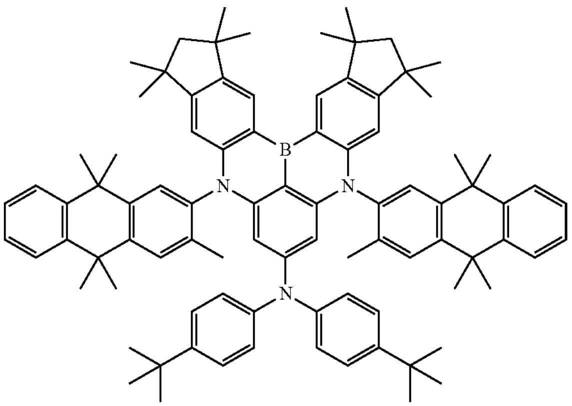

-continued
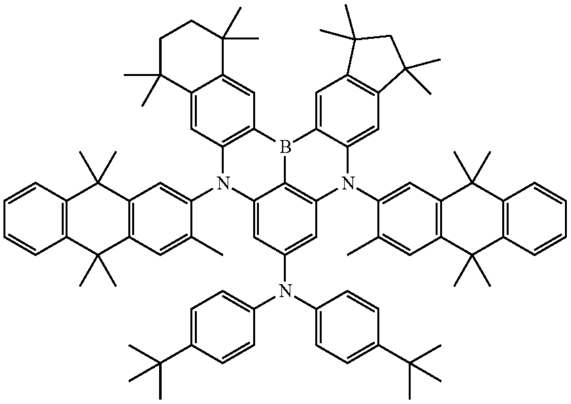
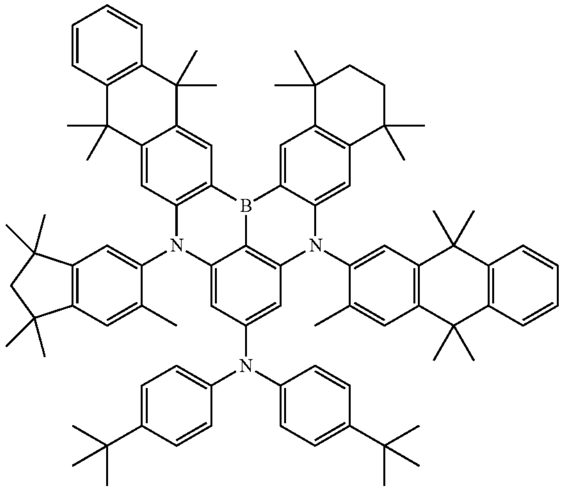
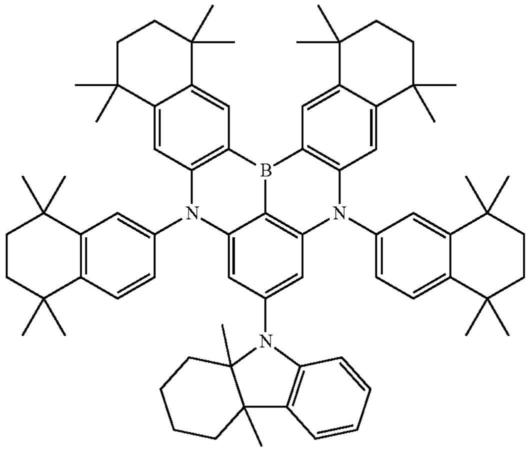
-continued
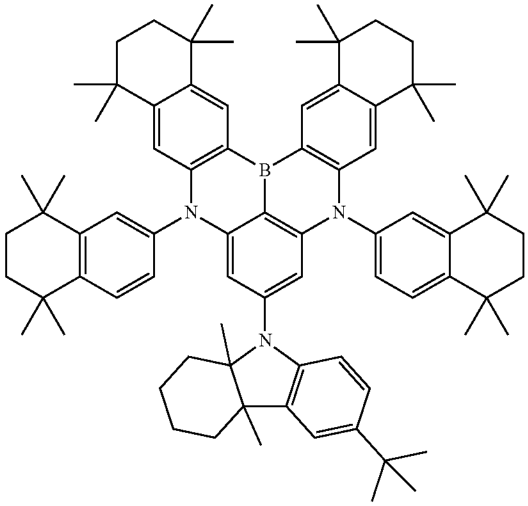
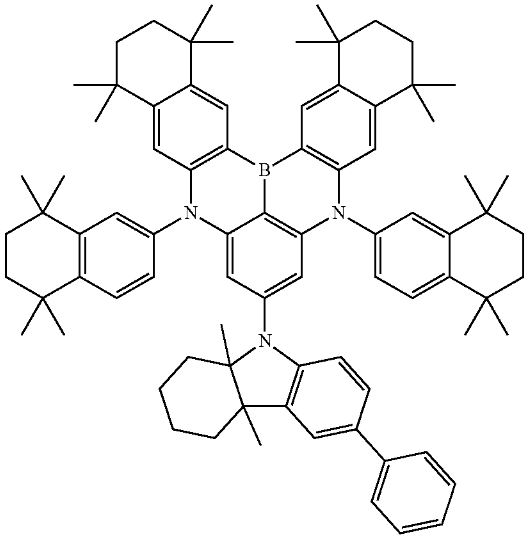
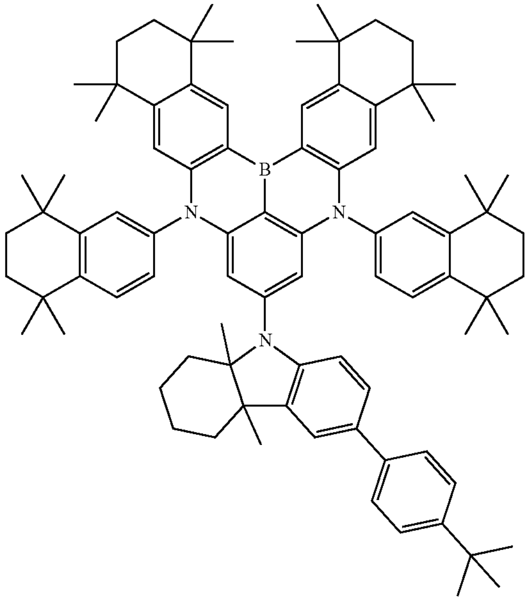

-continued
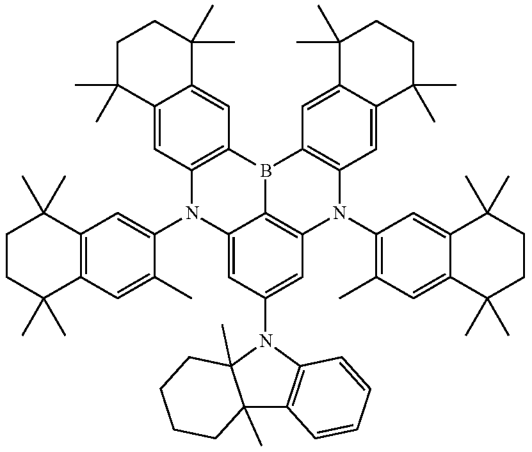
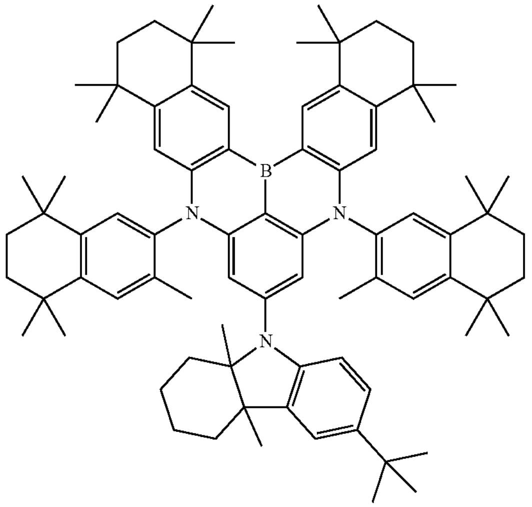
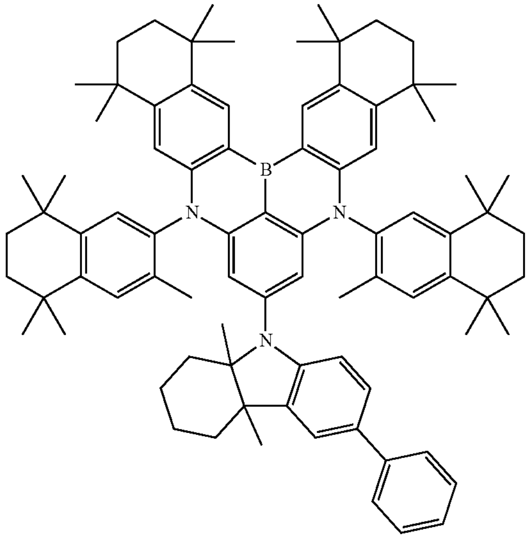
-continued
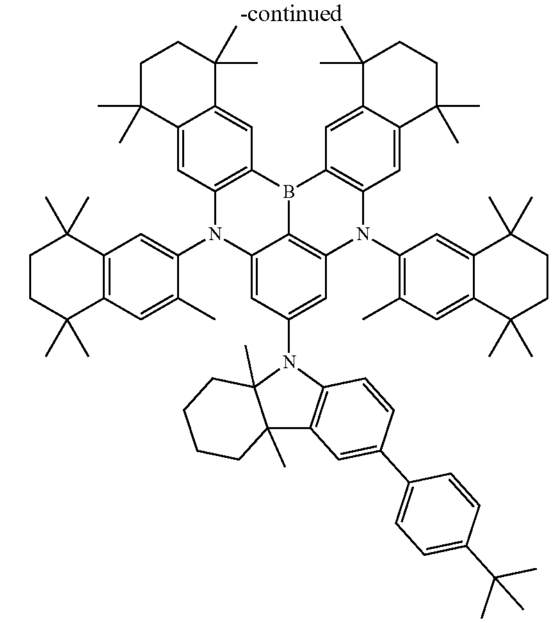
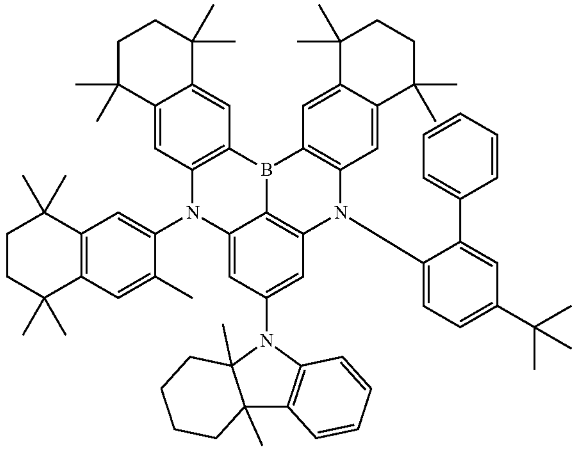
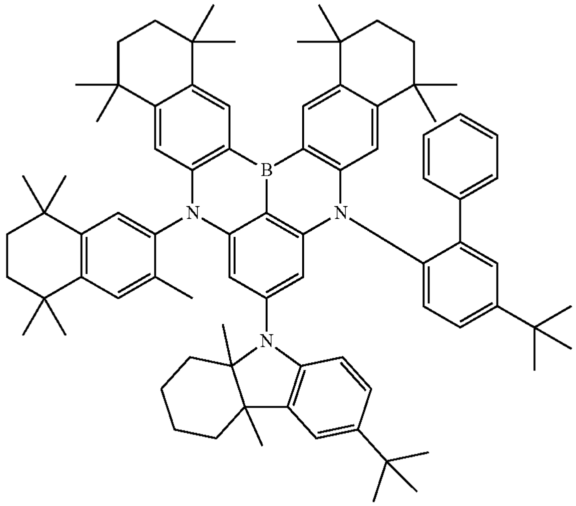

-continued
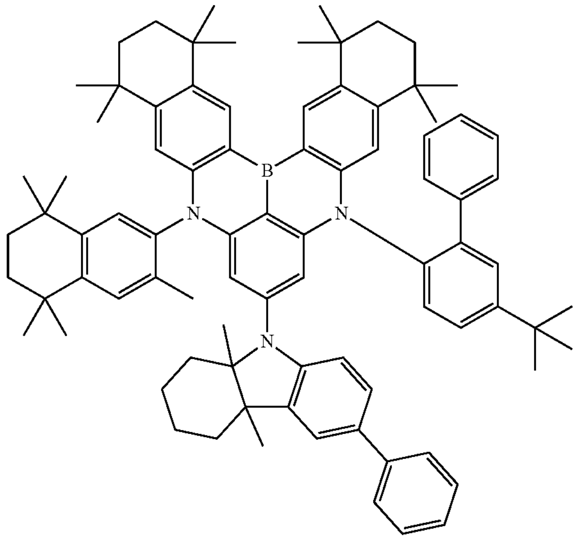
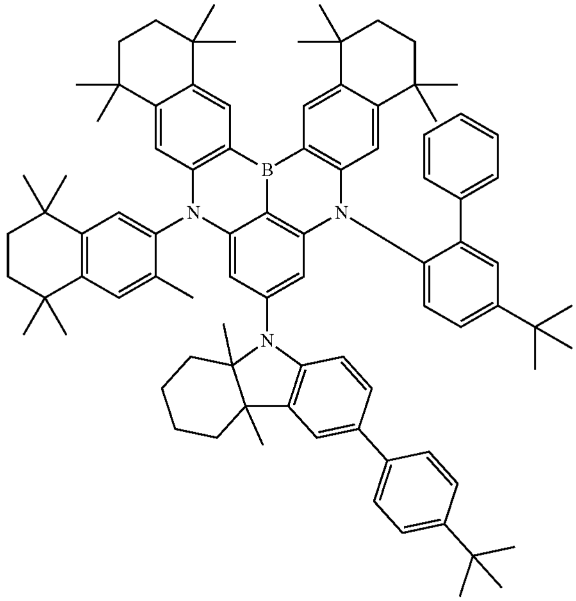
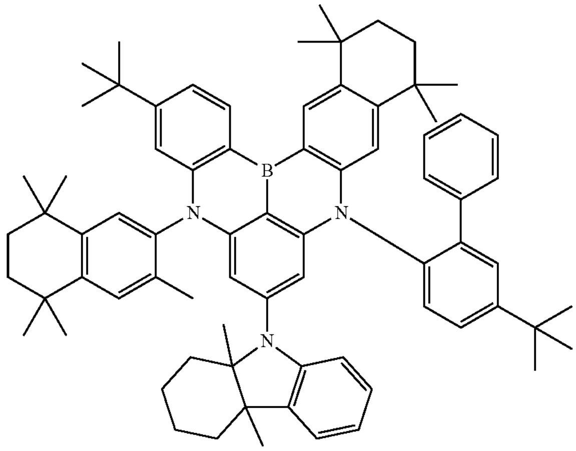
-continued
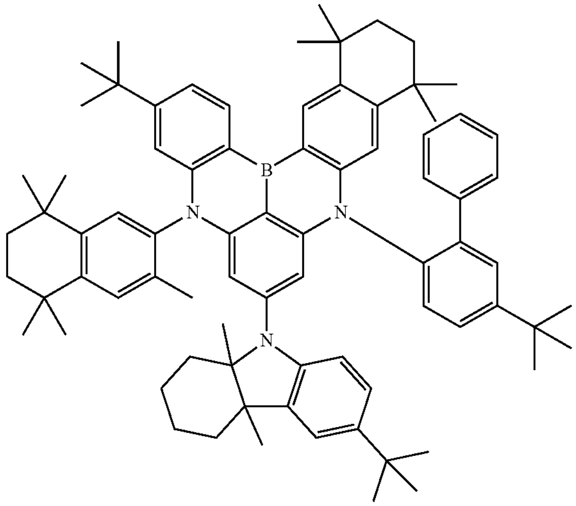
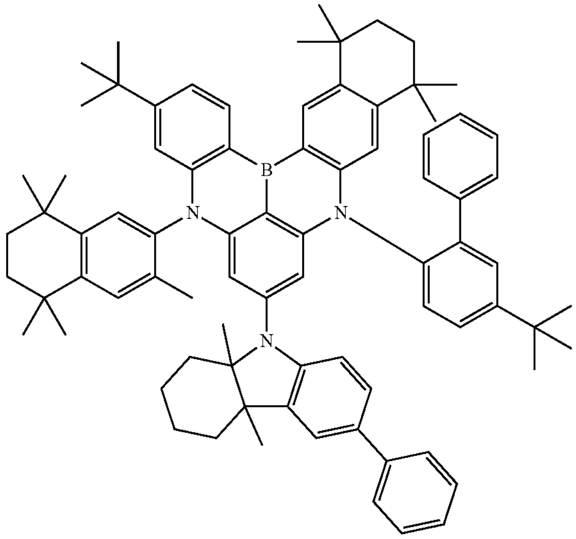
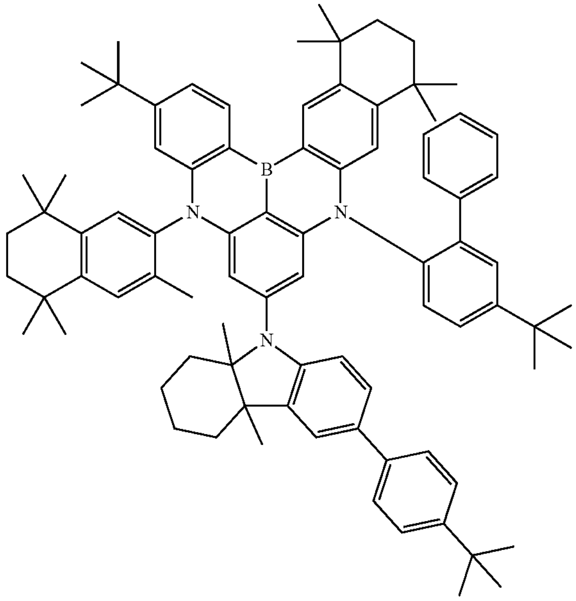

-continued
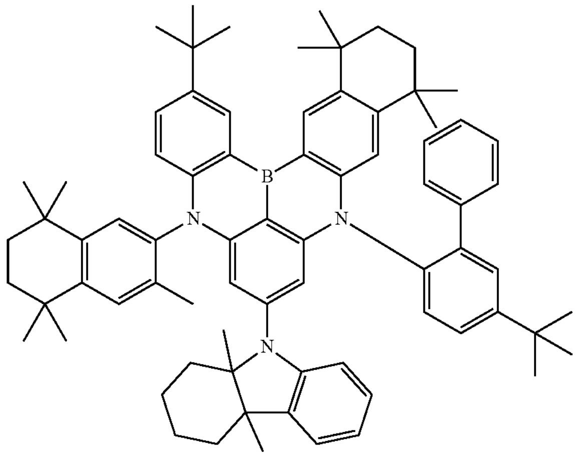
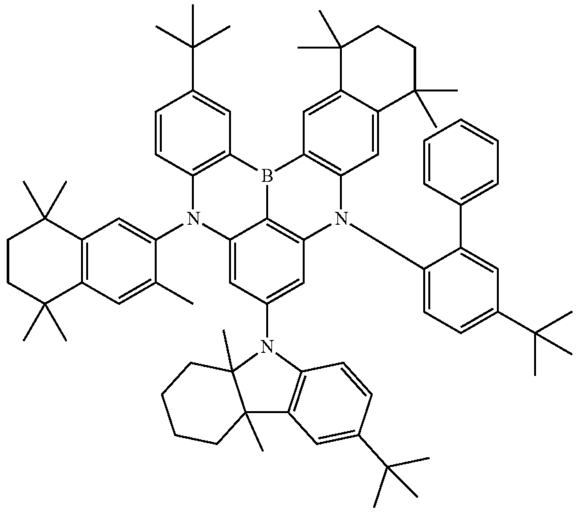
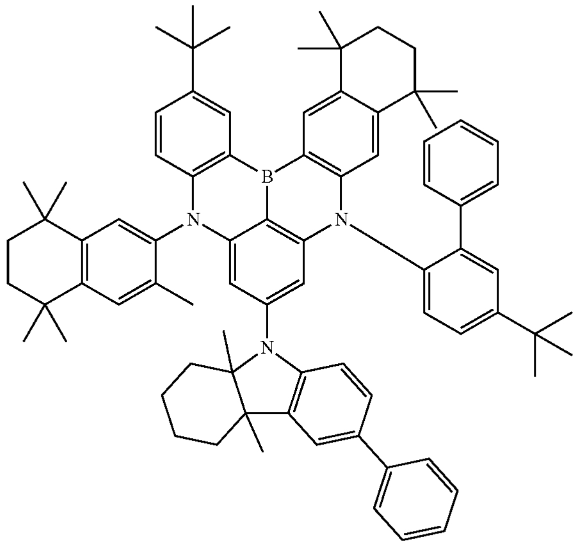
-continued
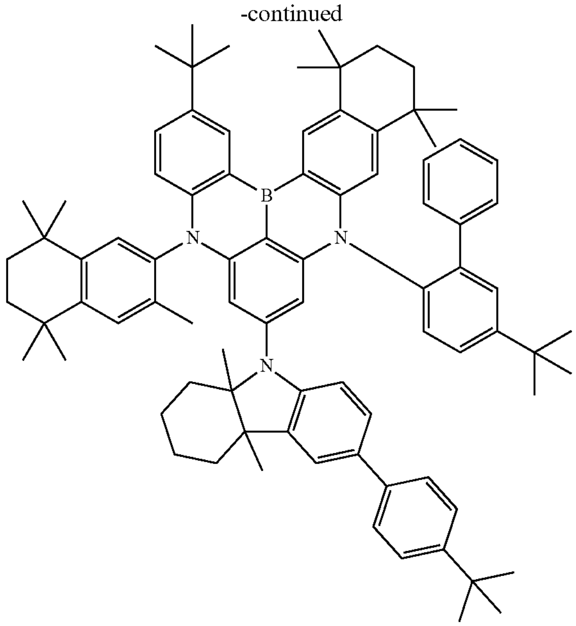
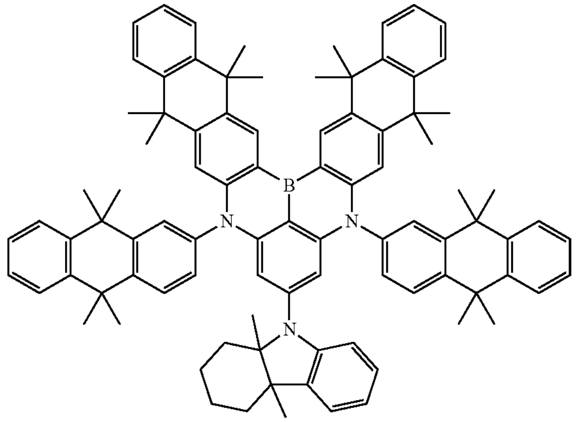
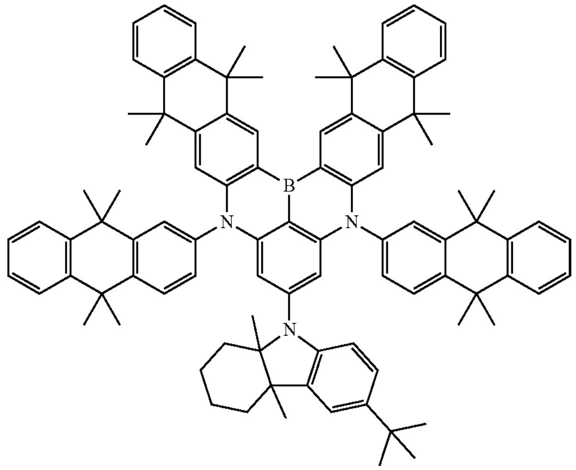

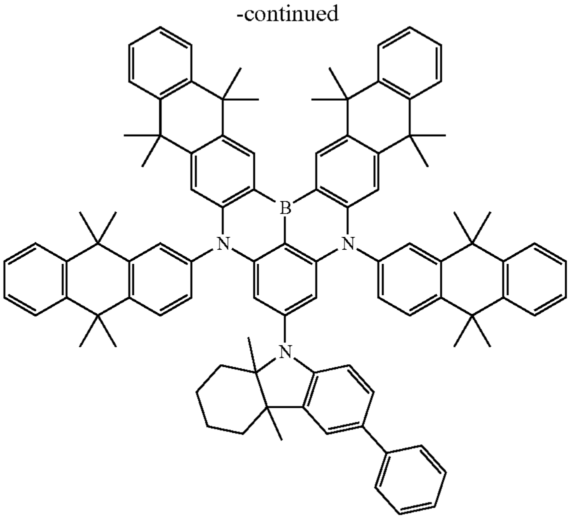
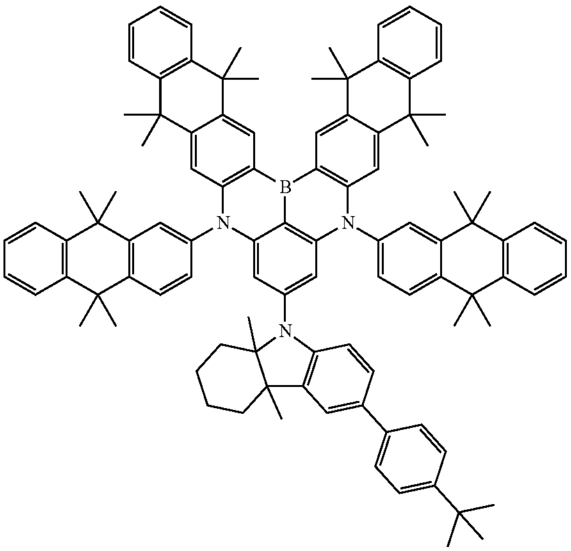
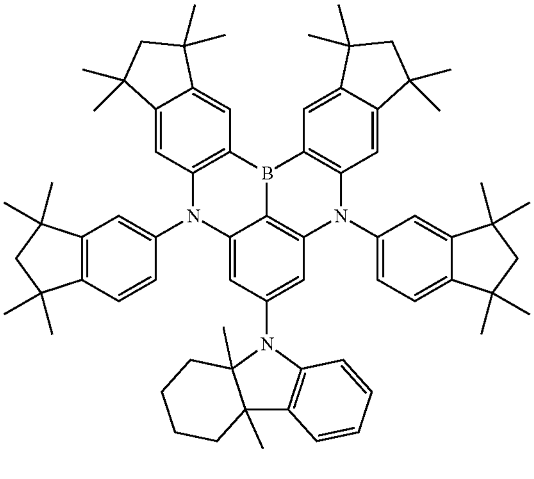
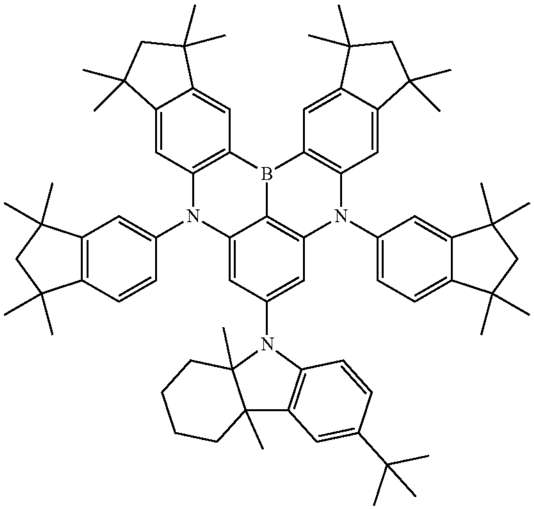
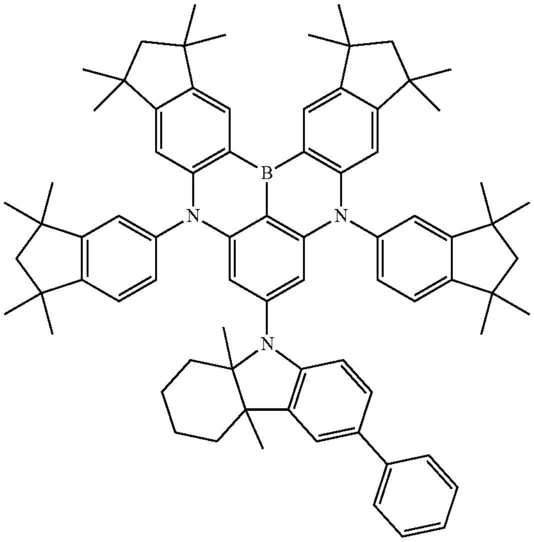
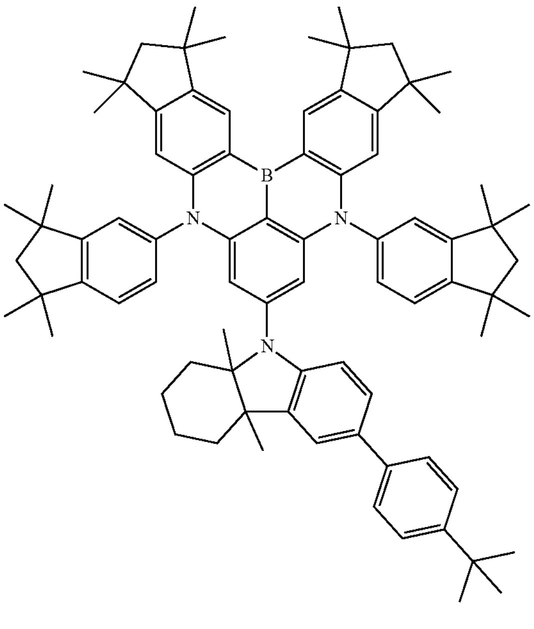

-continued
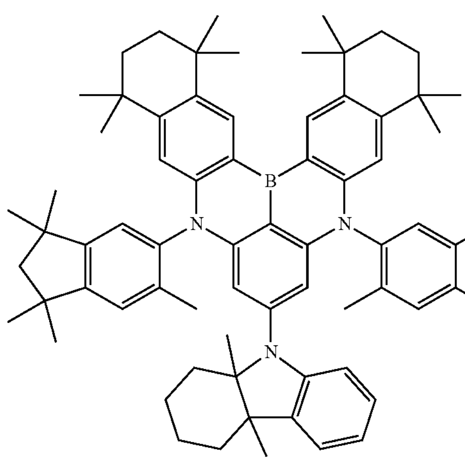
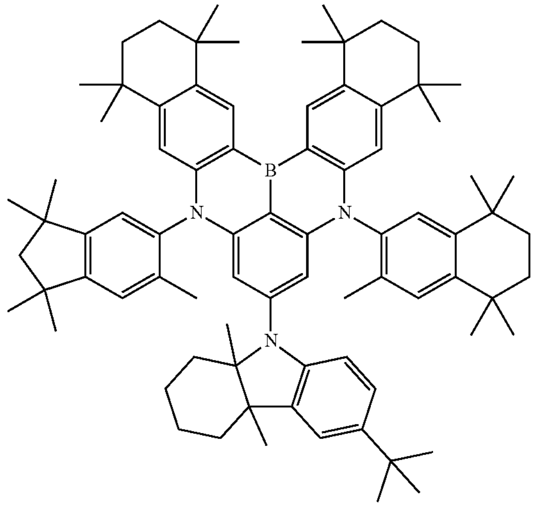
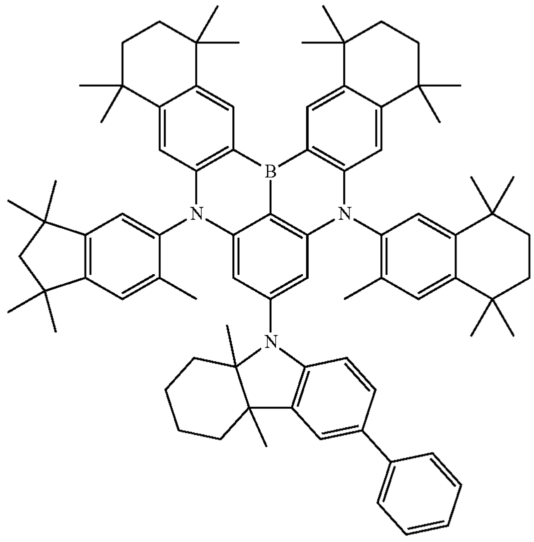
-continued
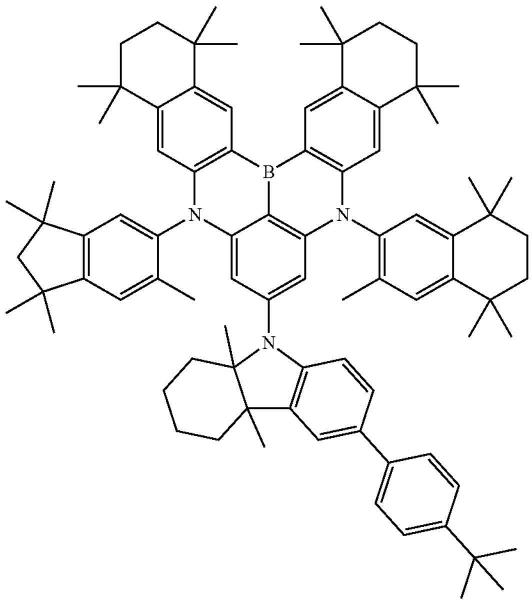
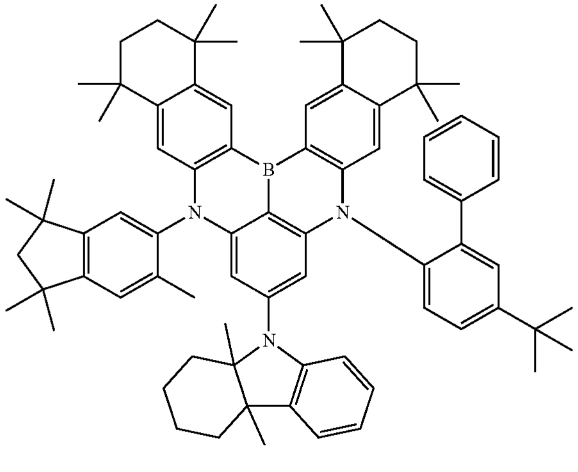
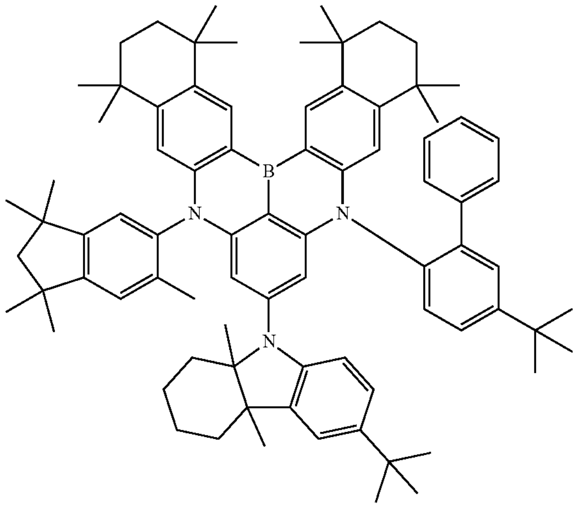

-continued
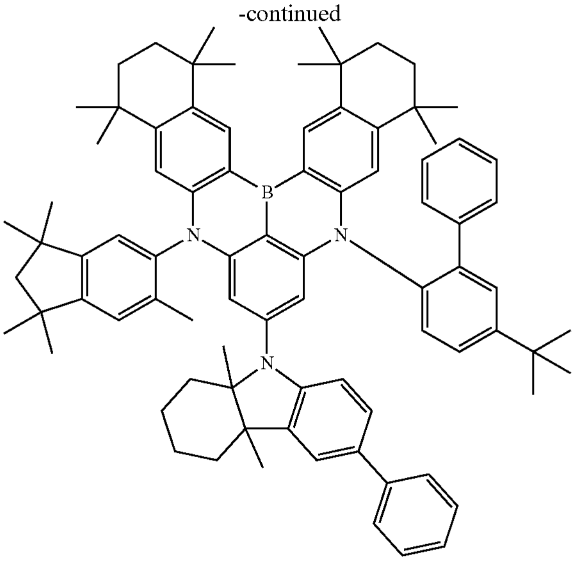
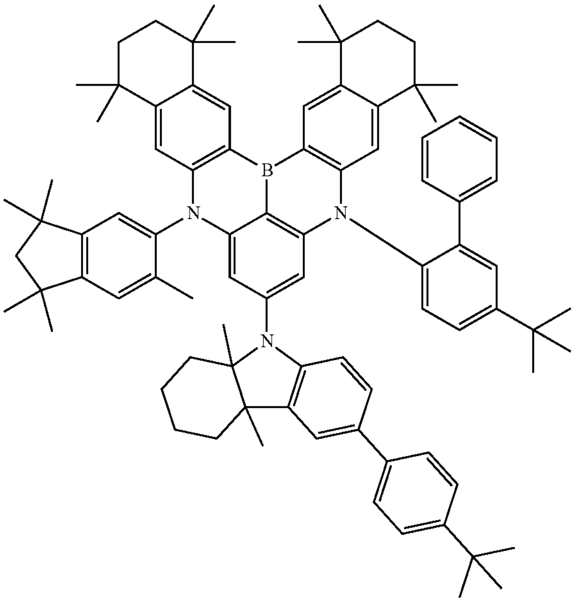
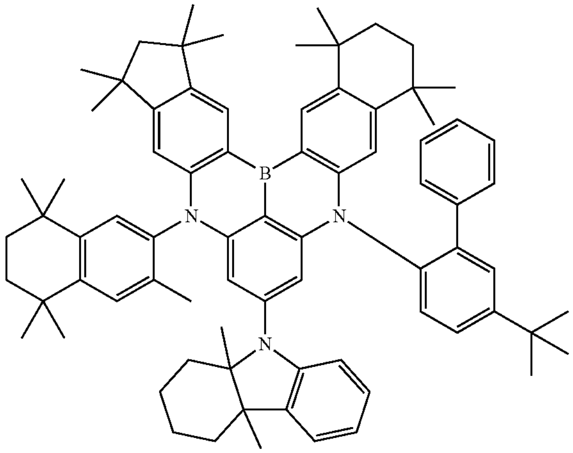
-continued
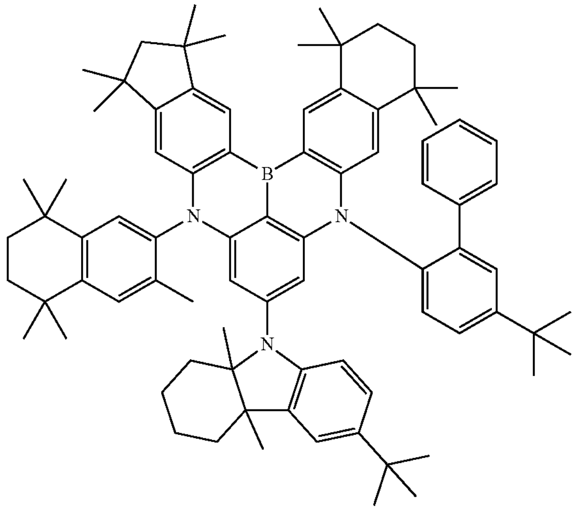
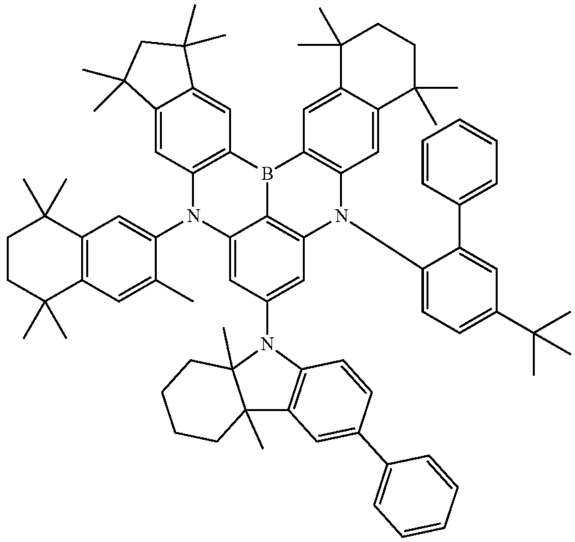
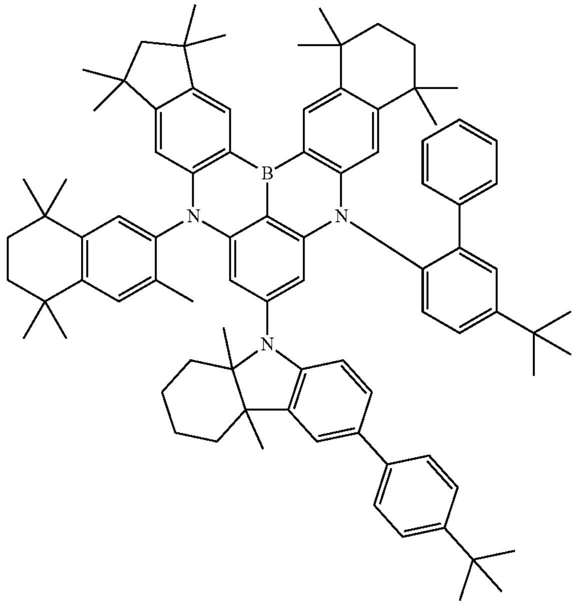

-continued
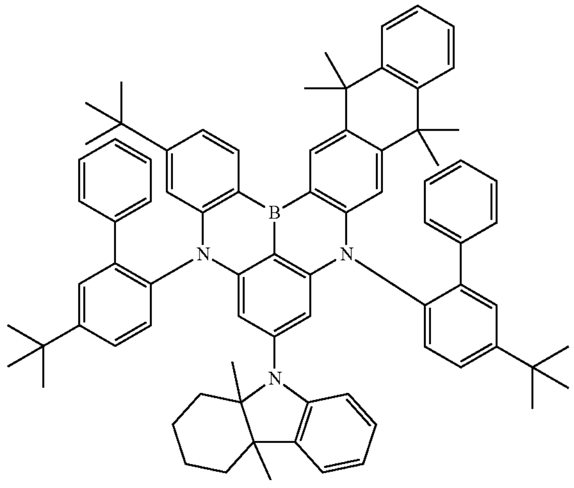
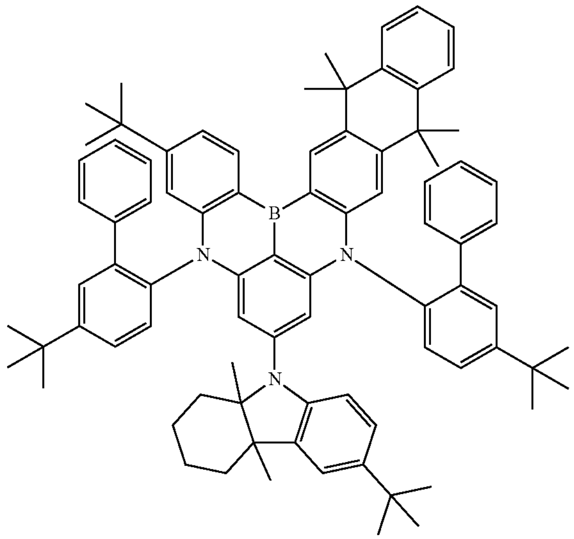
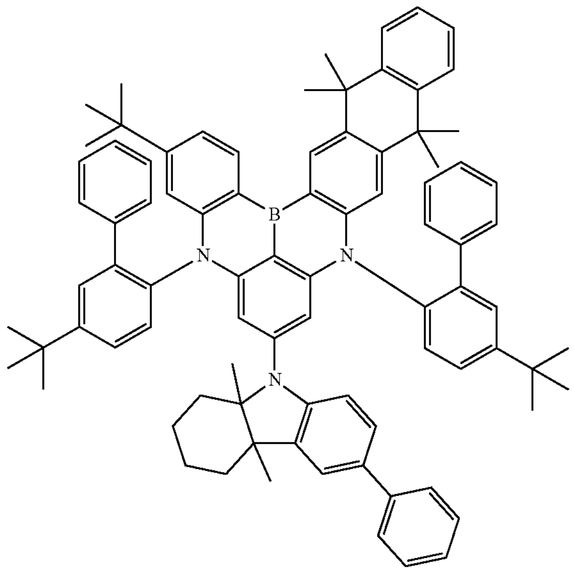
-continued
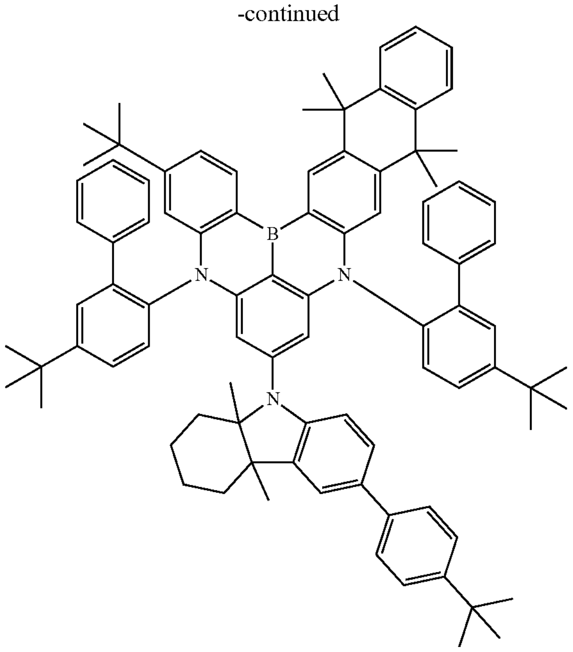
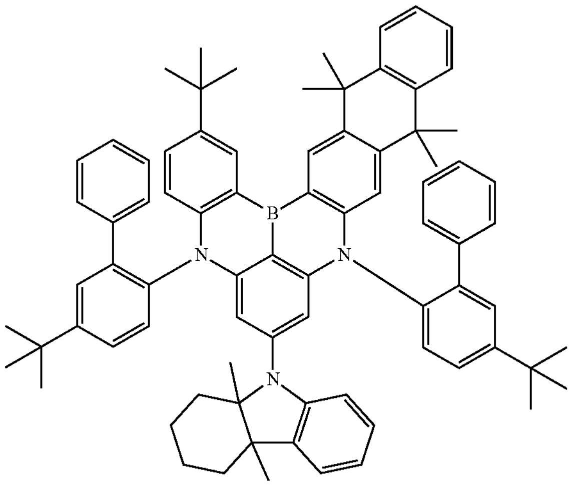
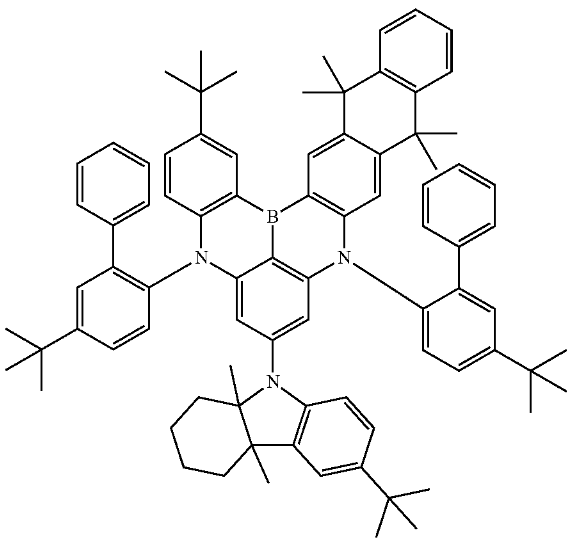

-continued
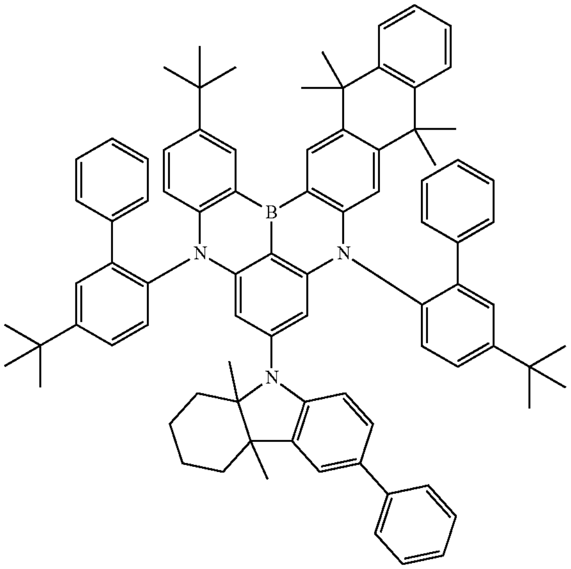
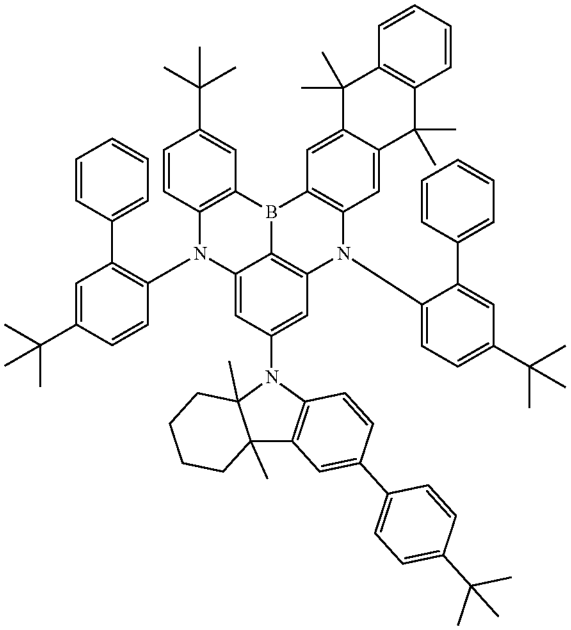
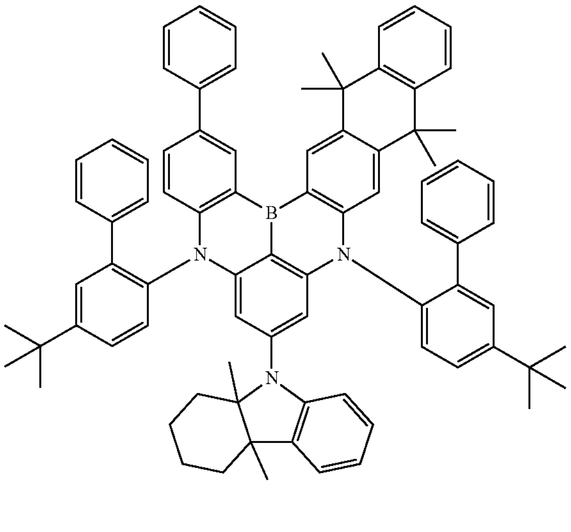
-continued
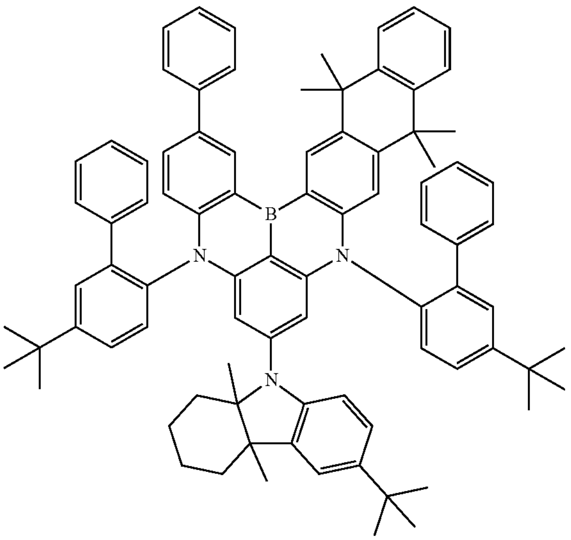
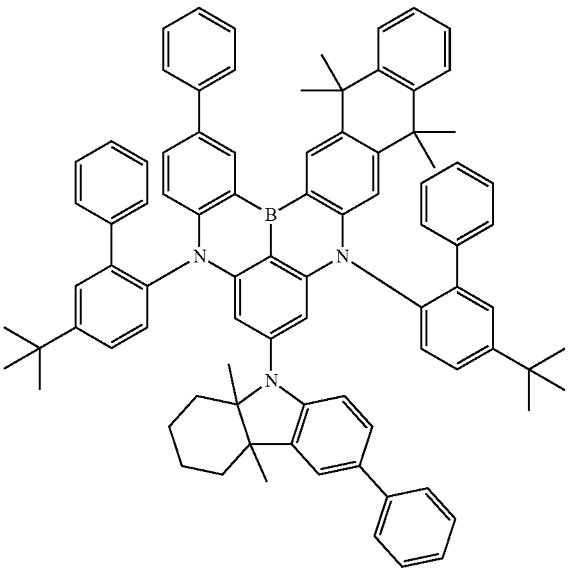

-continued
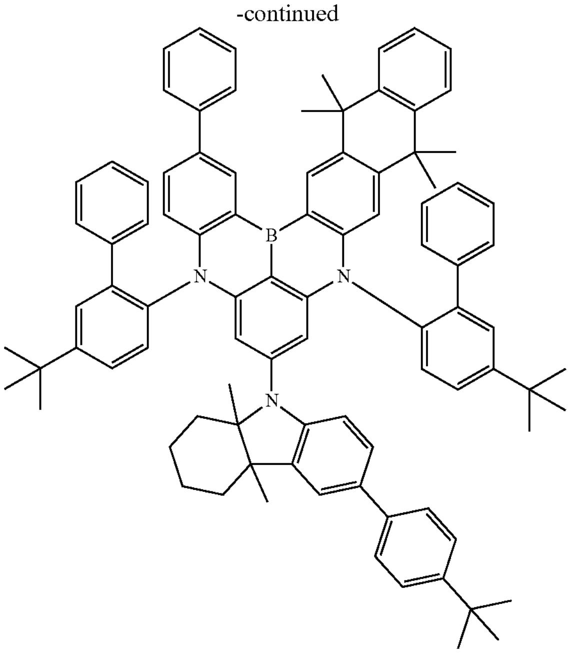
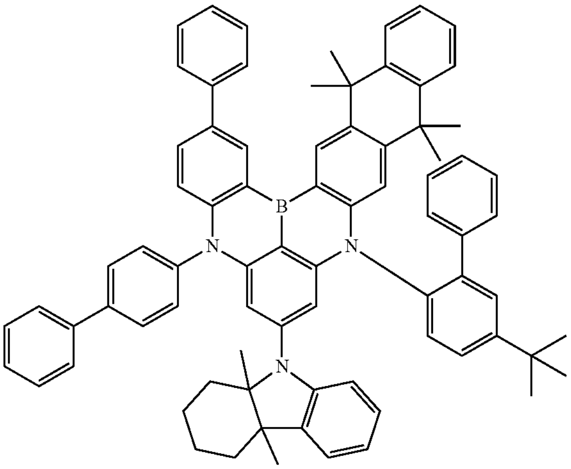
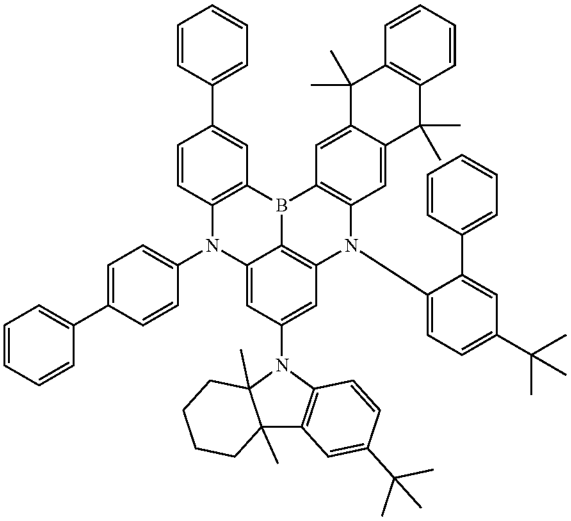
-continued
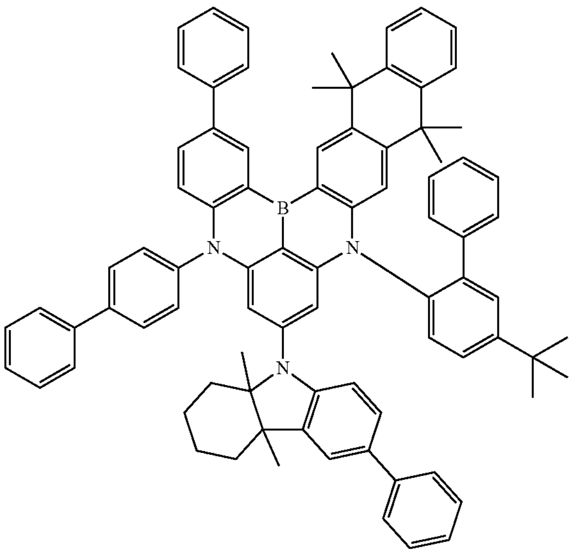
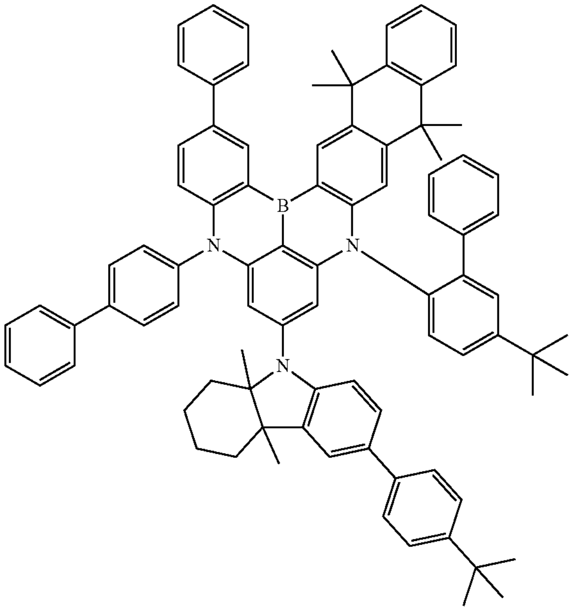
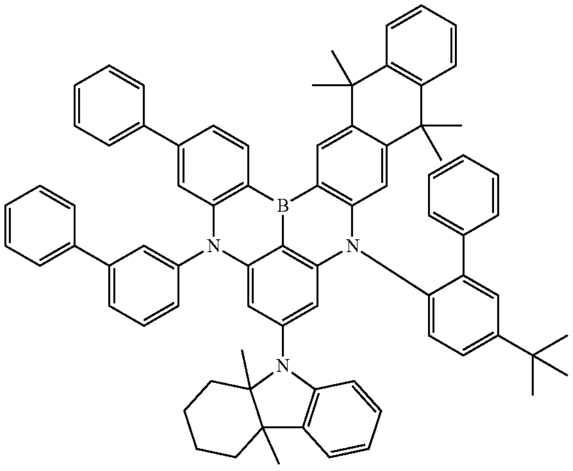

-continued
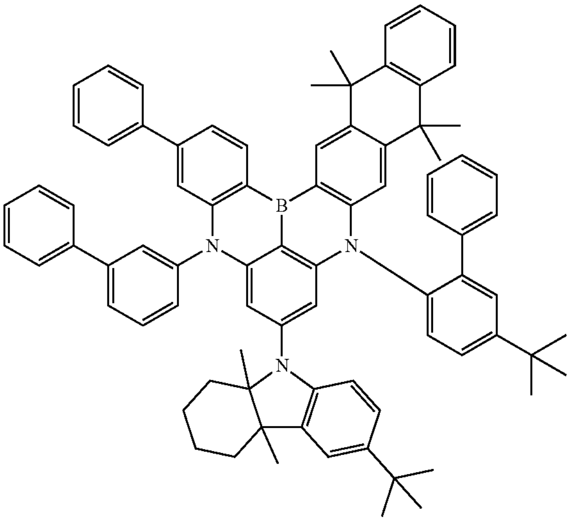
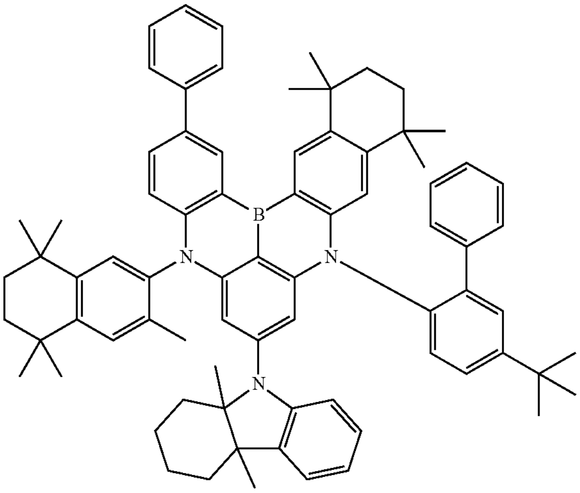
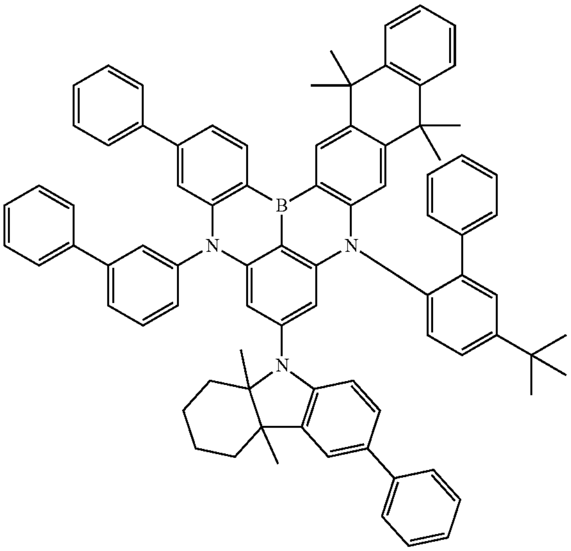
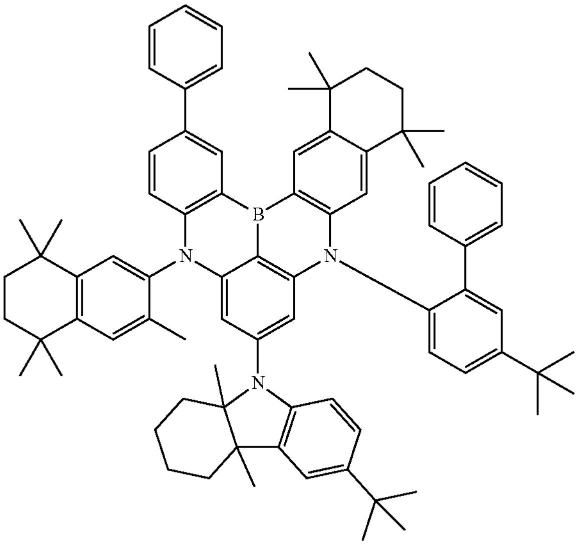
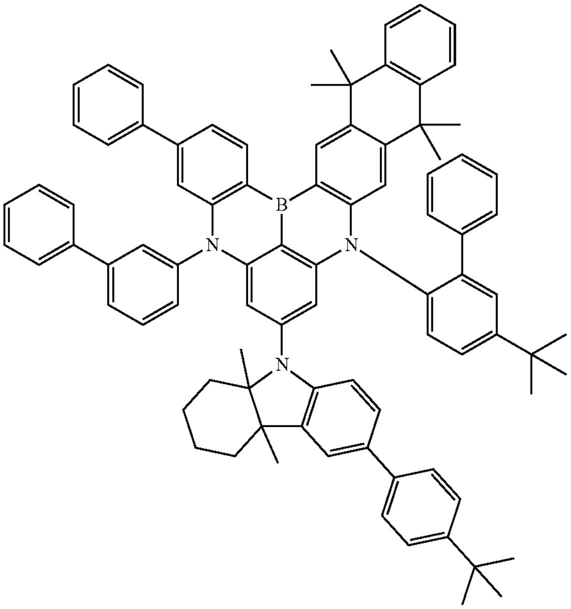
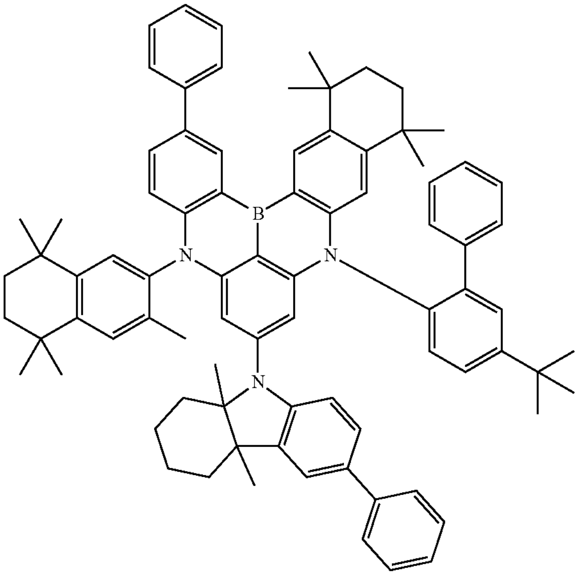

-continued
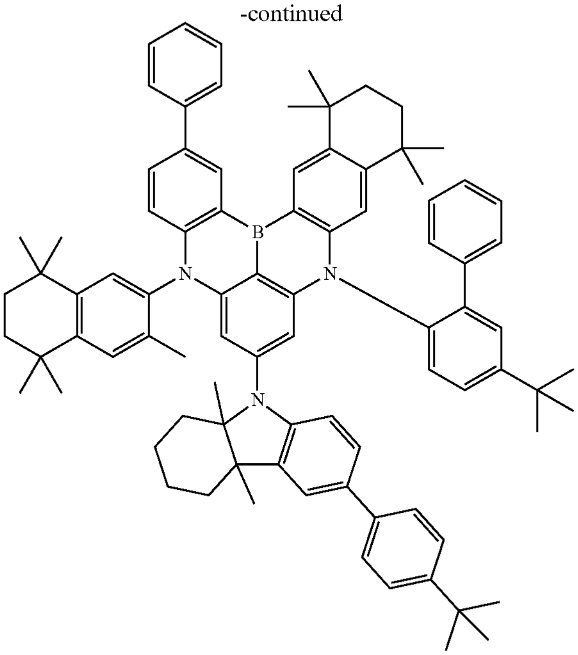
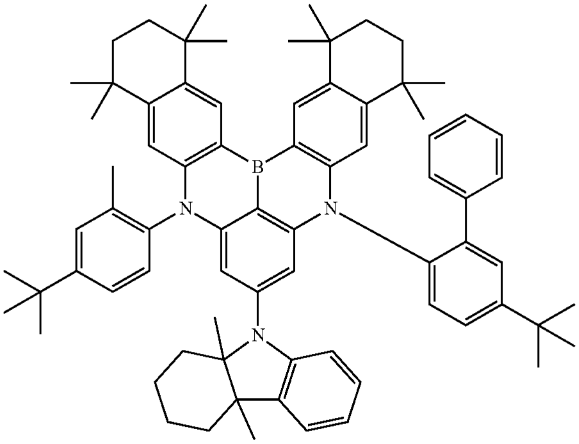
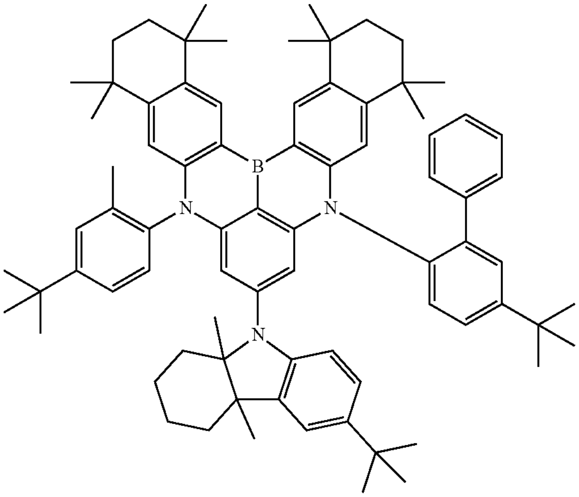
-continued
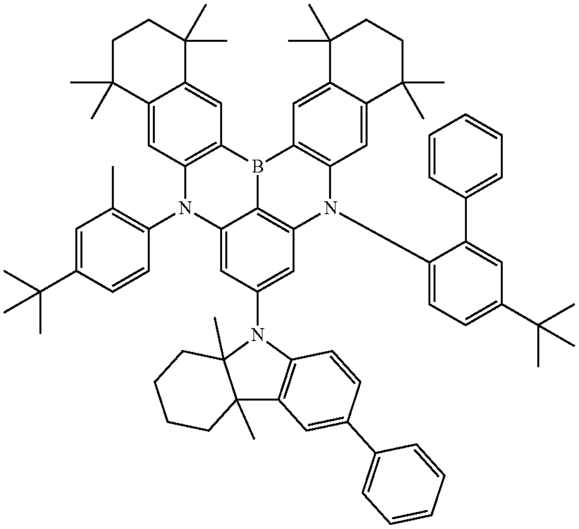
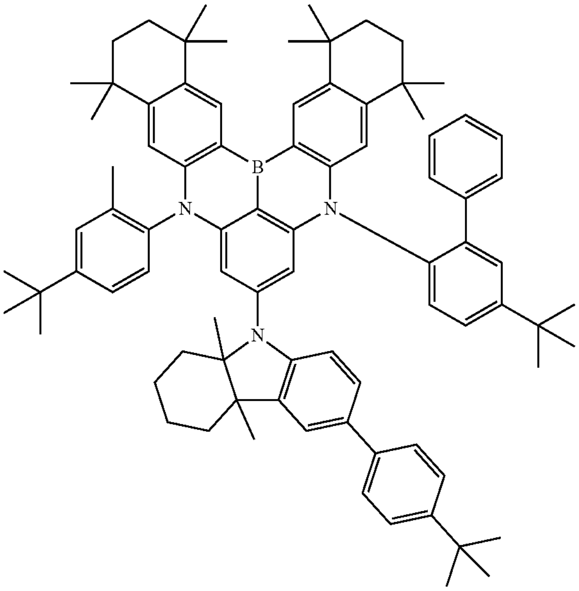
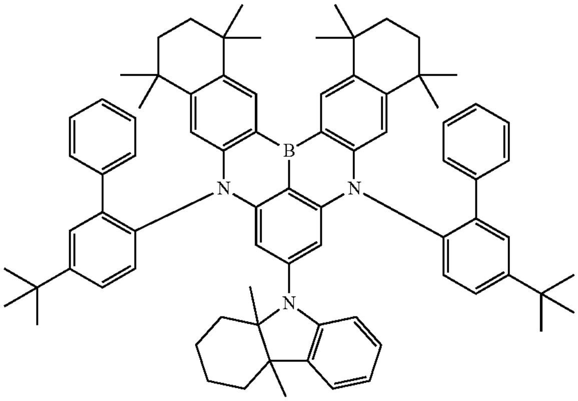

-continued
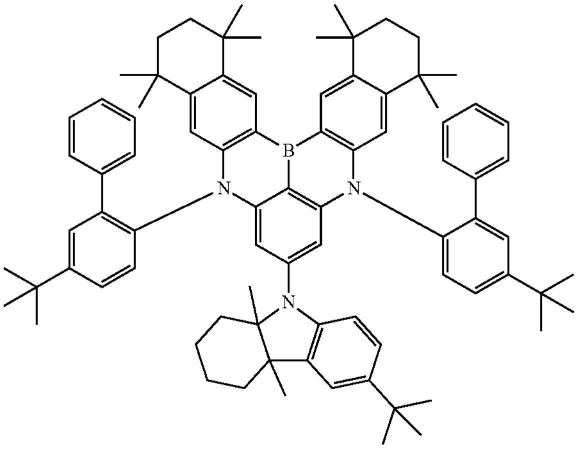
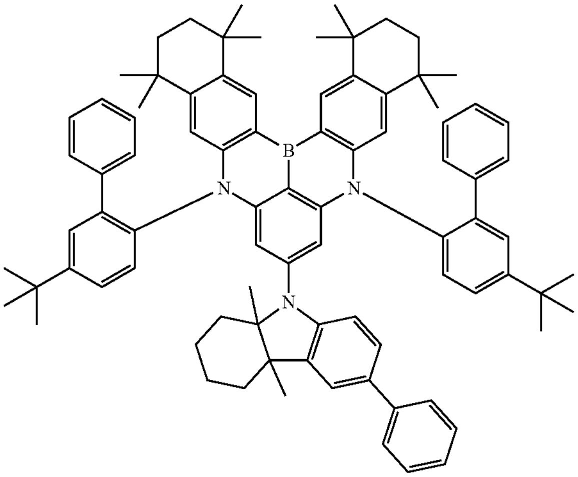
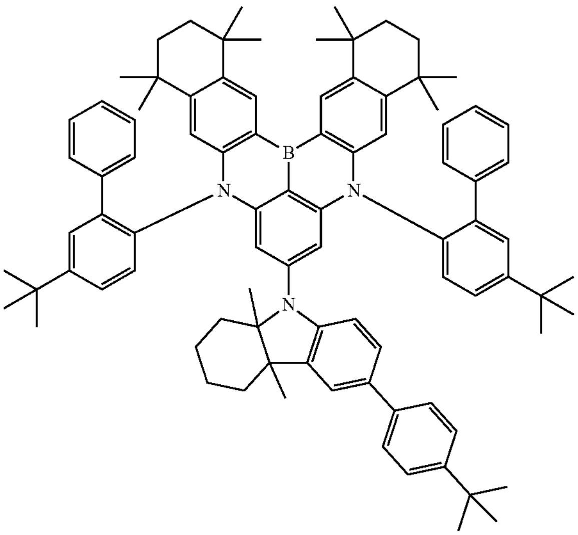
-continued
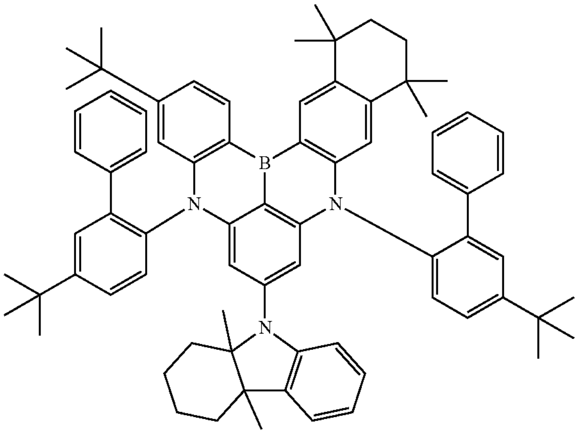
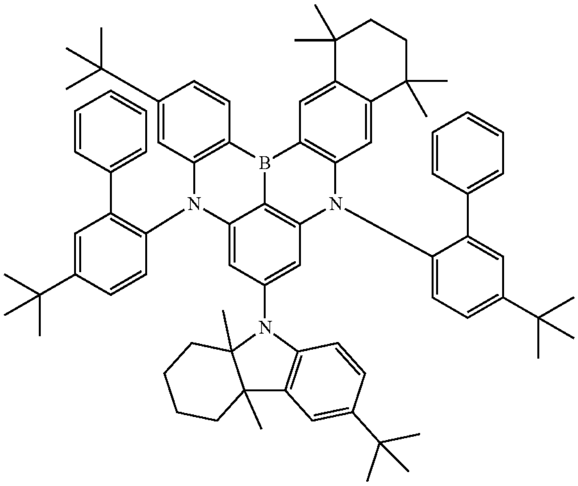
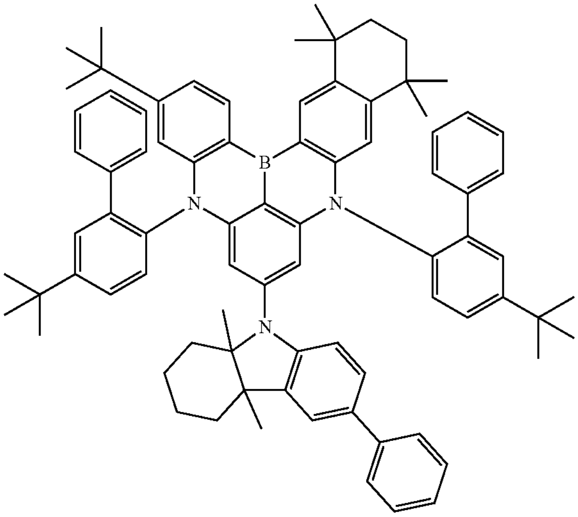

-continued
-continued
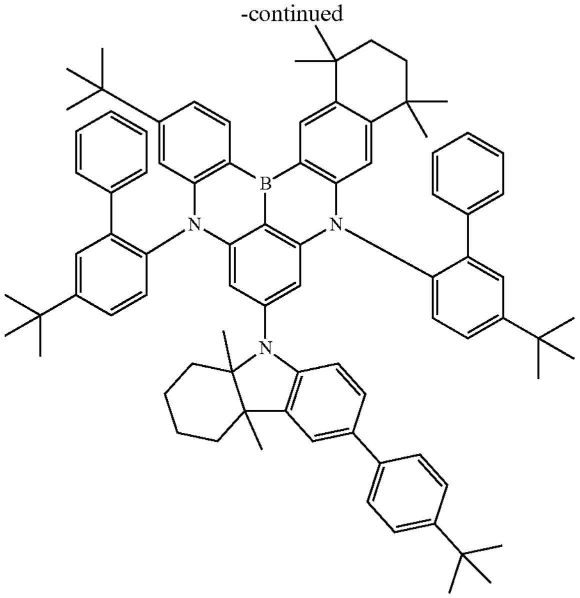
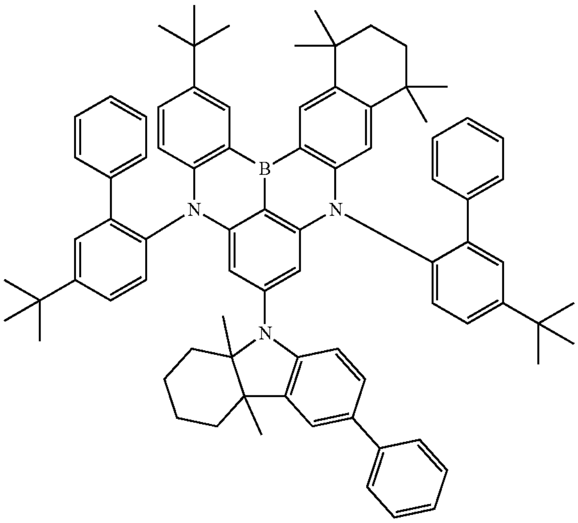
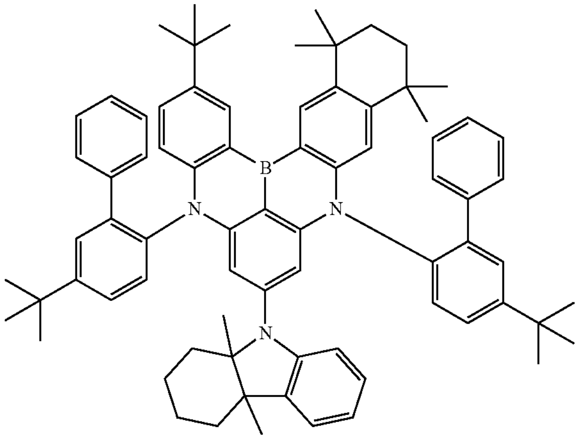
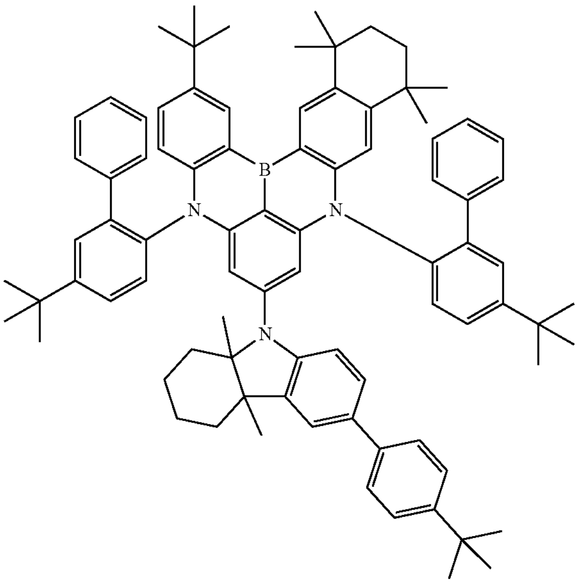
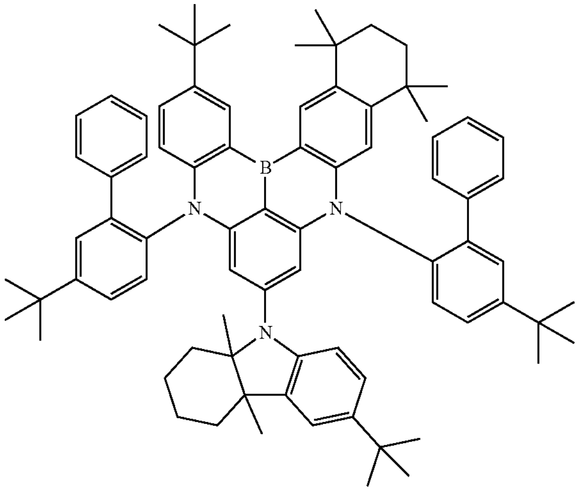
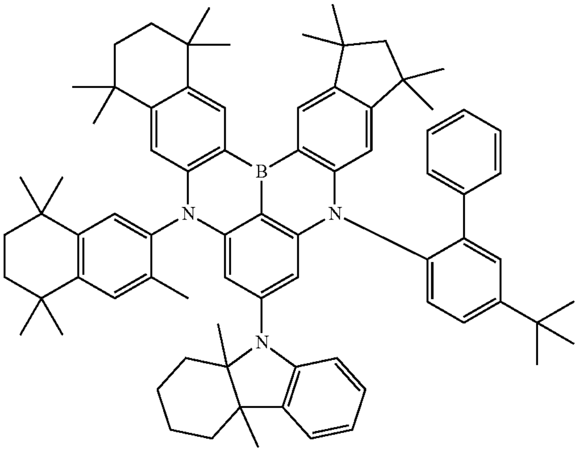

-continued
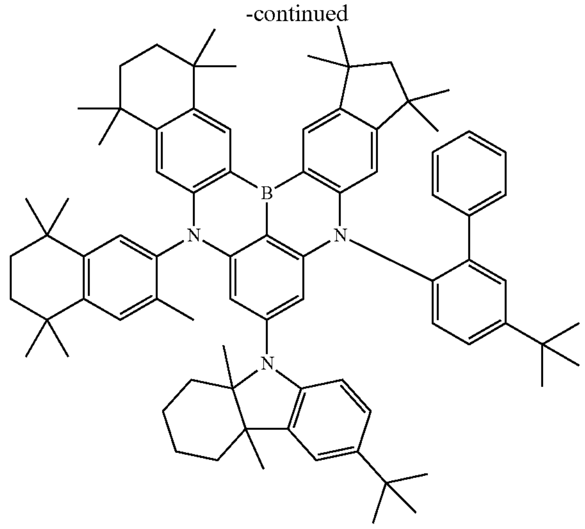
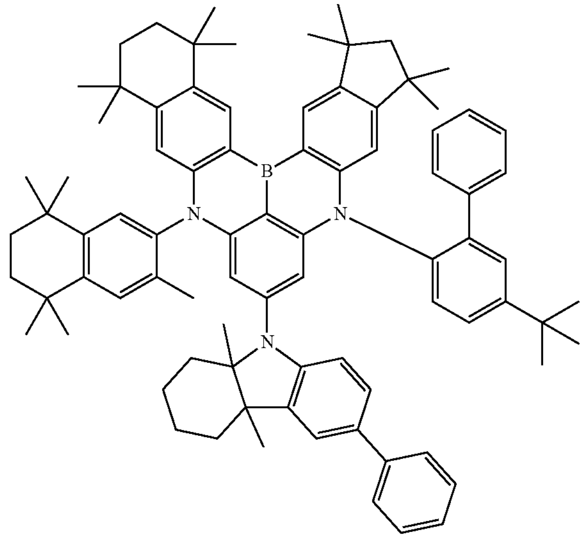
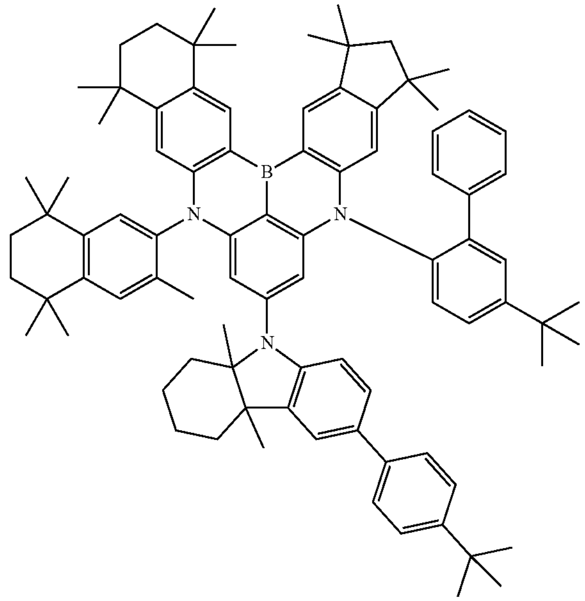
-continued
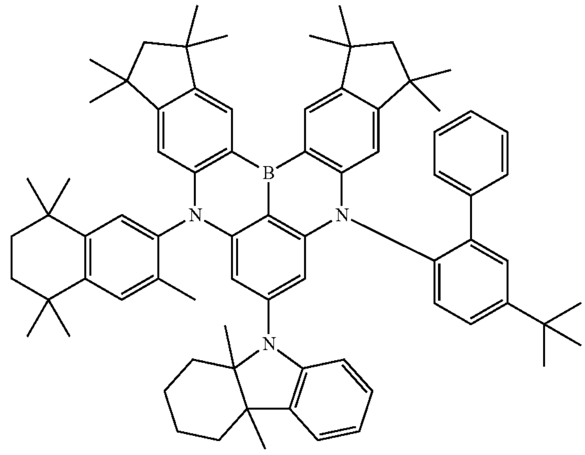
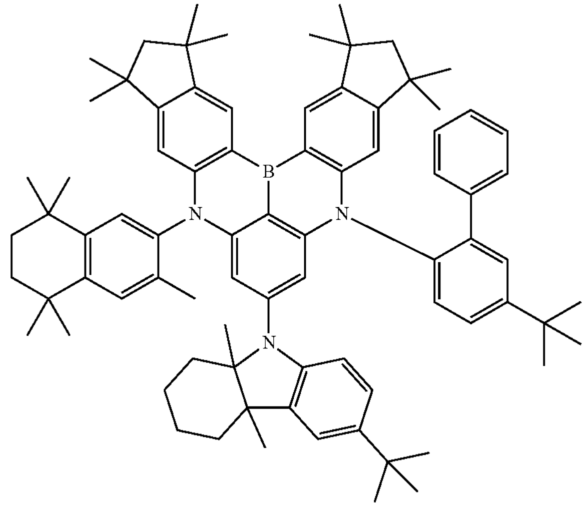
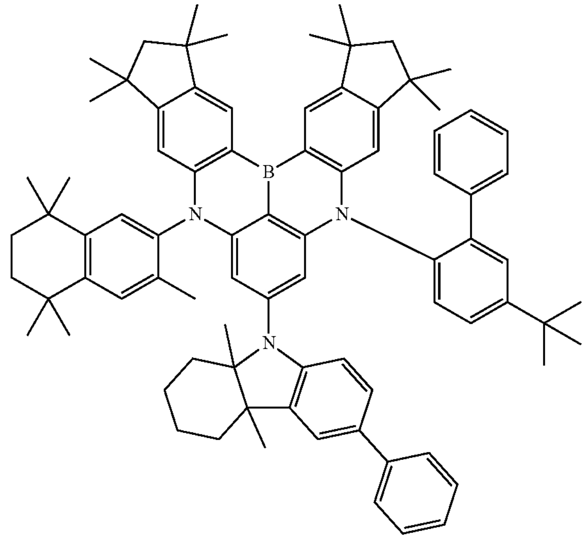

-continued
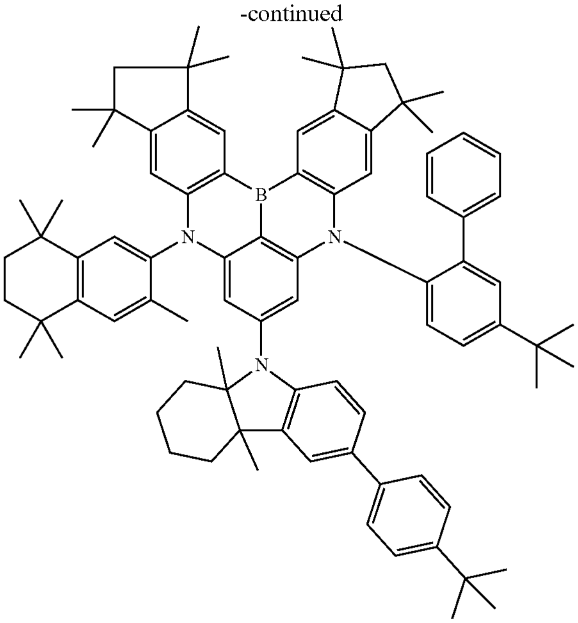
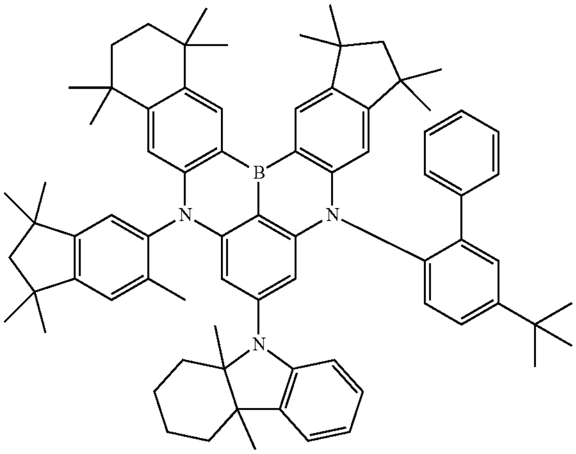
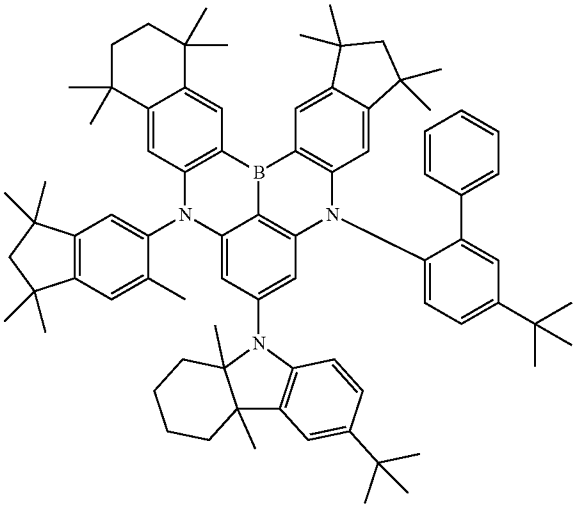
-continued
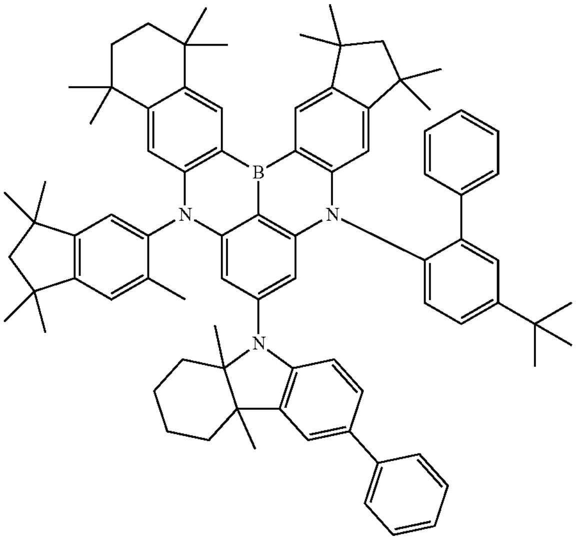
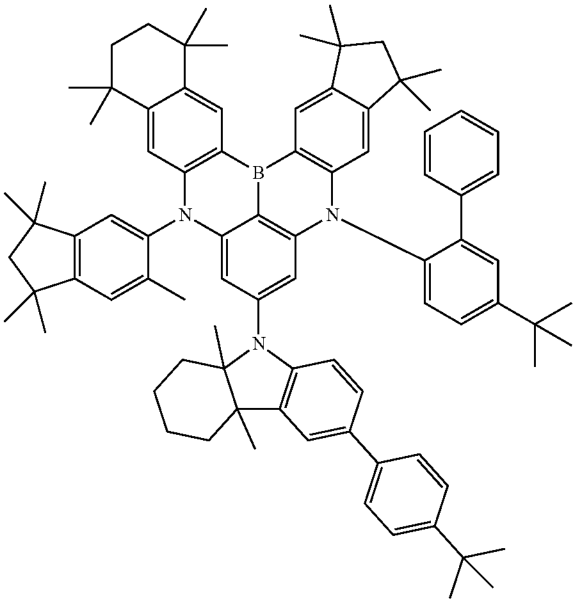
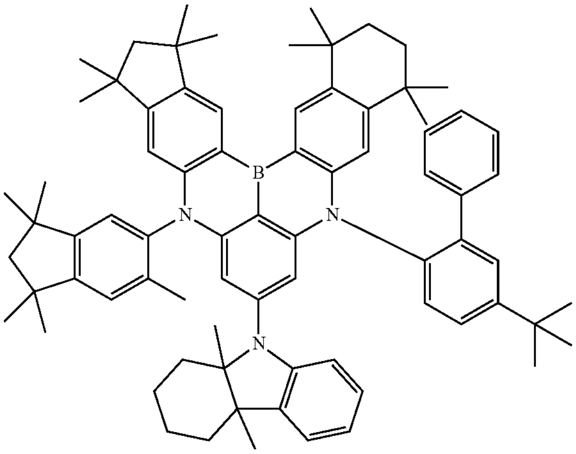

-continued
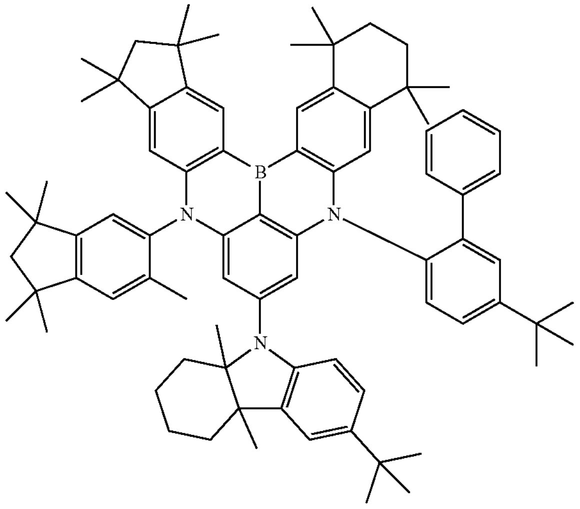
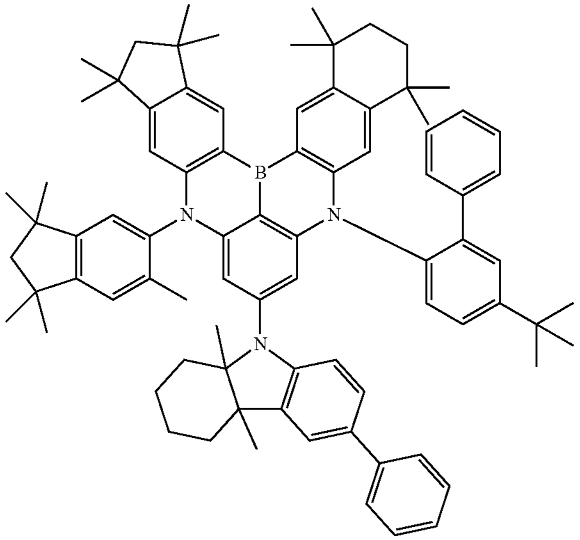
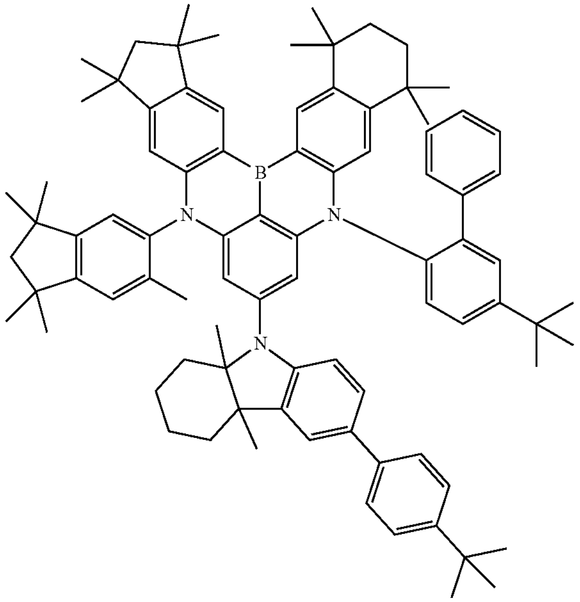
-continued
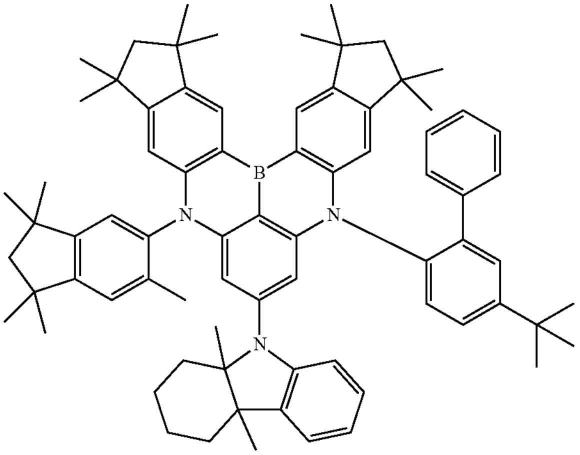
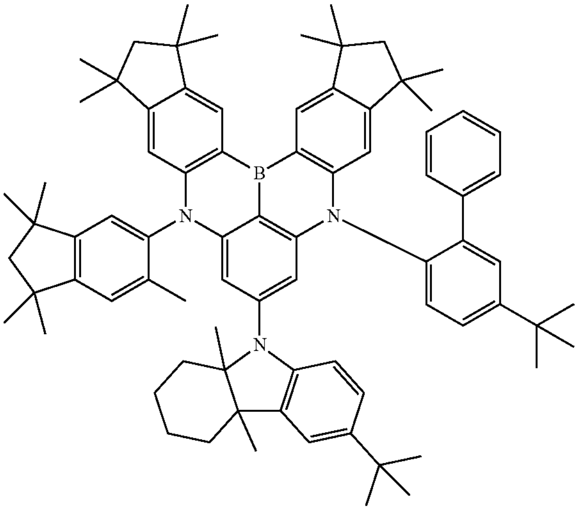
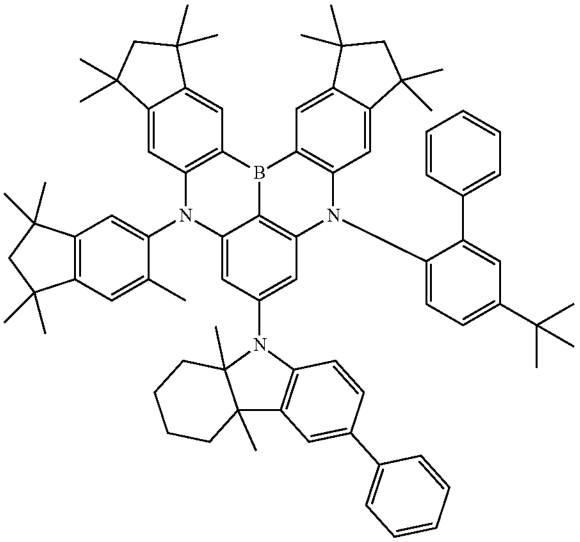

-continued
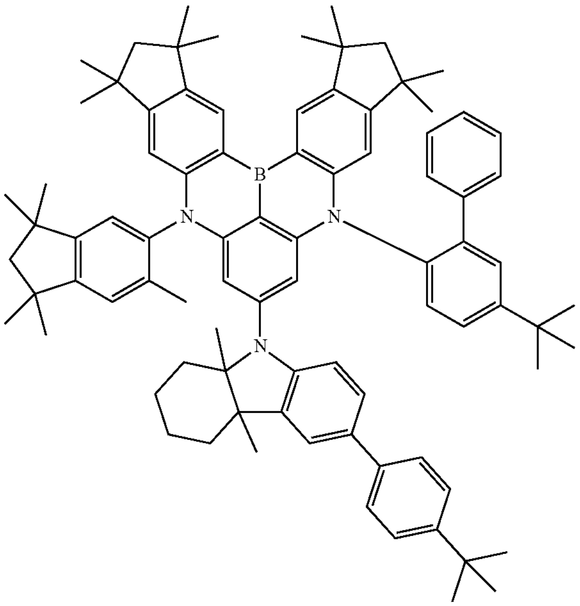
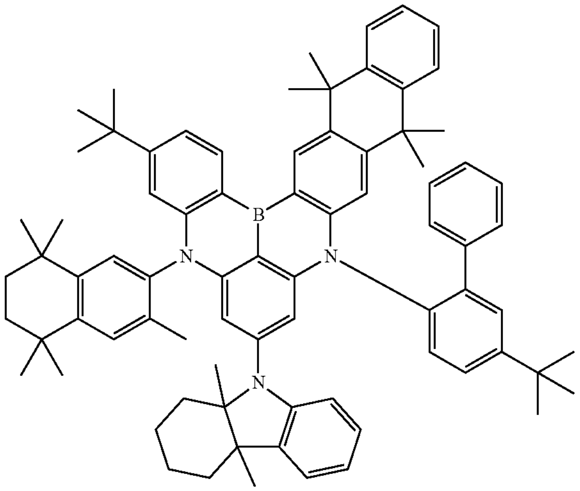
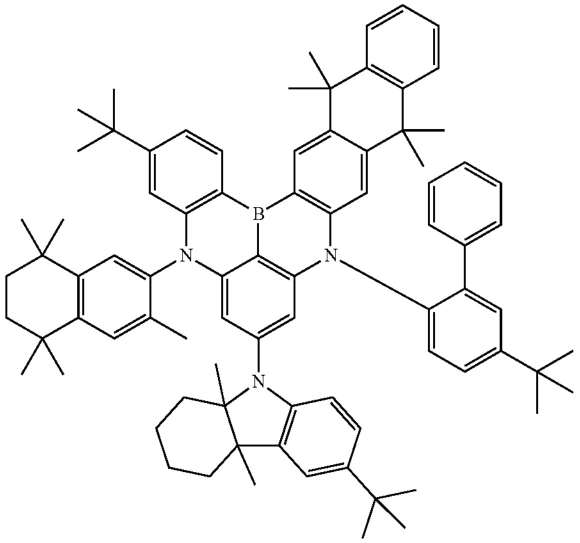
-continued
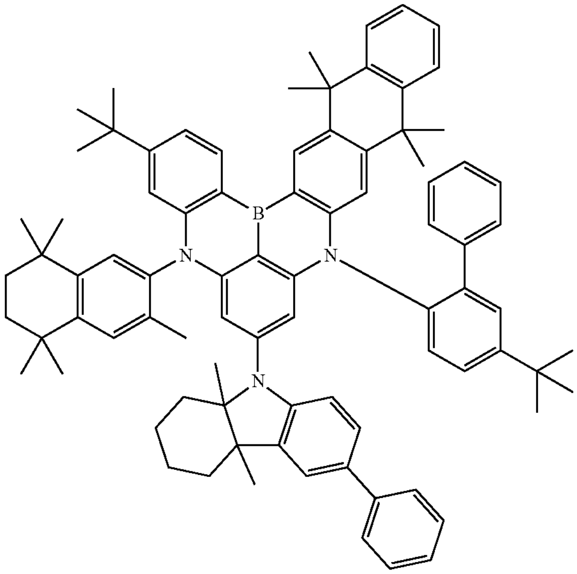
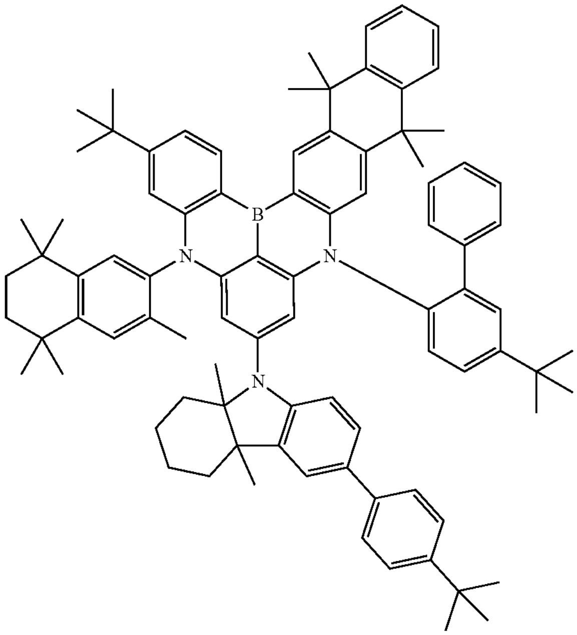
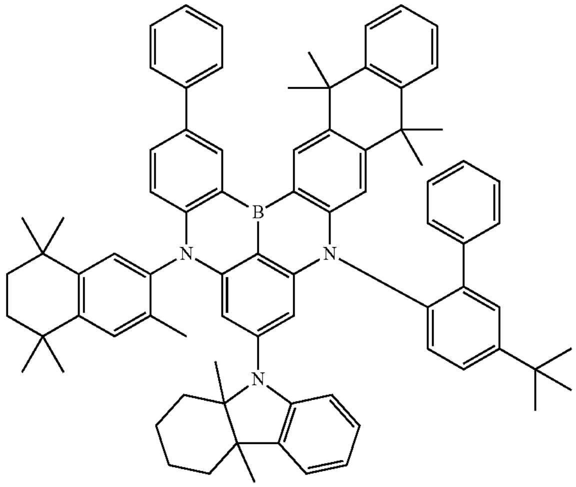

-continued
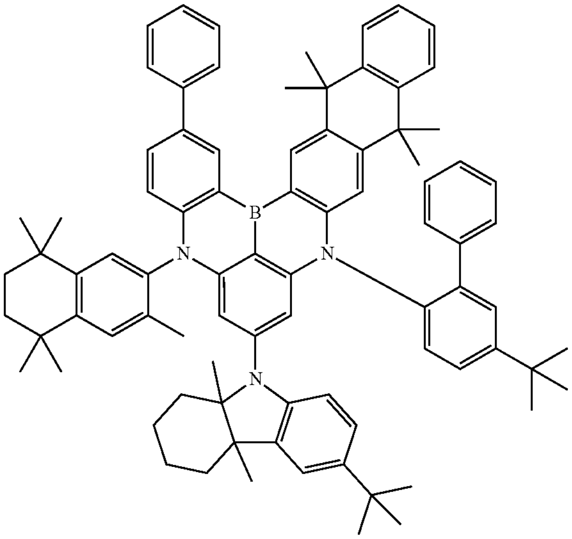
-continued
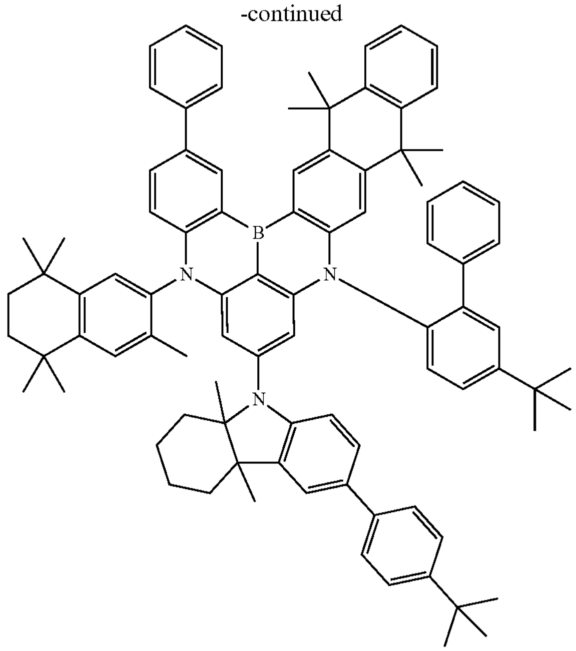
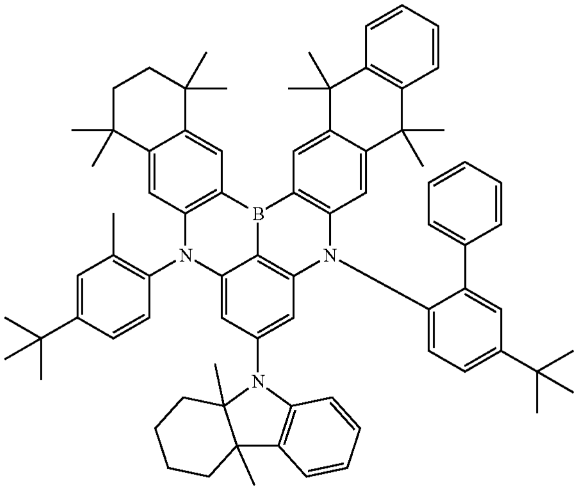
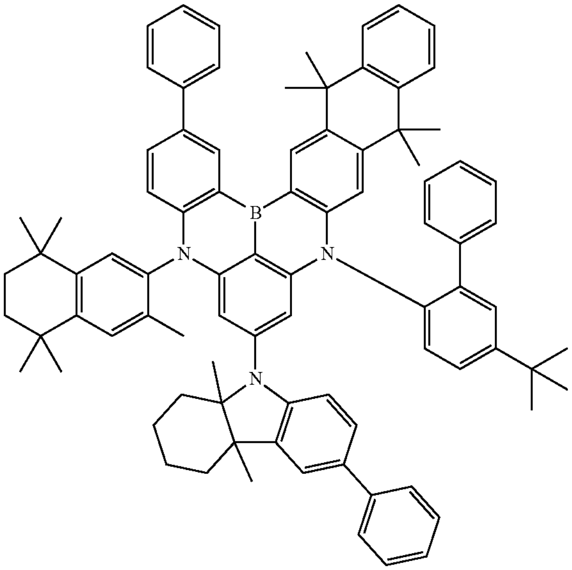
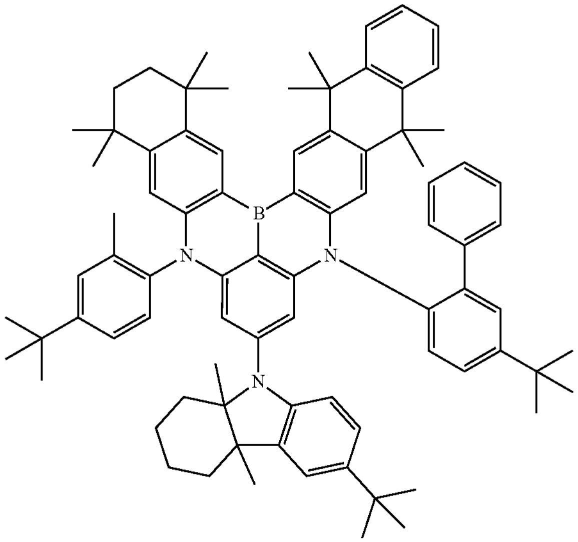

-continued
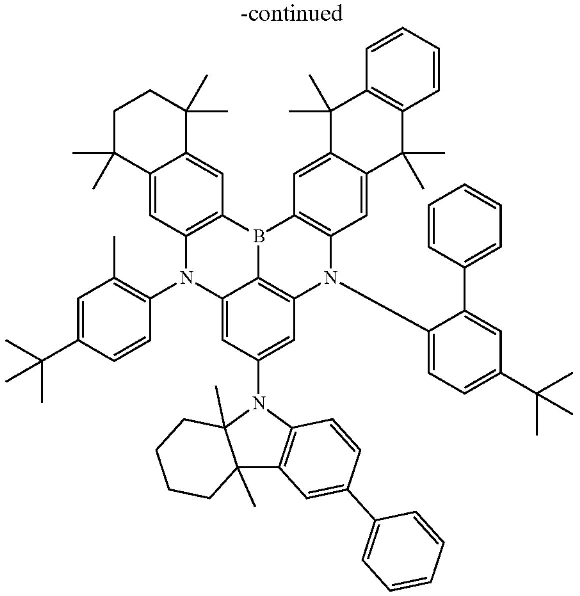
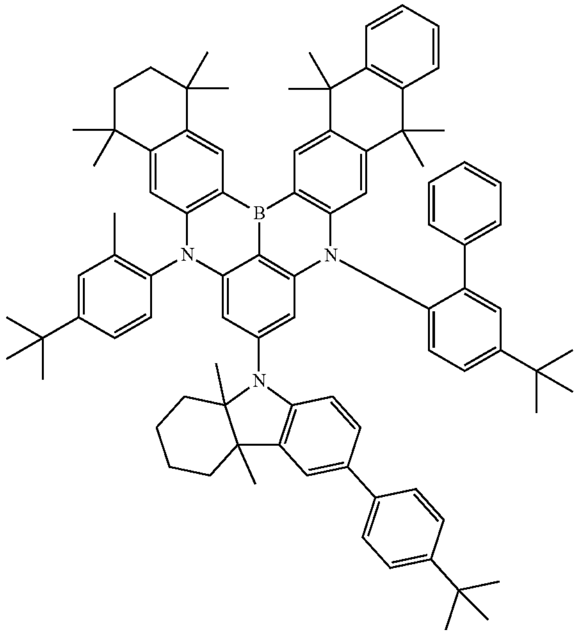
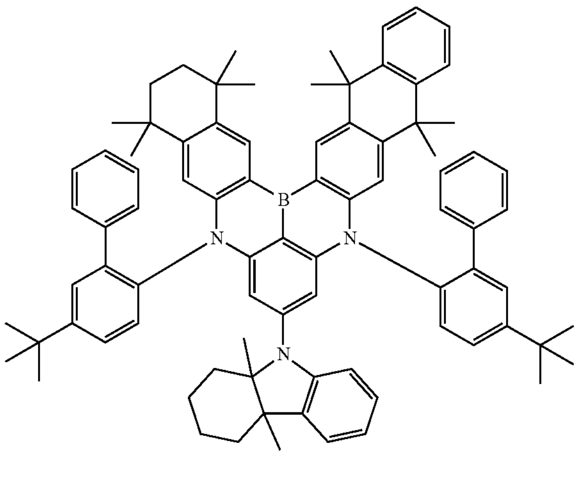
-continued
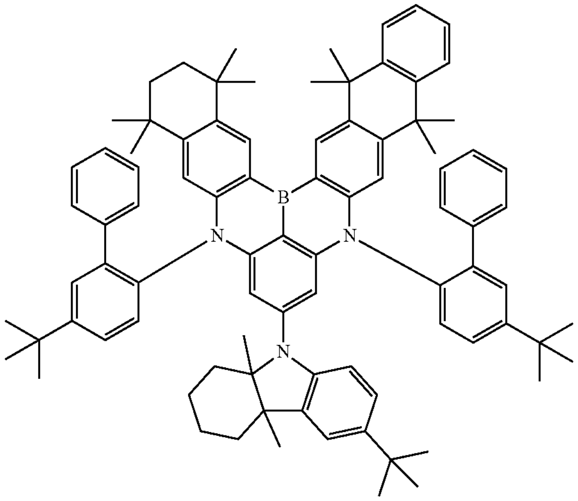
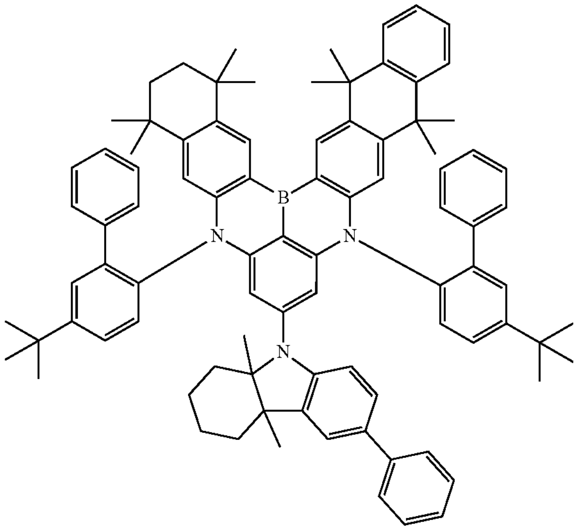
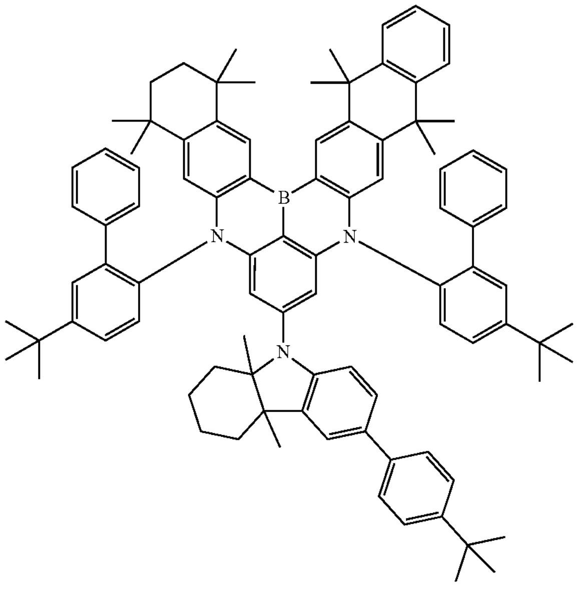

-continued
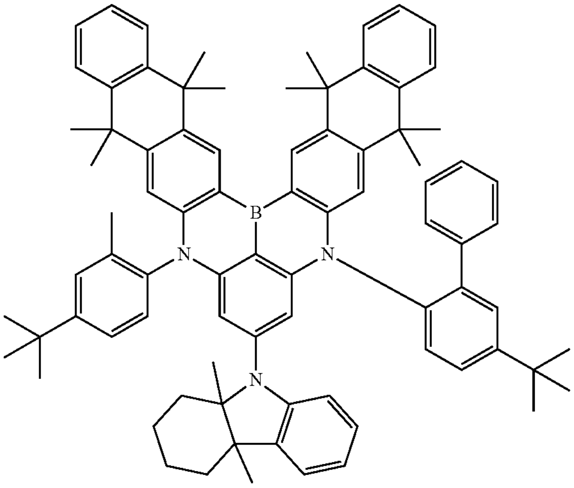
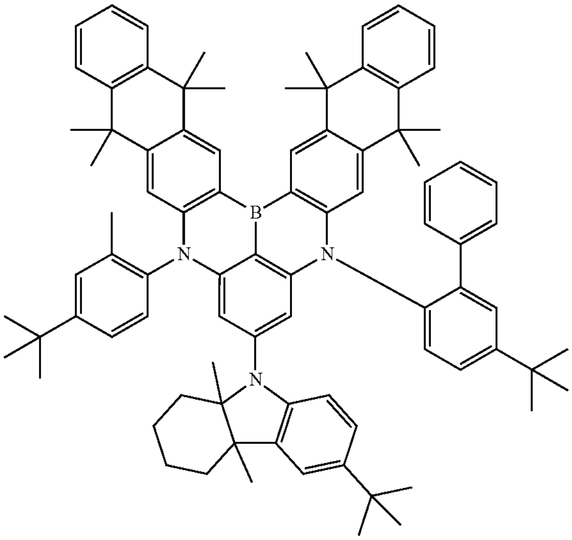
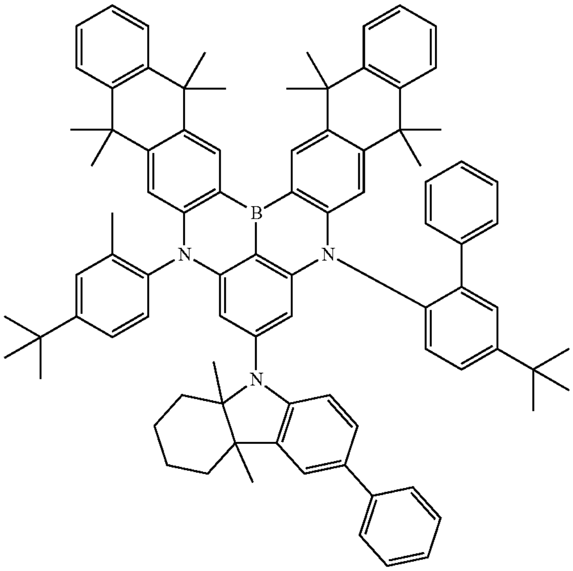
-continued
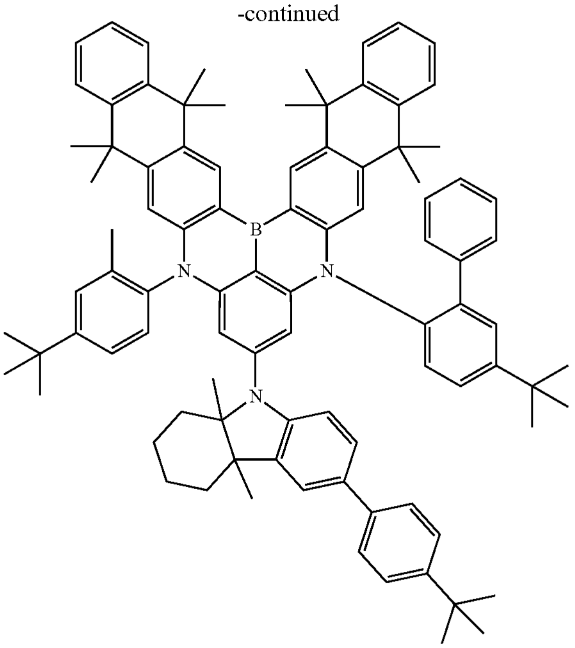
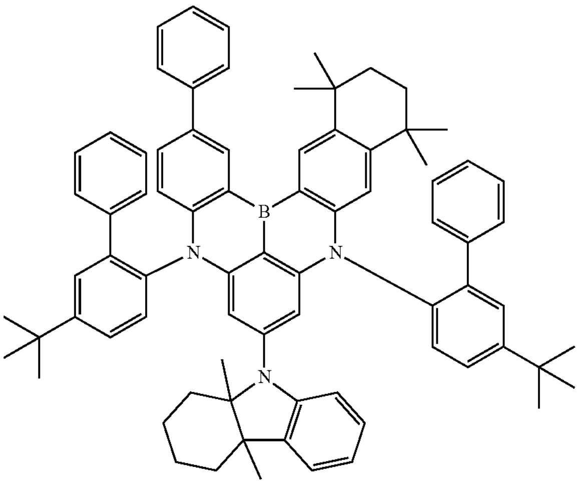
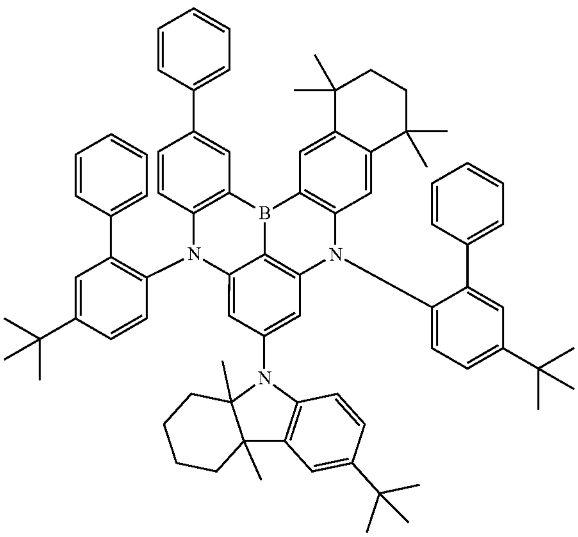

-continued
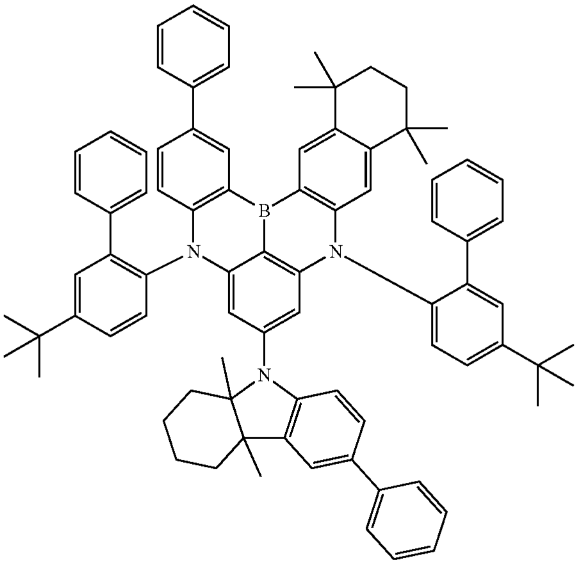
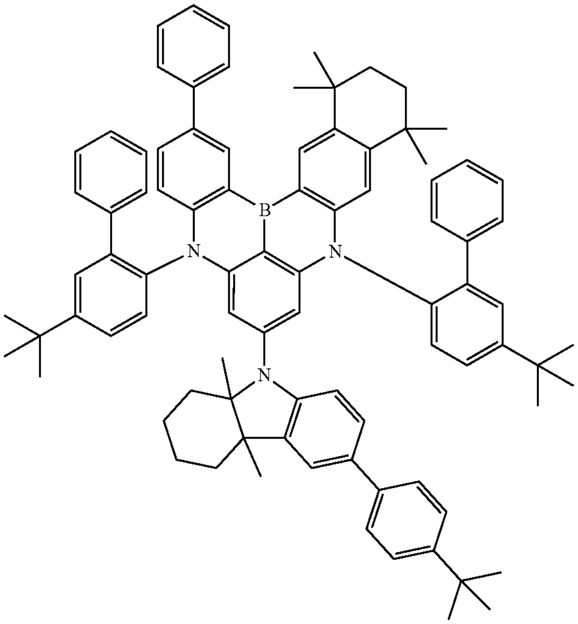
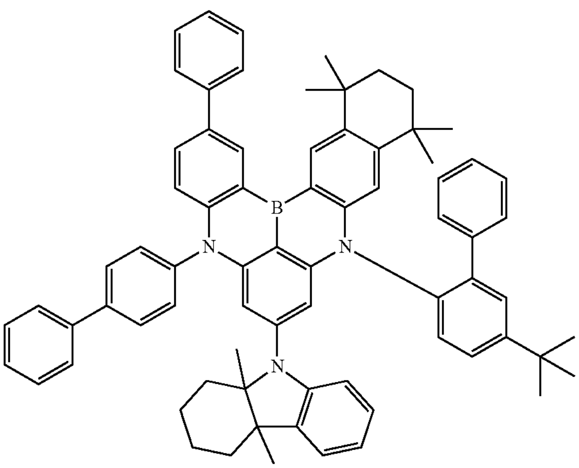
-continued
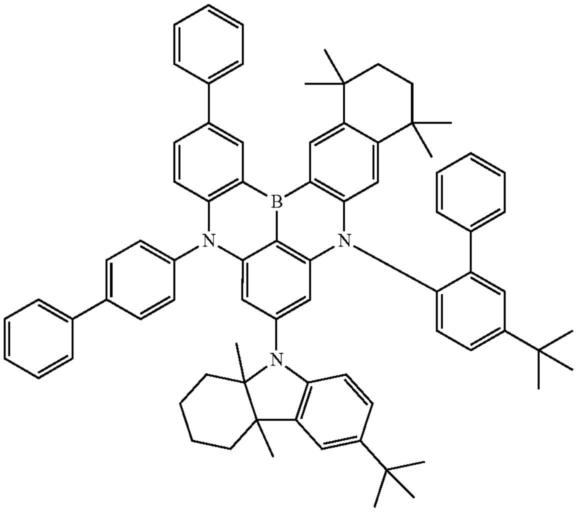
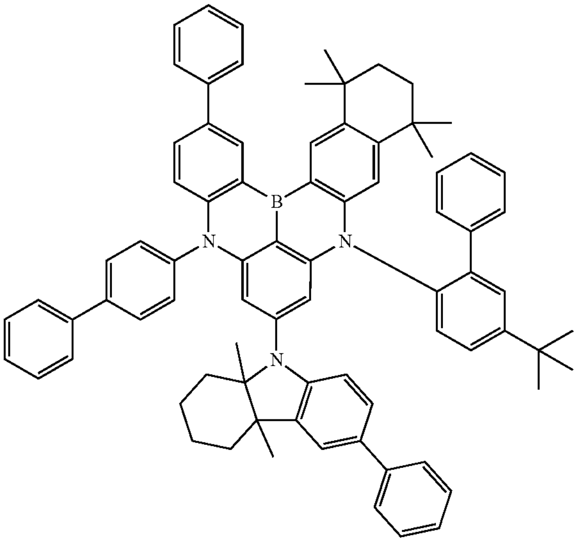
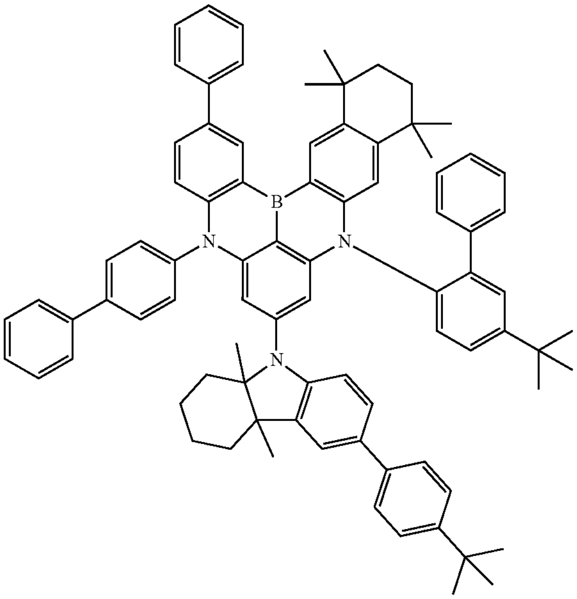

-continued
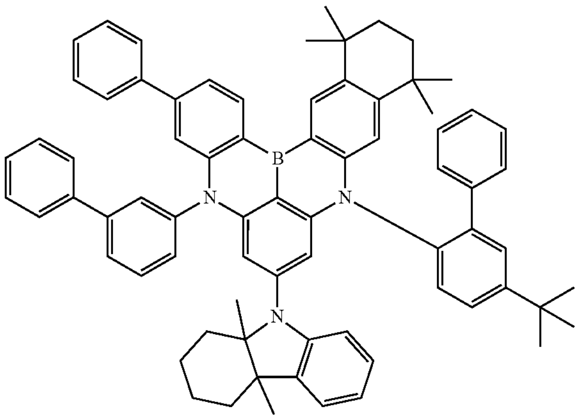
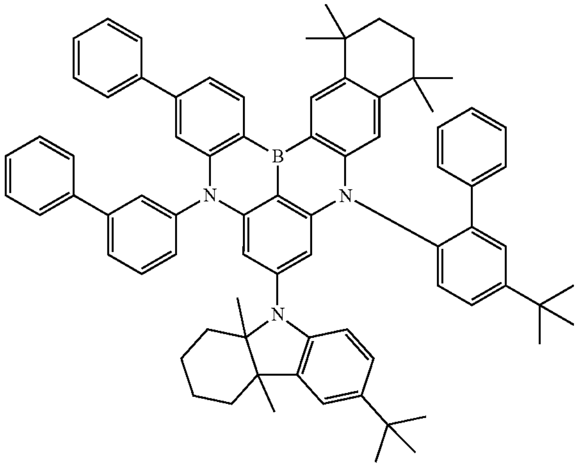
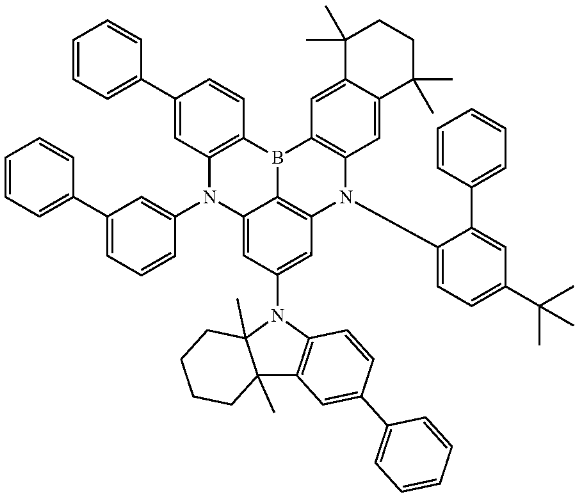
-continued
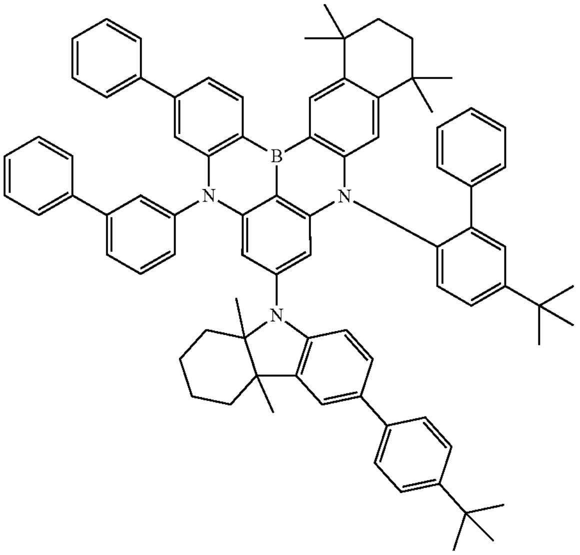
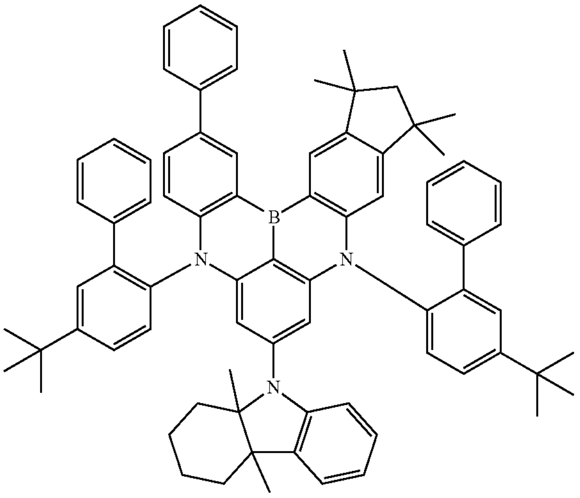
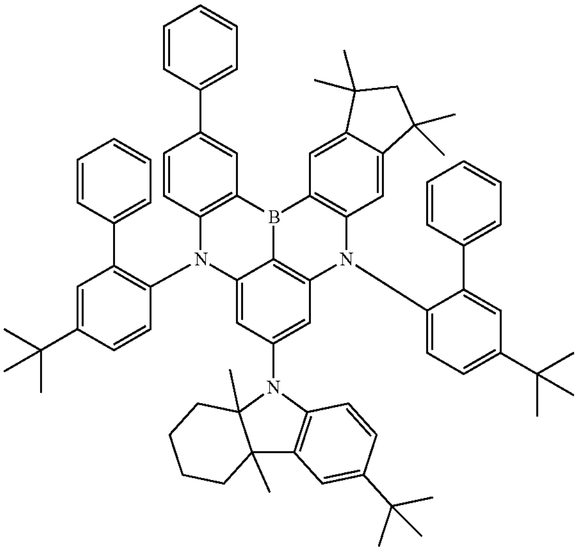

-continued
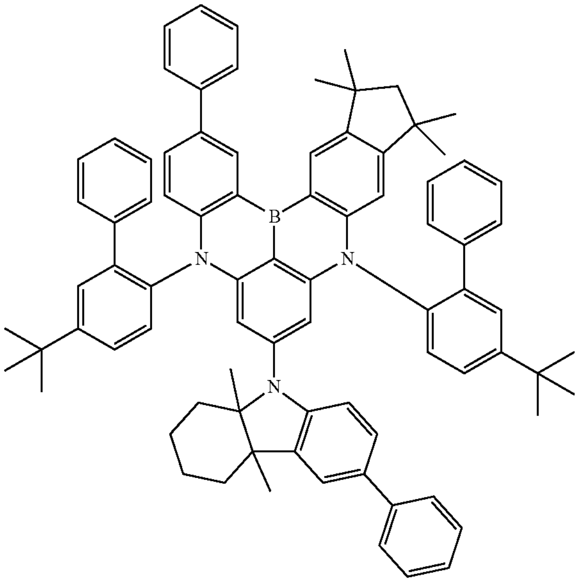
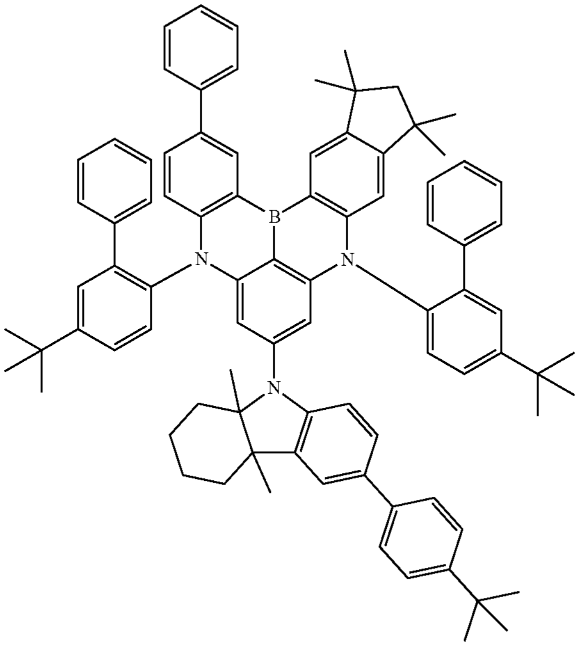
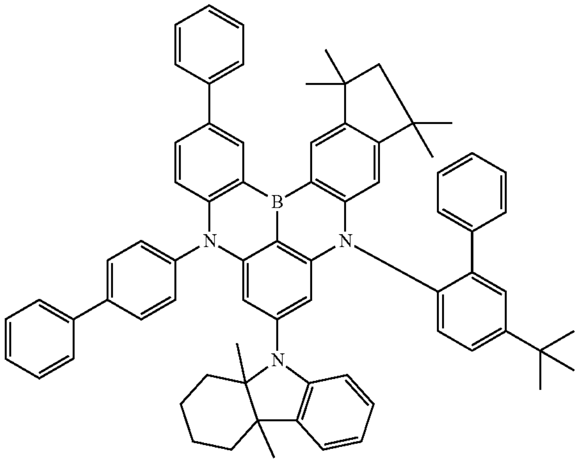
-continued
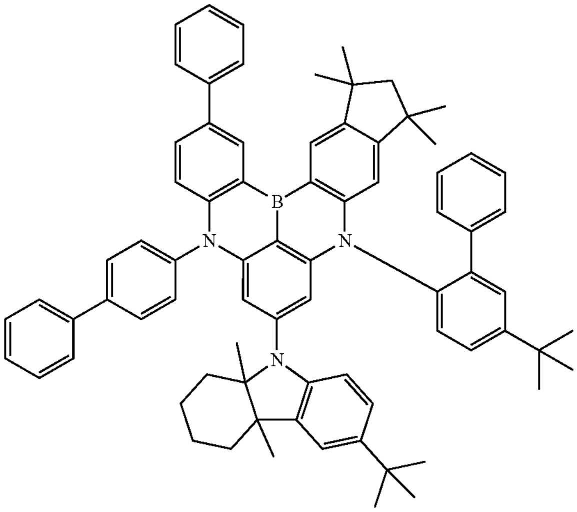
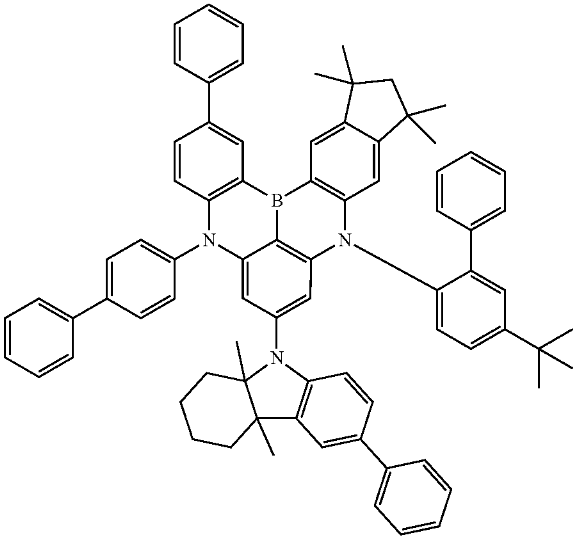
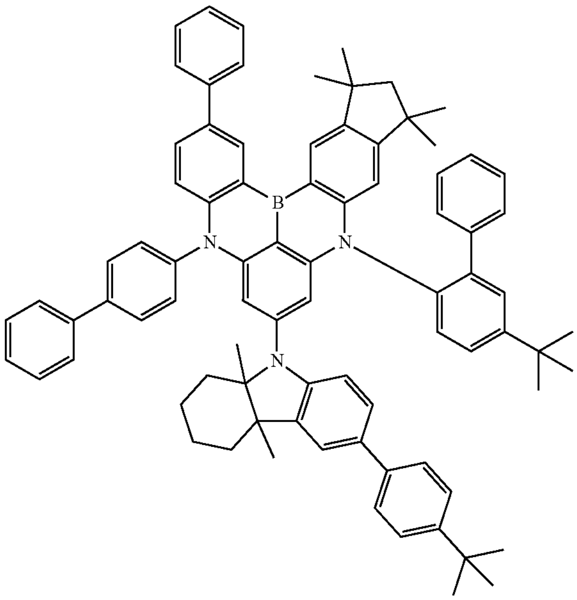

-continued
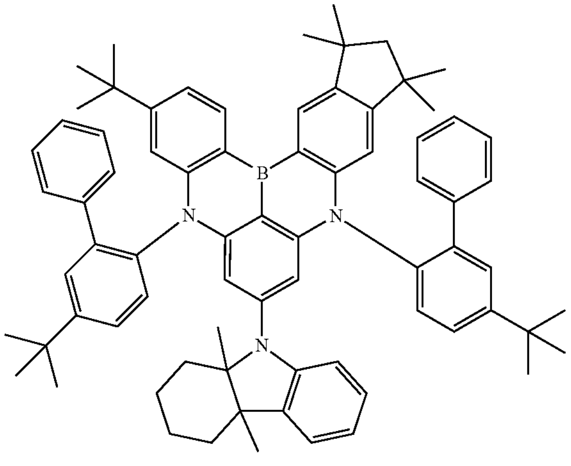
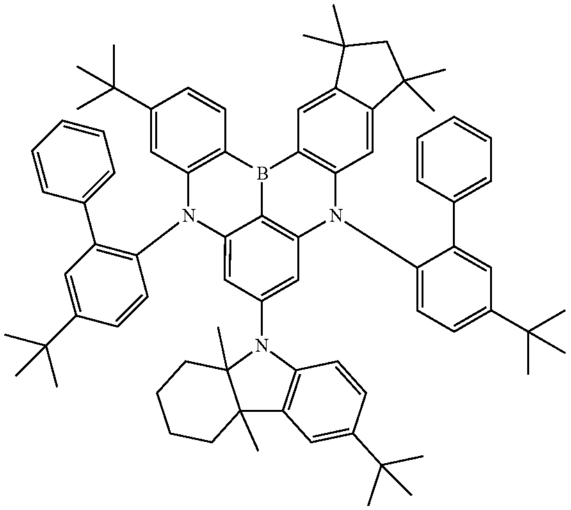
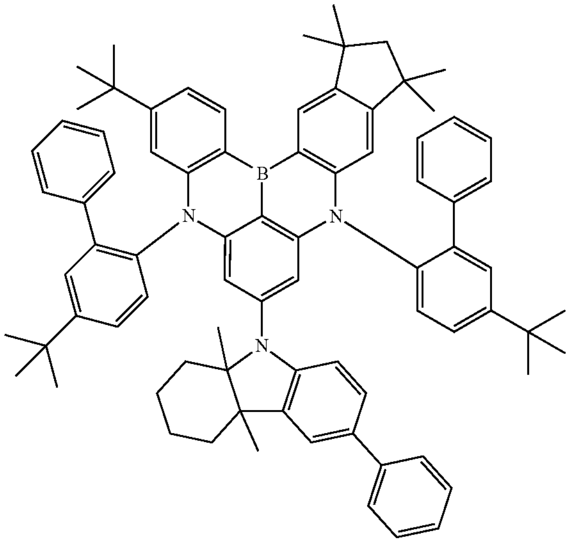
-continued
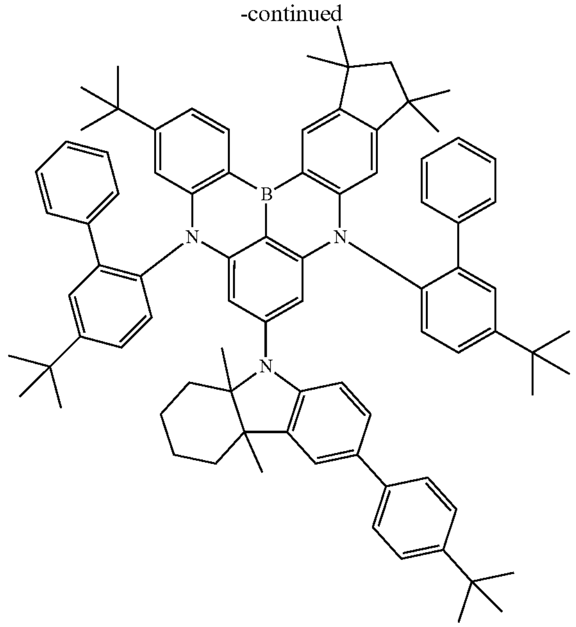
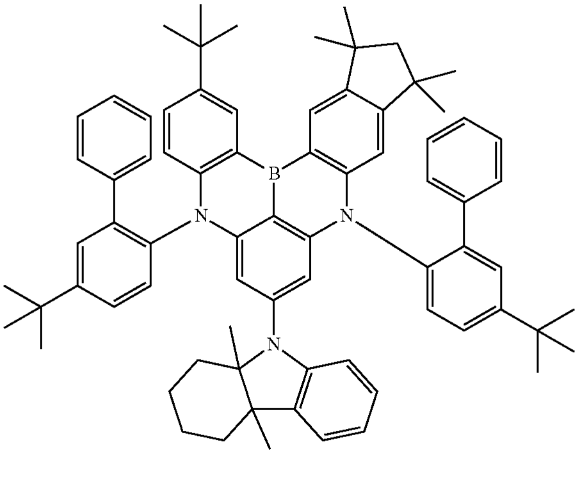
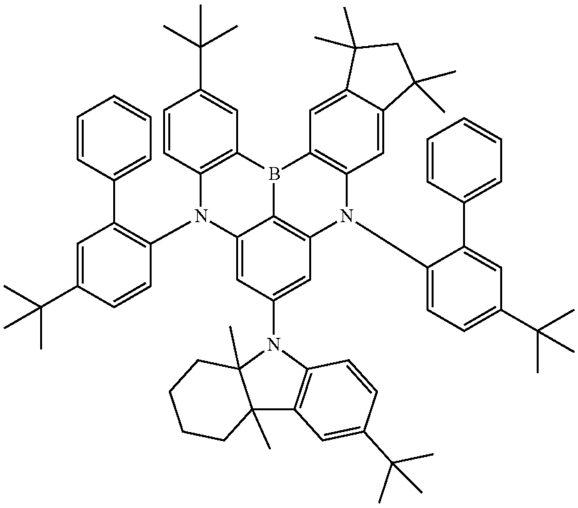

-continued
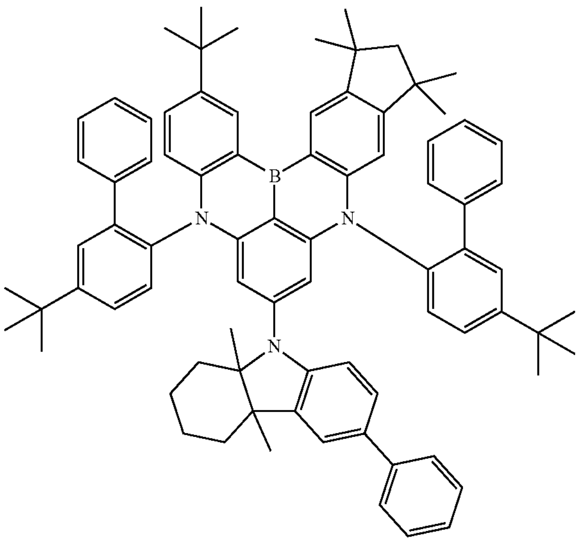
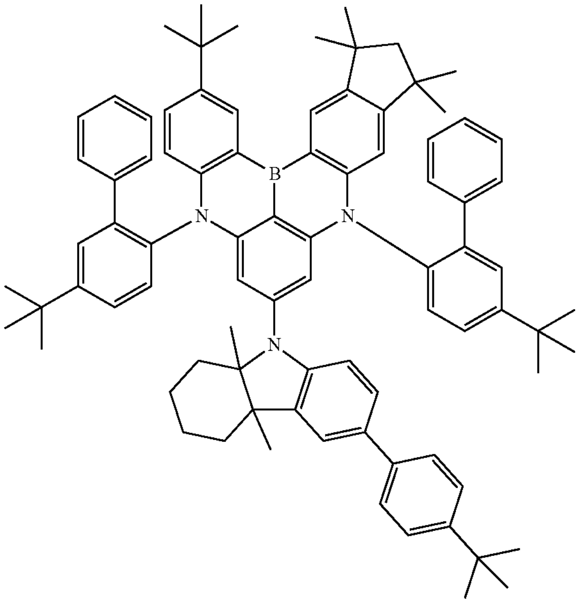
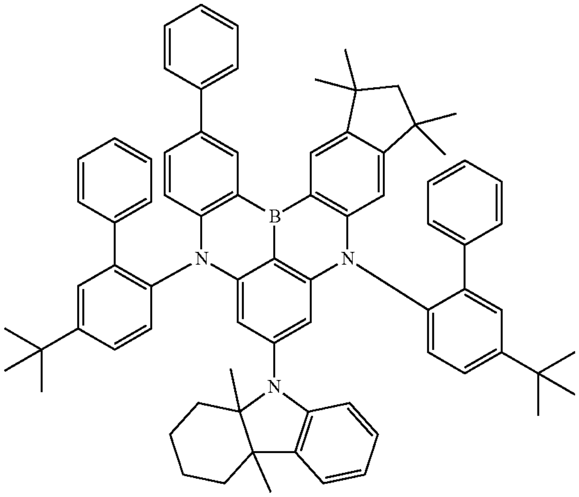
-continued
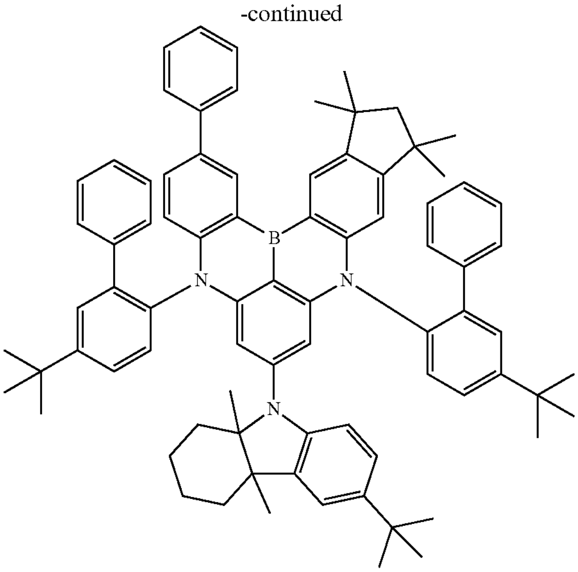
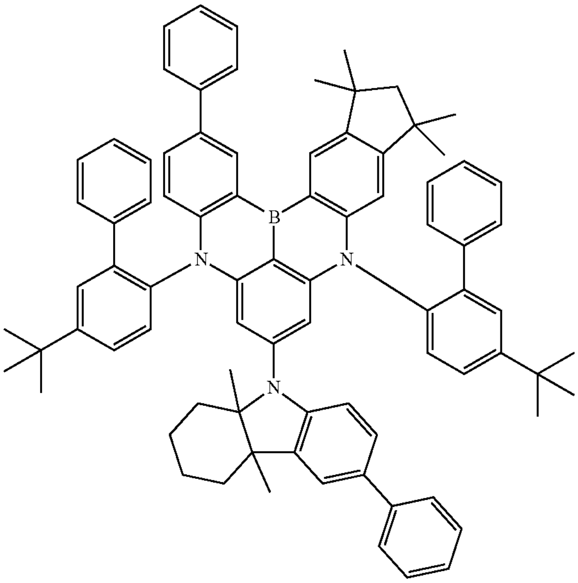

-continued
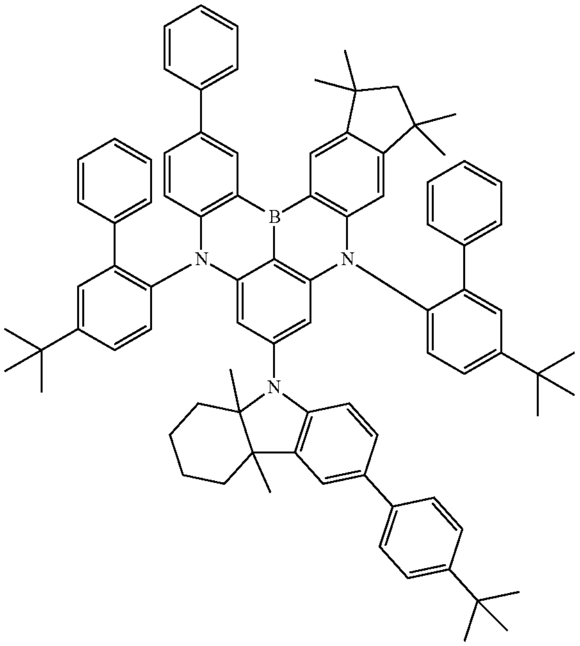
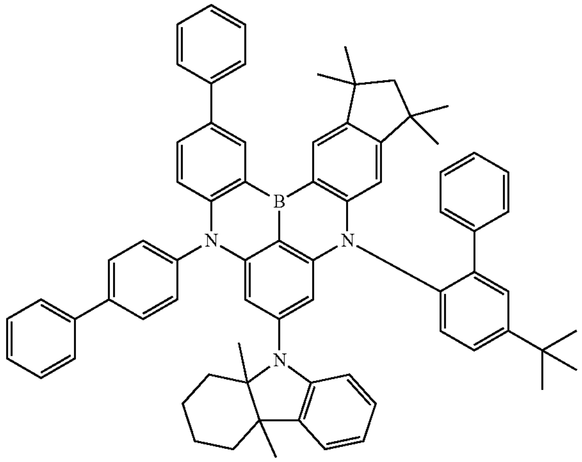
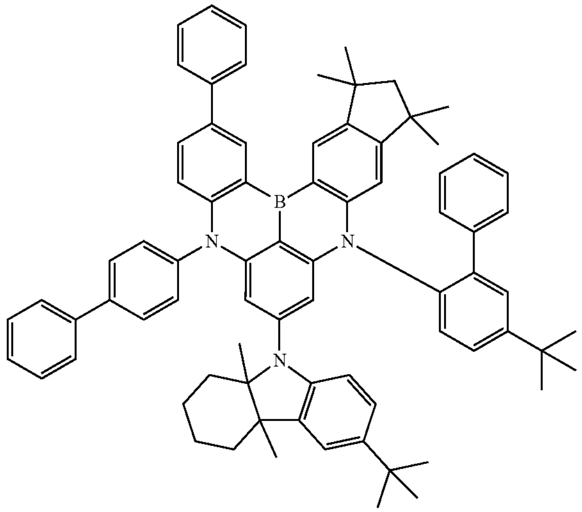
-continued
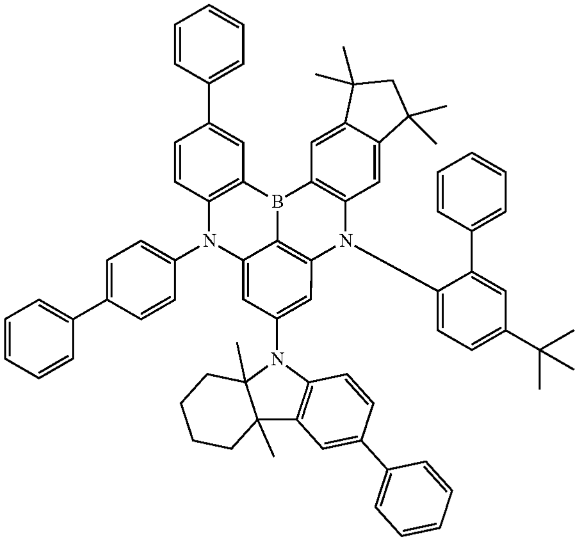
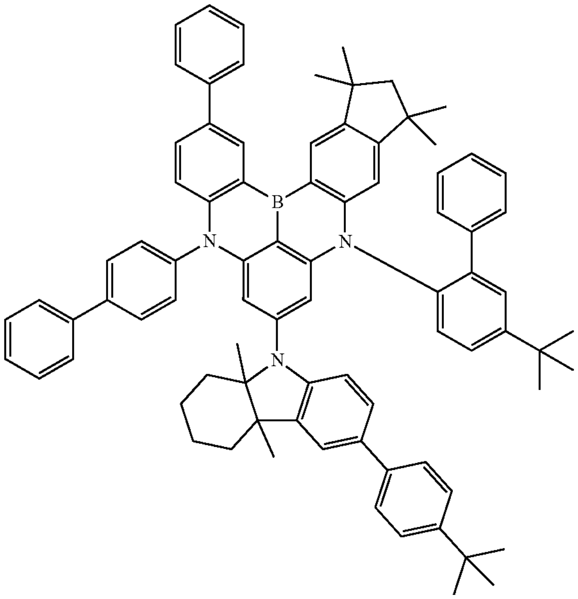
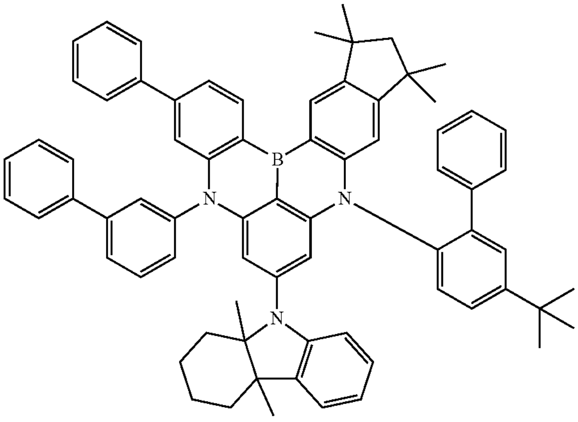

-continued
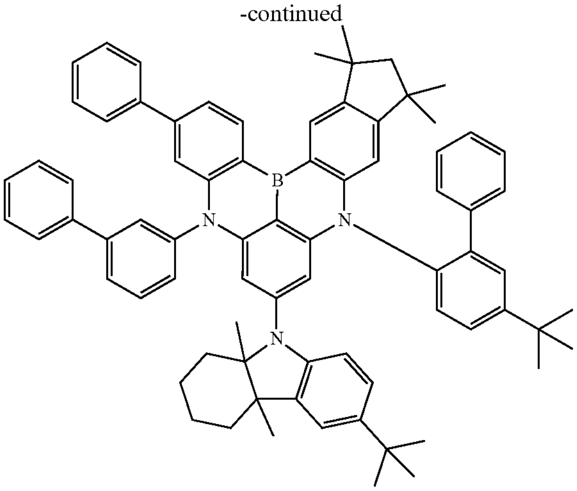
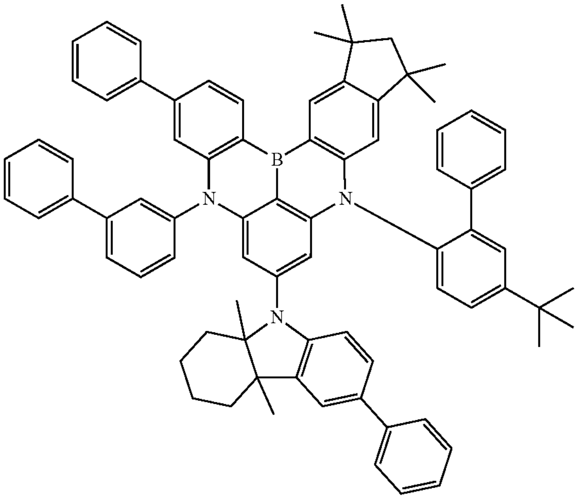
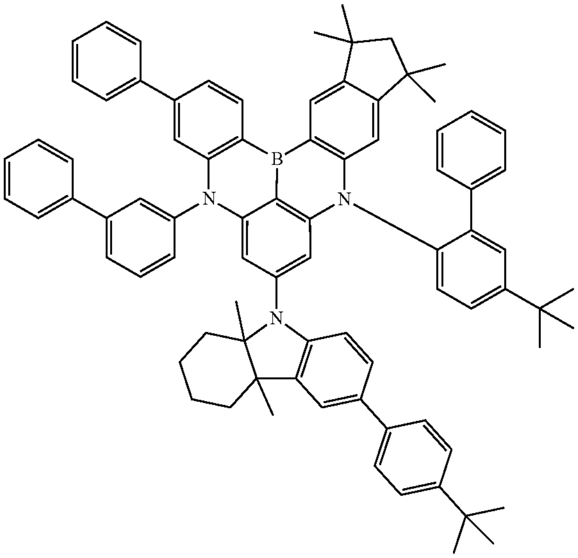
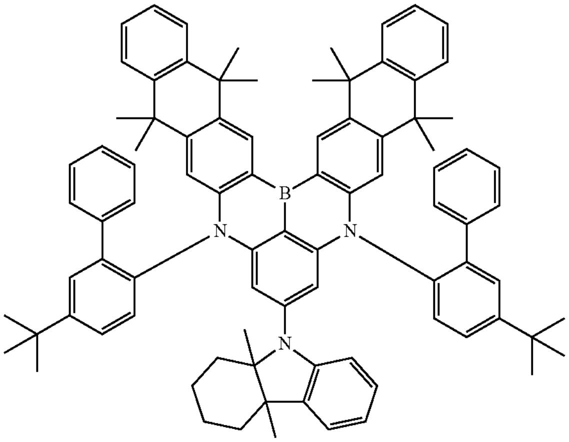
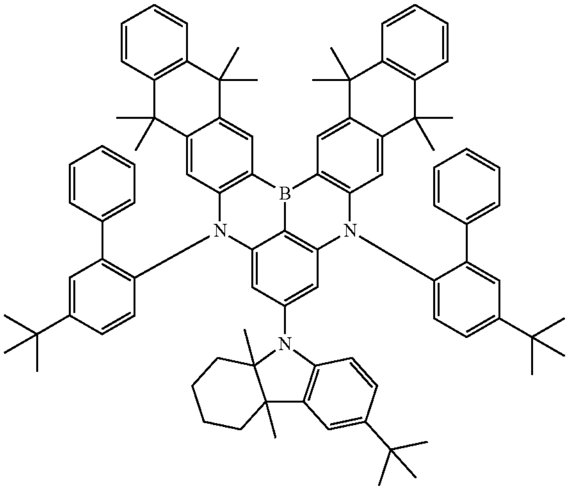
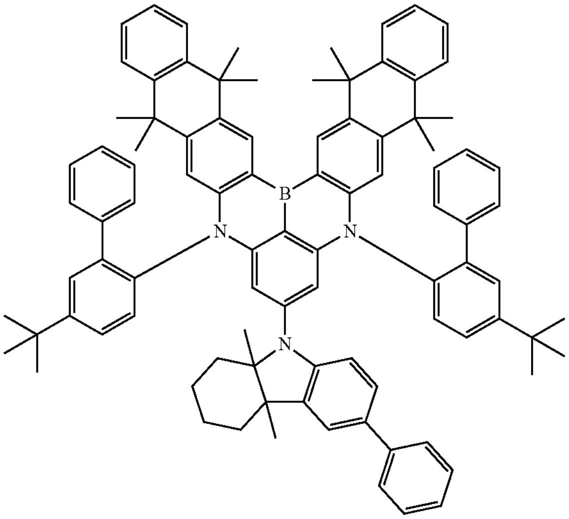

-continued
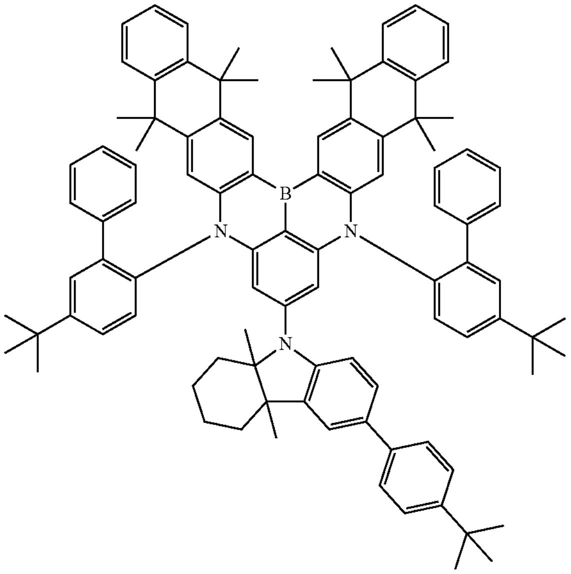
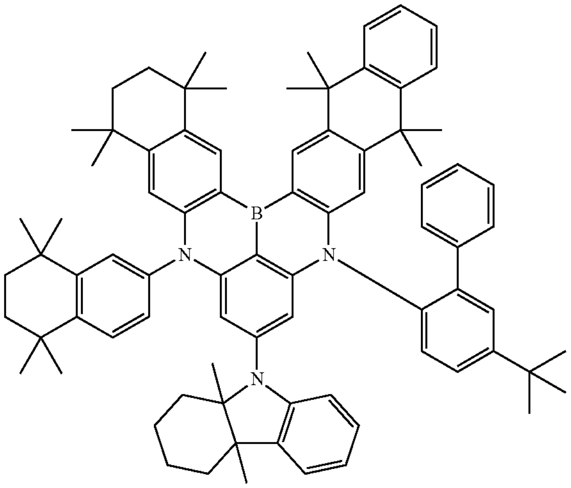
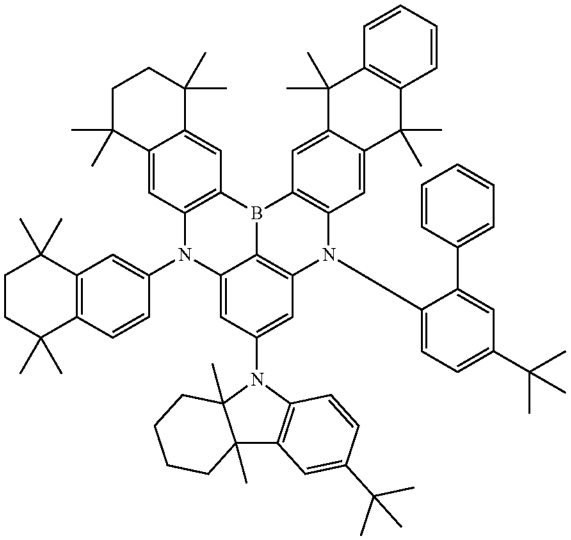
-continued
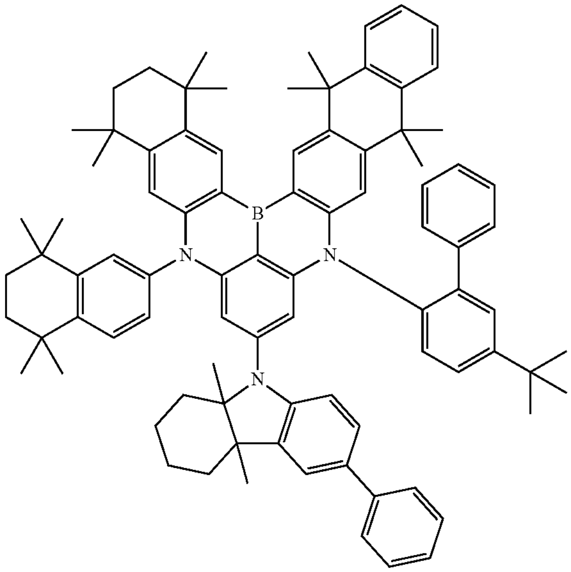
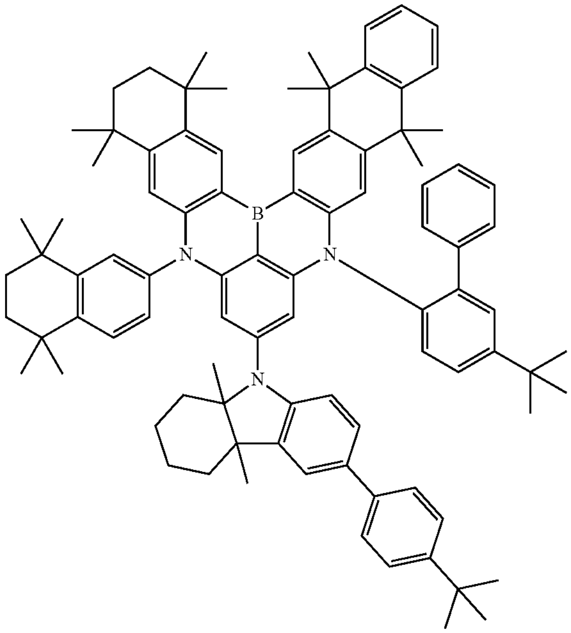
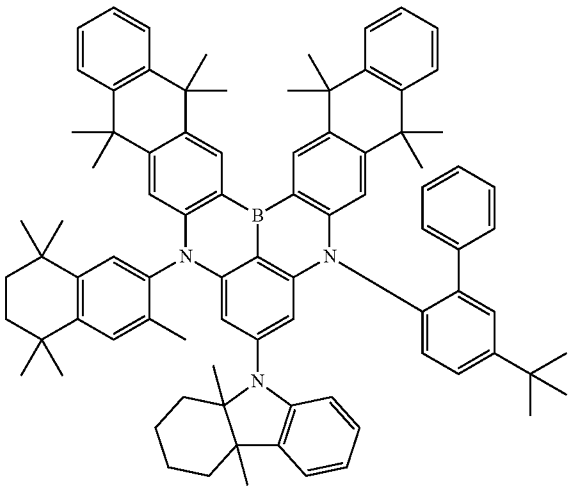

-continued
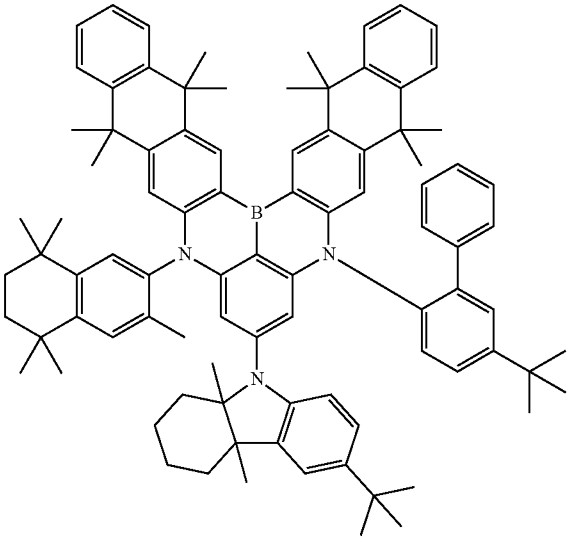
-continued
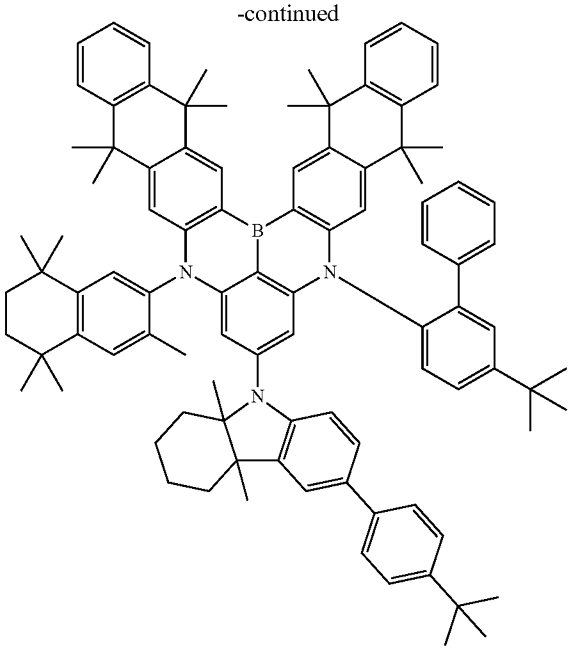
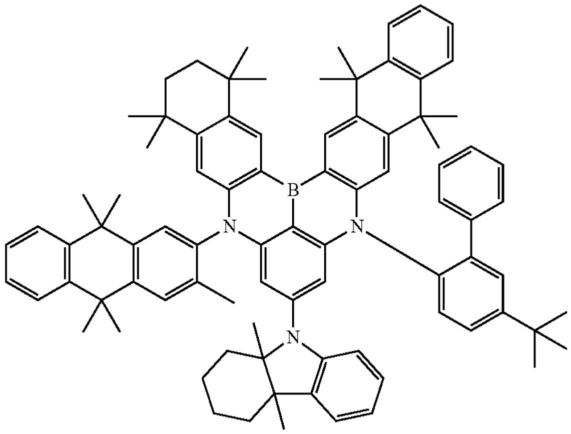
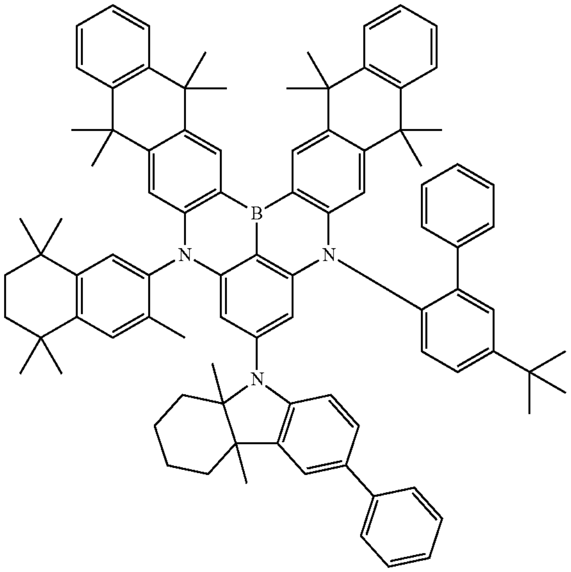
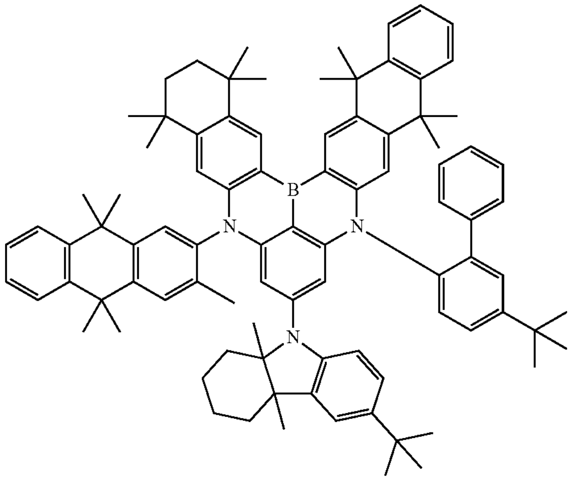

-continued
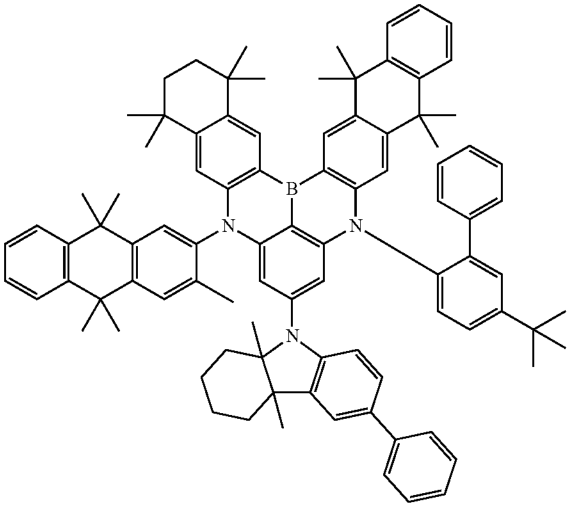
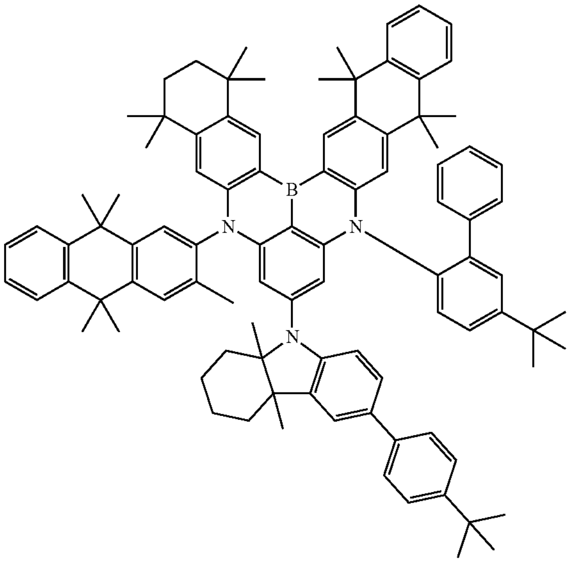
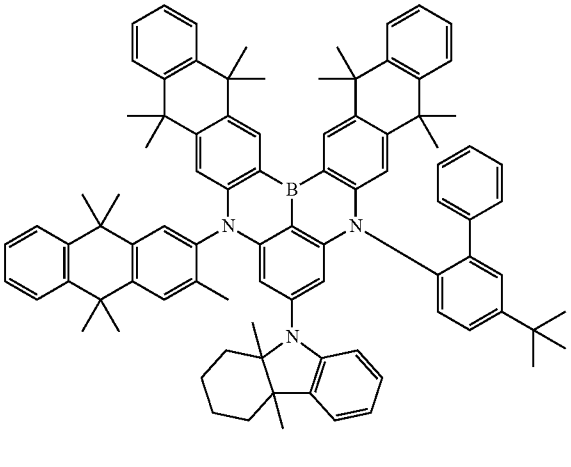
-continued
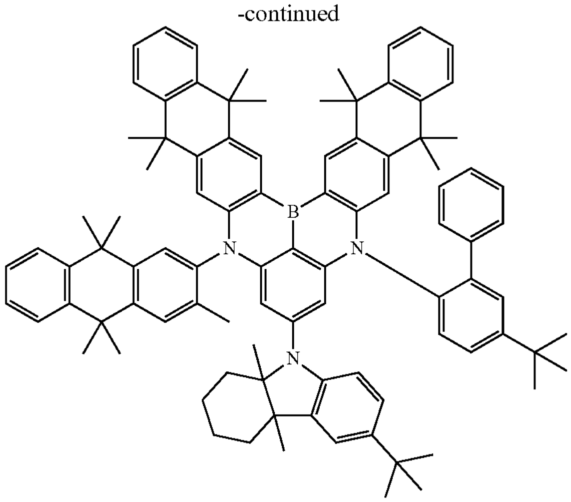
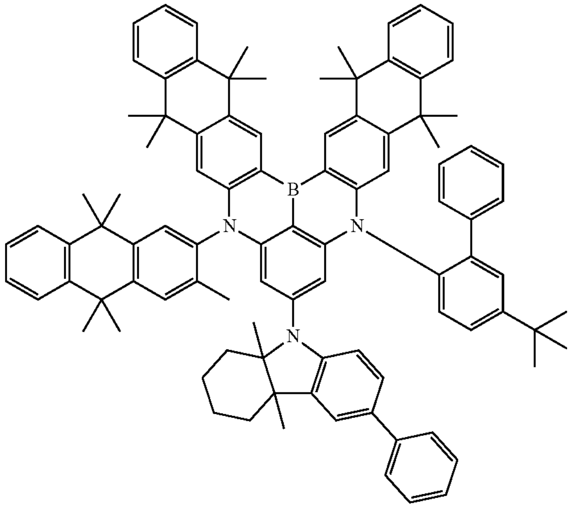
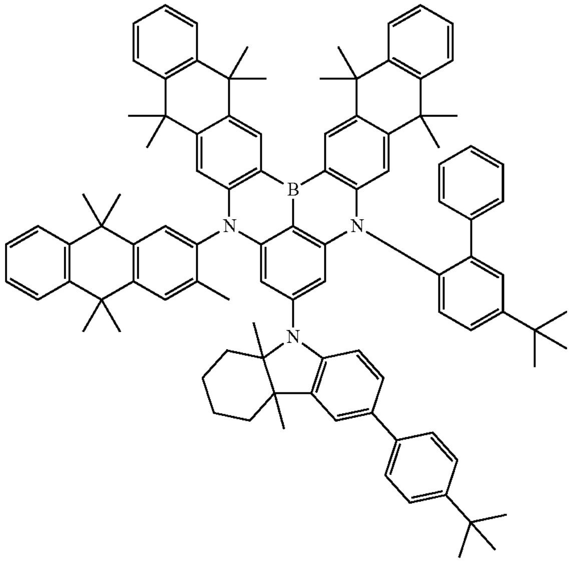

-continued
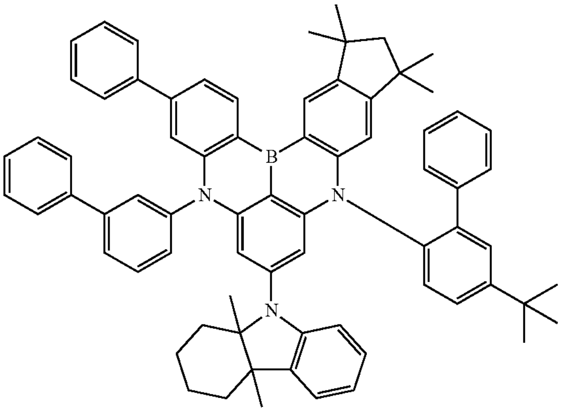
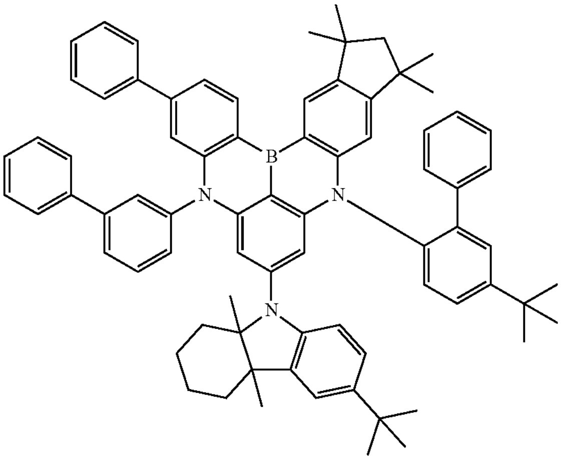
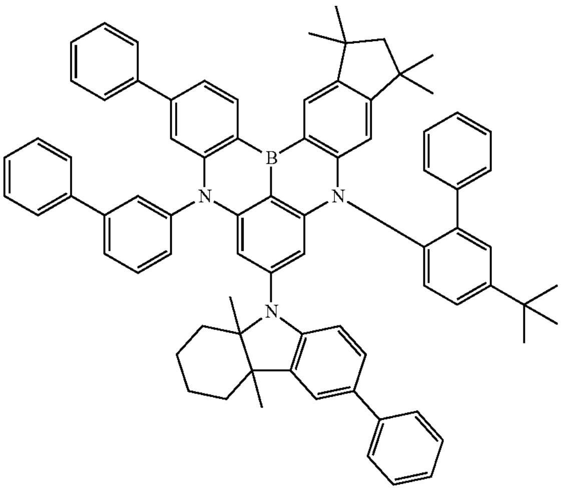
-continued
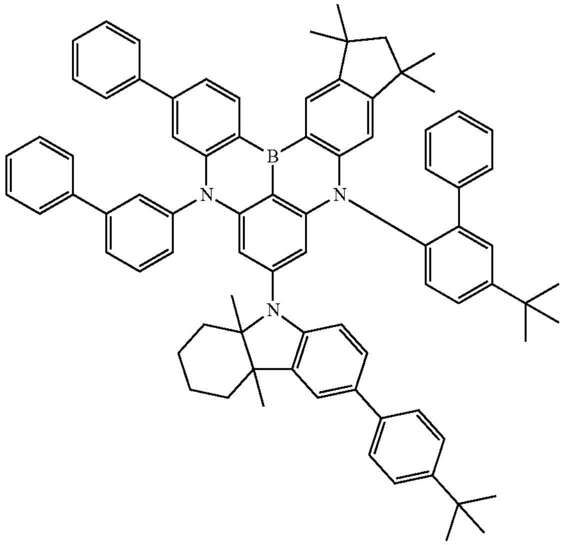
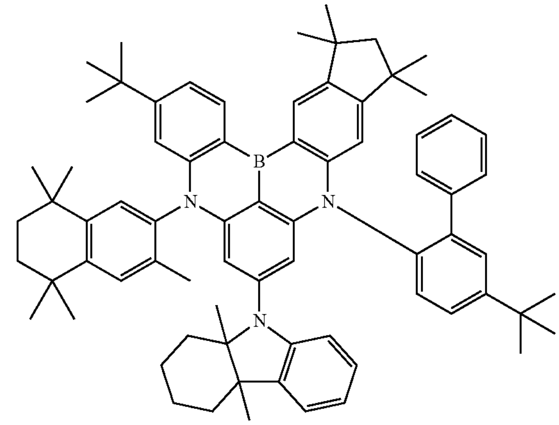
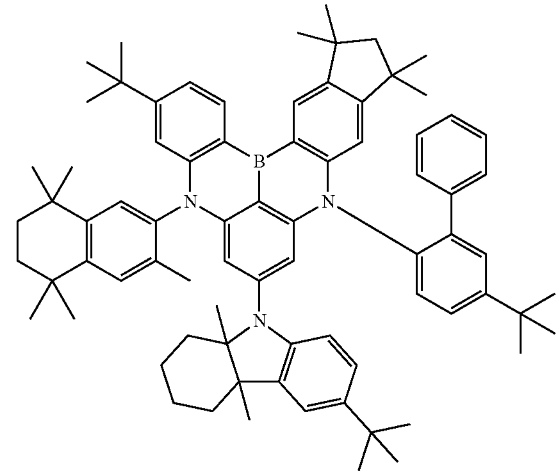

-continued
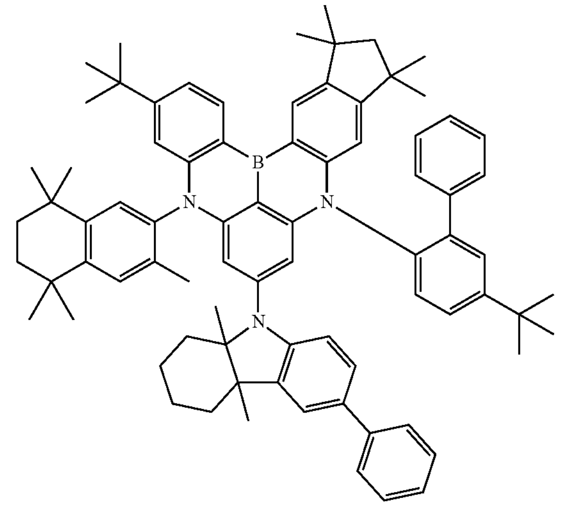
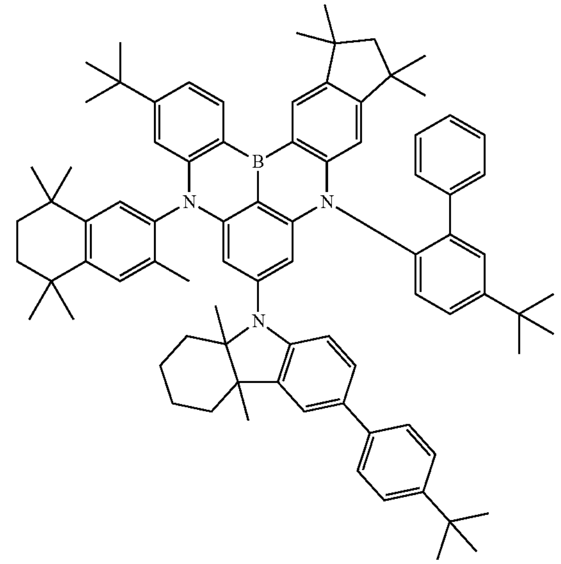
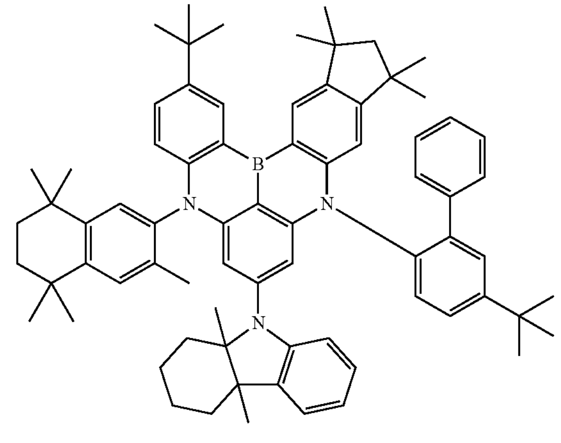
-continued
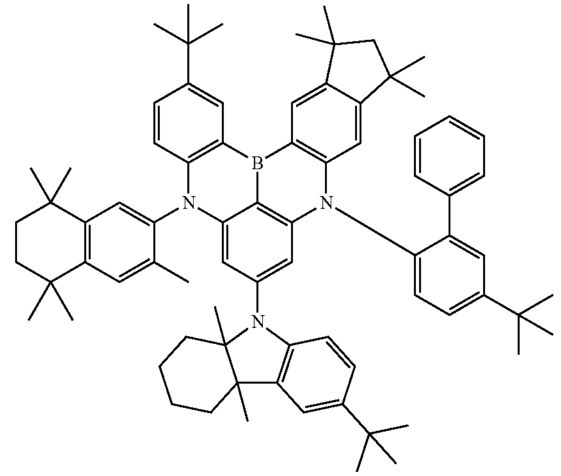
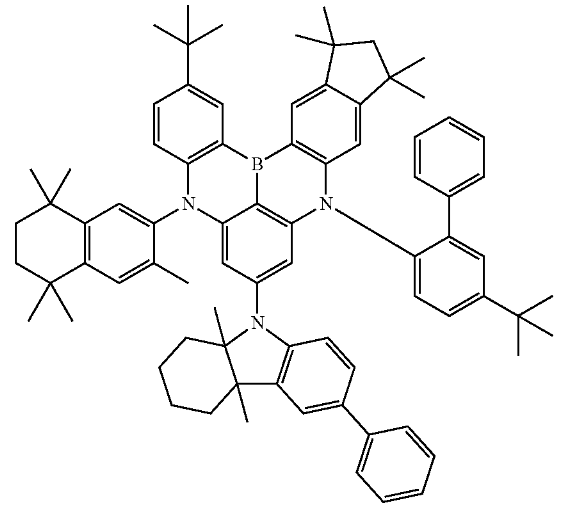
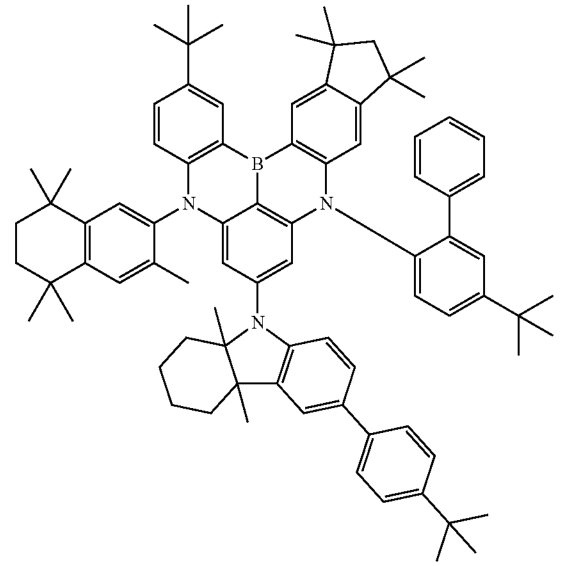

-continued
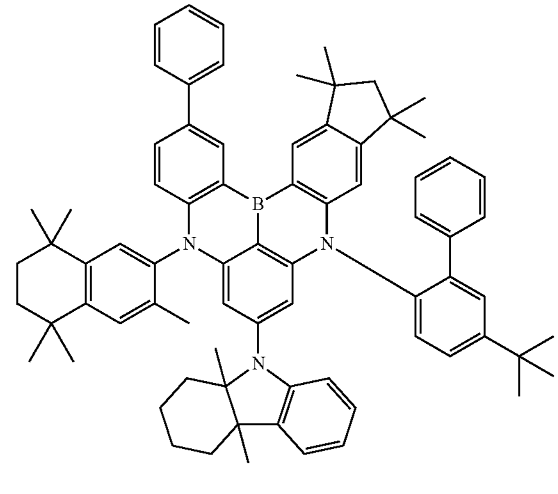
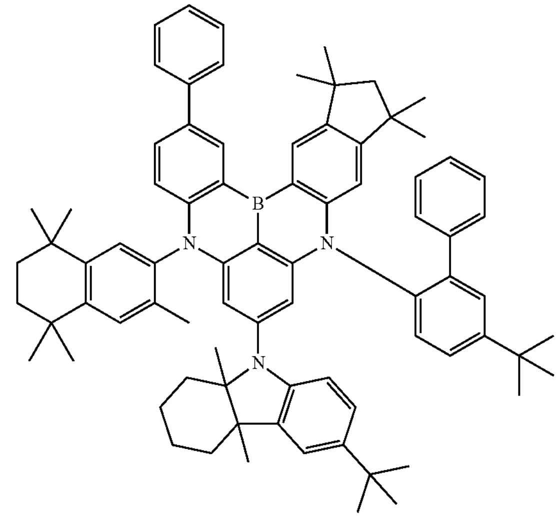
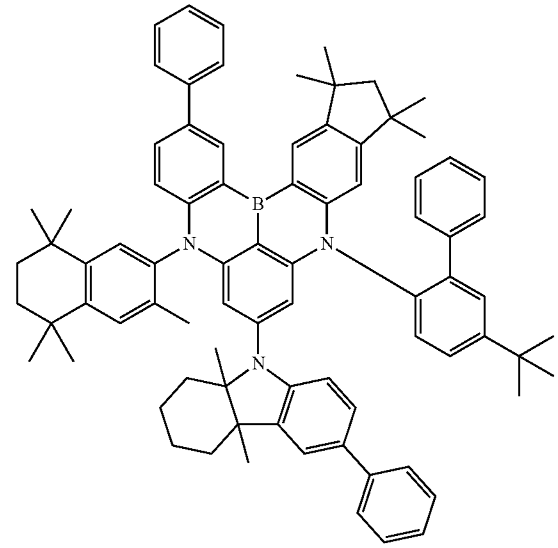
-continued
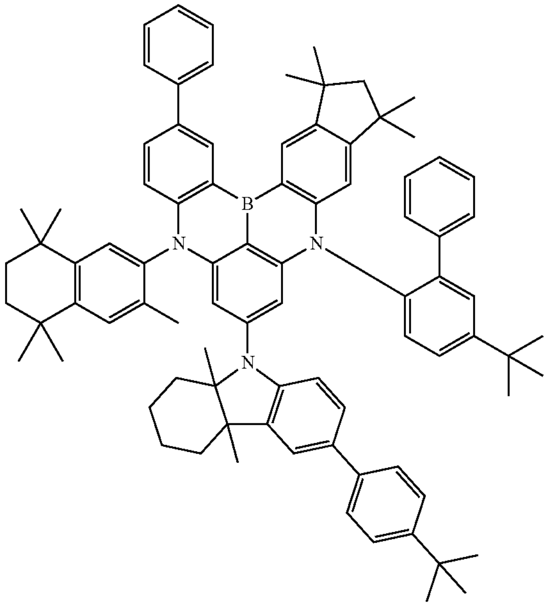
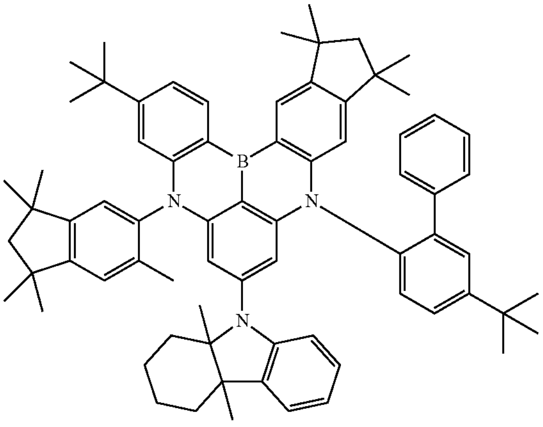
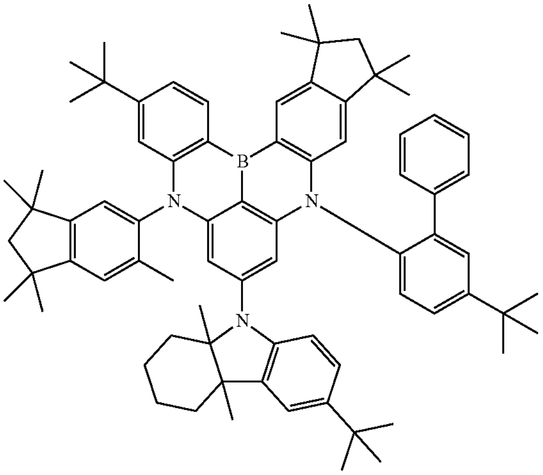

-continued
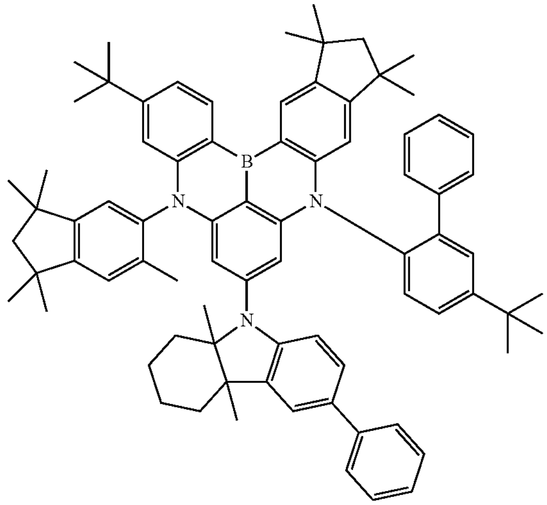
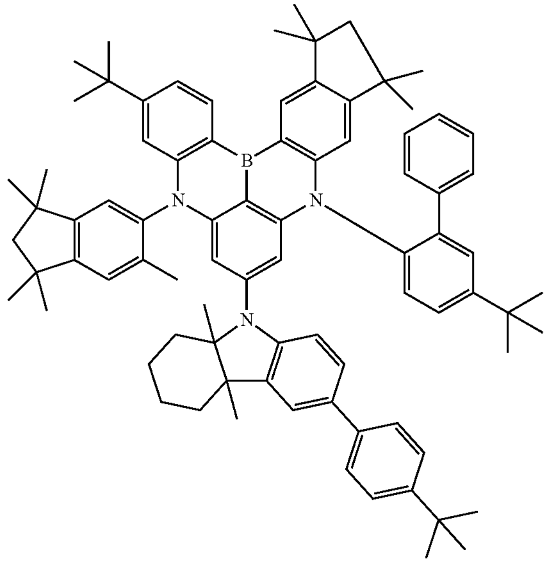
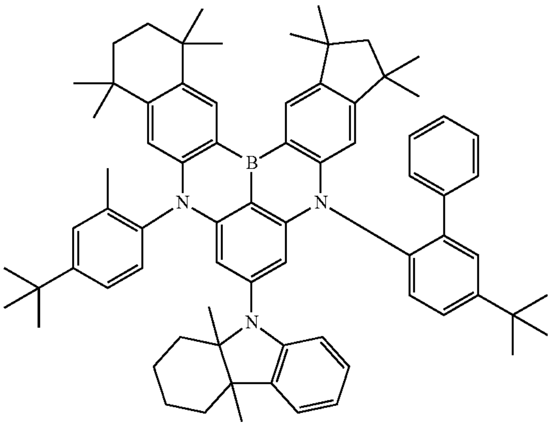
-continued
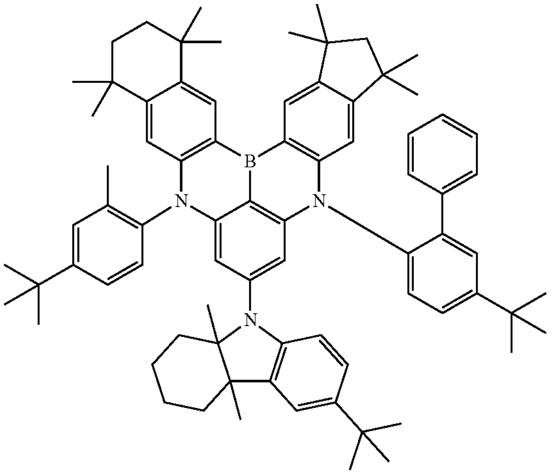
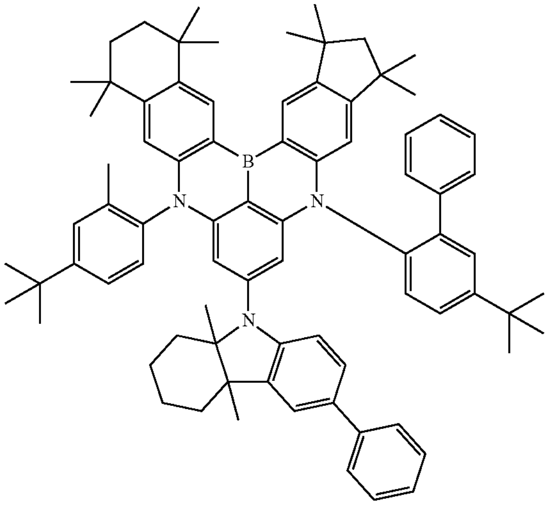
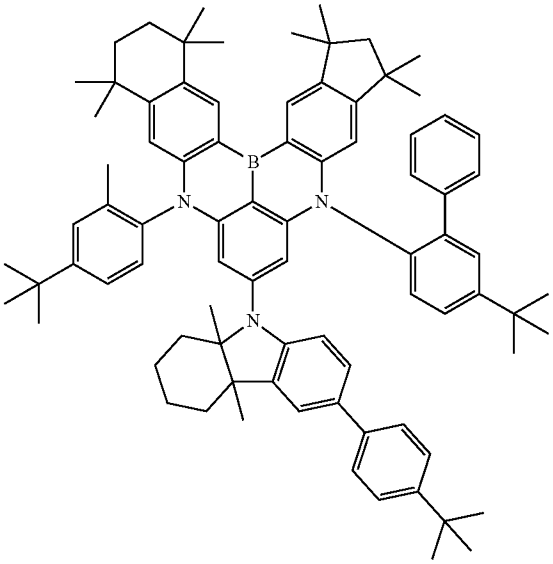

-continued
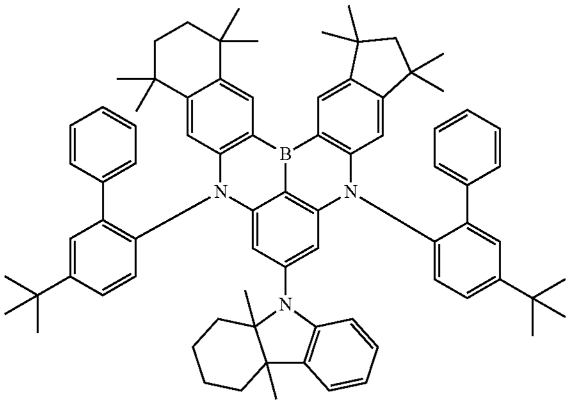
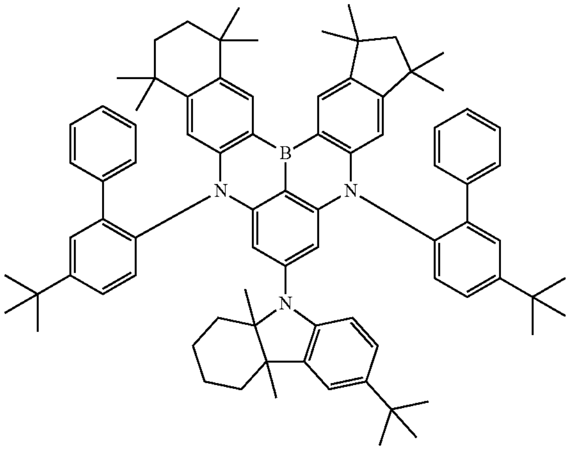
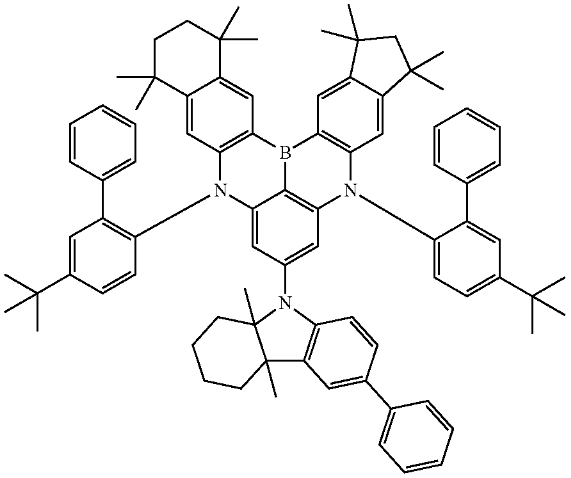
-continued
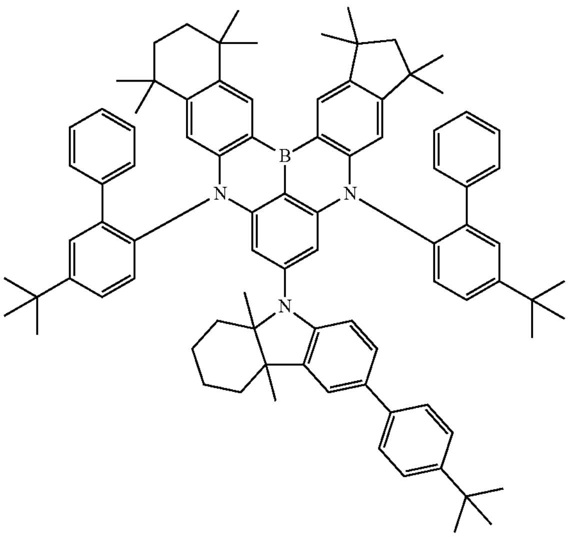
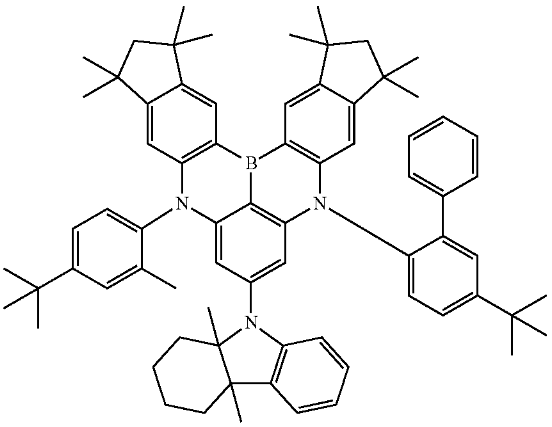
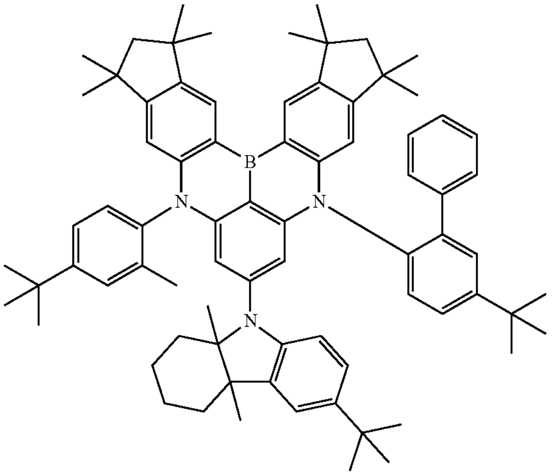

-continued
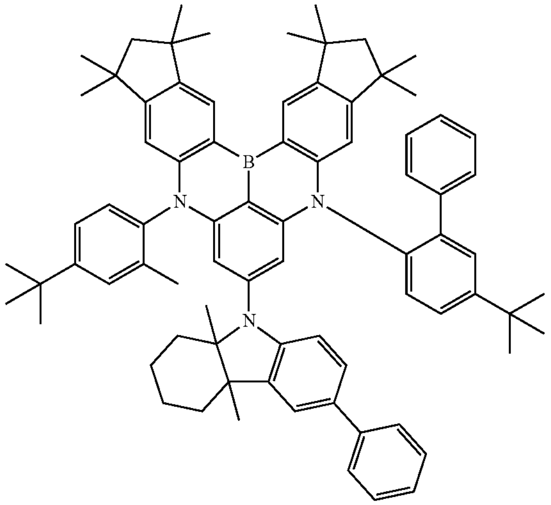
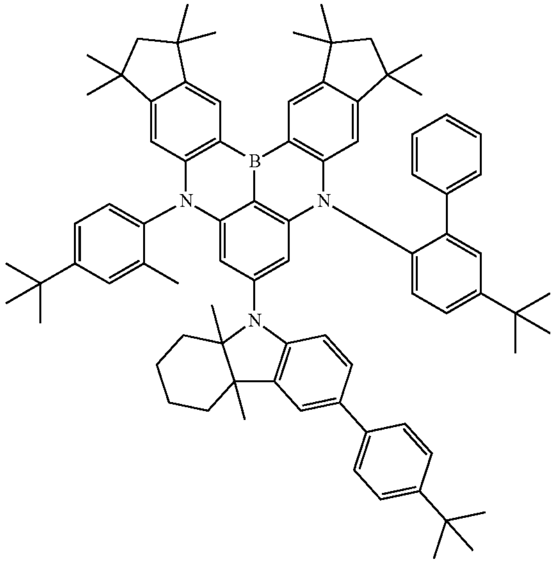
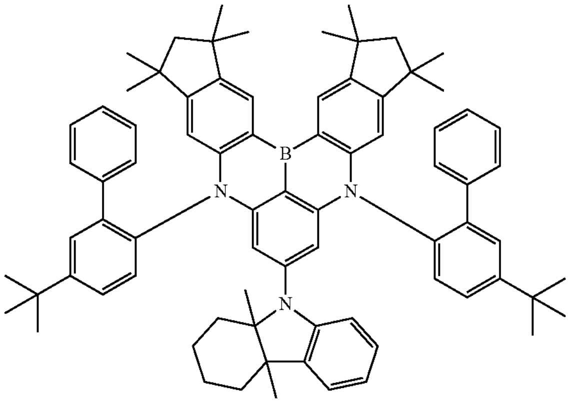
-continued
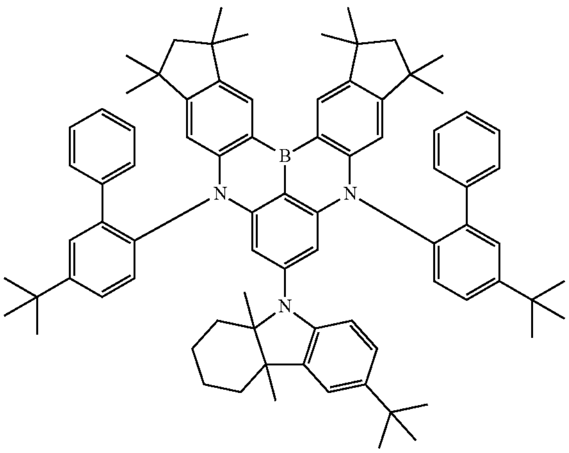
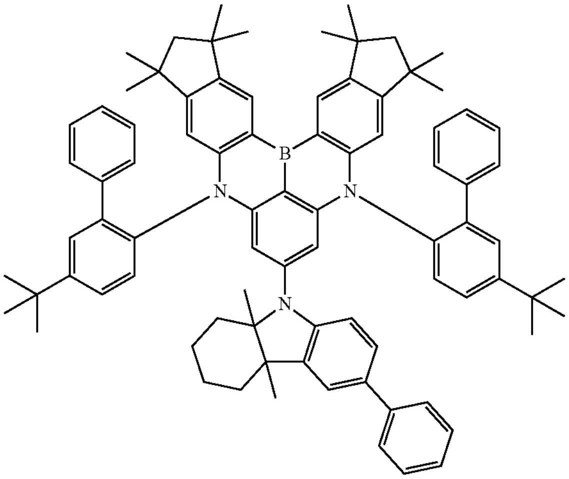
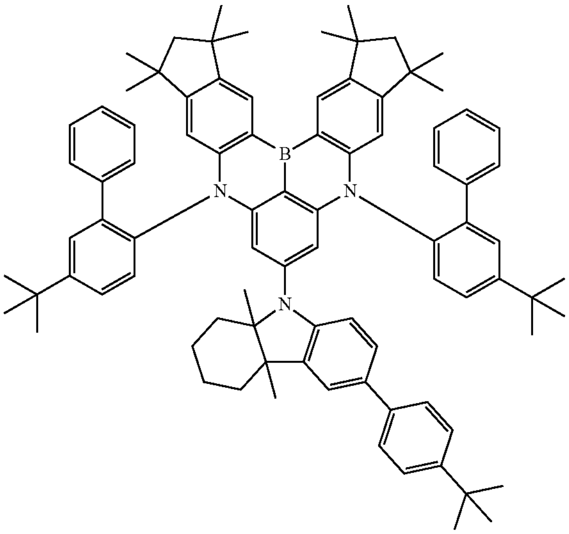

-continued
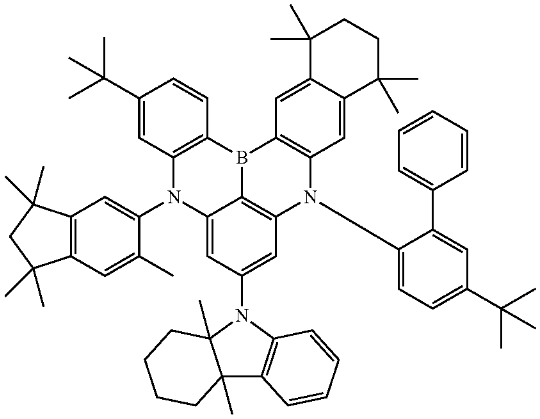
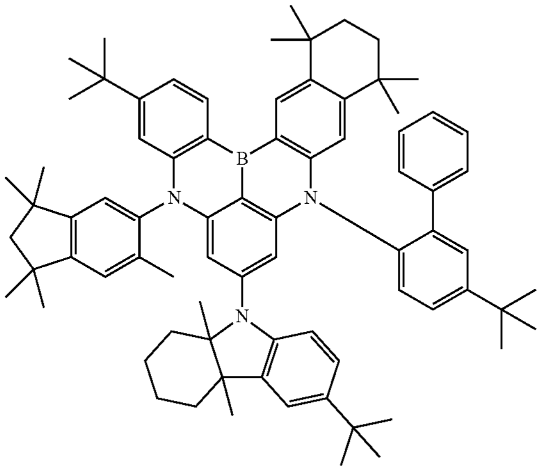
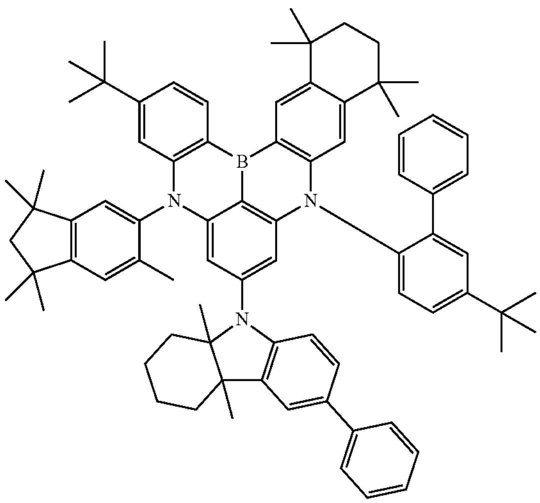
-continued
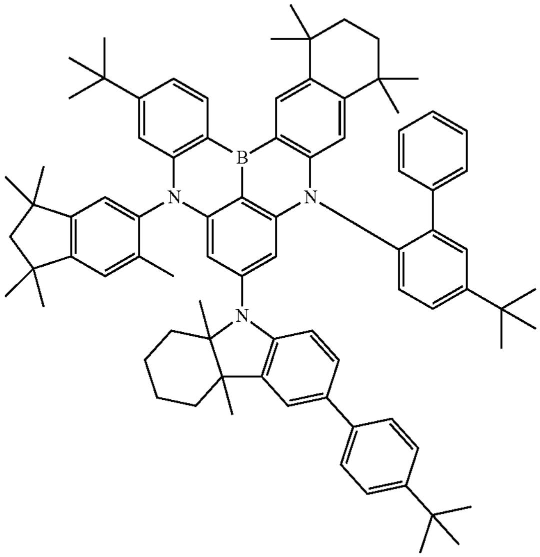
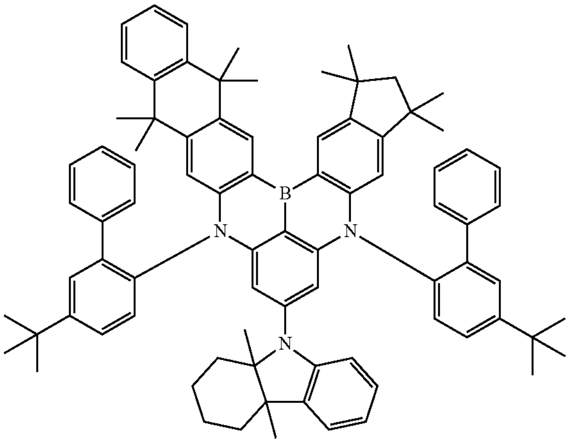
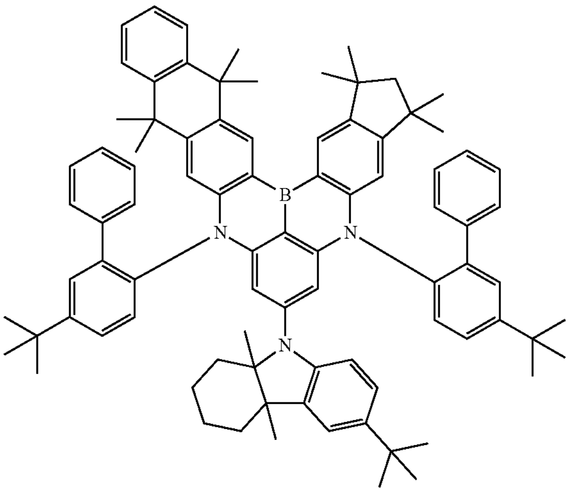

-continued
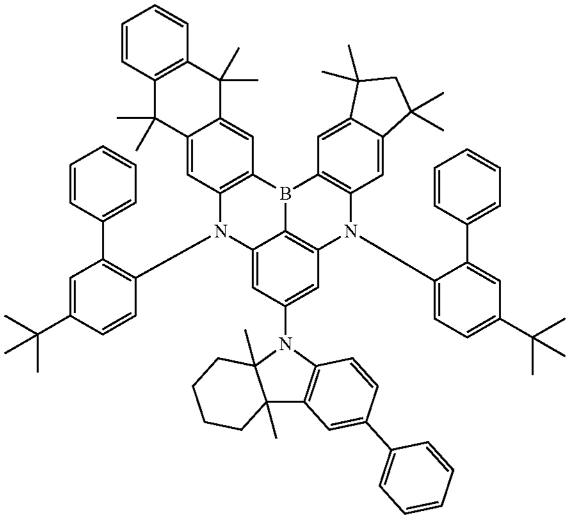
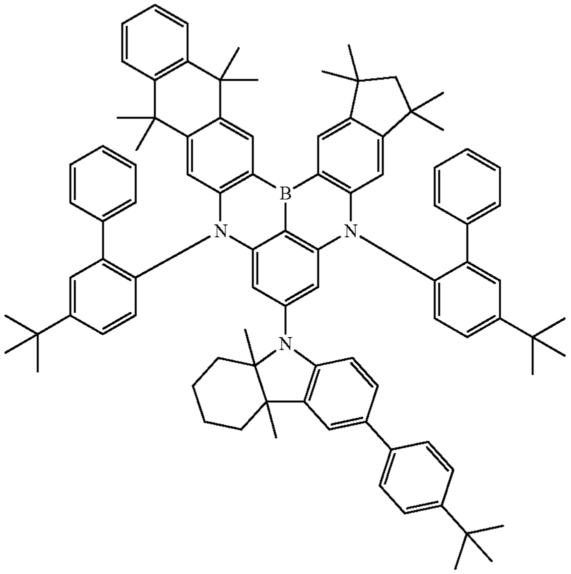
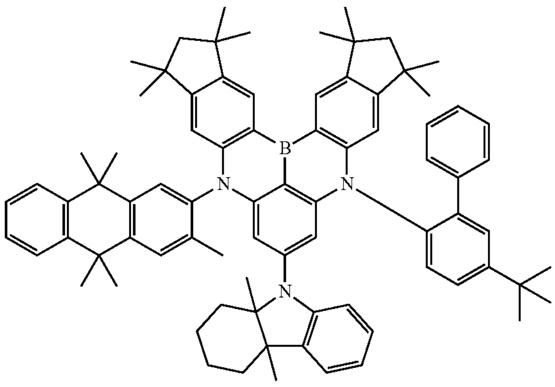
-continued
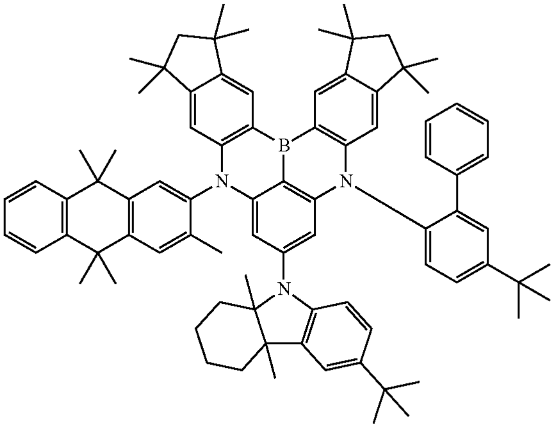
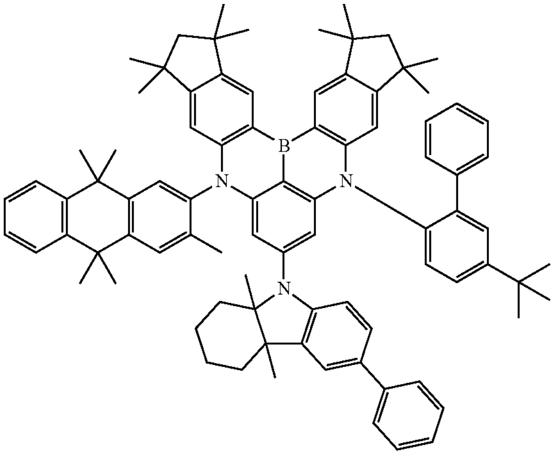
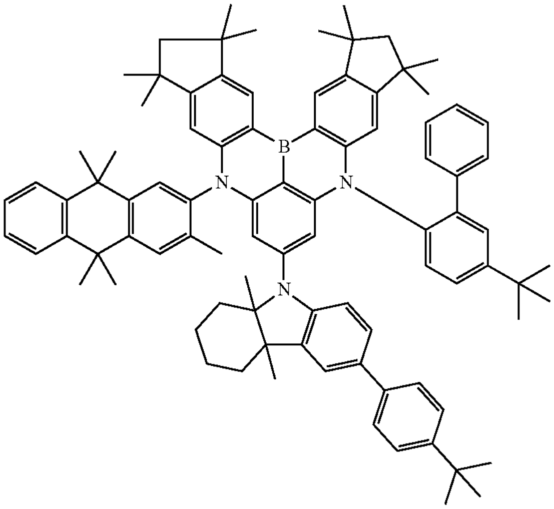

-continued
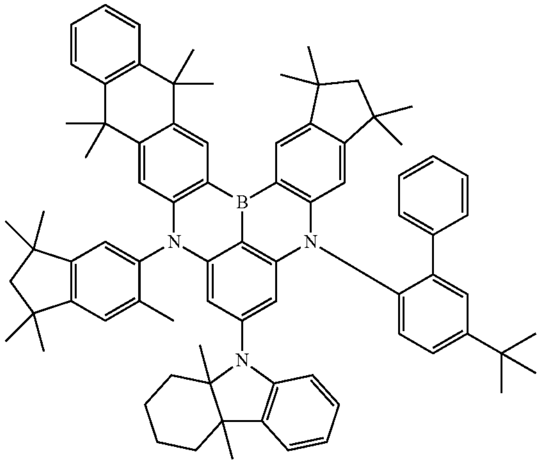
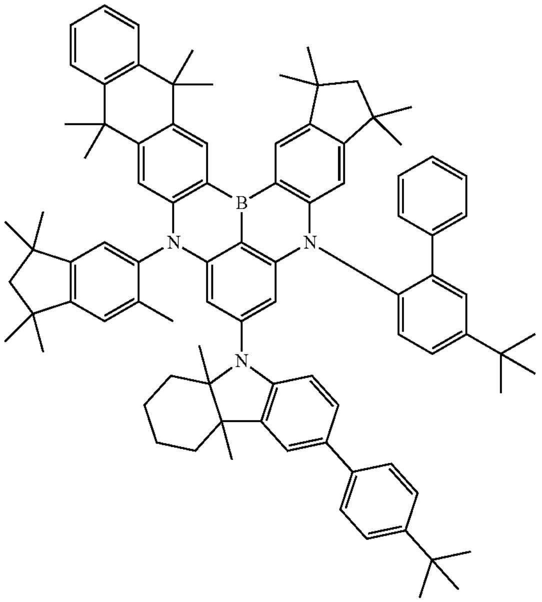
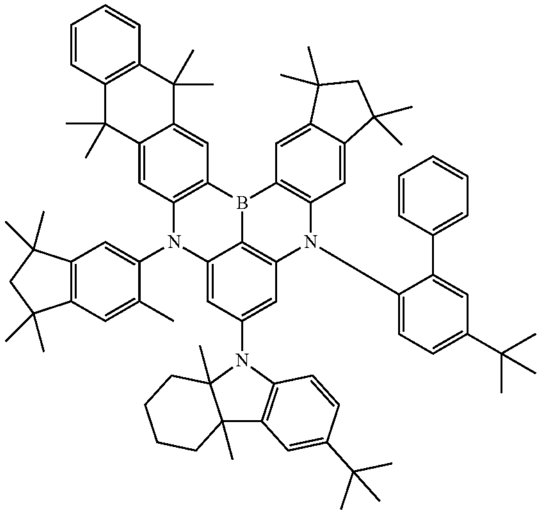
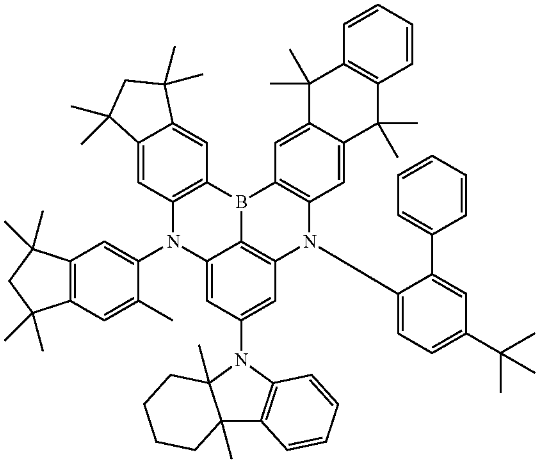
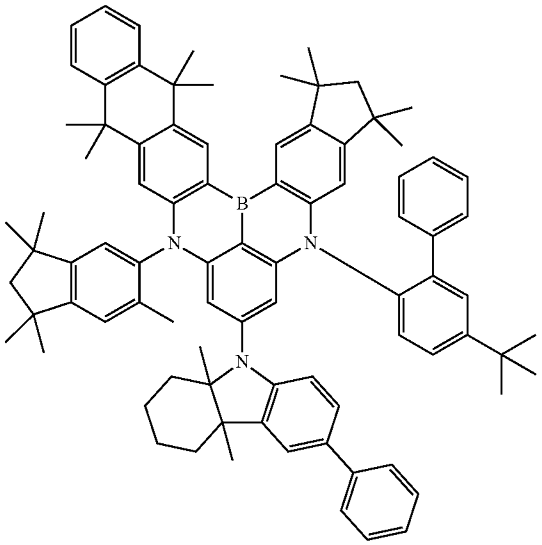
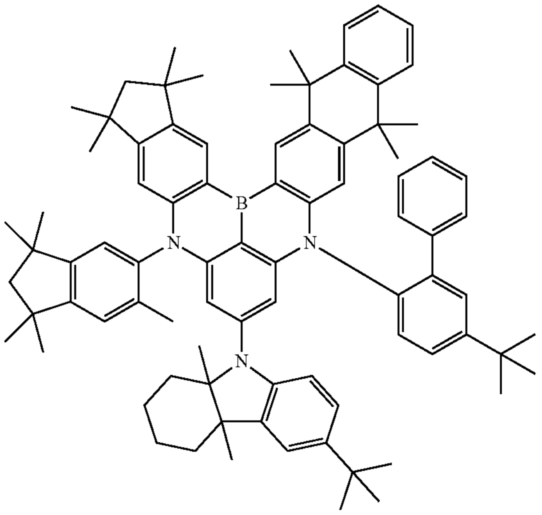
-continued

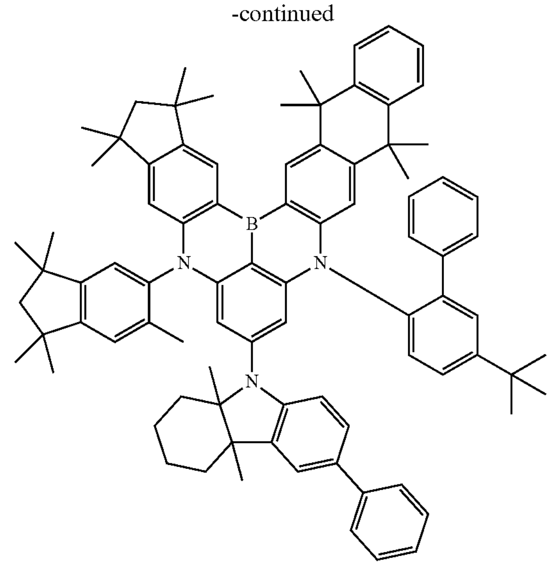
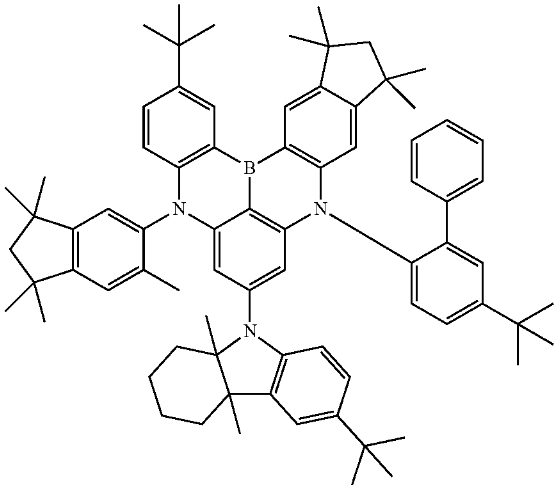
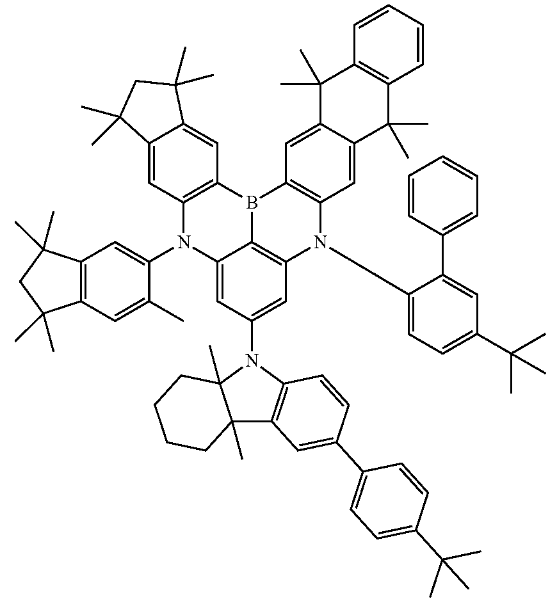
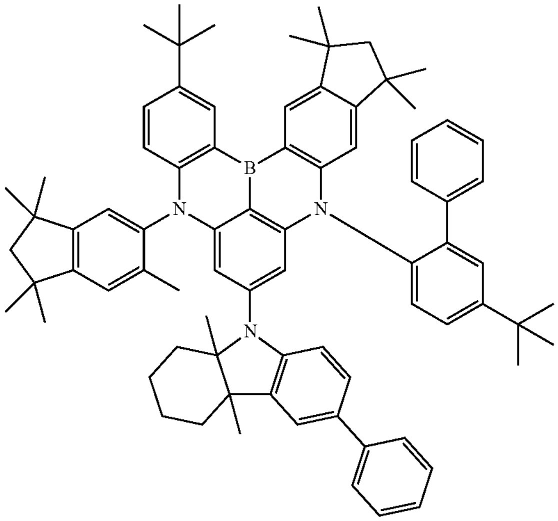
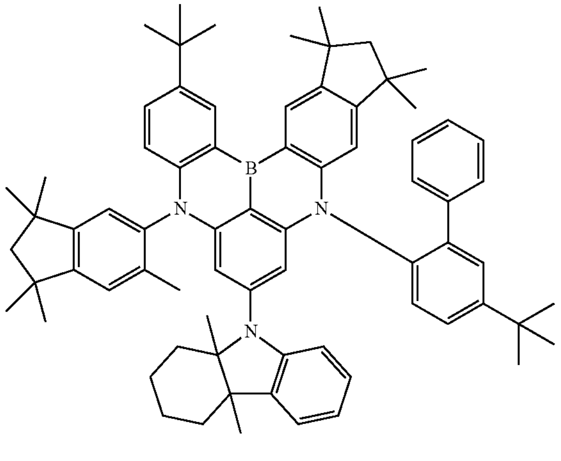
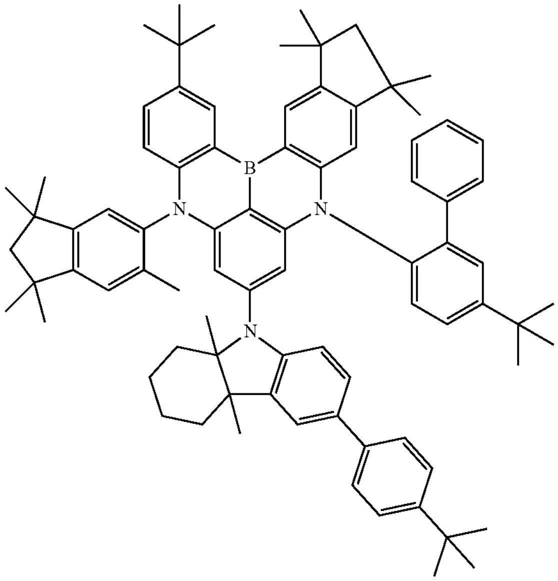

-continued
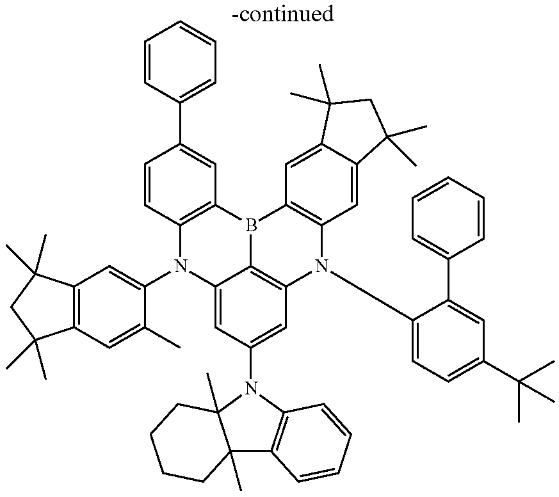
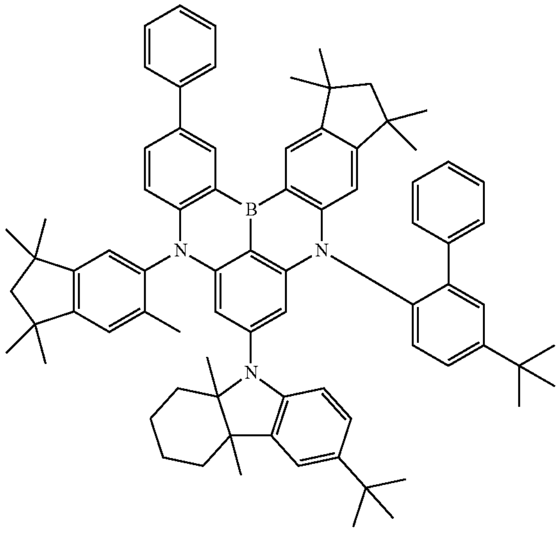
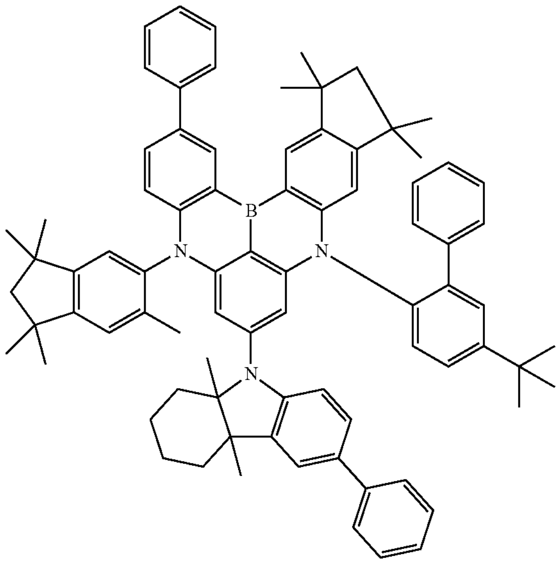
-continued
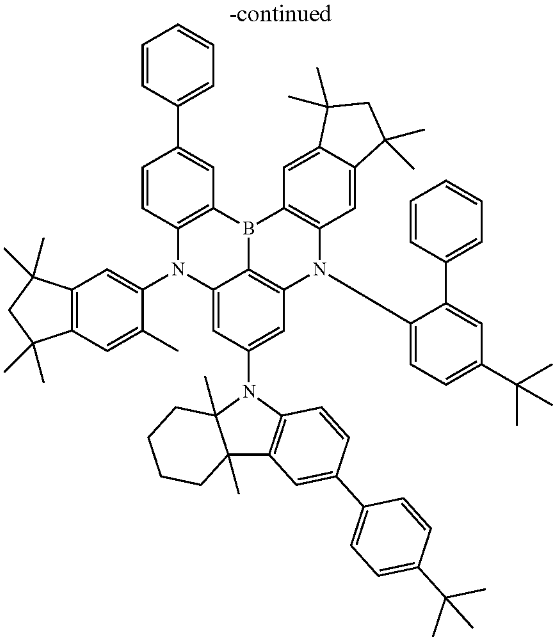
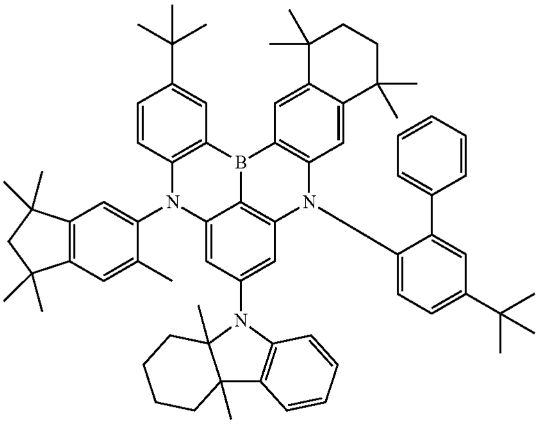
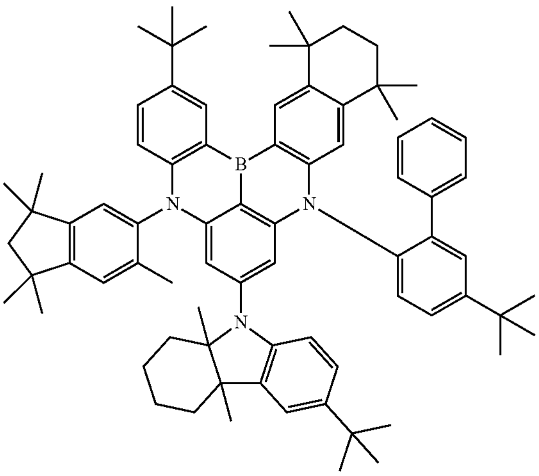

-continued
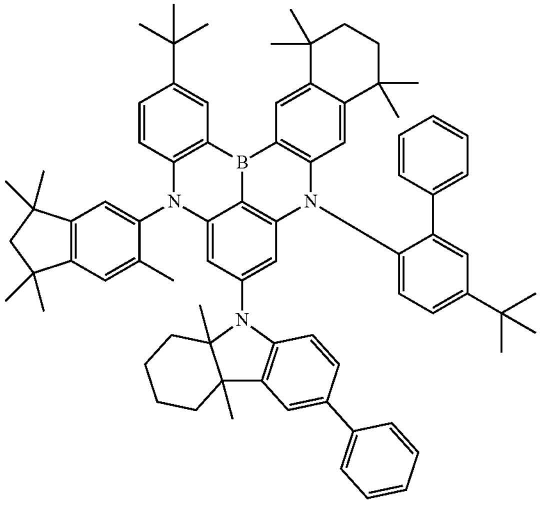
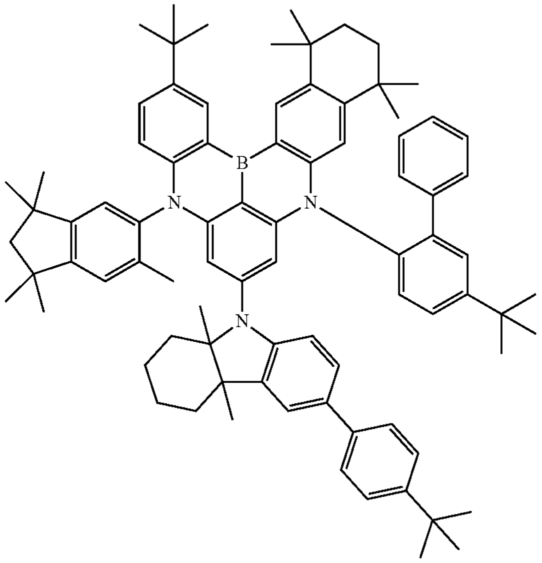
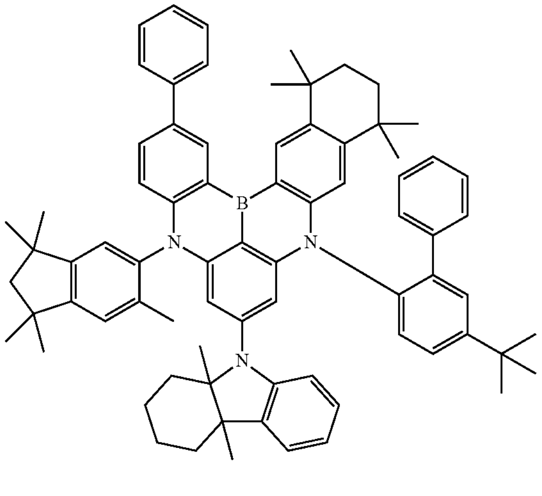
-continued
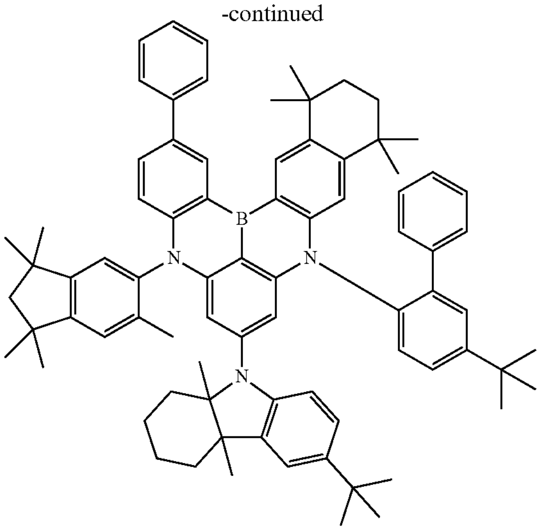
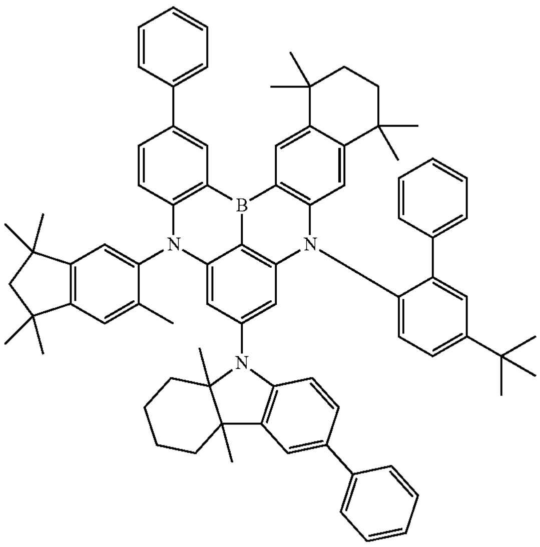
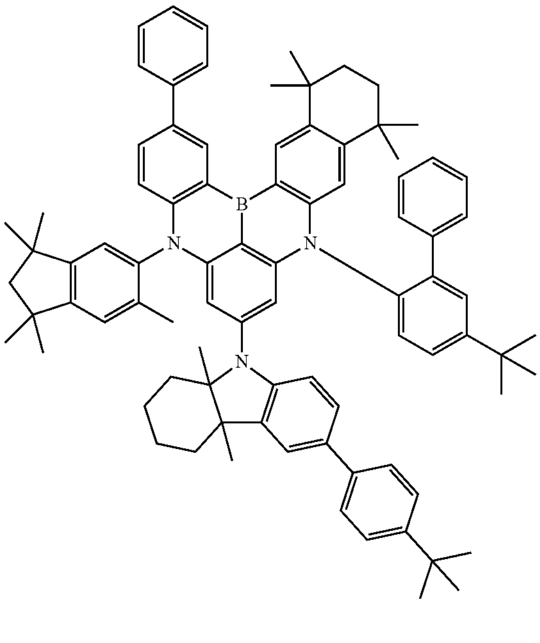

-continued
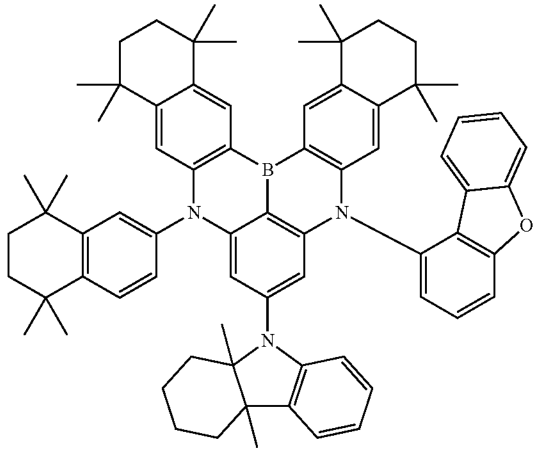
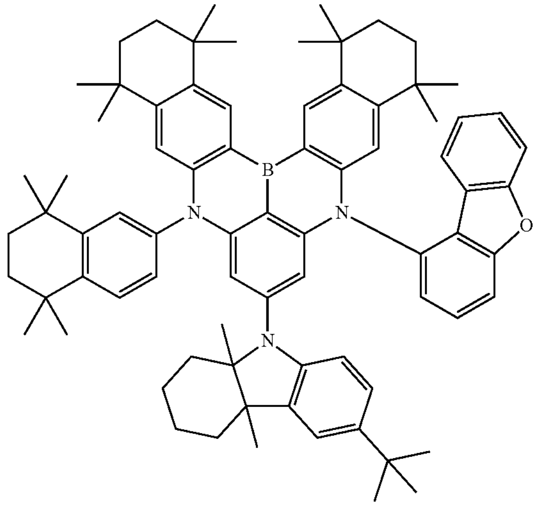
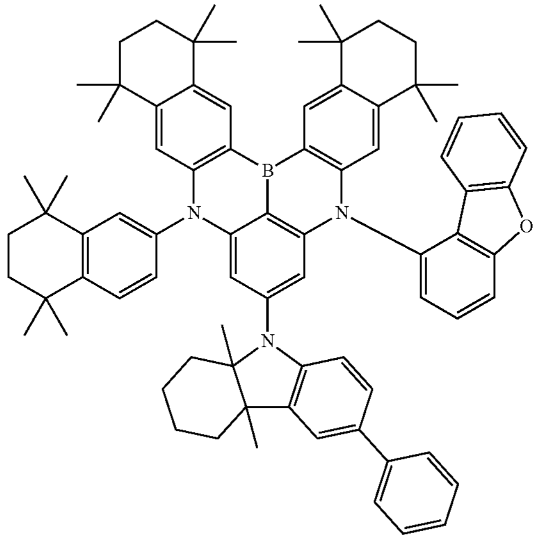
-continued
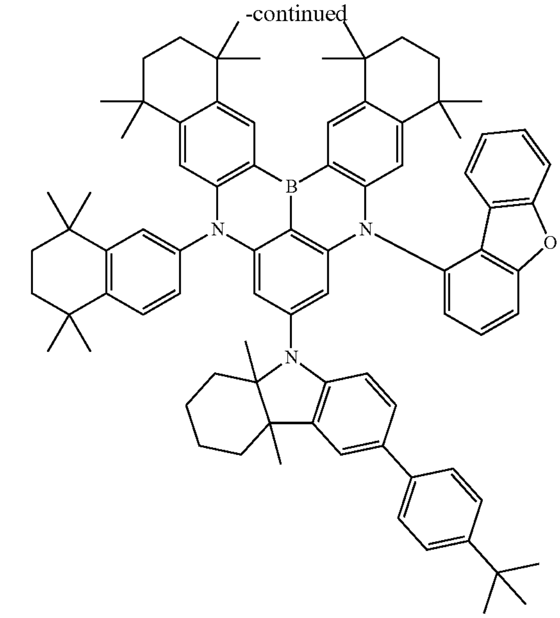
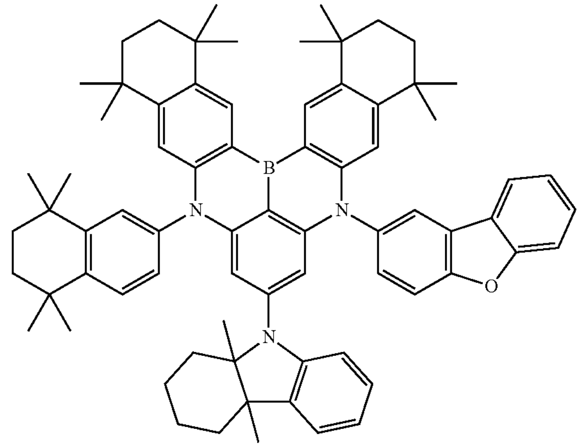
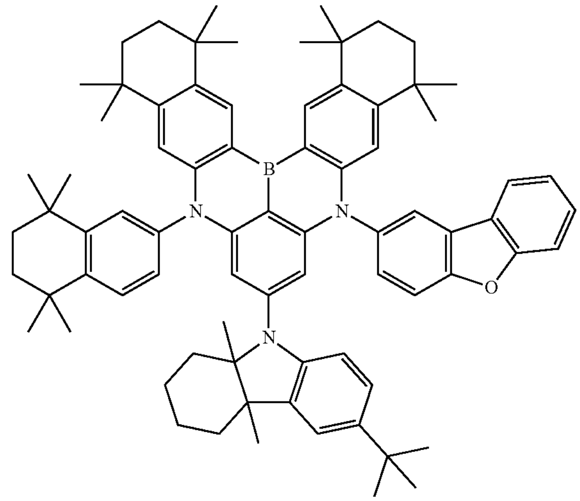

-continued
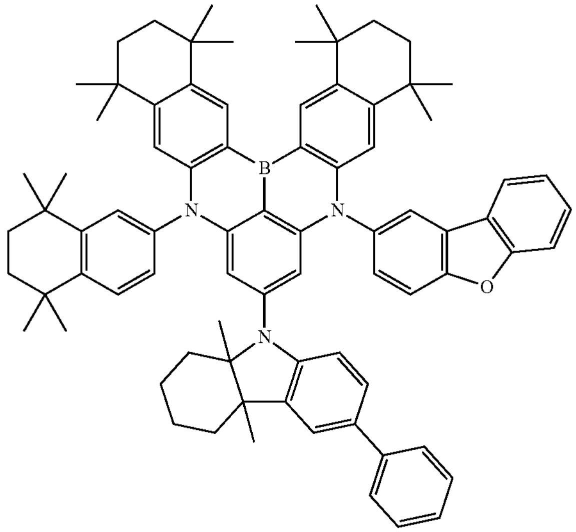
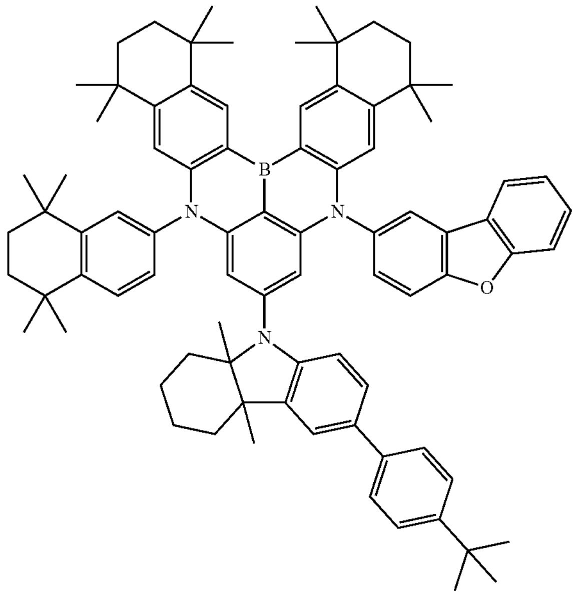
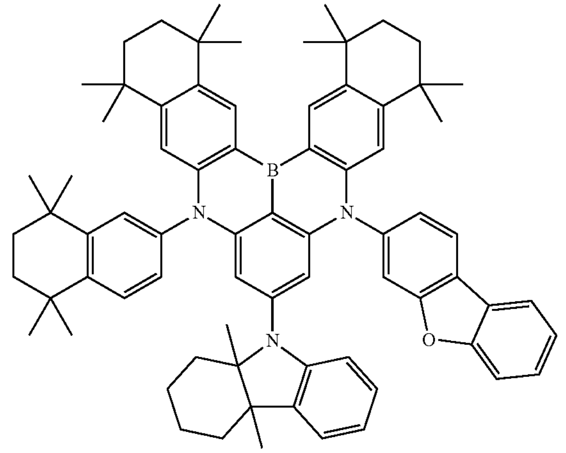
-continued
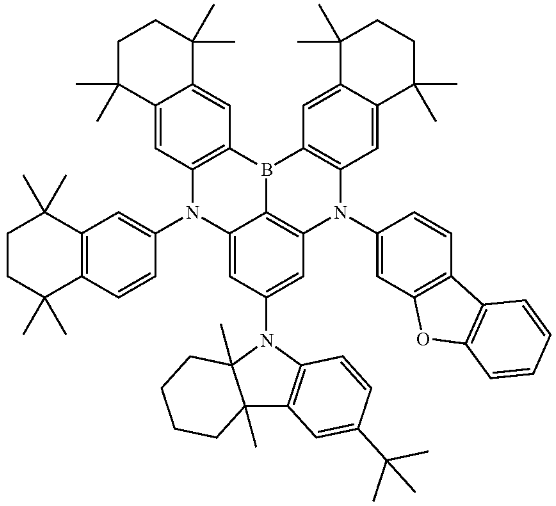
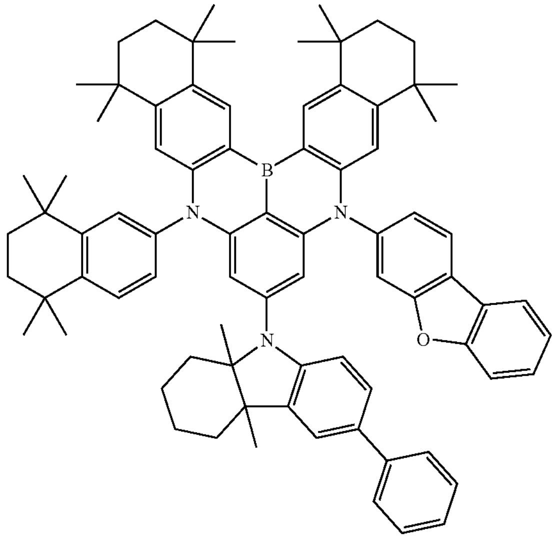
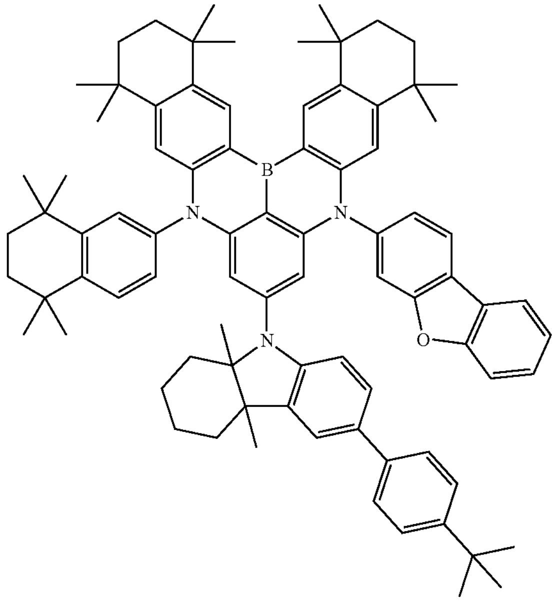

-continued
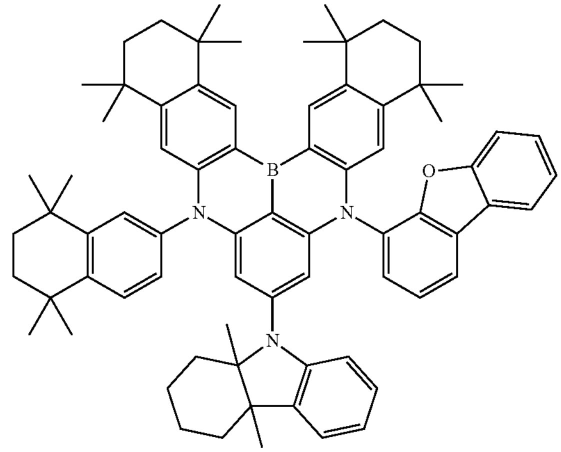
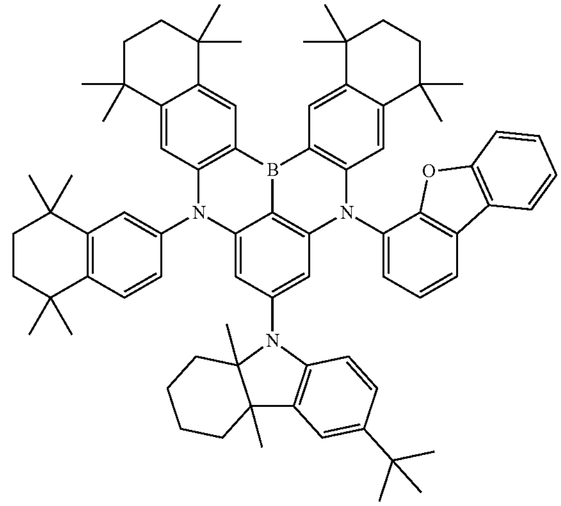
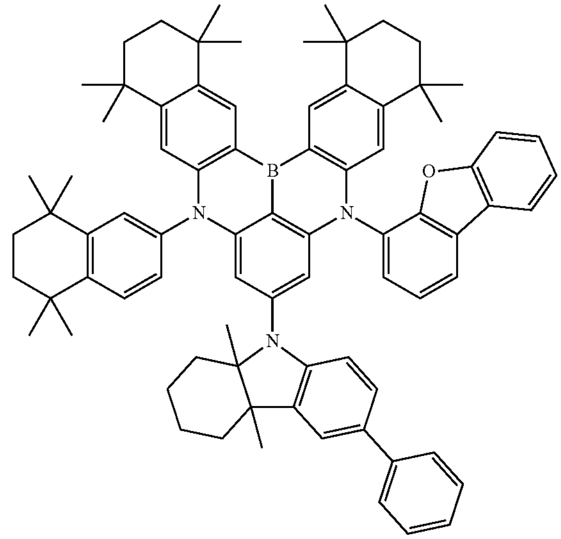
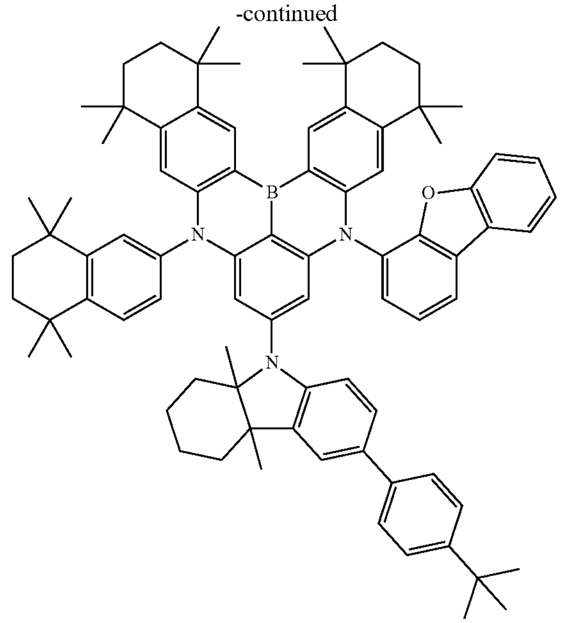
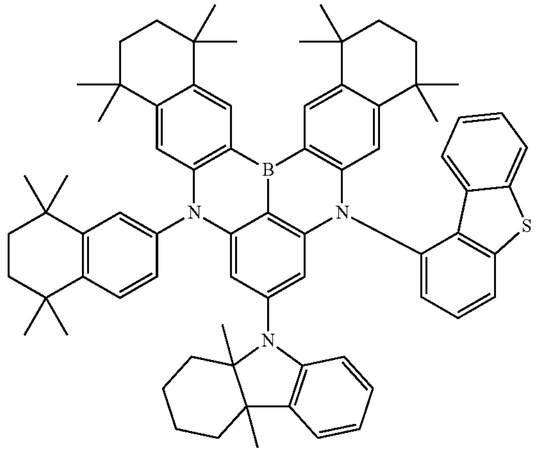
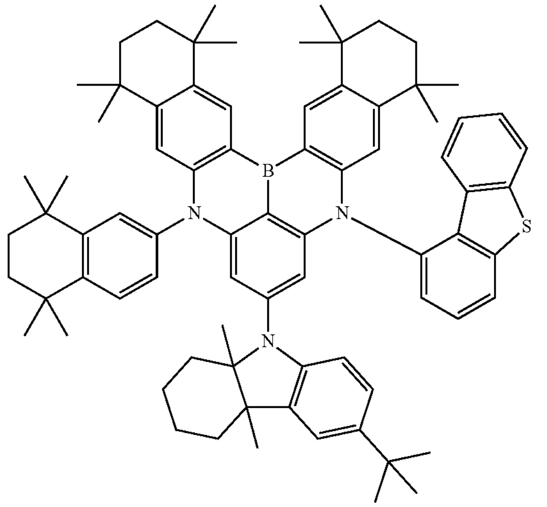

-continued
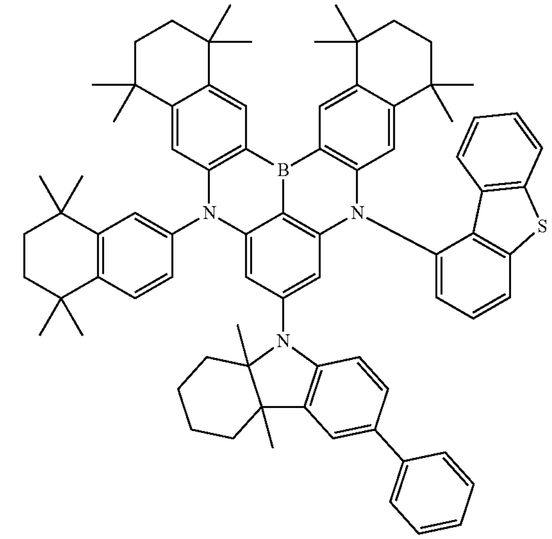
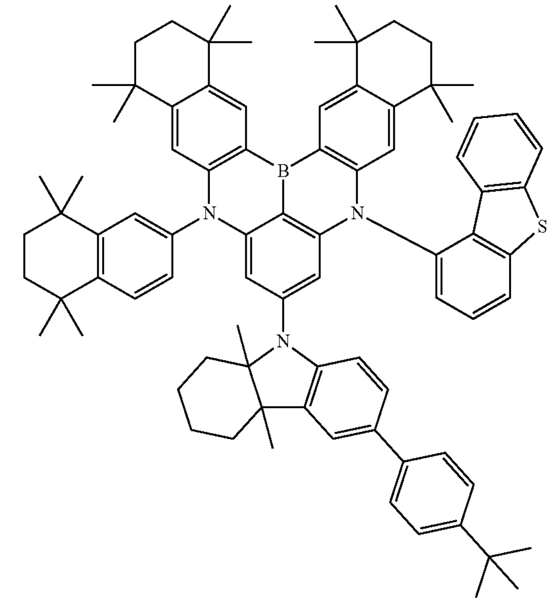
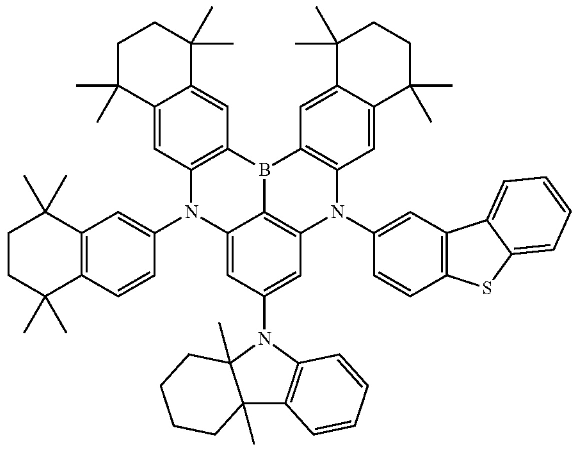
-continued
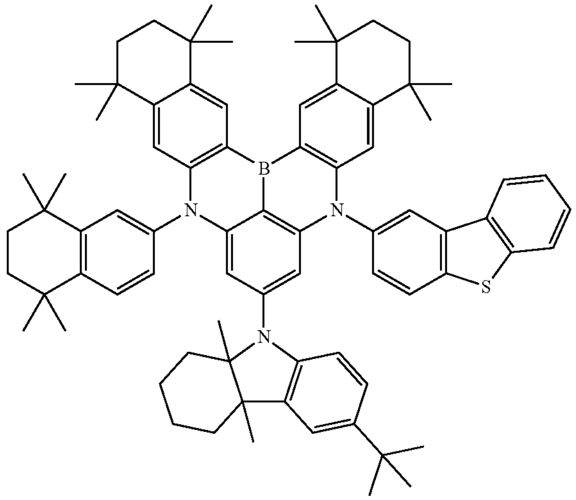
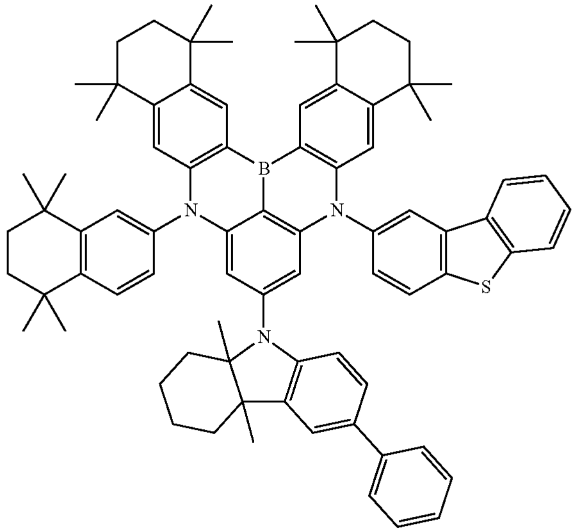
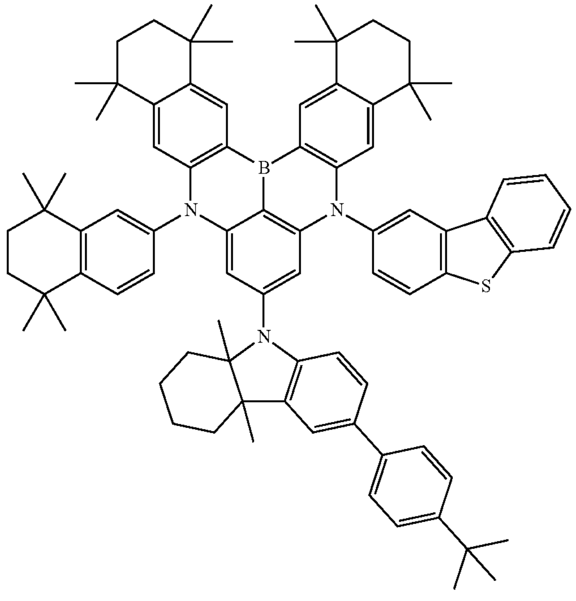

-continued
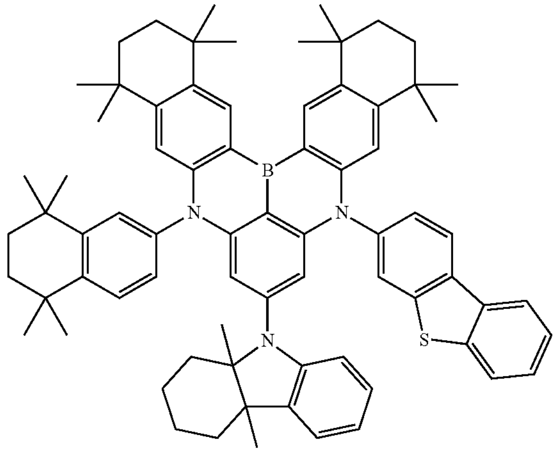
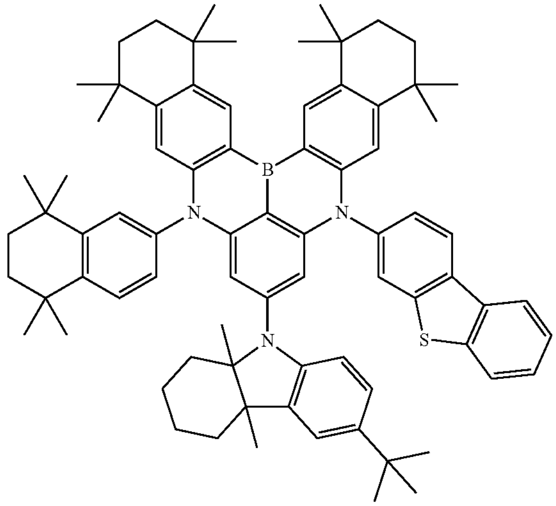
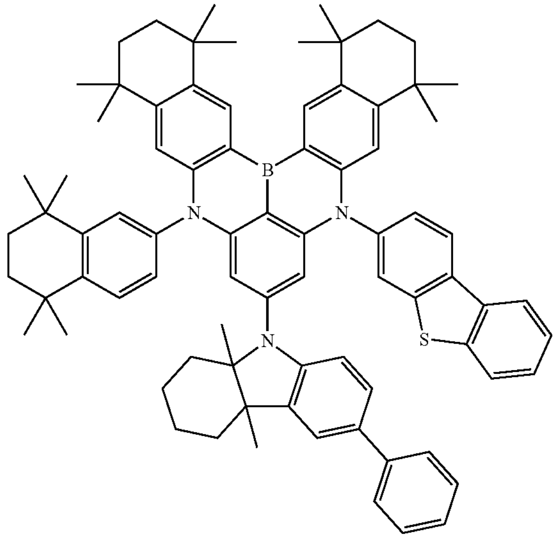
-continued
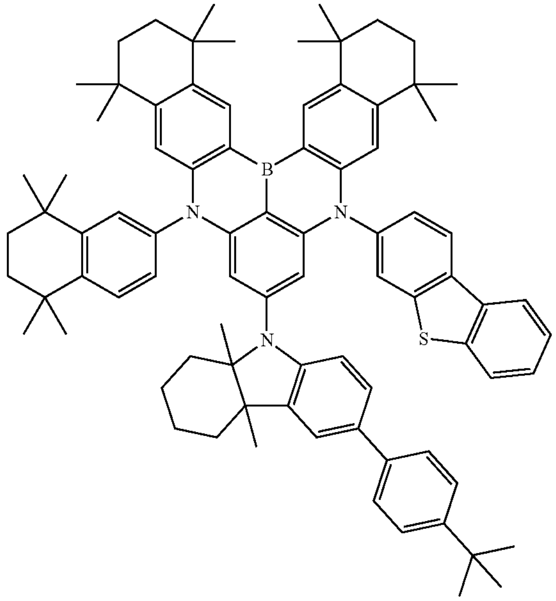
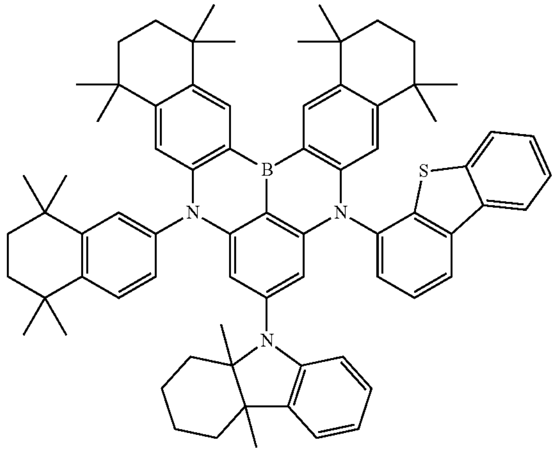
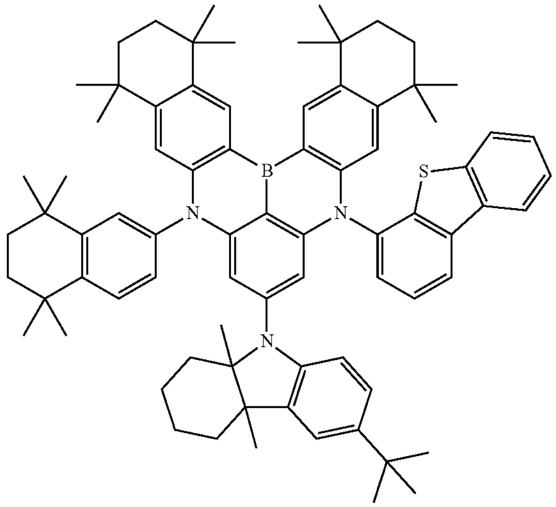

-continued
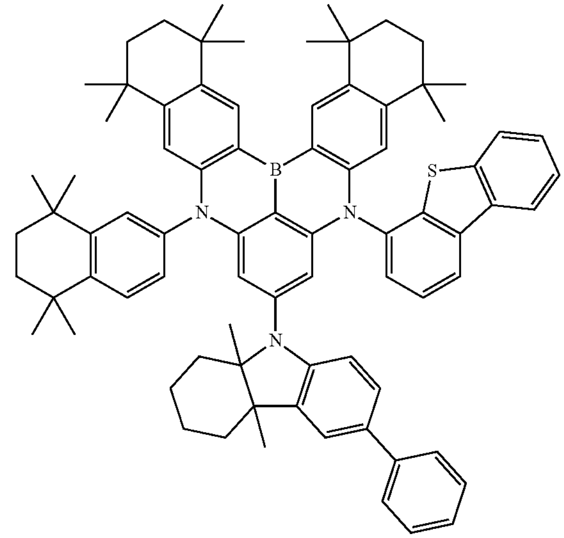
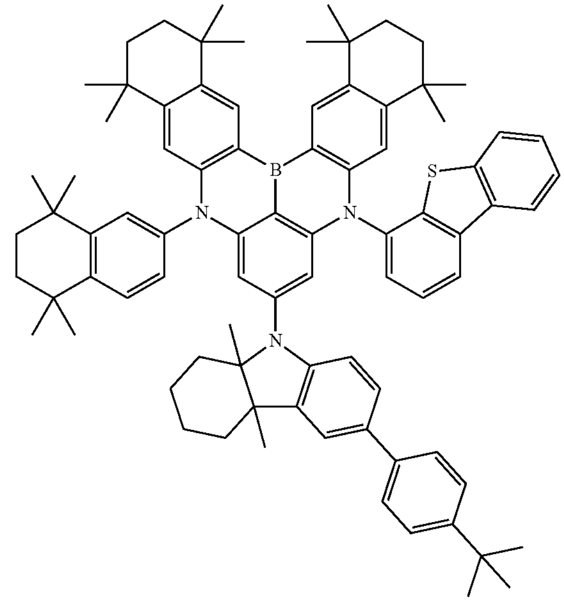
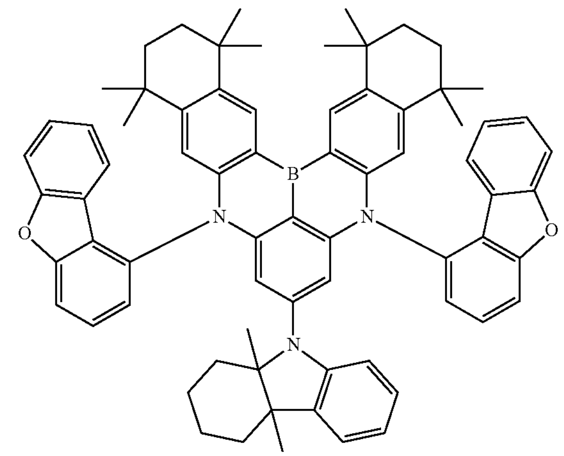
-continued
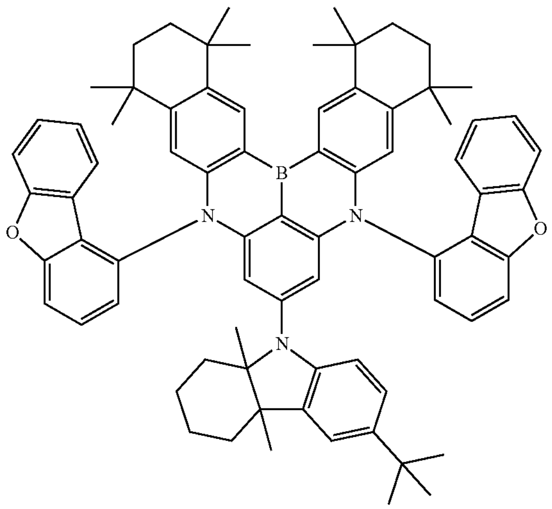
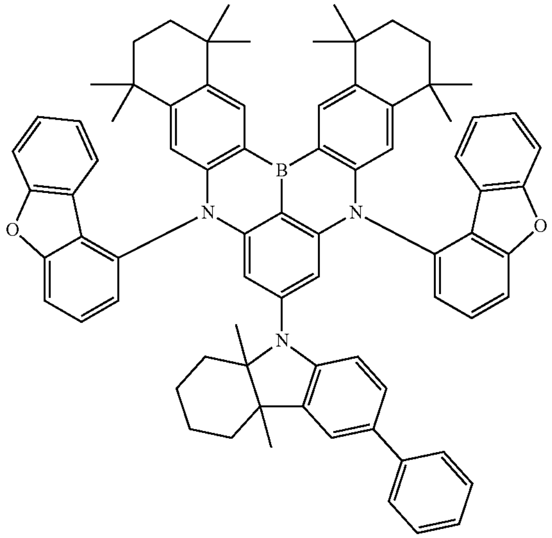
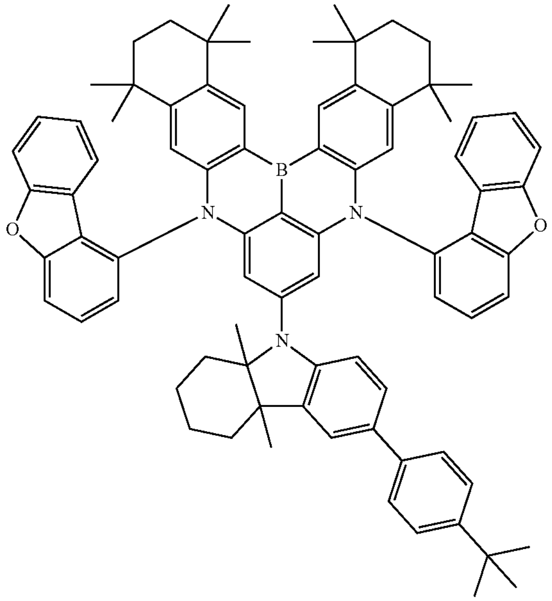

-continued
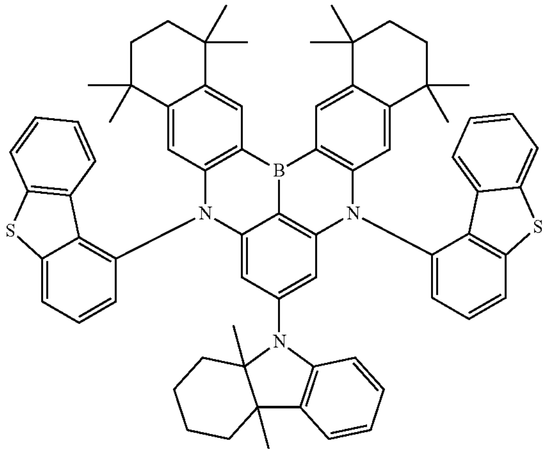
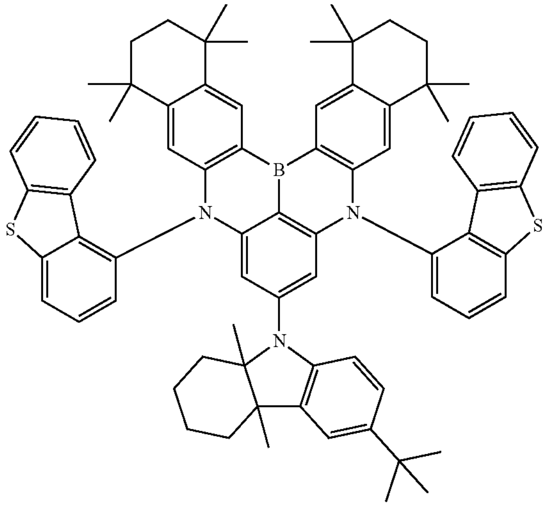
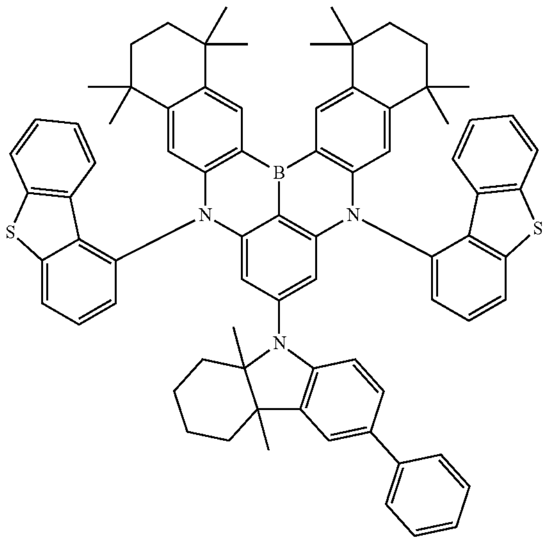
-continued
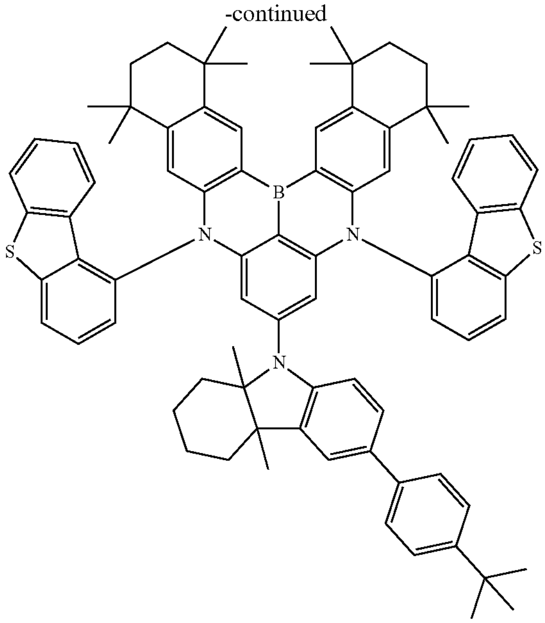
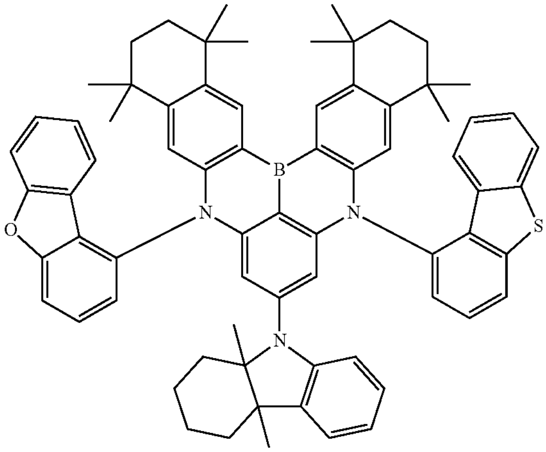
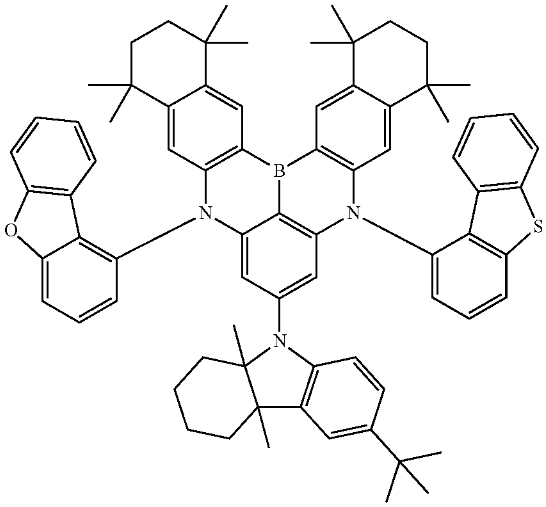

-continued
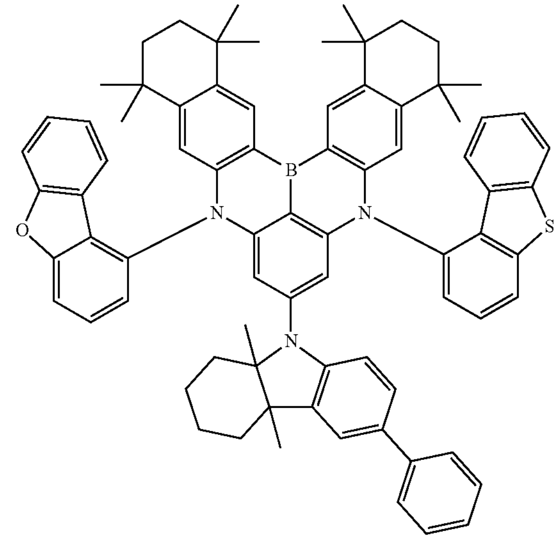
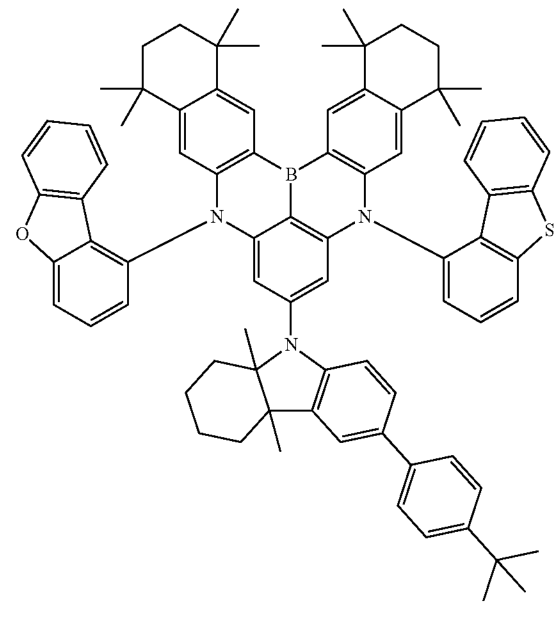
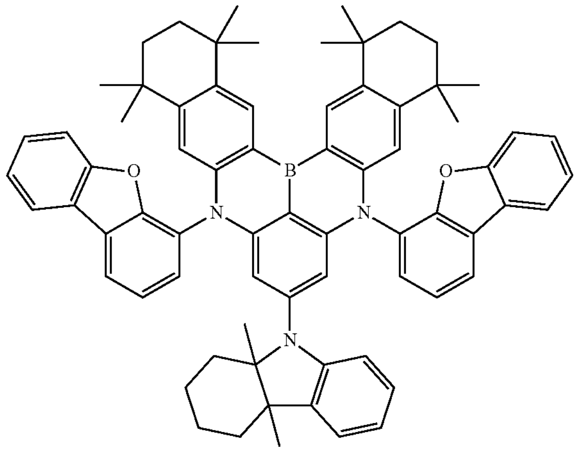
-continued
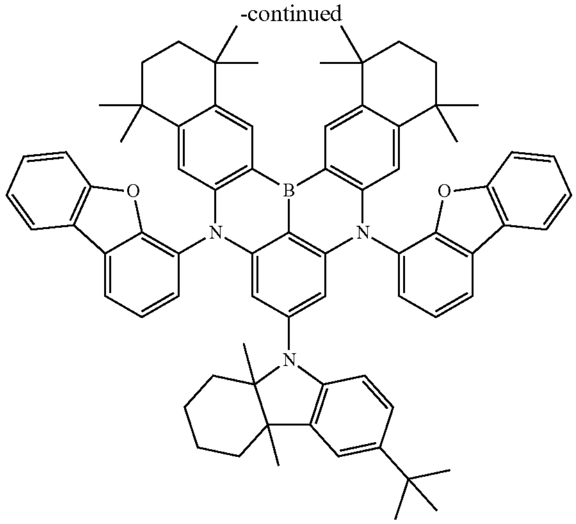
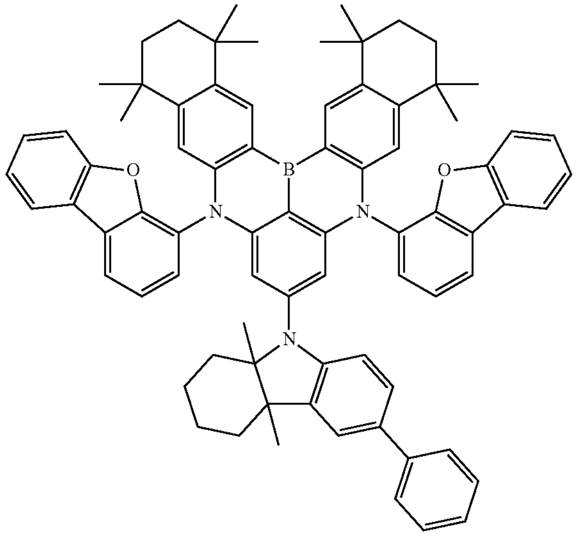
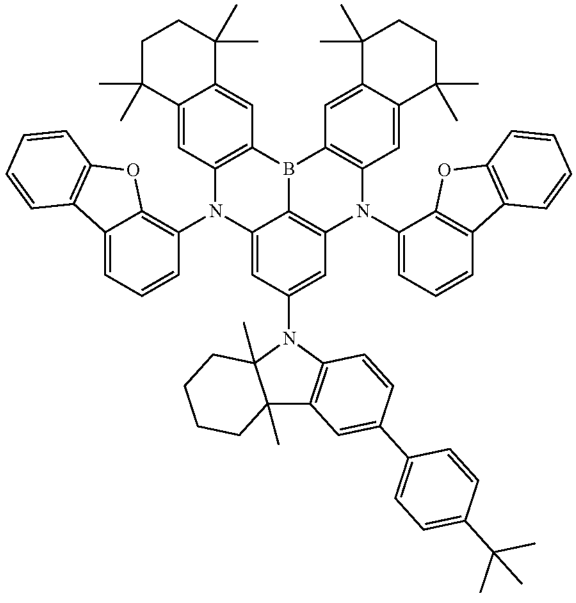

-continued
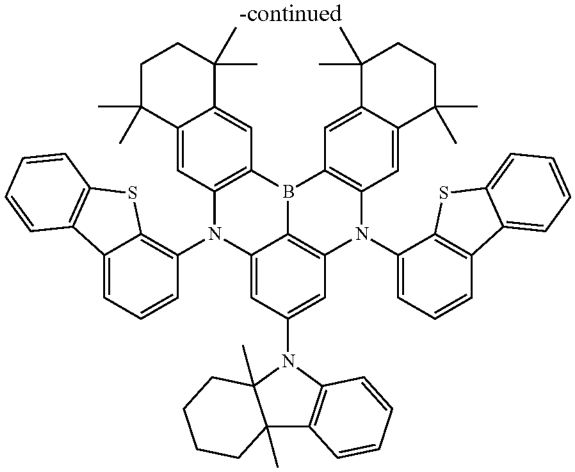
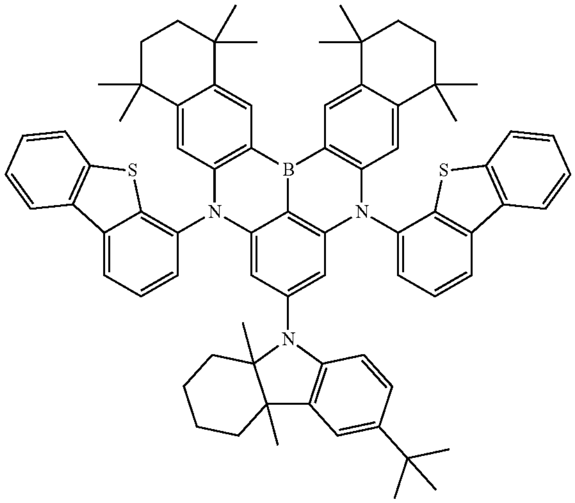
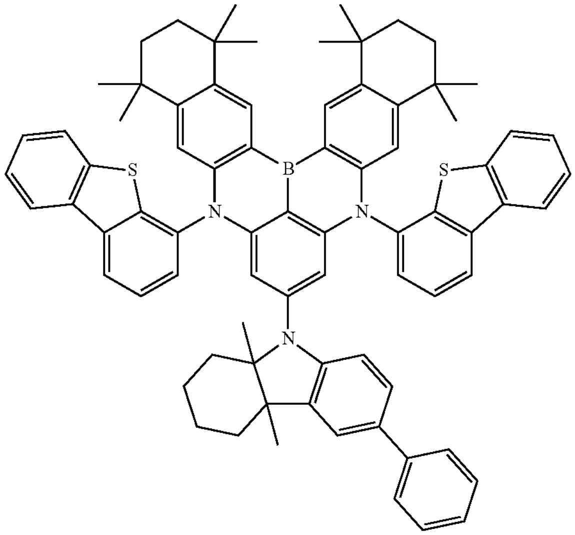
-continued
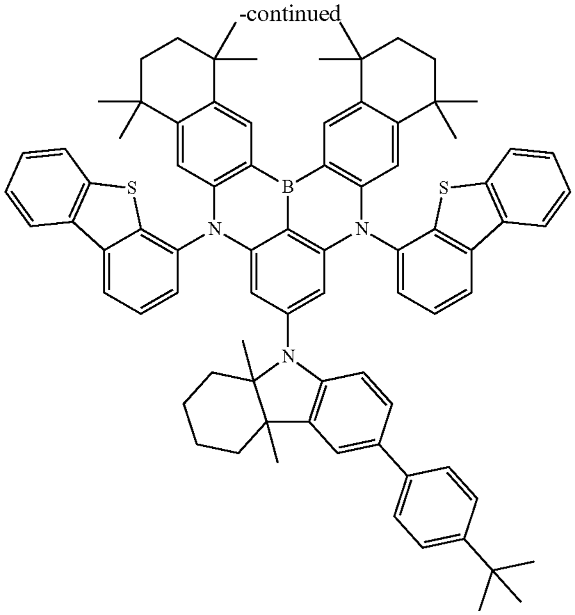
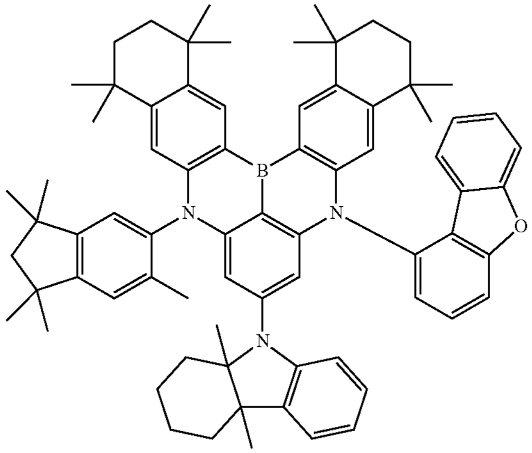
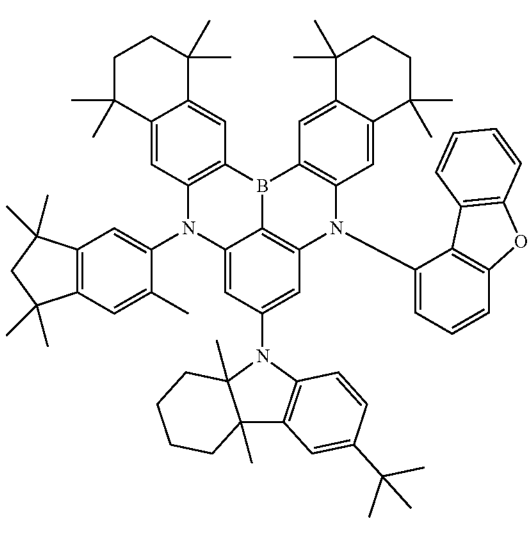

-continued
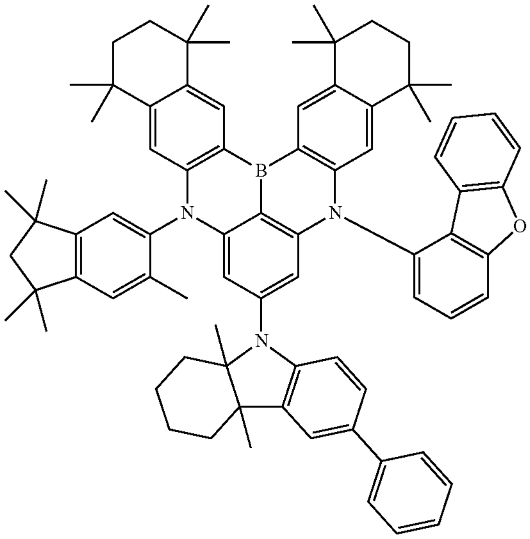
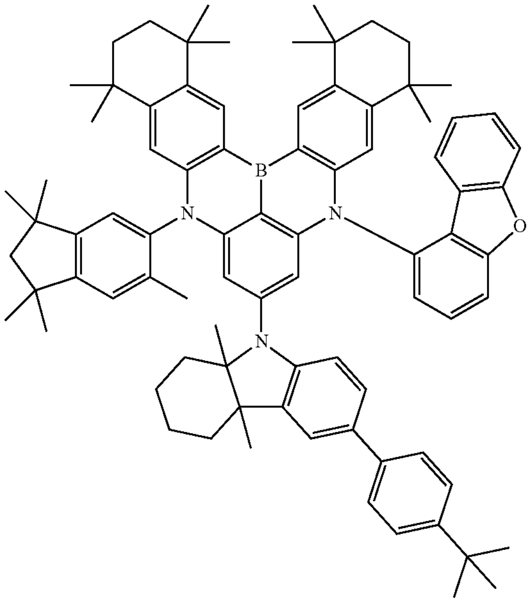
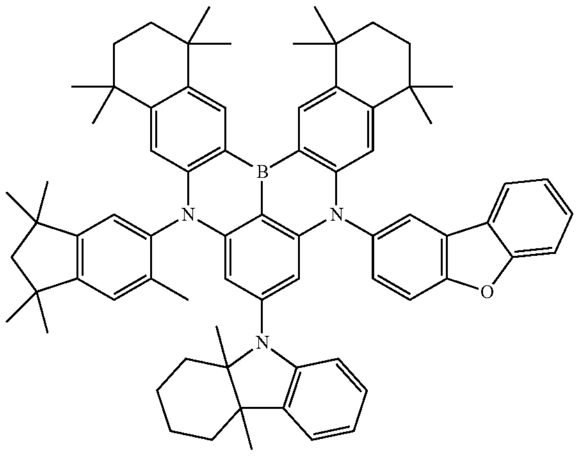
-continued
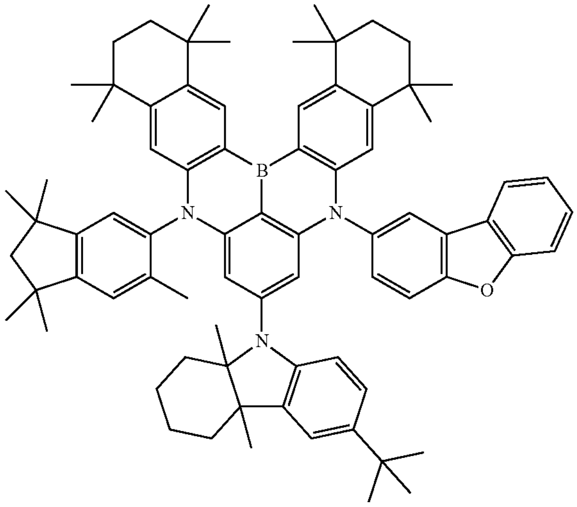
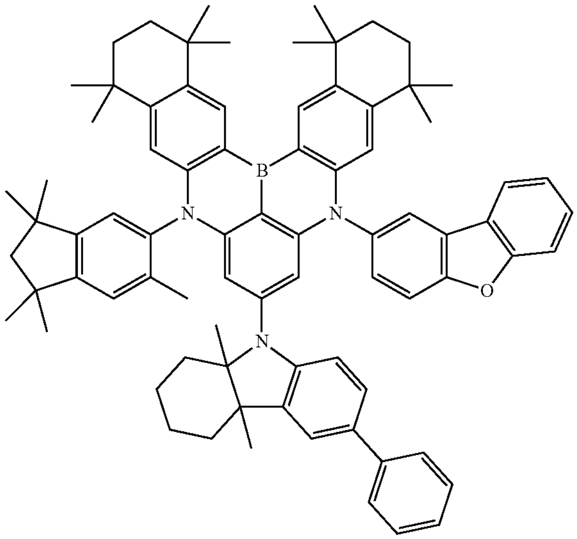
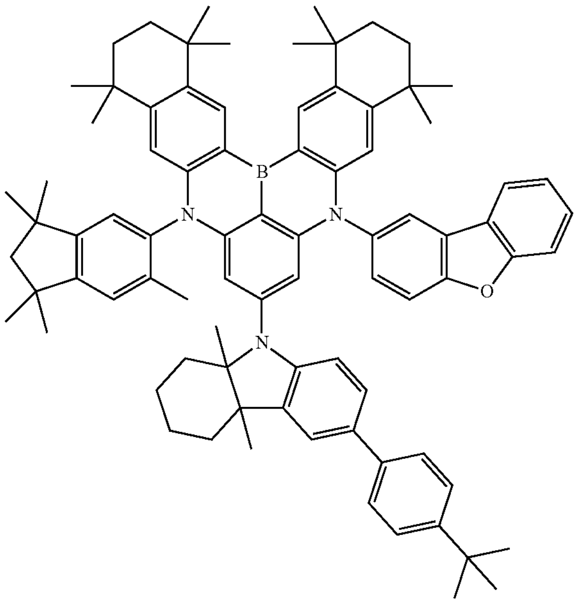

-continued
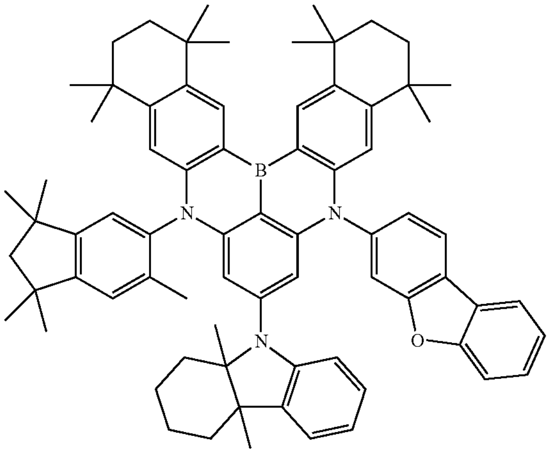
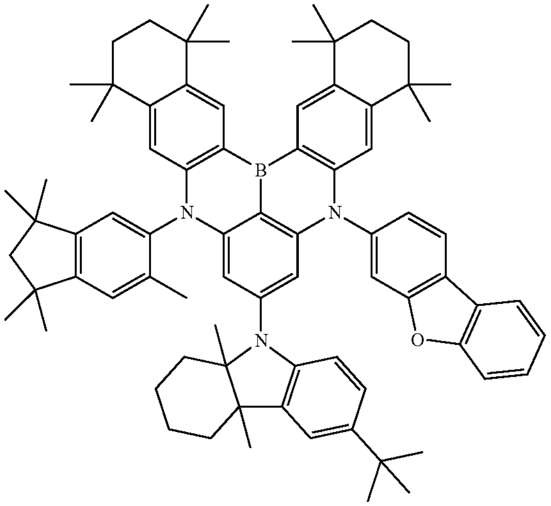
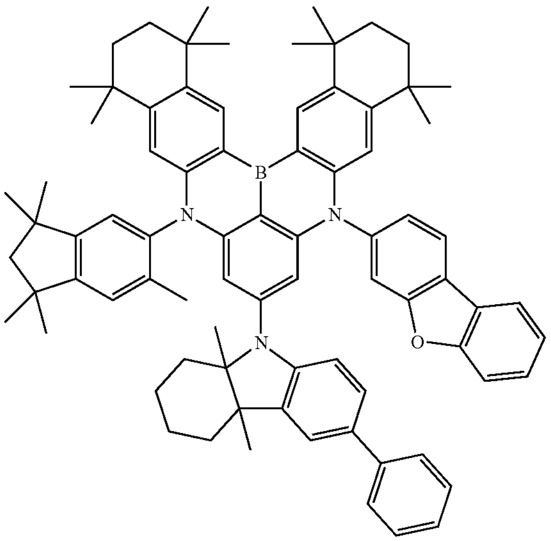
-continued
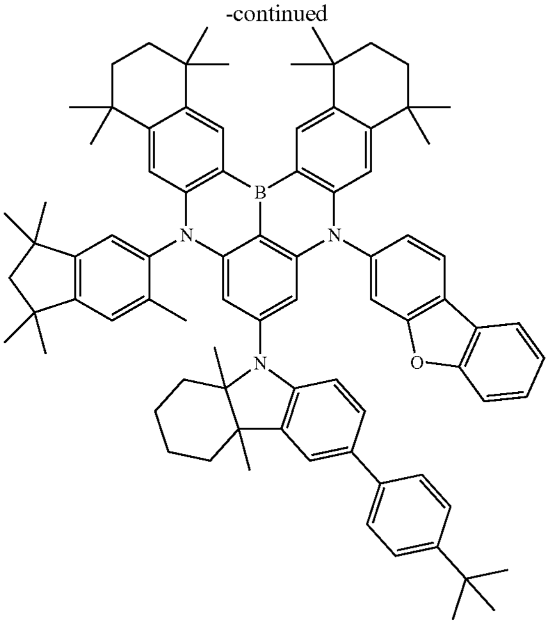
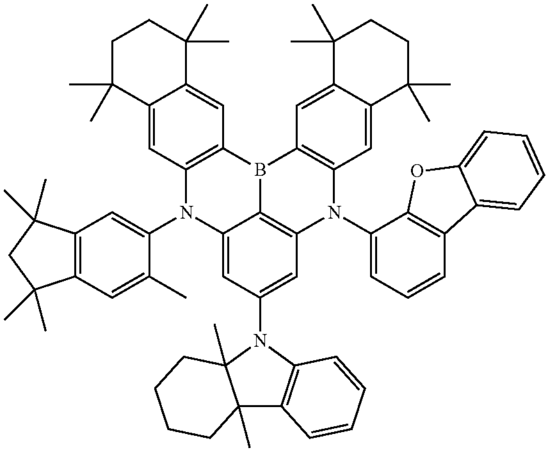
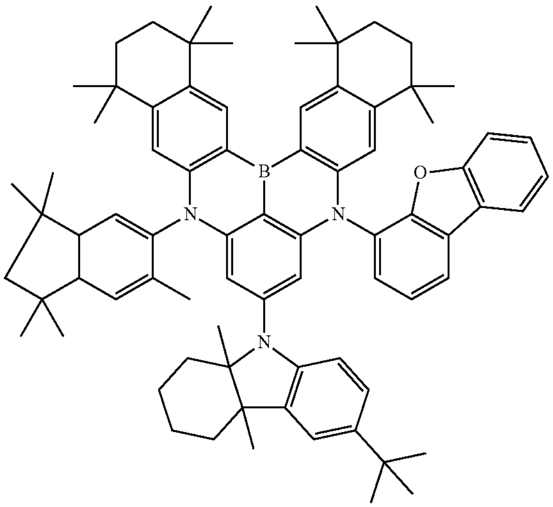

-continued
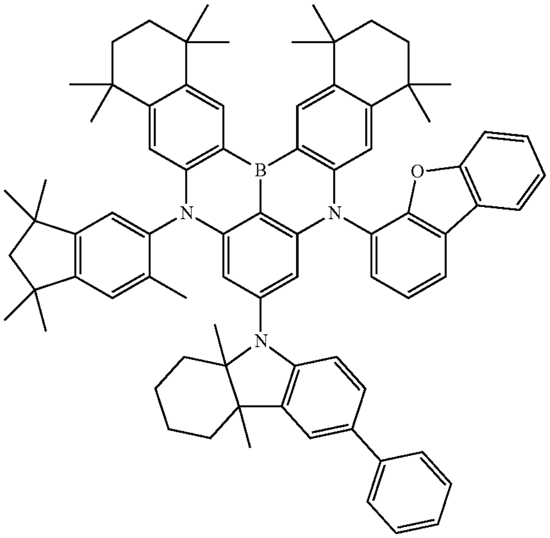
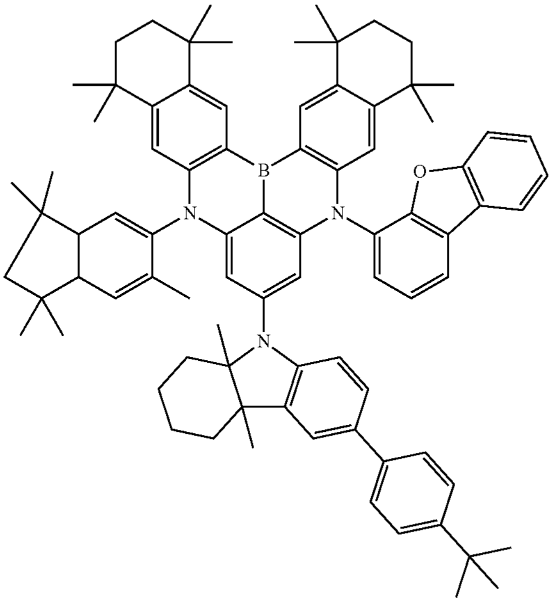
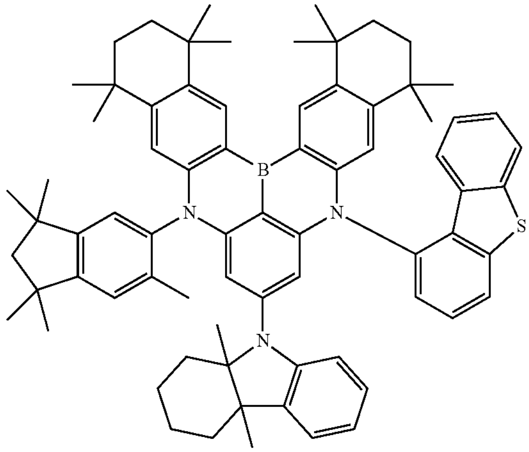
-continued
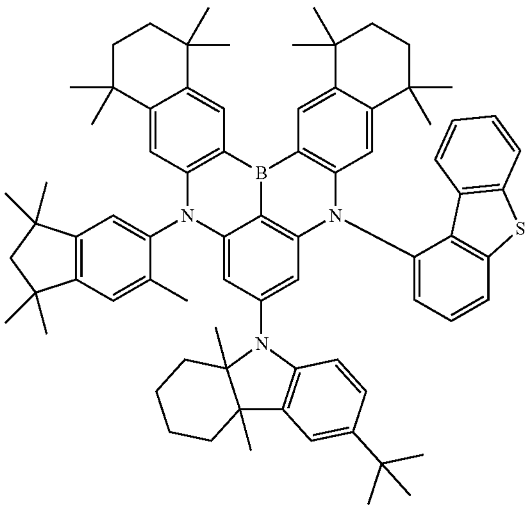
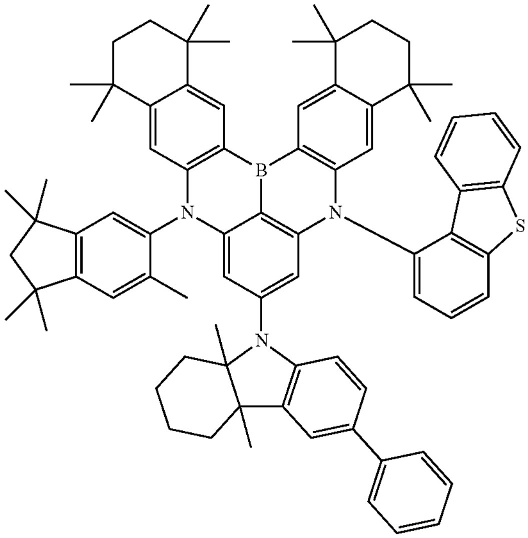
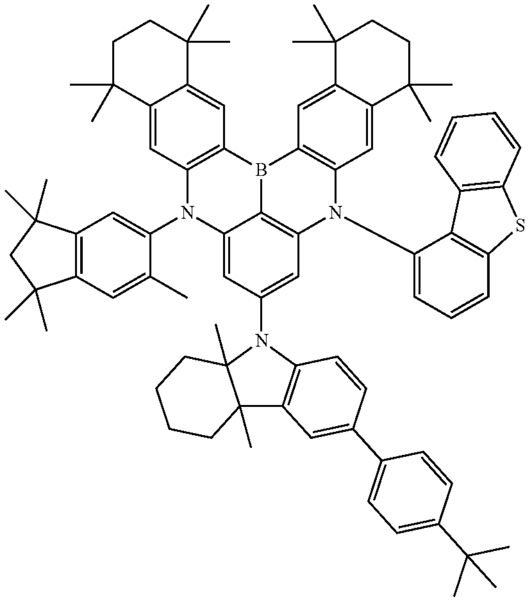

-continued
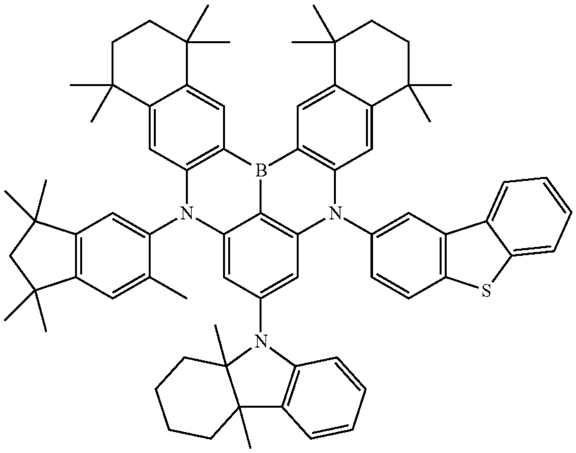
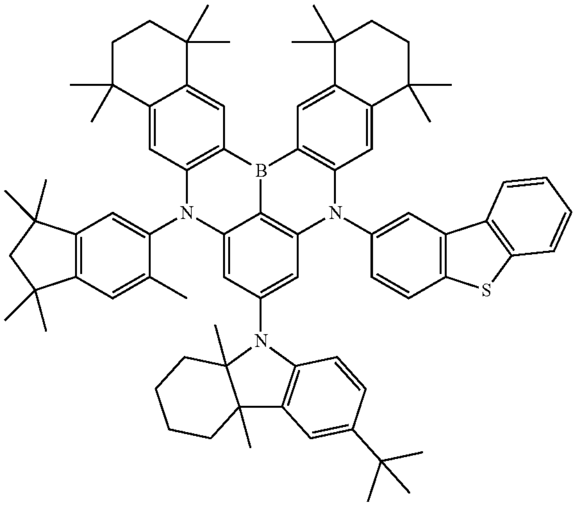
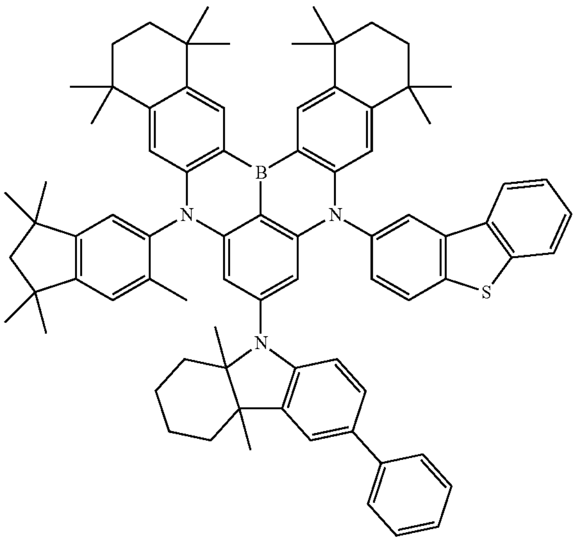
-continued
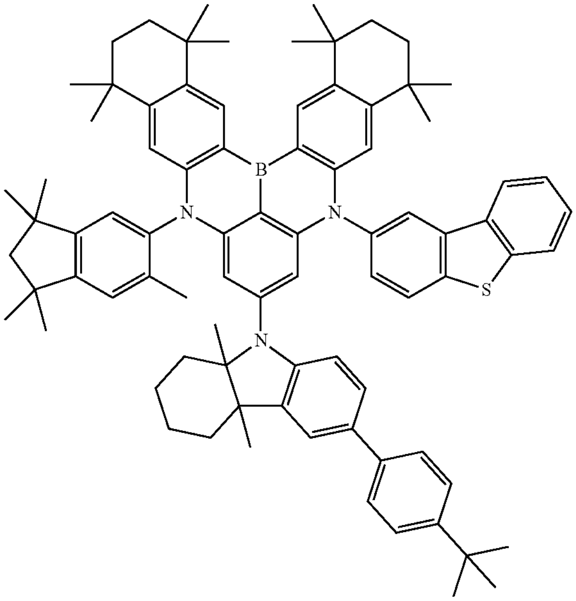
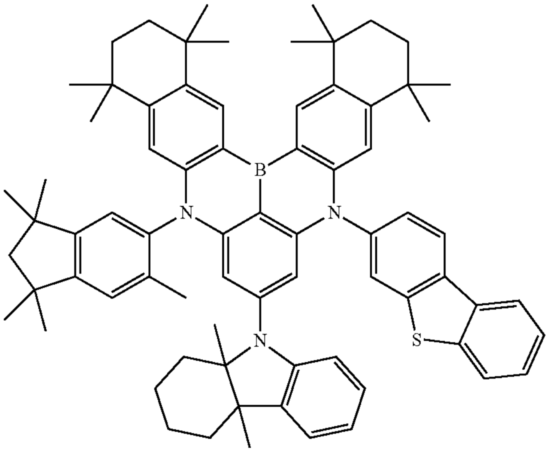
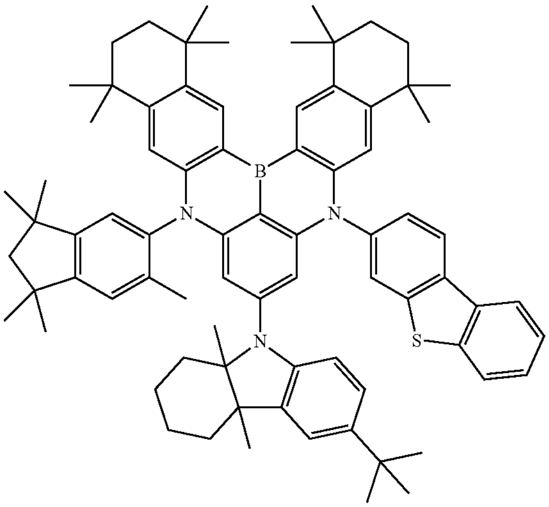

-continued
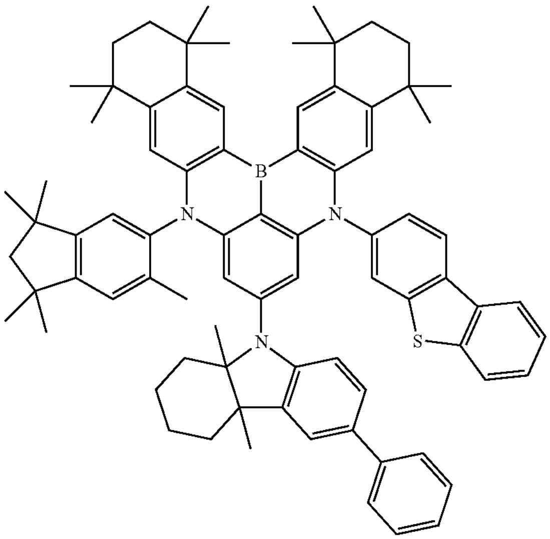
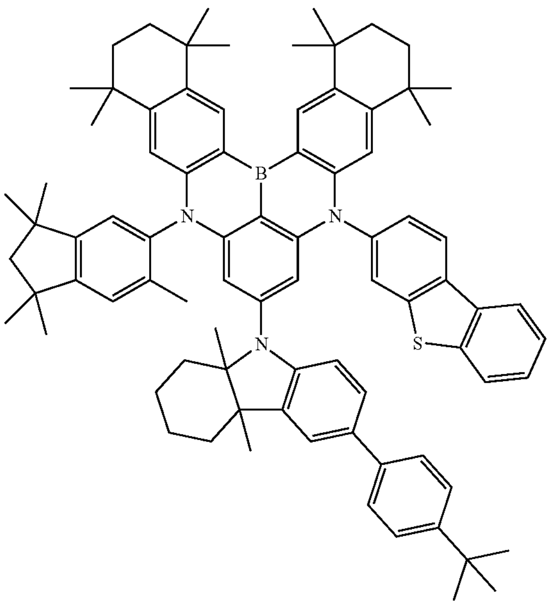
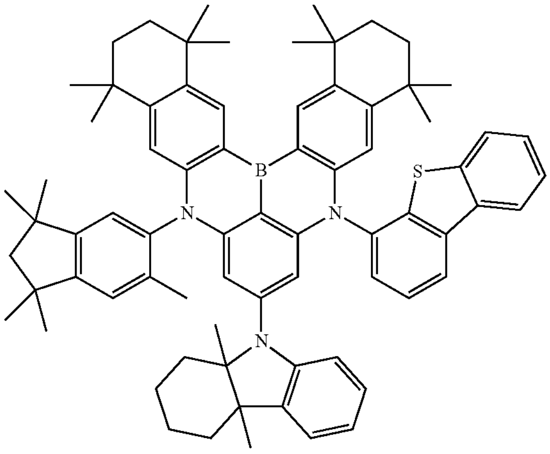
-continued
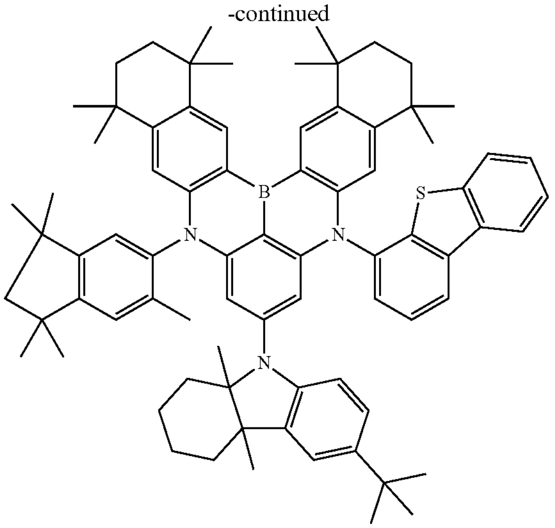
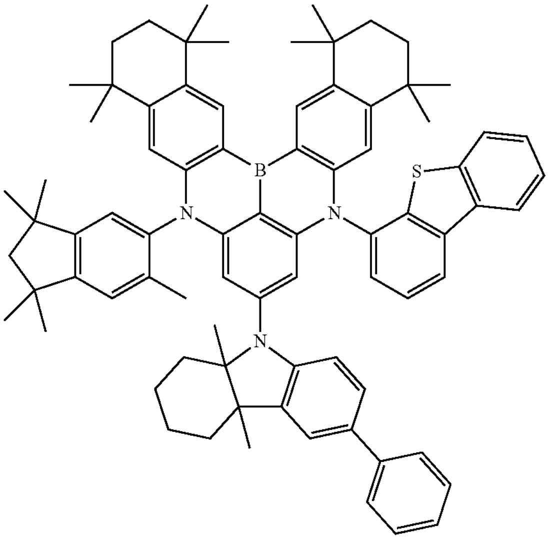
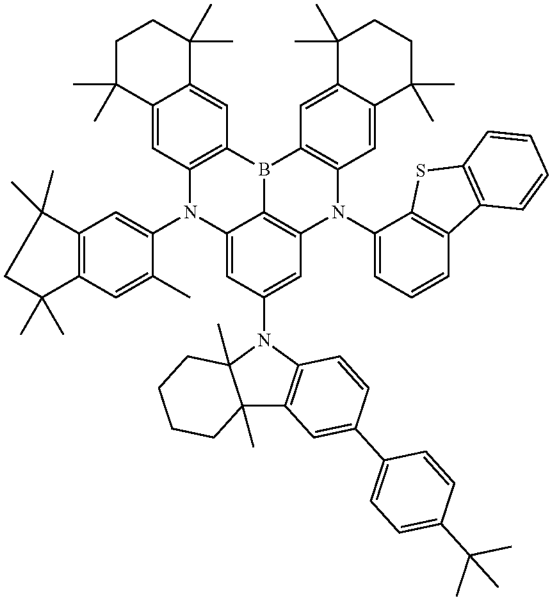

-continued
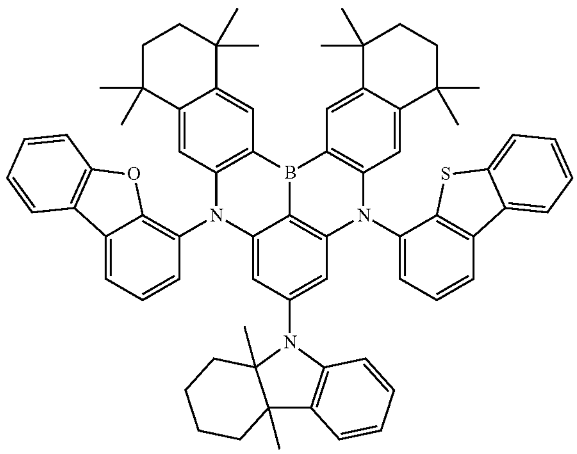
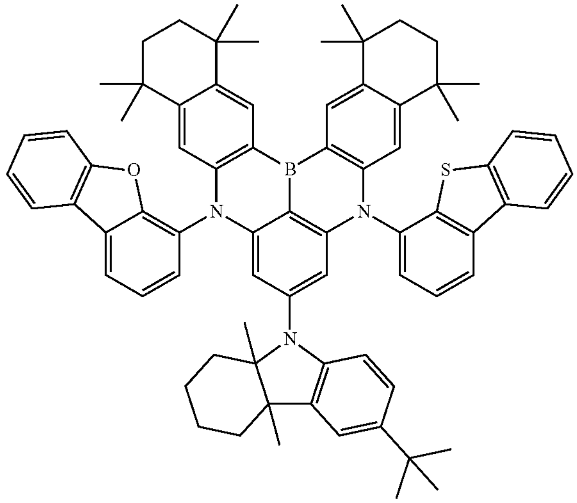
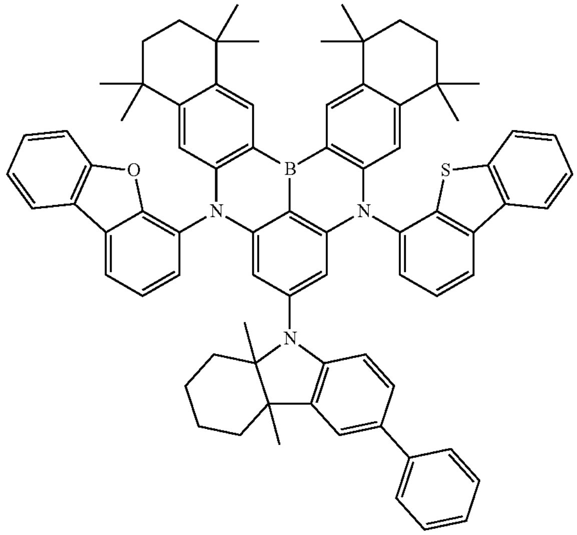
-continued
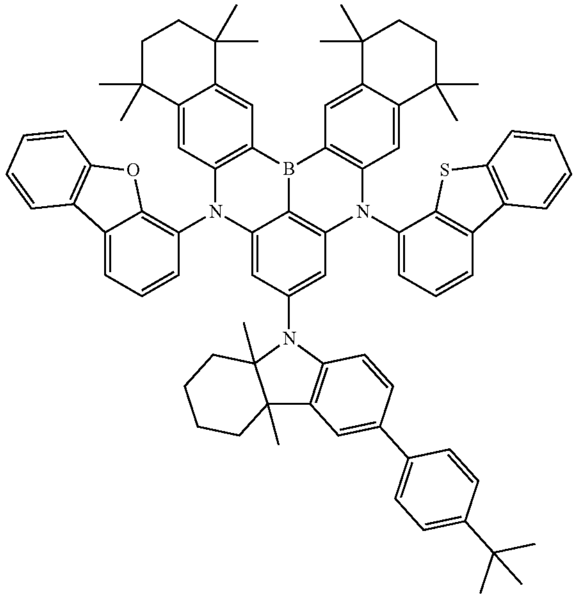
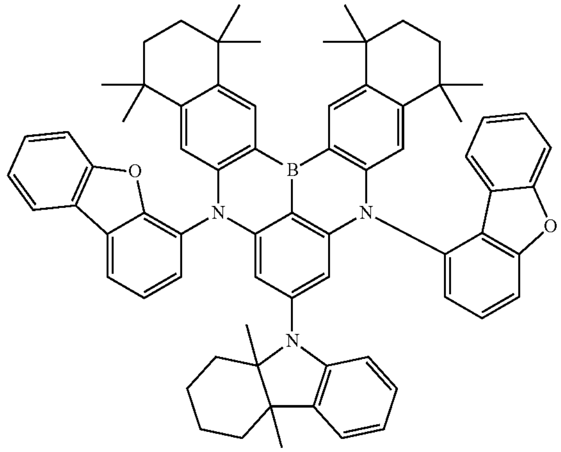
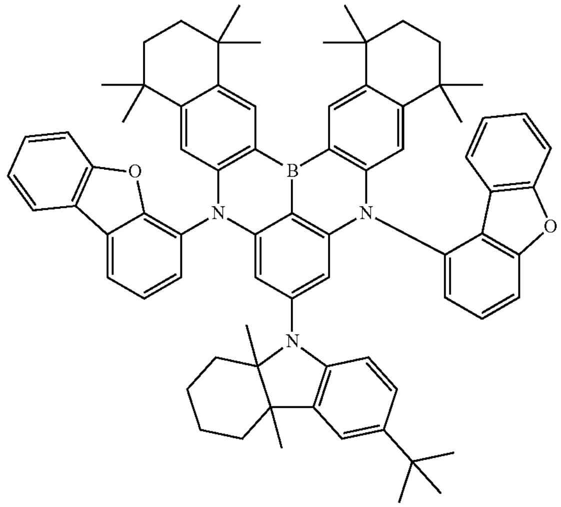

-continued
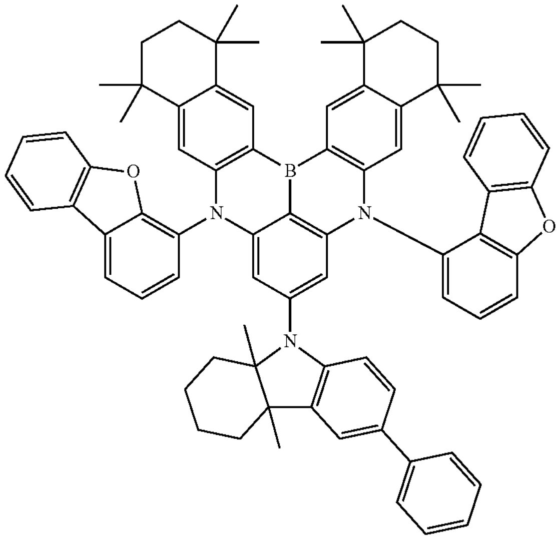
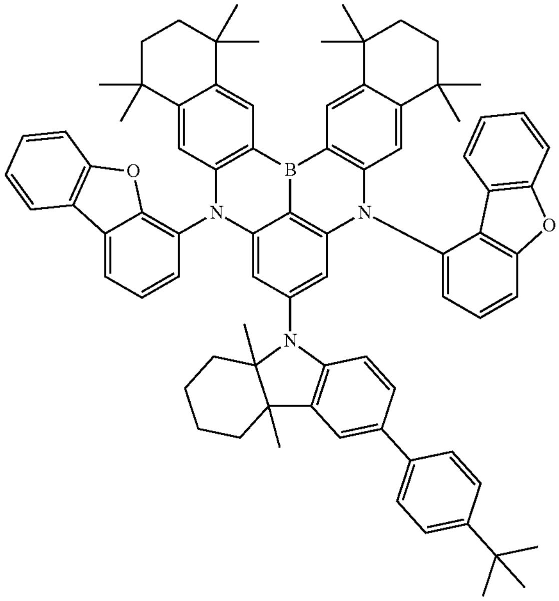
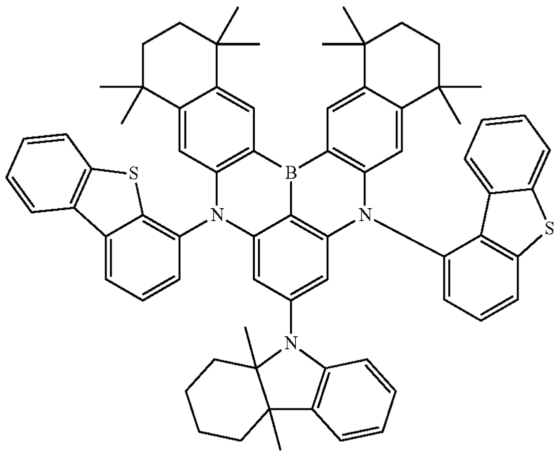
-continued
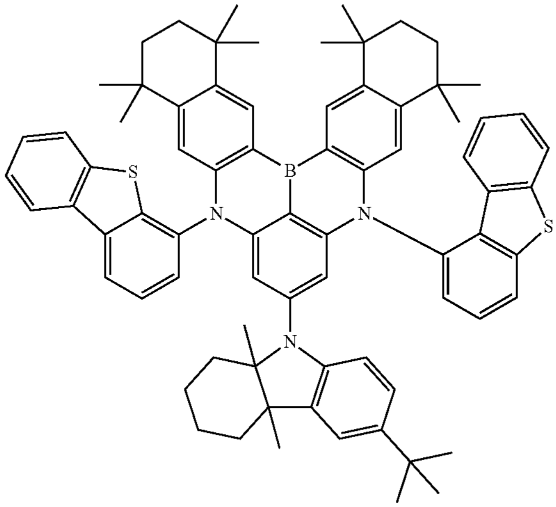
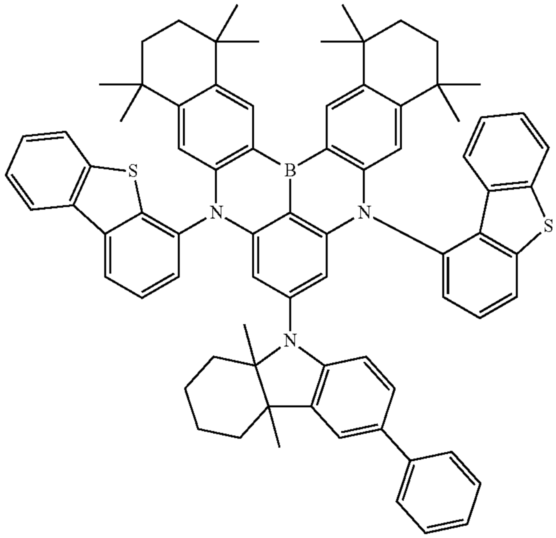
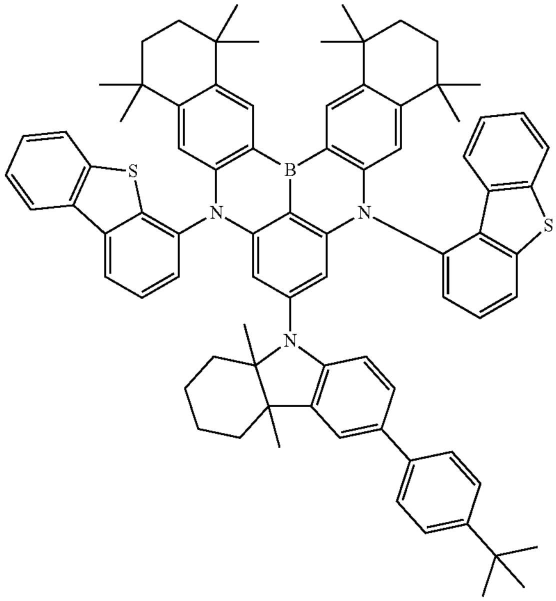

-continued
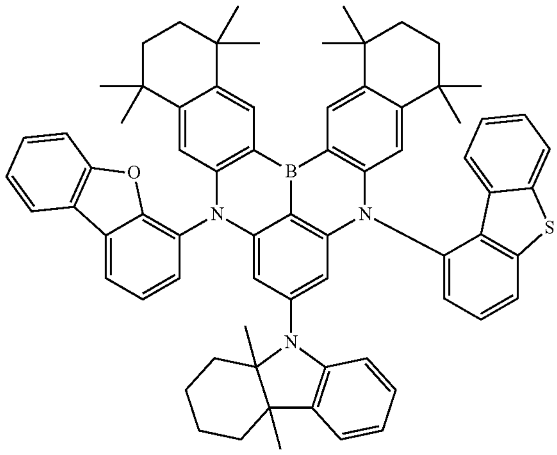
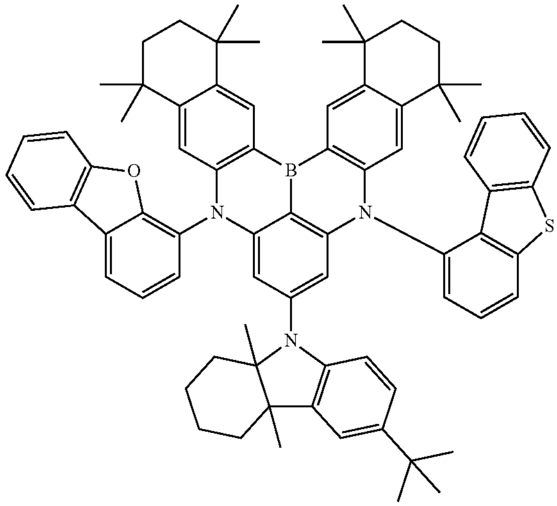
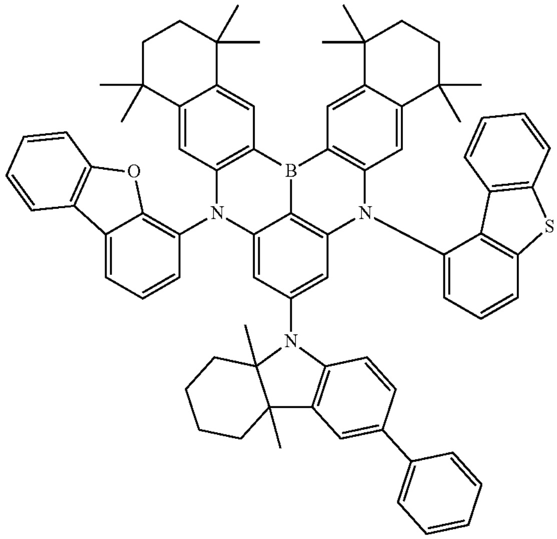
-continued
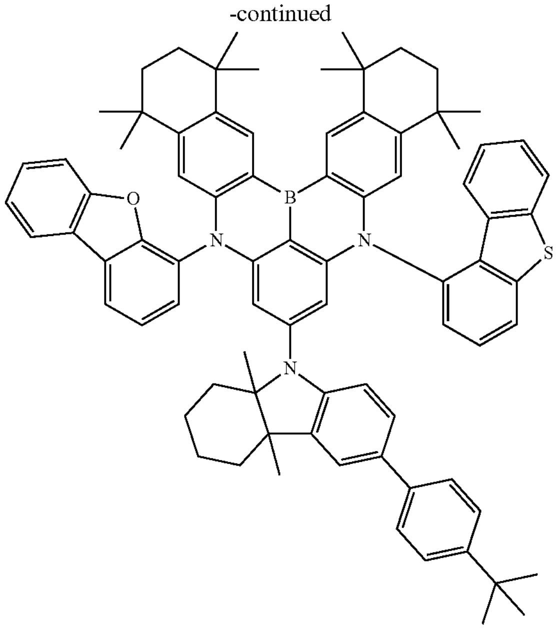
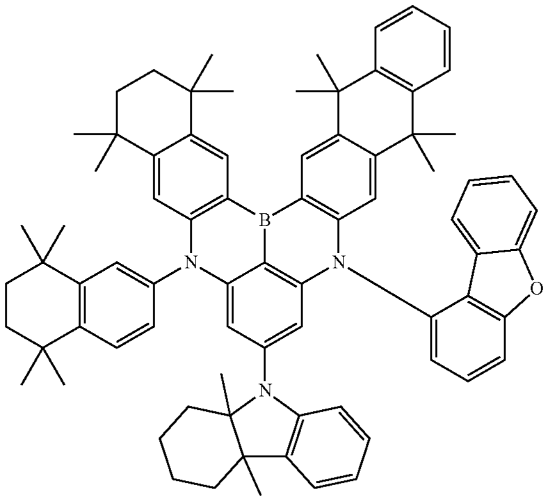

-continued
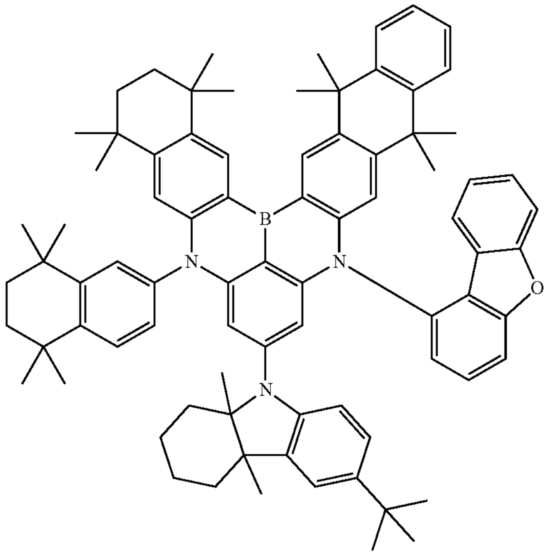
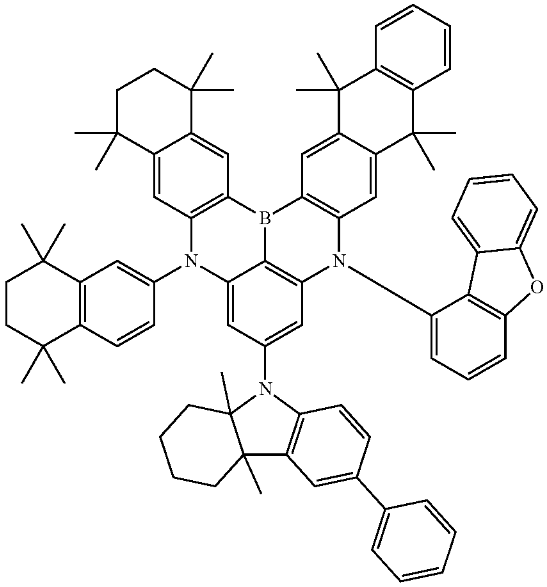
-continued
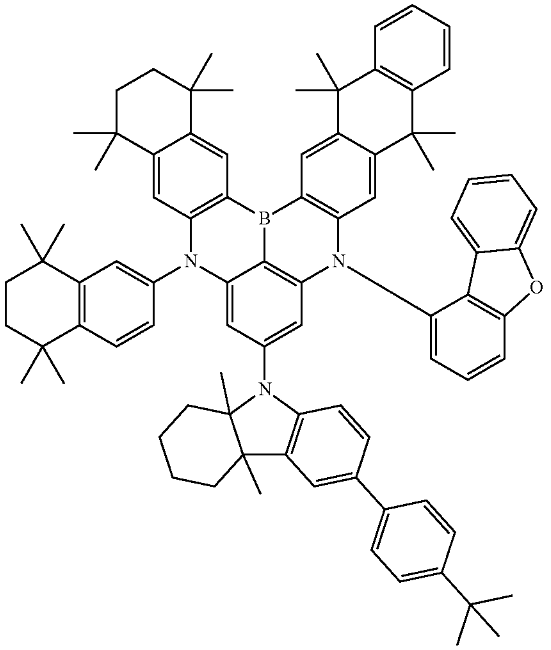
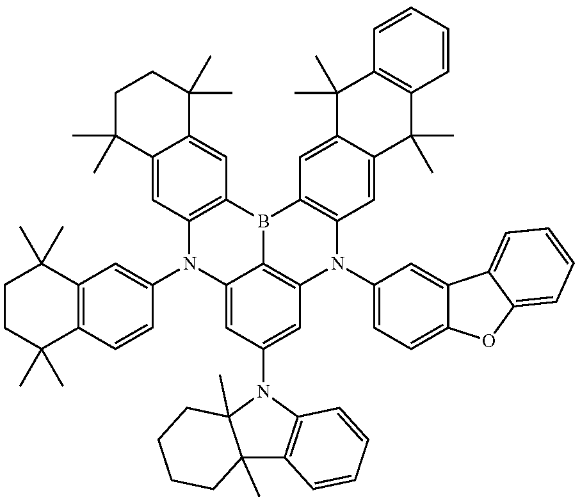
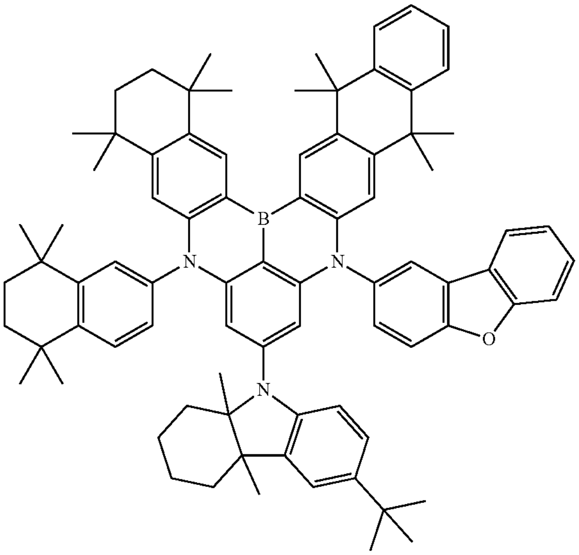

-continued
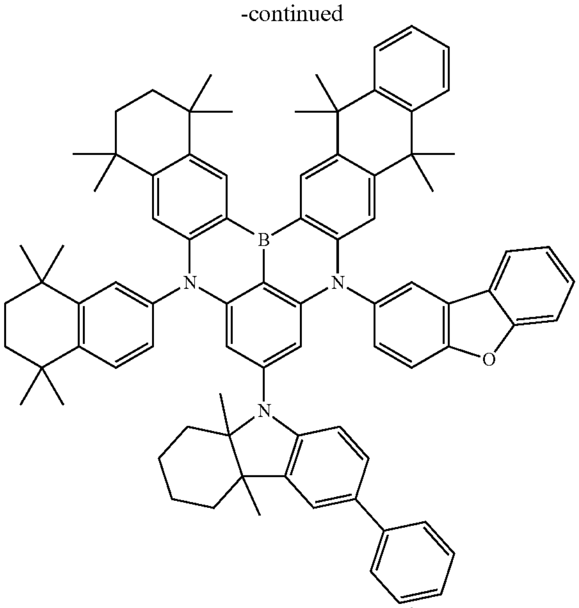
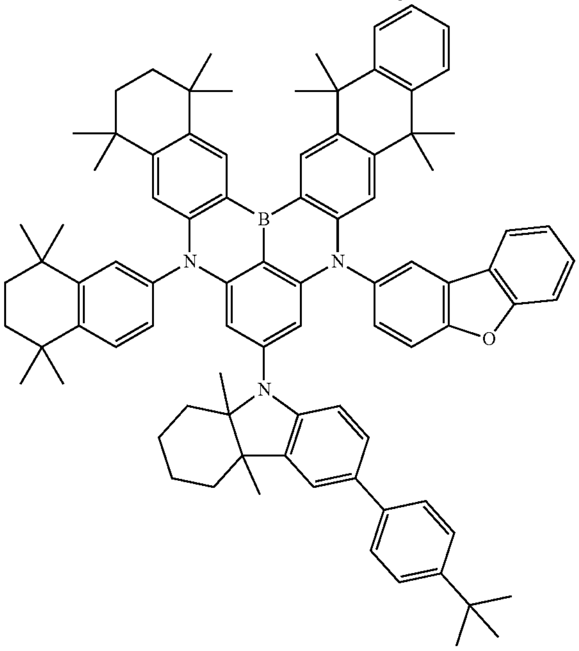
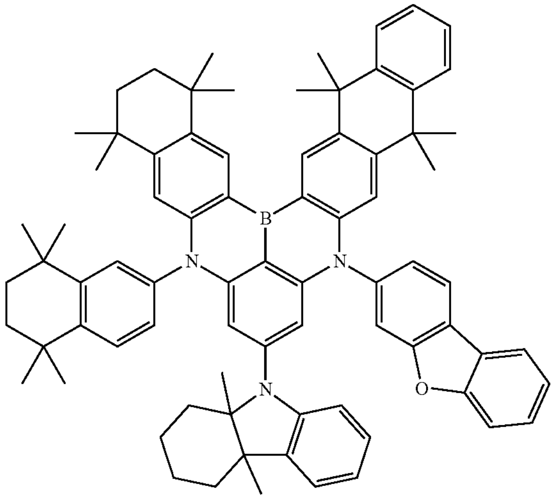
-continued
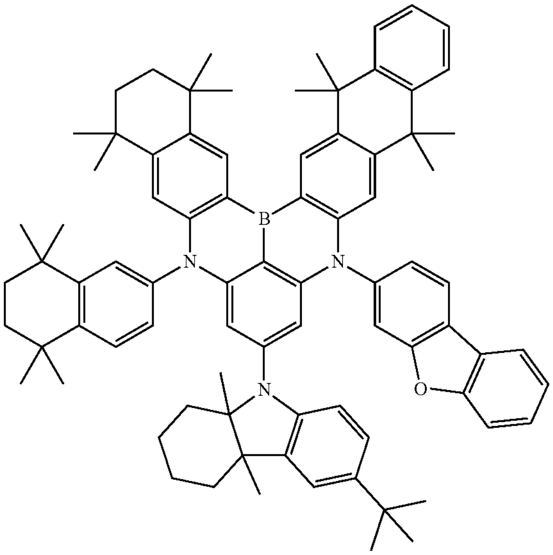
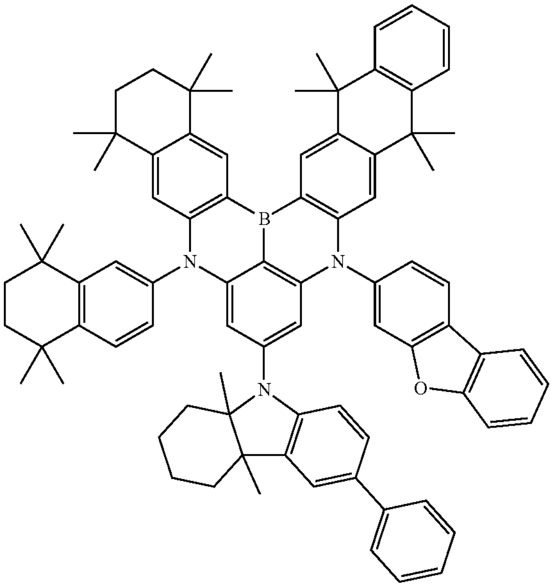

-continued
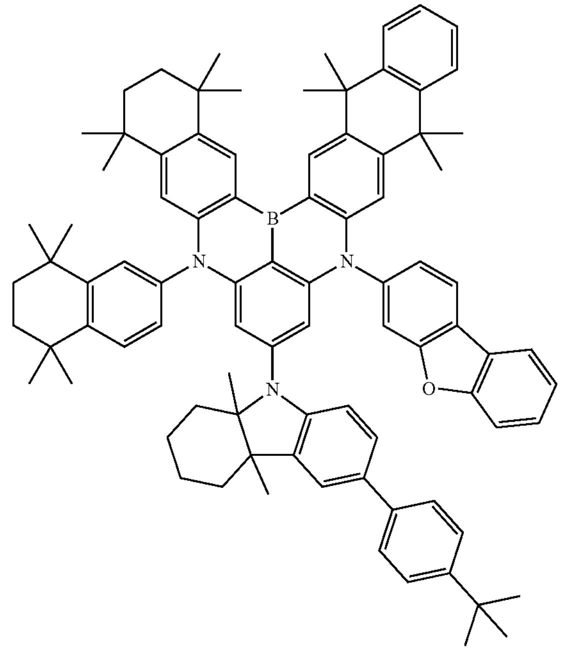
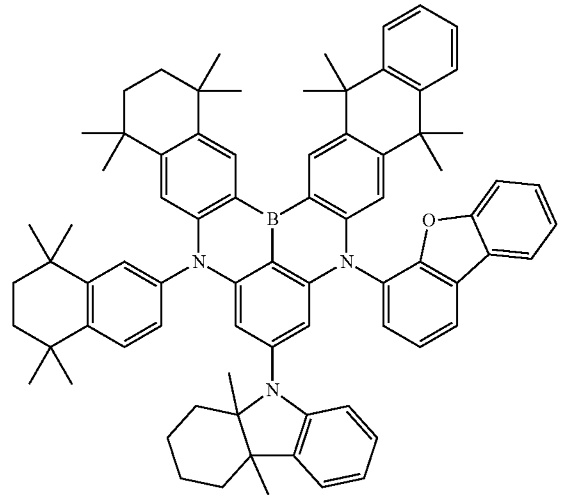
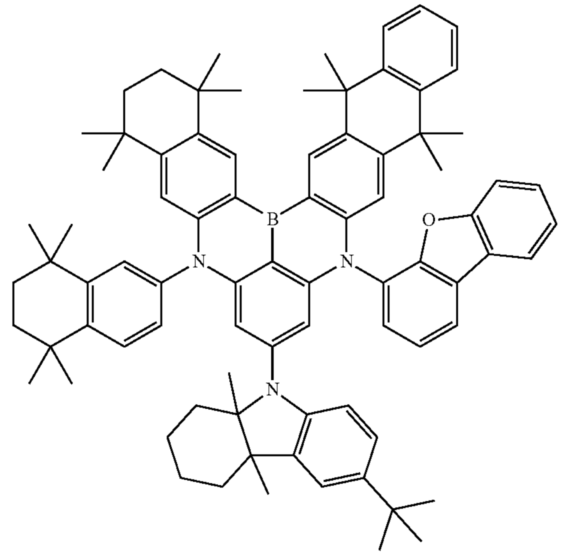
-continued
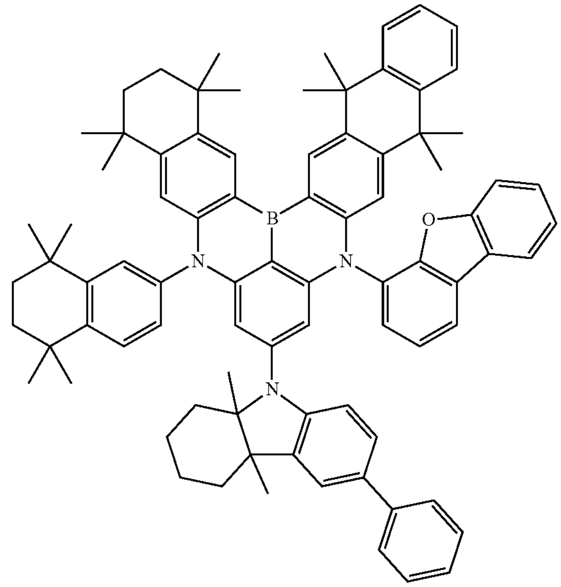
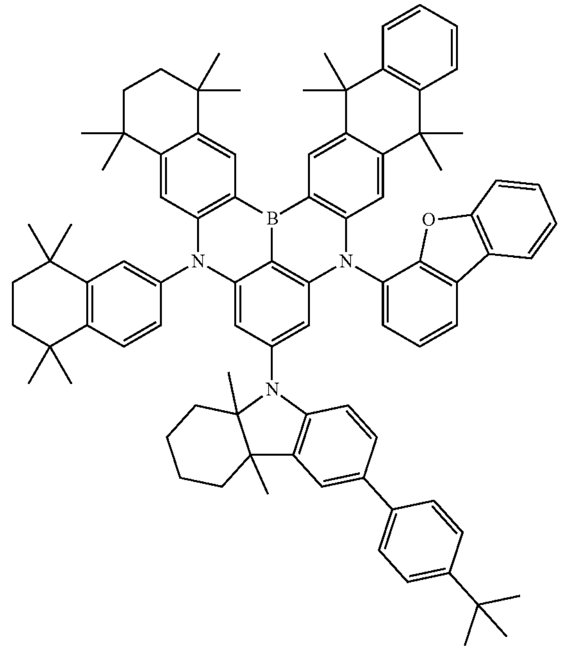

-continued
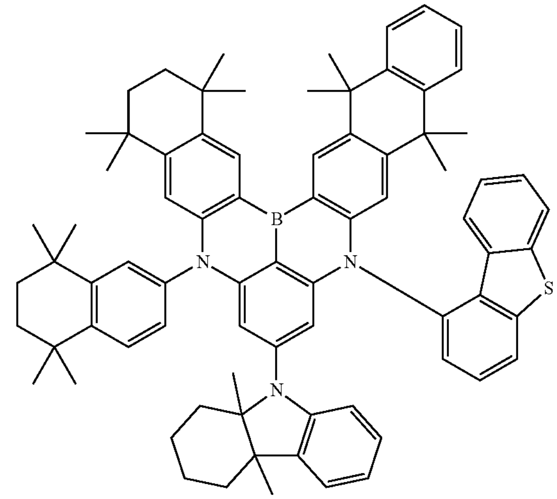
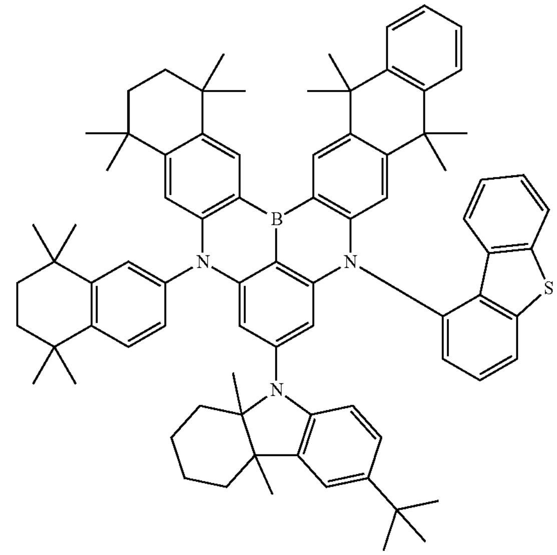
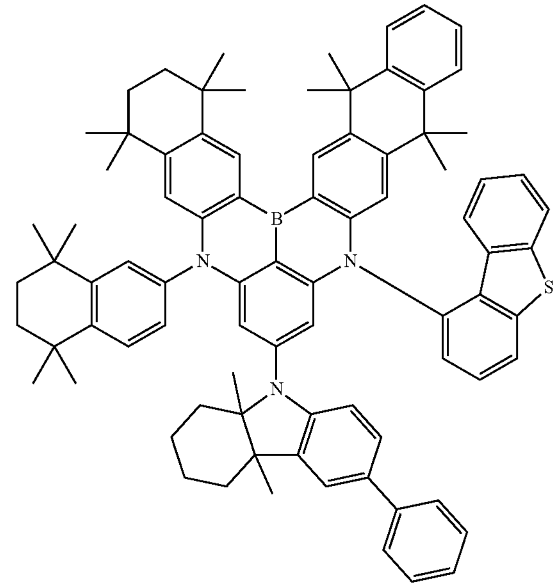
-continued
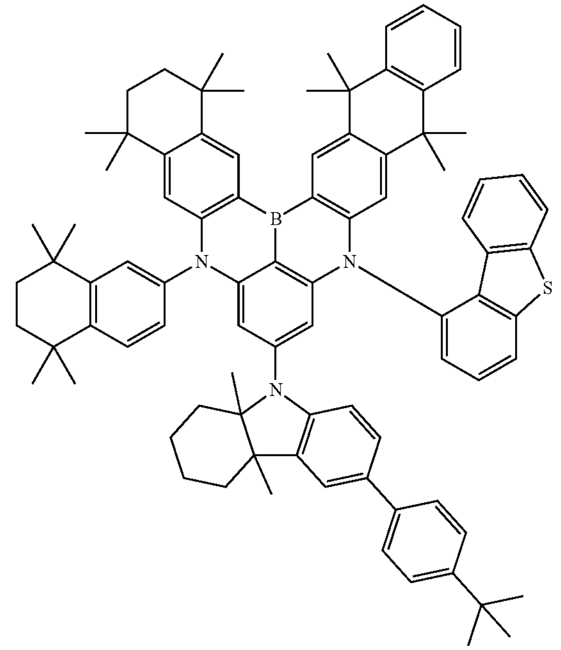
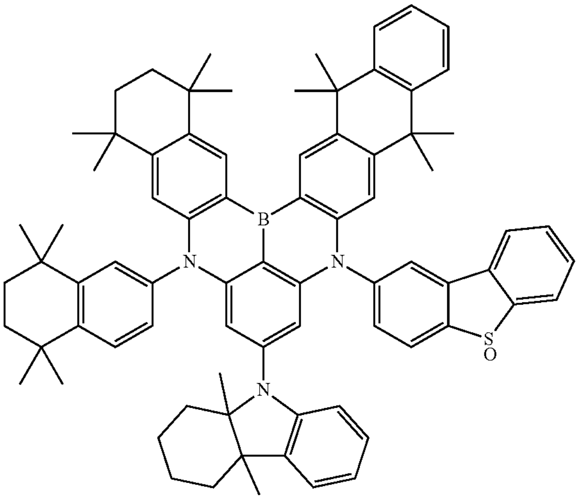
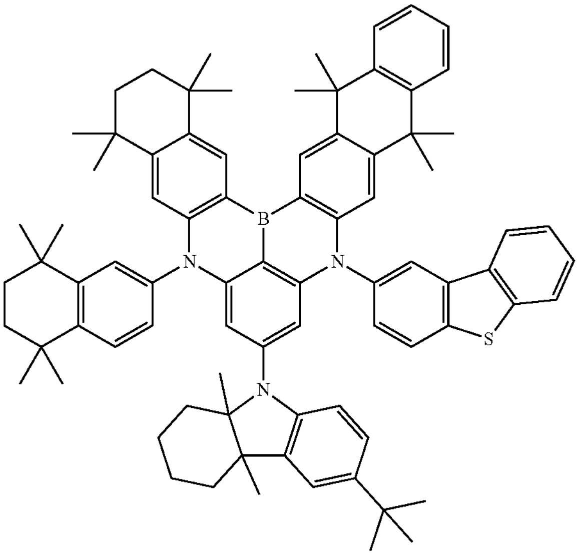

-continued
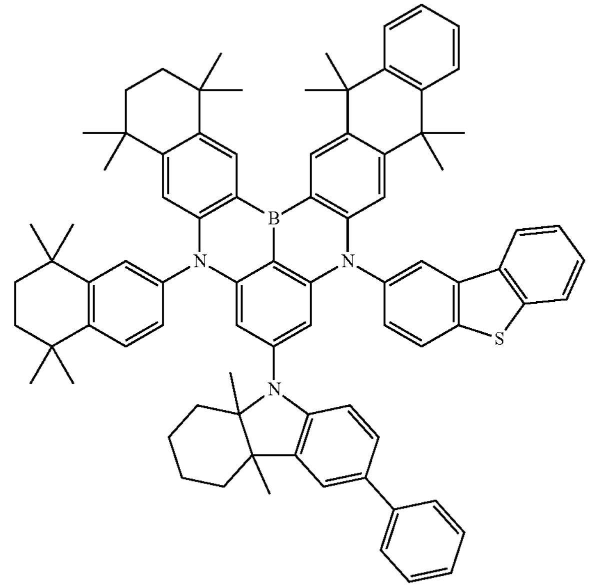
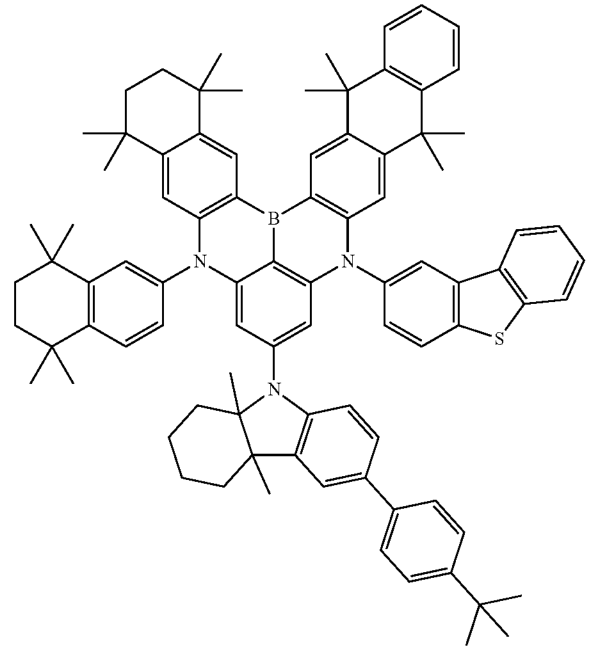
-continued
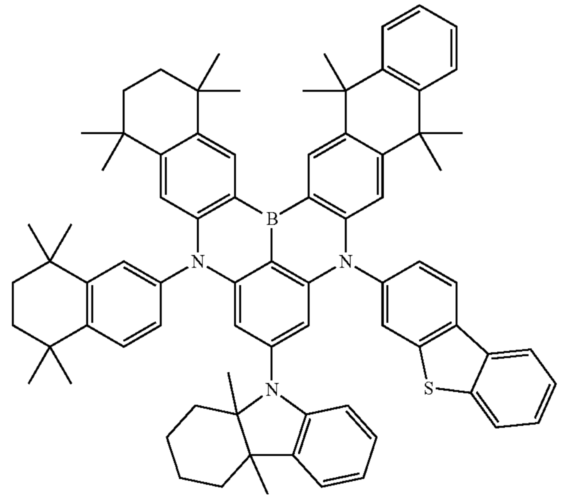
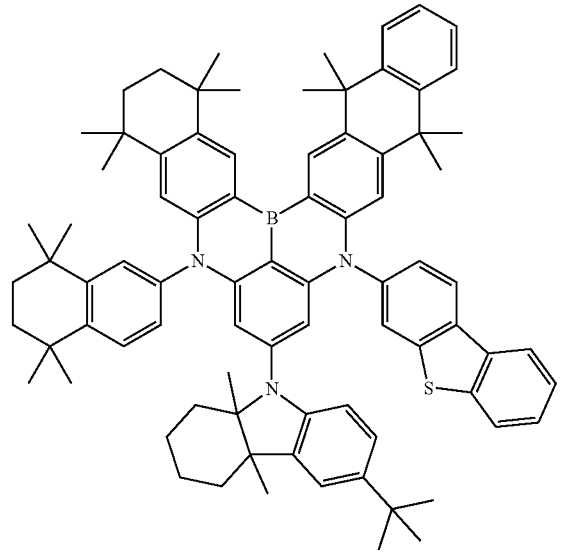
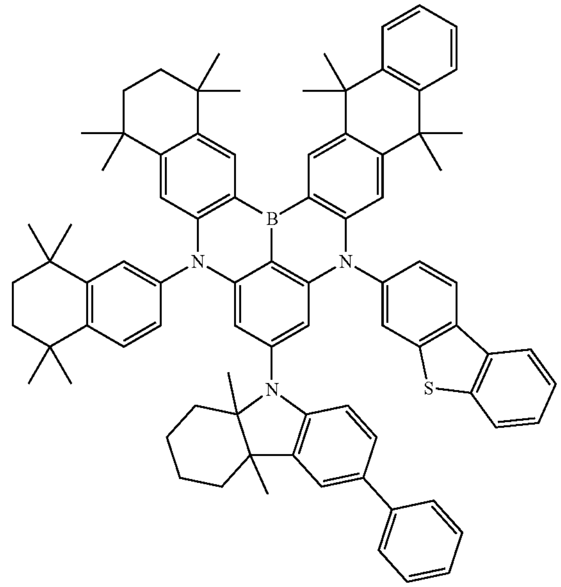

-continued
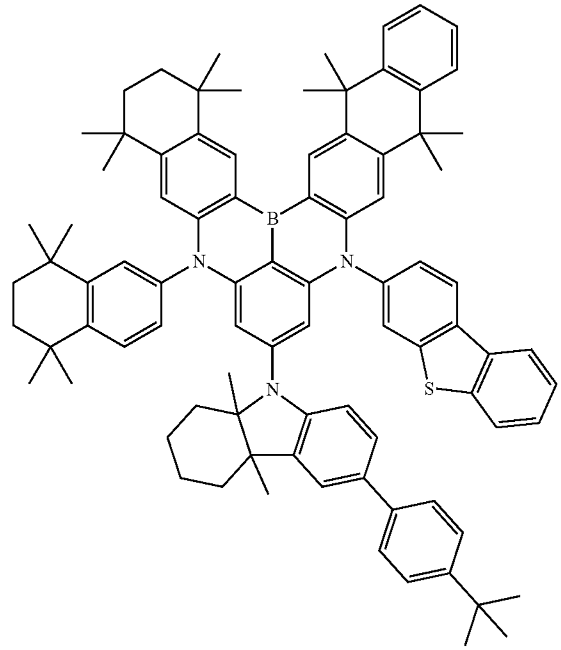
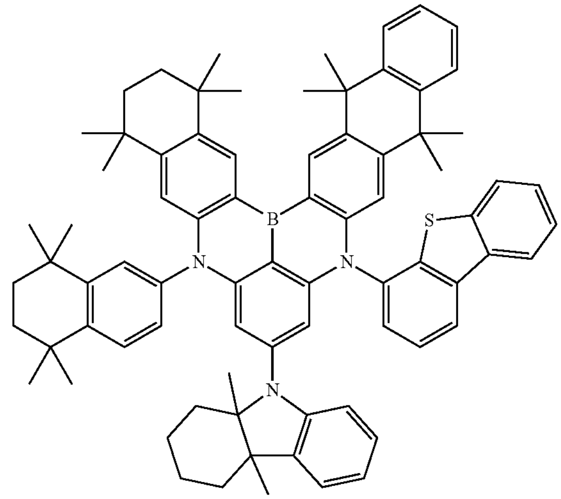
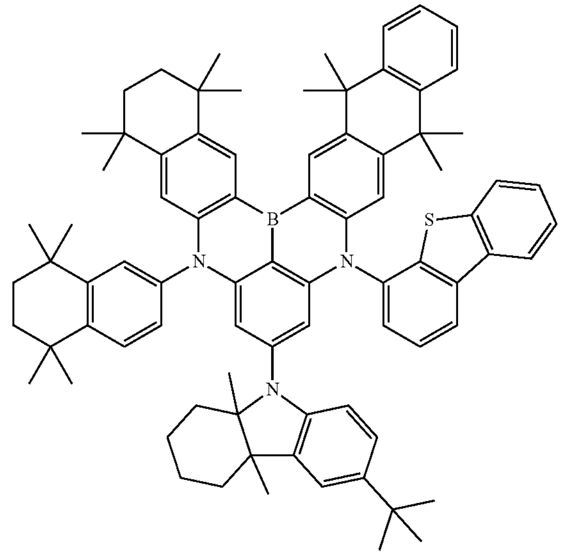
-continued
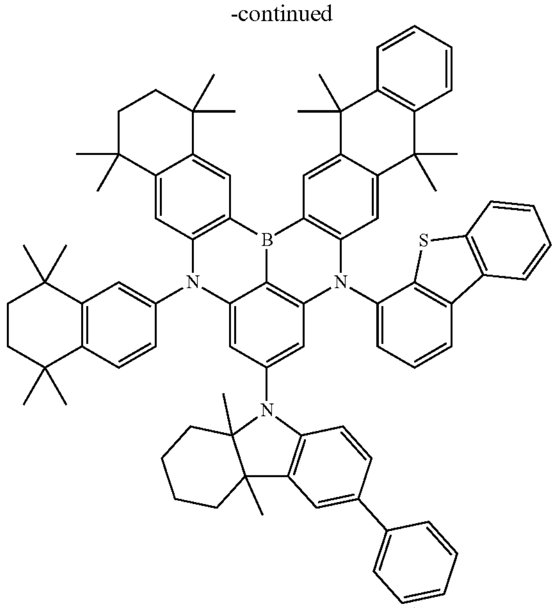
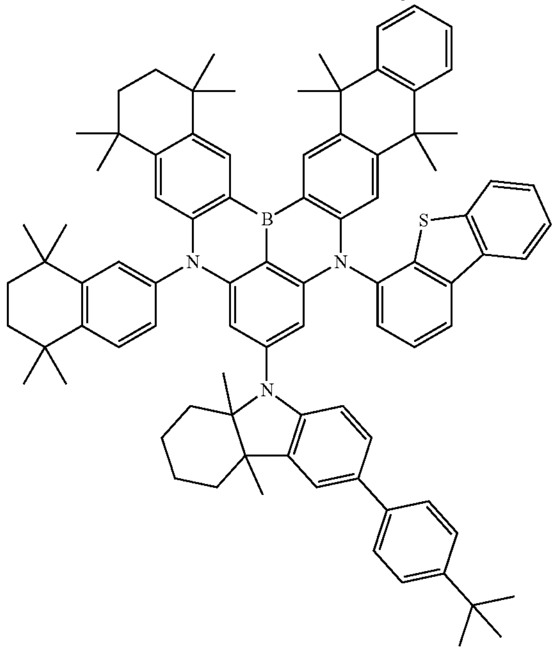
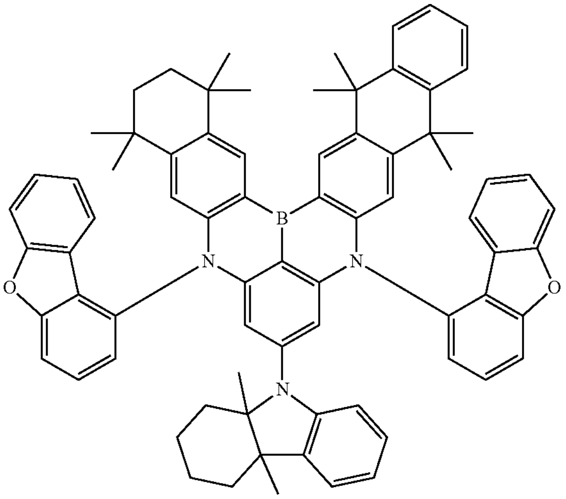

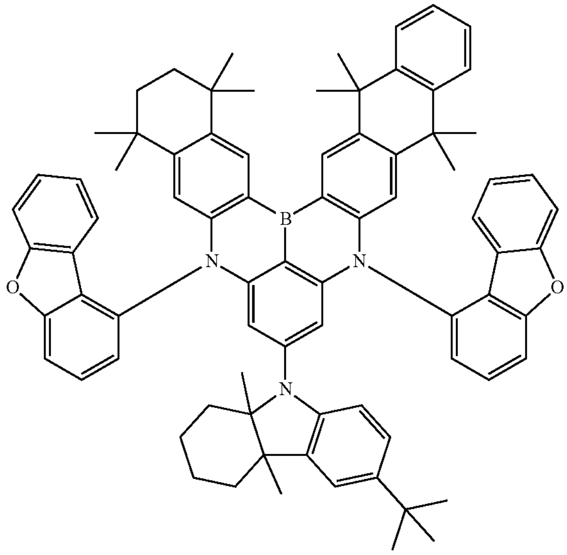
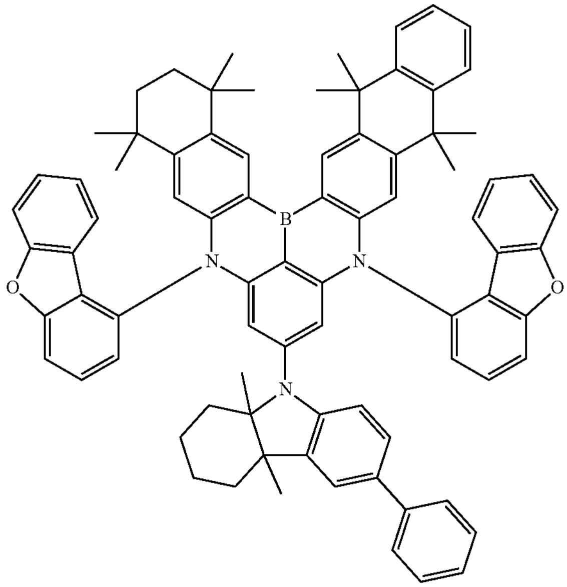
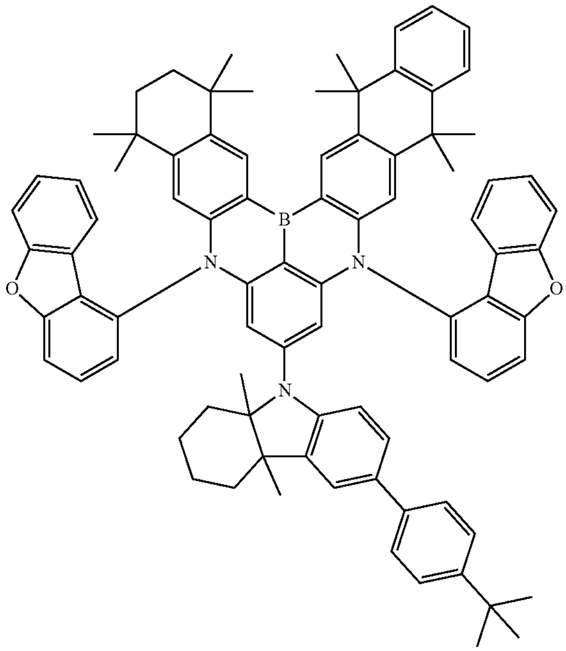
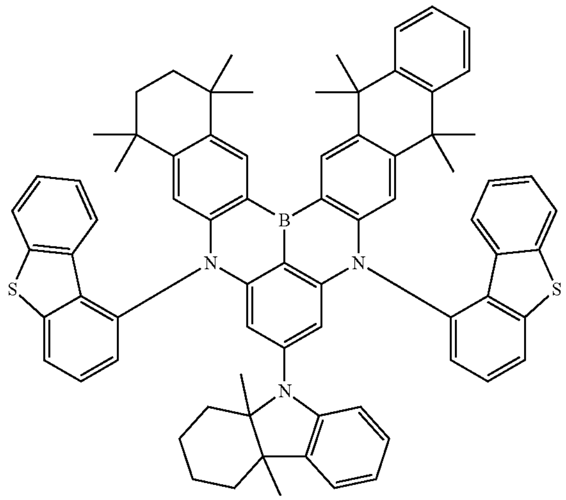
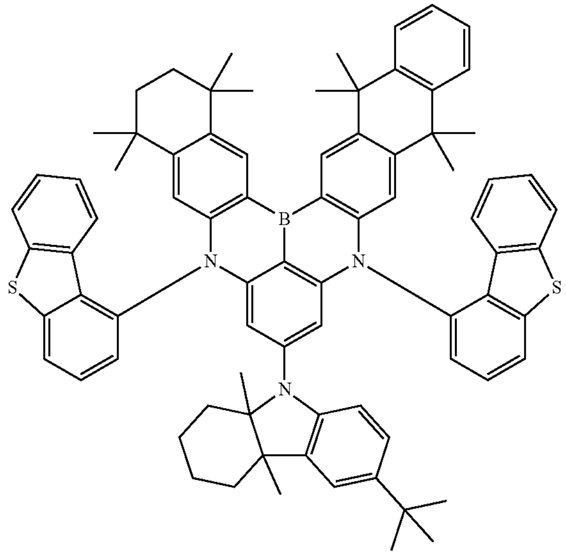

-continued
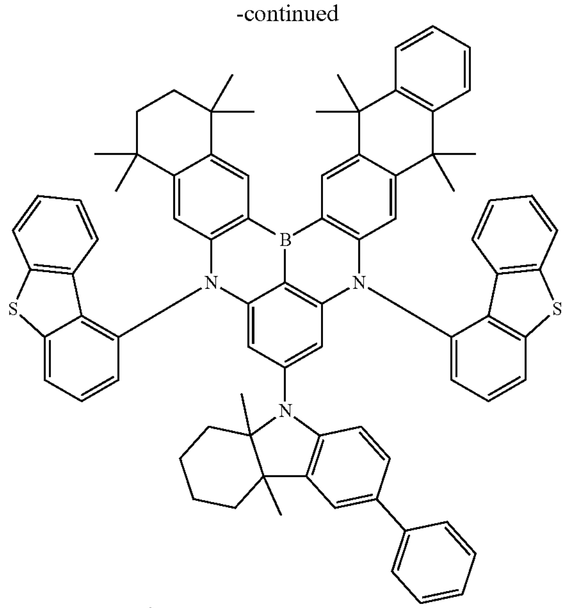
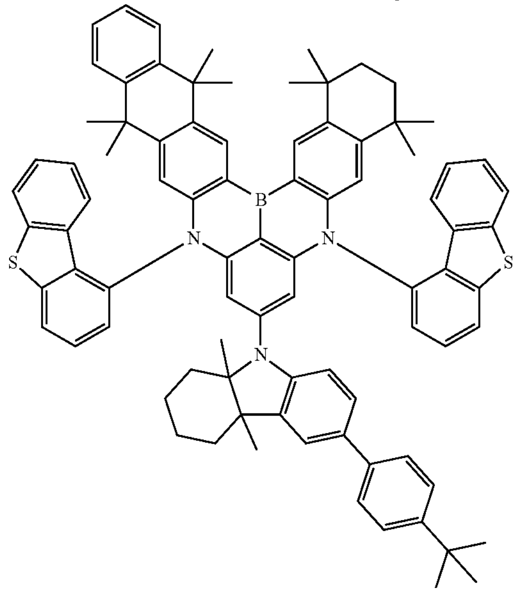
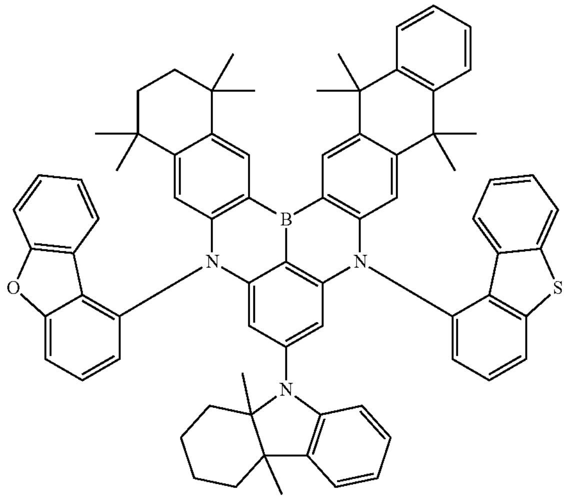
-continued
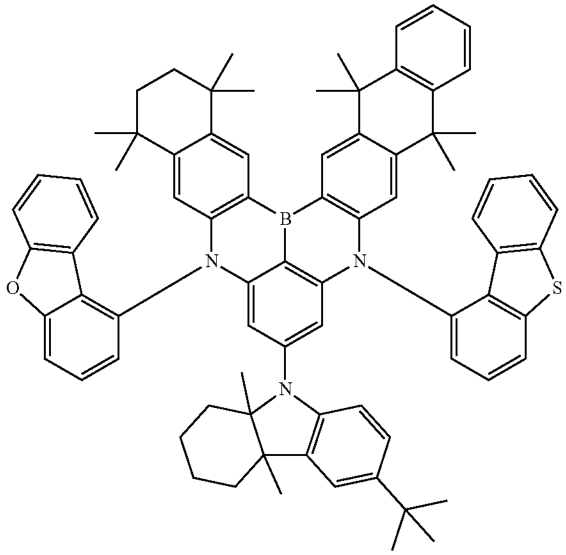
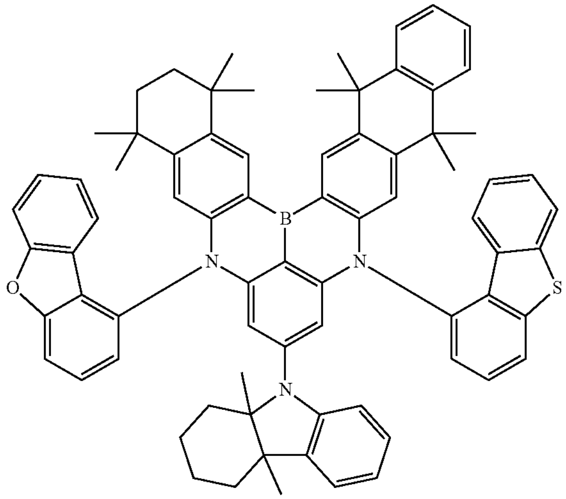
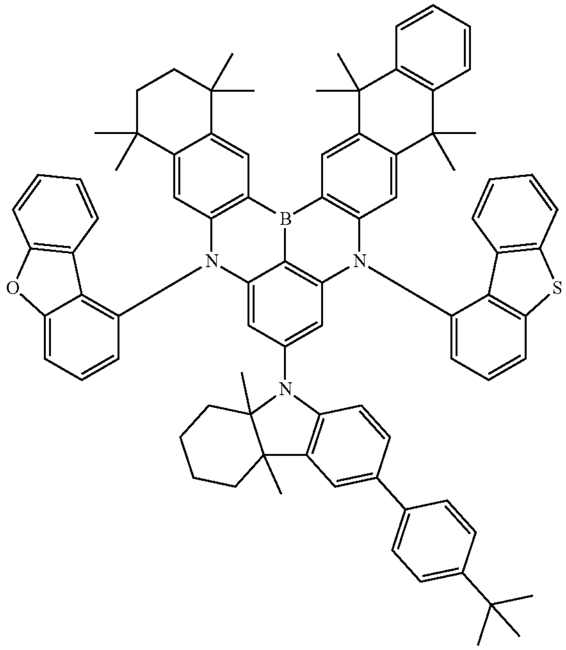

-continued
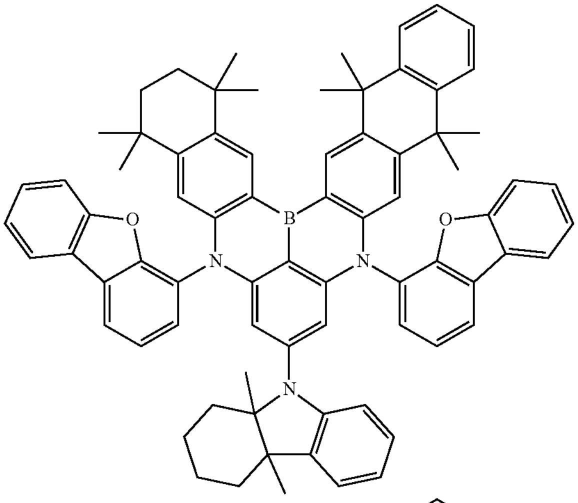
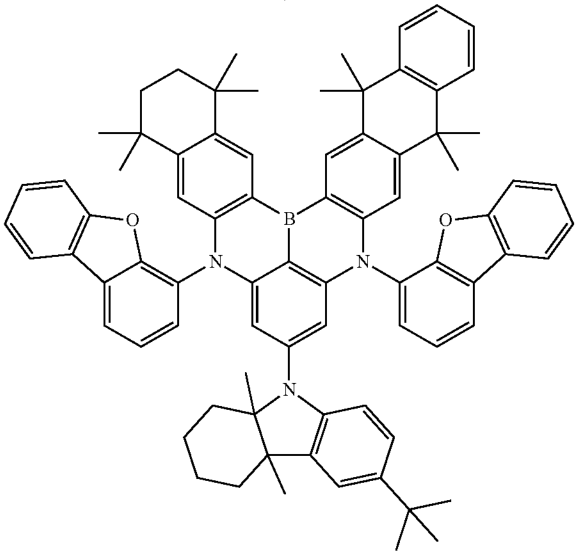
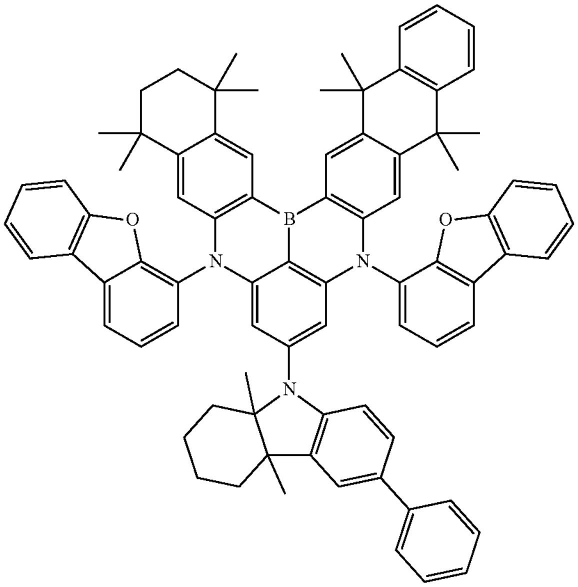
-continued
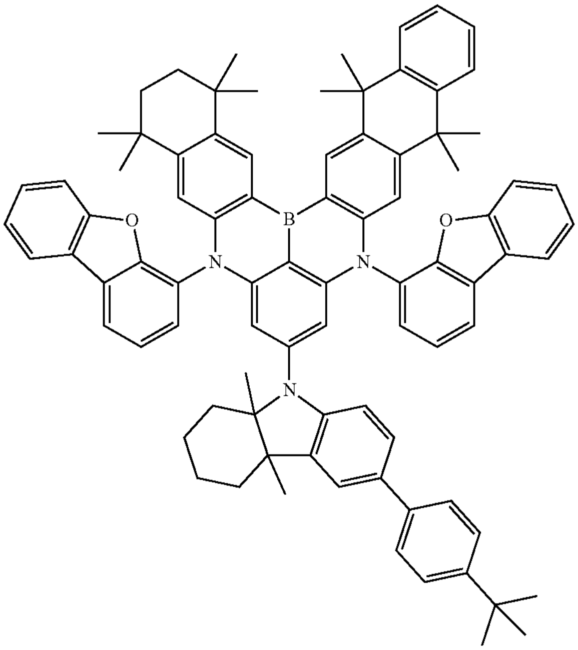
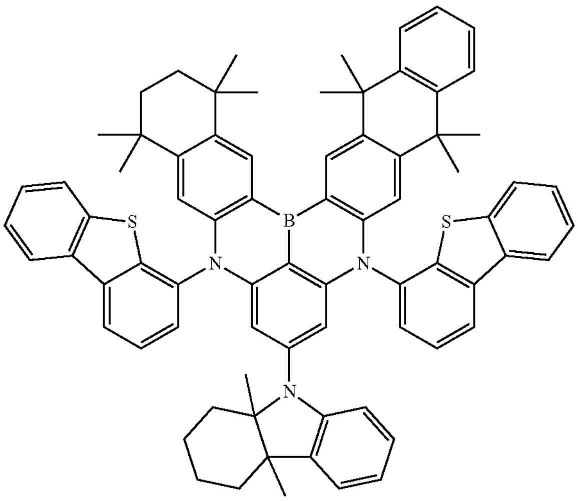
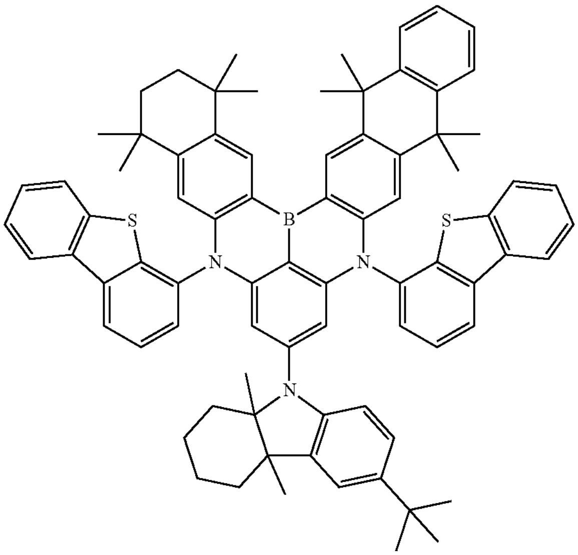

-continued
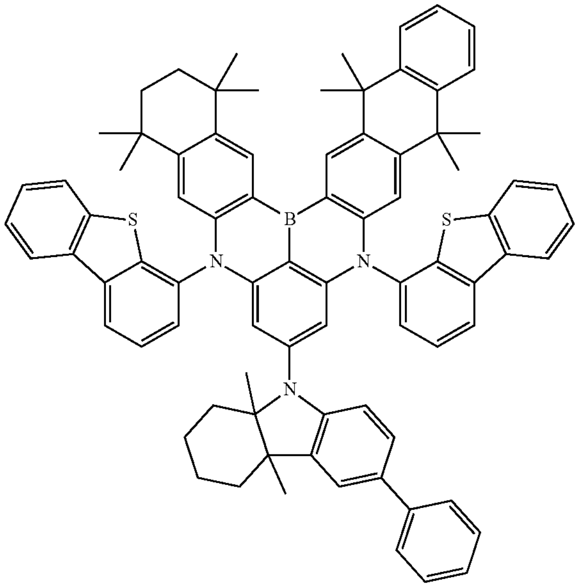
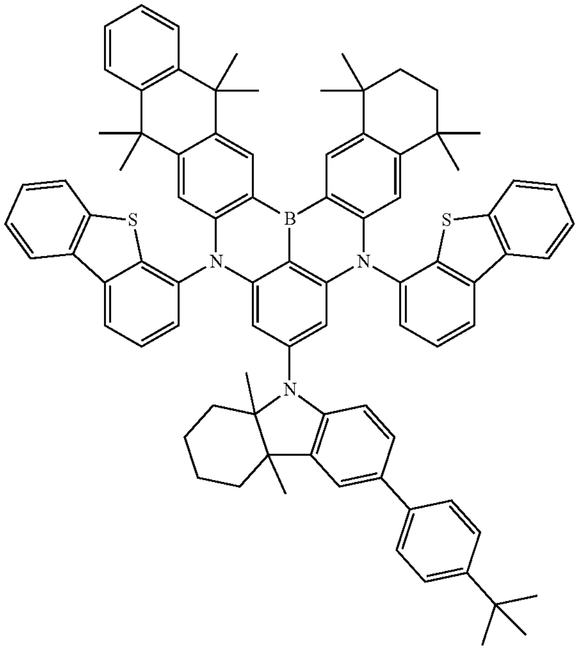
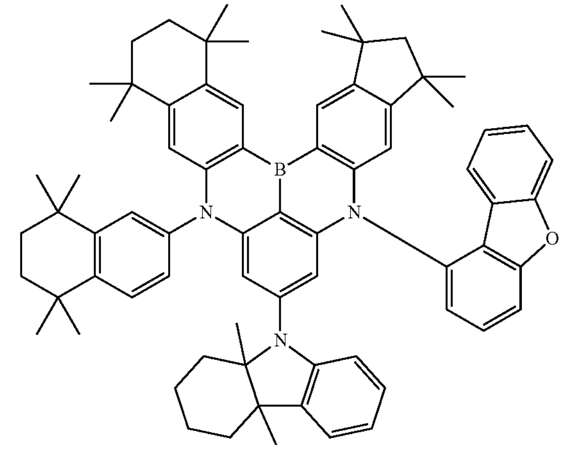
-continued
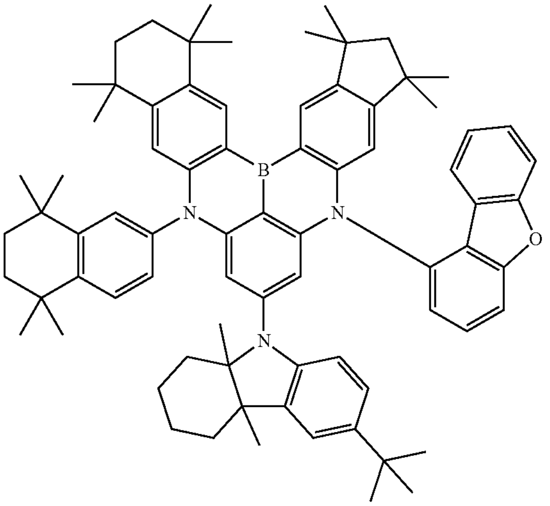
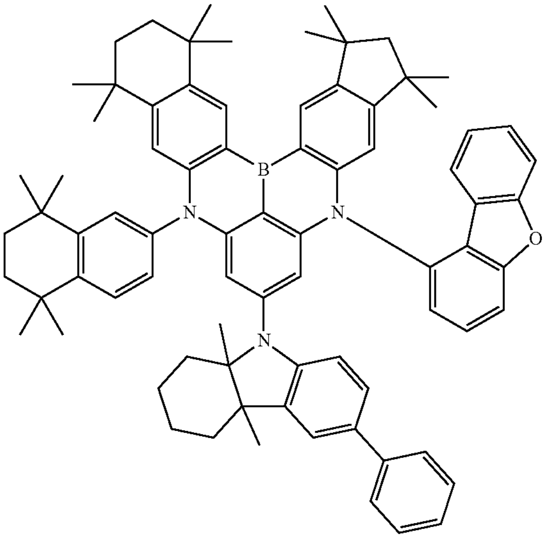
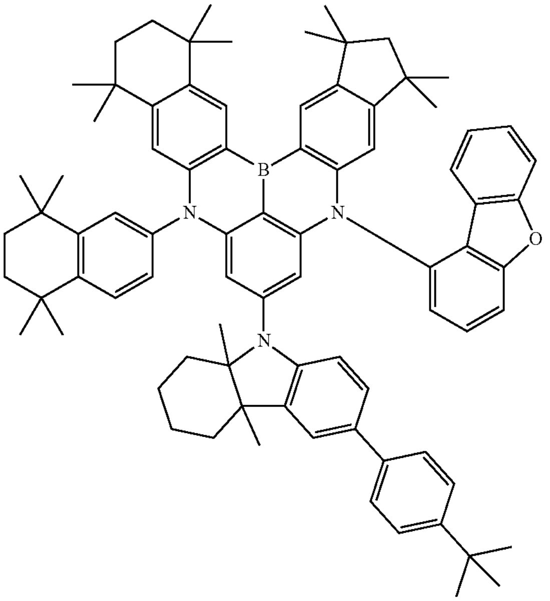

-continued
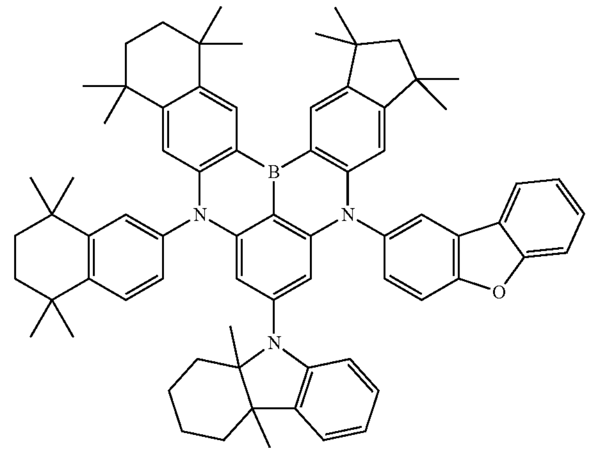
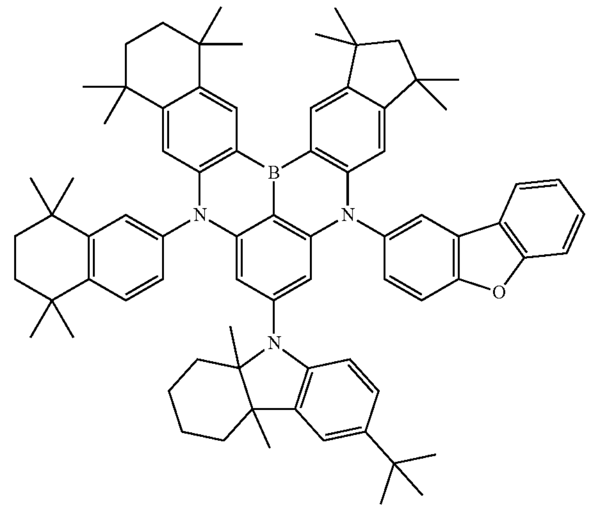
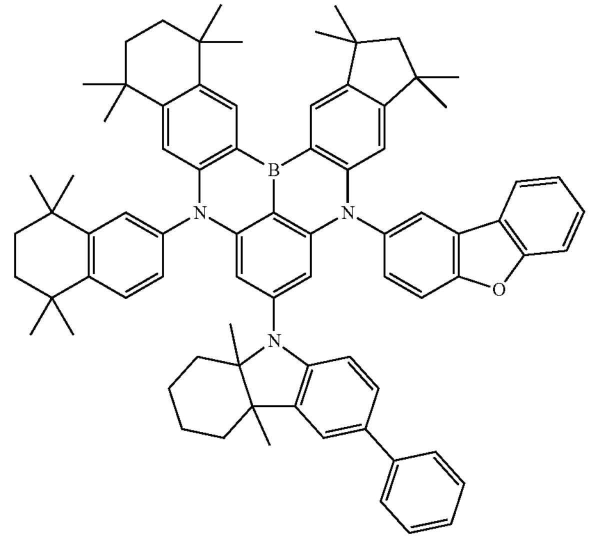
-continued
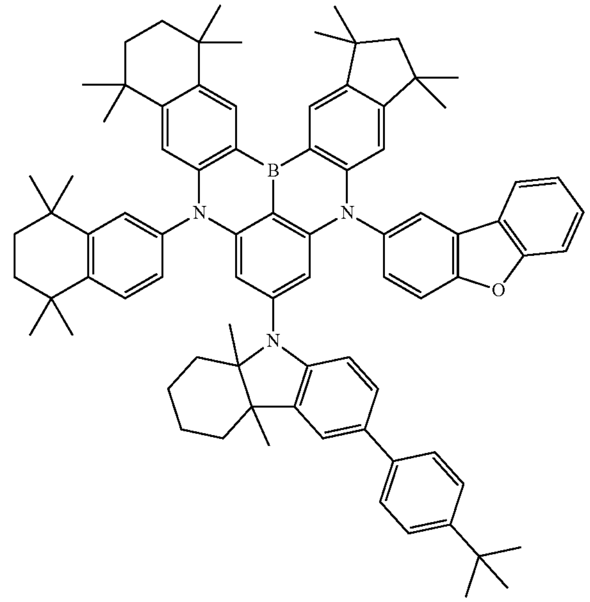
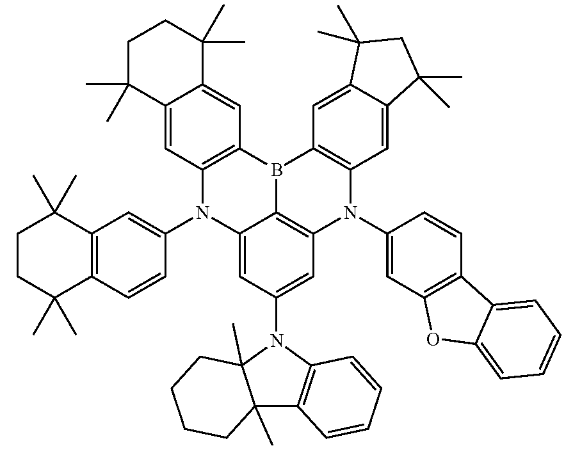
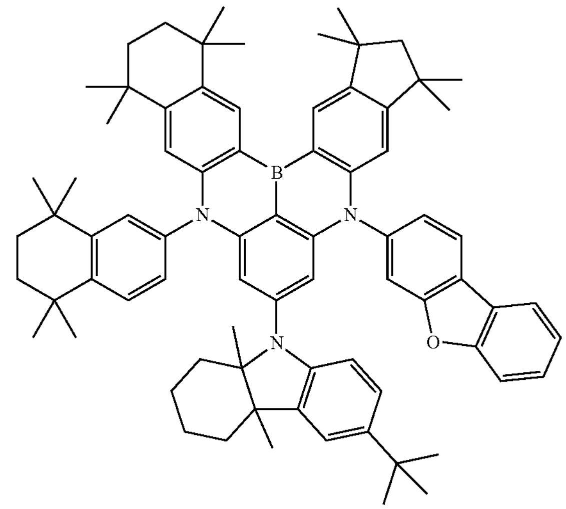

-continued
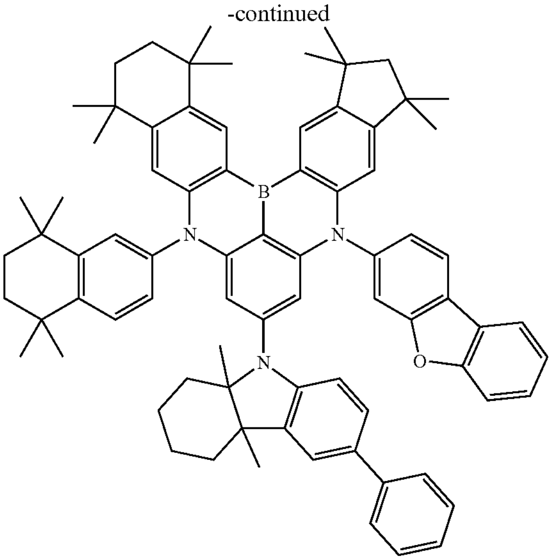
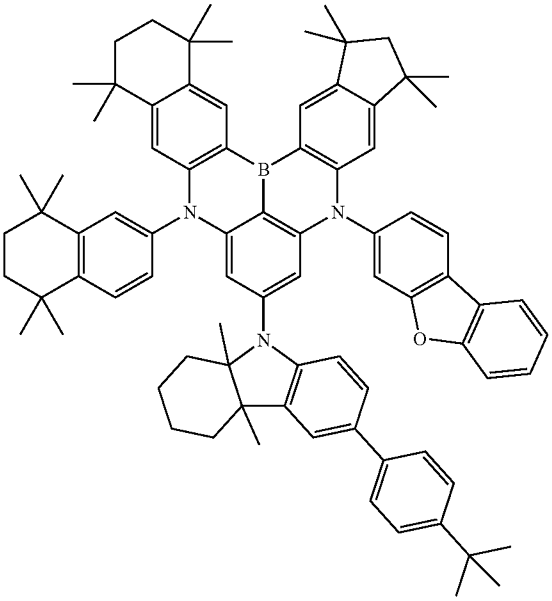
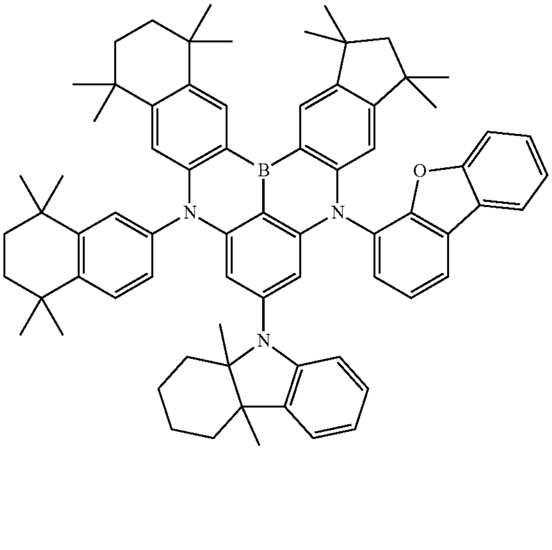
-continued
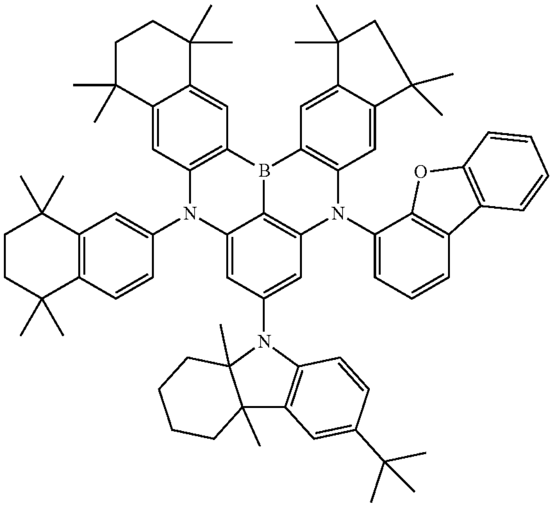
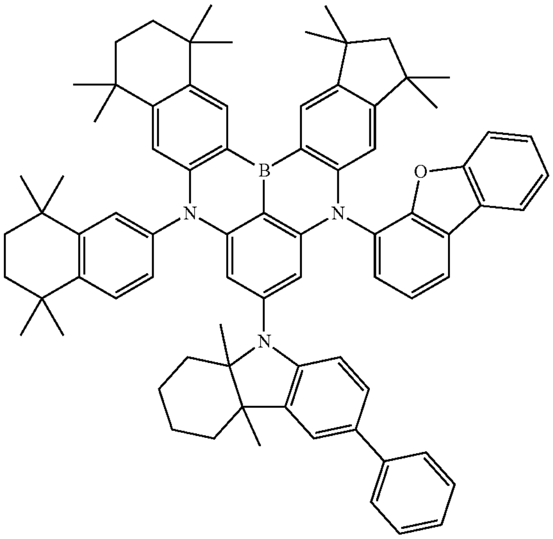
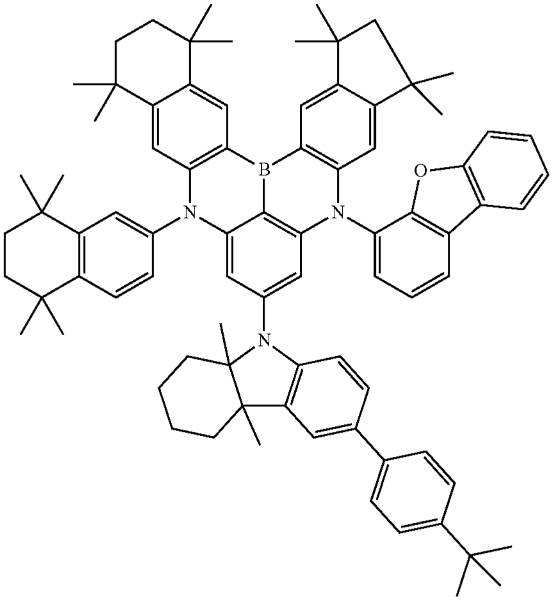

-continued
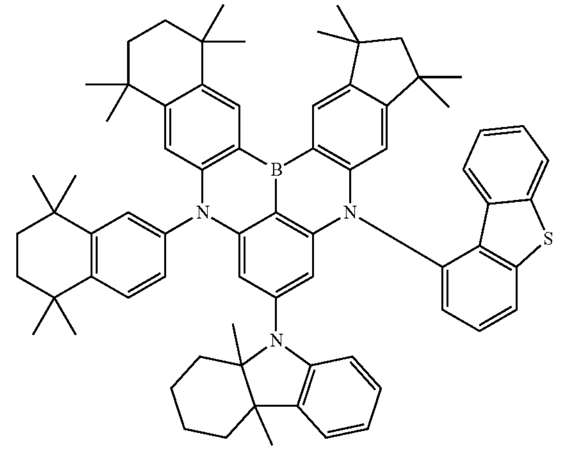
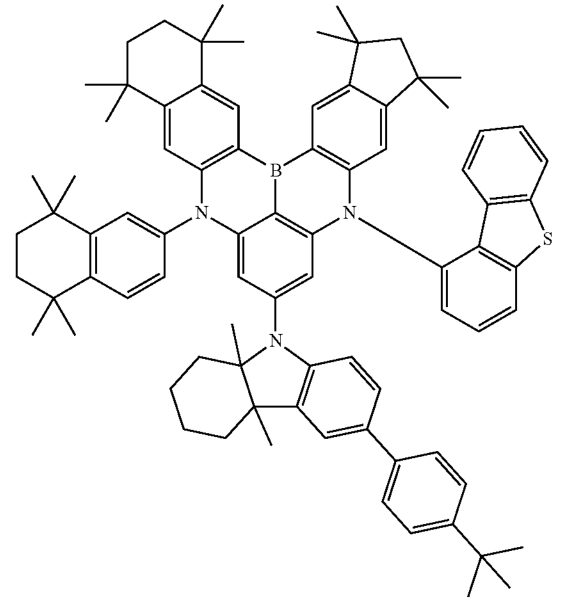
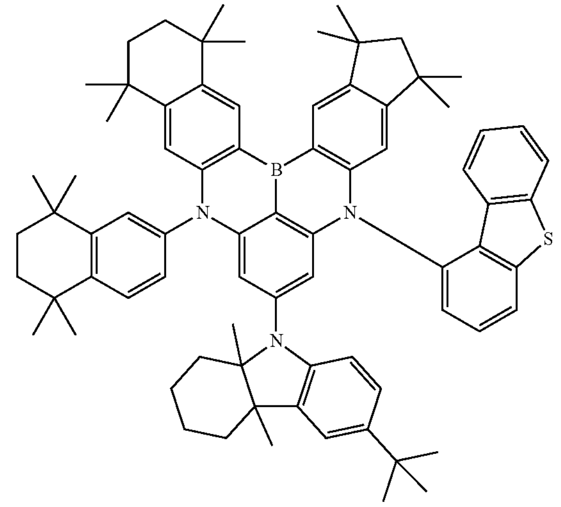
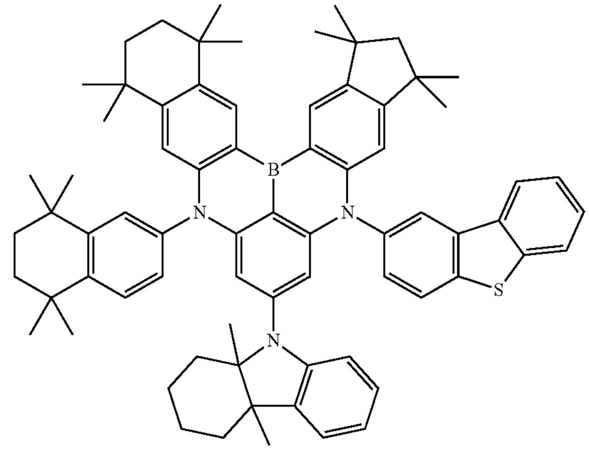
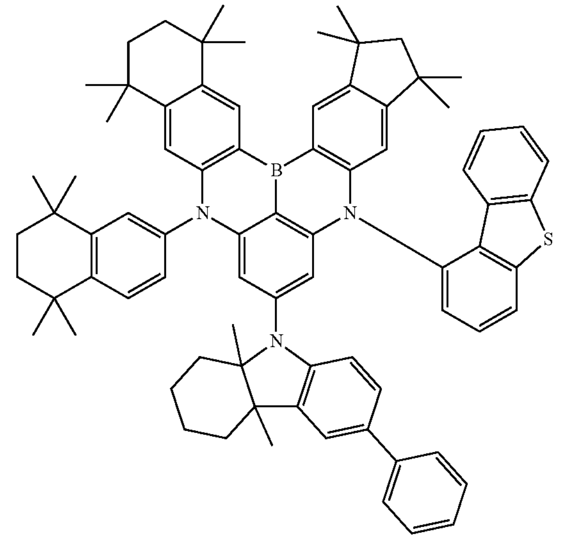
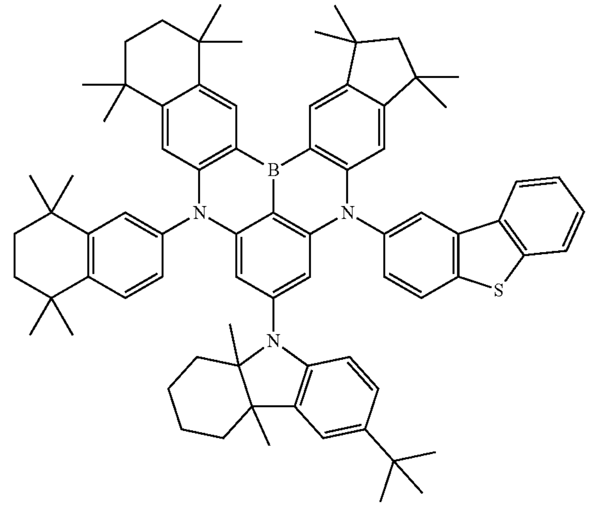
-continued -continued
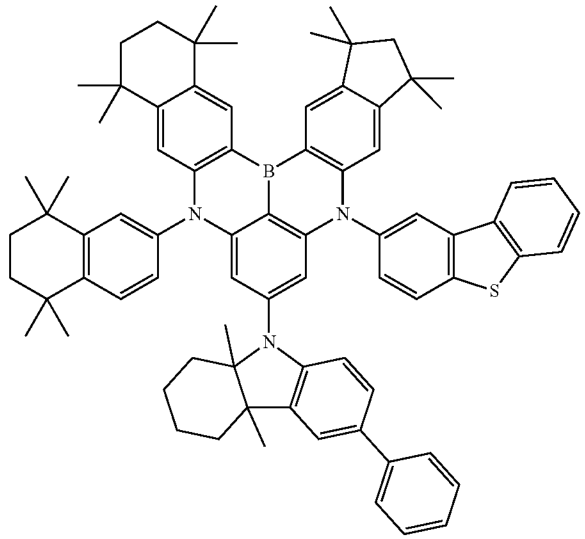
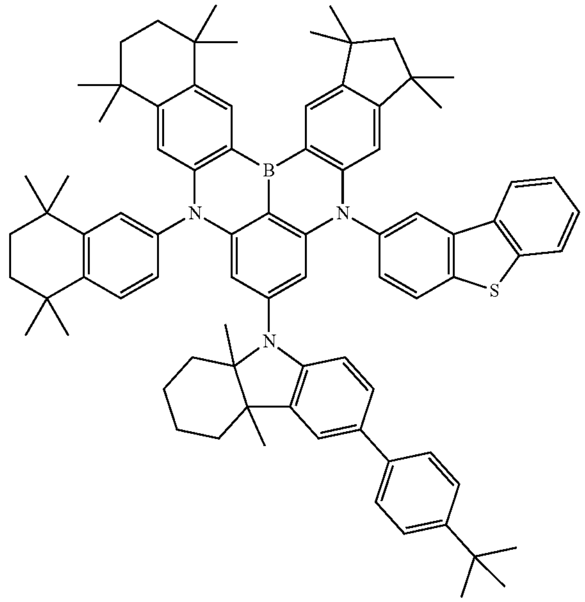
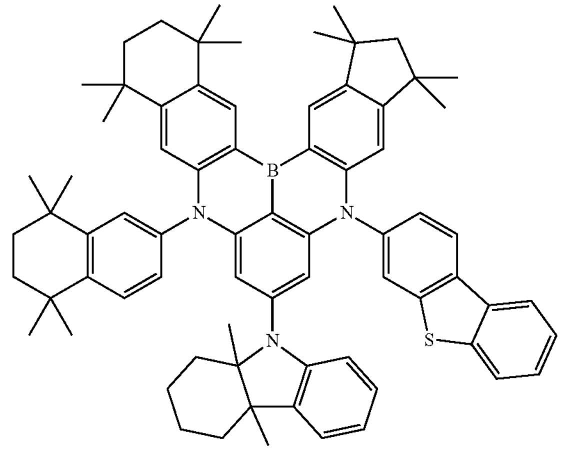
-continued
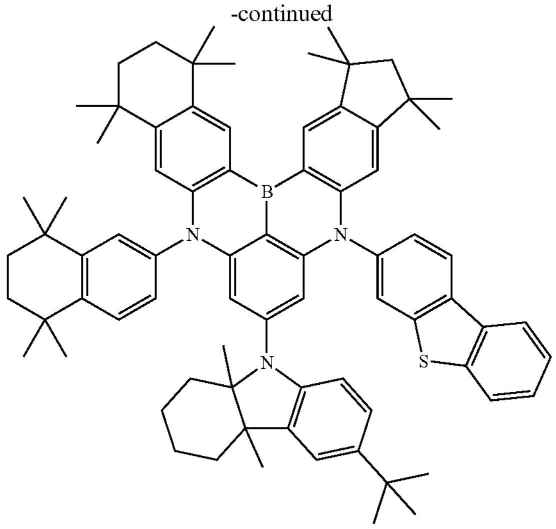
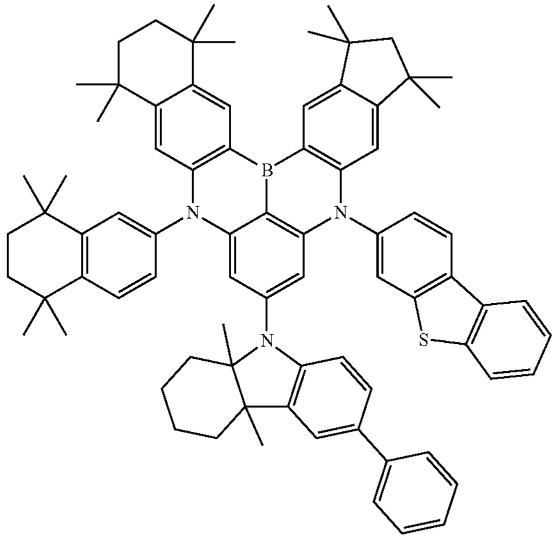
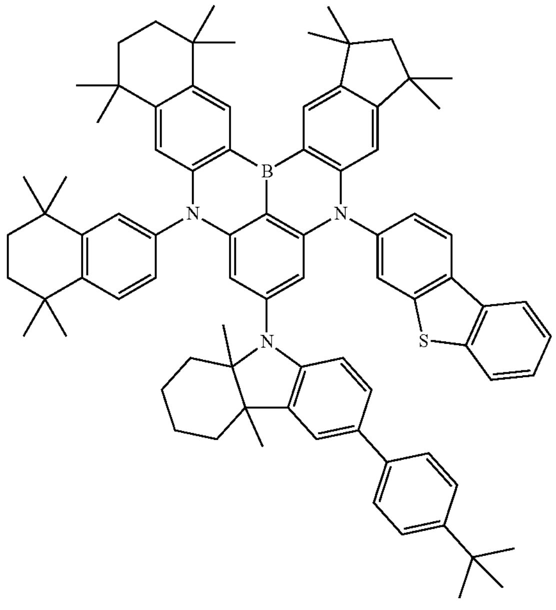

-continued
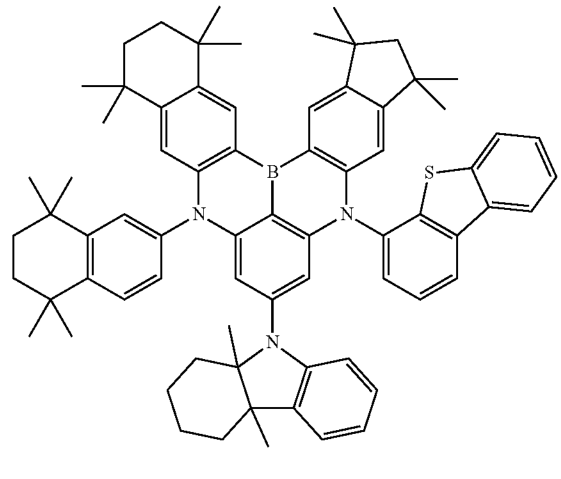
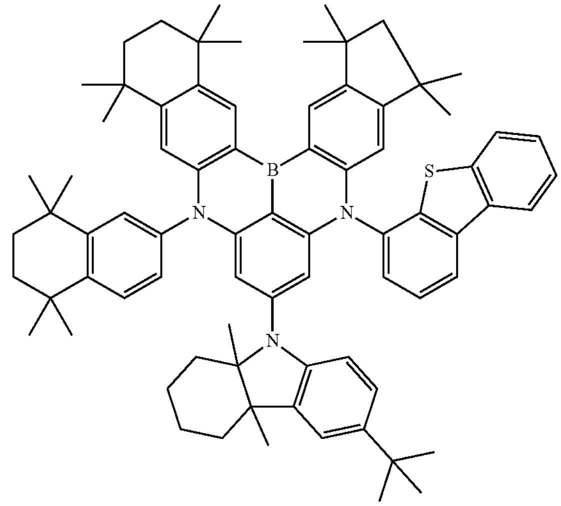
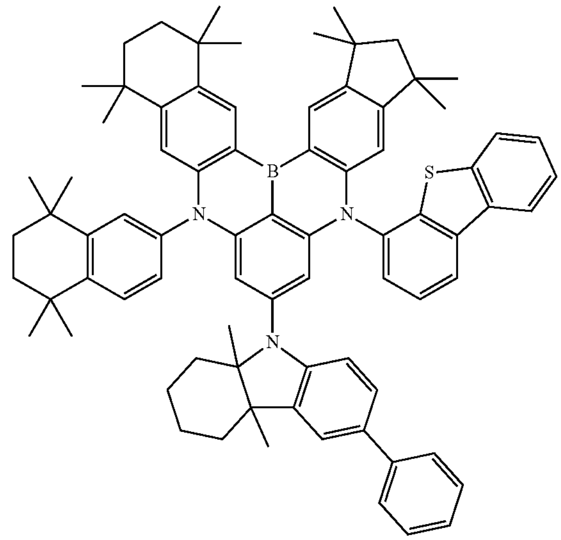
-continued
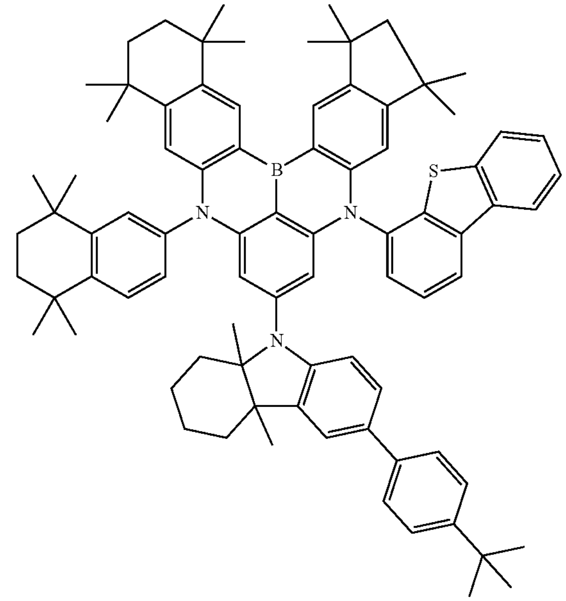
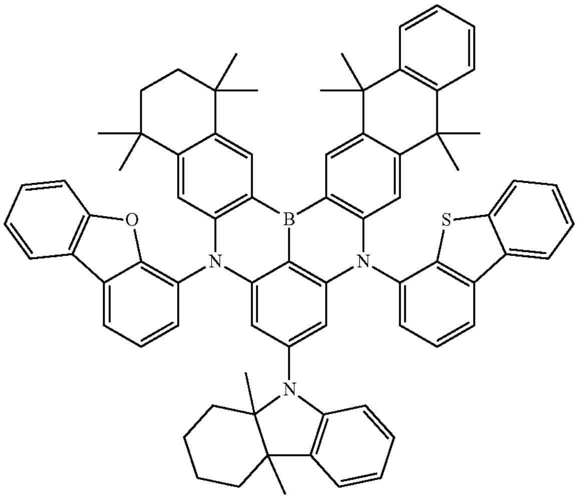
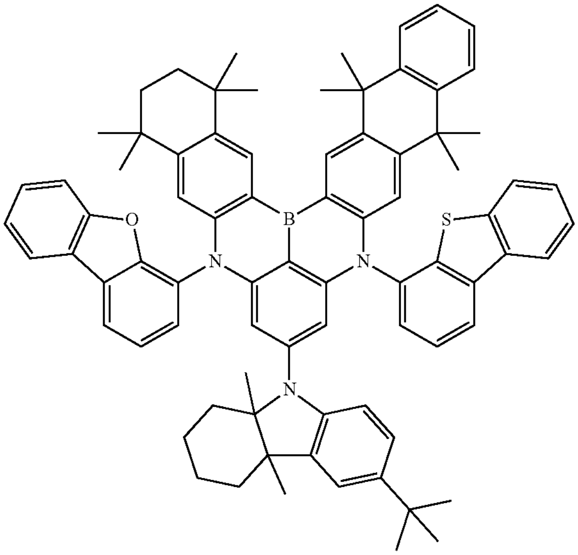

-continued
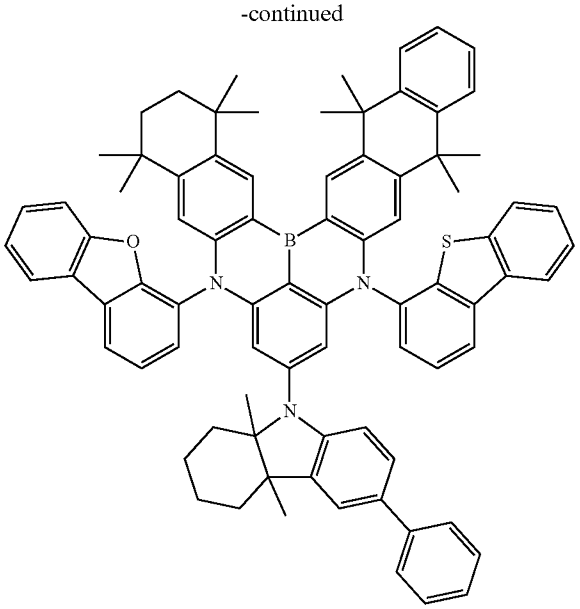
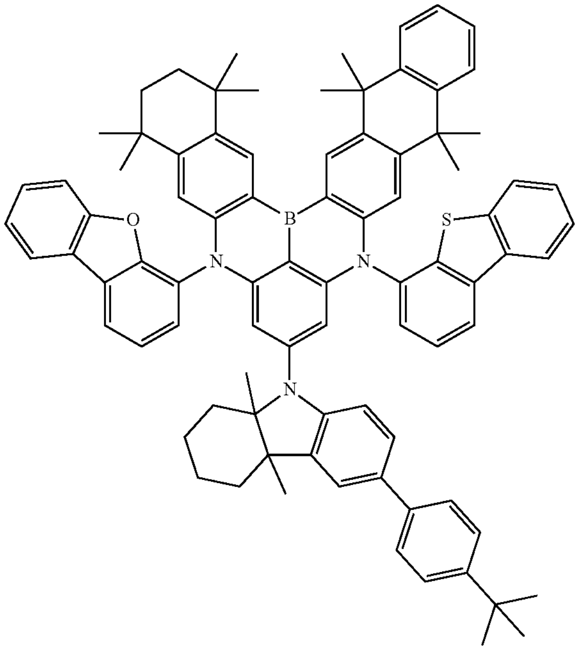
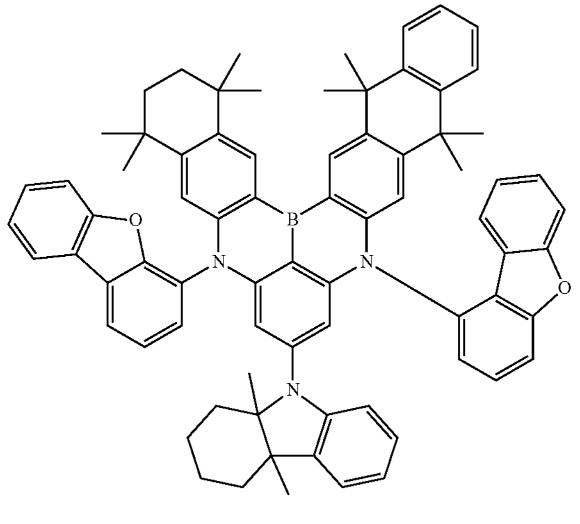
-continued
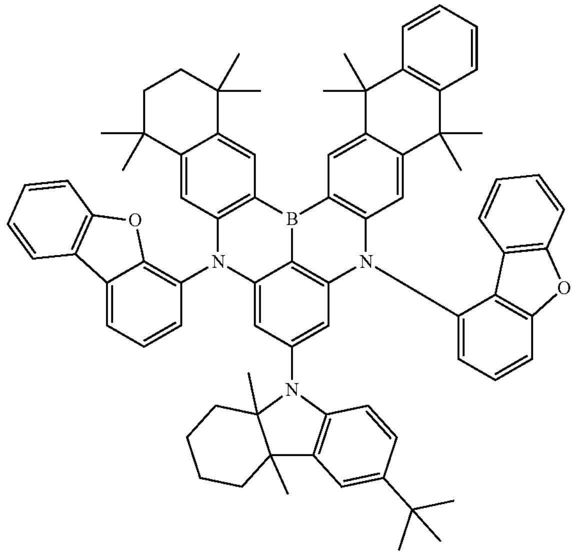
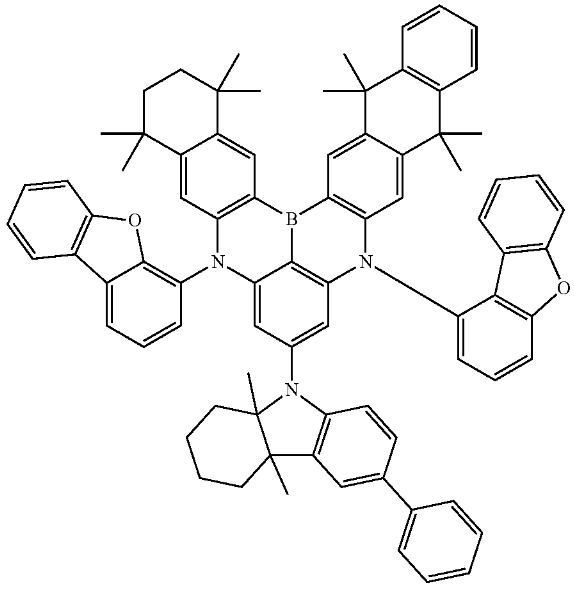

-continued
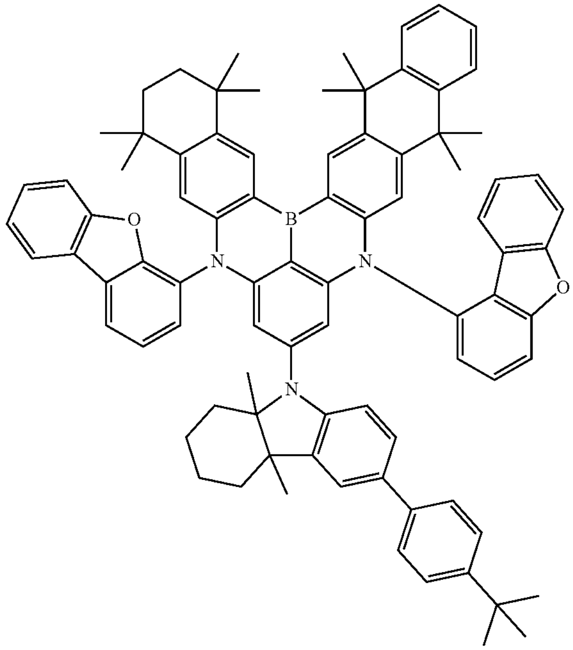
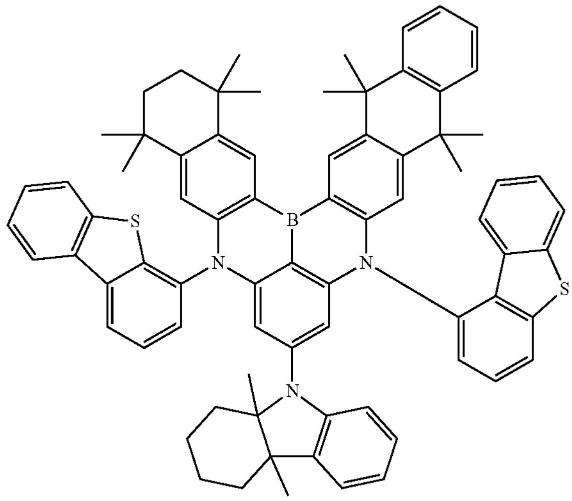
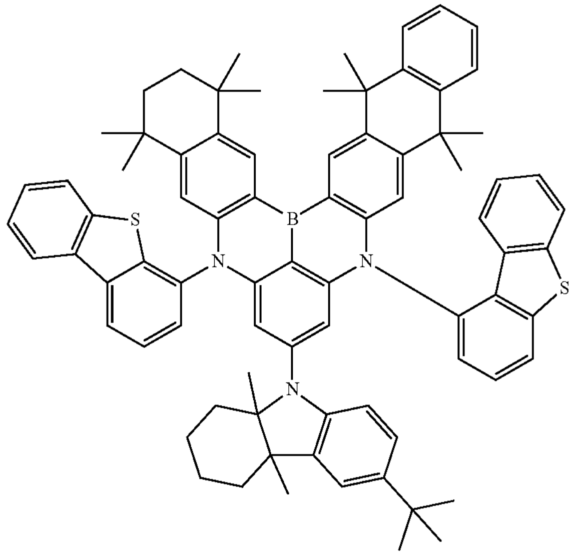
-continued
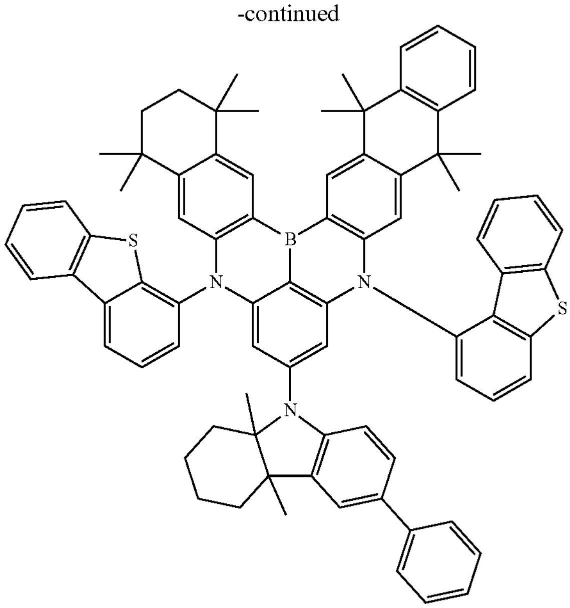
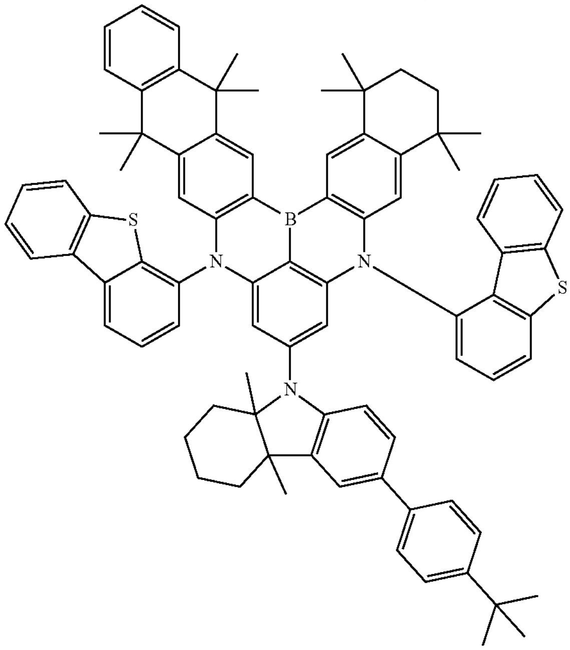
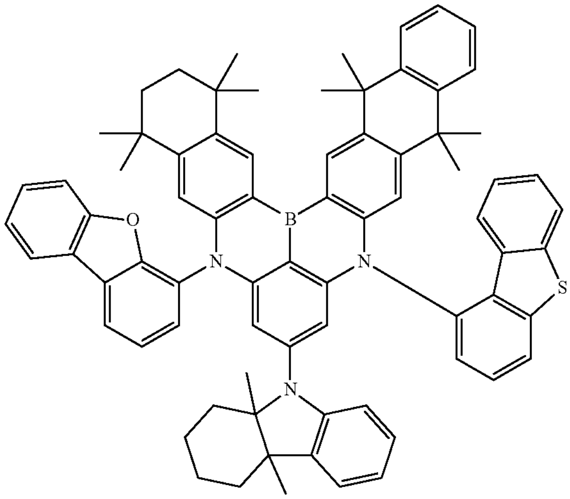

-continued
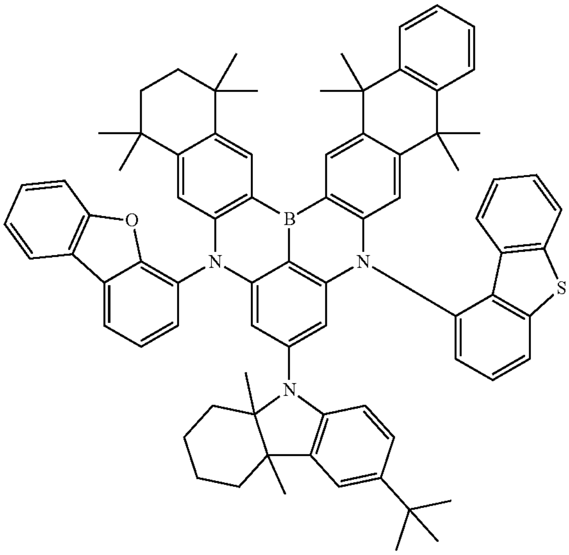
-continued
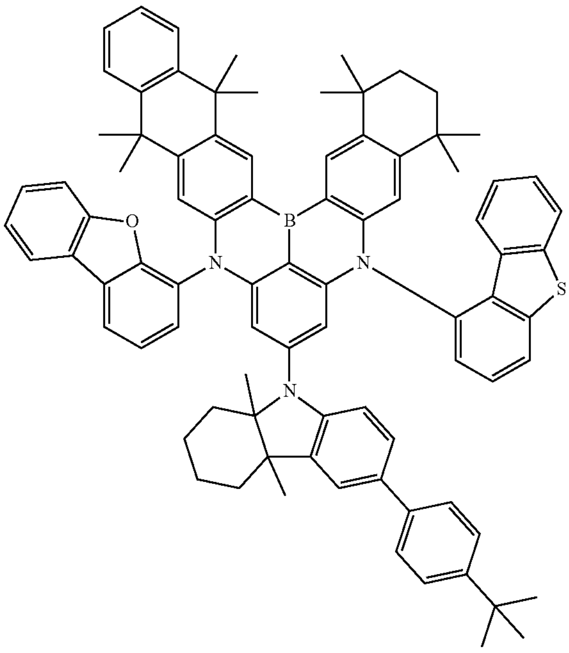
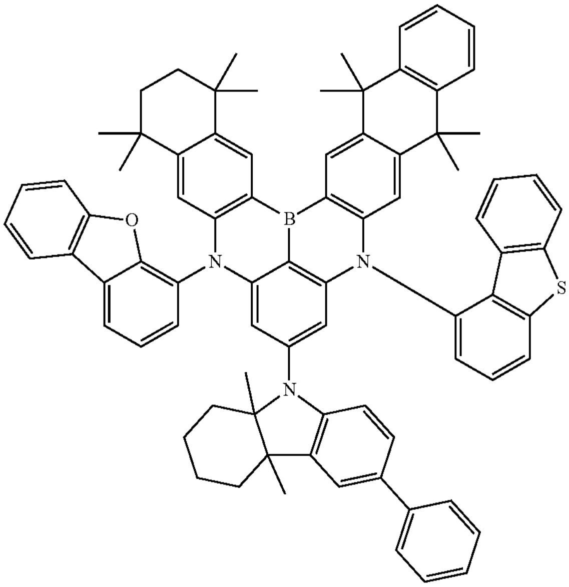
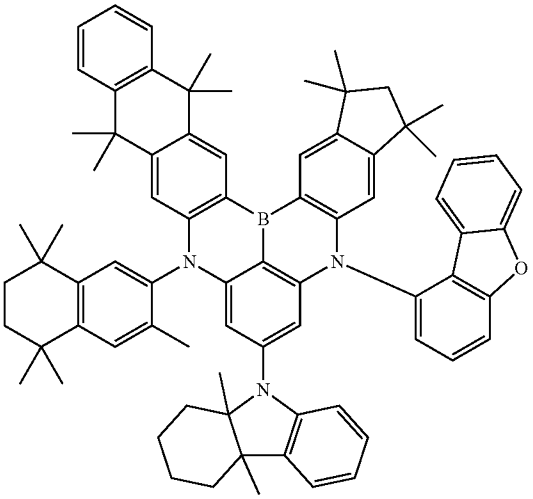

-continued
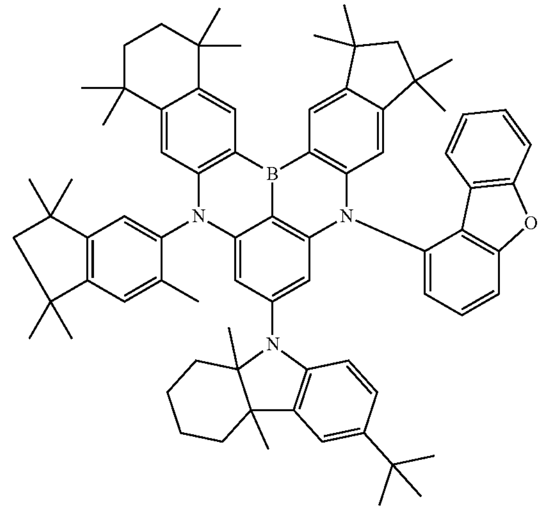
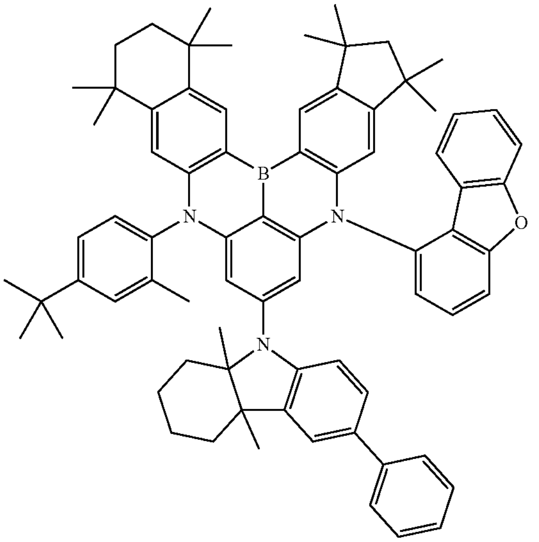
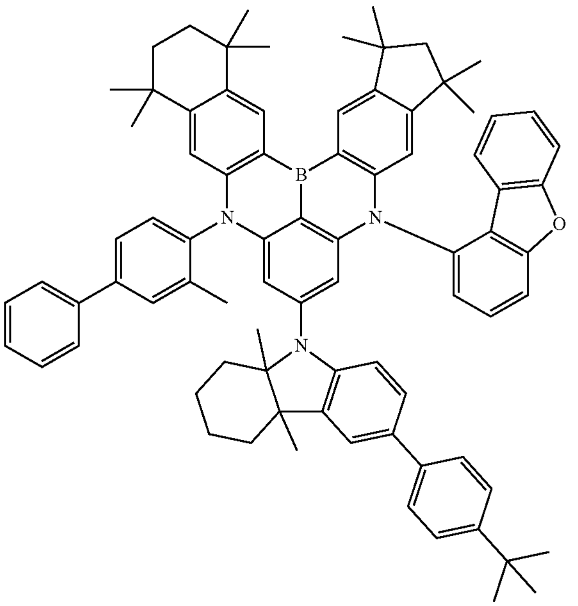
-continued
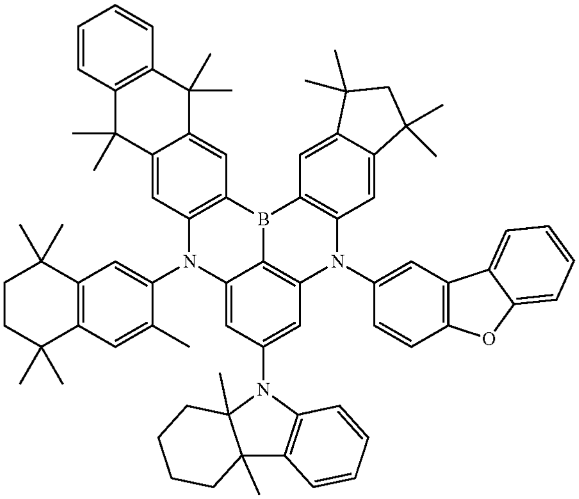
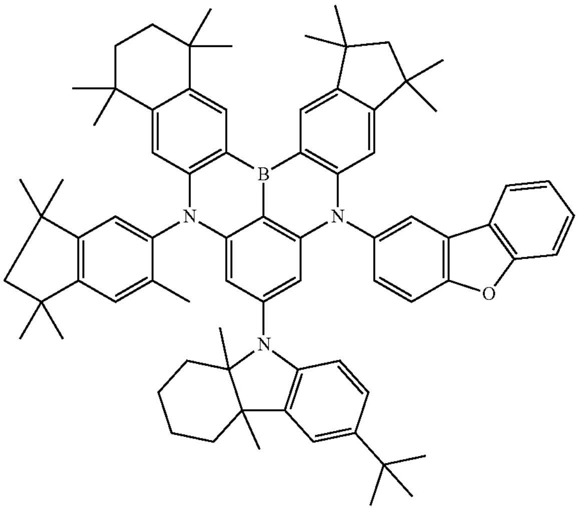
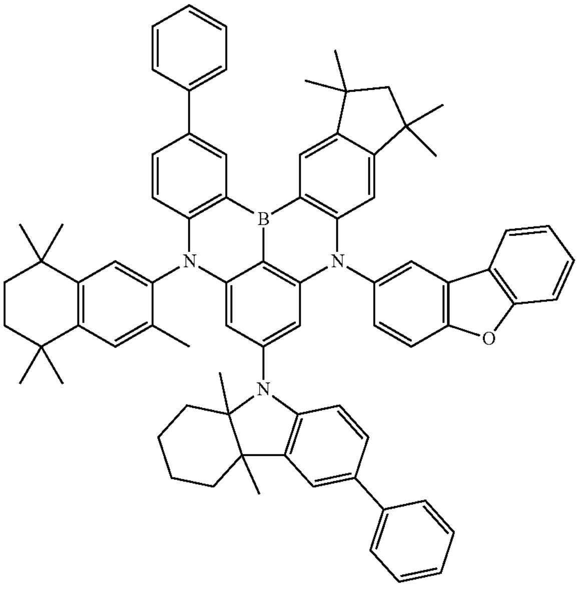

-continued
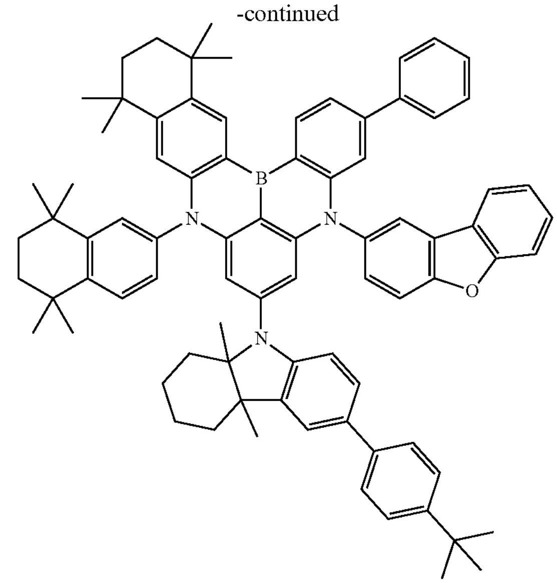
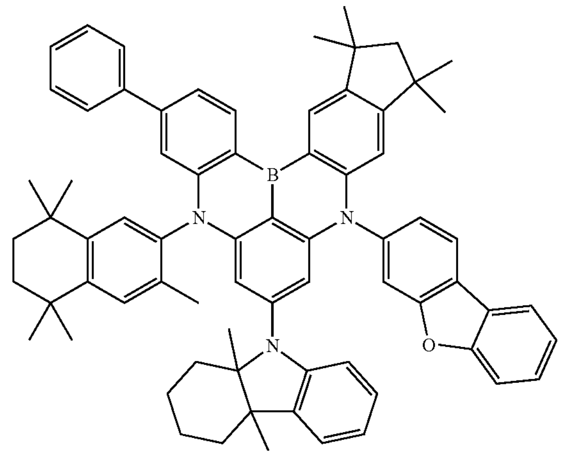
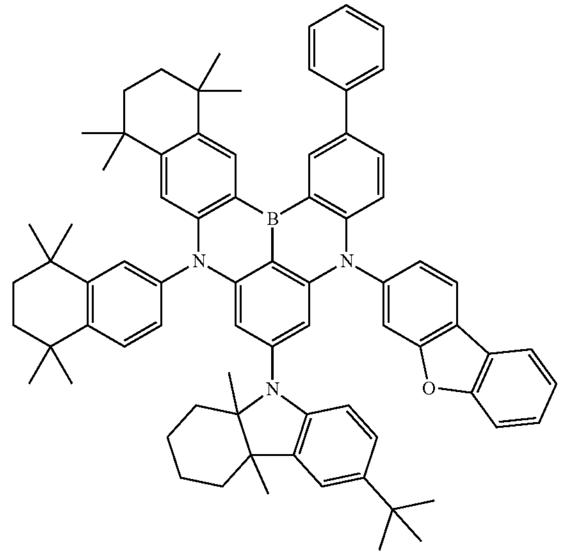
-continued
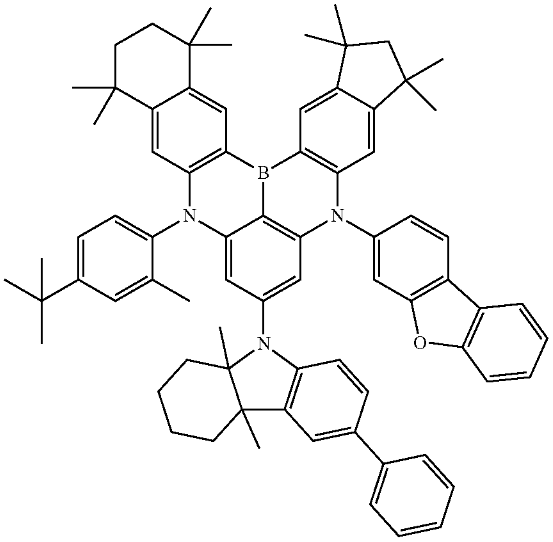
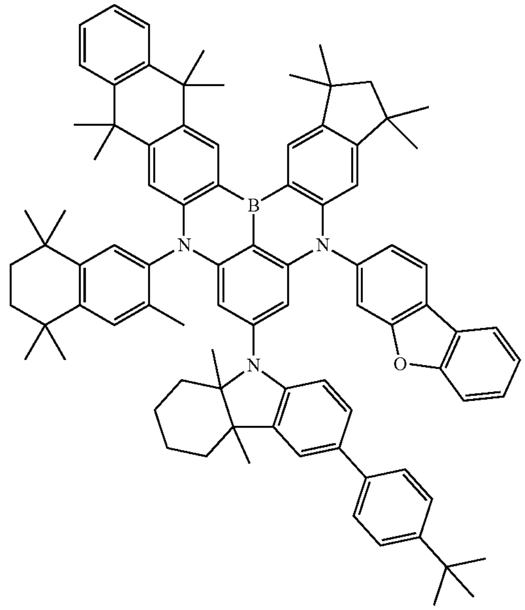
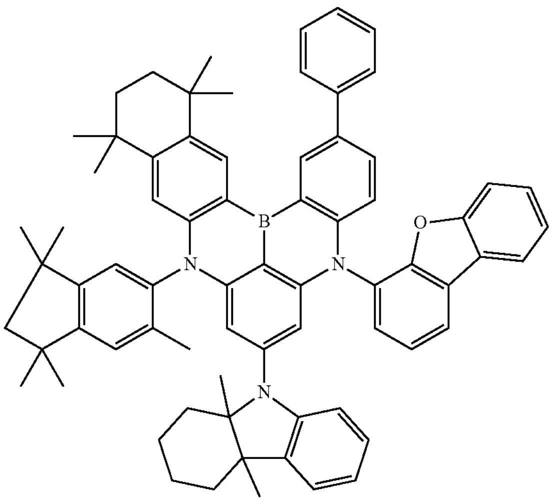

-continued
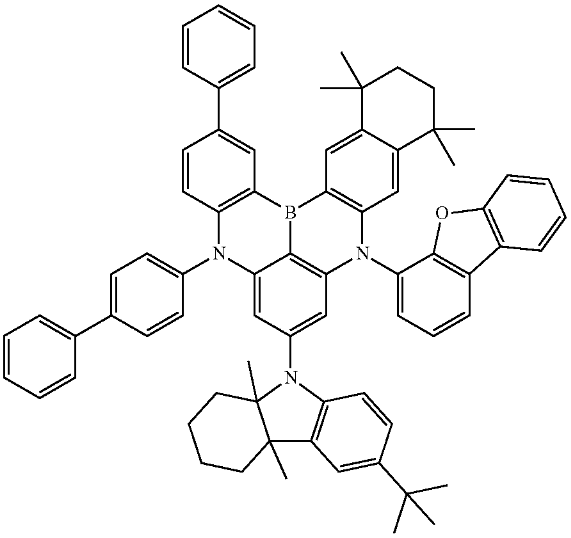
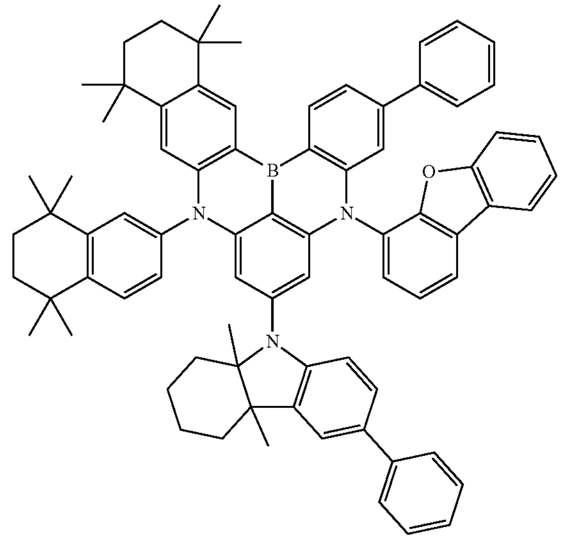
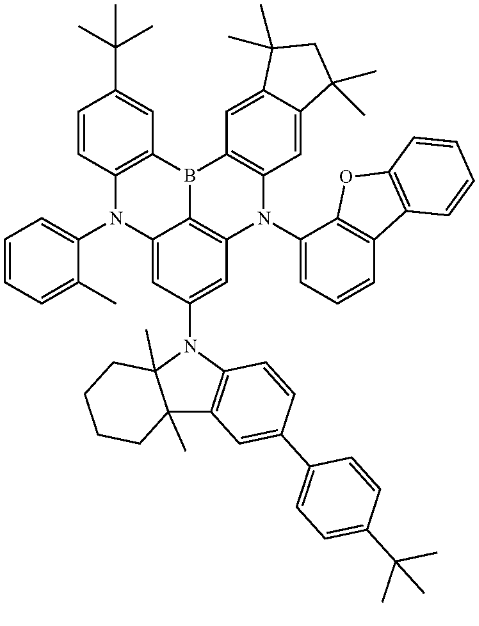
-continued
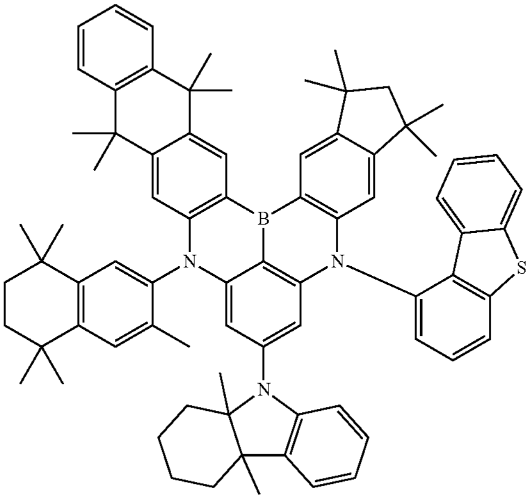
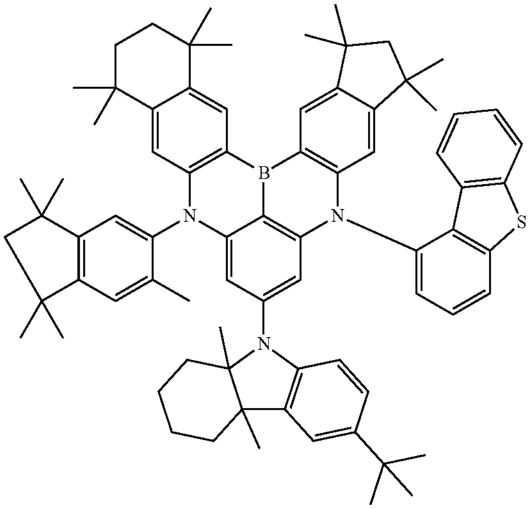
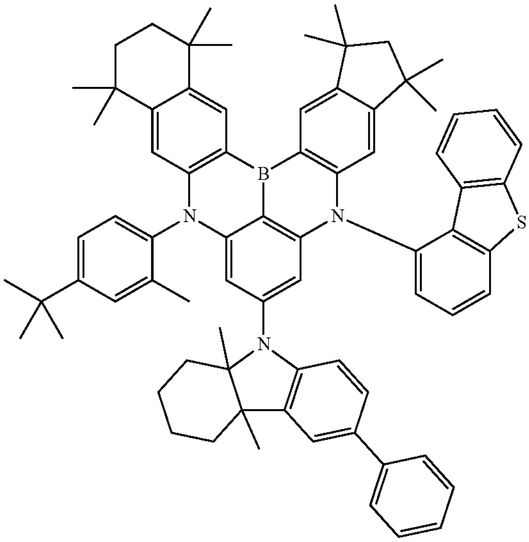

-continued
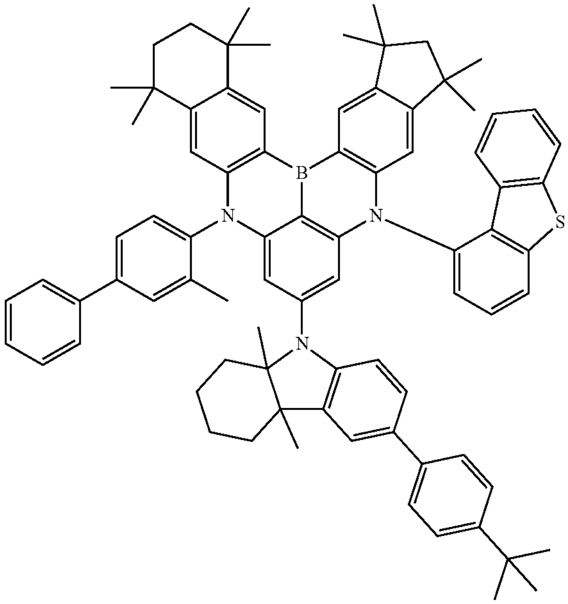
-continued
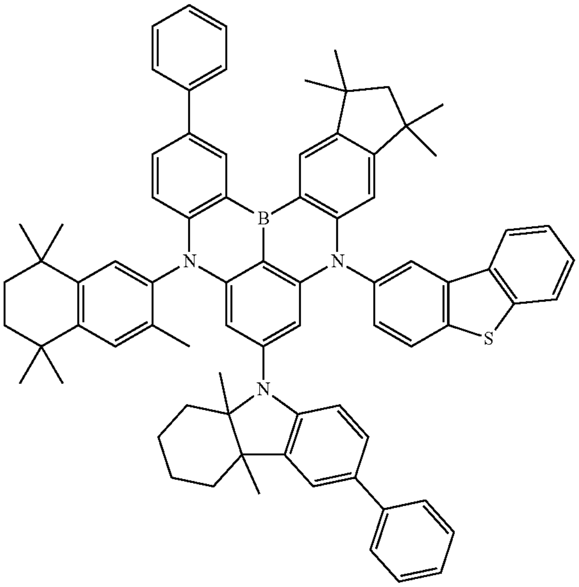
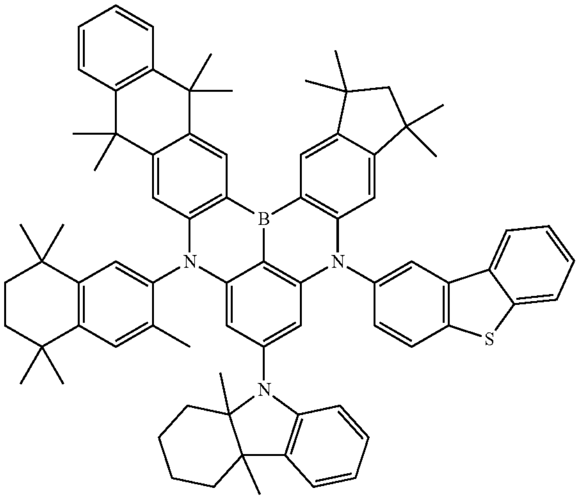
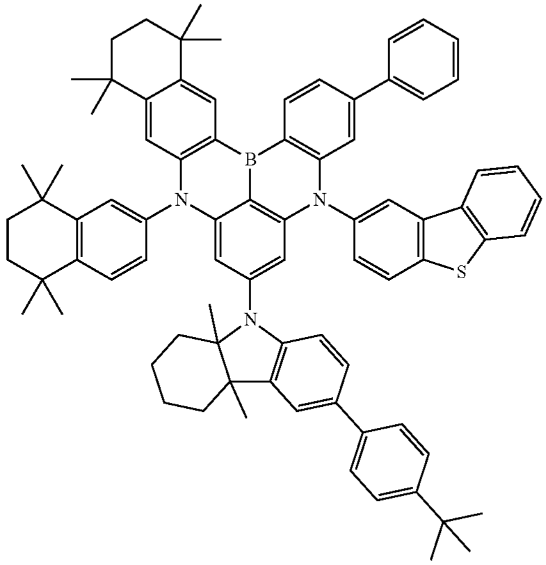
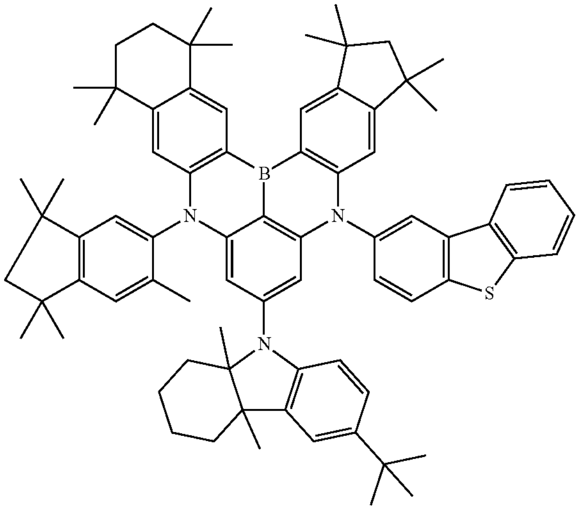
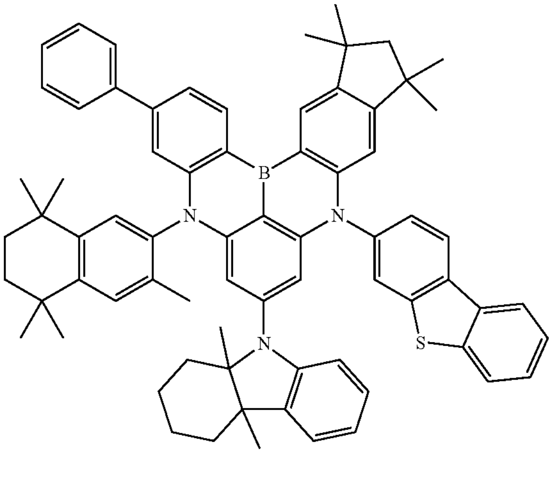

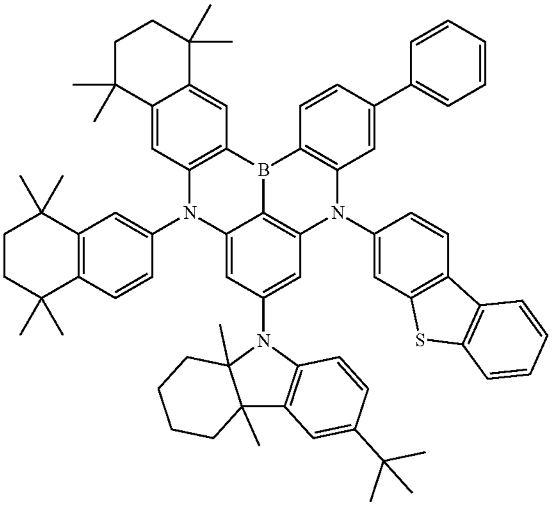
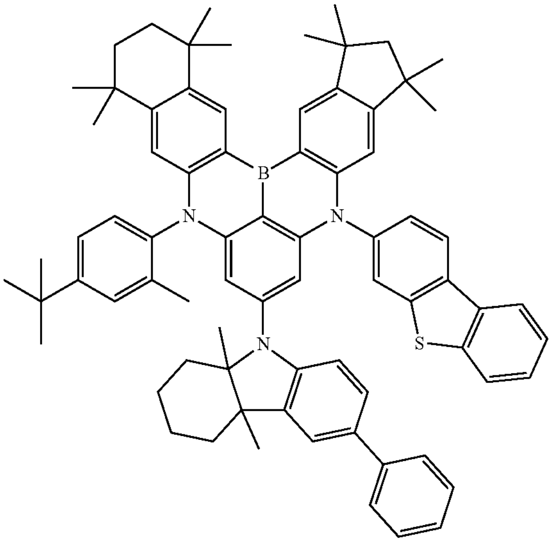
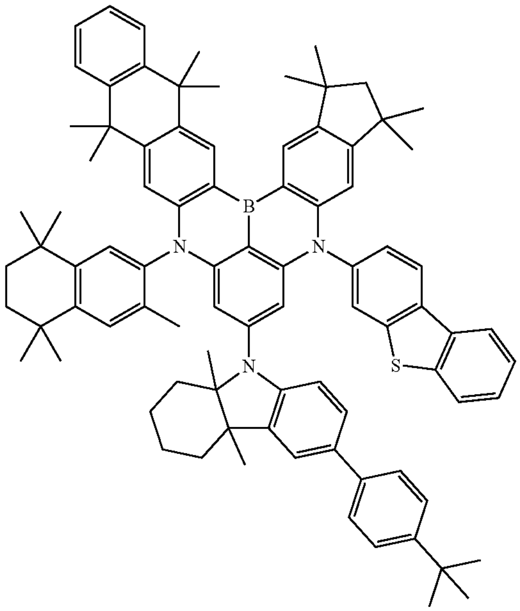
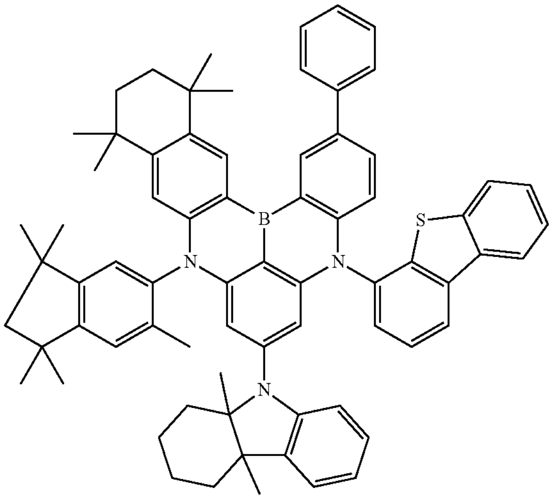
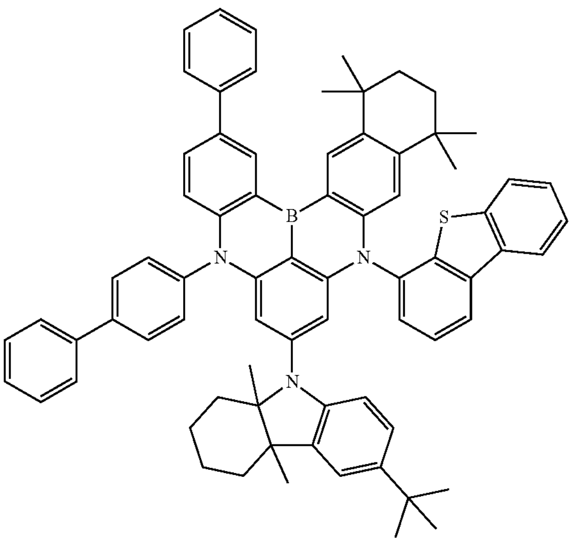
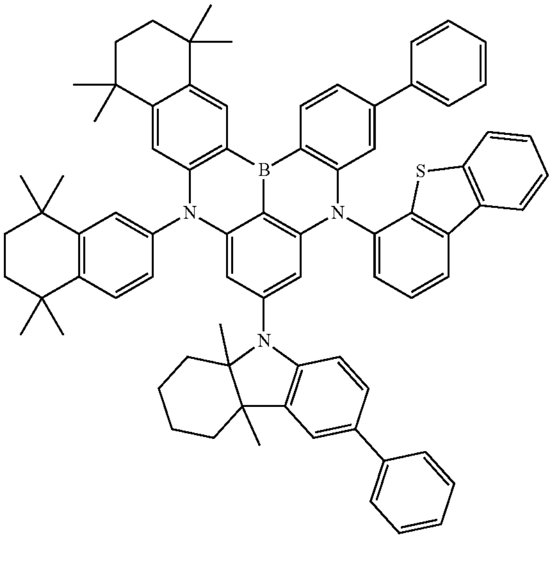

-continued
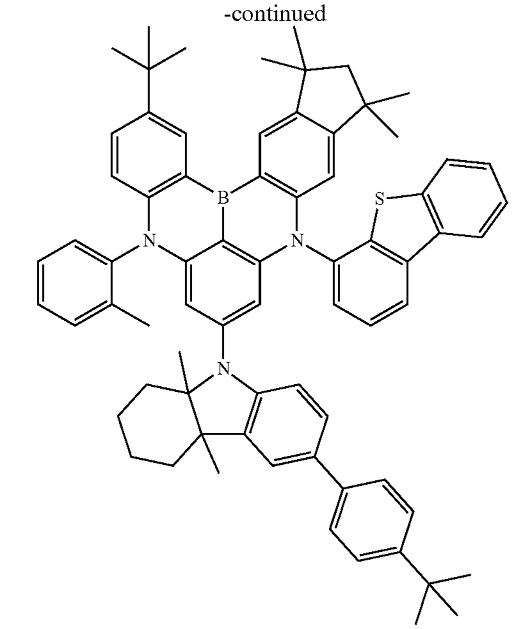
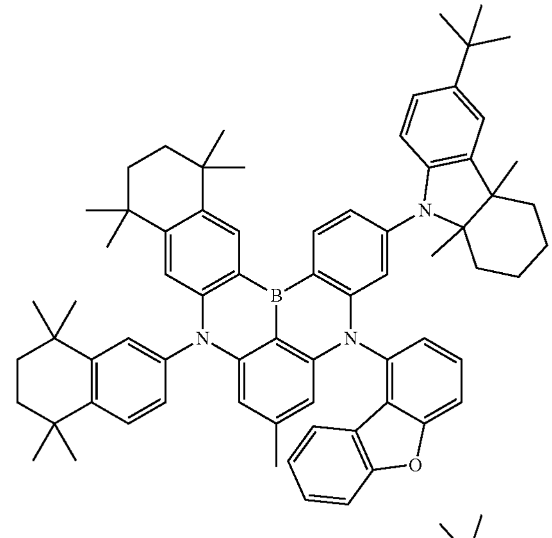
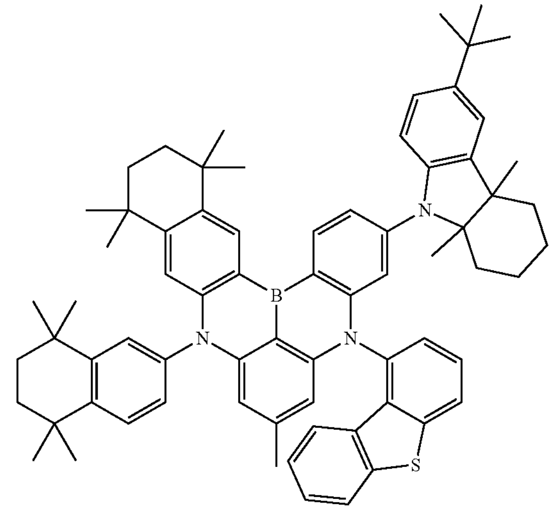
-continued
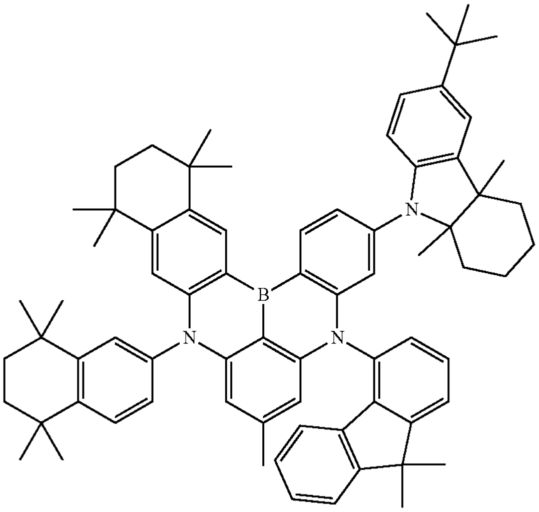
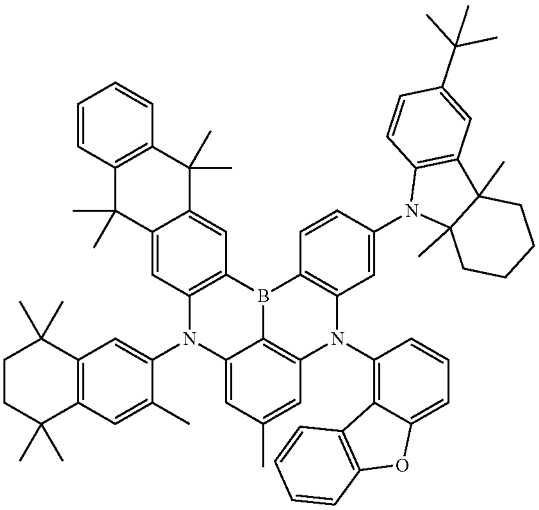
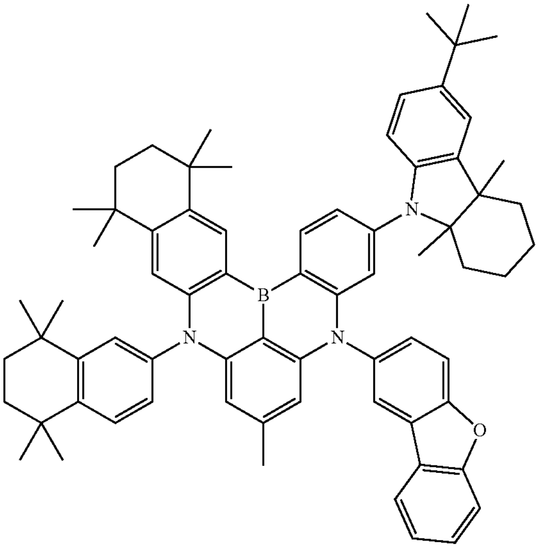

-continued
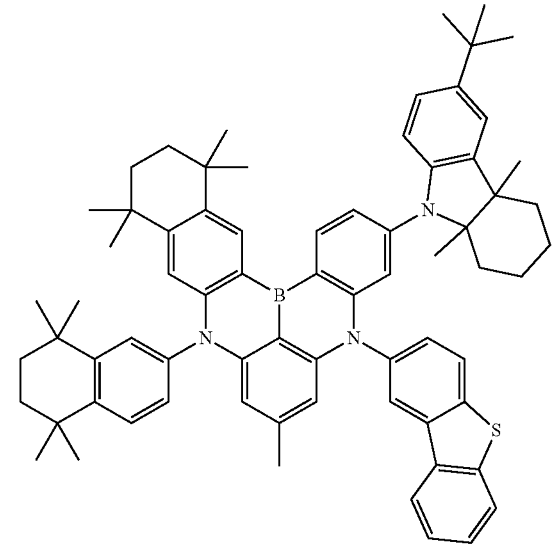
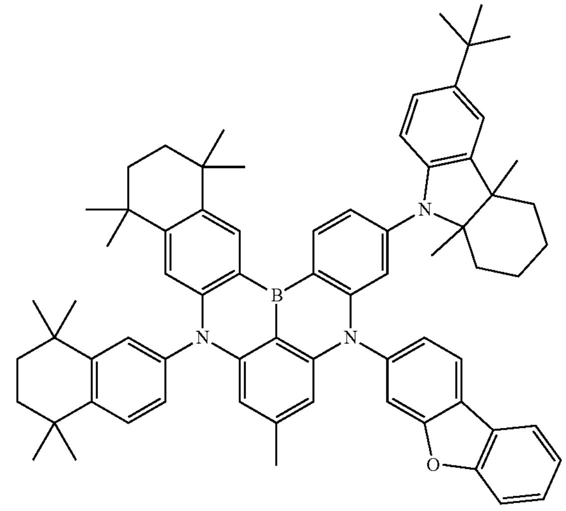
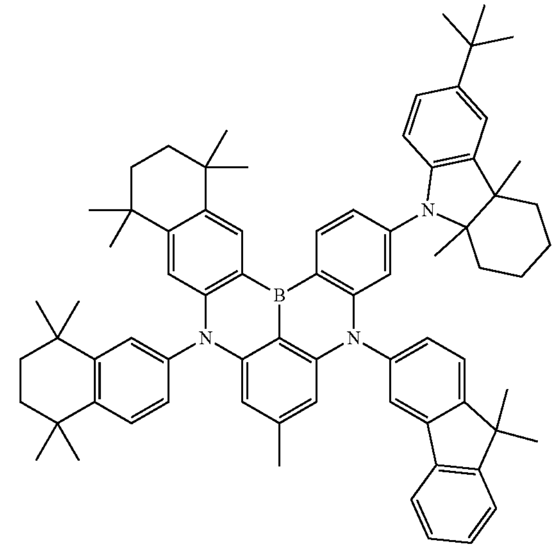
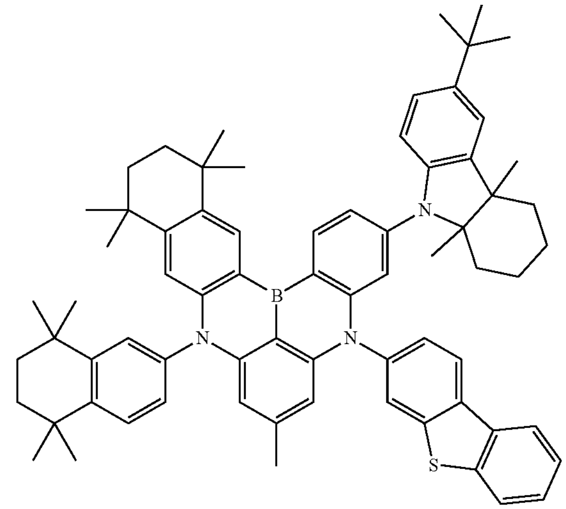
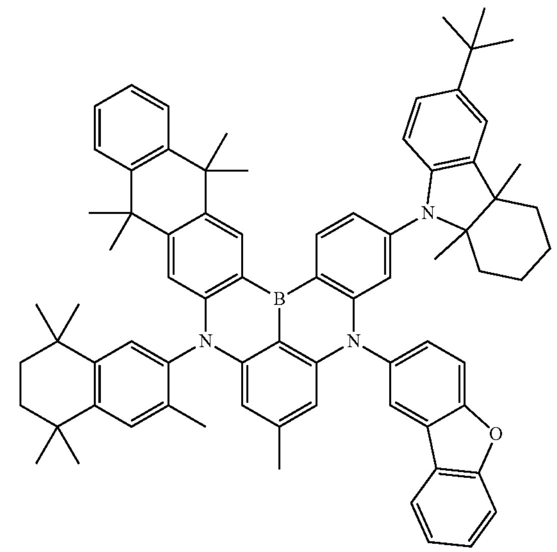
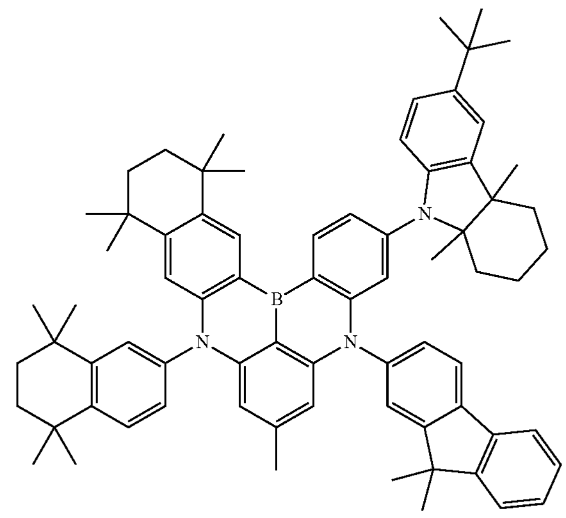

-continued
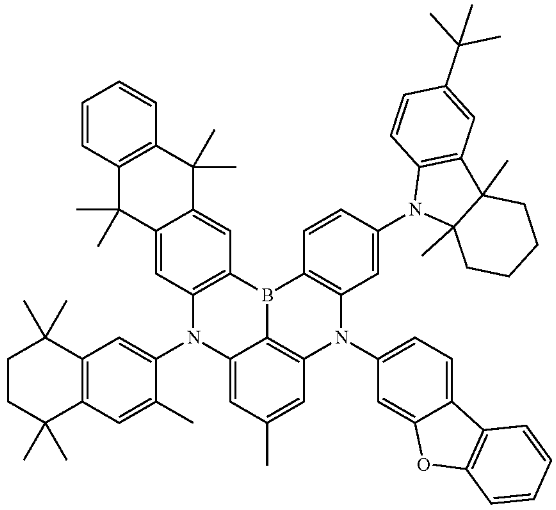
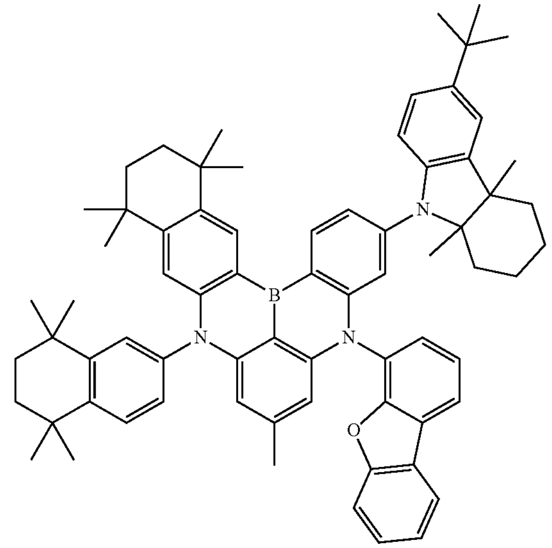
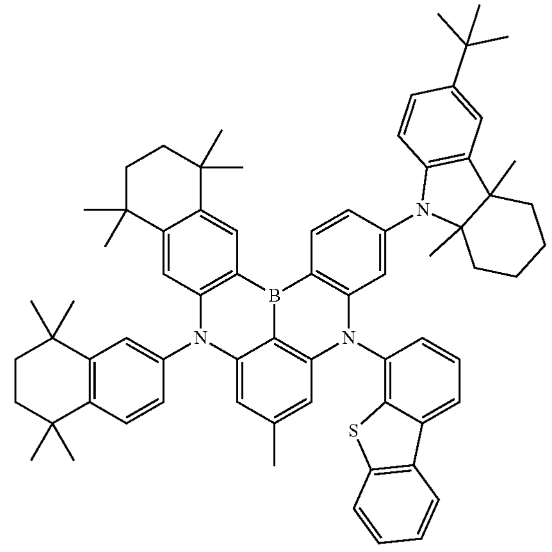
-continued
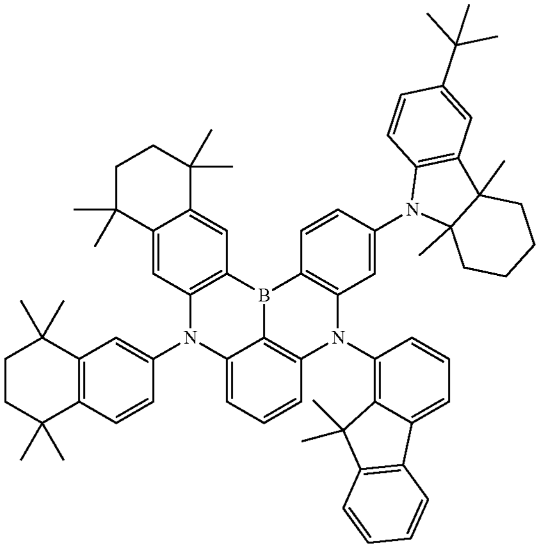
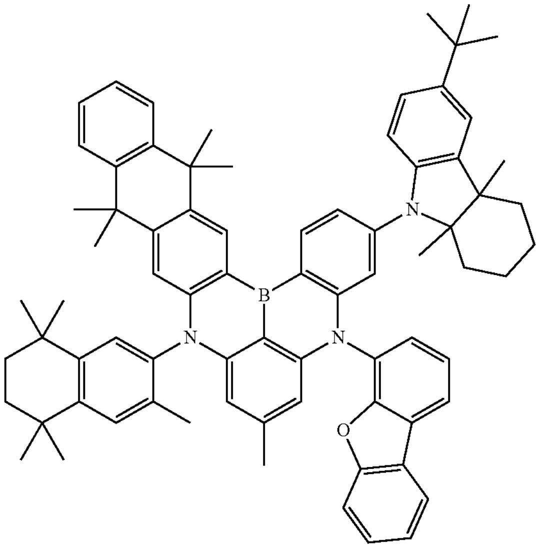
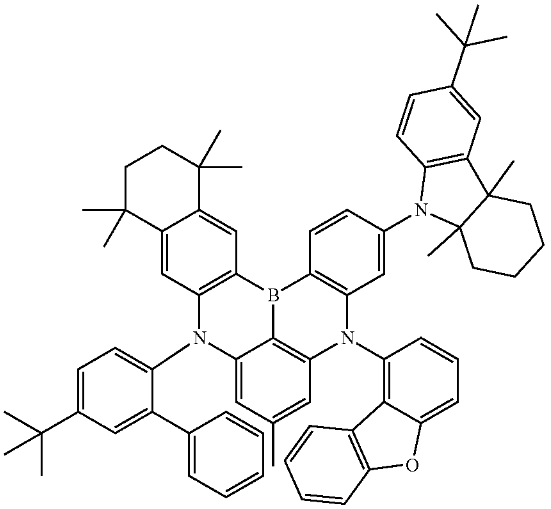

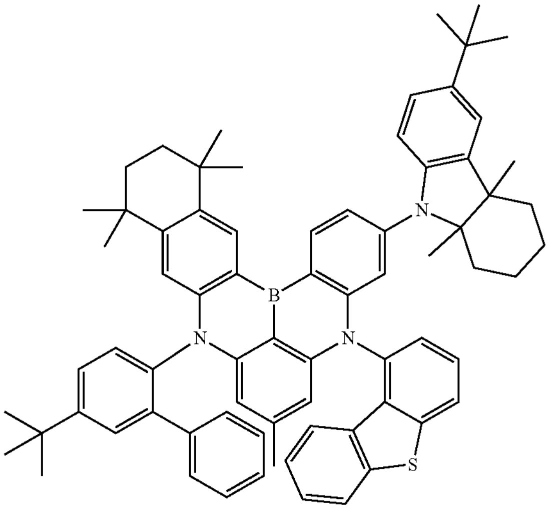
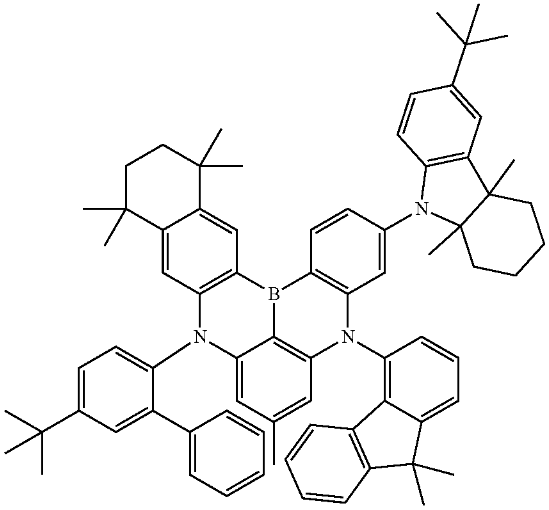
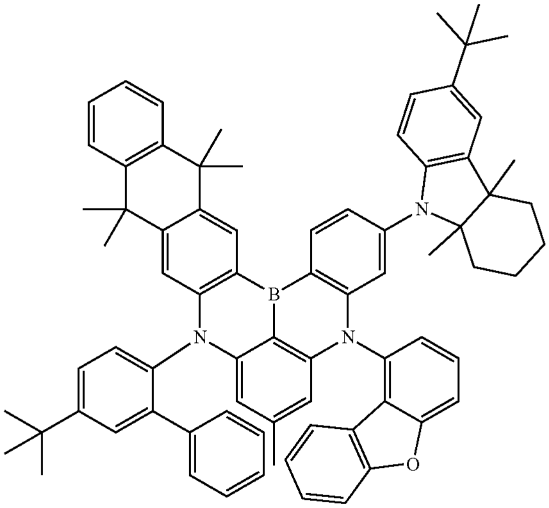
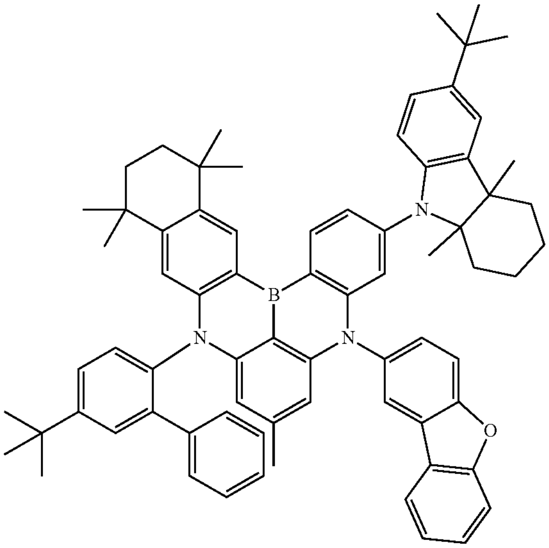
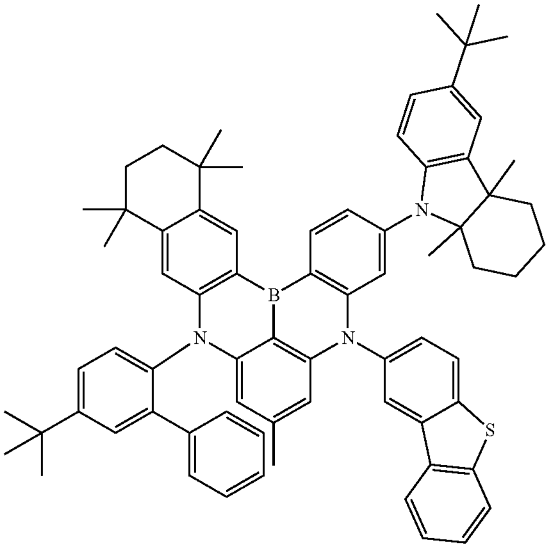
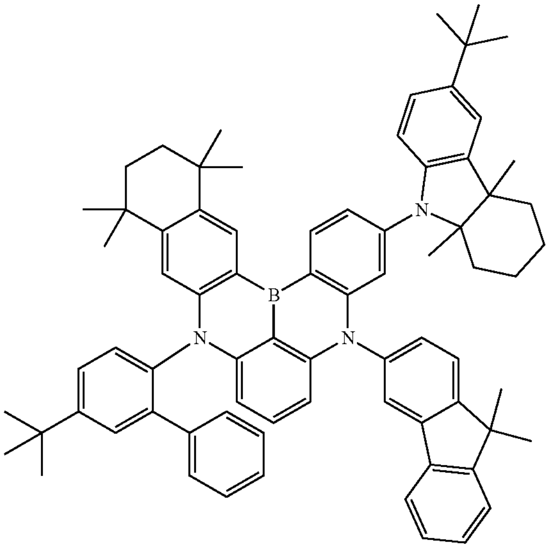

-continued
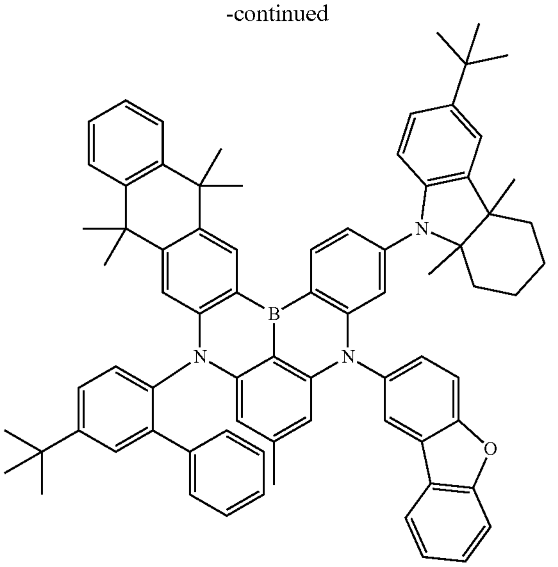
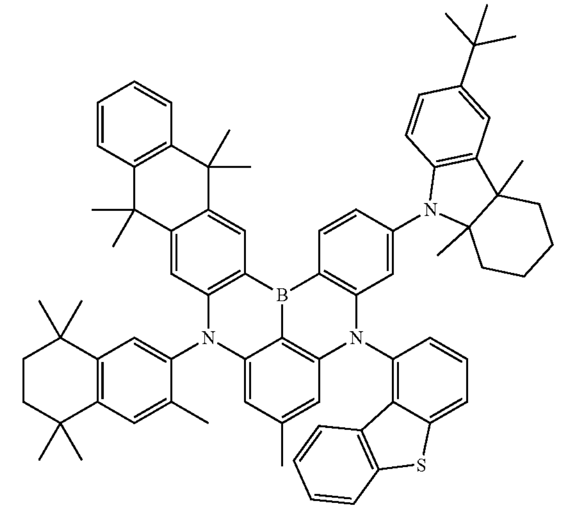
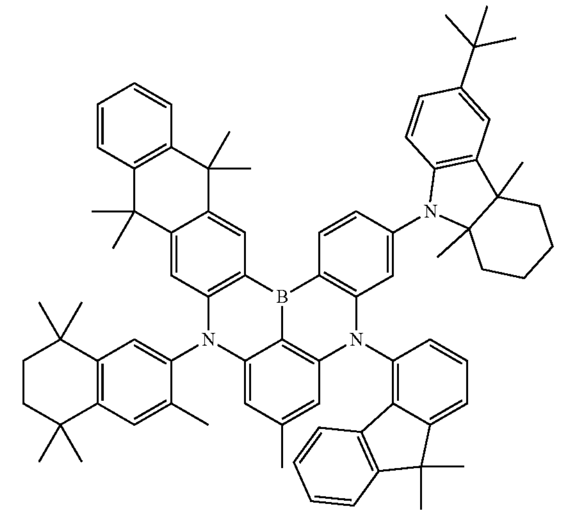
-continued
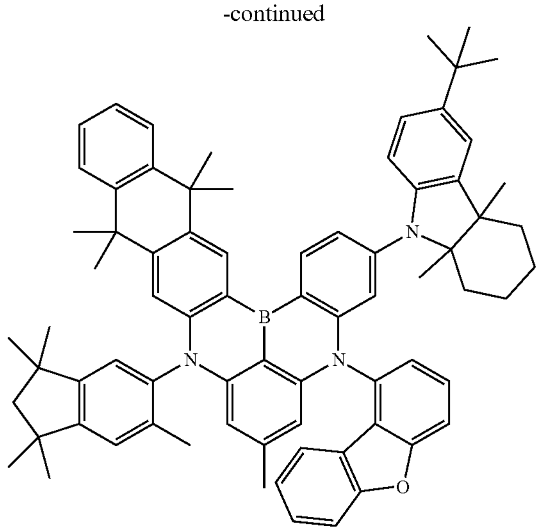
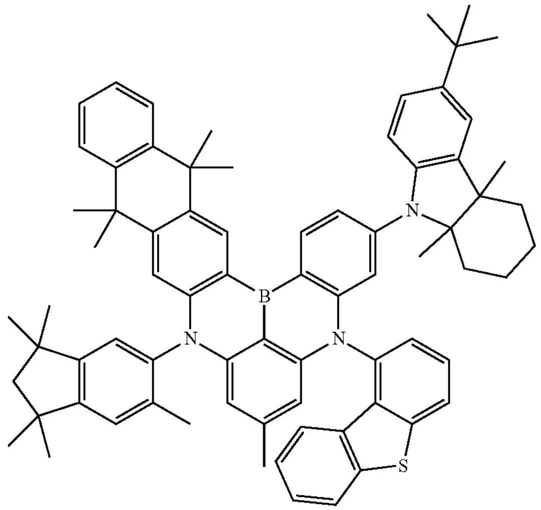
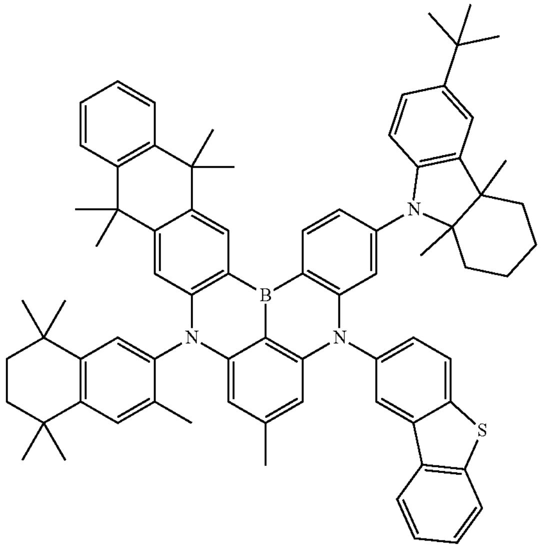

-continued
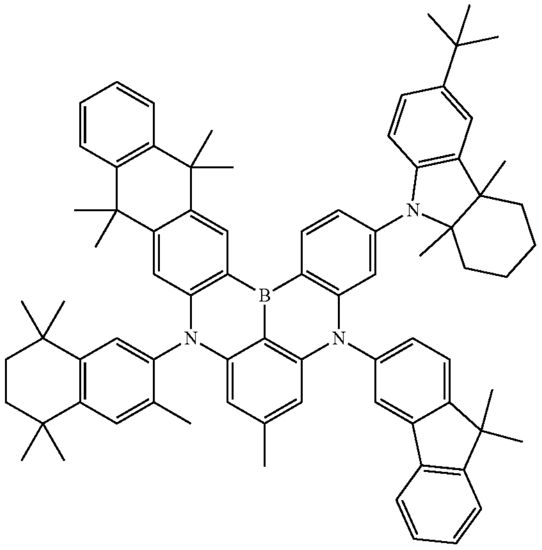
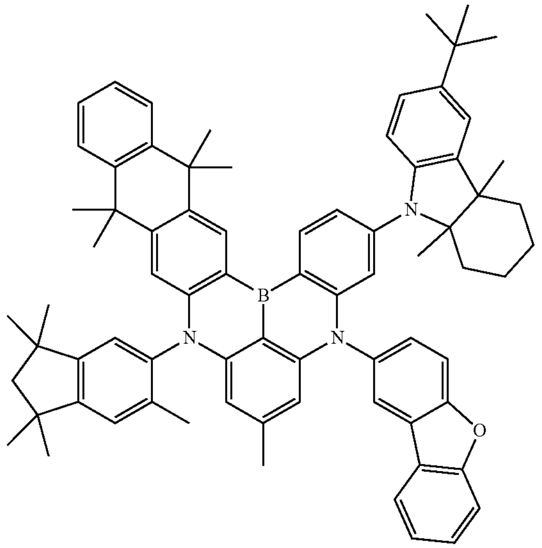
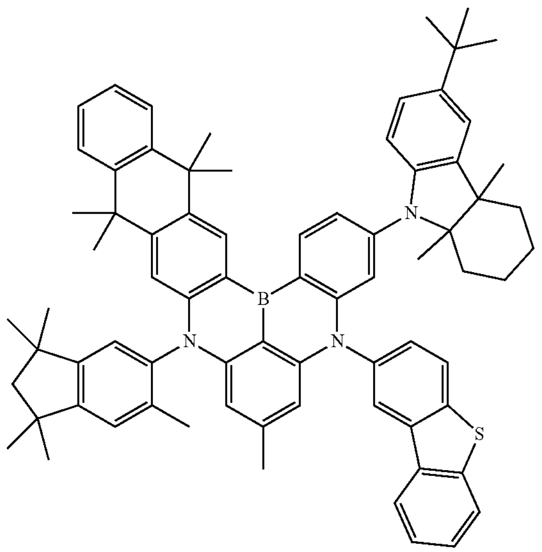
-continued
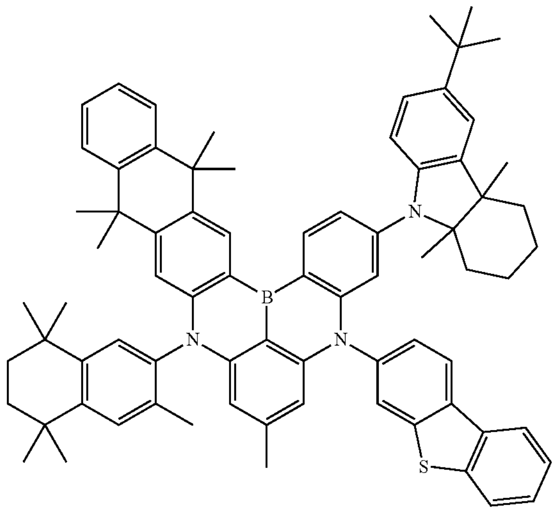
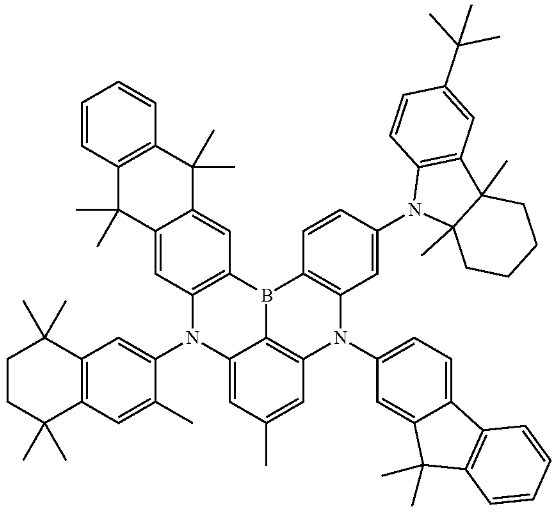
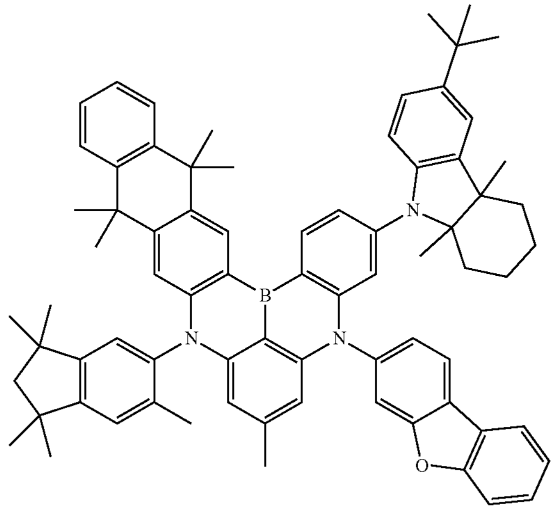

-continued
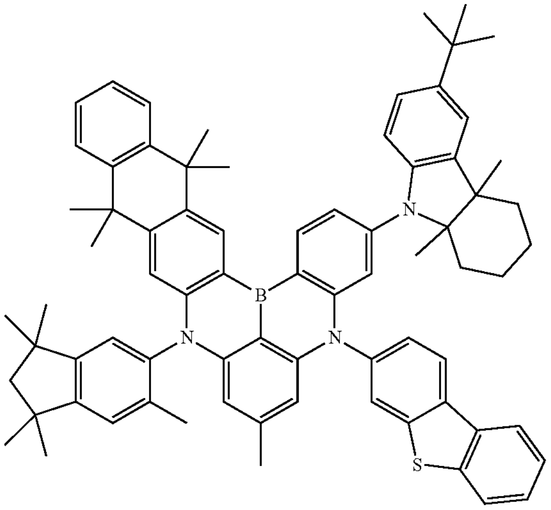
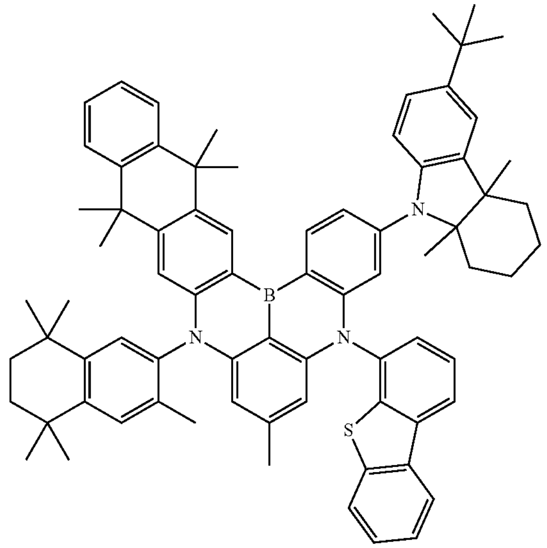
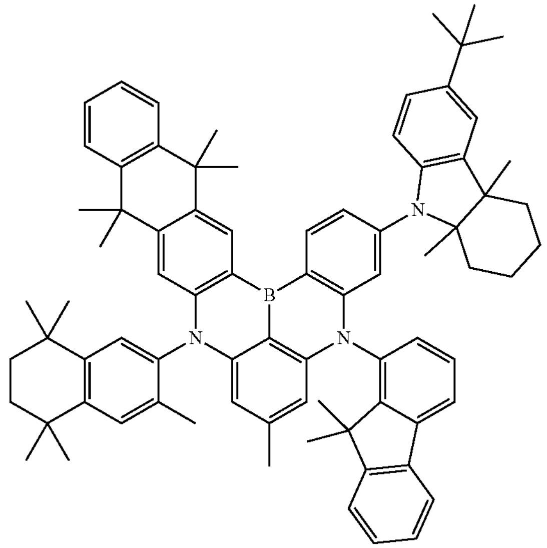
-continued
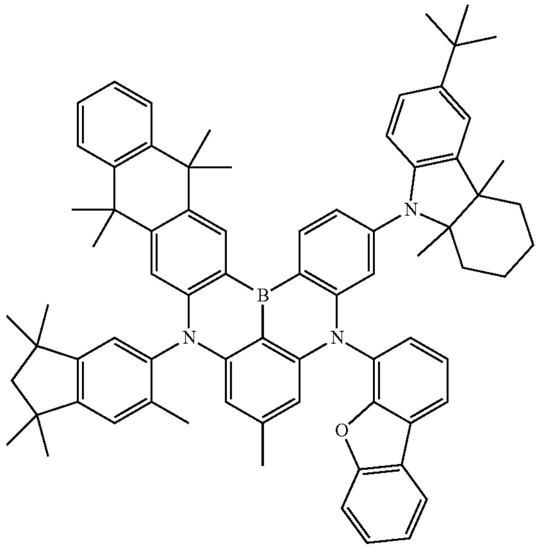
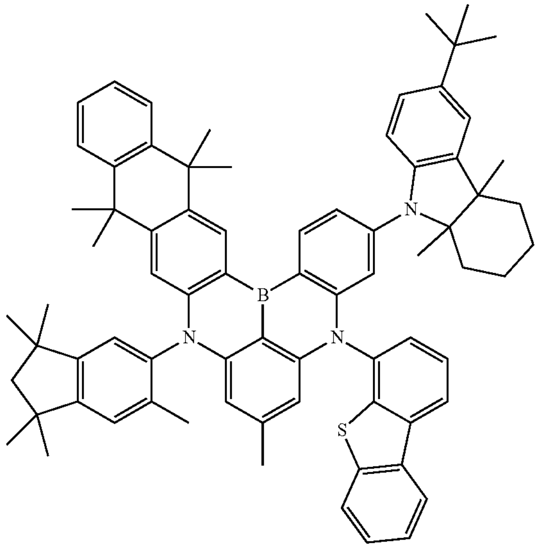
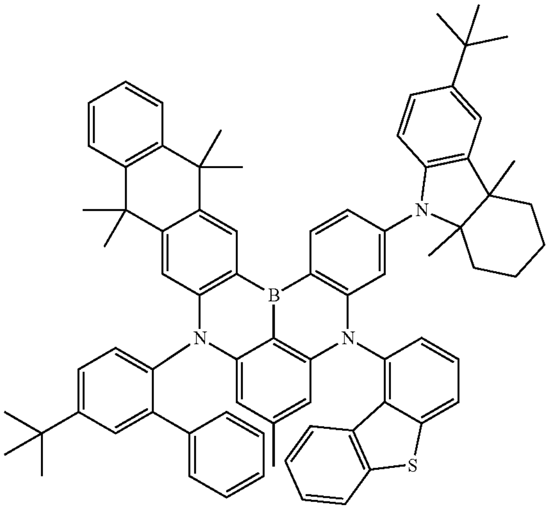

-continued
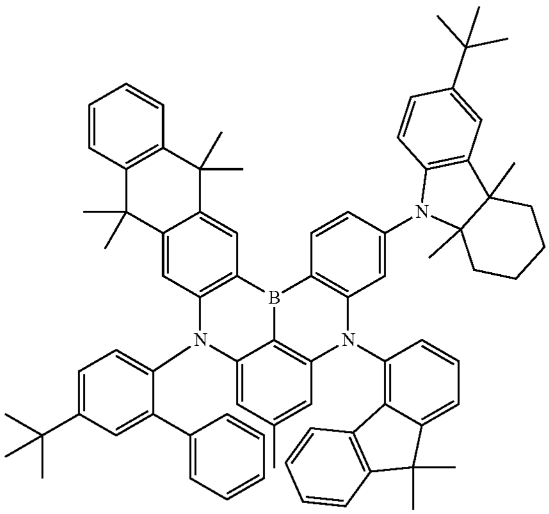
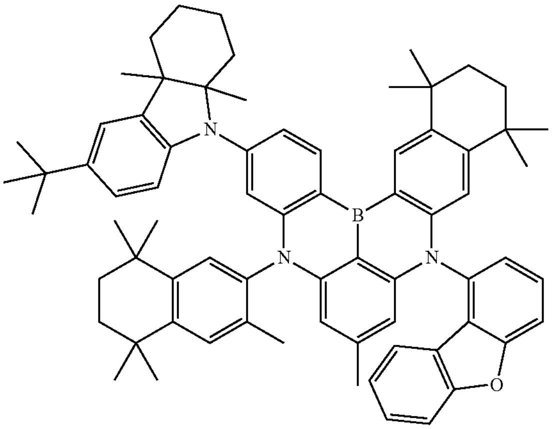
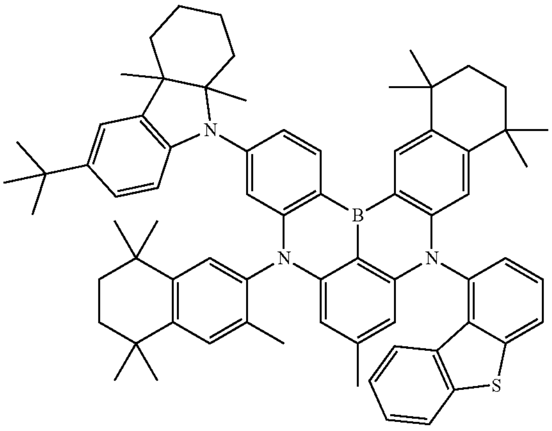
-continued
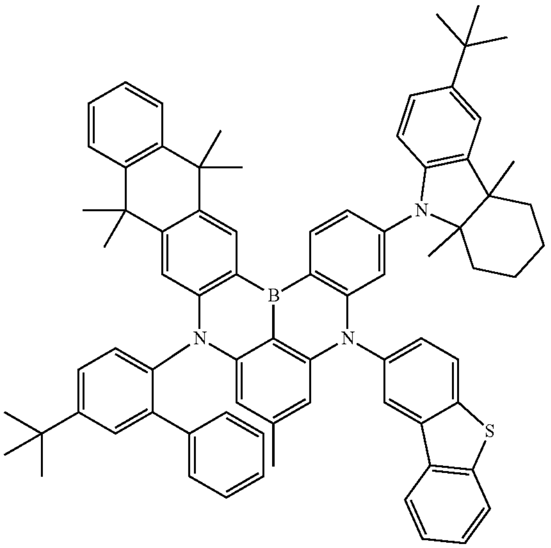
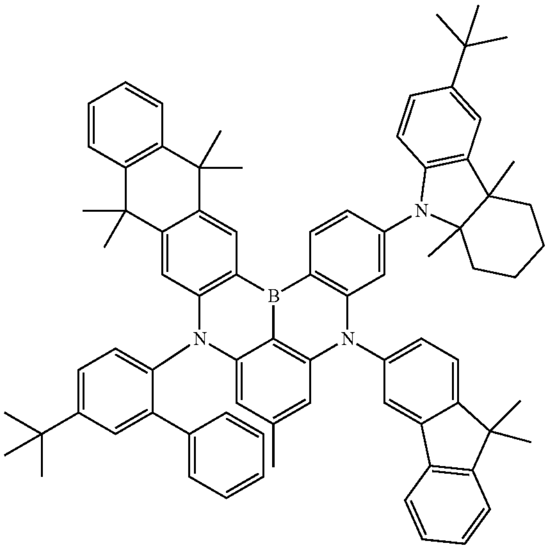
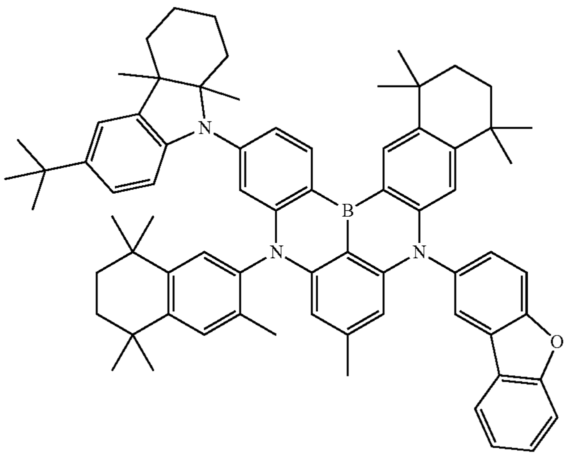

-continued
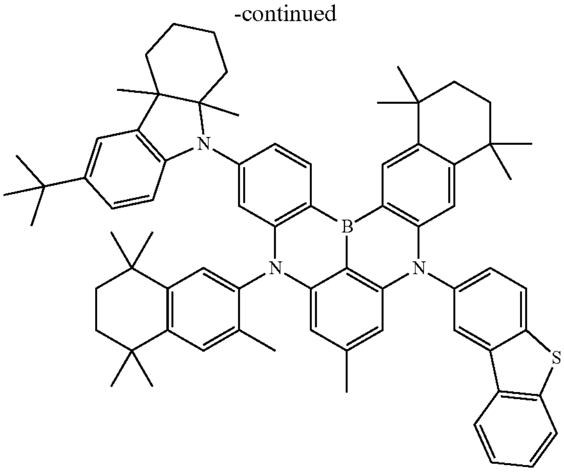
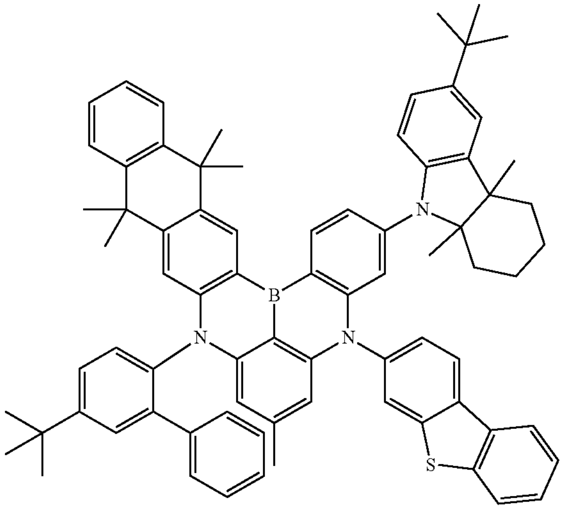
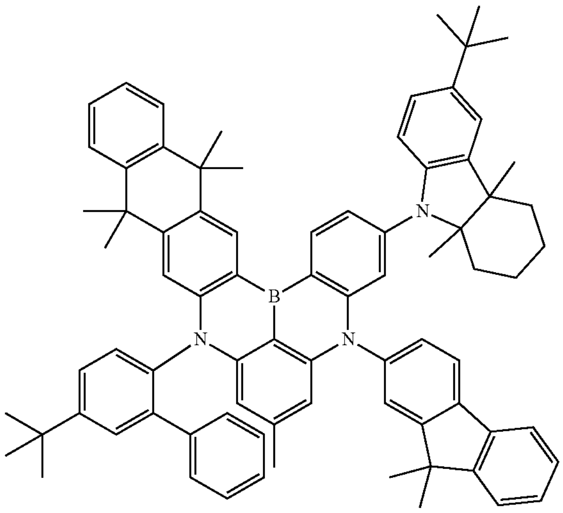
-continued
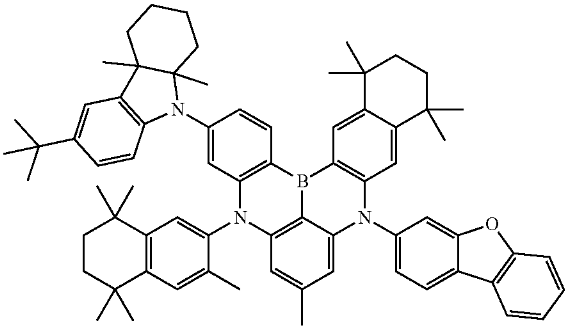
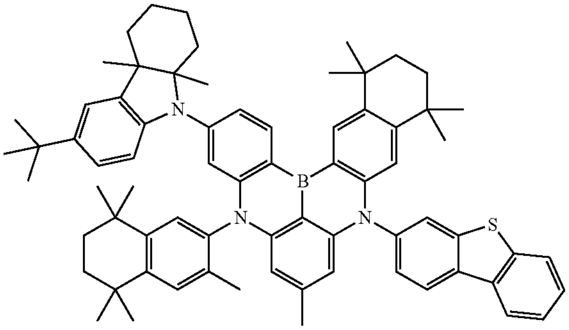
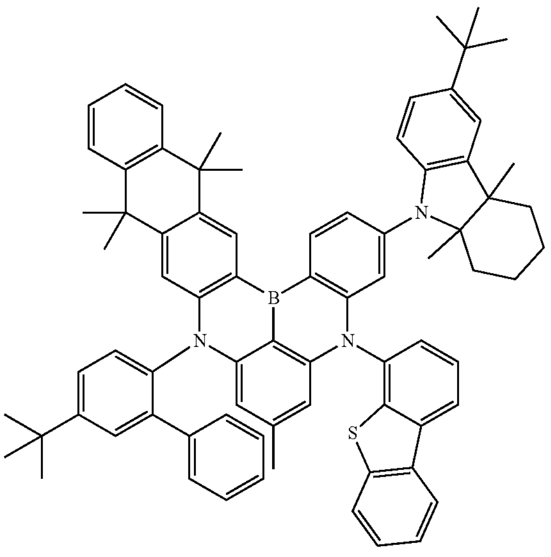

-continued
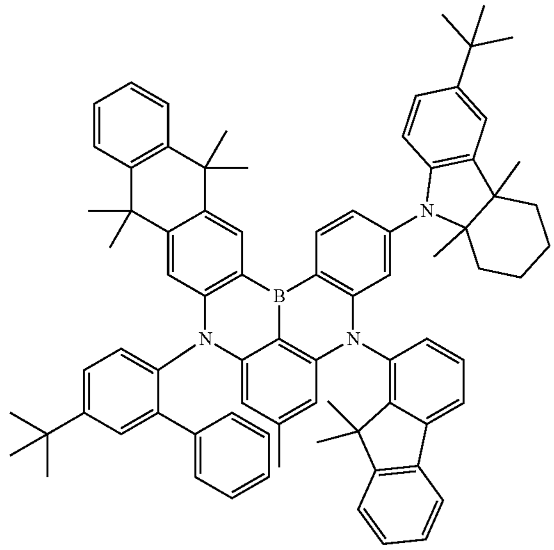
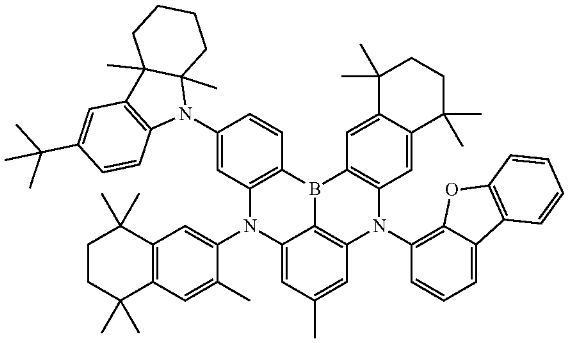
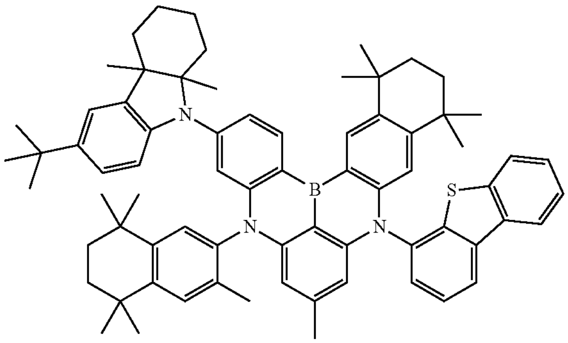
-continued
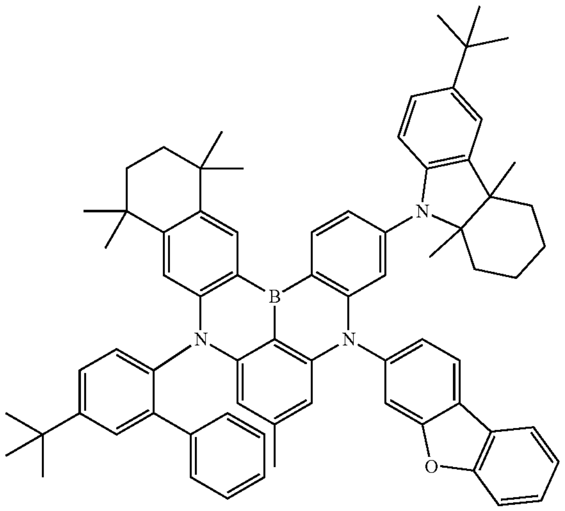
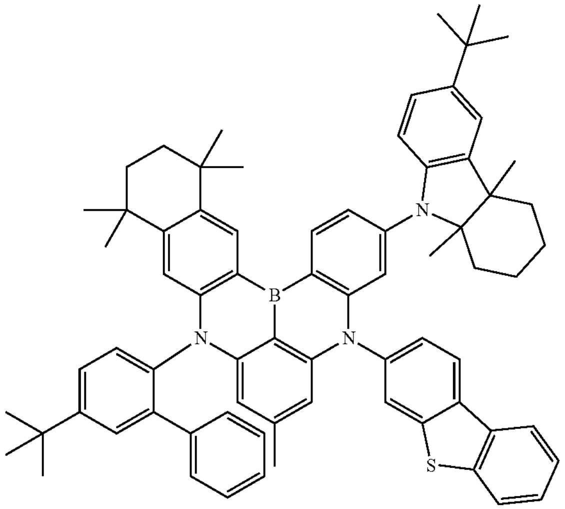
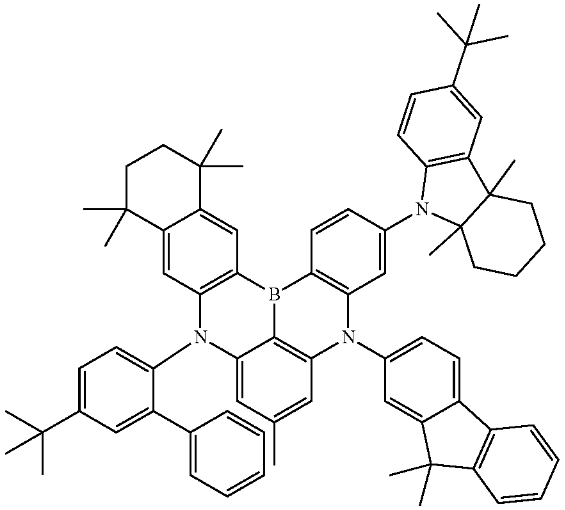

-continued
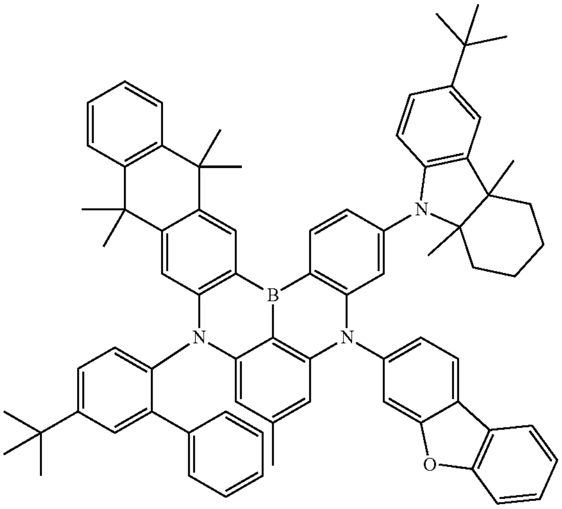
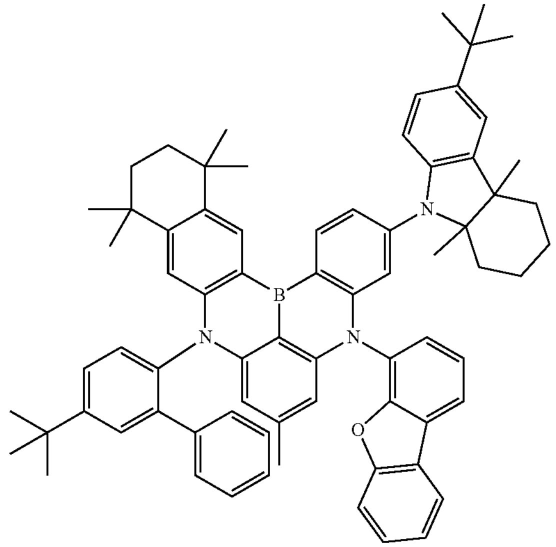
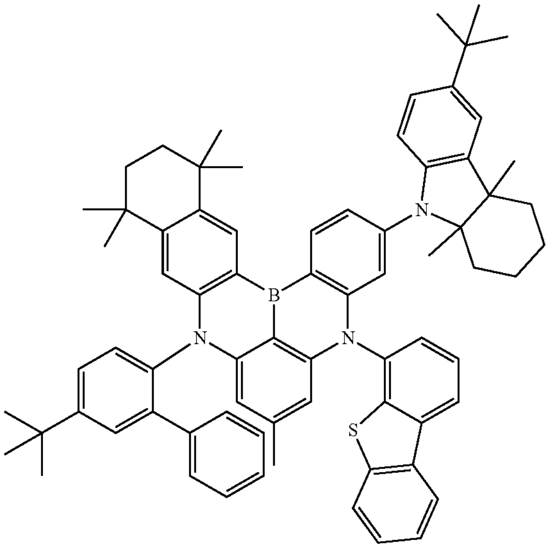
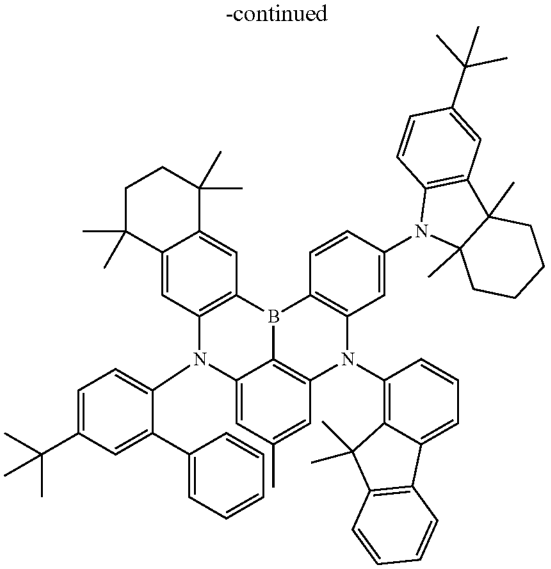
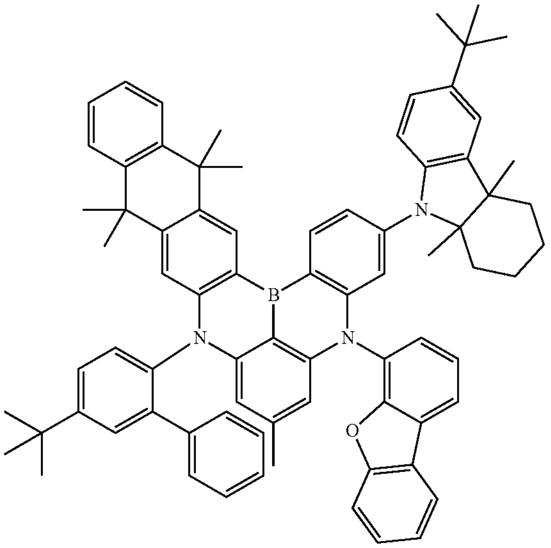
-continued
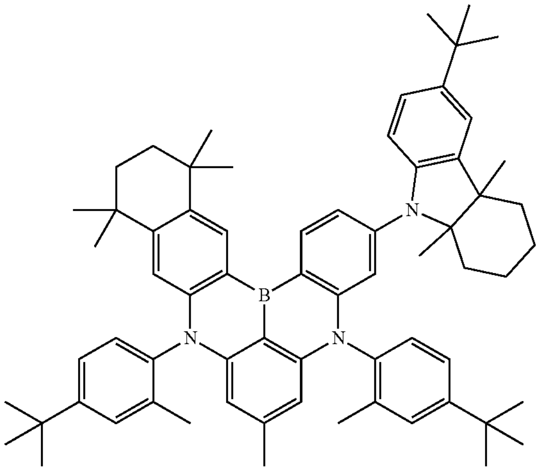

-continued
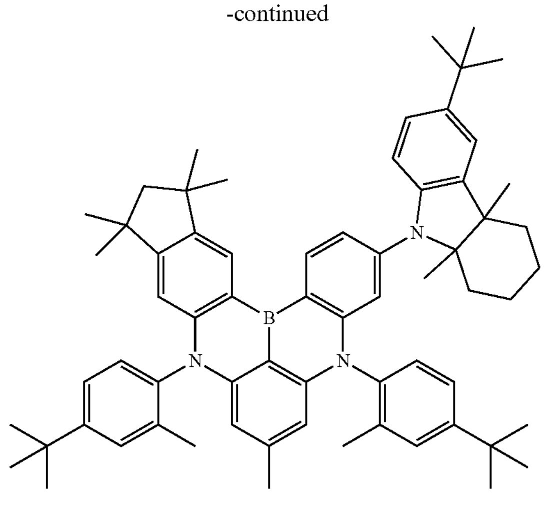
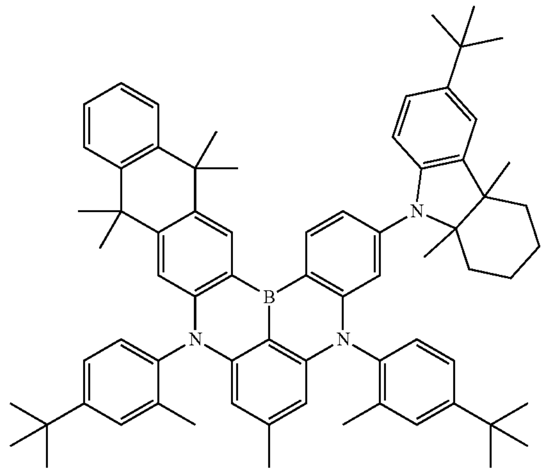
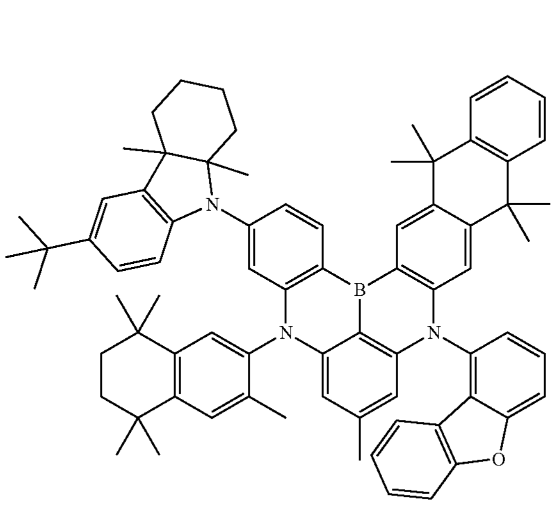
-continued
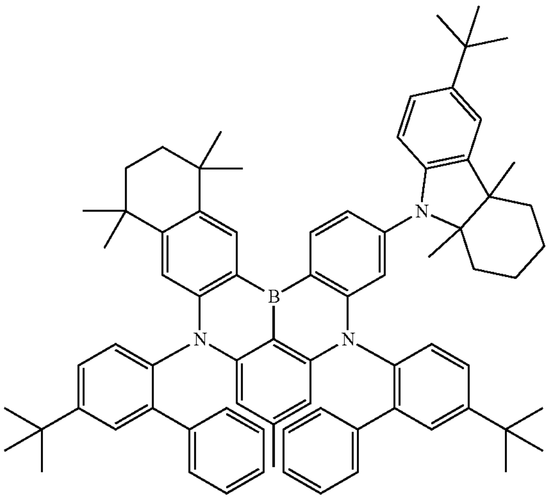
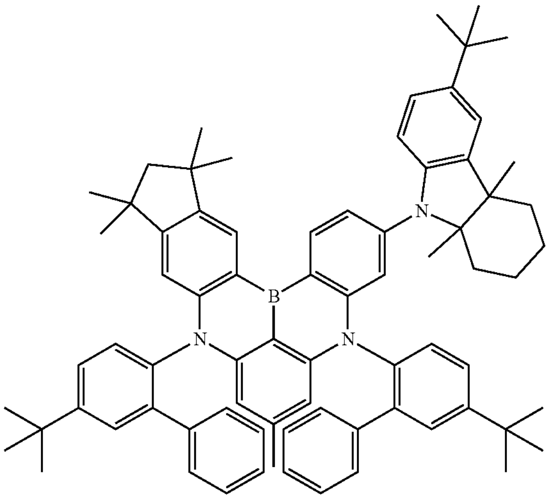
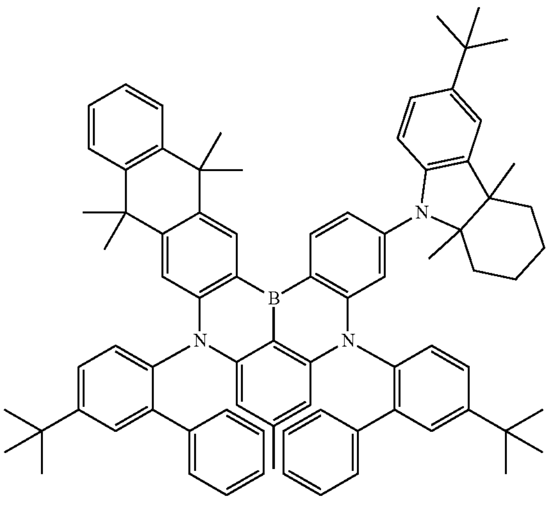

-continued
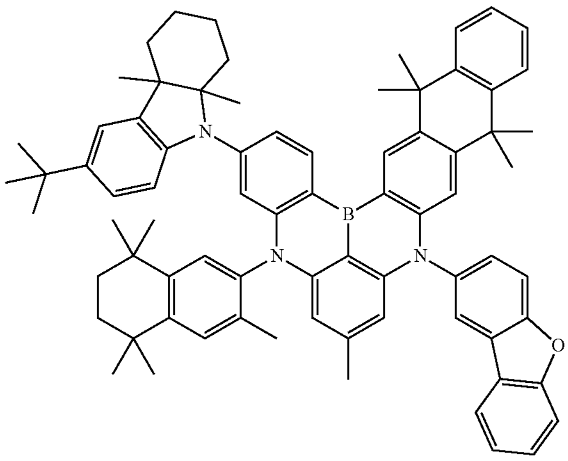
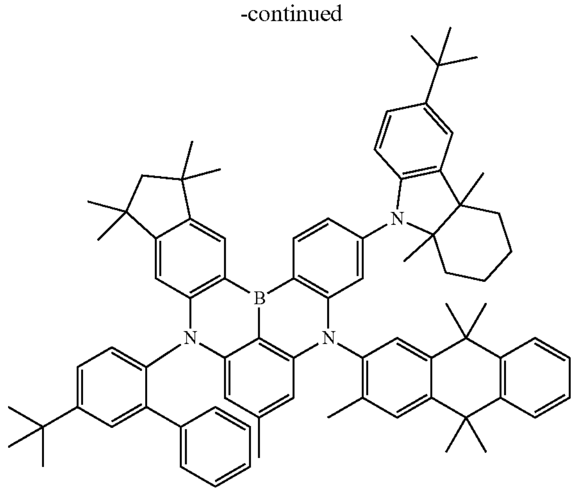
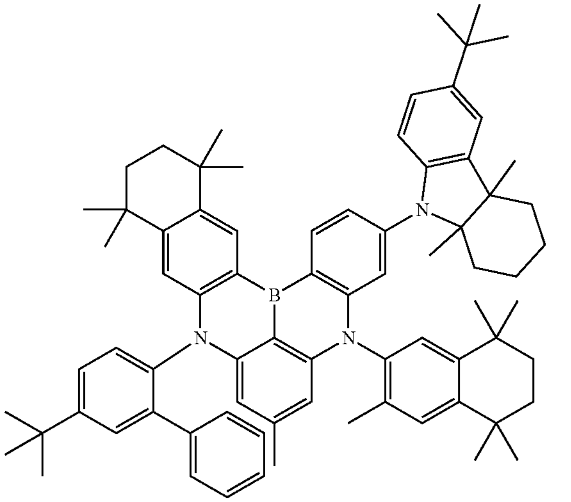
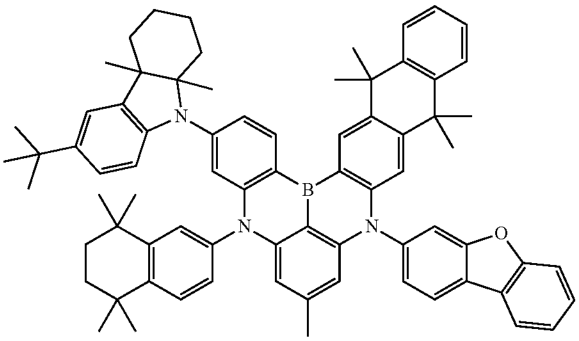
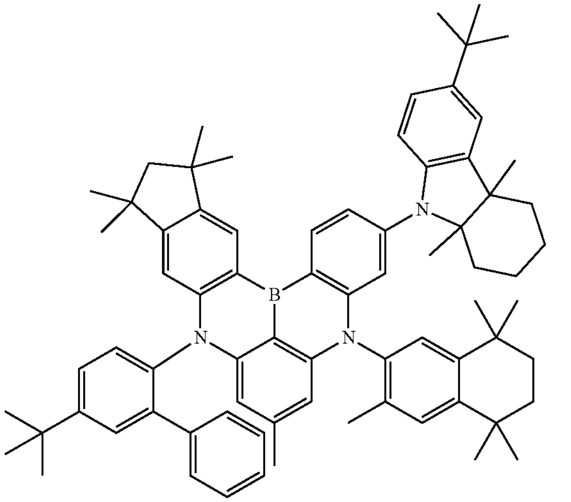
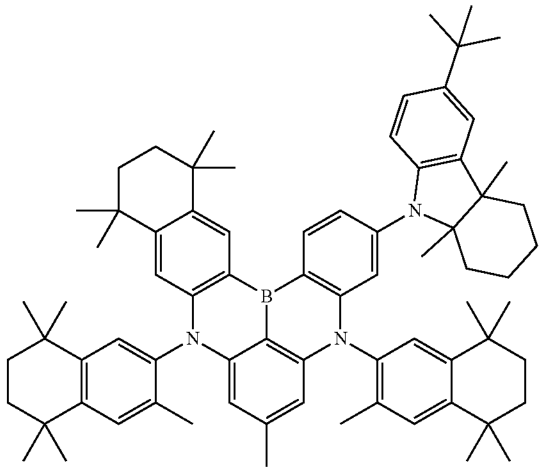
-continued -continued
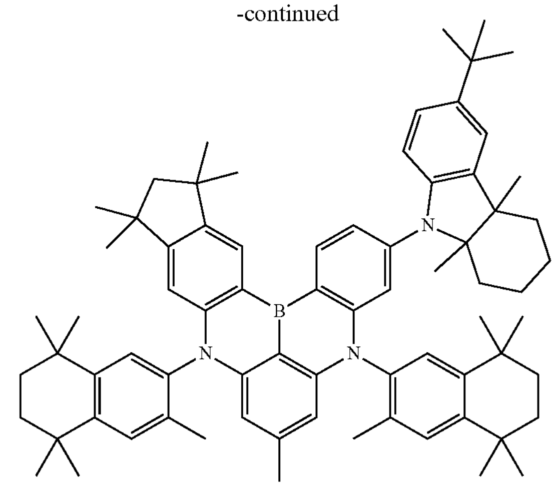
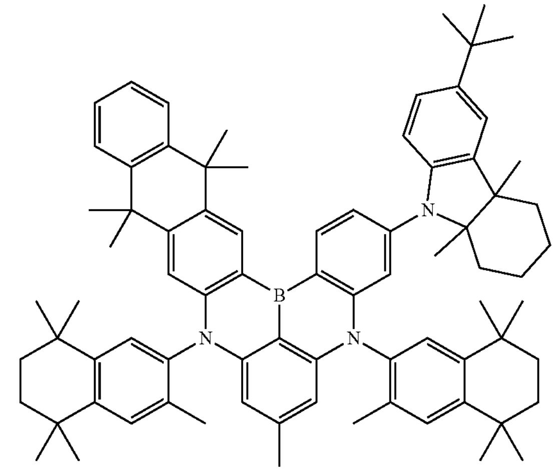
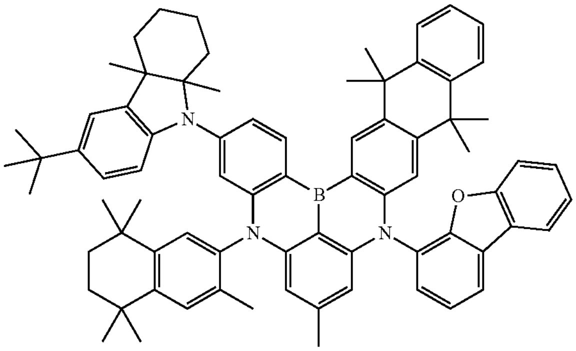
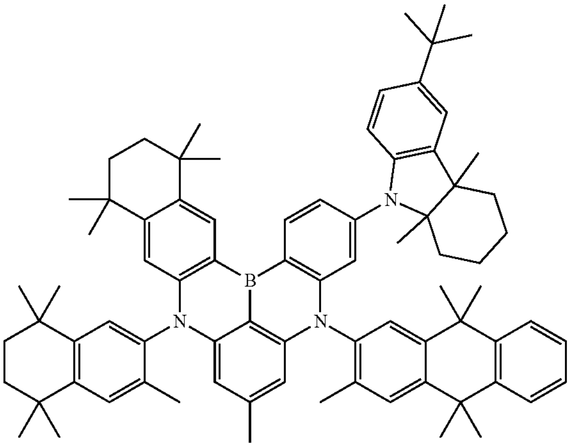
-continued
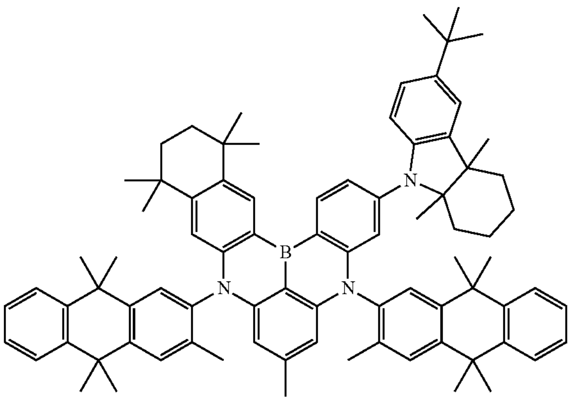
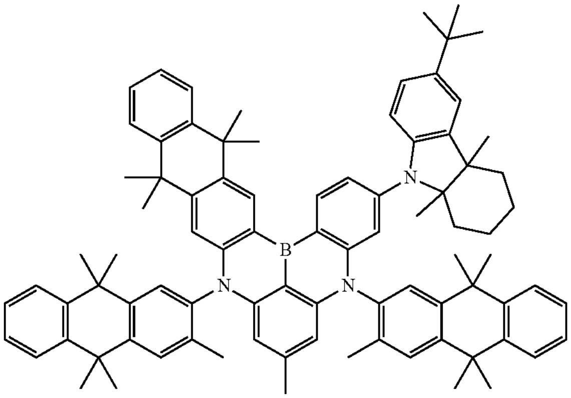
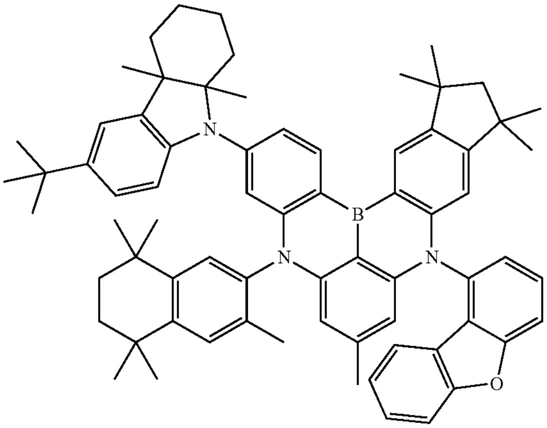
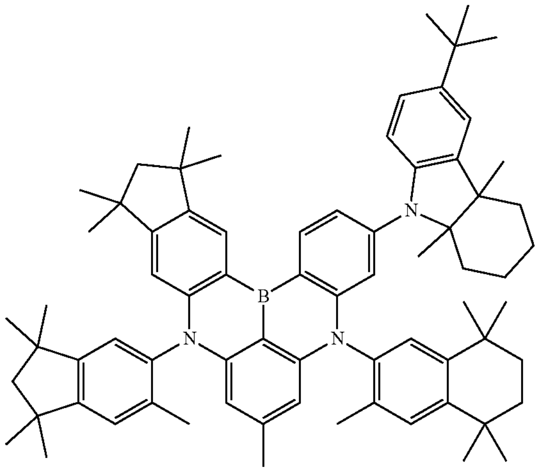

-continued
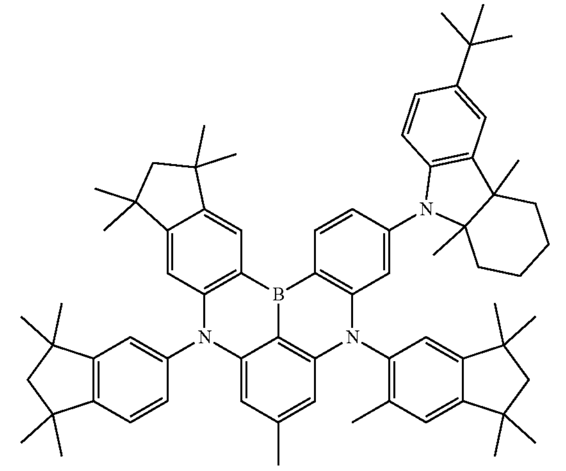
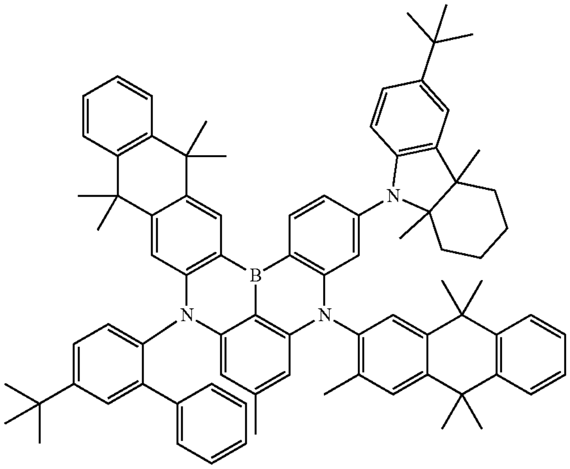
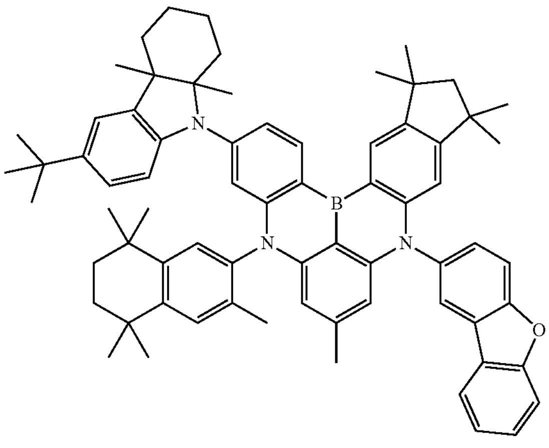
-continued
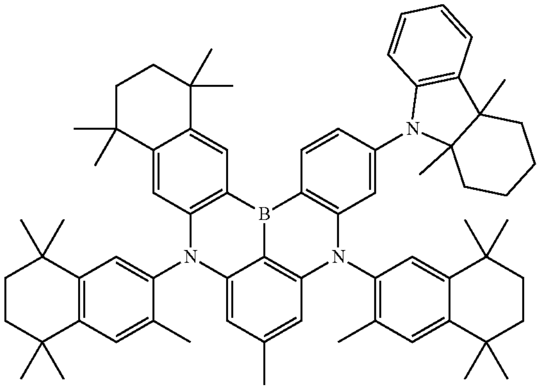
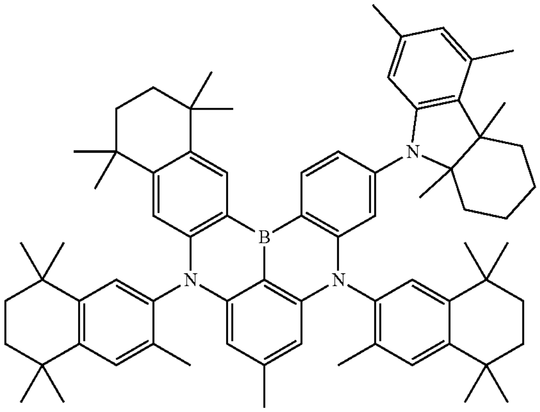
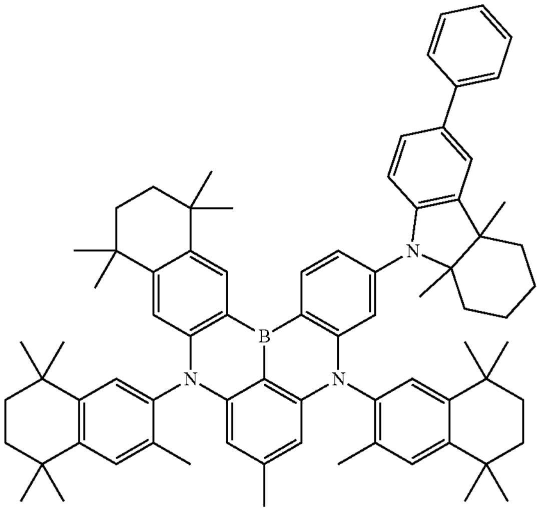
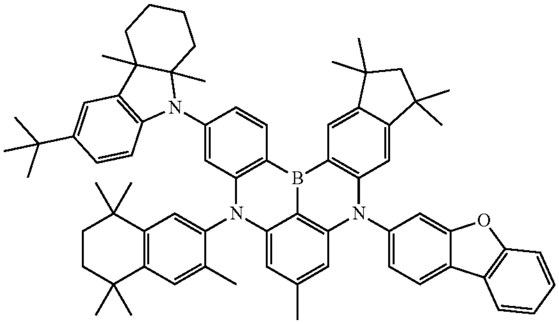

-continued
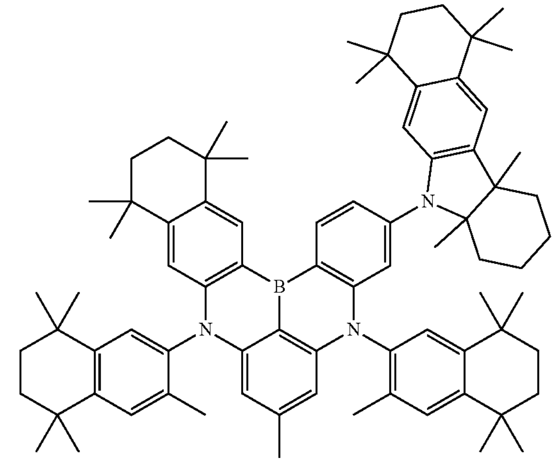
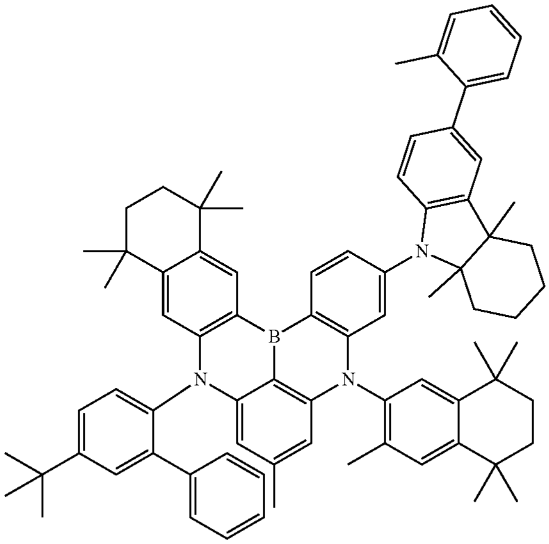
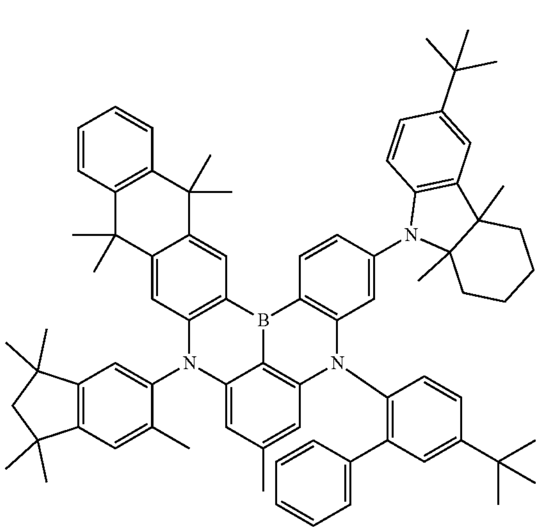
-continued
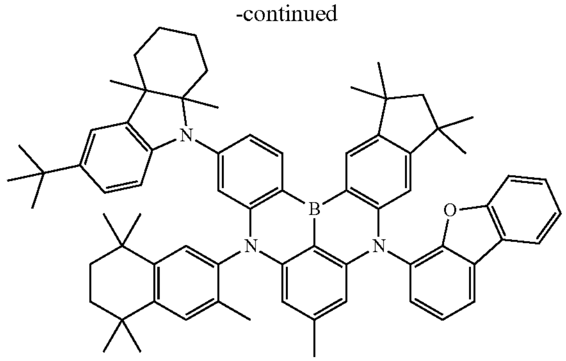
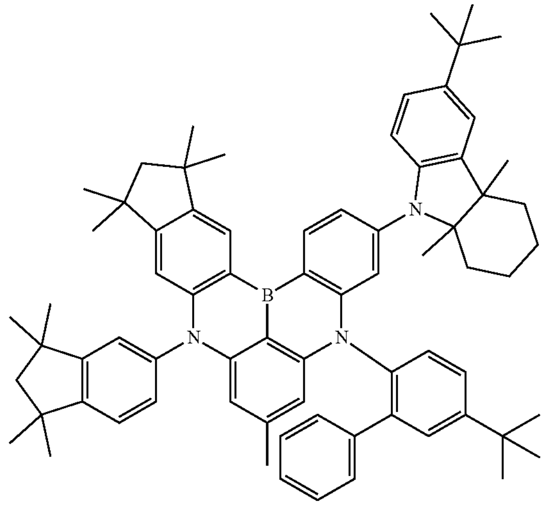
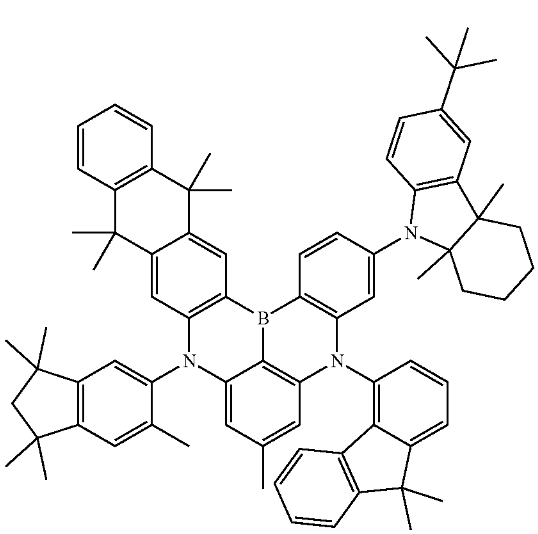

-continued
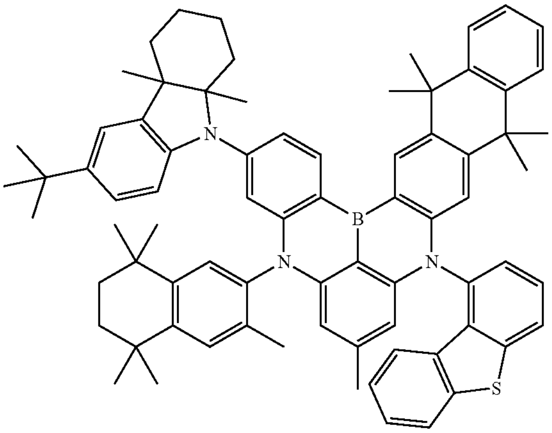
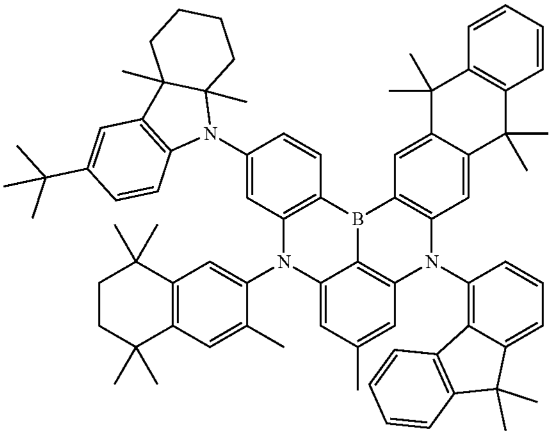
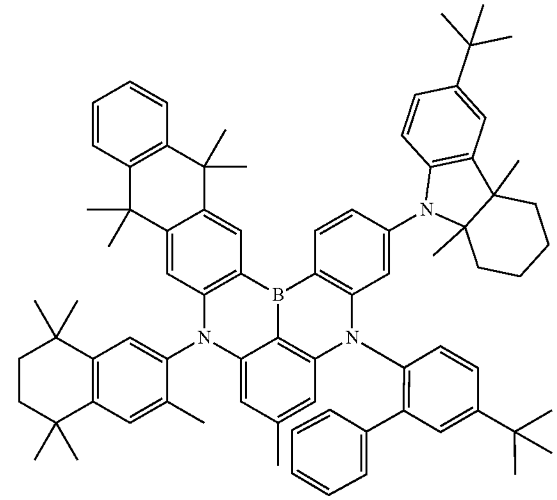
-continued
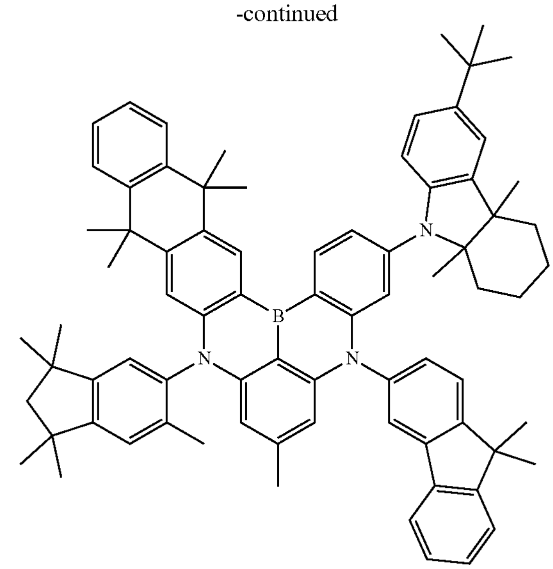
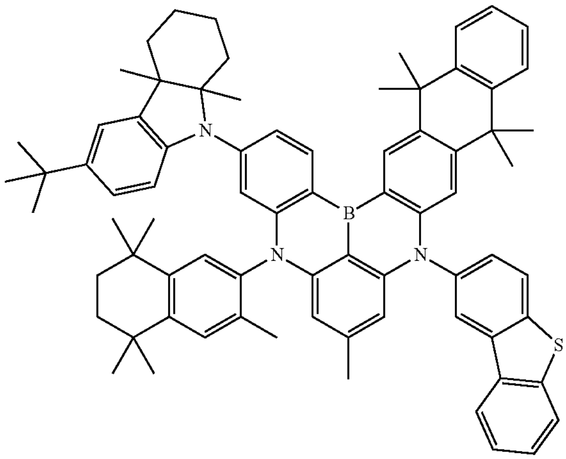
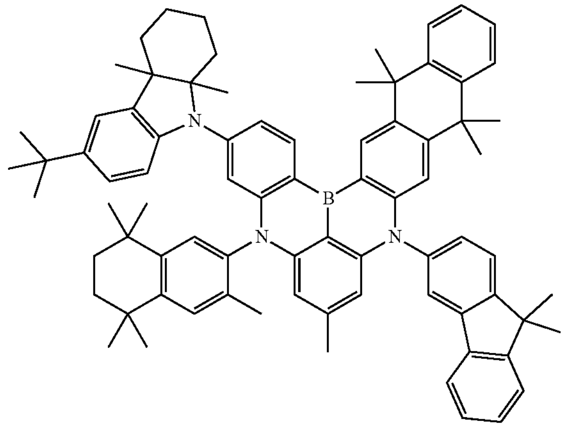

-continued
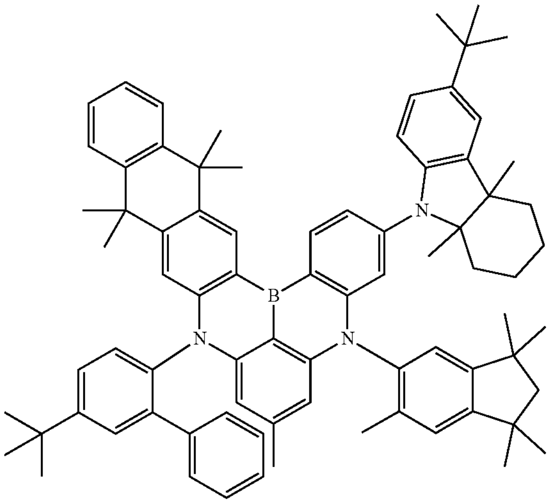
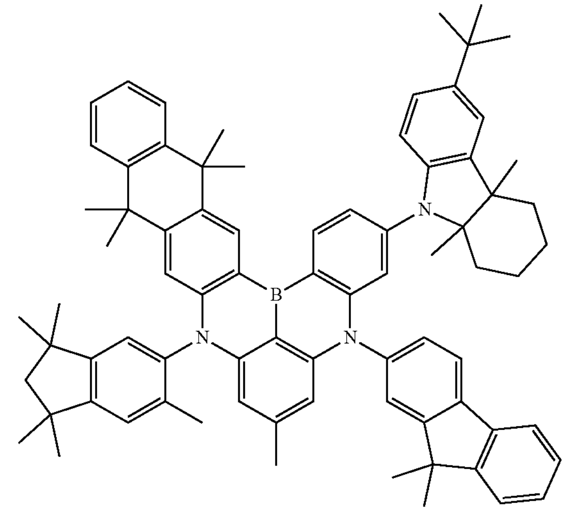
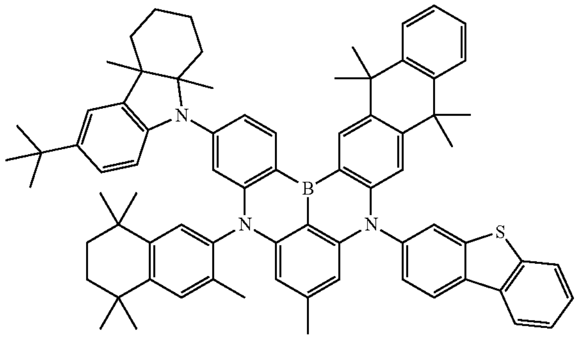
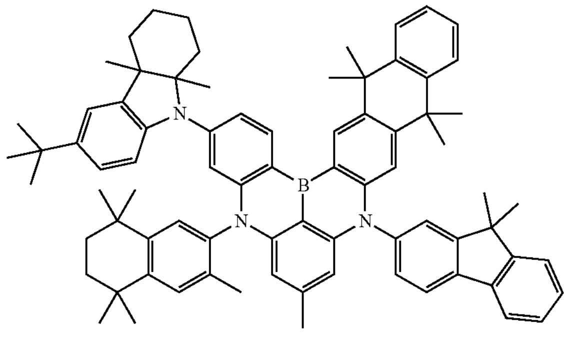
-continued
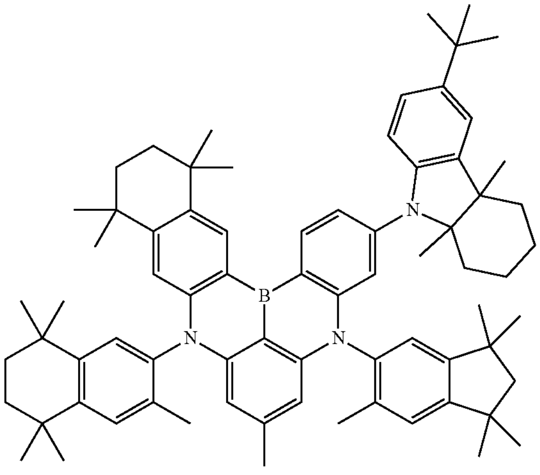
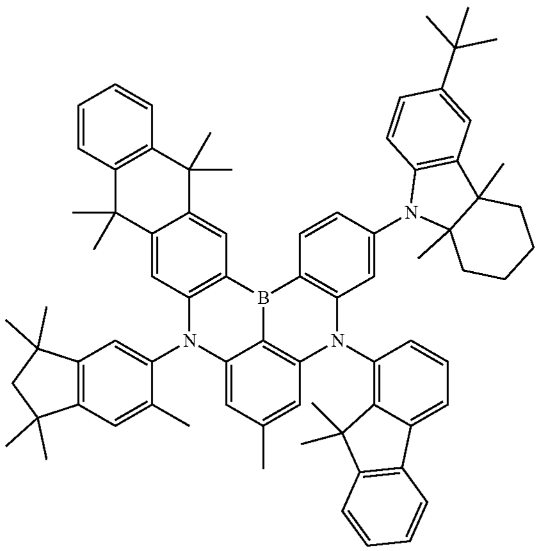
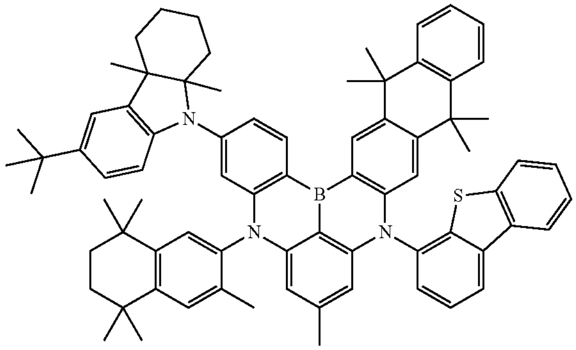

-continued
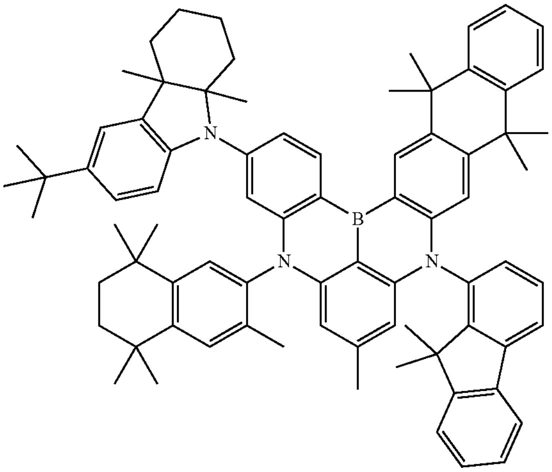
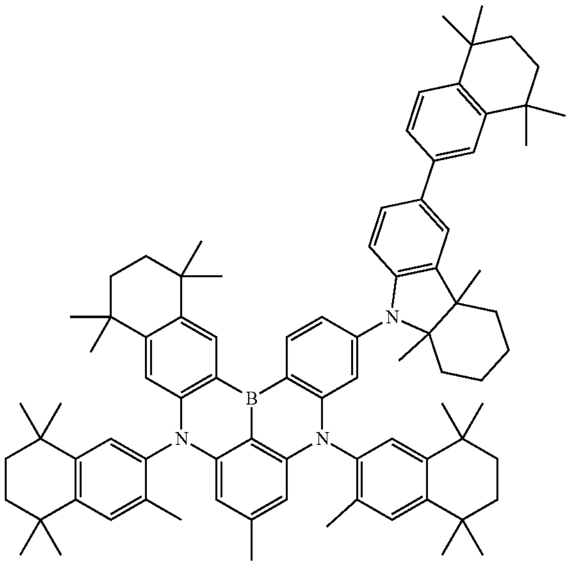
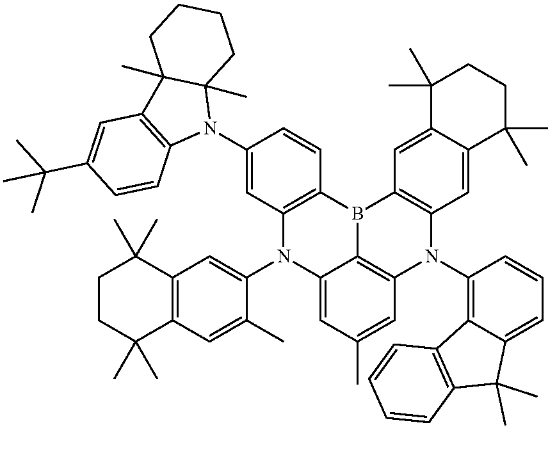
-continued
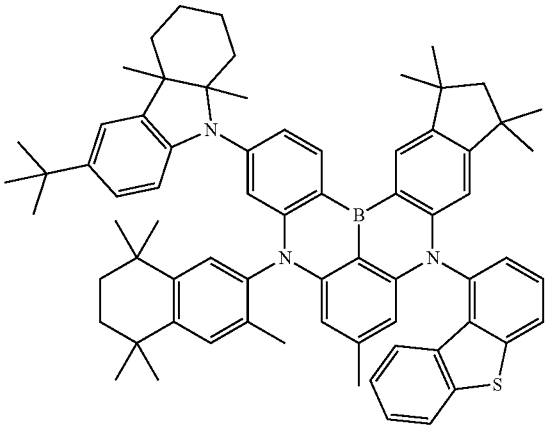
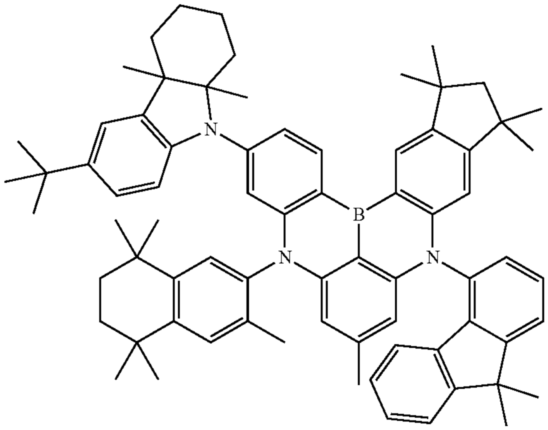
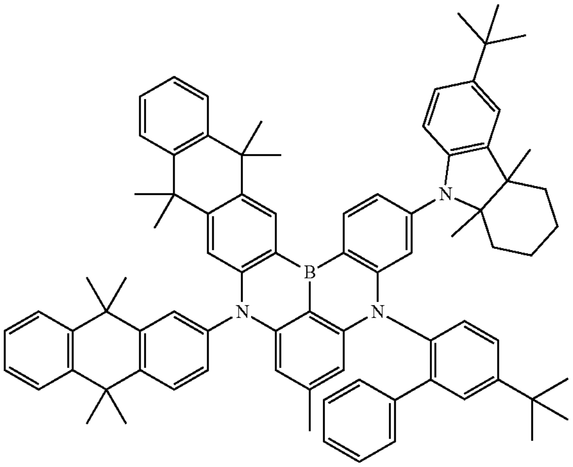

-continued
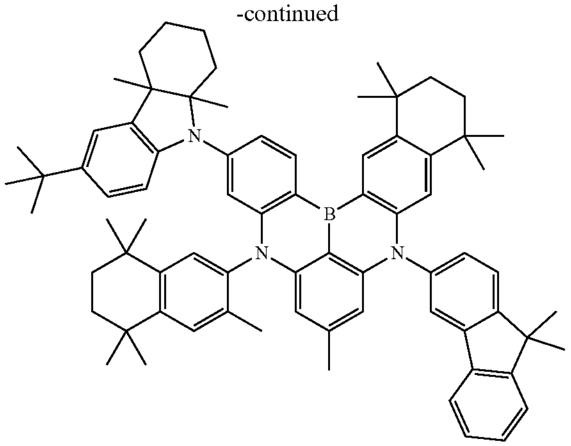
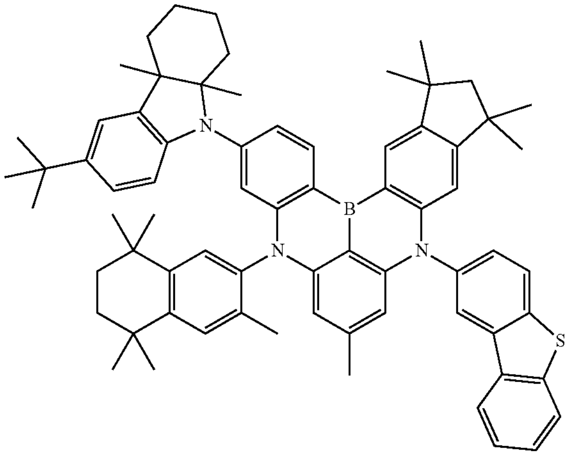
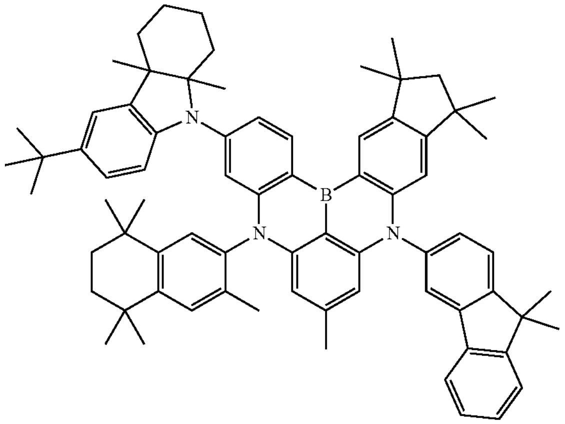
-continued
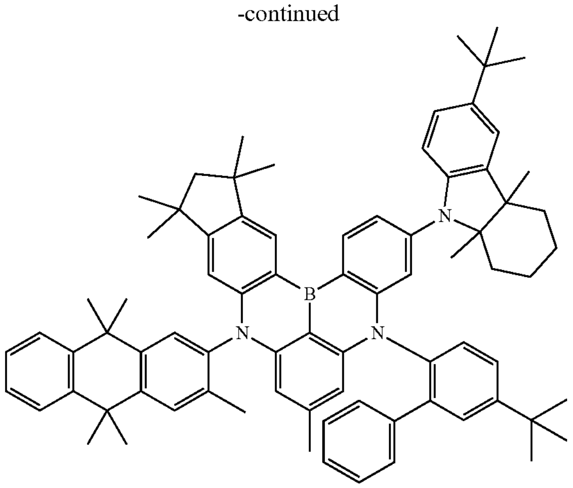
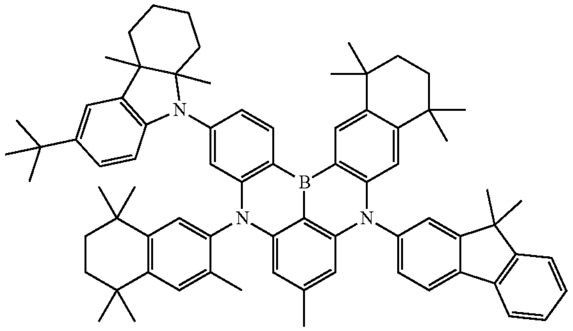
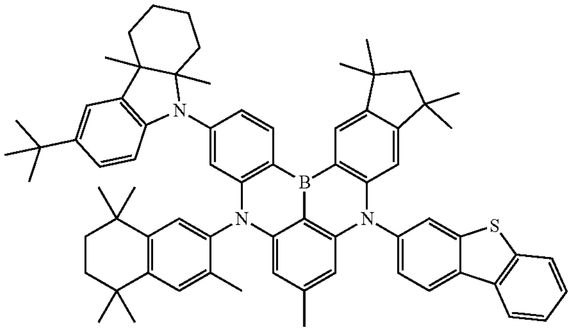
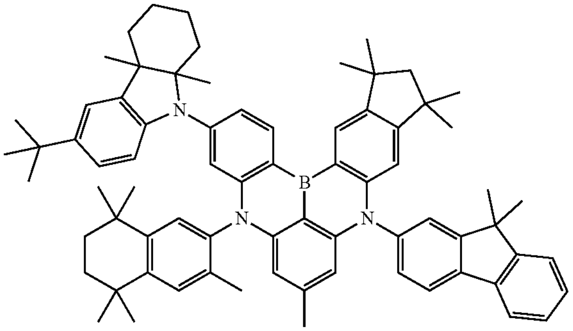

-continued
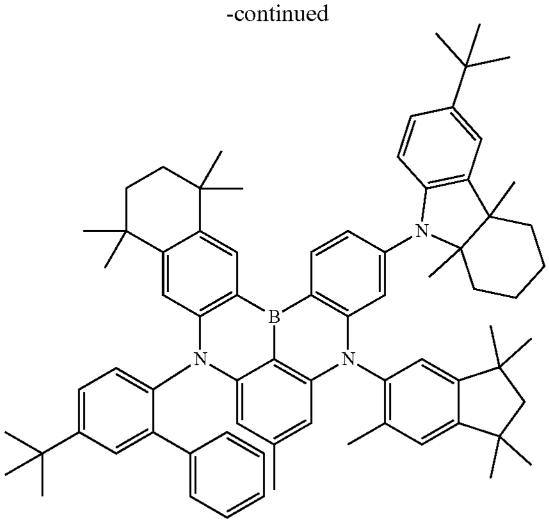
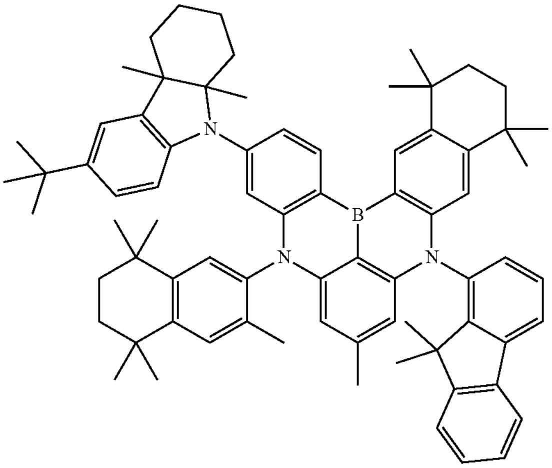
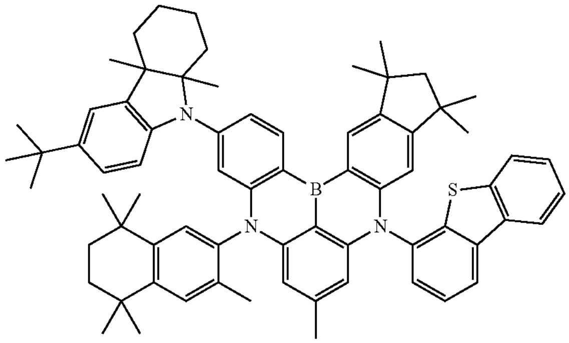
-continued
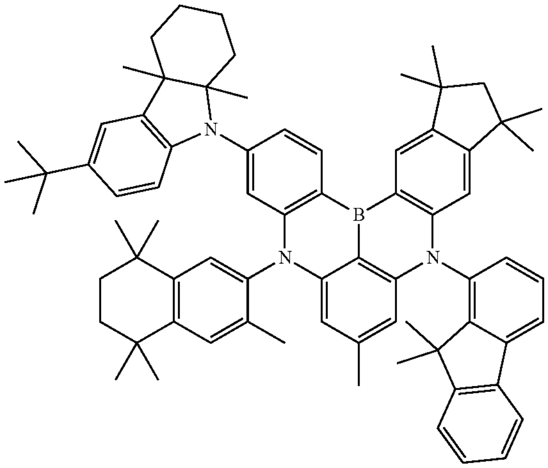
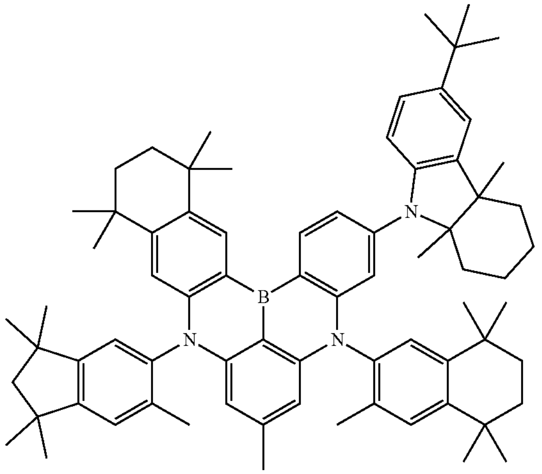
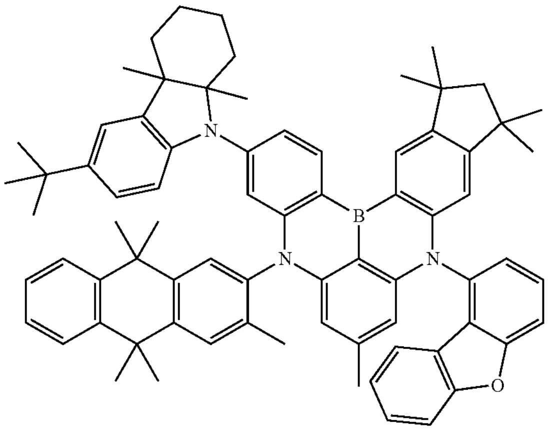

-continued
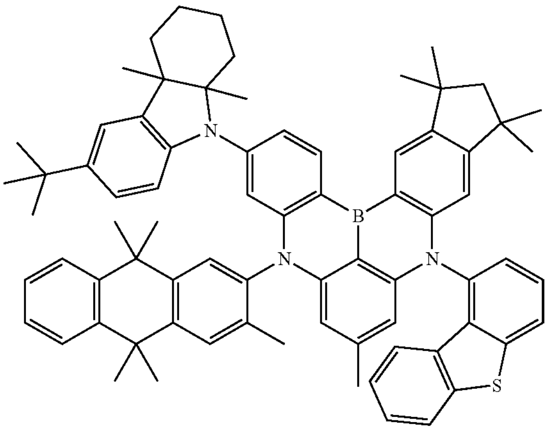
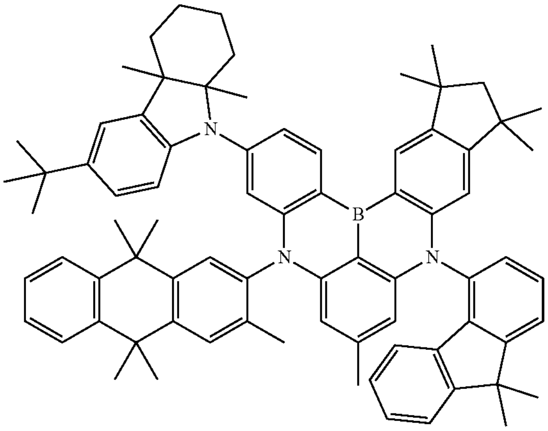
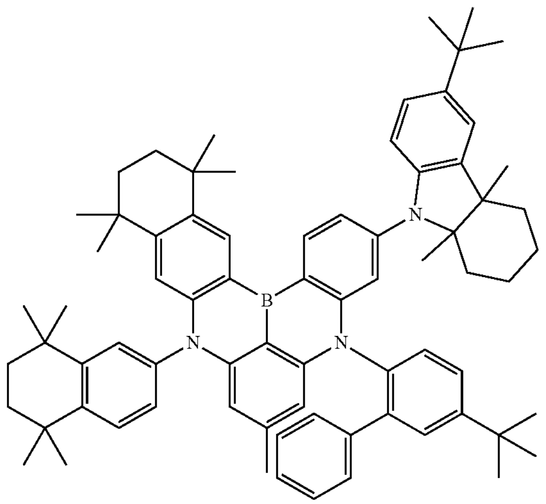
-continued
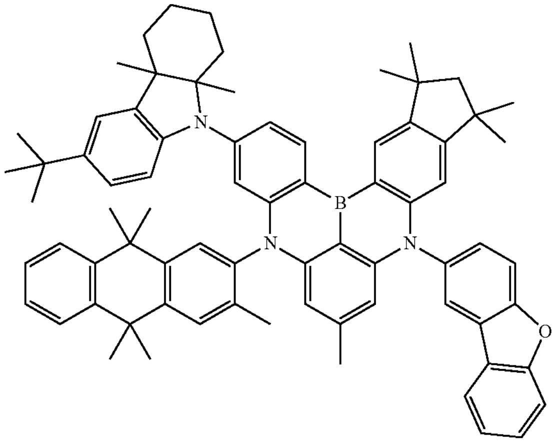
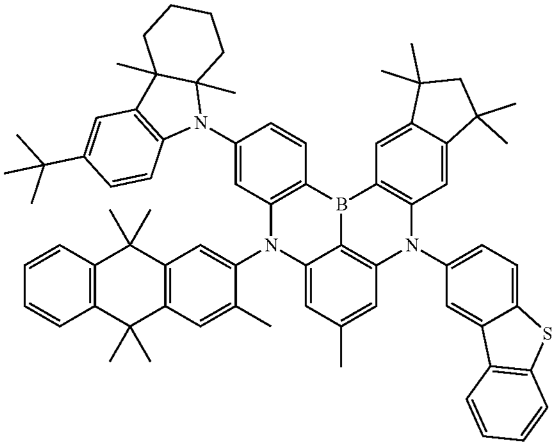
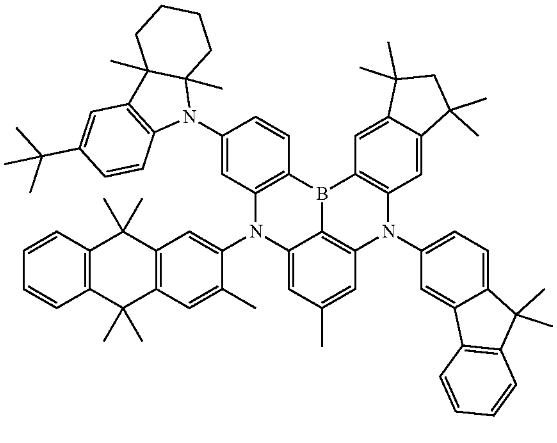

-continued
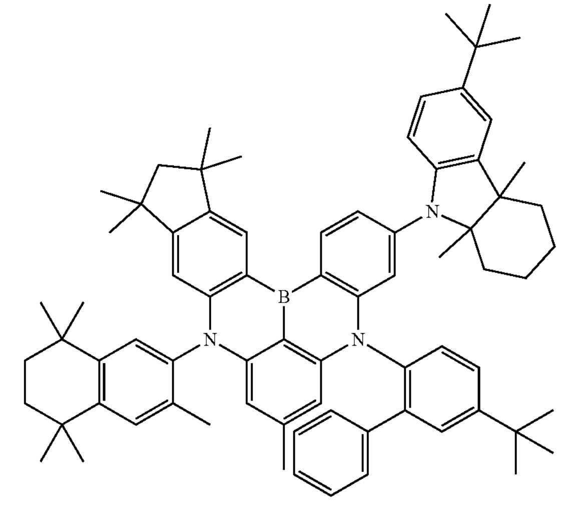
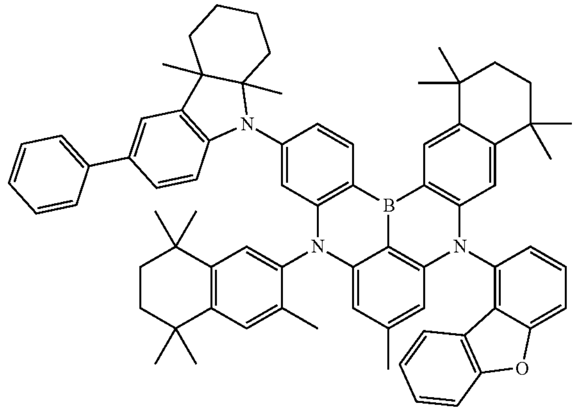
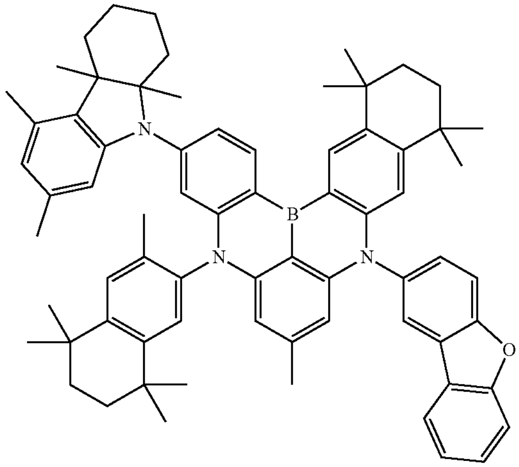
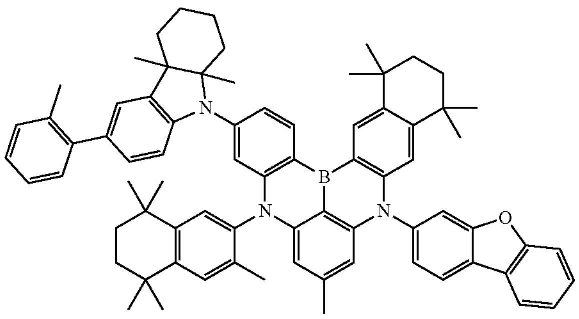
-continued
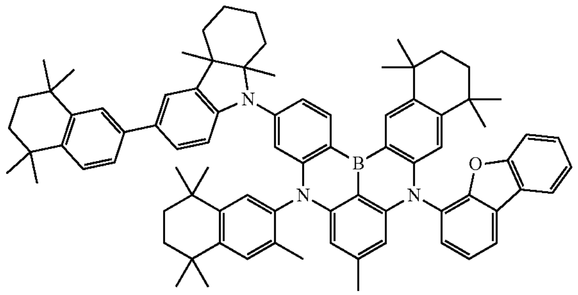
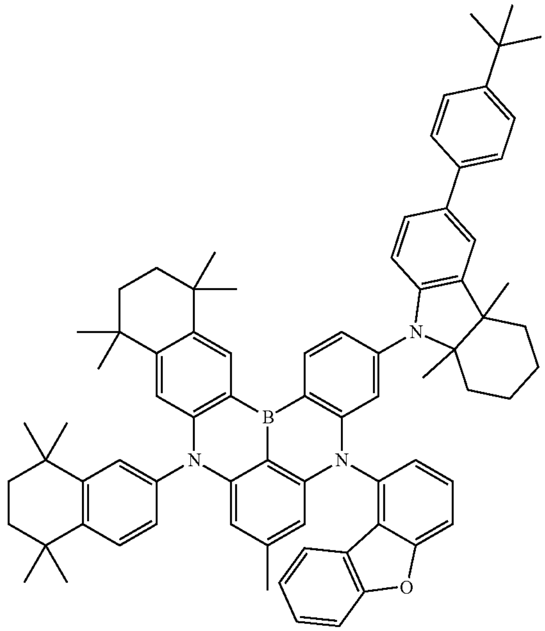
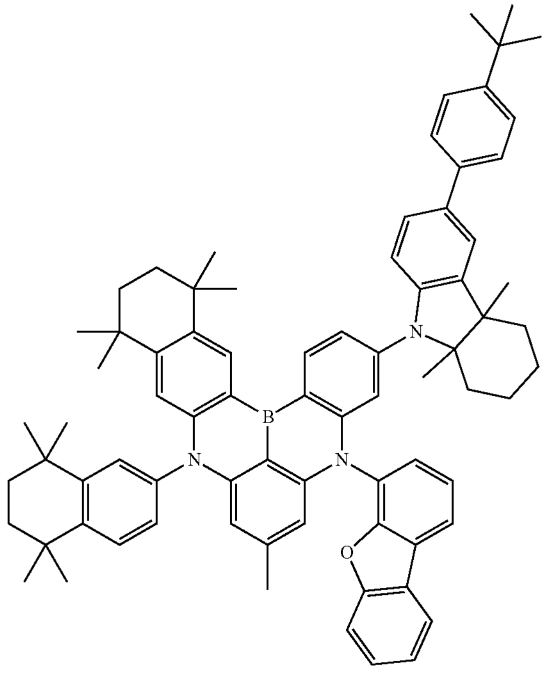

-continued
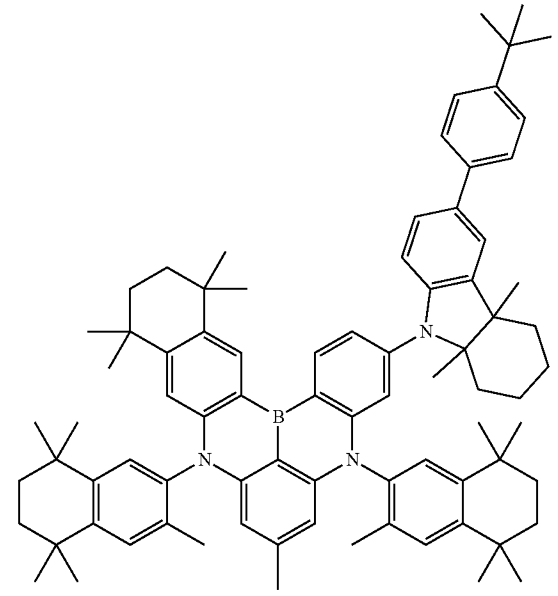
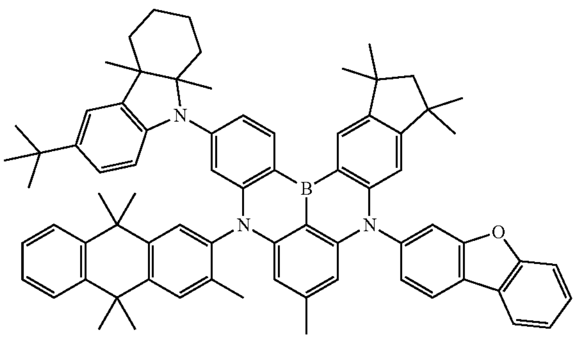
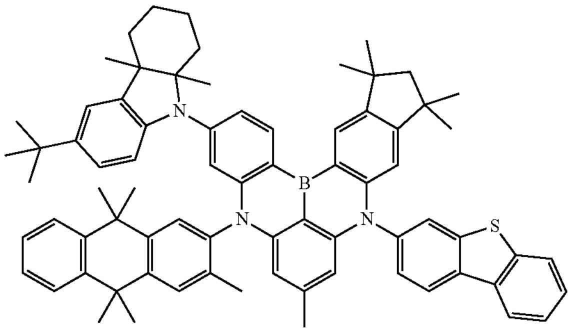
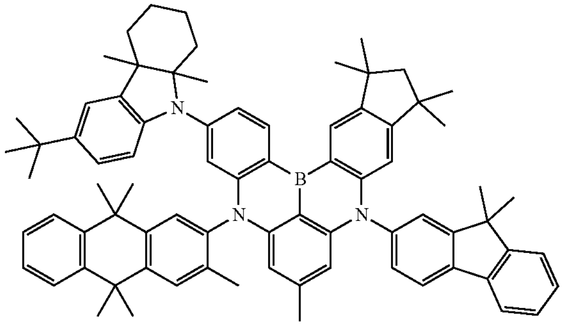
-continued
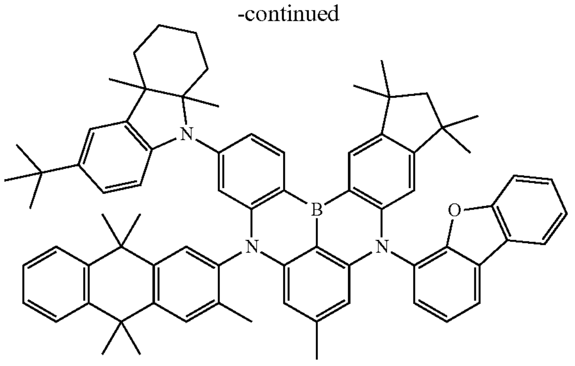
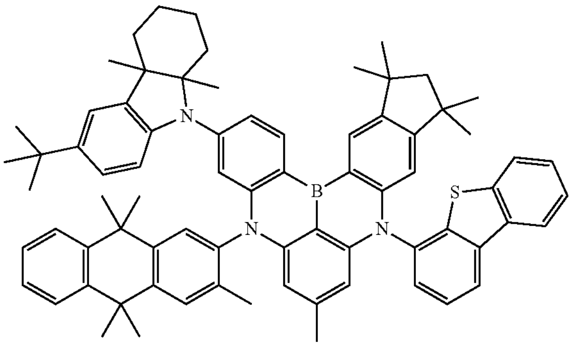
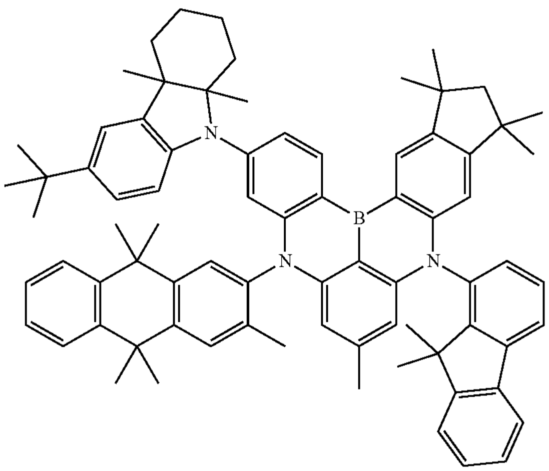
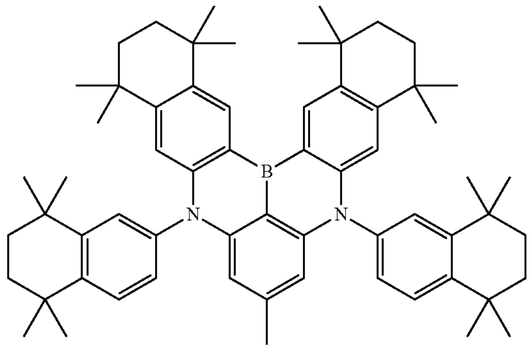

-continued
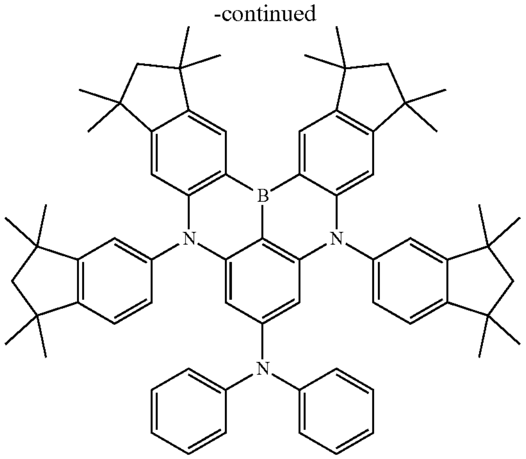
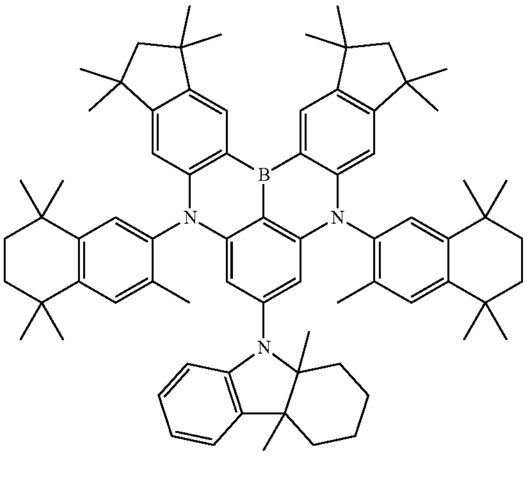
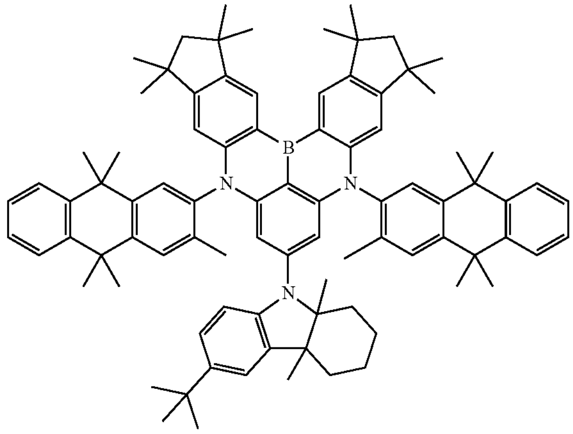
-continued
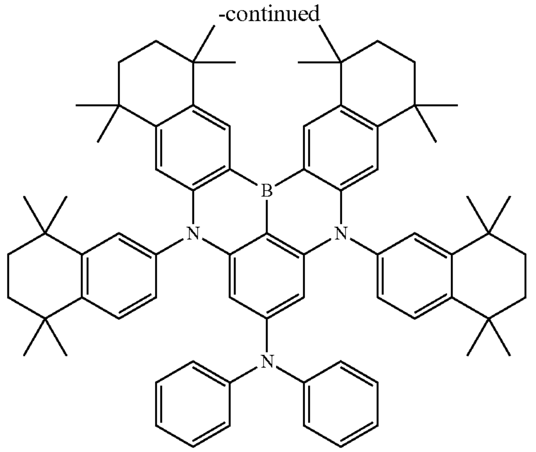
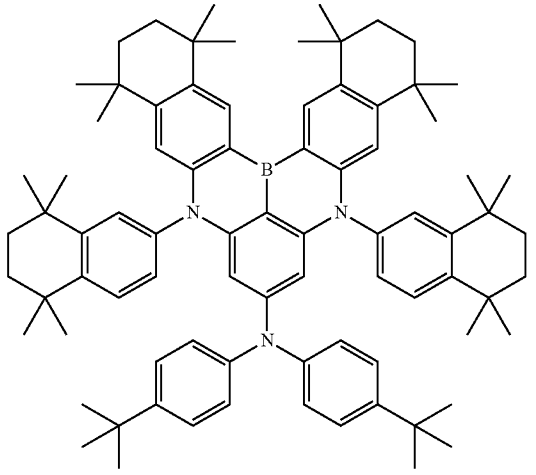
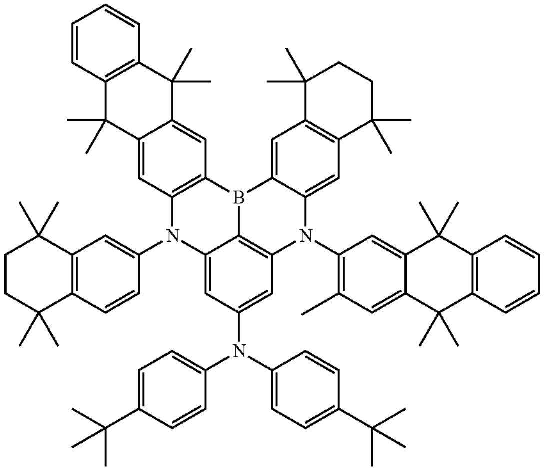

-continued
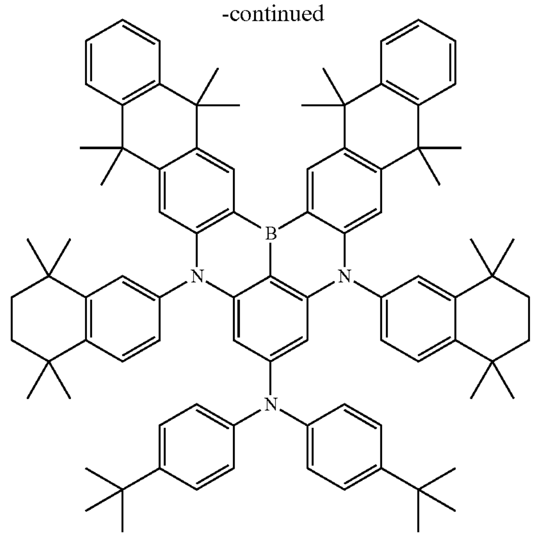
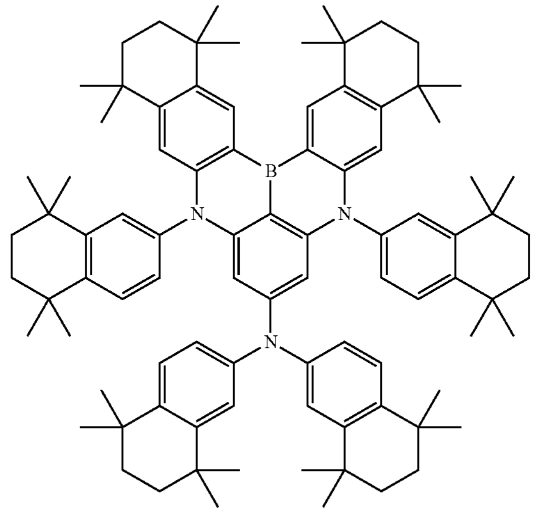
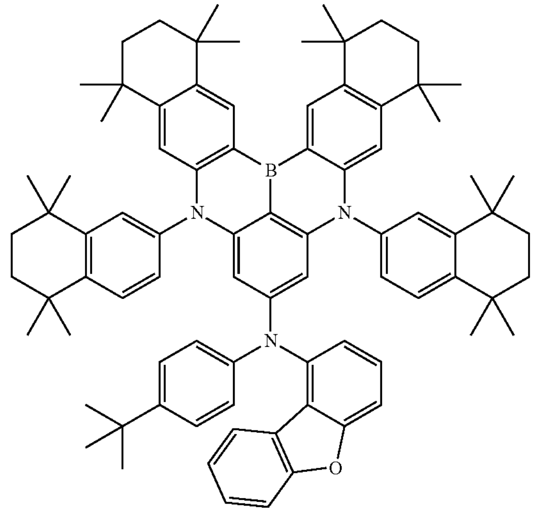
-continued
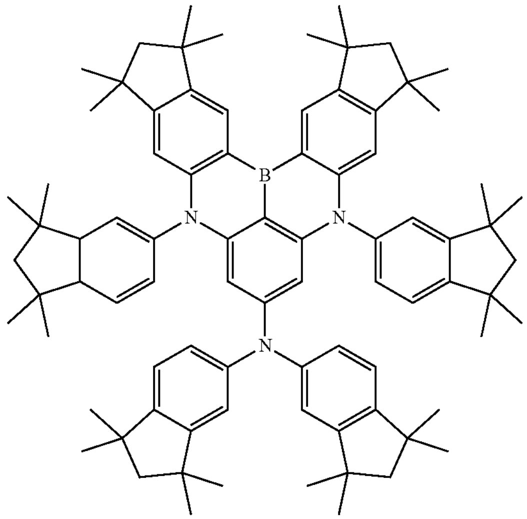
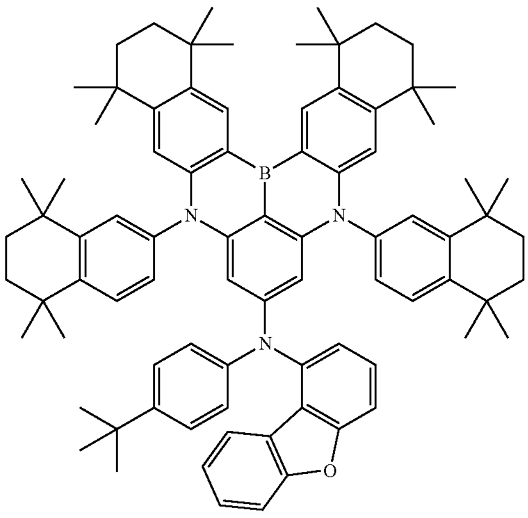
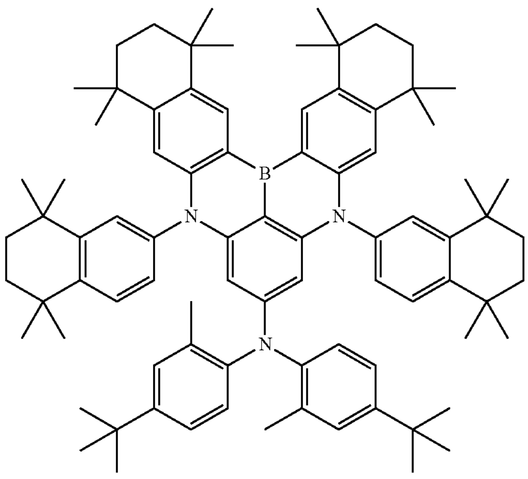

-continued
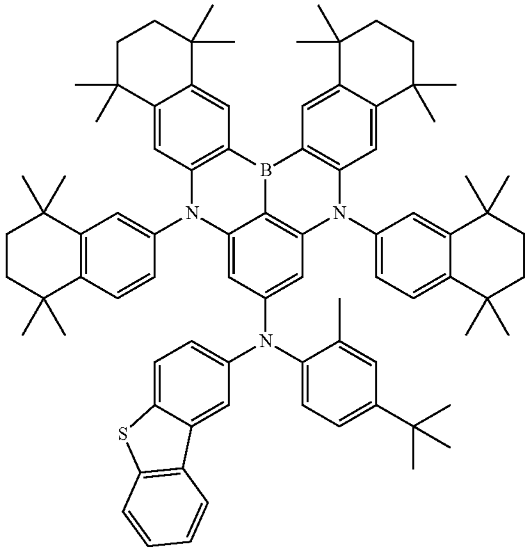
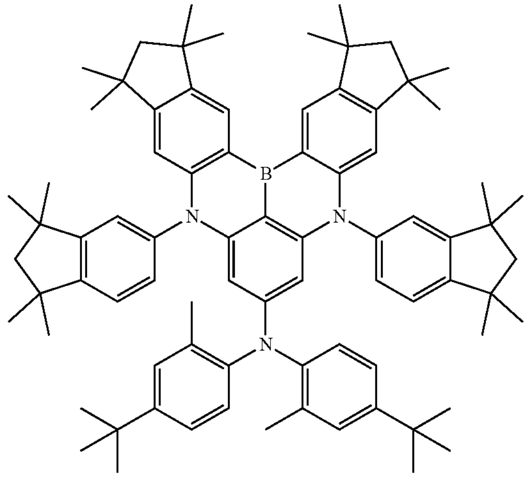
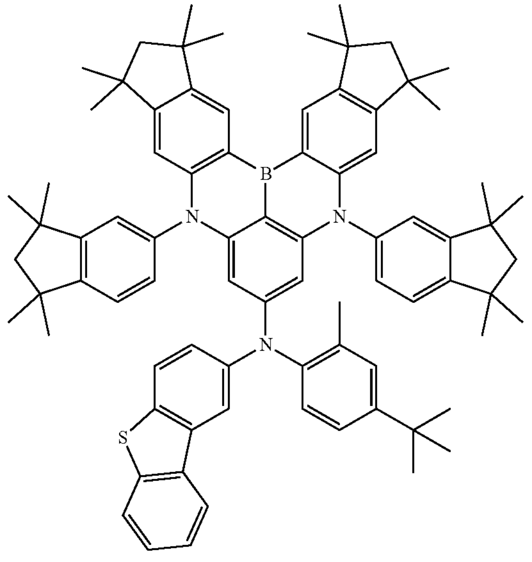
-continued
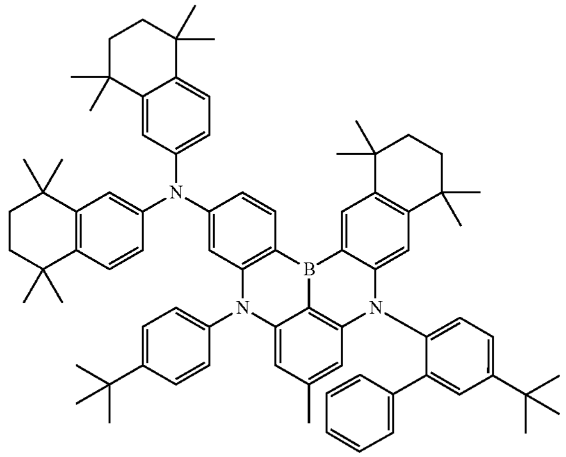
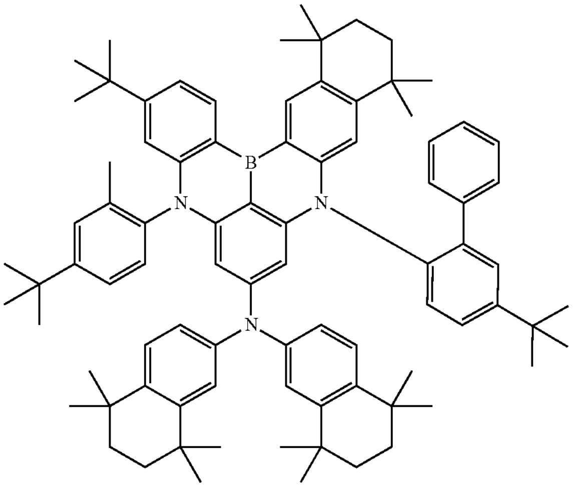
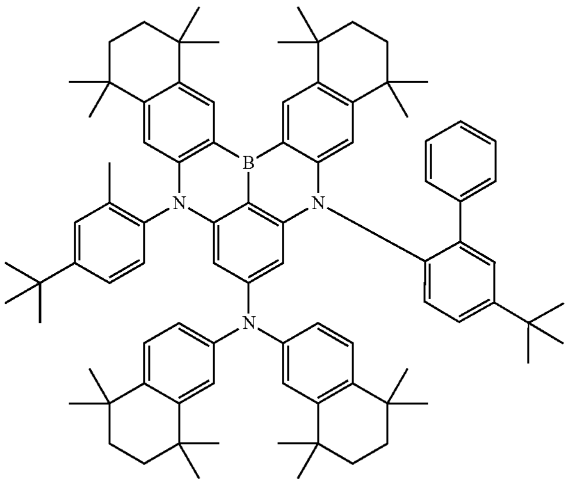

-continued
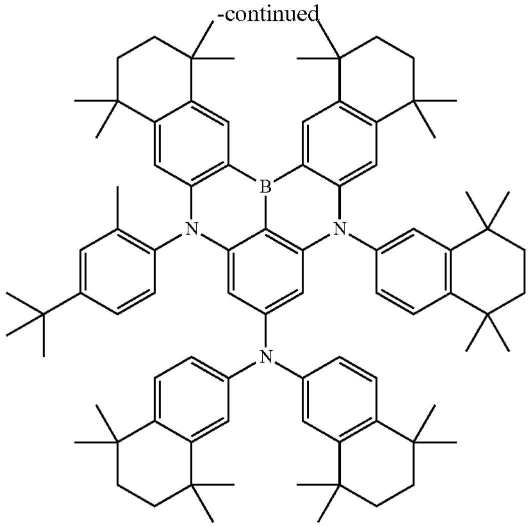
-continued
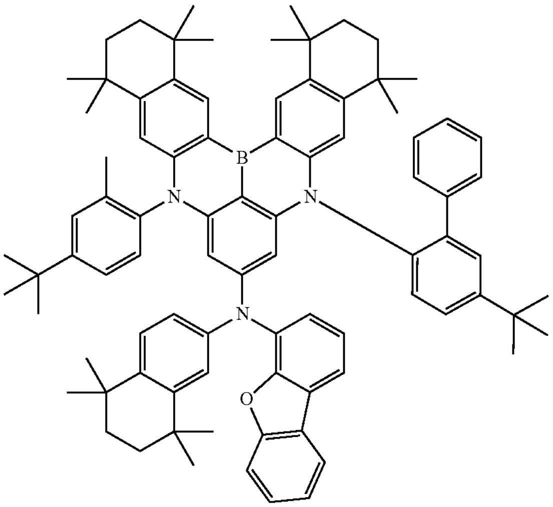
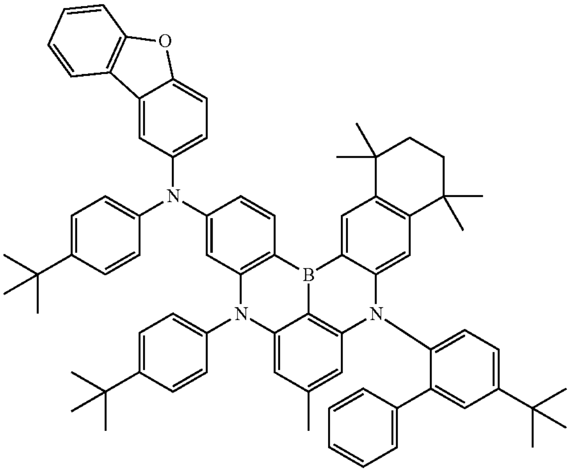
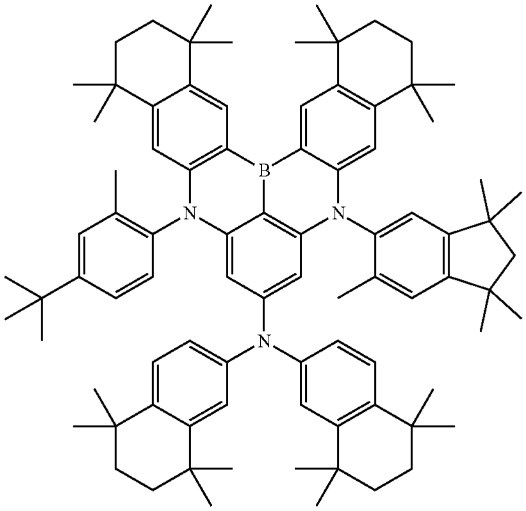
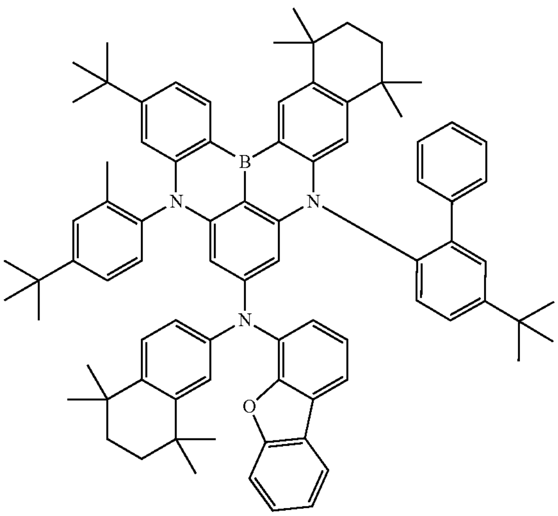
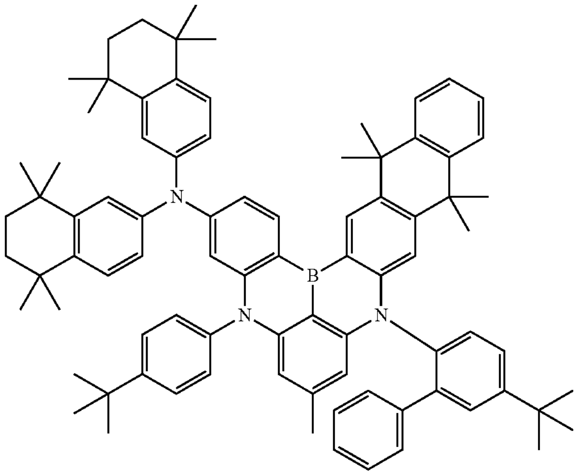

-continued
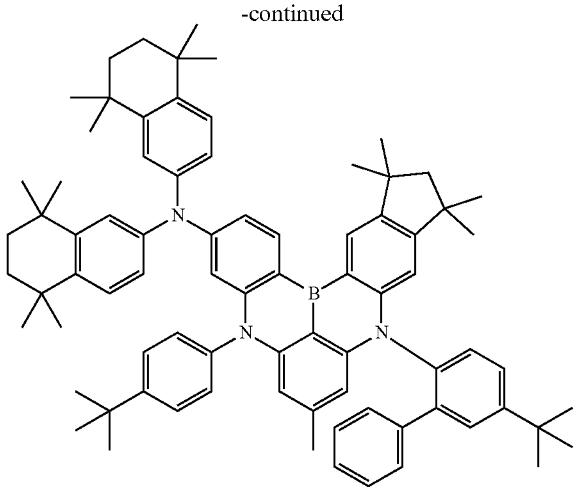
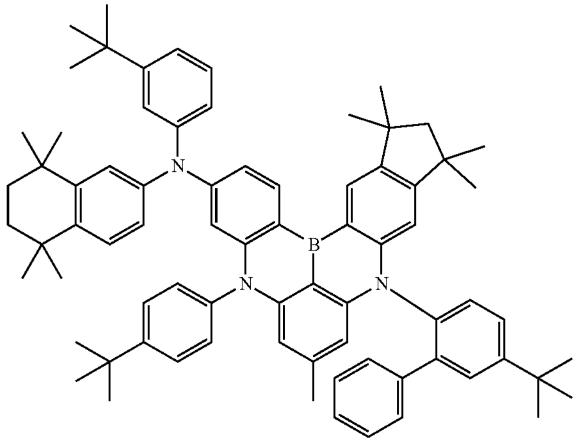
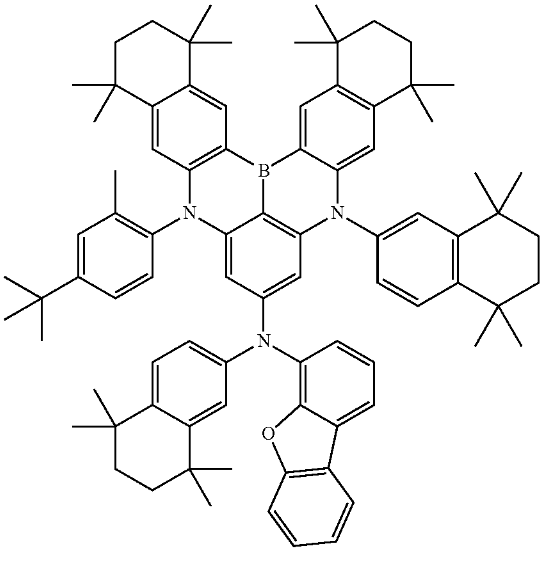
-continued
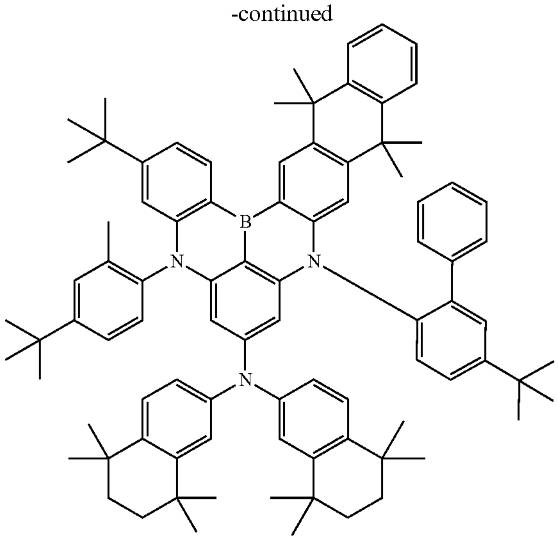
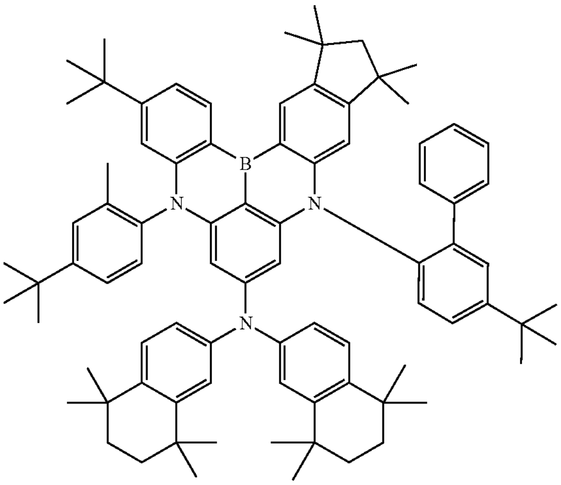
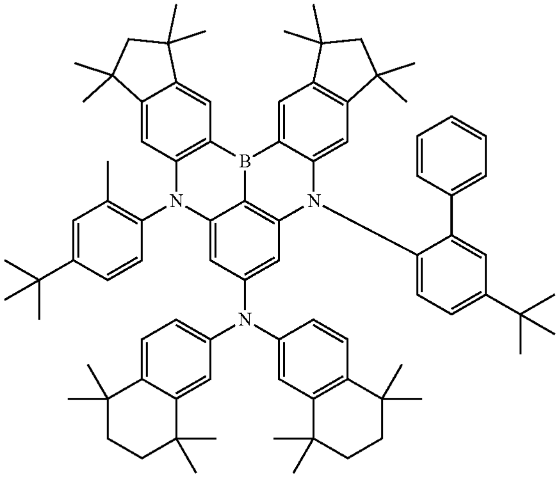

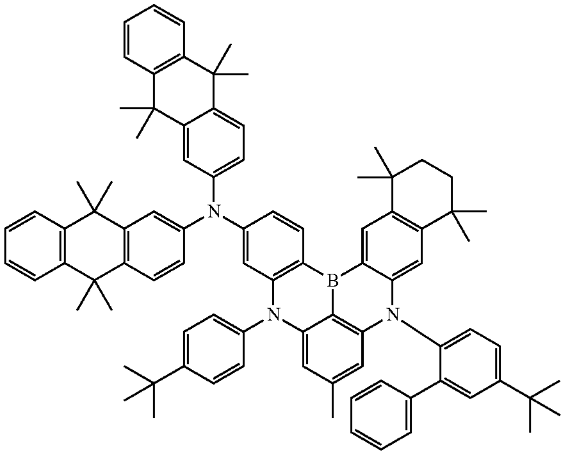
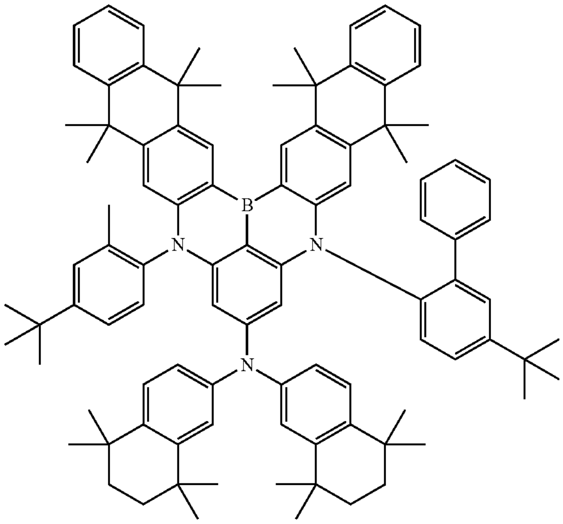
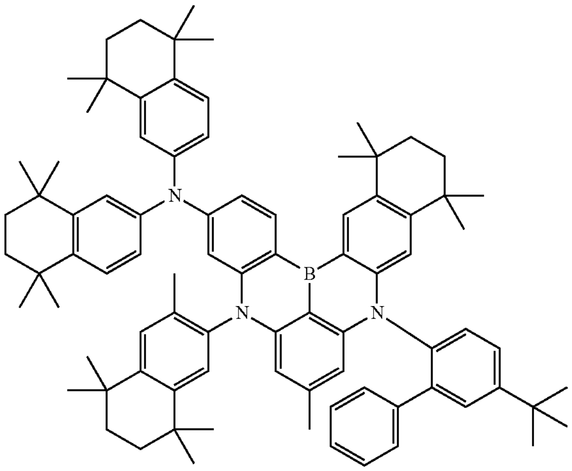
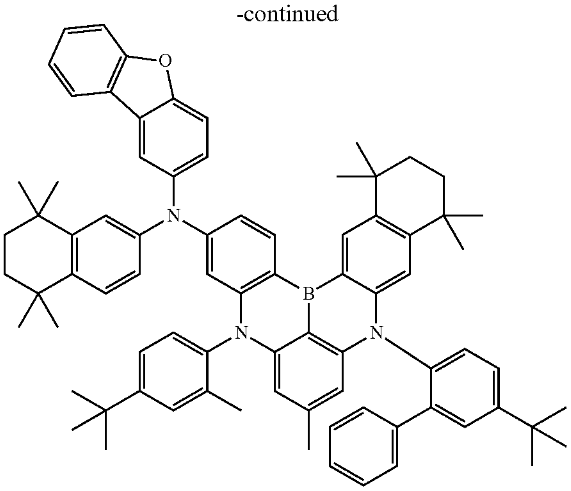
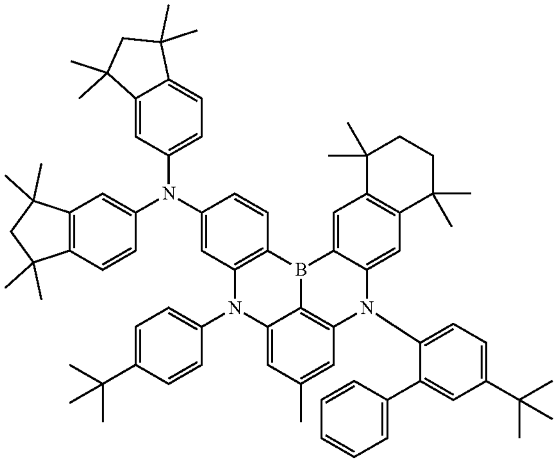
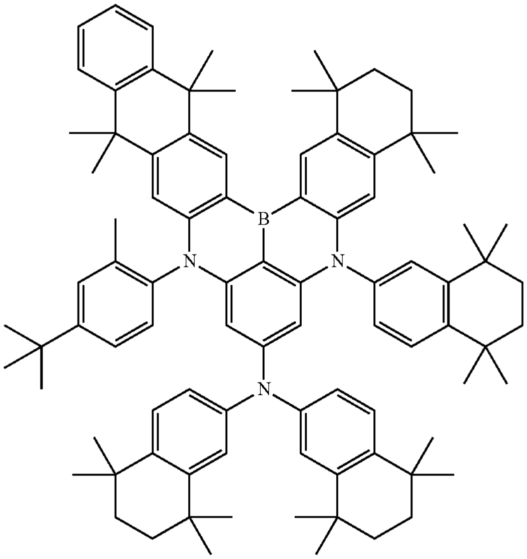

-continued
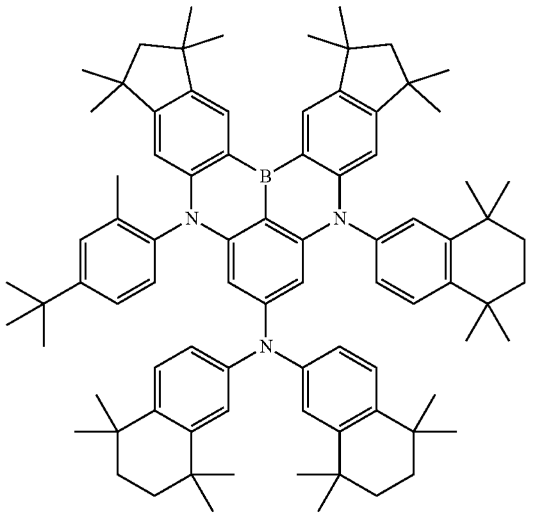
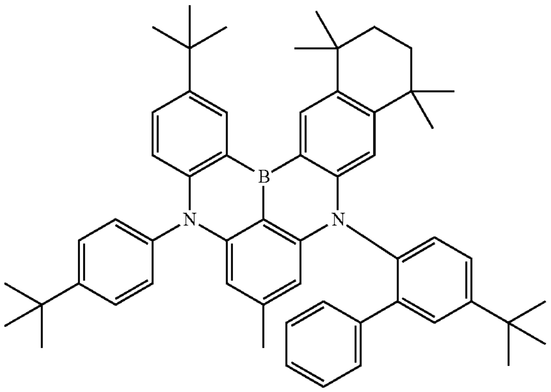
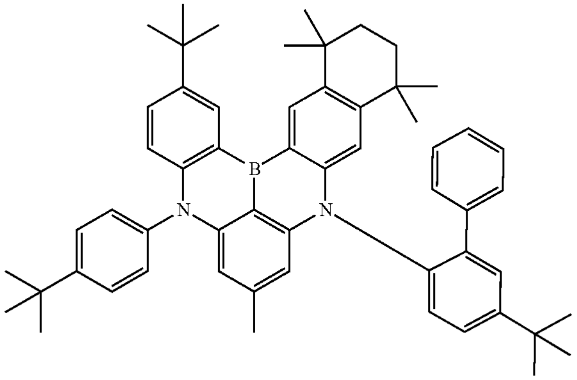
-continued
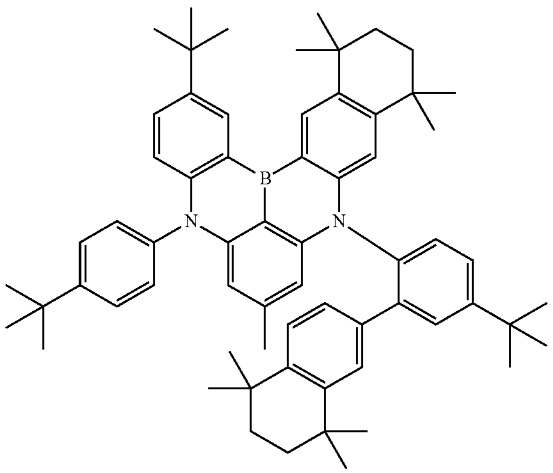
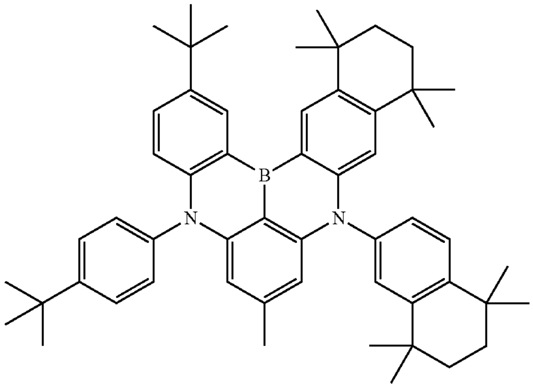
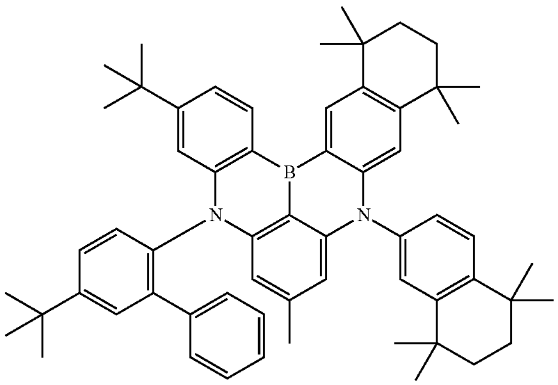
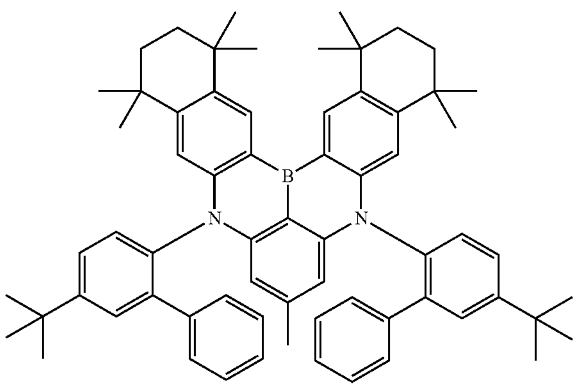

-continued
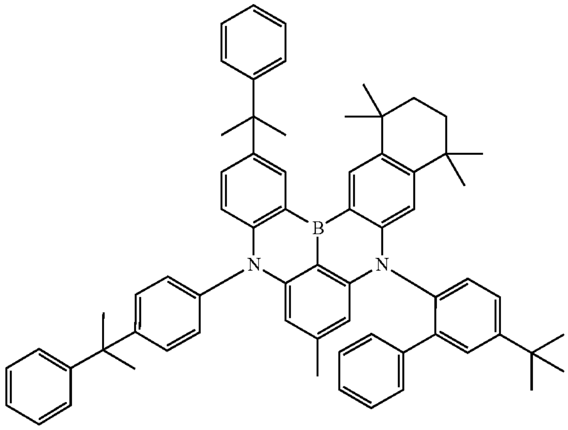
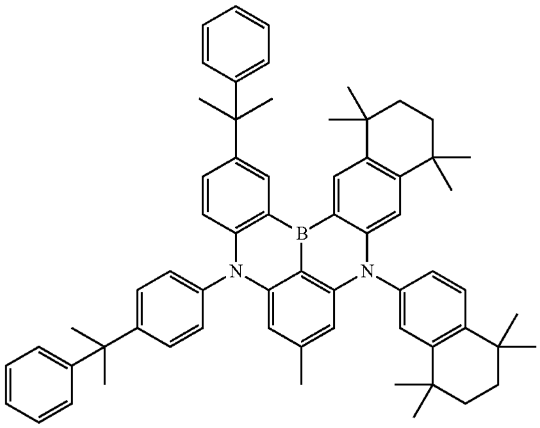
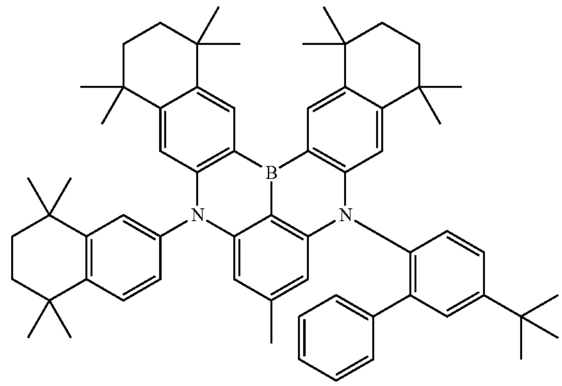
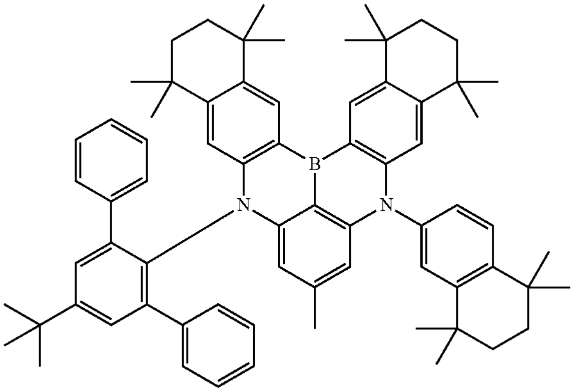
-continued
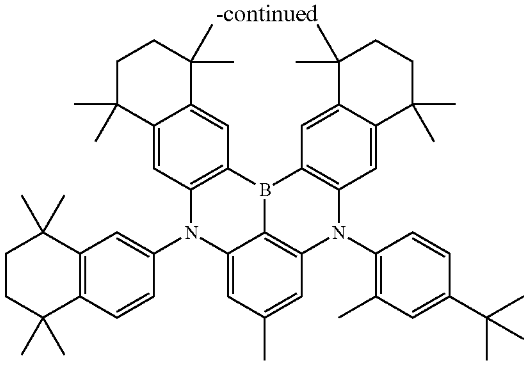
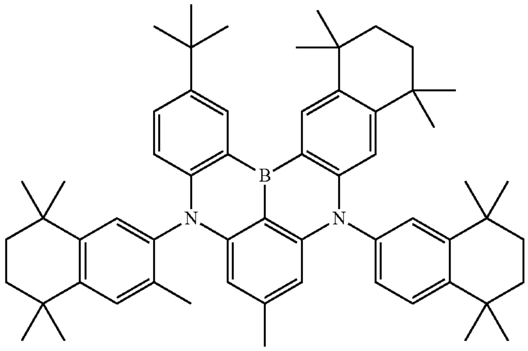
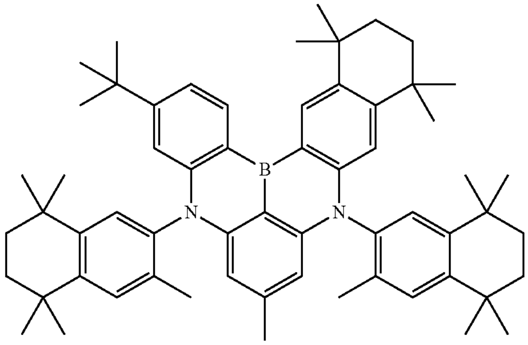
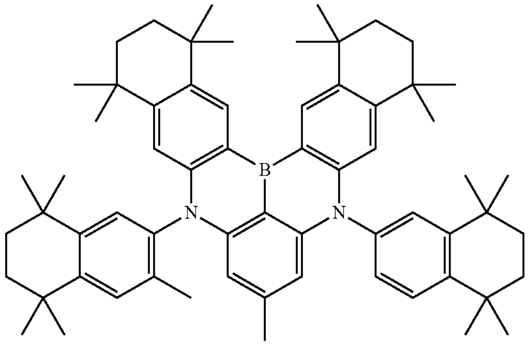
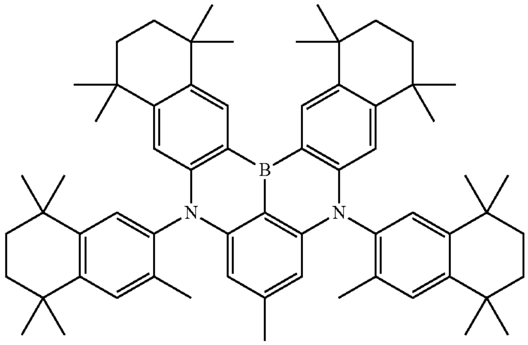

-continued
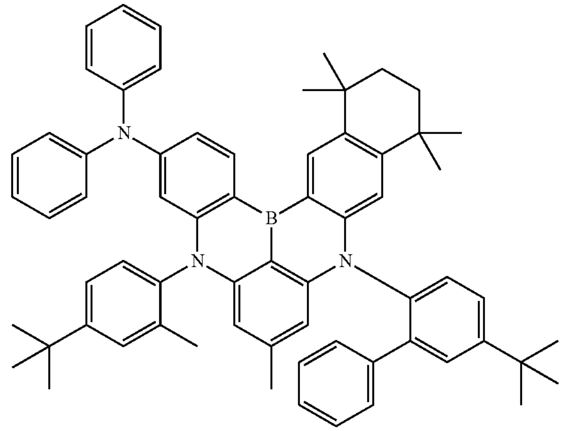
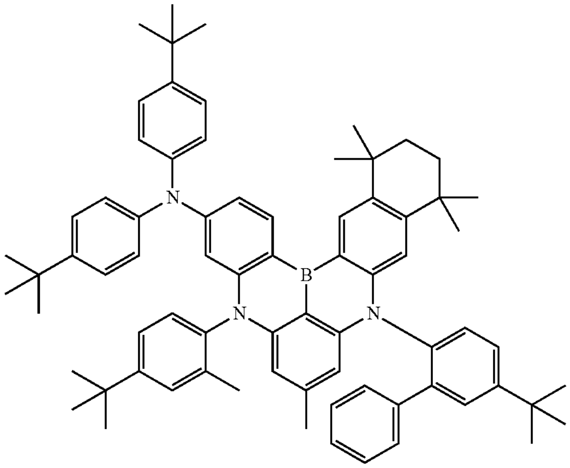
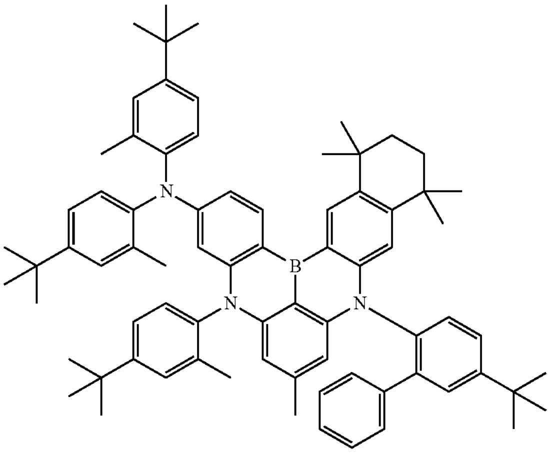
-continued
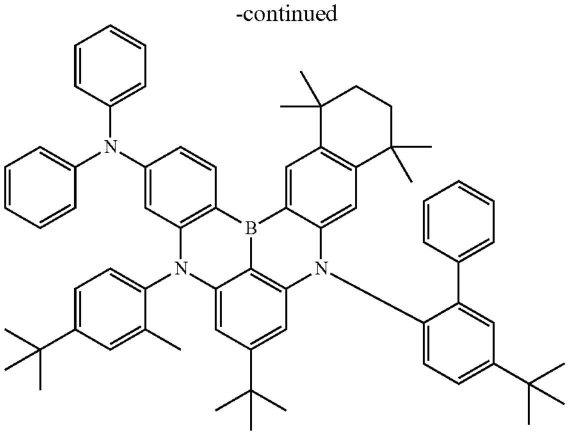
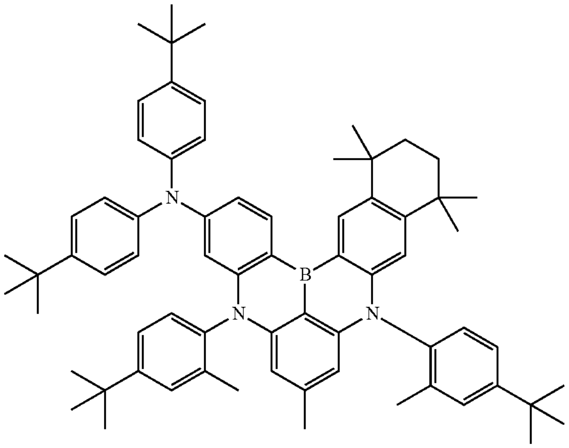
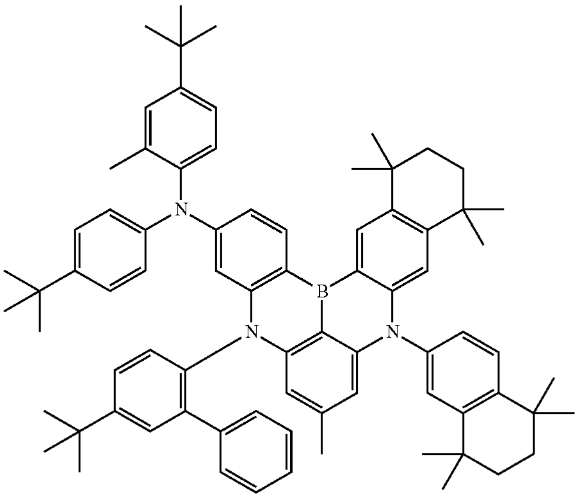

-continued
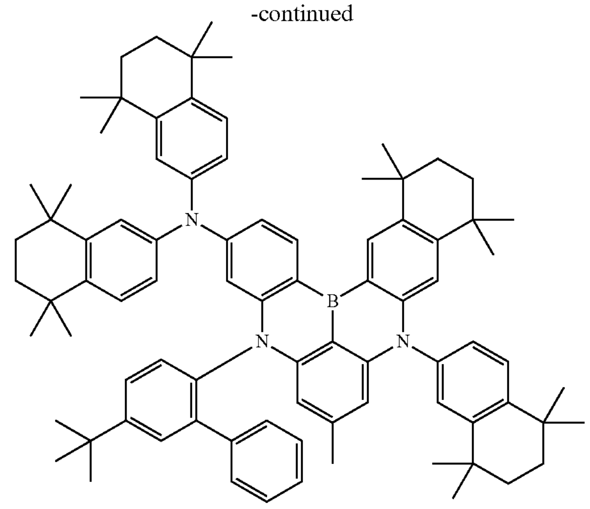
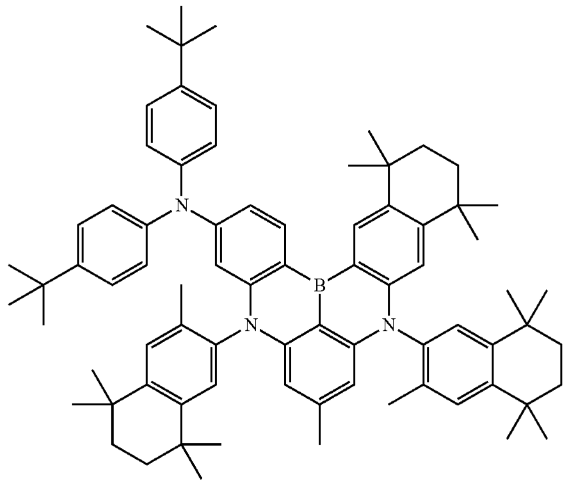
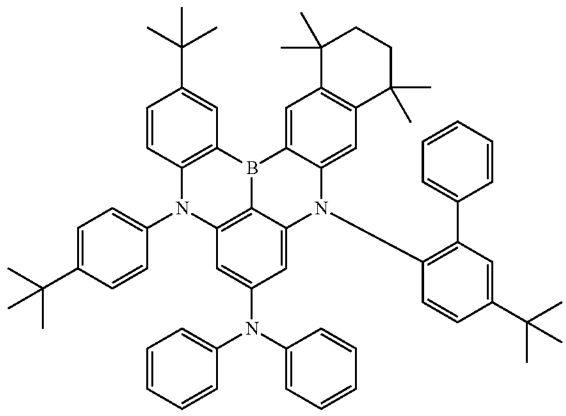
-continued
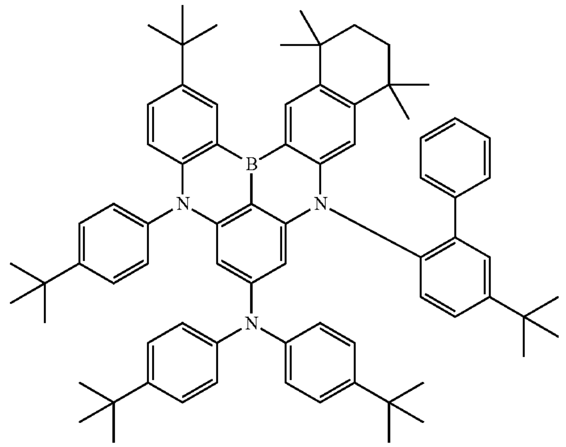
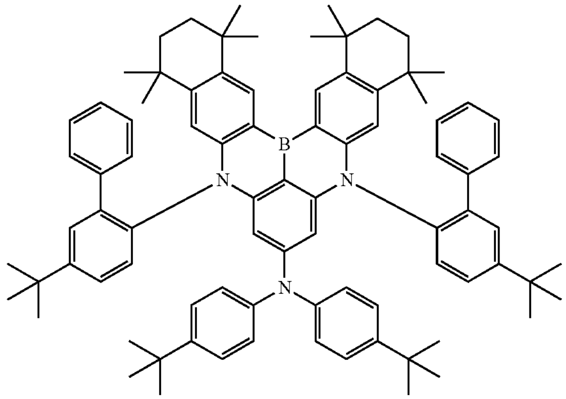
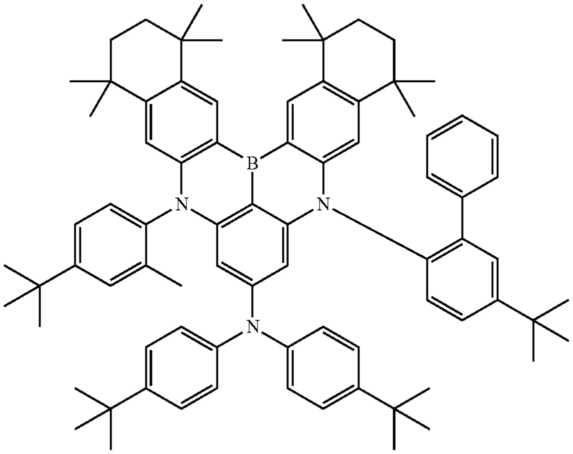

-continued
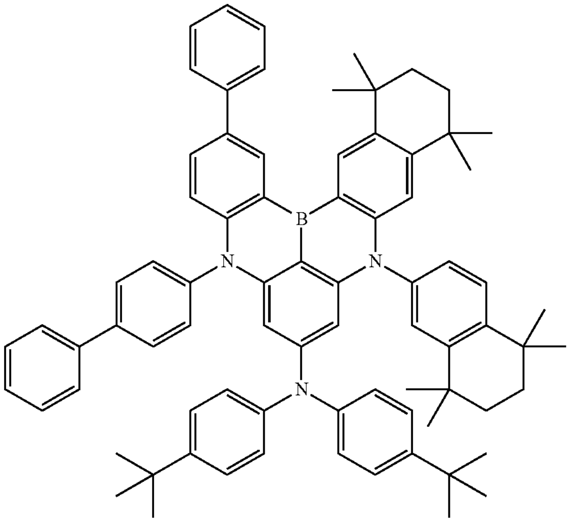
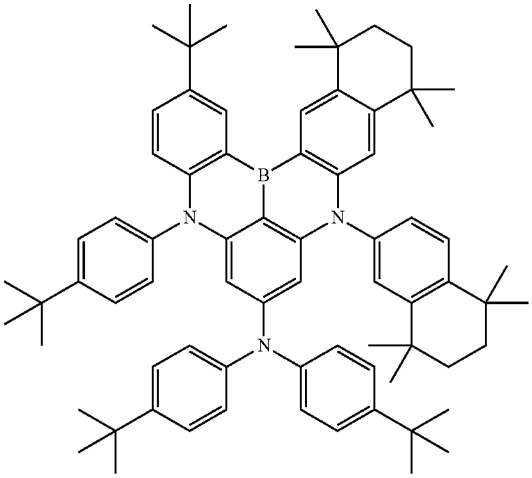
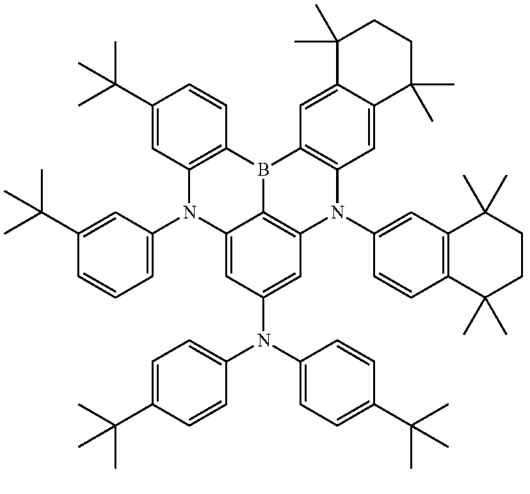
-continued
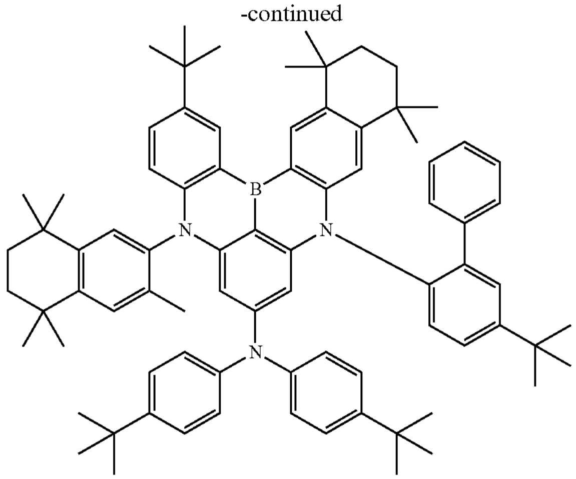
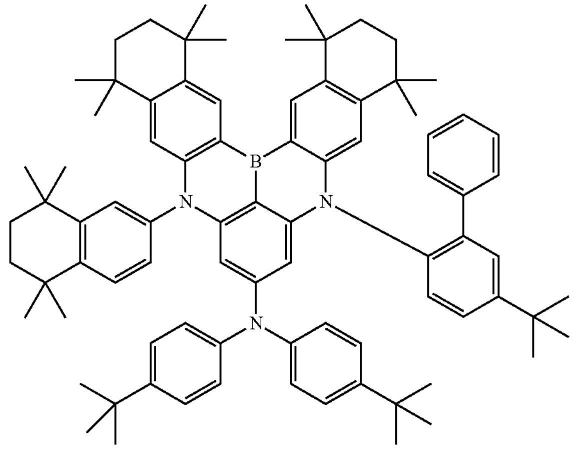
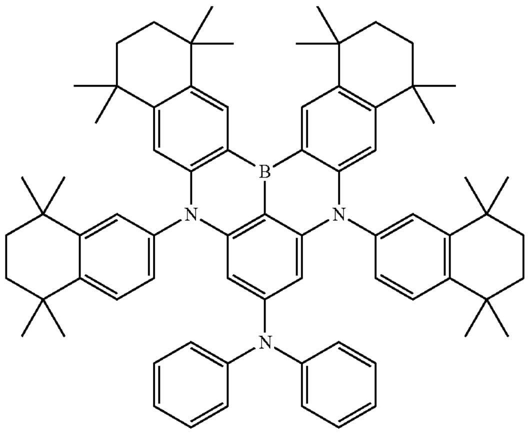

-continued
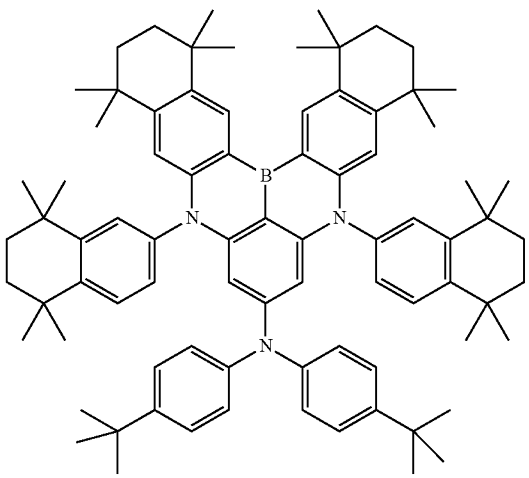
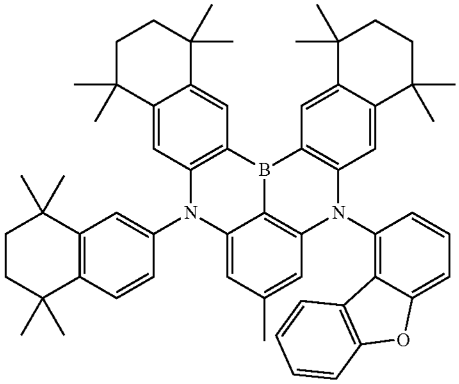
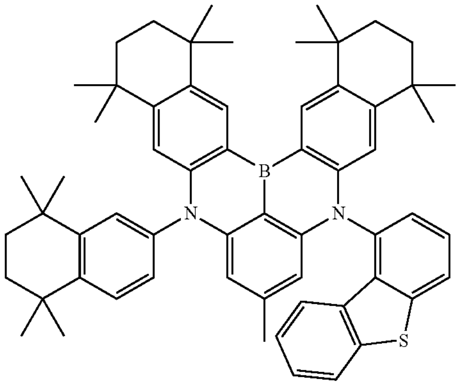
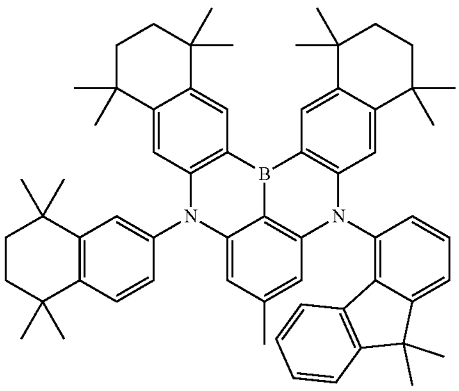
-continued
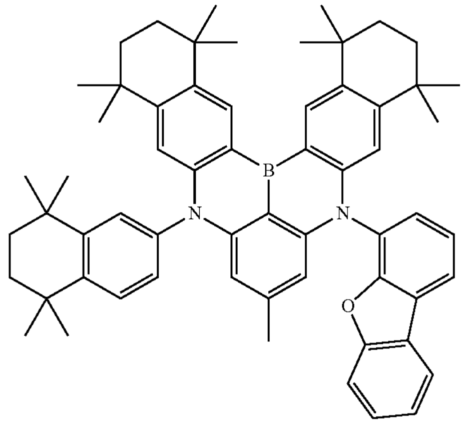
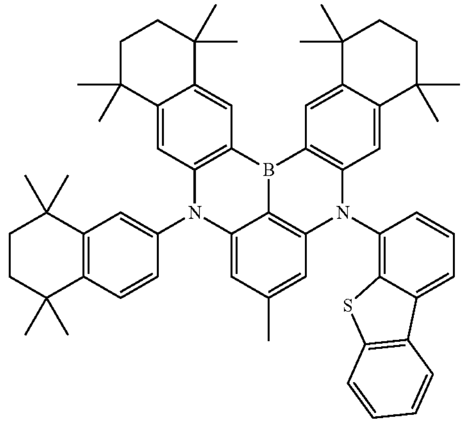
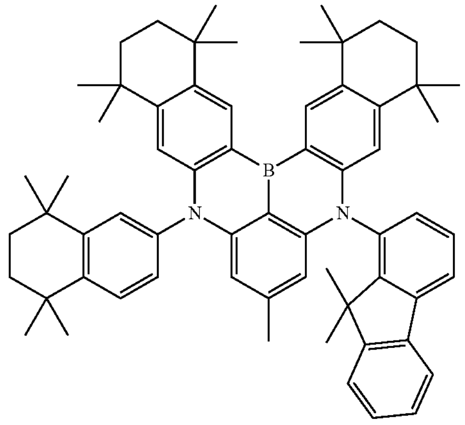
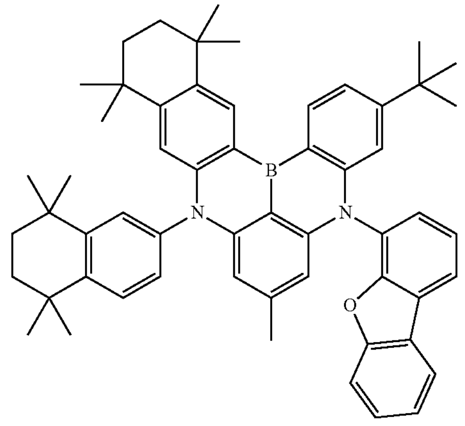

-continued
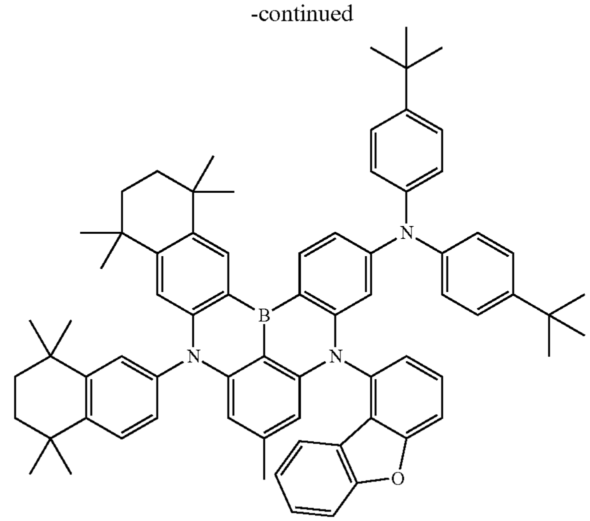
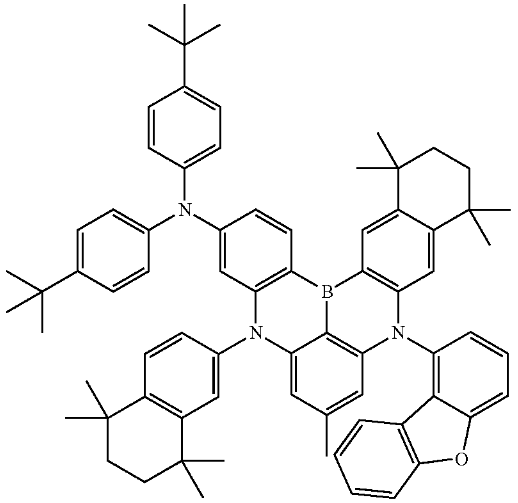
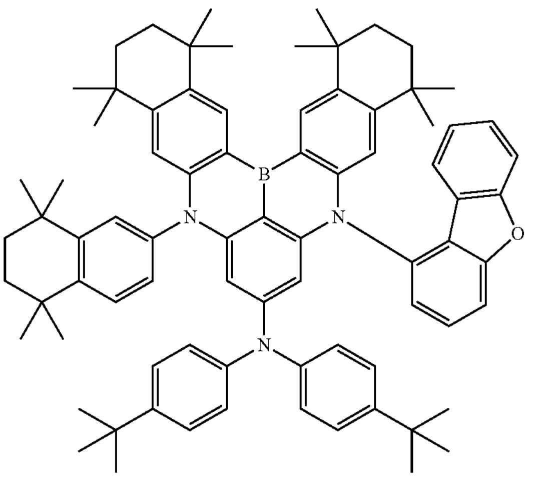
-continued
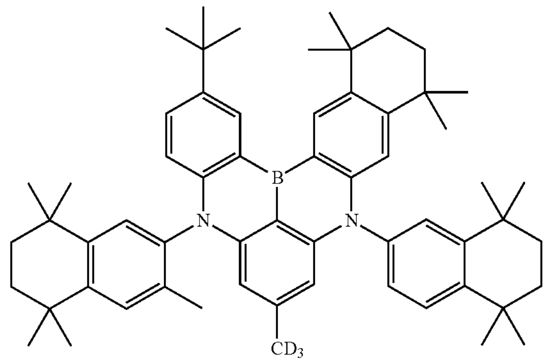
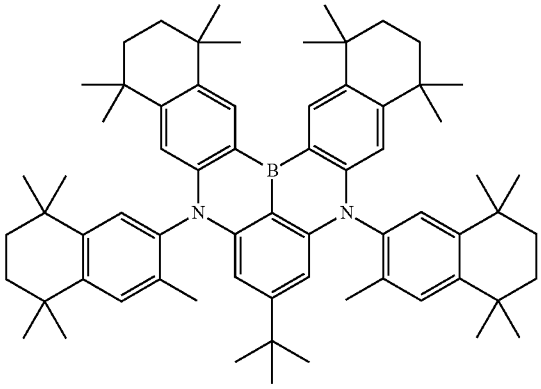
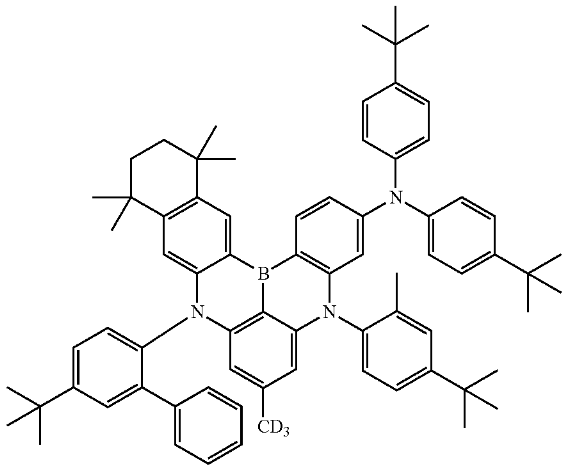
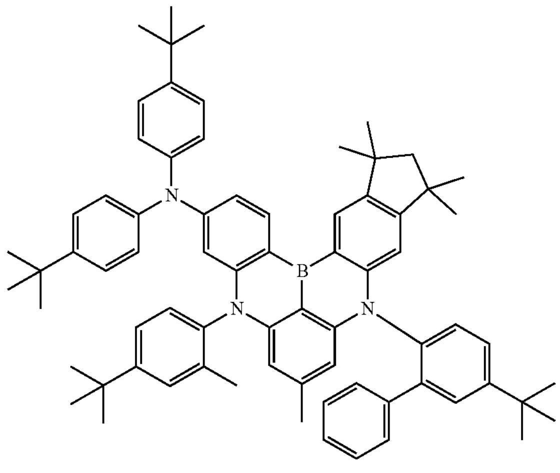

-continued
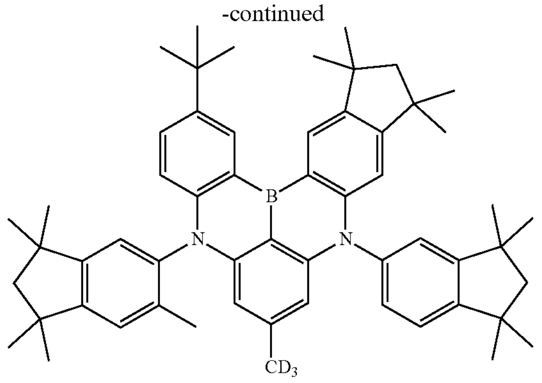
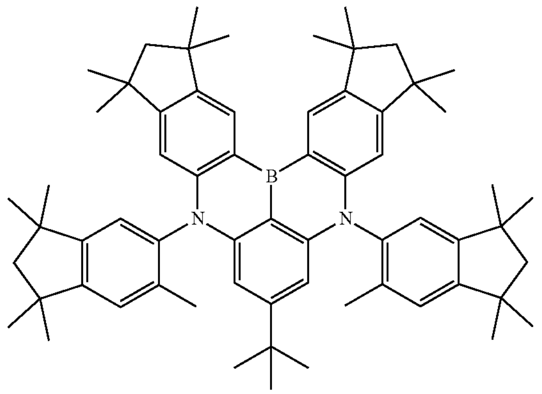
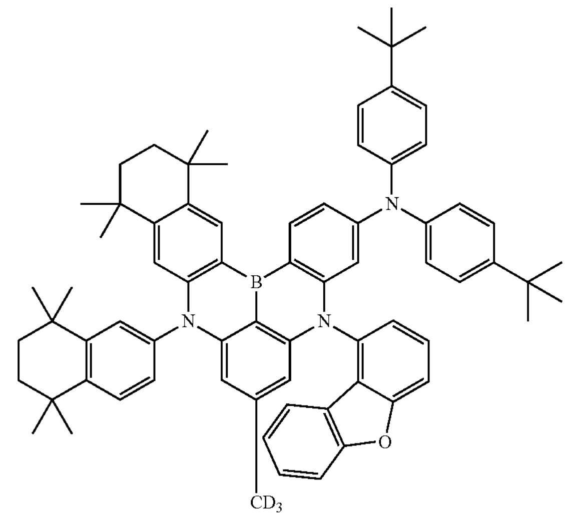
-continued
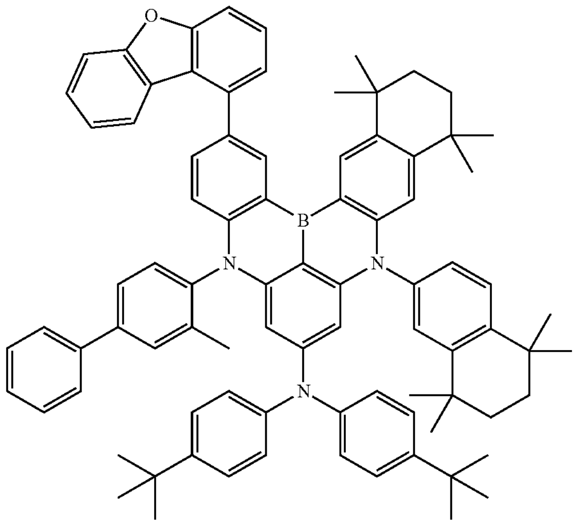
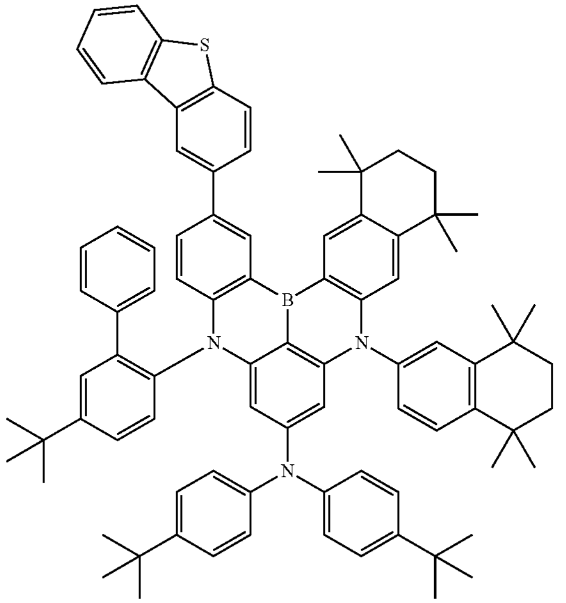
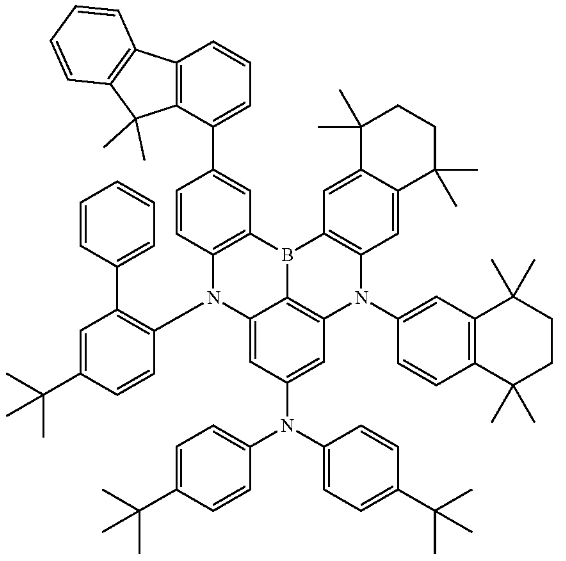

-continued
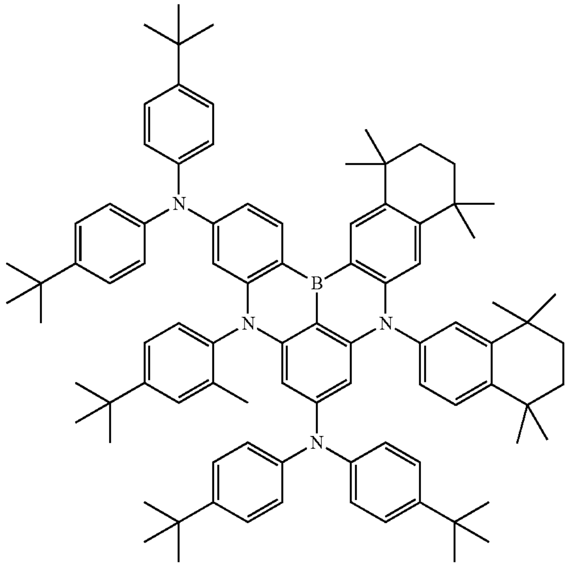
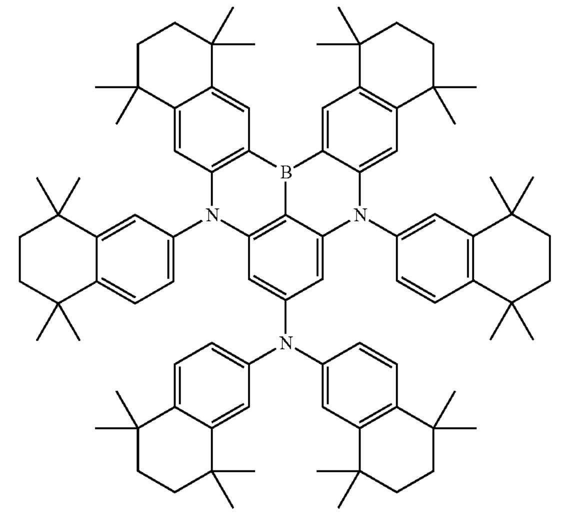
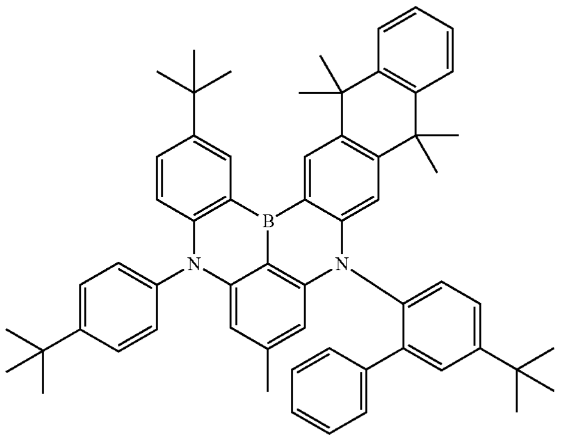
-continued
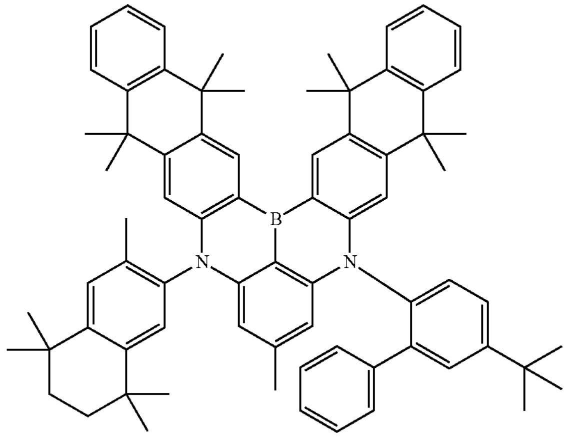
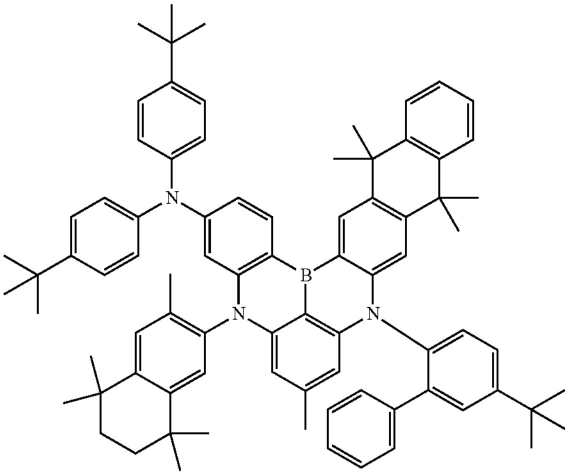
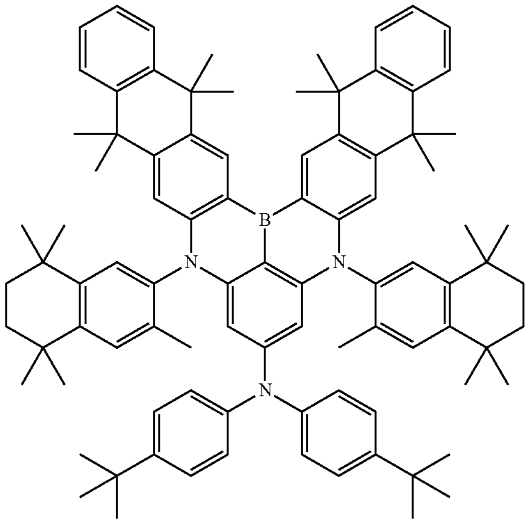

-continued

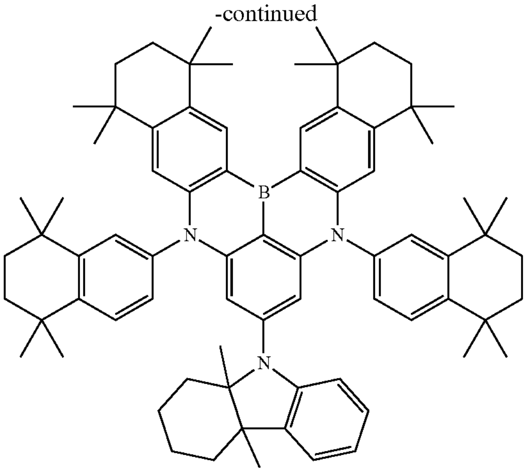

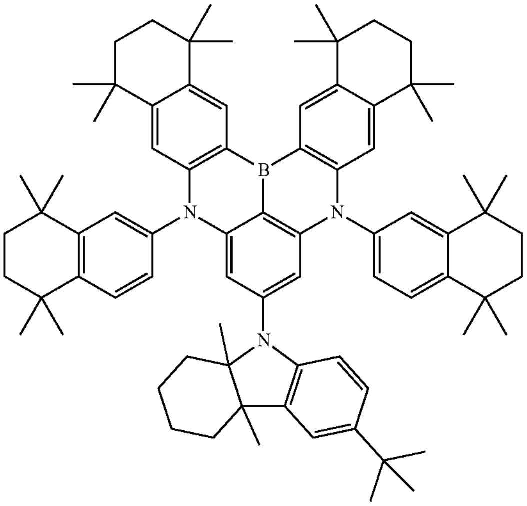

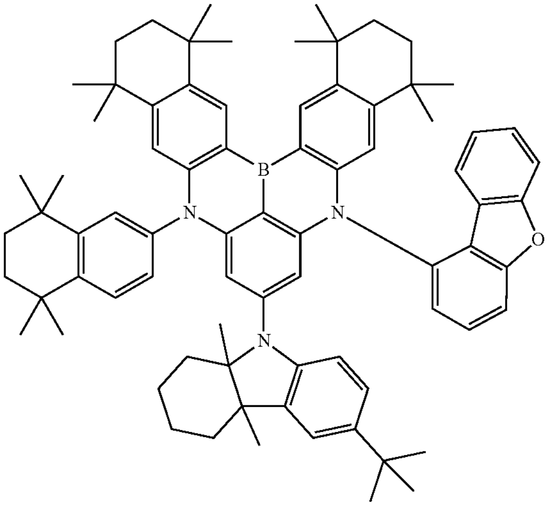

-continued

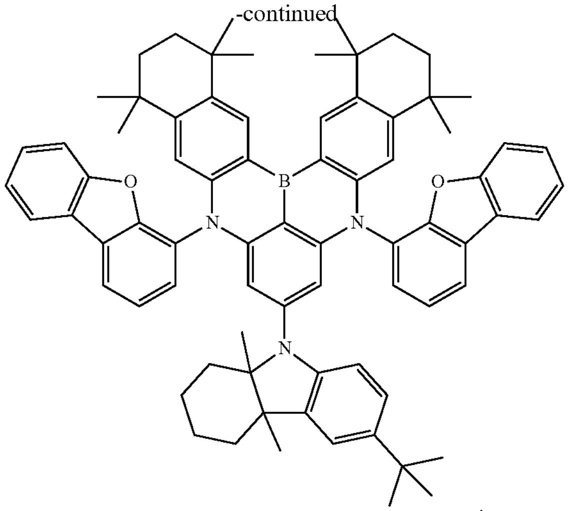

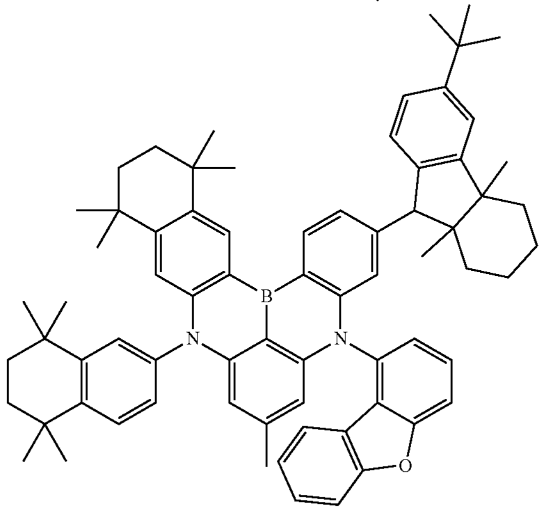

The substituent of the compound of Formula 1 can be bonded by a method known in the art, and the type and position of the substituent or the number of substituents can be changed according to the technology known in the art.

A conjugation length and an energy band gap of the compound are closely associated with each other. Specifically, the longer a conjugation length of a compound is, the smaller an energy bandgap is.

In the present invention, various substituents can be introduced into the core structure as described above to synthesize compounds having various energy bandgaps. Further, in the present invention, various substituents can be introduced into the core structure having the structure described above to adjust the HOMO and LUMO energy levels of a compound.

In addition, various substituents can be introduced into the core structure having the structure described above to synthesize compounds having inherent characteristics of the introduced substituents. For example, a substituent usually used for a hole injection layer material, a material for transporting holes, a light emitting layer material, and an electron transport layer material, which are used for manufacturing an organic light emitting device, can be introduced into the core structure to synthesize a material which satisfies conditions required for each organic material layer.

Furthermore, the organic light emitting device according to the present invention is an organic light emitting device including: a first electrode; a second electrode provided to face the first electrode; and an organic material layer having one or more layers provided between the first electrode and the second electrode, in which one or more layers of the organic material layer include the above-described compound.

The organic light emitting device of the present invention can be manufactured using typical manufacturing methods and materials of an organic light emitting device, except that the above-described compound is used to form an organic material layer having one or more layers.

The compound can be formed as an organic material layer by not only a vacuum deposition method, but also a solution application method when an organic light emitting device is manufactured. Here, the solution application method means spin coating, dip coating, inkjet printing, screen printing, a spray method, roll coating, and the like, but is not limited thereto.

The organic material layer of the organic light emitting device of the present invention can be composed of a single-layered structure, but can be composed of a multi-layered structure in which two or more organic material layers are stacked. For example, the organic light emitting device of the present invention can have a structure including a hole injection layer, a hole transport layer, a layer which injects and transports holes simultaneously, a light emitting layer, an electron transport layer, an electron injection layer, and the like as organic material layers. However, the structure of the organic light emitting device is not limited thereto, and can include a fewer or greater number of organic material layers.

In the organic light emitting device of the present invention, the organic material layer can include one or more layers of an electron transport layer, an electron injection layer, and a layer which injects and transports electrons simultaneously, and one or more layers of the layers can include the compound of Formula 1.

In another organic light emitting device, the organic material layer can include an electron transport layer or an electron injection layer, and the electron transport layer or the electron injection layer can include the compound of Formula 1.

In the organic light emitting device of the present invention, the organic material layer can include one or more layers of a hole injection layer, a hole transport layer, and a layer which injects and transports holes simultaneously, and one or more layers of the layers can include the compound of Formula 1.

In still another organic light emitting device, the organic material layer can include a hole injection layer or a hole transport layer, and the hole transport layer or the hole injection layer can include the compound of Formula 1.

In another exemplary embodiment, the organic material layer includes a light emitting layer, and the light emitting layer includes the compound of Formula 1. As an example, the compound of Formula 1 can be included as a dopant of the light emitting layer.

In an exemplary embodiment of the present specification, the organic light emitting device is a green organic light emitting device in which the light emitting layer includes the compound of Formula 1 as a dopant.

According to an exemplary embodiment of the present specification, the organic light emitting device is a red organic light emitting device in which the light emitting layer includes the compound of Formula 1 as a dopant.

In another exemplary embodiment, the organic light emitting device is a blue organic light emitting device in which the light emitting layer includes the compound of Formula 1 as a dopant.

As another example, the organic material layer including the compound of Formula 1 can include the compound of Formula 1 as a dopant, and can include an organic compound such as an anthracene-based compound as a host.

As still another example, the organic material layer including the heterocyclic compound of Formula 1 can include the compound of Formula 1 as a dopant, and can include a fluorescent host or a phosphorescent host.

In still another exemplary embodiment, the organic material layer including the heterocyclic compound of Formula 1 can include the compound of Formula 1 as a dopant, include a fluorescent host or a phosphorescent host, and include another organic compound, a metal or a metal compound as a dopant.

As yet another example, the organic material layer including the compound of Formula 1 can include the compound of Formula 1 as a dopant and include a fluorescent host or a phosphorescent host, and can be used with an iridium (Ir)-based dopant.

According to an exemplary embodiment of the present specification, the organic material layer includes a light emitting layer, and the light emitting layer includes the above-described polycyclic compound as a dopant of the light emitting layer, and includes a compound of Formula H as a host of the light emitting layer:

Formula H

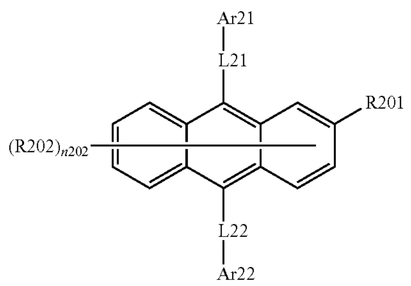

wherein in Formula H:

L21 and L22 are the same as or different from each other, and are each independently a direct bond, a substituted or unsubstituted arylene group, or a substituted or unsubstituted heteroarylene group;

Ar21 and Ar22 are the same as or different from each other, and are each independently a substituted or unsubstituted aryl group or a substituted or unsubstituted heterocyclic group;

R201 and R202 are the same as or different from each other, and are each independently hydrogen, deuterium, a halogen group, a substituted or unsubstituted alkyl group, a substituted or unsubstituted cycloalkyl group, a substituted or unsubstituted aryl group, or a substituted or unsubstituted heterocyclic group; and n202 is an integer from 0 to 7, and when n202 is 2 or higher, R202s are the same as or different from each other.

In an exemplary embodiment of the present specification, L21 and L22 are the same as or different from each other, and are each independently a direct bond, a monocyclic or polycyclic arylene group having 6 to 30 carbon atoms, or a monocyclic or polycyclic heteroarylene group having 2 to 30 carbon atoms.

In an exemplary embodiment of the present specification, L21 and L22 are the same as or different from each other, and are each independently a direct bond, a monocyclic or polycyclic arylene group having 6 to 20 carbon atoms, or a monocyclic or polycyclic heteroarylene group having 2 to 20 carbon atoms.

In an exemplary embodiment of the present specification, L21 and L22 are the same as or different from each other, and are each independently a direct bond; a phenylene group which is unsubstituted or substituted with deuterium; a biphenylylene group which is unsubstituted or substituted with deuterium; a naphthalene group which is unsubstituted or substituted with deuterium; a divalent dibenzofuran group; or a divalent dibenzothiophene group.

In an exemplary embodiment of the present specification, Ar21 and Ar22 are the same as or different from each other, and are each independently a substituted or unsubstituted monocyclic or polycyclic aryl group having 6 to 30 carbon atoms, or a substituted or unsubstituted monocyclic or polycyclic heterocyclic group having 2 to 30 carbon atoms.

In an exemplary embodiment of the present specification, Ar2l and Ar22 are the same as or different from each other, and are each independently a substituted or unsubstituted monocyclic or polycyclic aryl group having 6 to 20 carbon atoms, or a substituted or unsubstituted monocyclic or polycyclic heterocyclic group having 2 to 20 carbon atoms.

In an exemplary embodiment of the present specification, Ar2l and Ar22 are the same as or different from each other, and are each independently a substituted or unsubstituted monocyclic to tetracyclic aryl group having 6 to 20 carbon atoms, or a substituted or unsubstituted monocyclic to tetracyclic heterocyclic group having 6 to 20 carbon atoms.

In an exemplary embodiment of the present specification, Ar2l and Ar22 are the same as or different from each other, and are each independently a substituted or unsubstituted phenyl group, a substituted or unsubstituted biphenyl group, a substituted or unsubstituted terphenyl group, a substituted or unsubstituted naphthyl group, a substituted or unsubstituted anthracene group, a substituted or unsubstituted phenanthrene group, a substituted or unsubstituted phenalene group, a substituted or unsubstituted fluorene group, a substituted or unsubstituted benzofluorene group, a substituted or unsubstituted furan group, a substituted or unsubstituted thiophene group, a substituted or unsubstituted dibenzofuran group, a substituted or unsubstituted naphthobenzofuran group, a substituted or unsubstituted dibenzothiophene group, or a substituted or unsubstituted naphthobenzothiophene group.

In an exemplary embodiment of the present specification, Ar2l and Ar22 are the same as or different from each other, and are each independently a phenyl group which is unsubstituted or substituted with deuterium or a monocyclic or polycyclic aryl group having 6 to 20 carbon atoms; a biphenyl group which is unsubstituted or substituted with deuterium or a monocyclic or polycyclic aryl group having 6 to 20 carbon atoms; a naphthyl group which is unsubstituted or substituted with a monocyclic or polycyclic aryl group having 6 to 20 carbon atoms; a dibenzofuran group which is unsubstituted or substituted with a monocyclic or polycyclic aryl group having 6 to 20 carbon atoms; a naphthobenzofuran group which is unsubstituted or substituted with a monocyclic or polycyclic aryl group having 6 to 20 carbon atoms; a dibenzothiophene group which is unsubstituted or substituted with a monocyclic or polycyclic aryl group having 6 to 20 carbon atoms; or a naphthobenzothiophene group which is unsubstituted or substituted with a monocyclic or polycyclic aryl group having 6 to 20 carbon atoms.

In an exemplary embodiment of the present specification, Ar21 and Ar22 are the same as or different from each other, and are each independently a phenyl group which is unsubstituted or substituted with deuterium; a biphenyl group which is unsubstituted or substituted with deuterium; a terphenyl group; a naphthyl group which is unsubstituted or substituted with deuterium; a phenanthrene group; a dibenzofuran group; a naphthobenzofuran group; a dibenzothiophene group; or a naphthobenzothiophene group.

In an exemplary embodiment of the present specification, any one of Ar21 and Ar22 is a substituted or unsubstituted aryl group, and the other is a substituted or unsubstituted heterocyclic group.

In an exemplary embodiment of the present specification, Ar21 is a substituted or unsubstituted aryl group, and Ar22 is a substituted or unsubstituted heterocyclic group.

In an exemplary embodiment of the present specification, Ar21 is a substituted or unsubstituted heterocyclic group, and Ar22 is a substituted or unsubstituted aryl group.

In an exemplary embodiment of the present specification, R201 is hydrogen, deuterium, a halogen group, a substituted or unsubstituted straight-chained or branched alkyl group having 1 to 30 carbon atoms, a substituted or unsubstituted monocyclic or polycyclic cycloalkyl group having 3 to 30 carbon atoms, a substituted or unsubstituted monocyclic or polycyclic aryl group having 6 to 30 carbon atoms, or a substituted or unsubstituted monocyclic or polycyclic heterocyclic group having 2 to 30 carbon atoms.

In an exemplary embodiment of the present specification, R201 is hydrogen, deuterium, fluorine, a substituted or unsubstituted straight-chained or branched alkyl group having 1 to 10 carbon atoms, a substituted or unsubstituted monocyclic or polycyclic cycloalkyl group having 3 to 10 carbon atoms, a substituted or unsubstituted monocyclic or polycyclic aryl group having 6 to 30 carbon atoms, or a substituted or unsubstituted monocyclic or polycyclic heterocyclic group having 2 to 30 carbon atoms.

In an exemplary embodiment of the present specification, R201 is hydrogen, a substituted or unsubstituted monocyclic or polycyclic aryl group having 6 to 30 carbon atoms, or a substituted or unsubstituted monocyclic or polycyclic heterocyclic group having 2 to 30 carbon atoms.

In an exemplary embodiment of the present specification, R201 is hydrogen, a substituted or unsubstituted monocyclic or polycyclic aryl group having 6 to 20 carbon atoms, or a substituted or unsubstituted monocyclic or polycyclic heterocyclic group having 2 to 20 carbon atoms.

In an exemplary embodiment of the present specification, R201 is hydrogen, a substituted or unsubstituted monocyclic to tetracyclic aryl group having 6 to 20 carbon atoms, or a substituted or unsubstituted monocyclic to tetracyclic heterocyclic group having 6 to 20 carbon atoms.

In an exemplary embodiment of the present specification, R201 is hydrogen, a substituted or unsubstituted phenyl group, a substituted or unsubstituted biphenyl group, a substituted or unsubstituted terphenyl group, a substituted or unsubstituted naphthyl group, a substituted or unsubstituted anthracene group, a substituted or unsubstituted phenanthrene group, a substituted or unsubstituted phenalene group, a substituted or unsubstituted fluorene group, a substituted or unsubstituted benzofluorene group, a substituted or unsubstituted furan group, a substituted or unsubstituted thiophene group, a substituted or unsubstituted dibenzofuran group, a substituted or unsubstituted naphthobenzofuran group, a substituted or unsubstituted dibenzothiophene group, or a substituted or unsubstituted naphthobenzothiophene group.

In an exemplary embodiment of the present specification, R201 is hydrogen; deuterium; a phenyl group which is unsubstituted or substituted with deuterium or a monocyclic or polycyclic aryl group having 6 to 20 carbon atoms; a biphenyl group which is unsubstituted or substituted with a monocyclic or polycyclic aryl group having 6 to 20 carbon atoms; a naphthyl group which is unsubstituted or substituted with deuterium or a monocyclic or polycyclic aryl group having 6 to 20 carbon atoms; a dibenzofuran group which is unsubstituted or substituted with a monocyclic or polycyclic aryl group having 6 to 20 carbon atoms; a naphthobenzofuran group which is unsubstituted or substituted with a monocyclic or polycyclic aryl group having 6 to 20 carbon atoms; a dibenzothiophene group which is unsubstituted or substituted with a monocyclic or polycyclic aryl group having 6 to 20 carbon atoms; or a naphthobenzothiophene group which is unsubstituted or substituted with a monocyclic or polycyclic aryl group having 6 to 20 carbon atoms.

In an exemplary embodiment of the present specification, R201 is hydrogen; deuterium; a phenyl group which is unsubstituted or substituted with deuterium, a phenyl group, or a naphthyl group; a biphenyl group; a naphthyl group which is unsubstituted or substituted with deuterium, a phenyl group, or a naphthyl group; a dibenzofuran group; a naphthobenzofuran group; a dibenzothiophene group; or a naphthobenzothiophene group.

According to an exemplary embodiment of the present specification, R202 is hydrogen or deuterium.

According to an exemplary embodiment of the present specification, four or more of R202s are deuterium.

According to an exemplary embodiment of the present specification, R202 is hydrogen.

According to an exemplary embodiment of the present specification, R202 is deuterium.

In an exemplary embodiment of the present specification, when the compound of Formula H is substituted with deuterium, 30% or more of H at a substitutable position is substituted with deuterium. In another exemplary embodiment, in the structure of Formula H, 40% or more of H at a substitutable position is substituted with deuterium. In still another exemplary embodiment, in the structure of Formula H, 60% or more of H at a substitutable position is substituted with deuterium.

In yet another exemplary embodiment, in the structure of Formula H, 80% or more of H at a substitutable position is substituted with deuterium. In still yet another exemplary embodiment, in the structure of Formula H, 100% of H at a substitutable position is substituted with deuterium.

In an exemplary embodiment of the present specification, the compound of Formula H is any one compound selected from among the following compounds:

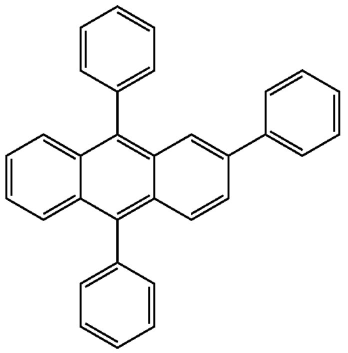

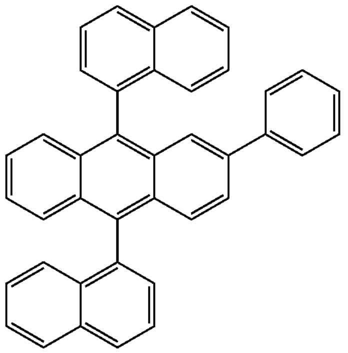

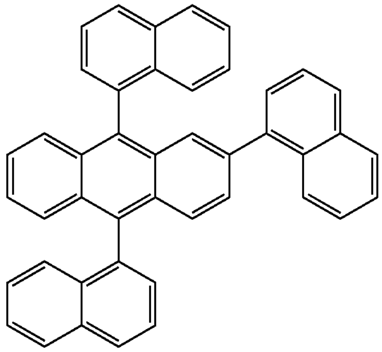

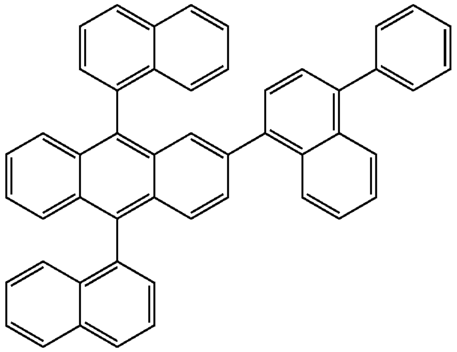

-continued
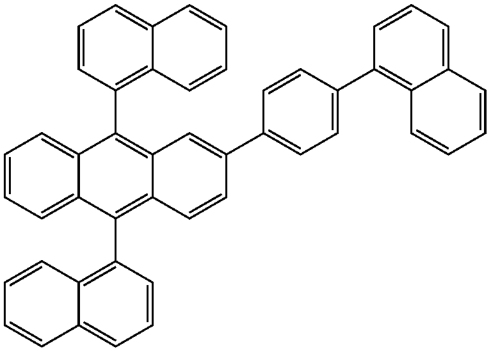
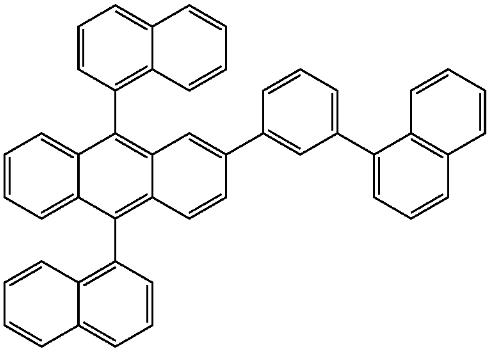
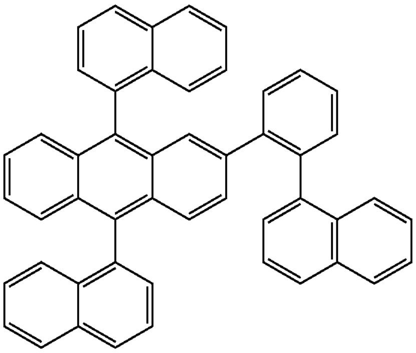
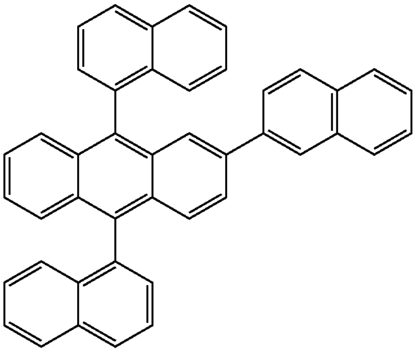
-continued
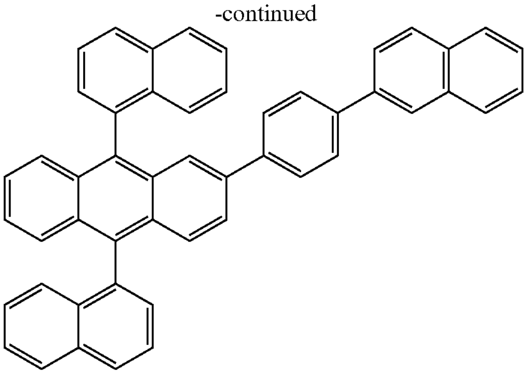
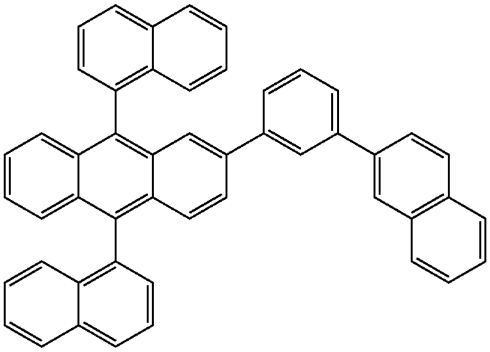
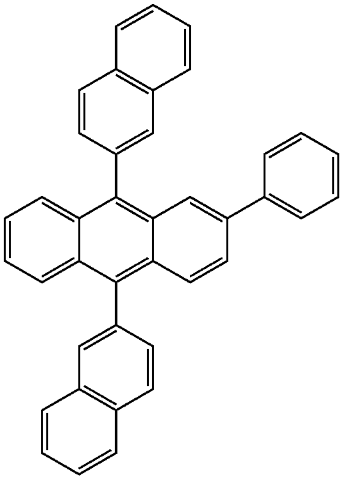
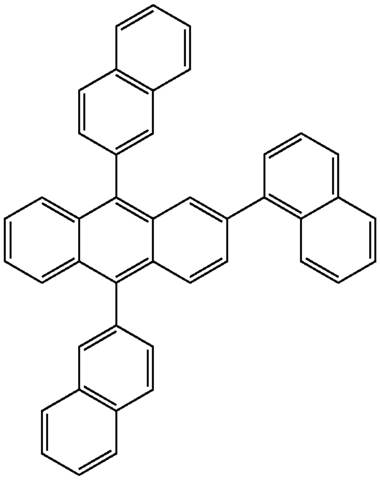

-continued
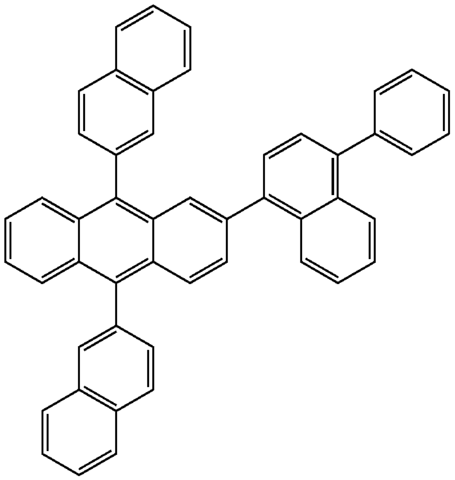
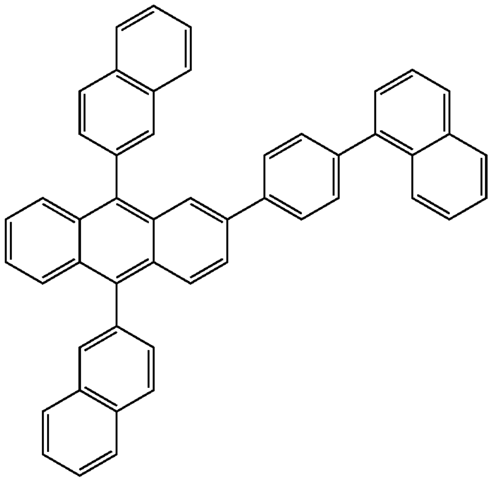
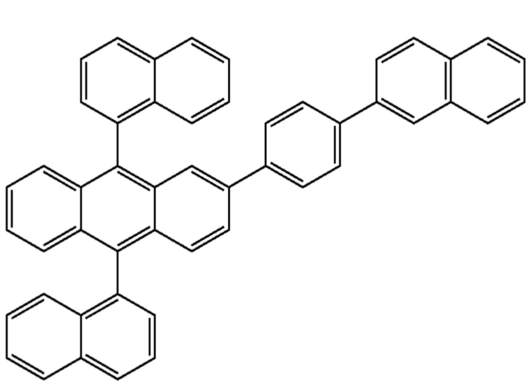
-continued
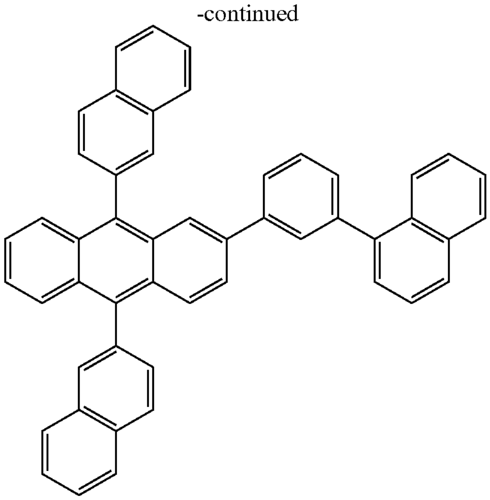
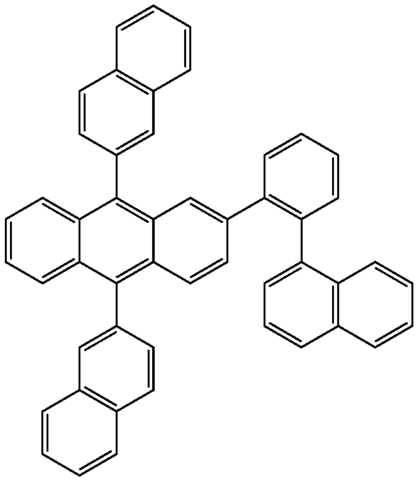
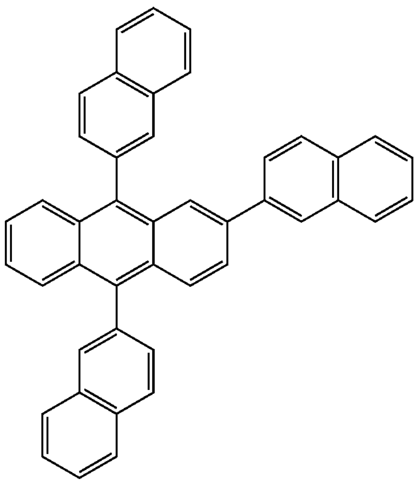

-continued
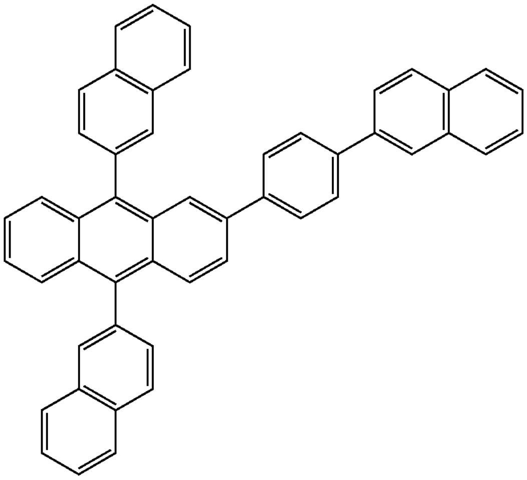
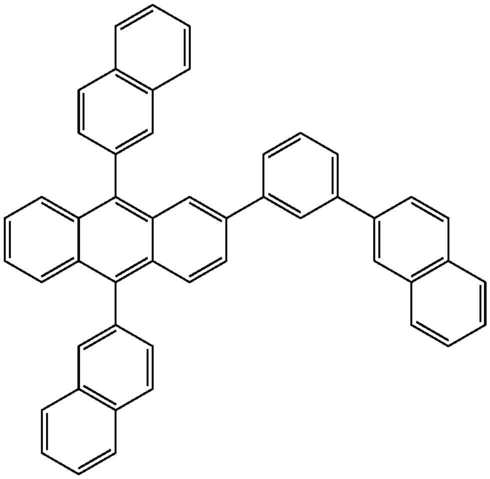
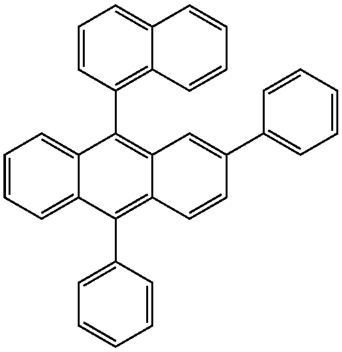
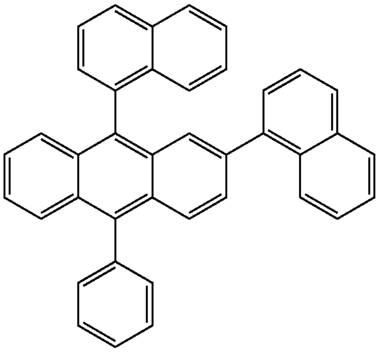
-continued
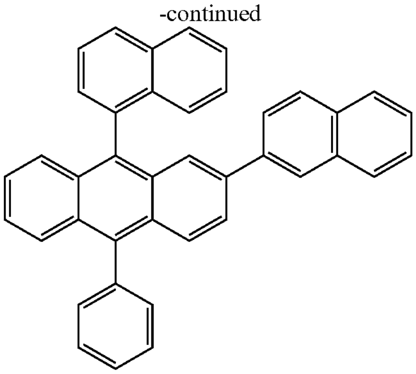
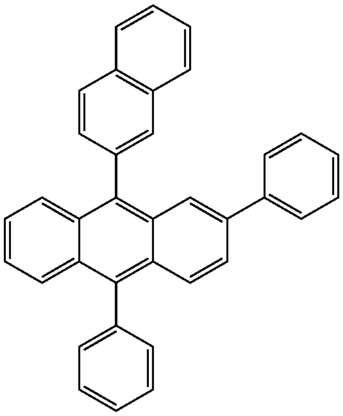
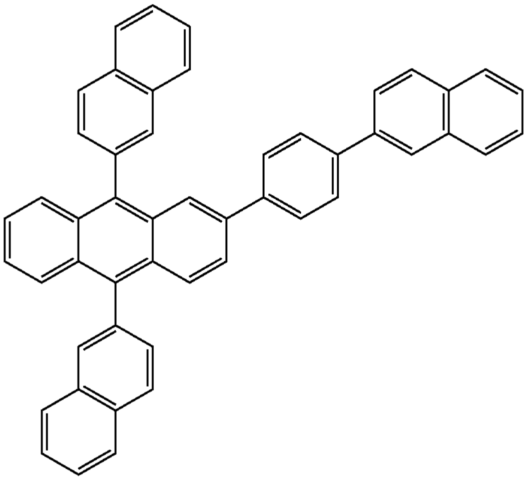
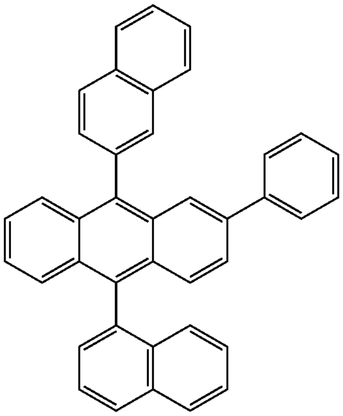

-continued
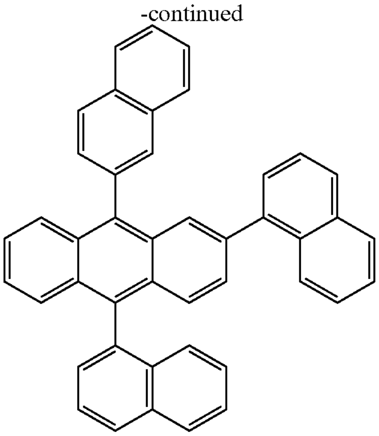
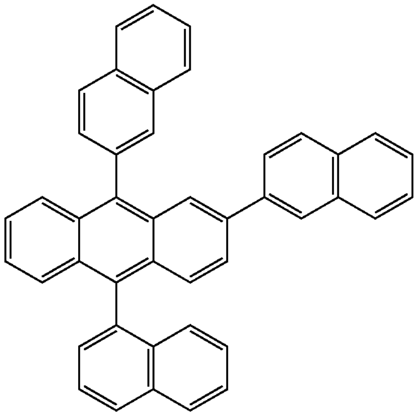
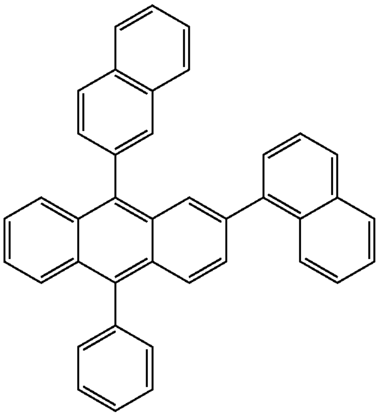
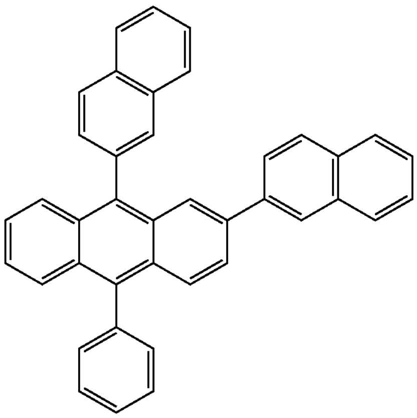
-continued
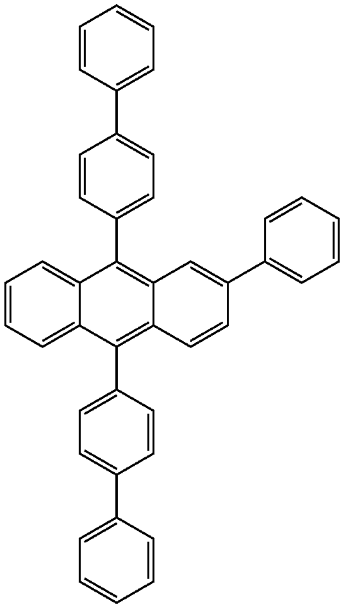
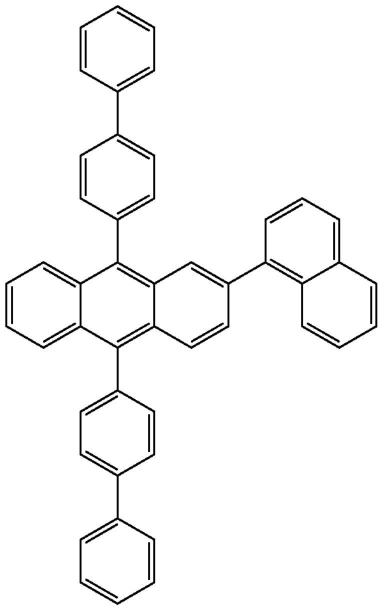
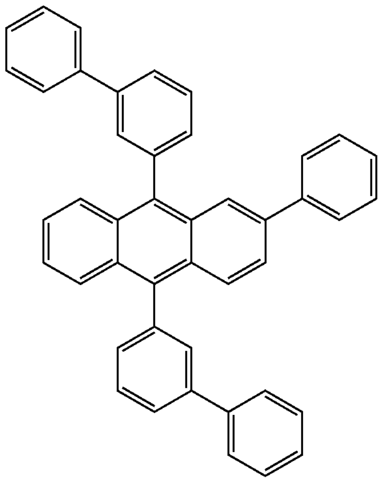

-continued
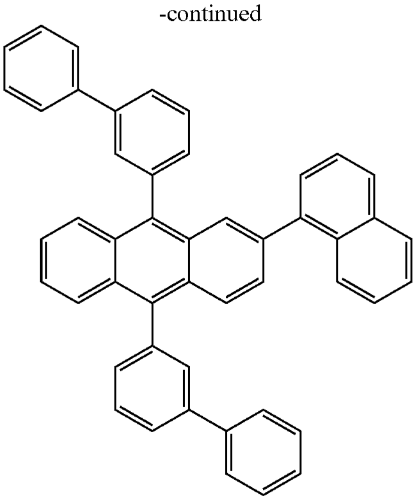
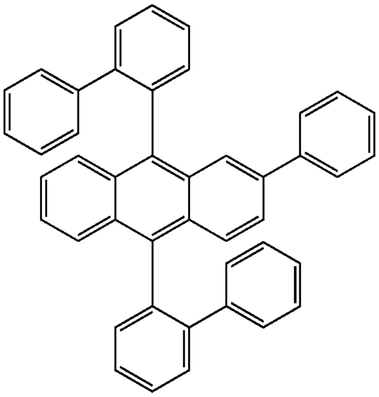
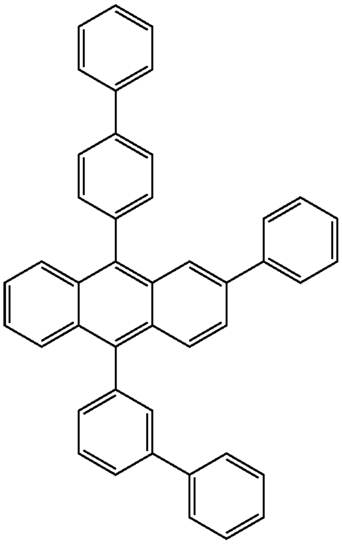
-continued
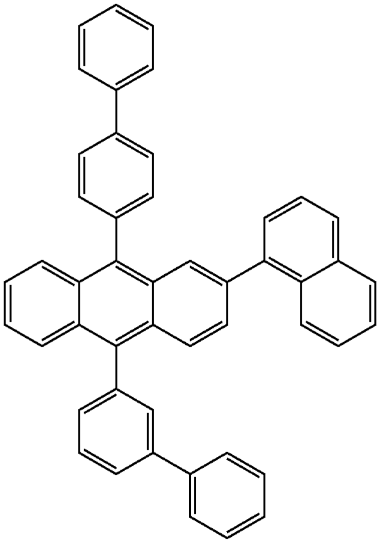
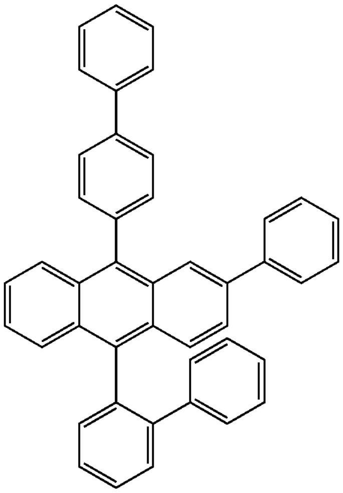
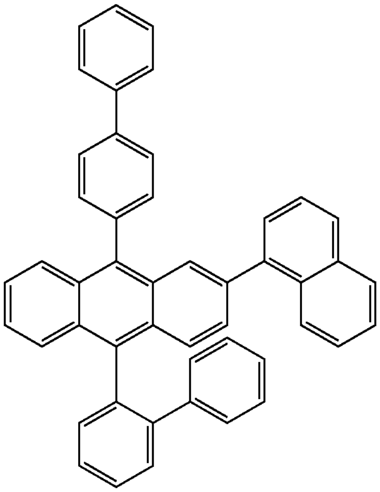

-continued
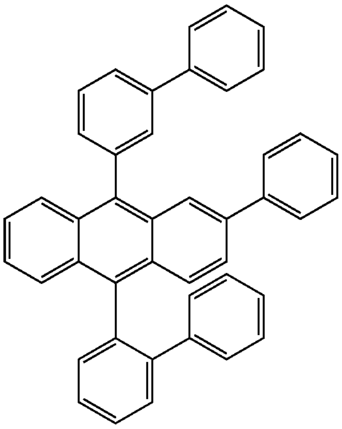
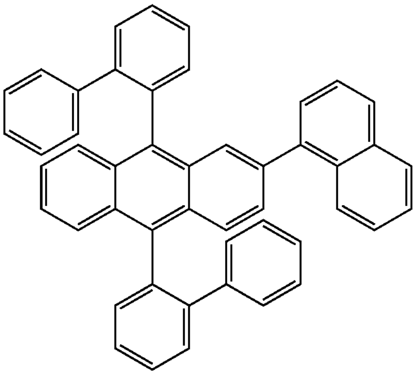
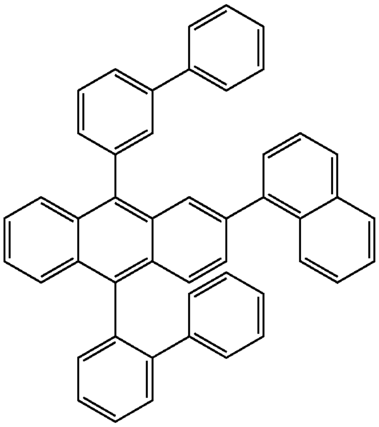
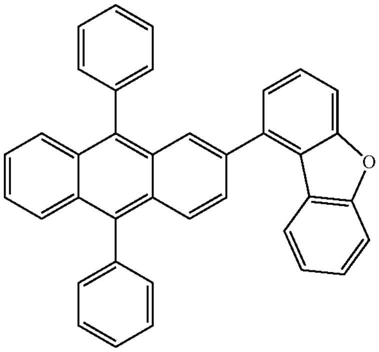
-continued
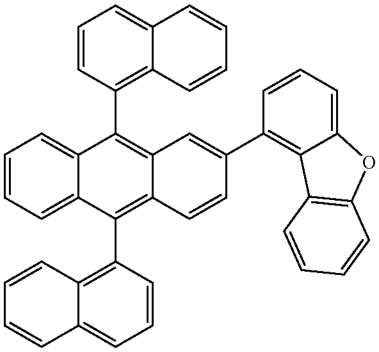
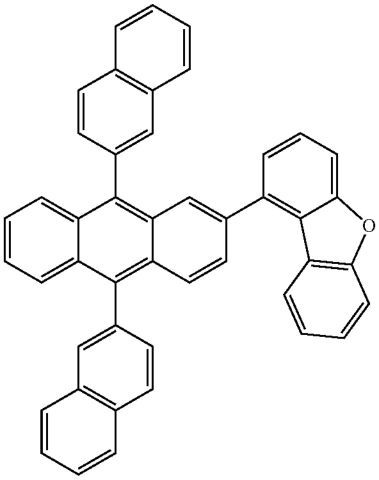
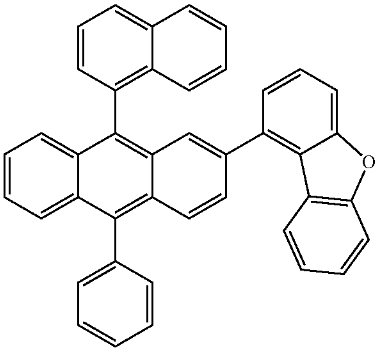
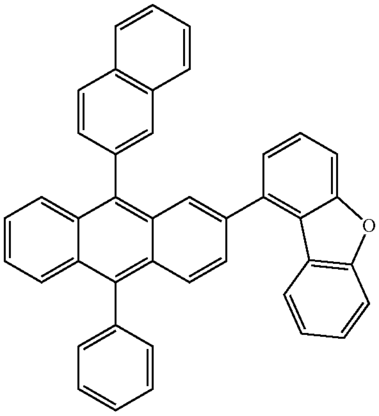

-continued
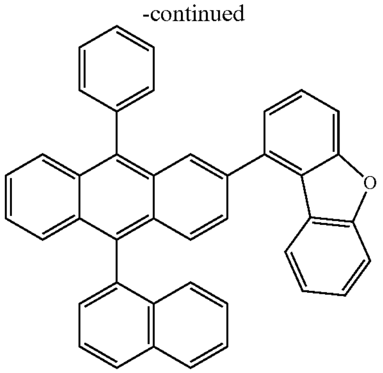
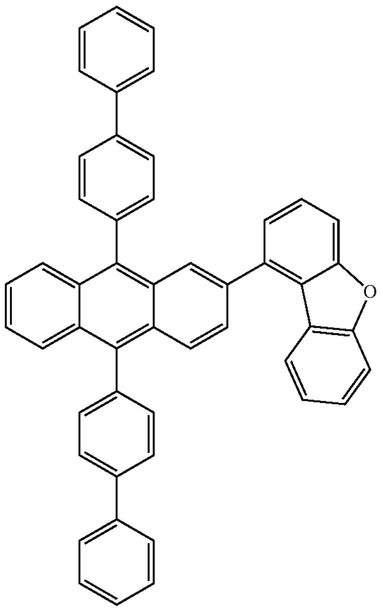
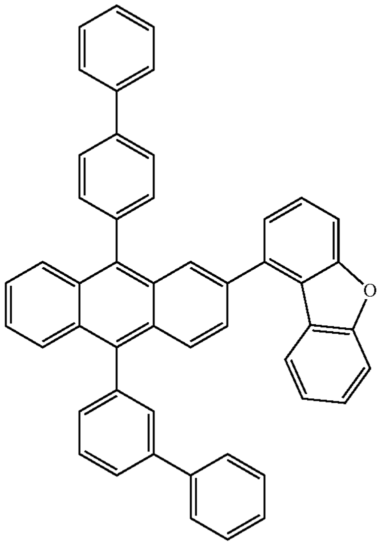
-continued
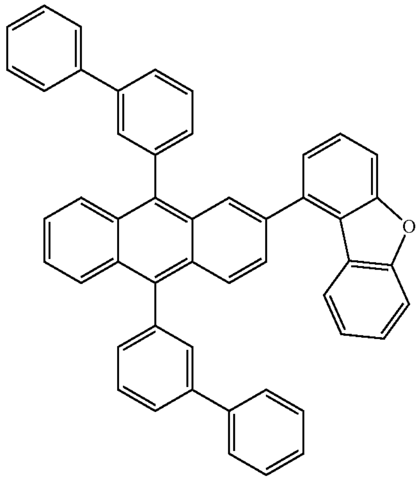
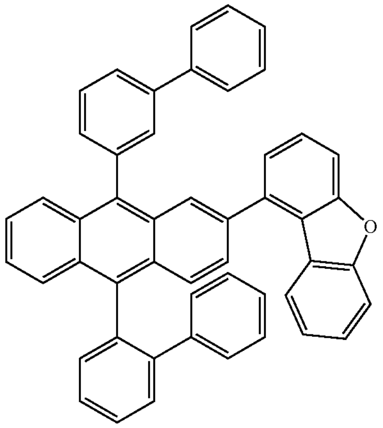
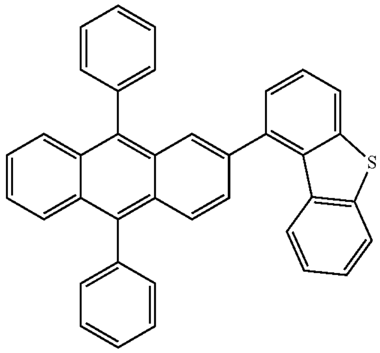
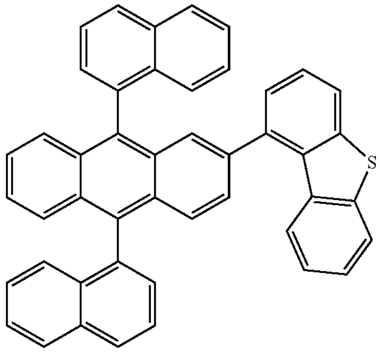

-continued
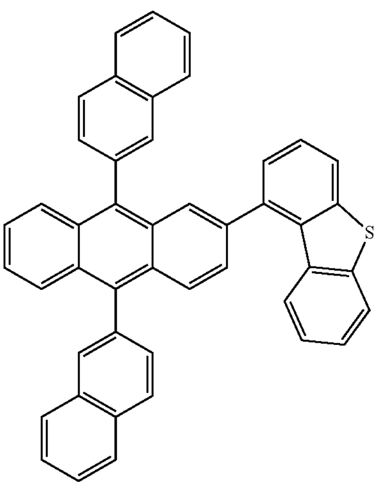
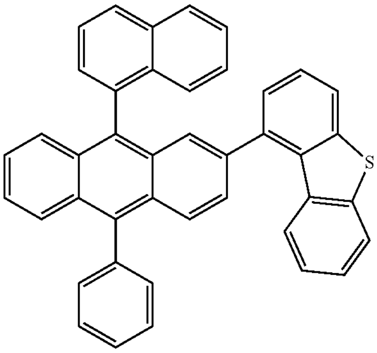
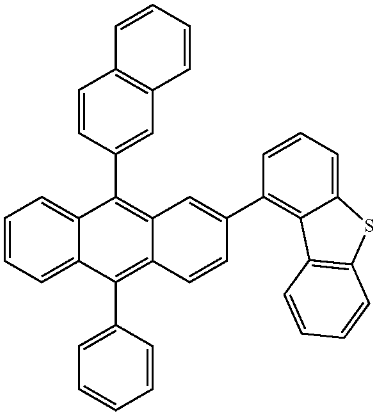
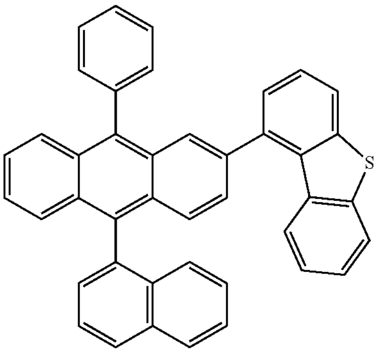
-continued
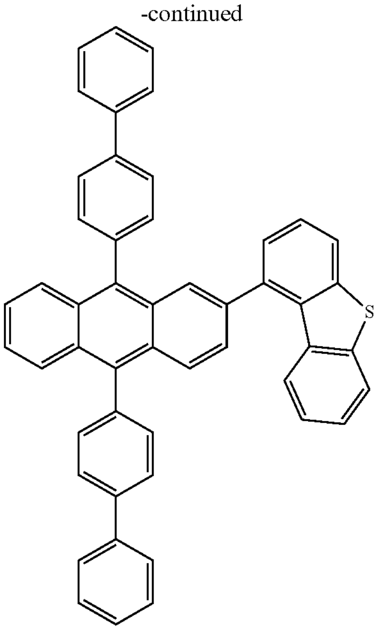
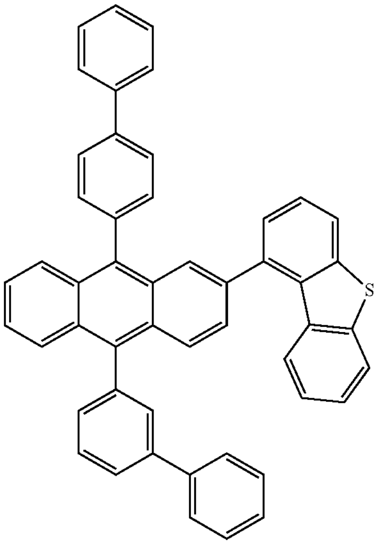
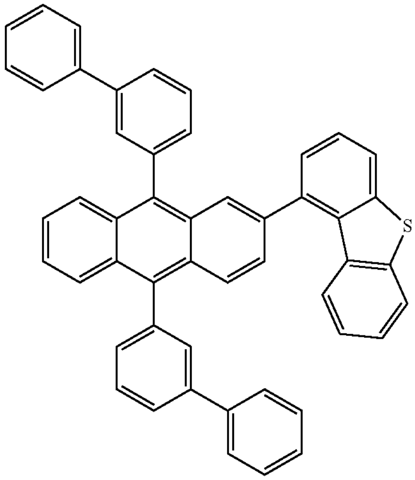

-continued
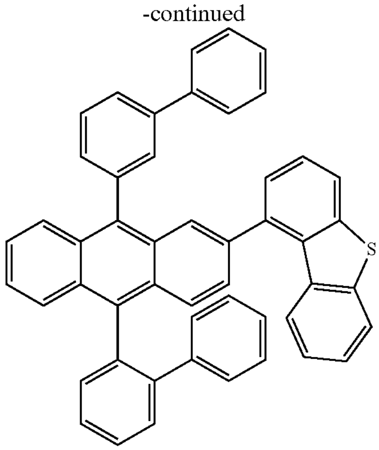
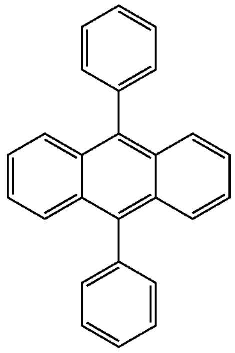
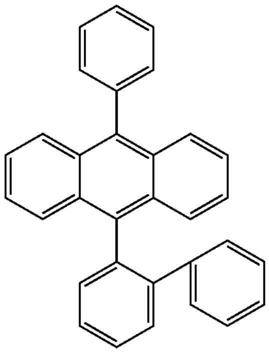
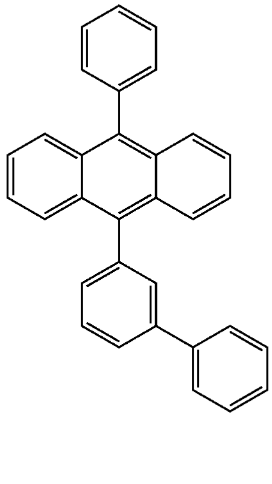
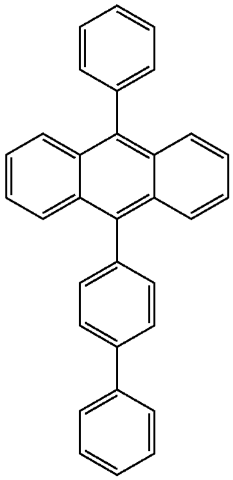
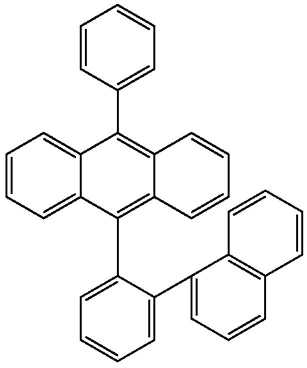
-continued
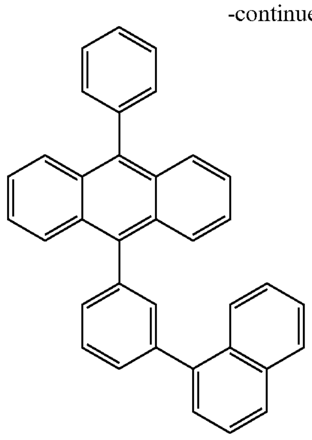
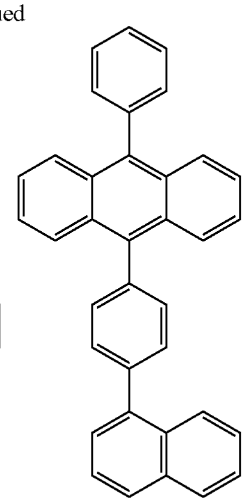
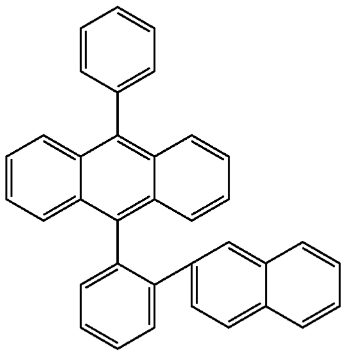
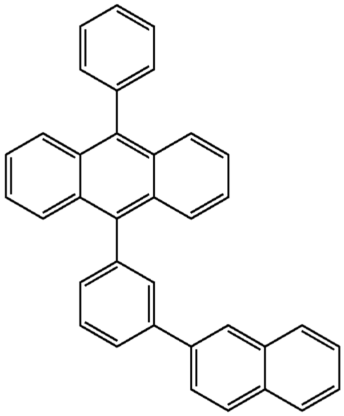
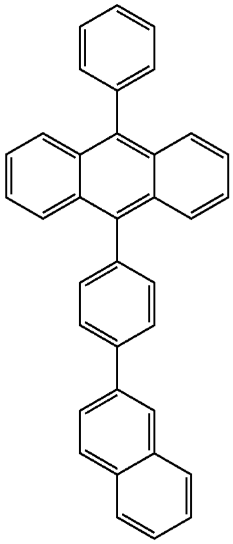
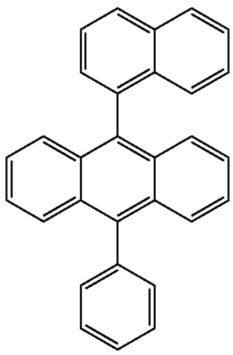
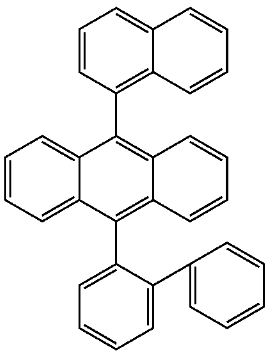

-continued
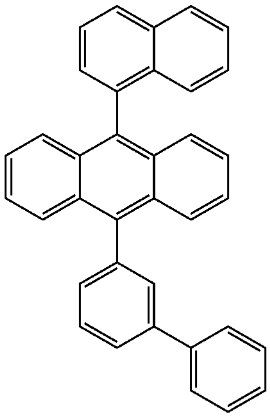
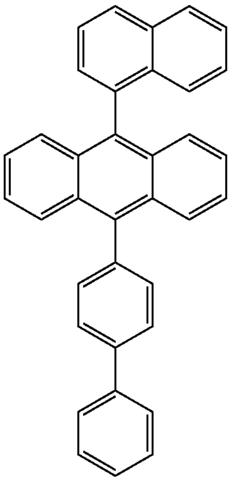
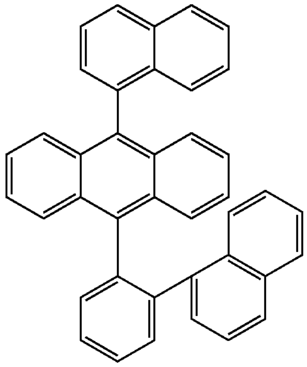
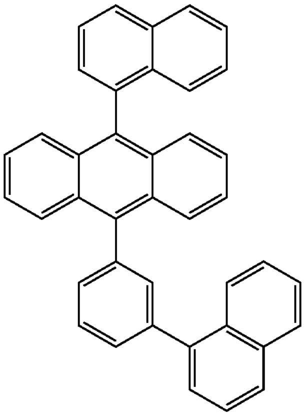
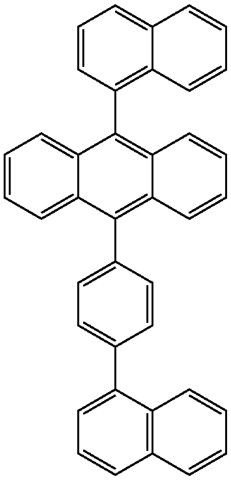
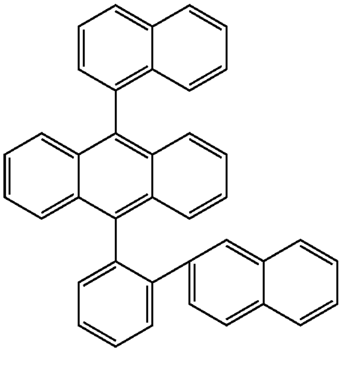
-continued
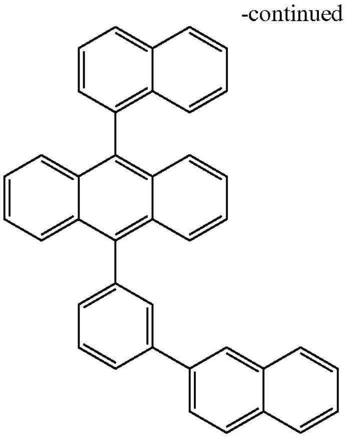
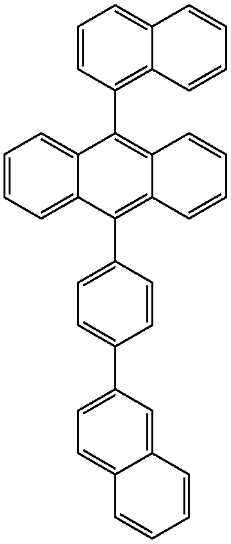
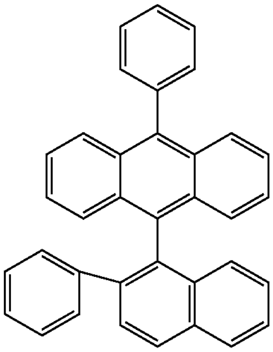
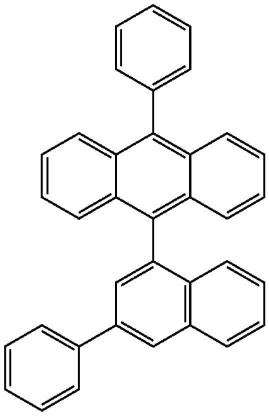
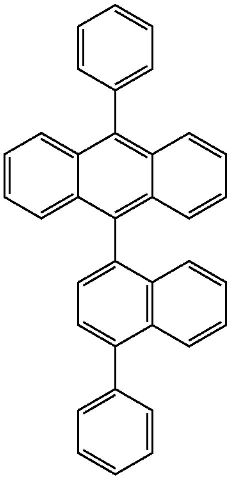
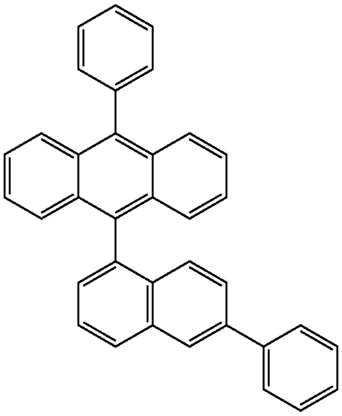

-continued
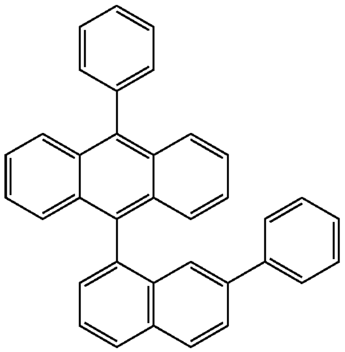
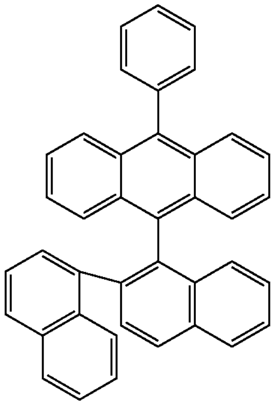
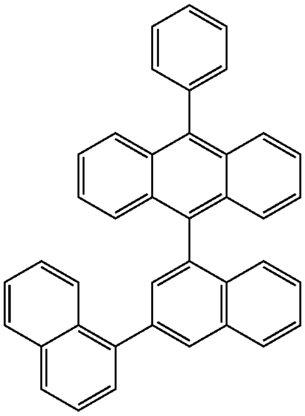
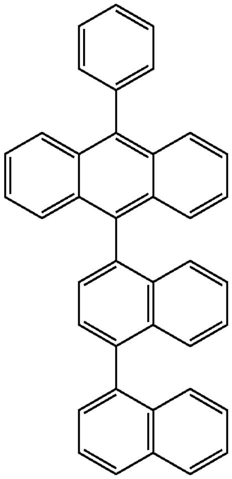
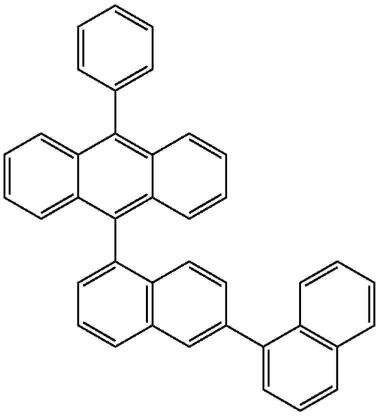
-continued
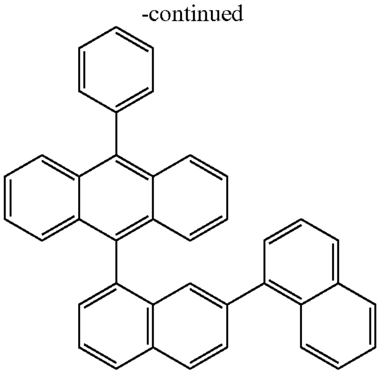
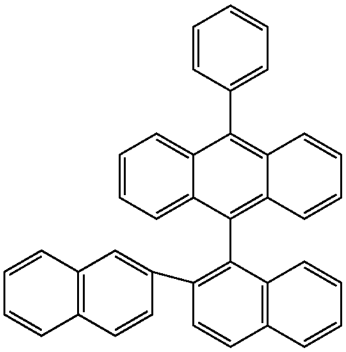
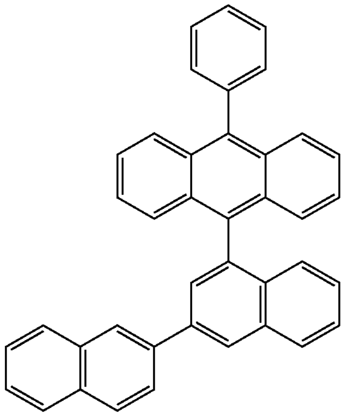
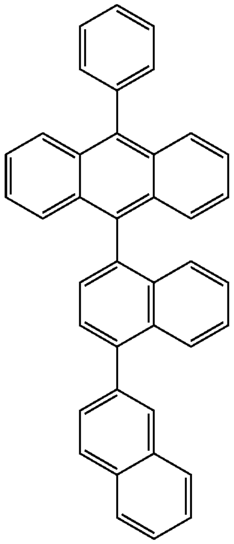
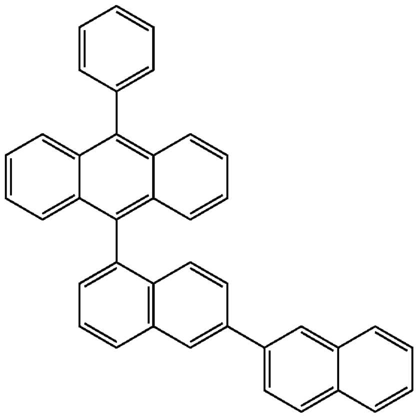

-continued
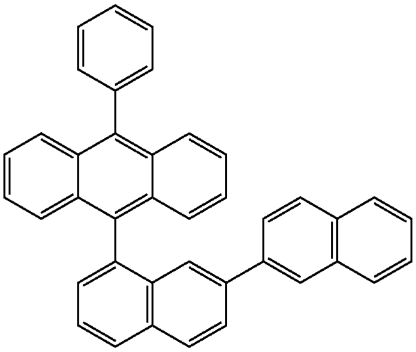
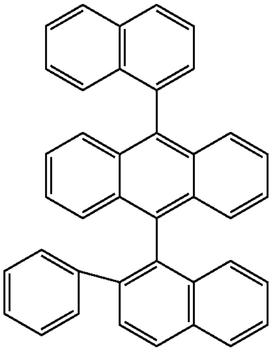
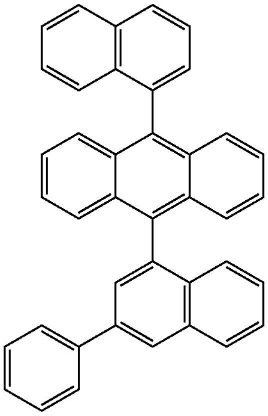
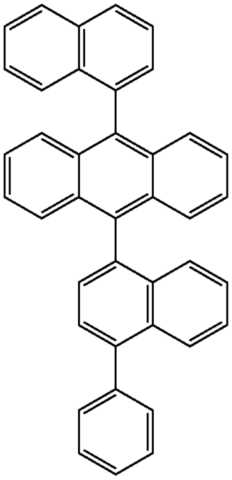
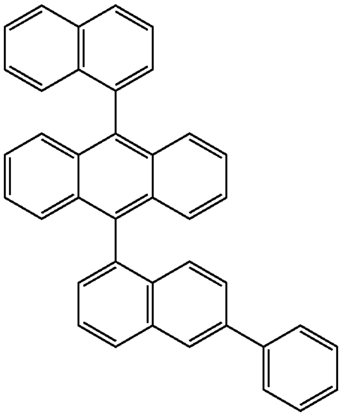
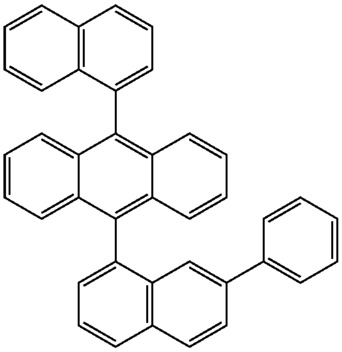
-continued
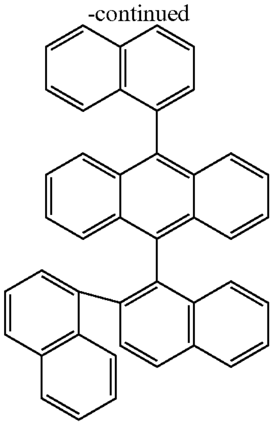
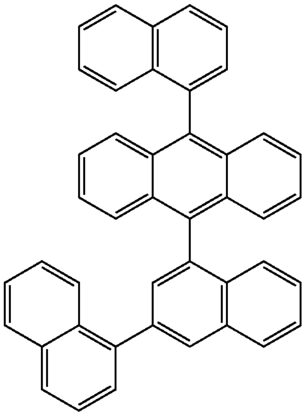
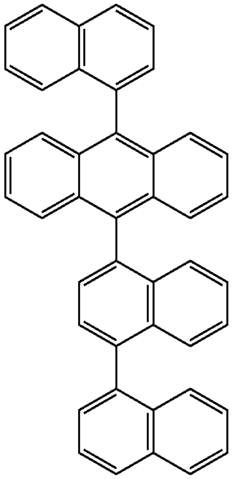
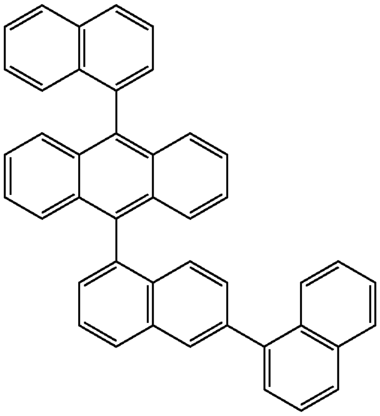
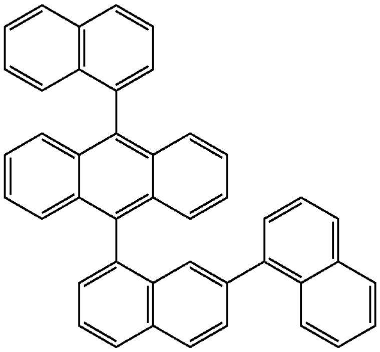

-continued
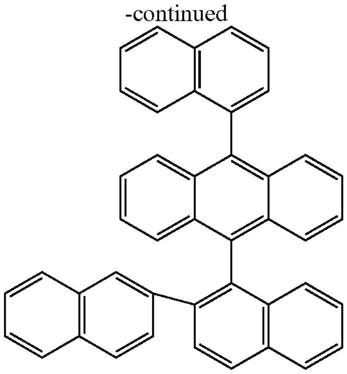
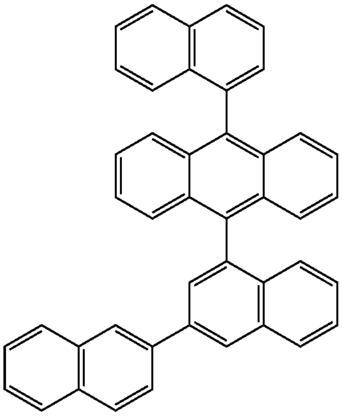
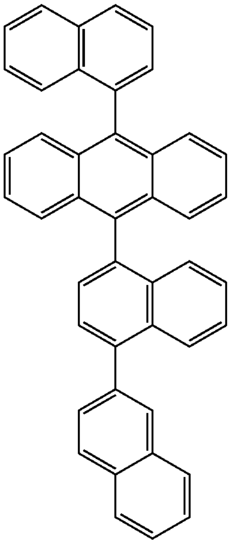
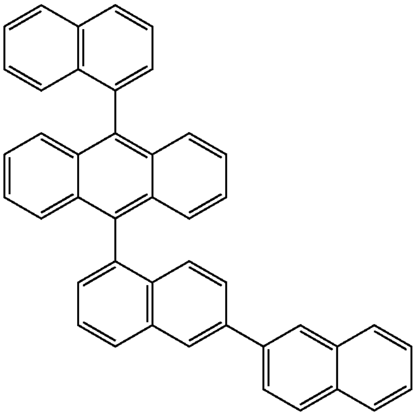
-continued
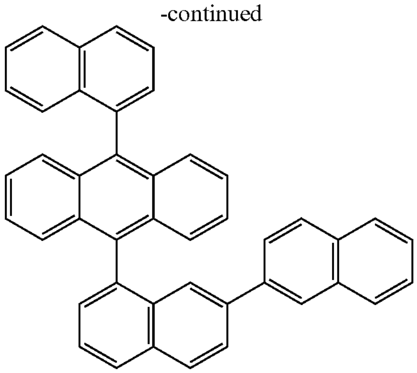
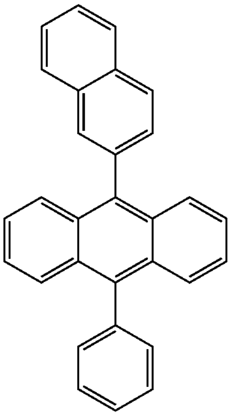
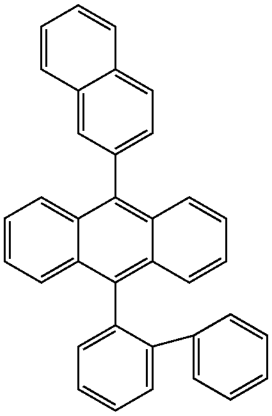
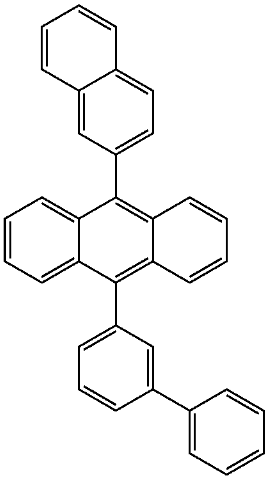
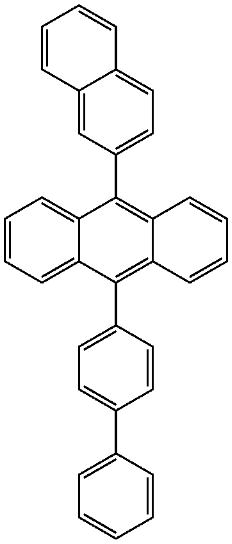
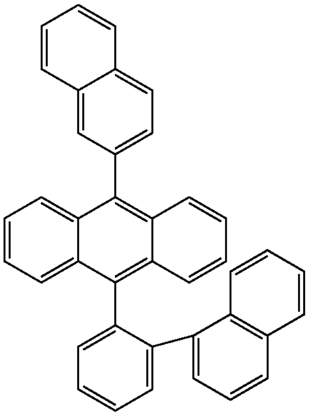

-continued
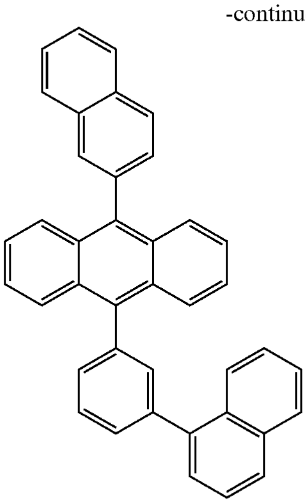
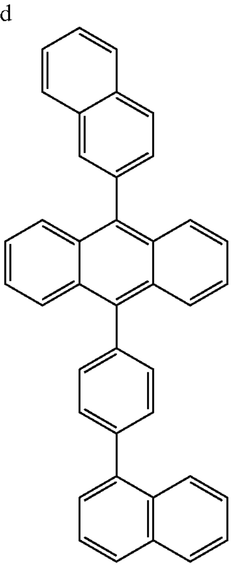
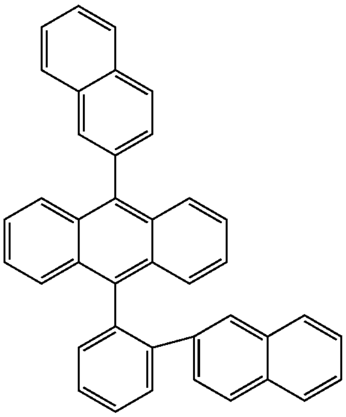
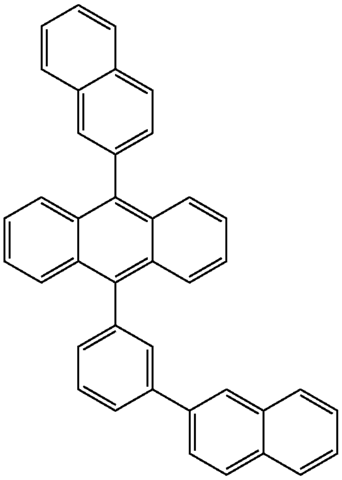
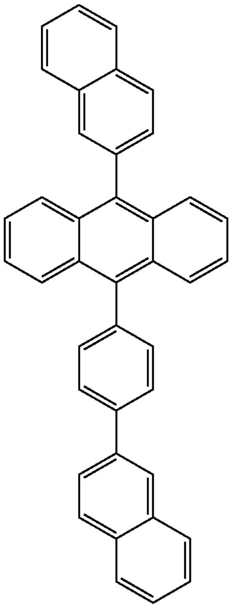
-continued
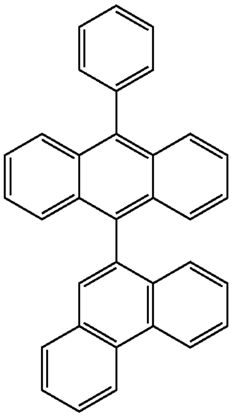
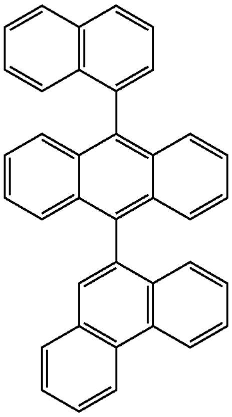
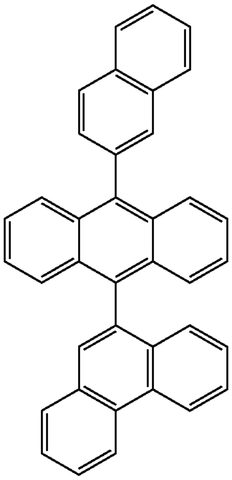
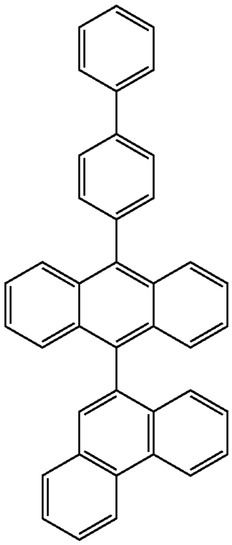
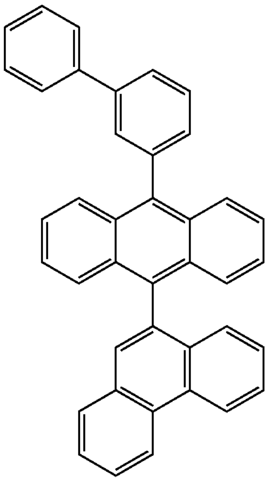
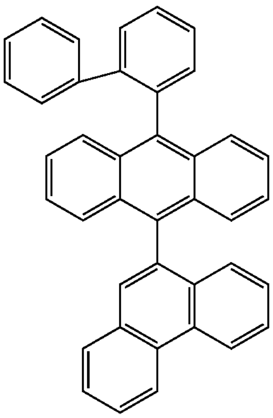

-continued
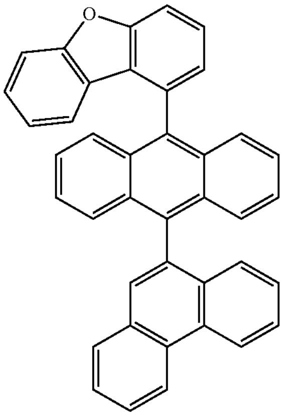
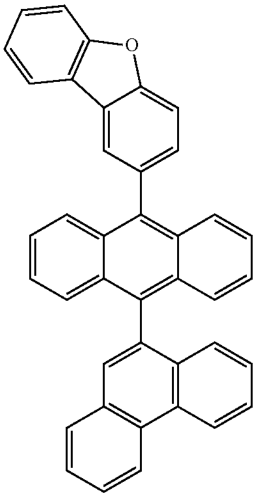
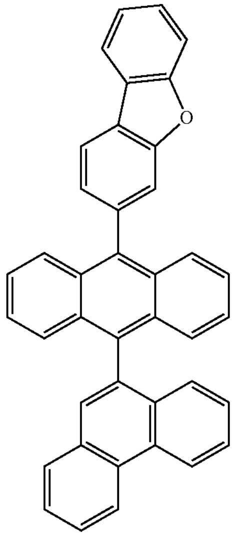
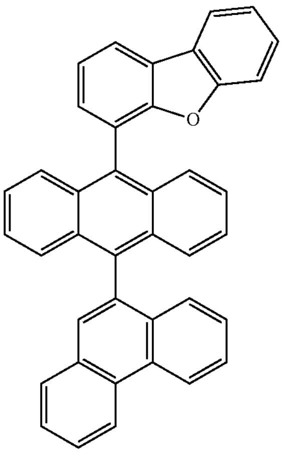
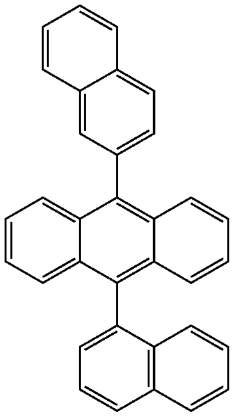
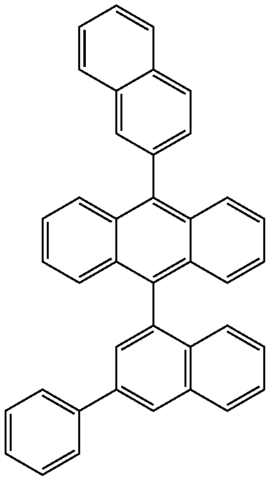
-continued
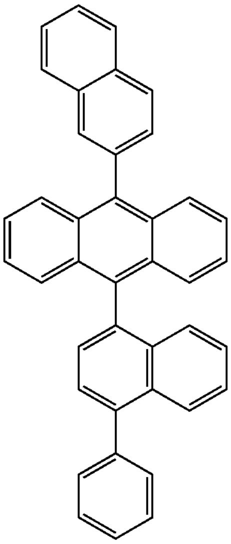
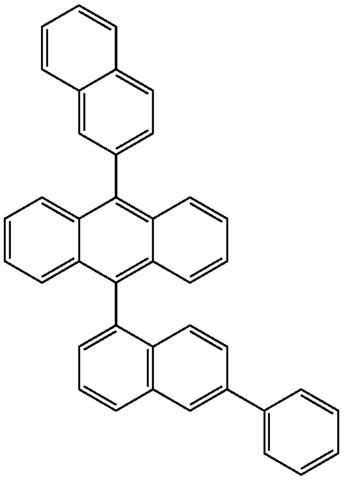
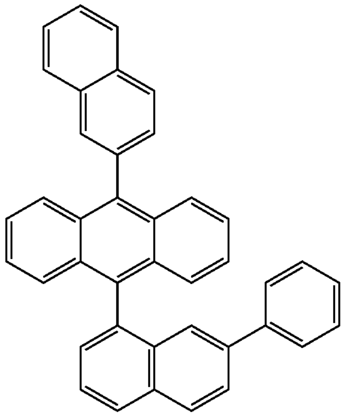
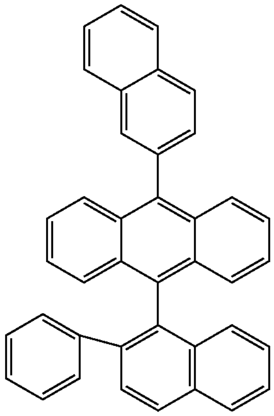

-continued
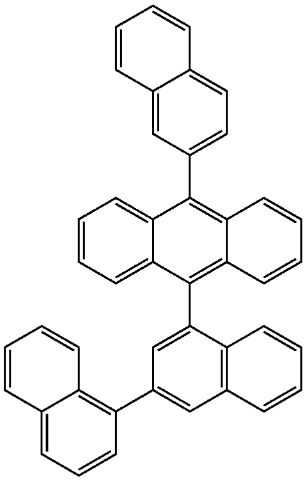
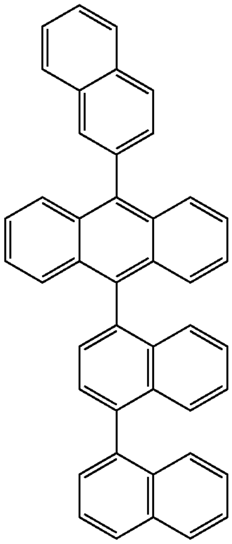
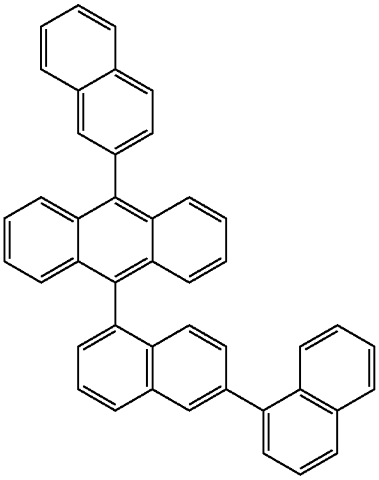
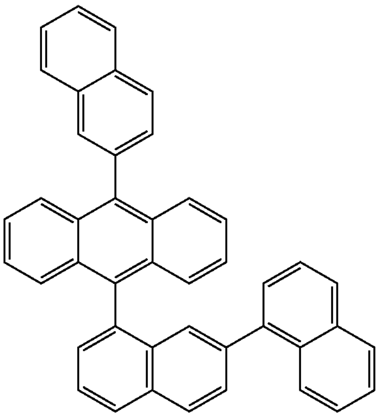
-continued
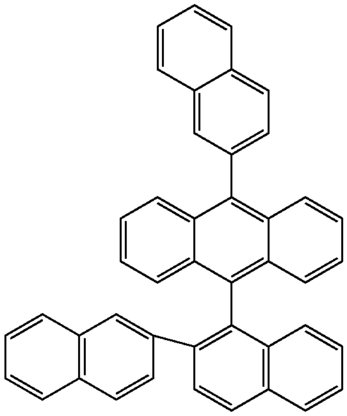
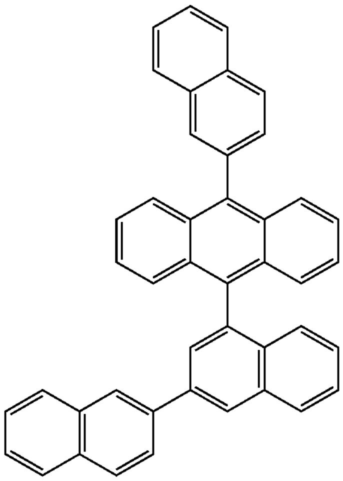
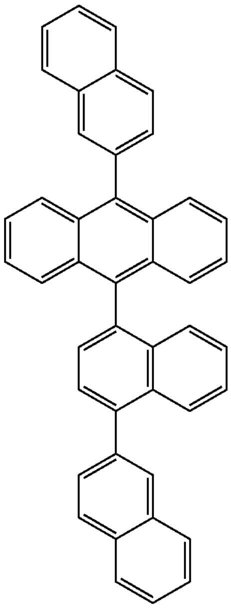

-continued
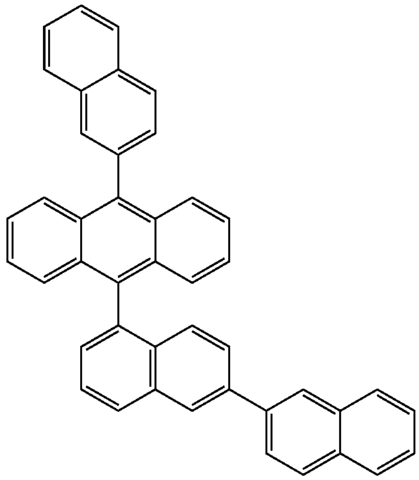
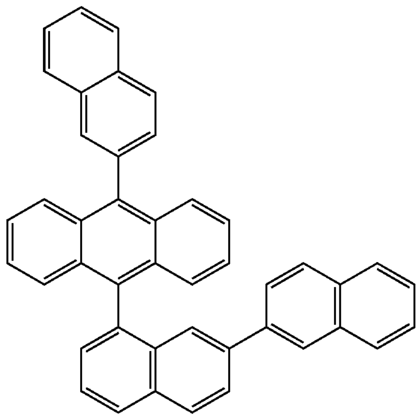
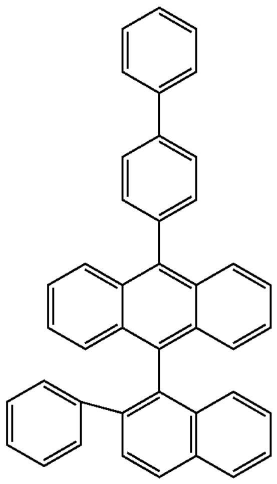
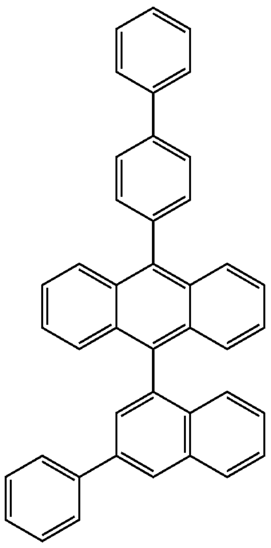
-continued
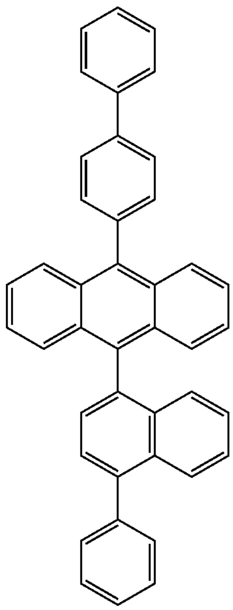
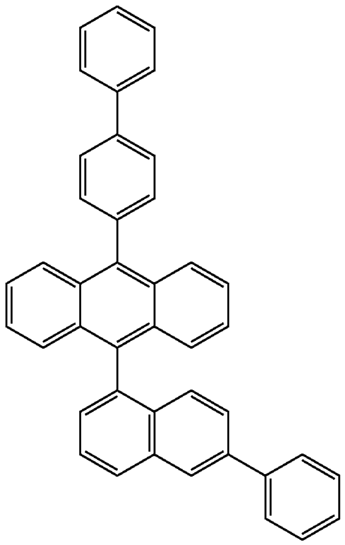
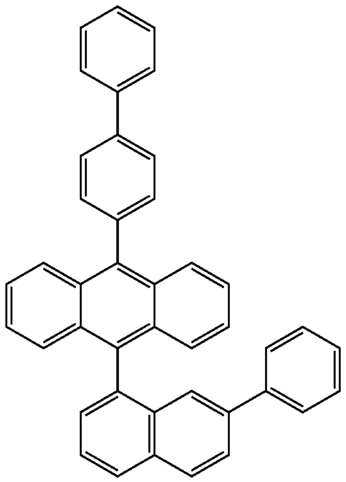
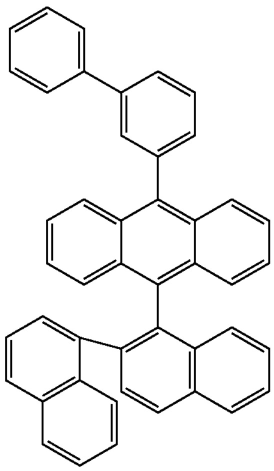

-continued
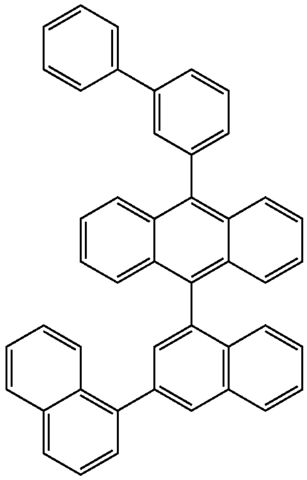
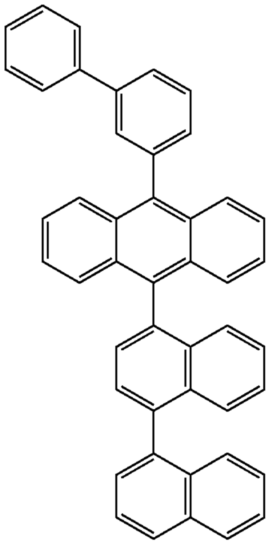
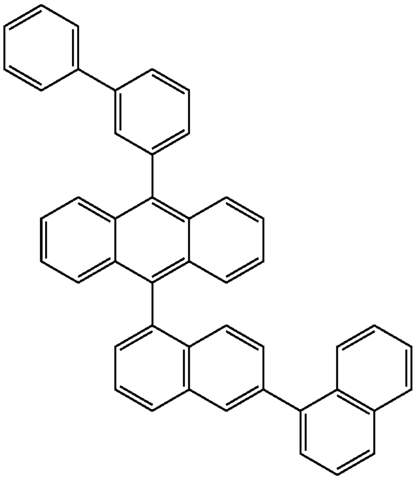
-continued
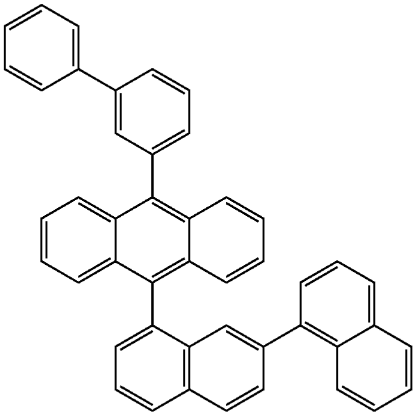
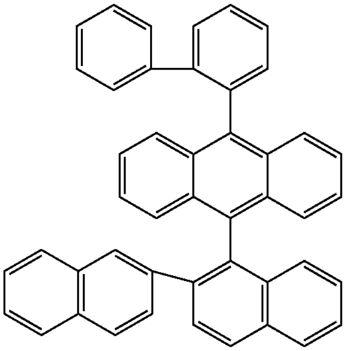
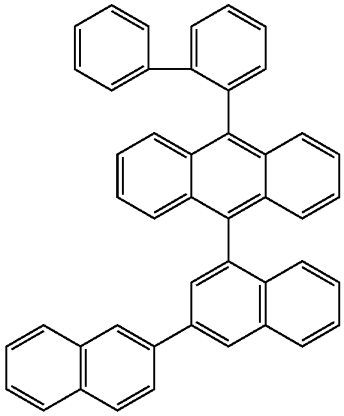
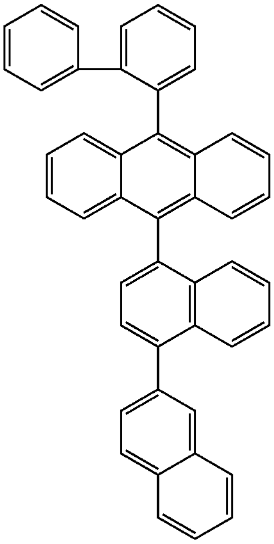

-continued
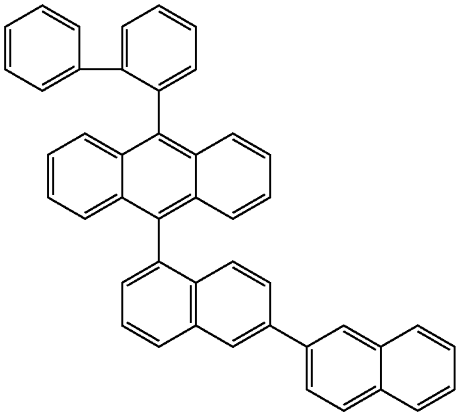
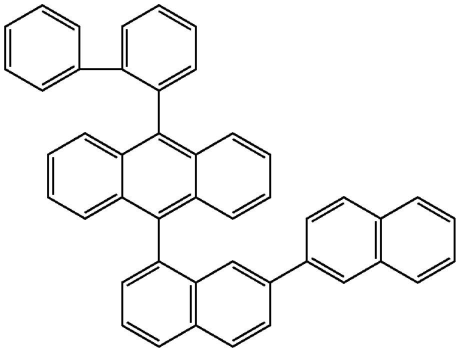
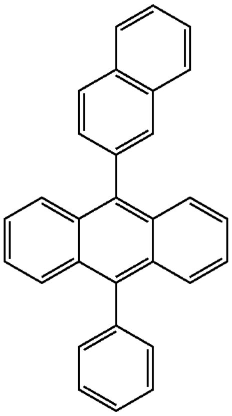
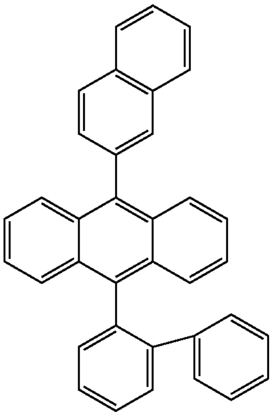
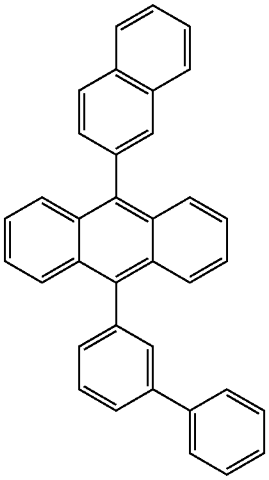
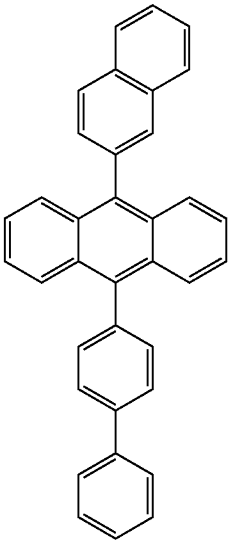
-continued
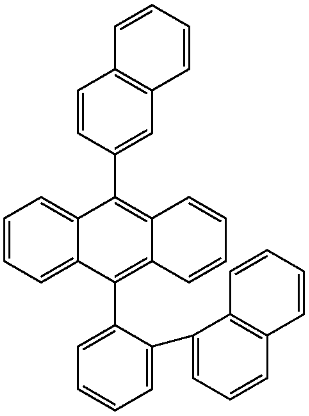
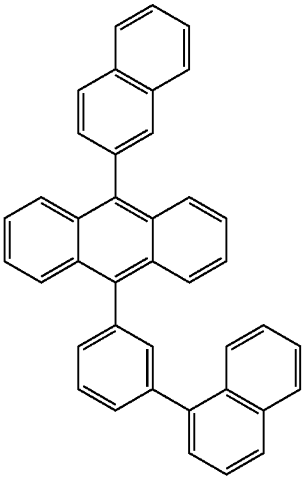
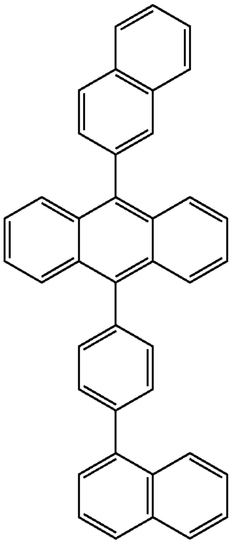
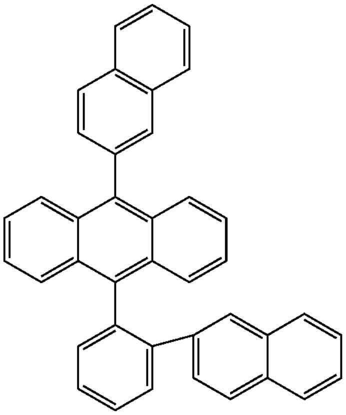

-continued
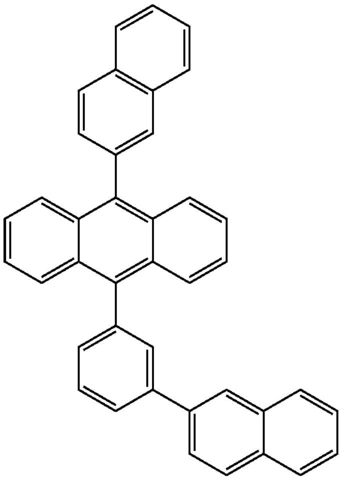
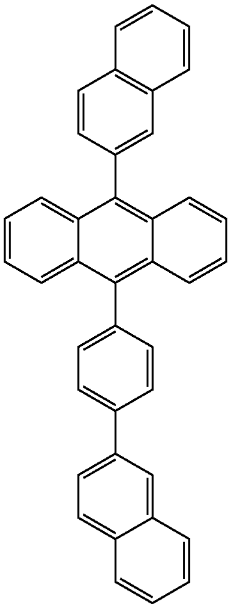
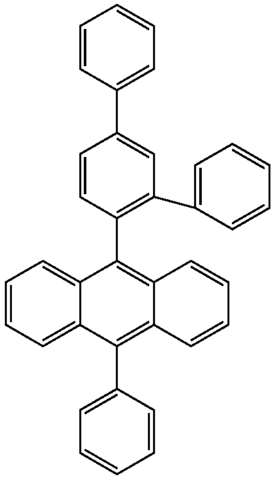
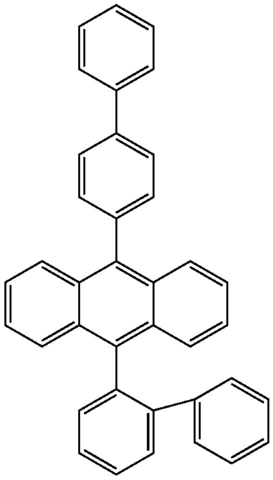
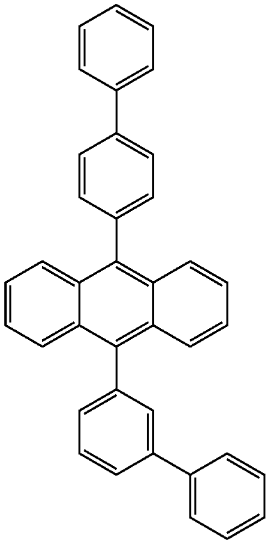
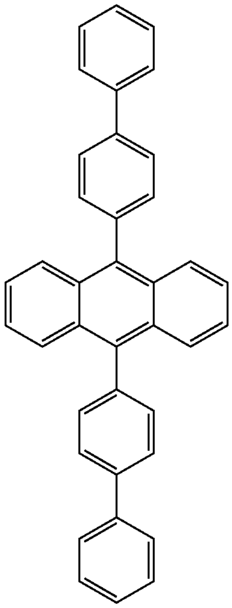
-continued
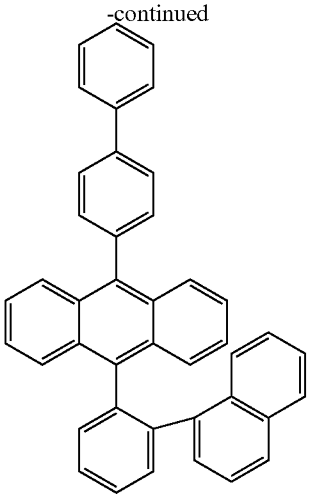
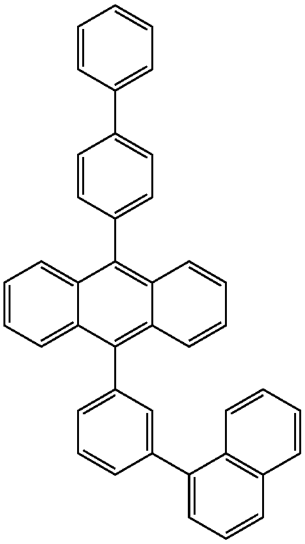
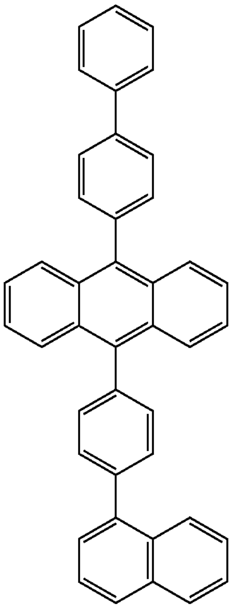
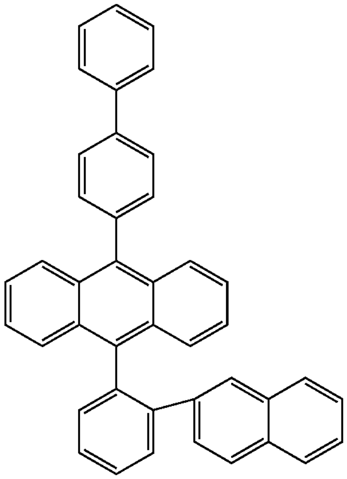

-continued
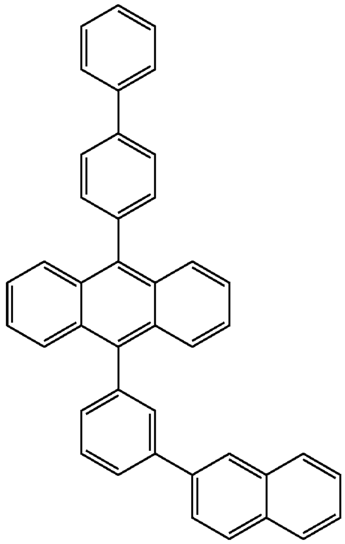
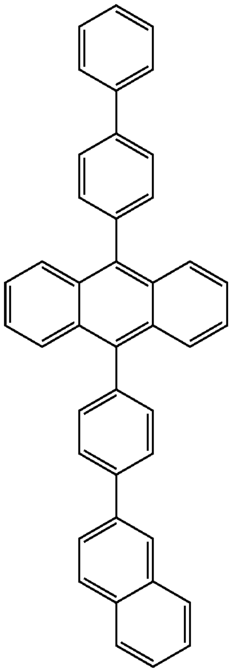
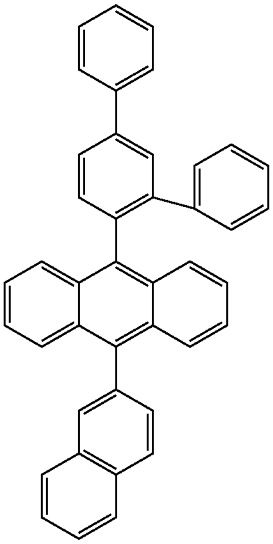
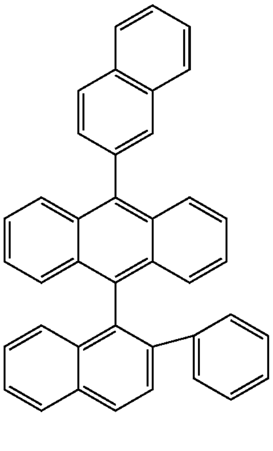
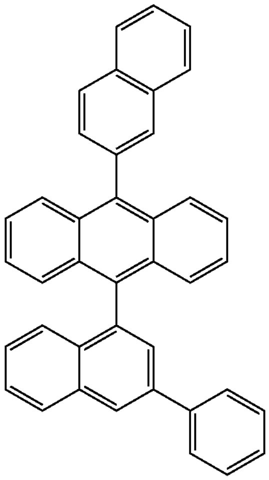
-continued
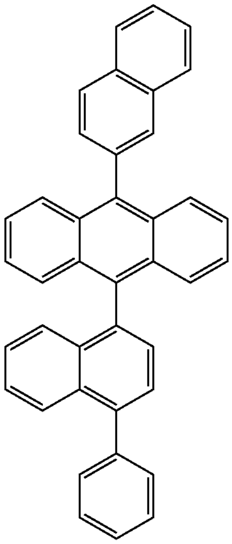
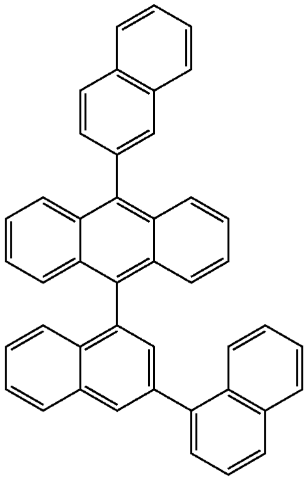
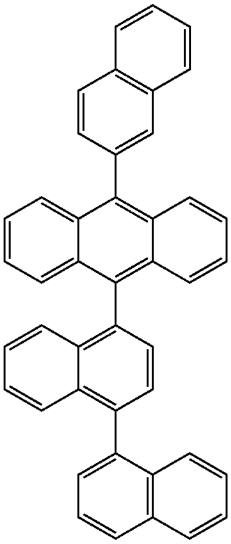
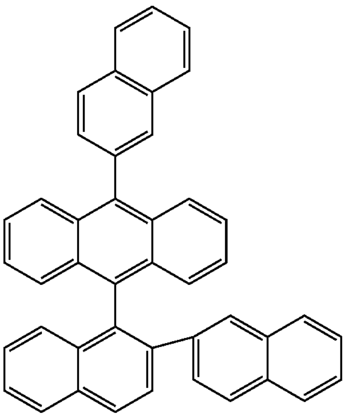

-continued
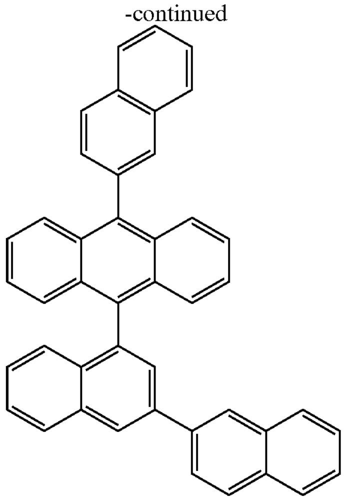
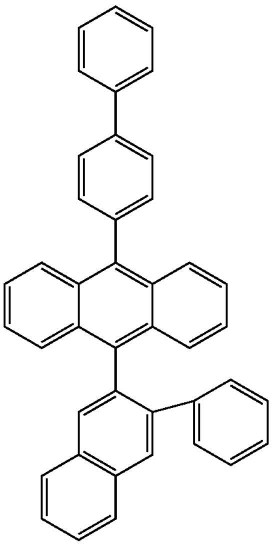
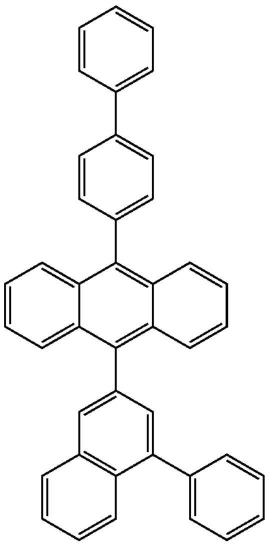
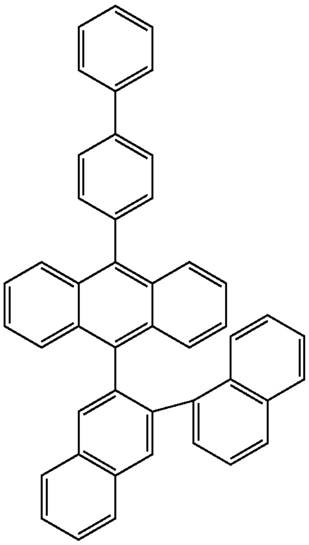
-continued
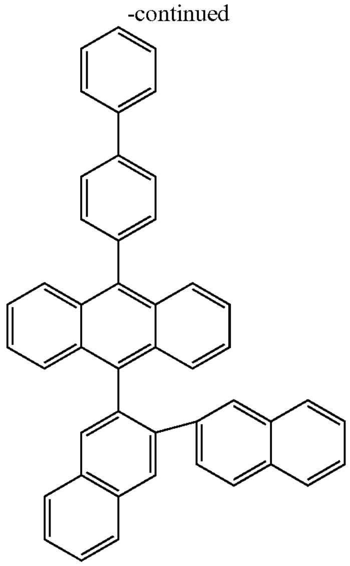
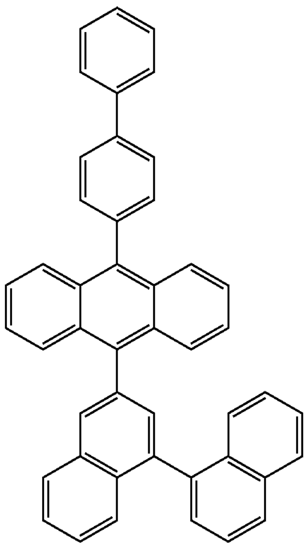

-continued
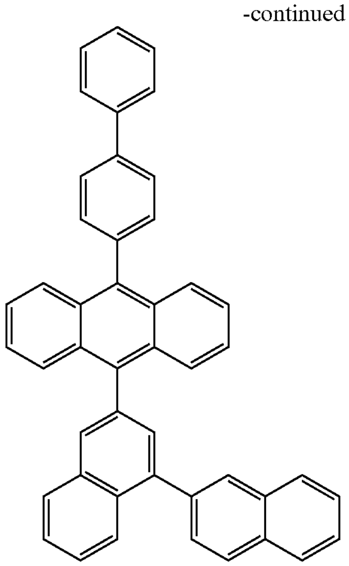
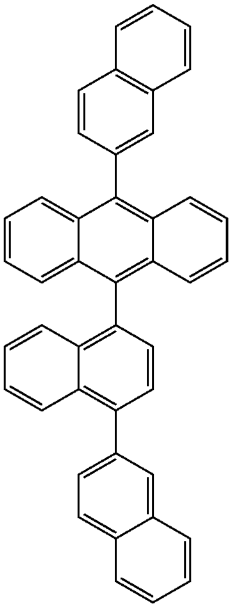
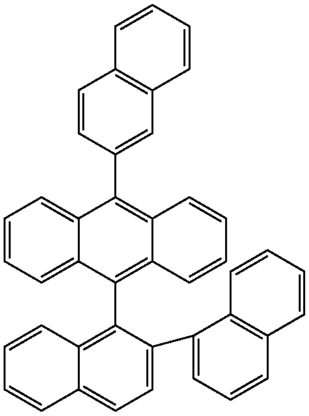
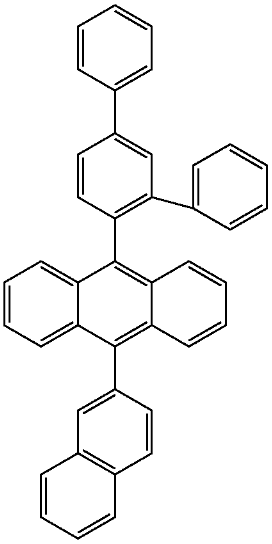
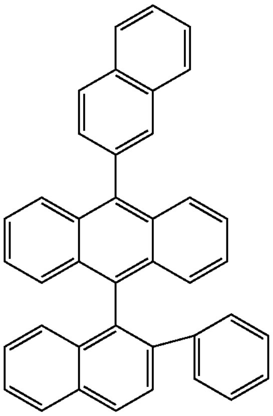
-continued
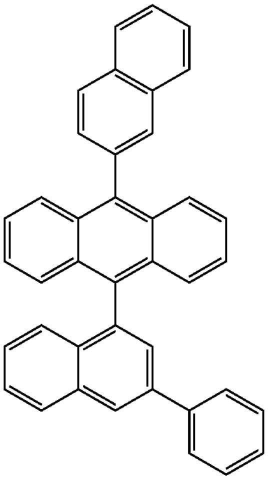
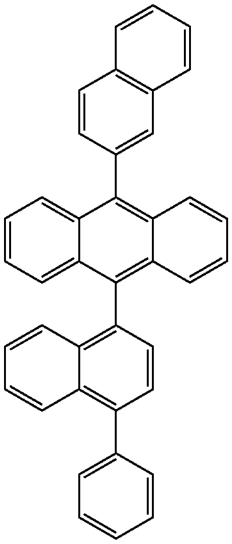
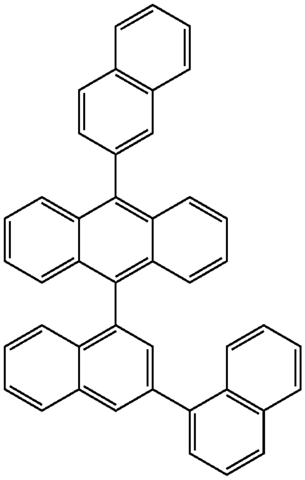
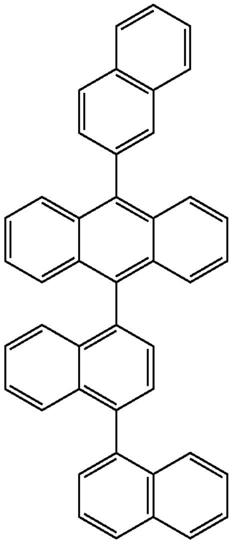
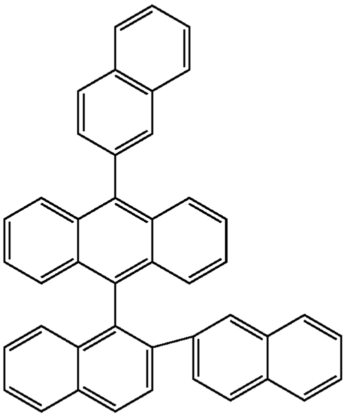

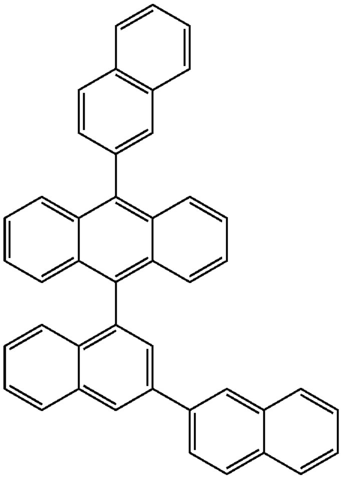
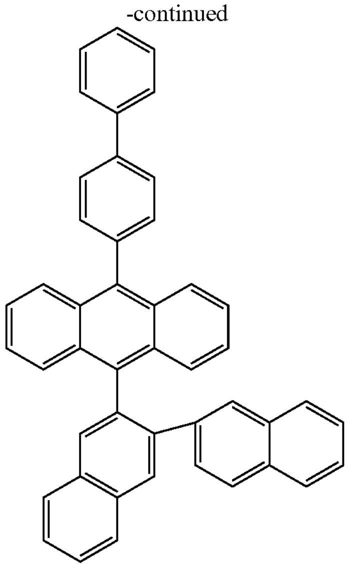
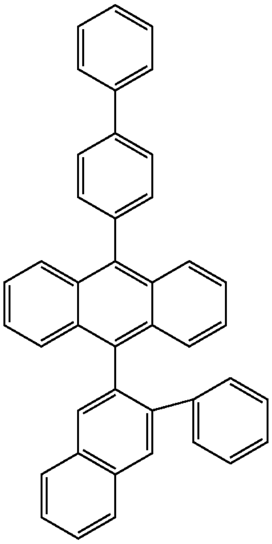
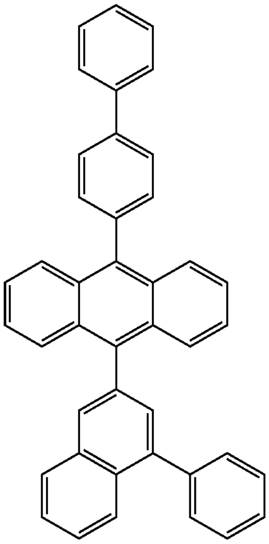
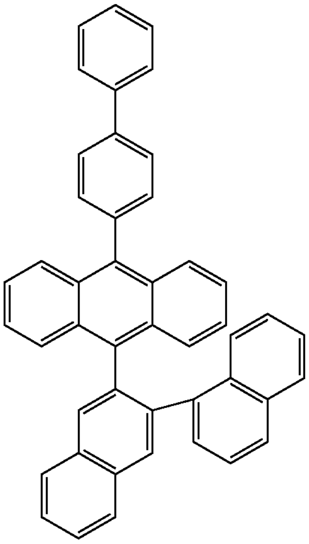
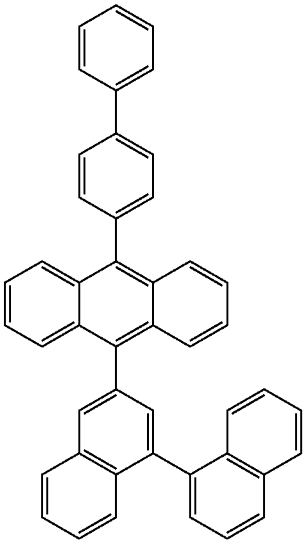

-continued
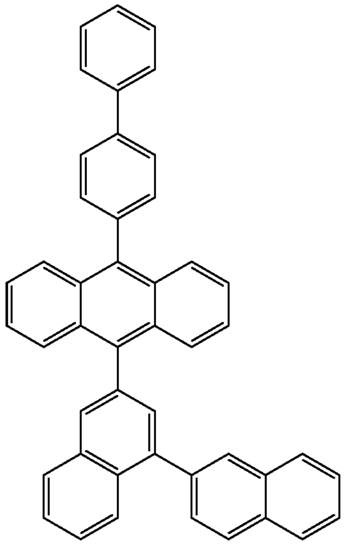
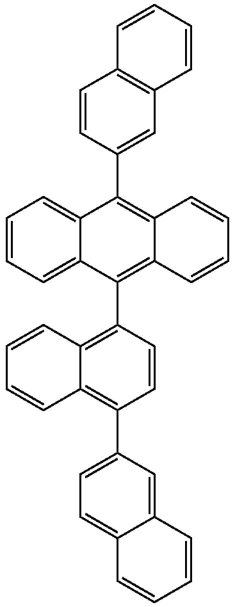
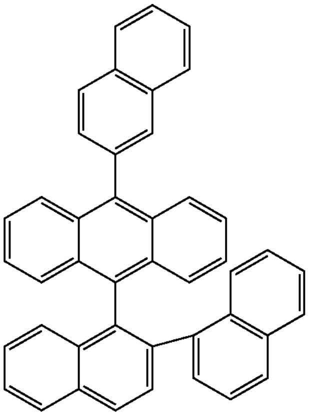
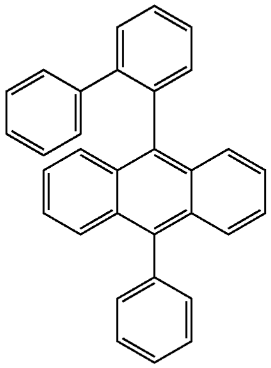
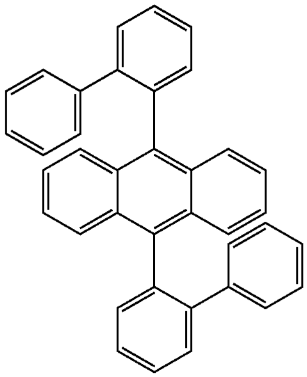
-continued
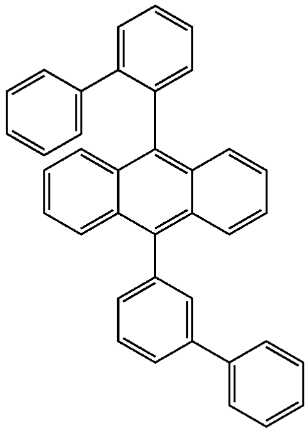
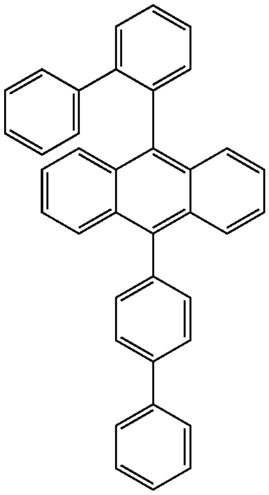
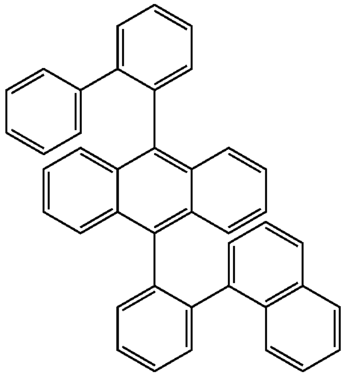
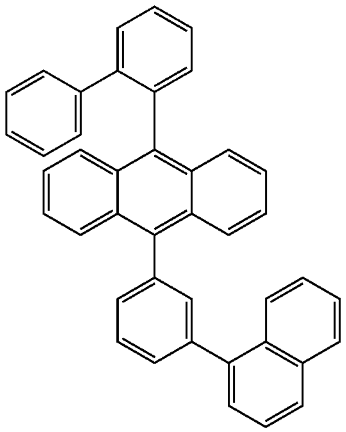

-continued
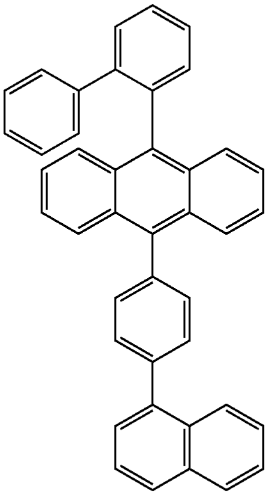
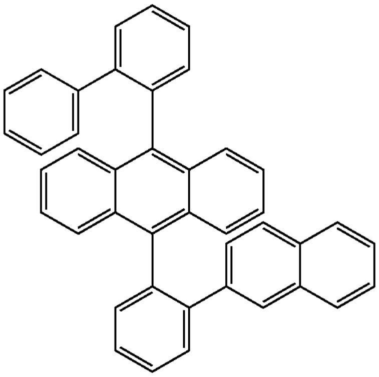
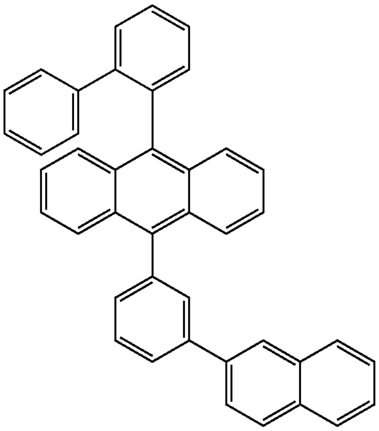
-continued
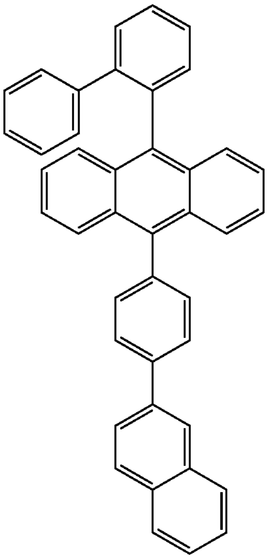
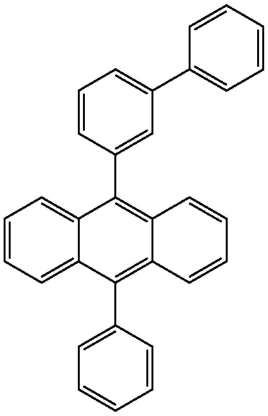
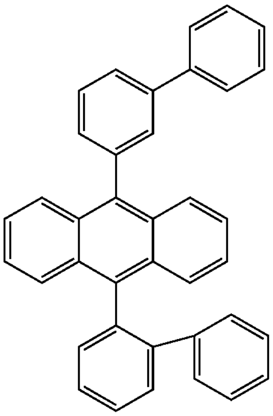
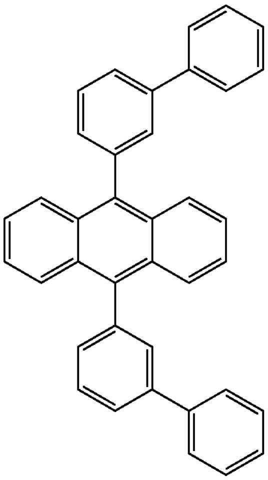
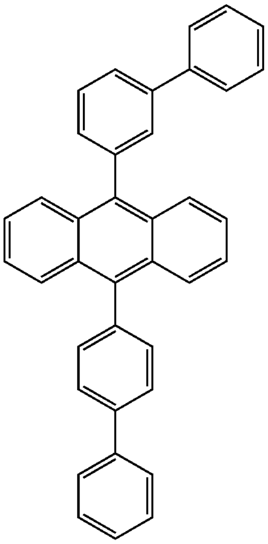

-continued
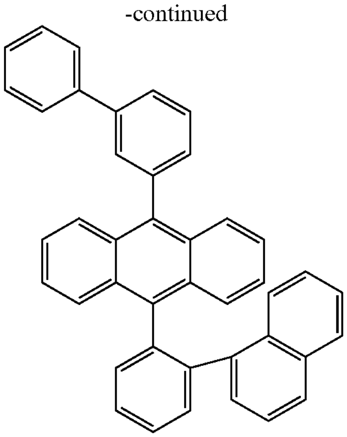
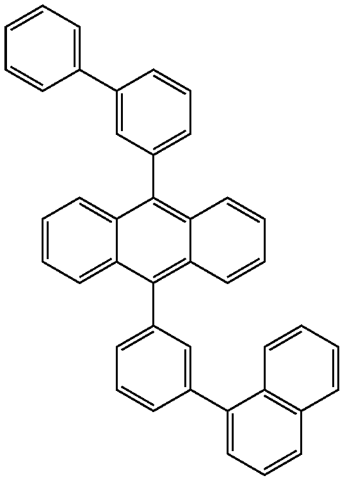
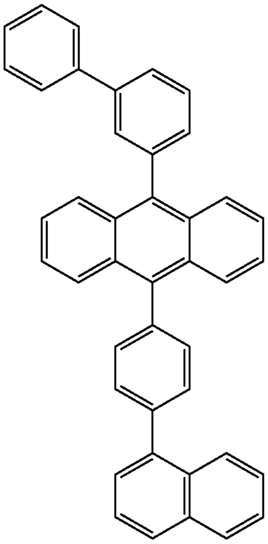
-continued
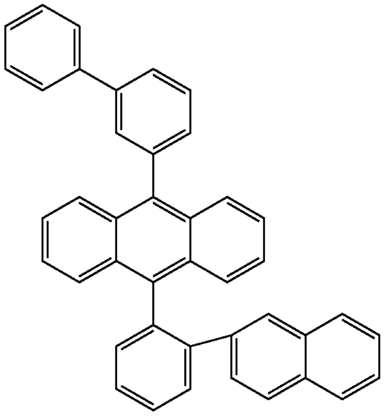
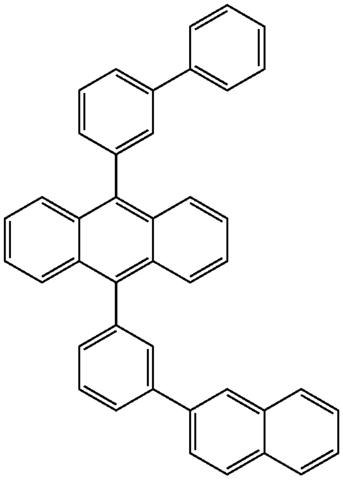
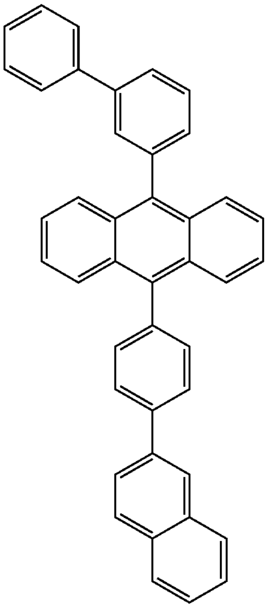

-continued
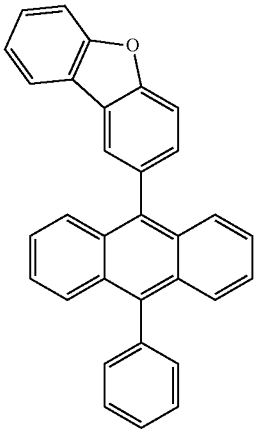
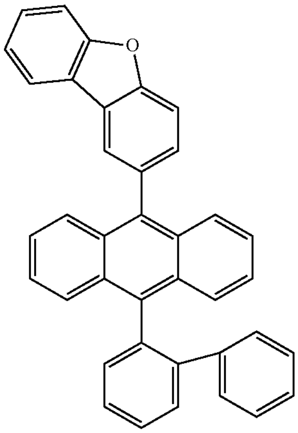
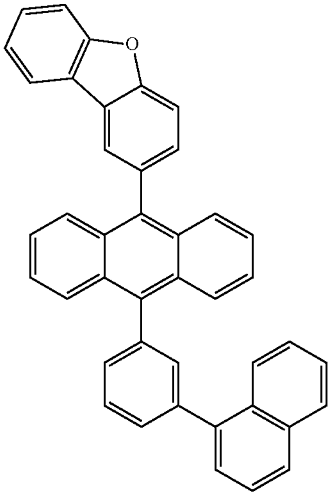
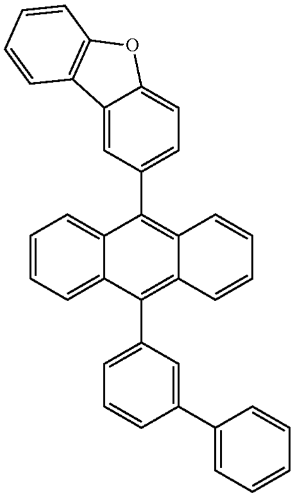
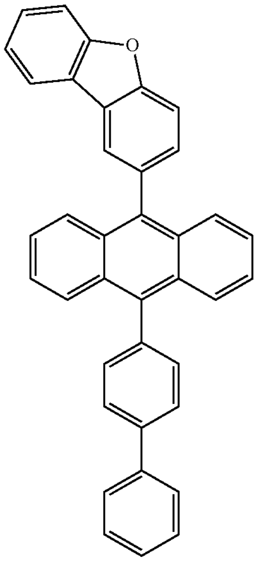
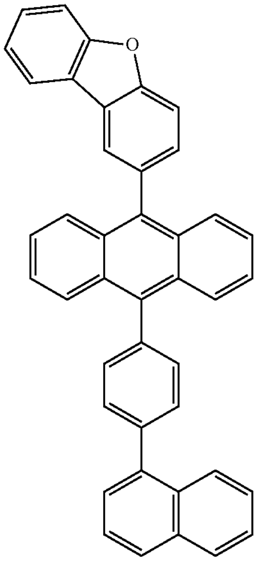
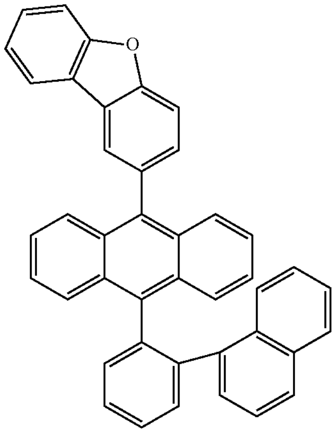
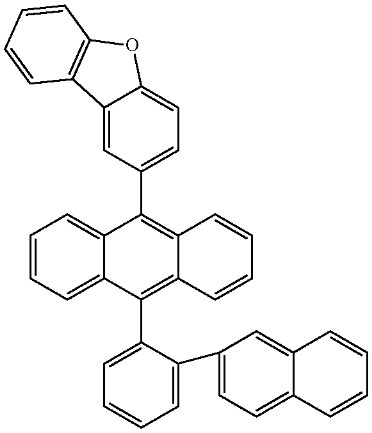

-continued
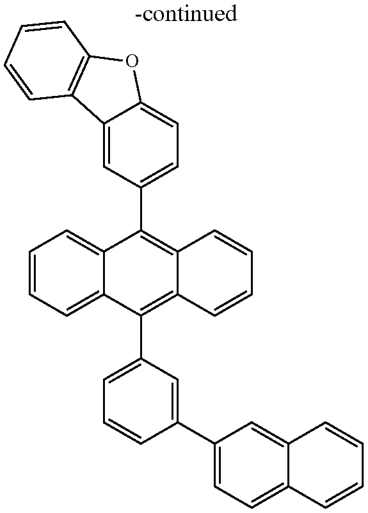
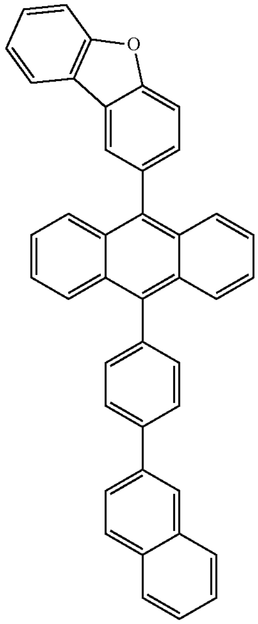
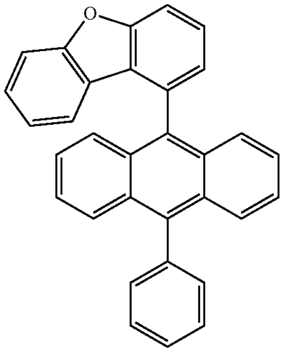
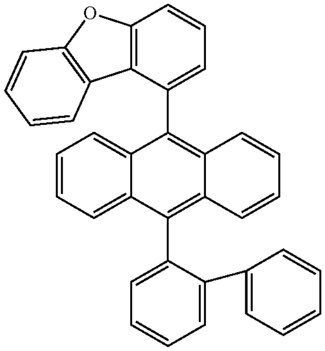
-continued
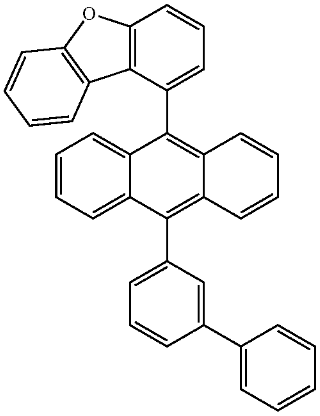
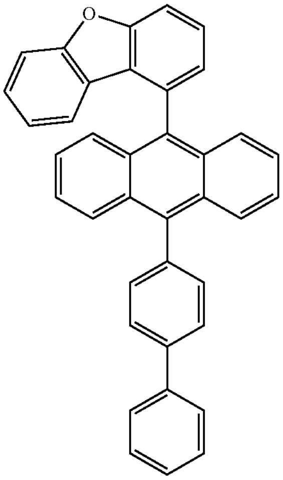
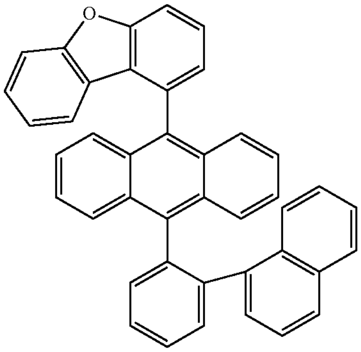
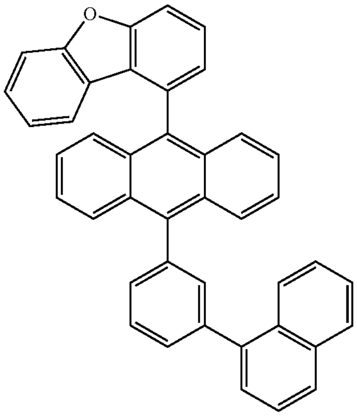

-continued
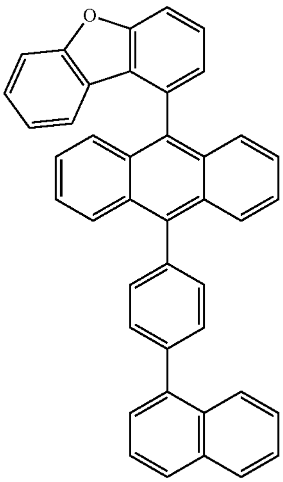
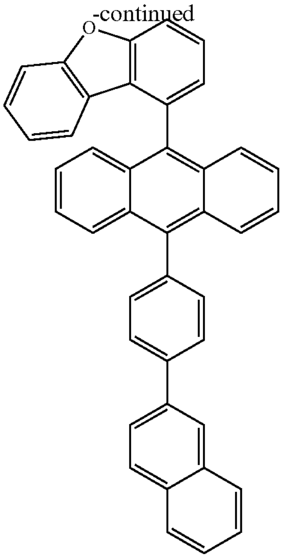
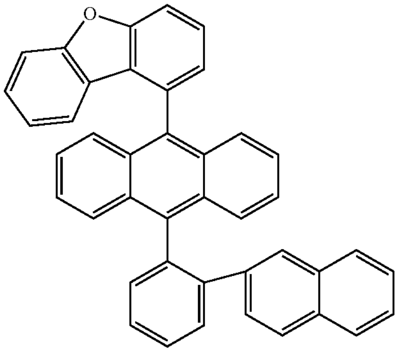
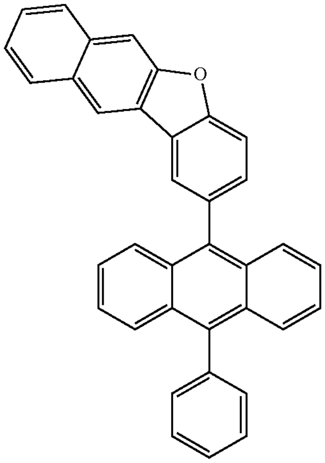
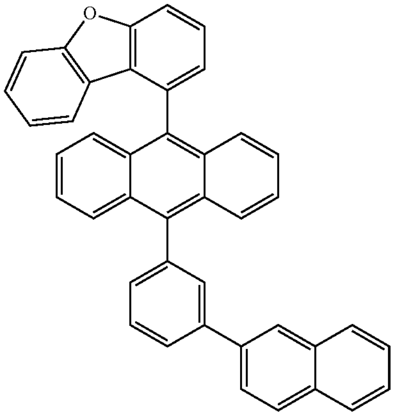
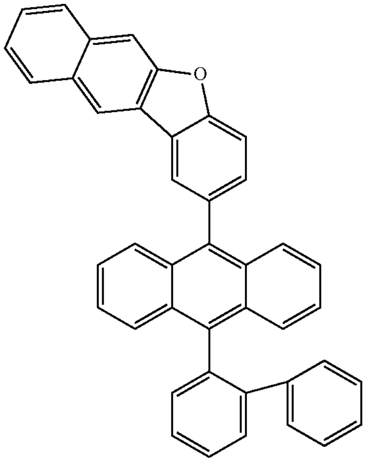
-continued -continued
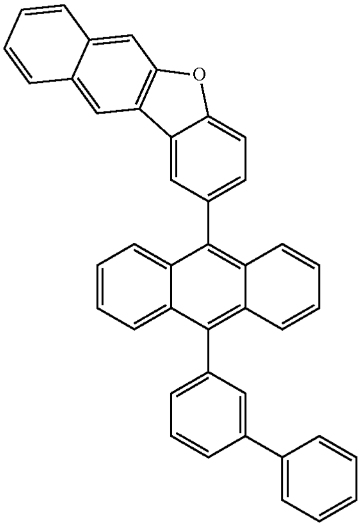
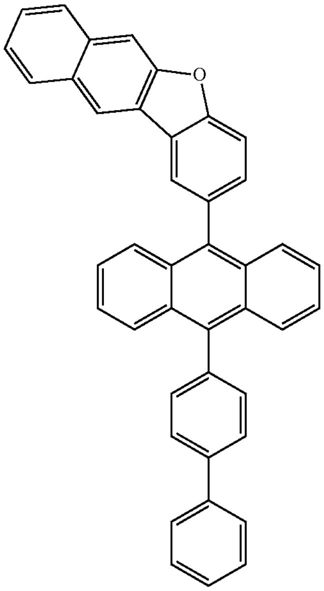
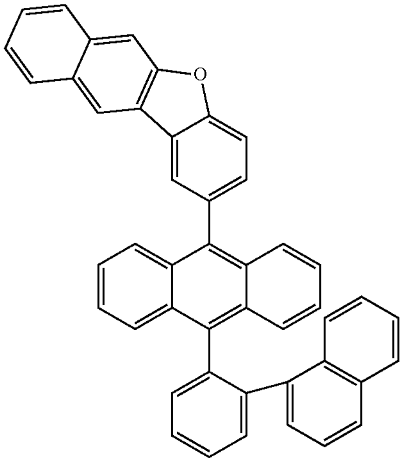
-continued
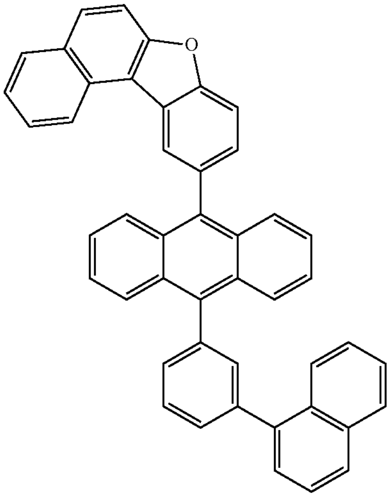
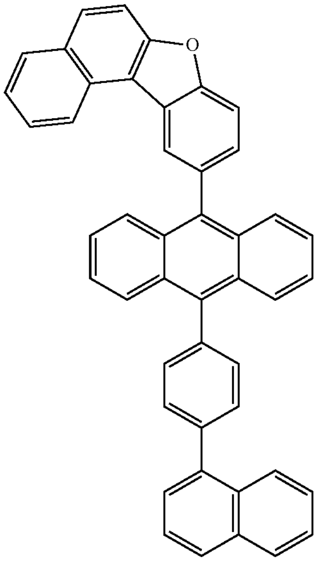
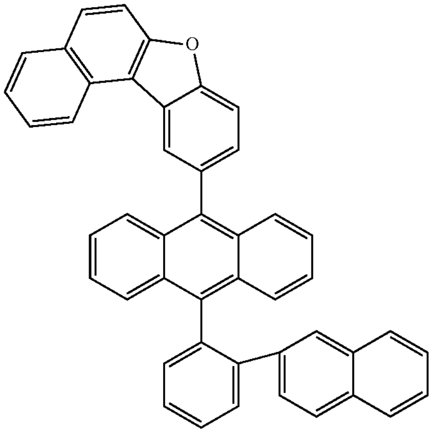

-continued
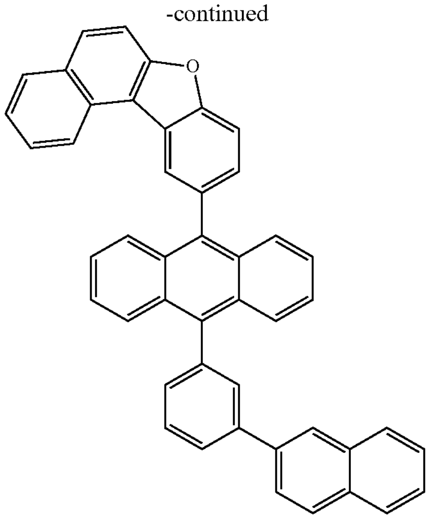
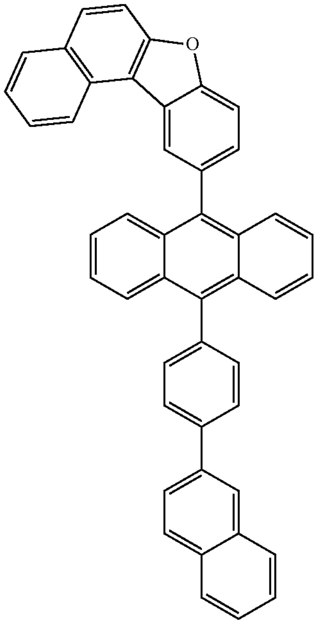
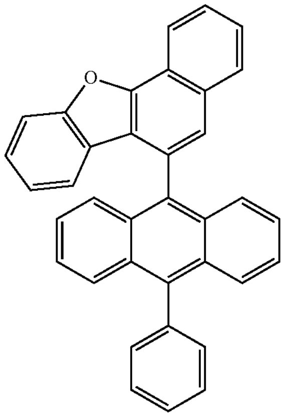
-continued
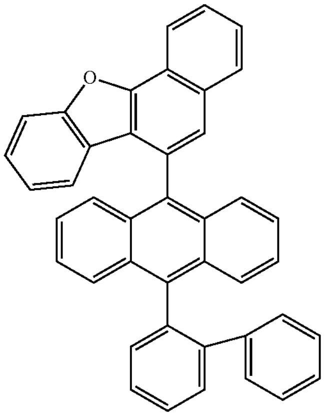
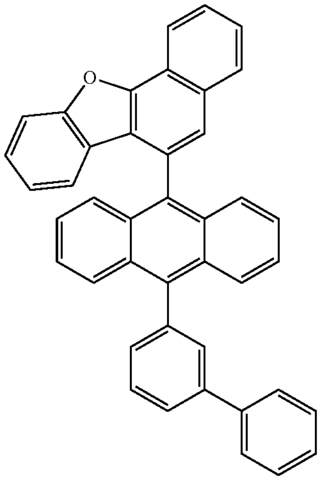
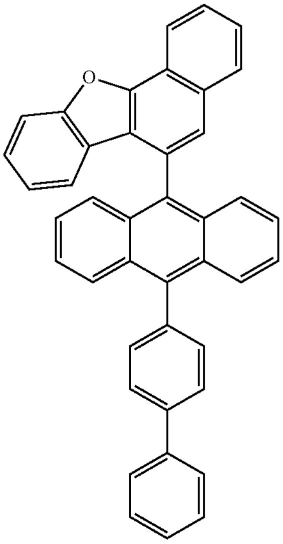

-continued
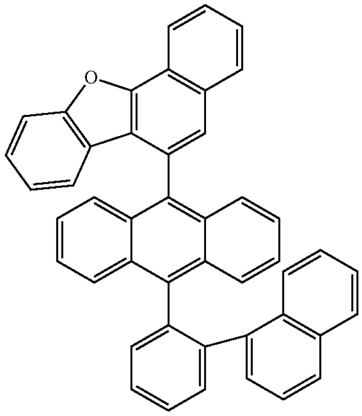
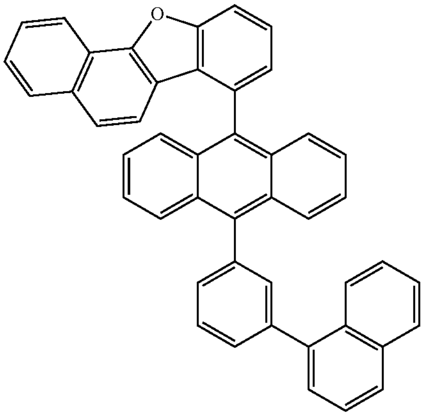
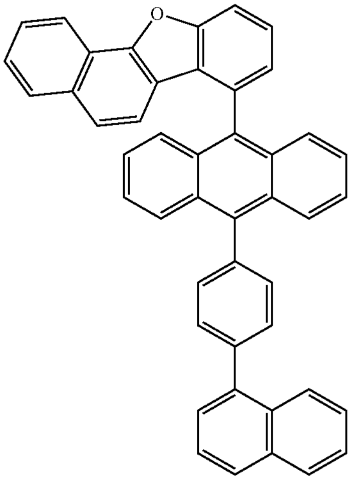
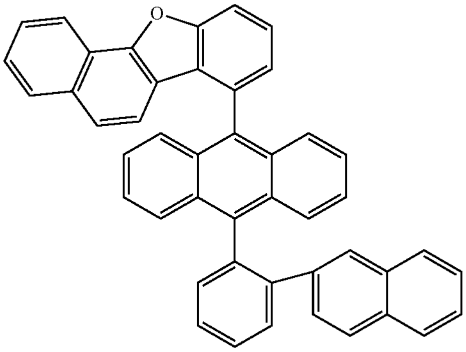
-continued
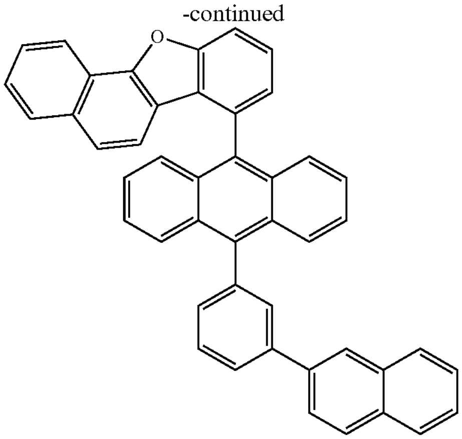
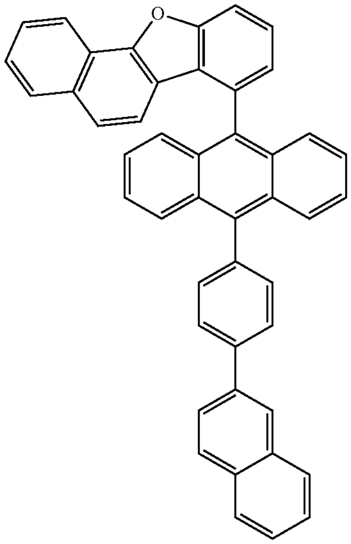
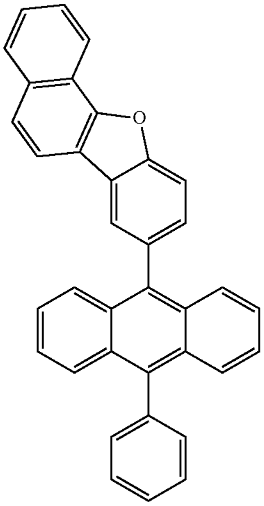

-continued
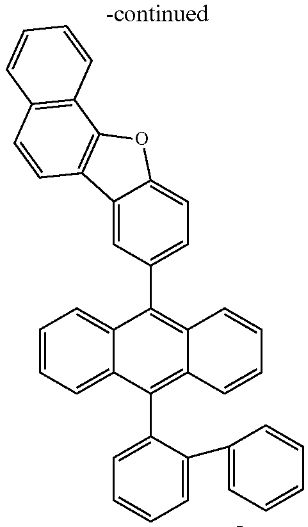
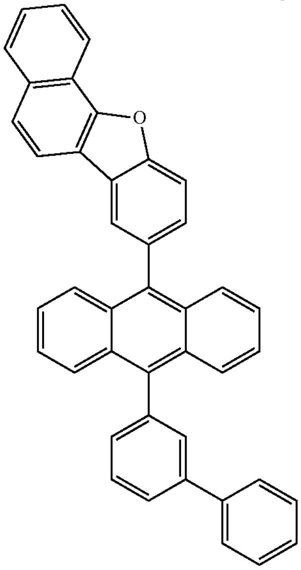
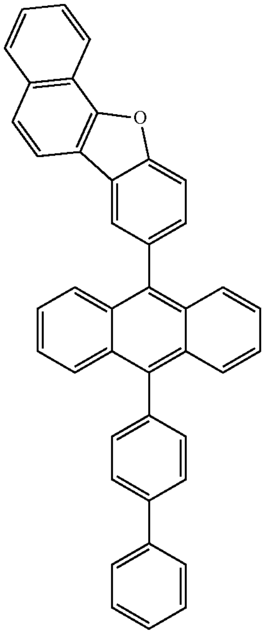
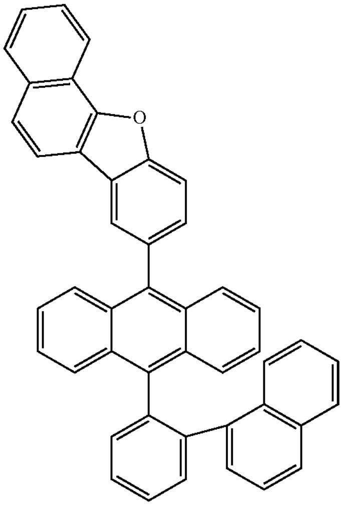
-continued
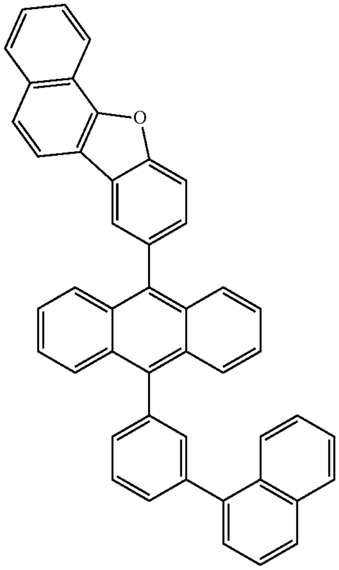
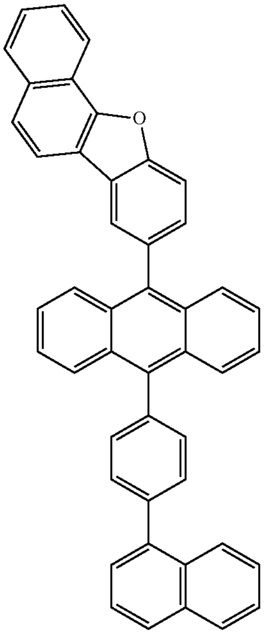
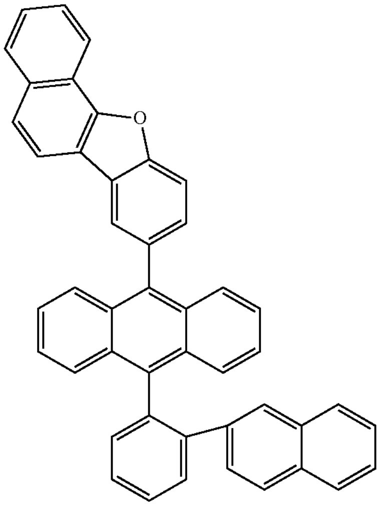

-continued
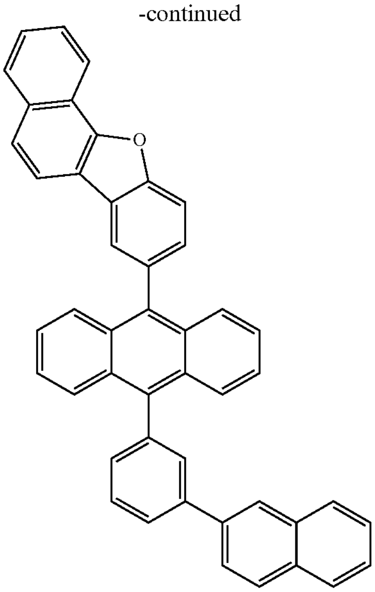
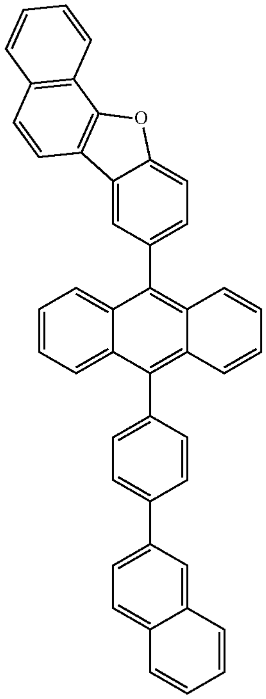
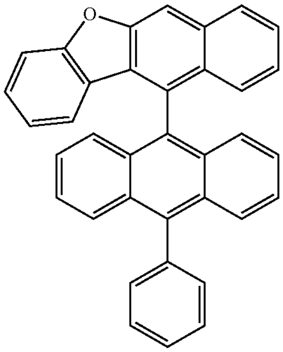
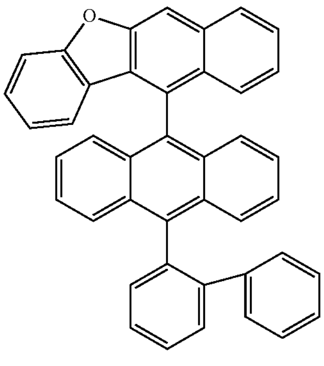
-continued
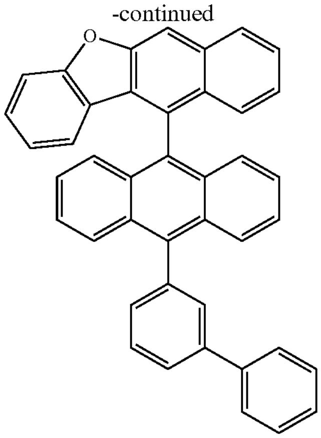
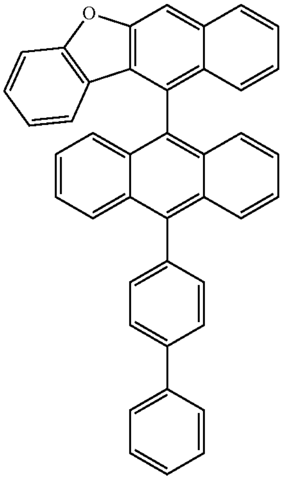
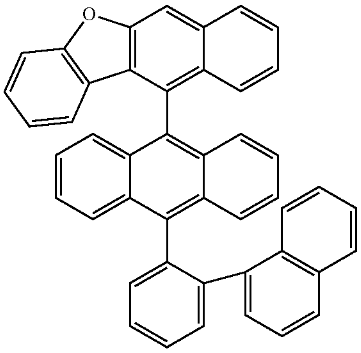
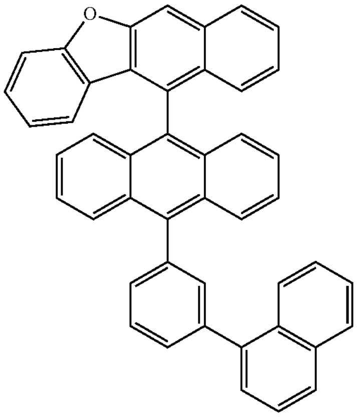

-continued
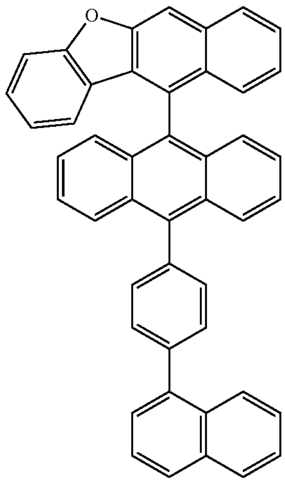
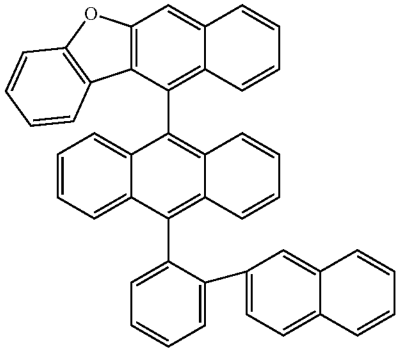
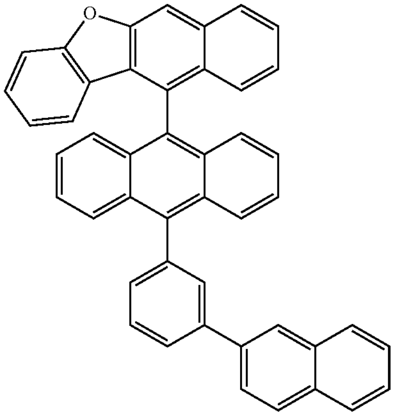
-continued
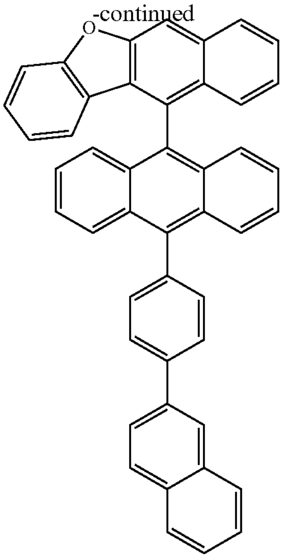
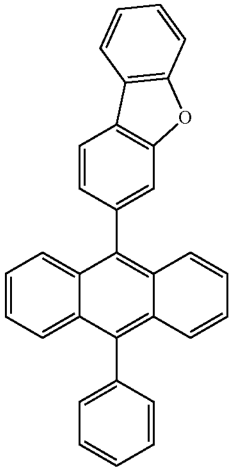
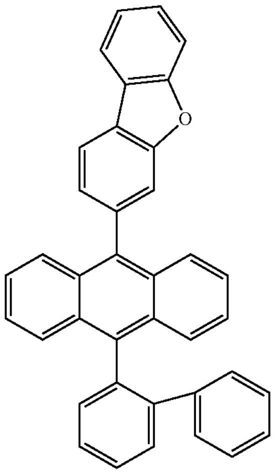
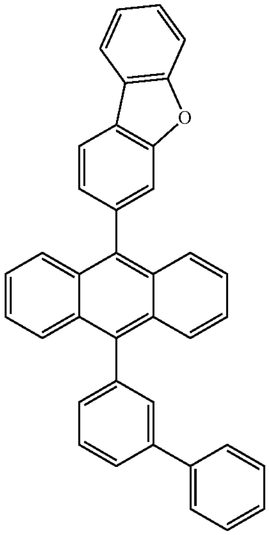
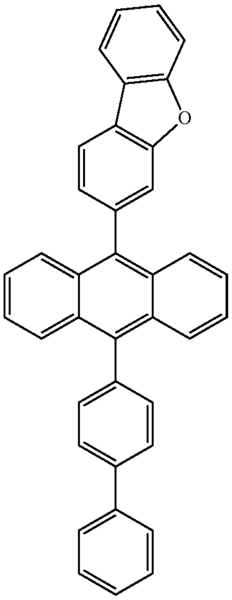

-continued
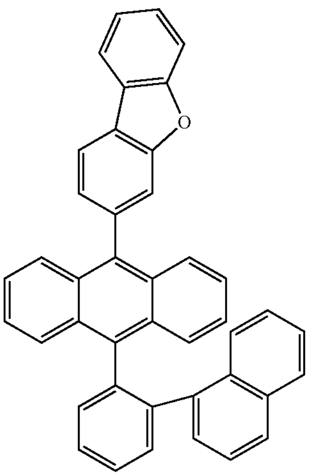
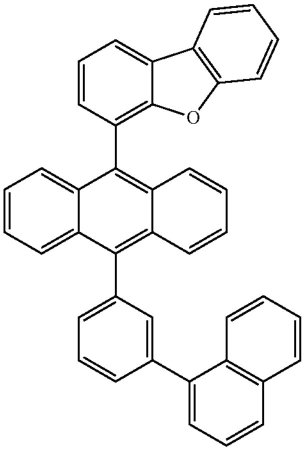
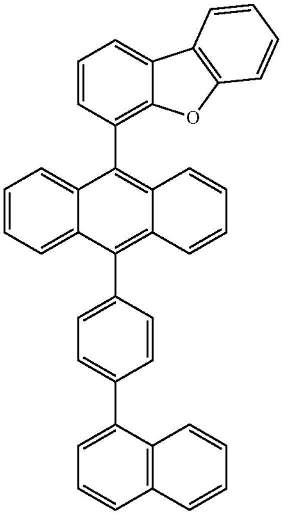
-continued
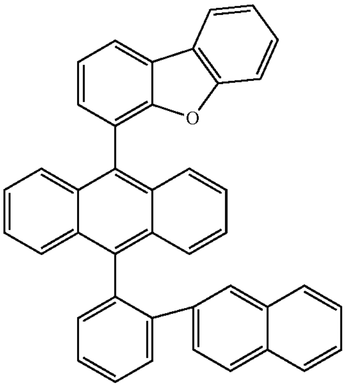
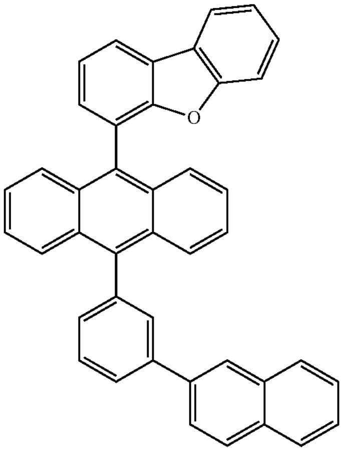
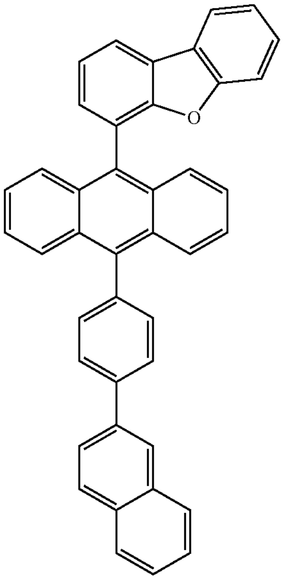
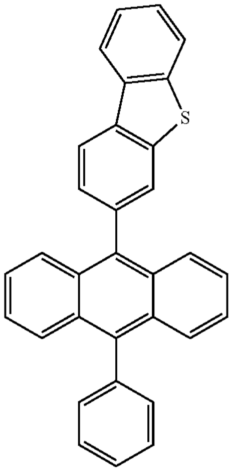

-continued
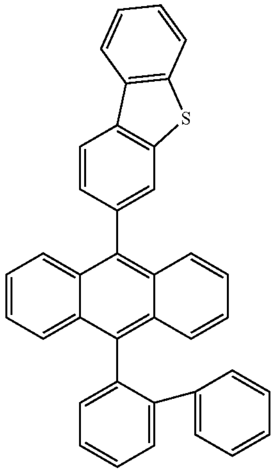
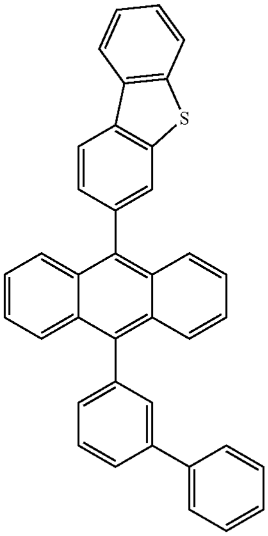
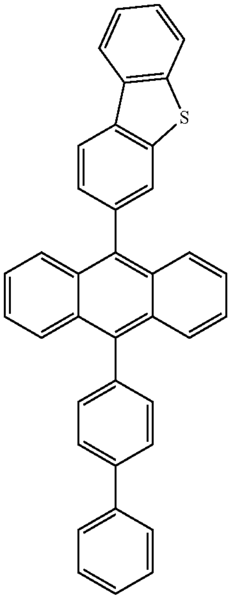
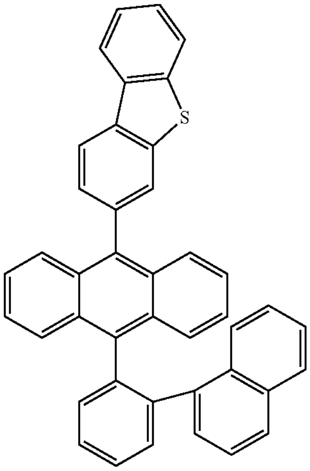
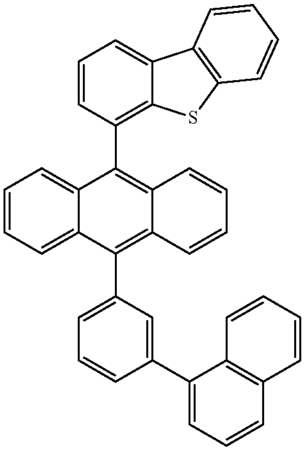
-continued
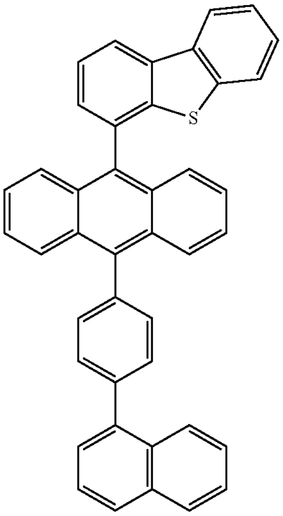
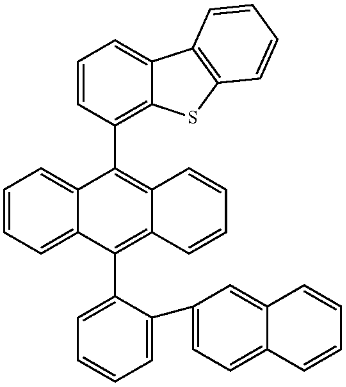
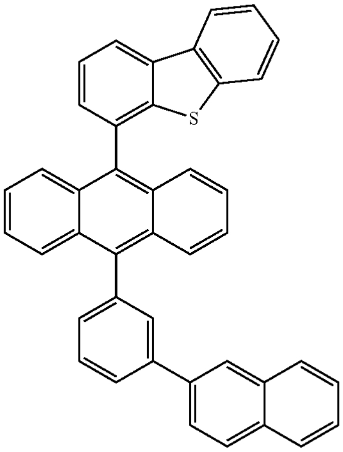

-continued
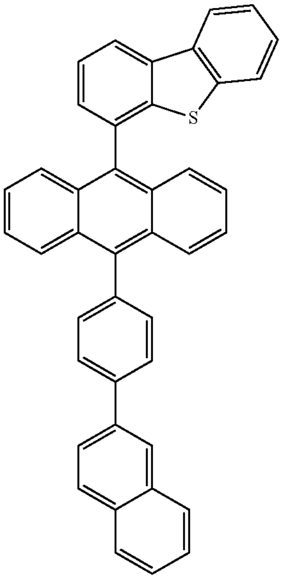
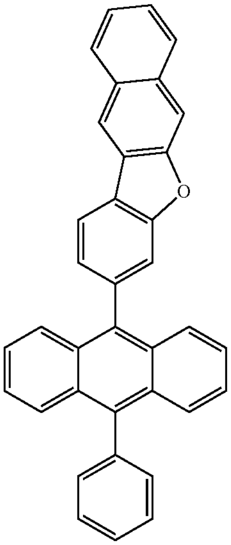
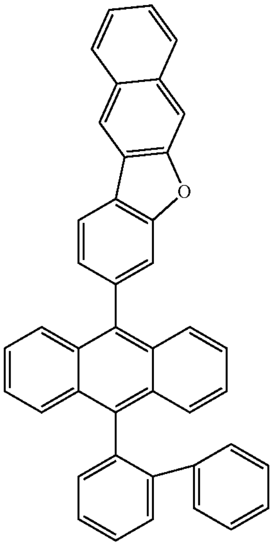
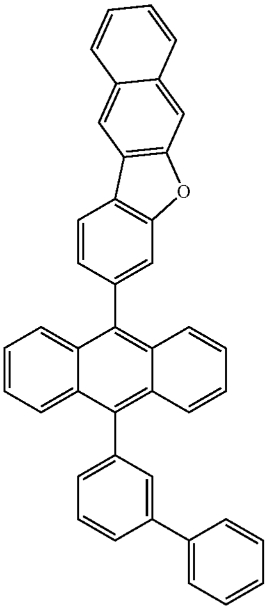
-continued
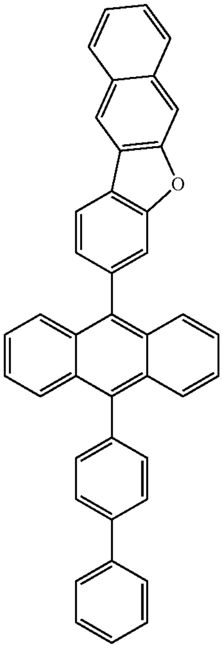
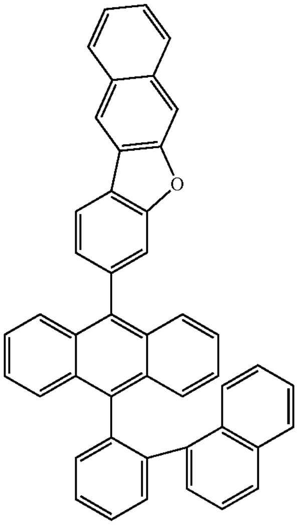
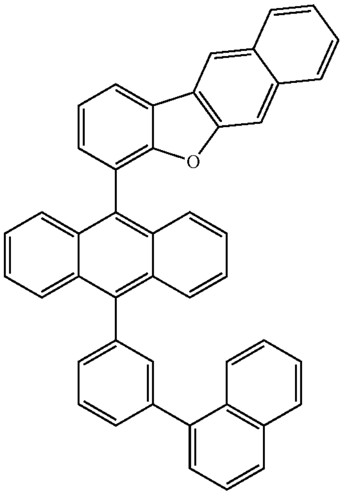
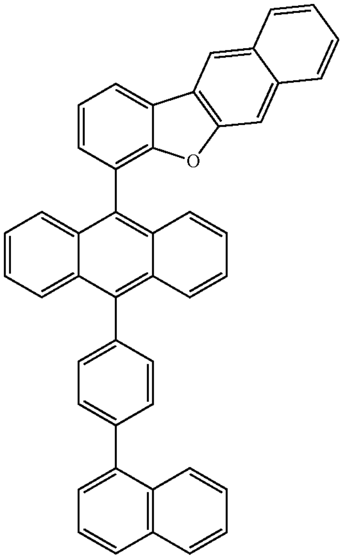

-continued
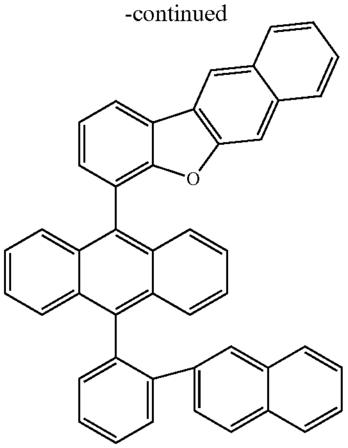
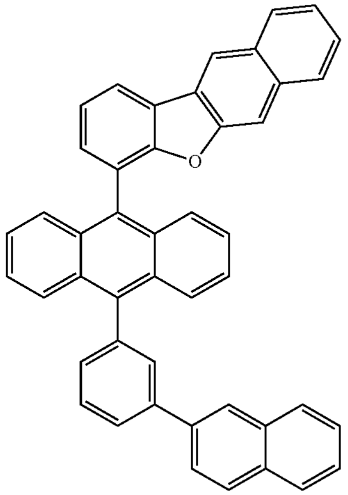
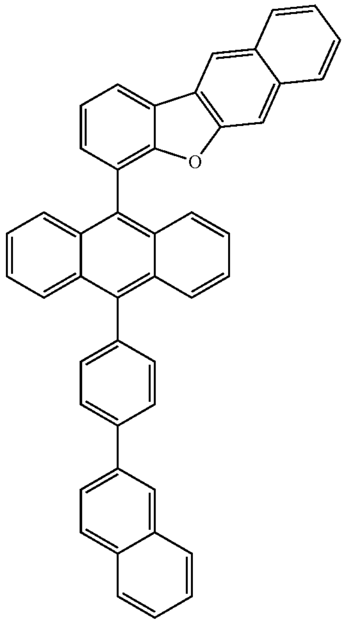
-continued
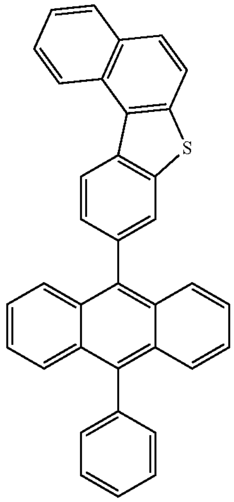
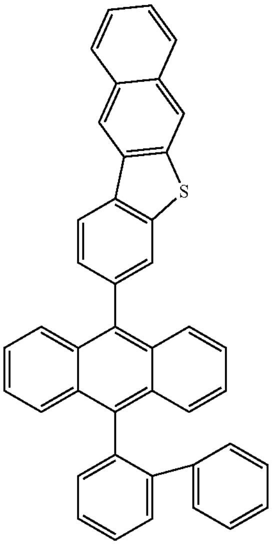
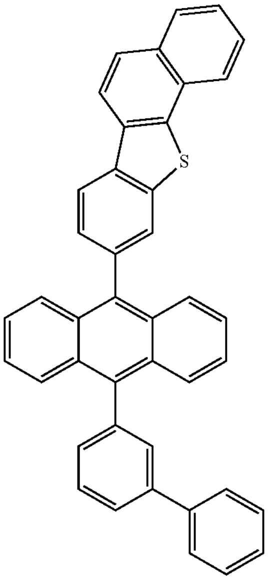
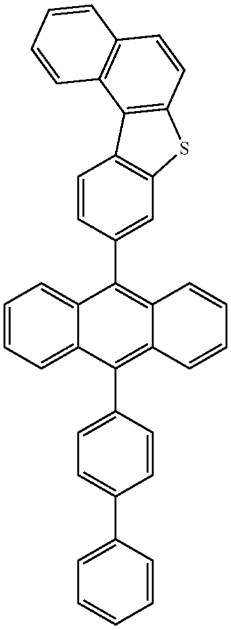
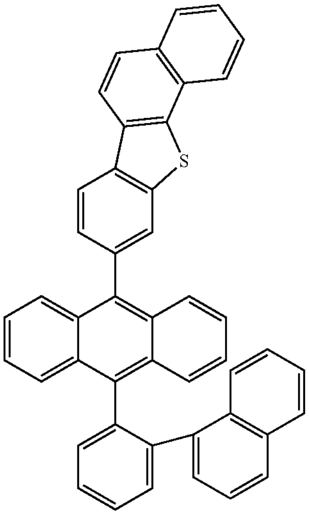

-continued
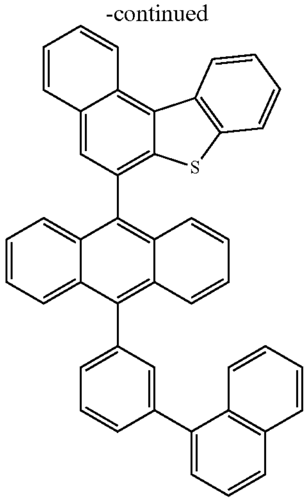
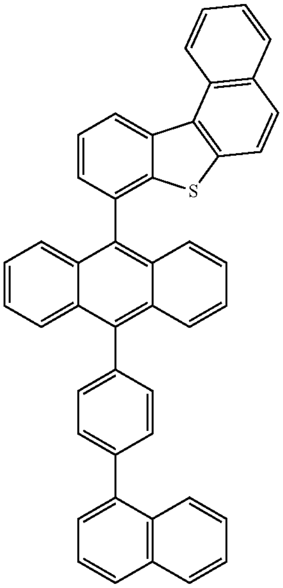
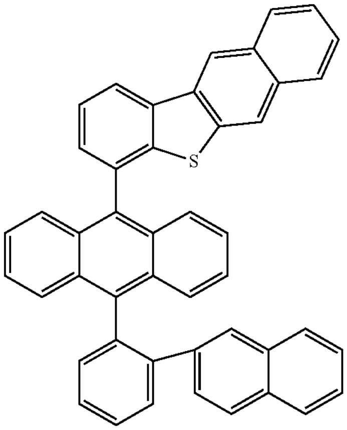
-continued
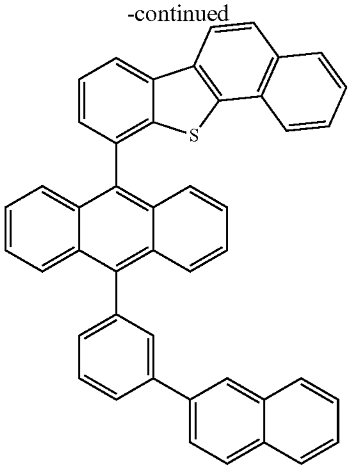
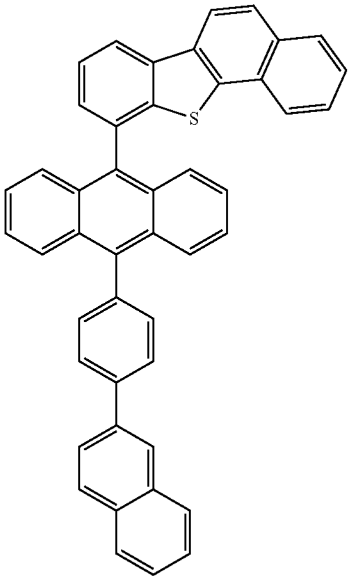
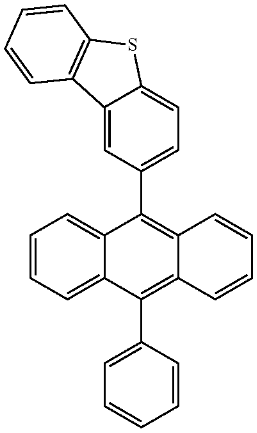
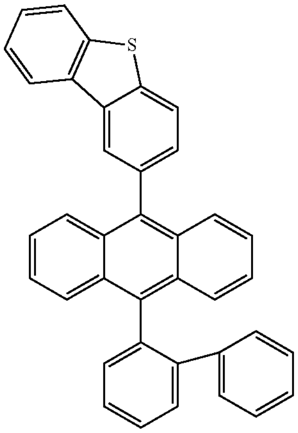

-continued
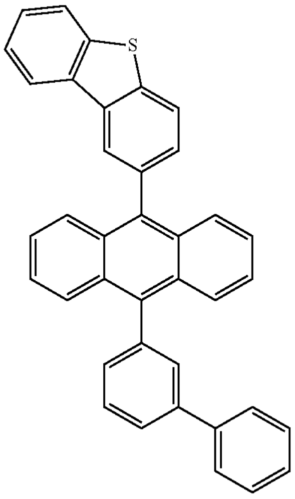
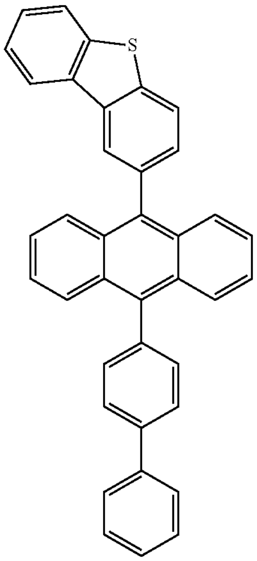
-continued
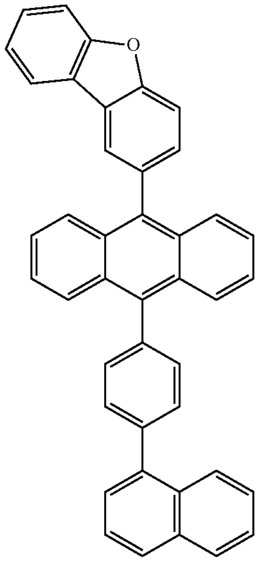
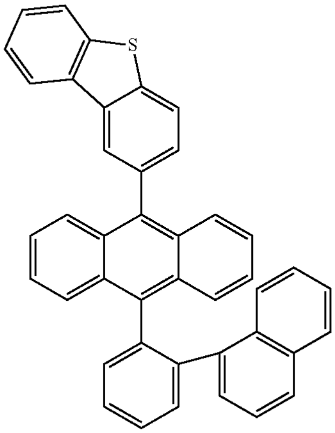
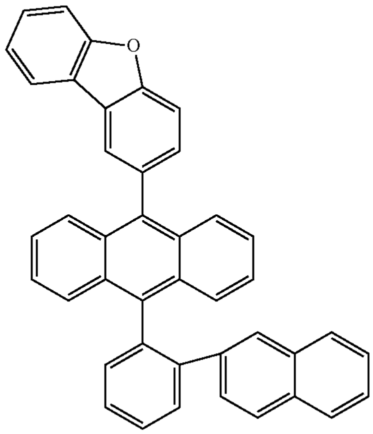
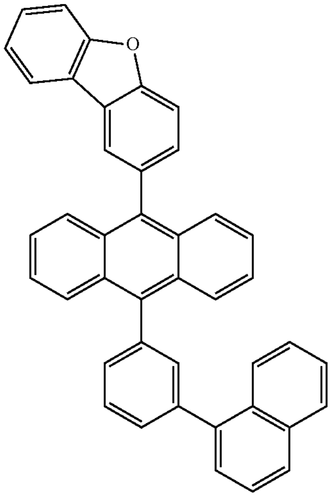
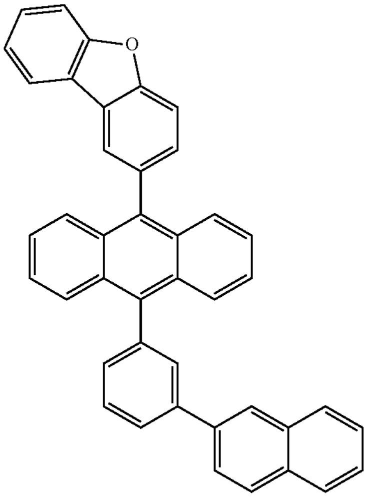

-continued
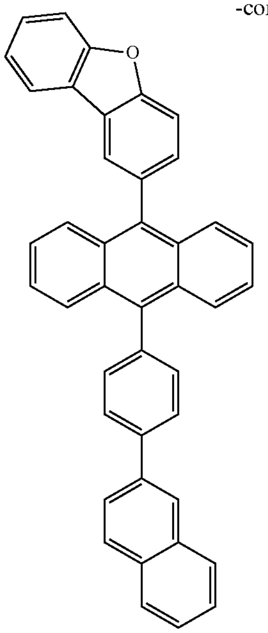
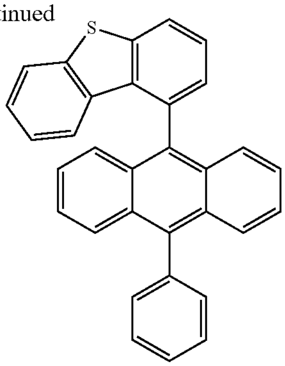
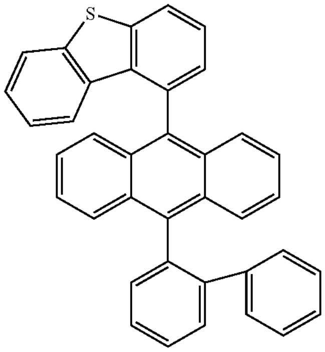
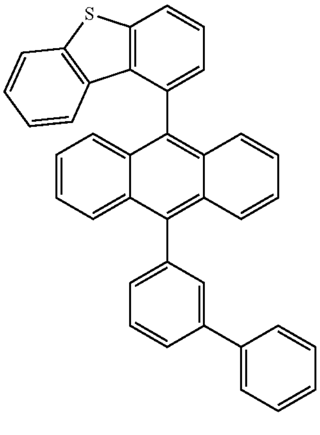
-continued
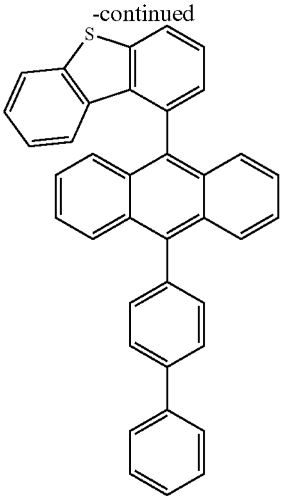
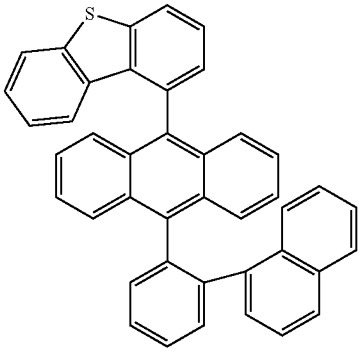
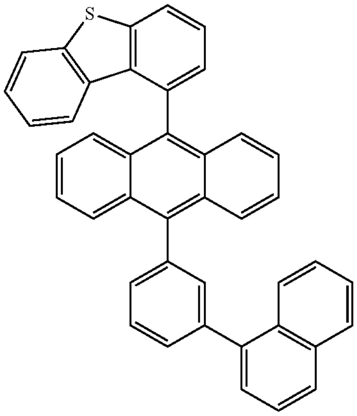
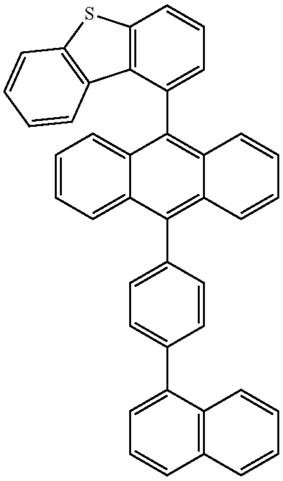

-continued
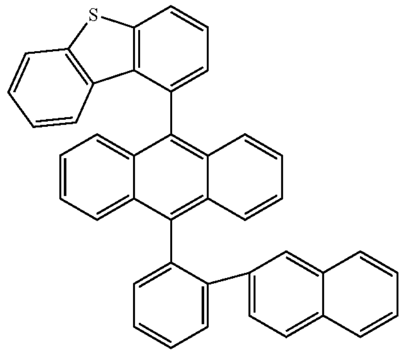
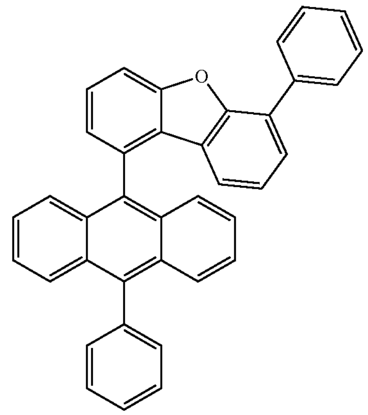
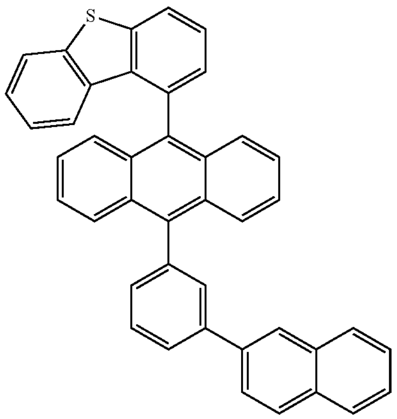
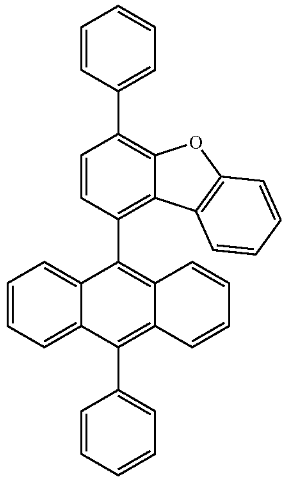
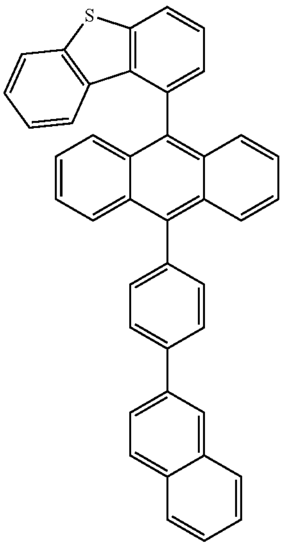
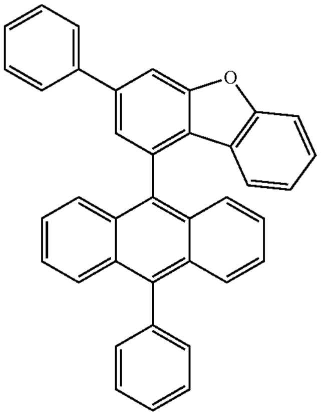

-continued
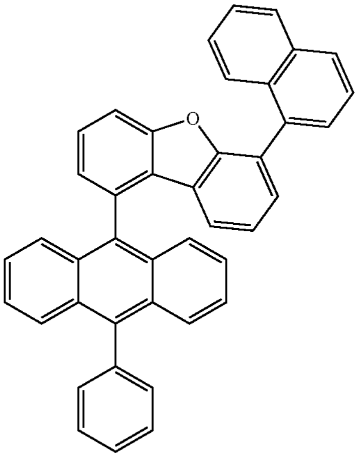
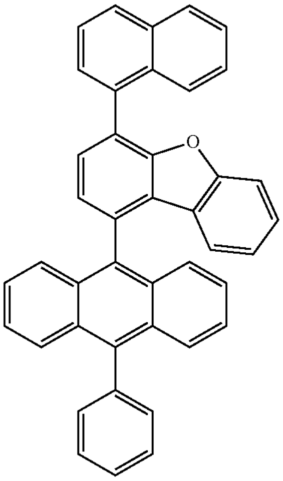
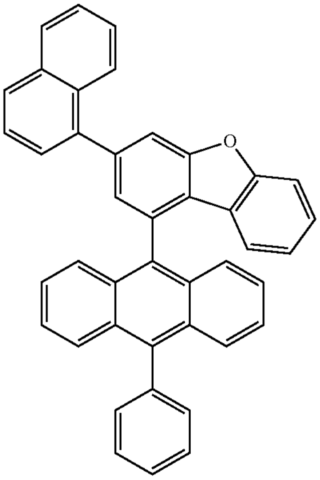
-continued
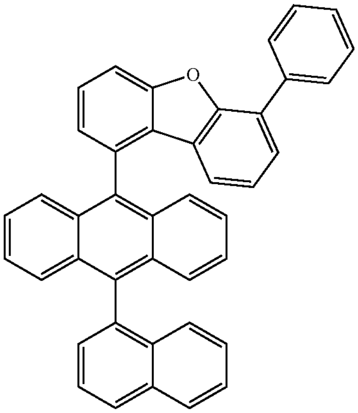
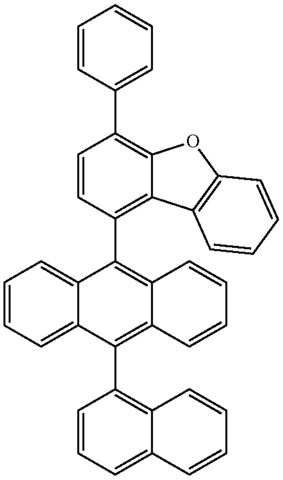
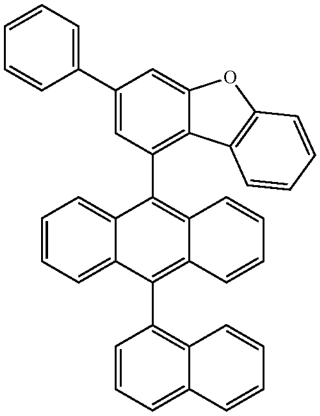

-continued
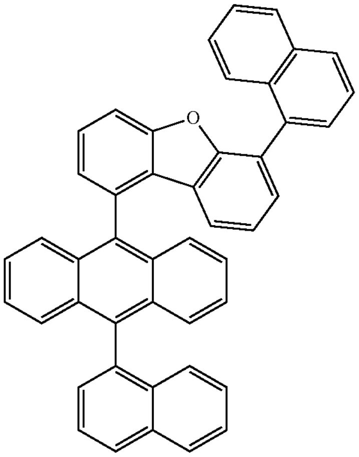
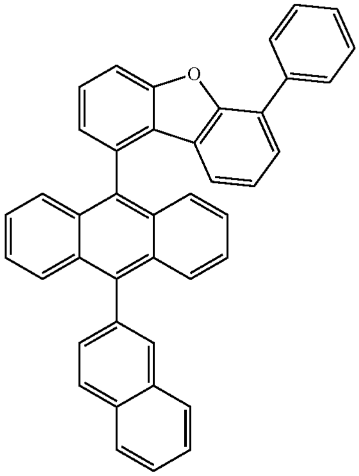
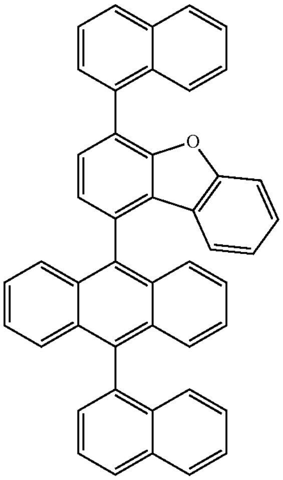
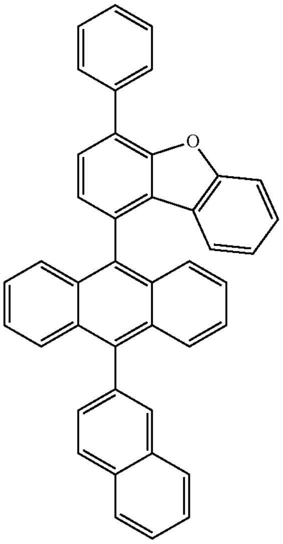
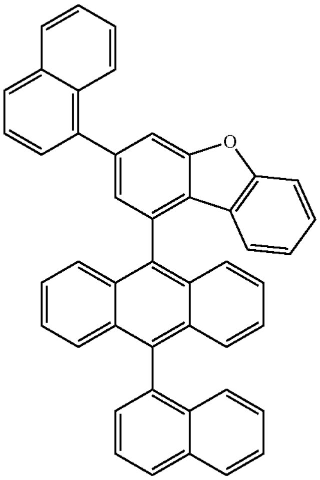
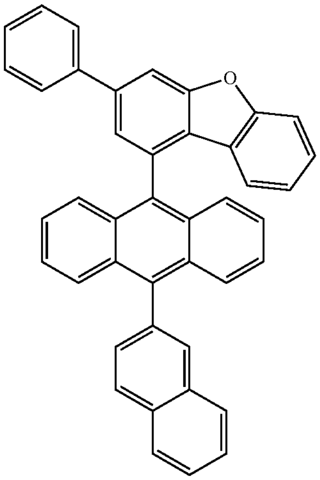
-continued -continued
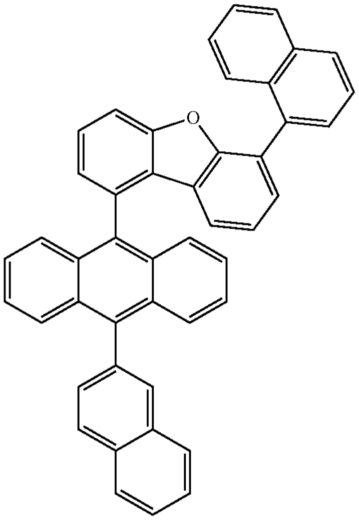
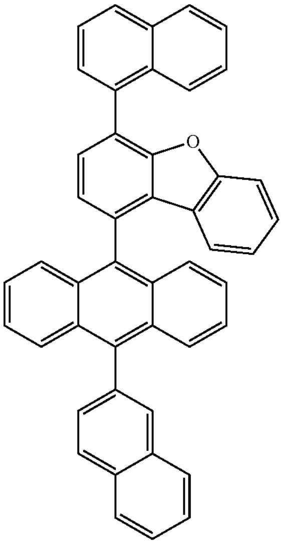
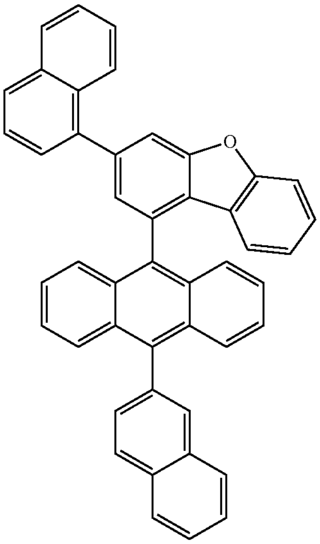
-continued
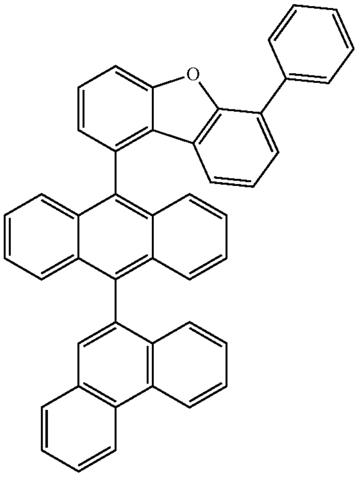
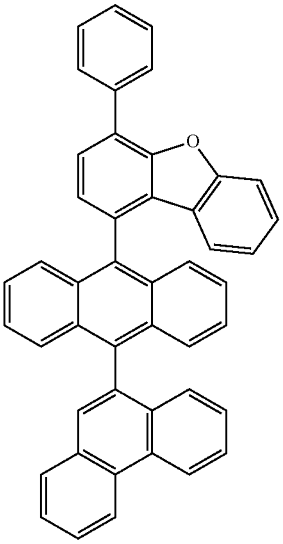
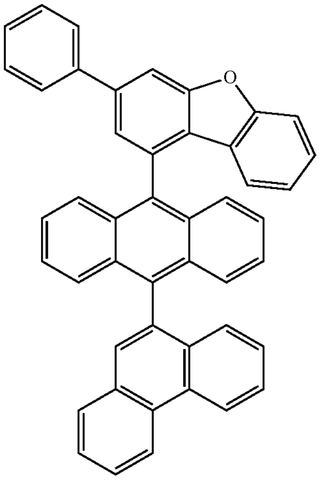

-continued
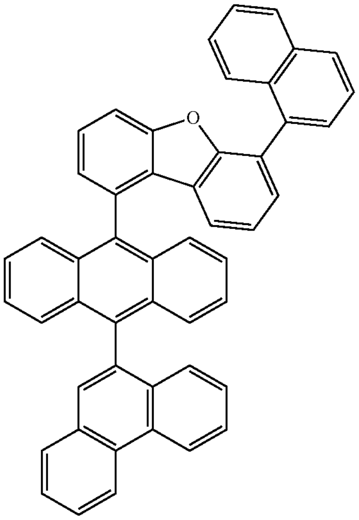
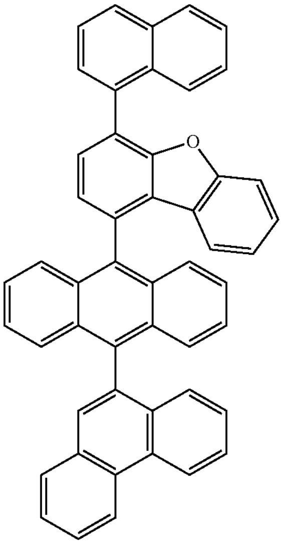
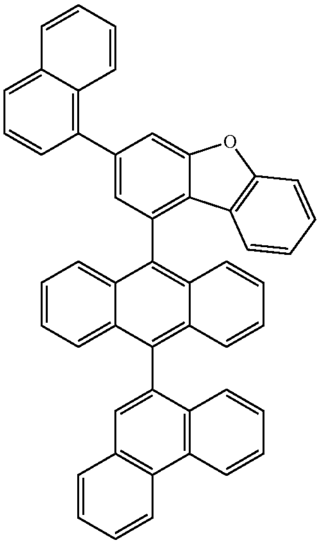
-continued
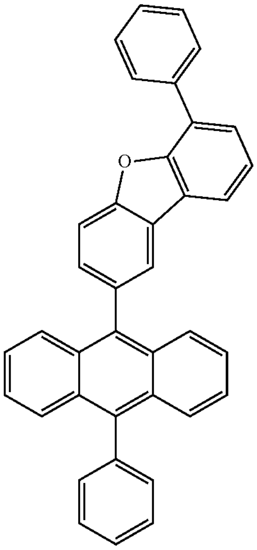
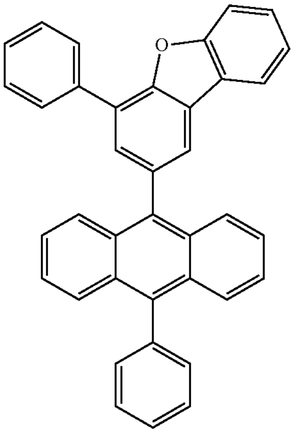
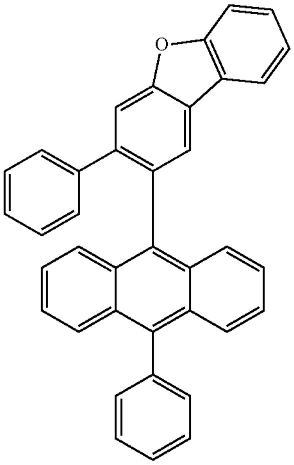

-continued
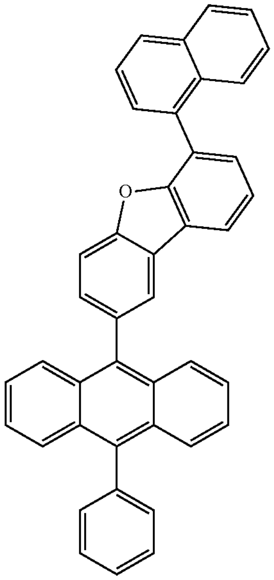
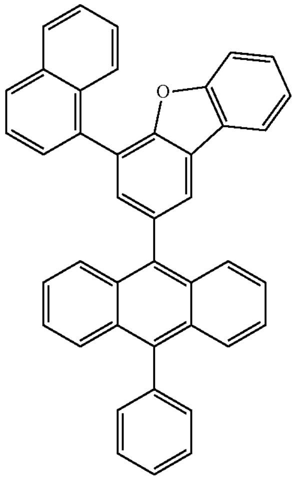
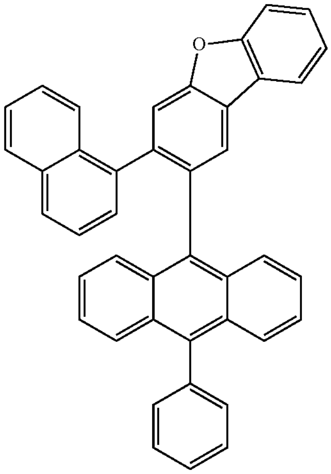
-continued
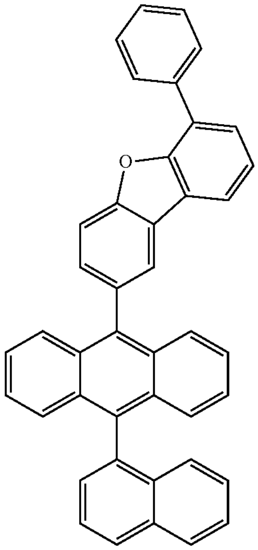
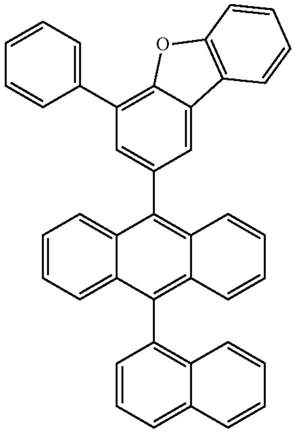
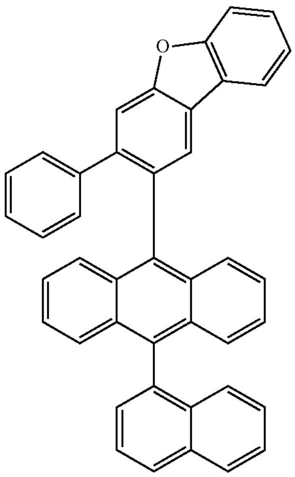

-continued
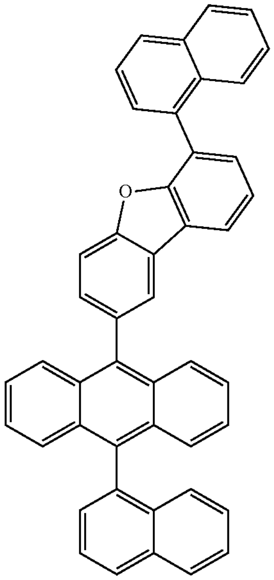
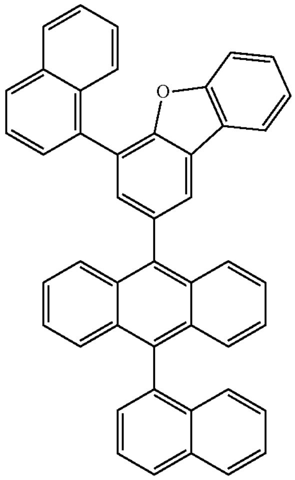
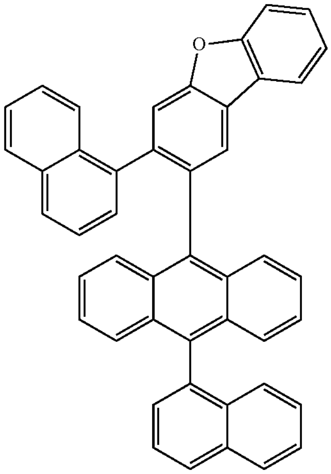
-continued
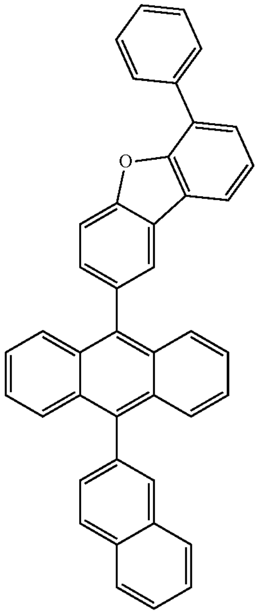
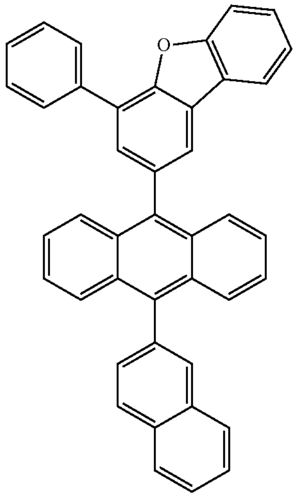
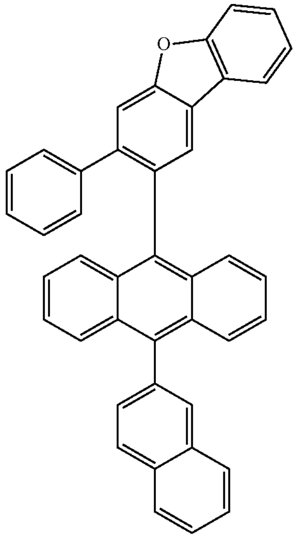

-continued
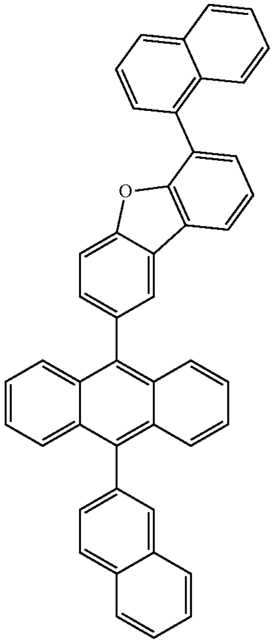
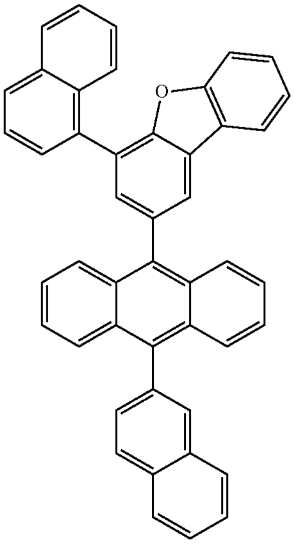
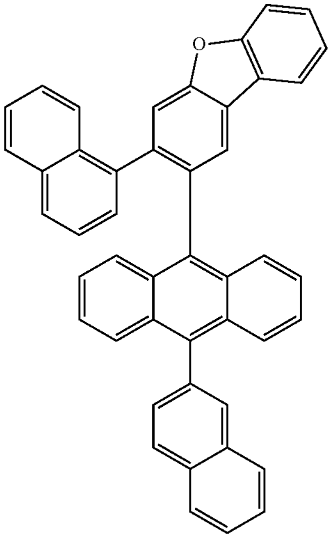
-continued
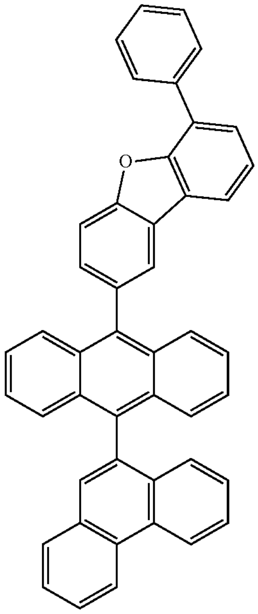
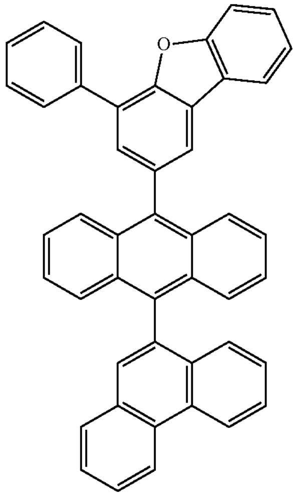
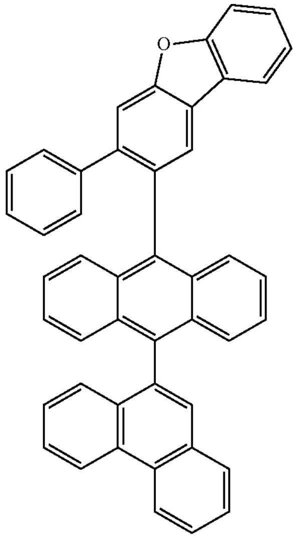

-continued
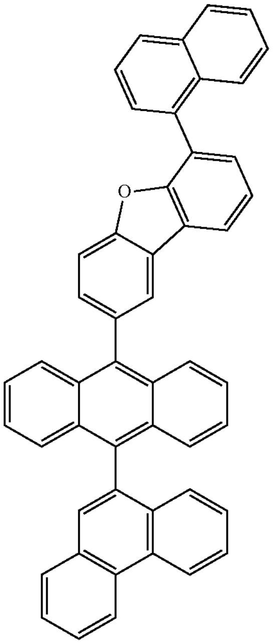
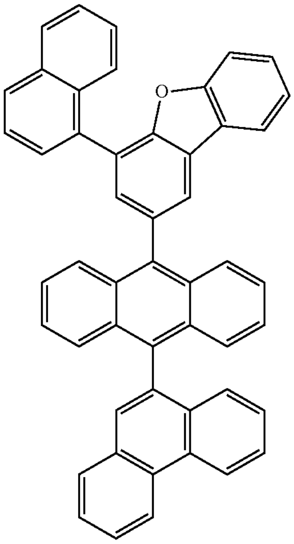
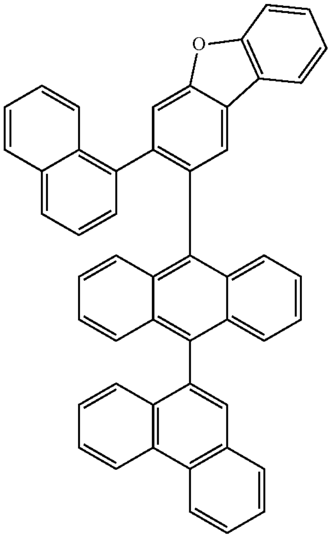
-continued
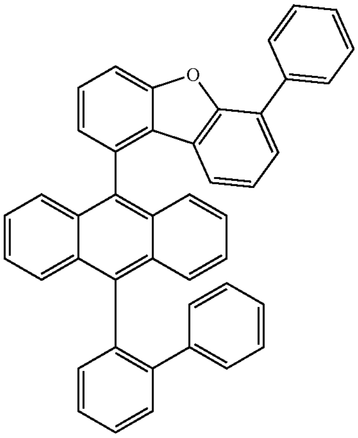
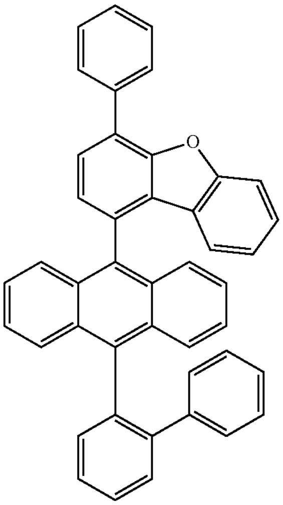
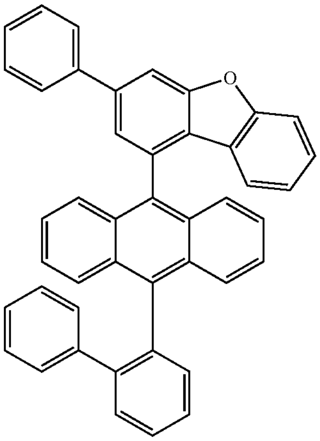

-continued
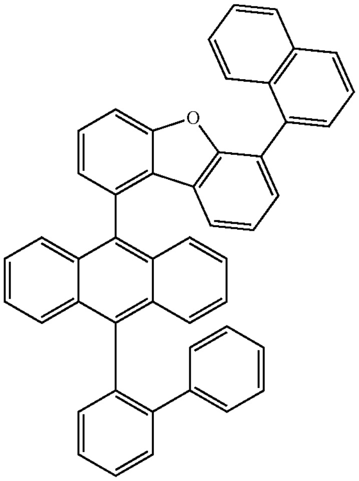
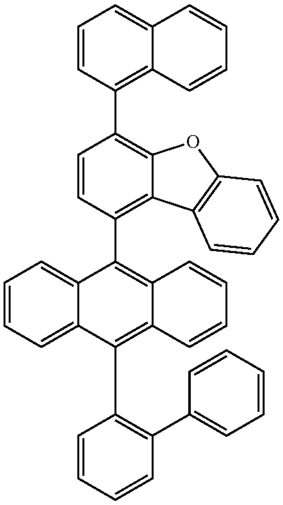
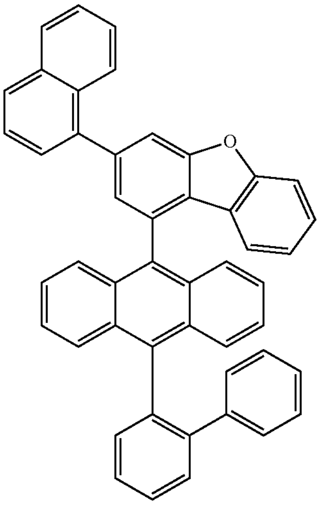
-continued
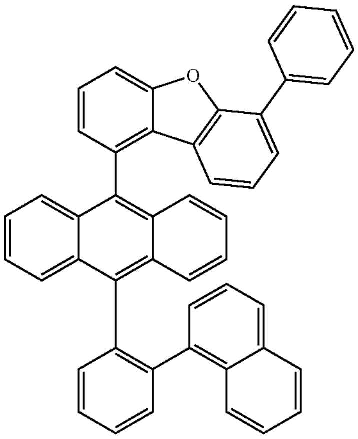
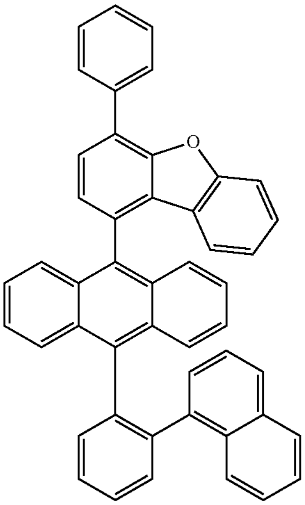
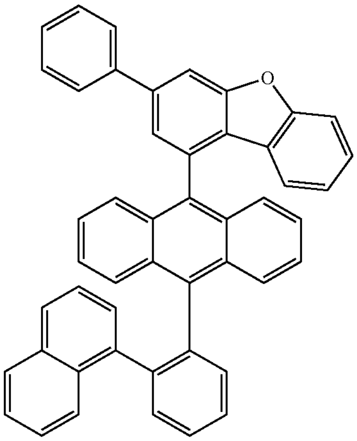

-continued
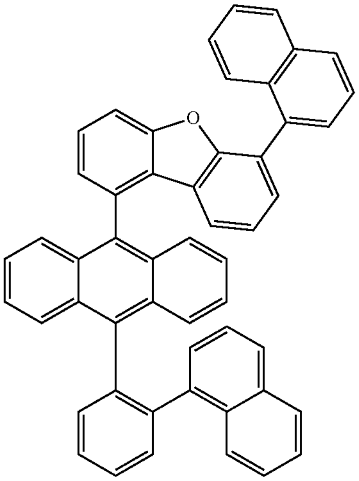
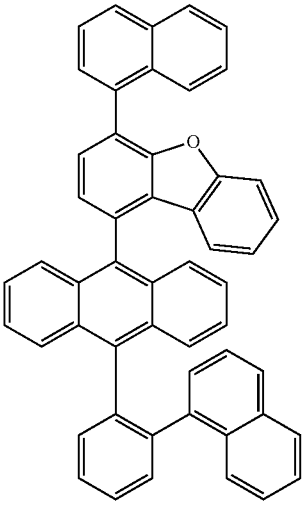
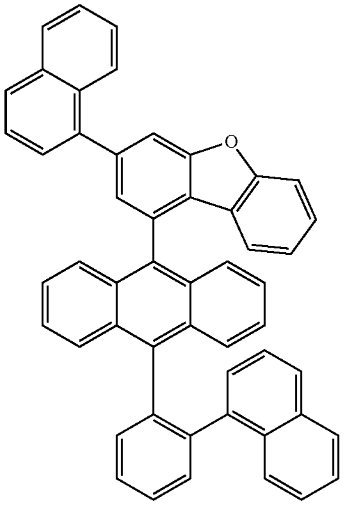
-continued
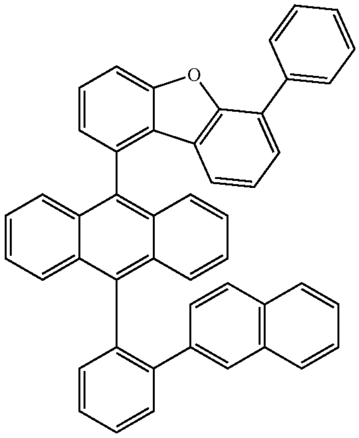
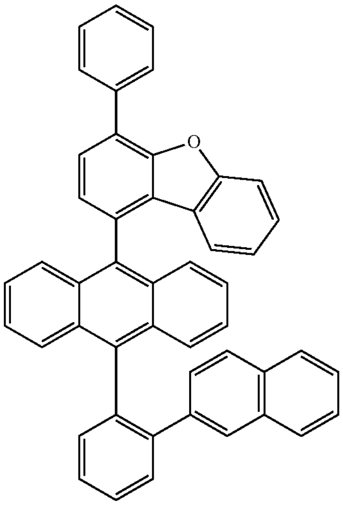
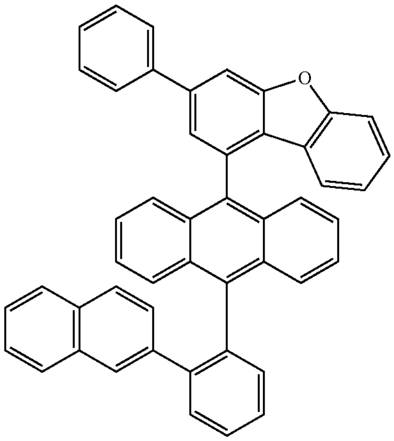

-continued
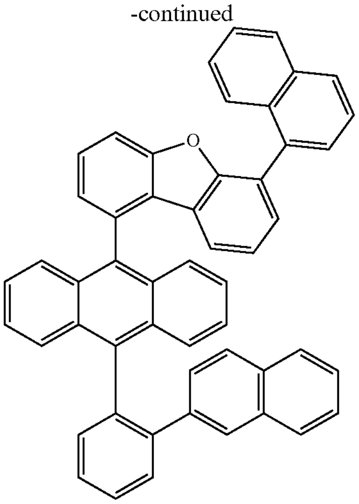
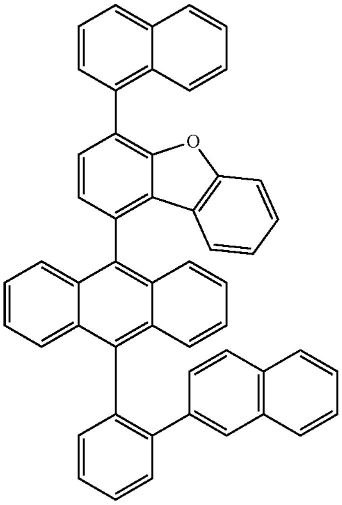
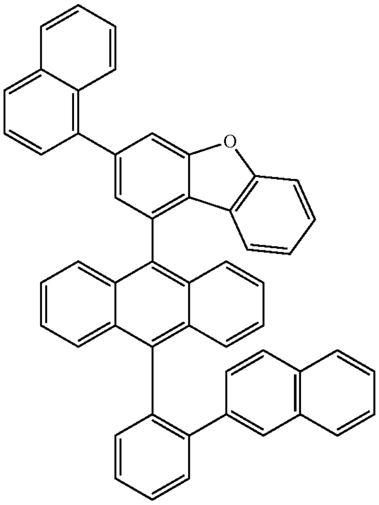
-continued
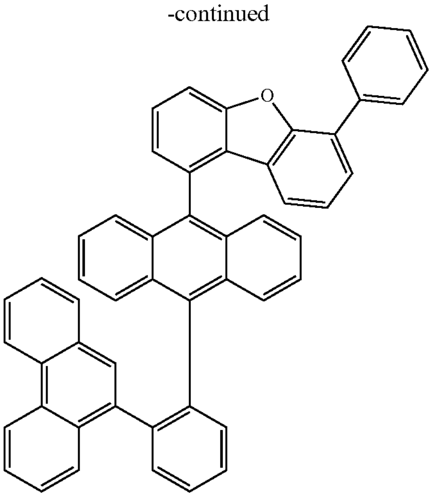
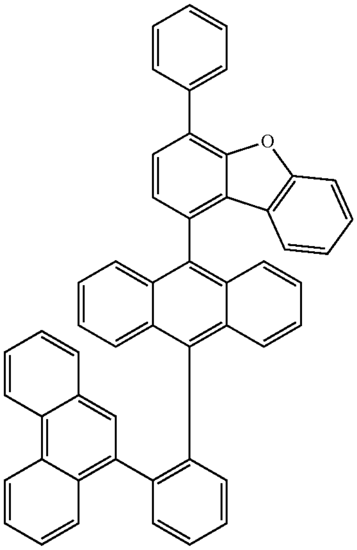
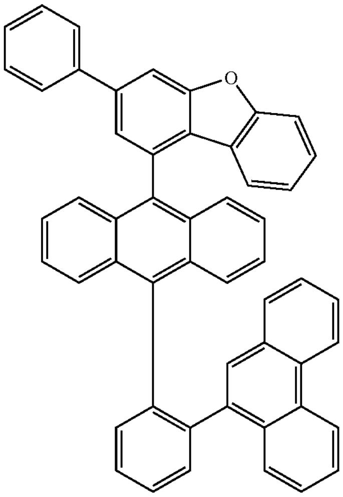

-continued
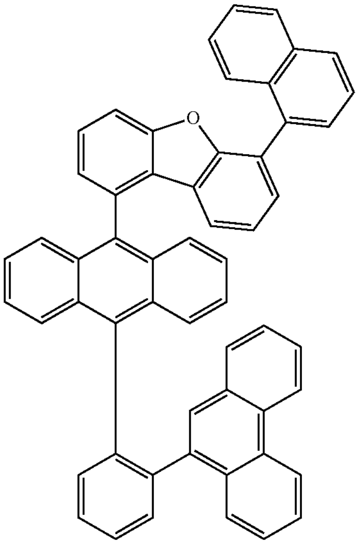
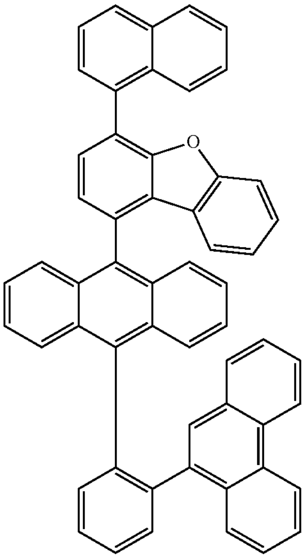
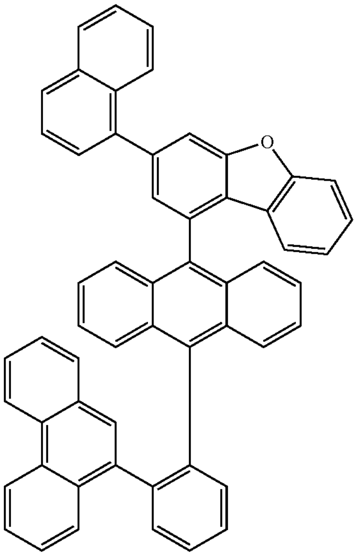
-continued
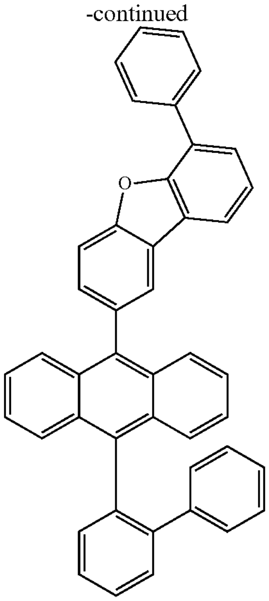
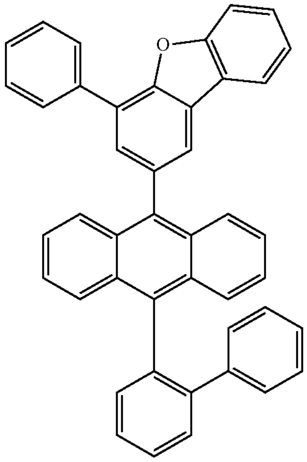
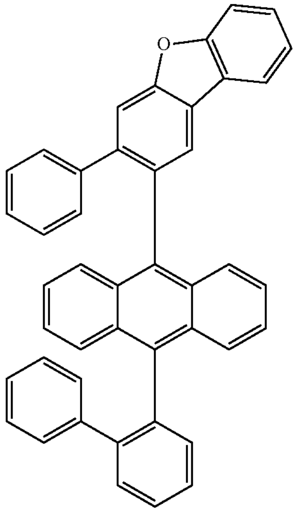

-continued
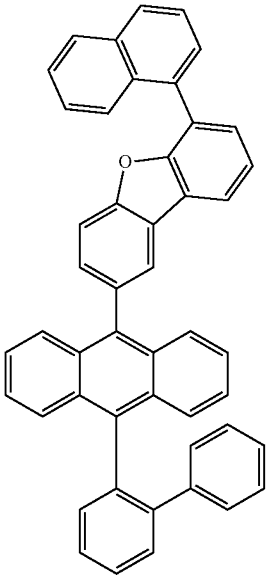
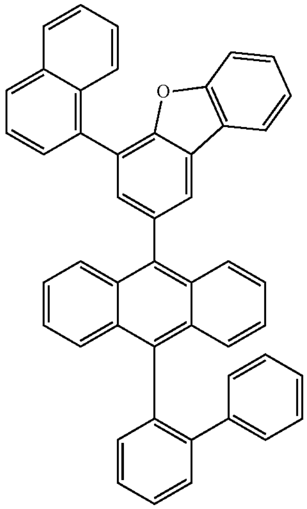
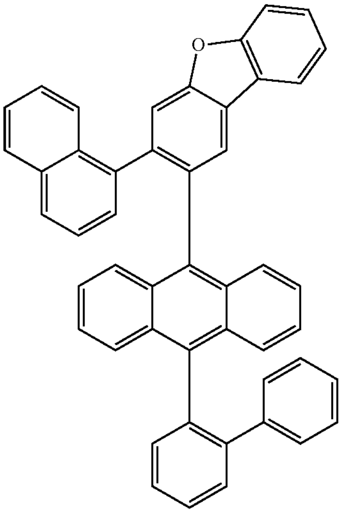
-continued
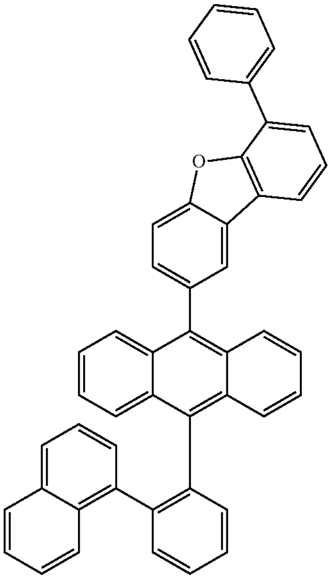
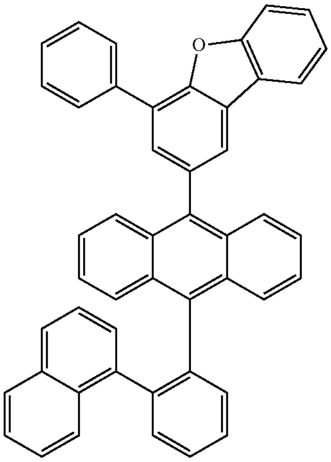
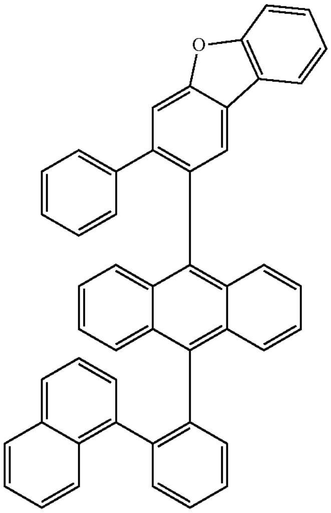

-continued
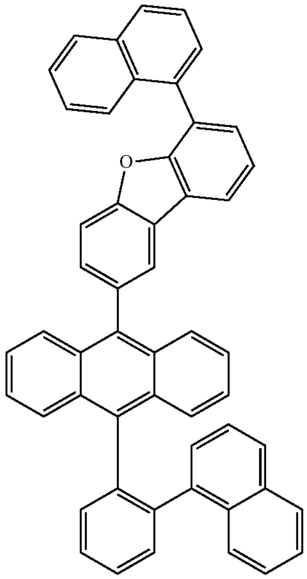
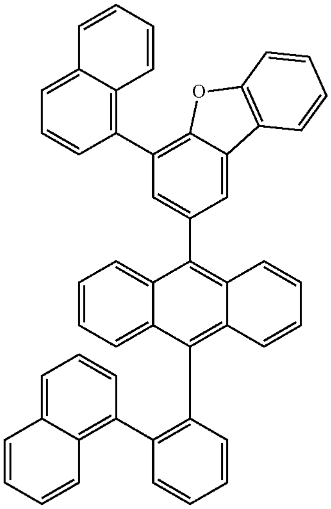
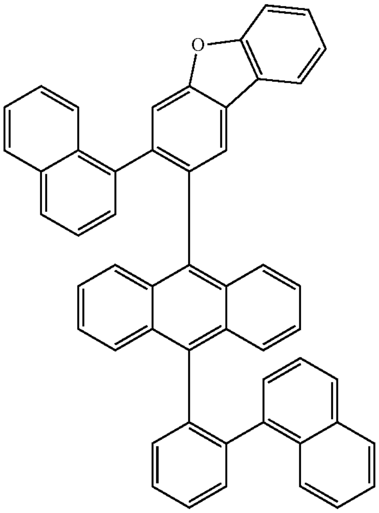
-continued
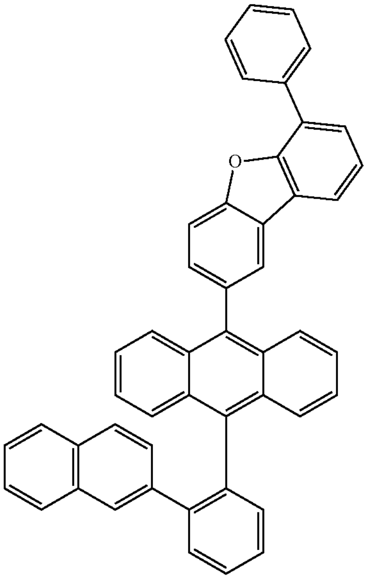
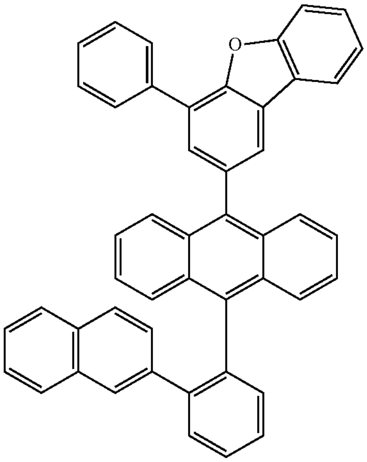
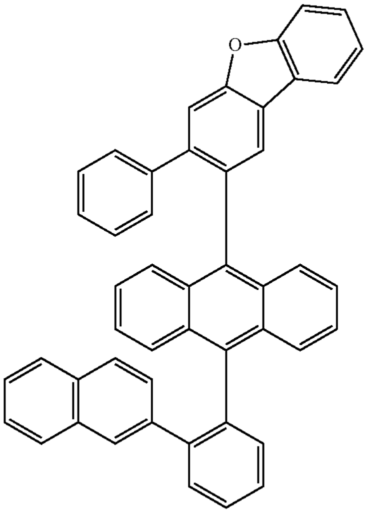

-continued
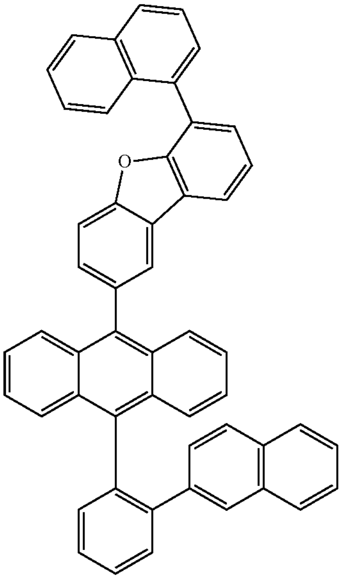
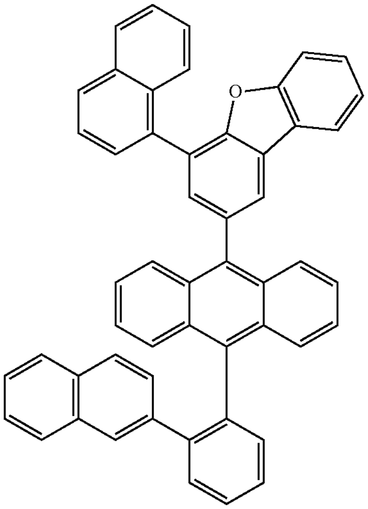
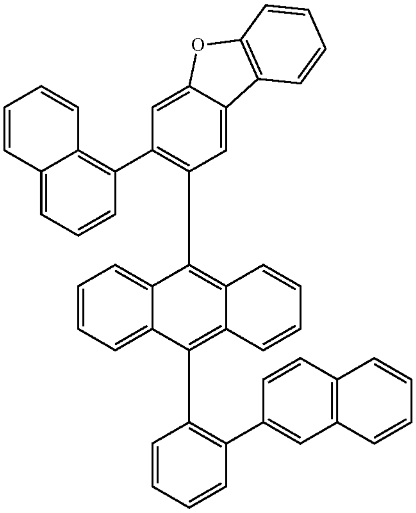
-continued
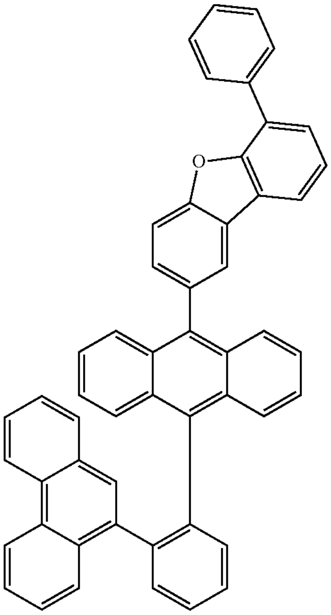
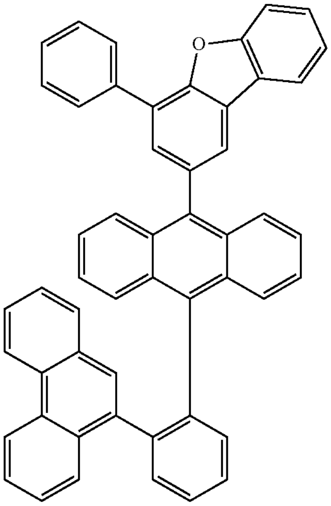
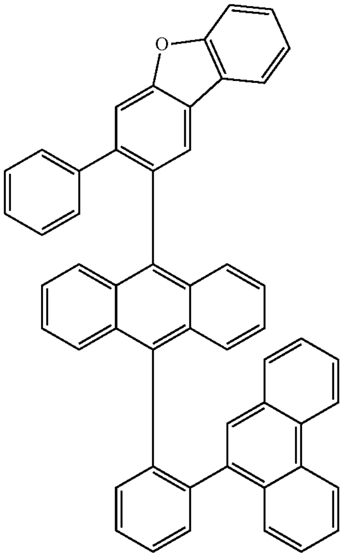

-continued
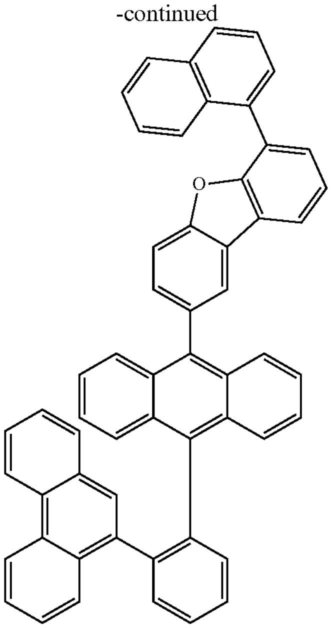
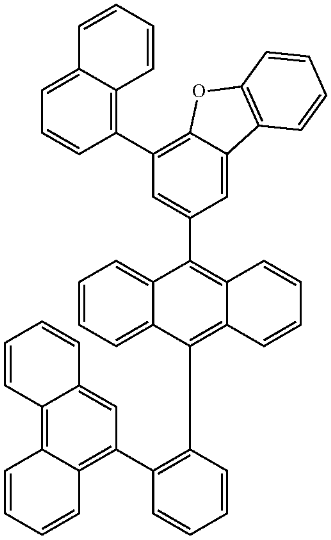
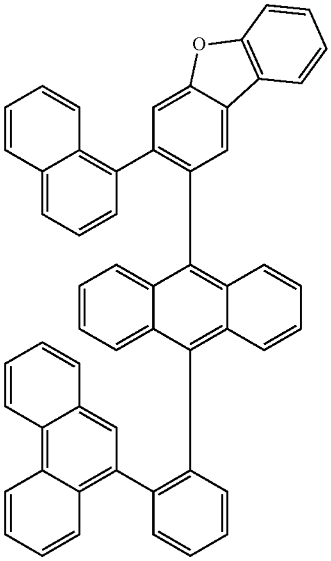
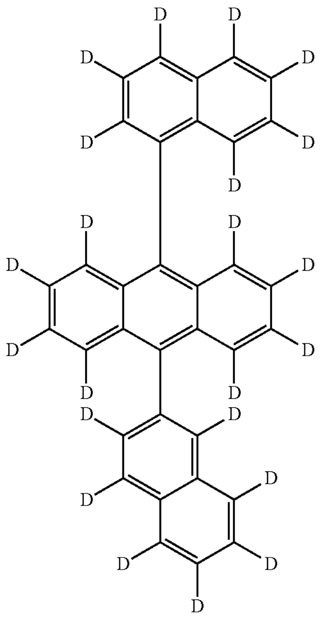
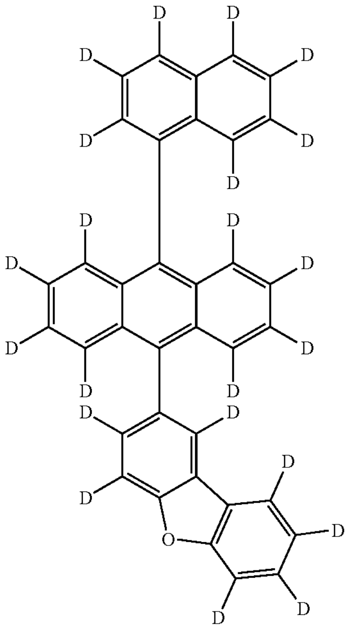

-continued
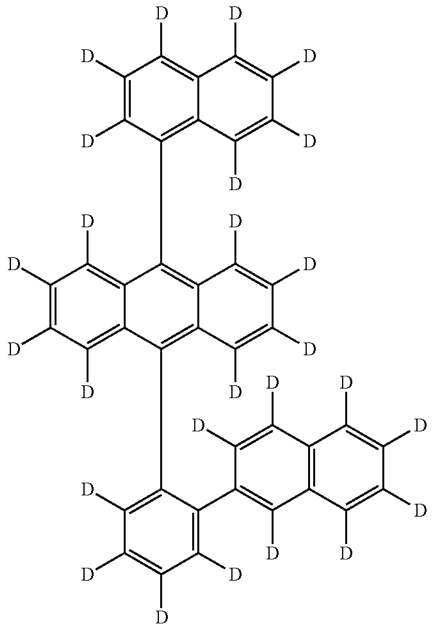
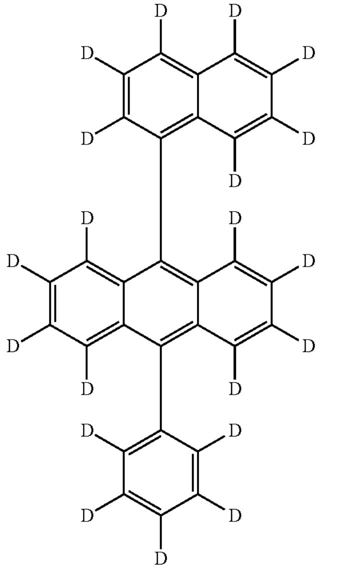
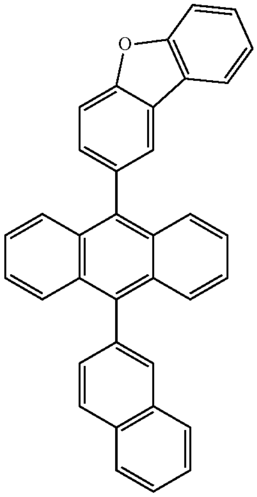
-continued
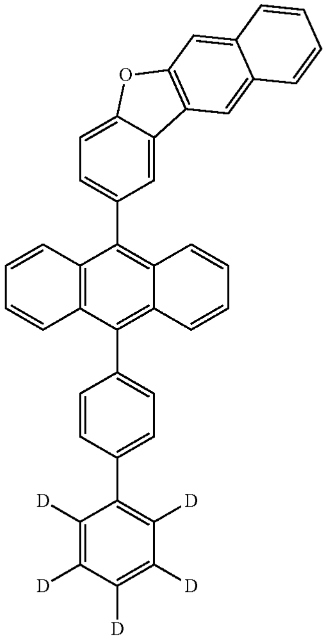
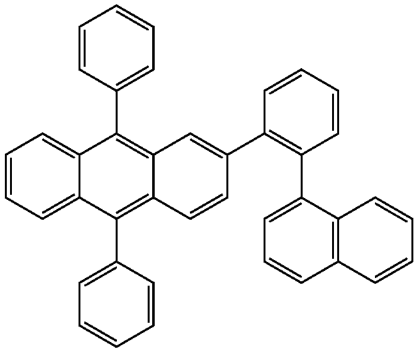
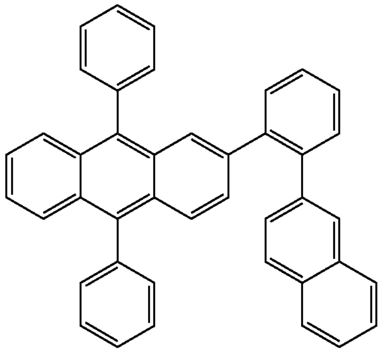
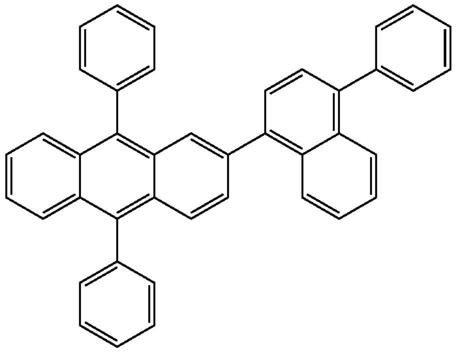

-continued
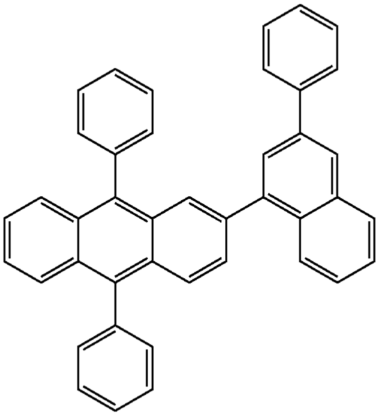
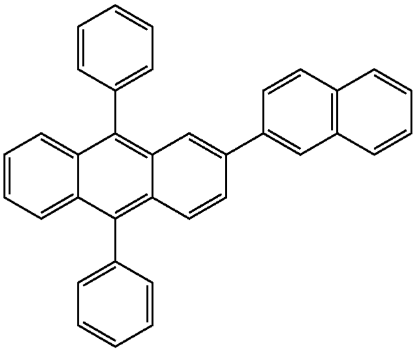
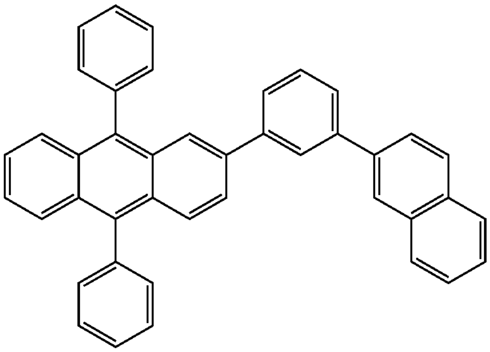
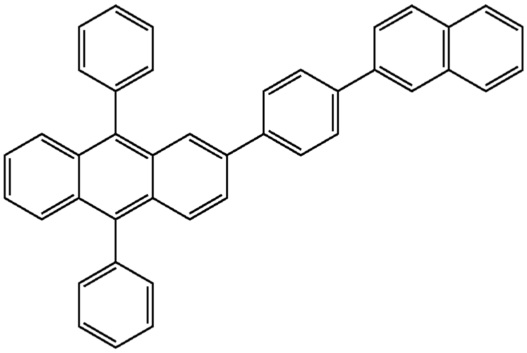
-continued
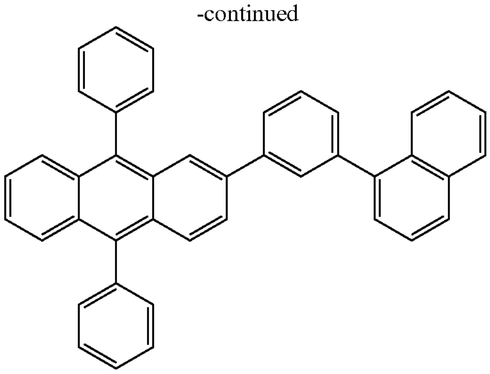
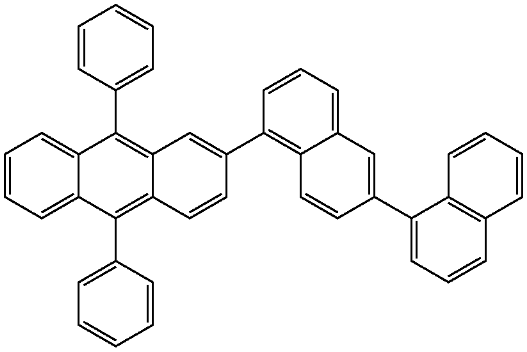
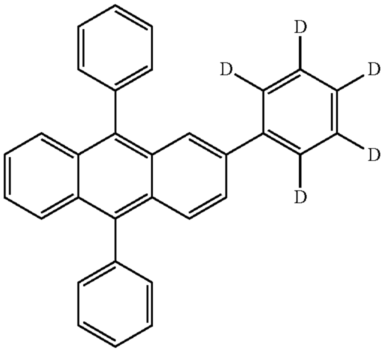
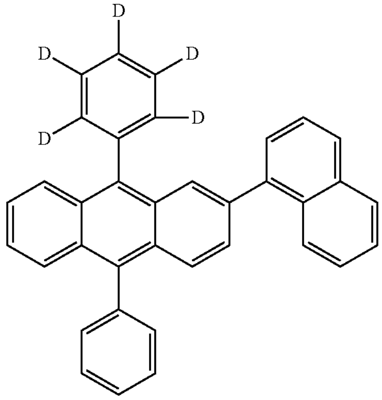

-continued
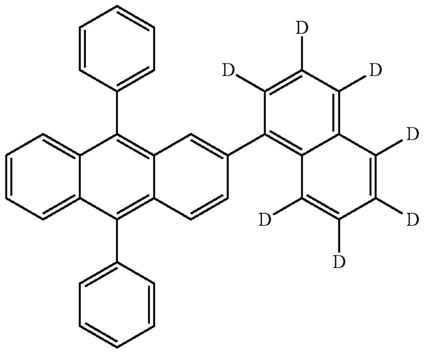
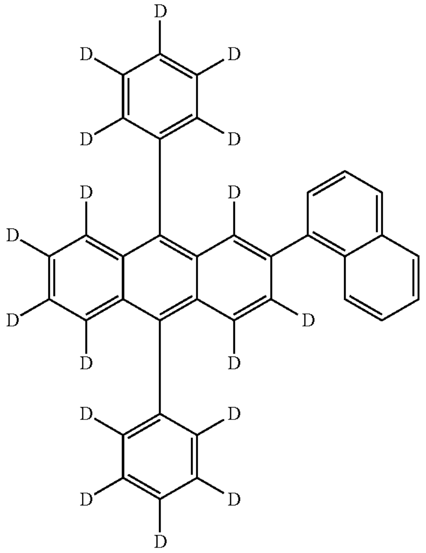
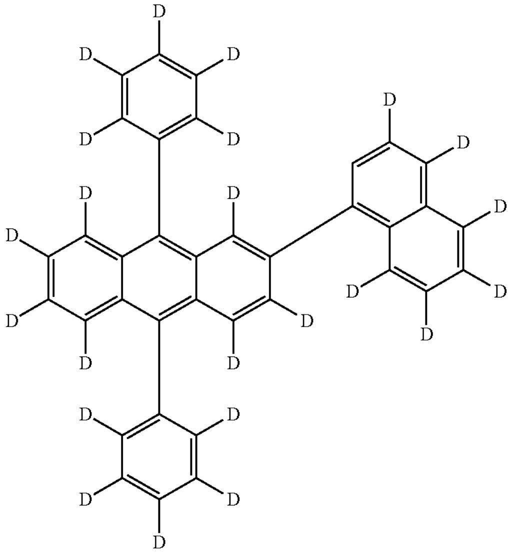
-continued
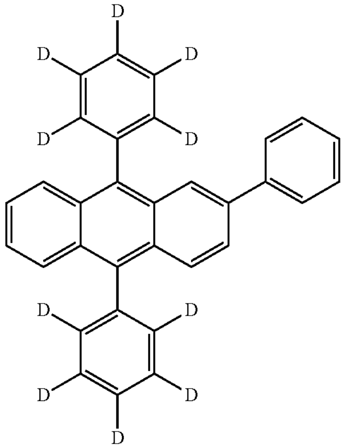
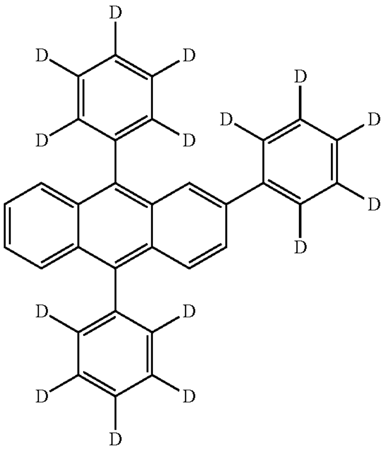
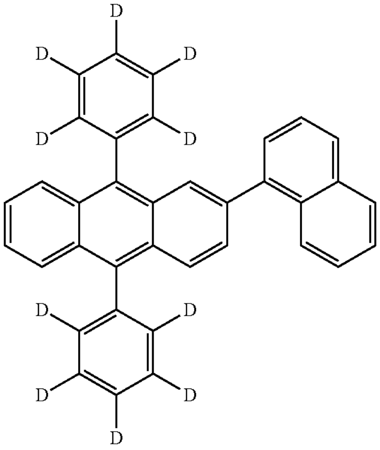

-continued
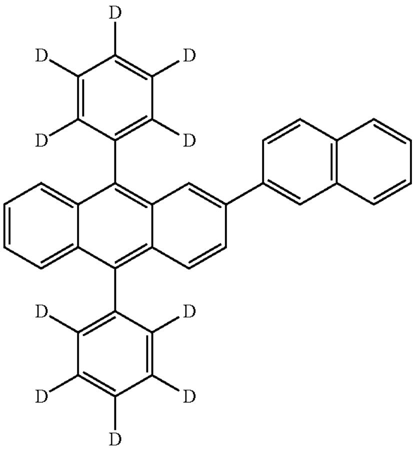
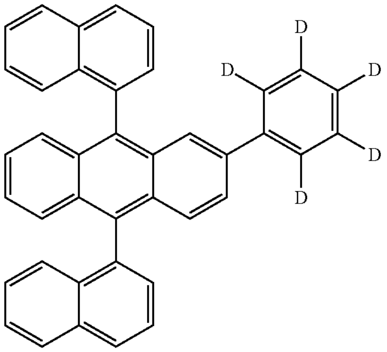
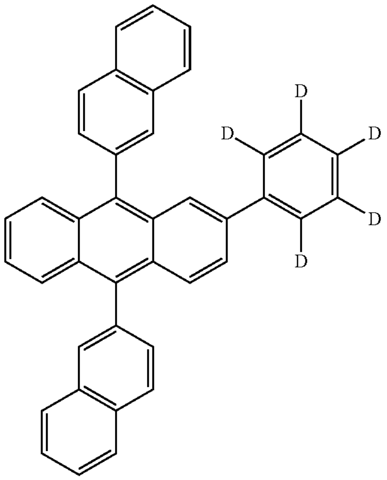
-continued
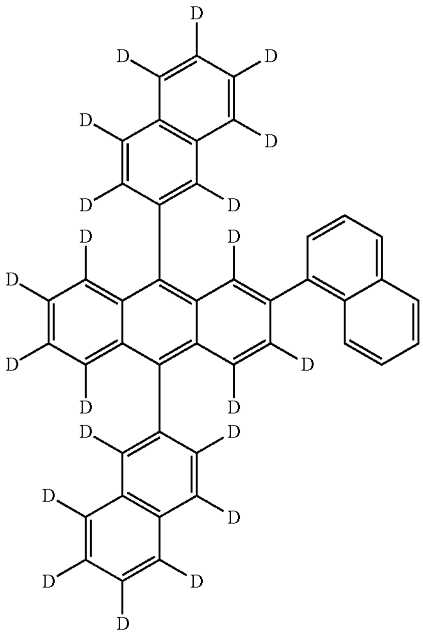
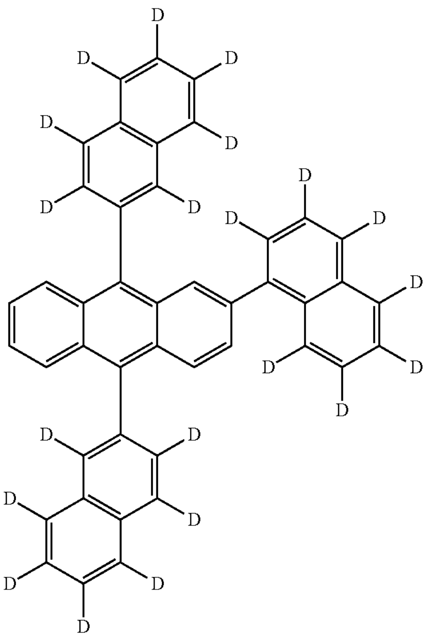

-continued
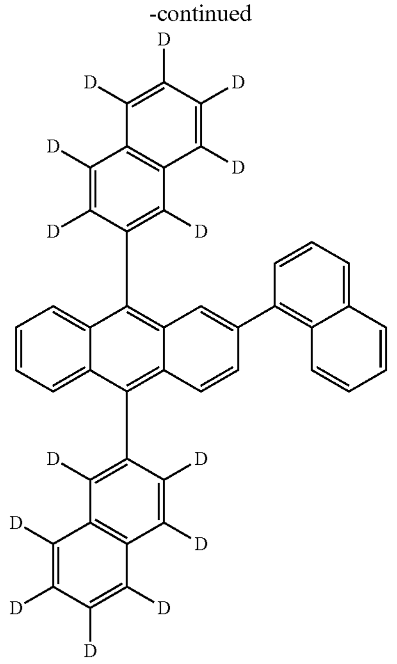
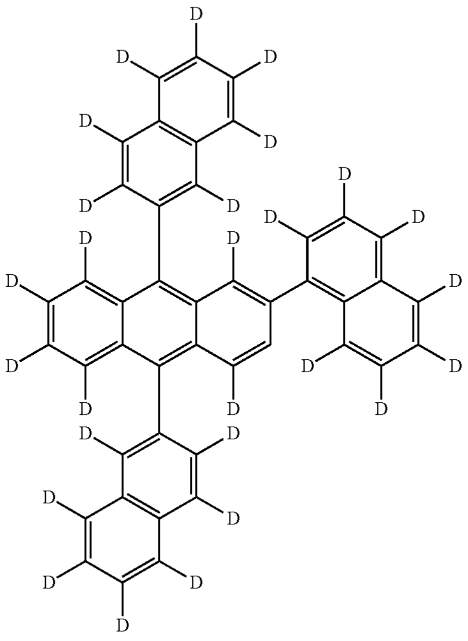
-continued
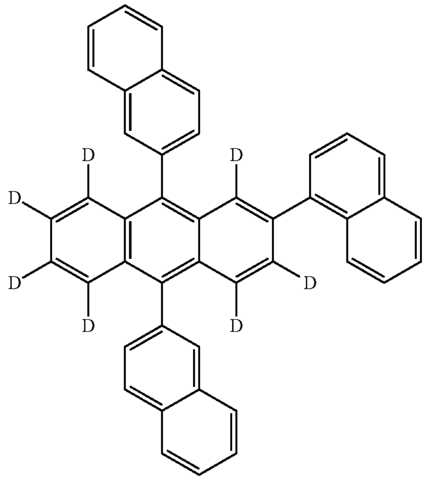
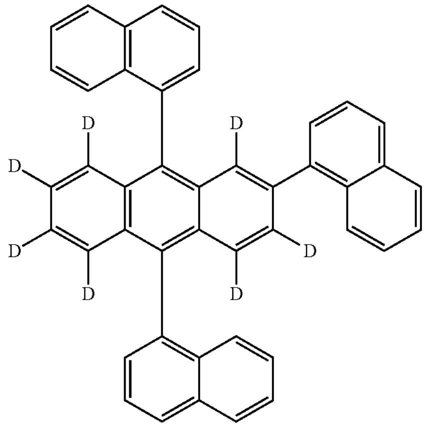
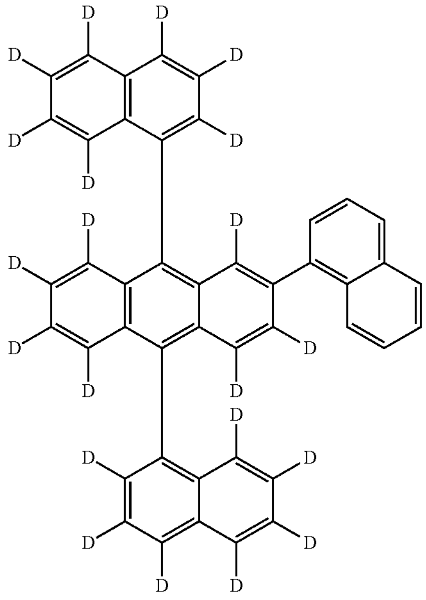

-continued
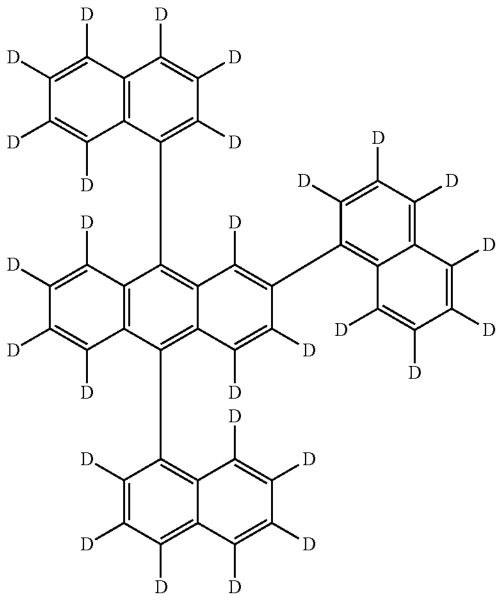
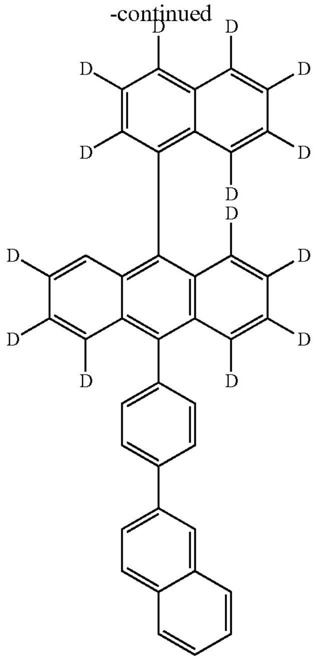
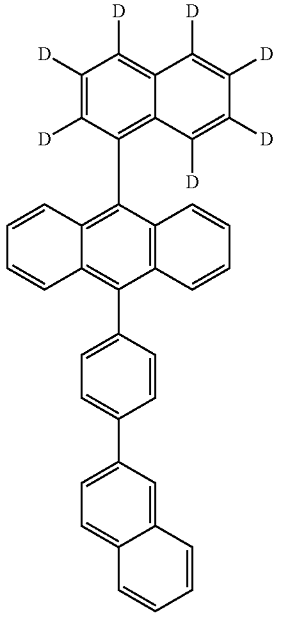
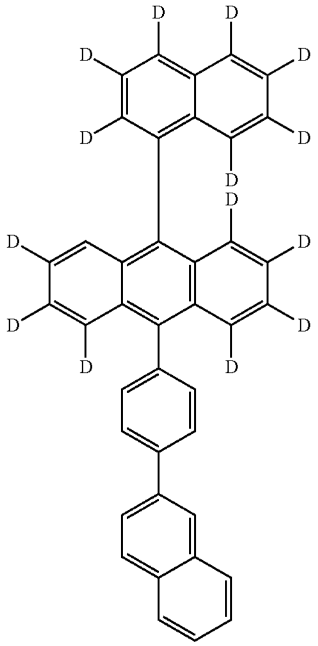

-continued
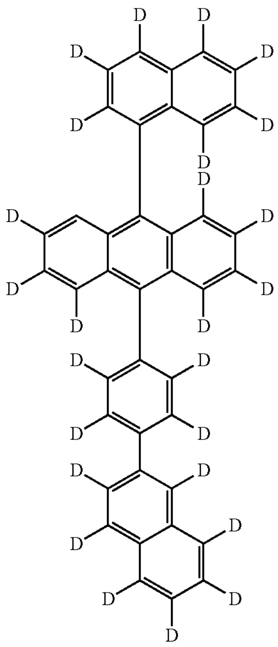
-continued
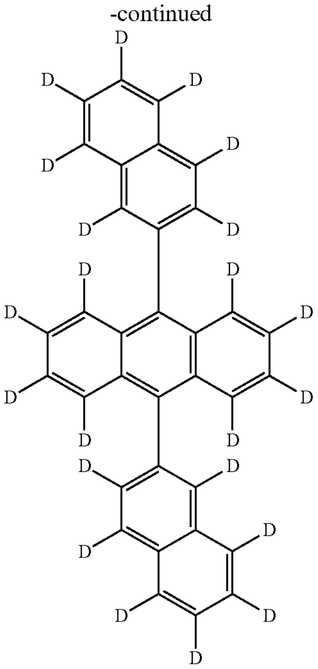
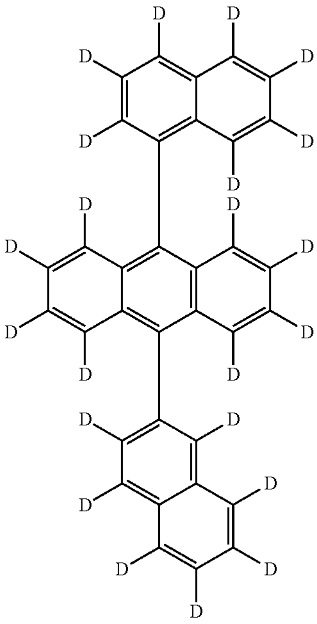
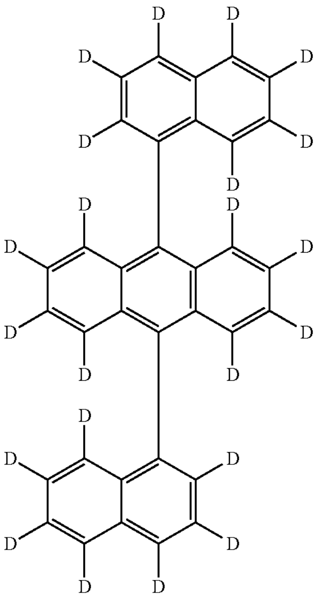

-continued
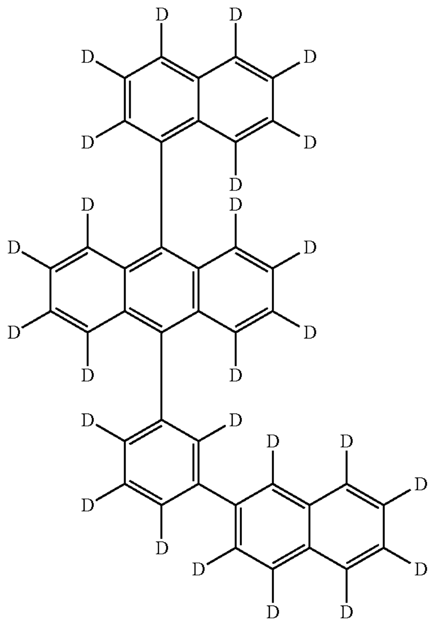
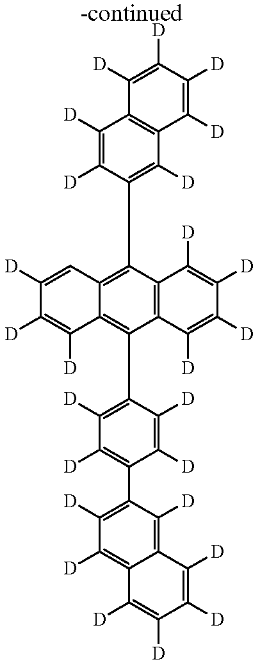
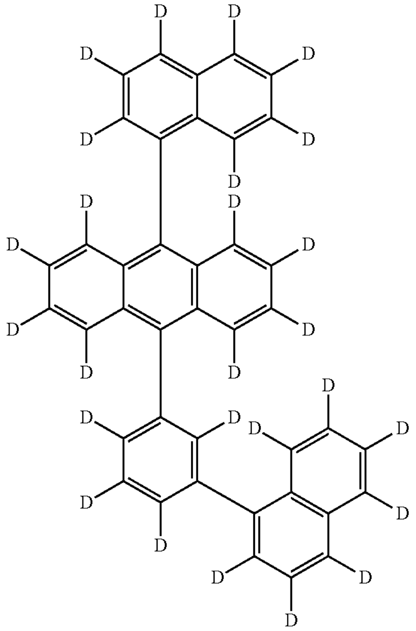
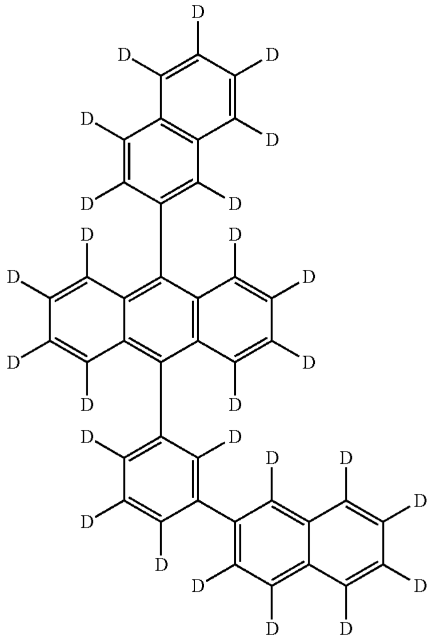

-continued
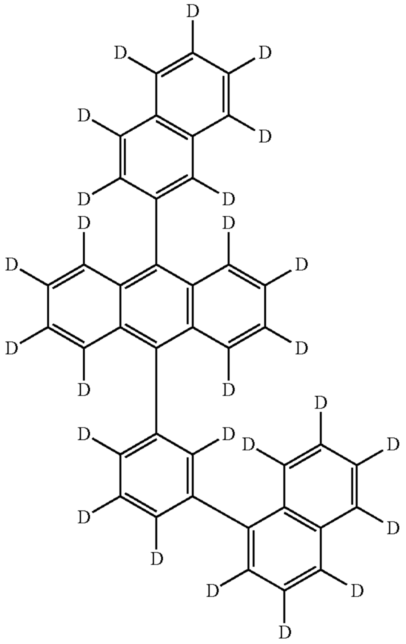
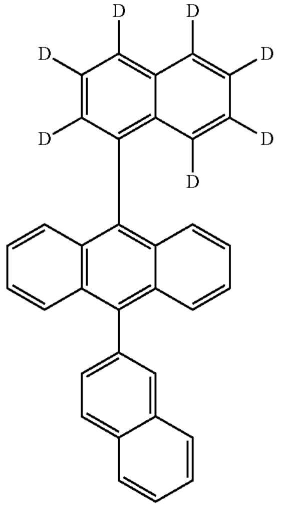
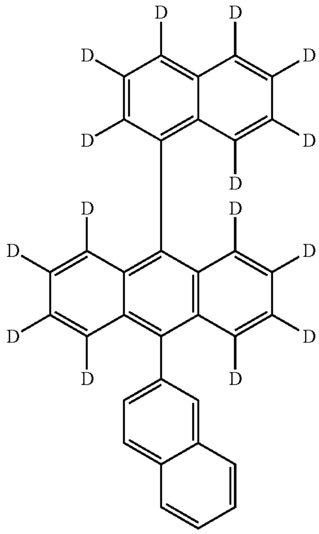
-continued
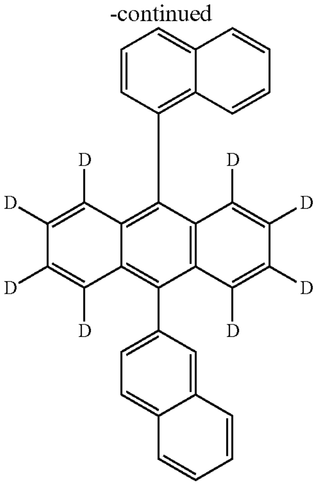
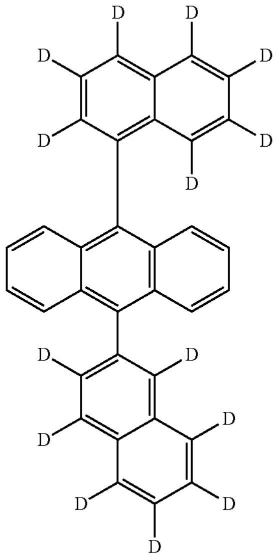
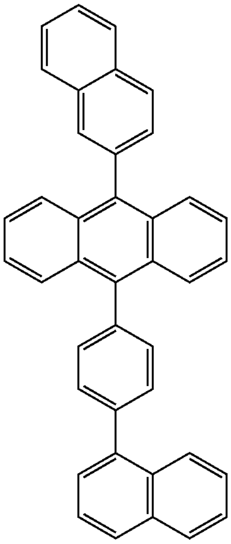

-continued

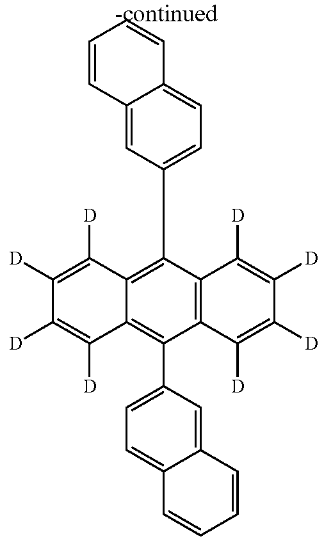

In an exemplary embodiment of the present specification, the light emitting layer includes the above-described polycyclic compound as a dopant of the light emitting layer, and includes the compound of Formula H as a host of the light emitting layer.

In an exemplary embodiment of the present specification, when the light emitting layer includes a host and a dopant, a content of the dopant can be selected within a range of 0.01 to 10 parts by weight based on 100 parts by weight of the light emitting layer, but is not limited thereto.

In an exemplary embodiment of the present specification, the light emitting layer includes a host and a dopant, and the host and the dopant are included at a weight ratio of 99:1 to 1:99, preferably 99:1 to 70:30, and more preferably 99:1 to 90:10.

The light emitting layer can further include a host material, and examples of the host include a fused aromatic ring derivative, a hetero ring-containing compound, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, triazine derivatives, or the like, and the examples thereof can be a compound of two or more thereof, but are not limited thereto.

According to an exemplary embodiment of the present specification, the organic material layer includes a light emitting layer, and the light emitting layer includes one or more dopants, and a host.

According to an exemplary embodiment of the present specification, the organic material layer includes a light emitting layer, and the light emitting layer includes two or more mixed dopants and a host.

According to an exemplary embodiment of the present specification, one or more of the two or more mixed dopants include Formula 1, and the host includes the compound of Formula H. One or more of the two or more mixed dopants include Formula 1, and the others can use dopant materials known in the related art, but the present invention is not limited thereto.

According to an exemplary embodiment of the present specification, one or more of the two or more mixed dopants include Formula 1, and the others can use one or more of a boron-based compound, a pyrene-based compound, and a delayed fluorescence-based compound, which are different from the compounds in Formula 1, but the present invention is not limited thereto.

According to an exemplary embodiment of the present specification, the organic material layer includes a light emitting layer, and the light emitting layer includes one or more hosts.

According to an exemplary embodiment of the present specification, the organic material layer includes a light emitting layer, and the light emitting layer includes two or more mixed hosts.

According to an exemplary embodiment of the present specification, one or more of the two or more mixed hosts are the compound of Formula H.

According to an exemplary embodiment of the present specification, the two or more mixed hosts are different from each other, and are each independently the compound of Formula H.

According to an exemplary embodiment of the present specification, the organic material layer includes a light emitting layer, and the light emitting layer includes two mixed hosts.

According to an exemplary embodiment of the present specification, the organic material layer includes a light emitting layer, the light emitting layer includes two mixed hosts, the two mixed hosts are different from each other, and the two hosts are the compounds of Formula H.

According to an exemplary embodiment of the present specification, the organic material layer includes a light emitting layer, and includes: a first host of Formula H, and a second host of Formula H, and the first host and the second host are different from each other.

According to an exemplary embodiment of the present specification, the first host:the second host are included at a weight ratio of 95:5 to 5:95, preferably at a weight ratio of 70:30 to 30:70.

According to an exemplary embodiment of the present specification, the organic material layer includes a light emitting layer, and the light emitting layer includes one or more hosts, and a dopant.

According to an exemplary embodiment of the present specification, the organic material layer includes a light emitting layer, the light emitting layer includes one or more hosts, and a dopant, the host includes the compound of Formula H, and the dopant includes the compound of Formula 1.

According to an exemplary embodiment of the present specification, the organic material layer includes a light emitting layer, and the light emitting layer includes two or more mixed hosts, and a dopant.

According to an exemplary embodiment of the present specification, one or more of the two or more mixed hosts include the compound of Formula H, and the dopant includes the compound of Formula 1.

In the present specification, the two or more mixed hosts are different from each other.

According to an exemplary embodiment of the present specification, the organic material layer includes a light emitting layer, and the light emitting layer includes two mixed hosts, and a dopant.

According to an exemplary embodiment of the present specification, the two mixed hosts are different from each other, and each independently include the compound of Formula H, and the dopant includes the compound of Formula 1.

According to an exemplary embodiment of the present specification, the organic material layer includes a light emitting layer, and includes: a first host of Formula H, a second host of Formula H, and a dopant of Formula 1, and the first host and the second host are different from each other.

According to an exemplary embodiment of the present specification, one or more hosts and one or more dopants are used in the organic material layer, the one or more hosts include the compound of Formula H, and the one or more dopants include the compound of Formula 1.

According to an exemplary embodiment of the present specification, two or more mixed hosts and two or more mixed dopants are used in the organic material layer, the same material as described above can be used in the two or more mixed hosts, and the same material as described above can be used in the two or more mixed dopants.

In an exemplary embodiment of the present specification, the maximum emission peak of the light emitting layer including the polycyclic compound of Formula 100 is 380 nm to 500 nm. That is, the light emitting layer including the above-described polycyclic compound is a blue light emitting layer.

In an exemplary embodiment of the present specification, the first electrode is a positive electrode, and the second electrode is a negative electrode.

According to another exemplary embodiment, the first electrode is a negative electrode, and the second electrode is a positive electrode.

The structure of the organic light emitting device of the present invention can have a structure such as following (1) to (18), but is not limited thereto.

(1) Positive electrode/Hole transport layer/Light emitting layer/Negative electrode (2) Positive electrode/Hole injection layer/Hole transport layer/Light emitting layer/Negative electrode (3) Positive electrode/Hole injection layer/Hole buffer layer/Hole transport layer/Light emitting layer/Negative electrode (4) Positive electrode/Hole transport layer/Light emitting layer/Electron transport layer/Negative electrode (5) Positive electrode/Hole transport layer/Light emitting layer/Electron transport layer/Electron injection layer/Negative electrode (6) Positive electrode/Hole injection layer/Hole transport layer/Light emitting layer/Electron transport layer/Negative electrode (7) Positive electrode/Hole injection layer/Hole transport layer/Light emitting layer/Electron transport layer/Electron injection layer/Negative electrode (8) Positive electrode/Hole injection layer/Hole buffer layer/Hole transport layer/Light emitting layer/Electron transport layer/Negative electrode (9) Positive electrode/Hole injection layer/Hole buffer layer/Hole transport layer/Light emitting layer/Electron transport layer/Electron injection layer/Negative electrode

(10) Positive electrode/Hole transport layer/Electron blocking layer/Light emitting layer/Electron transport layer/Negative electrode

(11) Positive electrode/Hole transport layer/Electron blocking layer/Light emitting layer/Electron transport layer/Electron injection layer/Negative electrode

(12) Positive electrode/Hole injection layer/Hole transport layer/Electron blocking layer/Light emitting layer/Electron transport layer/Negative electrode

(13) Positive electrode/Hole injection layer/Hole transport layer/Electron blocking layer/Light emitting layer/Electron transport layer/Electron injection layer/Negative electrode

(14) Positive electrode/Hole transport layer/Light emitting layer/Hole blocking layer/Electron transport layer/Negative electrode

(15) Positive electrode/Hole transport layer/Light emitting layer/Hole blocking layer/Electron transport layer/Electron injection layer/Negative electrode

(16) Positive electrode/Hole injection layer/Hole transport layer/Light emitting layer/Hole blocking layer/Electron transport layer/Negative electrode

(17) Positive electrode/Hole injection layer/Hole transport layer/Light emitting layer/Hole blocking layer/Electron transport layer/Electron injection layer/Negative electrode

(18) Positive electrode/Hole injection layer/Hole transport layer/Electron blocking layer/Light emitting layer/Hole blocking layer/Electron injection and transport layer/Negative electrode The structure of the organic light emitting device of the present invention can have a structure as illustrated in FIGS. 1 and 2, but is not limited thereto.

FIG. 1 exemplifies the stereto of an organic light emitting device in which a positive electrode 2, a light emitting layer 3, and a negative electrode 4 are sequentially stacked on a substrate 1. In the structure described above, the compound of Formula 1 can be included in the light emitting layer 3.

FIG. 2 exemplifies a structure of an organic light emitting device in which a positive electrode 2, a first hole injection layer 5, a second hole injection layer 6, a hole transport layer 7, an electron blocking layer 8, a light emitting layer 3, a first electron transport layer 9, a second electron transport layer 10, an electron injection layer 11, and a negative electrode 4 are sequentially stacked on a substrate 1. In the structure described above, the compound of Formula 1 can be included in the light emitting layer 3.

For example, the organic light emitting device according to the present invention can be manufactured by depositing a metal or a metal oxide having conductivity, or an alloy thereof on a substrate to form a positive electrode, forming an organic material layer having one or more layers selected from the group consisting of a hole injection layer, a hole transport layer, a layer which transports and injects holes simultaneously, a light emitting layer, an electron transport layer, an electron injection layer, and a layer which transports and injects electrons simultaneously, thereon, and then depositing a material, which can be used as a negative electrode, thereon, by using a physical vapor deposition (PVD) method such as sputtering or e-beam evaporation. In addition to the method described above, an organic light emitting device can also be made by sequentially depositing a negative electrode material, an organic material layer, and a positive electrode material on a substrate.

The organic material layer can have a multi-layered structure including a hole injection layer, a hole transport layer, a light emitting layer, and an electron transport layer, and the like, but is not limited thereto and can have a single-layered structure. Further, the organic material layer can be manufactured to include a fewer number of layers by a method such as a solvent process, for example, spin coating, dip coating, doctor blading, screen printing, inkjet printing, or a thermal transfer method, using various polymer materials, instead of a deposition method.

The positive electrode is an electrode which injects holes, and as a positive electrode material, materials having a high work function are usually preferred so as to facilitate the injection of holes into an organic material layer. Specific examples of the positive electrode material which can be used in the present invention include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

The negative electrode is an electrode which injects electrons, and as a negative electrode material, materials having a low work function are usually preferred so as to facilitate the injection of electrons into an organic material layer. Specific examples of the negative electrode material include: a metal such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The hole injection layer is a layer which serves to facilitate the injection of holes from a positive electrode to a light emitting layer and can have a single-layered or multi-layered structure, and a hole injection material is preferably a material which can proficiently accept holes from a positive electrode at a low voltage, and the highest occupied molecular orbital (HOMO) of the hole injection material is preferably a value between the work function of the positive electrode material and the HOMO of the neighboring organic material layer. Specific examples of the hole injection material include metal porphyrin, oligothiophene, arylamine-based organic materials, hexanitrile hexaazatriphenylene-based organic materials, quinacridone-based organic materials, perylene-based organic materials, anthraquinone, polyaniline-based and polythiophene-based conductive polymers, and the like, but are not limited thereto. The hole injection layer can have a thickness of 1 to 150 nm. When the hole injection layer has a thickness of 1 nm or more, there is an advantage in that it is possible to prevent hole injection characteristics from deteriorating, and when the hole injection layer has a thickness of 150 nm or less, there is an advantage in that it is possible to prevent the driving voltage from being increased in order to improve the movement of holes due to the too thick hole injection layer. In an exemplary embodiment of the present specification, the hole injection layer has a multi-layered structure of two or more layers.

The hole transport layer can serve to facilitate the transport of holes. A hole transport material is suitably a material having high hole mobility which can accept holes from a positive electrode or a hole injection layer and transfer the holes to a light emitting layer. Specific examples thereof include arylamine-based organic materials, conductive polymers, block copolymers having both conjugated portions and non-conjugated portions, and the like, but are not limited thereto.

A hole buffer layer can be additionally provided between a hole injection layer and a hole transport layer, and can include hole injection or transport materials known in the art.

An electron blocking layer can be provided between a hole transport layer and a light emitting layer. As the electron blocking layer, the above-described spiro compound or a material known in the art can be used.

The light emitting layer can emit red, green, or blue light, and can be composed of a phosphorescent material or a fluorescent material. The light emitting material is a material which can receive holes and electrons from a hole transport layer and an electron transport layer, respectively, and combine the holes and the electrons to emit light in a visible ray region, and is preferably a material having high quantum efficiency for fluorescence or phosphorescence. Specific examples thereof include: 8-hydroxy-quinoline aluminum complexes ($Alq_3$); carbazole-based compounds; dimerized styryl compounds; BAlq; 10-hydroxybenzoquinoline-metal compounds; benzoxazole-based, benzothiazole-based and benzimidazole-based compounds; poly(p-phenylenevinylene) (PPV)-based polymers; spiro compounds; polyfluorene, rubrene, and the like, but are not limited thereto.

Examples of the host material for the light emitting layer include fused aromatic ring derivatives, or hetero ring-containing compounds, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, and the like, but the examples thereof are not limited thereto.

When the light emitting layer emits red light, it is possible to use a phosphorescent material such as bis(1-phenylisoquinoline)acetylacetonate iridium (PIQIr(acac)), bis(1-phenylquinoline)acetylacetonate iridium (PQIr(acac)), tris(1-phenylquinoline)iridium (PQIr), or octaethylporphyrin platinum (PtOEP), or a fluorescent material such as tris(8-hydroxyquinolino)-aluminum ($Alq_3$) as a light emitting dopant, but the light emitting dopant is not limited thereto. When the light emitting layer emits green light, it is possible to use a phosphorescent material such as fac-tris(2-phenylpyridine)iridium ($Ir(ppy)_3$), or a fluorescent material such as tris(8-hydroxyquinolino)-aluminum ($Alq_3$), as the light emitting dopant, but the light emitting dopant is not limited thereto. When the light emitting layer emits blue light, it is possible to use a phosphorescent material such as $(4,6\text{-}F2ppy)_2Irpic$, or a fluorescent material such as spiro-DPVBi, spiro-6P, distyryl benzene (DSB), distyryl arylene (DSA), a PFO-based polymer or a PPV-based polymer as the light emitting dopant, but the light emitting dopant is not limited thereto.

A hole blocking layer can be provided between the electron transport layer and the light emitting layer, and materials known in the art can be used.

The electron transport layer serves to facilitate the transport of electrons, and can have a single-layered or multi-layered structure. An electron transport material is suitably a material having high electron mobility which can proficiently accept electrons from a negative electrode and transfer the electrons to a light emitting layer. Specific examples thereof include: Al complexes of 8-hydroxyquinoline; complexes including $Alq_3$; organic radical compounds; hydroxyflavone-metal complexes; and the like, but are not limited thereto. The electron transport layer can have a thickness of 1 to 50 nm. When the electron transport layer has a thickness of 1 nm or more, there is an advantage in that it is possible to prevent electron transport characteristics from deteriorating, and when the electron transport layer has a thickness of 50 nm or less, there is an advantage in that it is possible to prevent the driving voltage from being increased in order to improve the movement of electrons due to the too thick electron transport layer. In an exemplary embodiment of the present specification, an electron transport layer has a multi-layered structure of two or more layers, and an electron transport layer adjacent to a negative electrode includes an n-type dopant.

The electron injection layer can serve to facilitate the injection of electrons. An electron injection material is preferably a compound which has a capability of transporting electrons, an effect of injecting electrons from a negative electrode, and an excellent effect of injecting electrons into a light emitting layer or a light emitting material, prevents excitons produced from a light emitting layer from moving to a hole injection layer, and is also excellent in the ability to form a thin film. Specific examples thereof include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, metal complex compounds, nitrogen-containing 5-membered ring derivatives, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris(2-methyl-8-hydroxyquinolinato) aluminum, tris(8-hydroxyquinolinato) gallium, bis(10-hydroxybenzo[h]quinolinato) beryllium, bis(10-hydroxybenzo[h]quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The hole blocking layer is a layer which blocks holes from reaching a negative electrode, and can be generally formed under the same conditions as those of the hole injection layer. Specific examples thereof include oxadiazole derivatives or triazole derivatives, phenanthroline derivatives, BCP, aluminum complexes, and the like, but are not limited thereto.

The organic light emitting device according to the present invention can be a top emission type, a bottom emission type, or a dual emission type according to the material to be used.

EXAMPLES

Hereinafter, the present specification will be described in detail with reference to Examples, Comparative Examples, and the like for specifically describing the present specification. However, the Examples and the Comparative Examples according to the present specification can be modified in various forms, and it is not interpreted that the scope of the present specification is limited to the Examples and the Comparative Examples described below in detail. The Examples and the Comparative Examples of the present specification are provided to more completely explain the present specification to a person with ordinary skill in the art.

Synthesis Example 1. Synthesis of Compound 1

1) Synthesis of Intermediate 1

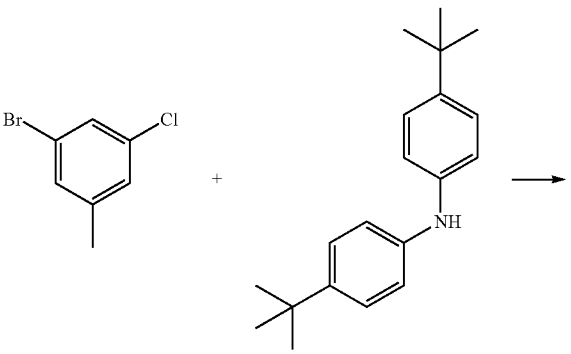

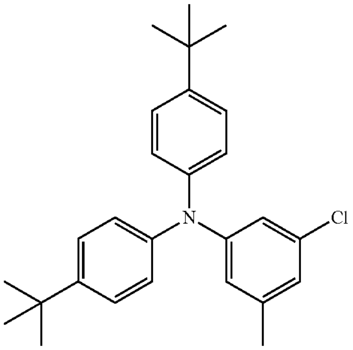

[Intermediate 1]

After 40 g of 1-bromo-3-chloro-5-methylbenzene, 54.8 g of bis(4-(tert-butyl)phenyl)amine, 56.1 g of sodium-tert-butoxide, and 1.0 g of bis(tri-tert-butylphosphine)-palladium (0) were put into 600 ml of toluene under a nitrogen atmosphere, the resulting mixture was stirred under reflux for 2 hours. After the completion of the reaction, the resulting product was extracted, and then recrystallized to obtain 65 g of Intermediate 1. (yield 82%). MS[M+H]+=407

2) Synthesis of Intermediate 2

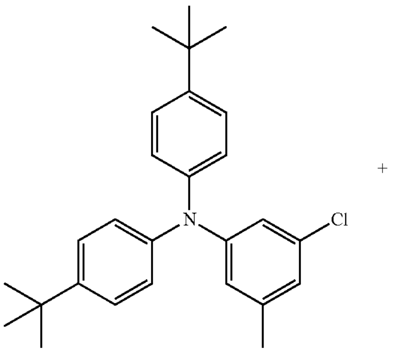

[Intermediate 1]

-continued

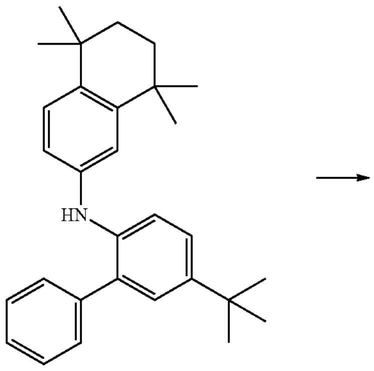

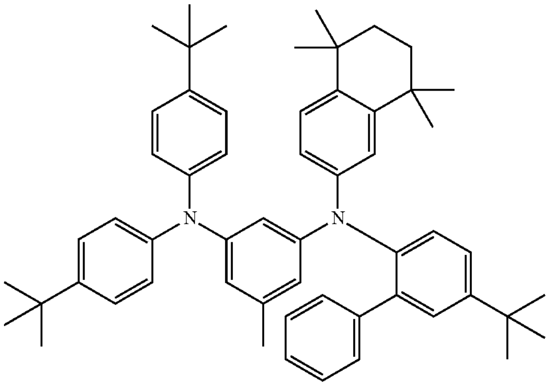

[Intermediate 2]

After 30 g of Intermediate 1, 30.5 g of N-(5-(tert-butyl)-[1,1'-biphenyl]-2-yl)-5,5,8,8-tetramethyl-5,6,7,8-tetrahydronaphthalen-2-amine, 14.2 g of sodium-tert-butoxide, and 0.4 g of bis(tri-tert-butyl-phosphine)palladium(0) were put into 450 ml of toluene under a nitrogen atmosphere, the resulting mixture was stirred under reflux for 2 hours. After the completion of the reaction, the resulting product was extracted, and then recrystallized to obtain 45 g of Intermediate 2. (yield 78%). MS[M+H]+=782

3) Synthesis of Compound 1

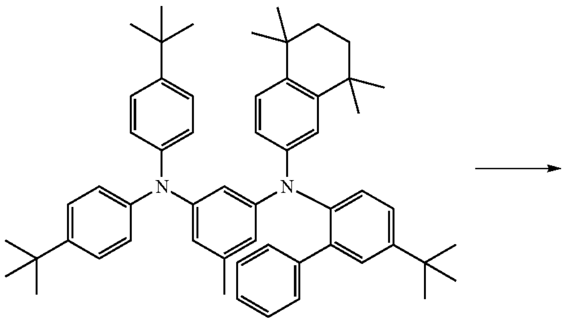

[Intermediate 2]

-continued

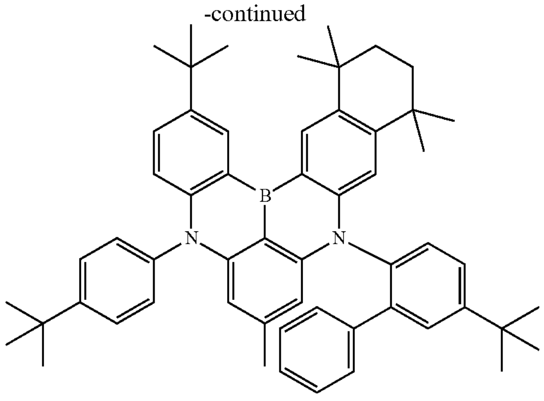

[Compound 1]

After 25 g of Intermediate 2 and 21.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 8 g of Compound 1 (yield 32%). MS[M+H]+=789

Synthesis Example 2. Synthesis of Compound 2

1) Synthesis of Intermediate 3

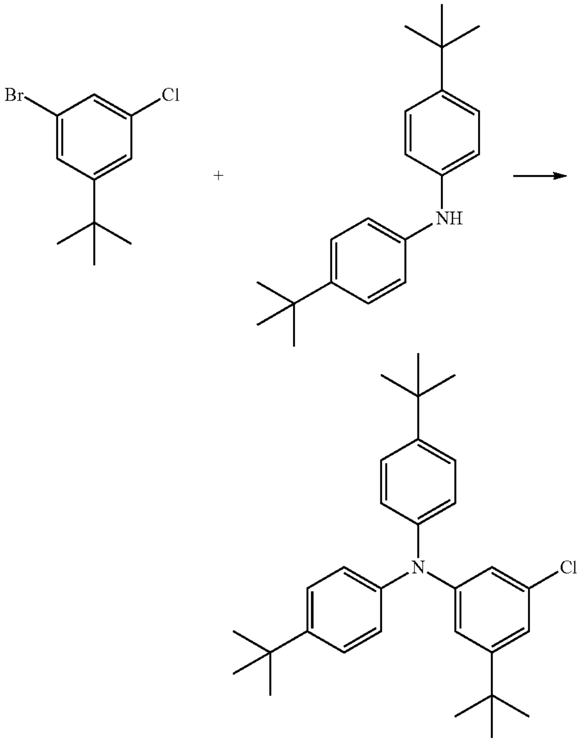

[Intermediate 3]

40 g of 1-bromo-3-(tert-butyl)-5-chlorobenzene instead of 1-bromo-3-chloro-5-methylbenzene, and the same material and equivalent weight as in the synthesis method of Intermediate 1 were used, and the resulting product was recrystallized to obtain 60 g of Intermediate 3. (yield 83%). MS[M+H]+=449

2) Synthesis of Intermediate 4

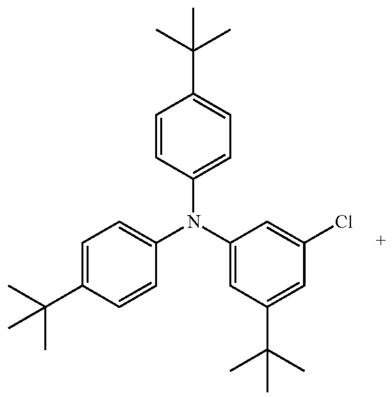

[Intermediate 3]

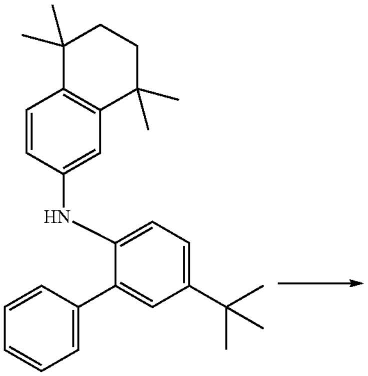

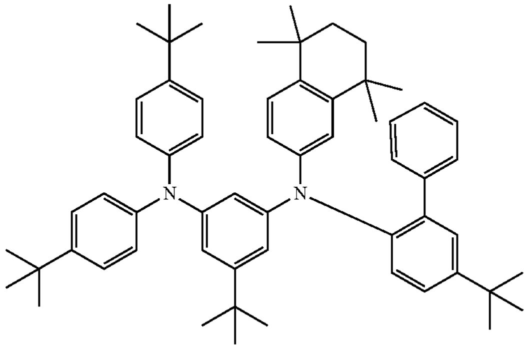

[Intermediate 4]

30 g of intermediate 3 and 27.5 g of N-(5-(tert-butyl)-[1,1'-biphenyl]-2-yl)-5,5,8,8-tetramethyl-5,6,7,8-tetrahydronaphthalen-2-amine, and the same material and equivalent weight as in the synthesis method of Intermediate 2 were used, and the resulting product was recrystallized to obtain 43 g of Intermediate 4. (yield 78%). MS[M+H]+=824

3) Synthesis of Compound 2

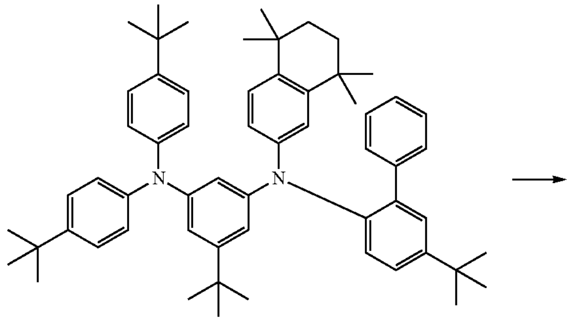

[Intermediate 4]

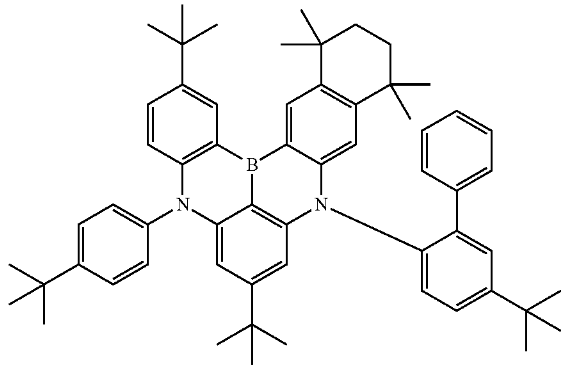

[Compound 2]

After 25 g of Intermediate 4 and 20.2 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 8.4 g of Compound 2 (yield 33%). MS[M+H]+=832

Synthesis Example 3. Synthesis of Compound 3

1) Synthesis of Intermediate 5

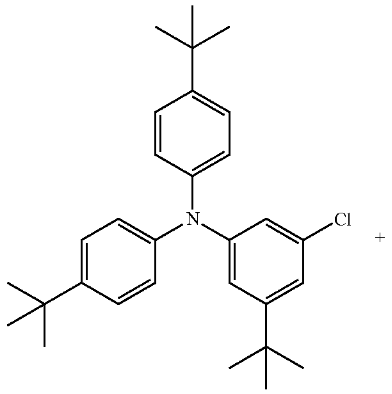

[Intermediate 1]

-continued

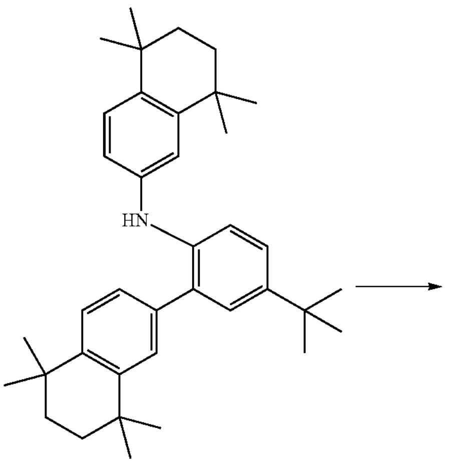

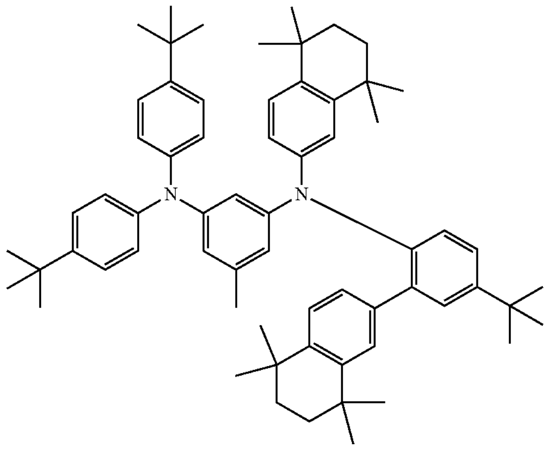

[Intermediate 5]

30 g of intermediate 1 and 38.6 g of N-(4-(tert-butyl)-2-(5,5,8,8-tetramethyl-5,6,7,8-tetrahydro-naphthalen-2-yl)phenyl)-5,5,8,8-tetramethyl-5,6,7,8-tetrahydronaphthalen-2-amine, and the same material and equivalent weight as in the synthesis method of Intermediate 2 were used, and the resulting product was recrystallized to obtain 46 g of Intermediate 5. (yield 70%). MS[M+H]+=892

2) Synthesis of Compound 3

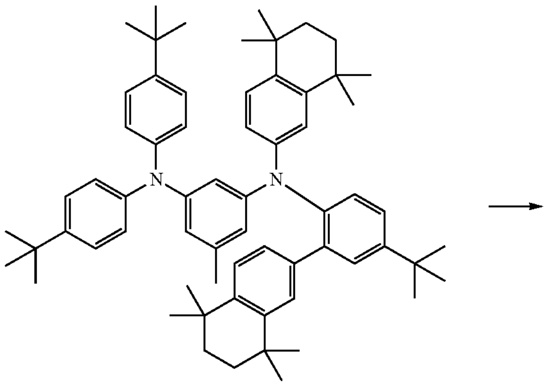

[Intermediate 5]

-continued

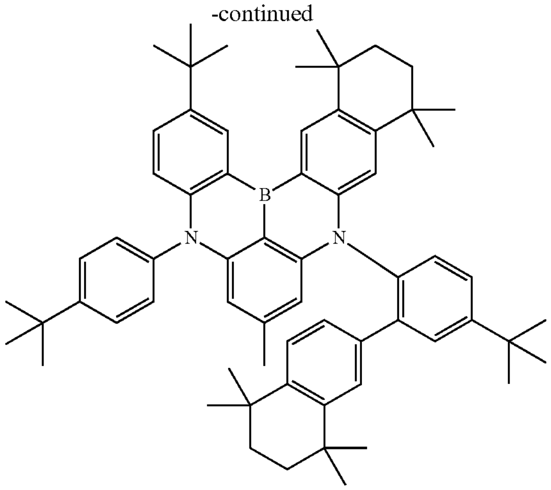

[Compound 3]

After 25 g of Intermediate 5 and 20.2 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 8.1 g of Compound 3 (yield 31%). MS[M+H]+=900

Synthesis Example 4. Synthesis of Compound 4

1) Synthesis of Intermediate 6

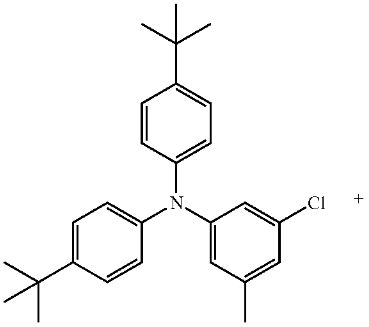

[Intermediate 1]

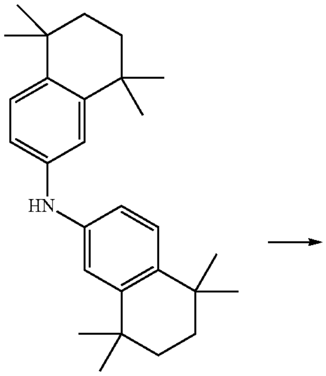

-continued

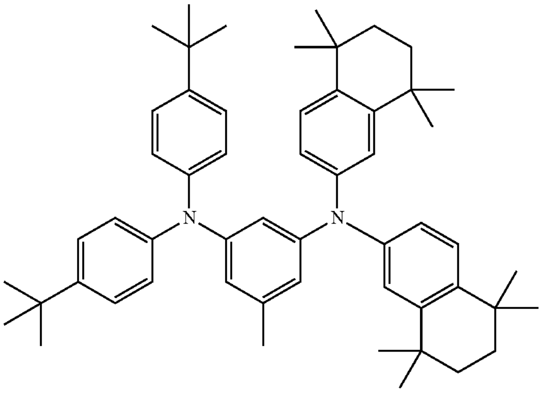

[Intermediate 6]

30 g of Intermediate 1 and 28.8 g of bis(5,5,8,8-tetramethyl-5,6,7,8-tetrahydronaphthalen-2-yl)amine, and the same material and equivalent weight as in the synthesis method of Intermediate 2 were used, and the resulting product was recrystallized to obtain 42 g of Intermediate 6. (yield 75%). MS[M+H]+=760

2) Synthesis of Compound 4

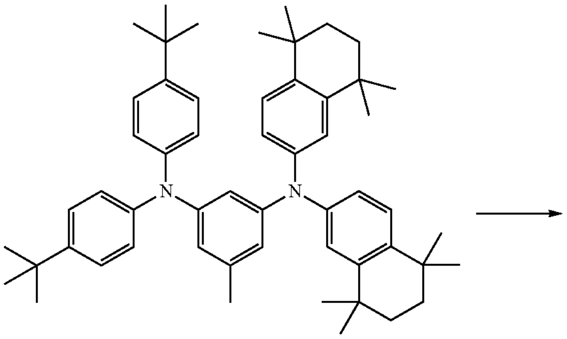

[Intermediate 6]

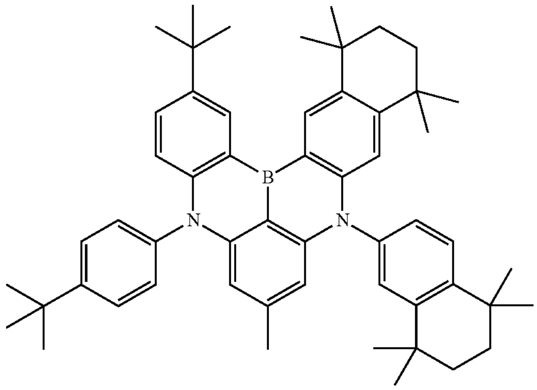

[Compound 4]

After 25 g of Intermediate 6 and 21.9 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.9 g of Compound 4 (yield 31%). MS[M+H]+=767

Synthesis Example 5. Synthesis of Compound 5

1) Synthesis of Intermediate 7

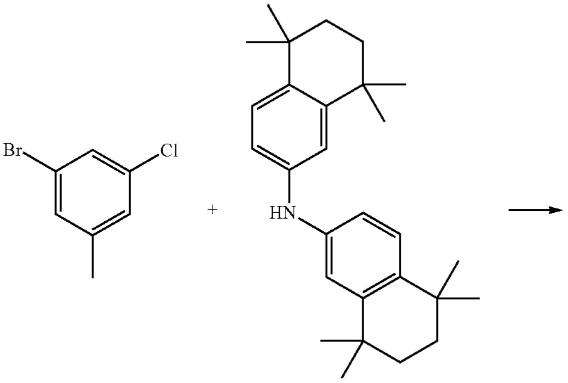

[Intermediate 7]

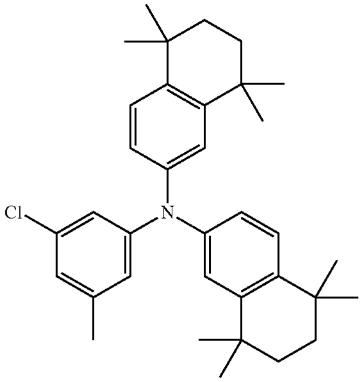

40 g of 1-bromo-3-chloro-5-methylbenzene, 75.8 g of bis(5,5,8,8-tetramethyl-5,6,7,8-tetrahydronaphthalen-2-yl)amine, and the same material and equivalent weight as in the synthesis method of Intermediate 1 were used, and the resulting product was recrystallized to obtain 72 g of Intermediate 7. (yield 72%). MS[M+H]+=515

2) Synthesis of Intermediate 8

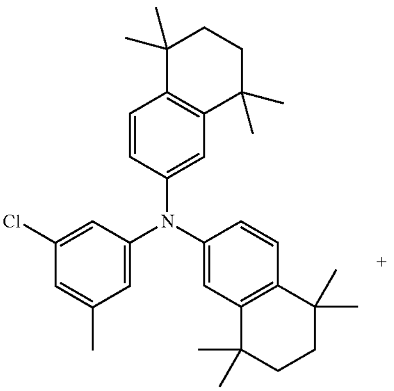

[Intermediate 7]

-continued

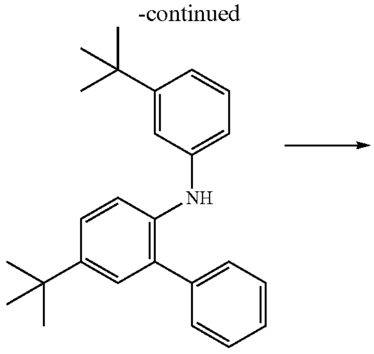

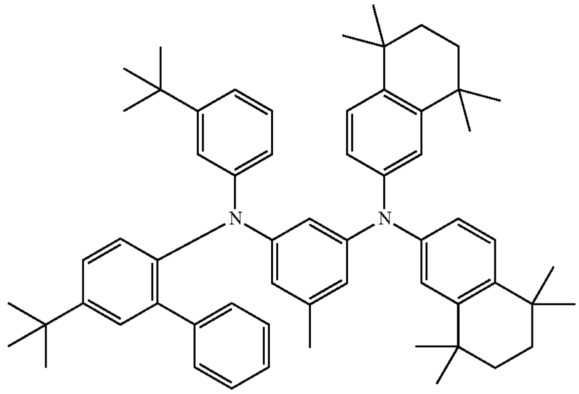

[Intermediate 8]

30 g of Intermediate 7, 30.5 g, 20.9 g of 5-(tert-butyl)-N-(3-(tert-butyl)phenyl)-[1,1'-biphenyl]-2-amine, and the same material and equivalent weight as in the synthesis method of Intermediate 2 were used, and the resulting product was recrystallized to obtain 39 g of Intermediate 8. (yield 80%). MS[M+H]+=836

3) Synthesis of Compound 5

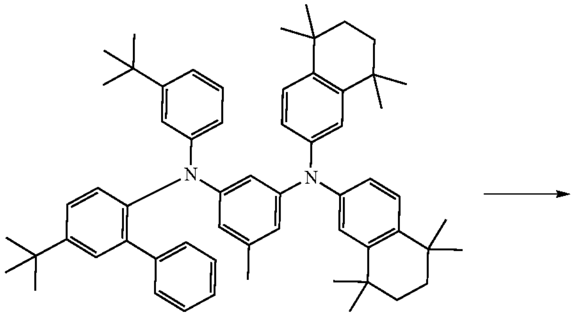

[Intermediate 8]

-continued

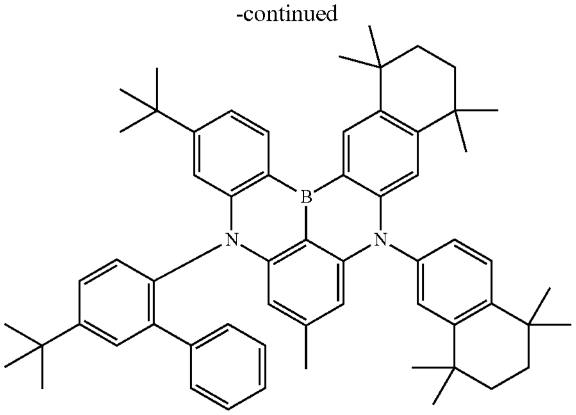

[Compund 5]

After 25 g of Intermediate 8 and 19.9 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 8.1 g of Compound 5 (yield 32%). MS[M+H]+=844

Synthesis Example 6. Synthesis of Compound 6

1) Synthesis of Intermediate 9

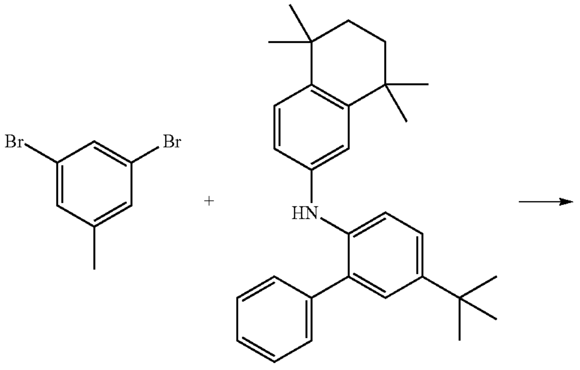

[Intermediate 9]

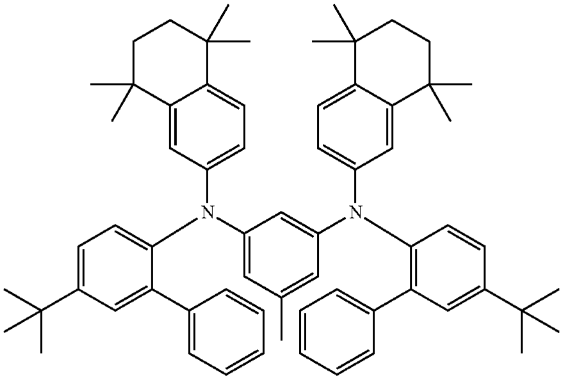

After 40 g of 1,3-dibromo-5-methylbenzene, 98.8 g of N-(5-(tert-butyl)-[1,1-biphenyl]-2-yl)-5,5,8,8-tetramethyl-5,6,7,8-tetrahydronaphthalen-2-amine, 92 g of sodium-tert-butoxide, and 0.6 g of bis(tri-tert-butylphosphine)palladium (0) were put into 1,000 ml of toluene, the resulting mixture was stirred under reflux for 2 hours. After the completion of the reaction, the resulting product was extracted, and then recrystallized to obtain 80 g of Intermediate 9. (yield 73%). MS[M+H]+=912

2) Synthesis of Compound 6

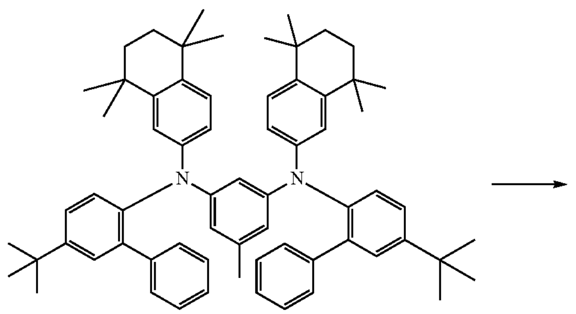

[Intermediate 9]

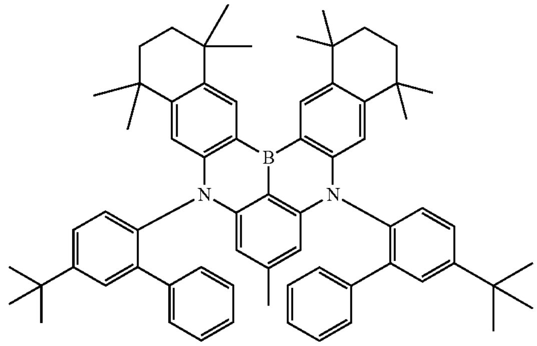

[Compound 6]

After 25 g of Intermediate 9 and 18.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.8 g of Compound 6 (yield 31%). MS[M+H]+=920

Synthesis Example 8. Synthesis of Compound 8

1) Synthesis of Intermediate 11

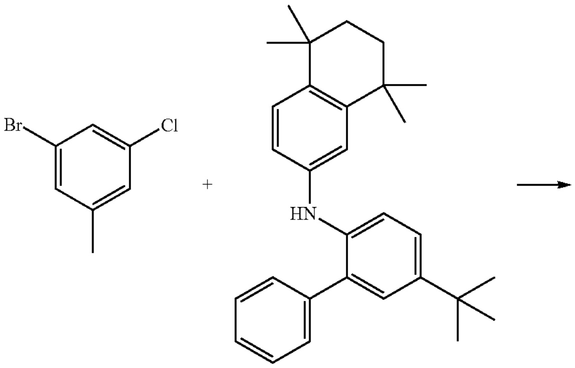

-continued

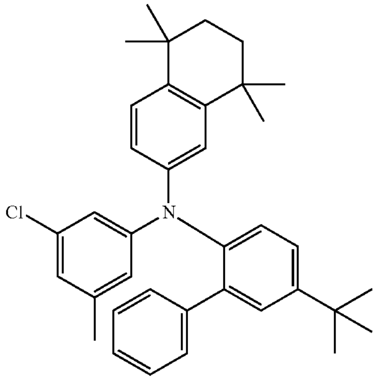

[Intermediate 11]

40 g of 1-bromo-3-chloro-5-methylbenzene and 80.1 g of N-(5-(tert-butyl)-[1,1'-biphenyl]-2-yl)-5,5,8,8-tetramethyl-5,6,7,8-tetrahydronaphthalen-2-amine, and the same material and equivalent weight as in the synthesis method of Intermediate 1 were used, and the resulting product was recrystallized to obtain 77 g of Intermediate 11. (yield 74%). MS[M+H]+=537

2) Synthesis of Intermediate 12

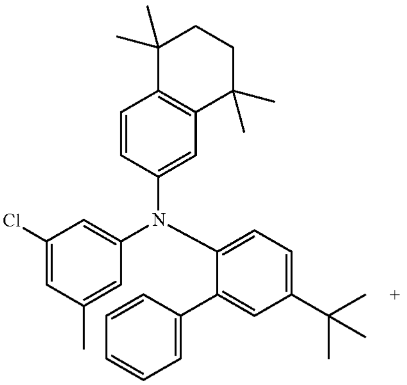

[Intermediate 11]

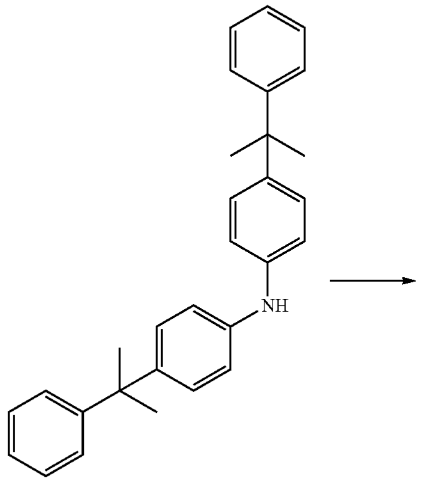

-continued

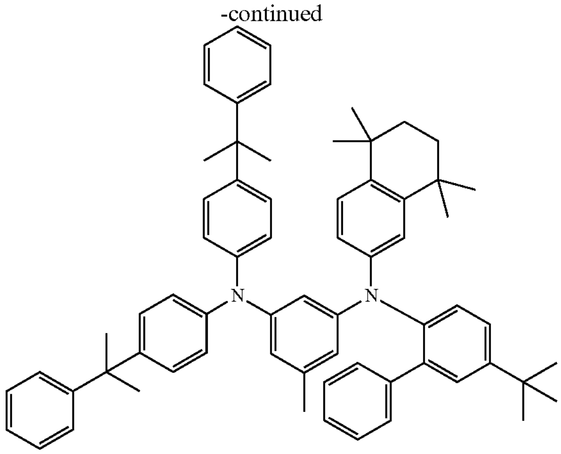

[Intermediate 12]

30 g of Intermediate 11 and 22.7 g of bis(4-(2-phenylpropan-2-yl)phenyl)amine, and the same material and equivalent weight as in the synthesis method of Intermediate 2 were used, and the resulting product was recrystallized to obtain 33 g of Intermediate 12. (yield 65%). MS[M+H]+=906

3) Synthesis of Compound 8

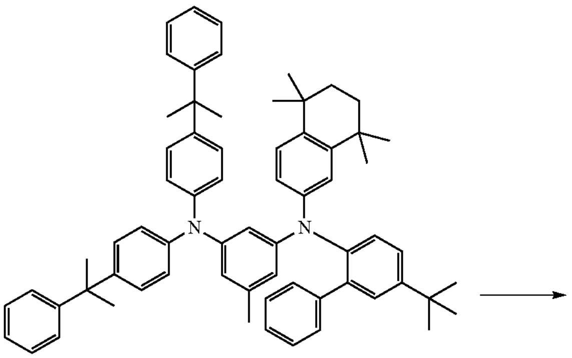

[Intermediate 12]

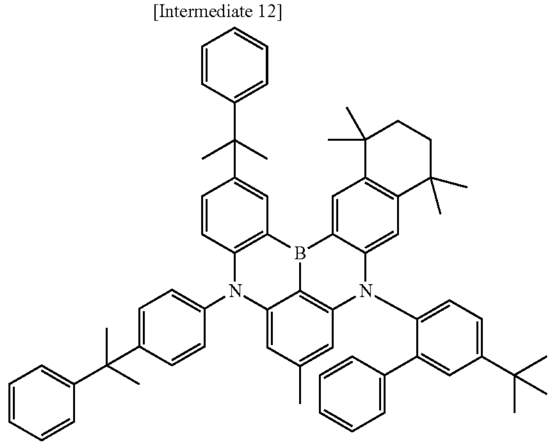

[Compound 8]

After 25 g of Intermediate 12 and 18.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Compound 8 (yield 30%). MS[M+H]+=914

Synthesis Example 9. Synthesis of Compound 9

1) Synthesis of Intermediate 13

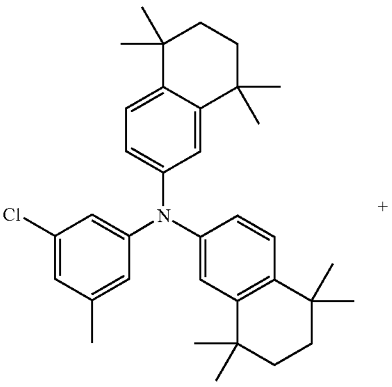

[Intermediate 7]

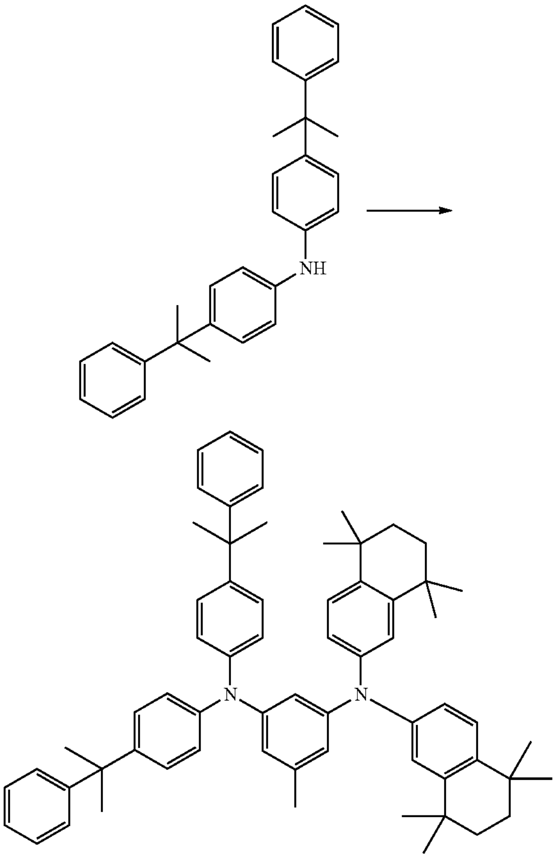

[Intermediate 13]

30 g of Intermediate 7, 23.7 g of bis(4-(2-phenylpropan-2-yl)phenyl)amine, and the same material and equivalent weight as in the synthesis method of Intermediate 2 were used, and the resulting product was recrystallized to obtain 36 g of Intermediate 13. (yield 70%). MS[M+H]+=884

2) Synthesis of Compound 9

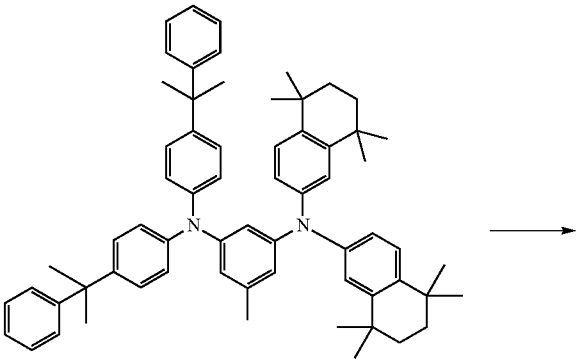

[Intermediate 13]

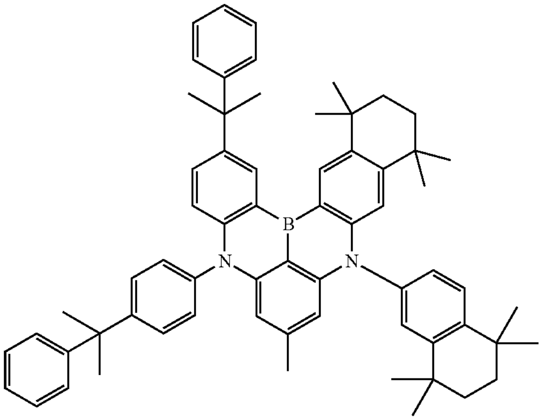

[Compound 9]

After 25 g of Intermediate 13 and 18.8 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Compound 9 (yield 30%). MS[M+H]+=892

Synthesis Example 10. Synthesis of Compound 10

1) Synthesis of Intermediate 14

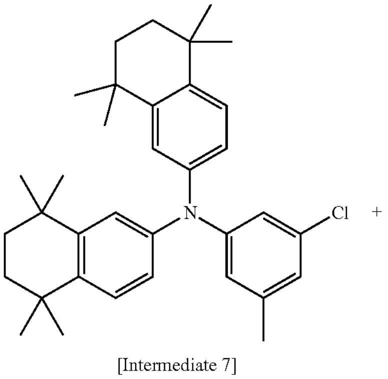

[Intermediate 7]

-continued

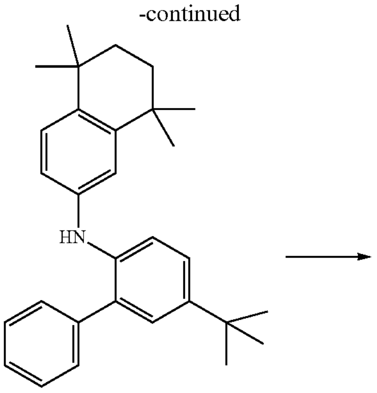

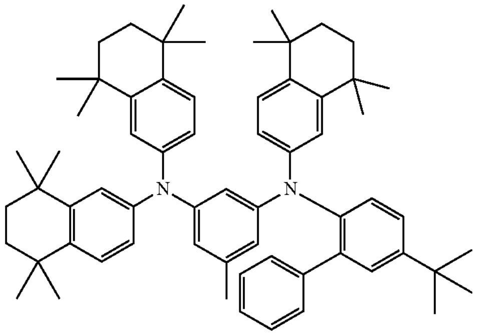

[Intermediate 14]

30 g of intermediate 7 and 24.7 g of N-(5-(tert-butyl)-[1, 1'-biphenyl]-2-yl)-5,5,8,8-tetramethyl-5,6,7,8-tetrahydronaphthalen-2-amine, and the same material and equivalent weight as in the synthesis method of Intermediate 2 were used, and the resulting product was recrystallized to obtain 39 g of Intermediate 14. (yield 75%). MS[M+H]+=890

2) Synthesis of Compound 10

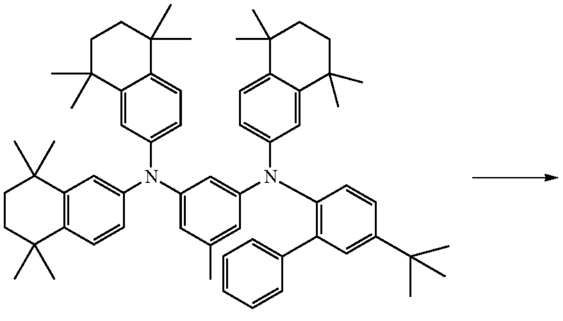

[Intermediate 14]

-continued

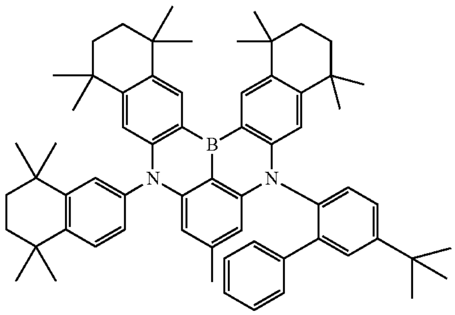

[Compound 10]

After 25 g of Intermediate 14 and 18.7 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.2 g of Compound 10 (yield 29%). MS[M+H]+=898

Synthesis Example 11. Synthesis of Compound 11

1) Synthesis of Intermediate 15

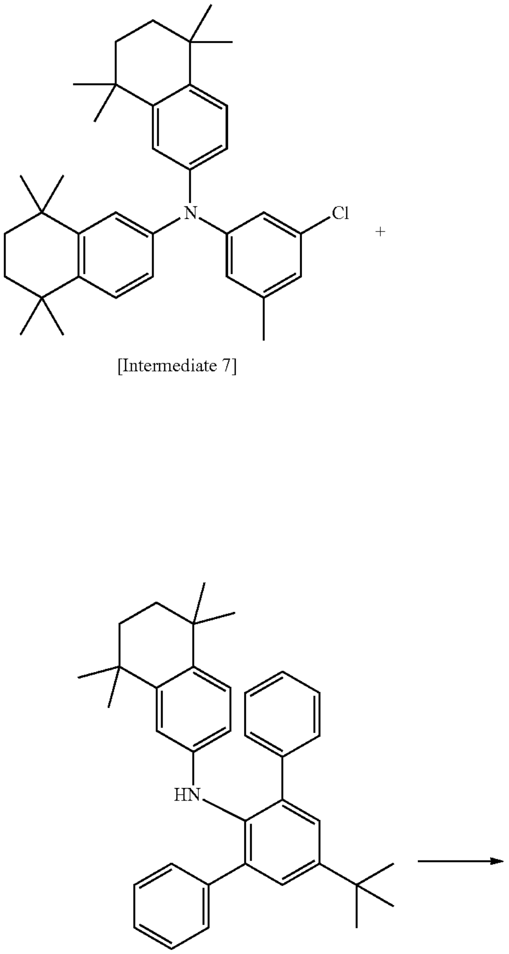

[Intermediate 7]

-continued

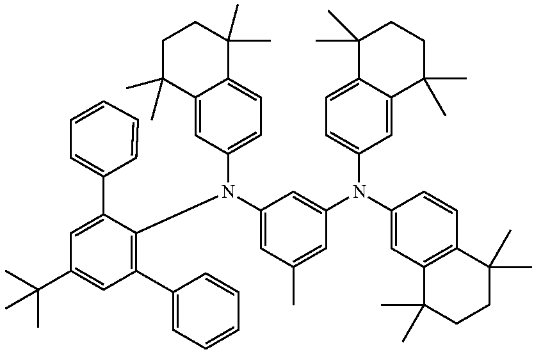

[Intermediate 15]

30 g of intermediate 7, 28.5 g of N-(5'-(tert-butyl)-[1,1':3',1"-terphenyl]-2'-yl)-5,5,8,8-tetramethyl-5,6,7,8-tetrahydronaphthalen-2-amine, and the same material and equivalent weight as in the synthesis method of Intermediate 2 were used, and the resulting product was recrystallized to obtain 42 g of Intermediate 15. (yield 75%). MS[M+H]+=966

2) Synthesis of Compound 11

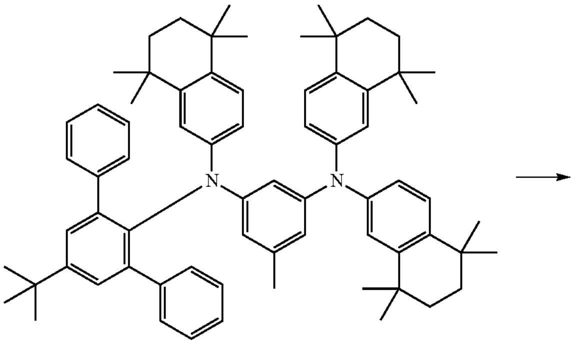

[Intermediate 15]

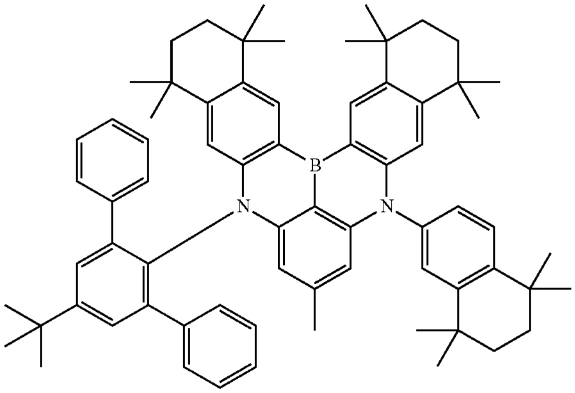

[Compound 11]

After 25 g of Intermediate 15 and 17.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Compound 11 (yield 30%). MS[M+H]+=974

Synthesis Example 12. Synthesis of Compound 12

1) Synthesis of Intermediate 16

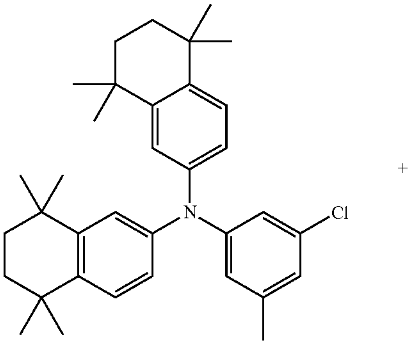

[Intermediate 7]

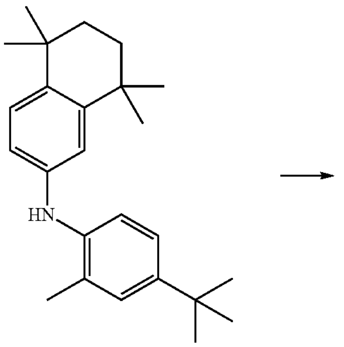

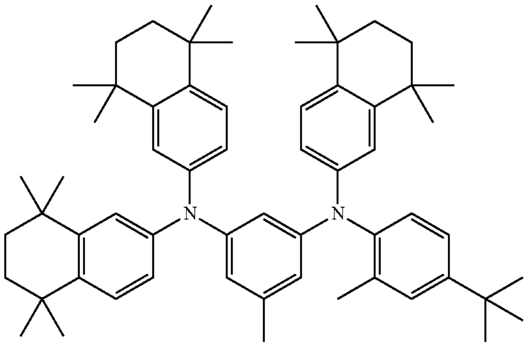

[Intermediate 16]

30 g of intermediate 7 and 20.4 g of N-(4-(tert-butyl)-2-methylphenyl)-5,5,8,8-tetramethyl-5,6,7,8-tetrahydronaphthalen-2-amine, and the same material and equivalent weight as in the synthesis method of Intermediate 2 were used, and the resulting product was recrystallized to obtain 33 g of Intermediate 16. (yield 68%). MS[M+H]+=828

2) Synthesis of Compound 12

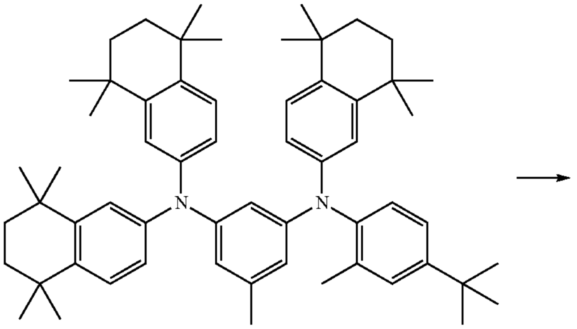

[Intermediate 16]

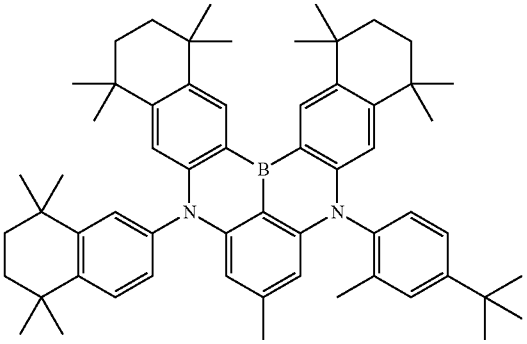

[Compound 12]

After 25 g of Intermediate 16 and 20.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Compound 12 (yield 31%). MS[M+H]+=836

Synthesis Example 13. Synthesis of Compound 13

1) Synthesis of Intermediate 17

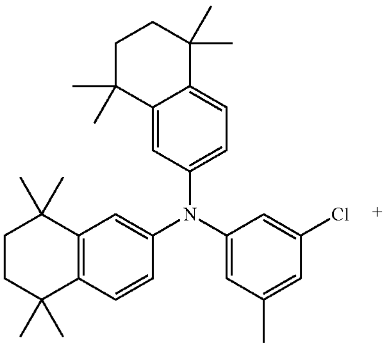

[Intermediate 7]

-continued

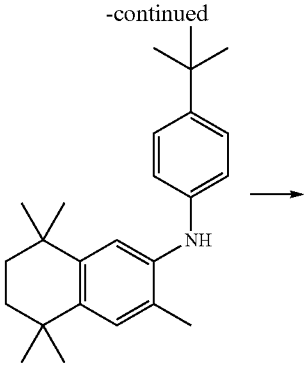

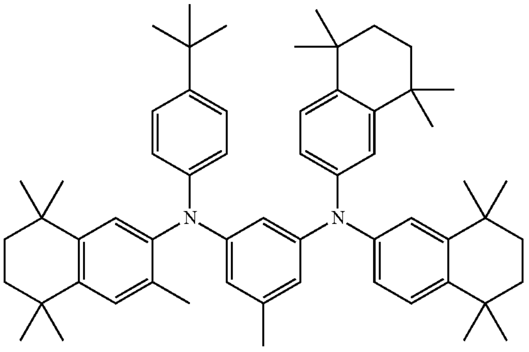

[Intermediate 17]

30 g of intermediate 7 and 20.4 g of N-(4-(tert-butyl)phenyl)-3,5,5,8,8-pentamethyl-5,6,7,8-tetrahydro-naphthalen-2-amine, and the same material and equivalent weight as in the synthesis method of Intermediate 2 were used, and the resulting product was recrystallized to obtain 32 g of Intermediate 17. (yield 66%). MS[M+H]+=828

2) Synthesis of Compound 13

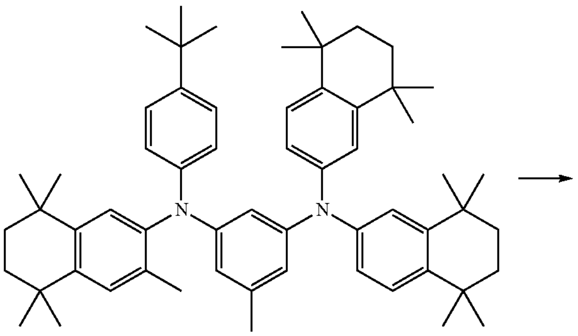

[Intermediate 17]

-continued

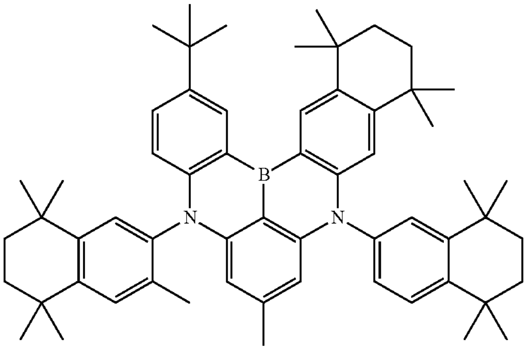

[Compound 13]

After 25 g of Intermediate 17 and 20.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Compound 13 (yield 30%). MS[M+H]+=836

Synthesis Example 14. Synthesis of Compound 14

1) Synthesis of Intermediate 18

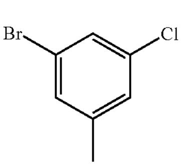

+

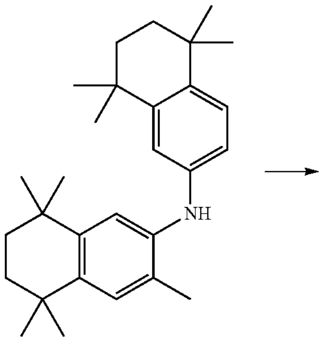

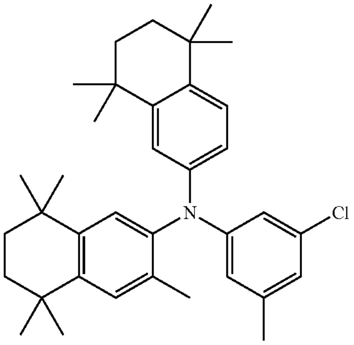

[Intermediate 18]

40 g of 1-bromo-3-chloro-5-methylbenzene and 78.6 g of 3,5,5,8,8-pentamethyl-N-(5,5,8,8-tetramethyl-5,6,7,8-tetrahydronaphthalen-2-yl)-5,6,7,8-tetrahydronaphthalen-2-amine, and the same material and equivalent weight as in the synthesis method of Intermediate 1 were used, and the resulting product was recrystallized to obtain 78 g of Intermediate 18. (yield 76%). MS[M+H]+=529

2) Synthesis of Intermediate 19

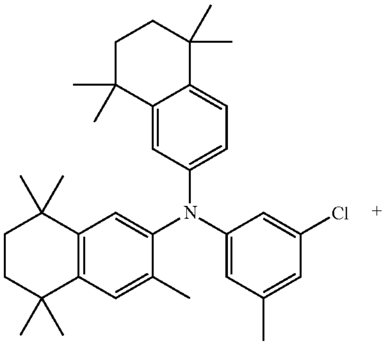

[Intermediate 18]

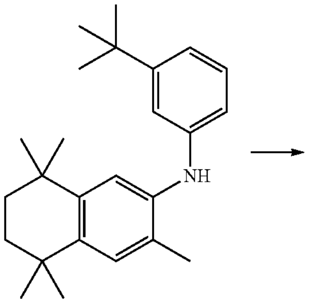

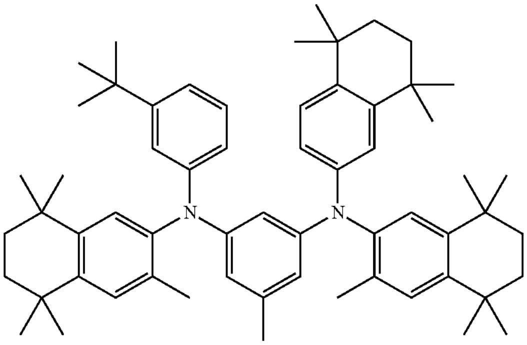

[Intermediate 19]

30 g of intermediate 18 and 19.9 g of N-(3-(tert-butyl) phenyl)-3,5,5,8,8-pentamethyl-5,6,7,8-tetrahydro-naphthalen-2-amine, and the same material and equivalent weight as in the synthesis method of Intermediate 2 were used, and the resulting product was recrystallized to obtain 32 g of Intermediate 19. (yield 68%). MS[M+H]+=828

3) Synthesis of Compound 14

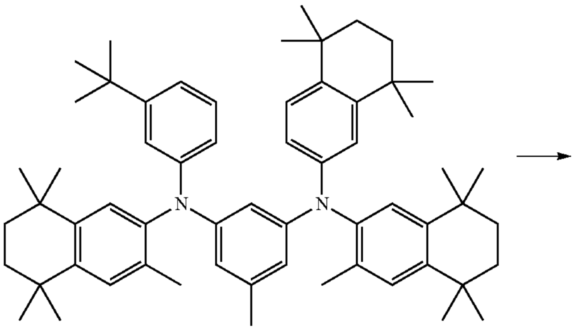

[Intermediate 19]

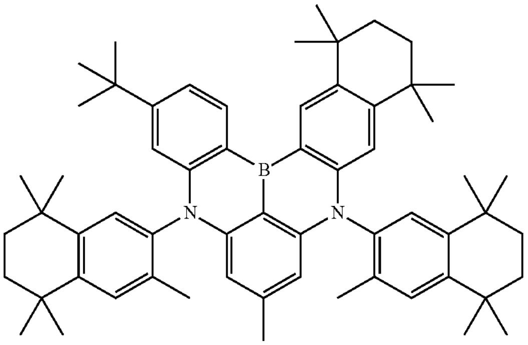

[Compound 14]

After 25 g of Intermediate 19 and 20.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.8 g of Compound 14 (yield 31%). MS[M+H]+=836

Synthesis Example 15. Synthesis of Compound 15

1) Synthesis of Intermediate 20

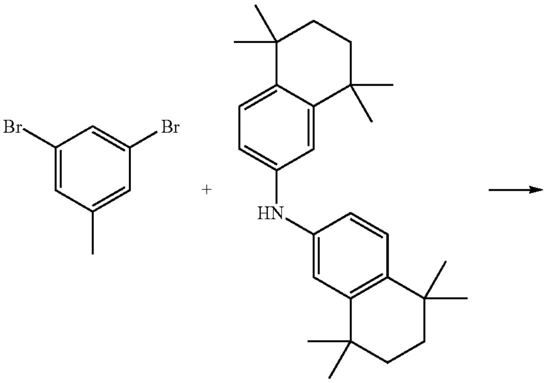

-continued

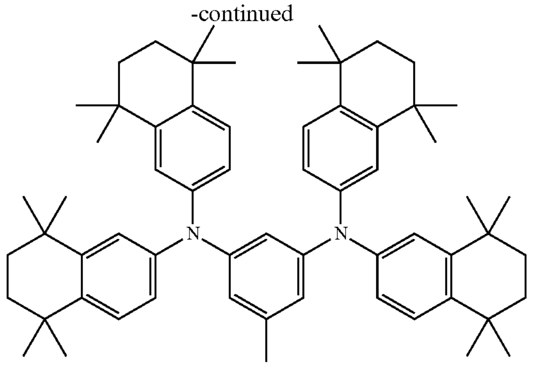

[Intermediate 20]

30 g of 1,3-dibromo-5-methylbenzene and 93.5 g of bis(5,5,8,8-tetramethyl-5,6,7,8-tetrahydronaphthalen-2-yl) amine, and the same material and equivalent weight as in the synthesis method of Intermediate 2 were used, and the resulting product was recrystallized to obtain 77 g of Intermediate 20. (yield 74%). MS[M+H]+=868

2) Synthesis of Compound 15

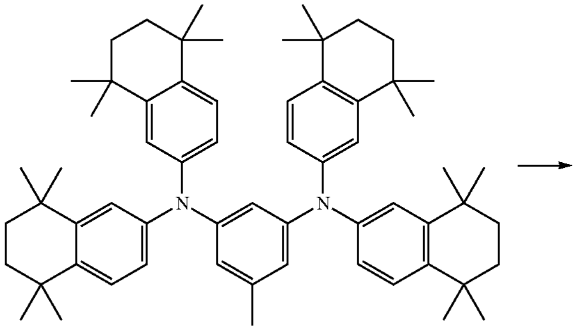

[Intermediate 20]

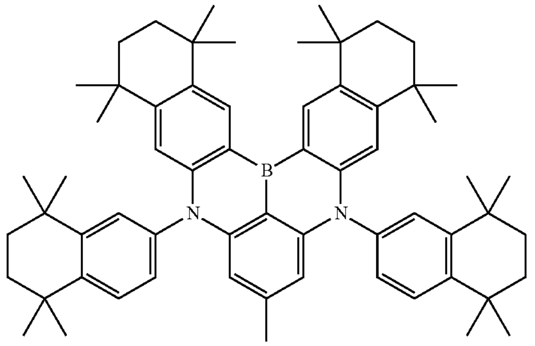

[Compound 15]

After 25 g of Intermediate 20 and 19.2 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.8 g of Compound 15 (yield 31%). MS[M+H]+=876

Synthesis Example 16. Synthesis of Compound 16

1) Synthesis of Intermediate 21

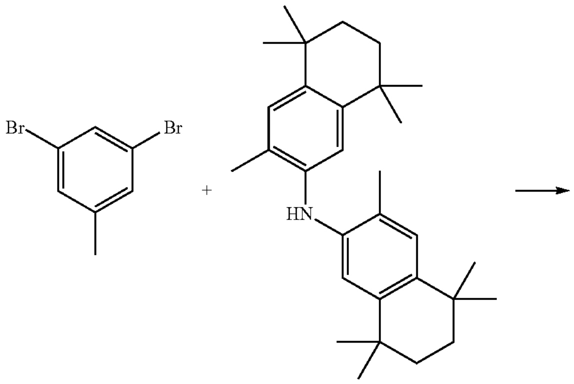

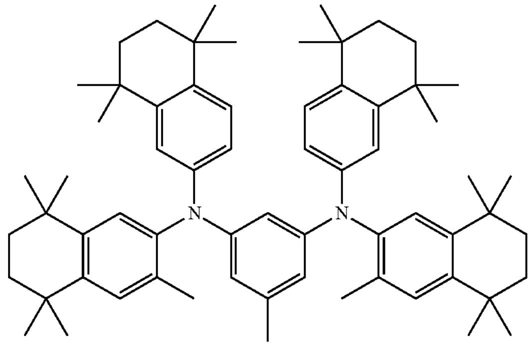

[Intermediate 21]

30 g of 1,3-dibromo-5-methylbenzene and 100.2 g of bis(3,5,5,8,8-pentamethyl-5,6,7,8-tetrahydronaphthalen-2-yl)amine, and the same material and equivalent weight as in the synthesis method of Intermediate 2 were used, and the resulting product was recrystallized to obtain 74 g of Intermediate 21. (yield 69%). MS[M+H]+=896

2) Synthesis of Compound 16

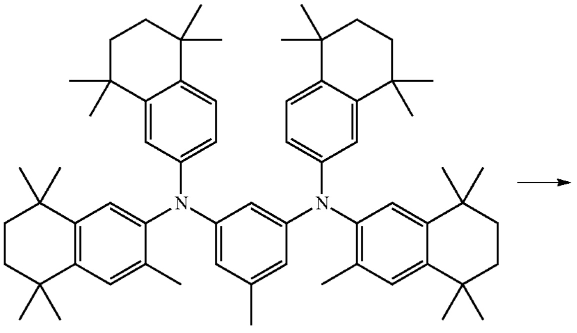

[Intermediate 21]

-continued

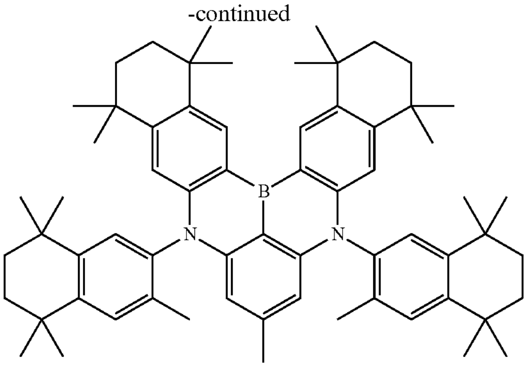

[Compound 16]

After 25 g of Intermediate 21 and 18.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Compound 16 (yield 31%). MS[M+H]+=904

Synthesis Example 17. Synthesis of Compound 17

1) Synthesis of Intermediate 22

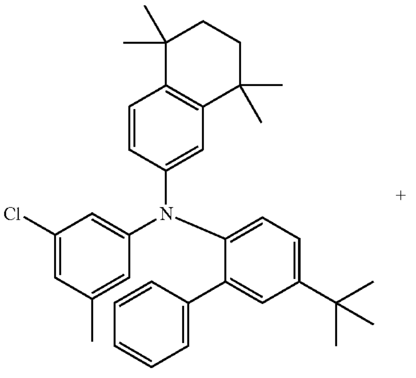

[Intermediate 11]

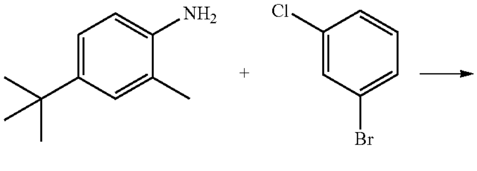

-continued

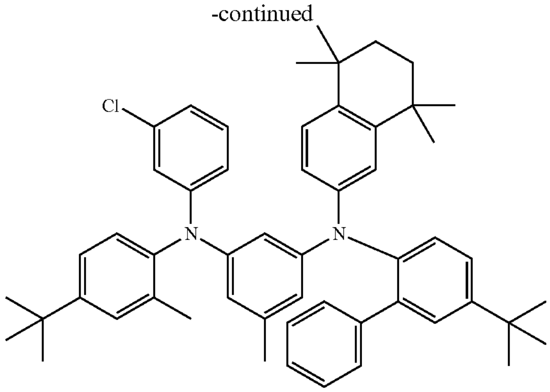

[Intermediate 22]

After 40 g of Intermediate 11, 12.2 g of 4-(tert-butyl)-2-methylaniline, 21.5 g of sodium-tert-butoxide, and 0.4 g of bis(tri-tert-butylphosphine)palladium(0) were put into 600 ml of toluene, the resulting mixture was refluxed for 1 hour, whether the reaction proceeded was confirmed, and then 14.3 g of 1-bromo-3-chlorobenzene was added thereto during the reflux reaction, and the reflux reaction was performed for an additional 1 hour. After the completion of the reaction, the resulting product was extracted, and then recrystallized to obtain 44 g of Intermediate 22. (yield 76%). MS[M+H]+=774

2) Synthesis of Intermediate 23

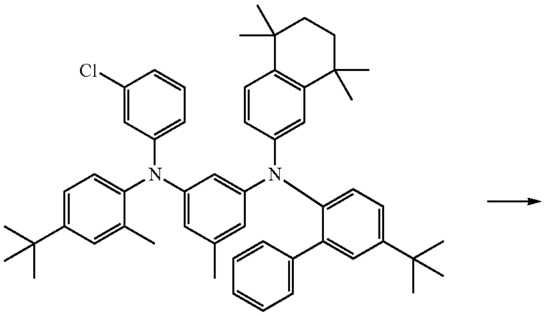

[Intermediate 22]

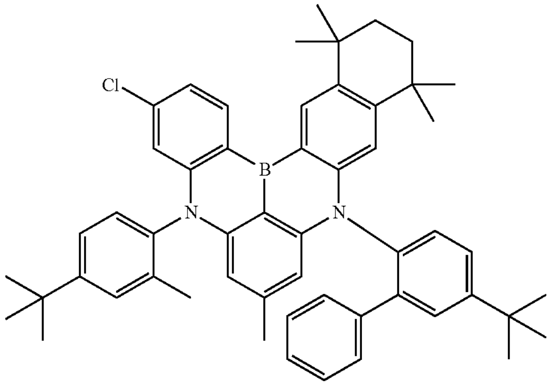

[Intermediate 23]

After 25 g of Intermediate 22 and 21.5 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.6 g of Intermediate 23 (yield 30%). MS[M+H]+=876

3) Synthesis of Compound 17

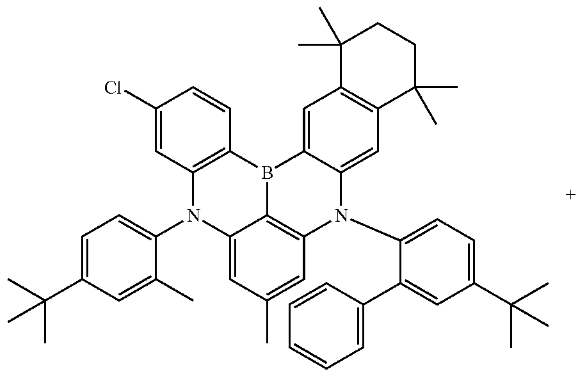

[Intermediate 23]

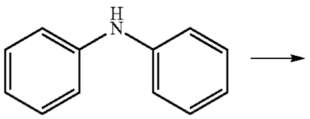

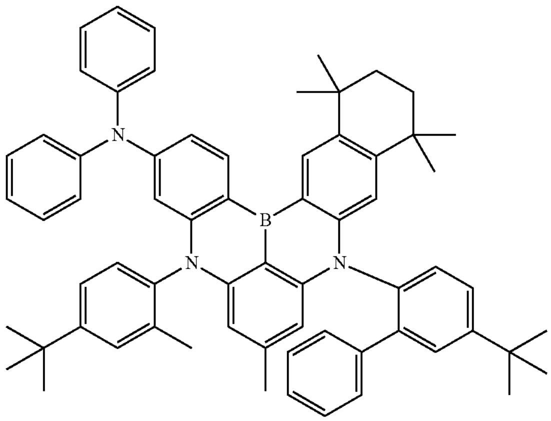

[Compound 17]

After 7 g of Intermediate 23, 1.52 g of diphenylamine, 1.7 g of sodium-tert-butoxide, and 0.05 g of bis(tri-tert-butylphosphine)palladium(0) were put into 80 ml of xylene under a nitrogen atmosphere, the resulting mixture was stirred under reflux for 5 hours. After the completion of the reaction, the resulting product was extracted, and then recrystallized to obtain 7 g of Compound 17 (yield 85%). MS[M+H]+=915

Synthesis Example 18. Synthesis of Compound 18

1) Synthesis of Compound 18

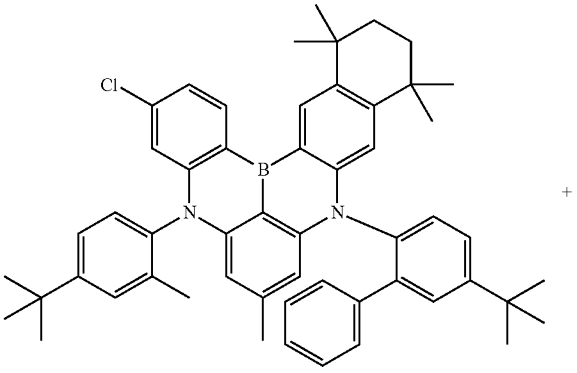

[Intermediate 23]

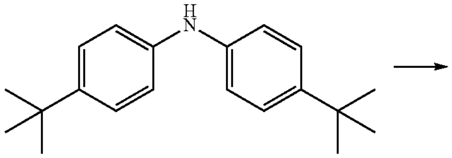

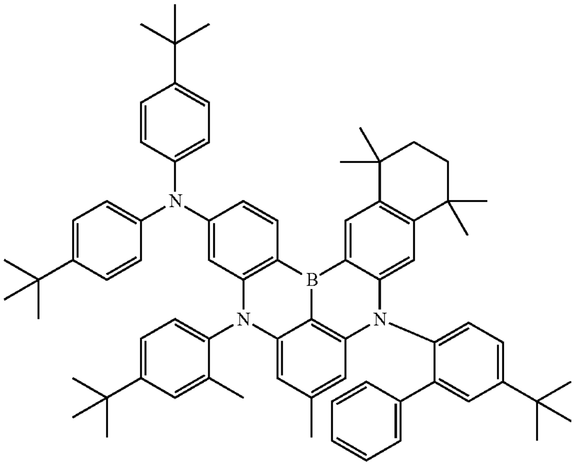

[Compound 18]

After 7 g of Intermediate 23, 1.52 g of bis(4-(tert-butyl)phenyl)amine, 2.6 g of sodium-tert-butoxide, and 0.05 g of bis(tri-tert-butylphosphine)palladium(0) were put into 80 ml of xylene under a nitrogen atmosphere, the resulting mixture was stirred under reflux for 5 hours. After the completion of the reaction, the resulting product was extracted, and then recrystallized to obtain 7.7 g of Compound 18 (yield 84%). MS[M+H]+=1027

Synthesis Example 19. Synthesis of Compound 19

1) Synthesis of Compound 19

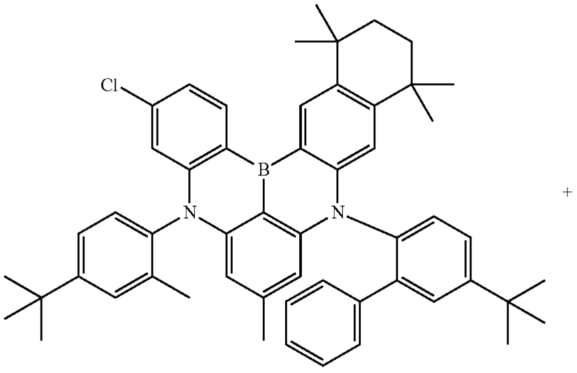

[Intermediate 23]

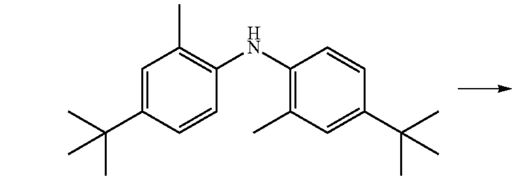

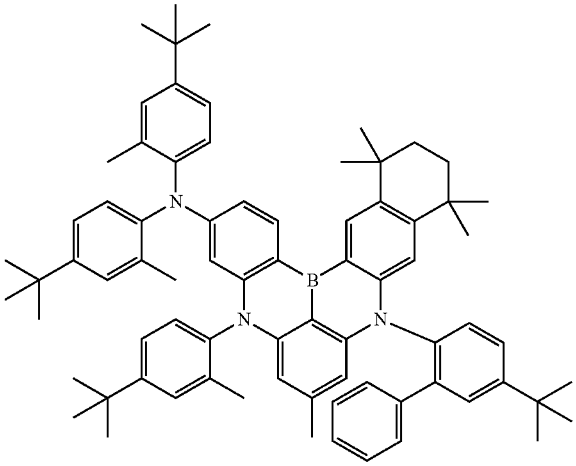

[Compound 19]

After 7 g of Intermediate 23, 2.77 g of bis(4-(tert-butyl)-2-methylphenyl)amine, 2.7 g of sodium-tert-butoxide, and 0.5 g of bis(tri-tert-butylphosphine)palladium(0) were put into 80 ml of xylene under a nitrogen atmosphere, the resulting mixture was stirred under reflux for 5 hours. After the completion of the reaction, the resulting product was extracted, and then recrystallized to obtain 7.8 g of Compound 19 (yield 83%). MS[M+H]+=1055

Synthesis Example 20. Synthesis of Compound 20

1) Synthesis of Intermediate 24

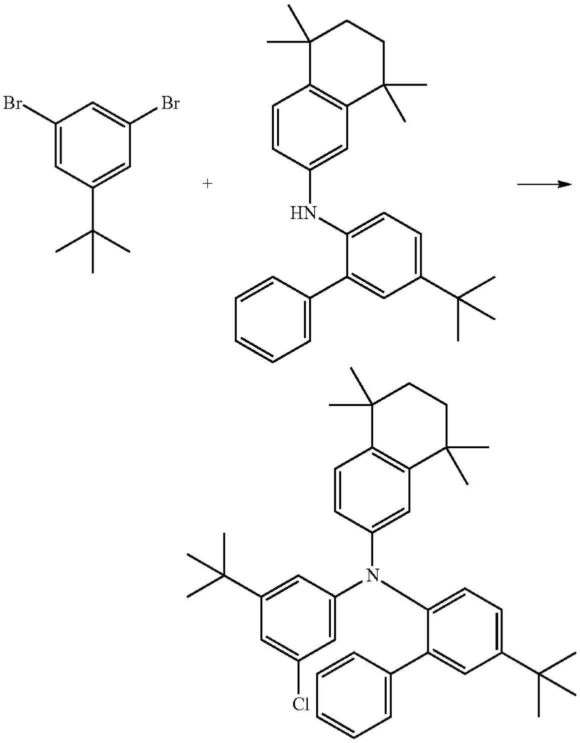

[Intermediate 24]

40 g of 1-bromo-3-(tert-butyl)-5-chlorobenzene and 66.5 g of N-(5-(tert-butyl)-[1,1'-biphenyl]-2-yl)-5,5,8,8-tetramethyl-5,6,7,8-tetrahydronaphthalen-2-amine, and the same material and equivalent weight as in the synthesis method of Intermediate 1 were used, and the resulting product was recrystallized to obtain 75 g of Intermediate 24. (yield 80%). MS[M+H]+=579

2) Synthesis of Intermediate 25

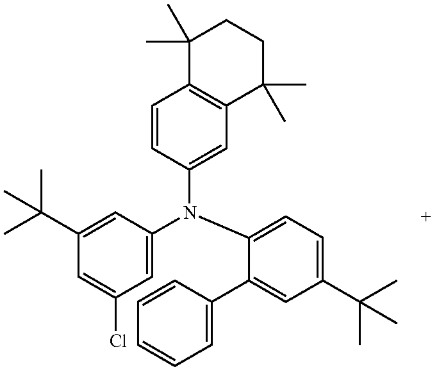

[Intermediate 24]

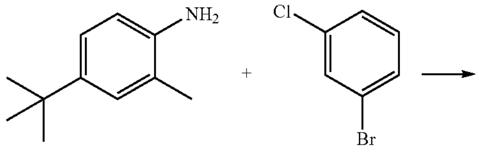

-continued

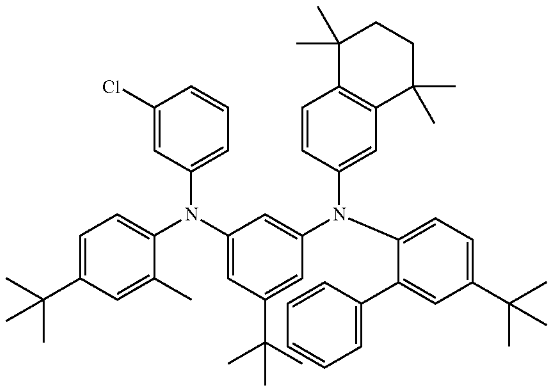

[Intermediate 25]

After 40 g of Intermediate 24, 11.3 g of 4-(tert-butyl)-2-methylaniline, 19.9 g of sodium-tert-butoxide, and 0.4 g of bis(tri-tert-butylphosphine)palladium(0) were put into 600 ml of toluene, the resulting mixture was refluxed for 1 hour, whether the reaction proceeded was confirmed, and then 13.2 g of 1-bromo-3-chlorobenzene was added thereto during the reflux reaction, and the reflux reaction was performed for an additional 1 hour. After the completion of the reaction, the resulting product was extracted, and then recrystallized to obtain 42 g of Intermediate 25 (yield 74%). MS[M+H]+=816

3) Synthesis of Intermediate 26

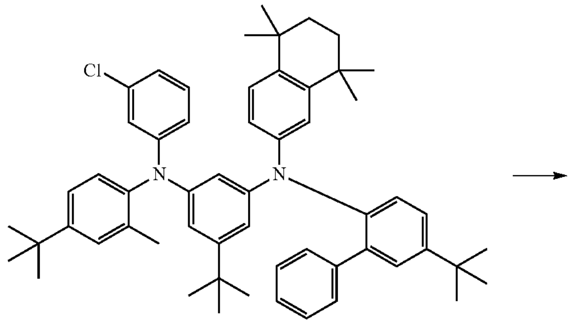

[Intermediate 25]

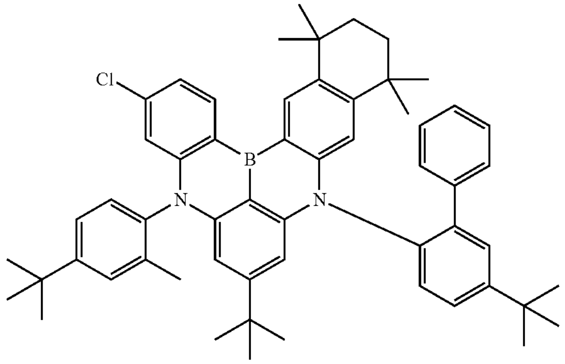

[Intermediate 26]

After 25 g of Intermediate 25 and 20.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 8.1 g of Intermediate 26 (yield 32%). MS[M+H]+=825

4) Synthesis of Compound 20

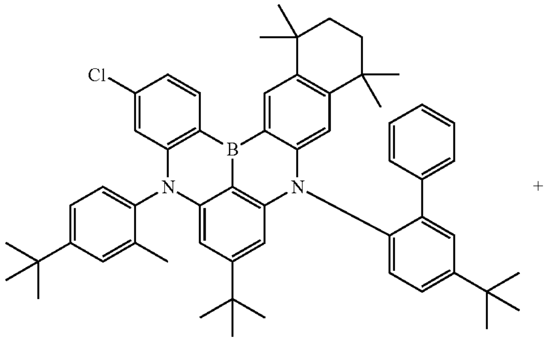

[Intermediate 26]

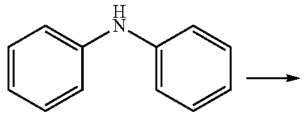

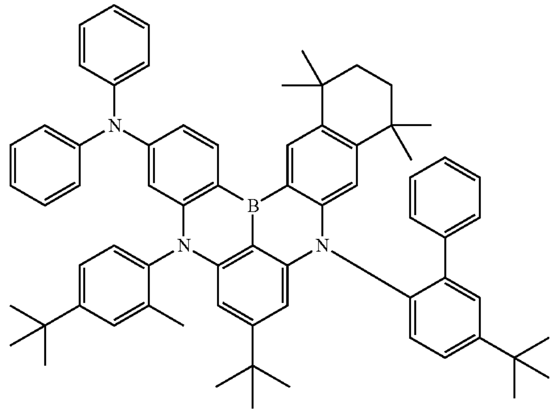

[Compound 20]

After 7 g of Intermediate 26, 1.5 g of diphenylamine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.5 g of Compound 20 (yield 80%). MS[M+H]+=957

Synthesis Example 21. Synthesis of Compound 21

1) Synthesis of Intermediate 27

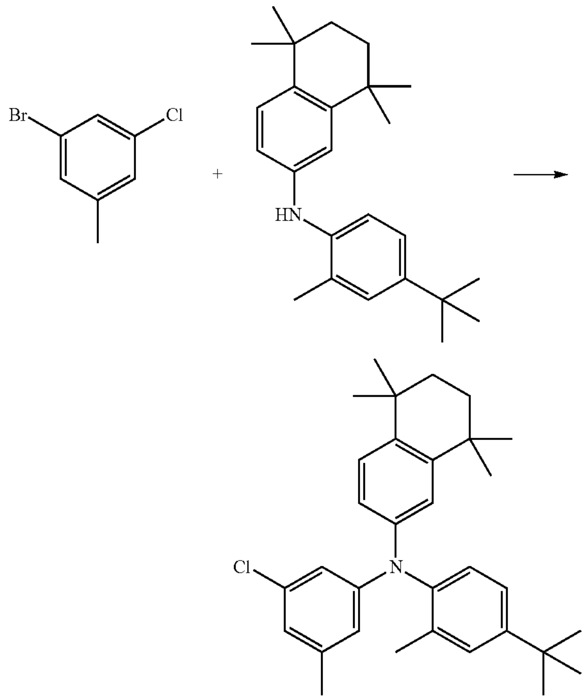

[Intermediate 27]

40 g of 1-bromo-3-chloro-5-methylbenzene and 56.5 g of N-(4-(tert-butyl)-2-methylphenyl)-5,5,8,8-tetramethyl-5,6,7,8-tetrahydronaphthalen-2-amine, and the same material and equivalent weight as in the synthesis method of Intermediate 1 were used, and the resulting product was recrystallized to obtain 55 g of Intermediate 27. (yield 72%). MS[M+H]+=475

2) Synthesis of Intermediate 28

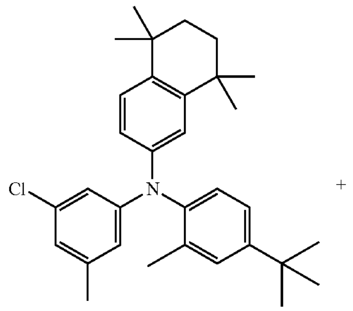

[Intermediate 27]

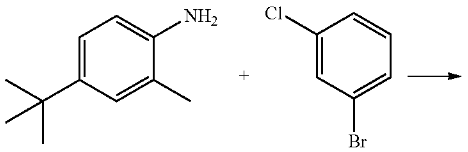

-continued

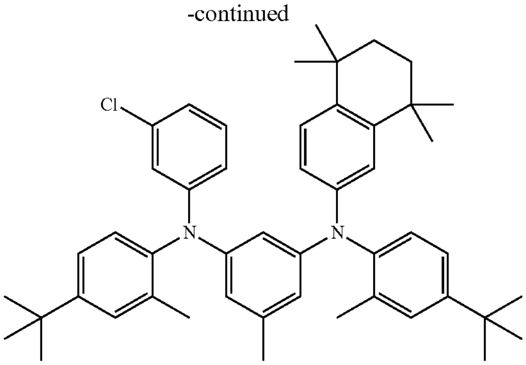

[Intermediate 28]

After 40 g of Intermediate 27, 13.8 g of 4-(tert-butyl)-2-methylaniline, 24.3 g of sodium-tert-butoxide, and 0.4 g of bis(tri-tert-butylphosphine)palladium(0) were put into 600 ml of toluene, the resulting mixture was refluxed for 1 hour, whether the reaction proceeded was confirmed, and then 16.2 g of 1-bromo-3-chlorobenzene was added thereto during the reflux reaction, and the reflux reaction was performed for an additional 1 hour. After the completion of the reaction, the resulting product was extracted, and then recrystallized to obtain 44 g of Intermediate 28. (yield 73%). MS[M+H]+=712

3) Synthesis of Intermediate 29

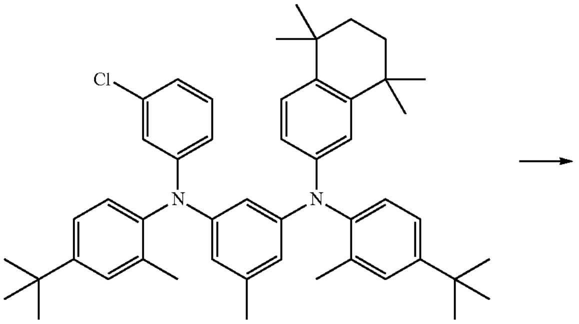

[Intermediate 28]

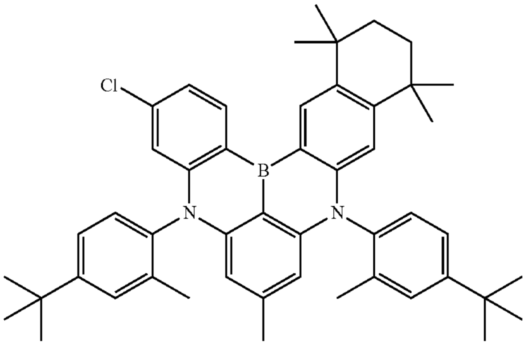

[Intermediate 29]

After 25 g of Intermediate 28 and 23.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 8.2 g of Intermediate 29 (yield 32%). MS[M+H]+=720

4) Synthesis of Compound 21

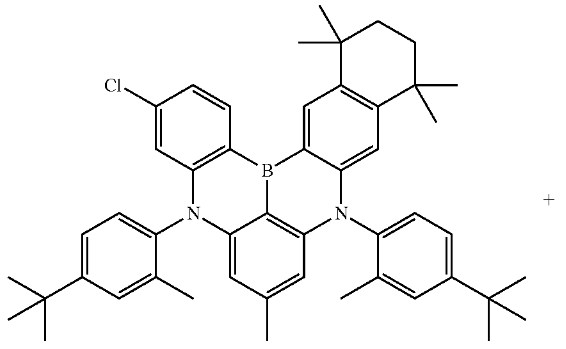

[Intermediate 29]

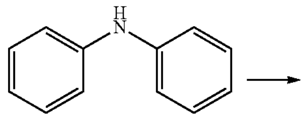

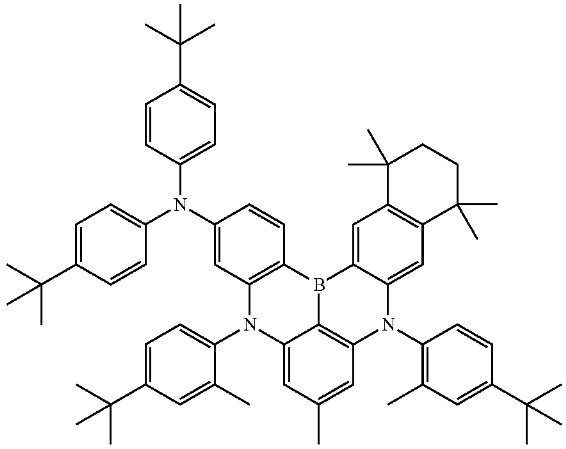

[Compound 21]

After 7 g of Intermediate 29, 1.7 g of diphenylamine, 1.8 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.6 g of Compound 21 (yield 70%). MS[M+H]+=965

Synthesis Example 22. Synthesis of Compound 22

1) Synthesis of Intermediate 30

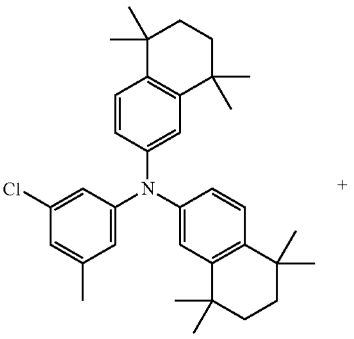

[Intermediate 7]

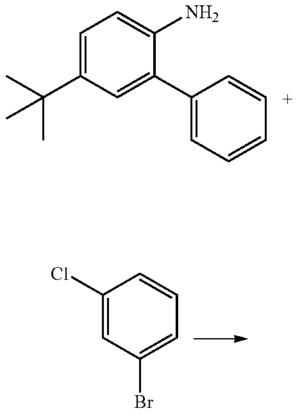

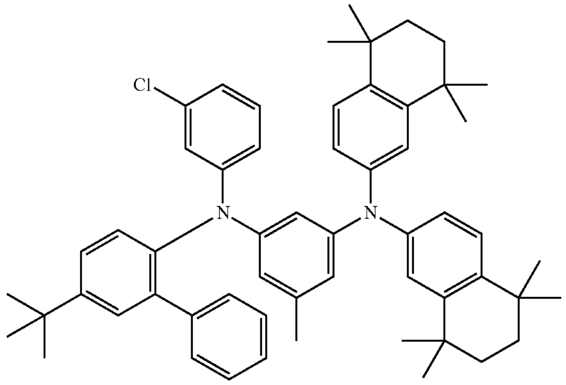

[Intermediate 30]

After 40 g of Intermediate 7, 17.6 g of 5-(tert-butyl)-[1, 1'-biphenyl]-2-amine, 22.4 g of sodium-tert-butoxide, and 0.4 g of bis(tri-tert-butylphosphine)palladium(0) were put into 600 ml of toluene, the resulting mixture was refluxed for 1 hour, whether the reaction proceeded was confirmed, and then 14.9 g of 1-bromo-3-chlorobenzene was added thereto during the reflux reaction, and the reflux reaction was performed for an additional 1 hour. After the completion of the reaction, the resulting product was extracted, and then recrystallized to obtain 45 g of Intermediate 30. (yield 71%). MS[M+H]+=814

2) Synthesis of Intermediate 31

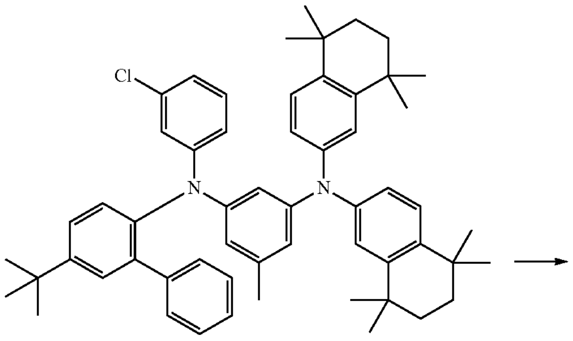

[Intermediate 30]

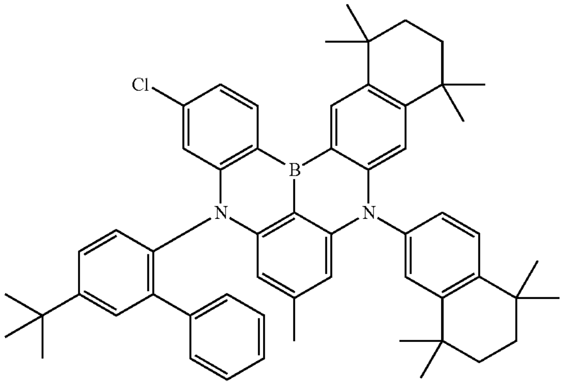

[Intermediate 31]

After 25 g of Intermediate 30 and 20.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 8.3 g of Intermediate 31 (yield 33%). MS[M+H]+=822

3) Synthesis of Compound 22

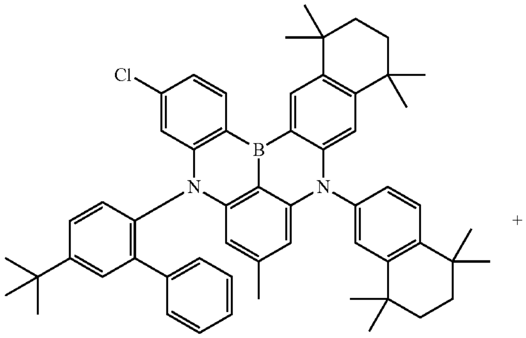

[Intermediate 31]

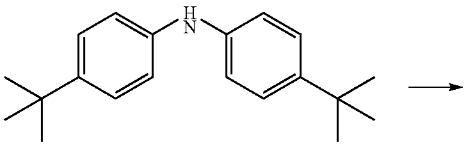

-continued

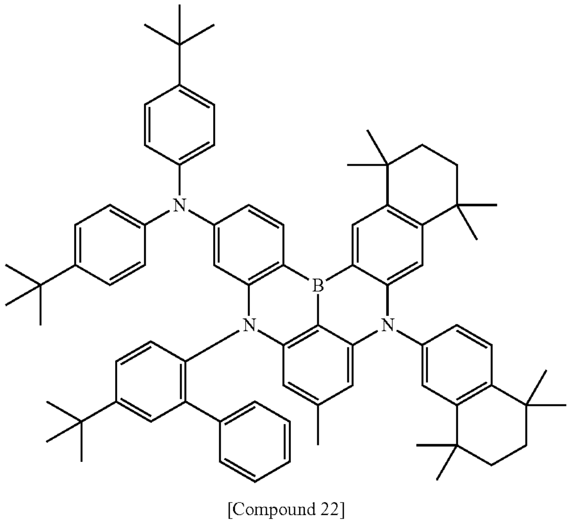

[Compound 22]

After 7 g of Intermediate 31, 2.4 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.5 g of Compound 22 (yield 72%). MS[M+H]+=1067

Synthesis Example 23. Synthesis of Compound 23

3) Synthesis of Compound 23

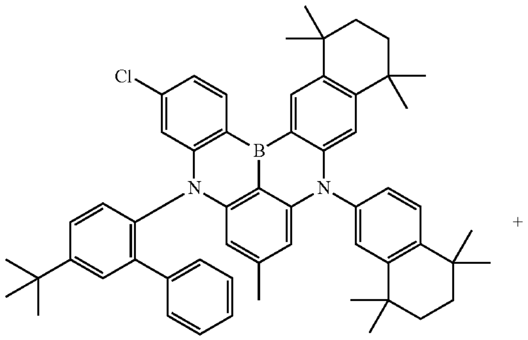

[Intermediate 31]

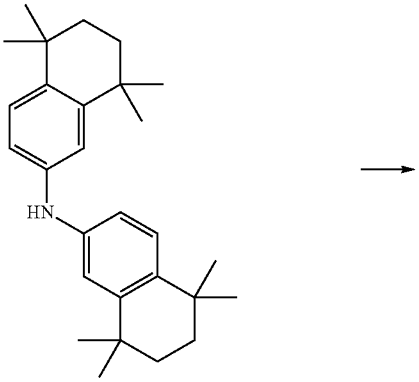

-continued

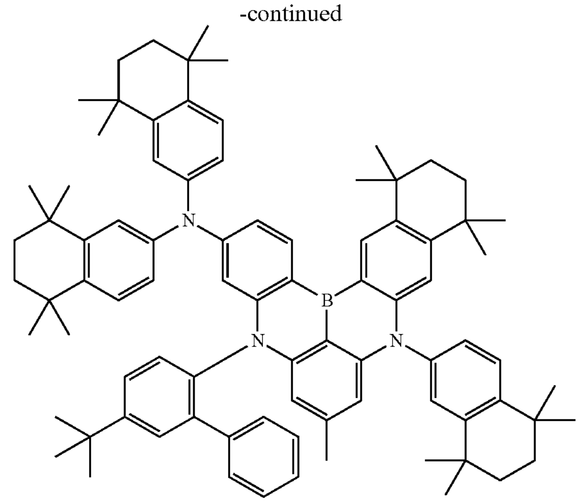

[Compound 23]

After 7 g of Intermediate 31, 3.4 g of bis(5,5,8,8-tetramethyl-5,6,7,8-tetrahydronaphthalen-2-yl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 7.4 g of Compound 23 (yield 74%). MS[M+H]+=1175

Synthesis Example 25. Synthesis of Compound 25

1) Synthesis of Intermediate 32

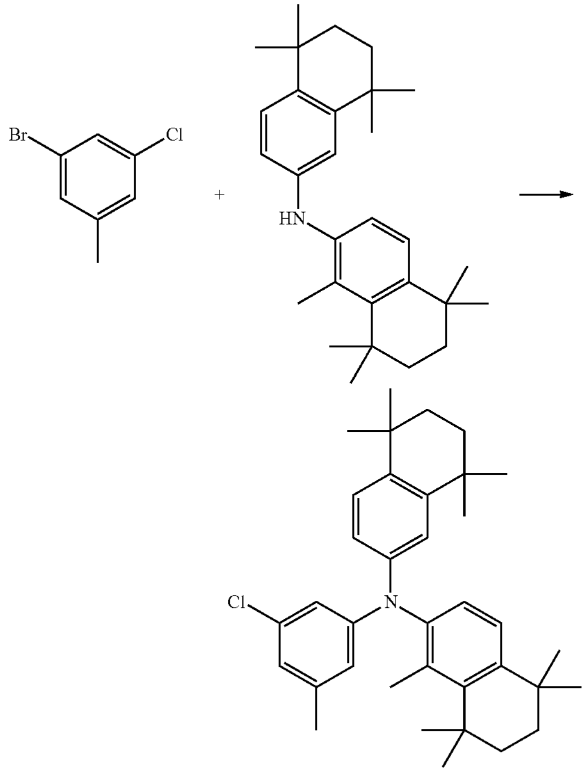

[Intermediate 32]

40 g of 1-bromo-3-chloro-5-methylbenzene and 78.6 g of 1,5,5,8,8-pentamethyl-N-(5,5,8,8-tetramethyl-5,6,7,8-tetrahydronaphthalen-2-yl)-5,6,7,8-tetrahydronaphthalen-2-amine, and the same material and equivalent weight as in the synthesis method of Intermediate 1 were used, and the resulting product was recrystallized to obtain 72 g of Intermediate 32. (yield 70%). MS[M+H]+=529

2) Synthesis of Intermediate 33

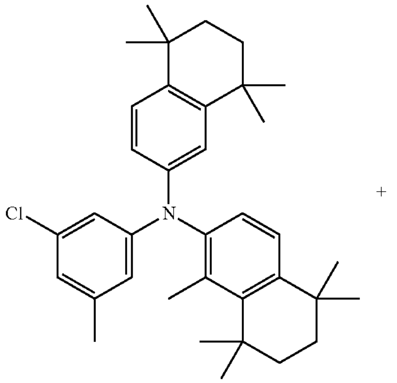

[Intermediate 32]

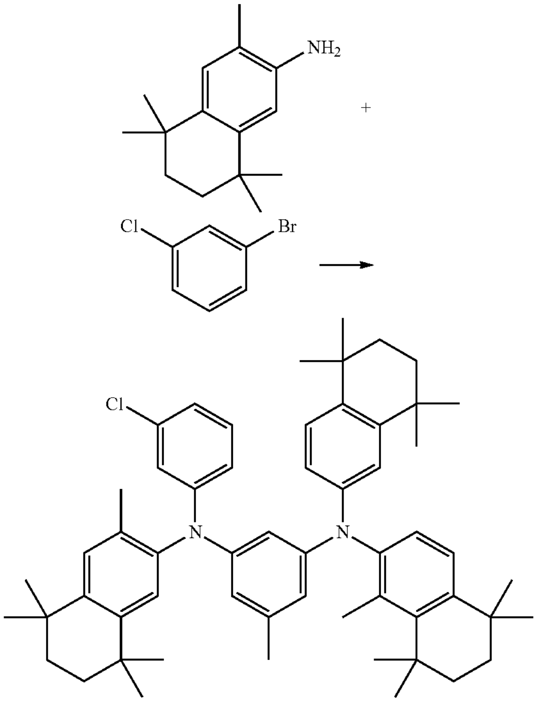

[Intermediate 33]

After 40 g of Intermediate 32, 16.5 g of 3,5,5,8,8-pentamethyl-5,6,7,8-tetrahydronaphthalen-2-amine, 14.5 g of sodium-tert-butoxide, and 0.4 g of bis(tri-tert-butylphosphine)palladium(0) were put into 600 ml of toluene, the resulting mixture was refluxed for 1 hour, whether the reaction proceeded was confirmed, and then 14.5 g of 1-bromo-3-chlorobenzene was added thereto during the reflux reaction, and the reflux reaction was performed for an additional 1 hour. After the completion of the reaction, the resulting product was extracted, and then recrystallized to obtain 46 g of Intermediate 33. (yield 74%). MS[M+H]+=820

3) Synthesis of Intermediate 34

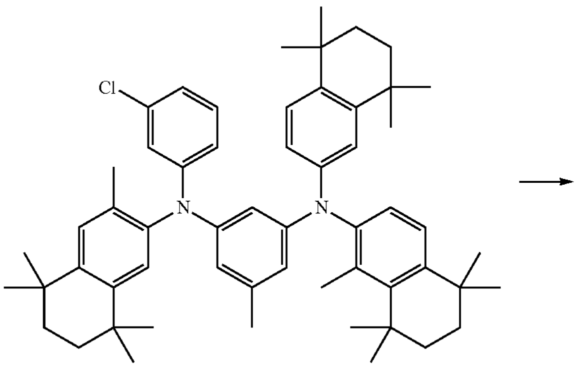

[Intermediate 33]

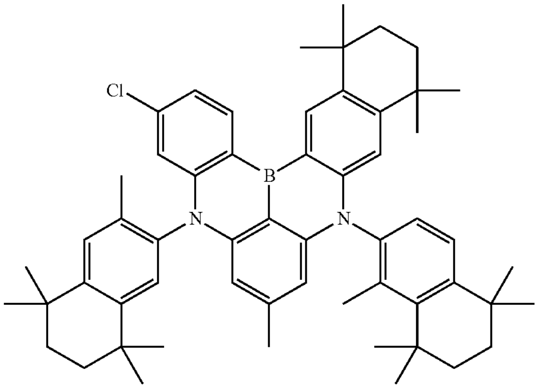

[Intermediate 34]

After 25 g of Intermediate 33 and 20.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 34 (yield 31%). MS[M+H]+=828

4) Synthesis of Compound 25

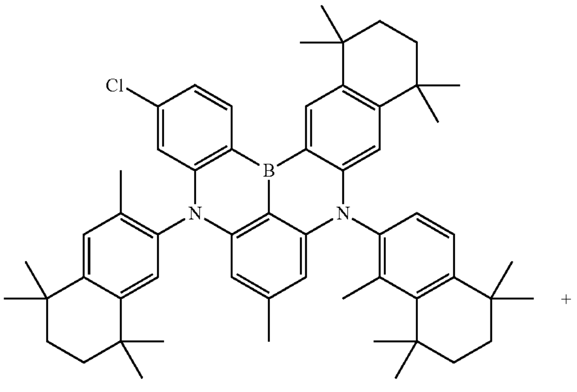

[Intermediate 34]

-continued

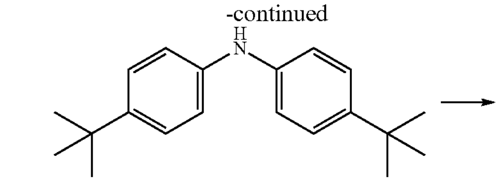

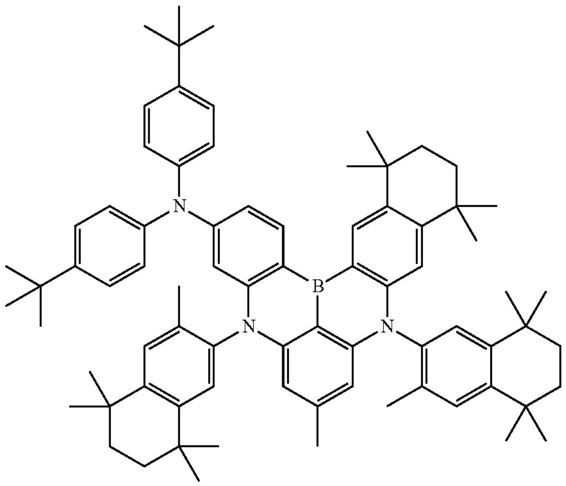

[Compound 25]

After 7 g of Intermediate 34, 2.4 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.8 g of Compound 25 (yield 75%). MS[M+H]+=1073

Synthesis Example 26. Synthesis of Compound 26

1) Synthesis of Intermediate 35

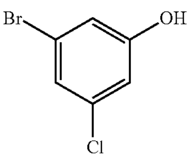

+

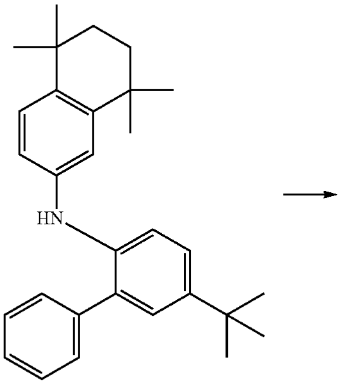

-continued

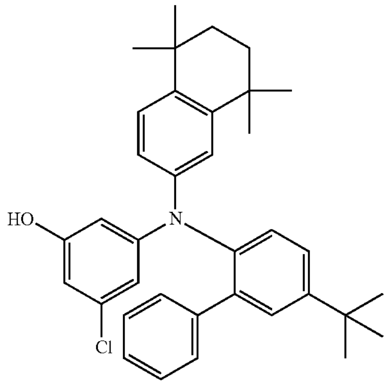

[Intermediate 35]

40 g of 3-bromo-5-chlorophenol and 79.4 g of N-(5-(tert-butyl)-[1,1'-biphenyl]-2-yl)-5,5,8,8-tetramethyl-5,6,7,8-tetrahydronaphthalen-2-amine, and the same material and equivalent weight as in the synthesis method of Intermediate 1 were used, and the resulting product was recrystallized to obtain 70 g of Intermediate 35. (yield 57%). MS[M+H]+=539

2) Synthesis of Intermediate 36

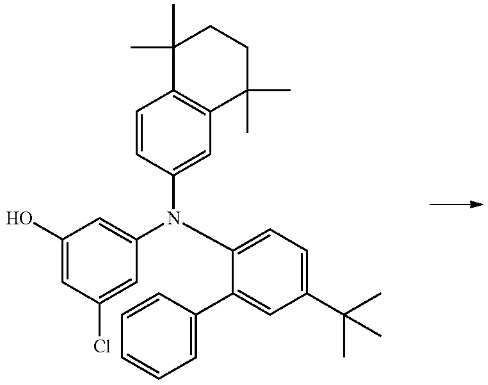

[Intermediate 35]

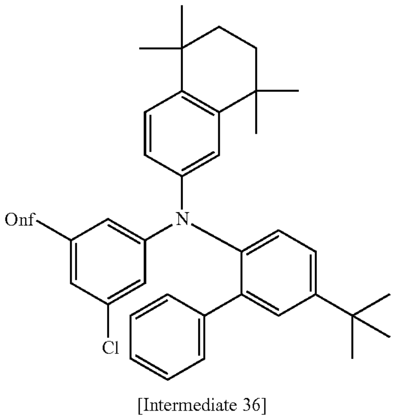

[Intermediate 36]

After 40 g of intermediate 35, 20 ml of 1,1,2,2,3,3,4,4,4-nonafluorobutane-1-sulfonyl fluoride, and 30 g of potassium carbonate were put into 400 ml of tetrahydrofuran and 200 ml of water, the resulting mixture was reacted for 3 hours, and then the resulting product was extracted after the completion of the reaction, and then the solvent was removed to obtain 58 g of Intermediate 36. (yield 97%). MS[M+H]+=805

3) Synthesis of Intermediate 37

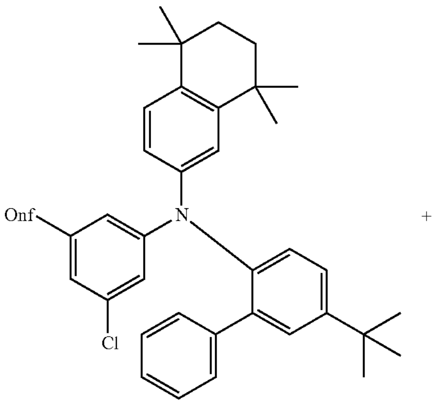

[Intermediate 36]

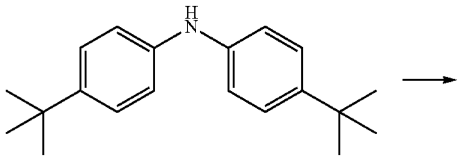

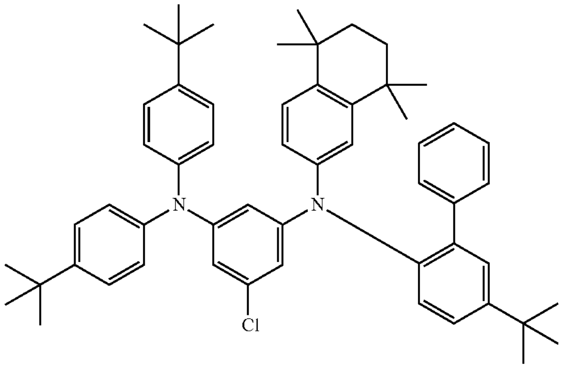

[Intermediate 37]

After 40 g of Intermediate 36, 14 g of bis(4-(tert-butyl)phenyl)amine, 0.85 g of Pd(dba)$_2$, 1.42 g of Xphos, and 48.6 g of cesium carbonate were put into 500 ml of xylene under a nitrogen atmosphere, the resulting mixture was stirred under reflux for 24 hours. After the completion of the reaction, the resulting product was extracted, and then recrystallized to obtain 31 g of Intermediate 37. (yield 78%). MS[M+H]+=802

4) Synthesis of Intermediate 38

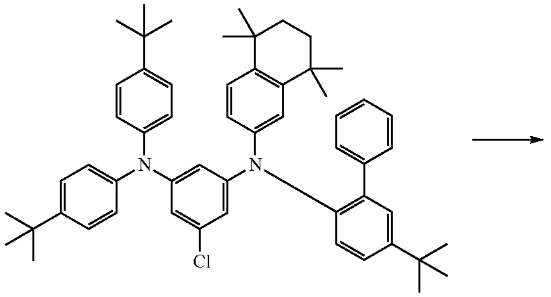

[Intermediate 37]

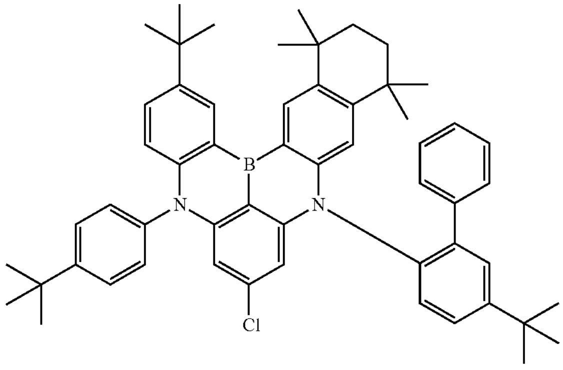

[Intermediate 38]

After 25 g of Intermediate 37 and 20.8 g of boron triiodide were put into 250 ml of 1,2-dichlorobenzene, the resulting mixture was stirred at 160° C. for 4 hours. After the completion of the reaction, the resulting product was extracted, and then recrystallized to obtain 7.9 g of Intermediate 38 (yield 31%). MS[M+H]+=810

5) Synthesis of Compound 26

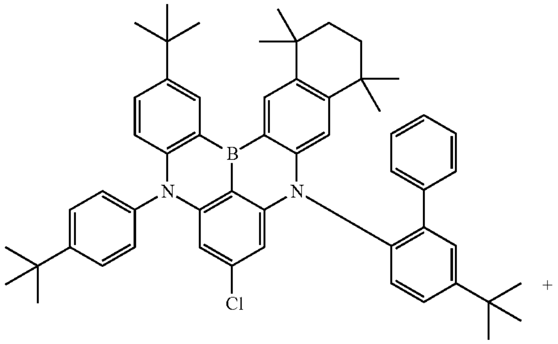

[Intermediate 38]

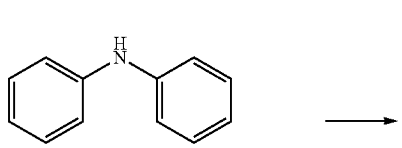

-continued

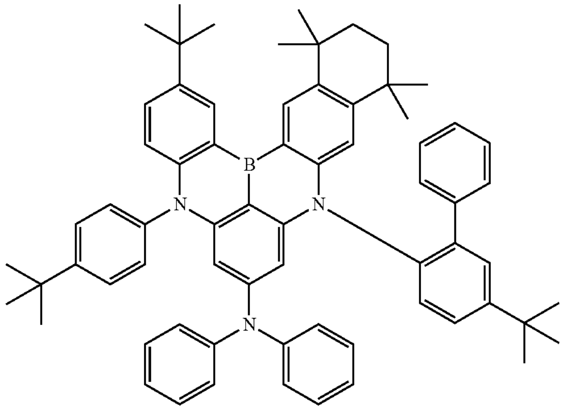

[Compound 26]

After 7 g of Intermediate 38, 1.46 g of diphenylamine, 2.5 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.2 g of Compound 26 (yield 76%). MS[M+H]+=943

Synthesis Example 27. Synthesis of Compound 27

1) Synthesis of Compound 27

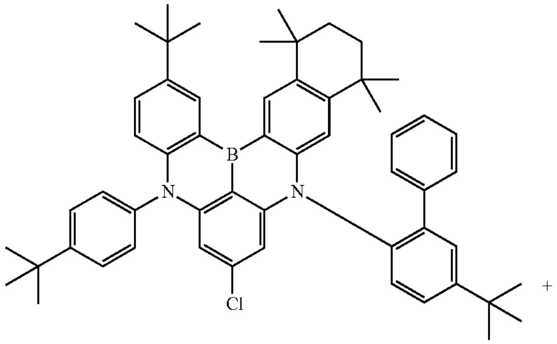

[Intermediate 38]

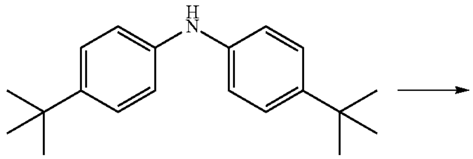

-continued

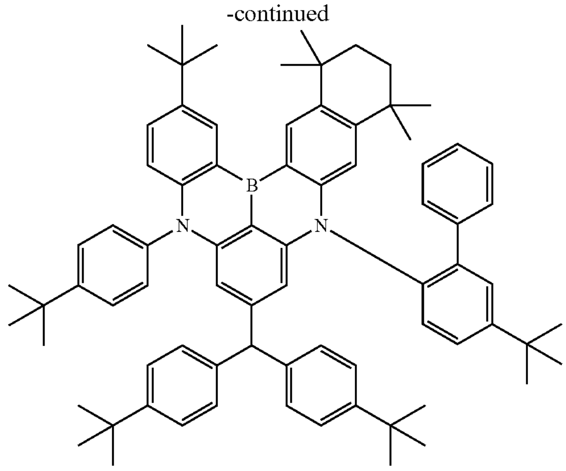

[Compound 27]

After 7 g of Intermediate 38, 2.43 g of bis(4-(tert-butyl) phenyl)amine, 2.5 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.7 g of Compound 27 (yield 73%). MS[M+H]+=1055

Synthesis Example 29. Synthesis of Compound 29

1) Synthesis of Intermediate 41

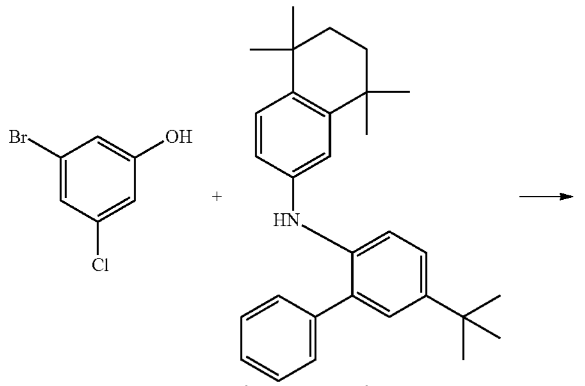

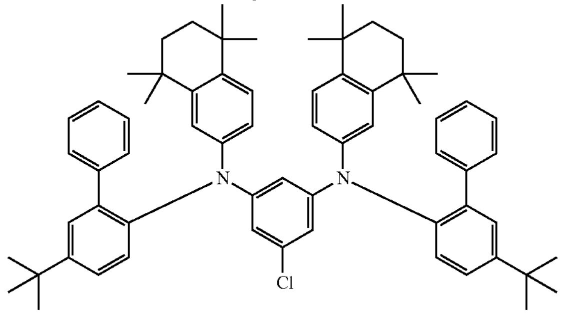

[Intermediate 41]

After 40 g of 1,3-dibromo-5-chlorobenzene, 121.8 g of N-(5-(tert-butyl)-[1,1'-biphenyl]-2-yl)-5,5,8,8-tetramethyl-5,6,7,8-tetrahydronaphthalen-2-amine, 56.9 g of sodium-tert-butoxide, and 0.8 g of bis(tri-tert-butylphosphine)palladium(0) were put into 1,200 ml of toluene under a nitrogen atmosphere, the resulting mixture was refluxed for 1 hour, the resulting product was extracted after the completion of the reaction, and then recrystallized to obtain 99 g of Intermediate 41. (yield 72%). MS[M+H]+=932

2) Synthesis of Intermediate 42

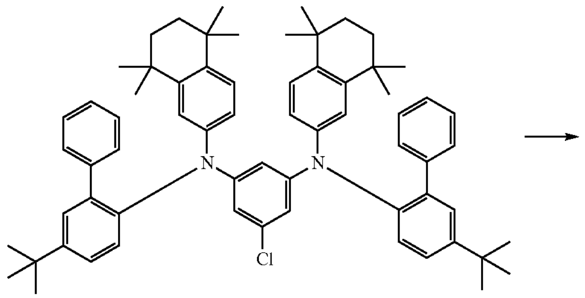

[Intermediate 41]

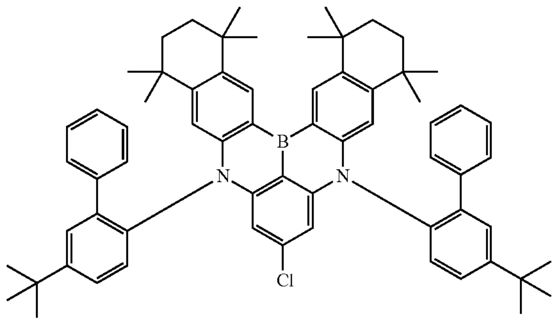

[Intermediate 42]

After 25 g of Intermediate 41 and 17.9 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 42 (yield 31%). MS[M+H]+=940

3) Synthesis of Compound 29

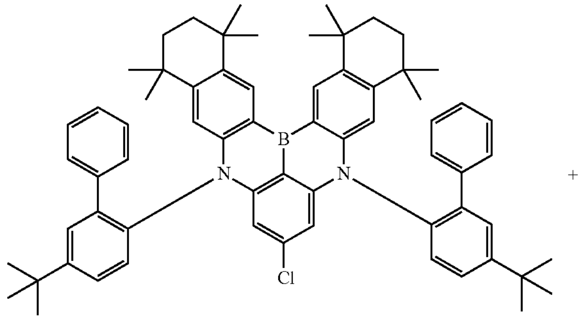

[Intermediate 42]

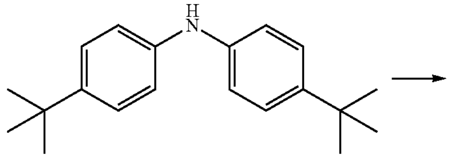

-continued

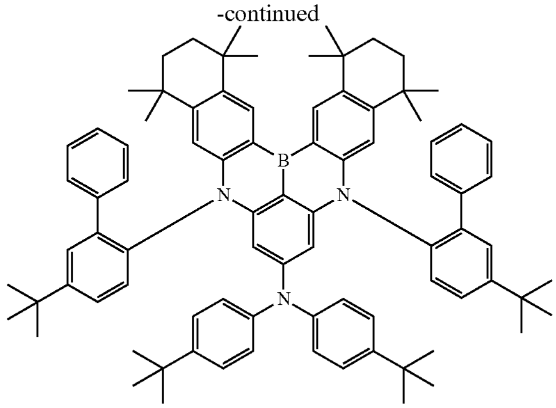

[Compound 29]

After 7 g of Intermediate 42, 2.1 g of bis(4-(tert-butyl) phenyl)amine, 1.5 g of sodium-tert-butoxide, and 0.04 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.4 g of Compound 29 (yield 72%). MS[M+H]+=1185

Synthesis Example 30. Synthesis of Compound 30

1) Synthesis of Intermediate 43

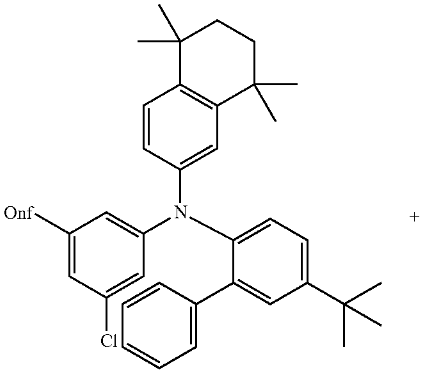

[Intermediate 36]

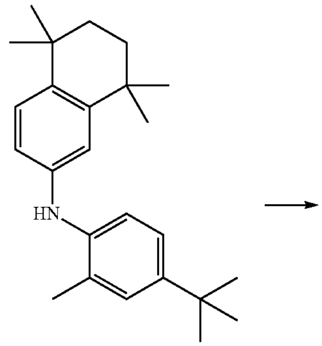

-continued

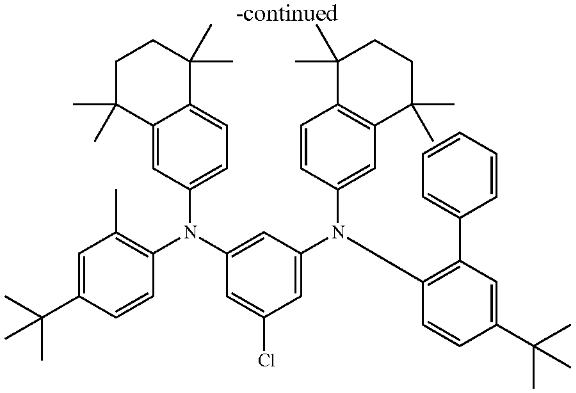

[Intermediate 43]

40 g of intermediate 36 and 17.4 g of N-(4-(tert-butyl)-2-methylphenyl)-5,5,8,8-tetramethyl-5,6,7,8-tetrahydronaphthalen-2-amine, and the same material and equivalent weight as in the synthesis method of Intermediate 37 under a nitrogen atmosphere were used, and the resulting product was recrystallized to obtain 35 g of Intermediate 43. (yield 81%). MS[M+H]+=870

2) Synthesis of Intermediate 44

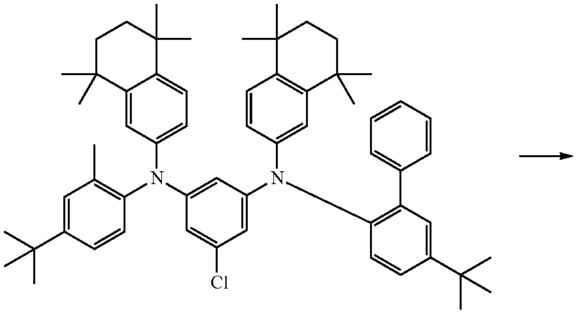

[Intermediate 43]

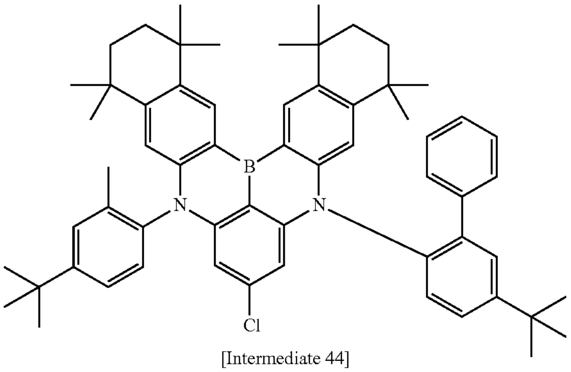

[Intermediate 44]

After 25 g of Intermediate 43 and 19.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.8 g of Intermediate 44 (yield 31%). MS[M+H]+=878

3) Synthesis of Compound 30

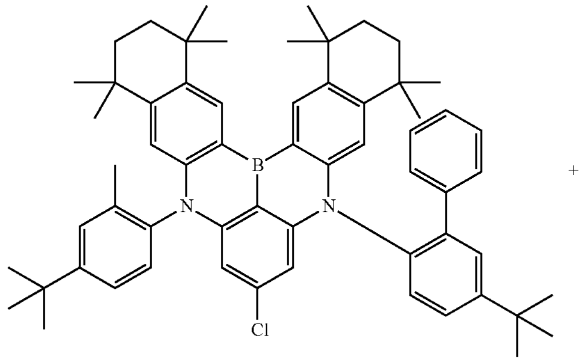

[Intermediate 44]

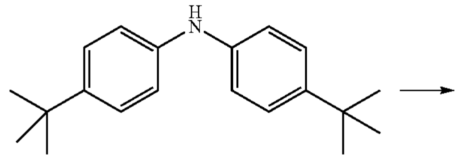

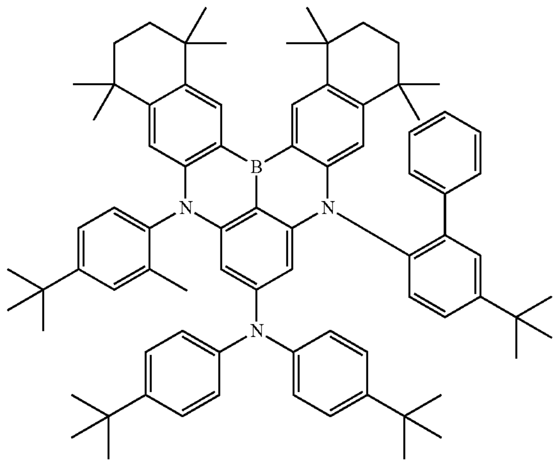

[Compound 30]

After 7 g of Intermediate 44, 2.2 g of bis(4-(tert-butyl)phenyl)amine, 1.5 g of sodium-tert-butoxide, and 0.04 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.6 g of Compound 30 (yield 74%). MS[M+H]+=1123

Synthesis Example 31. Synthesis of Compound 31

1) Synthesis of Intermediate 45

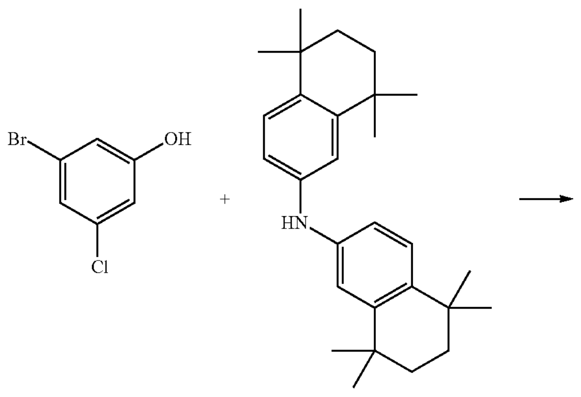

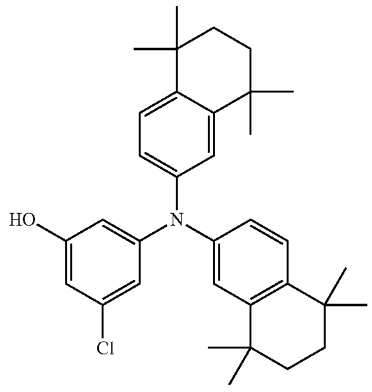

[Intermediate 45]

40 g of 3-bromo-5-chlorophenol and 75.2 g of bis(5,5,8,8-tetramethyl-5,6,7,8-tetrahydronaphthalen-2-yl)amine, and the same material and equivalent weight as in the synthesis method of Intermediate 35 were used, and the resulting product was recrystallized to obtain 70 g of Intermediate 45. (yield 70%). MS[M+H]+=517

2) Synthesis of Intermediate 46

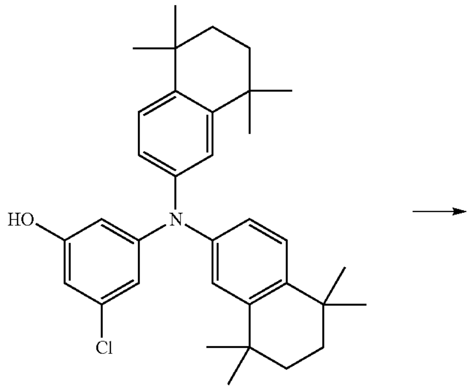

[Intermediate 45]

-continued

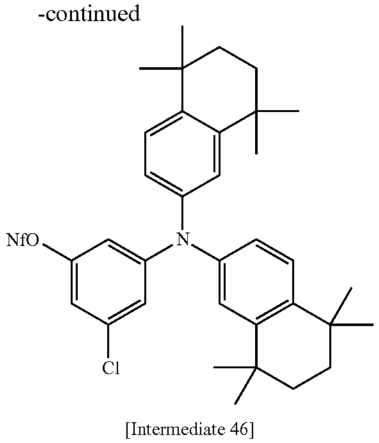

[Intermediate 46]

40 g of Intermediate 45 was used with the same material and equivalent weight as in the synthesis method of Intermediate 36 to obtain 56 g of Intermediate 46. (yield 92%). MS[M+H]+=783

3) Synthesis of Intermediate 47

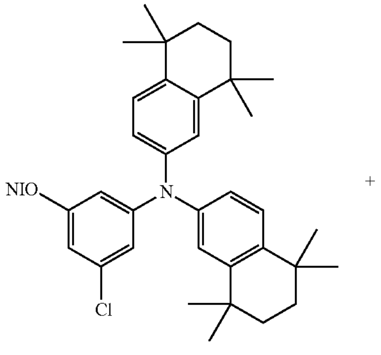

[Intermediate 46]

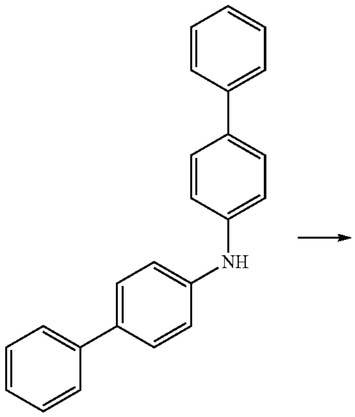

-continued

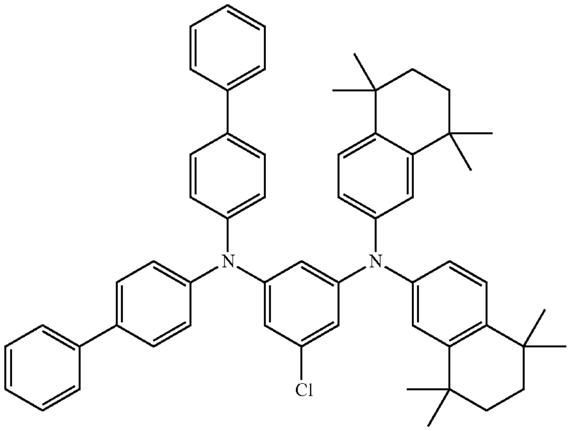

[Intermediate 47]

40 g of Intermediate 46 and 16.4 g of di([1,1'-biphenyl]-4-yl)amine, and the same material and equivalent weight as in the synthesis method of Intermediate 37 under a nitrogen atmosphere were used, and the resulting product was recrystallized to obtain 34 g of Intermediate 47 (yield 81%). MS[M+H]+=820

4) Synthesis of Intermediate 48

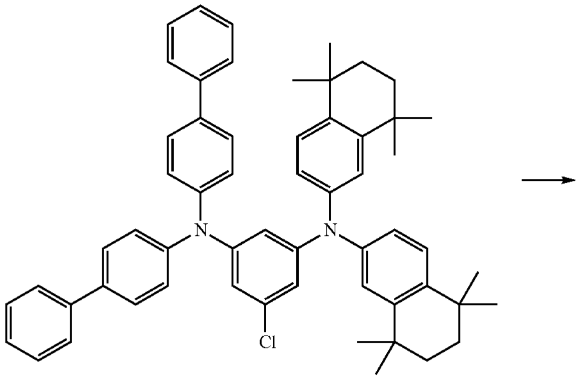

[Intermediate 47]

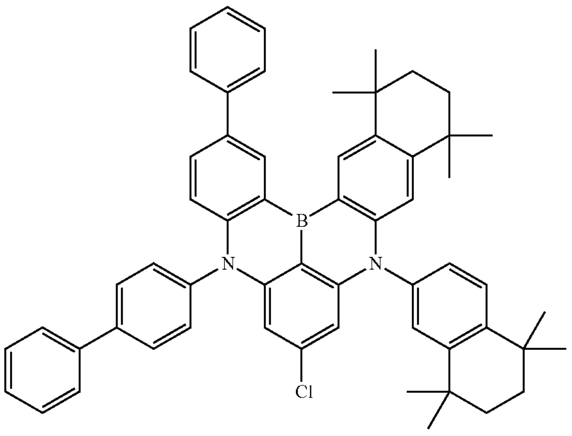

[Intermediate 48]

25 g of Intermediate 47, and the same material and equivalent weight as in the synthesis method of Intermediate 38 were used, and the resulting product was recrystallized to obtain 7.5 g of Intermediate 48 (yield 30%). MS[M+H]+=828

5) Synthesis of Compound 31

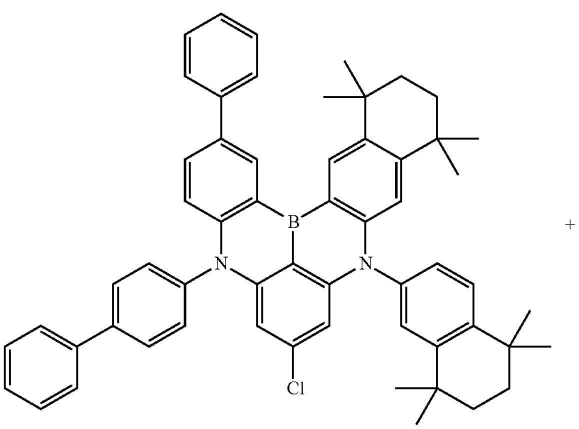

[Intermediate 48]

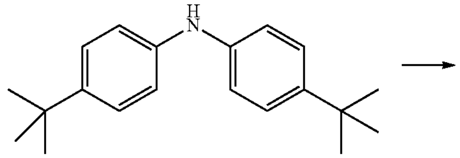

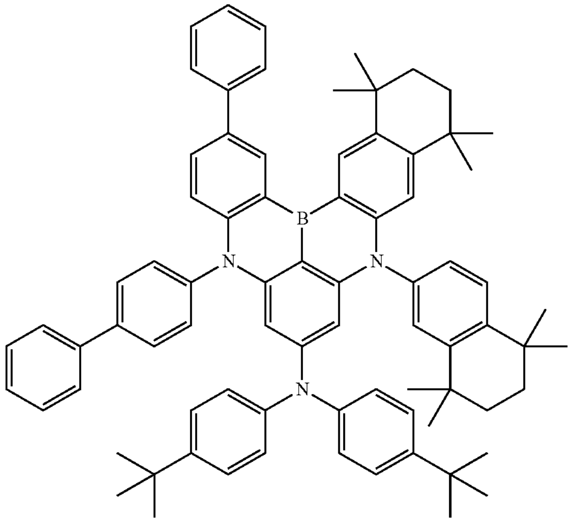

[Compound 31]

After 7 g of Intermediate 48, 1.46 g of bis(4-(tert-butyl) phenyl)amine, 1.5 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.7 g of Compound 31 (yield 78%). MS[M+H]+=1073

Synthesis Example 32. Synthesis of Compound 32

1) Synthesis of Intermediate 49

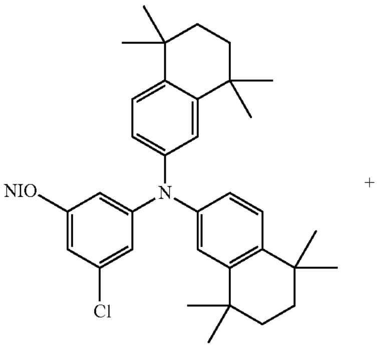

[Intermediate 46]

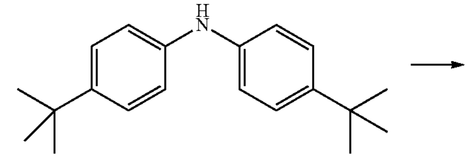

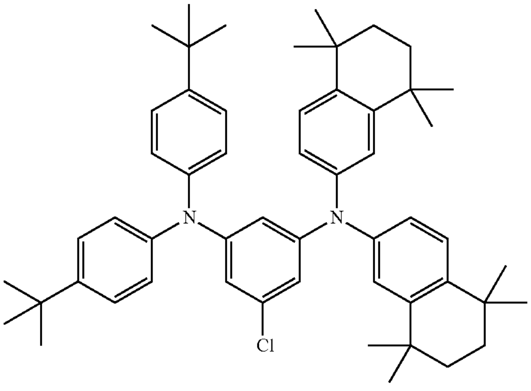

[Intermediate 49]

40 g of Intermediate 46 and 14 g of bis(4-(tert-butyl) phenyl)amine, and the same material and equivalent weight as in the synthesis method of Intermediate 37 under a nitrogen atmosphere were used, and the resulting product was recrystallized to obtain 32 g of Intermediate 49 (yield 83%). MS[M+H]+=780

2) Synthesis of Intermediate 50

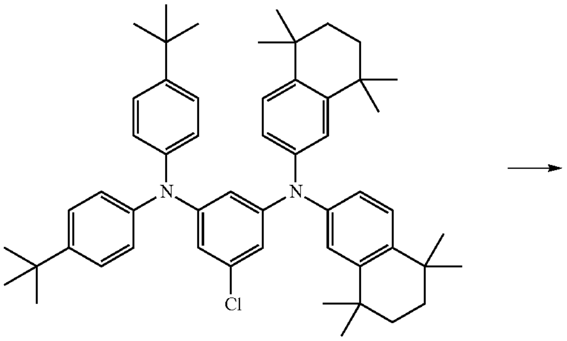

[Intermediate 49]

-continued

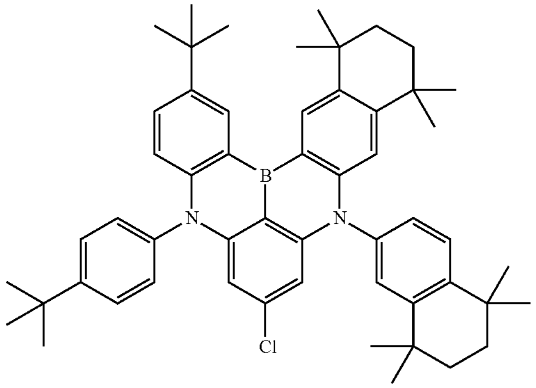

[Intermediate 50]

After 25 g of Intermediate 49 and 21.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 50 (yield 30%). MS[M+H]+=788

3) Synthesis of Compound 32

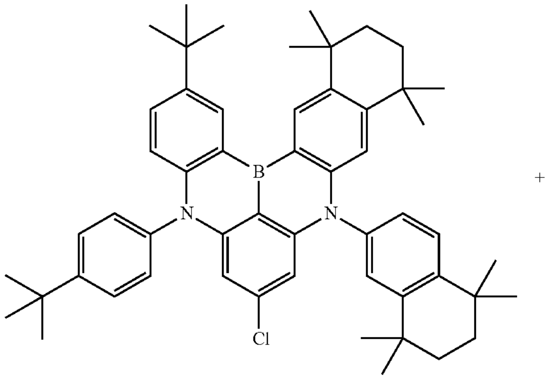

[Intermediate 50]

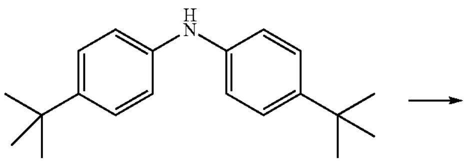

-continued

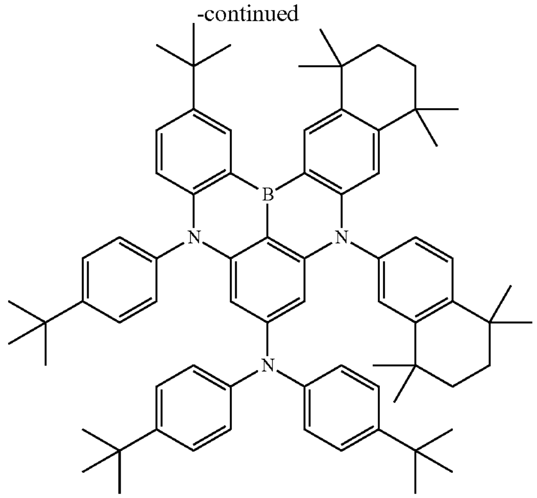

[Compound 32]

After 7 g of Intermediate 50, 2.5 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.5 g of Compound 32 (yield 71%). MS[M+H]+=1033

Synthesis Example 33. Synthesis of Compound 33

1) Synthesis of Intermediate 51

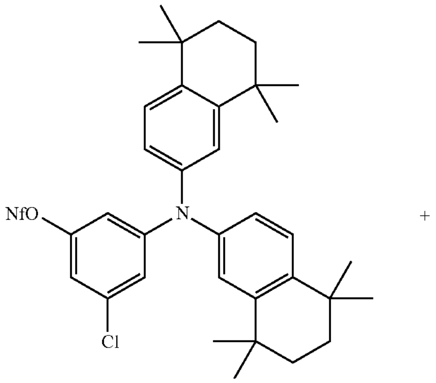

[Intermediate 46]

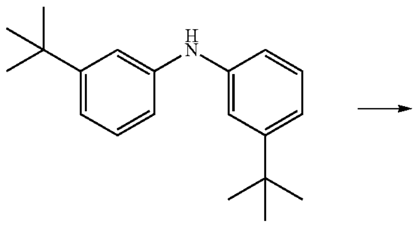

-continued

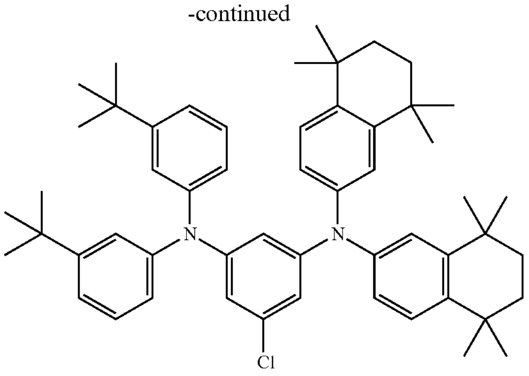

[Intermediate 51]

40 g of Intermediate 46 and 14 g of bis(3-(tert-butyl) phenyl)amine, and the same material and equivalent weight as in the synthesis method of Intermediate 37 under a nitrogen atmosphere were used, and the resulting product was recrystallized to obtain 30 g of Intermediate 51 (yield 81%). MS[M+H]+=780

2) Synthesis of Intermediate 52

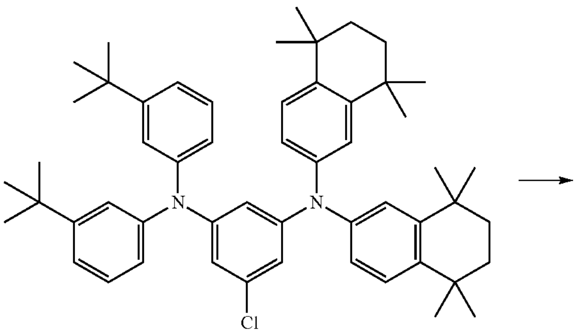

[Intermediate 51]

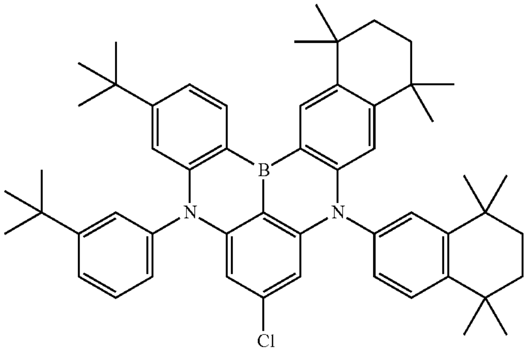

[Intermediate 52]

After 25 g of Intermediate 51 and 21.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Intermediate 52 (yield 30%). MS[M+H]+=788

3) Synthesis of Compound 33

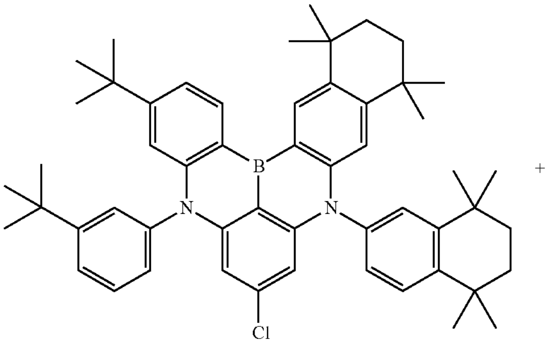

[Intermediate 52]

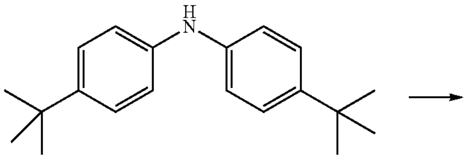

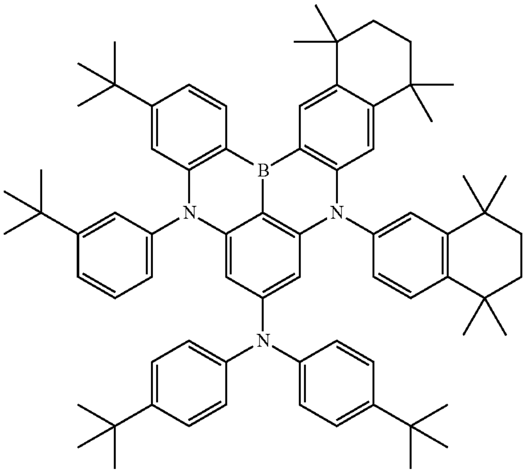

[Compound 33]

After 7 g of Intermediate 52, 2.5 g of bis(4-(tert-butyl) phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.6 g of Compound 33 (yield 72%). MS[M+H]+=1033

Synthesis Example 34. Synthesis of Compound 34

1) Synthesis of Intermediate 53

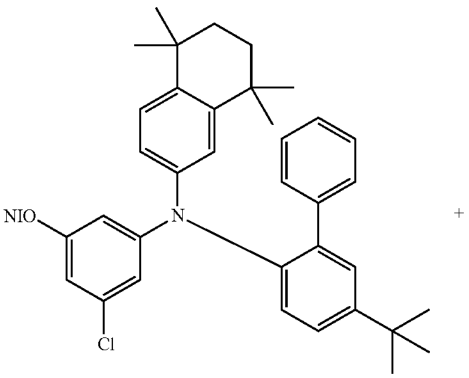

[Intermediate 36]

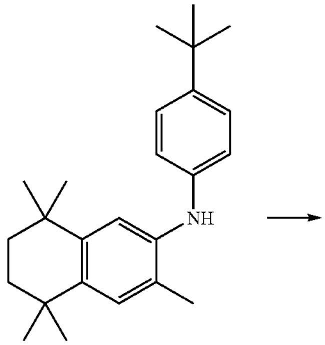

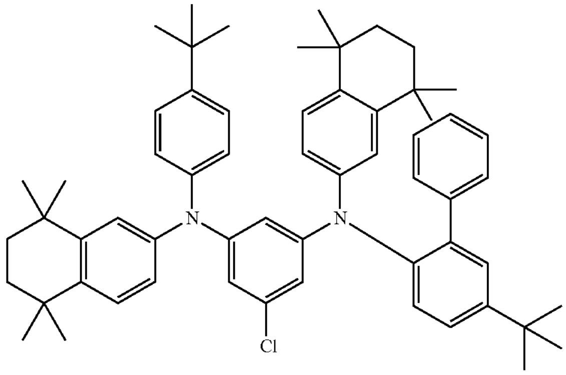

[Intermediate 53]

40 g of intermediate 36 and 17.4 g of N-(4-(tert-butyl) phenyl)-3,5,5,8,8-pentamethyl-5,6,7,8-tetrahydronaphthalen-2-amine, and the same material and equivalent weight as in the synthesis method of Intermediate 37 under a nitrogen atmosphere were used, and the resulting product was recrystallized to obtain 34 g of Intermediate 53. (yield 79%). MS[M+H]+=870

2) Synthesis of Intermediate 54

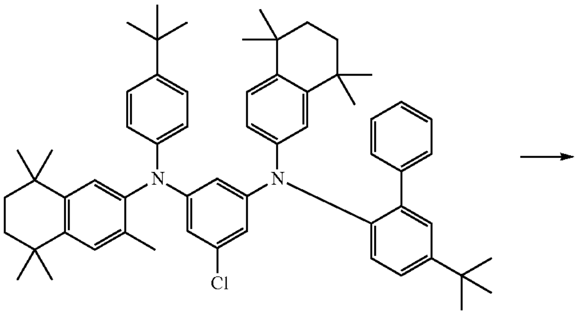

[Intermediate 53]

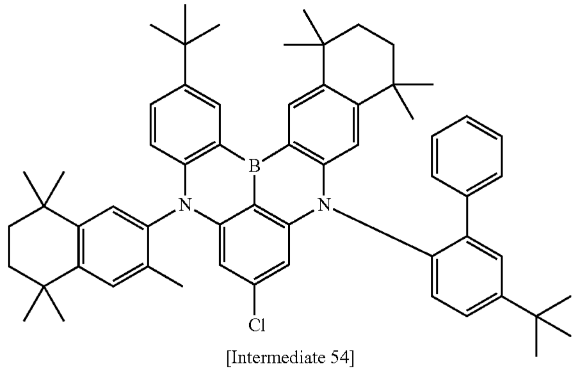

[Intermediate 54]

After 25 g of Intermediate 53 and 19.2 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.1 g of Intermediate 54 (yield 28%). MS[M+H]+=878

3) Synthesis of Compound 34

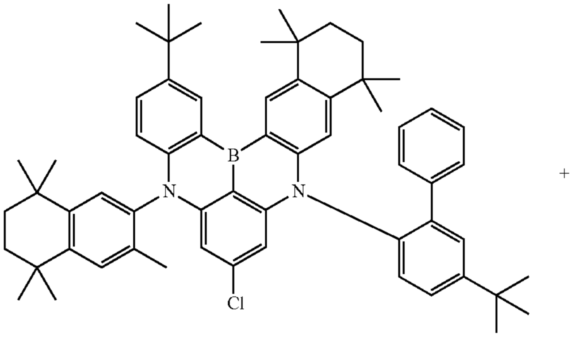

[Intermediate 54]

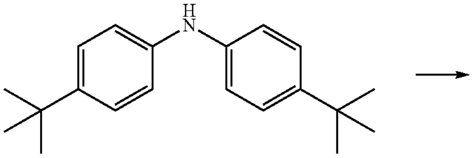

-continued

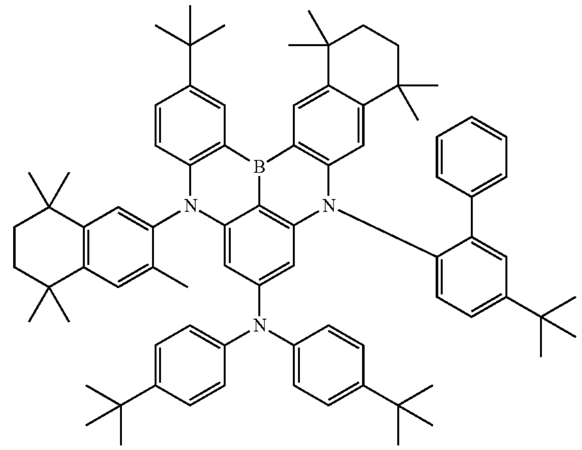

[Compound 34]

After 7 g of Intermediate 54, 2.3 g of bis(4-(tert-butyl)phenyl)amine, 1.5 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.6 g of Compound 34 (yield 74%). MS[M+H]+=1123

Synthesis Example 35. Synthesis of Compound 35

1) Synthesis of Intermediate 55

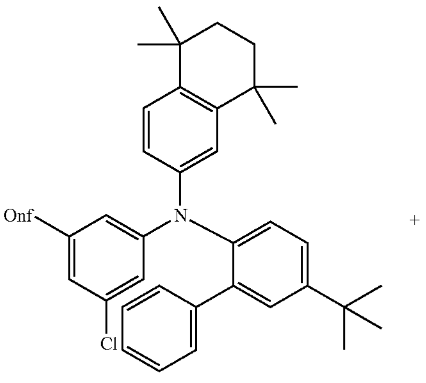

[Intermediate 36]

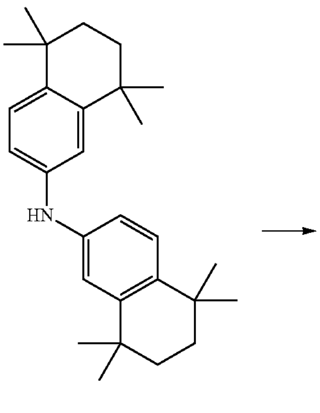

-continued

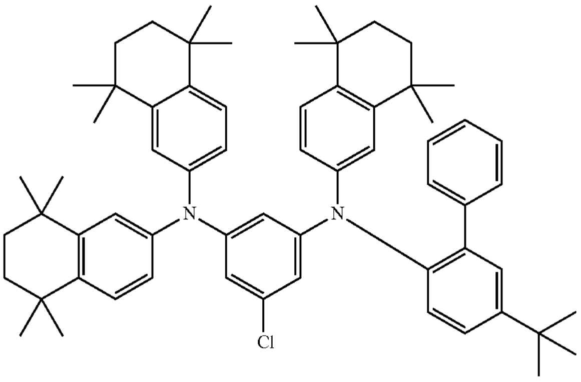

[Intermediate 55]

40 g of Intermediate 36 and 19.4 g of bis(5,5,8,8-tetramethyl-5,6,7,8-tetrahydronaphthalen-2-yl)amine, and the same material and equivalent weight as in the synthesis method of Intermediate 37 under a nitrogen atmosphere were used, and the resulting product was recrystallized to obtain 35 g of Intermediate 55. (yield 77%). MS[M+H]+=910

2) Synthesis of Intermediate 56

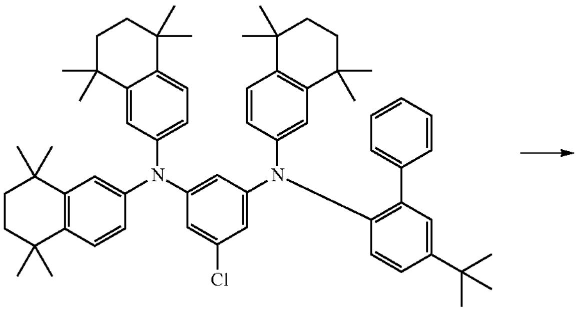

[Intermediate 55]

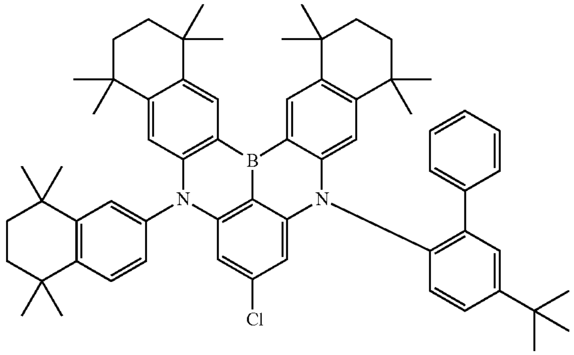

[Intermediate 56]

After 25 g of Intermediate 55 and 18.3 g of boron triiodide were put into 250 ml of 1,2-dichloro-benzene under a nitrogen atmosphere, the resulting mixture was stirred at 160° C. for 4 hours. After the completion of the reaction, the resulting product was extracted, and then recrystallized to obtain 7.4 g of Intermediate 56 (yield 29%). MS[M+H]+=918

3) Synthesis of Compound 35

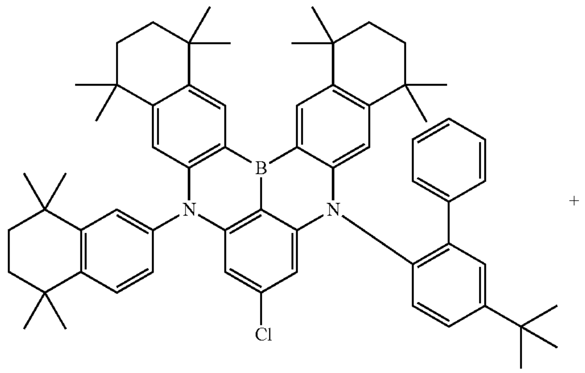

[Intermediate 56]

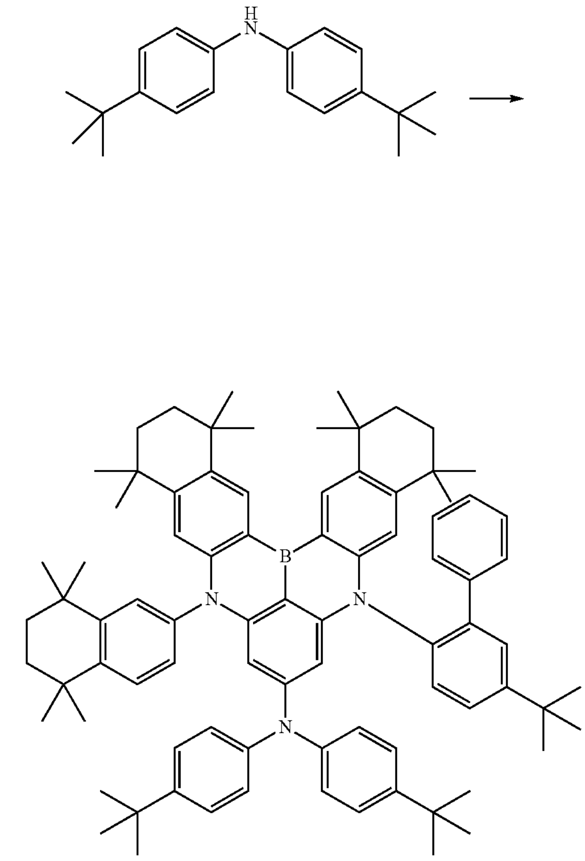

[Compound 35]

After 7 g of Intermediate 56, 2.1 g of bis(4-(tert-butyl) phenyl)amine, 1.5 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.5 g of Compound 35 (yield 73%). MS[M+H]+=1163

Synthesis Example 36. Synthesis of Compound 36

1) Synthesis of Intermediate 57

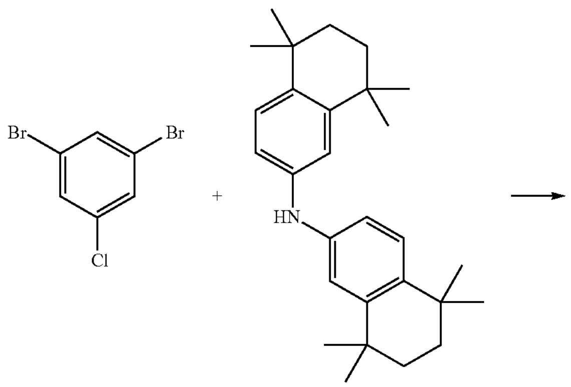

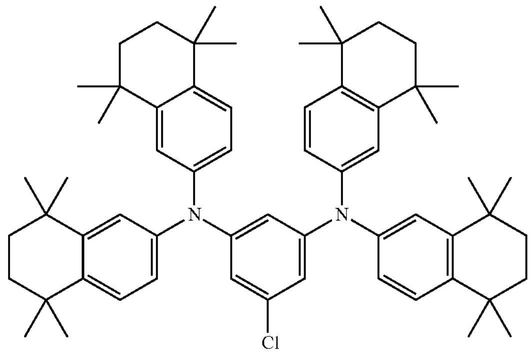

[Intermediate 57]

40 g of 1,3-dibromo-5-chlorobenzene and 115.3 g of bis(5,5,8,8-tetramethyl-5,6,7,8-tetrahydronaphthalen-2-yl) amine, and the same material and equivalent weight as in the synthesis method of Intermediate 41 under a nitrogen atmosphere were used, and the resulting product was recrystallized to obtain 99 g of Intermediate 57. (yield 75%). MS[M+H]+=888

2) Synthesis of Intermediate 58

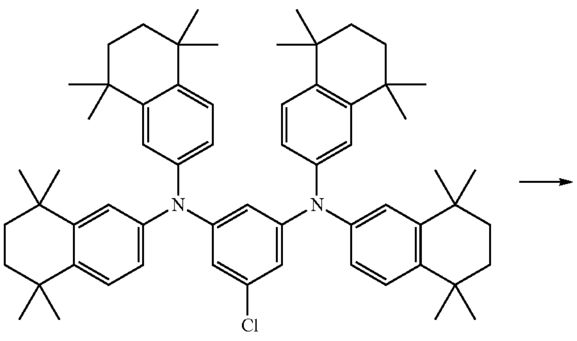

[Intermediate 57]

-continued

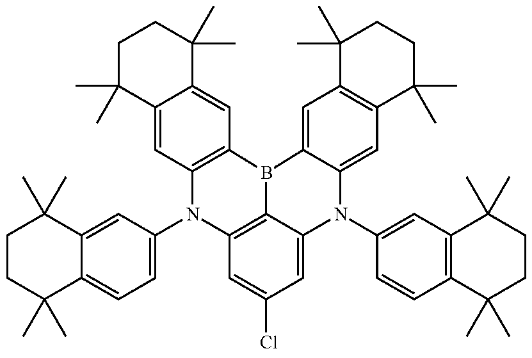

[Intermediate 58]

After 25 g of Intermediate 57 and 18.7 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 58 (yield 31%). MS[M+H]+=896

3) Synthesis of Compound 36

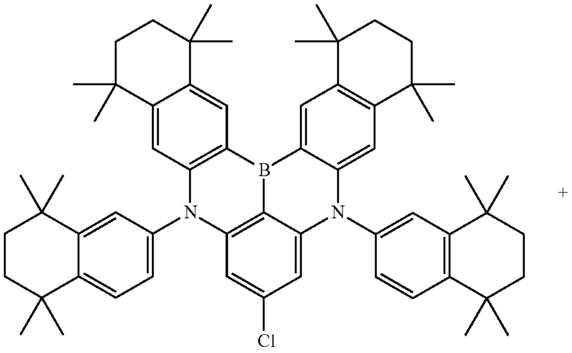

[Intermediate 58]

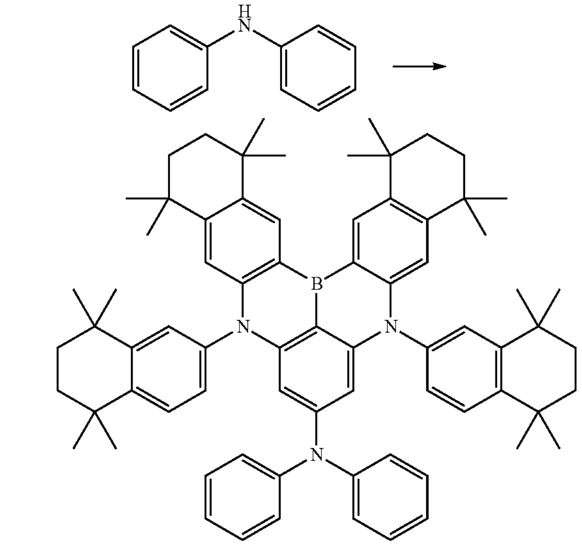

[Compound 36]

After 7 g of Intermediate 58, 1.4 g of diphenylamine, 1.5 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.3 g of Compound 36. (yield 78%). MS[M+H]+=1029

Synthesis Example 37. Synthesis of Compound 37

1) Synthesis of Compound 37

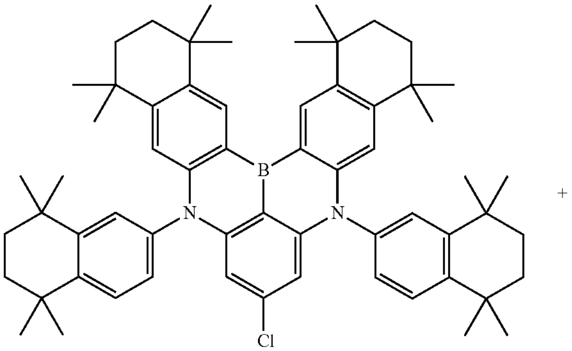

[Intermediate 58]

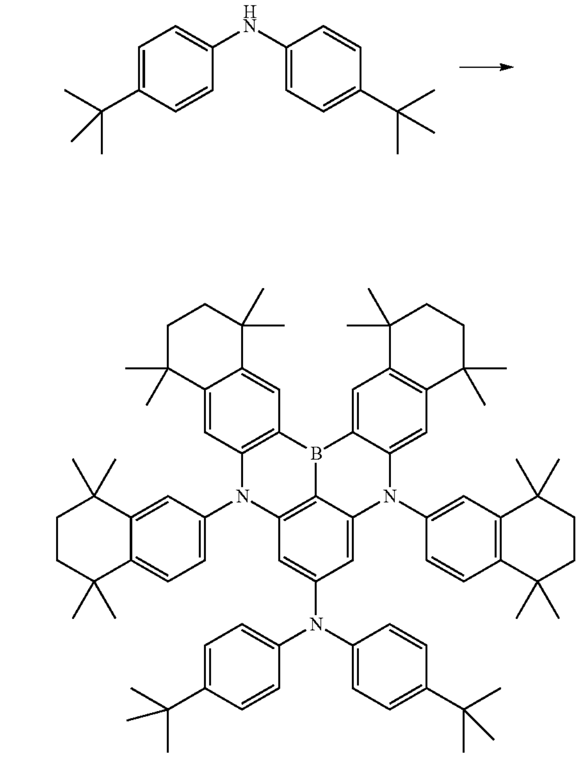

[Compound 37]

After 7 g of Intermediate 58, 2.2 g of bis(4-(tert-butyl)phenyl)amine, 1.5 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.5 g of Compound 37. (yield 73%). MS[M+H]+=1141

Synthesis Example 38. Synthesis of Compound 38

1) Synthesis of Intermediate 59

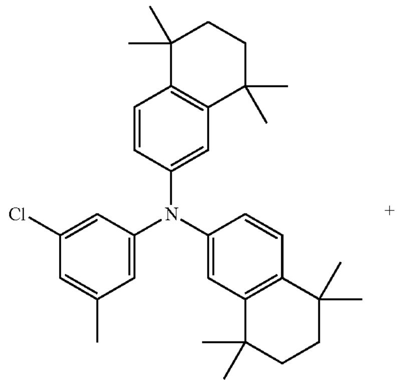

[Intermediate 7]

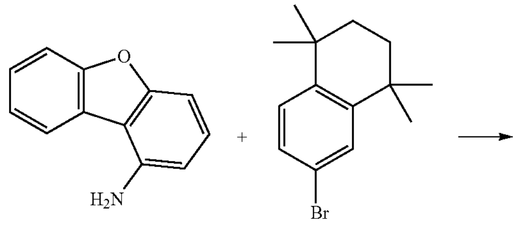

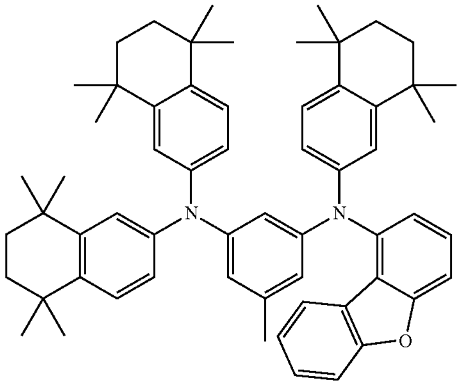

[Intermediate 59]

After 40 g of Intermediate 7, 14.3 g of dibenzo[b,d]furan-1-amine, 22.4 g of sodium-tert-butoxide, and 0.4 g of bis(tri-tert-butylphosphine)palladium(0) were put into 600 ml of toluene, the resulting mixture was refluxed for 1 hour, whether the reaction proceeded was confirmed, and then 20.8 g of 6-bromo-1,1,4,4-tetramethyl-1,2,3,4-tetrahydronaphthalene was added thereto during the reflux reaction, and the reflux reaction was performed for an additional 1 hour. After the completion of the reaction, the resulting product was extracted, and then recrystallized to obtain 54 g of Intermediate 59. (yield 82%). MS[M+H]+=848

2) Synthesis of Compound 38

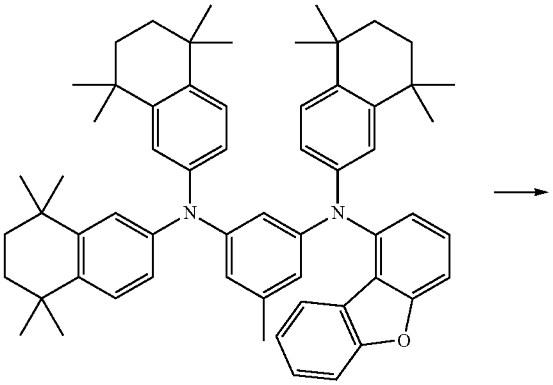

[Intermediate 59]

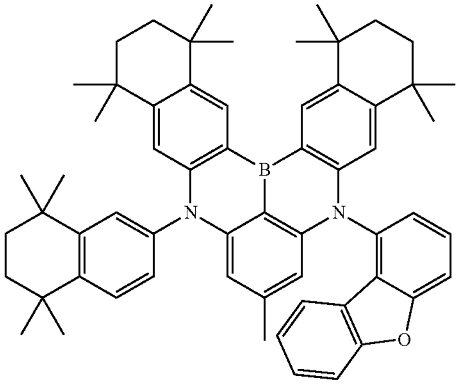

[Compound 38]

After 25 g of Intermediate 59 and 19.7 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Compound 38. (yield 30%). MS[M+H]+=856

Synthesis Example 39. Synthesis of Compound 39

1) Synthesis of Intermediate 60

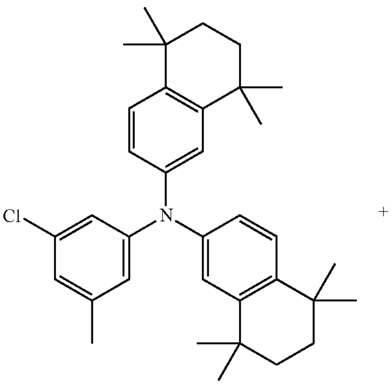

[Intermediate 7]

-continued

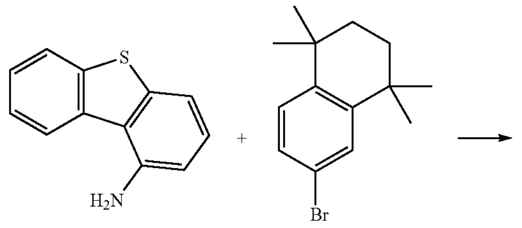

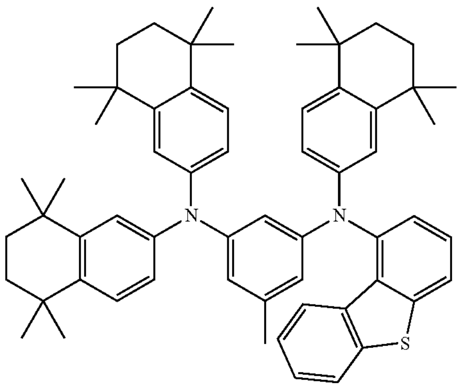

[Intermediate 60]

40 g of Intermediate 7, 15.5 g of dibenzo[b,d]thiophen-1-amine, and the same material and equivalent weight as in the synthesis method of Intermediate 59 were used, and the resulting product was recrystallized to obtain 52 g of Intermediate 60. (yield 77%). MS[M+H]+=864

2) Synthesis of Compound 39

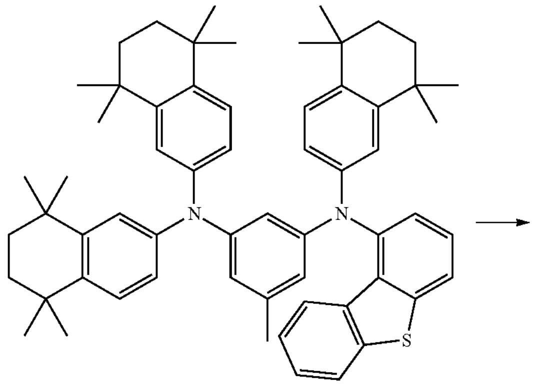

[Intermediate 60]

-continued

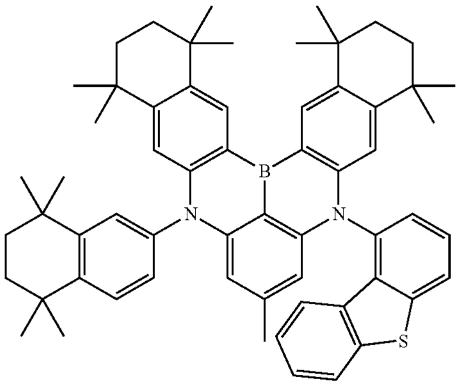

[Compound 39]

After 25 g of Intermediate 60 and 19.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Compound 39 (yield 31%). MS[M+H]+=872

Synthesis Example 40. Synthesis of Compound 40

1) Synthesis of Intermediate 61

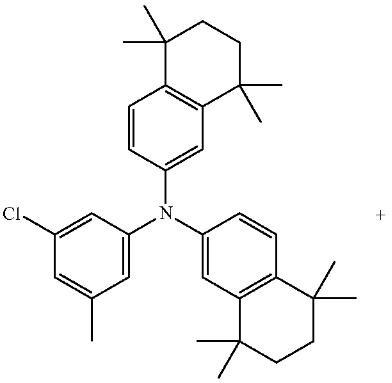

[Intermediate 7]

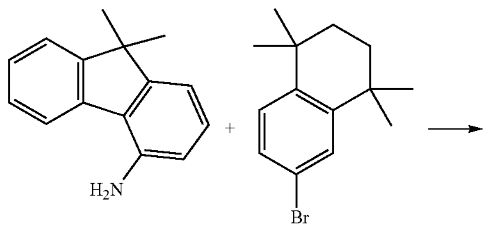

-continued

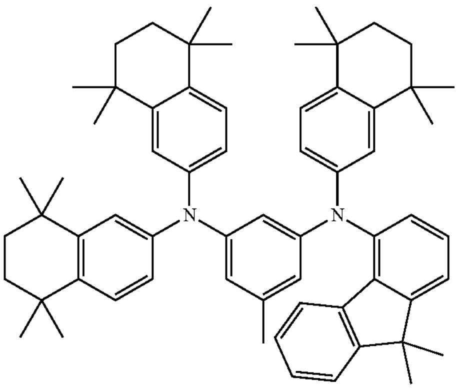

[Intermediate 61]

40 g of Intermediate 7 and 16.3 g of 9,9-dimethyl-9H-fluoren-4-amine, and the same material and equivalent weight as in the synthesis method of Intermediate 59 were used, and the resulting product was recrystallized to obtain 54 g of Intermediate 61. (yield 79%). MS[M+H]+=874

2) Synthesis of Compound 40

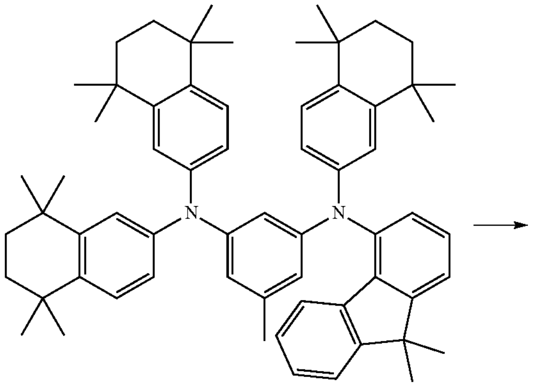

[Intermediate 61]

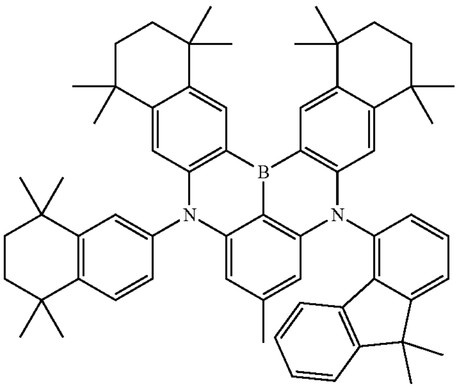

[Compound 40]

After 25 g of Intermediate 61 and 19.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Compound 40 (yield 30%). MS[M+H]+=882

Synthesis Example 41. Synthesis of Compound 41

1) Synthesis of Intermediate 62

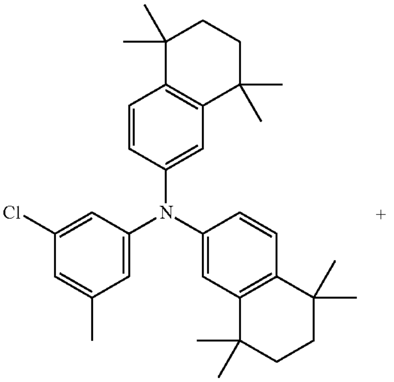

[Intermediate 7]

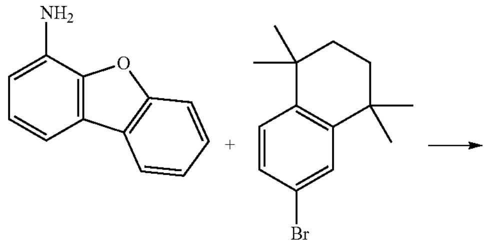

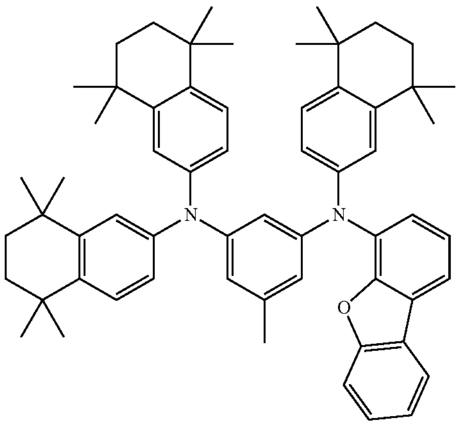

[Intermediate 62]

40 g of Intermediate 7, 14.3 g of dibenzo[b,d]furan-4-amine, and the same material and equivalent weight as in the synthesis method of Intermediate 59 were used, and the resulting product was recrystallized to obtain 53 g of Intermediate 62. (yield 77%). MS[M+H]+=848

2) Synthesis of Compound 41

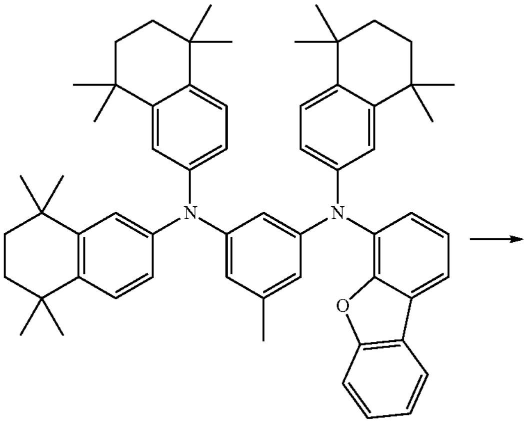

[Intermediate 62]

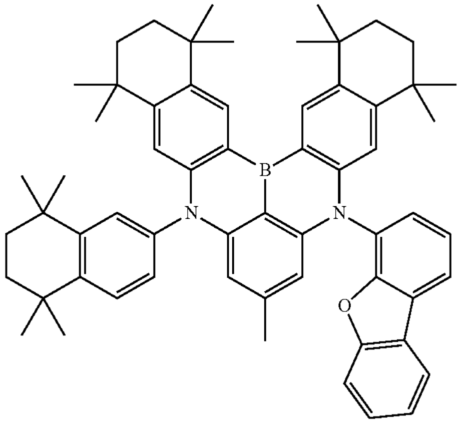

[Compound 41]

After 25 g of Intermediate 62 and 19.7 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Compound 41 (yield 31%). MS[M+H]+=856

Synthesis Example 42. Synthesis of Compound 42

1) Synthesis of Intermediate 63

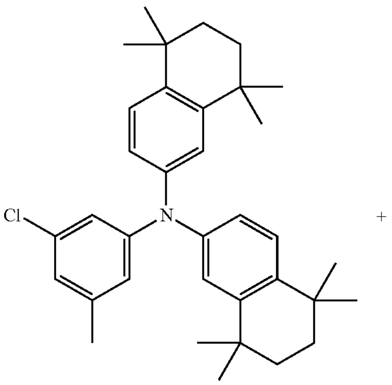

[Intermediate 7]

-continued

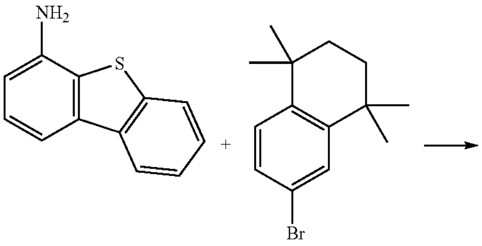

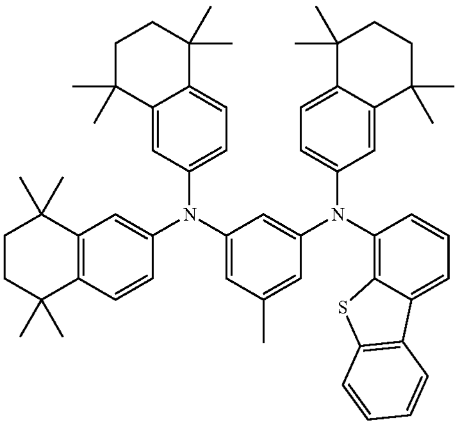

[Intermediate 63]

40 g of Intermediate 7 and 15.5 g of dibenzo[b,d]thiophen-4-amine, and the same material and equivalent weight as in the synthesis method of Intermediate 59 were used, and the resulting product was recrystallized to obtain 54 g of Intermediate 63. (yield 78%). MS[M+H]+=864

2) Synthesis of Compound 42

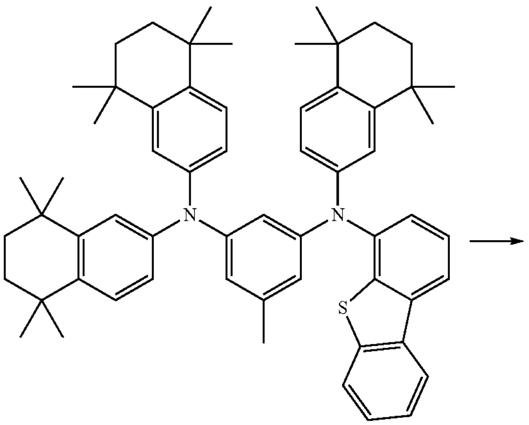

[Intermediate 63]

-continued

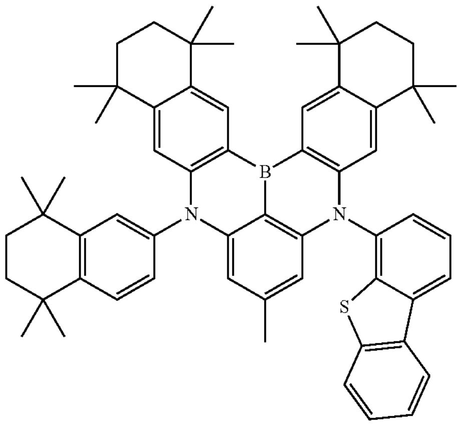

[Compound 42]

After 25 g of Intermediate 63 and 19.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Compound 42 (yield 31%). MS[M+H]+=872

Synthesis Example 43. Synthesis of Compound 43

1) Synthesis of Intermediate 64

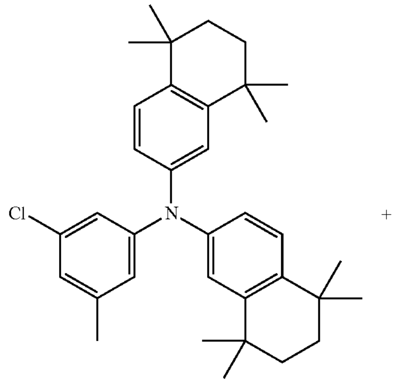

[Intermediate 7]

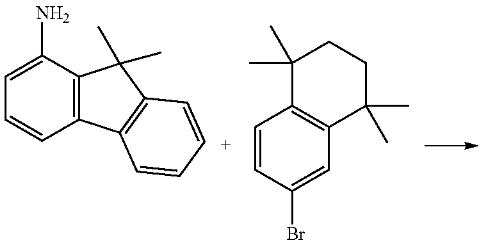

-continued

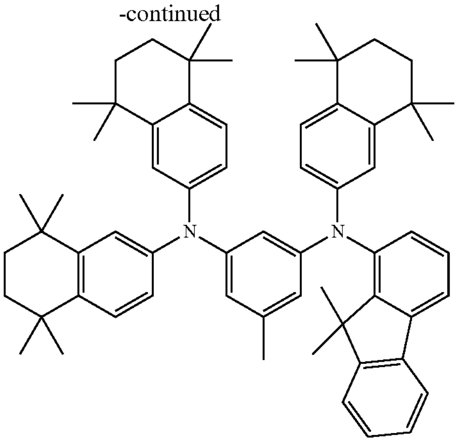

[Intermediate 64]

40 g of Intermediate 7 and 16.3 g of 9,9-dimethyl-9H-fluoren-1-amine, and the same material and equivalent weight as in the synthesis method of Intermediate 59 were used, and the resulting product was recrystallized to obtain 51 g of Intermediate 64. (yield 77%). MS[M+H]+=874

2) Synthesis of Compound 43

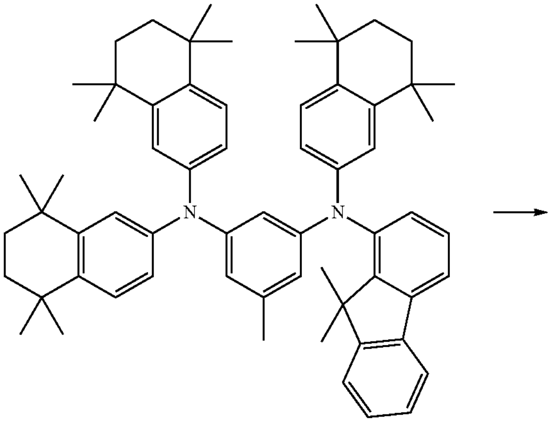

[Intermediate 64]

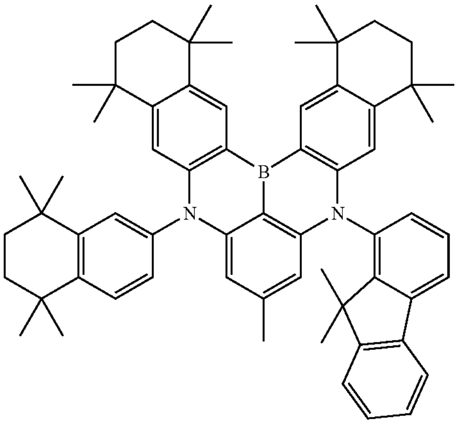

[Compound 43]

After 25 g of Intermediate 64 and 19.1 g of boron triiodide were put into 250 ml of 1,2-dichlorobenzene under a nitrogen atmosphere, the resulting mixture was stirred at 160° C.

for 4 hours. After the completion of the reaction, the resulting product was extracted, and then recrystallized to obtain 7.2 g of Compound 43 (yield 28%). MS[M+H]+=882

Synthesis Example 44. Synthesis of Compound 44

1) Synthesis of Intermediate 65

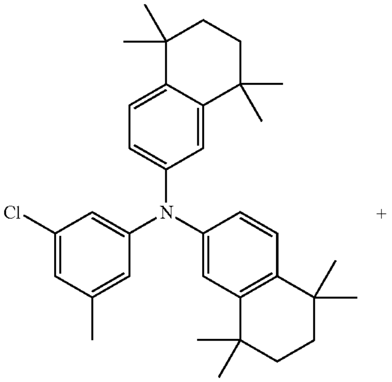

[Intermediate 7]

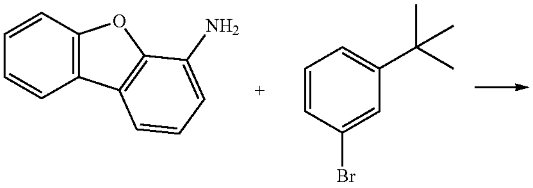

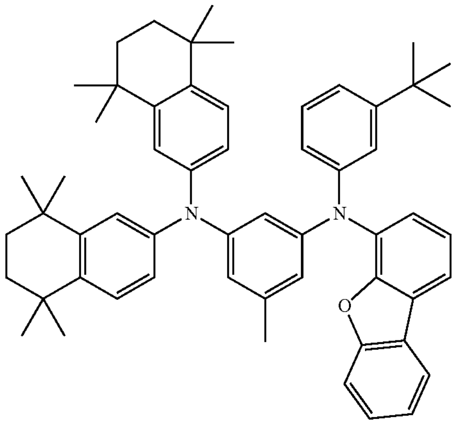

[Intermediate 65]

40 g of Intermediate 7, 14.3 g of dibenzo[b,d]furan-4-amine, and 16.6 g of 1-bromo-3-(tert-butyl)benzene, and the same material and equivalent weight as in the synthesis method of Intermediate 59 were used, and the resulting product was recrystallized to obtain 47 g of Intermediate 65. (yield 76%). MS[M+H]+=794

2) Synthesis of Compound 44

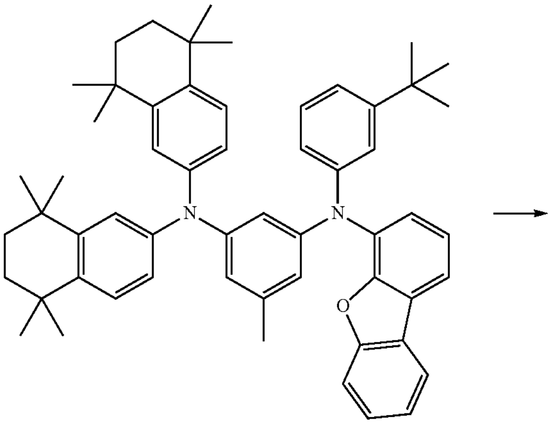

[Intermediate 65]

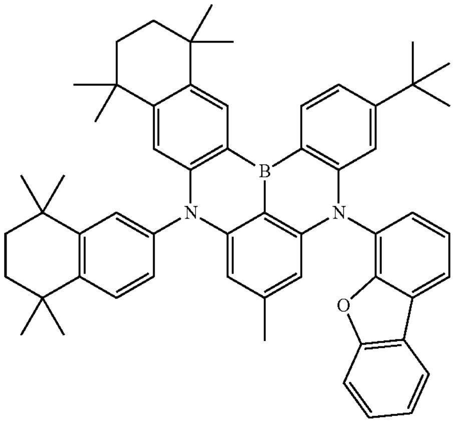

[Compound 44]

After 25 g of Intermediate 65 and 21 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.8 g of Compound 44 (yield 31%). MS[M+H]+=801

Synthesis Example 45. Synthesis of Compound 45

1) Synthesis of Intermediate 66

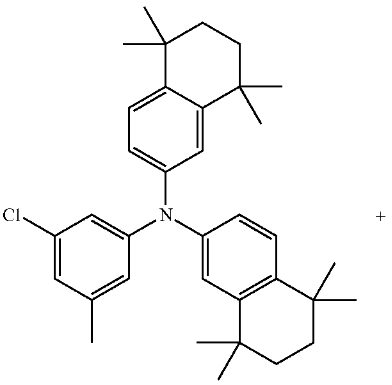

[Intermediate 7]

-continued

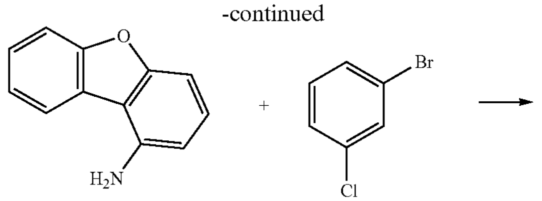

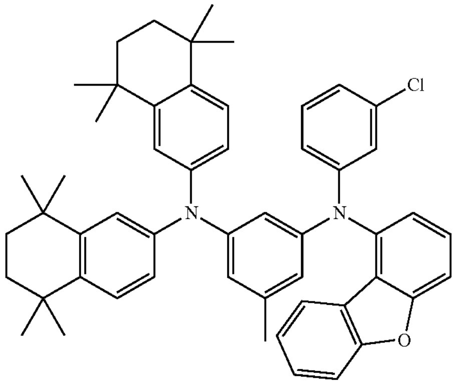

[Intermediate 66]

After 40 g of Intermediate 7, 14.3 g of dibenzo[b,d]furan-1-amine, 22.4 g of sodium-tert-butoxide, and 0.4 g of bis(tri-tert-butylphosphine)-palladium(0) were put into 600 ml of toluene, the resulting mixture was refluxed for 1 hour, whether the reaction proceeded was confirmed, and then 14.9 g of 1-bromo-3-chlorobenzene was added thereto during the reflux reaction, and the reflux reaction was performed for an additional 1 hour. After the completion of the reaction, the resulting product was extracted, and then recrystallized to obtain 46 g of Intermediate 66. (yield 77%). MS[M+H]+=771

2) Synthesis of Intermediate 67

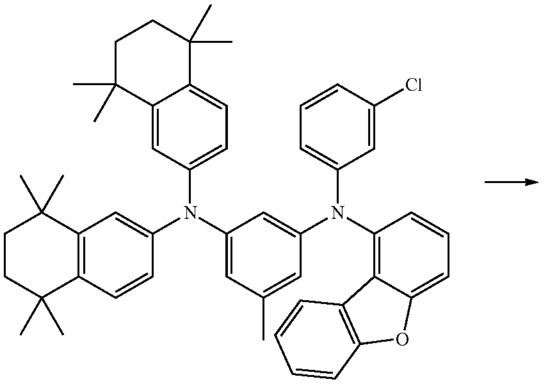

[Intermediate 66]

-continued

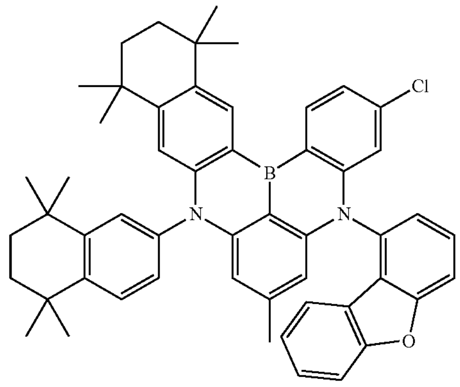

[Intermediate 67]

After 25 g of Intermediate 66 and 21.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.8 g of Intermediate 67 (yield 31%). MS[M+H]+=780

3) Synthesis of Compound 45

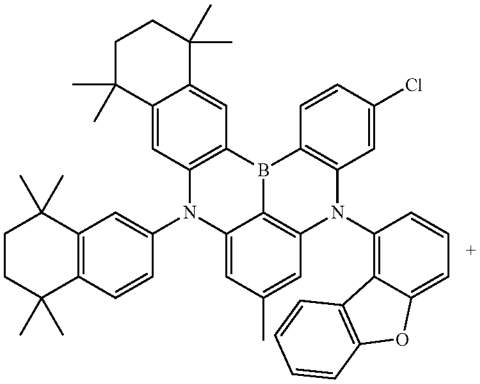

[Intermediate 67]

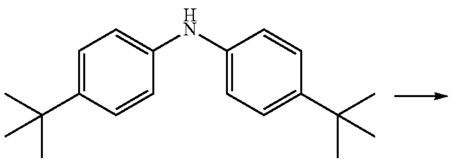

-continued

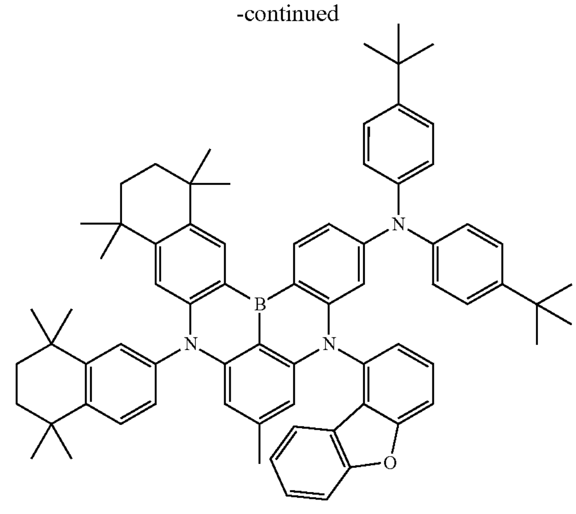

[Compound 45]]

After 7 g of Intermediate 67, 2.5 g of bis(4-(tert-butyl) phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.6 g of Compound 45 (yield 72%). MS[M+H]+=1025

Synthesis Example 46. Synthesis of Compound 46

1) Synthesis of Intermediate 68

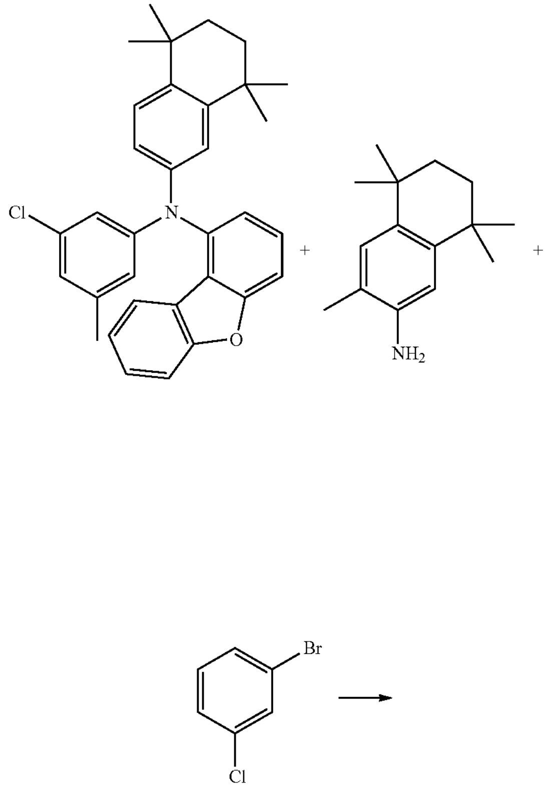

-continued

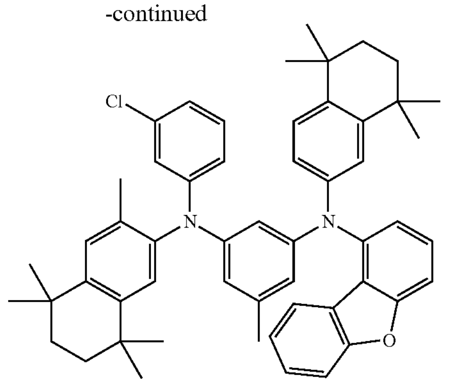

[Intermediate 68]

After 40 g of N-(3-chloro-5-methylphenyl)-N-(5,5,8,8-tetramethyl-5,6,7,8-tetrahydronaphthalen-2-yl)-dibenzo[b, d]furan-1-amine, 16.6 g of 3,5,5,8,8-pentamethyl-5,6,7,8-tetrahydronaphthalen-2-amine, 23.3 g of sodium-tert-butoxide, and 0.4 g of bis(tri-tert-butylphosphine)palladium (0) were put into 600 ml of toluene, the resulting mixture was refluxed for 1 hour, whether the reaction proceeded was confirmed, and then 15.5 g of 1-bromo-3-chlorobenzene was added thereto during the reflux reaction, and the reflux reaction was performed for an additional 1 hour. After the completion of the reaction, the resulting product was extracted, and then recrystallized to obtain 47 g of Intermediate 68. (yield 74%). MS[M+H]+=786

2) Synthesis of Intermediate 69

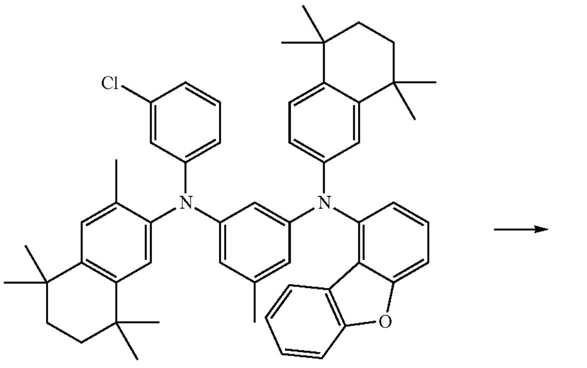

[Intermediate 68]

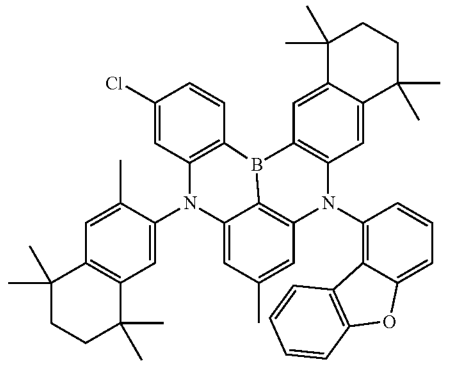

[Intermediate 69]

After 25 g of Intermediate 68 and 21.2 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 69 (yield 30%). MS[M+H]+=794

3) Synthesis of Compound 46

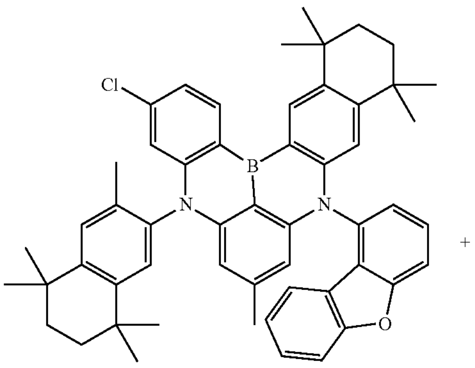

[Intermediate 69]

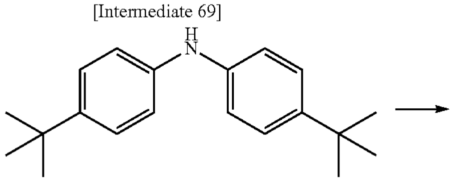

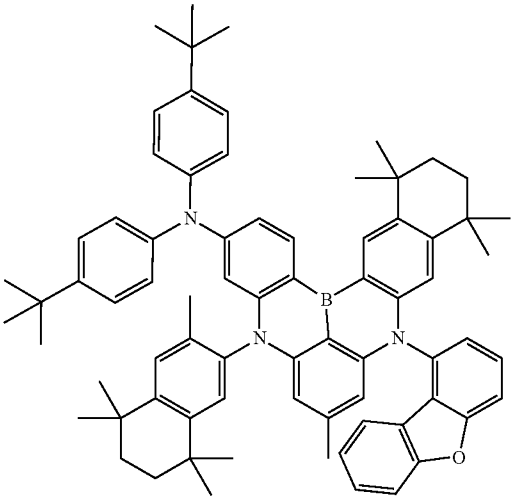

[Compound 46]

After 7 g of Intermediate 69, 2.5 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.8 g of Compound 46. (yield 74%). MS[M+H]+=1039

Synthesis Example 47. Synthesis of Compound 47

1) Synthesis of Intermediate 70

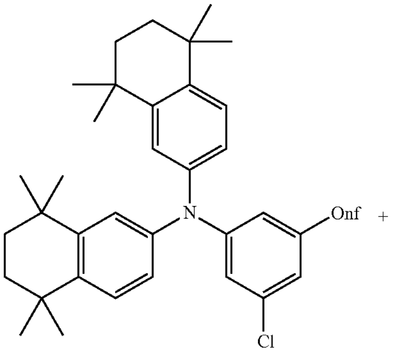

[Intermediate 46]

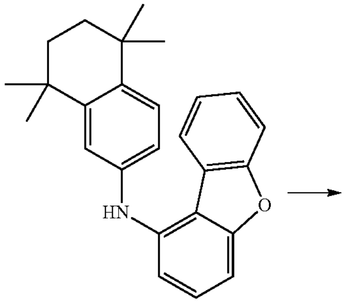

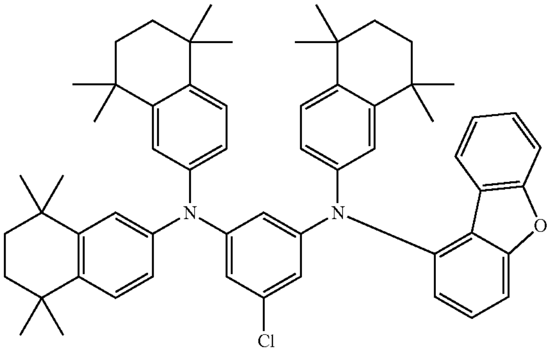

[Intermediate 70]

After 40 g of Intermediate 46 and 18.9 g of N-(5,5,8,8-tetramethyl-5,6,7,8-tetrahydronapthalen-2-yl)dibenzo[b,d]furan-1-amine were reacted using the same material and equivalent weight as in the synthesis method of Intermediate 47, the resulting product was extracted, and then recrystallized to obtain 34 g of Intermediate 70. (yield 77%). MS[M+H]+=868

2) Synthesis of Intermediate 71

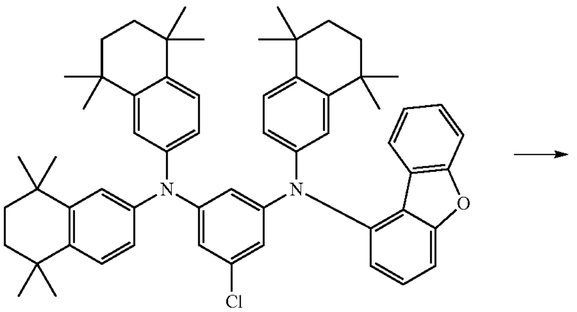

[Intermediate 70]

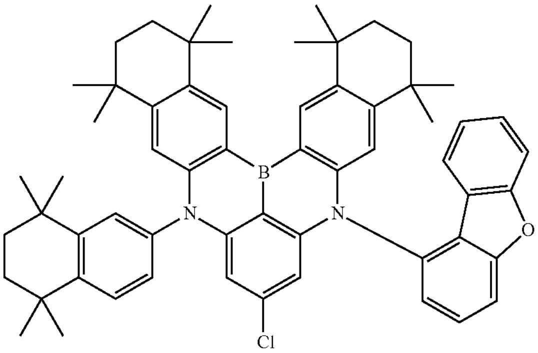

[Intermediate 71]

After 25 g of Intermediate 70 and 19.2 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 71 (yield 30%). MS[M+H]+=876

3) Synthesis of Compound 47

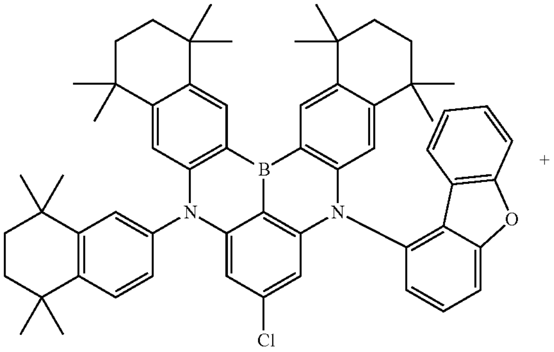

[Intermediate 71]

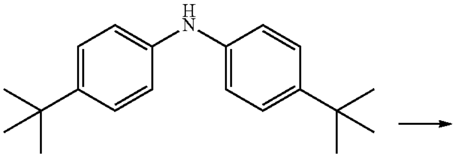

-continued

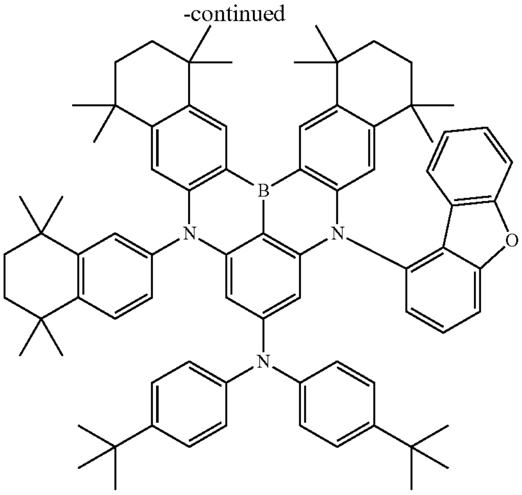

[Compound 47]

After 7 g of Intermediate 71, 2.5 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.9 g of Compound 47. (yield 70%). MS[M+H]+=1120

Synthesis Example 48. Synthesis of Compound 48

1) Synthesis of Intermediate 72

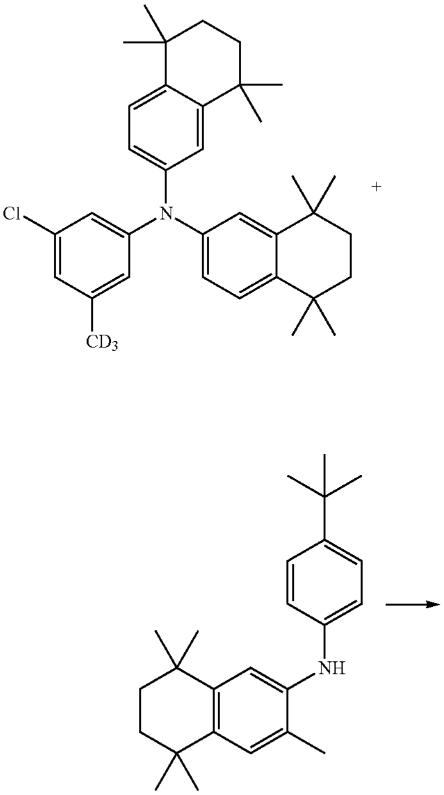

-continued

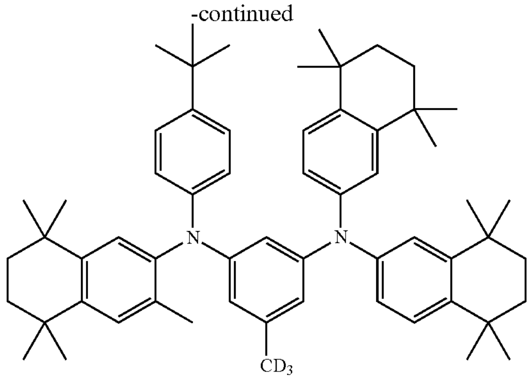

[Intermediate 72]

30 g of N-(3-chloro-5-(methyl-d3)phenyl)-5,5,8,8-tetramethyl-N-(5,5,8,8-tetramethyl-5,6,7,8-tetrahydronapthalen-2-yl)-5,6,7,8-tetrahydronaphthalen-2-amine and 20.4 g of N-(4-(tert-butyl)phenyl)-3,5,5,8,8-pentamethyl-5,6,7,8-tetrahydronaphthalen-2-amine, and the same material and equivalent weight as in the synthesis method of Intermediate 2 were used, and the resulting product was recrystallized to obtain 33 g of Intermediate 72. (yield 69%). MS[M+H]+=831

2) Synthesis of Compound 48

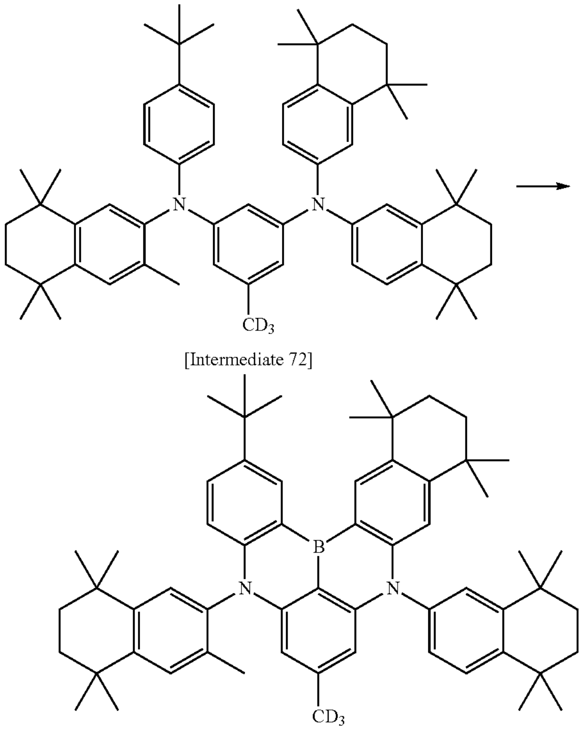

[Intermediate 72]

[Compound 48]

After 25 g of Intermediate 72 and 20.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.4 g of Compound 48 (yield 29%). MS[M+H]+=839

Synthesis Example 49. Synthesis of Compound 49

1) Synthesis of Intermediate 73

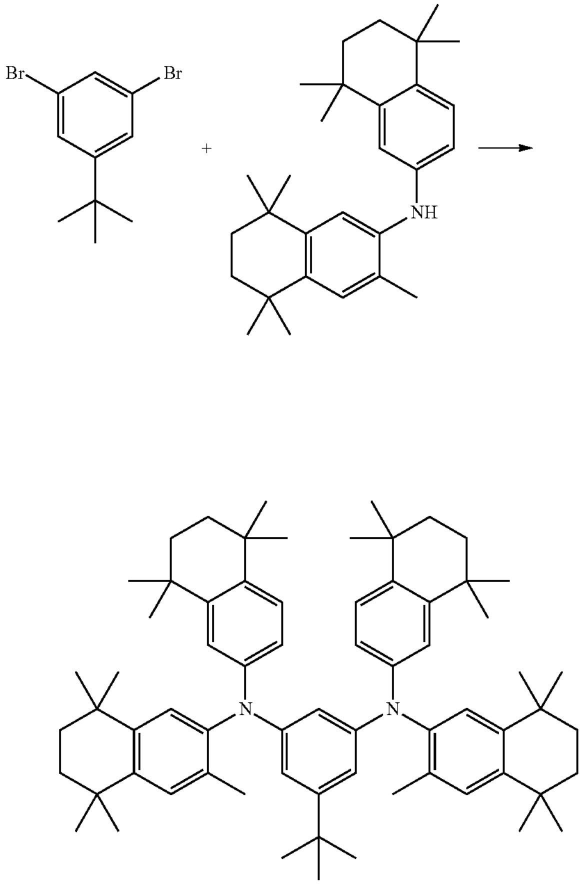

[Intermediate 73]

30 g of 1,3-dibromo-5-(tert-butyl)benzene and 83 g of 3,5,5,8,8-pentamethyl-N-(5,5,8,8-tetramethyl-5,6,7,8-tetrahydronaphthalen-2-yl)-5,6,7,8-tetrahydronaphthalen-2-amine, and the same material and equivalent weight as in the synthesis method of Intermediate 20 were used, and the resulting product was recrystallized to obtain 66 g of Intermediate 73. (yield 69%) MS[M+H]+=938

2) Synthesis of Compound 49

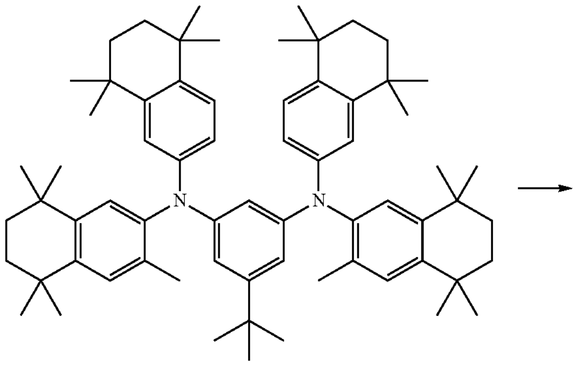

[Intermediate 73]

-continued

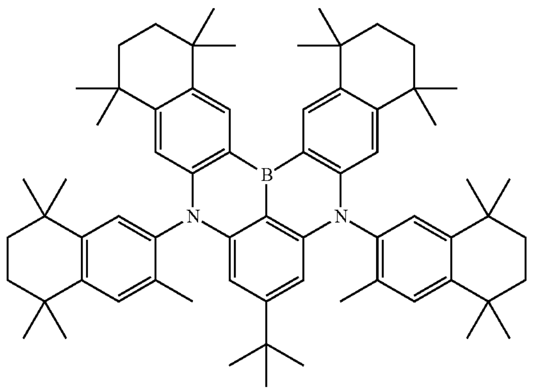

[Compound 49]

After 25 g of Intermediate 73 and 17.7 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Compound 49 (yield 30%). MS[M+H]+=946

Synthesis Example 50. Synthesis of Compound 50

1) Synthesis of Intermediate 74

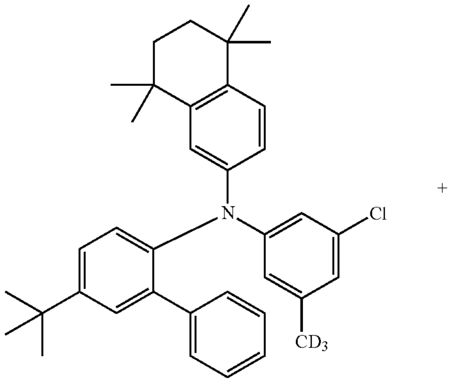

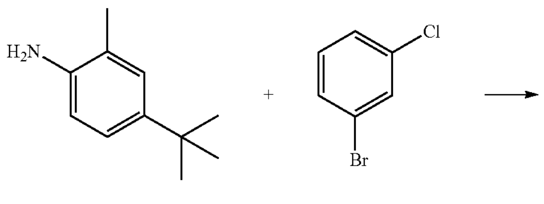

-continued

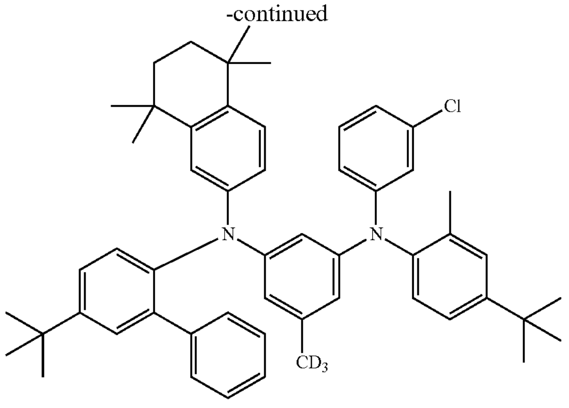

[Intermediate 74]

After 40 g of N-(5-(tert-butyl)-[1,1'-biphenyl]-2-yl)-N-(3-chloro-5-(methyl-d3)phenyl)-5,5,8,8-tetramethyl-5,6,7,8-tetrahydronaphthalen-2-amine, 12.1 g of 4-(tert-butyl)-2-methylaniline, 21.4 g of sodium-tert-butoxide, and 0.4 g of bis(tri-tert-butylphosphine)-palladium(0) were put into 600 ml of toluene, the resulting mixture was refluxed for 1 hour, whether the reaction proceeded was confirmed, and then 14.2 g of 1-bromo-3-chlorobenzene was added thereto during the reflux reaction, and the reflux reaction was performed for an additional 1 hour. After the completion of the reaction, the resulting product was extracted, and then recrystallized to obtain 42 g of Intermediate 74. (yield 73%). MS[M+H]+=777

2) Synthesis of Intermediate 75

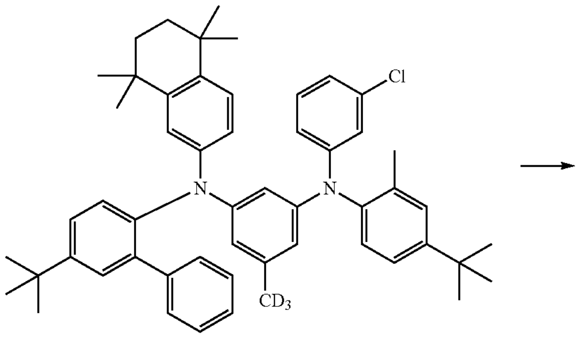

[Intermediate 74]

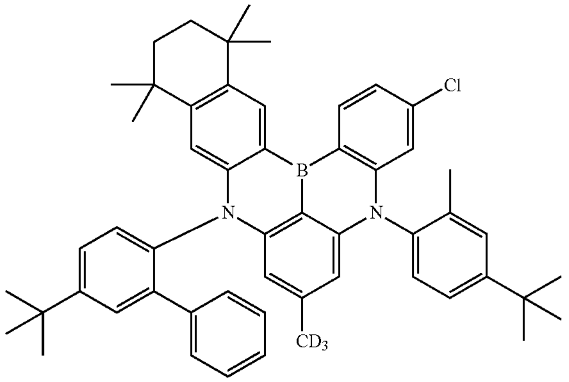

[Intermediate 75]

After 25 g of Intermediate 74 and 21.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 75 (yield 30%). MS[M+H]+=785

3) Synthesis of Compound 50

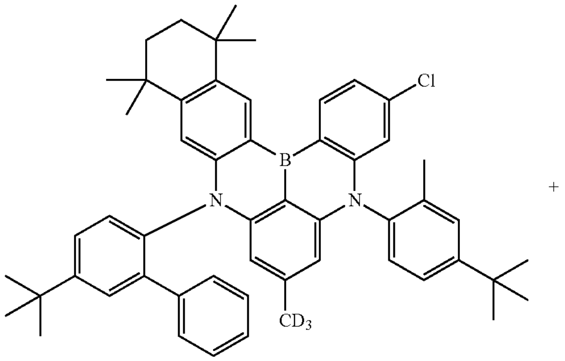

[Intermediate 75]

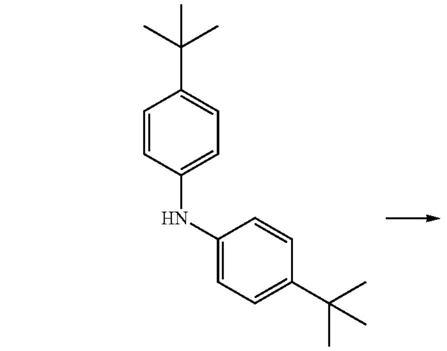

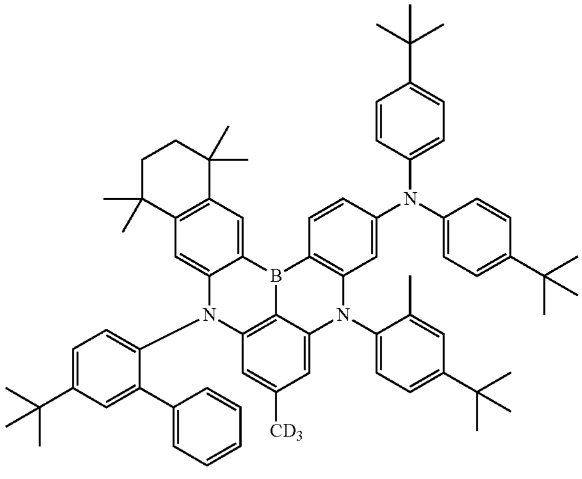

[Compound 50]

After 7 g of Intermediate 75, 2.5 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 7.1 g of Compound 50. (yield 77%). MS[M+H]+=1030

Synthesis Example 51. Synthesis of Compound 51

1) Synthesis of Intermediate 76

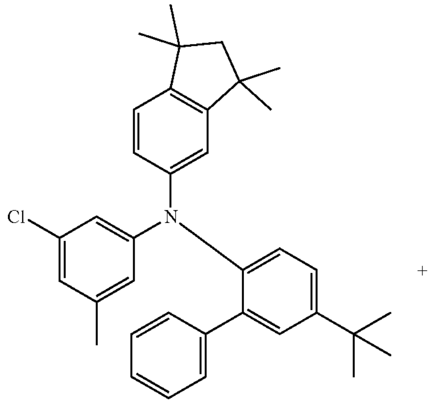

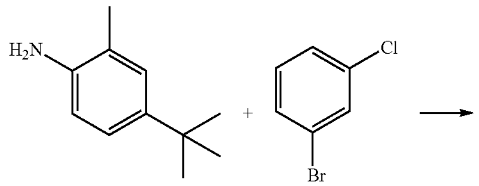

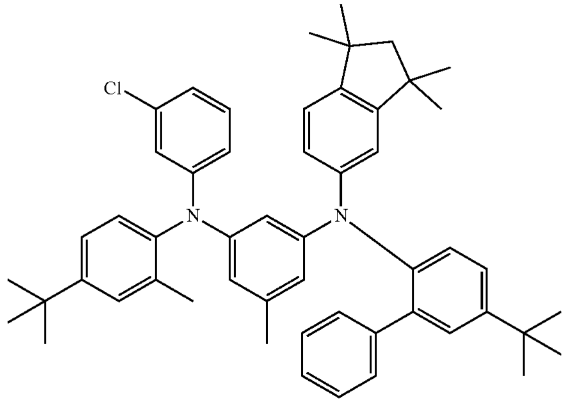

[Intermediate 76]

After 40 g of N-(5-(tert-butyl)-[1,1'-biphenyl]-2-yl)-N-(3-chloro-5-methylphenyl)-1,1,3,3-tetramethyl-2,3-dihydro-1H-inden-5-amine, 12.1 g of 4-(tert-butyl)-2-methylaniline, 22.1 g of sodium-tert-butoxide, and 0.4 g of bis(tri-tert-butylphosphine)palladium(0) were put into 600 ml of toluene, the resulting mixture was refluxed for 1 hour, whether the reaction proceeded was confirmed, and then 14.6 g of 1-bromo-3-chlorobenzene was added thereto during the reflux reaction, and the reflux reaction was performed for an additional 1 hour. After the completion of the reaction, the resulting product was extracted, and then recrystallized to obtain 43 g of Intermediate 76. (yield 74%). MS[M+H]+=760

2) Synthesis of Intermediate 77

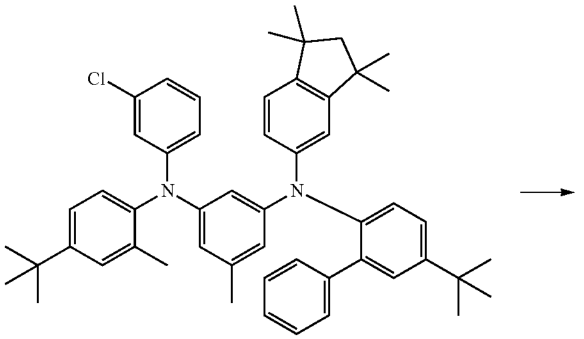

[Intermediate 76]

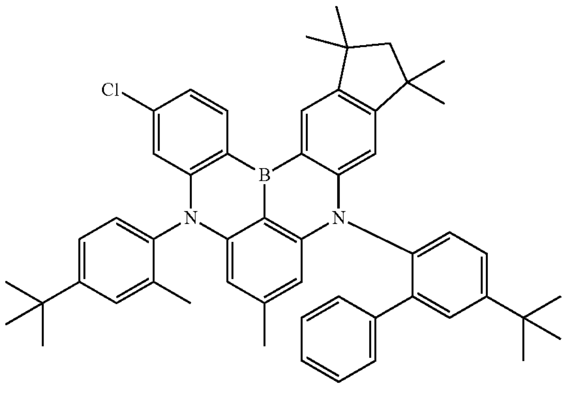

[Intermediate 77]

After 25 g of Intermediate 76 and 21.9 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.1 g of Intermediate 77 (yield 28%). MS[M+H]+=768

3) Synthesis of Compound 51

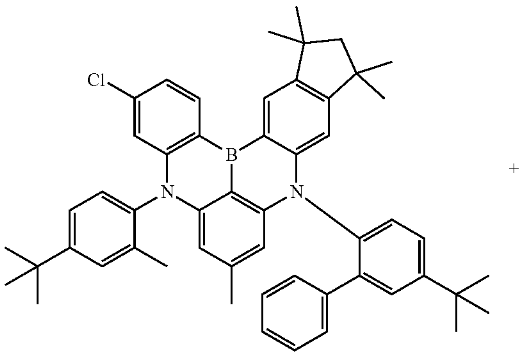

[Intermeddiate 77]

-continued

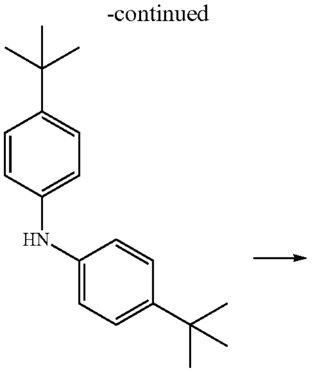

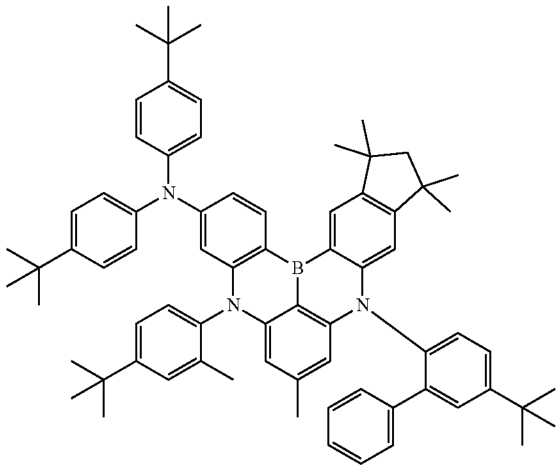

[Compound 51]

After 7 g of Intermediate 77, 2.5 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.5 g of Compound 51. (yield 72%). MS[M+H]+=1013

Synthesis Example 52. Synthesis of Compound 52

1) Synthesis of Intermediate 78

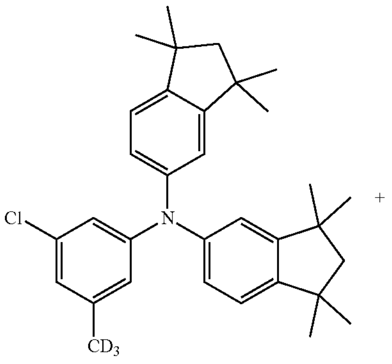

-continued

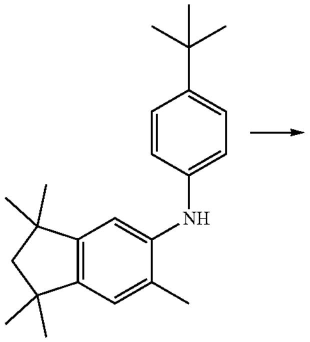

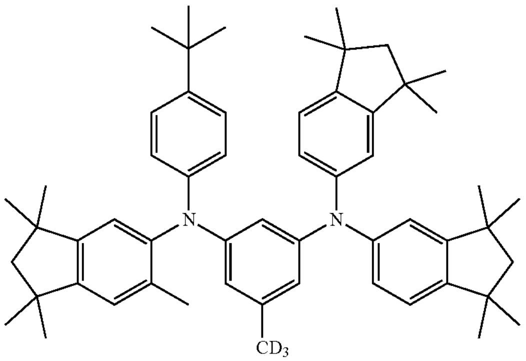

[Intermediate 78]

30 g of N-(3-chloro-5-(methyl-d3)phenyl)-1,1,3,3-tetramethyl-N-(1,1,3,3-tetramethyl-2,3-dihydro-1H-inden-5-yl)-2,3-dihydro-1H-inden-5-amine and 27.4 g of N-(4-(tert-butyl)phenyl)-1,1,3,3,6-pentamethyl-2,3-dihydro-1H-inden-5-amine, and the same material and equivalent weight as in the synthesis method of Intermediate 2 were used, and the resulting product was recrystallized to obtain 33 g of Intermediate 78. (yield 78%). MS[M+H]+=

2) Synthesis of Compound 52

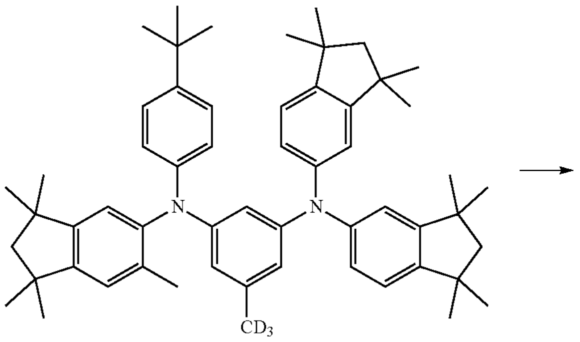

[Intermediate 78]

-continued

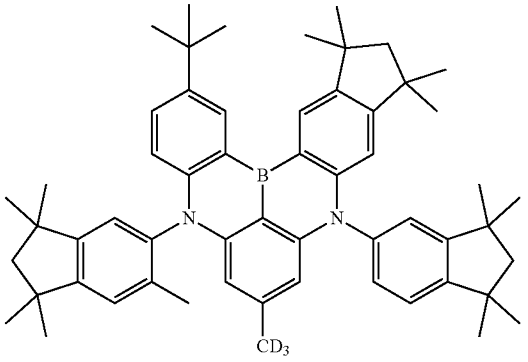

[Compound 52]

After 25 g of Intermediate 78 and 21.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Compound 52 (yield 30%). MS[M+H]+=797

Synthesis Example 53. Synthesis of Compound 53

1) Synthesis of Intermediate 79

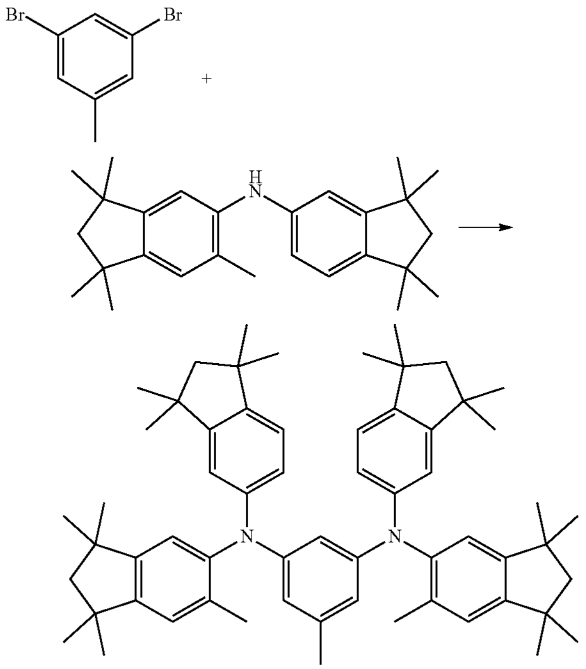

[Intermediate 79]

30 g of 1,3-dibromo-5-methylbenzene and 90.1 g of 1,1,3,3,6-pentamethyl-N-(1,1,3,3-tetramethyl-2,3-dihydro-1H-inden-5-yl)-2,3-dihydro-1H-inden-5-amine, and the same material and equivalent weight as in the synthesis method of Intermediate 20 were used, and the resulting product was recrystallized to obtain 66 g of Intermediate 79. (yield 66%). MS[M+H]+=840

2) Synthesis of Compound 53

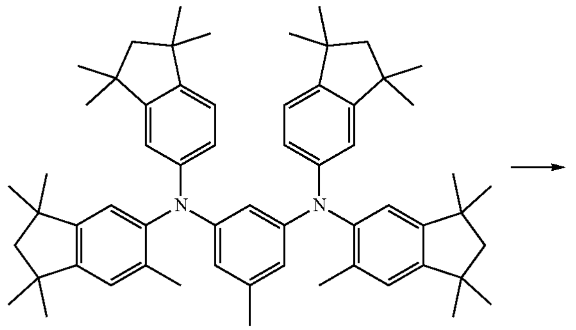

[Intermediate 79]

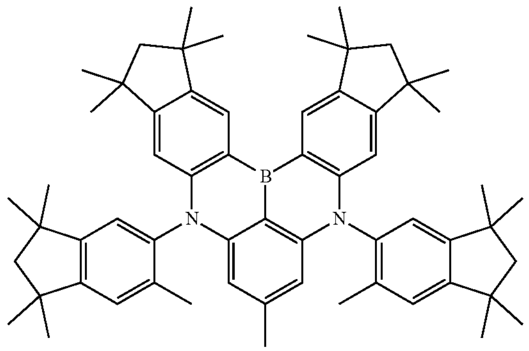

[Compound 53]

After 25 g of Intermediate 79 and 19.8 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.3 g of Compound 53 (yield 29%). MS[M+H]+=848

Synthesis Example 54. Synthesis of Compound 54

1) Synthesis of Intermediate 80

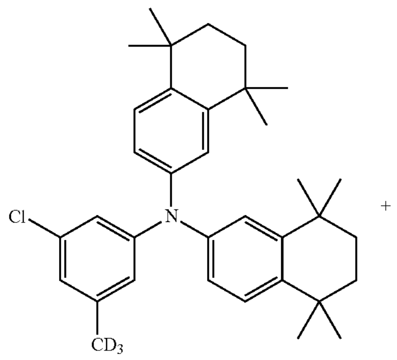

-continued

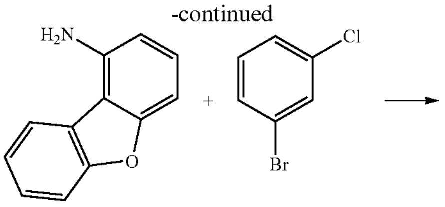

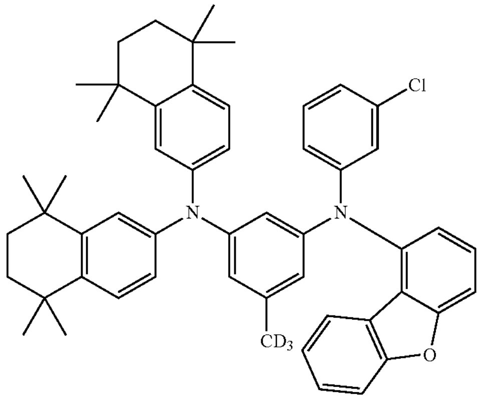

[Intermediate 80]

After 40 g of N-(3-chloro-5-(methyl-d3)phenyl)-5,5,8,8-tetramethyl-N-(5,5,8,8-tetramethyl-5,6,7,8-tetrahydronaphthalen-2-yl)-5,6,7,8-tetrahydronaphthalen-2-amine, 14.2 g of dibenzo[b,d]furan-1-amine, 22.3 g of sodium-tert-butoxide, and 0.4 g of bis(tri-tert-butylphosphine)palladium(0) were put into 600 ml of toluene, the resulting mixture was refluxed for 1 hour, whether the reaction proceeded was confirmed, and then 14.1 g of 1-bromo-3-chlorobenzene was added thereto during the reflux reaction, and the reflux reaction was performed for an additional 1 hour. After the completion of the reaction, the resulting product was extracted, and then recrystallized to obtain 41 g of Intermediate 80. (yield 68%). MS[M+H]+=775

2) Synthesis of Intermediate 81

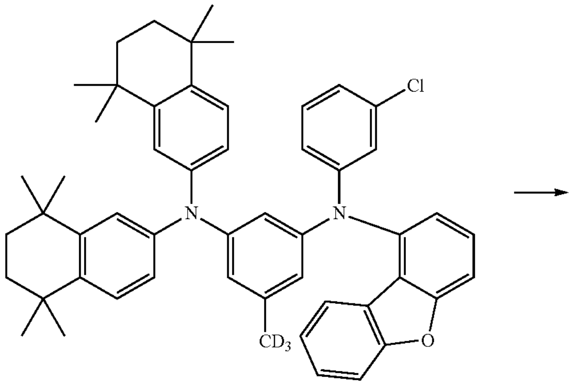

[Intermediate 80]

-continued

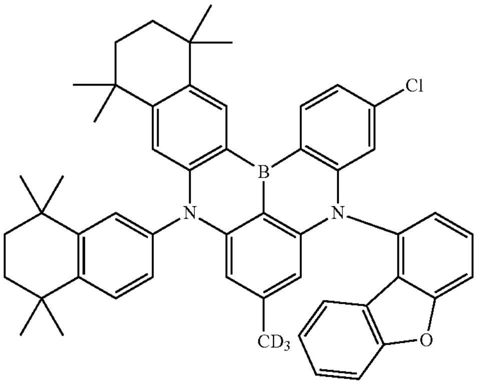

[Intermediate 81]

After 25 g of Intermediate 80 and 21.5 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 81 (yield 30%). MS[M+H]+=783

3) Synthesis of Compound 54

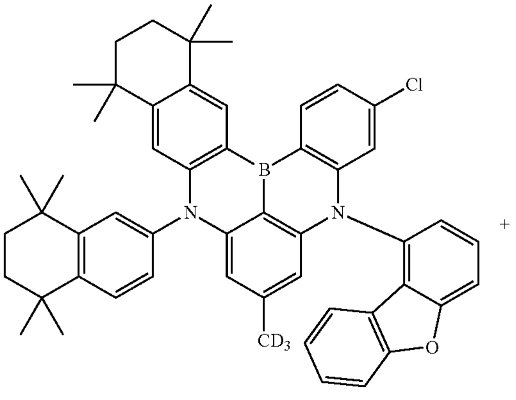

[Intermediate 81]

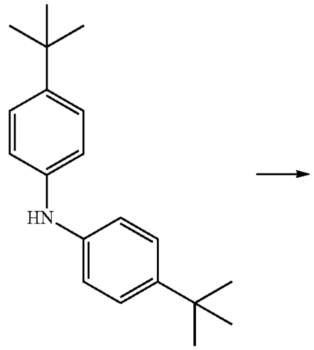

-continued

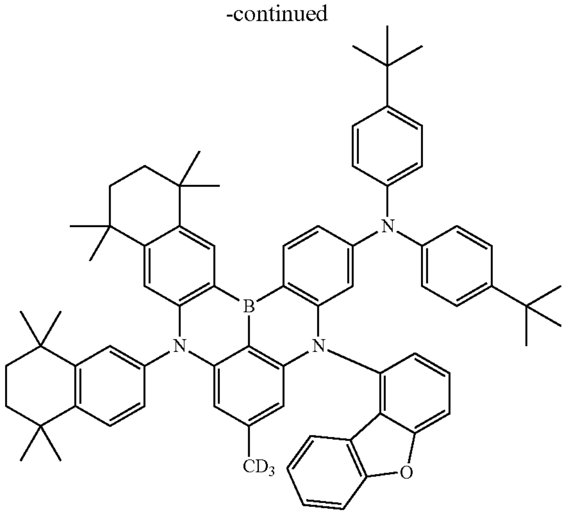

[Compound 54]

After 7 g of Intermediate 81, 2.5 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.6 g of Compound 54. (yield 72%). MS[M+H]+=1028

Synthesis Example 55. Synthesis of Compound 55

1) Synthesis of Intermediate 82

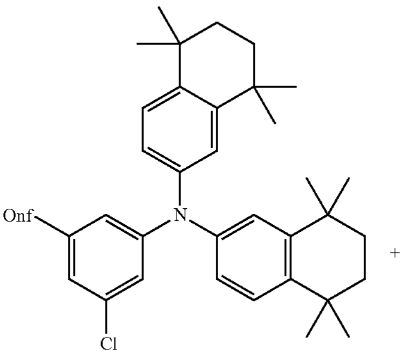

[Intermediate 46]

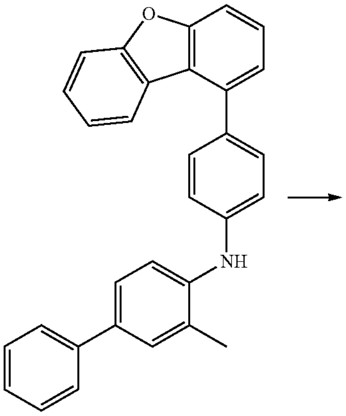

-continued

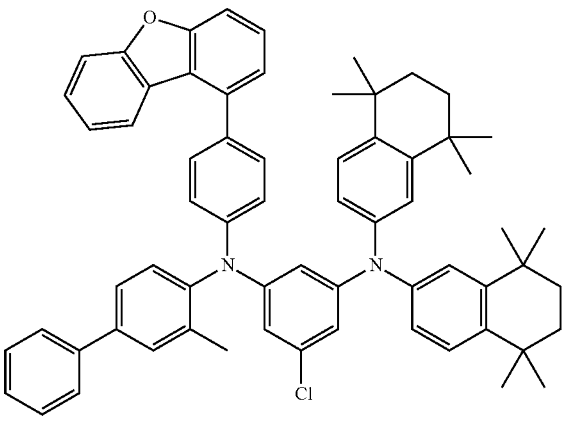

[Intermediate 82]

40 g of Intermediate 46, 31 g of N-(4-(dibenzo[b,d]furan-1-yl)phenyl)-3-methyl-[1,1'-biphenyl]-4-amine, and the same material and equivalent weight as in the synthesis method of Intermediate 37 were used, and the resulting product was recrystallized to obtain 55 g of Intermediate 82. (yield 78%). MS[M+H]+=924

2) Synthesis of Intermediate 83

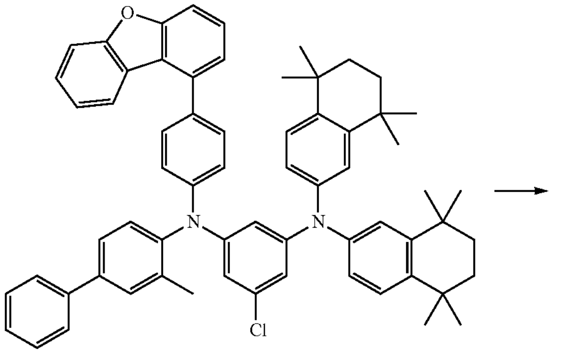

[Intermediate 82]

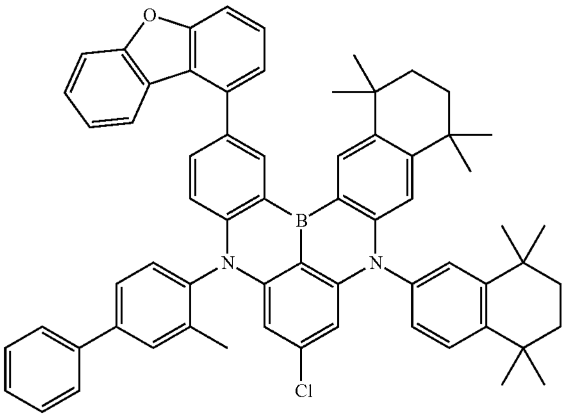

[Intermediate 83]

After 25 g of Intermediate 82 and 18 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.2 g of Intermediate 83 (yield 29%). MS[M+H]+=932

3) Synthesis of Compound 55

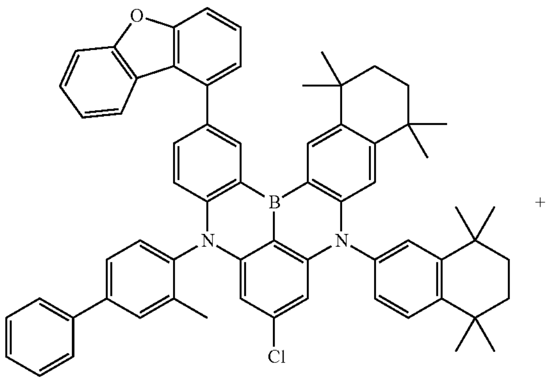

[Intermediate 83]

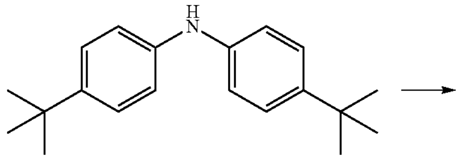

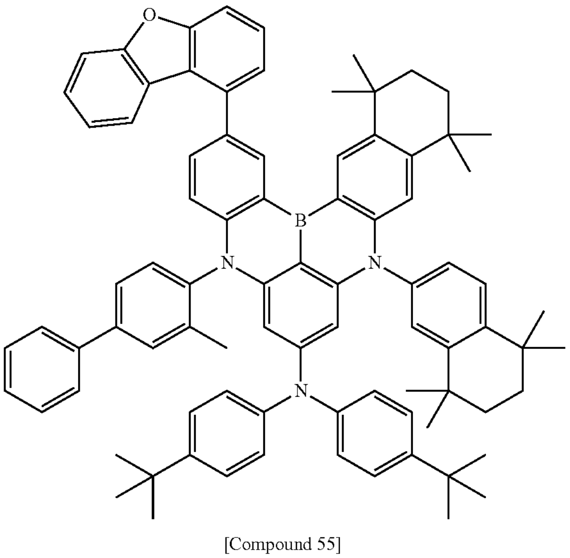

[Compound 55]

After 7 g of Intermediate 83, 2.1 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.4 g of Compound 55. (yield 72%). MS[M+H]+=1177

Synthesis Example 56. Synthesis of Compound 56

1) Synthesis of Intermediate 84

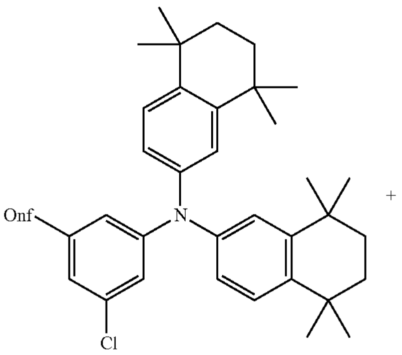

[Intermediate 46]

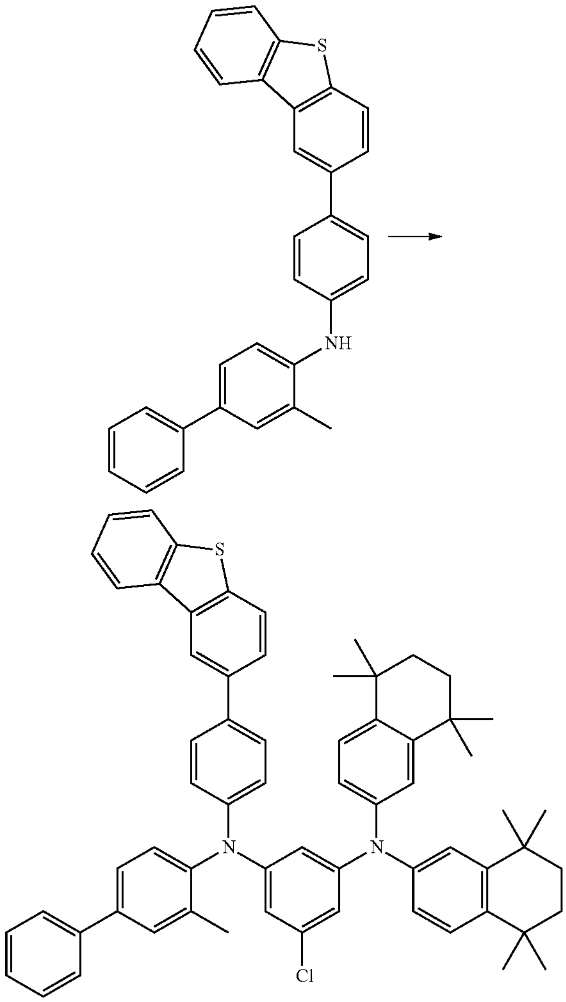

[Intermediate 84]

40 g of Intermediate 46 and 34 g of N-(4-(dibenzo[b,d]thiophen-2-yl)phenyl)-3-methyl-[1,1'-biphenyl]-4-amine, and the same material and equivalent weight as in the synthesis method of Intermediate 37 were used, and the resulting product was recrystallized to obtain 54 g of Intermediate 84. (yield 74%). MS[M+H]+=940

2) Synthesis of Intermediate 85

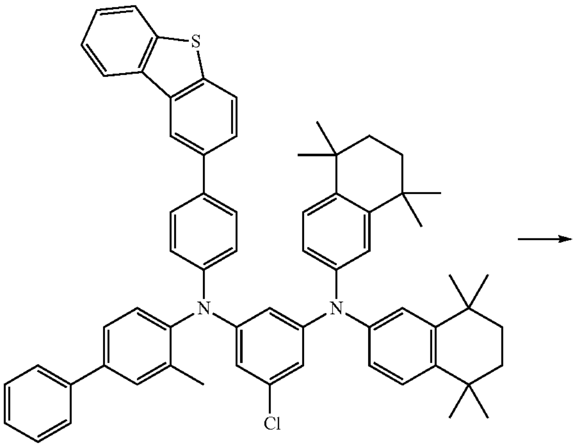

[Intermediate 84]

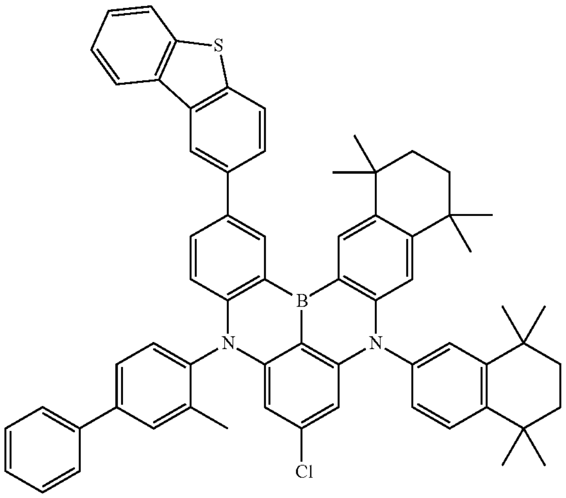

[Intermediate 85]

After 25 g of Intermediate 84 and 17.7 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Intermediate 85 (yield 30%). MS[M+H]+=948

3) Synthesis of Compound 56

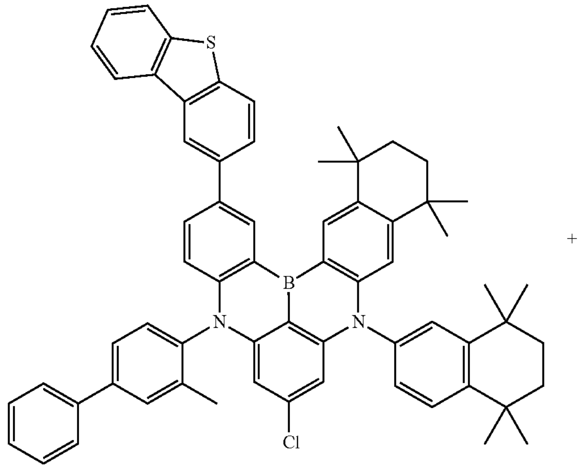

[Intermediate 85]

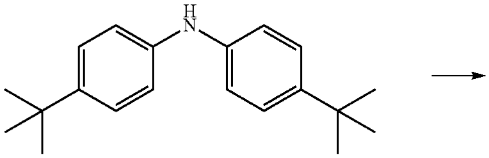

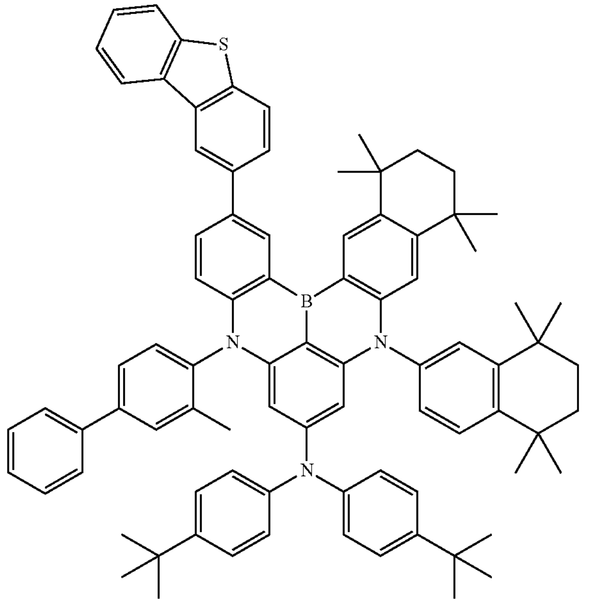

[Compound 56]

After 7 g of Intermediate 85, 2.1 g of bis(4-(tert-butyl)phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.6 g of Compound 56. (yield 72%). MS[M+H]+=1235

Synthesis Example 57. Synthesis of Compound 57

1) Synthesis of Intermediate 86

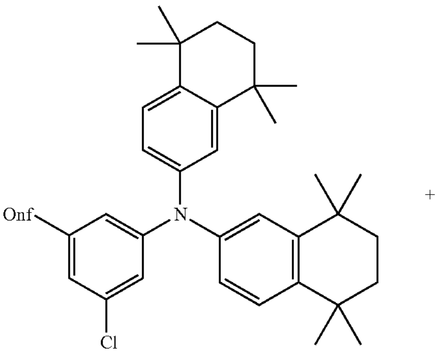

[Intermediate 46]

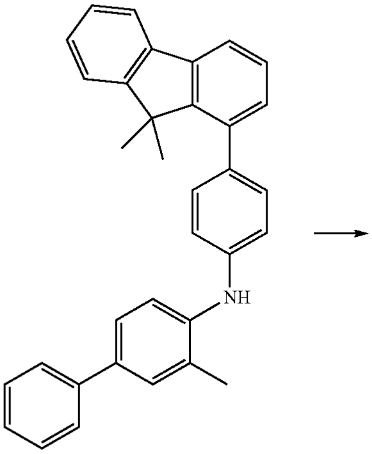

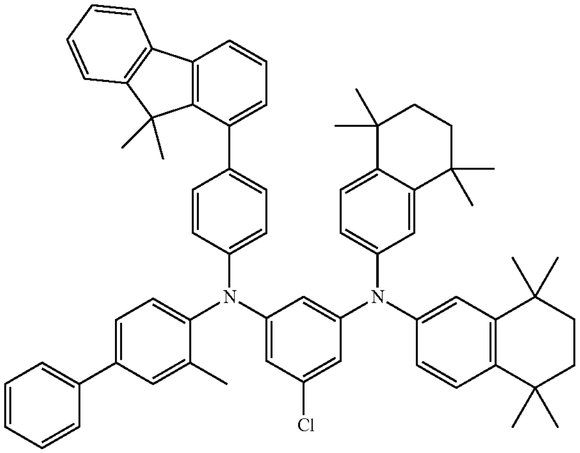

[Intermediate 86]

40 g of Intermediate 46 and 35 g of N-(4-(9,9-dimethyl-9H-fluoren-1-yl)phenyl)-3-methyl-[1,1'-biphenyl]-4-amine, and the same material and equivalent weight as in the synthesis method of Intermediate 37 were used, and the resulting product was recrystallized to obtain 53 g of Intermediate 86. (yield 72%). MS[M+H]+=950

2) Synthesis of Intermediate 87

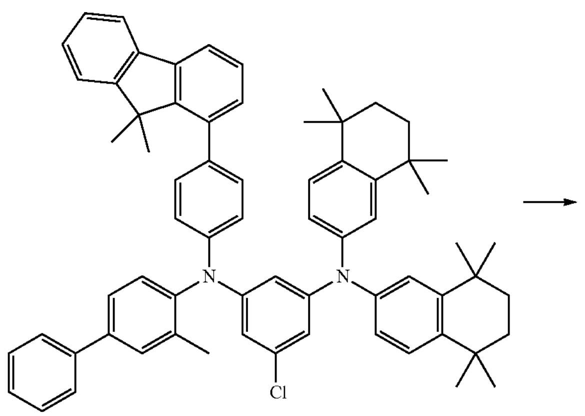

[Intermediate 86]

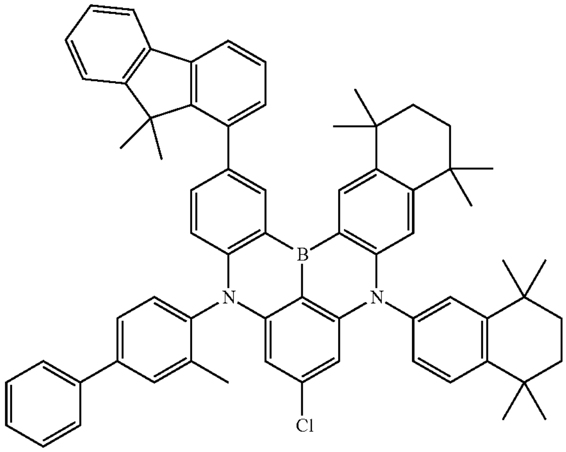

[Intermediate 87]

After 25 g of Intermediate 86 and 17.5 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.7 g of Intermediate 87 (yield 31%). MS[M+H]+=958

3) Synthesis of Compound 57

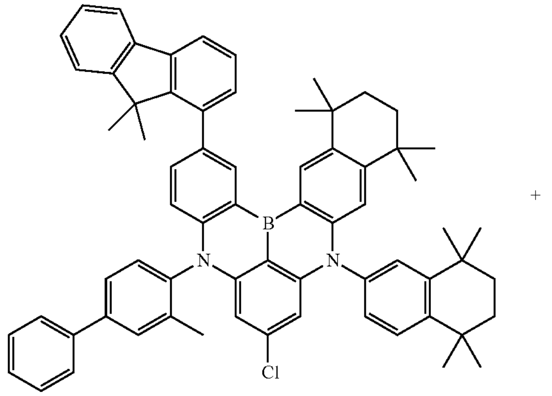

[Intermediate 87]

-continued

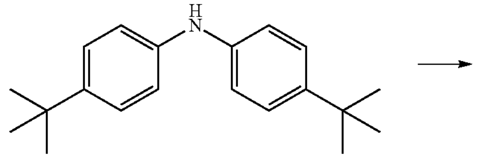

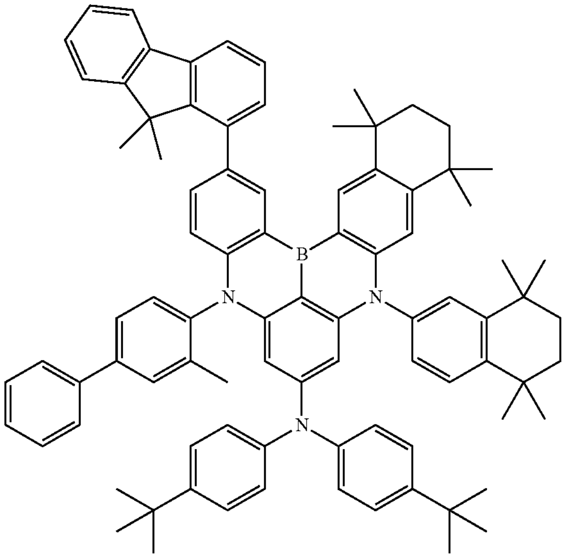

[Compound 57]

After 7 g of Intermediate 87, 2.1 g of bis(4-(tert-butyl) phenyl)amine, 1.7 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 6.8 g of Compound 57. (yield 75%). MS[M+H]+=1245

Synthesis Example 58. Synthesis of Compound 58

1) Synthesis of Intermediate 88

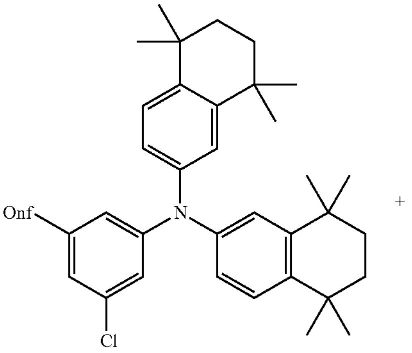

[Intermediate 46]

-continued

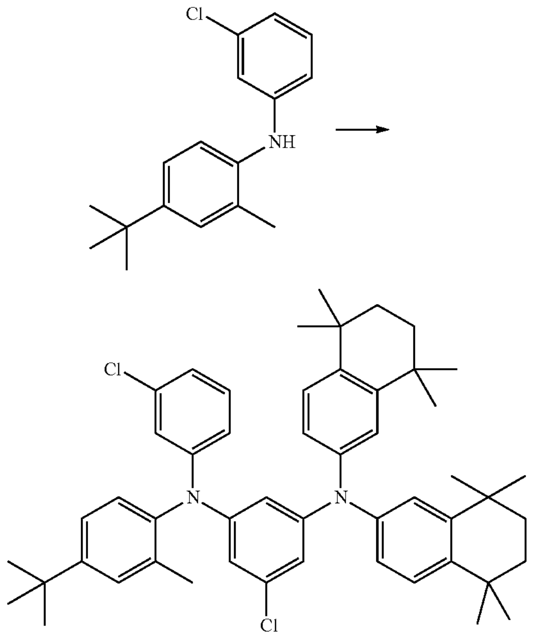

[Intermediate 88]

40 g of Intermediate 46 and 15 g of 4-(tert-butyl)-N-(3-chlorophenyl)-2-methylaniline, and the same material and equivalent weight as in the synthesis method of Intermediate 37 were used, and the resulting product was recrystallized to obtain 31 g of Intermediate 88. (yield 79%). MS[M+H]+=772

2) Synthesis of Intermediate 89

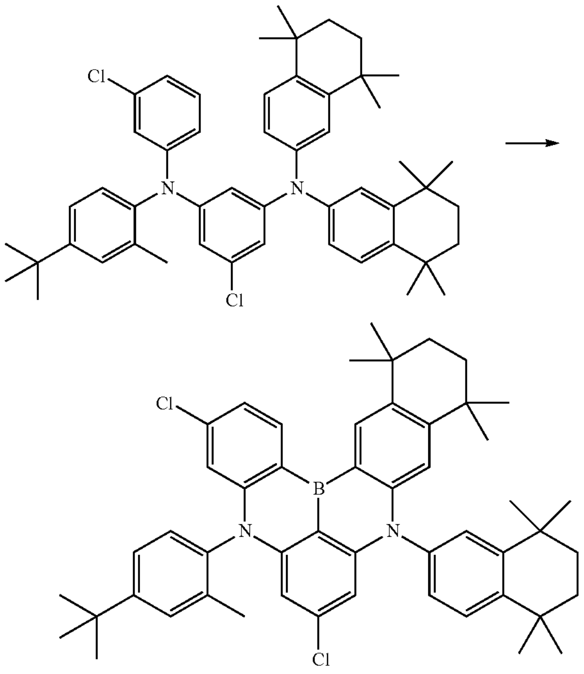

After 25 g of Intermediate 88 and 21.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Intermediate 89 (yield 30%). MS[M+H]+=780

3) Synthesis of Compound 58

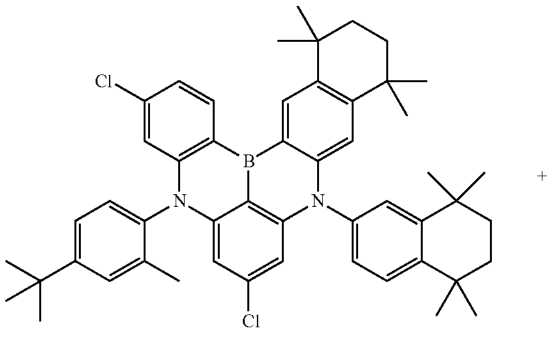

[Intermediate 89]

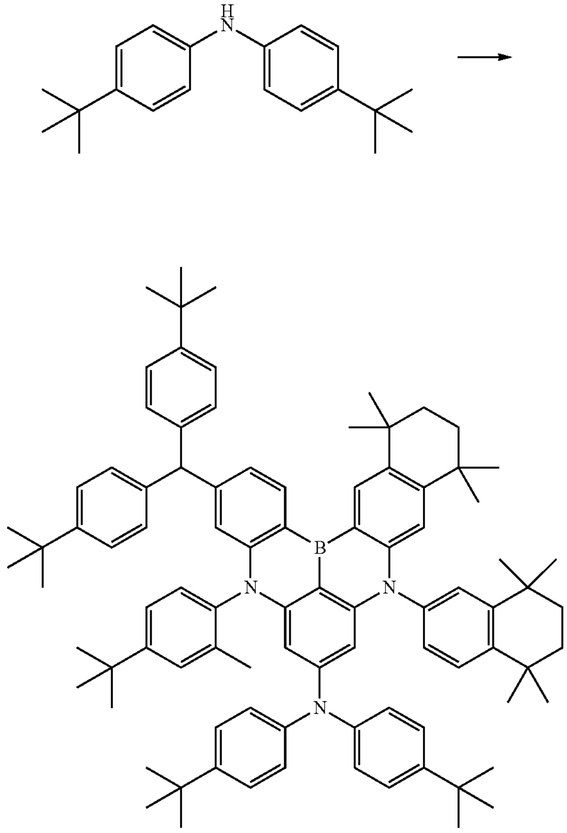

[Compound 58]

After 7 g of Intermediate 89, 4.3 g of bis(4-(tert-butyl)phenyl)amine, 2.1 g of sodium-tert-butoxide, and 0.05 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 7.2 g of Compound 58. (yield 78%). MS[M+H]+=1270

Synthesis Example 59. Synthesis of Compound 59

1) Synthesis of Compound 59

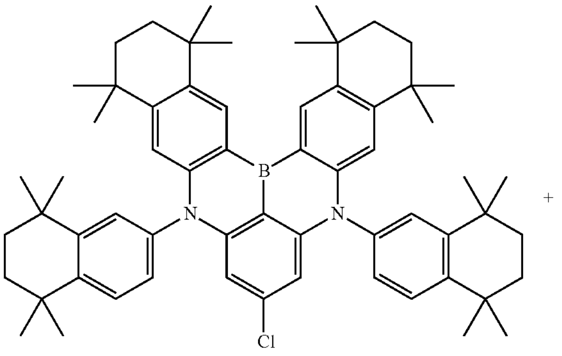

[Intermediate 58]

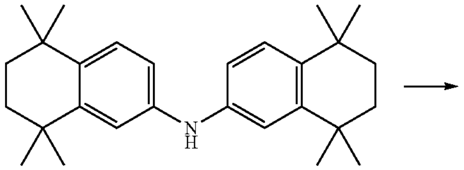

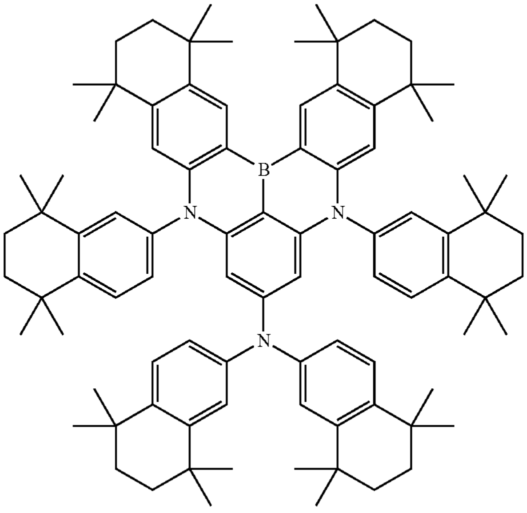

[Compound 59]

After 7 g of Intermediate 58, 3 g of bis(5,5,8,8-tetramethyl-5,6,7,8-tetrahydronaphthalen-2-yl)amine, 1.5 g of sodium-tert-butoxide, and 0.04 g of bis(tri-tert-butylphosphine)palladium(0) were put into 80 ml of xylene, the resulting mixture was stirred under reflux for 5 hours. After the completion of the reaction, the resulting product was extracted, and then recrystallized to obtain 7.1 g of Compound 59 (yield 73%). MS[M+H]+=1249

Synthesis Example 60. Synthesis of Compound 60

1) Synthesis of Intermediate 90

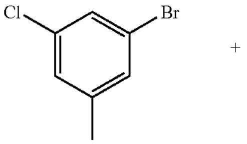

-continued

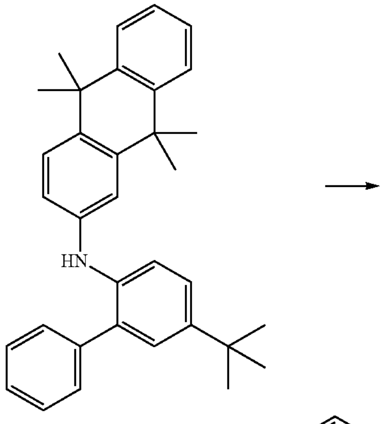

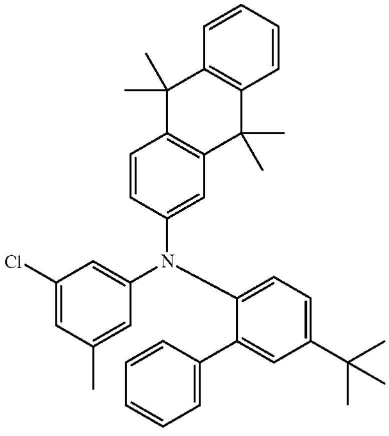

[Intermediate 90]

After 40 g of 1-bromo-3-chloro-5-methylbenzene, 89.5 g of N-(5-(tert-butyl)-[1,1'-biphenyl]-2-yl)-9,9,10,10-tetramethyl-9,10-dihydroanthracen-2-amine, 56.1 g of sodium-tert-butoxide, and 1.0 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 88 g of Intermediate 90. (yield 77%). MS[M+H]+=585

2) Synthesis of Intermediate 91

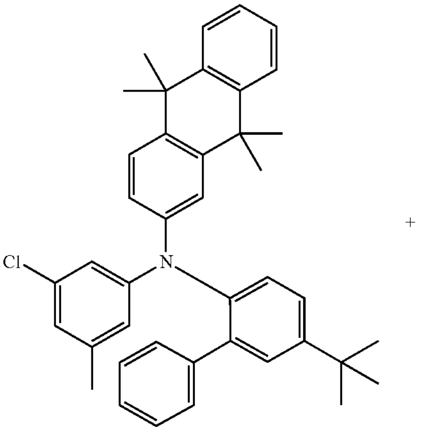

[Intermediate 90]

-continued

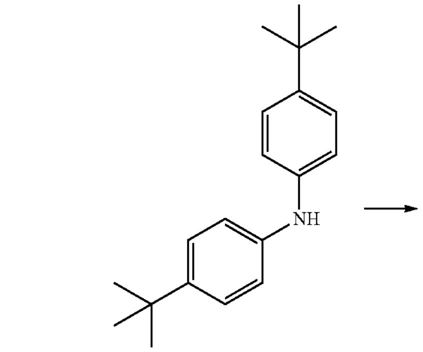

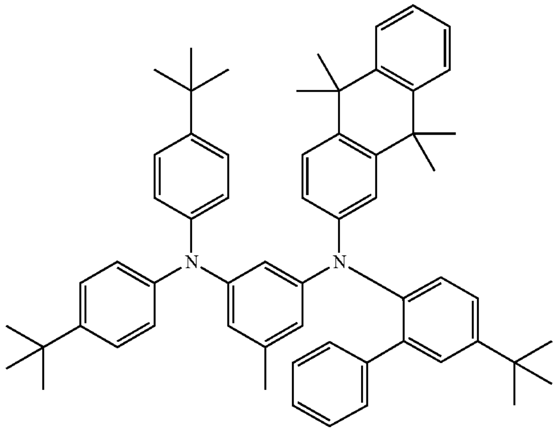

[Intermediate 91]

After 30 g of Intermediate 90, 14.5 g of bis(4-(tert-butyl) phenyl)amine, 9.9 g of sodium-tert-butoxide, and 0.3 g of bis(tri-tert-butylphosphine)palladium(0) were put into 450 ml of toluene under a nitrogen atmosphere, the resulting mixture was stirred under reflux for 2 hours. After the completion of the reaction, the resulting product was extracted, and then recrystallized to obtain 34 g of Intermediate 91. (yield 80%). MS[M+H]+=830

3) Synthesis of Compound 60

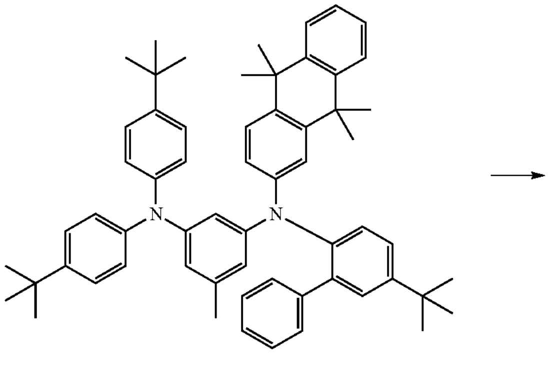

[Intermediate 91]

-continued

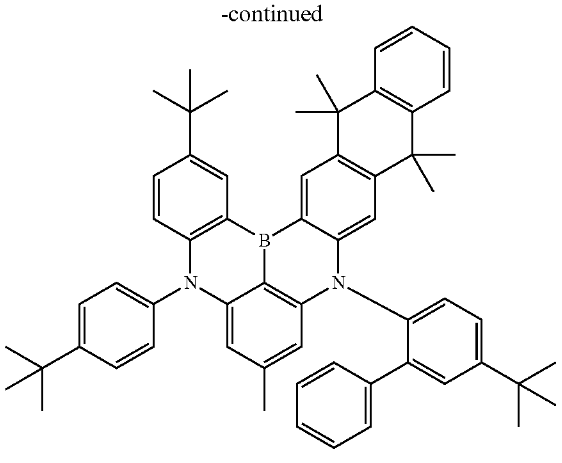

[Compound 60]

After 25 g of Intermediate 91 and 20.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Compound 60 (yield 30%). MS[M+H]+=838

Synthesis Example 61. Synthesis of Compound 61

1) Synthesis of Intermediate 92

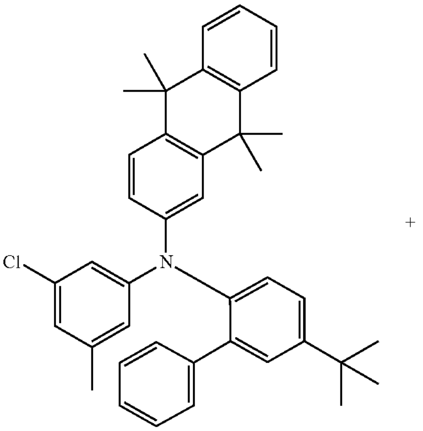

[Intermediate 90]

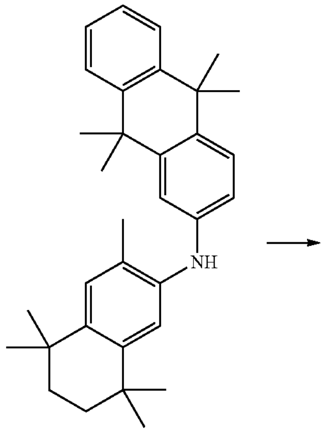

-continued

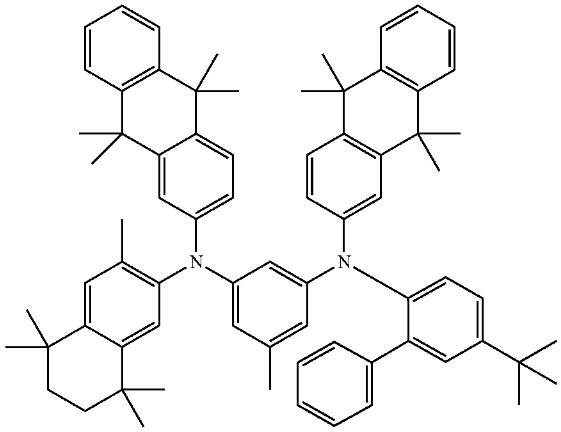

[Intermediate 92]

After 30 g of Intermediate 90, 23.2 g of 9,9,10,10-tetramethyl-N-(3,5,5,8,8-pentamethyl-5,6,7,8-tetrahydronapthalen-2-yl)-9,10-dihydroanthracen-2-amine, 9.9 g of sodium-tert-butoxide, and 0.3 g of bis(tri-tert-butylphosphine)palladium(0) were put into 450 ml of toluene under a nitrogen atmosphere, the resulting mixture was stirred under reflux for 2 hours. After the completion of the reaction, the resulting product was extracted, and then recrystallized to obtain 38 g of Intermediate 92. (yield 74%). MS[M+H]+=1000

2) Synthesis of Compound 61

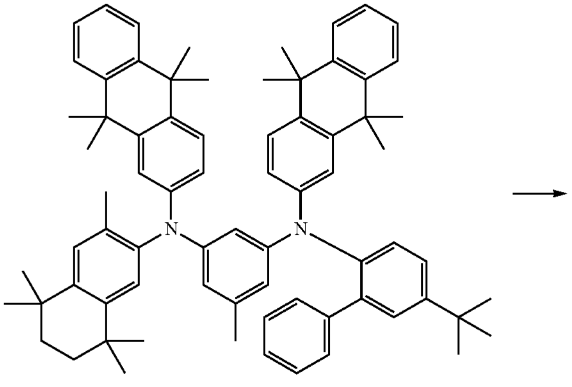

[Intermediate 92]

-continued

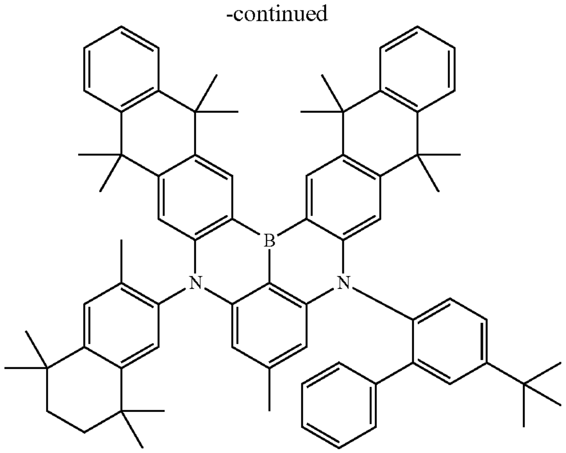

[Compound 61]

After 25 g of Intermediate 92 and 20.1 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.6 g of Compound 61 (yield 30%). MS[M+H]+=1008

Synthesis Example 62. Synthesis of Compound 62

1) Synthesis of Intermediate 93

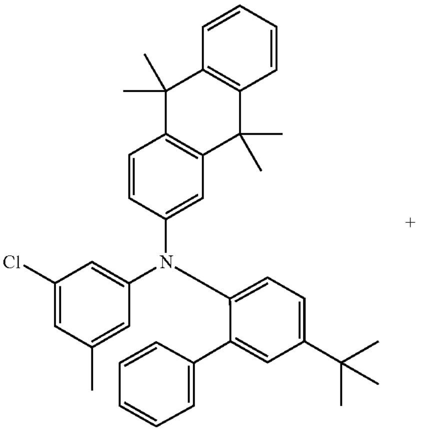

[Intermediate 90]

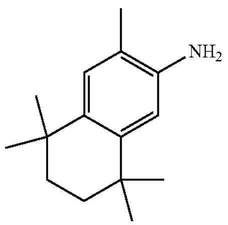

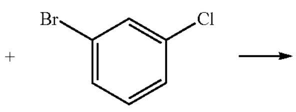

-continued

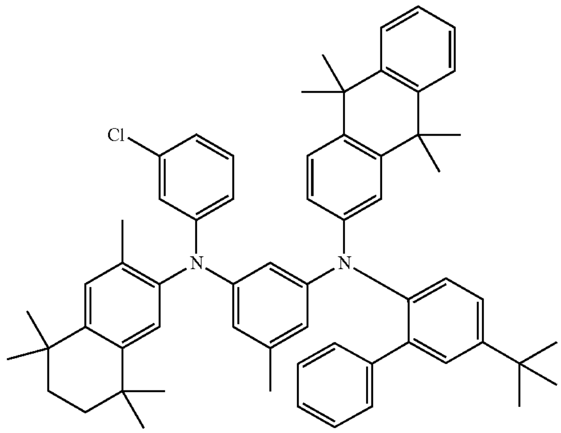

[Intermediate 93]

After 30 g of Intermediate 90, 14.9 g of 3,5,5,8,8-pentamethyl-5,6,7,8-tetrahydronaphthalen-2-amine, 19.8 g of sodium-tert-butoxide, and 0.4 g of bis(tri-tert-butylphosphine)palladium(0) were put into 600 ml of toluene under a nitrogen atmosphere, the resulting mixture was refluxed for 1 hour, whether the reaction proceeded was confirmed, and then 13.1 g of 1-bromo-3-chlorobenzene was added thereto during the reflux reaction, and the reflux reaction was performed for an additional 1 hour. After the completion of the reaction, the resulting product was extracted, and then recrystallized to obtain 44 g of Intermediate 93. (yield 73%). MS[M+H]+=876

(yield 77%), MS[M+H]+=585

2) Synthesis of Intermediate 94

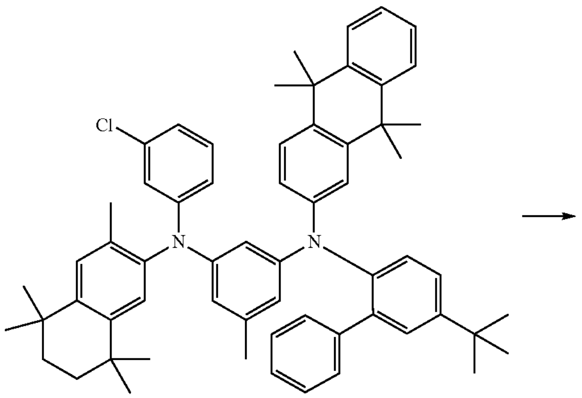

[Intermediate 93]

-continued

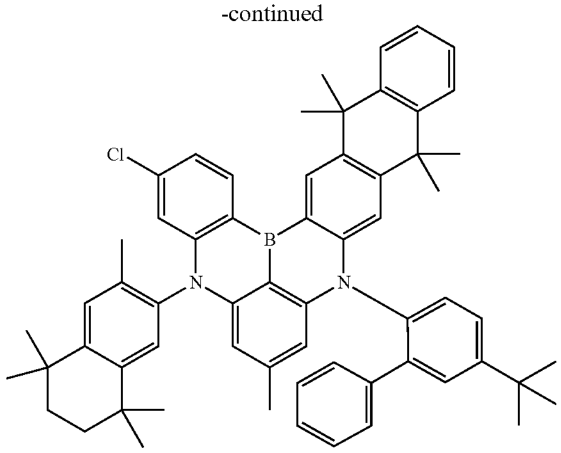

[Intermediate 94]

After 25 g of Intermediate 93 and 19 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 8.0 g of Intermediate 94. (yield 32%). MS[M+H]+=884

3) Synthesis of Compound 62

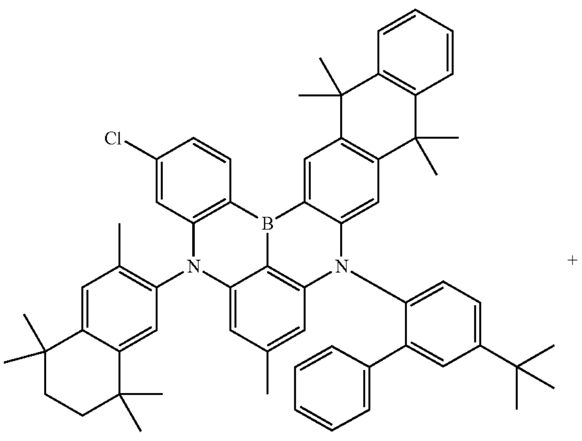

[Intermediate 94]

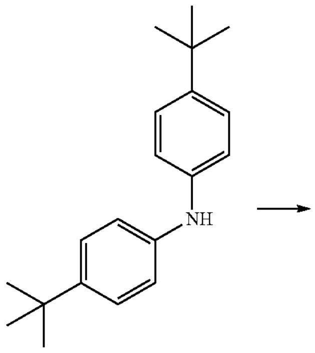

-continued

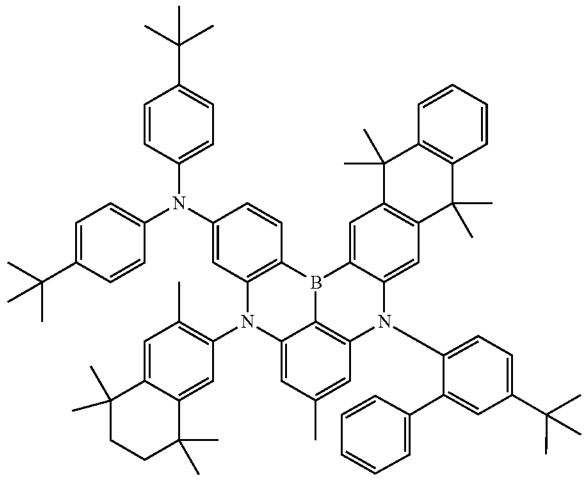

[Compound 62]

After 7 g of Intermediate 94, 14.5 g of bis(4-(tert-butyl)phenyl)amine, 9.9 g of sodium-tert-butoxide, and 0.3 g of bis(tri-tert-butylphosphine)palladium(0) were put into 150 ml of toluene under a nitrogen atmosphere, the resulting mixture was stirred under reflux for 2 hours. After the completion of the reaction, the resulting product was extracted, and then recrystallized to obtain 6.9 g of Compound 62. (yield 77%). MS[M+H]+=1129

Synthesis Example 63. Synthesis of Compound 63

1) Synthesis of Intermediate 95

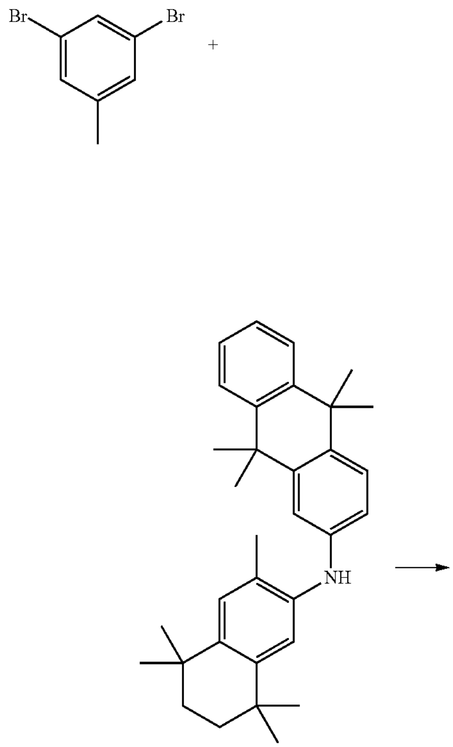

-continued

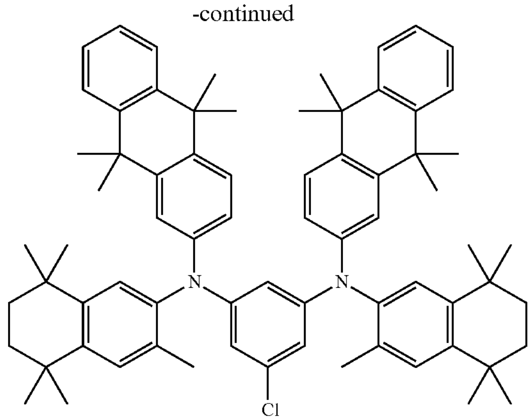

[Intermediate 95]

After 30 g of 1,3-dibromo-5-methylbenzene, 108 g of 9,9,10,10-tetramethyl-N-(3,5,5,8,8-pentamethyl-5,6,7,8-tetrahydronapthalen-2-yl)-9,10-dihydroanthracen-2-amine, 70 g of sodium-tert-butoxide, and 1.2 g of bis(tri-tert-butylphosphine)palladium(0) were put into 600 ml of toluene under a nitrogen atmosphere, the resulting mixture was stirred under reflux for 2 hours. After the completion of the reaction, the resulting product was extracted, and then recrystallized to obtain 88 g of Intermediate 95. (yield 72%). MS[M+H]+=1012

2) Synthesis of Intermediate 96

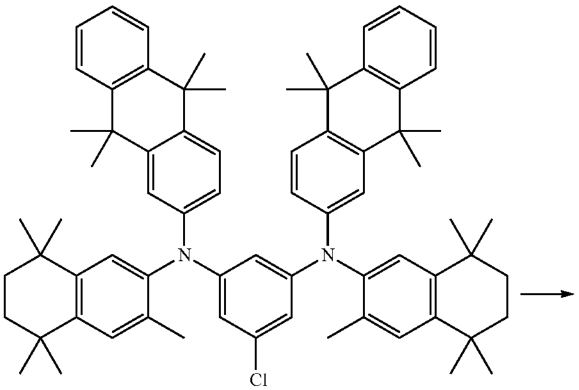

[Intermediate 95]

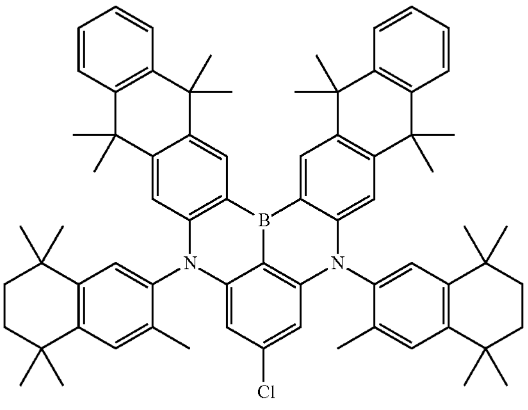

[Intermediate 96]

After 25 g of Intermediate 95 and 16.4 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.9 g of Intermediate 96. (yield 31%). MS[M+H]+=1020

3) Synthesis of Compound 63

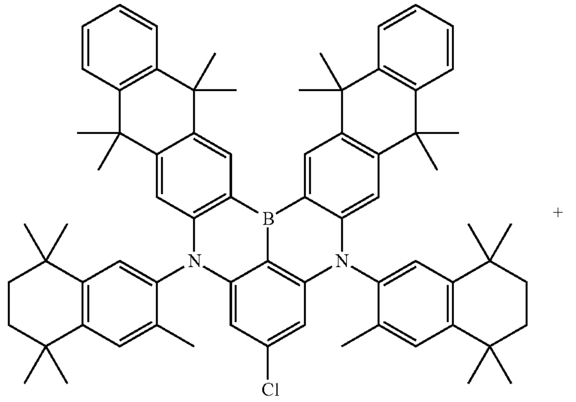

[Intermediate 96]

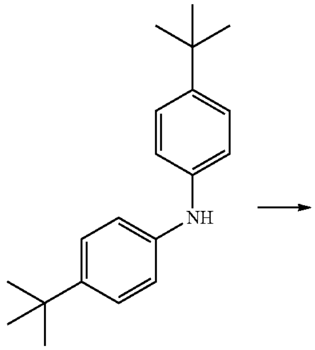

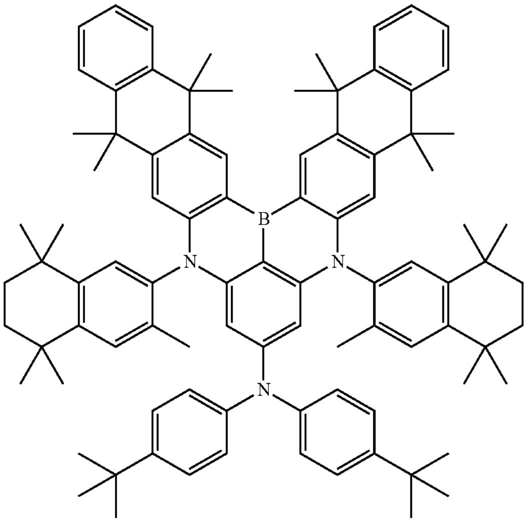

[Compound 63]

After 7 g of Intermediate 96, 1.93 g of bis(4-(tert-butyl)phenyl)amine, 1.32 g of sodium-tert-butoxide, and 0.03 g of bis(tri-tert-butylphosphine)palladium(0) were put into 80 ml of xylene under a nitrogen atmosphere, the resulting mixture was stirred under refluxed for 5 hours. After the completion of the reaction, the resulting product was extracted, and then recrystallized to obtain 6.9 g of Compound 63. (yield 79%). MS[M+H]+=1265

Synthesis Example 64. Synthesis of Compound 64

1) Synthesis of Compound 64

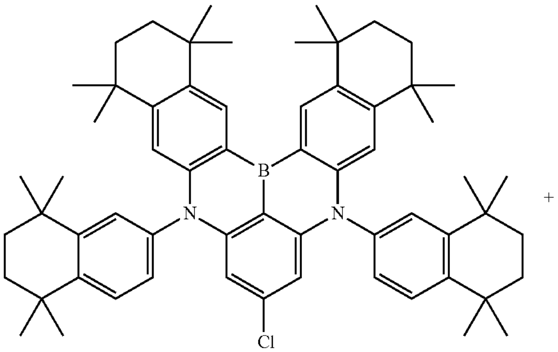

[Intermediate 58]

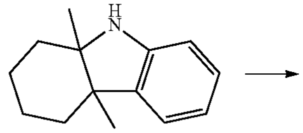

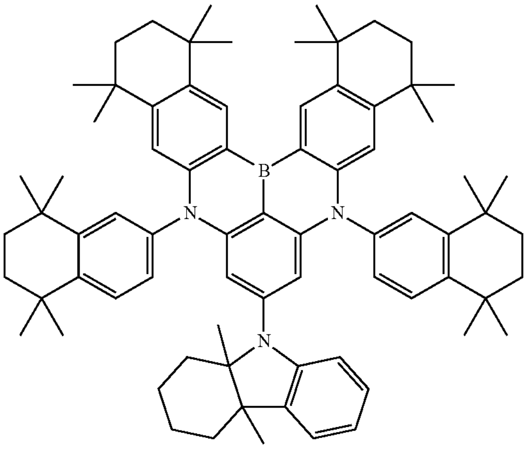

[Compound 64]

After 7 g of Intermediate 58, 1.93 g of 4a,9a-dimethyl-2,3,4,4a,9,9a-hexahydro-1H-carbazole, 1.52 g of sodium-tert-butoxide, and 0.04 g of bis(tri-tert-butylphosphine)palladium(0) were put into 80 ml of xylene under a nitrogen atmosphere, the resulting mixture was stirred under reflux for 5 hours. After the completion of the reaction, the resulting product was extracted, and then recrystallized to obtain 6.5 g of Compound 64. (yield 78%). MS[M+H]+=1061

Synthesis Example 65. Synthesis of Compound 65

1) Synthesis of Compound 65

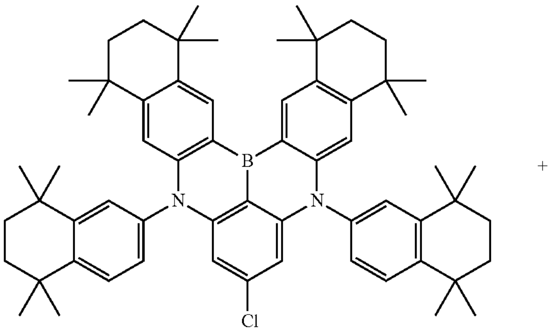

[Intermediate 58]

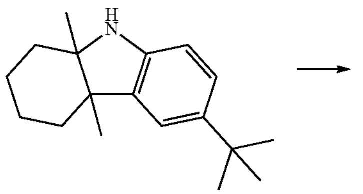

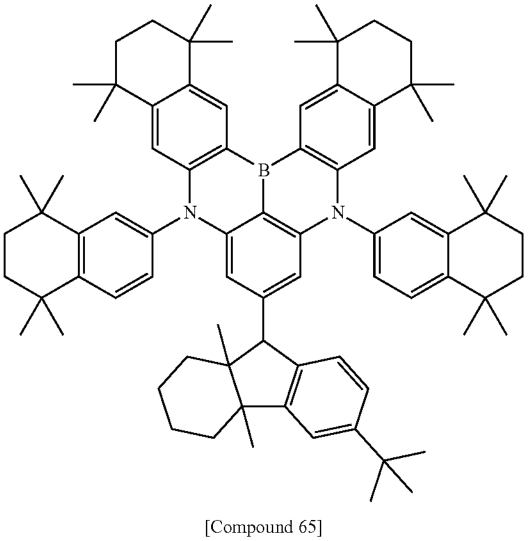

[Compound 65]

After 7 g of Intermediate 58, 2.05 g of 6-(tert-butyl)-4a, 9a-dimethyl-2,3,4,4a,9,9a-hexahydro-1H-carbazole, 1.52 g of sodium-tert-butoxide, and 0.04 g of bis(tri-tert-butylphosphine)palladium(0) were put into 80 ml of xylene under a nitrogen atmosphere, the resulting mixture was stirred under reflux for 5 hour. After the completion of the reaction, the resulting product was extracted, and then recrystallized to obtain 6.7 g of Compound 65. (yield 77%). MS[M+H]+=1117

Synthesis Example 66. Synthesis of Compound 66

1) Synthesis of Compound 66

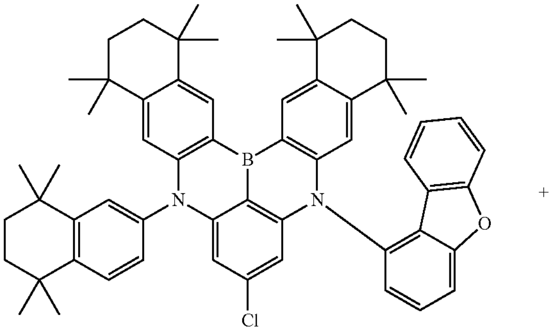

[Intermediate 71]

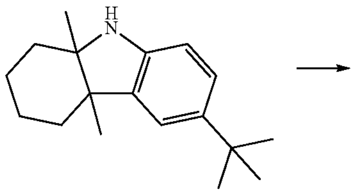

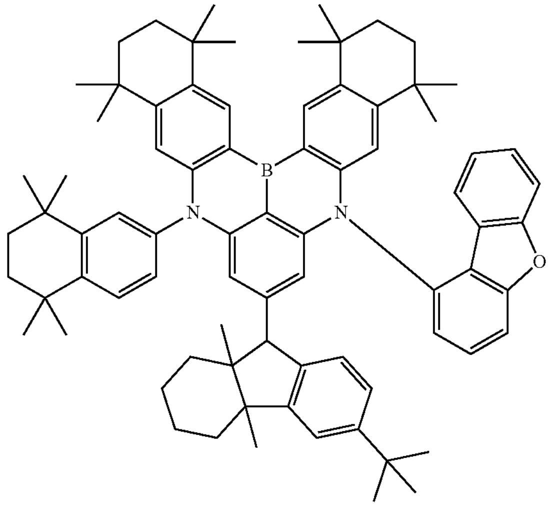

[Compound 66]

After 7 g of Intermediate 71, 2.06 g of 6-(tert-butyl)-4a, 9a-dimethyl-2,3,4,4a,9,9a-hexahydro-1H-carbazole, 1.55 g of sodium-tert-butoxide, and 0.04 g of bis(tri-tert-butylphosphine)palladium(0) were put into 80 ml of xylene under a nitrogen atmosphere, the resulting mixture was stirred under reflux for 5 hours. After the completion of the reaction, the resulting product was extracted, and then recrystallized to obtain 6.9 g of Compound 66. (yield 79%). MS[M+H]+=1097

Synthesis Example 67. Synthesis of Compound 67

1) Synthesis of Intermediate 97

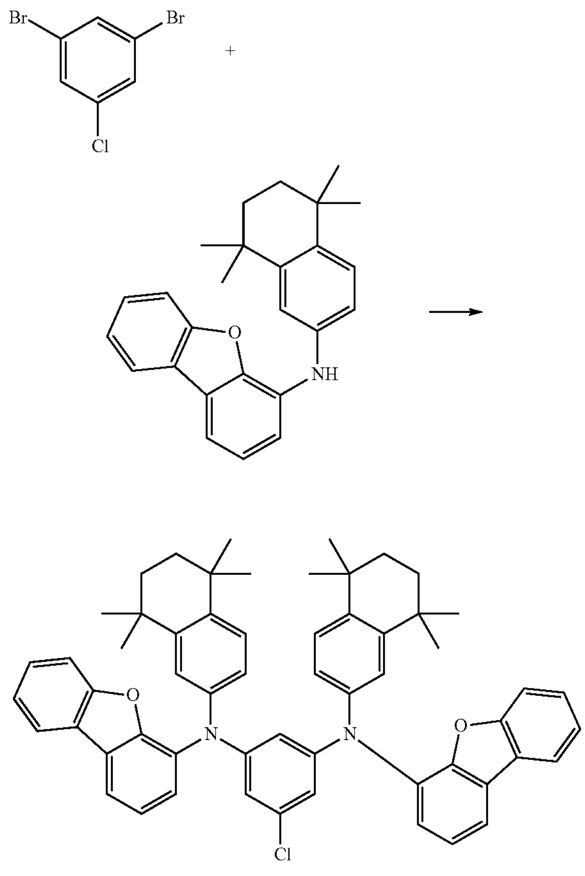

[Intermediate 97]

After 30 g of 1,3-dibromo-5-methylbenzene, 82 g of N-(5,5,8,8-tetramethyl-5,6,7,8-tetrahydronaphthalen-2-yl)dibenzo[b,d]furan-4-amine, 64 g of sodium-tert-butoxide, and 0.6 g of bis(tri-tert-butyl-phosphine)palladium(0) were put into 600 ml of toluene under a nitrogen atmosphere, the resulting mixture was stirred under reflux for 2 hours. After the completion of the reaction, the resulting product was extracted, and then recrystallized to obtain 69 g of Intermediate 97. (yield 73%). MS[M+H]+=848

2) Synthesis of Intermediate 98

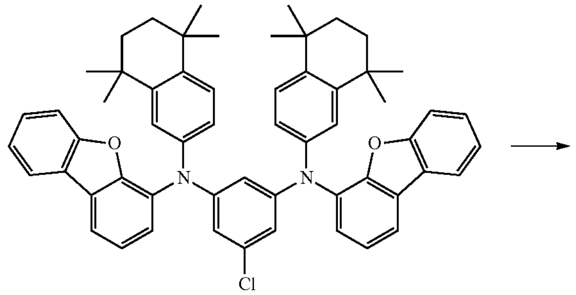

[Intermediate 97]

-continued

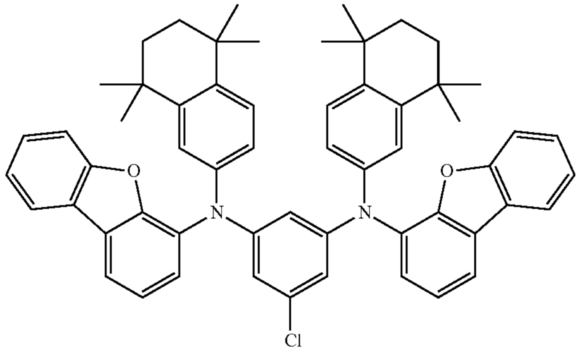

[Intermediate 98]

After 25 g of Intermediate 97 and 19.6 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.2 g of Intermediate 98. (yield 29%). MS[M+H]+=856

3) Synthesis of Compound 67

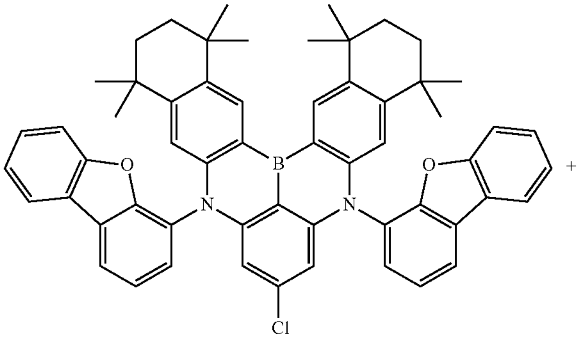

[Intermediate 98]

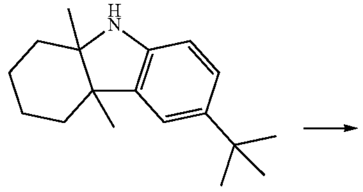

-continued

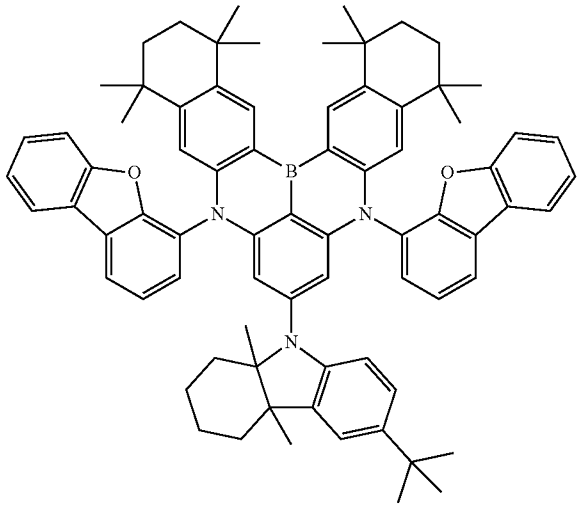

[Compound 67]

After 7 g of Intermediate 98, 2.1 g of 6-(tert-butyl)-4a,9a-dimethyl-2,3,4,4a,9,9a-hexahydro-1H-carbazole, 1.6 g of sodium-tert-butoxide, and 0.04 g of bis(tri-tert-butylphosphine)palladium(0) were put into 80 ml of xylene under a nitrogen atmosphere, the resulting mixture was stirred under reflux for 5 hours. After the completion of the reaction, the resulting product was extracted, and then recrystallized to obtain 7.0 g of Compound 67. (yield 79%). MS[M+H]+=1077

Synthesis Example 68. Synthesis of Compound 68

1) Synthesis of Compound 68

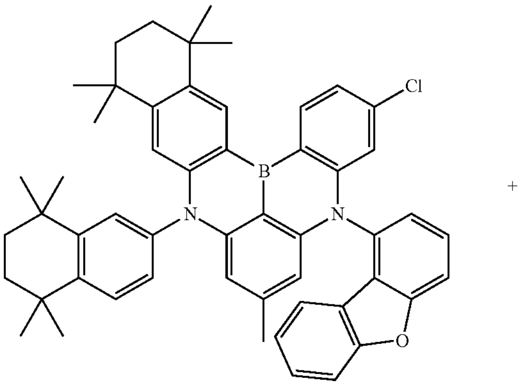

[Intermediate 67]

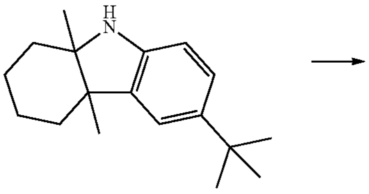

-continued

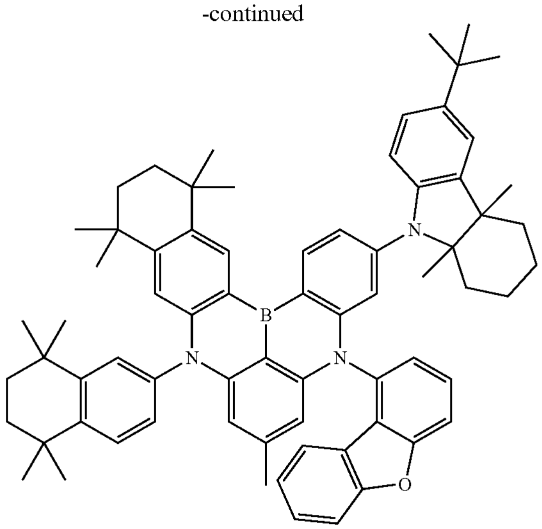

[Compound 68]

After 7 g of Intermediate 67, 2.31 g of 6-(tert-butyl)-4a,9a-dimethyl-2,3,4,4a,9,9a-hexahydro-1H-carbazole, 1.8 g of sodium-tert-butoxide, and 0.05 g of bis(tri-tert-butylphosphine)palladium(0) were put into 80 ml of xylene under a nitrogen atmosphere, the resulting mixture was stirred under reflux for 5 hours. After the completion of the reaction, the resulting product was extracted, and then recrystallized to obtain 7.1 g of Compound 68. (yield 79%). MS[M+H]+=1001

Synthesis Example 71. Synthesis of Compound 71

1) Synthesis of Intermediate 99

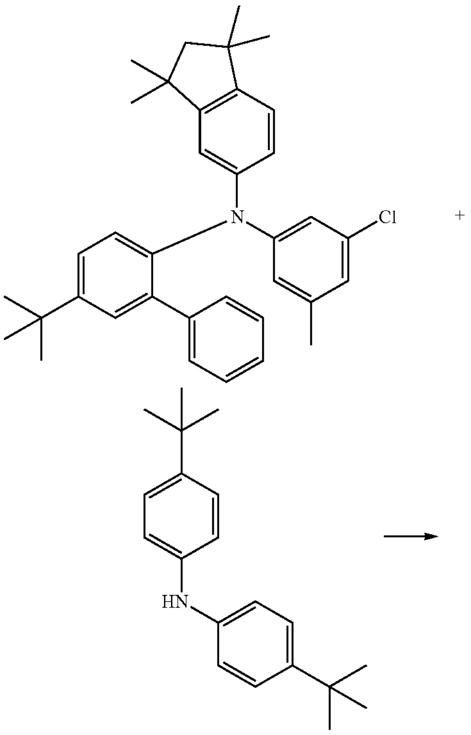

-continued

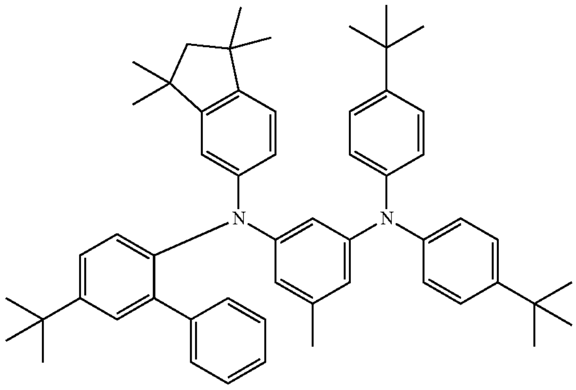

Intermediate 99

After 30 g of N-(5-(tert-butyl)-[1,1'-biphenyl]-2-yl)-N-(3-chloro-5-methylphenyl)-1,1,3,3-tetramethyl-2,3-dihydro-1H-inden-5-amine, 16.5 g of bis(4-(tert-butyl)phenyl)amine, 11.1 g of sodium-tert-butoxide, and 0.3 g of bis(tri-tert-butylphosphine)palladium(0) were put into 450 ml of toluene under a nitrogen atmosphere, the resulting mixture was stirred under reflux for 2 hours. After the completion of the reaction, the resulting product was extracted, and then recrystallized to obtain 34 g of Intermediate 99. (yield 77%). MS[M+H]+=768

2) Synthesis of Compound 71

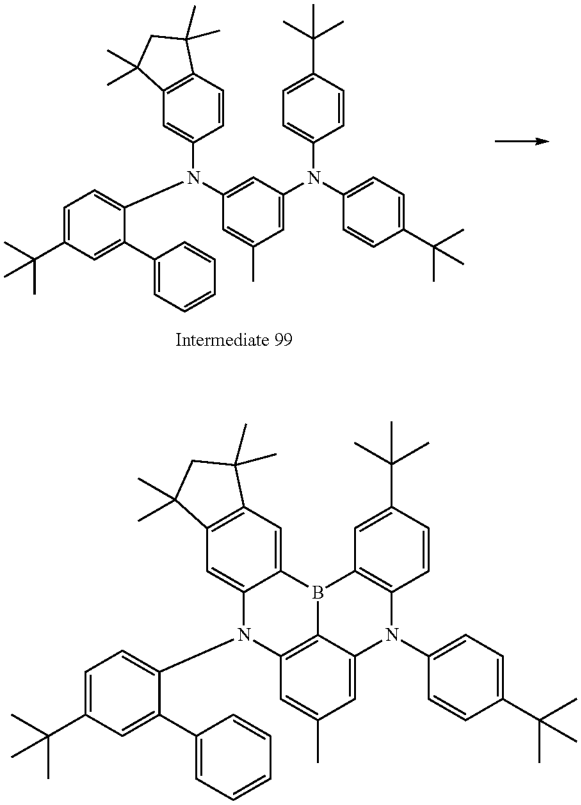

Intermediate 99

Compound 71

After 25 g of Intermediate 99 and 21.7 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.3 g of Compound 71 (yield 29%). MS[M+H]+=776

Synthesis Example 72. Synthesis of Compound 72

1) Synthesis of Intermediate 100

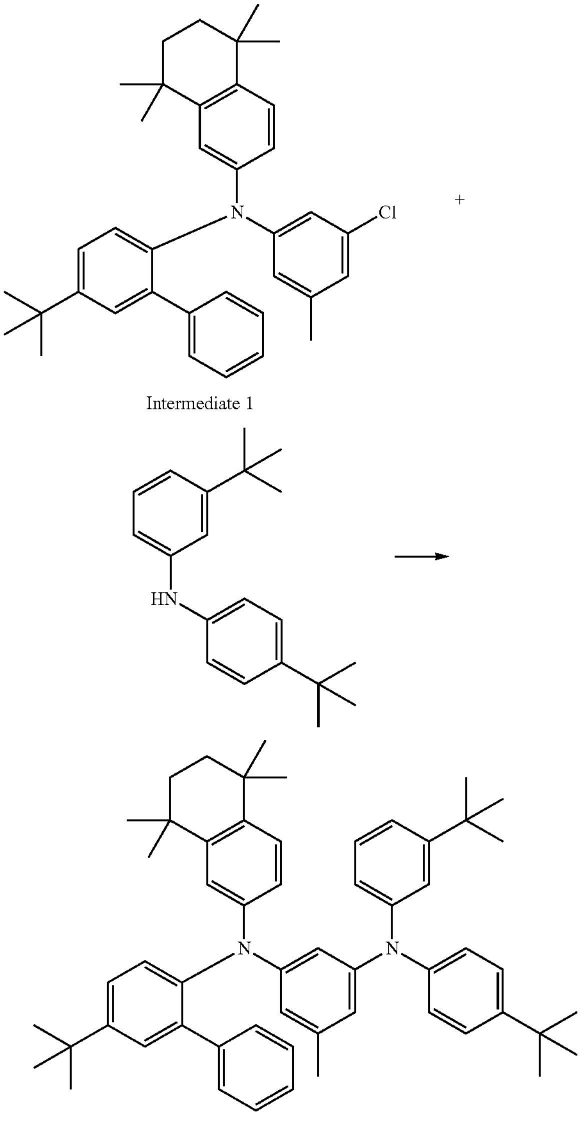

Intermediate 1

+

Intermediate 100

After 30 g of Intermediate 1, 15.7 g of 3-(tert-butyl)-N-(4-(tert-butyl)phenyl)aniline, 10.8 g of sodium-tert-butoxide, and 0.3 g of bis(tri-tert-butyl-phosphine)palladium(0) were put into 450 ml of toluene under a nitrogen atmosphere, the resulting mixture was stirred under reflux for 2 hours. After the completion of the reaction, the resulting product was extracted, and then recrystallized to obtain 33 g of Intermediate 100. (yield 76%). MS[M+H]+=782

2) Synthesis of Compound 72

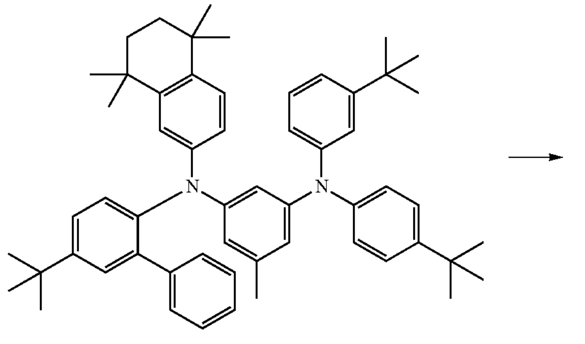

Intermediate 100

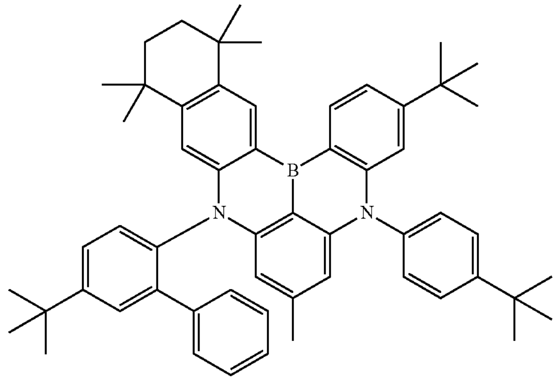

Compound 72

After 25 g of Intermediate 100 and 21.3 g of boron triiodide were put into 250 ml of 1,2-dichlorobenzene under a nitrogen atmosphere, the resulting mixture was stirred at 160° C. for 4 hours. After the completion of the reaction, the resulting product was extracted, and then recrystallized to obtain 7.5 g of Compound 72 (yield 30%). MS[M+H]+=790

By introducing various substituents in the same manner as in the Synthesis Examples, the compound of Formula 100 can be synthesized in addition to the above-described compounds.

<Experimental Example 1> Device Example

Example 1-1

A glass substrate thinly coated with indium tin oxide (ITO) to have a thickness of 1,400 Å was put into distilled water in which a detergent was dissolved, and ultrasonically washed. In this case, a product manufactured by Fischer Co., was used as the detergent, and distilled water, which had been filtered twice with a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted by using isopropyl alcohol, acetone, and methanol solvents, and the resulting product was dried and then transported to a plasma washing machine. The substrate was cleaned by using oxygen plasma for 5 minutes, and then was transported to a vacuum deposition machine.

The following compound HI-A and compound HAT-CN were thermally vacuum deposited to have a thickness of 650 Å and 50 Å, respectively, on the ITO transparent electrode prepared as described, thereby forming first and second hole injection layers. The following compound HT-A was vacuum deposited to have a thickness of 600 Å on the hole injection layer, thereby forming a hole transport layer. The following compound HT-B was vacuum deposited to have a thickness of 50 Å on the hole transport layer, thereby forming an electron blocking layer. Subsequently, 4 parts by weight of Compound 1 of the present invention as a blue light emitting dopant based on 100 parts by weight of the light emitting layer and the following compound BH as a host were vacuum deposited to have a thickness of 200 Å on the electron blocking layer, thereby forming a light emitting layer. Next, the following compound ET-A as a first electron transport layer was vacuum deposited to have a thickness of 50 Å on the light emitting layer, and subsequently, the following compound ET-B and compound LiQ were vacuum deposited at a weight ratio of 1:1, thereby forming a second electron transport layer having a thickness of 360 Å. Compound LiQ was vacuum deposited to have a thickness of 5 Å on the second electron transport layer, thereby forming an electron injection layer. Aluminum and silver were deposited at a weight ratio of 10:1 to have a thickness of 220 Å on the electron injection layer, aluminum was deposited to have a thickness of 1,000 Å thereon, thereby forming a negative electrode.

In the aforementioned procedure, the deposition rate of the organic materials were maintained at 0.4 to 0.9 Å/sec, the deposition rate of aluminum of the negative electrode was maintained at 2 Å/sec, and the degree of vacuum during the deposition was maintained at $1\times10^{-7}$ to $1\times10^{-8}$ torr, thereby manufacturing an organic light emitting device.

HI-A

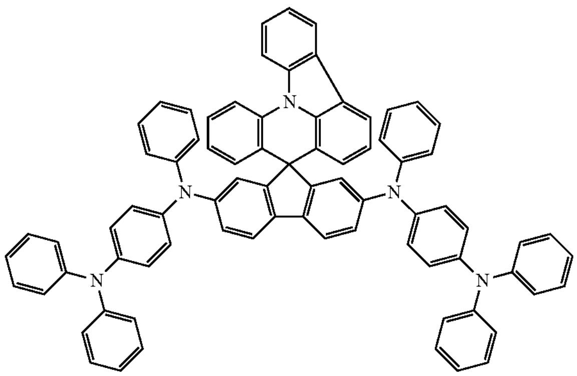

HAT-CN

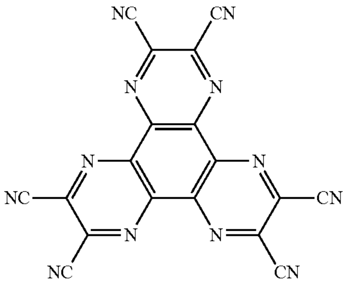

-continued
HT-A
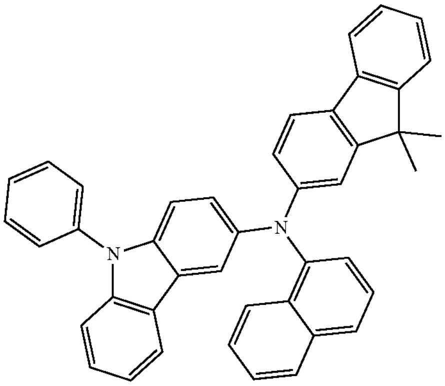
HT-B
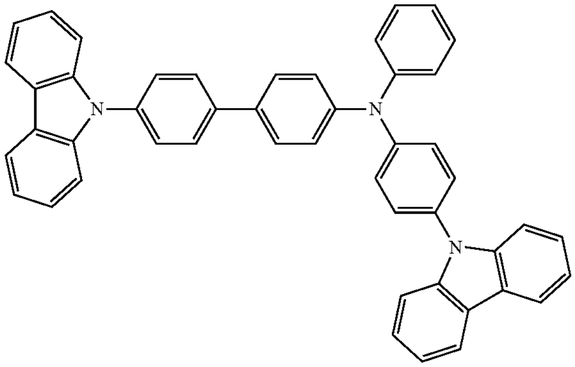
BH
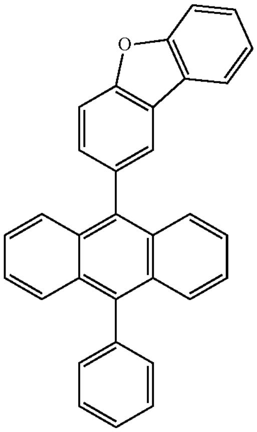
-continued
Compound 1
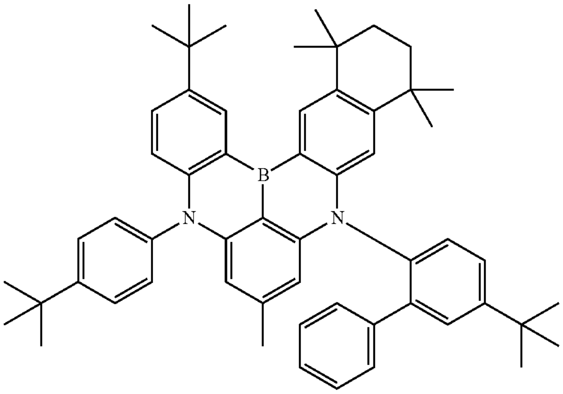
ET-A
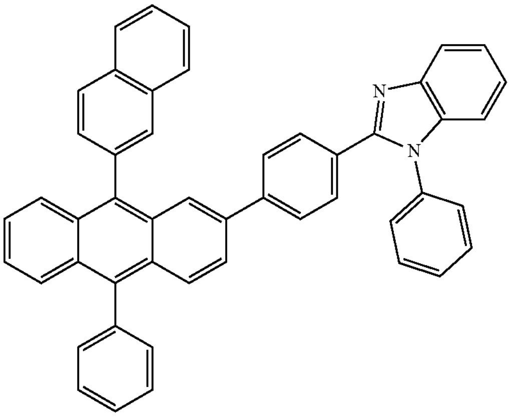
ET-B
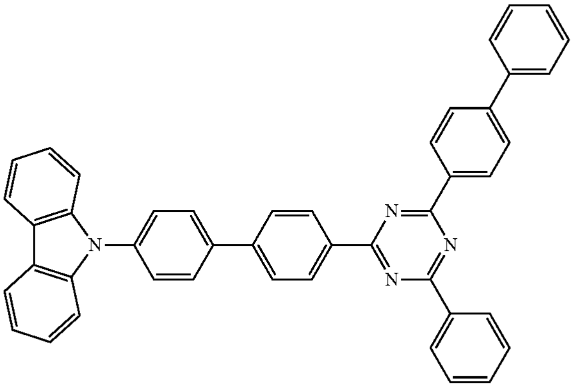
LiQ
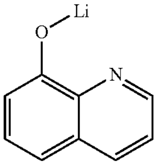
Examples 1-2 to 1-6, 1-8 to 1-23, 1-25 to 1-27, and 1-29 to 1-68
Devices were manufactured in the same manner as in Example 1-1, except that compounds described in the following Table 1 were used as the dopant of the light emitting layer in Example 1-1.

Compound 1
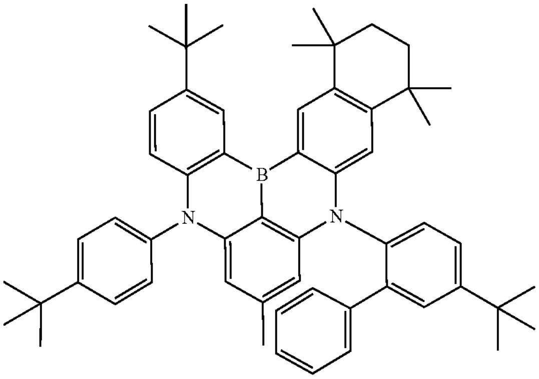
Compound 2
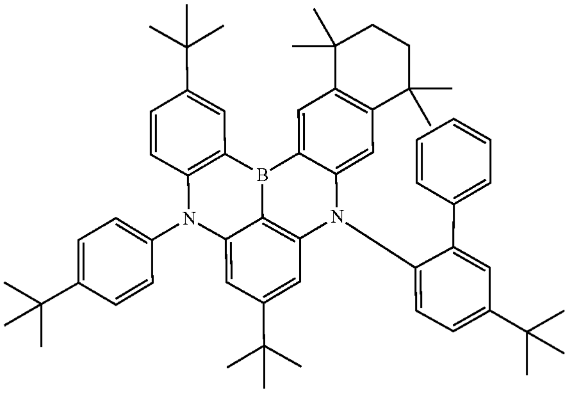
Compound 3
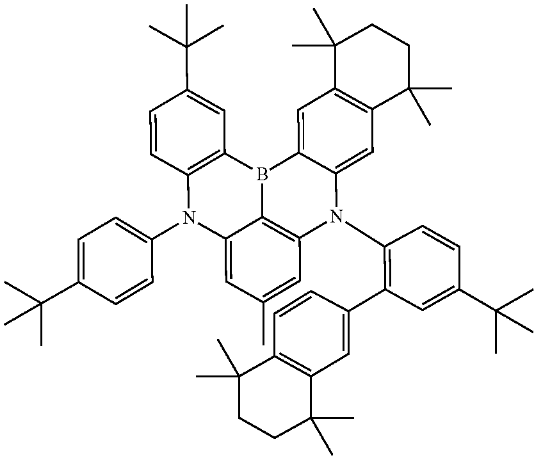
-continued
Compound 4
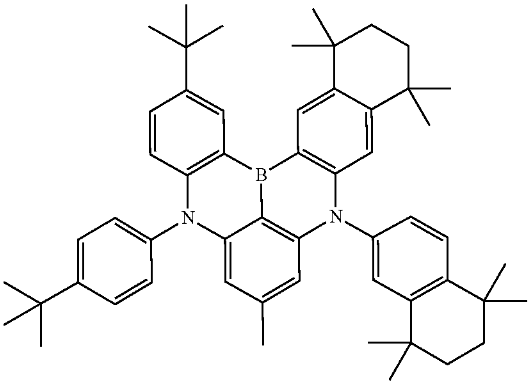
Compound 5
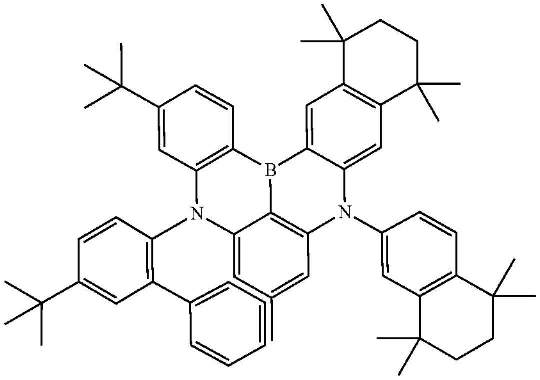
Compound 6
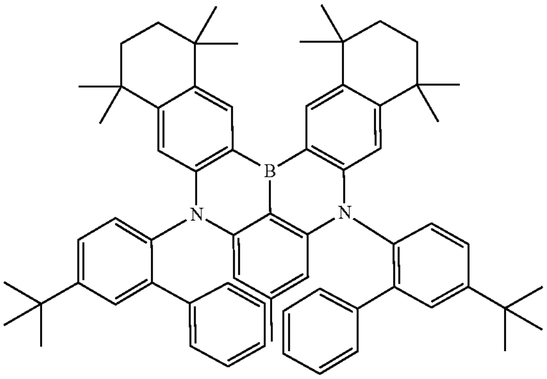

-continued
Compound 8
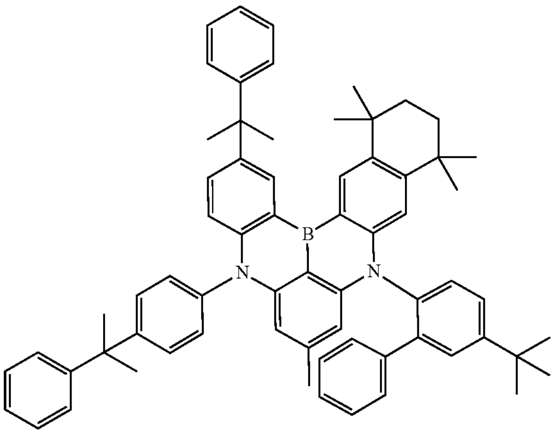
Compound 9
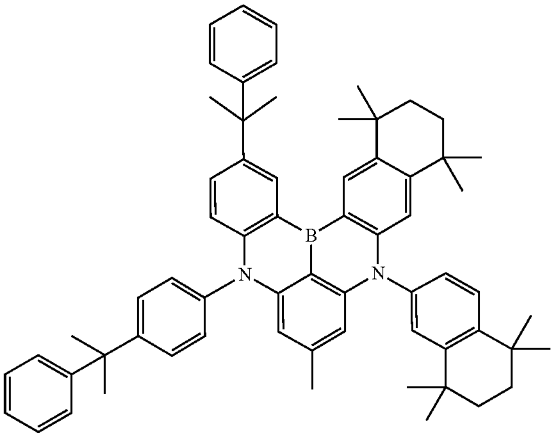
Compound 10
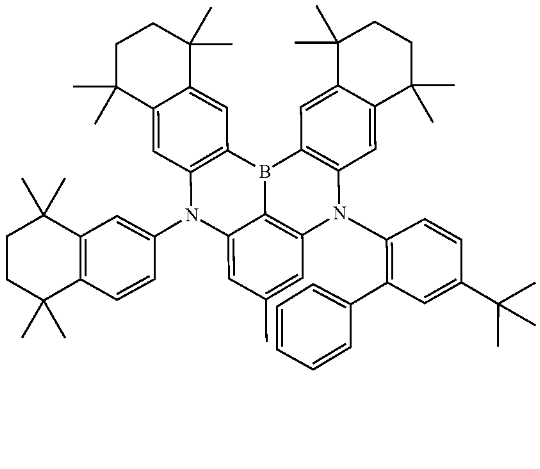
-continued
Compound 11
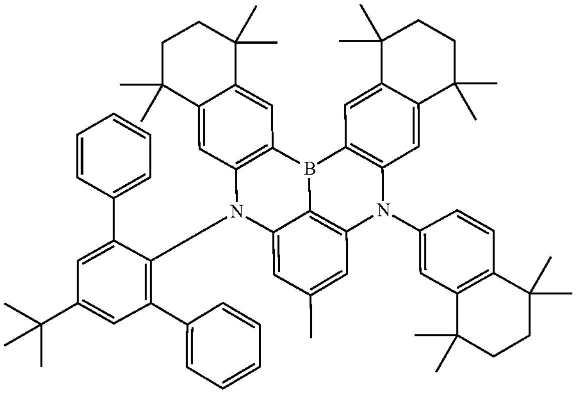
Compound 12
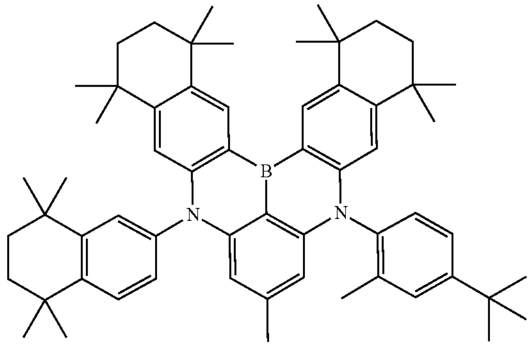
Compound 13
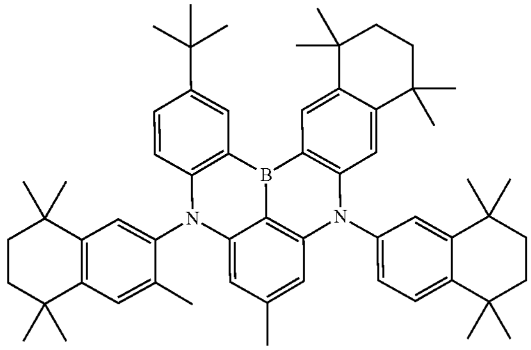
Compound 14
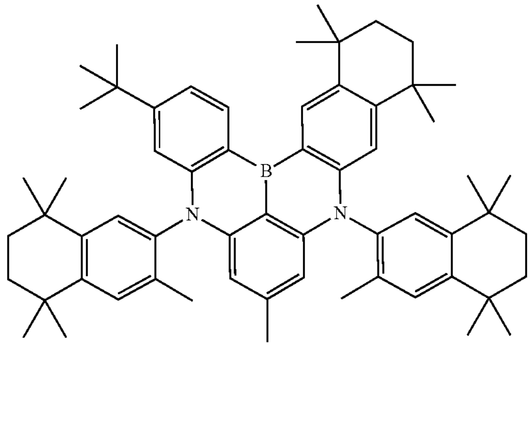

Compound 15
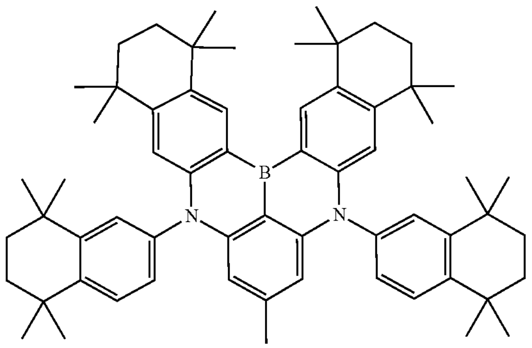
Compound 16
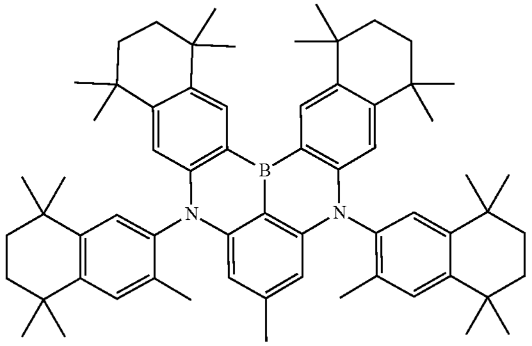
Compound 17
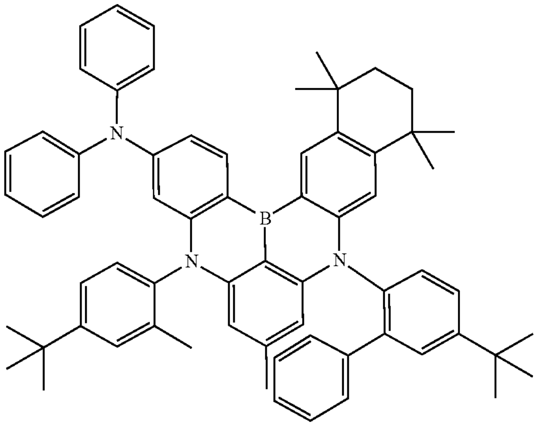
Compound 18
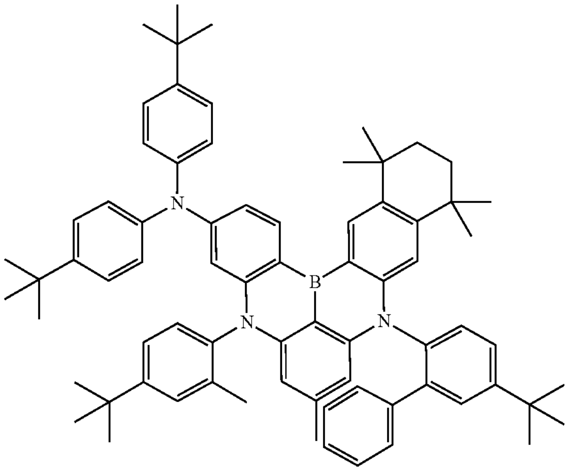
Compound 19
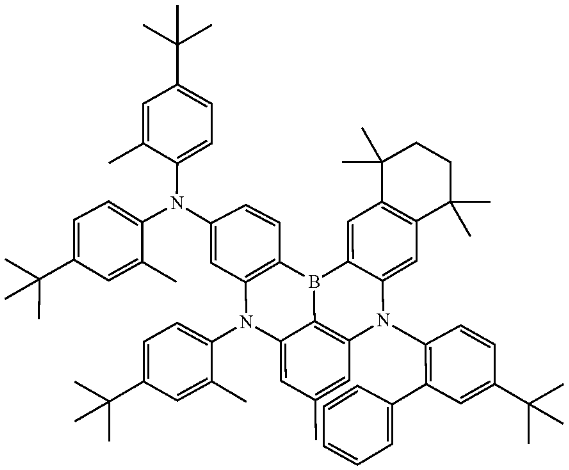
Compound 20
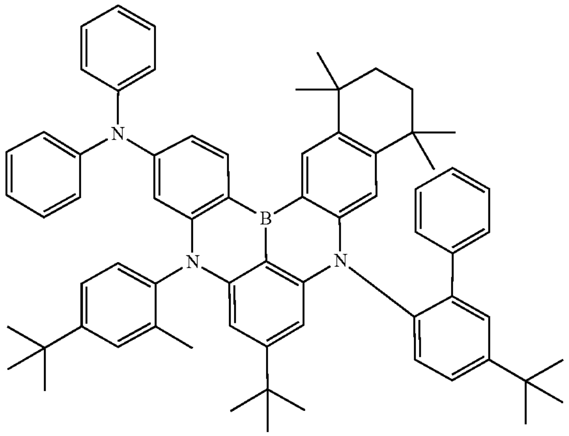

-continued
Compound 21
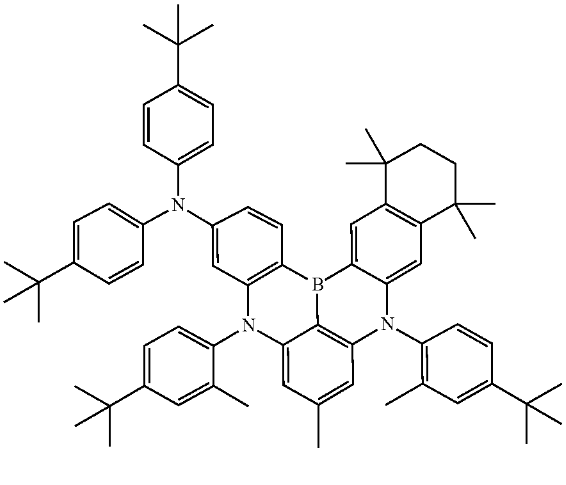
Compound 22
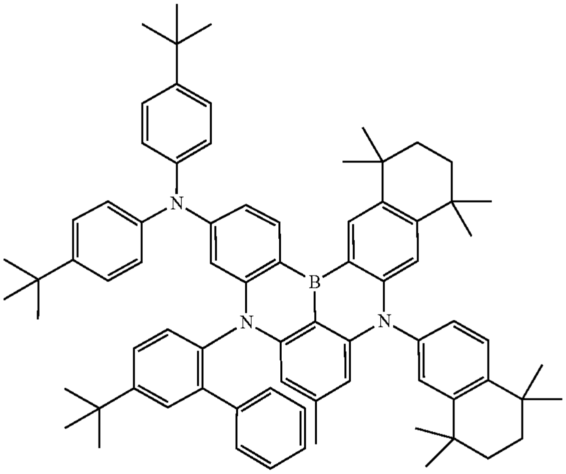
Compound 23
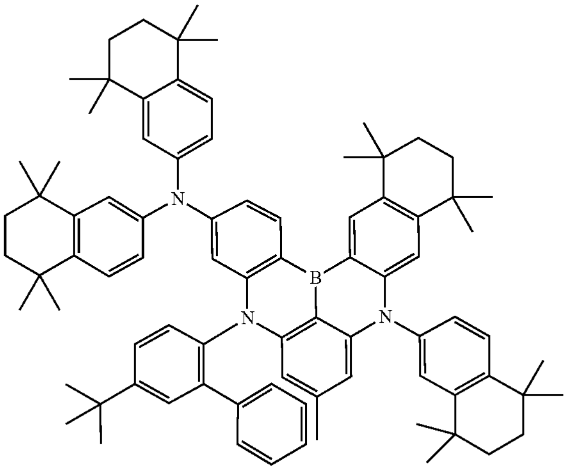
-continued
Compound 25
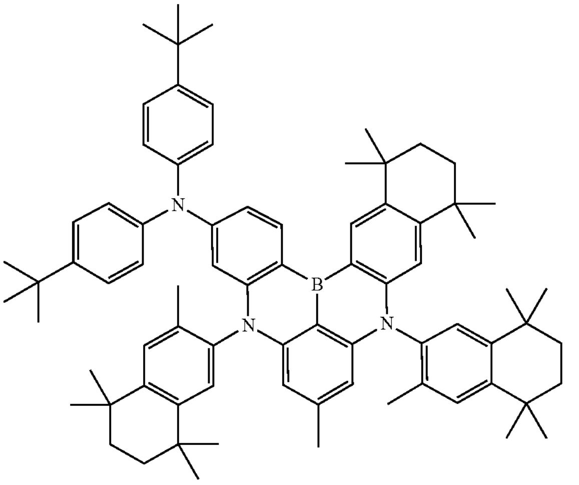
Compound 26
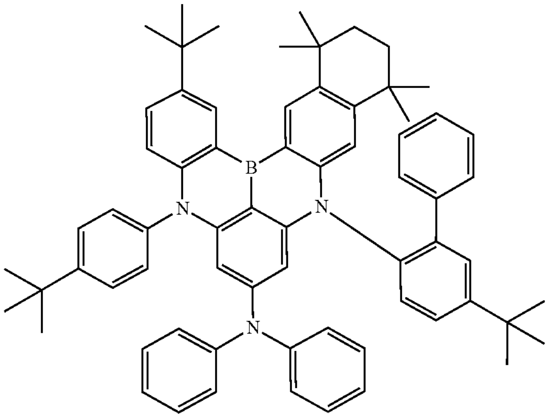
Compound 27
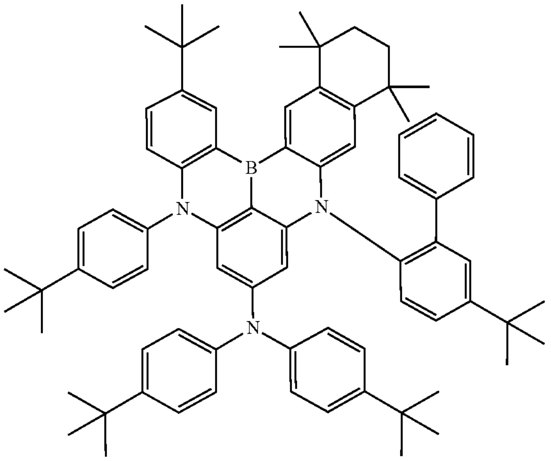

-continued
Compound 29
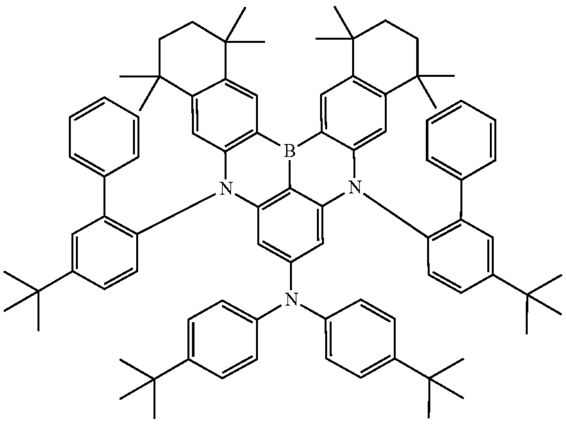
Compound 30
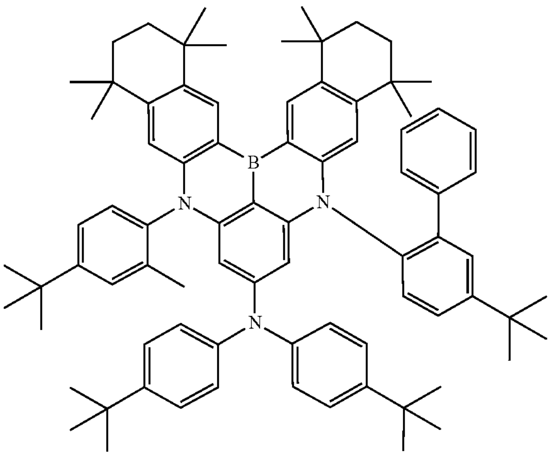
Compound 31
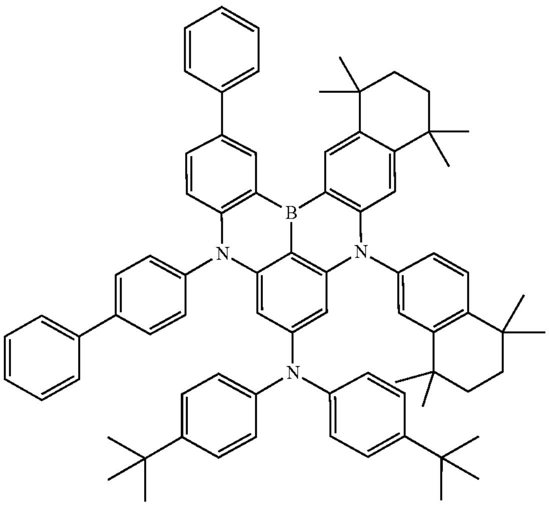
-continued
Compound 32
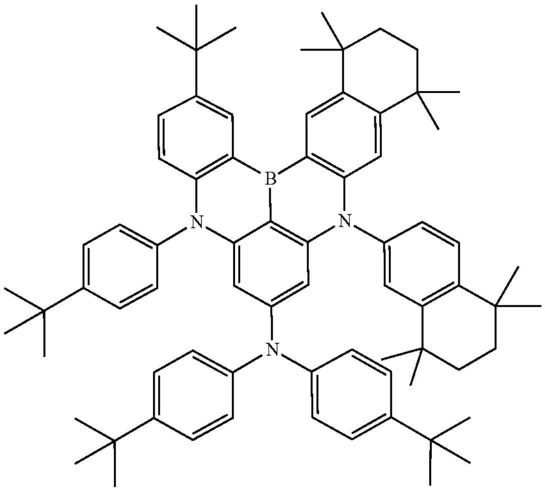
Compound 33
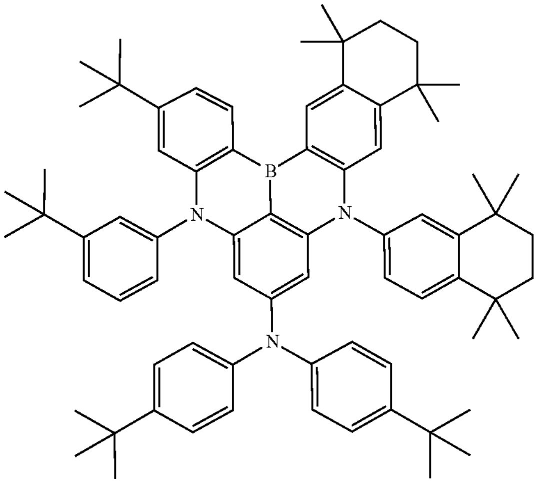
Compound 34
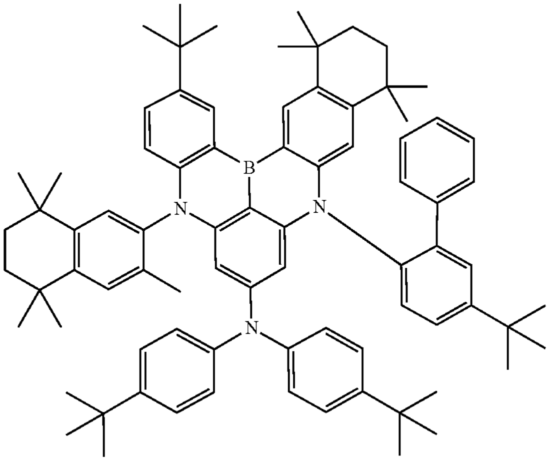

-continued
Compound 35
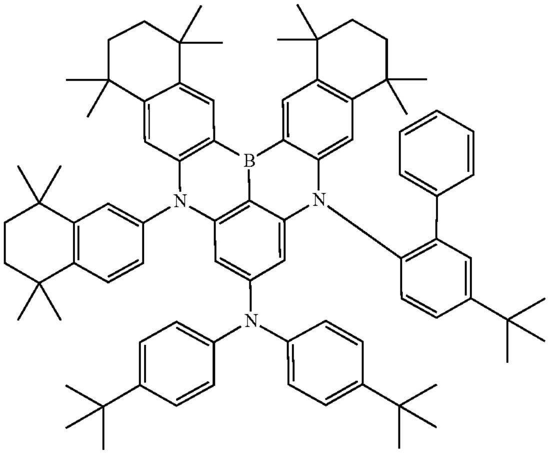
Compound 36
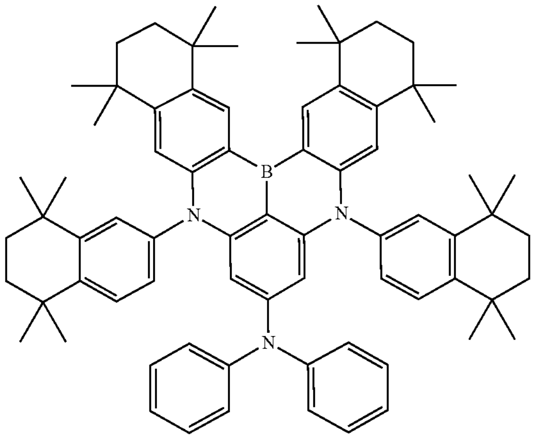
Compound 37
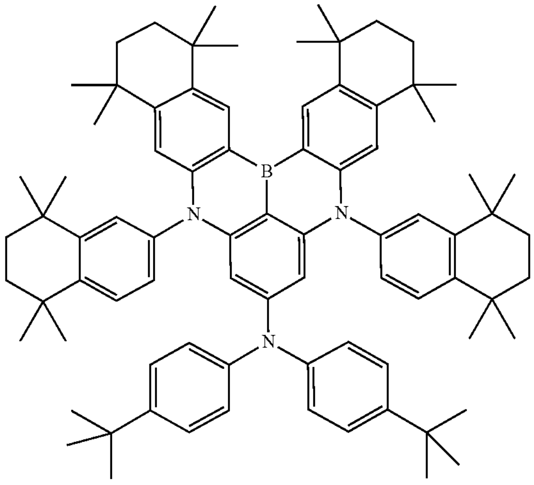
-continued
Compound 38
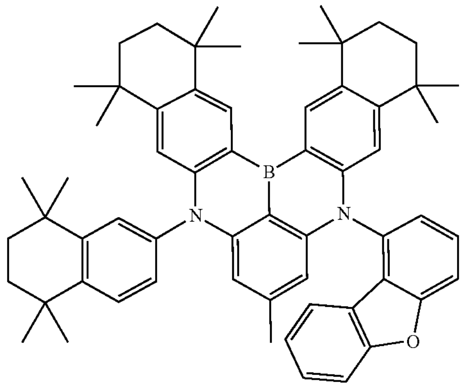
Compound 39
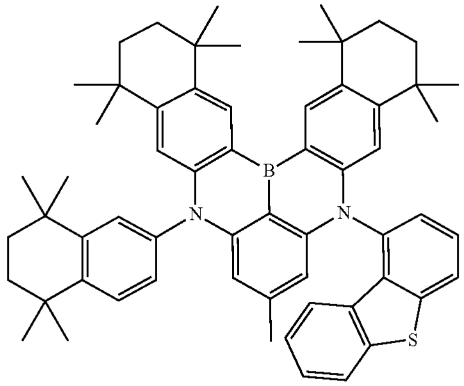
Compound 40
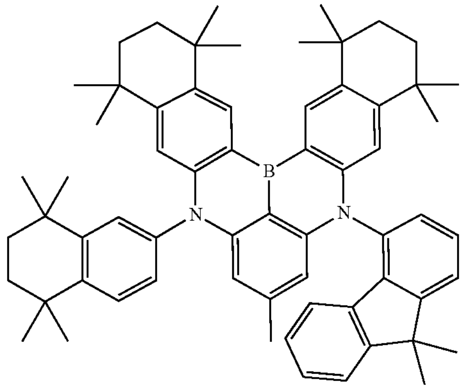

-continued
Compound 41
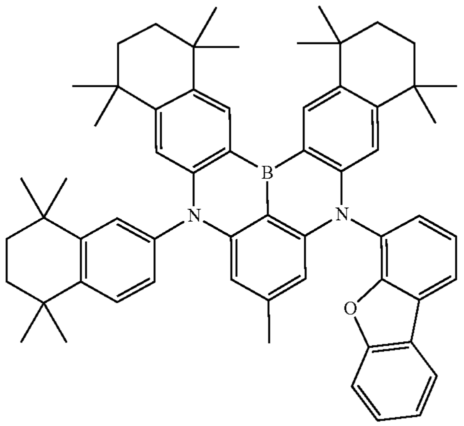
Compound 42
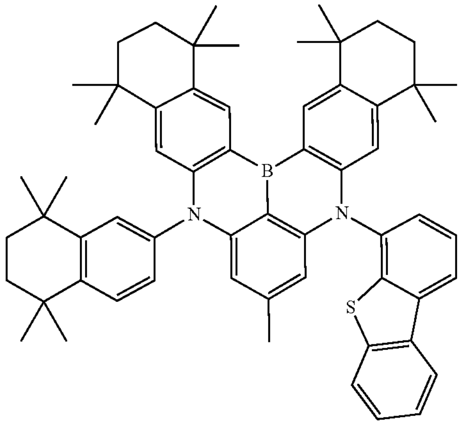
Compound 43
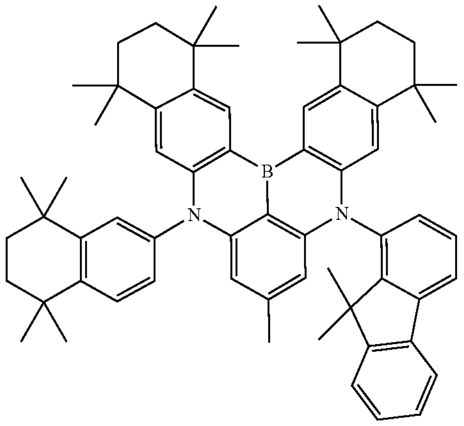
-continued
Compound 44
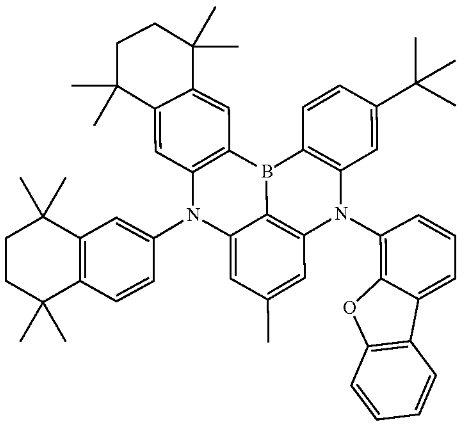
Compound 45
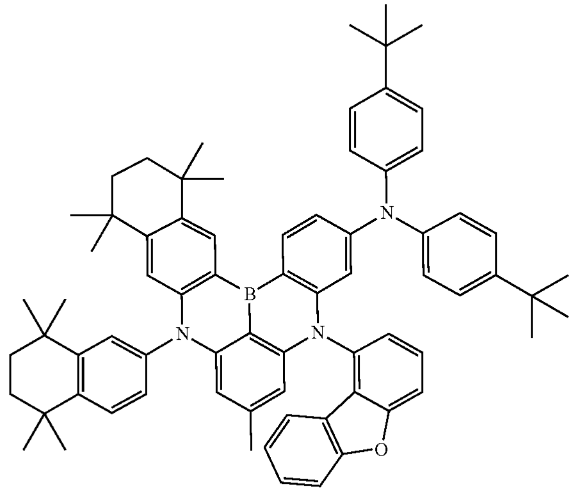
Compound 46
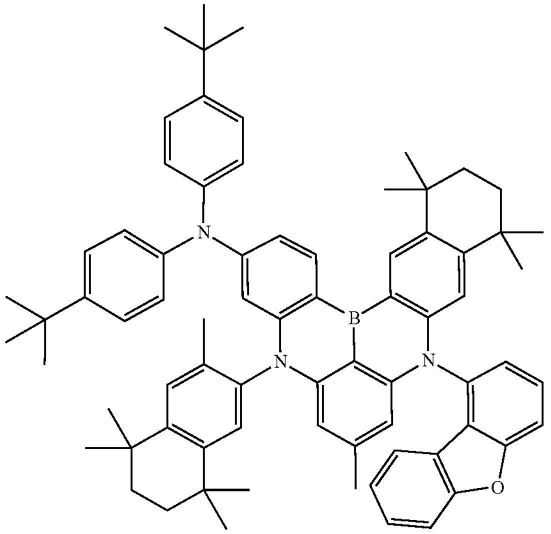

-continued
Compound 47
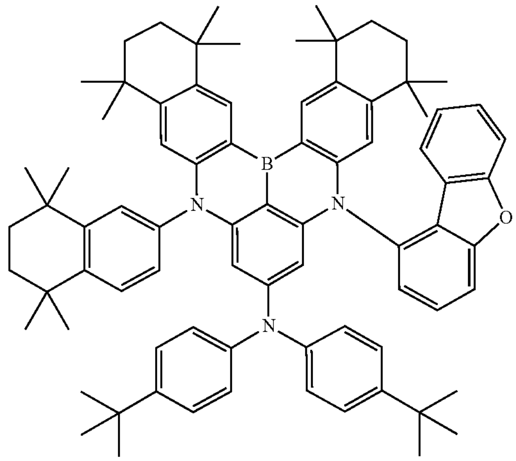
Compound 48
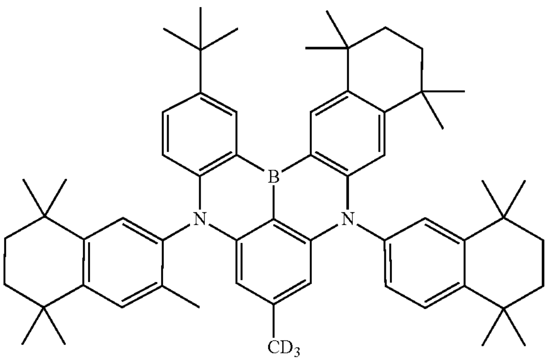
Compound 49
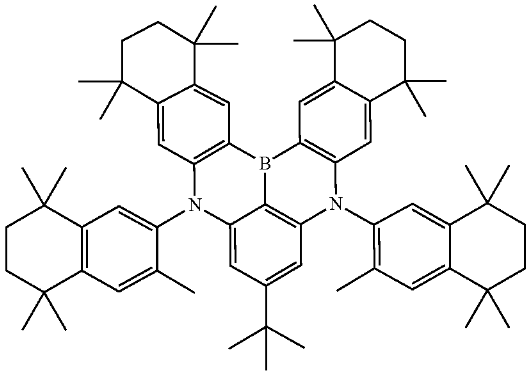
-continued
Compound 50
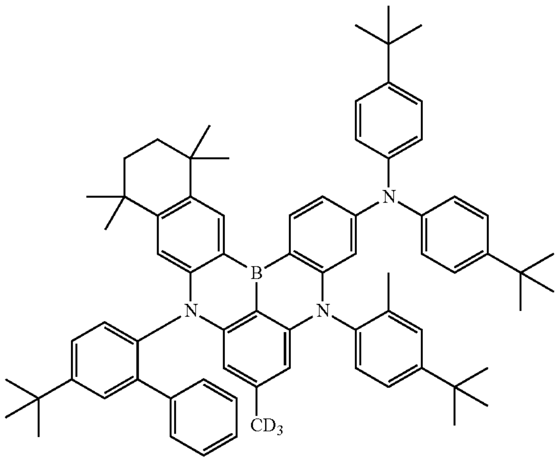
Compound 51
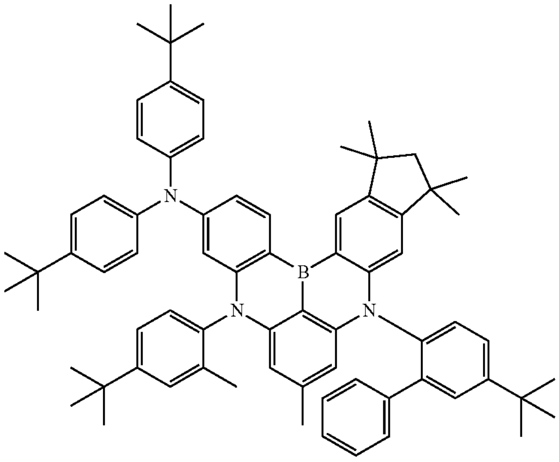
Compound 52
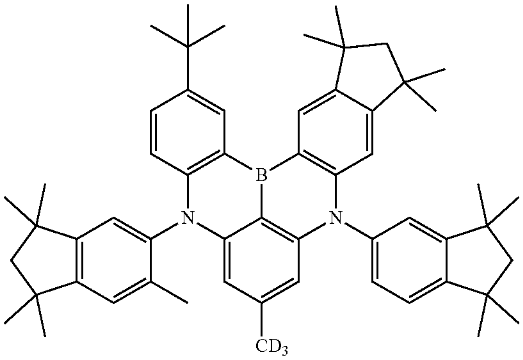

-continued
Compound 53
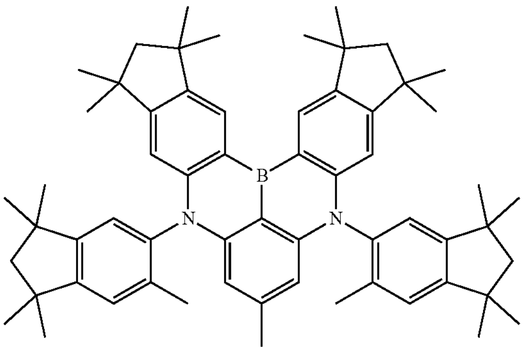
Compound 54
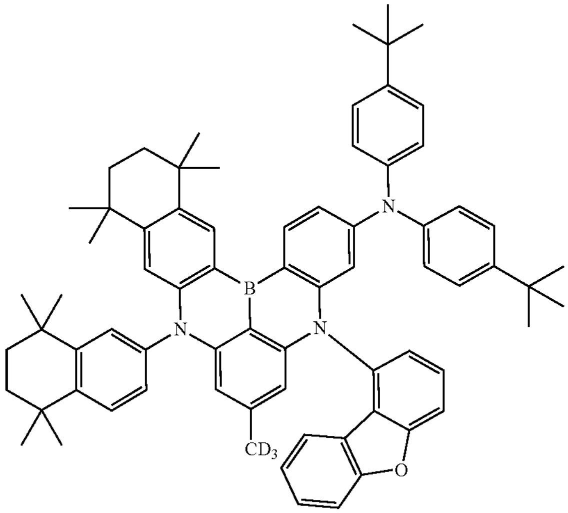
Compound 55
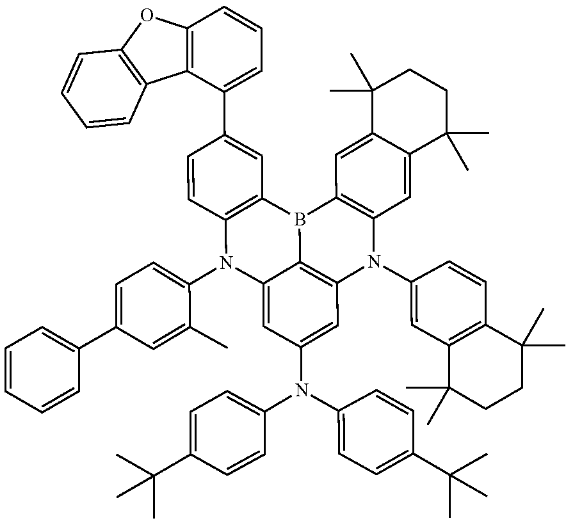
-continued
Compound 56
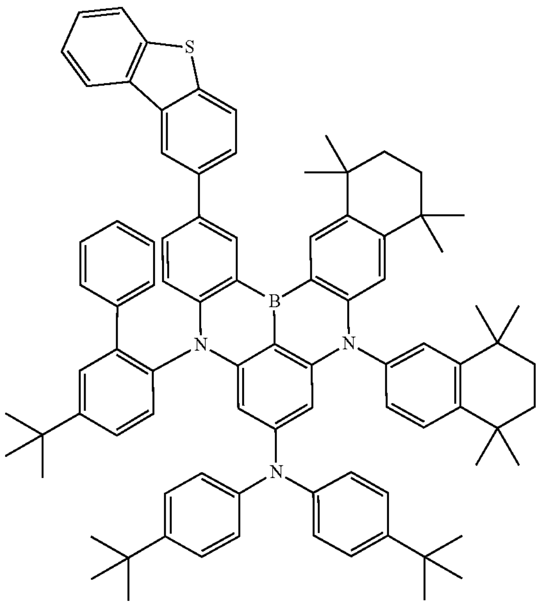
Compound 57
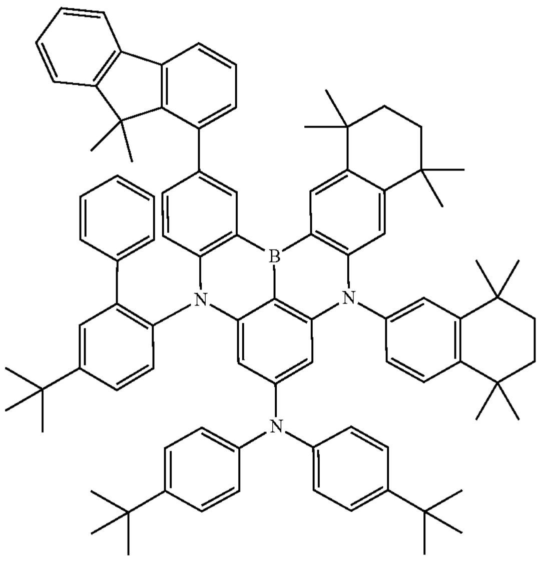

-continued
Compound 58
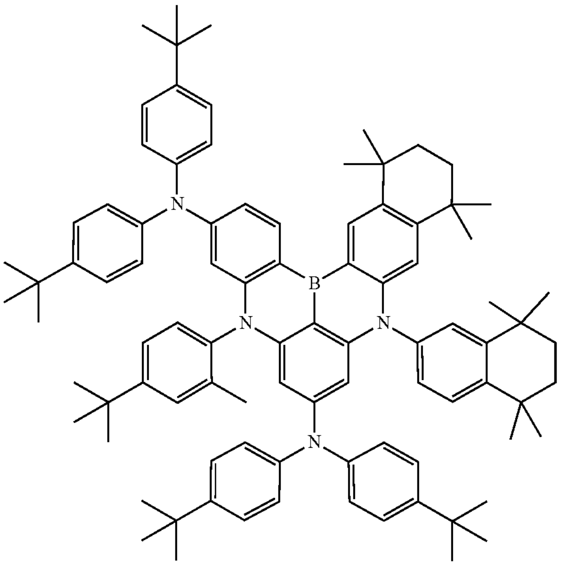
Compound 59
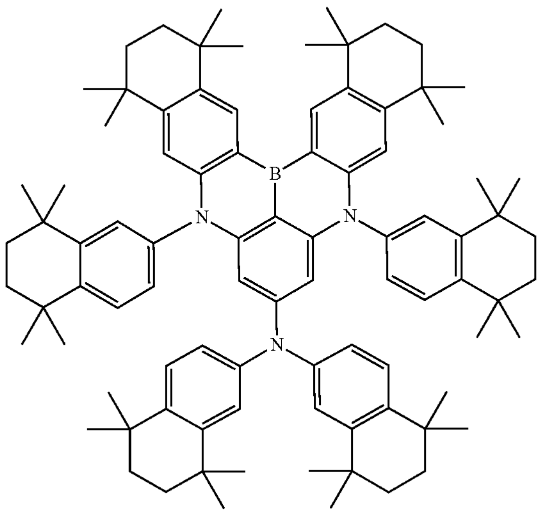
Compound 60
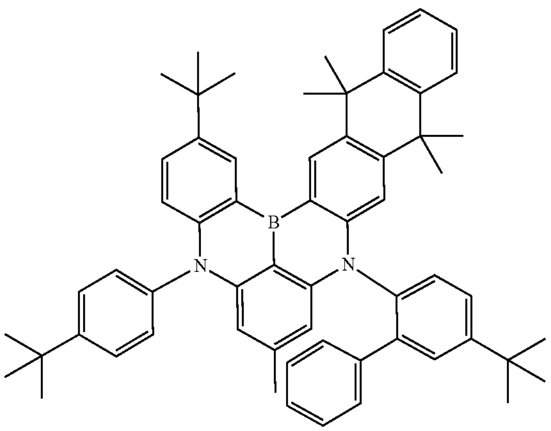
-continued
Compound 61
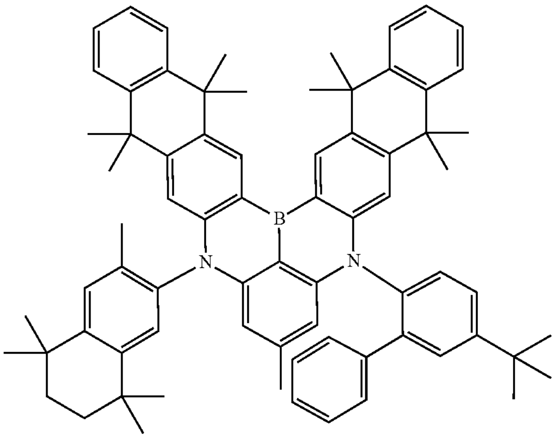
Compound 62
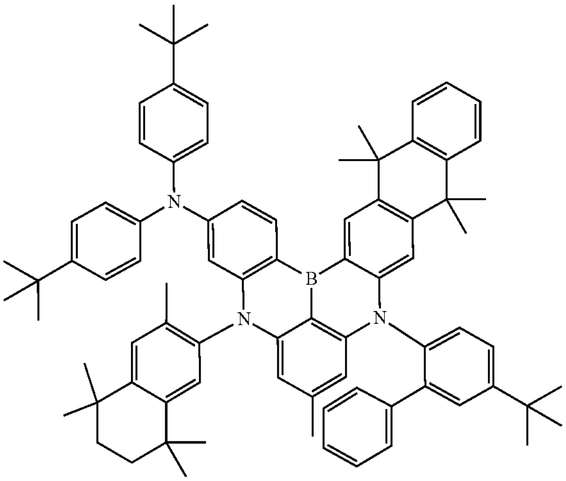
Compound 63
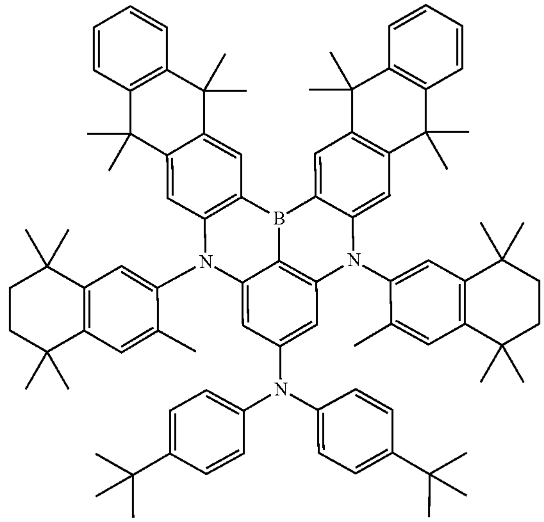

-continued
Compound 64
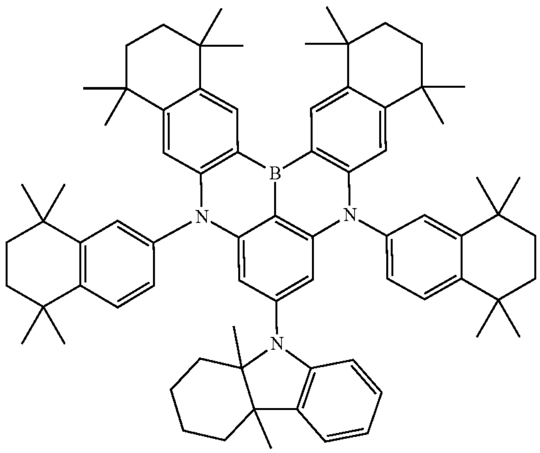
Compound 65
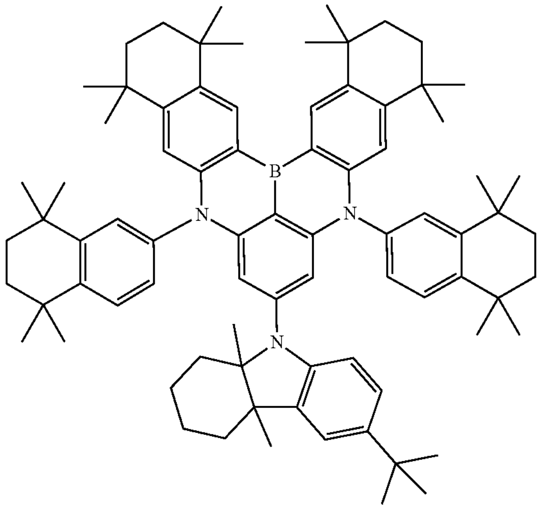
Compound 66
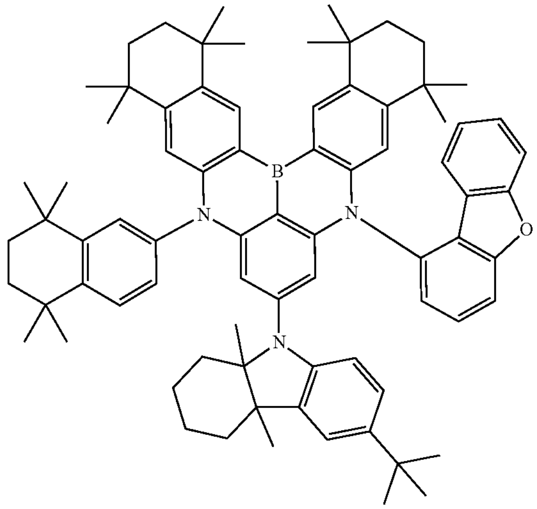
-continued
Compound 67
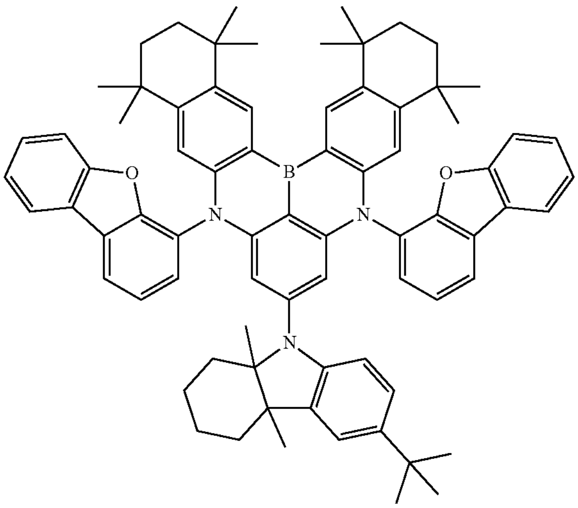
Compound 68
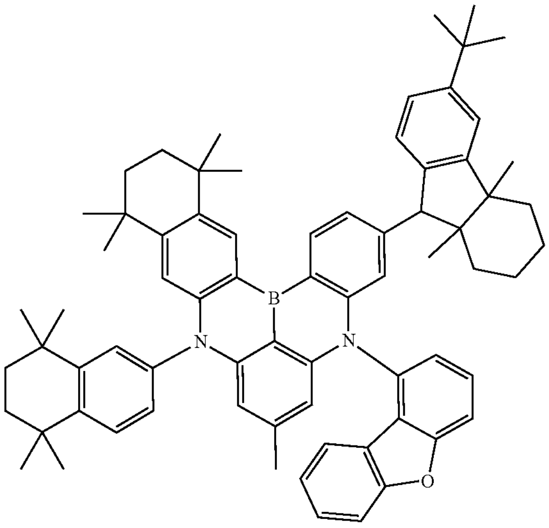
Comparative Examples 1-1 and 1-2
Devices were manufactured in the same manner as in Example 1-1, except that compounds described in the following Table 1 were used as the dopant of the light emitting layer in Example 1-1.

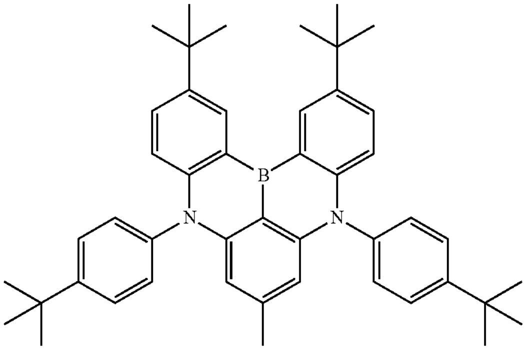

BD1

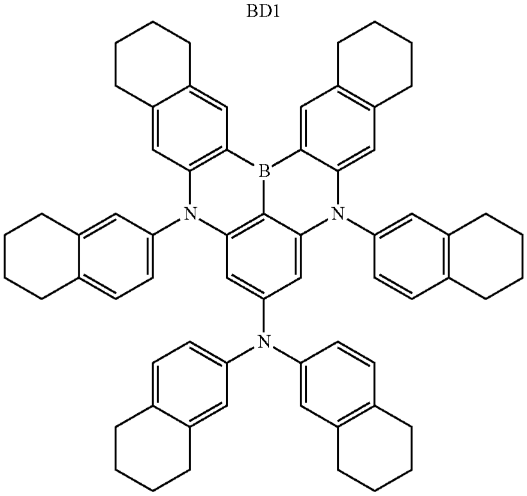

BD2

The efficiencies, service lives, and color coordinates (based on 1931 CIE color coordinate) of the organic light emitting devices manufactured in the Examples and the Comparative Examples at a current density of 10 mA/cm$^2$ were measured, and the results thereof are shown in the following Table 1.

TABLE 1

| | Dopant material | Efficiency (cd/A) | Color coordinate CIE (x) | Color coordinate CIE (y) | Service life T95 (hr) |
|---|---|---|---|---|---|
| Example 1-1 | Compound 1 | 9.12 | 0.15 | 0.05 | 271 |
| Example 1-2 | Compound 2 | 9.12 | 0.15 | 0.05 | 272 |
| Example 1-3 | Compound 3 | 9.24 | 0.14 | 0.05 | 283 |
| Example 1-4 | Compound 4 | 9.28 | 0.15 | 0.05 | 285 |
| Example 1-5 | Compound 5 | 9.29 | 0.15 | 0.05 | 282 |
| Example 1-6 | Compound 6 | 9.29 | 0.15 | 0.05 | 284 |
| Example 1-8 | Compound 8 | 9.14 | 0.14 | 0.05 | 273 |
| Example 1-9 | Compound 9 | 9.26 | 0.14 | 0.05 | 284 |
| Example 1-10 | Compound 10 | 9.45 | 0.15 | 0.06 | 291 |
| Example 1-11 | Compound 11 | 9.44 | 0.15 | 0.06 | 292 |
| Example 1-12 | Compound 12 | 9.45 | 0.15 | 0.06 | 289 |
| Example 1-13 | Compound 13 | 9.45 | 0.15 | 0.05 | 291 |
| Example 1-14 | Compound 14 | 9.4 | 0.15 | 0.05 | 292 |
| Example 1-15 | Compound 15 | 9.77 | 0.14 | 0.05 | 294 |
| Example 1-16 | Compound 16 | 9.77 | 0.14 | 0.05 | 292 |
| Example 1-17 | Compound 17 | 9.15 | 0.15 | 0.06 | 274 |
| Example 1-18 | Compound 18 | 9.15 | 0.15 | 0.06 | 272 |
| Example 1-19 | Compound 19 | 9.16 | 0.15 | 0.06 | 273 |
| Example 1-20 | Compound 20 | 9.15 | 0.15 | 0.06 | 275 |
| Example 1-21 | Compound 21 | 9.15 | 0.15 | 0.06 | 276 |
| Example 1-22 | Compound 22 | 9.29 | 0.15 | 0.06 | 283 |

TABLE 1-continued

| | Dopant material | Efficiency (cd/A) | Color coordinate CIE (x) | Color coordinate CIE (y) | Service life T95 (hr) |
|---|---|---|---|---|---|
| Example 1-23 | Compound 23 | 9.51 | 0.15 | 0.06 | 289 |
| Example 1-25 | Compound 25 | 9.48 | 0.15 | 0.06 | 291 |
| Example 1-26 | Compound 26 | 9.19 | 0.14 | 0.05 | 277 |
| Example 1-27 | Compound 27 | 9.2 | 0.14 | 0.05 | 280 |
| Example 1-29 | Compound 29 | 9.34 | 0.14 | 0.05 | 281 |
| Example 1-30 | Compound 30 | 9.33 | 0.14 | 0.05 | 283 |
| Example 1-31 | Compound 31 | 9.31 | 0.15 | 0.06 | 281 |
| Example 1-32 | Compound 32 | 9.33 | 0.14 | 0.05 | 280 |
| Example 1-33 | Compound 33 | 9.33 | 0.14 | 0.05 | 281 |
| Example 1-34 | Compound 34 | 9.32 | 0.14 | 0.05 | 280 |
| Example 1-35 | Compound 35 | 9.48 | 0.15 | 0.05 | 290 |
| Example 1-36 | Compound 36 | 9.81 | 0.15 | 0.05 | 290 |
| Example 1-37 | Compound 37 | 9.83 | 0.15 | 0.05 | 289 |
| Example 1-38 | Compound 38 | 9.5 | 0.15 | 0.06 | 285 |
| Example 1-39 | Compound 39 | 9.49 | 0.15 | 0.06 | 287 |
| Example 1-40 | Compound 40 | 9.5 | 0.15 | 0.06 | 285 |
| Example 1-41 | Compound 41 | 9.5 | 0.15 | 0.06 | 286 |
| Example 1-42 | Compound 42 | 9.5 | 0.15 | 0.06 | 282 |
| Example 1-43 | Compound 43 | 9.5 | 0.15 | 0.06 | 284 |
| Example 1-44 | Compound 44 | 9.31 | 0.15 | 0.06 | 280 |
| Example 1-45 | Compound 45 | 9.29 | 0.15 | 0.05 | 281 |
| Example 1-46 | Compound 46 | 9.3 | 0.15 | 0.05 | 280 |
| Example 1-47 | Compound 47 | 9.46 | 0.15 | 0.05 | 288 |
| Example 1-48 | Compound 48 | 9.45 | 0.15 | 0.05 | 286 |
| Example 1-49 | Compound 49 | 9.78 | 0.14 | 0.05 | 290 |
| Example 1-50 | Compound 50 | 9.16 | 0.15 | 0.06 | 274 |
| Example 1-51 | Compound 51 | 9.14 | 0.15 | 0.06 | 275 |
| Example 1-52 | Compound 52 | 9.43 | 0.15 | 0.05 | 284 |
| Example 1-53 | Compound 53 | 9.75 | 0.14 | 0.05 | 293 |
| Example 1-54 | Compound 54 | 9.3 | 0.15 | 0.05 | 283 |
| Example 1-55 | Compound 55 | 9.31 | 0.15 | 0.06 | 285 |
| Example 1-56 | Compound 56 | 9.3 | 0.15 | 0.06 | 284 |
| Example 1-57 | Compound 57 | 9.31 | 0.15 | 0.06 | 284 |
| Example 1-58 | Compound 58 | 9.33 | 0.15 | 0.05 | 283 |
| Example 1-59 | Compound 59 | 9.89 | 0.15 | 0.05 | 290 |
| Example 1-60 | Compound 60 | 9.15 | 0.15 | 0.05 | 274 |
| Example 1-61 | Compound 61 | 9.47 | 0.15 | 0.06 | 290 |
| Example 1-62 | Compound 62 | 9.31 | 0.15 | 0.06 | 285 |
| Example 1-63 | Compound 63 | 9.86 | 0.15 | 0.05 | 289 |
| Example 1-64 | Compound 64 | 9.85 | 0.15 | 0.05 | 295 |
| Example 1-65 | Compound 65 | 9.88 | 0.15 | 0.05 | 294 |
| Example 1-66 | Compound 66 | 9.48 | 0.15 | 0.05 | 291 |
| Example 1-67 | Compound 67 | 9.39 | 0.14 | 0.05 | 290 |
| Example 1-68 | Compound 68 | 9.34 | 0.15 | 0.05 | 288 |
| Comparative Example 1-1 | Compound BD1 | 7.54 | 0.15 | 0.05 | 240 |
| Comparative Example 1-2 | Compound BD2 | 7.83 | 0.15 | 0.05 | 245 |

As can be confirmed in Table 1, it can be seen that when the compound of Formula 100 is used as a dopant of a light emitting layer of an organic light emitting device, the efficiency and service life of the device are increased.

<Experimental Example 2> MD Calculation (Calculation of Distance Between Molecules in Host-Dopant System)

Example 2-1

A system in which Compound 1 (dopant) and Compound BH (host) were included at a weight ratio of 5:95 was implemented. Specifically, the molecules, the temperature, and the simulation time were set to 300 (a ratio of 95% of Host and 5% of Dopant), 300 K, and 3 ns, respectively, using an OPLS3e force field, and the molecular dynamics were calculated through NVT and NPT calculations, thereby implementing the environment of the doped device computationally and chemically.

Examples 2-2 to 2-5
Molecular systems were calculated in the same manner as in Example 2-1, except that dopants described in the following Table 2 were used instead of Compound 1 in Example 2-1.
Compound 1
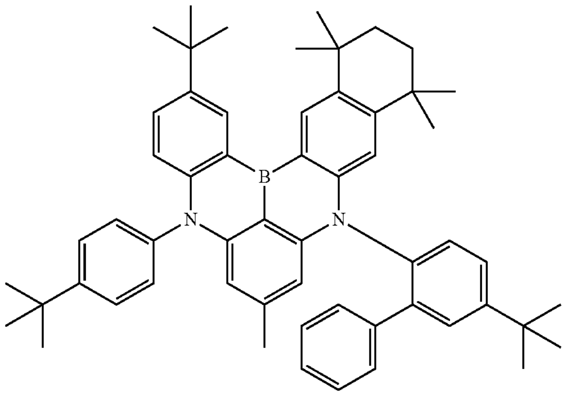
Compound 10
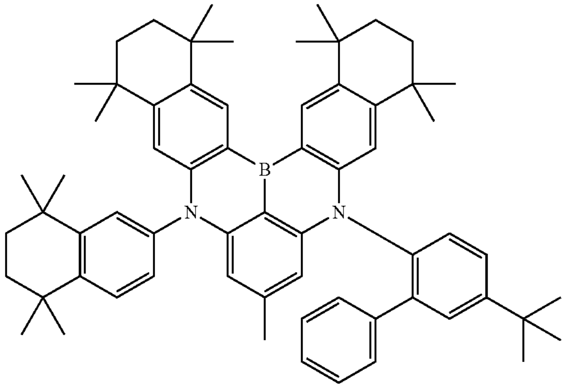
Compound 59
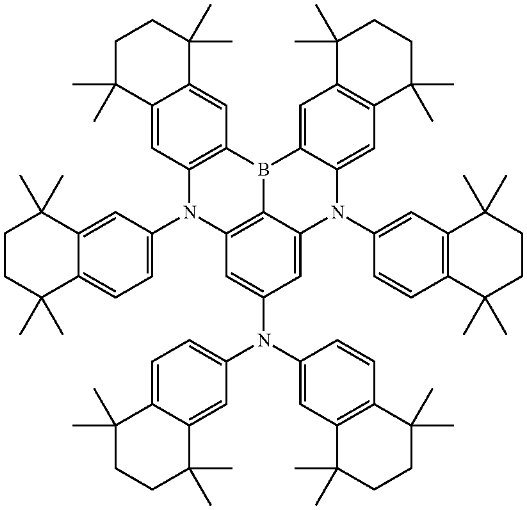

-continued

Compound 71

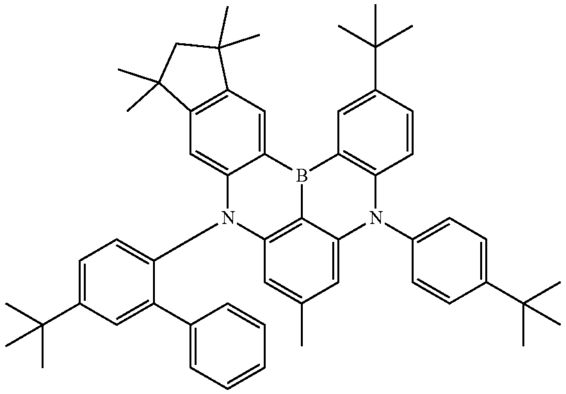

Compound 72

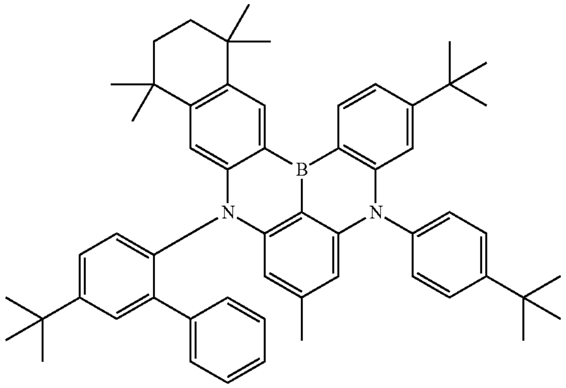

Comparative Examples 2-1 and 2-2

Molecular systems were calculated in the same manner as in Example 2-1, except that dopants described in the following Table 2 were used instead of Compound 1 in Example 1.

BD1

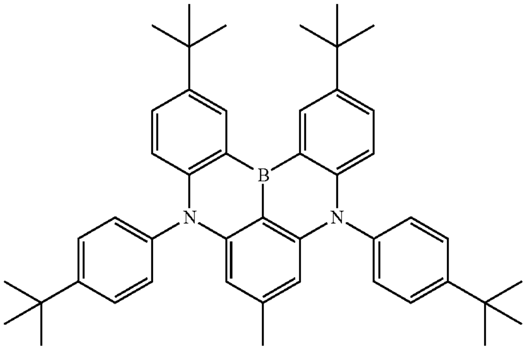

-continued

BD2

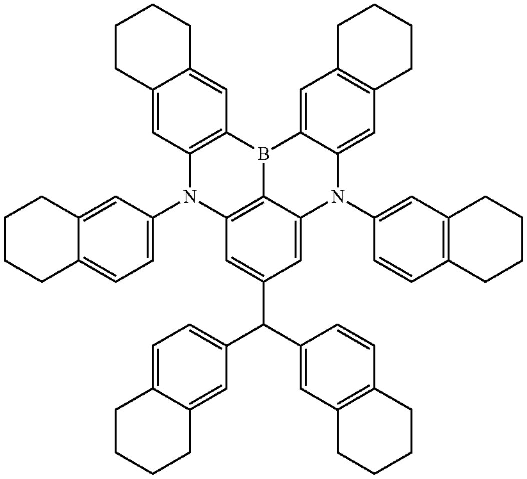

The implemented molecular models are illustrated in FIGS. 3 to 9. FIGS. 3 to 7 illustrate the systems of Examples 2-1 to 2-5, respectively, and FIGS. 8 and 9 illustrate the systems of Comparative Examples 2-1 and 2-2. The values obtained by calculating the total density and the average distance between different molecules in this case are shown in the following Table 2.

TABLE 2

| | Dopant | Overall density ($g/cm^3$) | Average intermolecular distance Radial (Å) |
|---|---|---|---|
| Example 2-1 | Compound 1 | 1.093 | 15.20 |
| Example 2-2 | Compound 10 | 1.090 | 15.47 |
| Example 2-3 | Compound 59 | 1.07 | 15.77 |
| Example 2-4 | Compound 71 | 1.086 | 15.24 |
| Example 2-5 | Compound 72 | 1.092 | 15.32 |
| Comparative Example 2-1 | Compound BD1 | 1.12 | 14.7 |
| Comparative Example 2-2 | Compound BD2 | 1.094 | 15.1 |

Referring to Table 2 and FIGS. 3 to 9, it can be confirmed that the distance between the host and the dopant is further increased as the aliphatic hydrocarbon ring is substituted with a methyl group, and the overall density is reduced. When materials are densely packed in one space, intermolecular Dexter transfer occurs, resulting in a reduction in efficiency. As in Examples 2-1 to 2-5 of the present invention, when an aliphatic hydrocarbon ring substituted with a methyl group is included, the efficiency of the device is increased and the injection of unnecessary electrons and holes is reduced while the intermolecular distance is increased and the packing density is reduced, so that the service life of the device is also improved.

The invention claimed is:

1. A polycyclic compound of Formula 100:

Formula 100

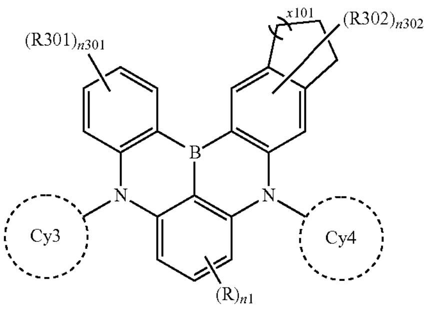

wherein in Formula 100:

R1 and R301 are the same as or different from each other, and are each independently deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

x101 is 1 or 2;

Cy3 and Cy4 are the same as or different from each other, and are each independently one selected from the group consisting of a substituted or unsubstituted aromatic hydrocarbon ring, a substituted or unsubstituted aliphatic hydrocarbon ring, and a substituted or unsubstituted aromatic hetero ring, or a ring in which two or more rings selected from the group are fused;

R302 is hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or is bonded to an adjacent substituent to form a substituted or unsubstituted ring;

n1 is an integer from 1 to 3, n301 is an integer from 1 to 4, and n302 is an integer from 0 to 10, and when n1, n301, and n302 are each 2 or higher, substituents in the parenthesis are the same as or different from each other;

at least one of Cy3 and Cy4 is one selected from the following Formulae A-1 and A-3:

[Formula A-1]

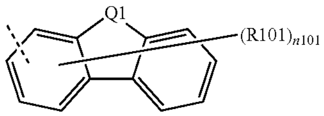

[Formula A-3]

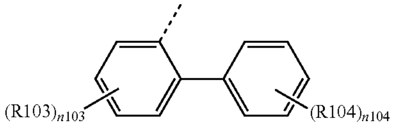

wherein in Formulae A-1 and A-3:

a dotted line is a position which is connected to Formula 100;

Q1 is O and R101 is a substituted alkyl group, a substituted or unsubstituted alkoxy group, a substituted or unsubstituted silyl group, a substituted or unsubstituted heterocyclic group, or a substituted or unsubstituted amine group, or are bonded to an adjacent substituent to form a substituted or unsubstituted ring, or Q1 is S or C(R118) (R119) and R101 is hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R101, R118, and R119 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R103 and R104 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring, wherein R103 and R104 satisfy at least one of the following two conditions:

1) at least one of R103 is the structure

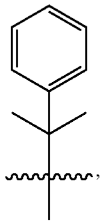

or 2) at least one of R104 is the structure

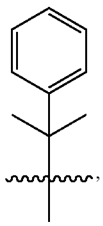

or a phenyl group substituted with tert-butyl;

n101 is an integer from 1 to 7, n103 is an integer from 1 to 4, and n104 is an integer from 1 to 5, and when n101, n103, and n104 are each 2 or higher, substituents in the parentheses are the same as or different from each other;

one or more of the aliphatic rings included in Formula 100 are selected from the following structures:

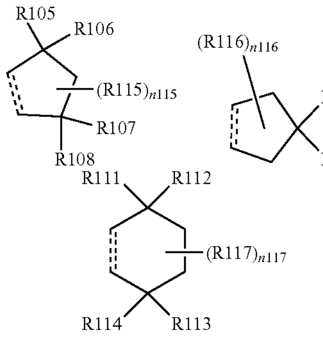

wherein in the structures:

a dotted double line is a position where substituents are fused;

R105 to R114 are the same as or different from each other, and are each independently a substituted or unsubstituted alkyl group;

R115 to R117 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

n115 is an integer from 0 to 2, and n116 and n117 are each an integer from 0 to 4, and when n115 to n117 are each 2 or higher, substituents in the parentheses are the same as or different from each other.

2. The polycyclic compound of claim 1, wherein Formula 100 is any one of the following Formulae 1 to 3:

Formula 1

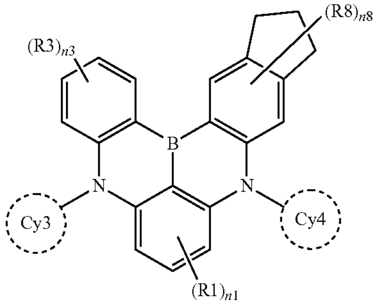

Formula 2

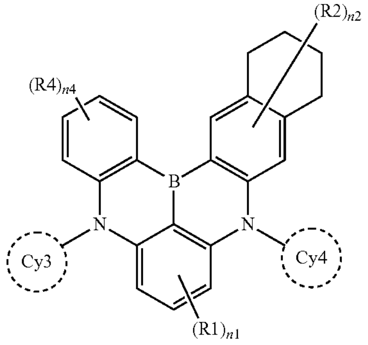

Formula 3

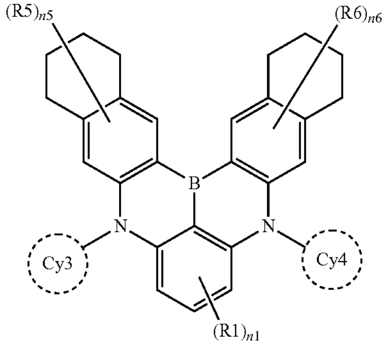

wherein in Formulae 1 to 3:

R1, Cy3, Cy4, and n1 are the same as those defined in Formula 100;

R3 and R4 are the same as or different from each other, and are each independently deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R2, R5, R6, and R8 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

n3 and n4 are each an integer from 1 to 4, n2, n5, and n6 are each an integer from 0 to 10, and n8 is an integer from 0 to 8, and when n2 to n6 and n8 are each 2 or higher, substituents in the parentheses are the same as or different from each other.

3. The polycyclic compound of claim 1, wherein Cy3 and Cy4 are the same as or different from each other, and are each independently selected from the following Groups A-11 to A-14, and at least one of Cy3 and Cy4 is selected from the following Group A-11:

Group A-11

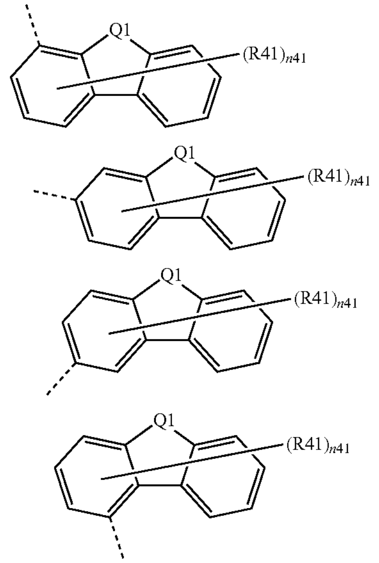

Group A-12

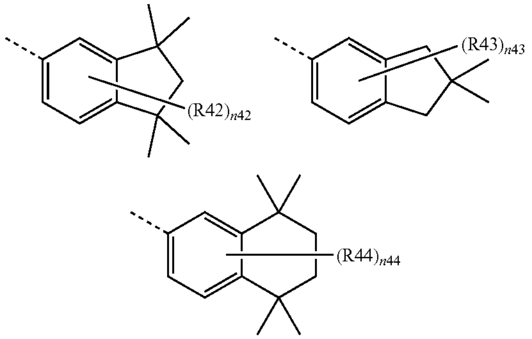

Group A-13

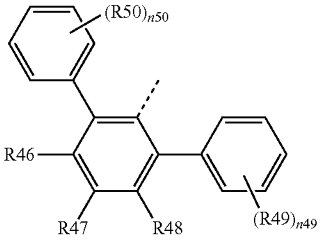

-continued

Group A-14

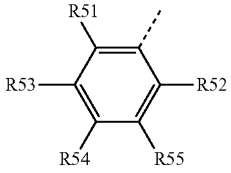

wherein in Groups A-11 to A-14:

a dotted line is a position which is connected to Formula 100;

Q1 is O and R41 is a substituted alkyl group, a substituted or unsubstituted alkoxy group, a substituted or unsubstituted silyl group, a substituted or unsubstituted heterocyclic group, or a substituted or unsubstituted amine group, or are bonded to an adjacent substituent to form a substituted or unsubstituted ring, or Q1 is S or C(R118) (R119) and R41 is hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R42 to R44, R46 to R50, R53 to R55, R118, and R119 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R45, R51, and R52 are the same as or different from each other, and are each independently hydrogen, deuterium, or a substituted or unsubstituted alkyl group;

n41, n43, and n44 are each an integer from 0 to 7, and n42, n49, and n50 are each an integer from 0 to 5, and when n41 to n44, n49, and n50 are each 2 or higher, substituents in the parentheses are the same as or different from each other.

4. The polycyclic compound of claim 1, wherein Formula 100 is any one of the following Formulae 101 to 109:

Formula 101

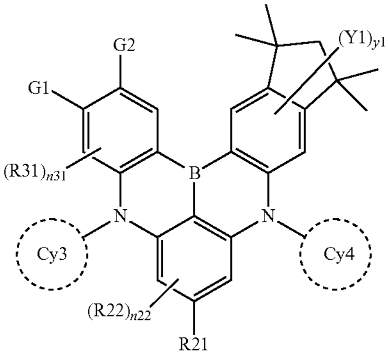

-continued
Formula 102
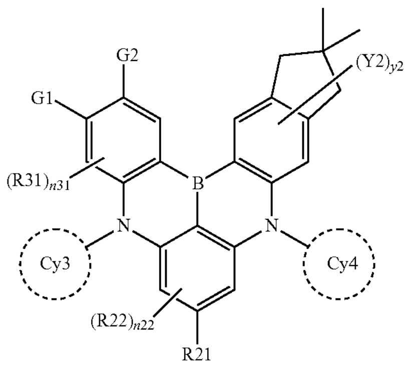
Formula 103
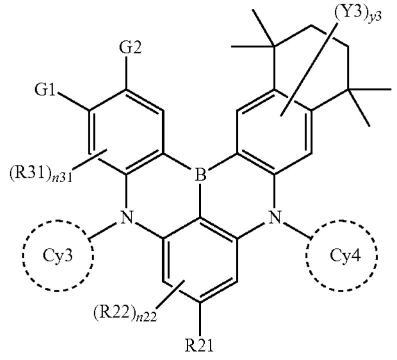
Formula 104
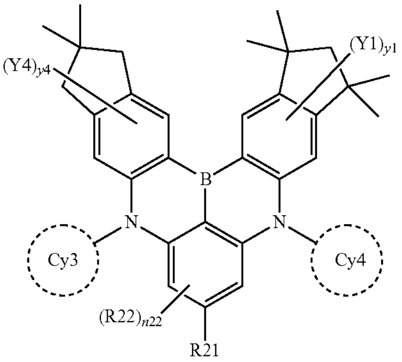
Formula 105
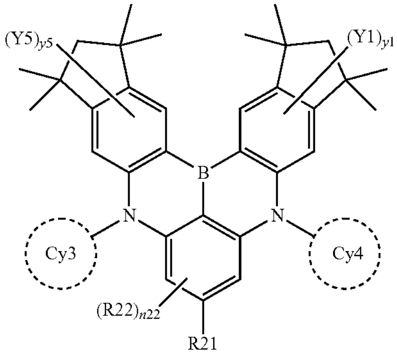
-continued
Formula 106
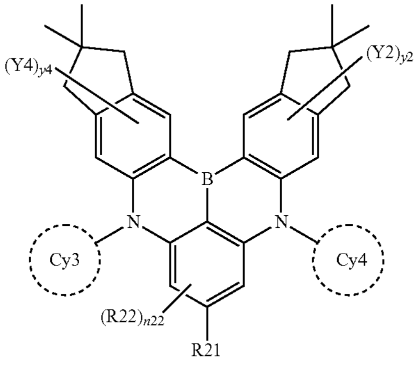
Formula 107
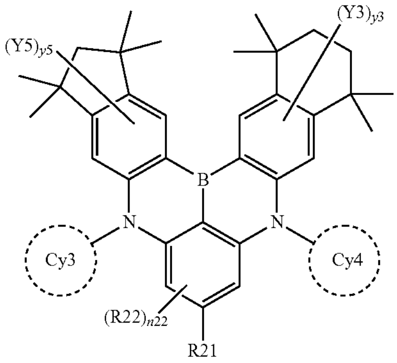
Formula 108
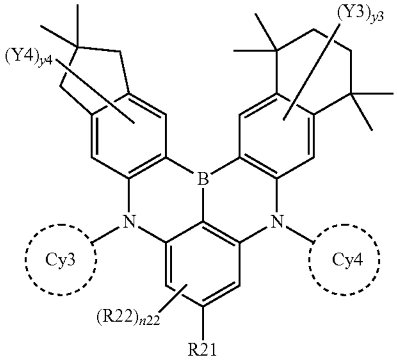
Formula 109
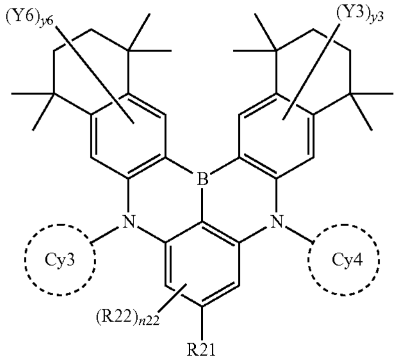
wherein in Formulae 101 to 109:
Cy3 and Cy4 are the same as those defined in Formula 100;
R22, R31, G1, G2, and Y1 to Y6 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R21 is a substituted or unsubstituted alkyl group, a substituted or unsubstituted aryl group, a substituted or unsubstituted heterocyclic group, or a substituted or unsubstituted amine group;

at least one of G1 and G2 is a substituted or unsubstituted alkyl group, a substituted or unsubstituted aryl group, a substituted or unsubstituted heterocyclic group, or a substituted or unsubstituted amine group;

n22 and n31 are each an integer from 0 to 2, y1 and y5 are each an integer from 0 to 4, and y2 to y4 and y6 are each an integer from 0 to 6, and when n22, n31, and y1 to y6 are each 2 or higher, substituents in the parentheses are the same as or different from each other.

5. The polycyclic compound of claim 1, wherein Formula 100 is any one of the following Formulae 201 to 209:

Formula 201

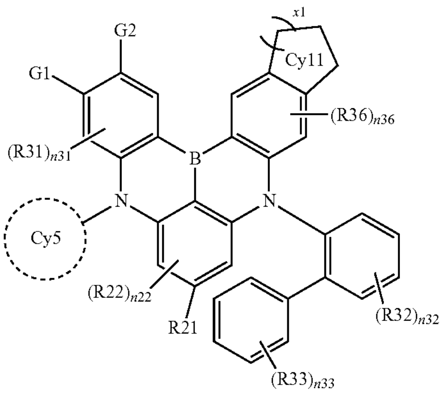

Formula 202

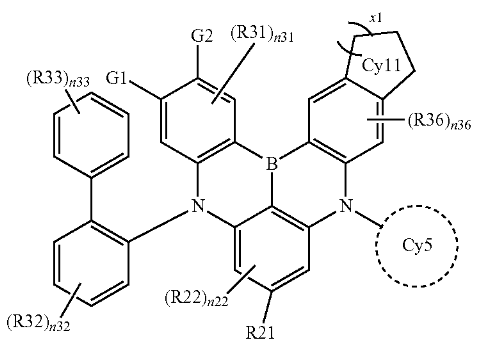

-continued

Formula 203

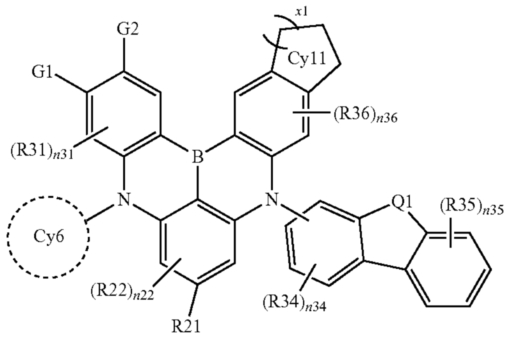

Formula 204

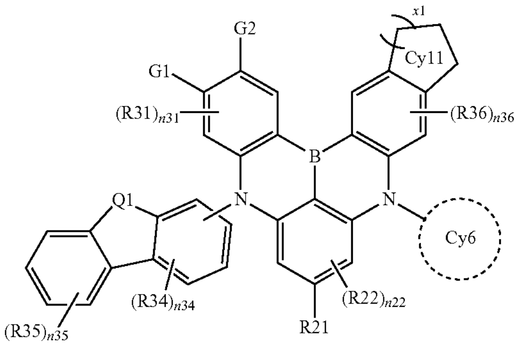

Formula 205

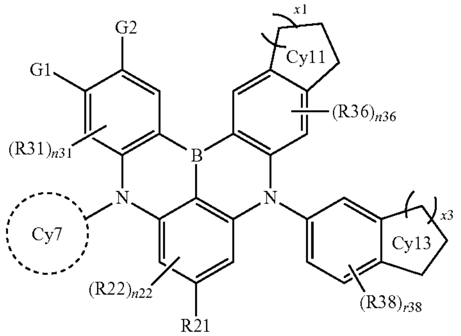

Formula 206

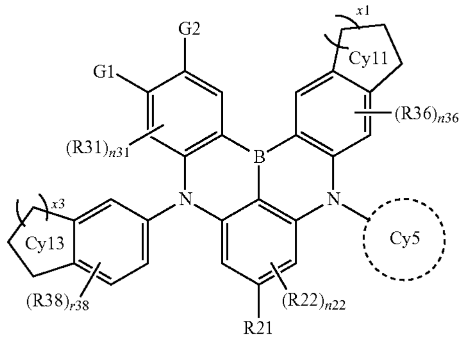

-continued

Formula 207

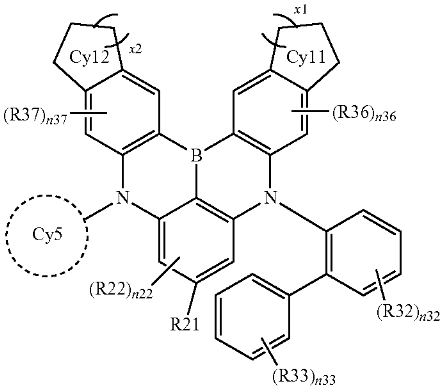

Formula 208

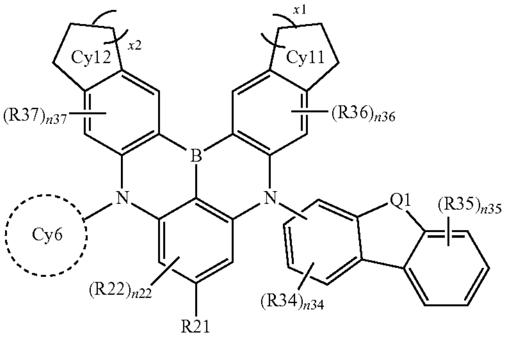

Formula 209

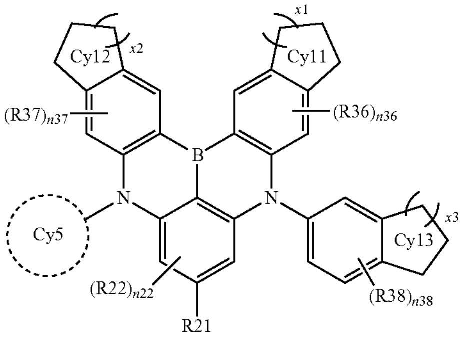

wherein in Formulae 201 to 209:

Q1 is the same as that defined in Formula 100;

Cy5 and Cy6 are the same as or different from each other, and are each independently one selected from the group consisting of a substituted or unsubstituted aromatic hydrocarbon ring, a substituted or unsubstituted aliphatic hydrocarbon ring, and a substituted or unsubstituted aromatic hetero ring, or a ring in which two or more rings selected from the group are fused;

Cy7 is one selected from the following Formulae A-1 and A-3:

[Formula A-1]

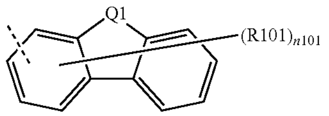

-continued

[Formula A-3]

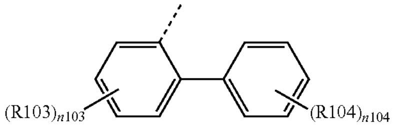

wherein in Formulae A-1 and A-3:

a dotted line is a position which is connected to Formula 100;

Q1 is O, S, or C(R118) (R119);

R101 R118, and R119 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R103 and R104 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring, wherein R103 and R104 satisfy at least one of the following two conditions:

1) at least one of R103 is the structure

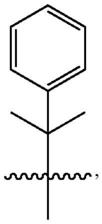

or 2) at least one of R104 is the structure

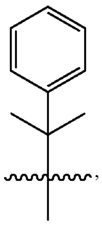

or a phenyl group substituted with tert-butyl;

n101 is an integer from 0 to 7, n103 is an integer from 1 to 4, and n104 is an integer from 1 to 5, and when n101, 103, and n104 are each 2 or higher, substituents in the parentheses are the same as or different from each other;

R22, R31 to R38, G1, and G2 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring;

R32 and R33 are the same as or different from each other, and are each independently hydrogen, deuterium, a nitrile group, a halogen group, a substituted or unsubstituted alkyl group, a substituted or unsubstituted alkoxy group, a substituted or unsubstituted silyl group, a substituted or unsubstituted aryl group, a substituted or unsubstituted heterocyclic group, or a substituted or unsubstituted amine group, or are bonded to an adjacent substituent to form a substituted or unsubstituted ring, wherein R32 and R33 satisfy at least one of the following two conditions:

1) at least one of R32 is the structure

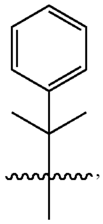

or 2) at least one of R33 is the structure

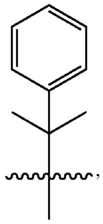

or a phenyl group substituted with tert-butyl;

R21 is a substituted or unsubstituted alkyl group, a substituted or unsubstituted aryl group, a substituted or unsubstituted heterocyclic group, or a substituted or unsubstituted amine group;

at least one of G1 and G2 is a substituted or unsubstituted alkyl group, a substituted or unsubstituted aryl group, a substituted or unsubstituted heterocyclic group, or a substituted or unsubstituted amine group, x1 to x3 are each 1 or 2;

n22, n31, n36, and n37 are each an integer from 0 to 2, n32 is an integer from 1 to 4, n35 is an integer from 0 to 4, n33 is an integer from 1 to 5, and n34 and r38 are each an integer from 0 to 3, and when n22, n31 to n37 and r38 are each 2 or higher, substituents in the parentheses are the same as or different from each other;

Cy11 to Cy13 are the same as or different from each other, and are each independently selected from the following structures:

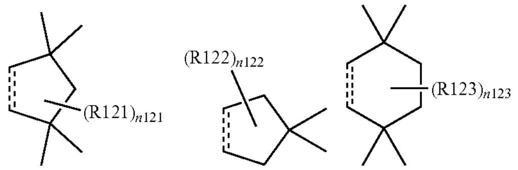

wherein in the structures:

a dotted double line is a position where substituents are fused;

R121 to R123 are the same as or different from each other, and are each independently hydrogen, deuterium, a substituted or unsubstituted alkyl group, a substituted or unsubstituted aryl group, or a substituted or unsubstituted heterocyclic group, or are bonded to an adjacent substituent to form a substituted or unsubstituted ring; and n121 is an integer from 0 to 2, n122 and n123 are each an integer from 0 to 4, and when n121 to n123 are each 2 or more, substituents in the parentheses are the same as or different from each other.

6. The polycyclic compound of claim 1, wherein R1 is an alkyl group having 1 to 10 carbon atoms, which is unsubstituted or substituted with deuterium; an arylamine group having 6 to 60 carbon atoms, which is unsubstituted or substituted with one or more substituents selected from the group consisting of deuterium and an alkyl group having 1 to 10 carbon atoms, or a substituent selected from the same group to which two or more substituents selected from the same group are linked together; an arylheteroarylamine group having 6 to 60 carbon atoms, which is unsubstituted or substituted with one or more substituents selected from the group consisting of deuterium and an alkyl group having 1 to 10 carbon atoms, or a substituent selected from the same group to which two or more substituents selected from the same group are linked together; or the following Formula Het1:

Formula Het 1

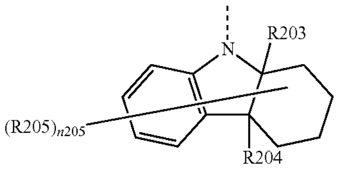

wherein in Formula Het1:

a dotted line is a position which is connected to Formula 100;

R203 to R205 are the same as or different from each other, and are each independently hydrogen; deuterium; an alkyl group having 1 to 10 carbon atoms, which is unsubstituted or substituted with deuterium; or an aryl group having 6 to 30 carbon atoms, which is unsubstituted or substituted with one or more substituents selected from the group consisting of deuterium and an alkyl group having 1 to 10 carbon atoms that is unsubstituted or substituted with two or more substituents selected from the group consisting of deuterium and an alkyl group having 1 to 10 carbon atoms; and n205 is an integer from 0 to 12, and when n205 is 2 or higher, the R205s are the same as or different from each other.

7. The polycyclic compound of claim 4, wherein any one of G1 and G2 is an alkyl group having 1 to 6 carbon atoms, which is unsubstituted or substituted with deuterium or an aryl group having 6 to 20 carbon atoms; an aryl group having 6 to 20 carbon atoms, which is unsubstituted or substituted with deuterium or an alkyl group having 1 to 6 carbon atoms; a heterocyclic group having 6 to 20 carbon atoms, which is unsubstituted or substituted with an alkyl group having 1 to 6 carbon atoms, an aryl group having 6 to 20 carbon atoms, or an alkylaryl group having 7 to 30 carbon atoms; or —N(R211) (R212), and the other is hydrogen or deuterium;

at least one of Cy3 and Cy4 is selected from Formulae A-1 and A-3, and the other is an aromatic hydrocarbon ring having 6 to 30 carbon atoms, which is unsubstituted or substituted with one or more substituents selected from the group consisting of deuterium, an alkyl group having 1 to 10 carbon atoms, and an aryl group having 6 to 30 carbon atoms or a substituent selected from the same group to which two or more substituents selected from the same group are linked together;

R21 is an alkyl group having 1 to 10 carbon atoms, which is unsubstituted or substituted with deuterium; an N-containing heterocyclic group having 2 to 30 carbon atoms, which is unsubstituted or substituted with one or more substituents selected from the group consisting of deuterium, an alkyl group having 1 to 10 carbon atoms, and an aryl group having 6 to 30 carbon atoms, or a substituent selected from the same group to which two or more substituents selected from the same group are linked together; or —N(R211) (R212); and R211 and R212 are the same as or different from each other, and are each independently an aryl group having 6 to 20 carbon atoms, which is unsubstituted or substituted with deuterium or an alkyl group having 1 to 6 carbon atoms, and is unfused or fused with an aliphatic hydrocarbon ring having 5 or 6 carbon atoms; or a heterocyclic group having 6 to 20 carbon atoms, which is unsubstituted or substituted with deuterium or an alkyl group having 1 to 6 carbon atoms.

8. The polycyclic compound of claim 1, wherein Formula 100 is any one of the following compounds:

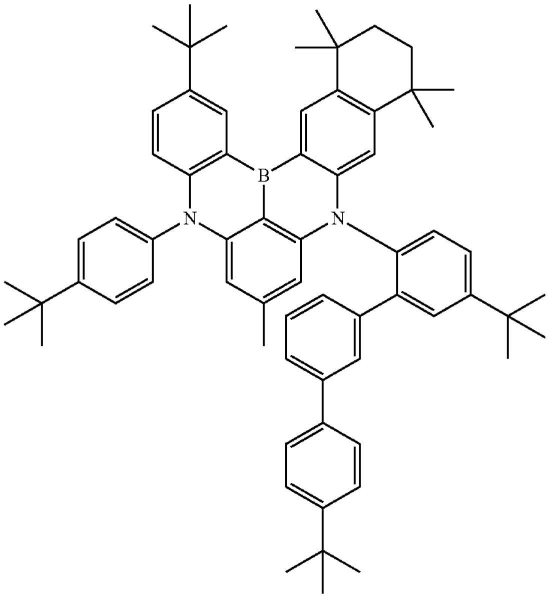

-continued

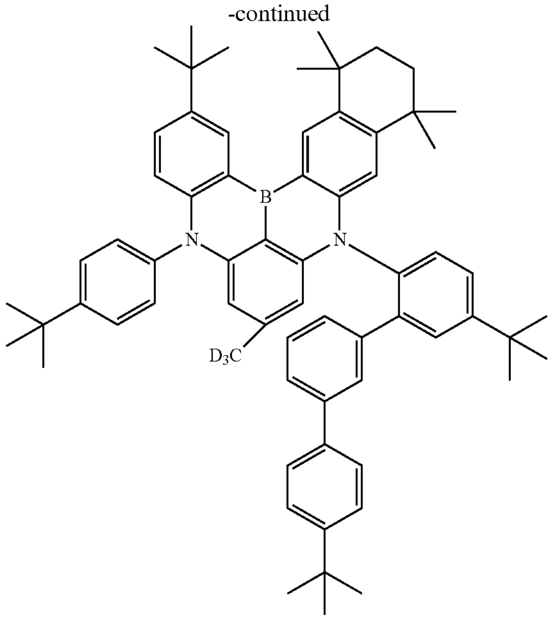

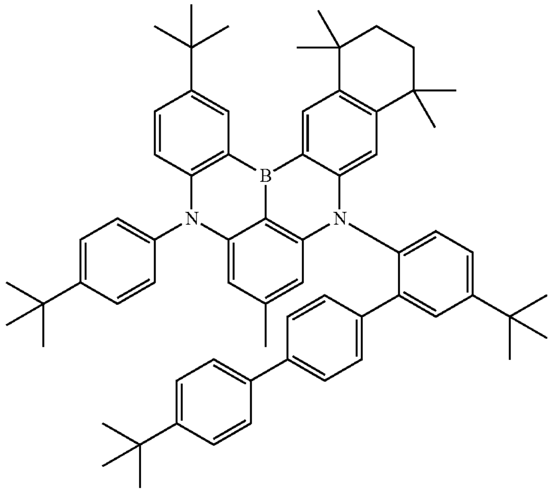

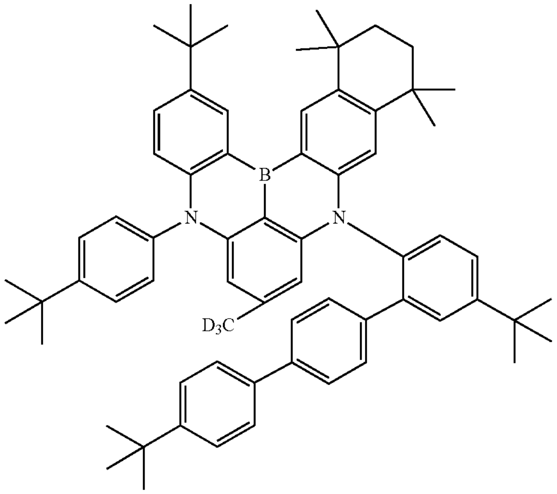

-continued
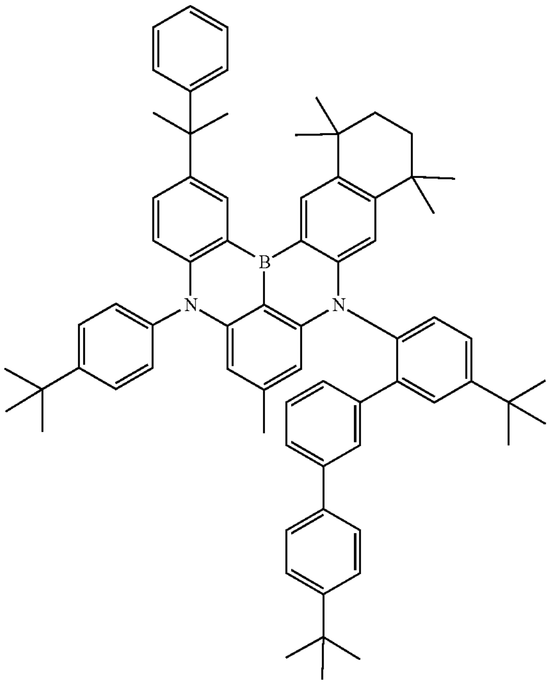
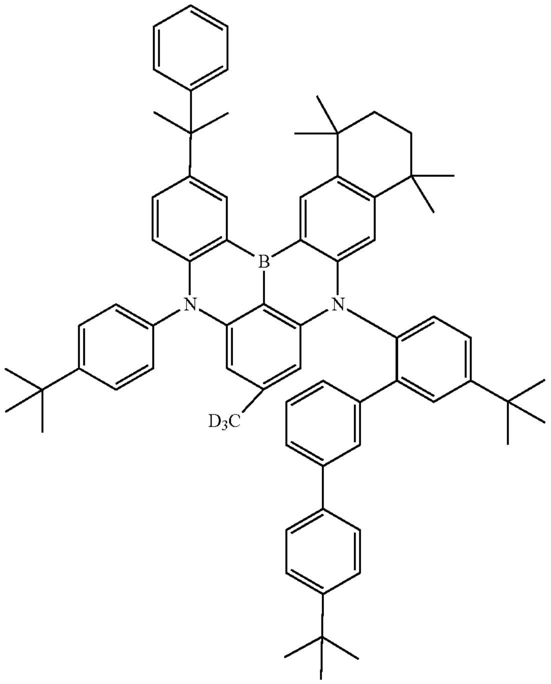
-continued
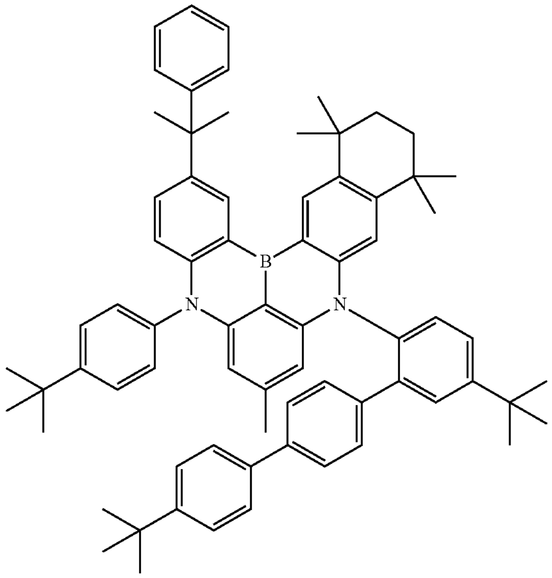
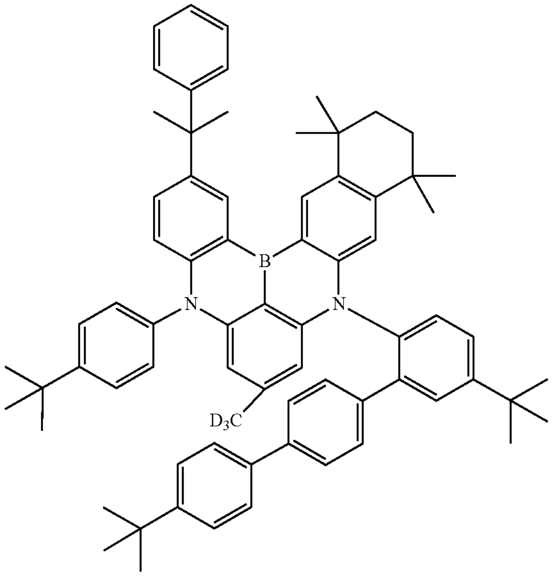

-continued
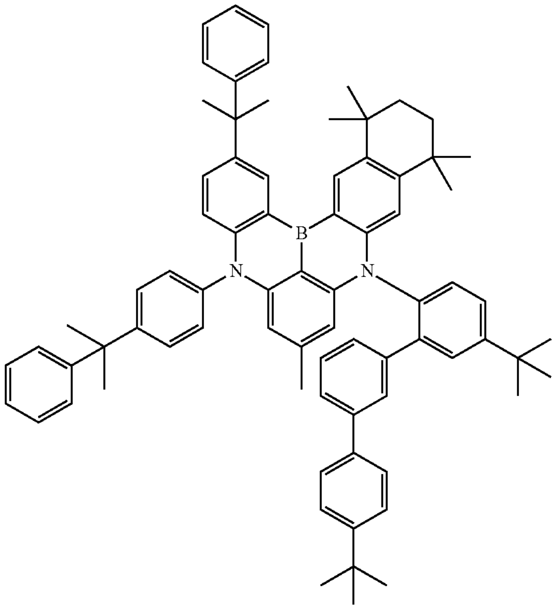
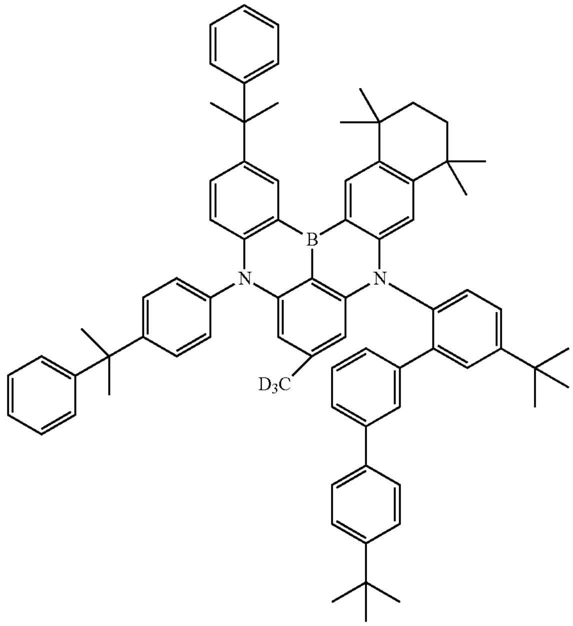
-continued
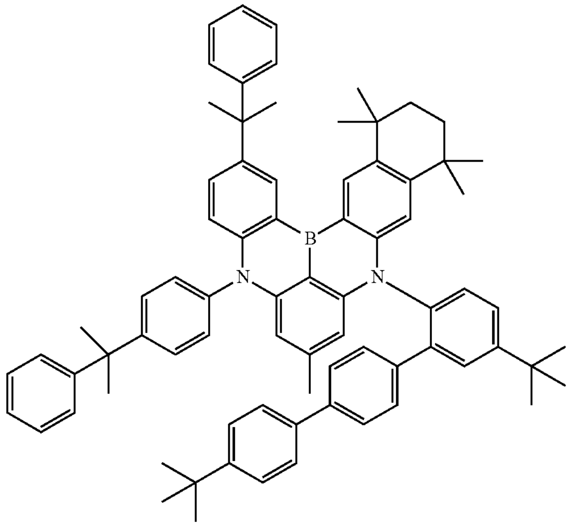
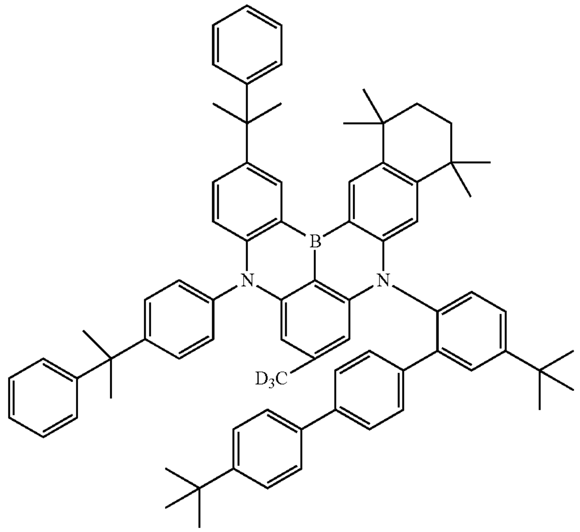
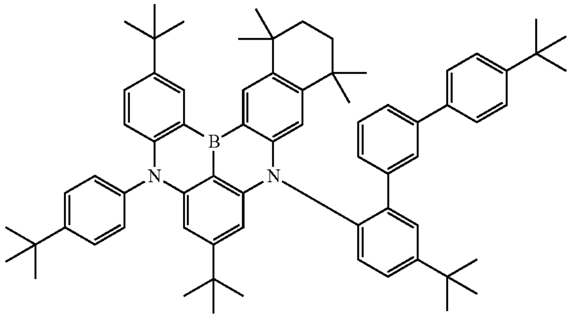
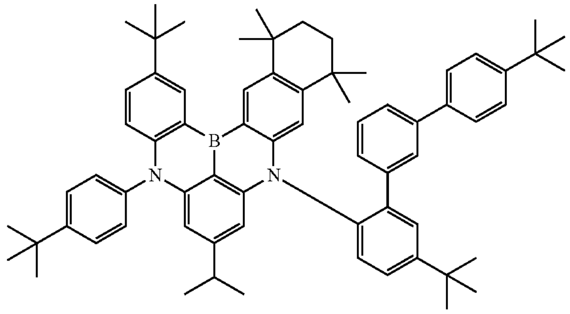

-continued
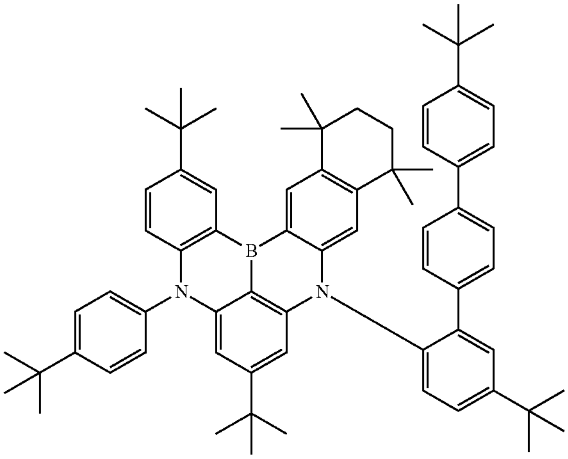
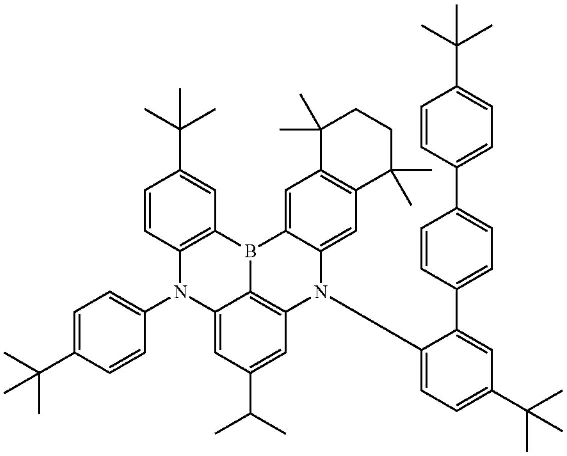
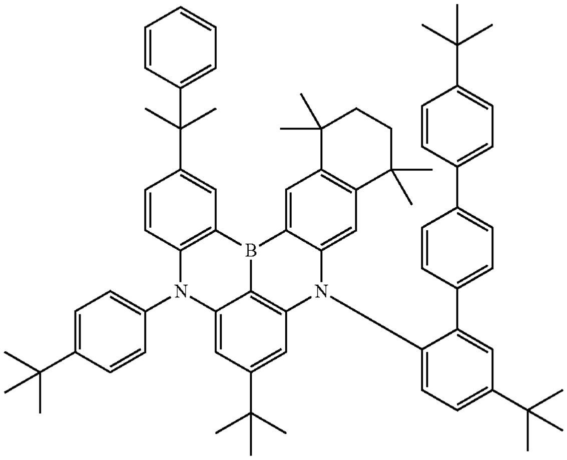
-continued
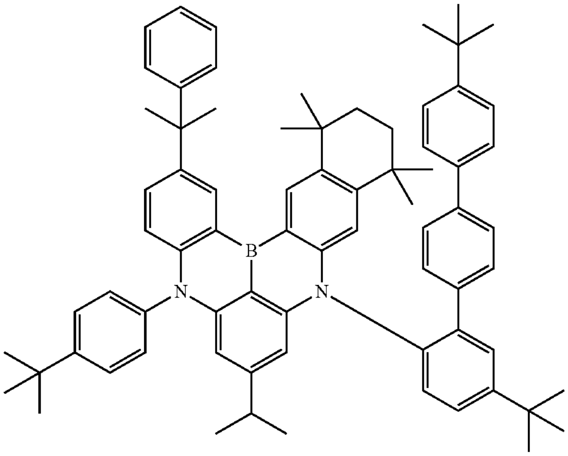
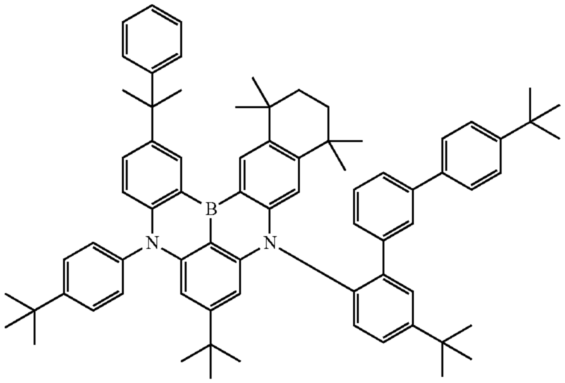
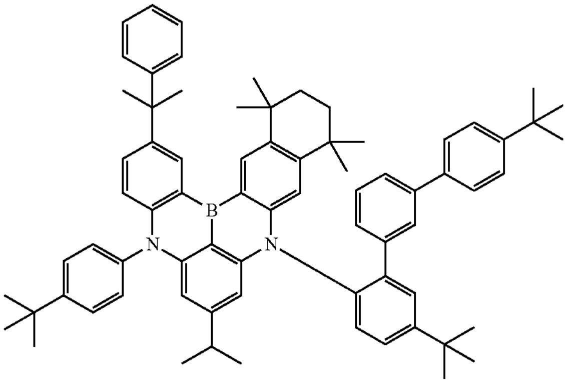
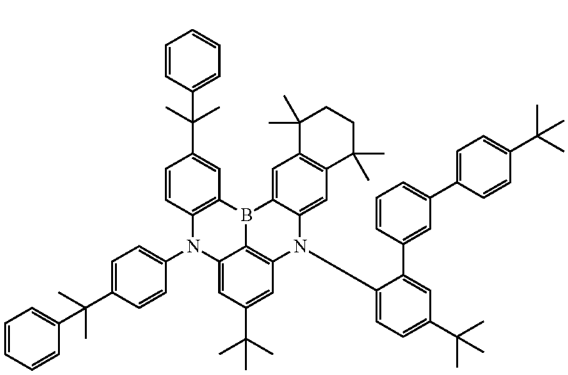

-continued
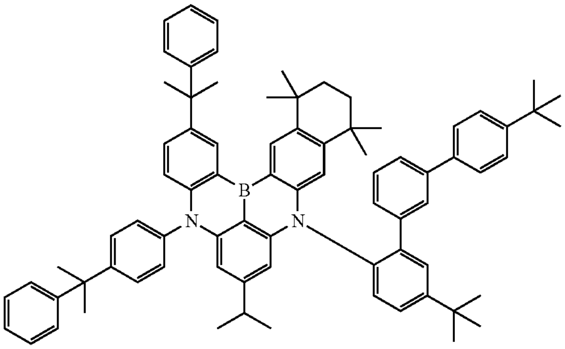
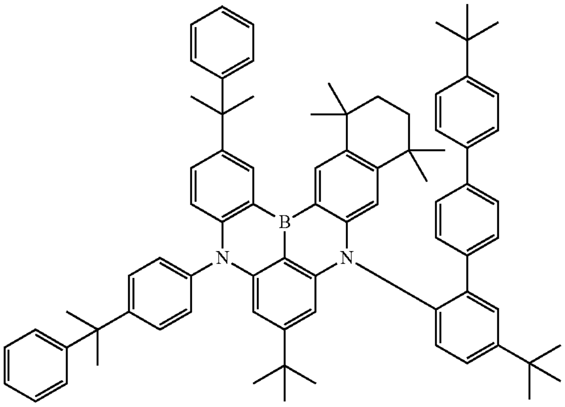
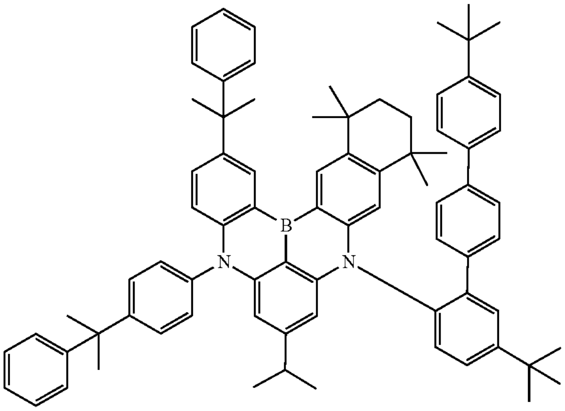
-continued
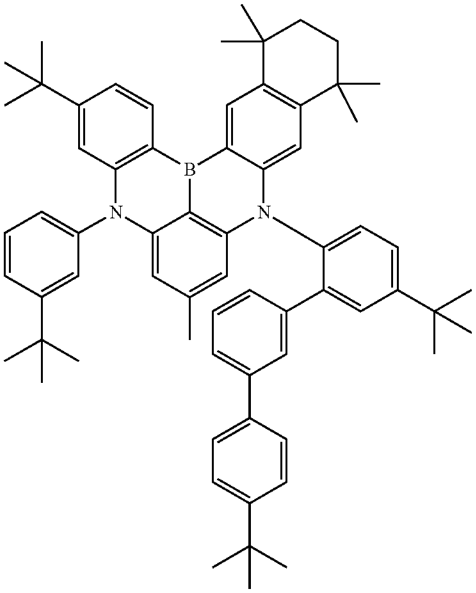
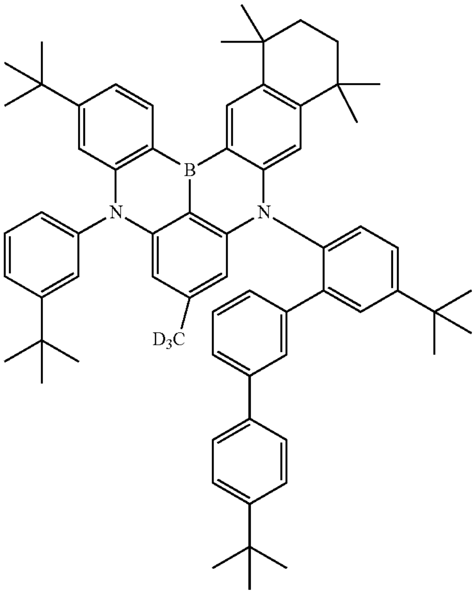
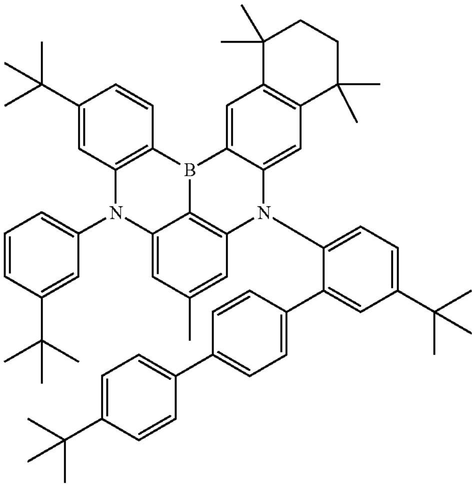

-continued
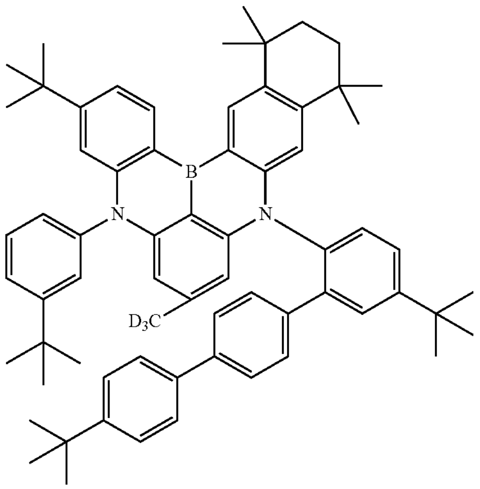
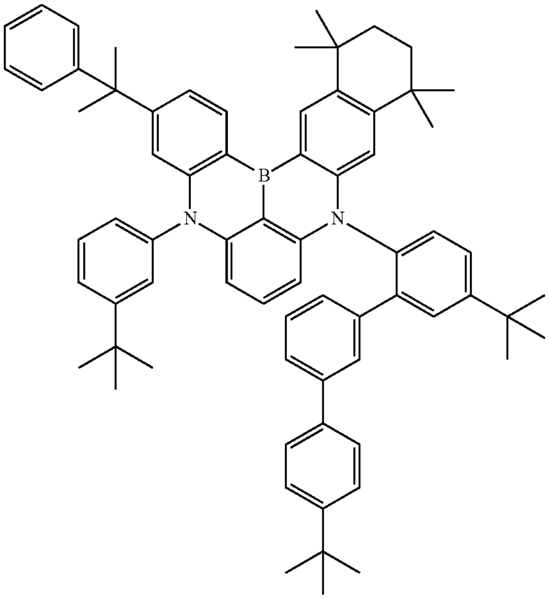
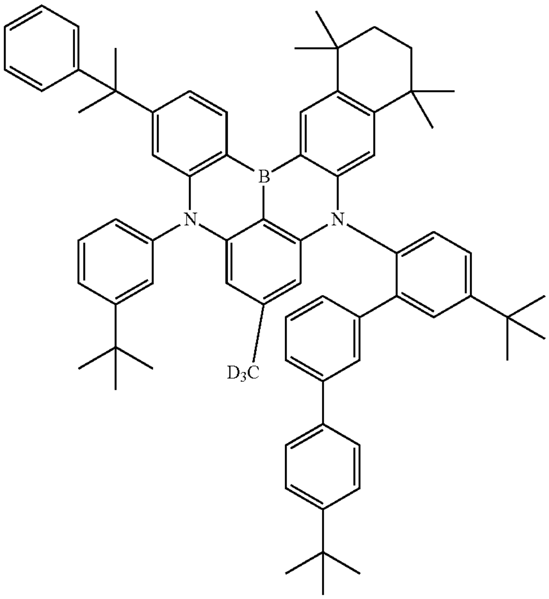
-continued
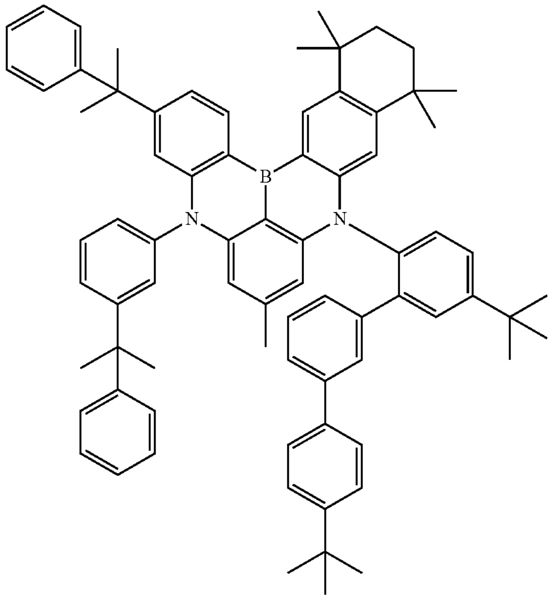
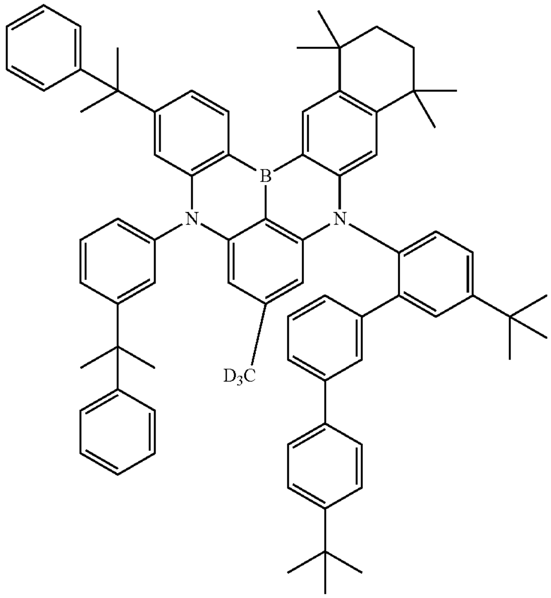
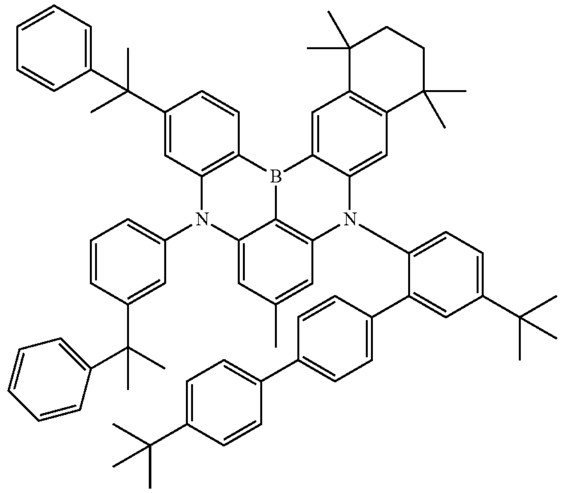

-continued
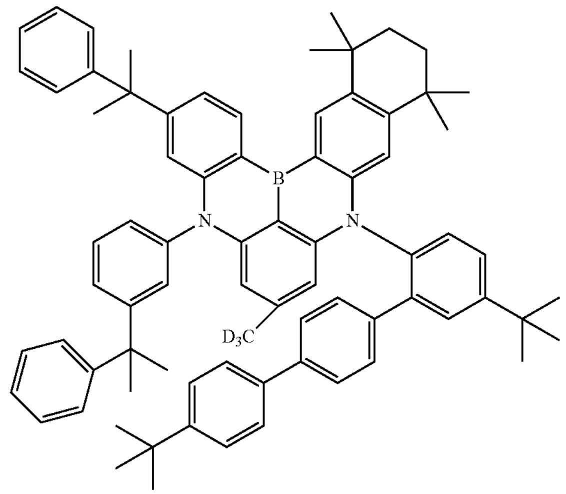
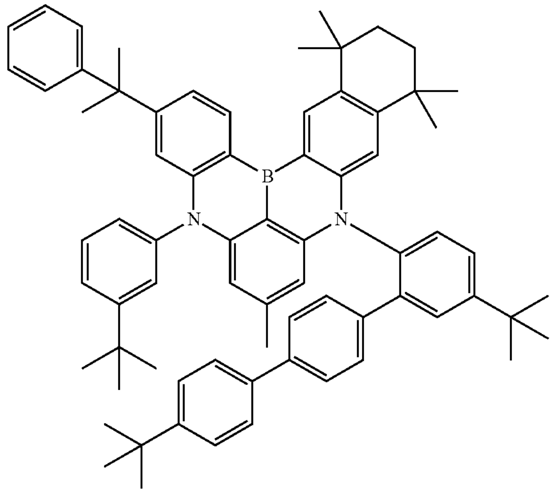
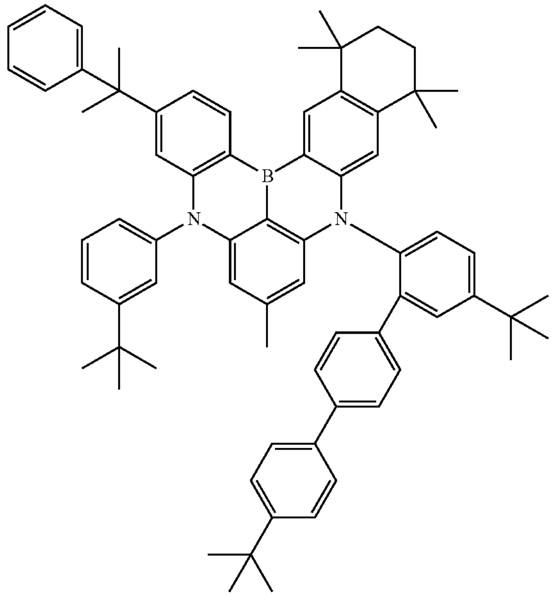
-continued
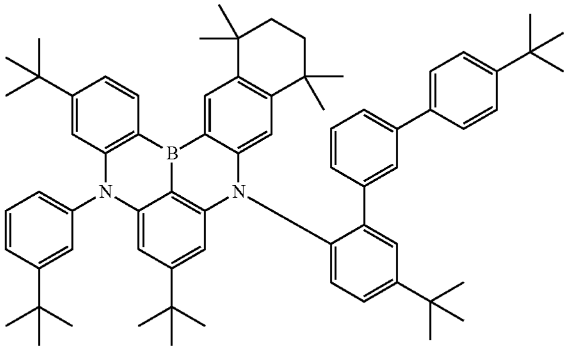
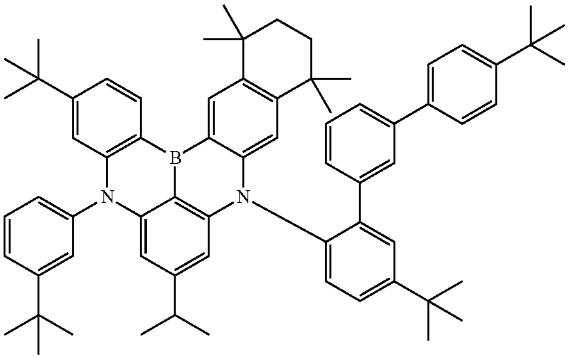
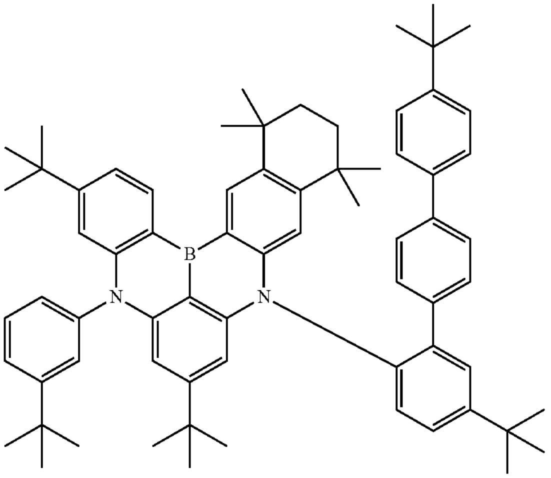
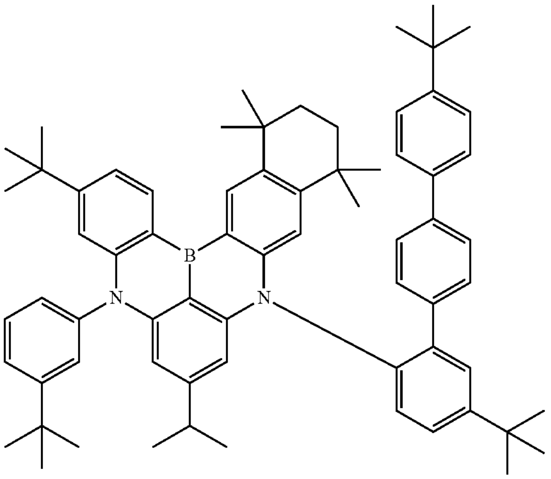

-continued
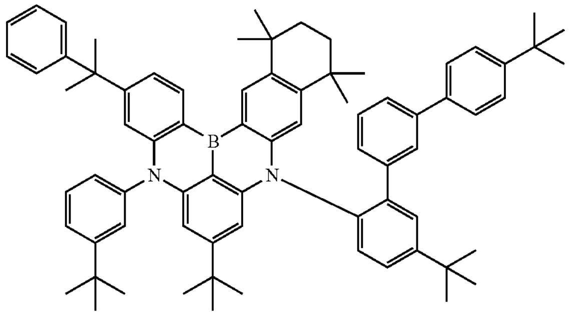
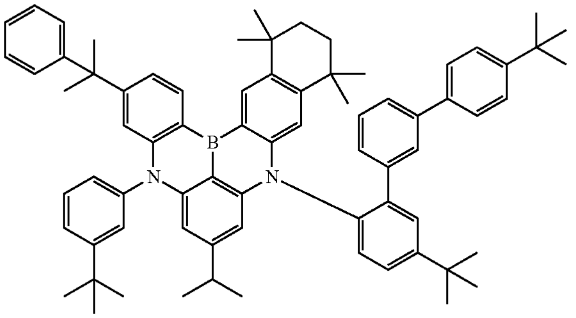
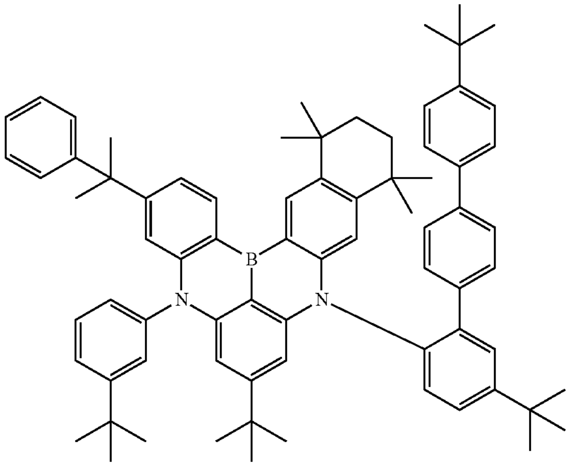
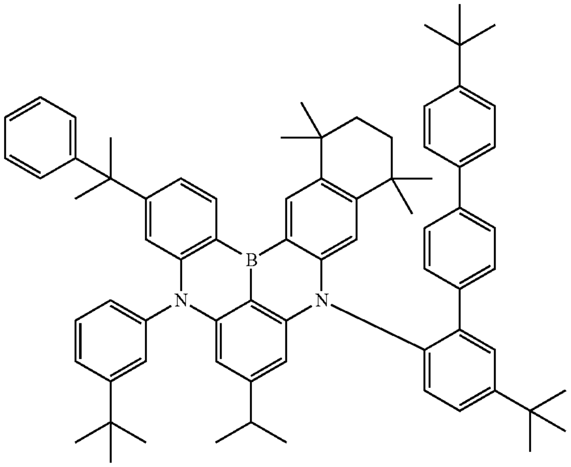
-continued
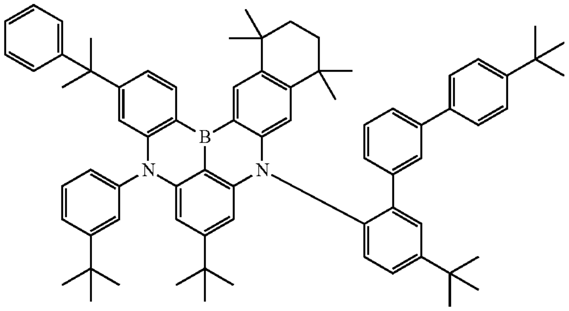
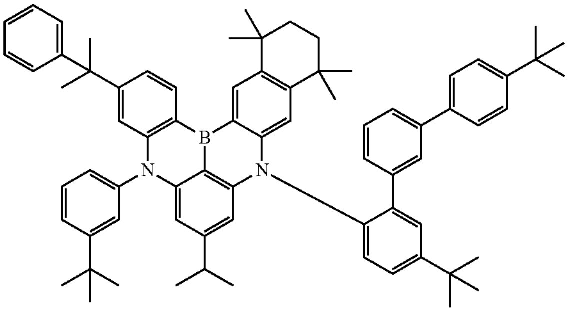
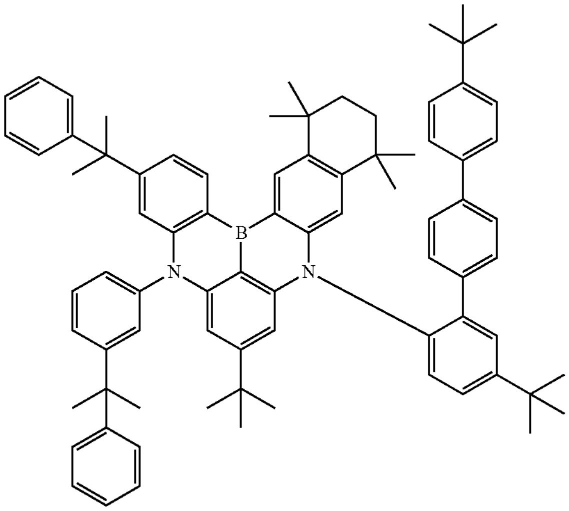
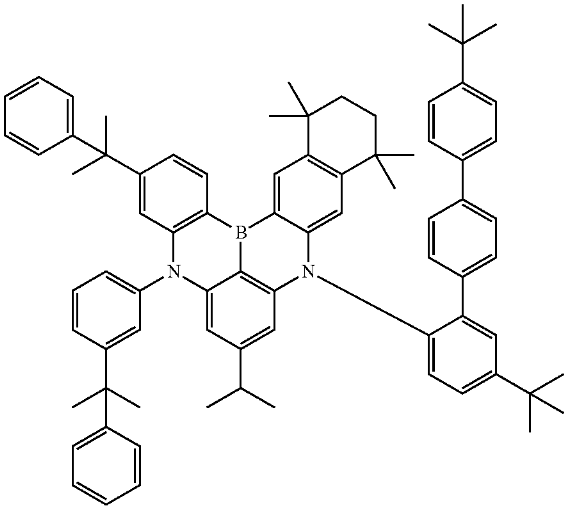

-continued
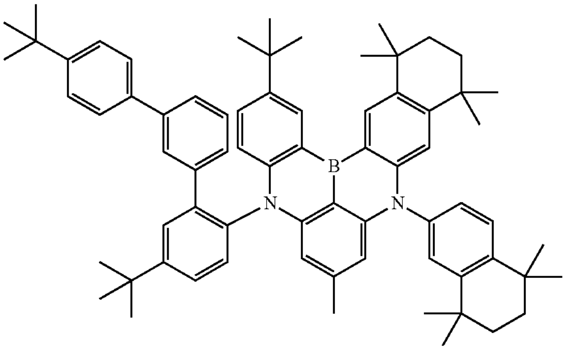
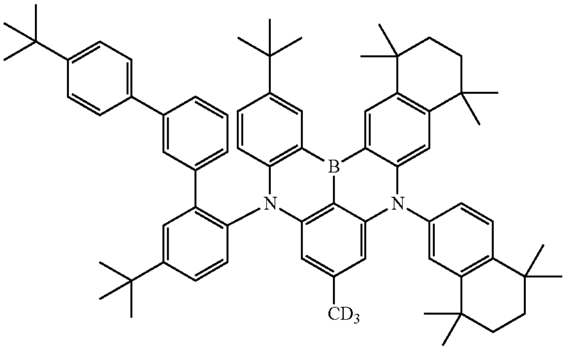
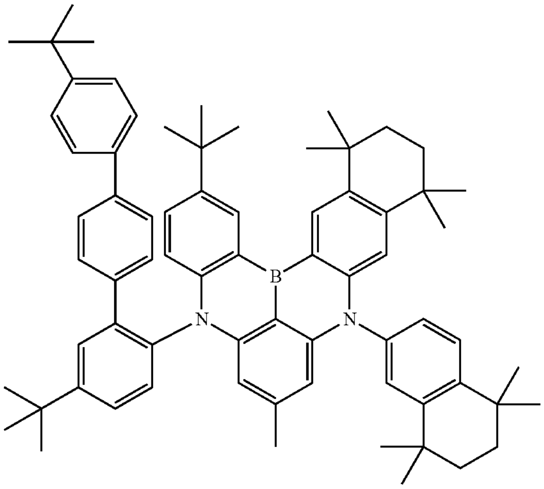
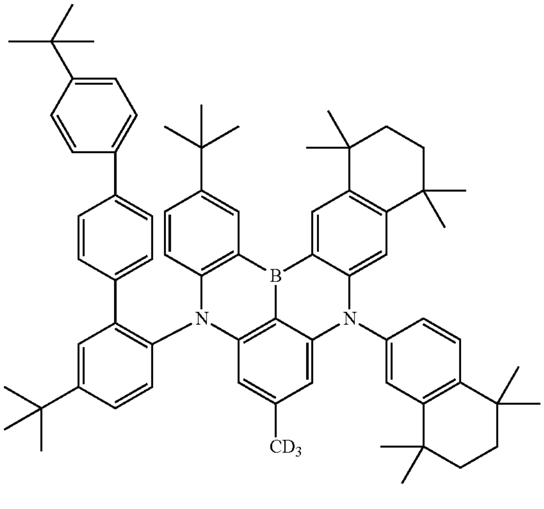
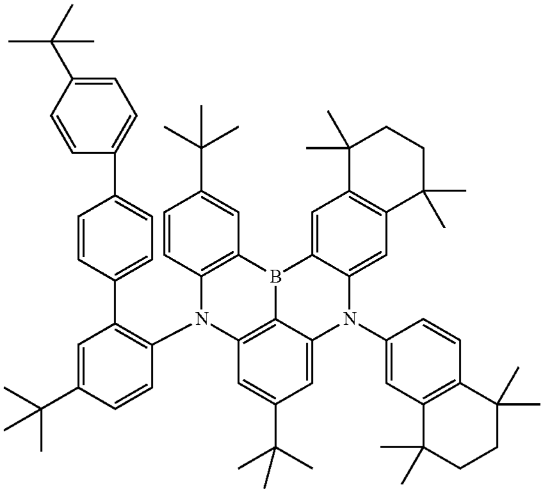
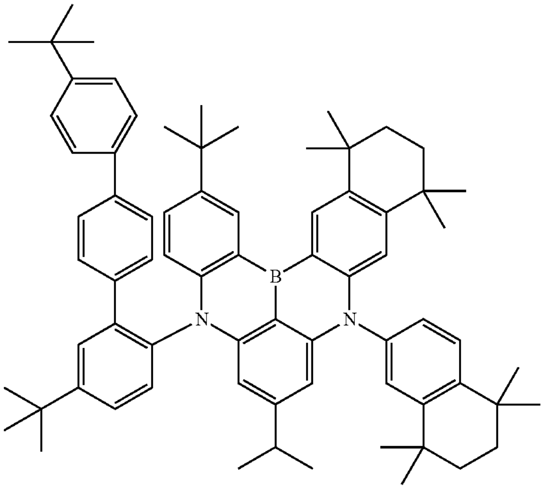
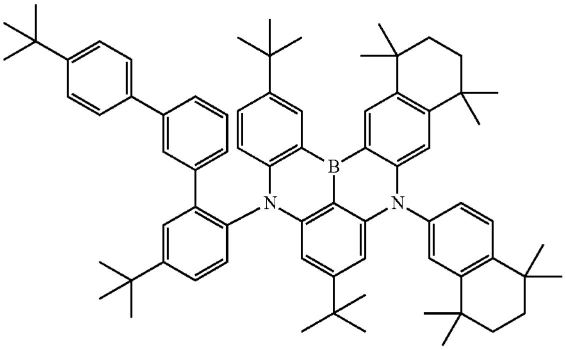
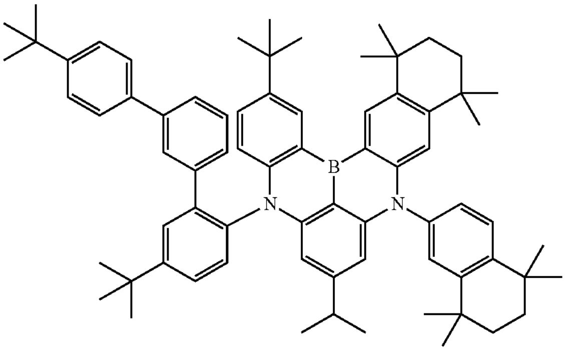

-continued
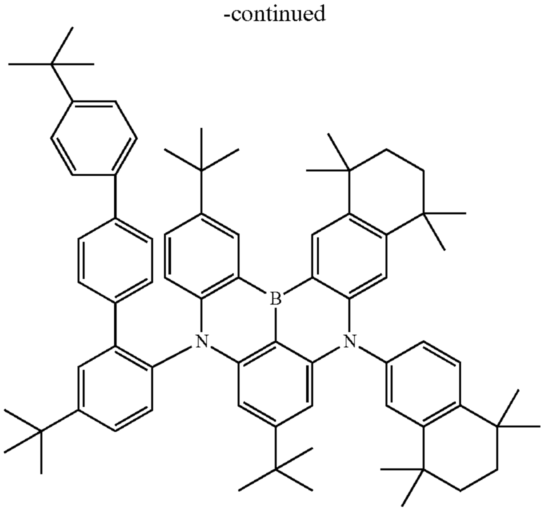
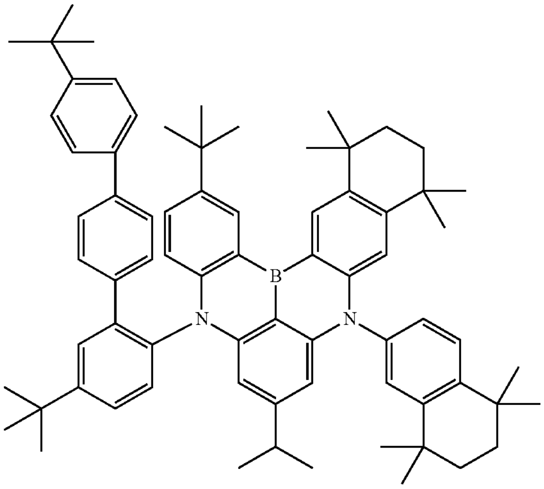
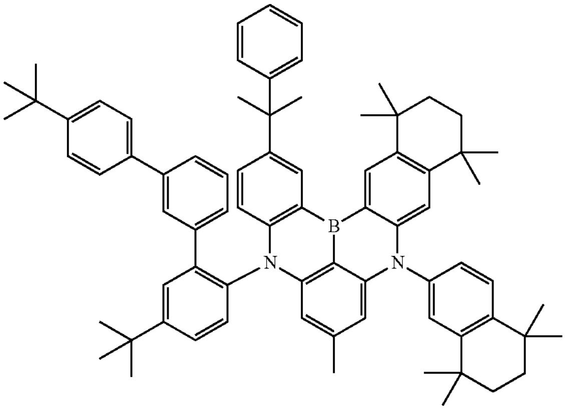
-continued
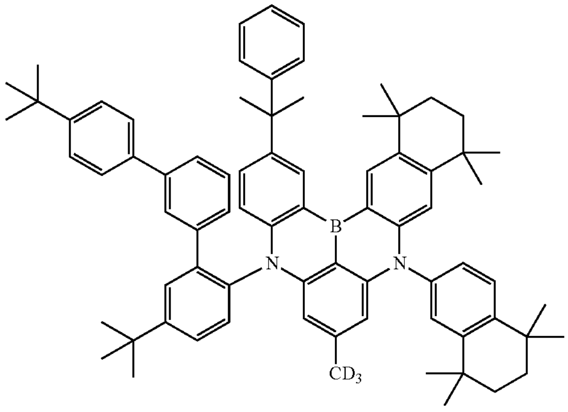
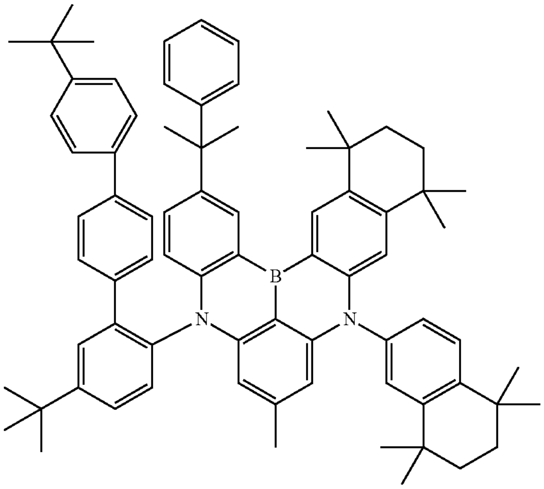
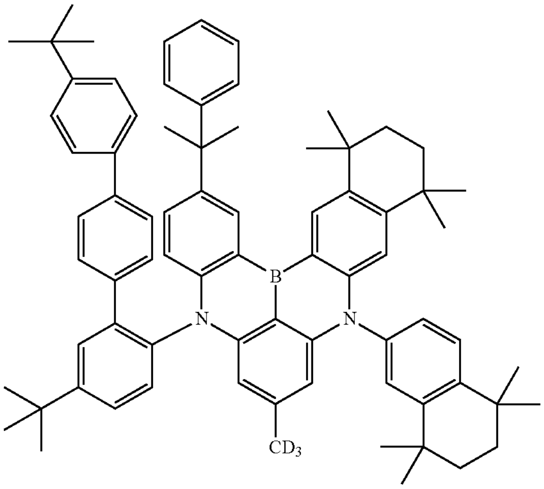

-continued
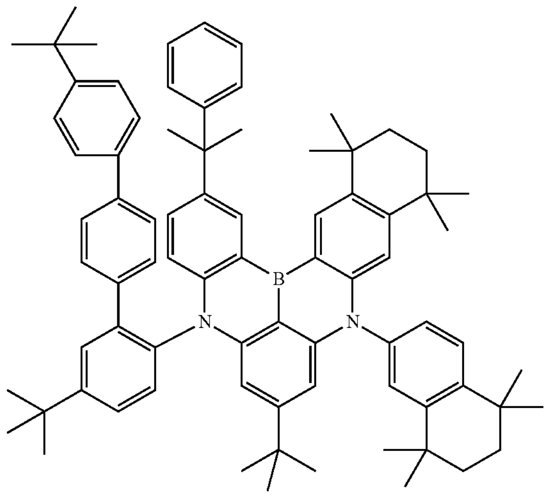
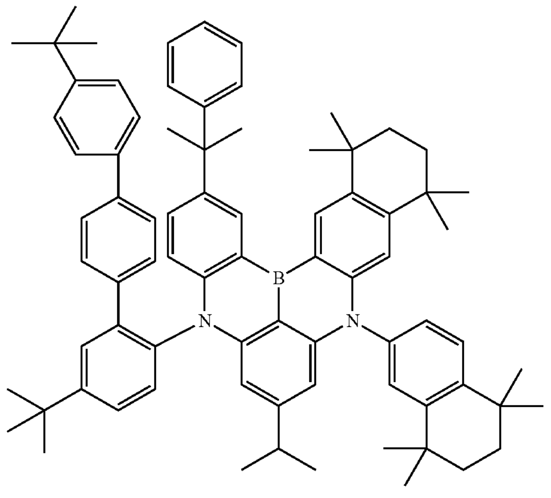
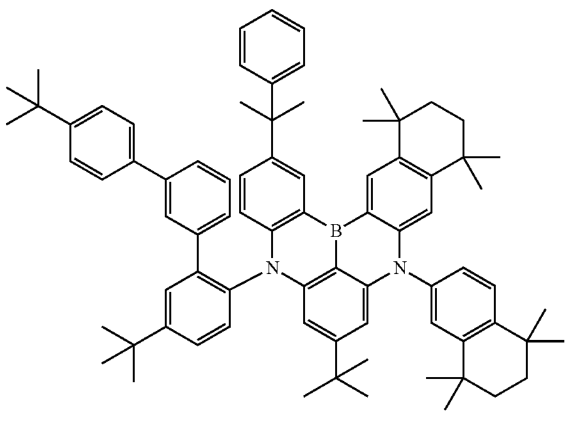
-continued
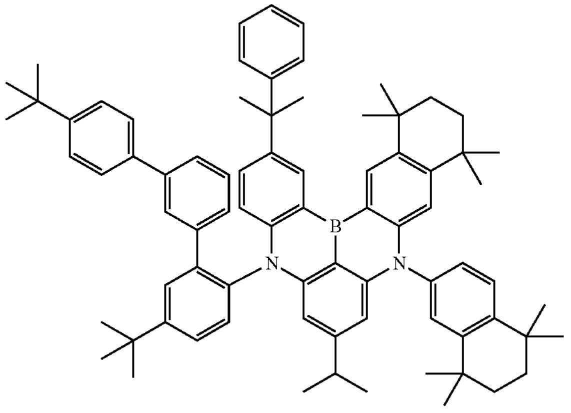
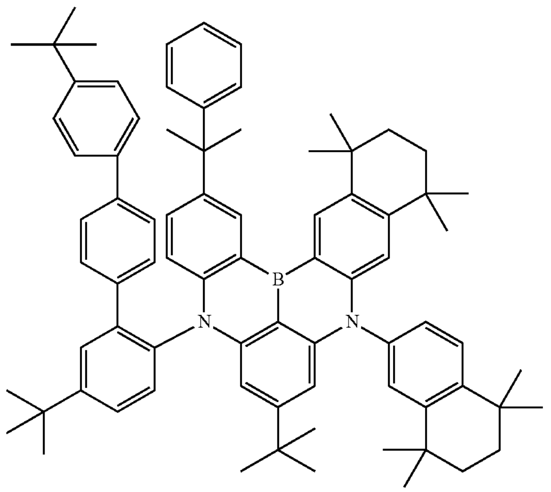
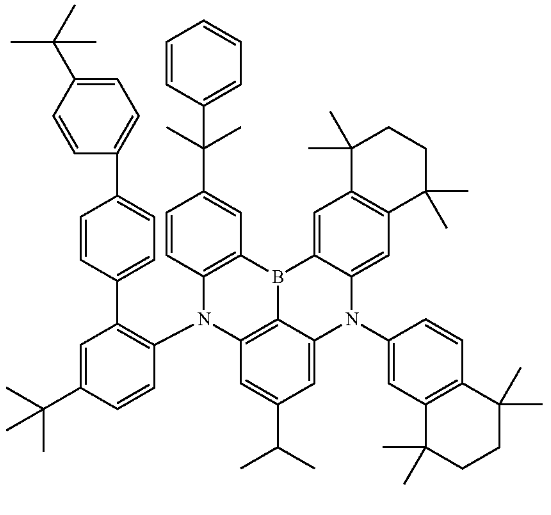

-continued
-continued
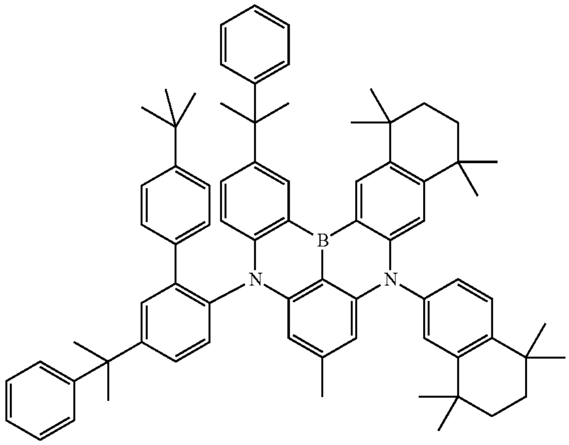
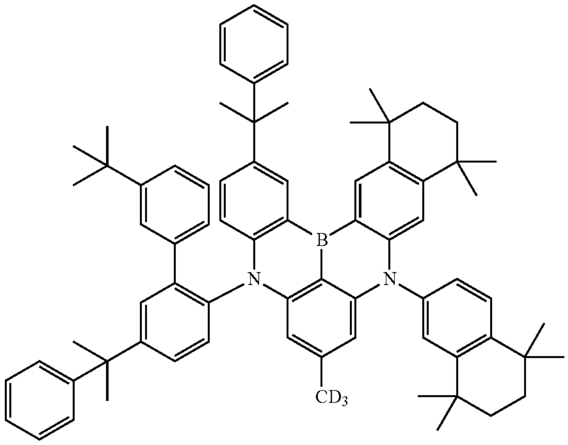
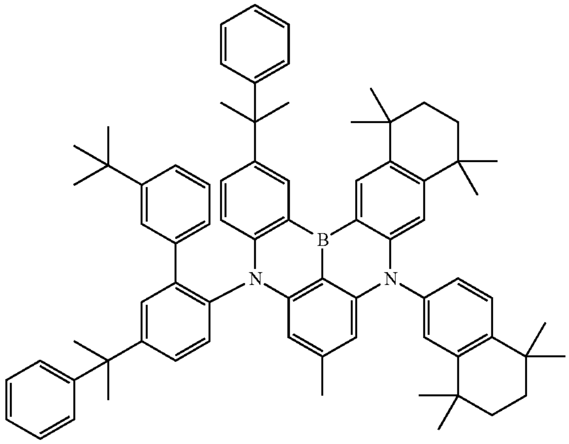
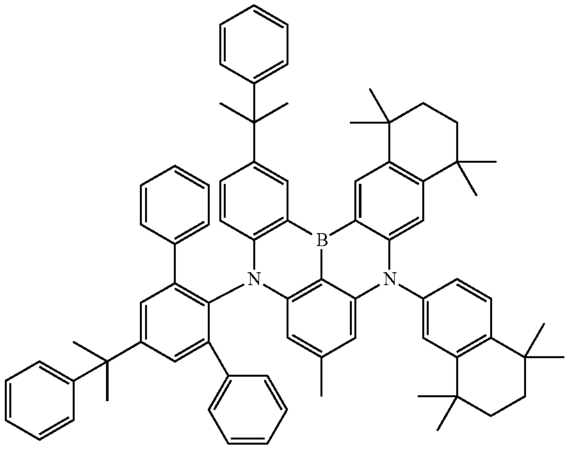
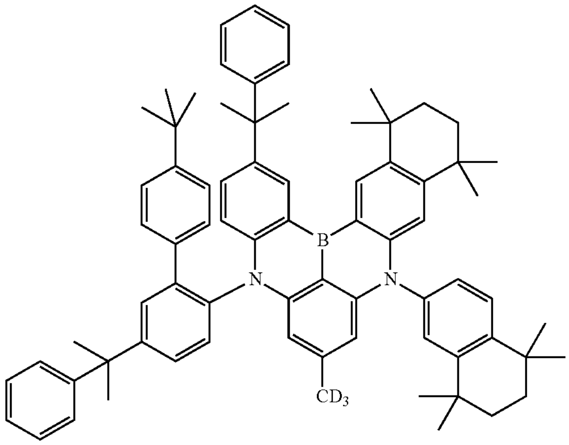
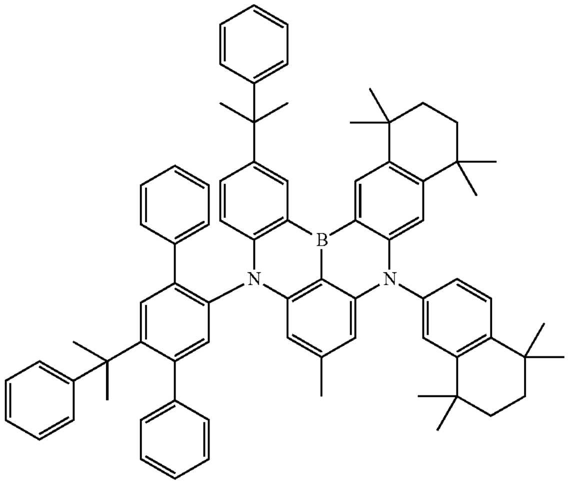

-continued
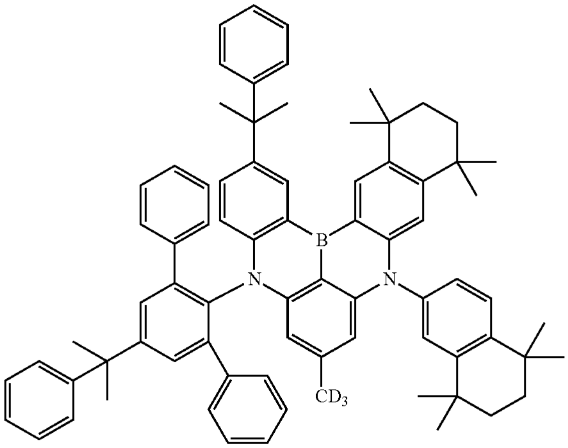
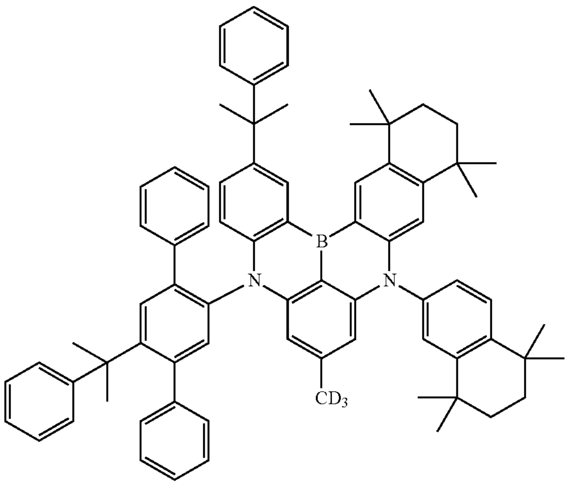
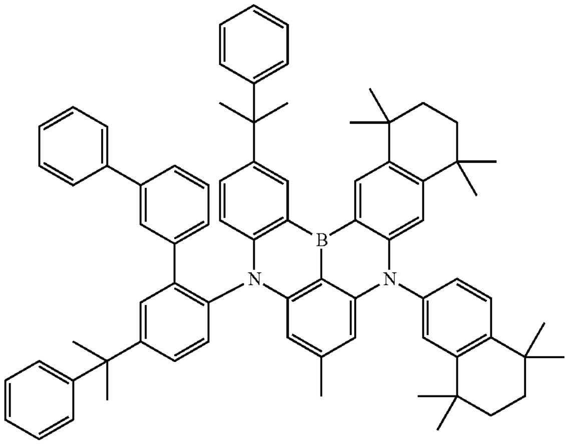
-continued
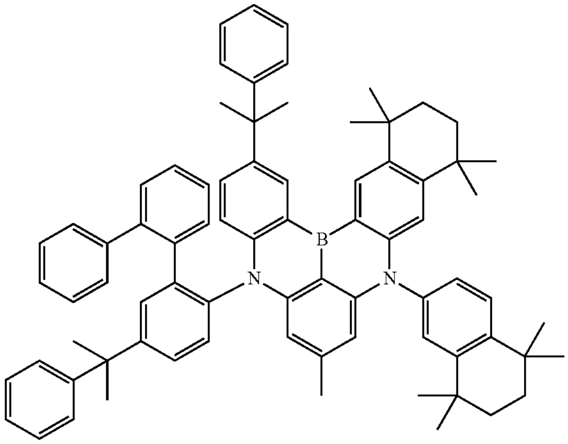
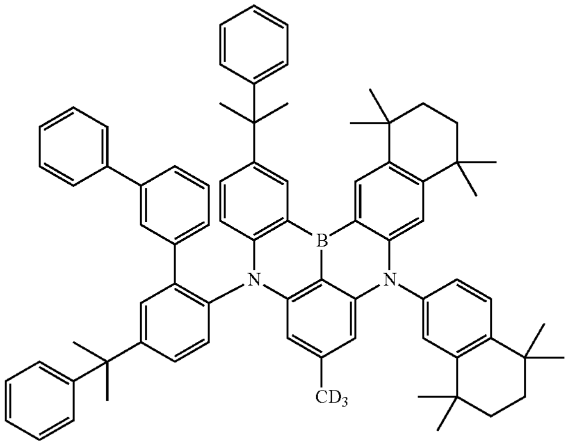
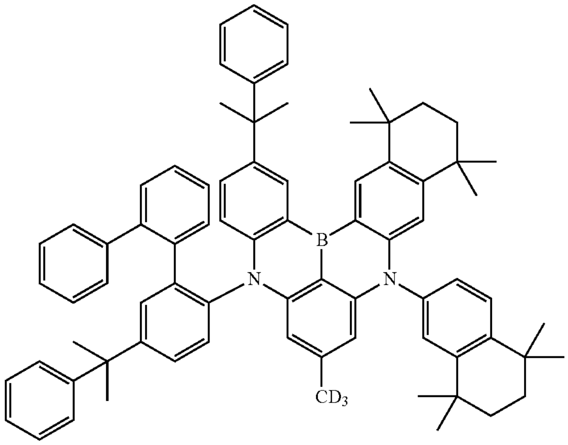

-continued
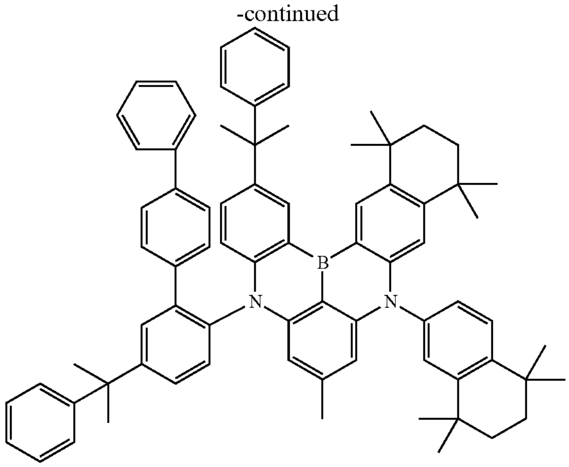
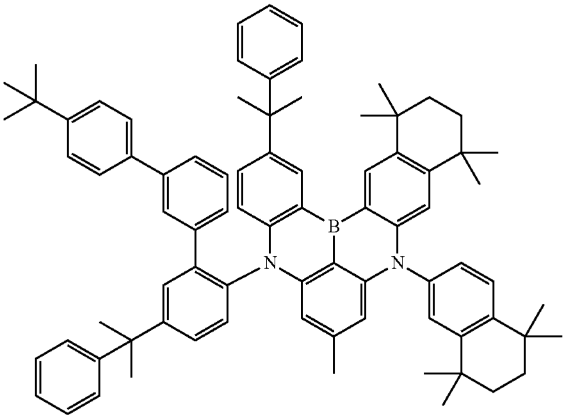
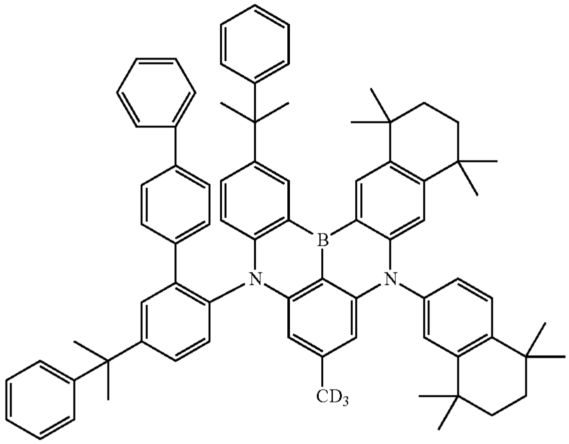
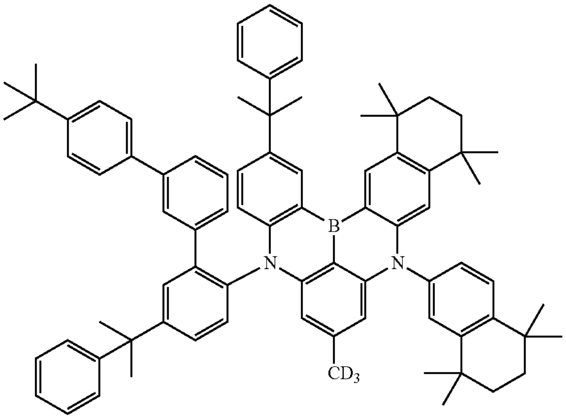 [SMILES: [2H]C([2H])([2H])c1cc2c3c(c1)N(c1ccc(C(C)(C)c4ccccc4)cc1-c1cccc(-c4ccc(C(C)(C)C)cc4)c1)c1ccc(C(C)(C)c4ccccc4)cc1B3c1cc3c(cc1N2c1ccc2c(c1)C(C)(C)CCC2(C)C)C(C)(C)CCC3(C)C]
-continued
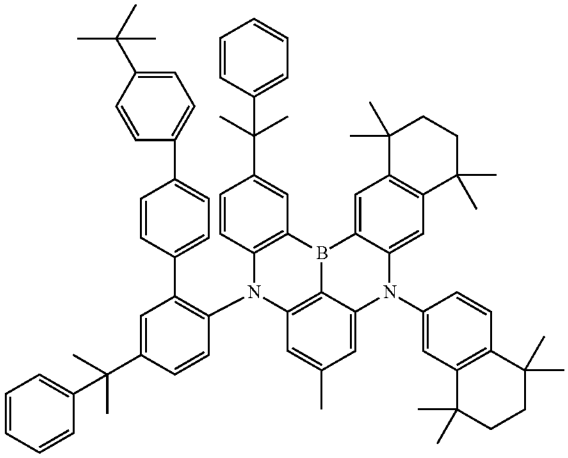
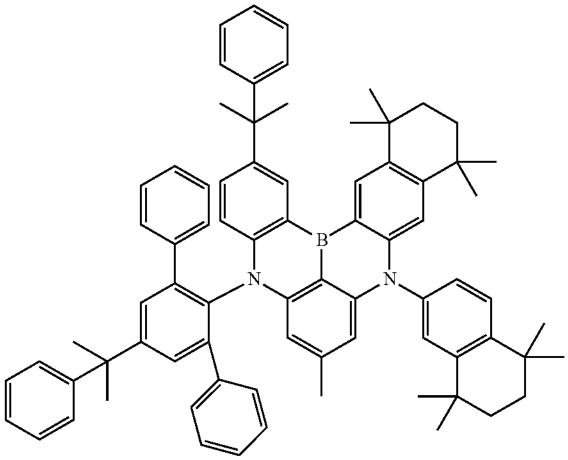
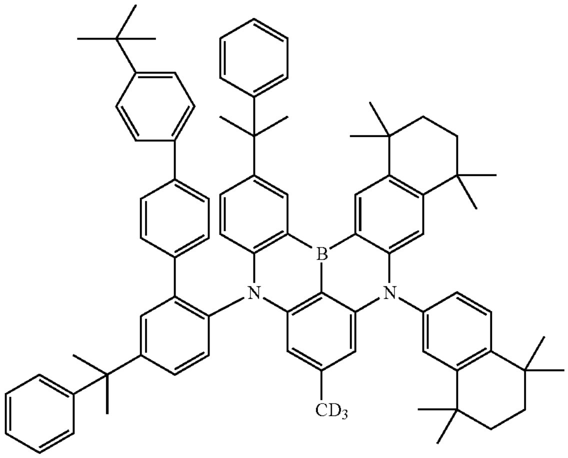

-continued
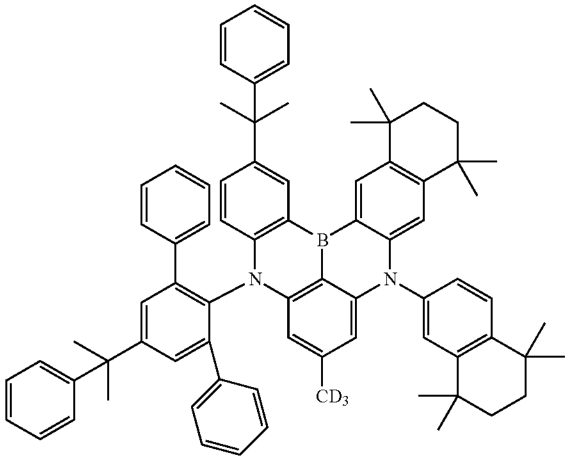
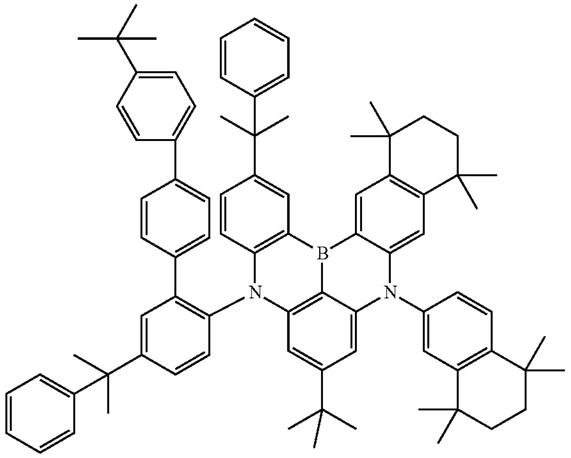
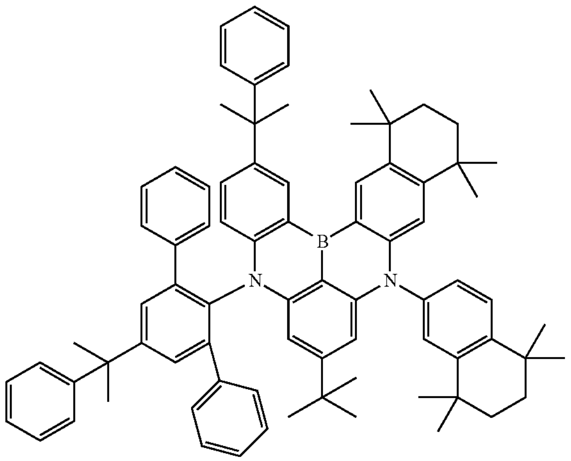
-continued
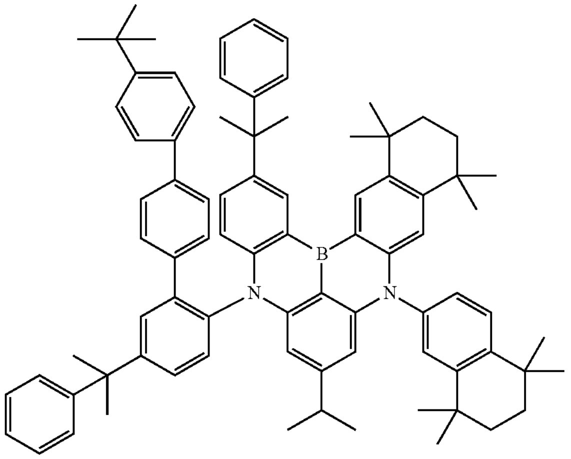
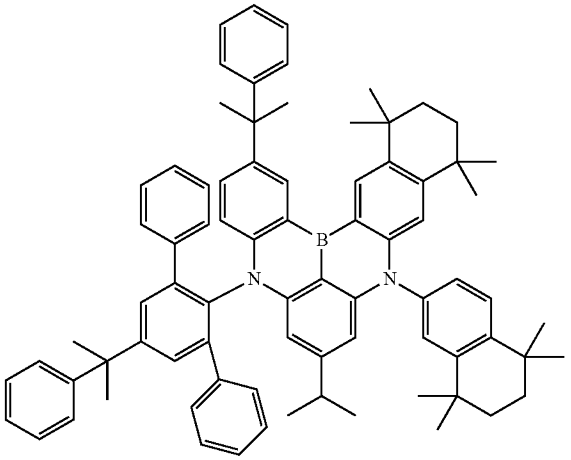
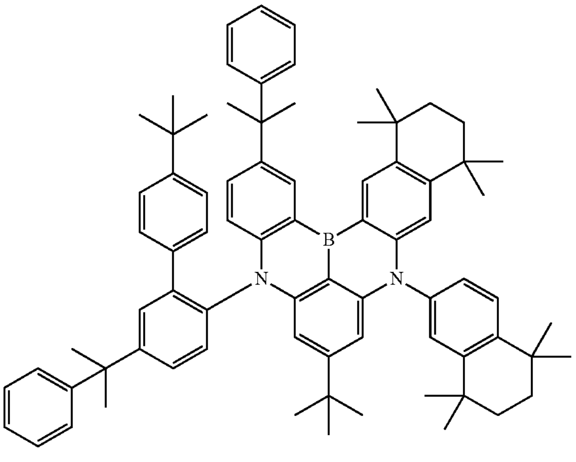

-continued
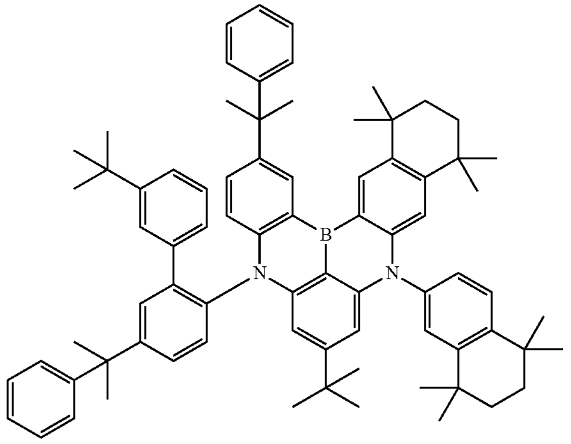
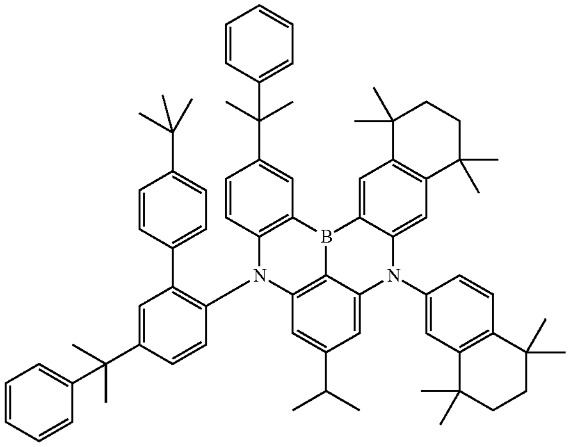
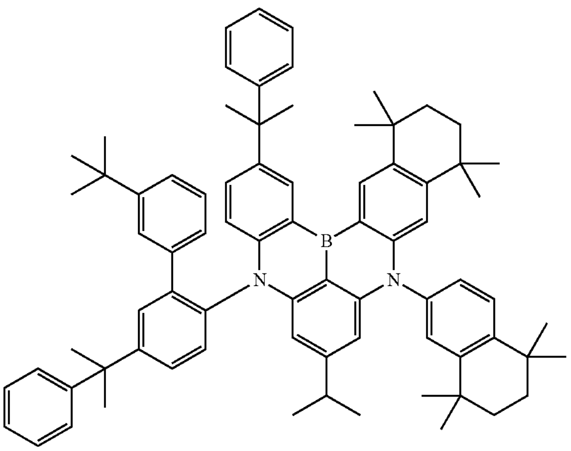
-continued
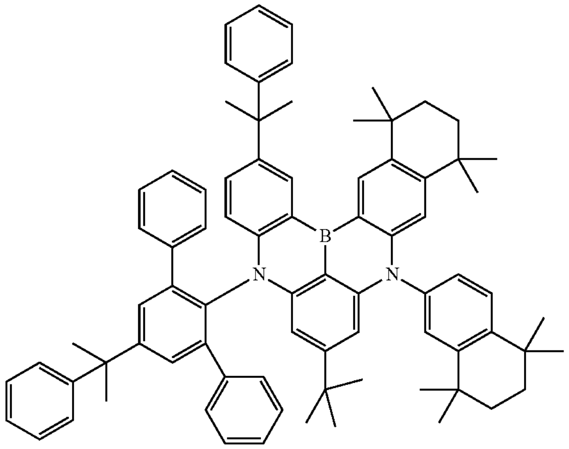
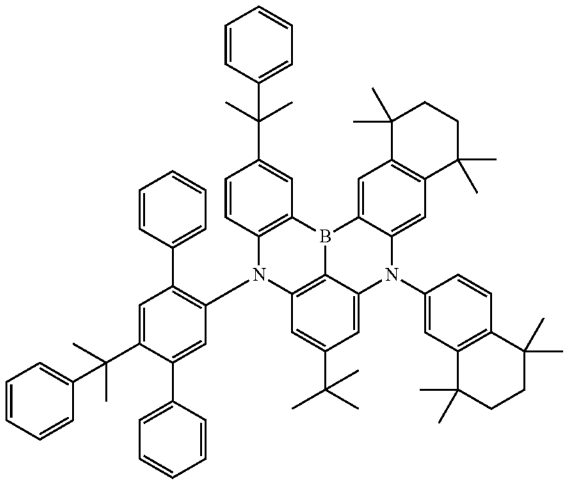
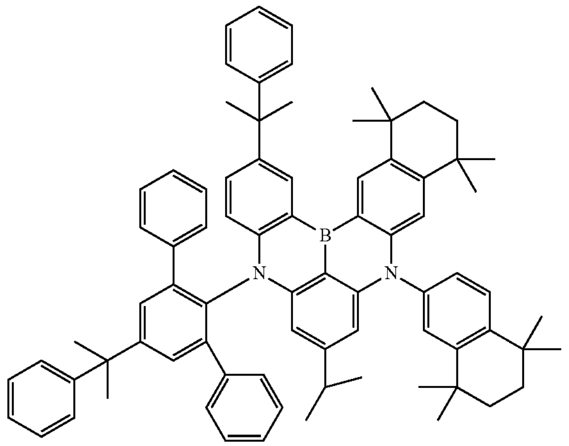

-continued
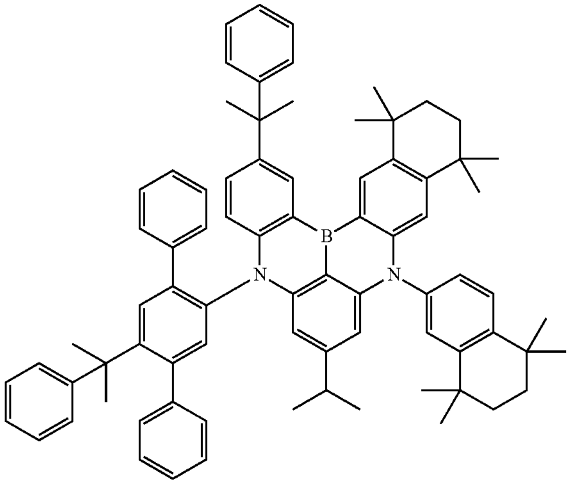
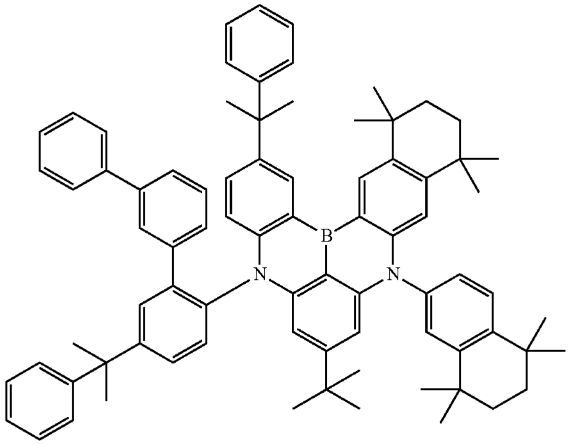
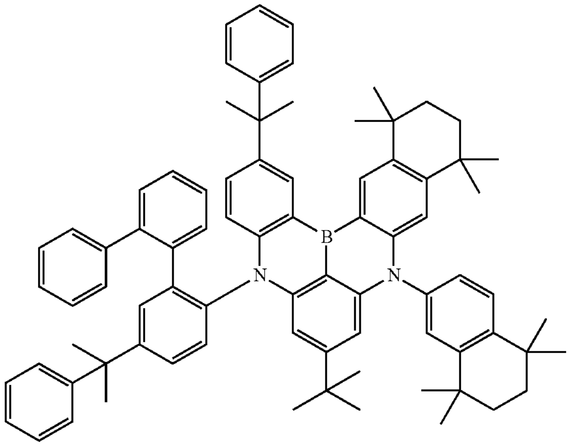
-continued
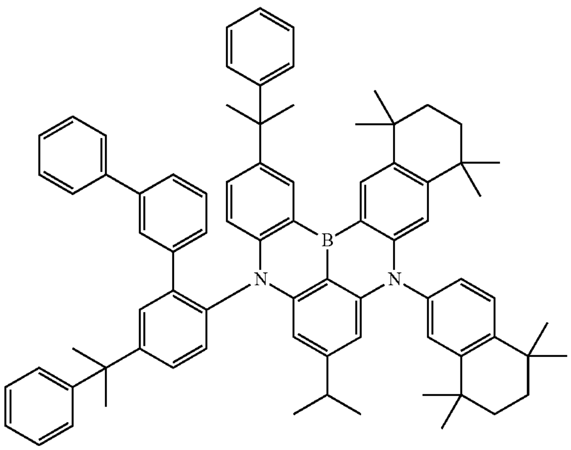
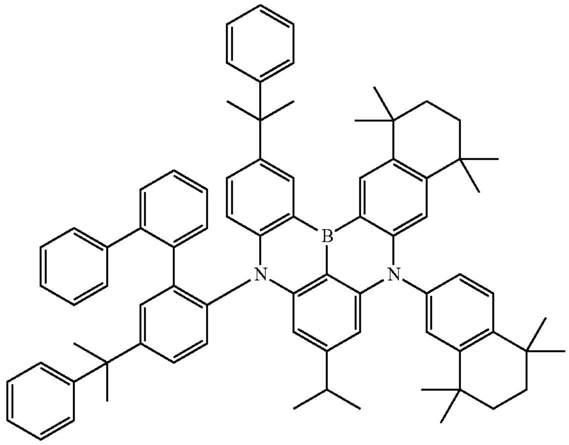
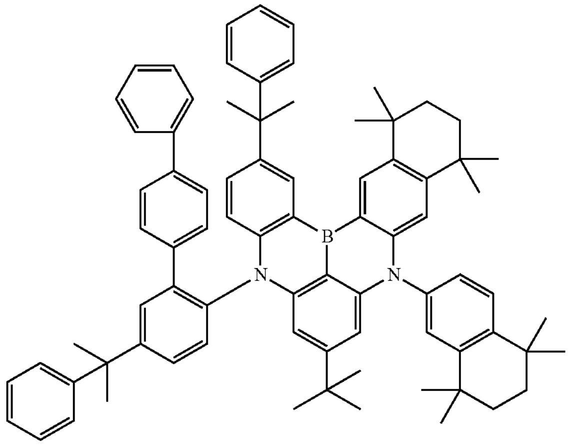

-continued
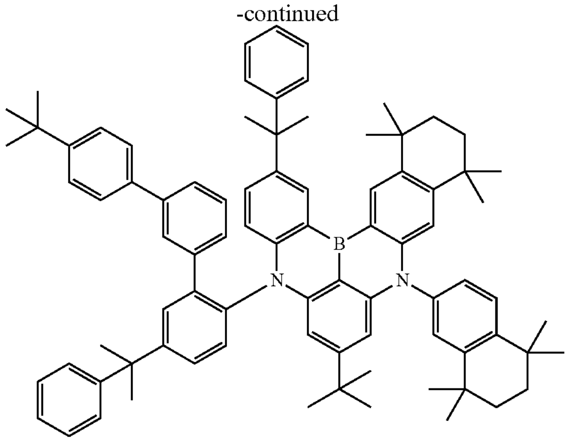
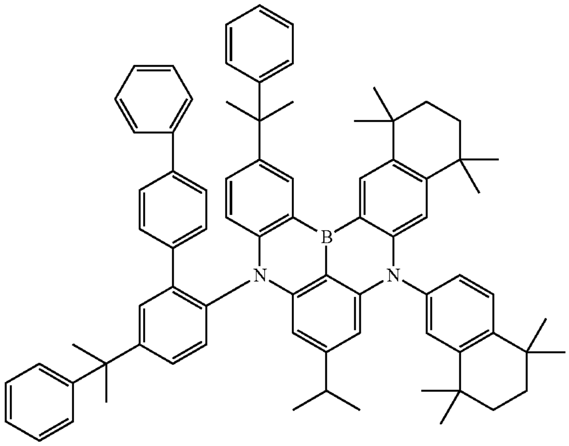
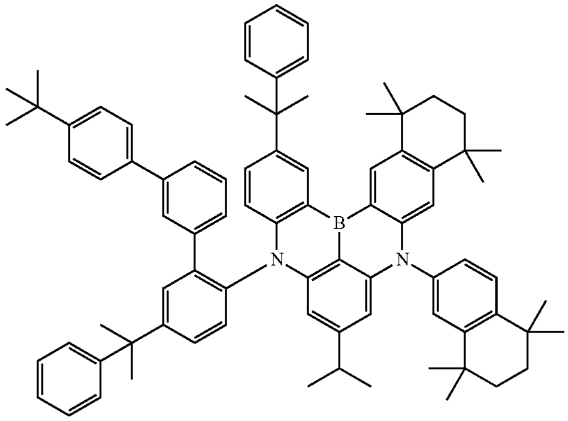
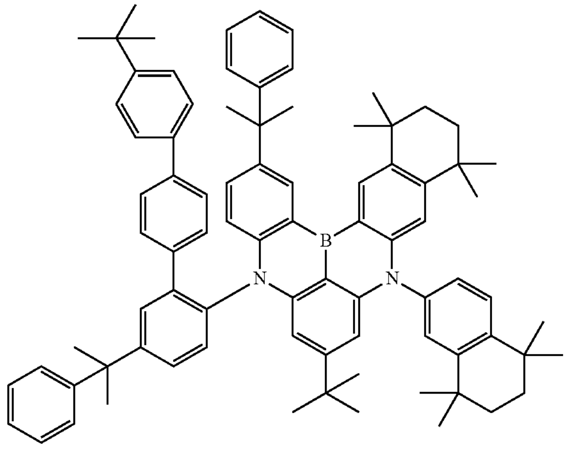
-continued
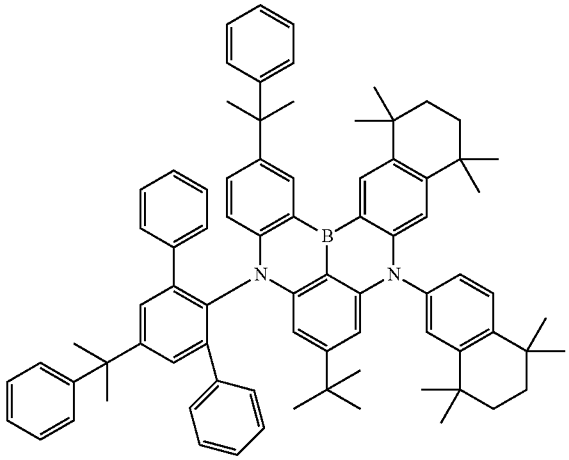
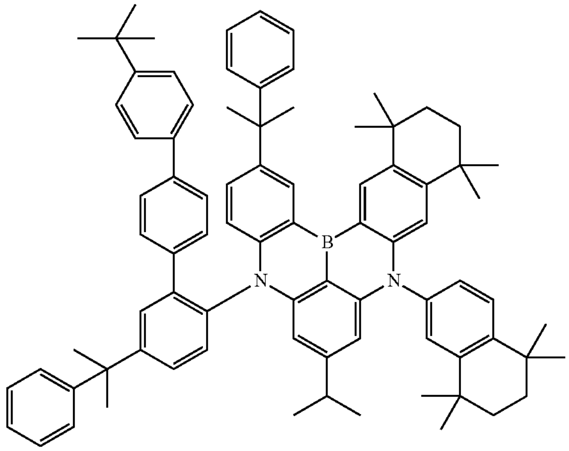
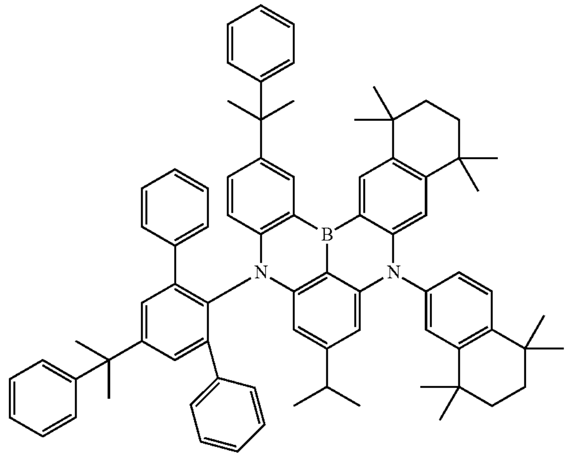
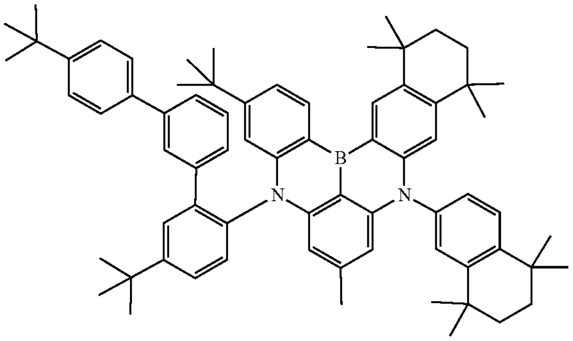

-continued
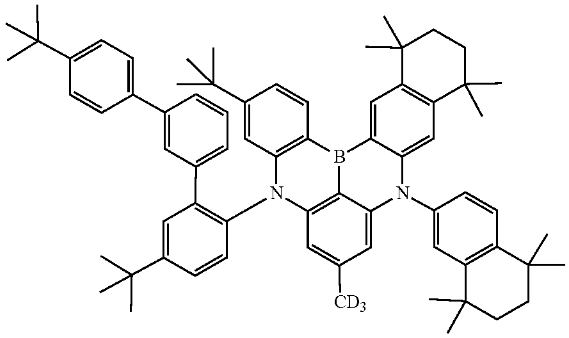
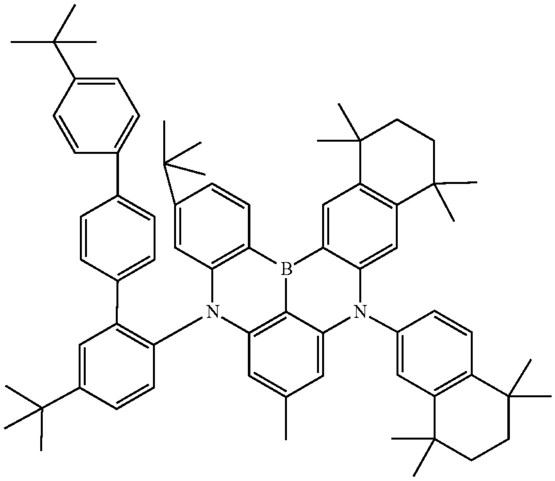
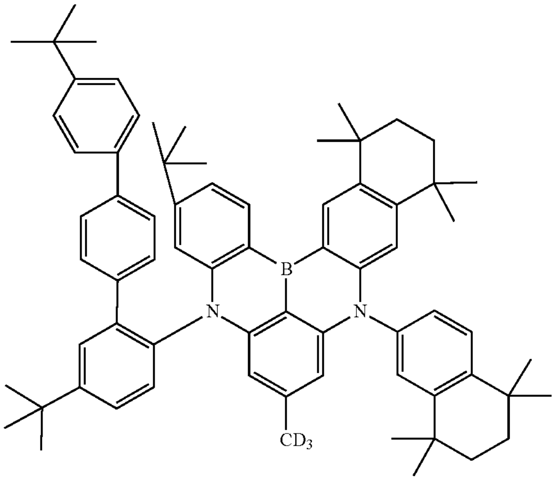
-continued
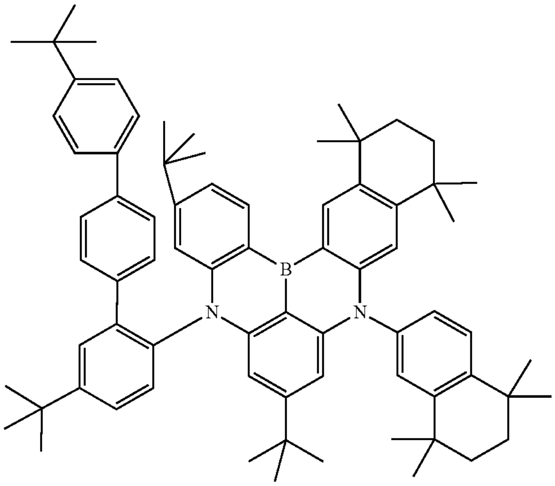
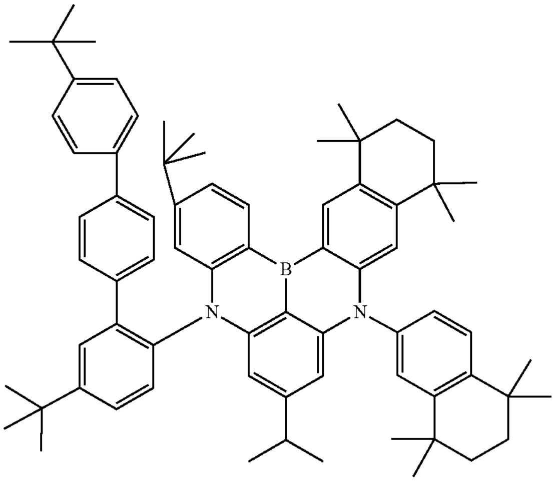
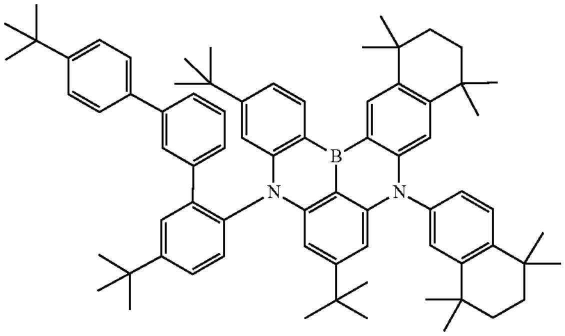
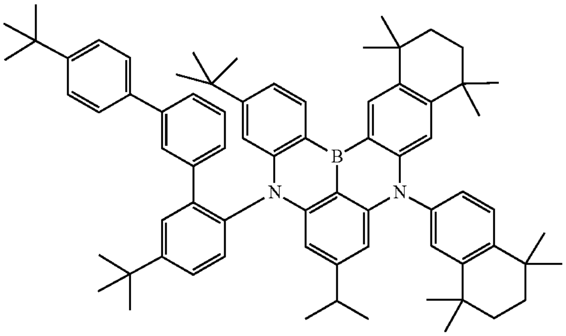

-continued
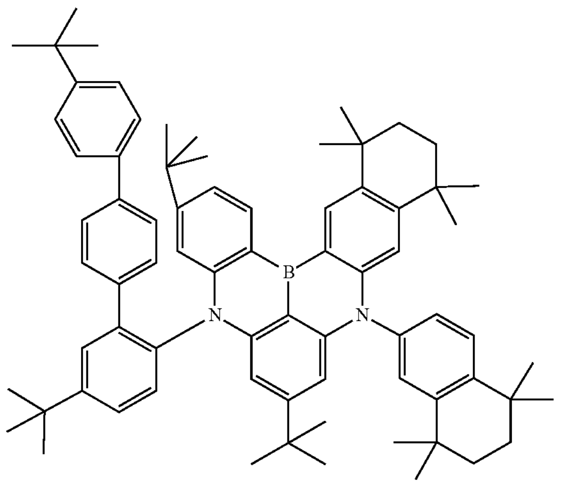
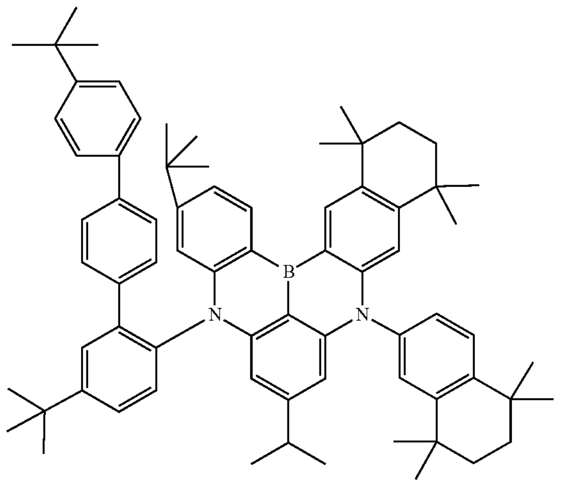
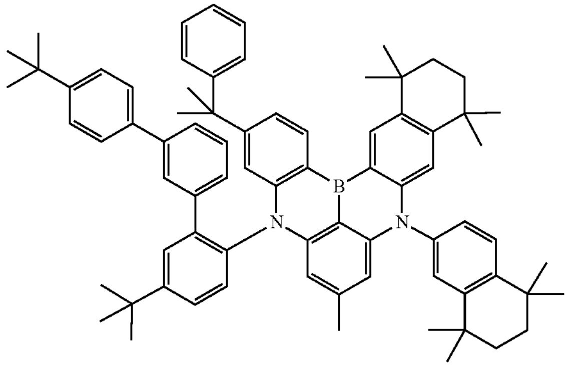
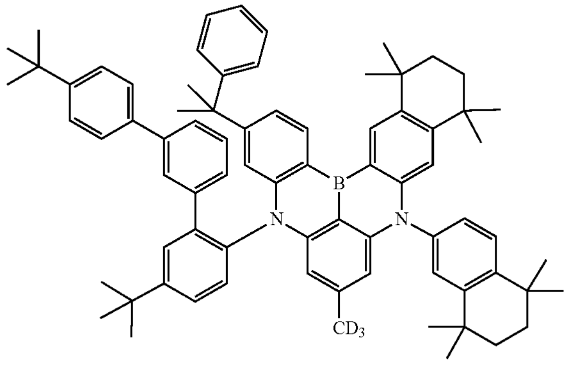
-continued
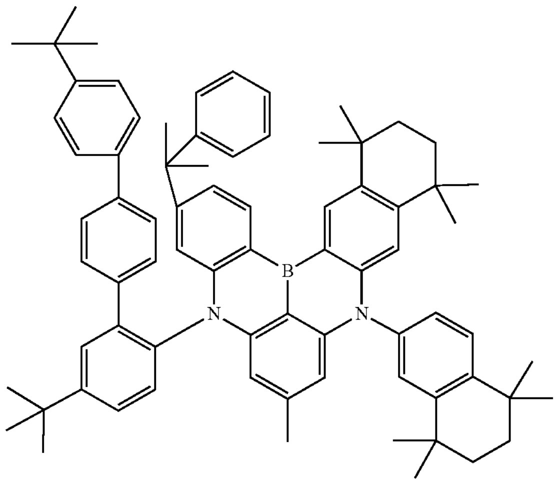
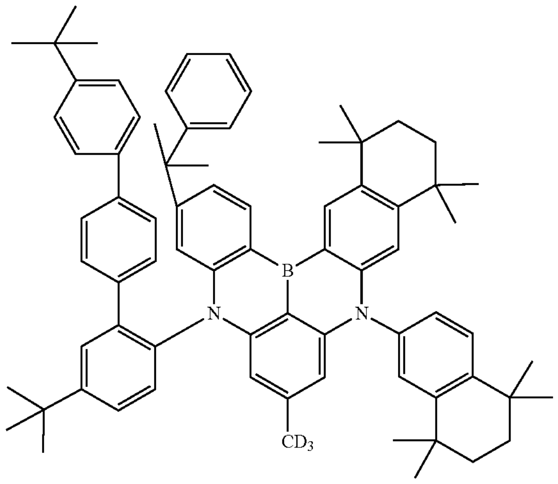
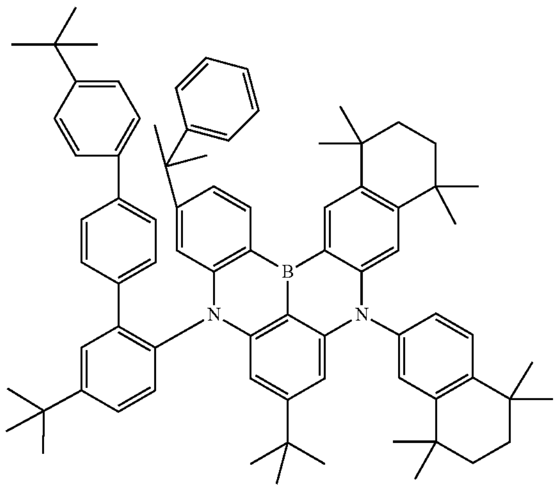

-continued
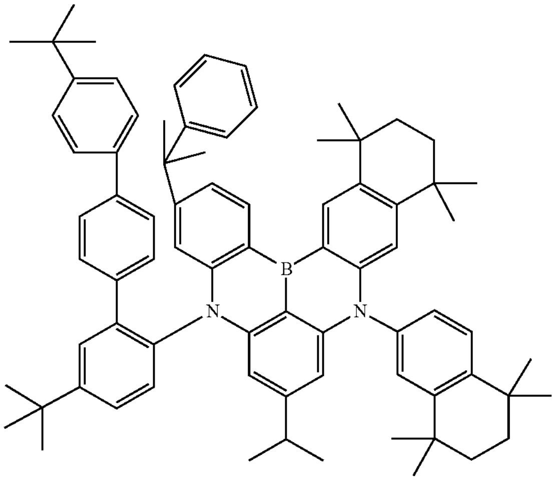
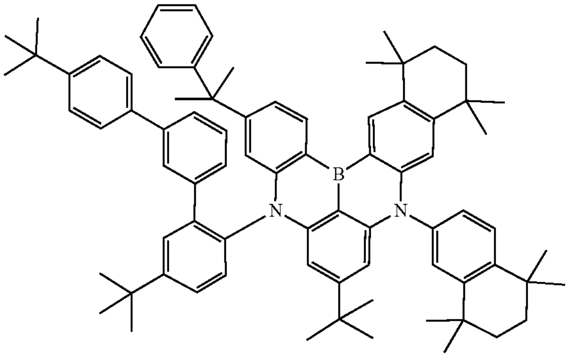
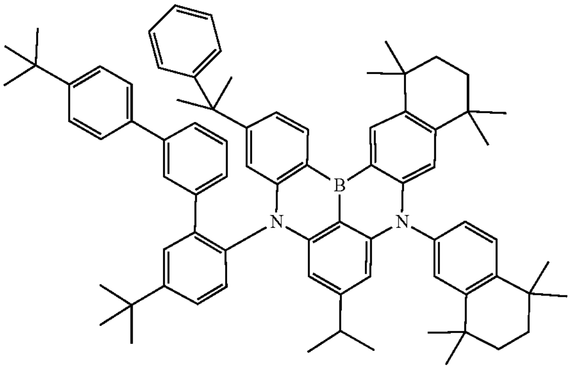
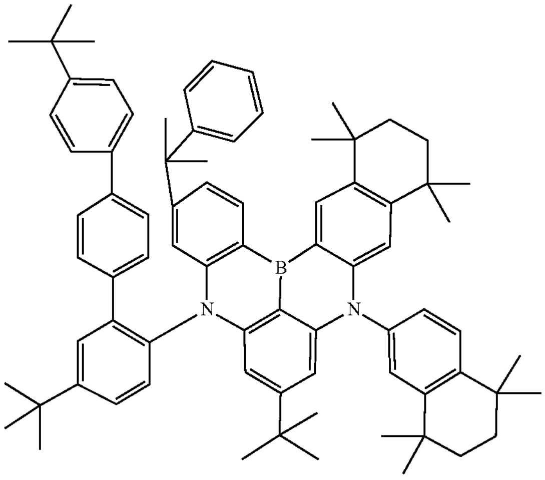
-continued
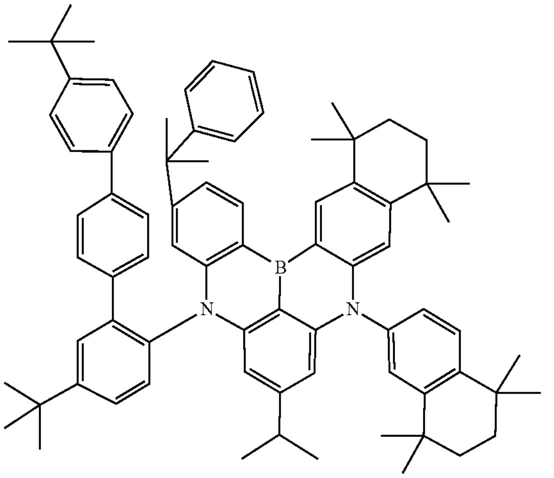
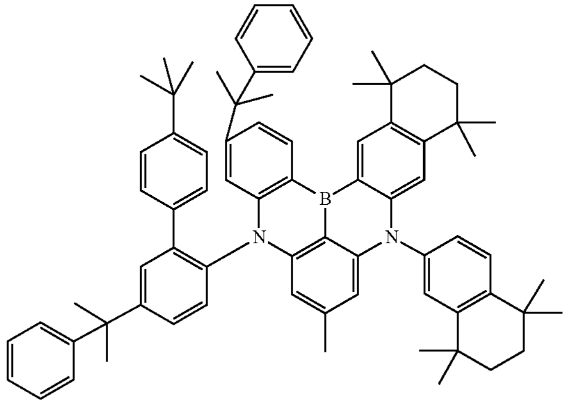
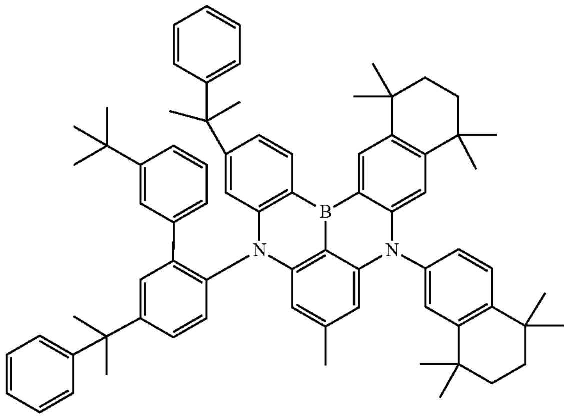
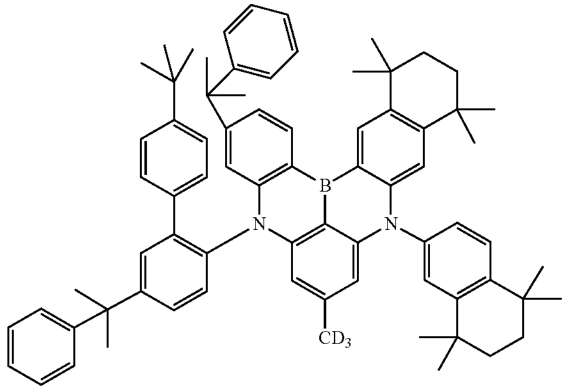

-continued
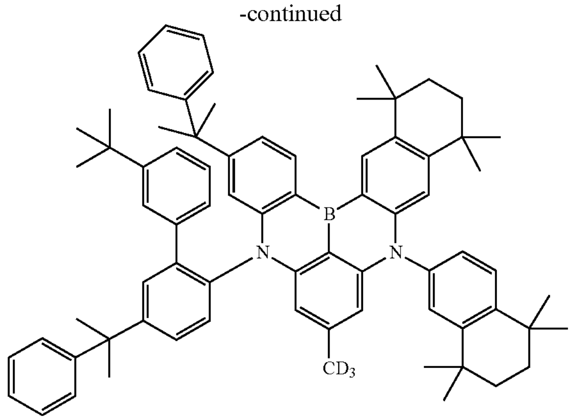
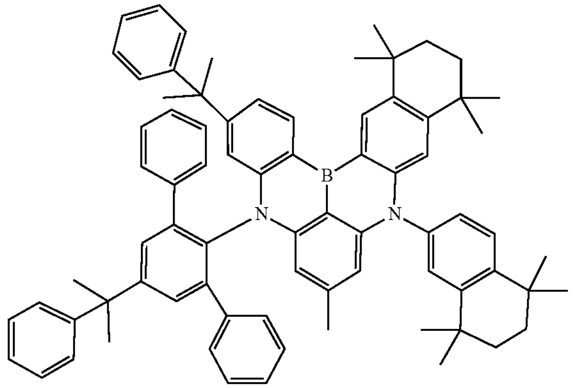
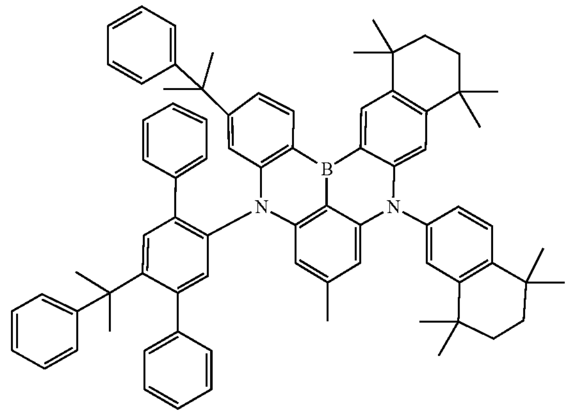
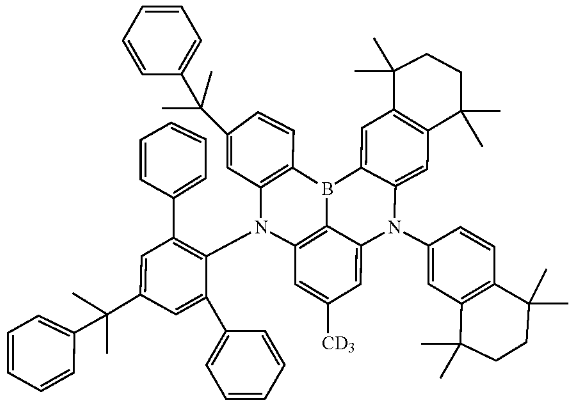
-continued
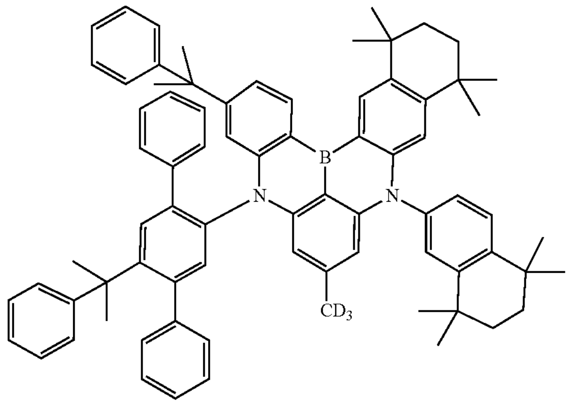
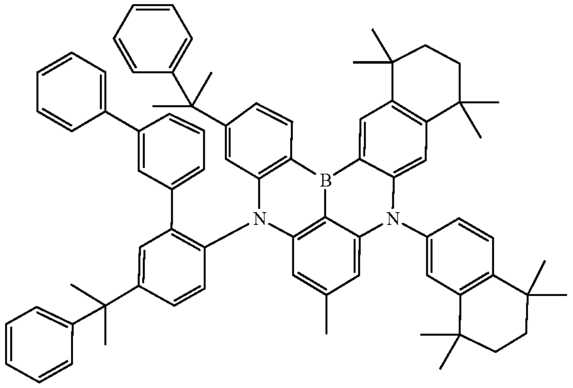
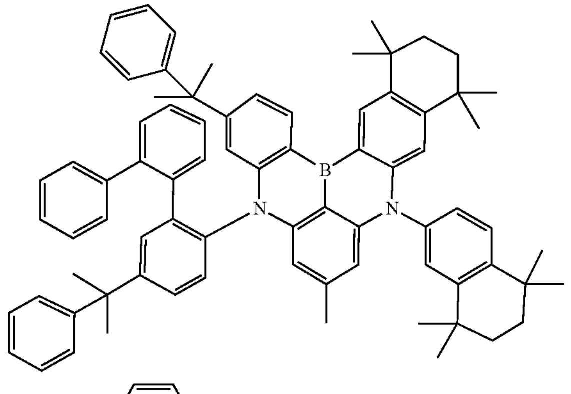
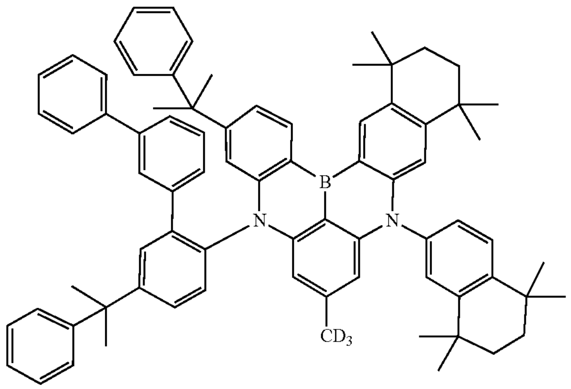

-continued
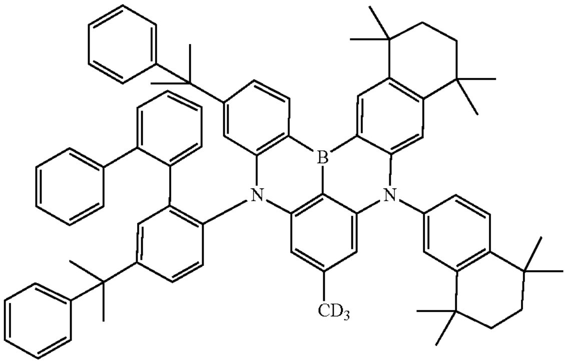
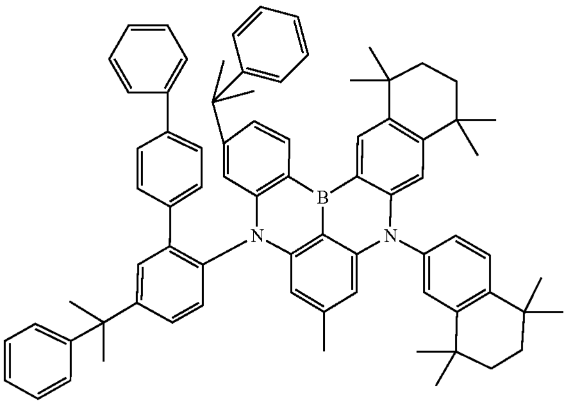
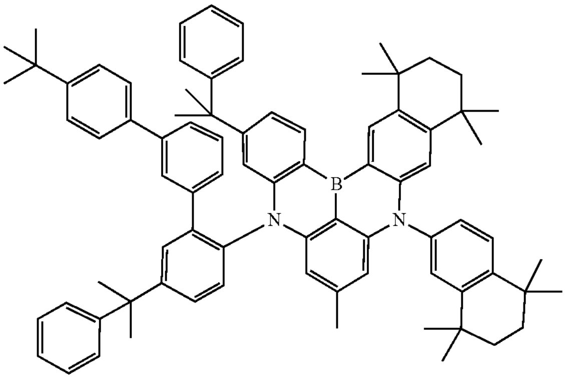
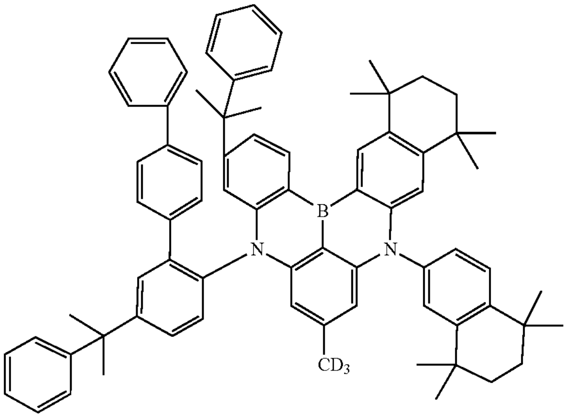
-continued
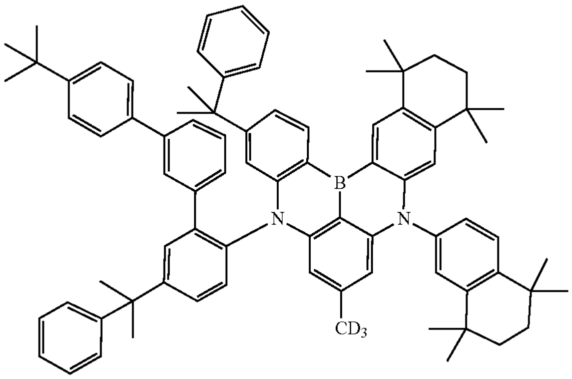
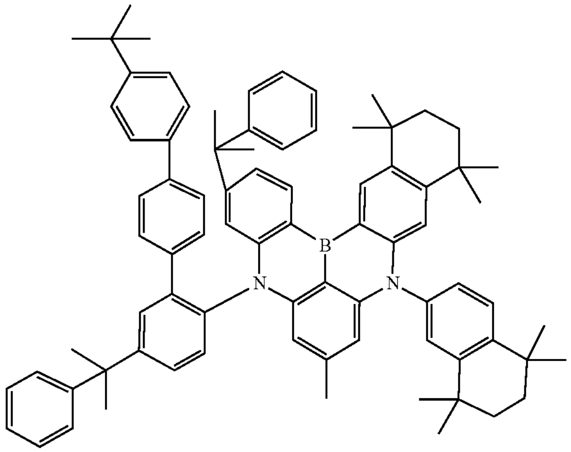
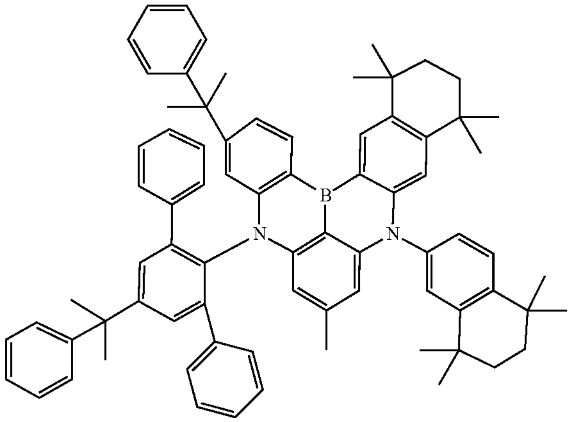
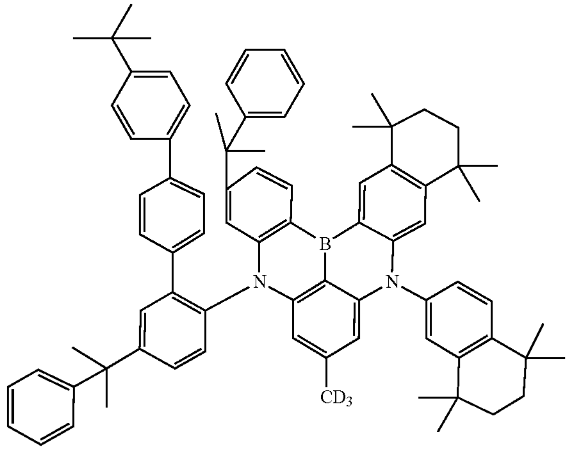

-continued
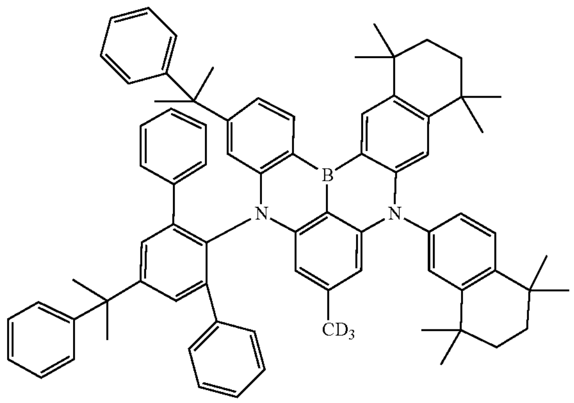
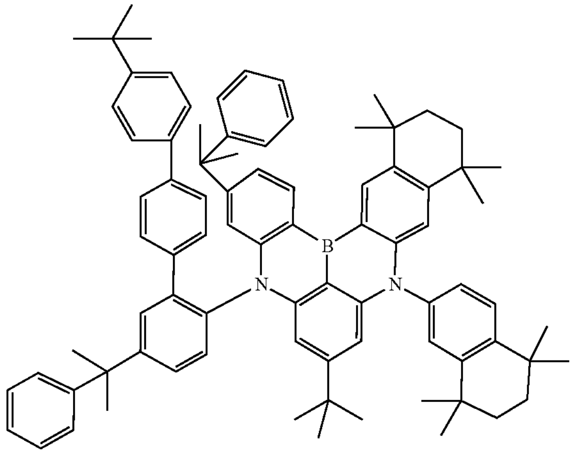
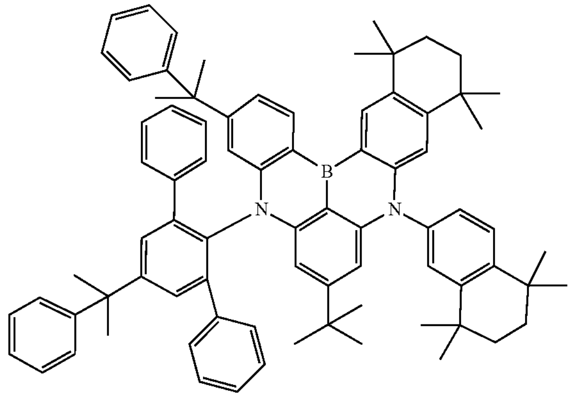
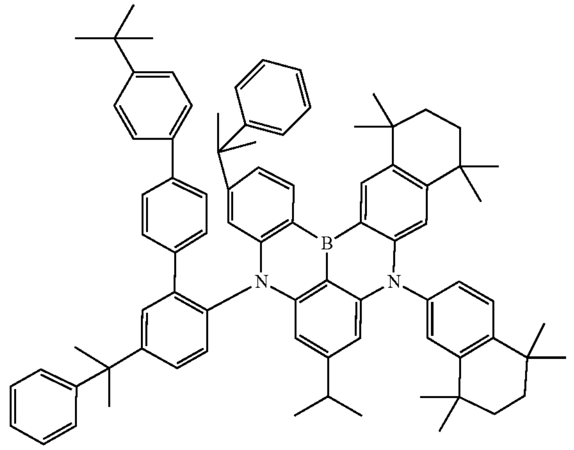
-continued
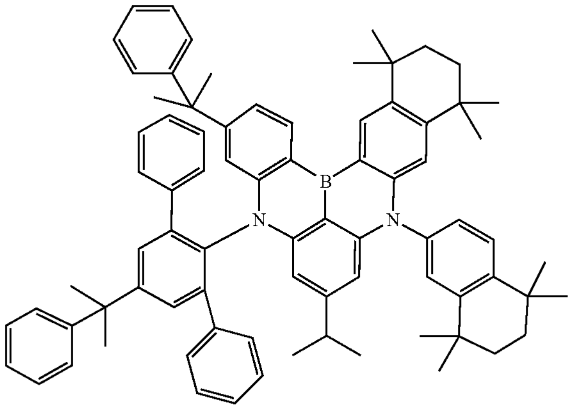
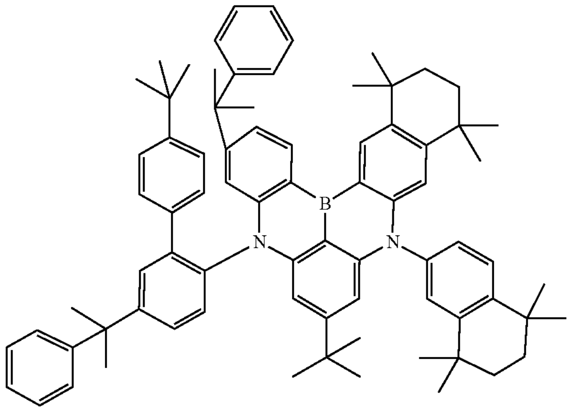
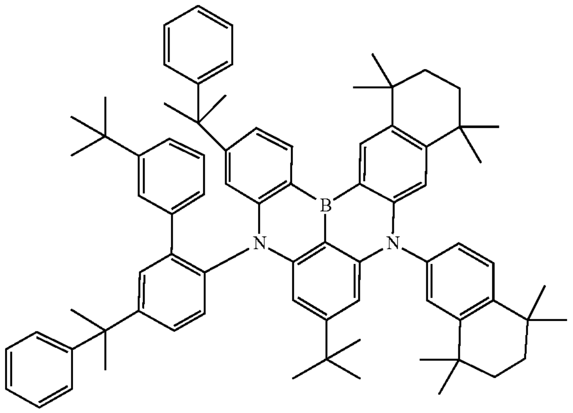
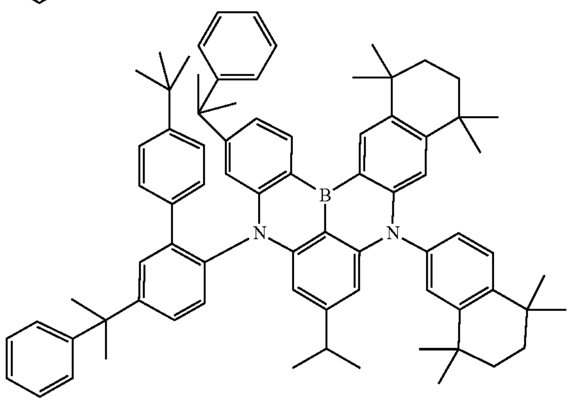

-continued
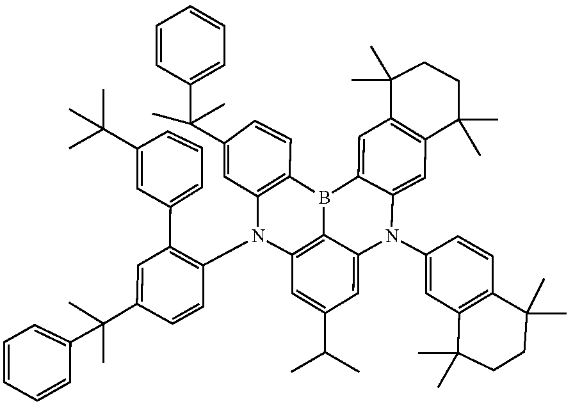
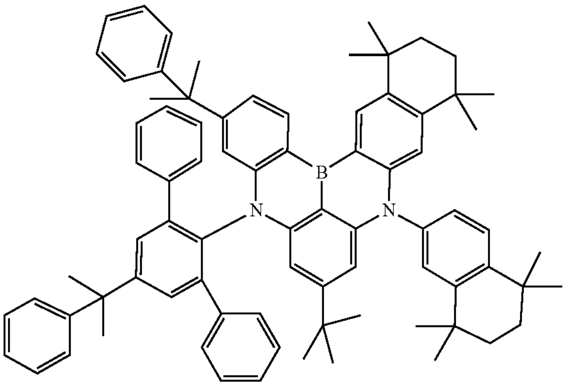
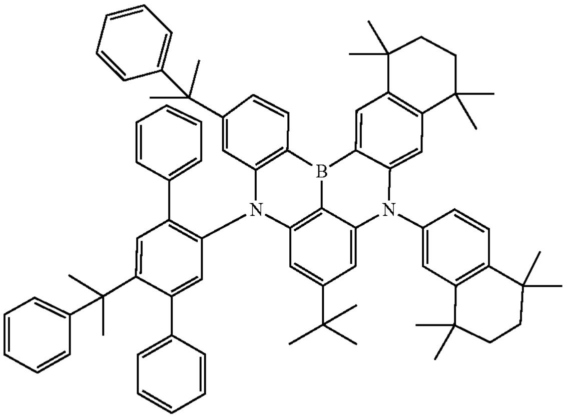
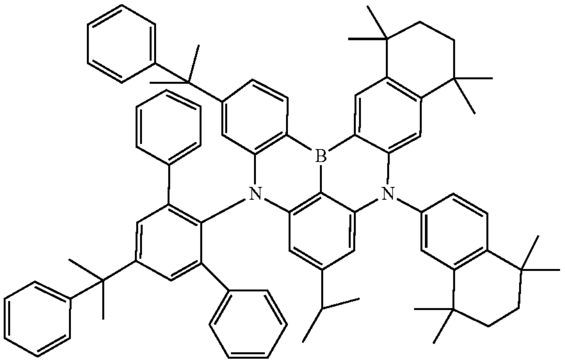
-continued
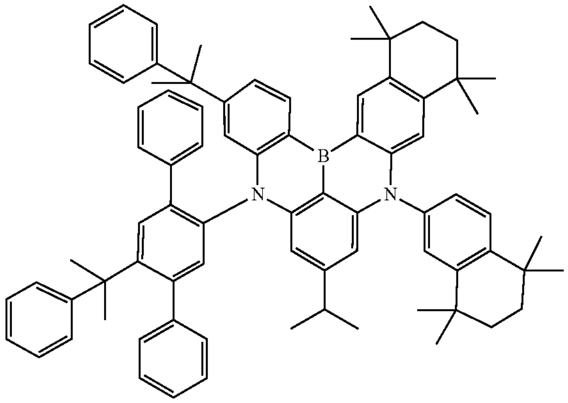
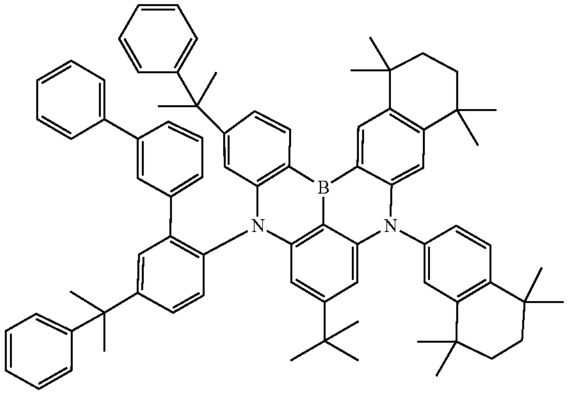
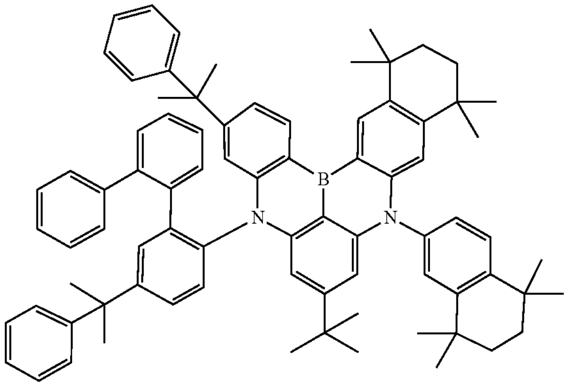
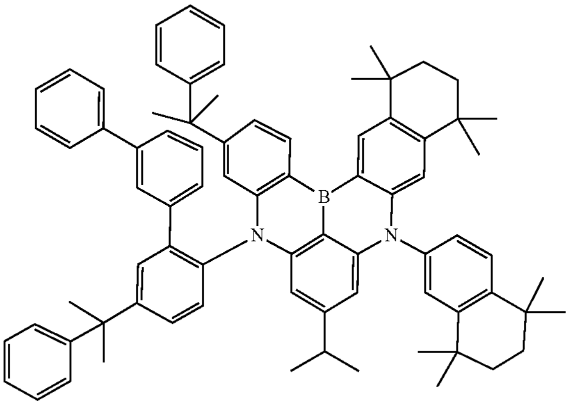

-continued
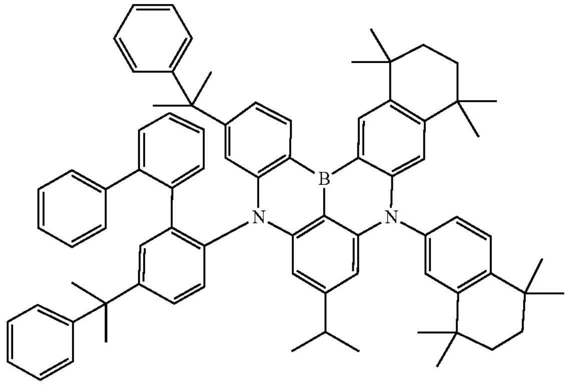
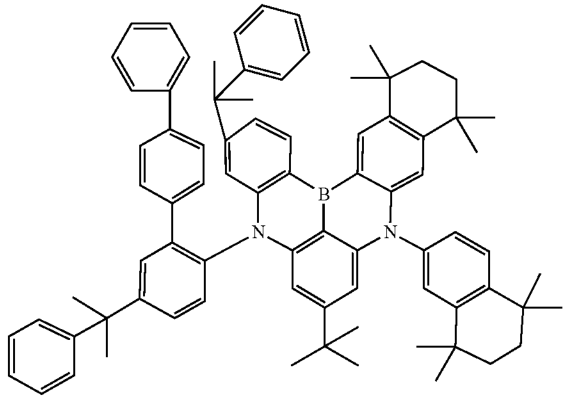
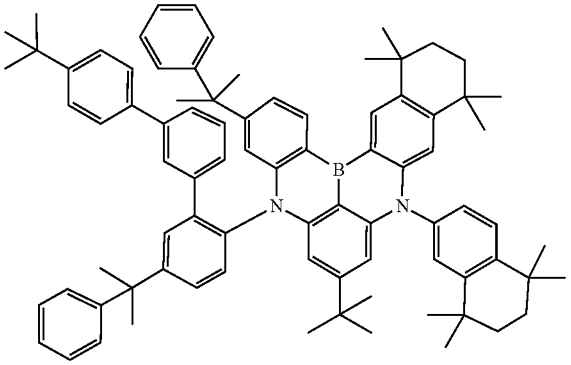
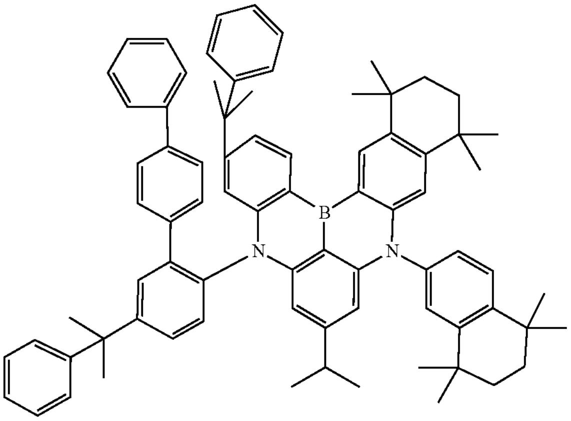
-continued
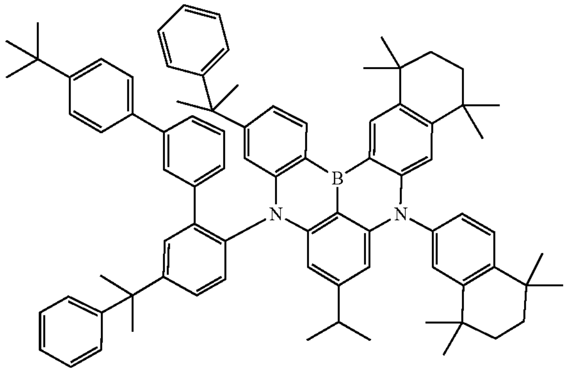
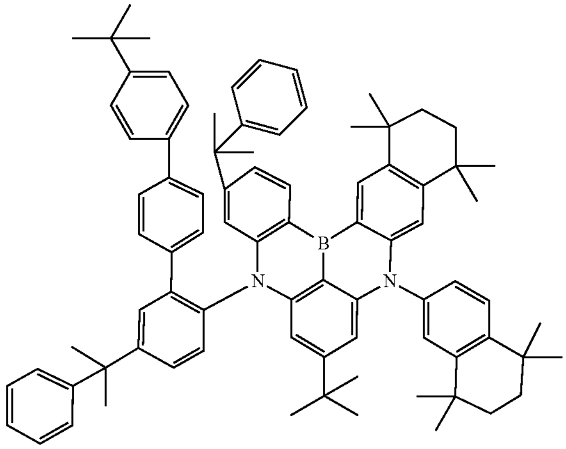
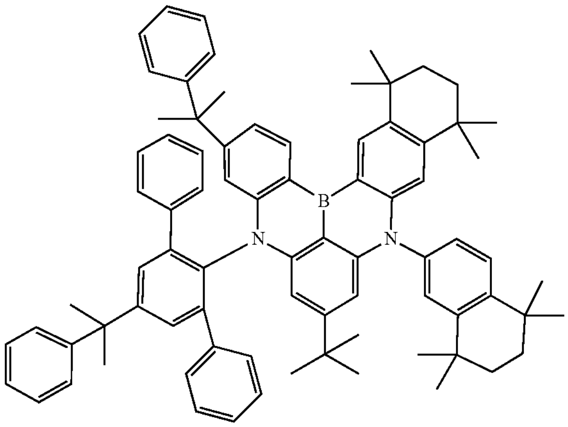
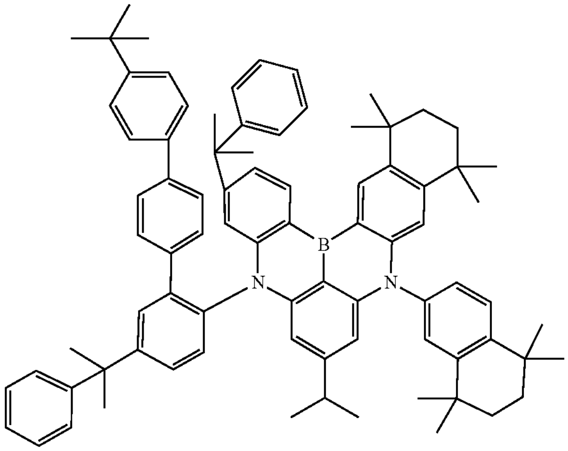

-continued
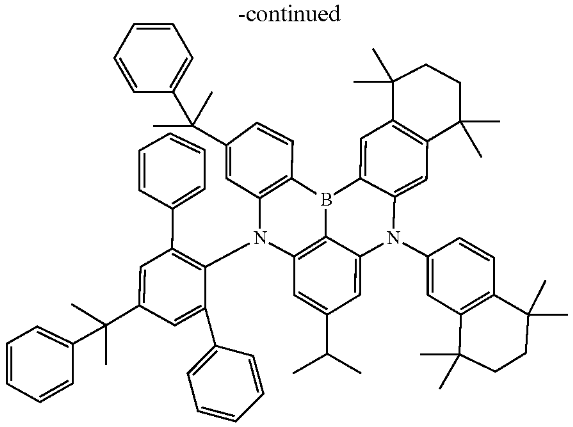
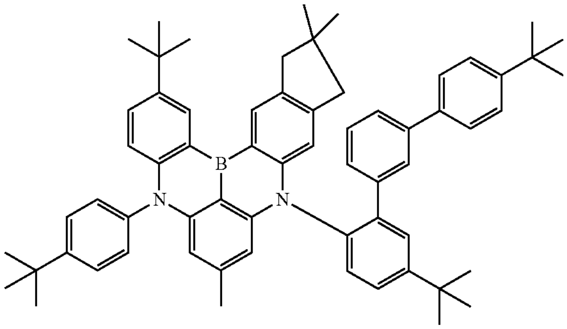
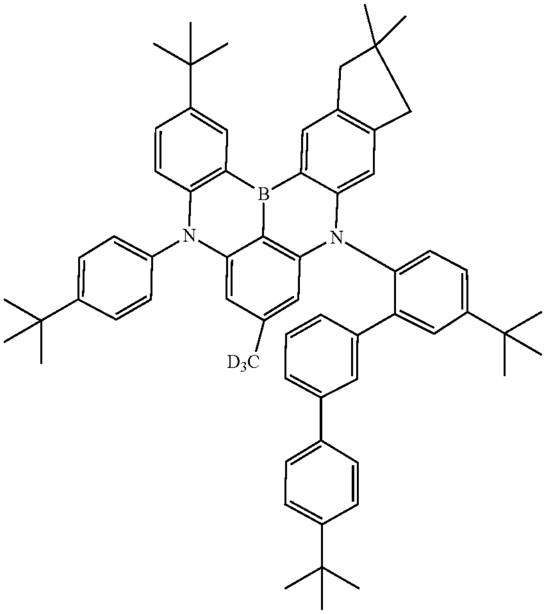
-continued
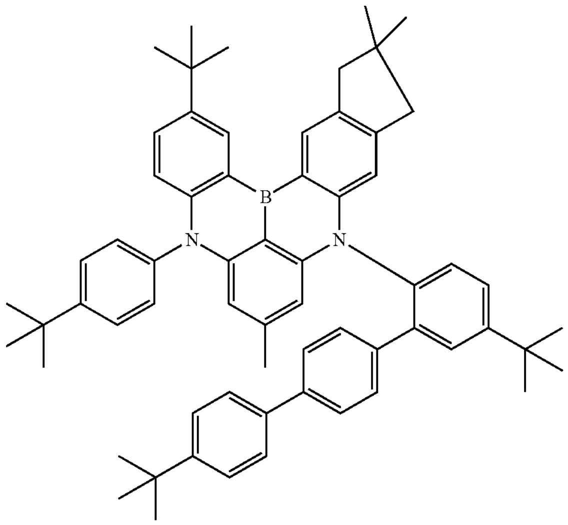
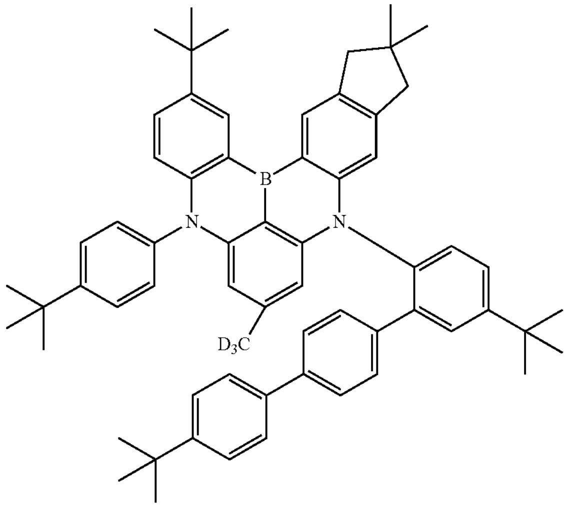
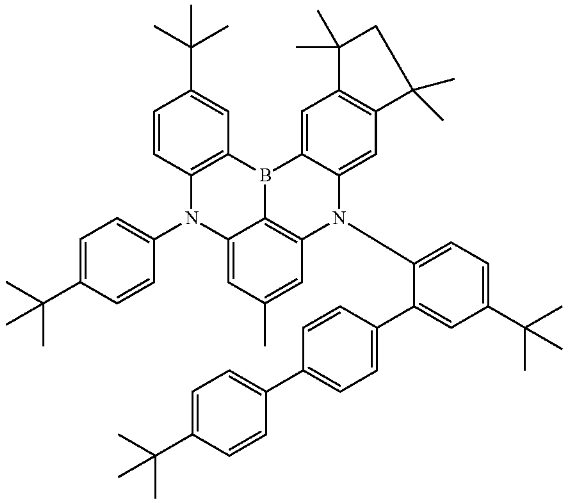

-continued
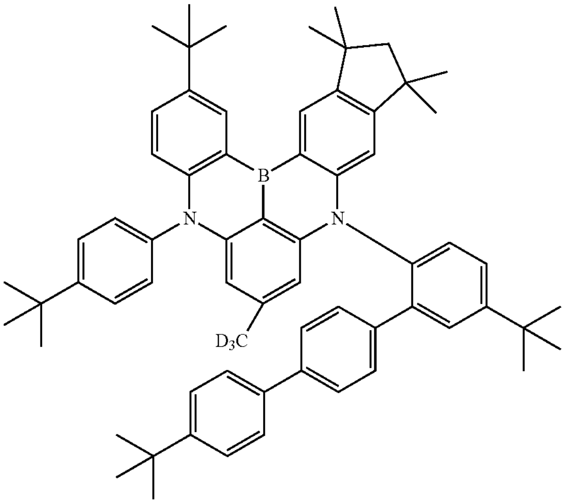
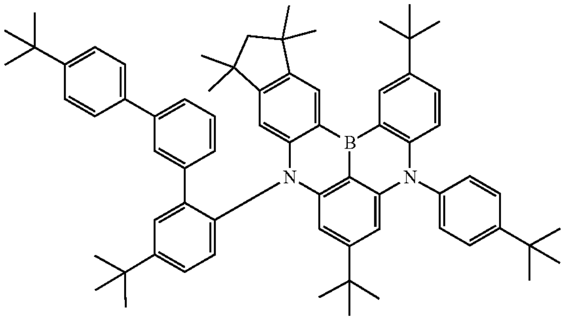
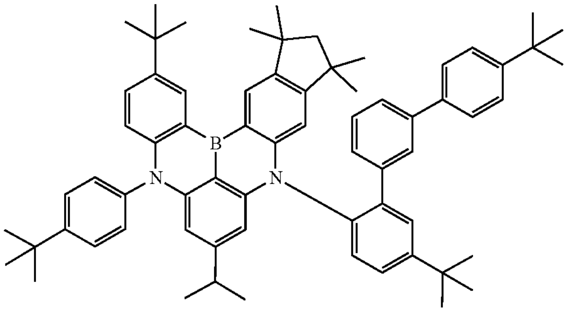
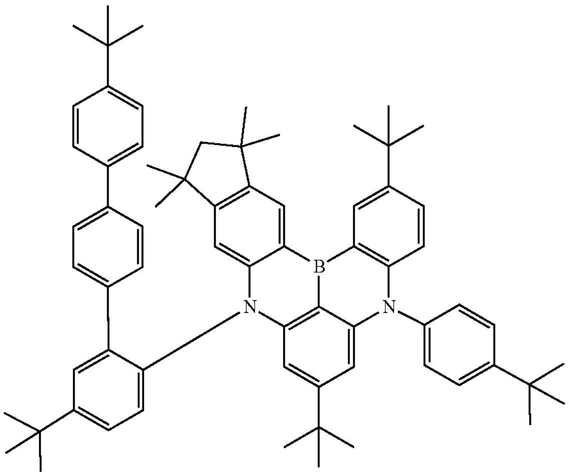
-continued
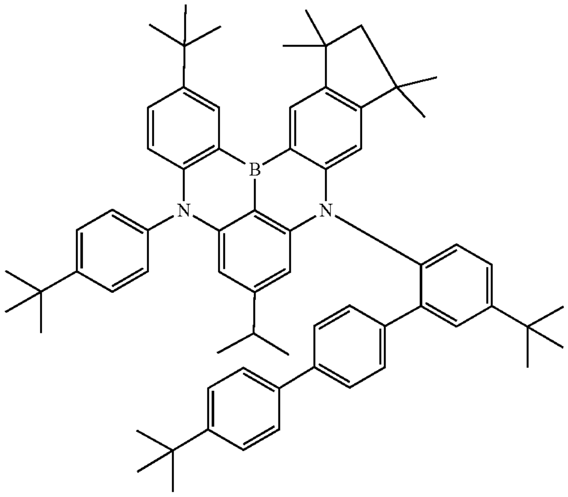
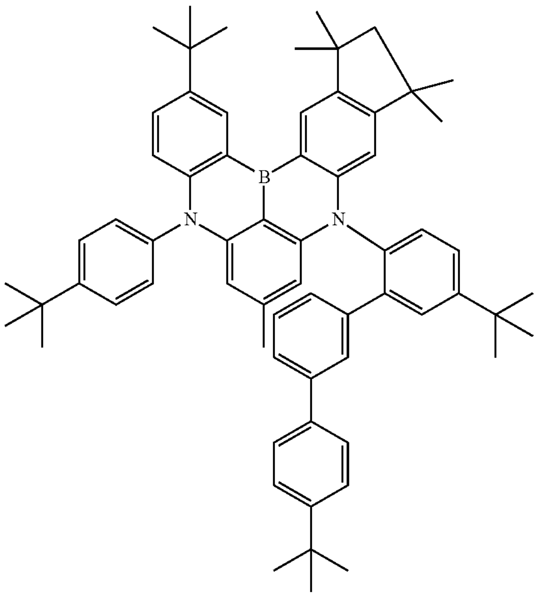
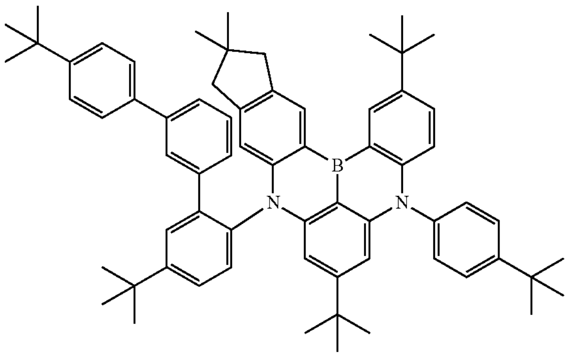

-continued
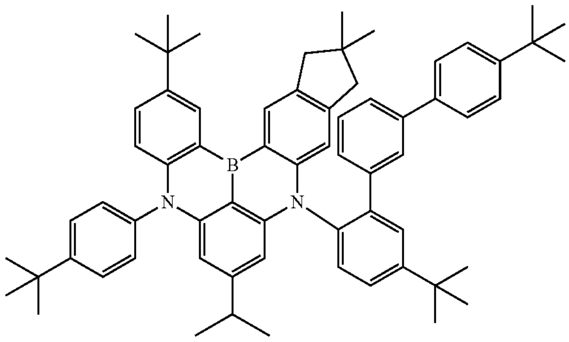
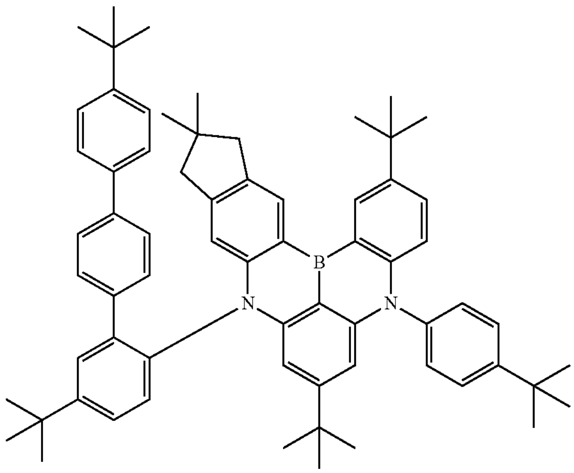
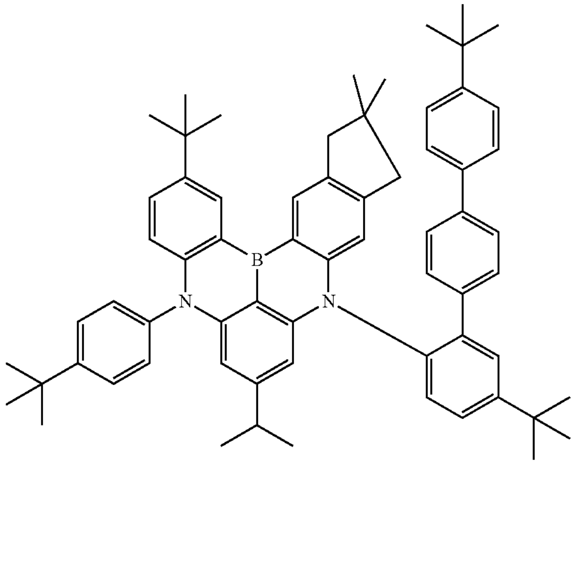
-continued
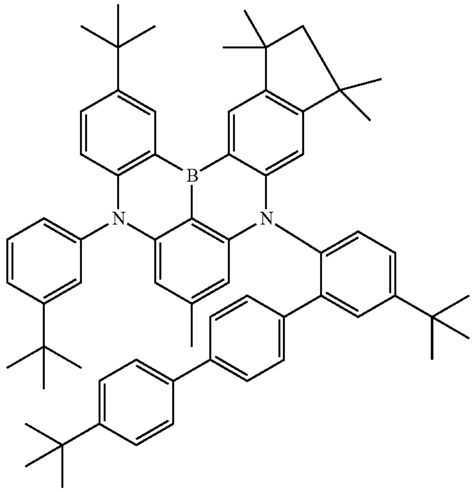
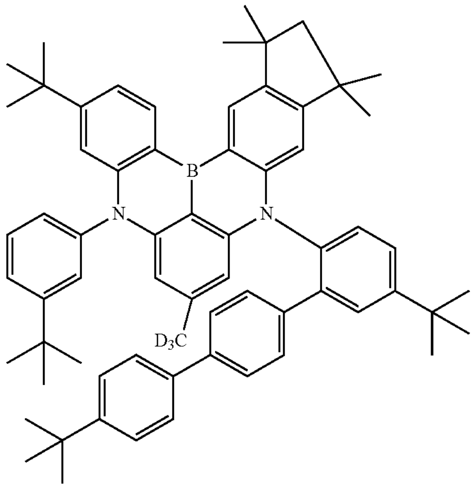
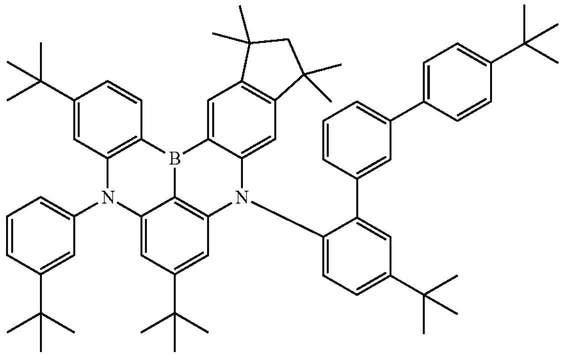
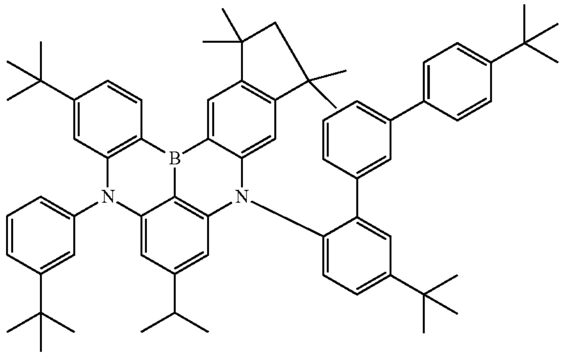

-continued
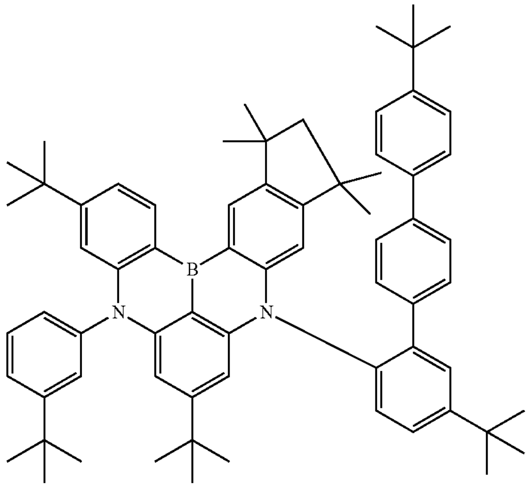
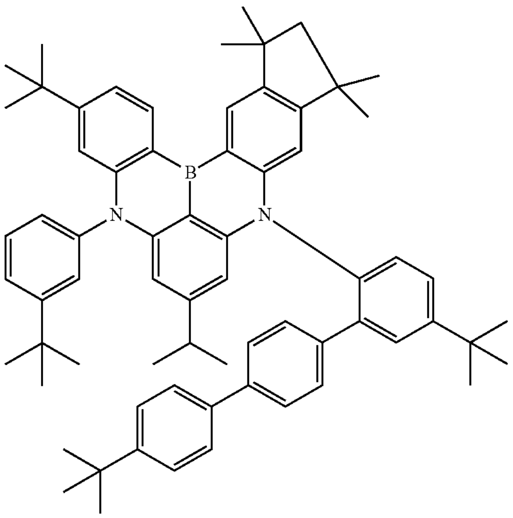
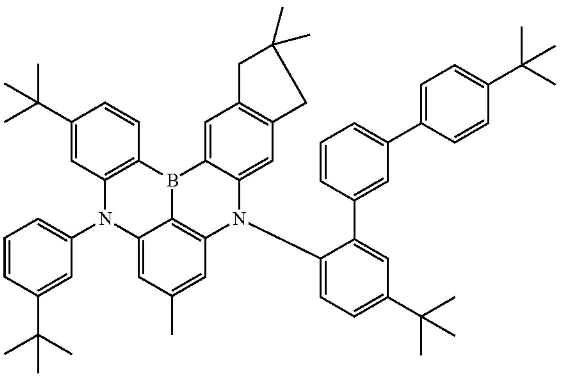
-continued
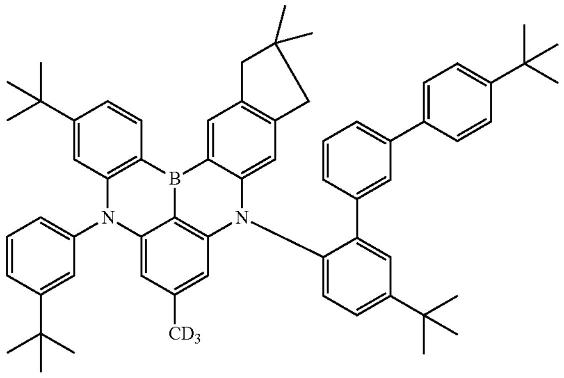
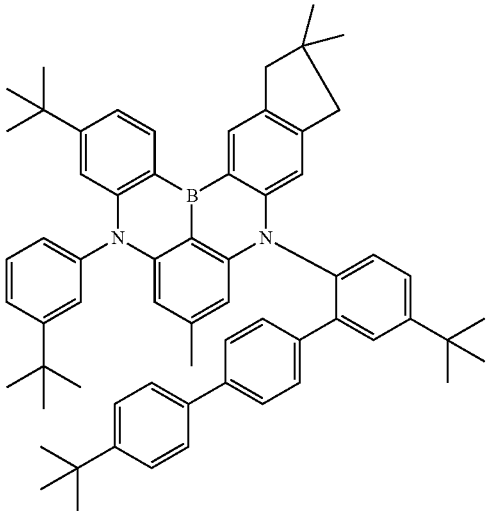
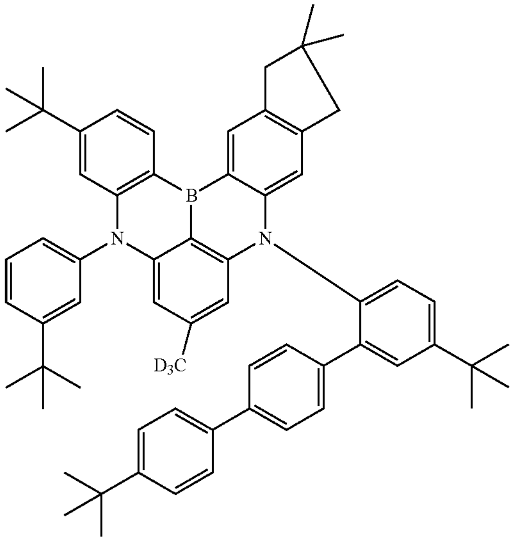

-continued
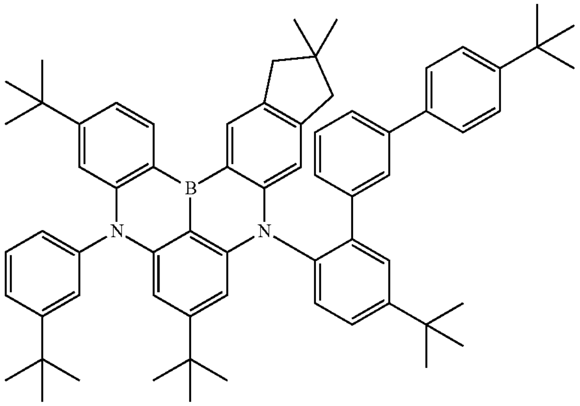
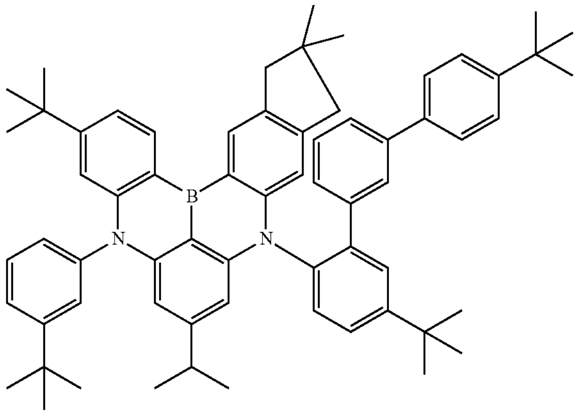
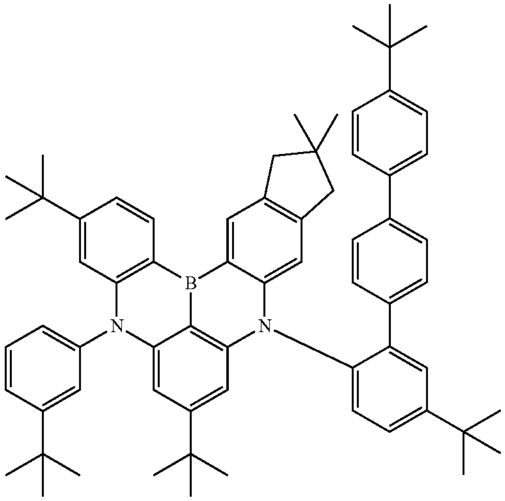
-continued
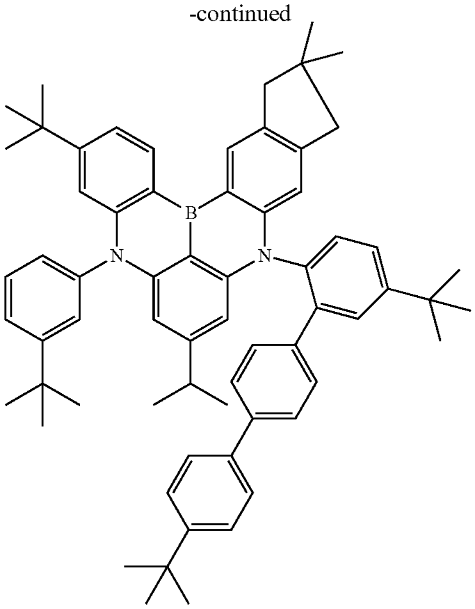
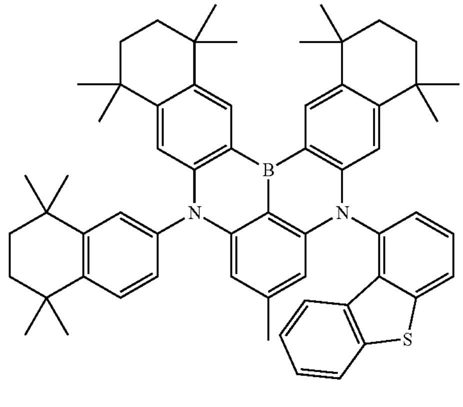
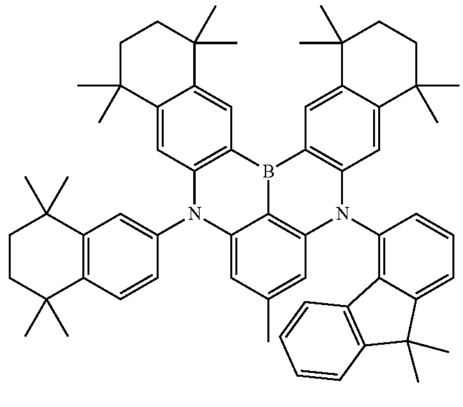

-continued
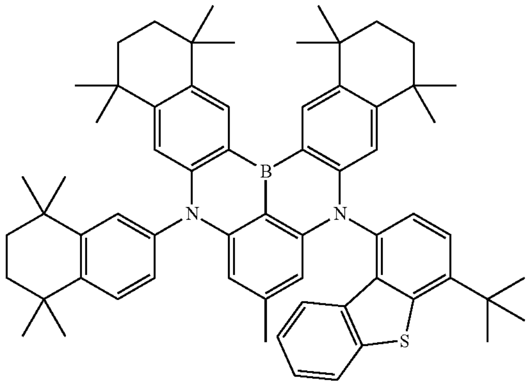
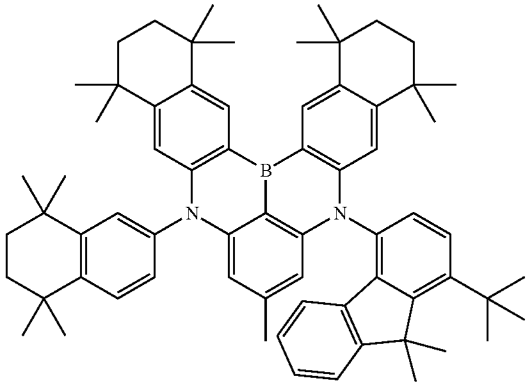
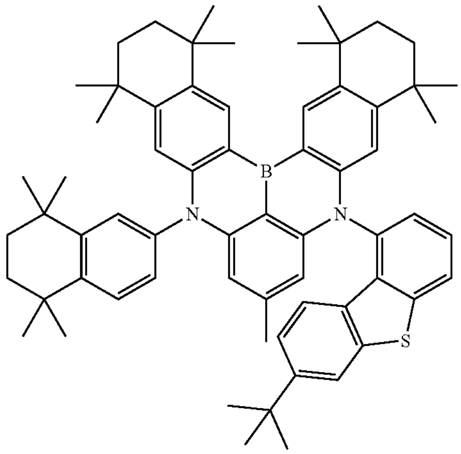
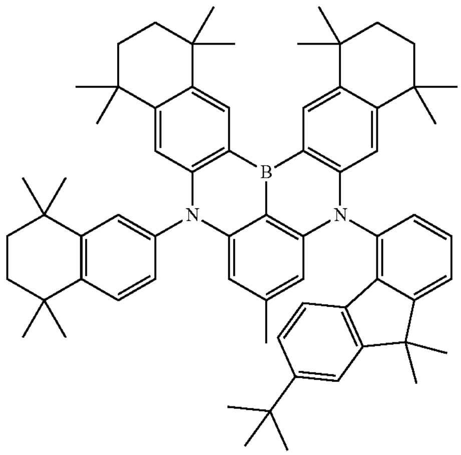
-continued
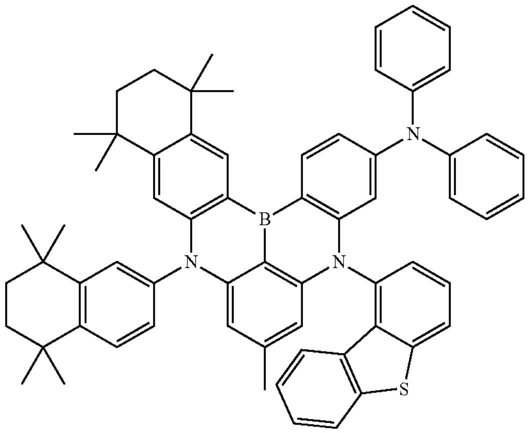
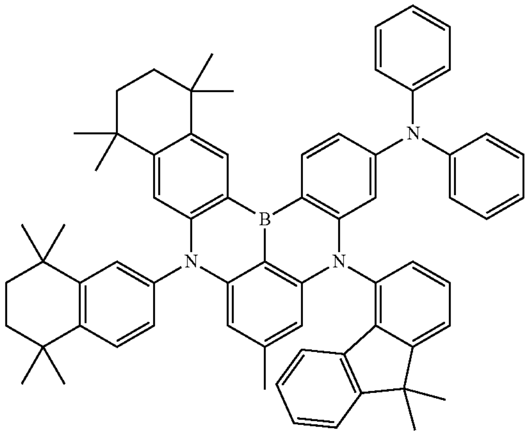
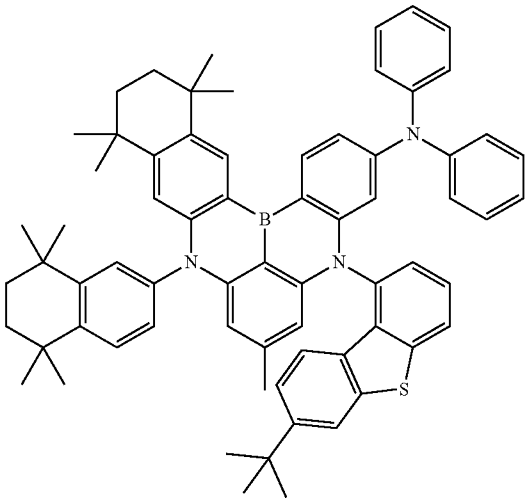

-continued
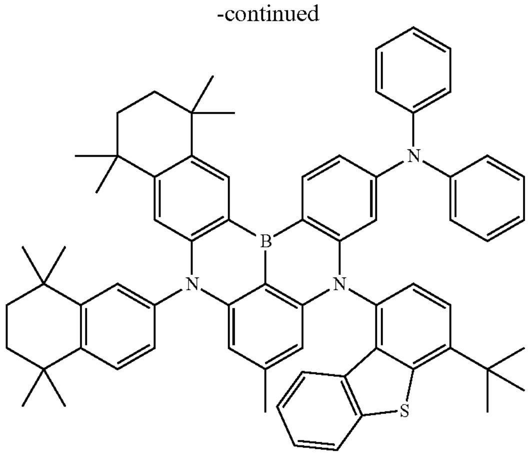
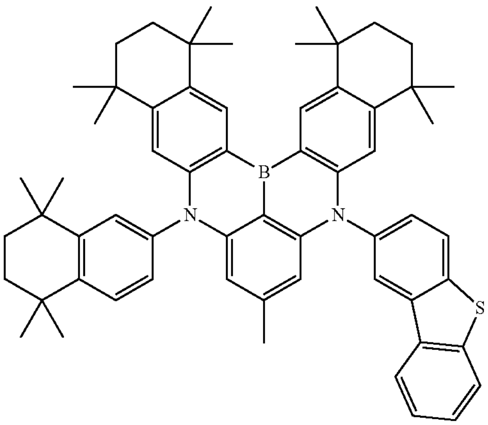
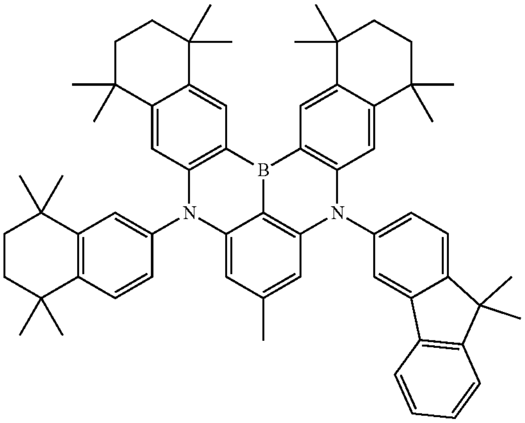
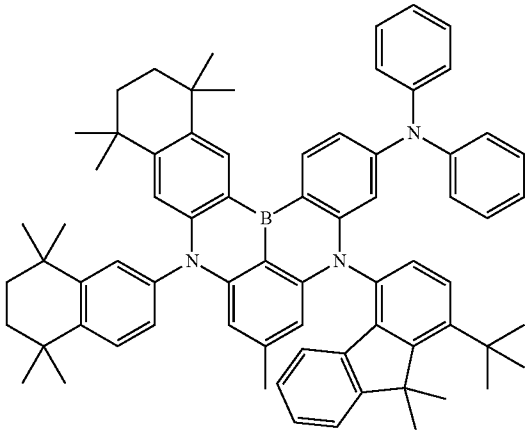
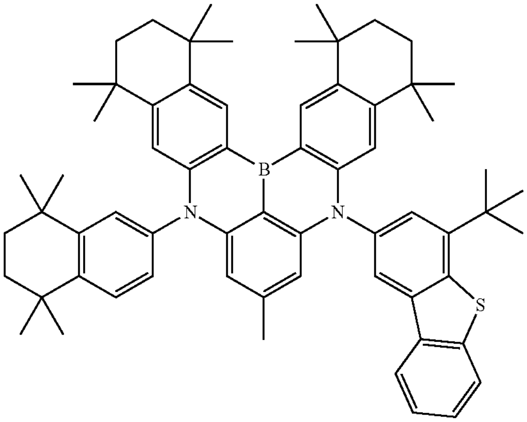
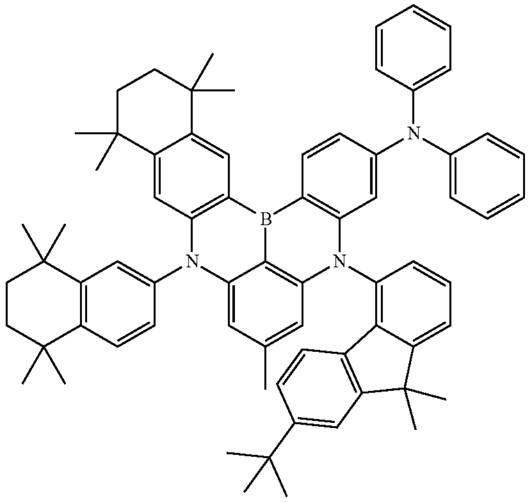
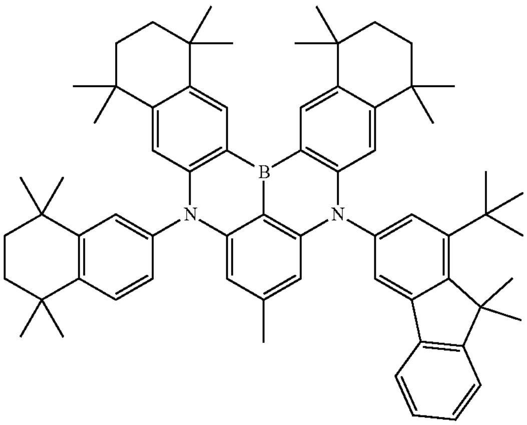

-continued
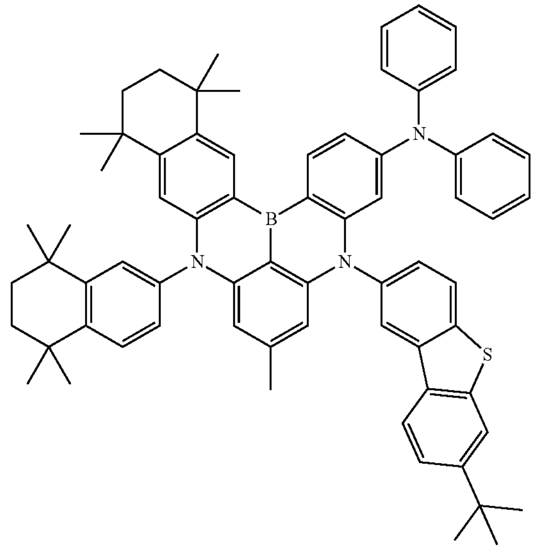
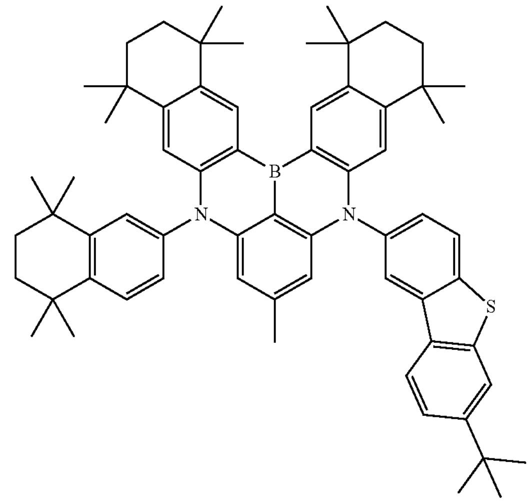
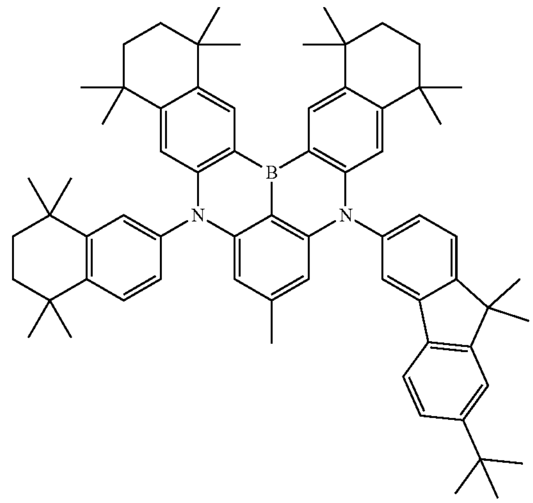
-continued
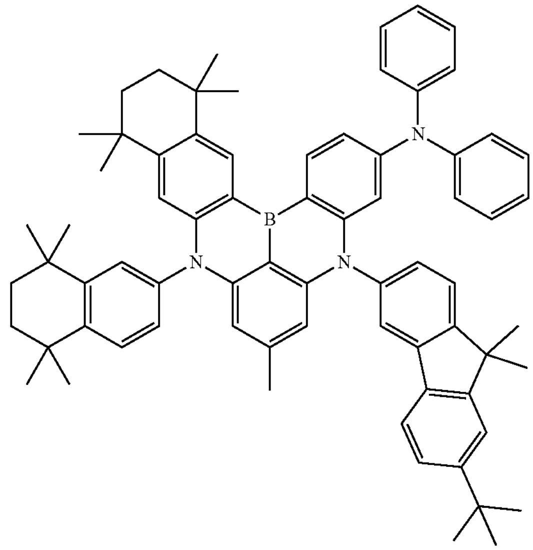
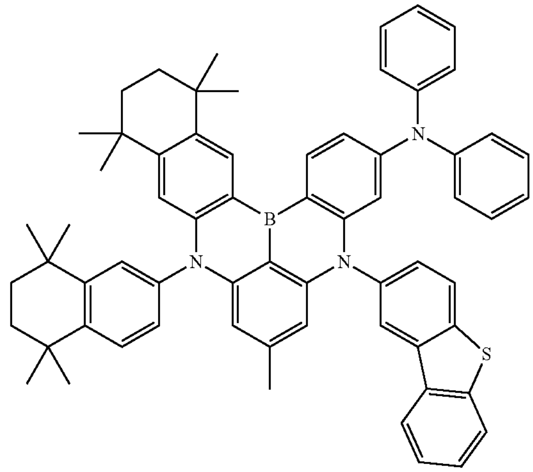
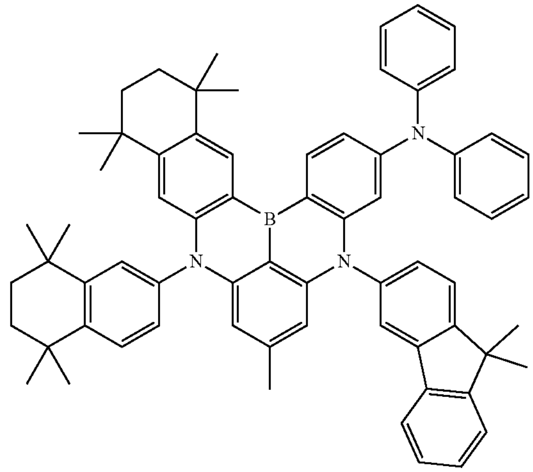

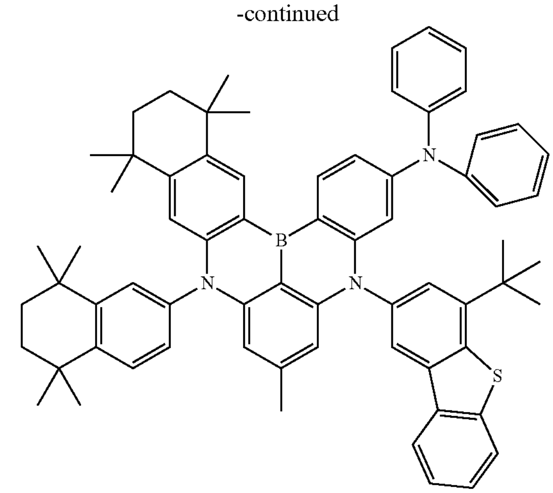
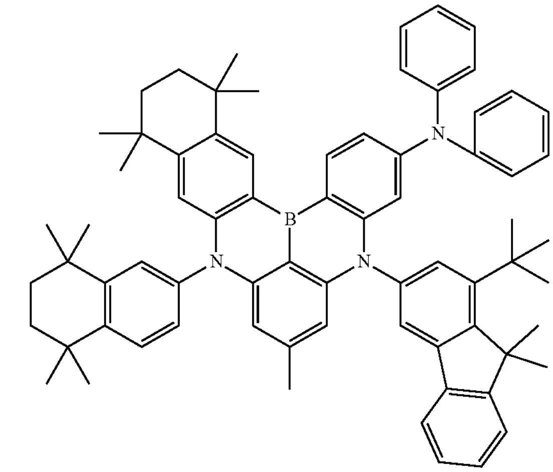
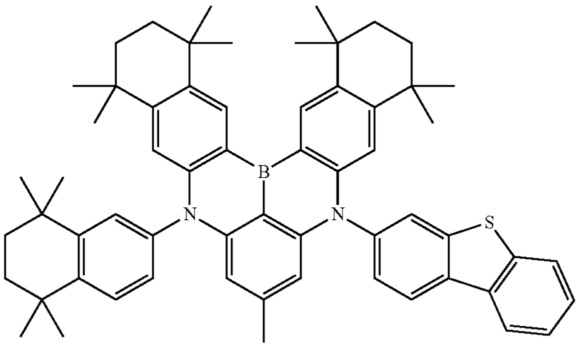
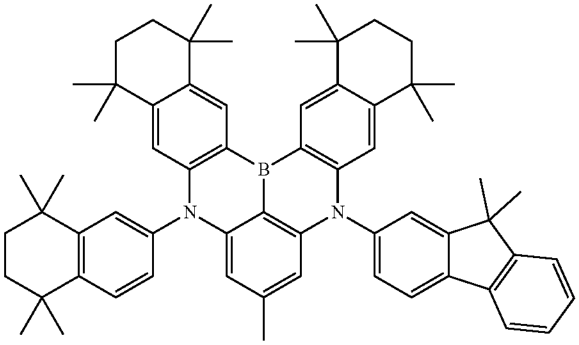
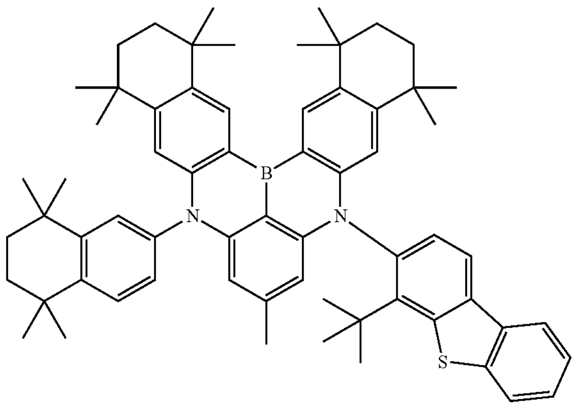
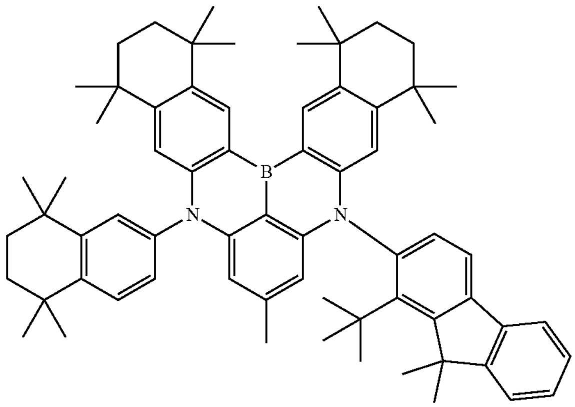
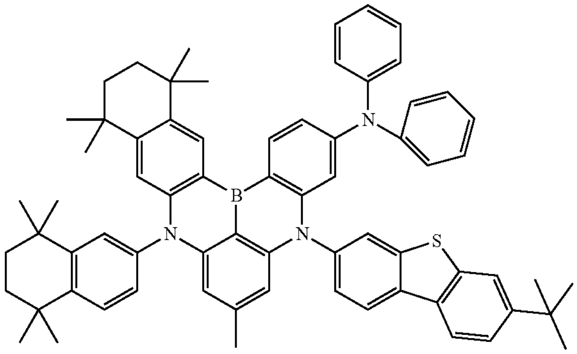
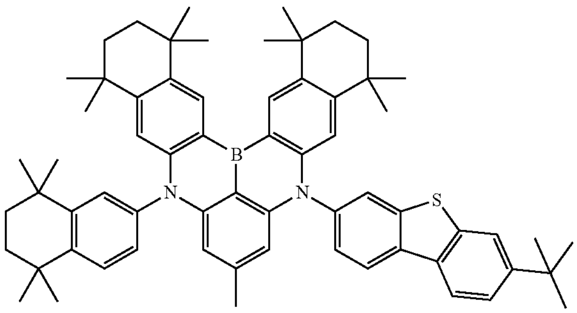

-continued
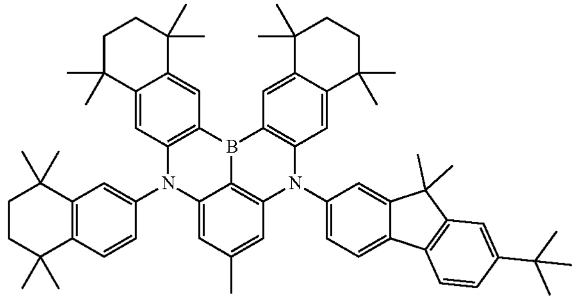
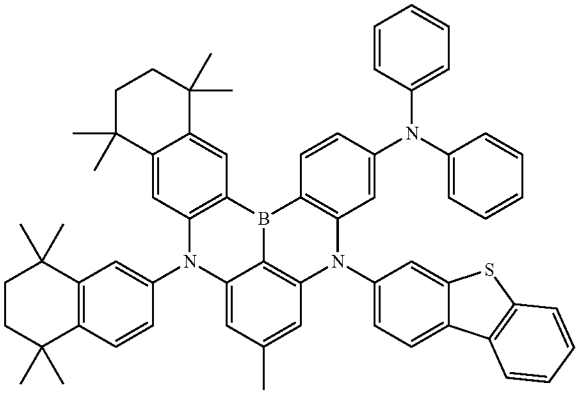
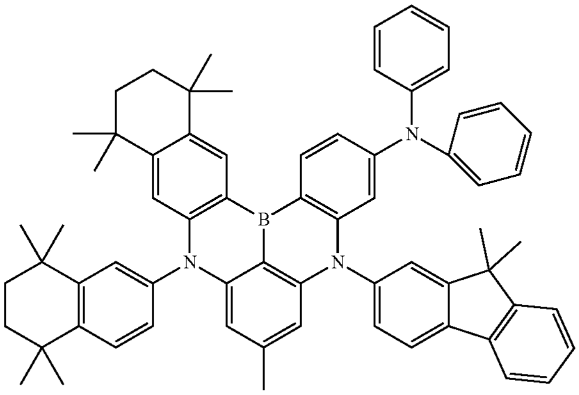
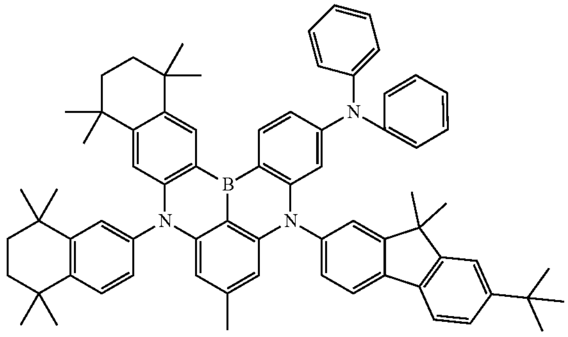
-continued
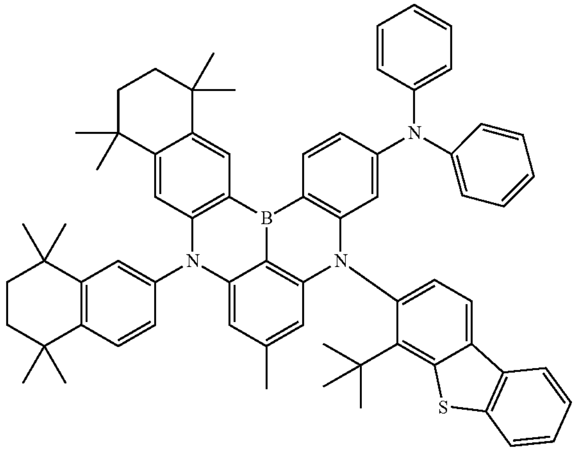
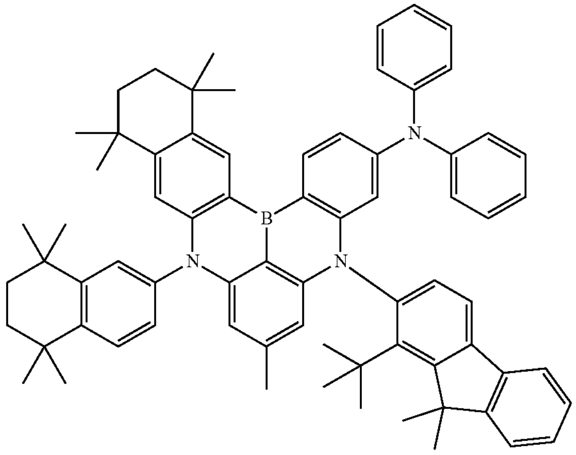
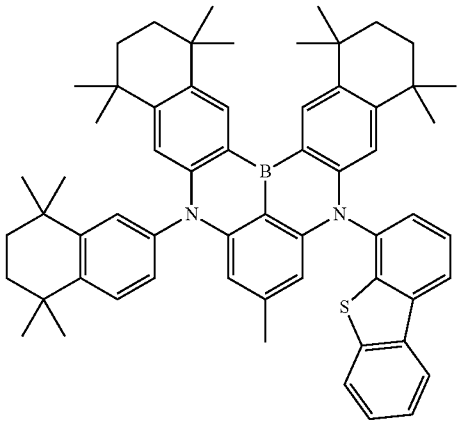

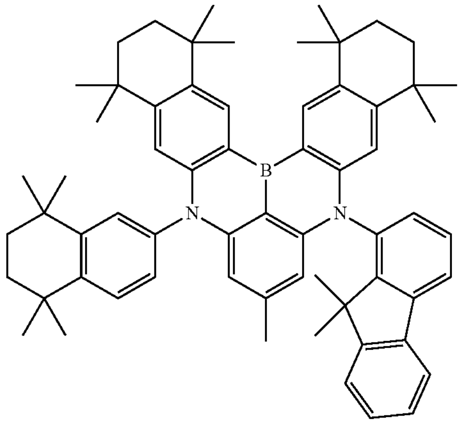
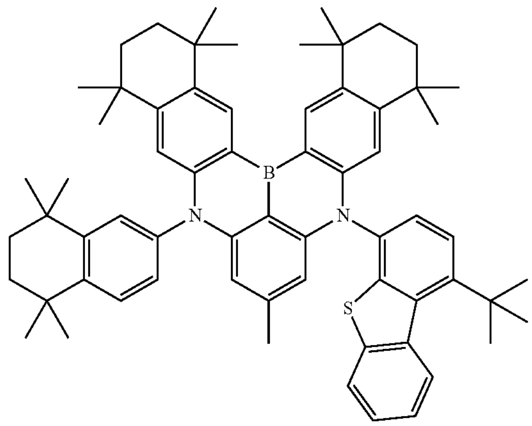
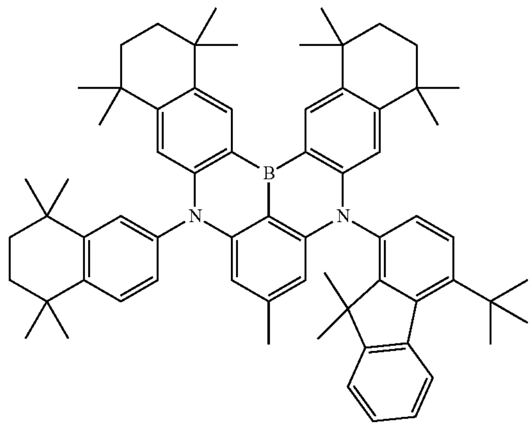
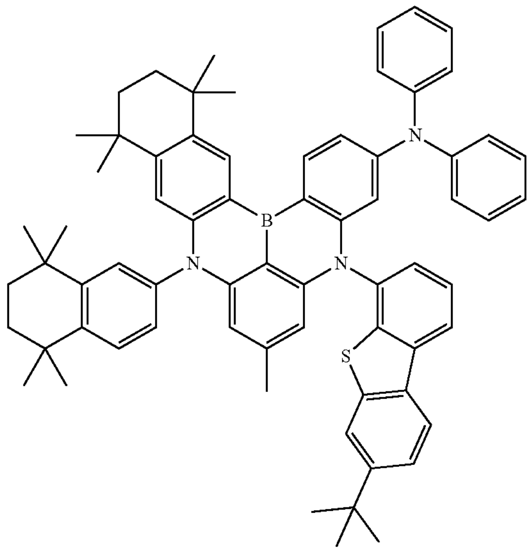
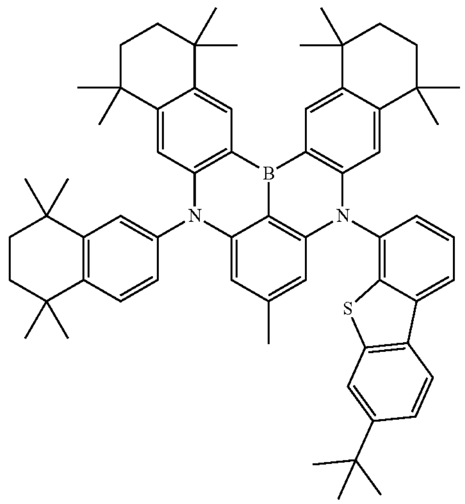
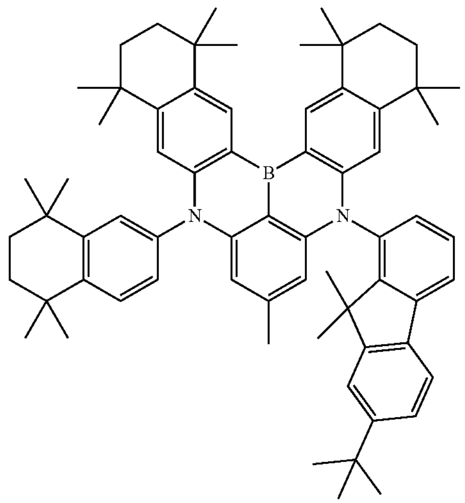

-continued
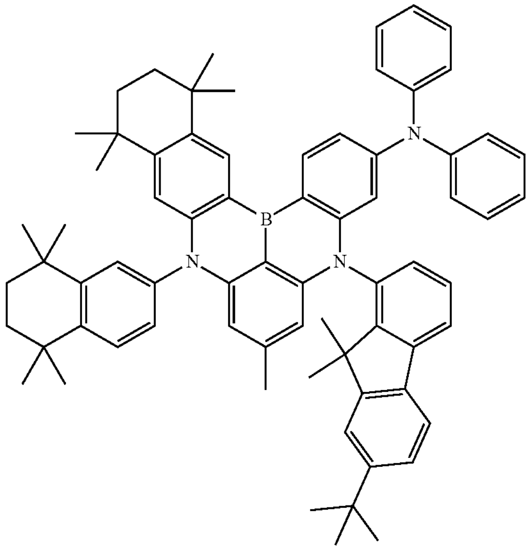
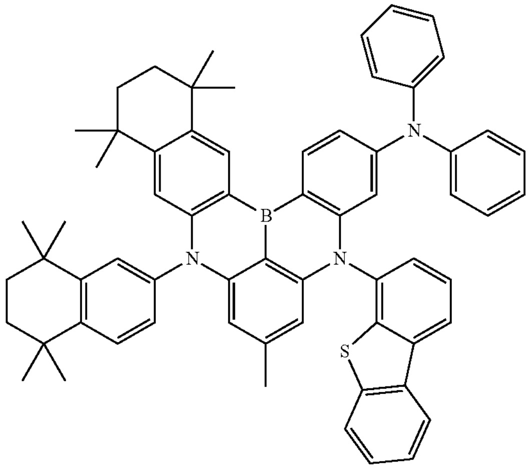
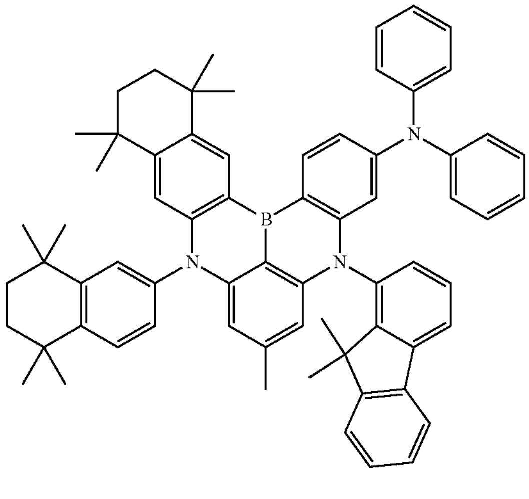
-continued
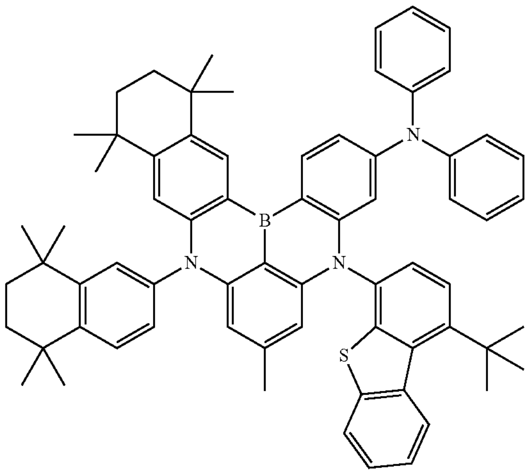
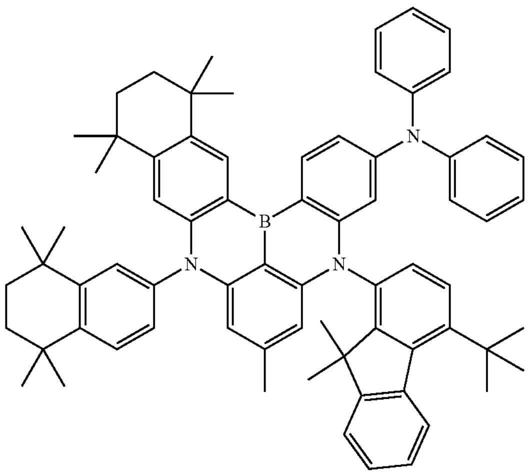
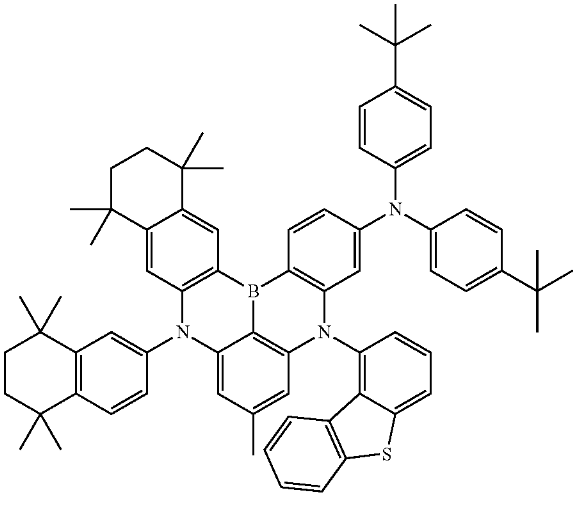

-continued
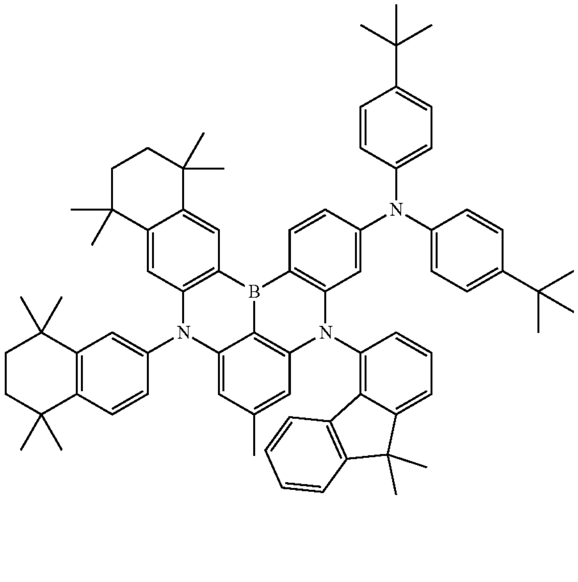
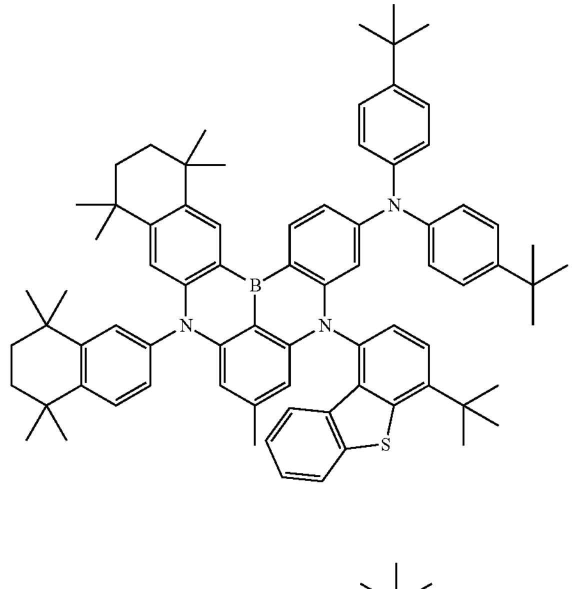
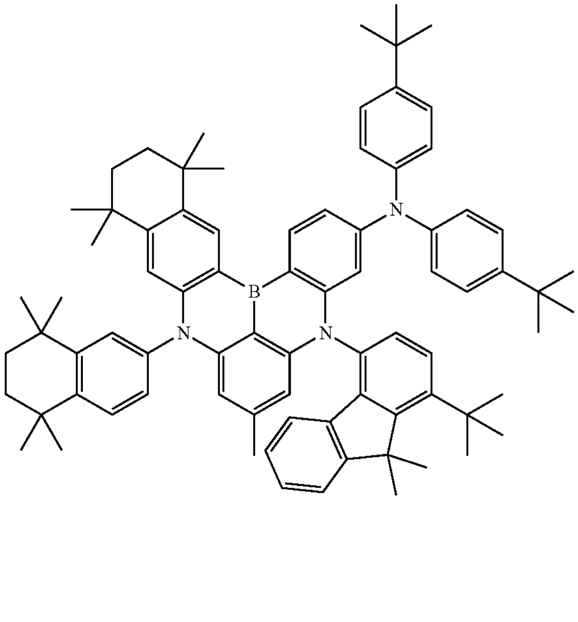
-continued
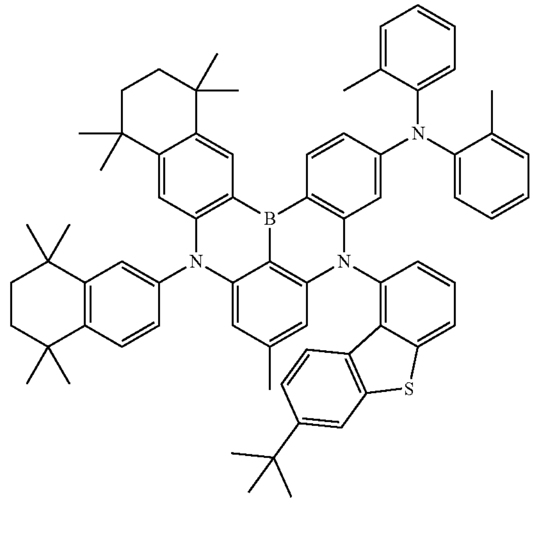
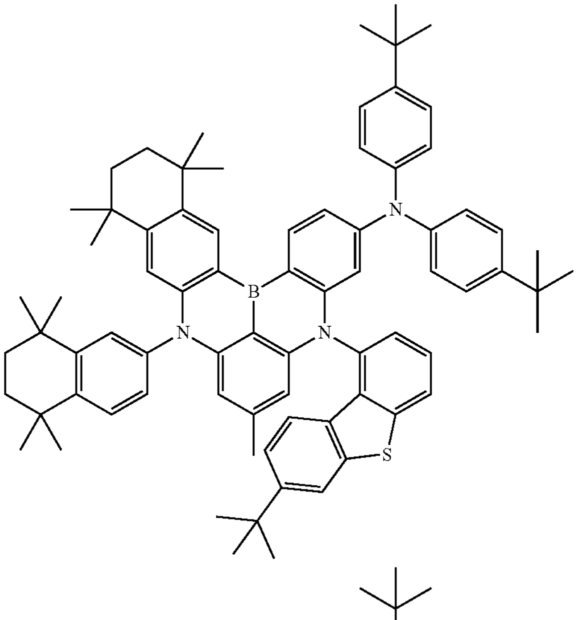
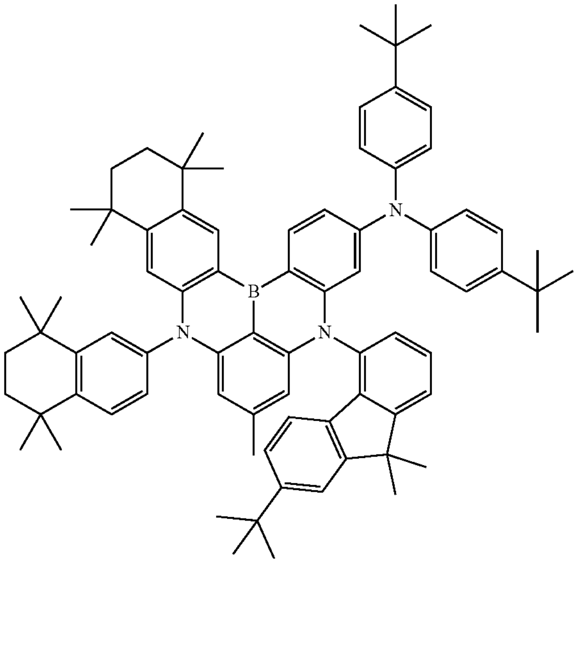

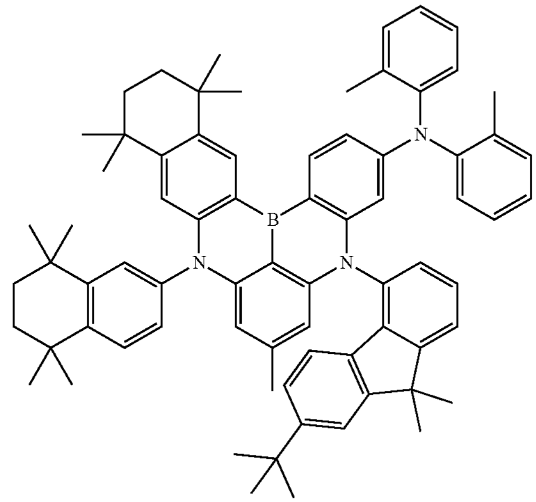
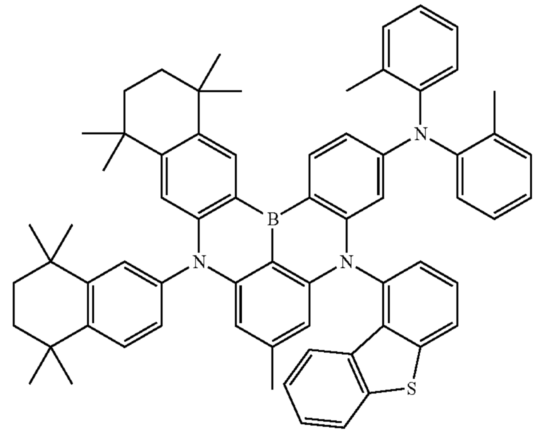
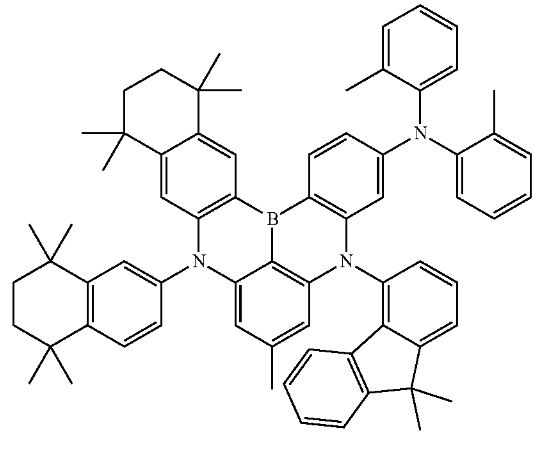
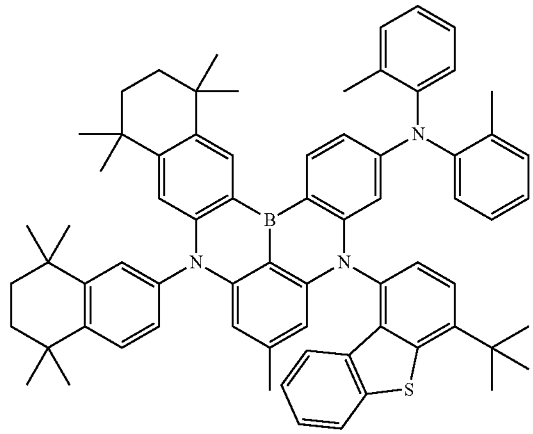
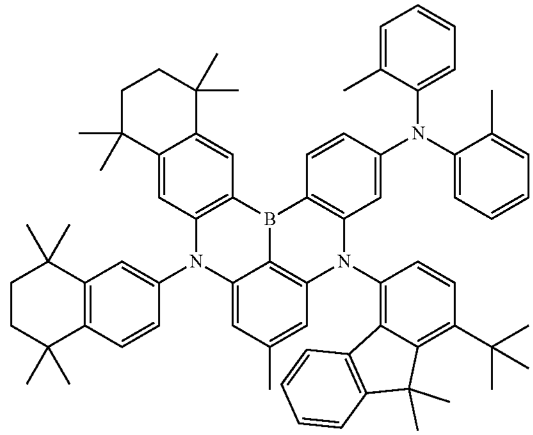
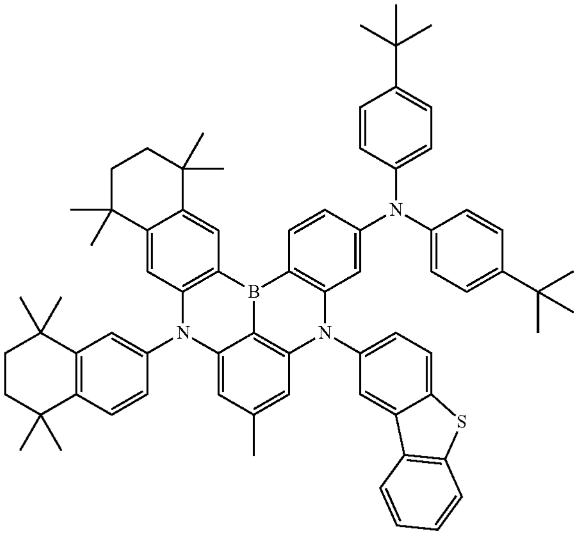

-continued
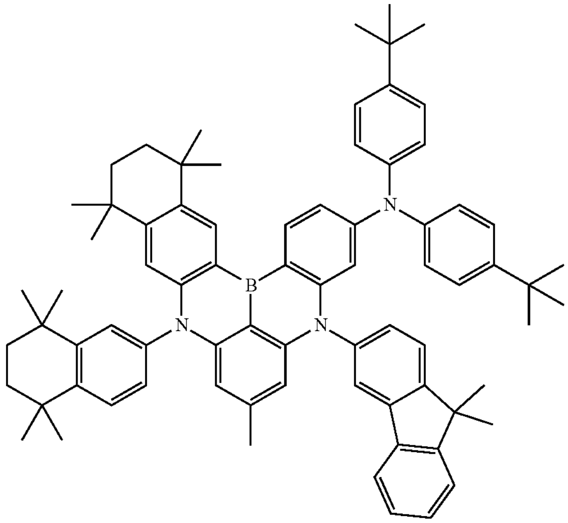
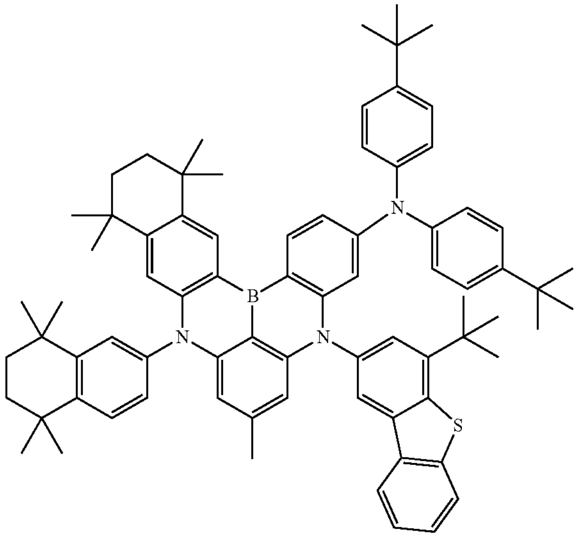
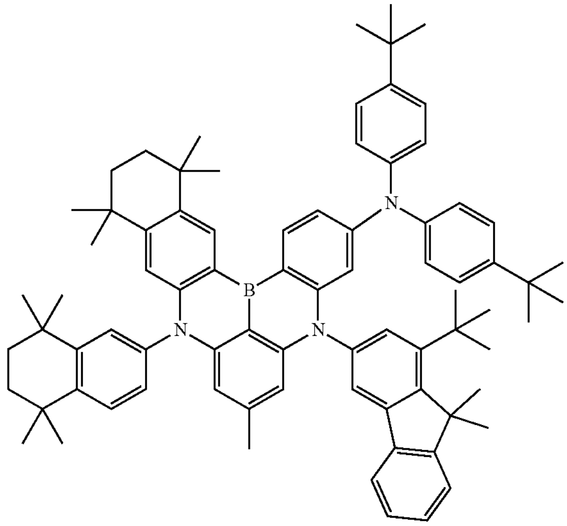
-continued
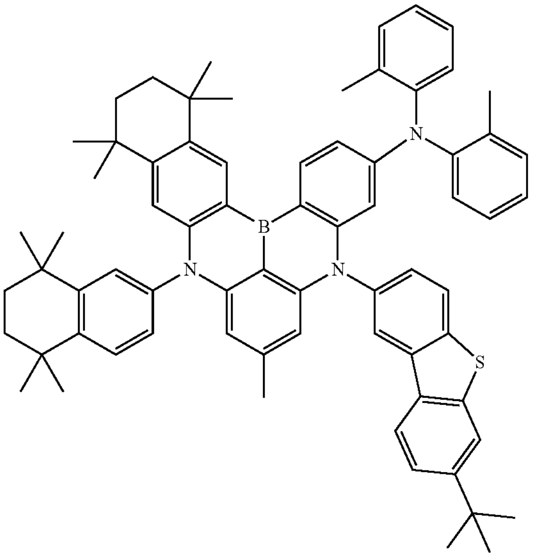
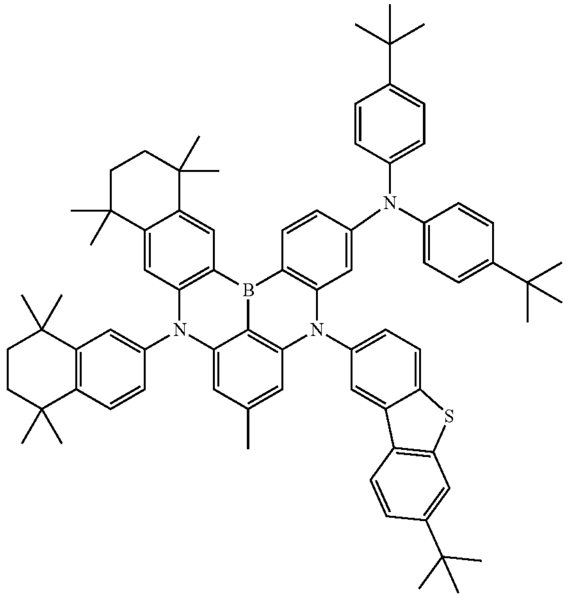

-continued
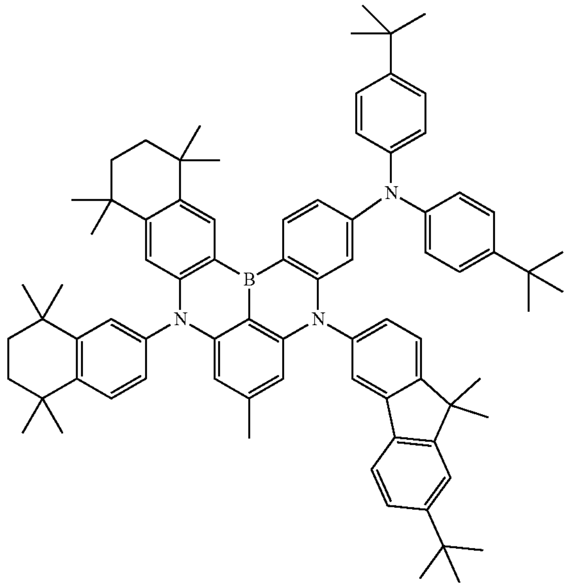
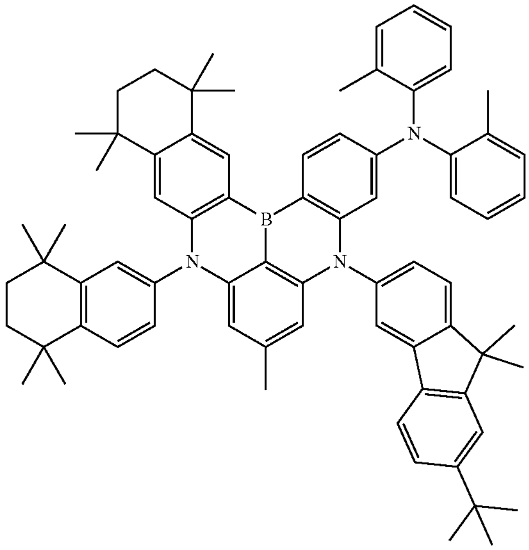
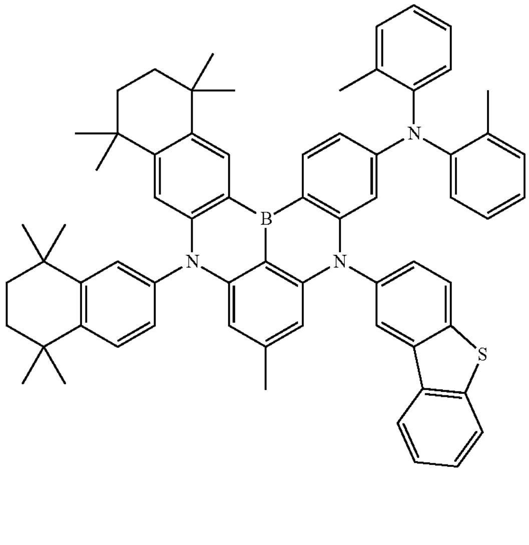
-continued
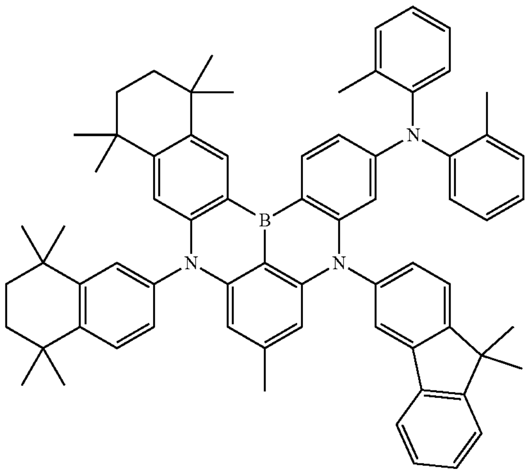
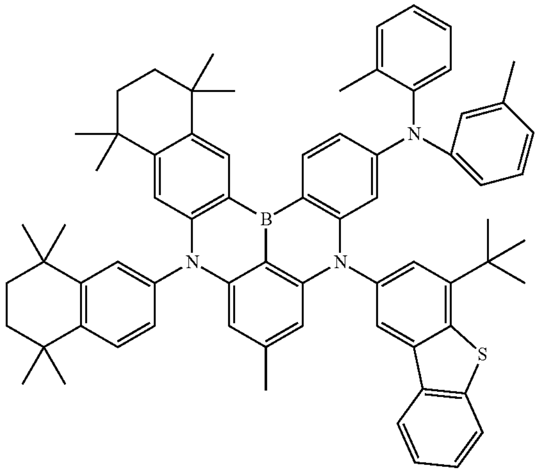
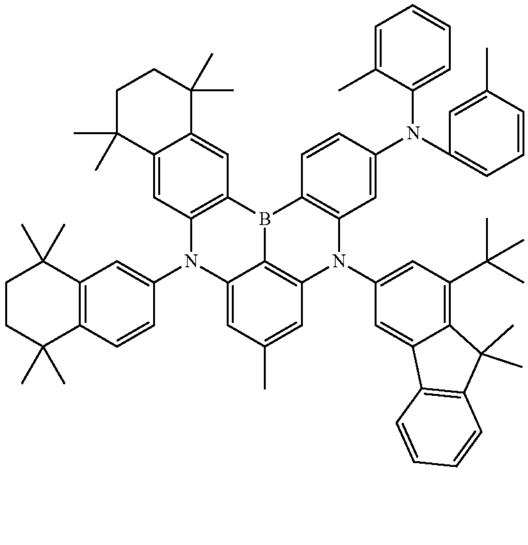

-continued
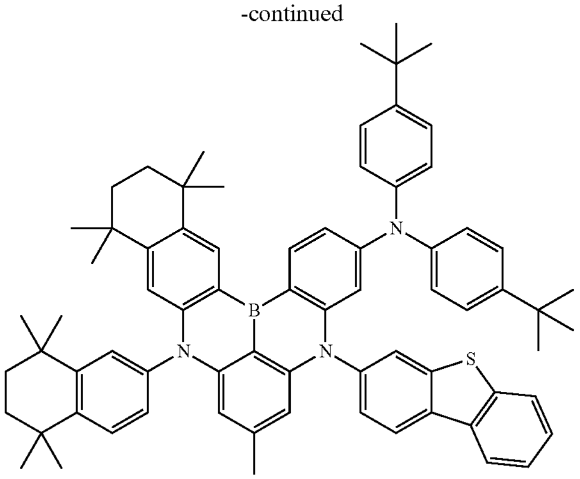
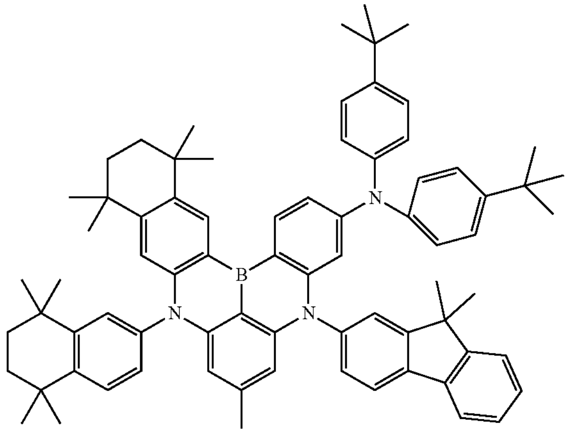
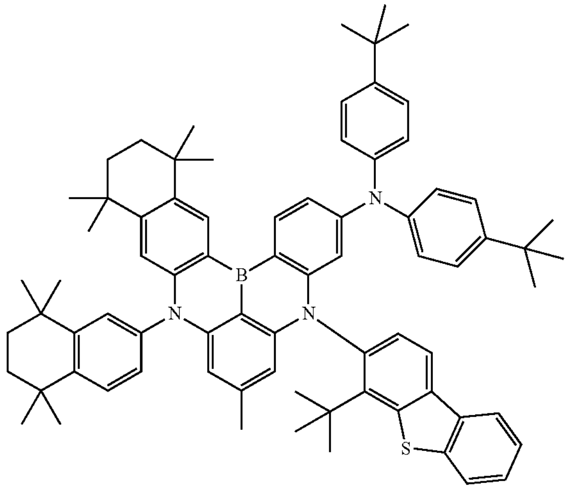
-continued
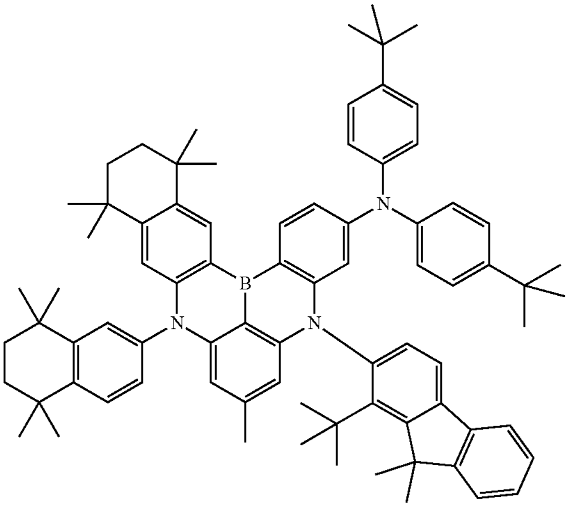
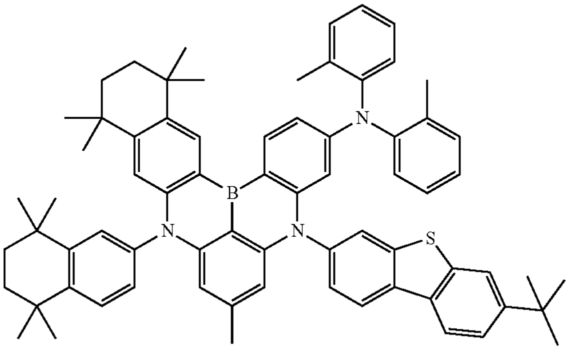
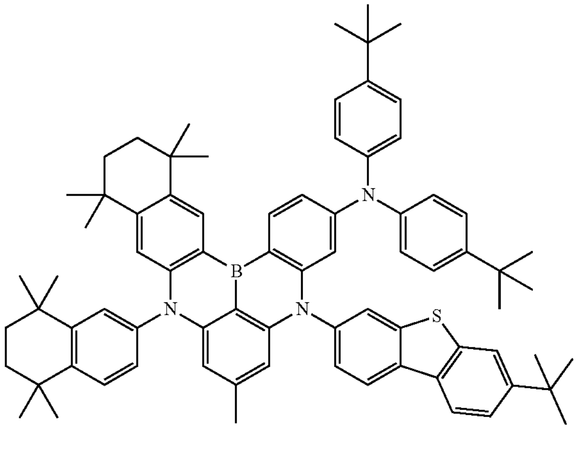

-continued
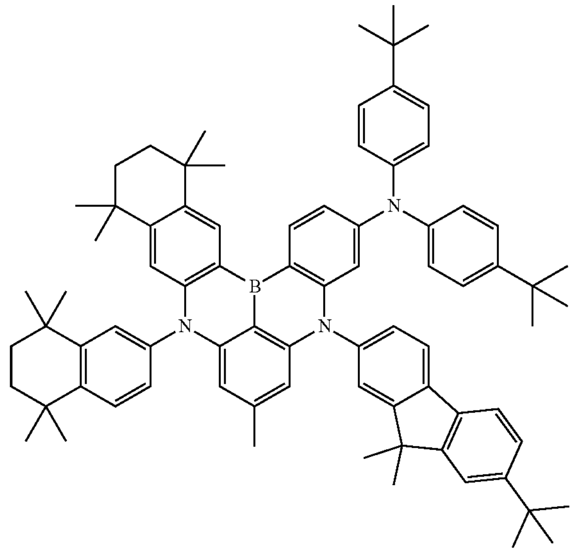
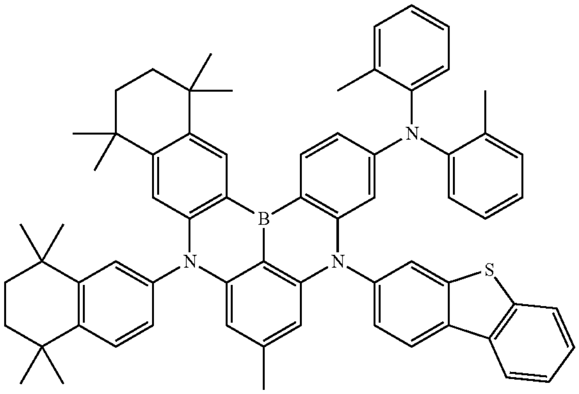
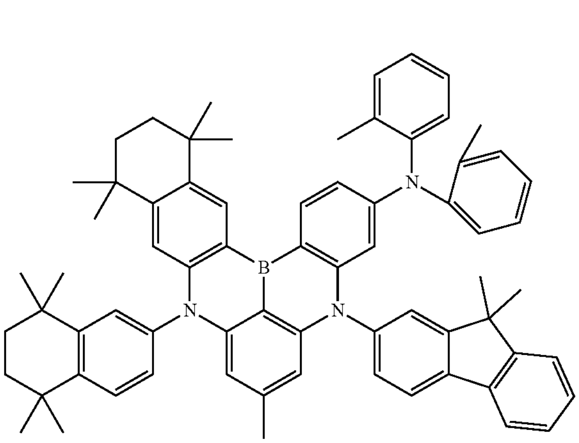
-continued
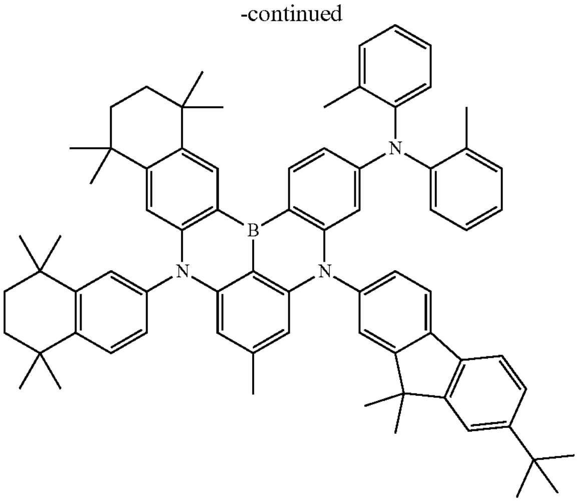
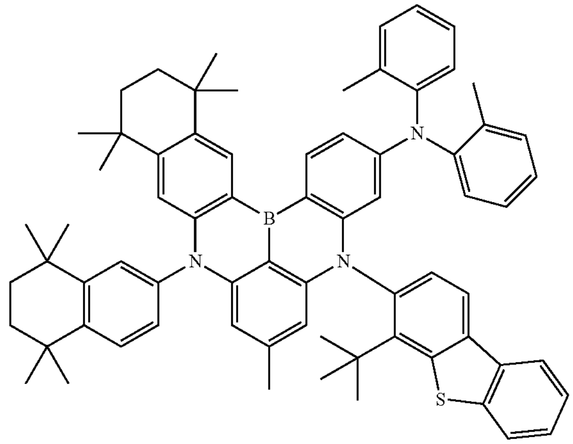
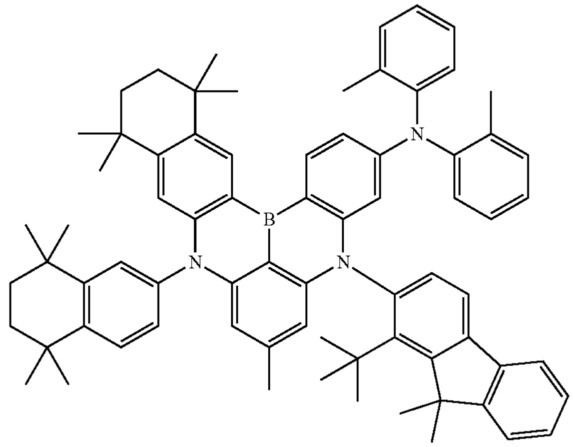

-continued
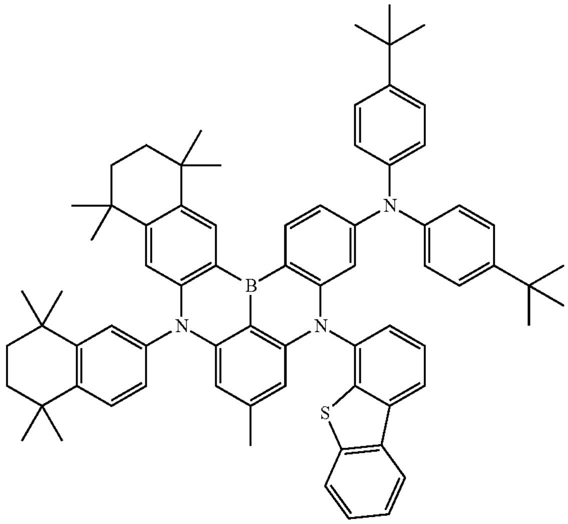
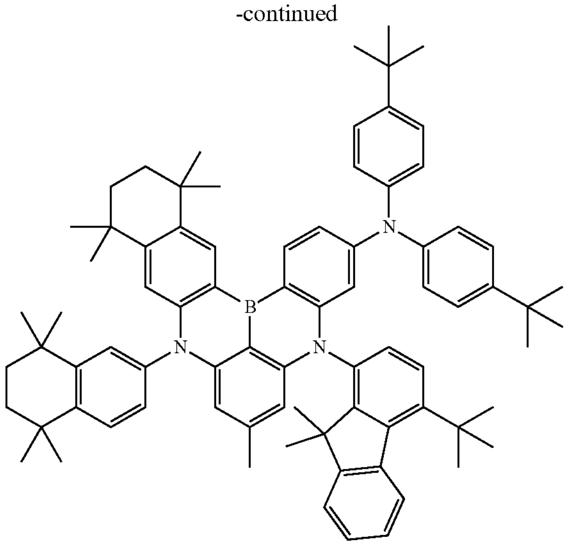
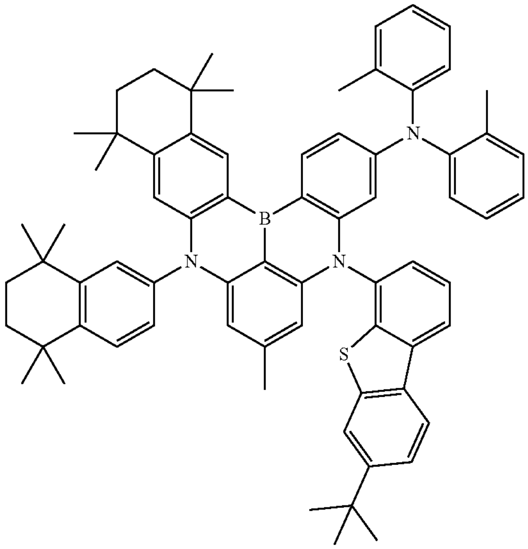
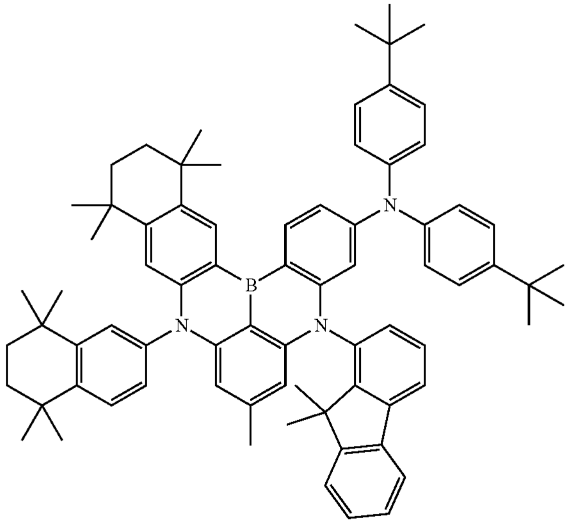
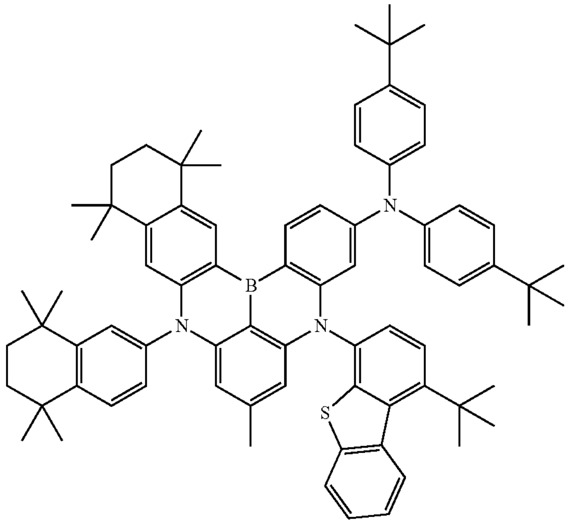
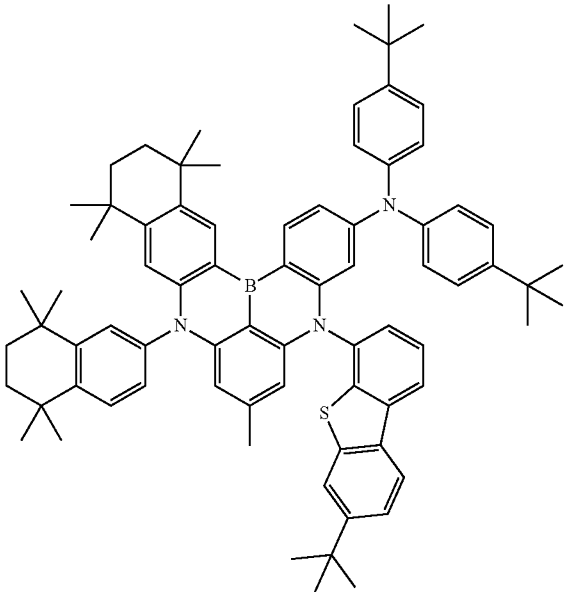

-continued
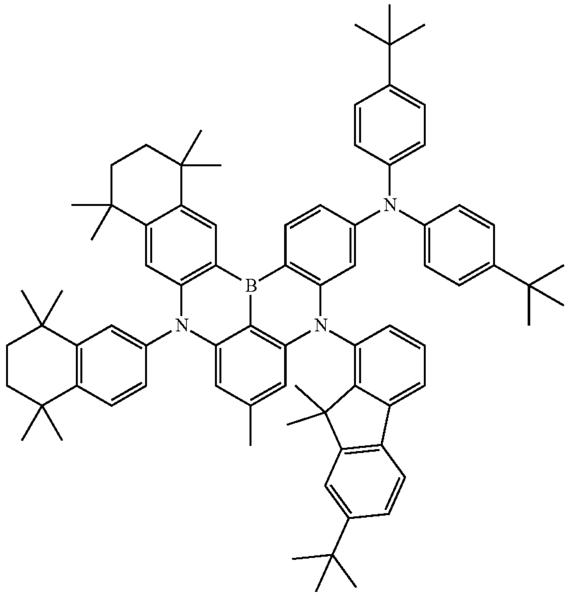
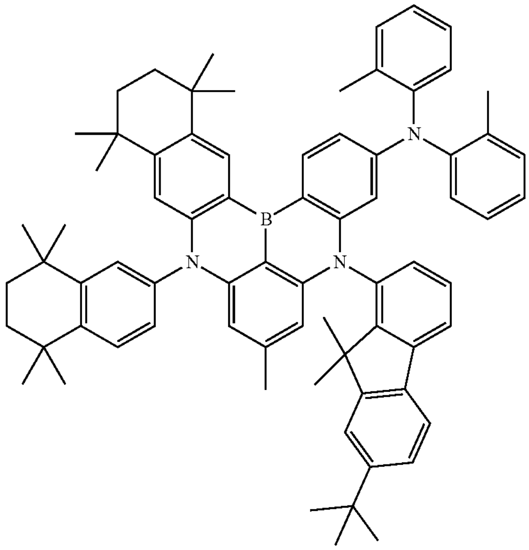
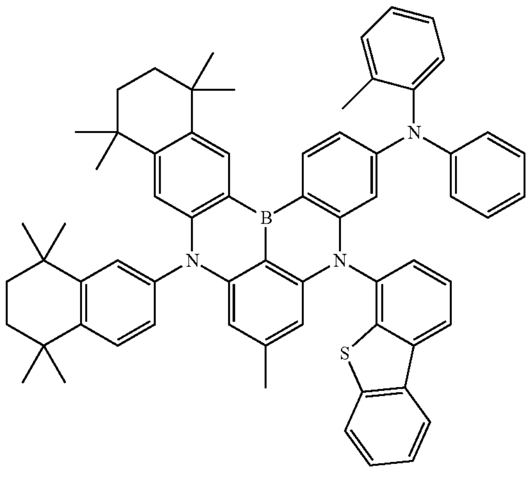
-continued
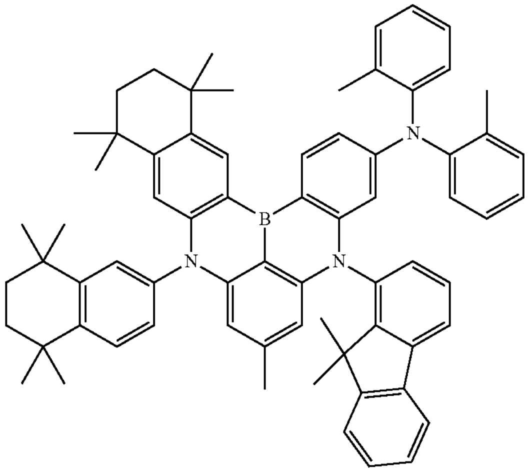
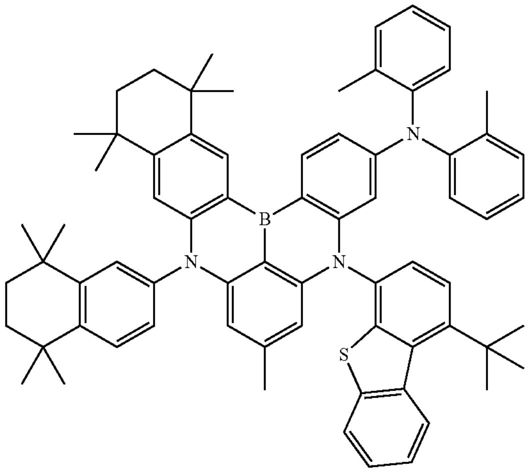
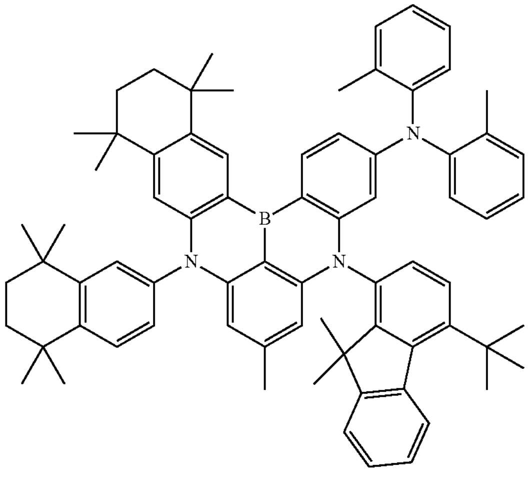

-continued
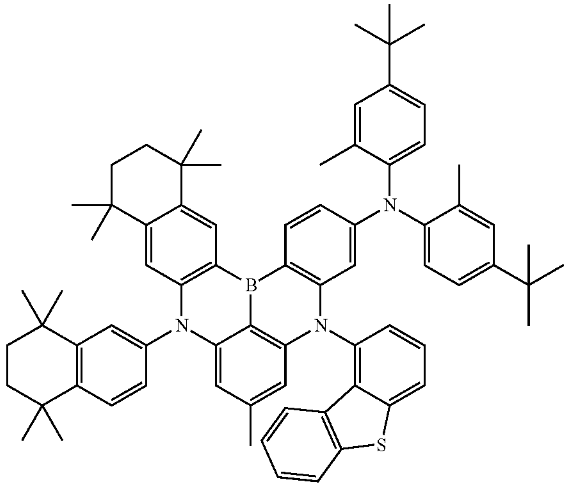
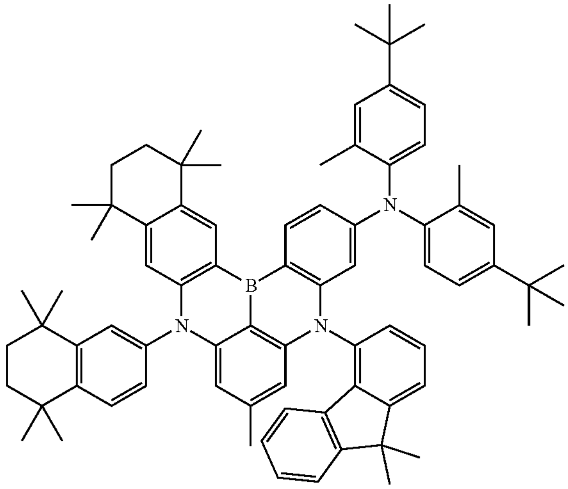
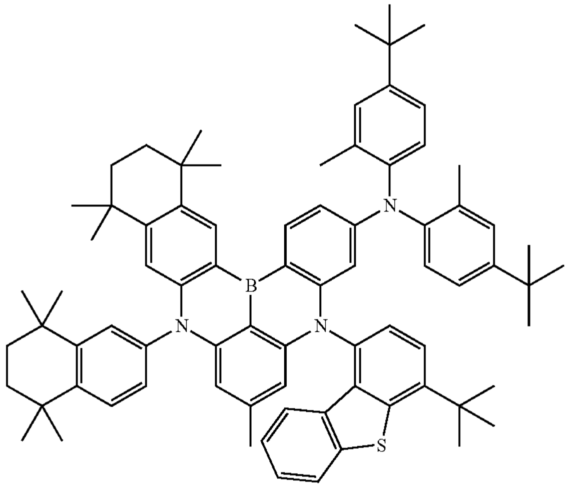
-continued
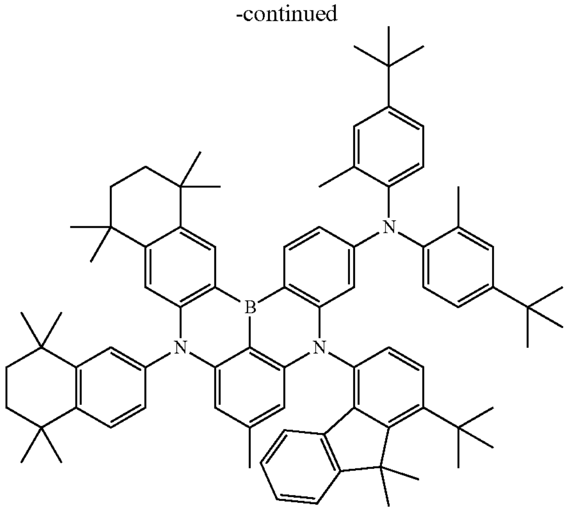
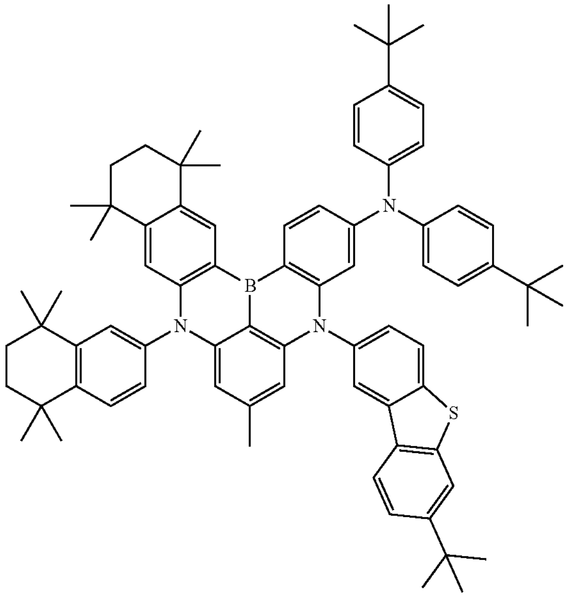
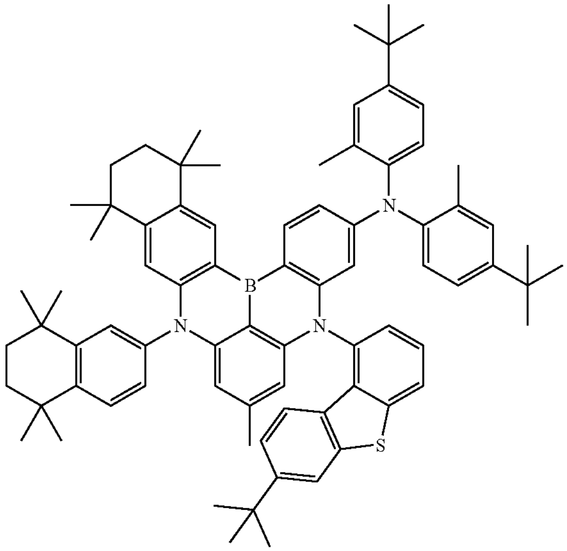

-continued
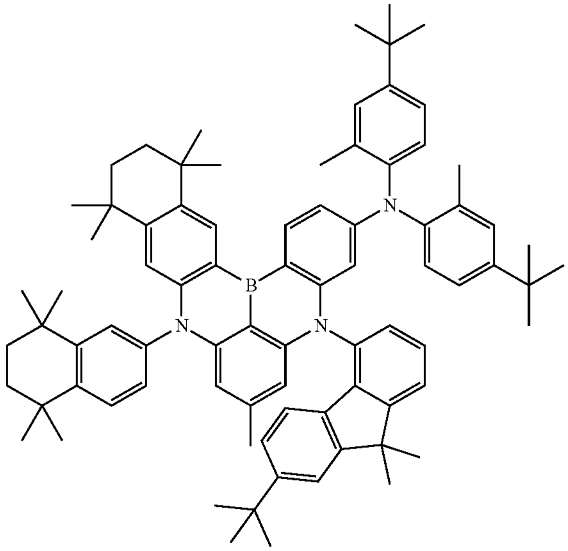
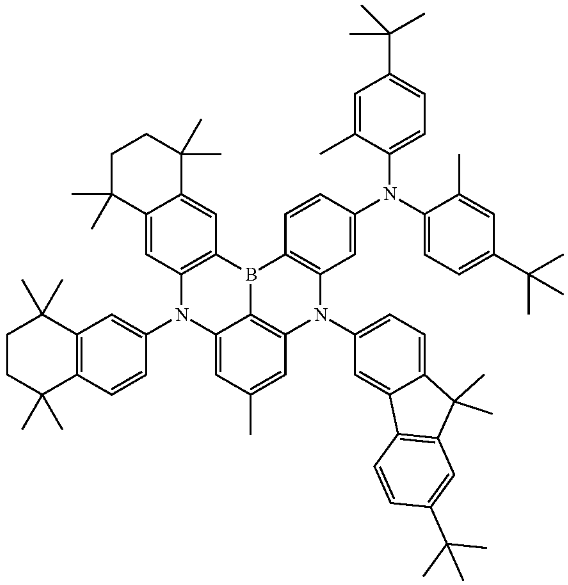
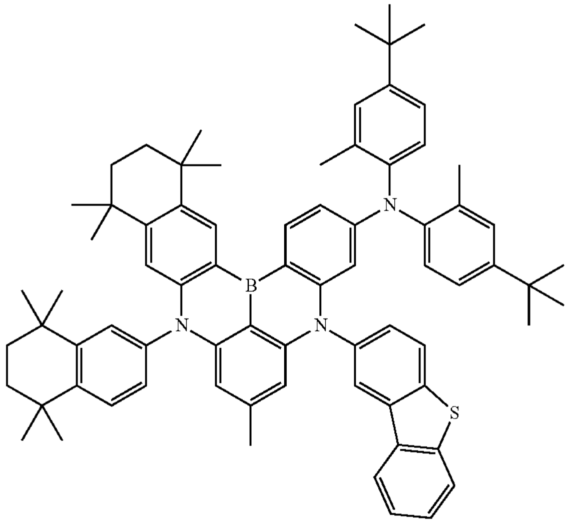
-continued
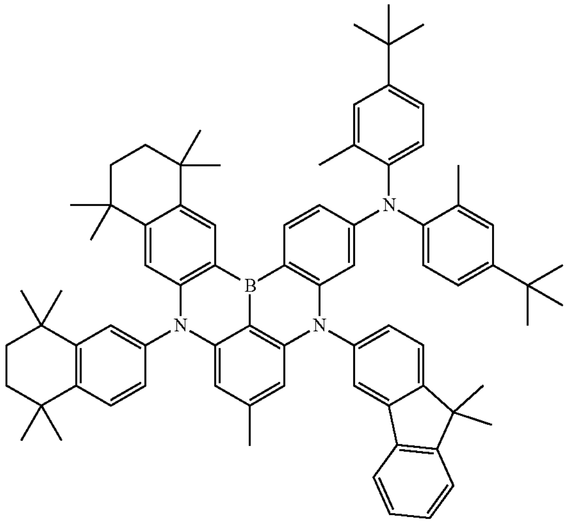
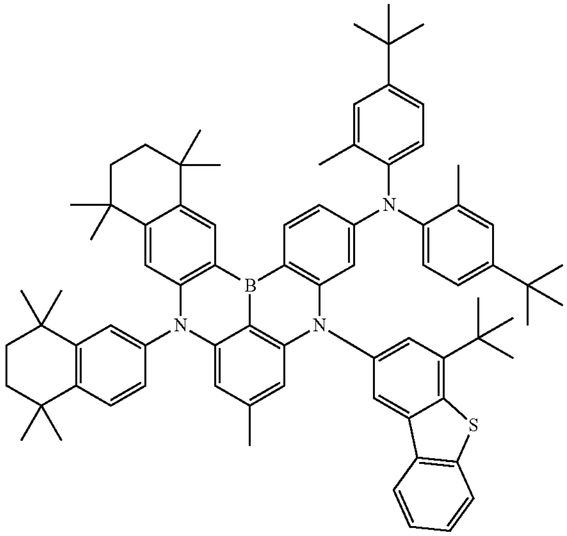
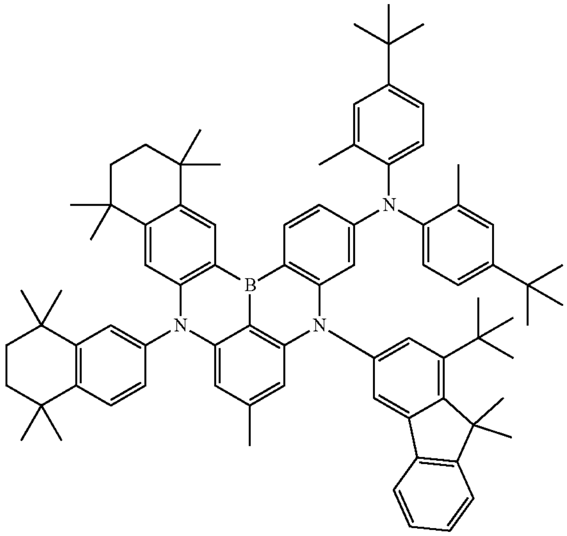

-continued
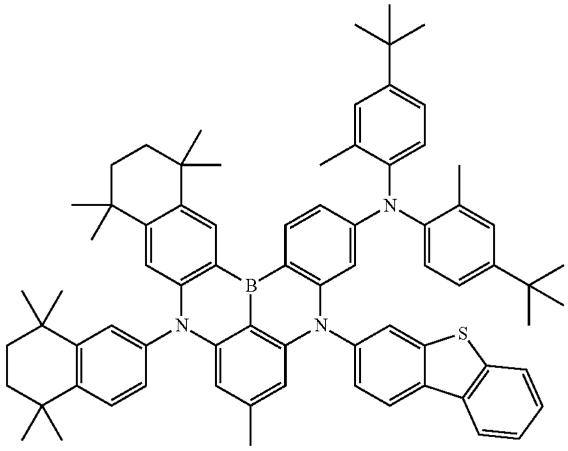
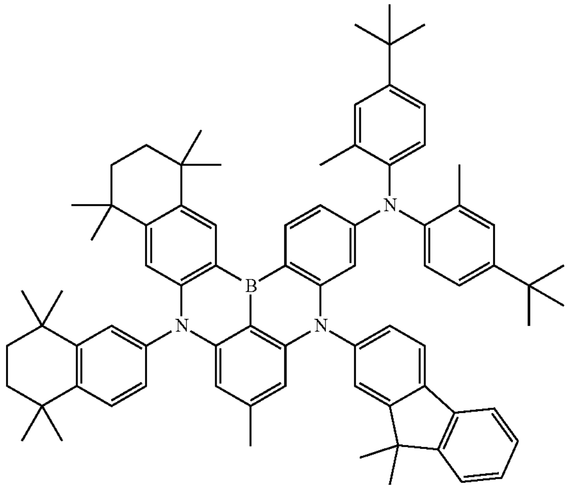
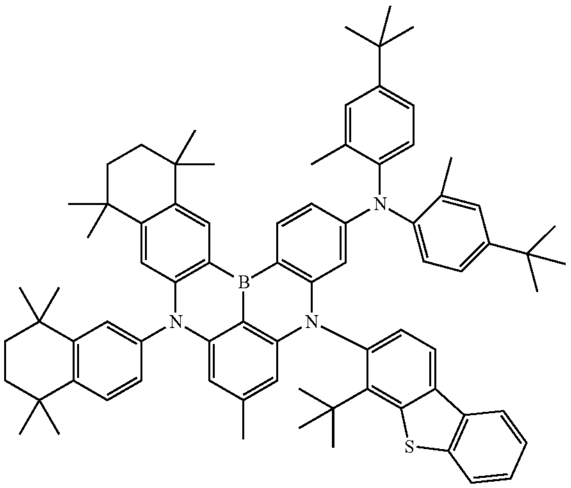
-continued
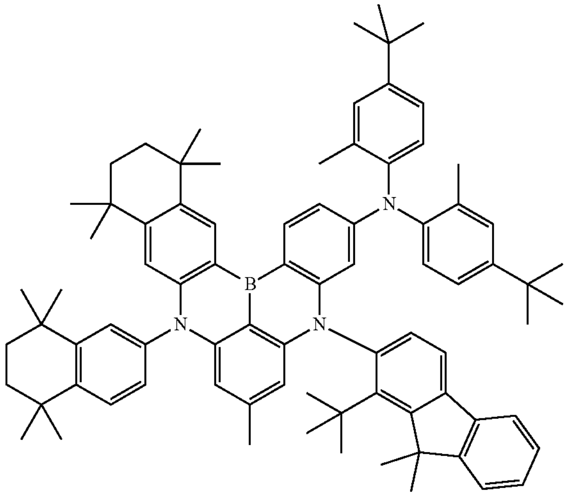
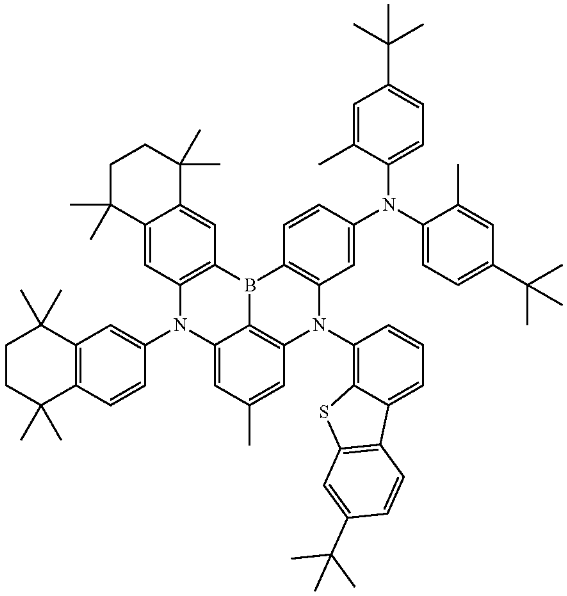
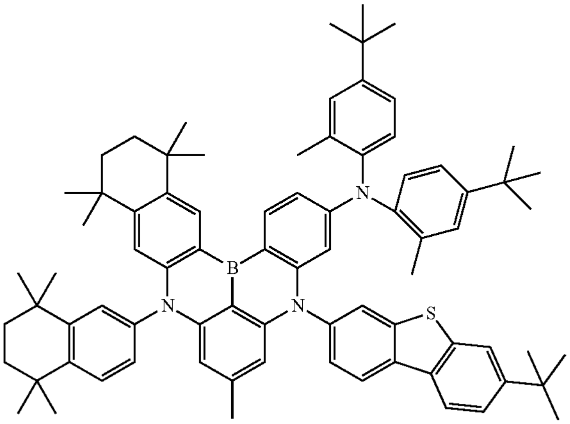

-continued
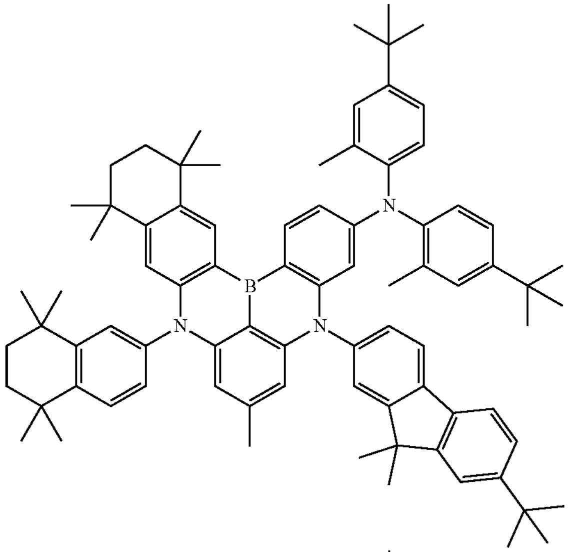
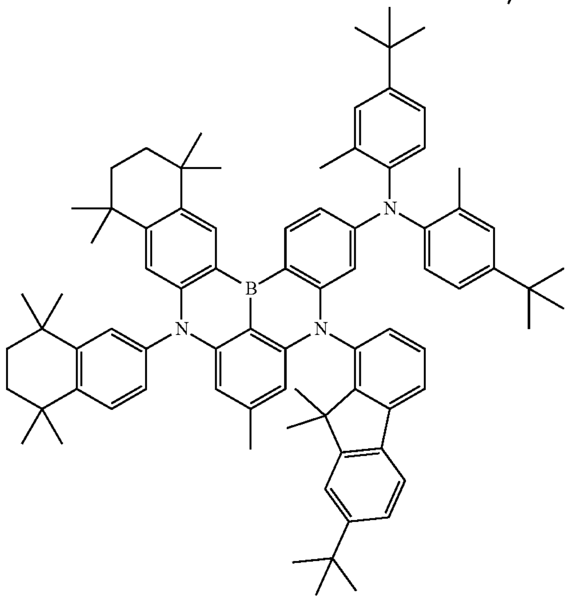
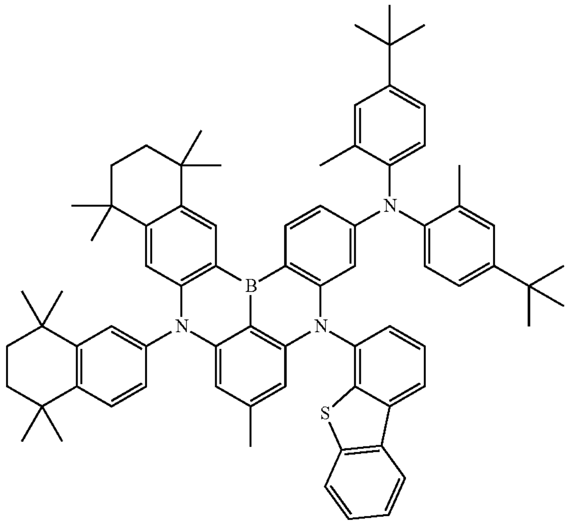
-continued
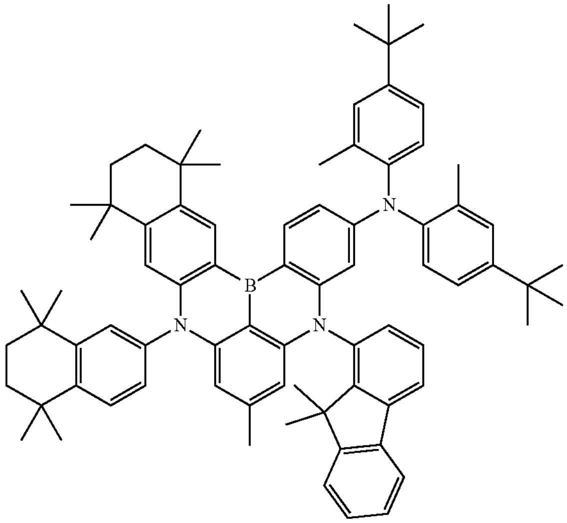
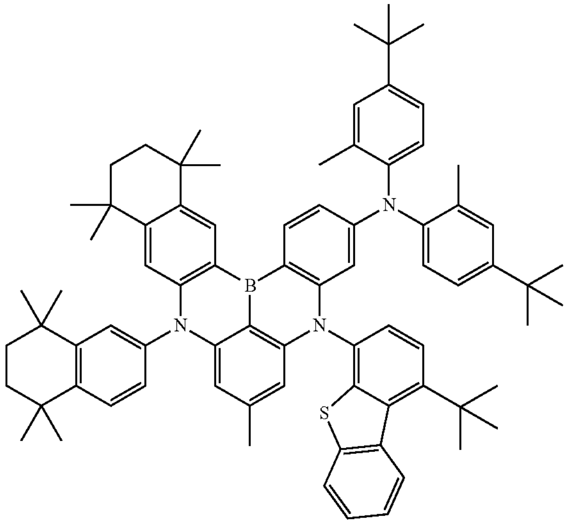
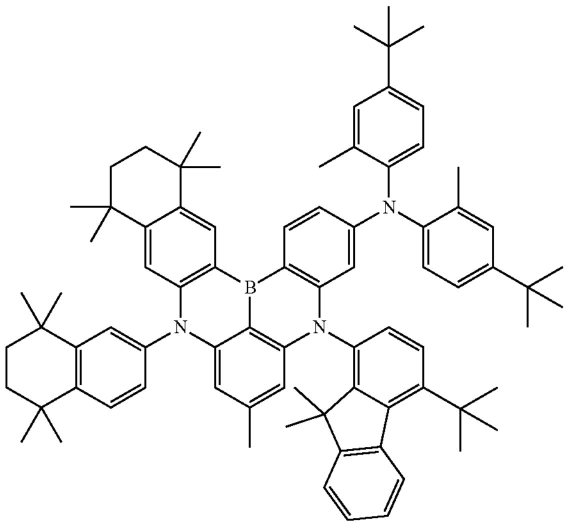

-continued
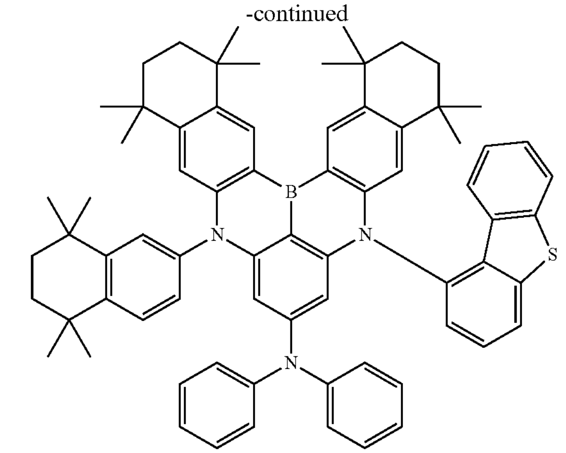
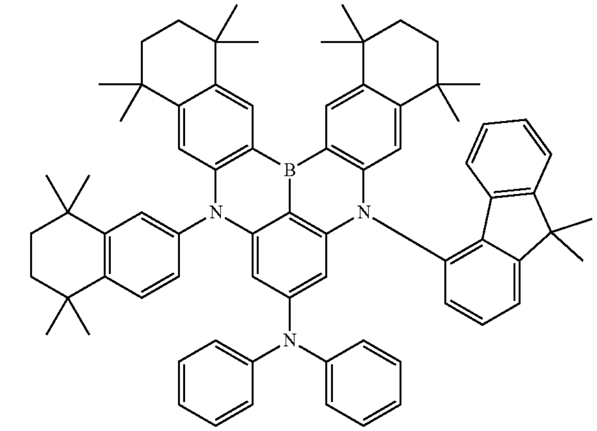
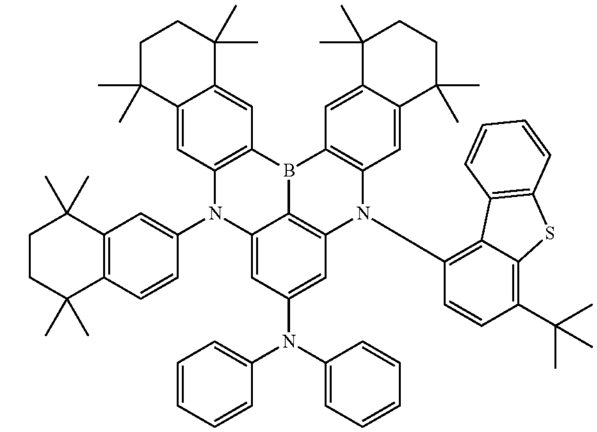
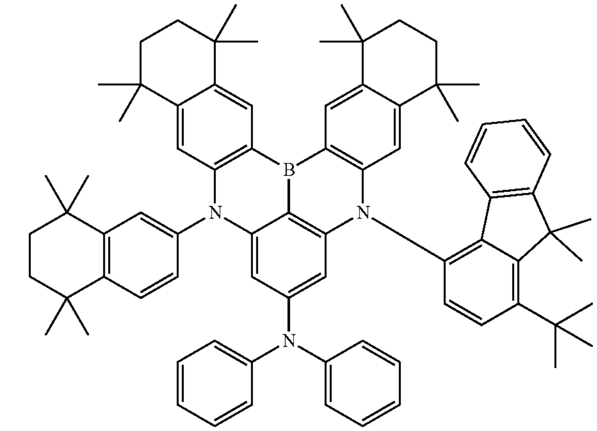
-continued
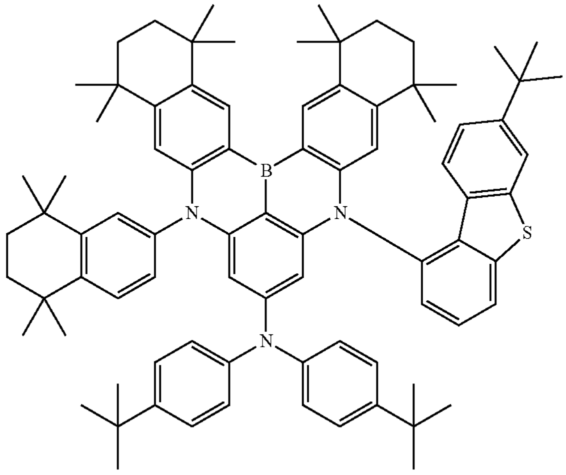
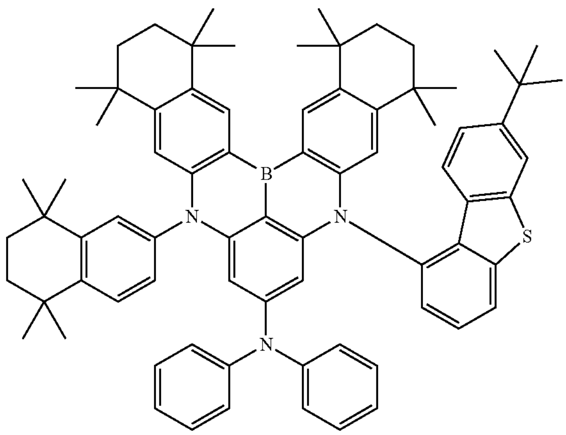
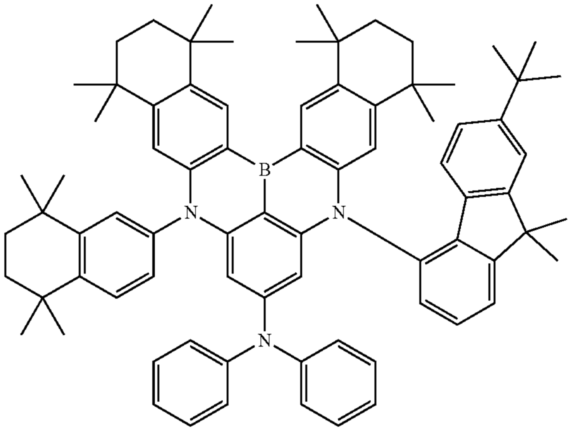

-continued
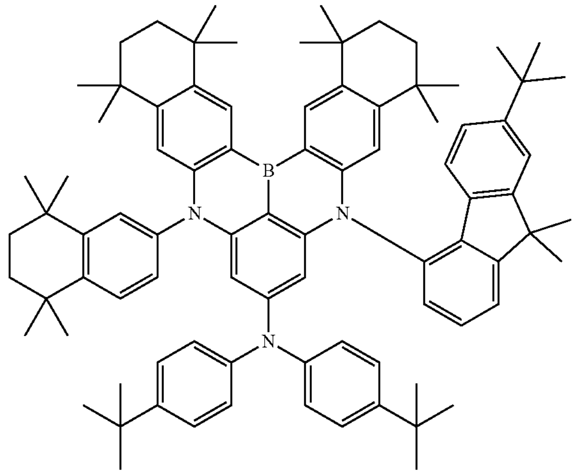
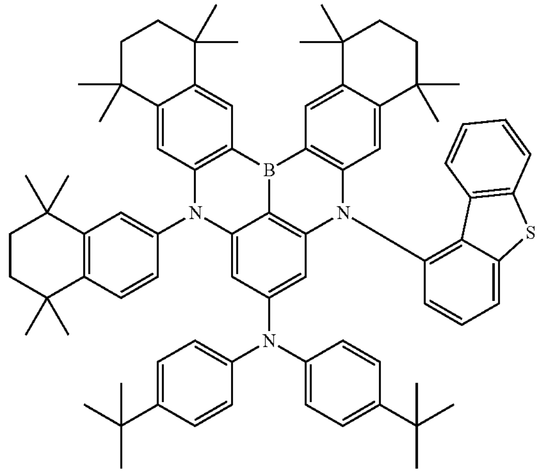
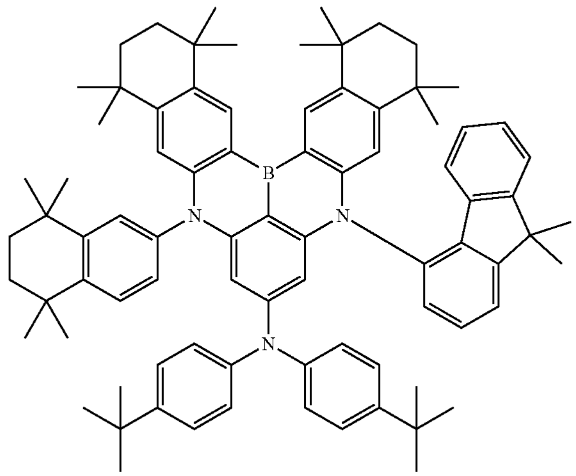
-continued
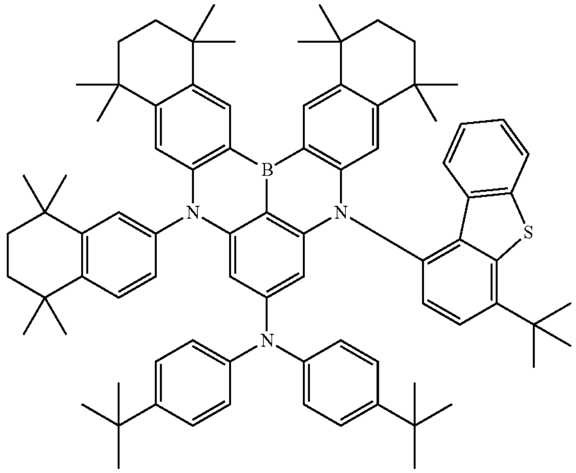
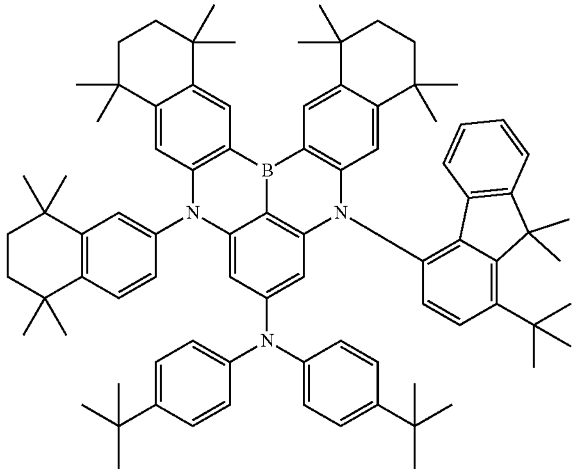
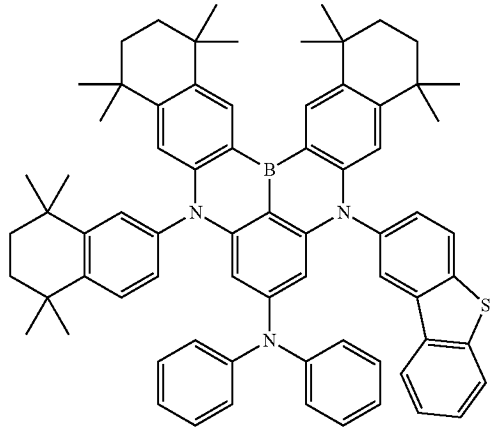

-continued
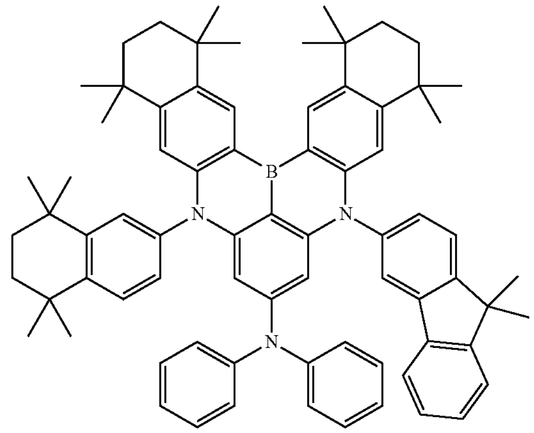
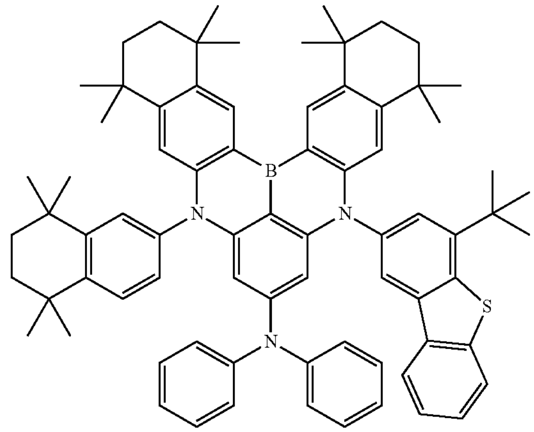
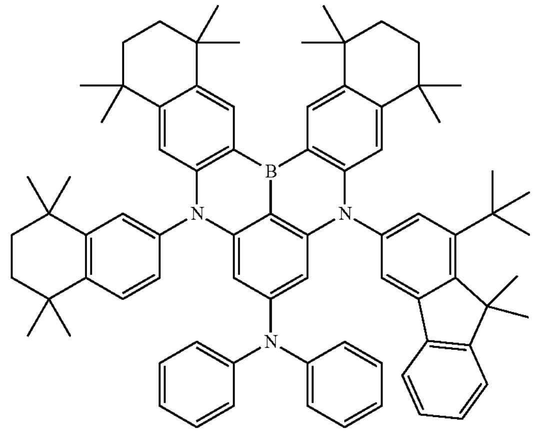
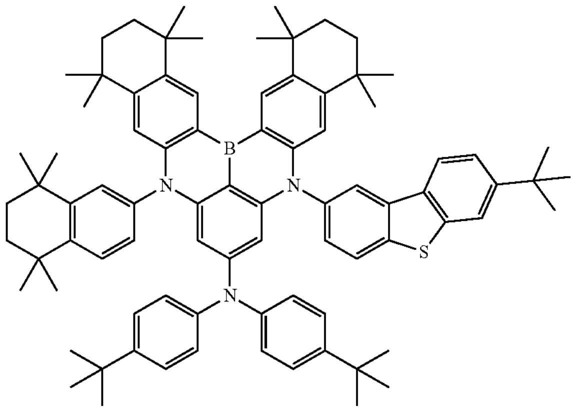
-continued
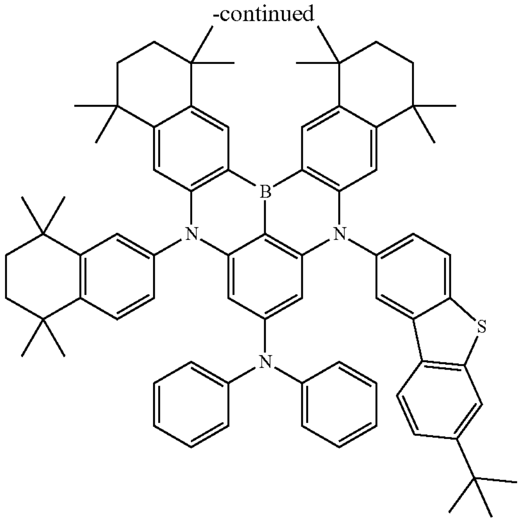
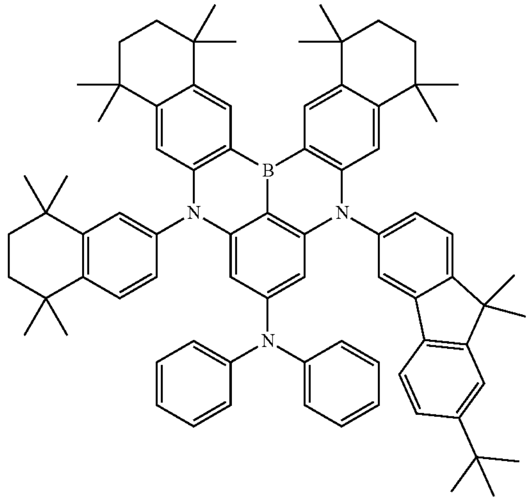
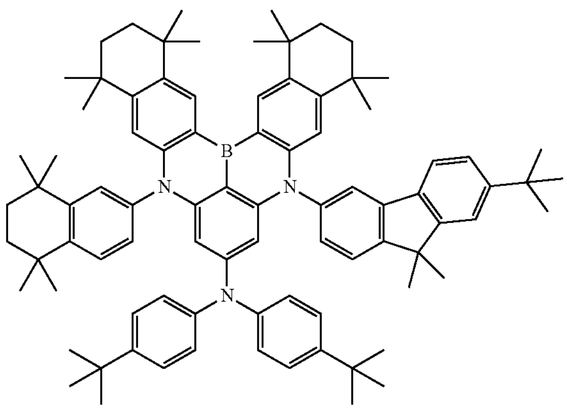

-continued
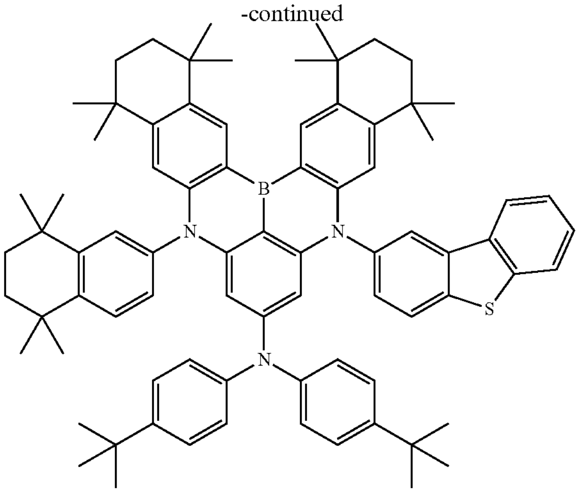
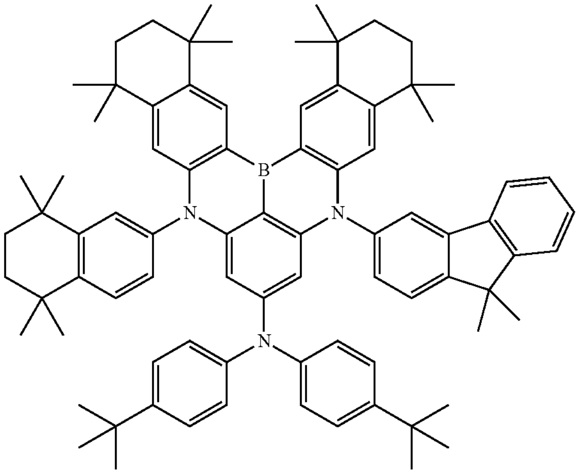
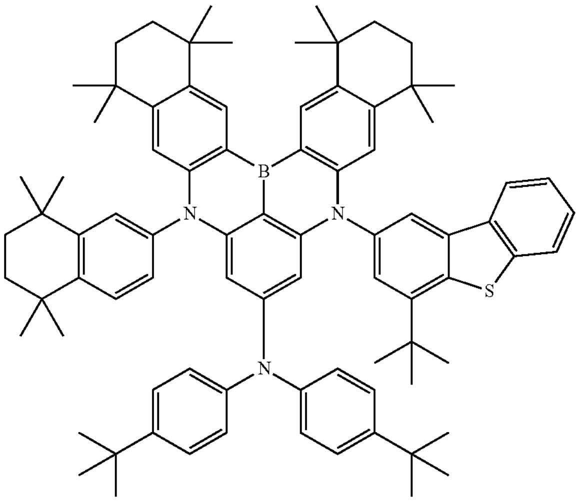
-continued
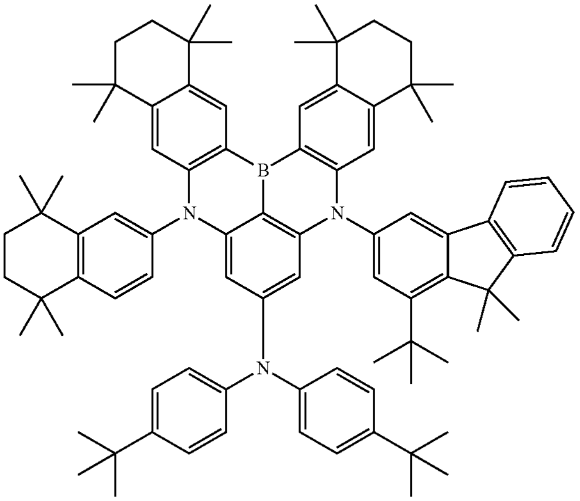
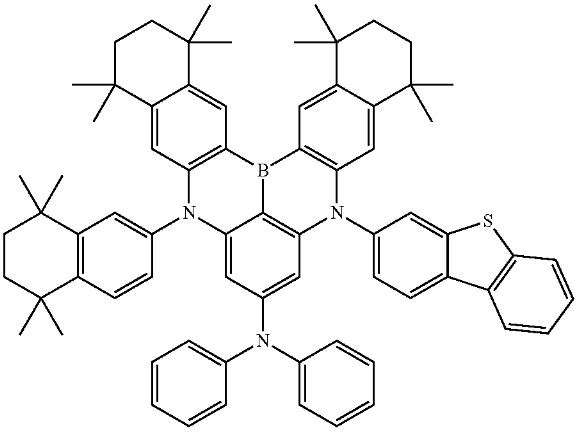
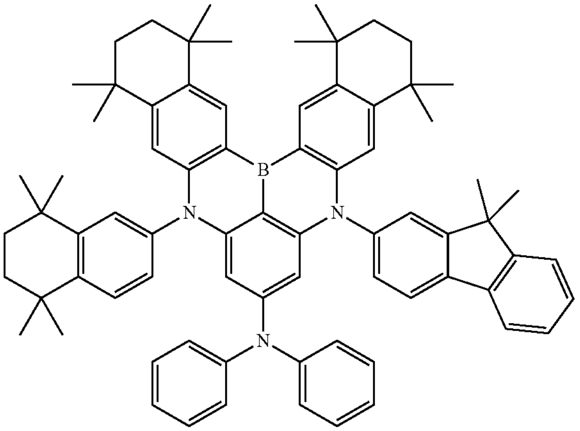

-continued
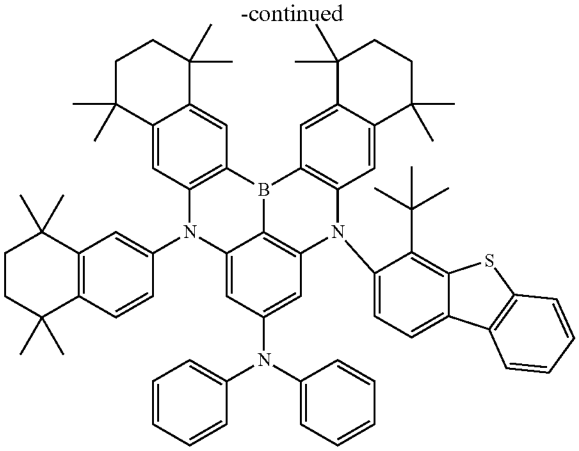
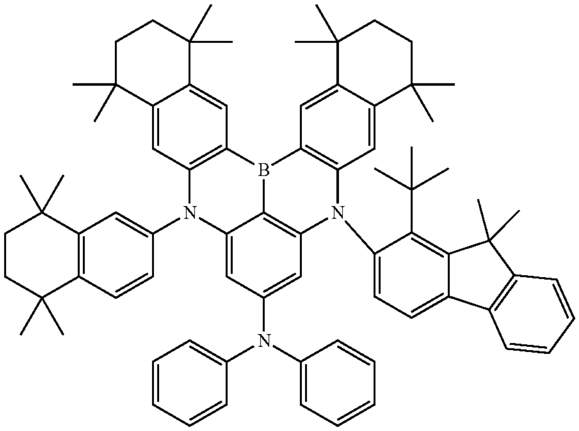
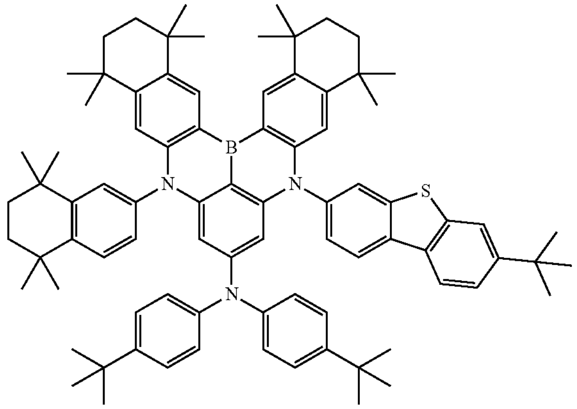
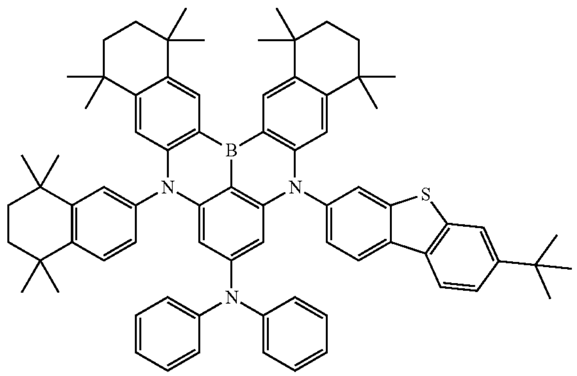
-continued
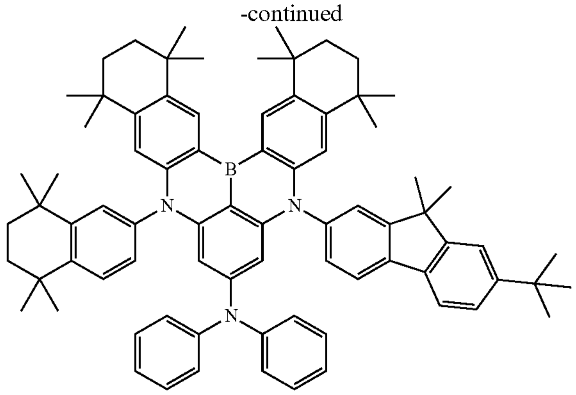
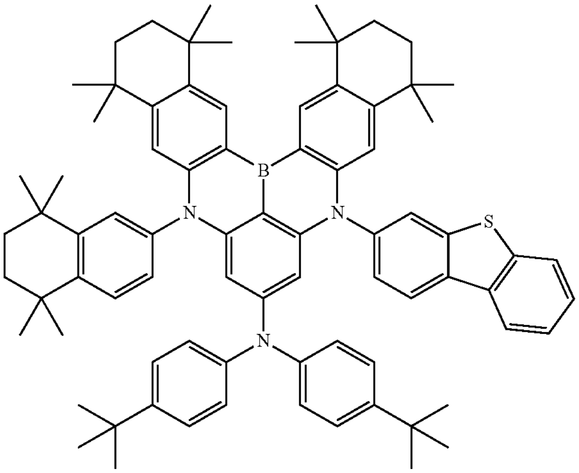
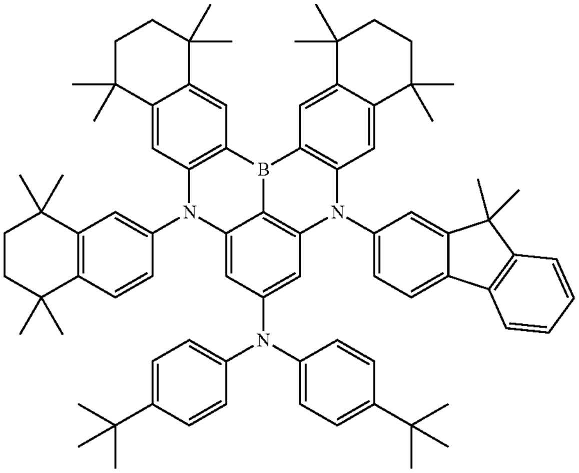
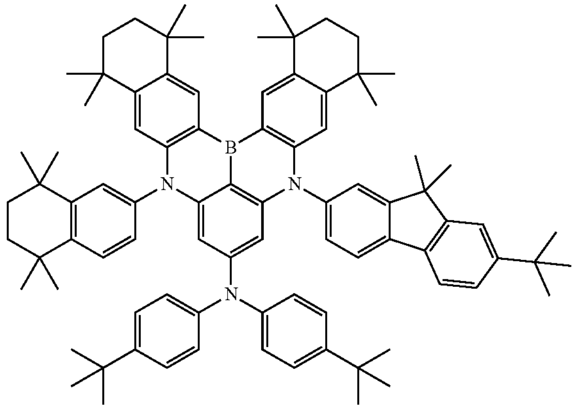

-continued
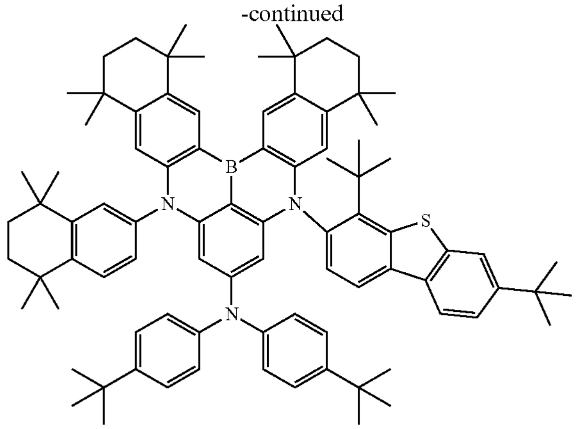
-continued
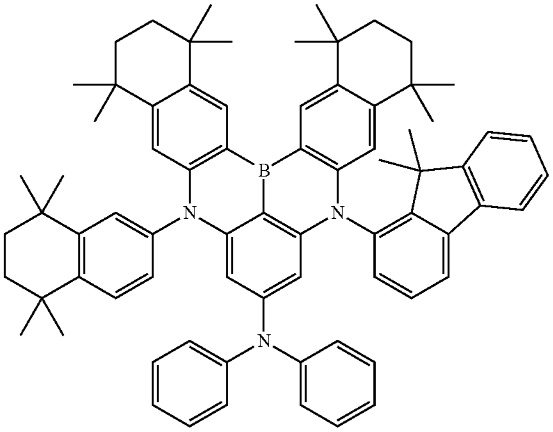
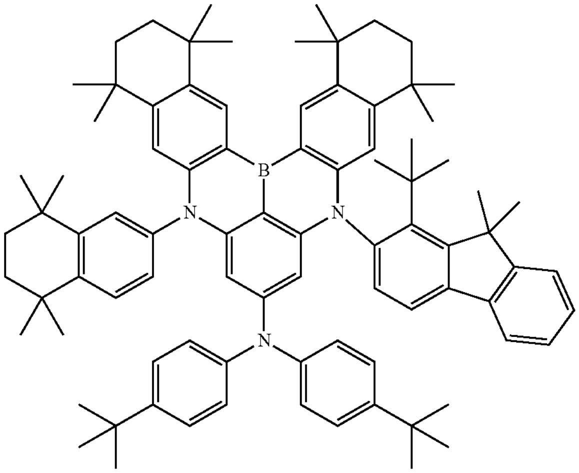
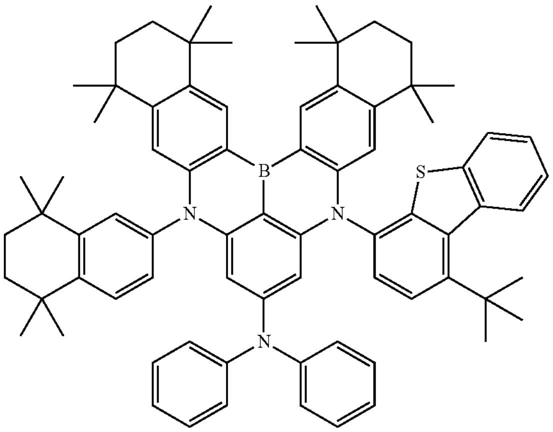
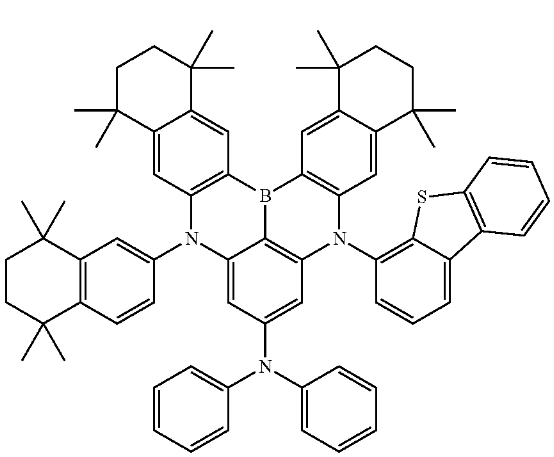
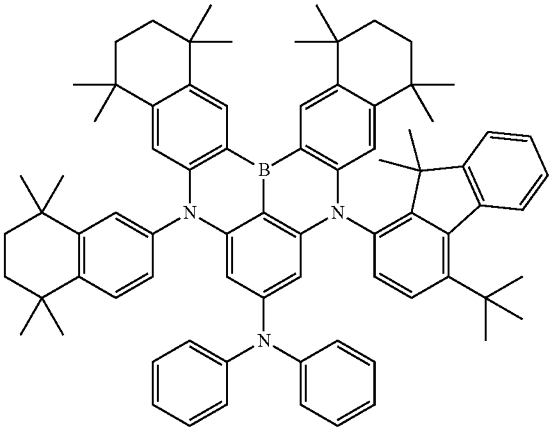

-continued
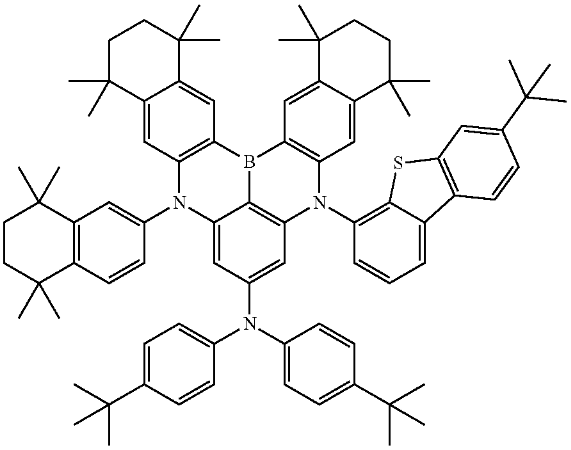
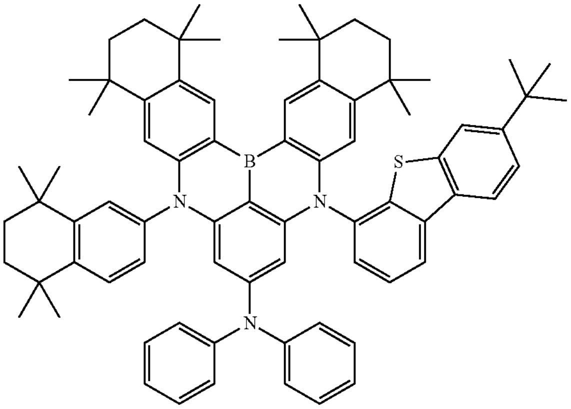
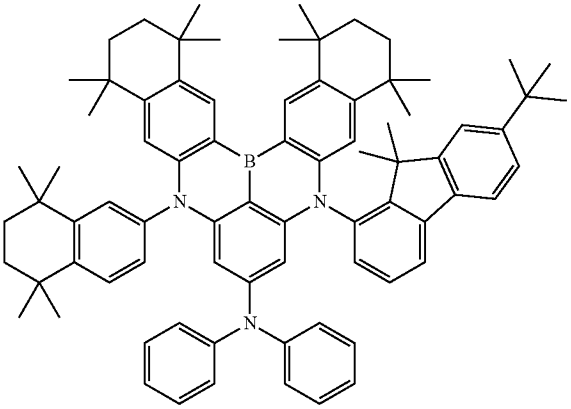
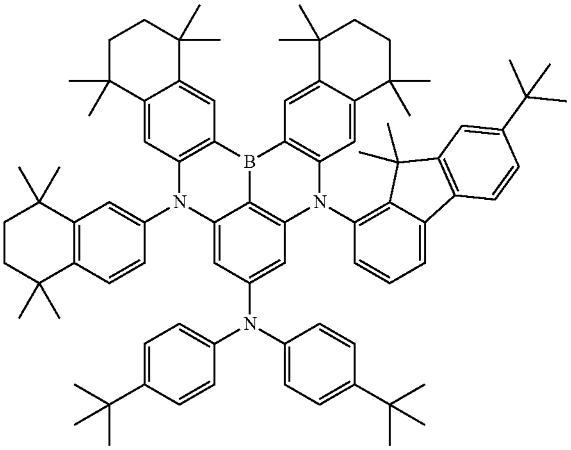
-continued
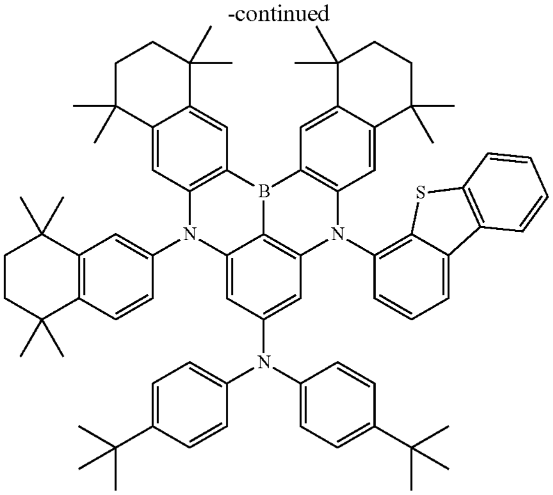
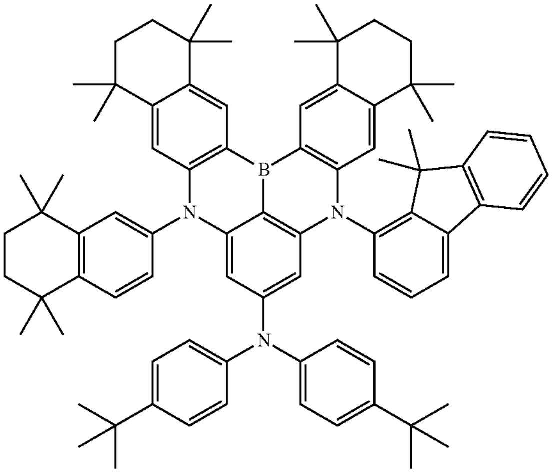
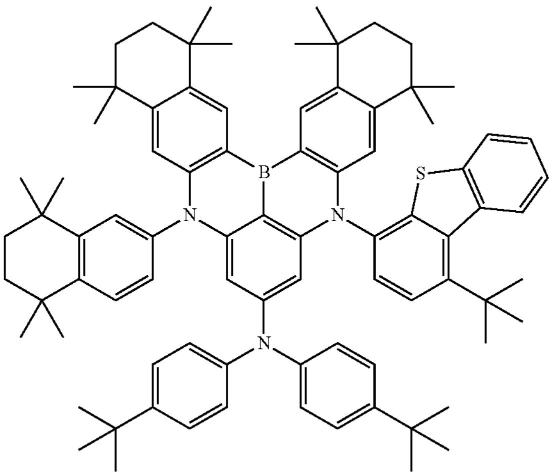

-continued
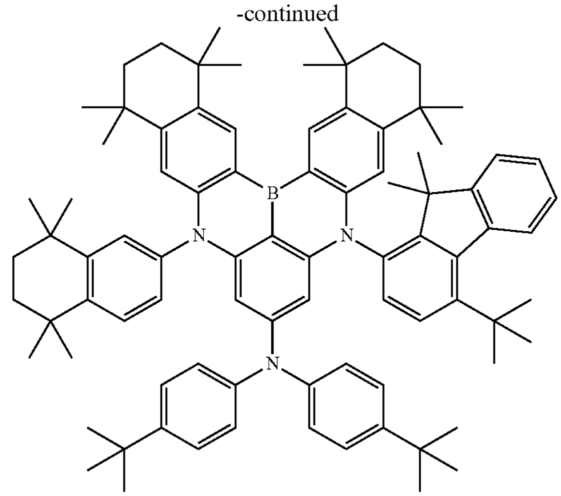
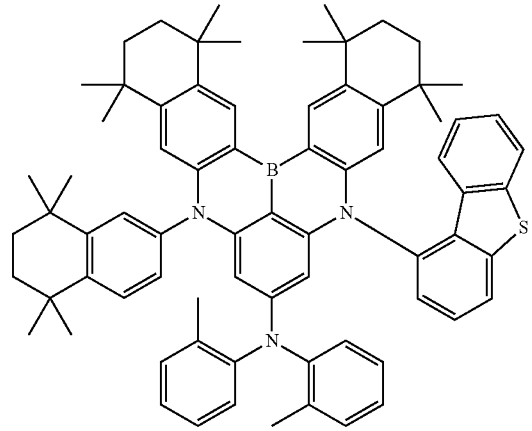
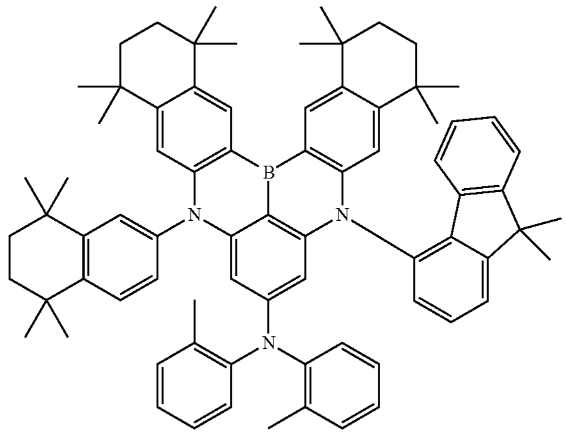
-continued
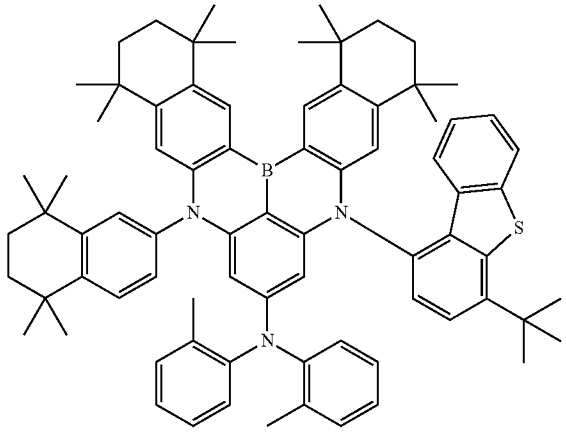
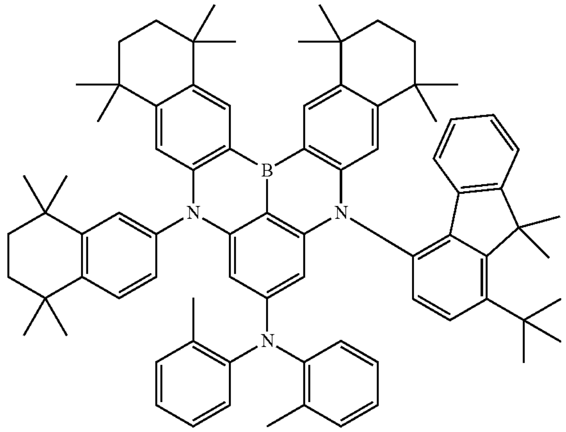
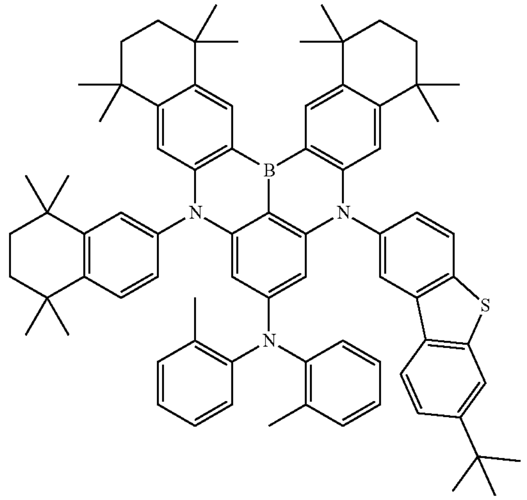

-continued
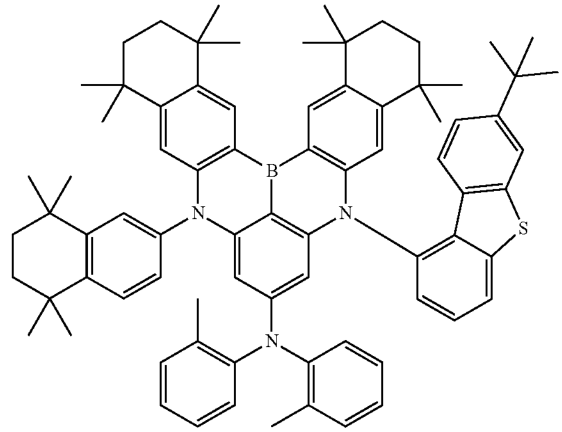
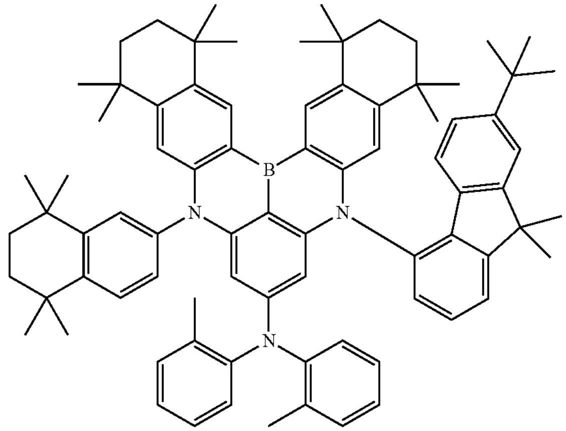
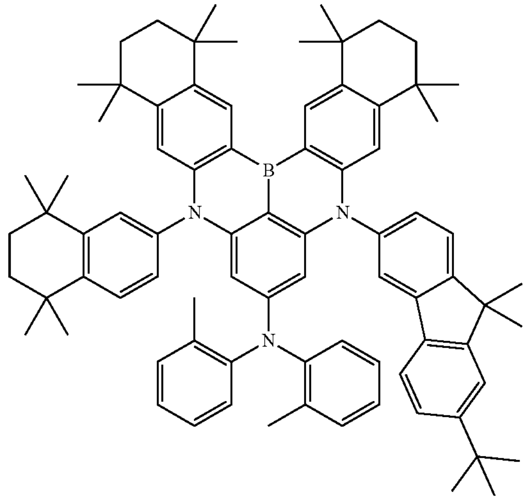
-continued
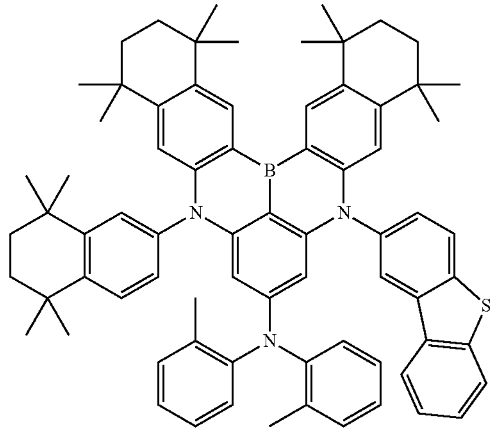
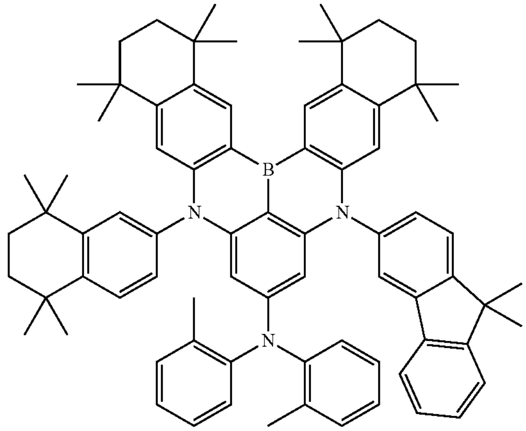
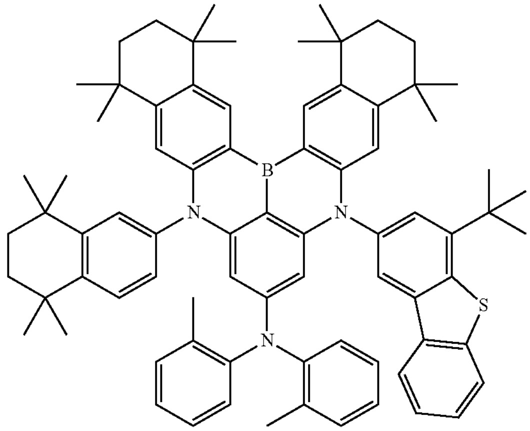
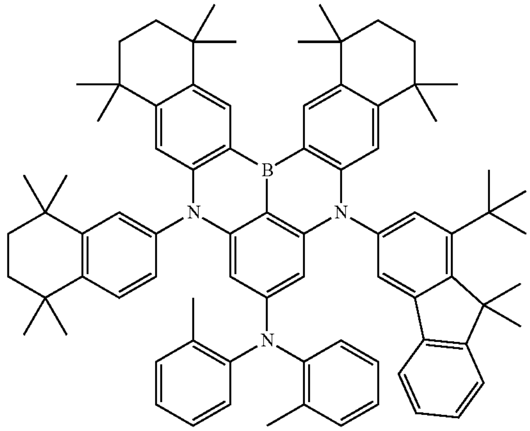

-continued
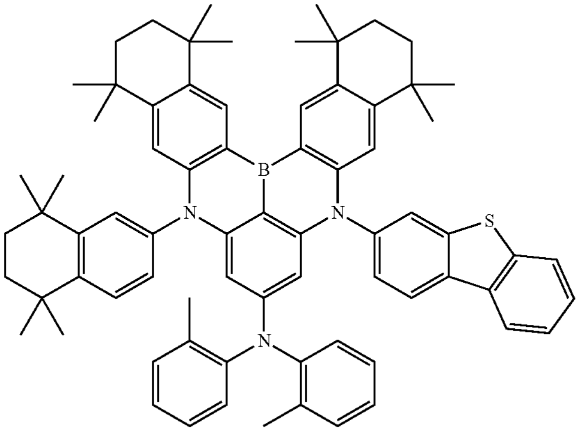
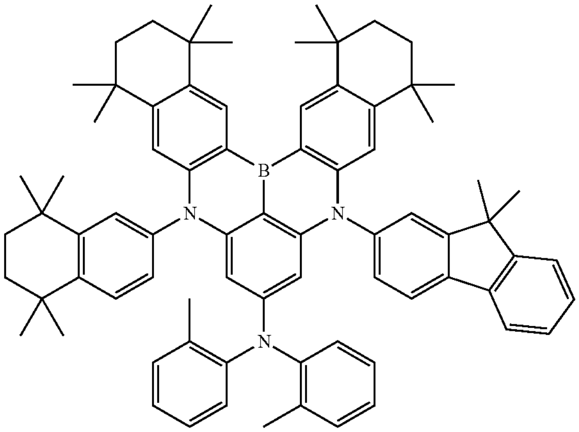
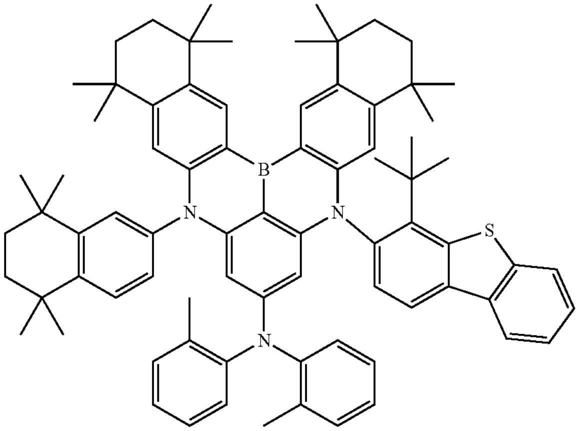
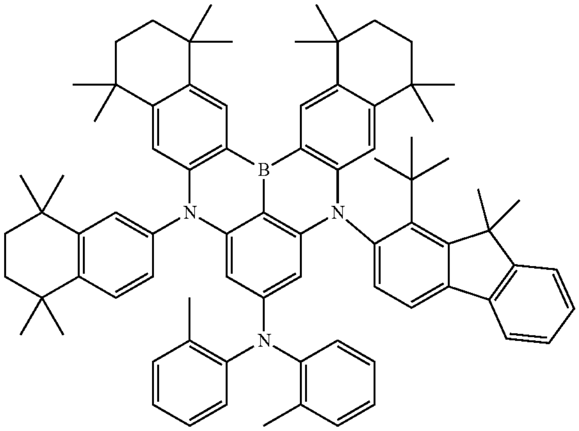
-continued
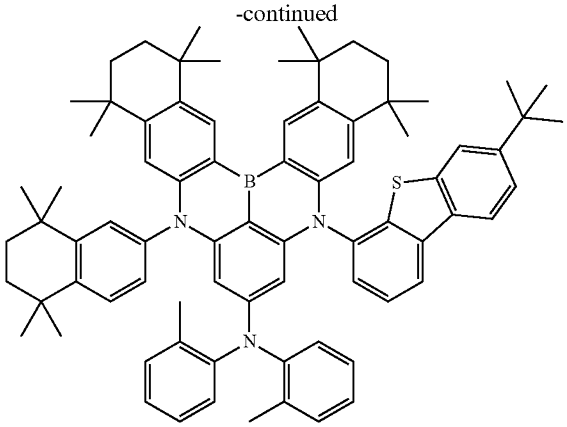
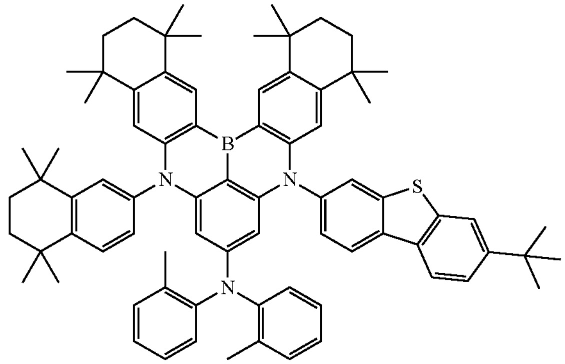
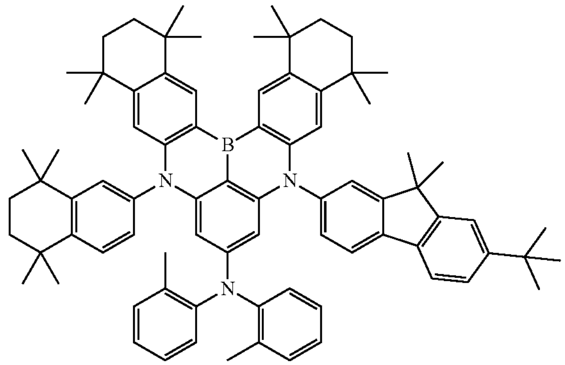
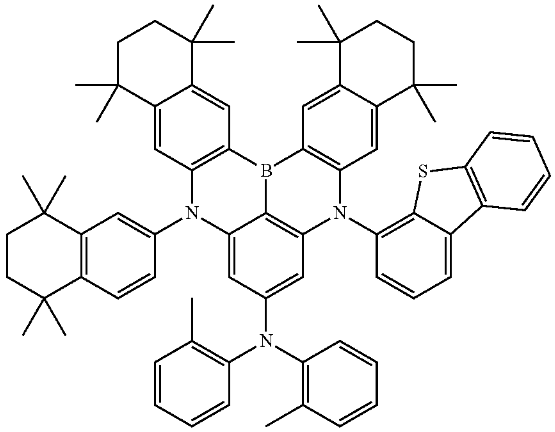

-continued
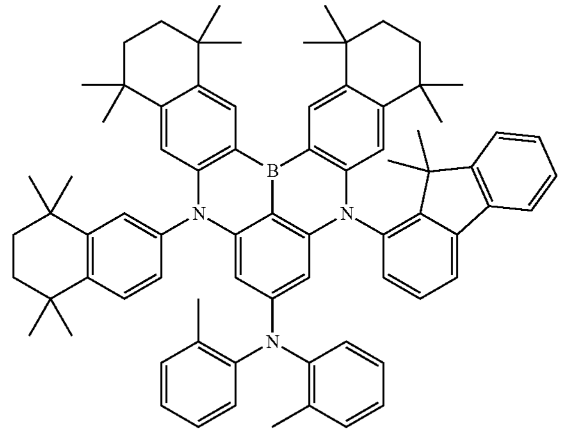
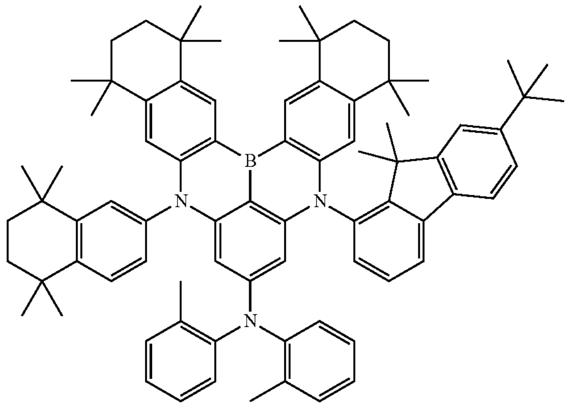
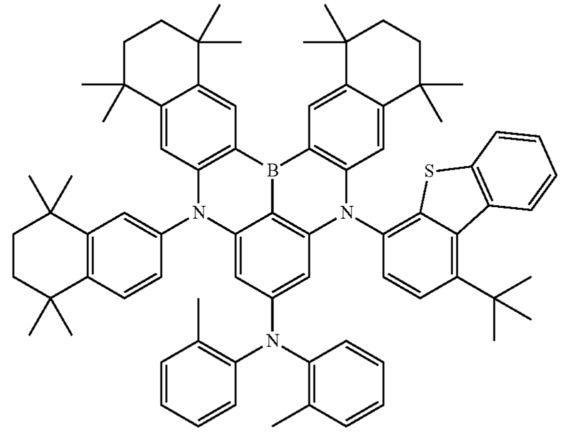
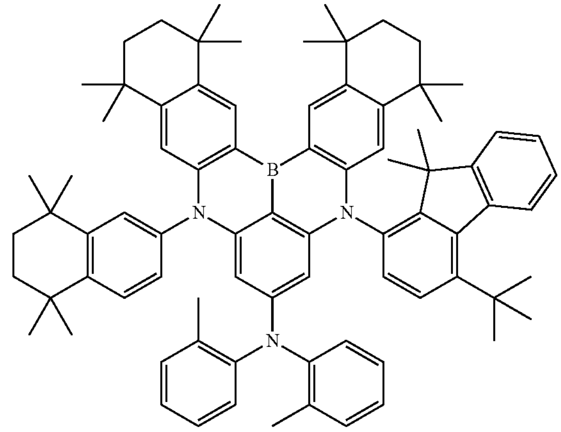
-continued
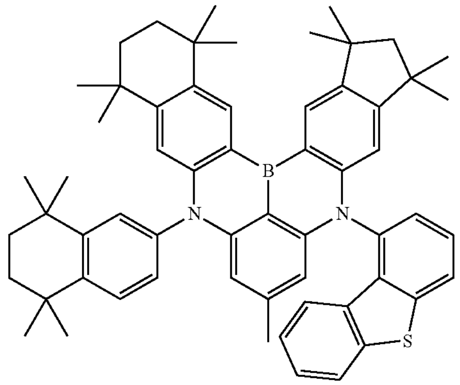
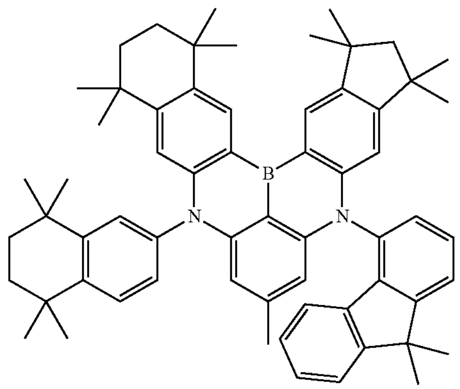
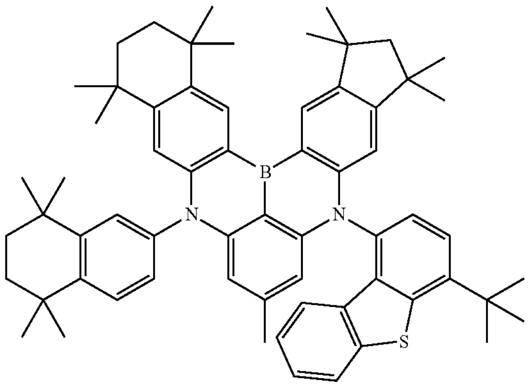
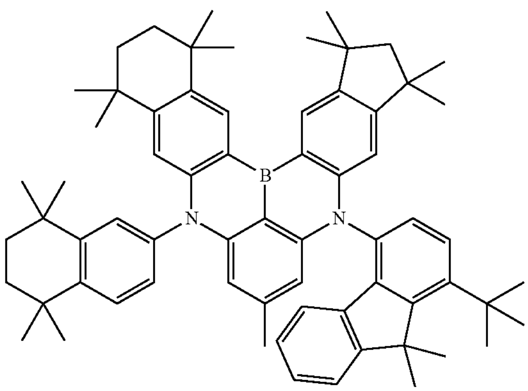

-continued
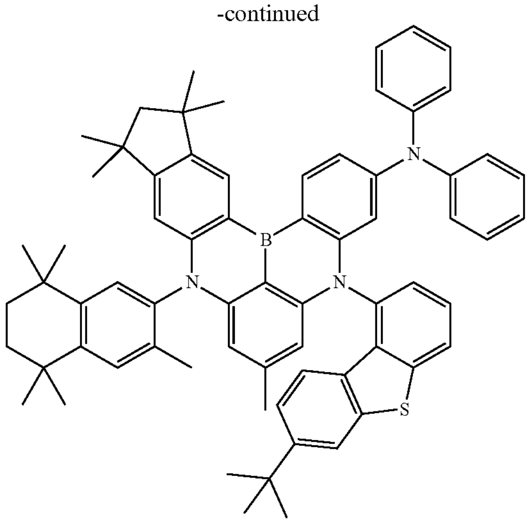
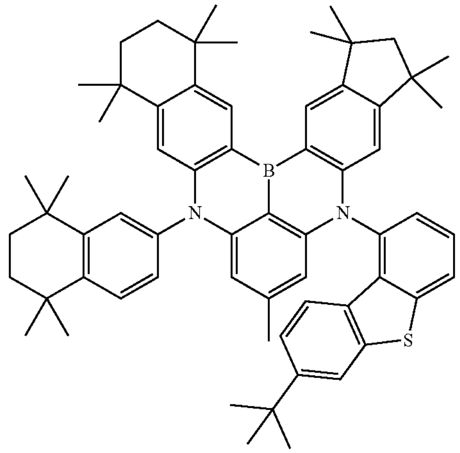
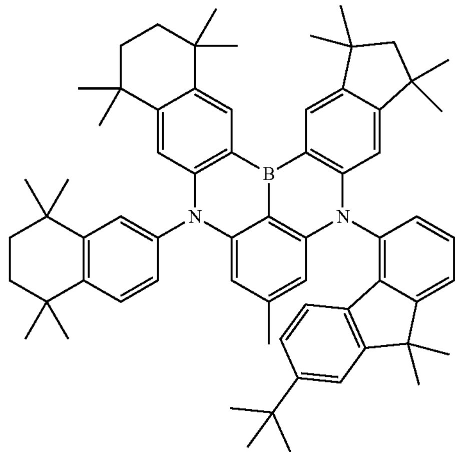
-continued
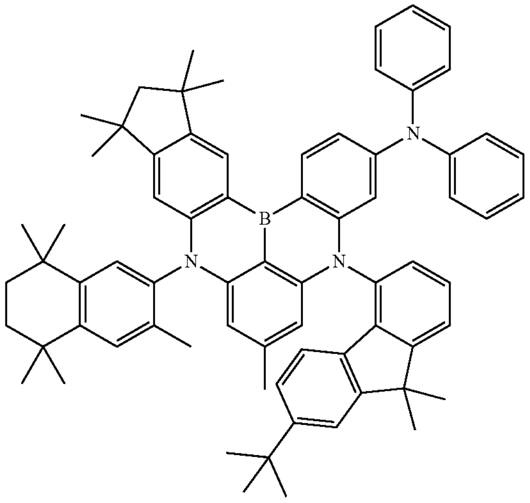
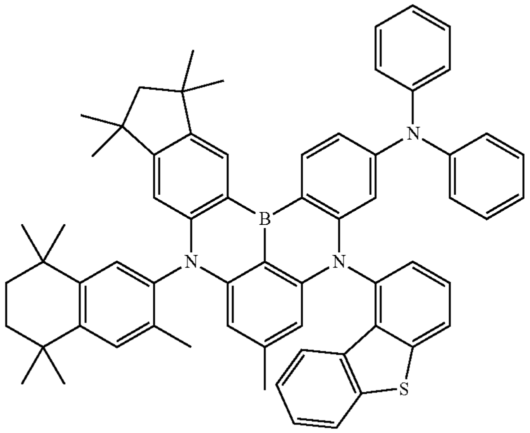
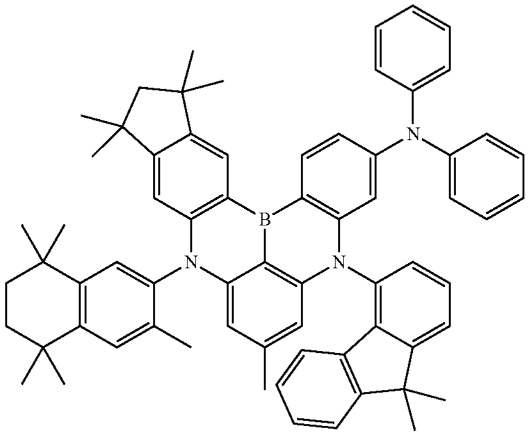

-continued
-continued
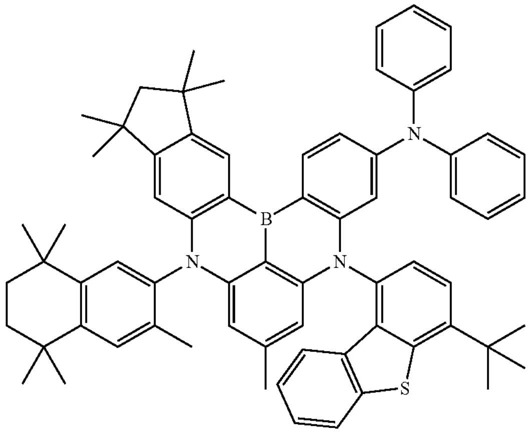
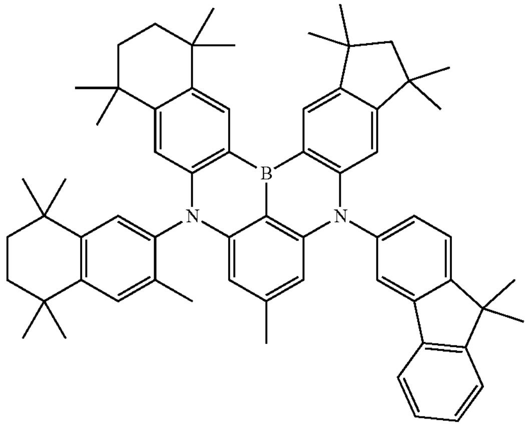
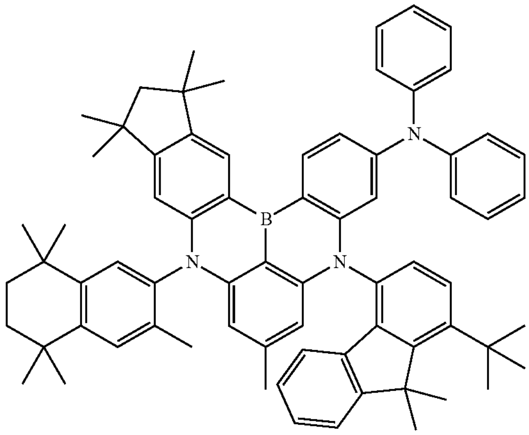
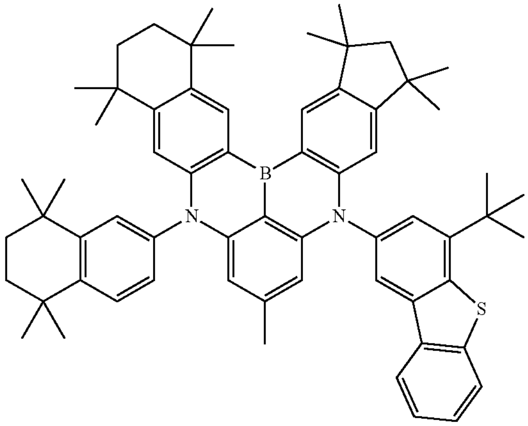
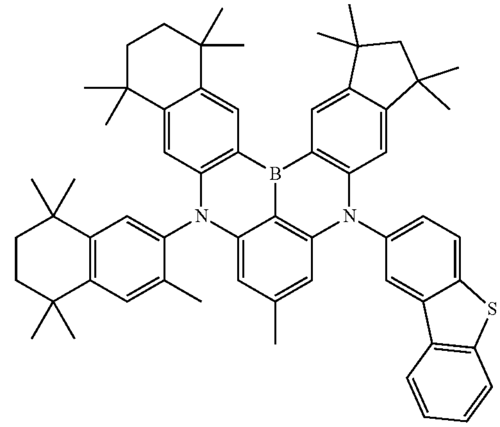
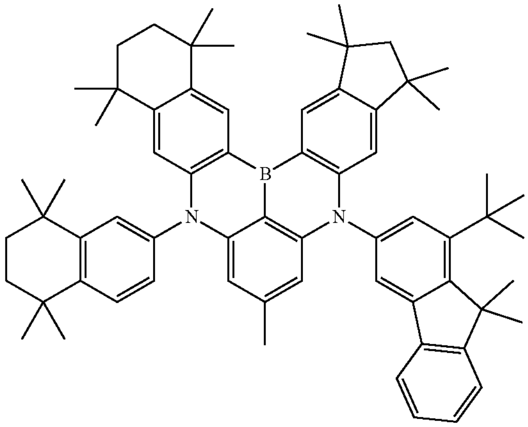

-continued
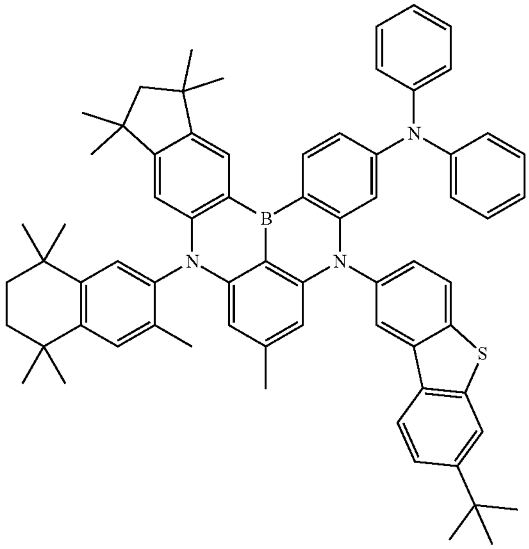
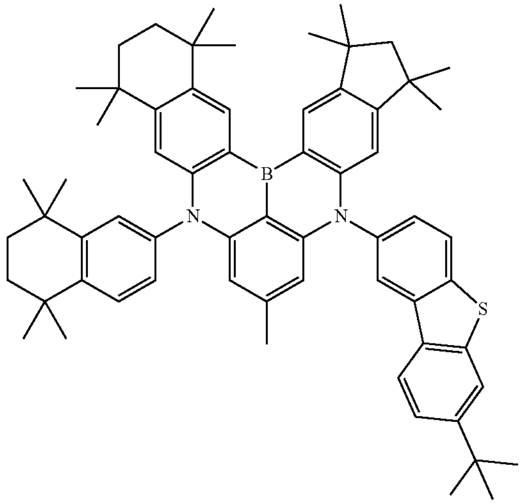
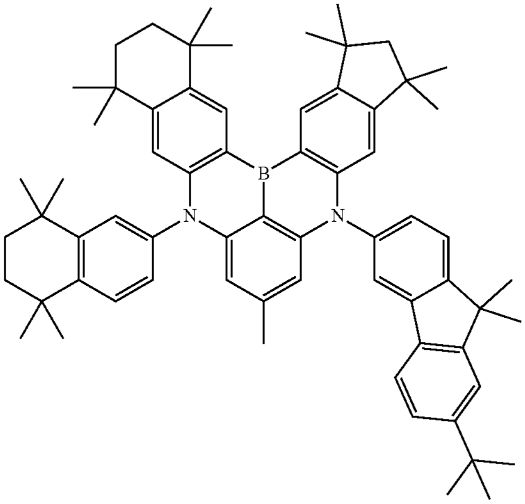
-continued
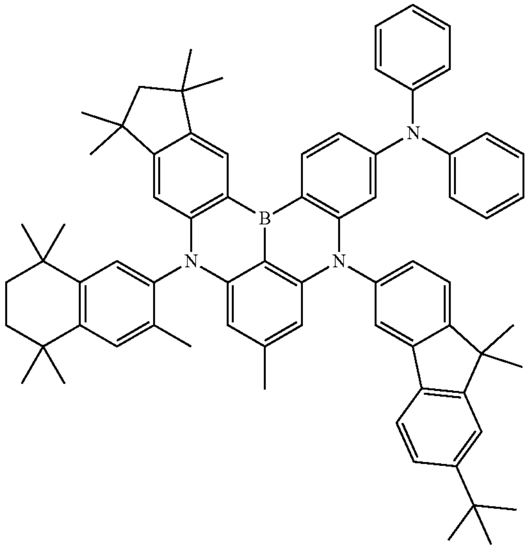
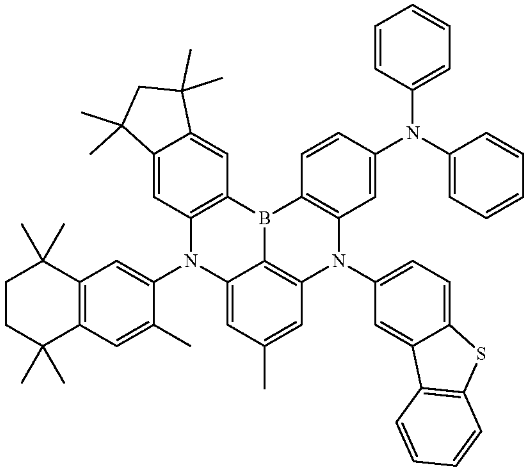
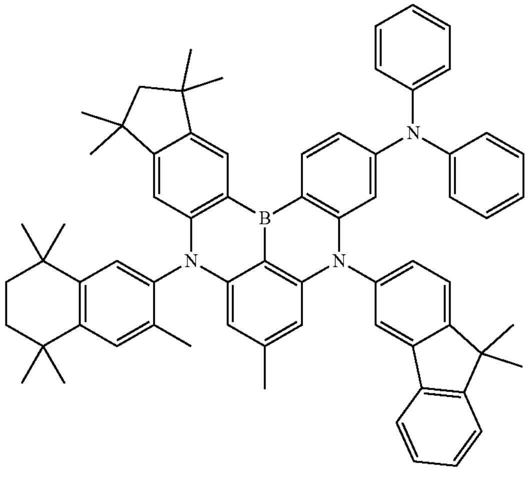

-continued
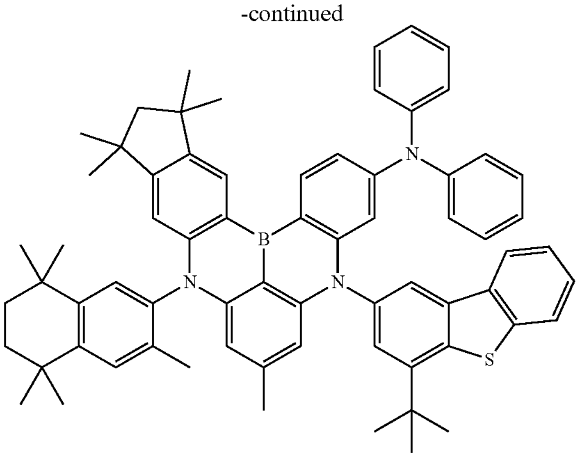
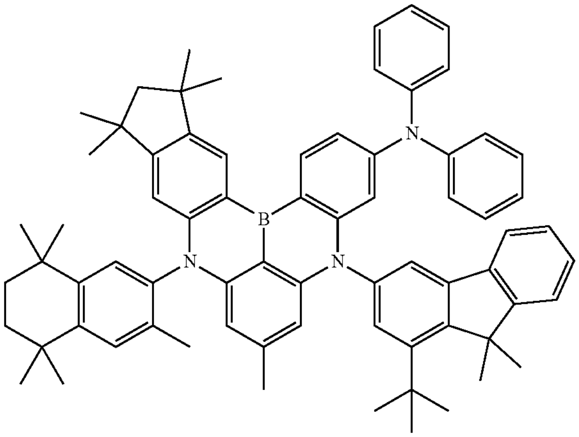
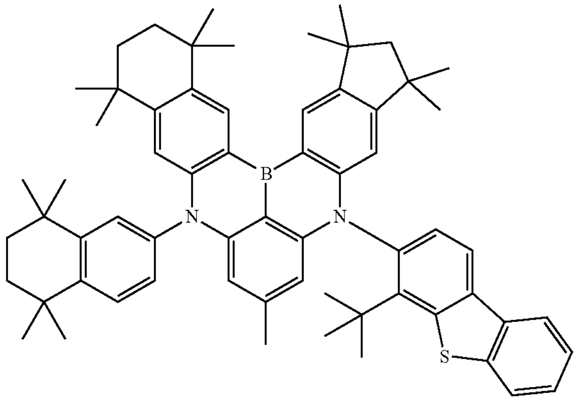
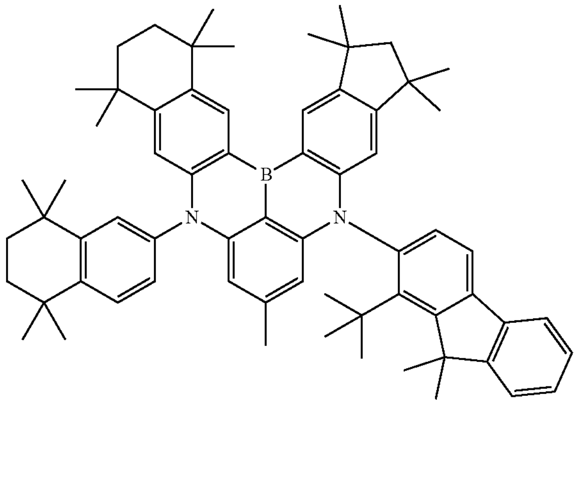
-continued
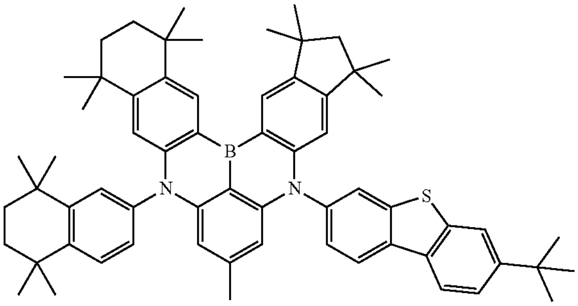
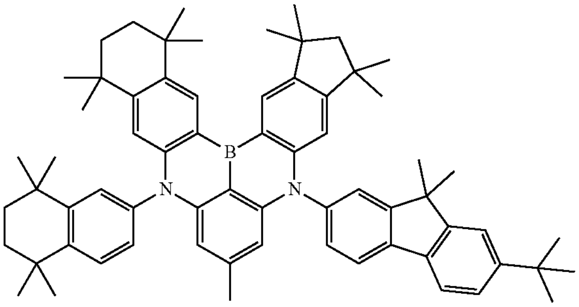
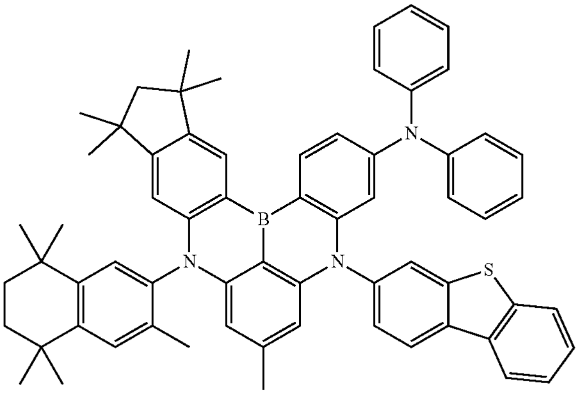
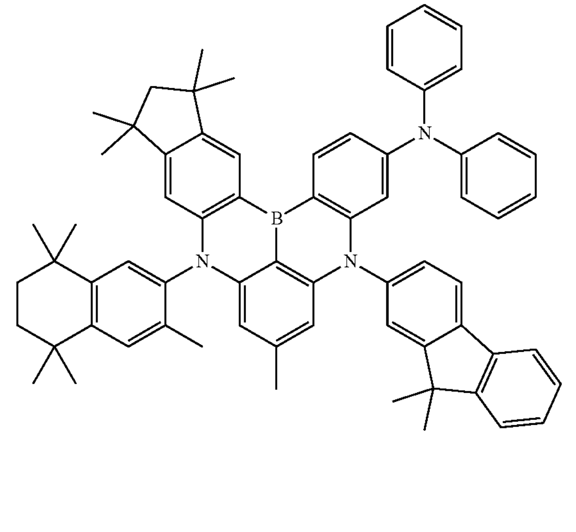

-continued
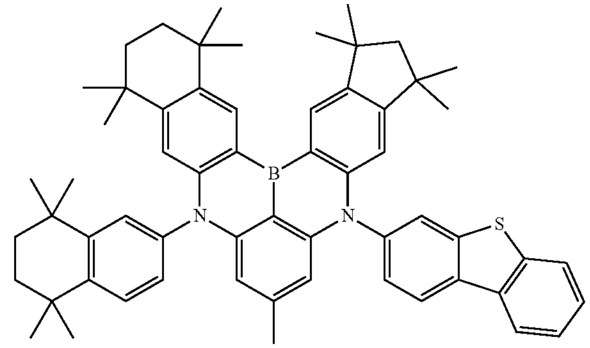
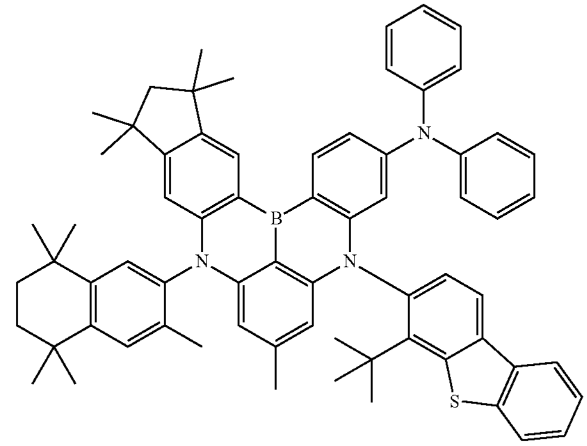
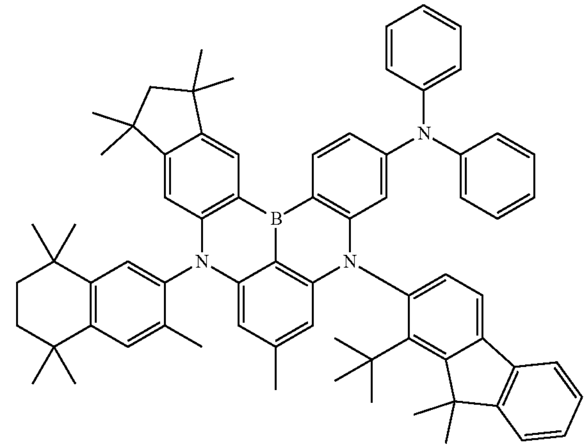
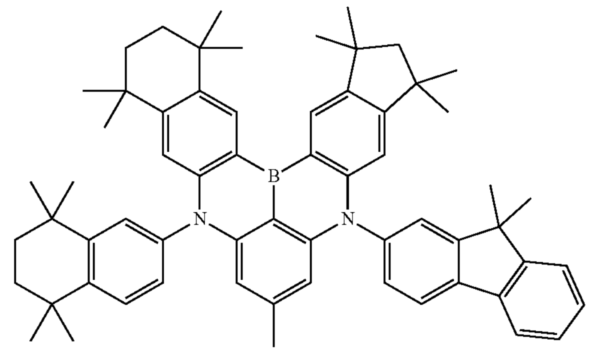
-continued
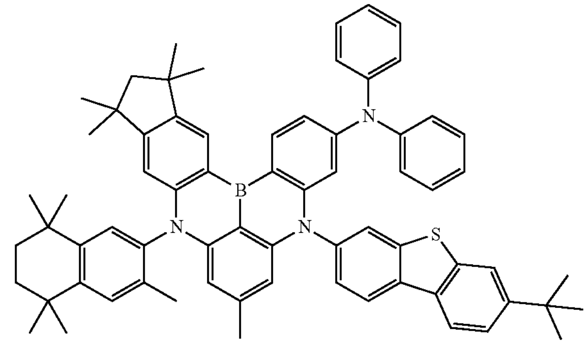
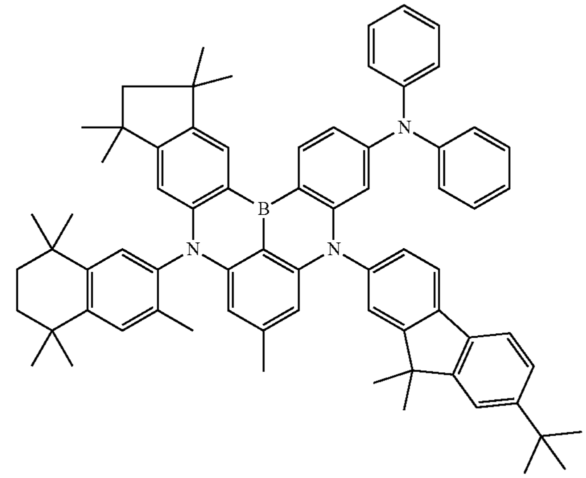
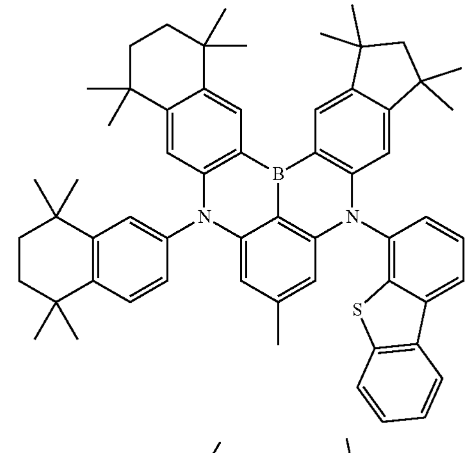
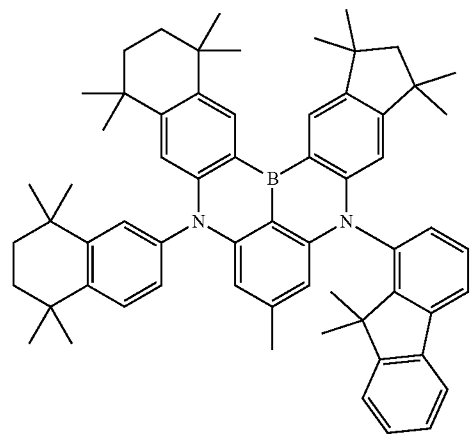

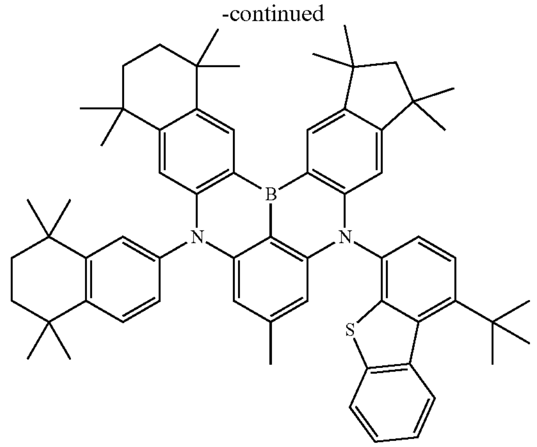
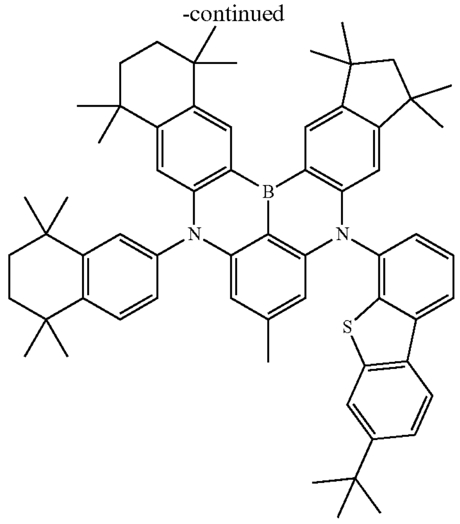
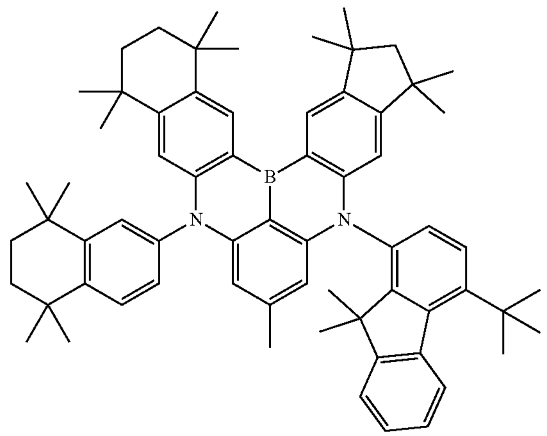
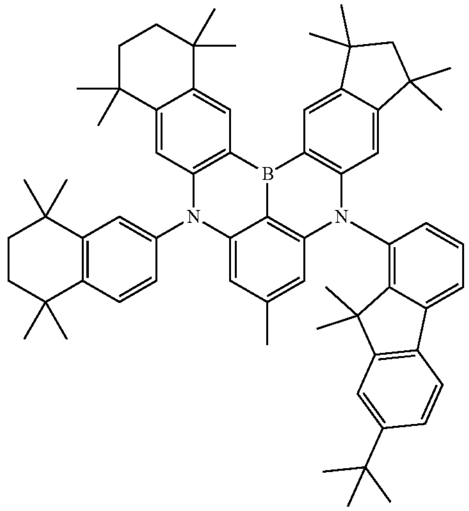
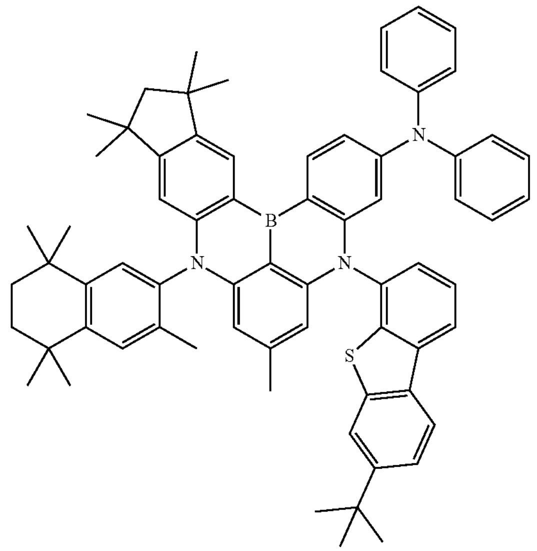
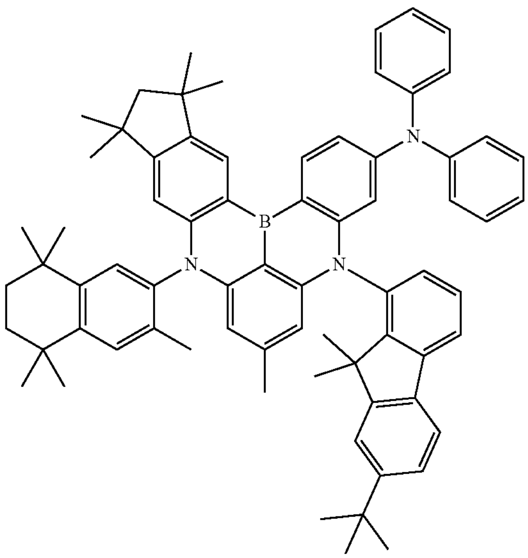

-continued
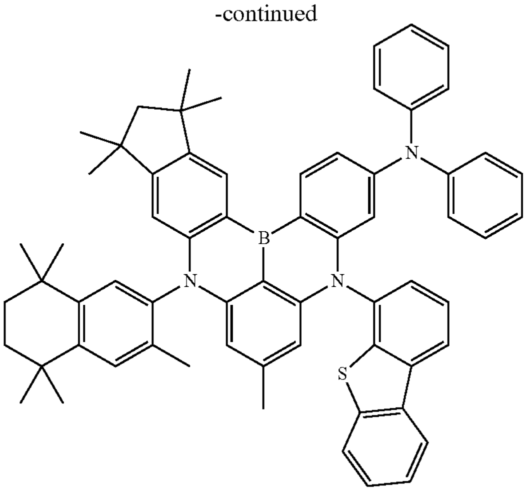
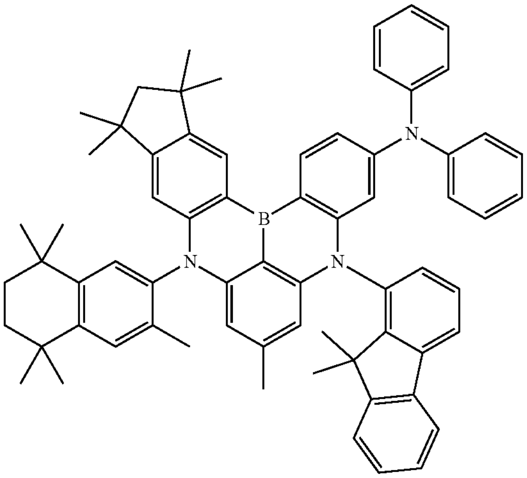
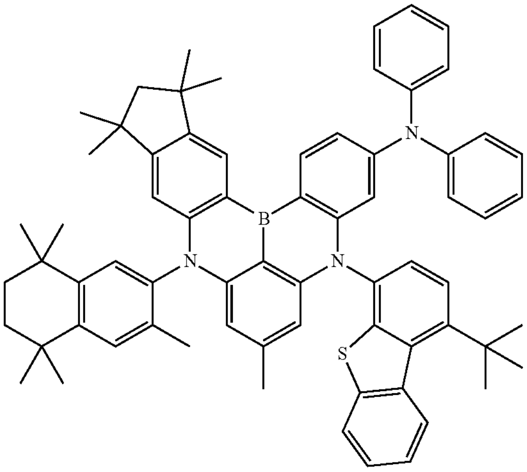
-continued
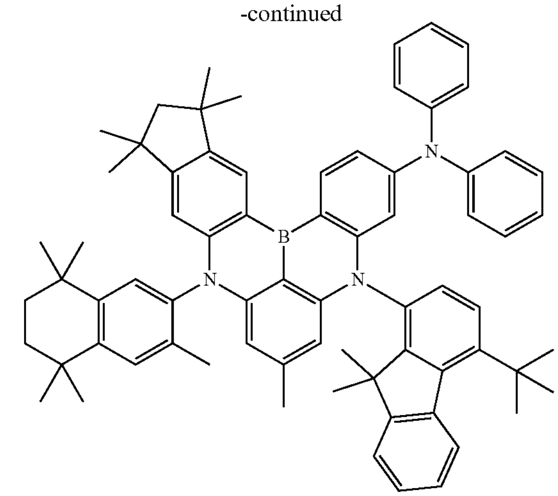
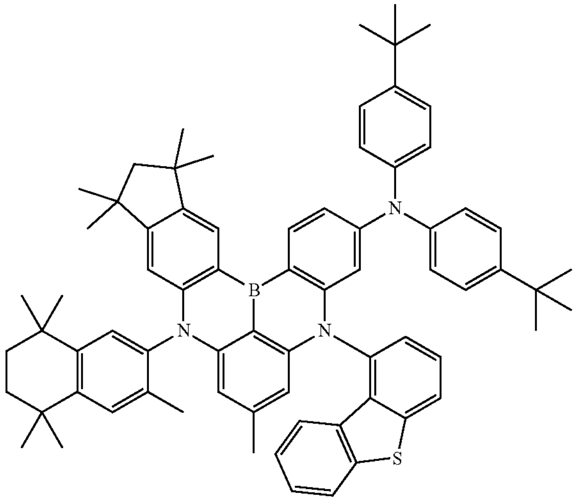
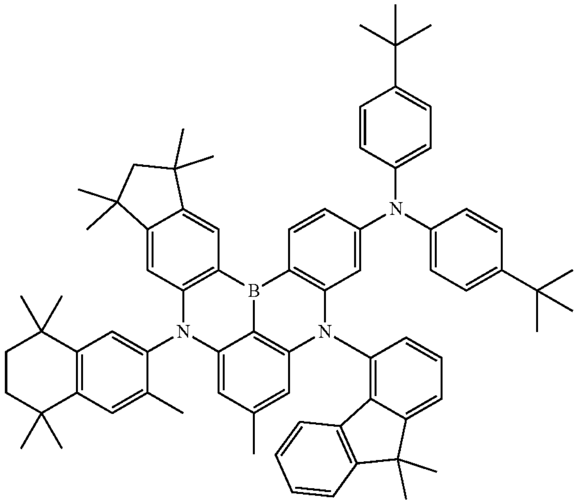

-continued
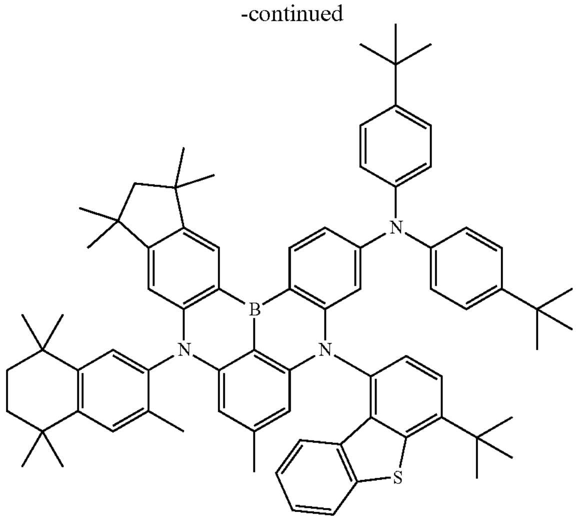
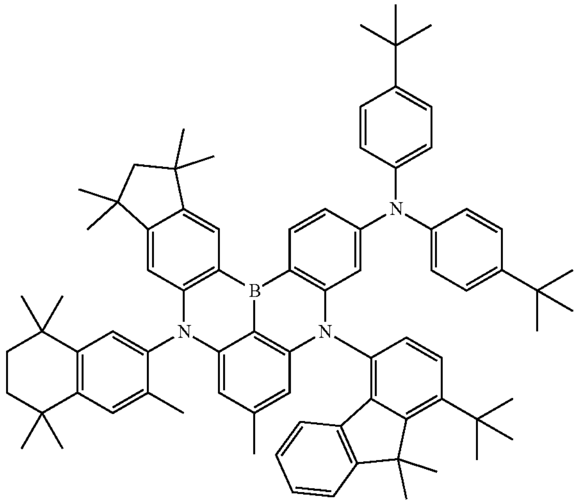
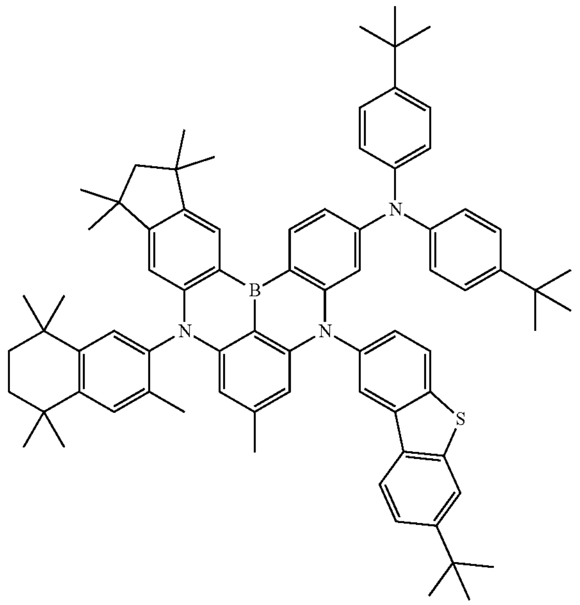
-continued
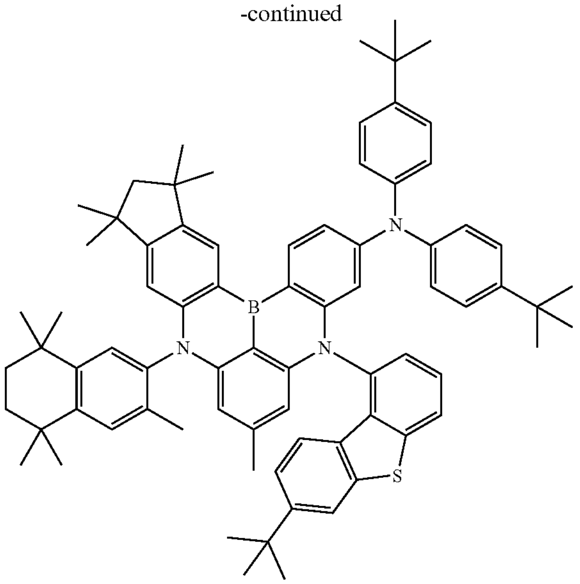
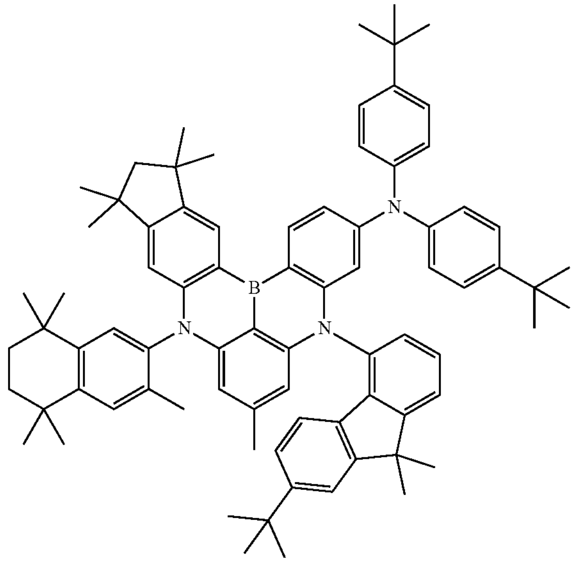
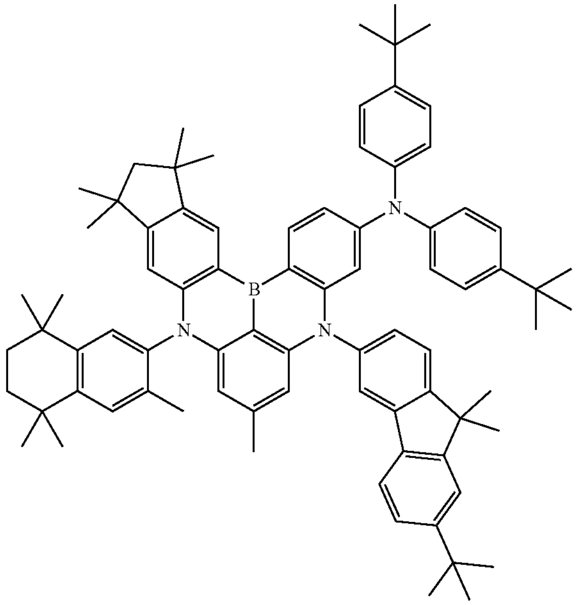

-continued
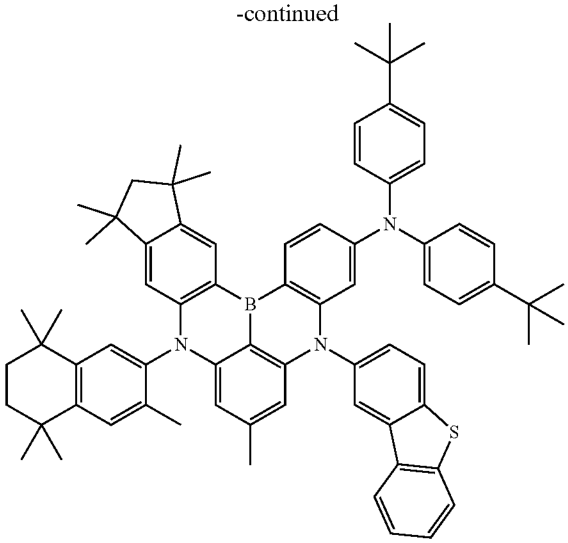
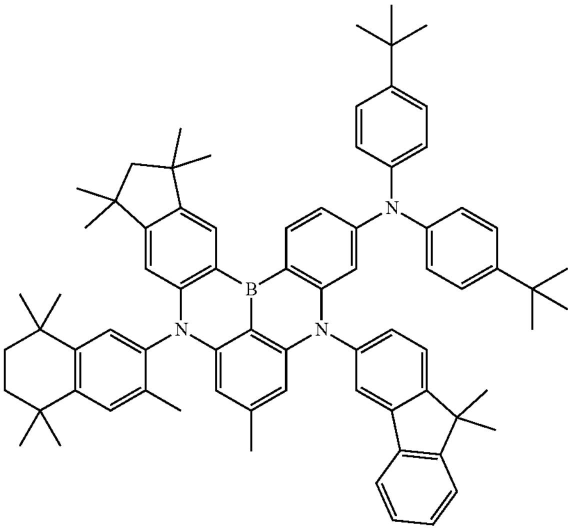
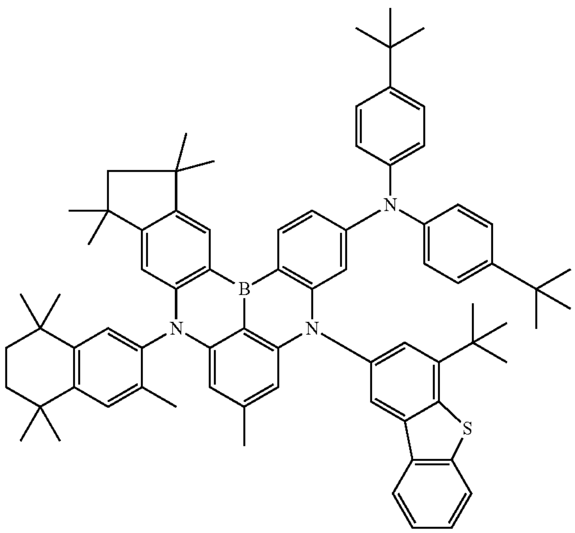
-continued
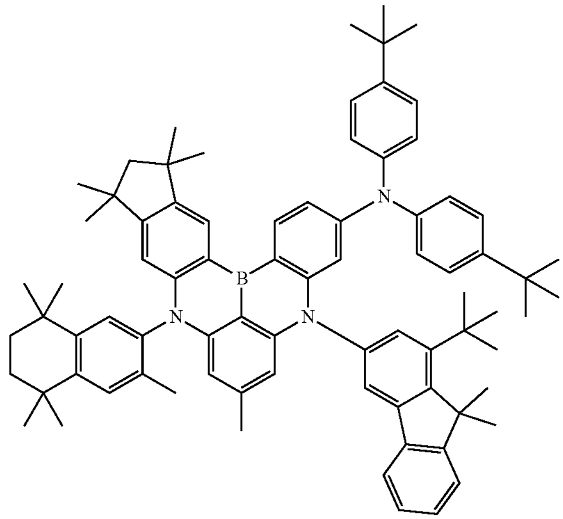
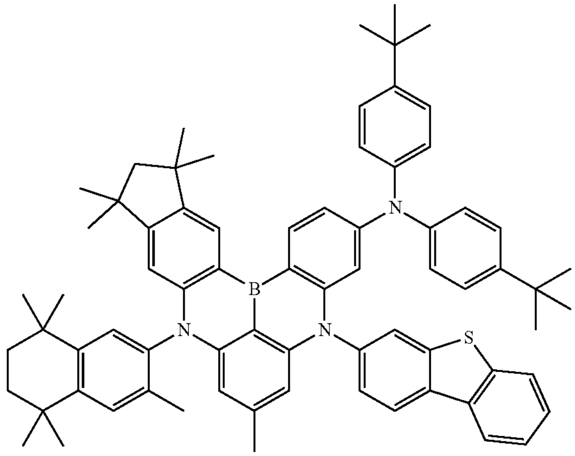
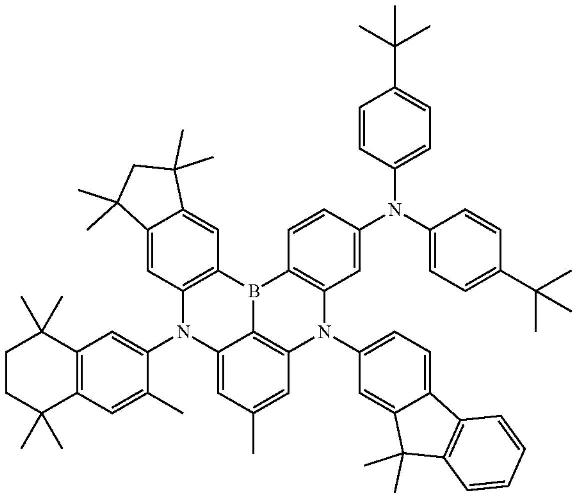

-continued
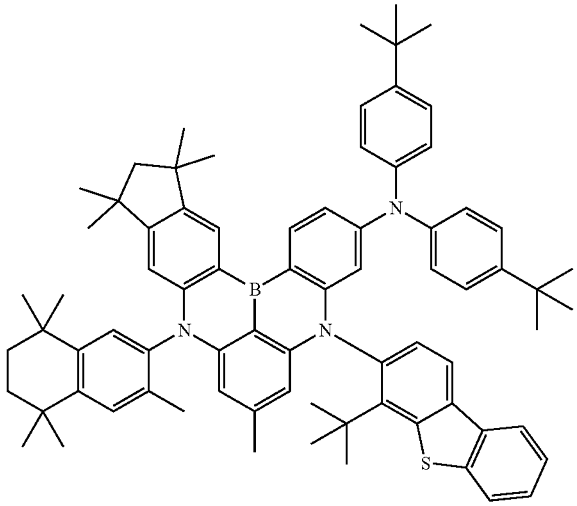
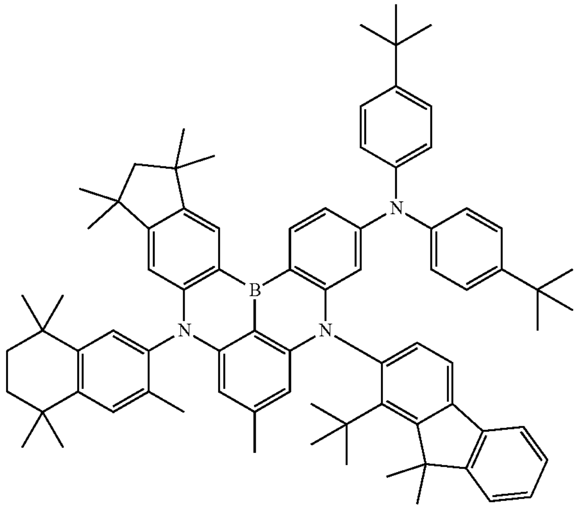
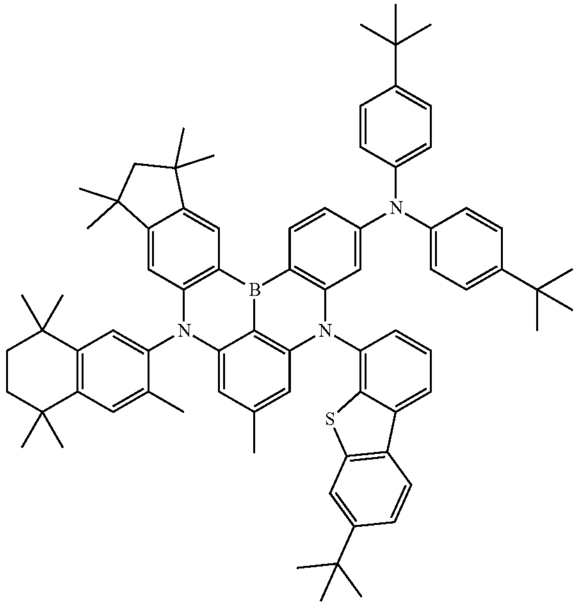
-continued
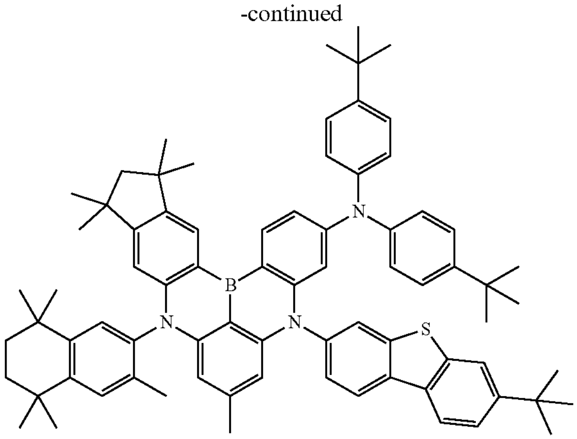
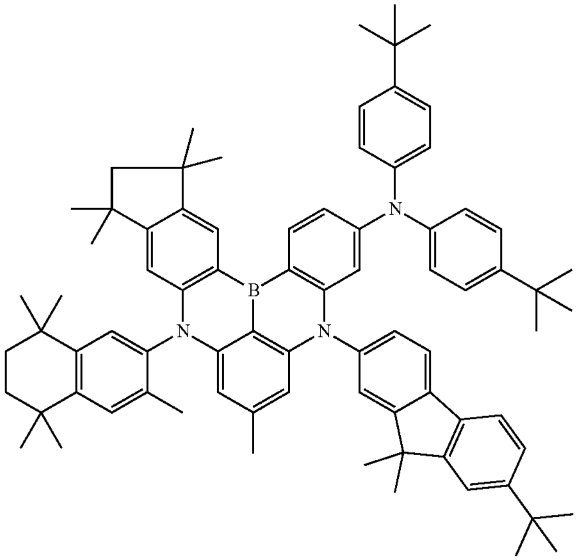
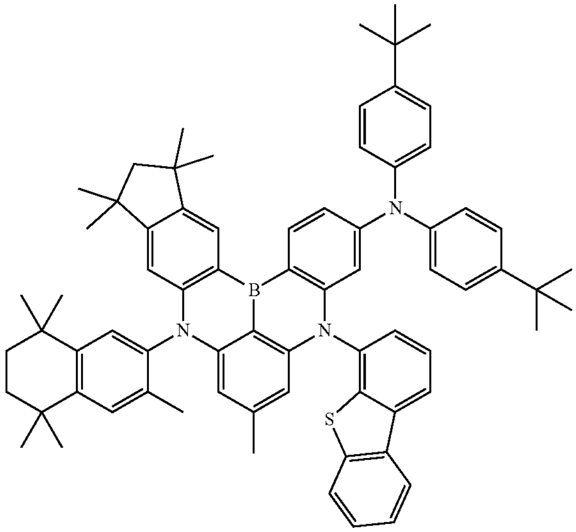

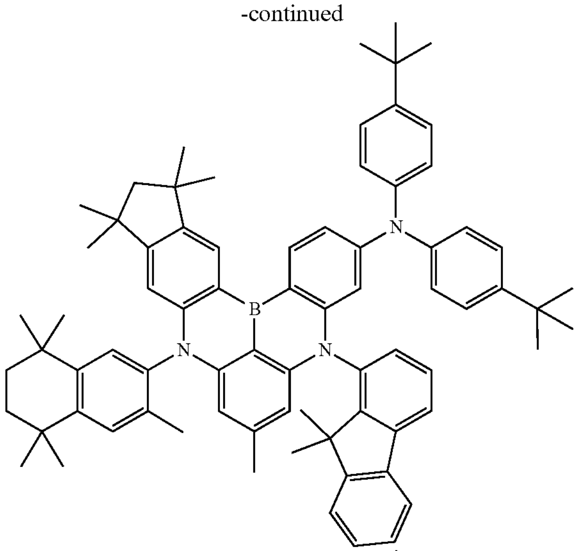
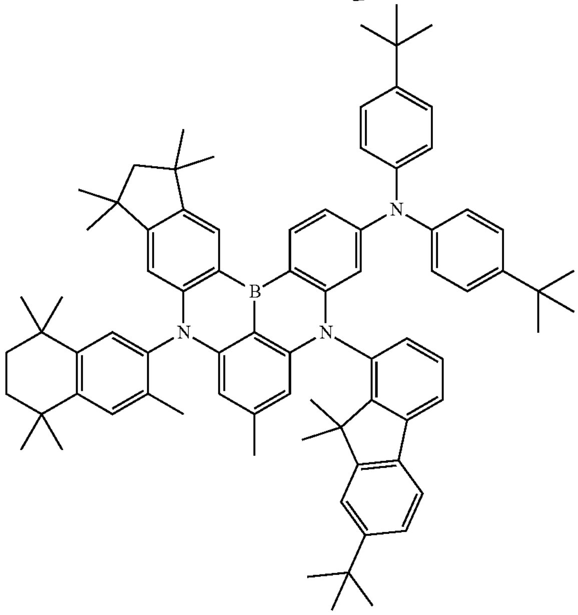
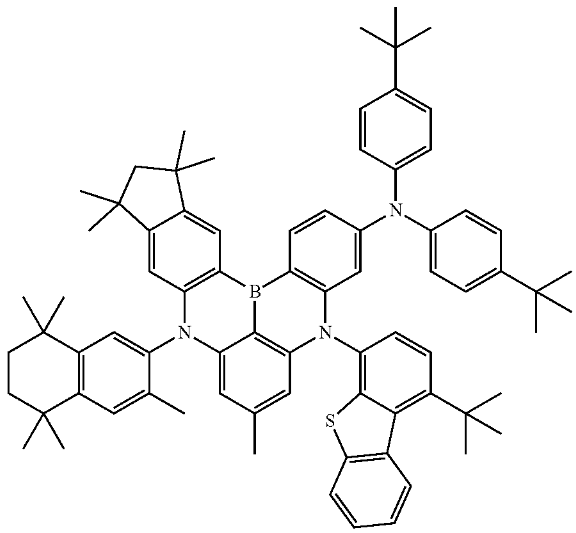
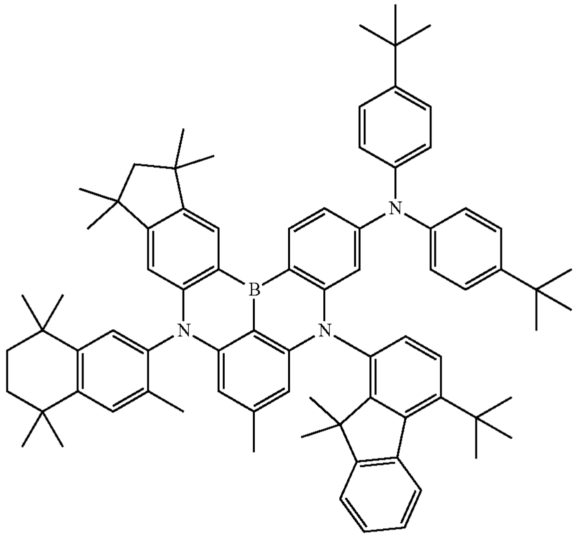
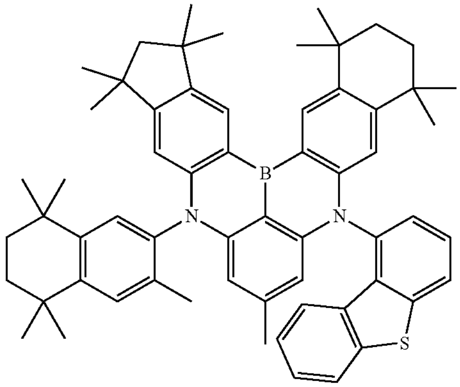
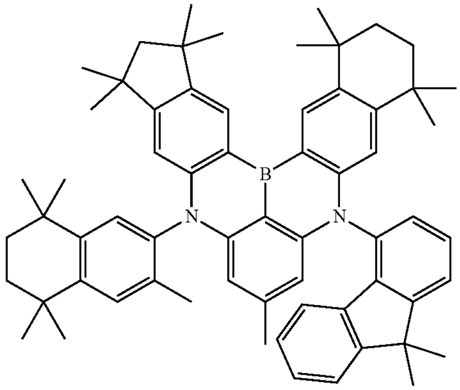
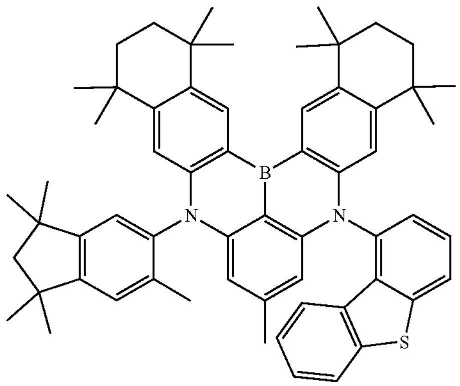

-continued
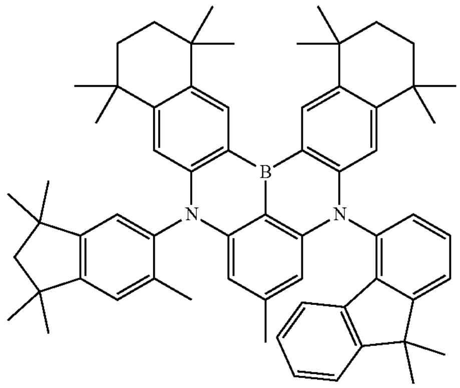
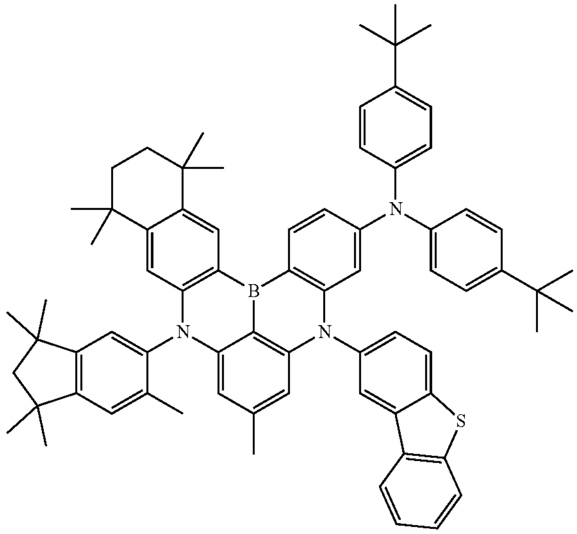
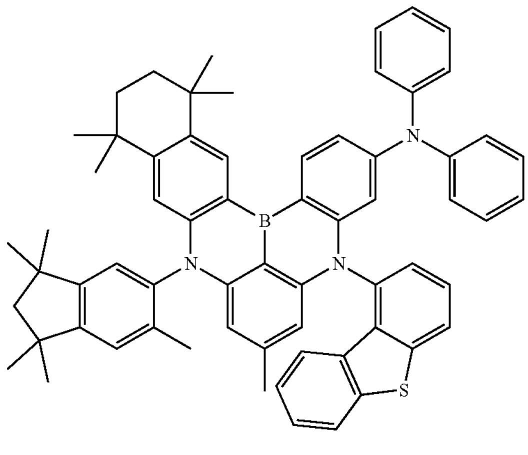
-continued
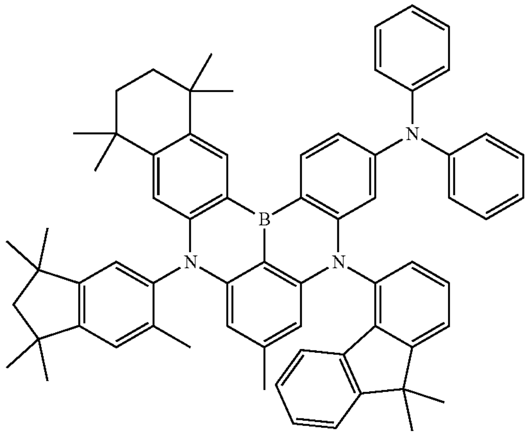
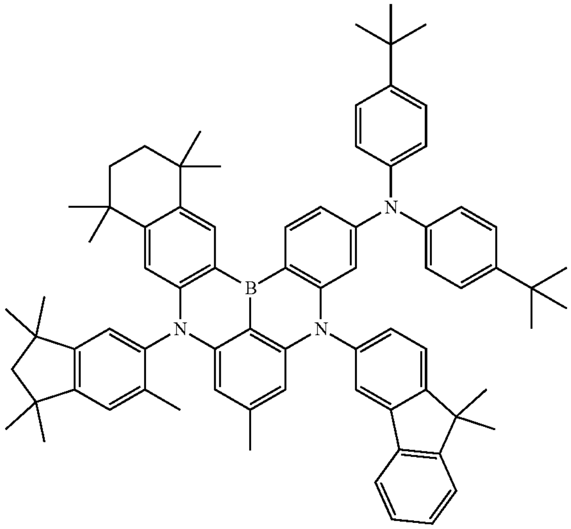
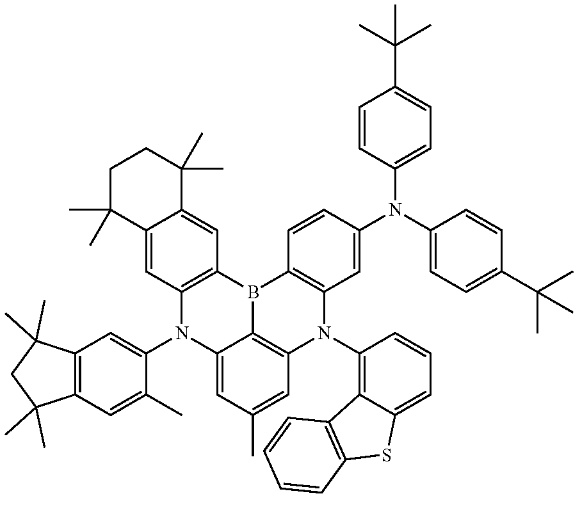

-continued
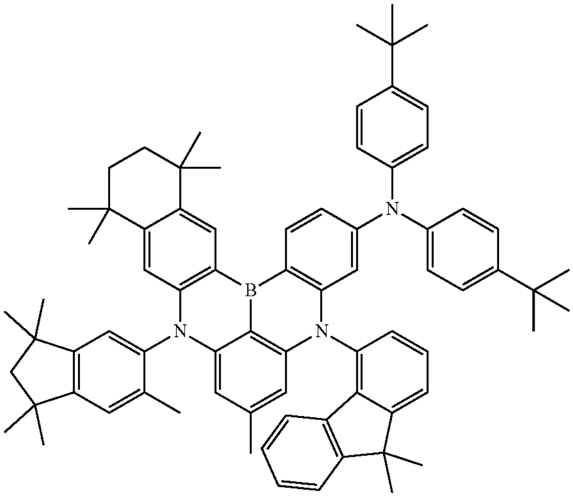
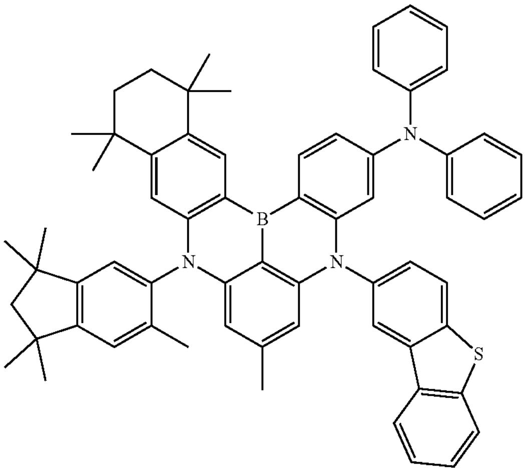
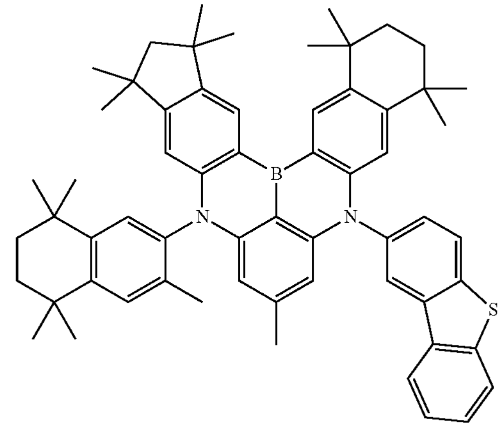
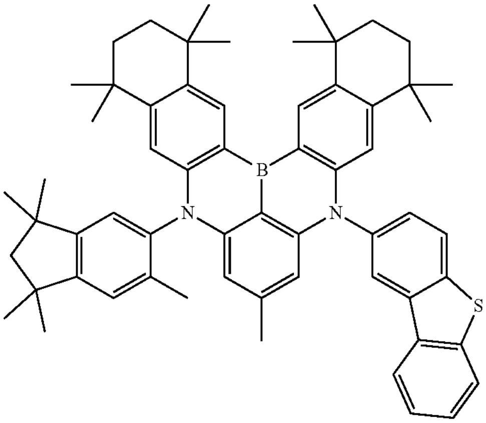
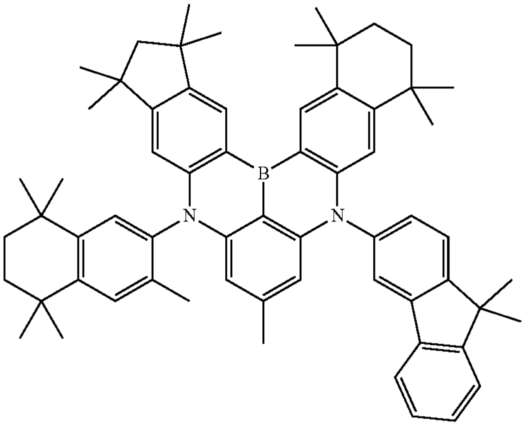
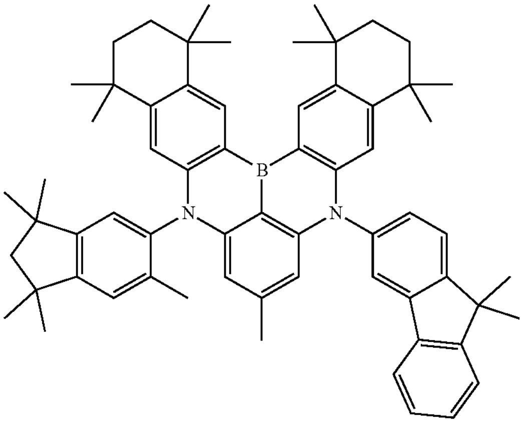
-continued -continued
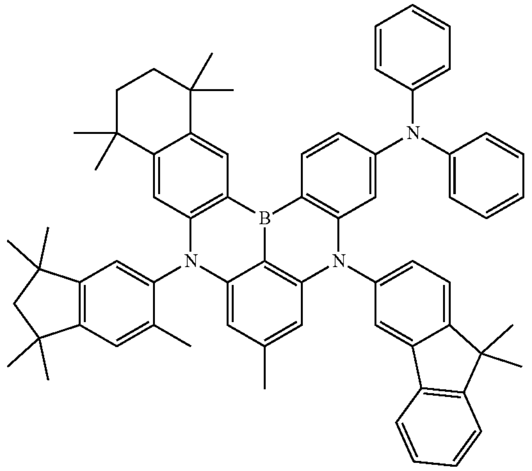
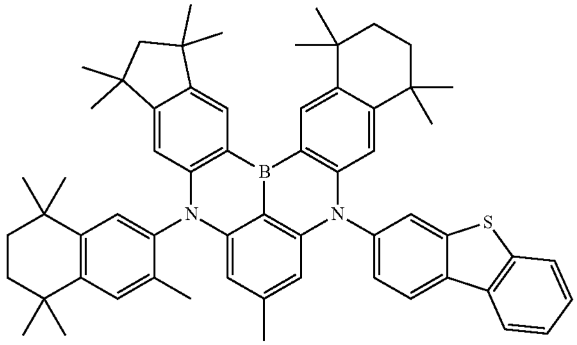
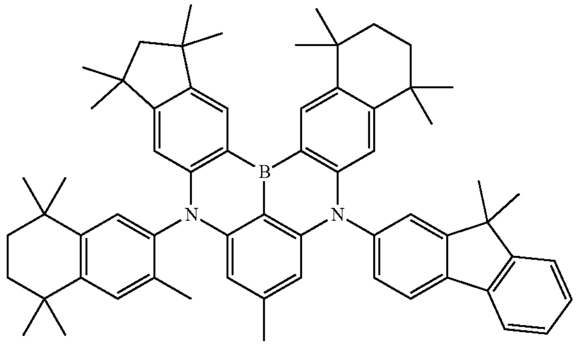
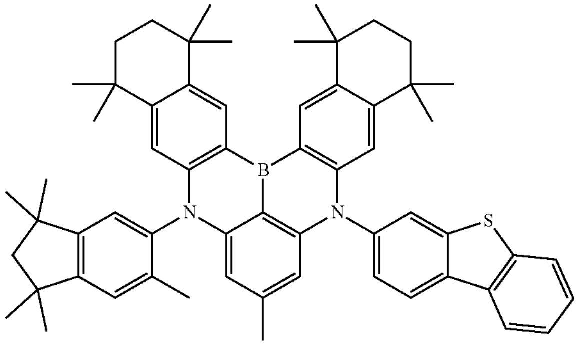
-continued
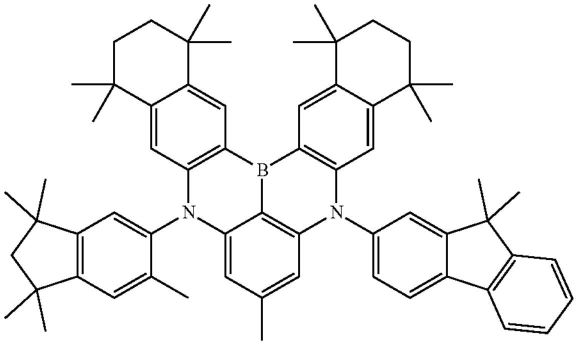
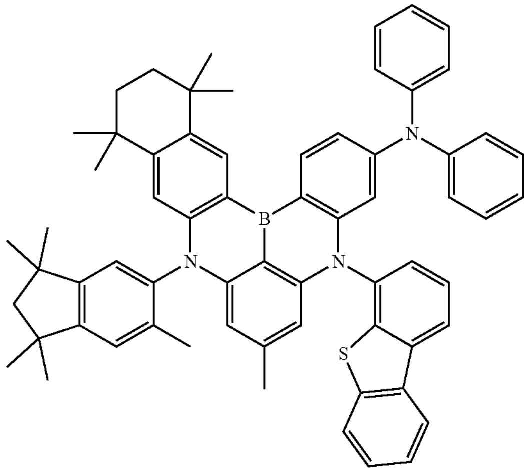
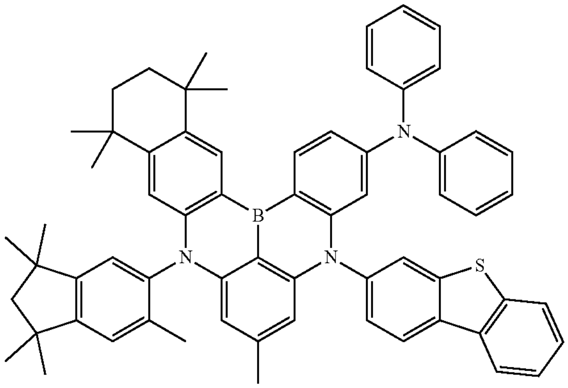
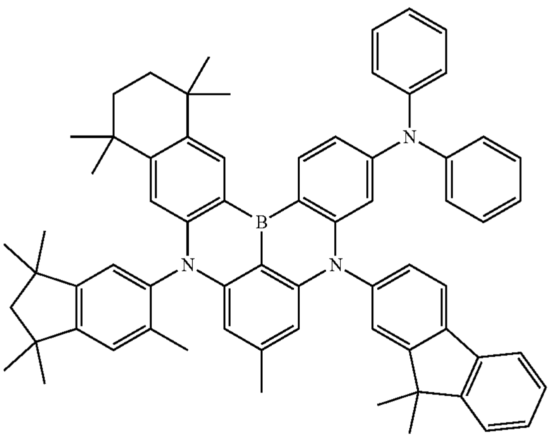

-continued
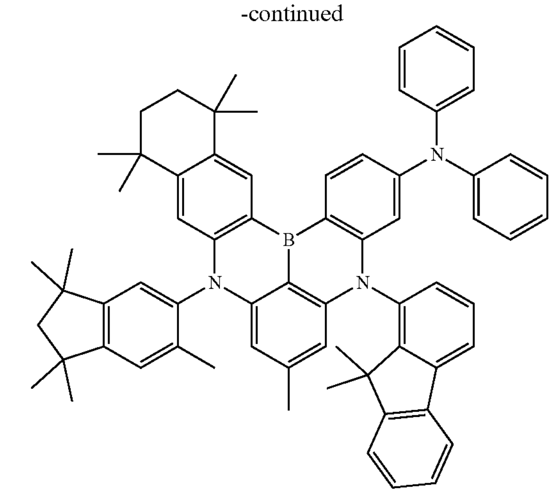
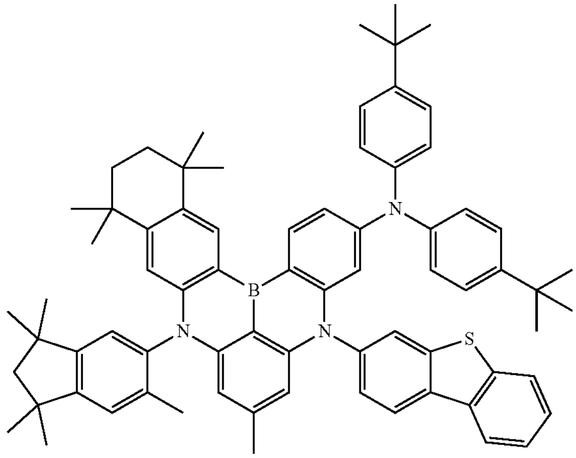
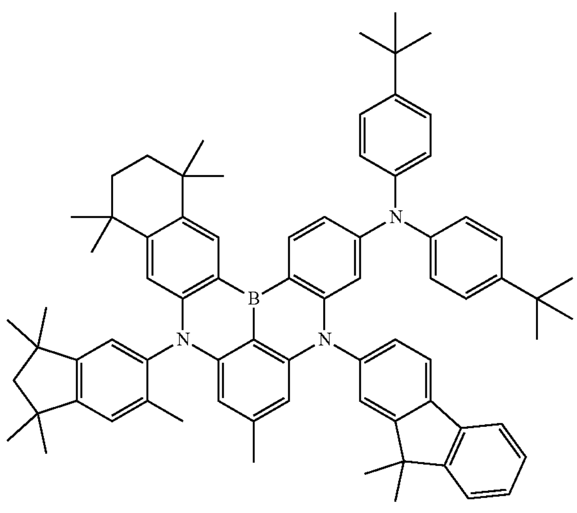
-continued
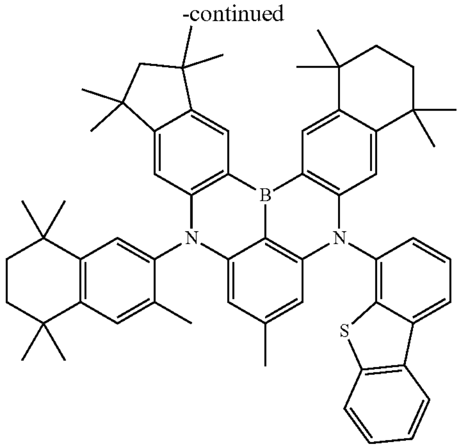
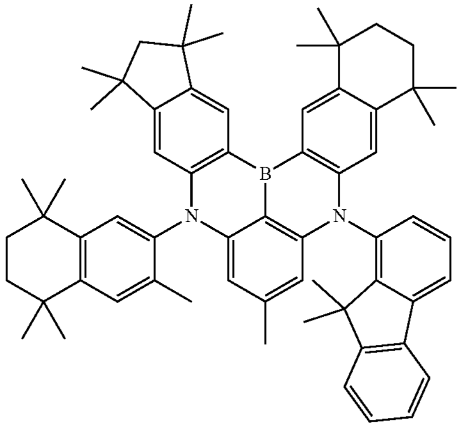
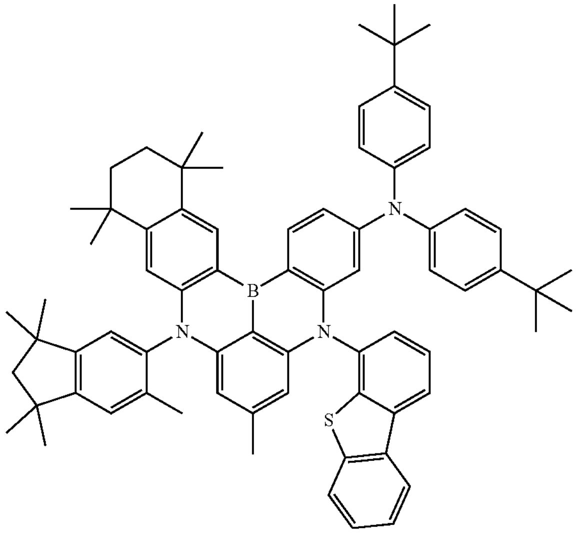

-continued
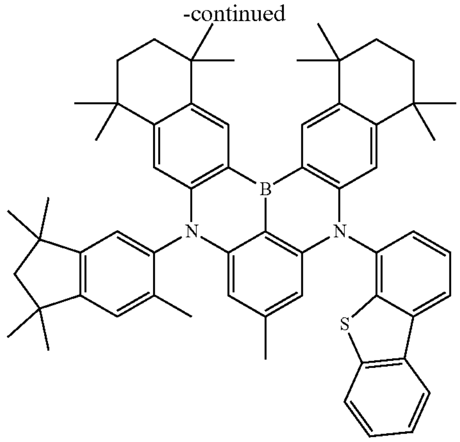
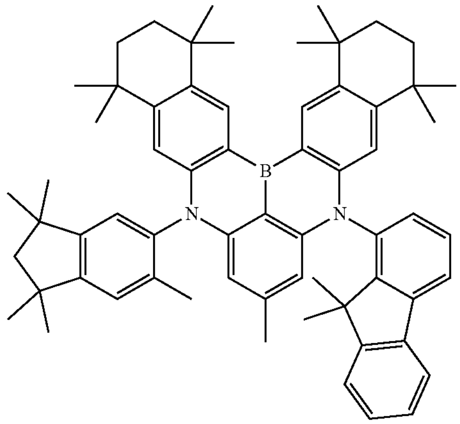
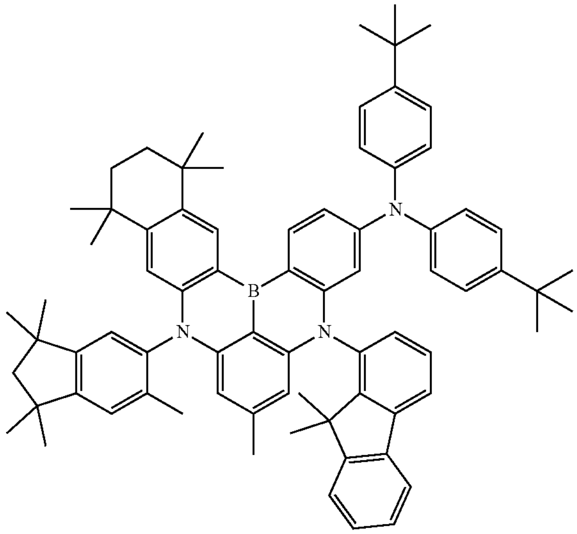
-continued
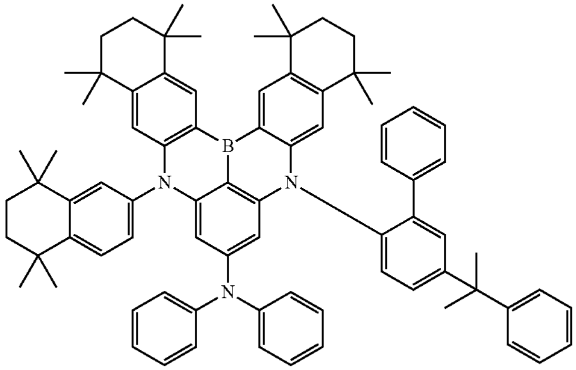
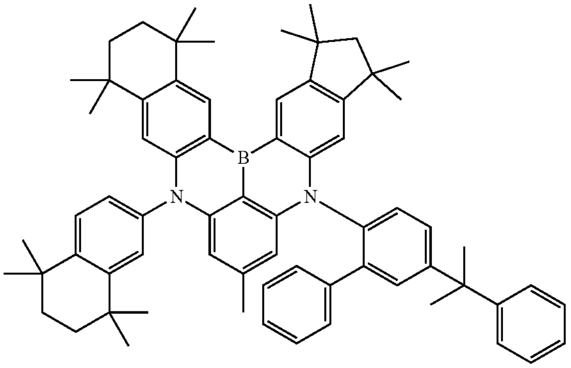
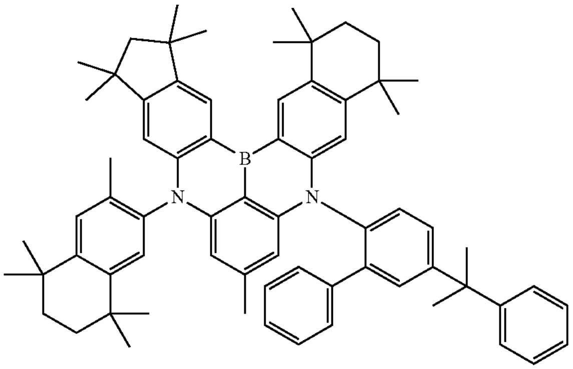
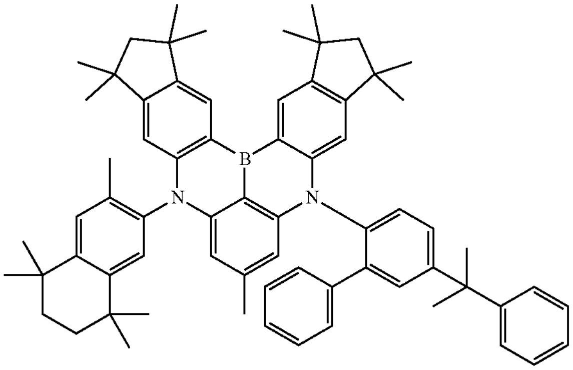

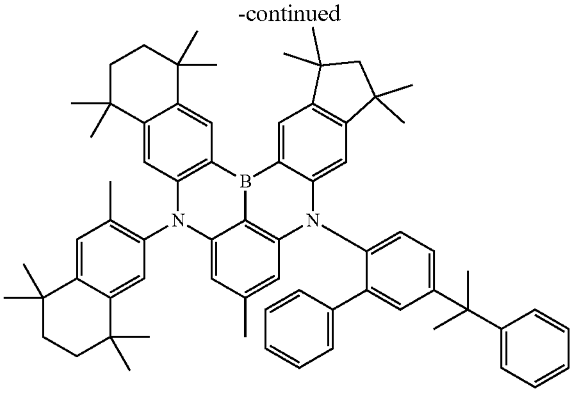
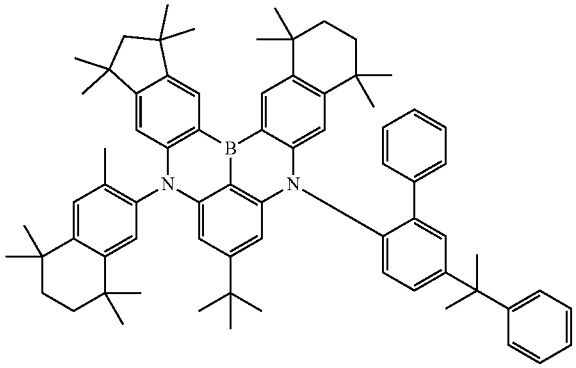
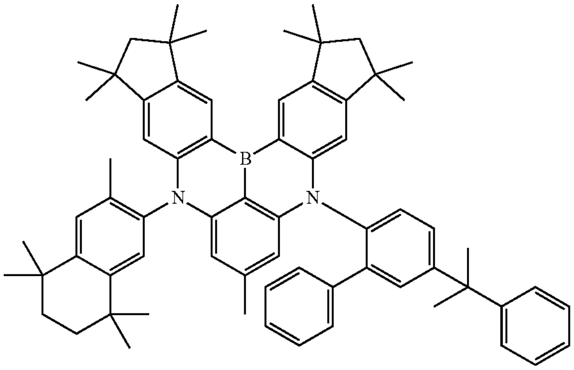
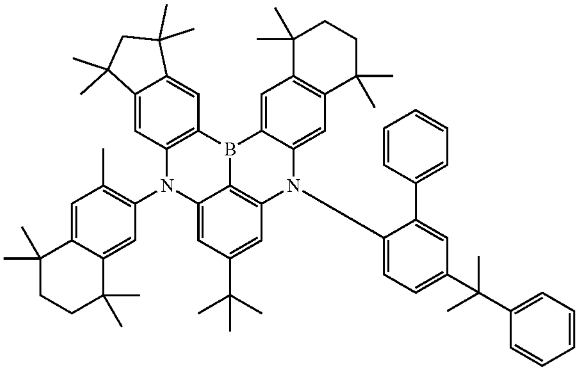
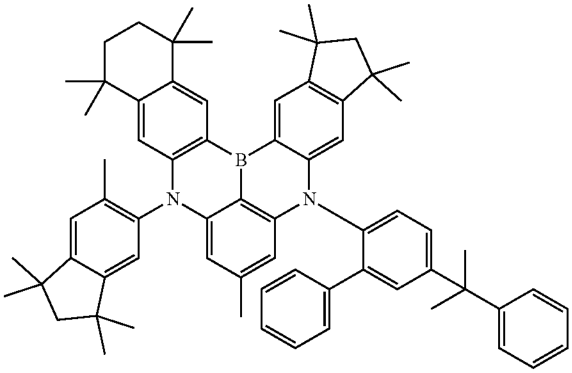
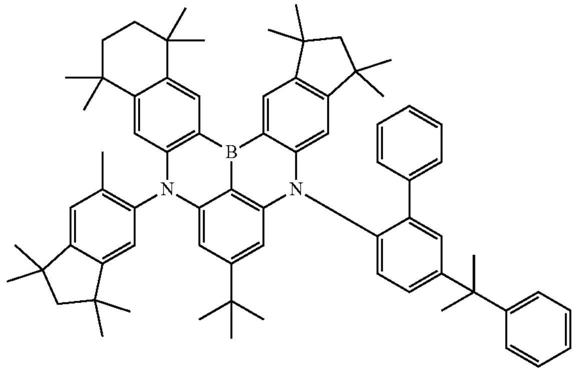
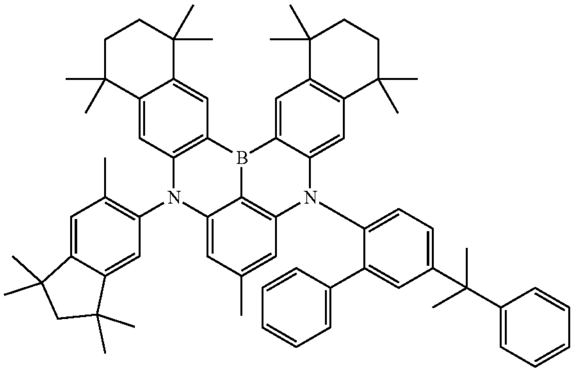
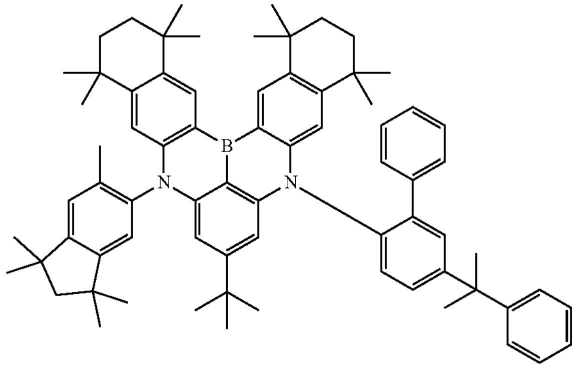

-continued
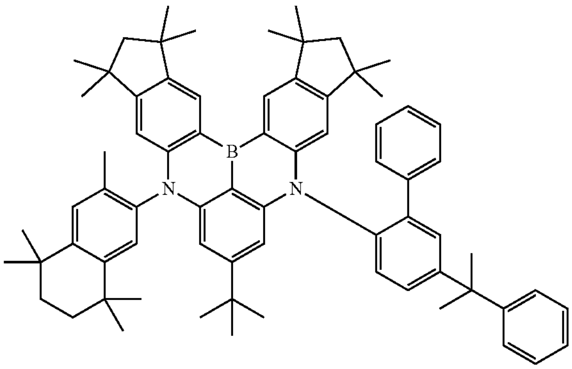
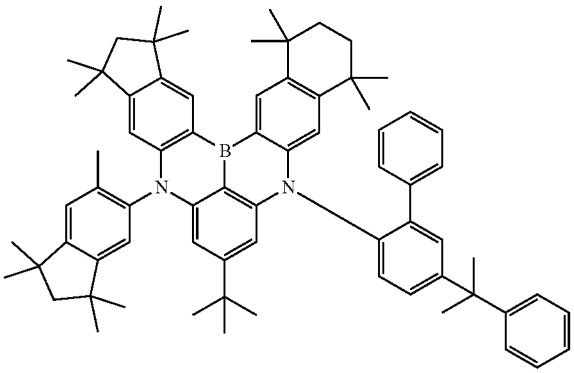
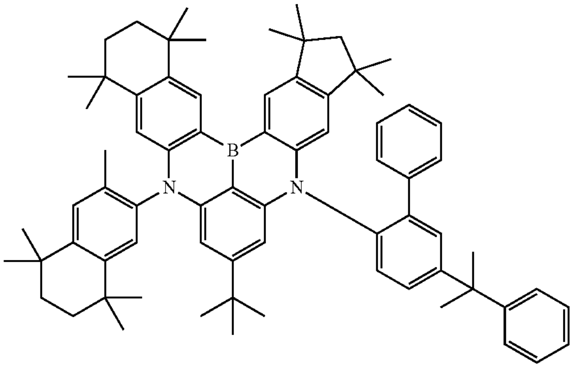
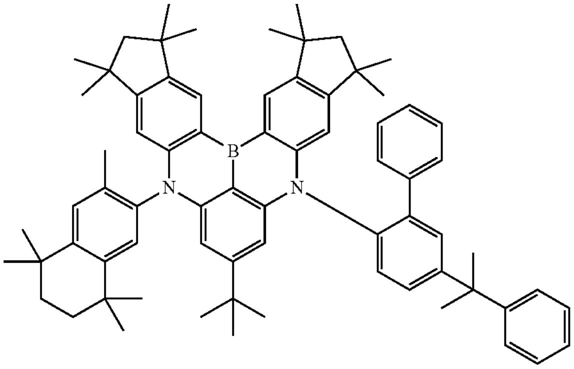
-continued
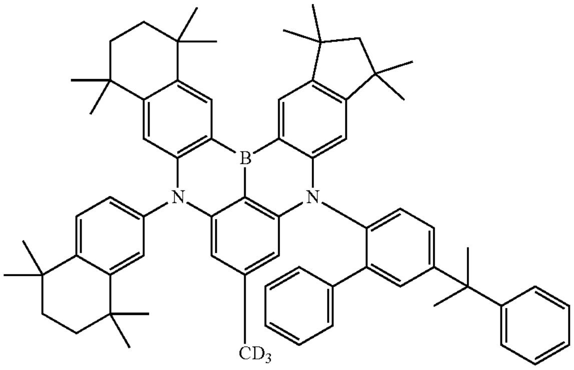
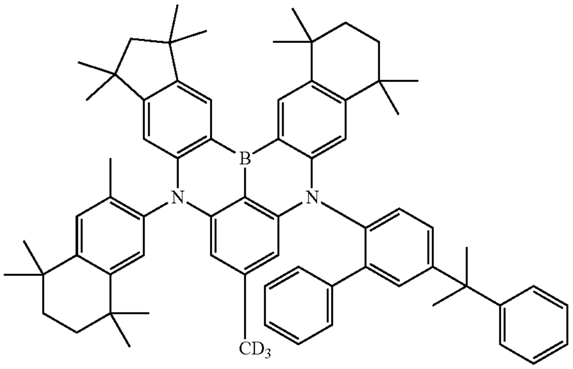
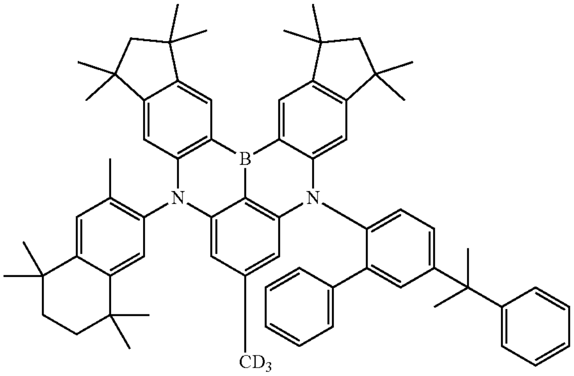
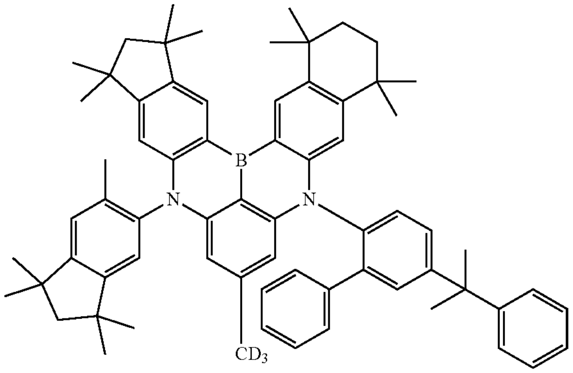

-continued
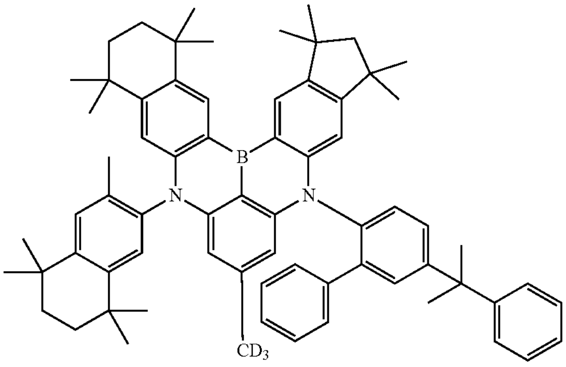
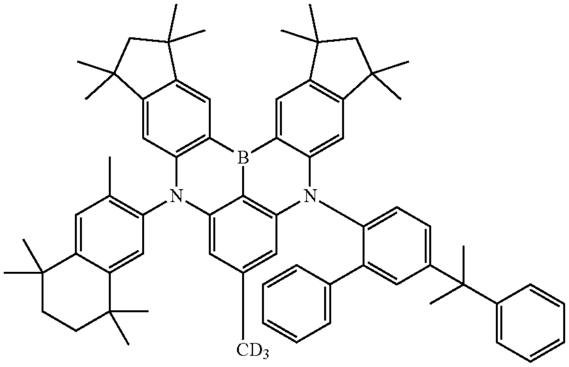
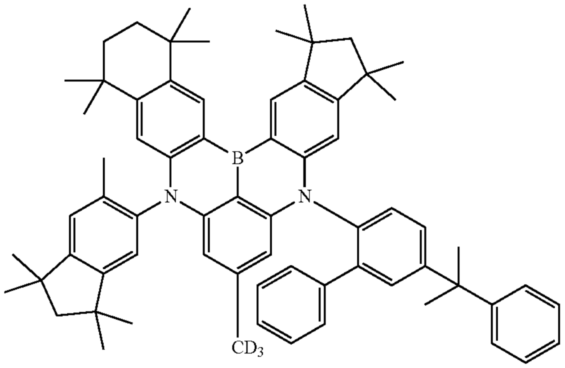
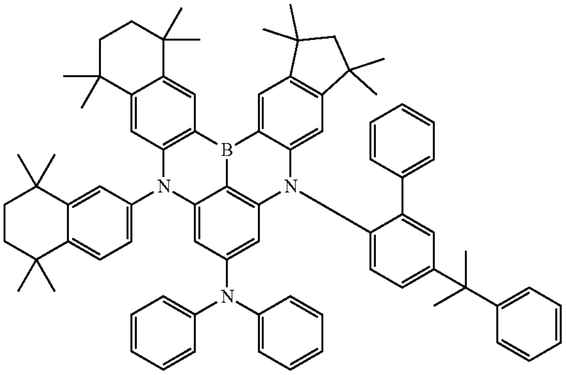
-continued
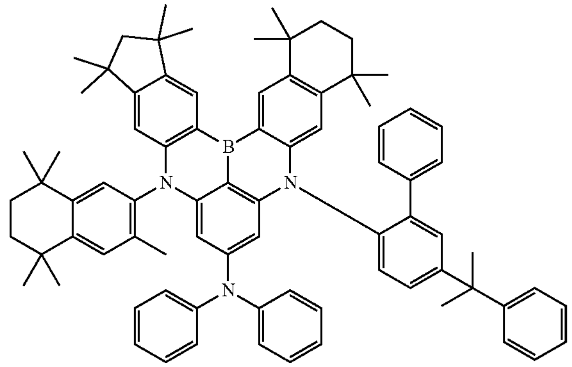
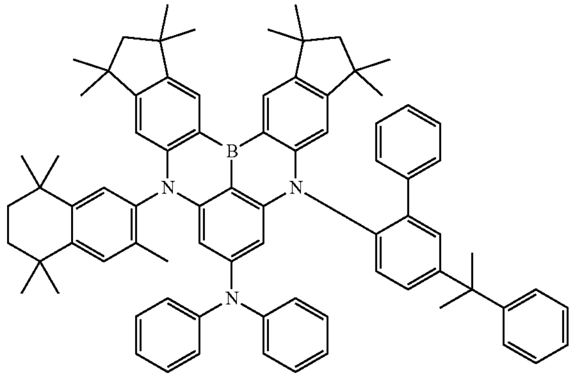
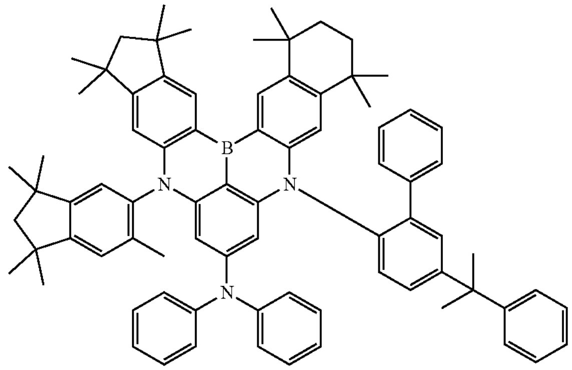
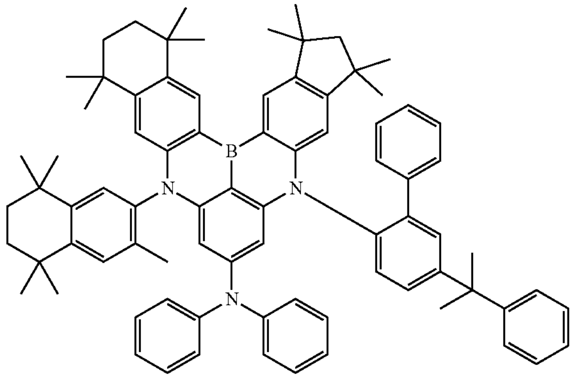

-continued
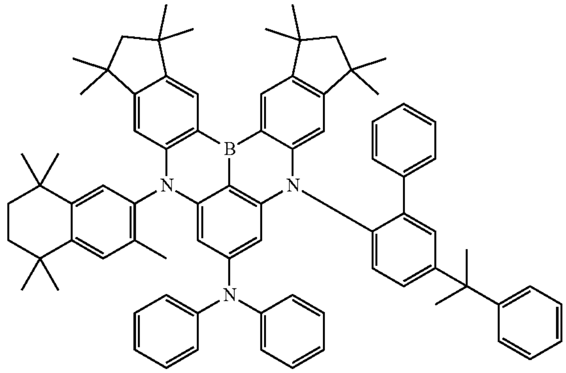
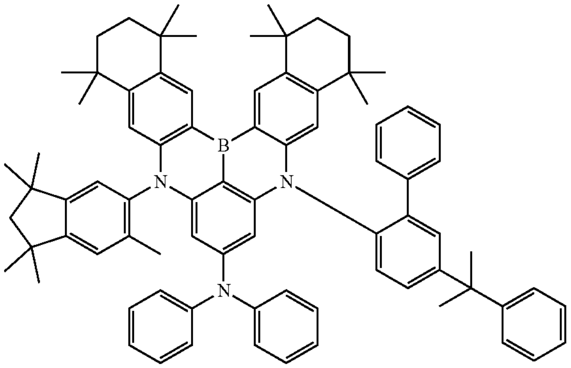
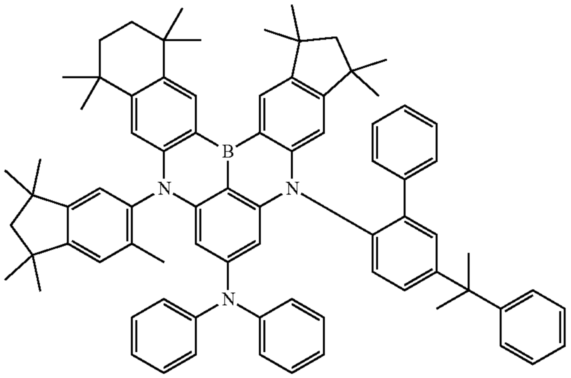
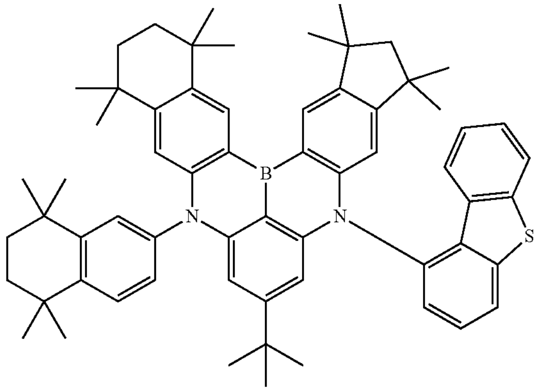
-continued
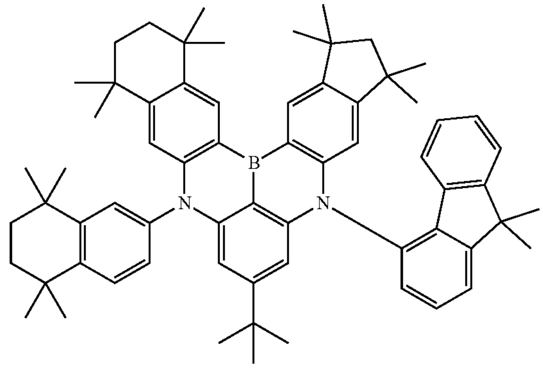
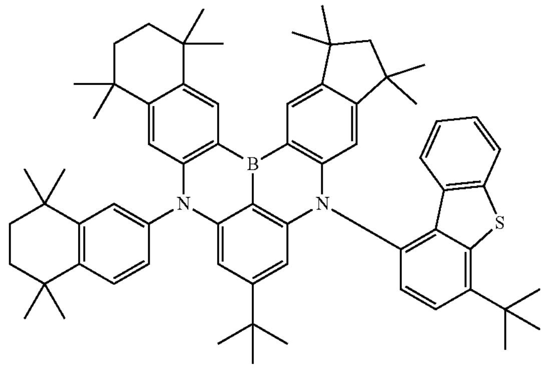
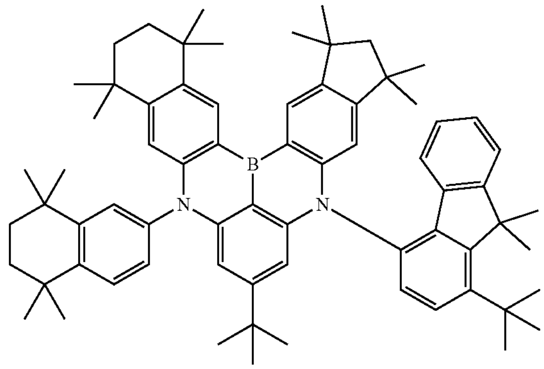
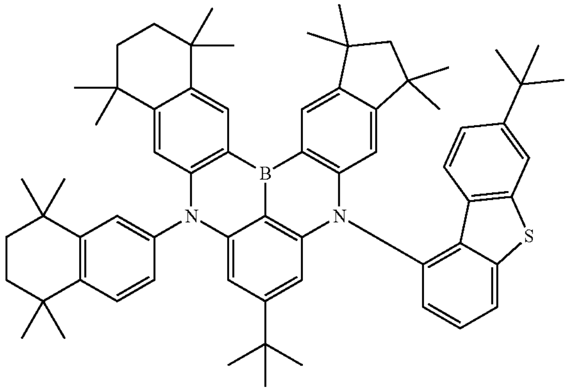

-continued
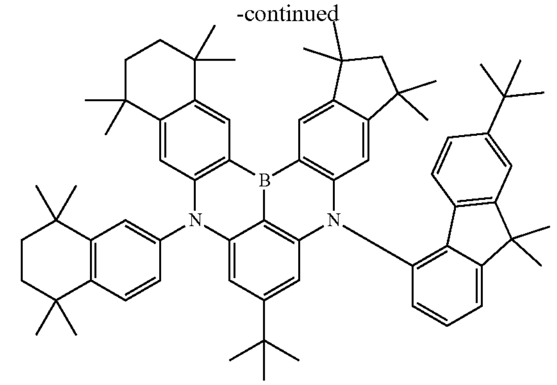
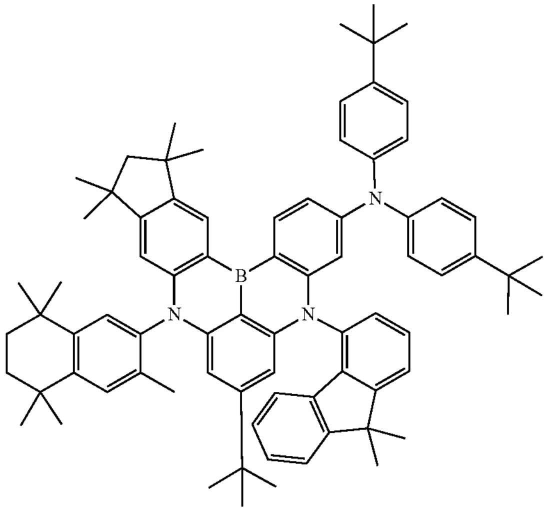
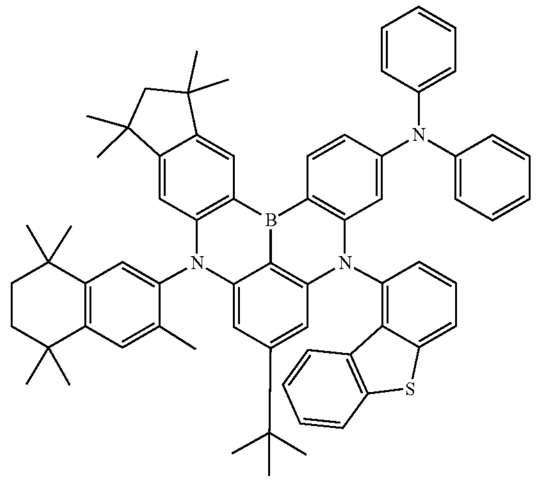
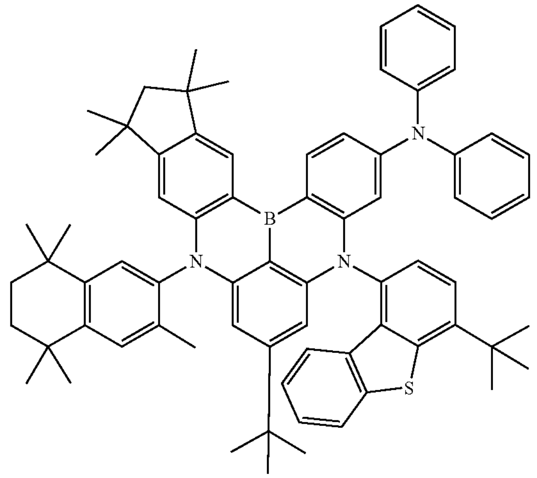
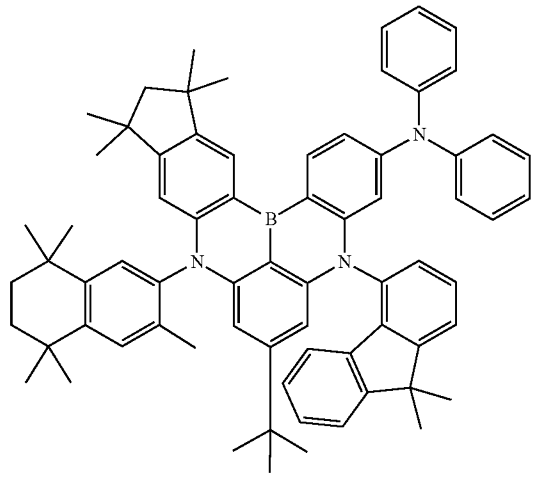
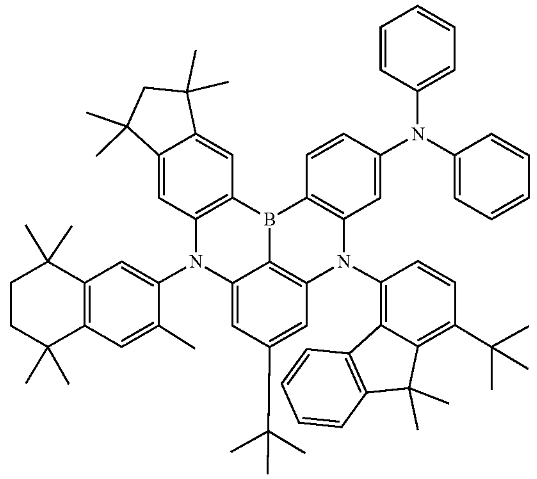
-continued -continued
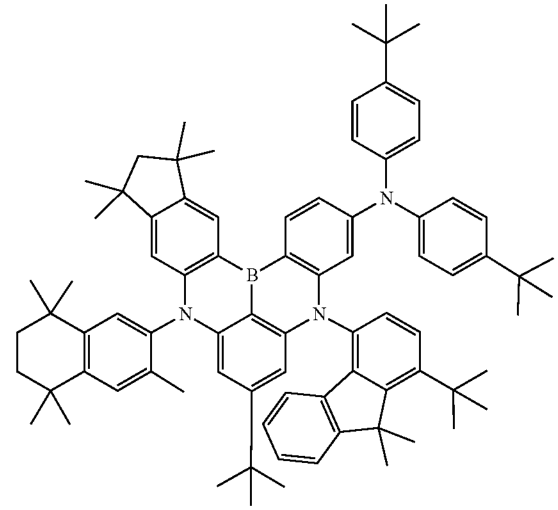
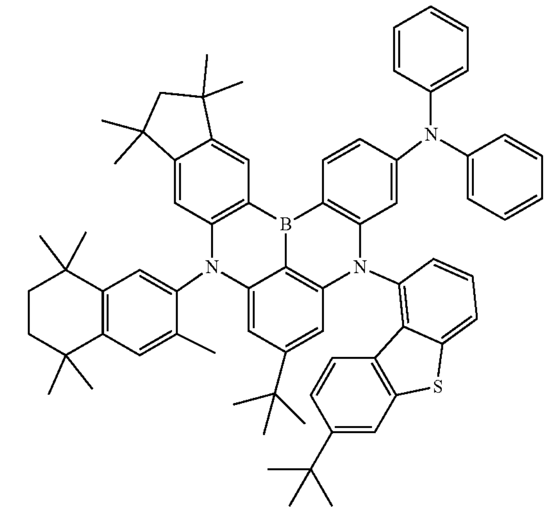
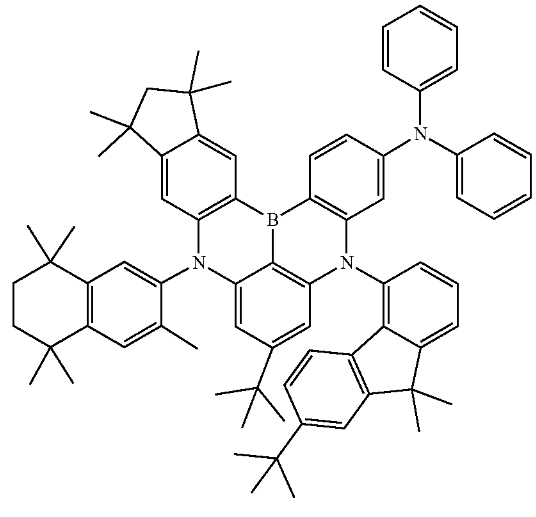
-continued
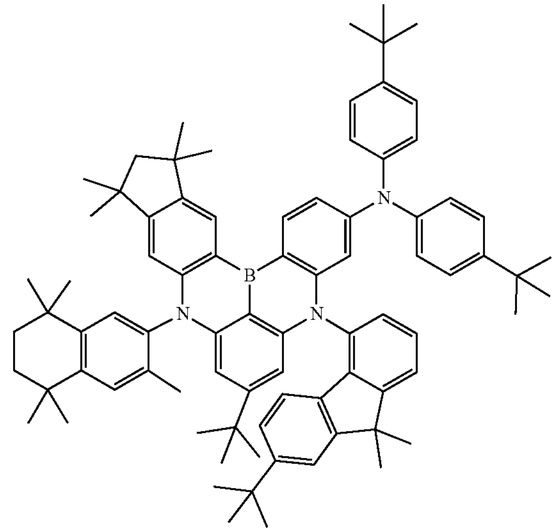
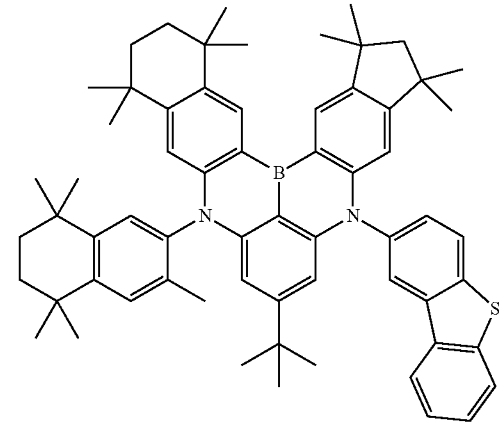
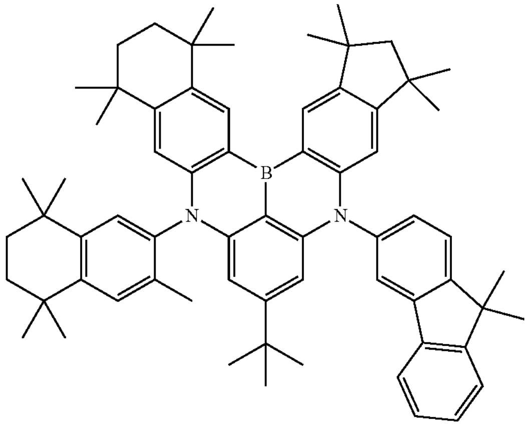

-continued
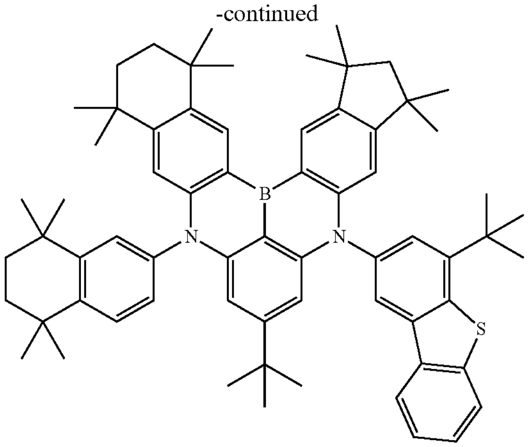
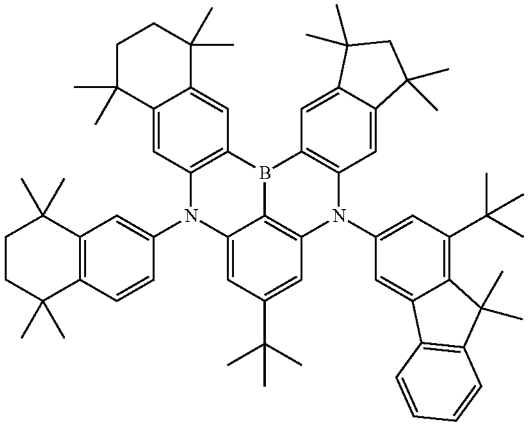
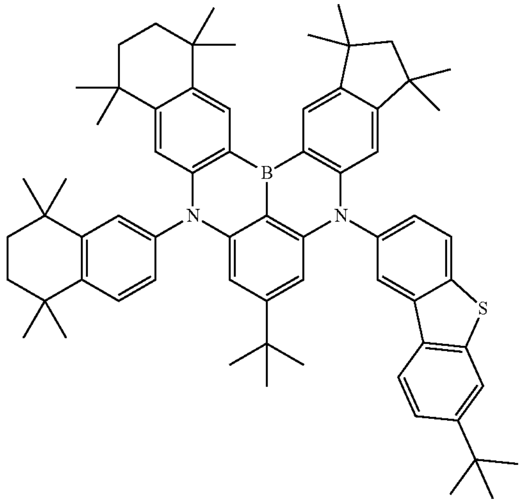
-continued
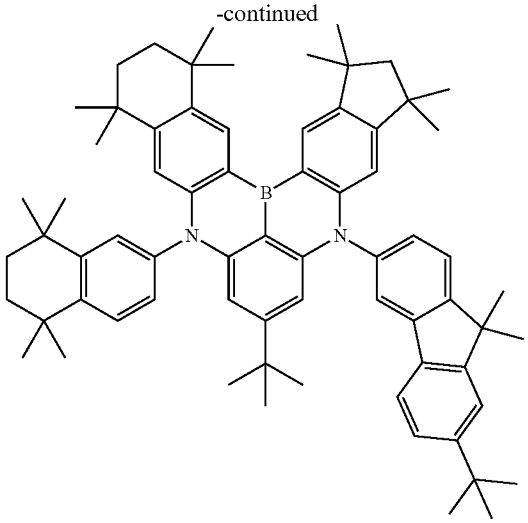
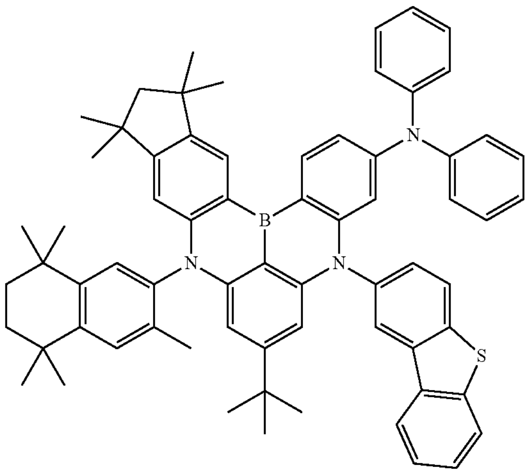
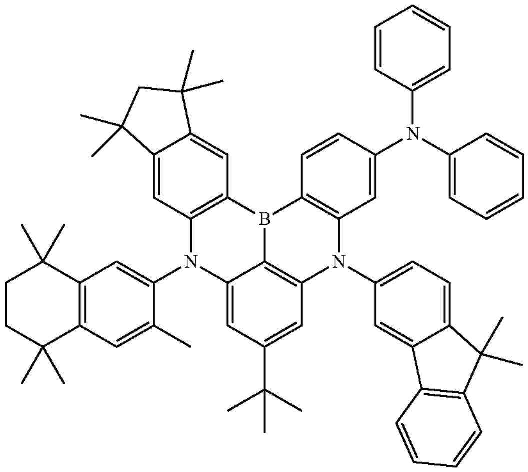

-continued
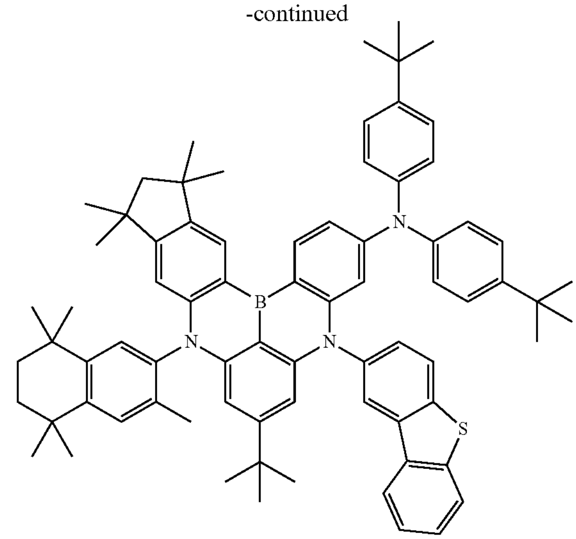
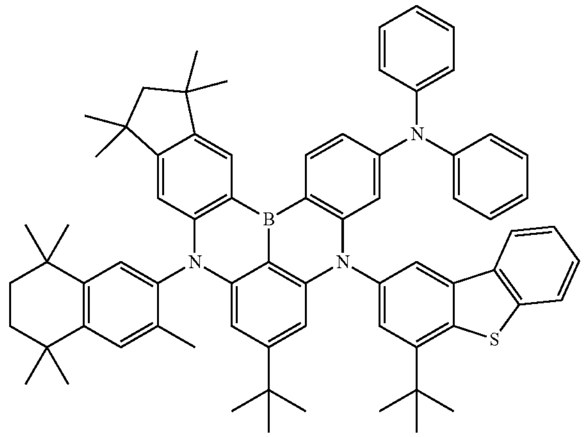
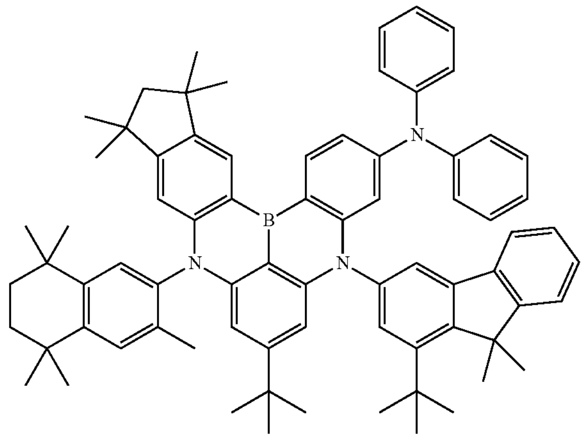
-continued
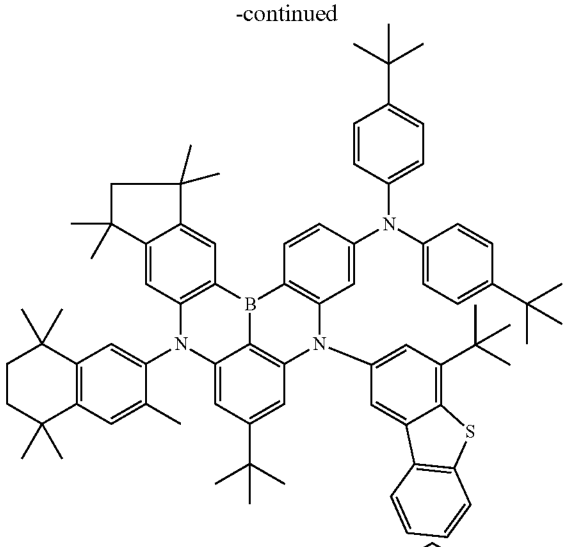
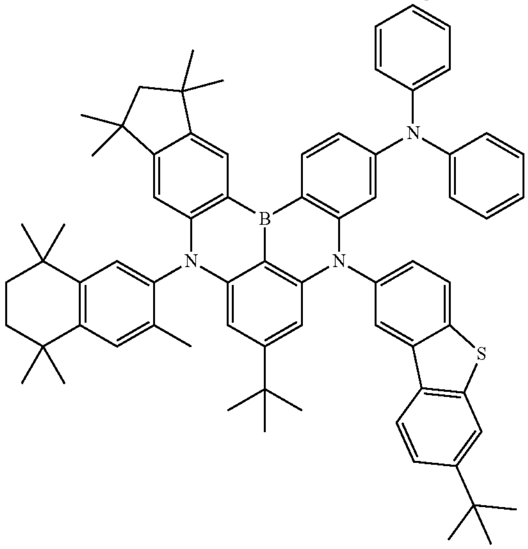
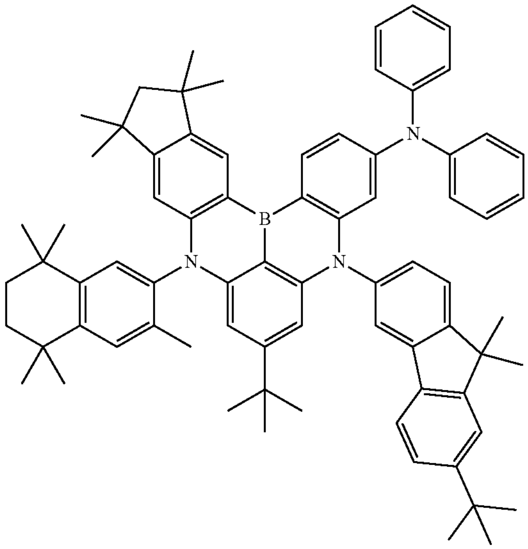

-continued
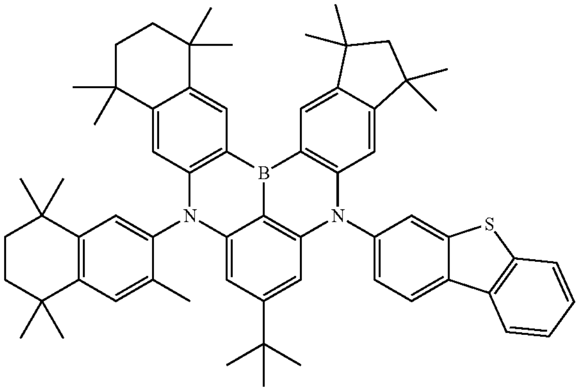
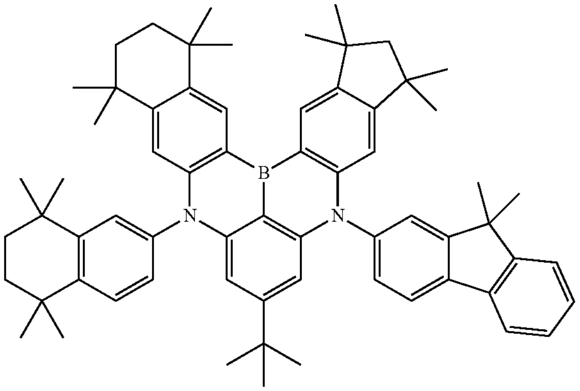
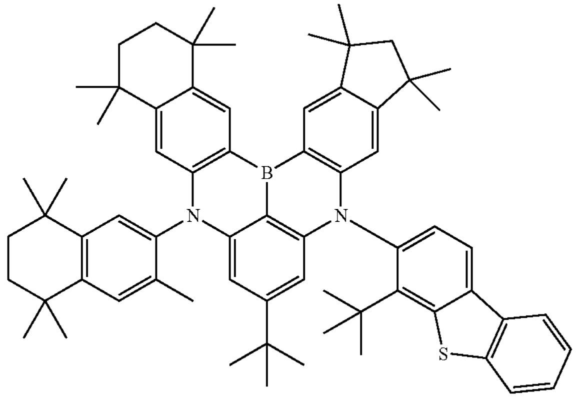
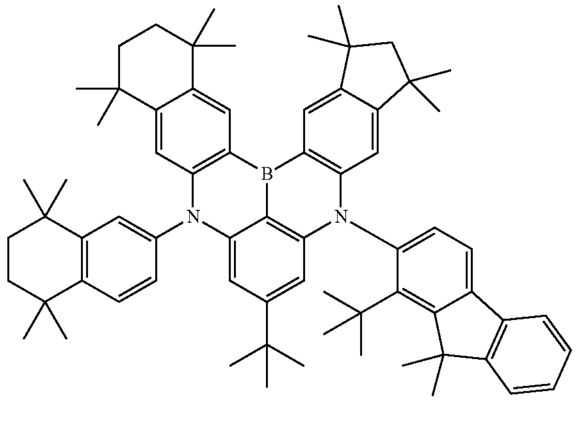
-continued
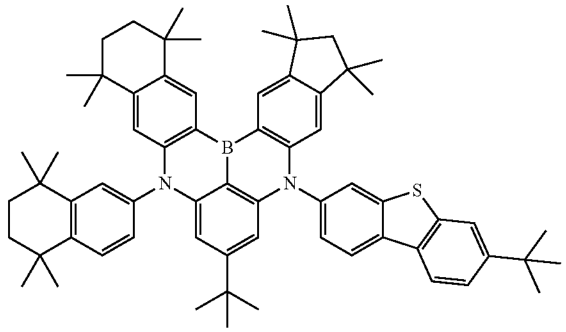
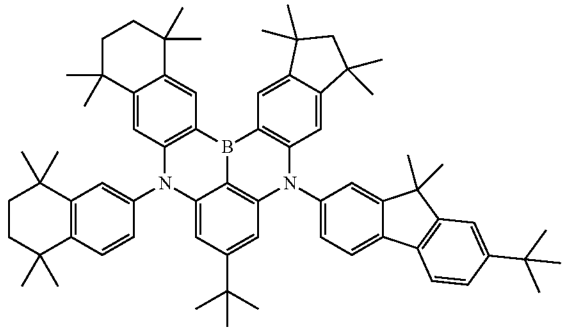
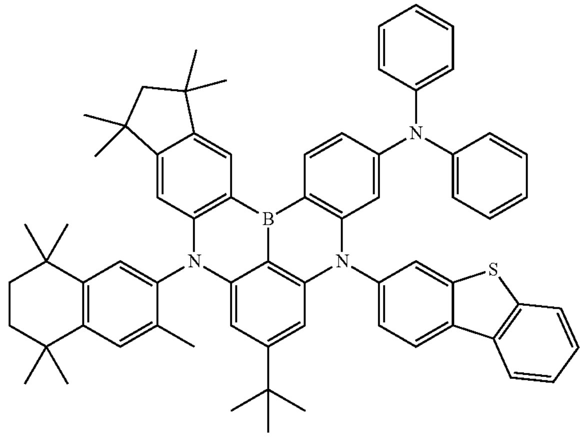
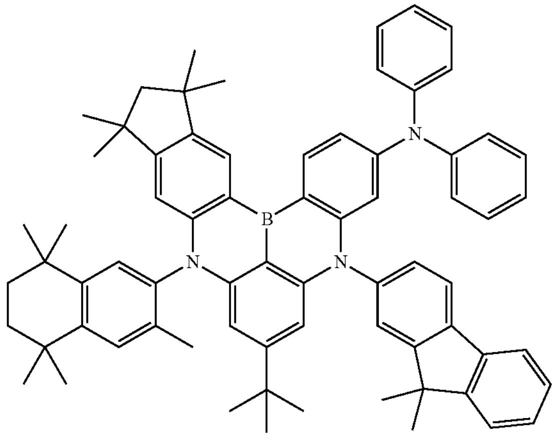

-continued
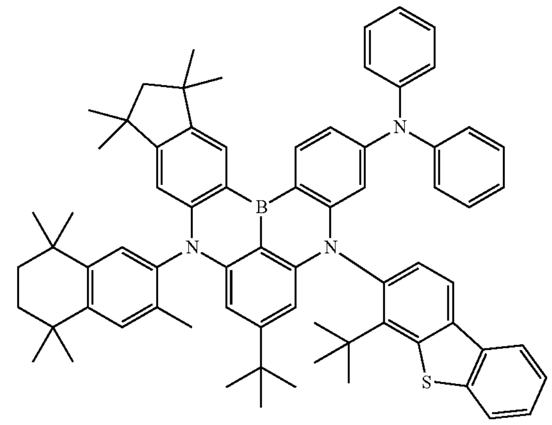
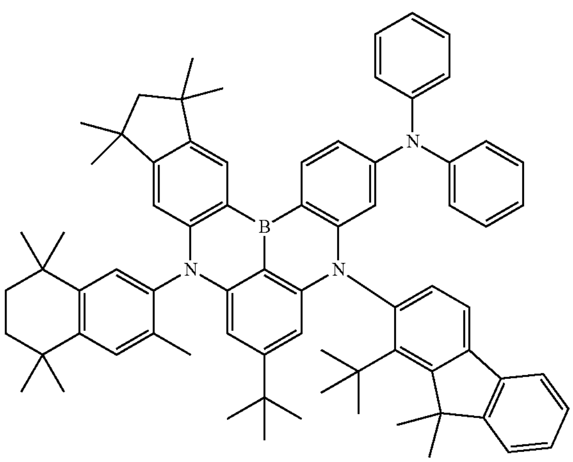
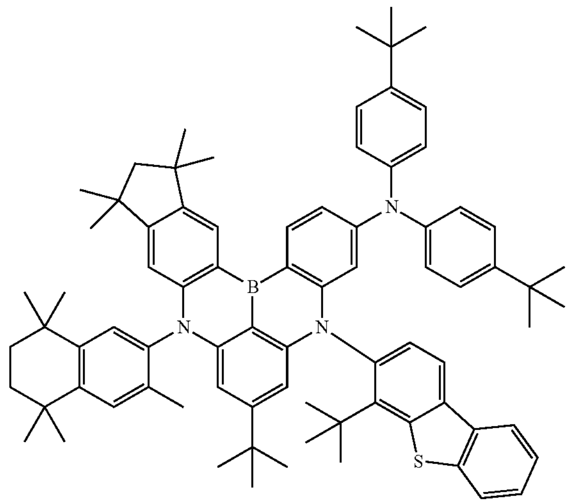
-continued
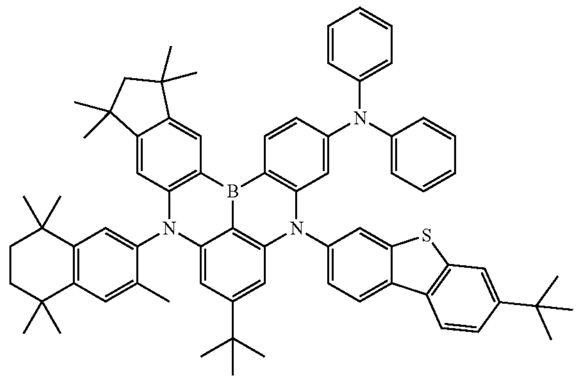
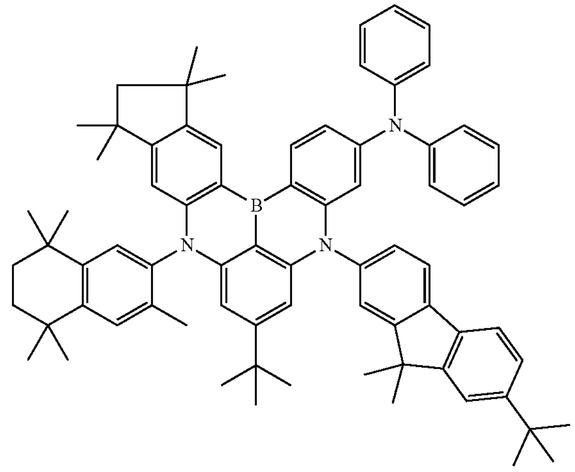
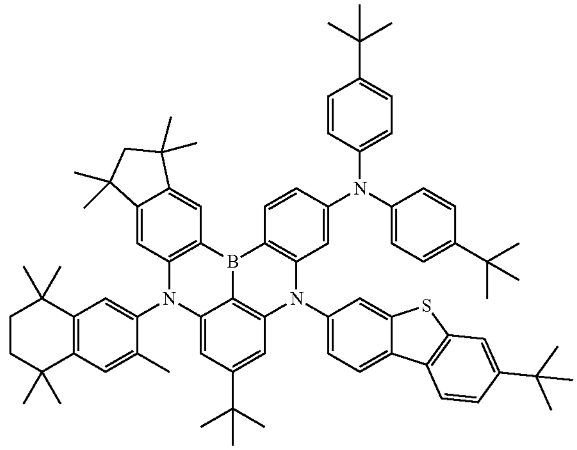
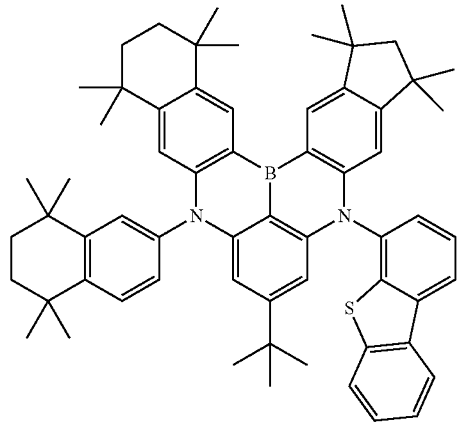

-continued
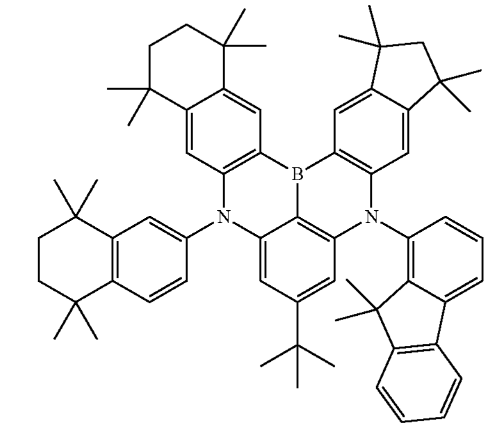
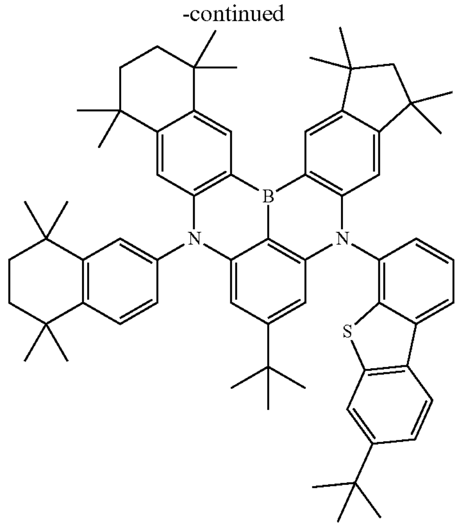
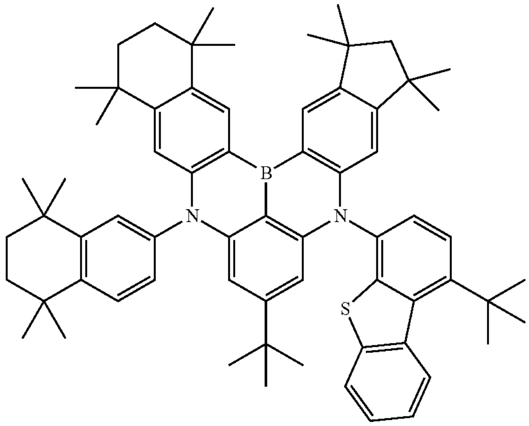
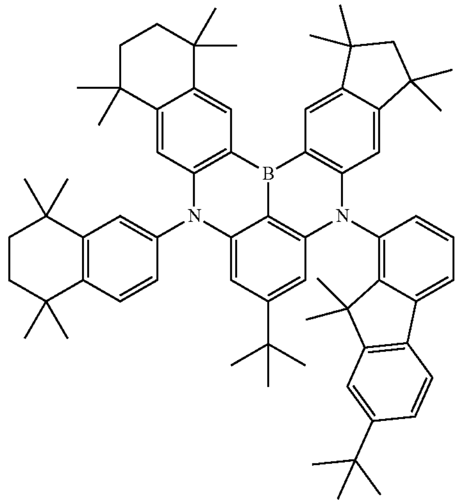
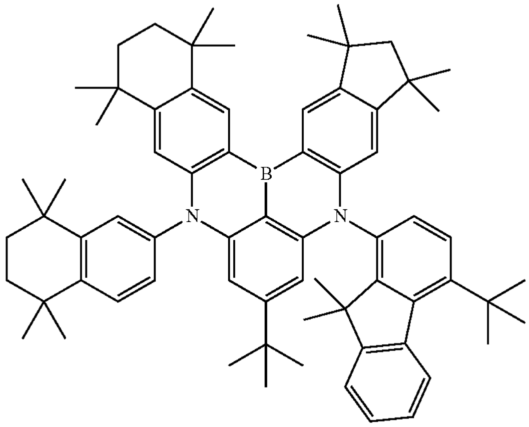
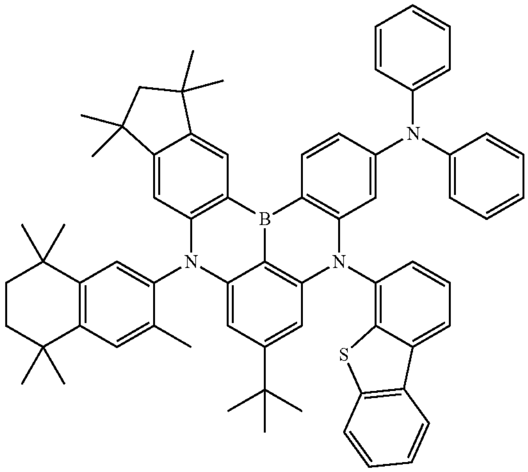

-continued
-continued
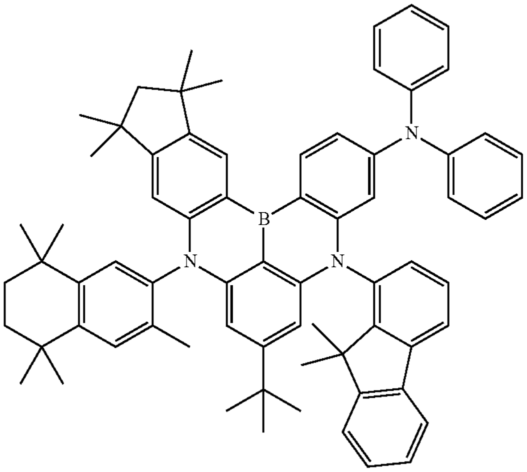
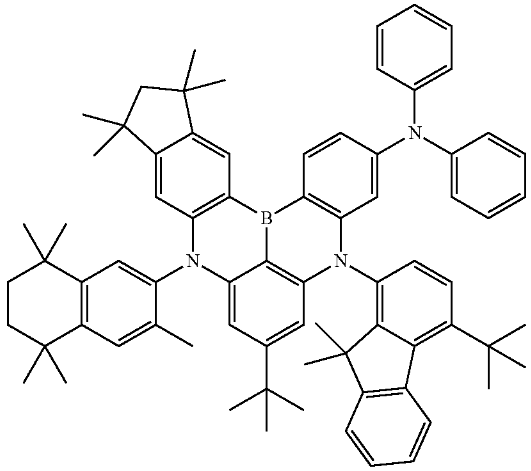
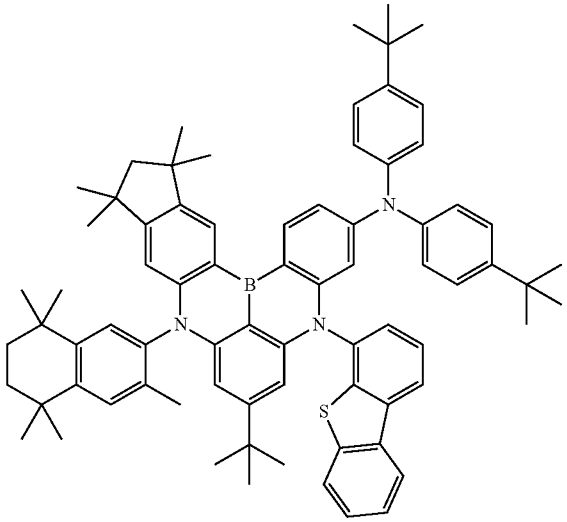
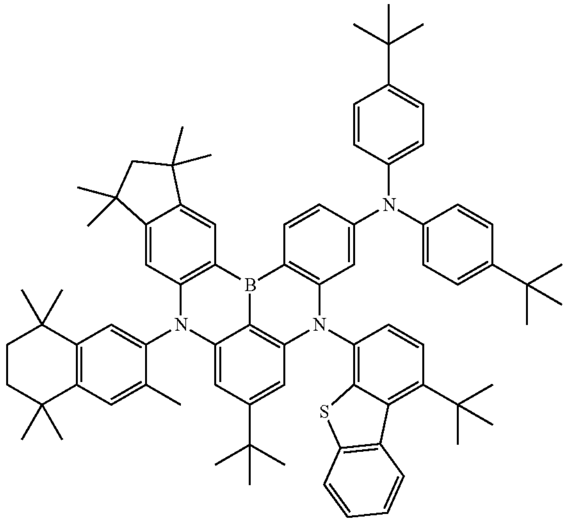
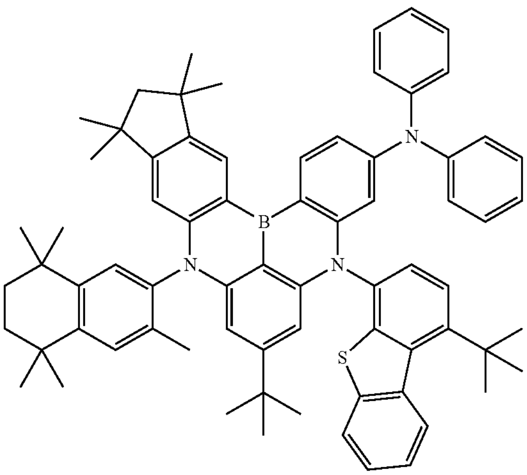
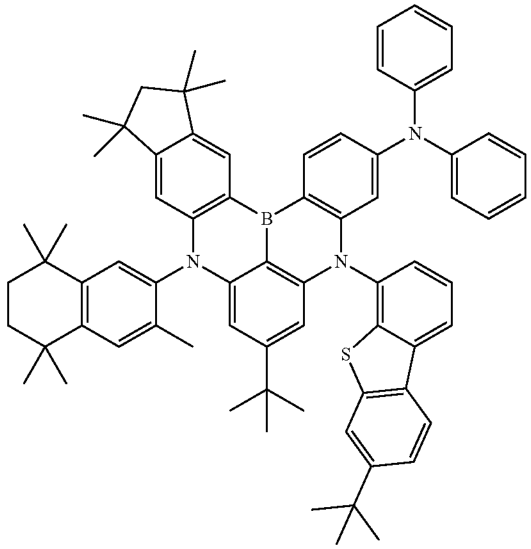

-continued
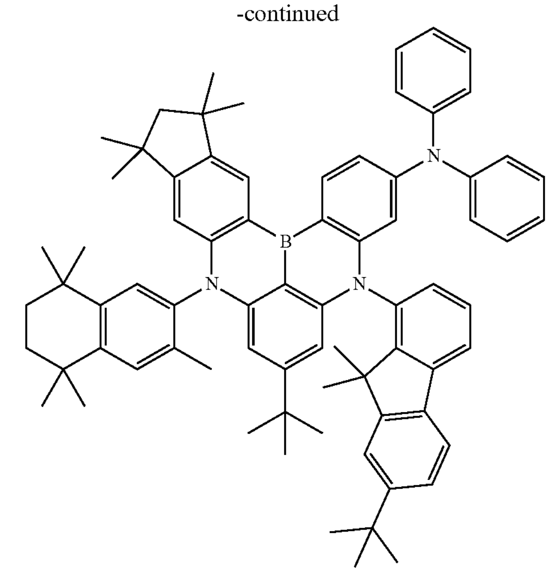
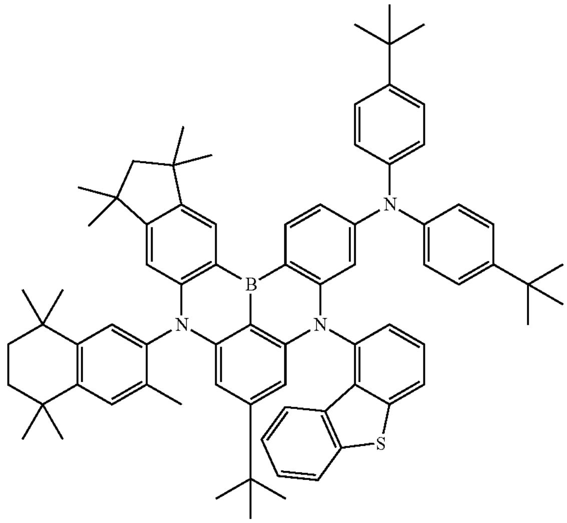
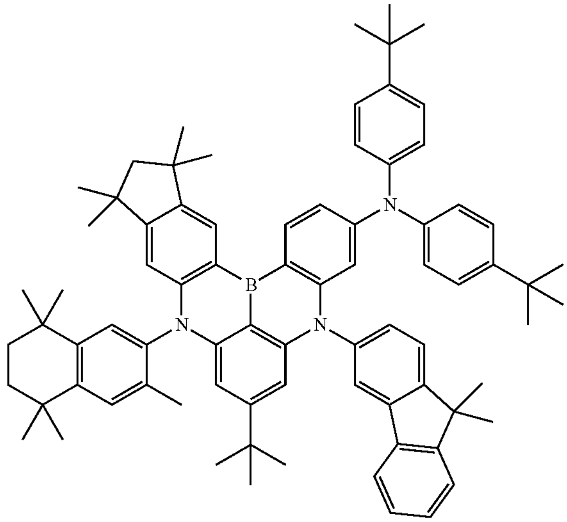
-continued
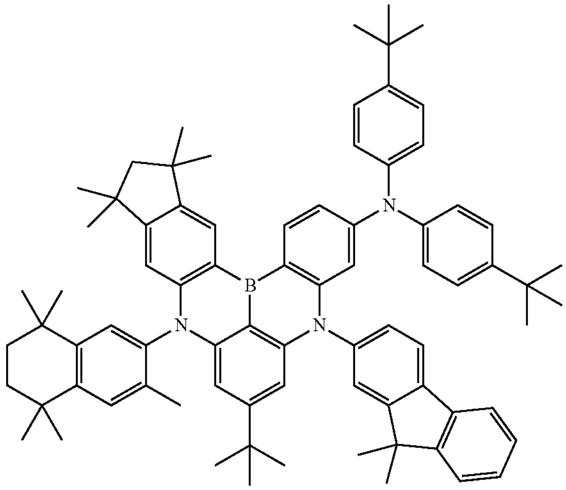
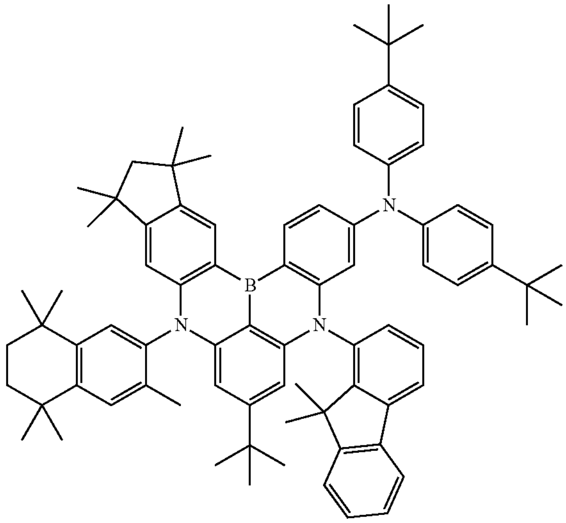
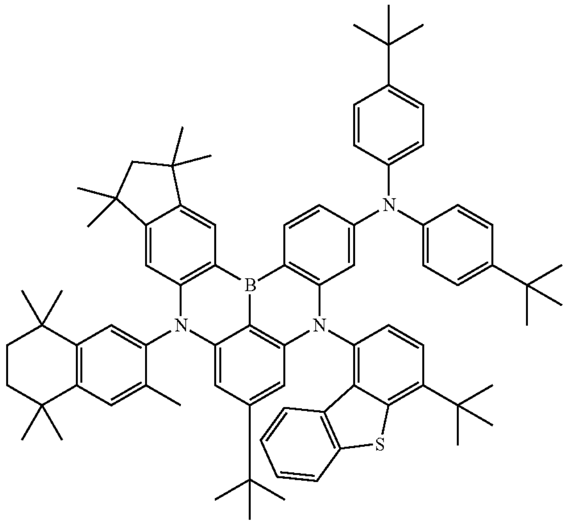

-continued
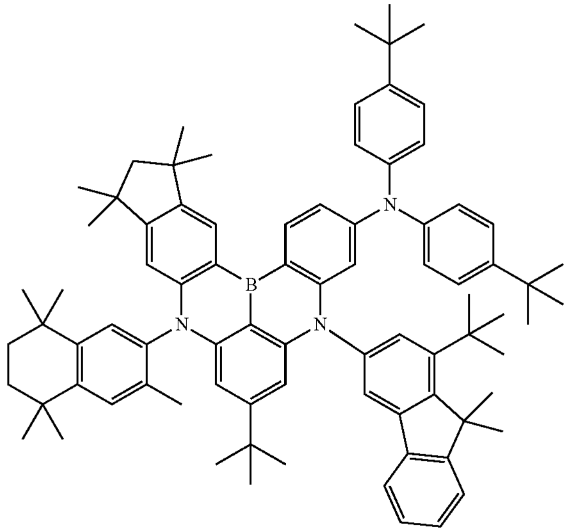
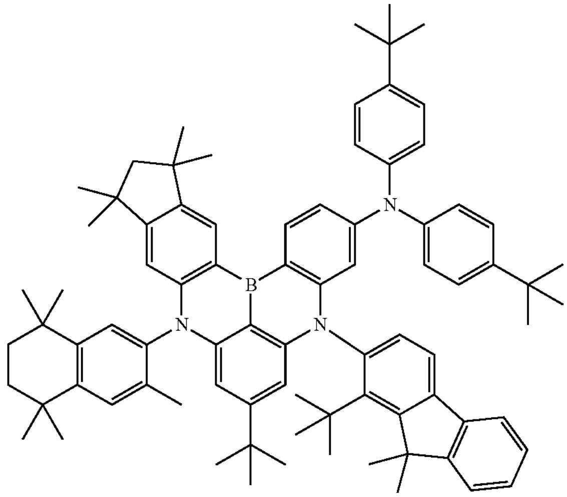
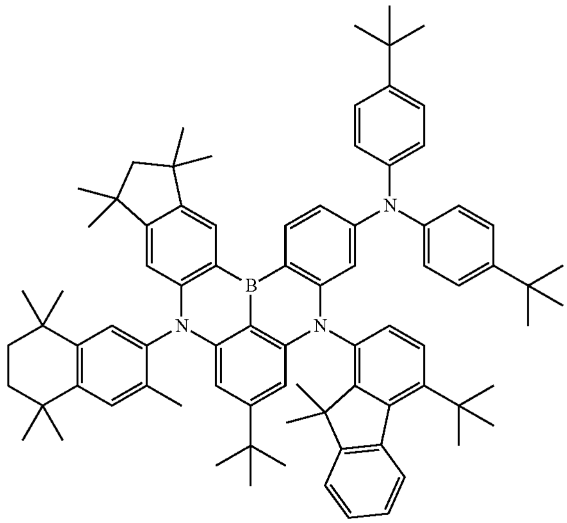
-continued
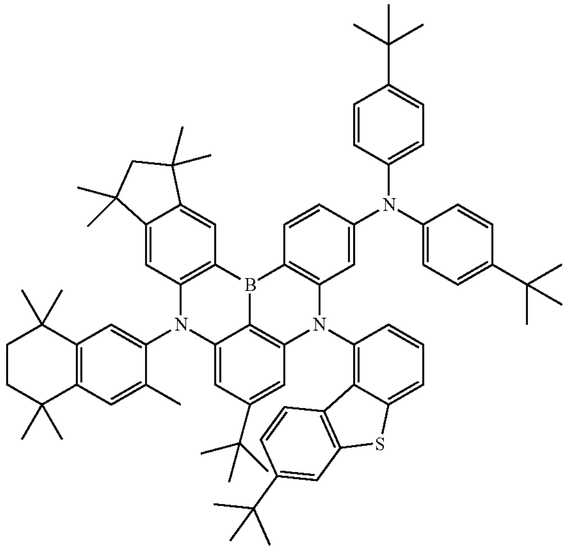
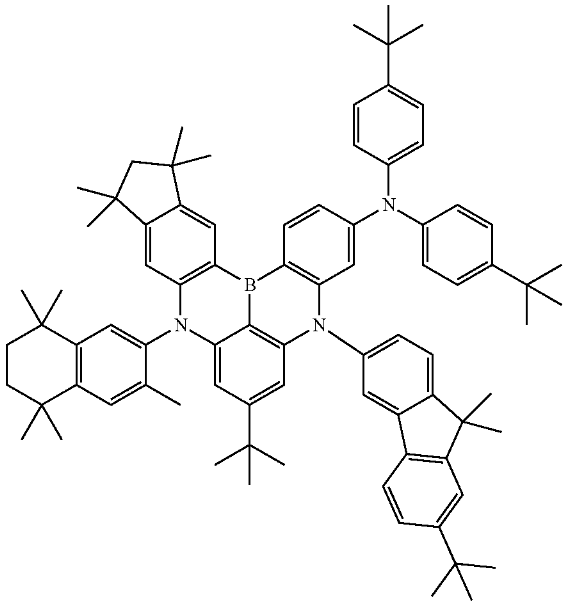
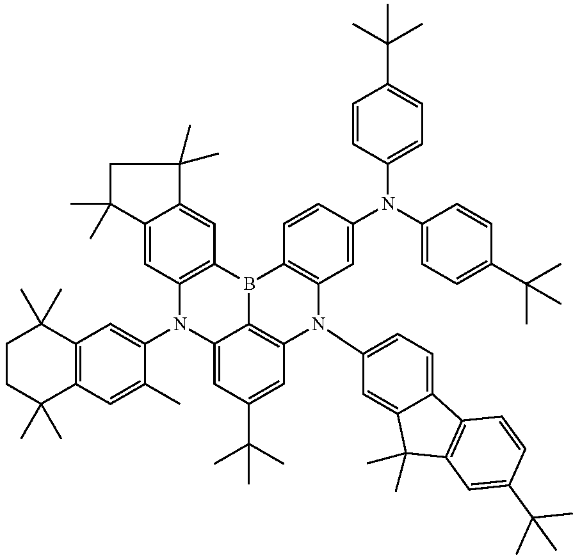

-continued
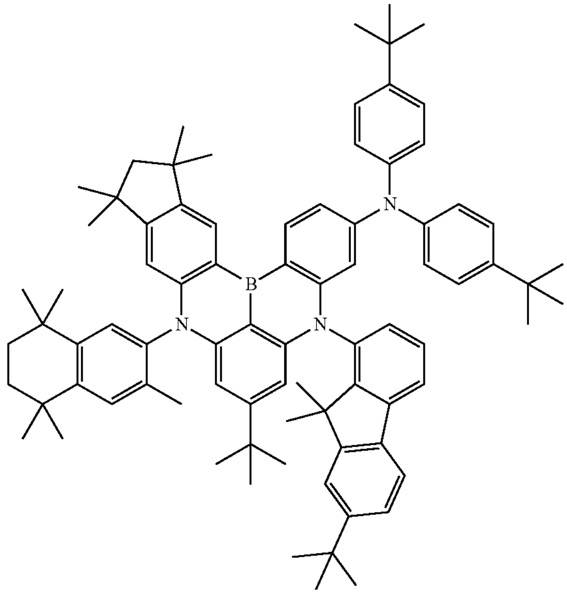
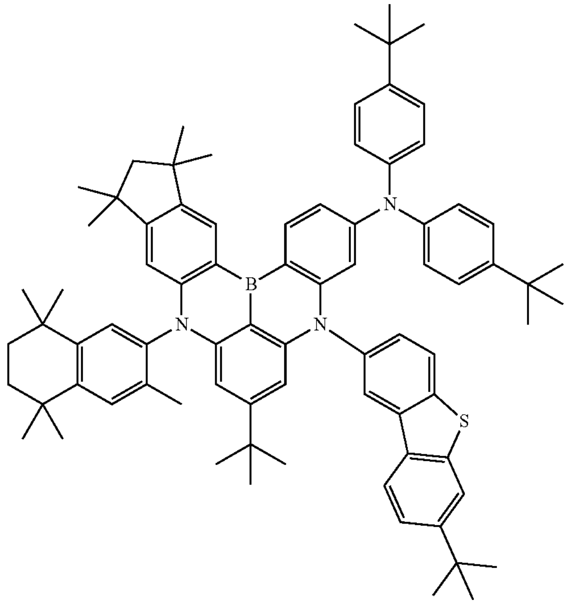
-continued
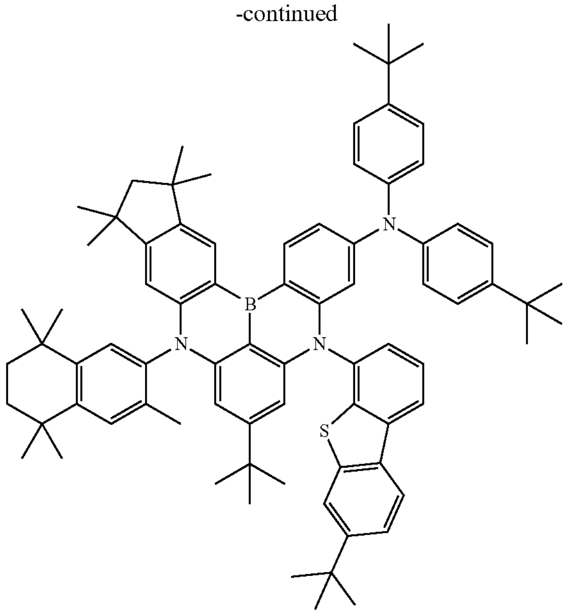
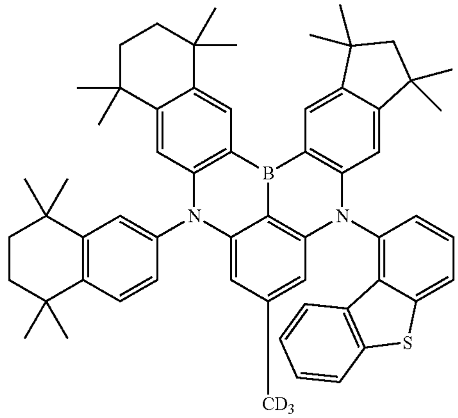
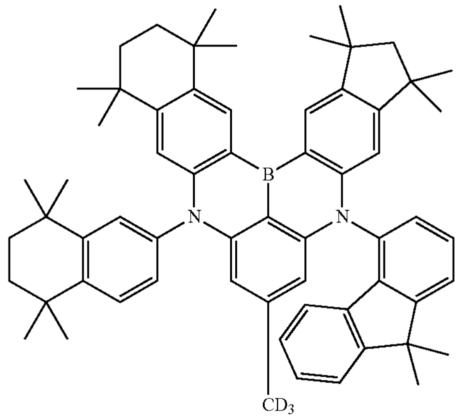

-continued
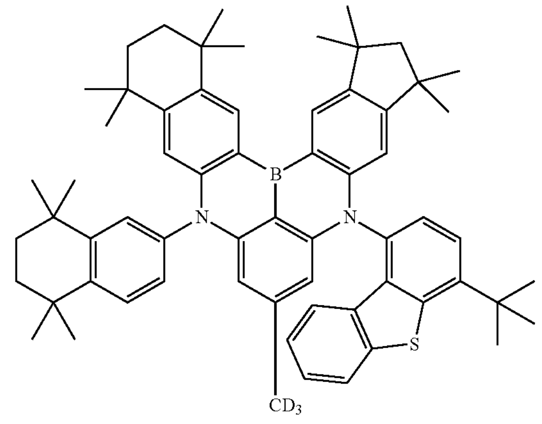
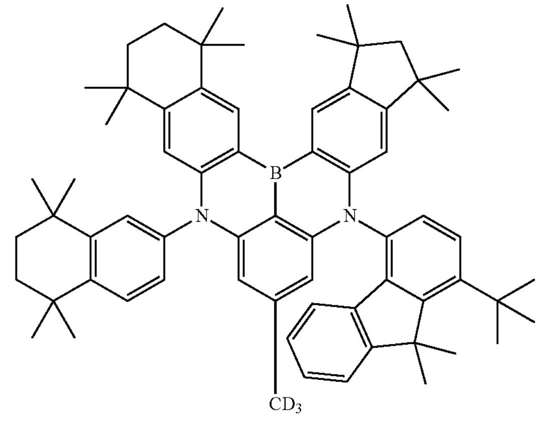
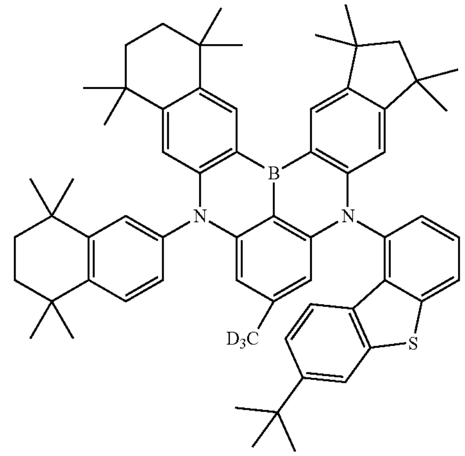
-continued
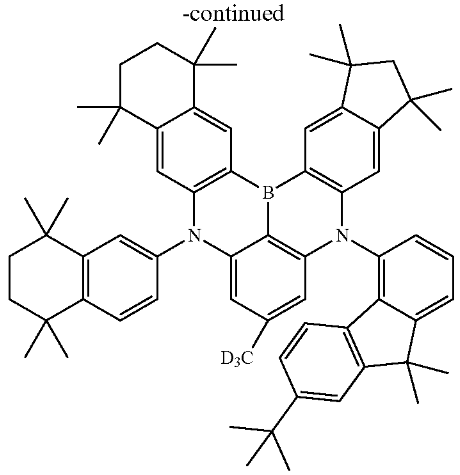
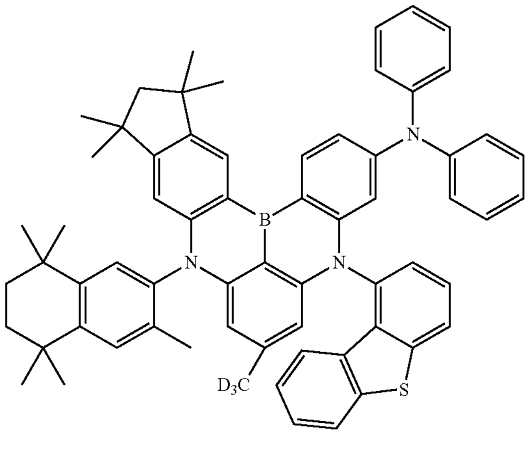
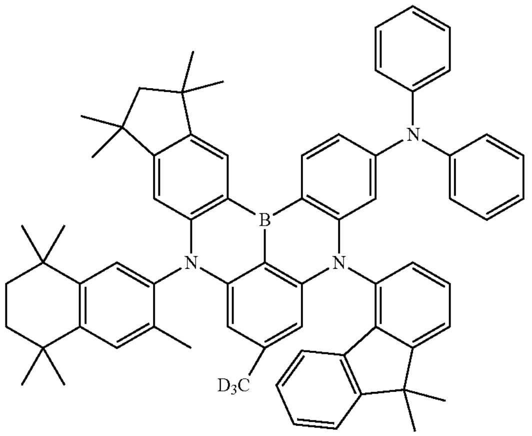

-continued
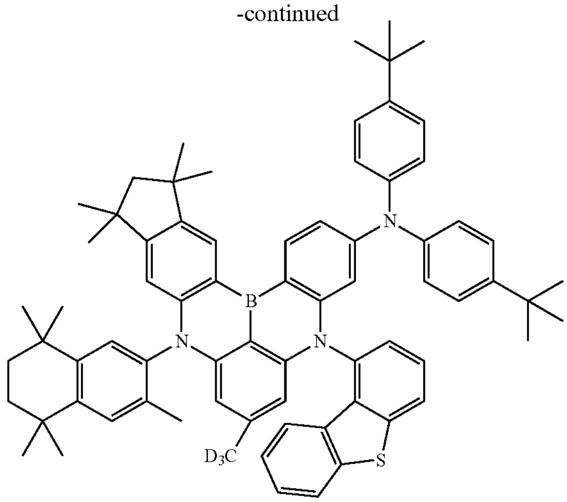
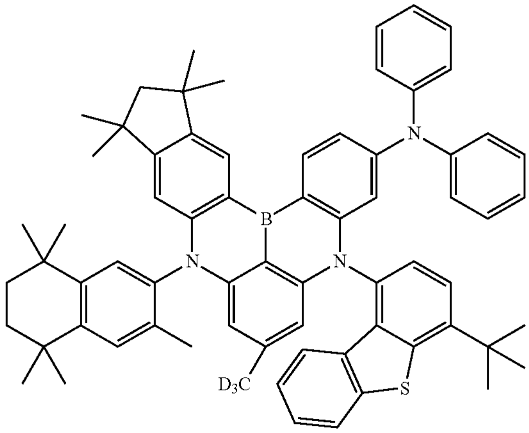
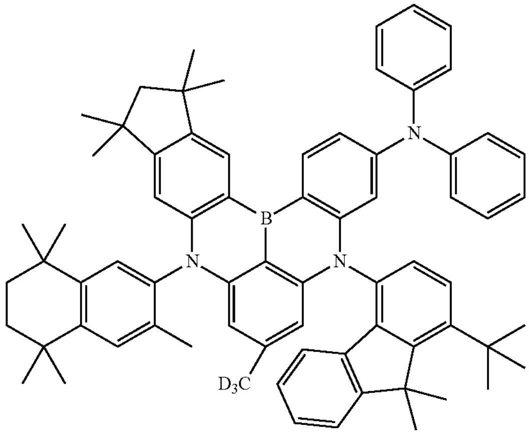
-continued
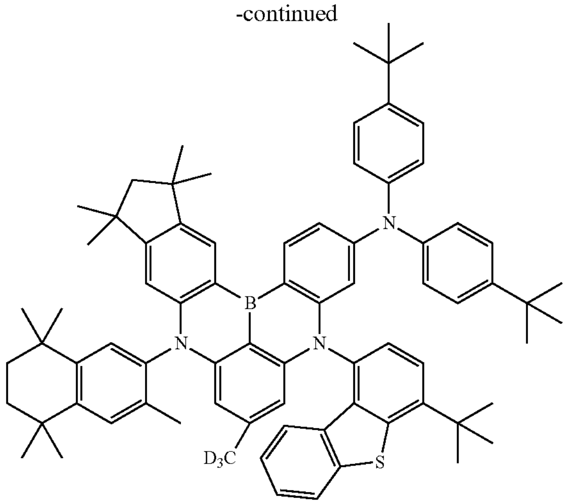
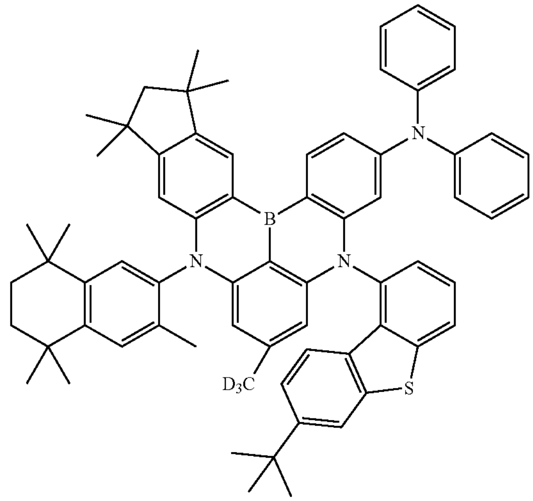
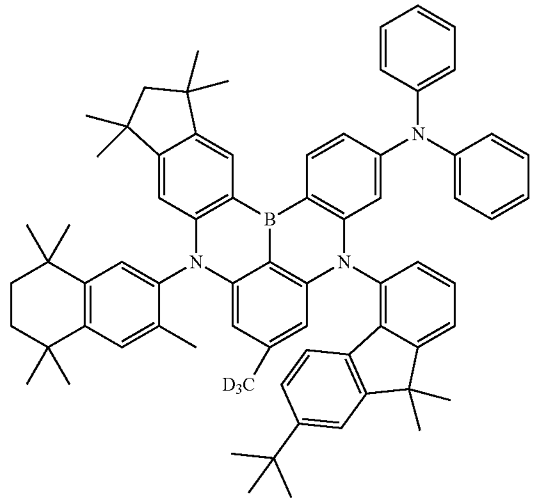

-continued
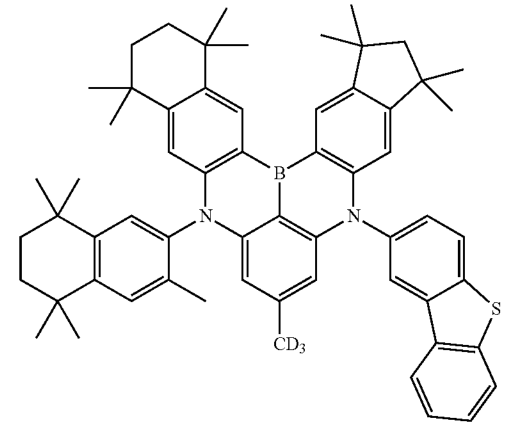
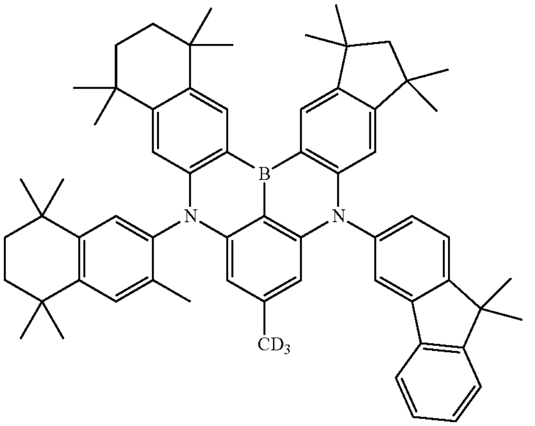
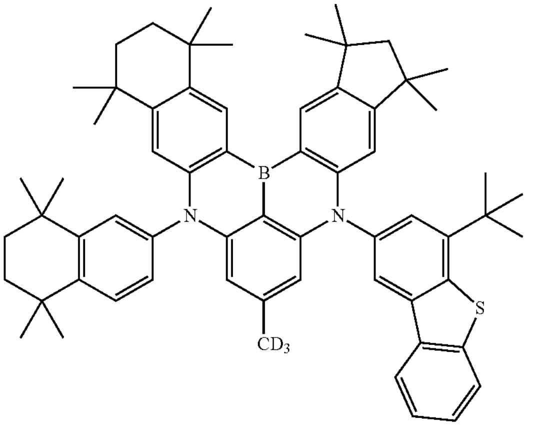
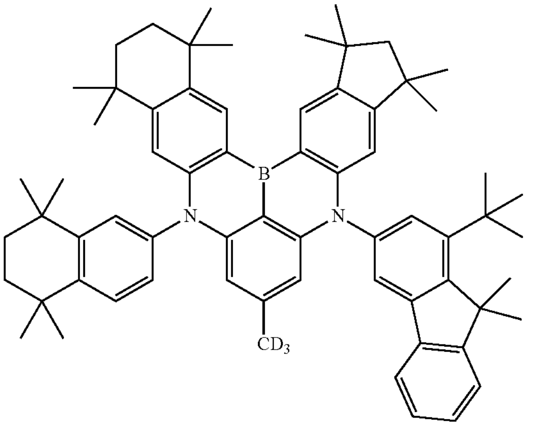
-continued
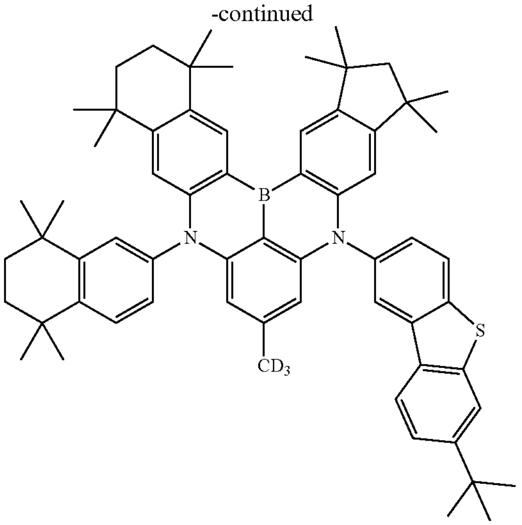
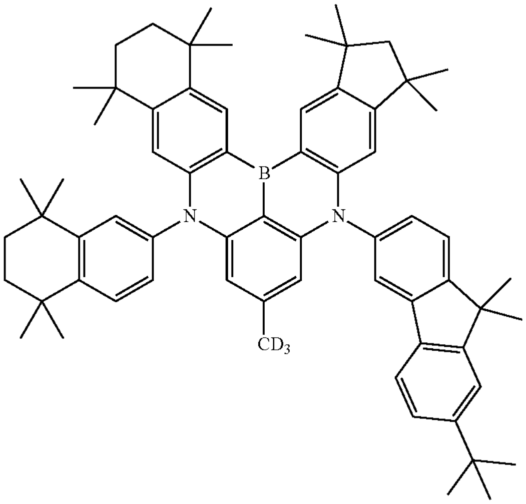
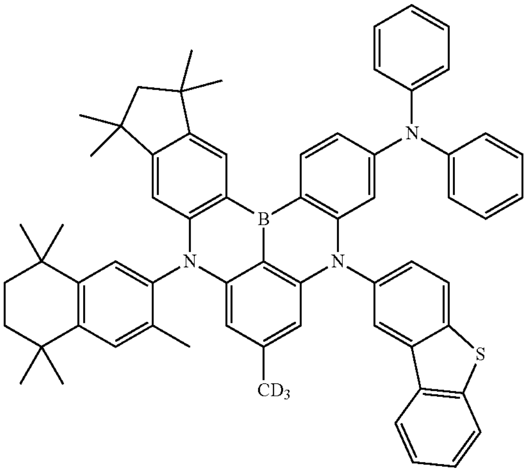

-continued
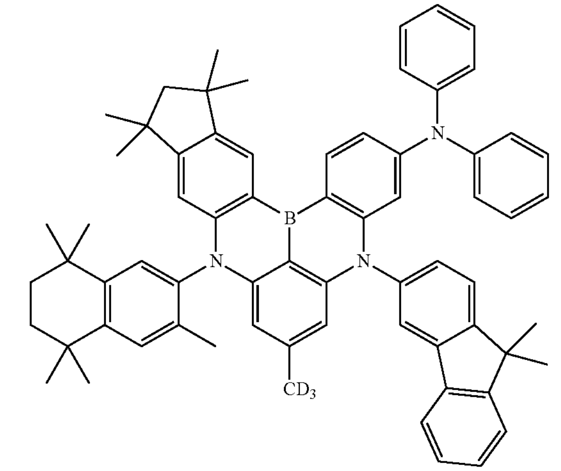
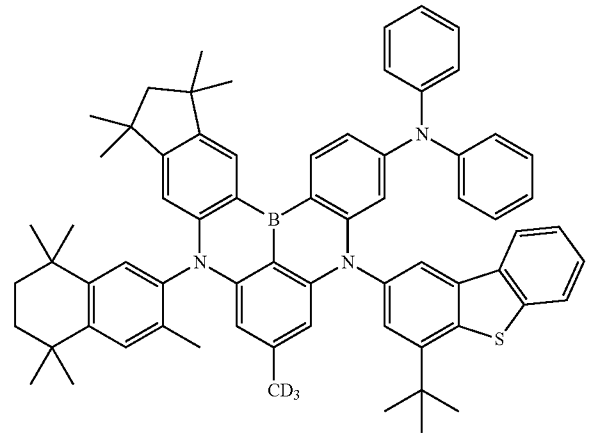
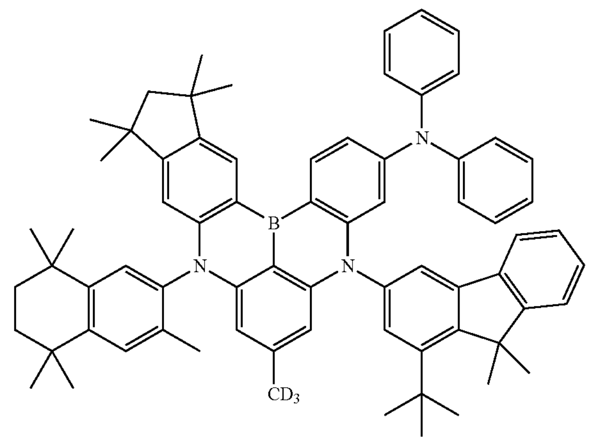
-continued
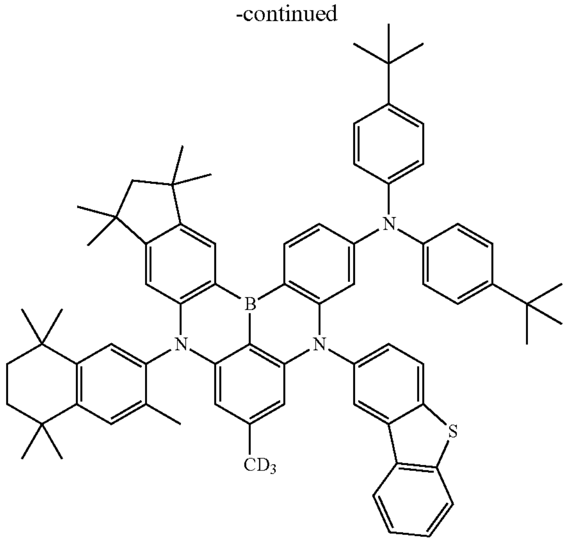
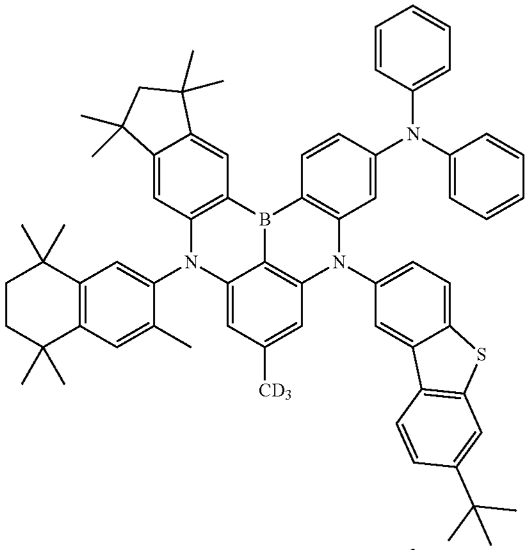
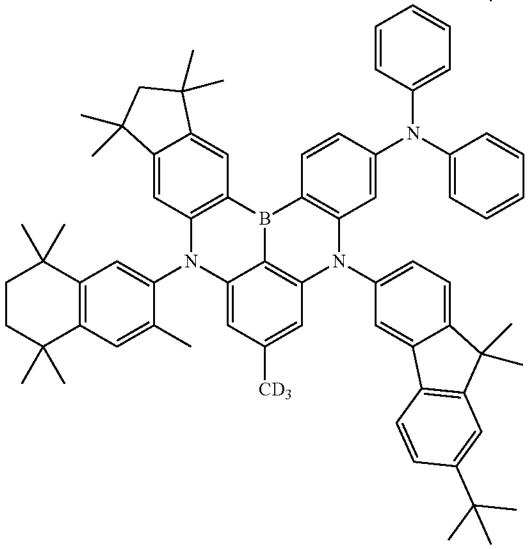

-continued
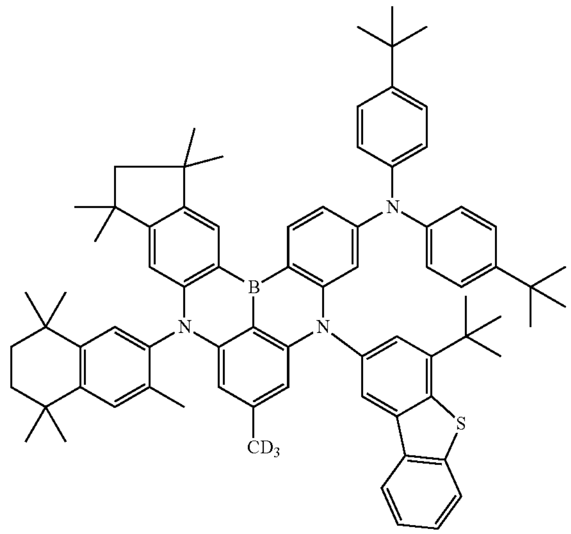
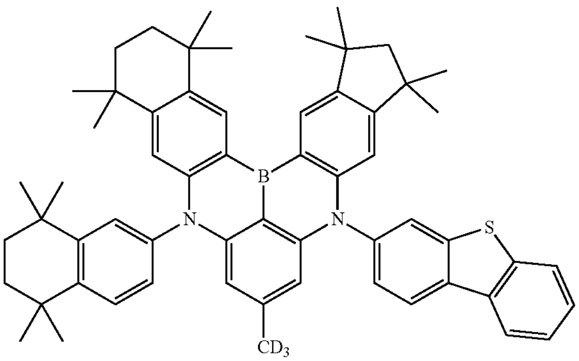
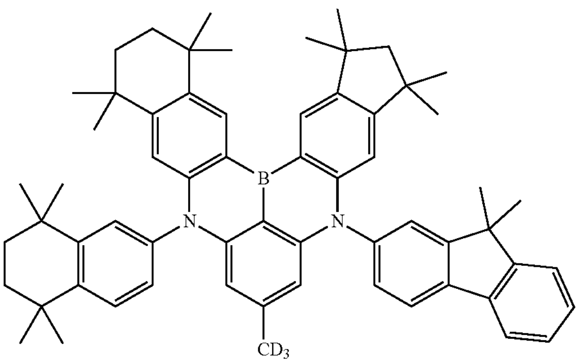
-continued
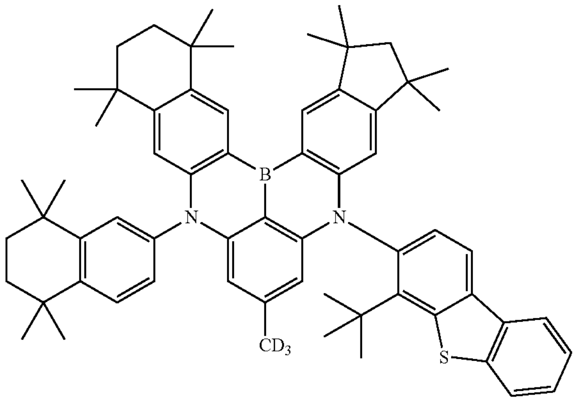
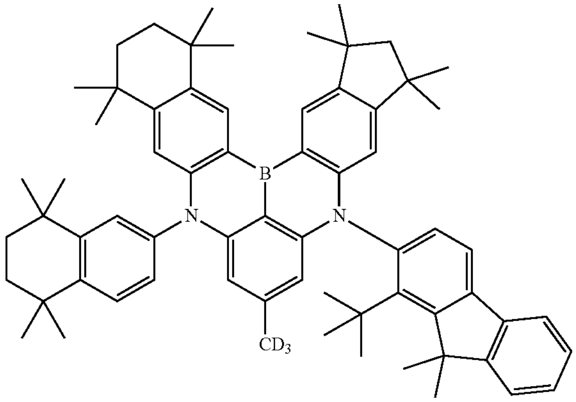
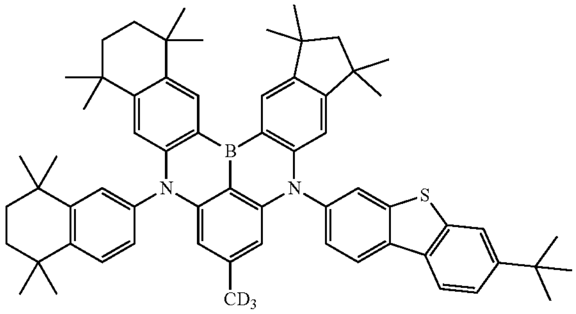
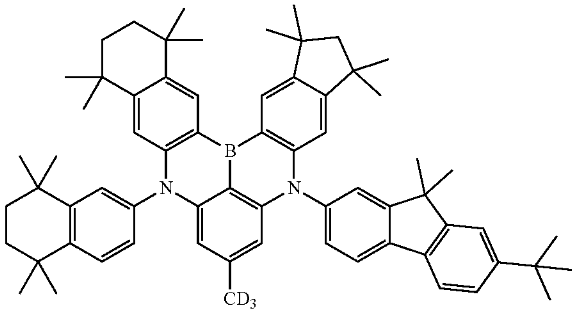

-continued
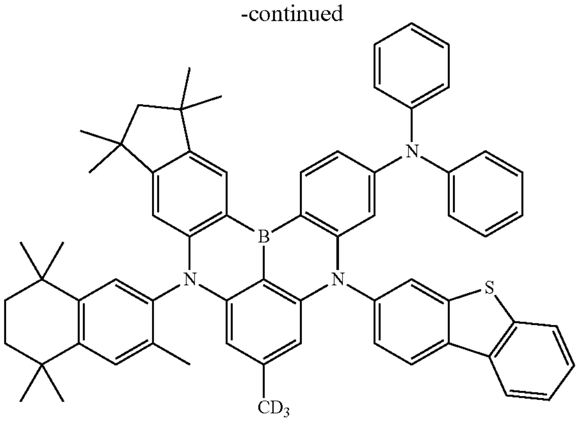
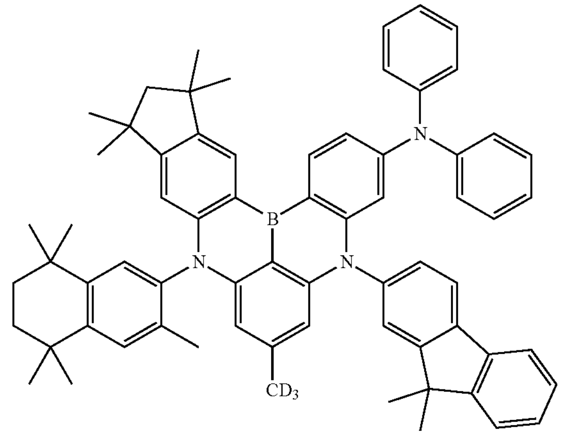
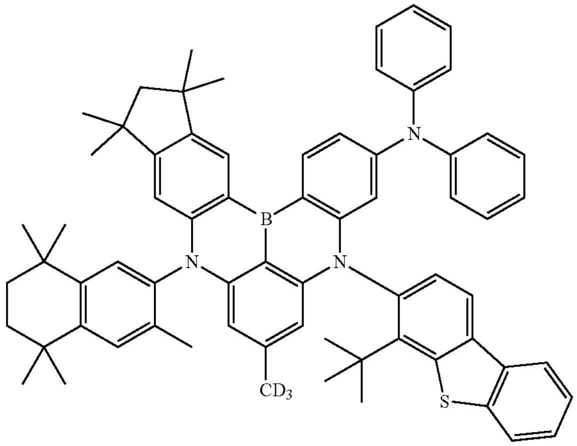
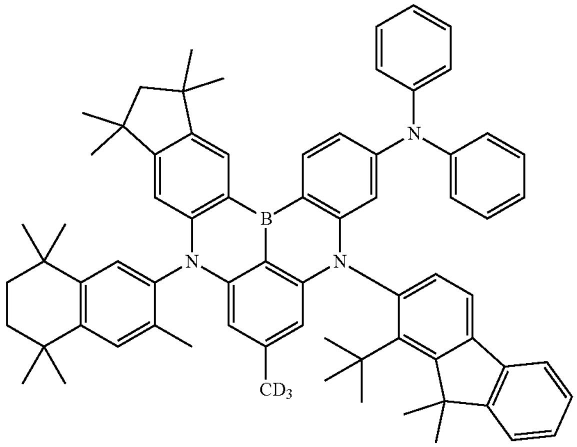
-continued
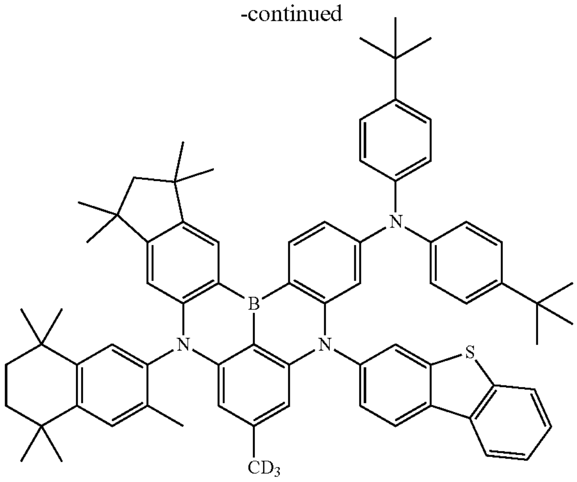
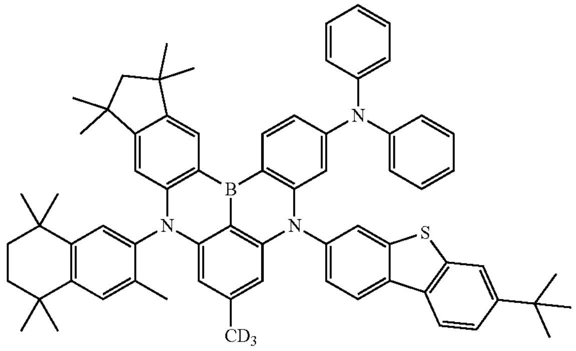
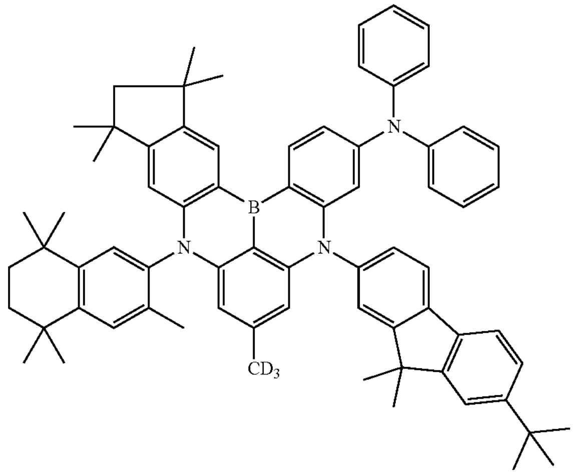

-continued
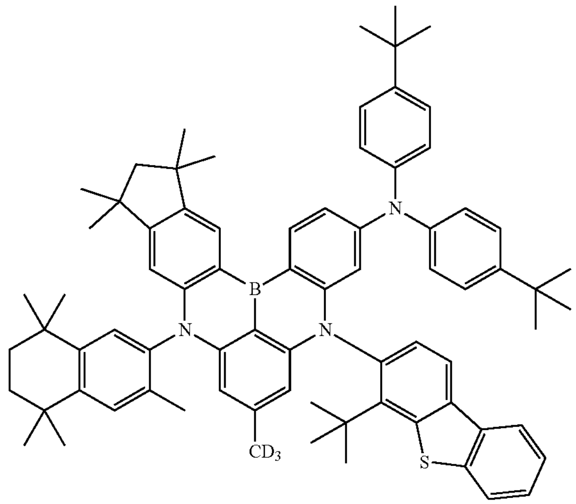
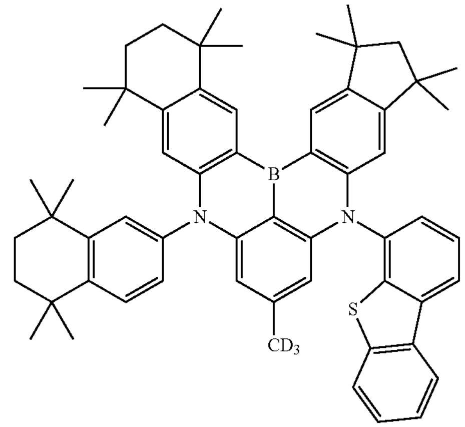
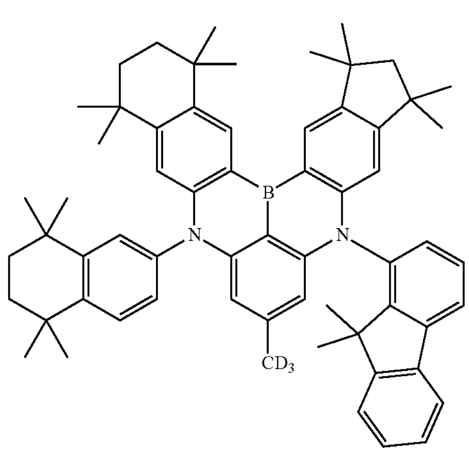
-continued
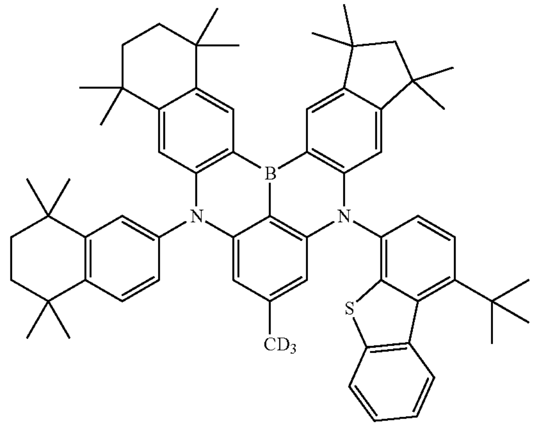
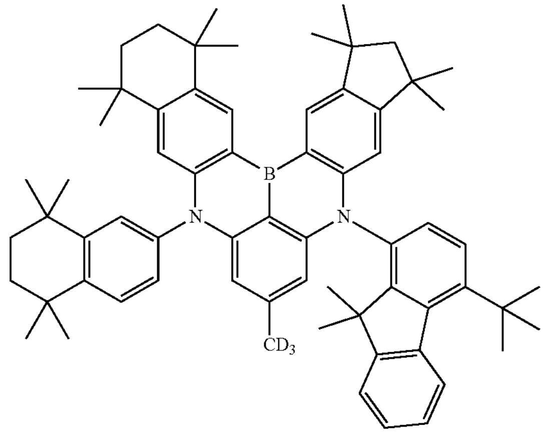
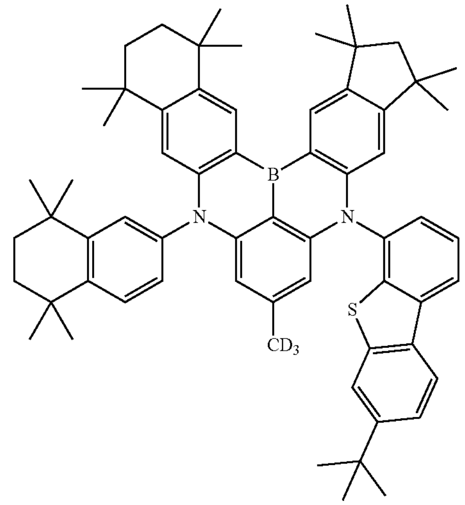

-continued
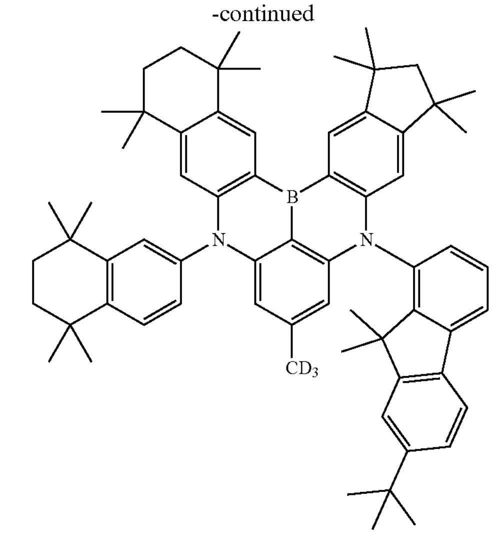
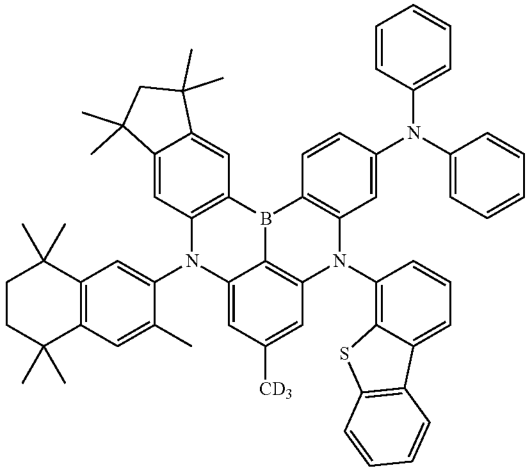
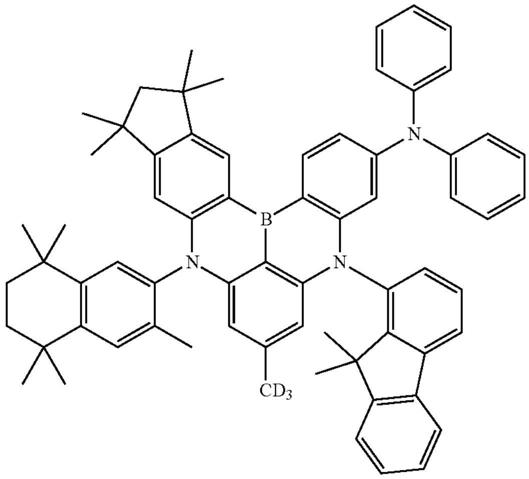
-continued
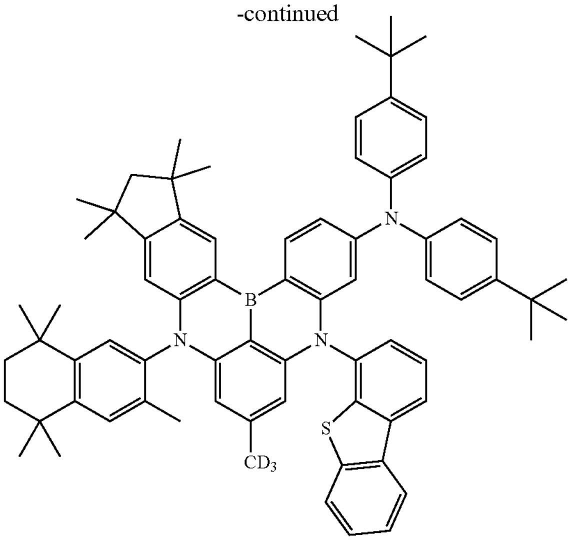
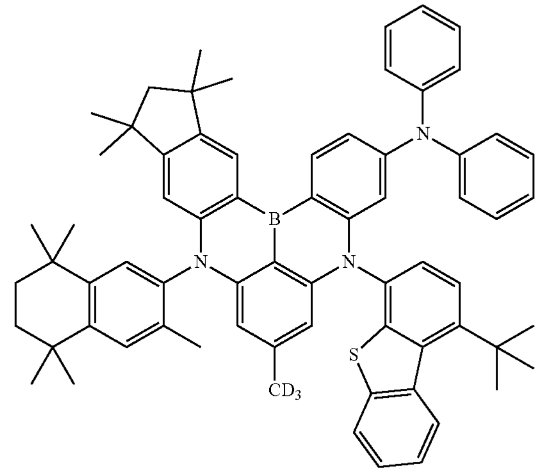
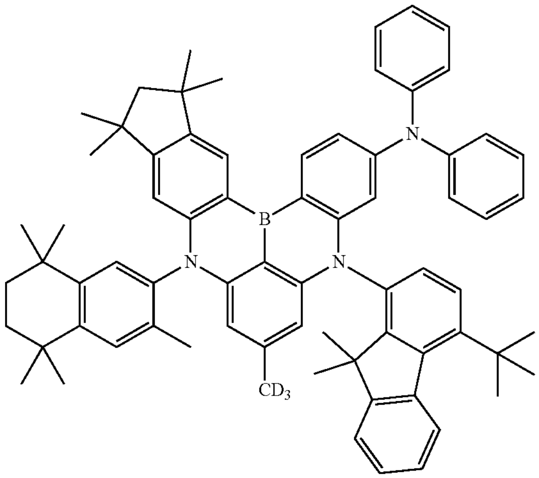

-continued
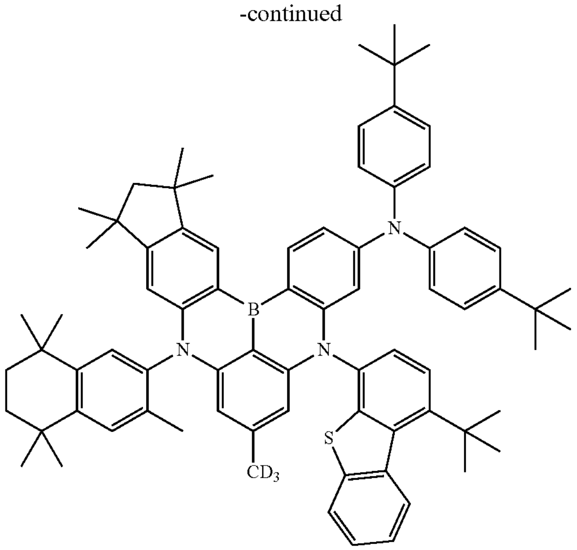
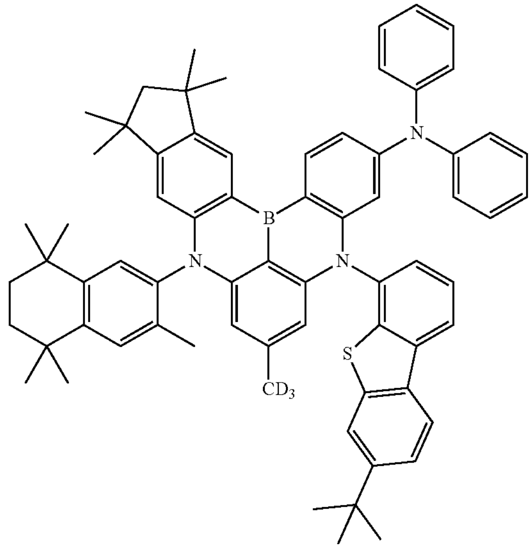
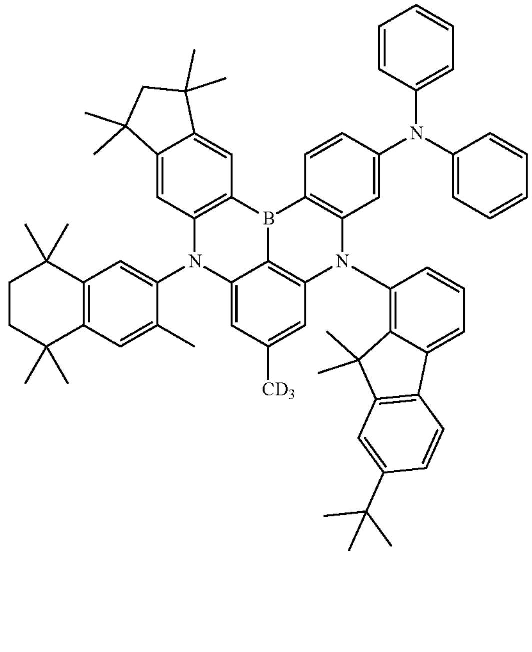
-continued
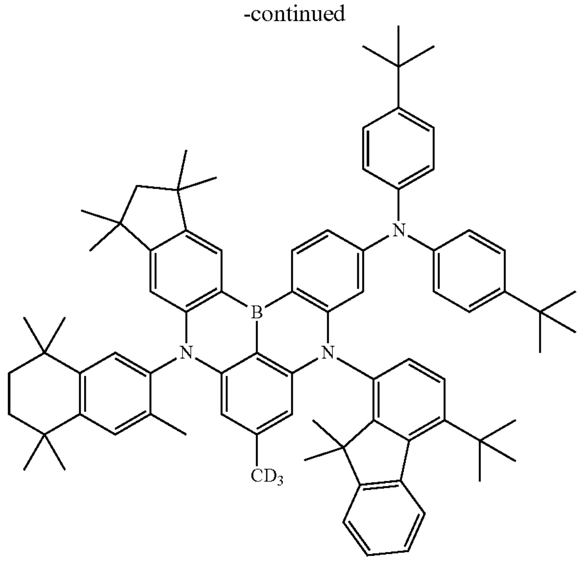
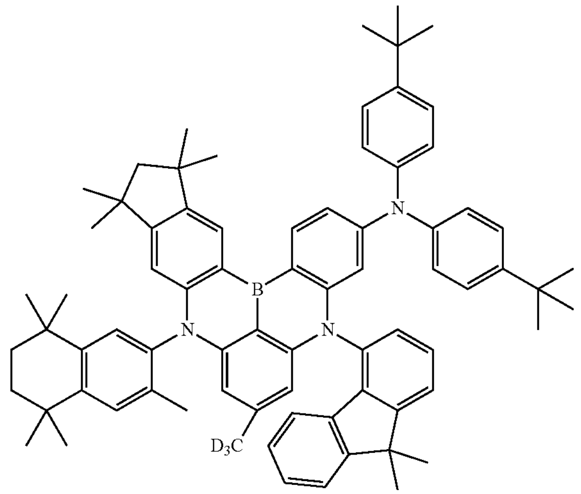
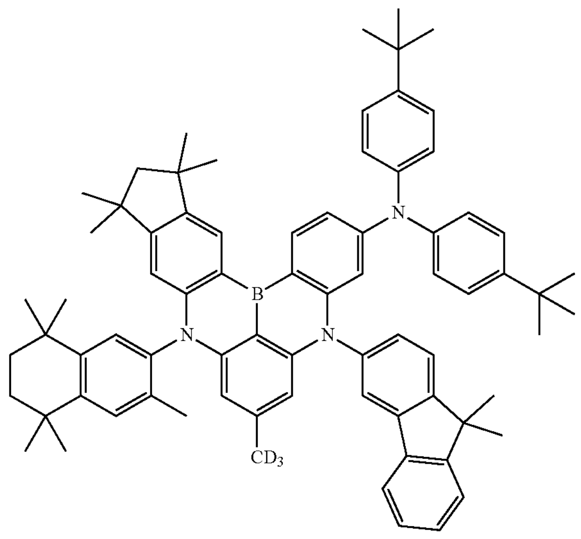

-continued
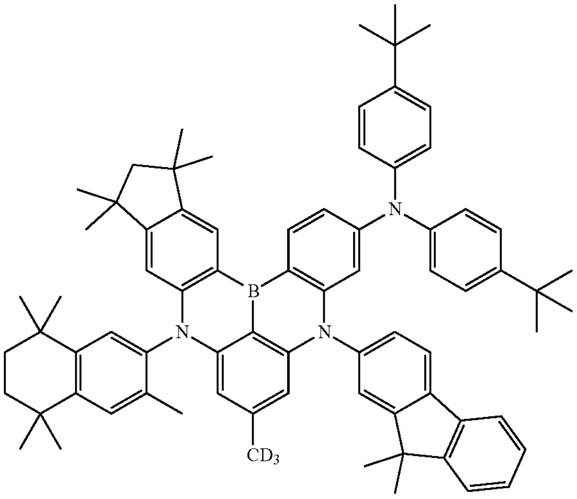
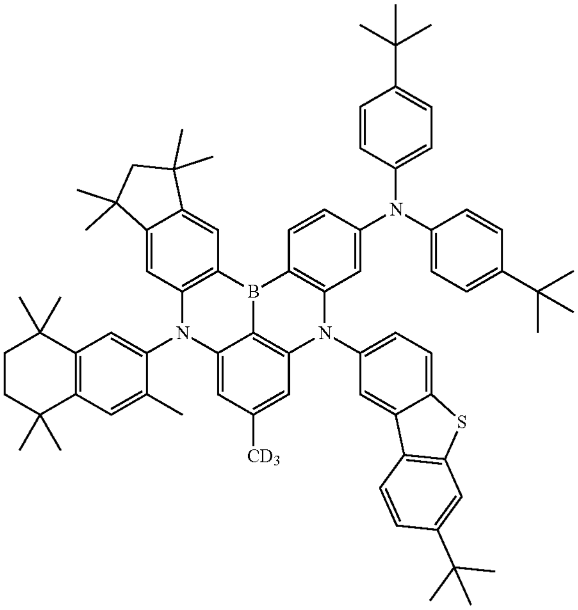
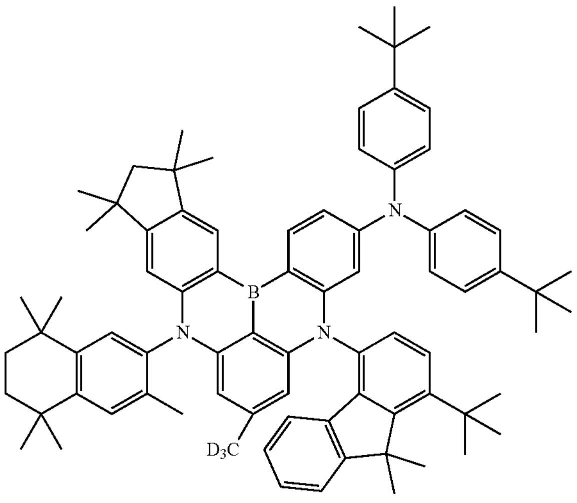
-continued
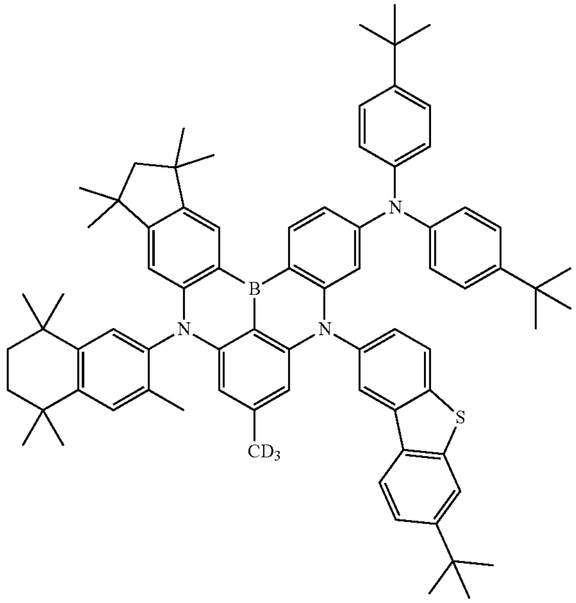
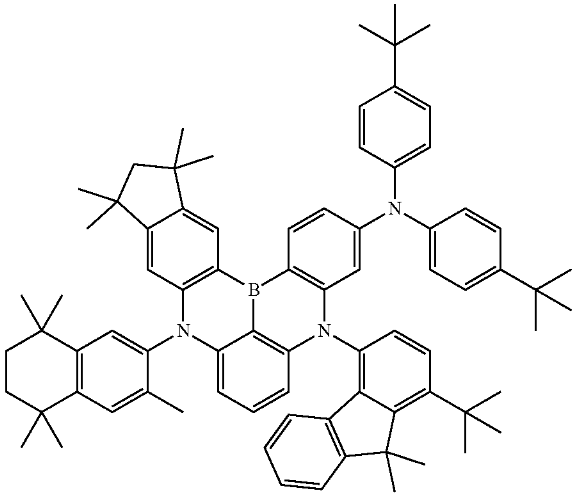
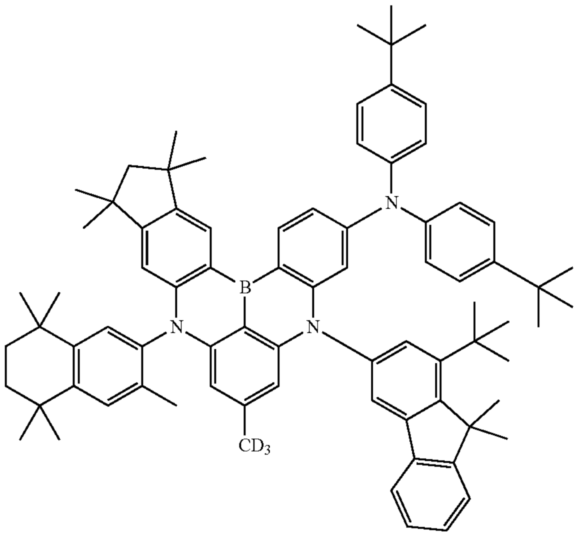

-continued
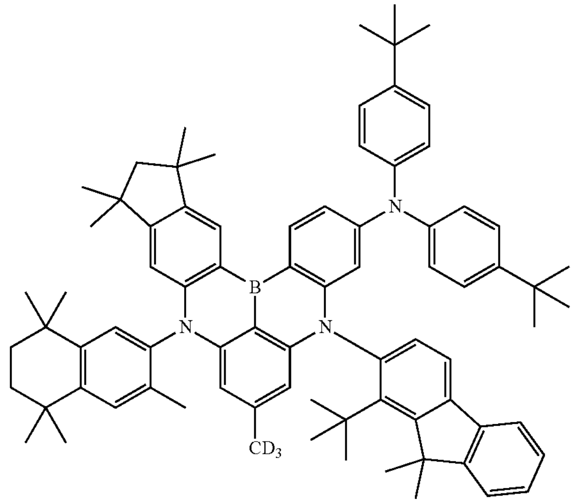
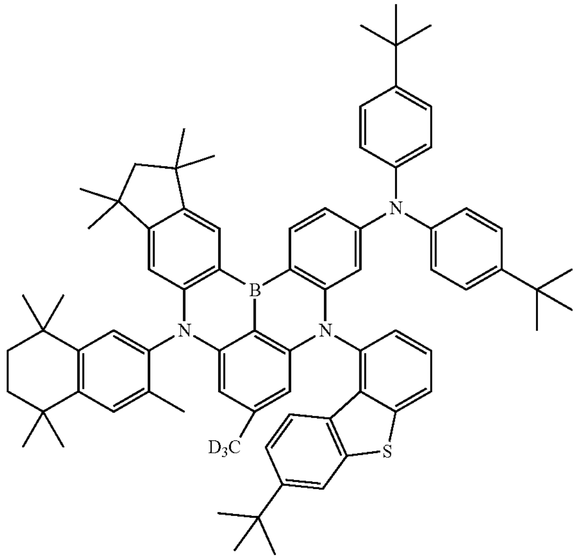
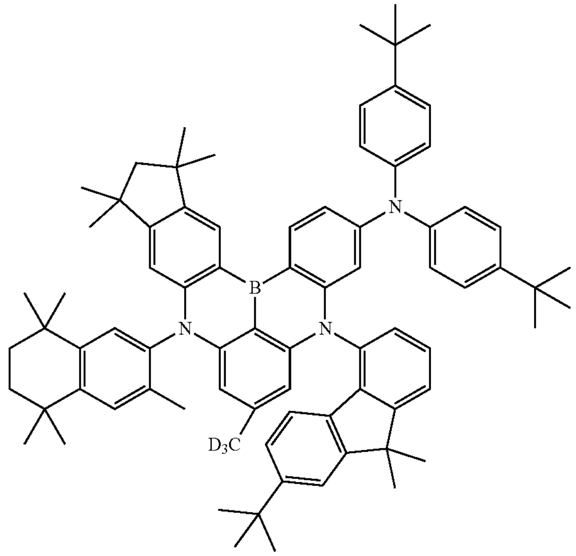
-continued
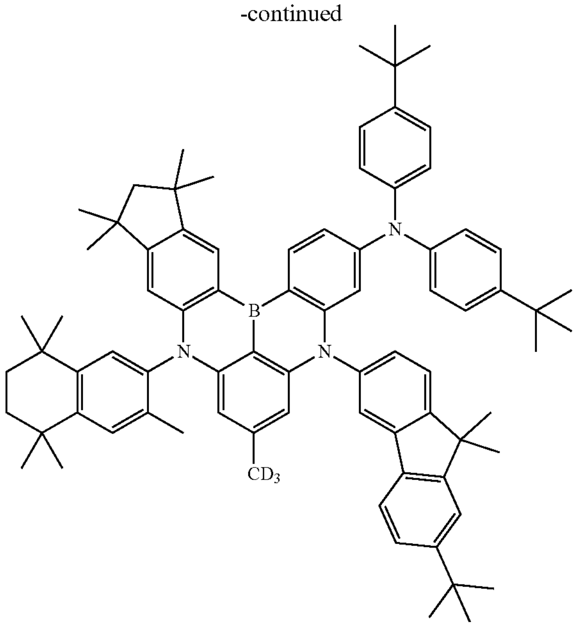
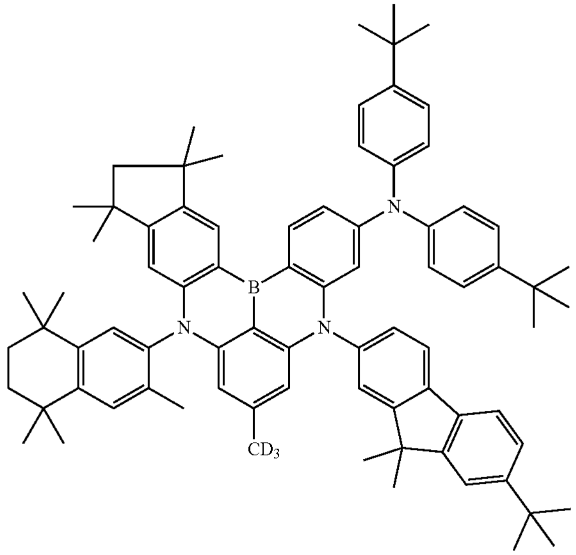
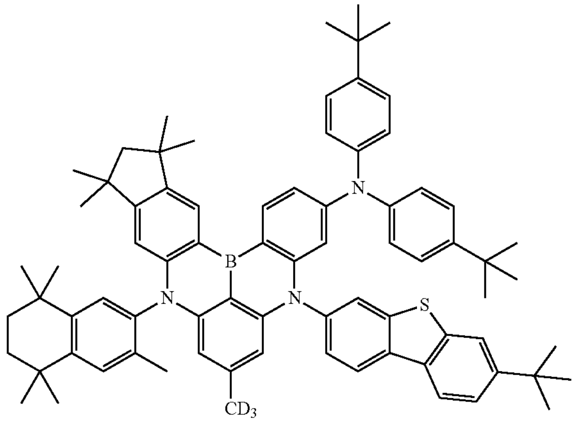

-continued
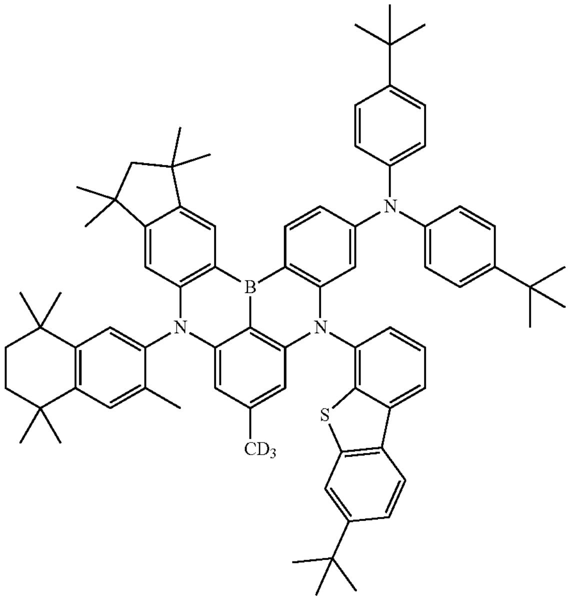
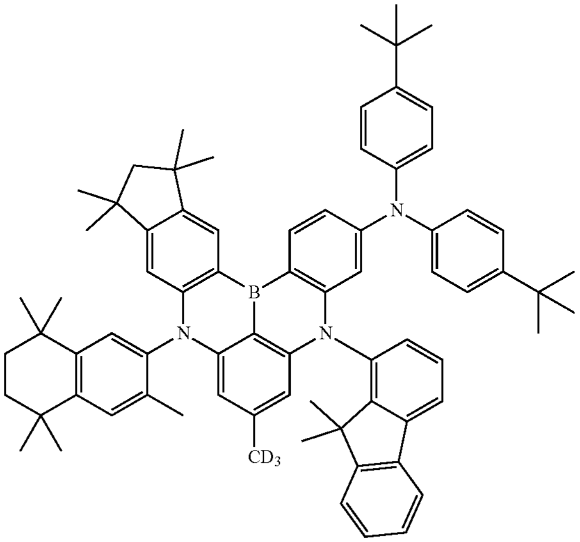
-continued
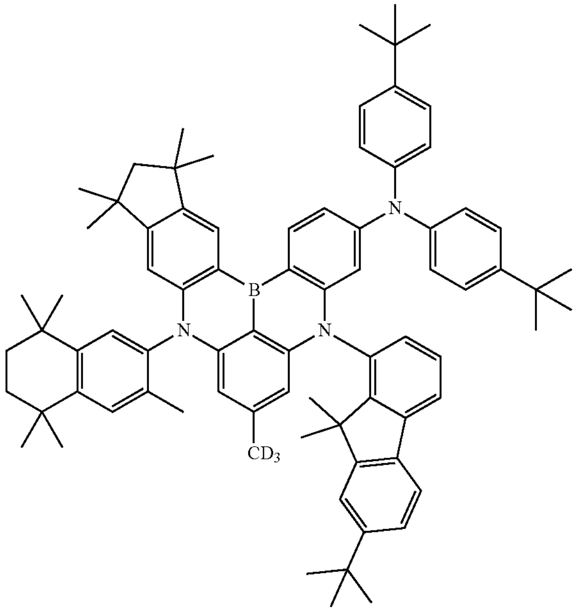
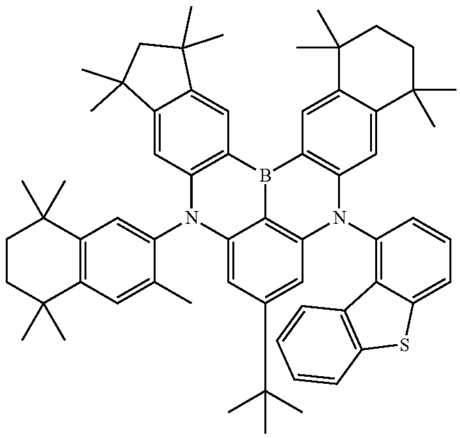
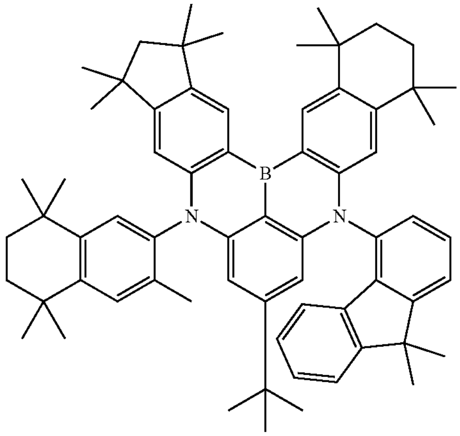

-continued
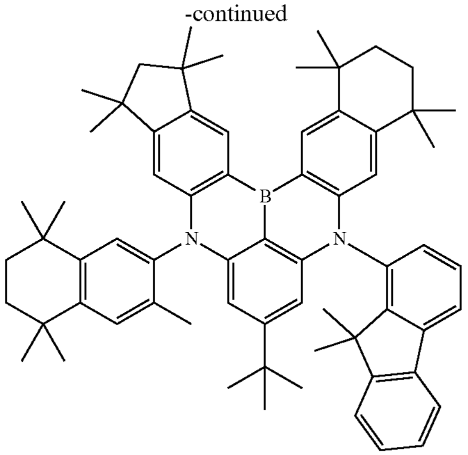
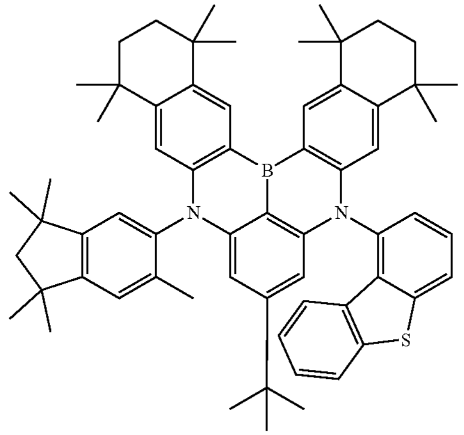
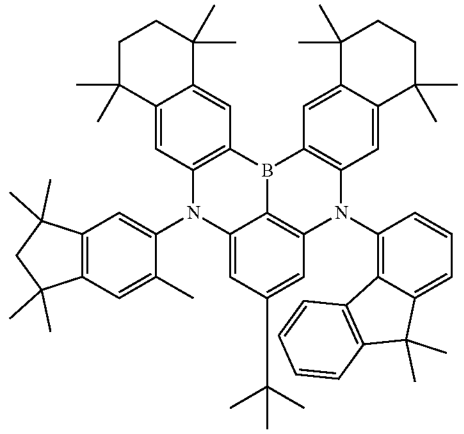
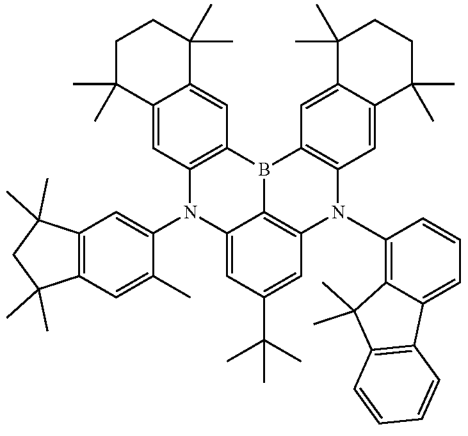
-continued
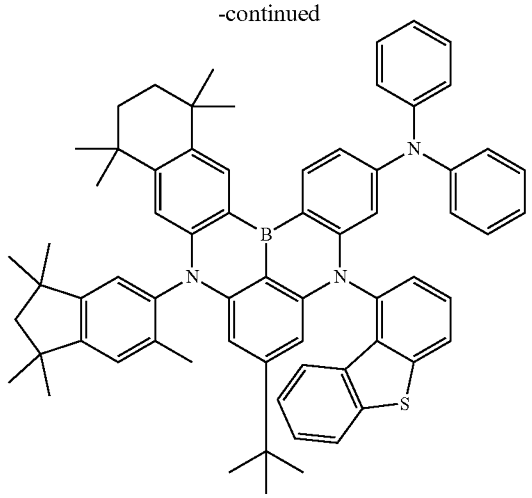
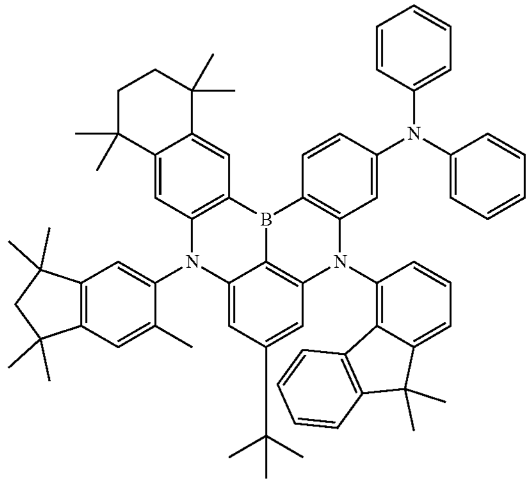
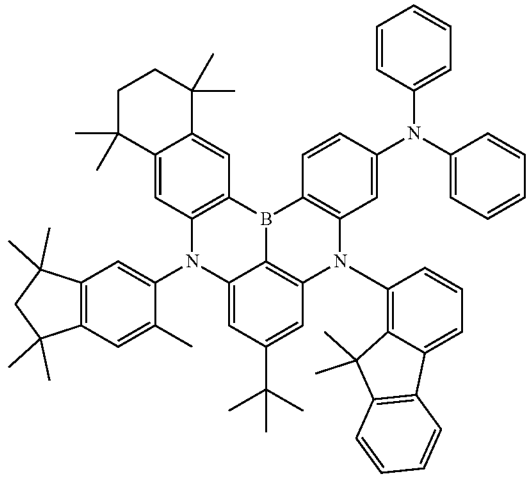

-continued
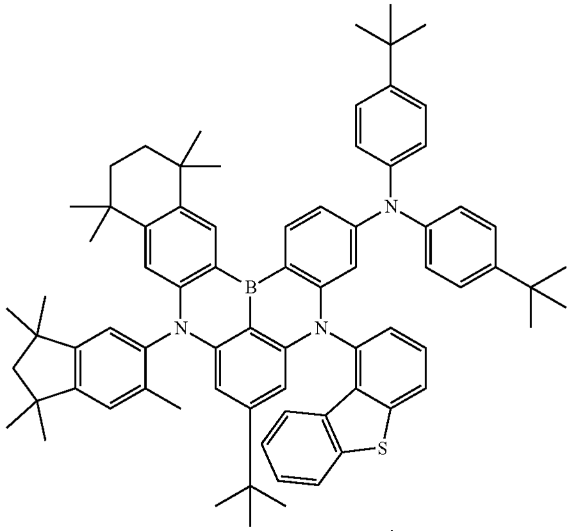
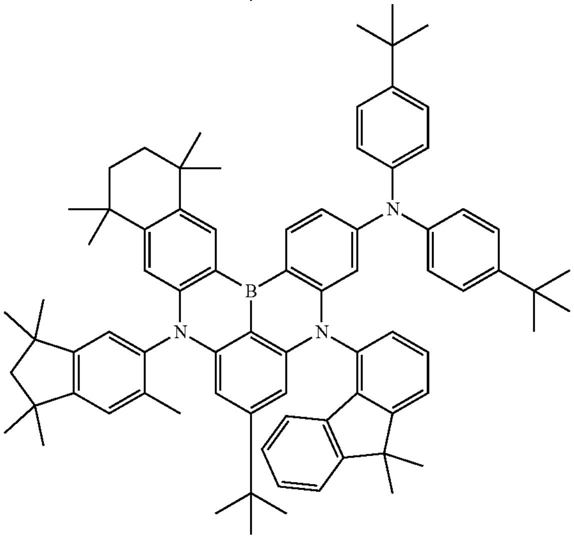
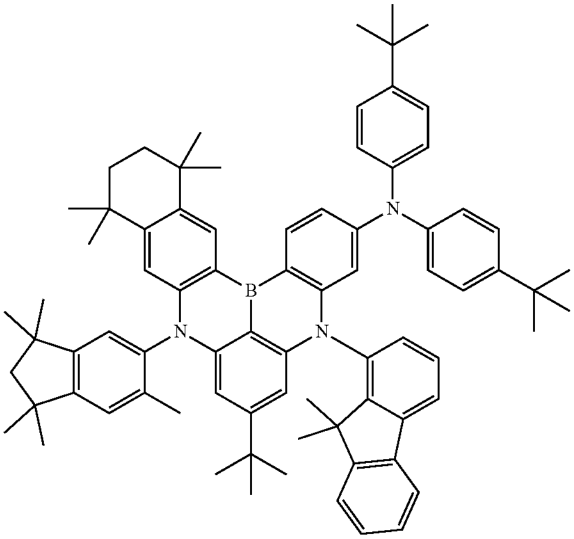
-continued
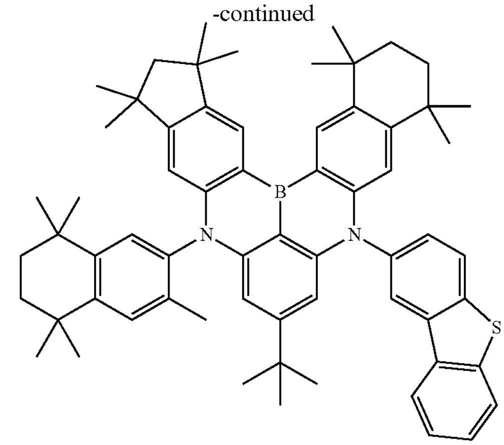
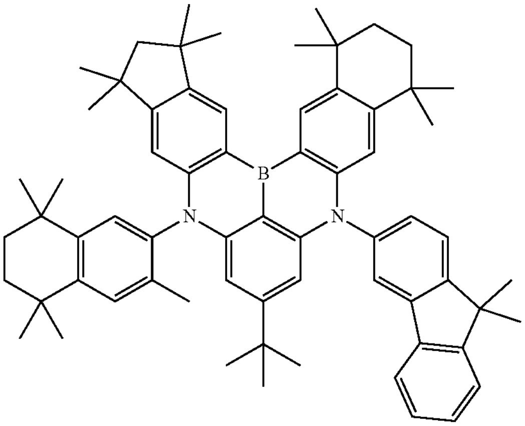
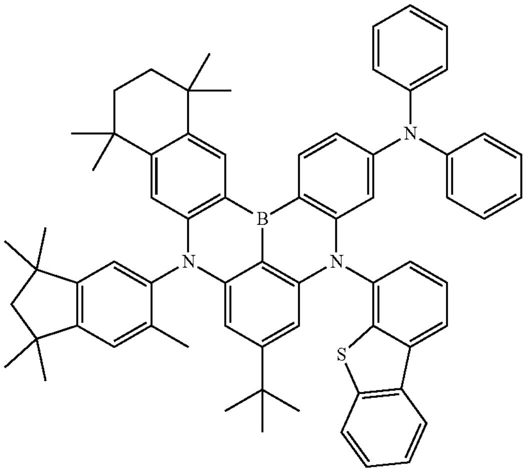

-continued
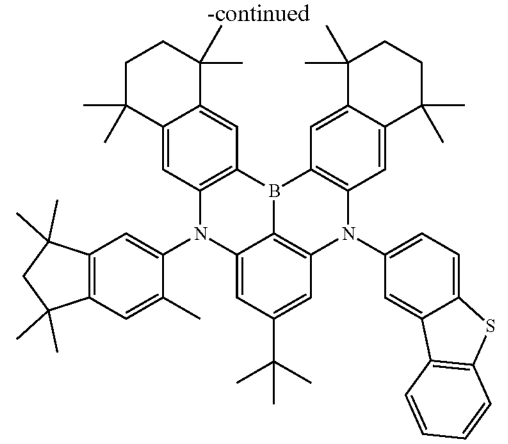
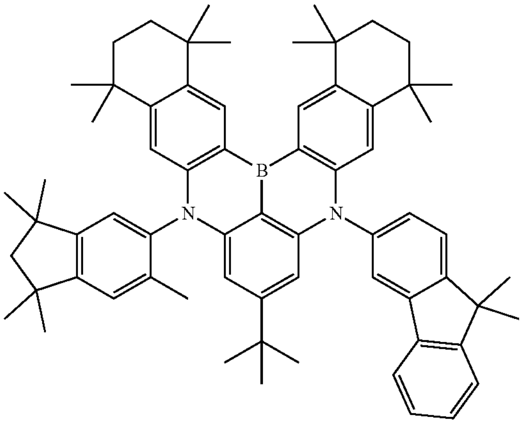
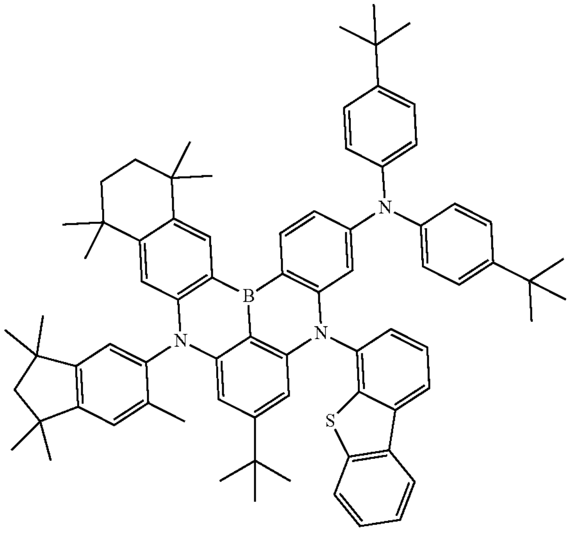
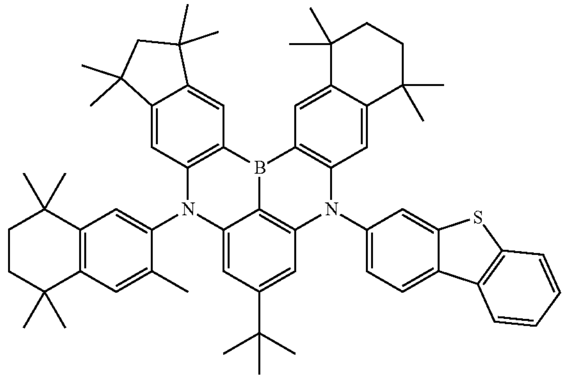
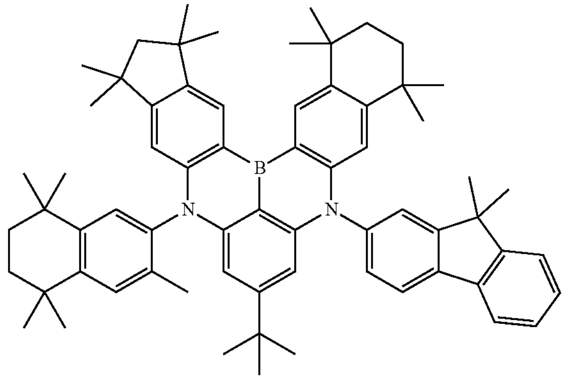
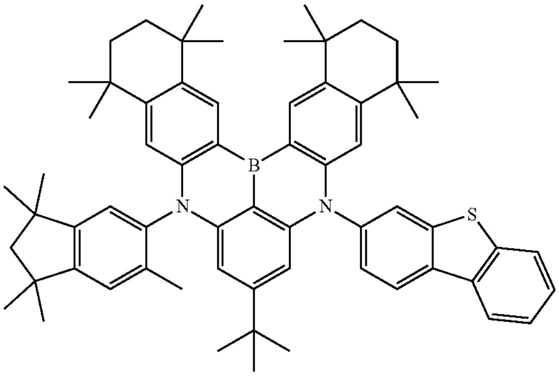
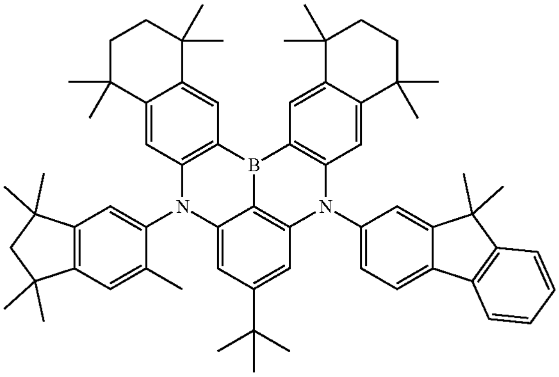

-continued
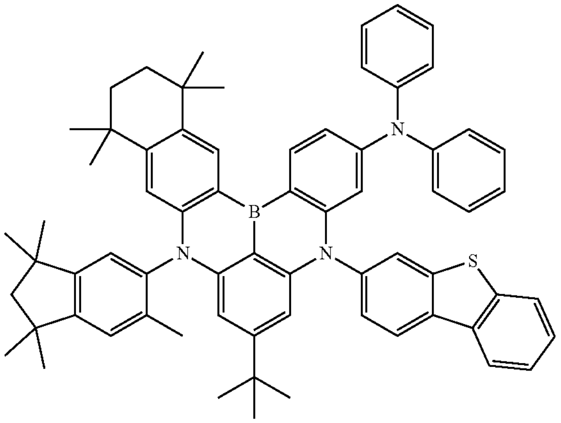
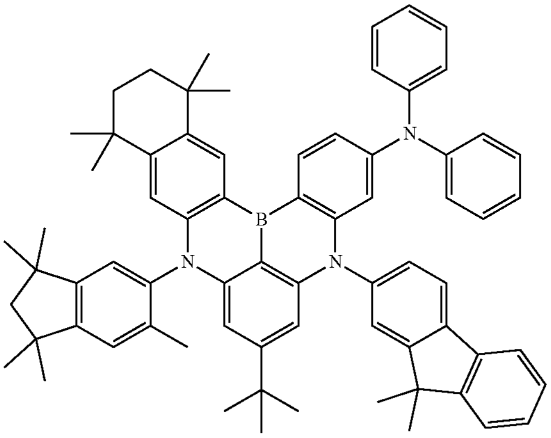
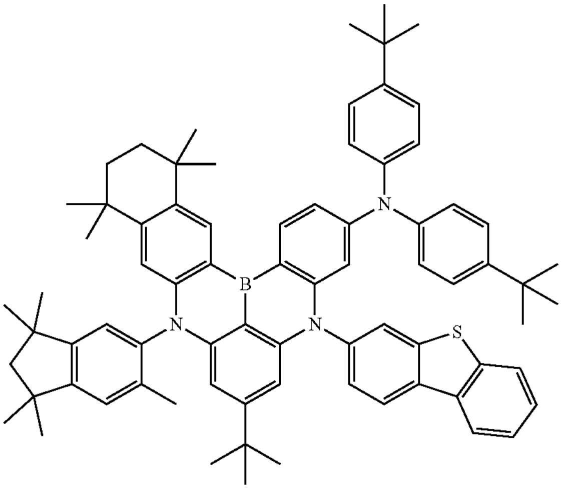
-continued
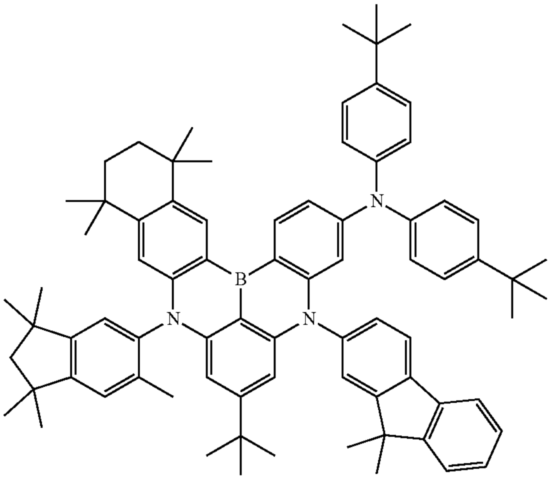
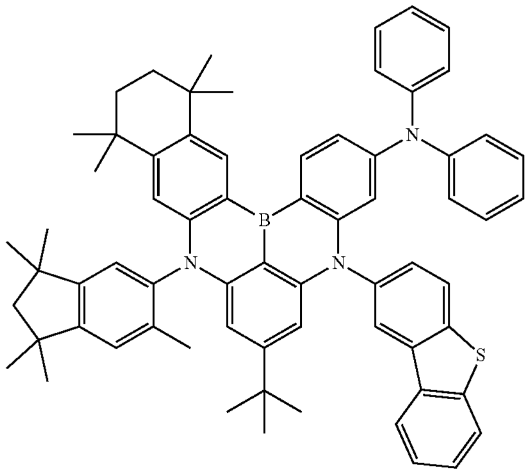
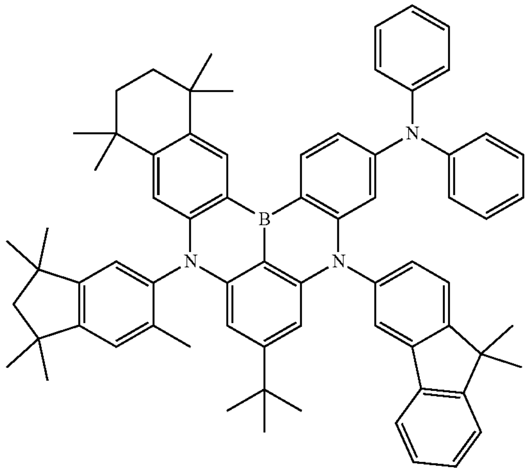

-continued
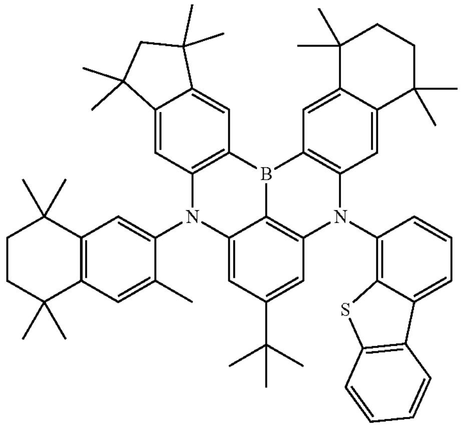
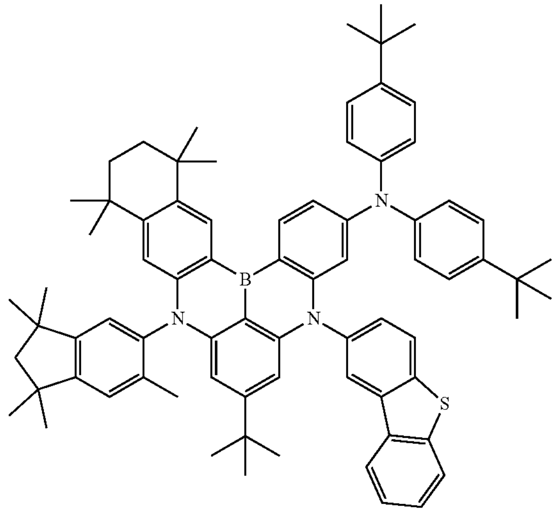
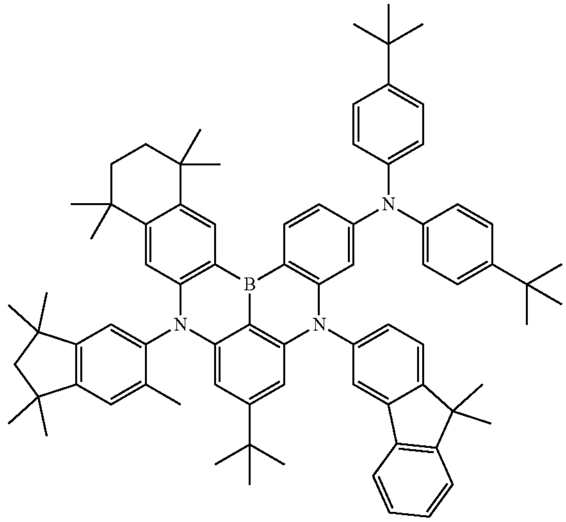
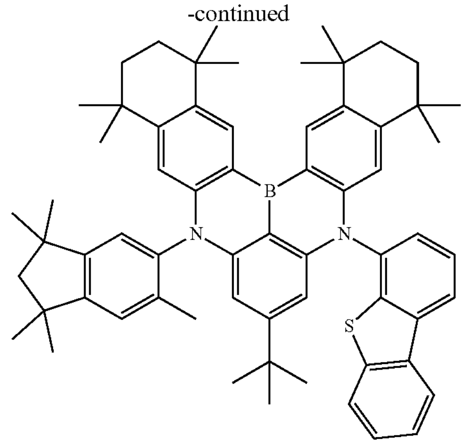
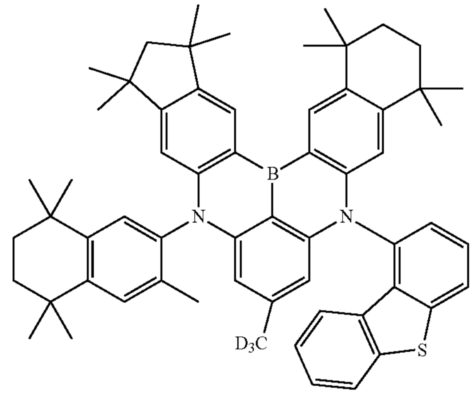
-continued
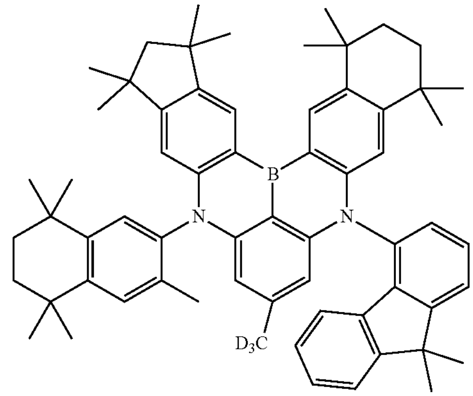
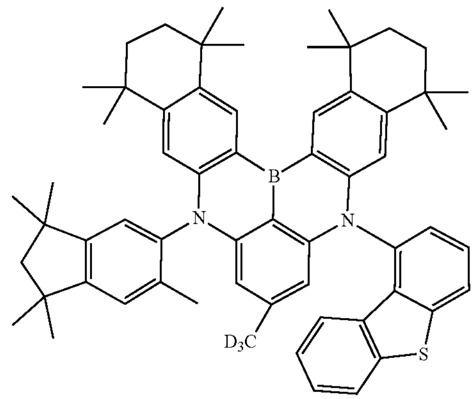

-continued
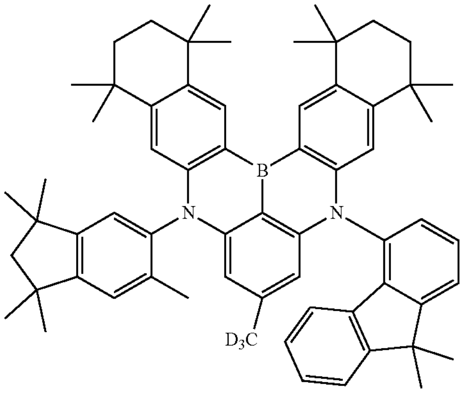
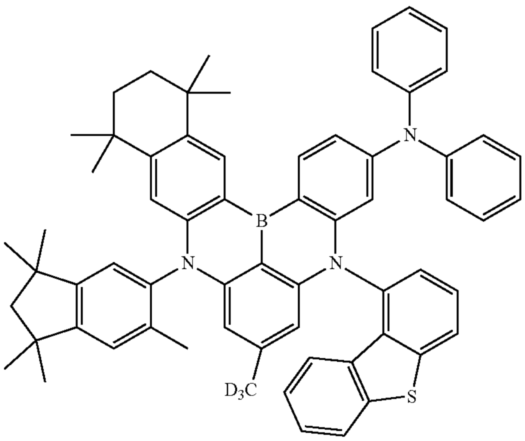
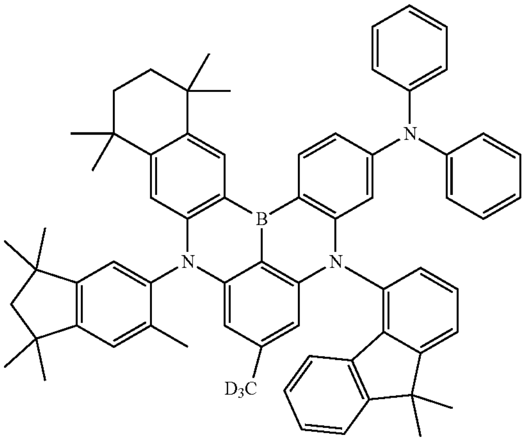
-continued
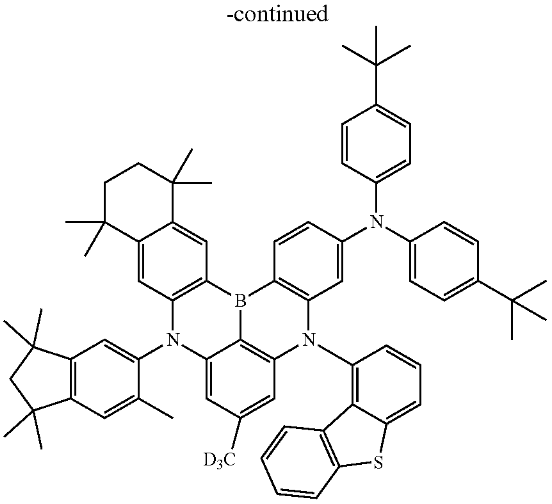
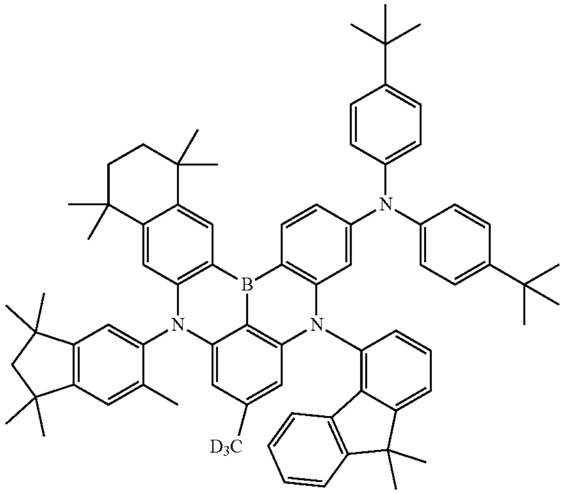
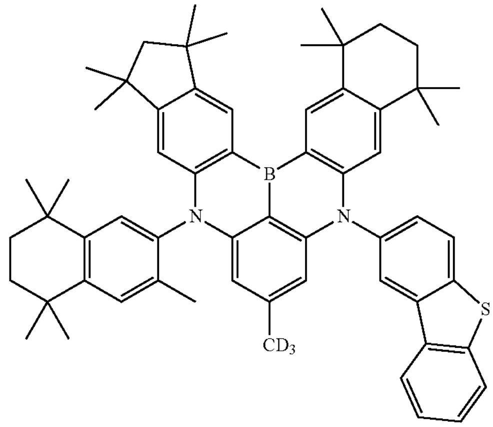

-continued
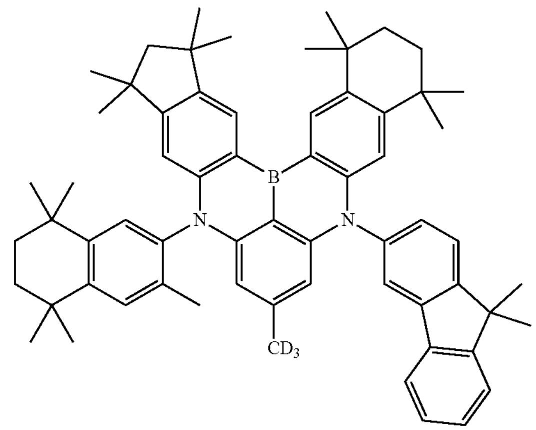
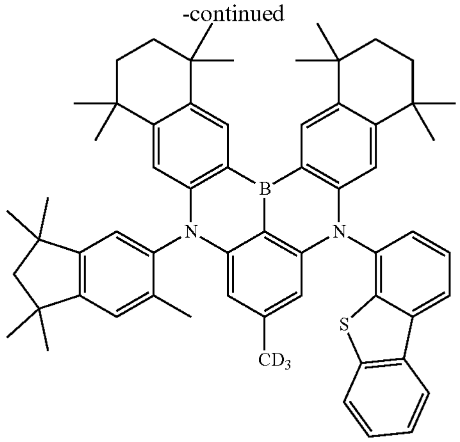
-continued
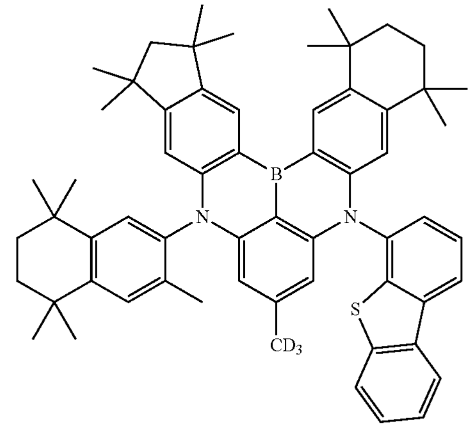
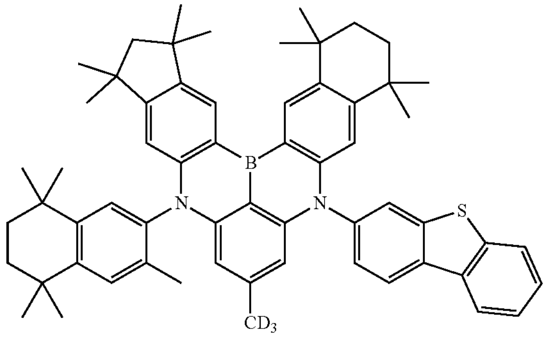
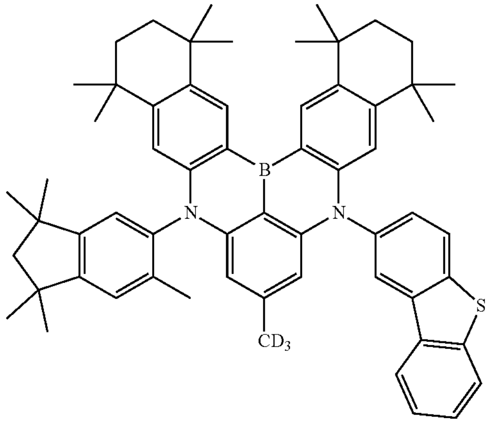
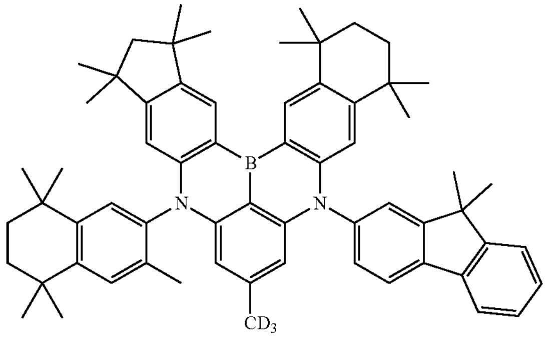
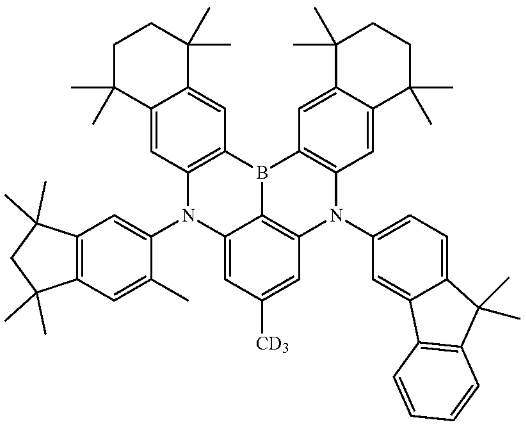
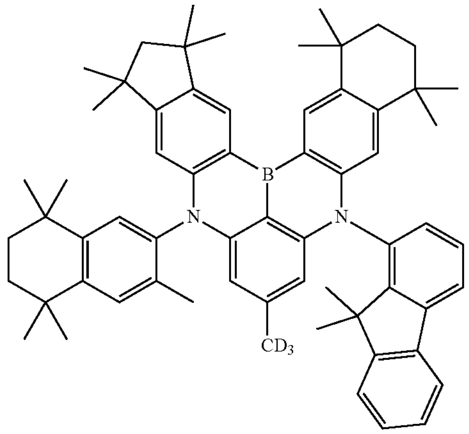

-continued
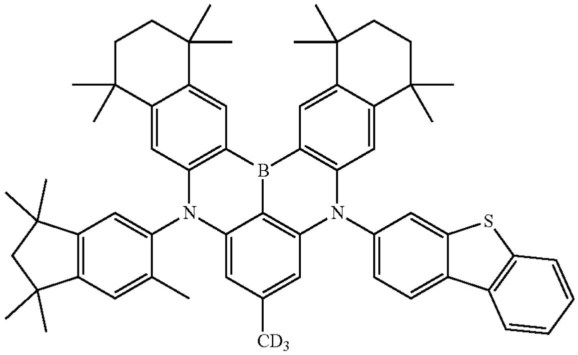
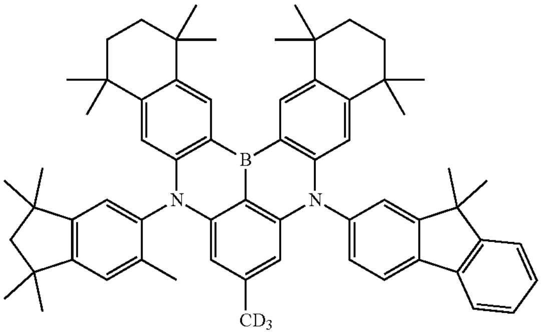
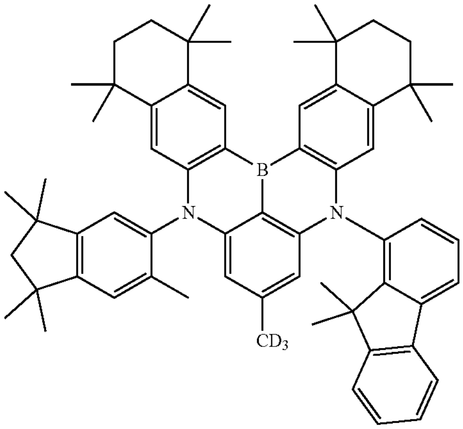
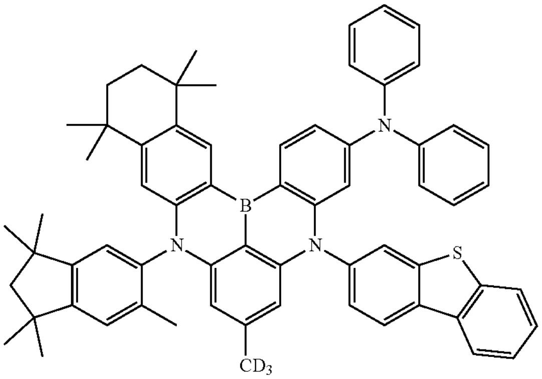
-continued
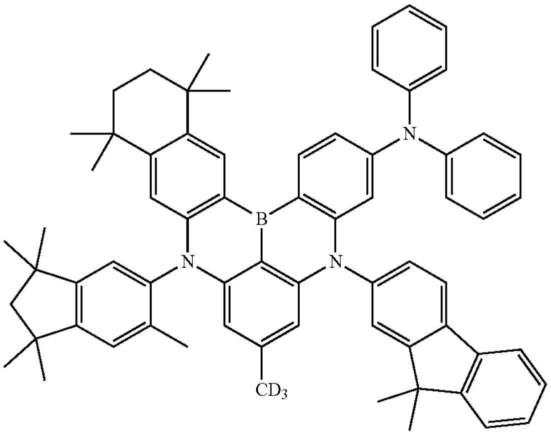
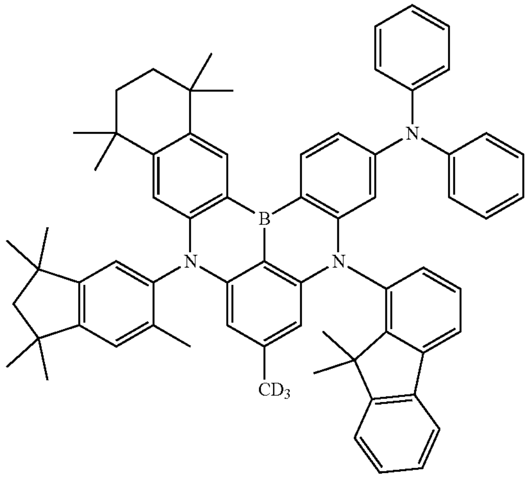
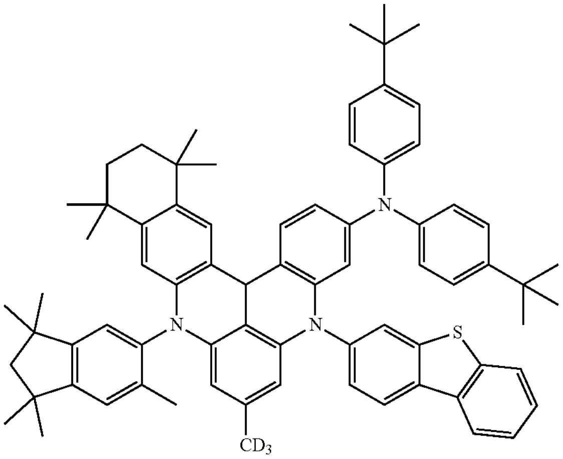

-continued
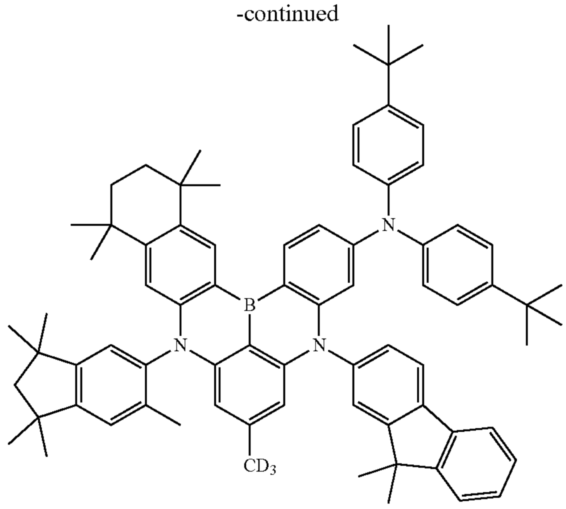
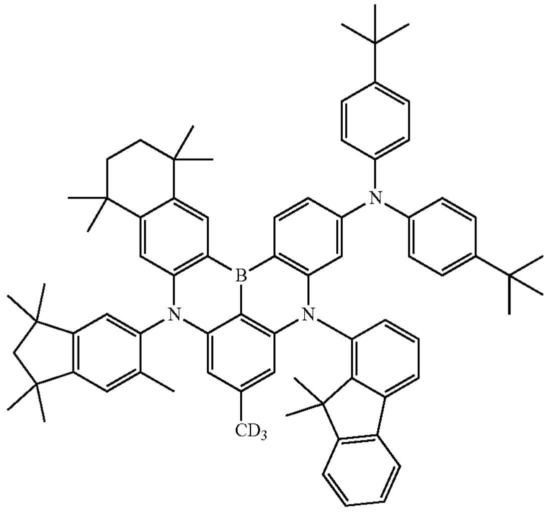
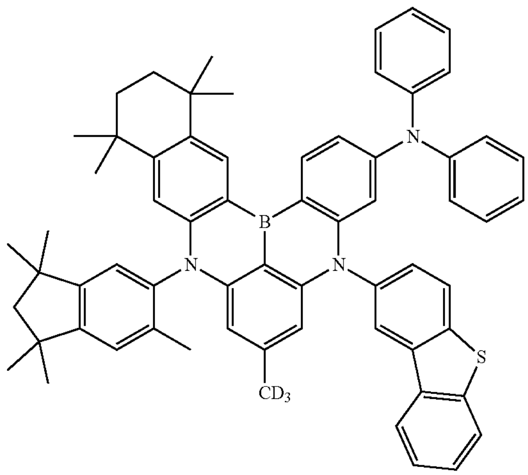
-continued
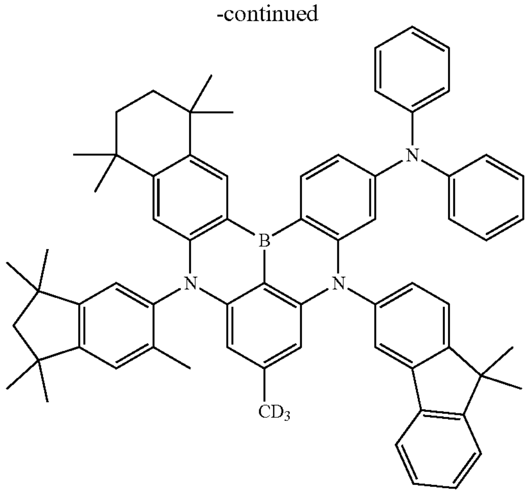
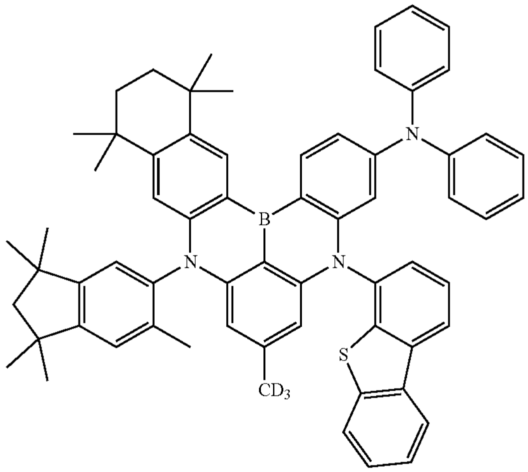
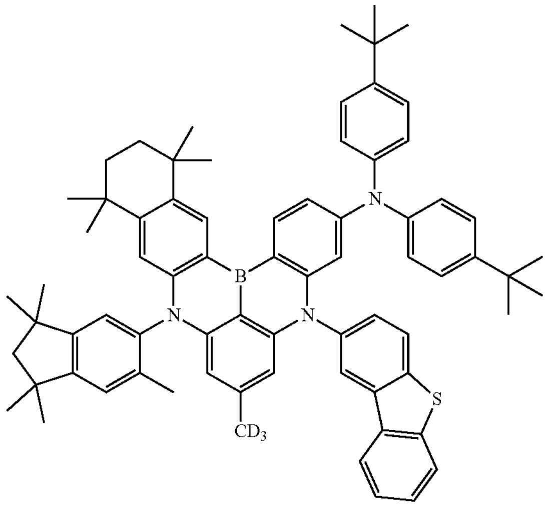

-continued
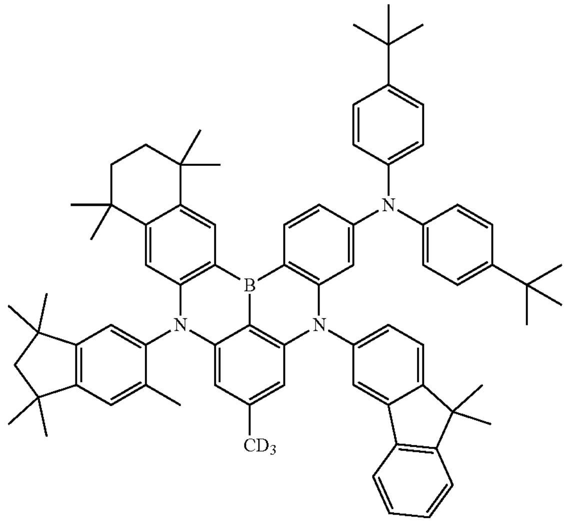
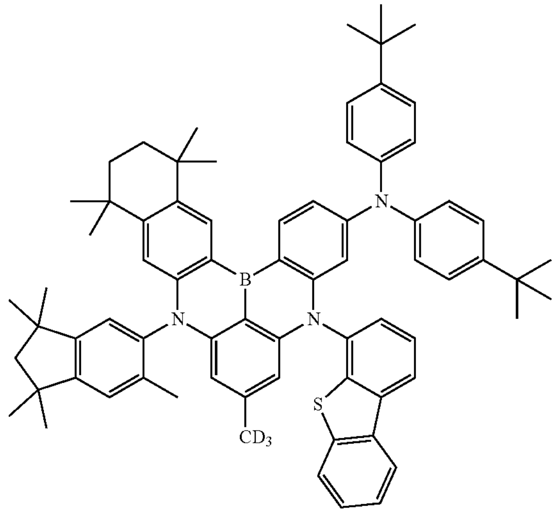
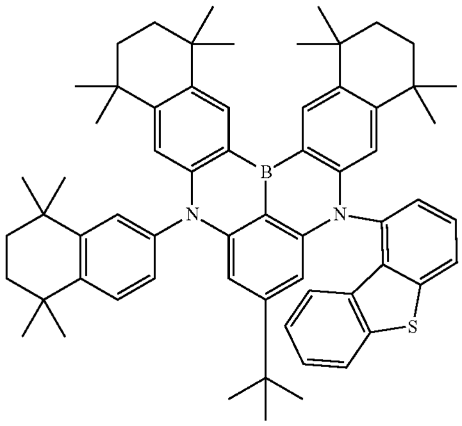
-continued
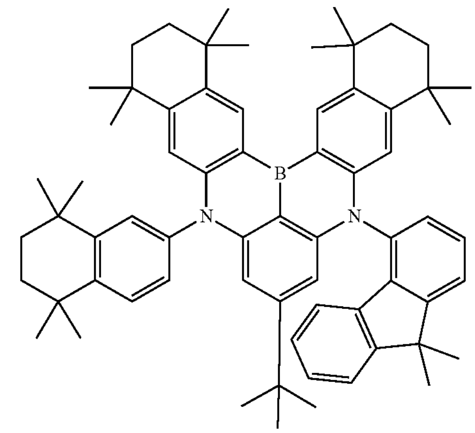
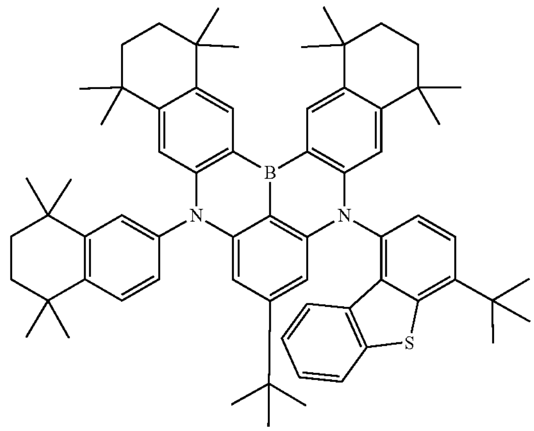
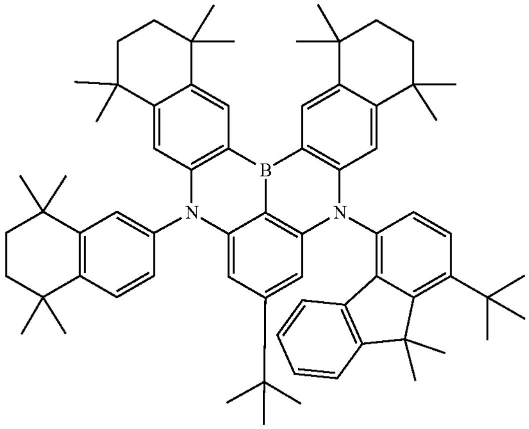

-continued
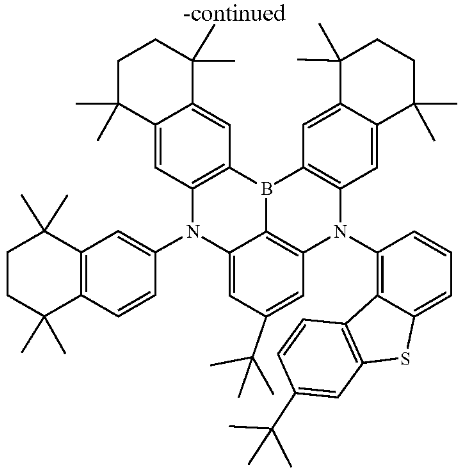
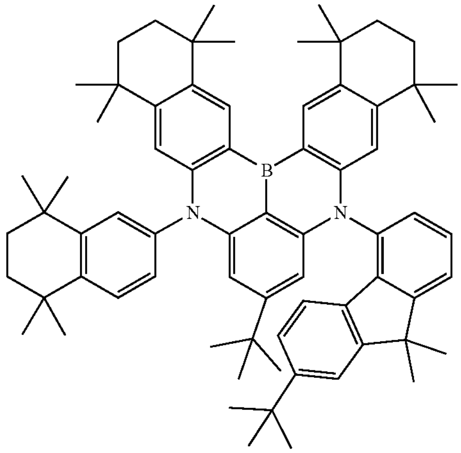
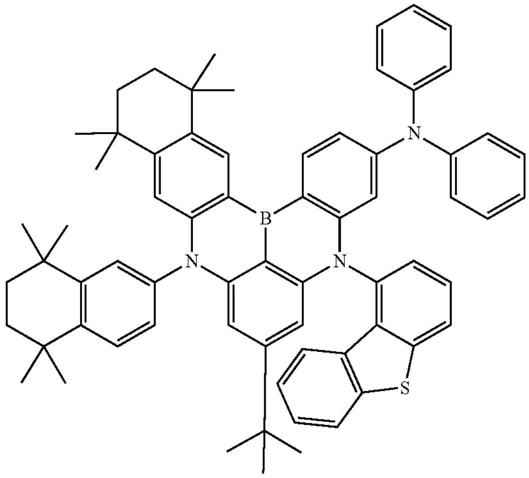
-continued
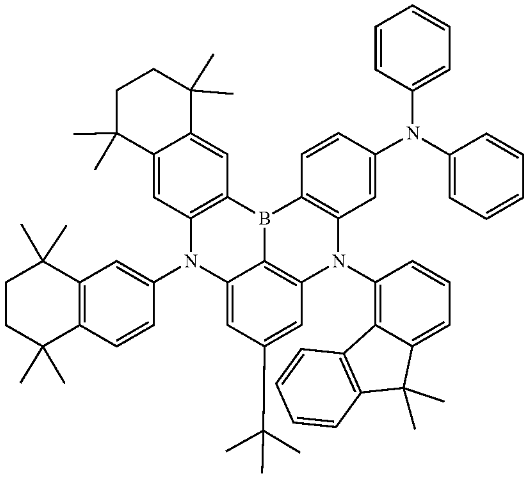
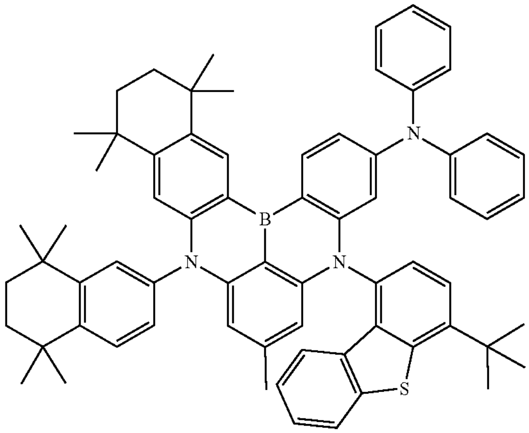
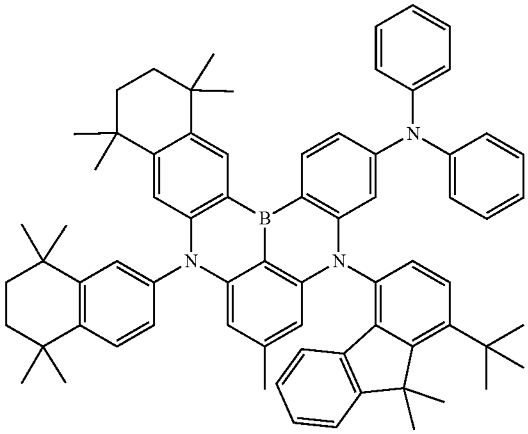

-continued
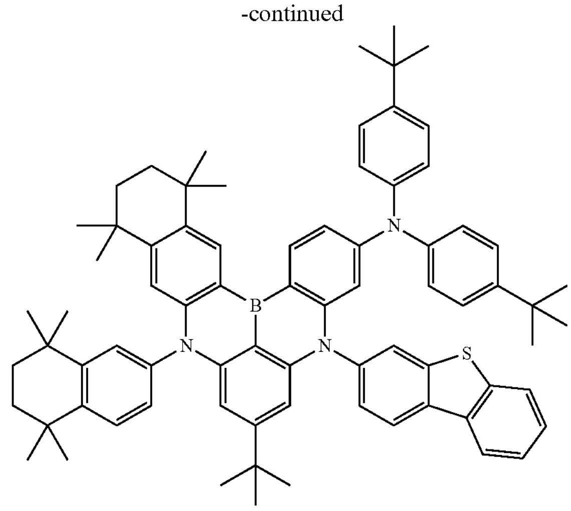
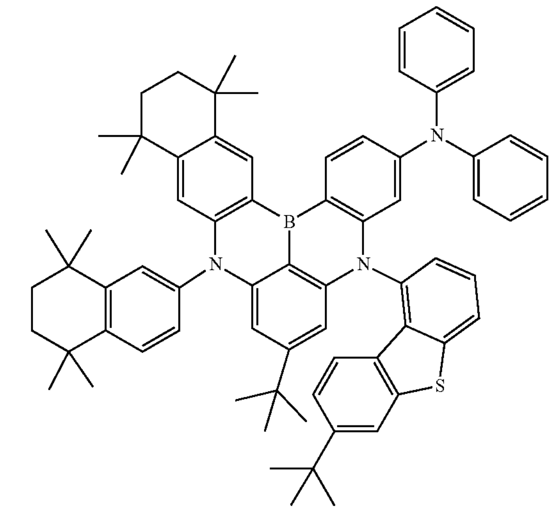
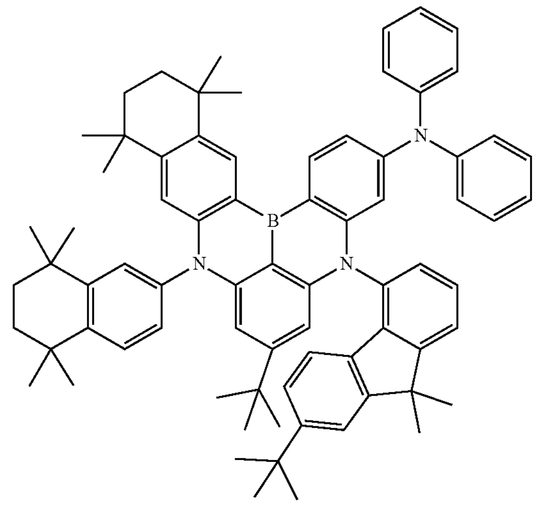
-continued
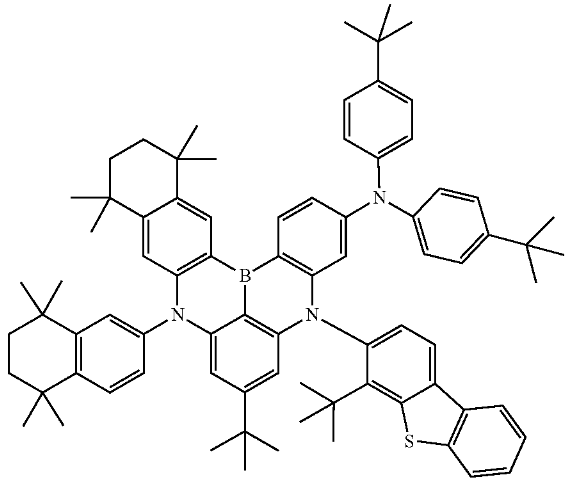
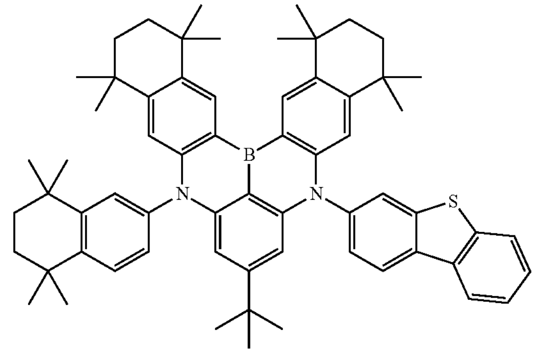
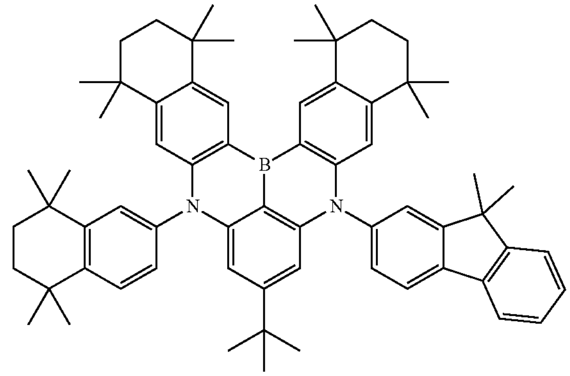
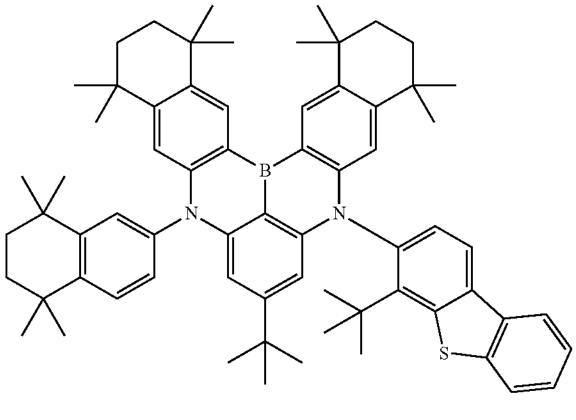

-continued
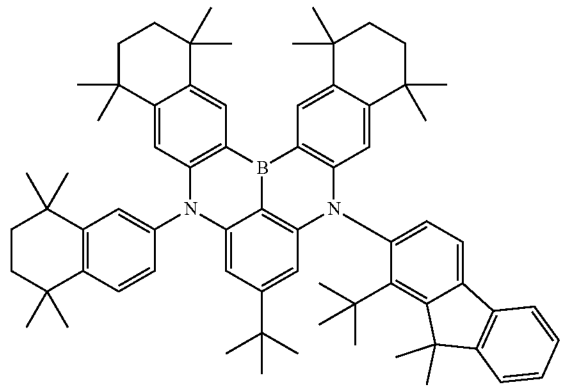
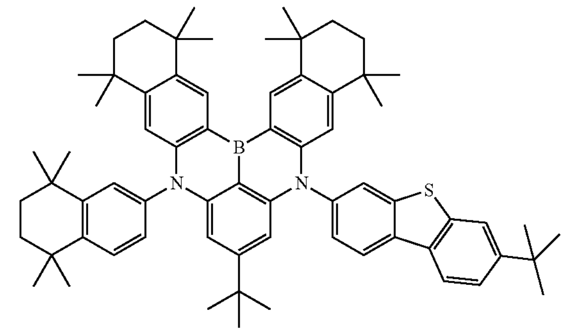
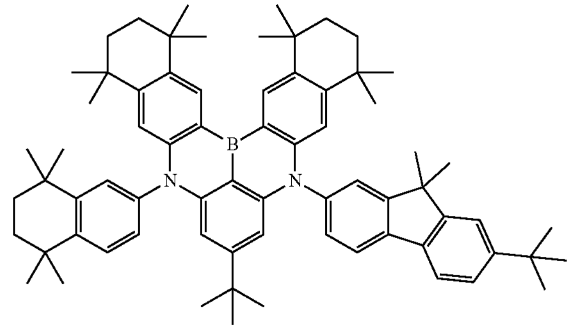
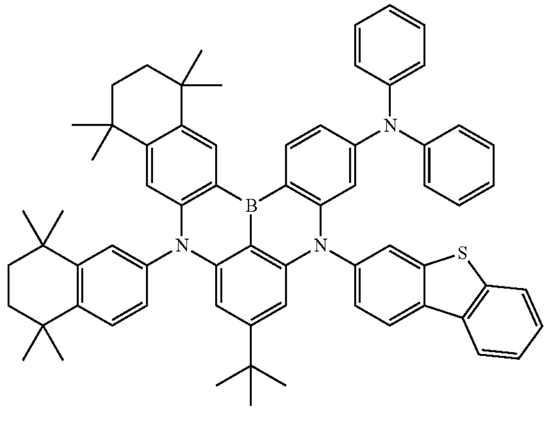
-continued
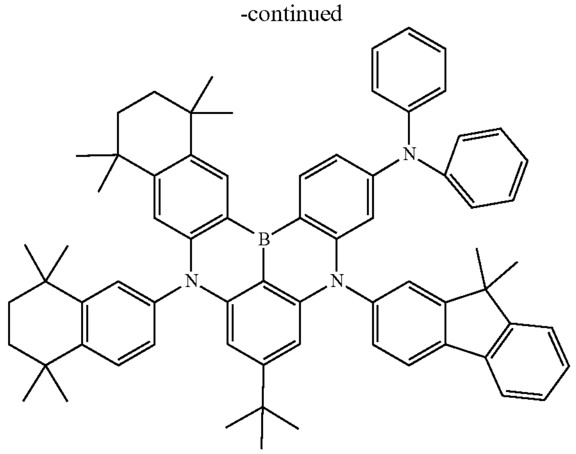
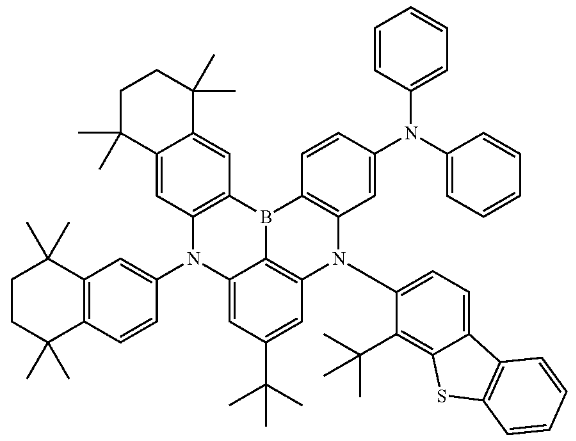
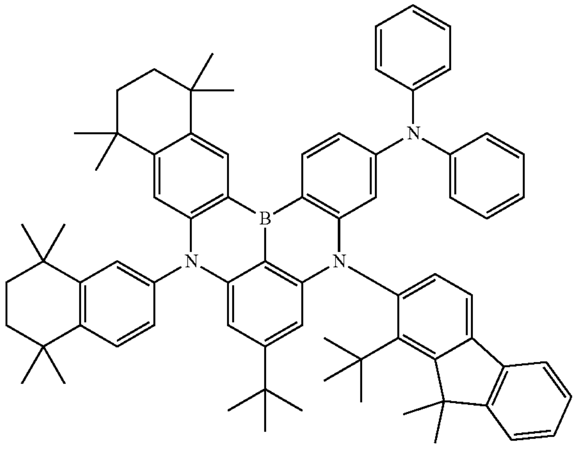

-continued
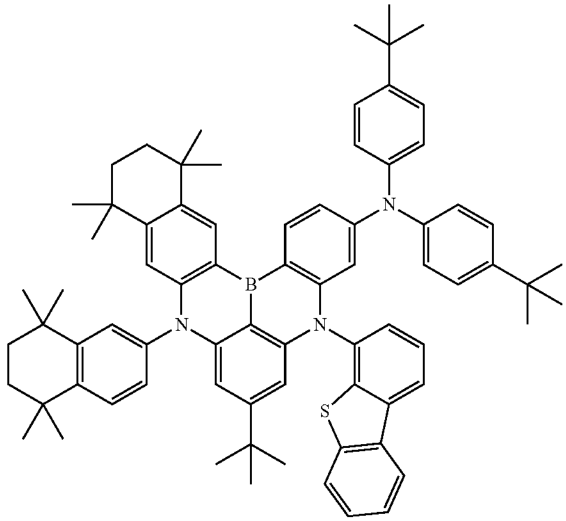
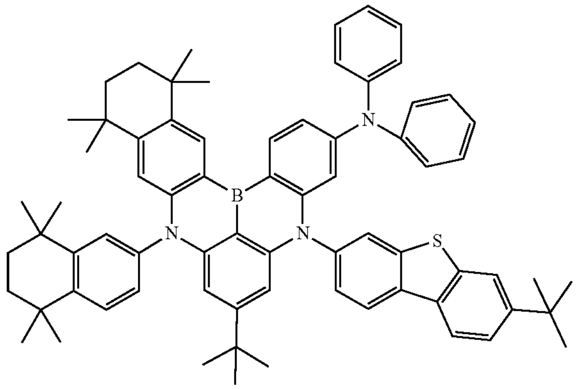
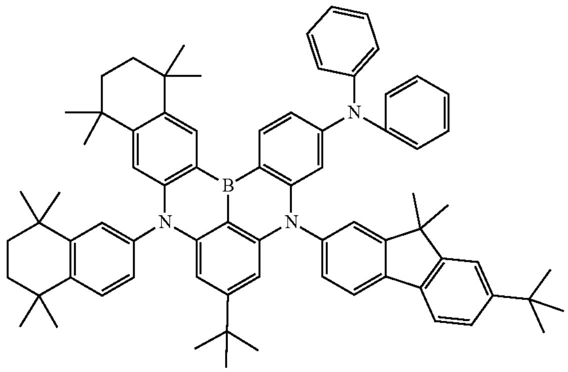
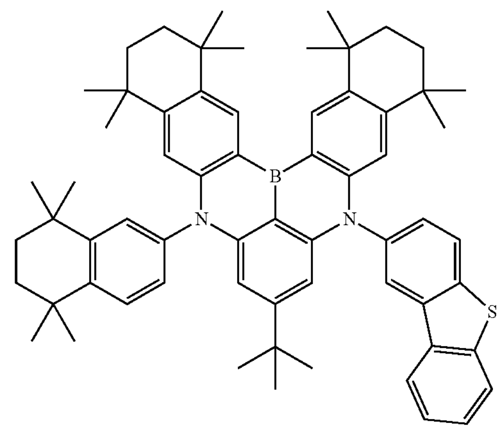
-continued
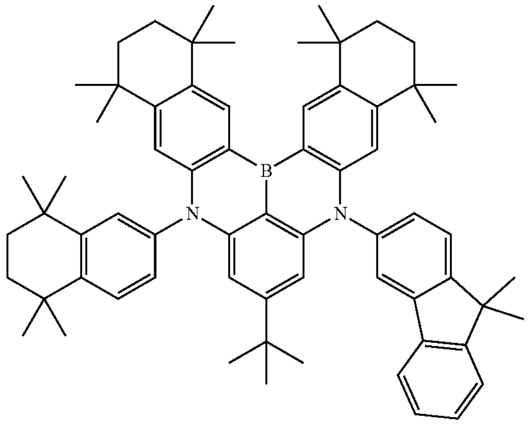
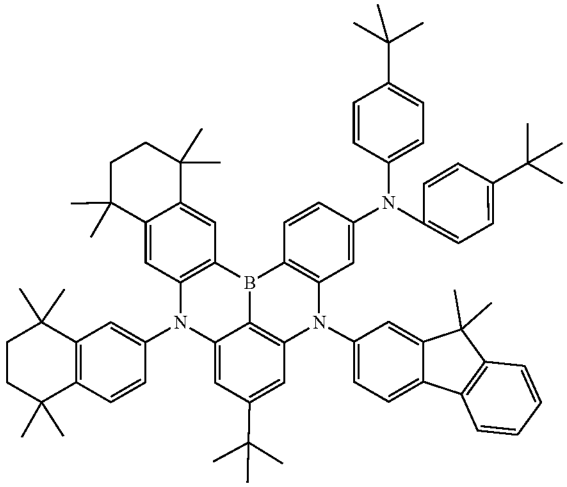
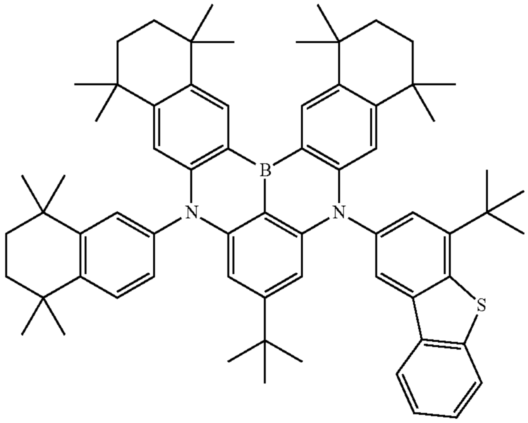

-continued
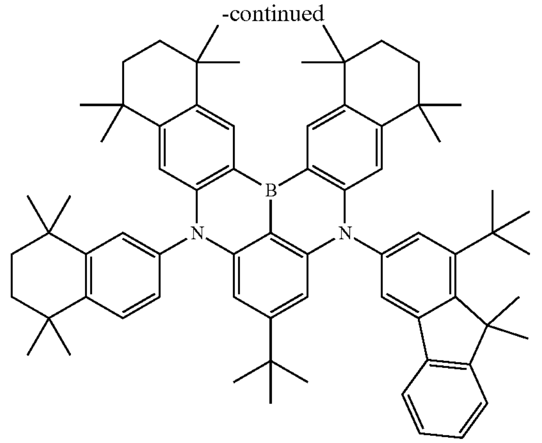
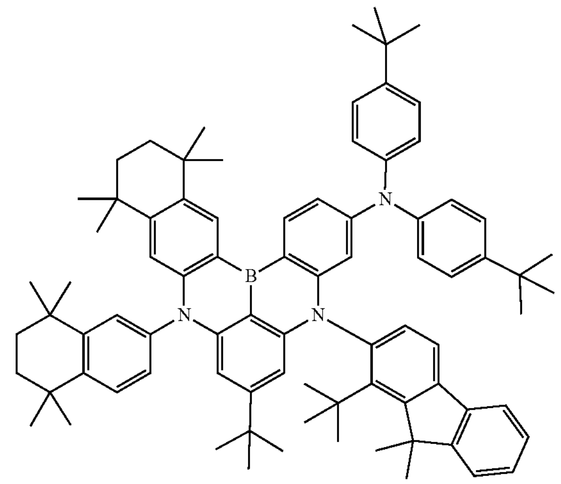
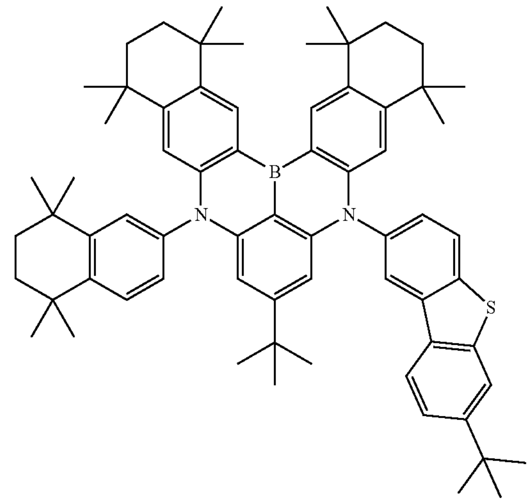
-continued
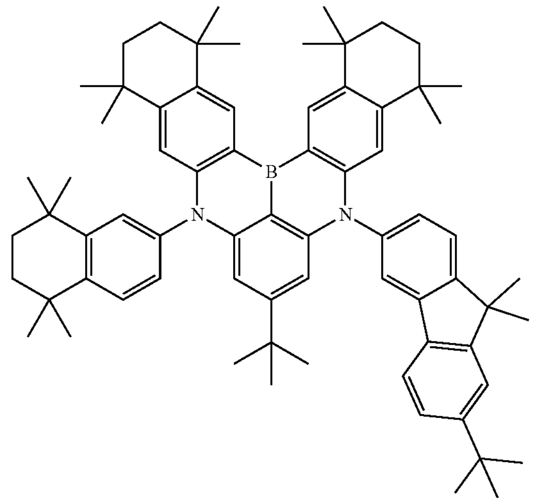
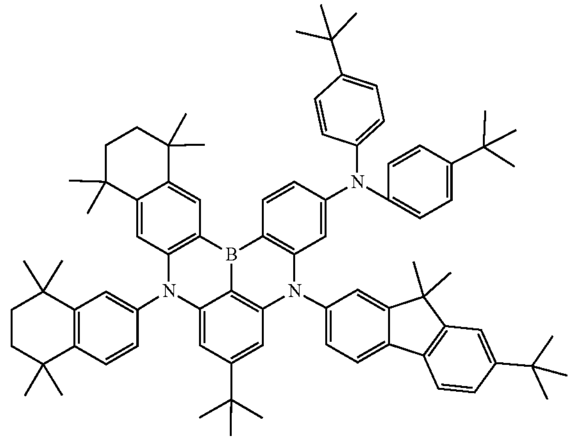
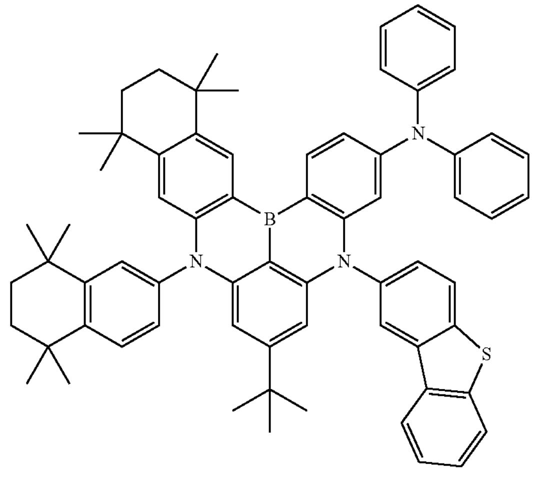

-continued
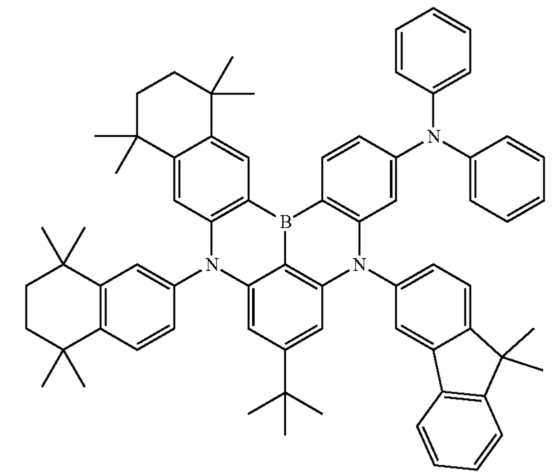
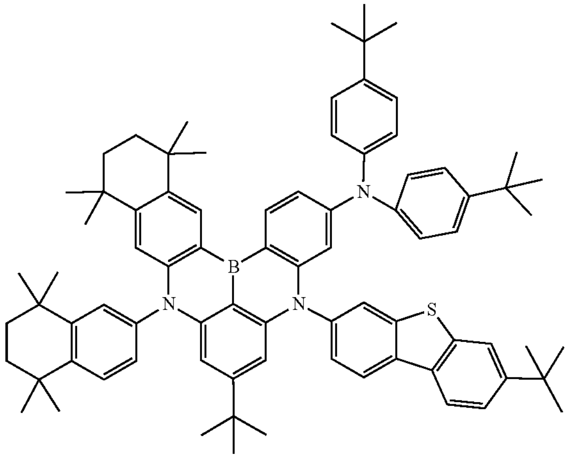
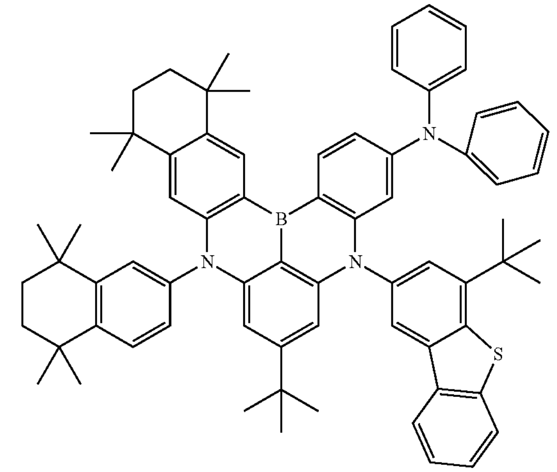
-continued
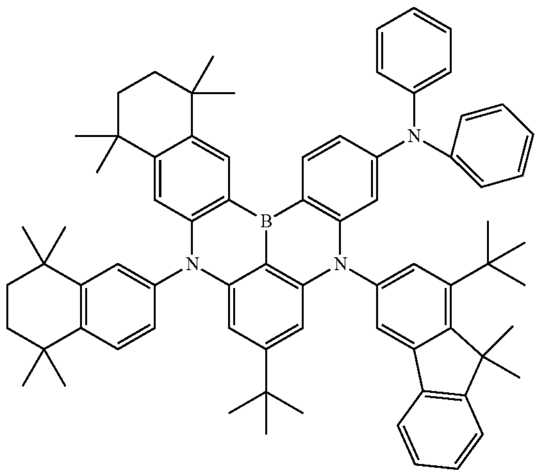
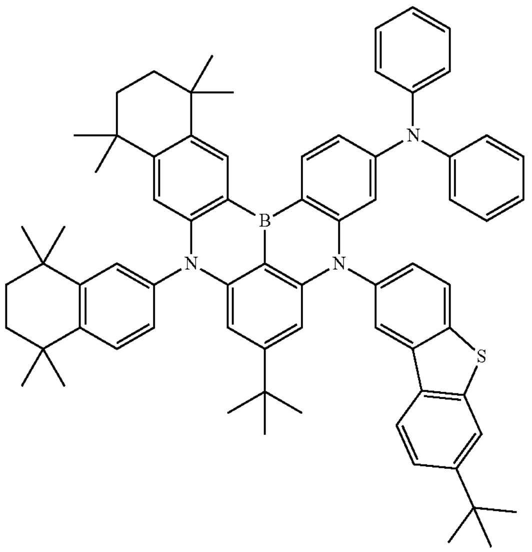
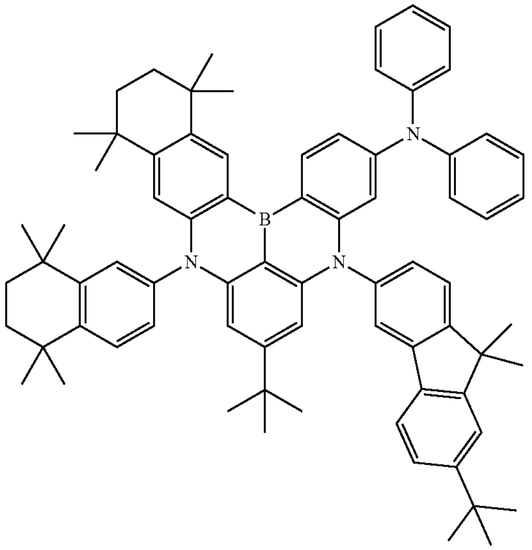

-continued
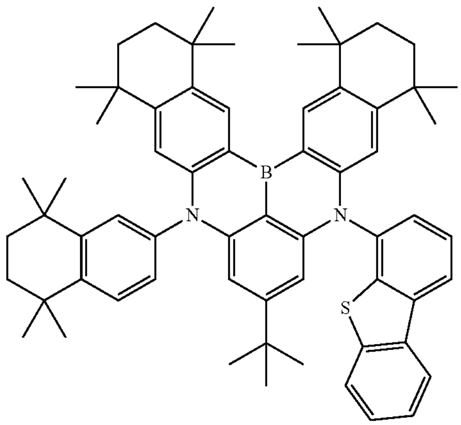
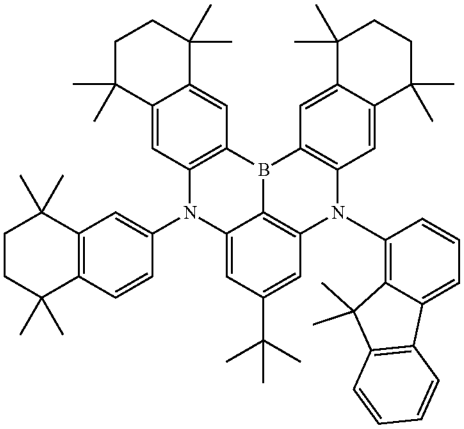
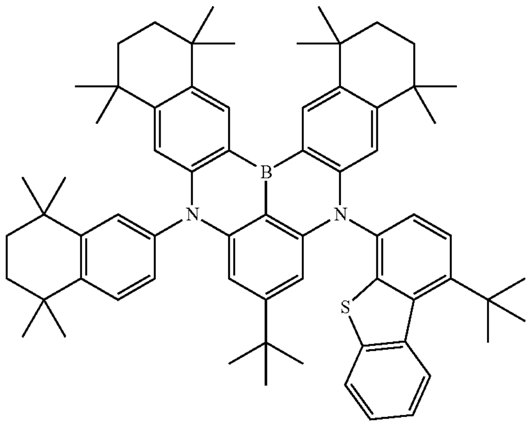
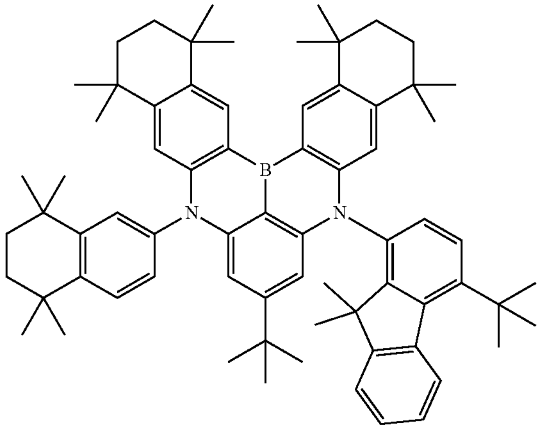
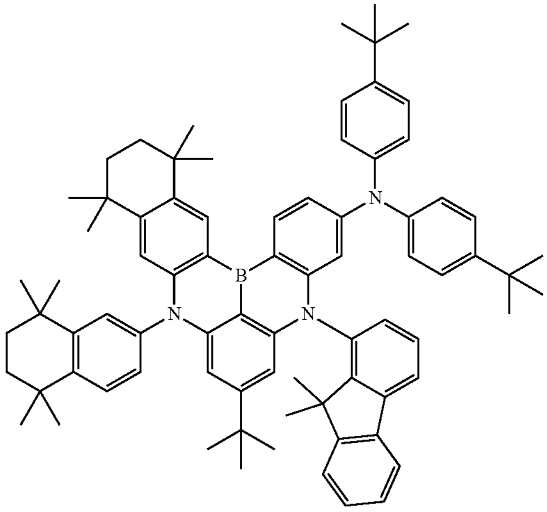
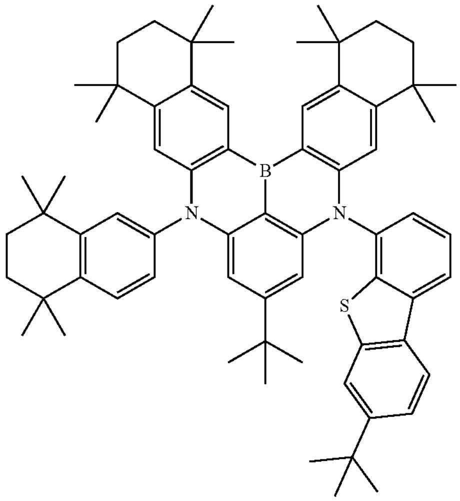
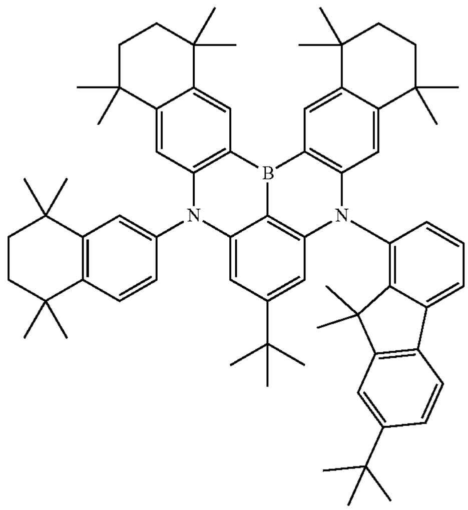

-continued
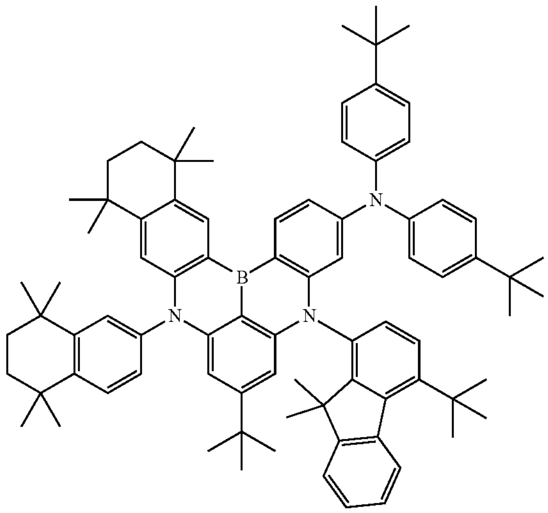
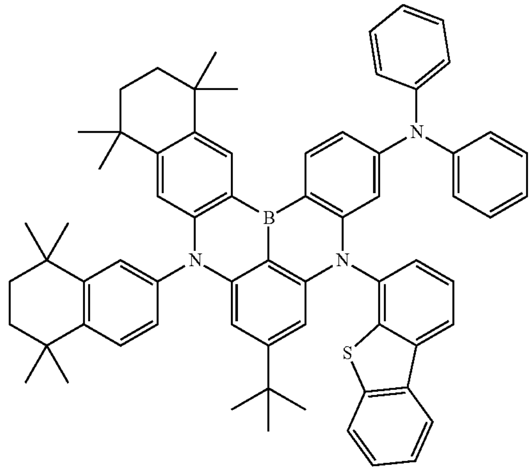
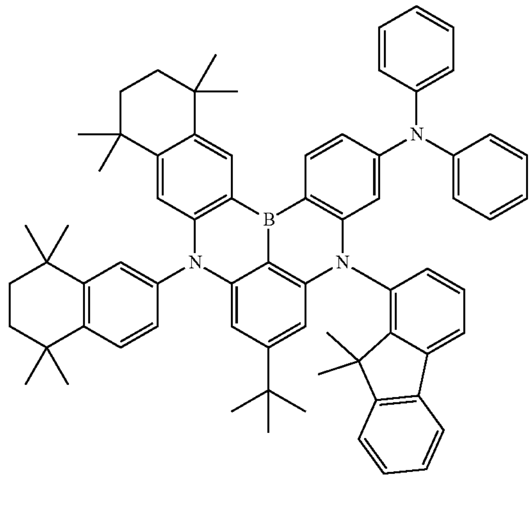
-continued
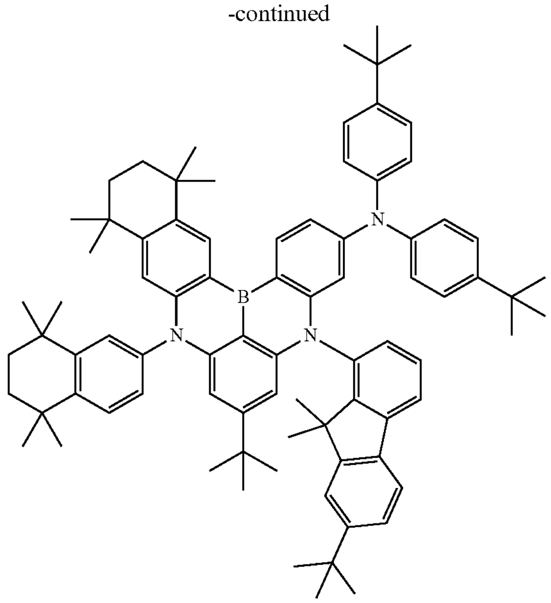
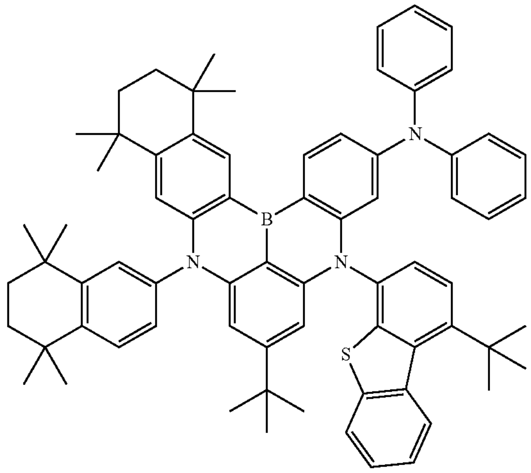
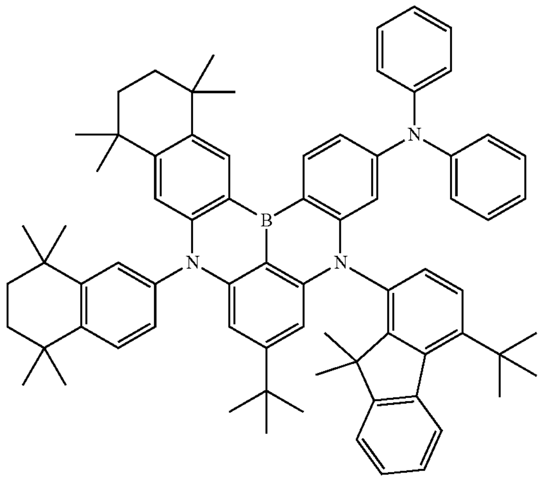

-continued
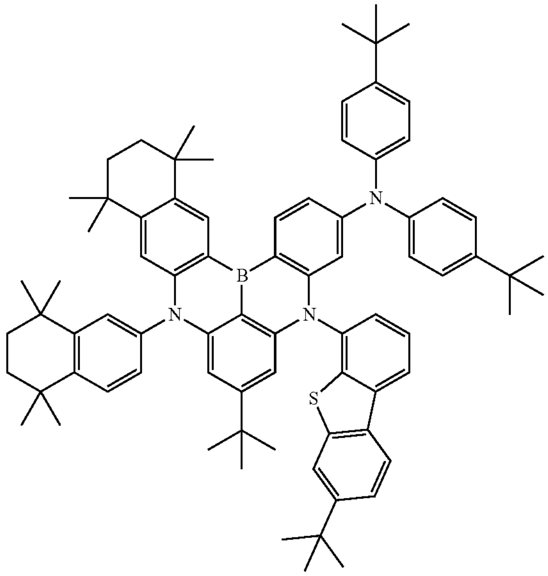
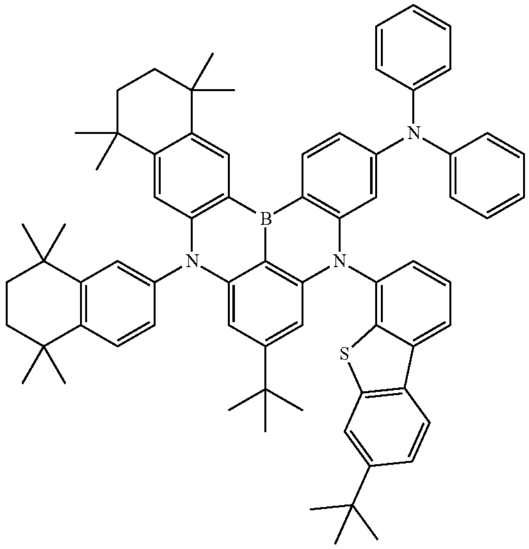
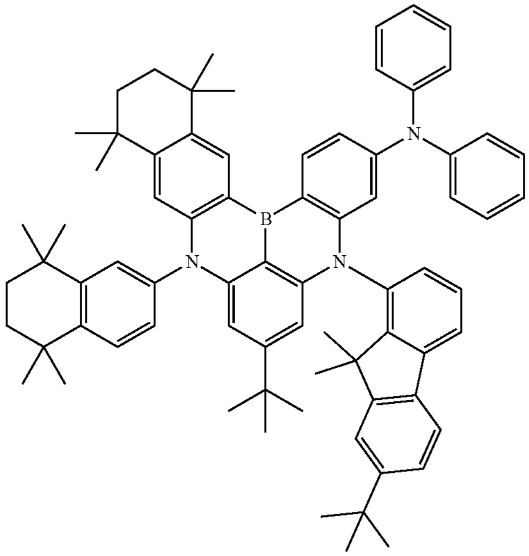
-continued
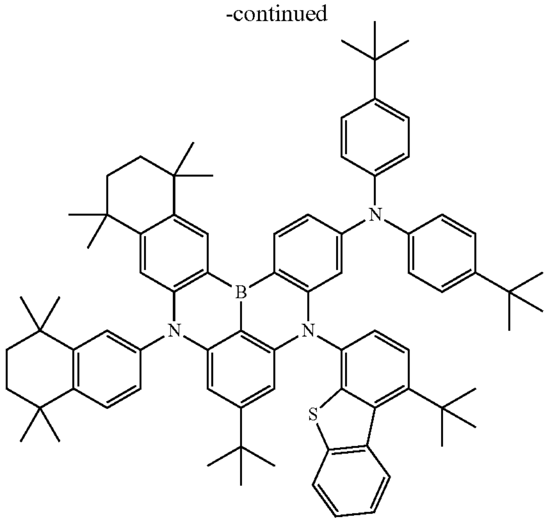
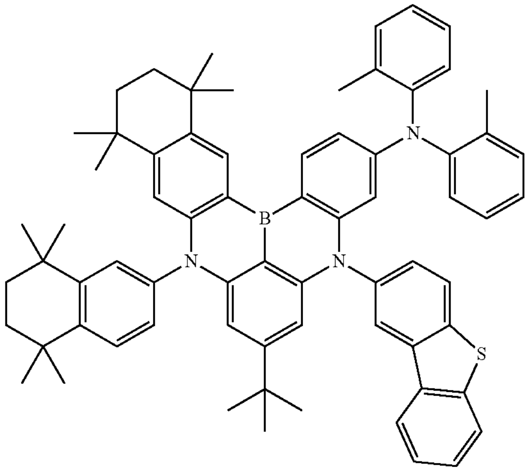
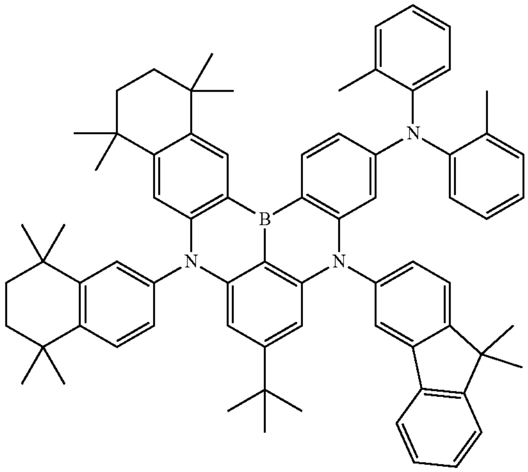

-continued
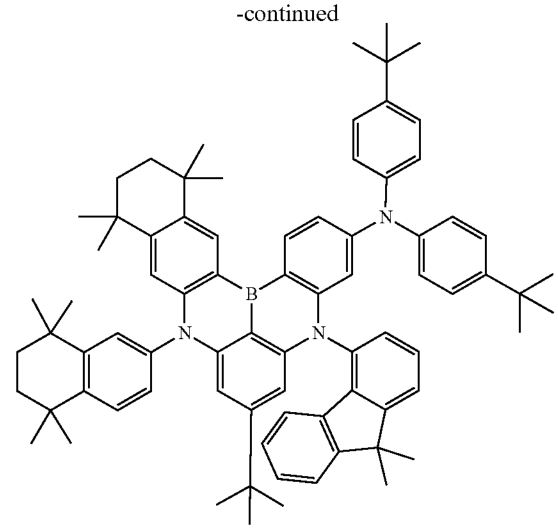
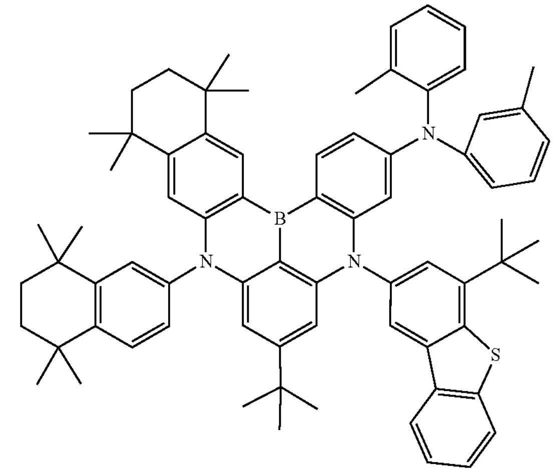
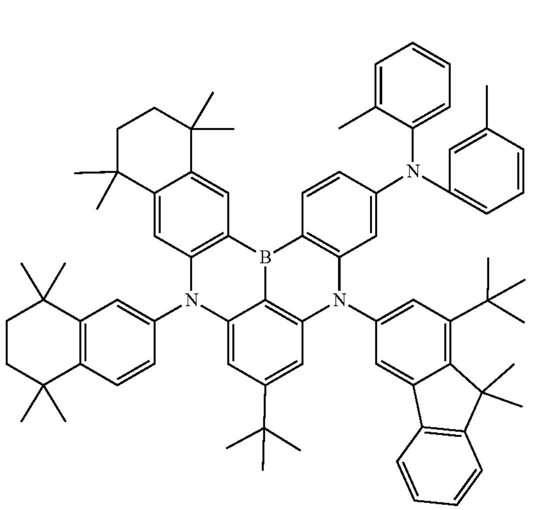
-continued
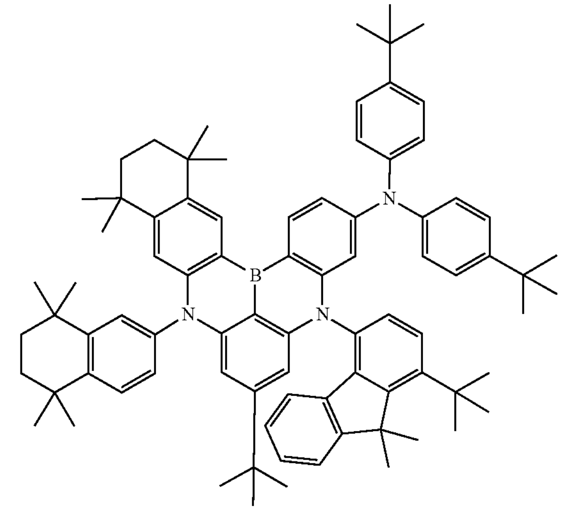
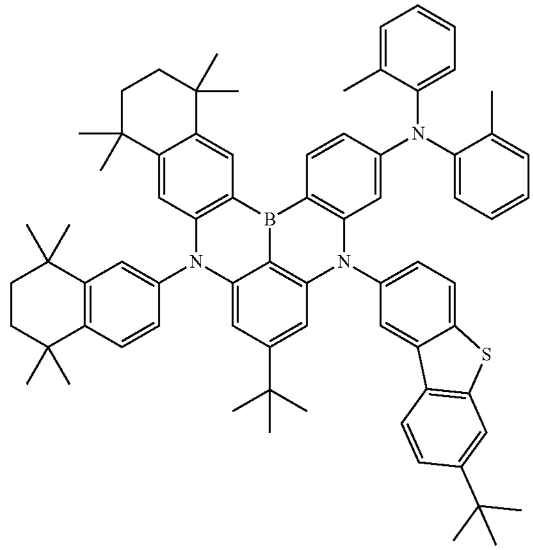
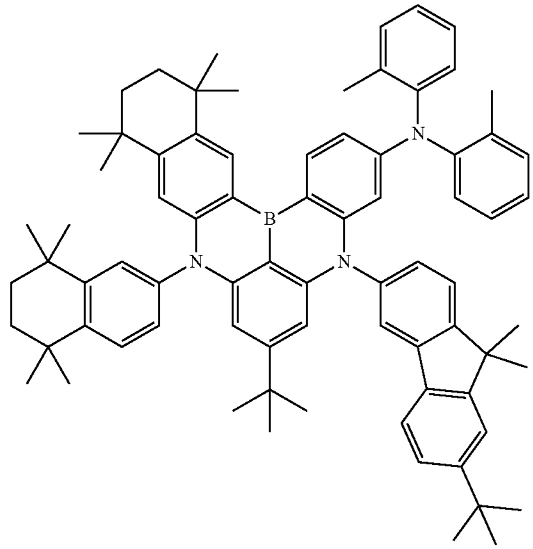

-continued
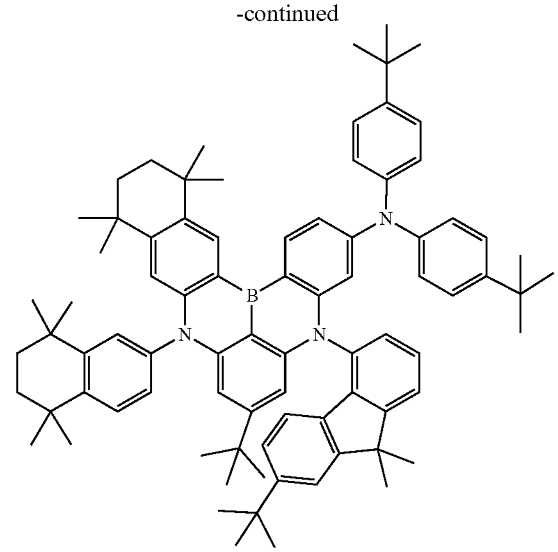
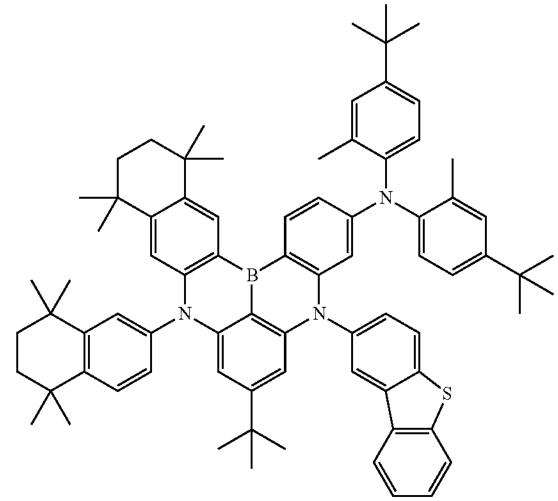
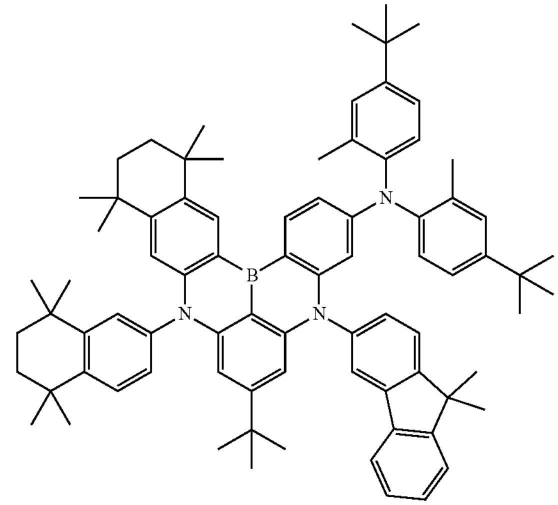
-continued
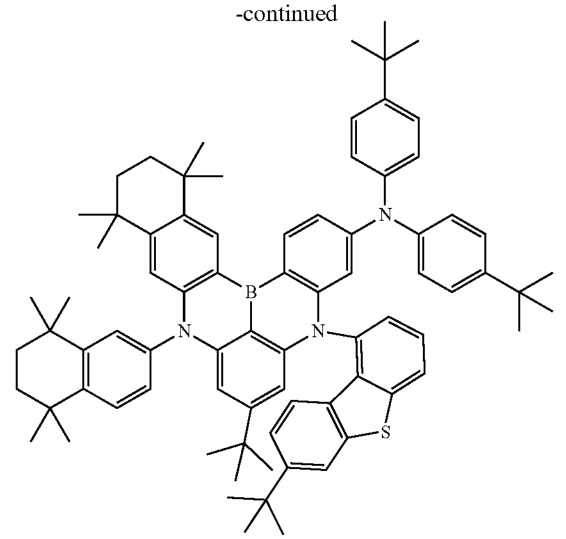
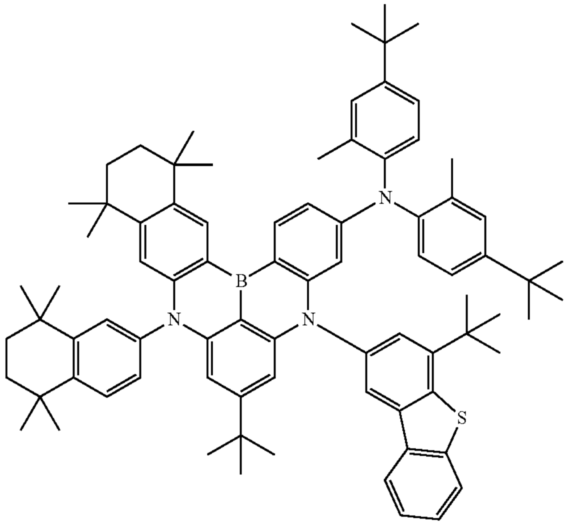
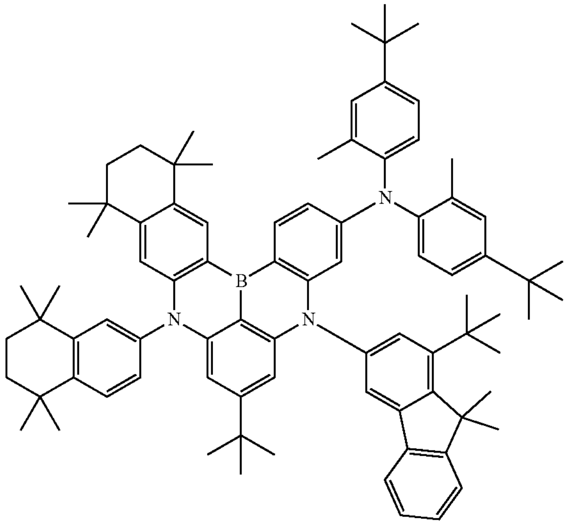

-continued
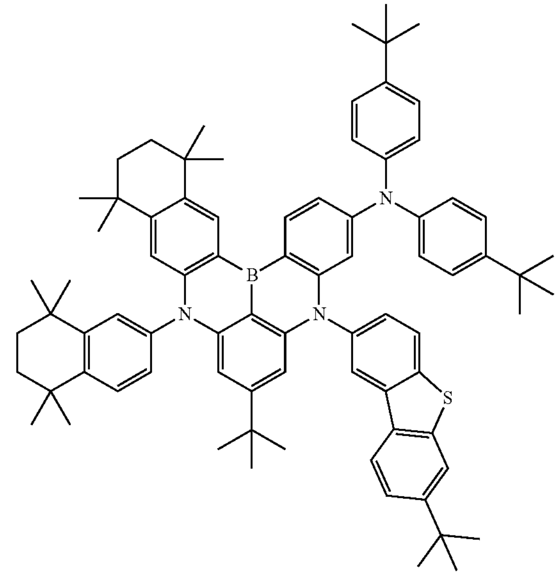
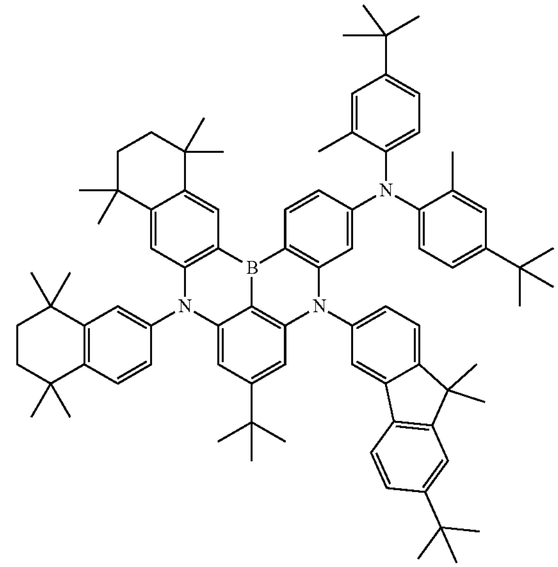
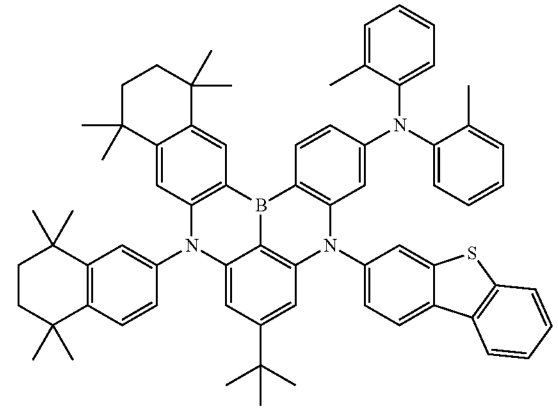
-continued
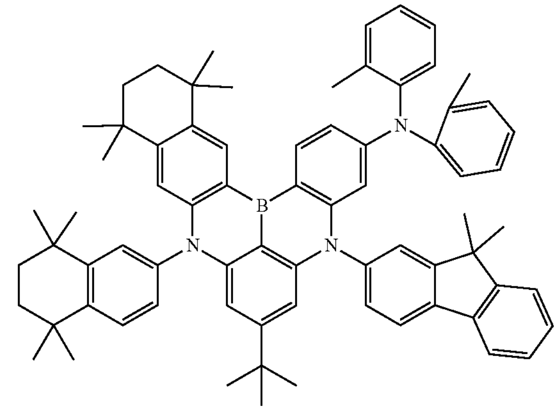
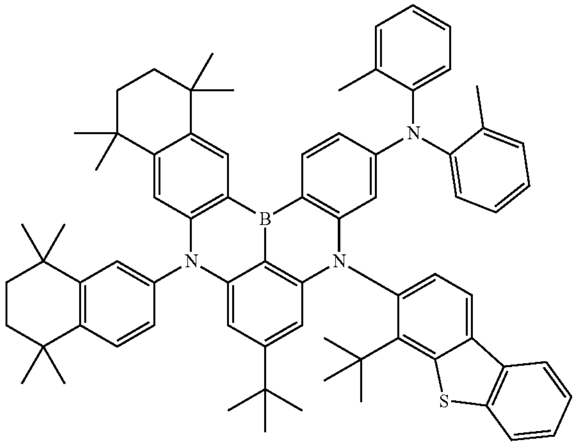
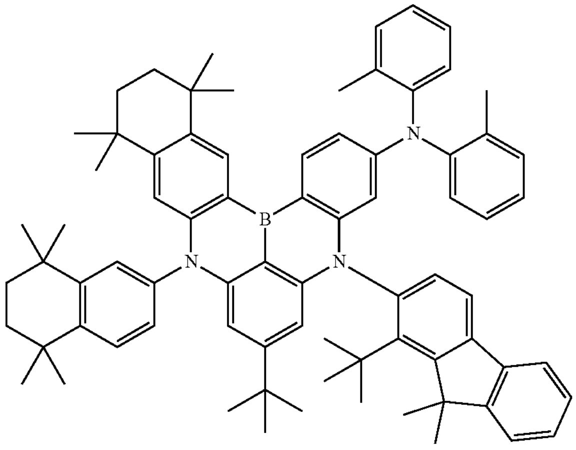
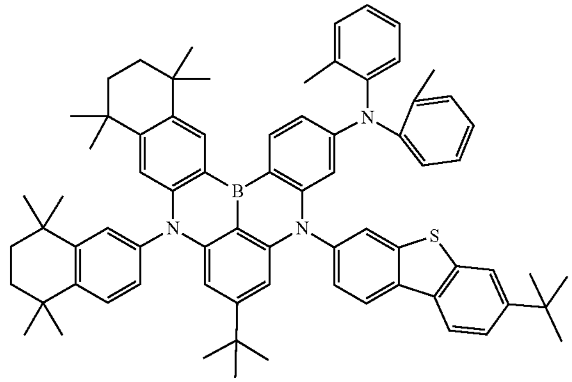

-continued
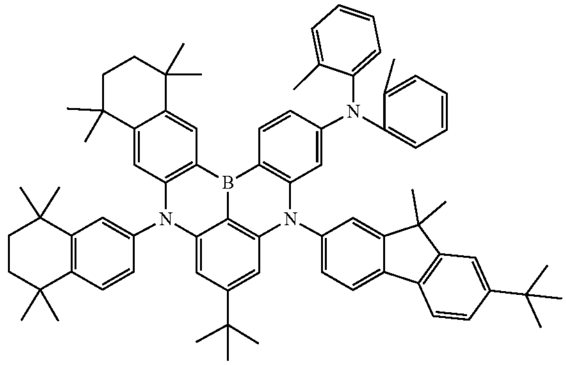
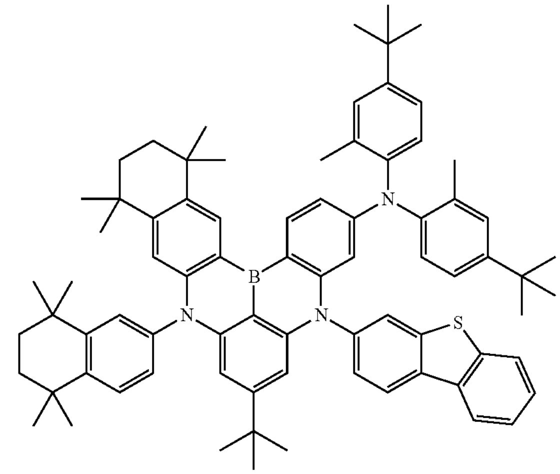
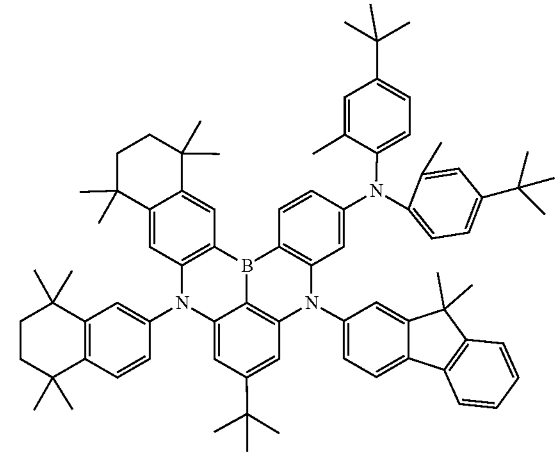
-continued
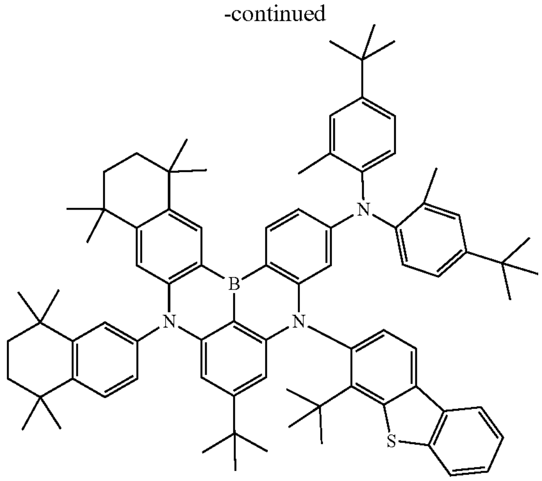
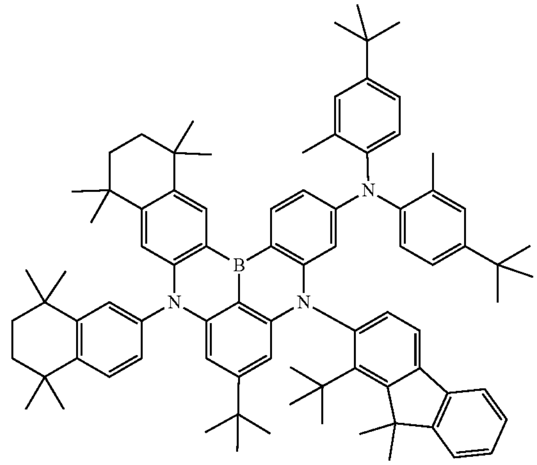
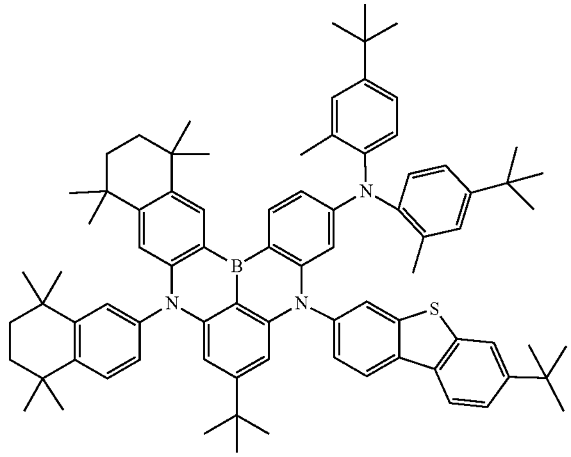

-continued
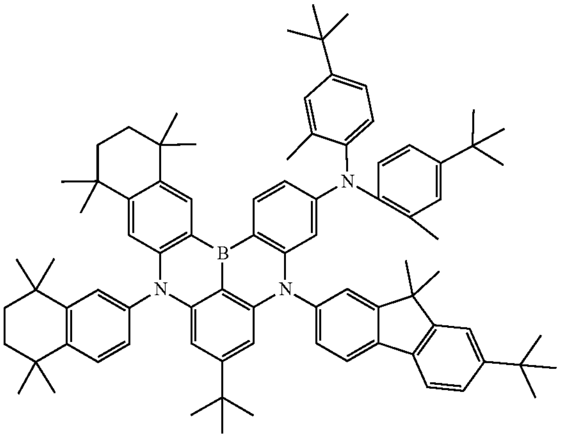
-continued
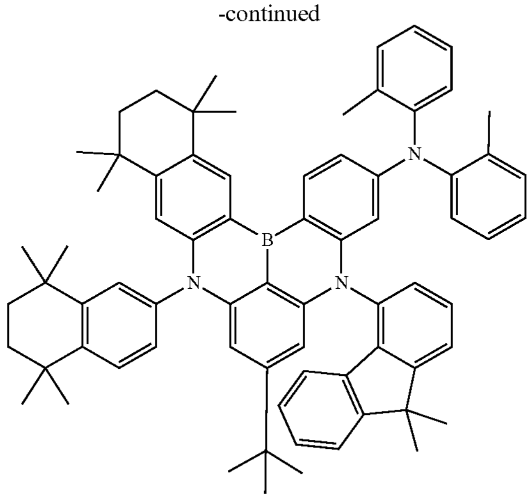
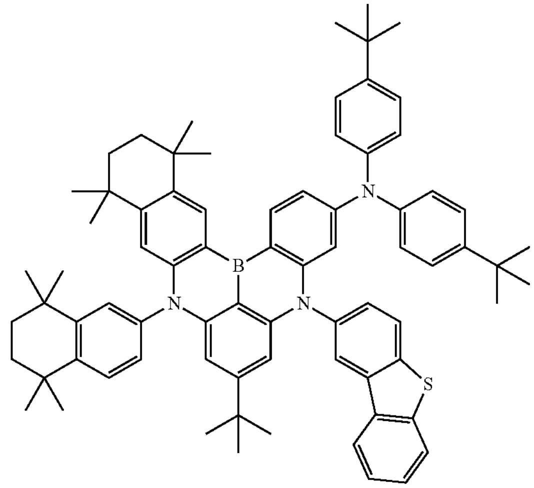
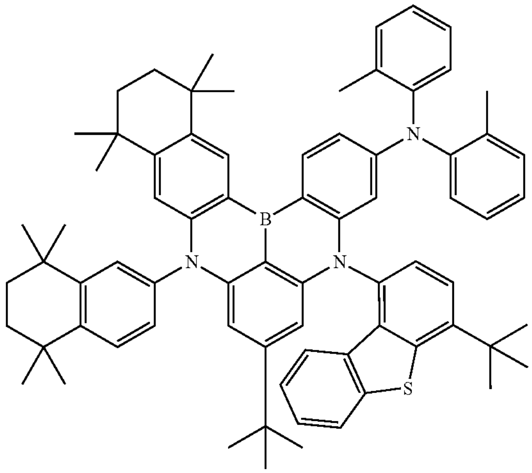
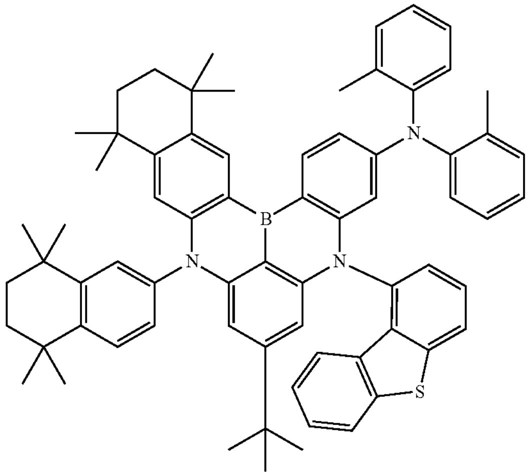
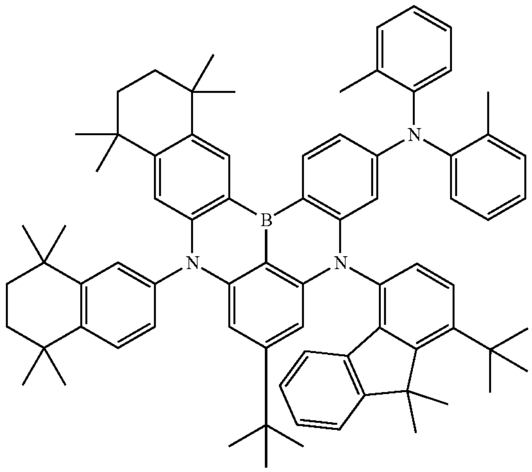

-continued
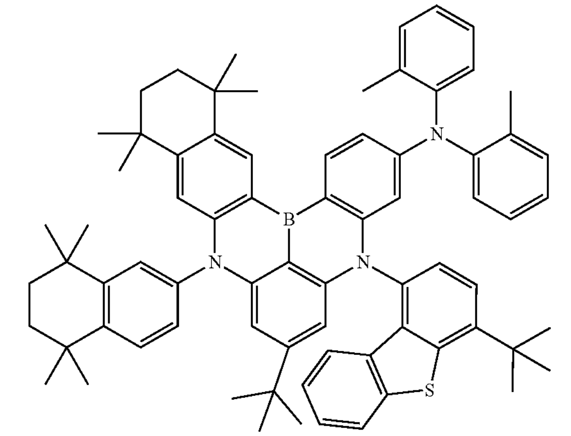
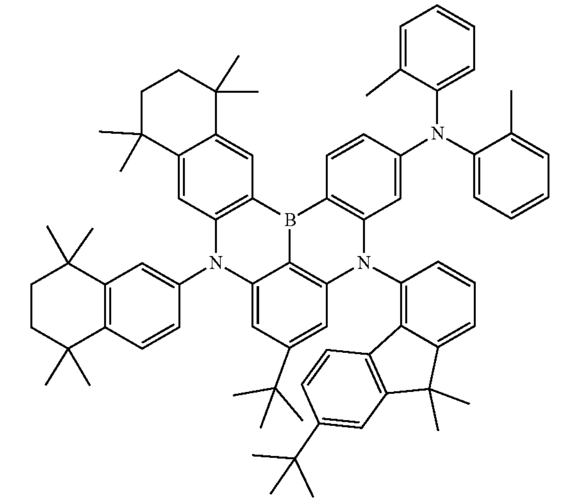
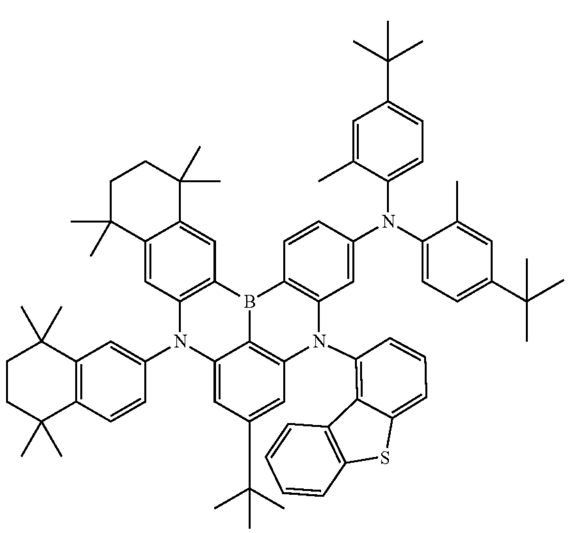
-continued
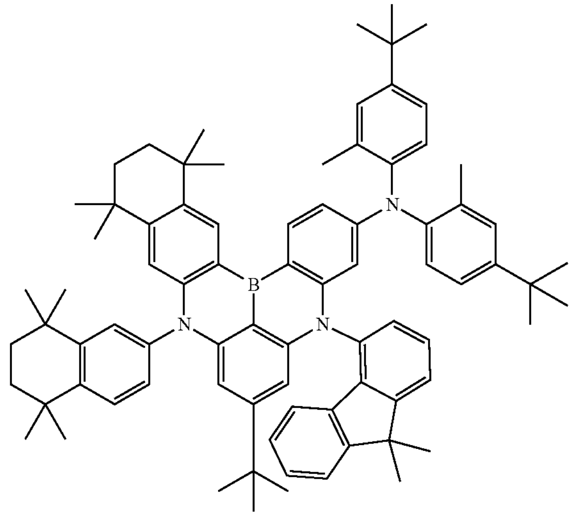
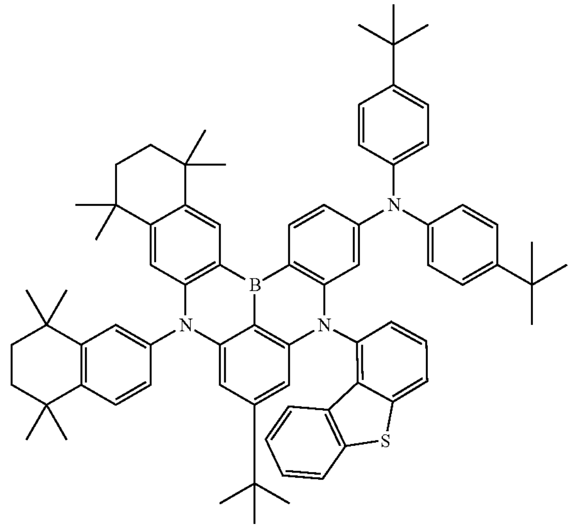
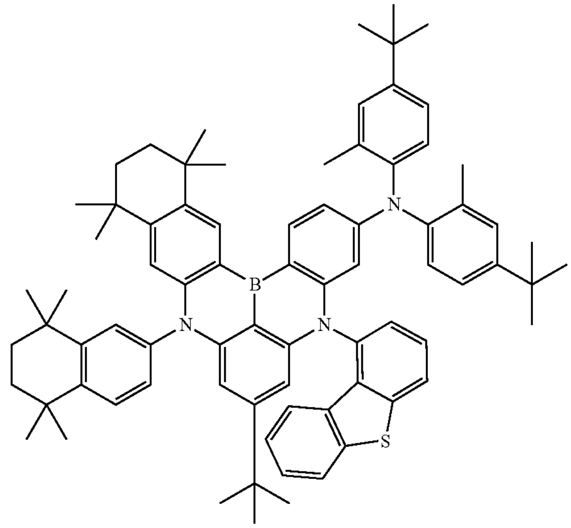

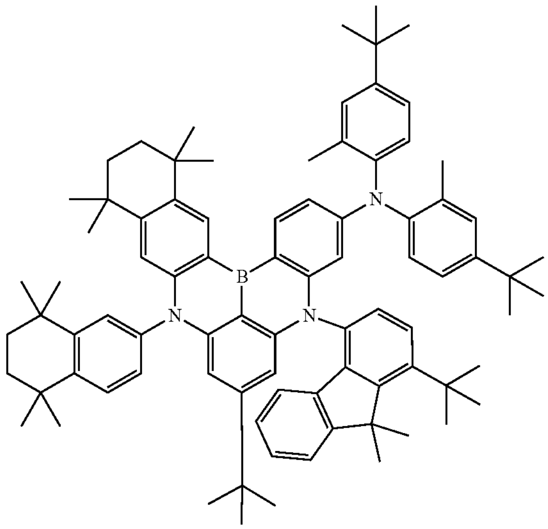
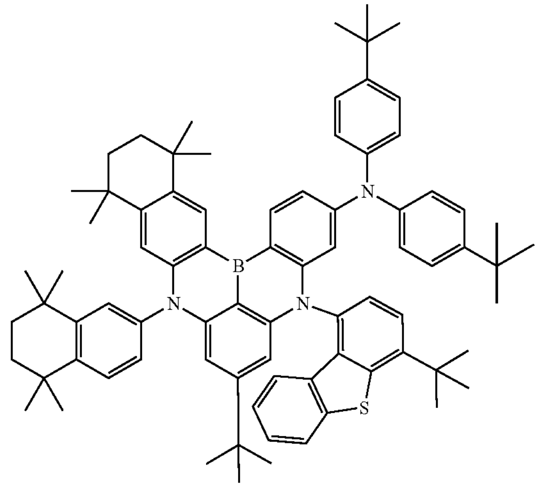
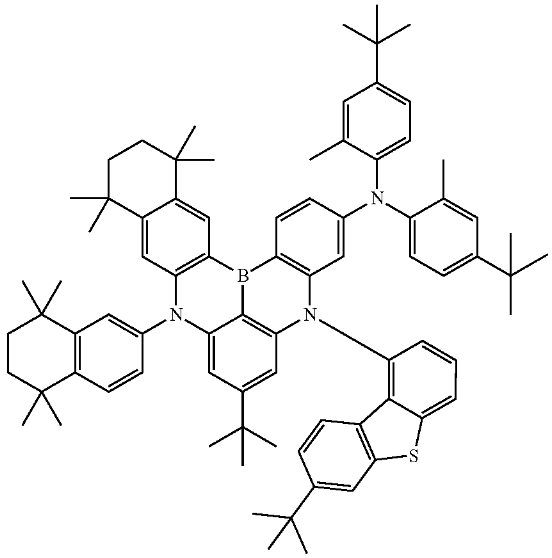
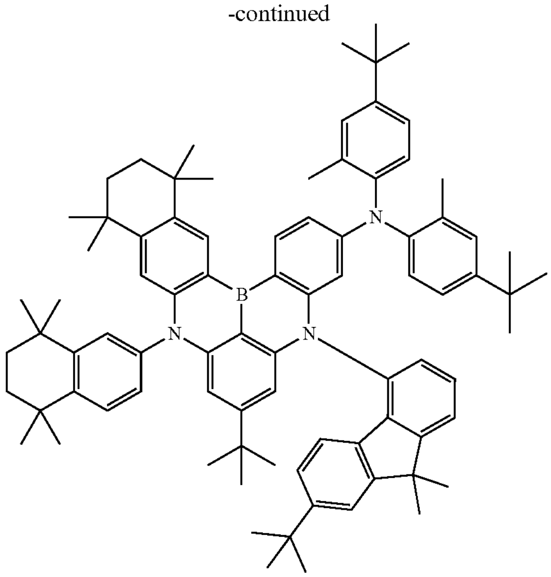
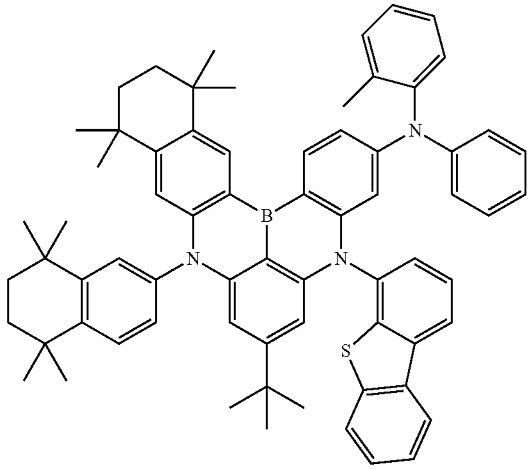
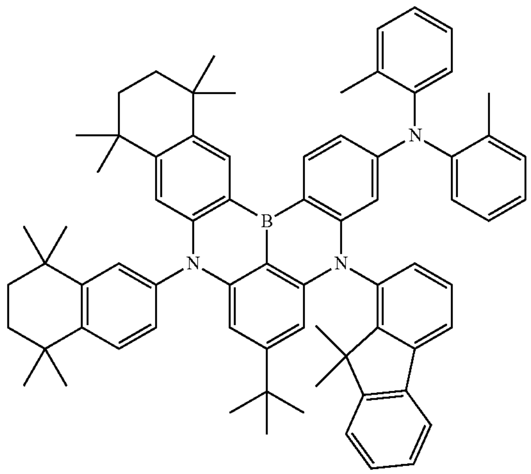

-continued
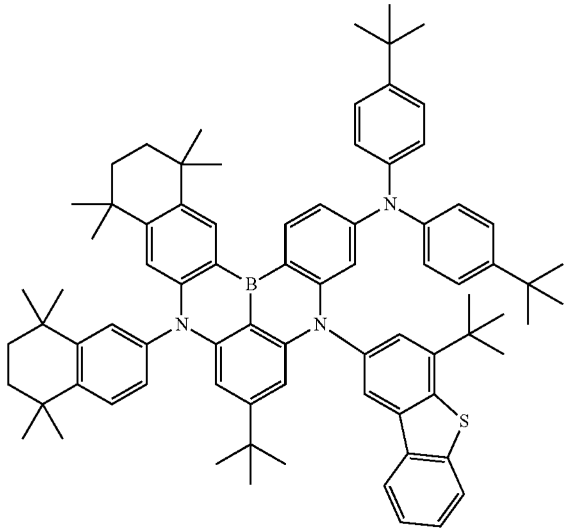
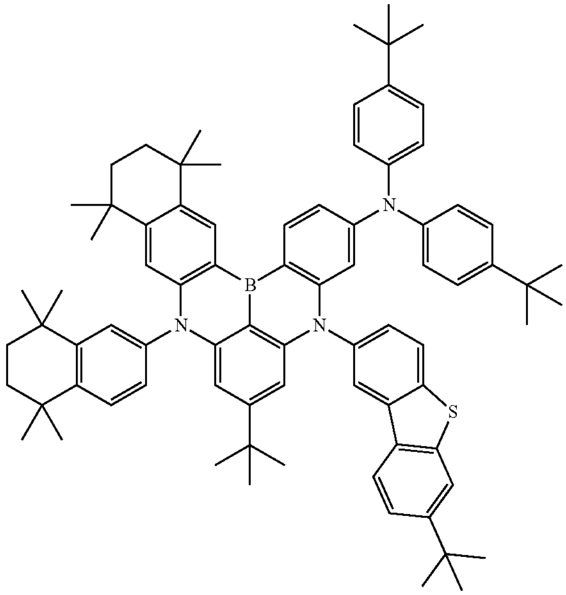
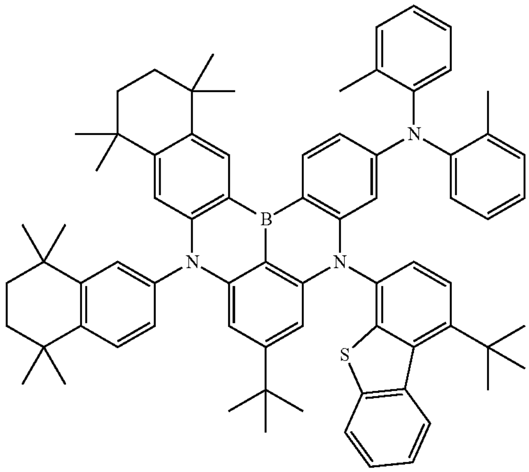
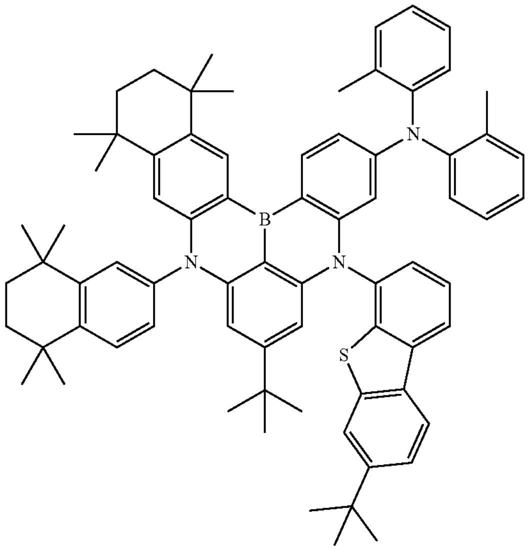
-continued
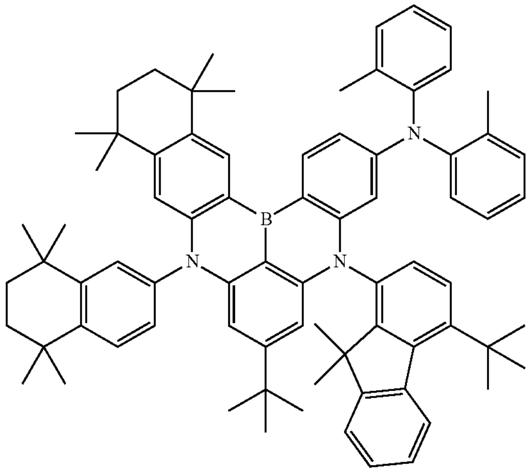
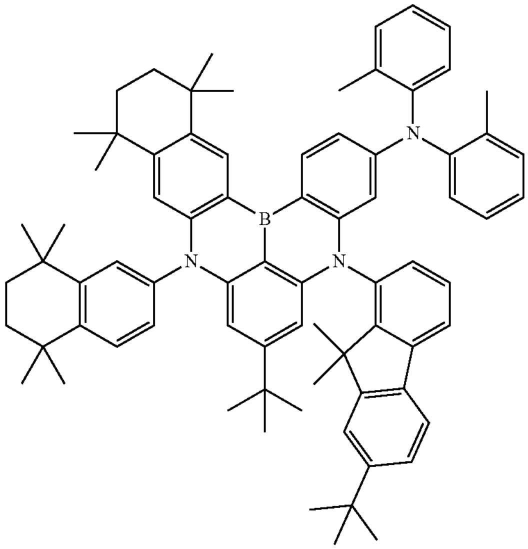

-continued
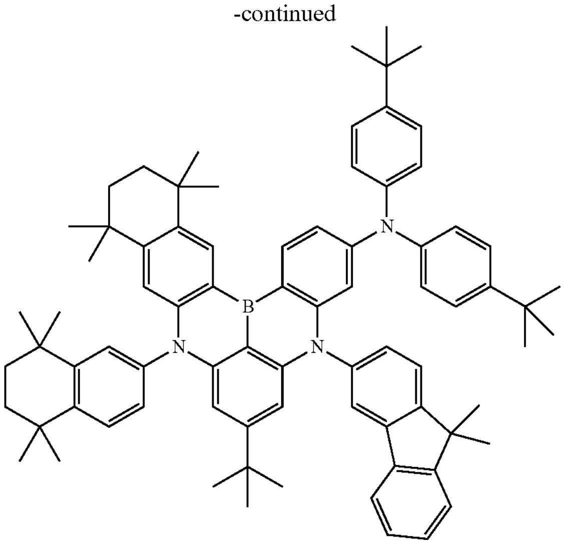
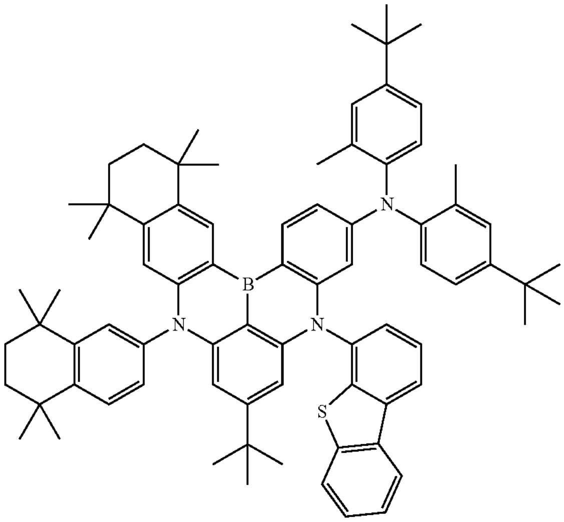
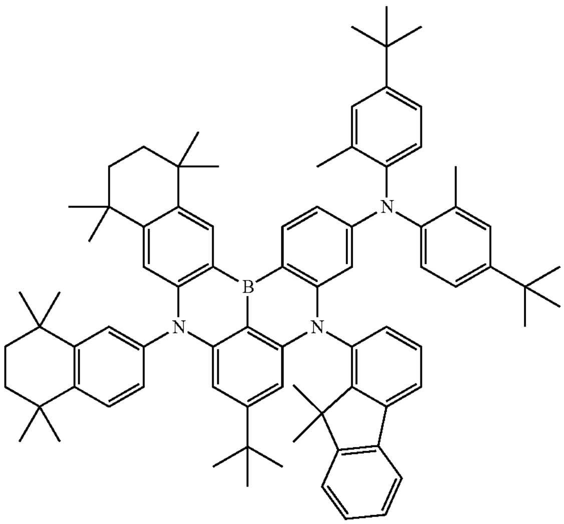
-continued
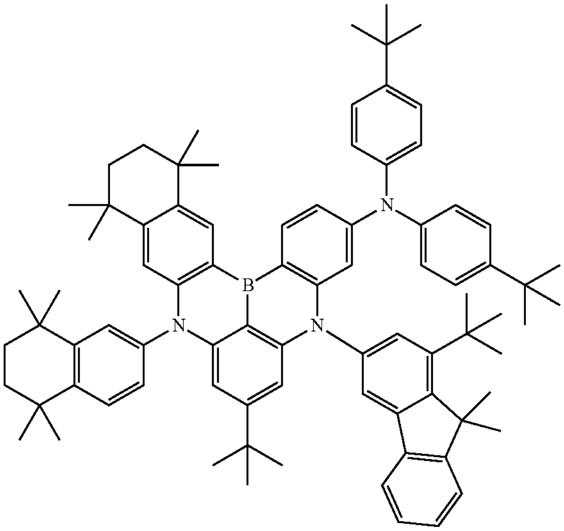
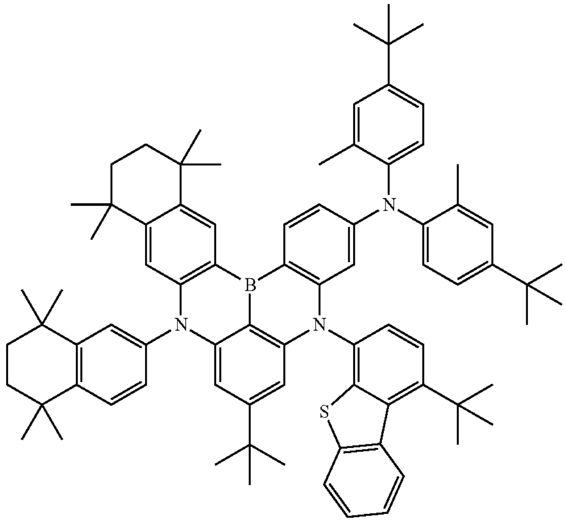
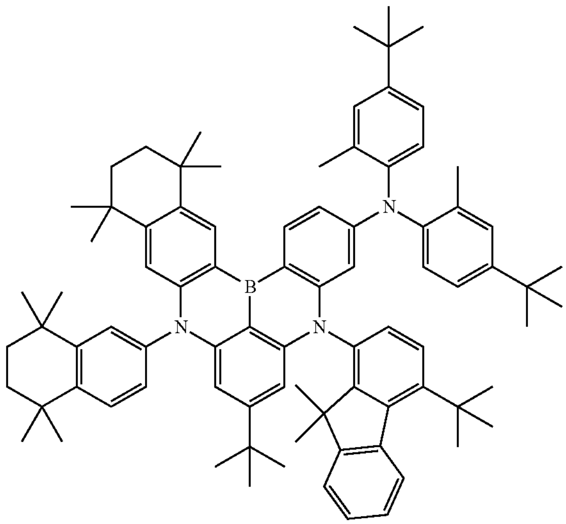

-continued
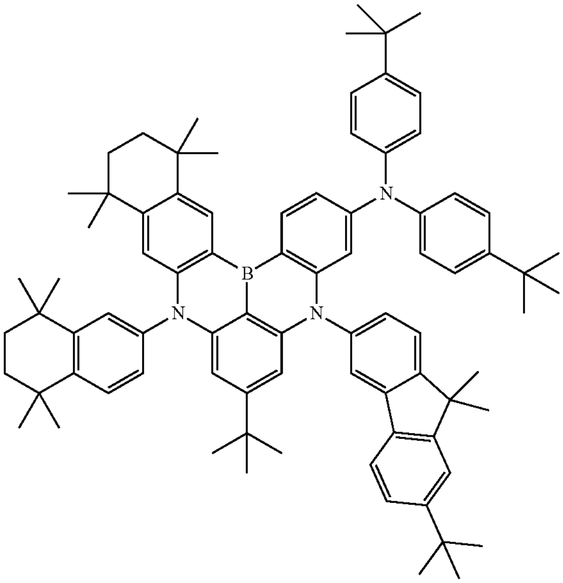
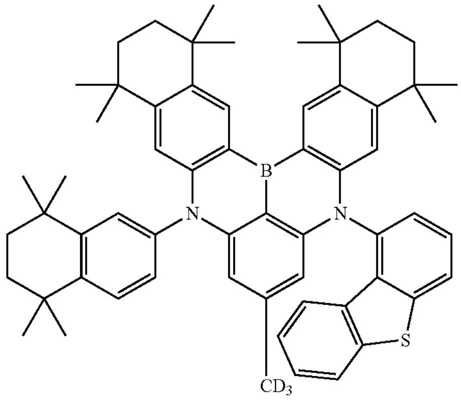
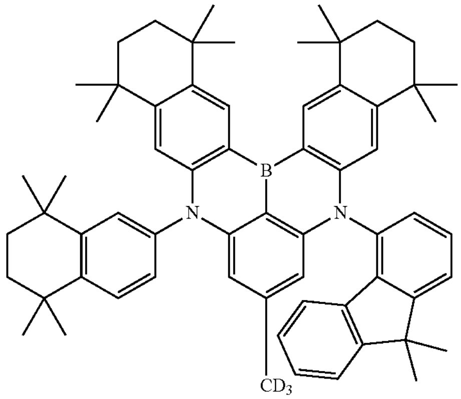
-continued
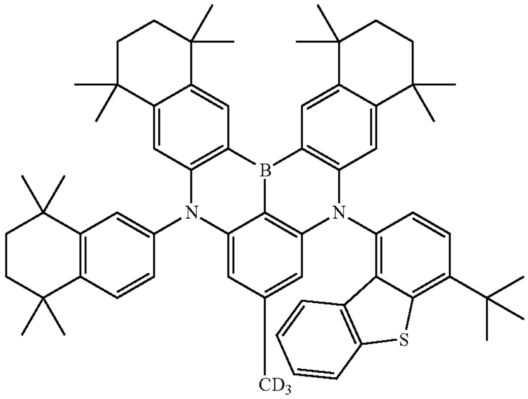
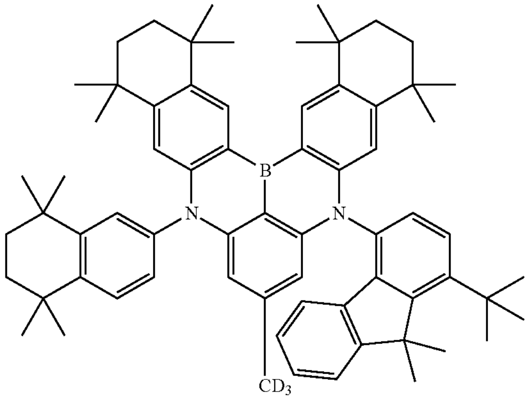
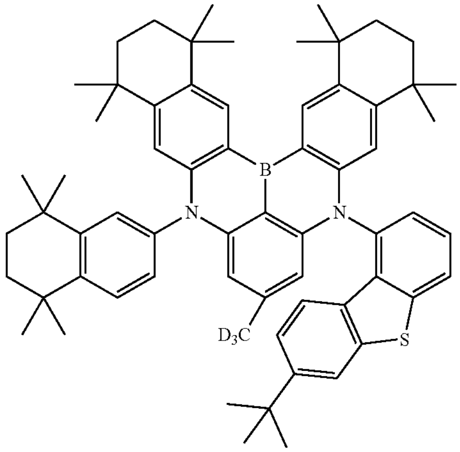
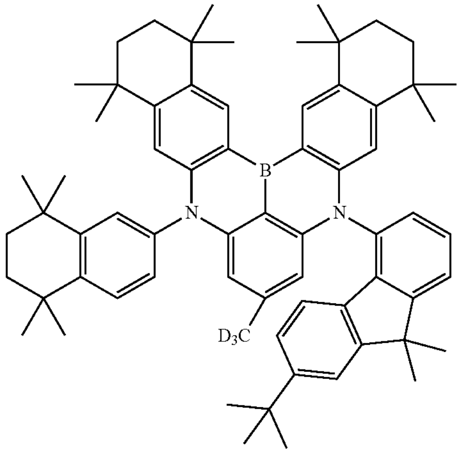

-continued
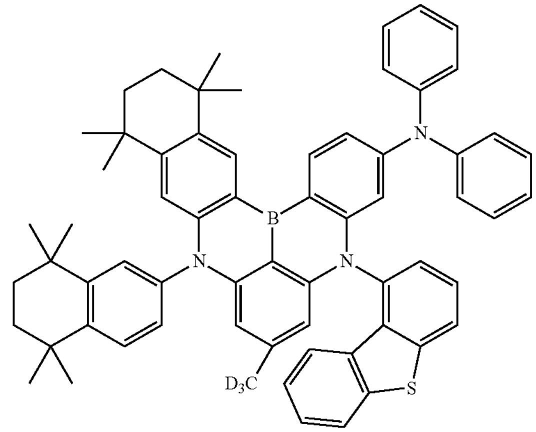
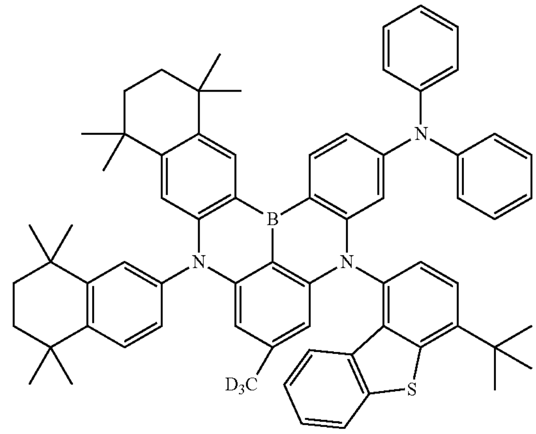
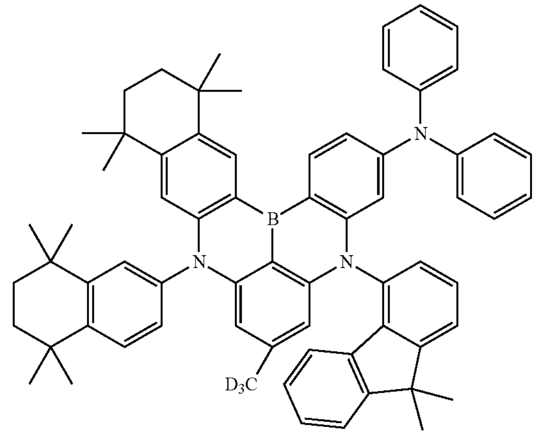
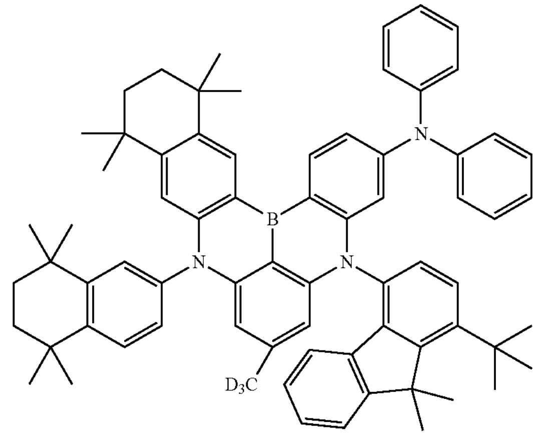
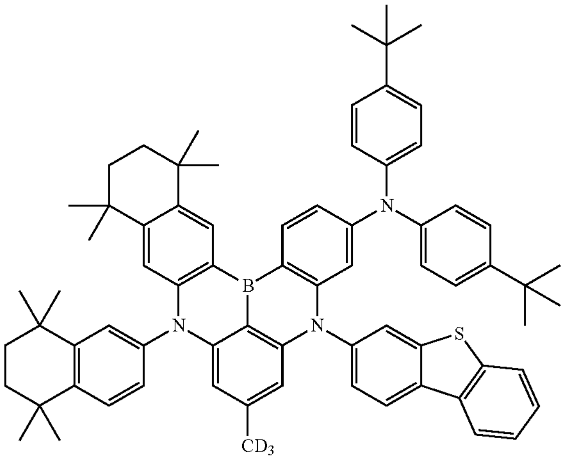
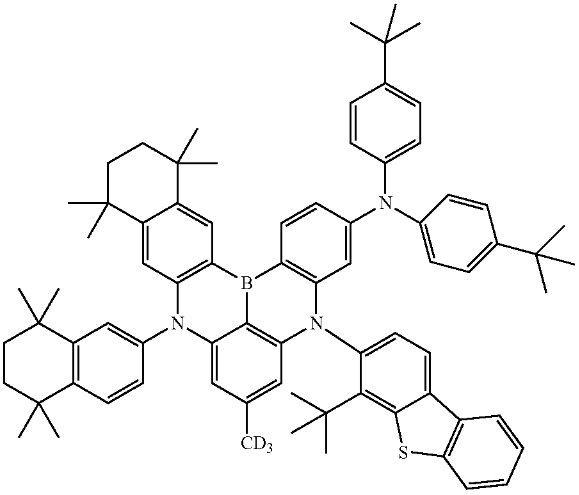
-continued -continued
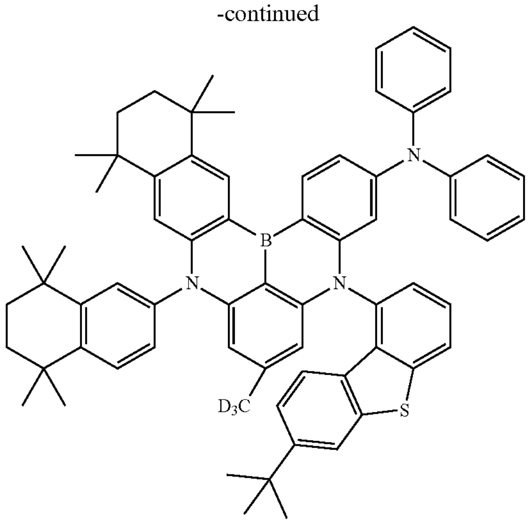
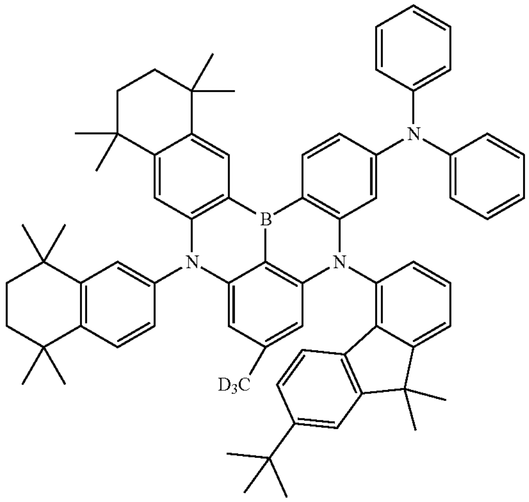
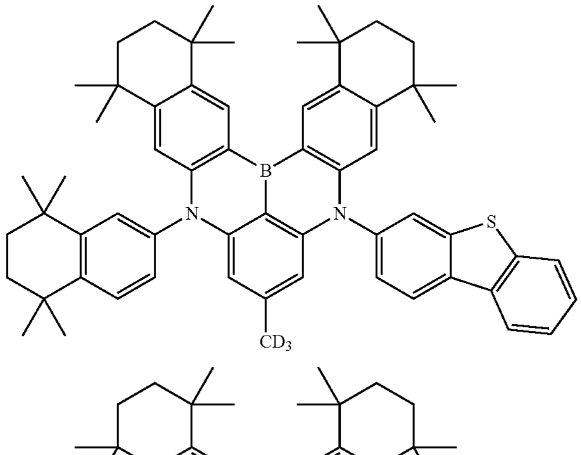
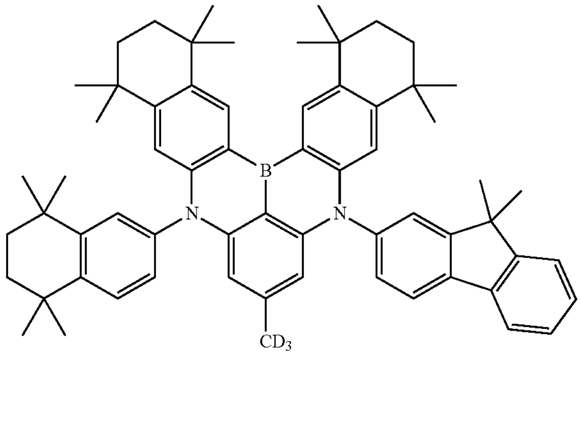
-continued
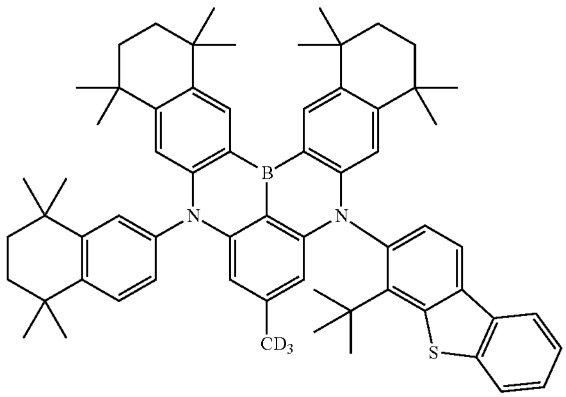
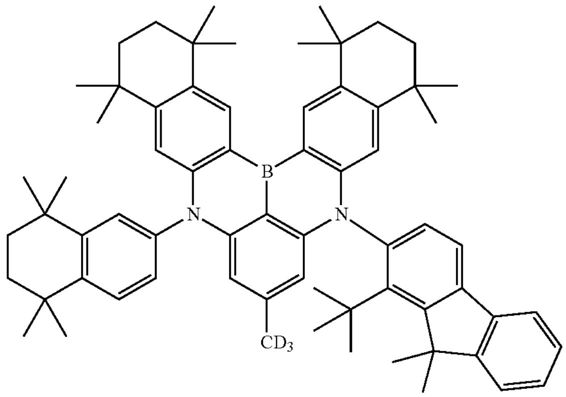
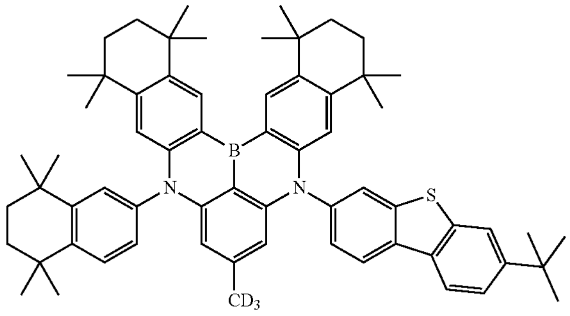
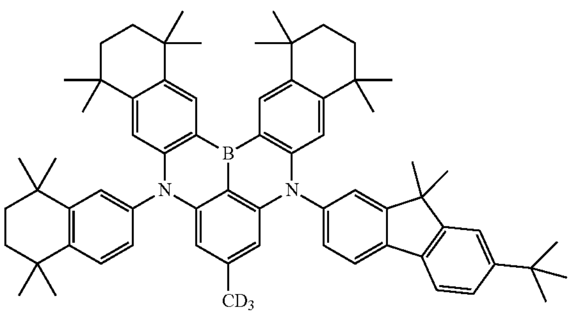

-continued
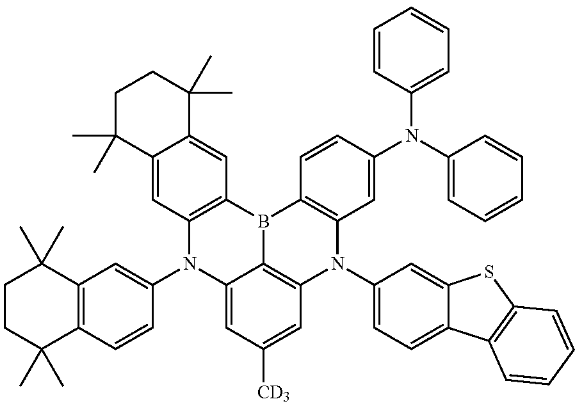
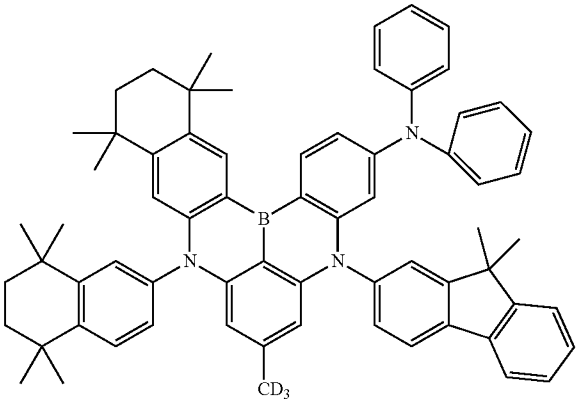
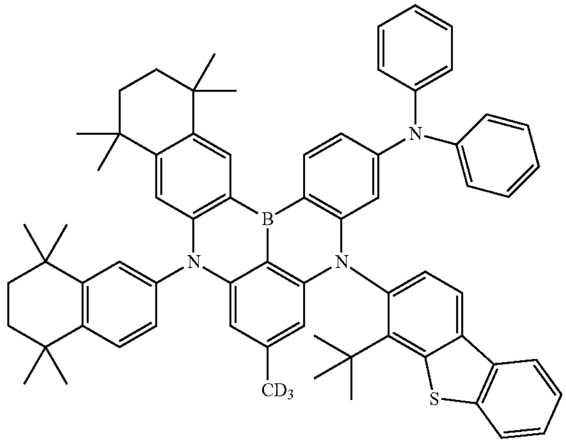
-continued
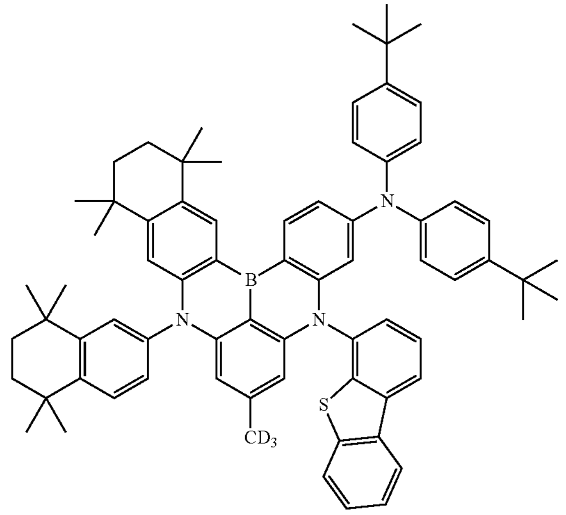
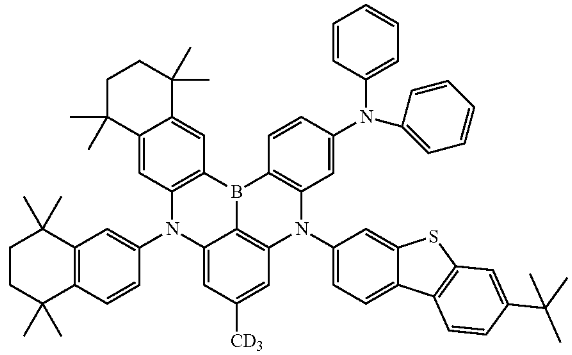
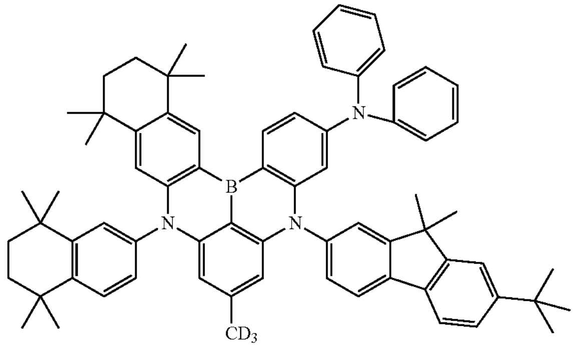
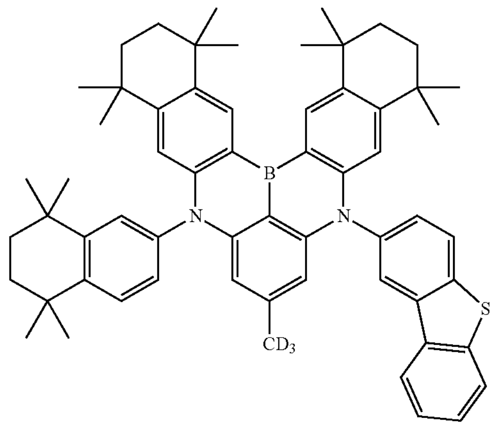

-continued
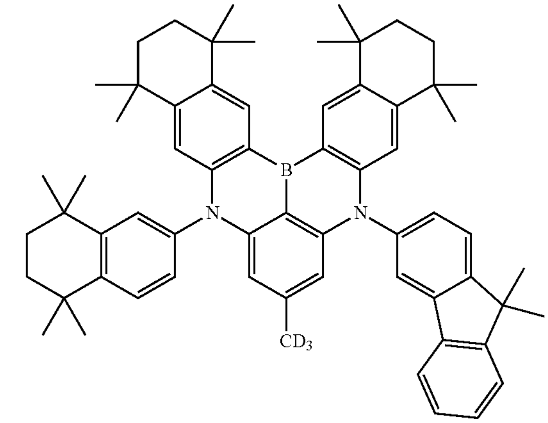
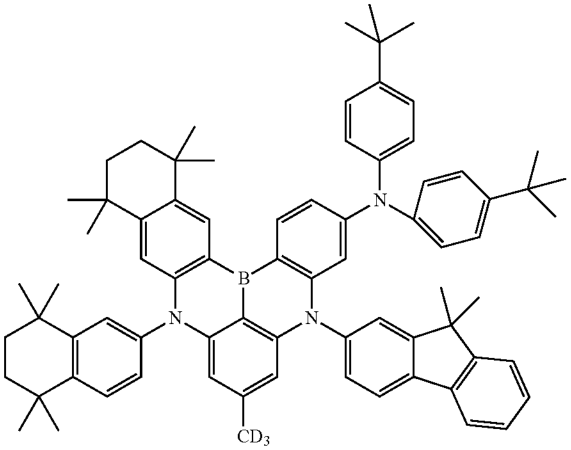
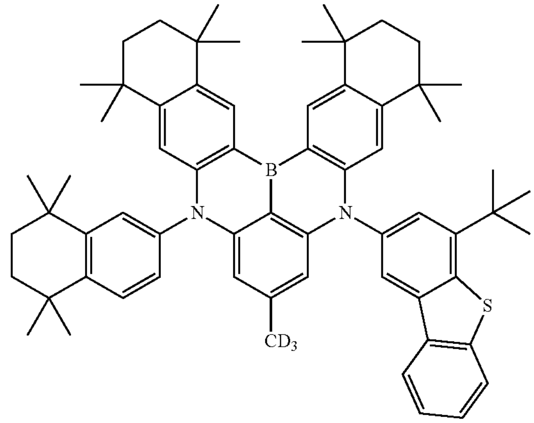
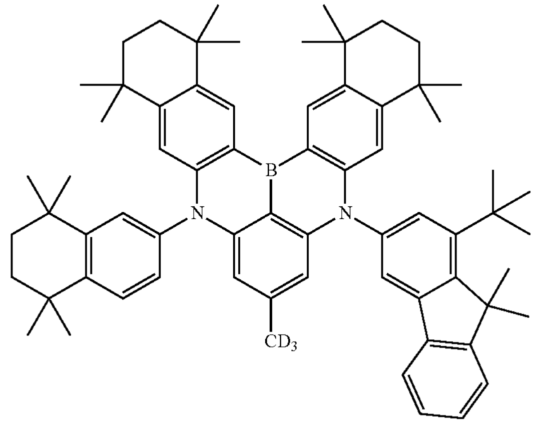
-continued
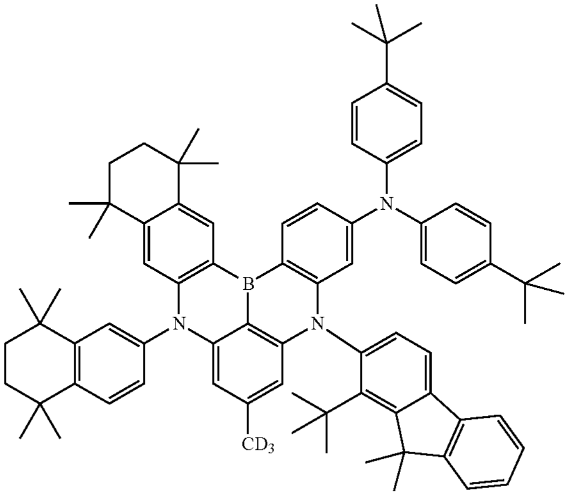
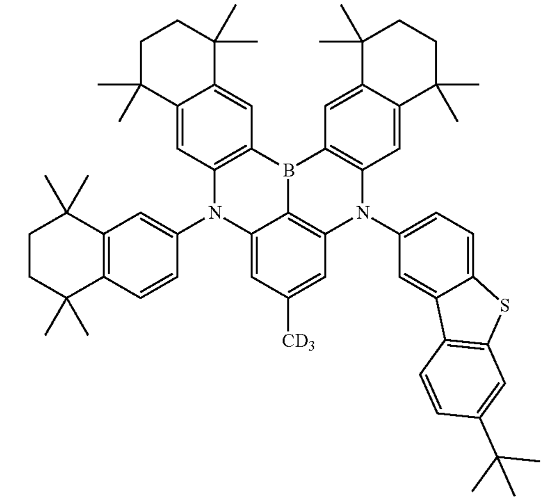
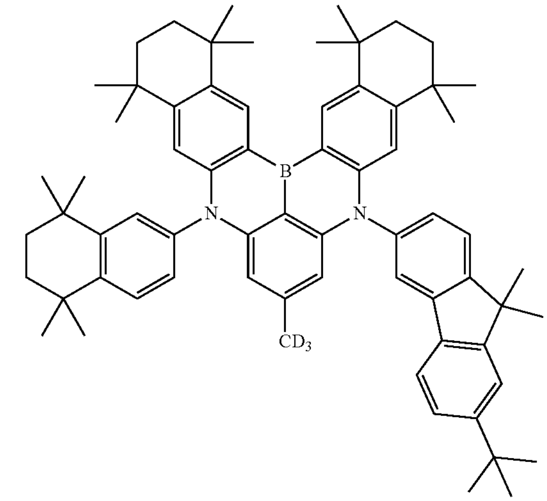

-continued
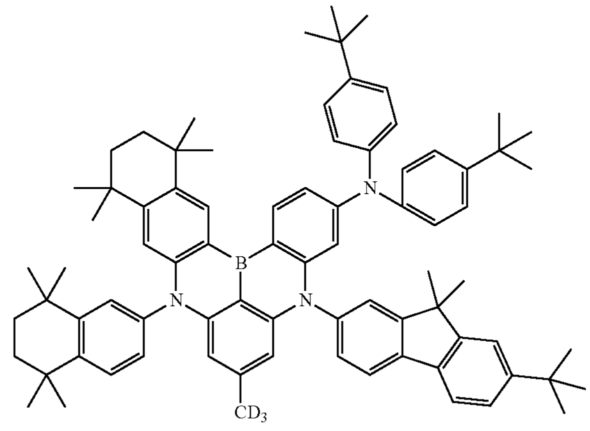
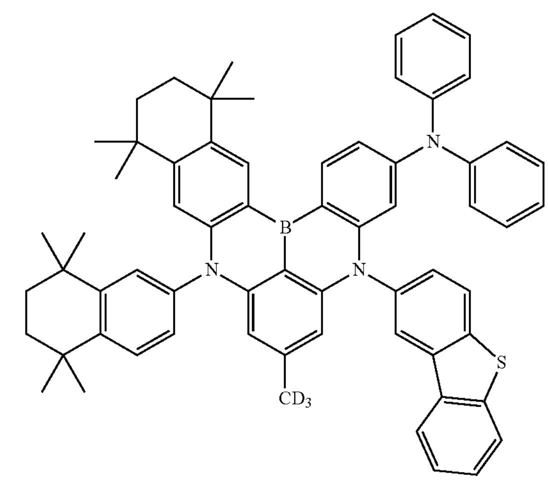
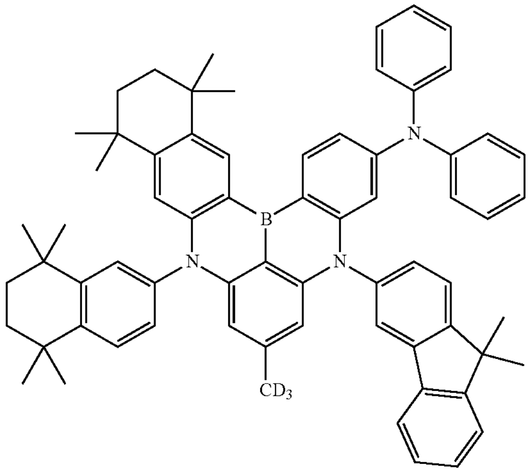
-continued
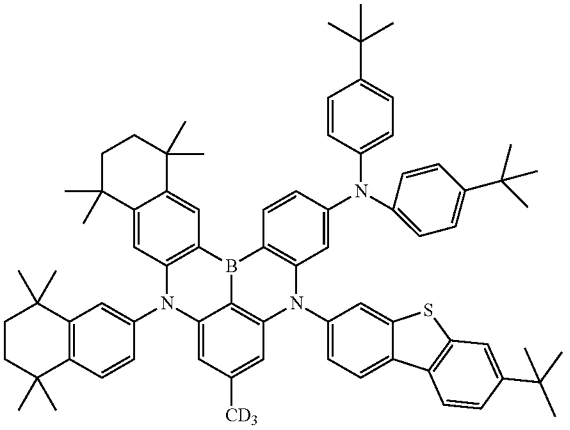
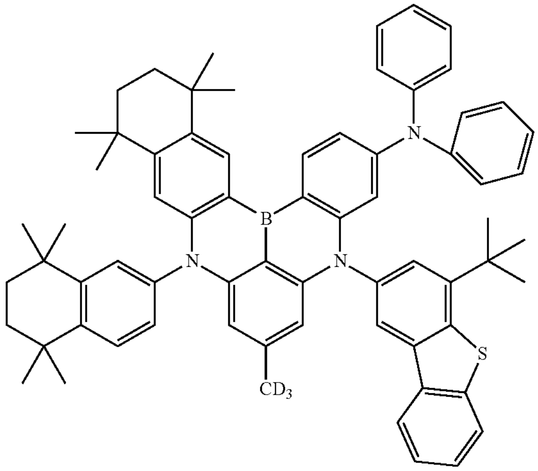
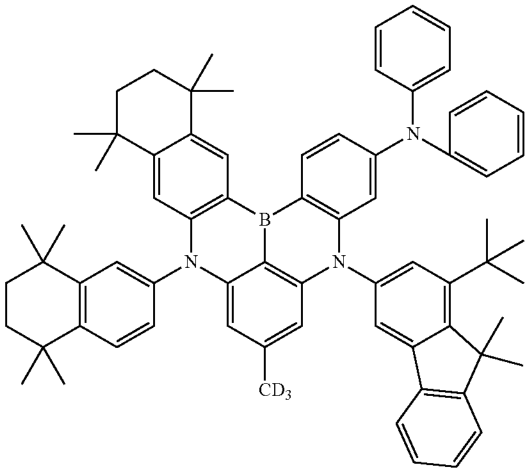

-continued
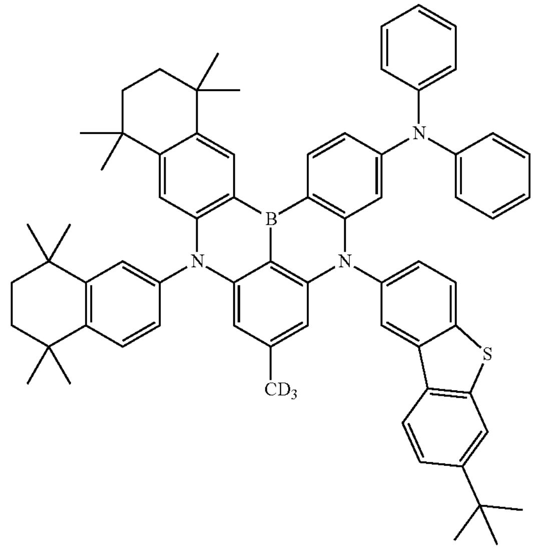
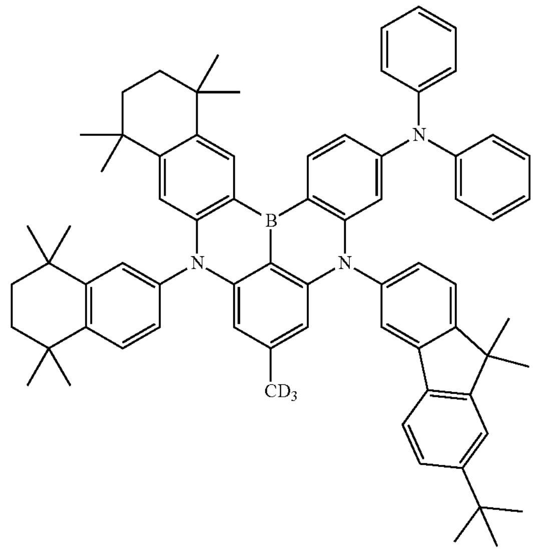
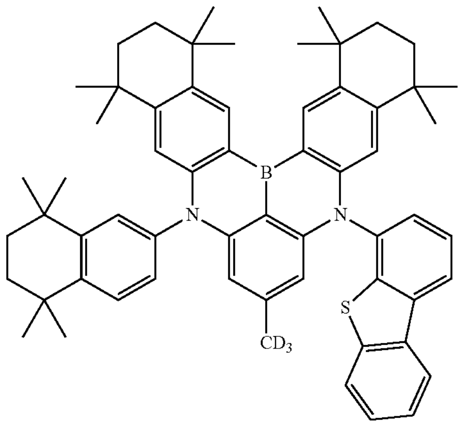
-continued
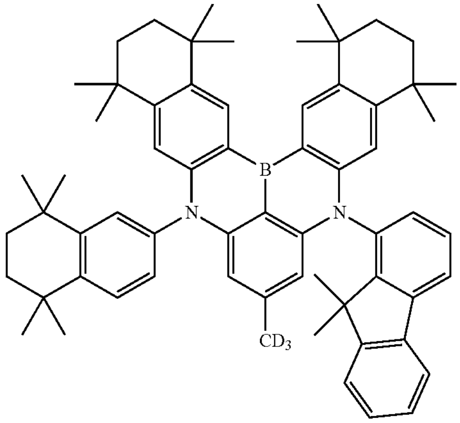
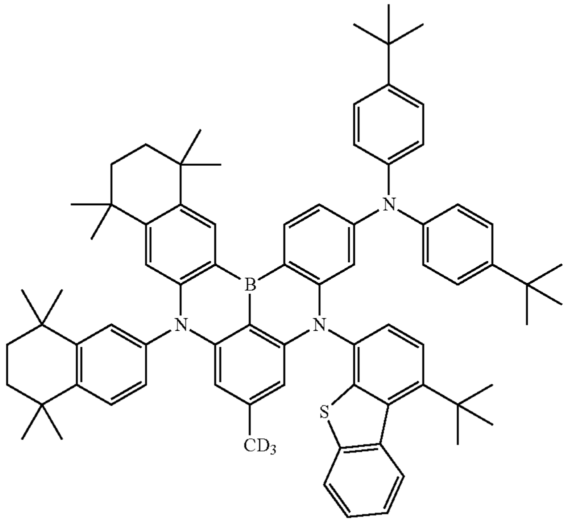
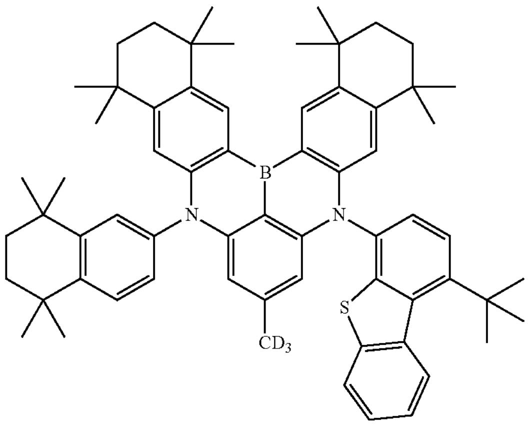

-continued
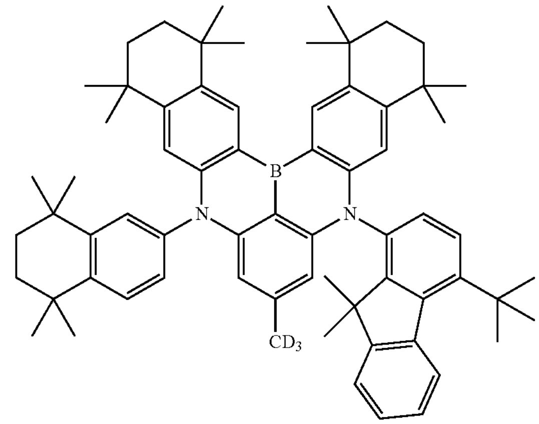
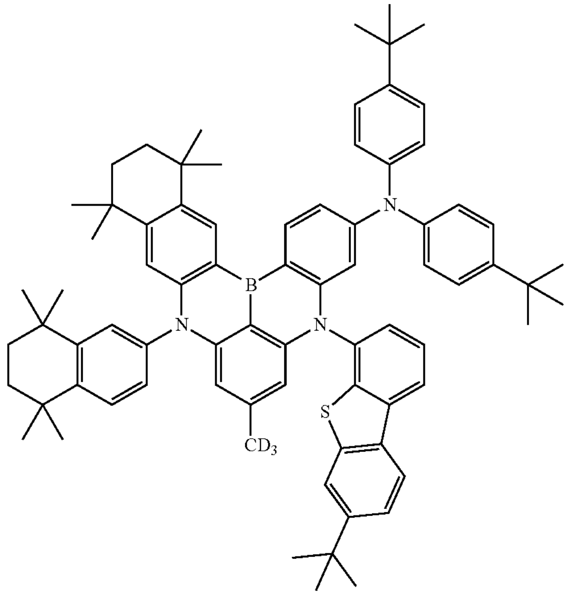
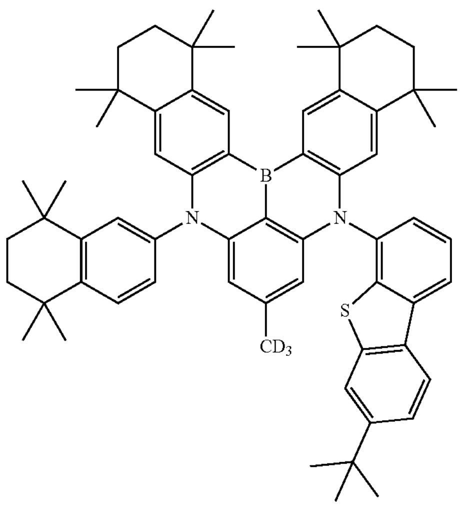
-continued
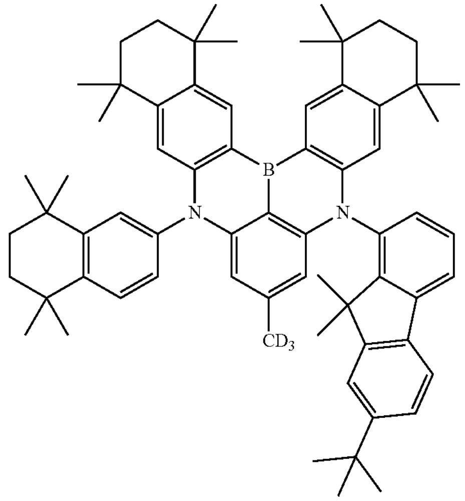
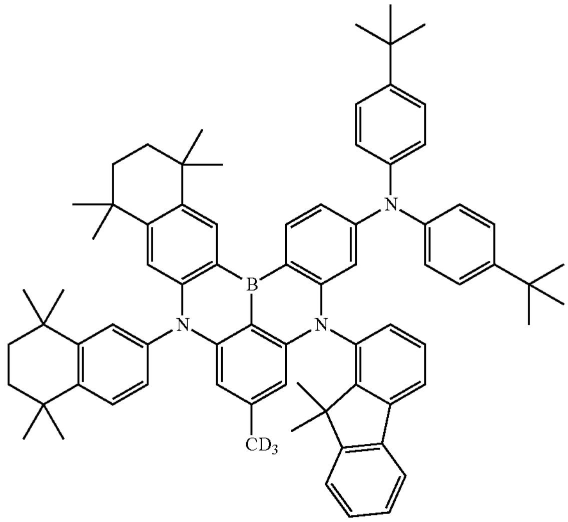
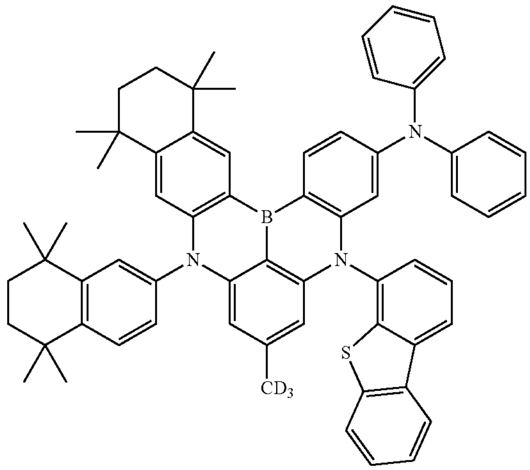

-continued
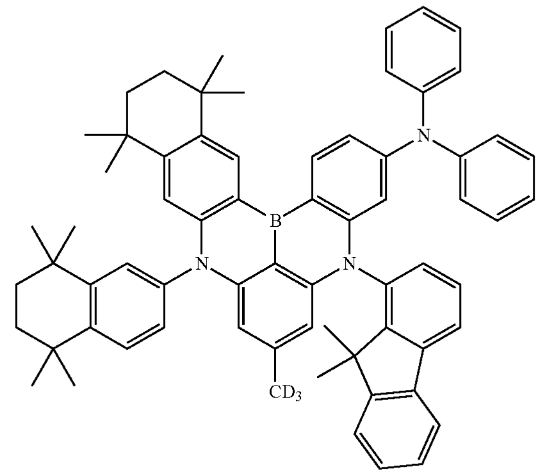
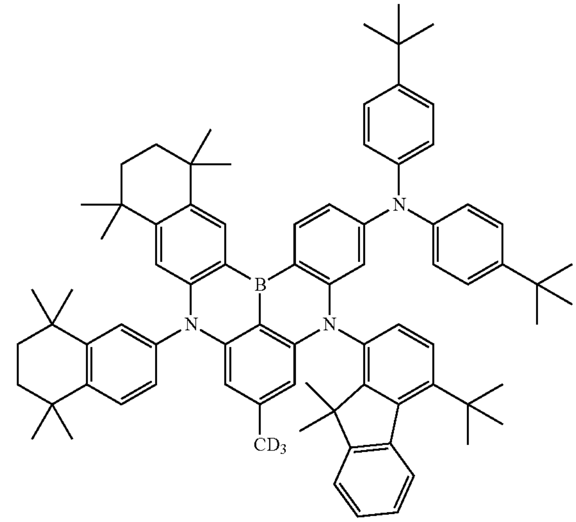
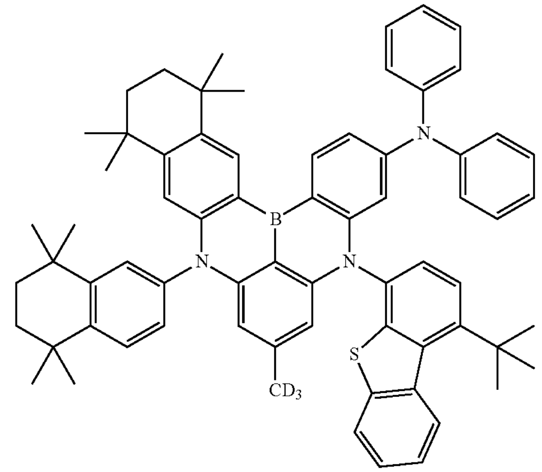
-continued
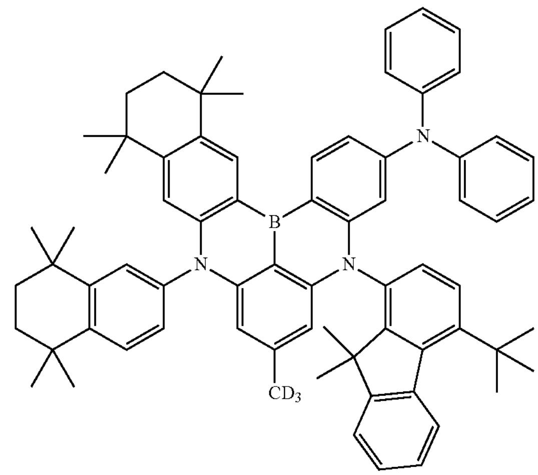
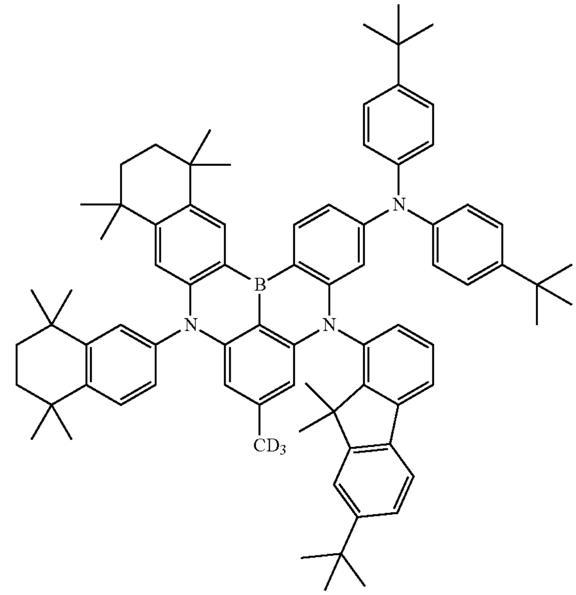
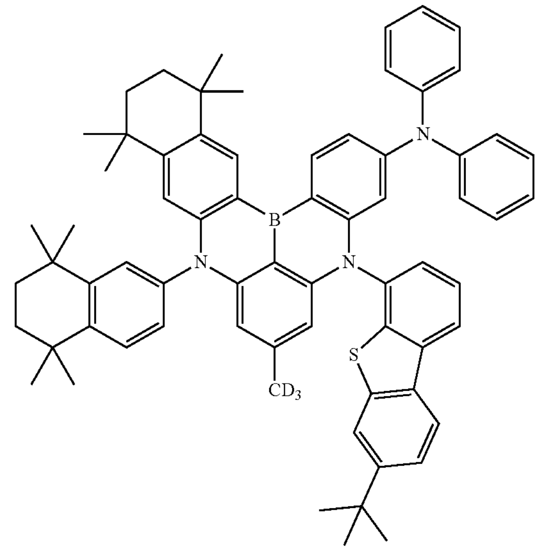

-continued
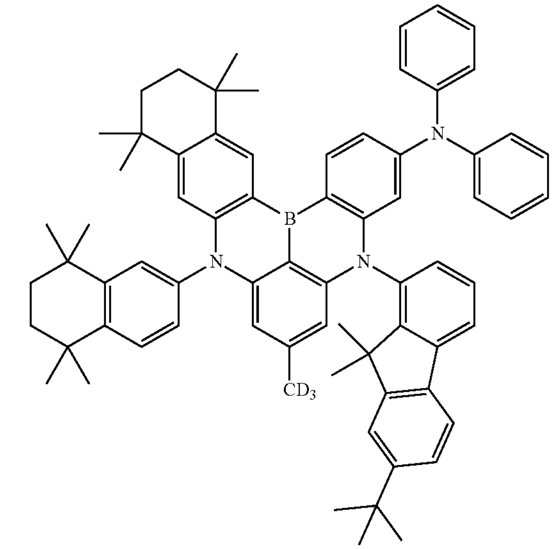
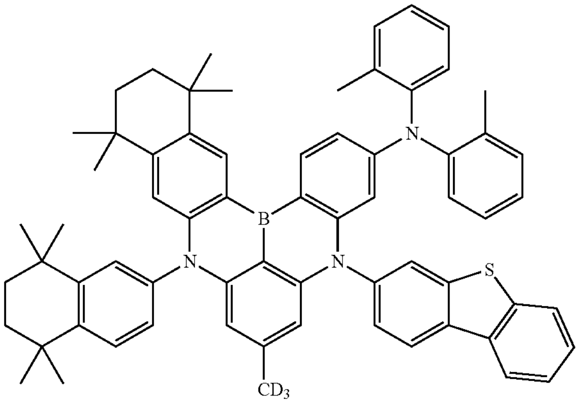
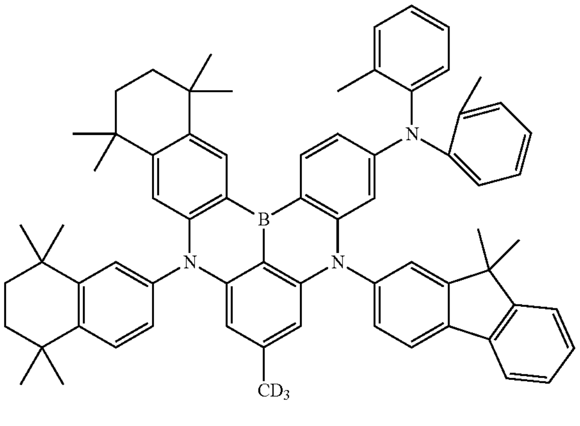
-continued
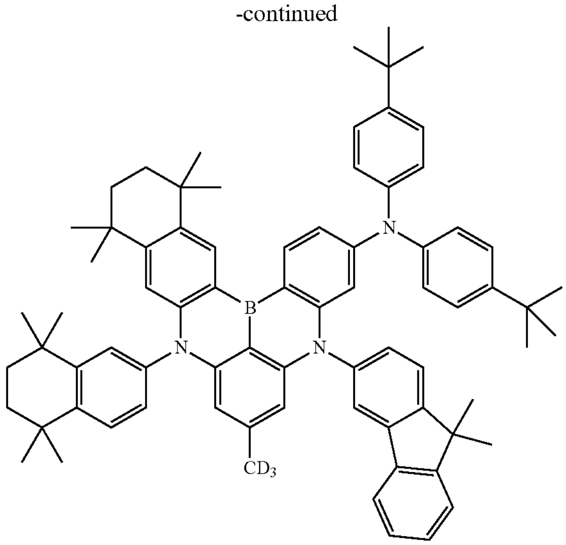
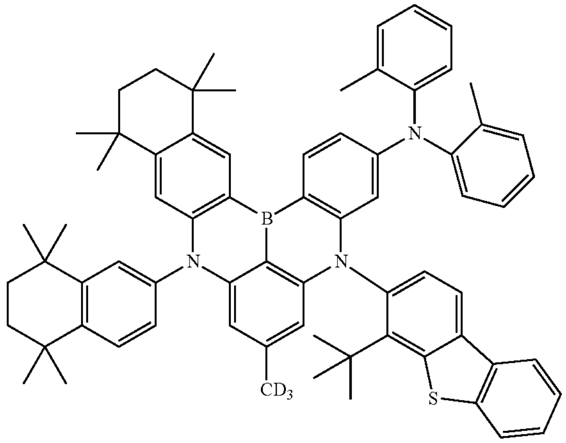
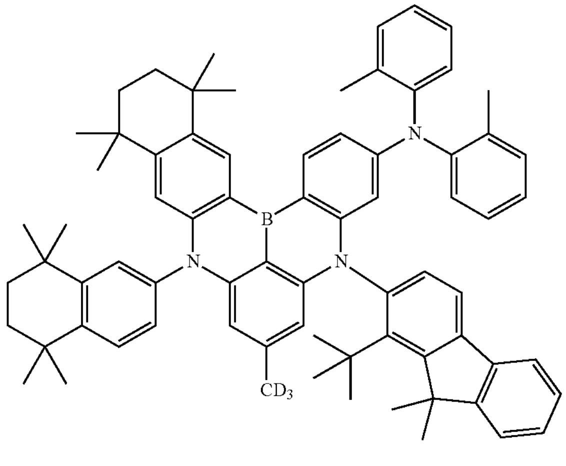

-continued
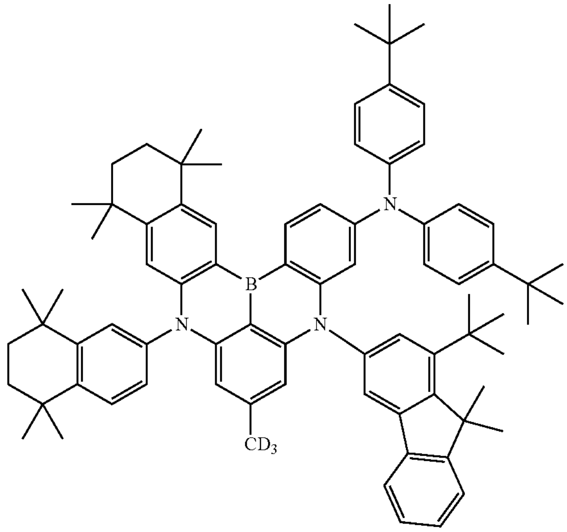
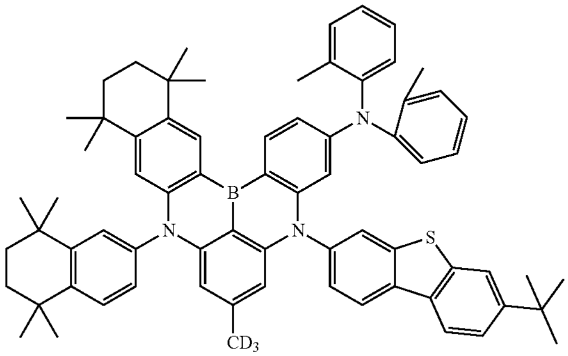
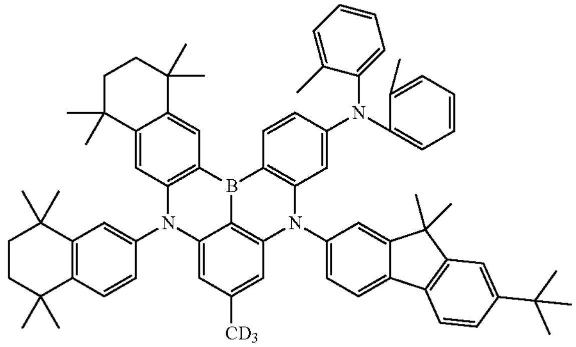
-continued
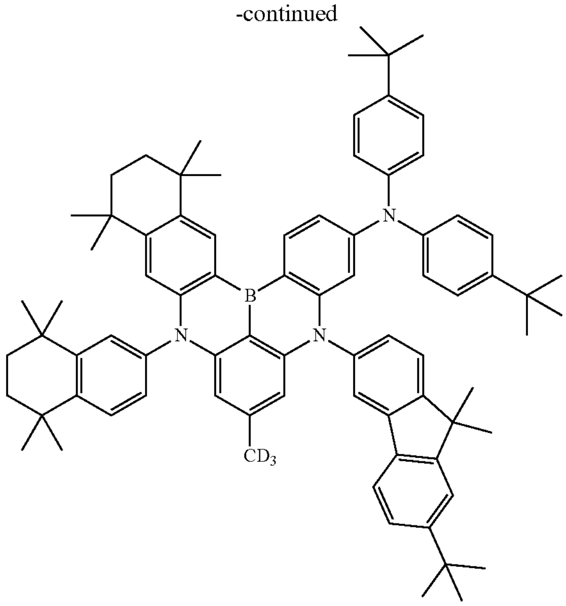
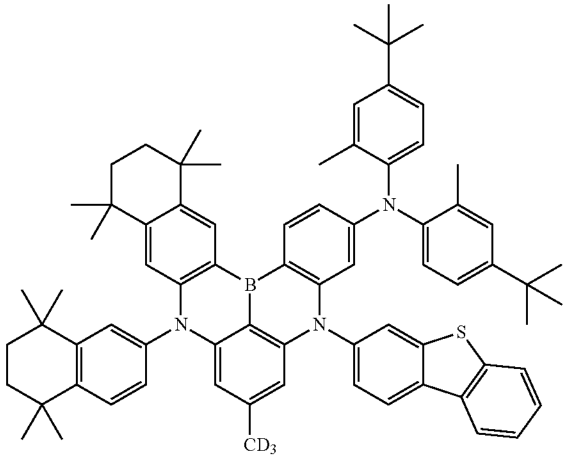
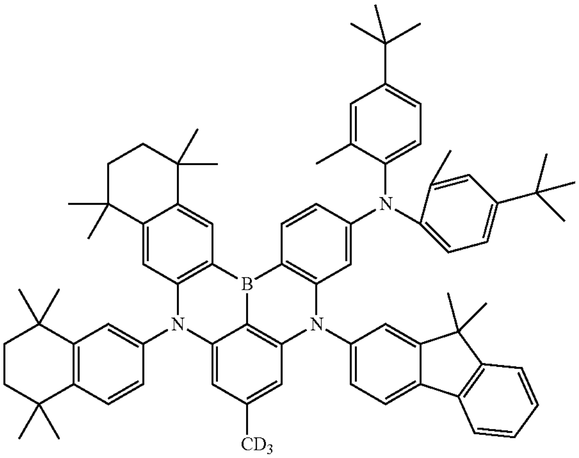

-continued
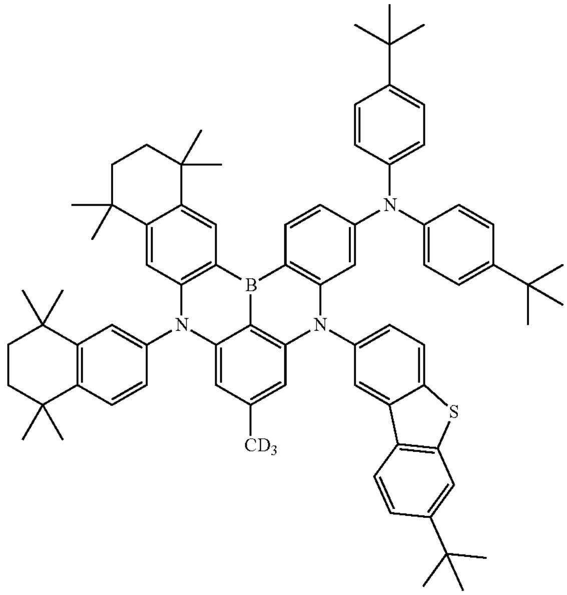
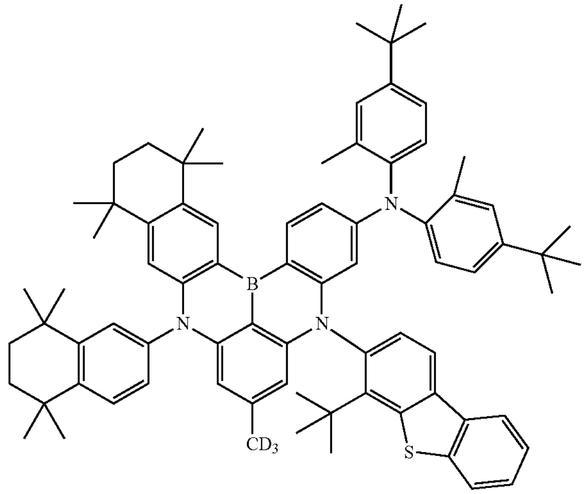
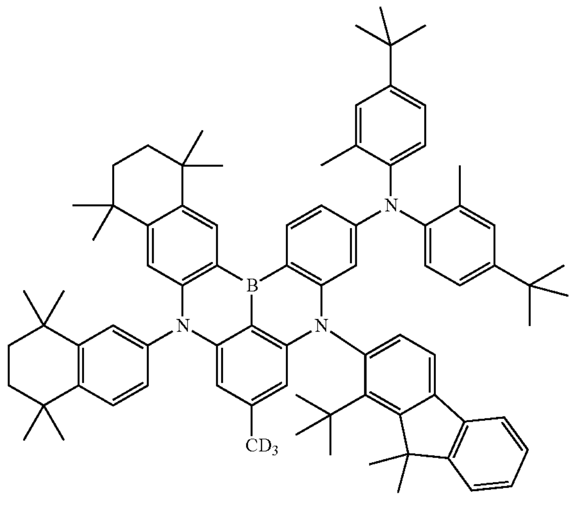
-continued
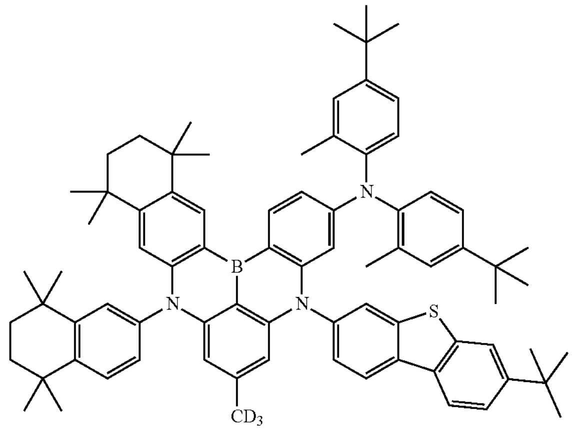
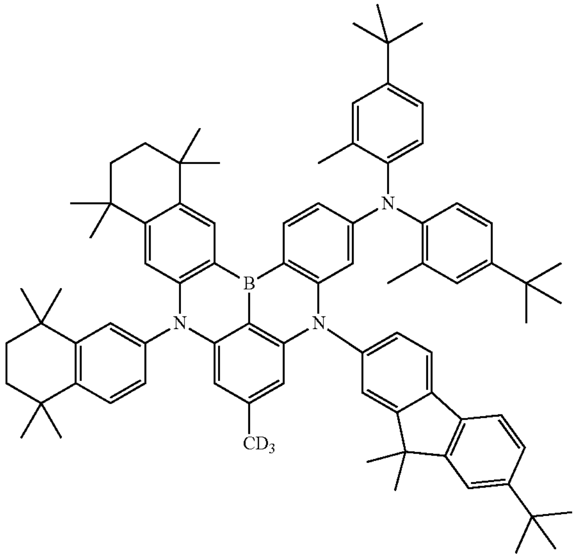
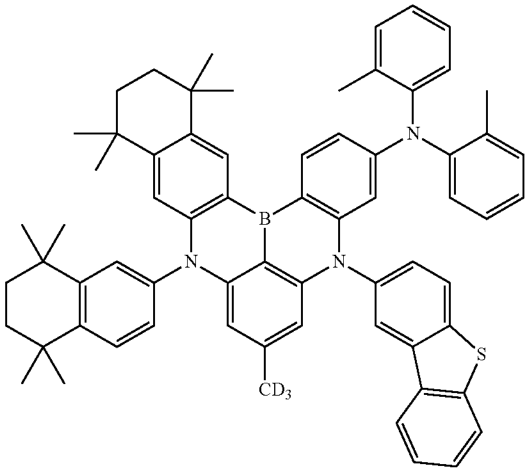

-continued
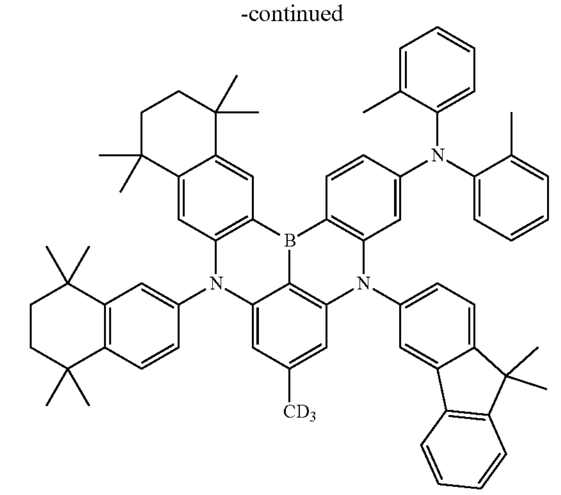
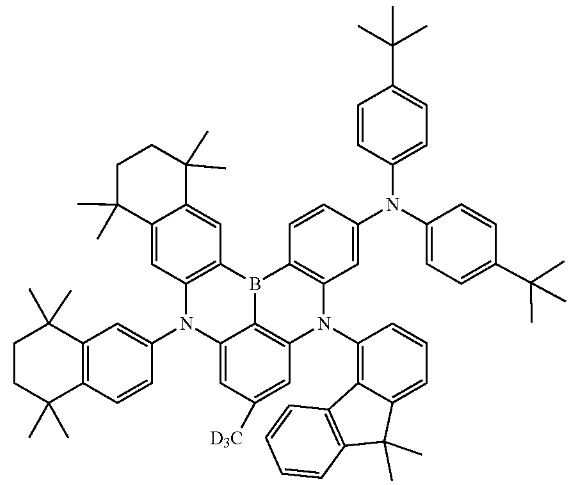
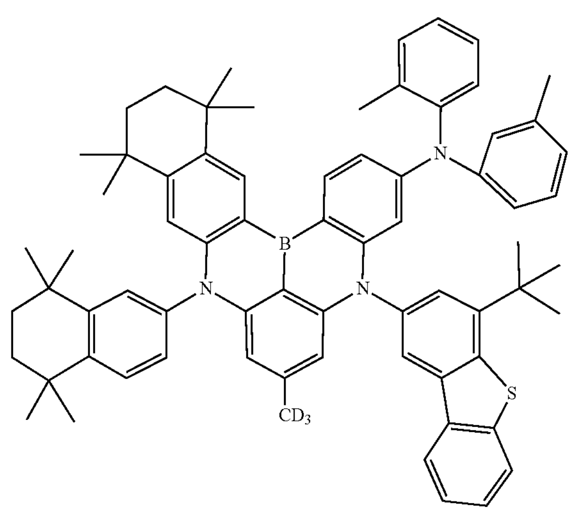
-continued
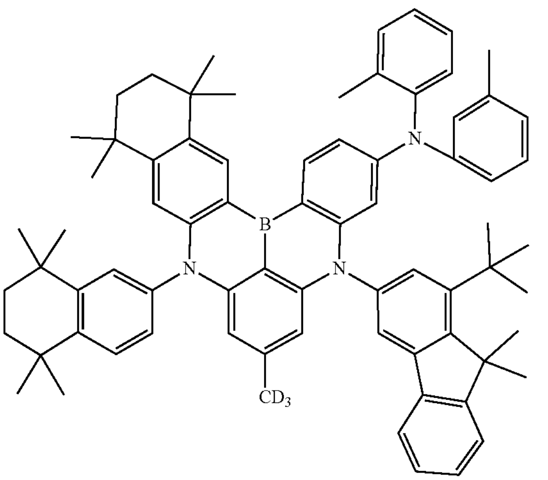
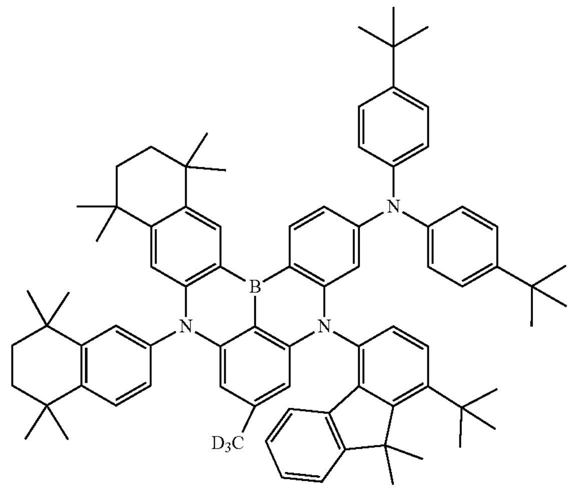
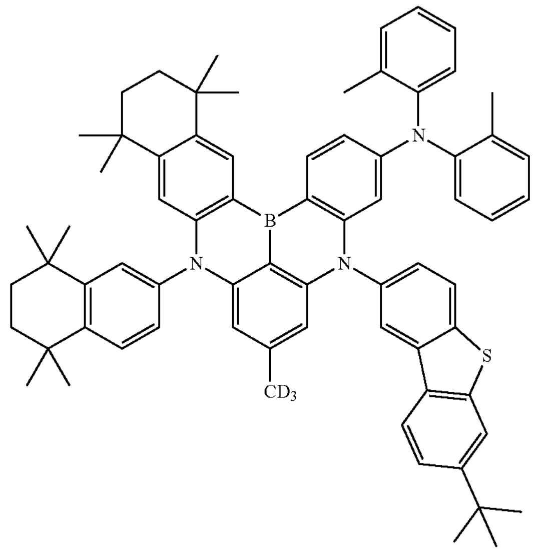

-continued
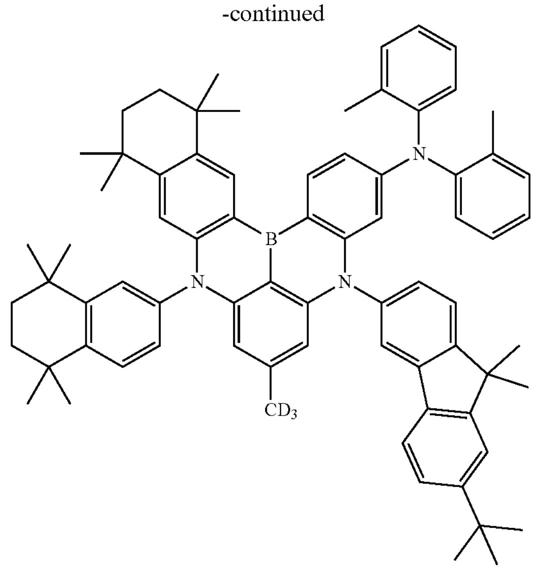
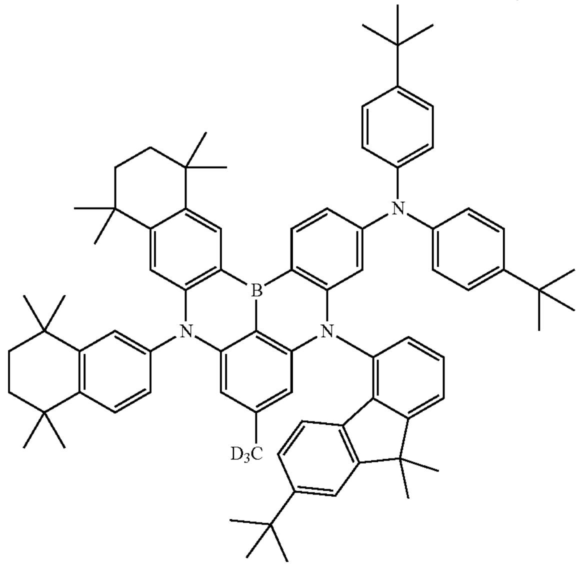
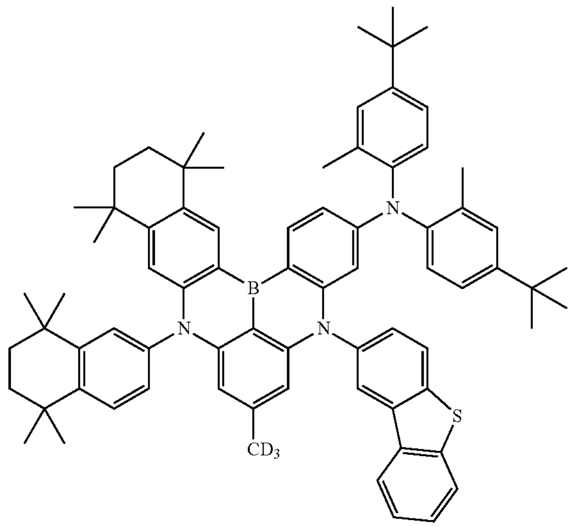
-continued
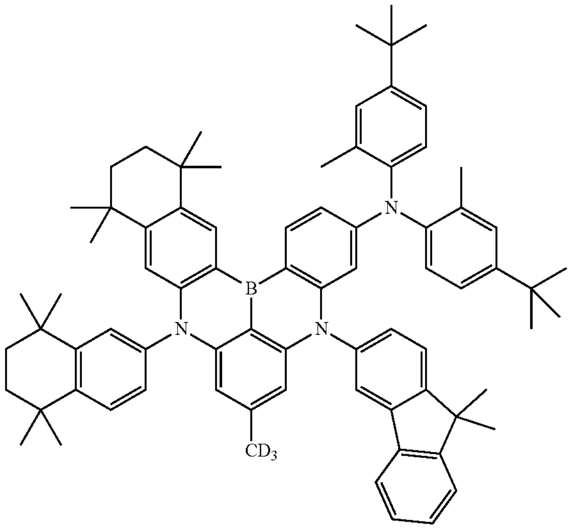
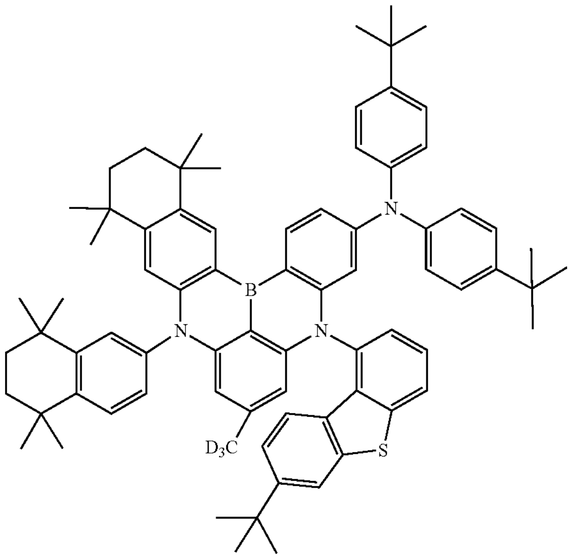
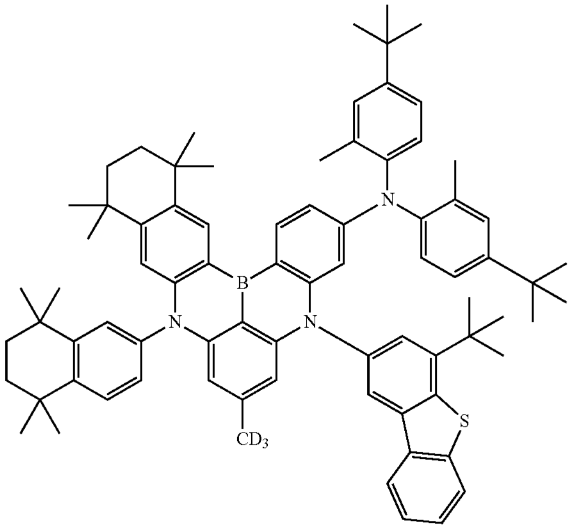

-continued
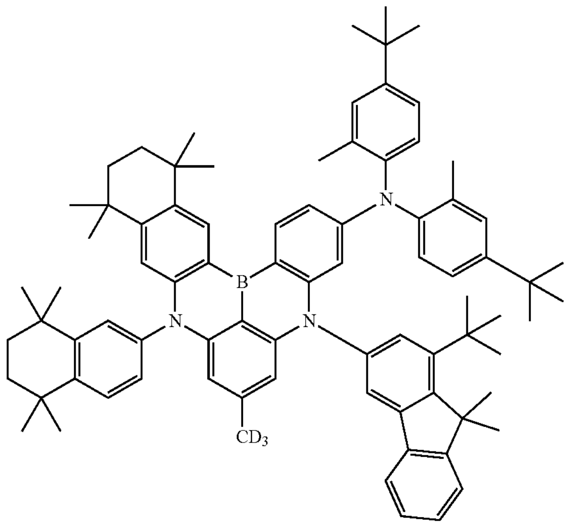
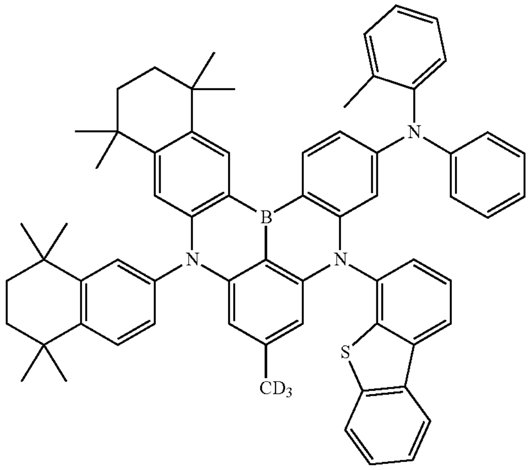
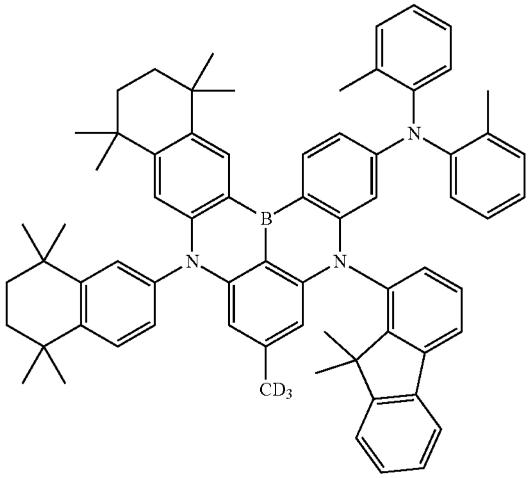
-continued
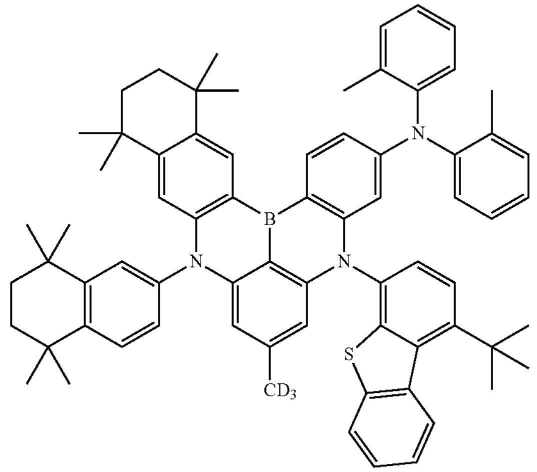
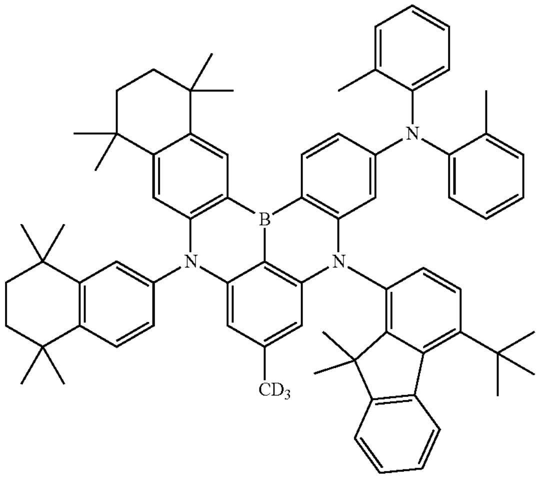
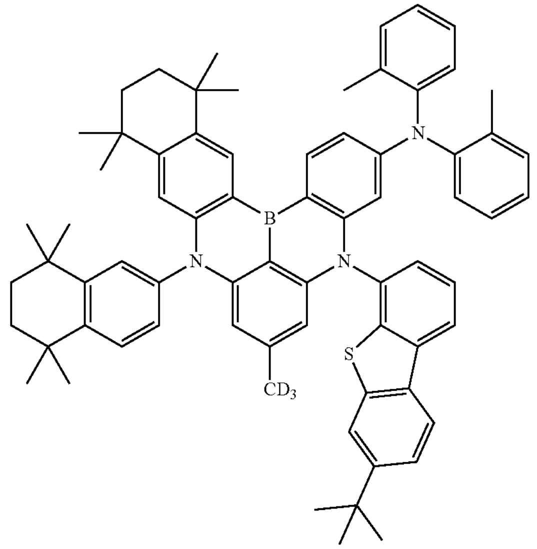

-continued
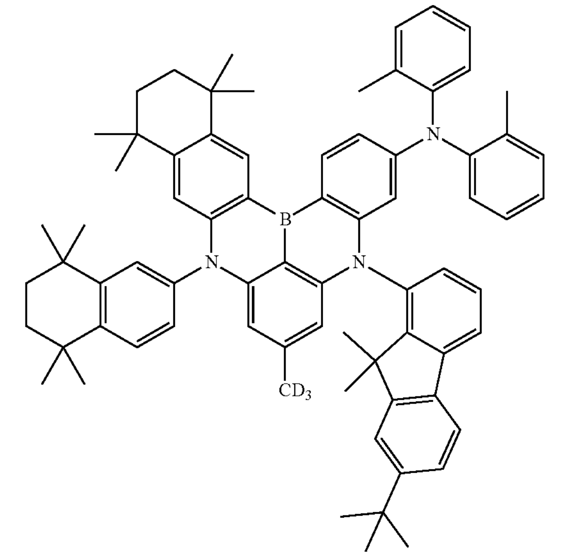
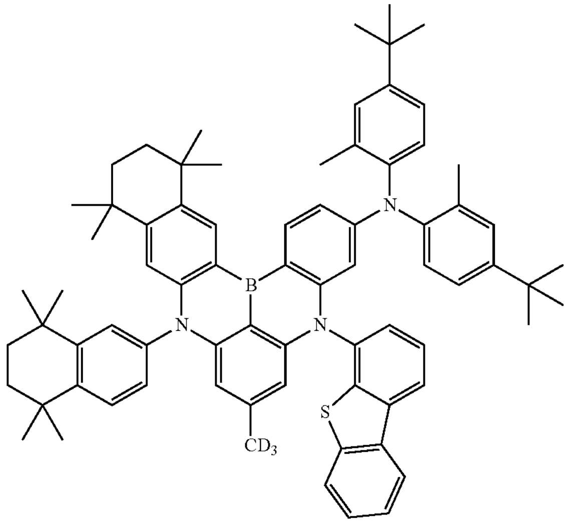
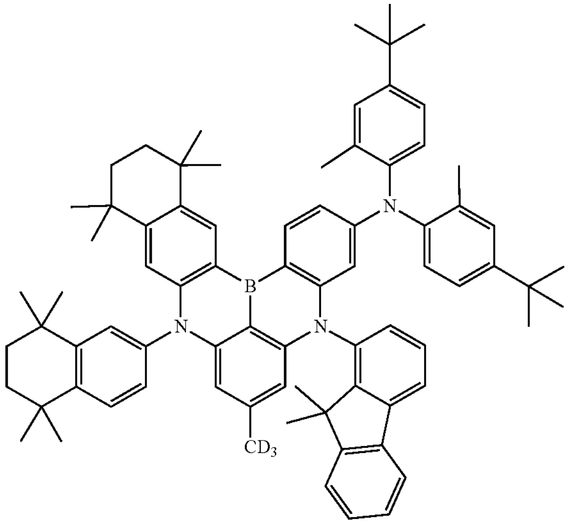
-continued
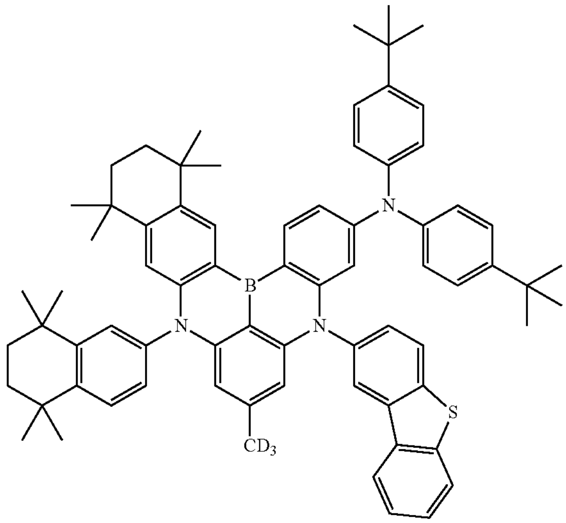
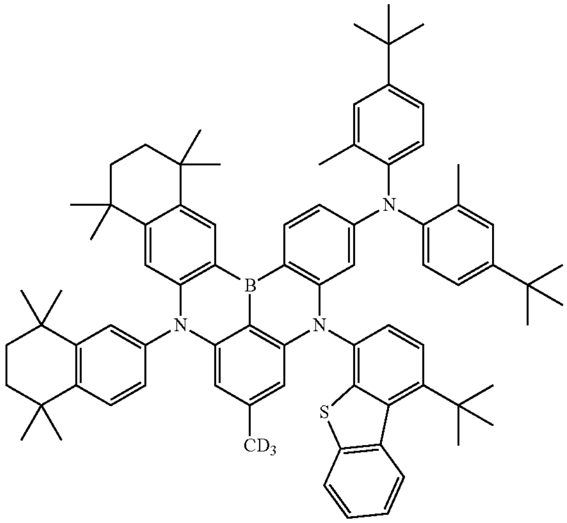
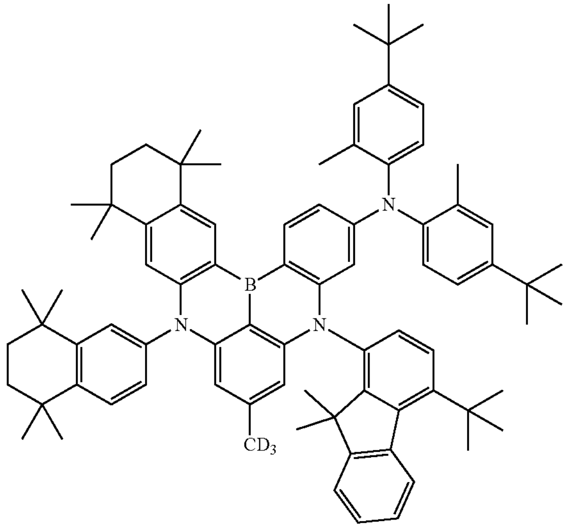

-continued
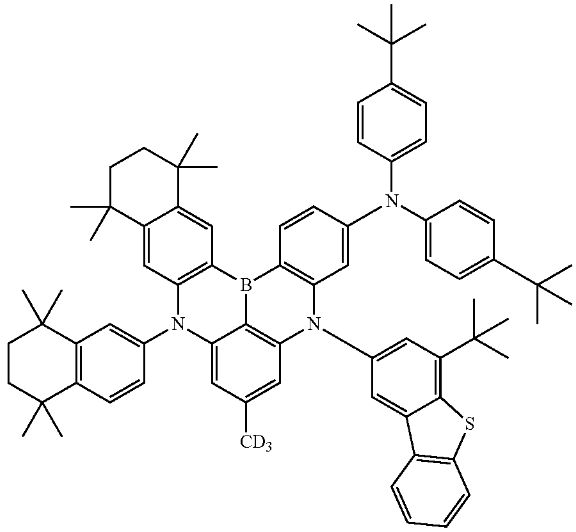
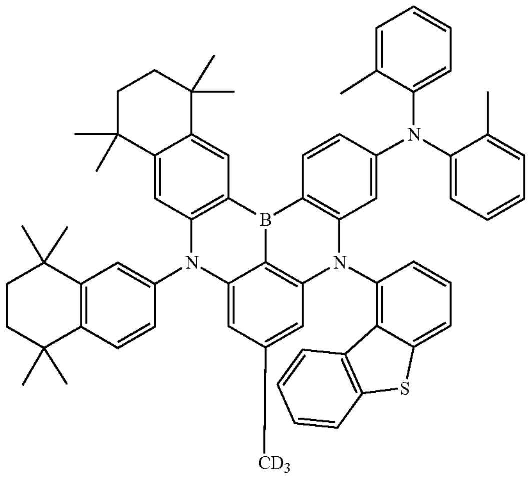
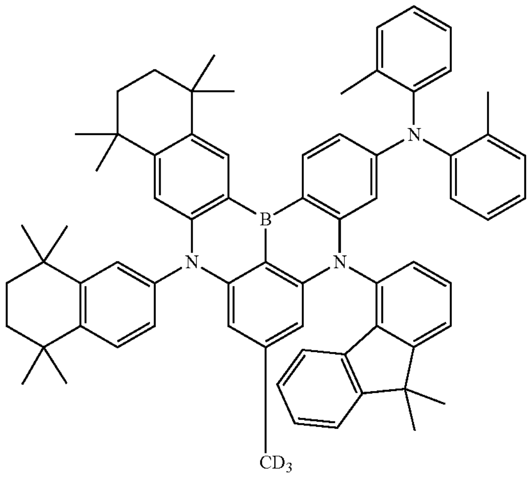
-continued
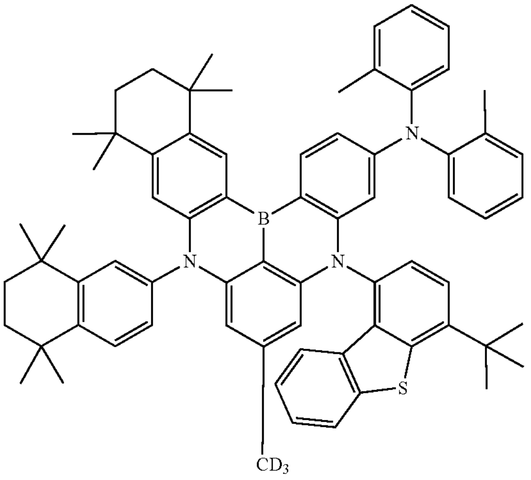
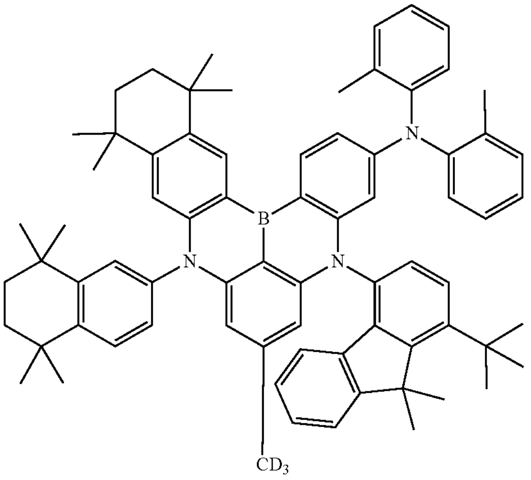
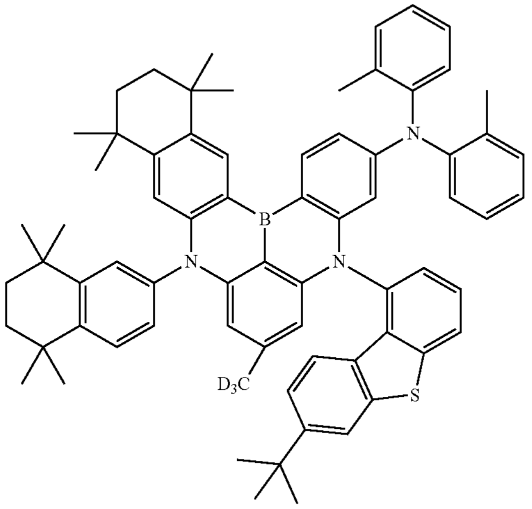

-continued
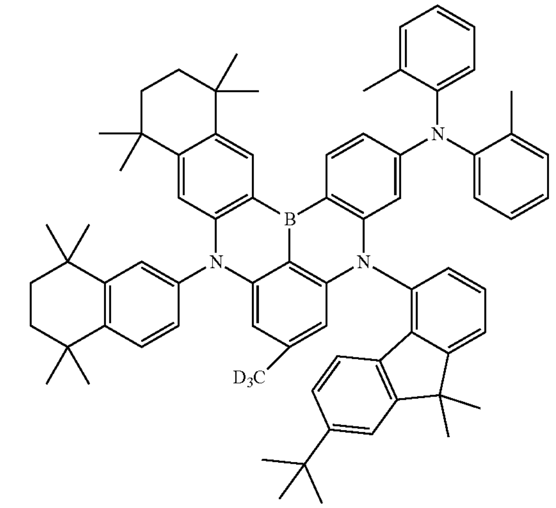
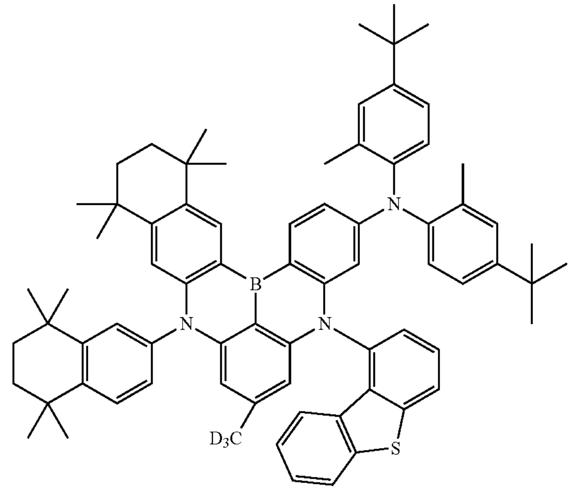
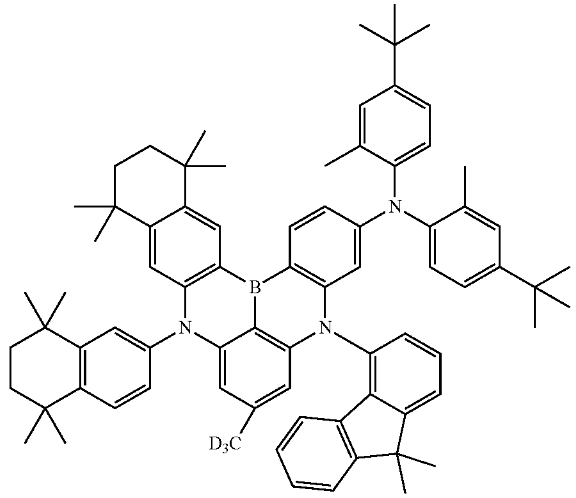
-continued
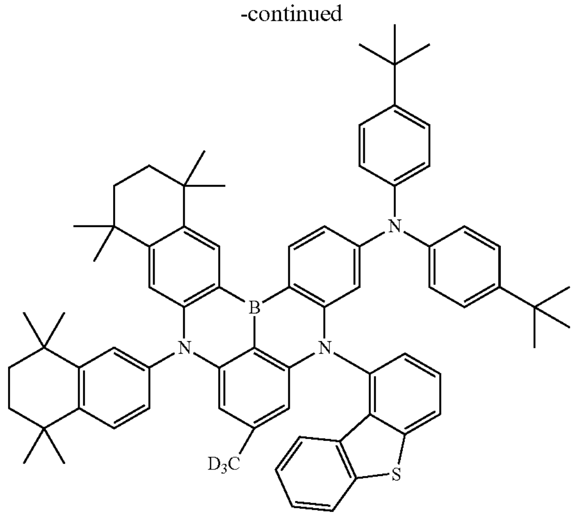
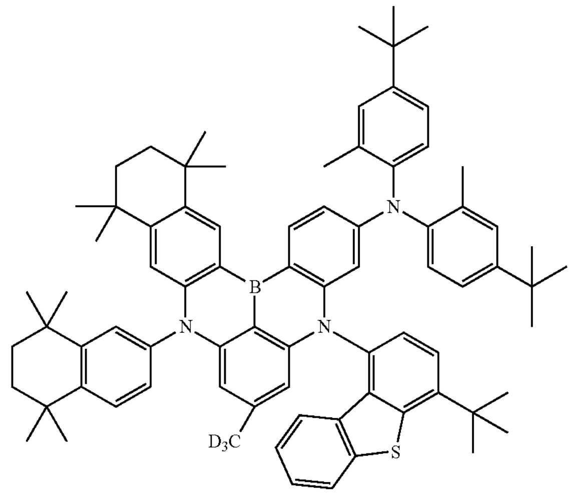
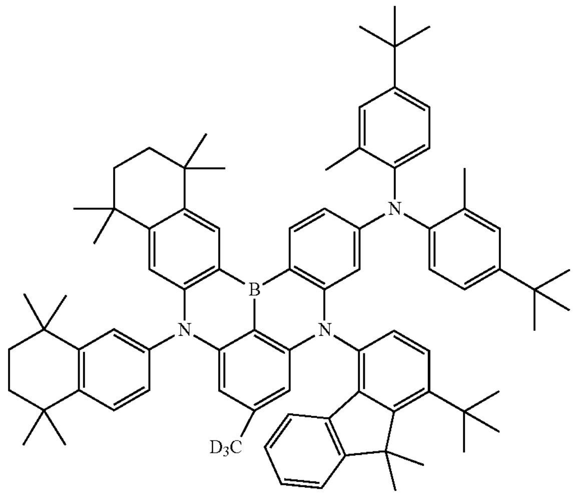

-continued
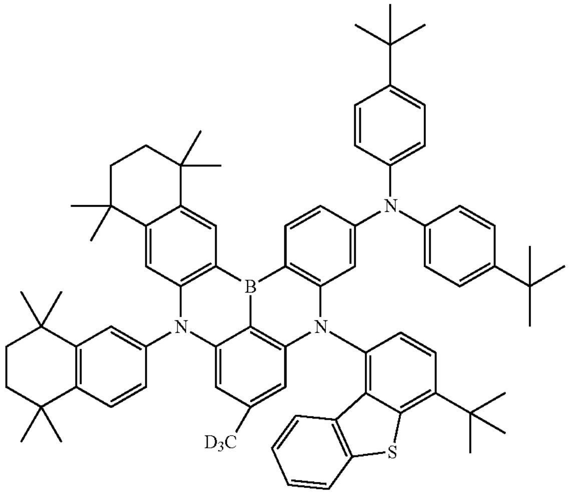
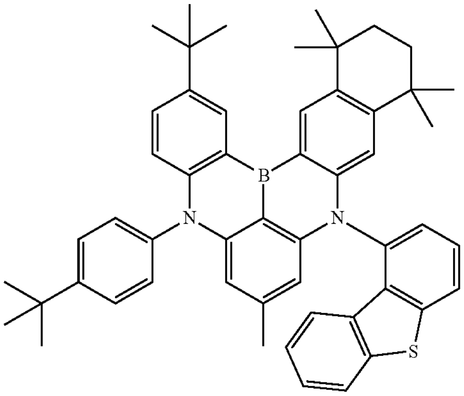
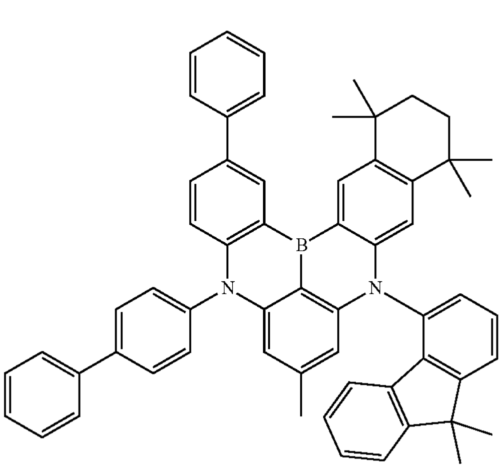
-continued
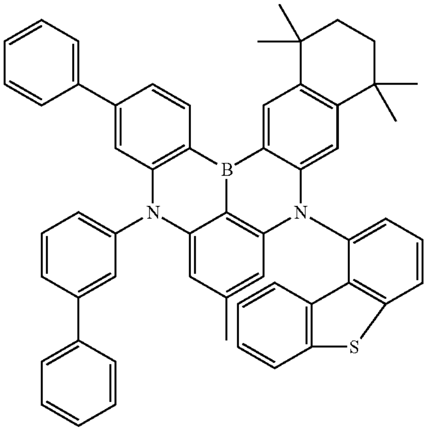
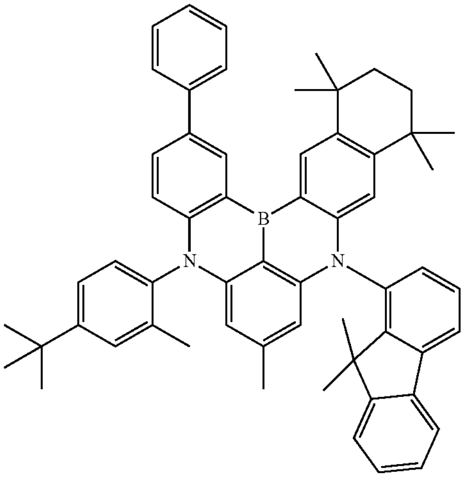
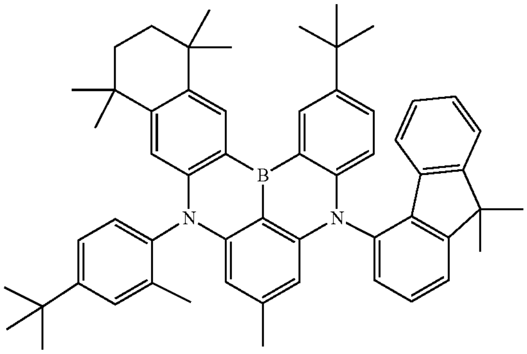
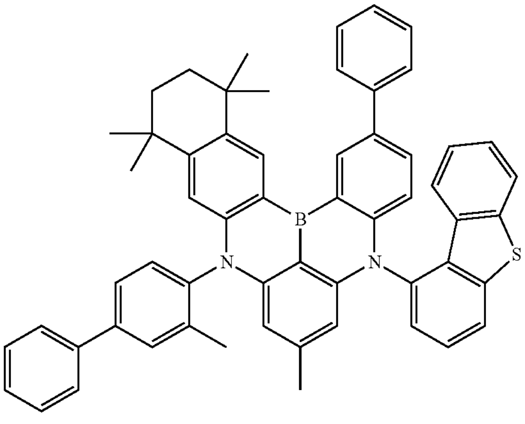

-continued
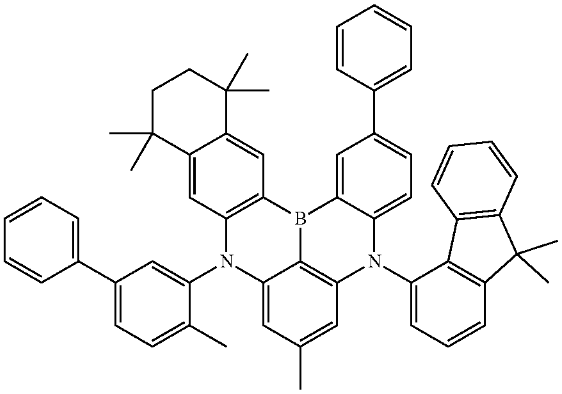
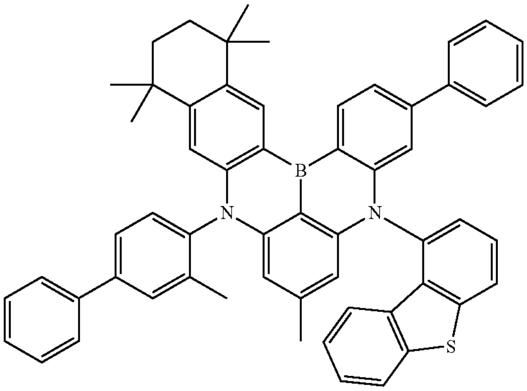
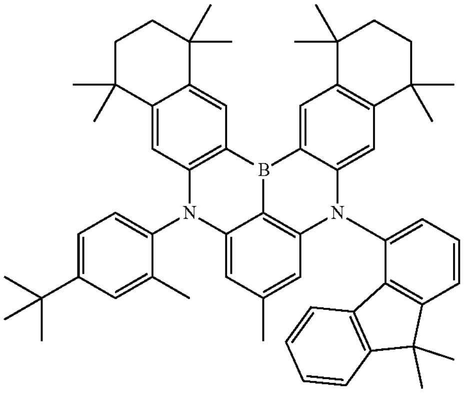
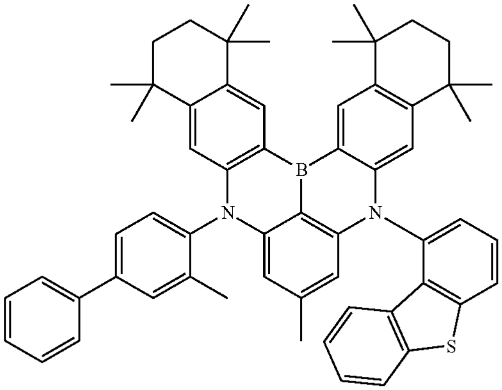
-continued
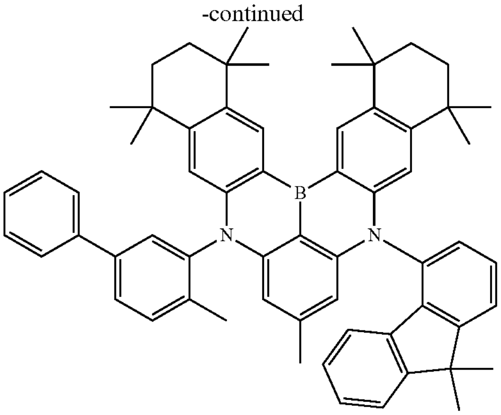
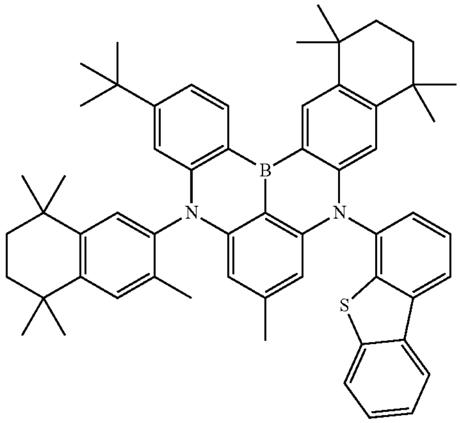
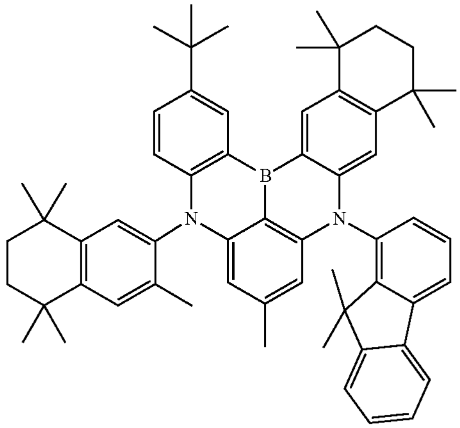
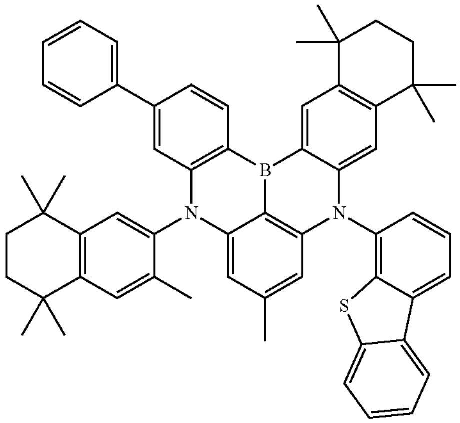

-continued
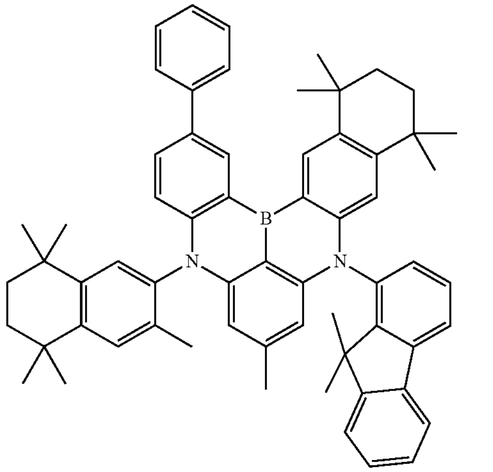
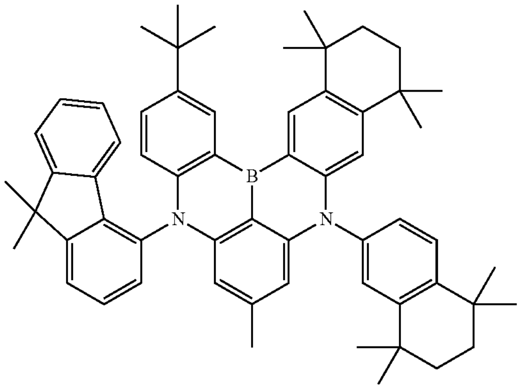
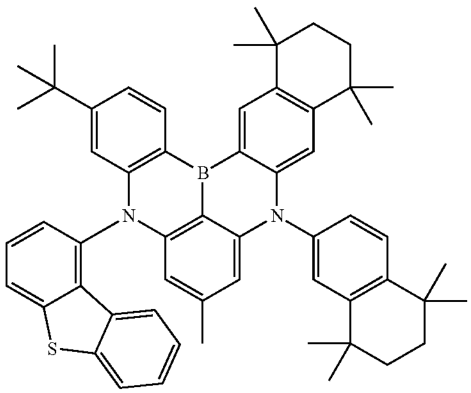
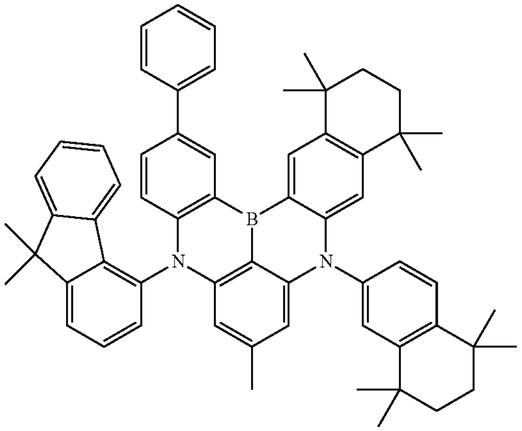
-continued
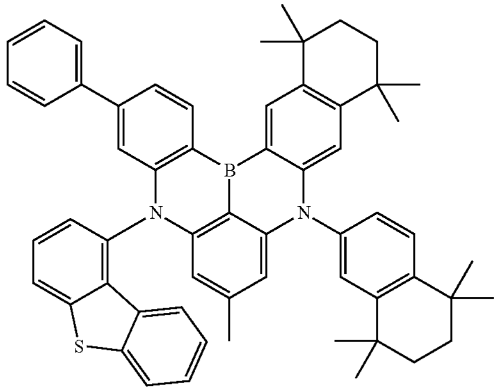
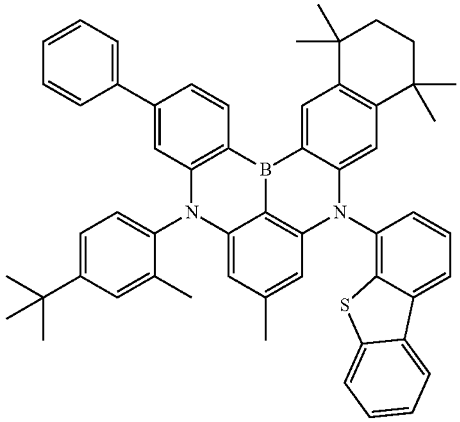
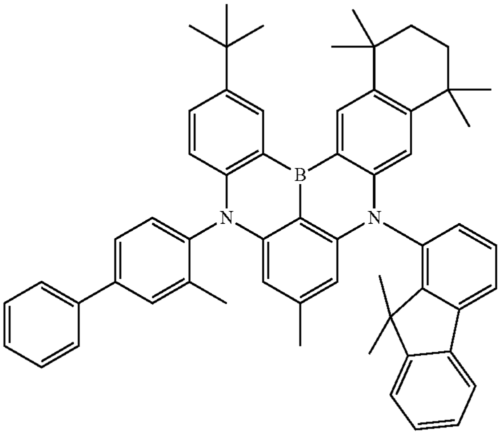
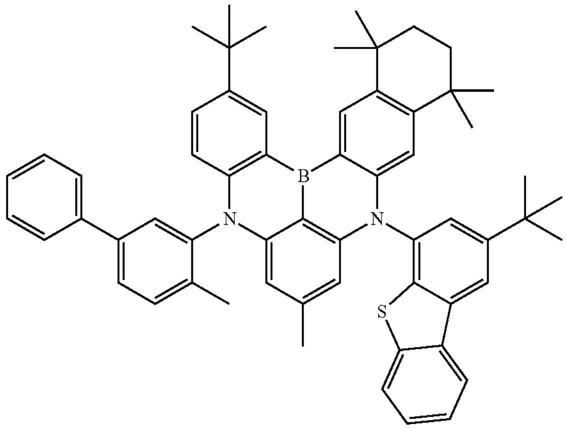

-continued
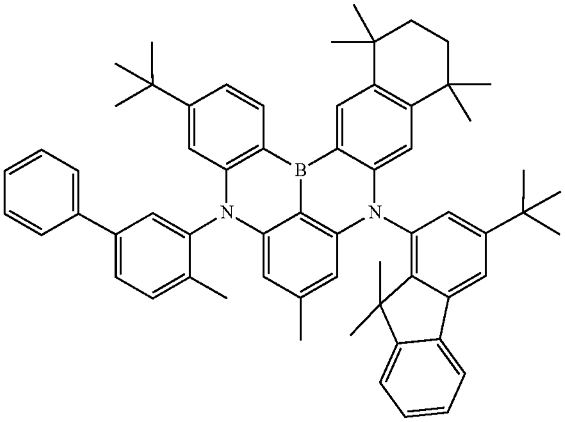
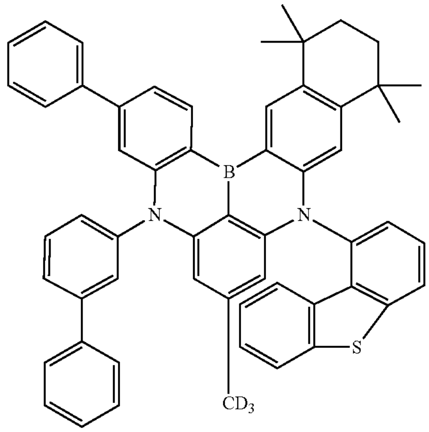
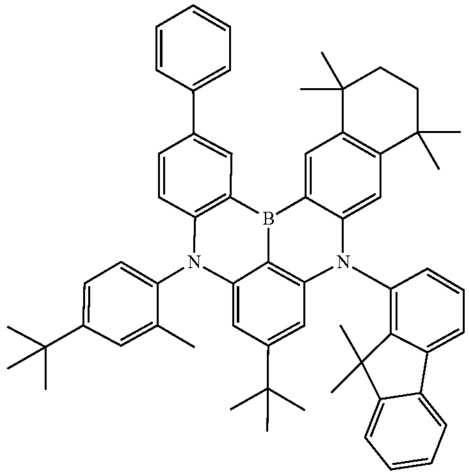
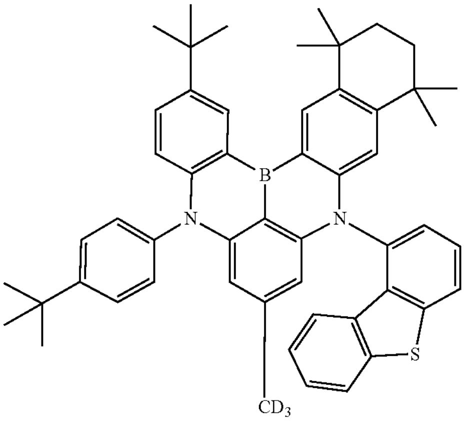
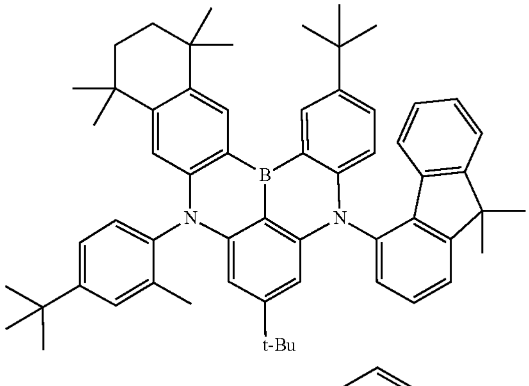
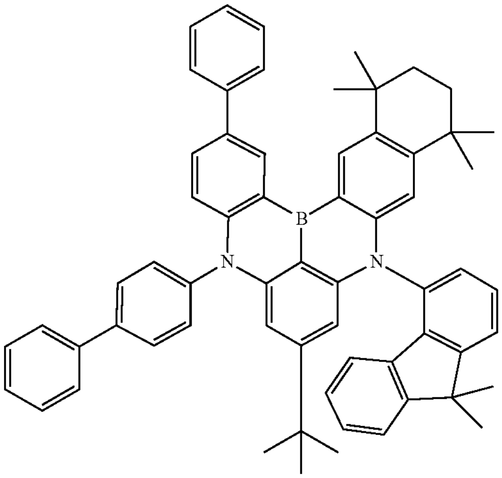
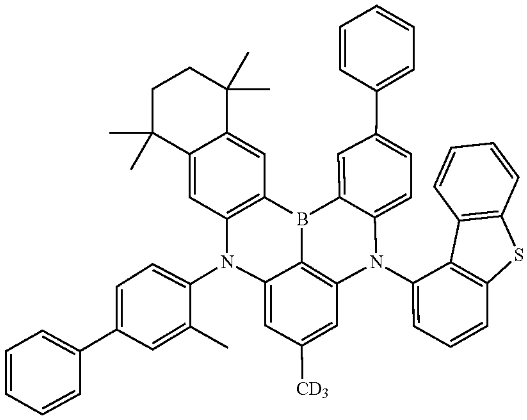
-continued -continued
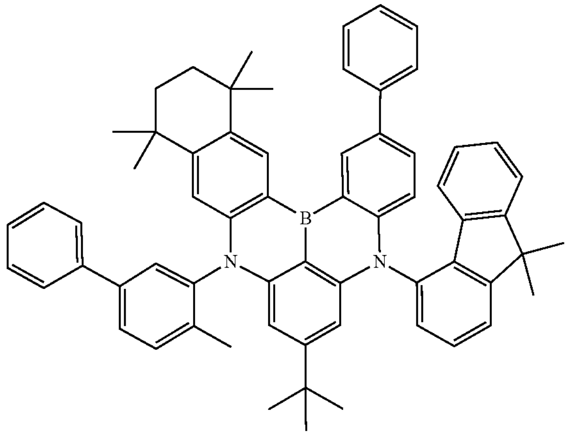
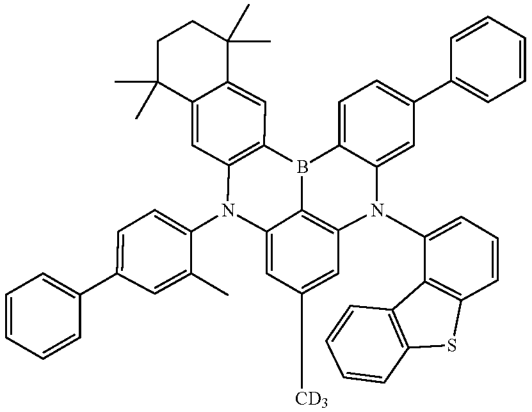
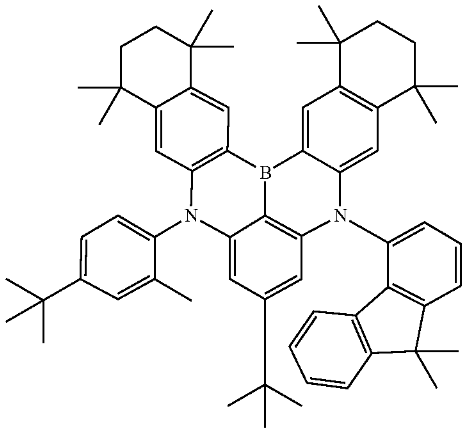
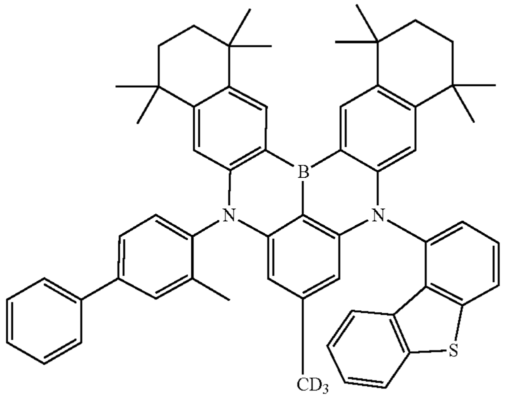
-continued
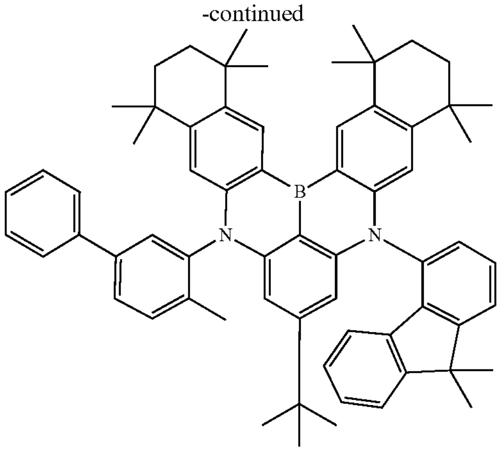
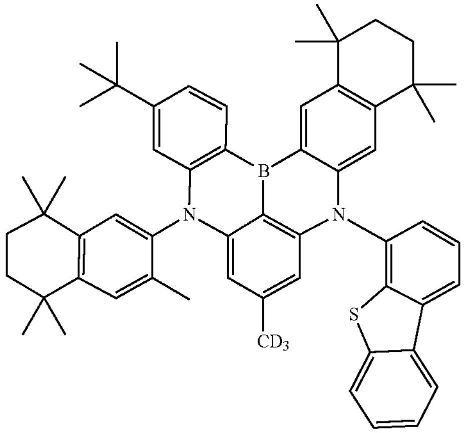
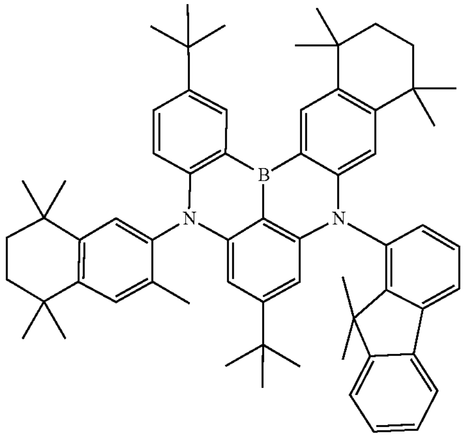
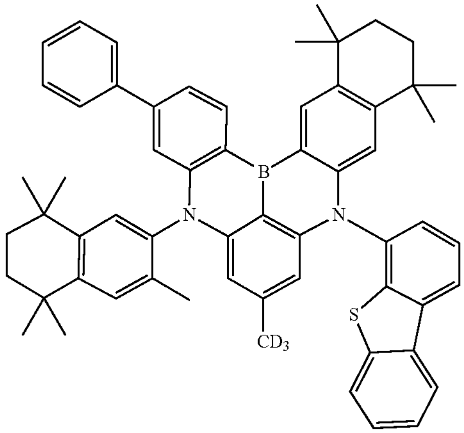

-continued
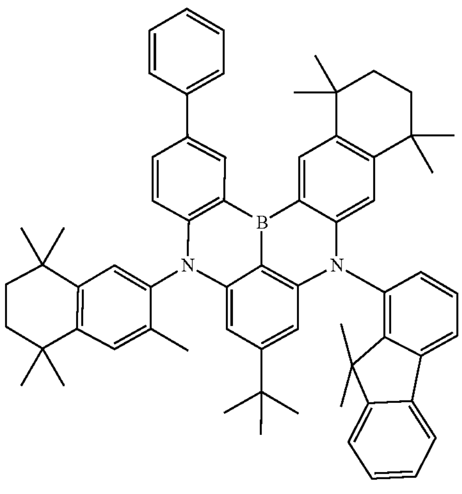
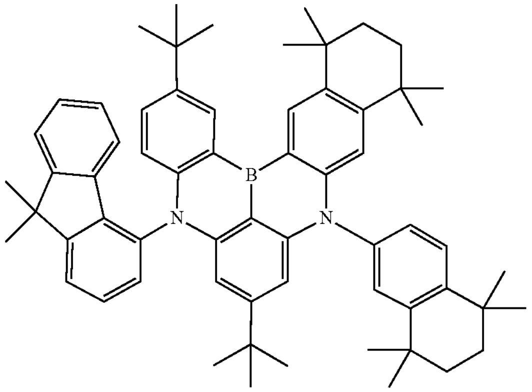
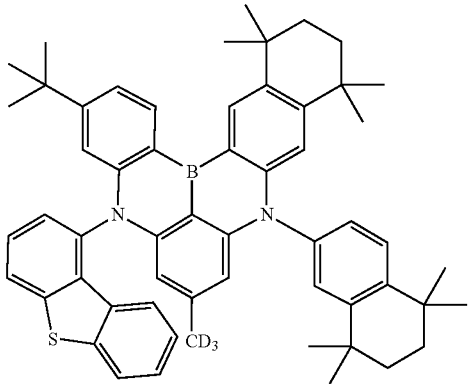
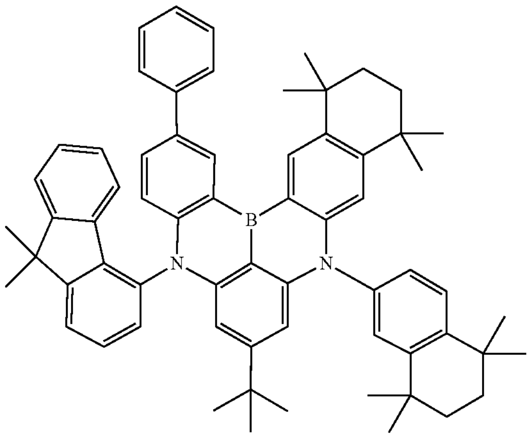
-continued
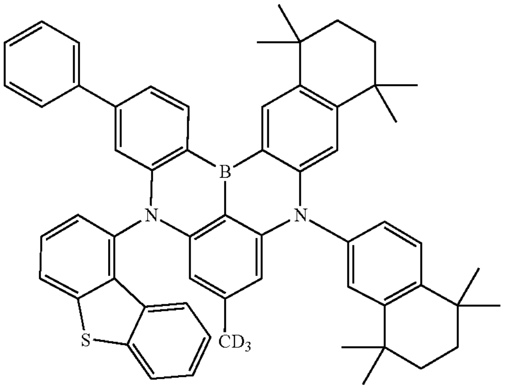
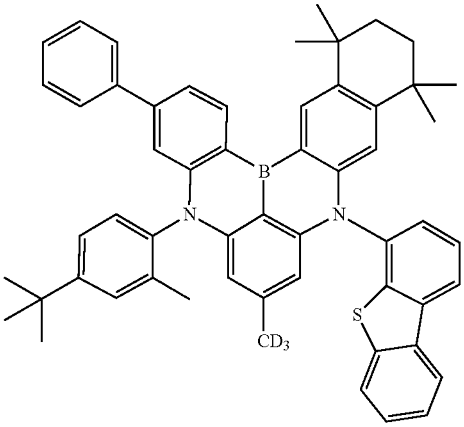
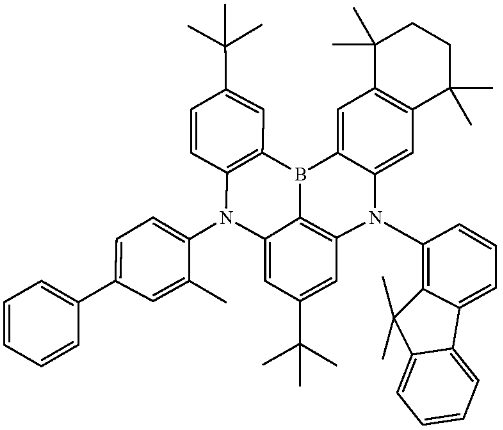
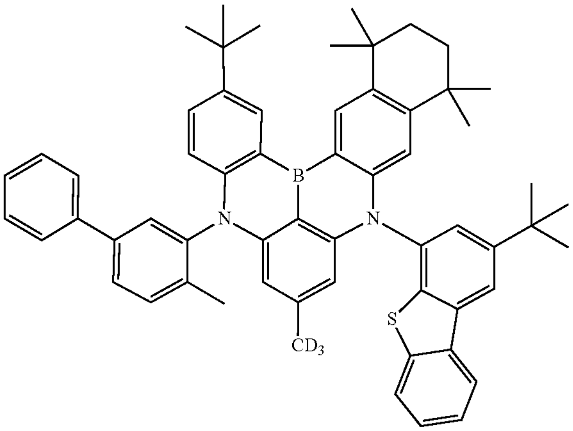

-continued
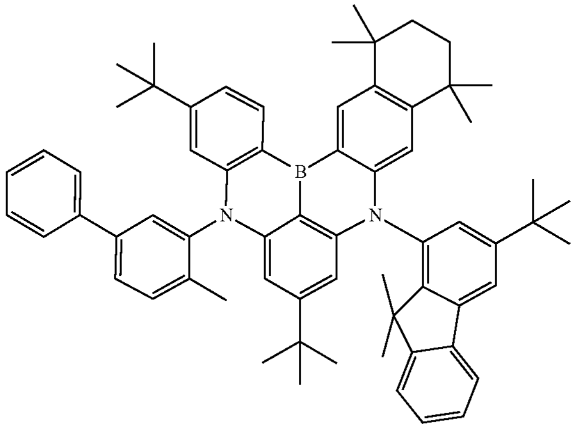
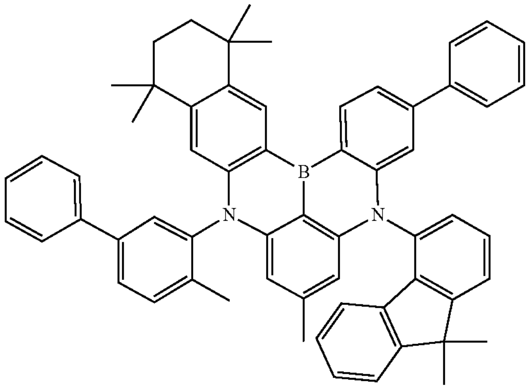
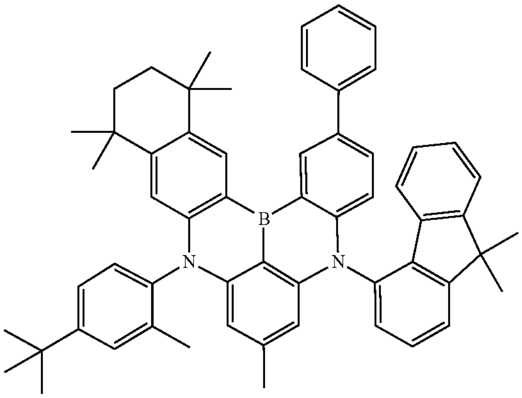
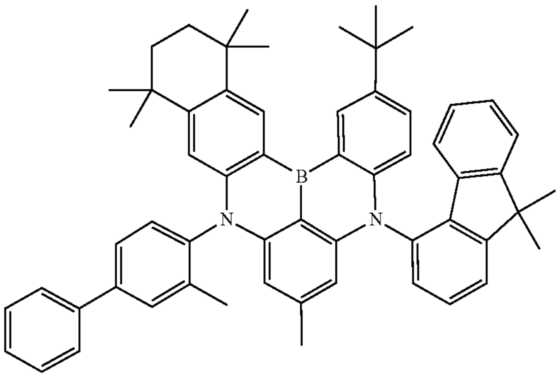
-continued
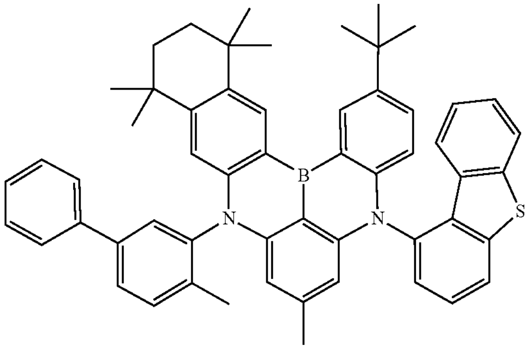
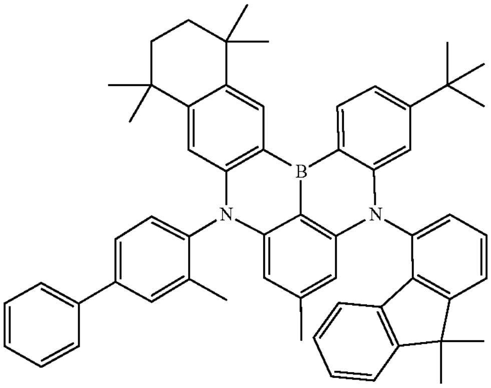
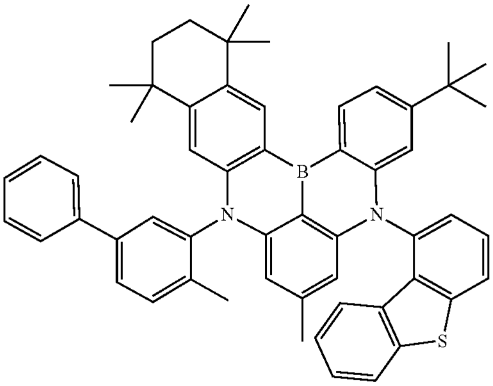
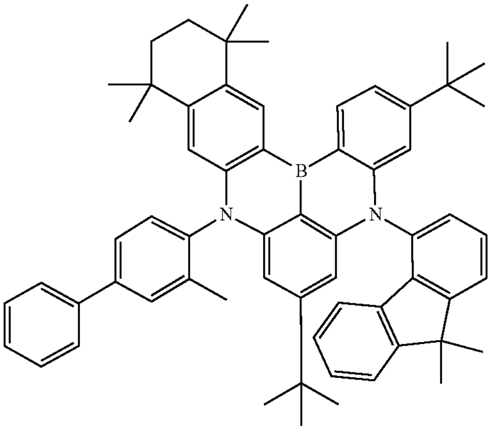

-continued
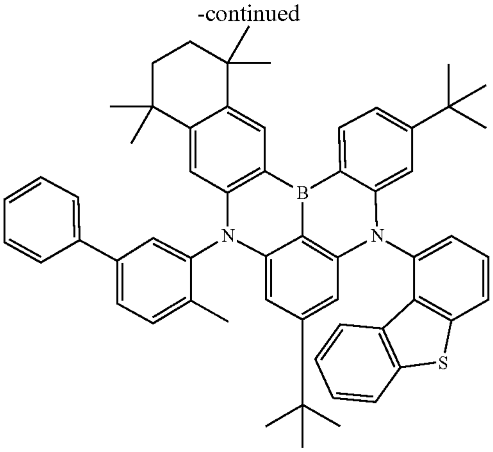
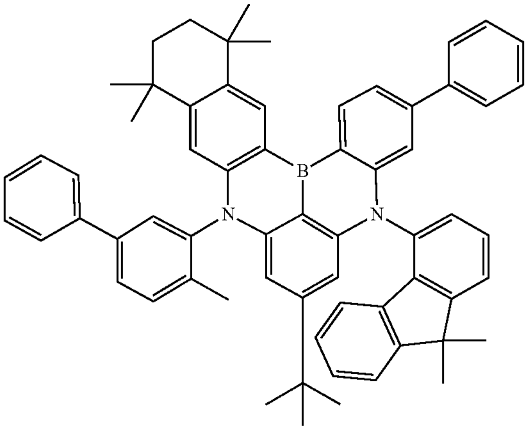
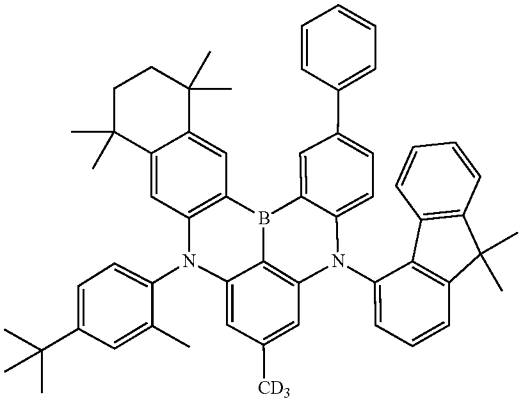
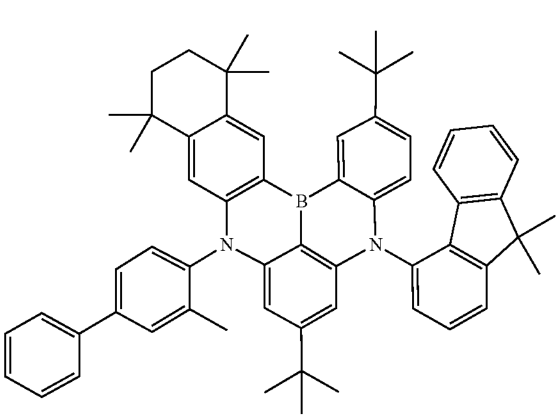
-continued
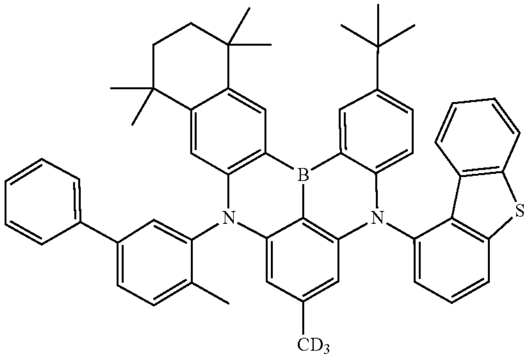
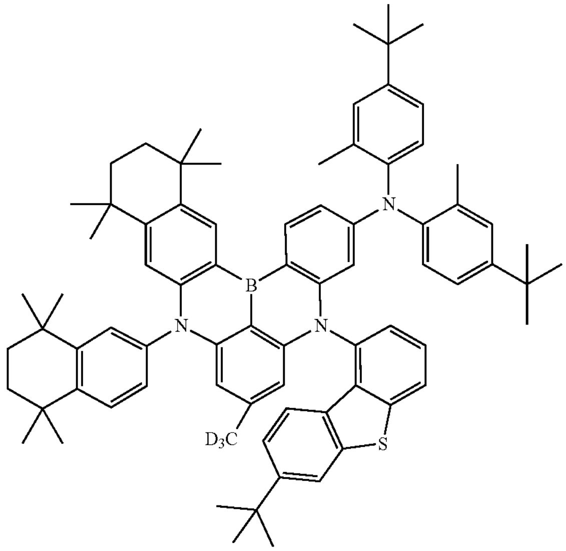
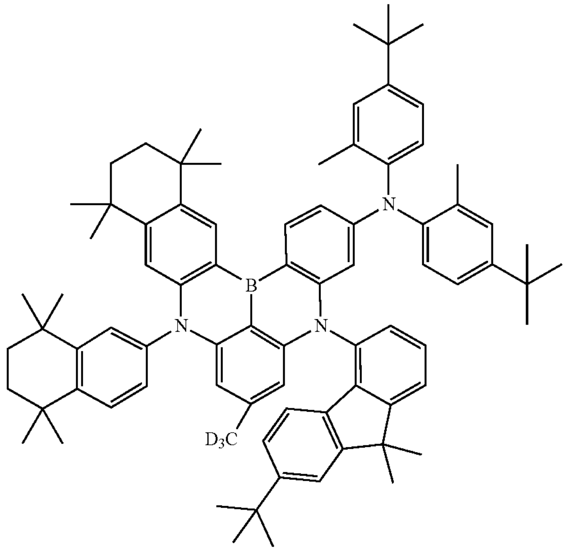

-continued
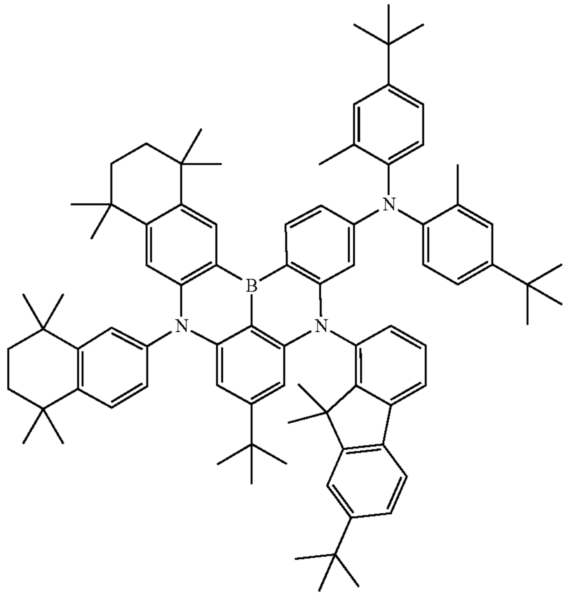
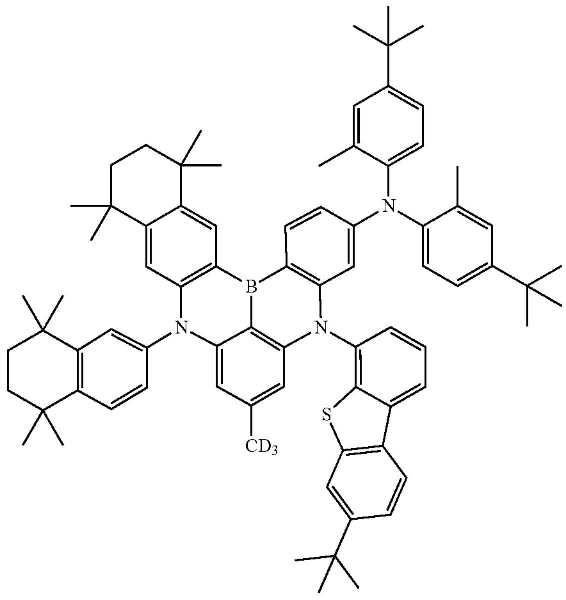
-continued
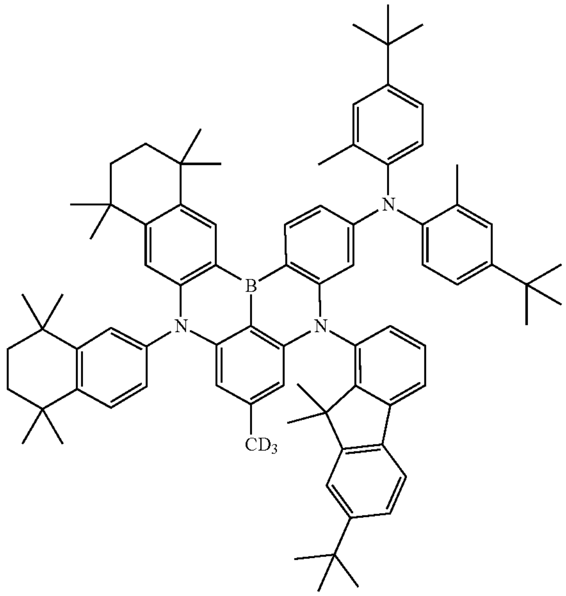
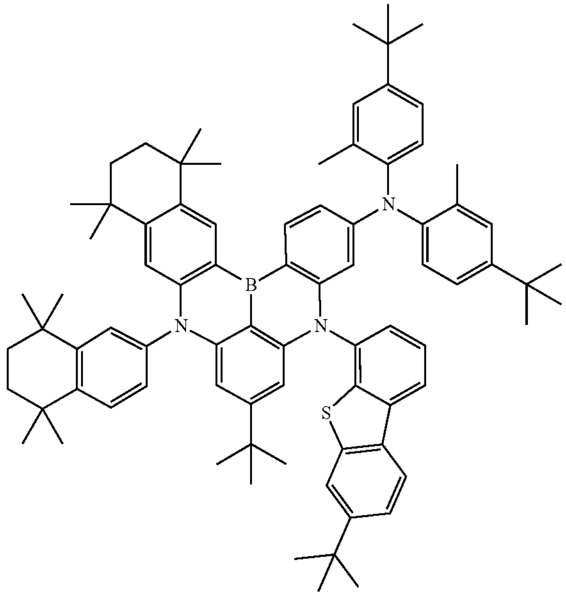

-continued
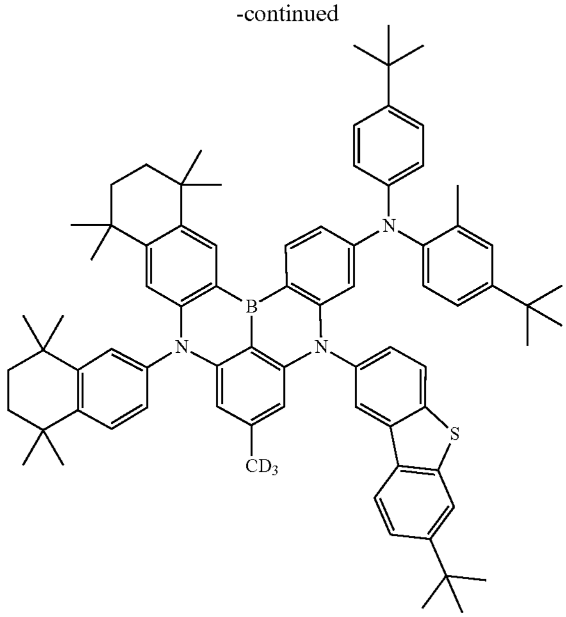
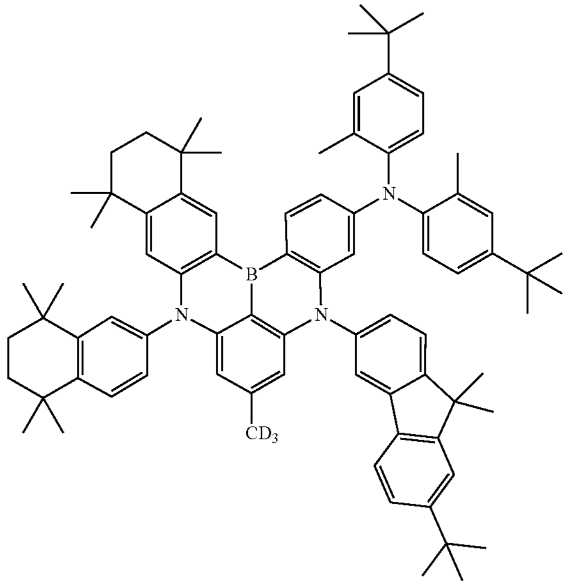
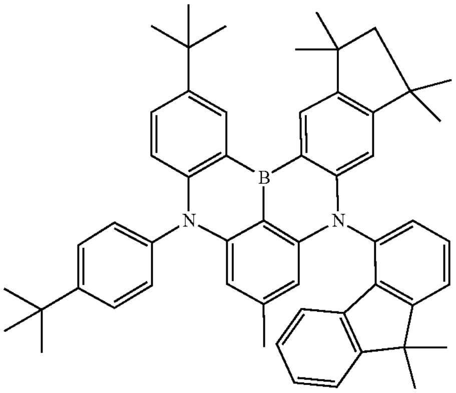
-continued
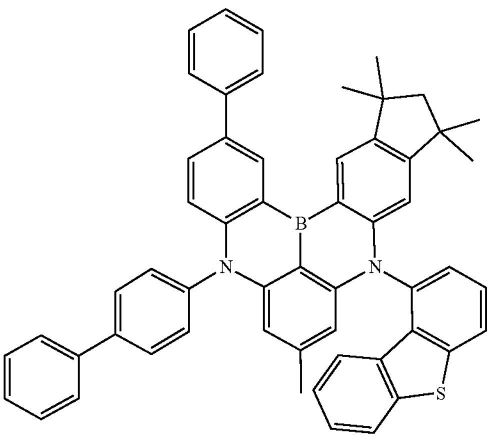
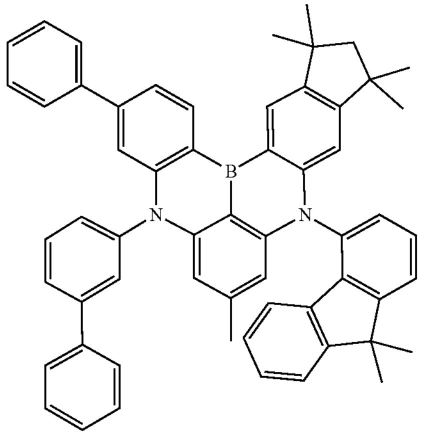
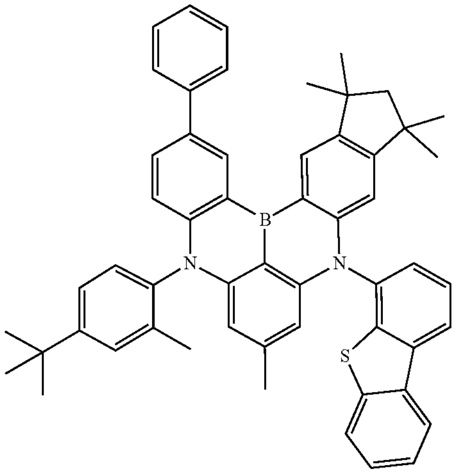
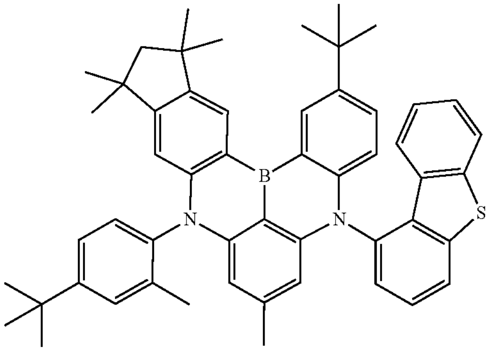

-continued
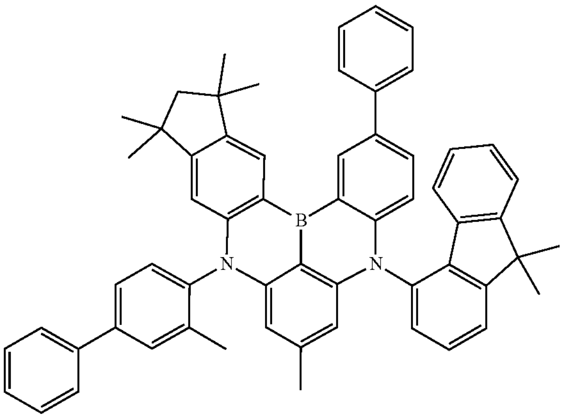
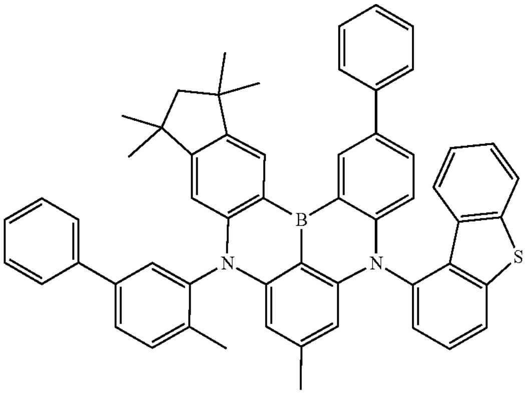
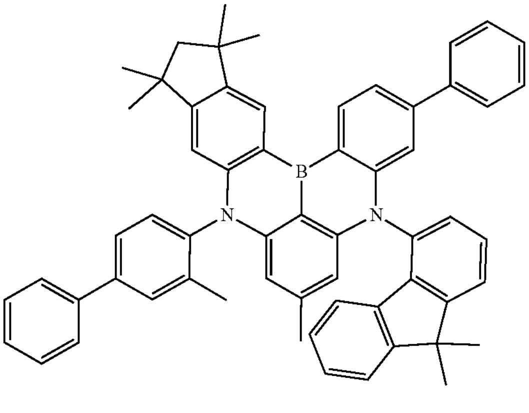
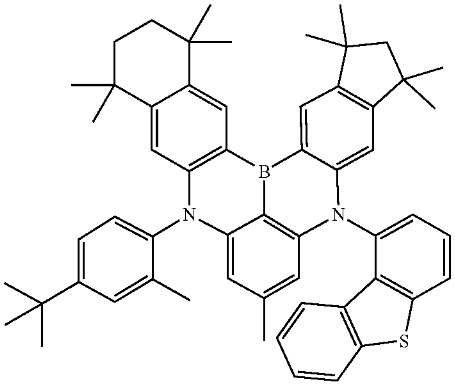
-continued
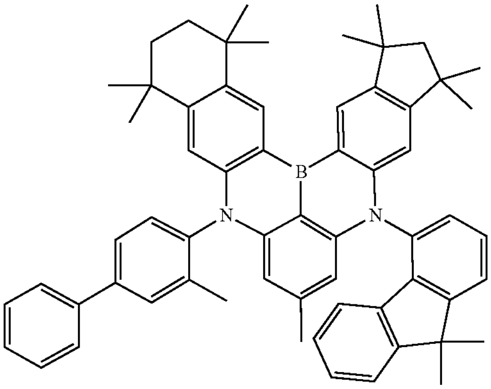
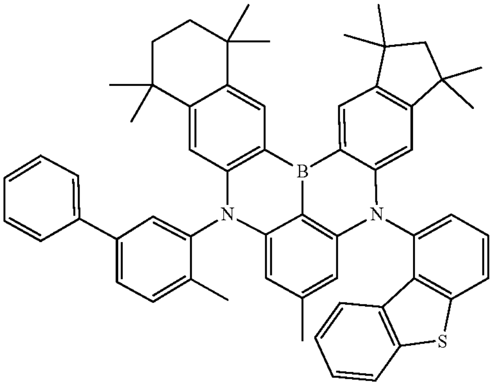
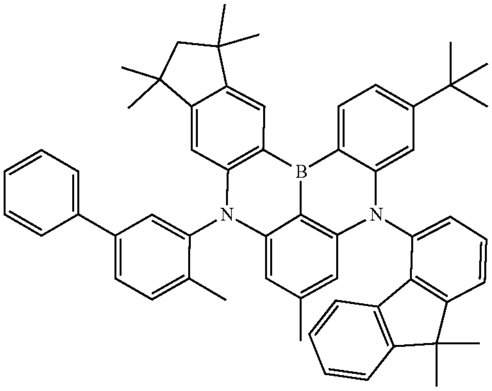
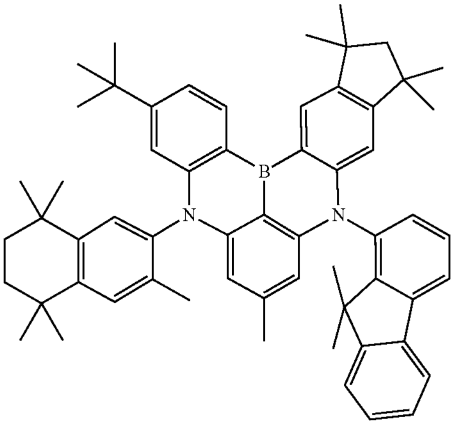

-continued
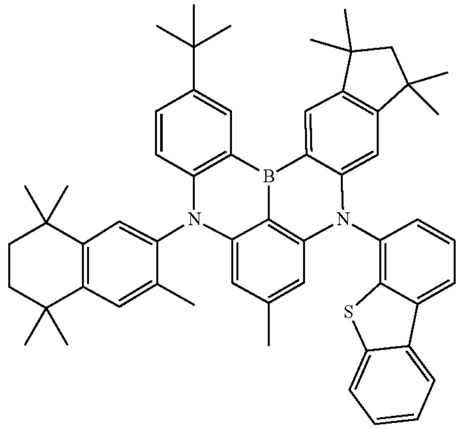
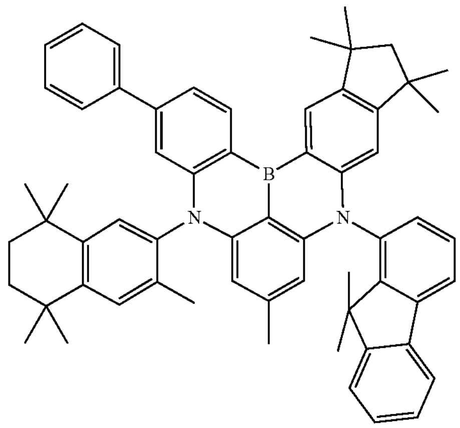
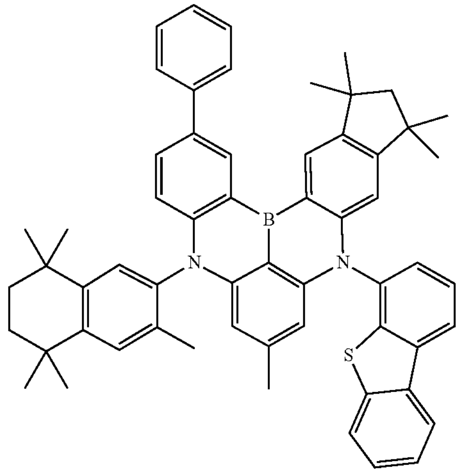
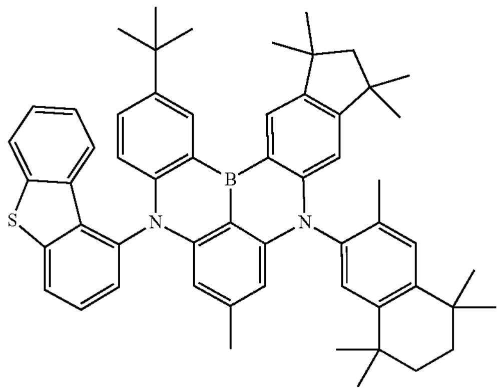
-continued
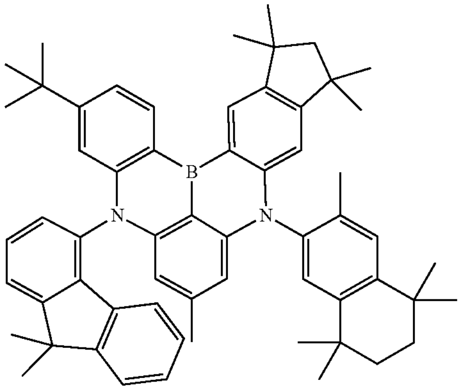
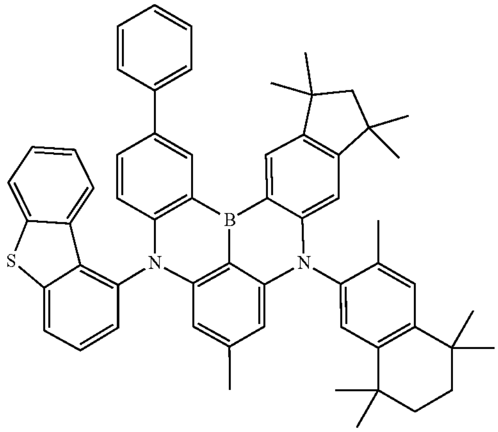
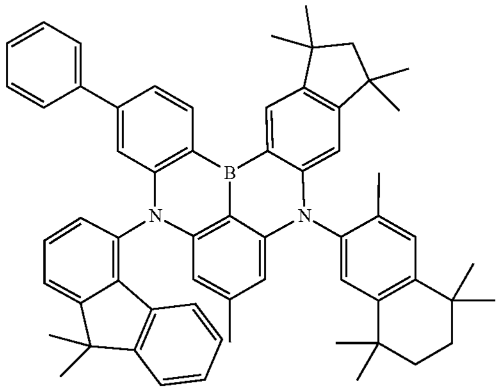
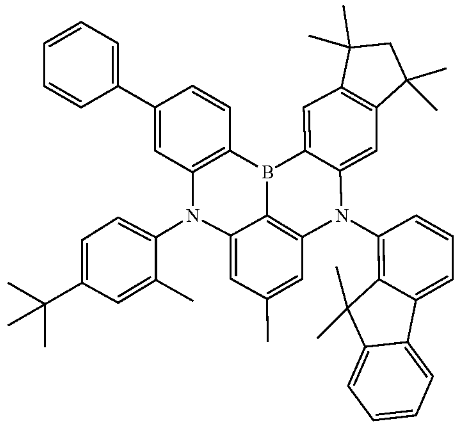

-continued
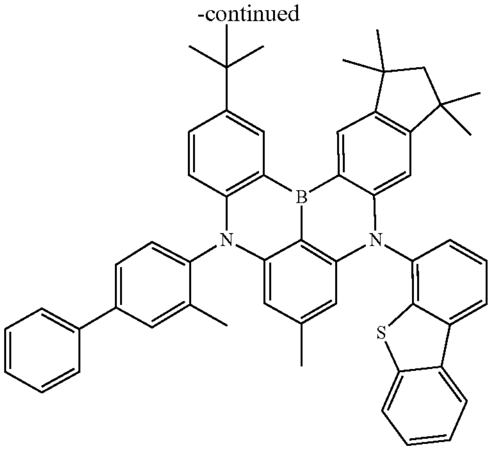
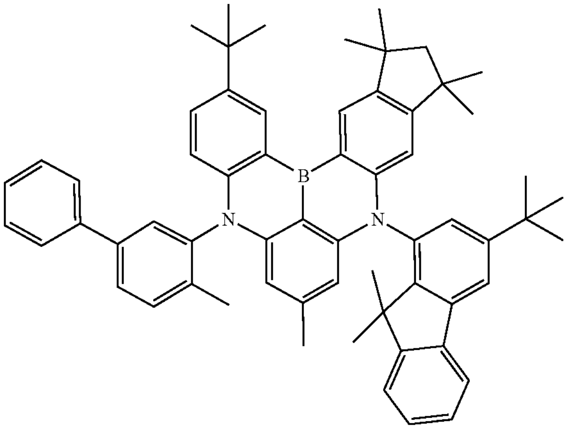
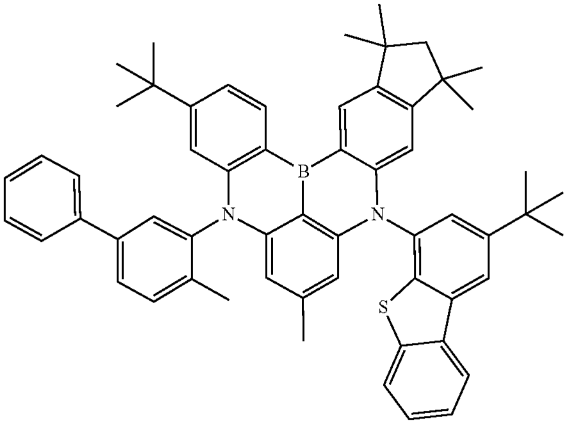
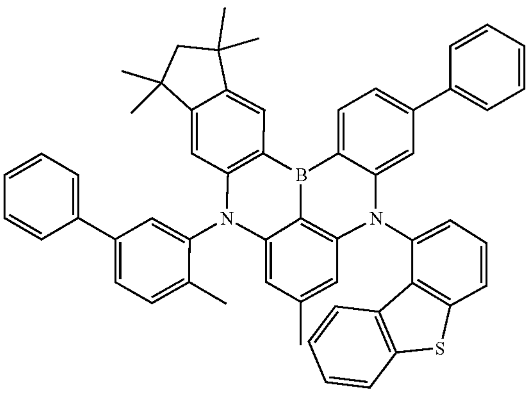
-continued
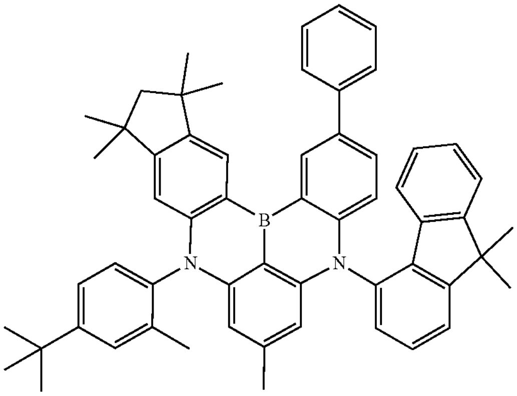
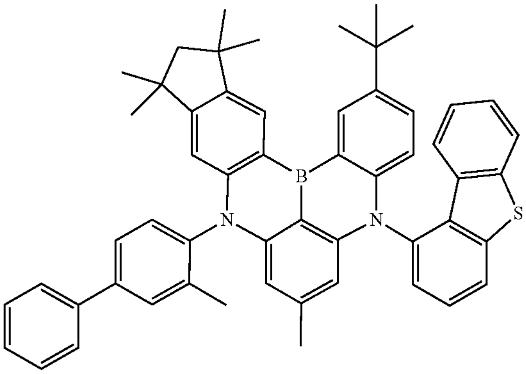
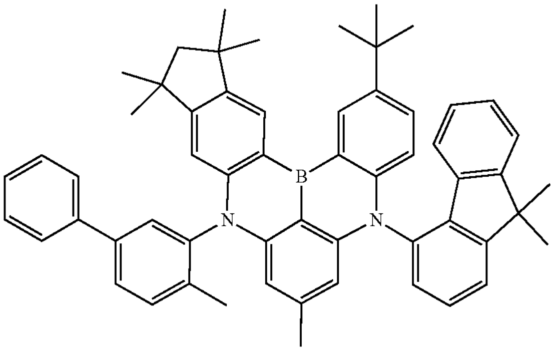
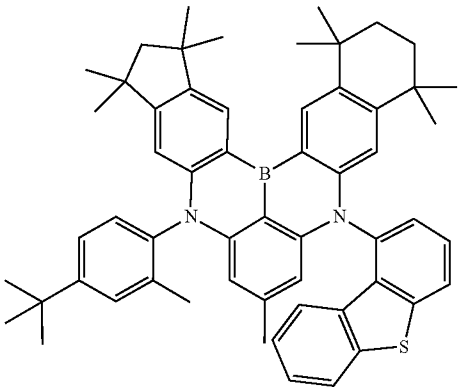

-continued
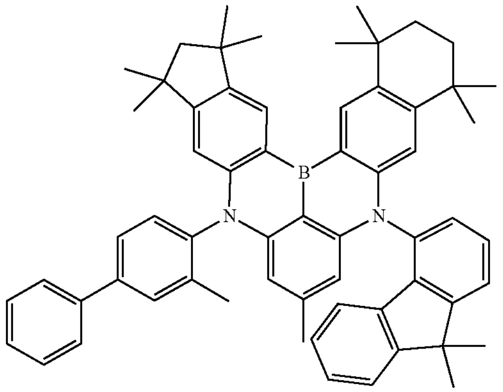
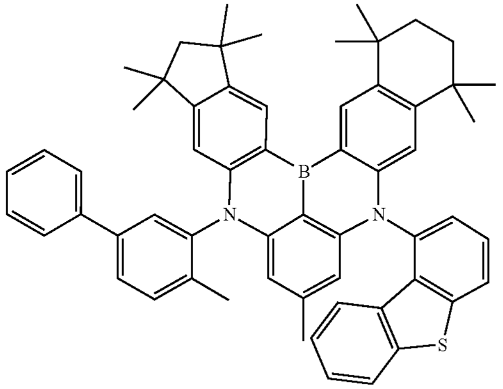
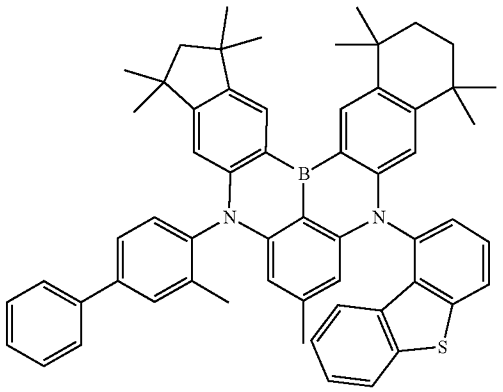
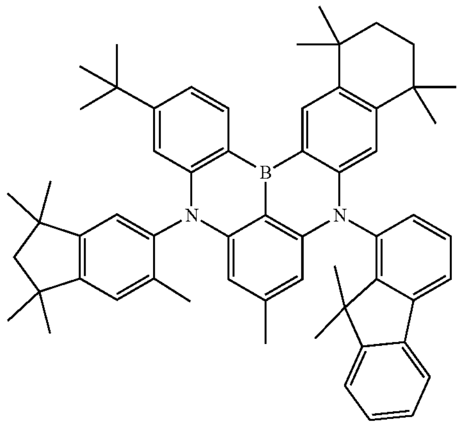
-continued
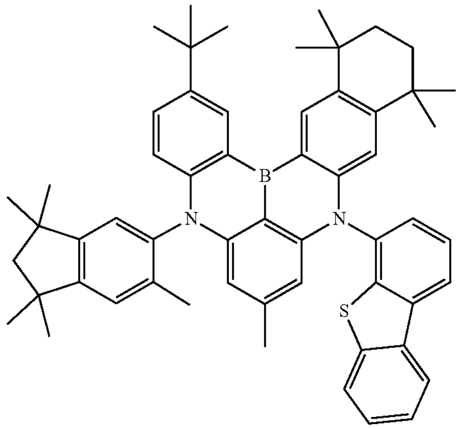
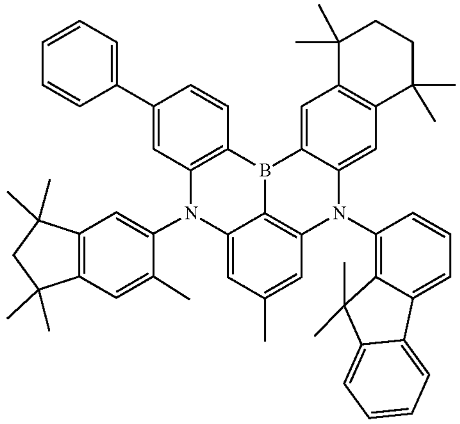
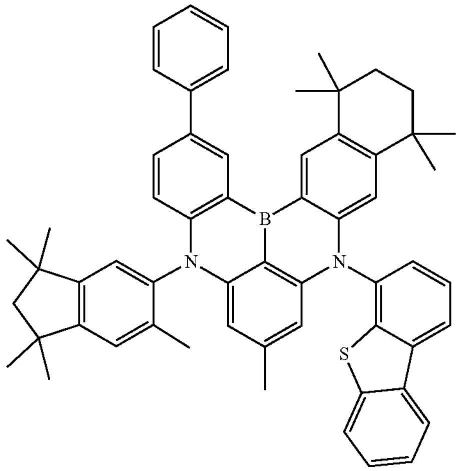
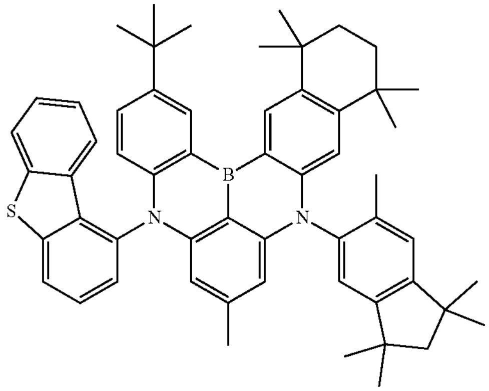

-continued
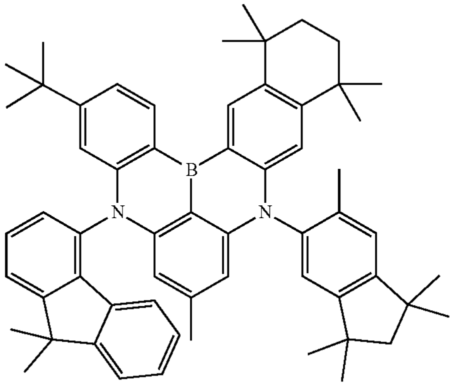
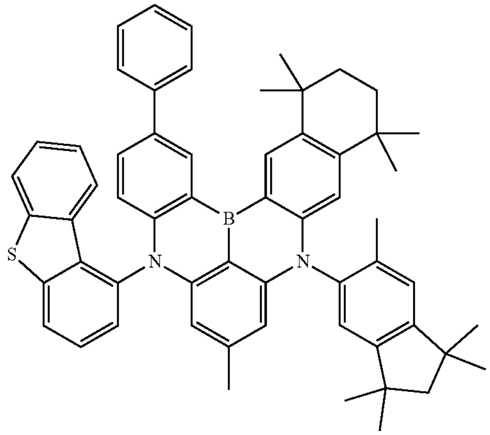
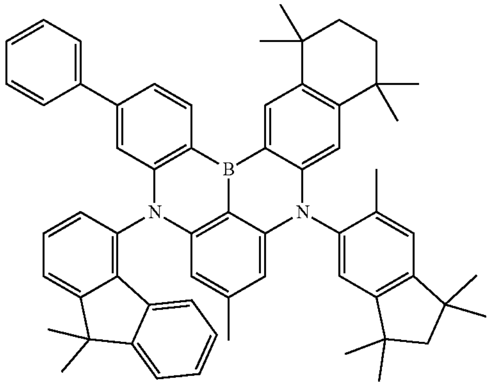
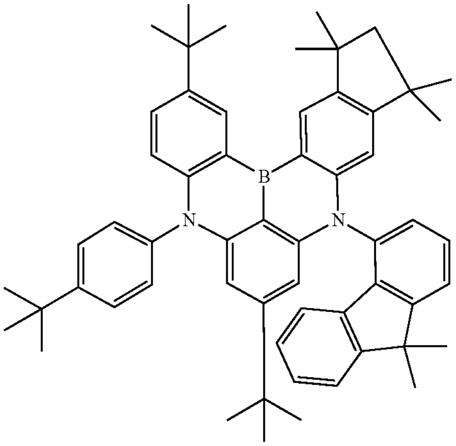
-continued
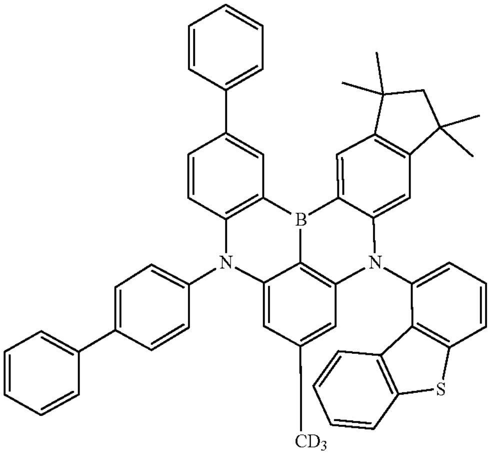
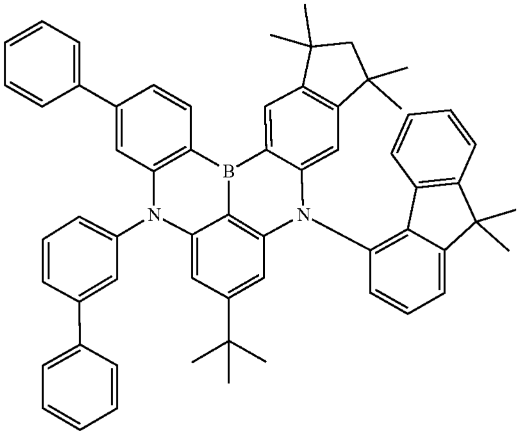
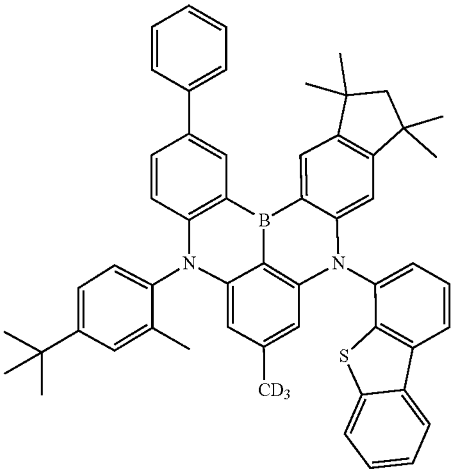
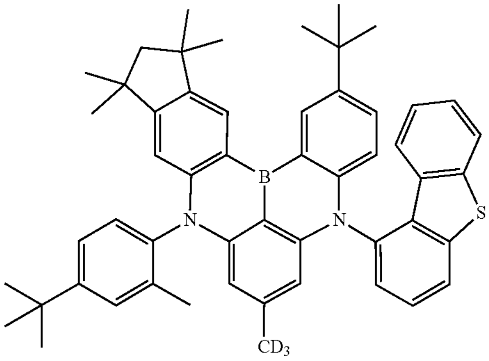

-continued
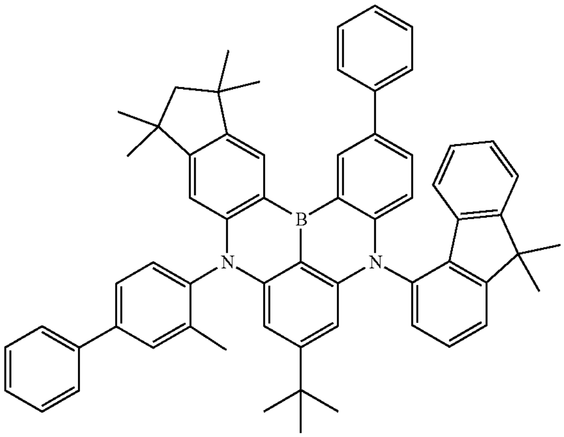
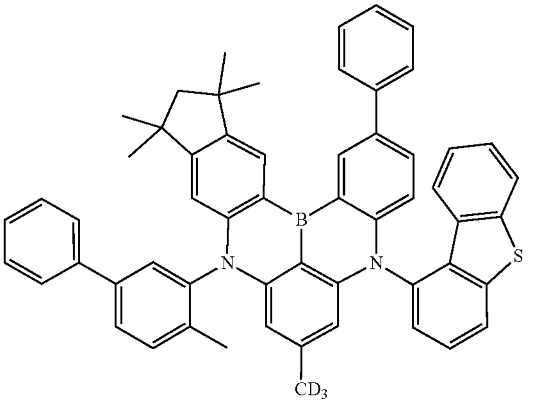
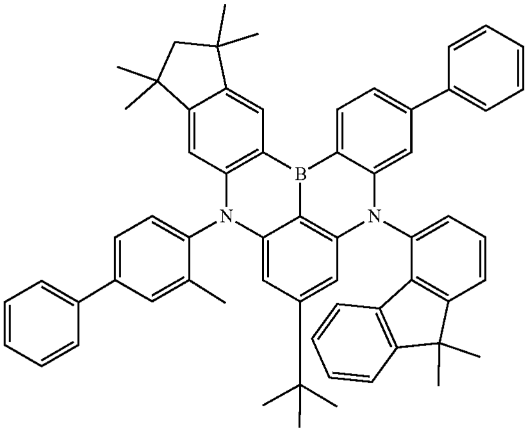
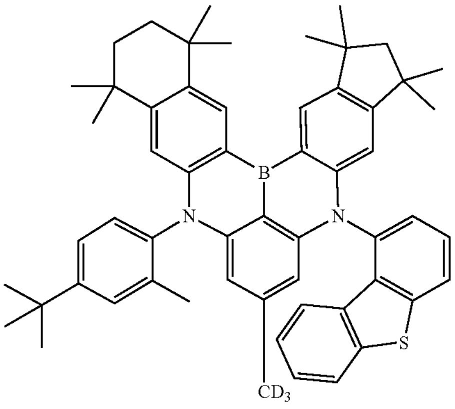
-continued
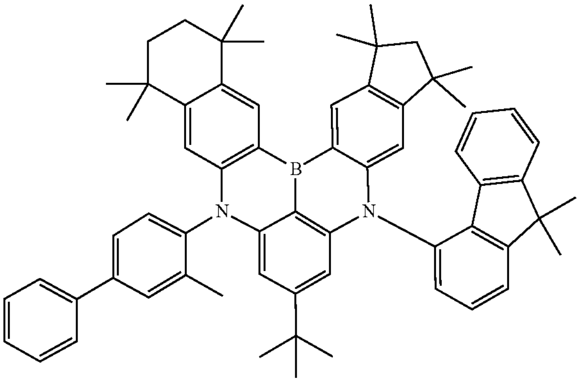
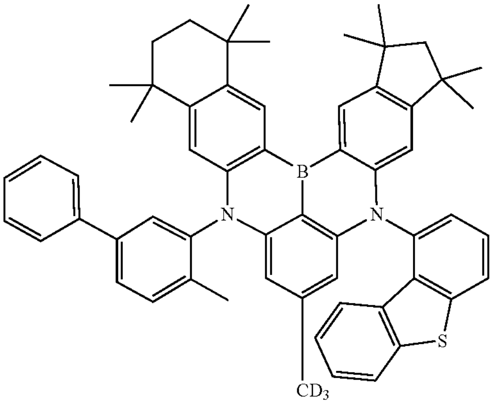
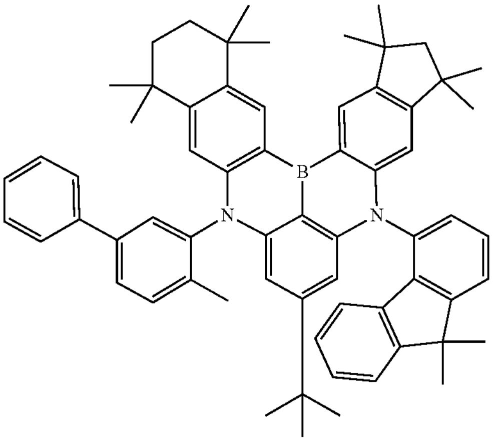
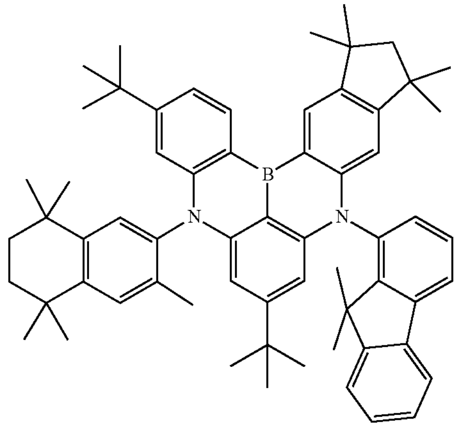

-continued
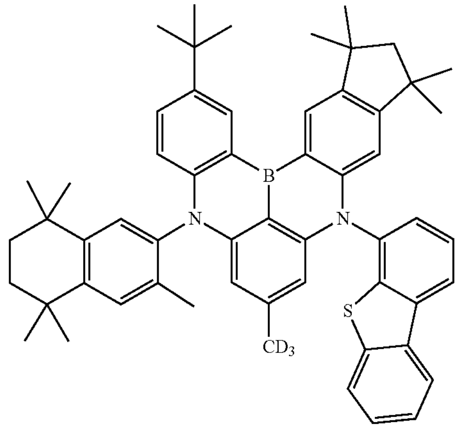
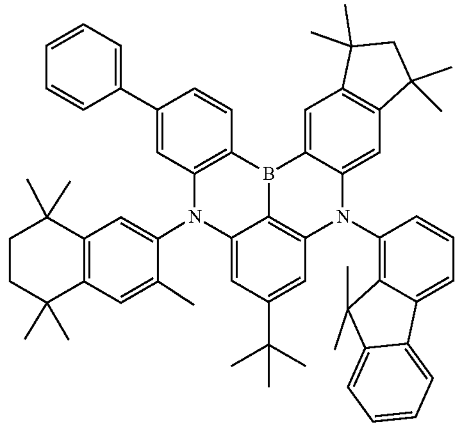
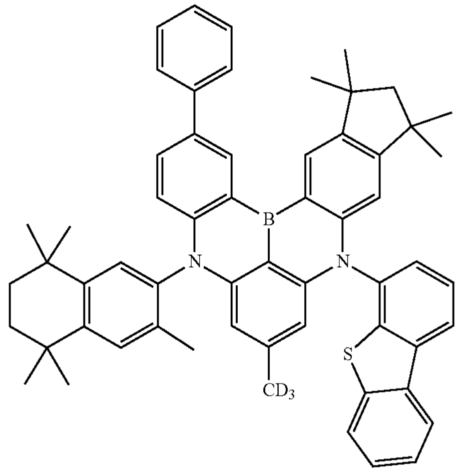
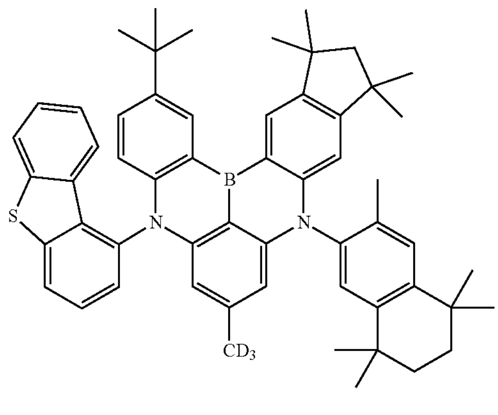
-continued
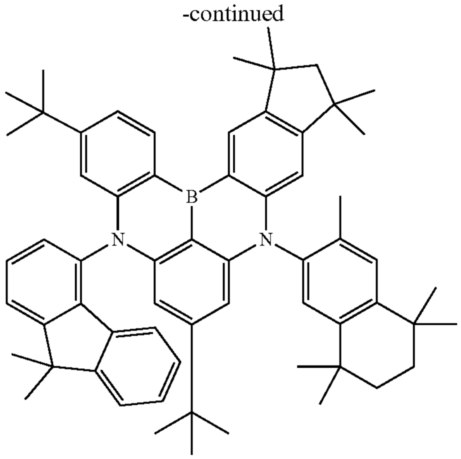
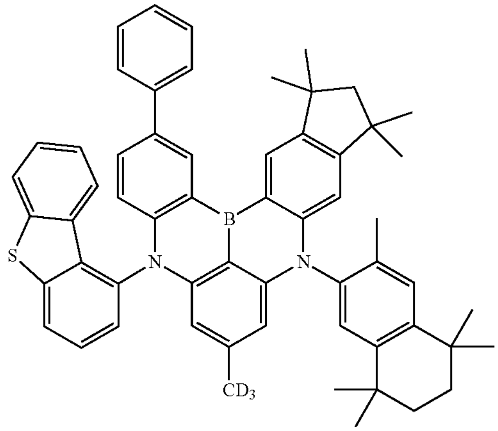
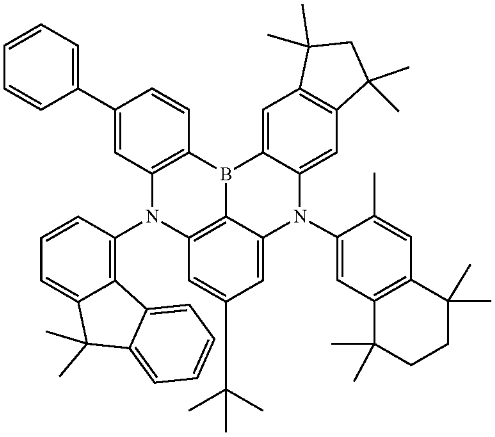
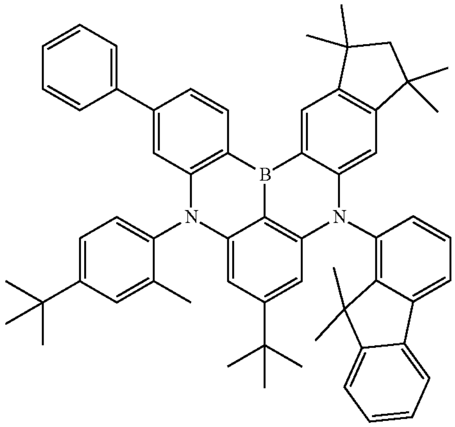

-continued
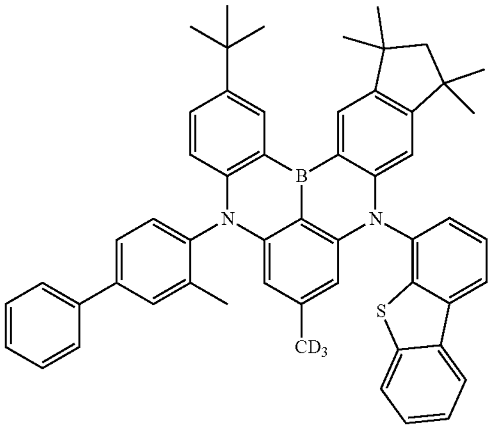
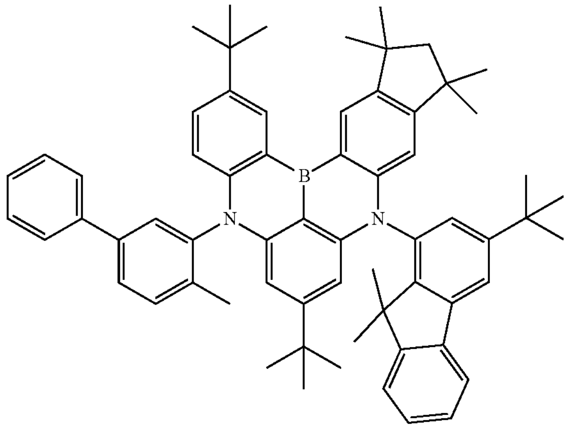
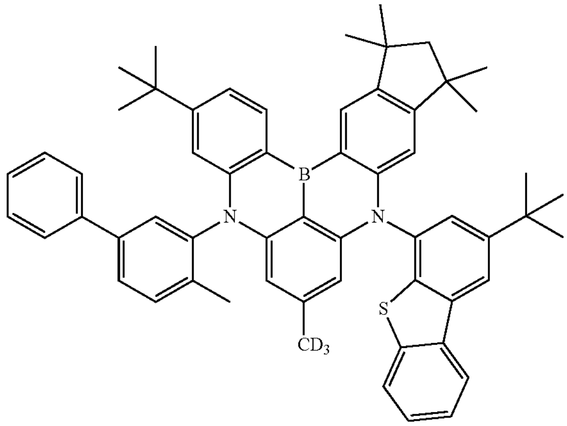
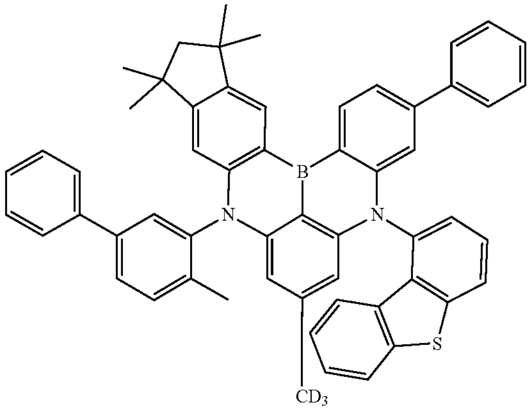
-continued
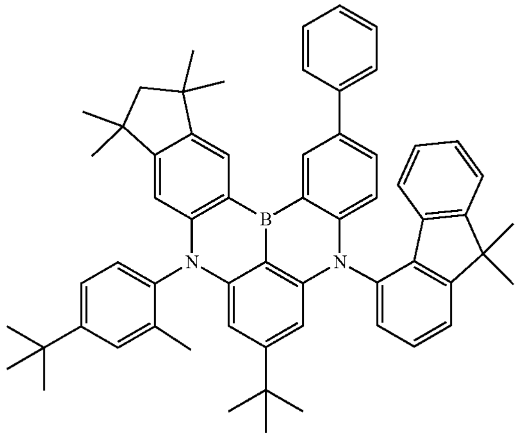
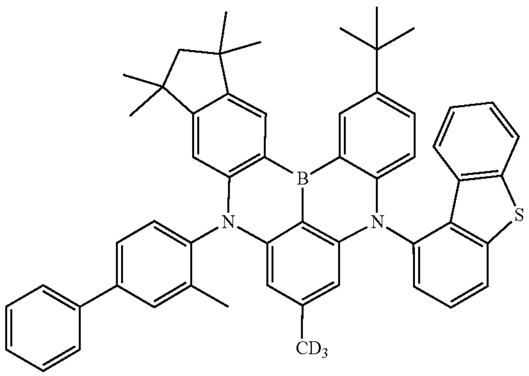
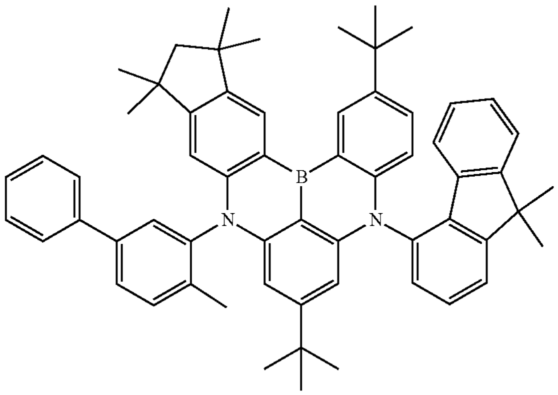
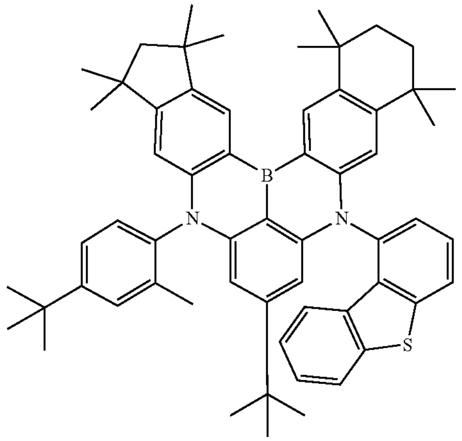

-continued
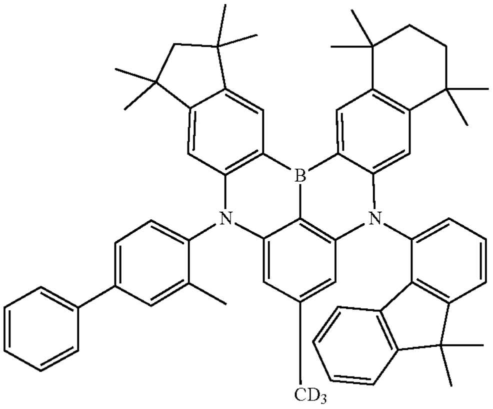
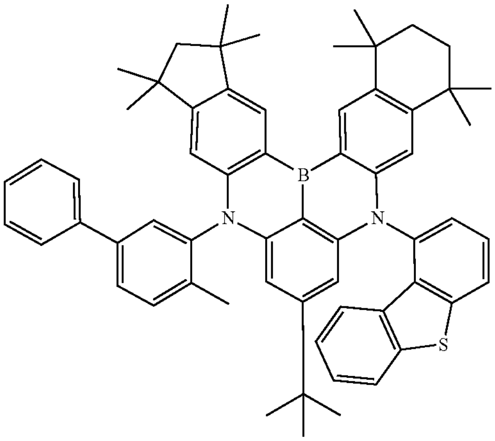
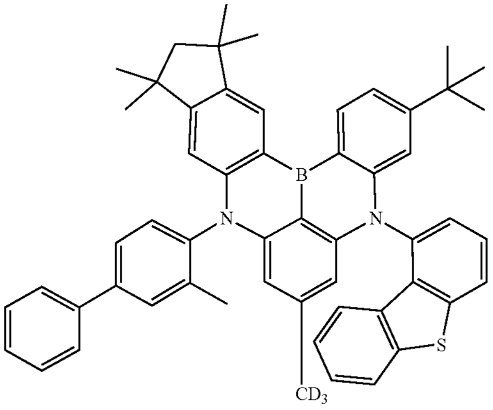
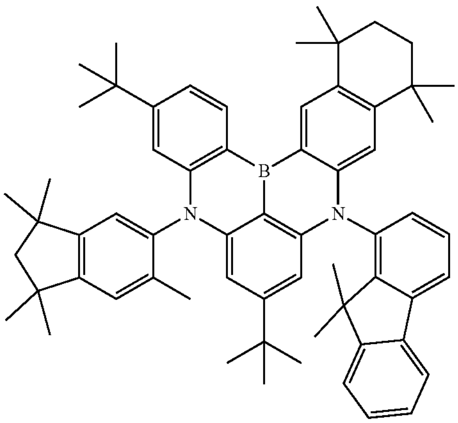
-continued
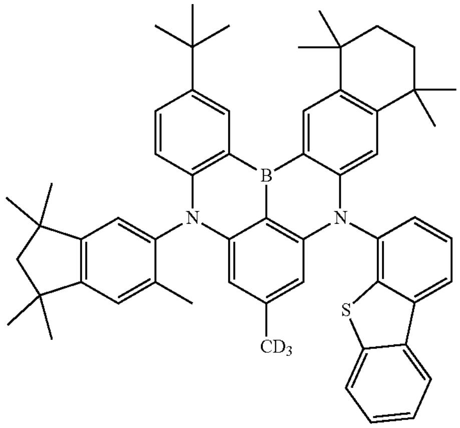
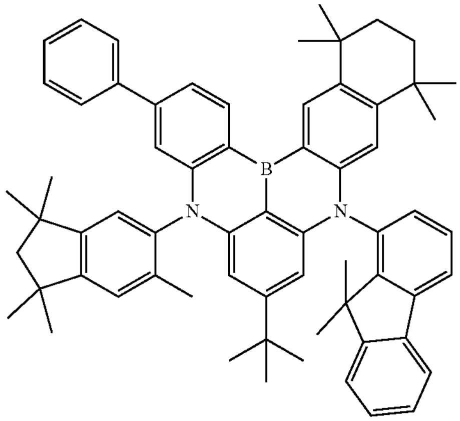
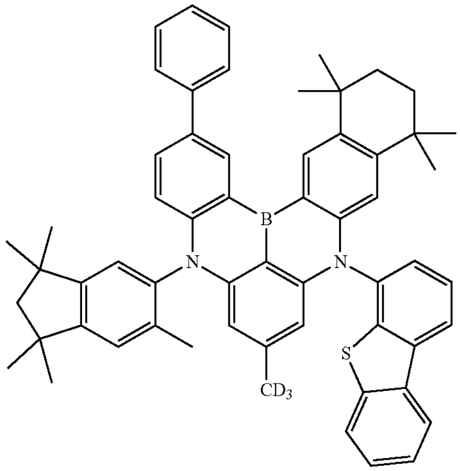
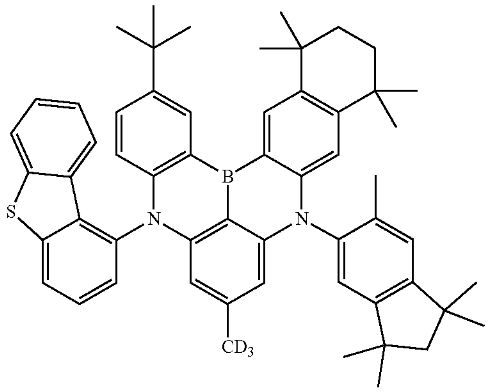

-continued
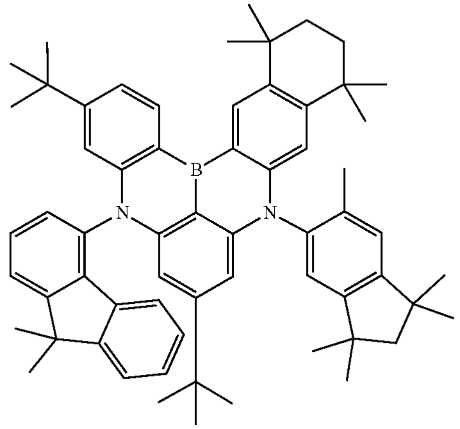
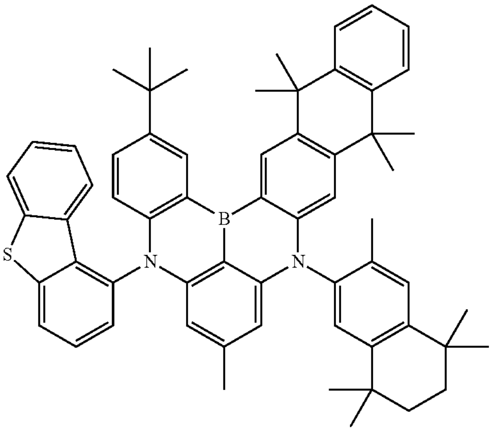
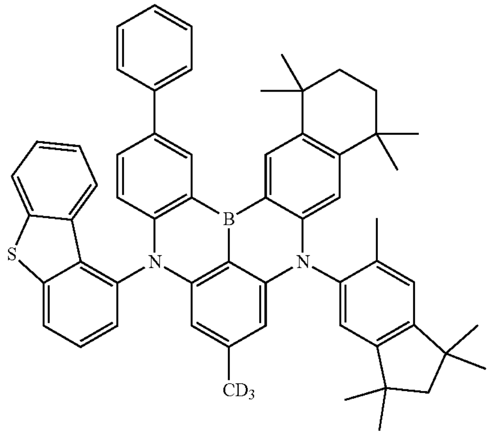
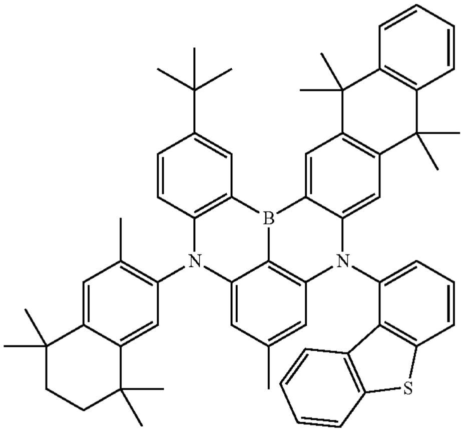
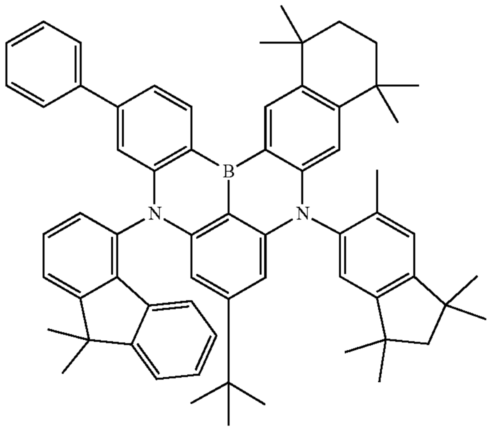
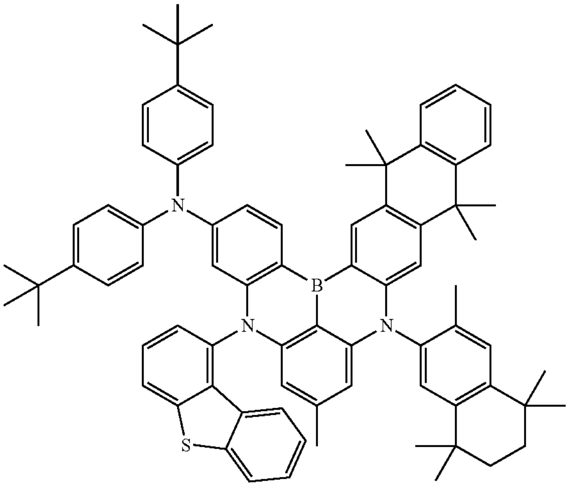

-continued
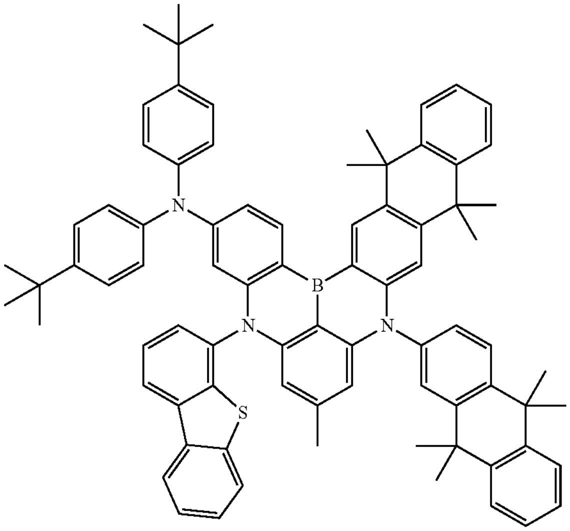
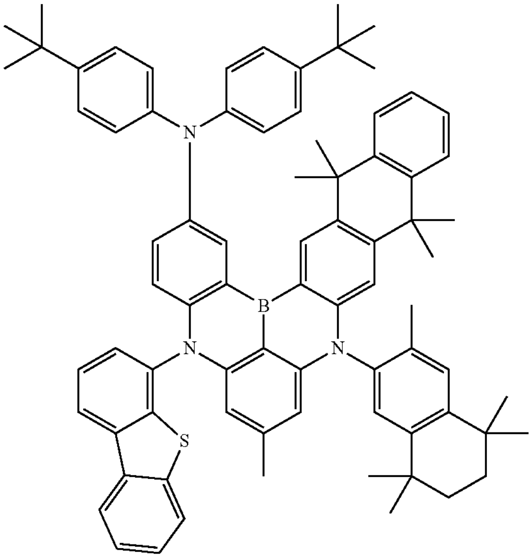
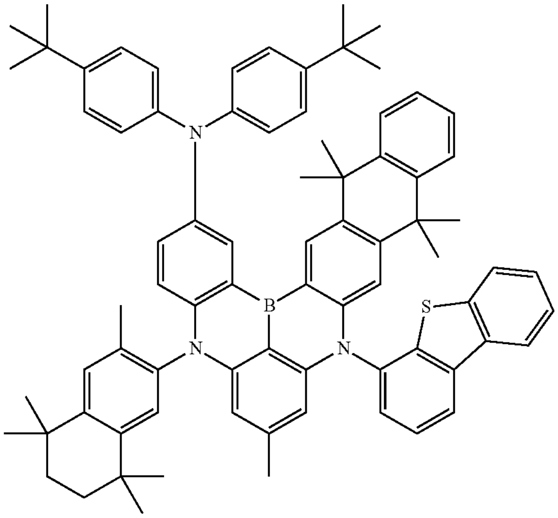
-continued
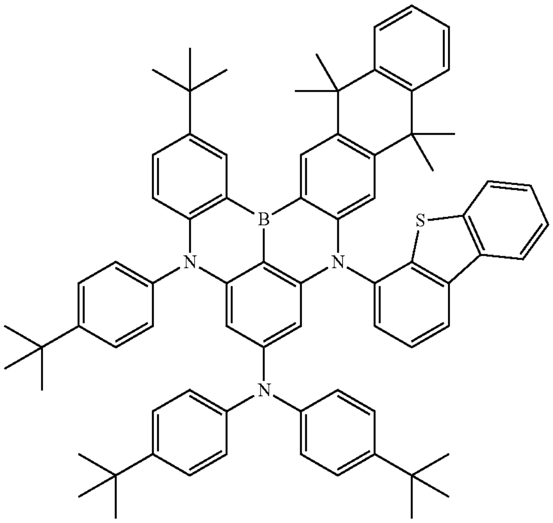
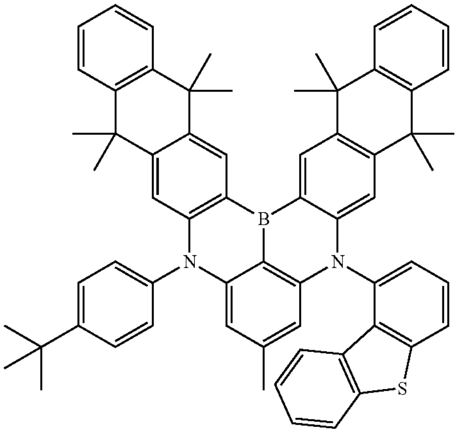
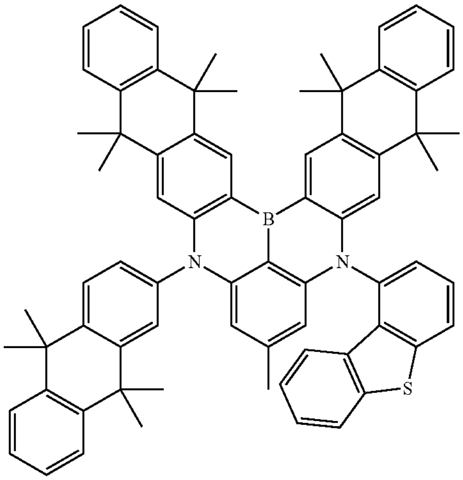

-continued
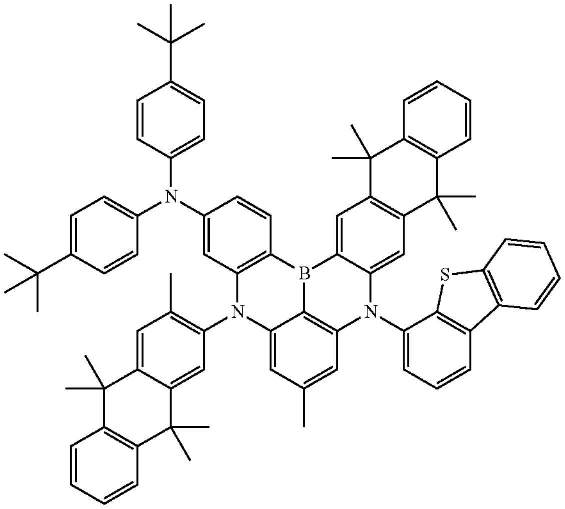
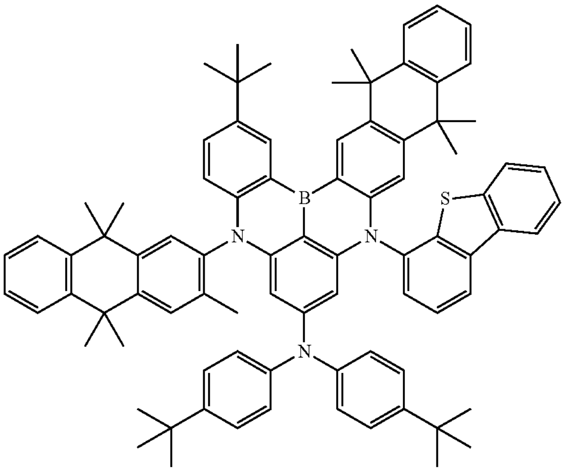
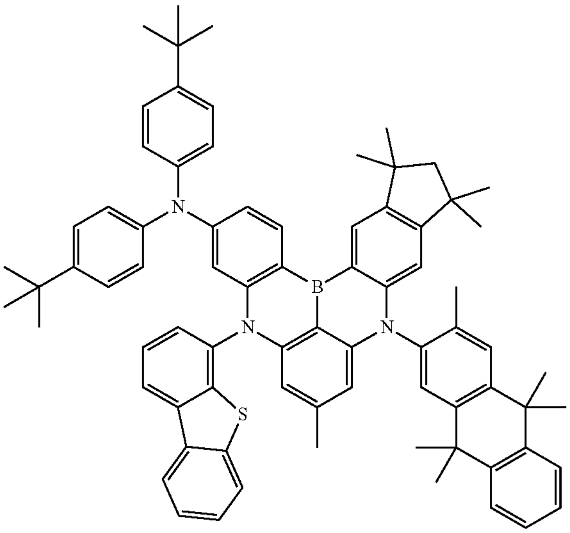
-continued
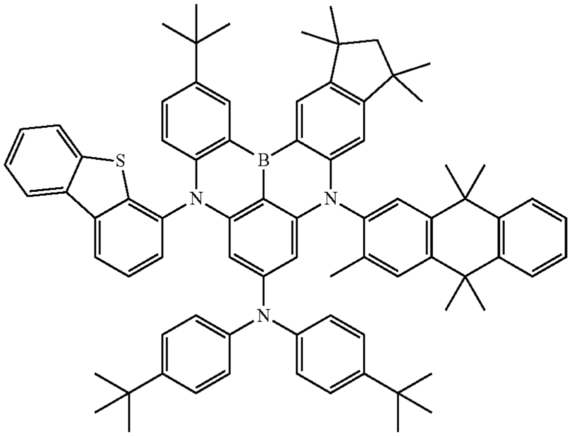
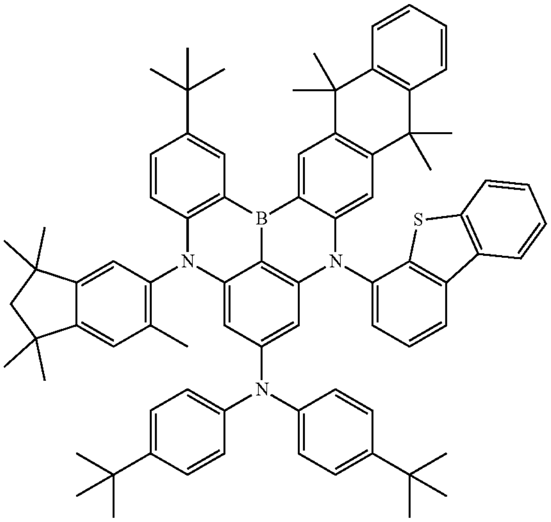
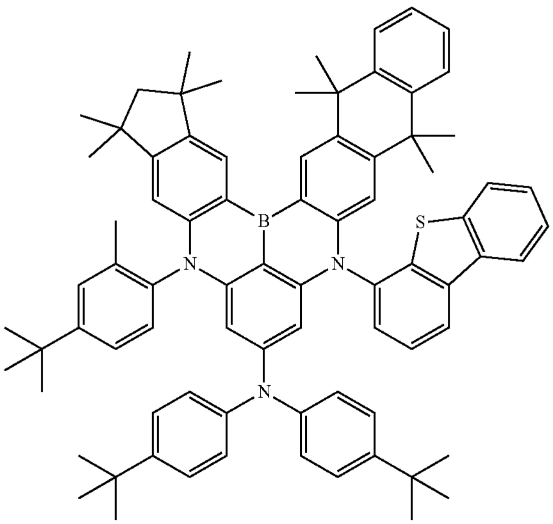

-continued
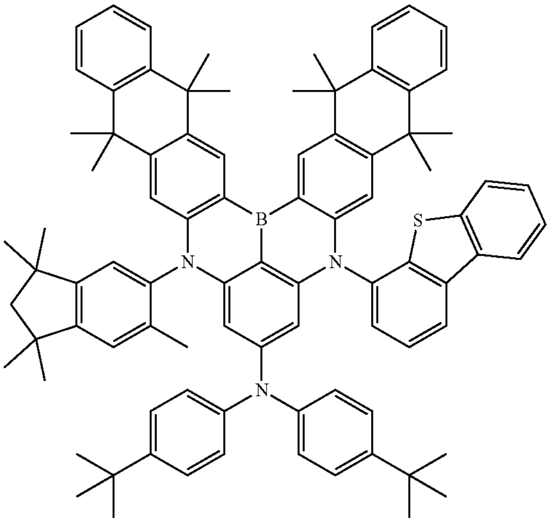
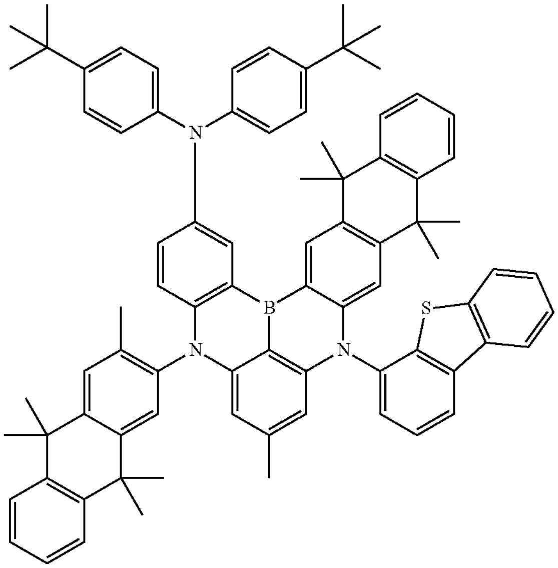
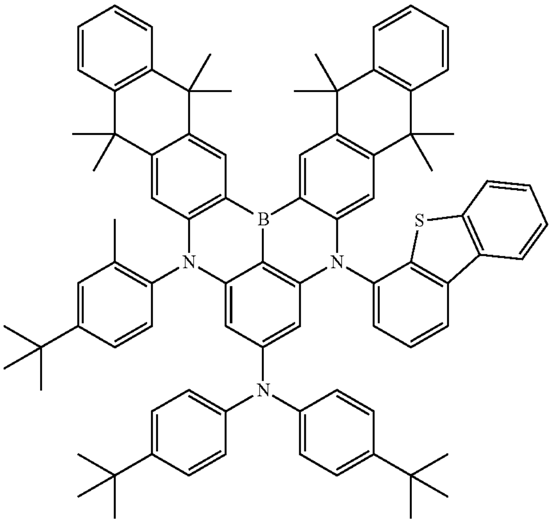
-continued
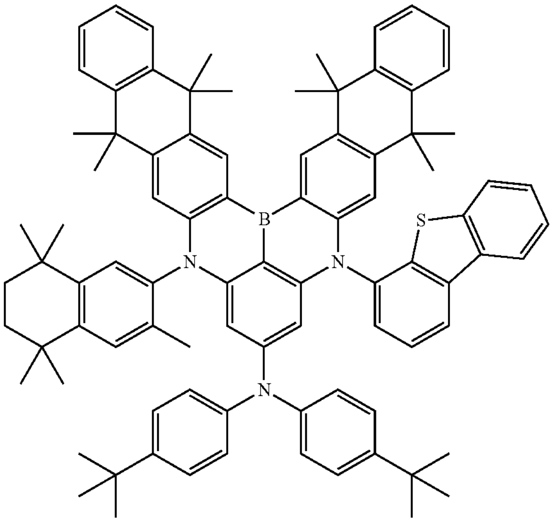
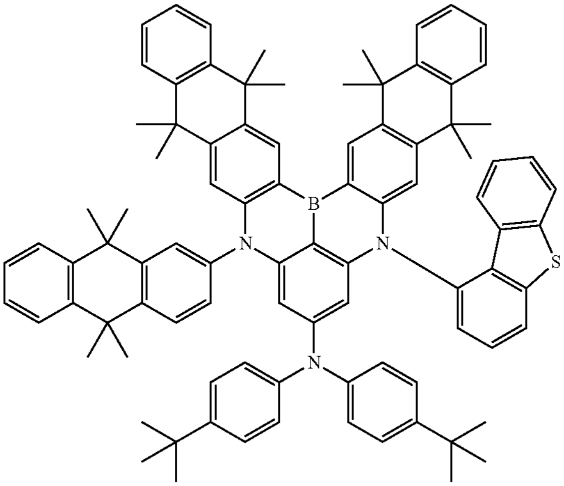
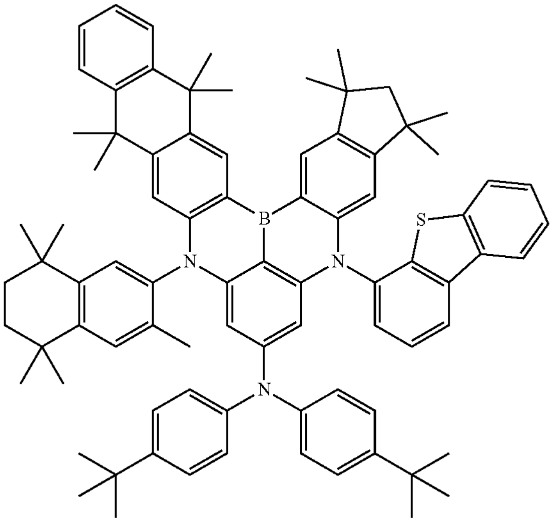

-continued
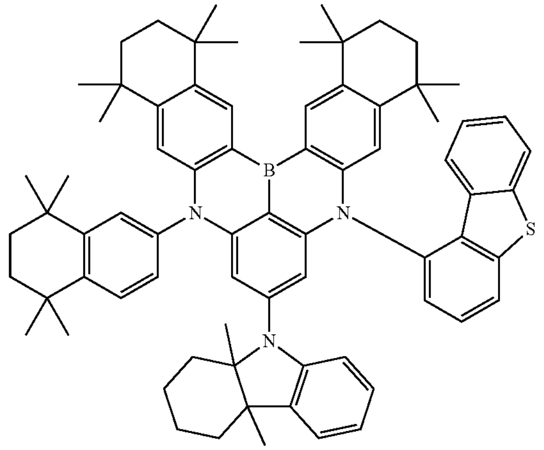
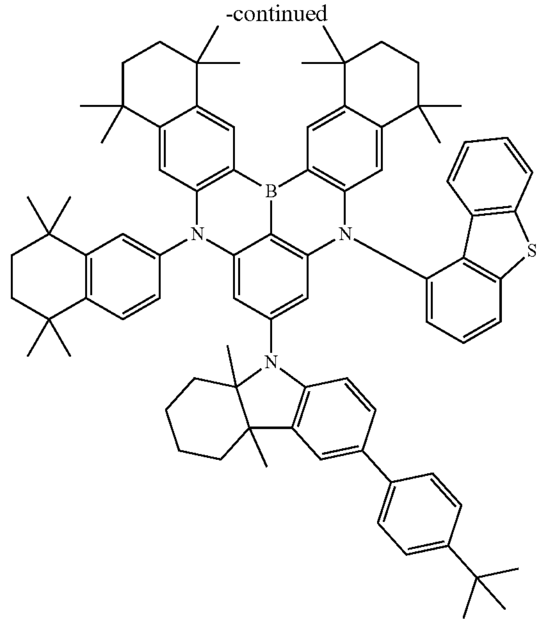
-continued
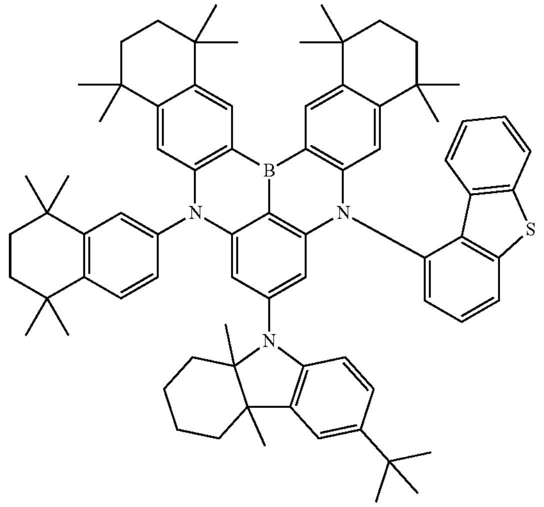
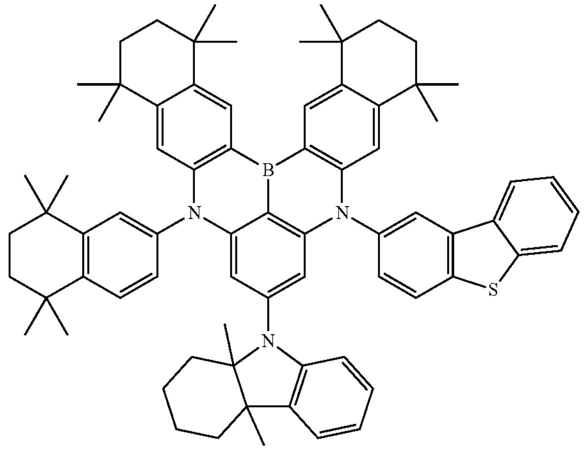
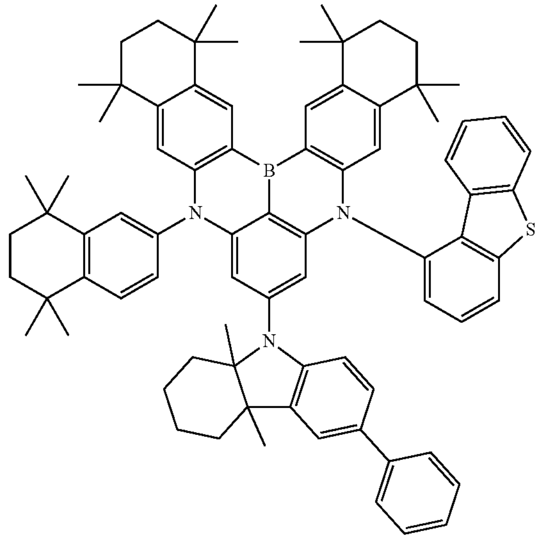
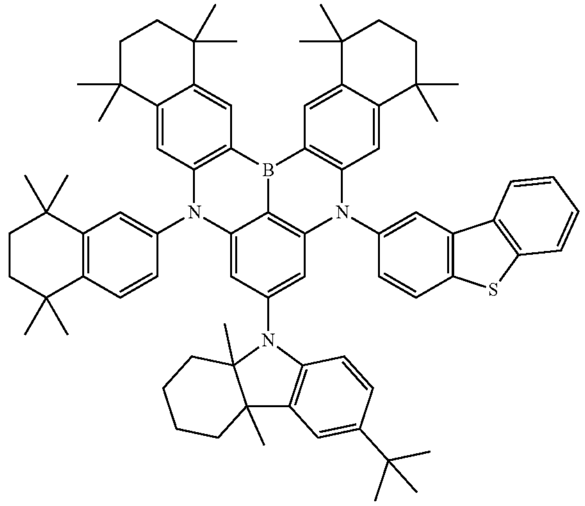

-continued
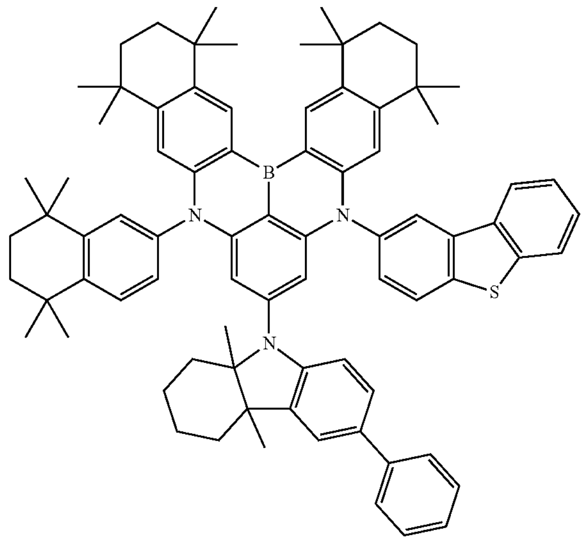
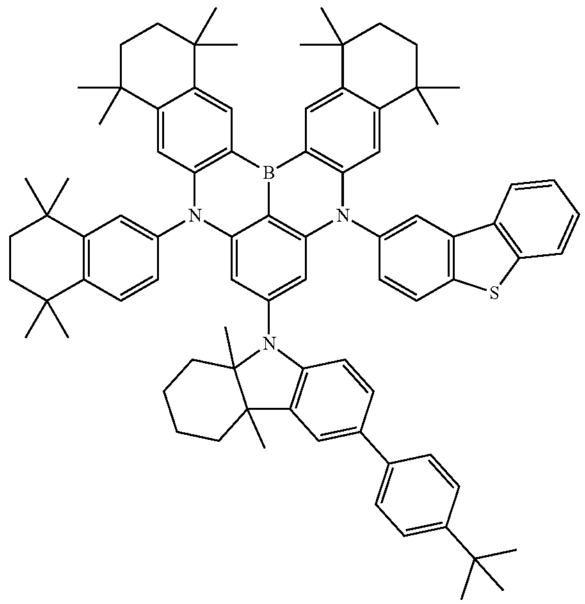
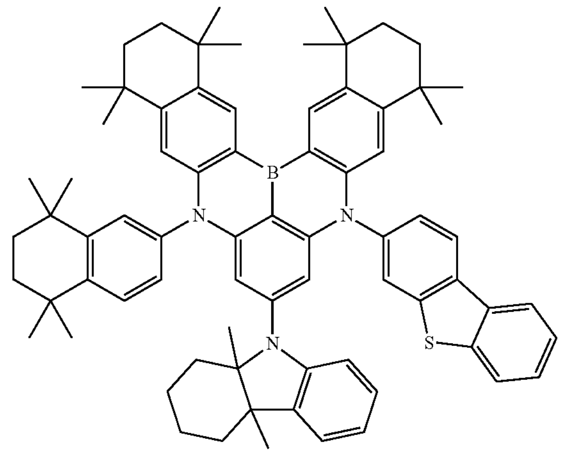
-continued
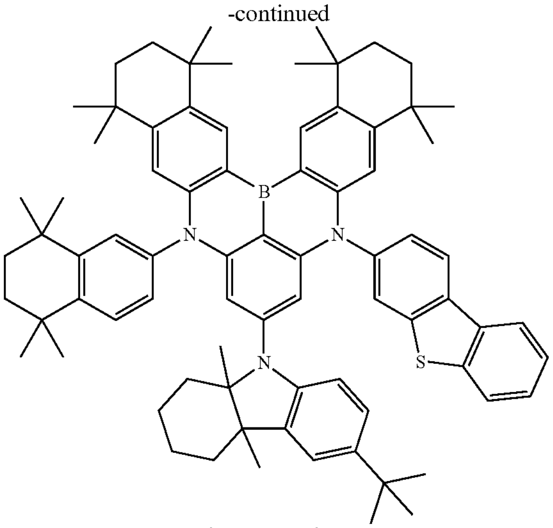
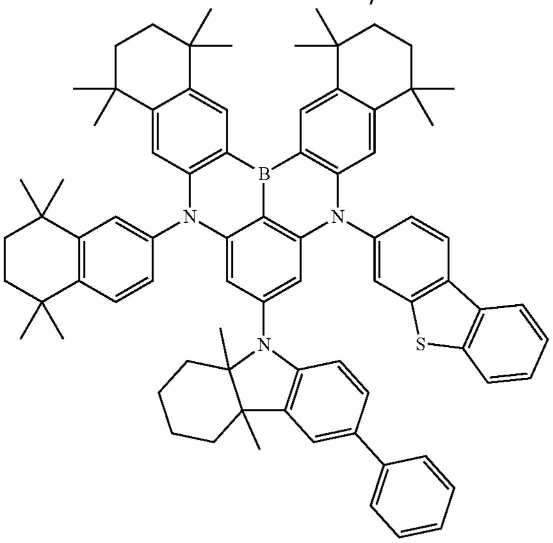
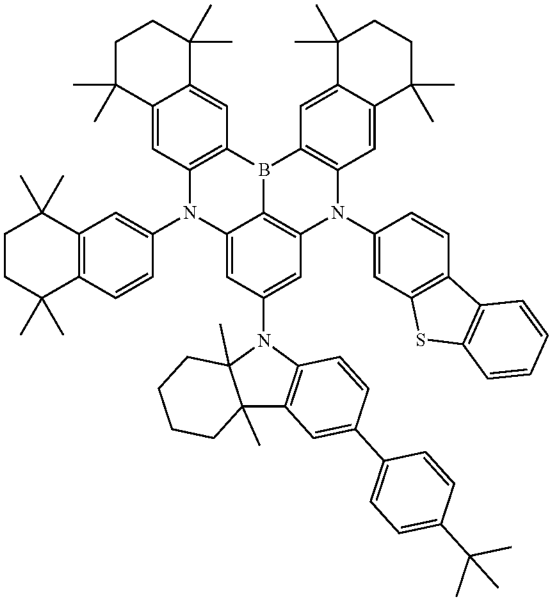

-continued
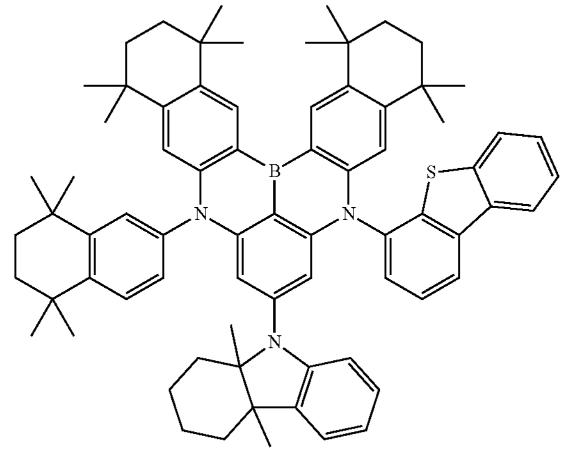
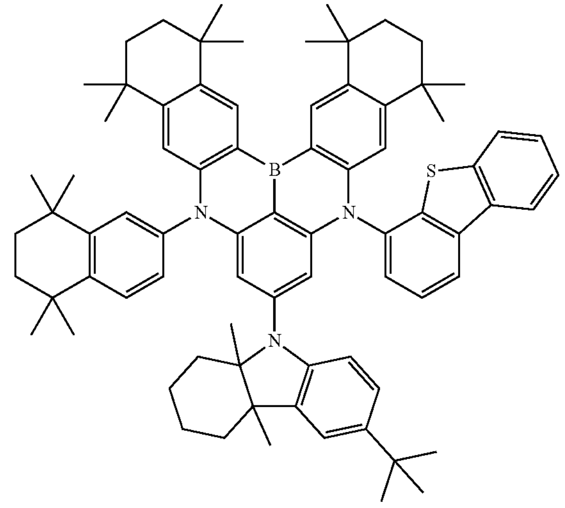
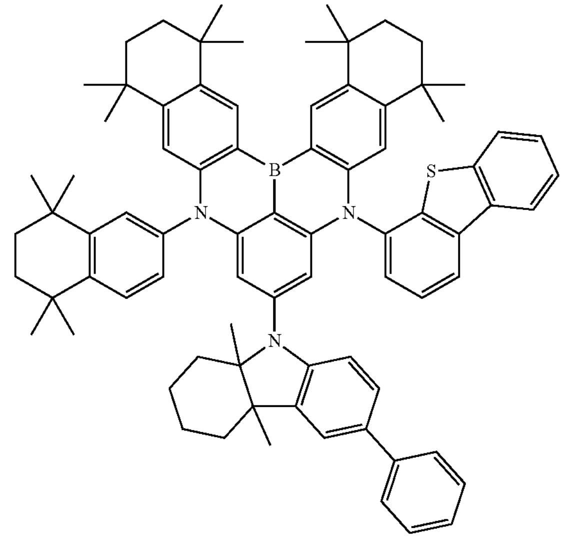
-continued
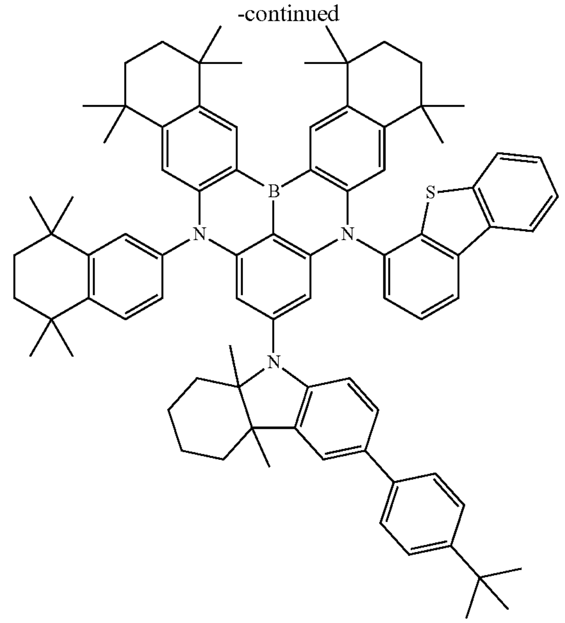
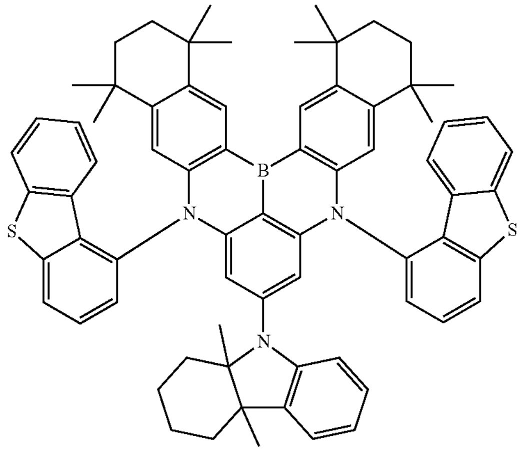
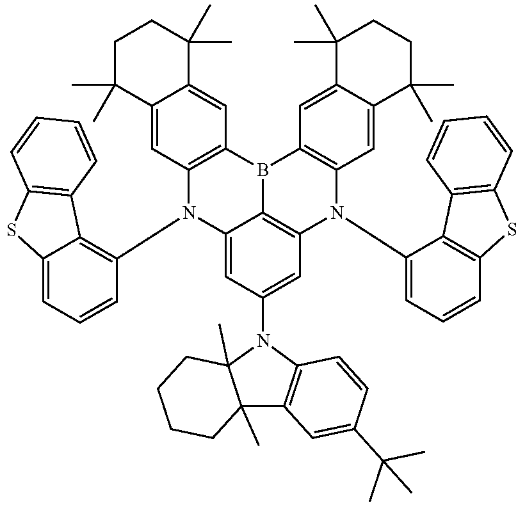

-continued
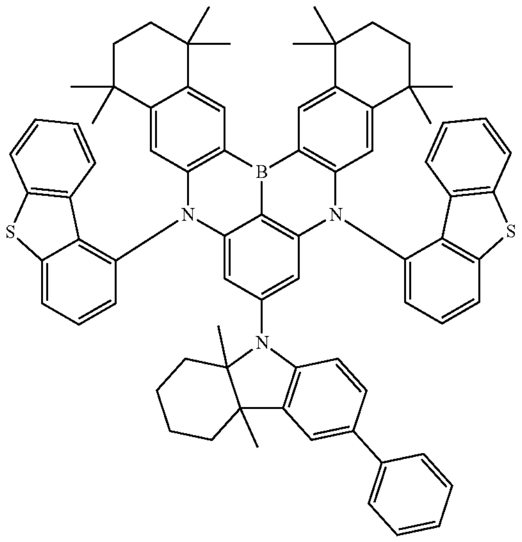
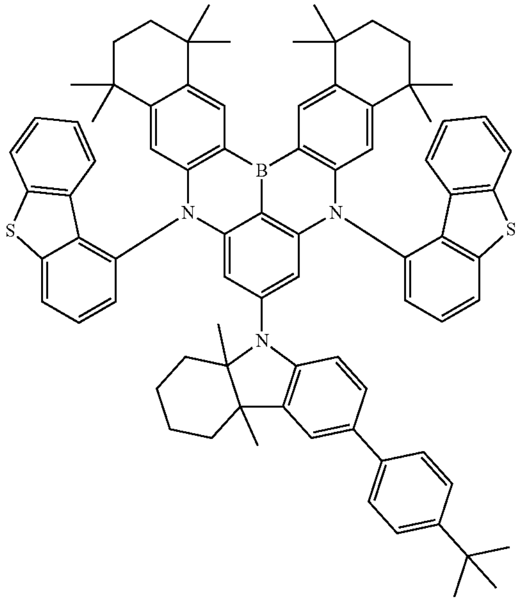
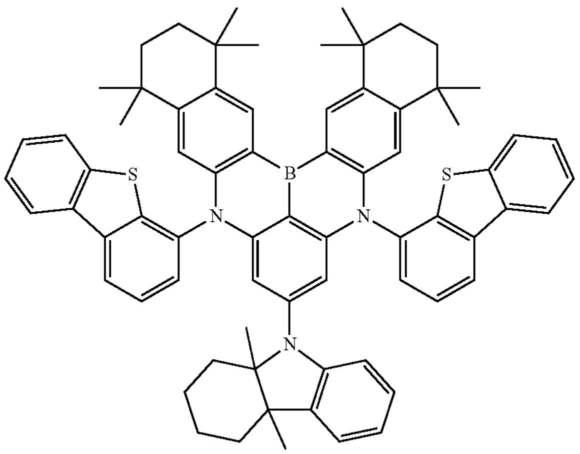
-continued
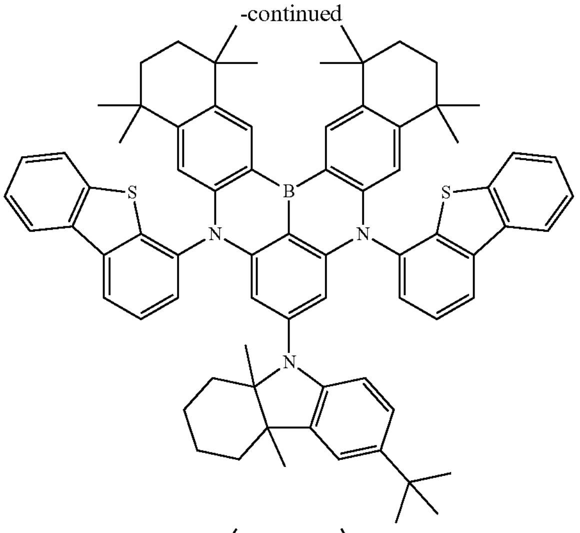
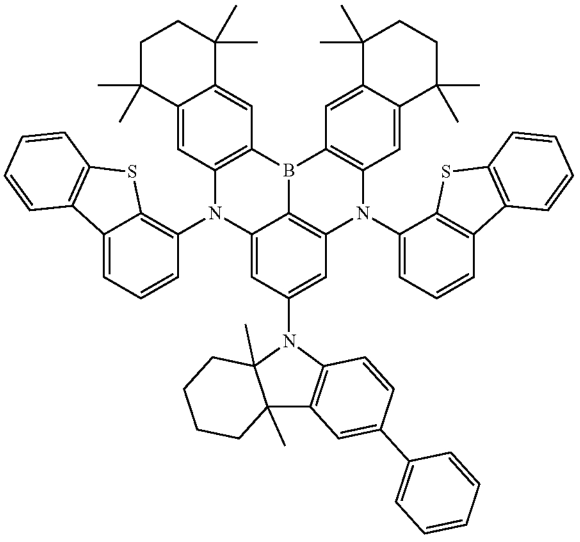
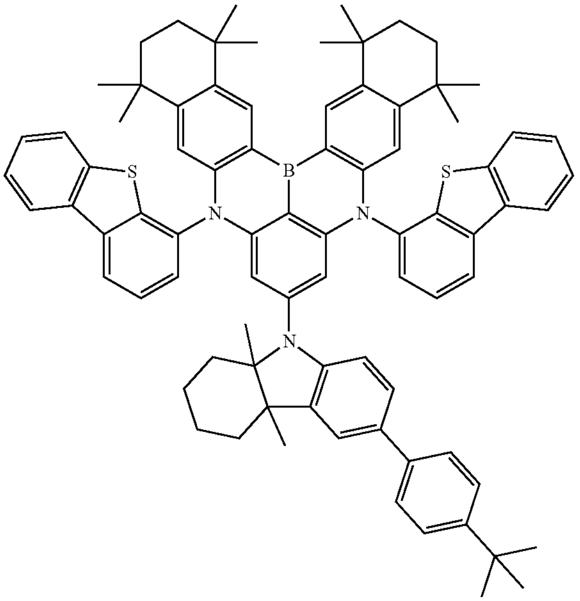

-continued
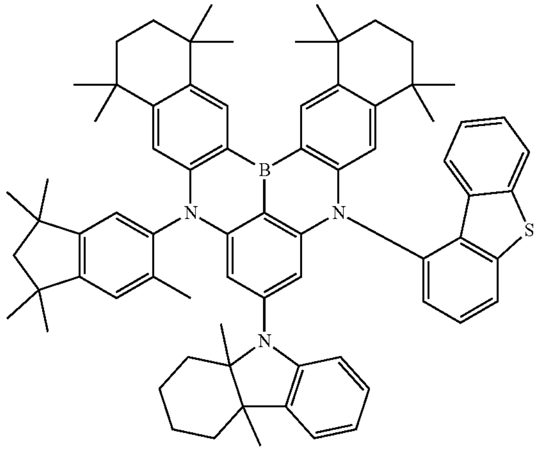
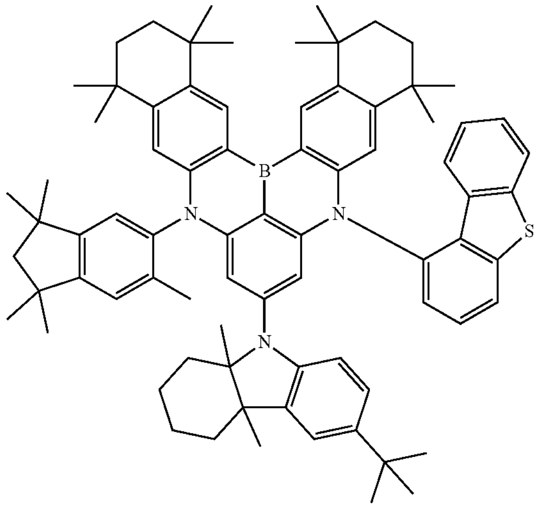
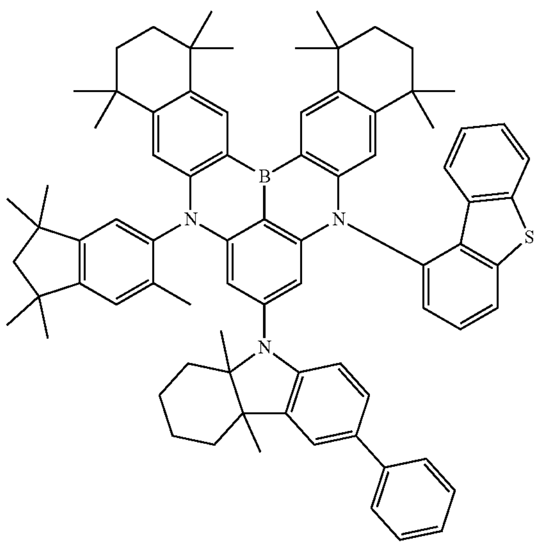
-continued
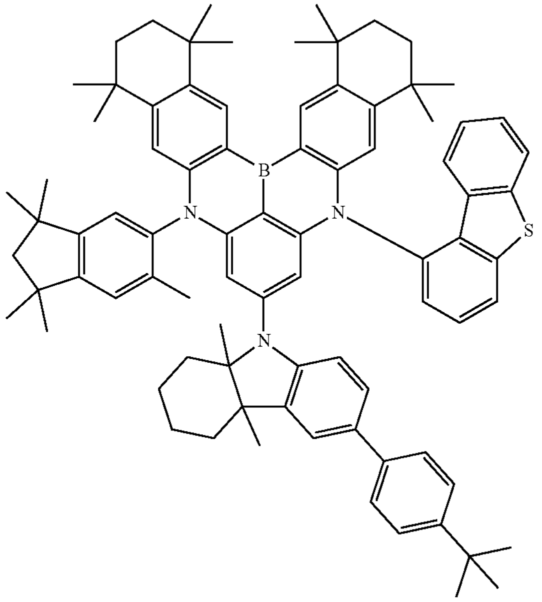 [SMILES: Cc1cc2c(cc1N1c3cc4c(cc3B3c5cc6c(cc5N(c5cccc7sc8ccccc8c57)c5cc(N7c8ccc(-c9ccc(C(C)(C)C)cc9)cc8C8(C)CCCCC78C)cc1c53)C(C)(C)CCC6(C)C)C(C)(C)CCC4(C)C)C(C)(C)CC2(C)C]
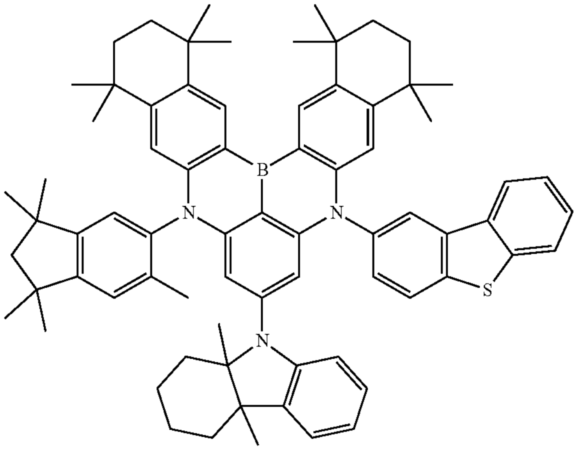
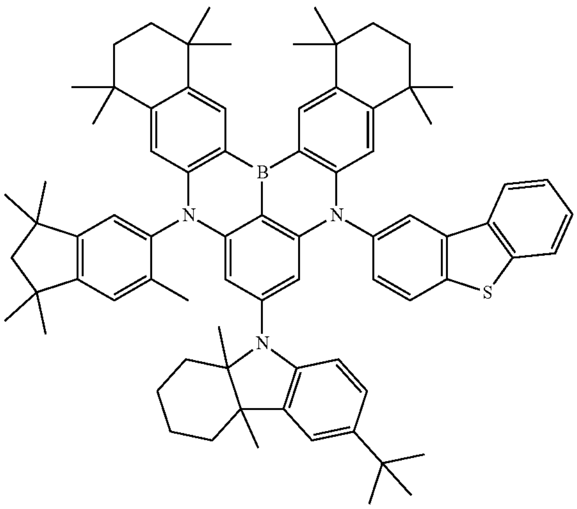

-continued
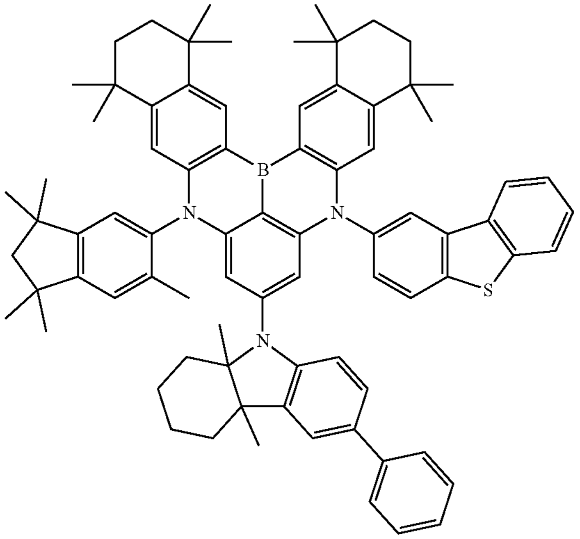
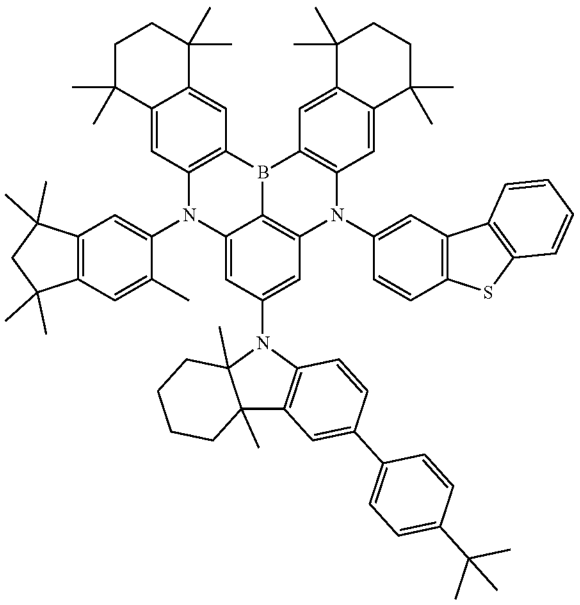
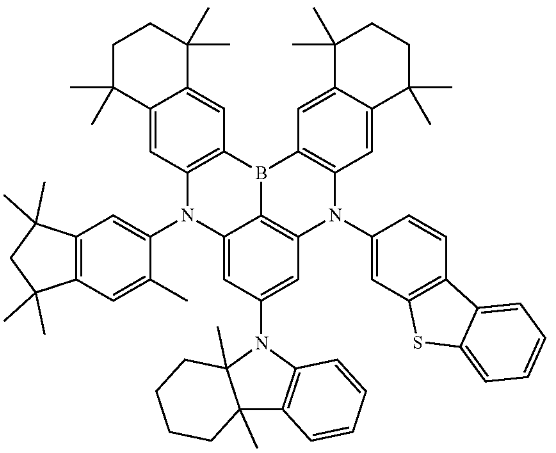
-continued
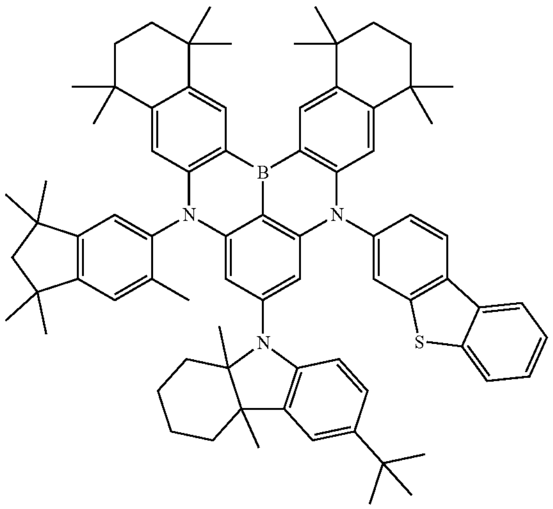
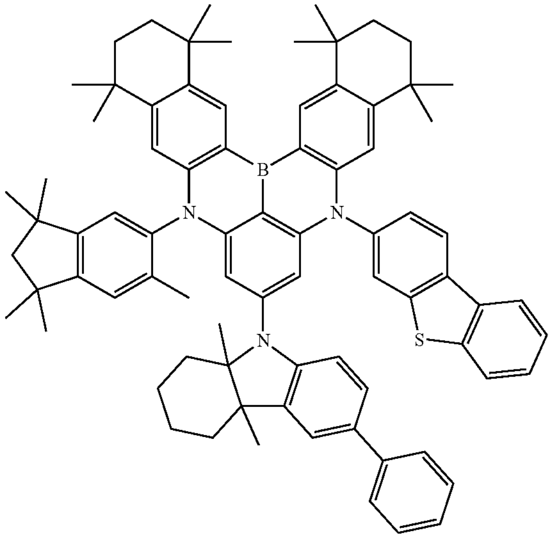
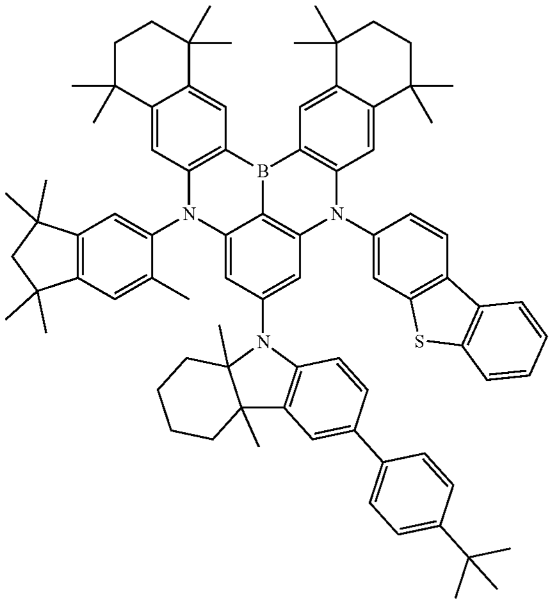

-continued
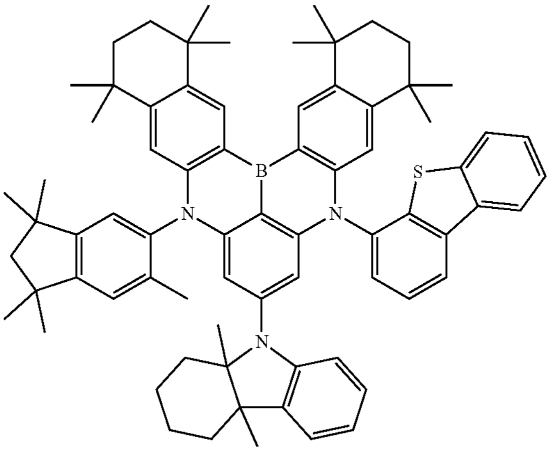
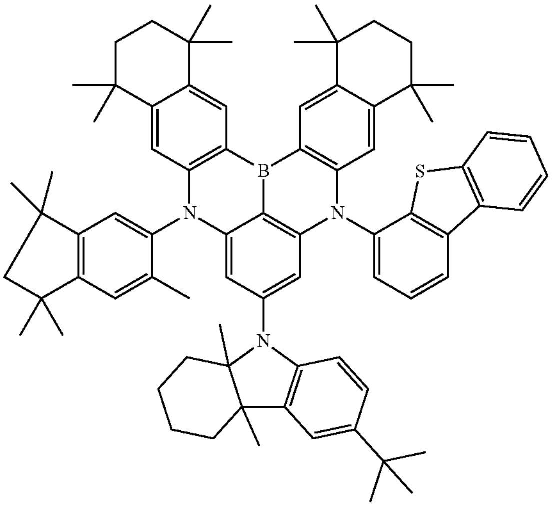
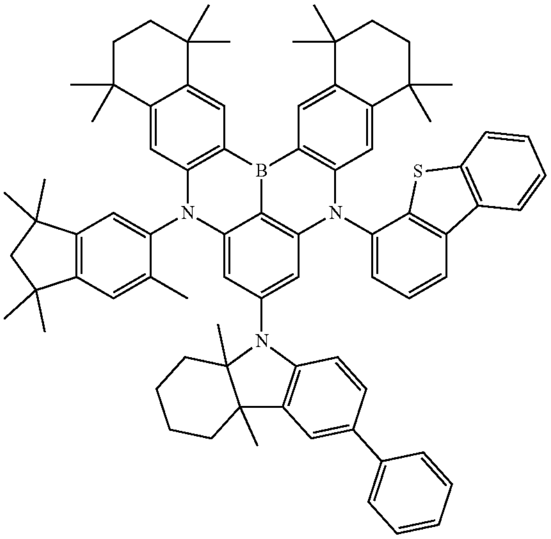
-continued
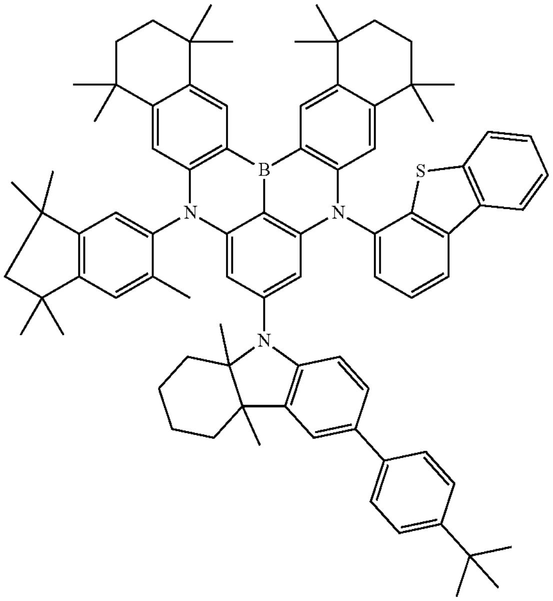
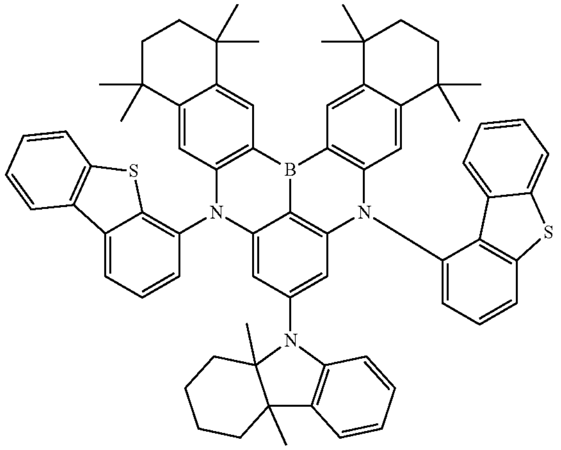
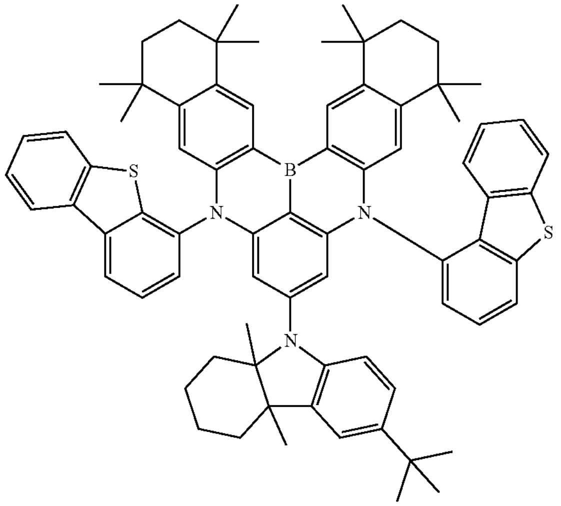

-continued
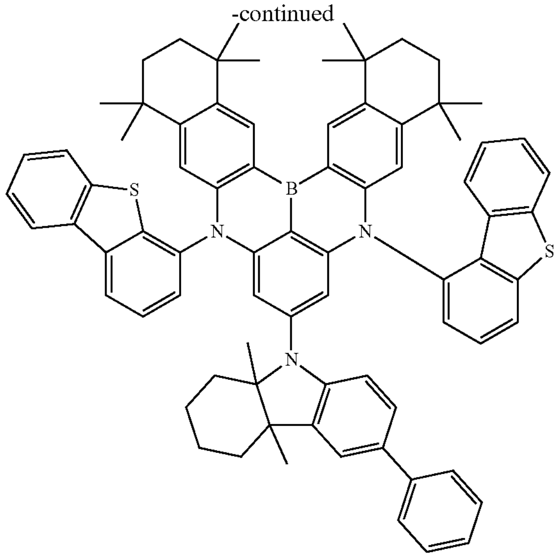
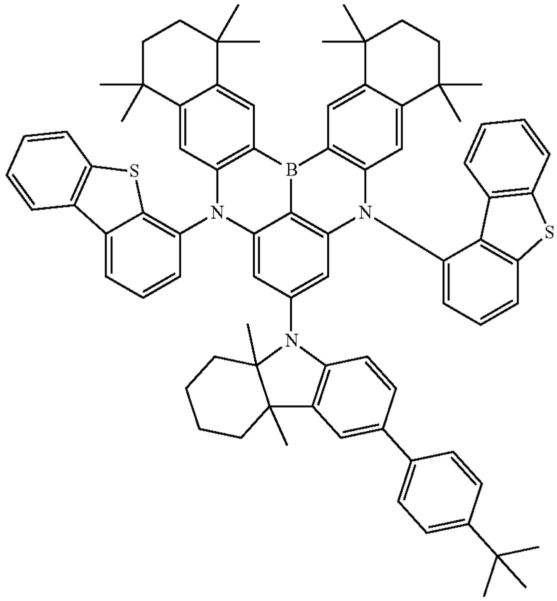
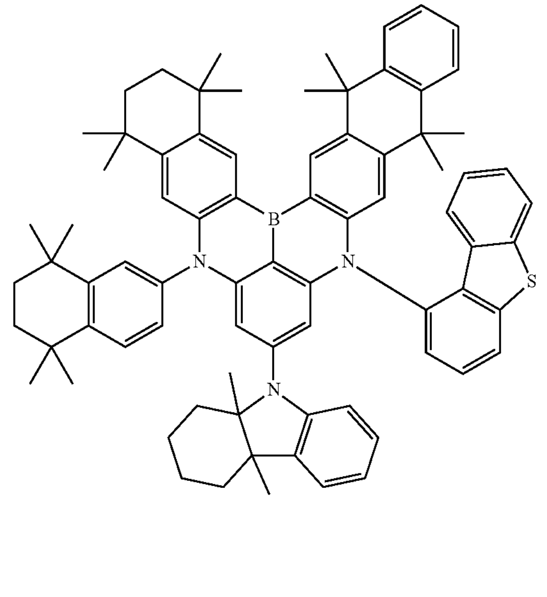
-continued
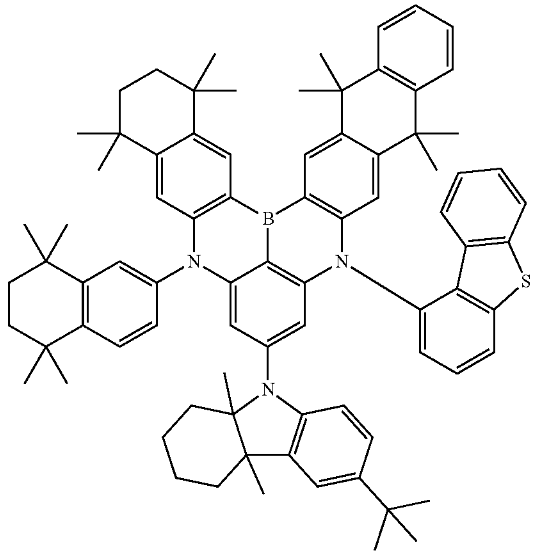
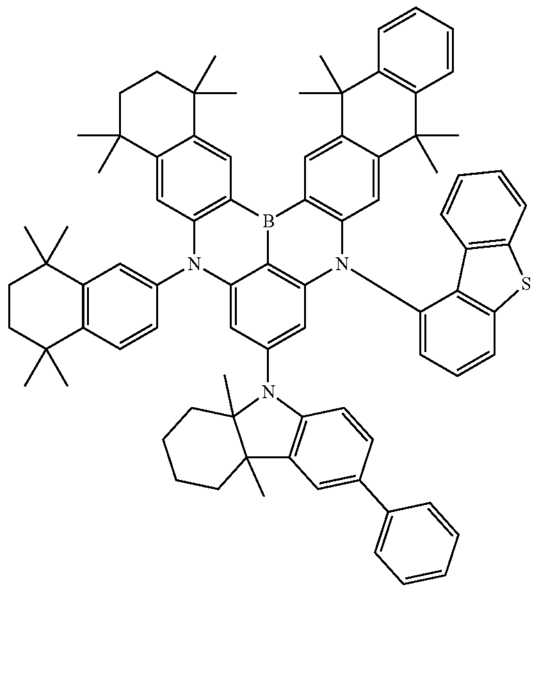

-continued
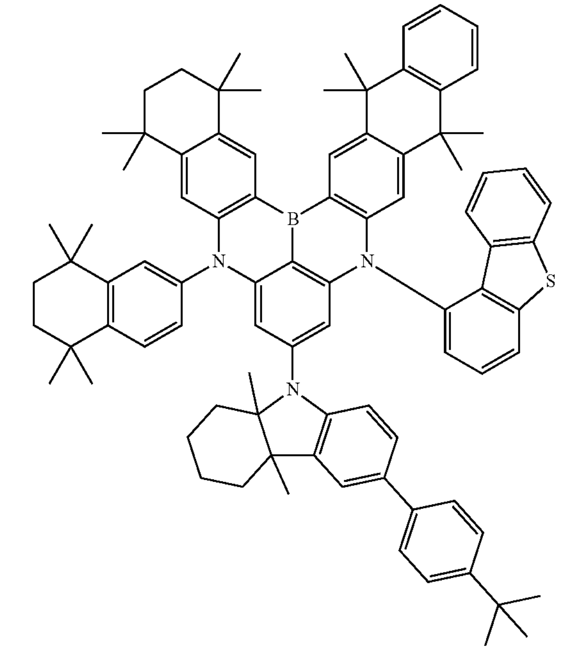
-continued
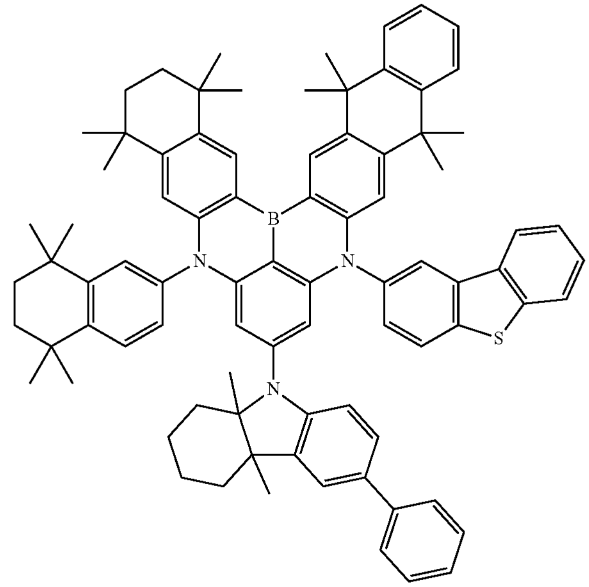
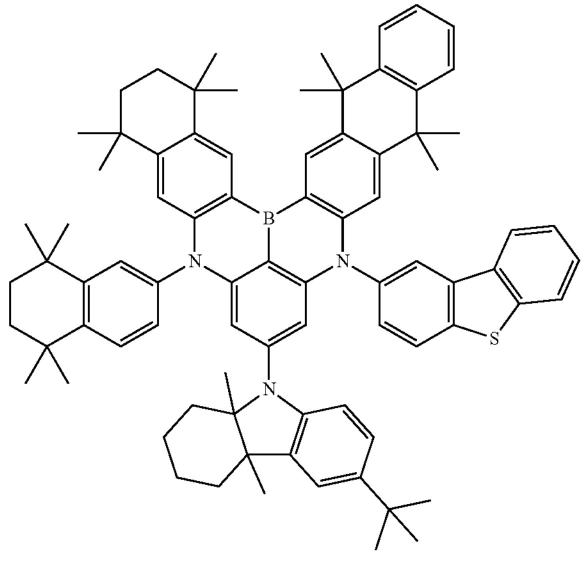
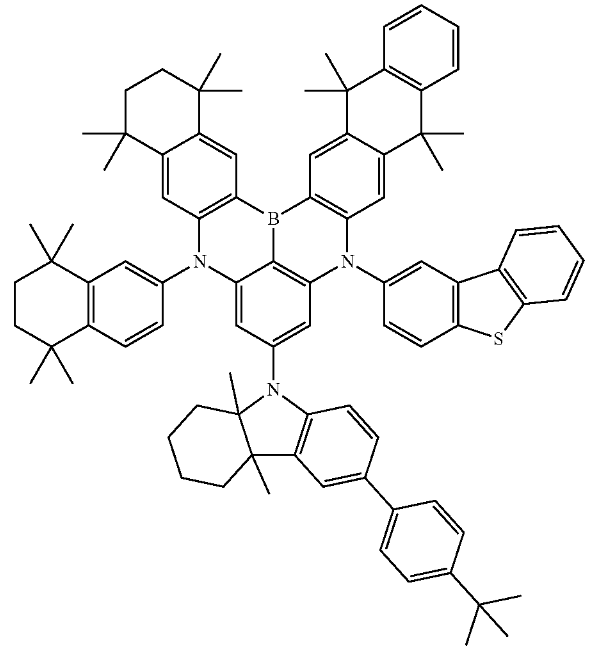

-continued
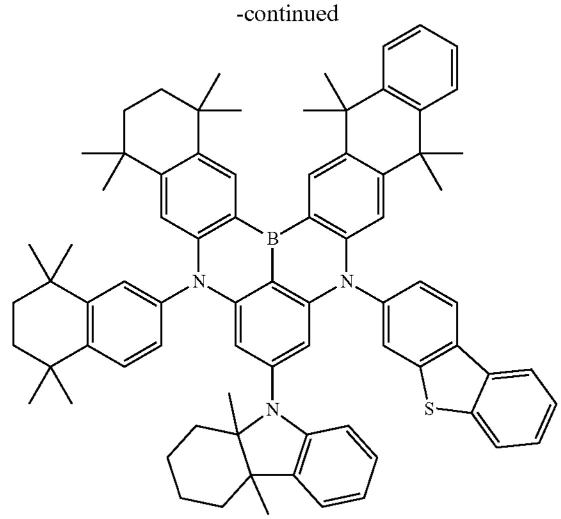
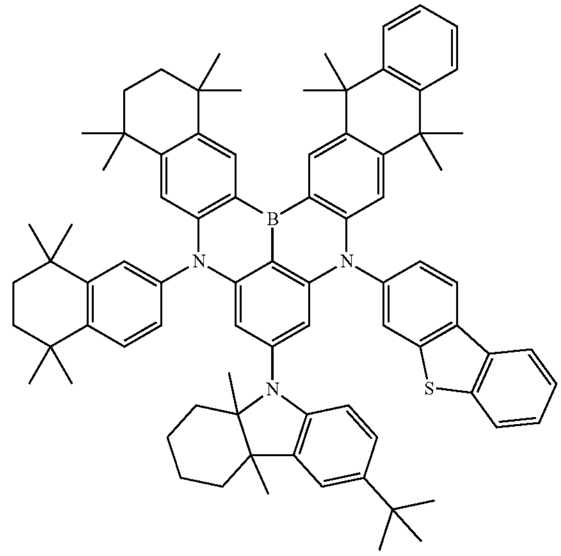
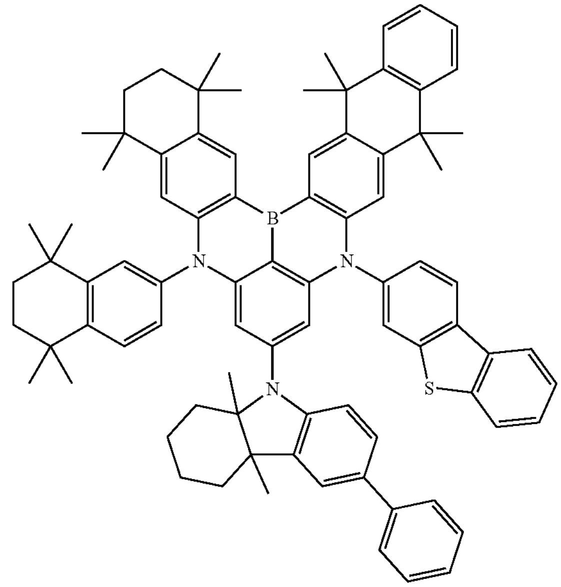
-continued
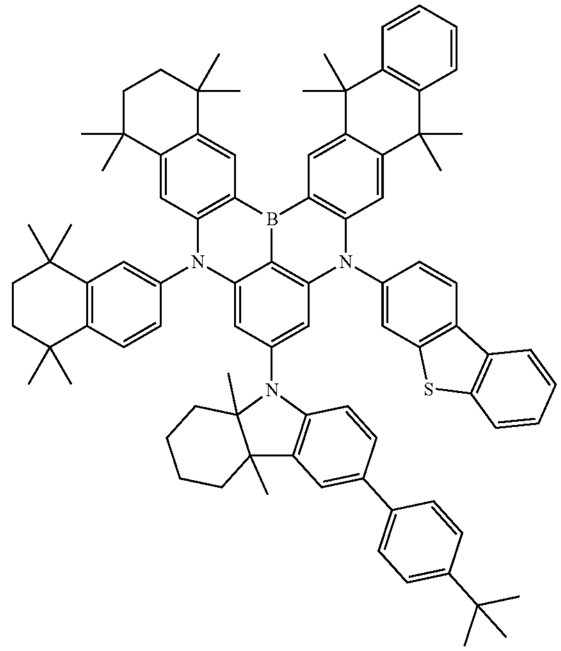
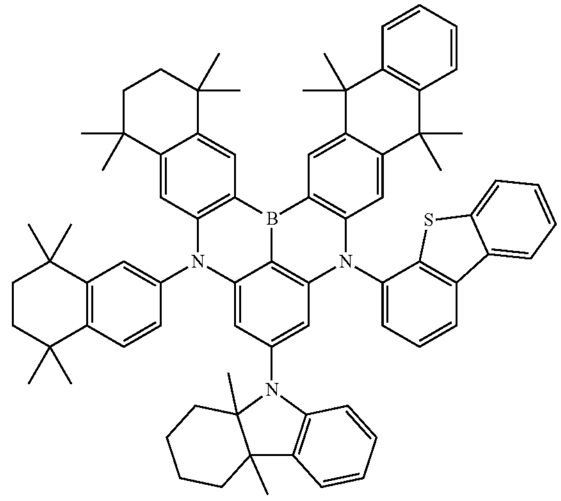
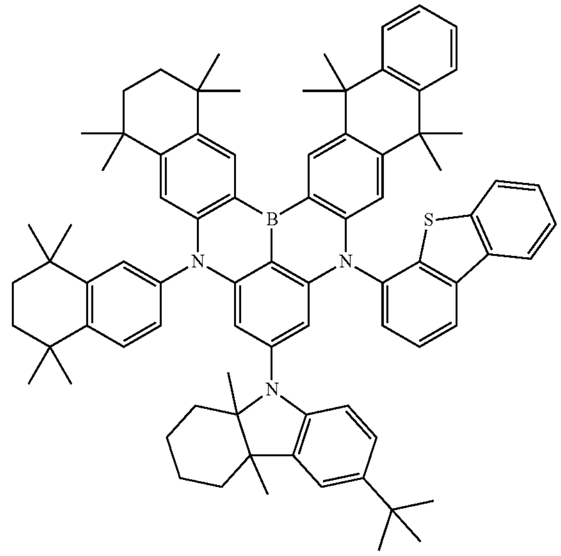

-continued
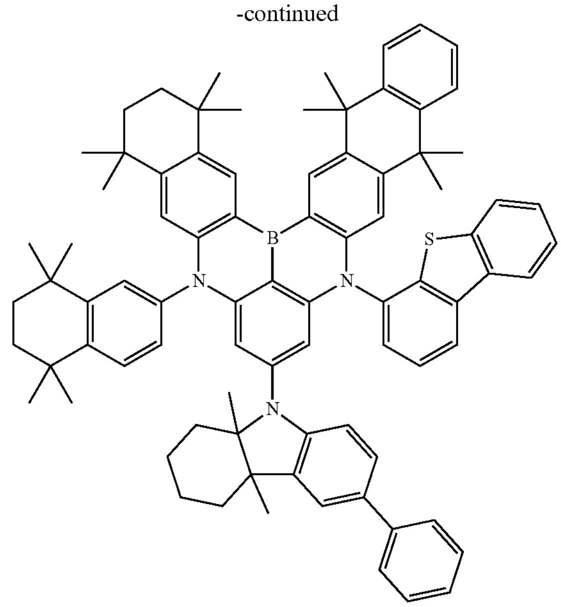
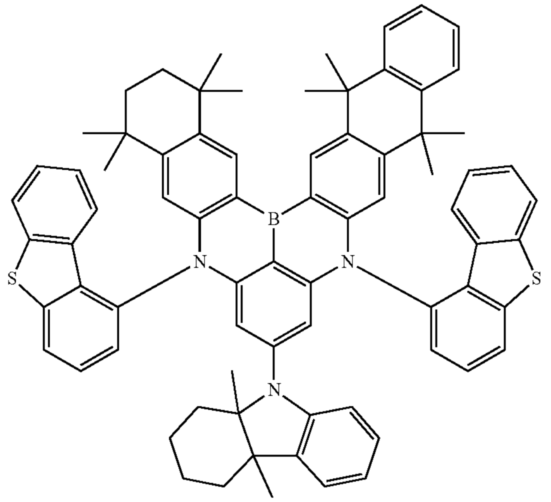
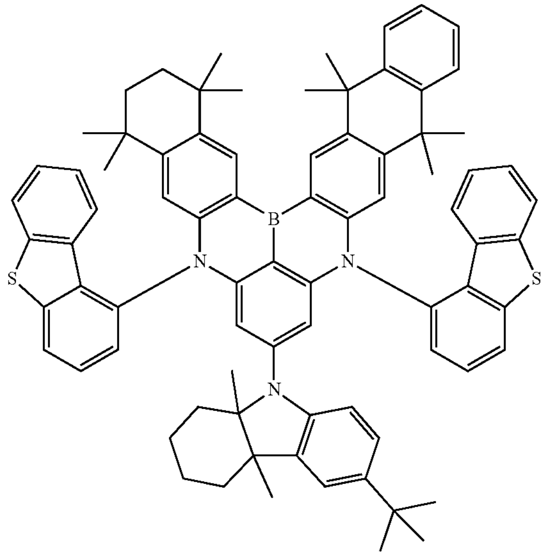
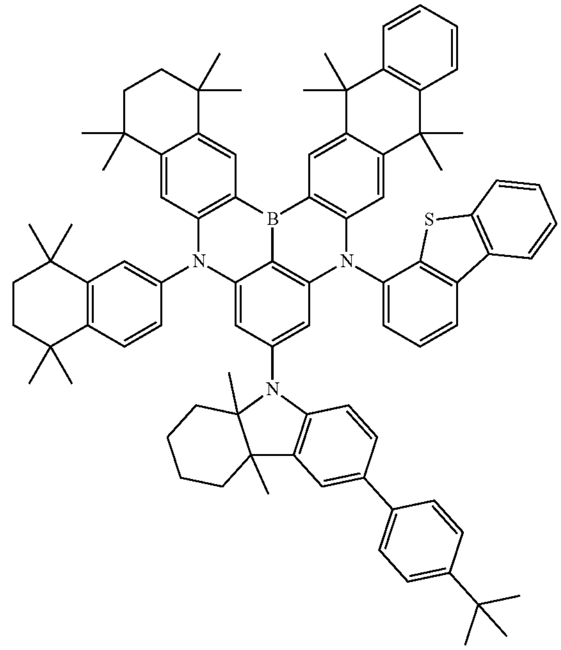 [SMILES: CC(C)(C)c1ccc(-c2ccc3c(c2)C2(C)CCCCC2(C)N3c2cc3c4c(c2)N(c2cccc5c2sc2ccccc25)c2cc5c(cc2B4c2cc4c(cc2N3c2ccc3c(c2)C(C)(C)CCC3(C)C)C(C)(C)CCC4(C)C)C(C)(C)c2ccccc2C5(C)C)cc1]
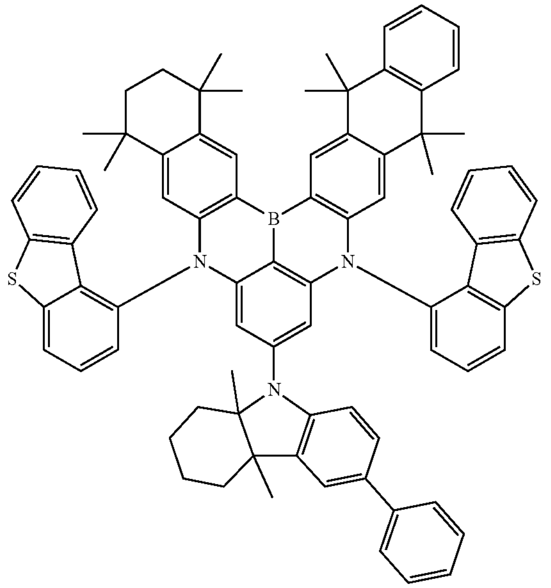

-continued
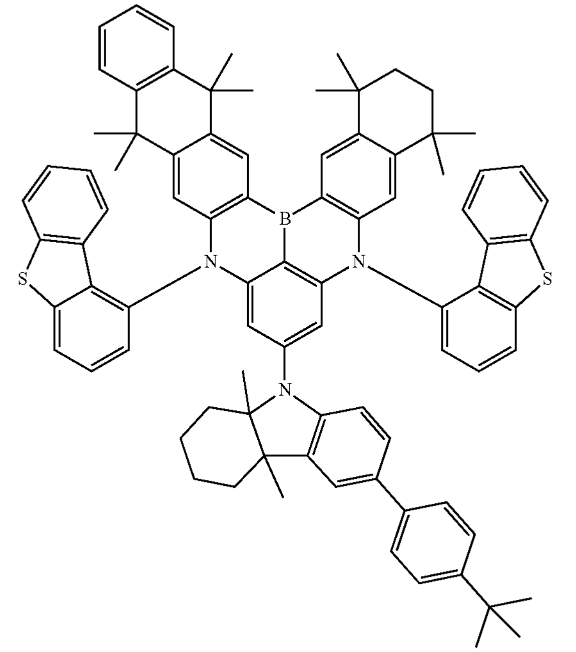
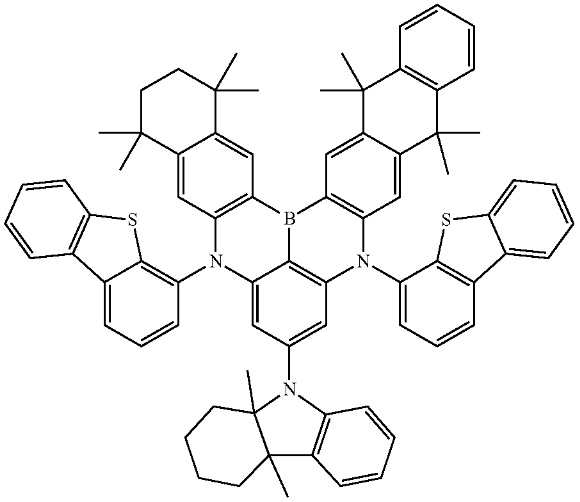
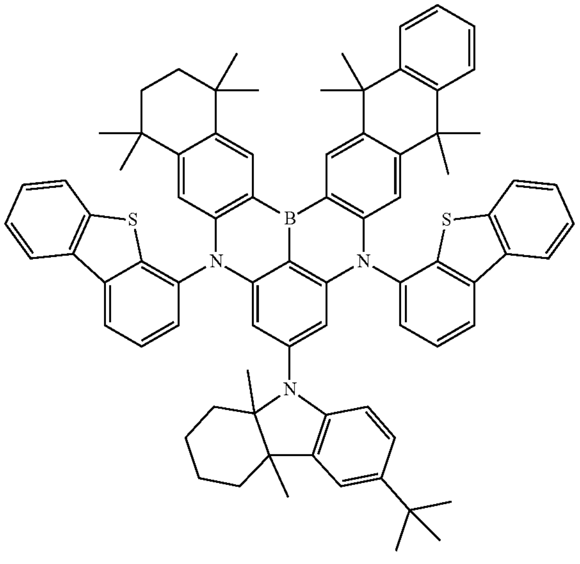
-continued
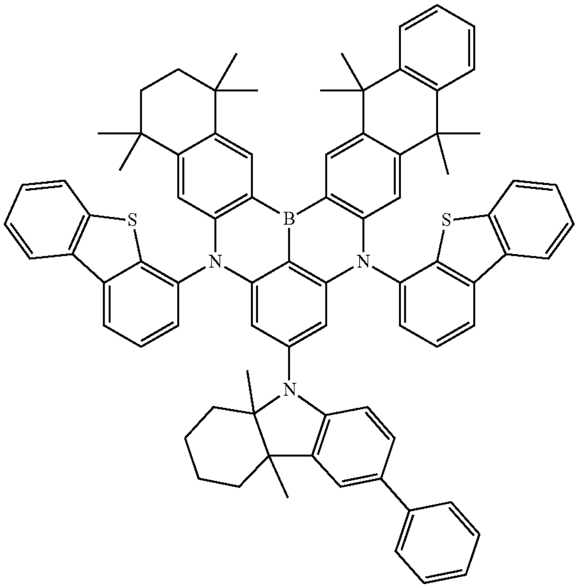
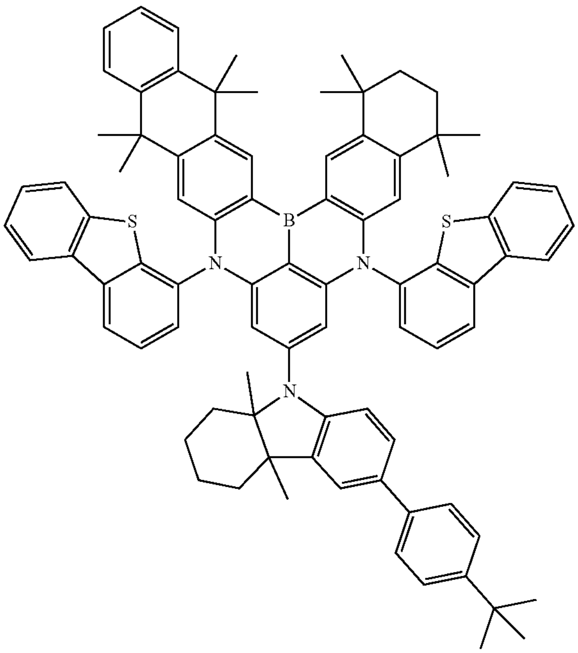
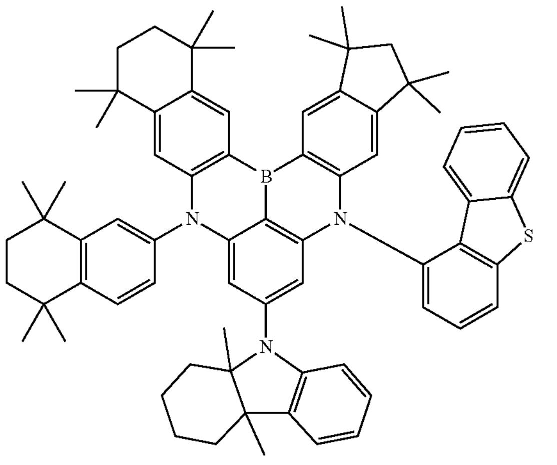

-continued
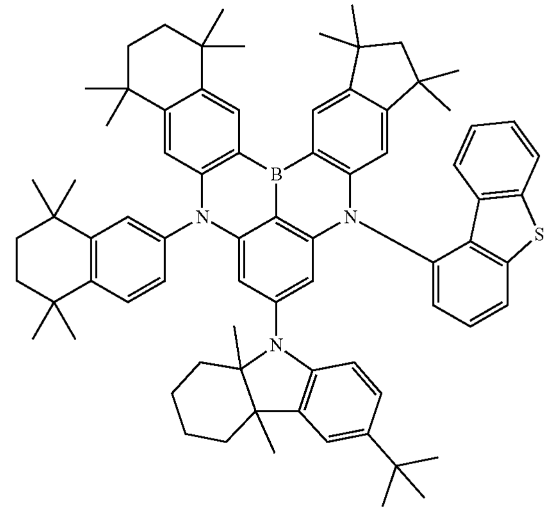
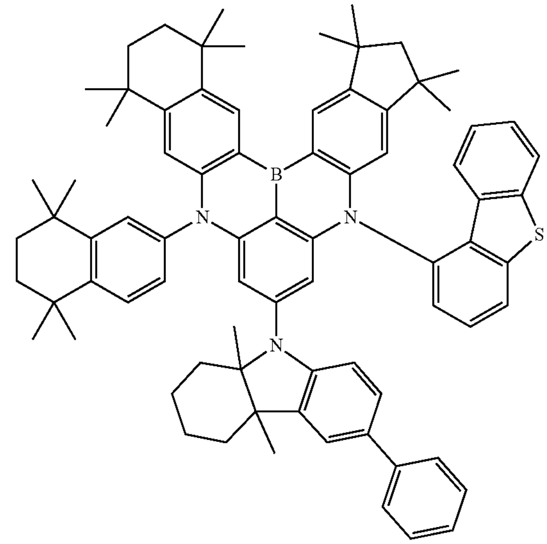
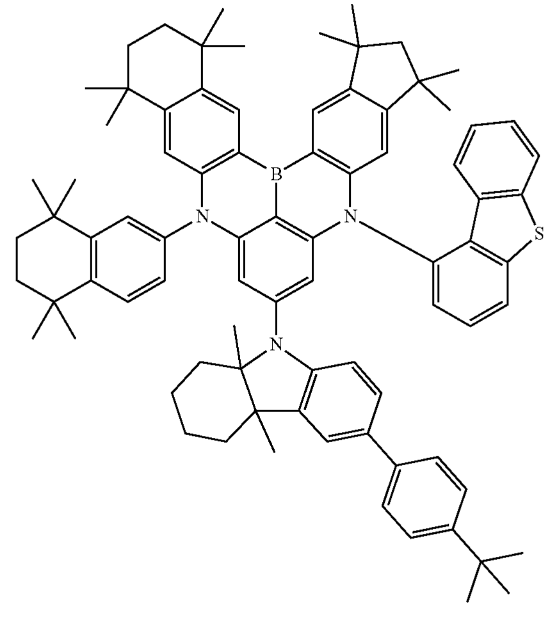
-continued
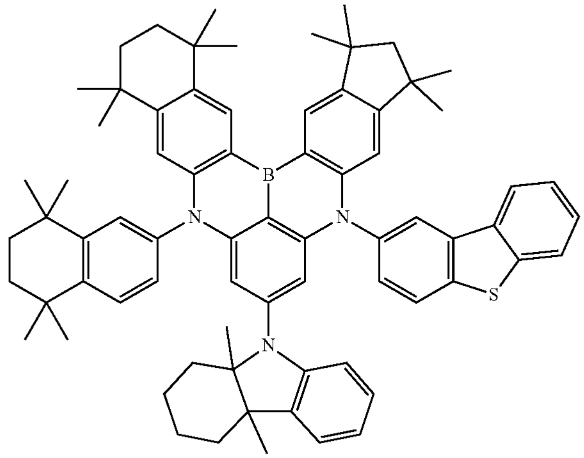
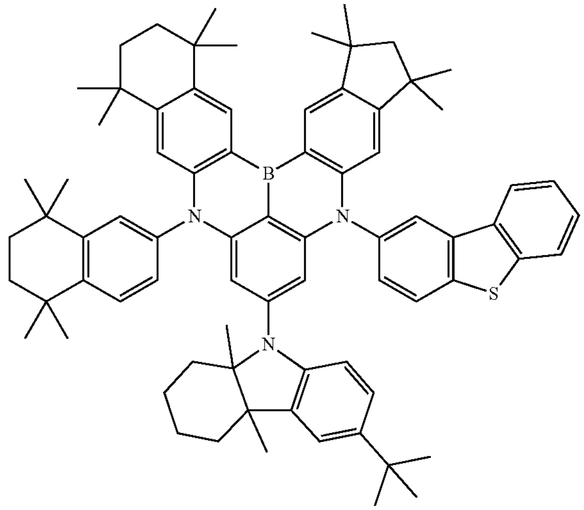
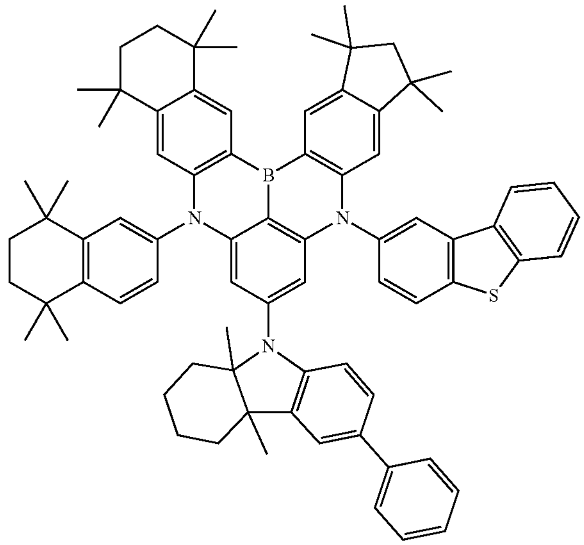

-continued
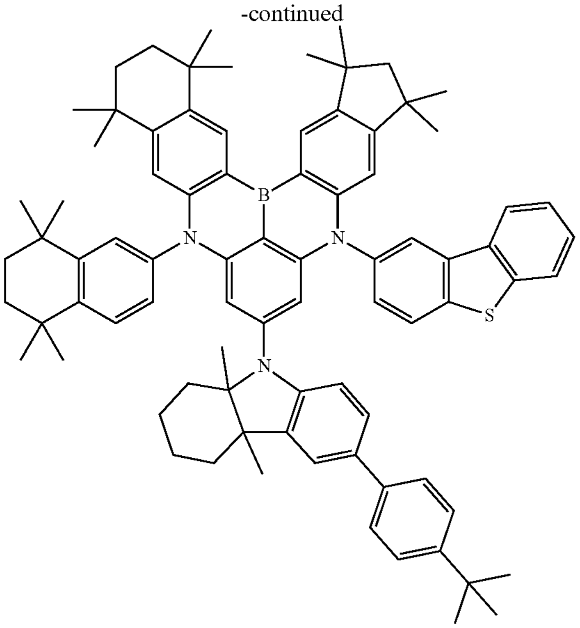
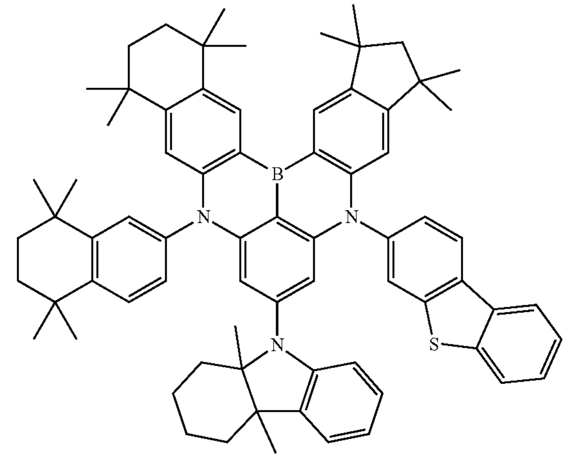
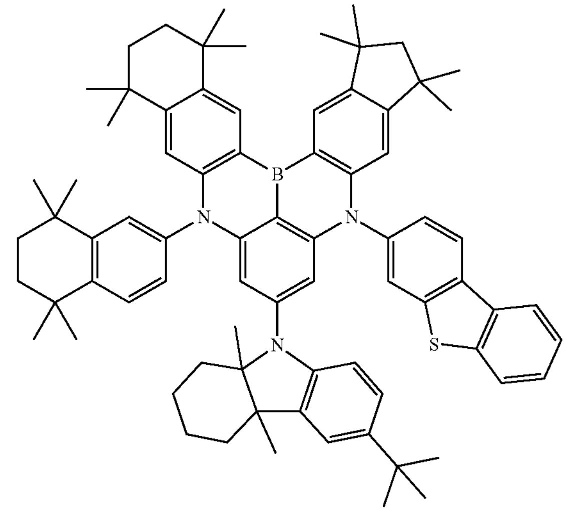
-continued
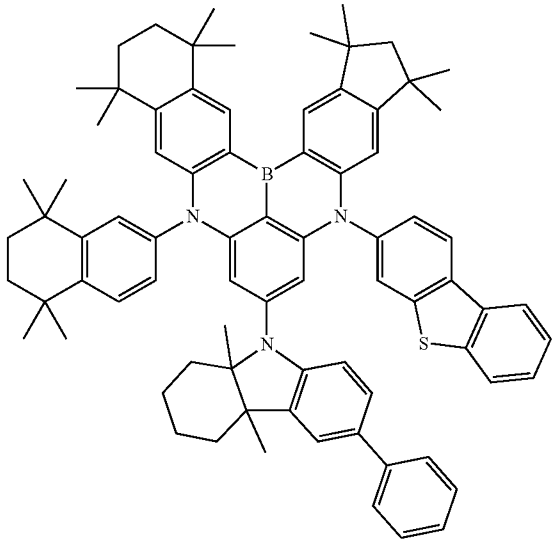
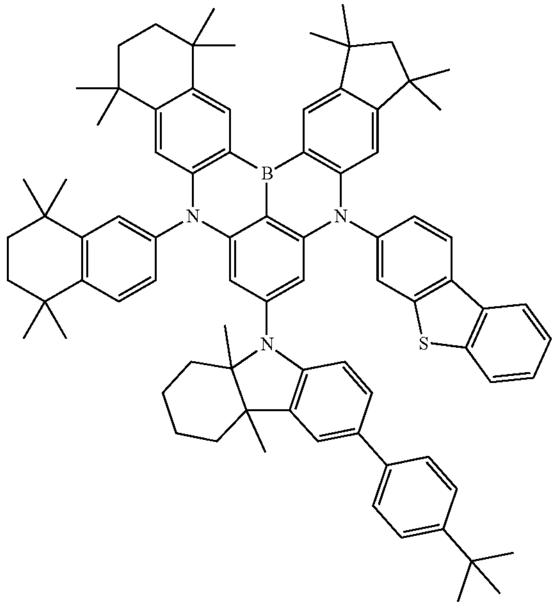
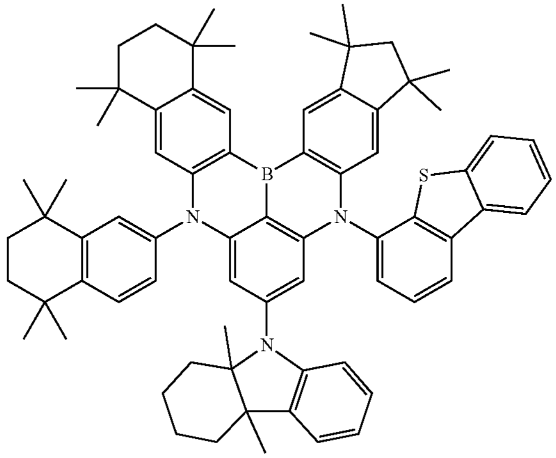

-continued
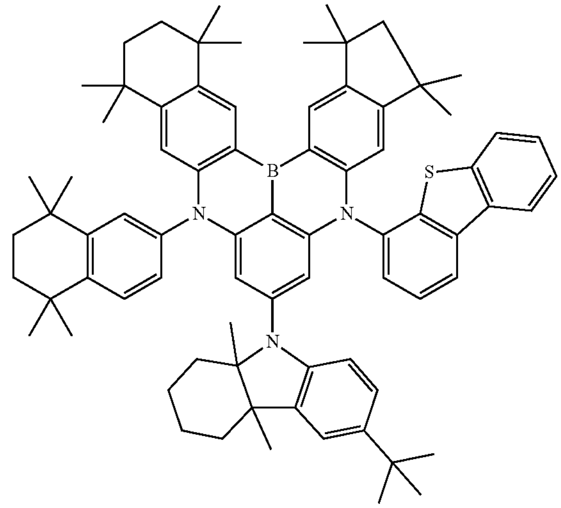
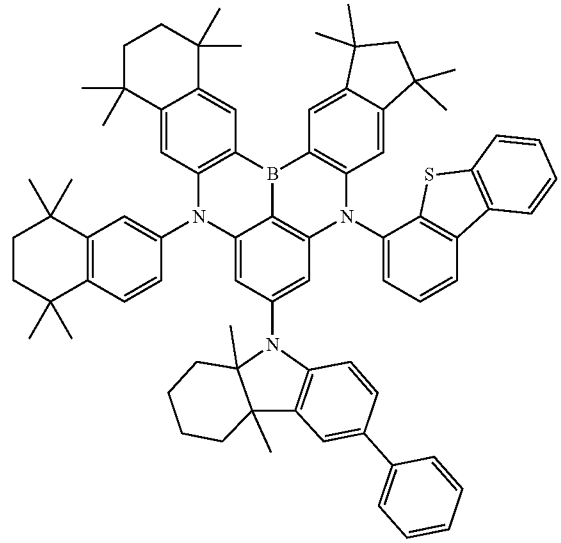
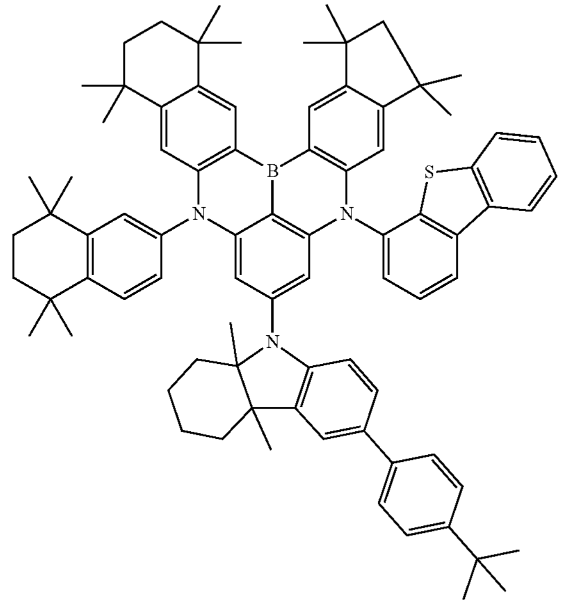
-continued
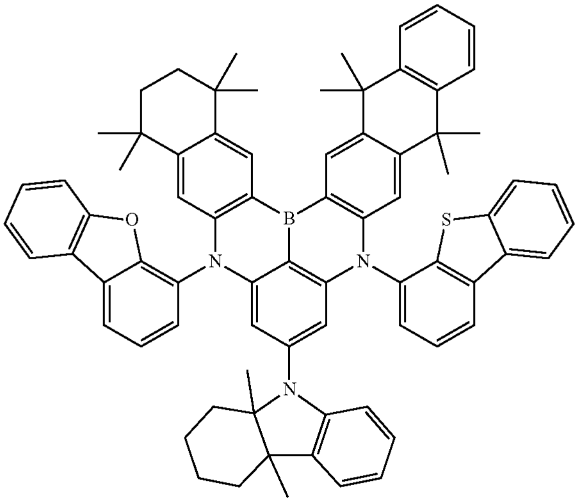
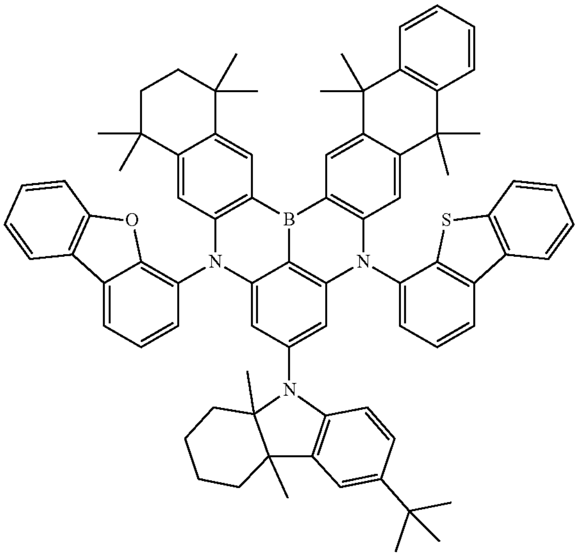
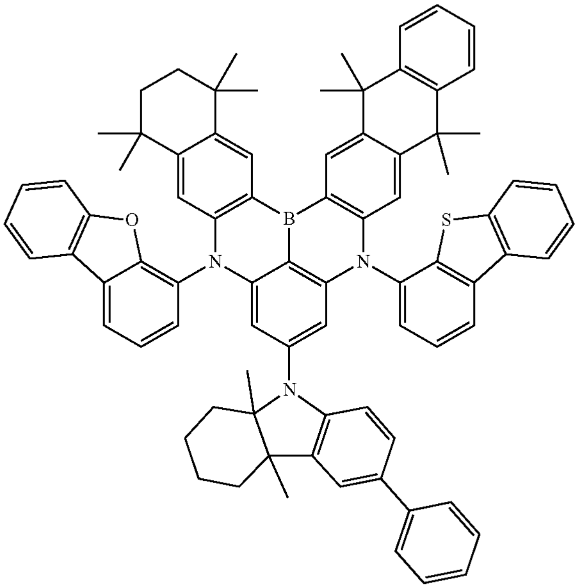

-continued
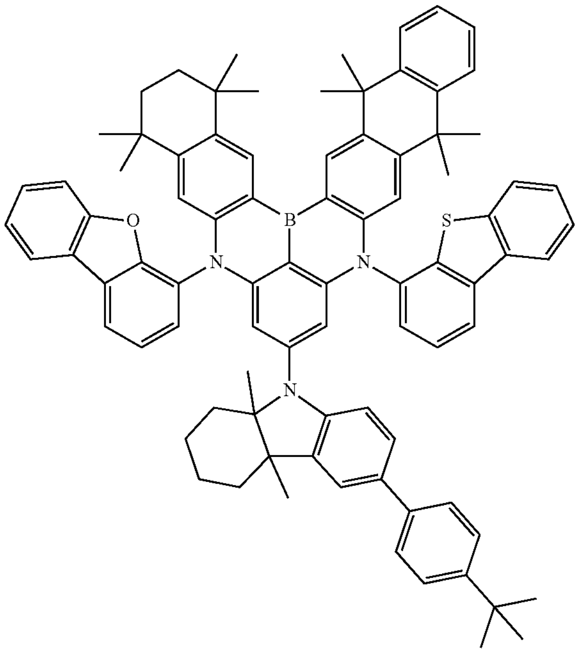
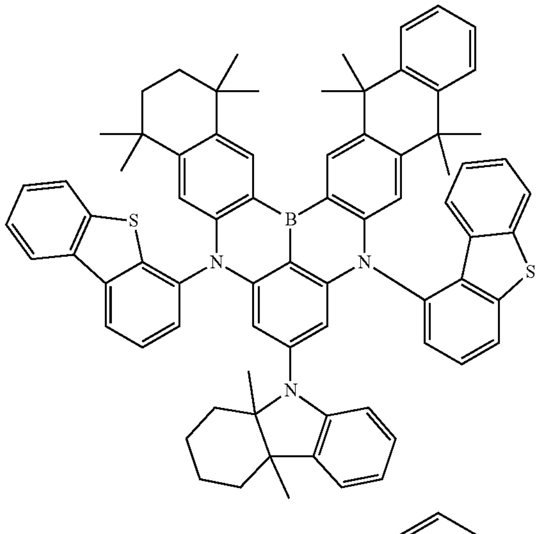
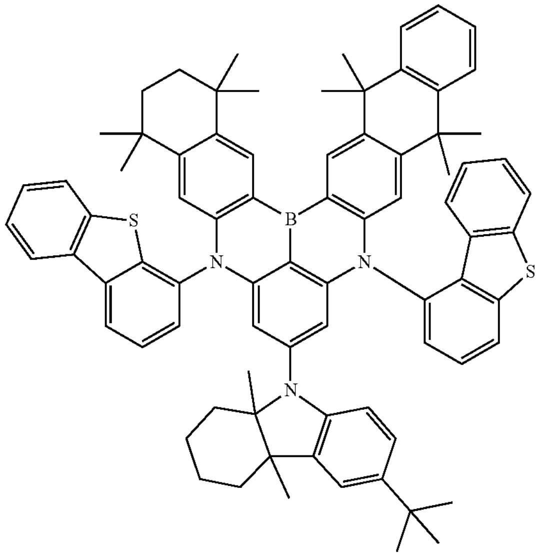
-continued
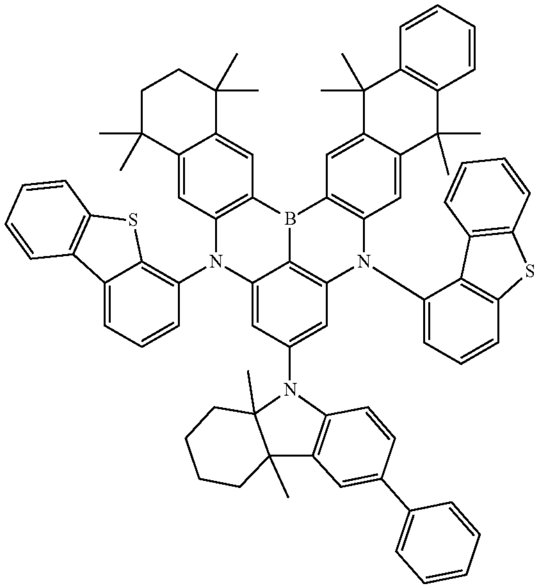
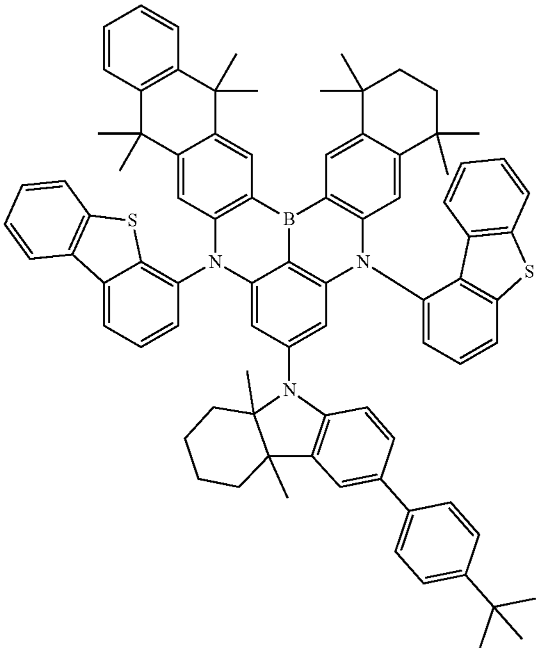

-continued
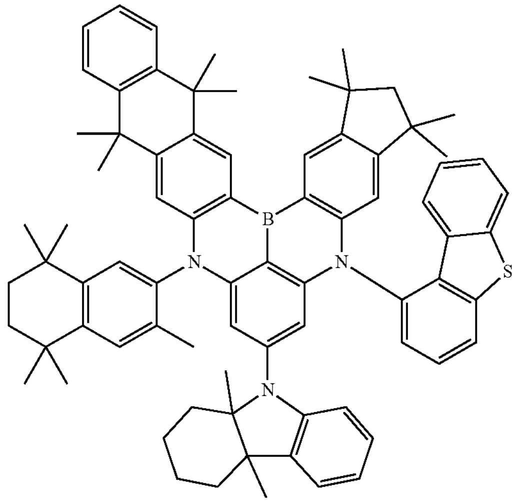
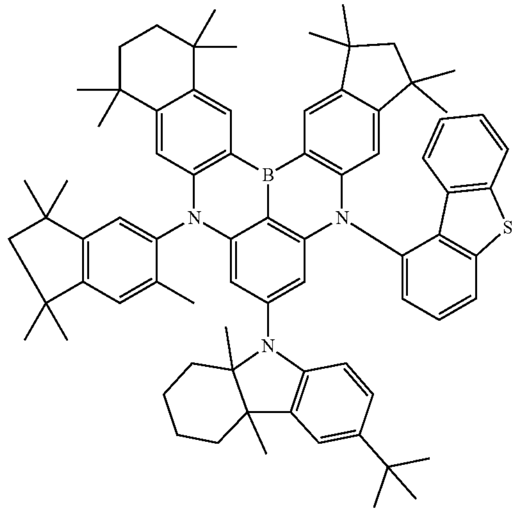
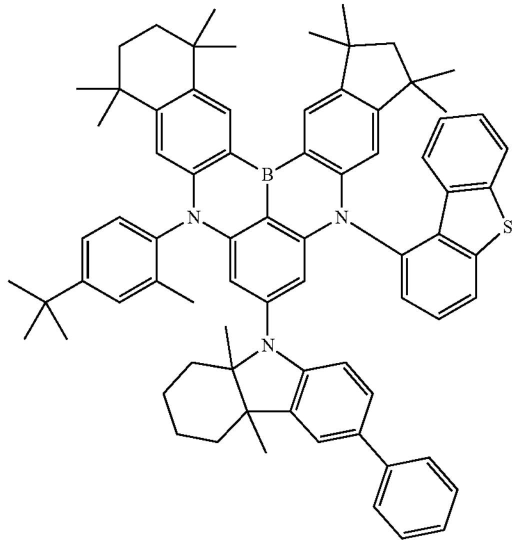
-continued
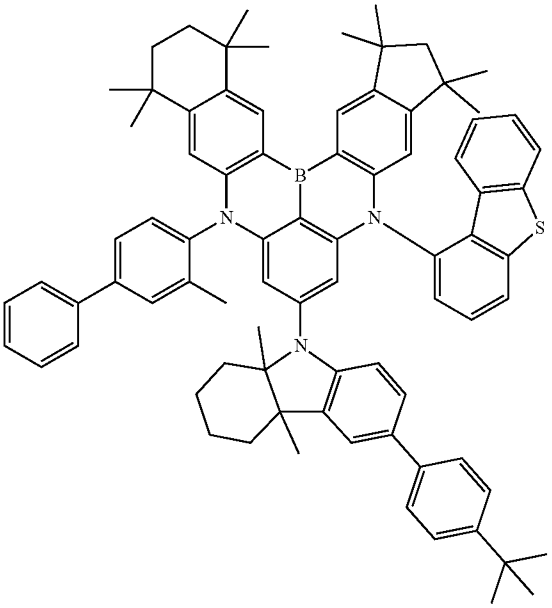
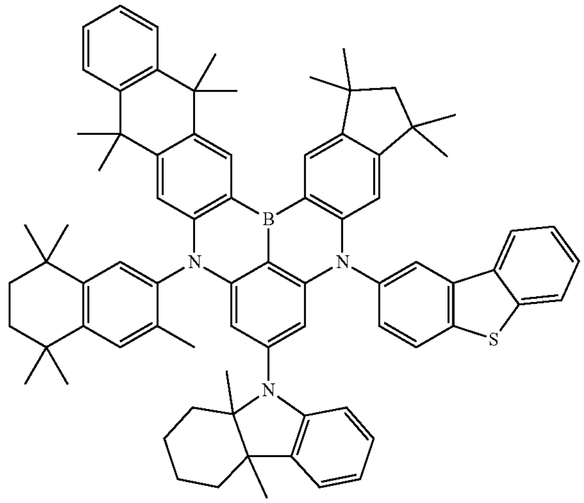
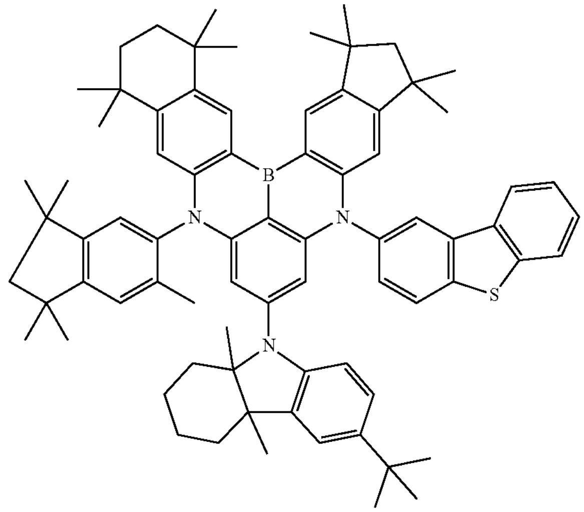

-continued
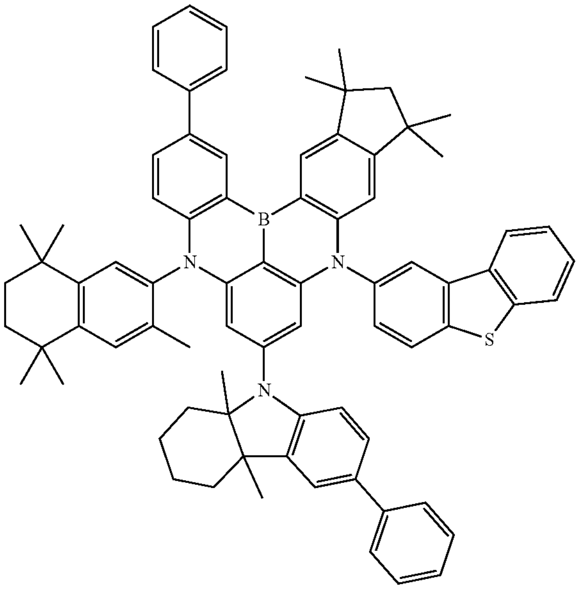
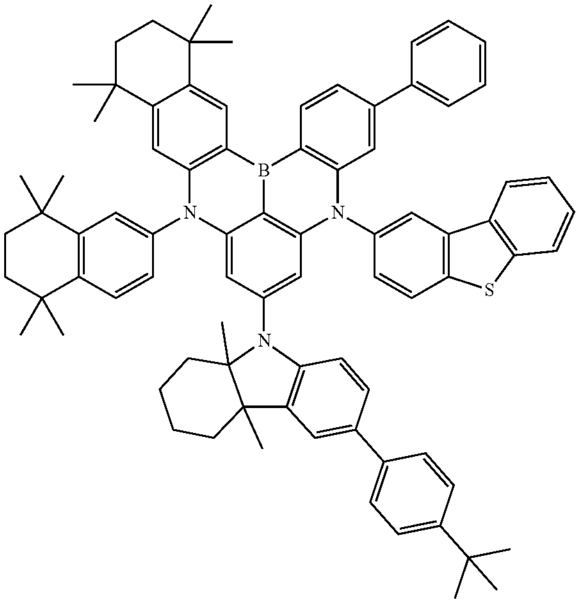
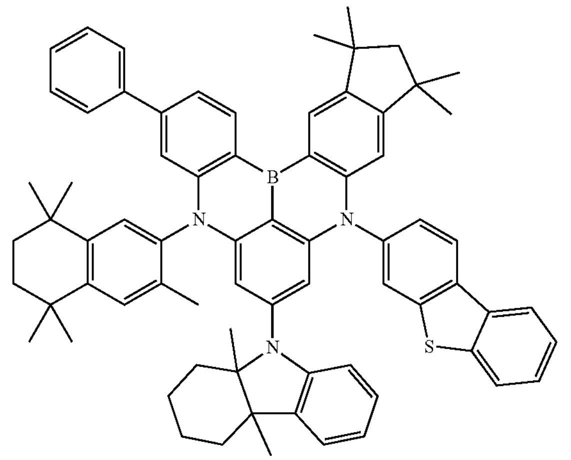
-continued
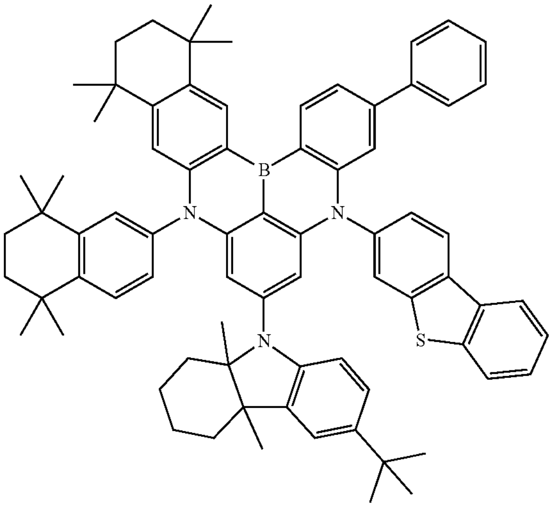
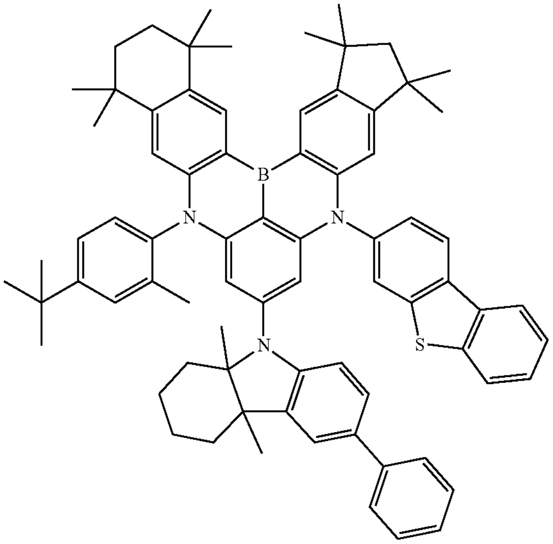
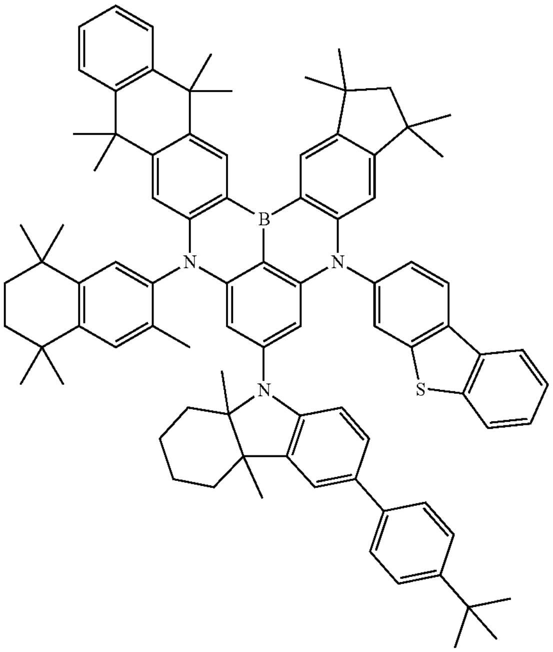

-continued
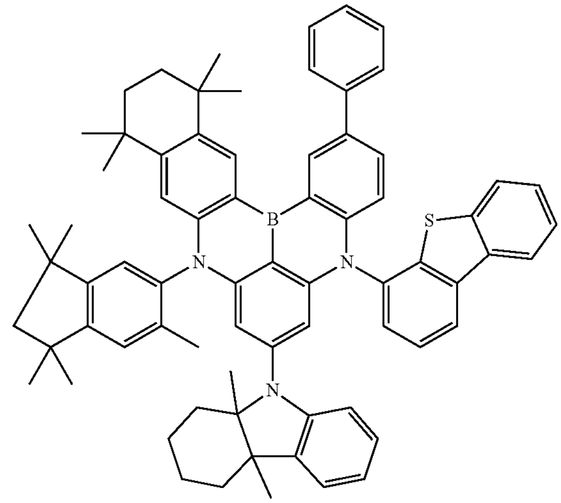
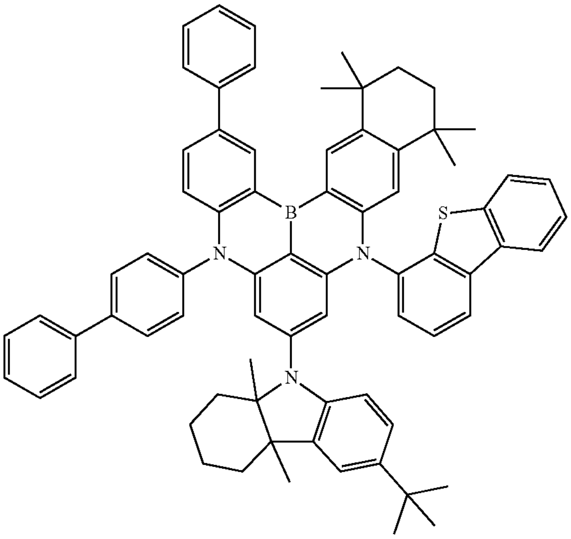
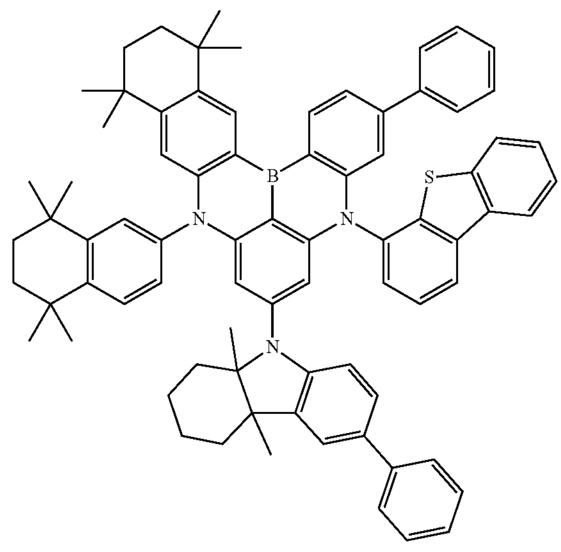
-continued
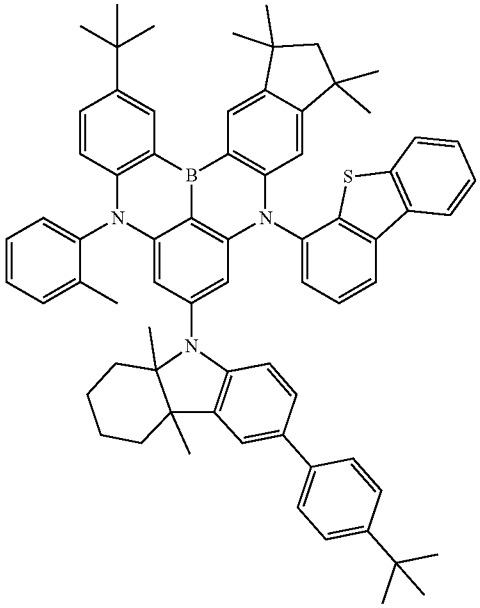
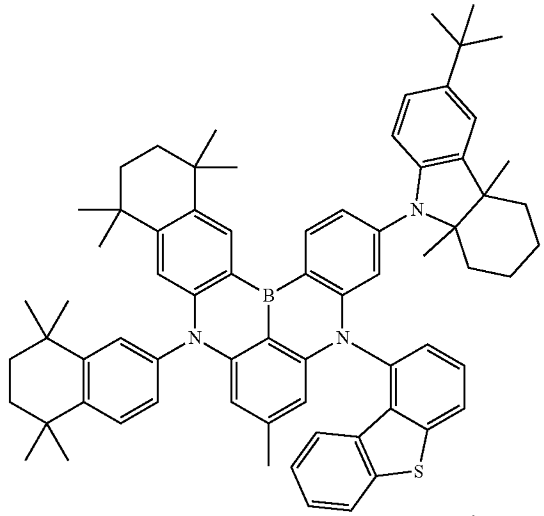
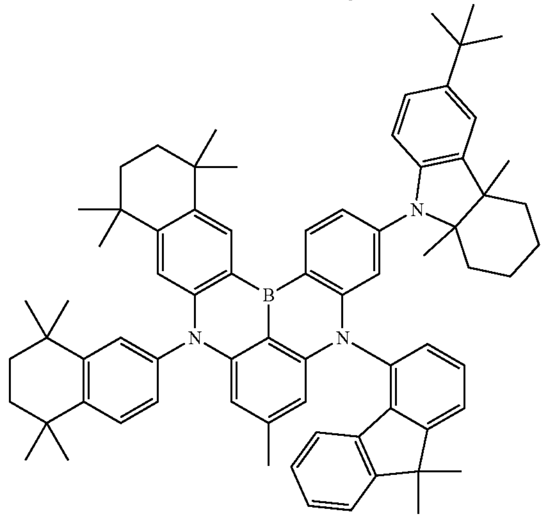

-continued
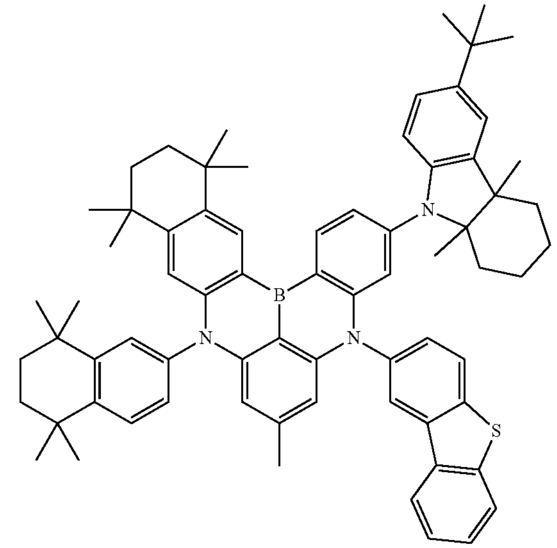
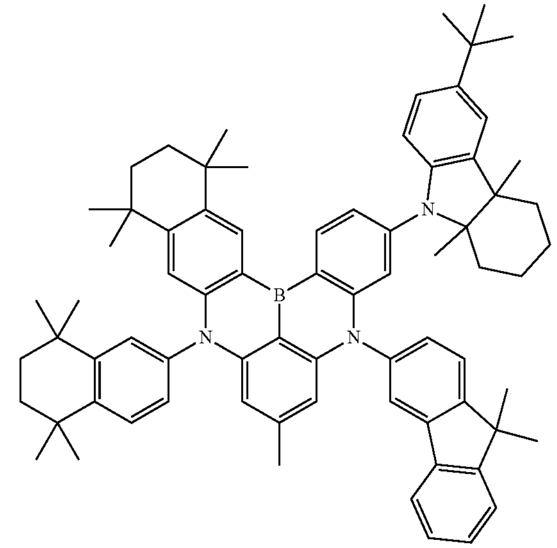
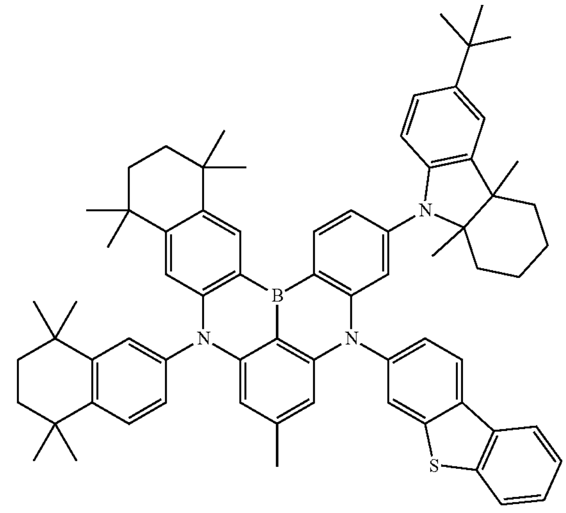
-continued
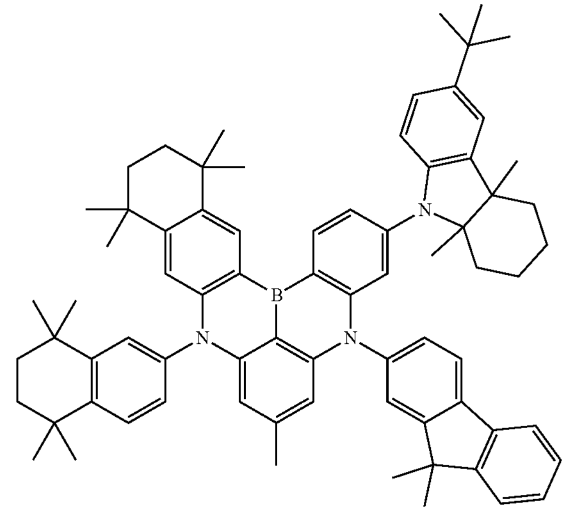
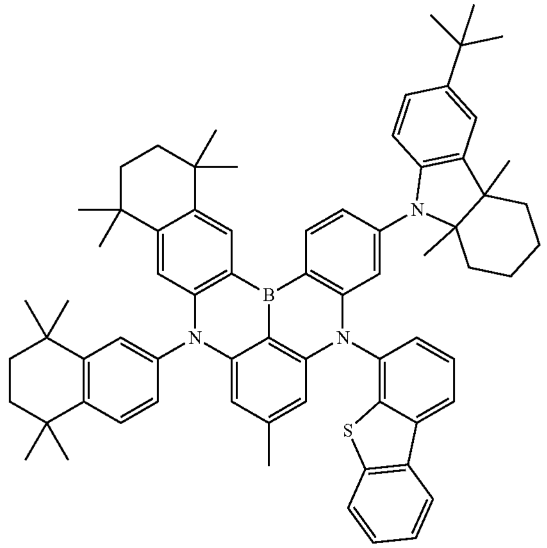
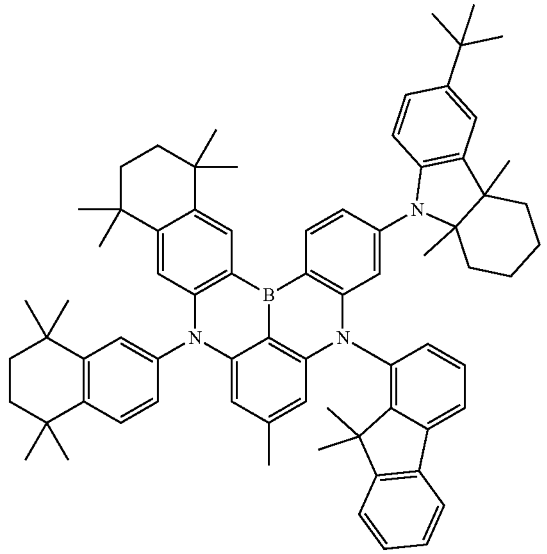

-continued
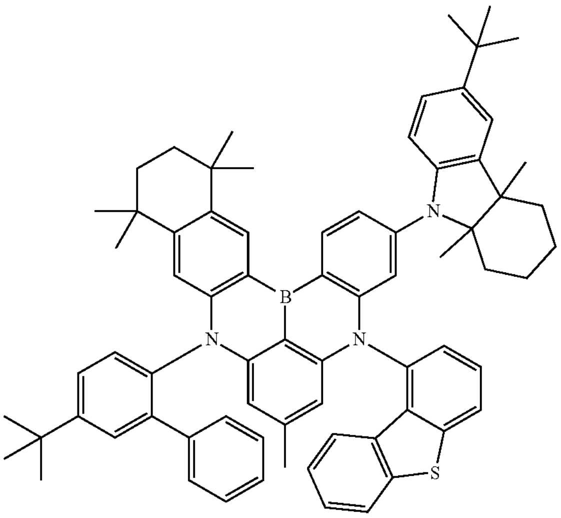
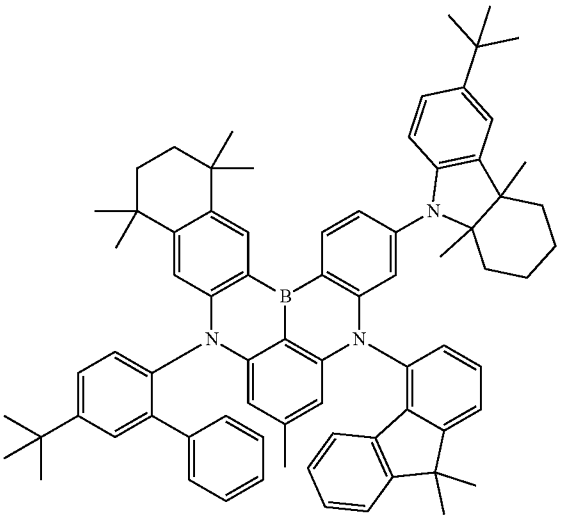
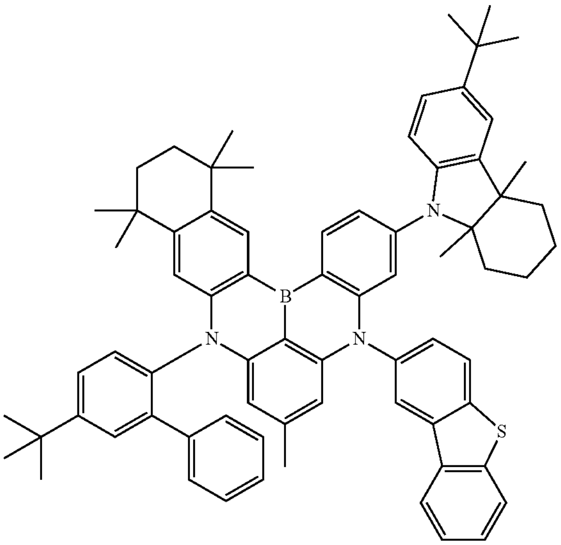
-continued
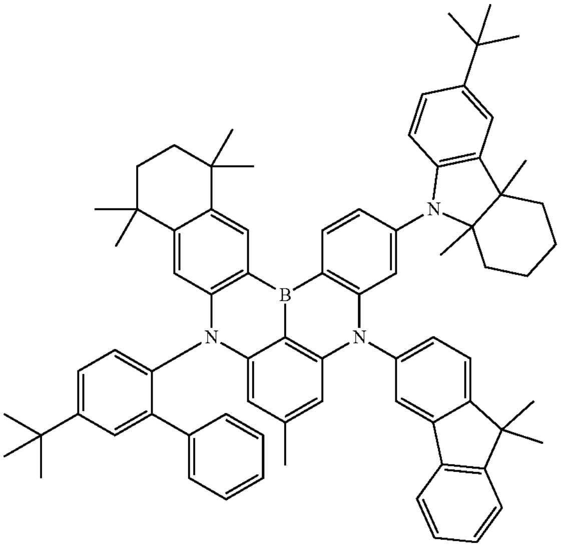
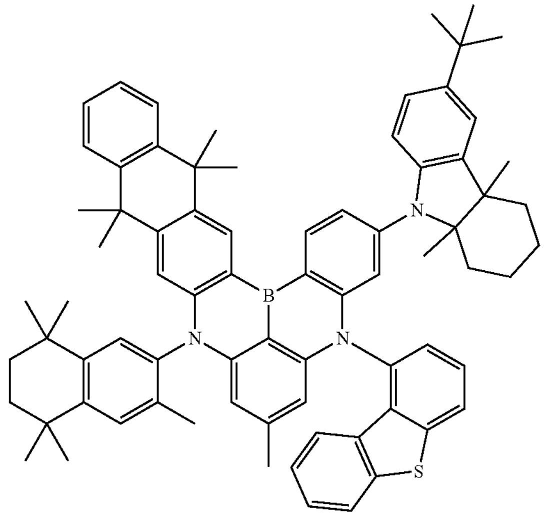
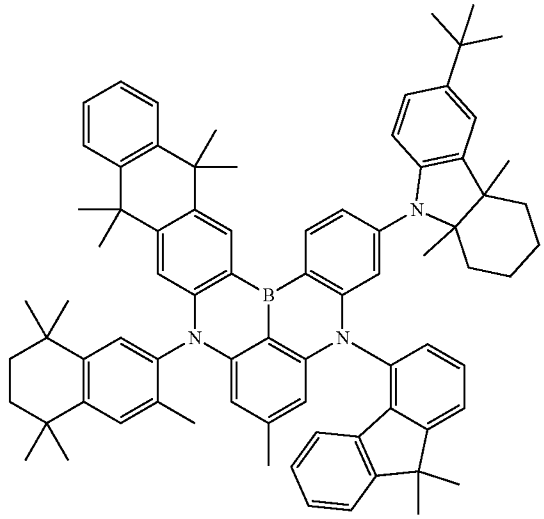

-continued
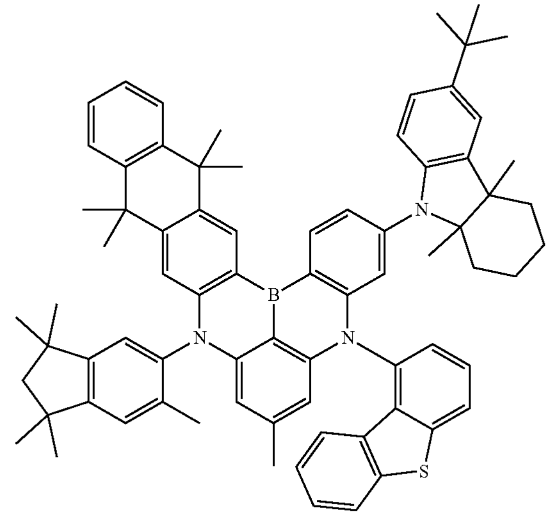
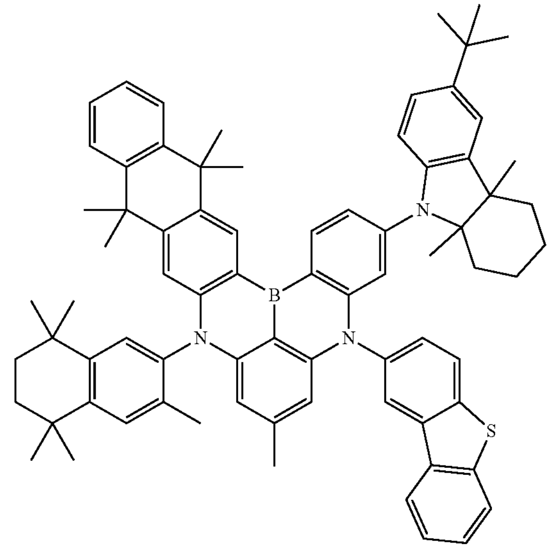
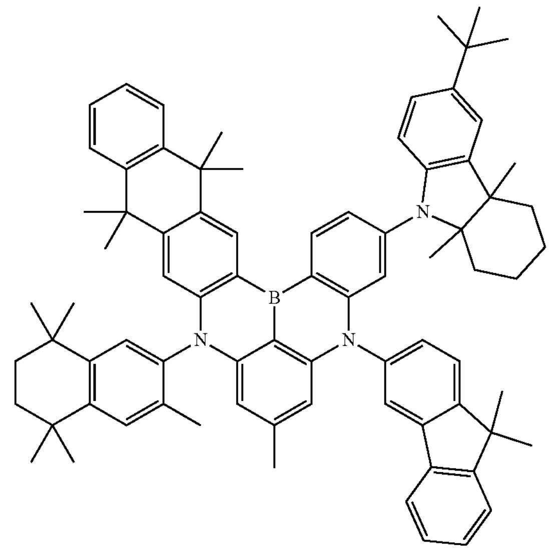
-continued
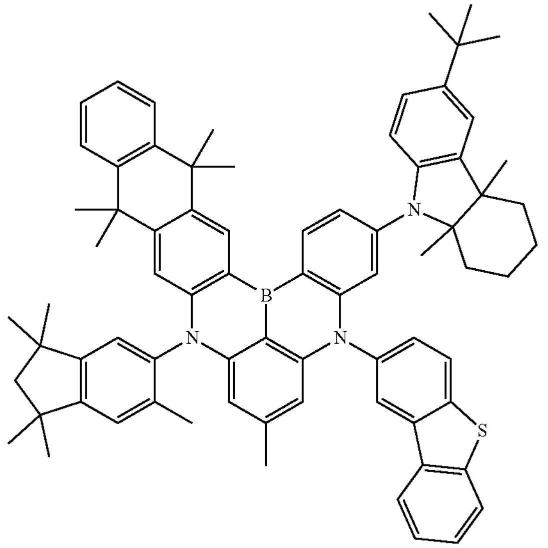
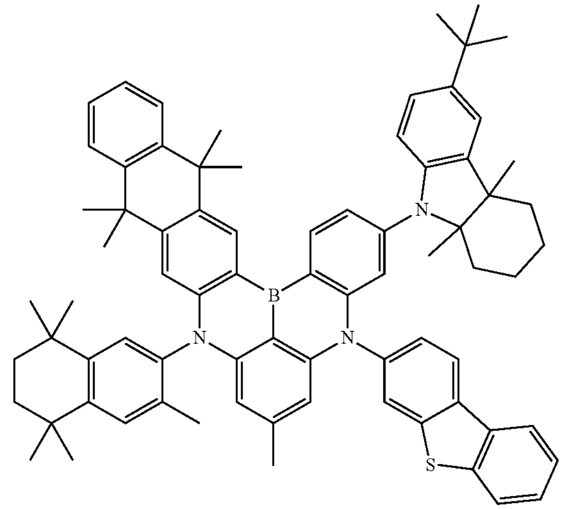
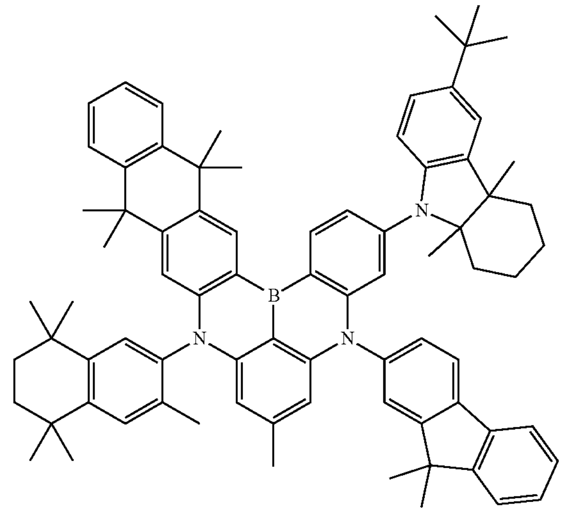

-continued
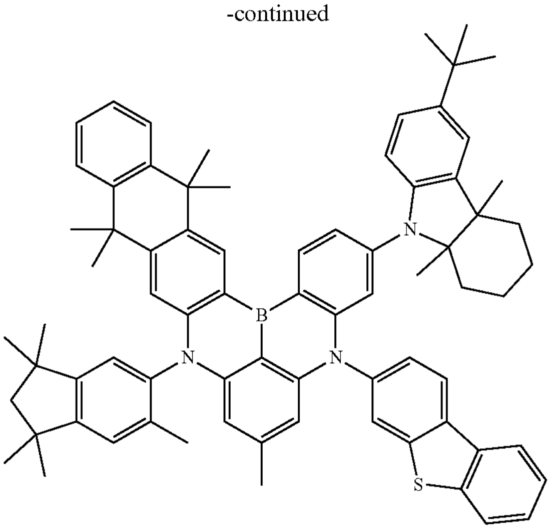
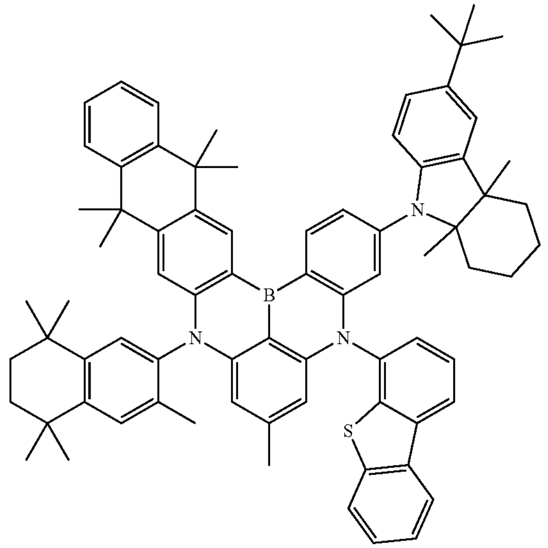
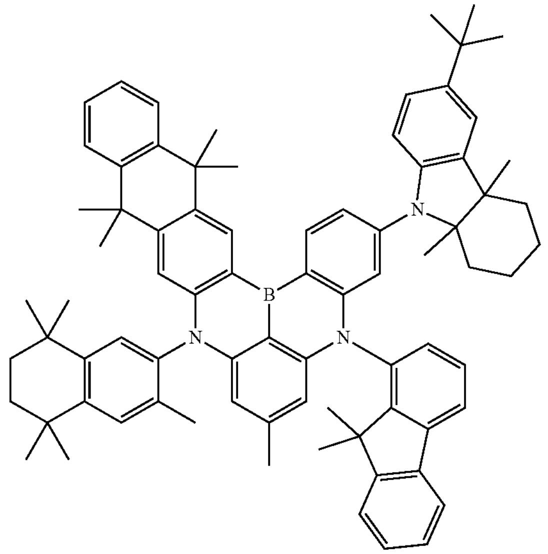
-continued
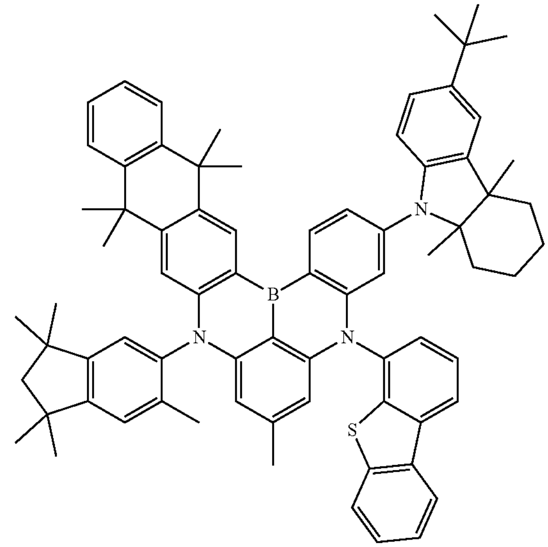
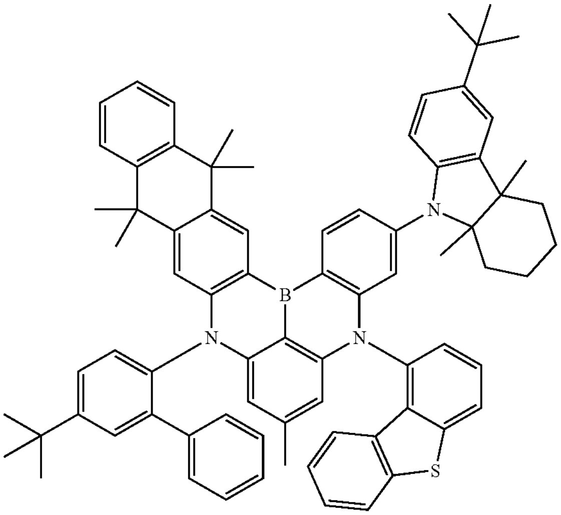
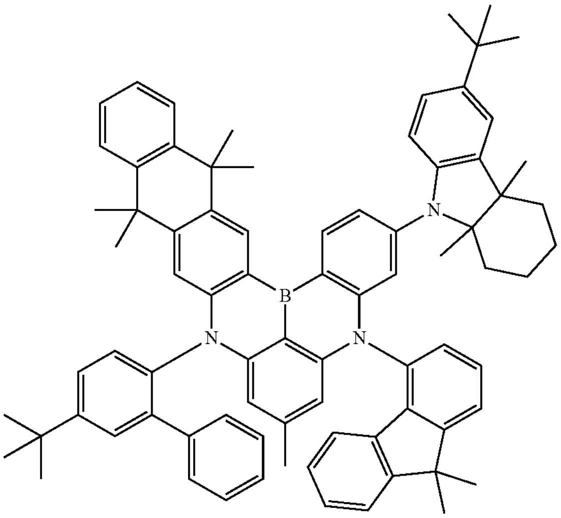

-continued
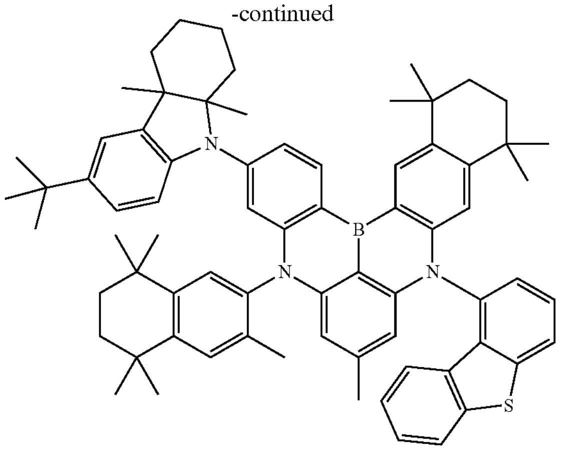
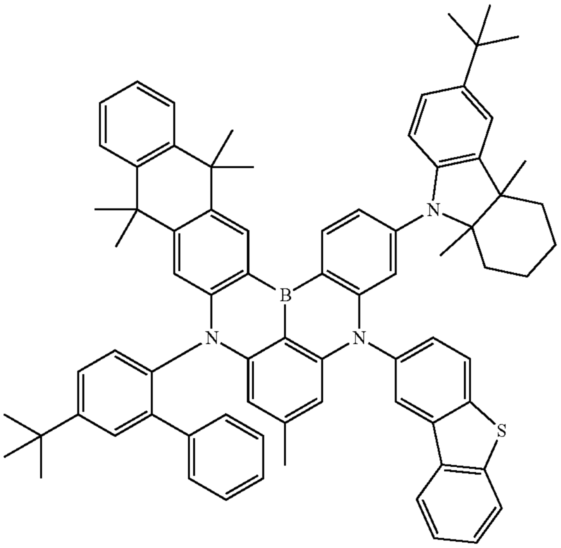
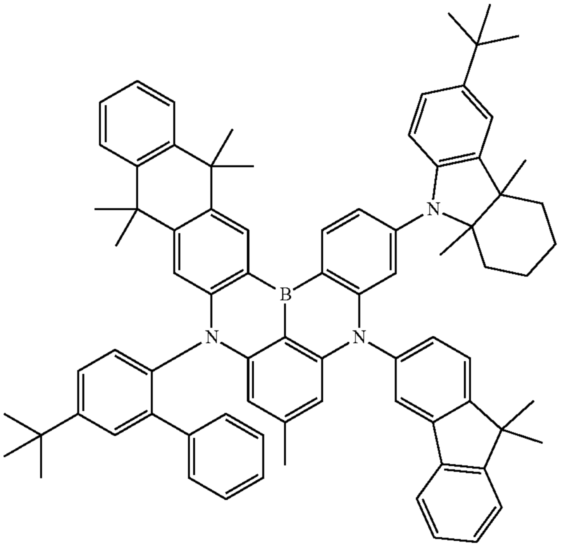
-continued
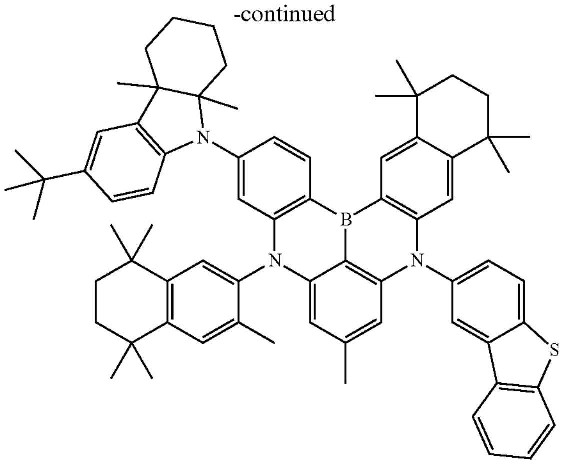
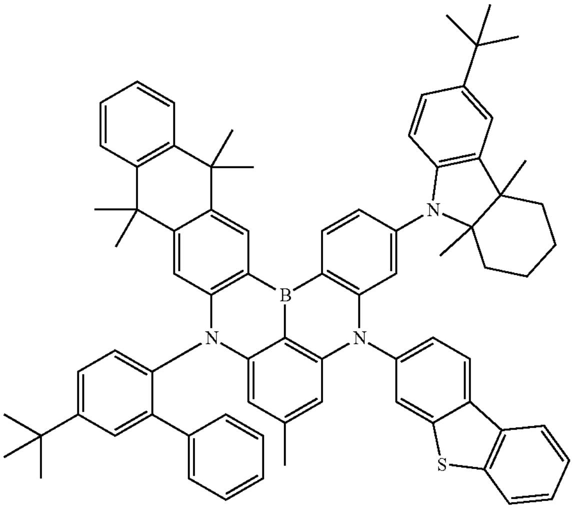
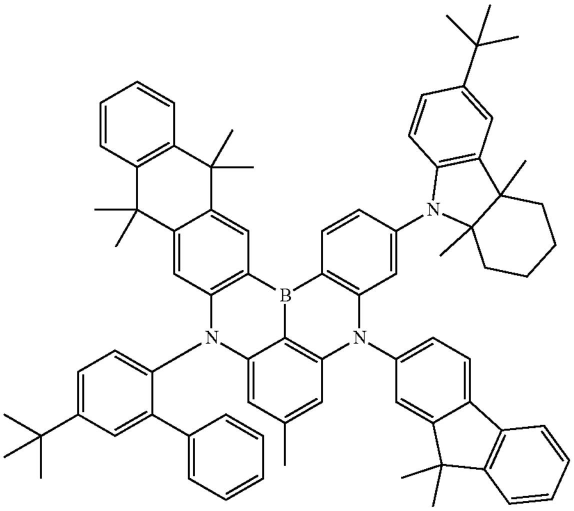

-continued
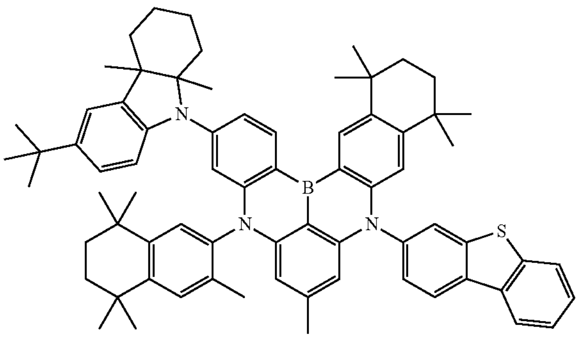
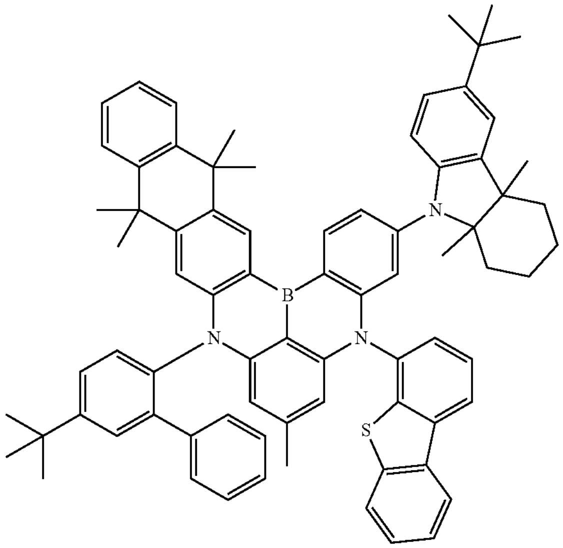
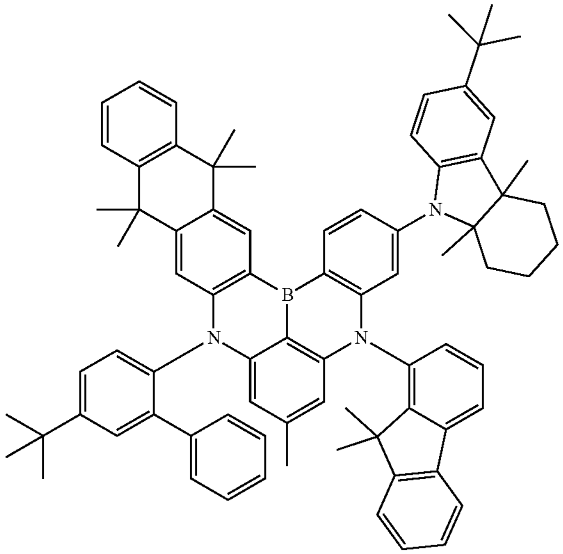
-continued
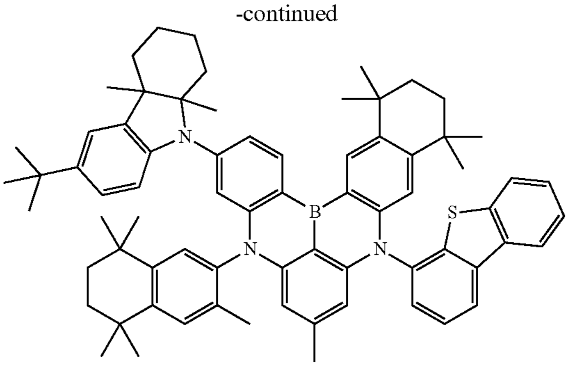
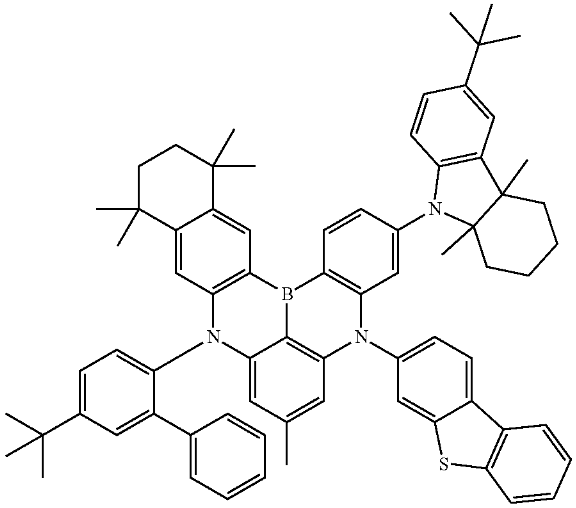
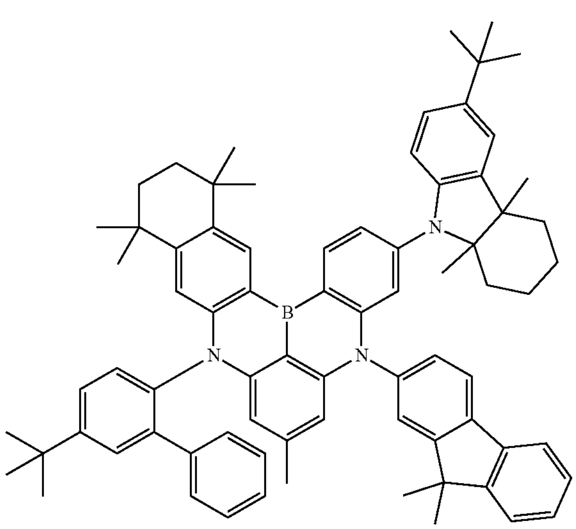

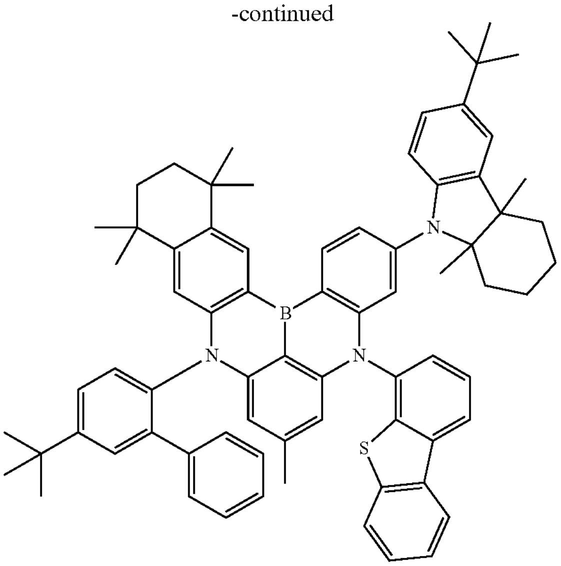
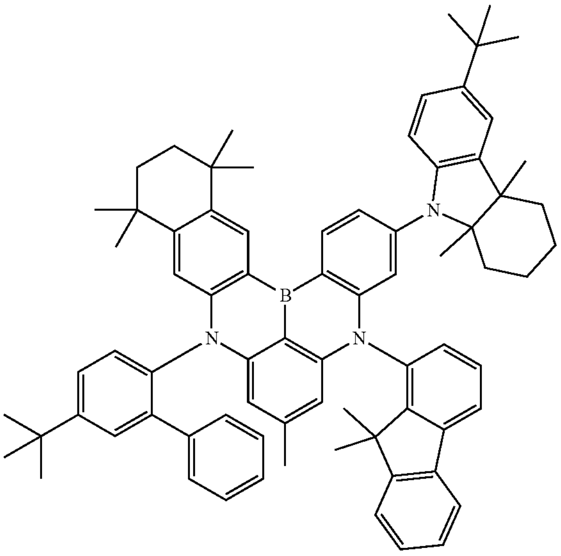
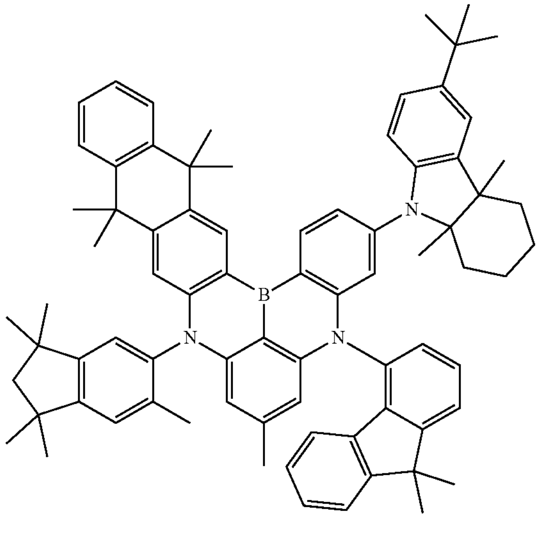
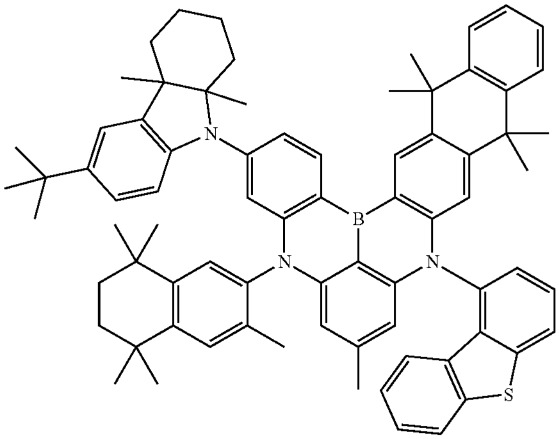
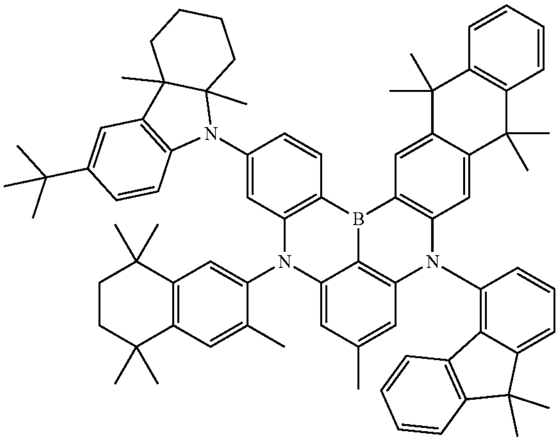
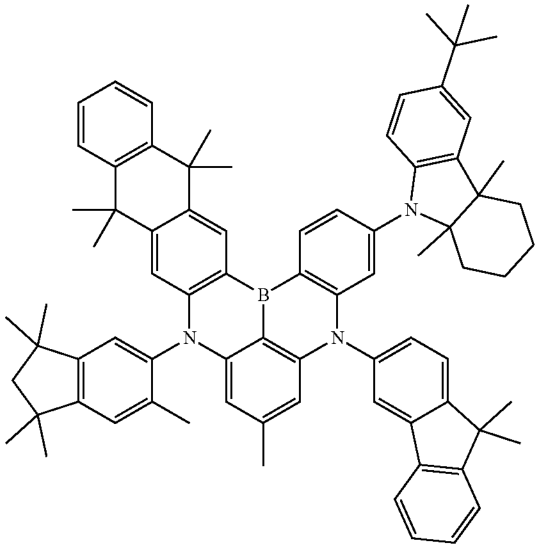

-continued
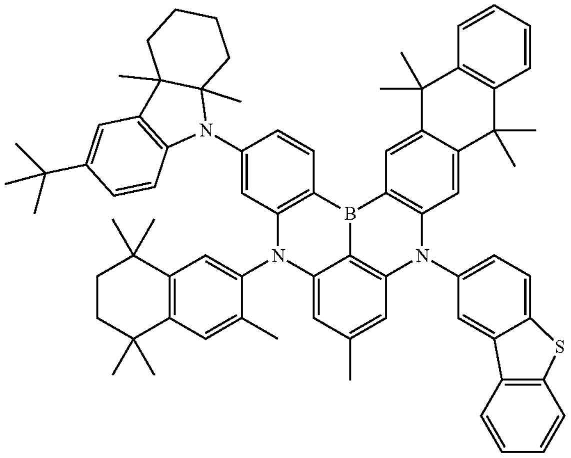
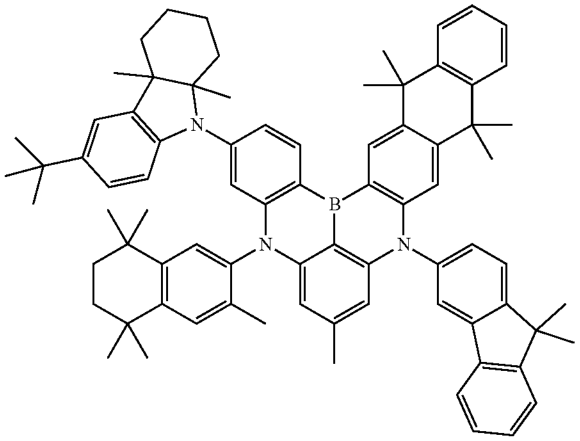
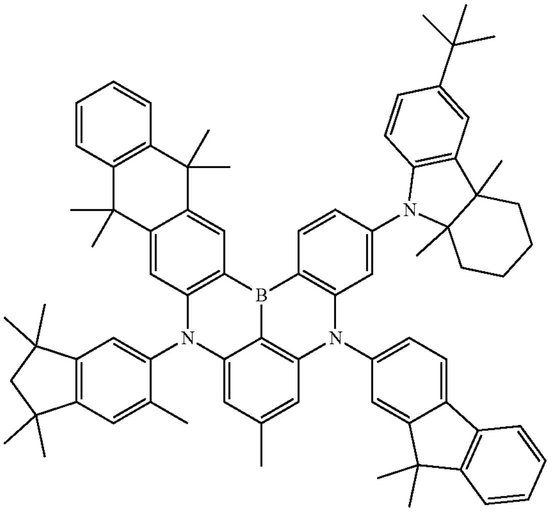
-continued
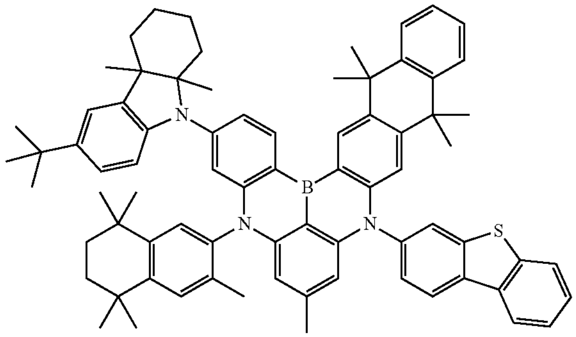
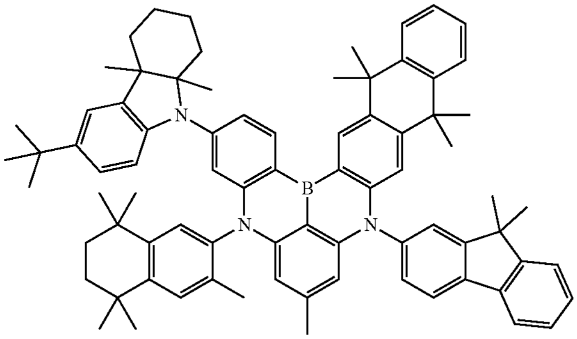
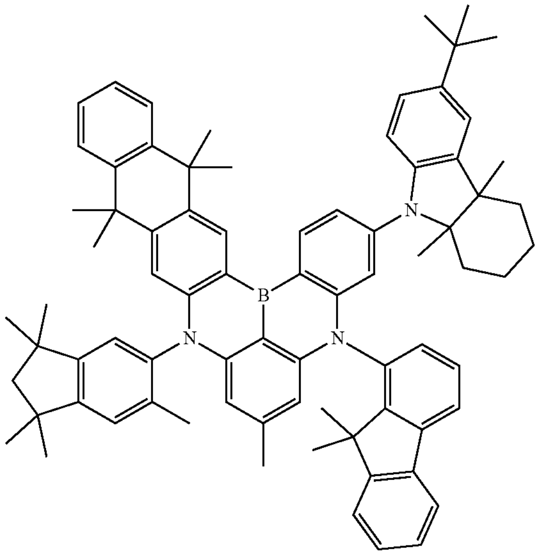
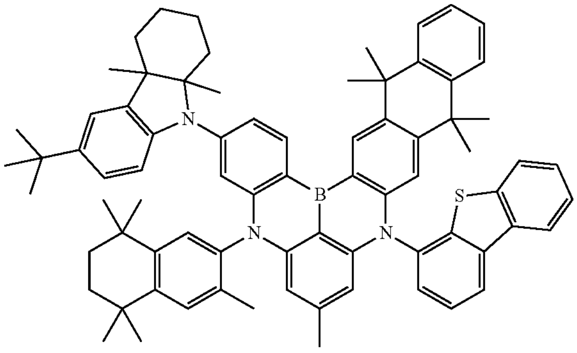

-continued
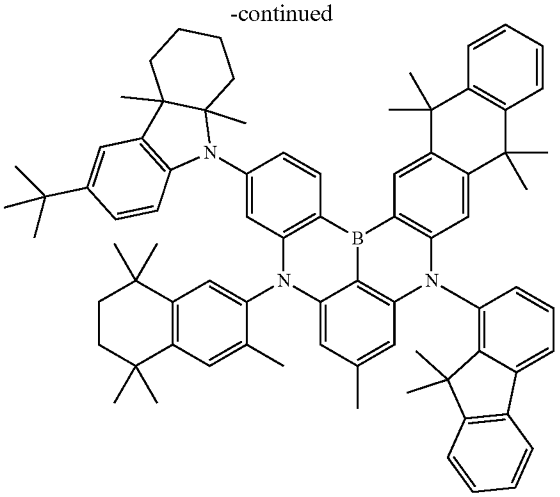
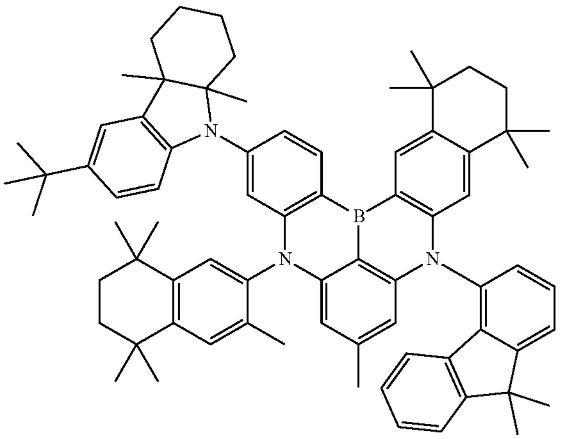
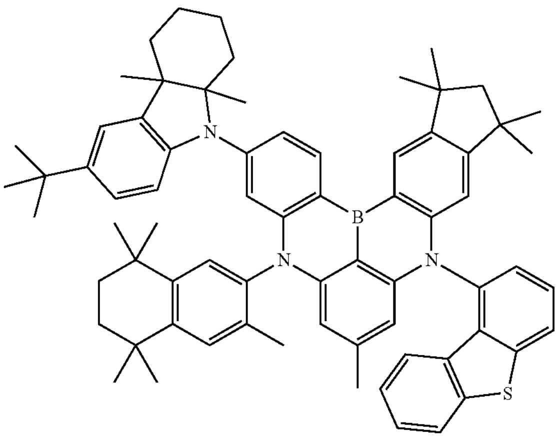
-continued
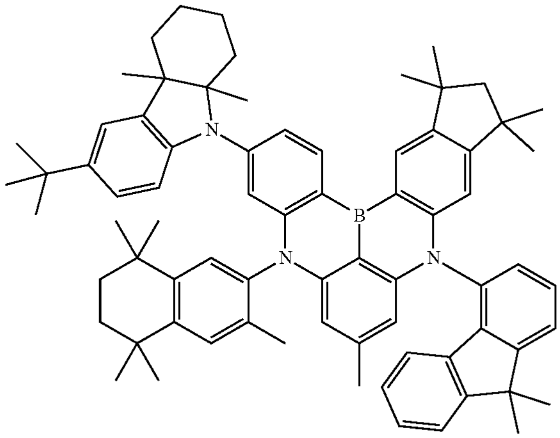
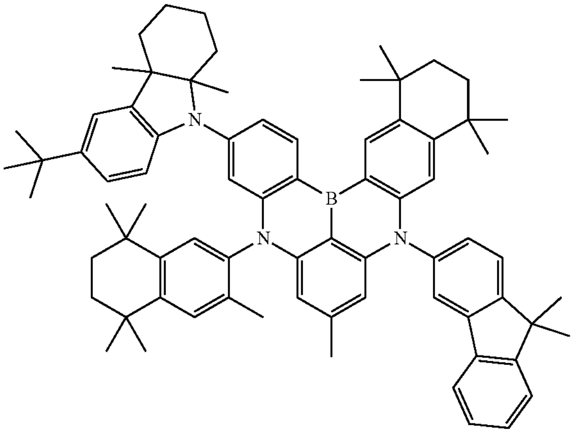
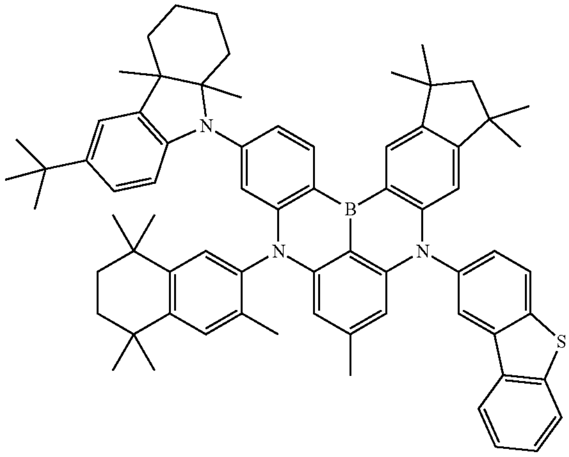

-continued
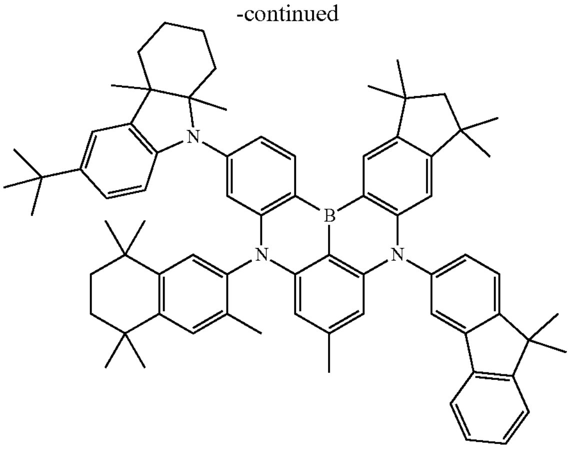
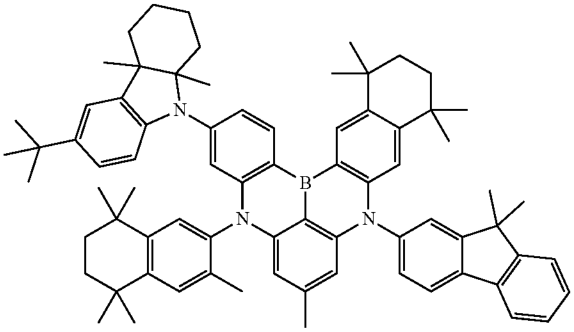
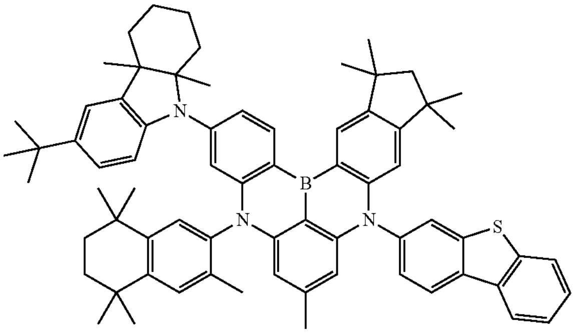
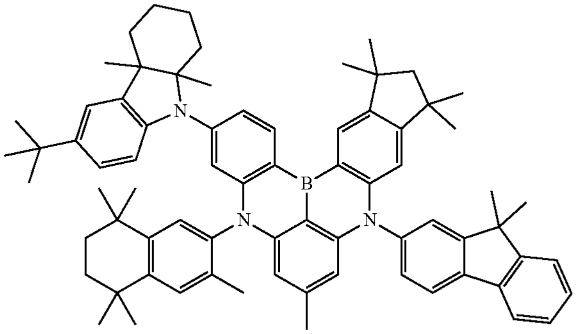
-continued
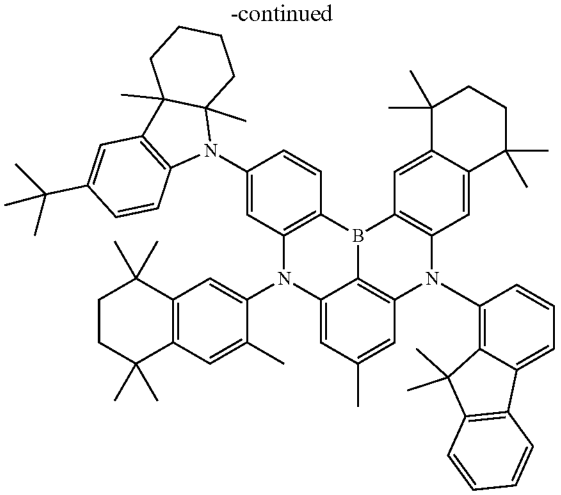
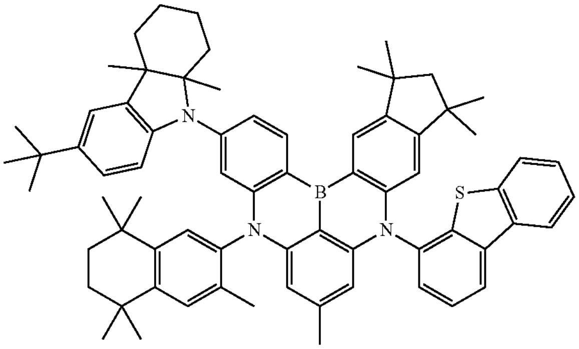
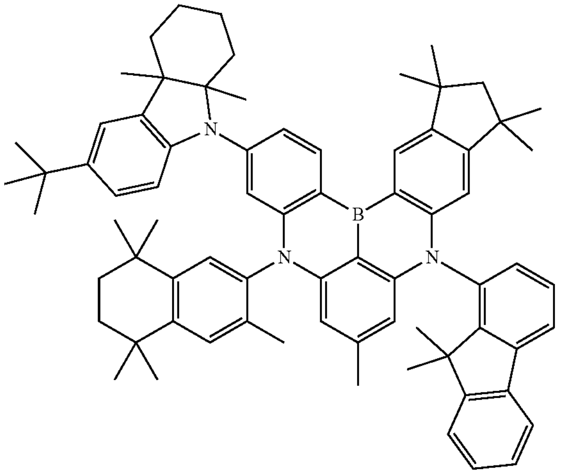
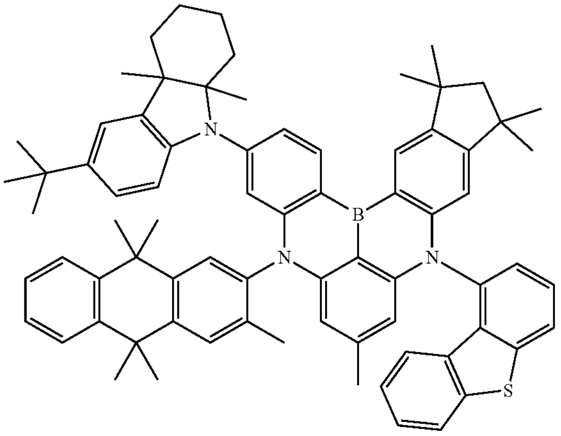

-continued
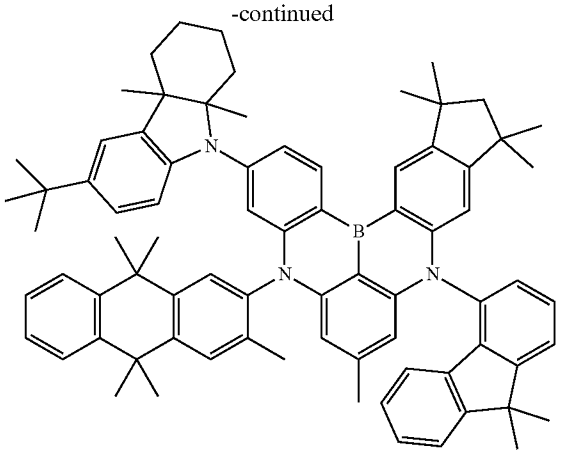
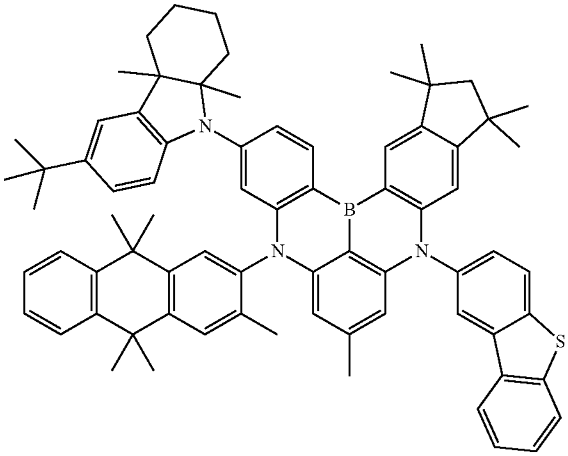
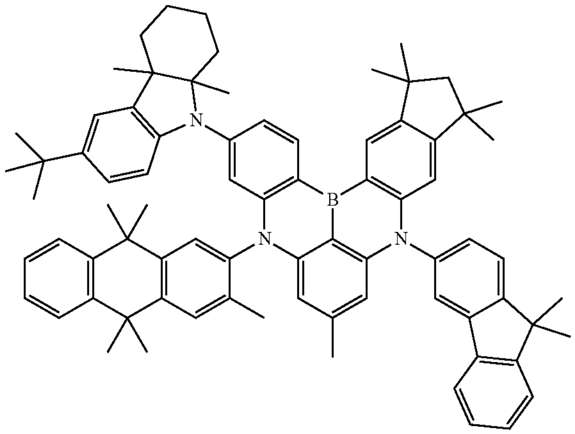
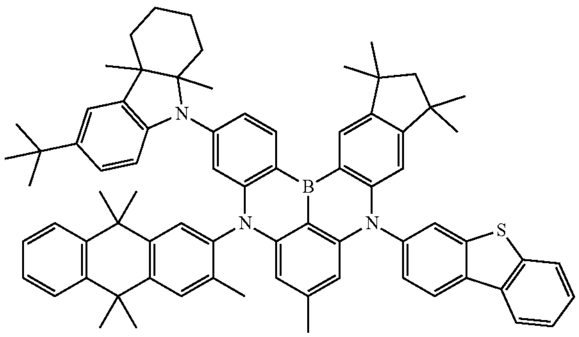
-continued
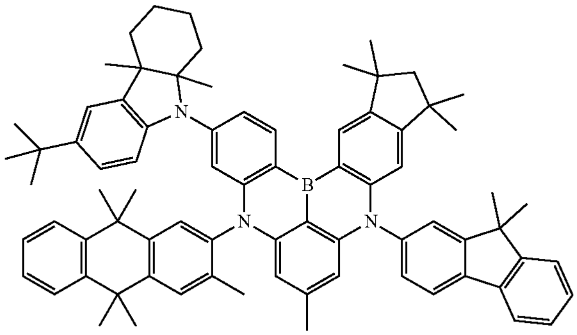
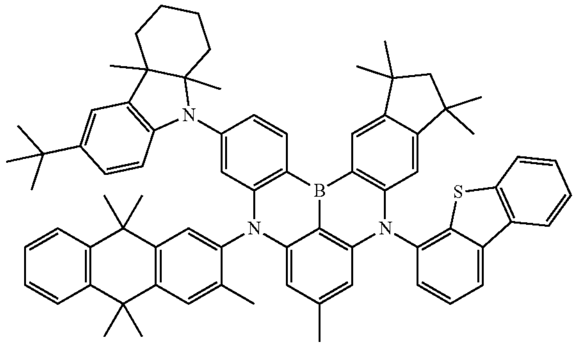
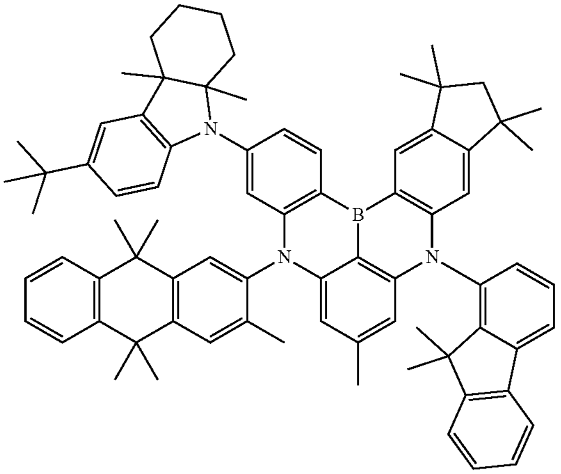
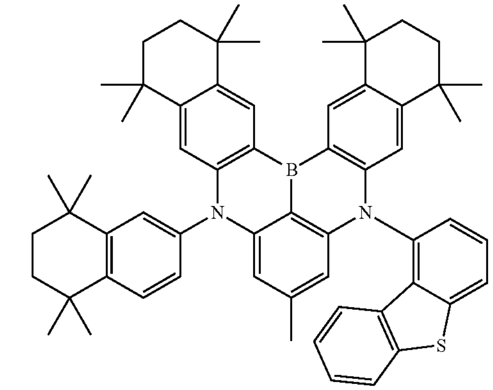

-continued

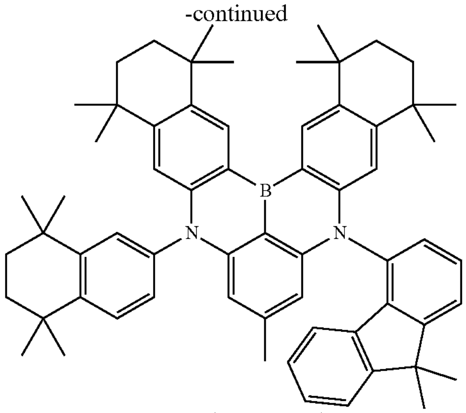

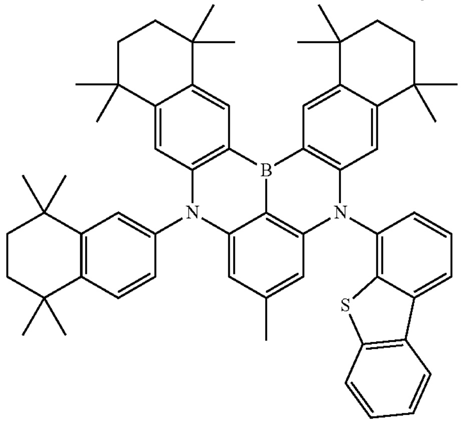

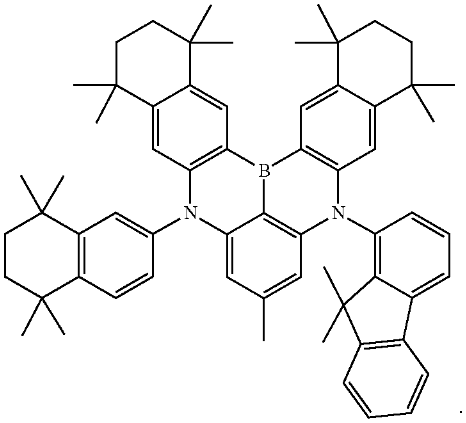

.

9. An organic light emitting device comprising:

a first electrode;

a second electrode provided to face the first electrode; and an organic material layer having one or more layers provided between the first electrode and the second electrode, wherein one or more layers of the organic material layer comprise the polycyclic compound of claim 1.

10. The organic light emitting device of claim 9, wherein the organic material layer comprises a light emitting layer, and the light emitting layer comprises the polycyclic compound.

11. The organic light emitting device of claim 9, wherein the organic material layer comprises a light emitting layer, and the light emitting layer comprises the polycyclic compound as a dopant of the light emitting layer, and a compound of the following Formula H as a host of the light emitting layer:

Formula H

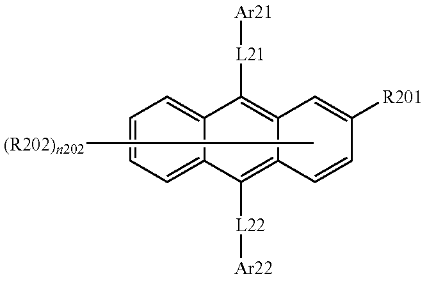

wherein in Formula H:

L21 and L22 are the same as or different from each other, and are each independently a direct bond, a substituted or unsubstituted arylene group, or a substituted or unsubstituted heteroarylene group;

Ar21 and Ar2 are the same as or different from each other, and are each independently a substituted or unsubstituted aryl group or a substituted or unsubstituted heterocyclic group;

R201 and R202 are the same as or different from each other, and are each independently hydrogen, deuterium, a halogen group, a substituted or unsubstituted alkyl group, a substituted or unsubstituted cycloalkyl group, a substituted or unsubstituted aryl group, or a substituted or unsubstituted heterocyclic group; and n202 is an integer from 0 to 7, and when n202 is 2 or higher, the R202s are the same as or different from each other.

12. The organic light emitting device of claim 9, wherein the organic material layer further comprises one or two or more layers selected from the group consisting of a light emitting layer, a hole injection layer, a hole transport layer, an electron injection layer, an electron transport layer, an electron blocking layer, and a hole blocking layer.

* * * * *